US010826000B2

(12) United States Patent
Ito et al.

(10) Patent No.: US 10,826,000 B2
(45) Date of Patent: Nov. 3, 2020

(54) ORGANIC LIGHT-EMITTING DEVICE

(71) Applicant: SAMSUNG DISPLAY CO., LTD., Yongin-si (KR)

(72) Inventors: Naoyuki Ito, Yongin-si (KR); Myeong-Suk Kim, Yongin-si (KR); Youn-Sun Kim, Yongin-si (KR); Sung-Wook Kim, Yongin-si (KR); Hwan-Hee Cho, Yongin-si (KR); Chang-Woong Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 569 days.

(21) Appl. No.: 14/885,919

(22) Filed: Oct. 16, 2015

(65) Prior Publication Data

US 2016/0111664 A1 Apr. 21, 2016

(30) Foreign Application Priority Data

Oct. 17, 2014 (KR) ........................ 10-2014-0141200

(51) Int. Cl.

| | |
|---|---|
| ***H01L 51/54*** | (2006.01) |
| ***C09K 11/06*** | (2006.01) |
| ***H01L 51/00*** | (2006.01) |
| ***C09K 11/02*** | (2006.01) |
| *H01L 51/50* | (2006.01) |

(52) U.S. Cl.

CPC ........ *H01L 51/0094* (2013.01); *C09K 11/025* (2013.01); *C09K 11/06* (2013.01); *H01L 51/006* (2013.01); *H01L 51/0054* (2013.01); *H01L 51/0055* (2013.01); *H01L 51/0059* (2013.01); *H01L 51/0061* (2013.01); *H01L 51/0067* (2013.01); *H01L 51/0071* (2013.01); *H01L 51/0072* (2013.01); *H01L 51/0073* (2013.01); *H01L 51/0074* (2013.01); *H01L 51/0085* (2013.01); *C09K 2211/1007* (2013.01); *C09K 2211/1029* (2013.01); *C09K 2211/1044* (2013.01); *C09K 2211/1059* (2013.01); *C09K 2211/1088* (2013.01); *C09K 2211/1092* (2013.01); *C09K 2211/185* (2013.01); *H01L 51/0058* (2013.01); *H01L 51/5012* (2013.01); *H01L 51/5016* (2013.01); *H01L 2251/5384* (2013.01)

(58) Field of Classification Search

CPC ............... H01L 51/0032; H01L 51/005; H01L 51/0051; H01L 51/0052; H01L 51/0054; H01L 51/0056; H01L 51/0055; H01L 51/0058; H01L 51/0059; H01L 51/006; H01L 51/0061; H01L 51/0067; H01L 51/0071; H01L 51/0072; H01L 51/0073; H01L 51/0074; H01L 51/0085; H01L 51/0094; H01L 51/50; H01L 51/5012; H01L 51/5016; H01L 2251/5384; C09K 11/025; C09K 11/06; C09K 2211/00; C09K 2211/10; C09K 2211/1007; C09K 2211/1029; C09K 2211/1044; C09K 2211/1059; C09K 2211/1088; C09K 2211/1092; C09K 2211/185

USPC .................... 428/690, 691, 917; 427/58, 66; 313/500–512; 257/40, 88–104, 257/E51.001–E51.052; 252/301.16–301.35

See application file for complete search history.

(56) References Cited

U.S. PATENT DOCUMENTS

| | | | | |
|---|---|---|---|---|
| 9,725,476 | B2 | 8/2017 | Beers et al. | |
| 2003/0072964 | A1 | 4/2003 | Kwong et al. | |
| 2006/0228581 | A1 | 10/2006 | Seo et al. | |
| 2009/0108737 | A1* | 4/2009 | Kwong | H01L 51/0085 313/504 |
| 2010/0237334 | A1* | 9/2010 | Ma | C07D 307/91 257/40 |
| 2012/0091446 | A1* | 4/2012 | Jung | C09K 11/06 257/40 |
| 2013/0112952 | A1* | 5/2013 | Adamovich | H01L 51/0054 257/40 |

(Continued)

FOREIGN PATENT DOCUMENTS

| | | | |
|---|---|---|---|
| JP | 2005-506361 | A | 3/2005 |
| KR | 10-2006-0029866 | A | 4/2006 |
| KR | 10-2013-0110934 | A | 10/2013 |

(Continued)

OTHER PUBLICATIONS

EPO Search Report dated Mar. 10, 2016, for corresponding European Patent application 15190326.7, (6 pages).

(Continued)

*Primary Examiner* — Andrew K Bohaty
(74) *Attorney, Agent, or Firm* — Lewis Roca Rothgerber Christie LLP

(57) ABSTRACT

An organic light-emitting device includes: a first electrode; a second electrode; and an organic layer between the first electrode and the second electrode, the organic layer including an emission layer, wherein the emission layer includes a first host and a dopant, the first host is represented by one selected from Formulae 1 and 2, and the dopant is represented by Formula 7:

$$Ar_{11}\text{-}[(L_{11})_{a11}\text{-}(R_{11})_{b11}]_{n11} \quad \text{Formula 1}$$

$$Ar_{21}\text{-}[(L_{21})_{a21}\text{-}(R_{21})_{b21}]_{n21} \quad \text{Formula 2}$$

$$M(L_1)_{n71}(L_2)_{n72}. \quad \text{Formula 7}$$

The organic light-emitting device may have high efficiency and long lifespan and may show little change in the efficiency at an x-coordinate (CIEx) value of 0.21.

18 Claims, 2 Drawing Sheets

(56) References Cited

U.S. PATENT DOCUMENTS

| | | | | |
|---|---|---|---|---|
| 2014/0008617 | A1* | 1/2014 | Beers | H01L 51/0085 257/40 |
| 2015/0021585 | A1 | 1/2015 | Yu et al. | |

FOREIGN PATENT DOCUMENTS

| | | | | | |
|---|---|---|---|---|---|
| KR | 10-2014-0005804 | A | | 1/2014 | |
| KR | 10-2014-0007278 | | | 1/2014 | |
| WO | WO-2013187896 | A1 | * | 12/2013 | C07D 403/14 |
| WO | 2014/007564 | A1 | | 1/2014 | |
| WO | WO 2014/007565 | A1 | | 1/2014 | |

OTHER PUBLICATIONS

Kim, C.Y., et al., *Synthesis and characterization of new blue light emitting iridium complexes containing a trimethylsilyl group*, Journal of Materials Chemistry, vol. 22, No. 42, Jan. 1, 2012, pp. 22721-22726, XP055235927.

EPO Office Action dated Aug. 2, 2018, for corresponding European Patent Application No. 15190326.7 (5 pages).

* cited by examiner

ORGANIC LIGHT-EMITTING DEVICE

CROSS-REFERENCE TO RELATED APPLICATION

This application claims priority to and the benefit of Korean Patent Application No. 10-2014-0141200, filed on Oct. 17, 2014, in the Korean Intellectual Property Office, the entire content of which is incorporated herein by reference.

BACKGROUND

1. Field

One or more aspects of embodiments of the present disclosure relate to an organic light-emitting device.

2. Description of the Related Art

Organic light-emitting devices are self-emitting devices that have wide viewing angles, high contrast, quick response times, high brightness, low driving voltage characteristics, and can provide multicolored images.

For example, an organic light-emitting device may include a first electrode disposed (e.g., positioned) on a substrate, and a hole transport region, an emission layer, an electron transport region, and a second electrode that are sequentially stacked on the first electrode. Holes injected from the first electrode may move to an emission layer via the hole transport region while electrons injected from the second electrode may move to an emission layer via the electron transport region. Carriers (e.g., the holes and the electrons) then recombine in the emission layer to generate excitons. When these excitons drop from an excited state to a ground state, light is emitted.

SUMMARY

One or more aspects of embodiments of the present disclosure are directed toward an organic light-emitting device.

Additional aspects will be set forth in part in the description which follows and, in part, will be apparent from the description, or may be learned by practice of the presented example embodiments.

According to an example embodiment, there is provided an organic light-emitting device including: a first electrode, a second electrode, and an organic layer between the first electrode and the second electrode and including an emission layer, wherein the emission layer may include a first host and a first dopant, the first host may be represented by one selected from Formulae 1 and 2, and the dopant may be represented by Formula 7:

Formula 1

$$A_{11}-[(L_{11})_{a11}-(R_{11})_{b11}]_{n11}$$

Formula 2

$$A_{21}-[(L_{21})_{a21}-(R_{21})_{b21}]_{n21}$$

Formula 7

$$M(L_1)_{n71}(L_2)_{n72}$$

-continued

Formula 7A

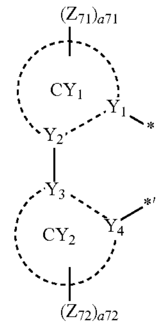

Formula 7B

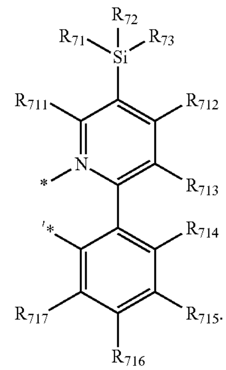

In Formulae above, $Ar_{11}$ and $Ar_{21}$ may each be independently selected from a substituted or unsubstituted $C_4$-$C_{30}$ pyrrolidine-based core and a substituted or unsubstituted $C_7$-$C_{30}$ condensed polycyclic-based core, $L_{11}$ and $L_{21}$ may each be independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a11 and a21 may each be independently selected from 0, 1, 2, and 3, $R_{11}$ may be a hole-transporting group, and $R_{21}$ may be electron-transporting group, b11 and b21 may each be independently selected from 1, 2, and 3, n11 and n21 may each be independently selected from 1, 2, 3, and 4, M may be selected from iridium (Ir), platinum (Pt), osmium (Os), titanium (Ti), zirconium (Zr), hafnium (Hf), europium (Eu), terbium (Tb), thulium (Tm), and rhodium (Rd), $L_1$ may be a ligand represented by Formula 7A above, and $L_2$ may be a ligand represented by Formula 7B above, wherein $L_1$ and $L_2$ may be different from each other, n71 and n72 may each be independently 1 or 2, wherein a sum of n71 and n72 (n71+n72) may be 2 or 3, and when n71 is 2, a plurality of $L_1$s may be identical to or different from each other, and when n72 is 2, a plurality of $L_2$s may be identical to or different from each other, $Y_1$ to $Y_4$ may each be independently carbon (C) or nitrogen (N), wherein $Y_1$ and $Y_2$ may be linked to each other via a single bond or a double bond, and $Y_3$ and $Y_4$ may be linked to each other via a single bond or a double bond, $CY_1$ and $CY_2$ may each be independently selected from a $C_5$-$C_{60}$ cyclic group and a $C_2$-$C_{60}$ heterocyclic group, wherein $CY_1$ and $CY_2$ may be optionally linked to each other via a single bond or a first linking group, $R_{71}$ to $R_{73}$ may each be independently selected from:

a $C_1$-$C_{10}$ alkyl group; and a $C_1$-$C_{10}$ alkyl group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, $Z_{71}$, $Z_{72}$, and $R_{711}$ to $R_{717}$ may each be independently selected from hydrogen, deuterium, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$, wherein $R_{712}$ is not hydrogen, and two adjacent substituents selected from $R_{714}$ to $R_{717}$ may be optionally linked to each other to form a condensed ring, a71 and a72 may each be independently an integer selected from 1 to 5, wherein when a71 is 2 or more, a plurality of $Z_{71}$s may be identical to or different from each other, and when a72 is 2 or more, a plurality of $Z_{72}$s may be identical to or different from each other,

* and *' may each independently indicate a binding site to M of Formula 1, and at least one substituent of the substituted $C_4$-$C_{30}$ pyrrolidine-based core, the substituted $C_7$-$C_{30}$ condensed polycyclic-based core, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$, wherein $Q_1$ to $Q_7$, $Q_{11}$ to $Q_{17}$, $Q_{21}$ to $Q_{27}$, and $Q_{31}$ to $Q_{37}$ may each be independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

According to another example embodiment, there is provided an organic light-emitting device including: a first electrode, a second electrode, and an organic layer between the first electrode and the second electrode and including an emission layer, wherein the emission layer may include a first host, a second host, and a dopant, the first host and the second host may each be independently represented by one selected from Formulae 1 and 2, and the dopant may be represented by Formula 7:

Formula 1

$$Ar_{11} \!-\!\!\left[ (L_{11})_{a11} - (R_{11})_{b11} \right]_{n11}$$

Formula 2

$$Ar_{11} \!-\!\!\left[ (L_{21})_{a21} - (R_{21})_{b21} \right]_{n21}$$

Formula 7

$$M(L_1)_{n71}(L_2)_{n72}$$

Formula 7A

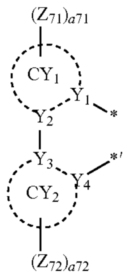

Formula 7B

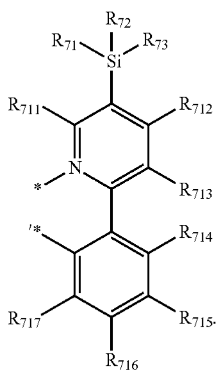

In Formulae above, $Ar_{11}$ and $Ar_{21}$ may each be independently selected from a substituted or unsubstituted $C_4$-$C_{30}$ pyrrolidine-based core and a substituted or unsubstituted $C_7$-$C_{30}$ condensed polycyclic-based core, $L_{11}$ and $L_{21}$ may each be independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a11 and a21 may each be independently selected from 0, 1, 2, and 3, $R_{11}$ may be a hole-transporting group, and $R_{21}$ may be an electron-transporting group, b11 and b21 may each be independently selected from 1, 2, and 3, n11 and n21 may each be independently selected from 1, 2, 3, and 4, M may be selected from iridium (Ir), platinum (Pt), osmium (Os), titanium (Ti), zirconium (Zr), hafnium (Hf), europium (Eu), terbium (Tb), thulium (Tm), and rhodium (Rd), $L_1$ may be a ligand represented by Formula 7A above, and $L_2$ may be a ligand represented by Formula 7B above, wherein $L_1$ and $L_2$ may be different from each other, n71 and n72 may each be independently 1 or 2, a sum of n71 and n72 (n71+n72) may be 2 or 3, and when n71 is 2, a plurality of $L_1$s may be identical to or different from each other, and when n72 is 2, a plurality of $L_2$s may be identical to or different from each other, $Y_1$ to $Y_4$ may each be independently C or N, wherein $Y_1$ and $Y_2$ may be linked to each other via a single bond or a double bond, and $Y_3$ and $Y_4$ may be linked to each other via a single bond or a double bond, $CY_1$ and $CY_2$ may each be independently selected from a $C_5$-$C_{60}$ cyclic group and a $C_2$-$C_{60}$ heterocyclic group, wherein $CY_1$ and $CY_2$ may be optionally linked to each other via a single bond or a first linking group, $R_{71}$ to $R_{73}$ may each be independently selected from:

a $C_1$-$C_{10}$ alkyl group; and a $C_1$-$C_{10}$ alkyl group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, $Z_{71}$, $Z_{72}$, and $R_{711}$ to $R_{717}$ may each be independently selected from hydrogen, deuterium, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$, wherein $R_{712}$ is not hydrogen, and two adjacent substituents selected from $R_{714}$ to $R_{717}$ may be optionally linked to each other to form a condensed ring, a71 and a72 may each be independently an integer selected from 1 to 5, wherein when a71 is 2 or more, a plurality of $Z_{71}$s may be identical to or different from each other, and when a72 is 2 or more, a plurality of $Z_{72}$s may be identical to or different from each other,

* and *' may each independently indicate a binding site to M of Formula 1, and at least one substituent of the substituted $C_4$-$C_{30}$ pyrrolidine-based core, the substituted $C_7$-$C_{30}$ condensed polycyclic-based core, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ may each be independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

According to another example embodiment, there is provided an organic light-emitting device including: a first electrode, a second electrode, and an organic layer between the first electrode and the second electrode and including an emission layer, wherein the emission layer may include a Host I and a dopant, the Host I may be represented by Formula 11, and the dopant may be represented by Formula 7:

Formula 11

$$Ar_{111}-[(L_{111})_{a111}-(R_{111})_{b111}]_{n111}$$

Formula 7

$$M(L_1)_{n71}(L_2)_{n72}$$

Formula 7A

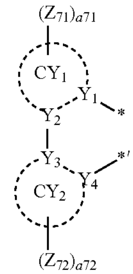

Formula 7B

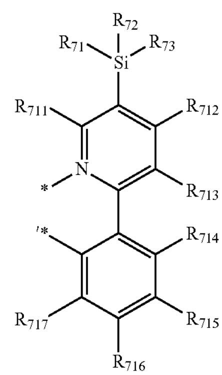

In Formulae above, $Ar_{111}$ may be selected from a substituted or unsubstituted $C_4$-$C_{30}$ pyrrolidine-based core and a substituted or unsubstituted $C_7$-$C_{30}$ condensed polycyclic-based core, $L_{111}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a111 may be selected from 0, 1, 2, and 3, $R_{111}$ may be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one $R_{111}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, b111 may be selected from 1, 2, and 3, n111 may be selected from 1, 2, 3, and 4, M may be selected from iridium (Ir), platinum (Pt), osmium (Os), titanium (Ti), zirconium (Zr), hafnium (Hf), europium (Eu), terbium (Tb), thulium (Tm), and rhodium (Rd), $L_1$ may be a ligand represented by Formula 7A above, and $L_2$ may be a ligand represented by Formula 7B above, wherein $L_1$ and $L_2$ may be different from each other, n71 and n72 may each be independently 1 or 2, a sum of n71 and n72 (n71+n72) may be 2 or 3, and when n71 is 2, a plurality of $L_1$s may be identical to or different from each other, and when n72 is 2, a plurality of $L_2$s may be identical to or different from each other, $Y_1$ to $Y_4$ may each be independently C or N, wherein $Y_1$ and $Y_2$ may be linked to each other via a single bond or a double bond, and $Y_3$ and $Y_4$ may be linked to each other via a single bond or a double bond, $CY_1$ and $CY_2$ may each be independently selected from a $C_5$-$C_{60}$ cyclic group and a $C_2$-$C_{60}$ heterocyclic group, wherein $CY_1$ and $CY_2$ may be optionally linked to each other via a single bond or a first linking group, $R_{71}$ to $R_{73}$ may each be independently selected from:

a $C_1$-$C_{10}$ alkyl group; and a $C_1$-$C_{10}$ alkyl group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, $Z_{71}$, $Z_{72}$, and $R_{711}$ to $R_{717}$ may each be independently selected from hydrogen, deuterium, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$), wherein $R_{712}$ is not hydrogen, and two adjacent substituents selected from $R_{714}$ to $R_{717}$ may be optionally linked to each other to form a condensed ring, a71 and a72 may each be independently an integer selected from 1 to 5, wherein when a71 is 2 or more, a plurality of $Z_{71}$s may be identical to or different from each other, and when a72 is 2 or more, a plurality of $Z_{72}$s may be identical to or different from each other,

* and *' may each independently indicate a binding site to M of Formula 1, and at least one substituent of the substituted $C_4$-$C_{30}$ pyrrolidine-based core, the substituted $C_7$-$C_{30}$ condensed polycyclic-based core, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ may each be independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

According to another example embodiment, there is provided an organic light-emitting device including: a first electrode, a second electrode, and an organic layer between the first electrode and the second electrode and including an emission layer, wherein the emission layer may include a Host I, a Host II, and a dopant, the Host I and the Host II may be different from each other, the Host I and the Host II may each be independently represented by Formula 11, and the dopant may be represented by Formula 7:

Formula 11

$$Ar_{111}\text{—}[(L_{111})_{a111}\text{—}(R_{111})_{b111}]_{n111}$$

Formula 7

$$M(L_1)_{n71}(L_2)_{n72}$$

Formula 7A

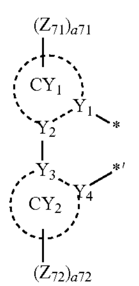

-continued

Formula 7B

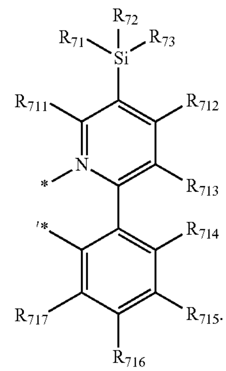

In Formulae above, $Ar_{111}$ may be selected from a substituted or unsubstituted $C_4$-$C_{30}$ pyrrolidine-based core and a substituted or unsubstituted $C_7$-$C_{30}$ condensed polycyclic-based core, $L_{111}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a111 may be selected from 0, 1, 2, and 3, $R_{111}$ may be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one $R_{111}$ is selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, b111 may be selected from 1, 2, and 3, n111 may be selected from 1, 2, 3, and 4, M may be selected from iridium (Ir), platinum (Pt), osmium (Os), titanium (Ti), zirconium (Zr), hafnium (Hf), europium (Eu), terbium (Tb), thulium (Tm), and rhodium (Rd), $L_1$ may be a ligand represented by Formula 7A above, and $L_2$ may be a ligand represented by Formula 7B above, wherein $L_1$ and $L_2$ may be different from each other, n71 and n72 may each be independently 1 or 2, a sum of n71 and n72 (n71+n72) may be 2 or 3, and when n71 is 2, a plurality of $L_1$s may be identical to or different from each other, and when n72 is 2, a plurality of $L_2$s may be identical to or different from each other, $Y_1$ to $Y_4$ may each be independently C or N, wherein $Y_1$ and $Y_2$ may be linked to each other via a single bond or a double bond, and $Y_3$ and $Y_4$ may be linked to each other via a single bond or a double bond, $CY_1$ and $CY_2$ may each be independently selected from a $C_5$-$C_{60}$ cyclic group and a $C_2$-$C_{60}$ heterocyclic group wherein $CY_1$ and $CY_2$ may be optionally linked to each other via a single bond or a first linking group, $R_{71}$ to $R_{73}$ may each be independently selected from:

a $C_1$-$C_{10}$ alkyl group; and a $C_1$-$C_{10}$ alkyl group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, $Z_{71}$, $Z_{72}$, and $R_{711}$ to $R_{717}$ may each be independently selected from hydrogen, deuterium, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$), wherein $R_{712}$ is not hydrogen, and two adjacent substituents selected from $R_{714}$ to $R_{717}$ may be optionally linked to each other to form a condensed ring, a71 and a72 may each be independently an integer selected from 1 to 5, wherein when a71 is 2 or more, a plurality of $Z_{71}$s may be identical to or different from each other, and when a72 is 2 or more, a plurality of $Z_{72}$s may be identical to or different from each other,

* and *' may each independently indicate a binding site to M of Formula 1, and at least one substituent of the substituted $C_4$-$C_{30}$ pyrrolidine-based core, the substituted $C_7$-$C_{30}$ condensed polycyclic-based core, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ may each be independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
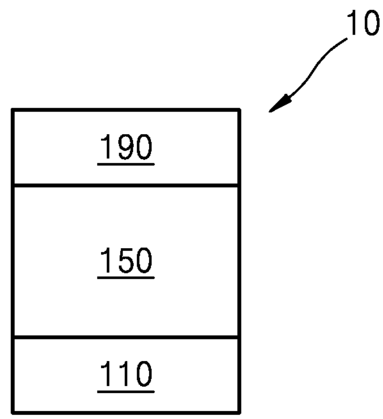
FIG. 1 is a schematic view of a structure of an organic light-emitting device according to an example embodiment.

Reference will now be made in more detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," "one of," "at least one selected from," and "one selected from," when preceding a list of elements, modify the entire list of elements and do not modify the individual elements of the list. Further, the use of "may" when describing embodiments of the present invention refers to "one or more embodiments of the present invention.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly on or formed on the other layer, region, or component. That is, for example, intervening layers, regions, or components may be present.

Sizes of components in the accompanying drawing may be exaggerated for convenience of explanation. In other words, since sizes and thicknesses of components in the accompanying drawing may be arbitrarily illustrated for convenience of explanation, the following embodiments are not limited thereto.

As used herein, the expression "(an organic layer) includes at least one first host" may refer to "(an organic layer) may include one first host represented by Formula 1 or at least two different first hosts represented by Formula 1".

As used herein, the term "organic layer" refers to a single layer and/or a plurality of layers disposed (e.g., positioned) between a first electrode and a second electrode of an organic light-emitting device. A material included in the "organic layer" is not limited to an organic material.

FIG. 1 is a schematic view of a structure of an organic light-emitting device 10 according to an example embodiment.

In FIG. 1, a substrate may be additionally disposed (e.g., positioned) under a first electrode 110 or on a second electrode 190. The substrate may be a glass substrate or a transparent plastic substrate, each with excellent mechanical strength, thermal stability, transparency, surface smoothness, ease of handling, and/or water-resistance.

The first electrode 110 may be formed by, e.g., depositing or sputtering a material for forming the first electrode 110 on the substrate. When the first electrode 110 is an anode, the material for forming the first electrode 110 may be selected from materials having a high work function to facilitate hole injection. The first electrode may be a reflective electrode, a semi-transparent electrode, or a transparent electrode. The material for forming the first electrode 110 may be a transparent and highly conductive material, and non-limiting examples of such material include indium tin oxide (ITO), indium zinc oxide (IZO), tin oxide ($SnO_2$), and zinc oxide (ZnO). When the first electrode 110 is a semi-transparent electrode or a reflective electrode, at least one selected from magnesium (Mg), aluminum (Al), aluminum-lithium (Al—Li), calcium (Ca), magnesium-indium (Mg—In), and magnesium-silver (Mg—Ag) may be utilized as a material for forming the first electrode 110.

The first electrode 110 may have a single-layered structure or a multi-layered structure including a plurality of layers. For example, the first electrode 110 may have a three-layered structured of ITO/Ag/ITO, but the structure of the first electrode 110 is not limited thereto.

An organic layer 150 including an emission layer (EML) may be disposed (e.g., positioned) on the first electrode 110. The organic layer 150 may further include a hole transport region disposed between the first electrode 110 and the EML and an electron transport region disposed between the EML and the second electrode 190.

The hole transport region may include at least one selected from a hole injection layer (HIL), a hole transport layer (HTL), a buffer layer, and an electron blocking layer (EBL); and the electron transport region may include at least one selected from a hole blocking layer (HBL), an electron transport layer (ETL), and an electron injection layer (EIL), but the hole transport region and the electron transport region are not limited thereto.

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a multi-layered structure such as a structure of HIL/HTL, a structure of HIL/HTL/buffer layer, a structure of HIL/buffer layer, a structure of HTL/buffer layer, or a structure of HIL/HTL/EBL. Layers of each structure are sequentially stacked from the first electrode 110 in this stated order, but the hole transport region is not limited thereto.

When the hole transport region includes an HIL, the HIL may be formed on the first electrode 110 by utilizing various suitable methods, such as vacuum deposition, spin coating, casting, a Langmuir-Blodgett (LB) method, ink-jet printing, laser-printing, and/or a laser-induced thermal imaging (LITI) method.

When an HIL is formed by vacuum deposition, the vacuum deposition may be performed, e.g., at a deposition temperature of about 100° C. to about 500° C., at a vacuum degree of about $10^{-8}$ torr to about $10^{-3}$ torr, and a deposition rate of about 0.01 Å/sec to about 100 Å/sec, depending upon a composition of a compound for forming the HIL to be deposited and a structure of the HIL to be formed.

When an HIL is formed by spin coating, the coating may be performed, e.g., at a coating speed of about 2,000 rpm to about 5,000 rpm and at a temperature of about 80° C. to about 200° C., depending upon a composition of a compound for forming the HIL to be deposited and a structure of the HIL to be formed.

When the hole transport region includes an HTL, the HTL may be formed on the first electrode 110 or the HIL by utilizing various suitable methods, such as vacuum deposition, spin coating, casting, an LB method, an ink-jet printing, a laser-printing, and/or an LITI method. When the HTL is formed by vacuum deposition and/or spin coating, the deposition and coating conditions for the HTL may be determined by referring to the deposition and coating conditions for the HIL.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid:polyaniline (Pani/CSA), polyaniline)/poly(4-styrenesulfonate) (PANI/PSS), a compound represented by Formula 201, and a compound represented by Formula 202:

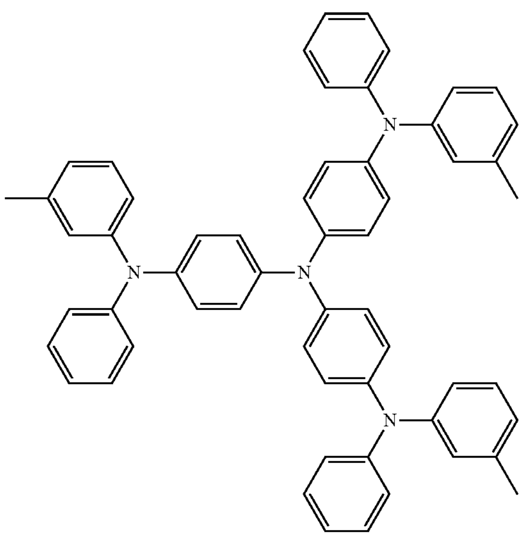

m-MTDATA

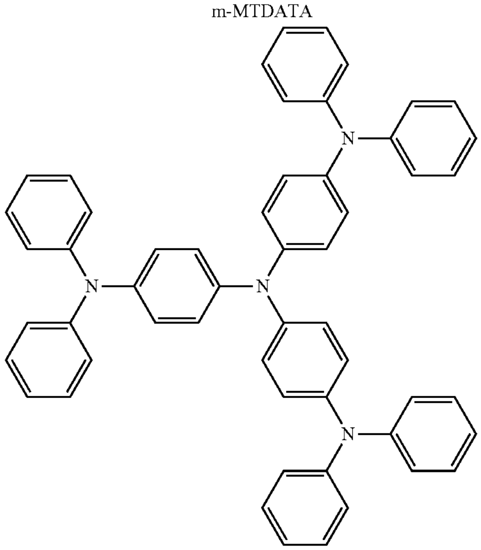

TDATA

-continued

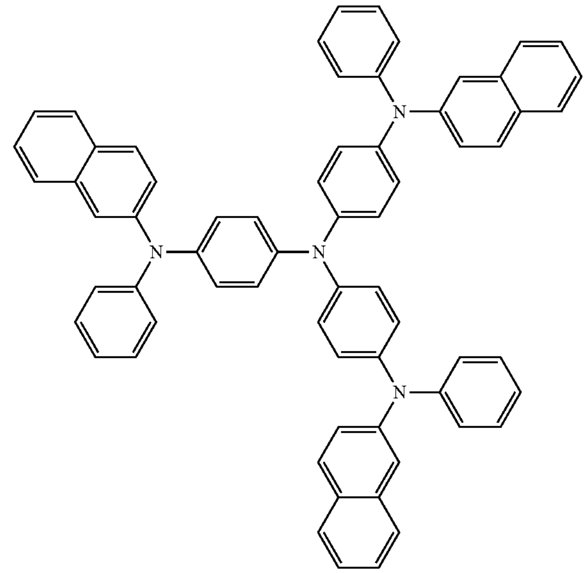

2-TNATA

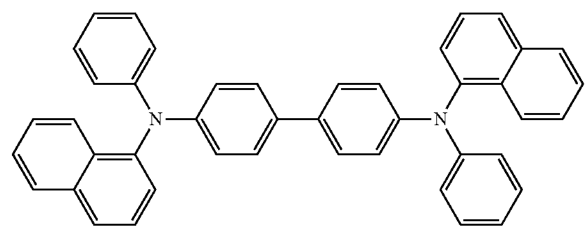

NPB

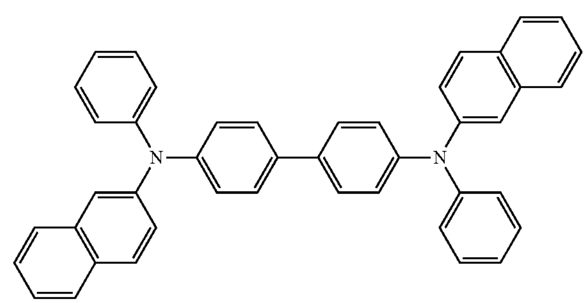

β-NPB

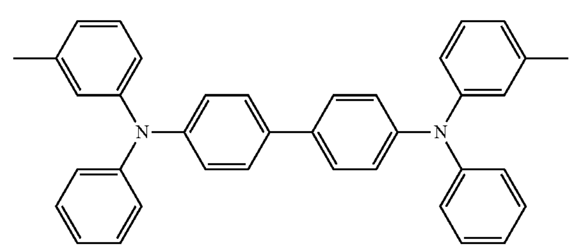

TPD

-continued

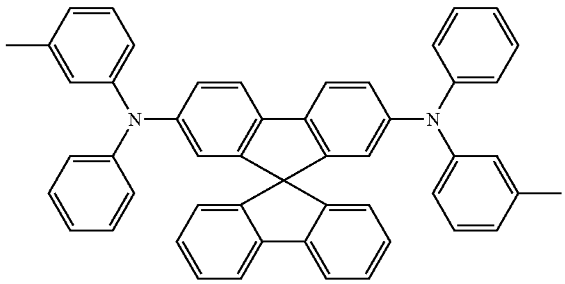

Spiro-TPD

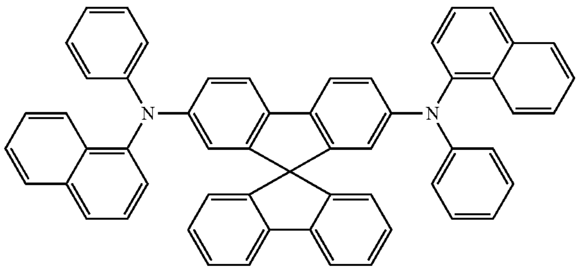

Spiro-NPB

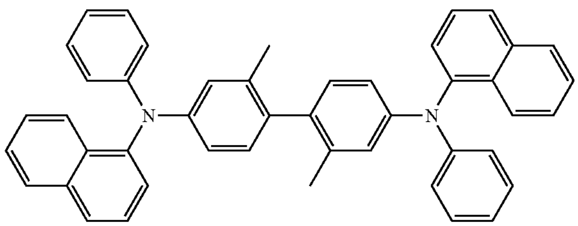

methylate NPB

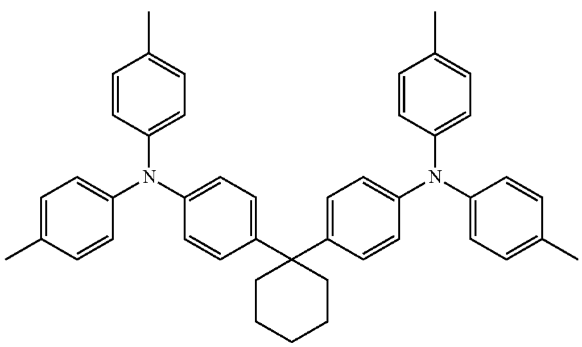

TAPC

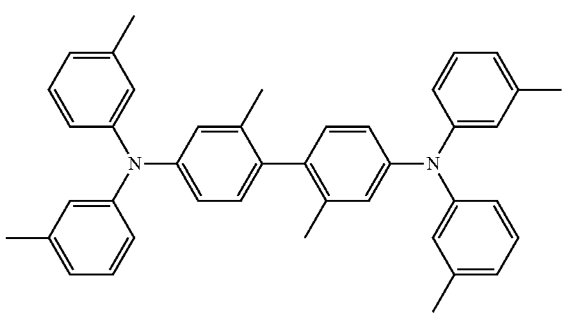

HMTPD

Formula 201

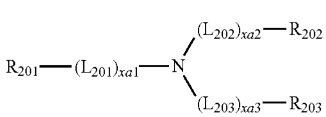

-continued

Formula 202

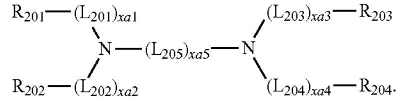

In Formulae 201 and 202, $L_{201}$ to $L_{205}$ may each be independently selected from:

a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{201}$)($Q_{202}$), —Si($Q_{203}$)($Q_{204}$)($Q_{205}$), and —B($Q_{206}$)($Q_{207}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{211})(Q_{212})$, —$Si(Q_{213})(Q_{214})(Q_{215})$, and —$B(Q_{216})(Q_{217})$; and —$N(Q_{221})(Q_{222})$, —$Si(Q_{223})(Q_{224})(Q_{225})$, and —$B(Q_{226})(Q_{227})$, xa1 to xa4 may each be independently selected from 0, 1, 2, and 3;

xa5 may be selected from 1, 2, 3, 4, and 5, and $R_{201}$ to $R_{204}$ may each be independently selected from:

a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{231})(Q_{232})$, —$Si(Q_{233})(Q_{234})(Q_{235})$, and —$B(Q_{236})(Q_{237})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{241})(Q_{242})$, —$Si(Q_{243})(Q_{244})(Q_{245})$, and —$B(Q_{246})(Q_{247})$, wherein $Q_{201}$ to $Q_{207}$, $Q_{211}$ to $Q_{217}$, $Q_{221}$ to $Q_{227}$, $Q_{231}$ to $Q_{237}$, and $Q_{241}$ to $Q_{247}$ may each be independently selected from:

hydrogen, deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201 and 202, $L_{201}$ to $L_{205}$ may each be independently selected from:

a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group, xa1 to xa4 may each be independently 0, 1, or 2, xa5 may be 1, 2, or 3, $R_{201}$ to $R_{204}$ may each be independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but embodiments are not limited thereto.

The compound of Formula 201 may be represented by Formula 201A:

Formula 201A

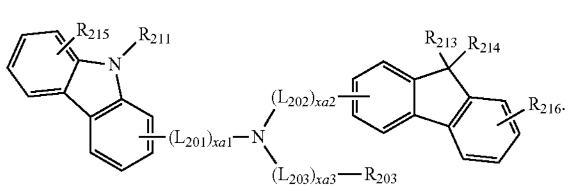

For example, the compound of Formula 201 may be represented by Formula 201A-1, but is not limited thereto:

Formula 201A-1

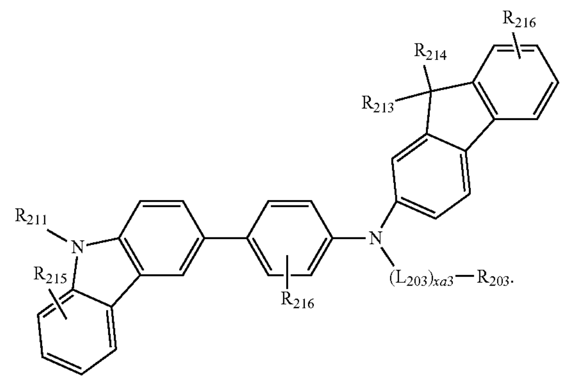

The compound of Formula 202 may be represented by Formula 202A, but is not limited thereto:

Formula 202A

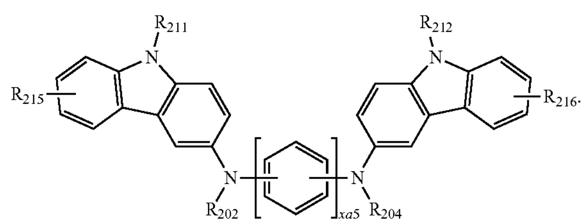

In Formulae 201A, 201A-1, and 202A, descriptions of $L_{201}$ to $L_{203}$, xa1 to xa3, xa5, and $R_{202}$ to $R_{204}$ may each be independently as referred to in the descriptions provided above, descriptions of $R_{211}$ and $R_{212}$ may each be independently as referred to in the description provided in connection with $R_{203}$, and $R_{213}$ to $R_{216}$ may each be independently selected from: hydrogen, deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formulae 201A, 201A-1, and 202A, $L_{201}$ to $L_{203}$ may each be independently selected from:

a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, xa1 to xa3 may each be independently 0 or 1, $R_{203}$, $R_{211}$, and $R_{212}$ may each be independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, $R_{213}$ and $R_{214}$ may each be independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, $R_{215}$ and $R_{216}$ may each be independently selected from hydrogen, deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and xa5 may be 1 or 2.

In Formulae 201A and 201A-1, $R_{213}$ and $R_{214}$ may bind to each other to form a saturated or unsaturated ring.

The compound of Formula 201 and the compound of Formula 202 may each independently include one of Compounds HT1 to HT20, but the compound of Formula 201 and the compound of Formula 202 are not limited thereto:

HT1

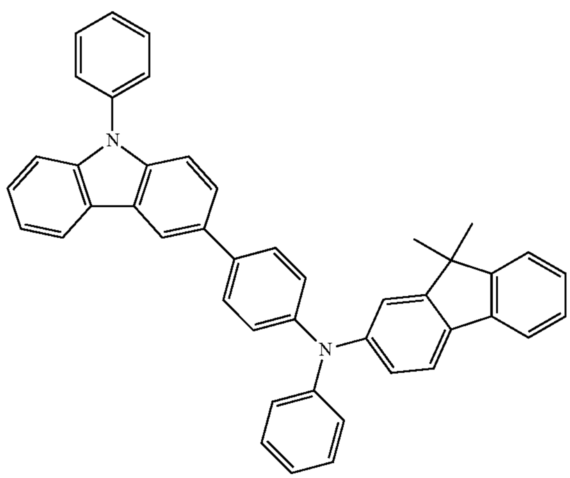

HT2

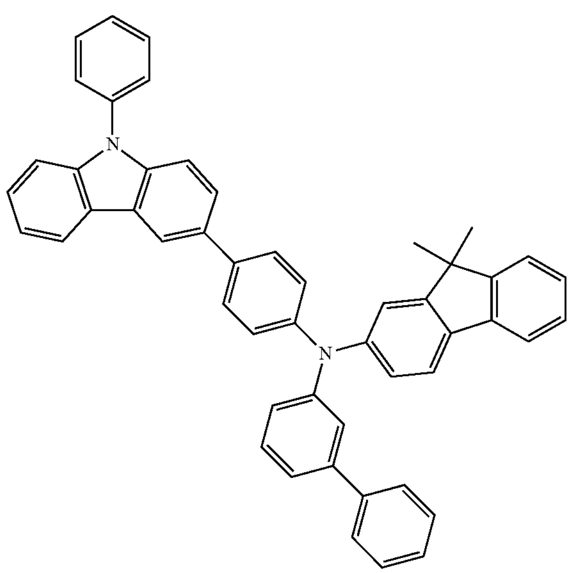

-continued

HT3

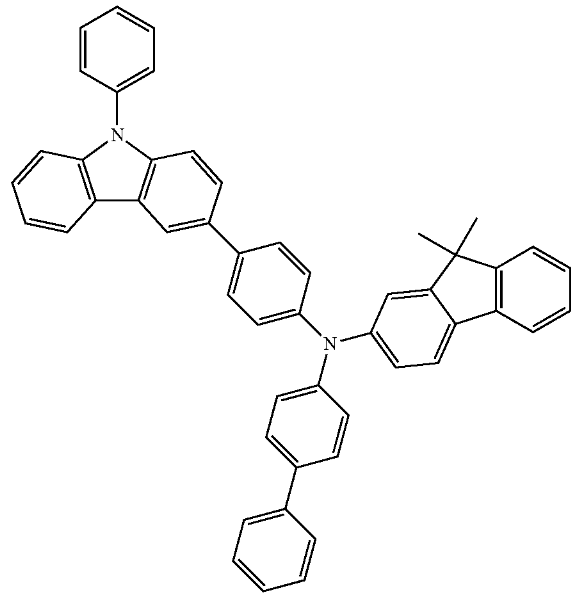

HT4

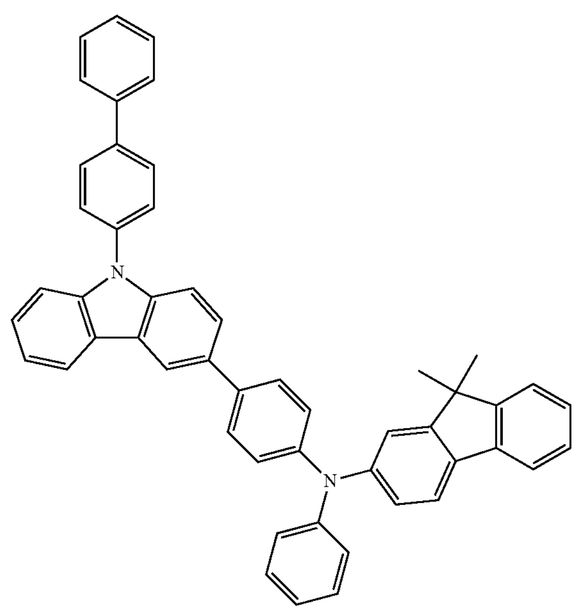

-continued
HT5
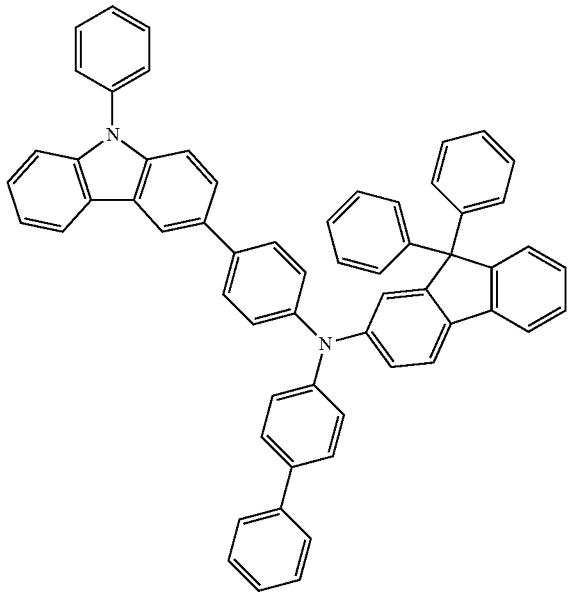
HT6
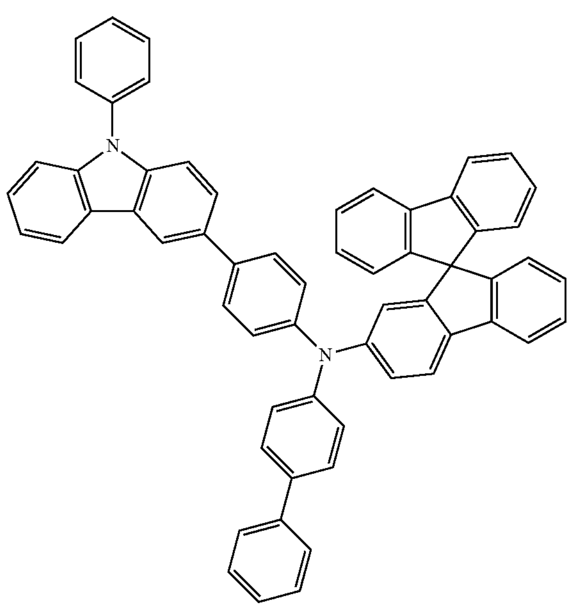
-continued
HT7
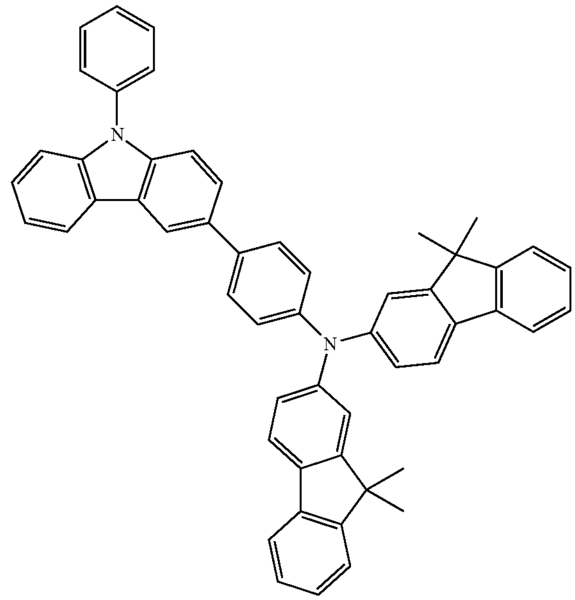
HT8
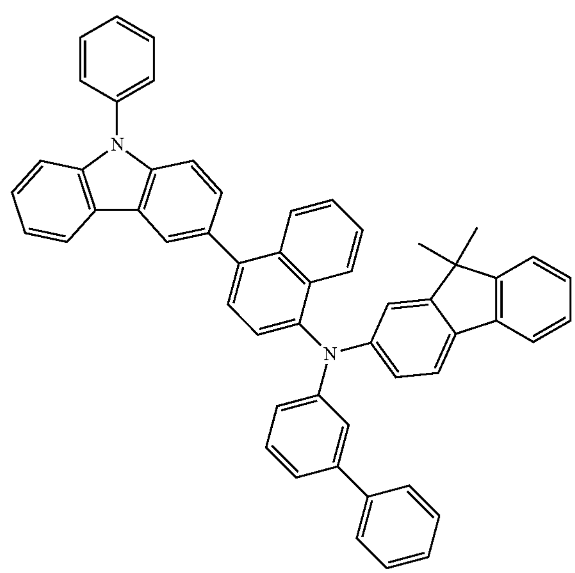

-continued
HT9
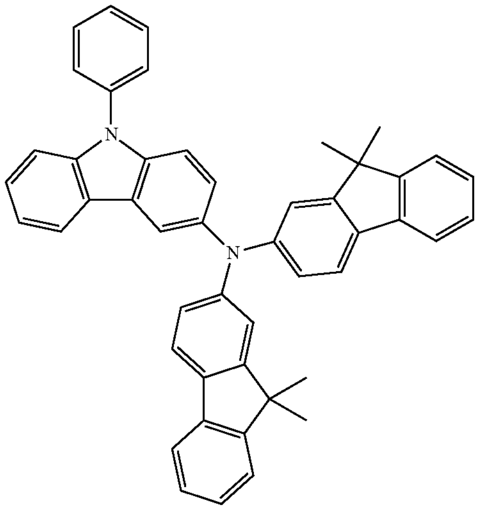
HT10
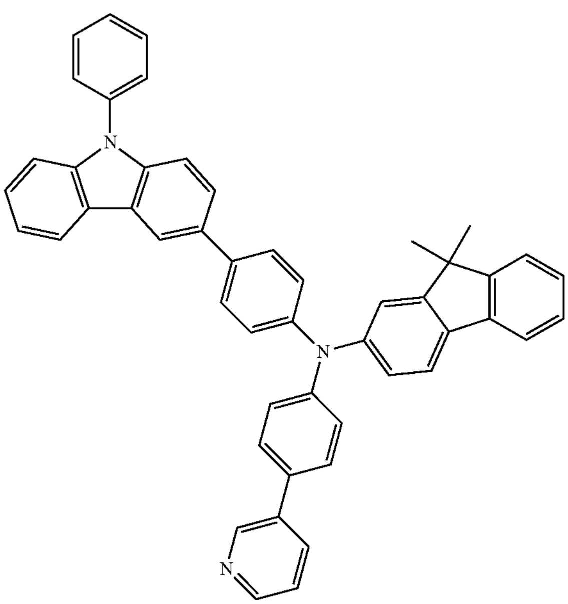
-continued
HT11
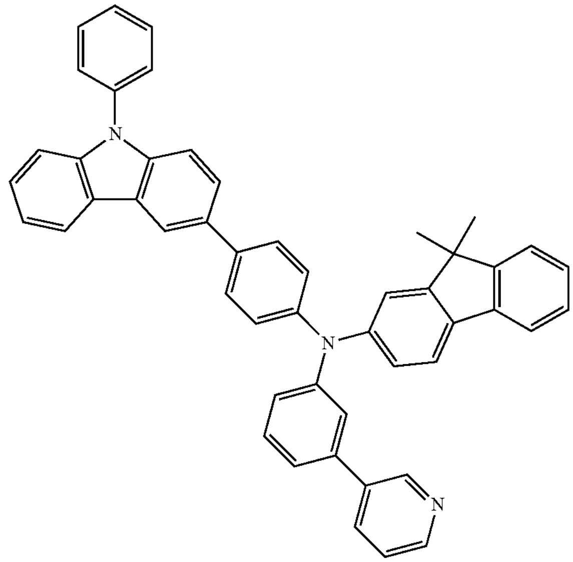
HT12
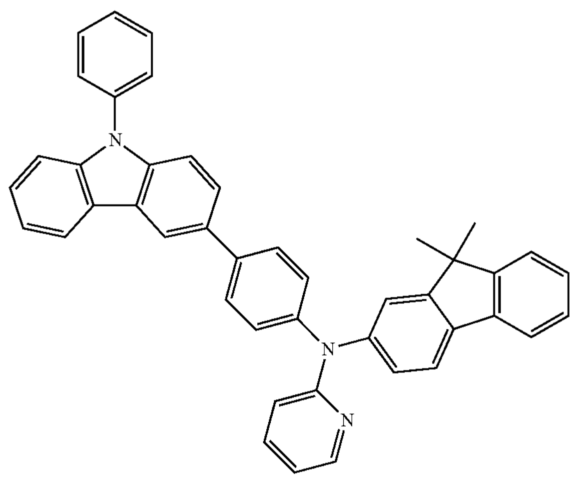
HT13
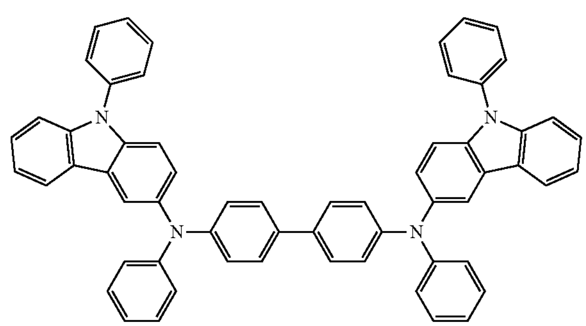

-continued

HT14

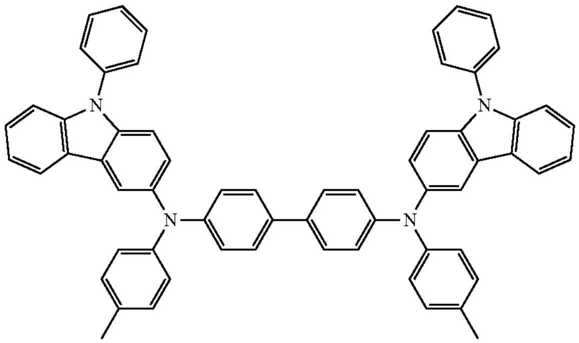

HT15

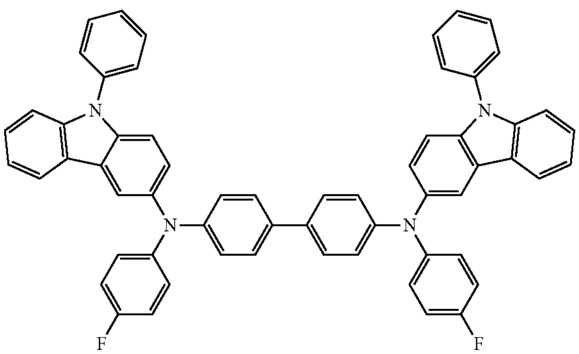

HT16

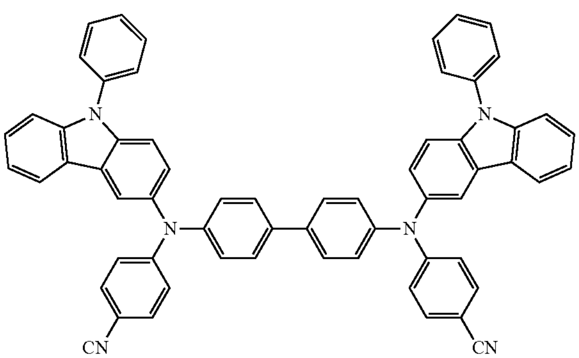

HT17

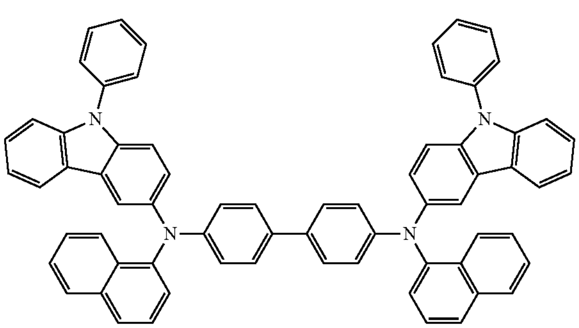

-continued

HT18

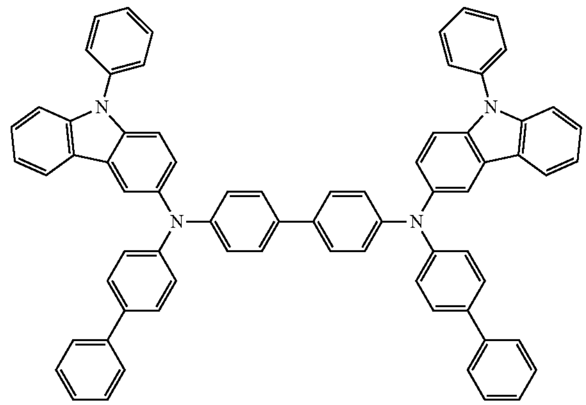

HT19

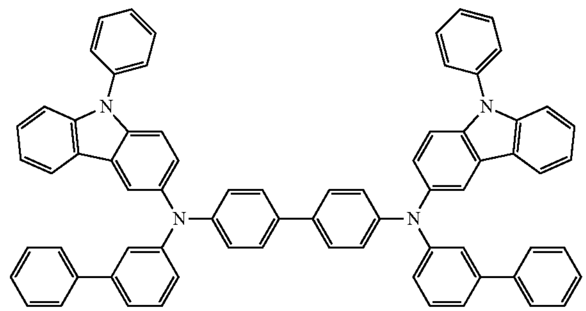

HT20

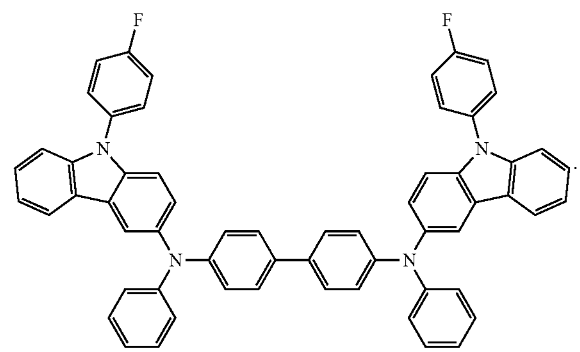

A thickness of the hole transport region may be in a range of about 100 Å to about 10,000 Å, for example, about 100 Å to about 1,000 Å. When the hole transport region includes both an HIL and an HTL, a thickness of the HIL may be in a range of about 100 Å to about 10,000 Å, for example, about 100 Å to about 1,000 Å; and a thickness of the HTL may be in a range of about 50 Å to about 2,000 Å, for example about 100 Å to about 1,500 Å. In one example embodiment, when the thickness of the hole transport region, the HIL, and the HTL are within any of these ranges, satisfactory or suitable hole transporting characteristics can be obtained without a substantial increase in driving voltage.

The hole transport region may further include, in addition to the materials described above, a charge-generation material for the improvement of conductive properties. The charge-generation material may be homogeneously or inhomogeneously dispersed in the hole transport region.

The charge-generation material may be, for example, a p-dopant. The p-dopant may be a quinone derivative, a metal oxide, or a cyano group-containing compound, but the p-dopant is not limited thereto. Non-limiting examples of the p-dopant include quinone derivatives such as tetracyanoquinonedimethane (TCNQ) and/or 2,3,5,6-tetrafluoro-tetracyano-1,4-benzoquinonedimethane (F4-TCNQ); metal oxides such as tungsten oxide and molybdenum oxide; and Compound HT-D1.

Compound HT-D1

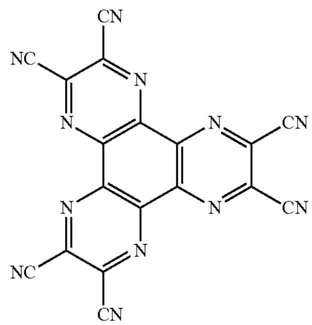

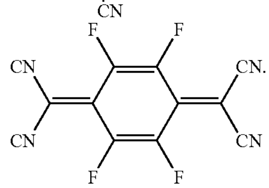

F4-TCNQ

The hole transport region may further include, in addition to the HIL and the HTL, at least one selected from a buffer layer and an EBL. Since the buffer layer may compensate for an optical resonance distance according to a wavelength of light emitted from the EML, light-emission efficiency of a formed organic light-emitting device may be improved. For usage as a material included in the buffer layer, materials that are included in the hole transport region may be utilized. The EBL may reduce or prevent injection of electrons from the electron transport region.

The EML may be formed on the first electrode 110 or on the hole transport region by utilizing various suitable methods, such as vacuum deposition, spin coating, casting, an LB method, an ink-jet printing, a laser-printing, and/or an LITI method. When the EML is formed by vacuum deposition and/or spin coating, the deposition and coating conditions for the emission layer may be determined by referring to the deposition and coating conditions for the HIL.

When the organic light-emitting device 10 is a full color organic light-emitting device, the EML may be patterned into a red EML, a green EML, or a blue EML, according to individual sub pixels, respectively. The EML may have various modifications in the structure, and for example, may have a structure of a red EML, a green EML, and a blue EML, each of which layers are sequentially stacked in the stated order, or a structure in which a red light-emitting material, a green light-emitting material, and a blue light-emitting material are mixed without distinction between layers, and accordingly the EML may emit white light. Alternatively, the EML may be a white EML, and may further include a color converting layer (which converts white light to light of desired color) or a color filter.

Hereinafter, an example embodiment in which an EML of an organic light-emitting includes the first host will be described (Embodiment 1).

In an example embodiment, the EML may include the first host represented by one of Formulae 1 and 2:

$$Ar_{11}\text{-}[(L_{11})_{a11}\text{-}(R_{11})_{b11}]_{n11} \qquad \text{Formula 1}$$

$$Ar_{21}\text{-}[(L_{21})_{a21}\text{-}(R_{21})_{b21}]_{n21}. \qquad \text{Formula 2}$$

In Formulae 1 and 2, $Ar_{11}$ and $Ar_{21}$ may each be independently selected from: a substituted or unsubstituted $C_4$-$C_{30}$ pyrrolidine-based core (herein, also referring to a moiety including a substituted or unsubstituted $C_4$-$C_{30}$ pyrrolidine-based core) and a substituted or unsubstituted $C_7$-$C_{30}$ condensed polycyclic-based core (herein, also referring to a moiety including a substituted or unsubstituted $C_7$-$C_{30}$ condensed polycyclic-based core), at least one substituent of the substituted $C_4$-$C_{30}$ pyrrolidine-based core and the substituted $C_7$-$C_{30}$ condensed polycyclic-based core may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —N($Q_{31}$)($Q_{32}$), —Si($Q_{33}$)($Q_{34}$)($Q_{35}$), and —B($Q_{36}$)($Q_{37}$), where $Q_{11}$ to $Q_{17}$, $Q_{21}$ to $Q_{27}$, and $Q_{31}$ to $Q_{37}$ may each independently be selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, the substituted or unsubstituted $C_4$-$C_{30}$ pyrrolidine-based core may have a partial pyrrolidine structure represented by Formula 10-1, but the substituted or unsubstituted $C_4$-$C_{30}$ pyrrolidine-based core is not limited thereto:

Formula 10-1

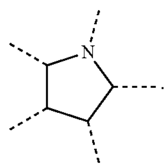

In Formula 10-1, the line '- - -' indicates a covalent bond with an adjacent atom, wherein the adjacent atom may be a hydrogen atom (H), a nitrogen atom (N), an oxygen atom (O), a carbon atom (C), or a sulfur atom (S).

For example, the substituted or unsubstituted $C_7$-$C_{30}$ condensed polycyclic-based core may have a partial condensed polycyclic group represented by one of Formulae 10-2 or 10-3, but the substituted or unsubstituted $C_7$-$C_{30}$ condensed polycyclic-based core is not limited thereto:

Formula 10-2

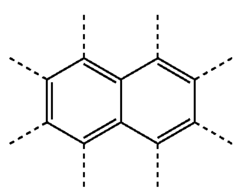

Formula 10-3

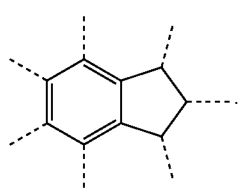

In Formulae 10-2 and 10-3, the line '- - -' indicates a covalent bond with an adjacent atom, wherein the adjacent atom may be H, N, or C.

For example, in Formulae 1 and 2, $Ar_{11}$ may be represented by one of Formulae 8A-1 to 8A-4, 8B-1 to 8B-19, and 8C-1 to 8C-19, and $Ar_{21}$ may be a group represented by one of Formulae 9A-1 to 9A-4, 9B-1 to 9B-19, and 9C-1 to 9C-19, but $Ar_1$ and $Ar_{21}$ are not limited thereto:

8A-1

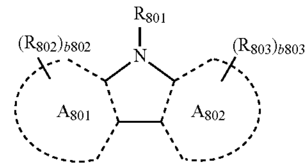

8A-2

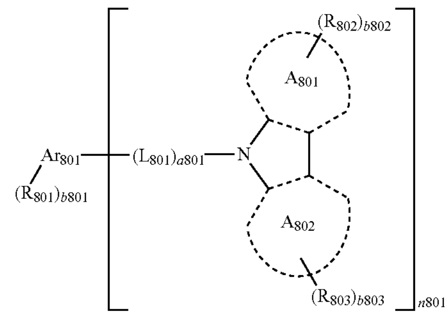

8A-3

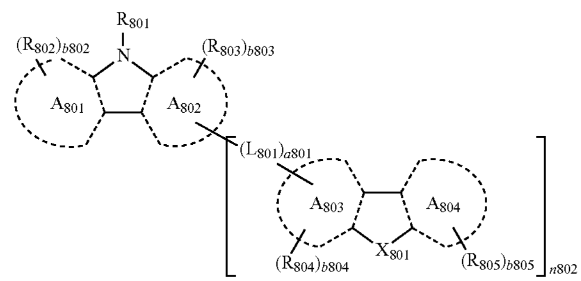

8A-4

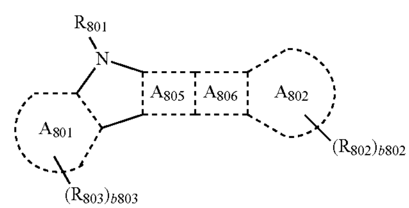

8B-1

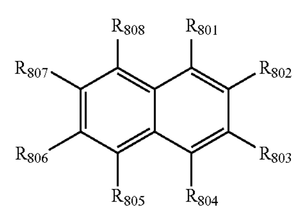

8B-2

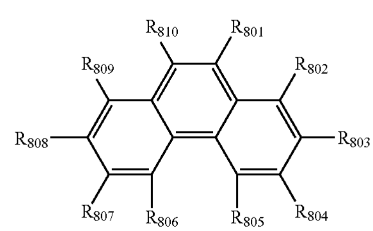

-continued
8B-3
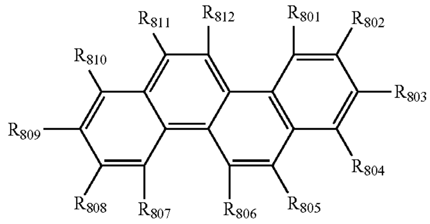
8B-4
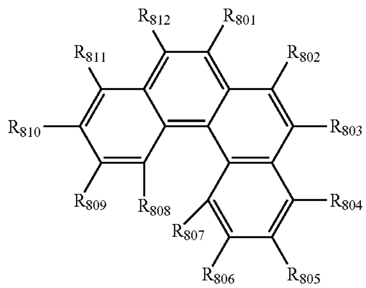
8B-5
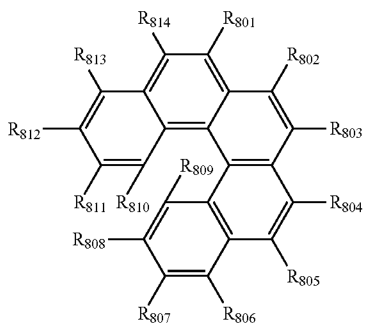
8B-6
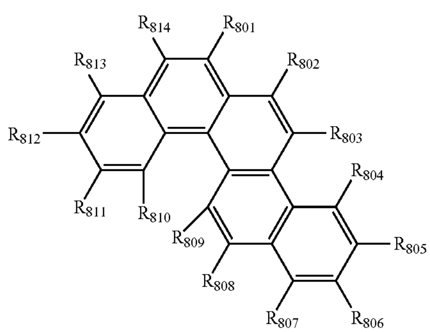
8B-7
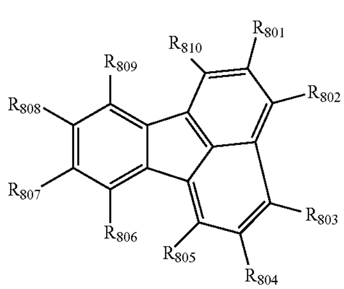
-continued
8B-8
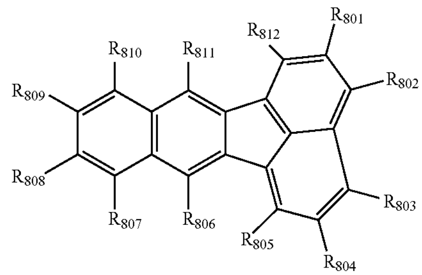
8B-9
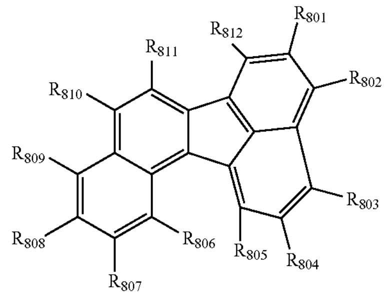
8B-10
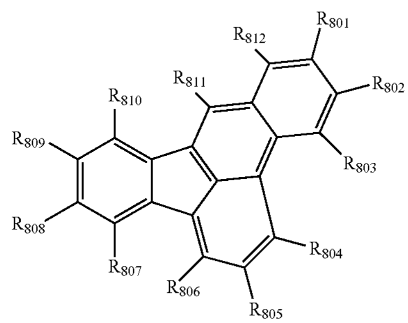
8B-11
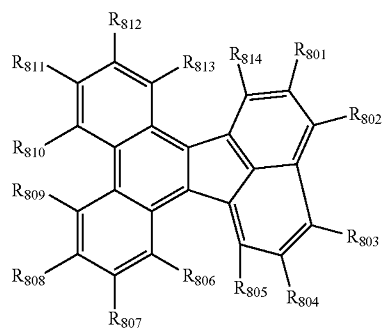
8B-12
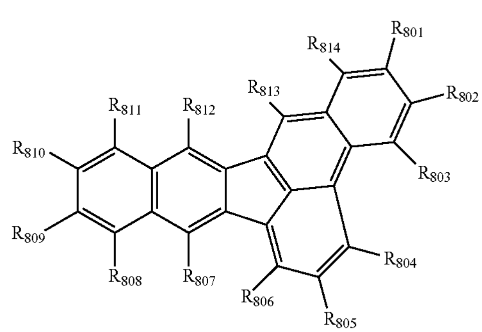

-continued
8B-13
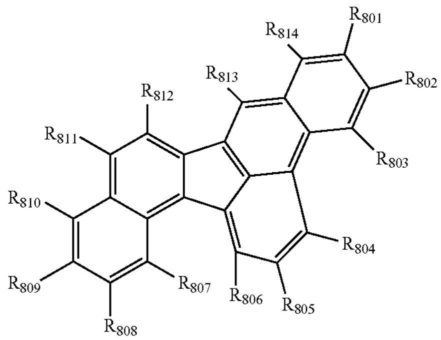
8B-14
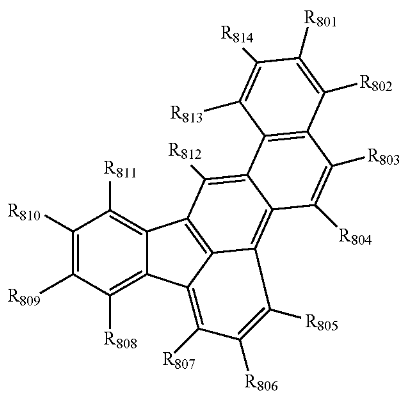
8B-15
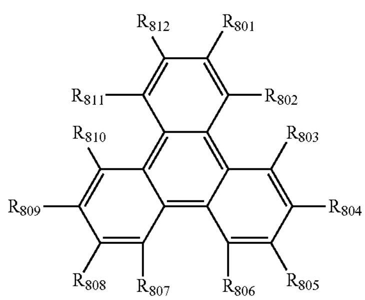
8B-16
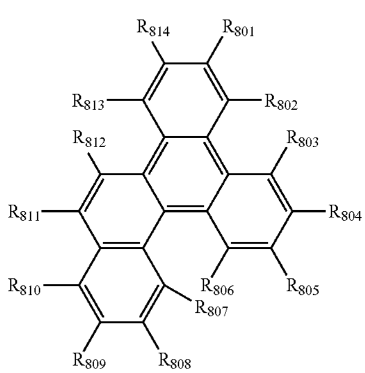
-continued
8B-17
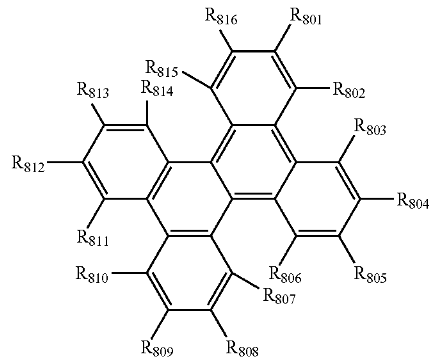
8B-18
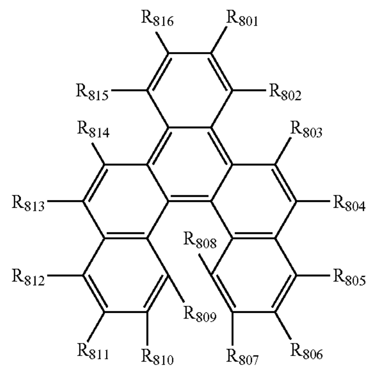
8B-19
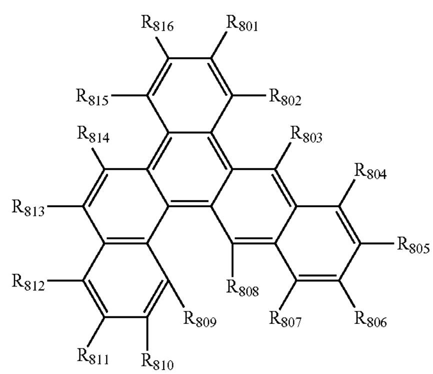
8C-1
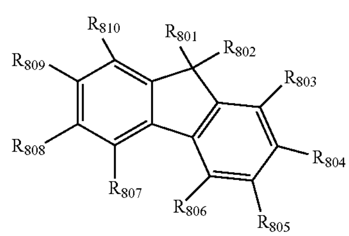
8C-2
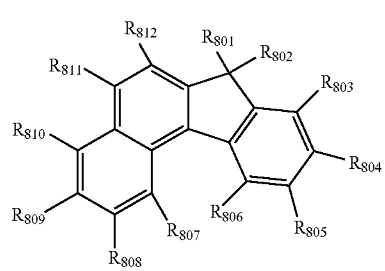

-continued
8C-3
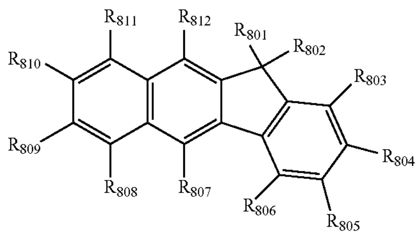
8C-4
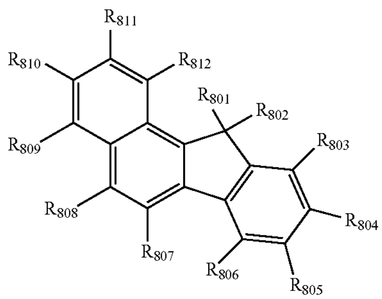
8C-5
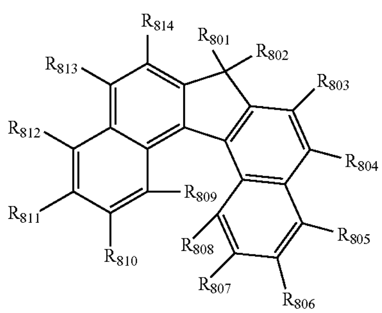
8C-6
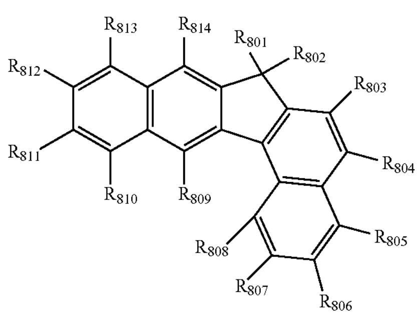
8C-7
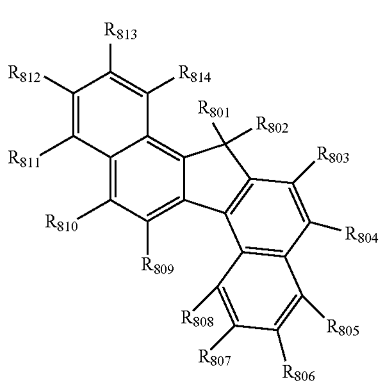
-continued
8C-8
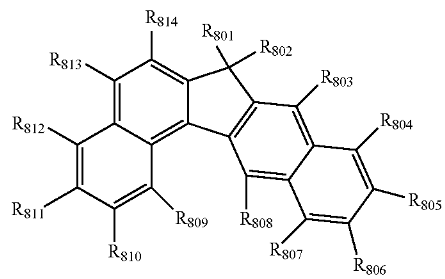
8C-9
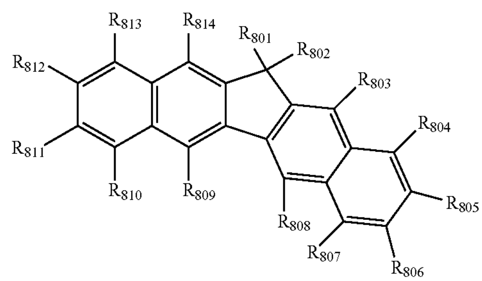
8C-10
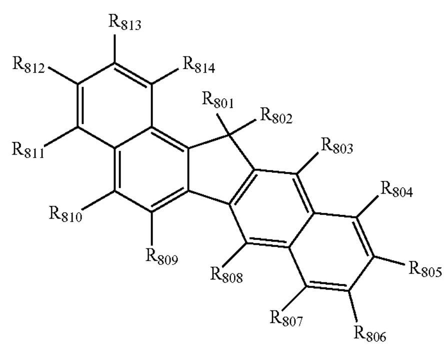
8C-11
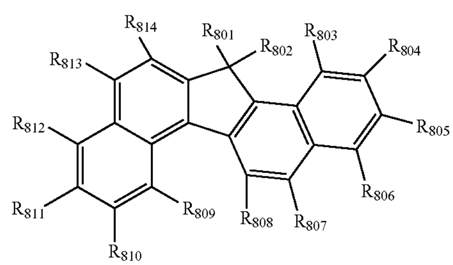
8C-12
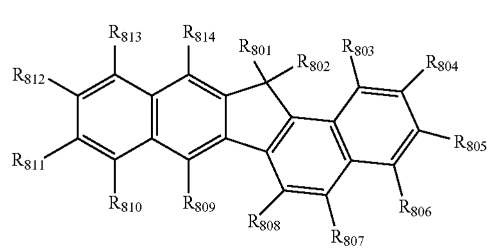

-continued
8C-13
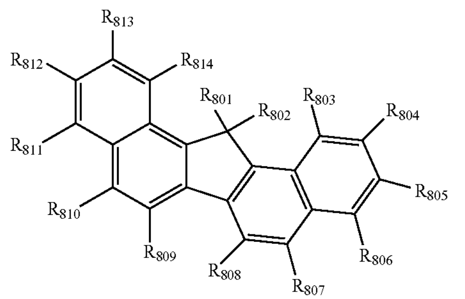
8C-14
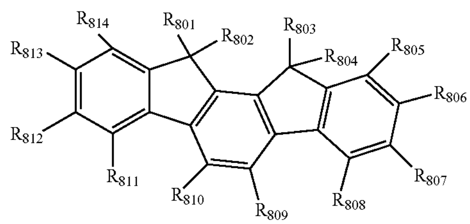
8C-15
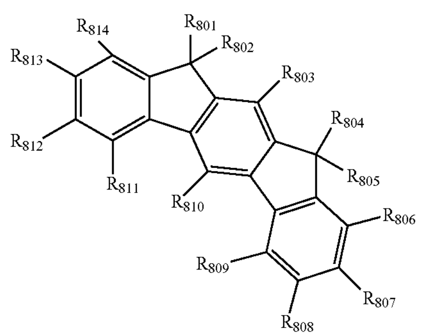
8C-16
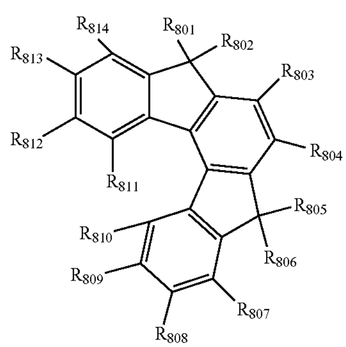
8C-17
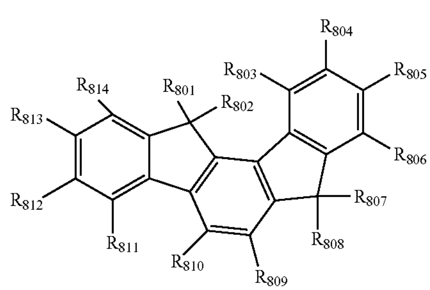
-continued
8C-18
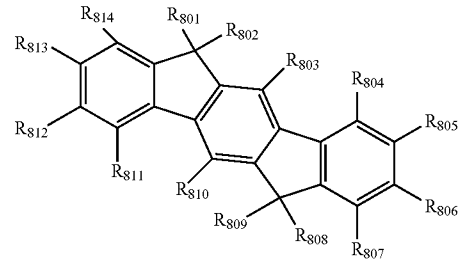
8C-19
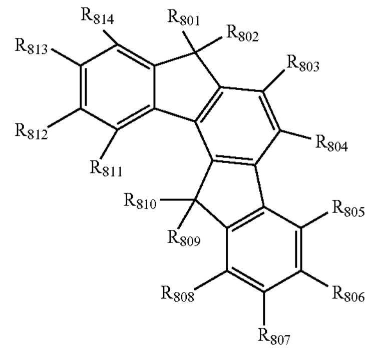
8D-1
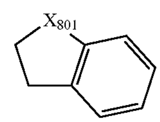
8D-2
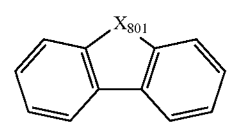
8D-3
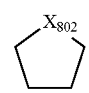
9A-1
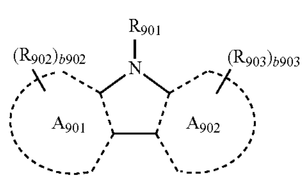
9A-2
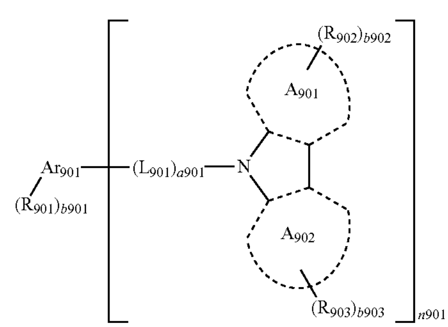

-continued
9A-3
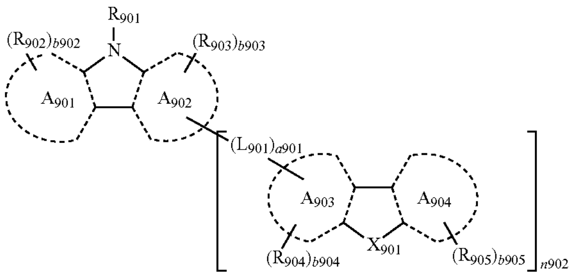
9A-4
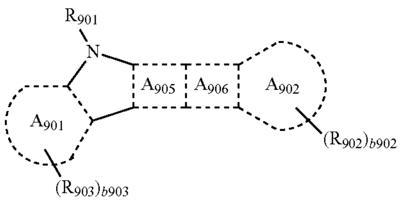
9B-1
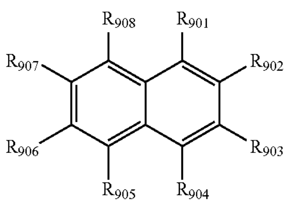
9B-2
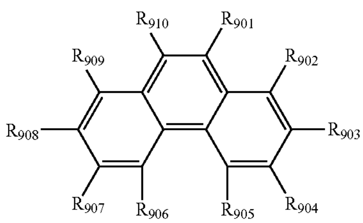
9B-3
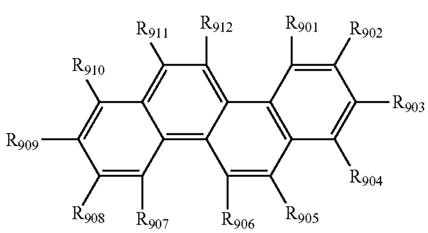
9B-4
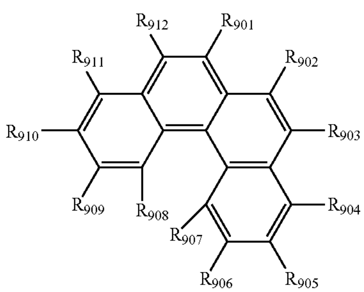
-continued
9B-5
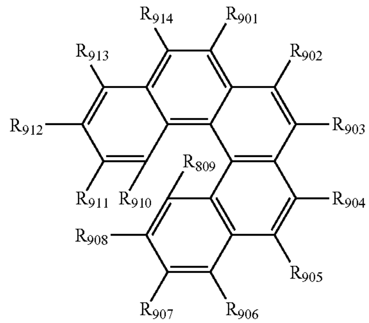
9B-6
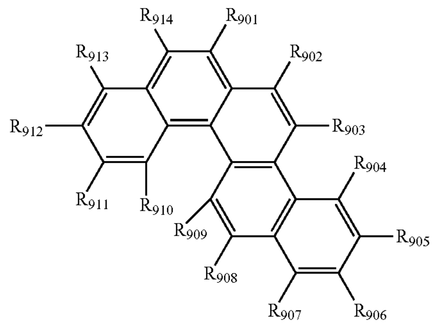
9B-7
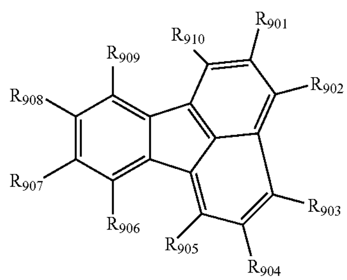
9B-8
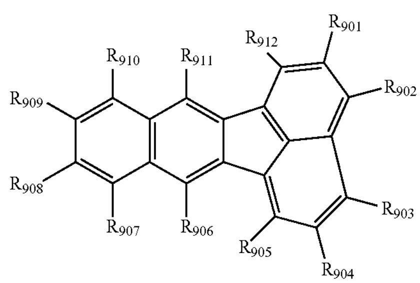
9B-9
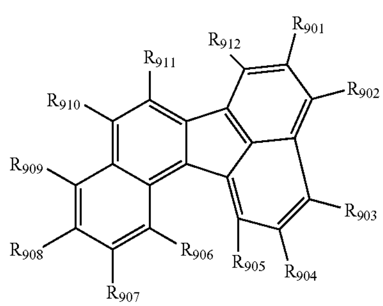

-continued
9B-10
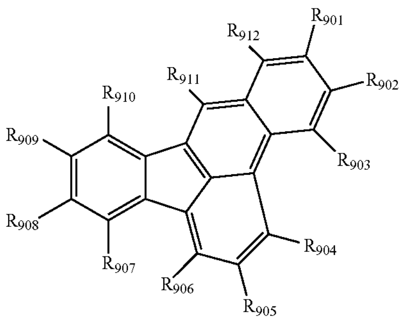
9B-11
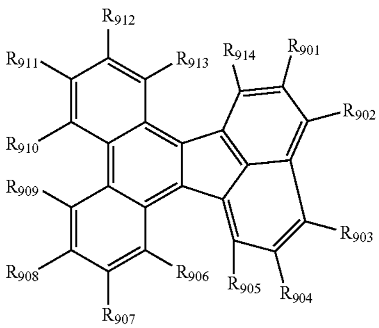
9B-12
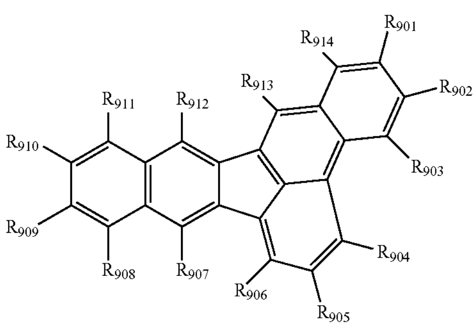
9B-13
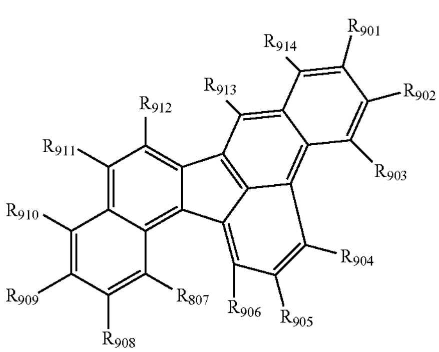
-continued
9B-14
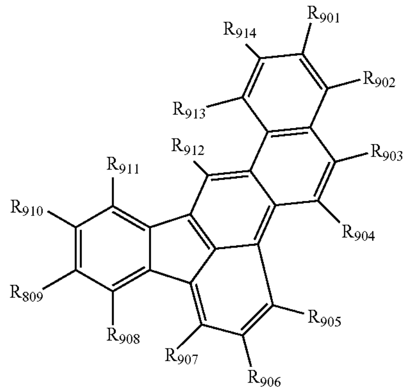
9B-15
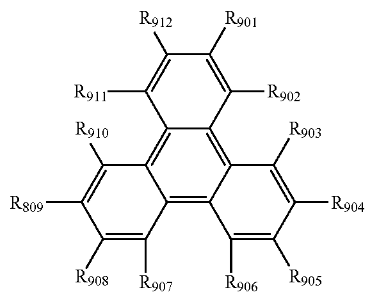
9B-16
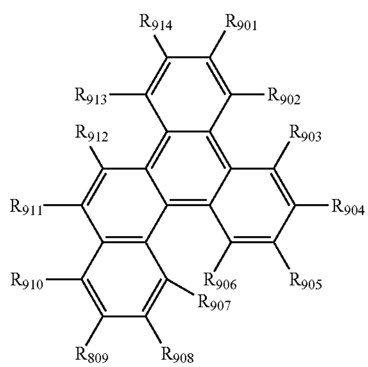
9B-17
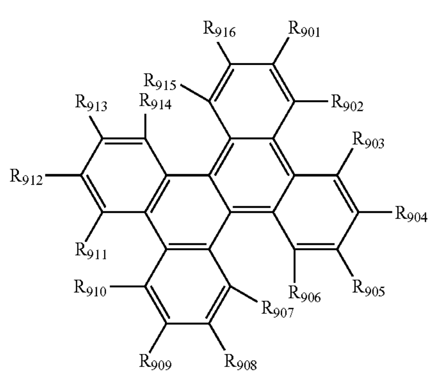

-continued
9B-18
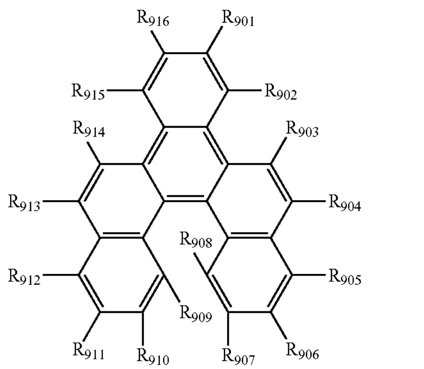
9B-19
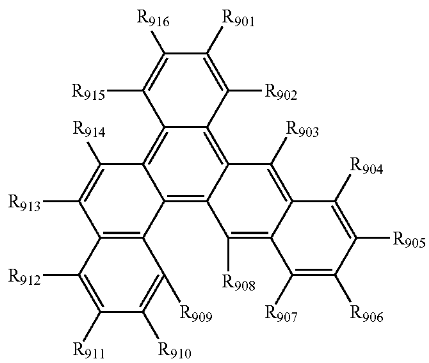
9C-1
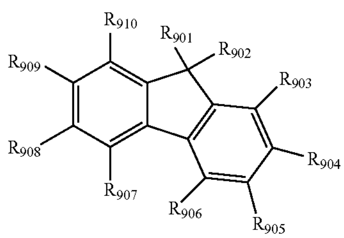
9C-2
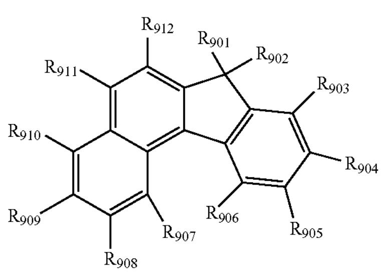
9C-3
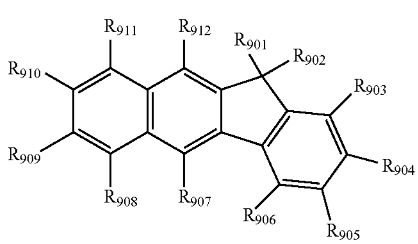
-continued
9C-4
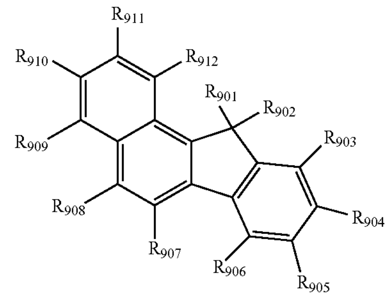
9C-5
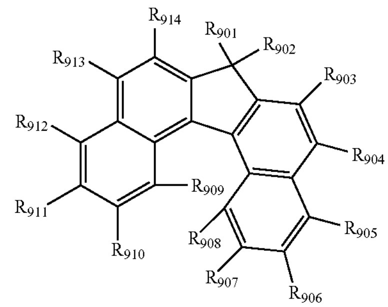
9C-6
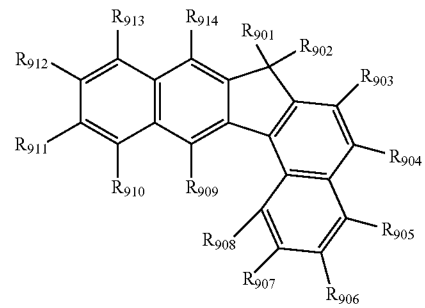
9C-7
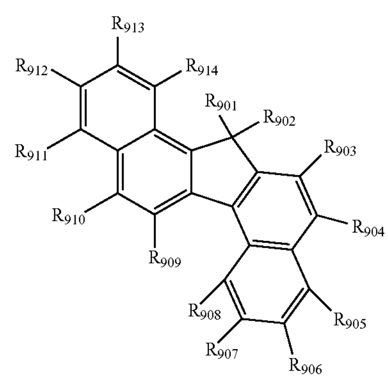
9C-8
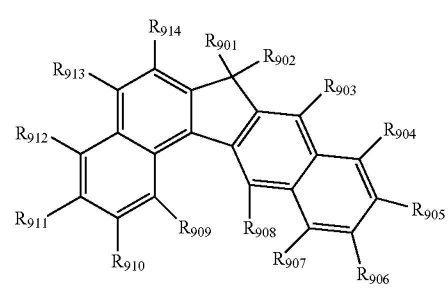

-continued
9C-9
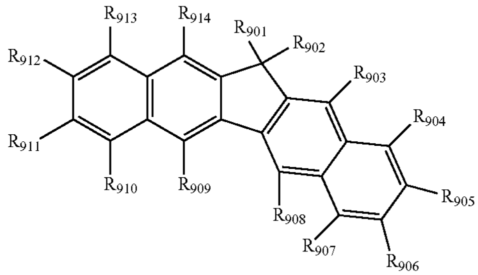
9C-10
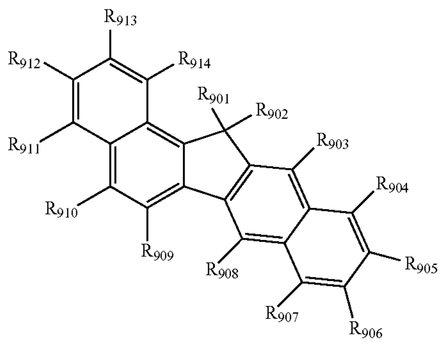
9C-11
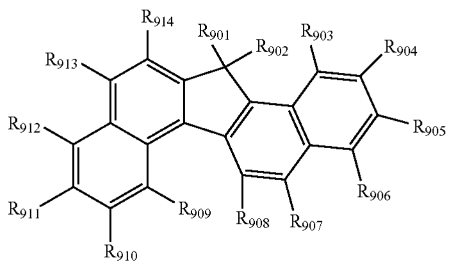
9C-12
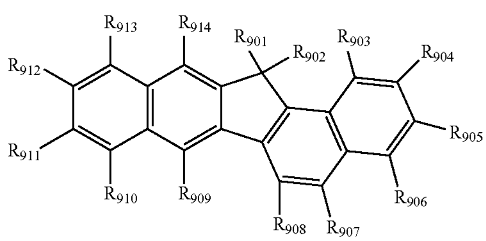
9C-13
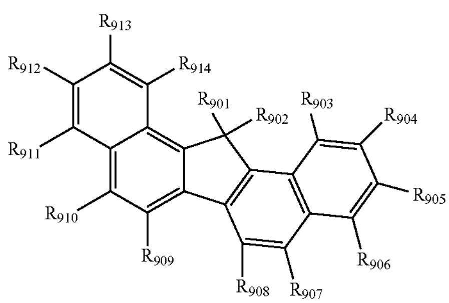
-continued
9C-14
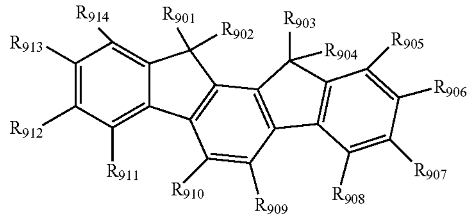
9C-15
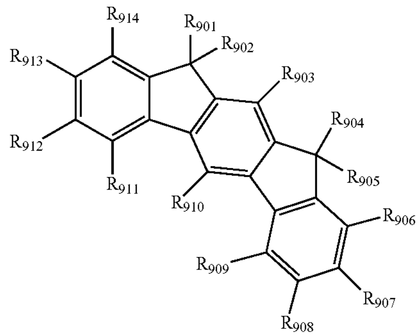
9C-16
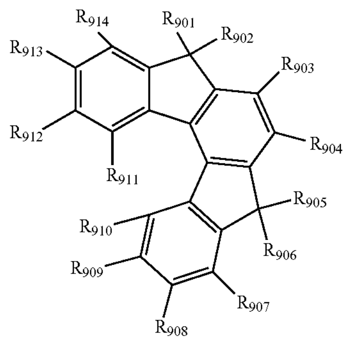
9C-17
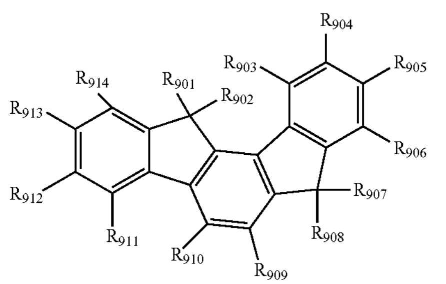
9C-18
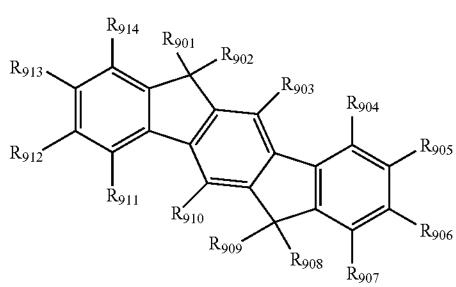

-continued 9C-19

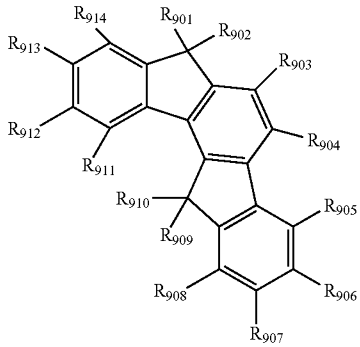

9D-1

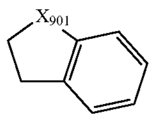

9D-2

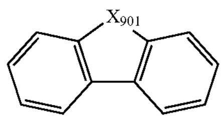

9D-3

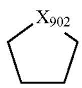

In Formulae 8A-1 to 8A-4, 8B-1 to 8B-19, 8D-1 to 8D-3, 8C-1 to 8C-19, 9A-1 to 9A-4, 9B-1 to 9B-19, 9C-1 to 9C-19, and 9D-1 to 9D-3, $Ar_{801}$ and $Ar_{901}$ may each be independently selected from a substituted or unsubstituted $C_3$-$C_{10}$ cycloalkane group, a substituted or unsubstituted $C_1$-$C_{10}$ heterocycloalkane group, a substituted or unsubstituted $C_3$-$C_{10}$ cycloalkene group, a substituted or unsubstituted $C_1$-$C_{10}$ heterocycloalkene group, a substituted or unsubstituted $C_6$-$C_{60}$ arene group, a substituted or unsubstituted $C_1$-$C_{60}$ heteroarene group, a substituted or unsubstituted non-aromatic condensed polycyclic group, and a substituted or unsubstituted non-aromatic condensed heteropolycyclic group, $L_{801}$ and $L_{901}$ may each be independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a801 and a901 may each be independently selected from 0, 1, 2, and 3, $A_{801}$ to $A_{804}$ may each be independently selected from a benzene, a naphthalene, a pyridine, a pyrimidine, a pyrazine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, the group of Formula 8D-1, and the group of Formula 8D-2, $A_{901}$ to $A_{904}$ may each be independently selected from a benzene, a naphthalene, a pyridine, a pyrimidine, a pyrazine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, the compound of Formula 9D-1, and the compound of Formula 9D-2, $A_{805}$ and $A_{905}$ may each be independently selected from a benzene and a naphthalene, $A_{806}$ may be represented by Formula 8D-3, and $A_{906}$ may be represented by Formula 9D-3, $X_{801}$ and $X_{802}$ may each be independently selected from $N(R_{806})$, O, S, $C(R_{806})(R_{807})$, $Si(R_{806})(R_{807})$, $B(R_{806})$, $P(R_{806})$, and $P(=O)(R_{806})$, and $X_{901}$ and $X_{902}$ may each be independently selected from $N(R_{906})$, O, S, $C(R_{906})(R_{907})$, $Si(R_{906})(R_{907})$, $B(R_{906})$, $P(R_{906})$, and $P(=O)(R_{906})$, $R_{801}$ to $R_{816}$ may each be independently selected from $*-[(L_{11})_{a11}-(R_{11})_{b11}]$, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein the number of $R_{801}$ to $R_{816}$ represented by $*-[(L_{11})_{a11}-(R_{11})_{b11}]$ may equal to n11, $R_{901}$ to $R_{916}$ may each be independently selected from $*-[(L_{21})_{a21}-(R_{21})_{b21}]$, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein the number of $R_{901}$ to $R_{916}$ represented by $*-[(L_{21})_{a21}-(R_{21})_{b21}]$ may equal to n21, b801 to b805 and b901 to b905 may each be independently selected from 1, 2, 3, and 4, n801 and n901 may each be independently selected from 2, 3, and 4, n802 and n902 may each be independently selected from 1, 2, and 3, and at least one substituent of the substituted $C_3$-$C_{10}$ cycloalkane group, the substituted $C_1$-$C_{10}$ heterocycloalkane group, the substituted $C_3$-$C_{10}$ cycloalkene group, the substituted $C_1$-$C_{10}$ heterocycloalkene group, the substituted $C_6$-$C_{60}$ arene group, the substituted $C_1$-$C_{60}$ heteroarene group, the substituted non-aromatic condensed polycyclic group, the substituted non-aromatic condensed heteropolycyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$, where $Q_{11}$ to $Q_{17}$, $Q_{21}$ to $Q_{27}$, and $Q_{31}$ to $Q_{37}$ may each be independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, but embodiments are not limited thereto.

In an example embodiment, in Formulae 8A-2 and 9A-2, $Ar_{801}$ and $Ar_{901}$ may each be independently selected from a cyclohexane, a benzene, a naphthalene, a pyridine, a pyrimidine, a triazine, a fluorene, and a spiro-fluorene, but $Ar_{801}$ and $Ar_{901}$ are not limited thereto.

In another example embodiment, in Formulae 8A-2 and 9A-2, $Ar_{801}$ and $Ar_{901}$ may each be independently selected from a cyclohexane, a benzene, a pyridine, and a fluorene, but $Ar_{801}$ and $Ar_{901}$ are not limited thereto.

For example, in Formulae 8A-2 and 9A-2, descriptions of $L_{801}$ and $L_{901}$ may each be independently as referred to in the descriptions provided in connection with $L_{11}$.

For example, in Formulae 8A-2 and 9A-2, descriptions of a801 and a901 may each be independently as referred to in the descriptions provided in connection with a11.

In an example embodiment, in Formulae 8A-1 to 8A-4 and 9A-1 to 9A-4, $A_{801}$ to $A_{804}$ and $A_{901}$ to $A_{904}$ may each be independently selected from a benzene, a naphthalene, a pyridine, a pyrimidine, a pyrazine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, and a quinazoline, but $A_{801}$ to $A_{804}$ and $A_{901}$ to $A_{904}$ are not limited thereto.

In another example embodiment, in Formulae 8A-1 to 8A-4 and 9A-1 to 9A-4, $A_{801}$ to $A_{804}$ and $A_{901}$ to $A_{904}$ may each be independently selected from a benzene, a naphthalene, a pyridine, a quinoline, and an isoquinoline, but $A_{801}$ to $A_{804}$ and $A_{901}$ to $A_{904}$ are not limited thereto.

In another example embodiment, in Formulae 8A-1 to 8A-4 and 9A-1 to 9A-4, $A_{801}$ to $A_{804}$ and $A_{901}$ to $A_{904}$ may each be independently selected from a benzene and a naphthalene, but $A_{801}$ to $A_{804}$ and $A_{901}$ to $A_{904}$ are not limited thereto.

For example, in Formulae 8A-4 and 9A-4, $A_{805}$ and $A_{905}$ may each be independently a benzene, but $A_{805}$ and $A_{905}$ are not limited thereto.

For example, in Formulae 8D-1 to 8D-3 and 9D-1 to 9D-3, $X_{801}$ and $X_{802}$ may each be independently selected from $N(R_{806})$, O, S, and $C(R_{806})(R_{807})$, and $X_{901}$ and $X_{902}$ may each be independently selected from $N(R_{906})$, O, S, and $C(R_{906})(R_{907})$, but embodiments of the present disclosure are not limited thereto.

For example, in Formulae 8A-1 to 8A-4, 8B-1 to 8B-19, 8D-1 to 8D-3, 8C-1 to 8C-19, 9A-1 to 9A-4, 9B-1 to 9B-19, 9C-1 to 9C-19, and 9D-1 to 9D-3, $R_{801}$ to $R_{816}$ may each be independently selected from *-$[(L_{11})_{a11}$-$(R_{11})_{b11}]$, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_6$-$C_{60}$ aryl group, and a $C_1$-$C_{60}$ heteroaryl group, wherein the number of $R_{801}$ to $R_{816}$ represented by *-[$(L_{11})_{a11}$-$(R_{11})_{b11}$] may equal to n11, $R_{901}$ to $R_{916}$ may each be independently selected from *-[$(L_{21})_{a21}$-$(R_{21})_{b21}$], hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_6$-$C_{60}$ aryl group, and a $C_1$-$C_{60}$ heteroaryl group, wherein the number of $R_{901}$ to $R_{916}$ represented by *-[$(L_{21})_{a21}$-$(R_{21})_{b21}$] may equal to n21, but embodiments of the present disclosure are not limited thereto.

In an example embodiment, in Formulae 8A-1 to 8A-4, 8B-1 to 8B-19, 8D-1 to 8D-3, 8C-1 to 8C-19, 9A-1 to 9A-4, 9B-1 to 9B-19, 9C-1 to 9C-19, and 9D-1 to 9D-3, $R_{801}$ to $R_{816}$ may each be independently selected from *-[$(L_{11})_{a11}$-$(R_{11})_{b11}$], hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an n-butyl group, an iso-butyl group, a sec-butyl group, a tert-butyl group, a phenyl group, a naphthyl group, and a pyridinyl group, wherein the number of $R_{801}$ to $R_{816}$ represented by *-[$(L_{11})_{a11}$-$(R_{11})_{b11}$] may equal to n11, $R_{901}$ to $R_{916}$ may each be independently selected from *-[$(L_{21})_{a21}$-$(R_{21})_{b21}$], hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, an n-propyl group, an n-butyl group, an iso-butyl group, a sec-butyl group, a tert-butyl group, a phenyl group, a naphthyl group, and a pyridinyl group, wherein the number of $R_{901}$ to $R_{916}$ represented by *-[$(L_{21})_{a21}$-$(R_{21})_{b21}$] may equal to n21, but embodiments are not limited thereto.

For example, in Formulae 8A-2 and 9A-2, n801 and n901 may each be independently selected from 2 and 3, but n801 and n901 are not limited thereto. When n801 and n901 each are independently 2 or more, a plurality of moieties indicated in [ ] respectively corresponding to n801 or n901 may be identical to or different from each other.

For example, in Formulae 8A-3 and 9A-3, n802 and n902 may each be independently selected from 1 and 2, but n802 and n902 are not limited thereto. When n801 and n901 each are independently 2 or more, a plurality of moieties indicated in [ ] may be identical to or different from each other.

In Formulae 1 and 2, $L_{11}$ and $L_{21}$ may each be independently selected from:

a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), where $Q_{11}$ to $Q_{17}$, $Q_{21}$ to $Q_{27}$, and $Q_{31}$ to $Q_{37}$ may each be independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an example embodiment, in Formulae 1 and 2, $L_{11}$ and $L_{21}$ may each be independently selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl, but embodiments are not limited thereto.

In another example embodiment, in Formulae 1 and 2, $L_{11}$ and $L_{21}$ may each be independently selected from a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzimidazolylene group, a benzofuranylene group, a benzothiophenylene group, a triazolylene group, a dibenzofuranylene group, and a dibenzothiophenylene group; and a phenylene group, a naphthylene group, a fluorenylene group, a phenanthrenylene group, an anthracenylene group, a triphenylenylene group, a pyrrolylene group, a thiophenylene group, a furanylene group, a pyridinylene group, a pyrazinylene group, a pyrimidinylene group, an indolylene group, a quinolinylene group, an isoquinolinylene group, a benzoquinolinylene group, a naphthyridinylene group, a quinoxalinylene group, a quinazolinylene group, a cinnolinylene group, a carbazolylene group, a phenanthridinylene group, a benzimidazolylene group, a benzofuranylene group, a benzothiophenylene group, a triazolylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but embodiments are not limited thereto.

In another example embodiment, in Formulae 1 and 2, $L_{11}$ and $L_{21}$ may each be independently a group represented by one of Formulae 3-1 to 3-18, but $L_{11}$ and $L_{21}$ are not limited thereto:

3-1

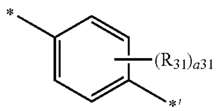

3-2

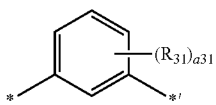

3-3

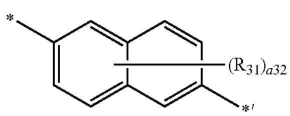

3-4

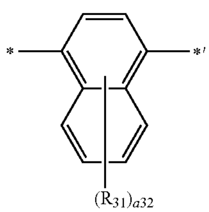

3-5

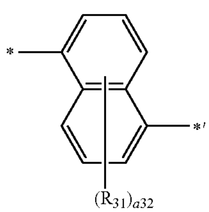

3-6

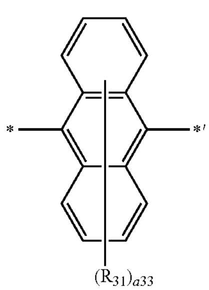

3-7

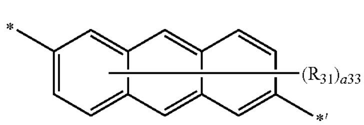

-continued 3-8

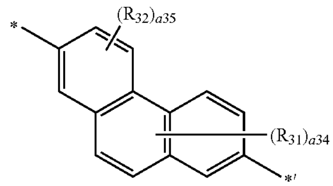

3-9

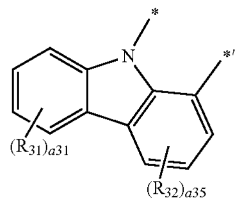

3-10

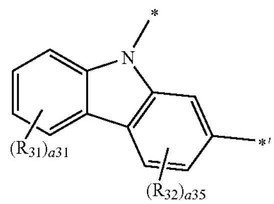

3-11

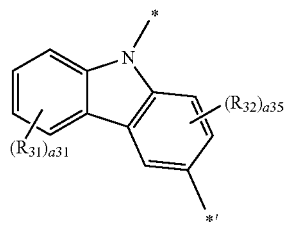

3-12

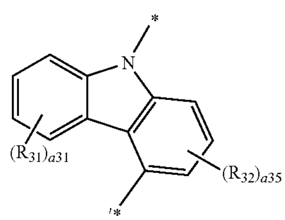

3-13

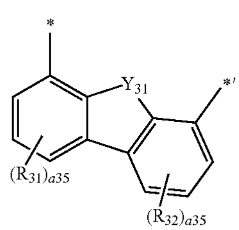

3-14

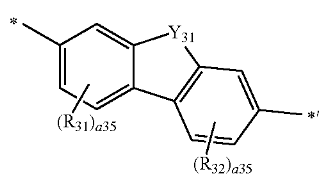

-continued 3-15

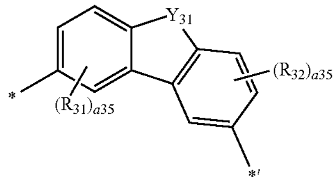

3-16

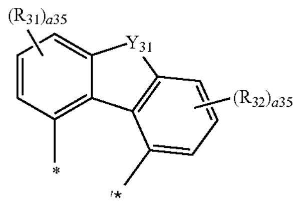

3-17

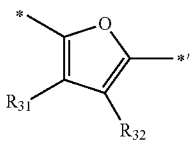

3-18

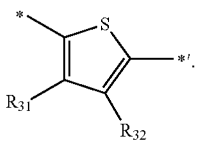

In Formulae 3-1 to 3-18, $Y_{31}$ may be selected from $C(R_{33})(R_{34})$, $N(R_{33})$, O, S and $Si(R_{33})(R_{34})$, $R_{31}$ to $R_{34}$ may each be independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a31 may be selected from 1, 2, 3, and 4, a32 may be selected from 1, 2, 3, 4, 5, and 6, a33 may be selected from 1, 2, 3, 4, 5, 6, 7, and 8, a34 may be selected from 1, 2, 3, 4, and 5, a35 may be selected from 1, 2, and 3, and

* and *' may each independently indicate a binding site to an adjacent atom.

In another example embodiment, in Formulae 1 and 2, $L_{11}$ and $L_{21}$ may each be independently a group represented by one of Formulae 4-1 to 4-36, but $L_{11}$ and $L_{21}$ are not limited thereto:

4-1

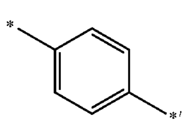

-continued 4-2

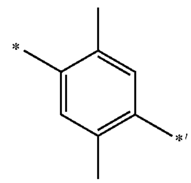

4-3

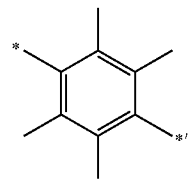

4-4

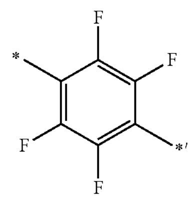

4-5

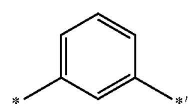

4-6

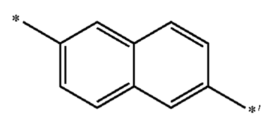

4-7

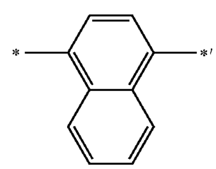

4-8

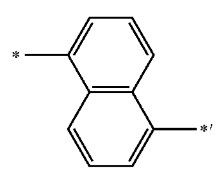

4-9

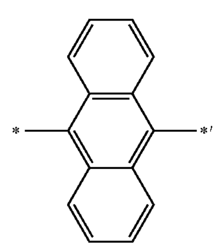

4-10

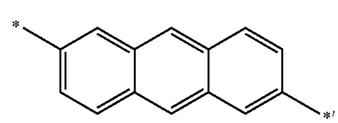

4-11
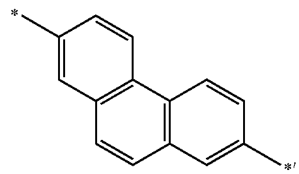
4-12
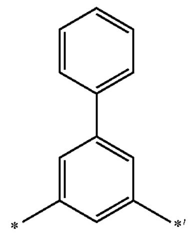
4-13
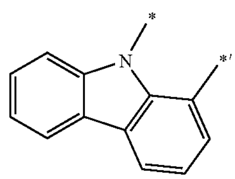
4-14
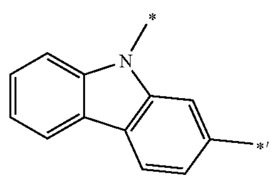
4-15
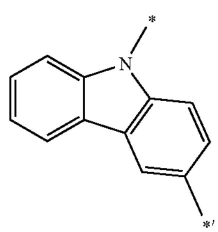
4-16
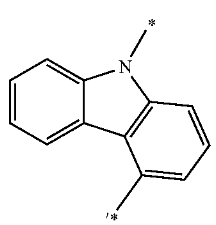
4-17
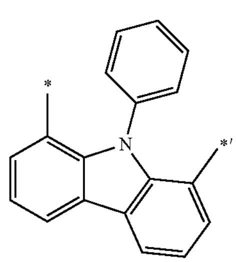
4-18
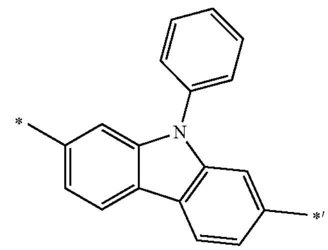
4-19
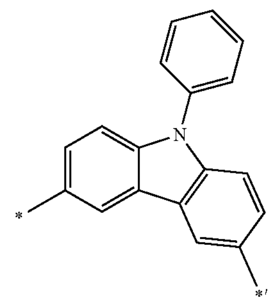
4-20
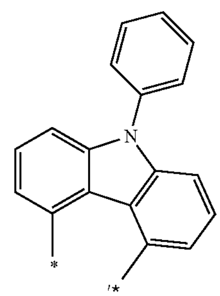
4-21
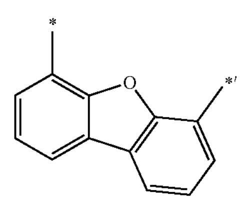
4-22
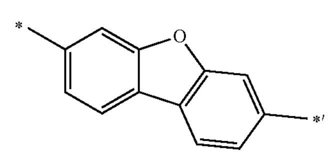
4-23
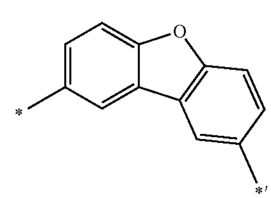
4-24
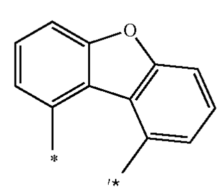

-continued 4-25

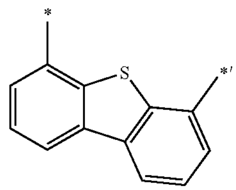

4-26

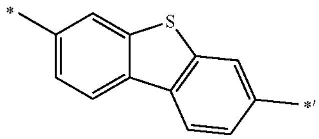

4-27

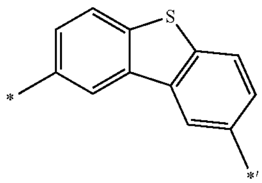

4-28

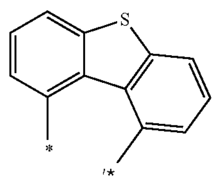

4-29

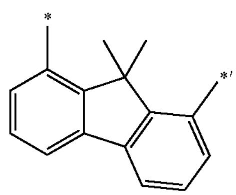

4-30

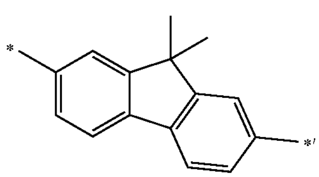

4-31

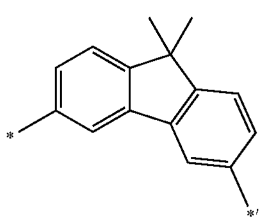

4-32

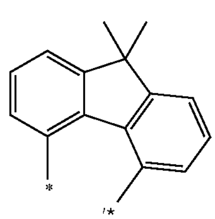

-continued 4-33

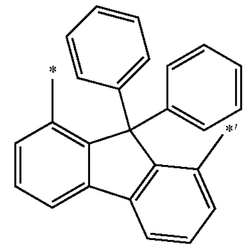

4-34

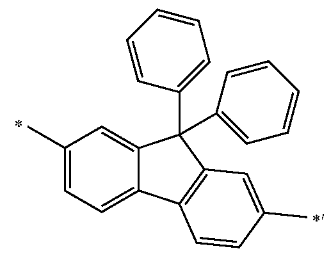

4-35

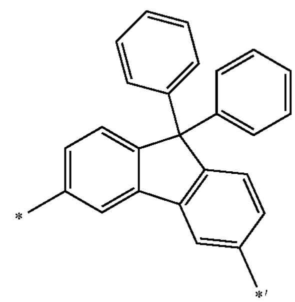

4-36

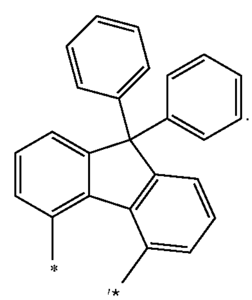

In Formulae 4-1 to 4-36,

* and *' may each independently indicate a binding site to an adjacent atom.

In Formula 1, a11 indicates the number of $L_{11}$, and may be selected from 0, 1, 2, and 3. For example, in Formula 1, a11 may be selected from 0 and 1, but a11 is not limited thereto. When a11 is 0, $(L_{11})_{a11}$ indicates a single bond. When a11 is 2 or more, a plurality of $L_{11}$s may be identical to or different from each other. For example, in Formulae 2, 8A-2, 8A-3, 9A-2, and 9A-3, descriptions of a21, a801, and a901 may each be independently as referred to in the description provided in connection with a11 and Formulae above.

In Formula 2, a21 may be selected from 0, 1, 2, and 3. For example, in Formula 2, a21 may be selected from 0 and 1, but a21 is not limited thereto.

In Formulae 1 and 2, $R_{11}$ may be a hole-transporting group, and $R_{21}$ may be an electron-transporting group.

For example, in Formula 1, $R_{11}$ may be selected from:

a phenyl group, a naphthyl group, a fluorenyl group, a benzofluorenyl group, a dibenzofluorenyl group, a phenanthrenyl group, an anthracenyl group, a triphenylenyl group, a benzofuranyl group, a benzothiophenyl group, a dibenzofuranyl group, a dibenzothiophenyl group, a carbazolyl group, and —N($R_{56}$)($R_{57}$);

a phenyl group, a naphthyl group, a fluorenyl group, a benzofluorenyl group, a dibenzofluorenyl group, a phenanthrenyl group, an anthracenyl group, a triphenylenyl group, a benzofuranyl group, a benzothiophenyl group, a dibenzofuranyl group, a dibenzothiophenyl group, and a carbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, a monovalent non-aromatic condensed heteropolycyclic group, —N($Q_{41}$)($Q_{42}$), —Si($Q_{43}$)($Q_{44}$)($Q_{45}$), and —B($Q_{46}$)($Q_{47}$); and a phenyl group, a naphthyl group, a fluorenyl group, a benzofluorenyl group, a dibenzofluorenyl group, a phenanthrenyl group, an anthracenyl group, a triphenylenyl group, a benzofuranyl group, a benzothiophenyl group, a dibenzofuranyl group, a dibenzothiophenyl group, and a carbazolyl group, each substituted with at least one selected from a $C_6$-$C_{20}$ aryl group, a $C_1$-$C_{20}$ heteroaryl group, a monovalent non-aromatic condensed polycyclic group, and a monovalent non-aromatic condensed heteropolycyclic group that are each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, where $R_{56}$ and $R_{57}$ may each be independently selected from:

a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group; and a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, and $Q_{41}$ to $Q_{47}$ may each be independently selected from a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, but embodiments are not limited thereto.

In another example embodiment, in Formula 1, $R_{11}$ may be selected from groups represented by Formulae 5-1 to 5-13, but $R_{11}$ is not limited thereto:

5-1

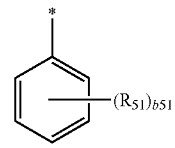

5-2

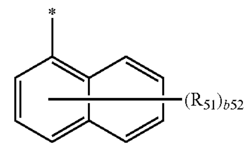

5-3

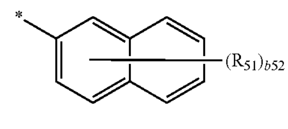

5-4

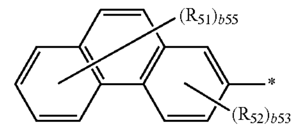

5-5

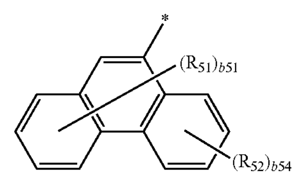

5-6

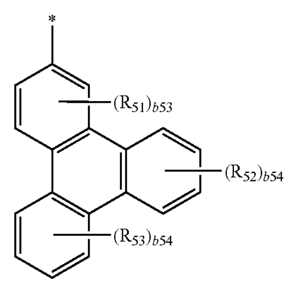

5-7

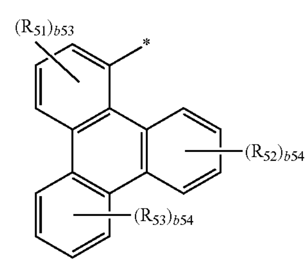

5-8

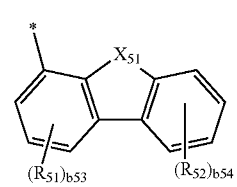

5-9

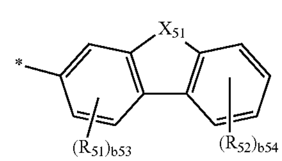

-continued 5-10

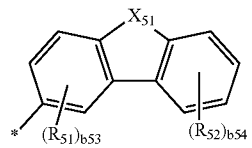

5-11

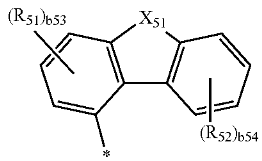

5-12

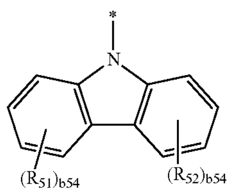

5-13

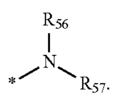

In Formulae 5-1 to 5-13, $X_{51}$ may be selected from O, S, $N(R_{54})$, and $C(R_{54})(R_{55})$, $R_{51}$ to $R_{55}$ may each be independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, a monovalent non-aromatic condensed heteropolycyclic group, $—N(Q_{41})(Q_{42})$, $—Si(Q_{43})(Q_{44})(Q_{45})$, and $—B(Q_{46})(Q_{47})$; and a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, where $R_{56}$ and $R_{57}$ may each be independently selected from:

a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group; and a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, and $Q_{41}$ to $Q_{47}$ may each be independently selected from a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, b51 may be selected from 1, 2, 3, 4, and 5, b52 may be selected from 1, 2, 3, 4, 5, 6, and 7, b53 may be selected from 1, 2, and 3, b54 may be selected from 1, 2, 3, and 4, b55 may be selected from 1, 2, 3, 4, 5, and 6, and

* indicates a binding site to an adjacent atom.

In another example embodiment, in Formula 1, $R_{11}$ may be selected from groups represented by Formulae 6-1 to 6-59, but $R_{11}$ is not limited thereto:

6-1

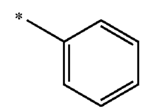

6-2

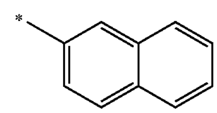

6-3

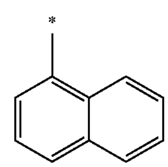

6-4

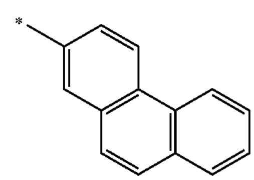

6-5

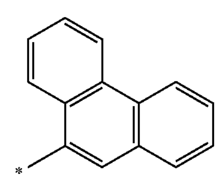

6-6

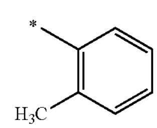

6-7

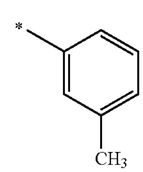

-continued
6-8
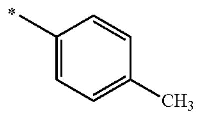
6-9
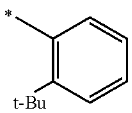
6-10
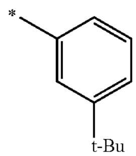
6-11
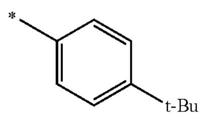
6-12
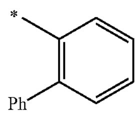
6-13
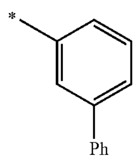
6-14
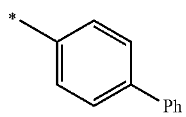
6-15
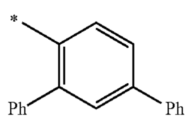
6-16
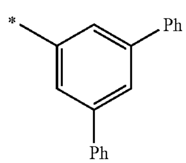
6-17
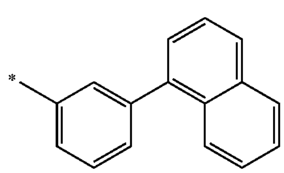
6-18
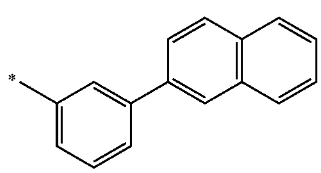
-continued
6-19
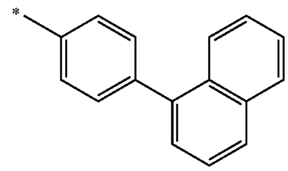
6-20
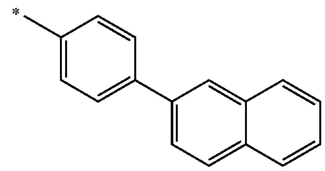
6-21
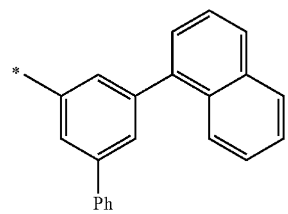
6-22
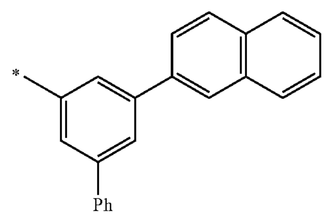
6-23
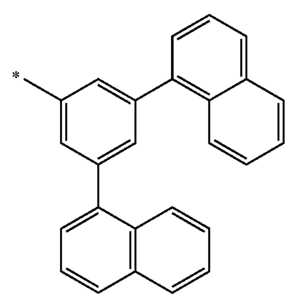
6-24
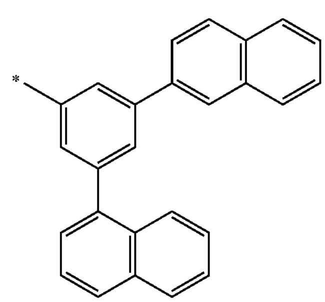

-continued
6-25
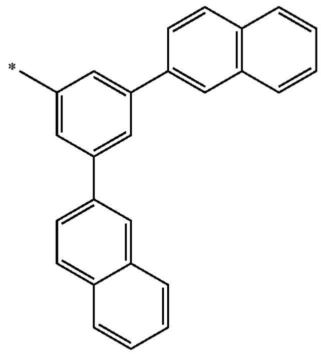
6-26
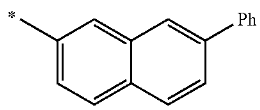
6-27
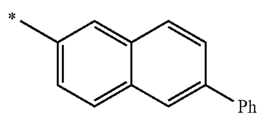
6-28
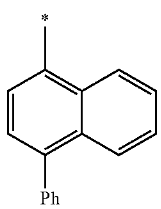
6-29
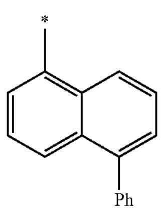
6-30
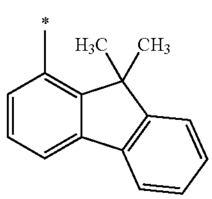
6-31
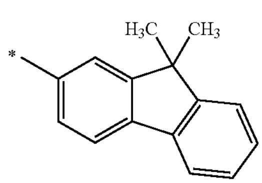
6-32
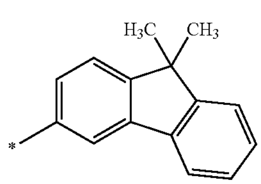
-continued
6-33
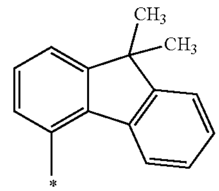
6-34
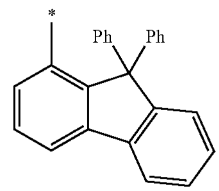
6-35
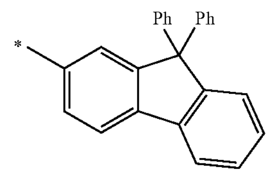
6-36
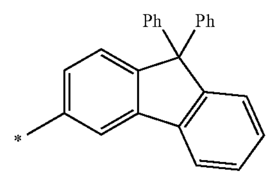
6-37
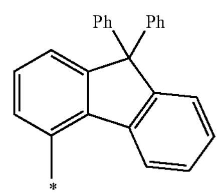
6-38
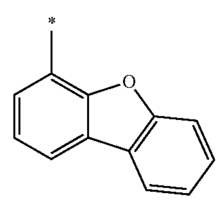
6-39
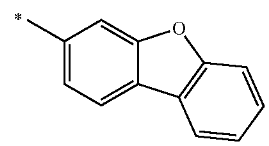
6-40
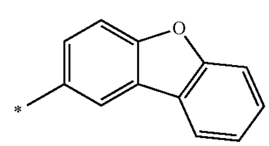
6-41
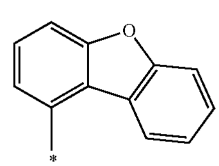

6-42
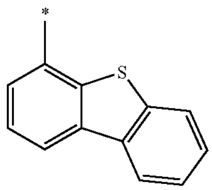
6-43
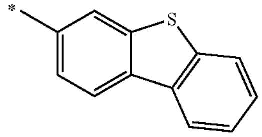
6-44
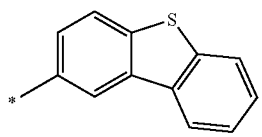
6-45
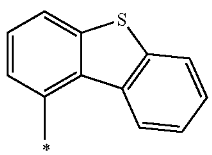
6-46
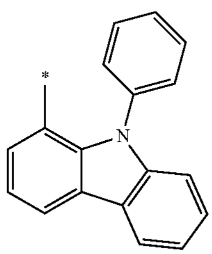
6-47
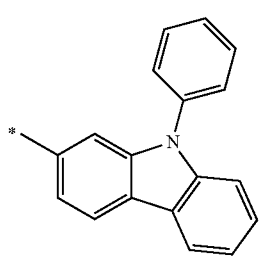
6-48
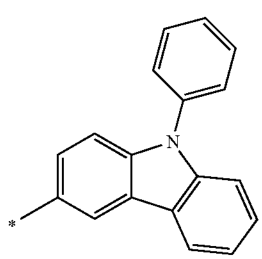
6-49
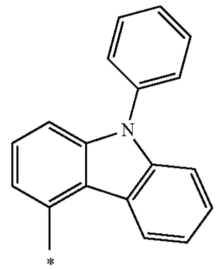
6-50
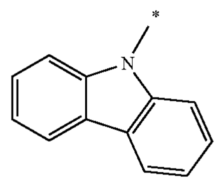
6-51
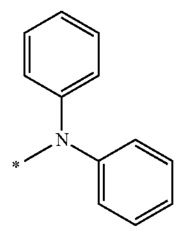
6-52
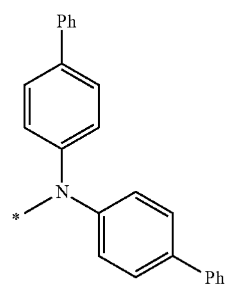
6-53
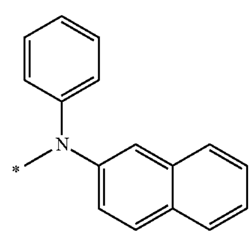
6-54
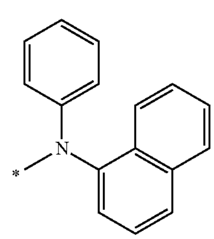

-continued 6-55

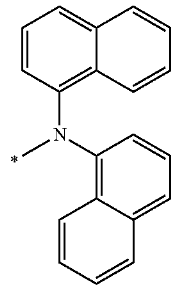

6-56

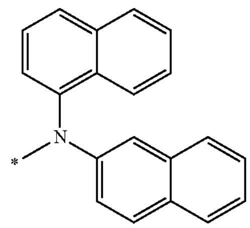

6-57

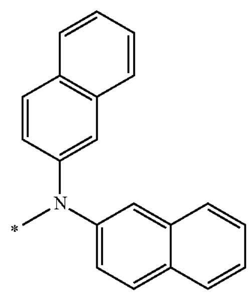

6-58

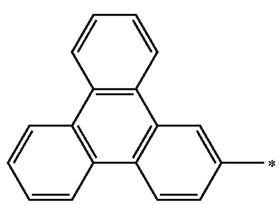

6-59

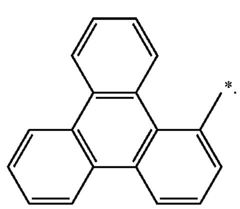

In Formulae 6-1 to 6-59, t-Bu indicates a tert-butyl group,

Ph indicates a phenyl group, and

* indicates a binding site to an adjacent atom.

In an example embodiment, in Formula 2, $R_{21}$ may be selected from:

a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzothiazolyl group, a benzoxazolyl group, a benzimidazolyl group, a triazolyl group, a triazinyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group;

a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzothiazolyl group, a benzoxazolyl group, a benzimidazolyl group, a triazolyl group, a triazinyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, a monovalent non-aromatic condensed heteropolycyclic group, —N($Q_{41}$)($Q_{42}$), —Si($Q_{43}$)($Q_{44}$)($Q_{45}$), and —B($Q_{46}$)($Q_{47}$); and a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzothiazolyl group, a benzoxazolyl group, a benzimidazolyl group, a triazolyl group, a triazinyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, where $Q_{41}$ to $Q_{47}$ may each be independently selected from a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, but embodiments are not limited thereto.

In another example embodiment, in Formula 2, $R_{21}$ may be selected from groups represented by Formulae 5-21 to 5-79, but $R_{21}$ are not limited thereto:

5-21

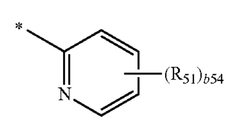

-continued
5-22
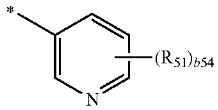
5-23
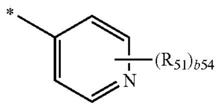
5-24
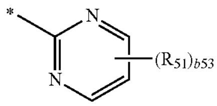
5-25
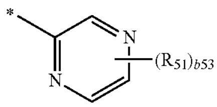
5-26
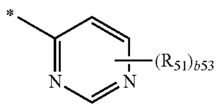
5-27
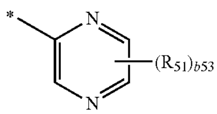
5-28
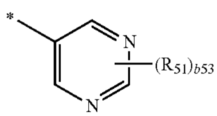
5-29
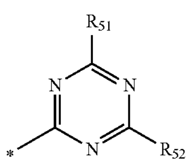
5-30
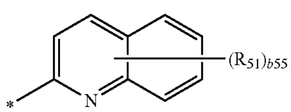
5-31
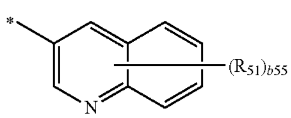
5-32
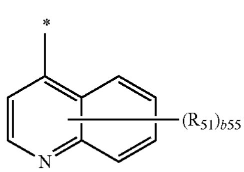
5-33
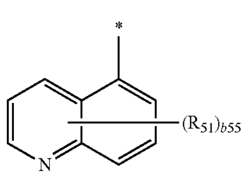
-continued
5-34
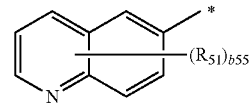
5-35
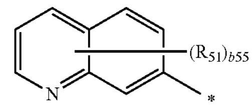
5-36
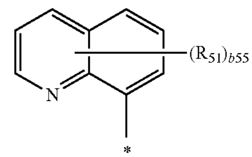
5-37
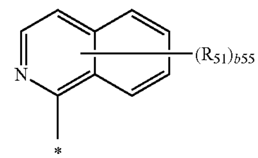
5-38
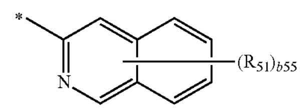
5-39
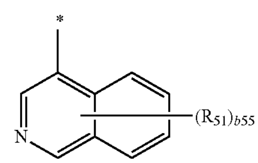
5-40
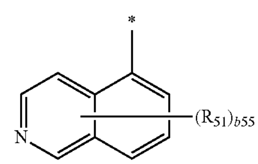
5-41
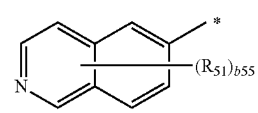
5-42
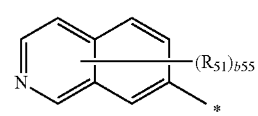
5-43
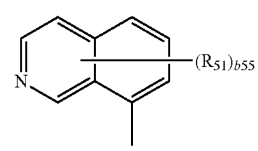
5-44
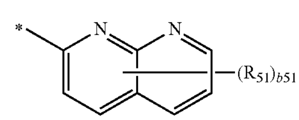

-continued
5-45
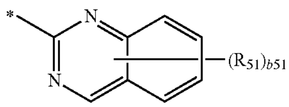
5-46
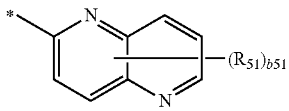
5-47
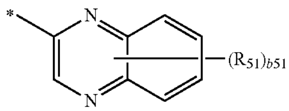
5-48
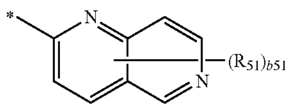
5-49
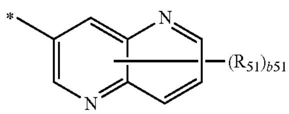
5-50
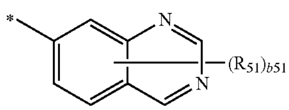
5-51
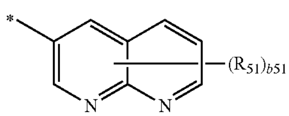
5-52
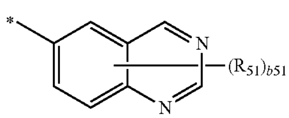
5-53
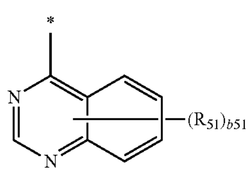
5-54
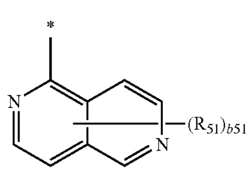
5-55
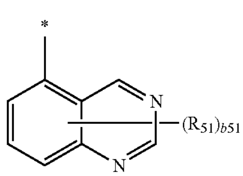
-continued
5-56
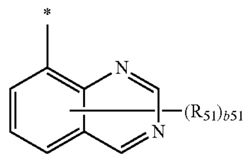
5-57
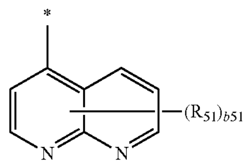
5-58
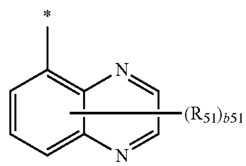
5-59
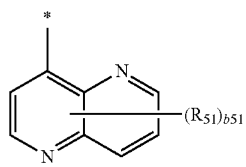
5-60
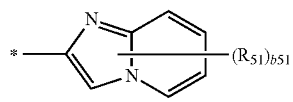
5-61
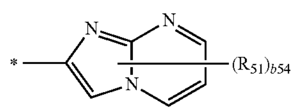
5-62
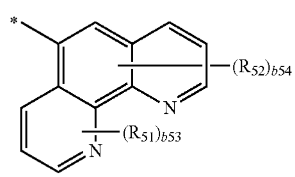
5-63
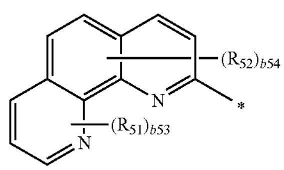
5-64
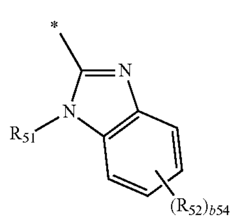

-continued 5-65

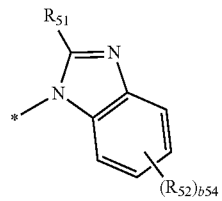

5-66

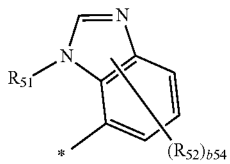

5-67

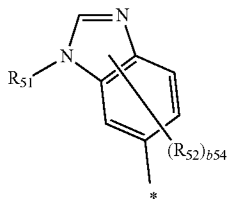

5-68

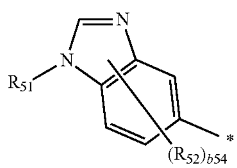

5-69

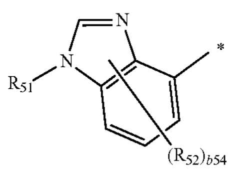

5-70

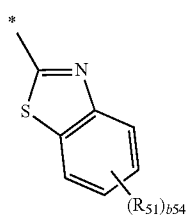

5-71

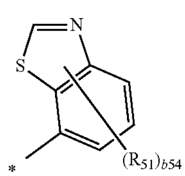

5-72

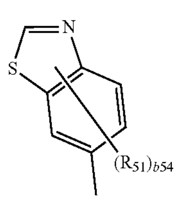

-continued 5-73

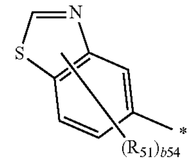

5-74

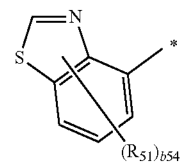

5-75

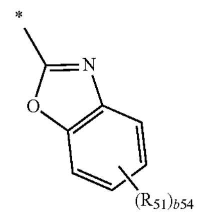

5-76

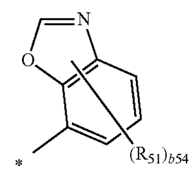

5-77

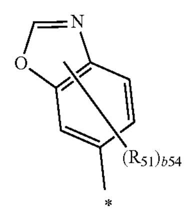

5-78

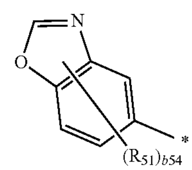

5-79

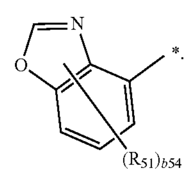

In Formulae 5-21 to 5-79, $R_{51}$ and $R_{52}$ may each be independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, a monovalent non-aromatic condensed heteropolycyclic group, —N($Q_{41}$)($Q_{42}$), —Si($Q_{43}$)($Q_{44}$)($Q_{45}$), and —B($Q_{46}$)($Q_{47}$); and a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

$Q_{41}$ to $Q_{47}$ may each be independently selected from a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group;

b51 may be selected from 1, 2, 3, 4, and 5, b53 may be selected from selected from 1, 2, and 3, b54 may be selected from selected from 1, 2, 3, and 4, b55 may be selected from 1, 2, 3, 4, 5, and 6, and

* indicates a binding site to an adjacent atom.

In another example embodiment, in Formula 2, $R_{21}$ may be selected from groups represented by Formulae 6-61 to 6-219, but $R_{21}$ is not limited thereto:

6-61

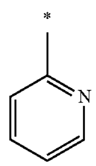

6-62

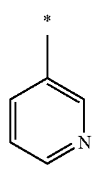

6-63

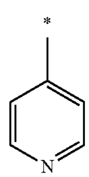

6-64

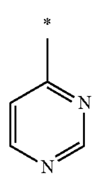

6-65

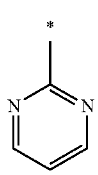

6-66

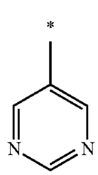

-continued 6-67

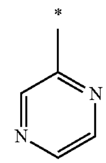

6-68

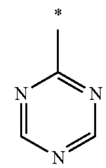

6-69

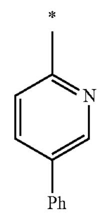

6-70

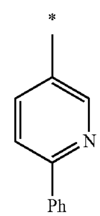

6-71

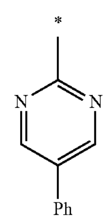

6-72

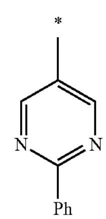

6-73

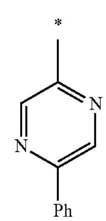

6-74

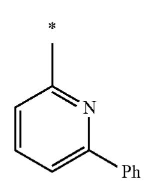

6-75
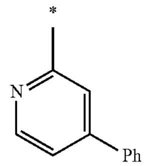
6-76
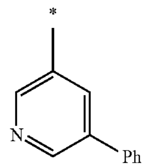
6-77
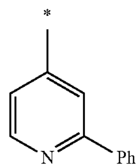
6-78
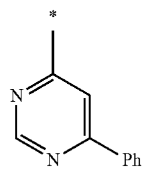
6-79
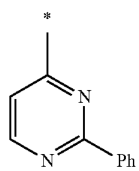
6-80
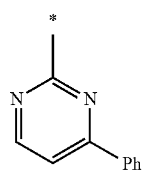
6-81
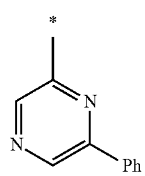
6-82
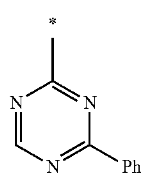
6-83
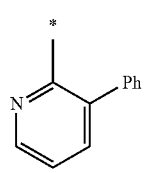
6-84
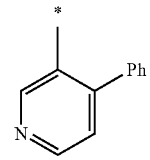
6-85
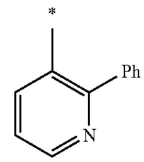
6-86
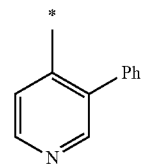
6-87
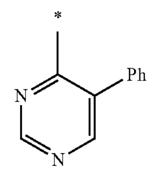
6-88
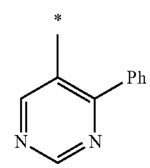
6-89
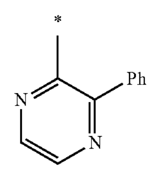
6-90
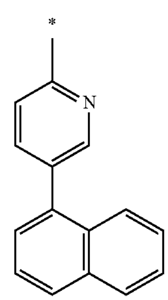

6-91
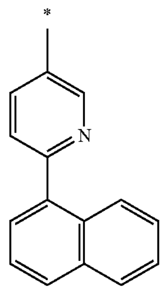
6-92
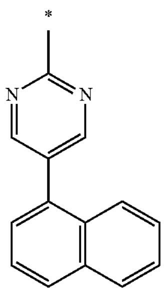
6-93
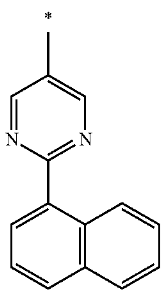
6-94
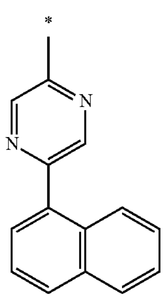
6-95
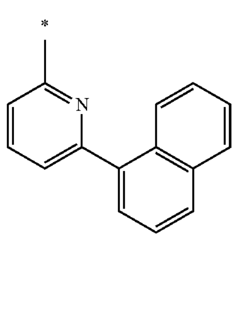
6-96
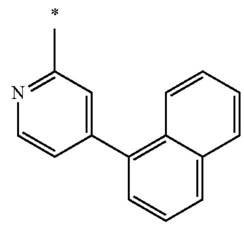
6-97
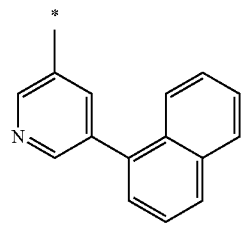
6-98
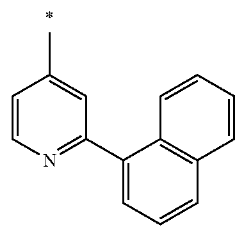
6-99
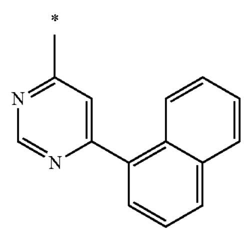
6-100
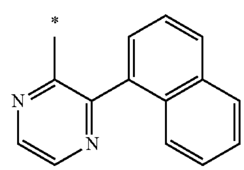
6-101
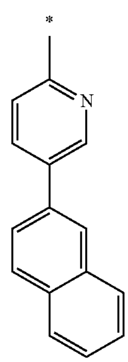

6-102
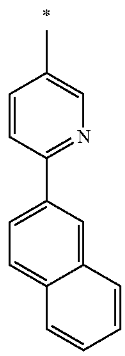
6-103
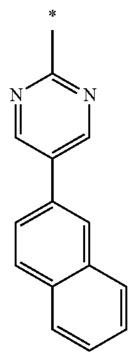
6-104
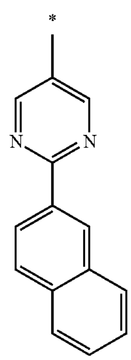
6-105
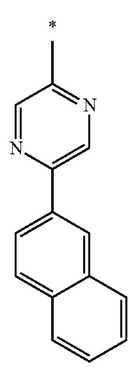
6-106
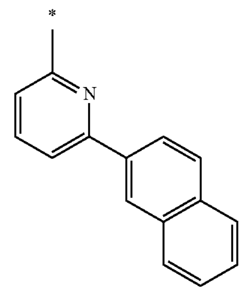
6-107
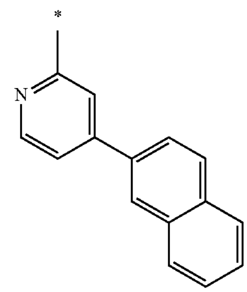
6-108
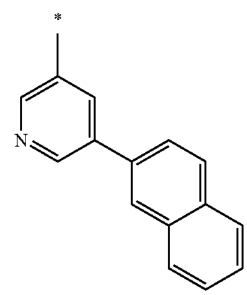
6-109
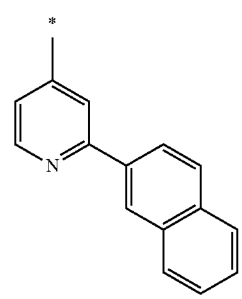
6-110
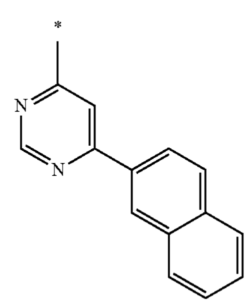

6-111
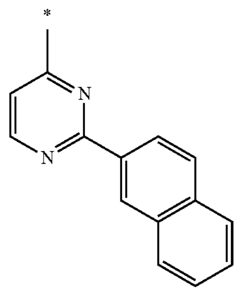
6-112
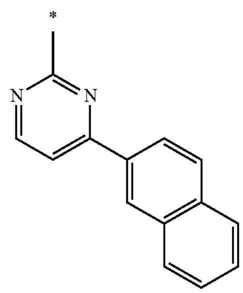
6-113
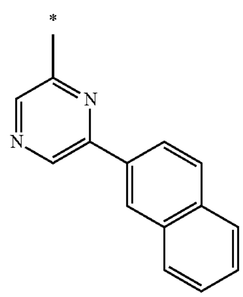
6-114
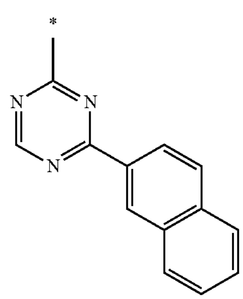
6-115
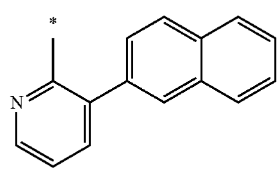
6-116
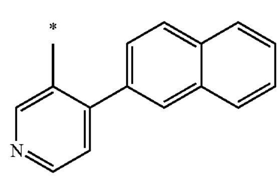
6-117
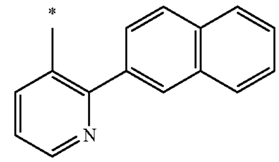
6-118
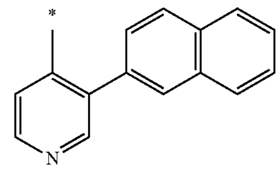
6-119
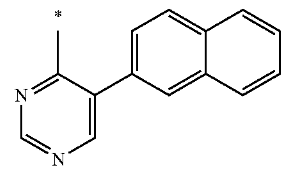
6-120
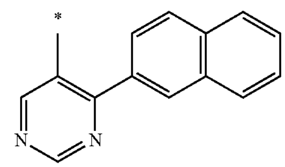
6-121
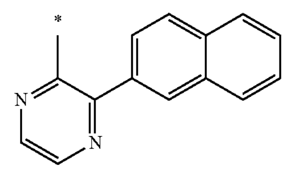
6-122
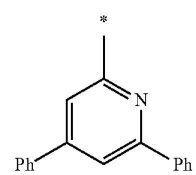
6-123
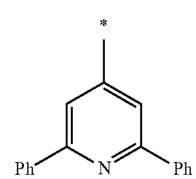
6-124
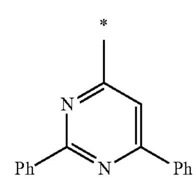
6-125
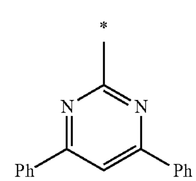

6-126
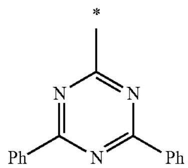
6-127
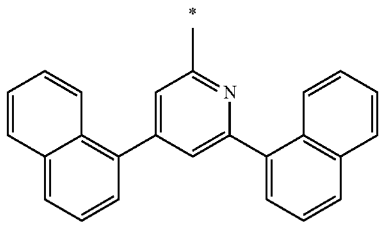
6-128
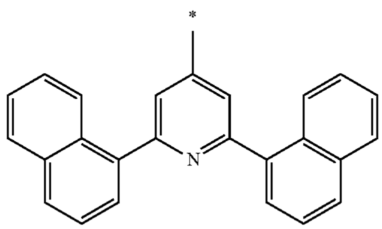
6-129
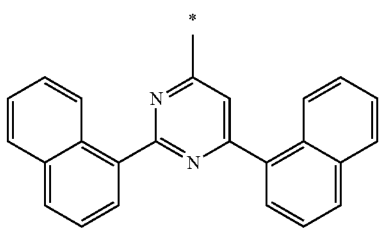
6-130
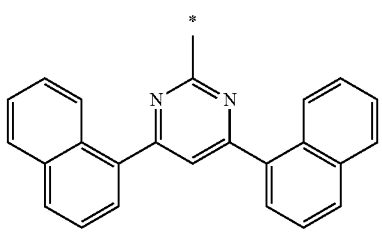
6-131
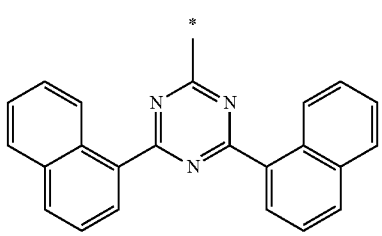
6-132
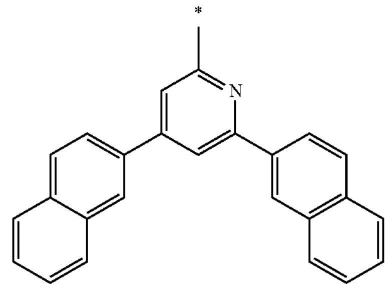
6-133
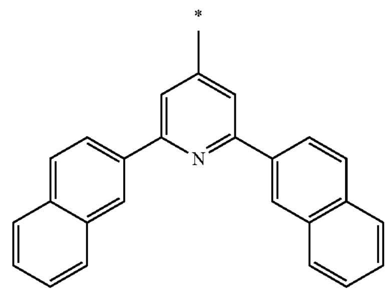
6-134
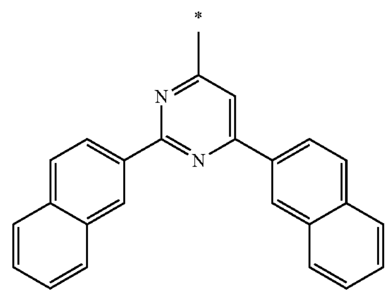
6-135
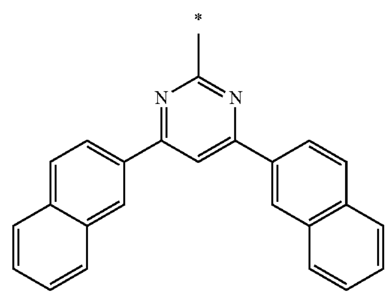
6-136
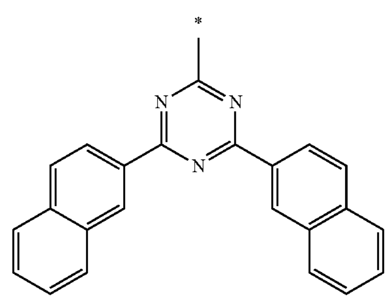

-continued
6-137
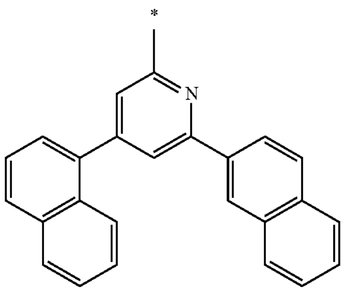
6-138
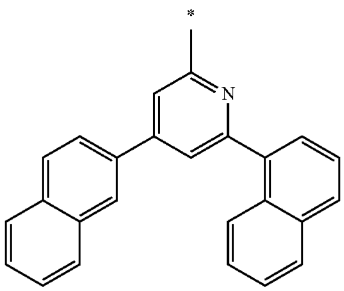
6-139
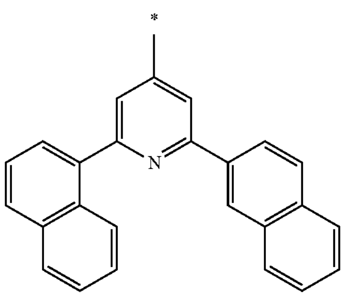
6-140
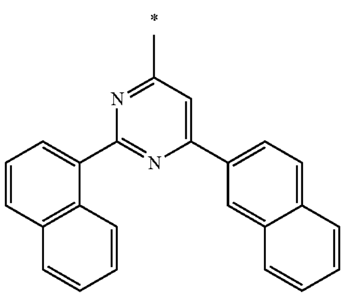
6-141
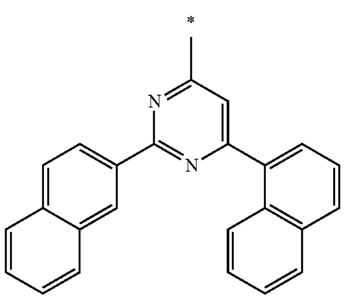
-continued
6-142
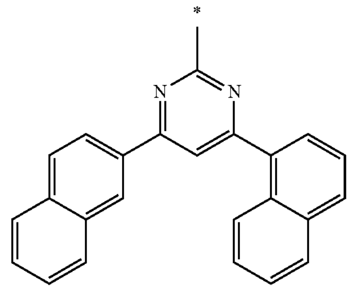
6-143
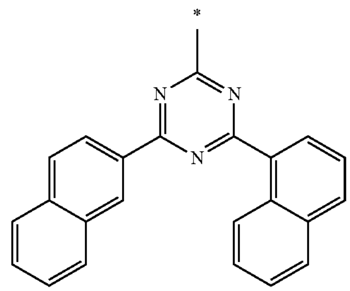
6-144
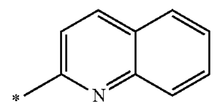
6-145
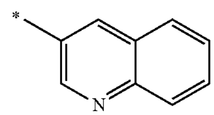
6-146
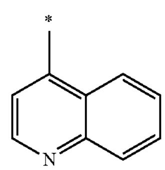
6-147
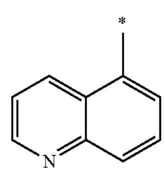
6-148
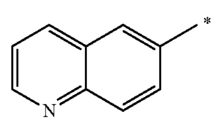
6-149
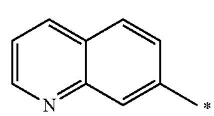
6-150
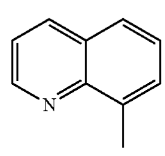

-continued
6-151
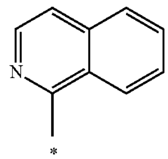
6-152
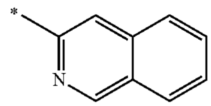
6-153
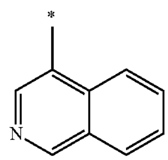
6-154
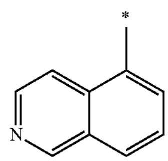
6-155
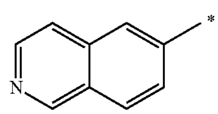
6-156
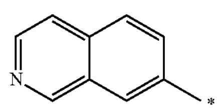
6-157
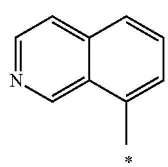
6-158
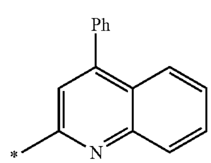
6-159
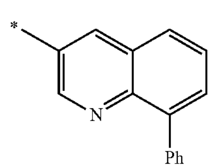
6-160
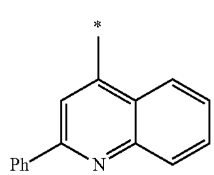
-continued
6-161
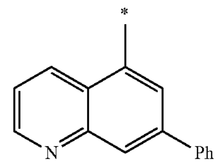
6-162
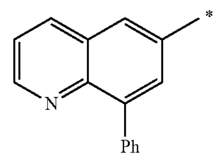
6-163
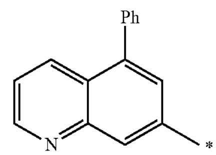
6-164
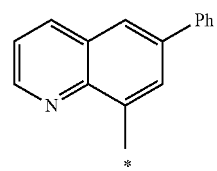
6-165
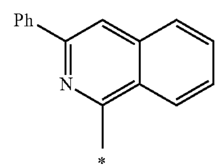
6-166
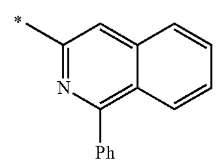
6-167
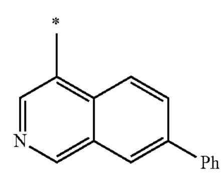
6-168
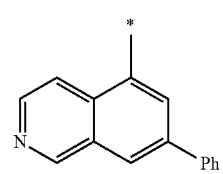
6-169
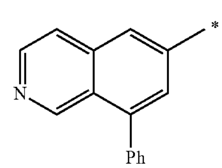

-continued
6-170
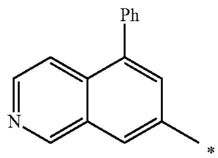
6-171
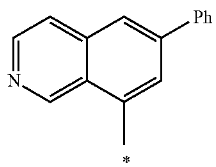
6-172
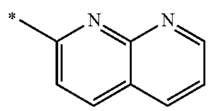
6-173
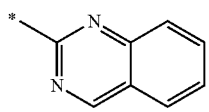
6-174
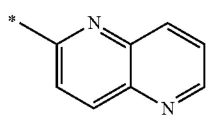
6-175
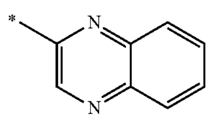
6-176
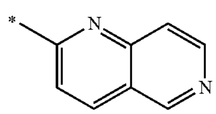
6-177
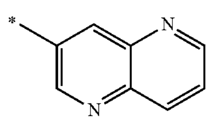
6-178
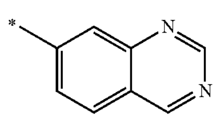
6-179
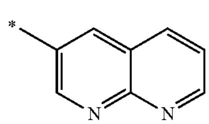
6-180
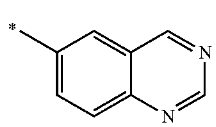
-continued
6-181
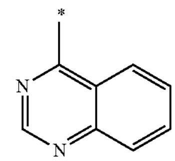
6-182
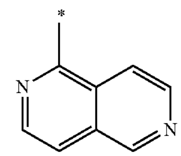
6-183
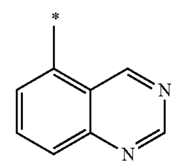
6-184
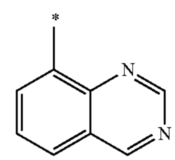
6-185
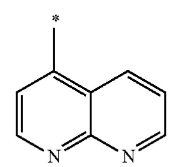
6-186
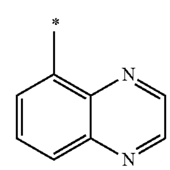
6-187
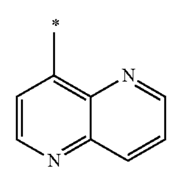
6-188
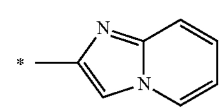
6-189
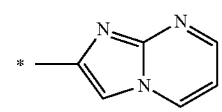
6-190
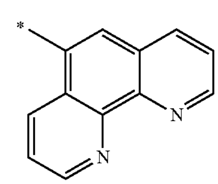

-continued
6-191
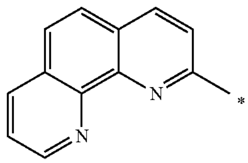
6-192
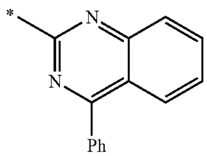
6-193
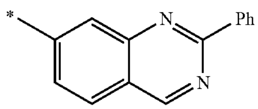
6-194
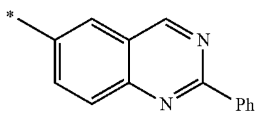
6-195
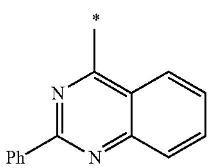
6-196
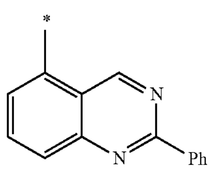
6-197
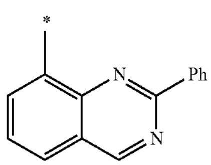
6-198
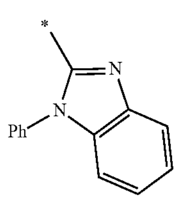
6-199
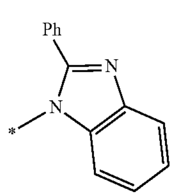
-continued
6-200
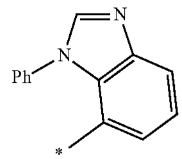
6-201
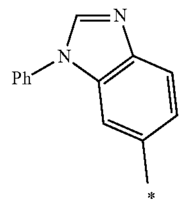
6-202
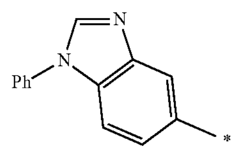
6-203
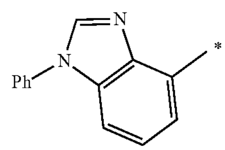
6-204
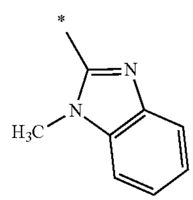
6-205
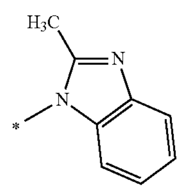
6-206
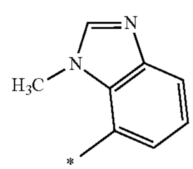
6-207
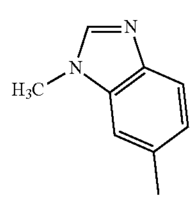

-continued 6-208

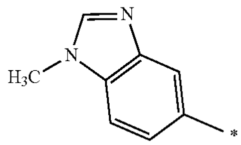

6-209

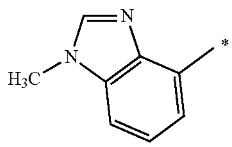

6-210

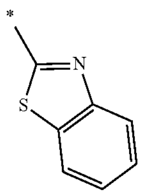

6-211

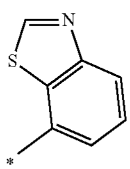

6-212

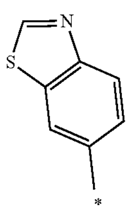

6-213

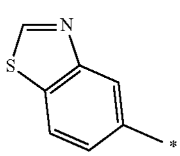

6-214

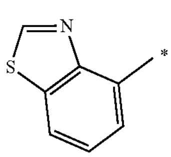

6-215

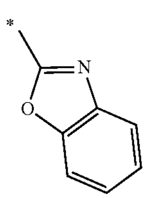

6-216

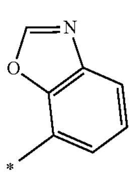

-continued 6-217

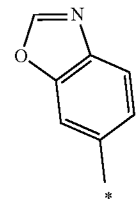

6-218

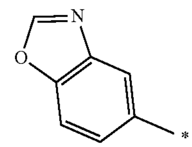

6-219

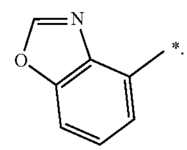

In Formulae 6-61 to 6-219,

Ph indicates a phenyl group, and

* indicates a binding site to an adjacent atom.

In Formula 1, b11 indicates the number of $R_{11}$, and may be selected from 1, 2, and 3. For example, in Formula 1, b11 may be selected from 1 and 2, but b11 is not limited thereto. When b11 is 2 or more, a plurality of $R_{11}$s may be identical to or different from each other.

In Formula 2, b21 indicates the number of $R_{21}$, and may be selected from 1, 2, and 3. For example, in Formula 1, b21 may be selected from 1 and 2, but b21 is not limited thereto. When b21 is 2 or more, a plurality of $R_{21}$s may be identical to or different from each other.

In Formula 1, n11 indicates the number of *-[$(L_{11})_{a11}$-$(R_{11})_{b11}$], and may be selected from 1, 2, 3, and 4. For example, in Formula 1, n11 may be selected from 1 and 2, but n11 is not limited thereto. When n11 is 2 or more, a plurality of *-[$(L_{11})_{a11}$-$(R_{11})_{b11}$]s may be identical to or different from each other.

In Formula 2, n21 indicates the number of *-[$(L_{21})_{a21}$-$(R_{21})_{b21}$], and may be selected from 1, 2, 3, and 4. For example, in Formula 2, n21 may be selected from 1 and 2, but n21 is not limited thereto. When n21 is 2 or more, a plurality of *-[$(L_{21})_{a21}$-$(R_{21})_{b21}$]s may be identical to or different from each other.

For example, the first host may be represented by one of Formulae 1-1 to 1-14 and 2-1 to 2-14, but the first host is not limited thereto:

1-1

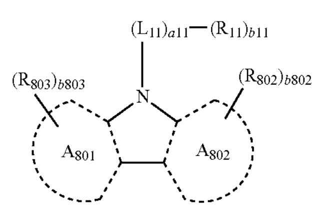

-continued
1-2
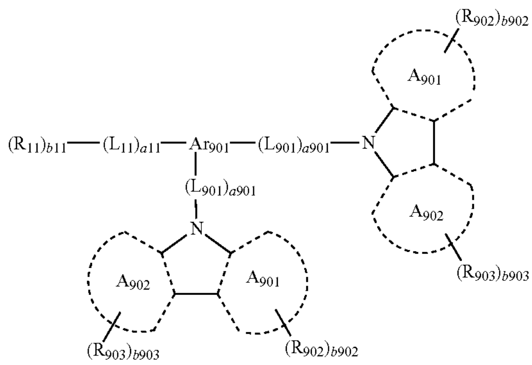
1-3
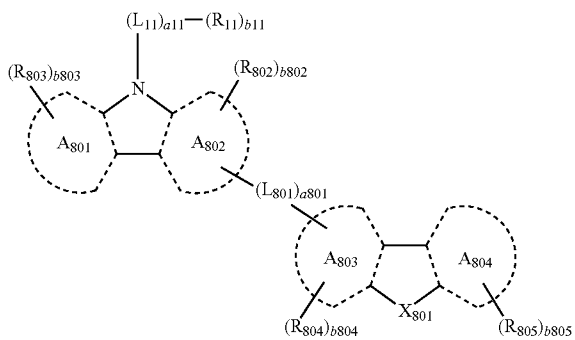
1-4
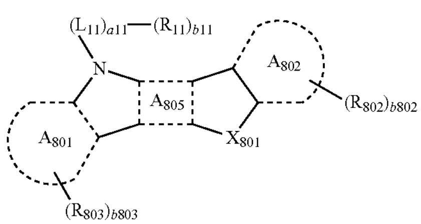
1-5
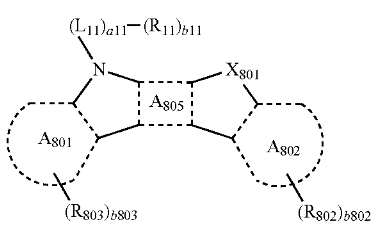
1-6
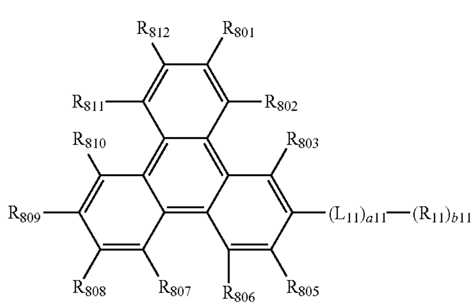
-continued
1-7
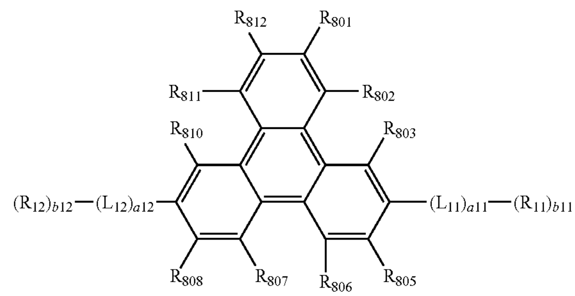
1-8
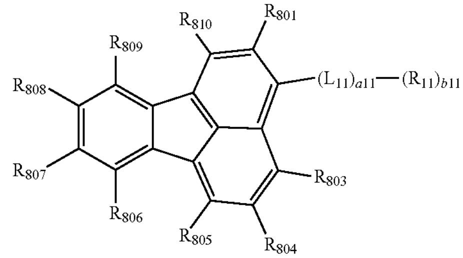
1-9
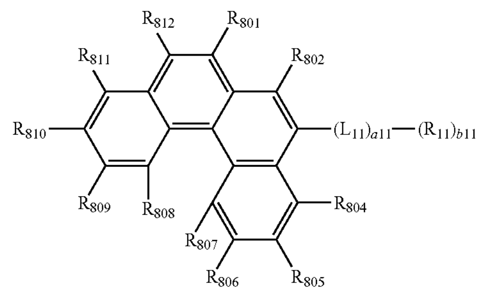
1-10
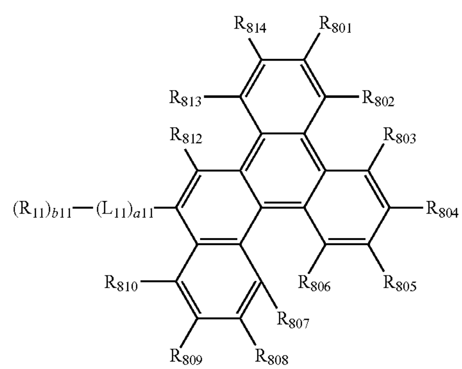
1-11
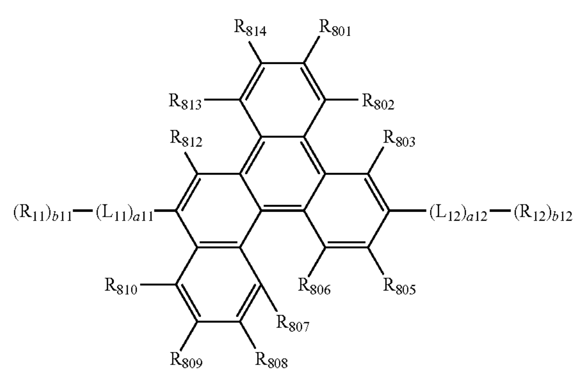

-continued
1-12
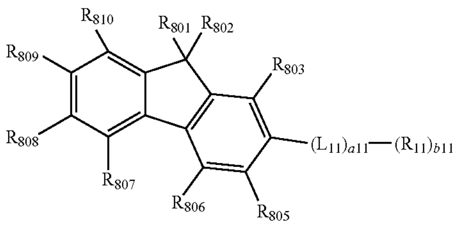
1-13
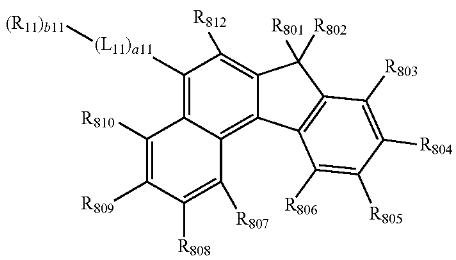
1-14
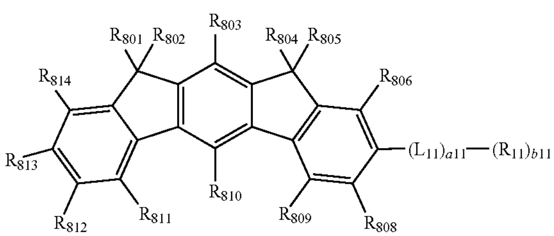
2-1
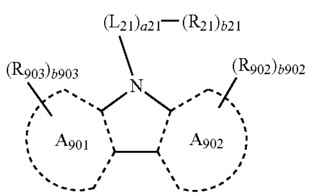
2-2
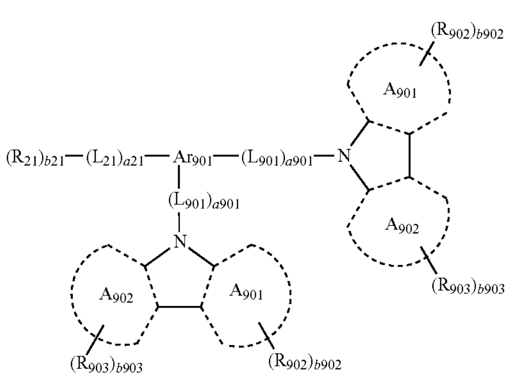
-continued
2-3
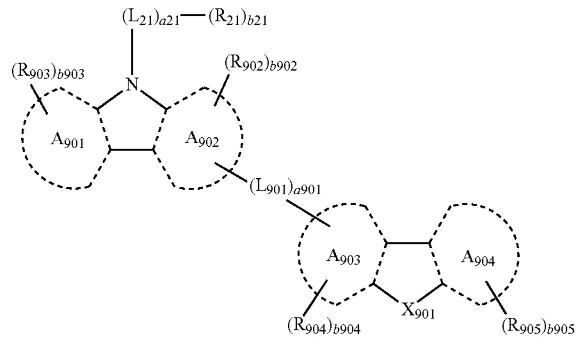
2-4
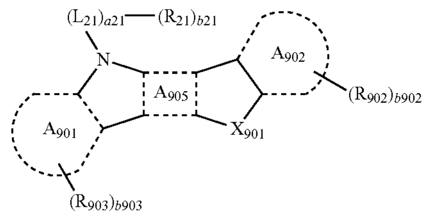
2-5
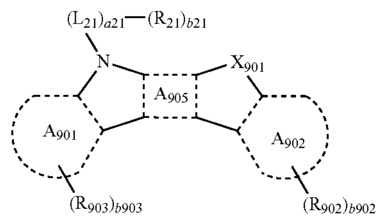
2-6
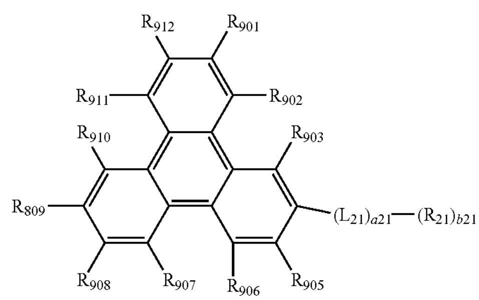
2-7
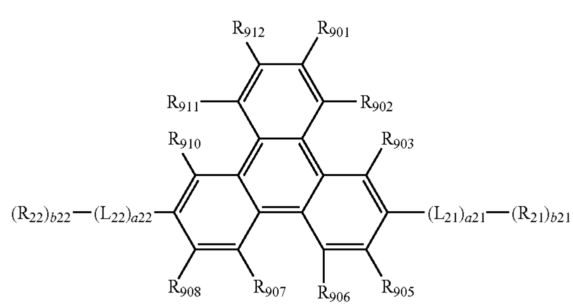

-continued 2-8

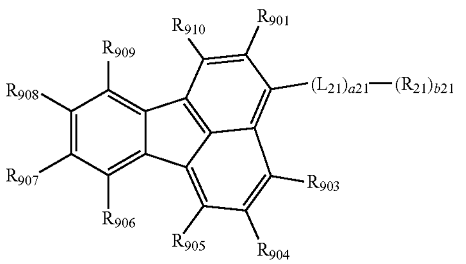

2-9

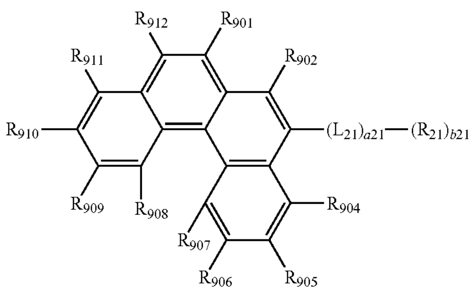

2-10

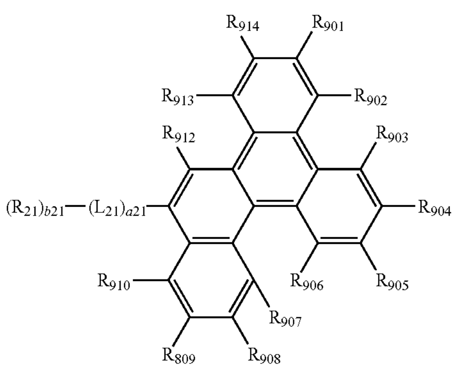

2-11

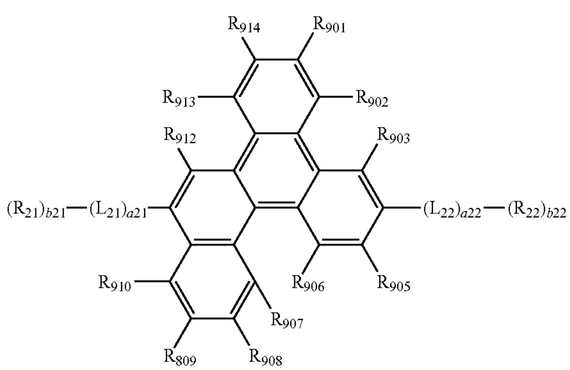

-continued 2-12

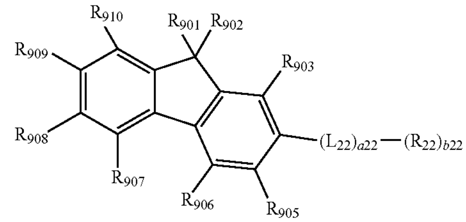

2-13

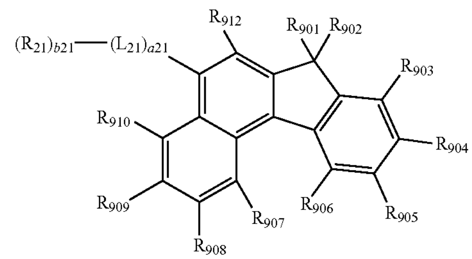

2-14

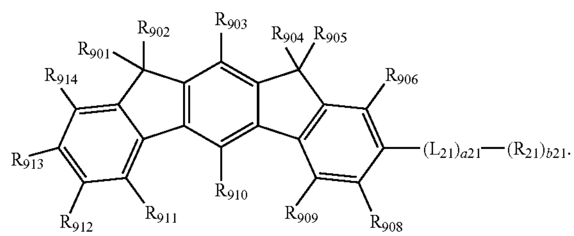

In Formulae 1-1 to 1-14 and 2-1 to 2-14, descriptions of $L_{11}$, a11, $R_{11}$, b11, $L_{801}$, a801, $A_{801}$ to $A_{805}$, $X_{801}$, $R_{801}$ to $R_{814}$, and b801 to b805 may each be independently as referred to in the descriptions provided above, a description of $L_{12}$ may be as referred to in the description provided in connection with $L_{11}$ in Formula 1, a description of a12 may be as referred to in the description provided in connection with a11 in Formula 1, a description of $R_{12}$ may be as referred to in the description provided in connection with $R_{11}$ in Formula 1, and a description of b12 may be as referred to in the description provided in connection with b11 in Formula 1, and descriptions of $L_{21}$, a21, $R_{21}$, b21, $L_{901}$, a901, $A_{901}$ to $A_{905}$, $X_{901}$, $R_{901}$ to $R_{912}$, and b901 to b905 may each be independently as referred to in the description provided in connection with those in Formula 2, a description of $L_{22}$ may be as referred to in the description provided in connection with $L_{21}$ in Formula 2, a description of a22 may be as referred to in the description provided in connection with a21 in Formula 2, a description of $R_{22}$ may be as referred to in the description provided in connection with $R_{21}$ in Formula 2, and a description of b22 may be as referred to in the description provided in connection with b21 in Formula 2.

In another example embodiment, the first host may be selected from compounds below, but the first host is not limited thereto:

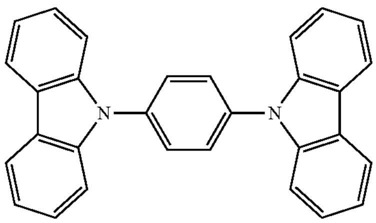
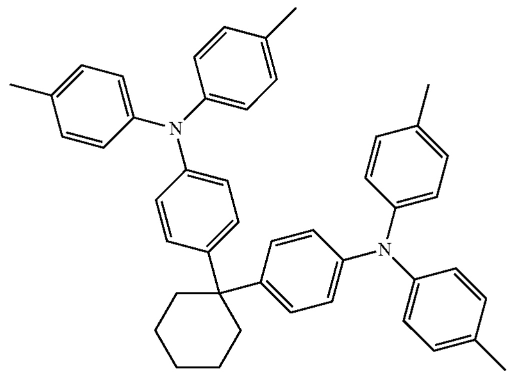
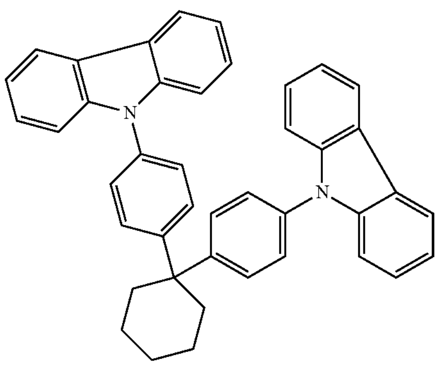
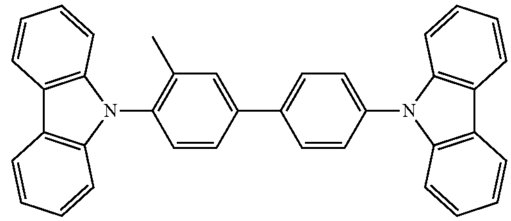
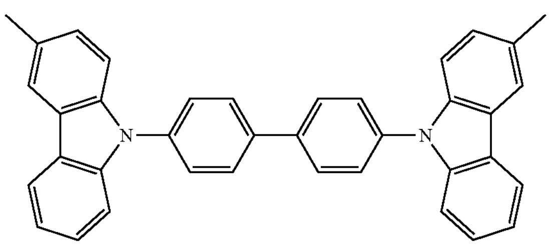
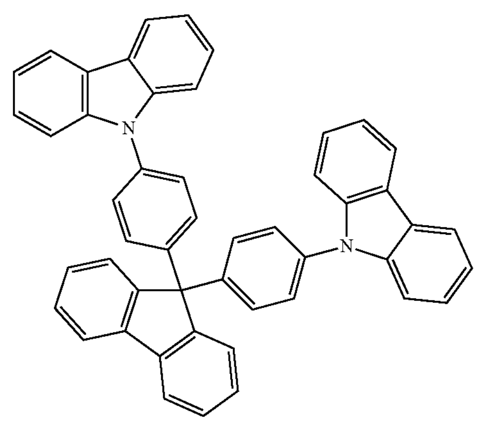
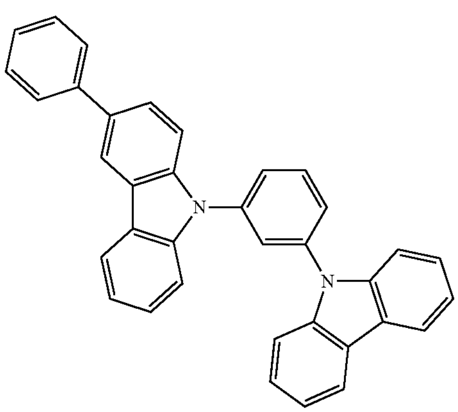
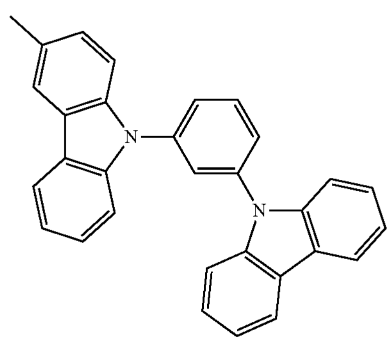

-continued
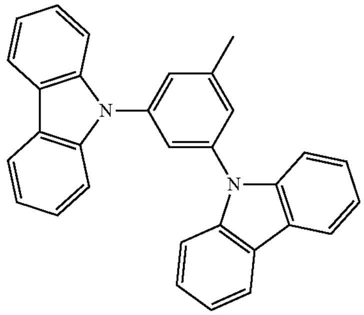
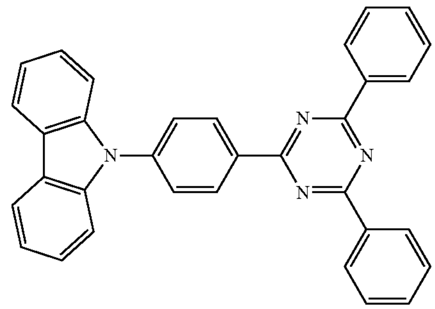
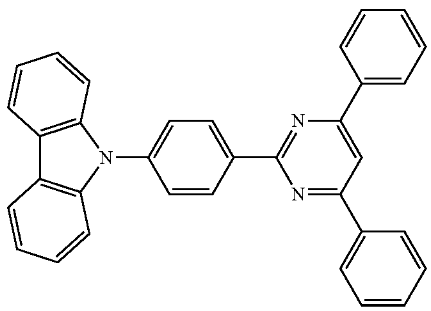
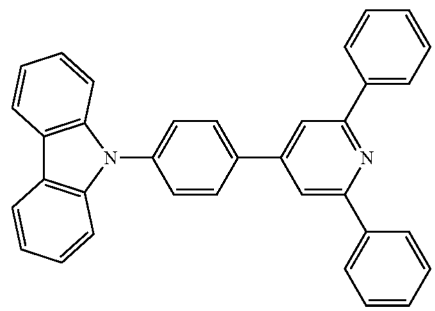
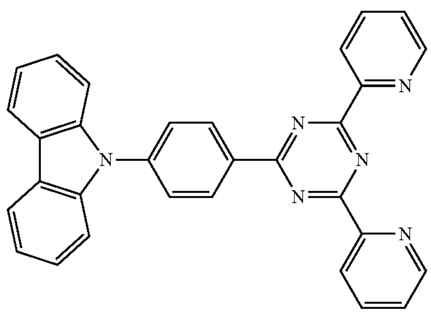
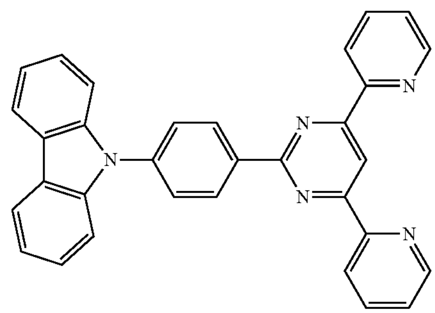
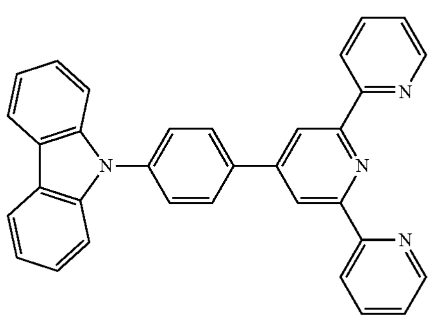
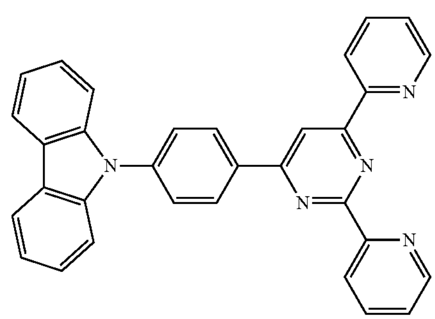
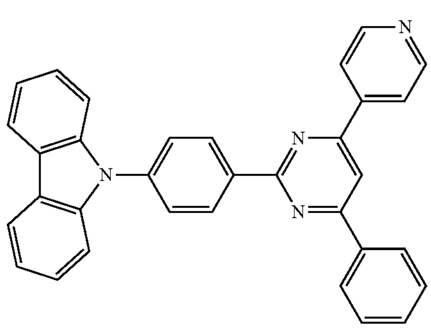
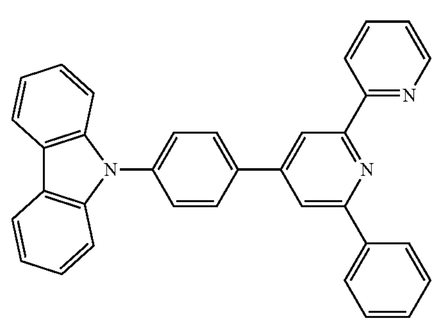

-continued
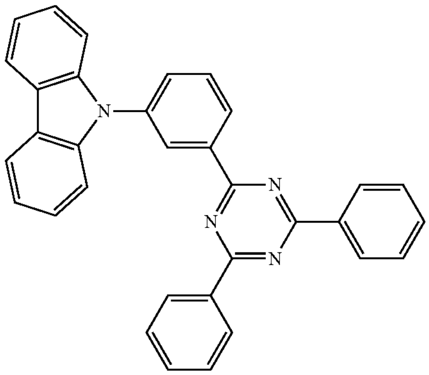
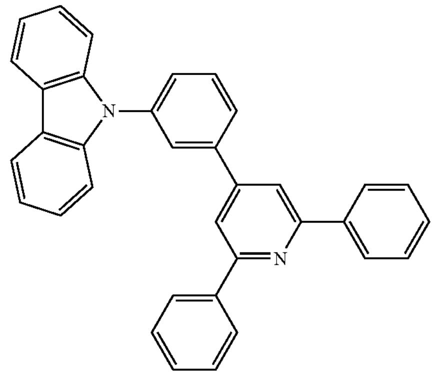
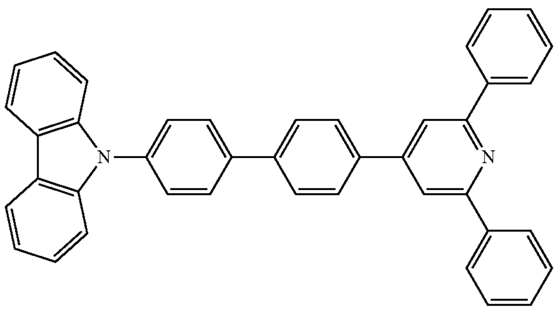
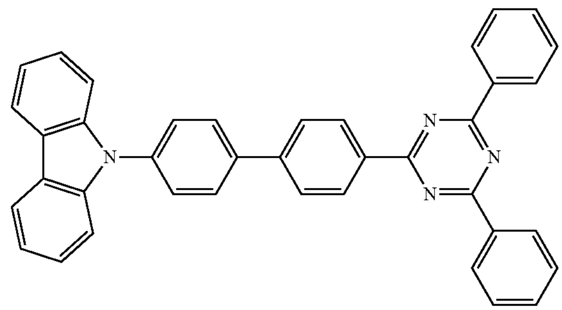
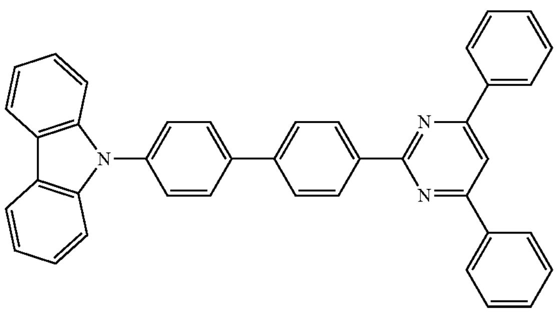
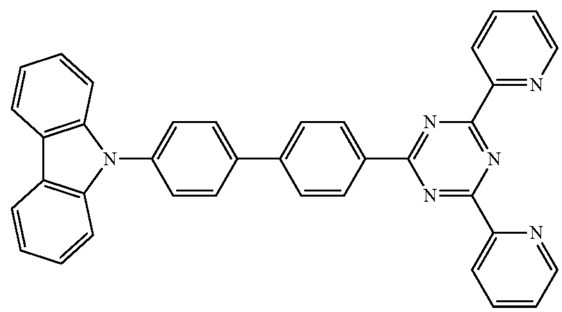
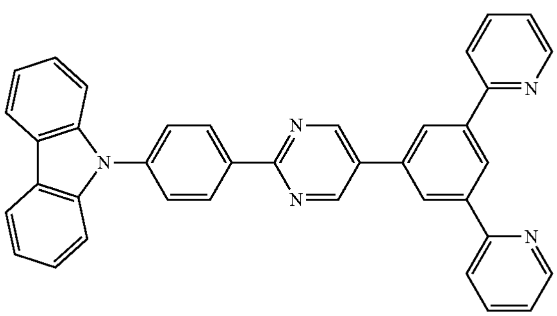
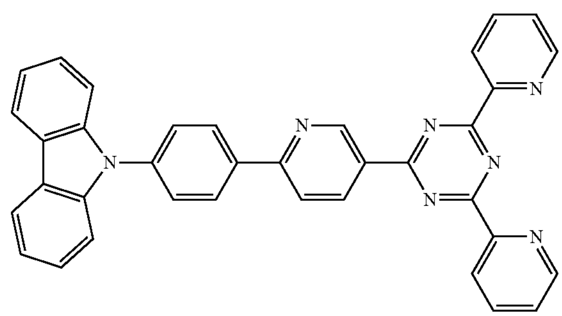
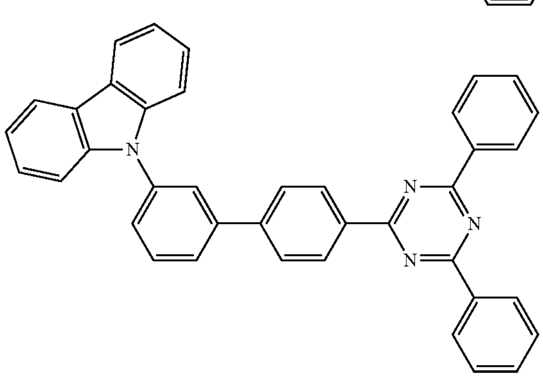
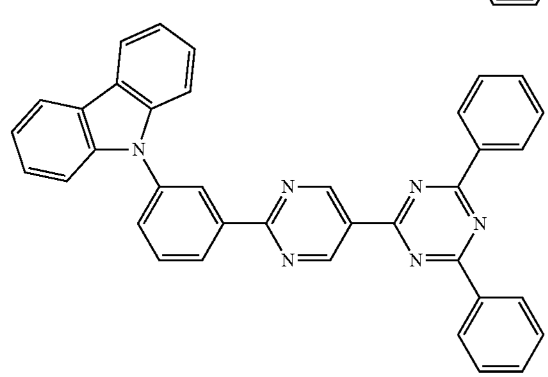

-continued
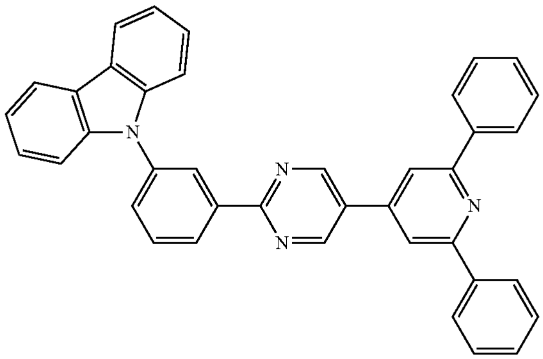
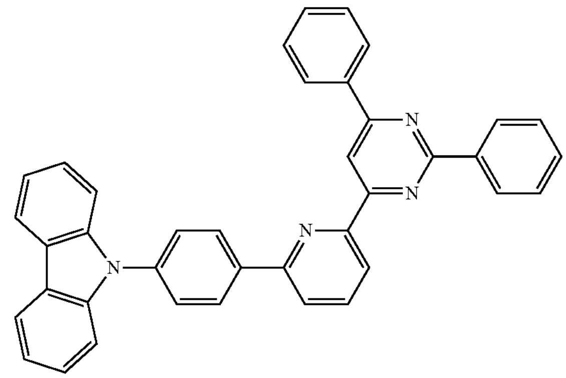
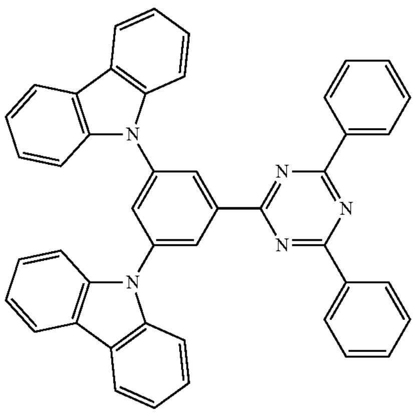
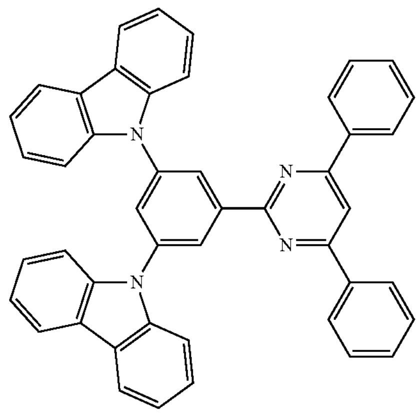
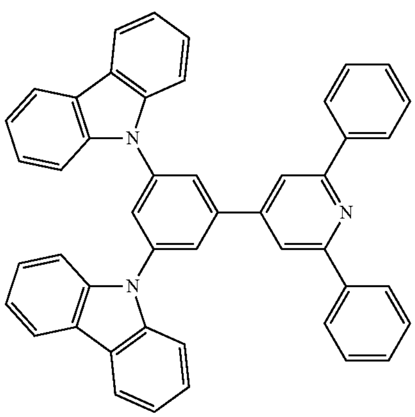
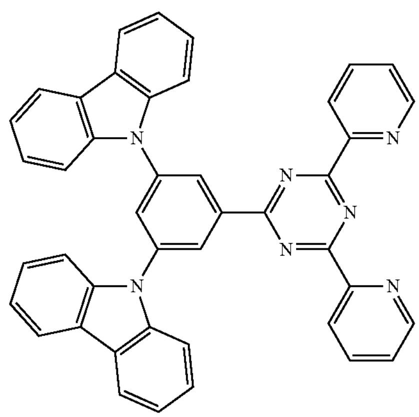
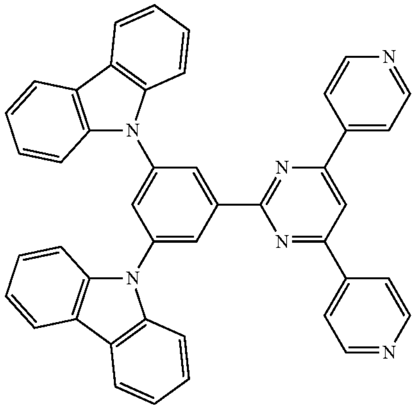
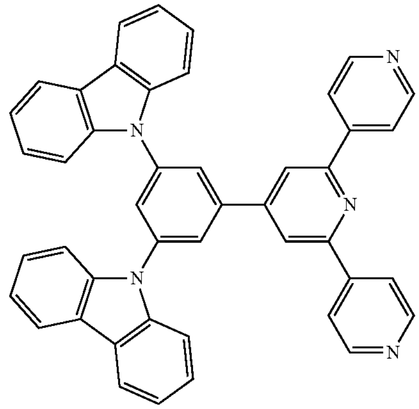

-continued
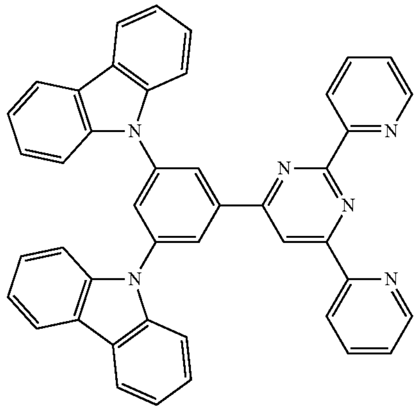
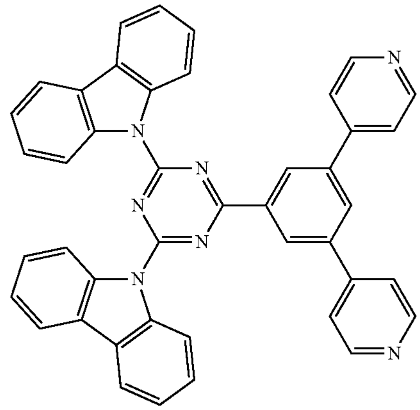
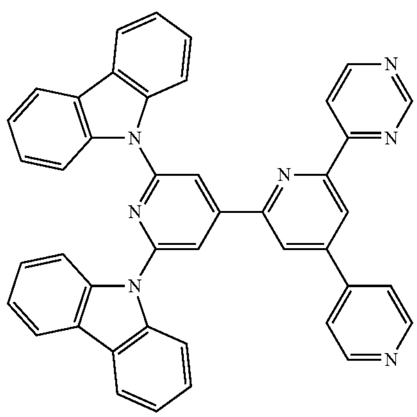
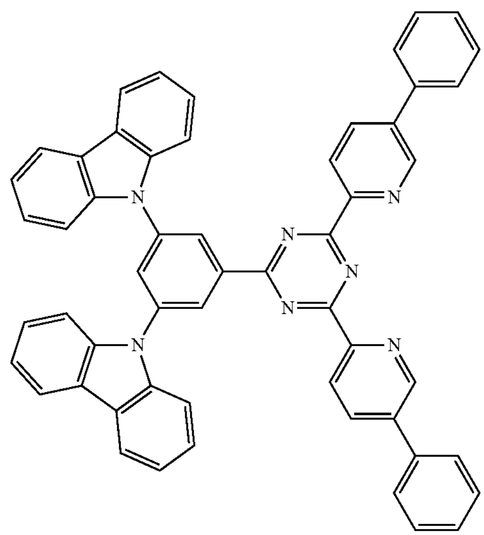
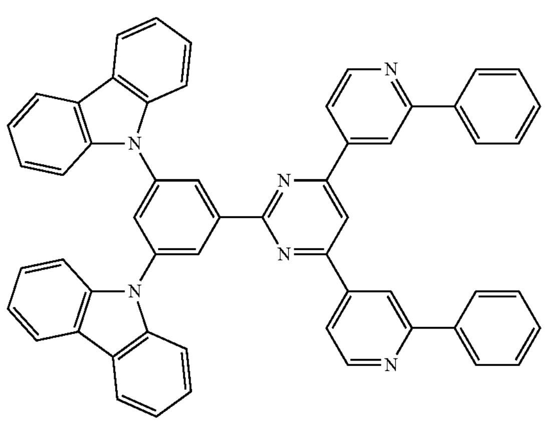
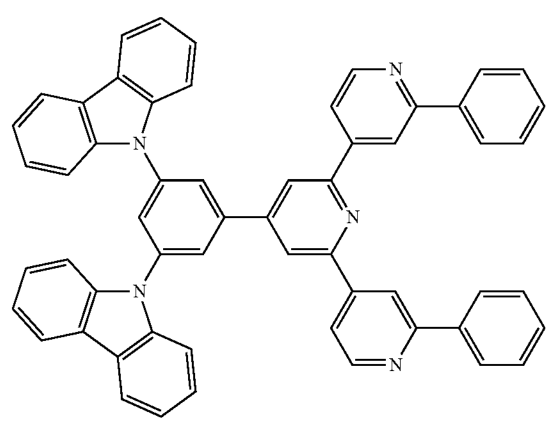

-continued
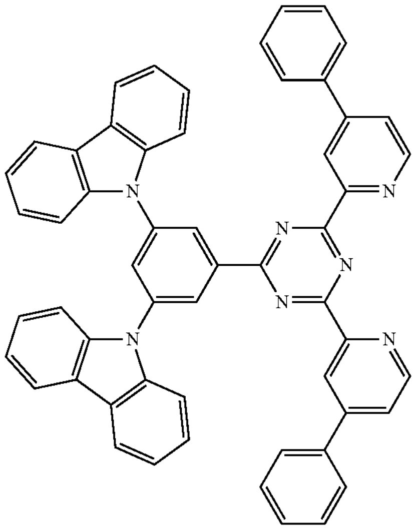
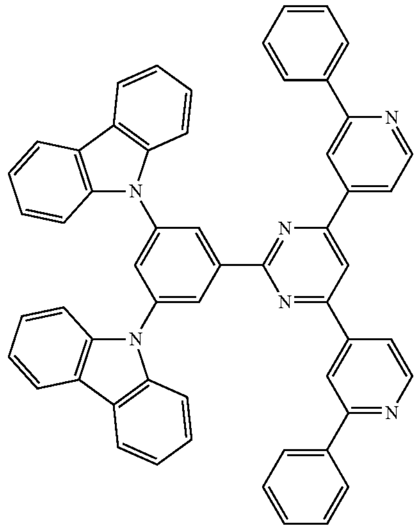
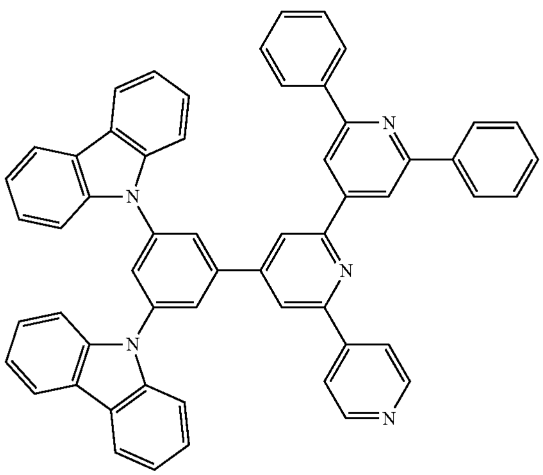
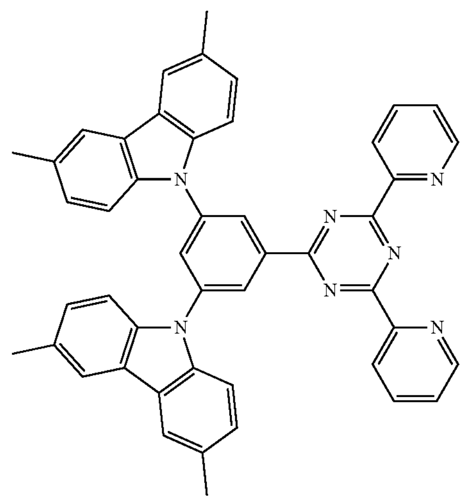
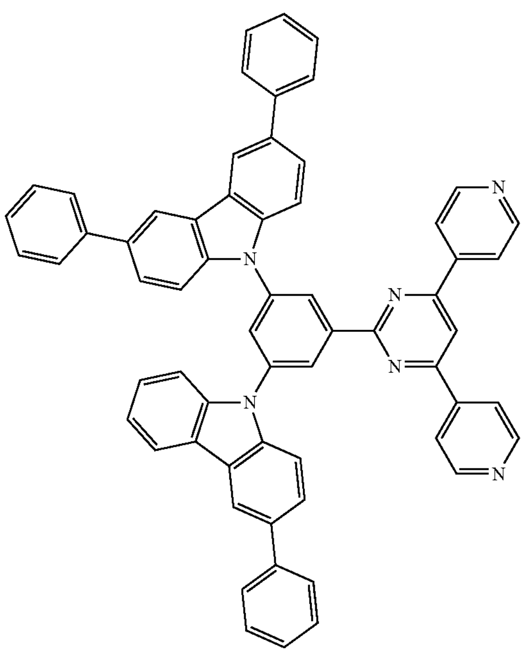
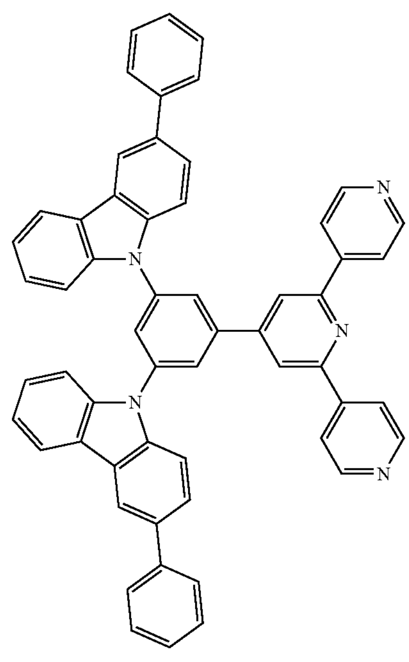

-continued
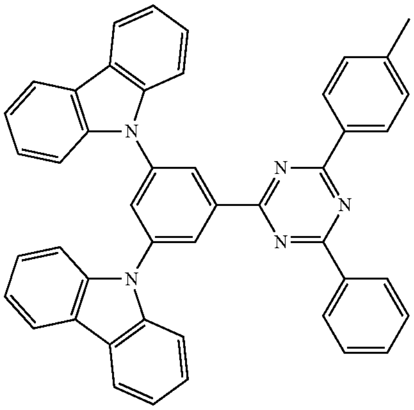
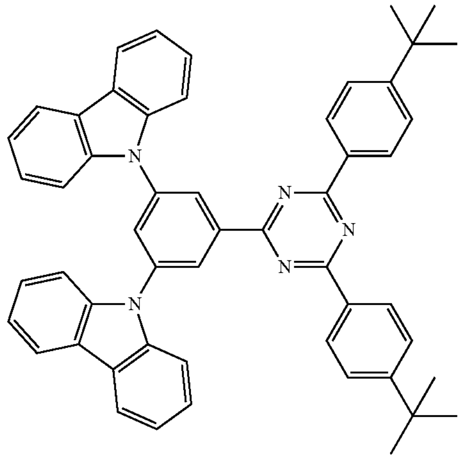
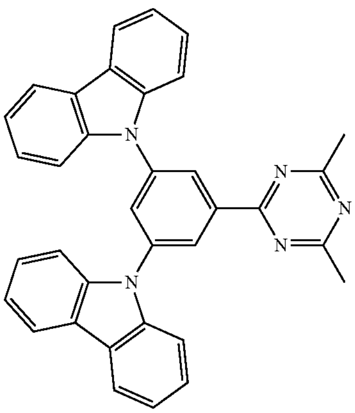
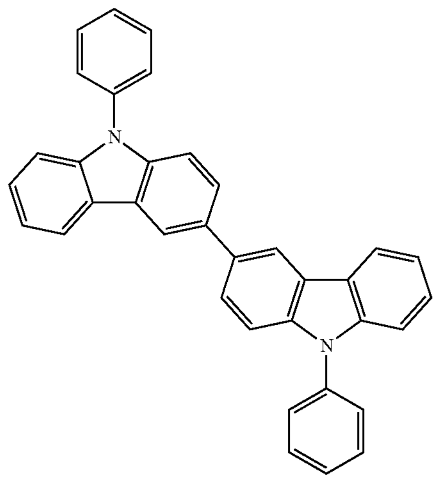
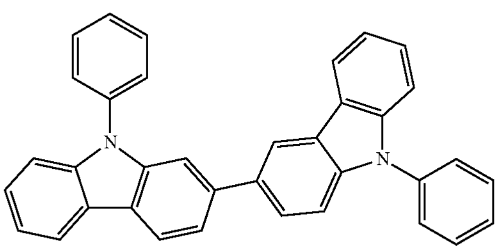
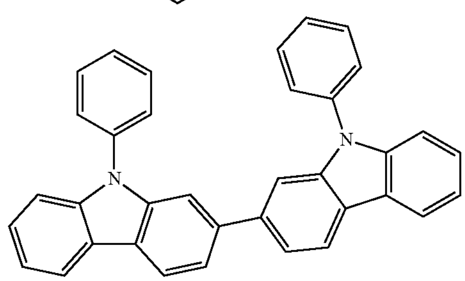
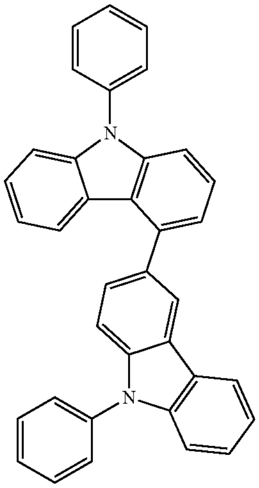
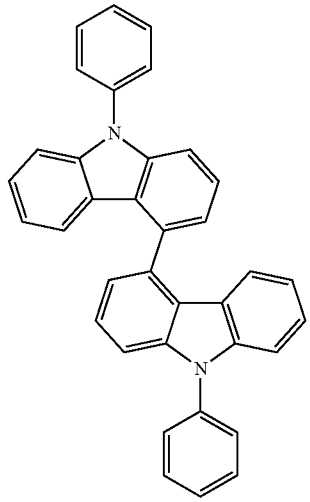
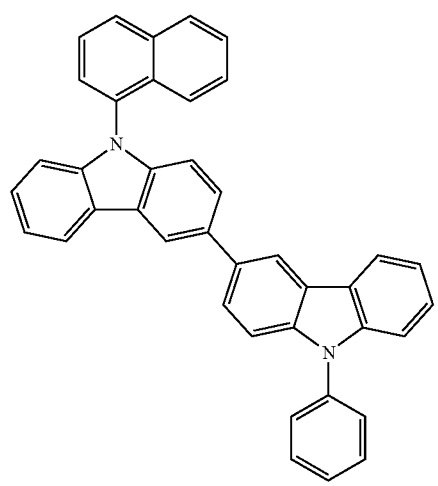

-continued
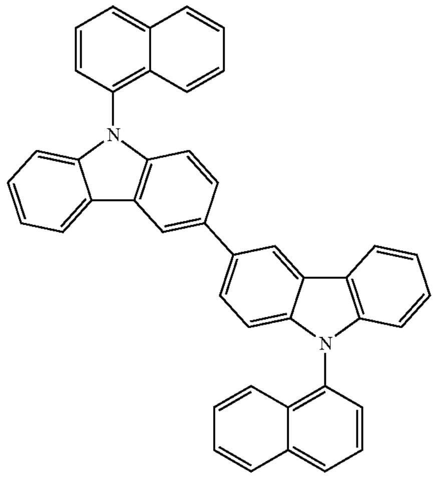
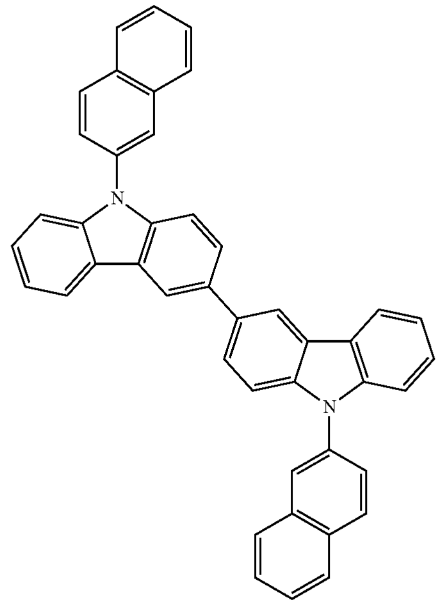
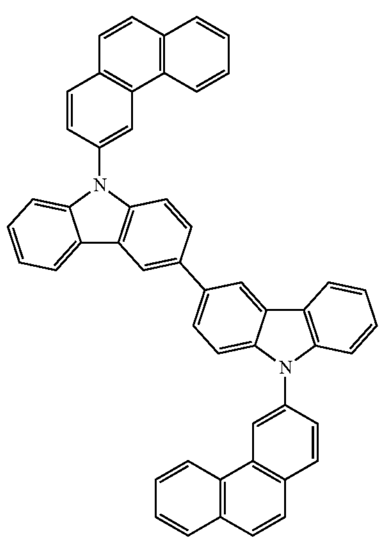
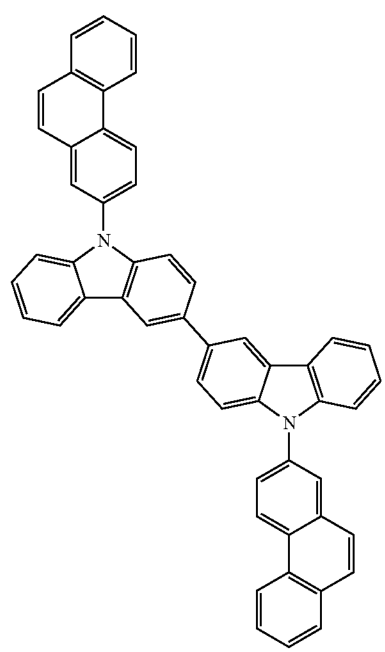

-continued
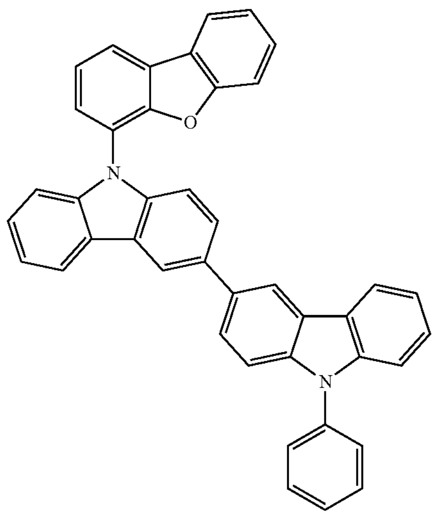
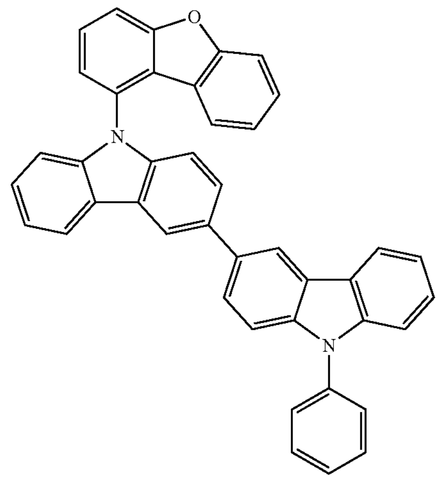
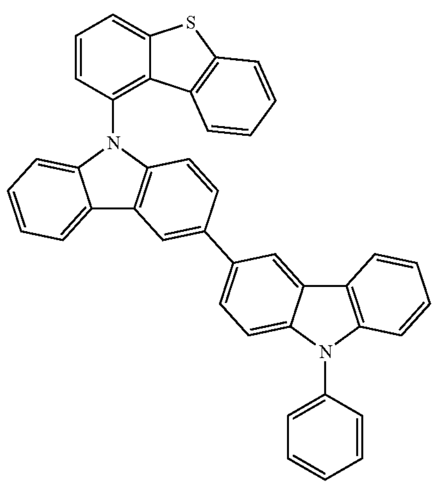
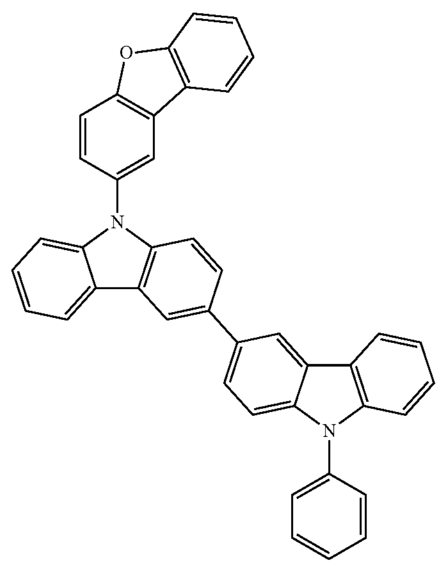
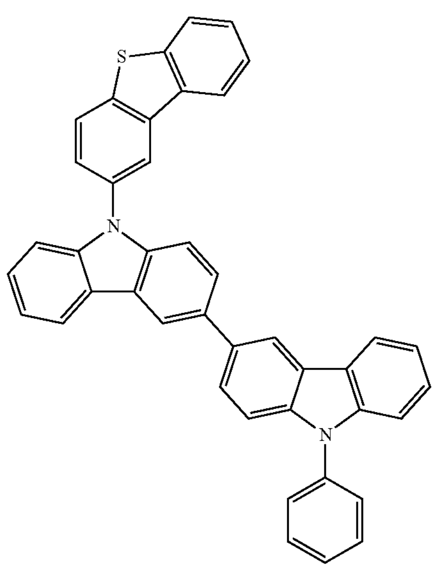
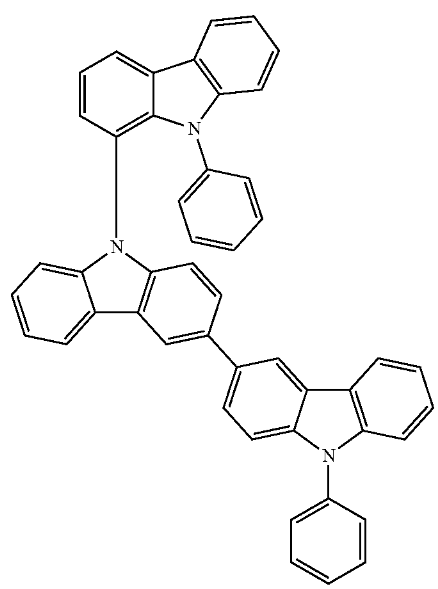

-continued
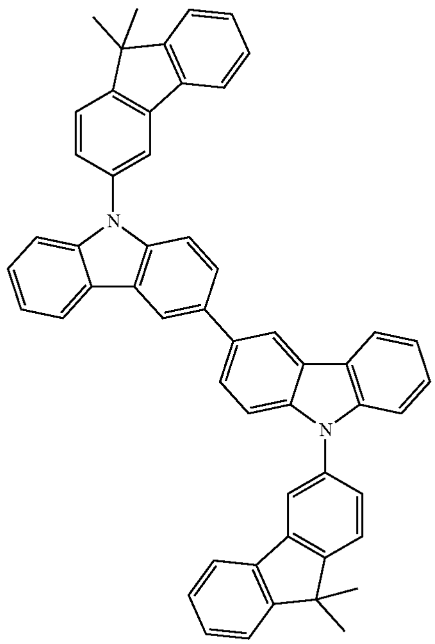
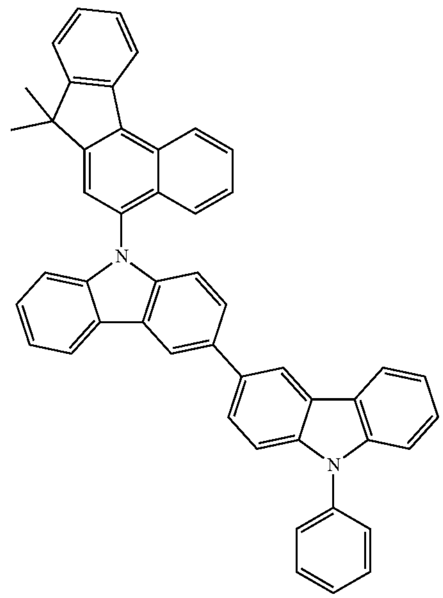
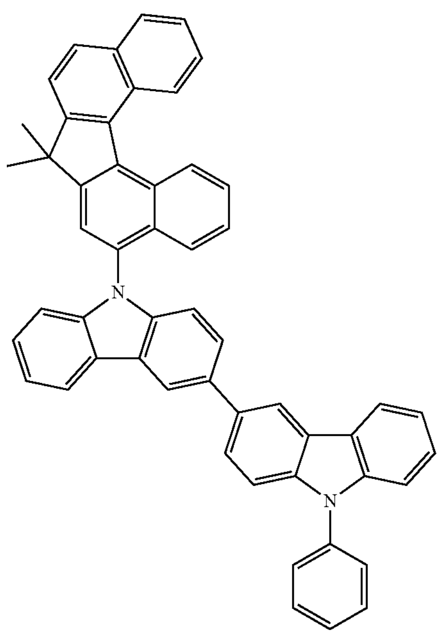
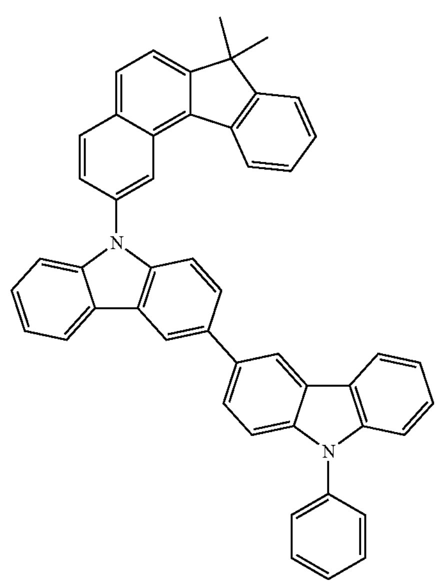

-continued
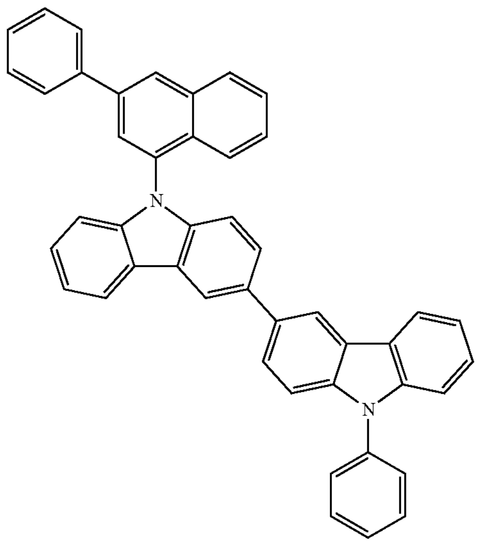
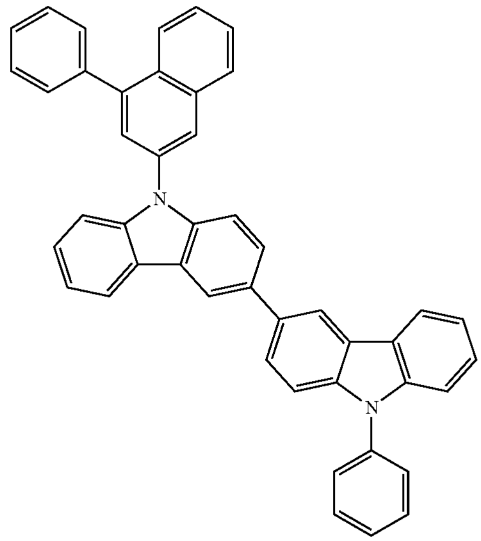
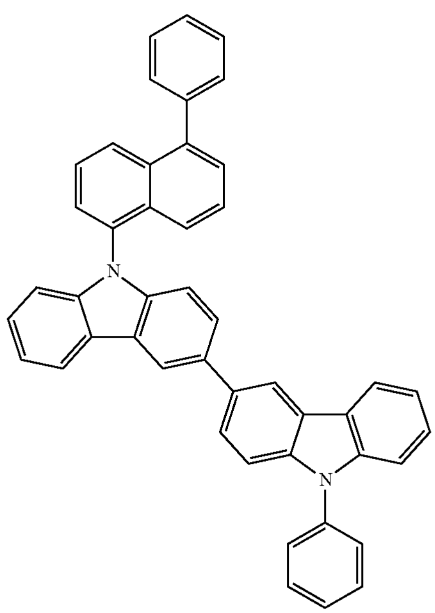
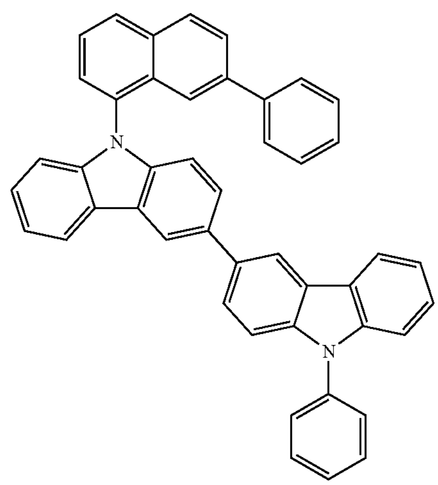

-continued
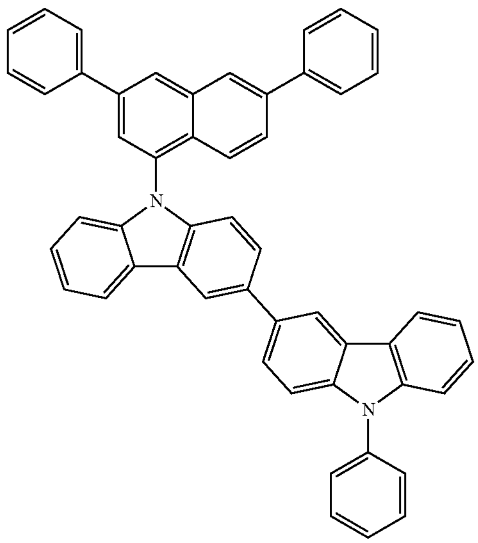
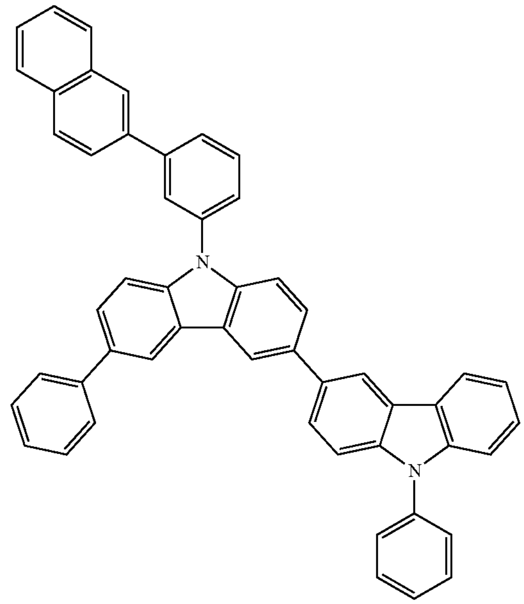
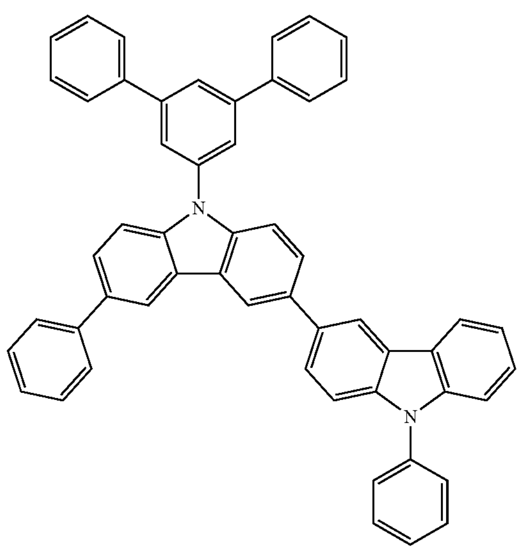
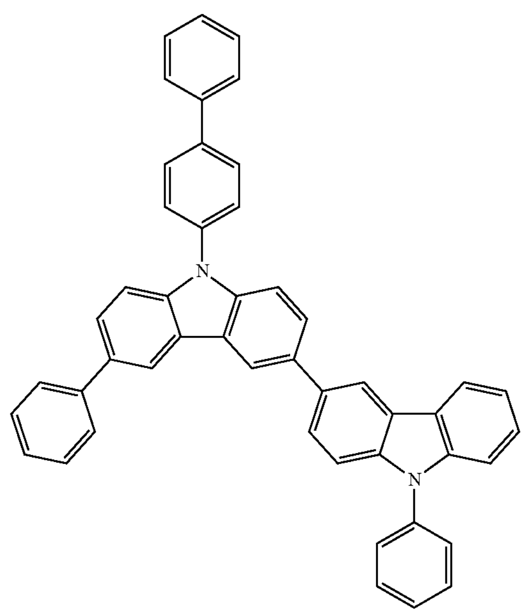

-continued
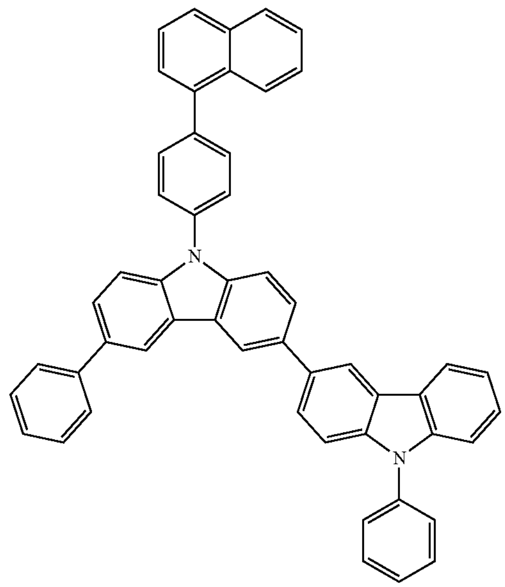
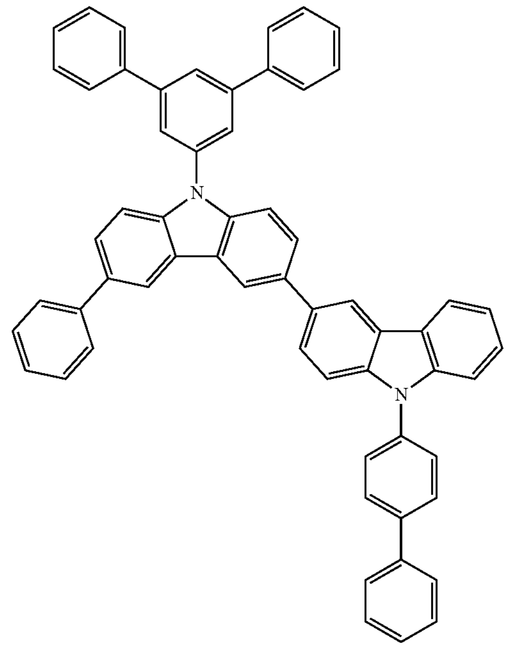
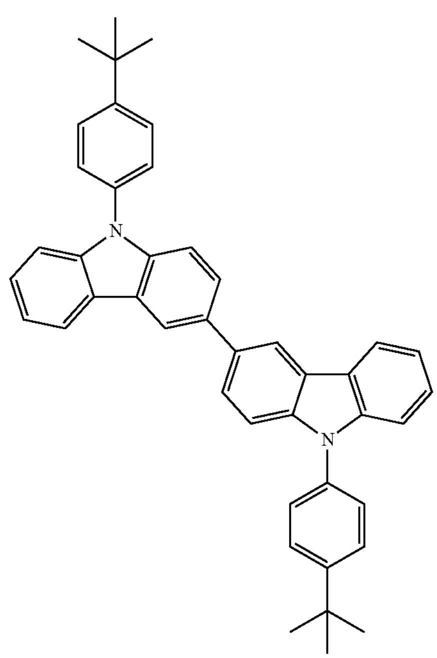
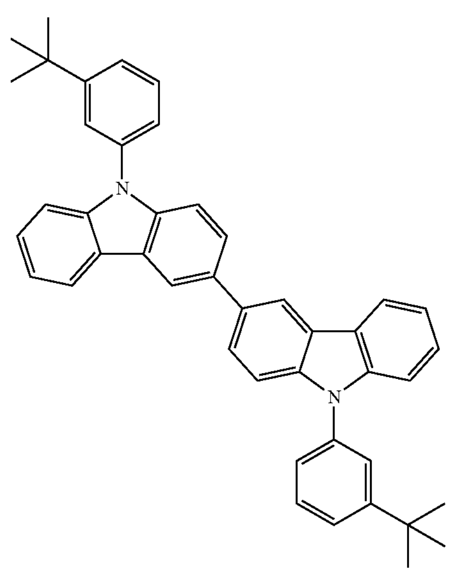

-continued
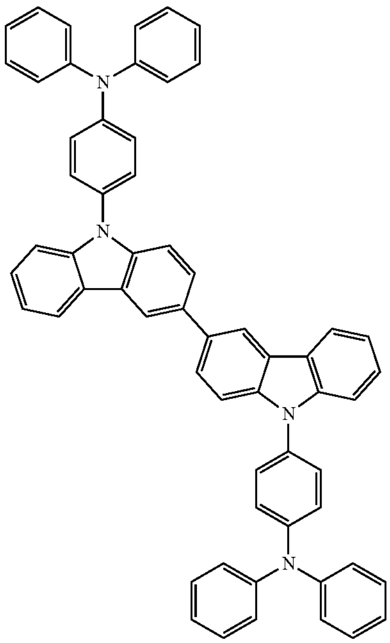
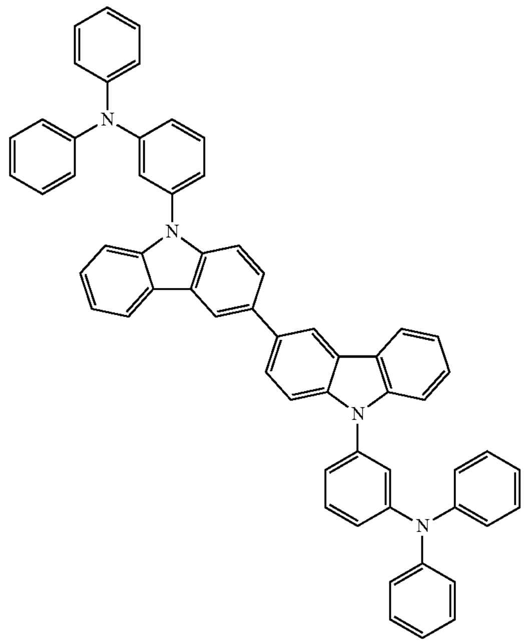
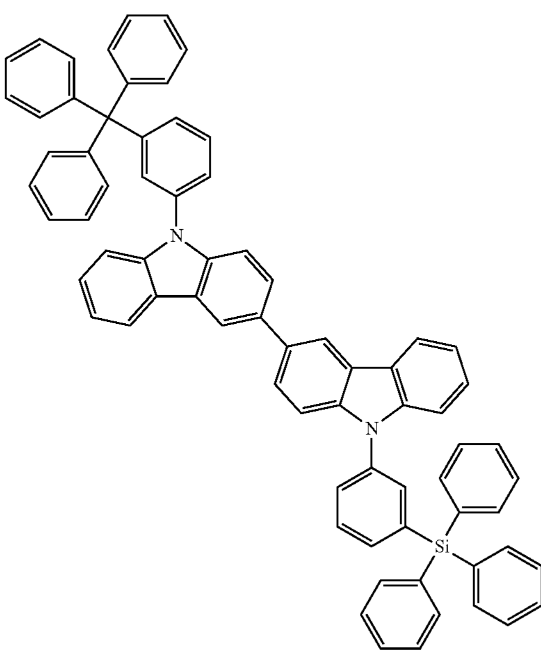
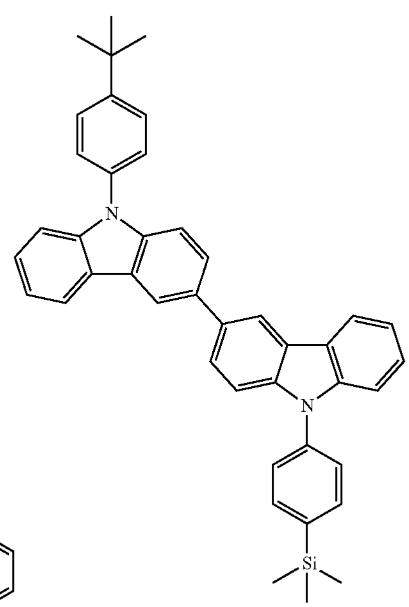

-continued
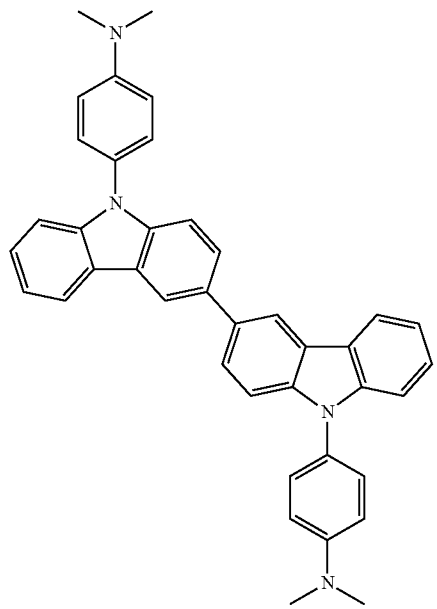
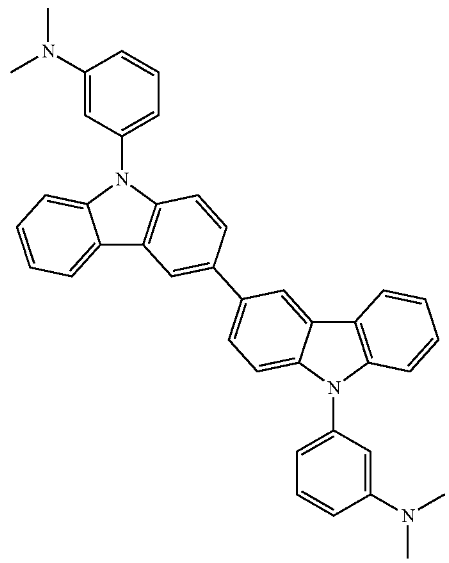
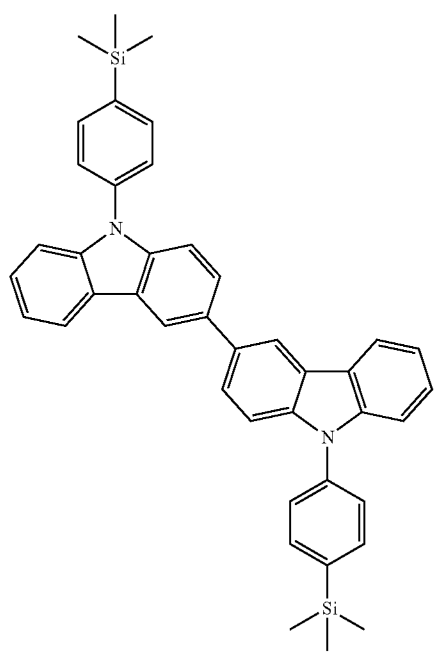
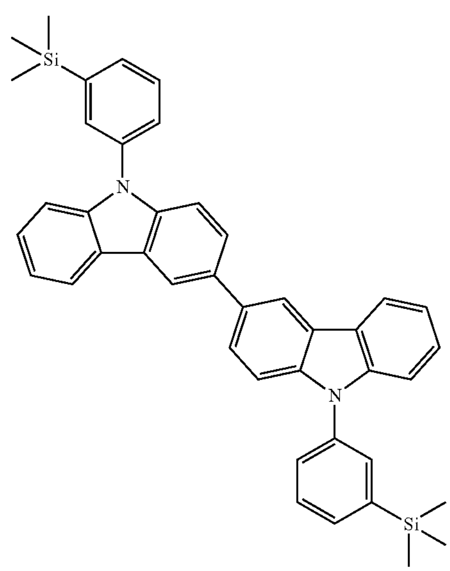

-continued
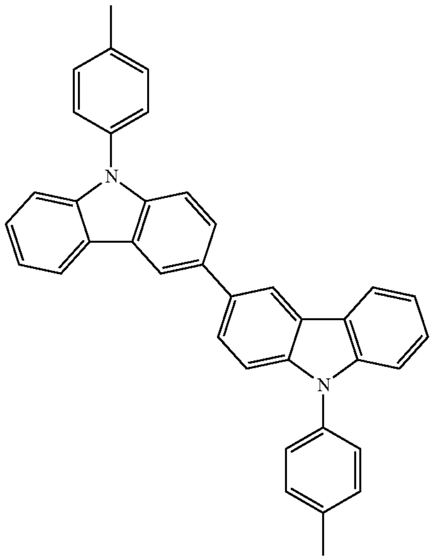
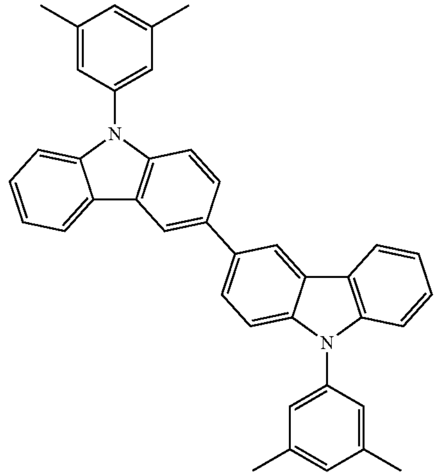
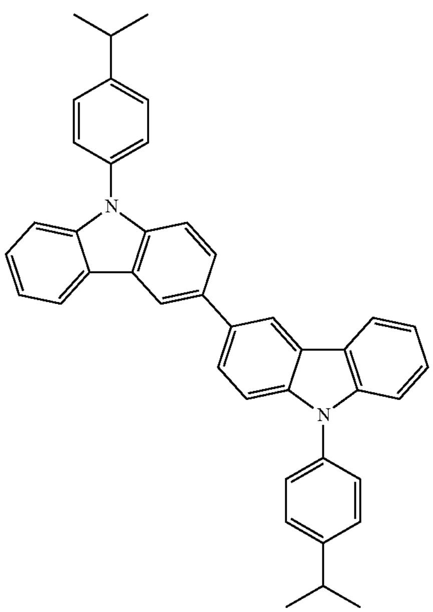
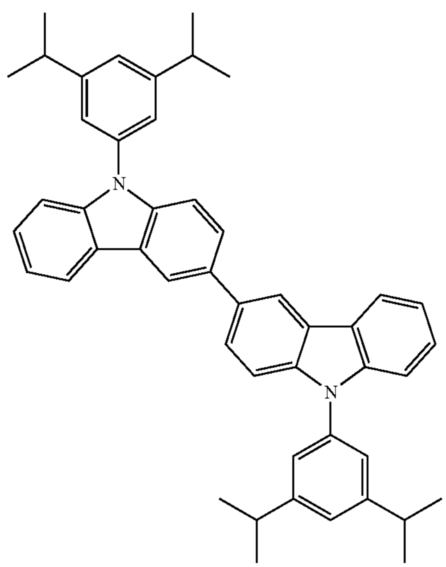

-continued
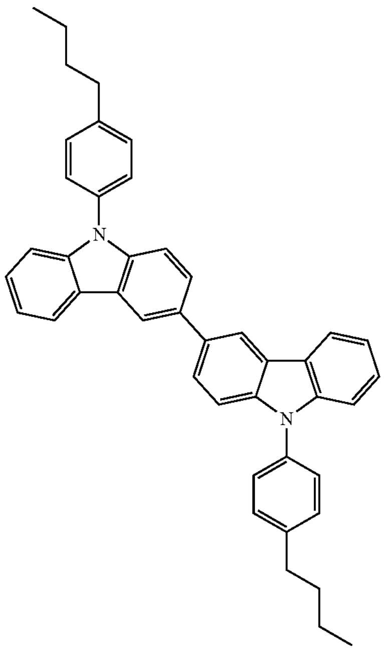
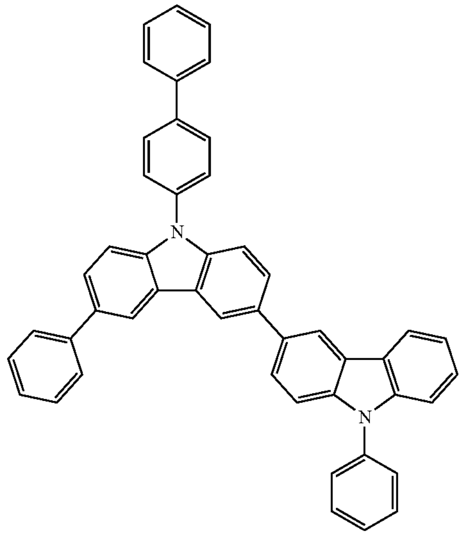
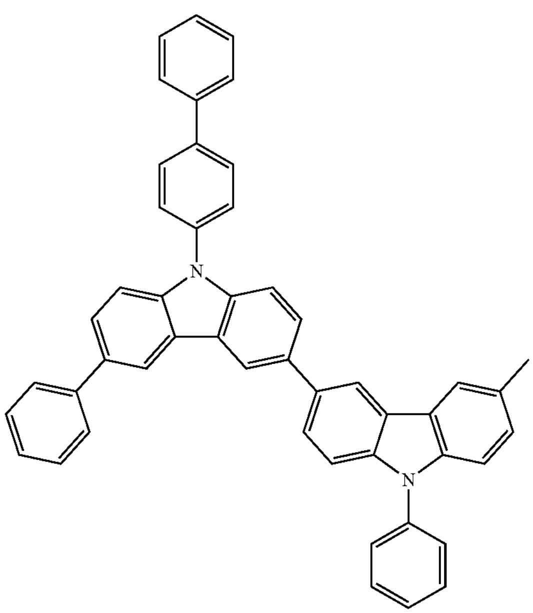
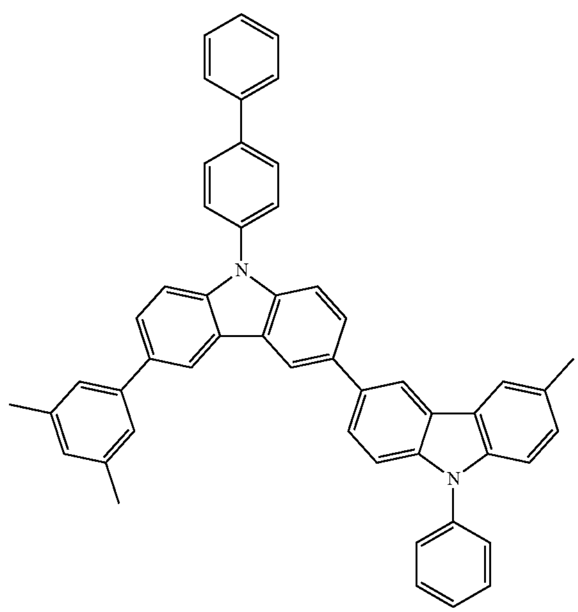

-continued
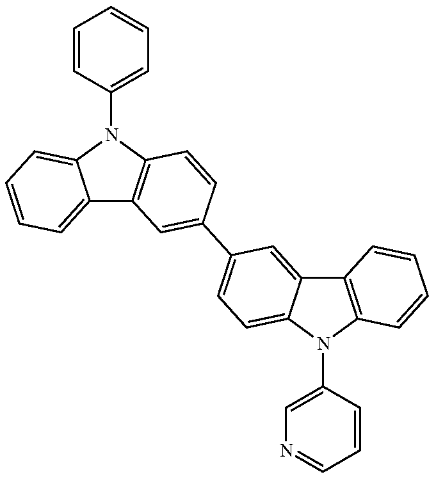
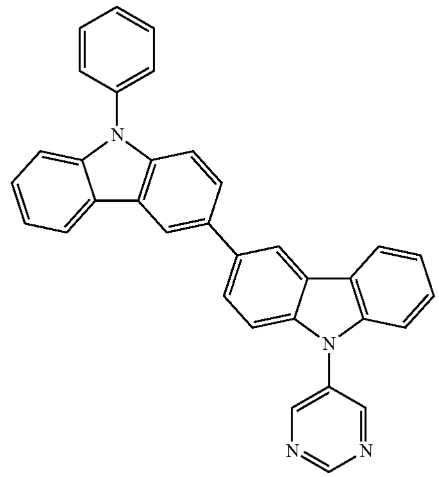
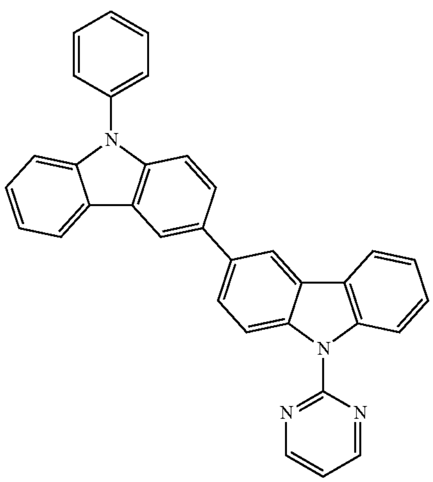
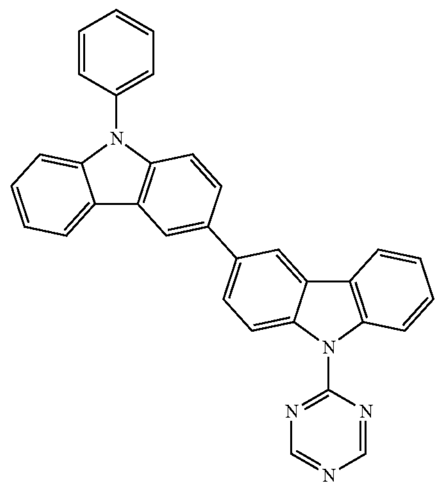
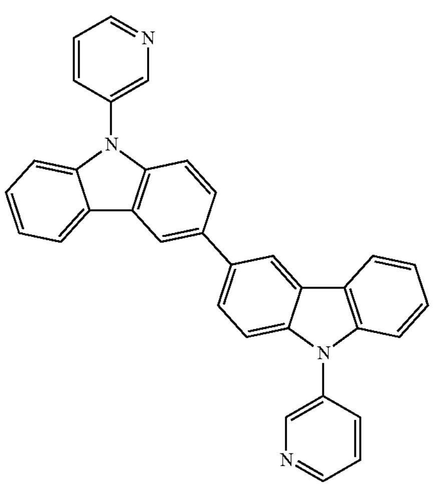
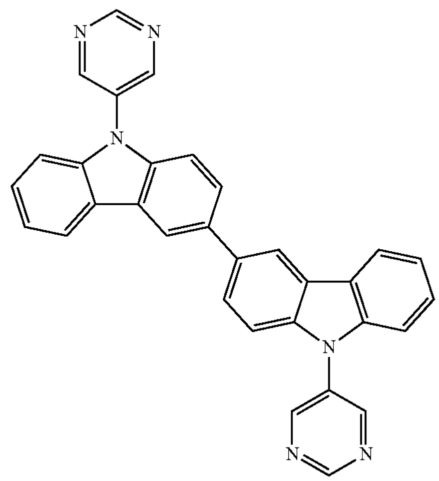

-continued
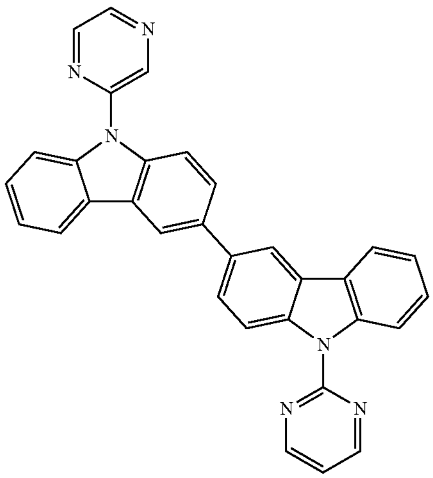
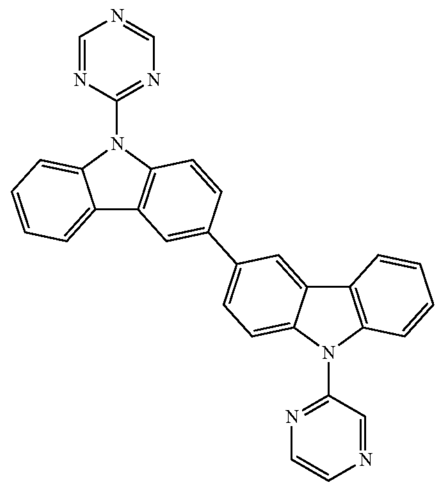
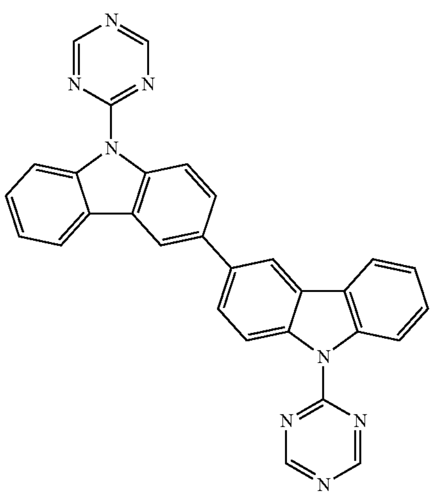
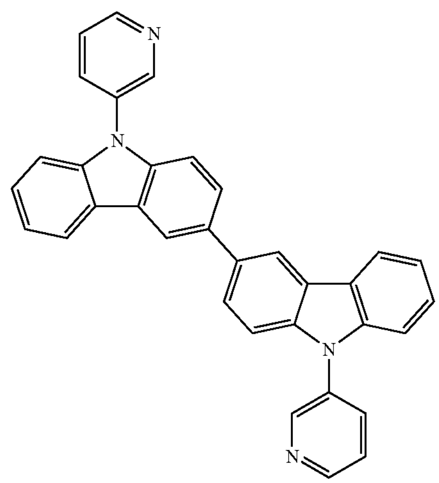
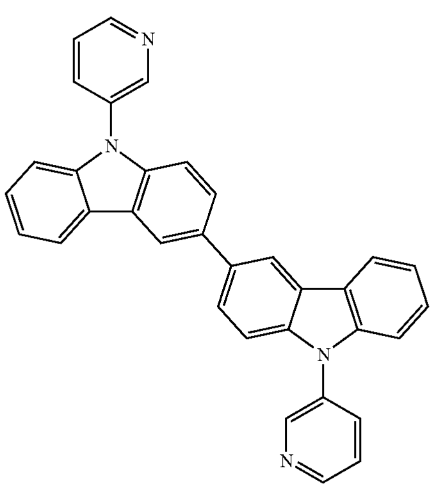
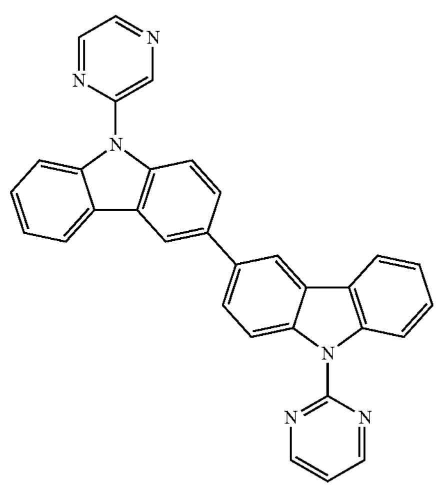

-continued
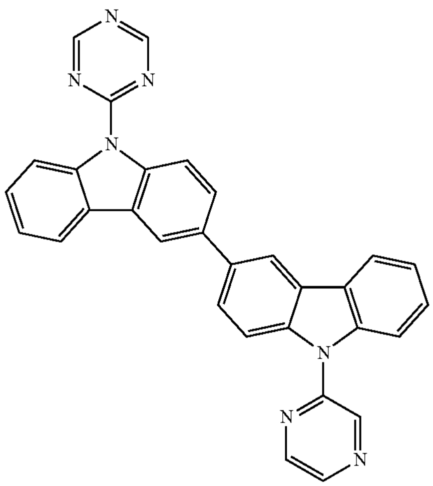
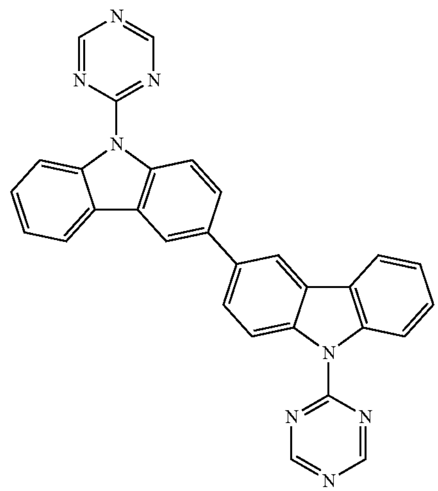
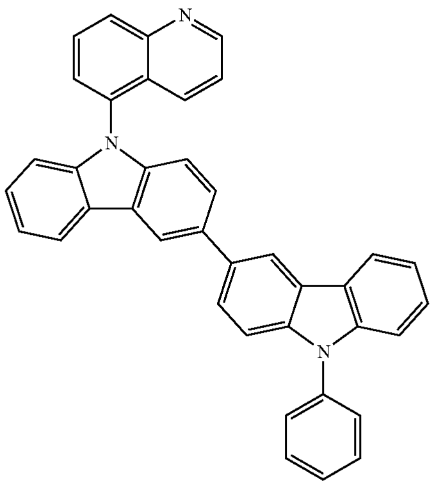
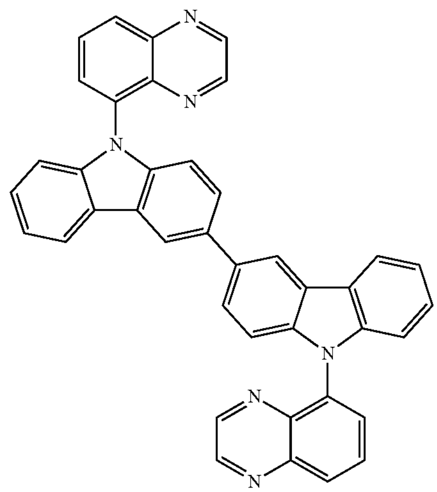
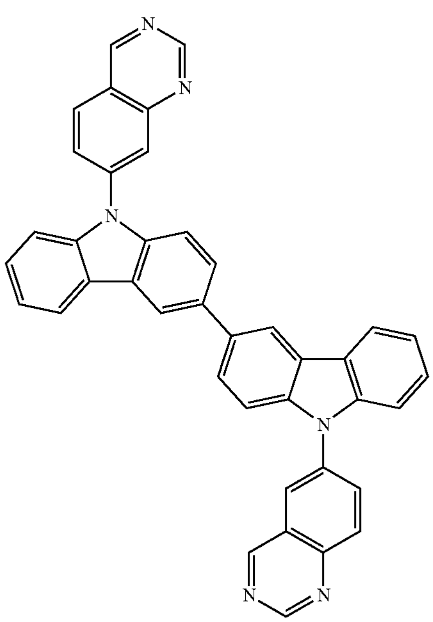
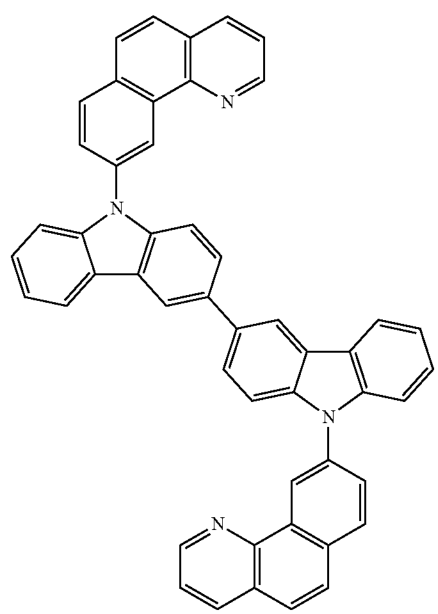

-continued
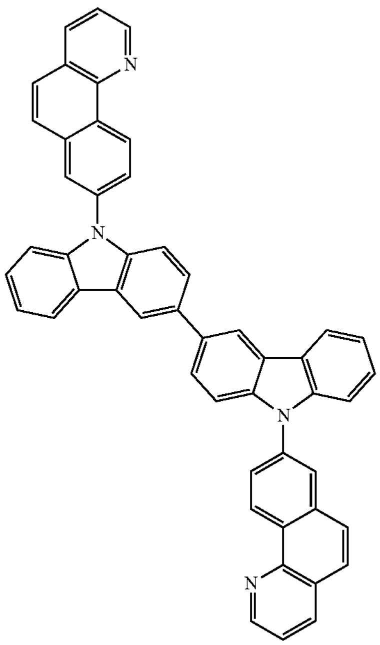
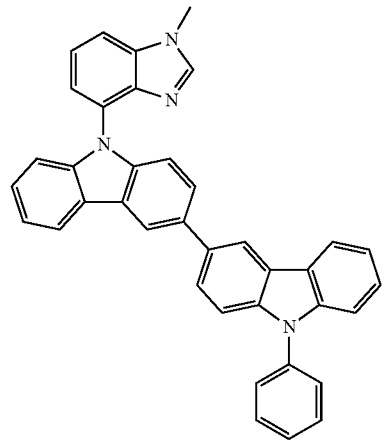
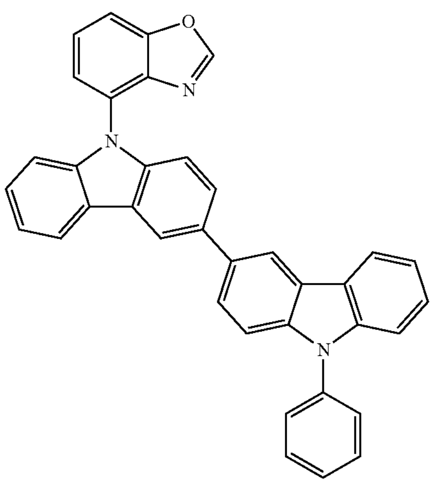
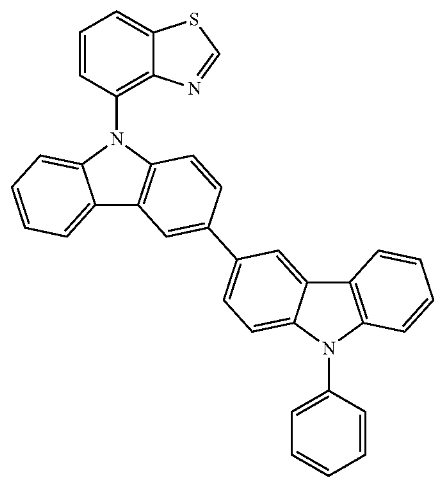
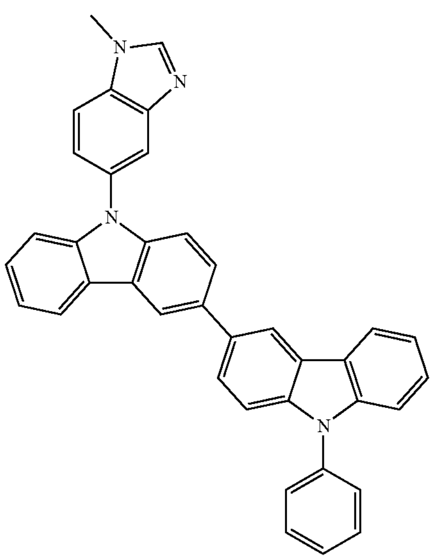
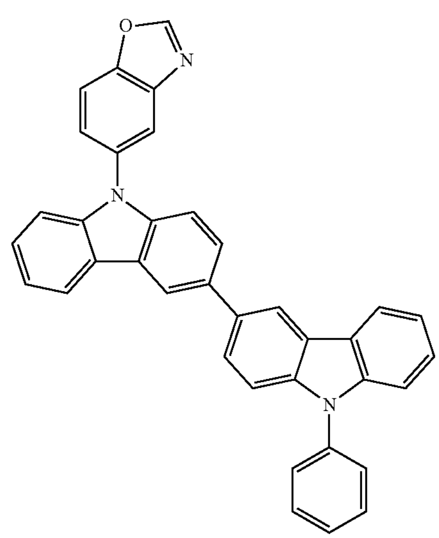

-continued
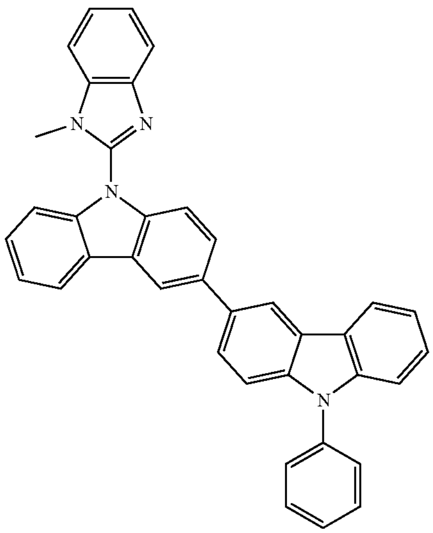
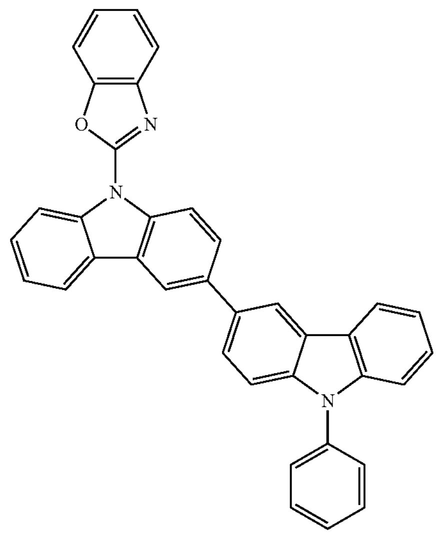
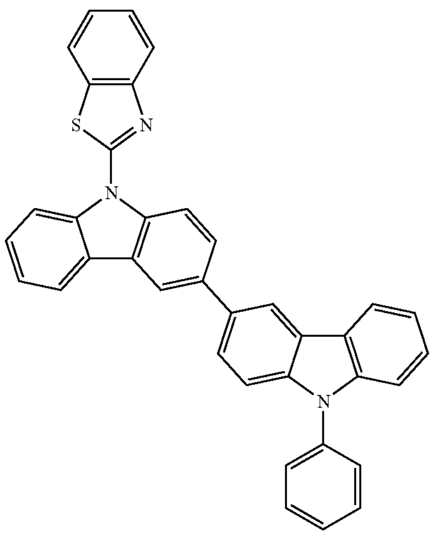
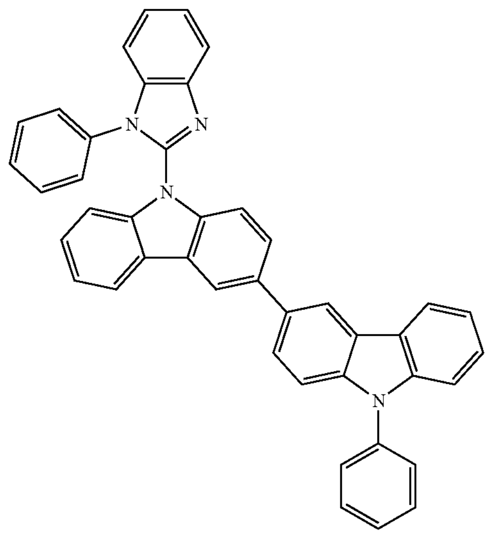
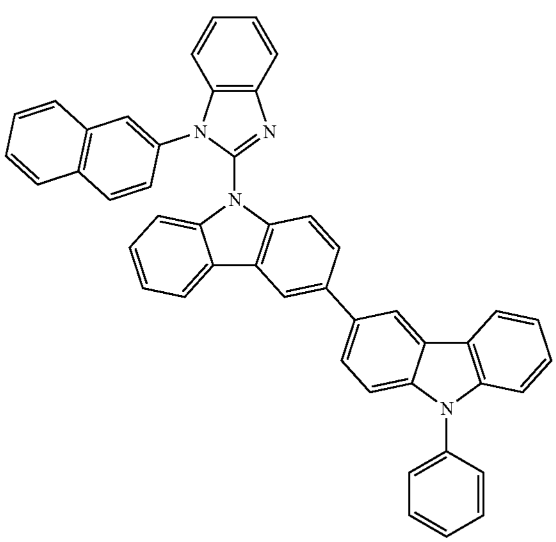
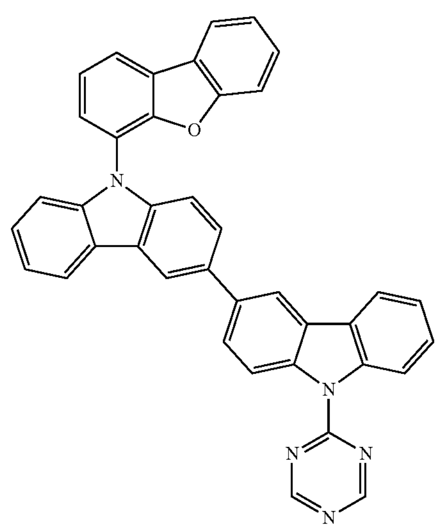

-continued
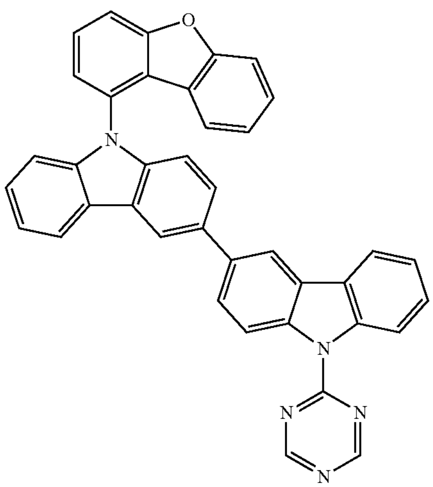
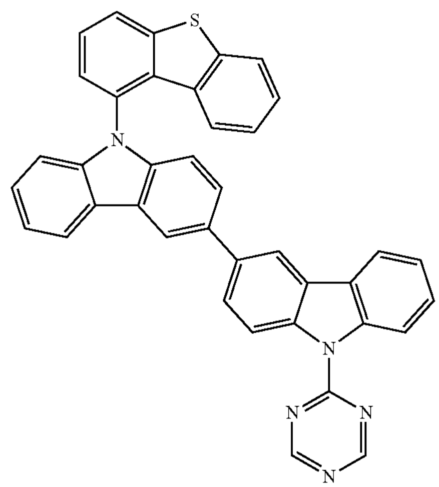
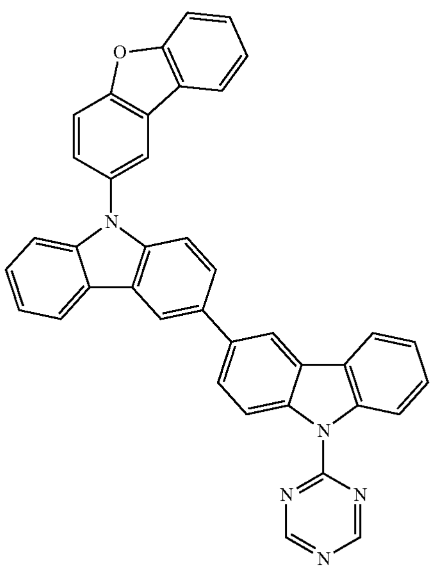
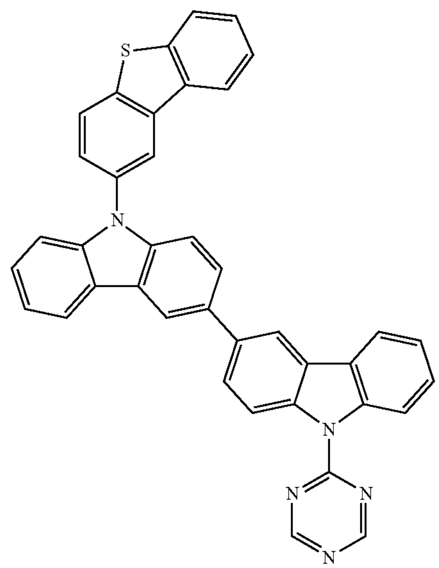
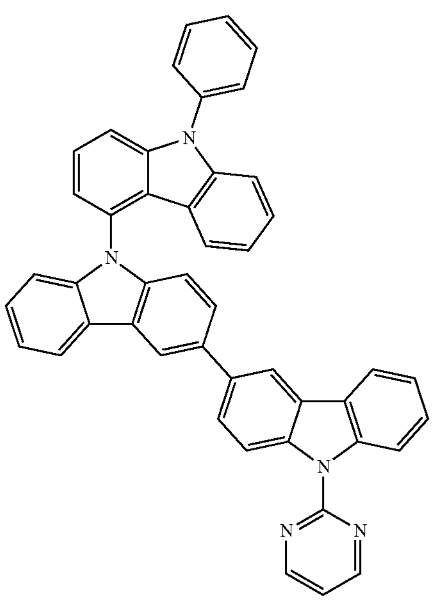
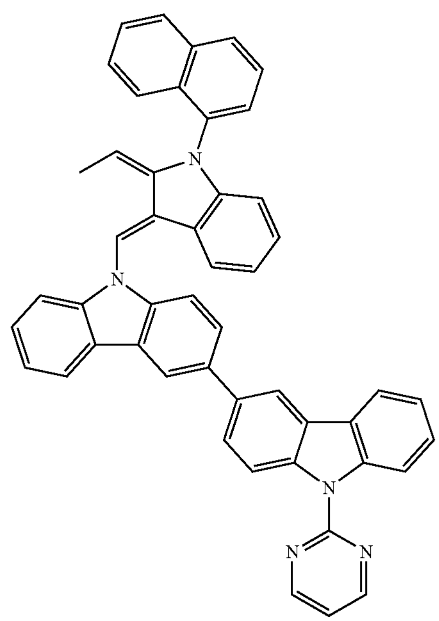

-continued
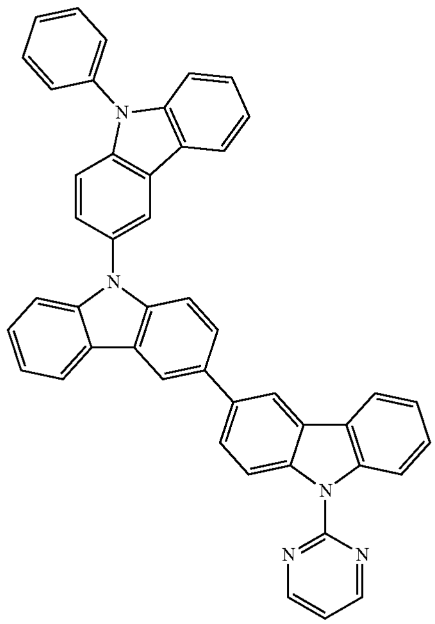
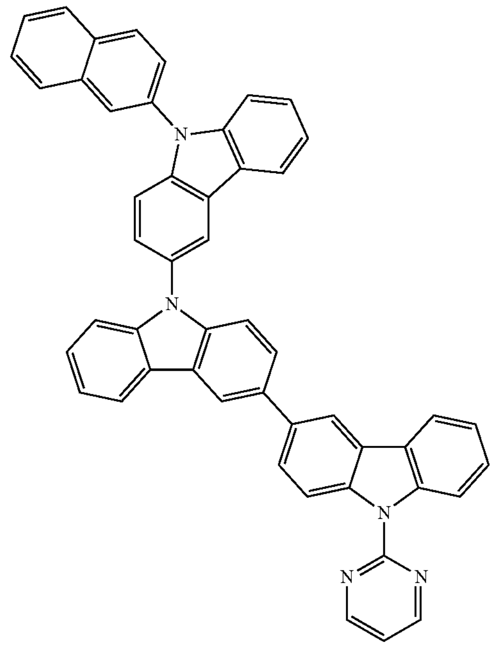
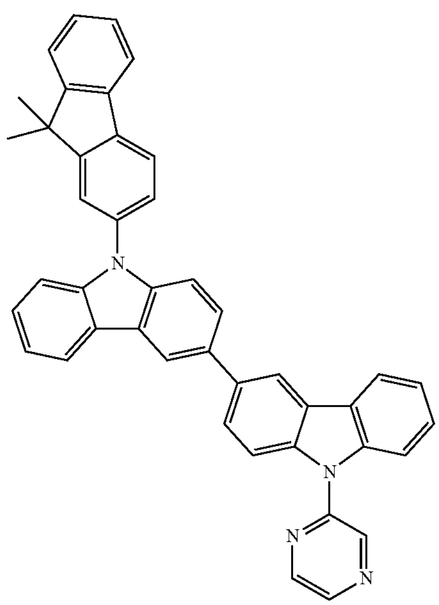
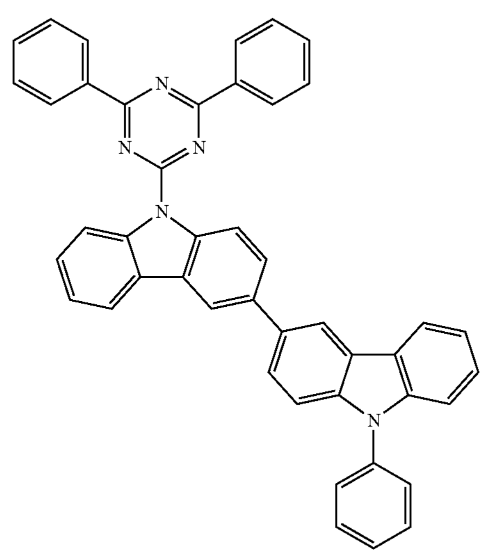

-continued
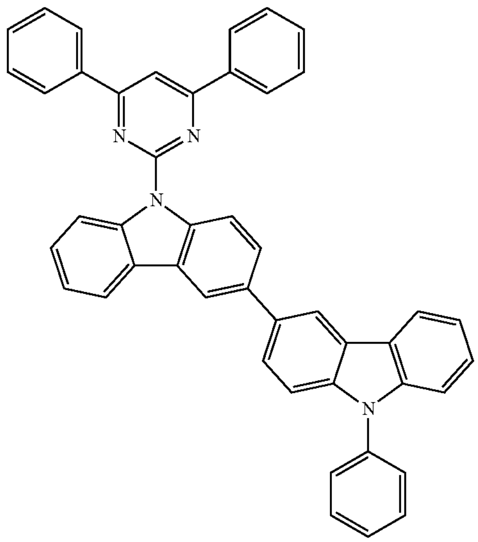
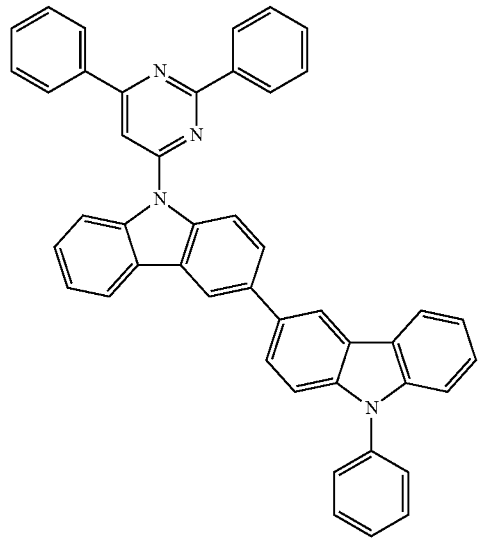
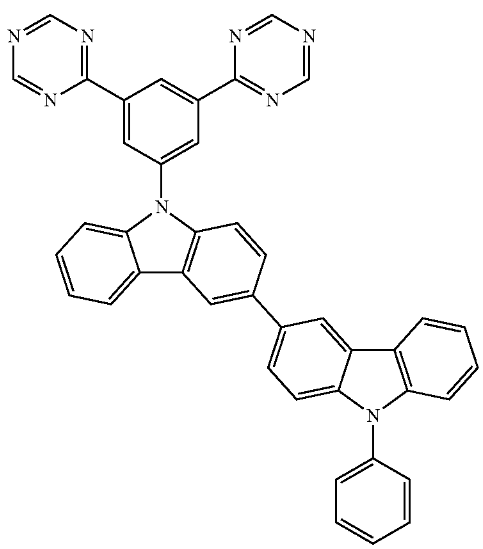
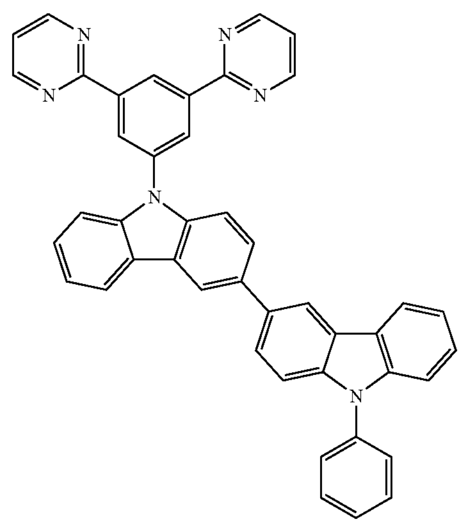

-continued
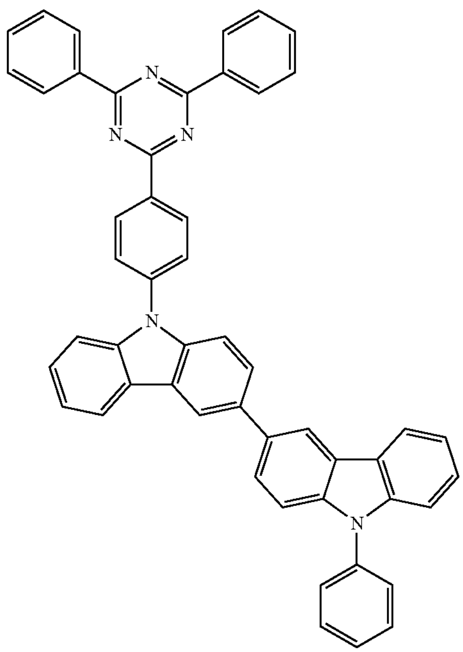
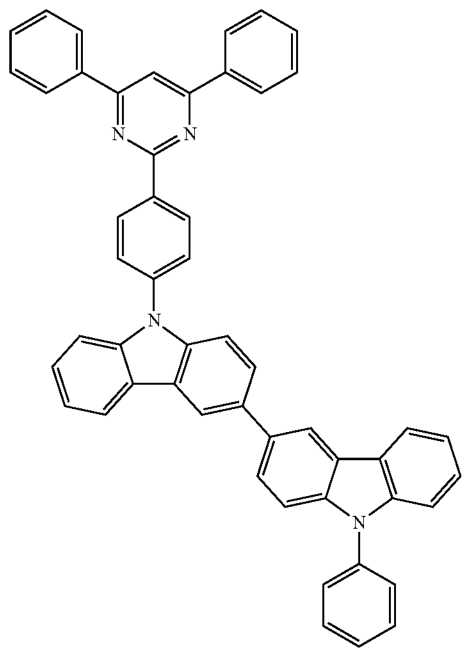
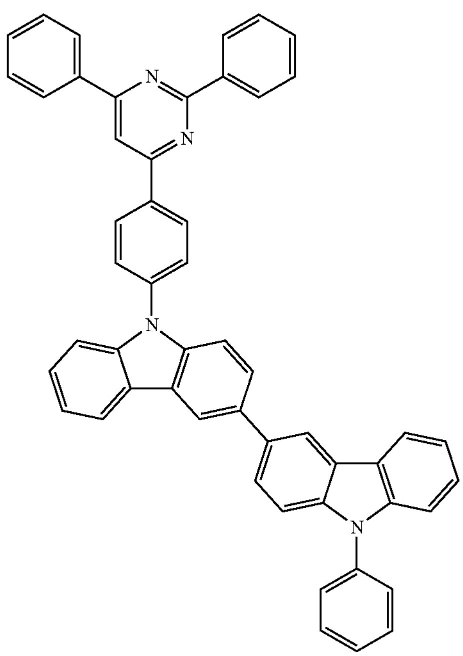
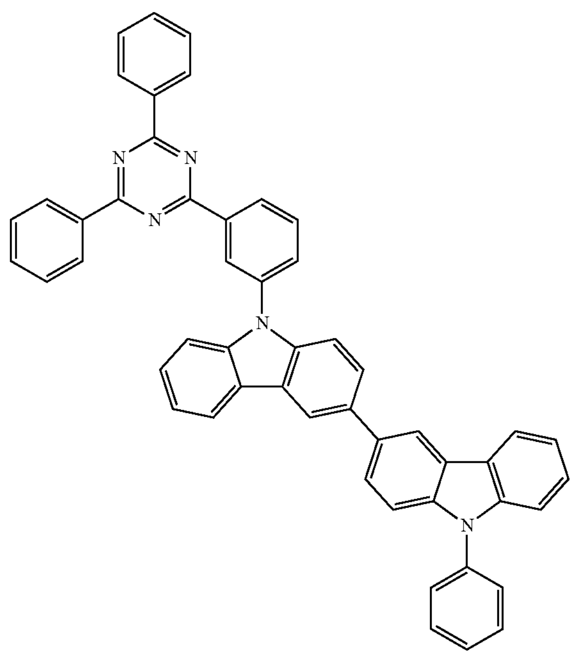

-continued
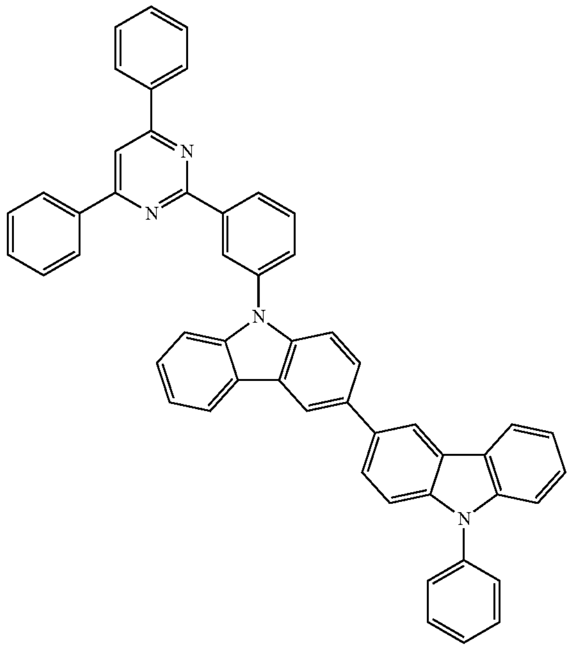
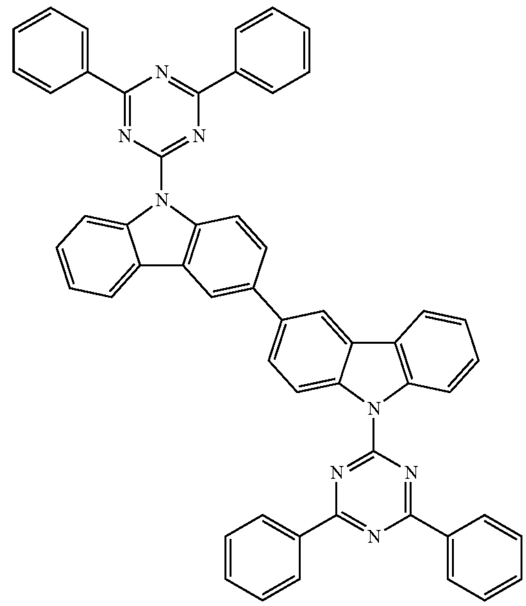
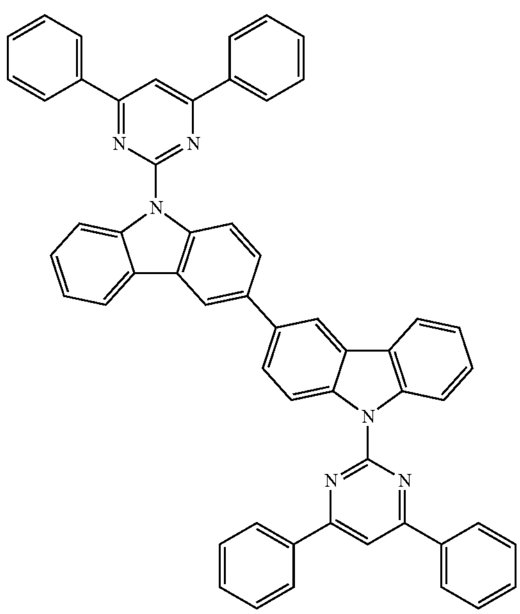
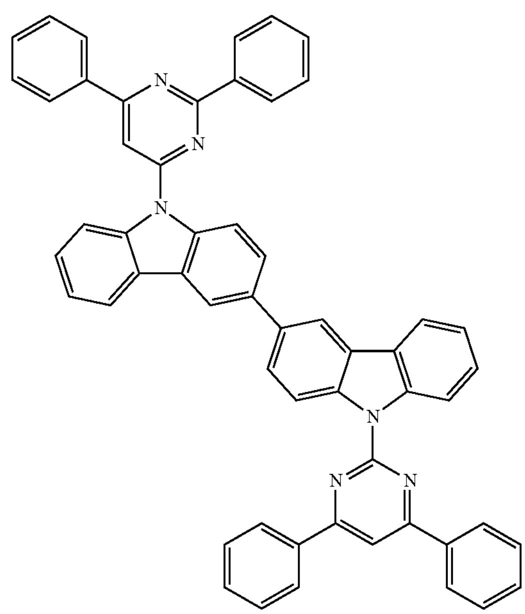

-continued
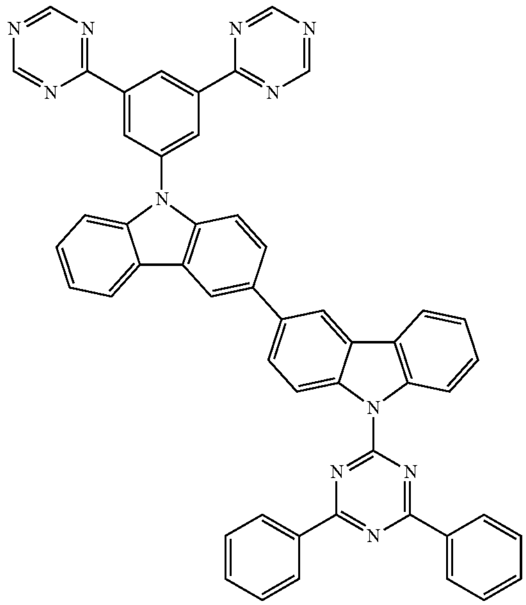
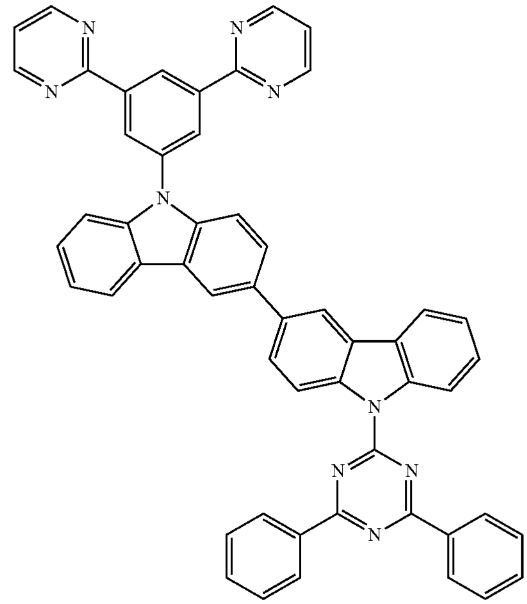
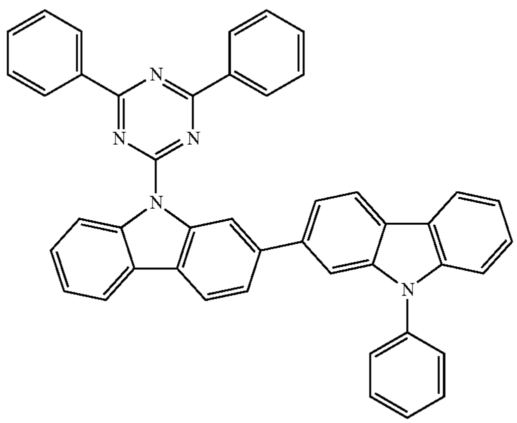
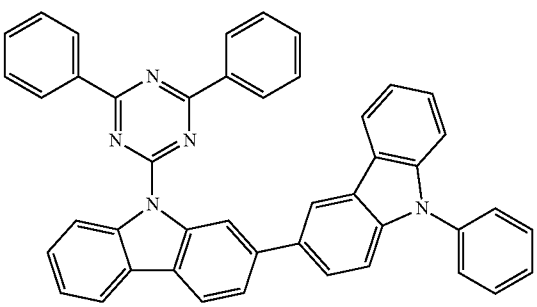
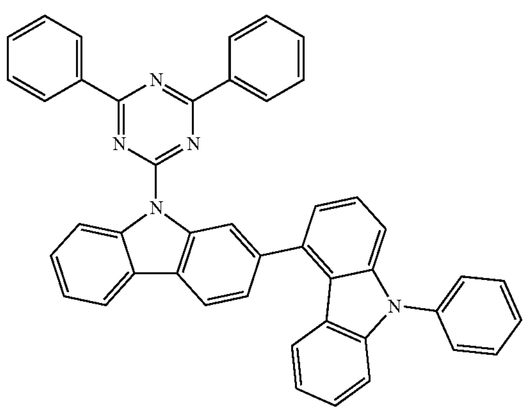
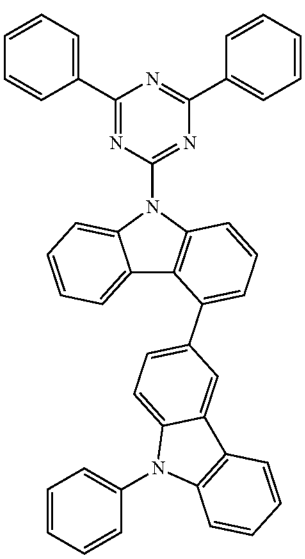

-continued
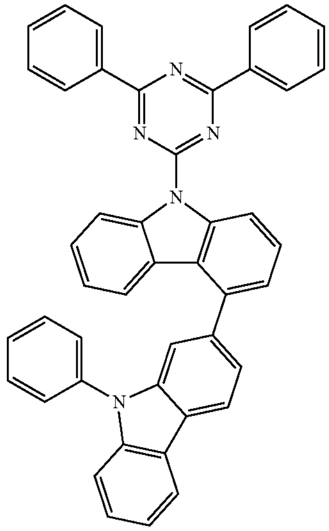
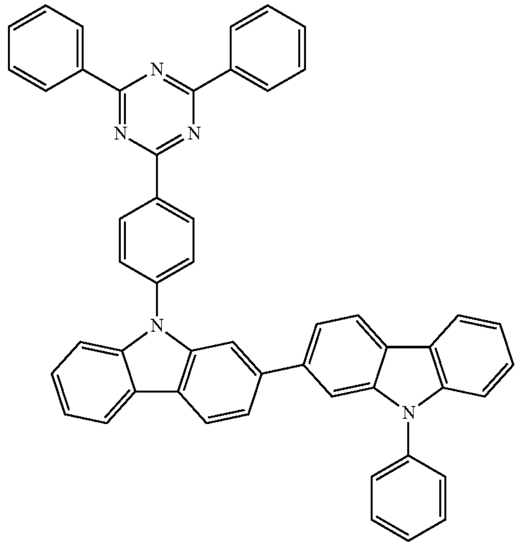
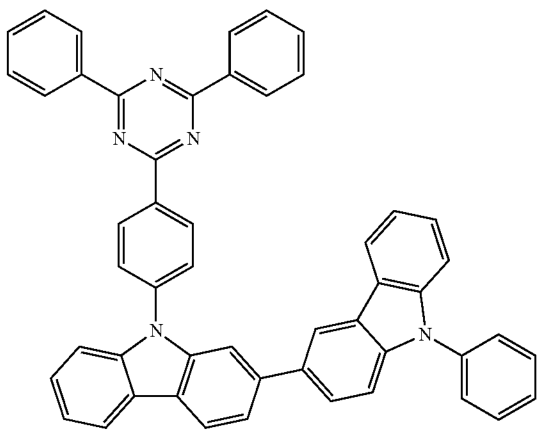
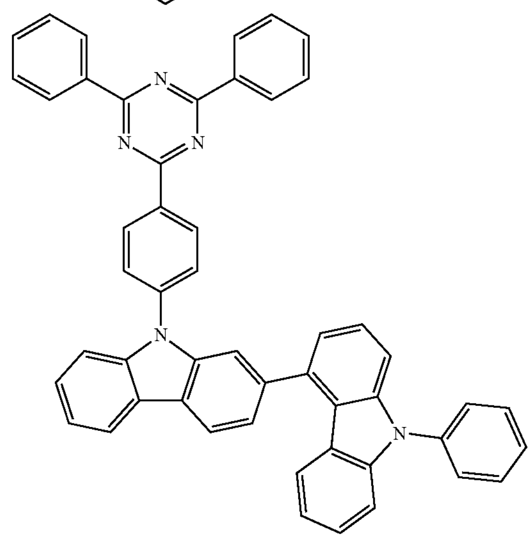
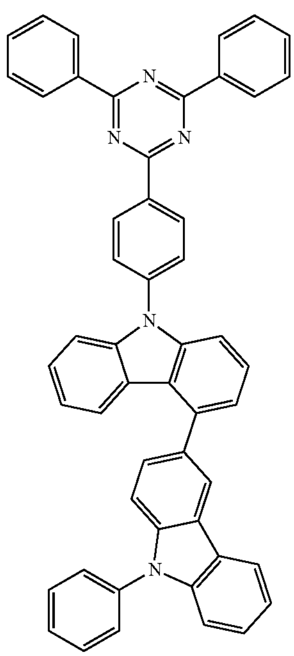
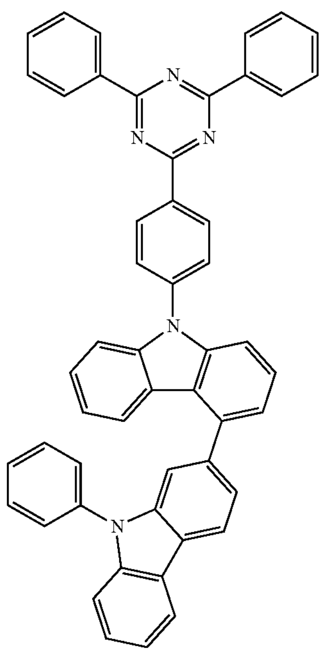

-continued
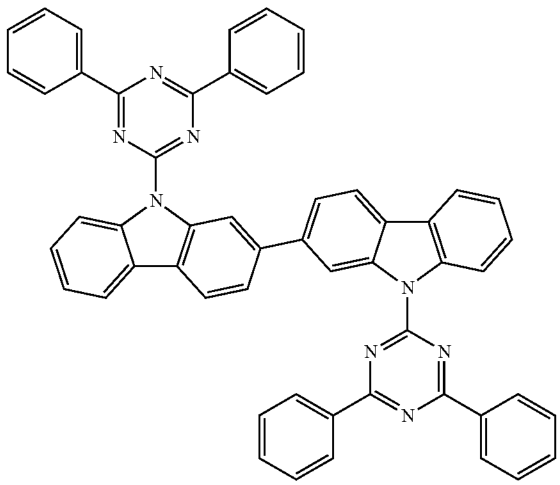
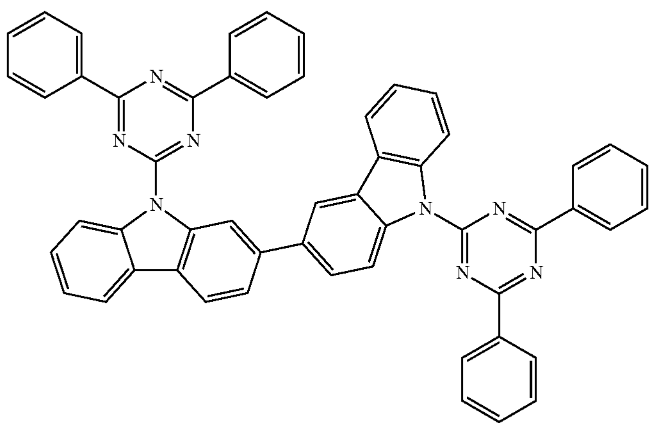
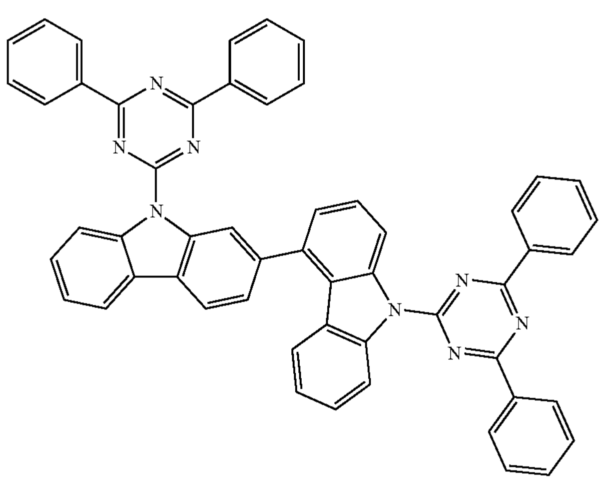
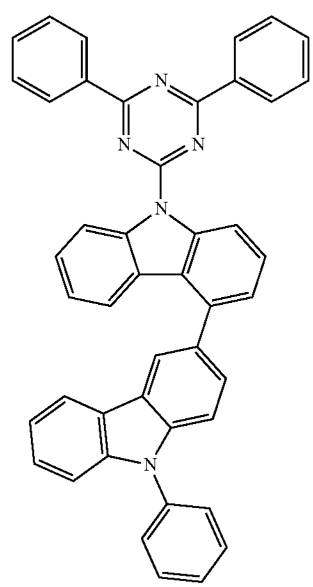

-continued
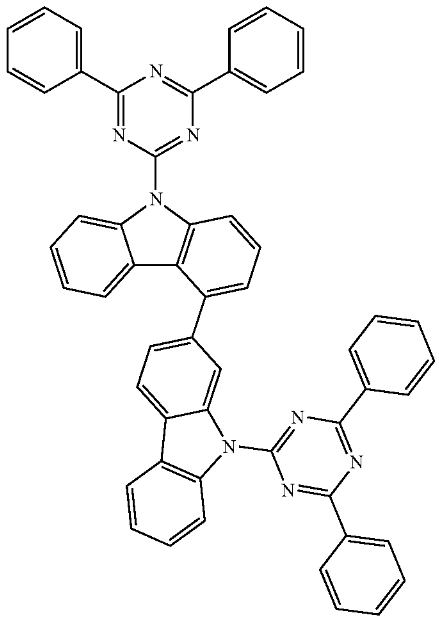
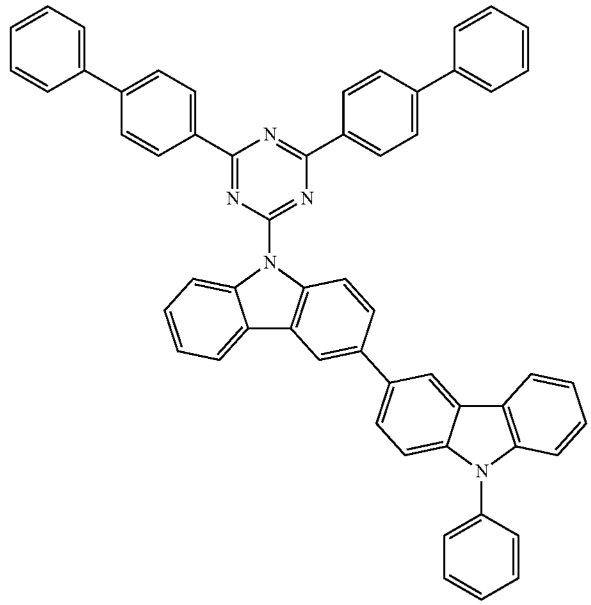
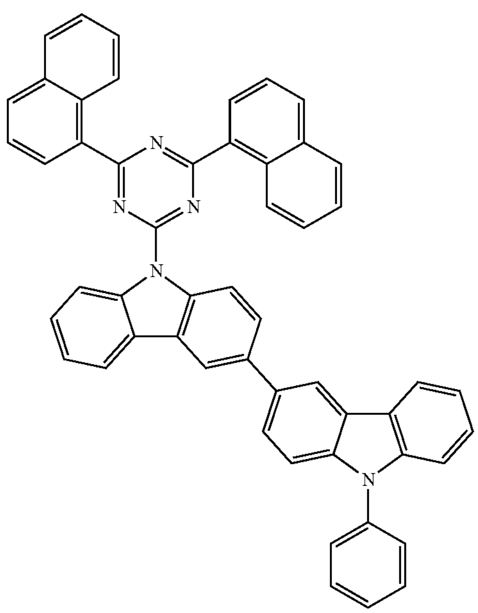
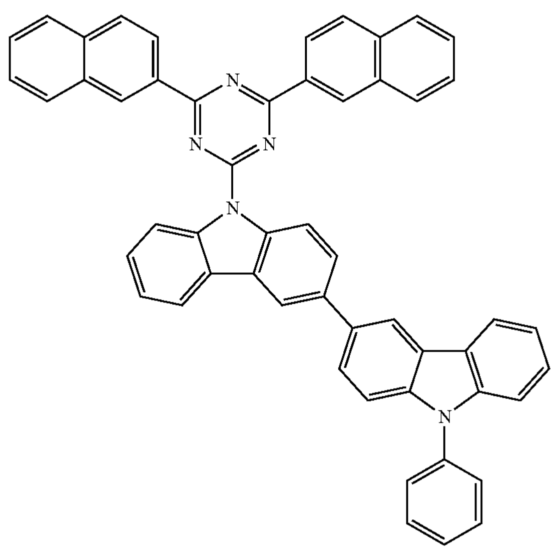

-continued
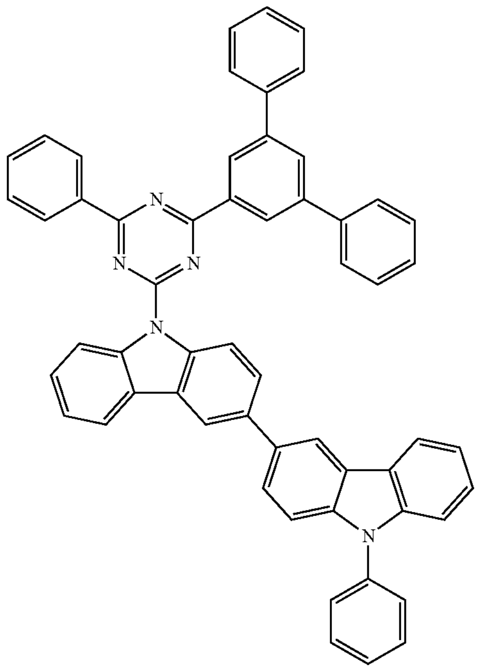
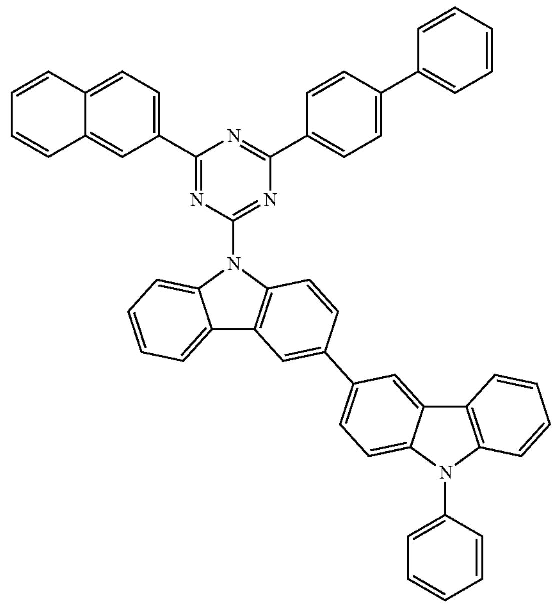
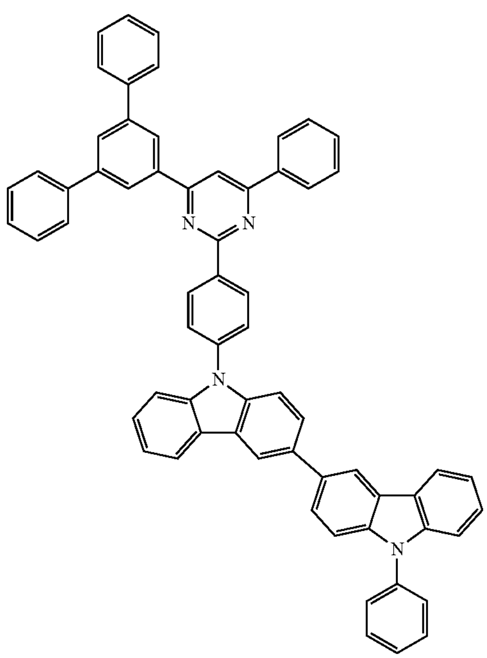
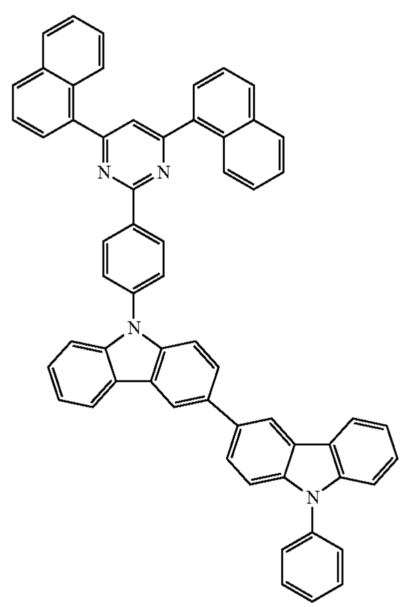

-continued
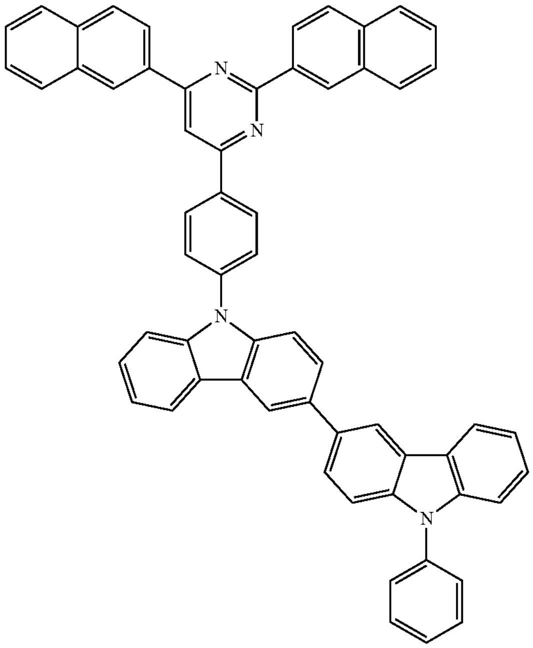
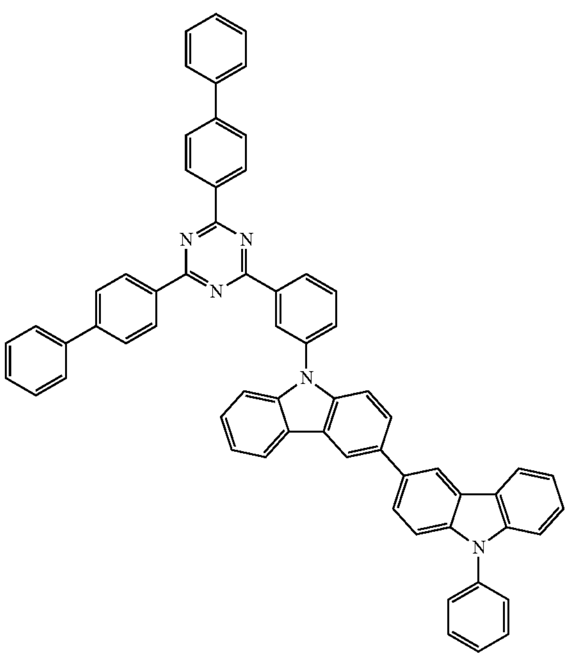
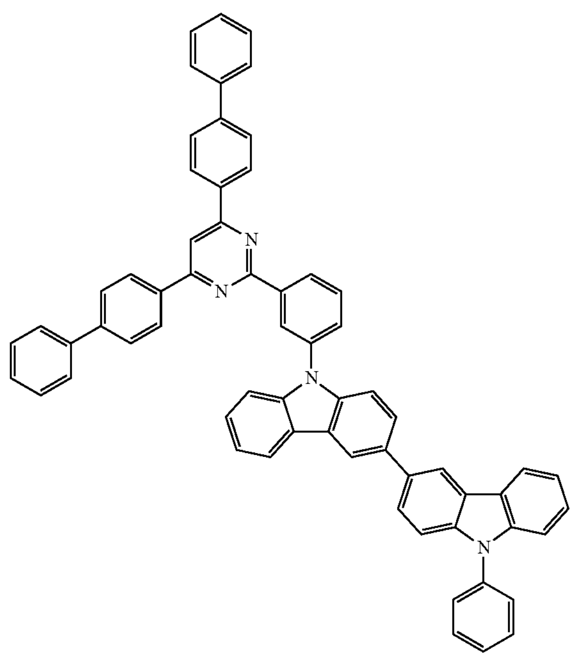

-continued
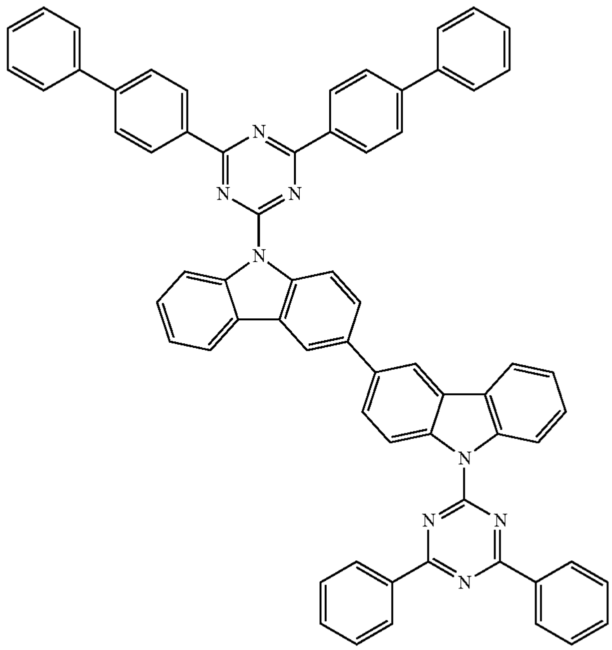
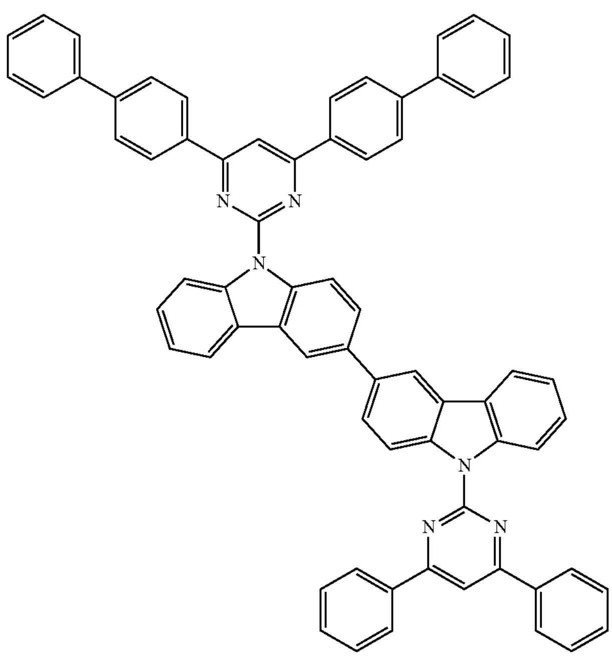

-continued
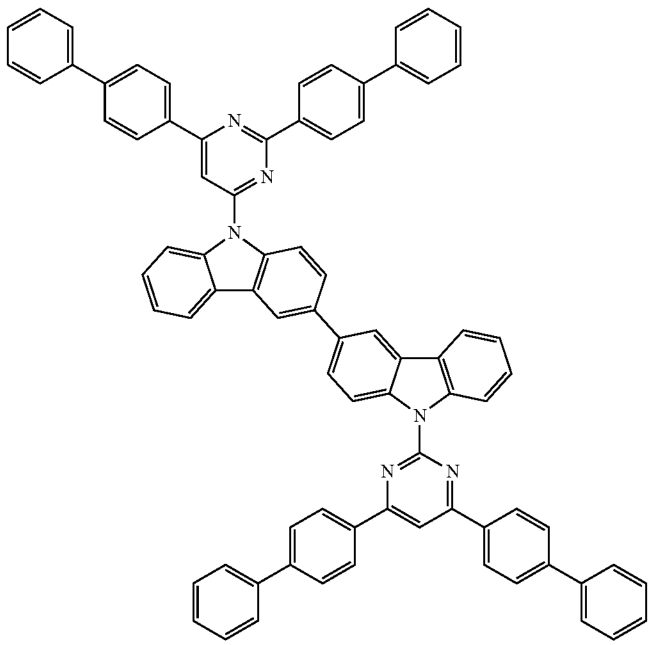
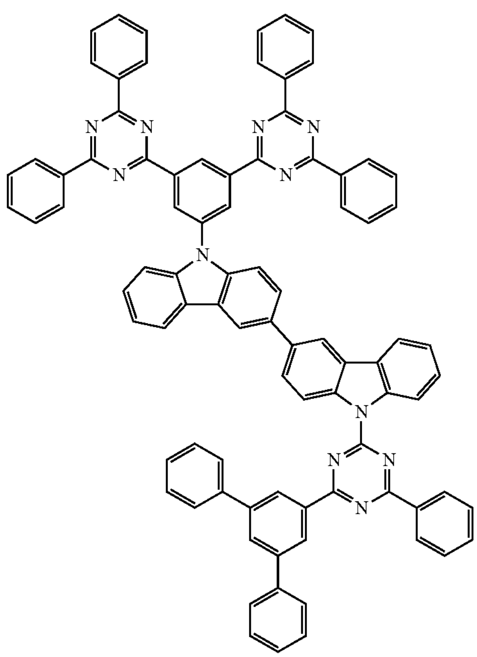
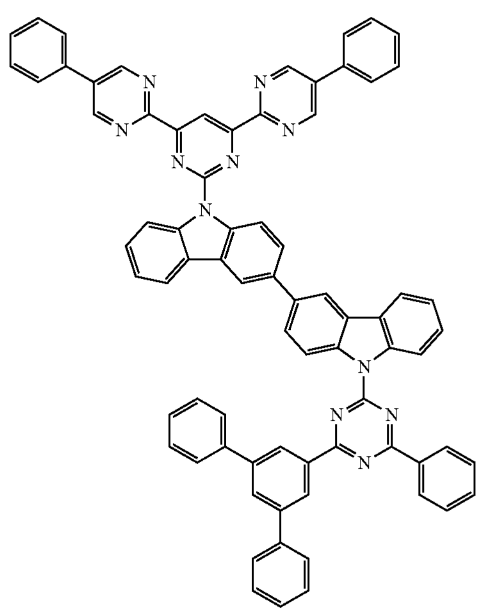

-continued
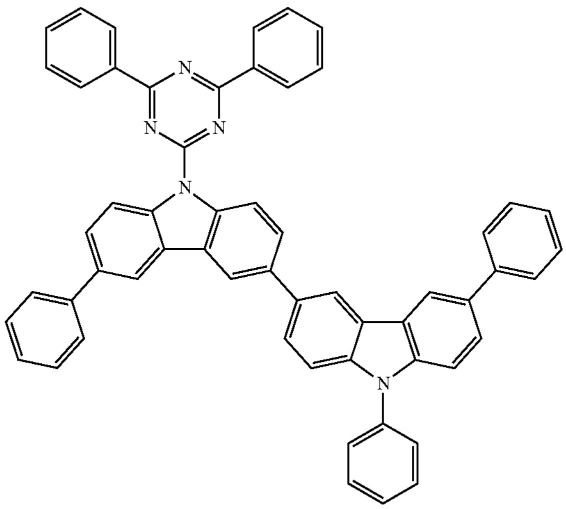
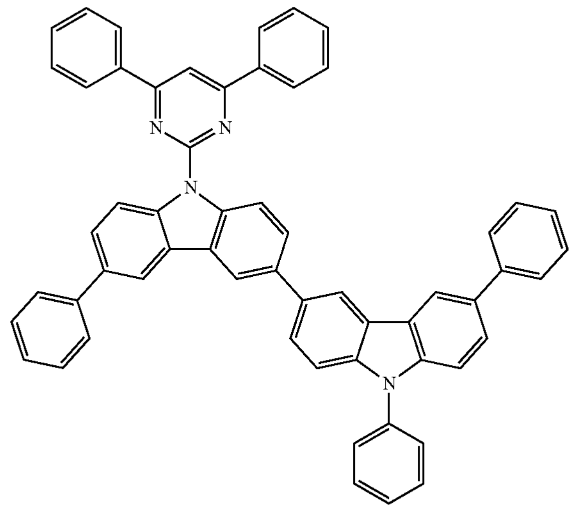
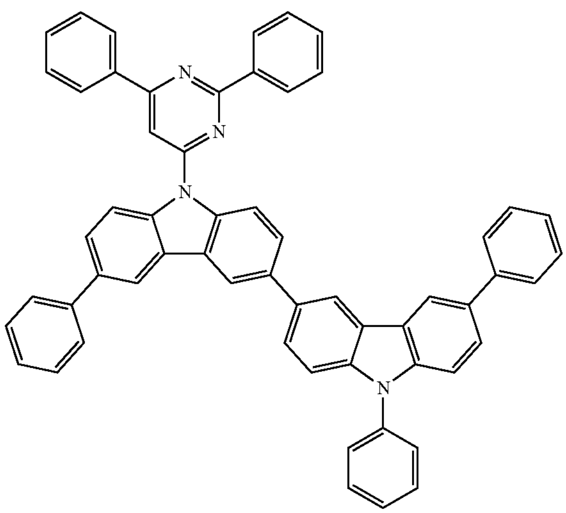
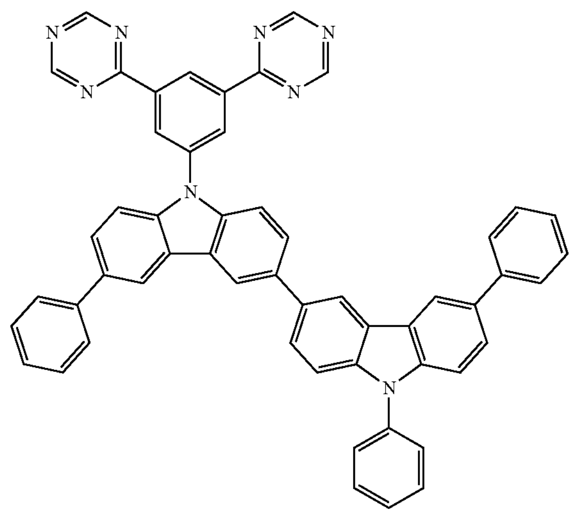
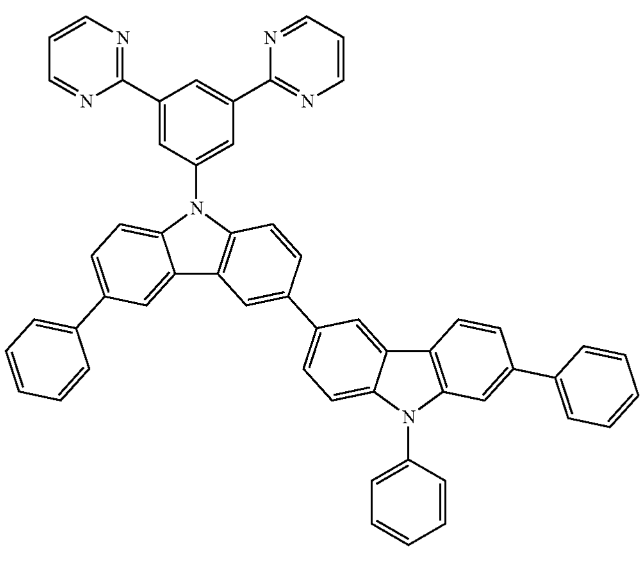

-continued
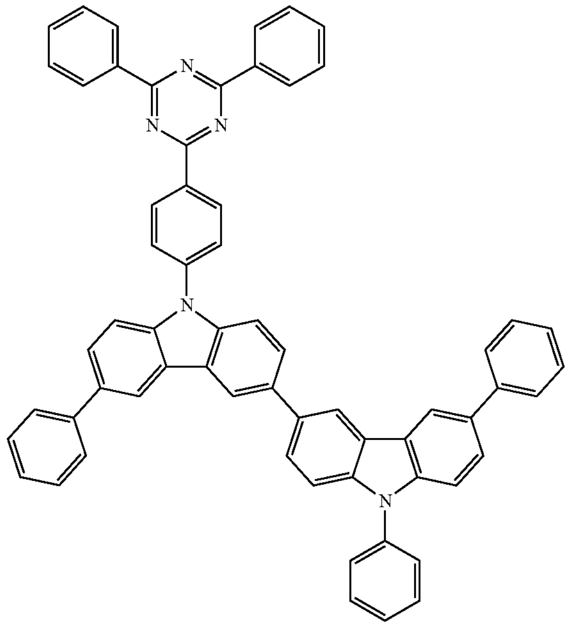
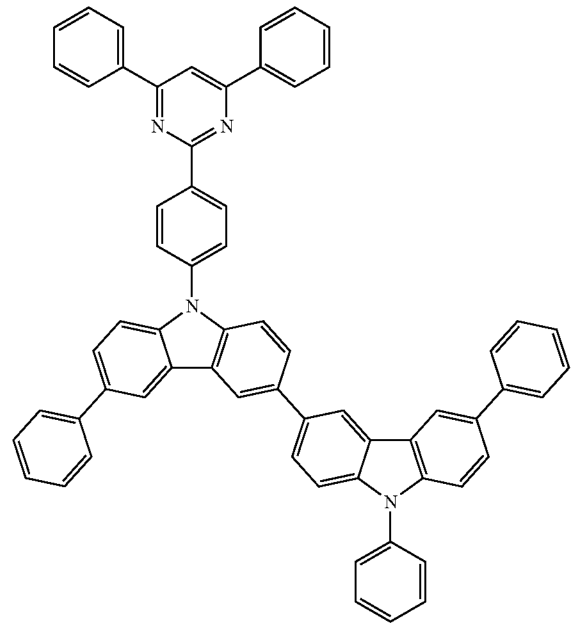
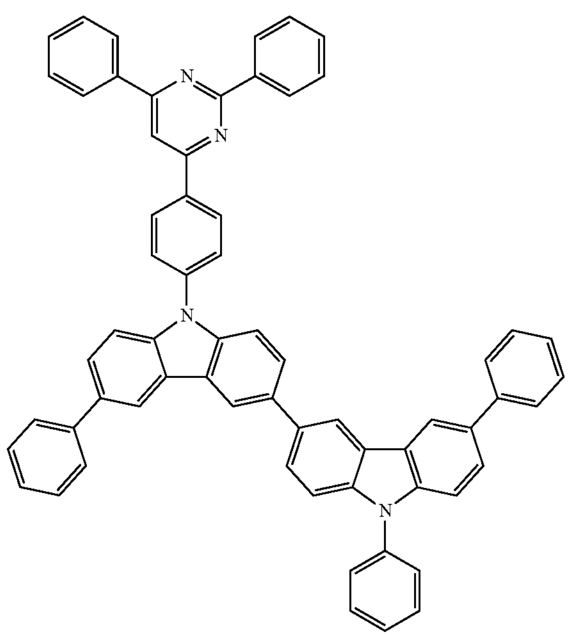

-continued
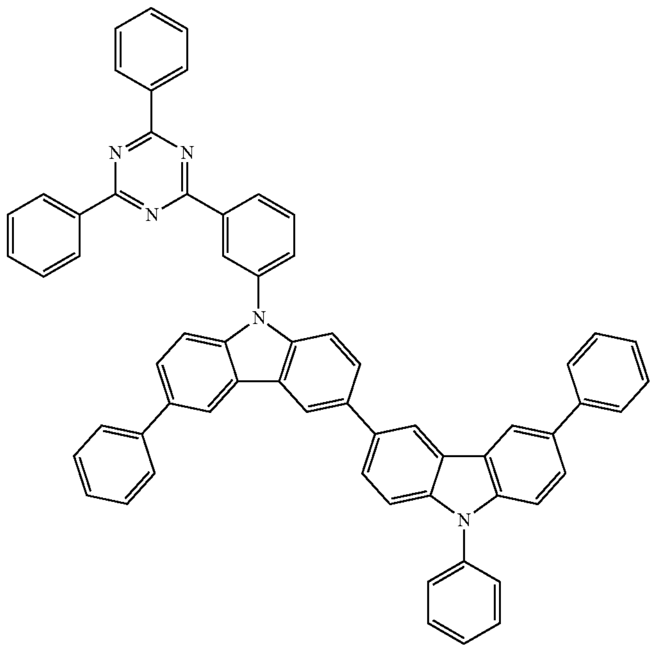
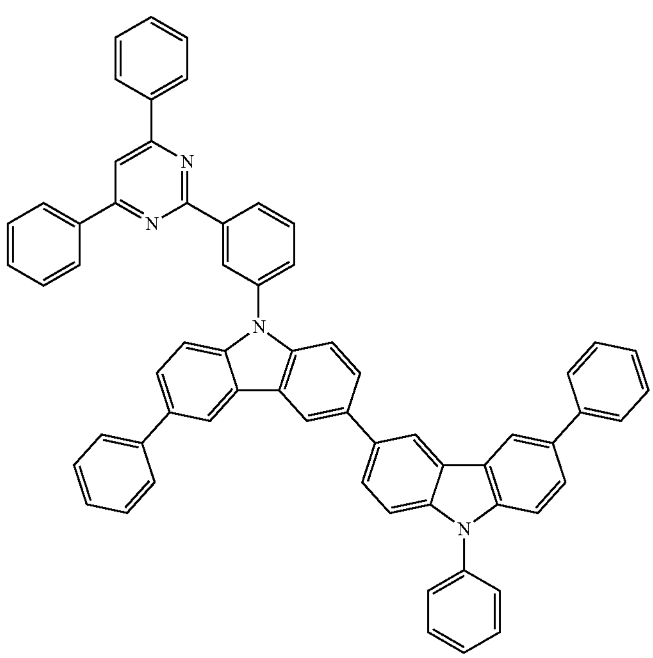

-continued
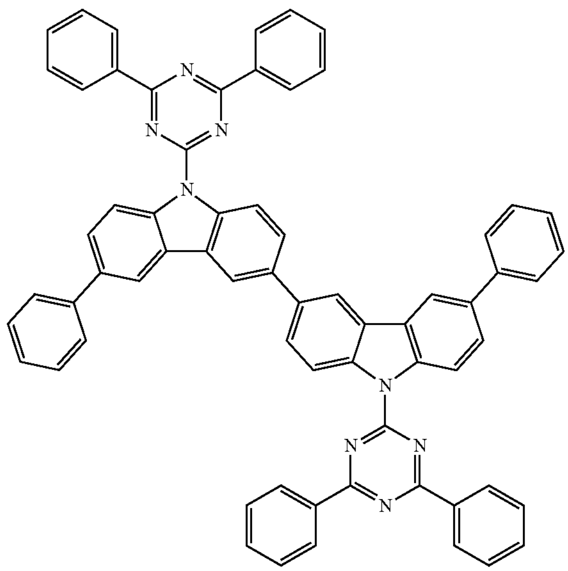
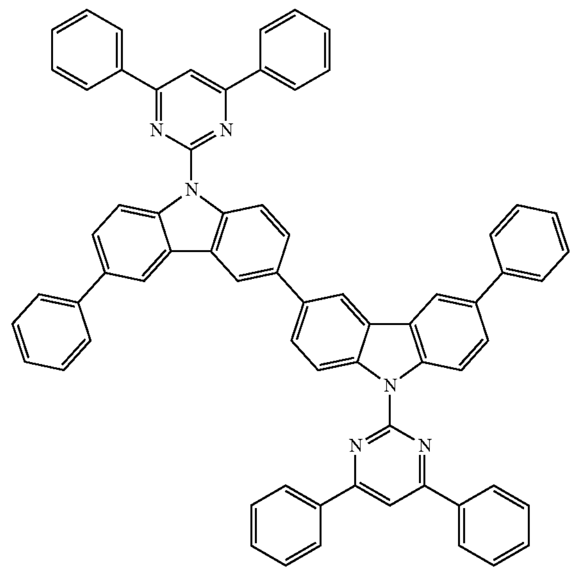
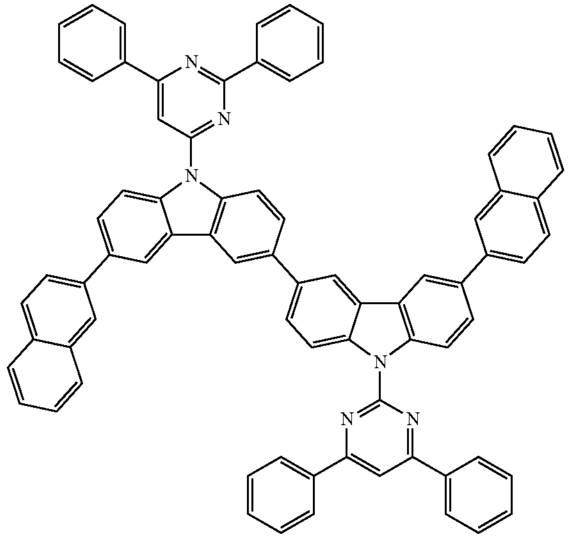
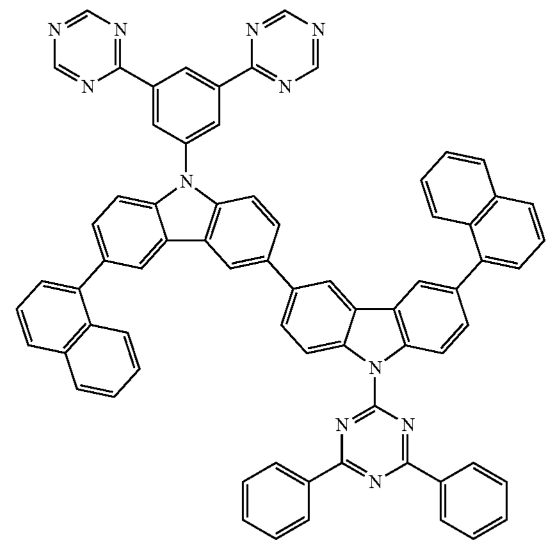
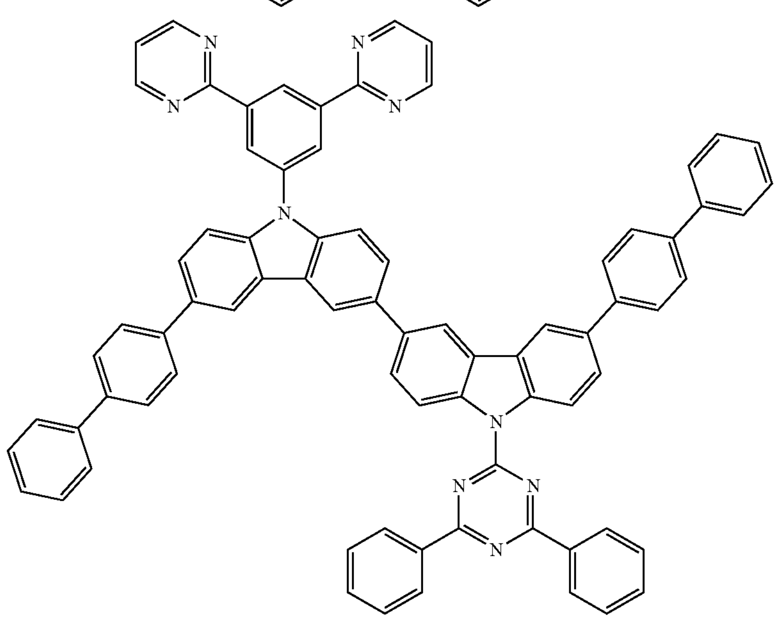

-continued
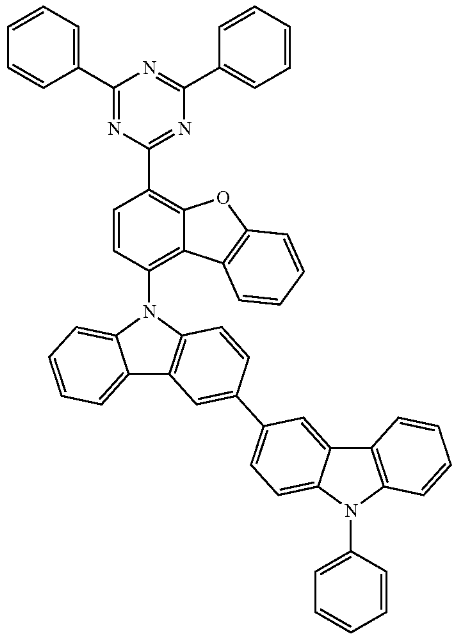
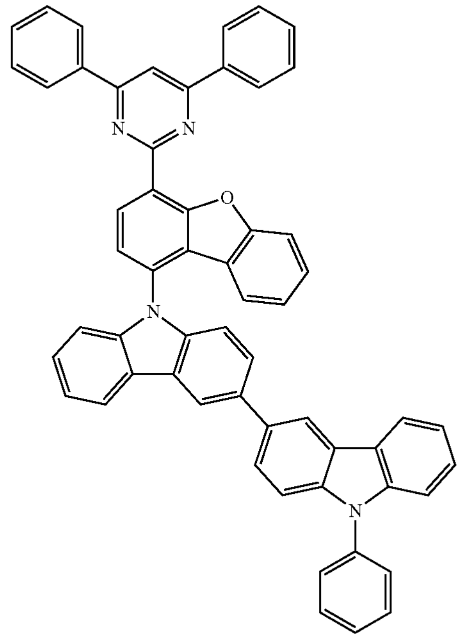
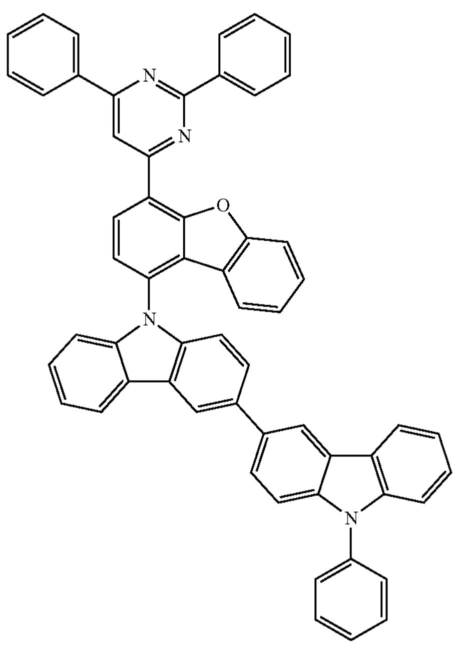
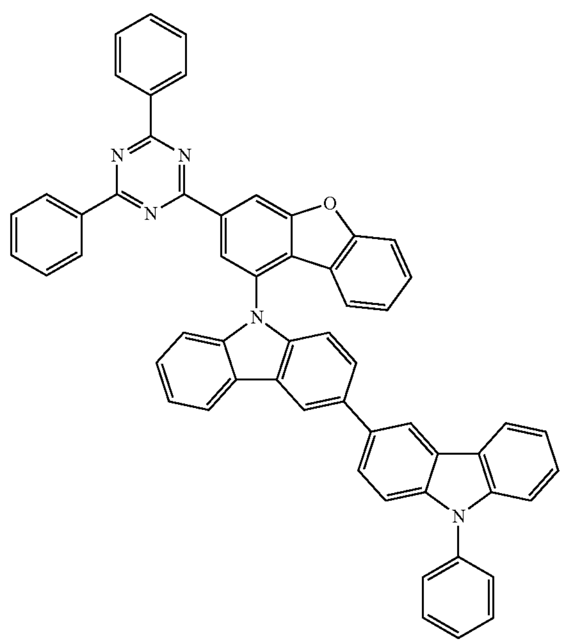

-continued
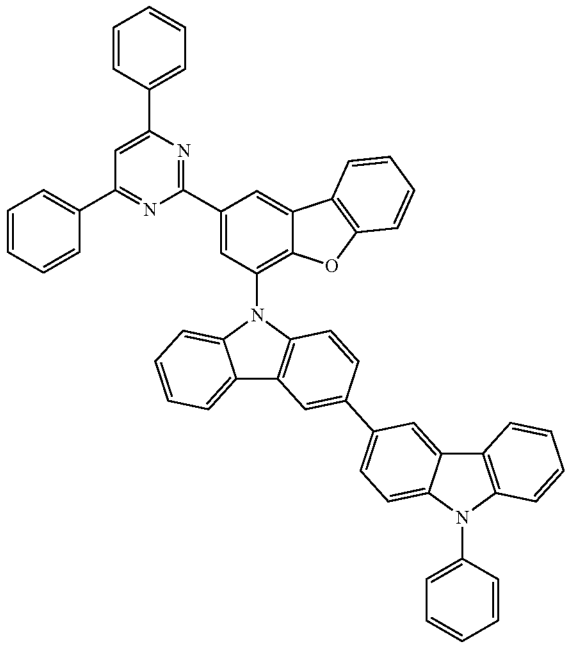
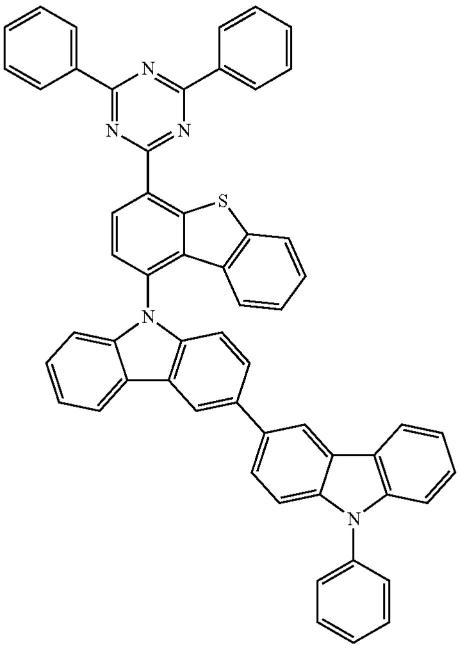
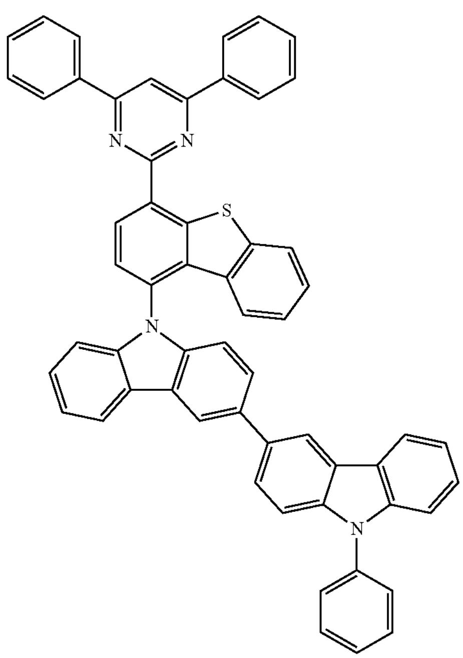
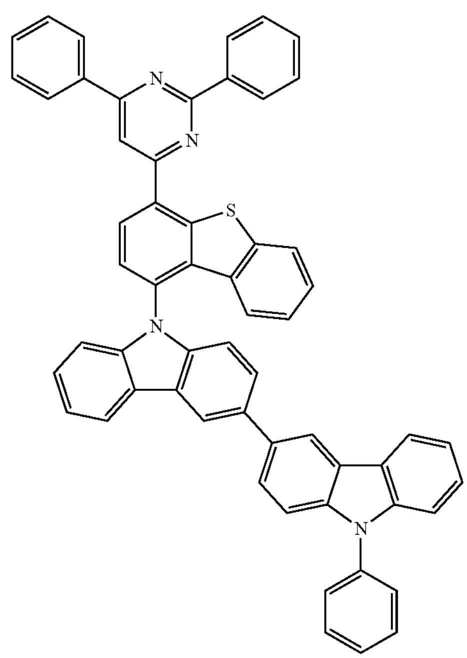

-continued
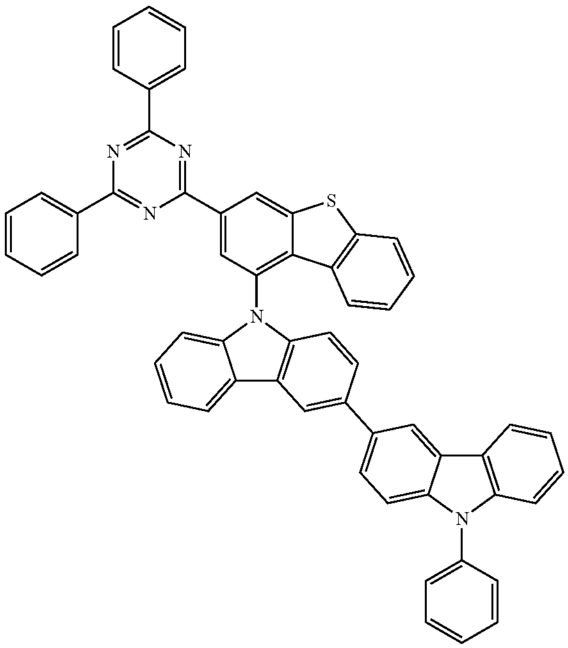
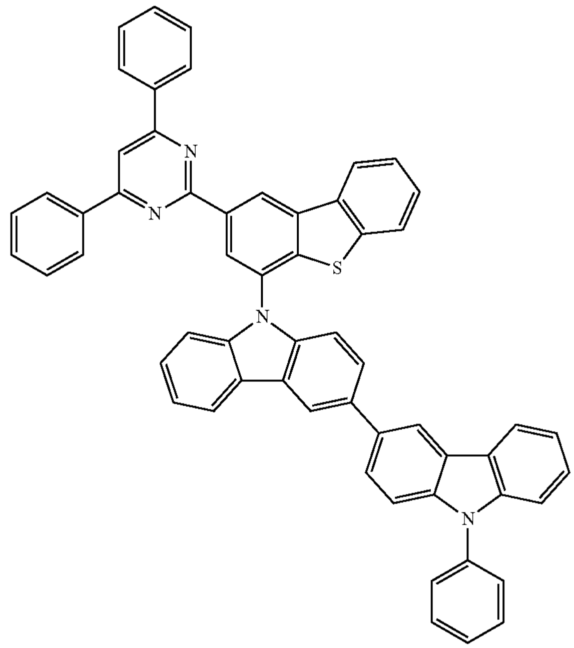
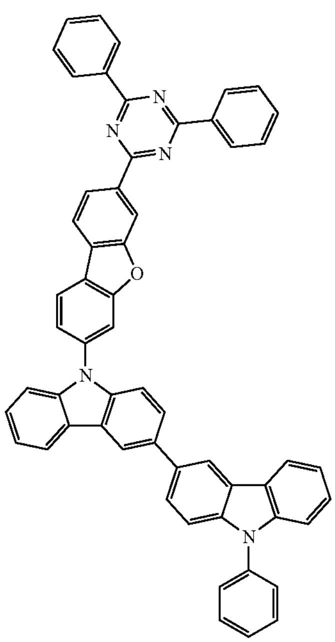
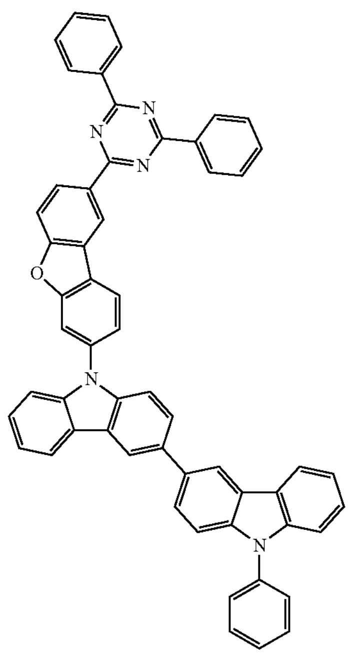

-continued
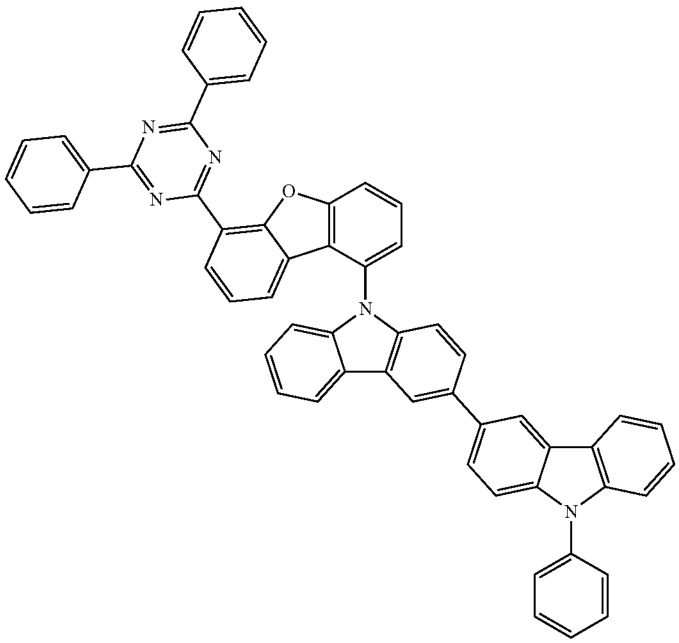
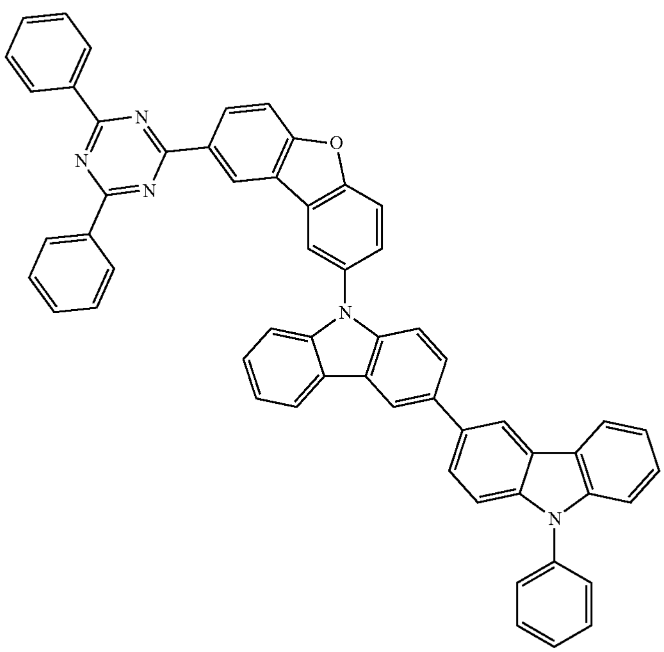

-continued
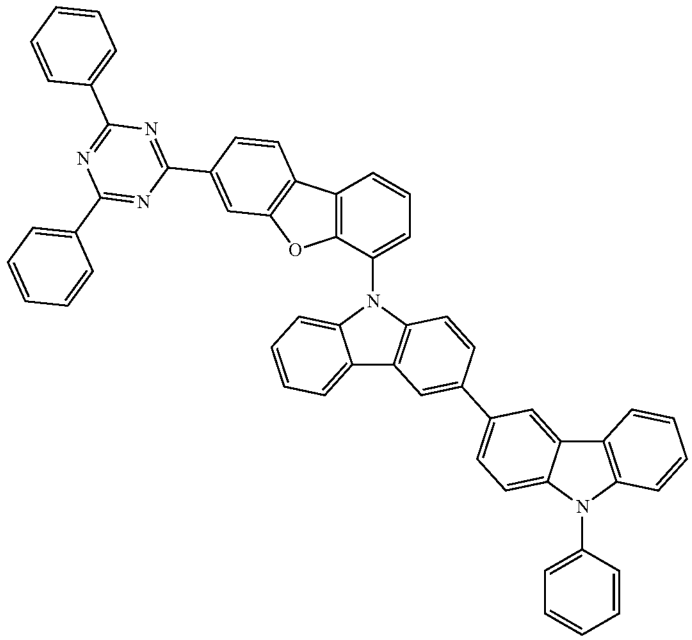
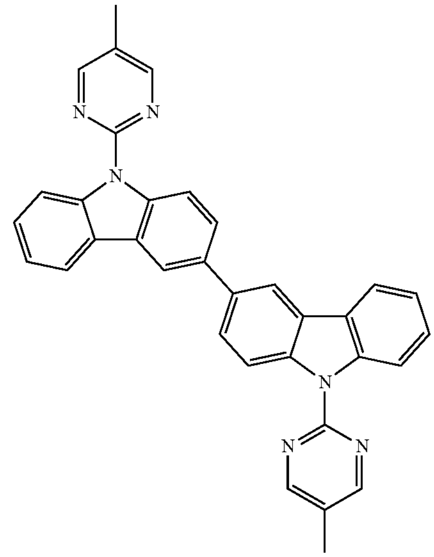
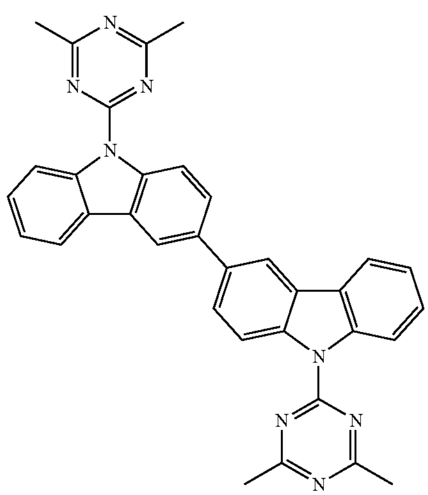
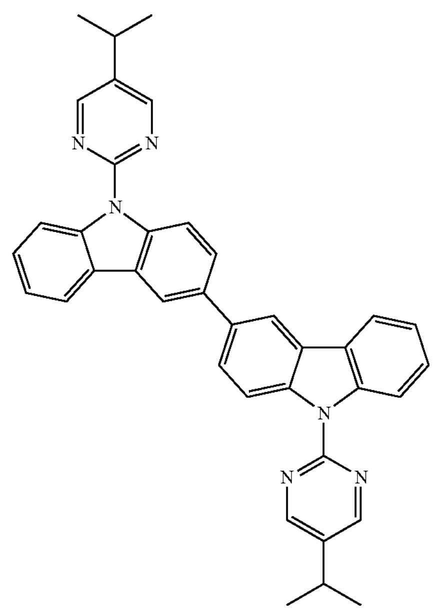

-continued
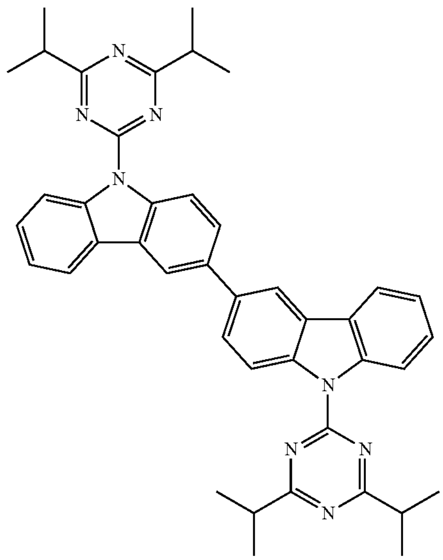
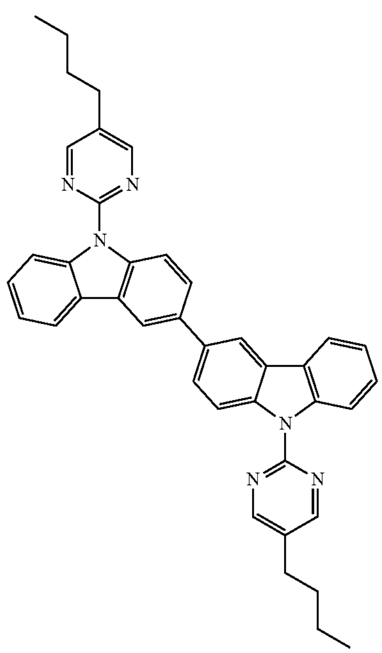
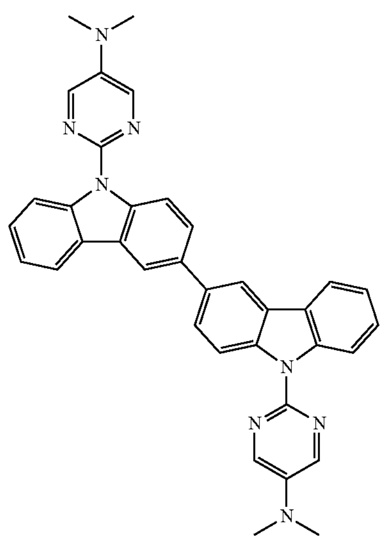

-continued
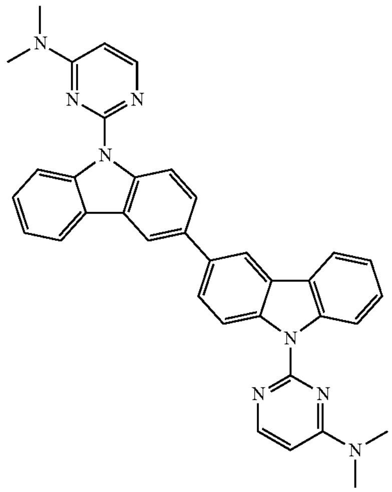
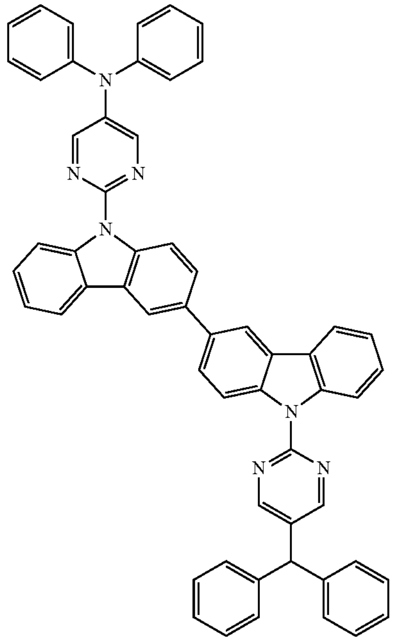
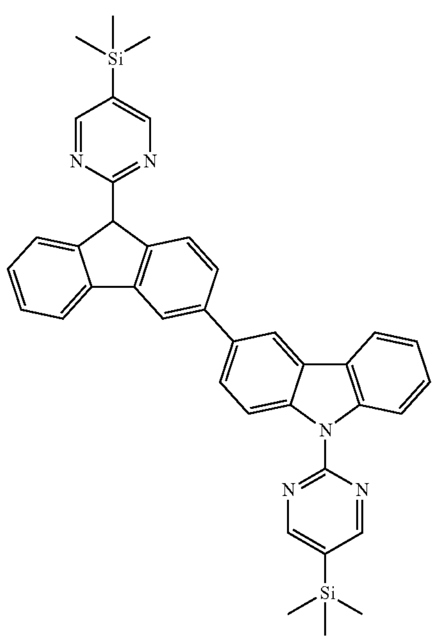
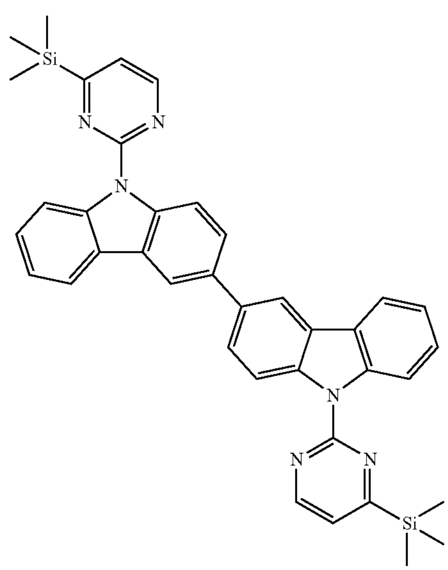

-continued
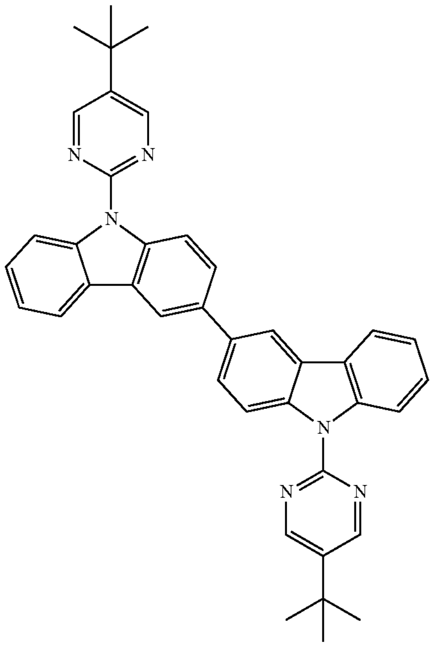
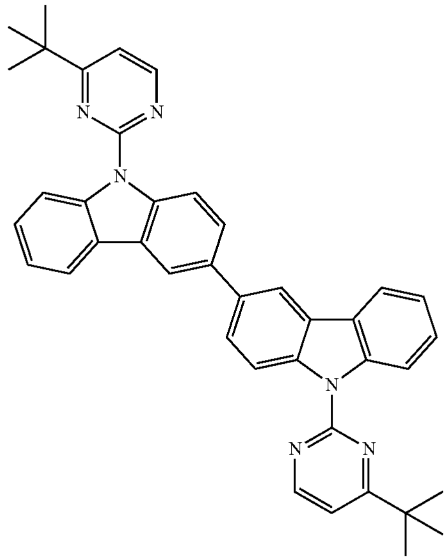
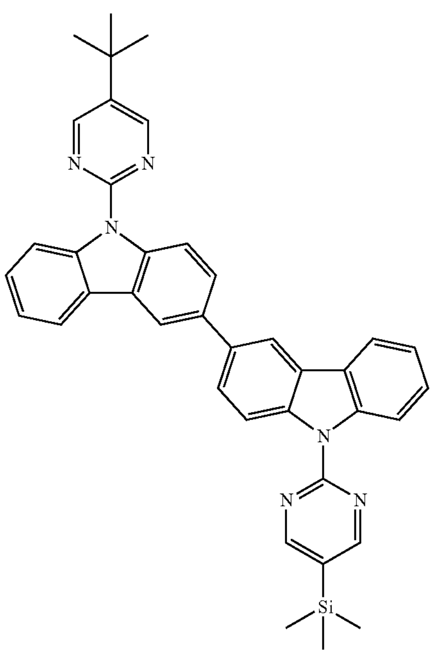
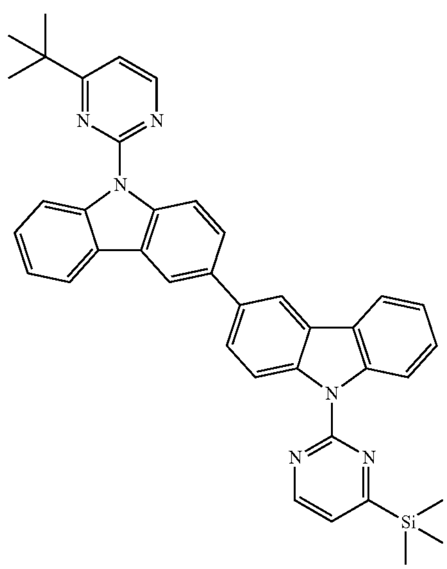

-continued
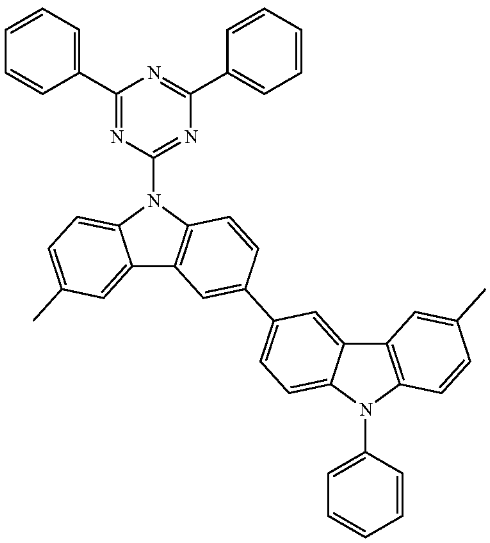
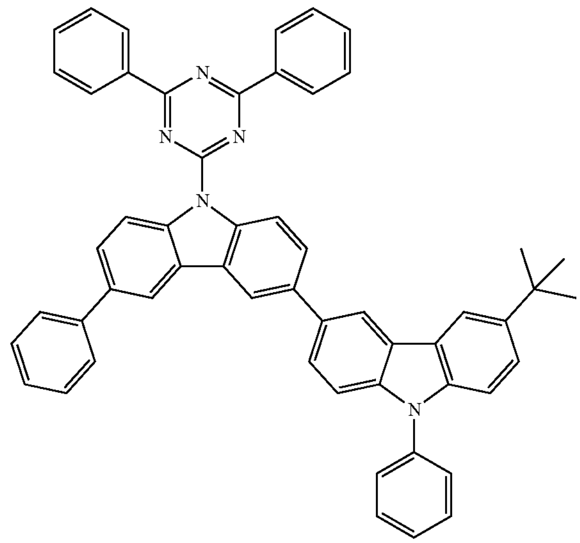
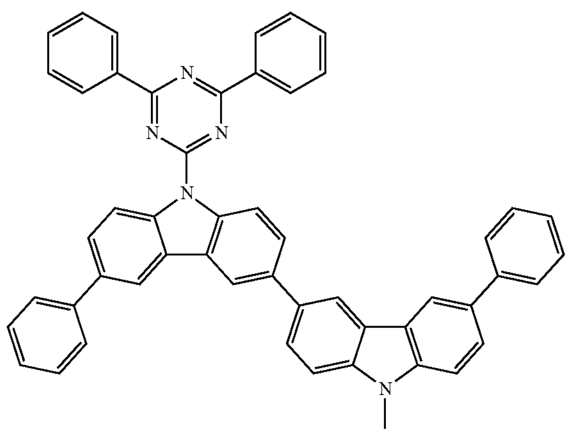
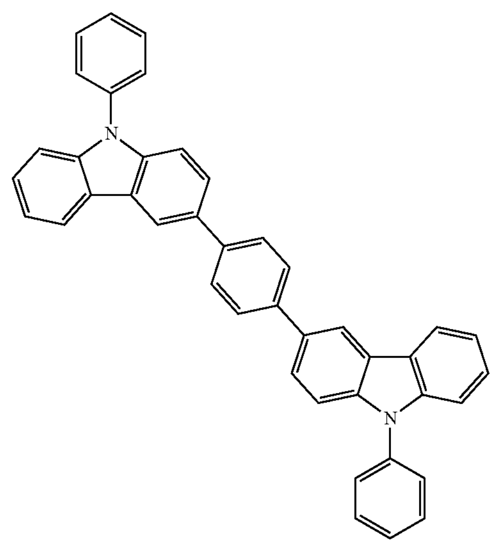
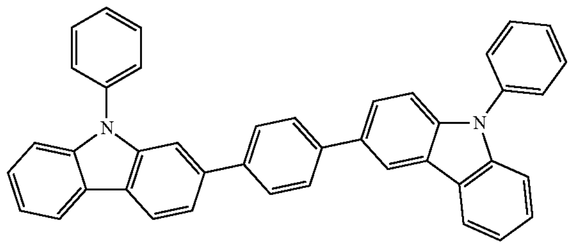

-continued
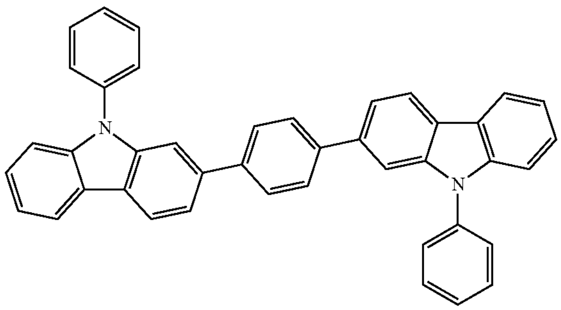
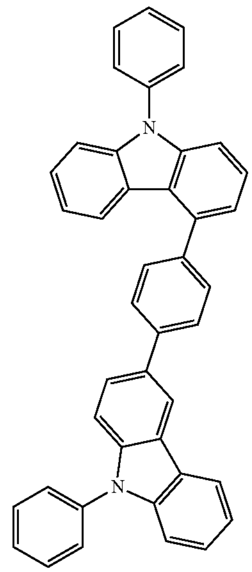
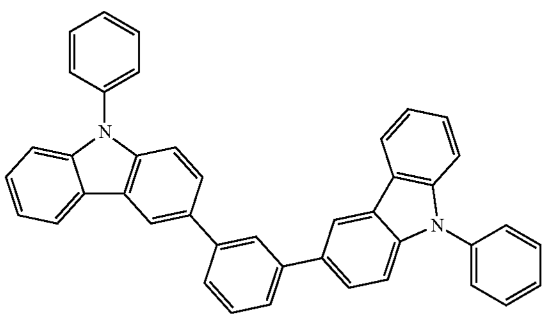
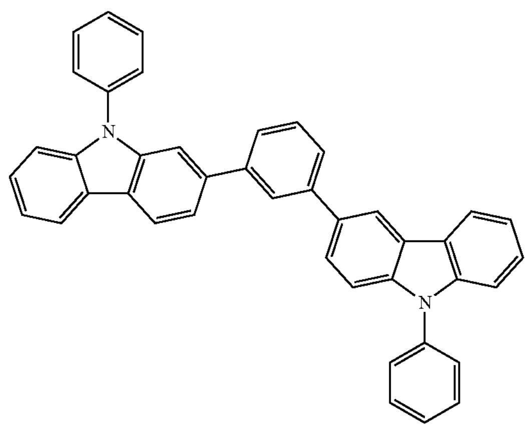
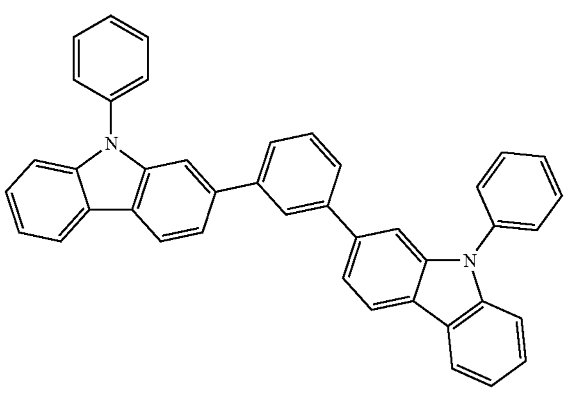
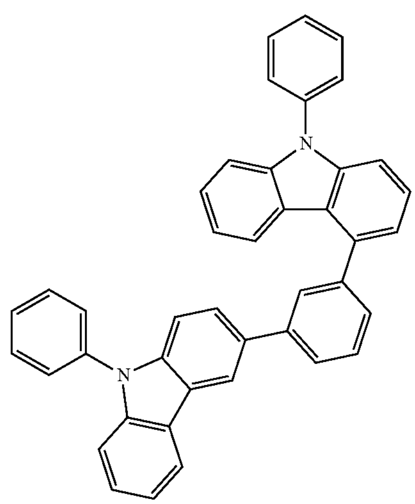

-continued
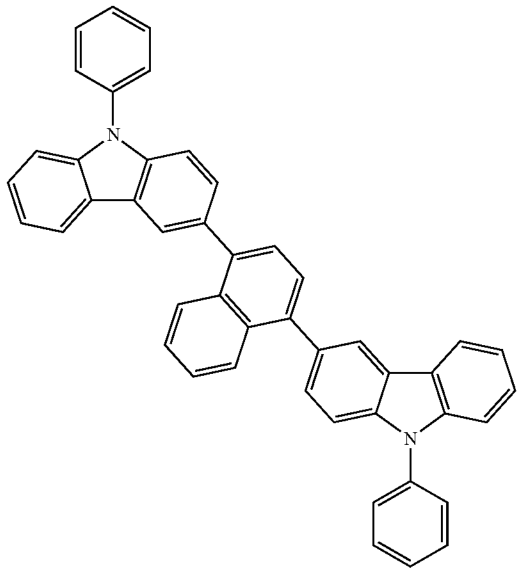
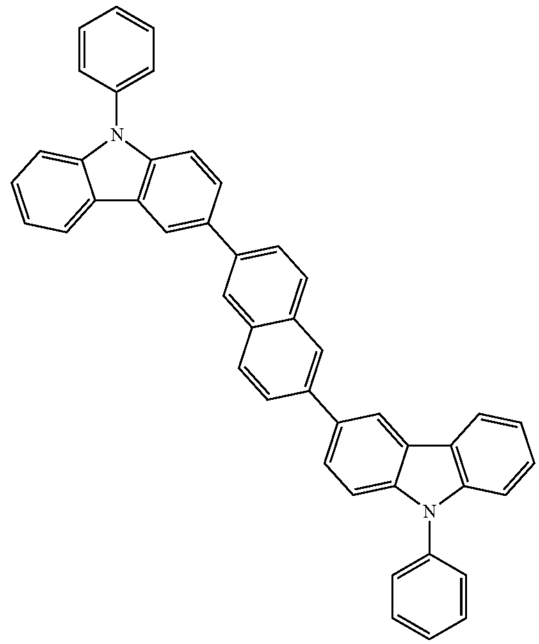
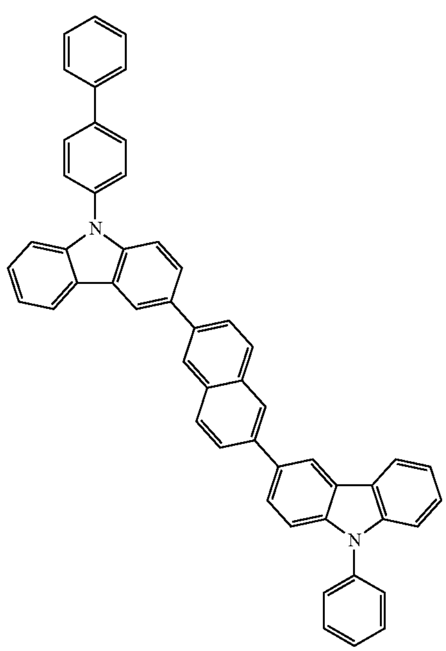
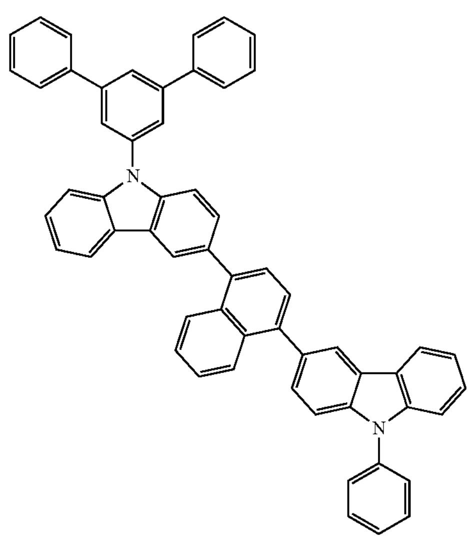

-continued
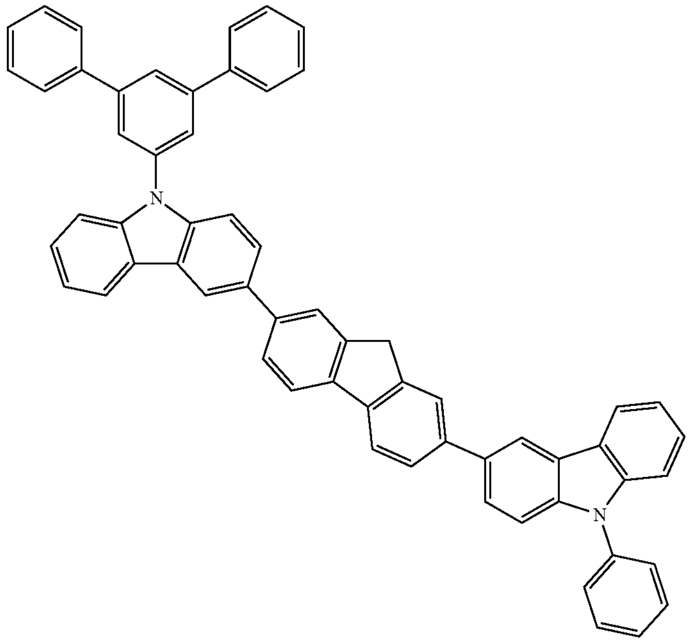
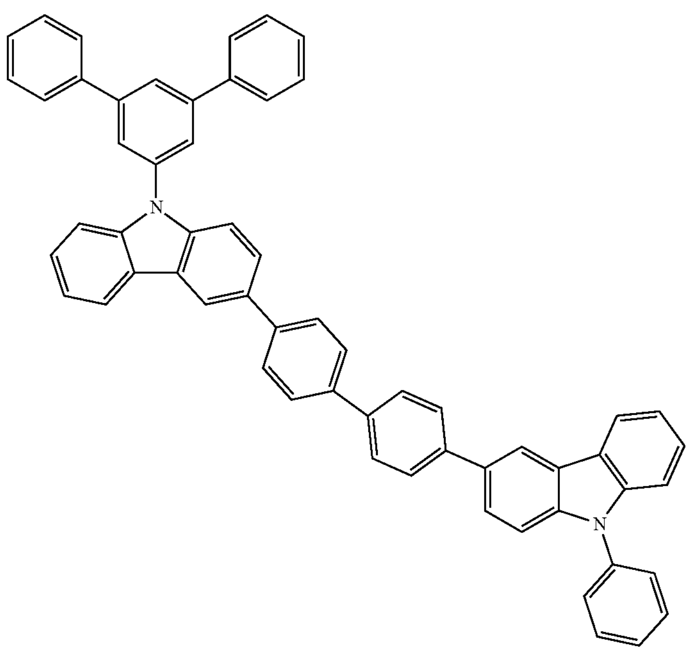

-continued
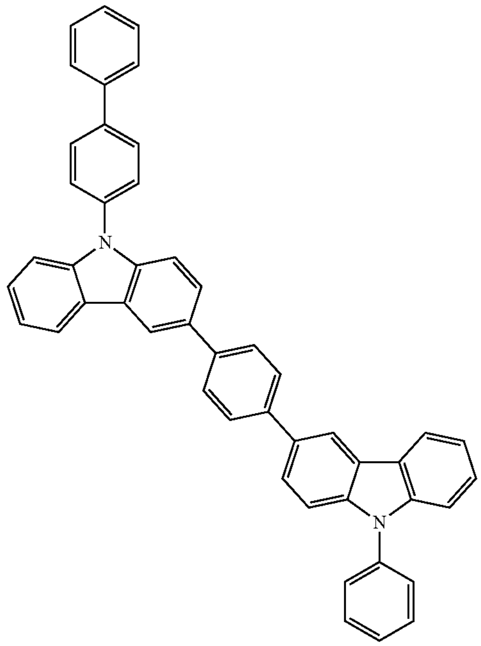
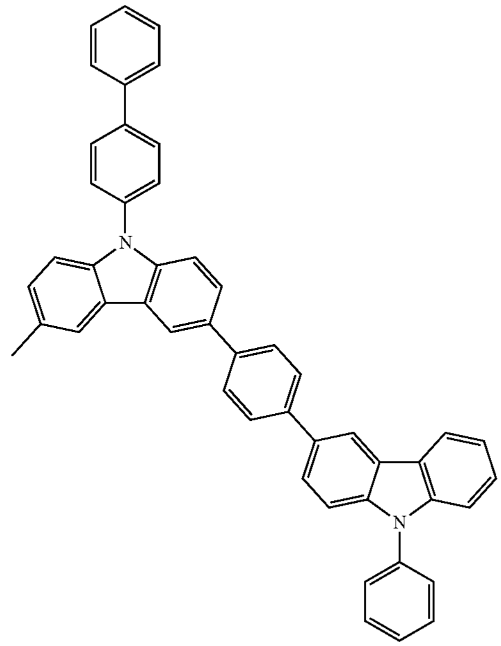
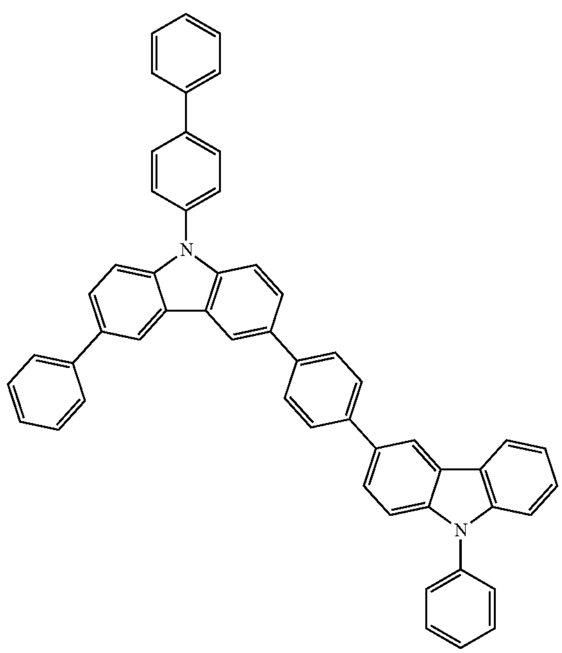
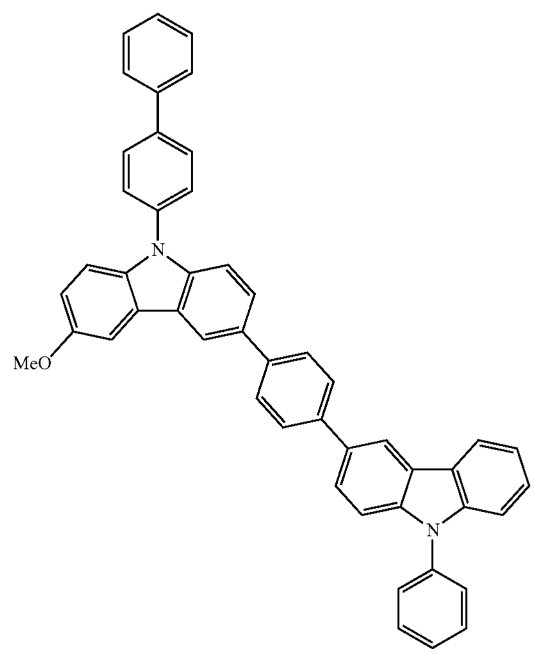

-continued
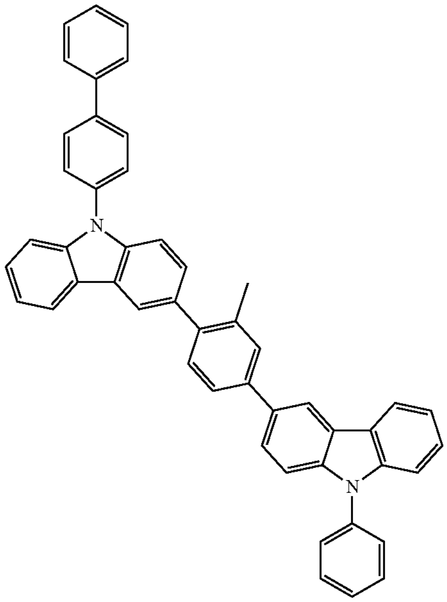
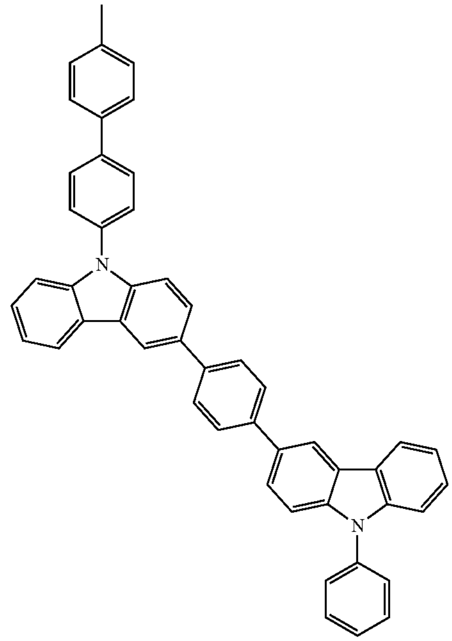
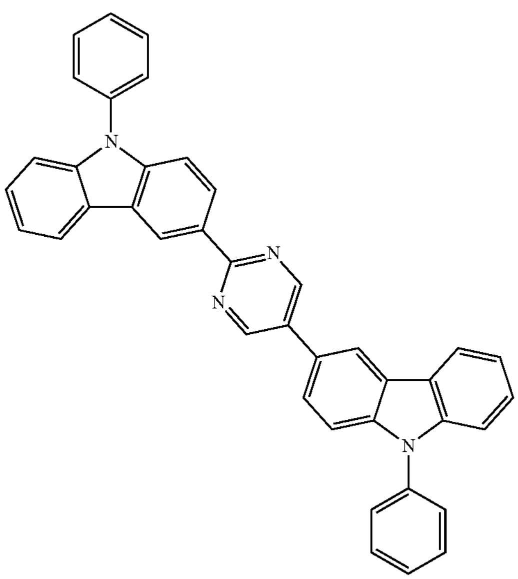
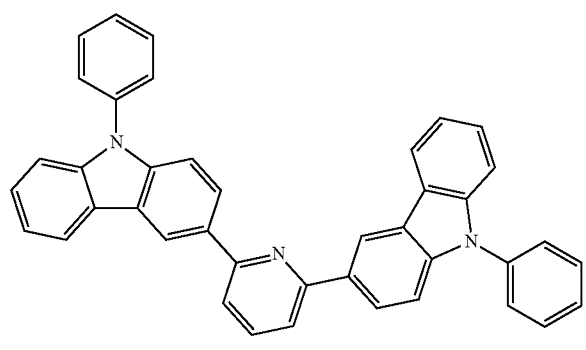

-continued
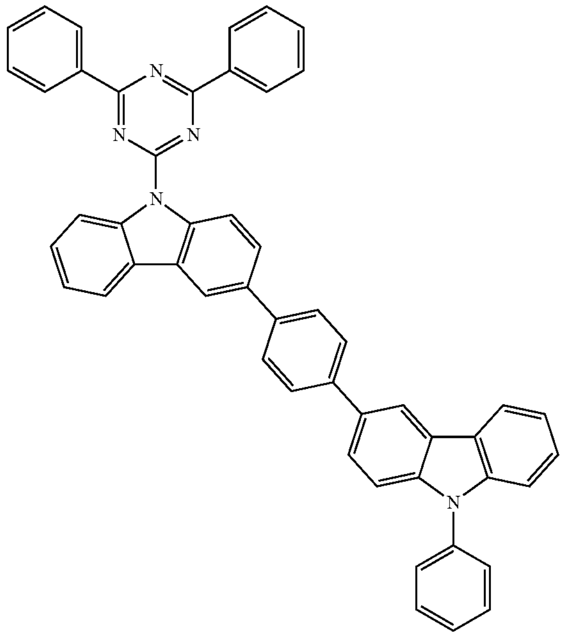
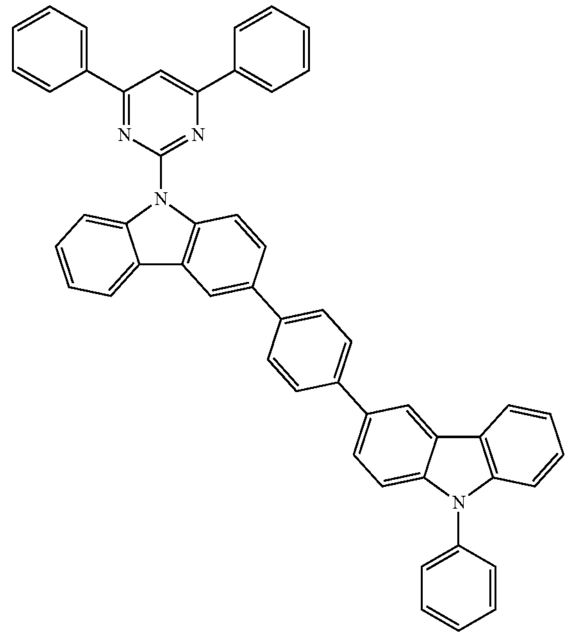
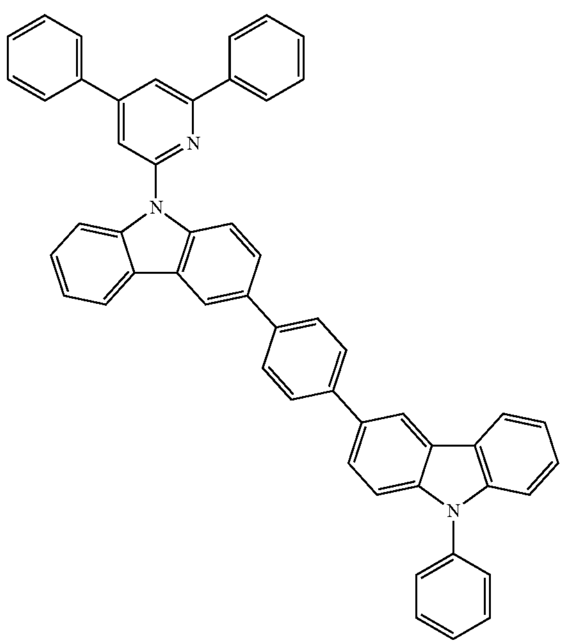
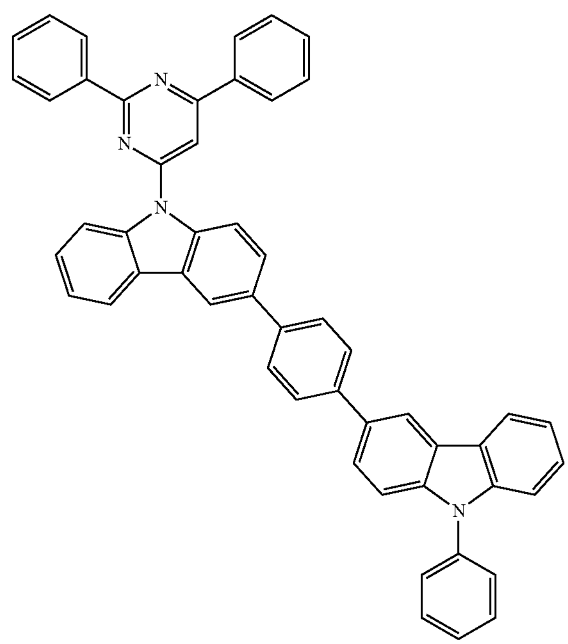

-continued
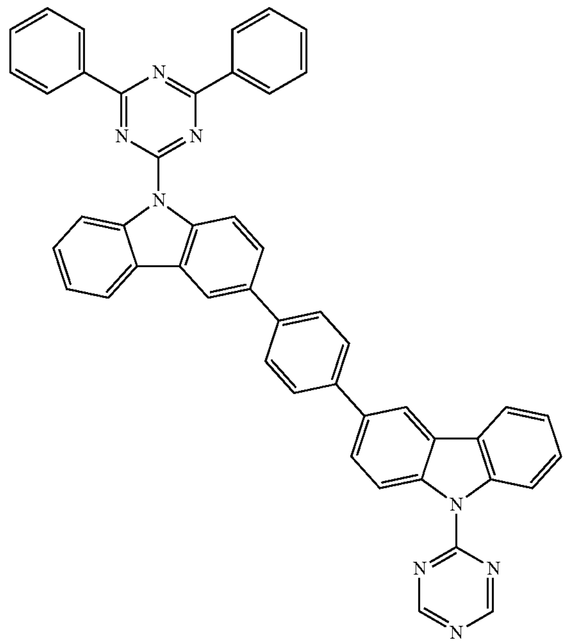
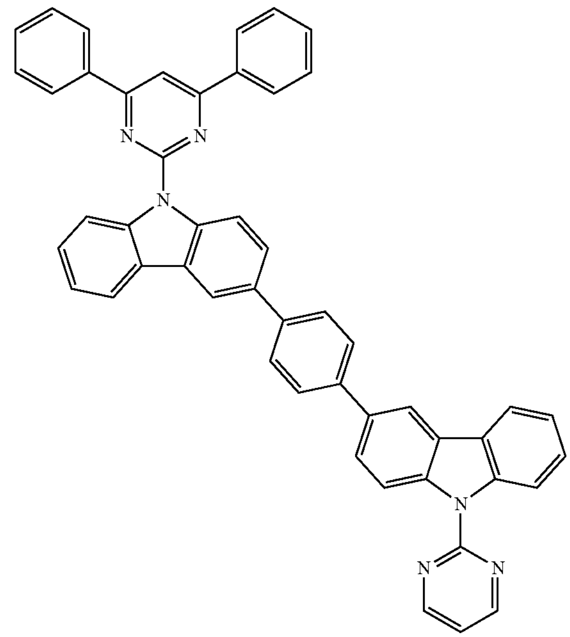
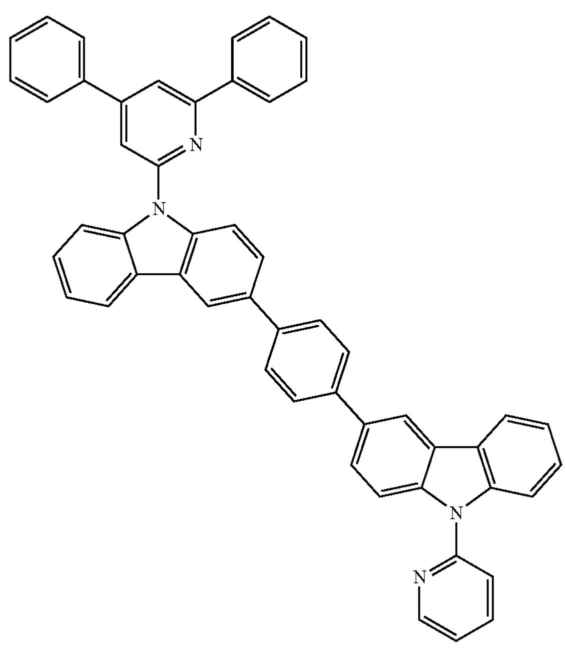
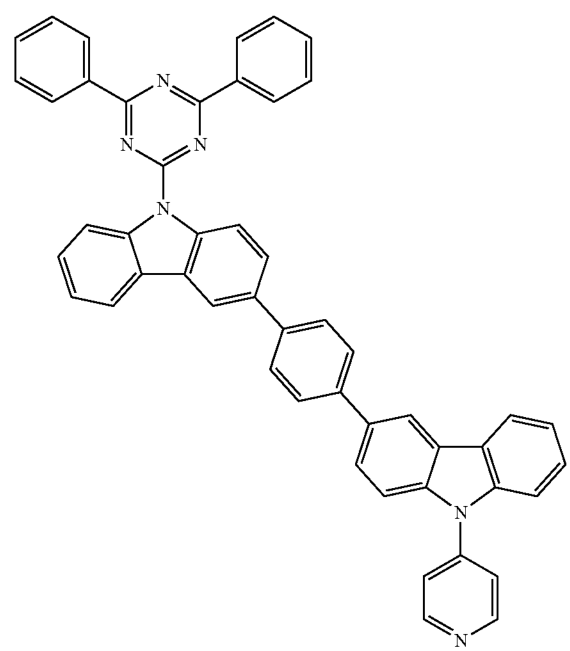

-continued
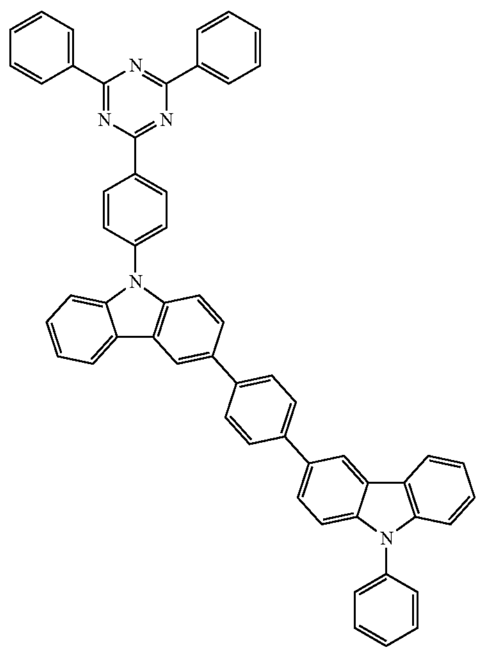
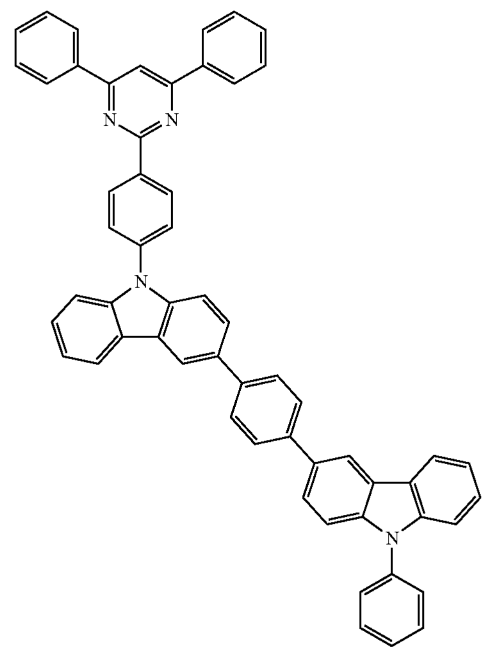
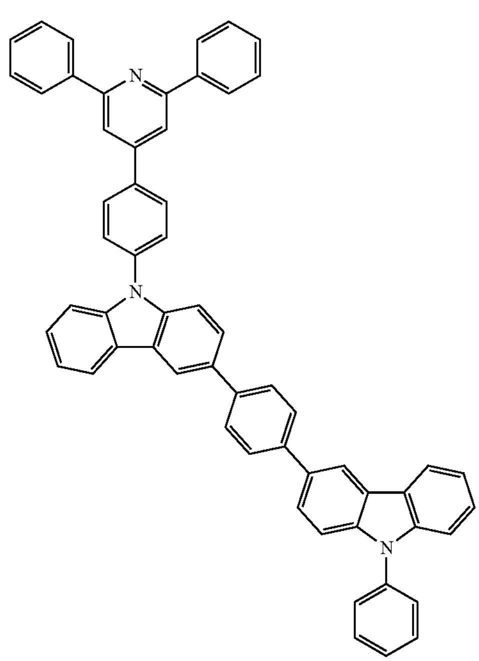
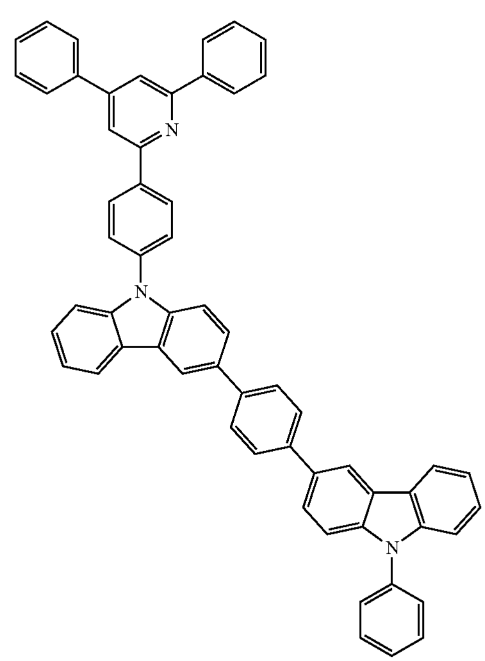

-continued
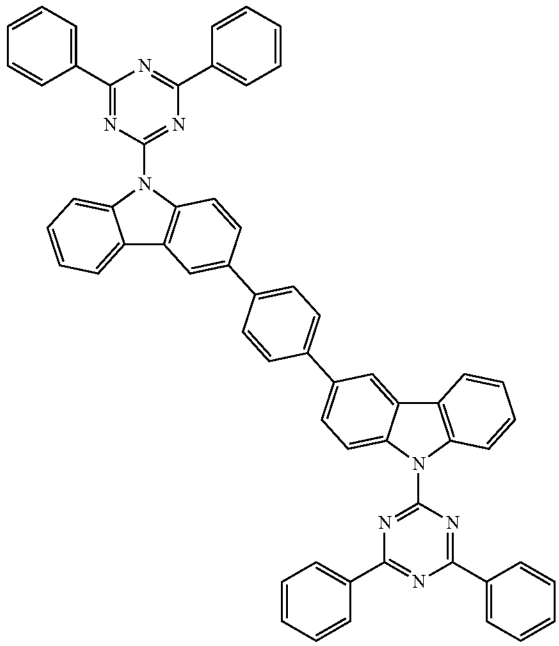
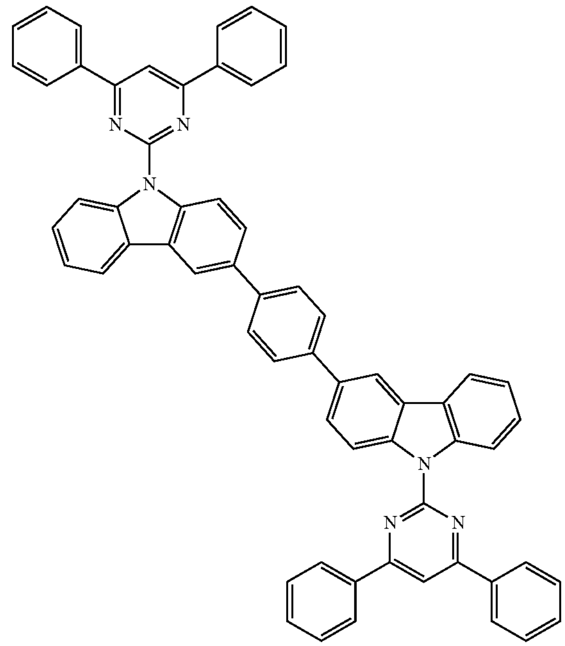
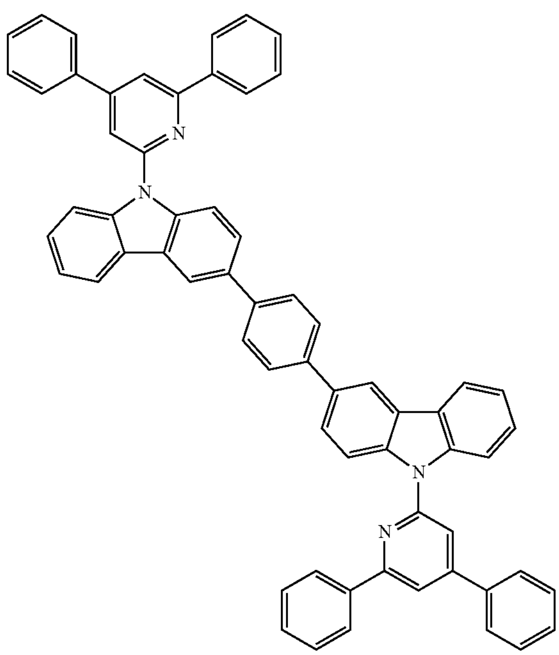
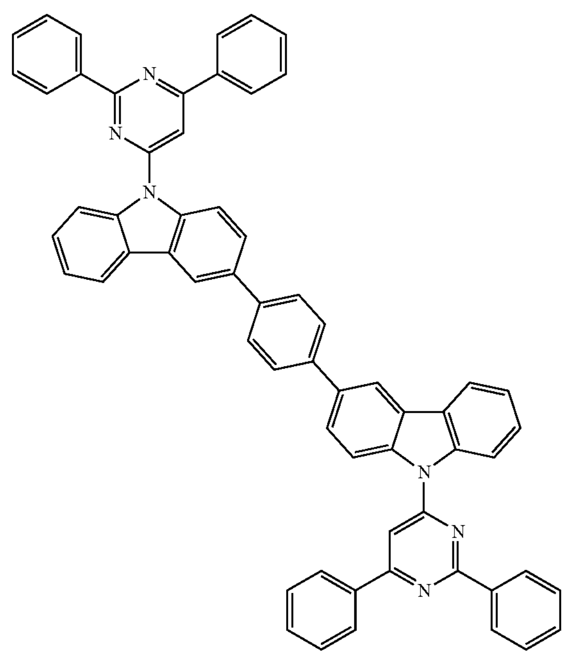

-continued
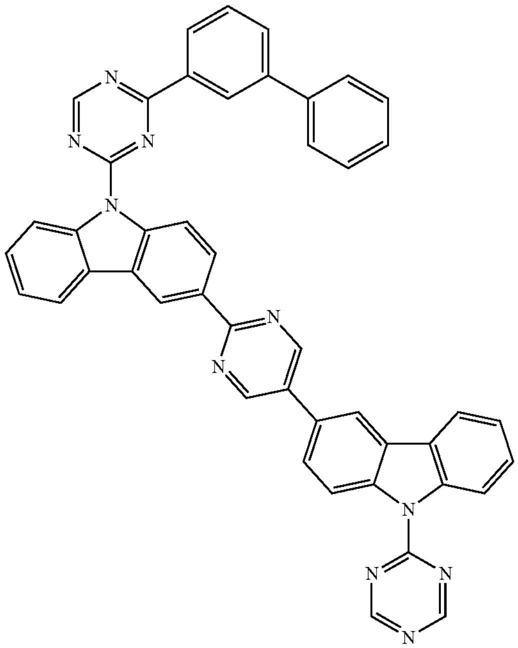
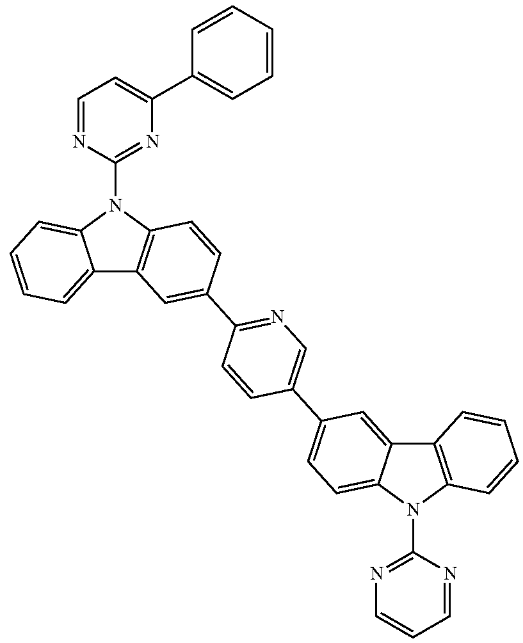
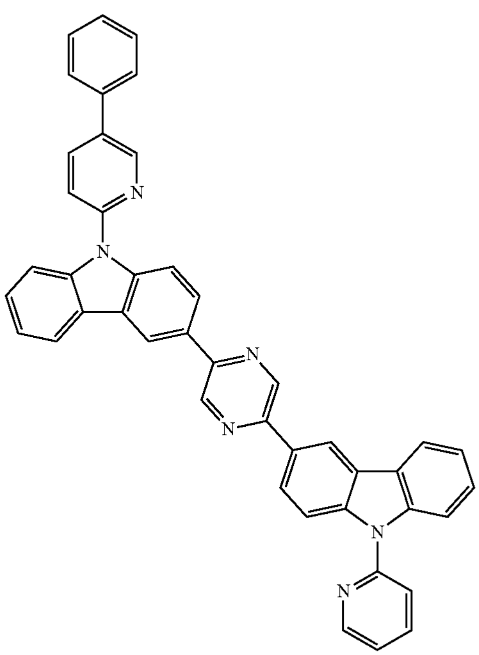
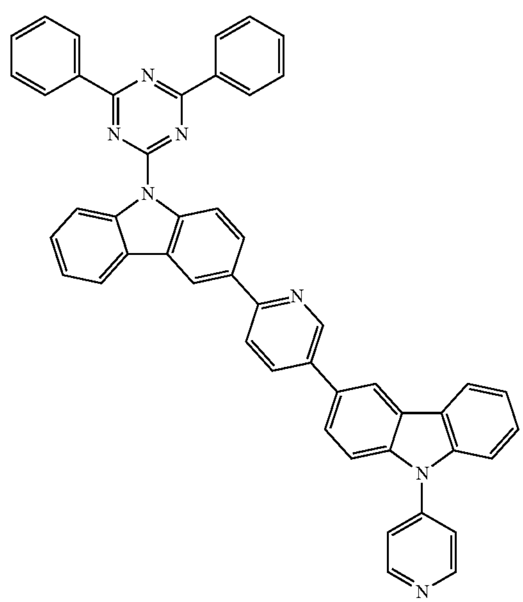

-continued
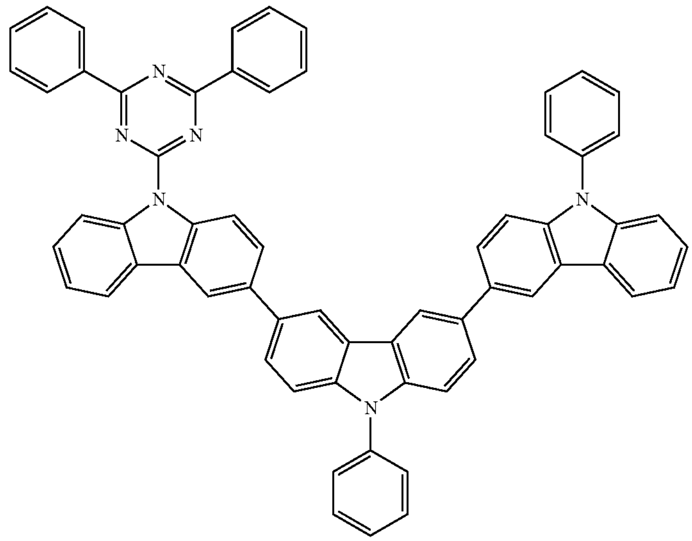
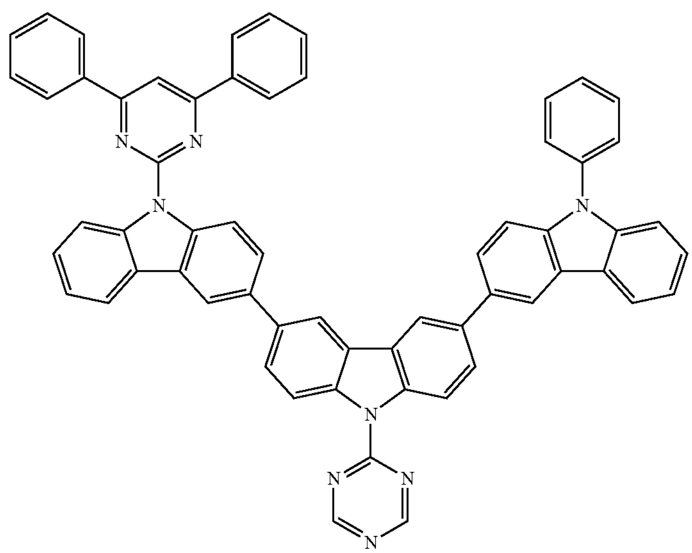
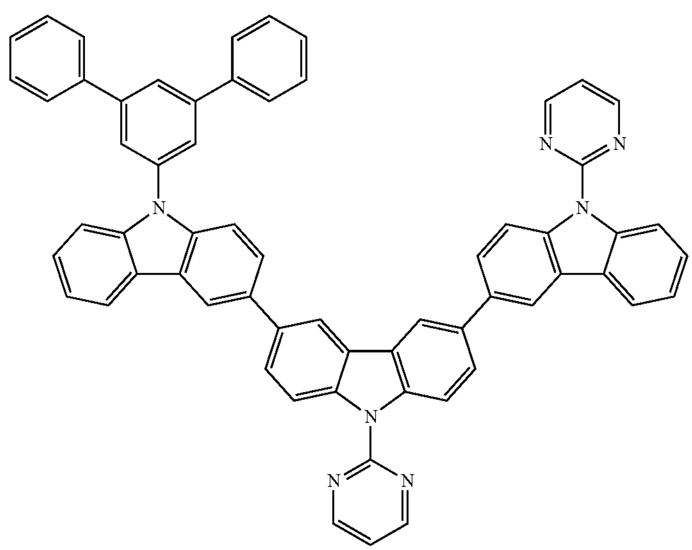

-continued
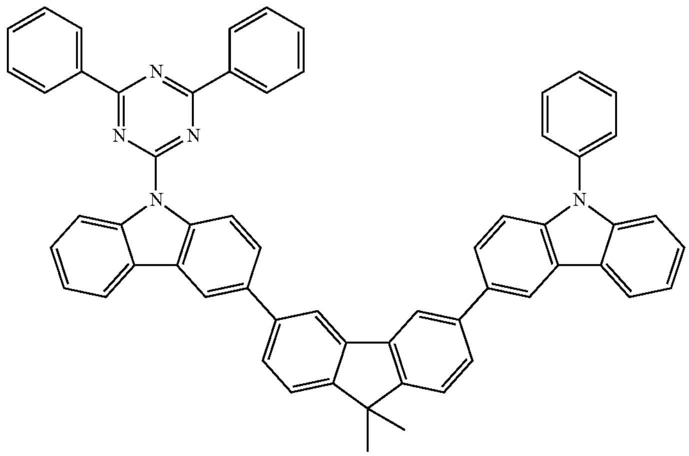
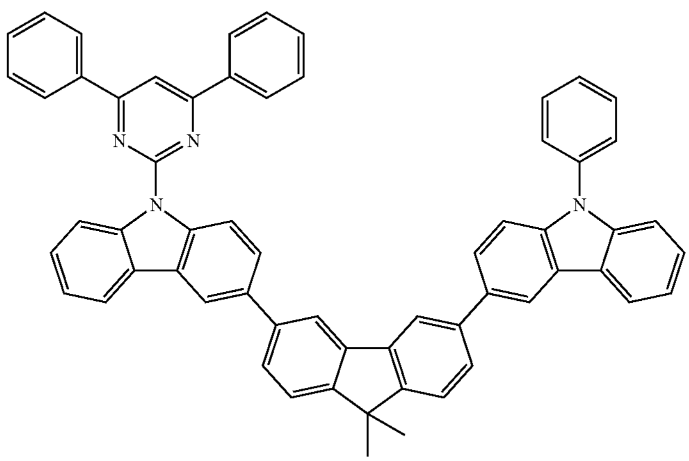
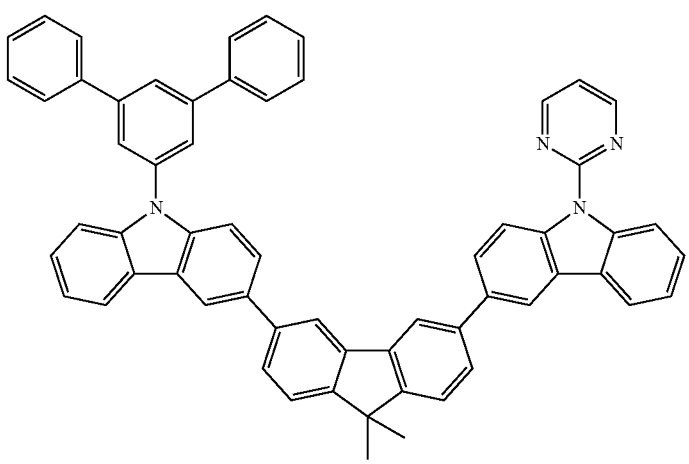

-continued
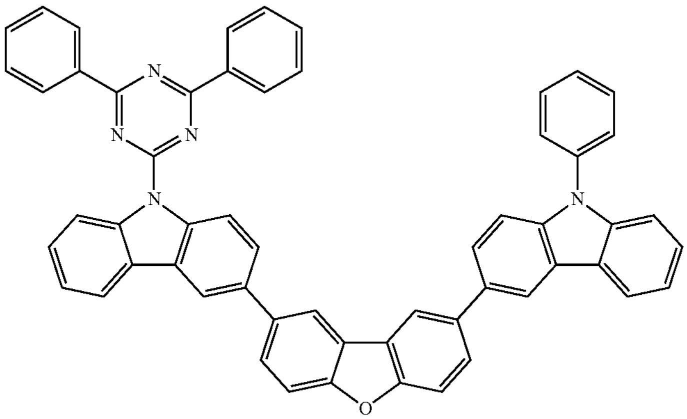
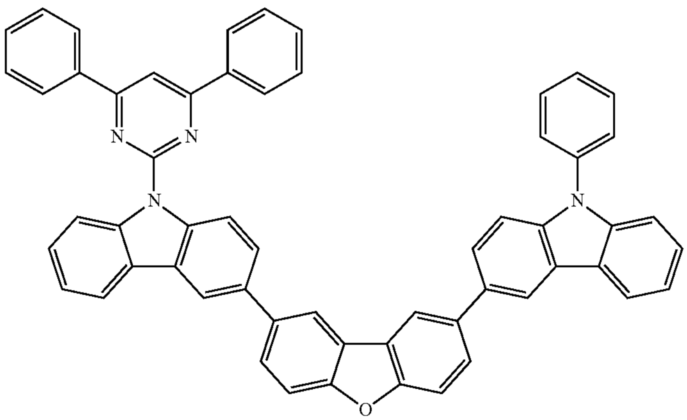
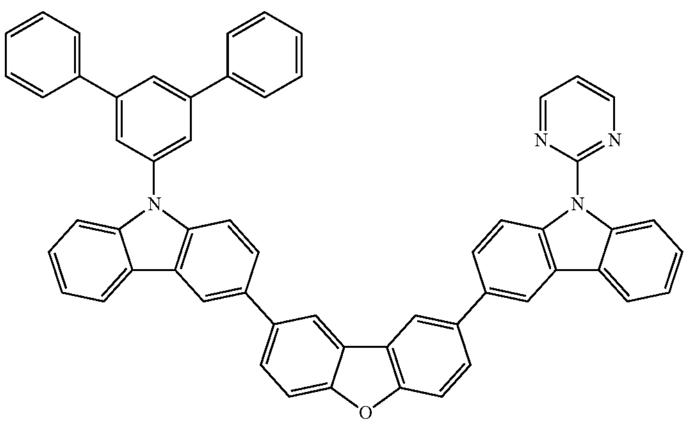
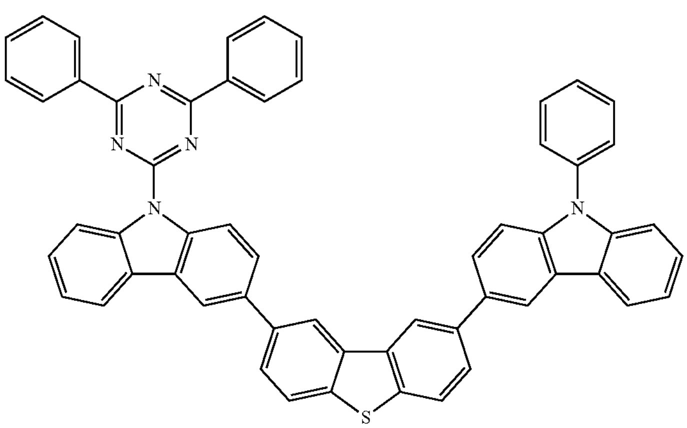

-continued
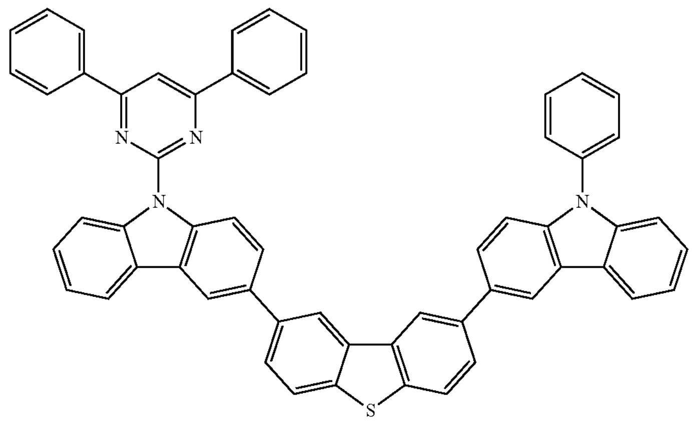
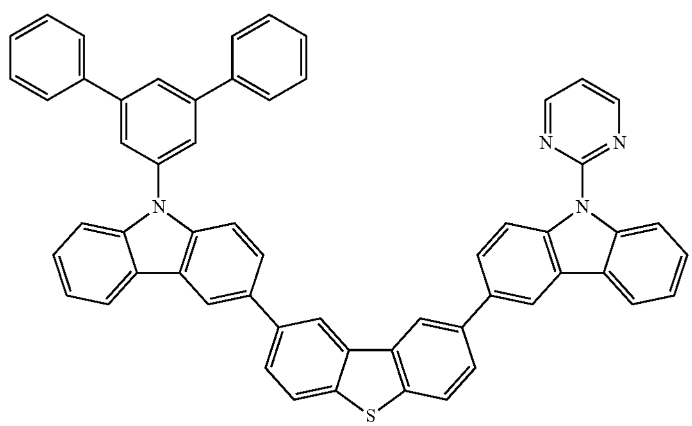
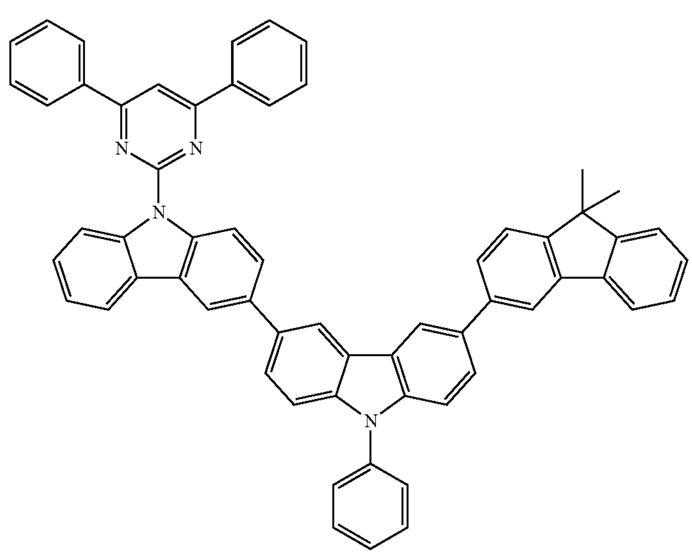

-continued
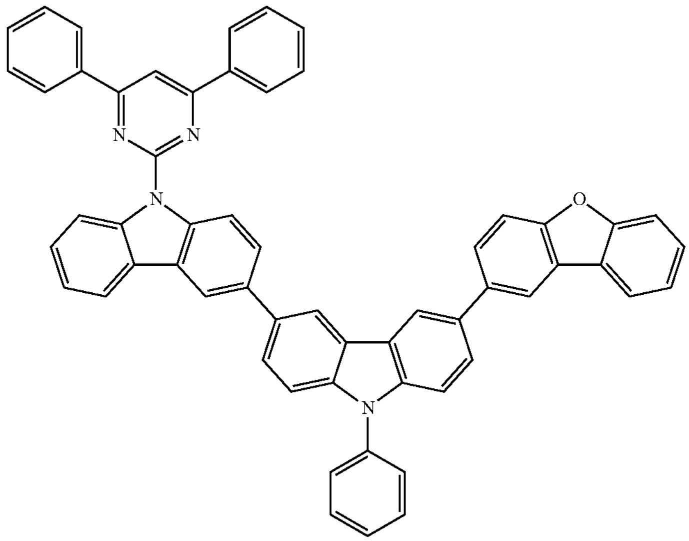
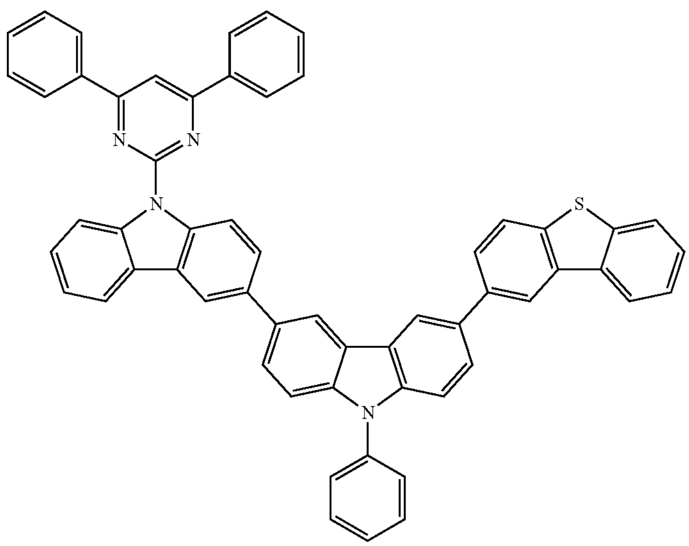
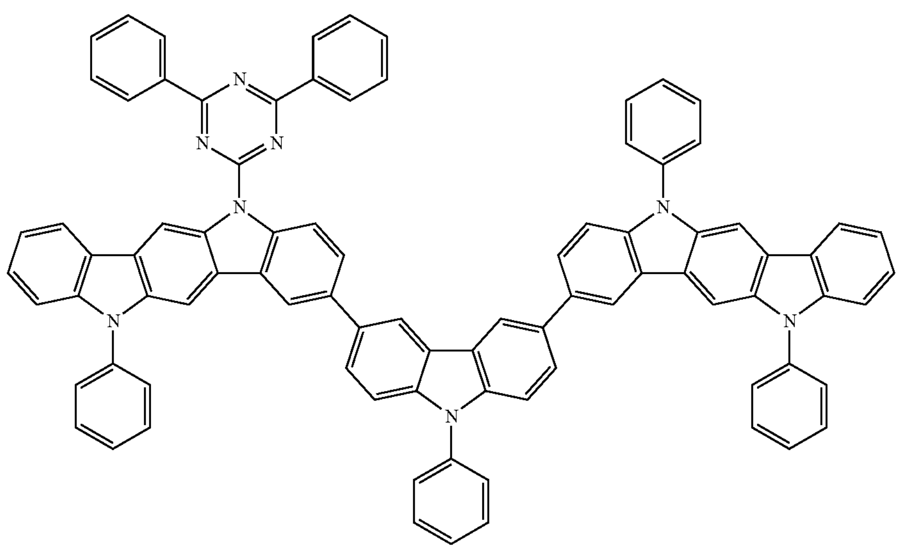

-continued
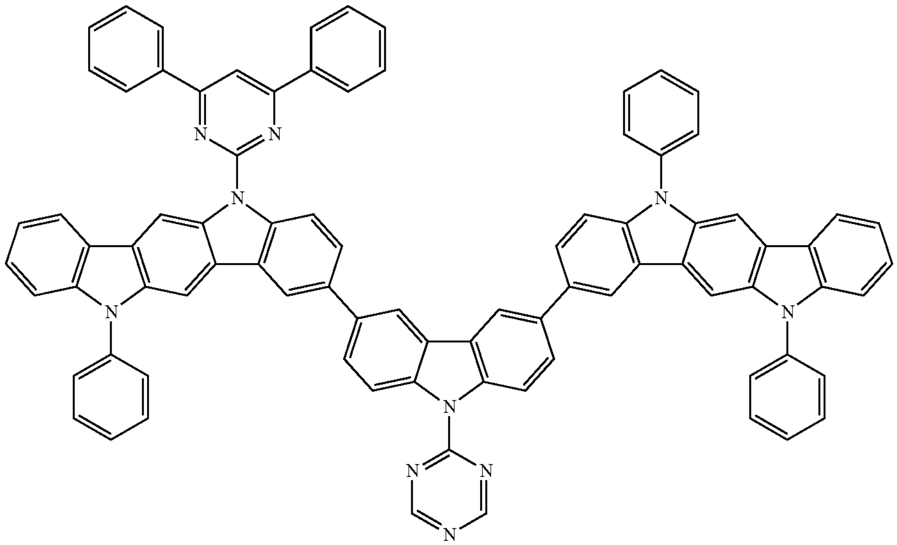
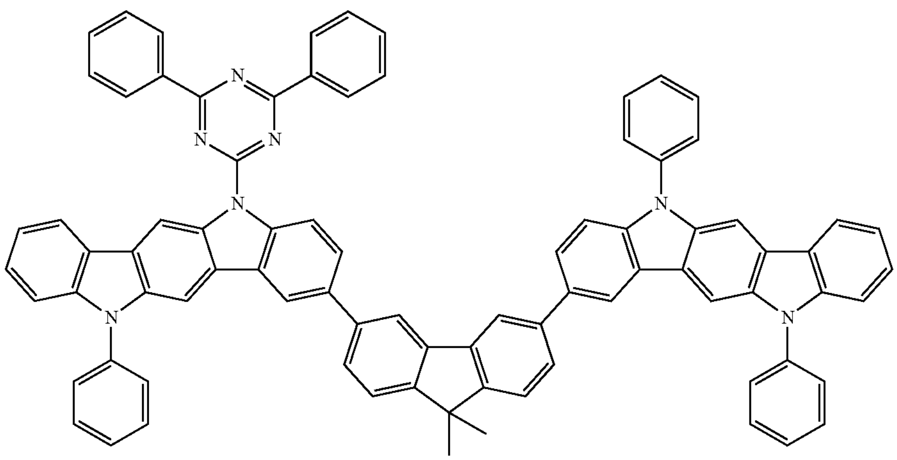
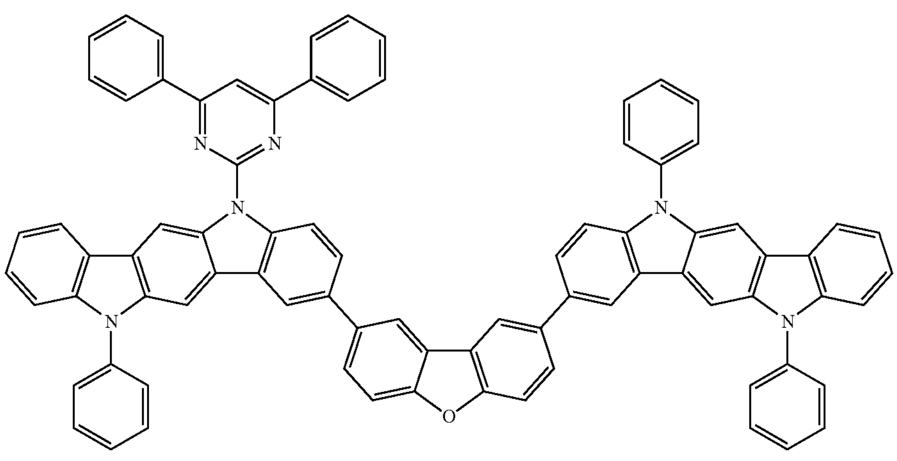

-continued
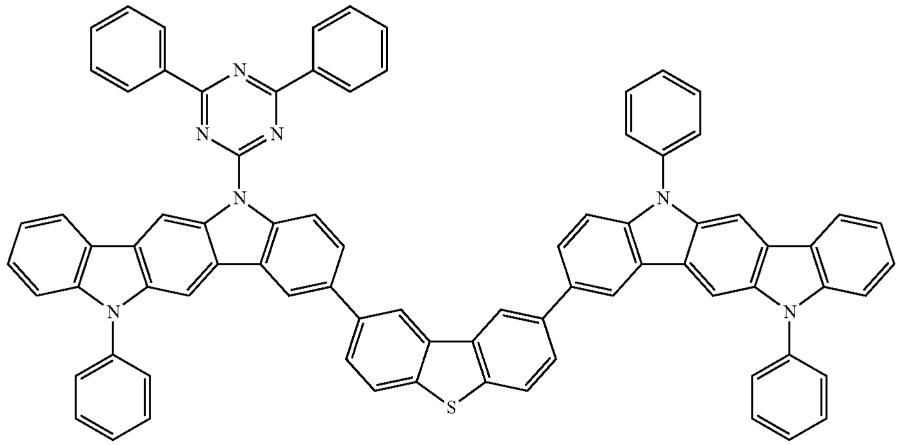
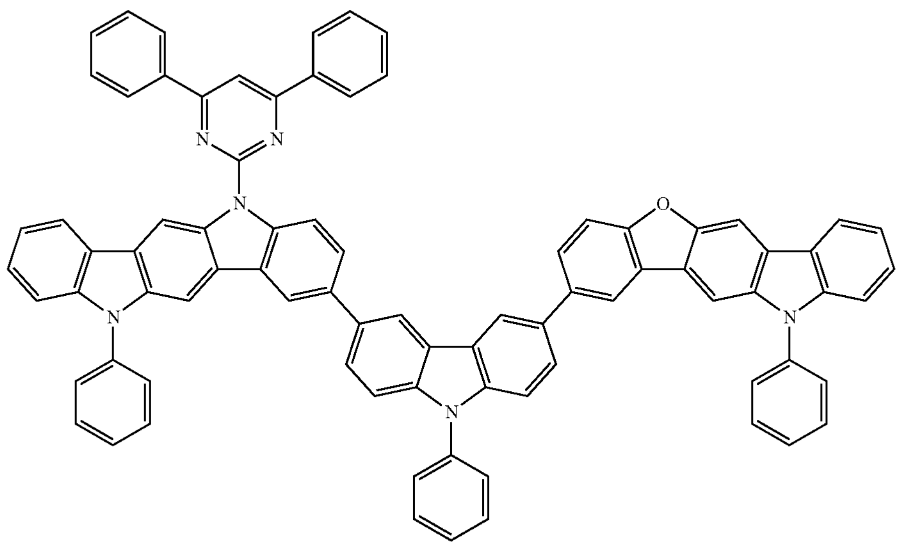
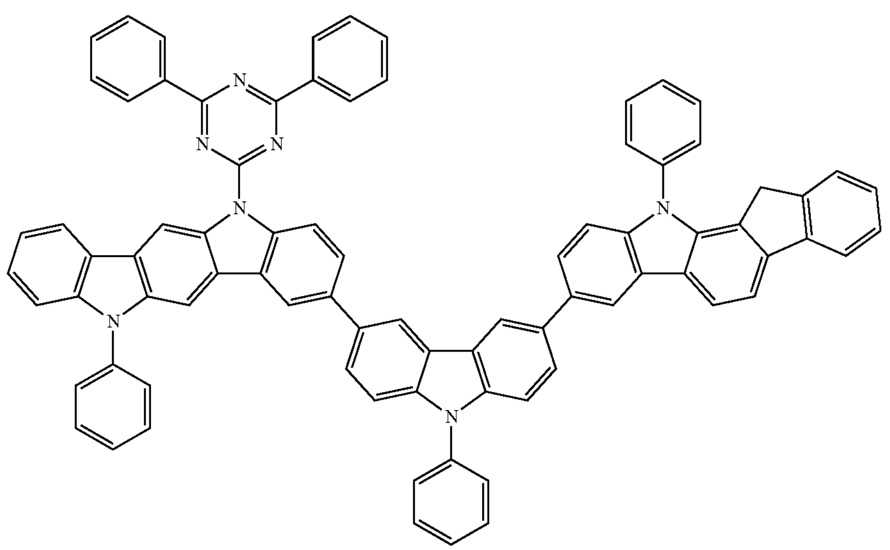

-continued
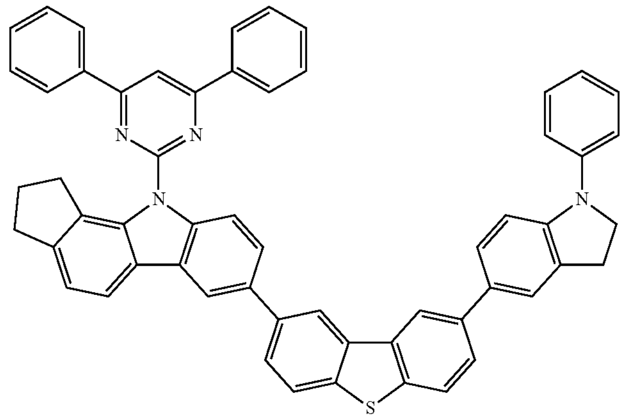
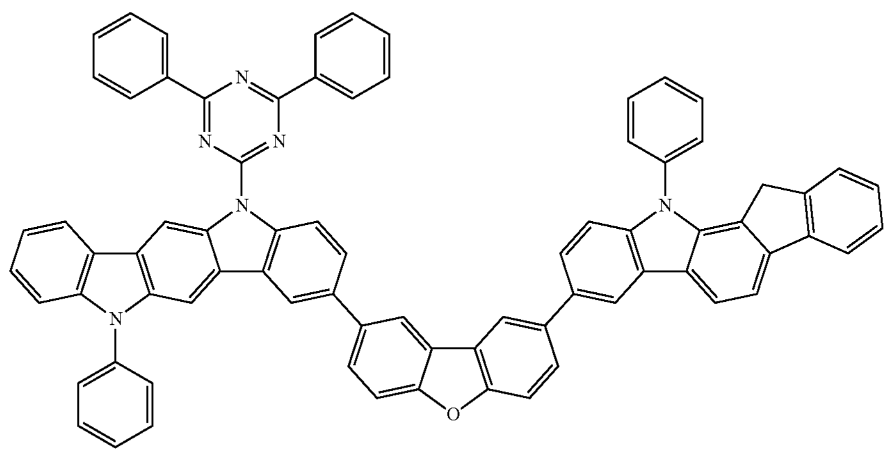
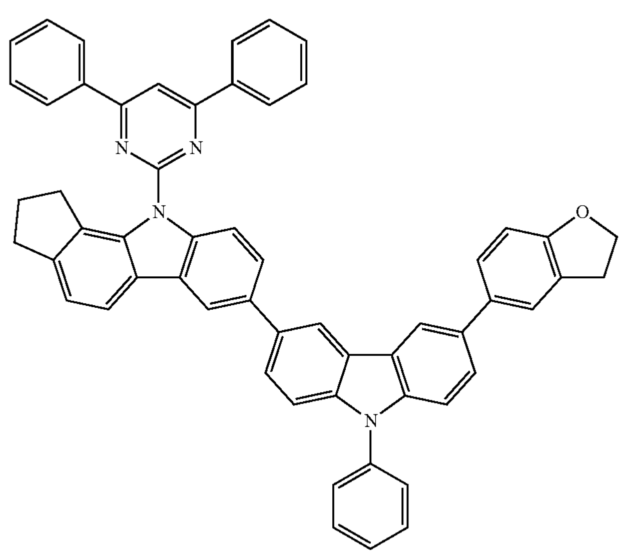

-continued
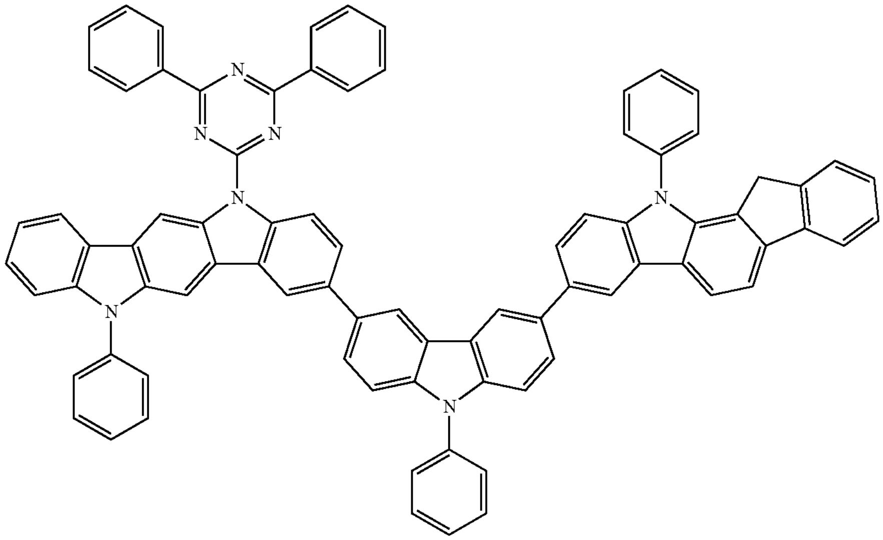
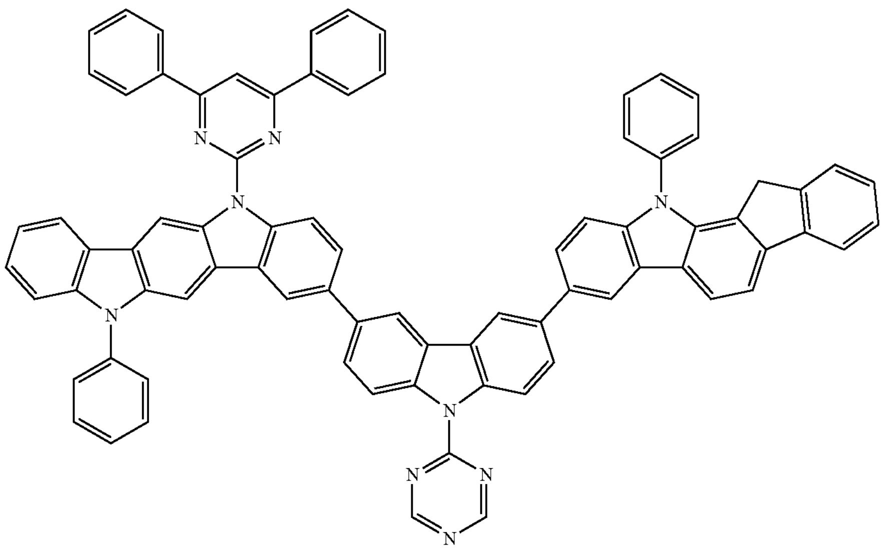
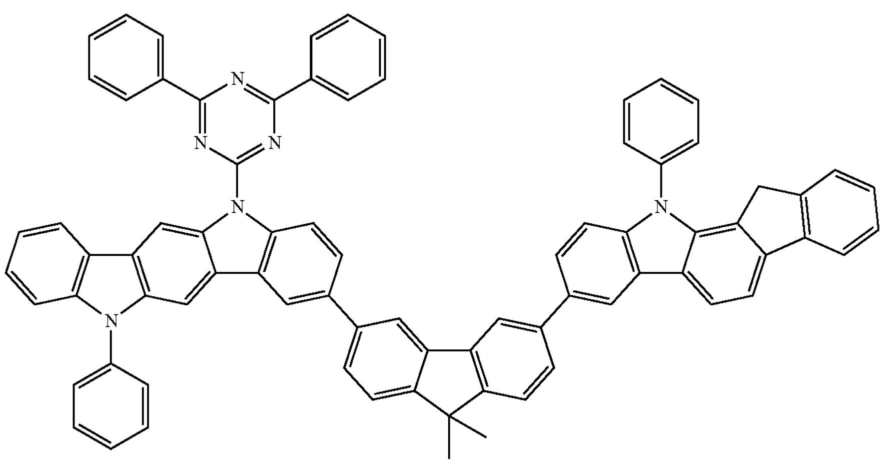

-continued
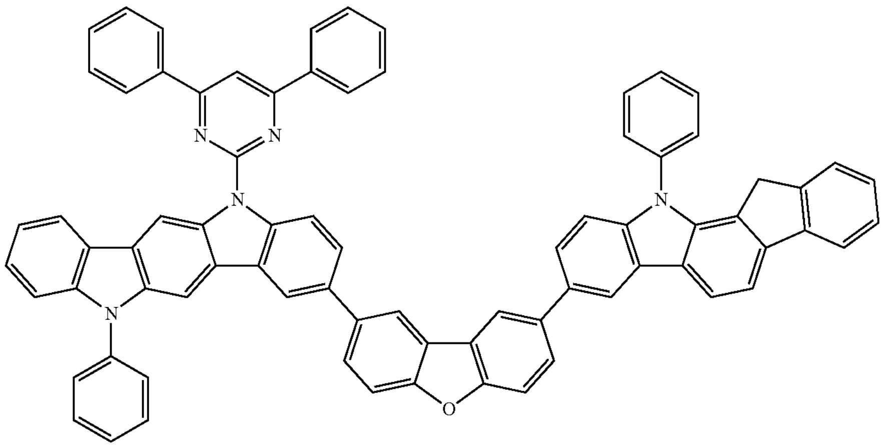
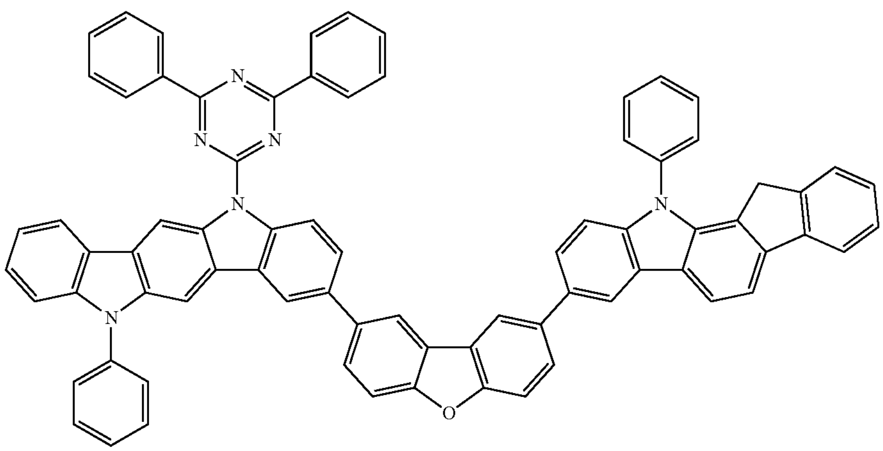
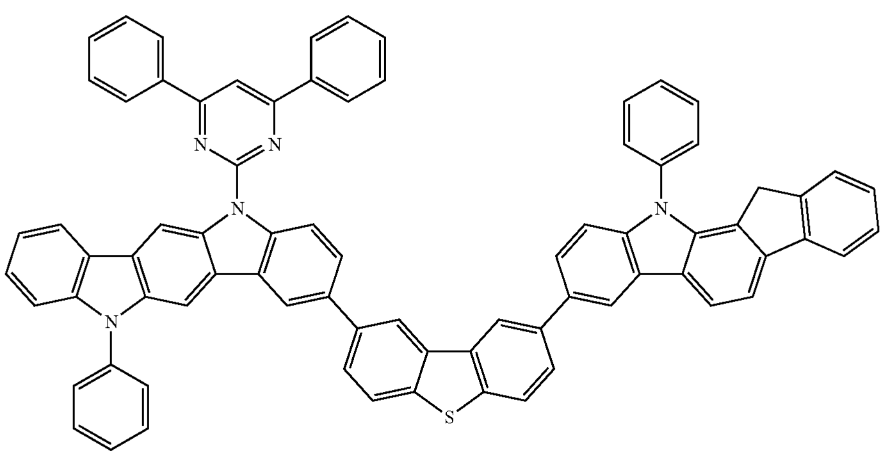

-continued
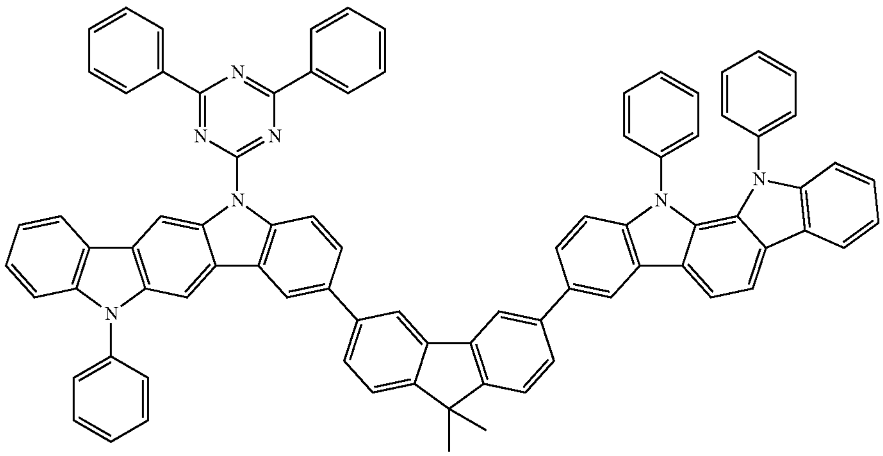
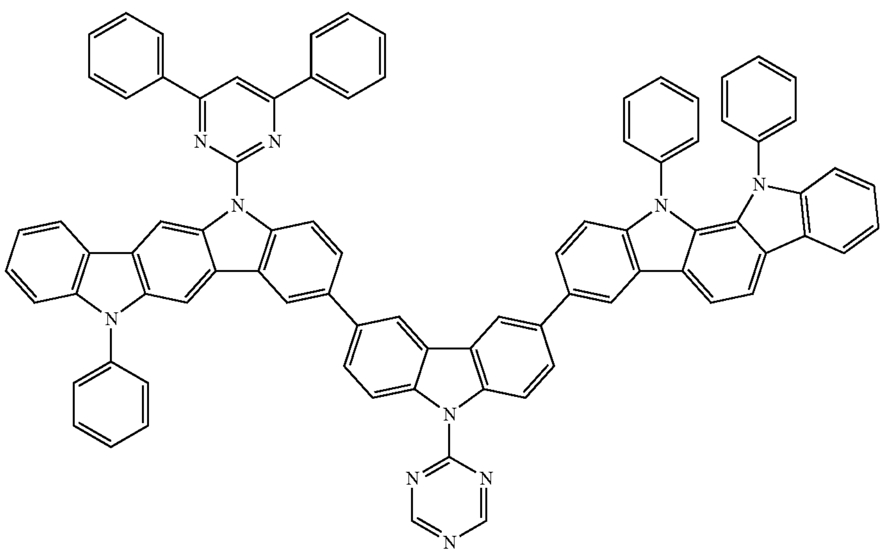
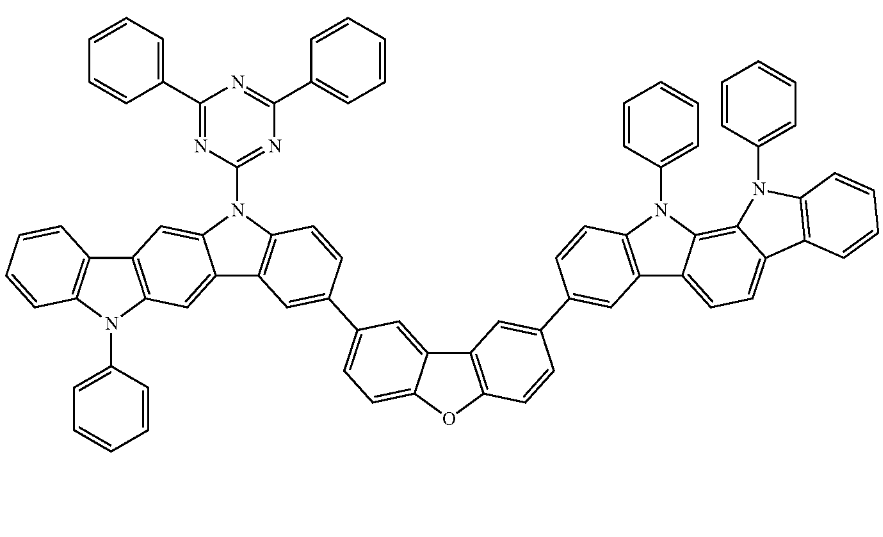

-continued
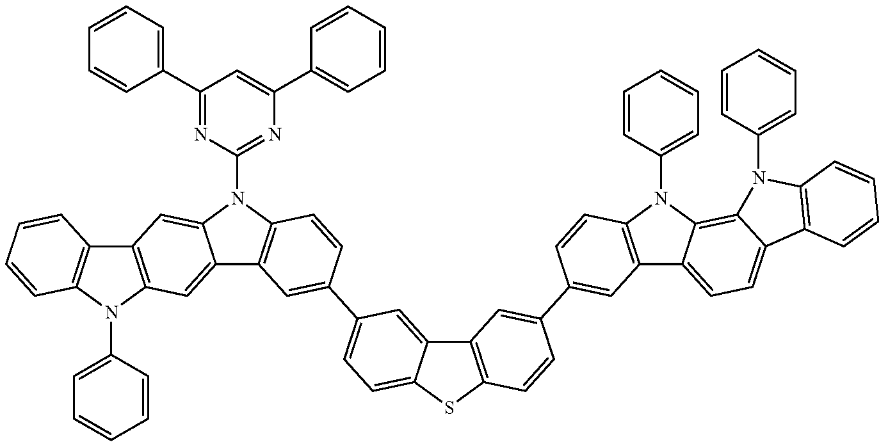
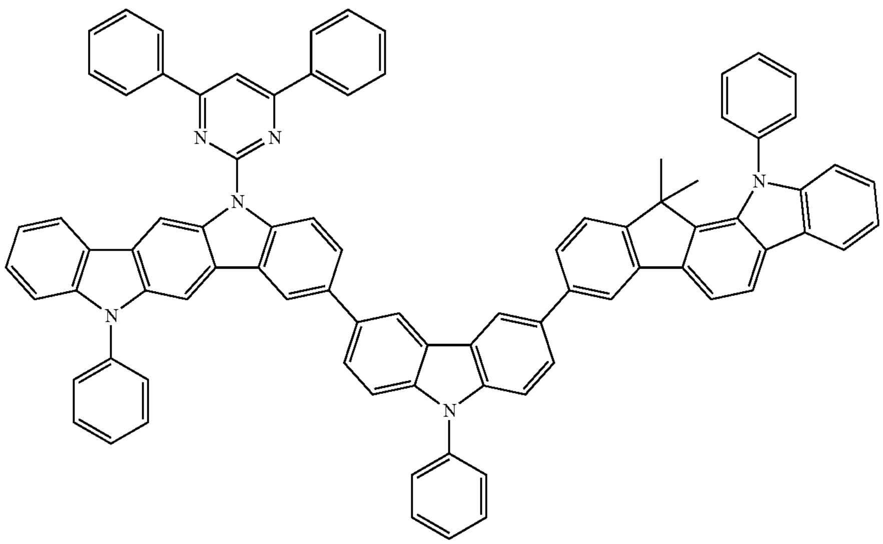
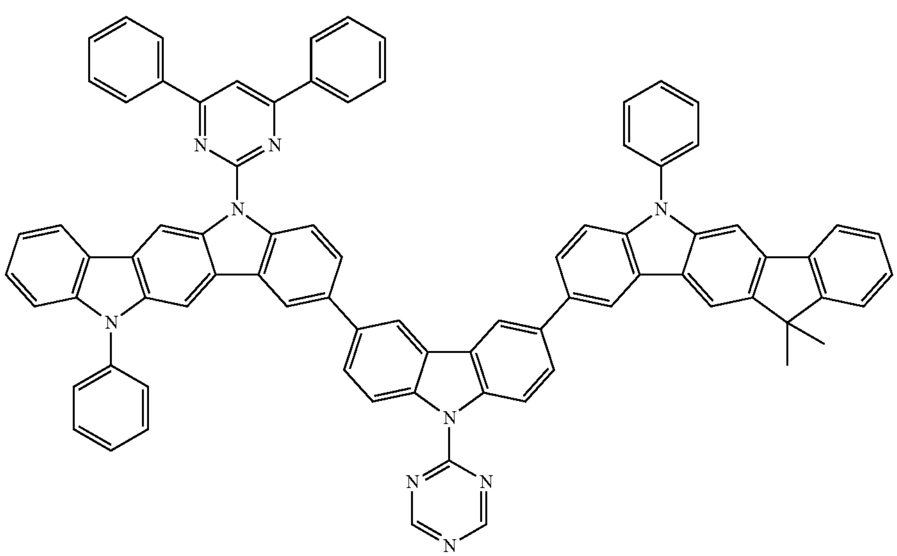

-continued
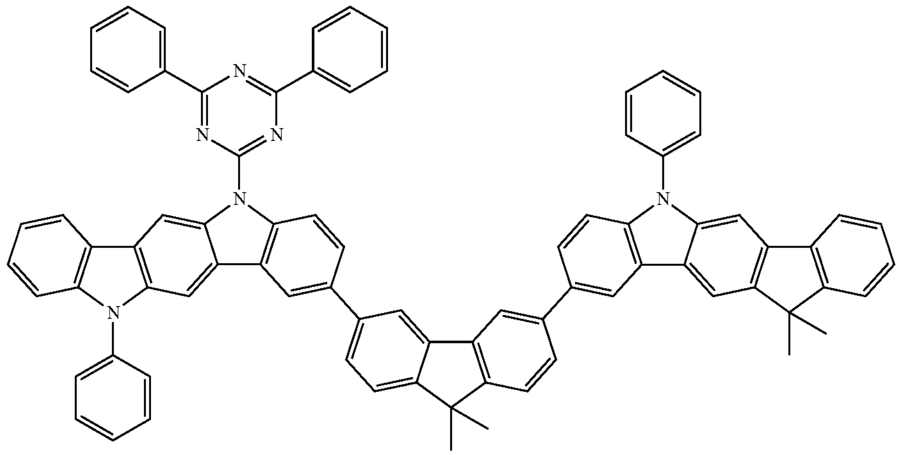
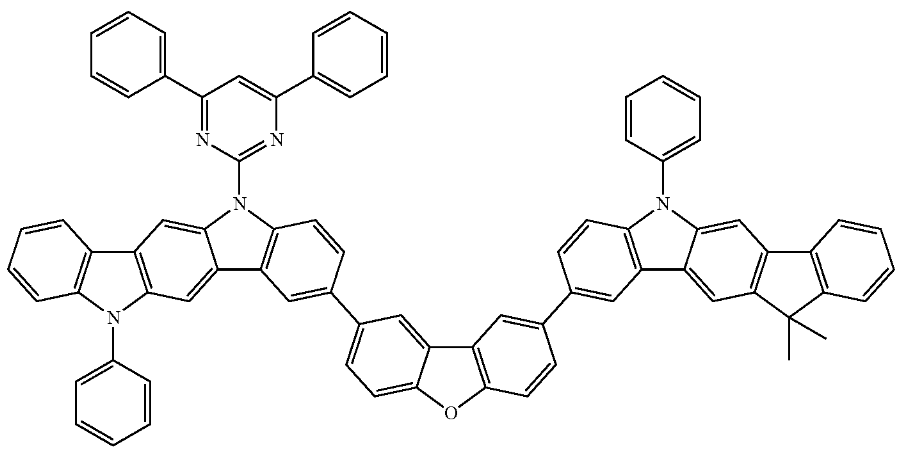
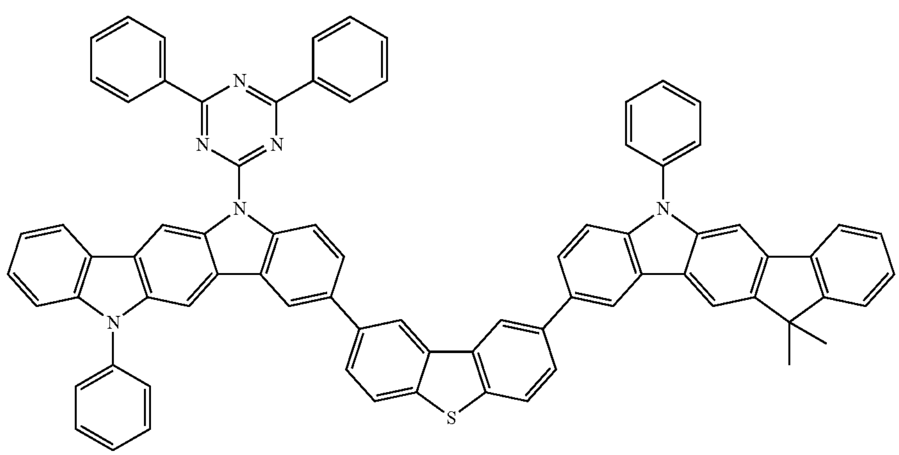

-continued
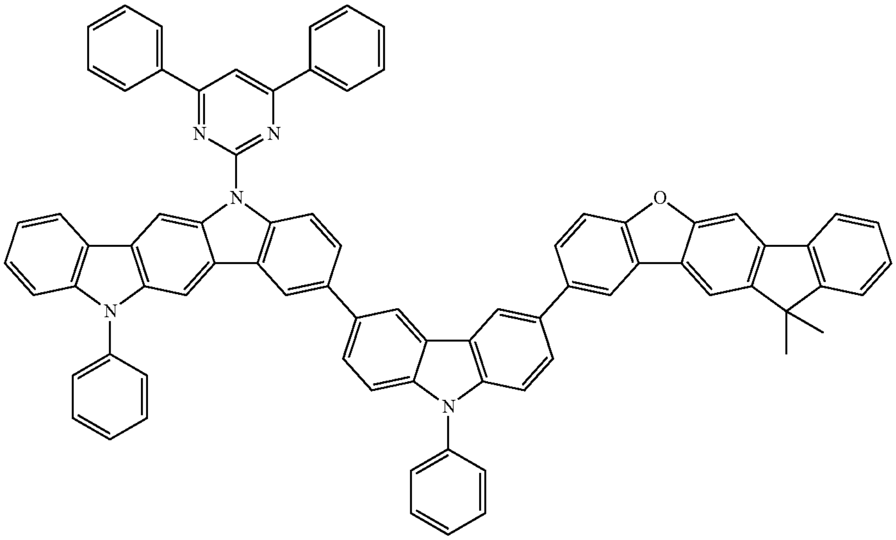
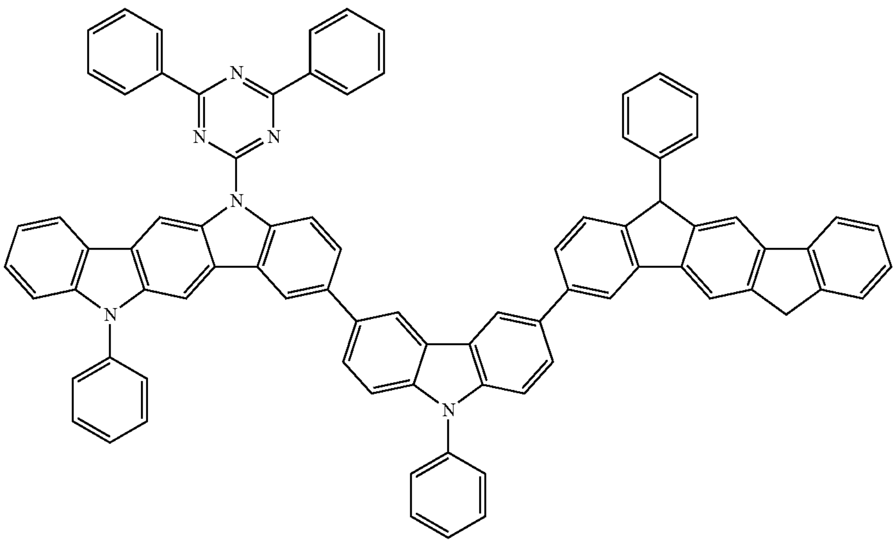
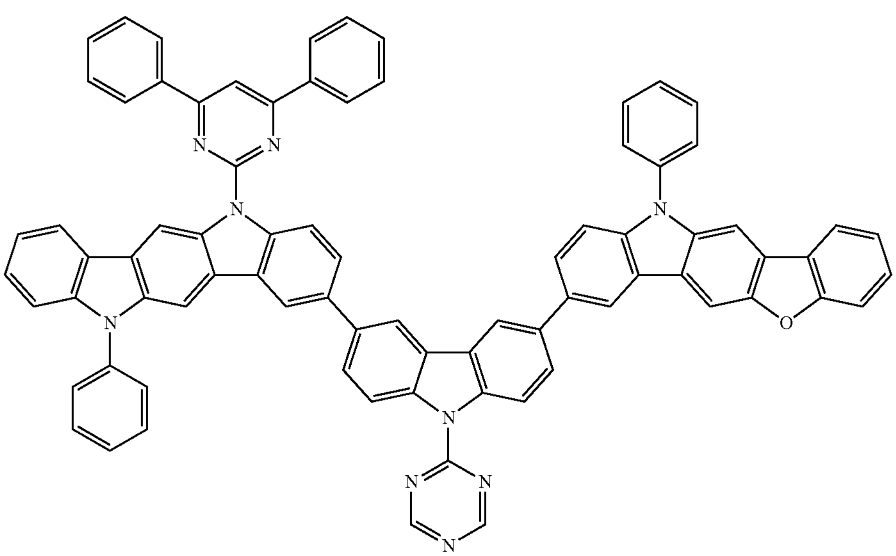

-continued
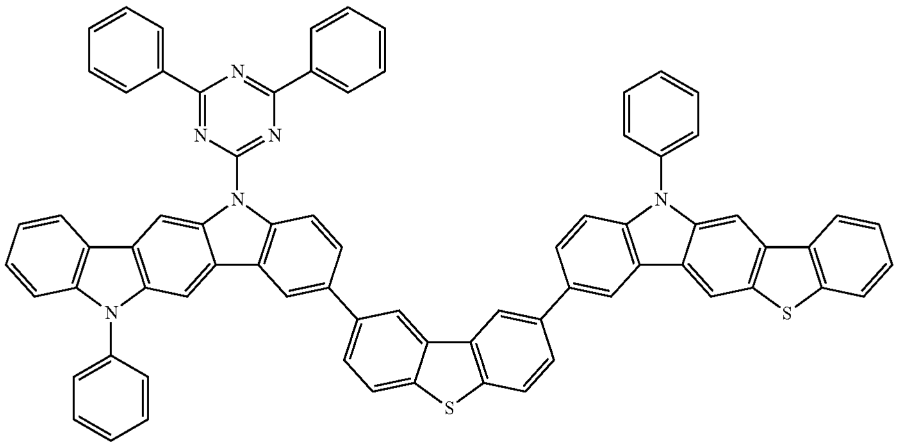
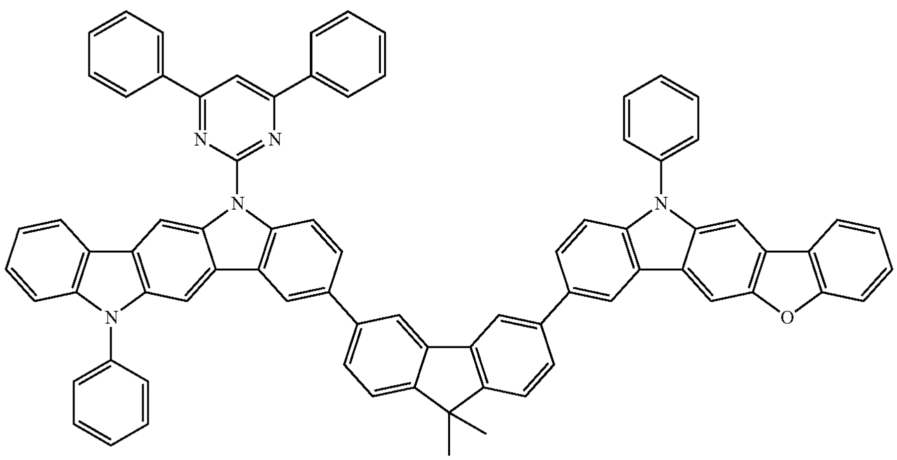
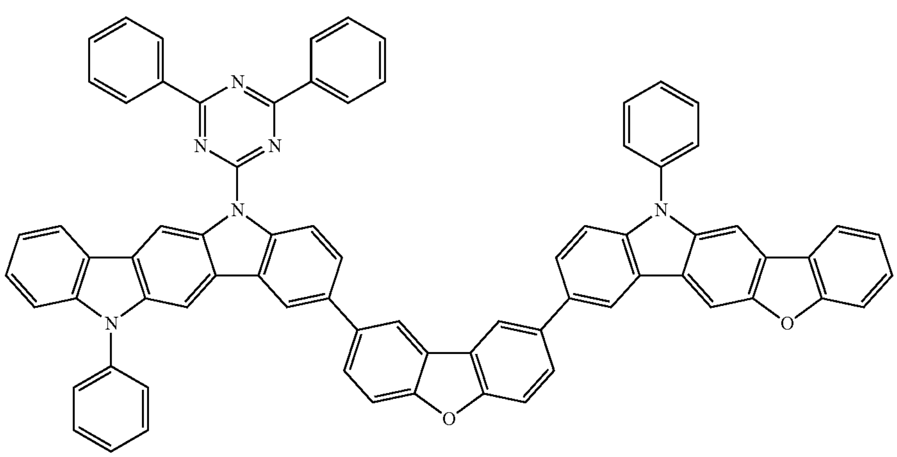

-continued
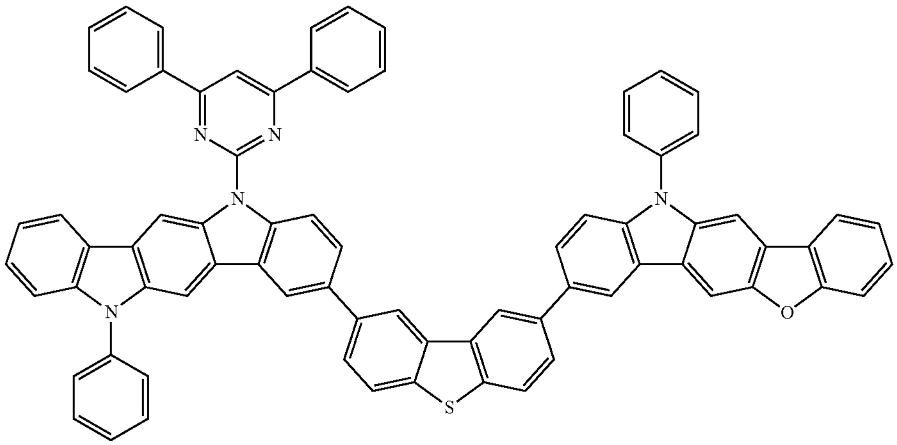
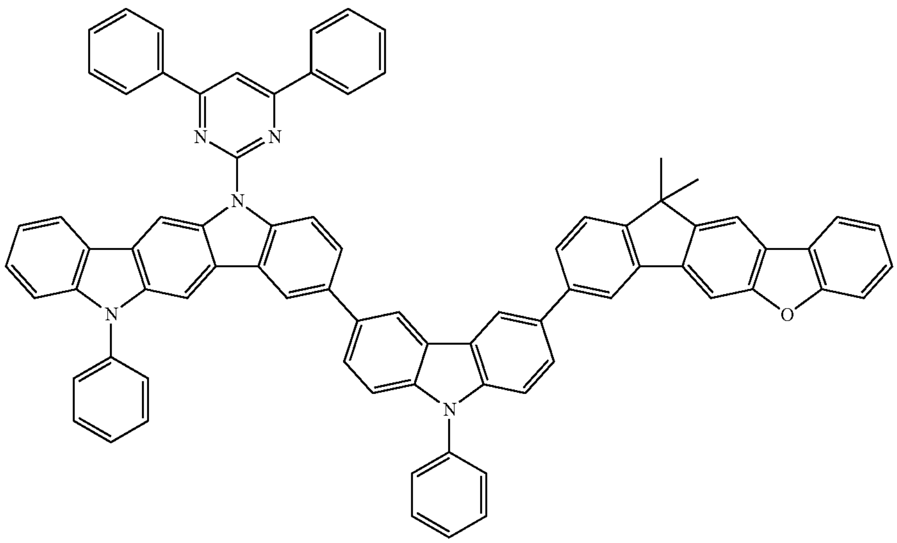
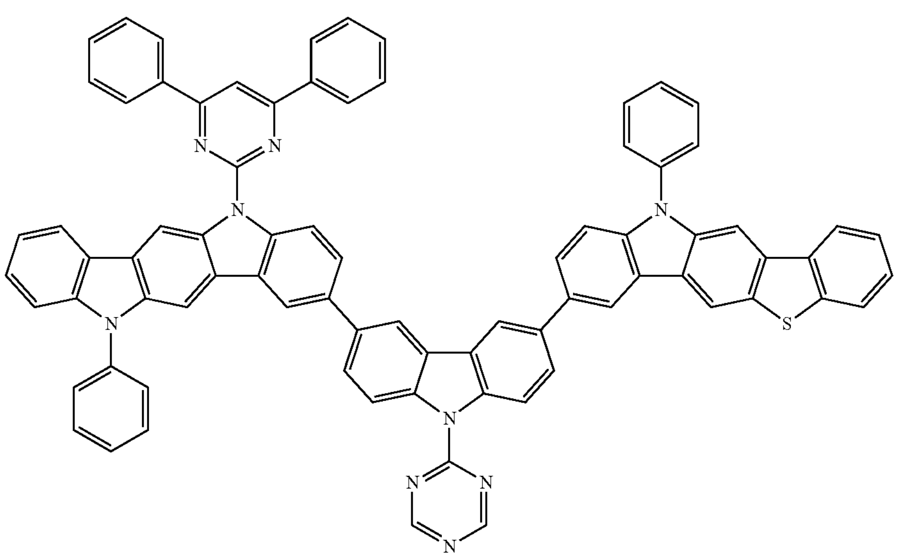

-continued
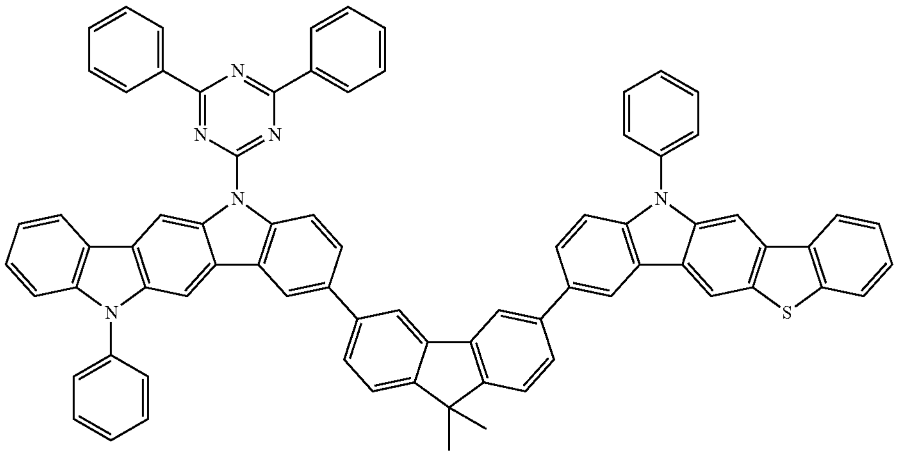
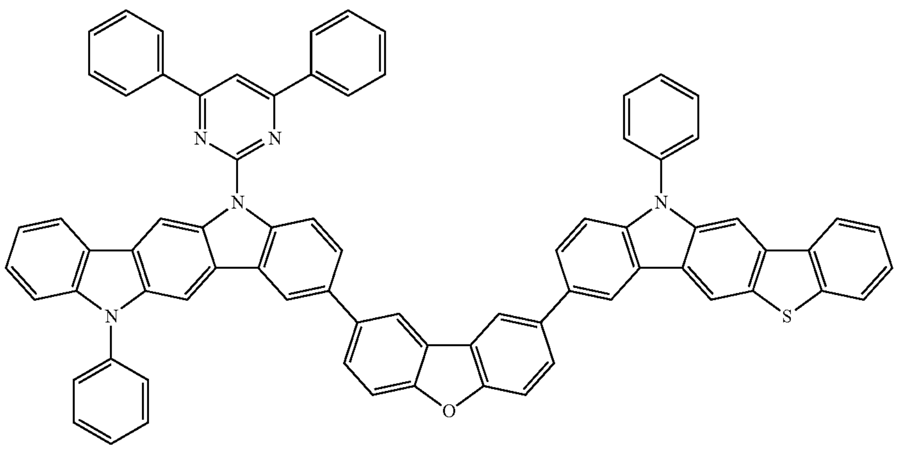
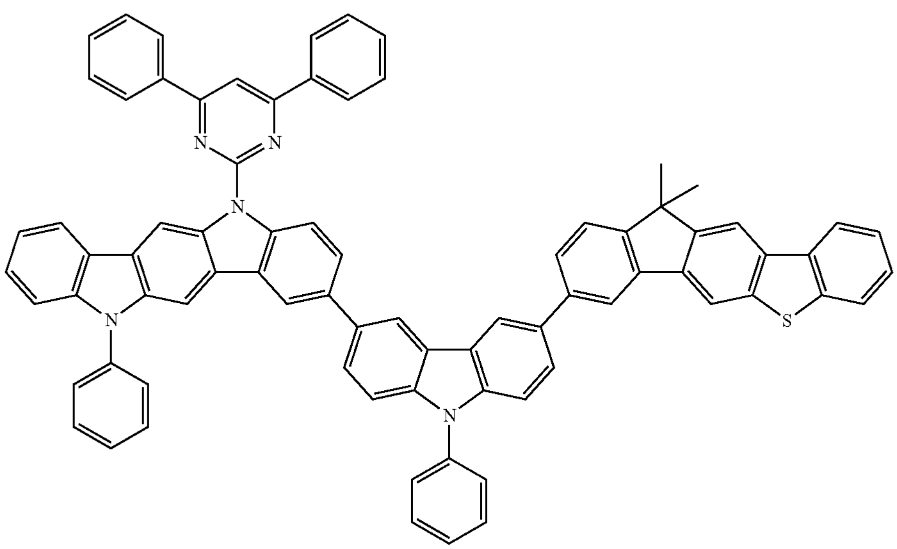

-continued
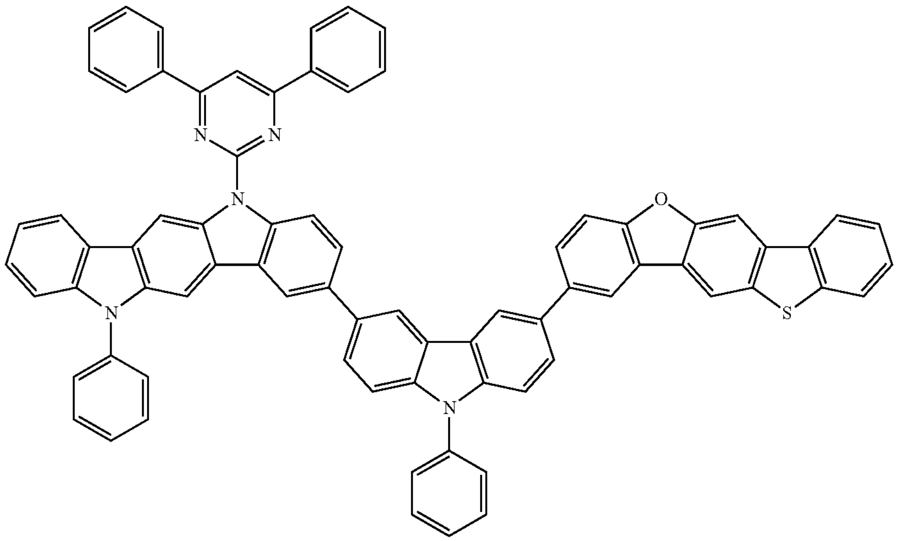
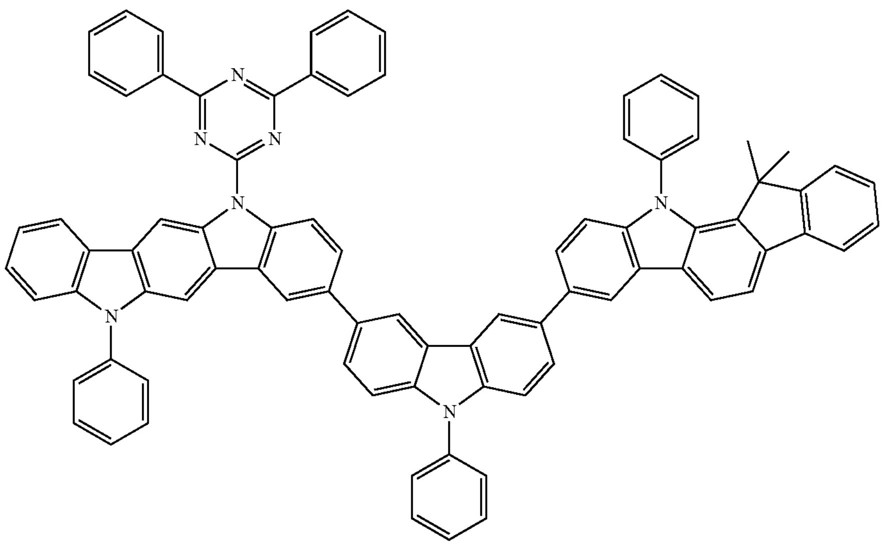
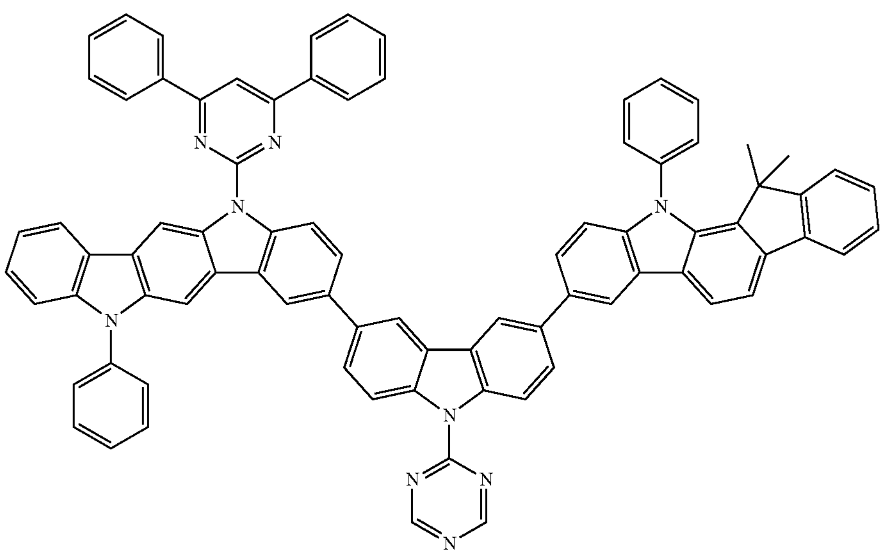

-continued
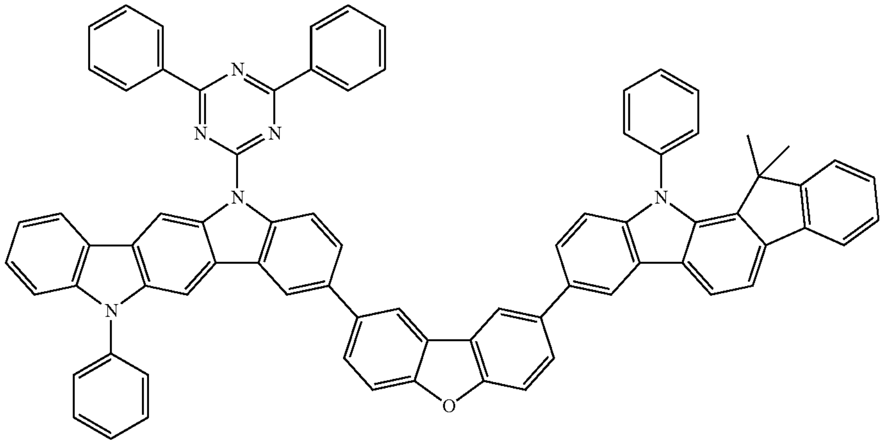
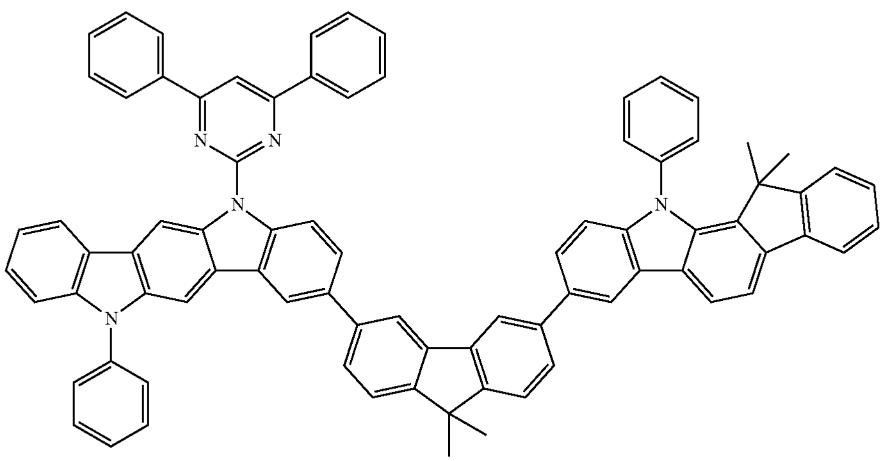
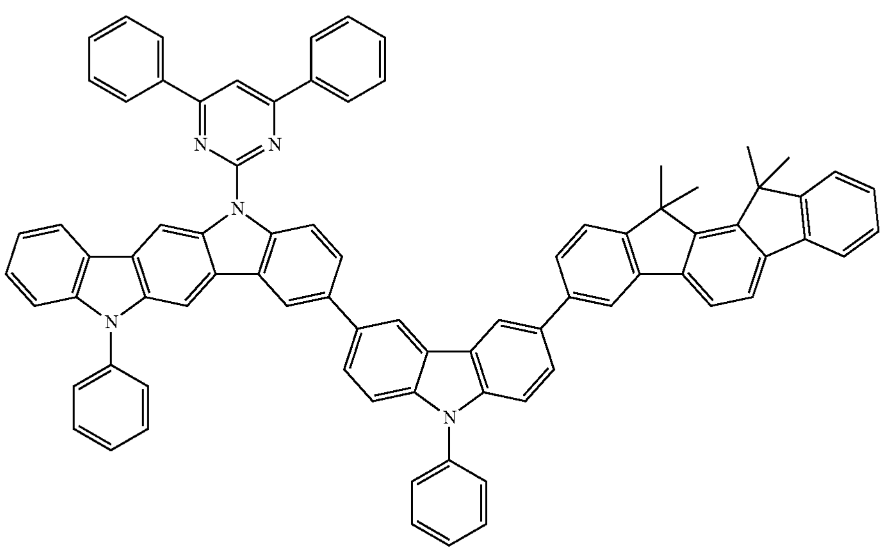

-continued
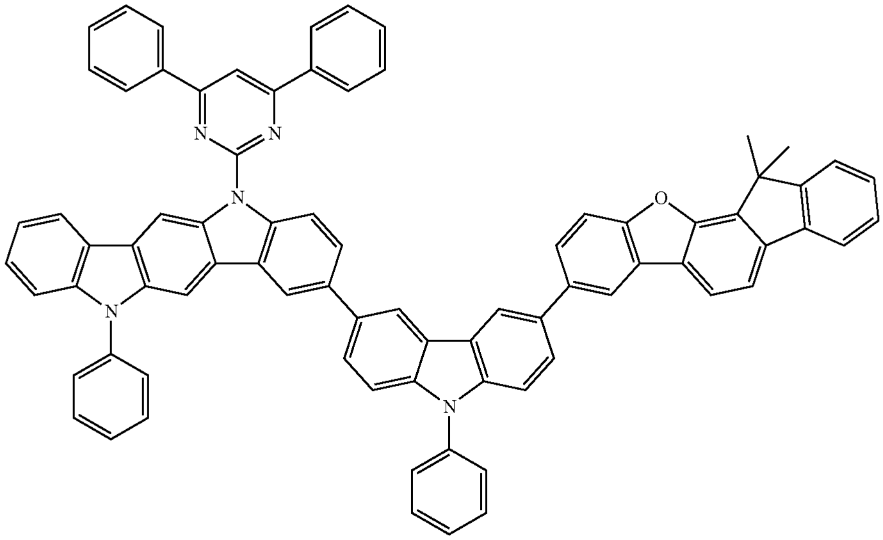
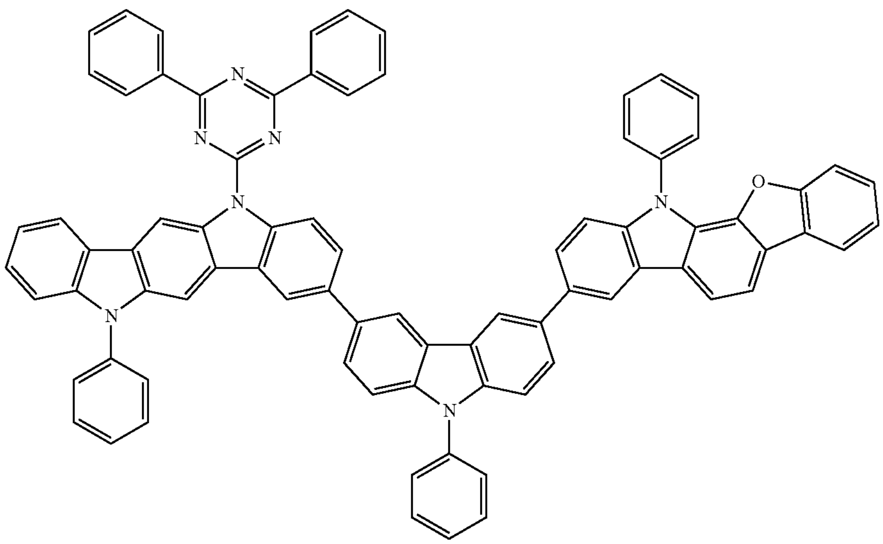
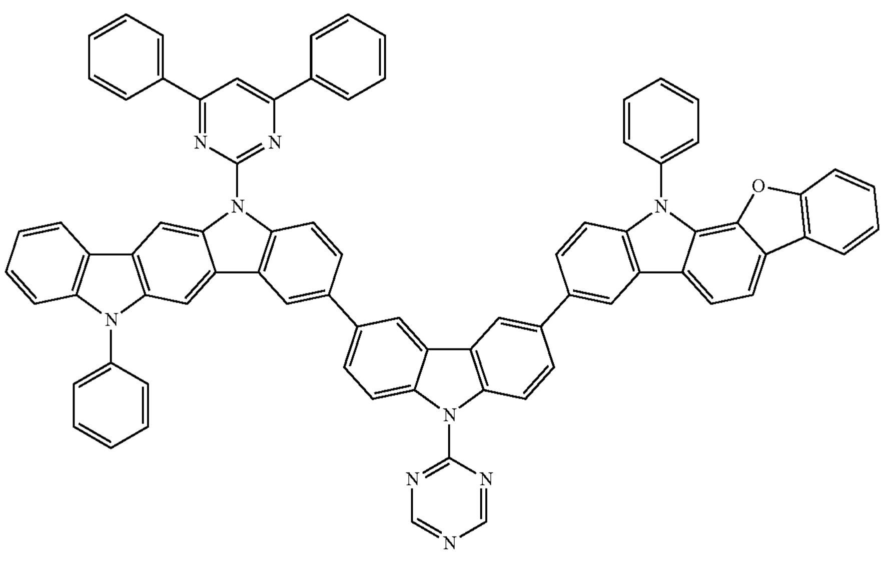

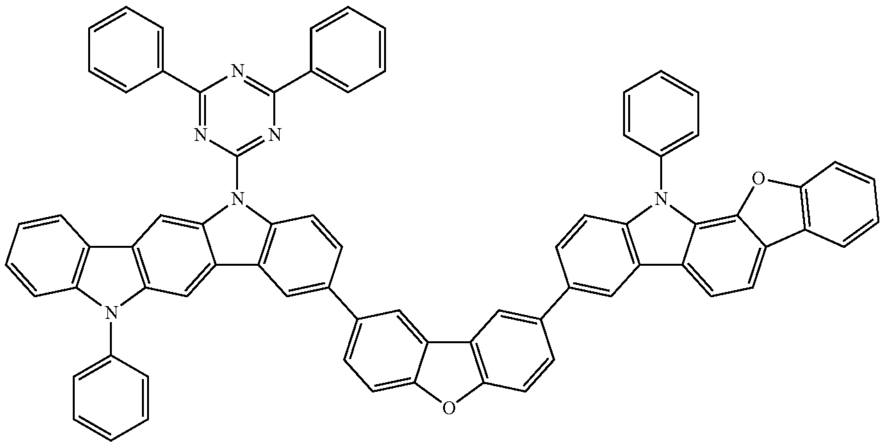
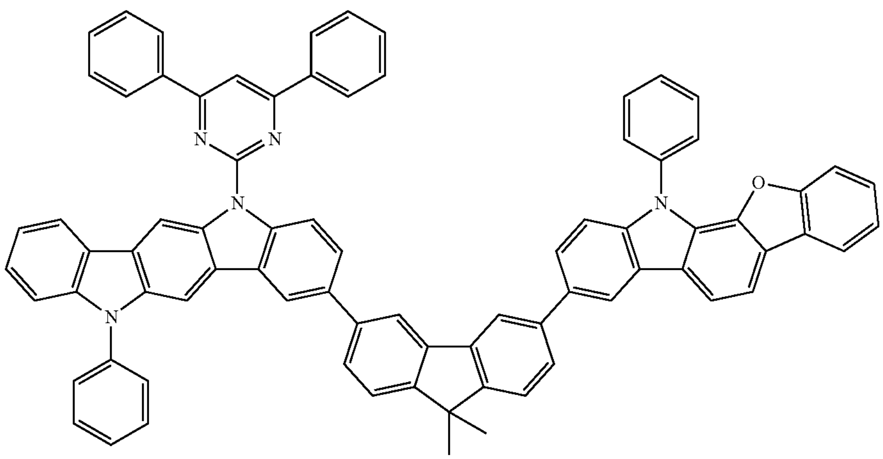
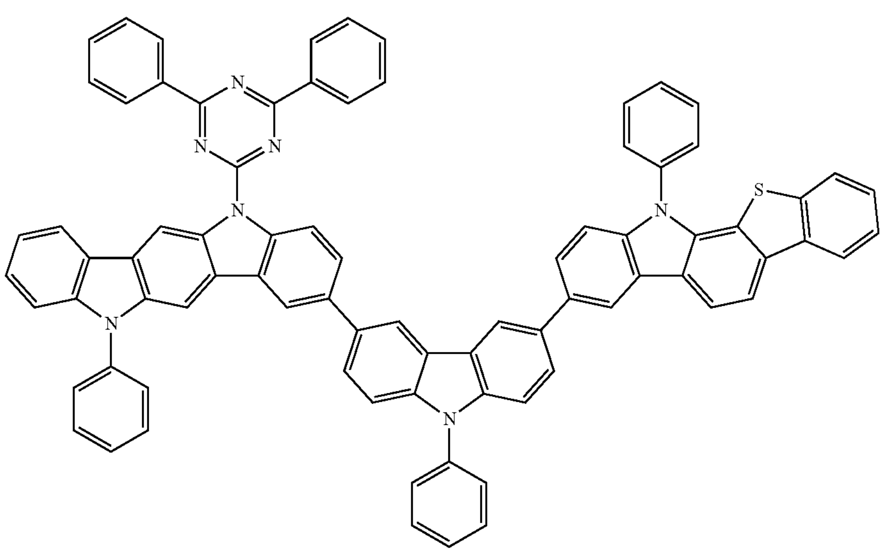

-continued
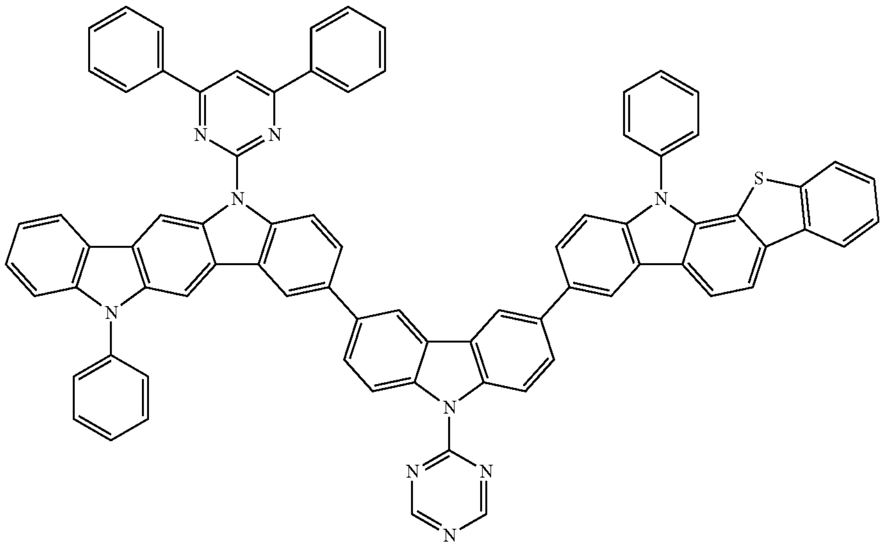
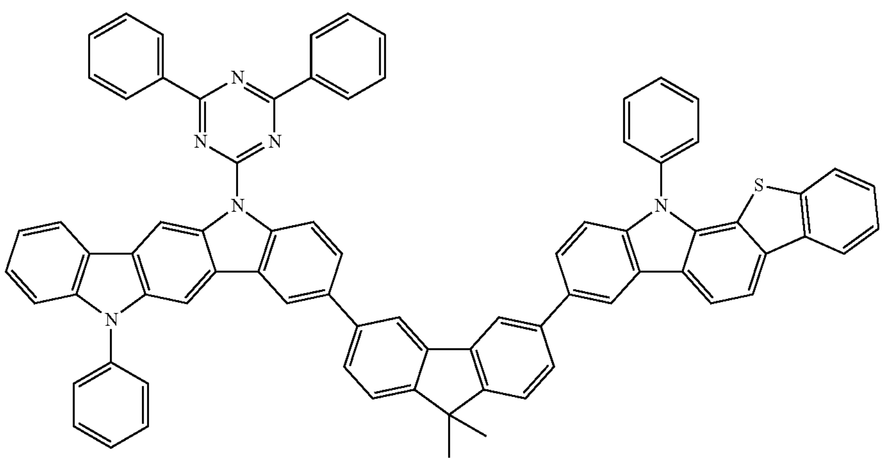
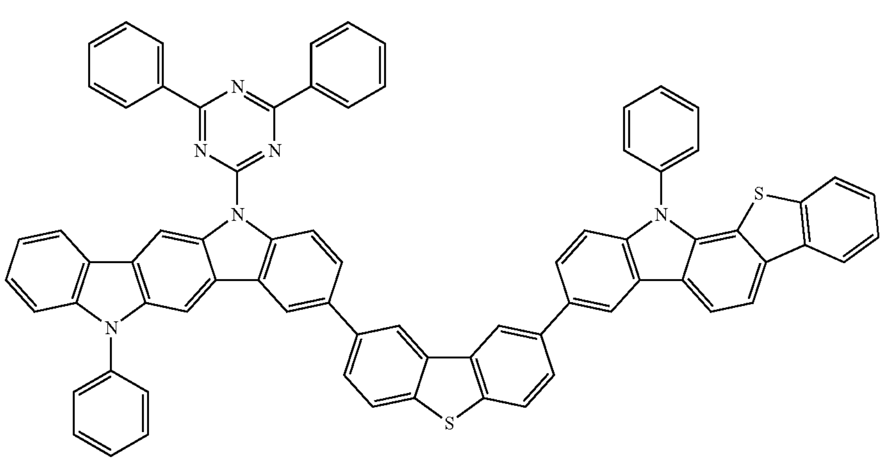

-continued
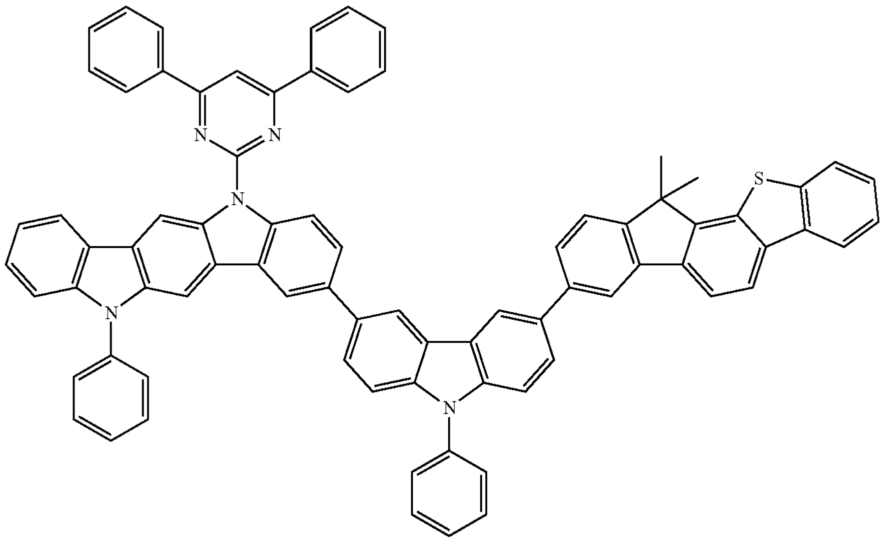
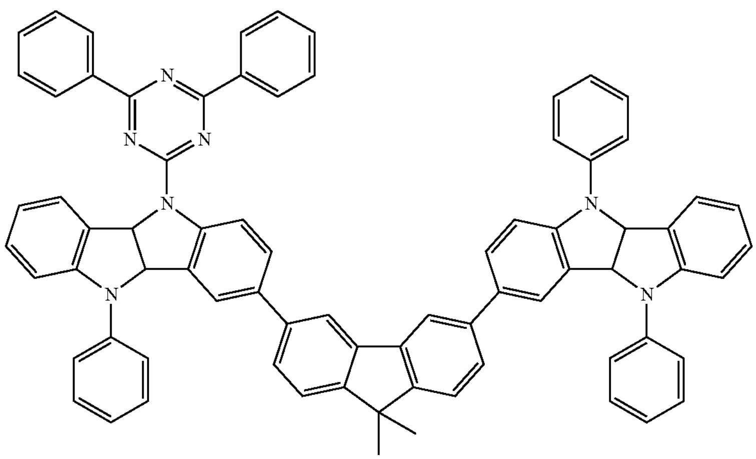
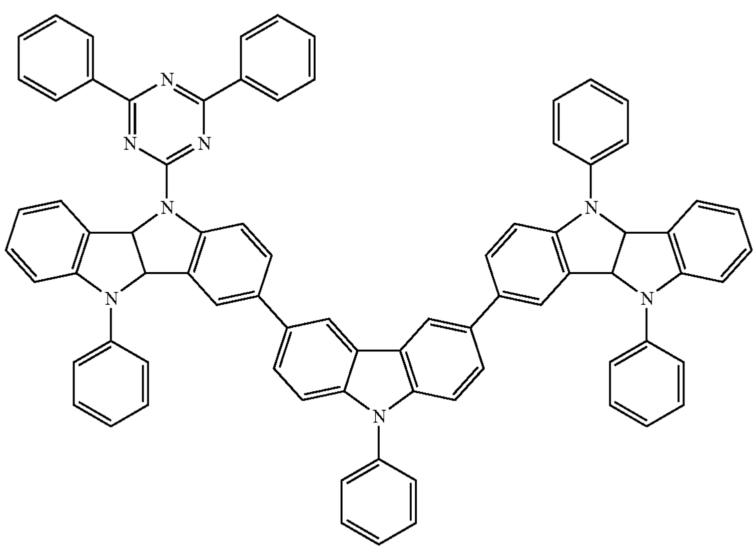

-continued
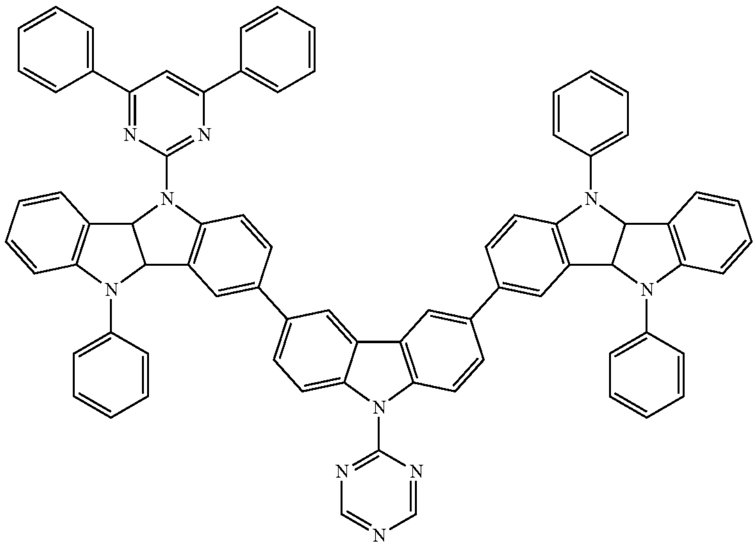
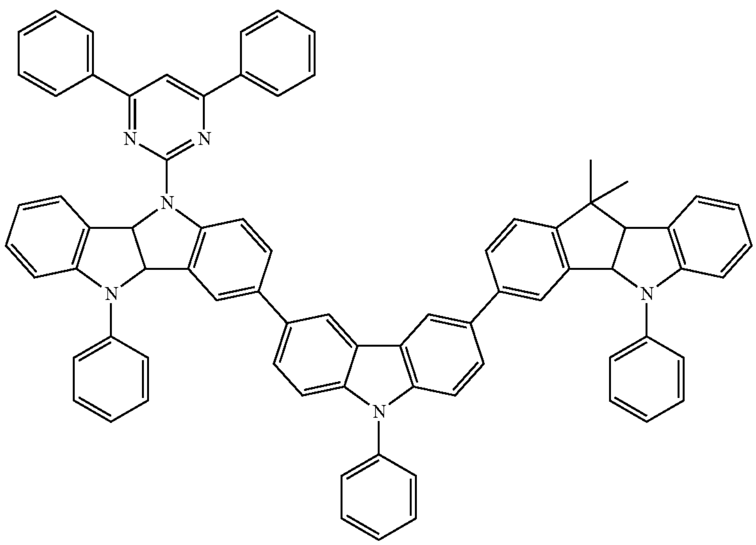
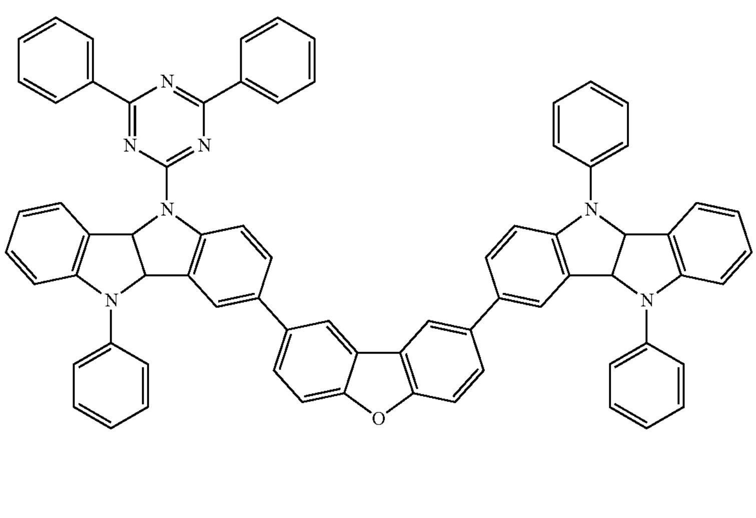

-continued
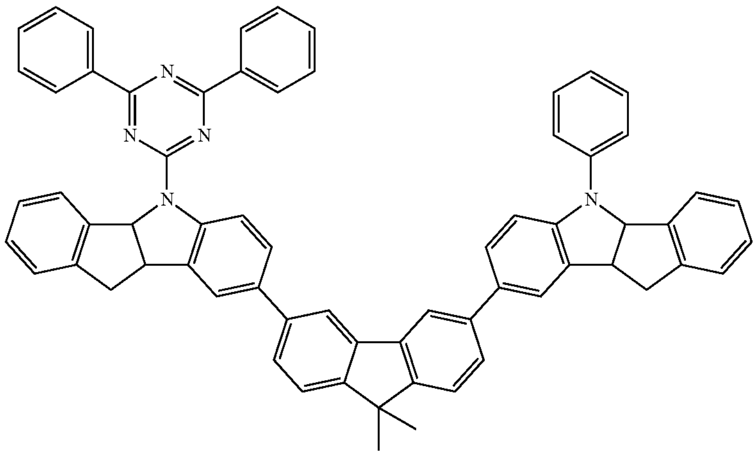
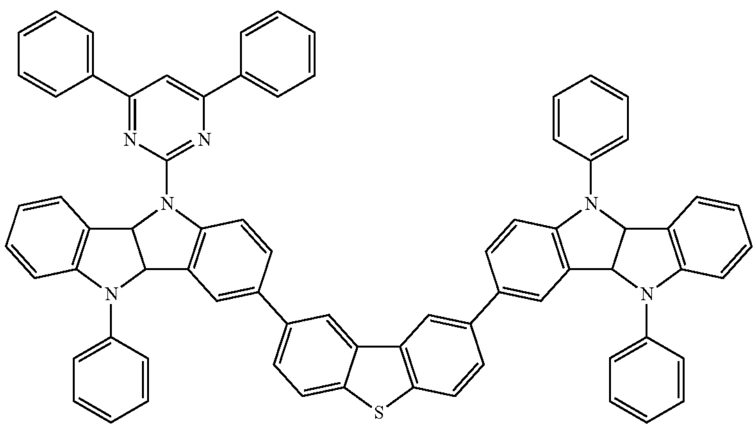
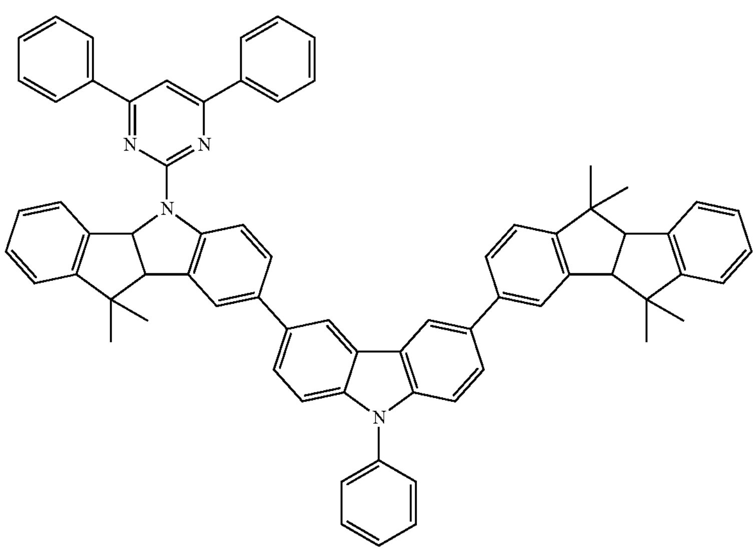

-continued
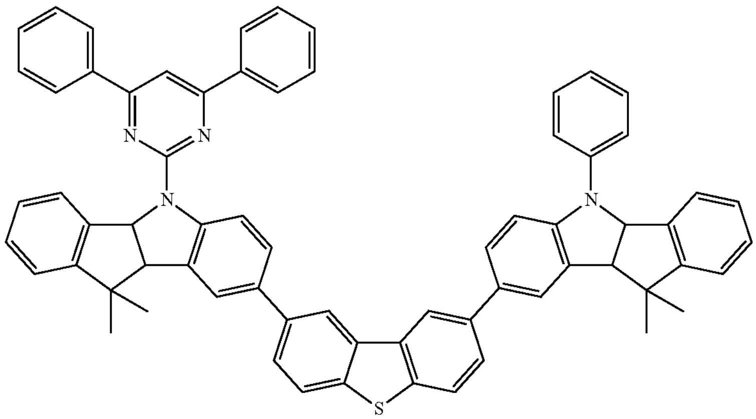
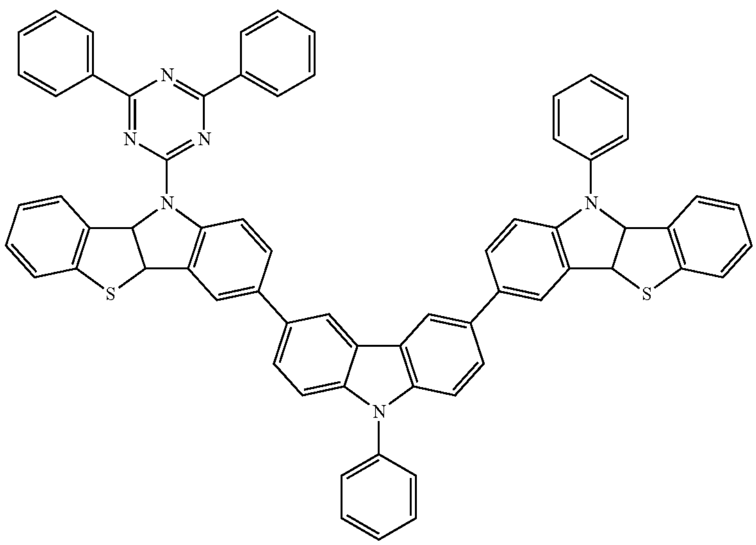
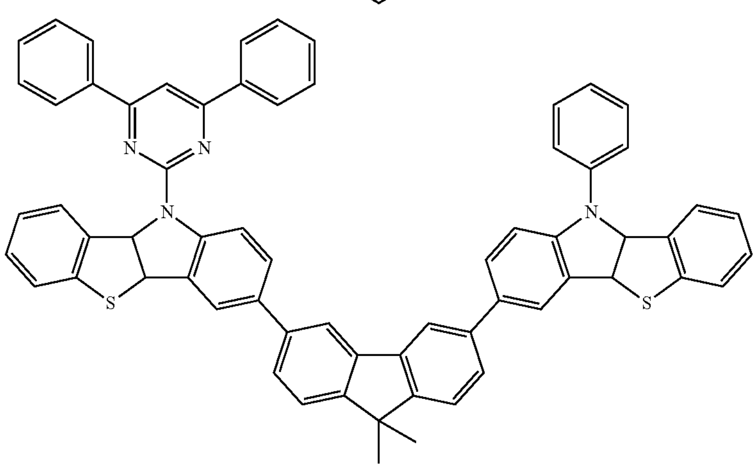
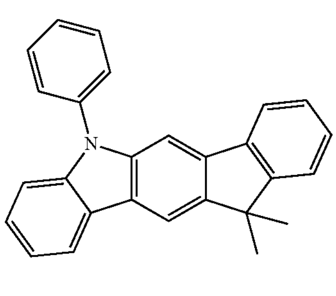
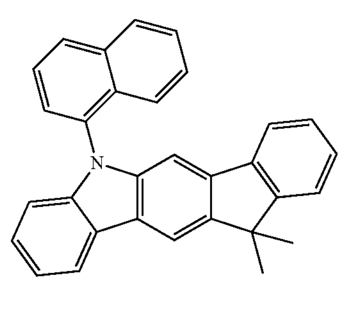

-continued
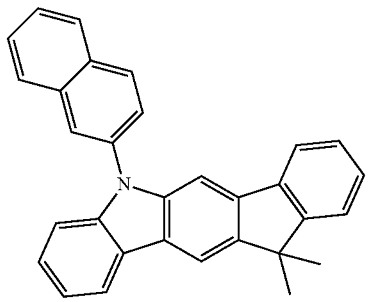
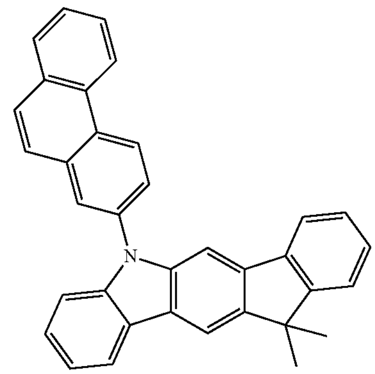
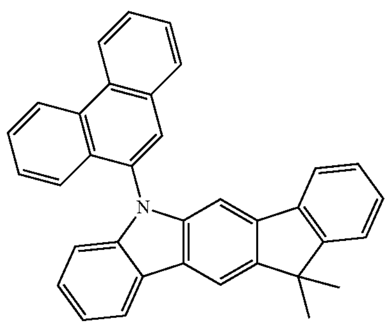
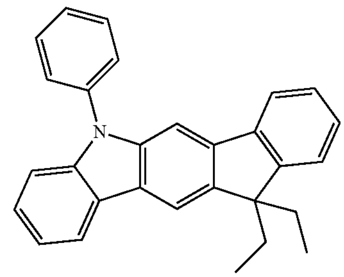
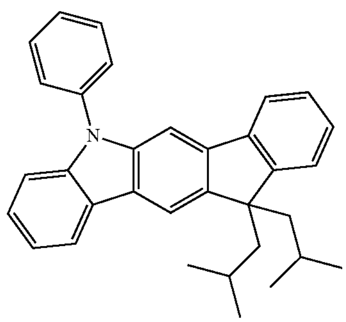
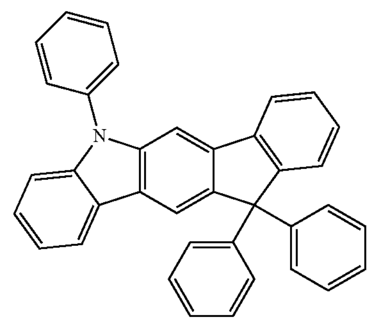
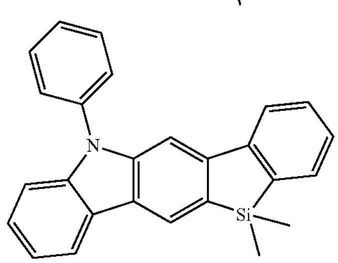
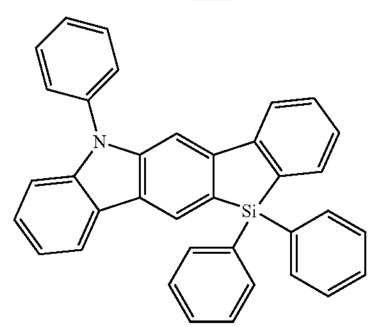
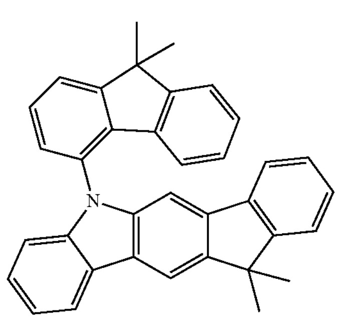
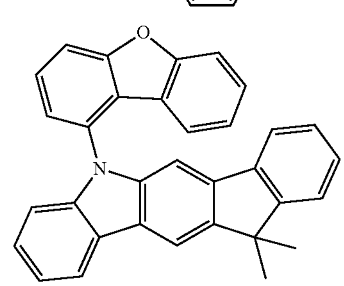

-continued
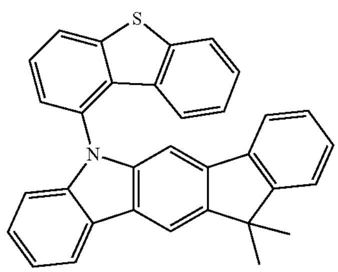
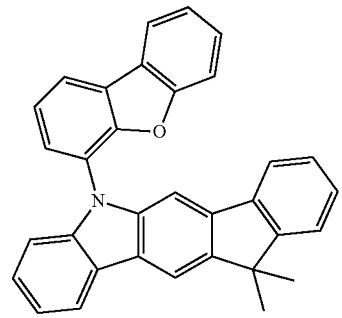
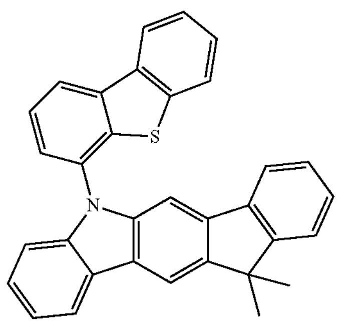
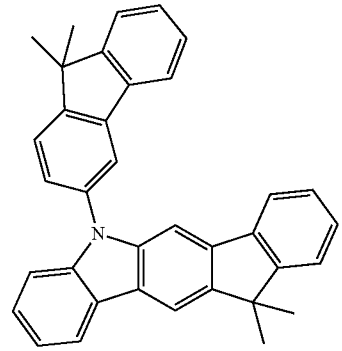
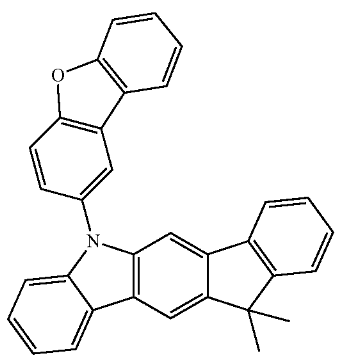
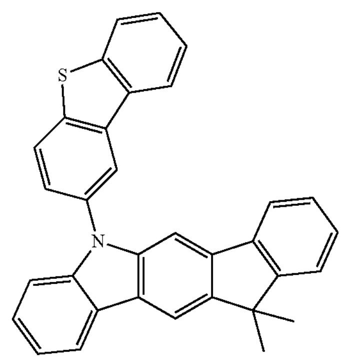
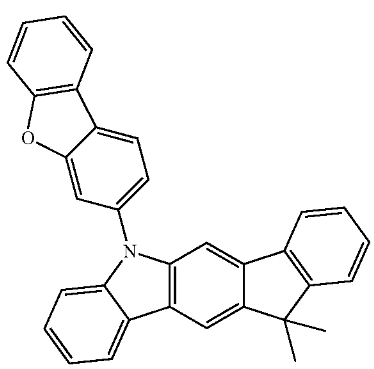
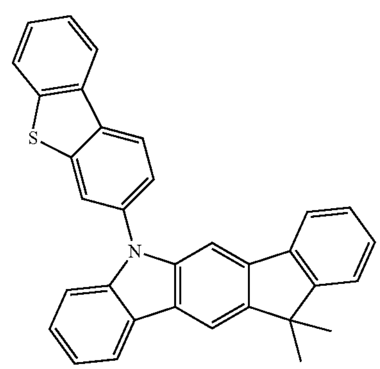

-continued
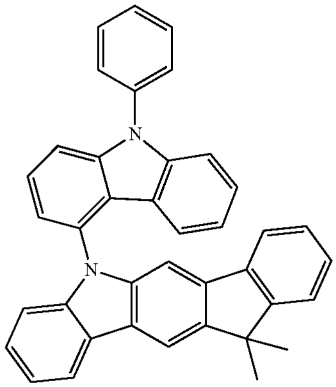
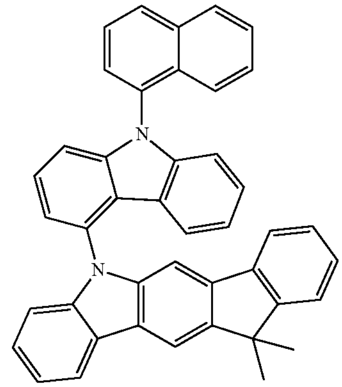
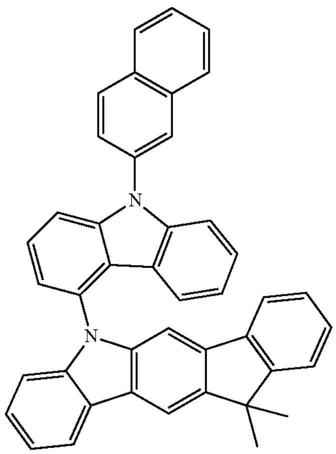
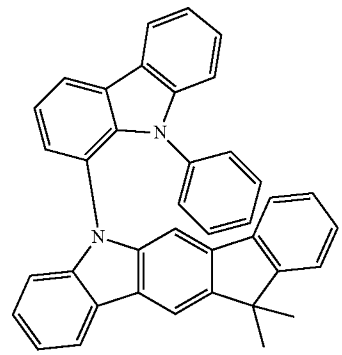
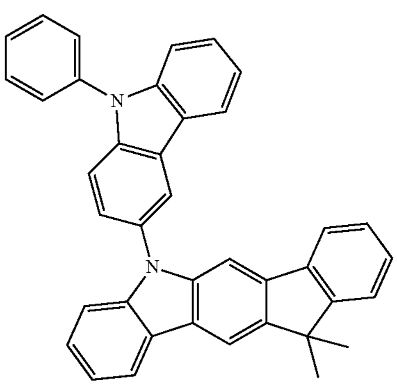
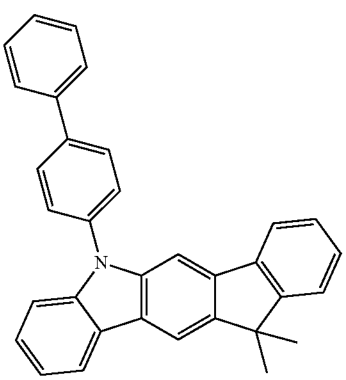
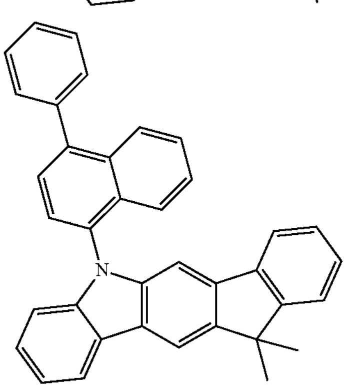
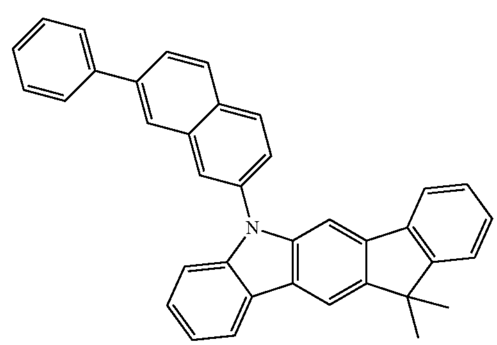

-continued
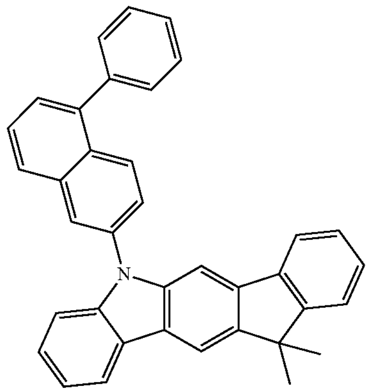
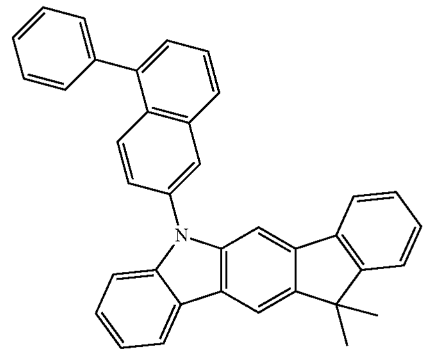
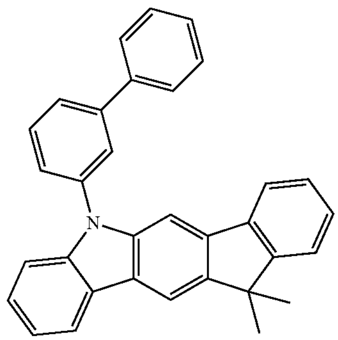
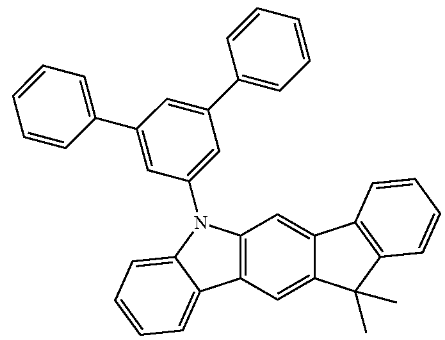
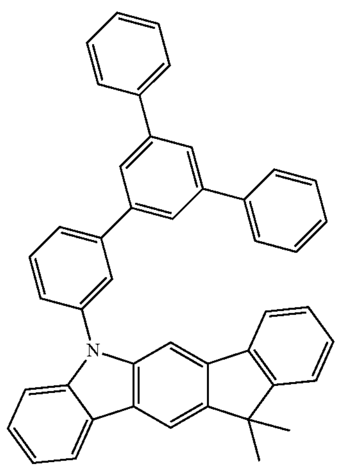
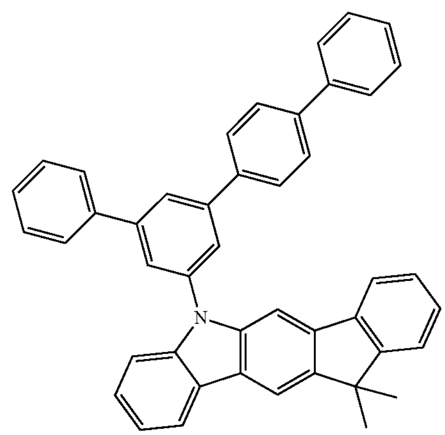
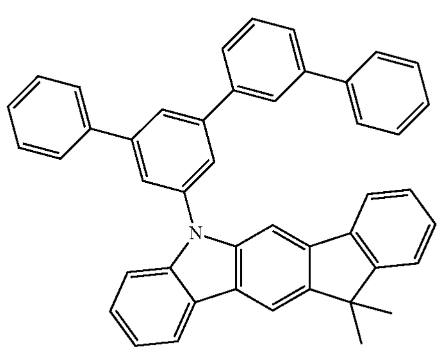
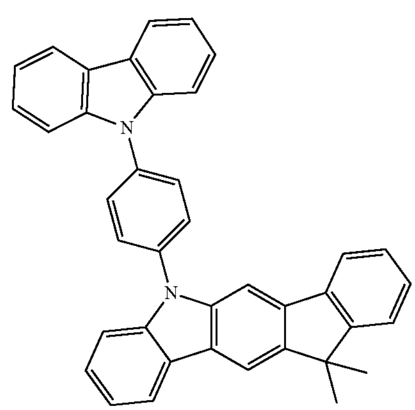

-continued
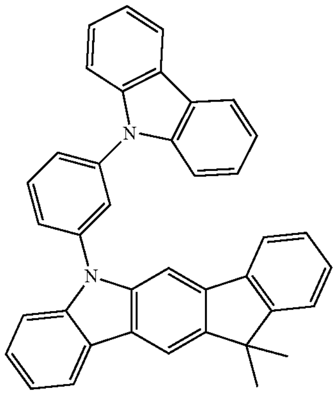
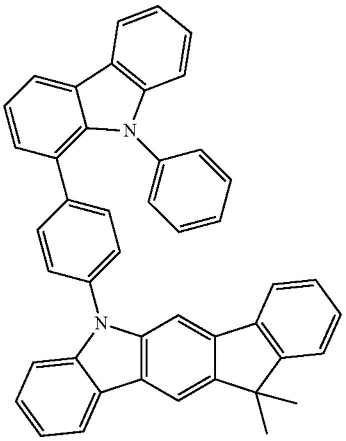
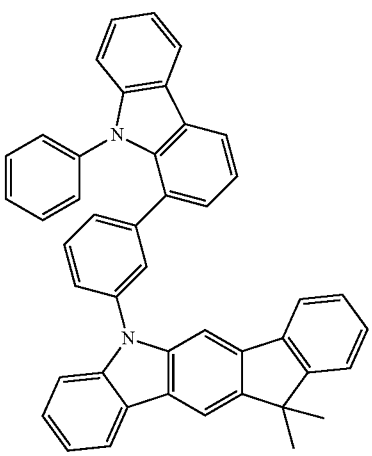
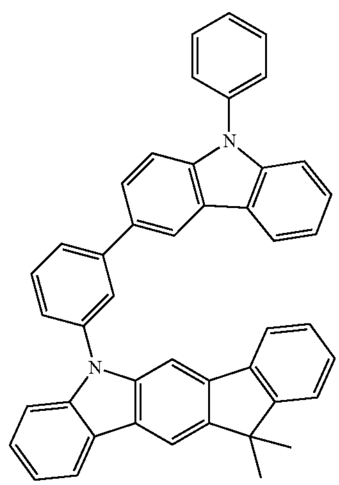
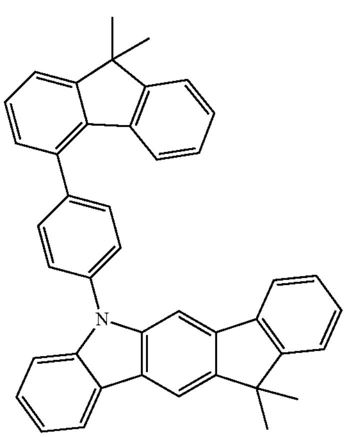
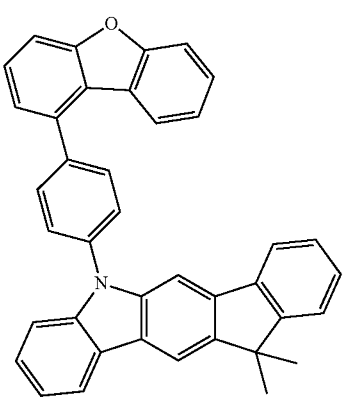

-continued
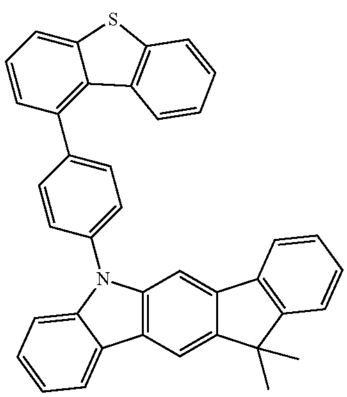
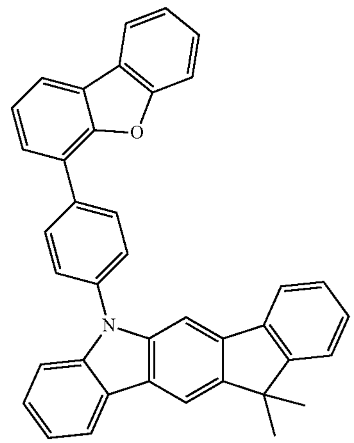
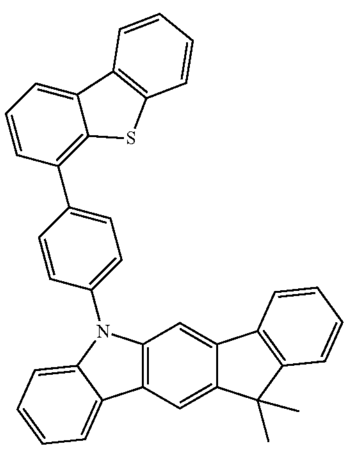
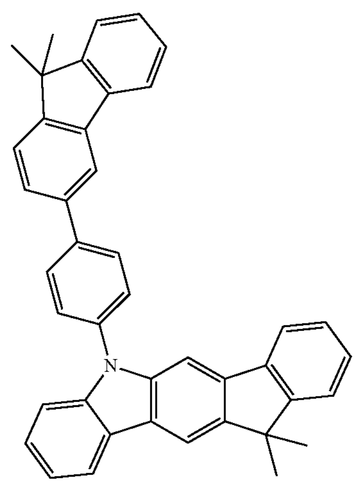
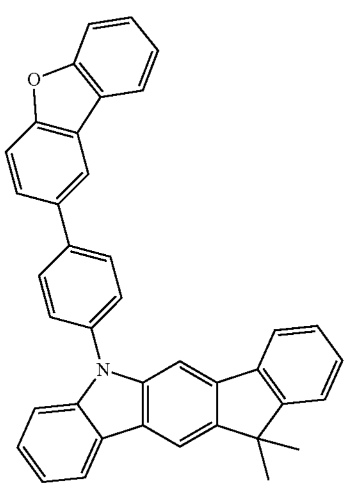
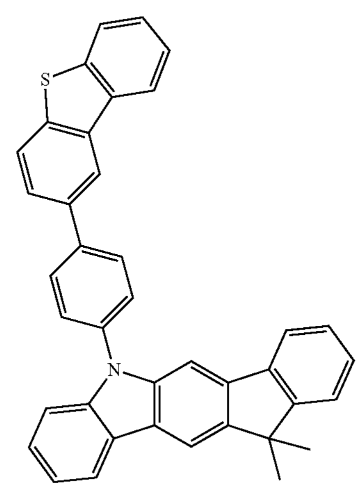

-continued
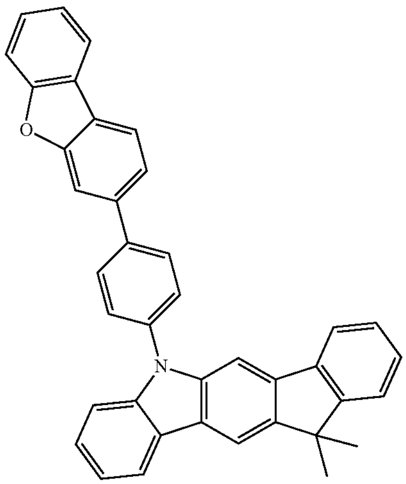
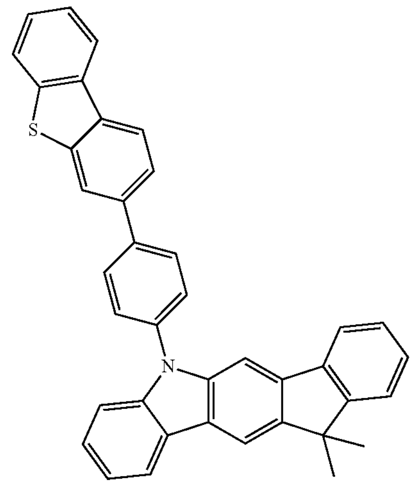
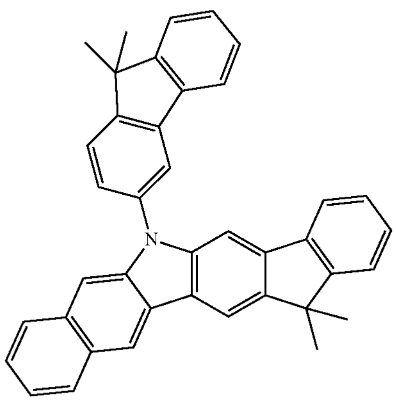
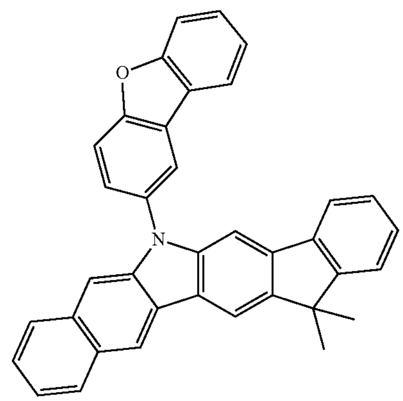
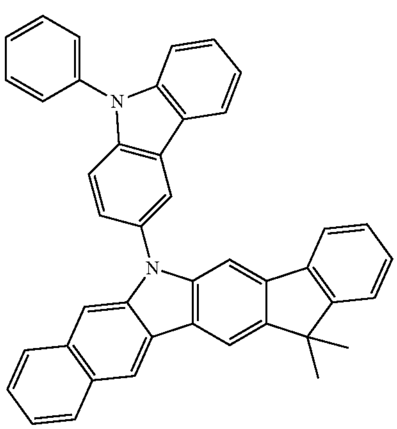
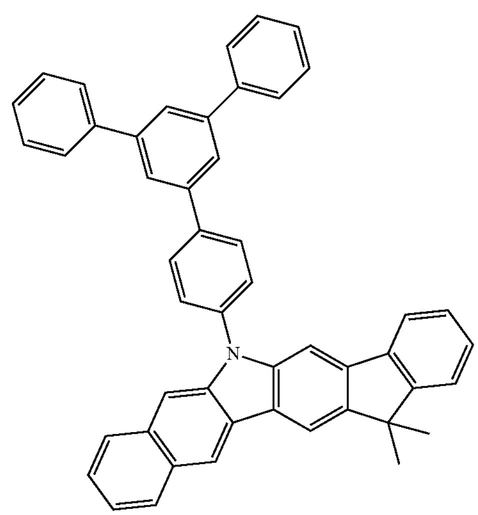

-continued
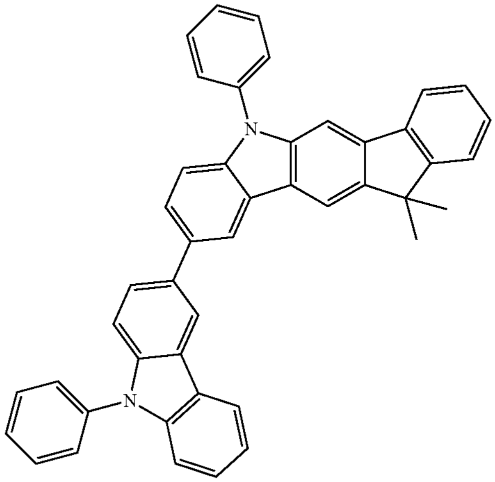
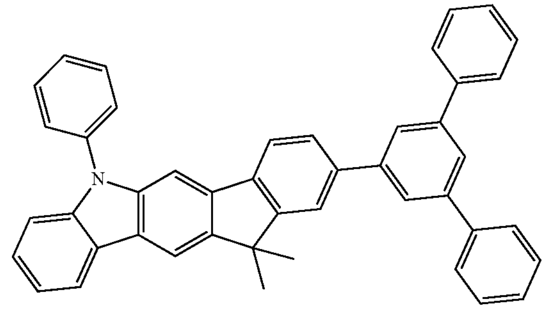
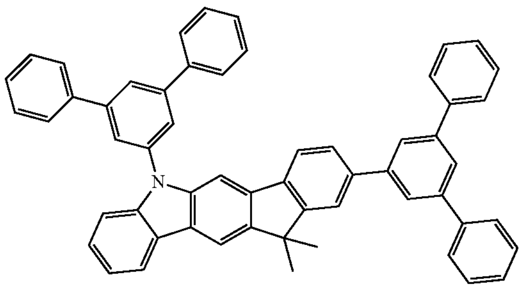
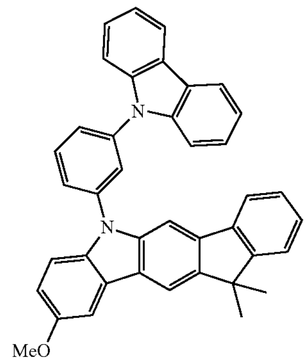
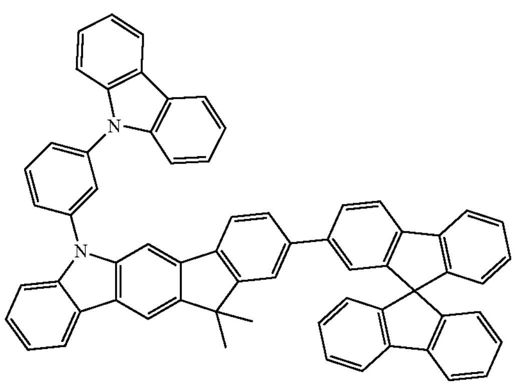
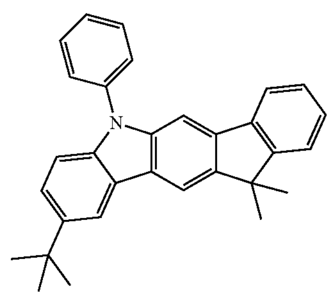
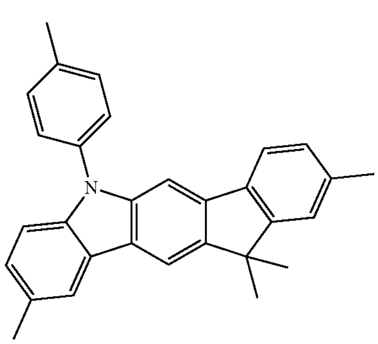
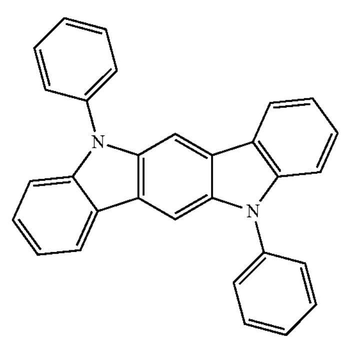

-continued
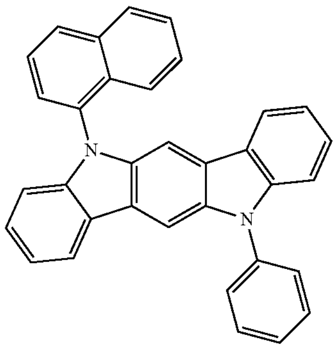
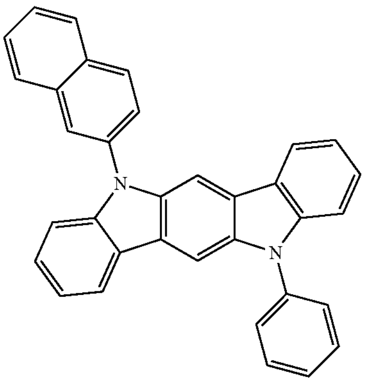
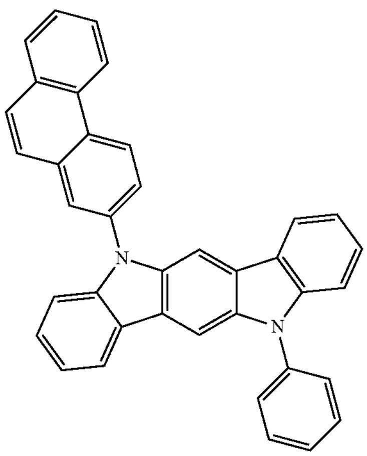
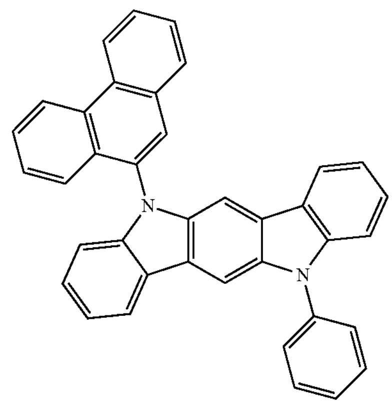
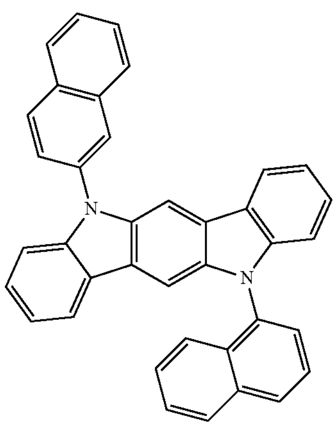
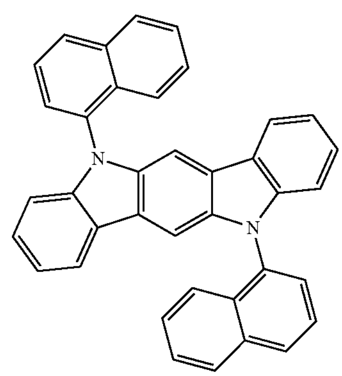

-continued
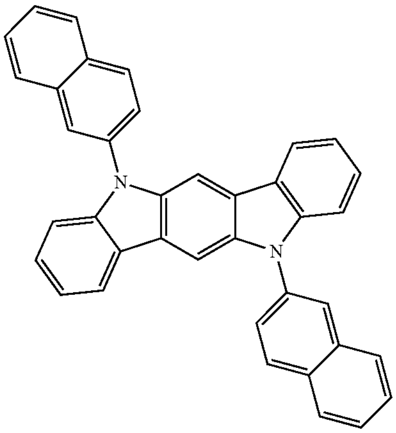
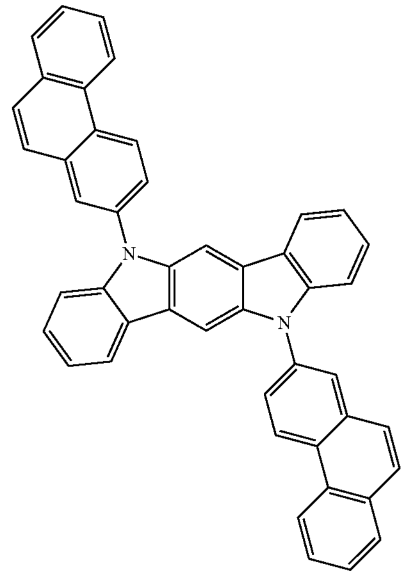
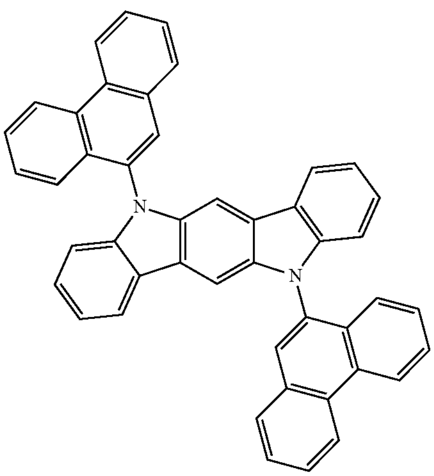
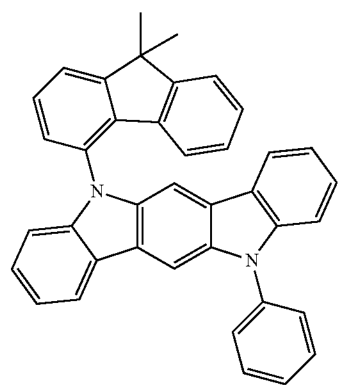
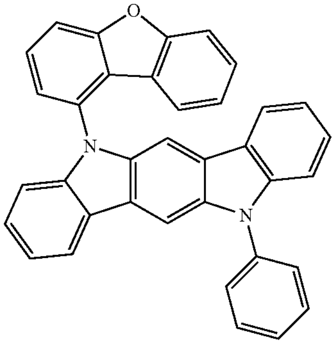
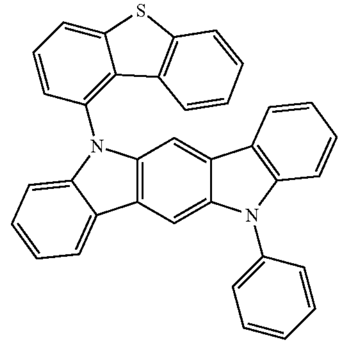

-continued
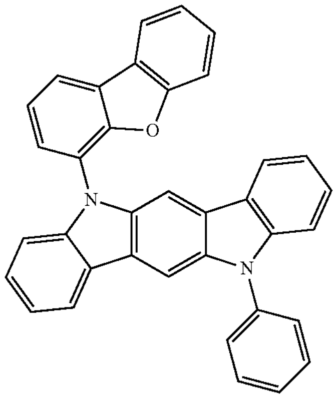
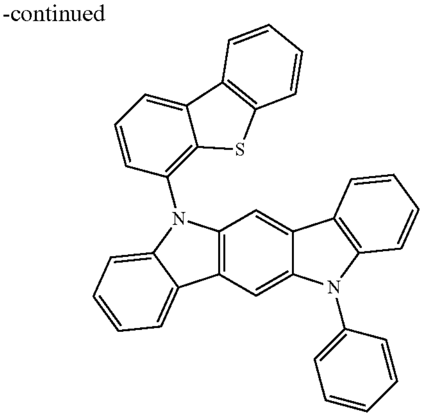
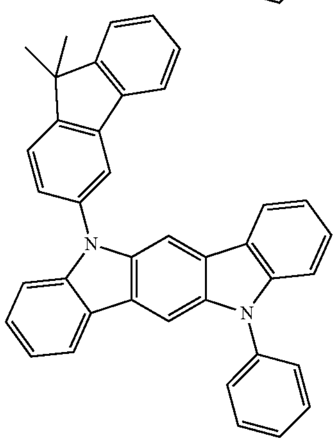
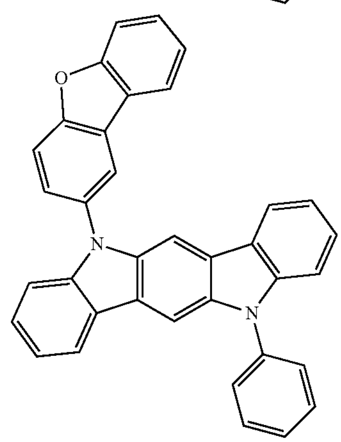
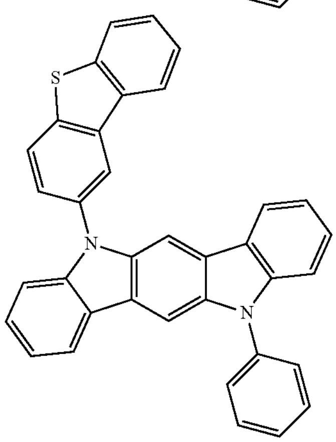
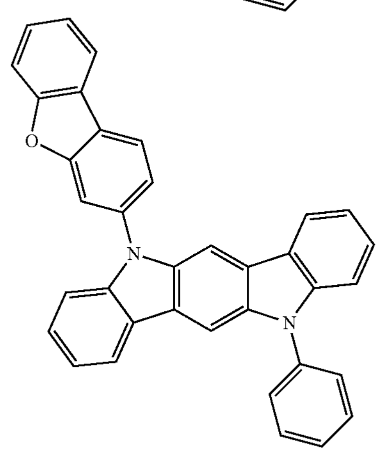
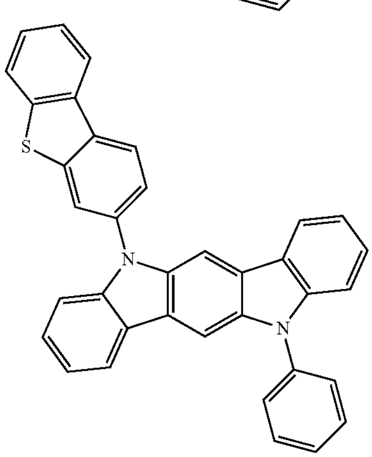
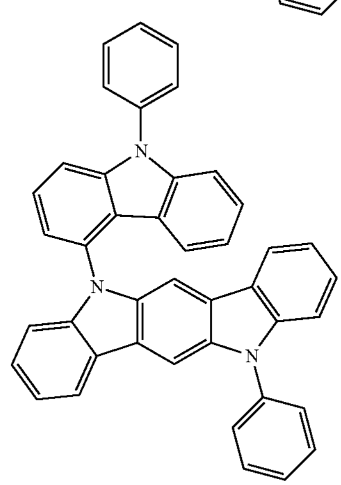

-continued
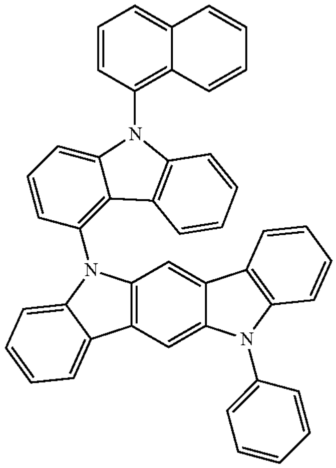
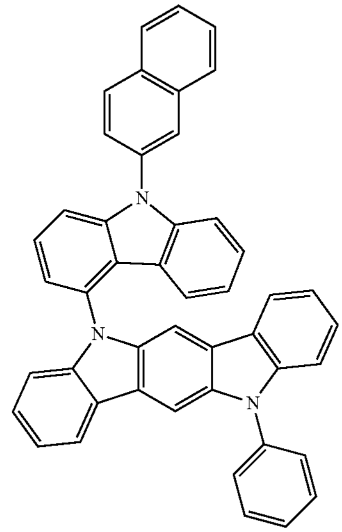
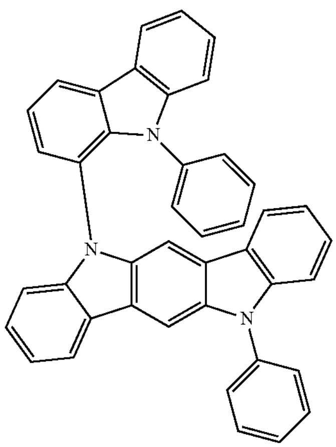
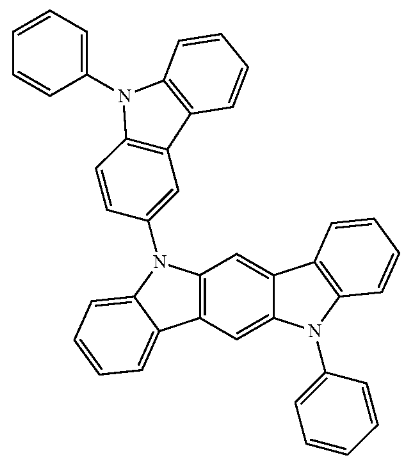
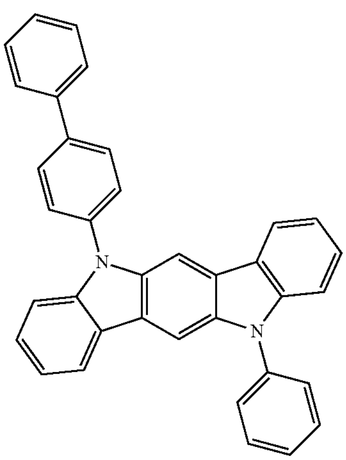
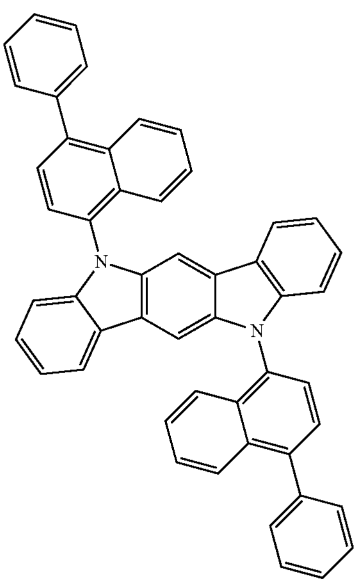

-continued
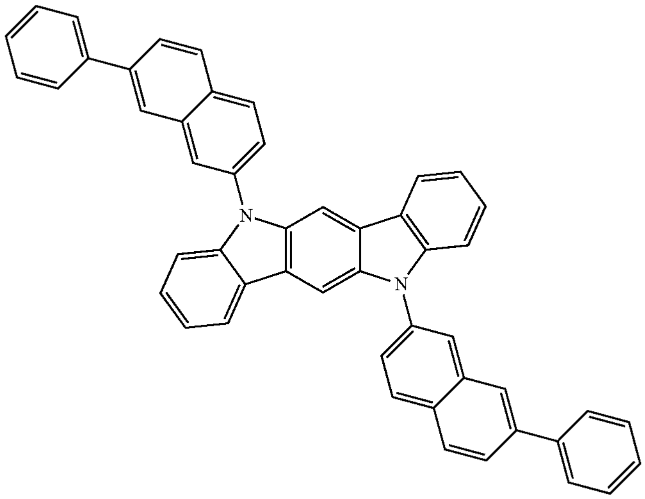
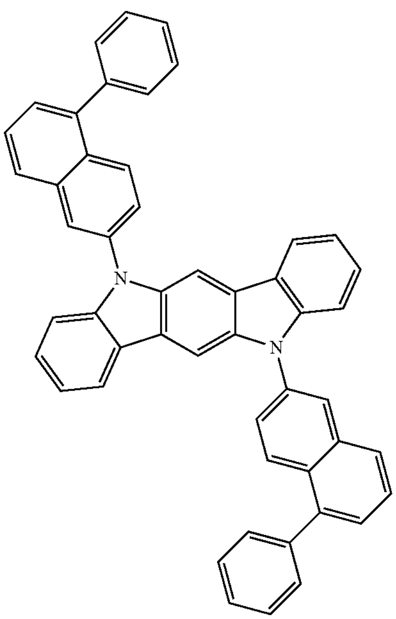
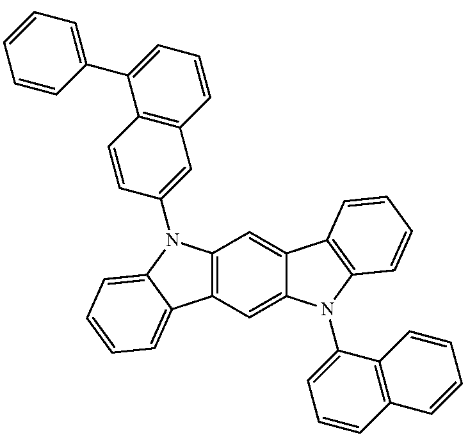
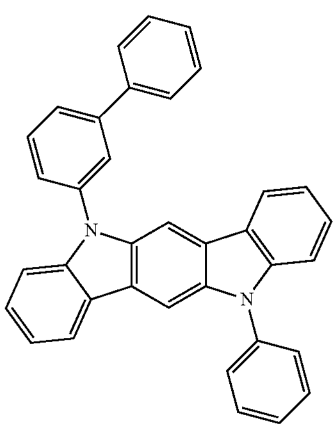
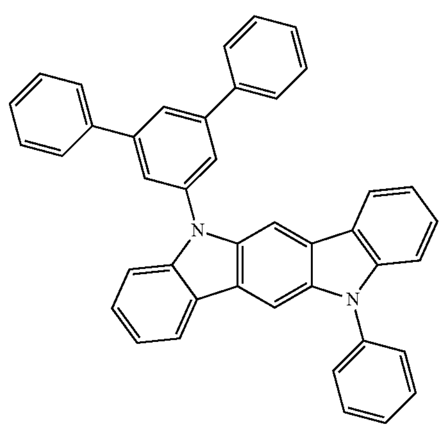

-continued
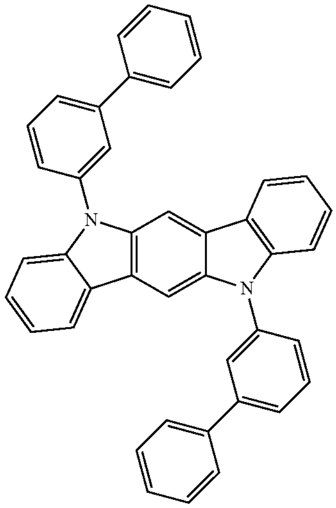
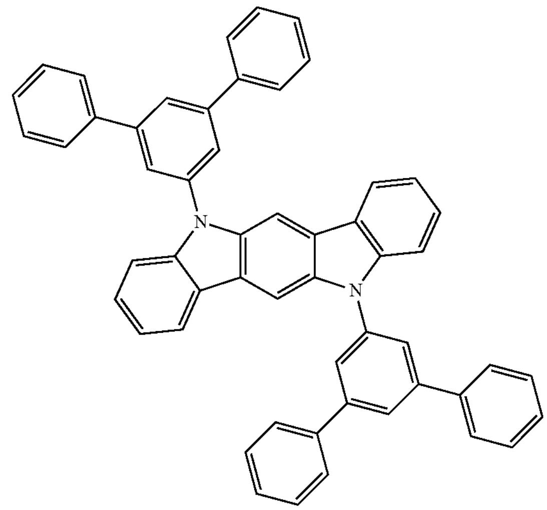
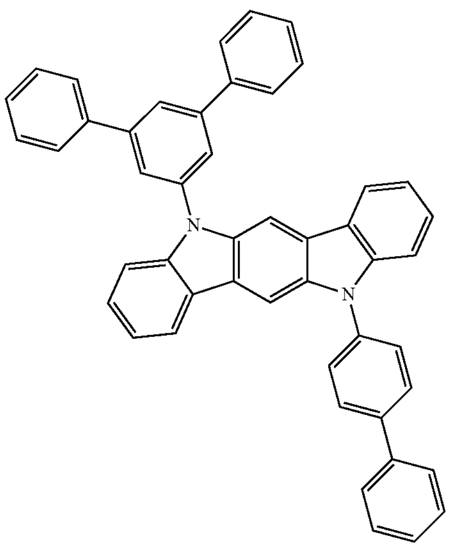
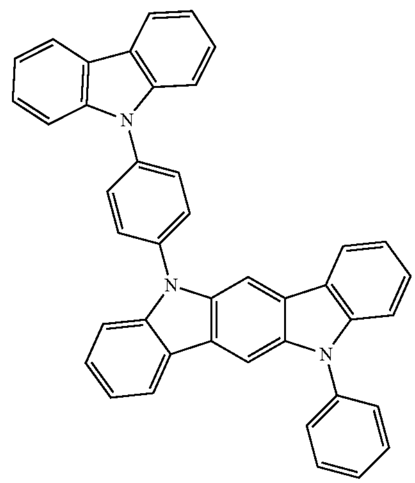
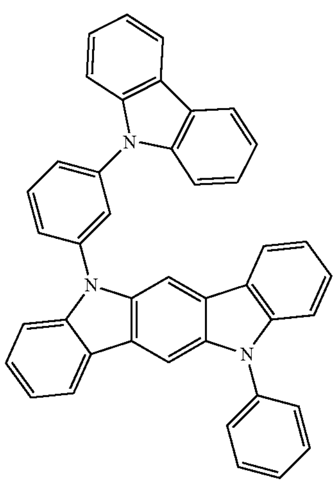
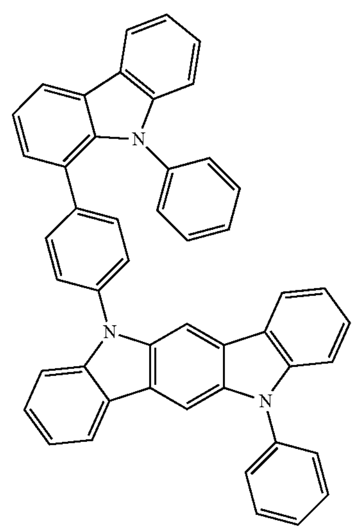

-continued
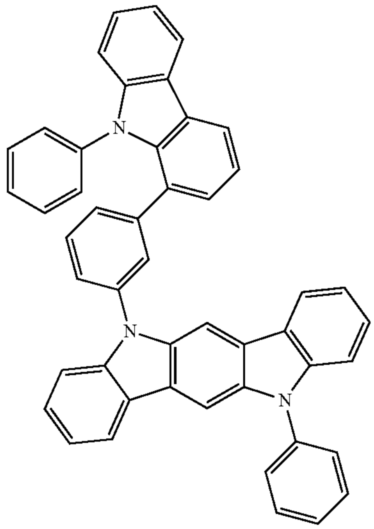
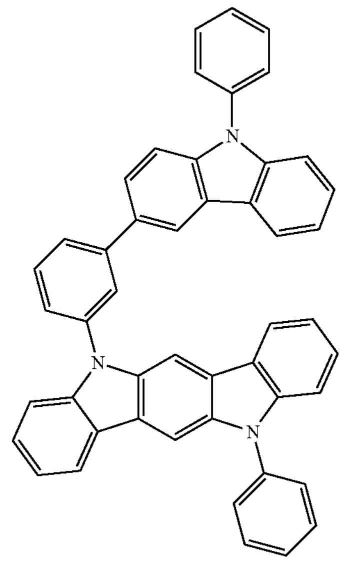
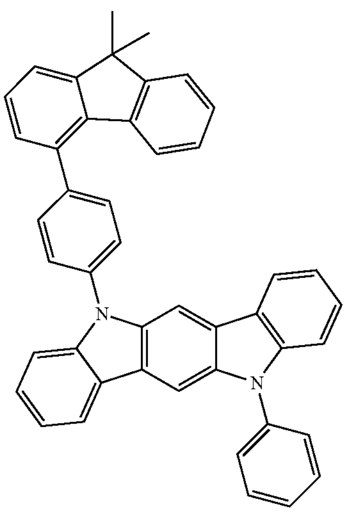
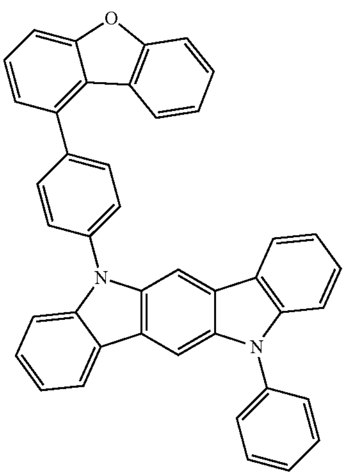
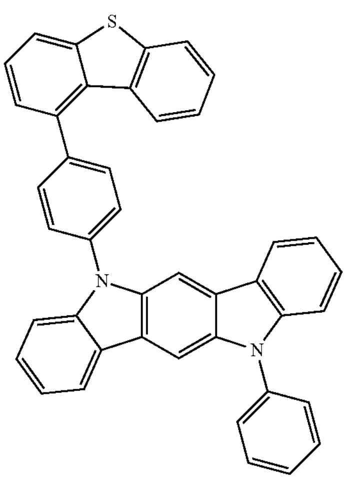
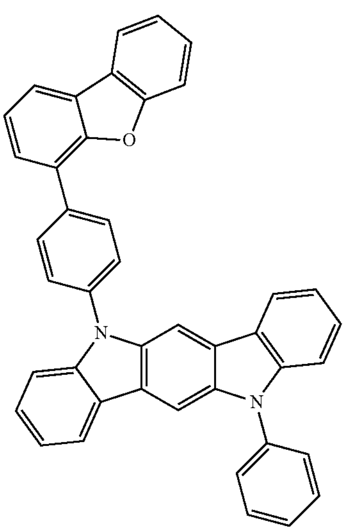

-continued
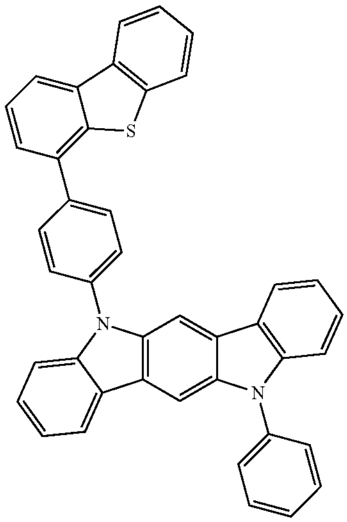
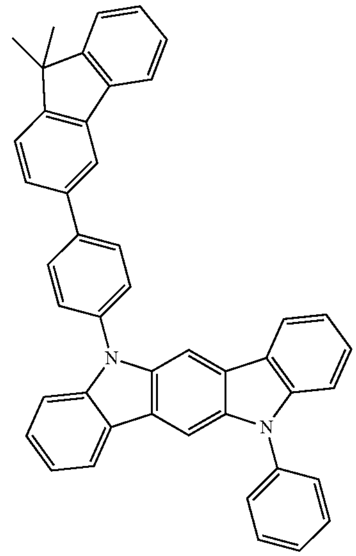
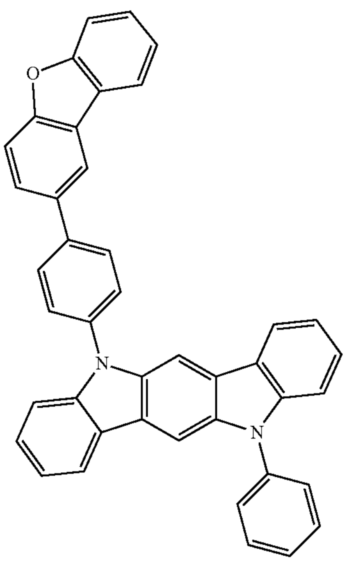
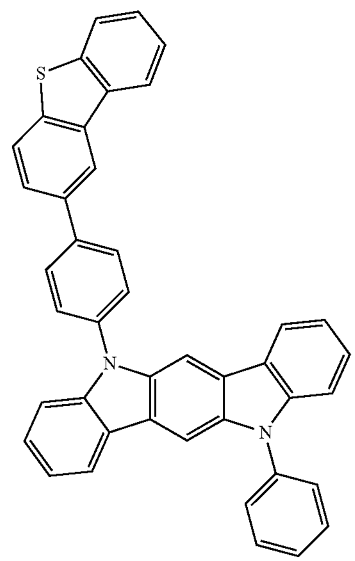
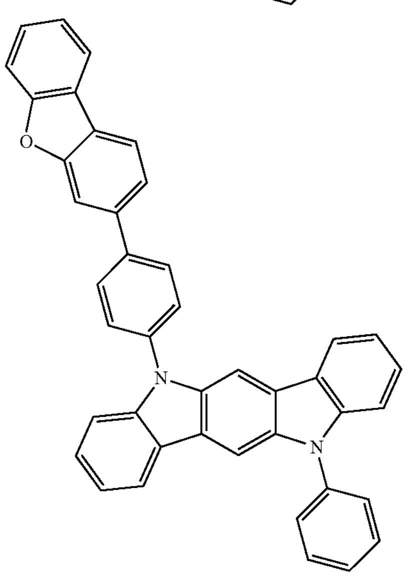
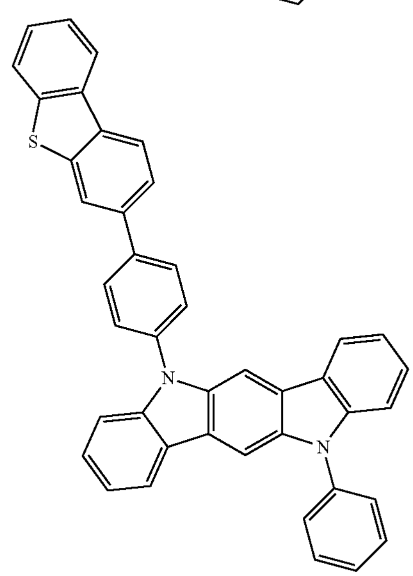

-continued
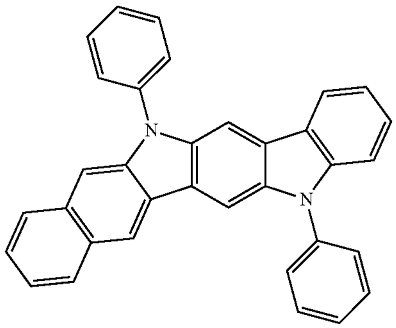
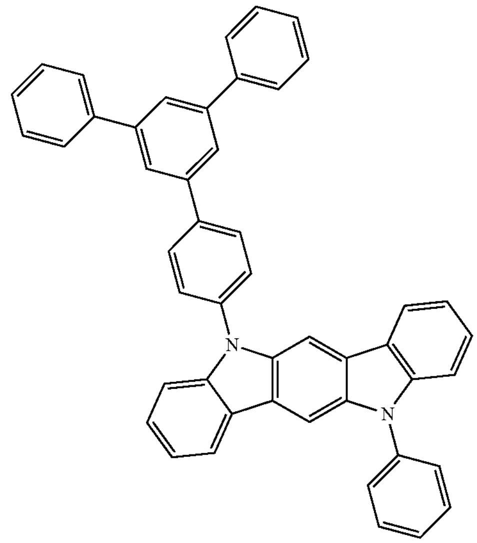
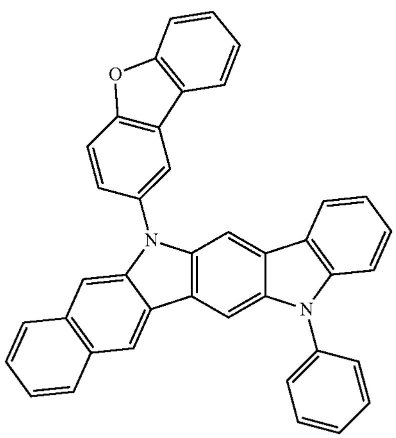
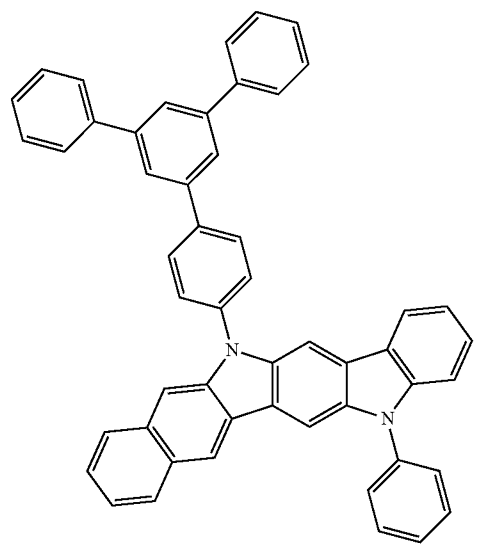
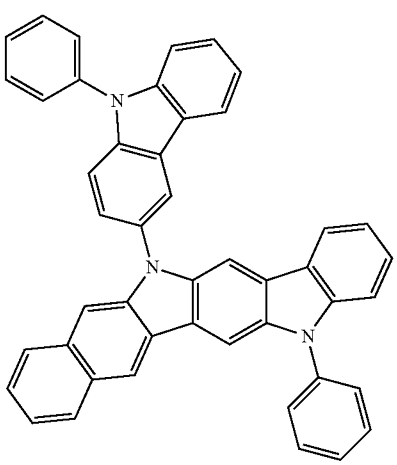
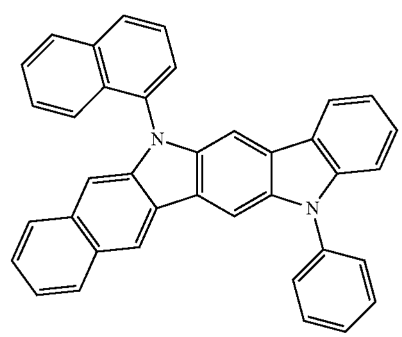

-continued
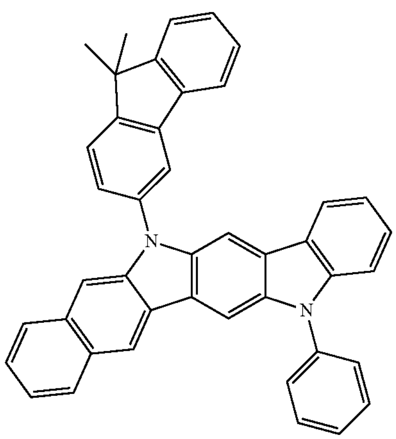
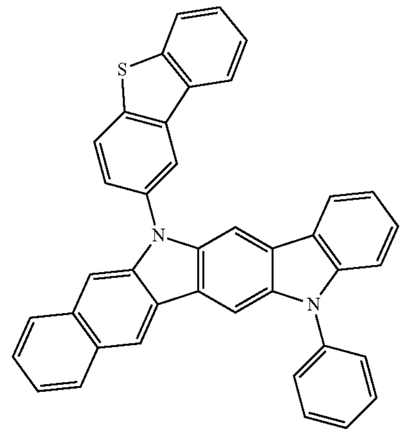
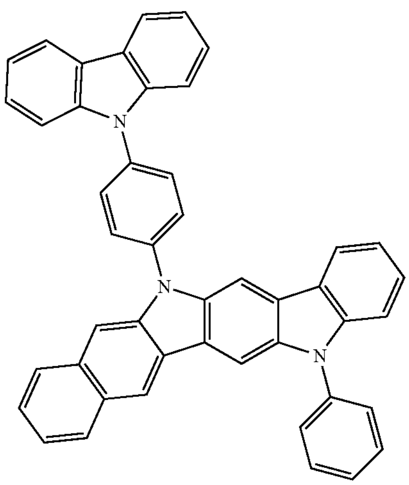
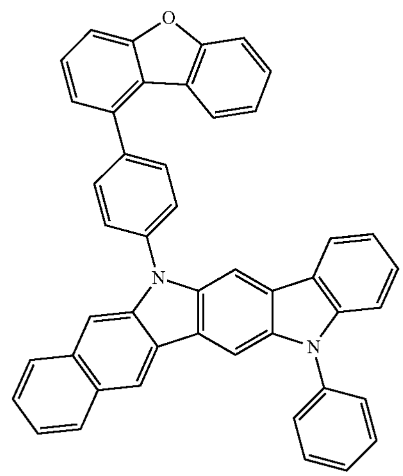
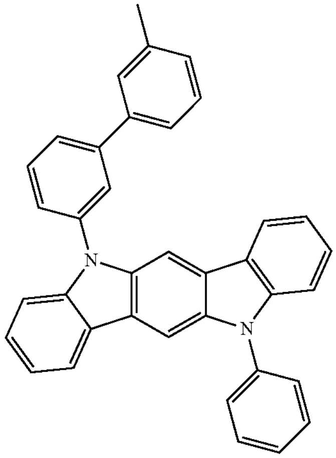
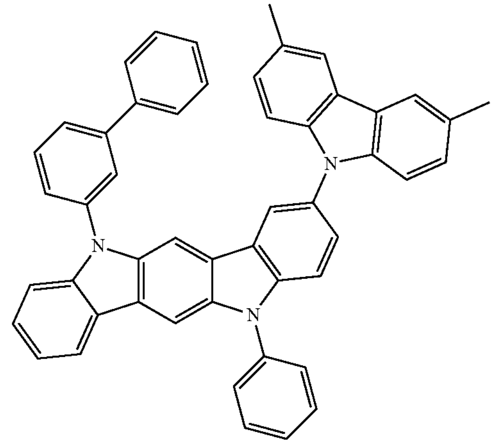

-continued
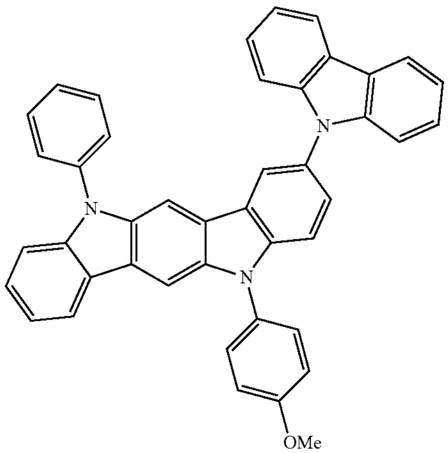
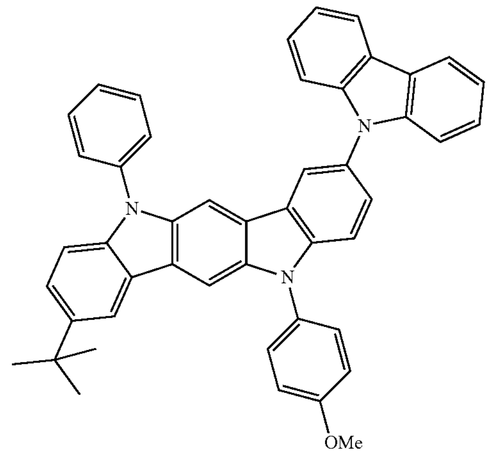
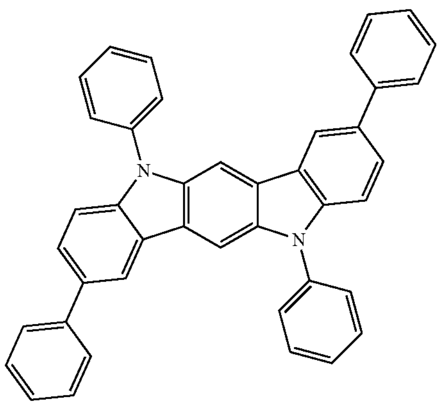
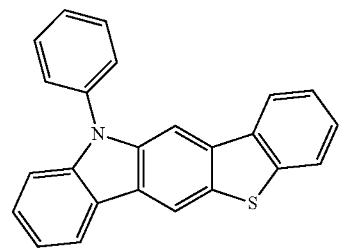
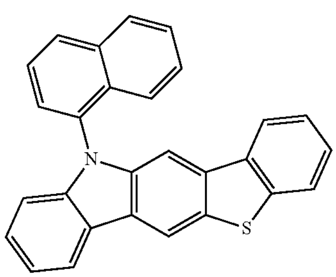
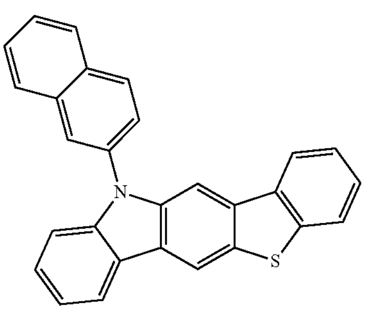
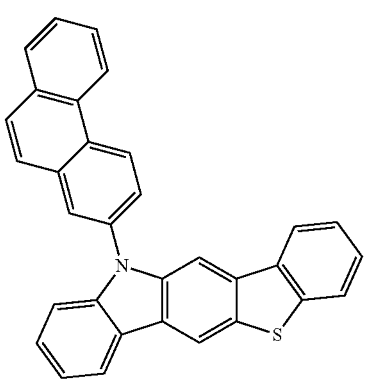
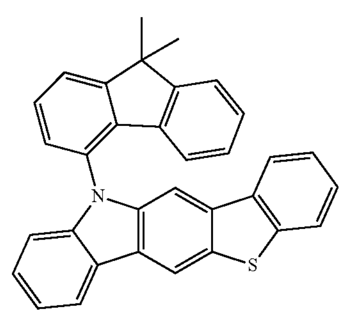

-continued
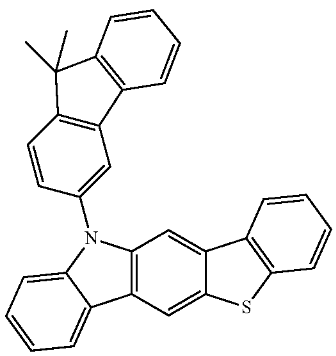
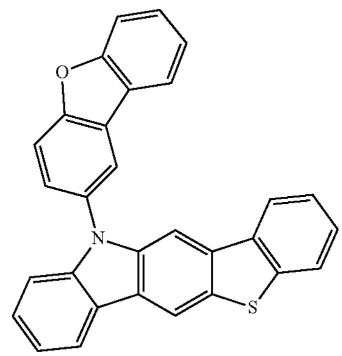
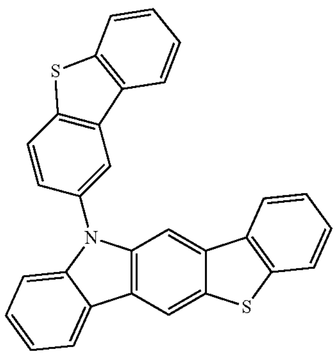
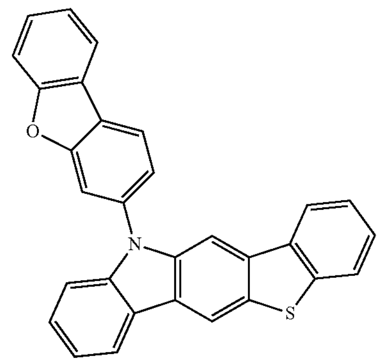
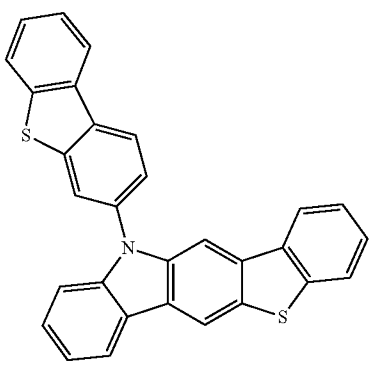
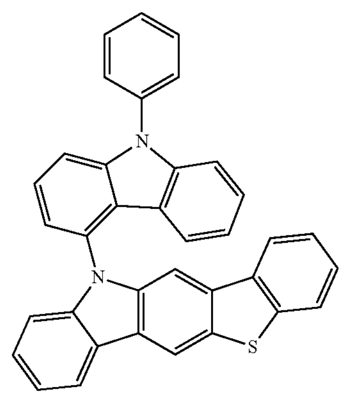
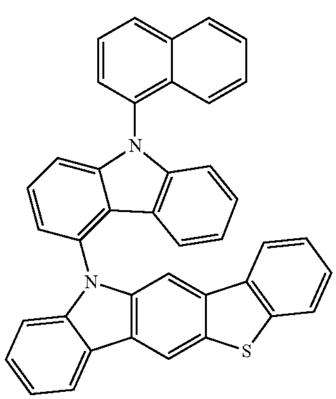
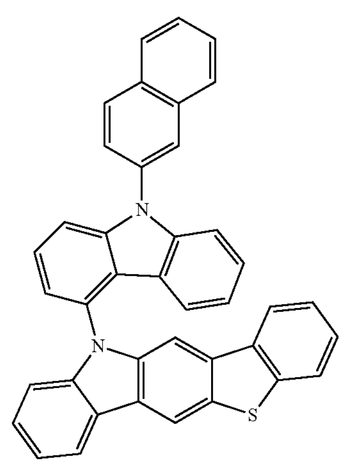

-continued
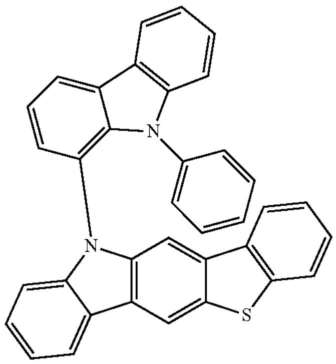
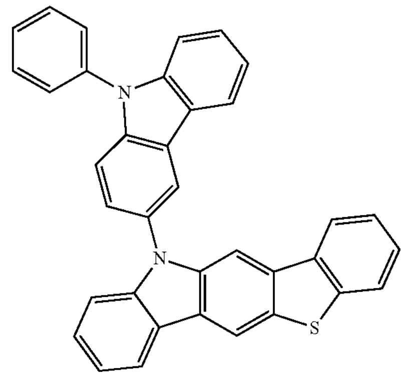
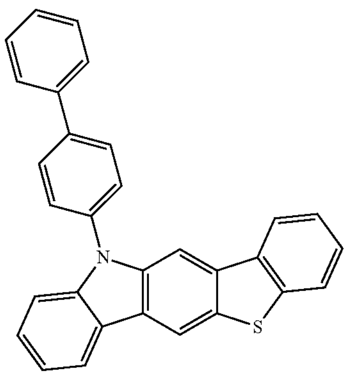
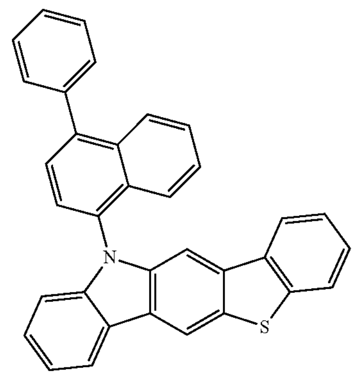
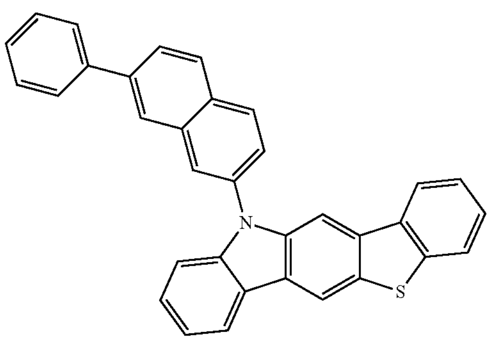
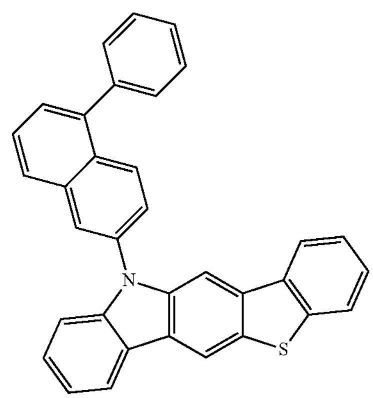
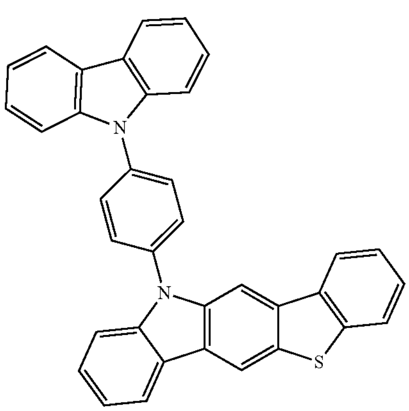
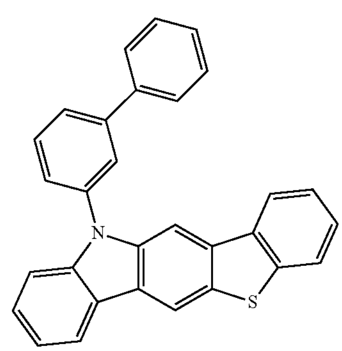

-continued
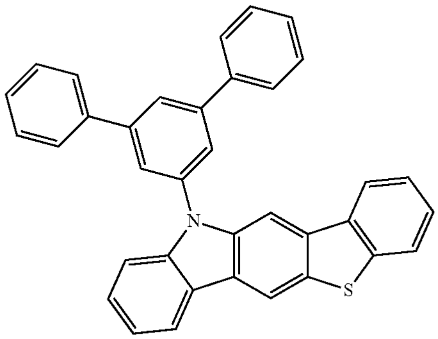
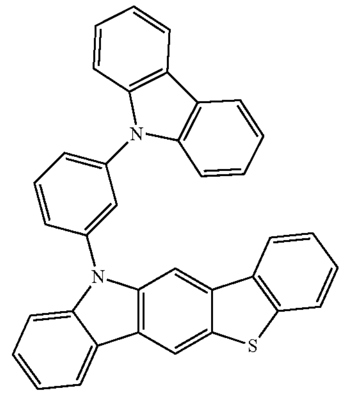
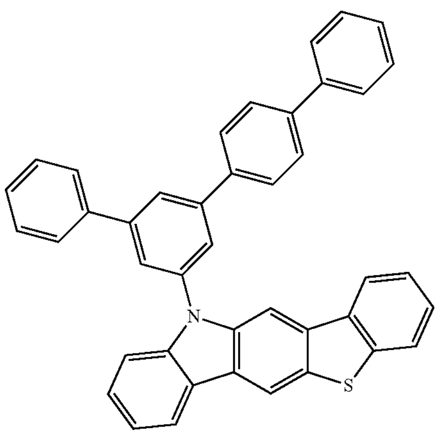
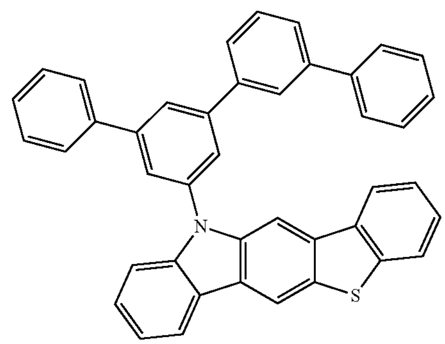
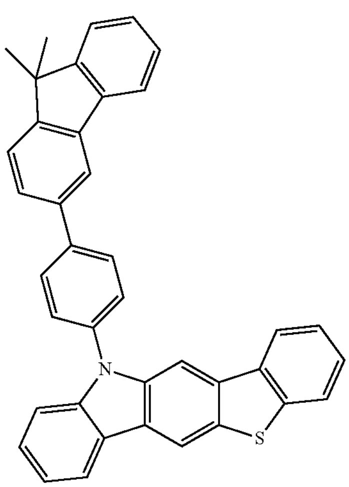
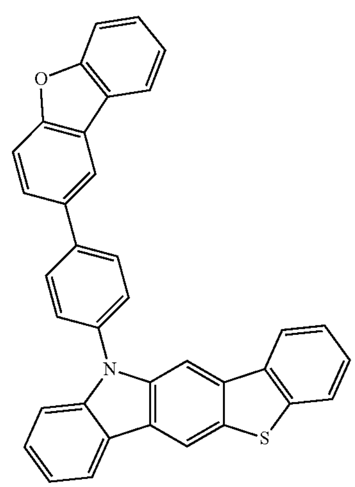

-continued
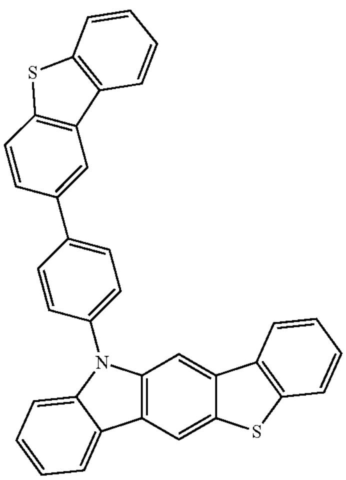
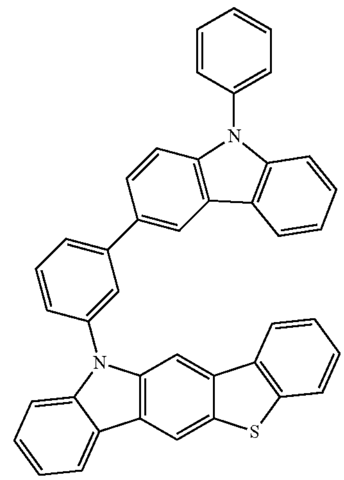
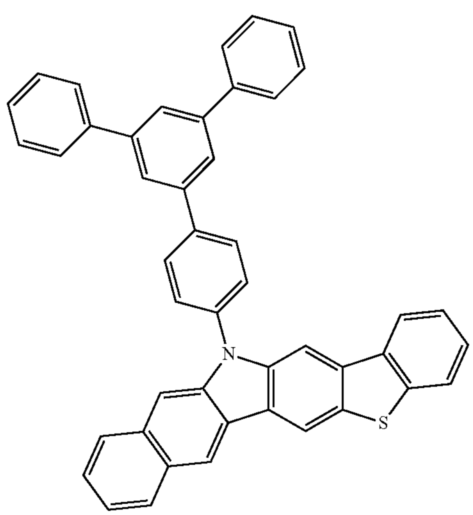
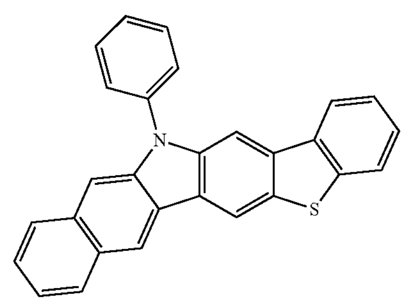
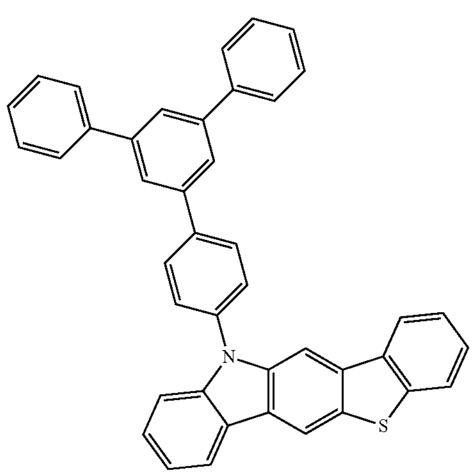
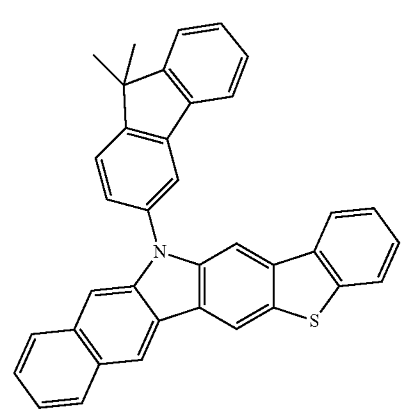

-continued
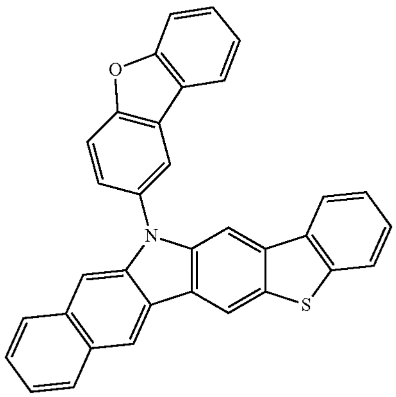
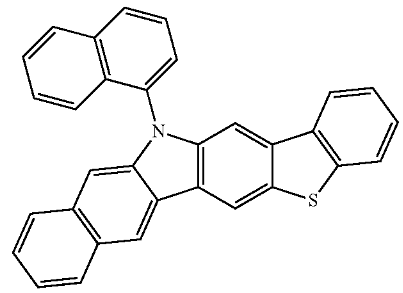
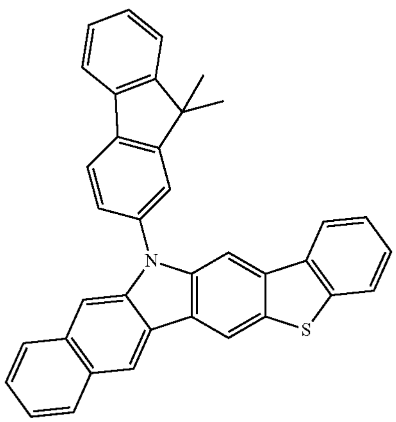
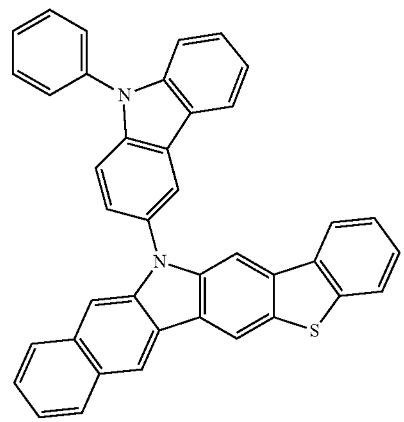
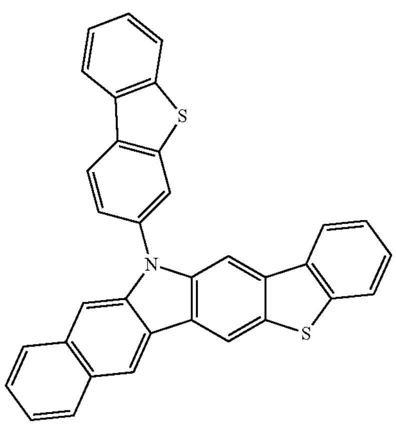
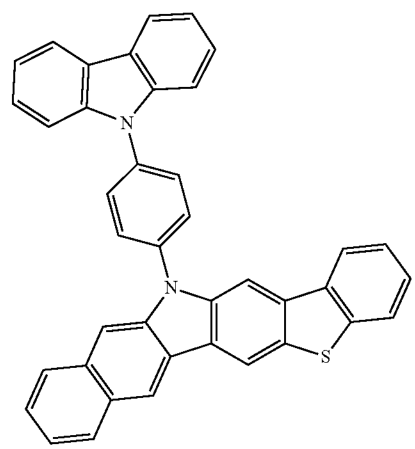
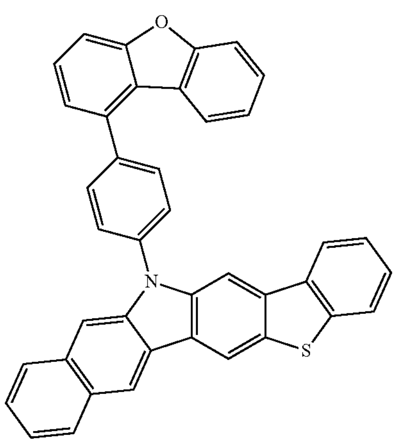
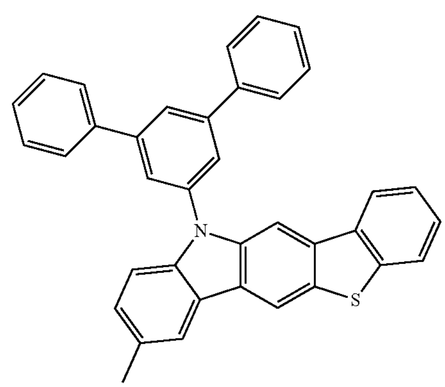

-continued
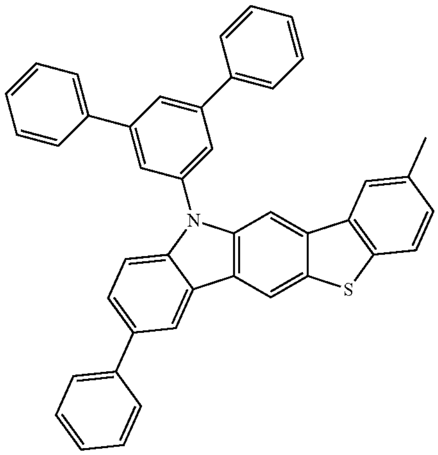
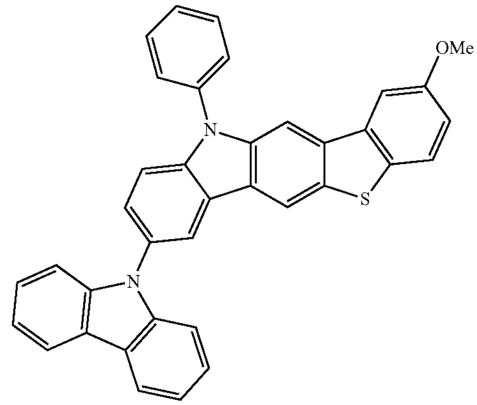
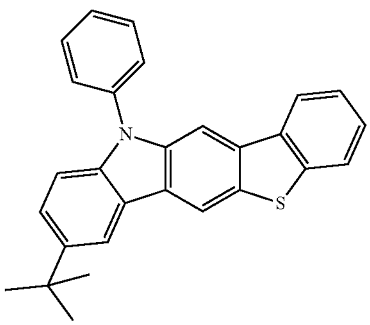
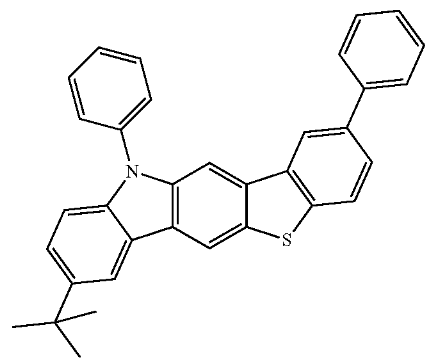
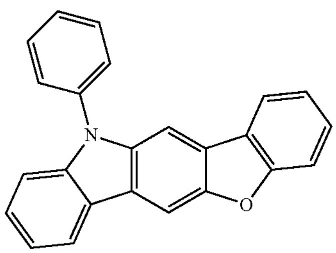
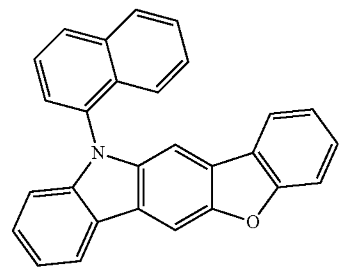
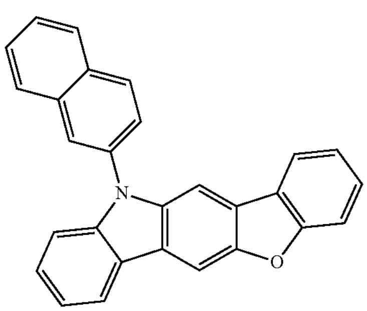
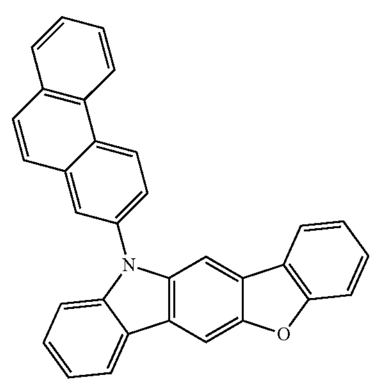

-continued
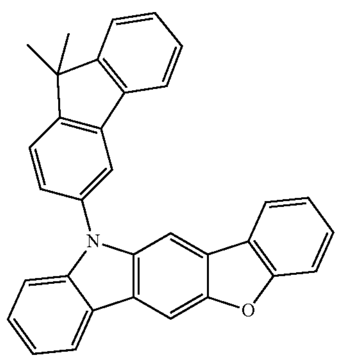
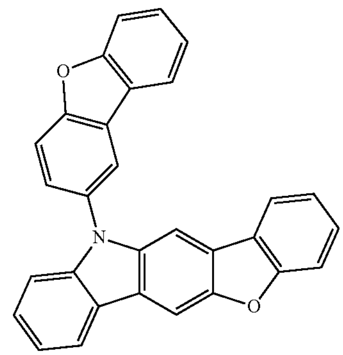
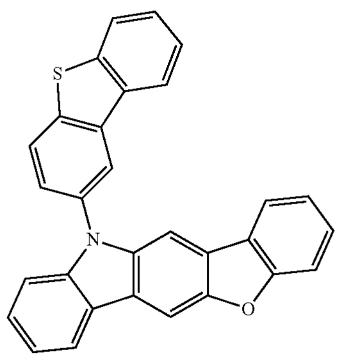
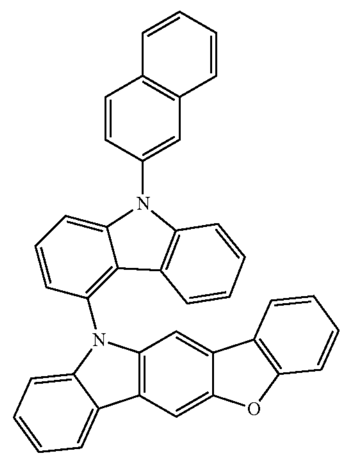
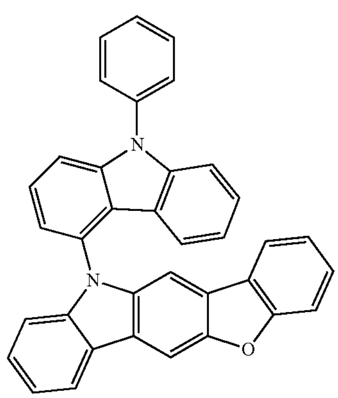
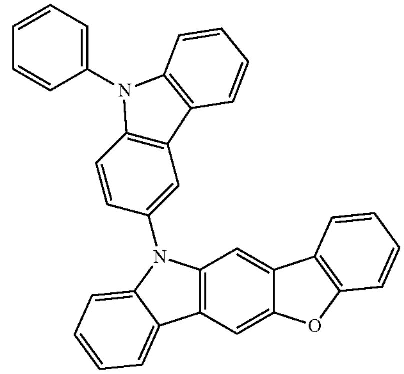
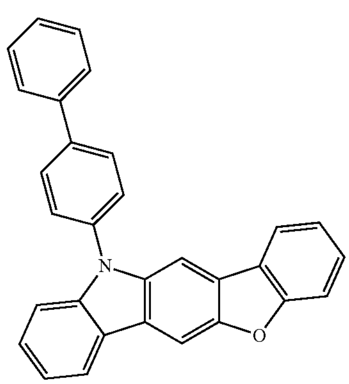
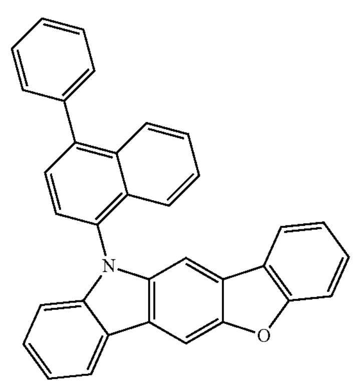

-continued
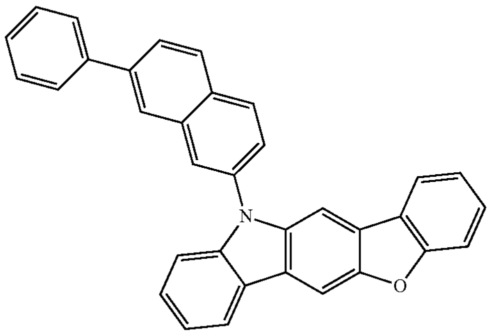
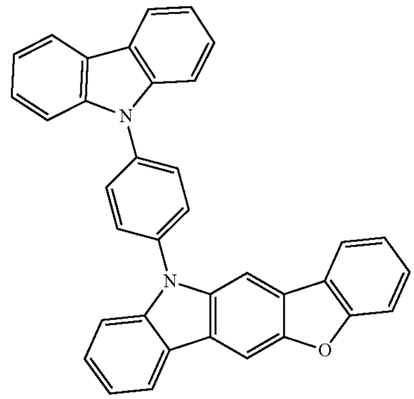
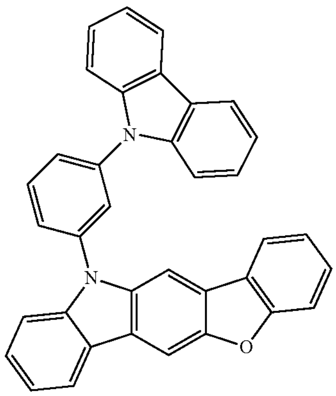
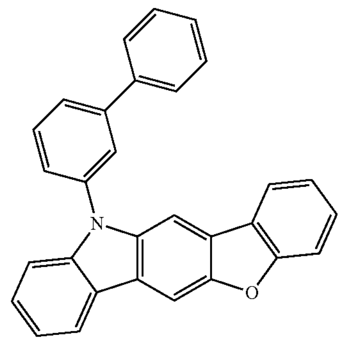
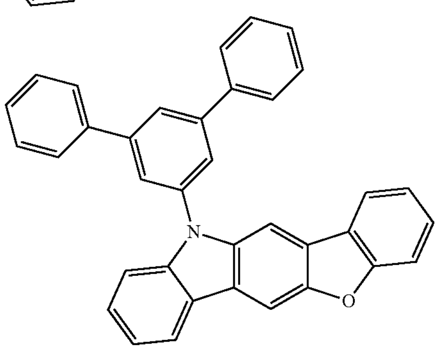
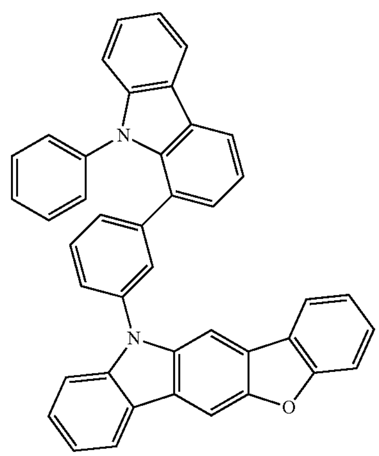
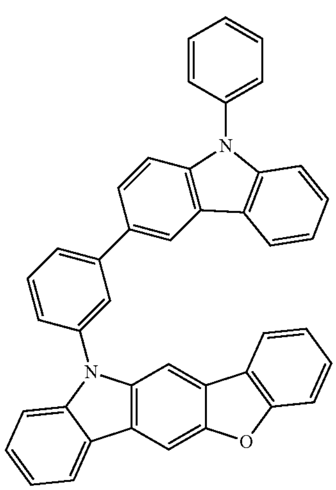
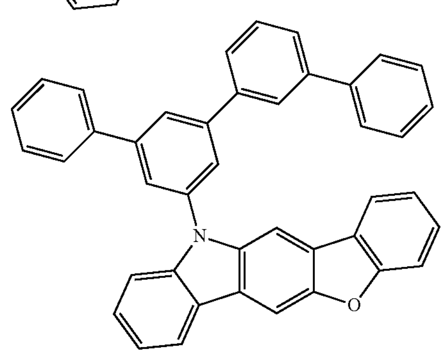

-continued
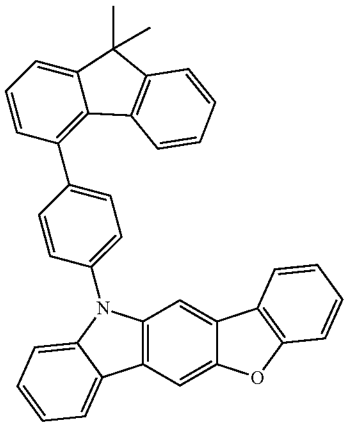
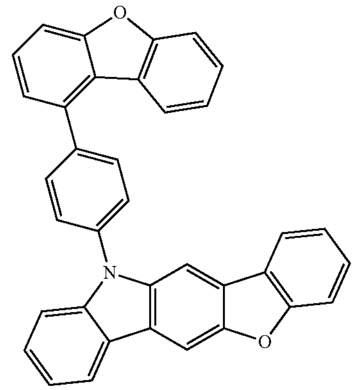
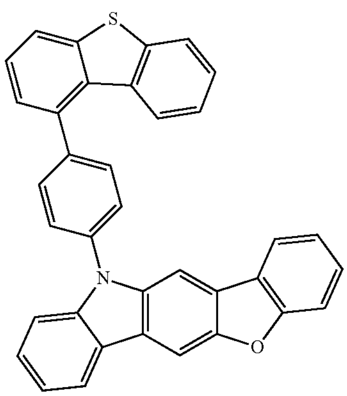
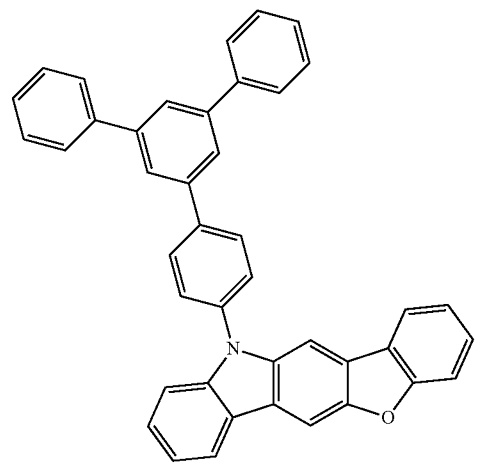
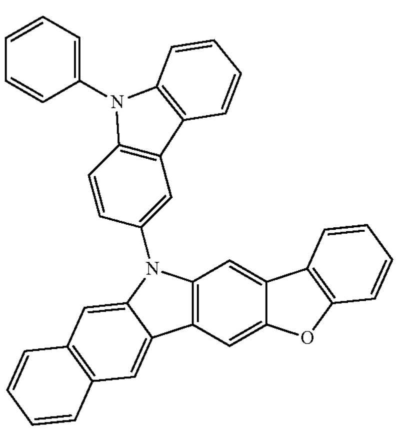
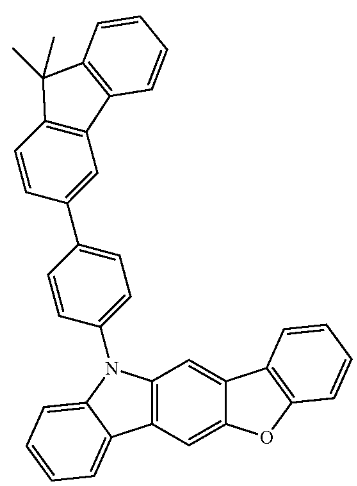

-continued
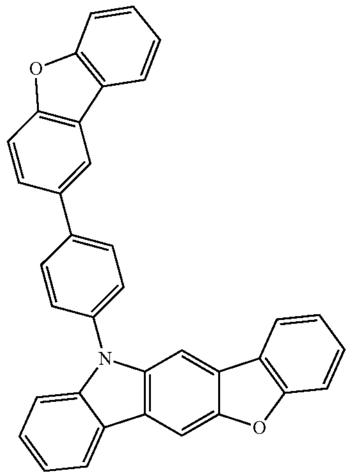
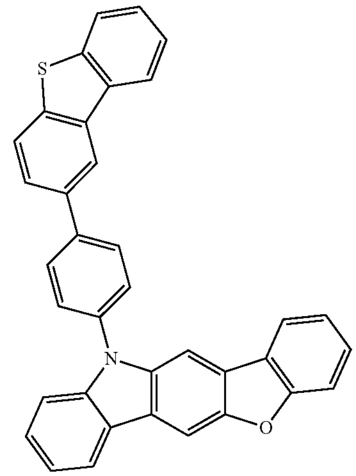
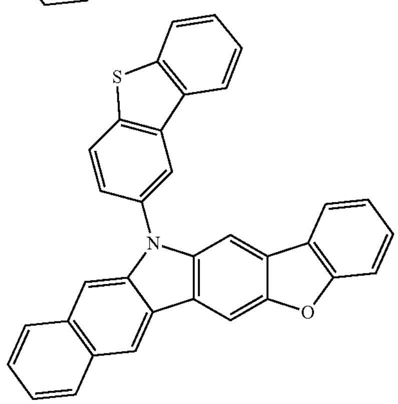
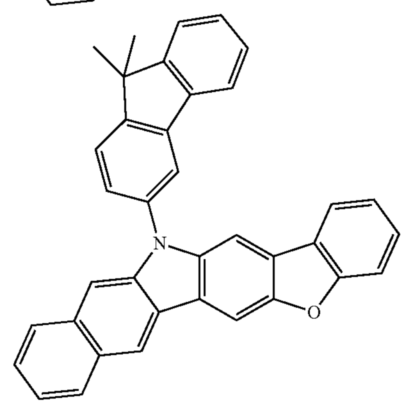
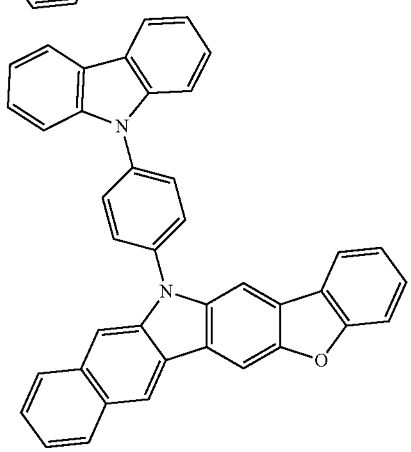
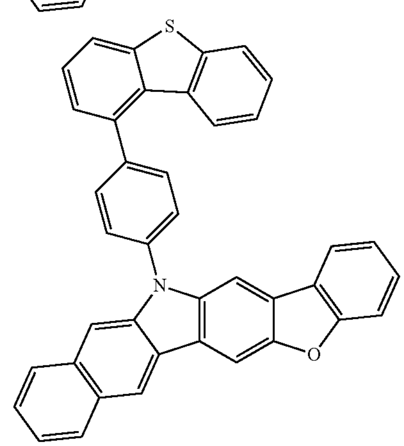
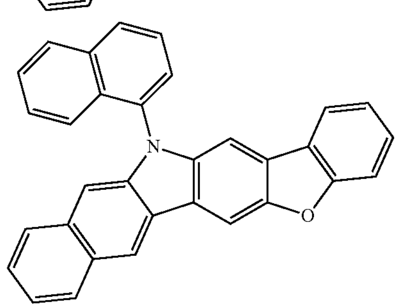
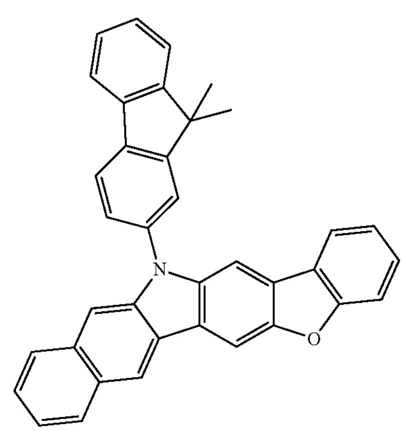

-continued
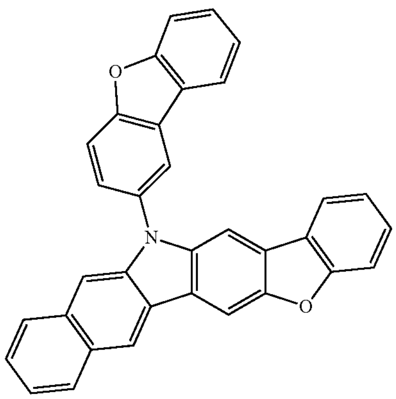
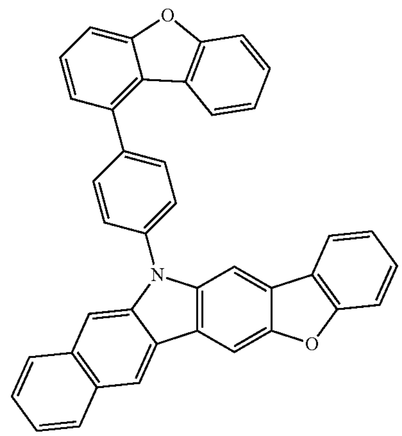
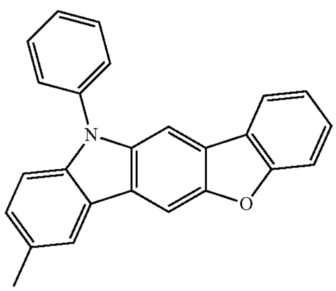
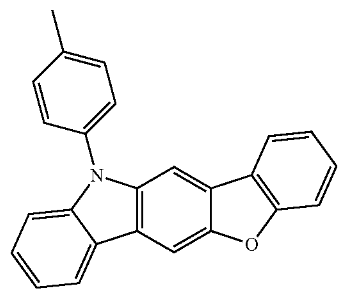
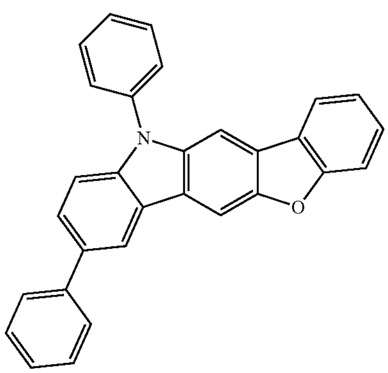
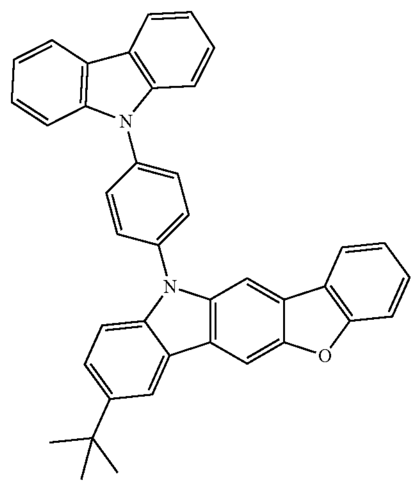
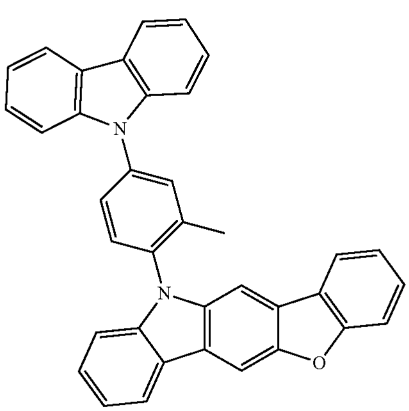
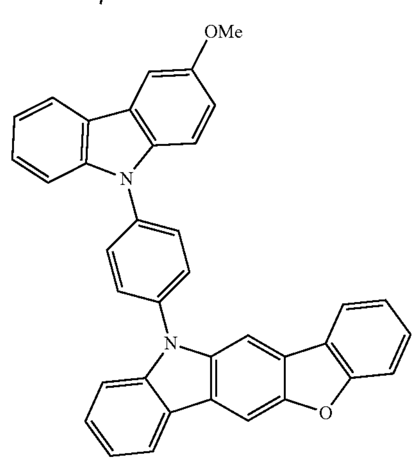

-continued
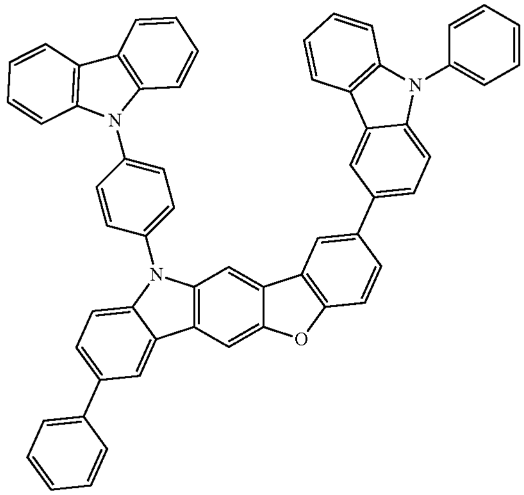
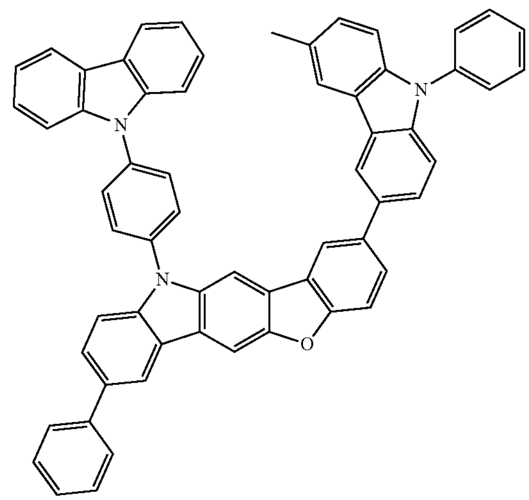
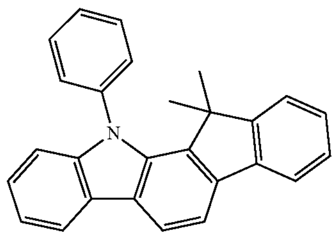
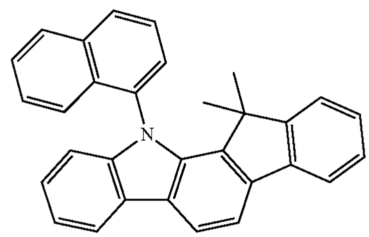
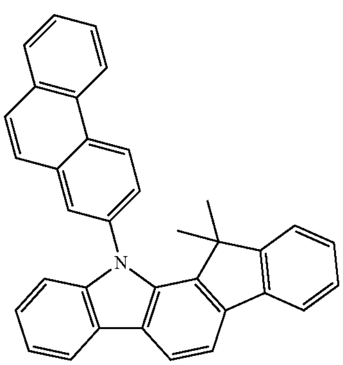
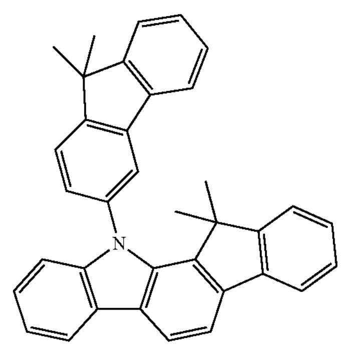
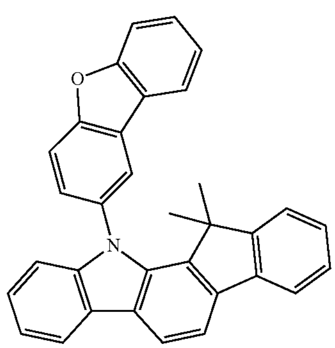
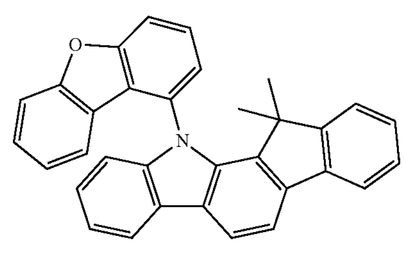
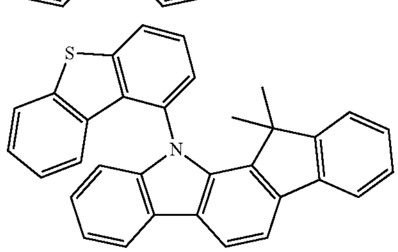
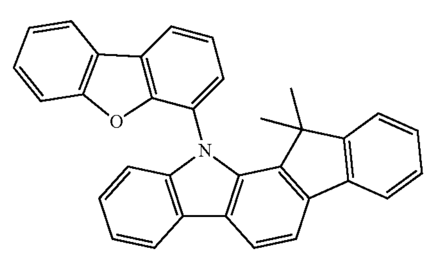

-continued
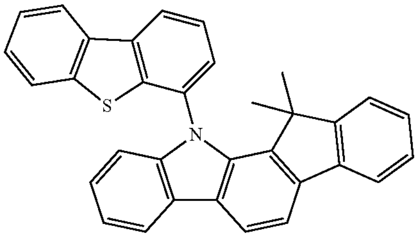
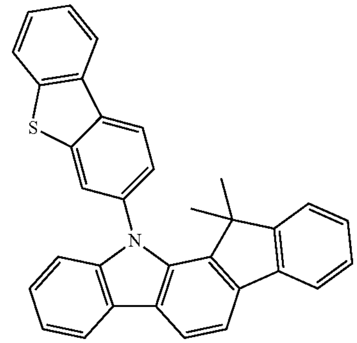
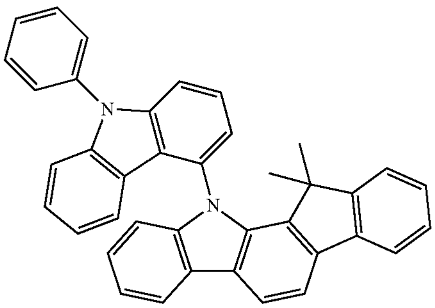
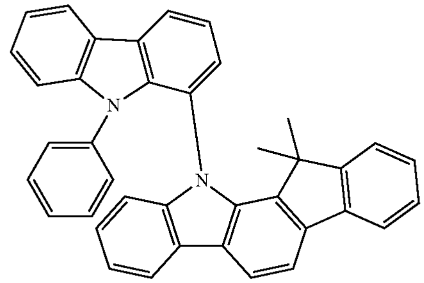
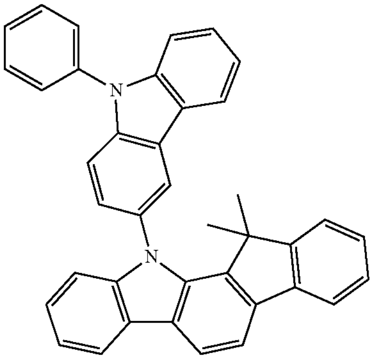
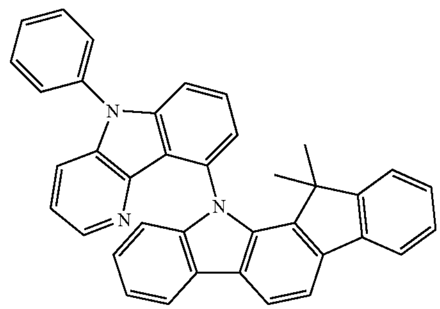
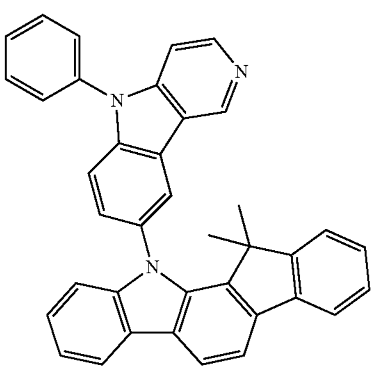
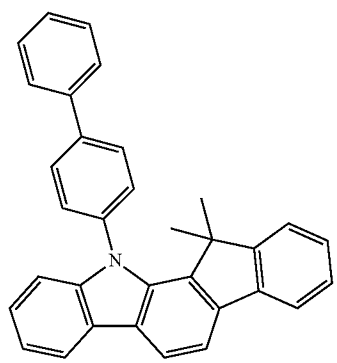
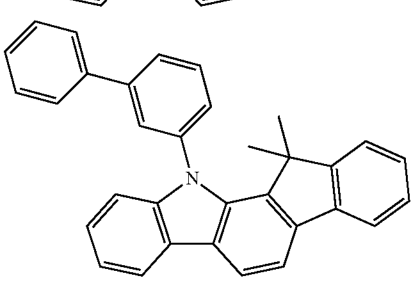
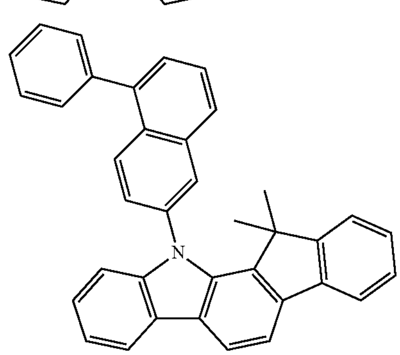

-continued
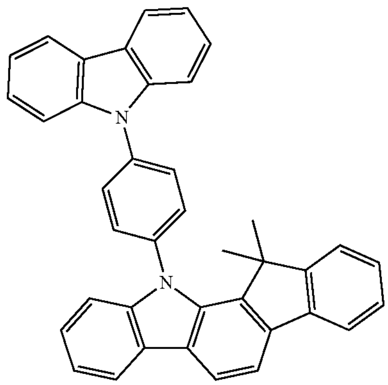
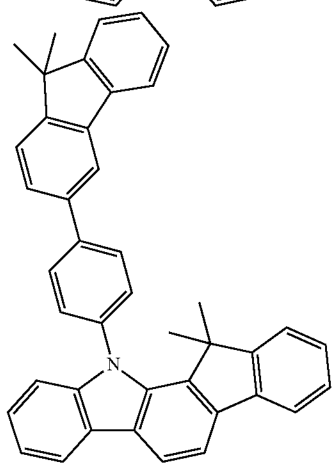
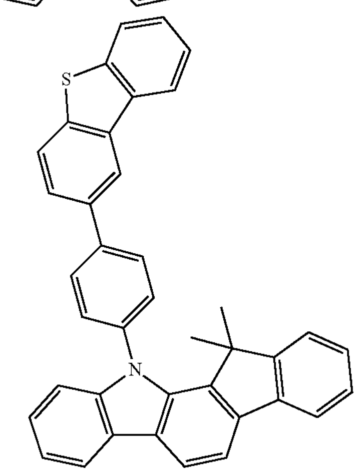
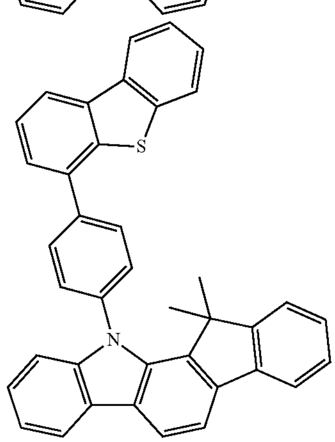
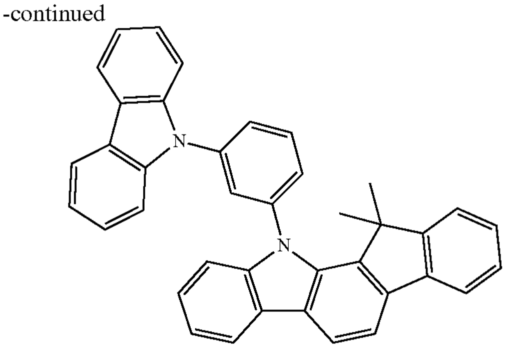
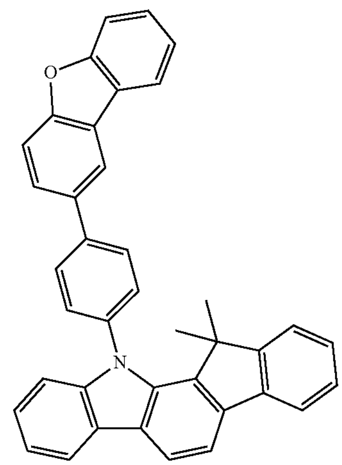
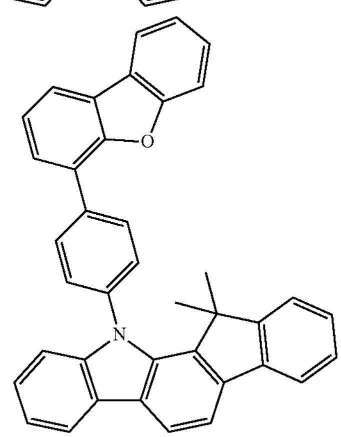
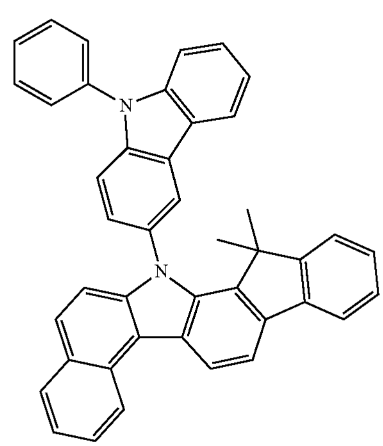

-continued
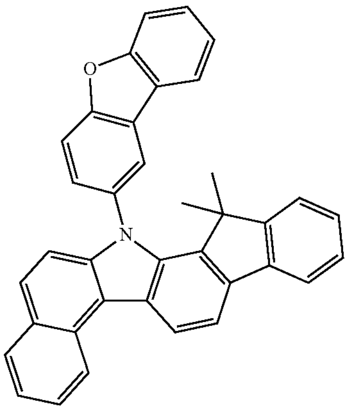
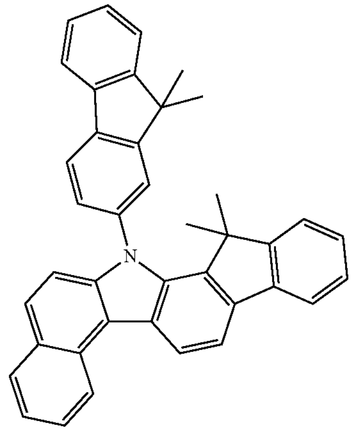
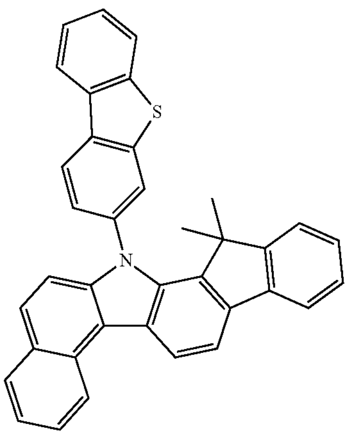
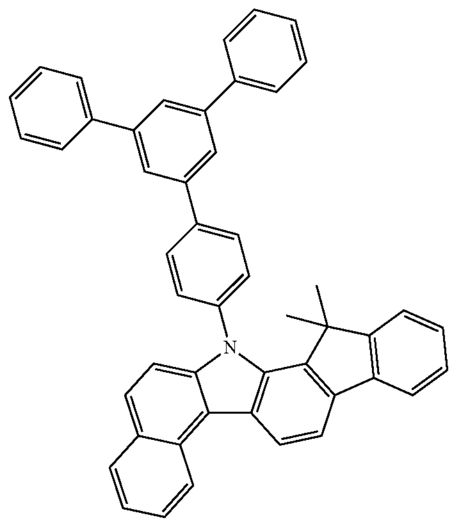
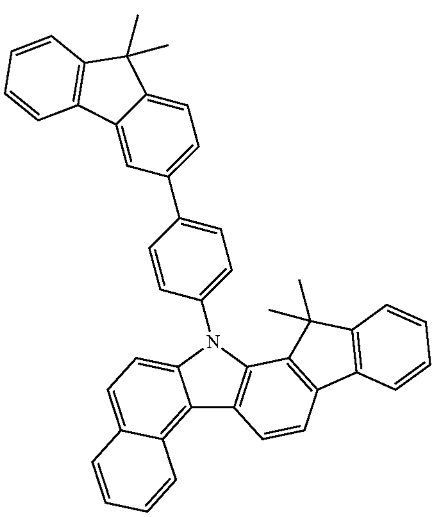
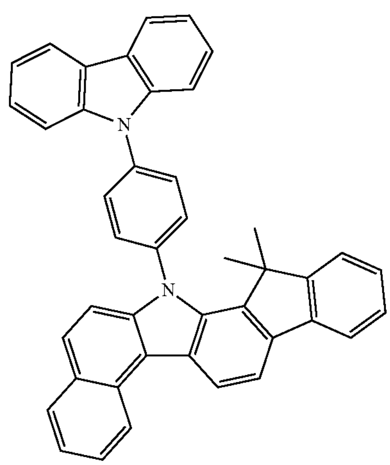

-continued
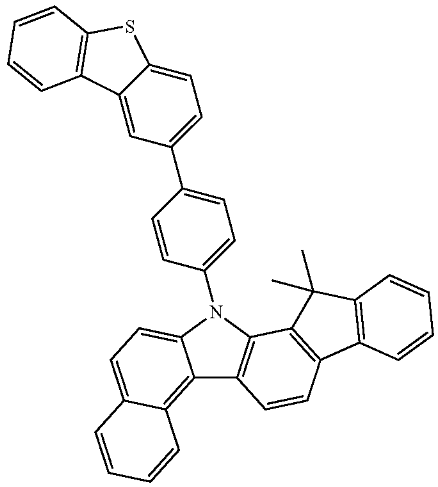
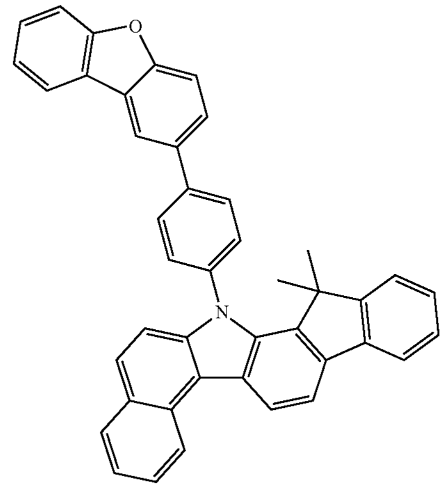
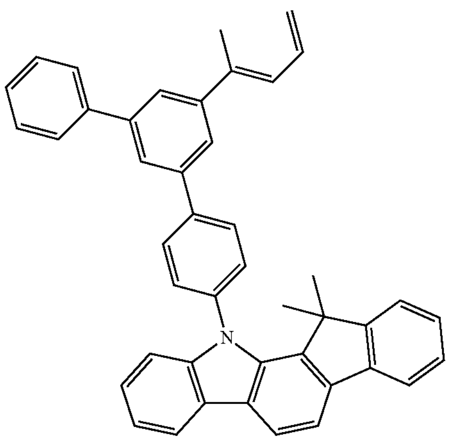
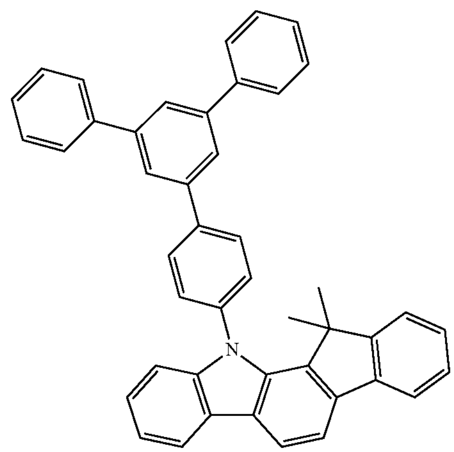
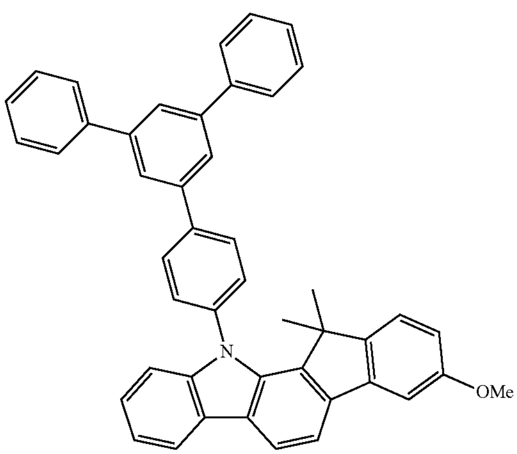
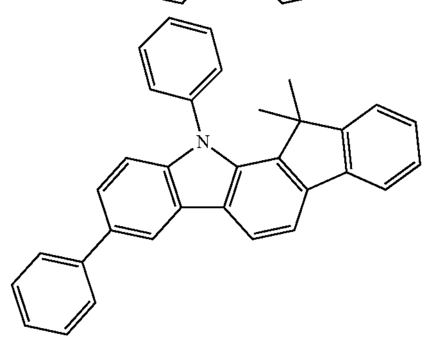
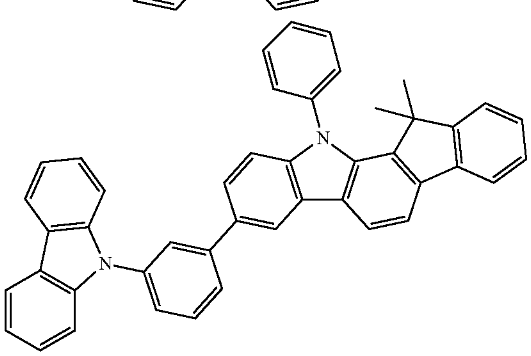
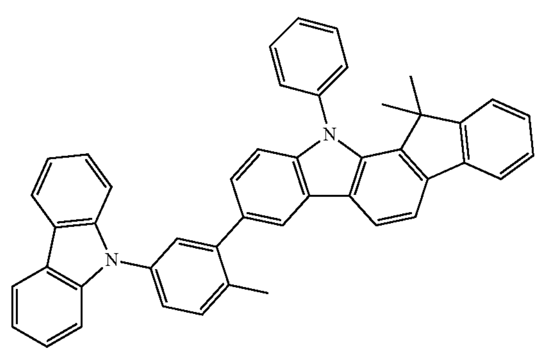

-continued
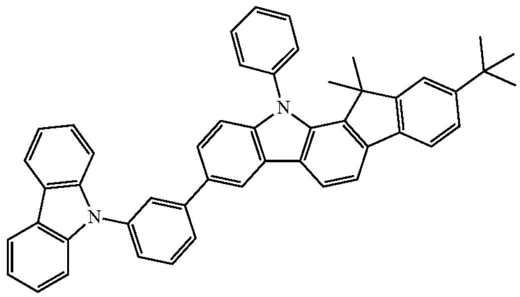
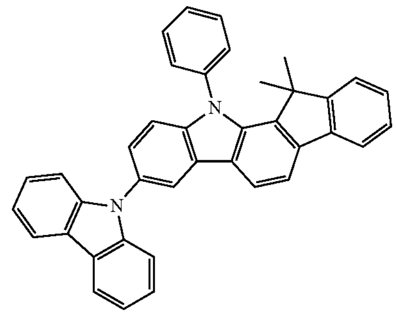
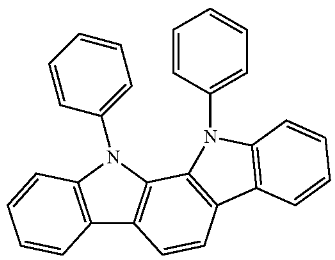
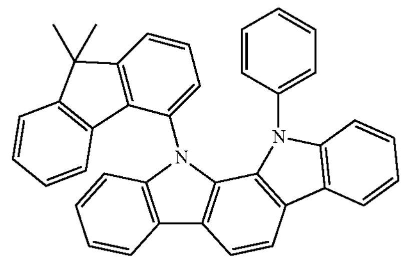
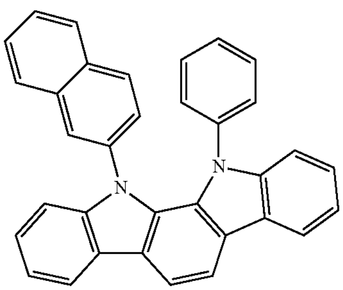
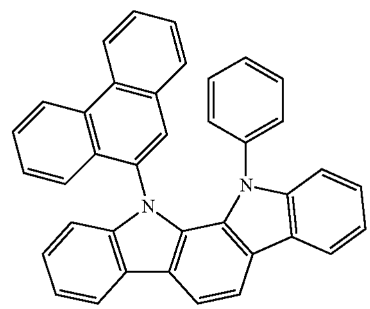
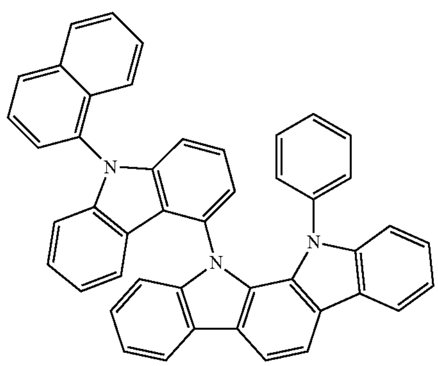
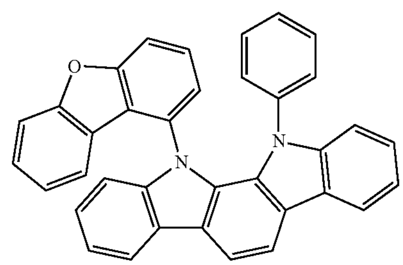
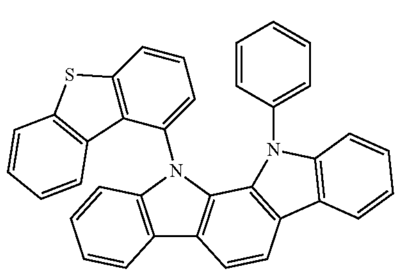
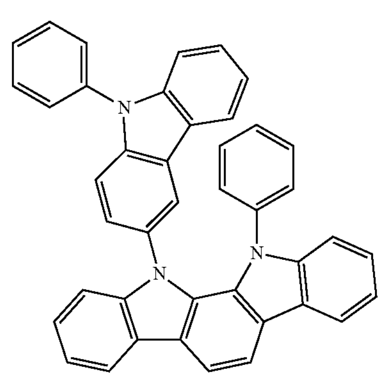

-continued
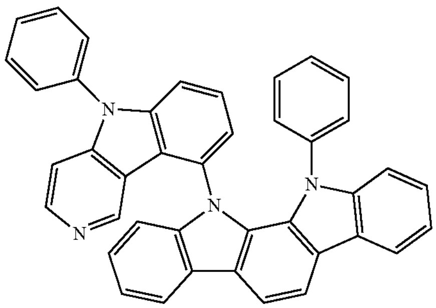
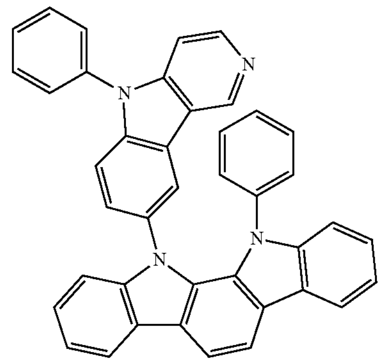
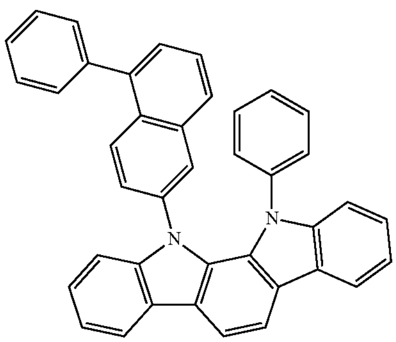
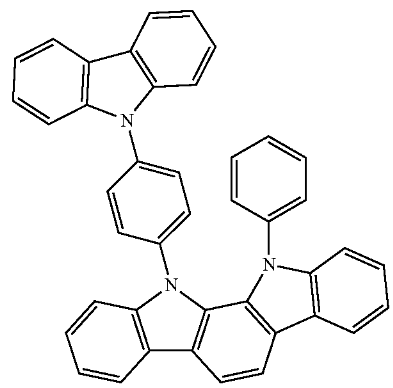
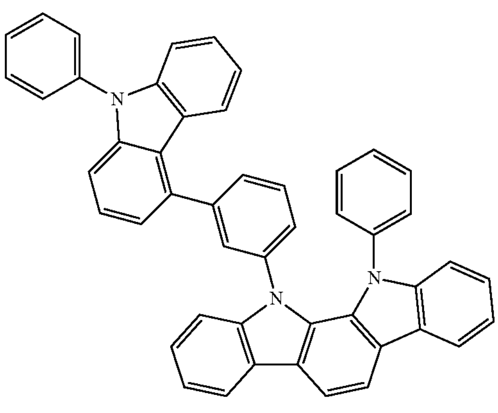
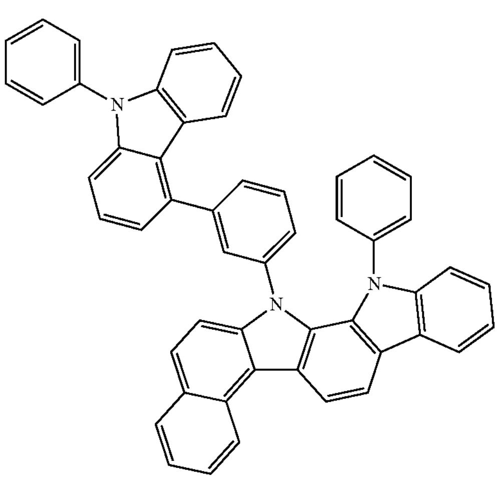
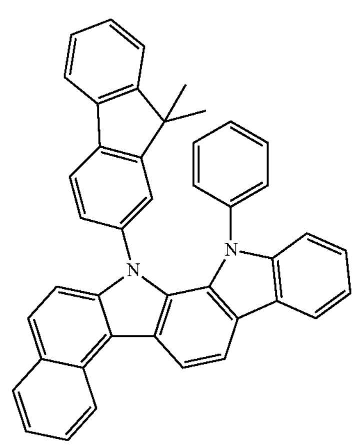

-continued
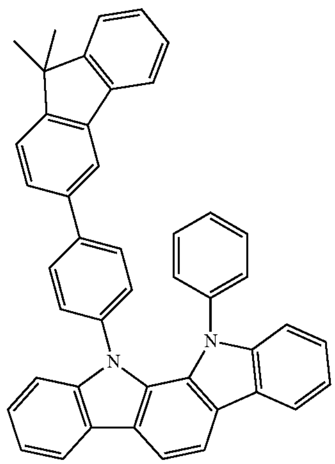
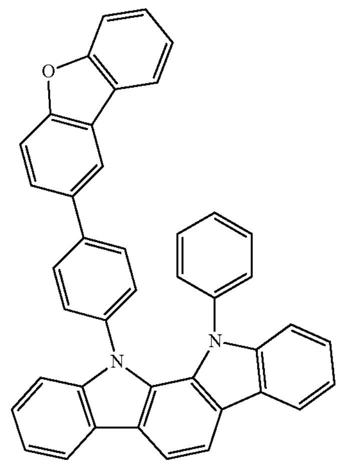
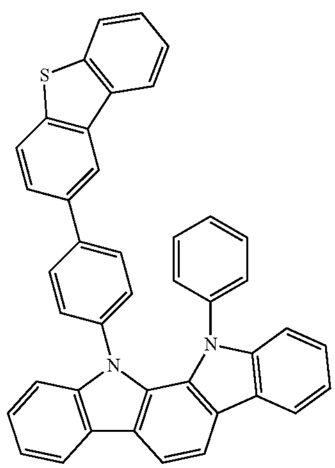
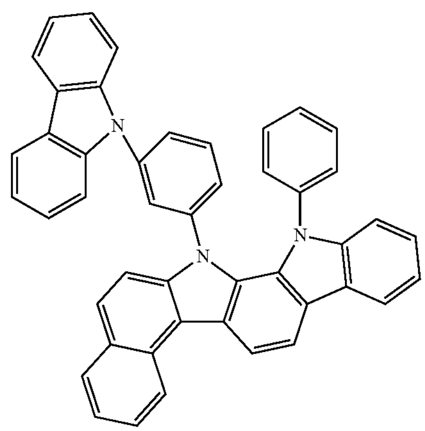
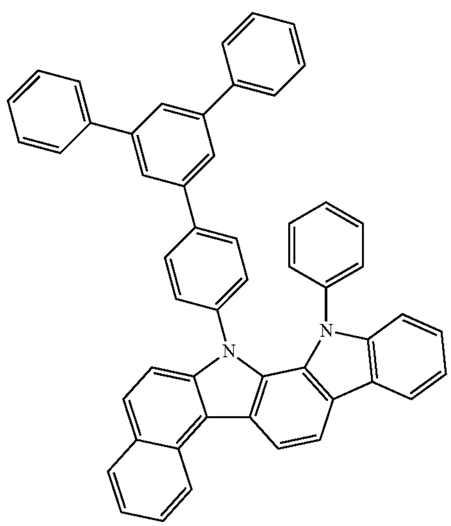
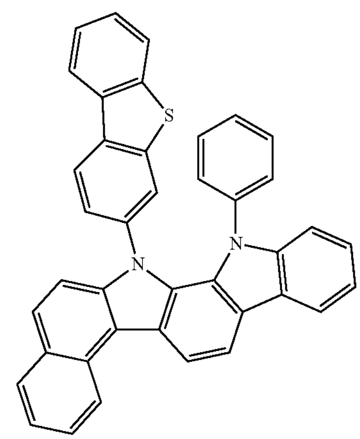

-continued
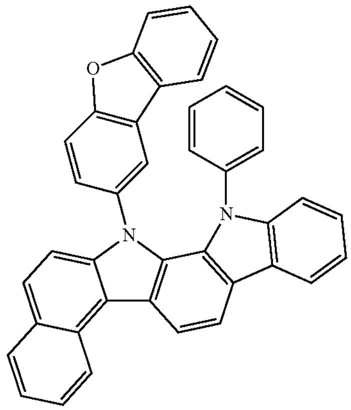
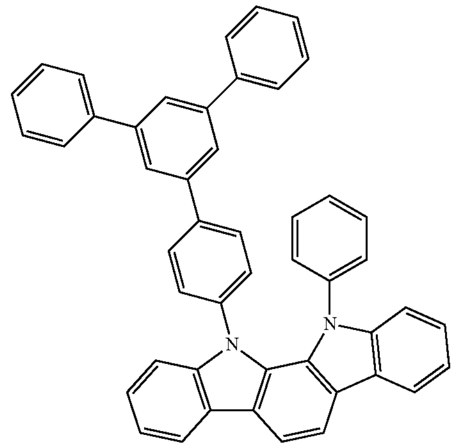
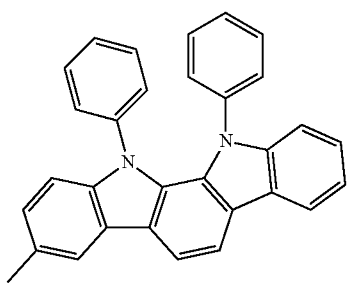
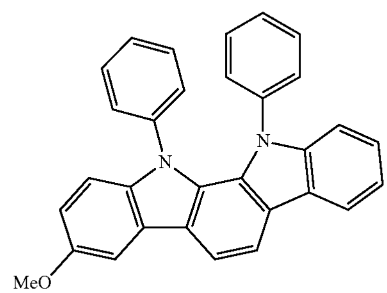
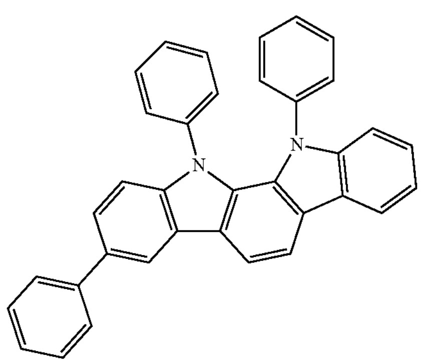
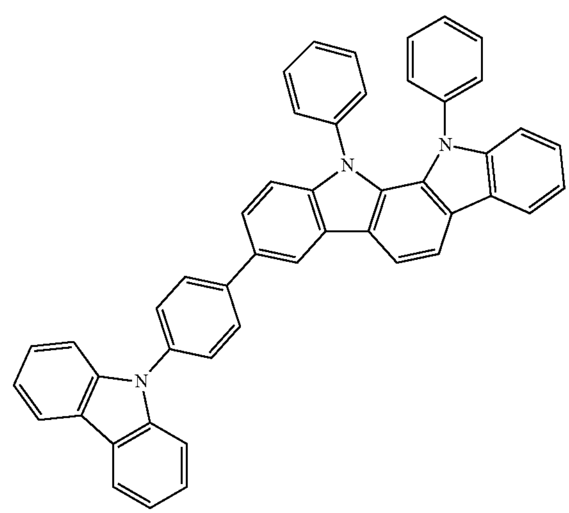

-continued
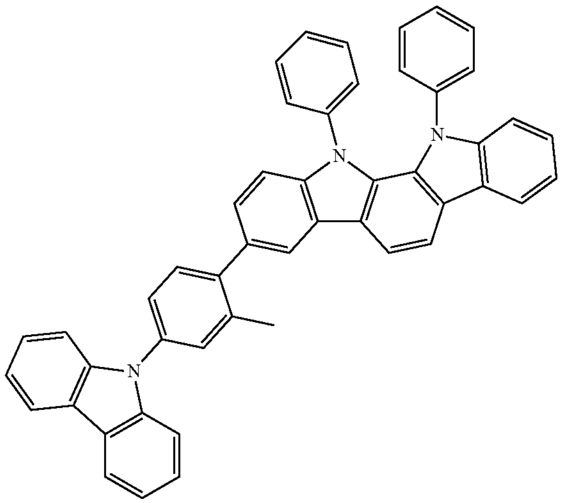
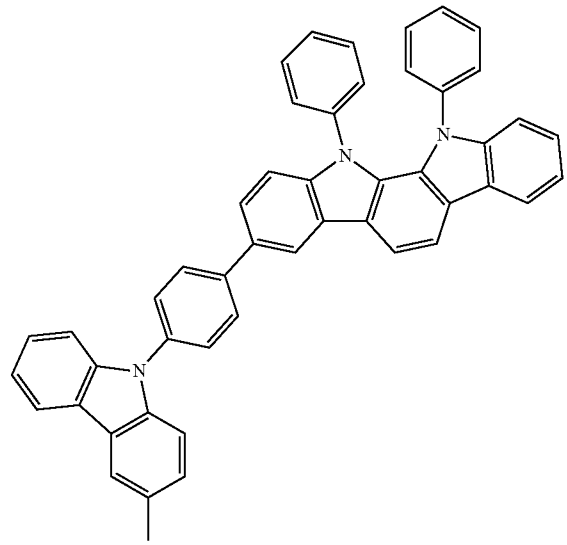
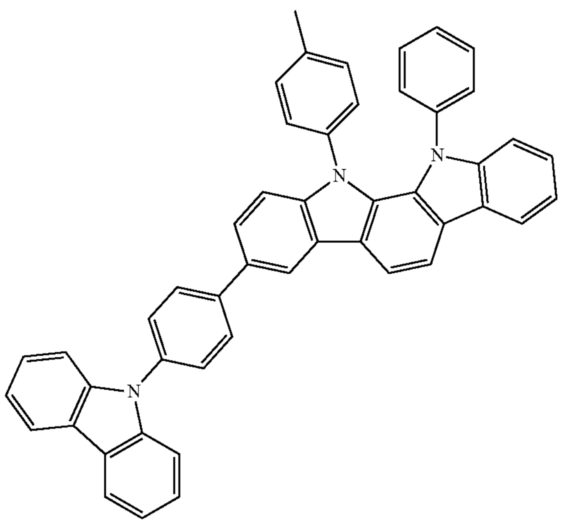
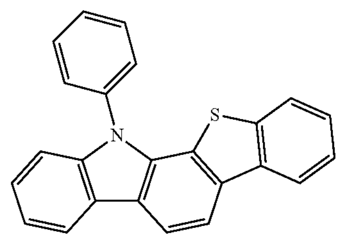
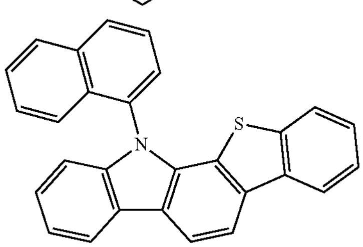
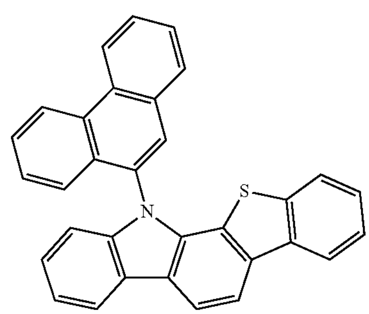
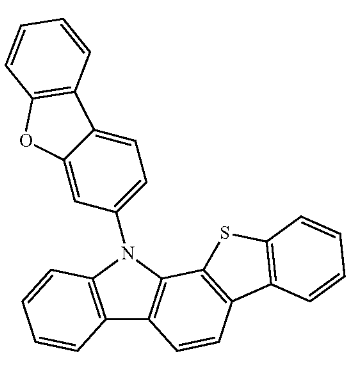
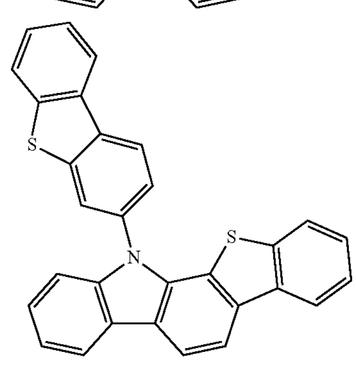

-continued
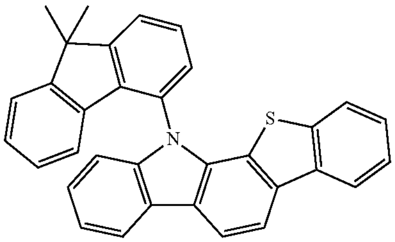
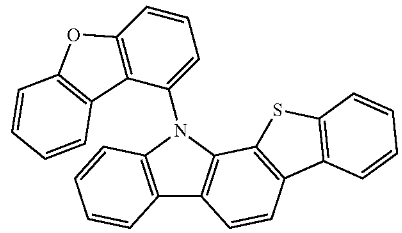
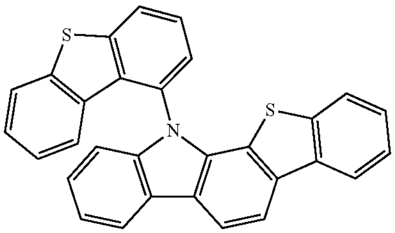
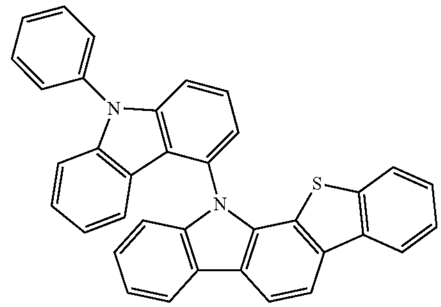
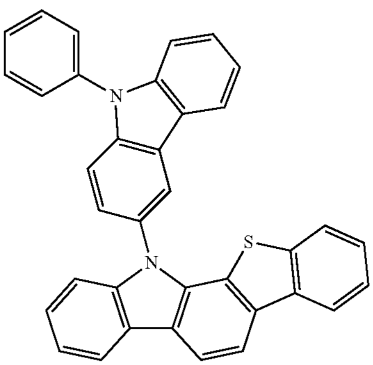
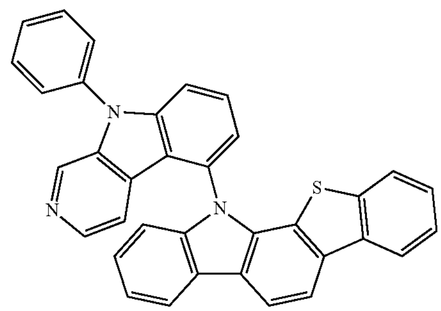
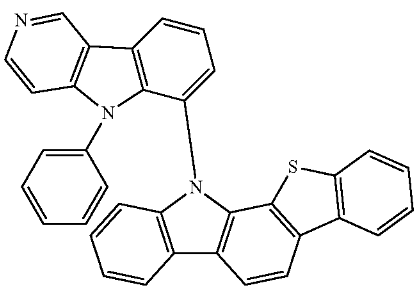
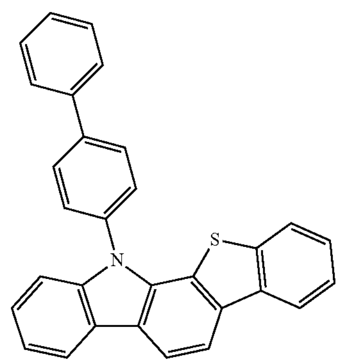
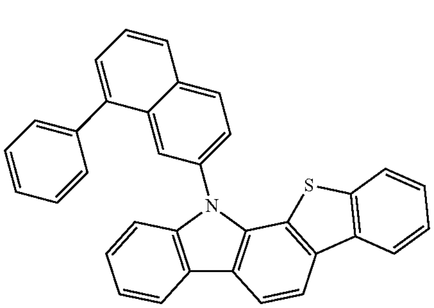
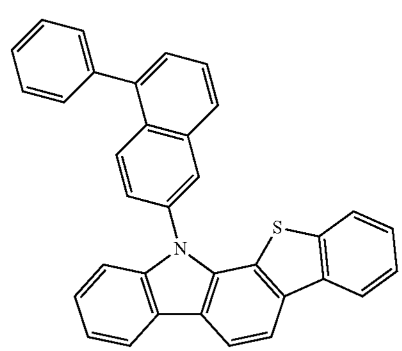

-continued
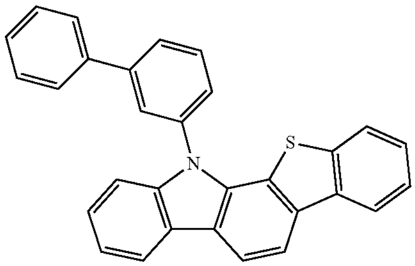
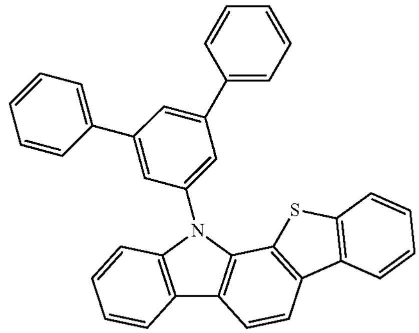
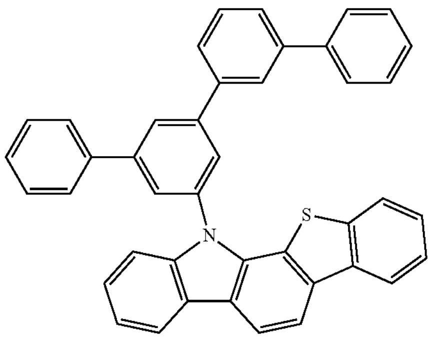
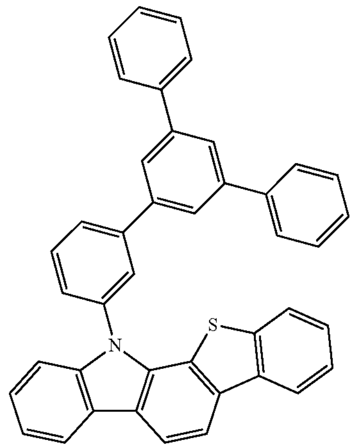
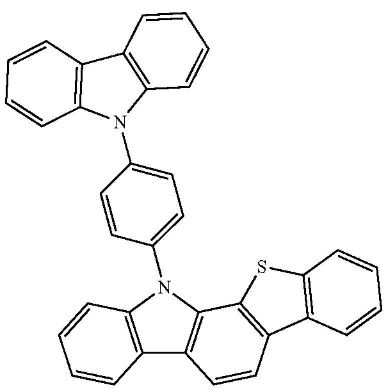
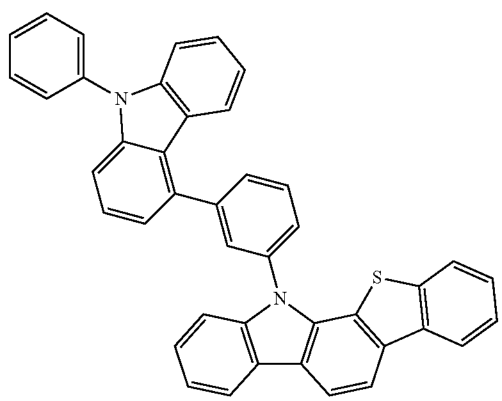
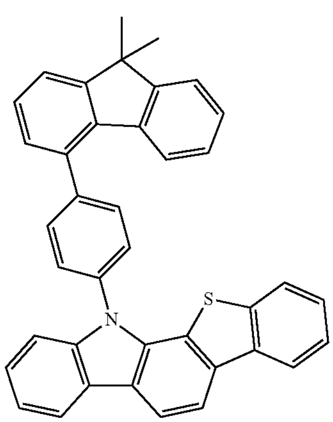
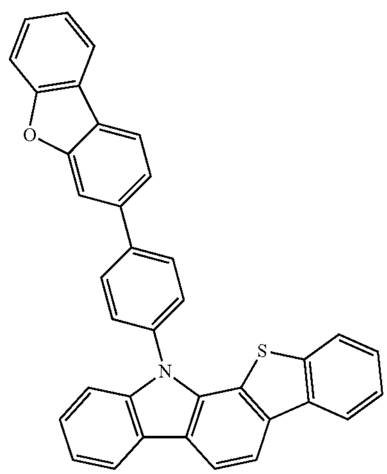

-continued
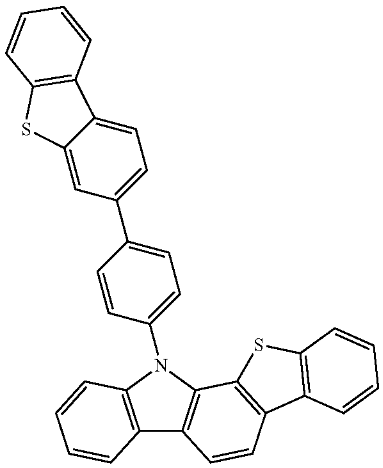
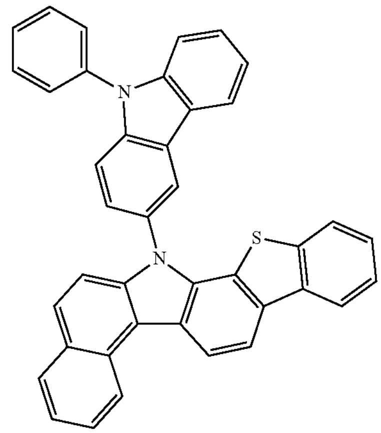
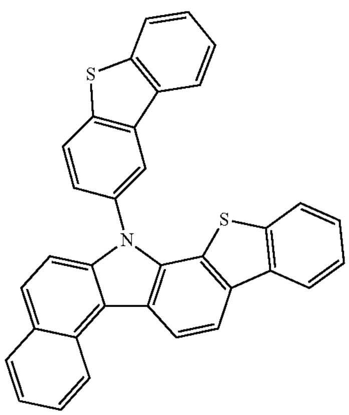
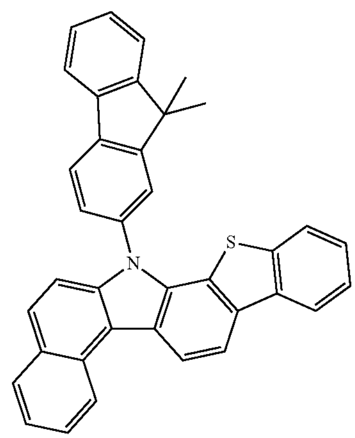
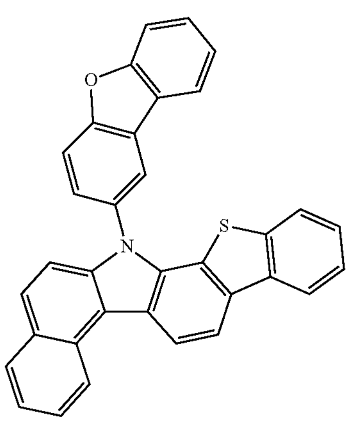
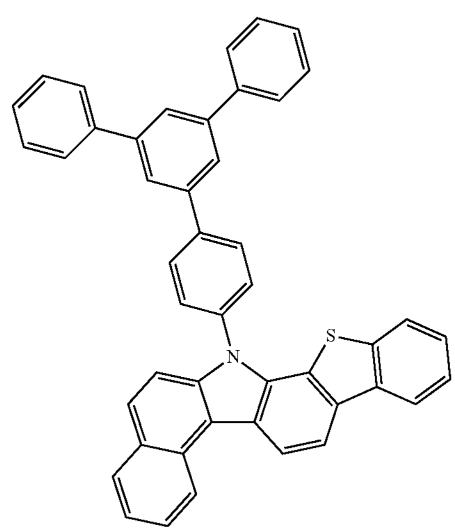

-continued
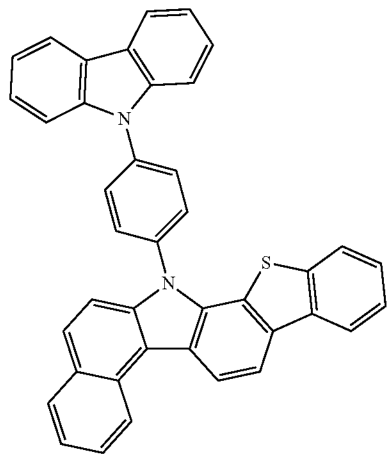
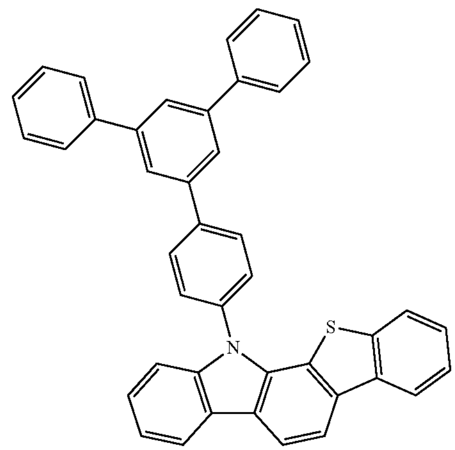
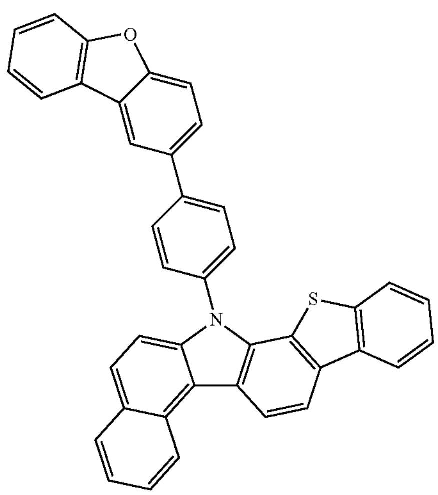
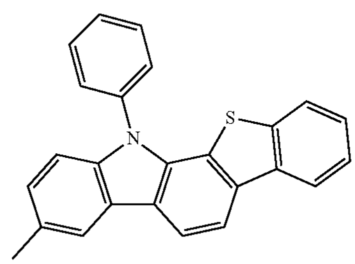
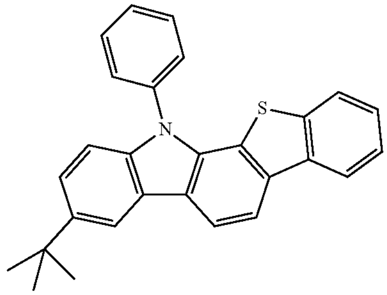
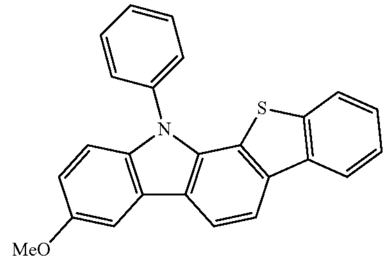

-continued
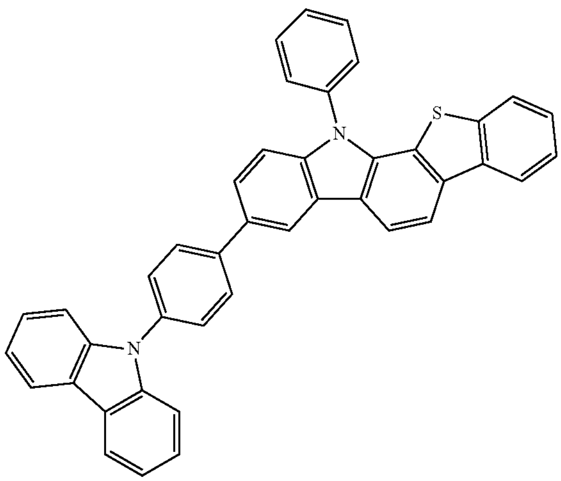
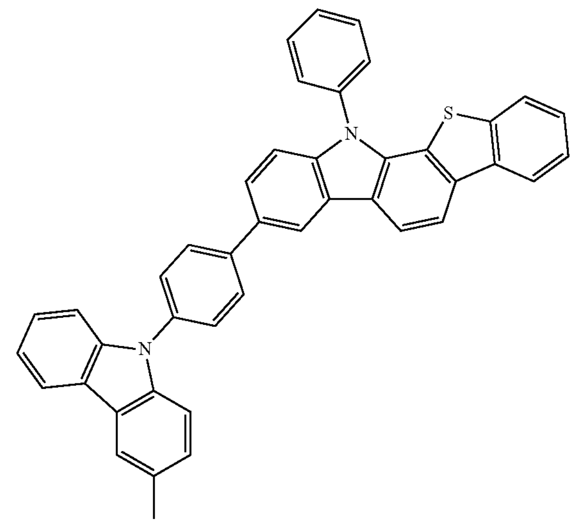
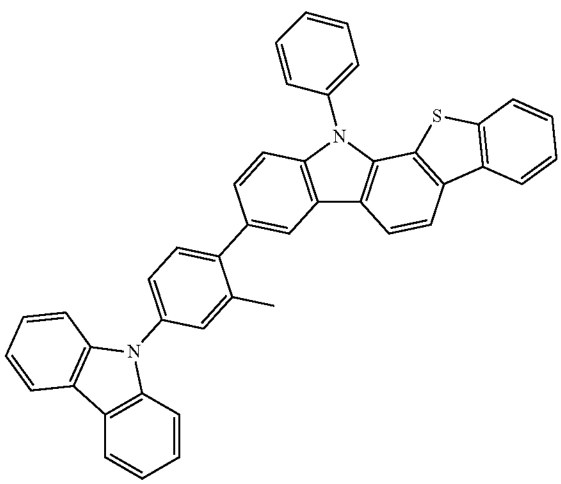
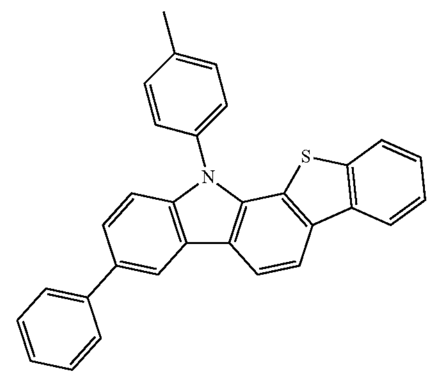
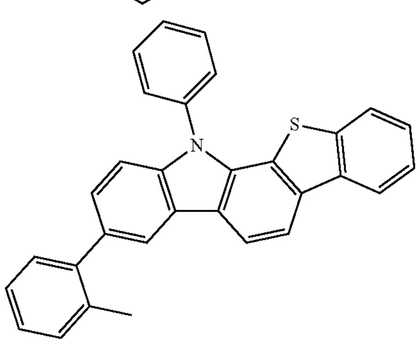
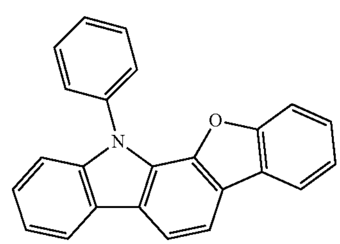
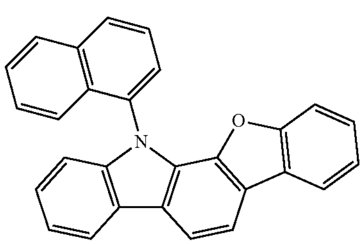
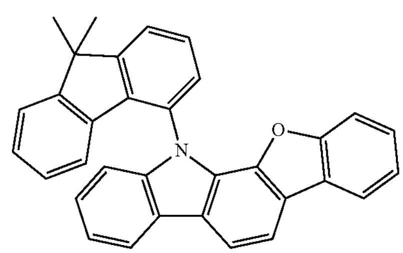

-continued
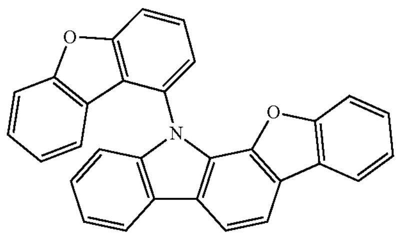
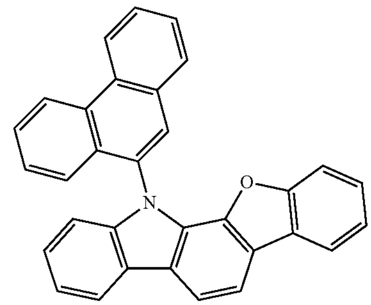
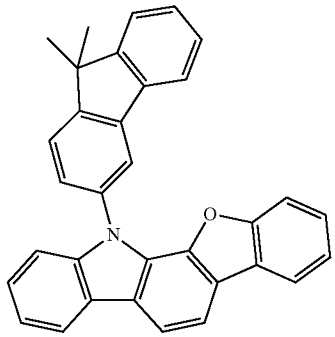
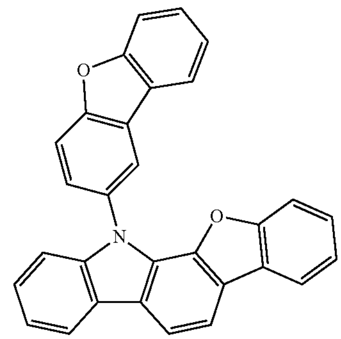
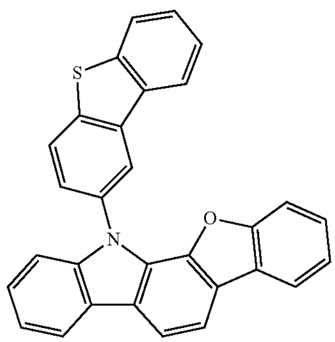
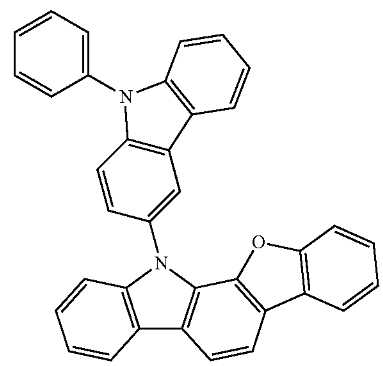
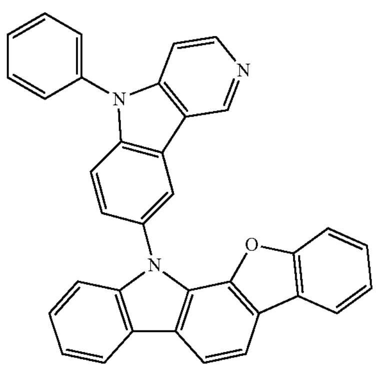
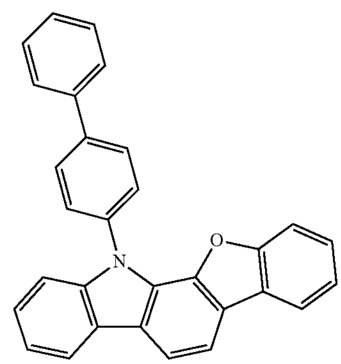
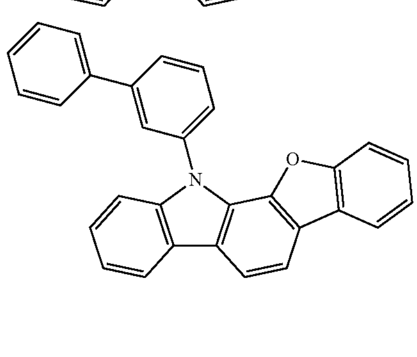
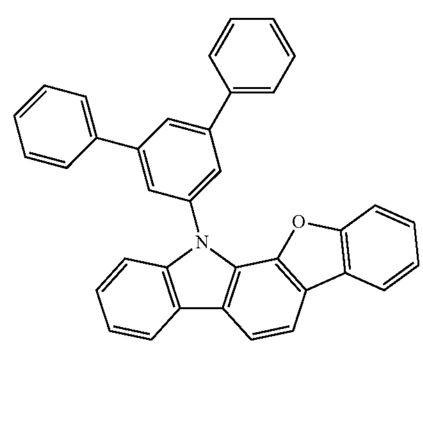

-continued
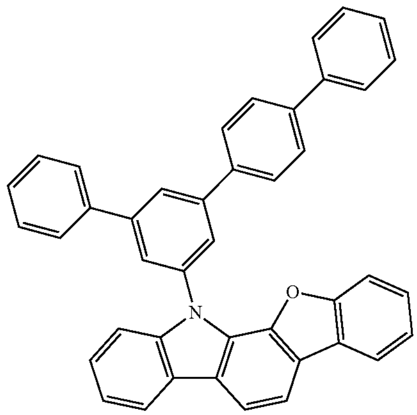
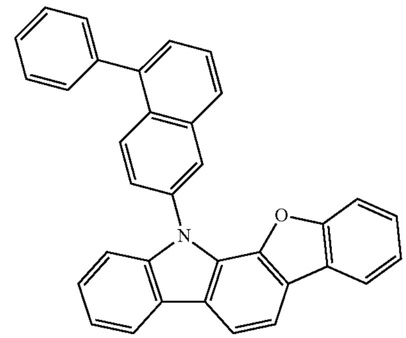
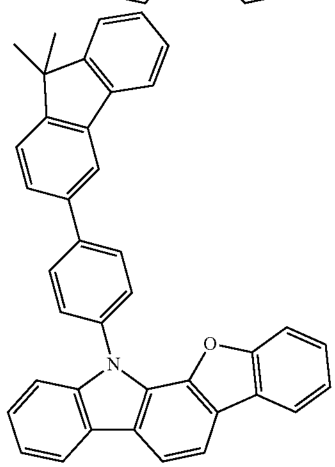
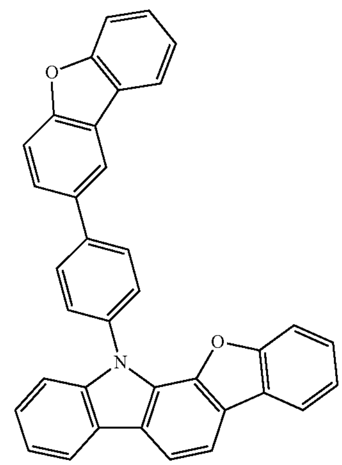
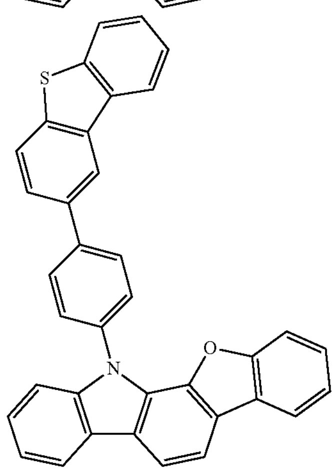
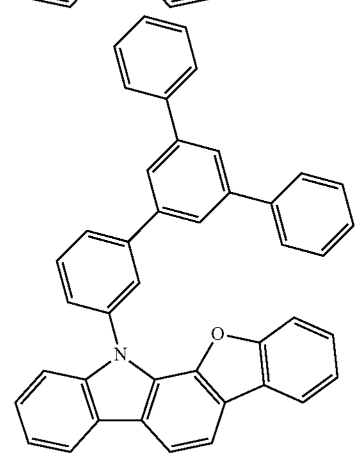
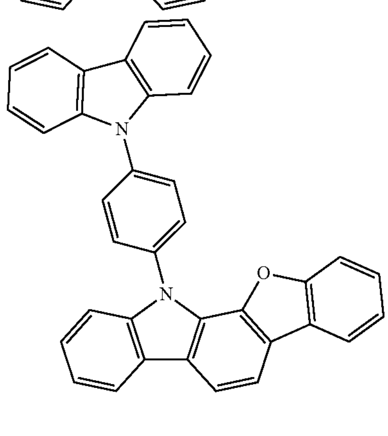
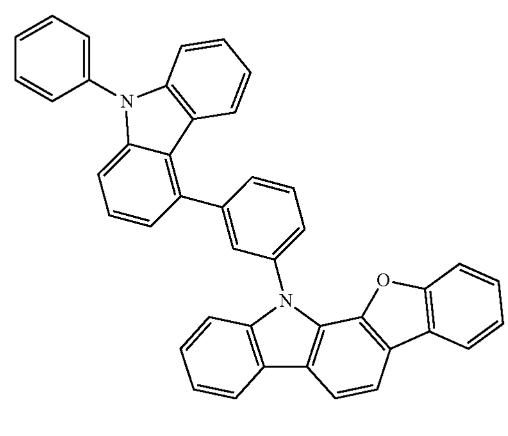

-continued
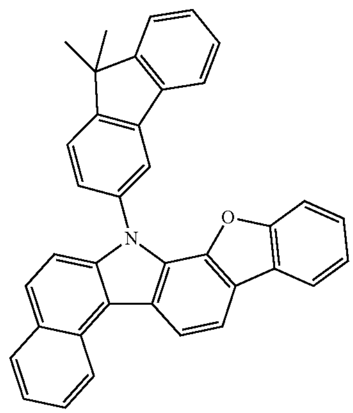
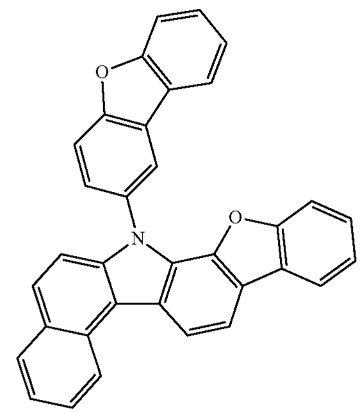
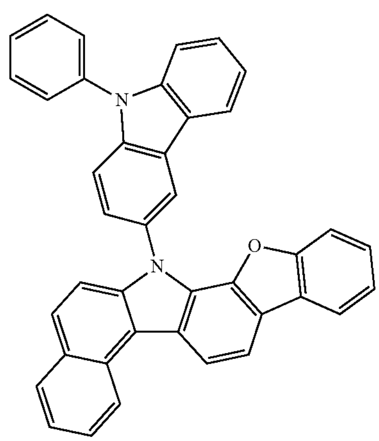
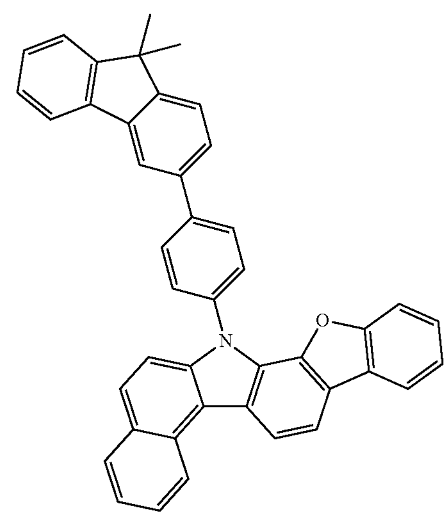
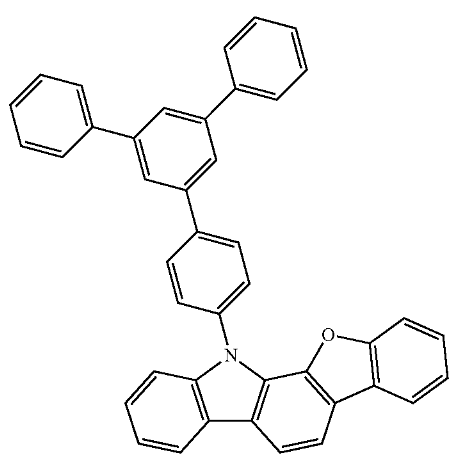
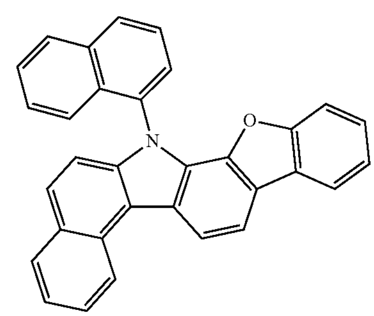

-continued
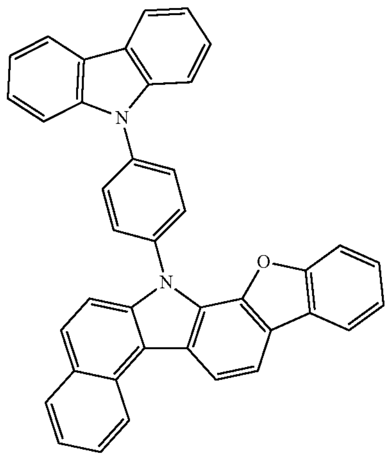
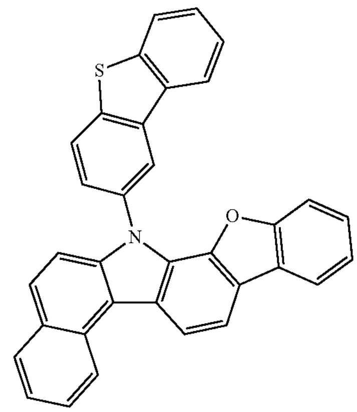
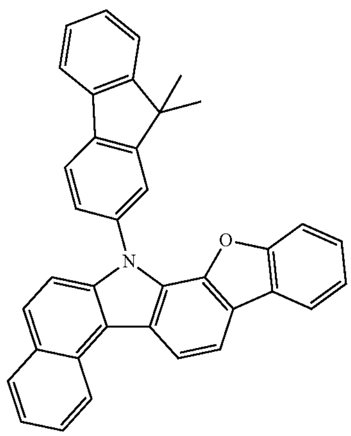
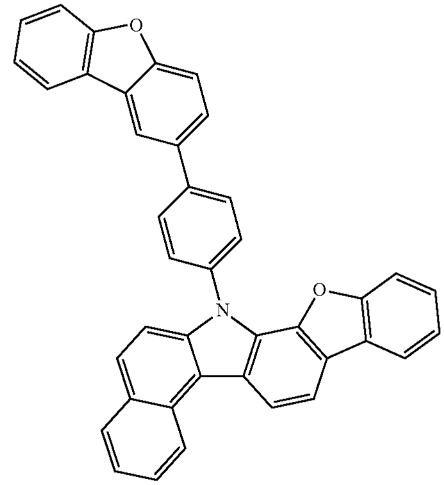
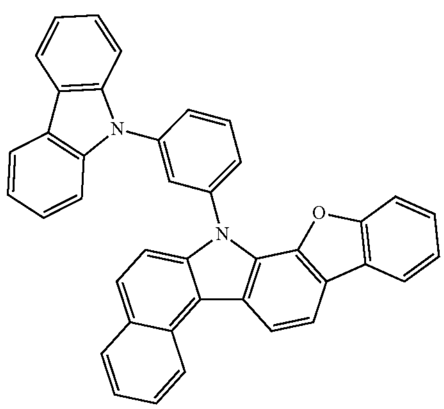
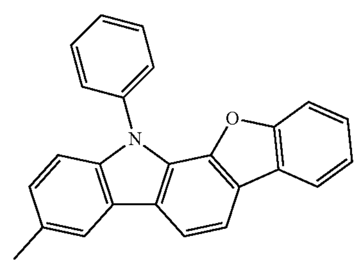
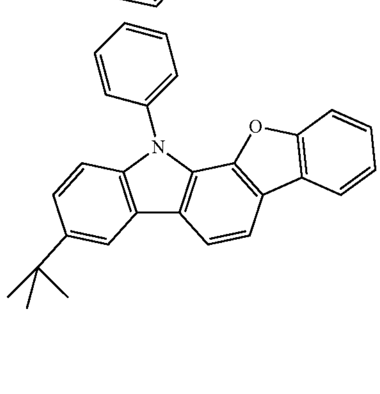
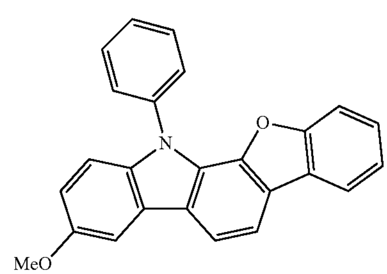

-continued
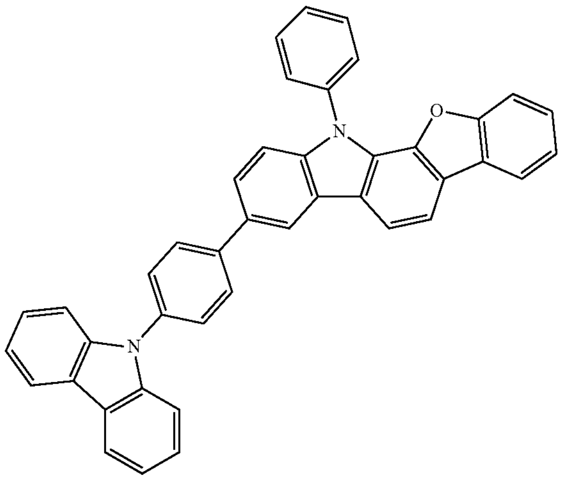
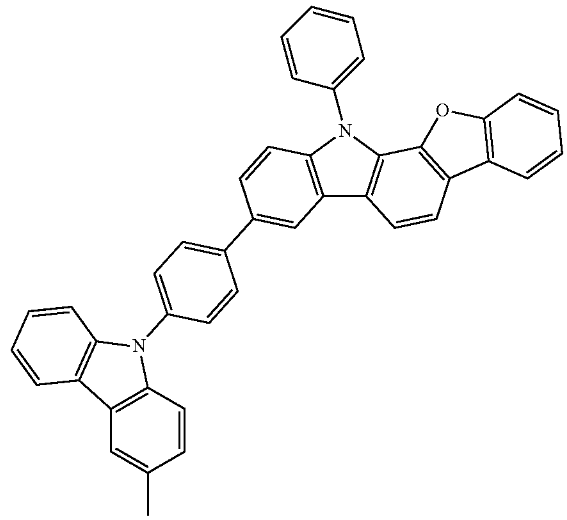
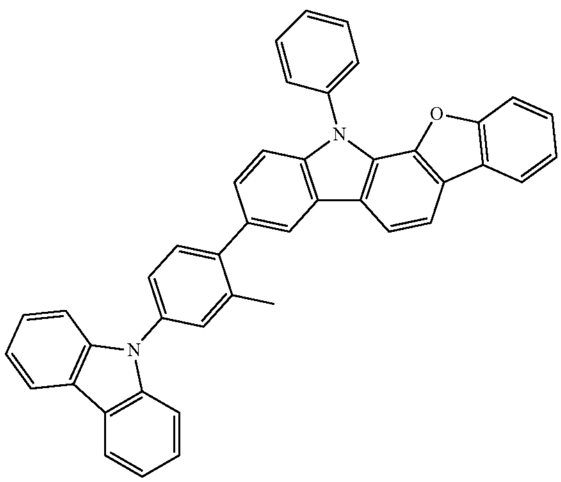
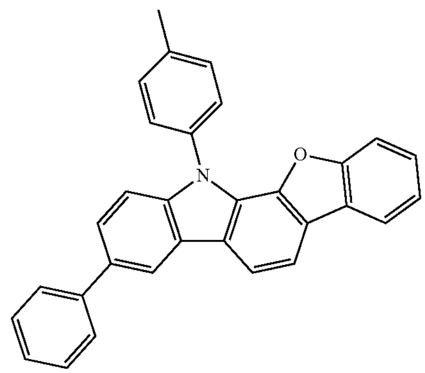
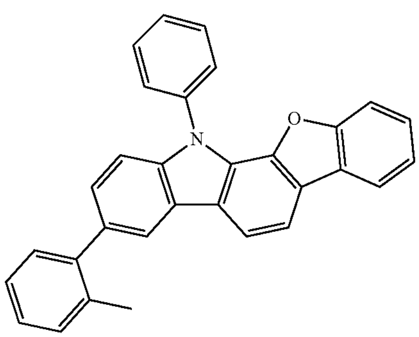
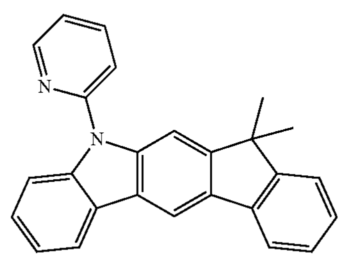
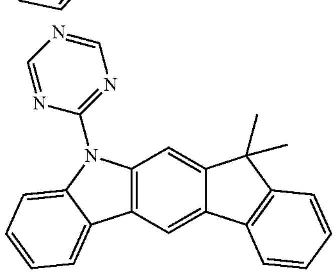
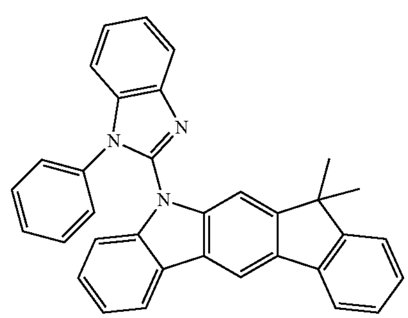

-continued
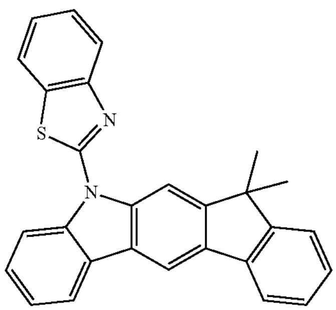
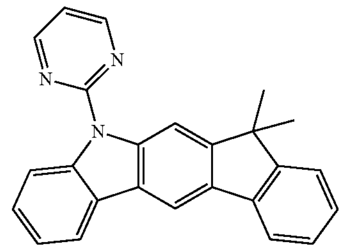
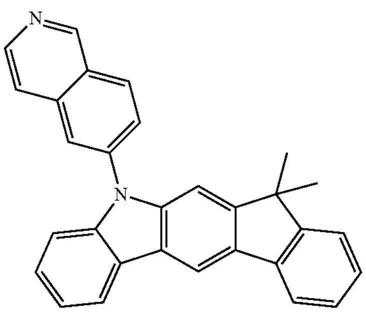
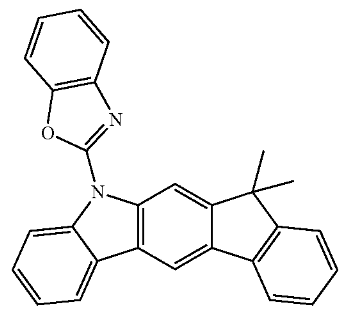
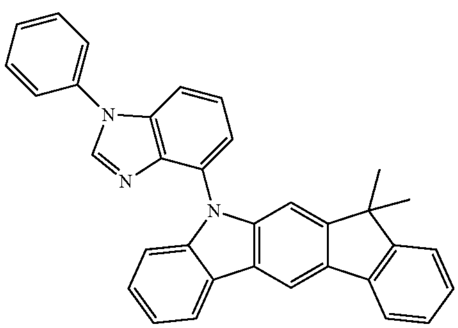
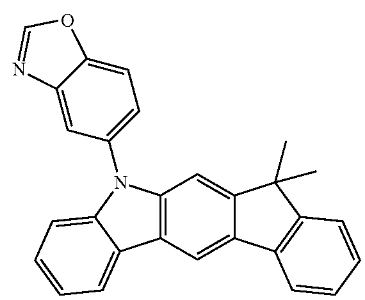
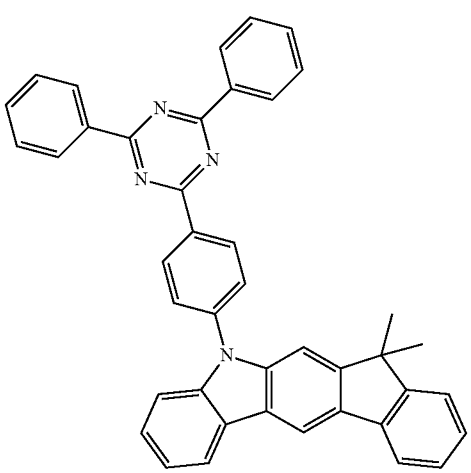
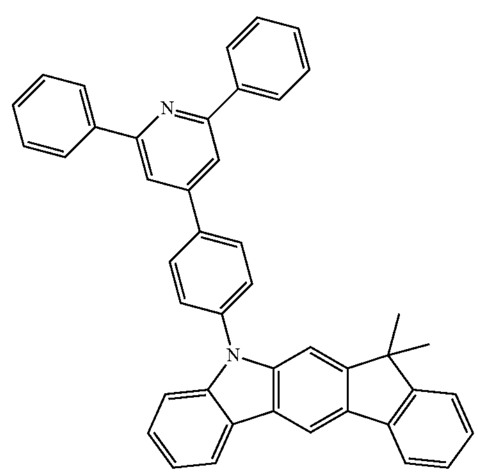

-continued
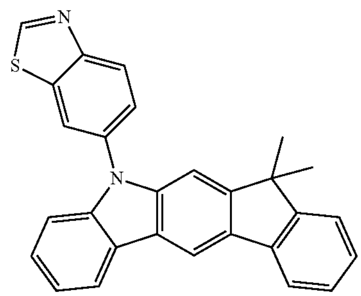
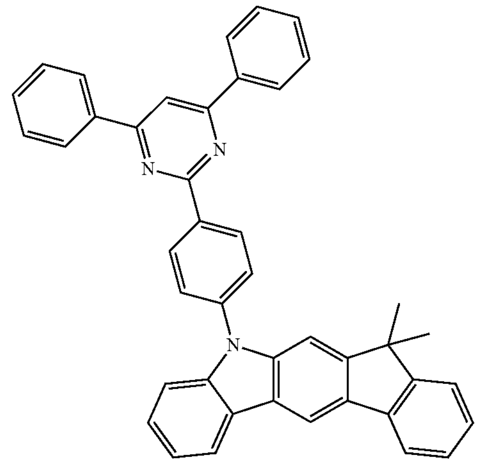
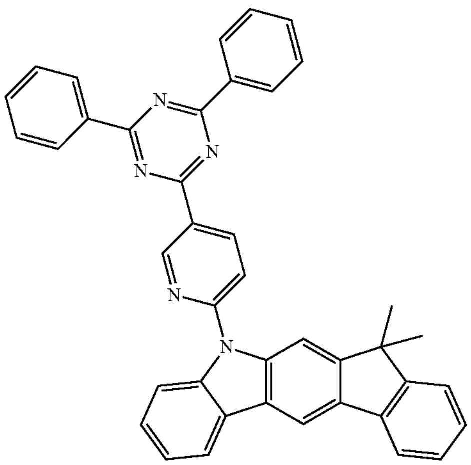
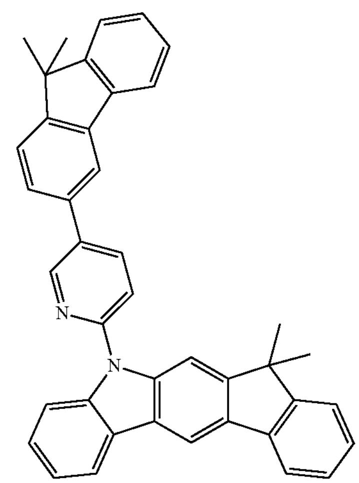
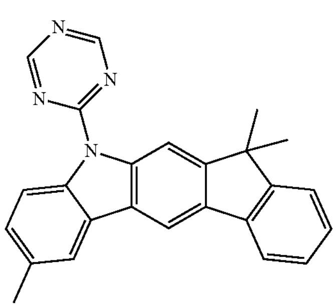
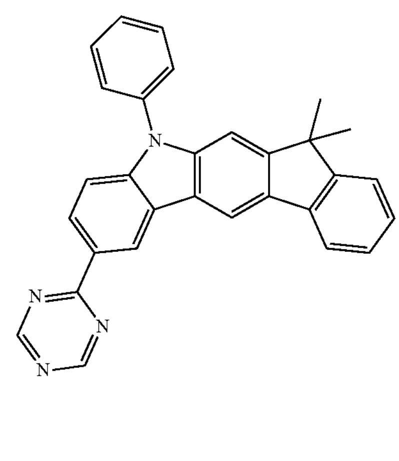

-continued
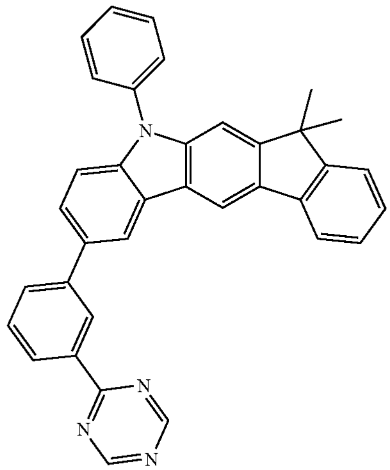
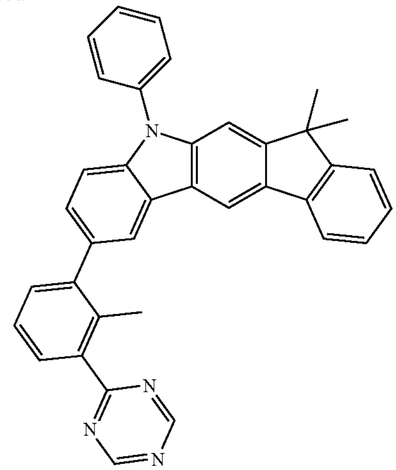
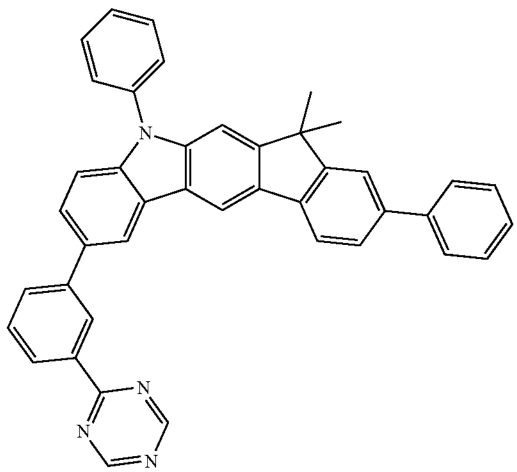
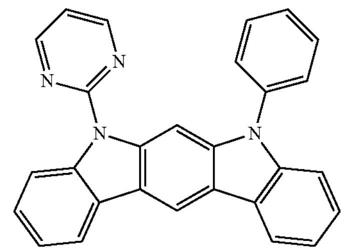
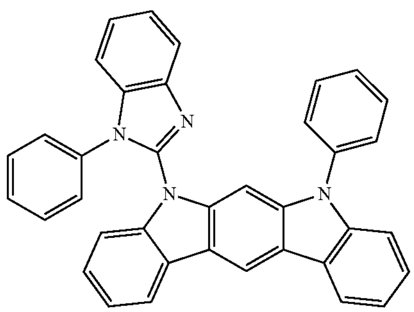
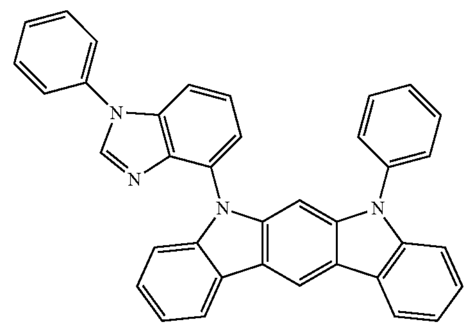
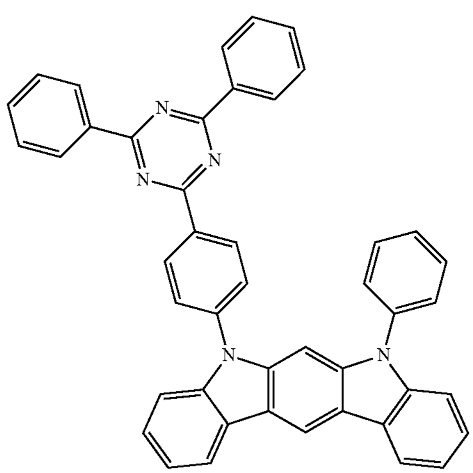
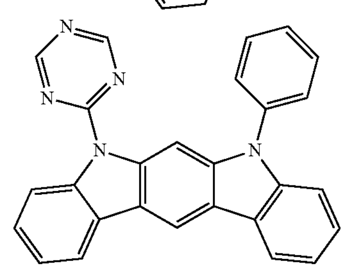

-continued
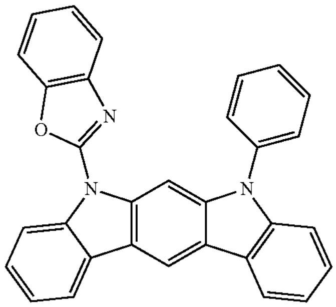
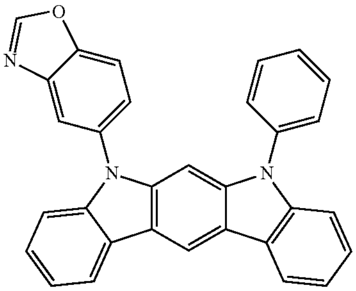
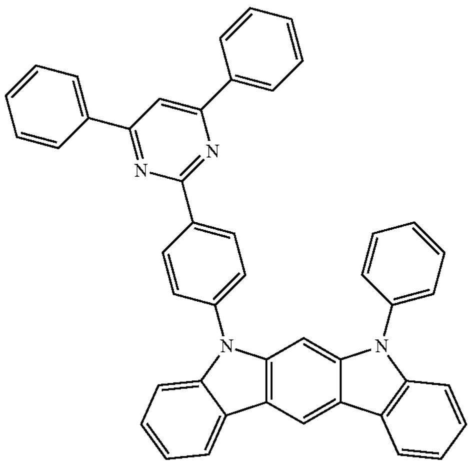
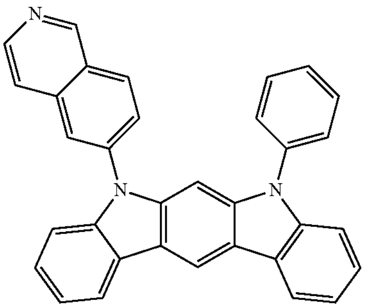
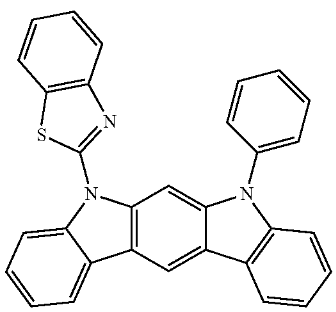
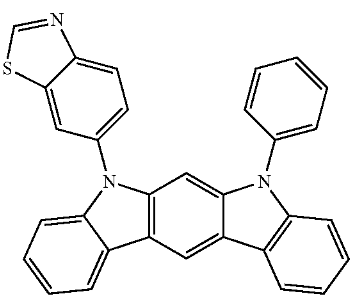
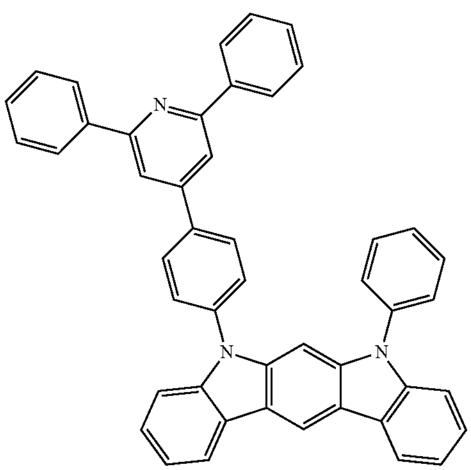
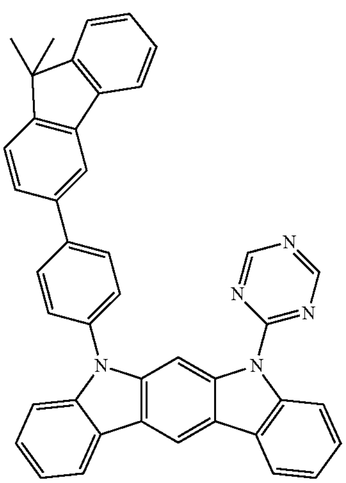

-continued
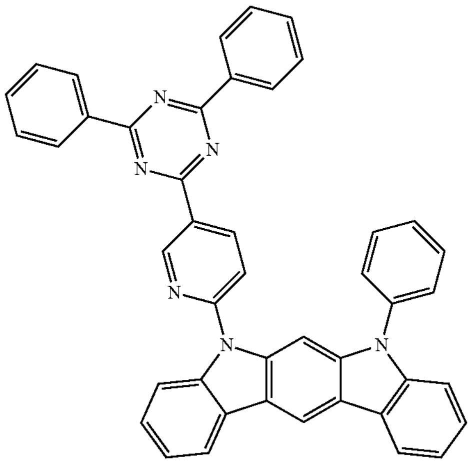
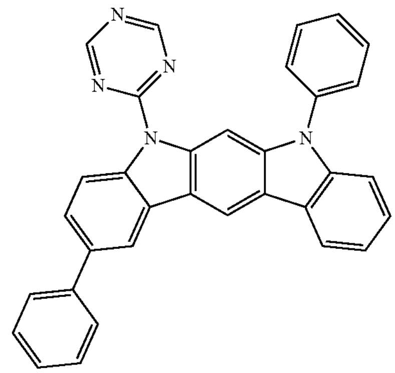
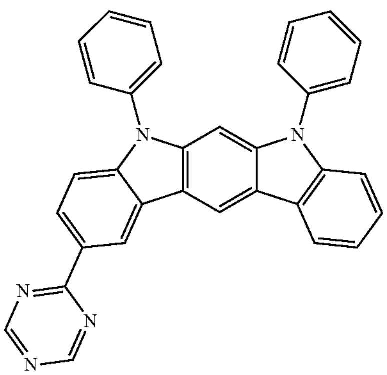
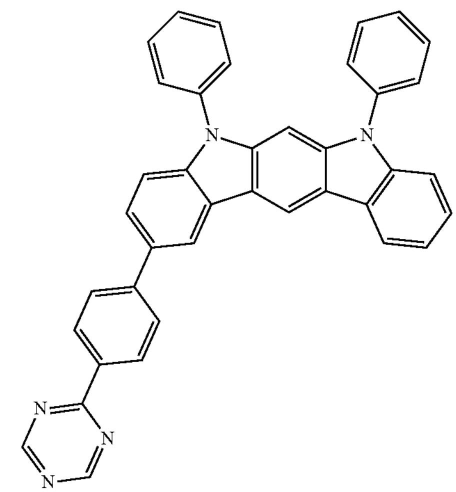
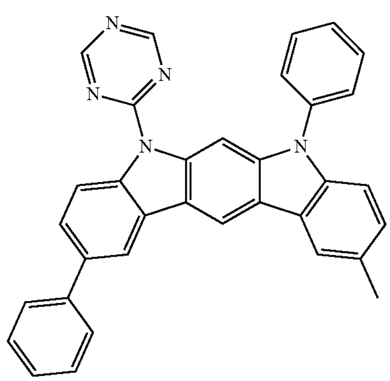
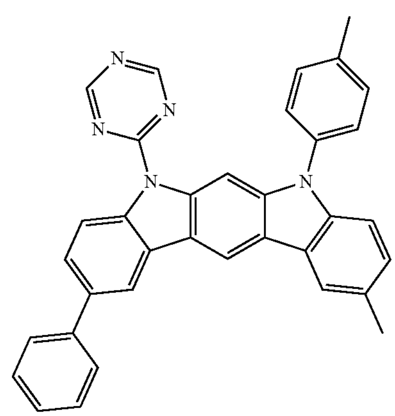

-continued
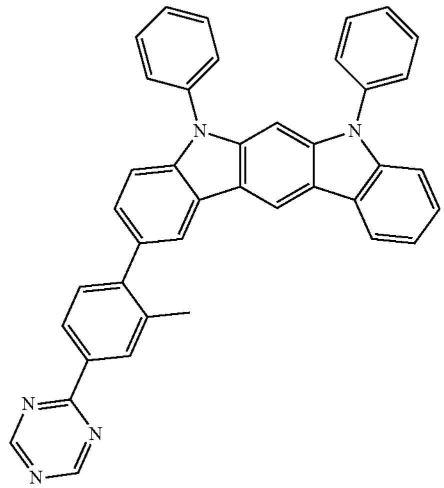
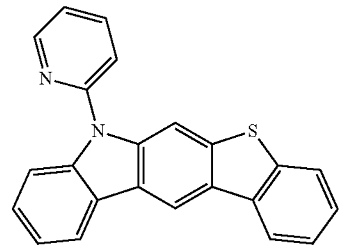
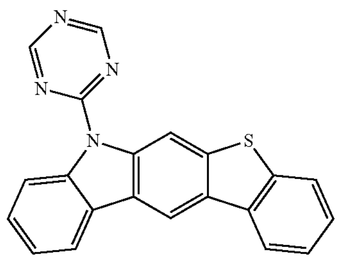
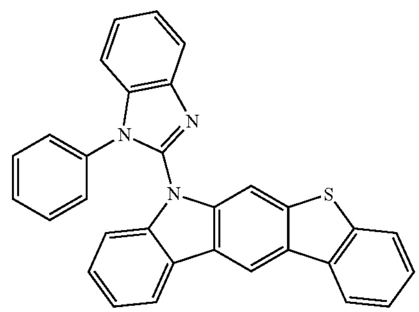
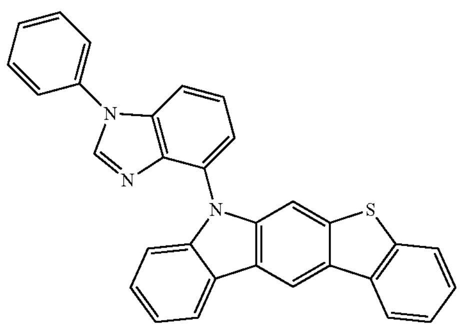
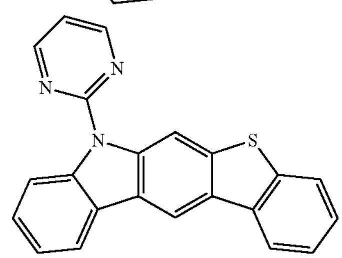
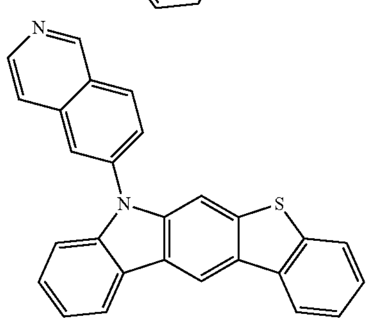
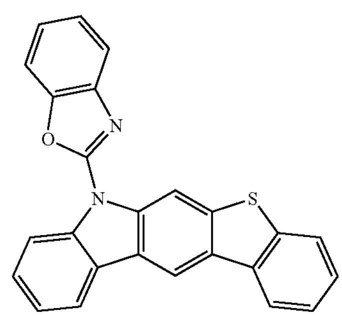
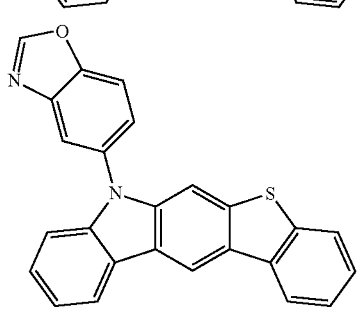
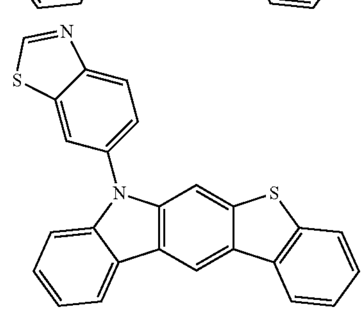

-continued
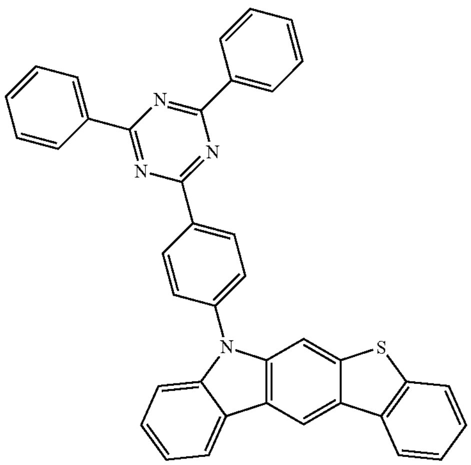
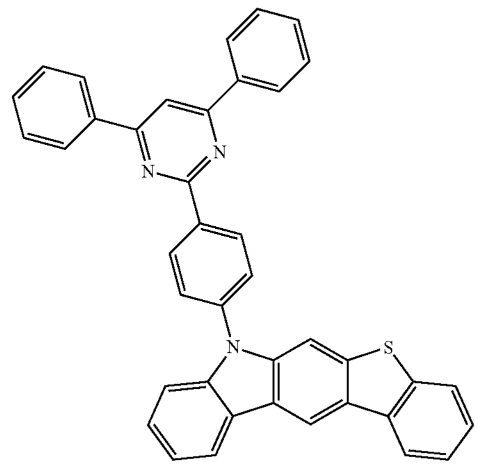
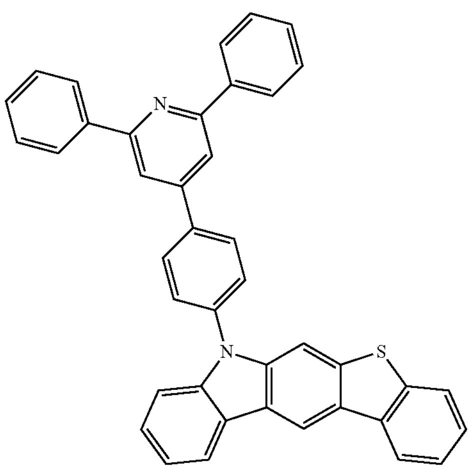
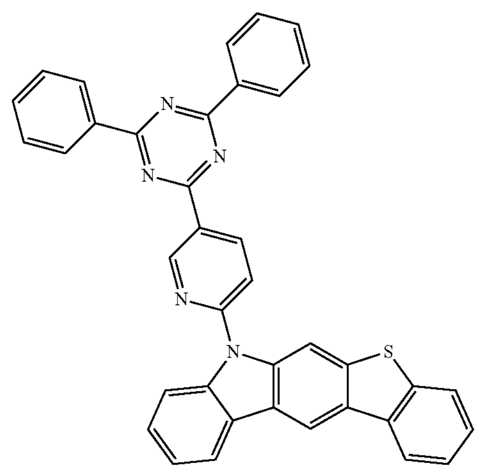
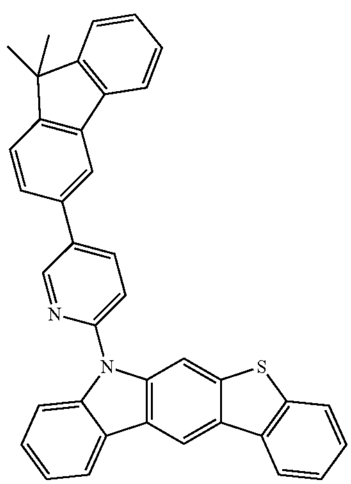
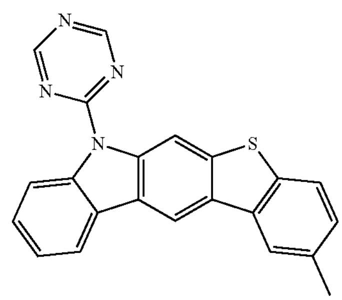

-continued
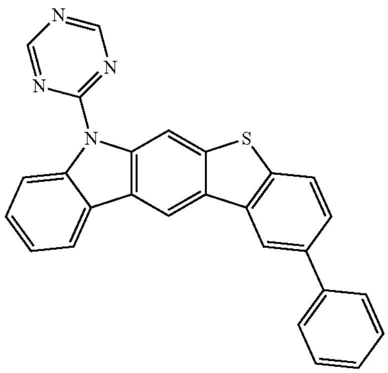
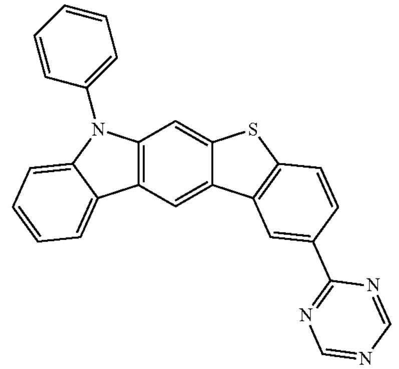
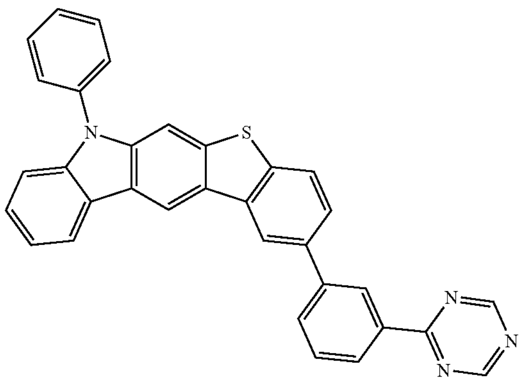
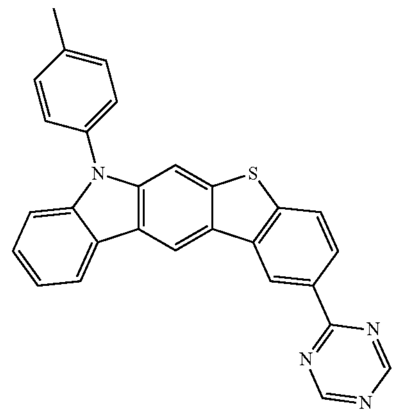
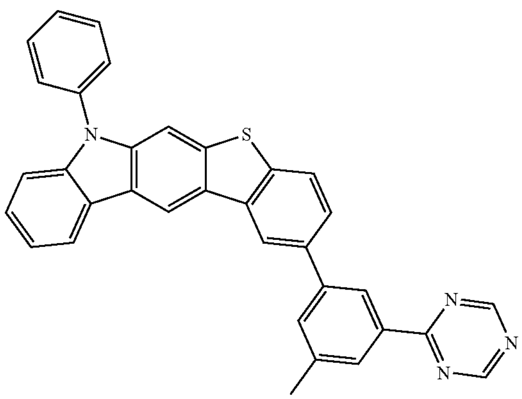
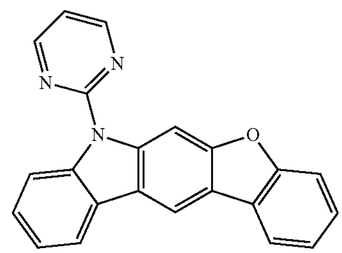
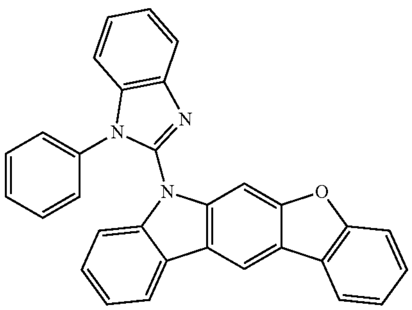
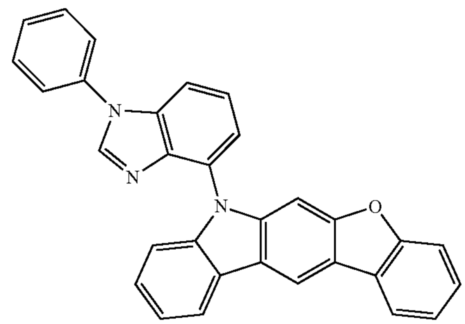

-continued
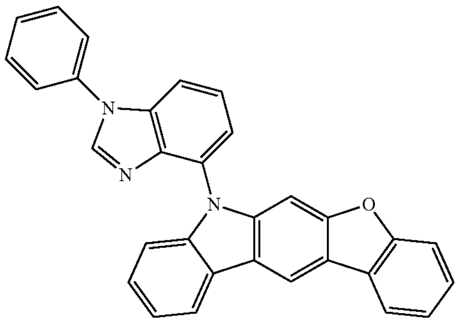
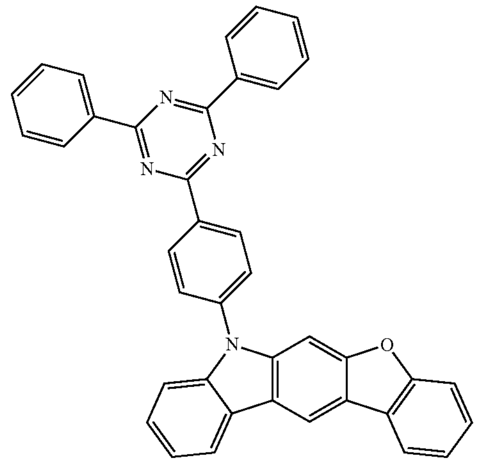
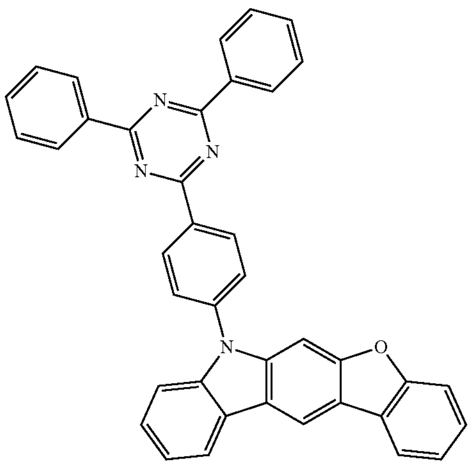
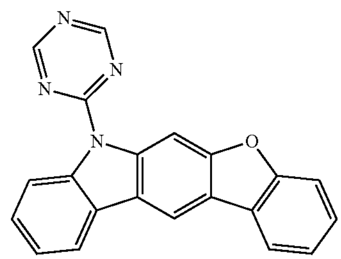
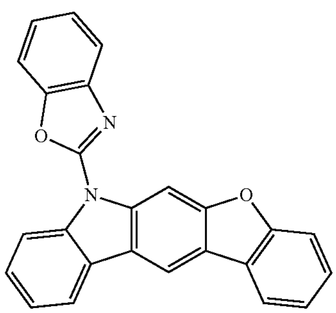
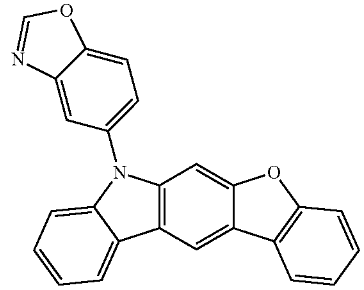
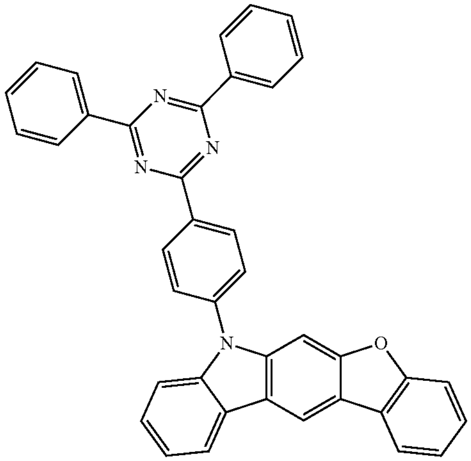
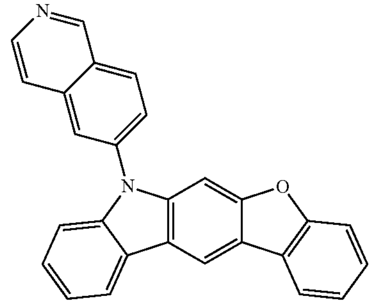

-continued
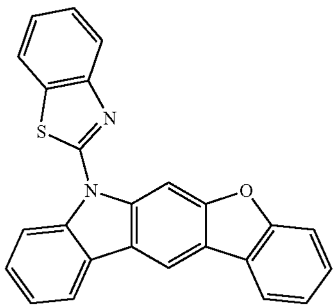
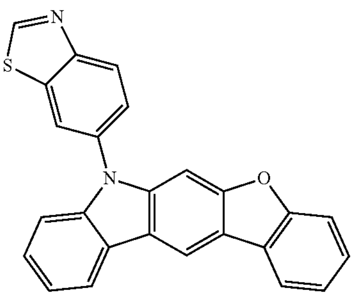
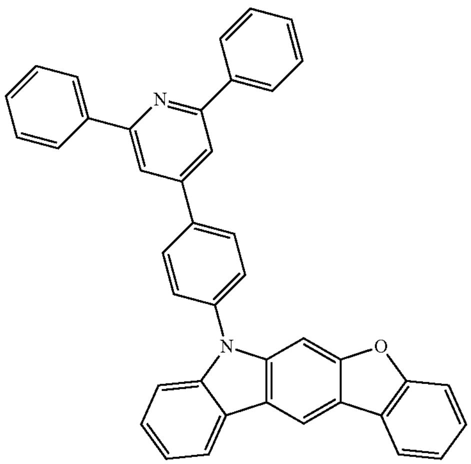
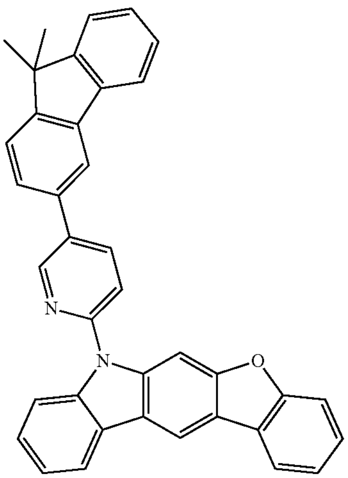
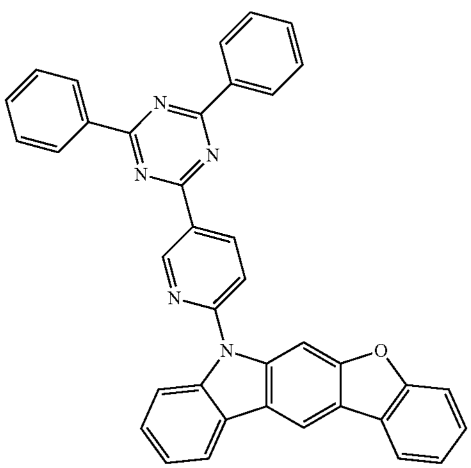
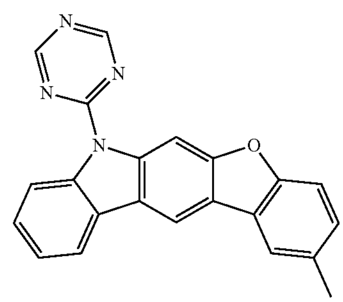
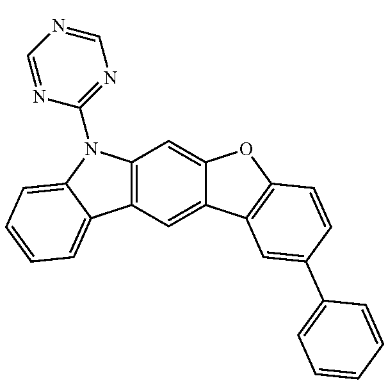
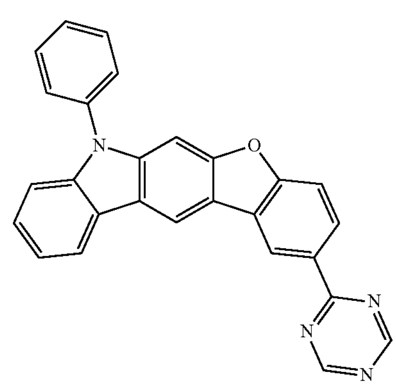

-continued
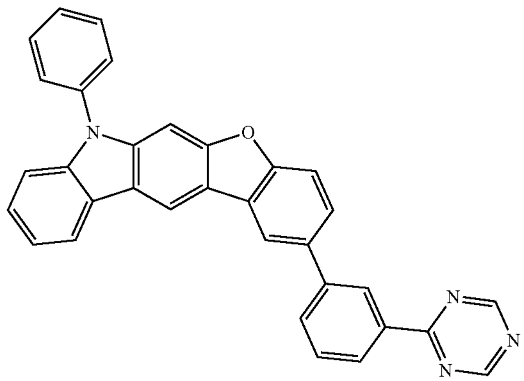
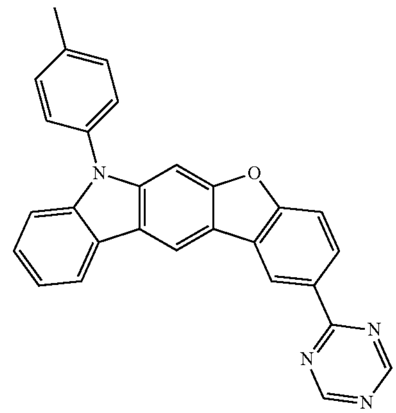
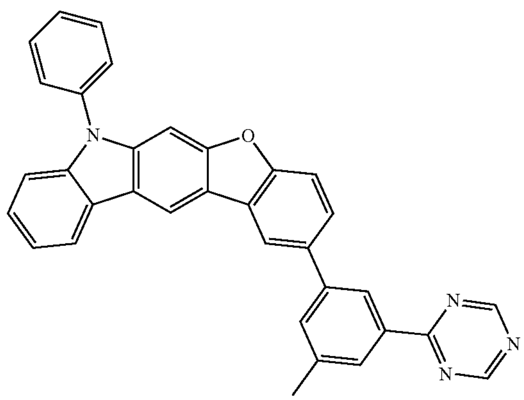
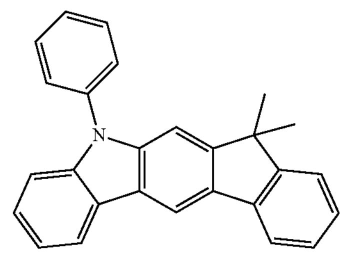
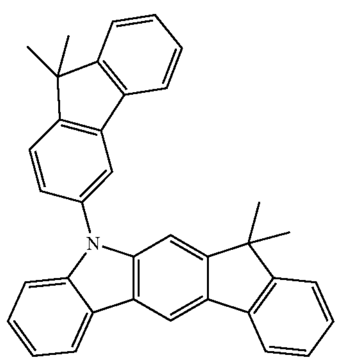
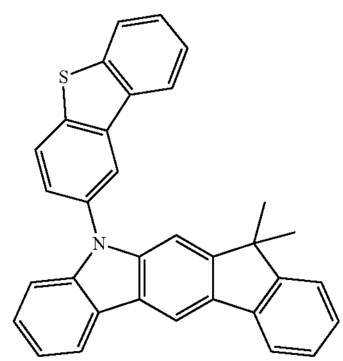
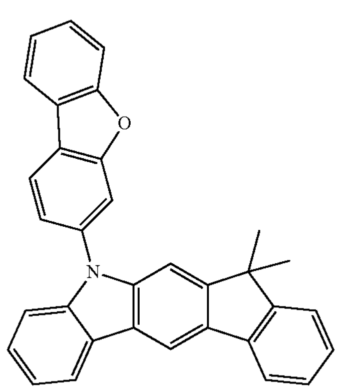
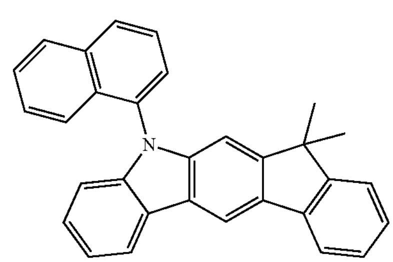

-continued
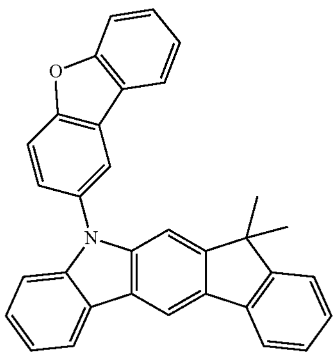
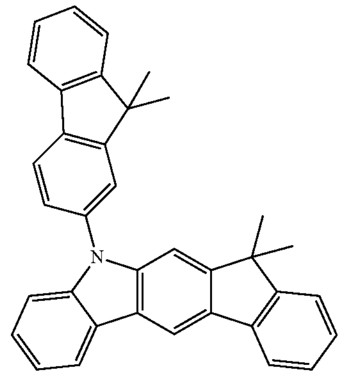
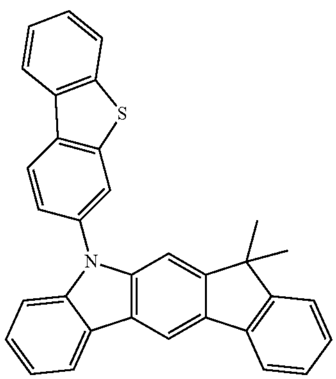
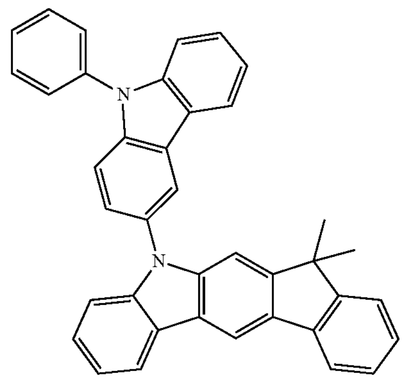
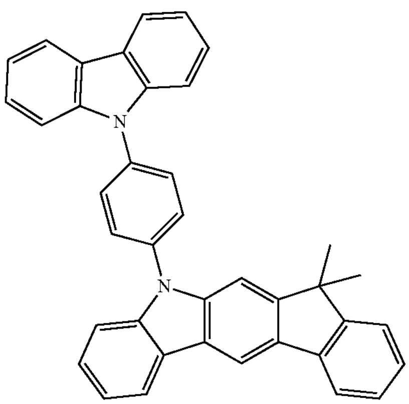
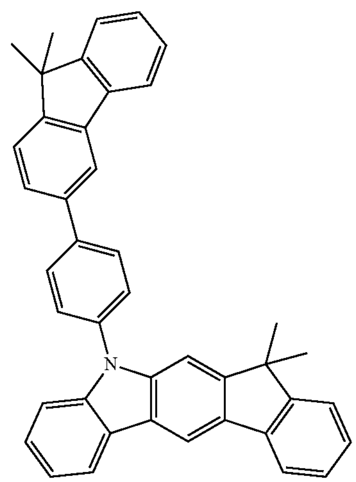
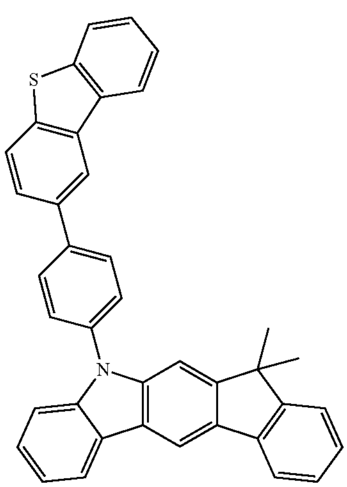
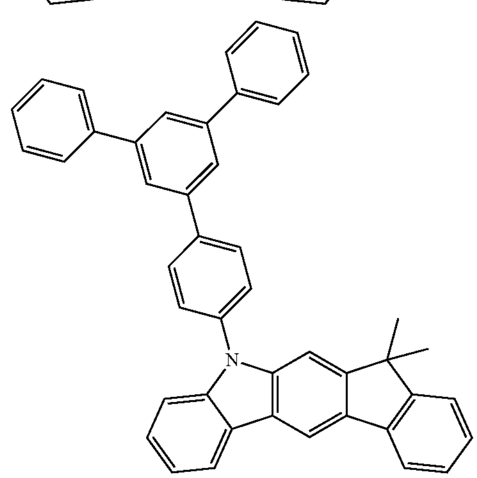

-continued
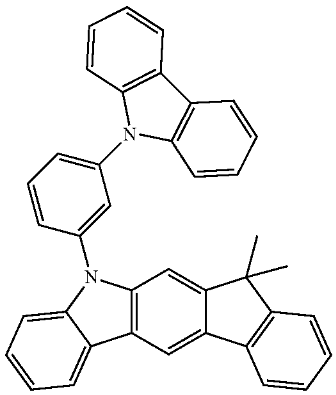
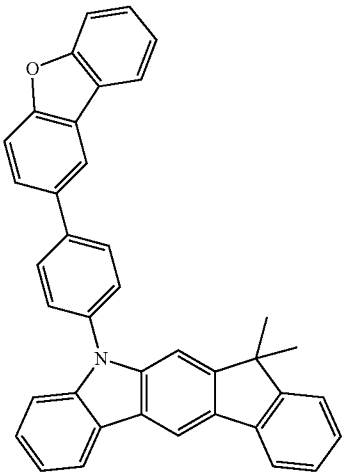
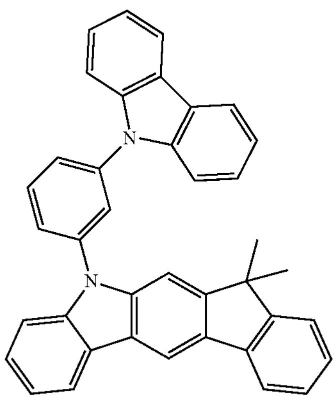
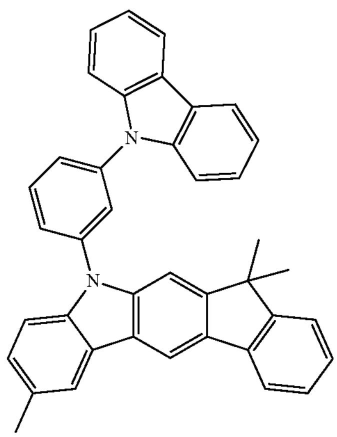
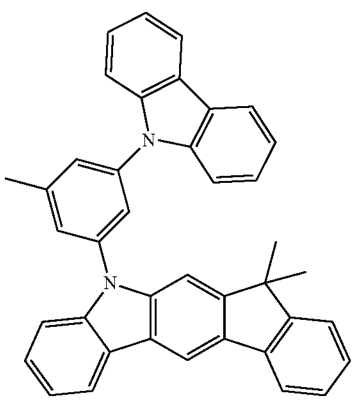
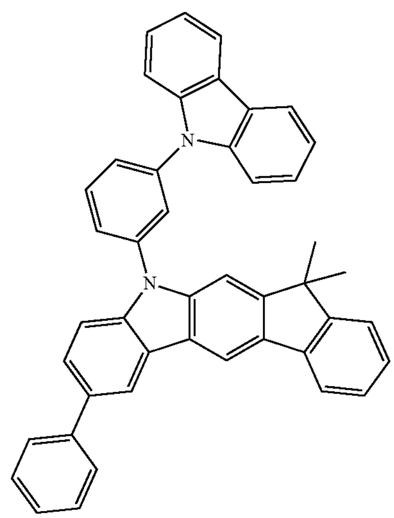

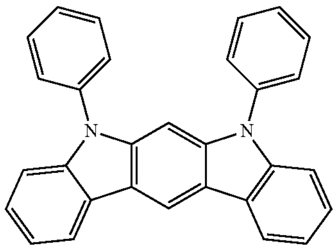
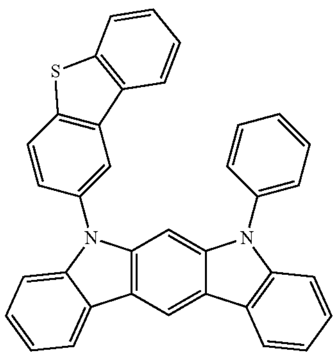
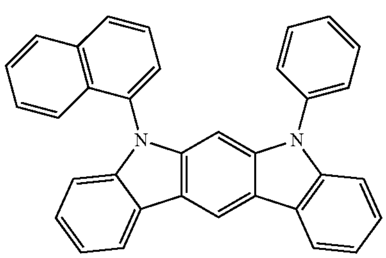
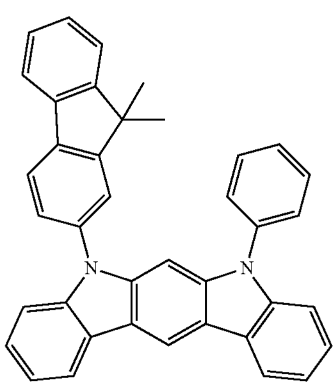
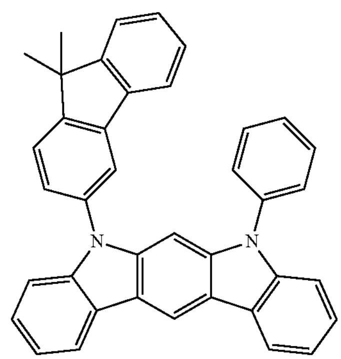
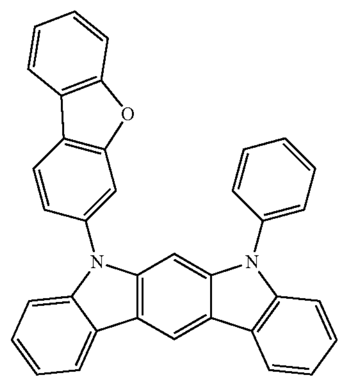
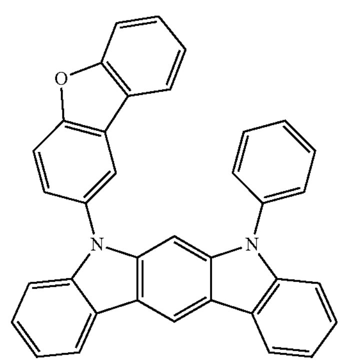
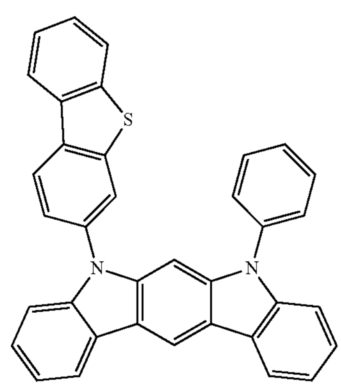

-continued
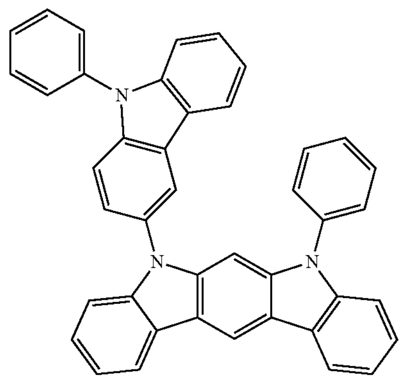
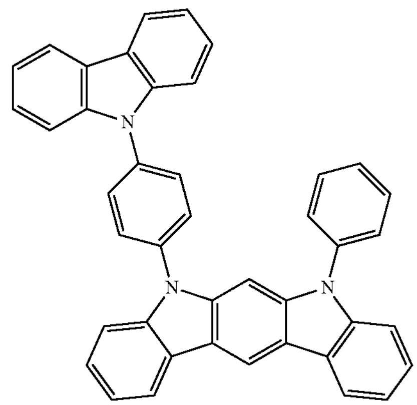
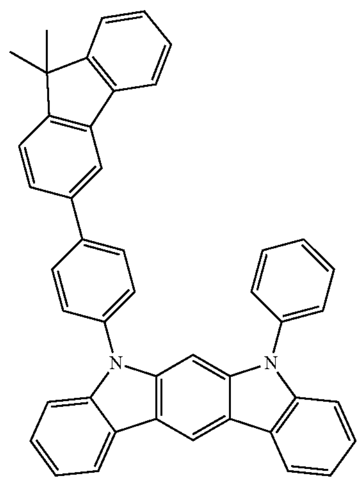
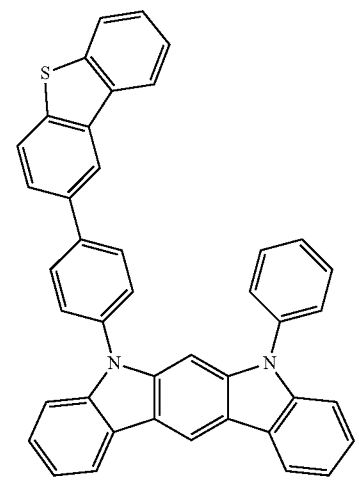
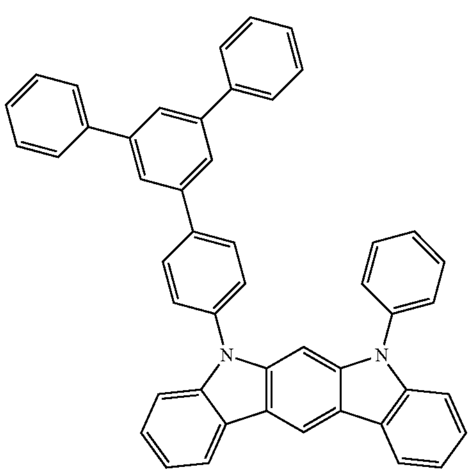
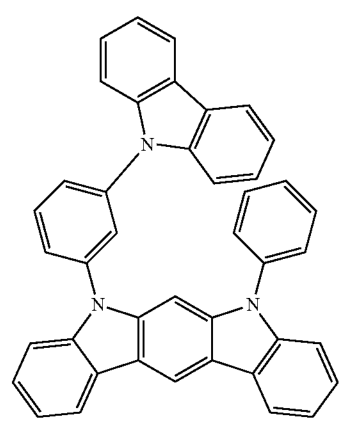

-continued
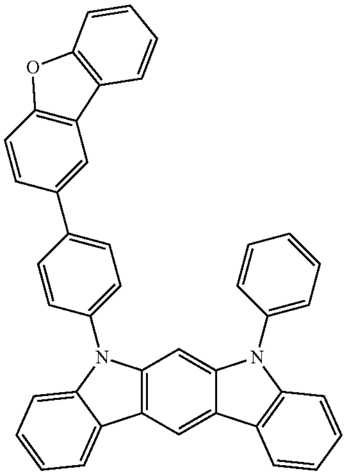
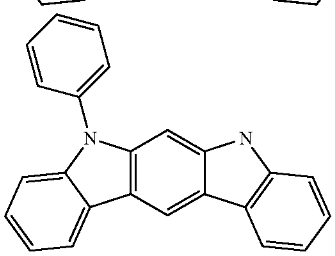
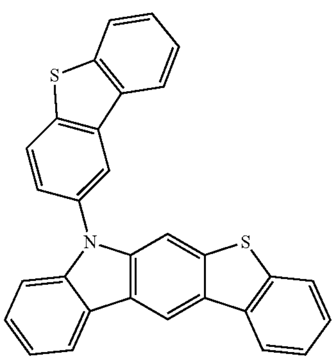
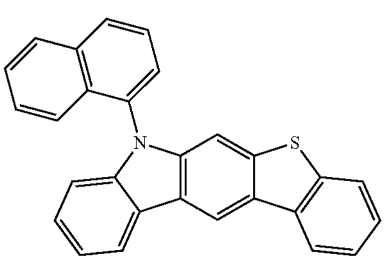
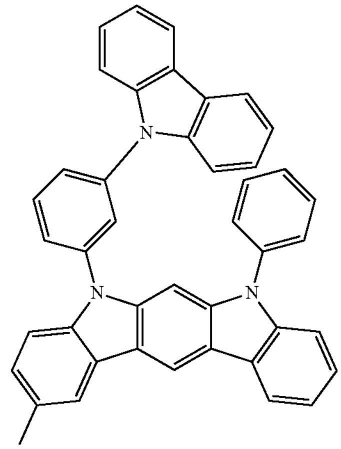
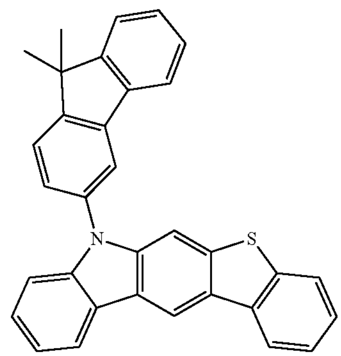
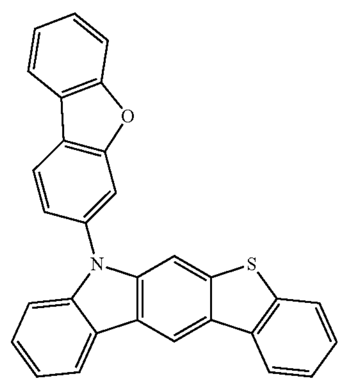
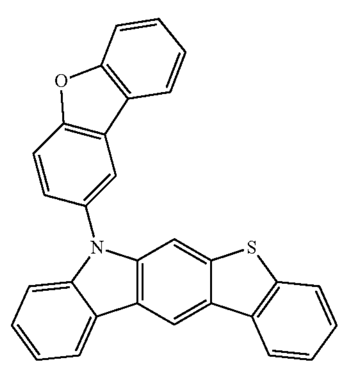

-continued
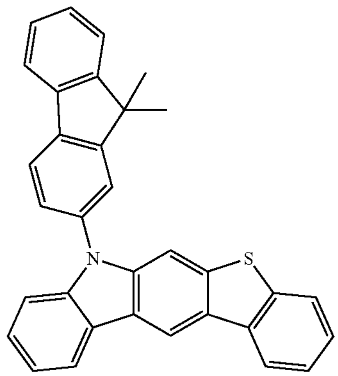
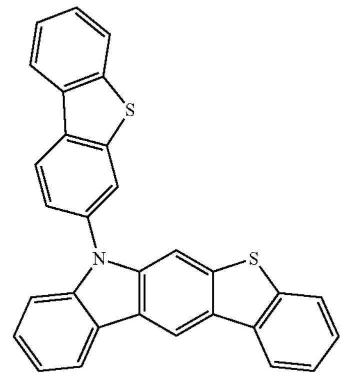
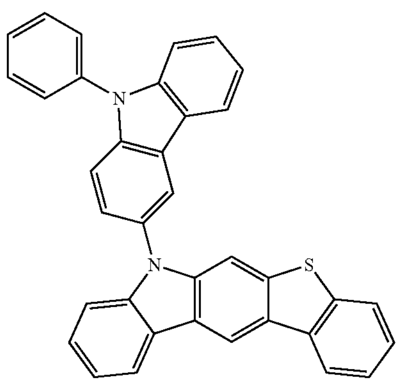
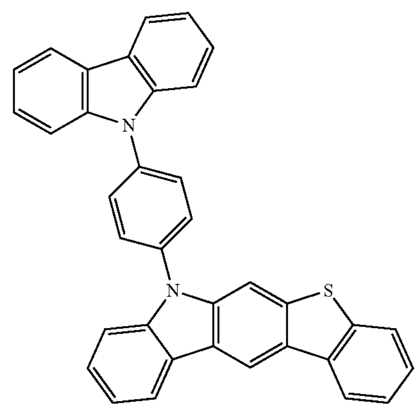
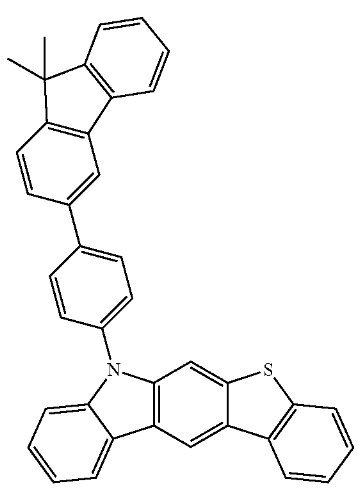
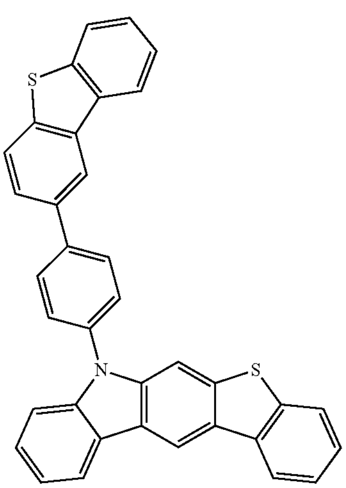

-continued
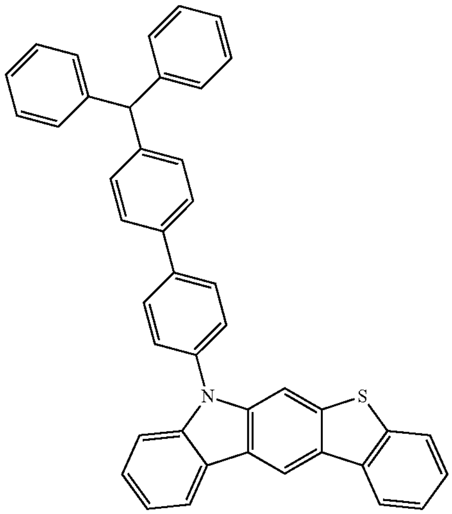
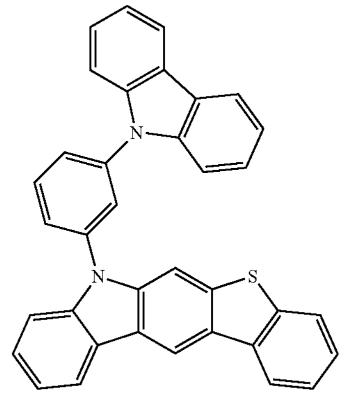
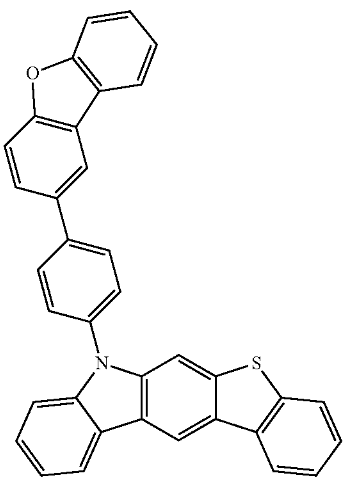
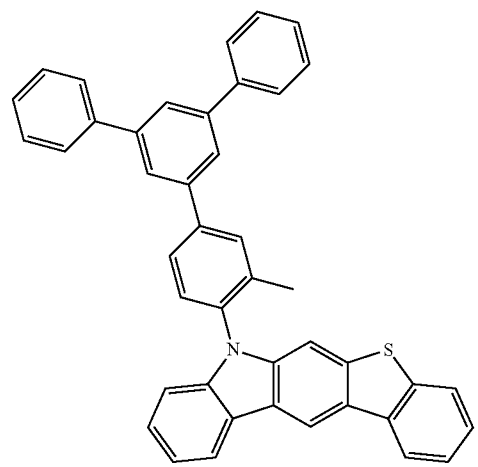
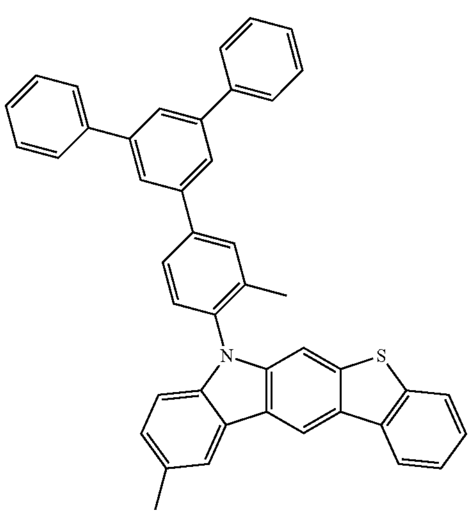
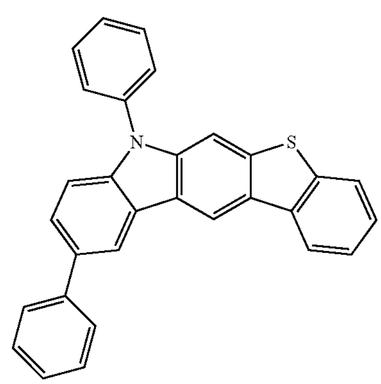

-continued
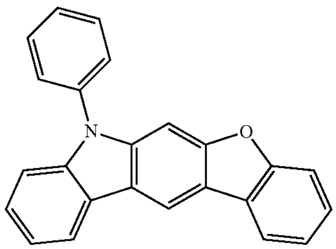
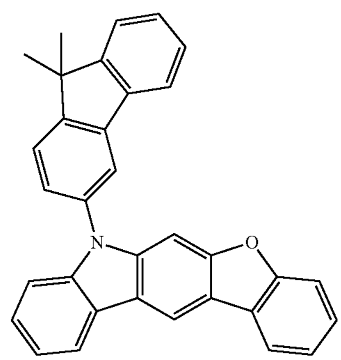
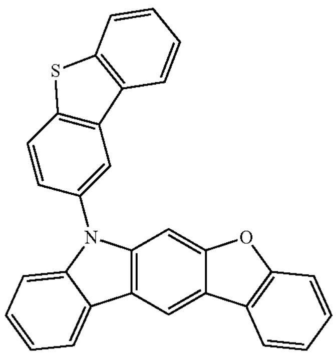
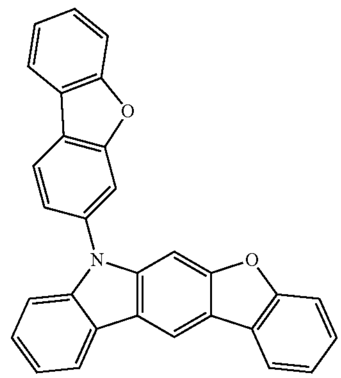
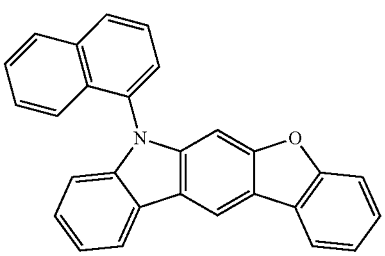
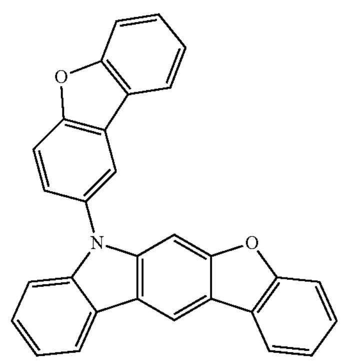
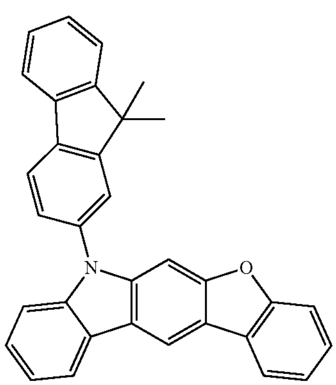
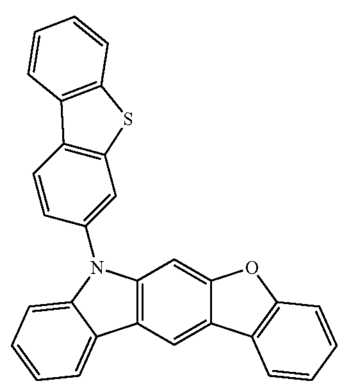

-continued
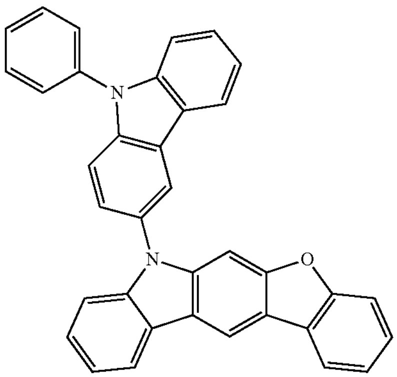
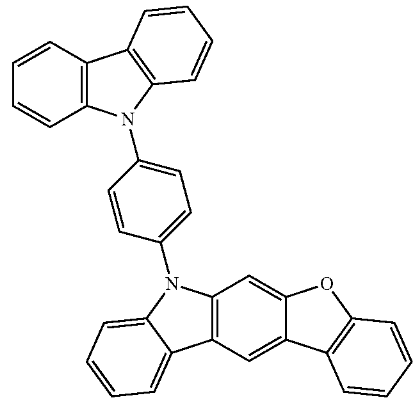
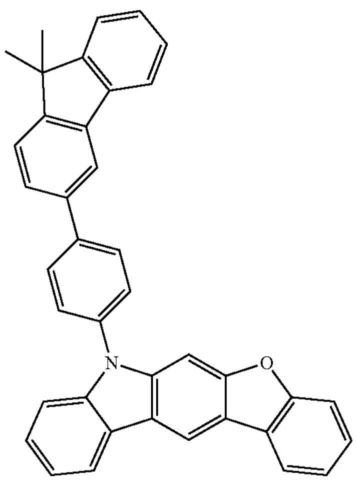
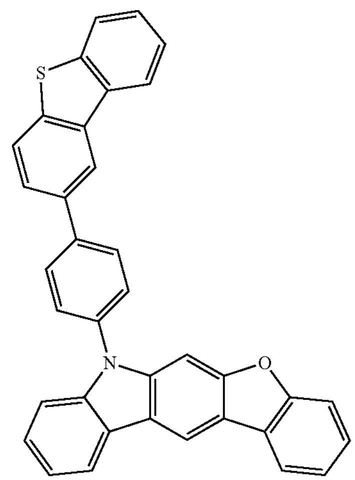
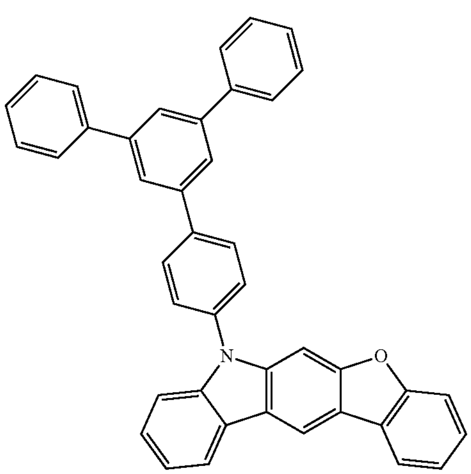
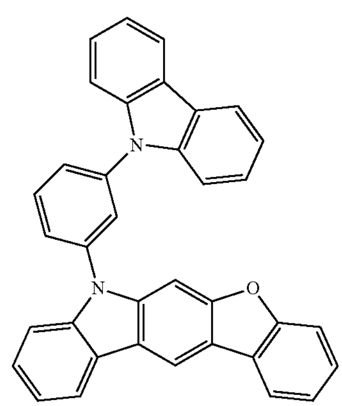

-continued
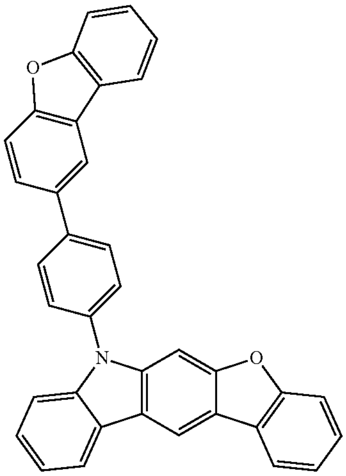
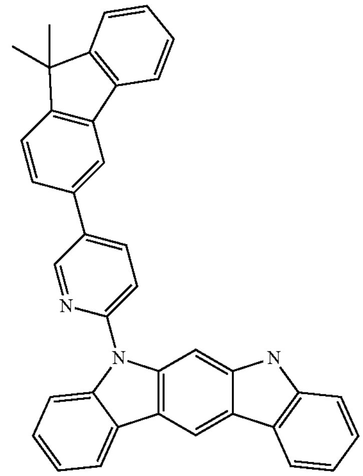
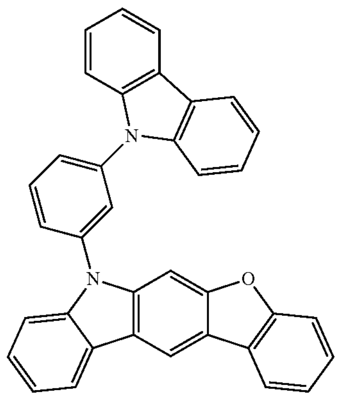
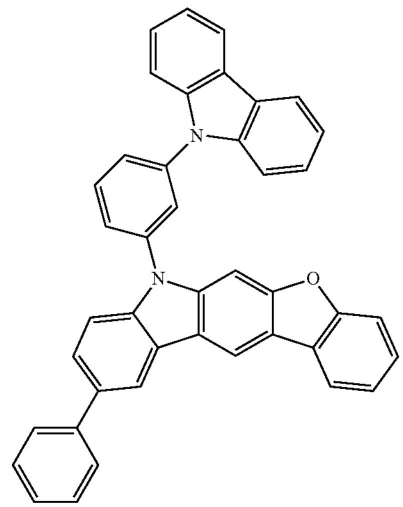
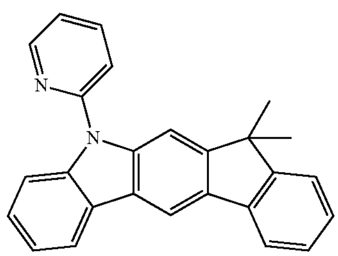
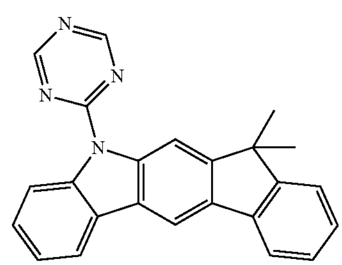
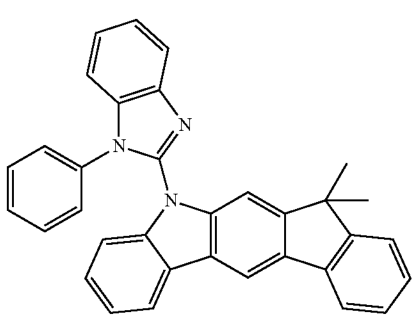
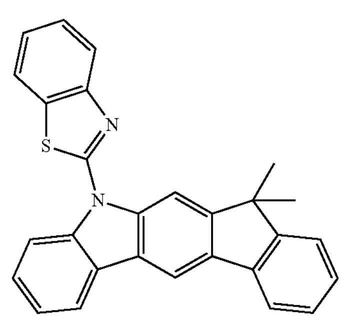

-continued
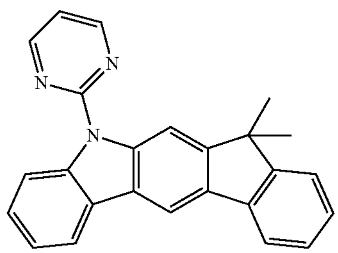
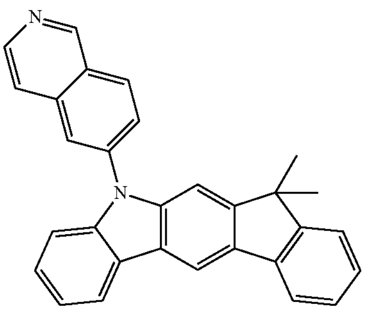
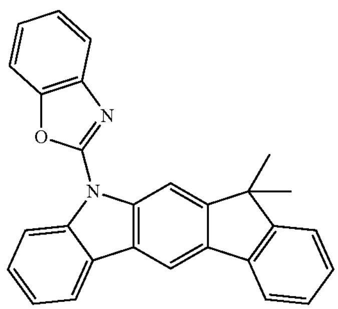
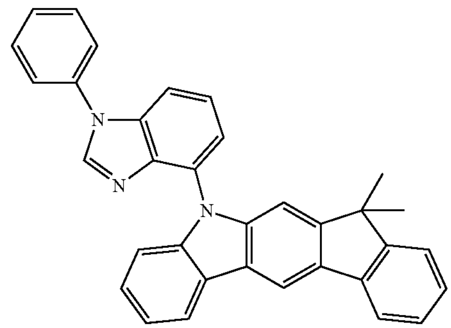
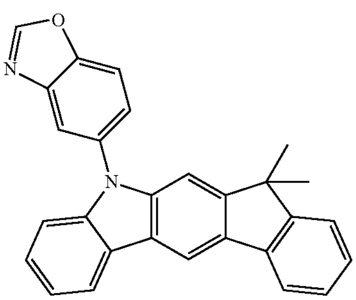
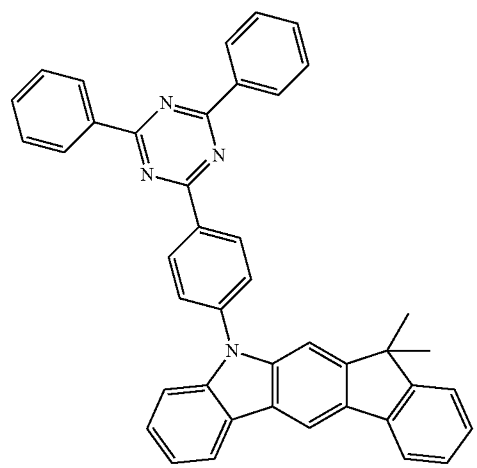
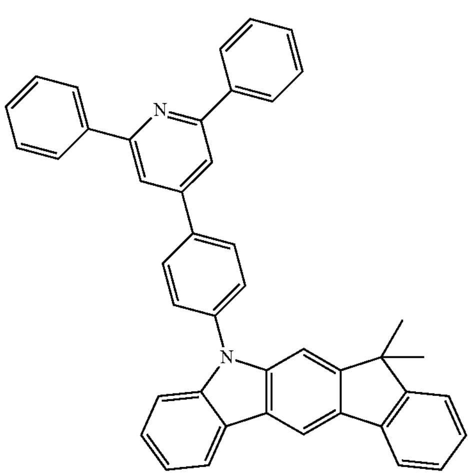
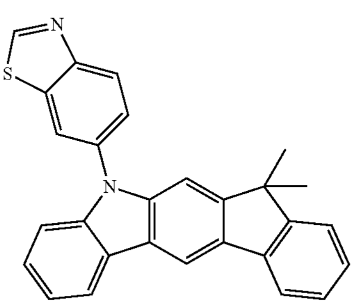

-continued
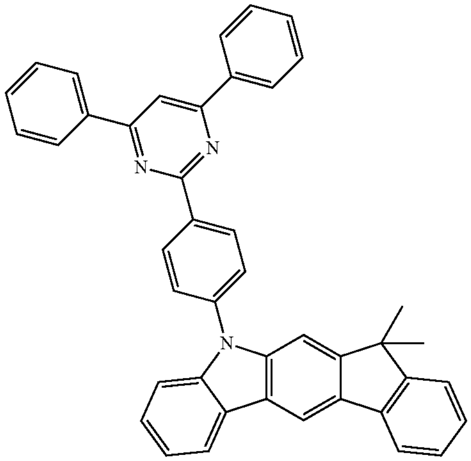
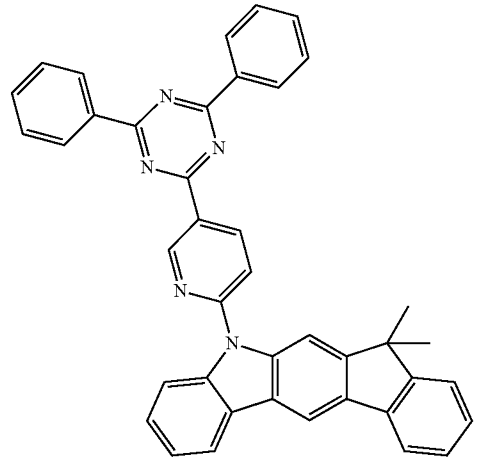
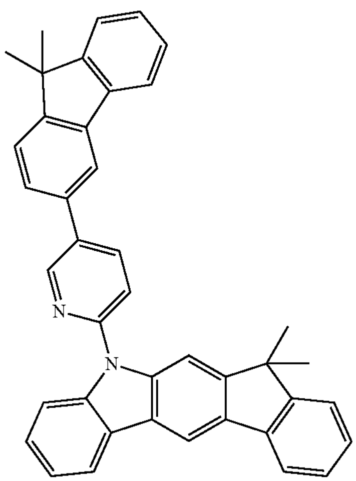
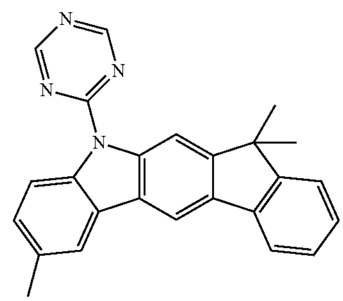
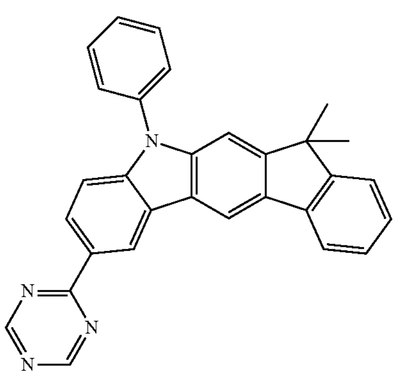
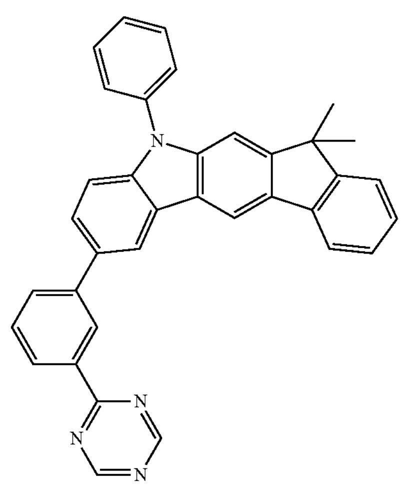

-continued
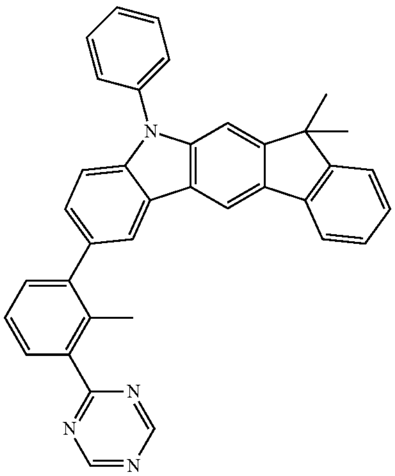
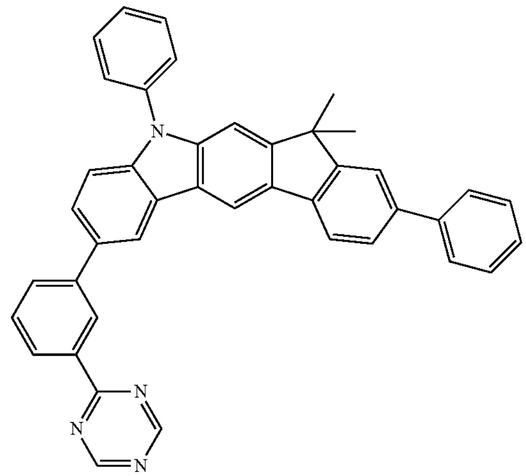
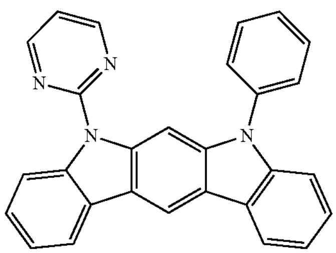
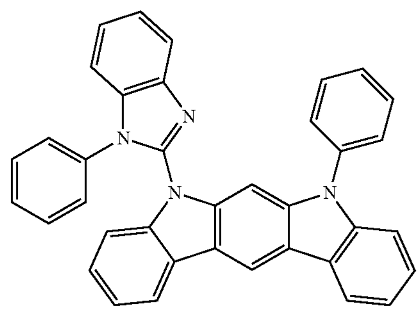
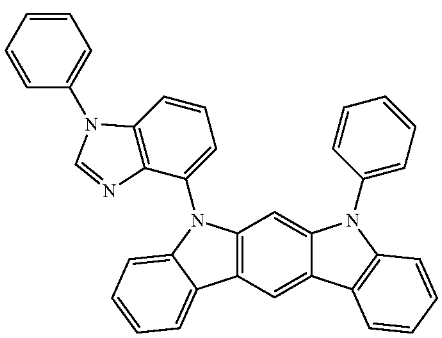
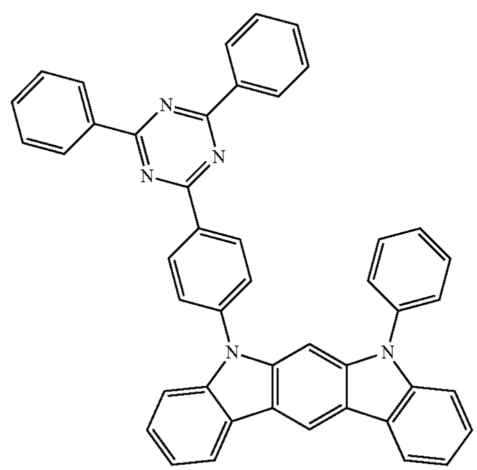
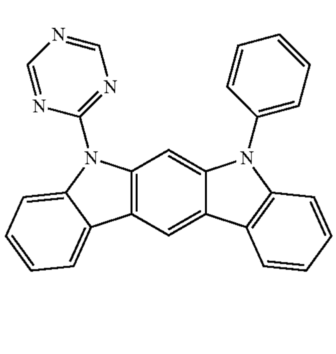
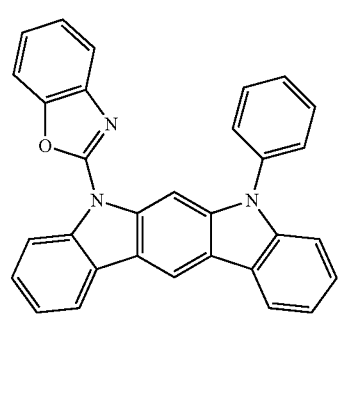

-continued
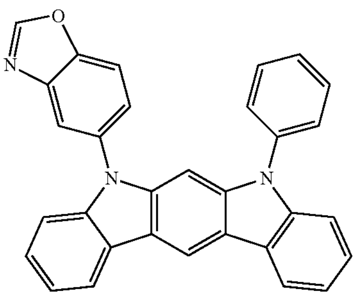
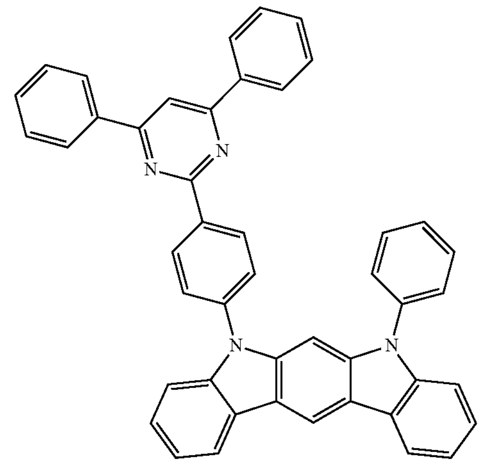
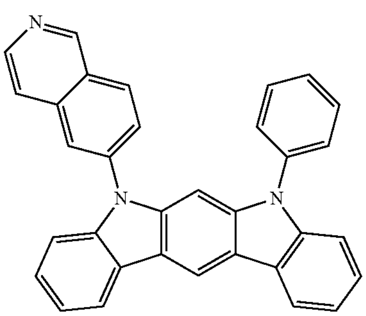
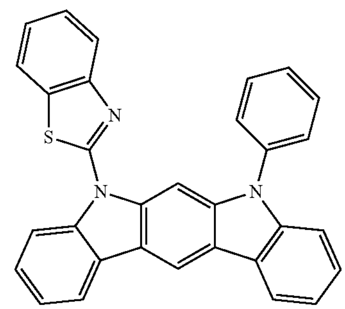
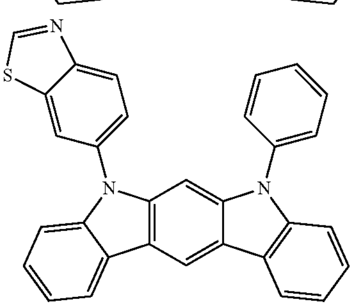
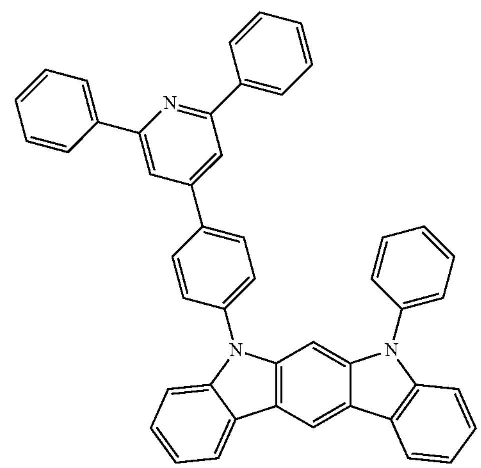
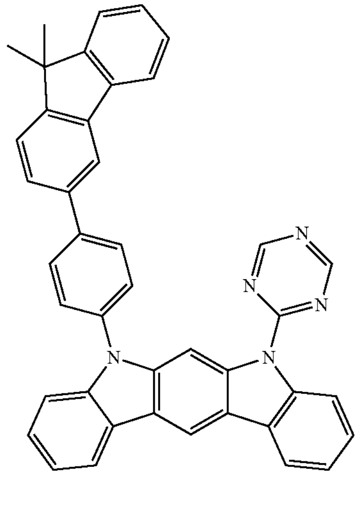
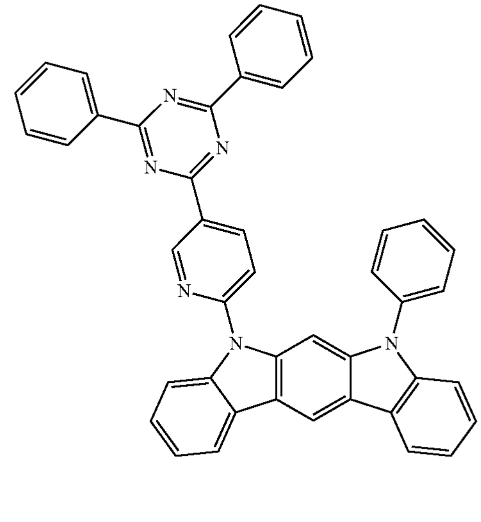

-continued
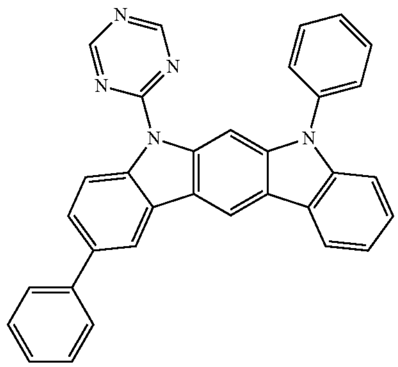
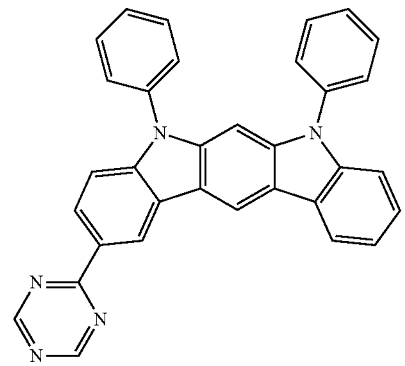
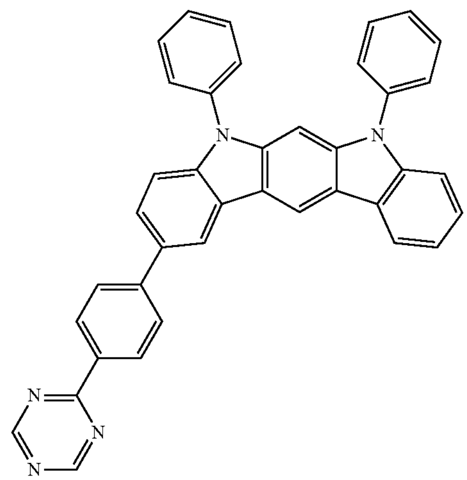
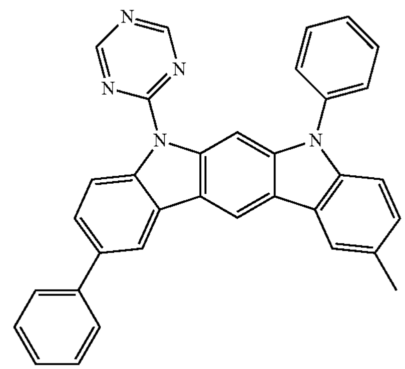
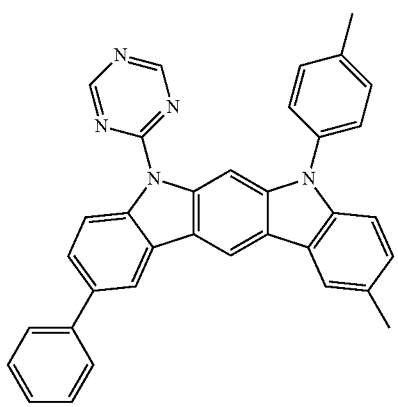
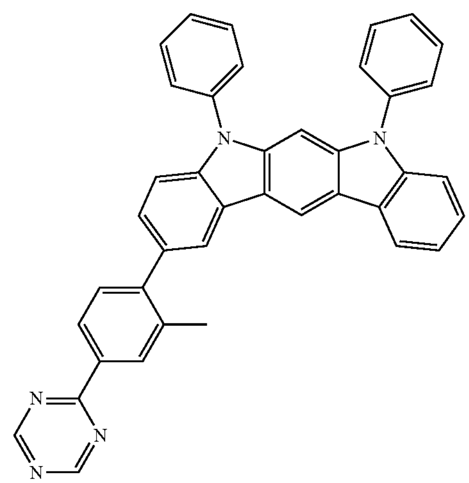
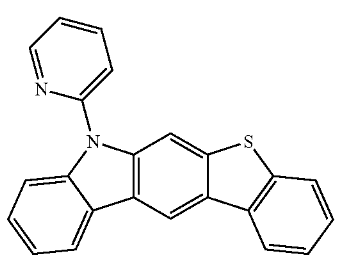
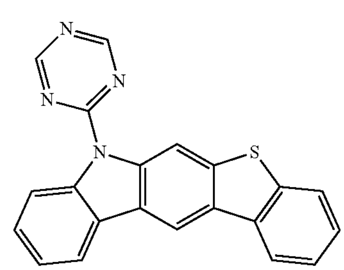

-continued
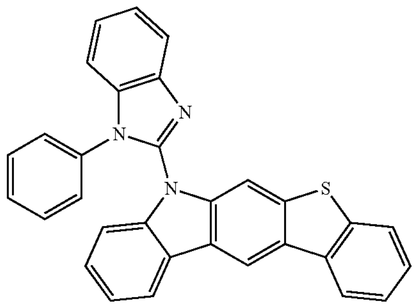
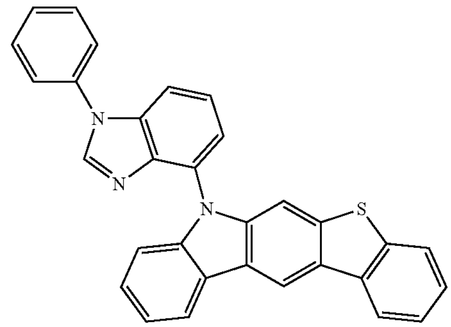
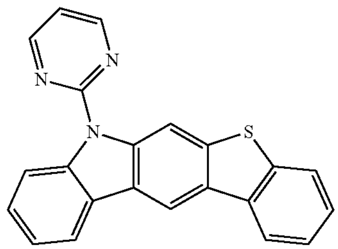
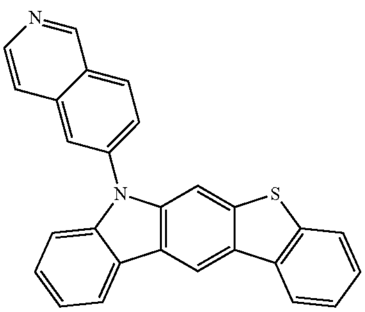
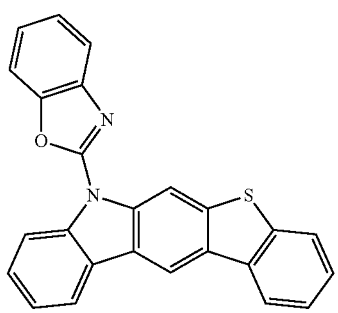
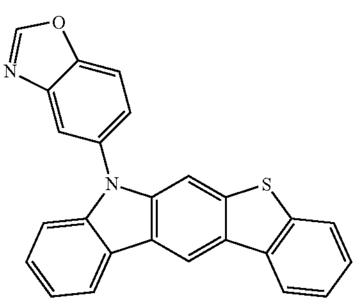
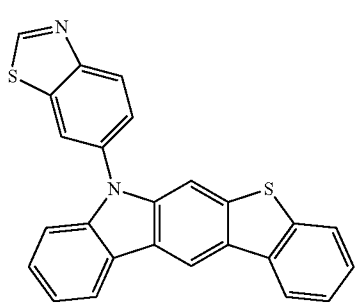
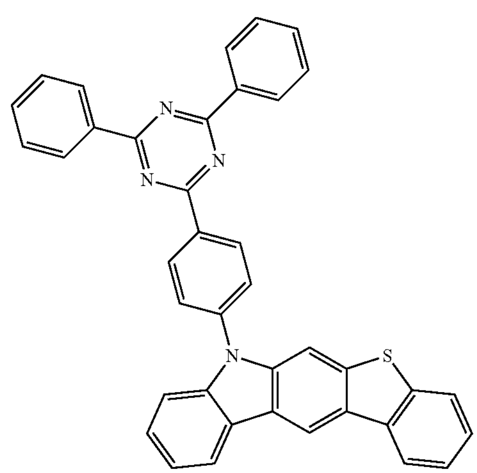

-continued
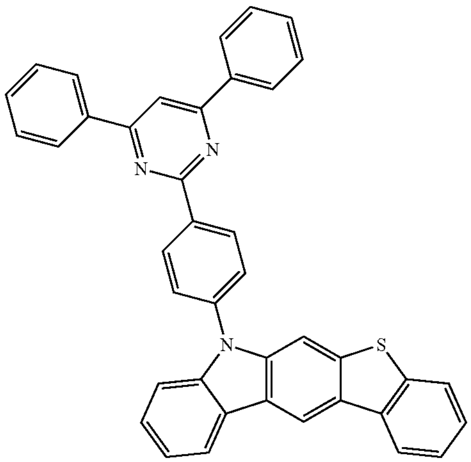
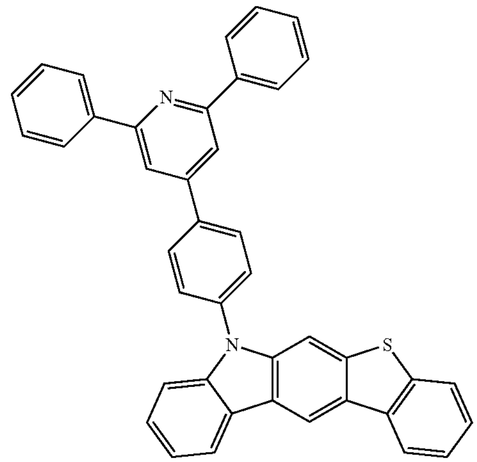
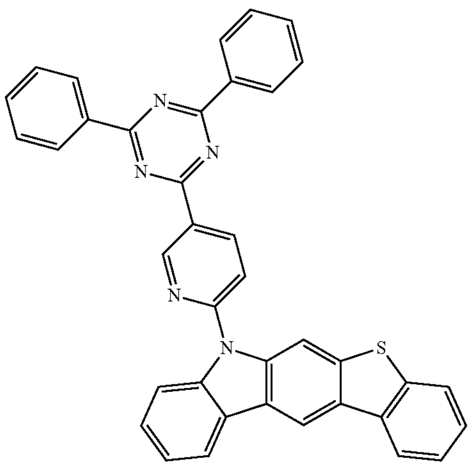
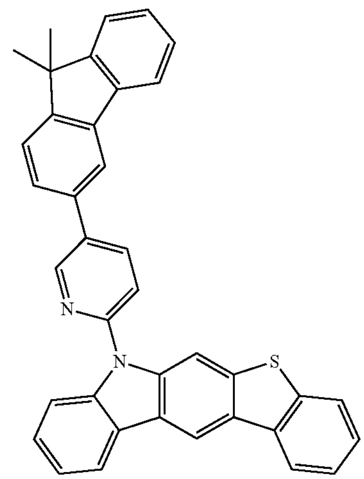
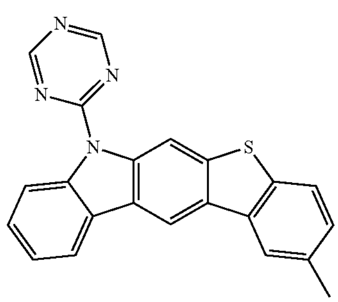
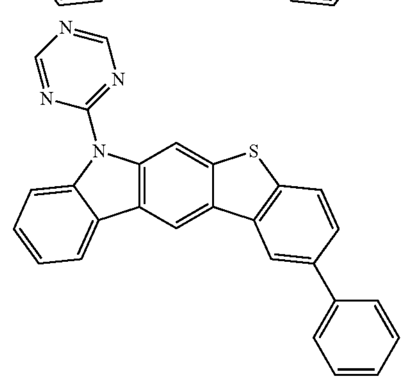
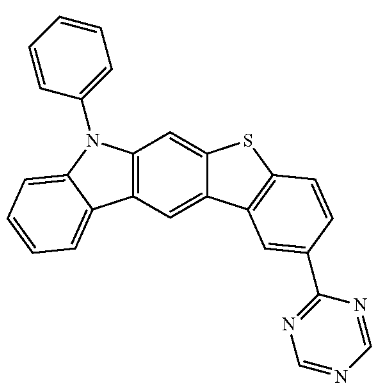
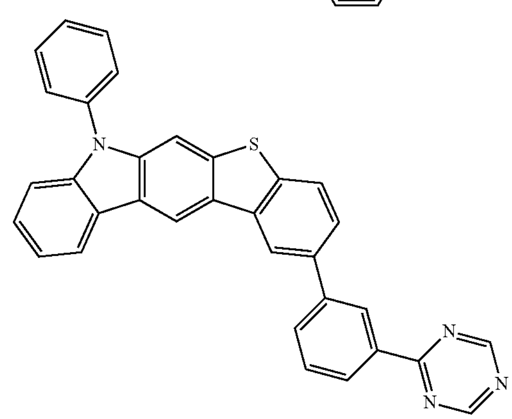

-continued
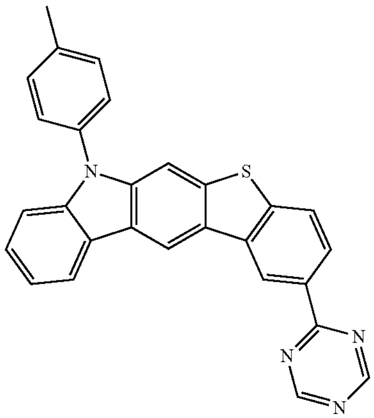
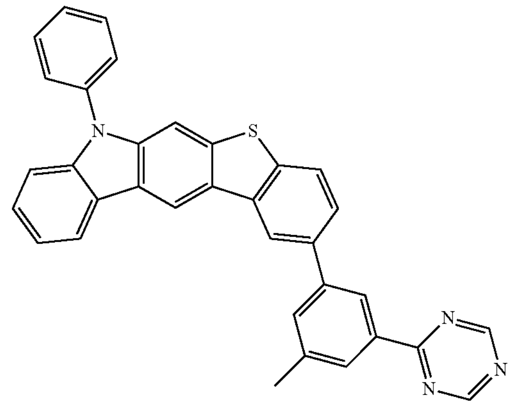
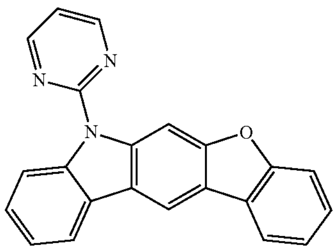
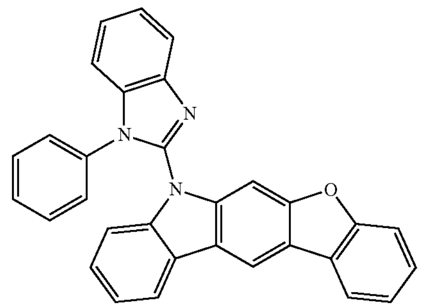
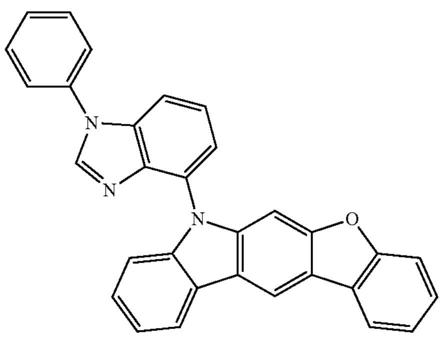
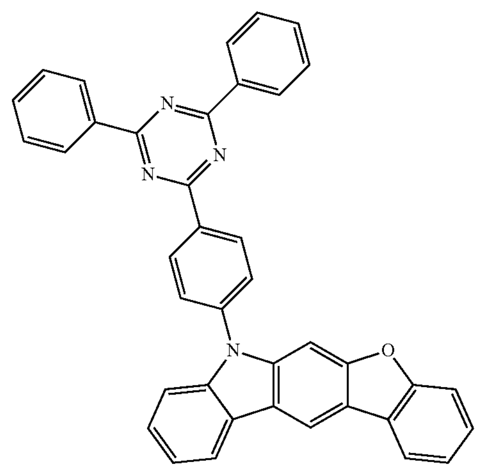
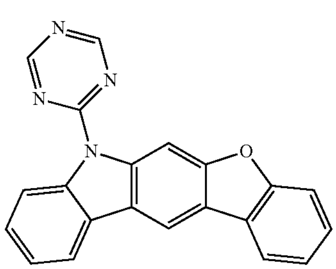
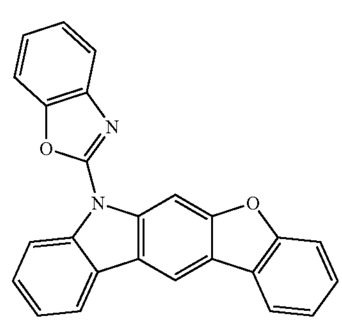

-continued
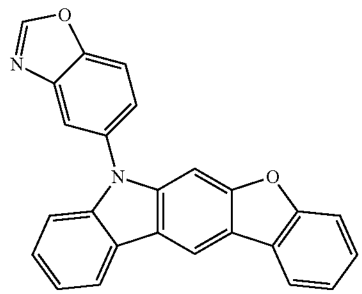
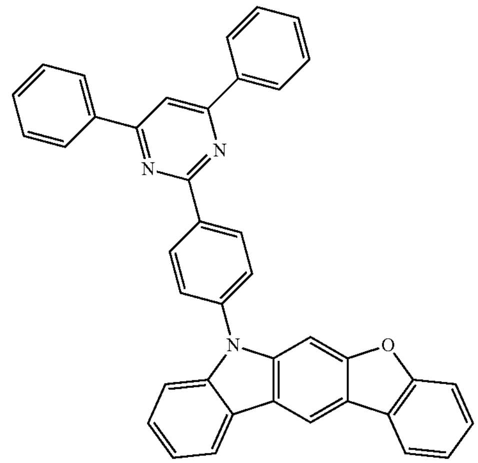
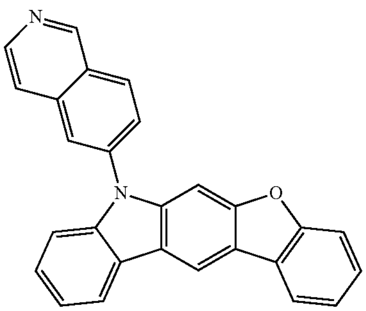
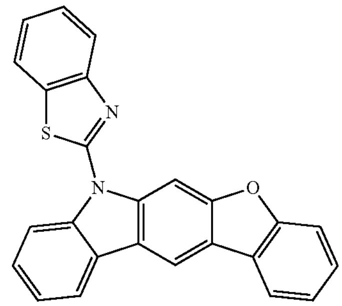
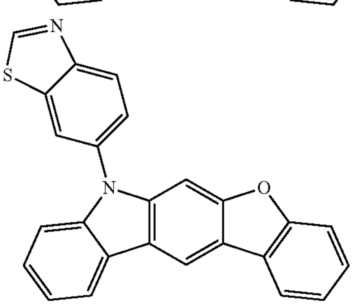
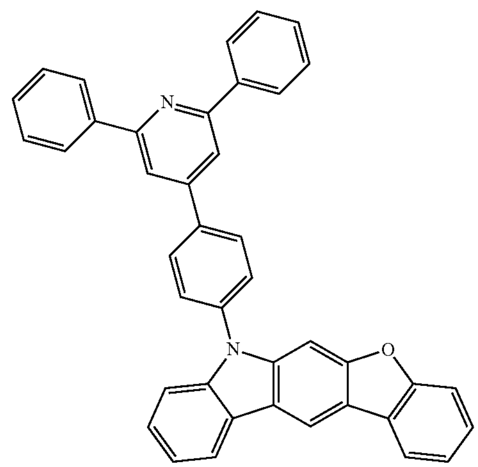
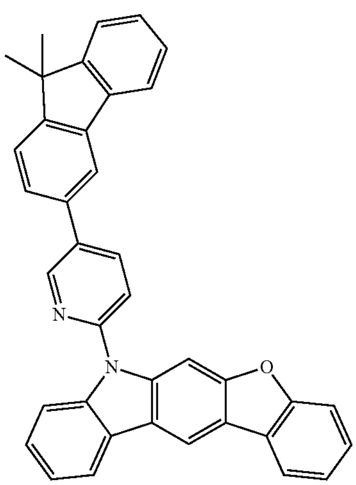
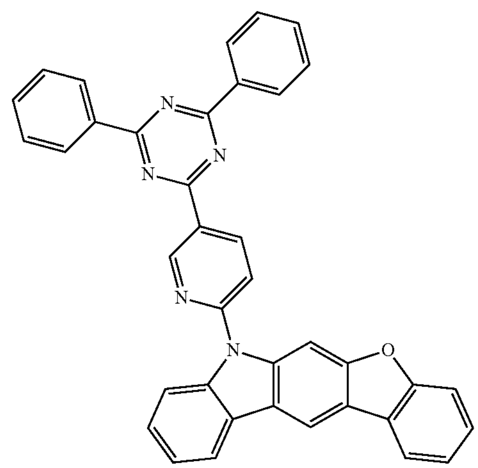

-continued
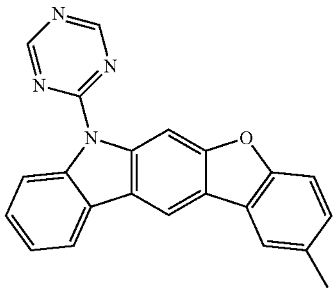
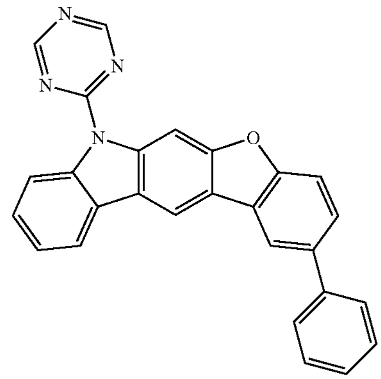
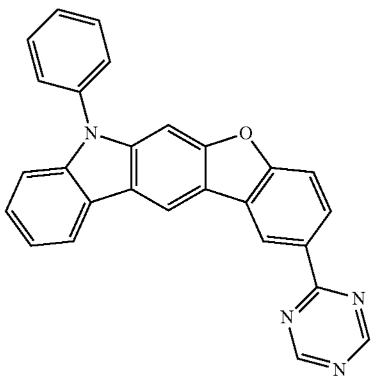
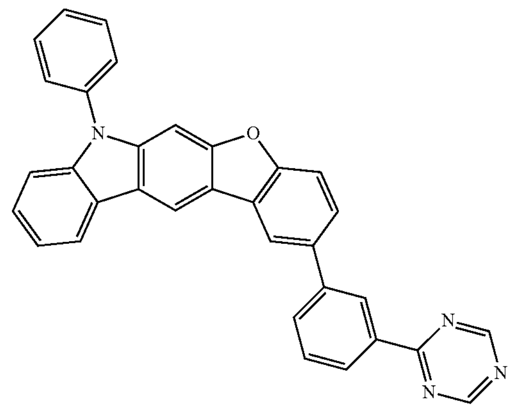
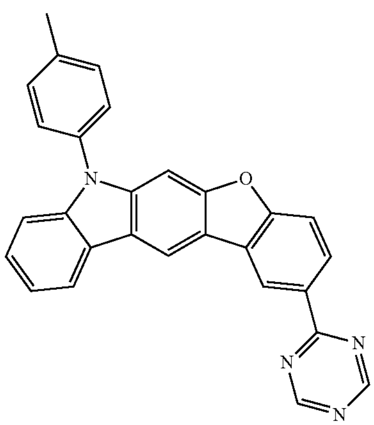
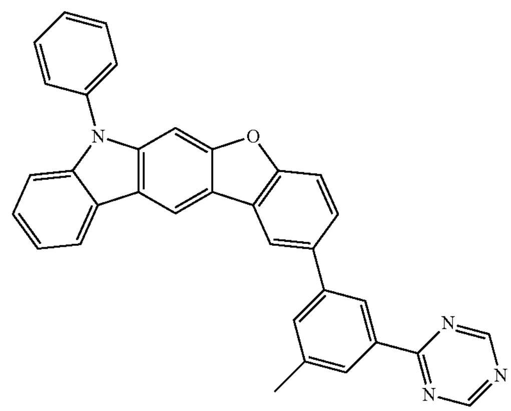
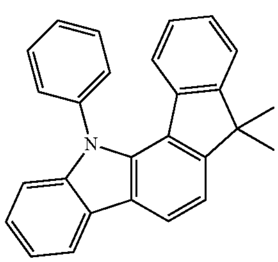
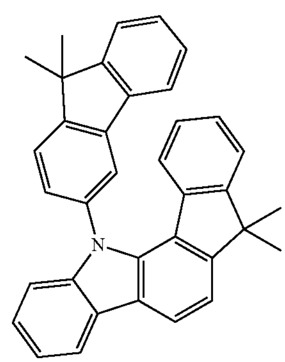

-continued
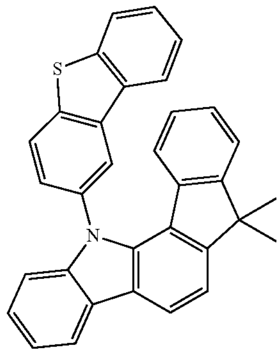
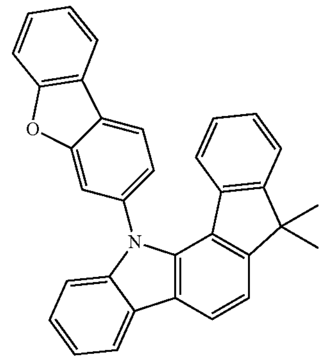
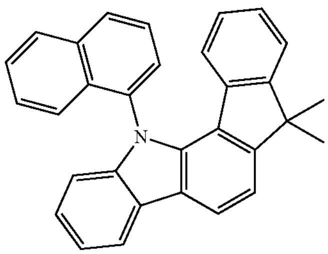
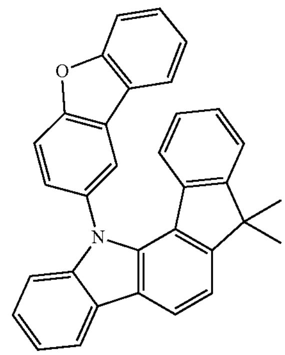
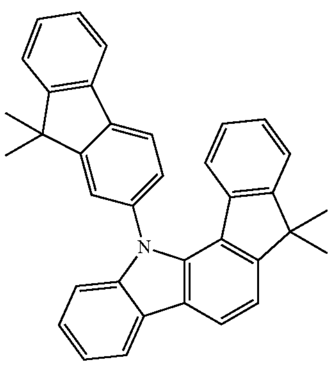
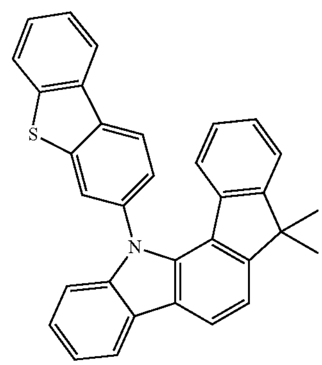
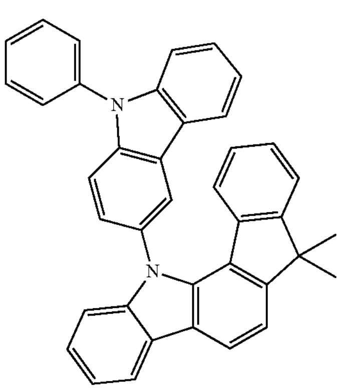
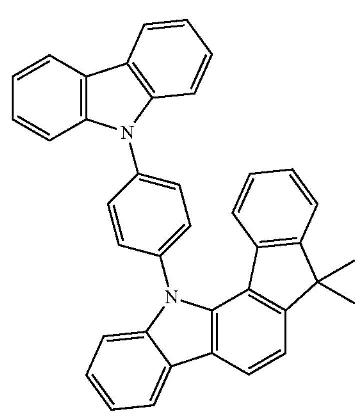

-continued
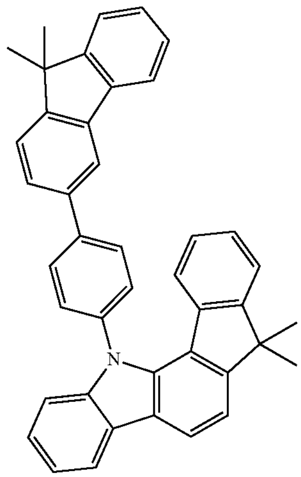
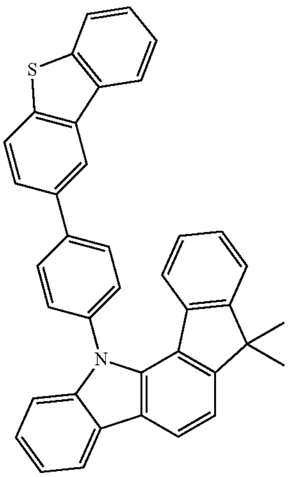
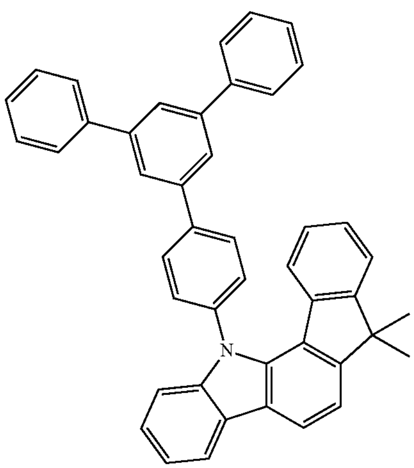
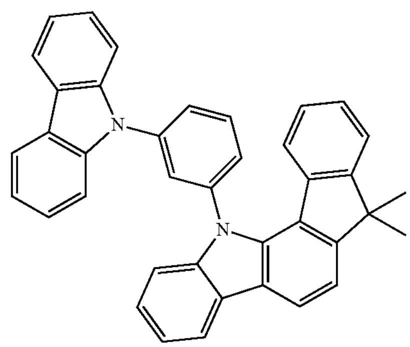
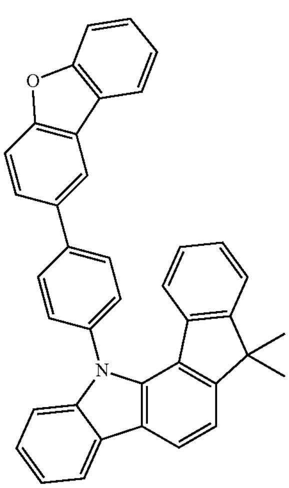
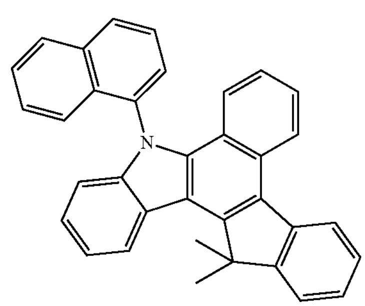

-continued
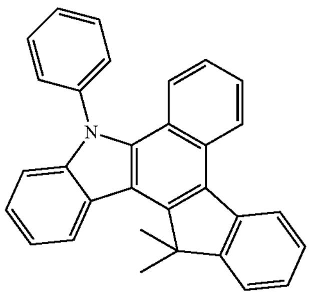
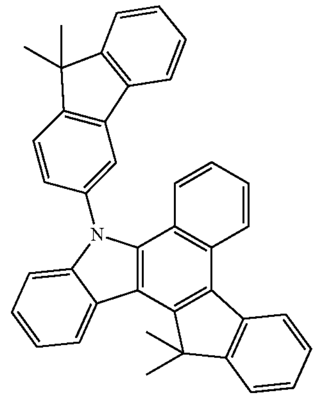
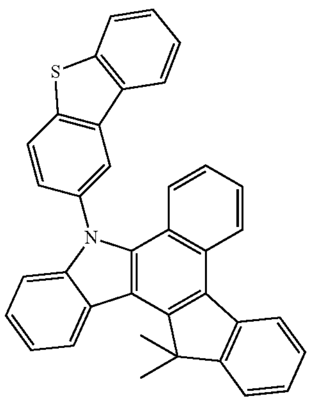
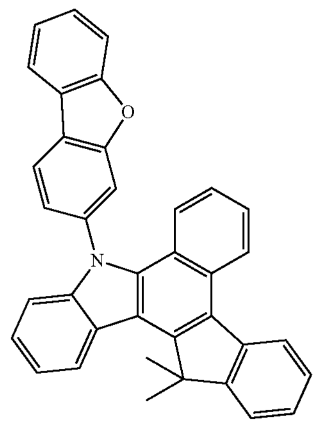
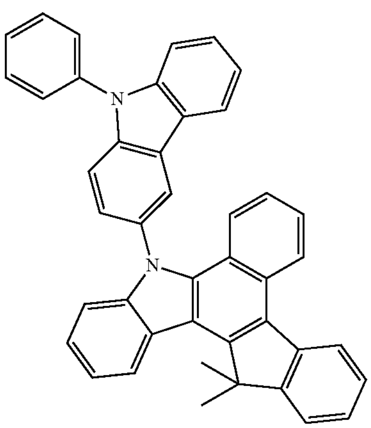
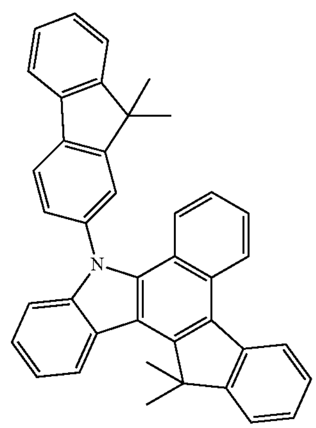
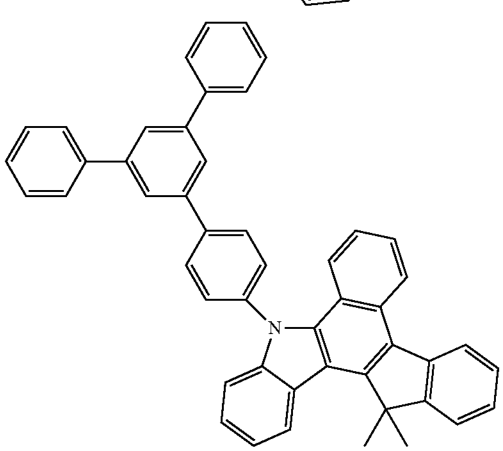
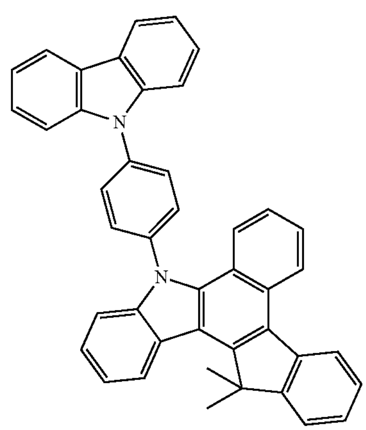

-continued
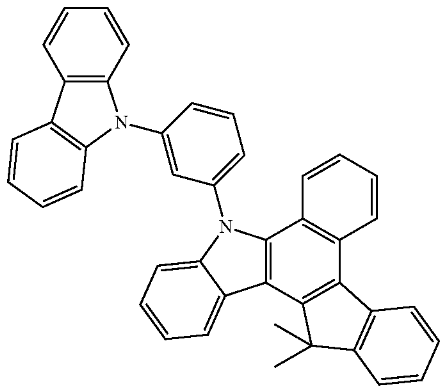
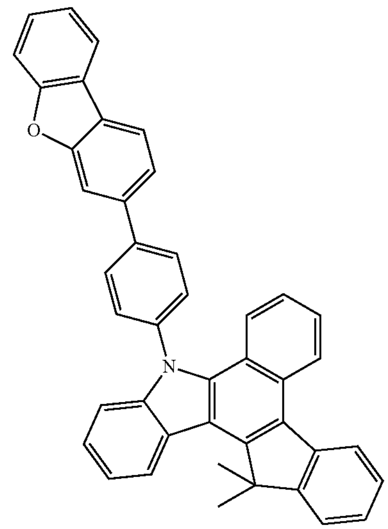
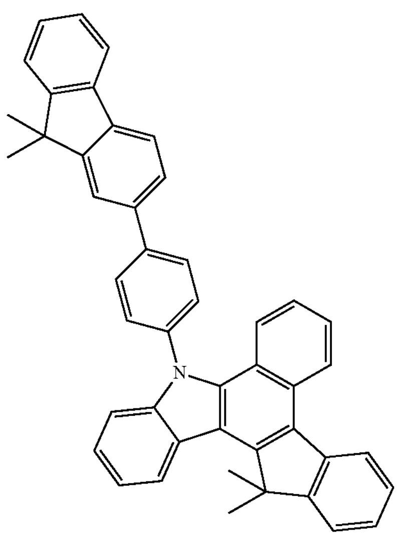
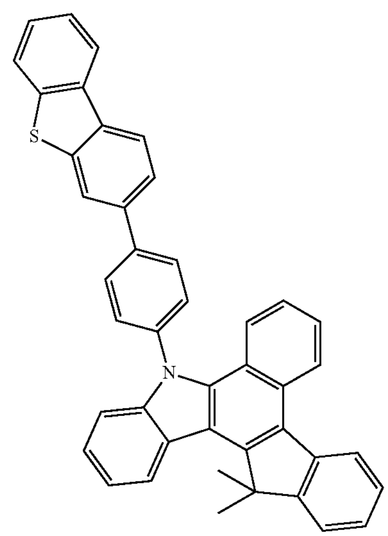
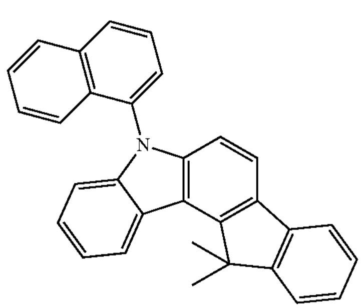
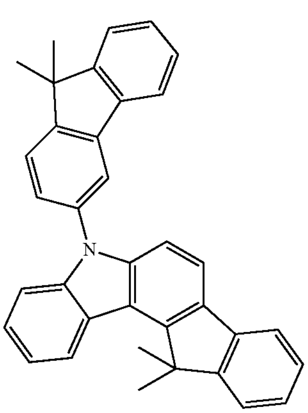

-continued
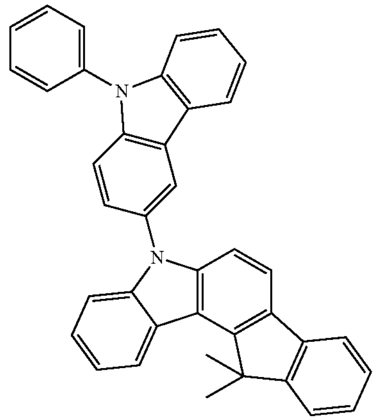
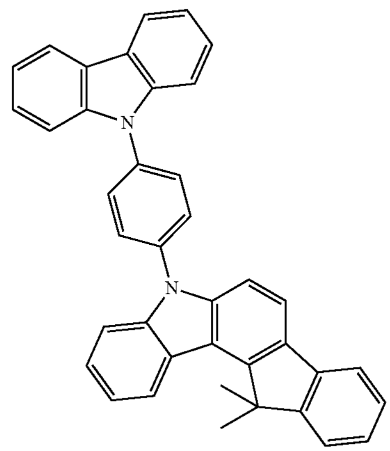
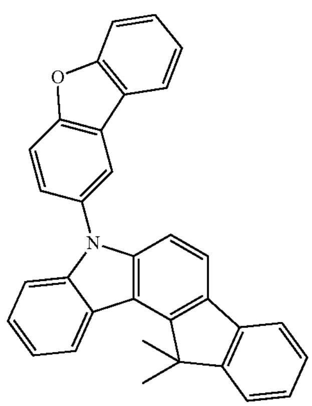
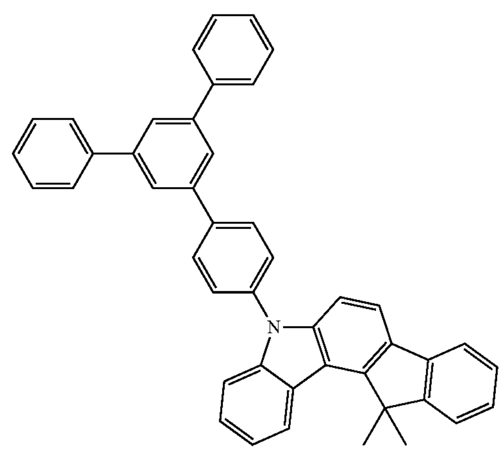
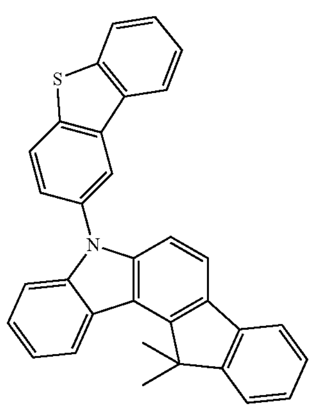
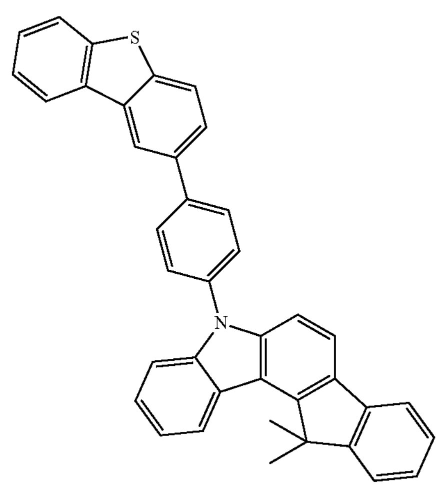

-continued
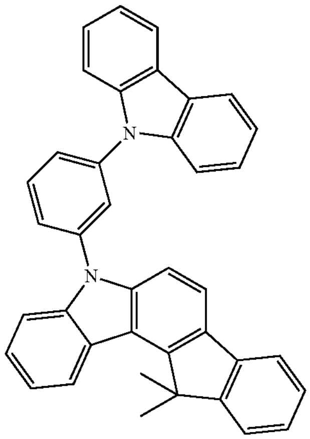
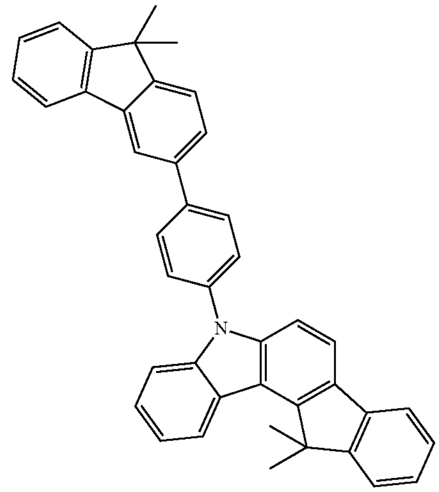
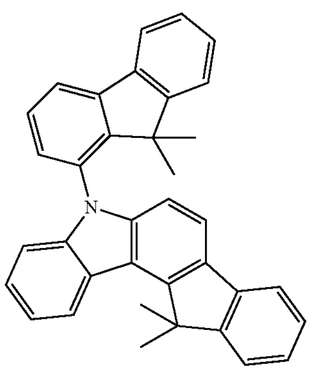
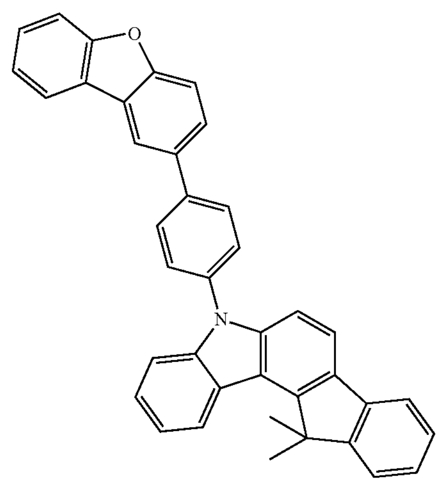
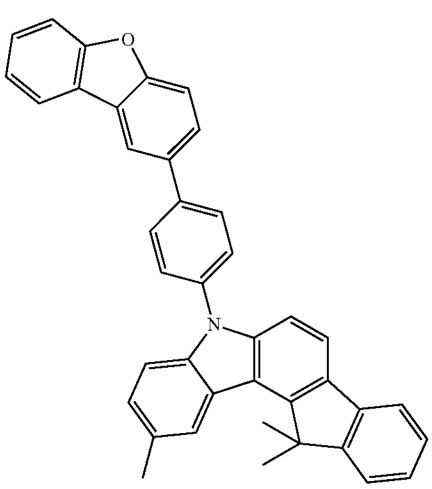
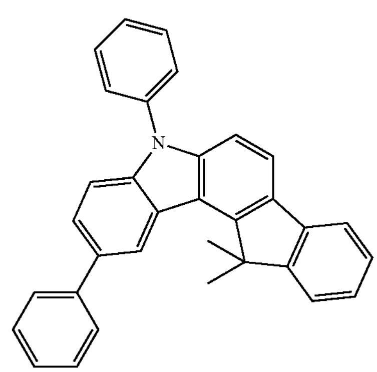

-continued
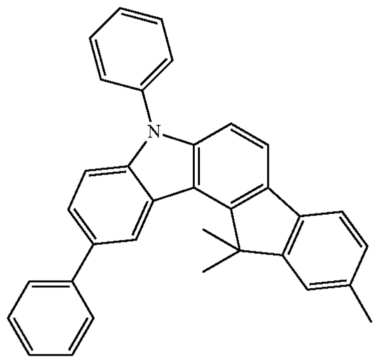
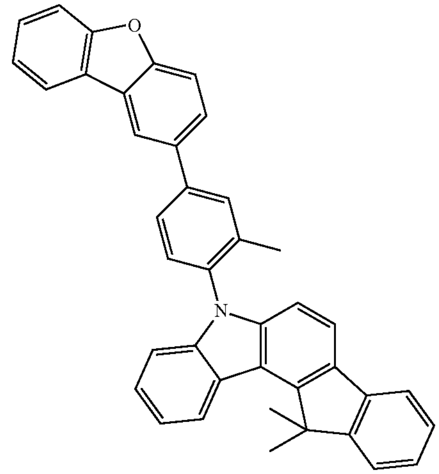
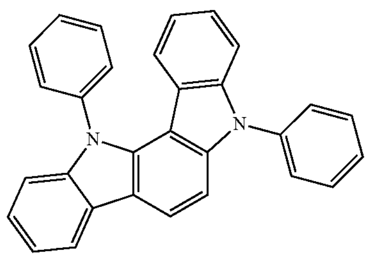
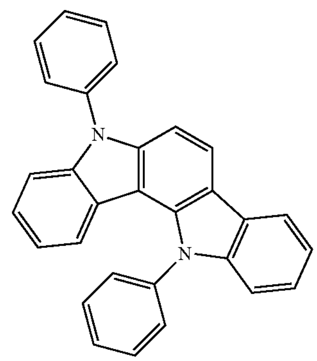
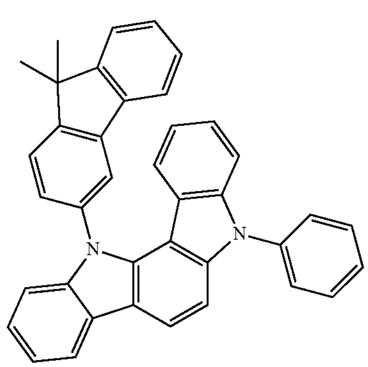
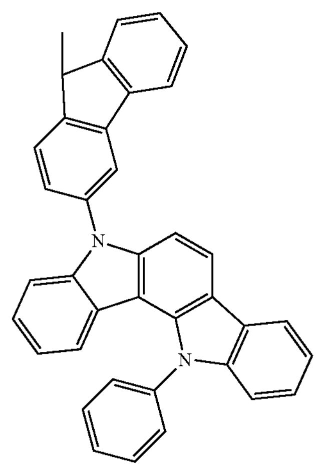

-continued
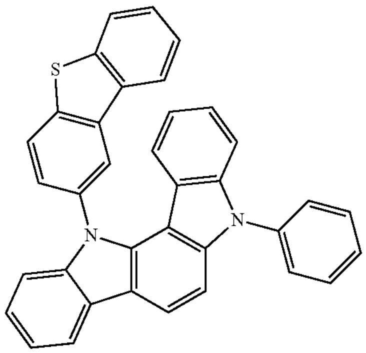
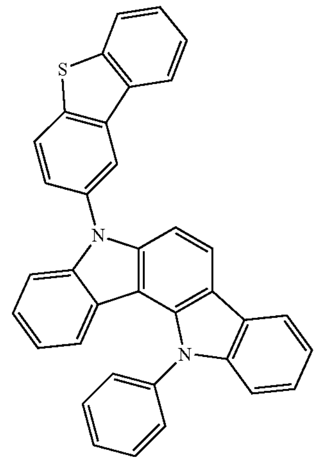
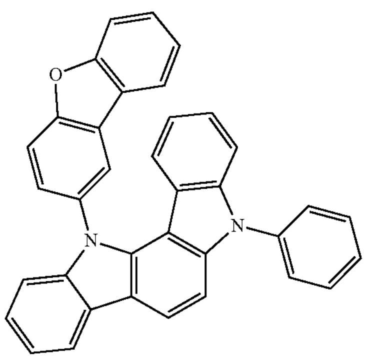
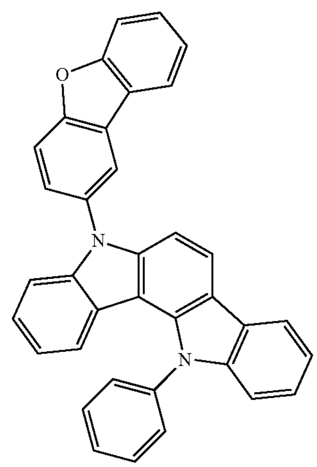
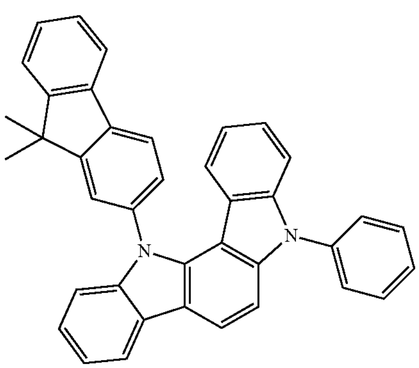
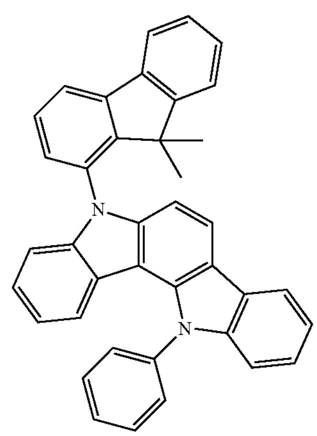

-continued
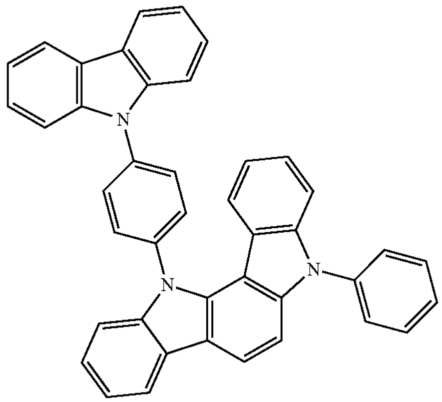
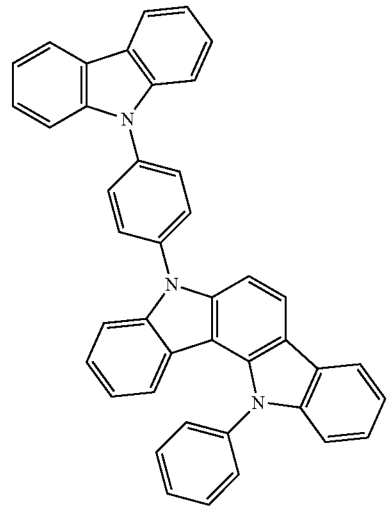
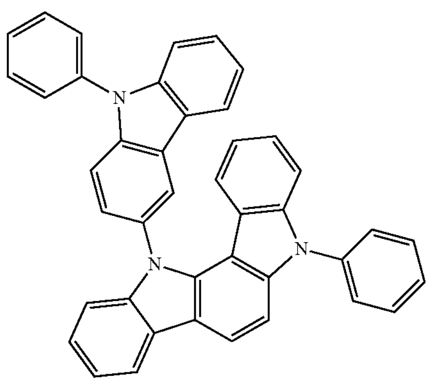
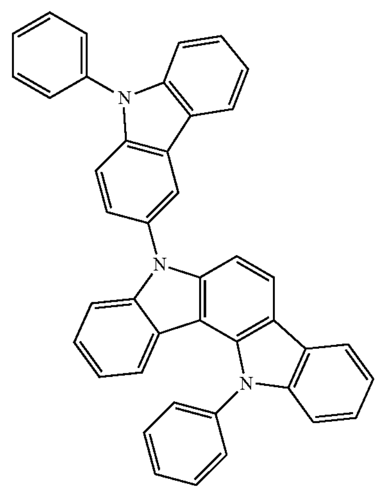
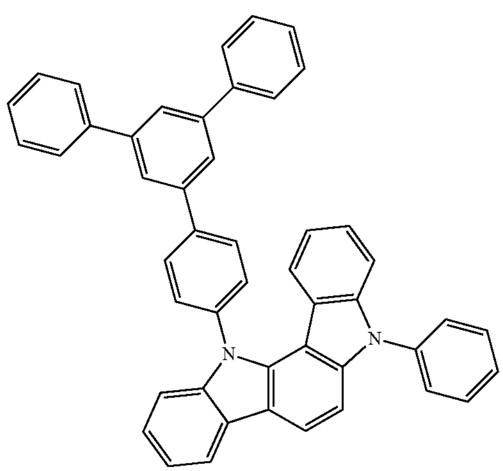
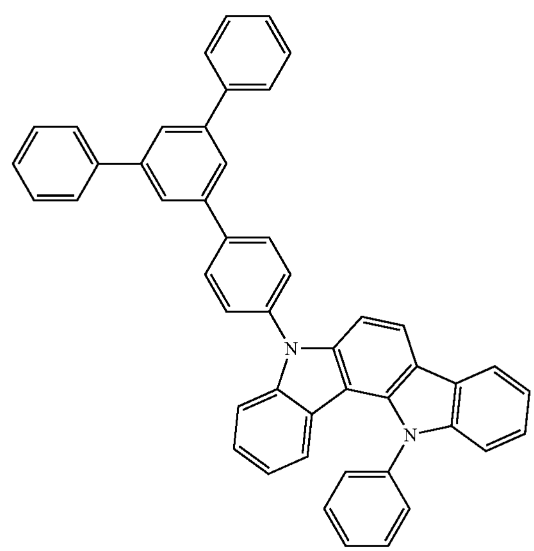

-continued
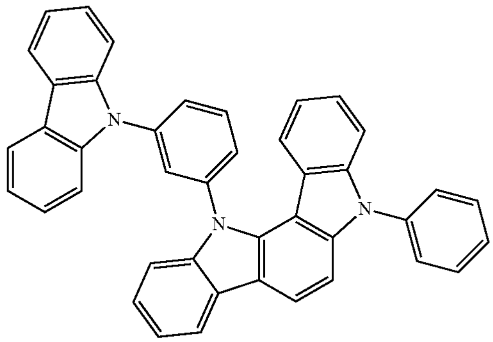
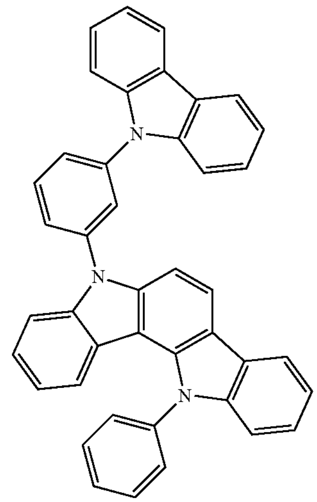
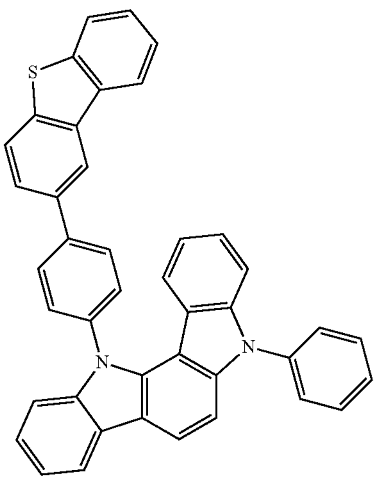
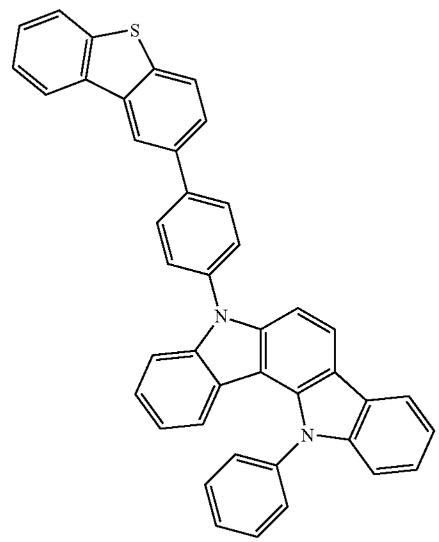
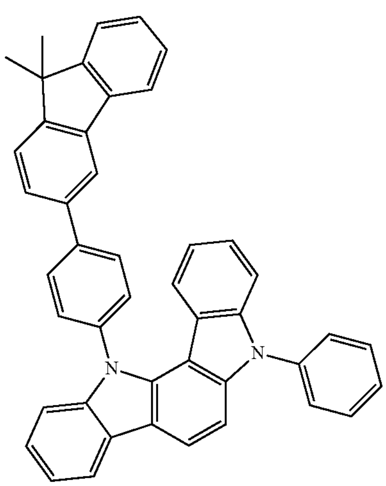
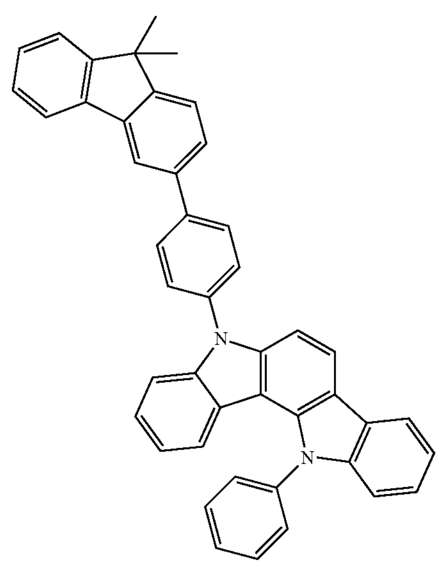

-continued
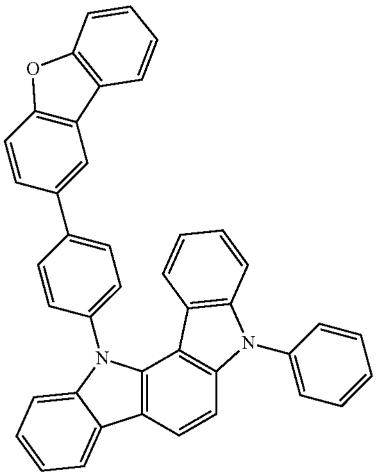
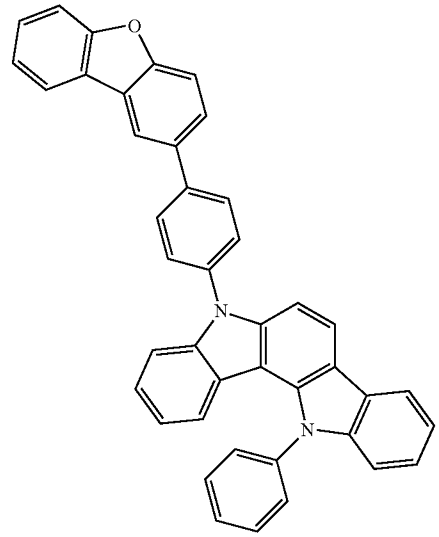
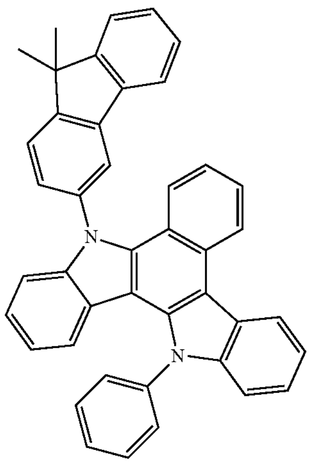
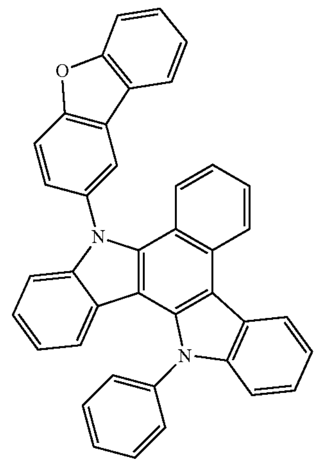
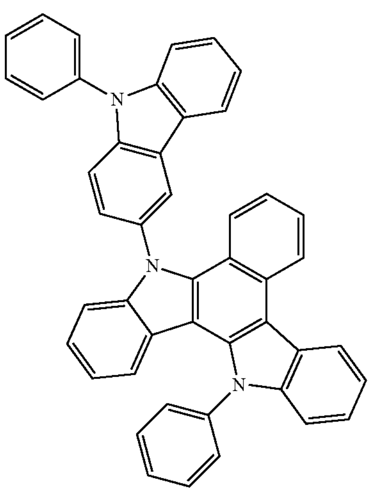
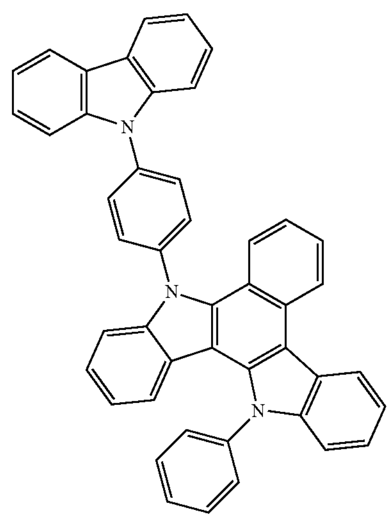

-continued
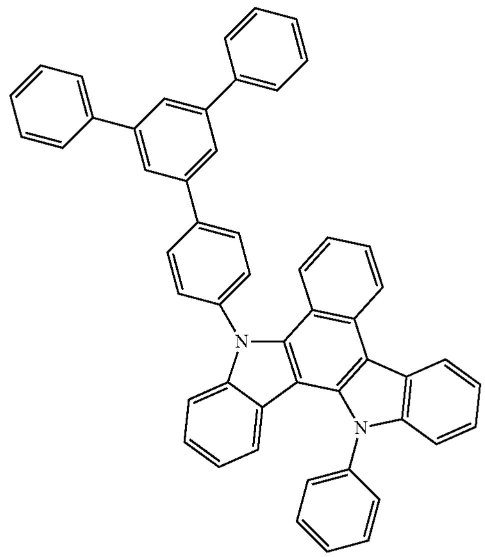
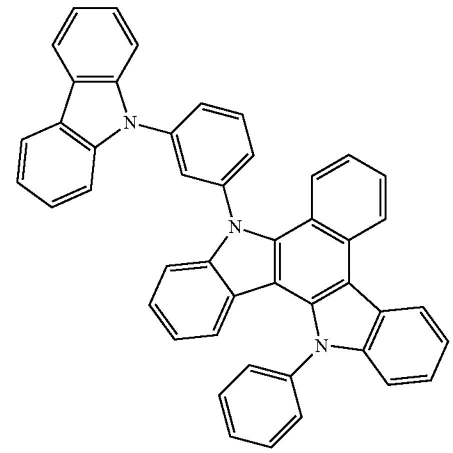
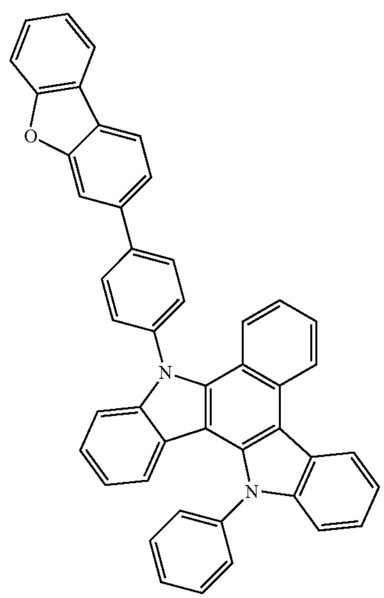
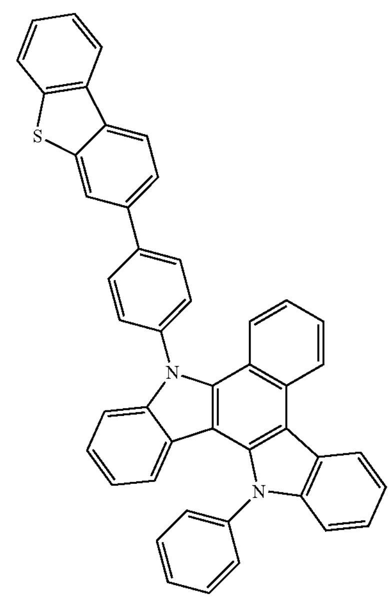
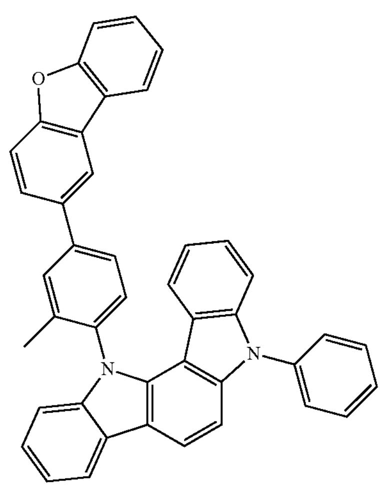
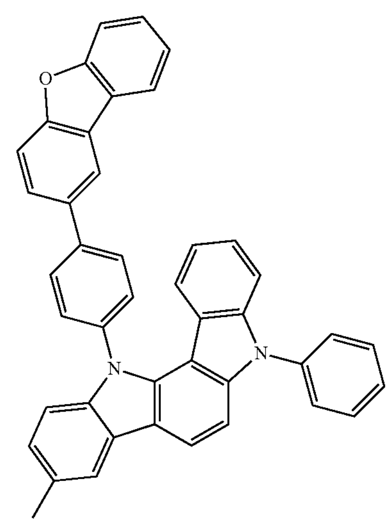

-continued
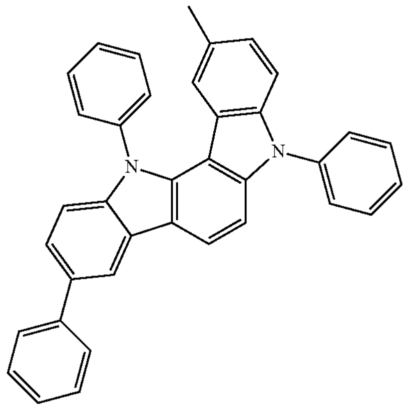
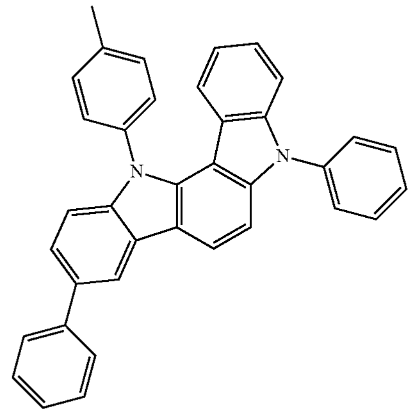
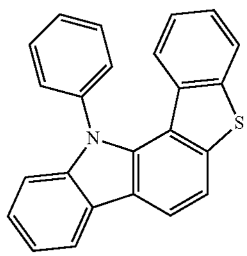
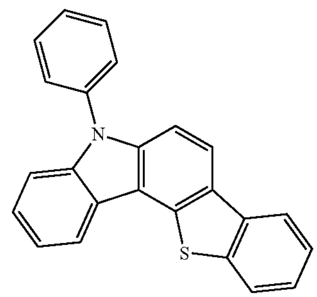
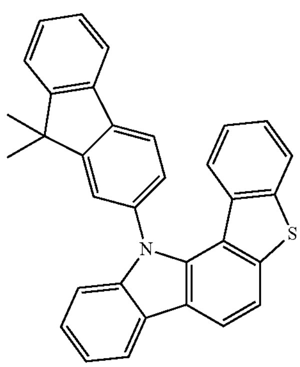
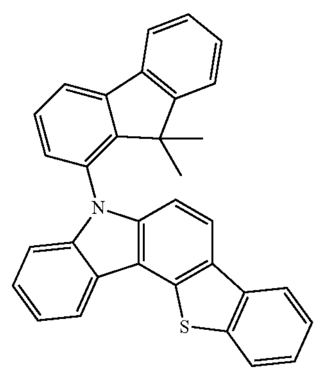
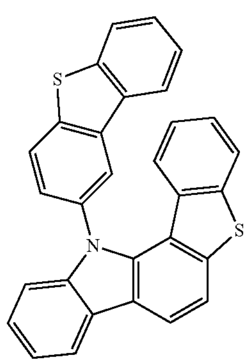
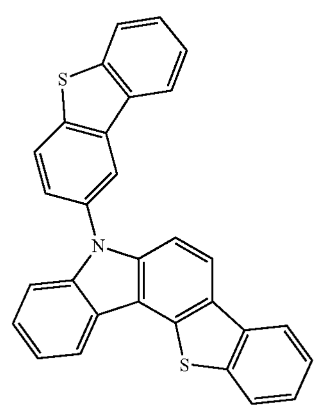

-continued
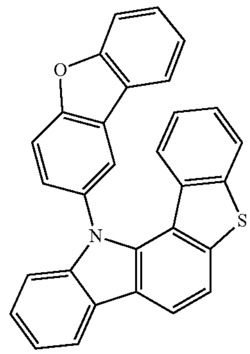
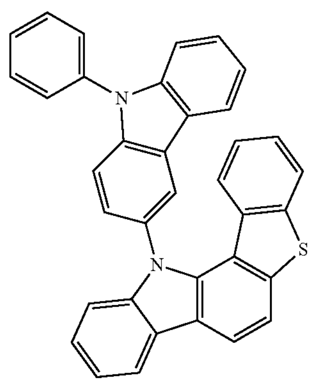
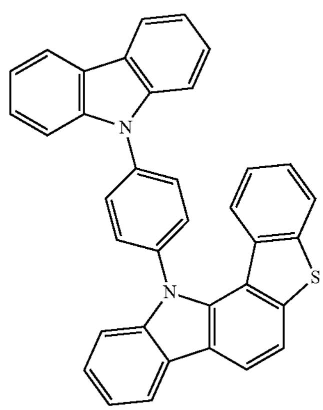
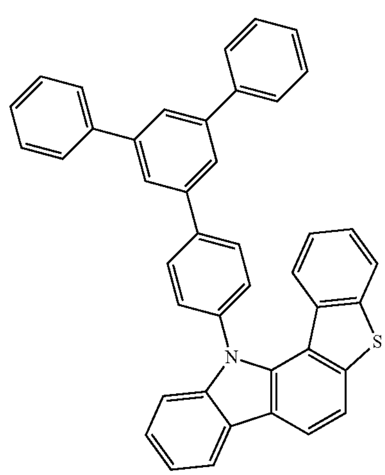
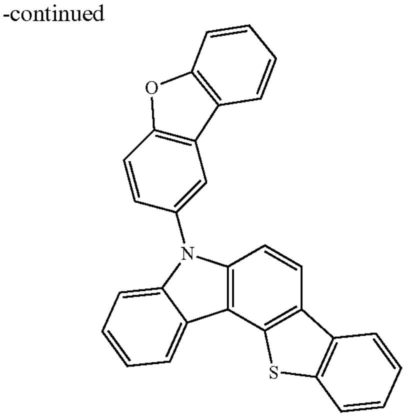
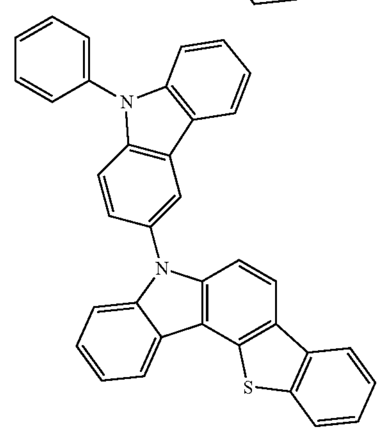
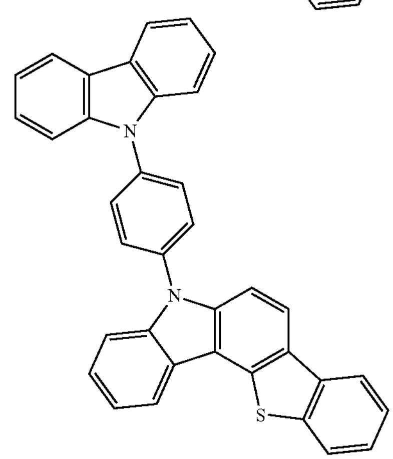
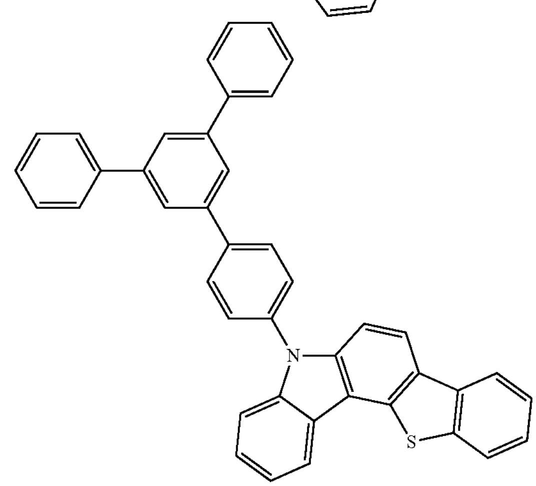

-continued
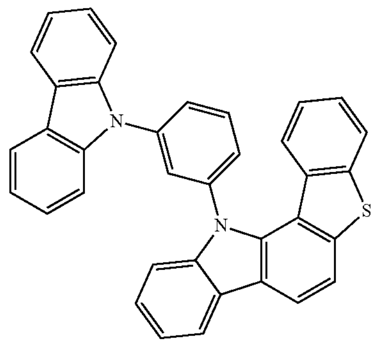
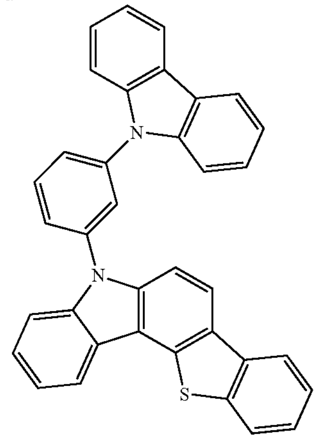
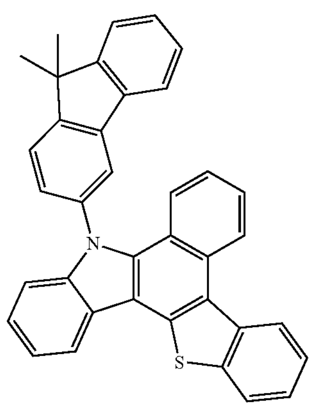
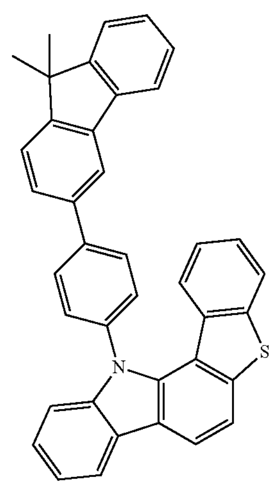
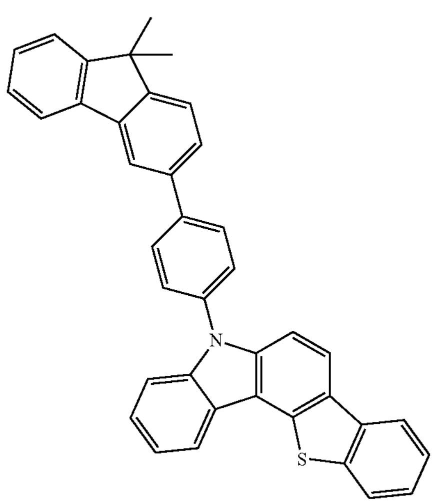
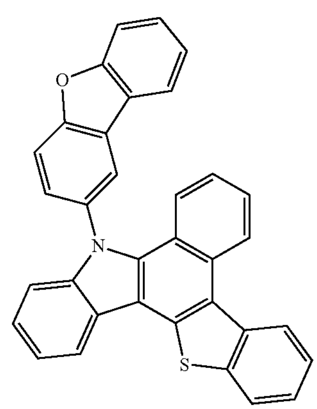

-continued
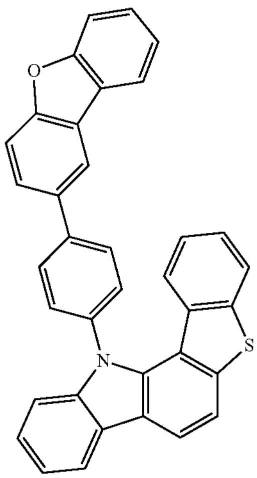
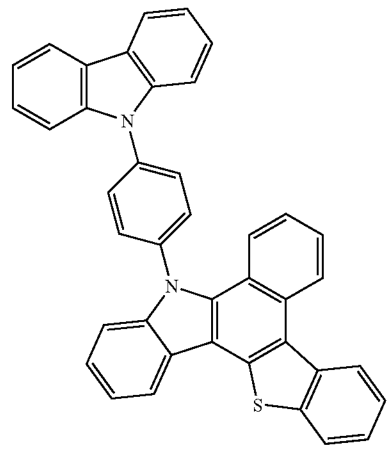
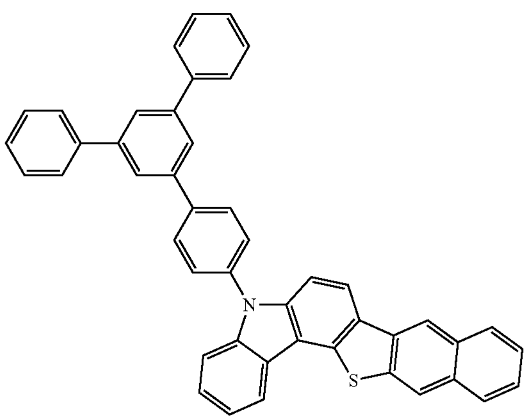
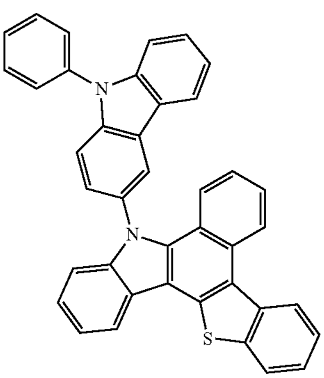
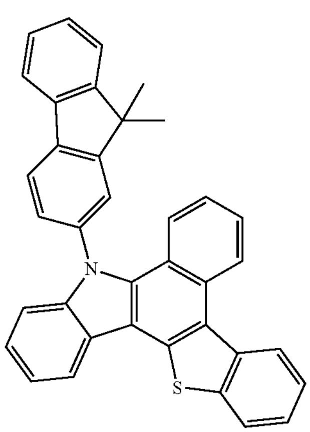
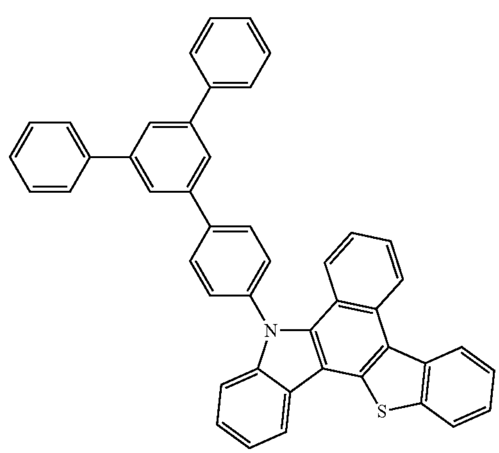

-continued
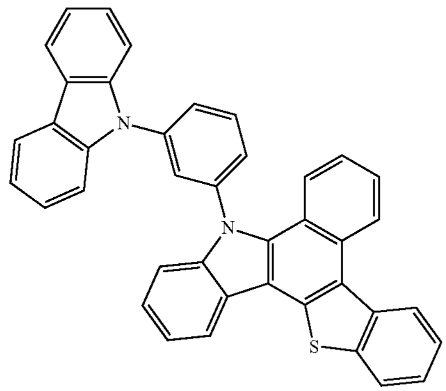
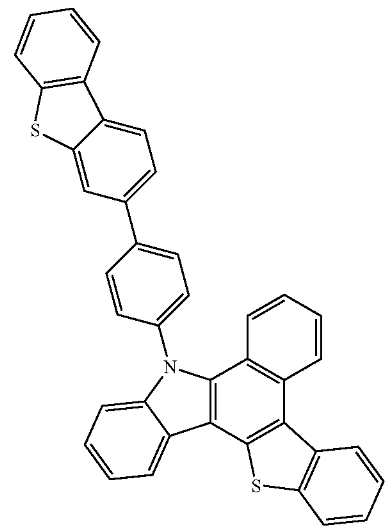
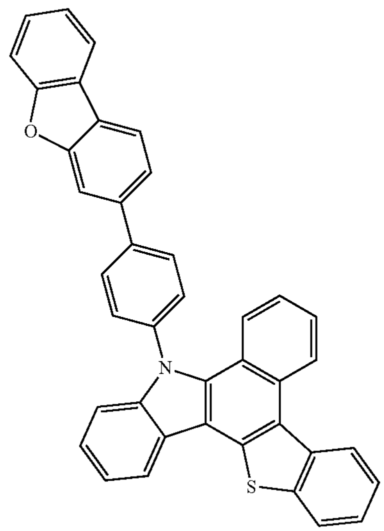
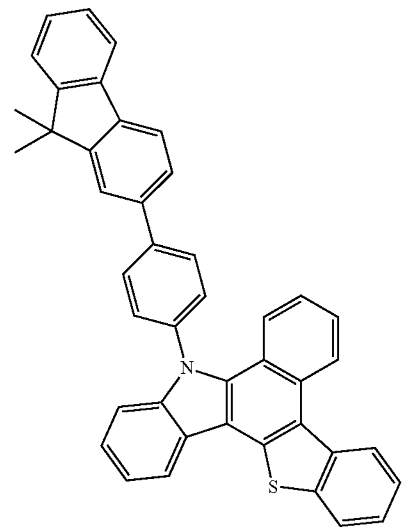
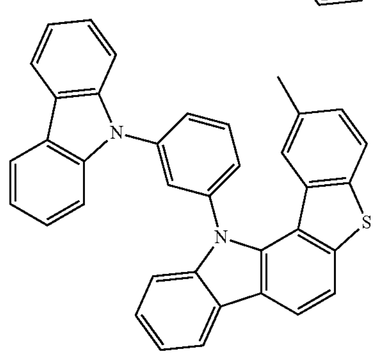
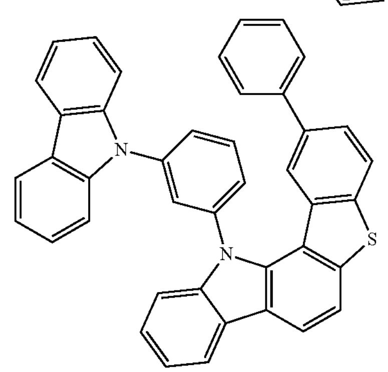
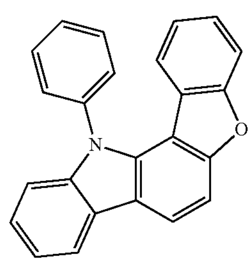
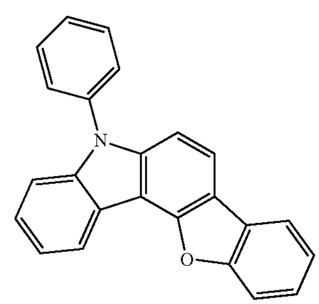

-continued
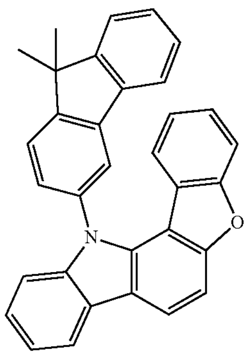
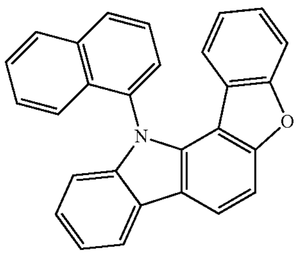
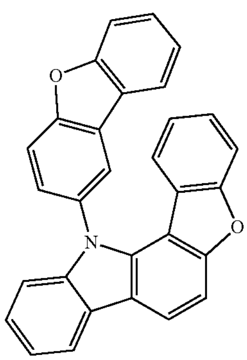
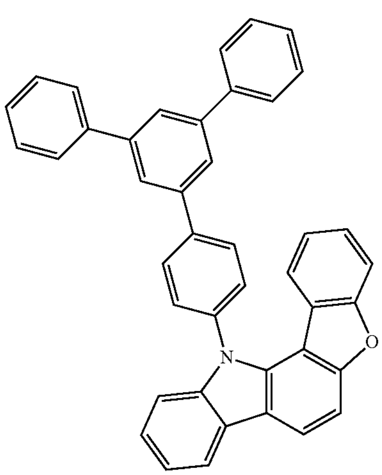
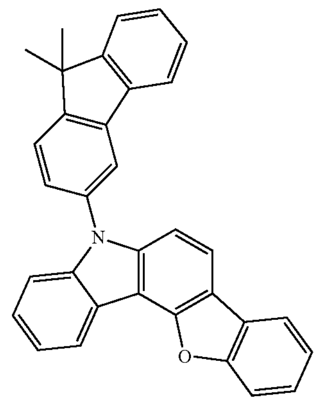
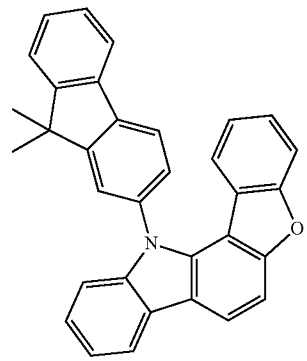
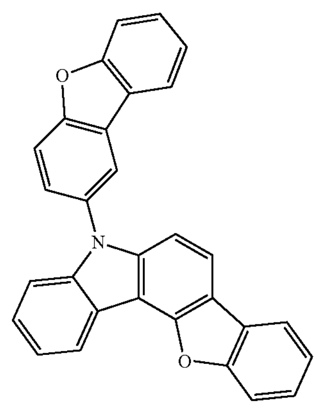
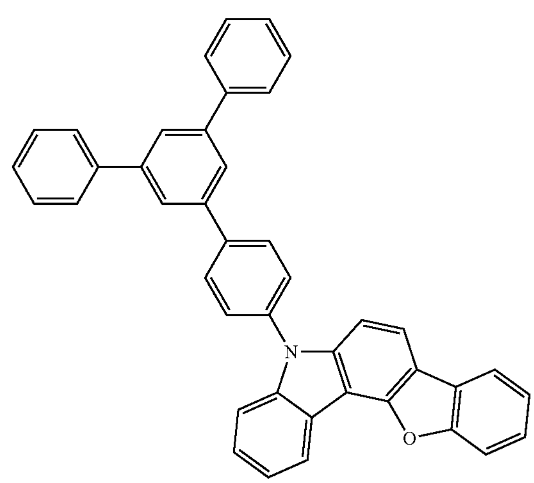

-continued
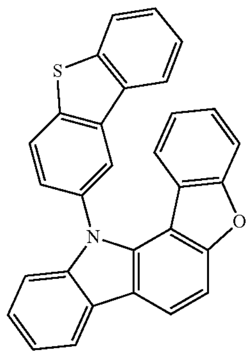
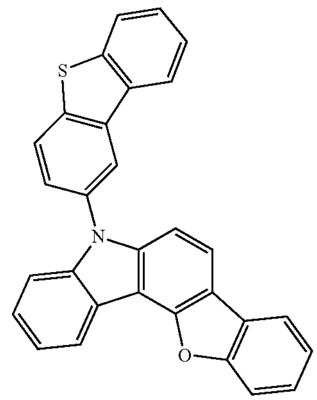
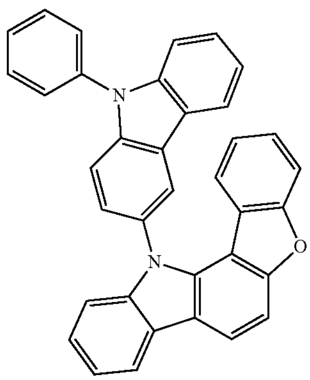
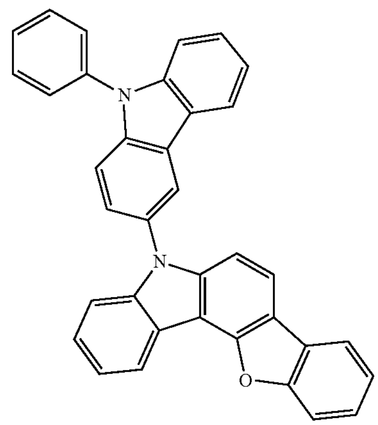
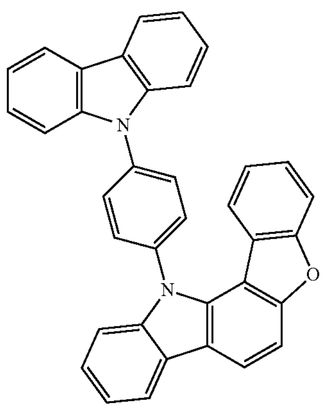
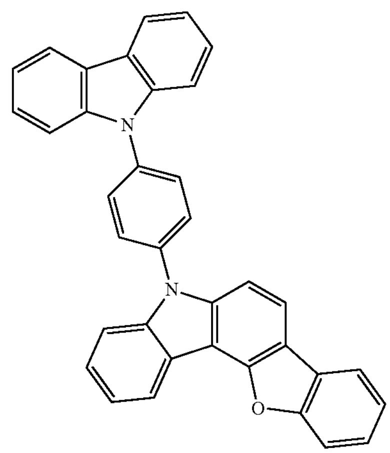
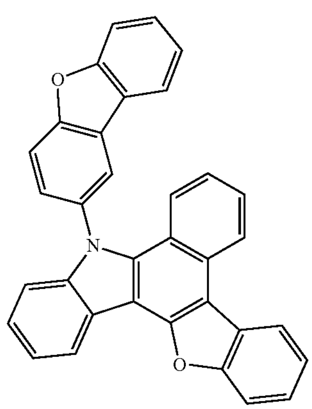
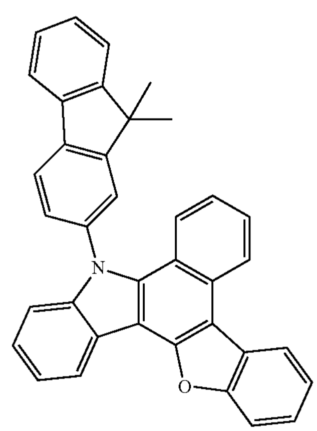

-continued
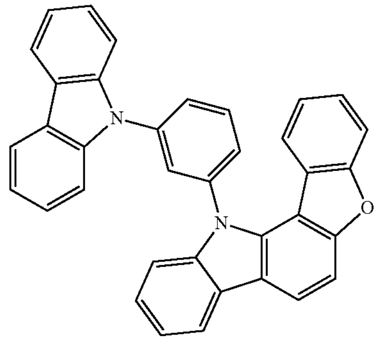
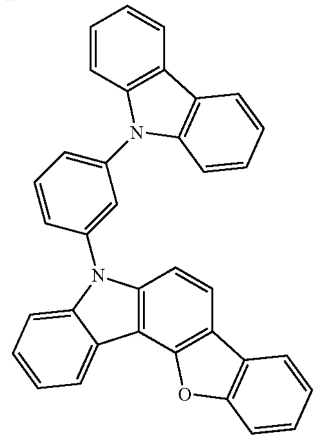
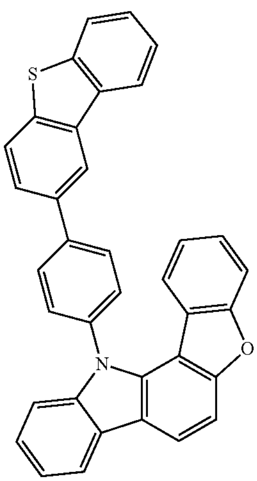
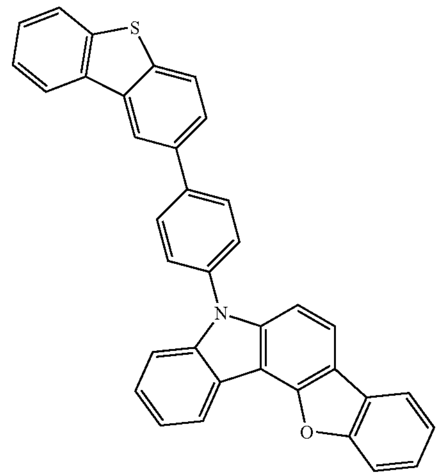
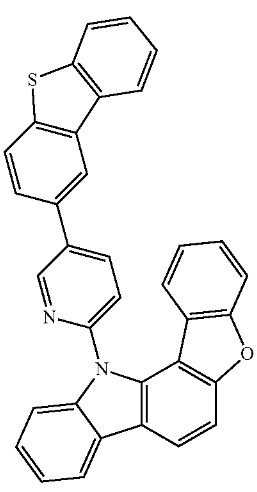
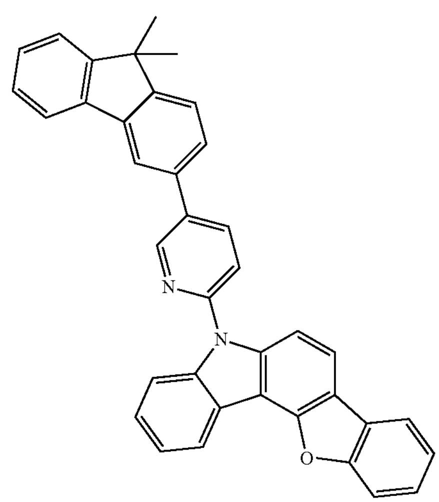

-continued
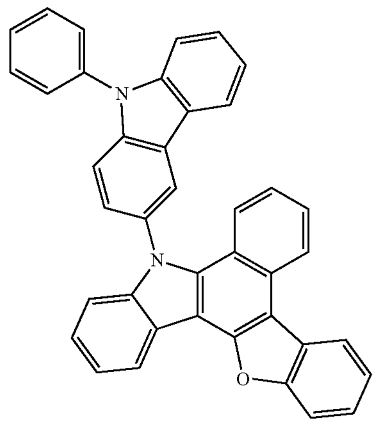
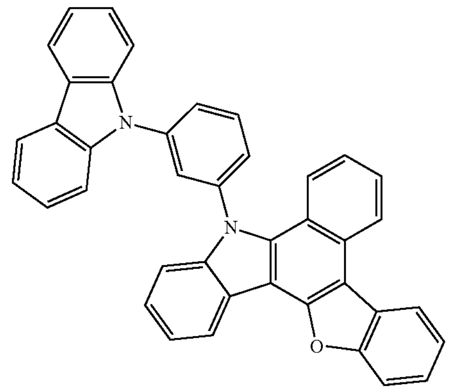
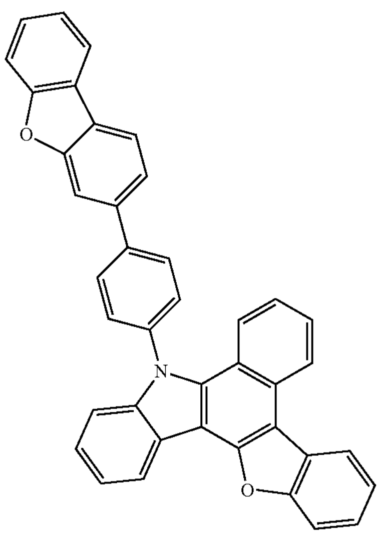
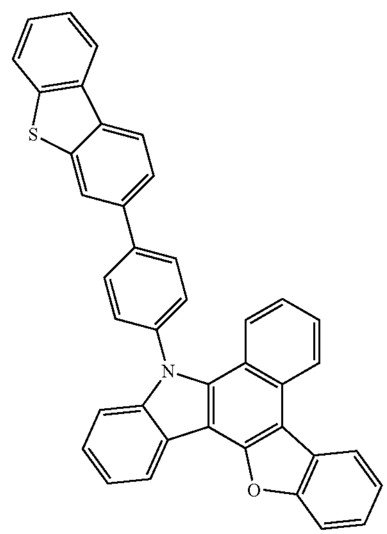
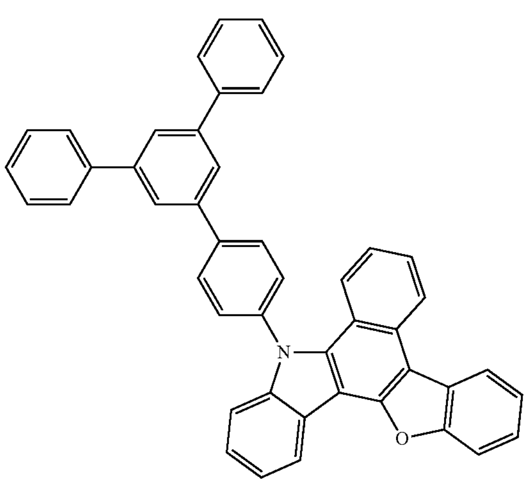
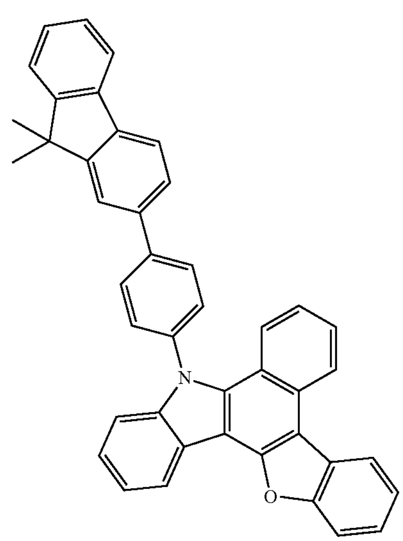

-continued
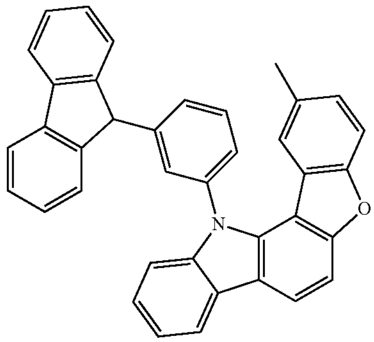
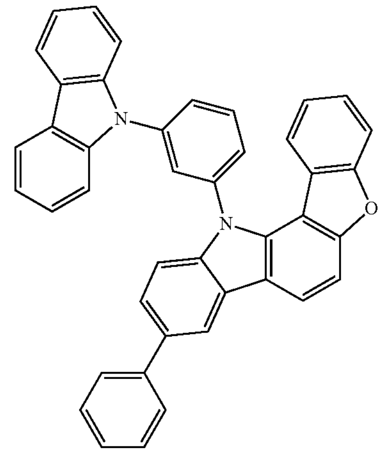
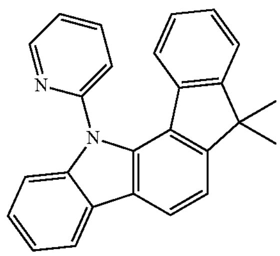
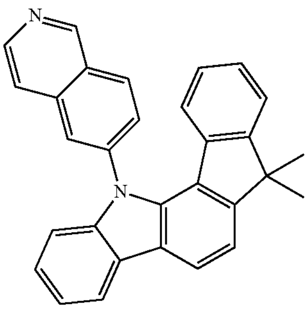
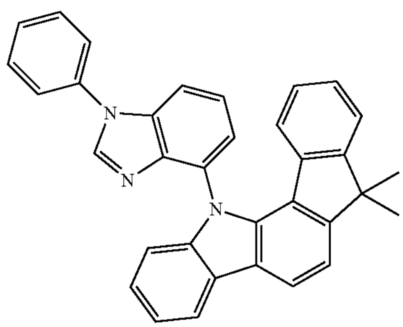
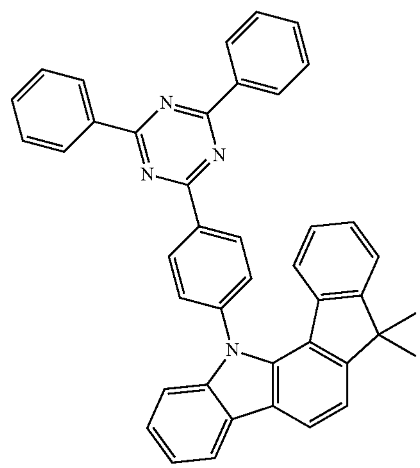
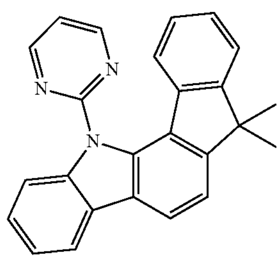
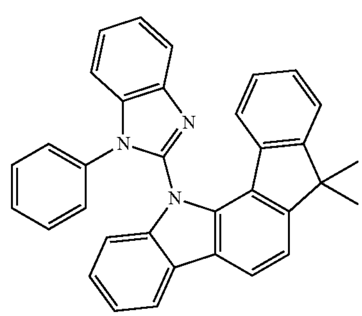

-continued
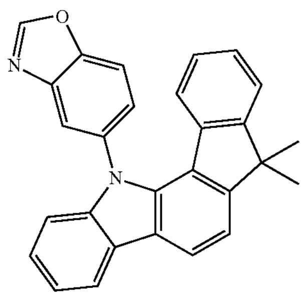
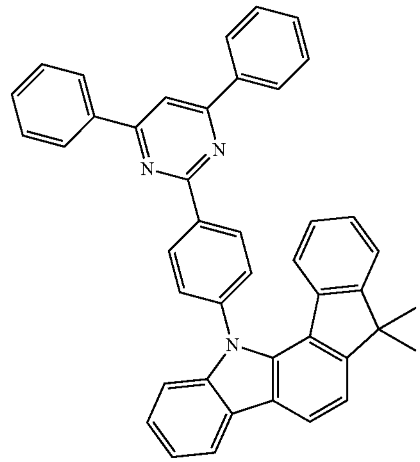
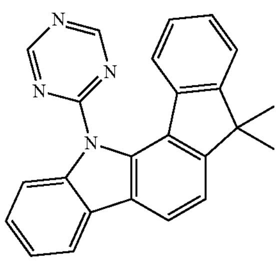
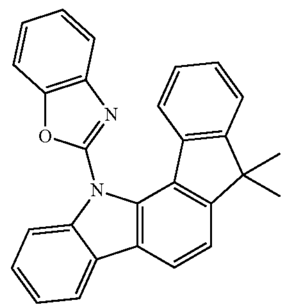
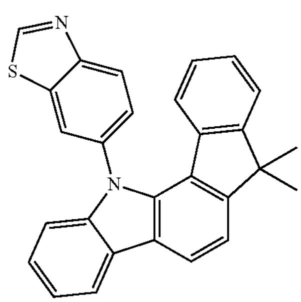
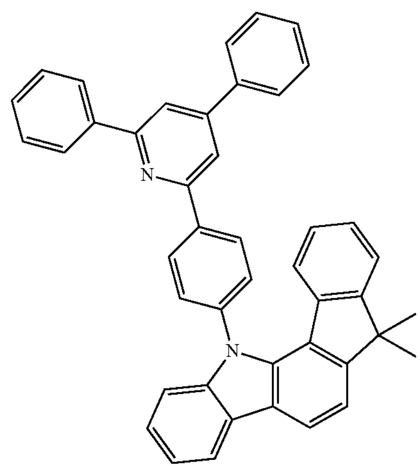
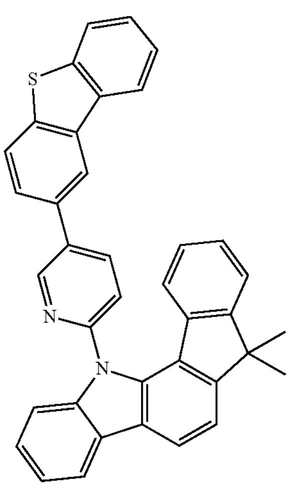
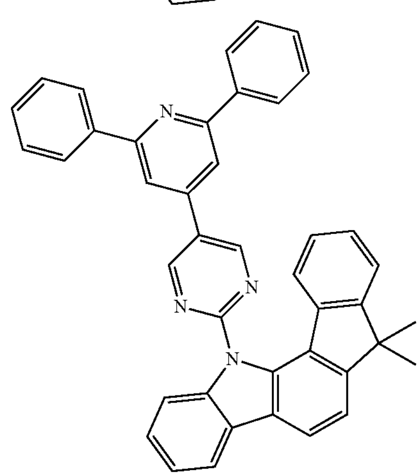

-continued
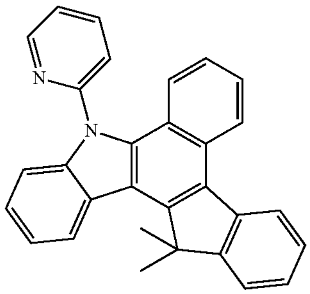
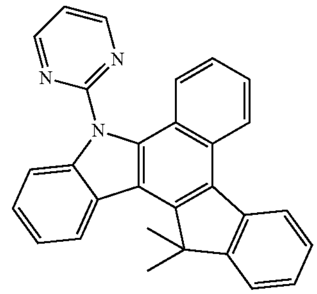
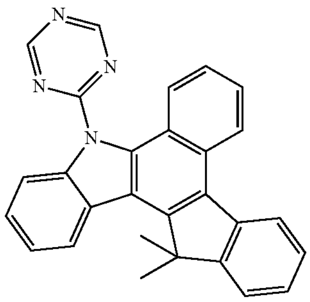
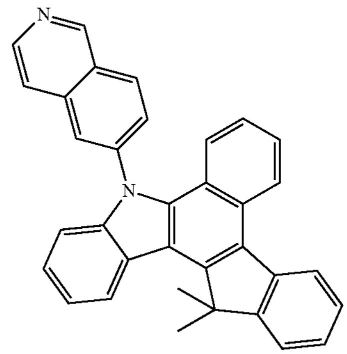
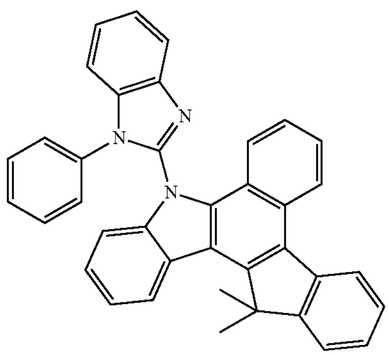
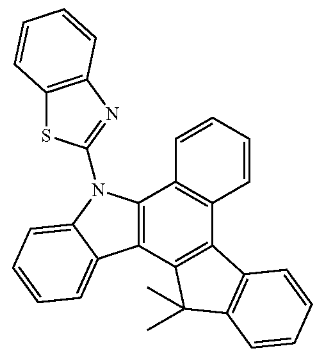
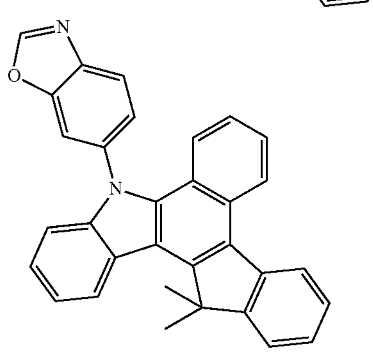
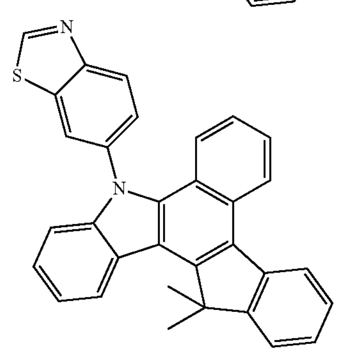
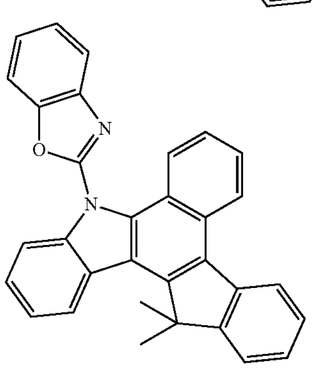
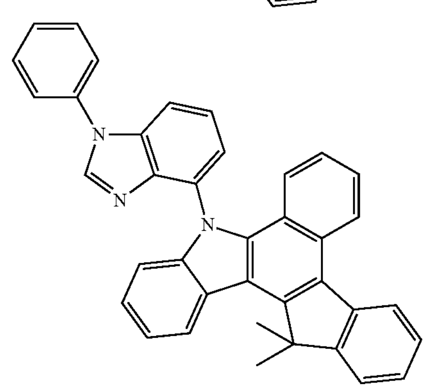

-continued
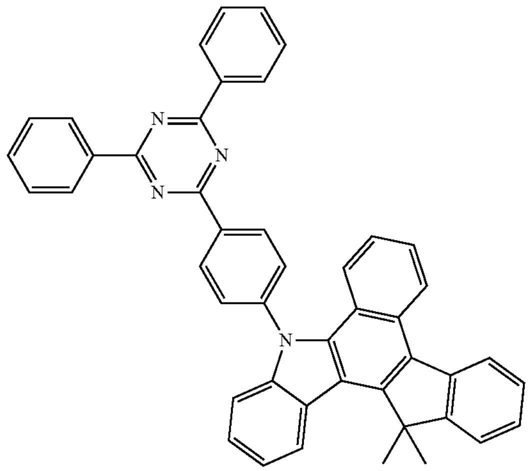
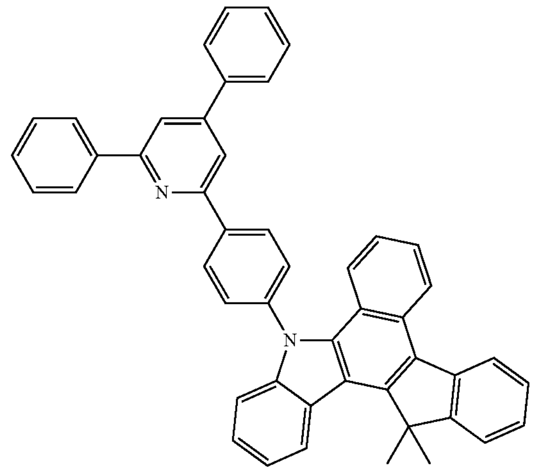
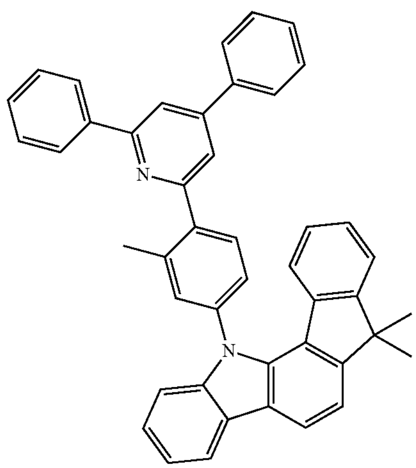
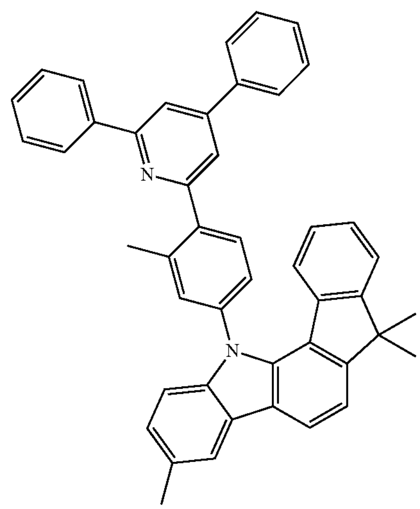
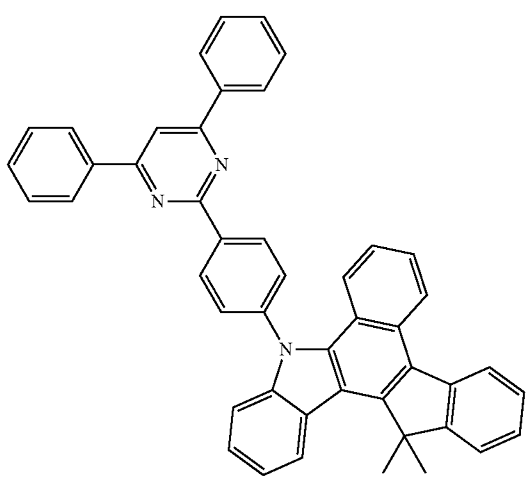
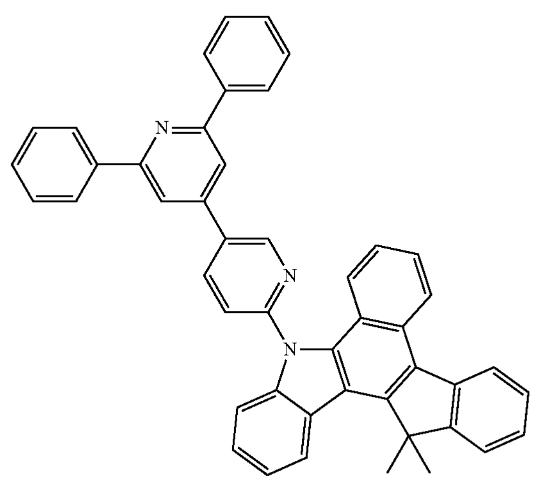

-continued
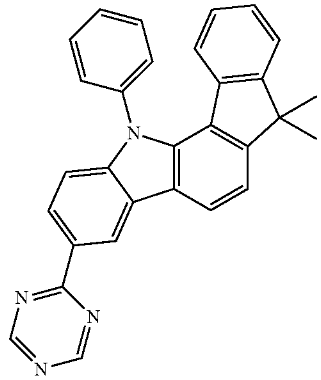
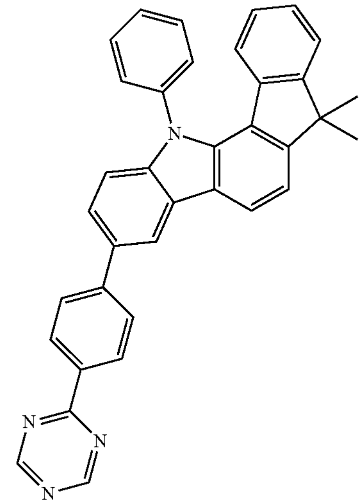
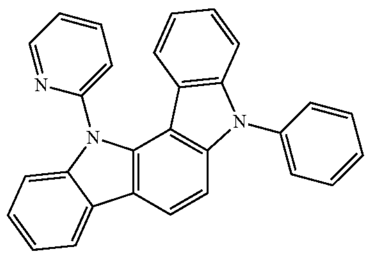
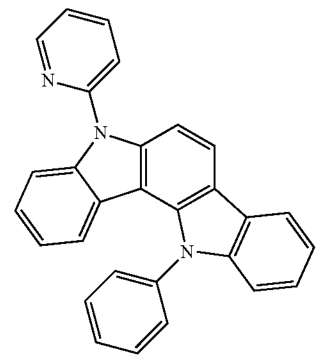
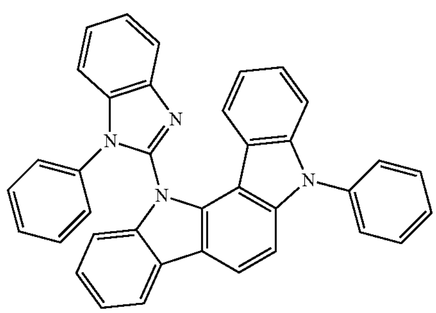
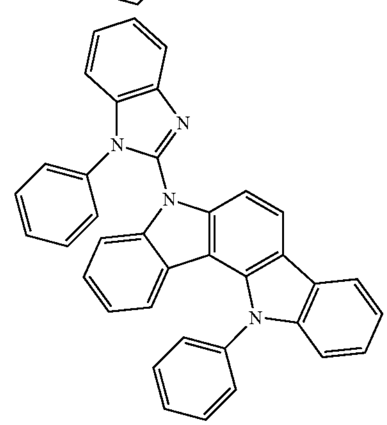
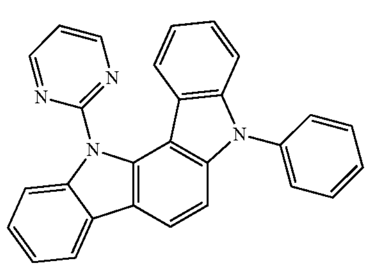
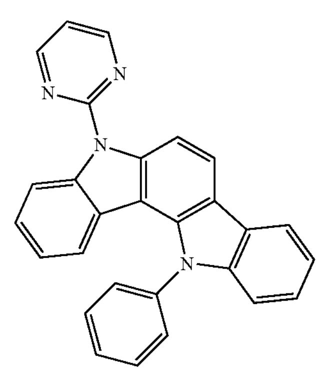

-continued
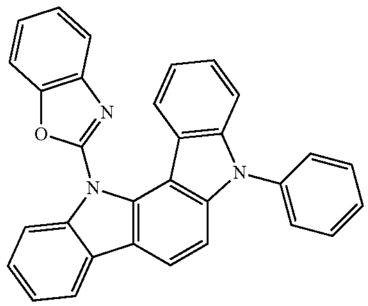
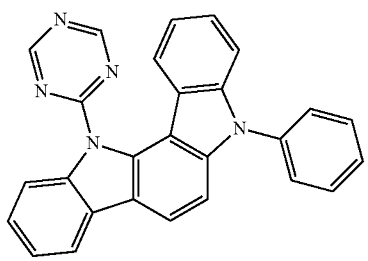
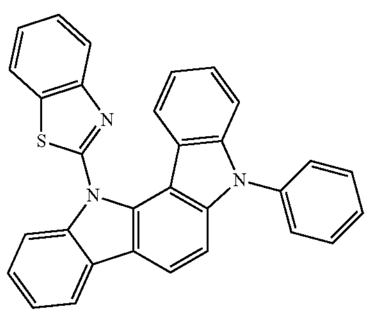
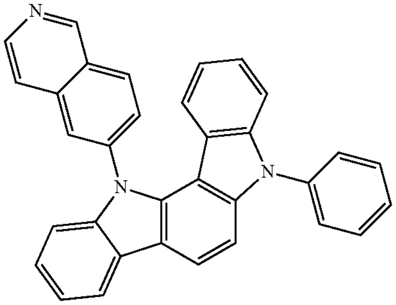
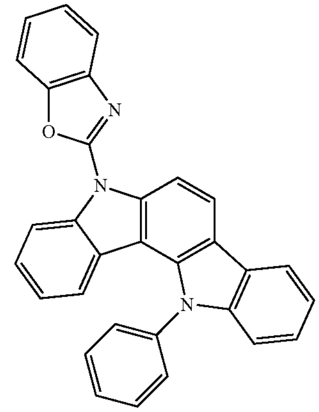
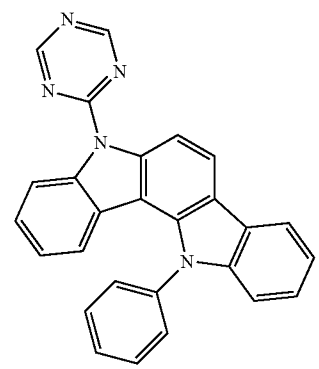
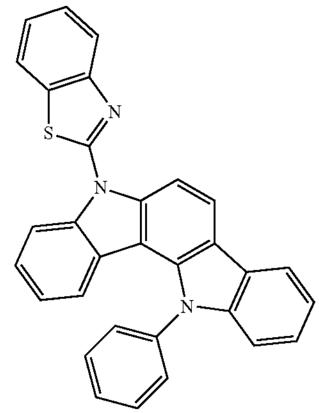
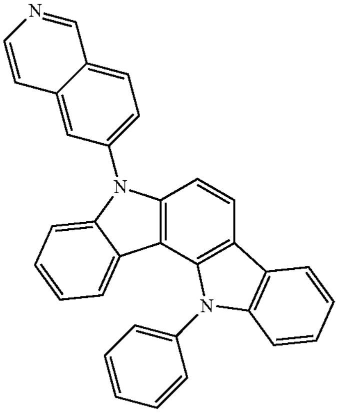

-continued
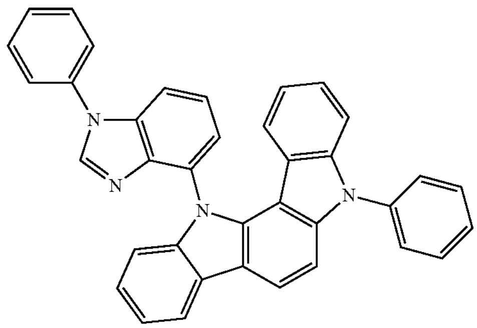
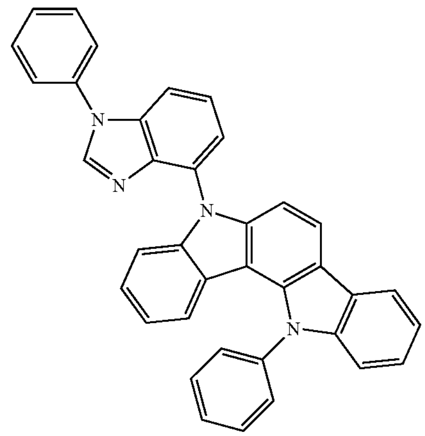
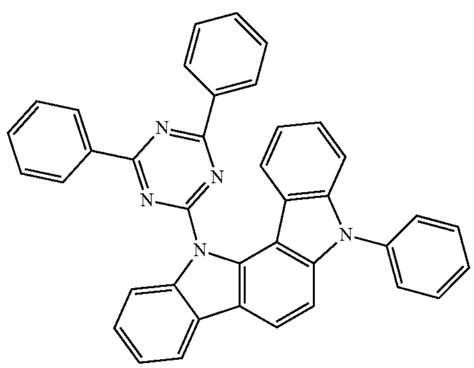
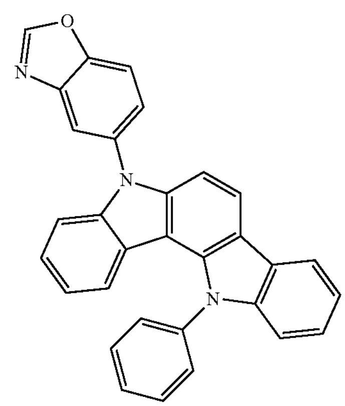
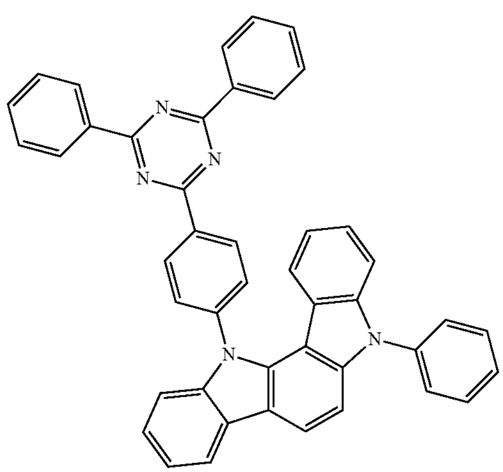
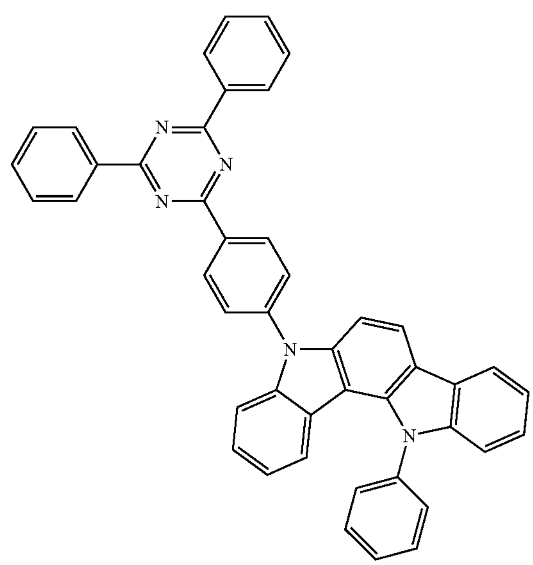

-continued
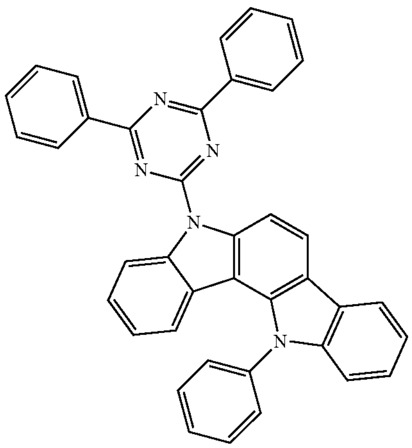
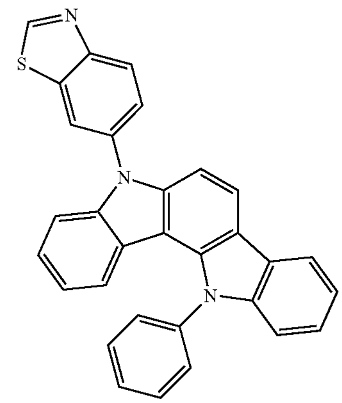
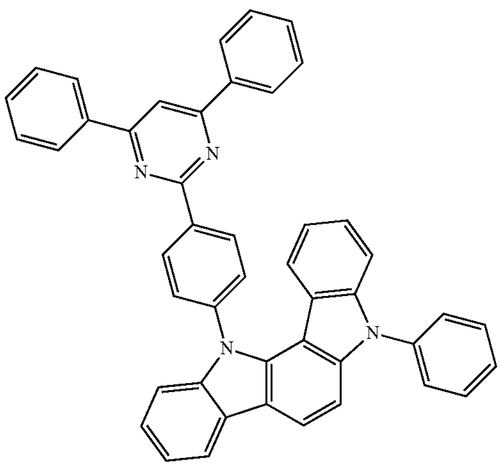
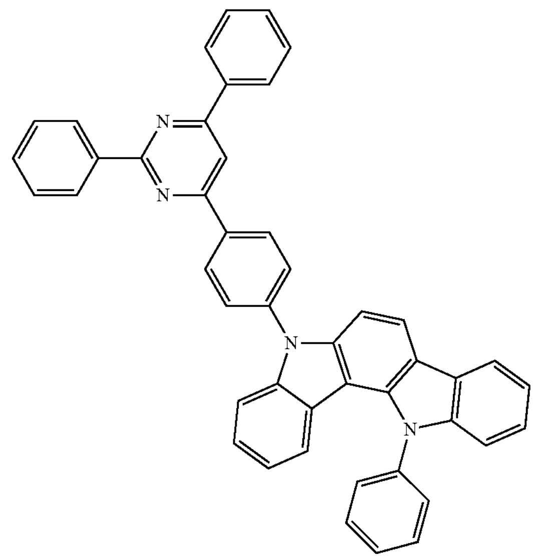
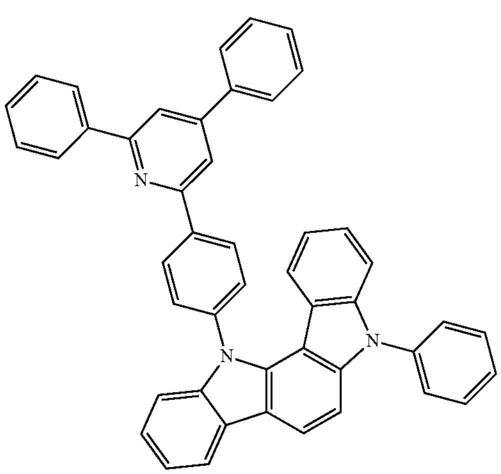
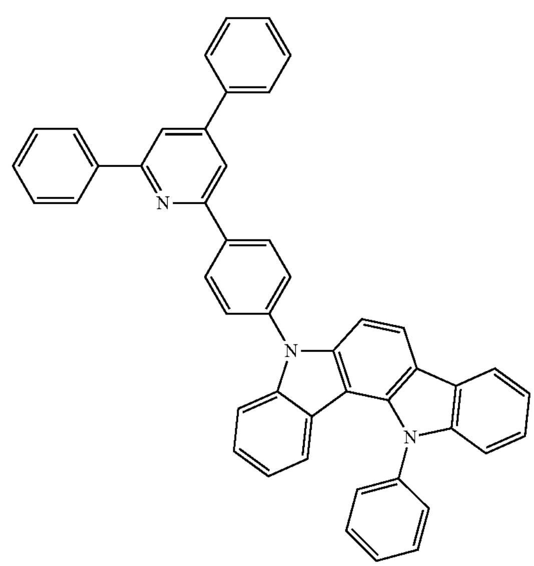

-continued
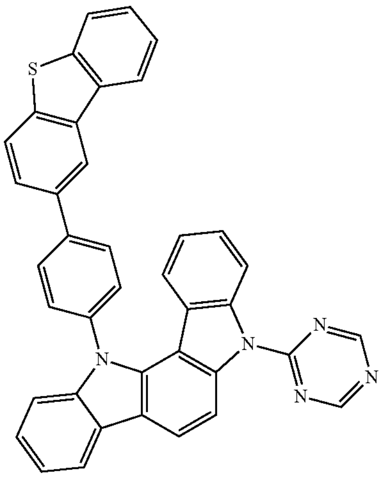
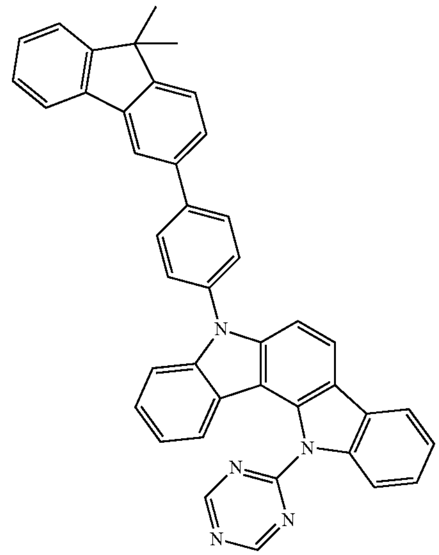
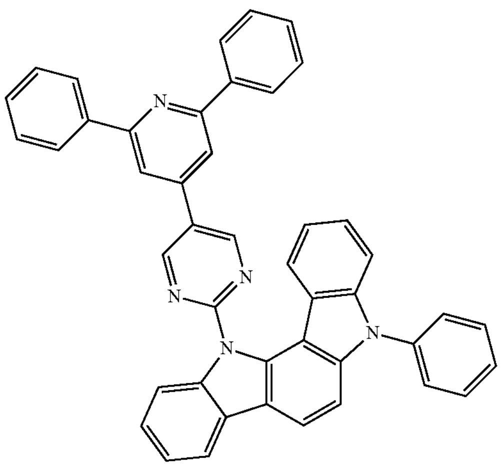
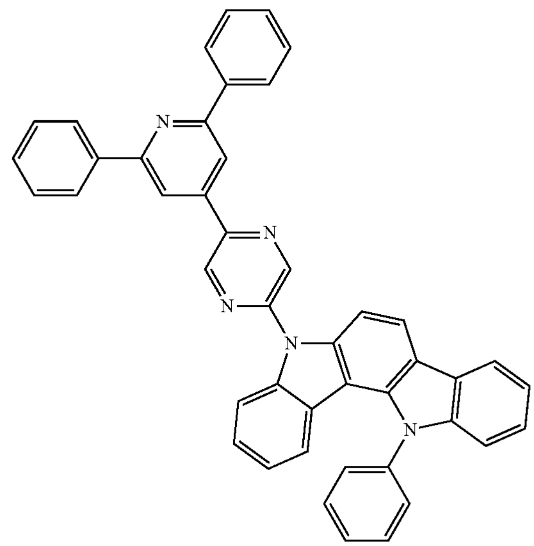
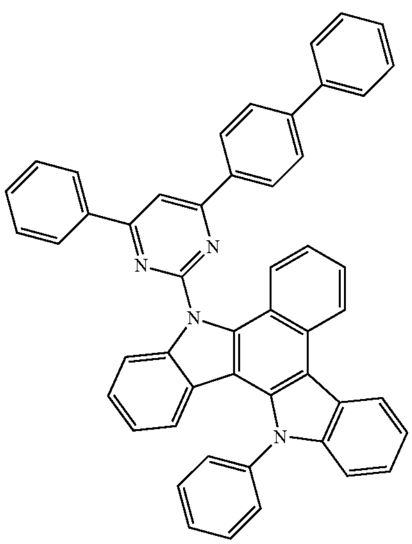
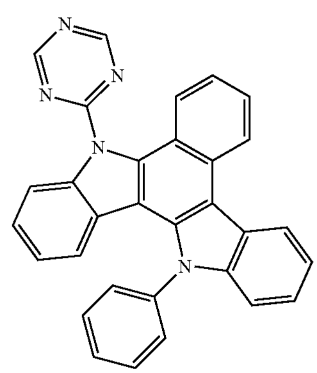

-continued
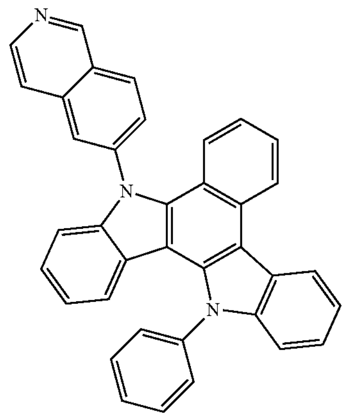
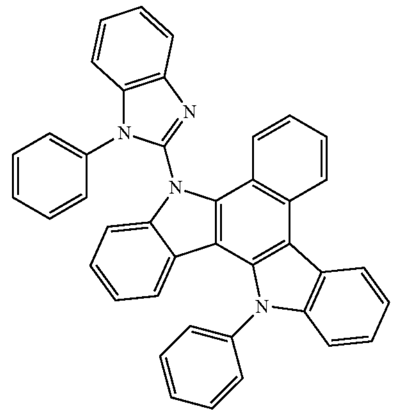
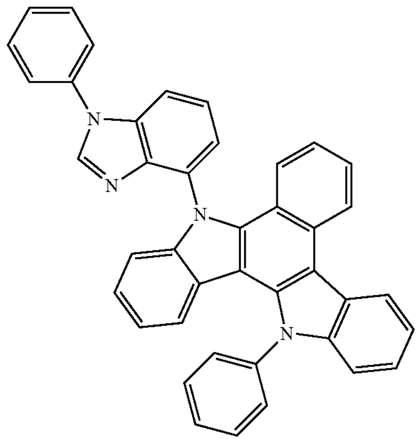
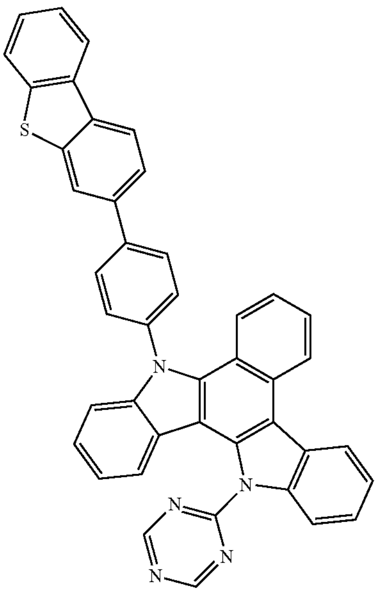
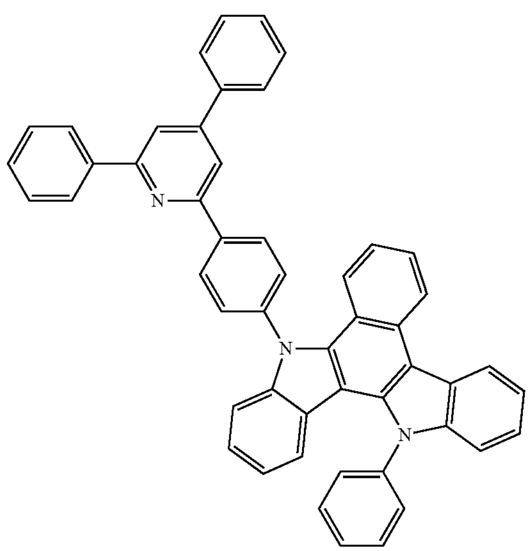
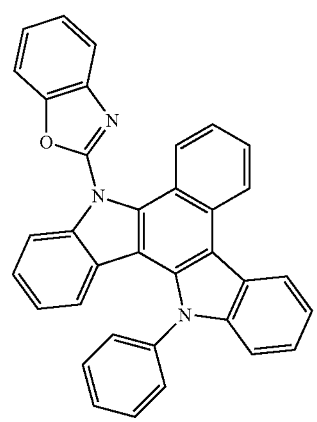

-continued
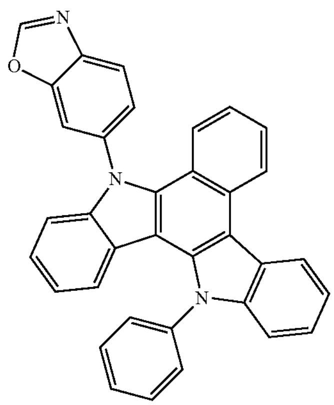
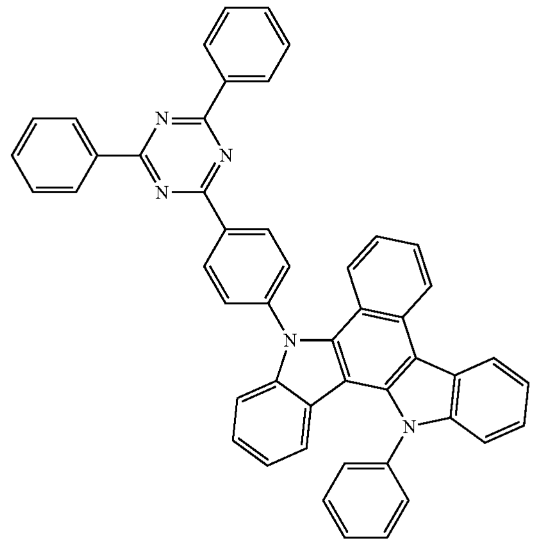
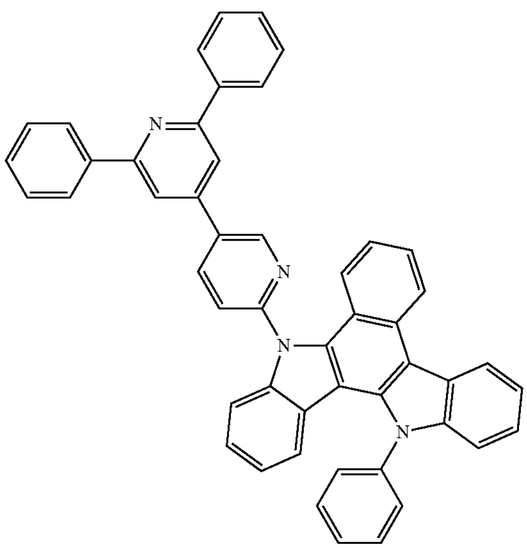
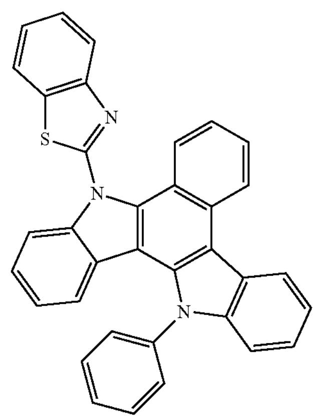
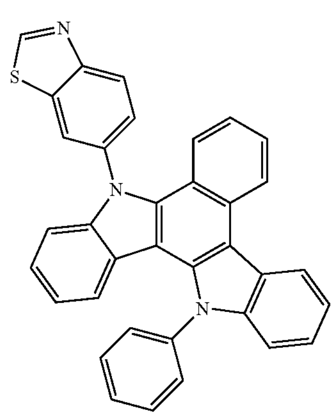
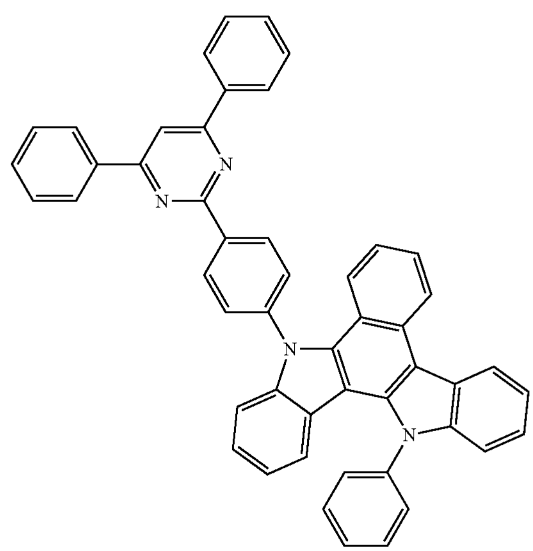

-continued
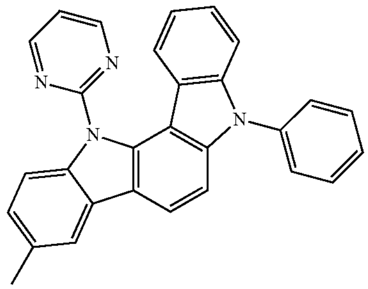
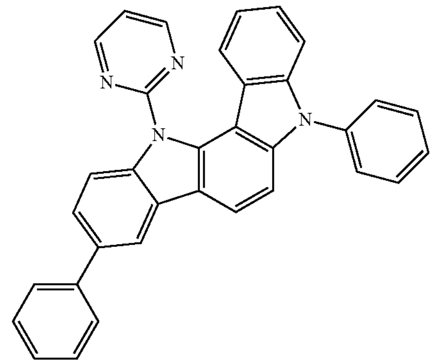
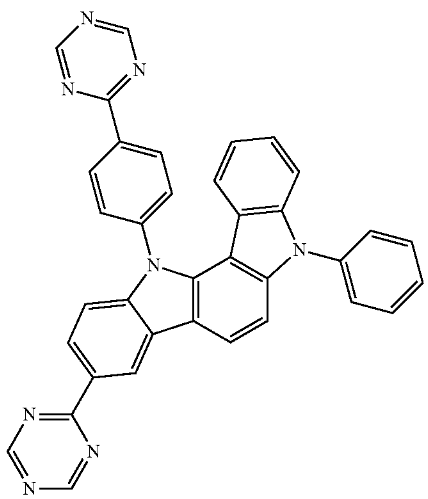
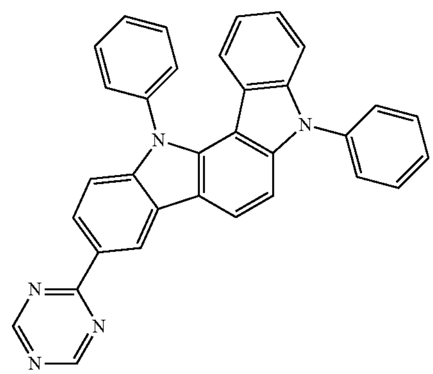
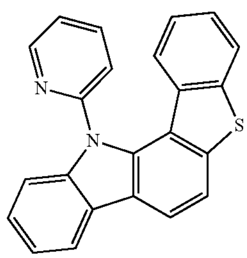
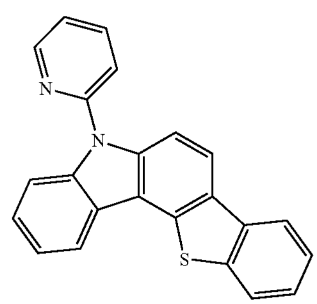
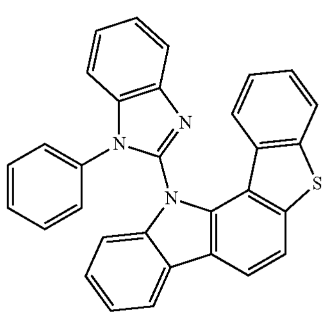
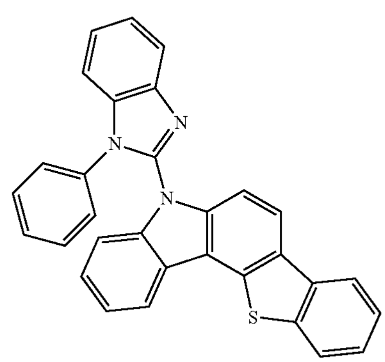

-continued
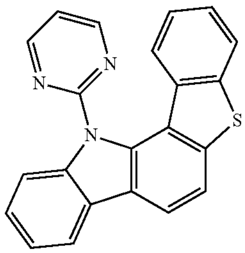
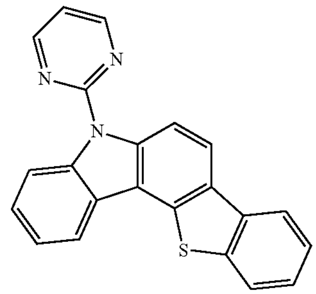
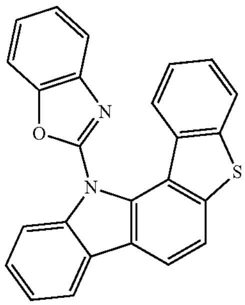
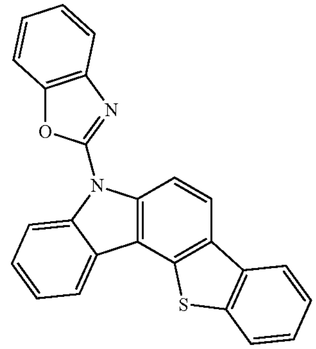
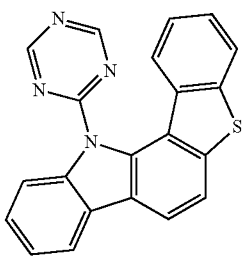
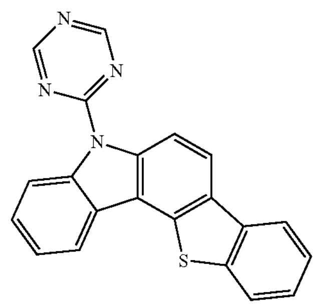
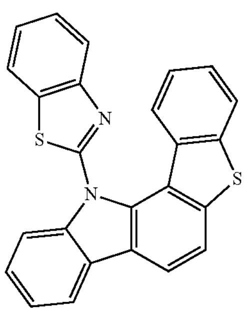
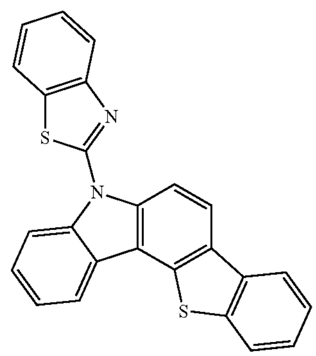
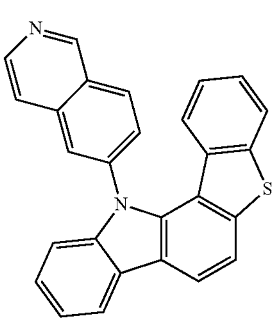
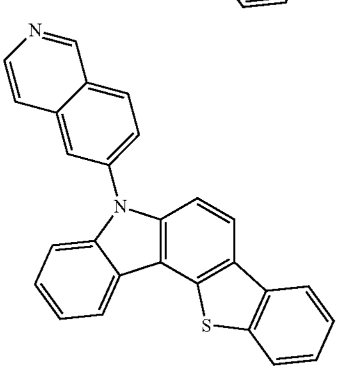

-continued
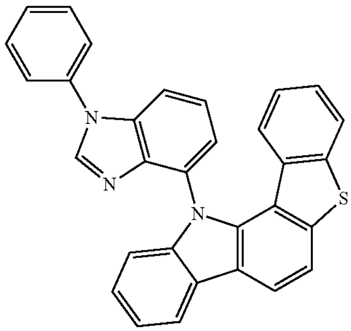
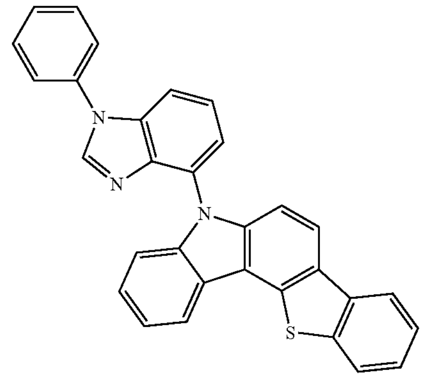
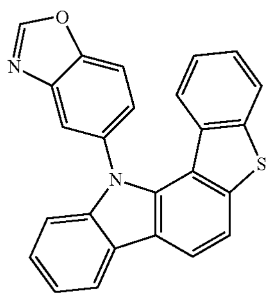
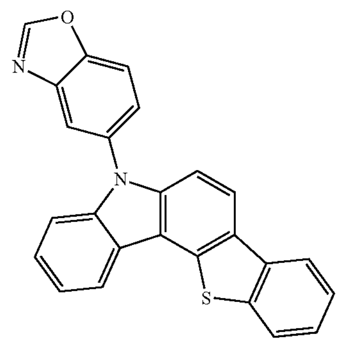
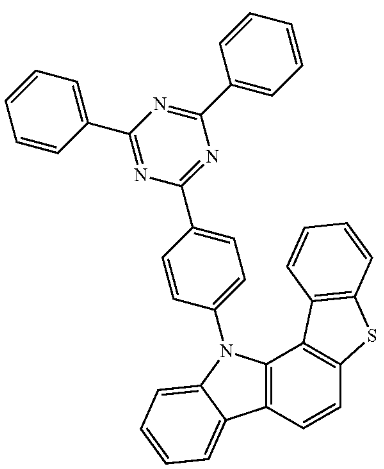
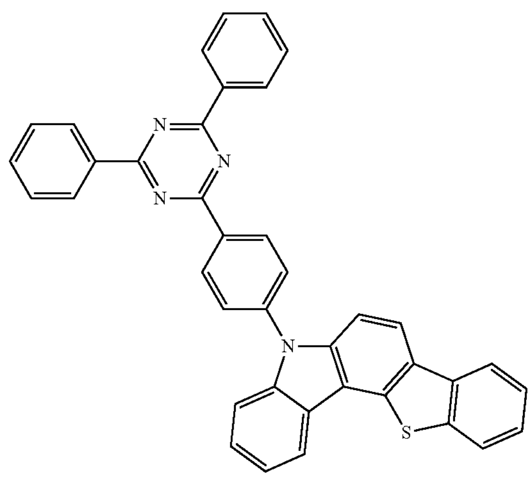
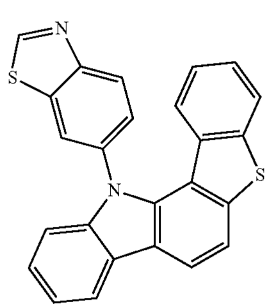
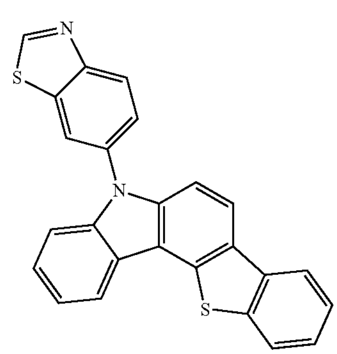

-continued
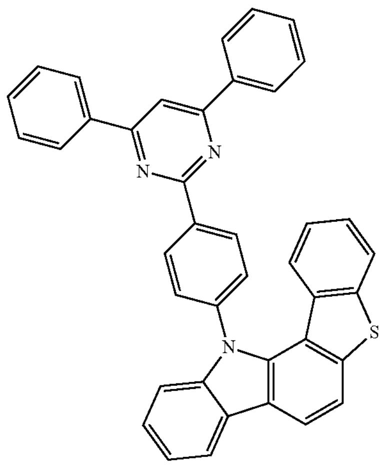
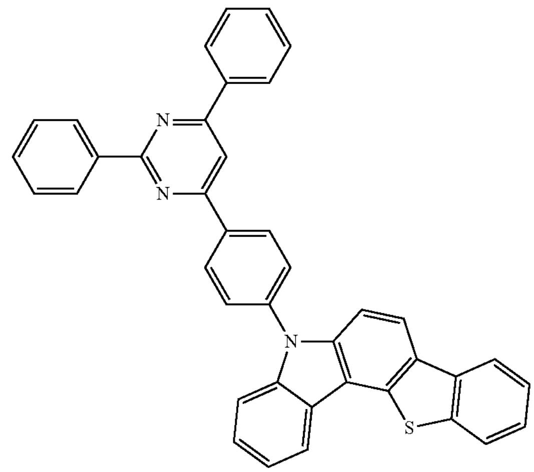
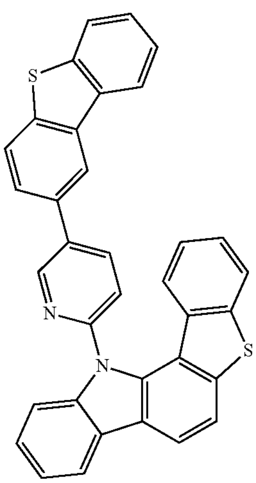
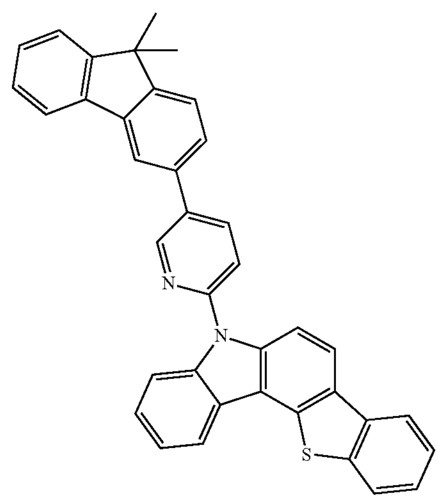
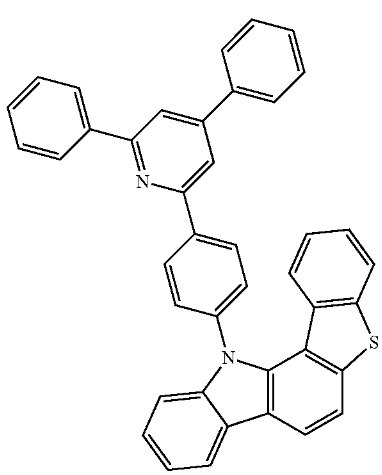
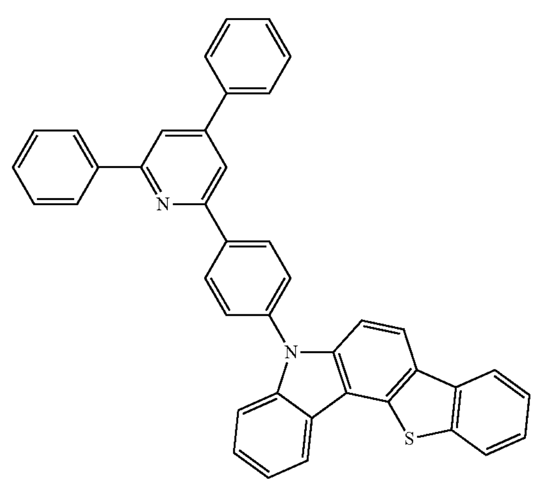

-continued
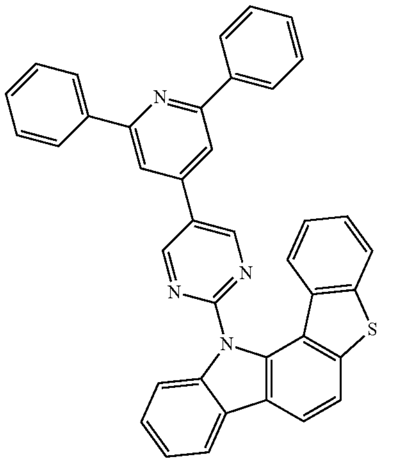
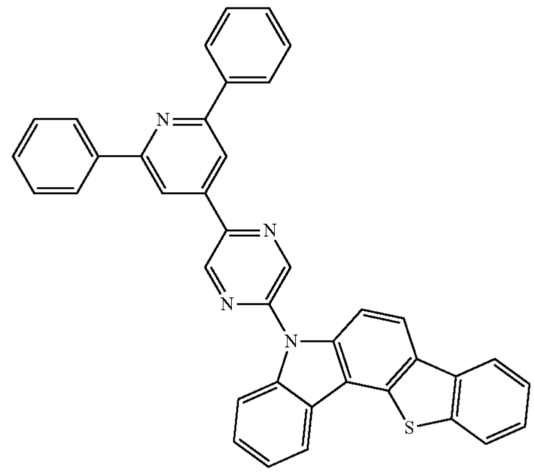
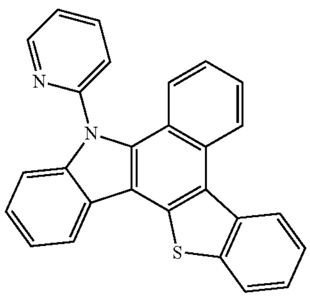
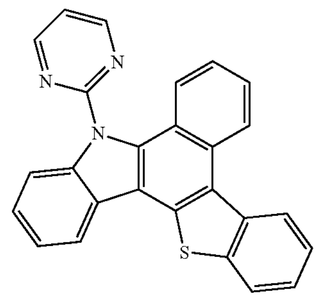
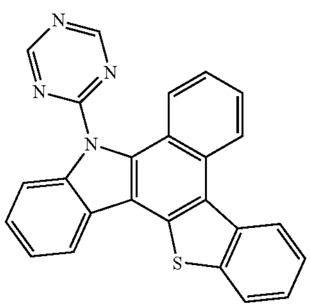
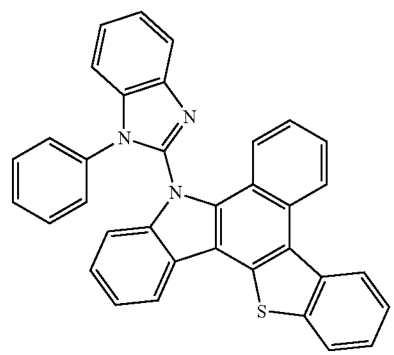
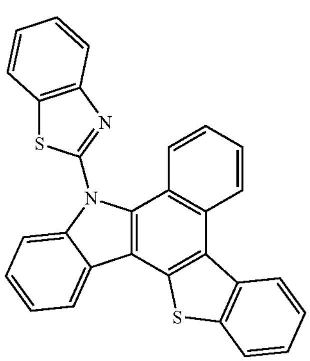
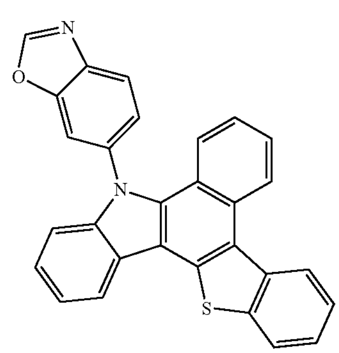

-continued
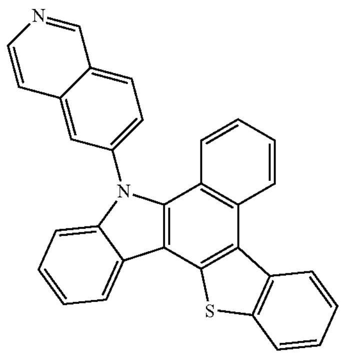
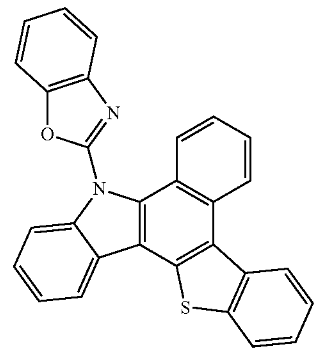
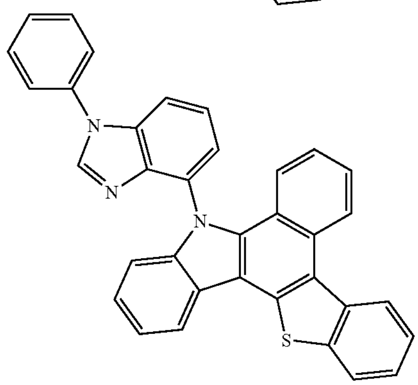
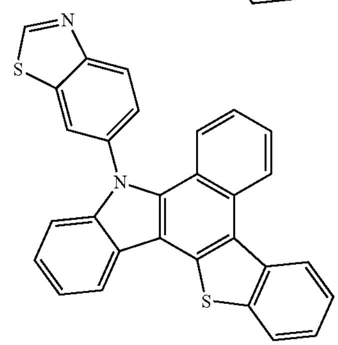
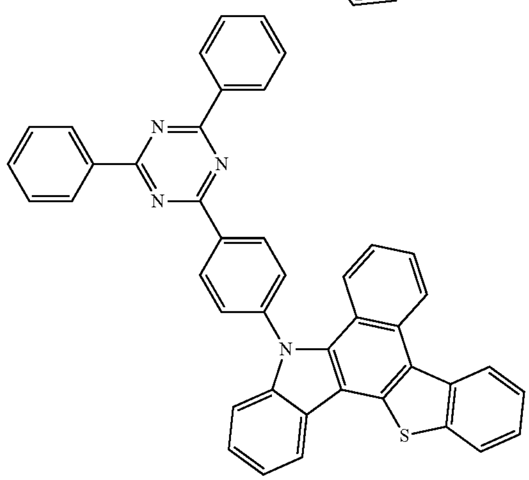
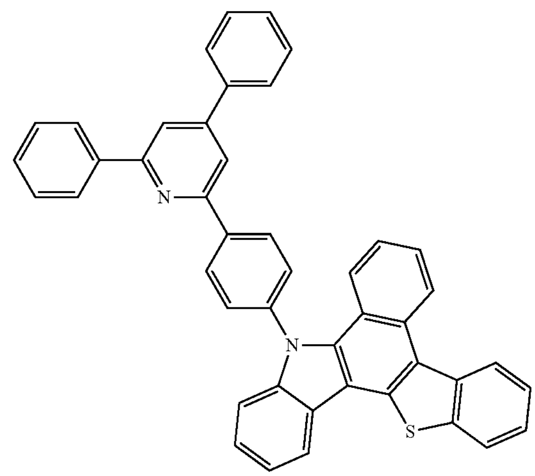
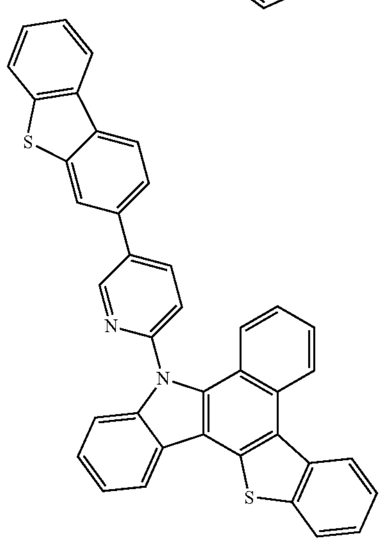
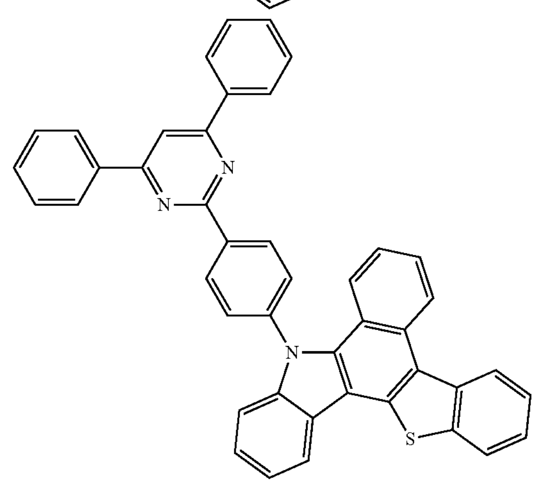

-continued
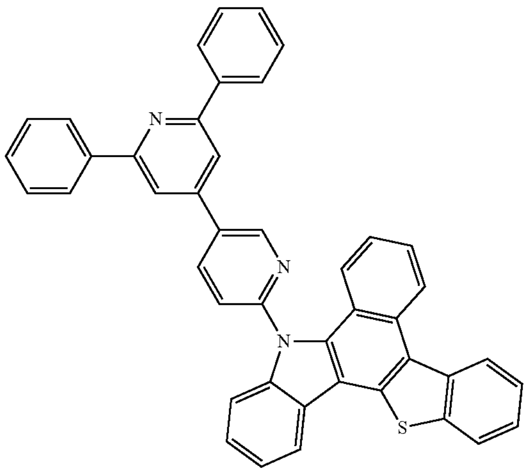
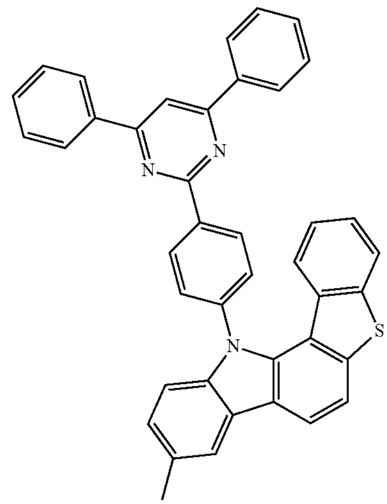
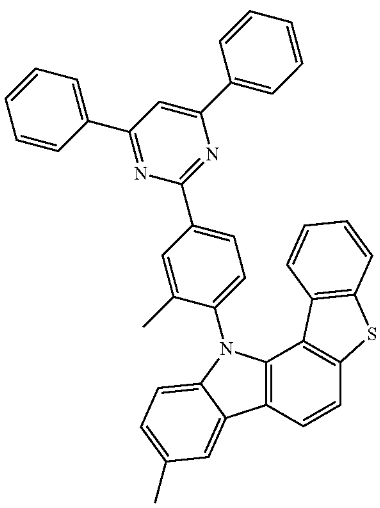
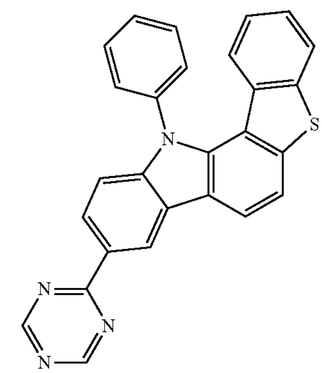
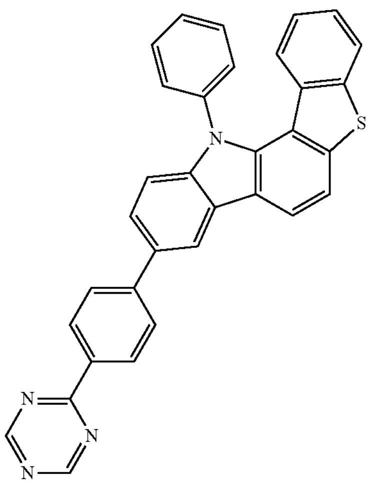
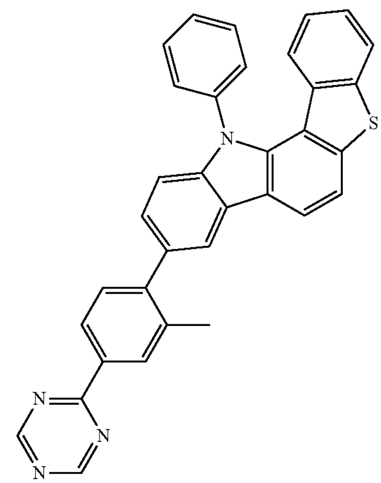

-continued
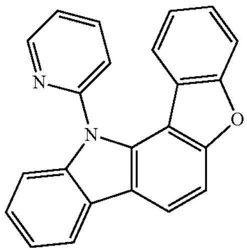
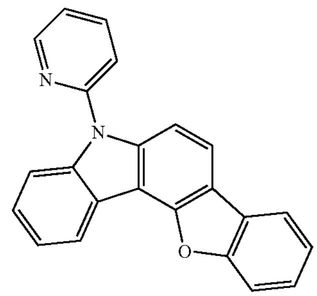
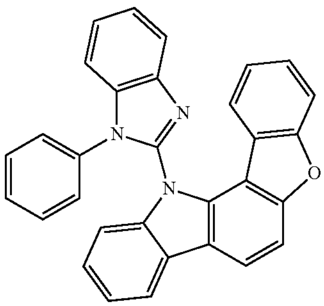
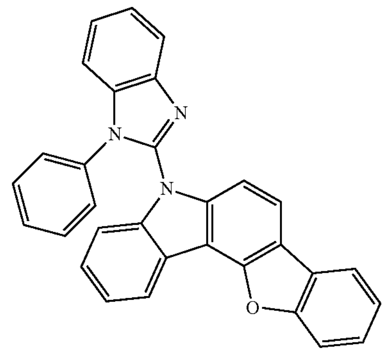
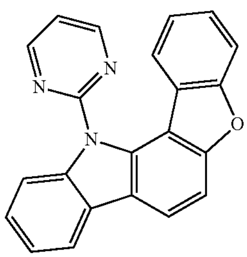
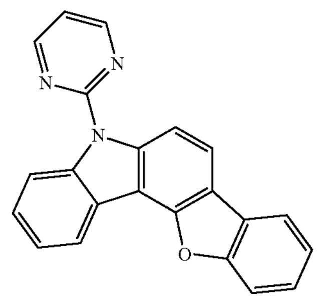
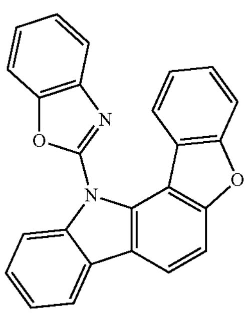
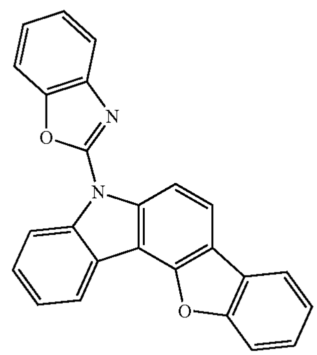
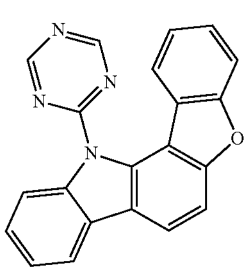
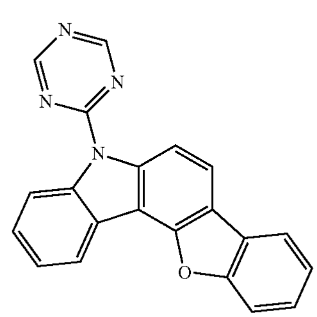

-continued
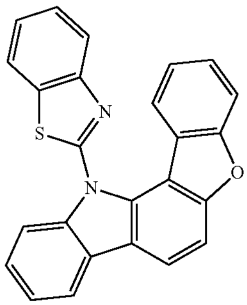
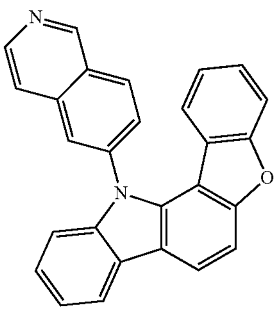
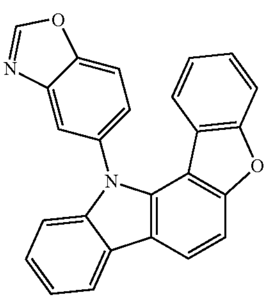
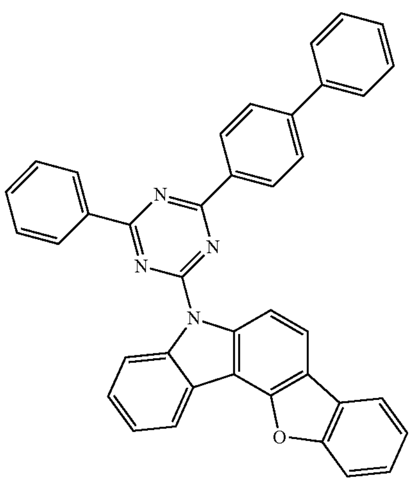
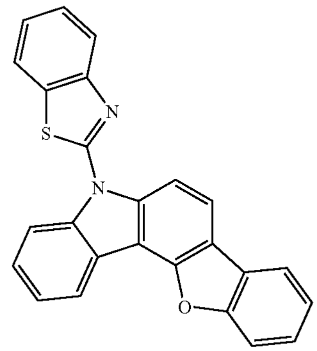
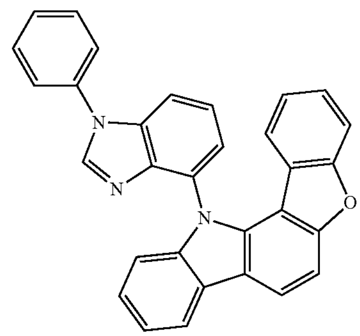
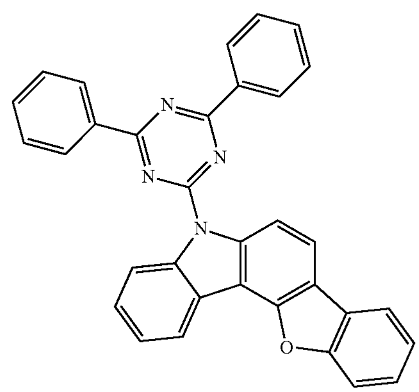
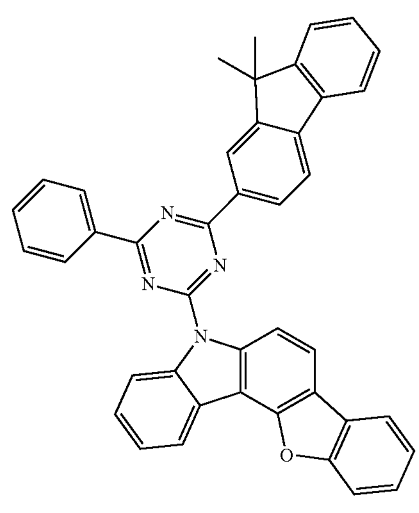

-continued
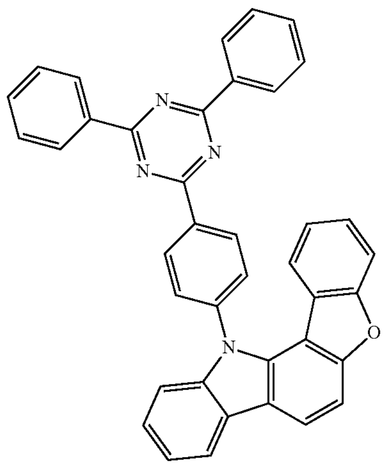
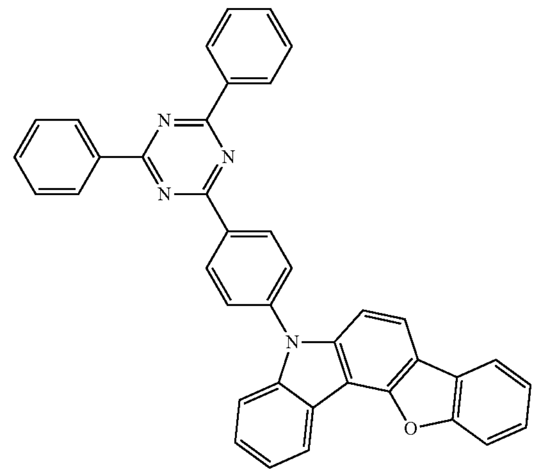
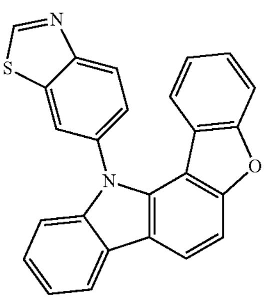
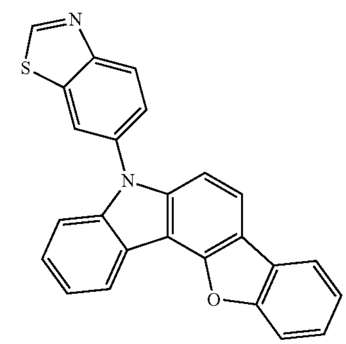
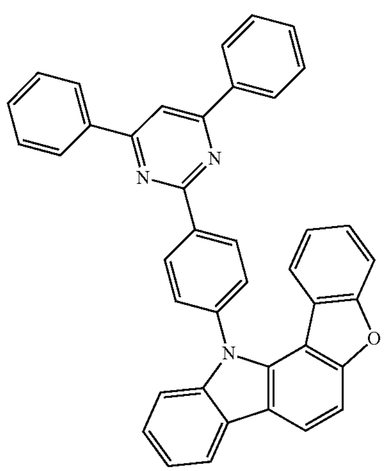
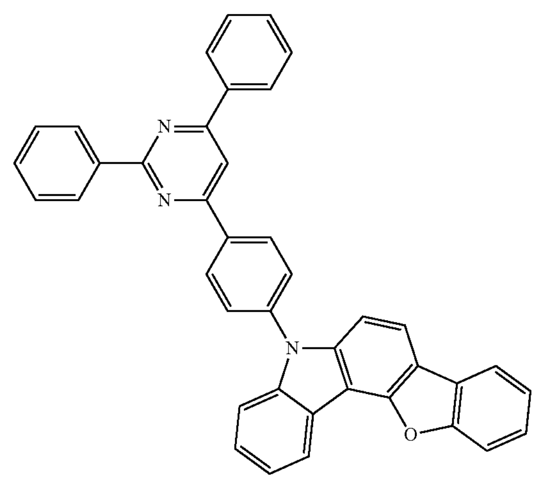
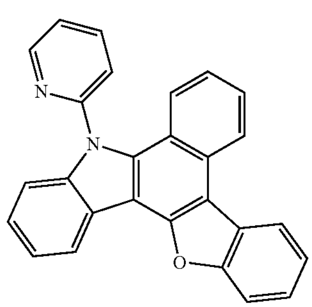
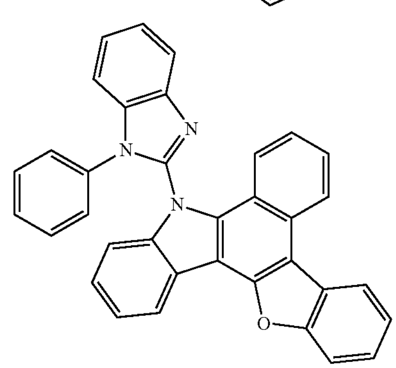

-continued
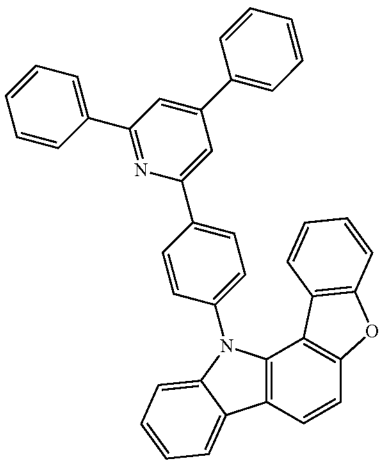
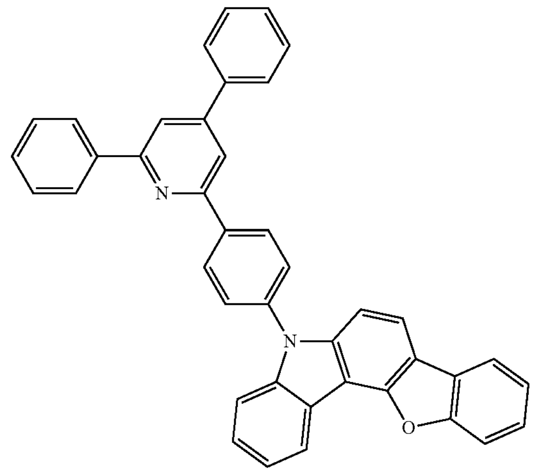
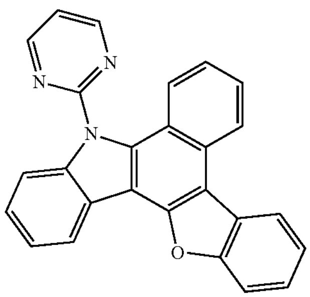
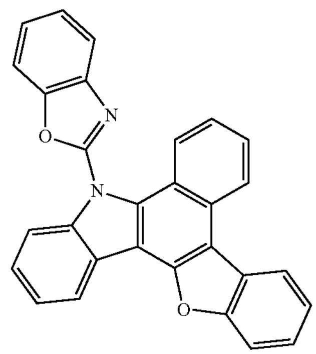
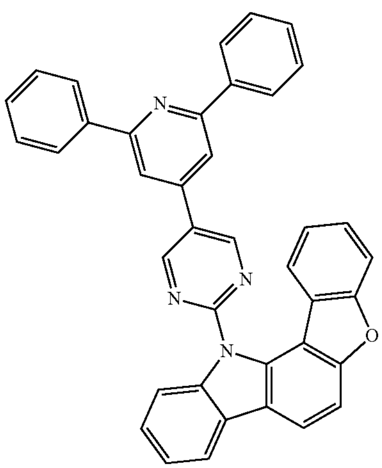
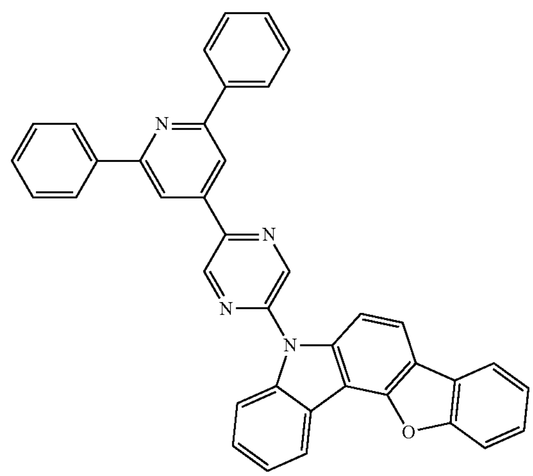
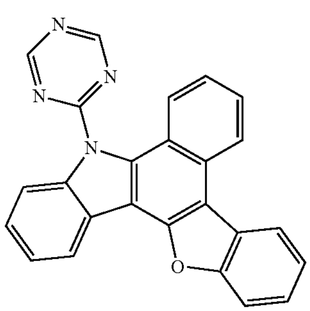
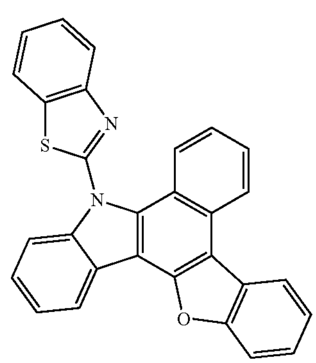

-continued
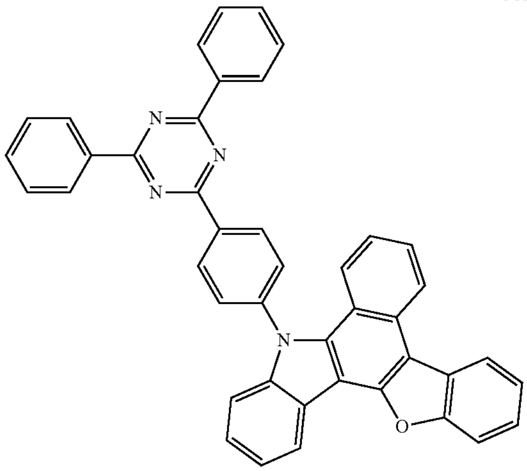
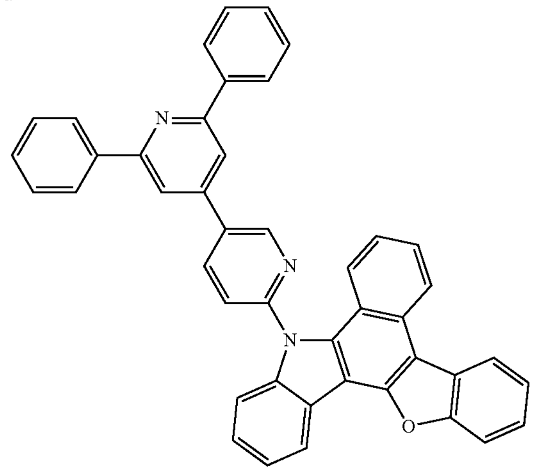
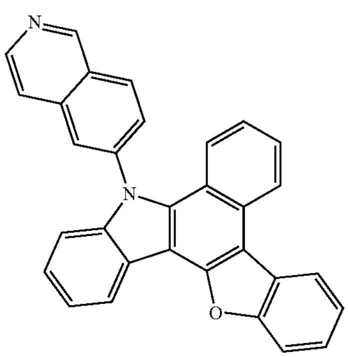
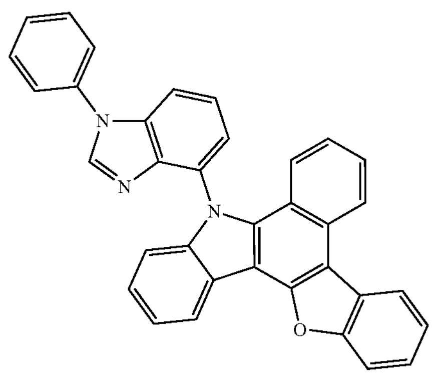
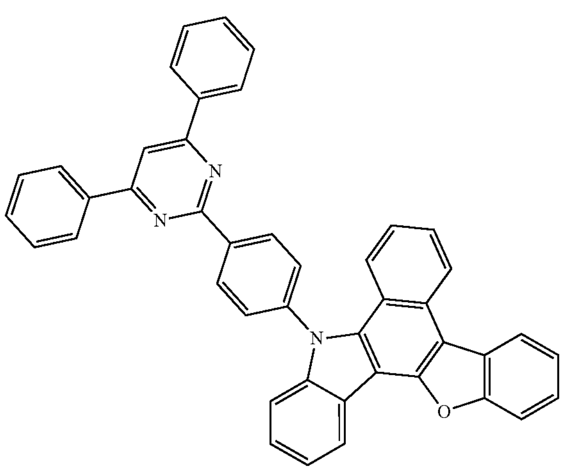
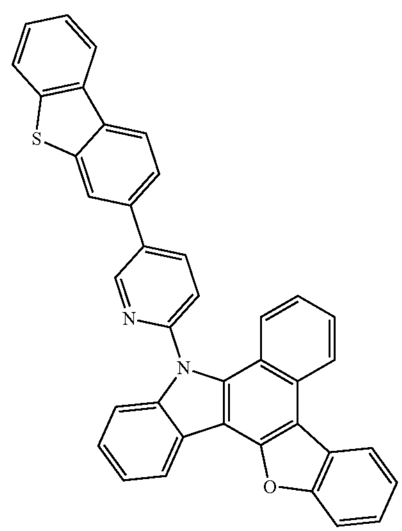

-continued
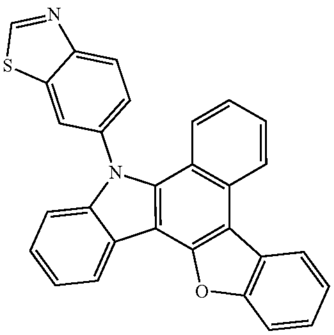
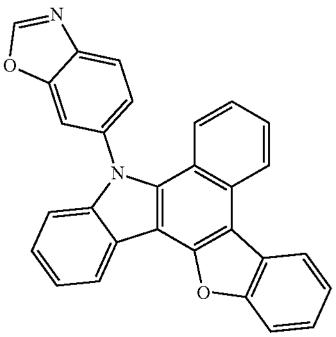
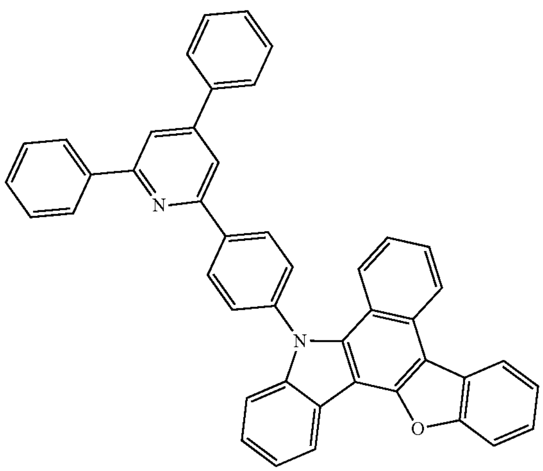
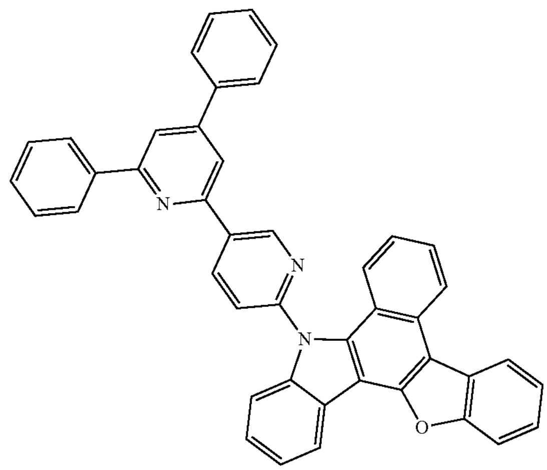
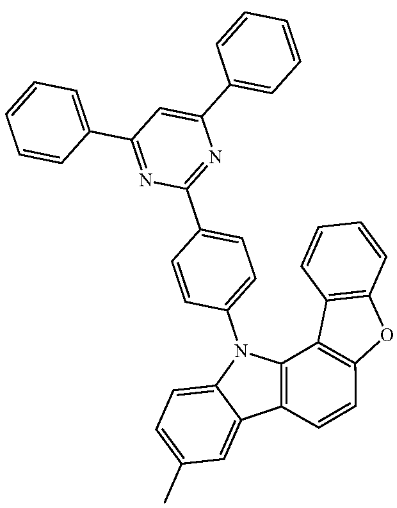
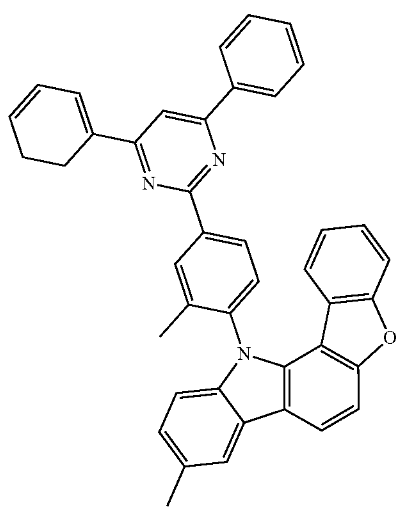

-continued
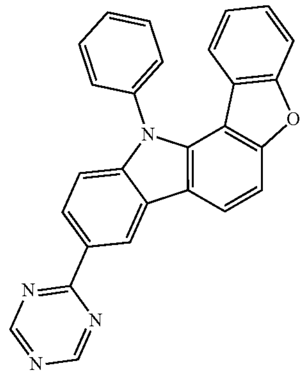
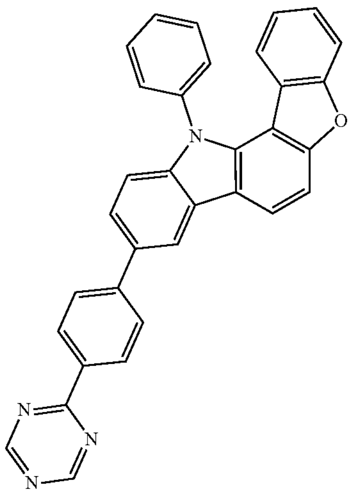
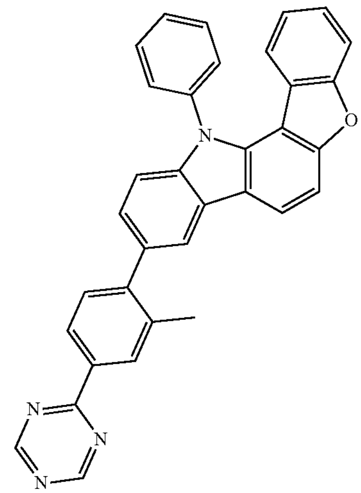
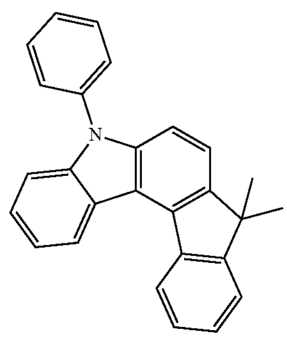
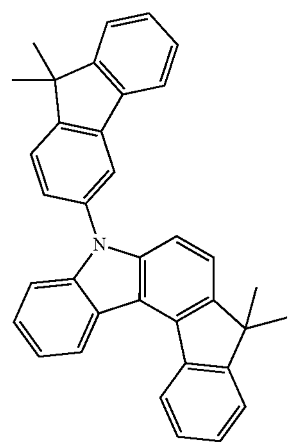
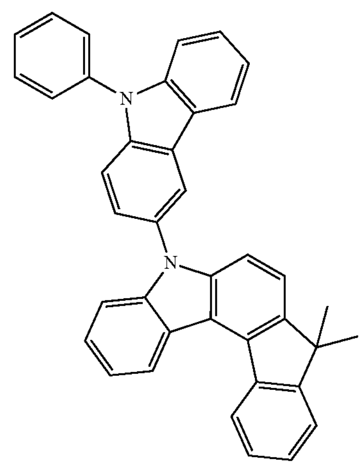
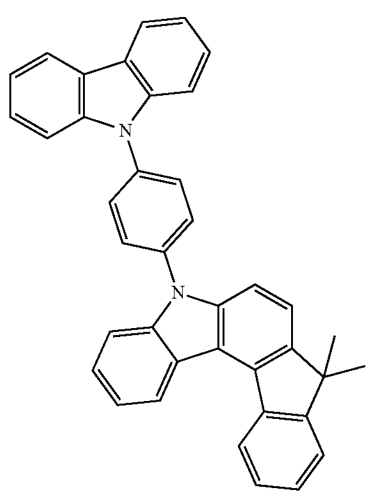
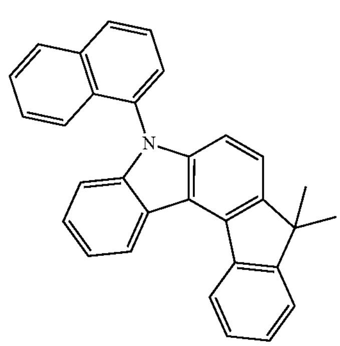

-continued
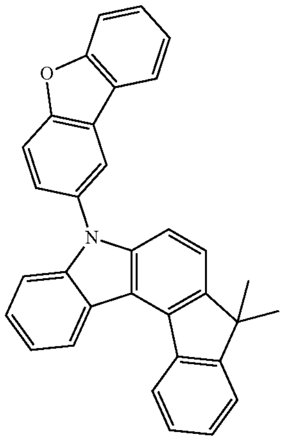
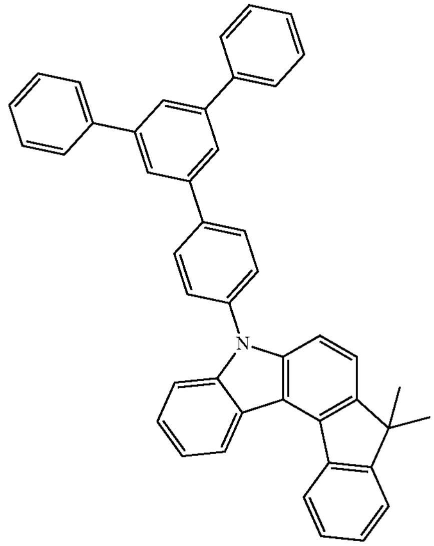
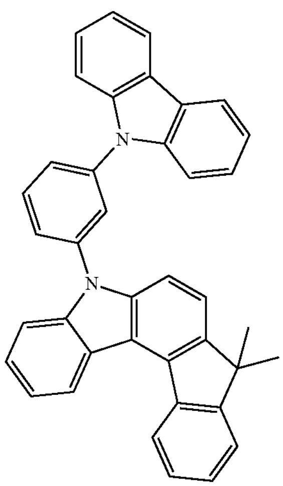
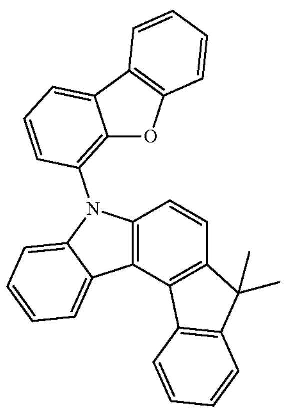
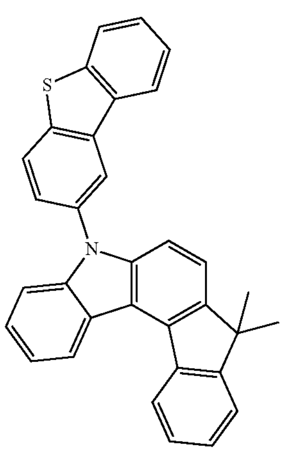
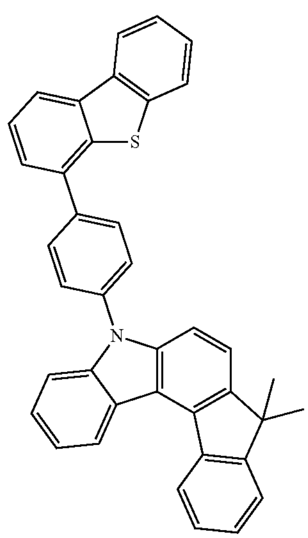

-continued
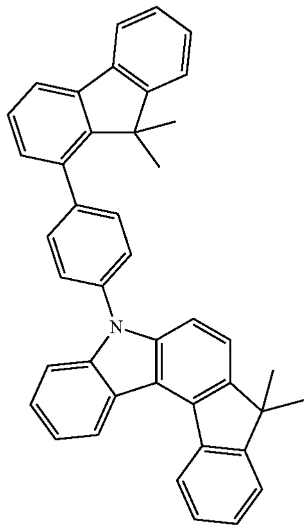
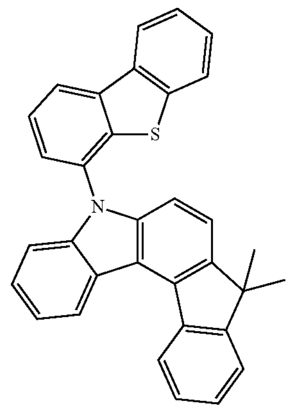
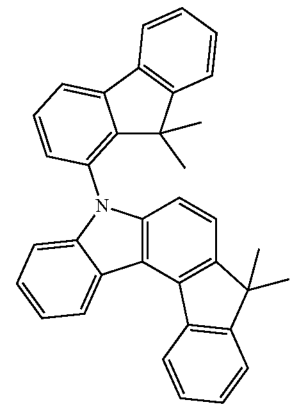
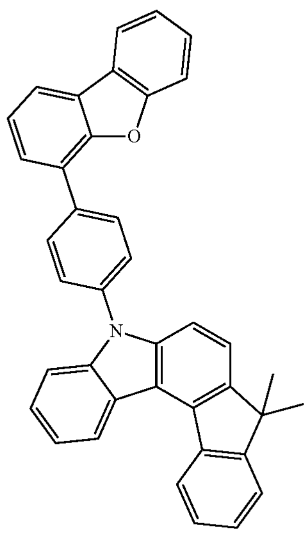
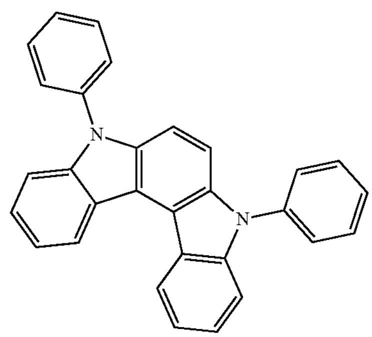
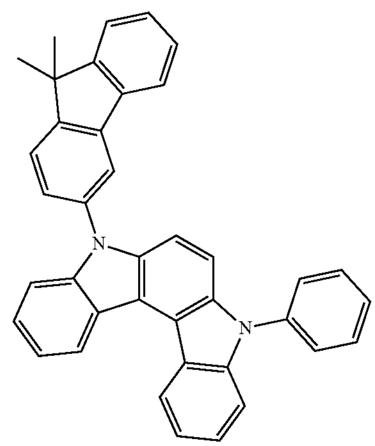
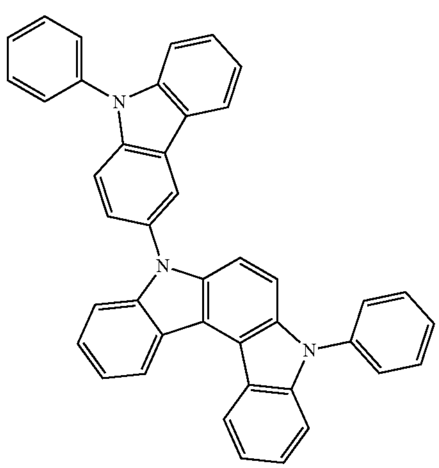
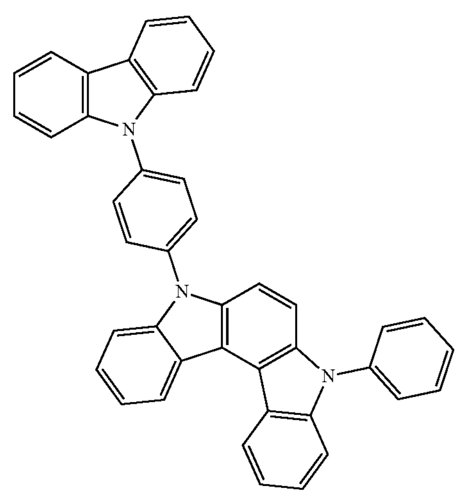

-continued
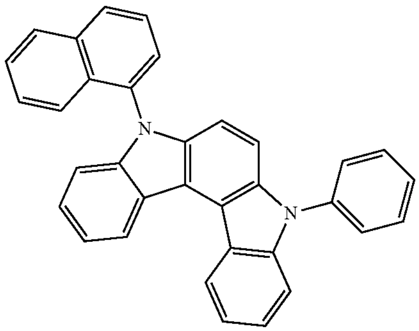
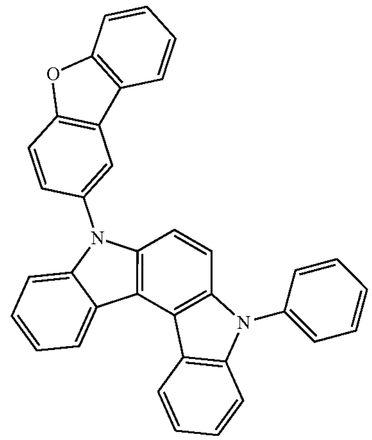
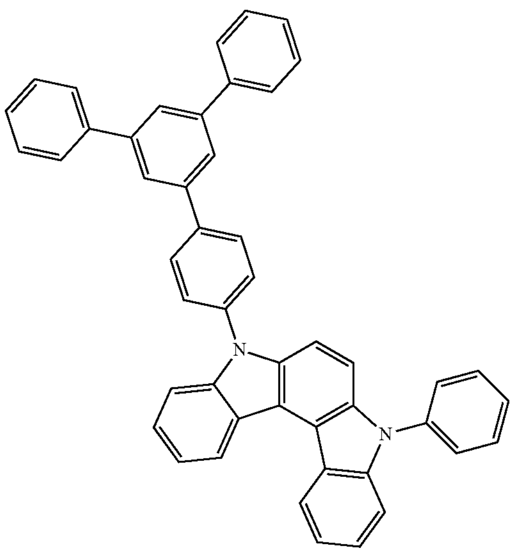
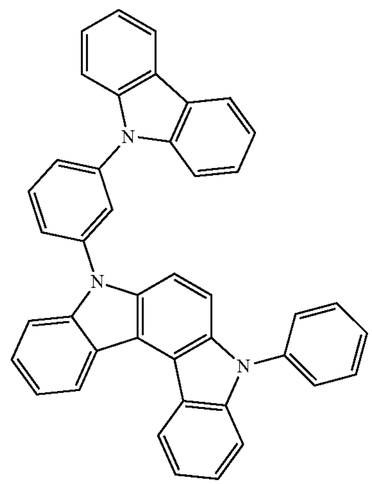
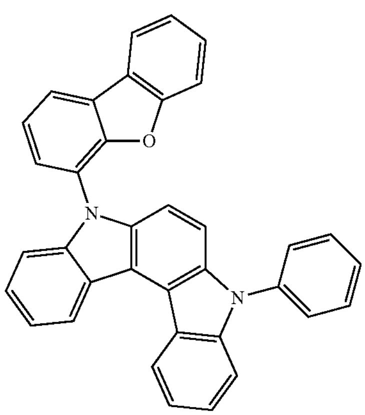
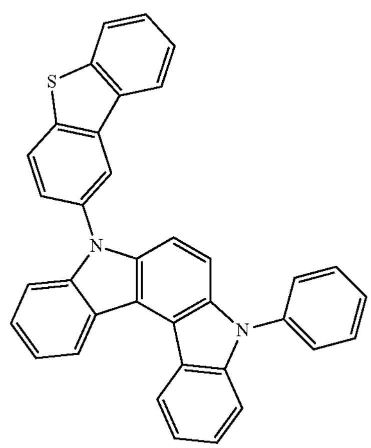

-continued
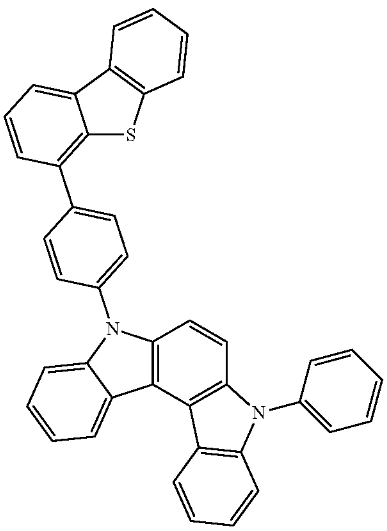
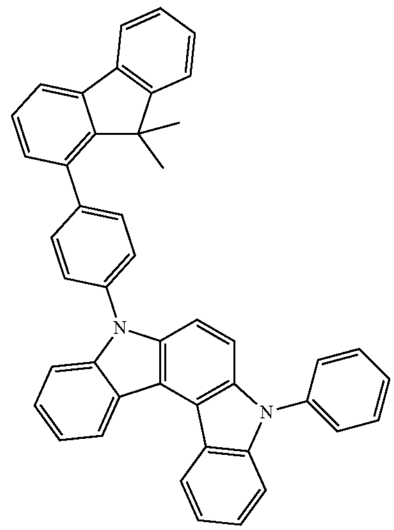
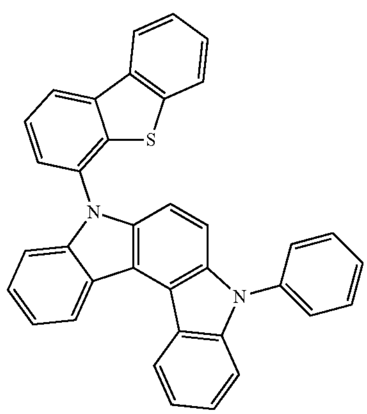
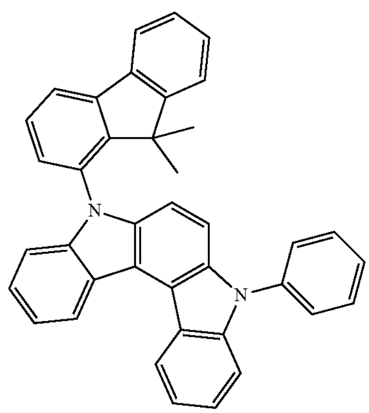
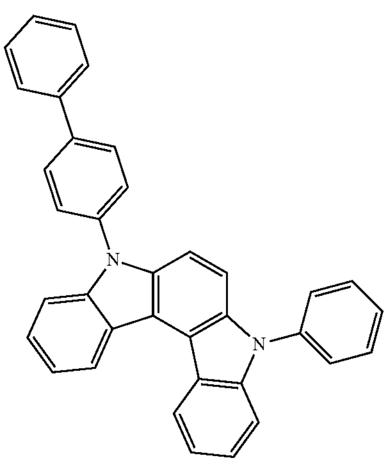
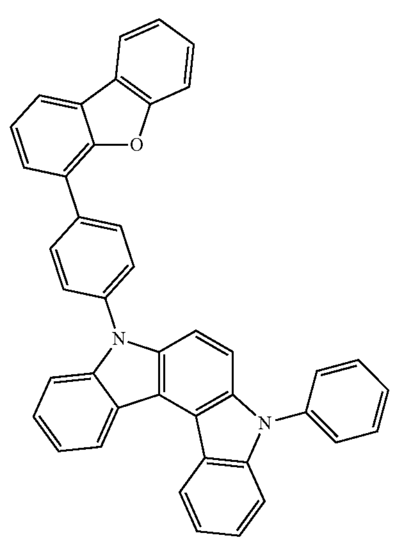

-continued
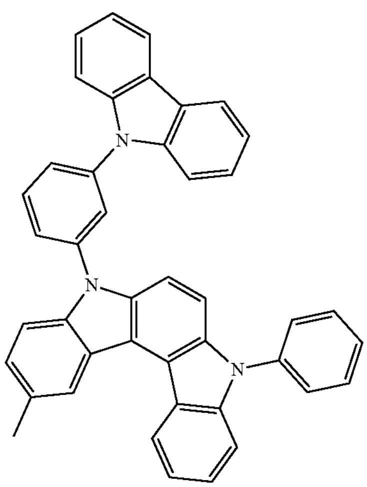
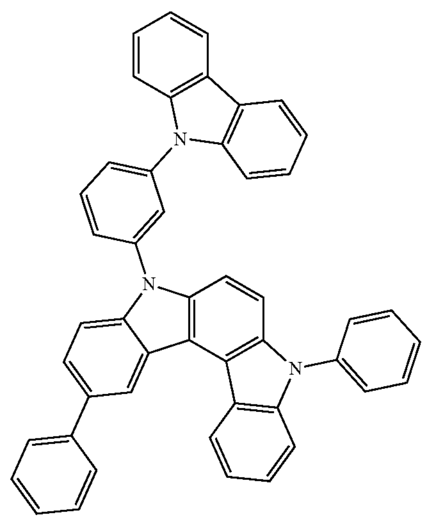
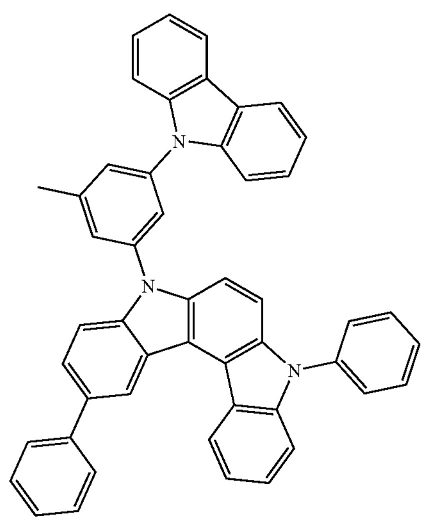
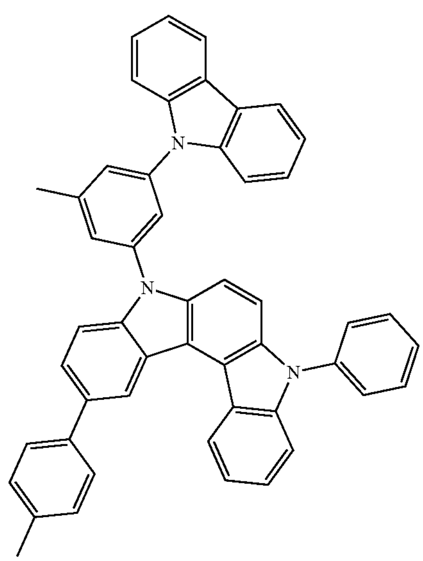
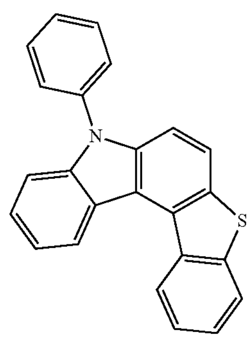
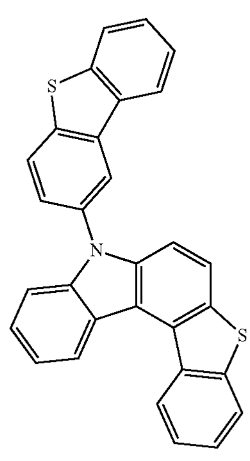
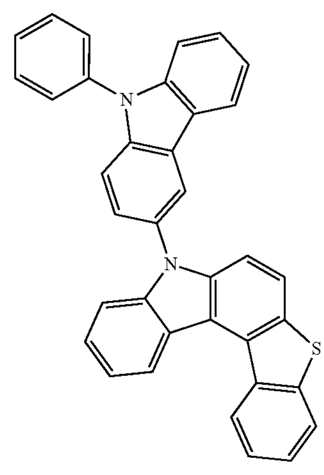

-continued
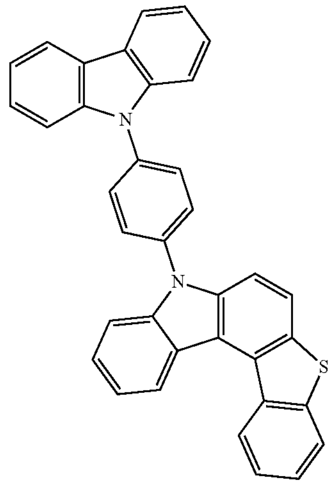
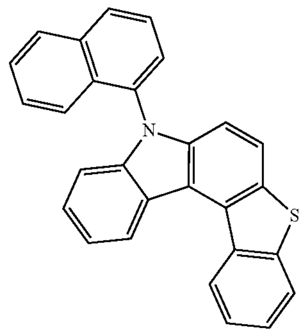
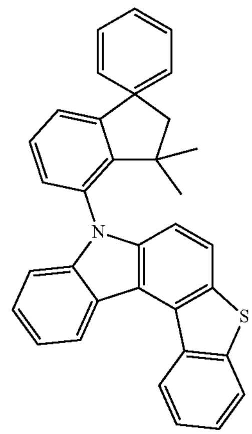
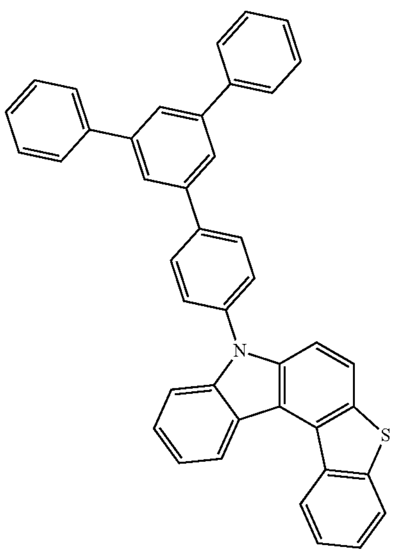
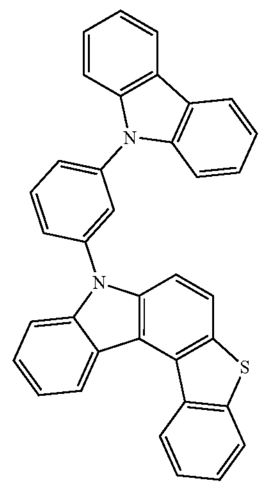
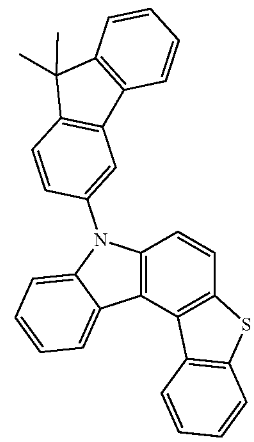
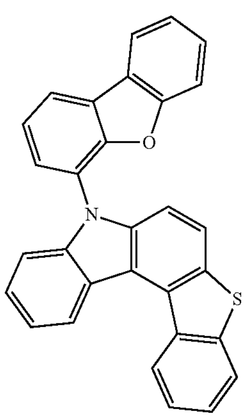
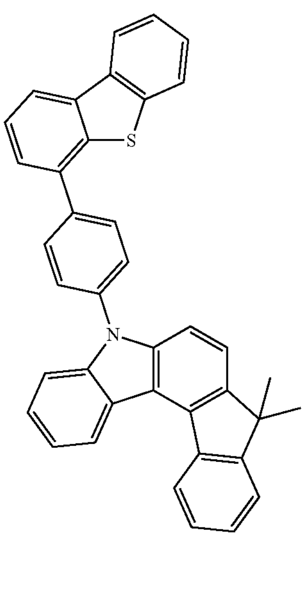
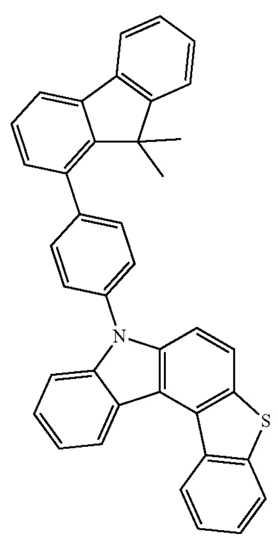

-continued
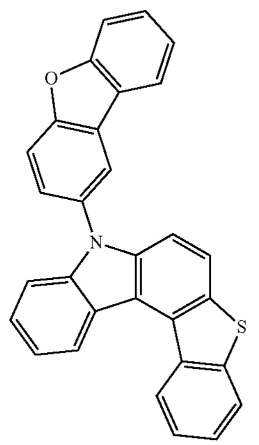
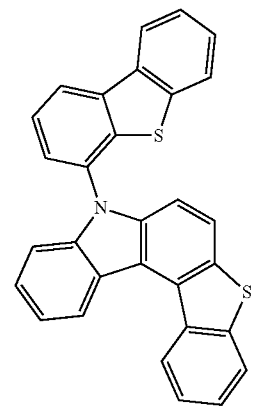
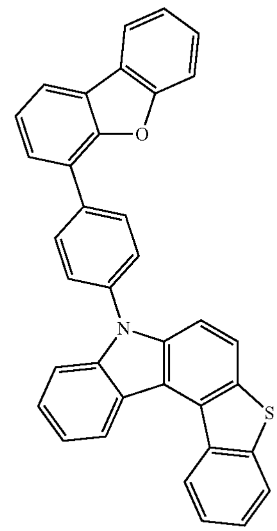
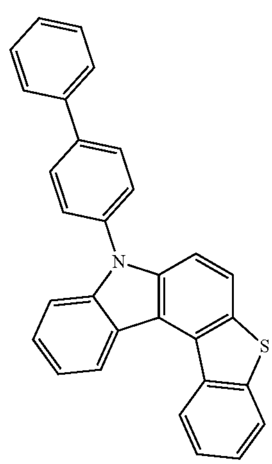
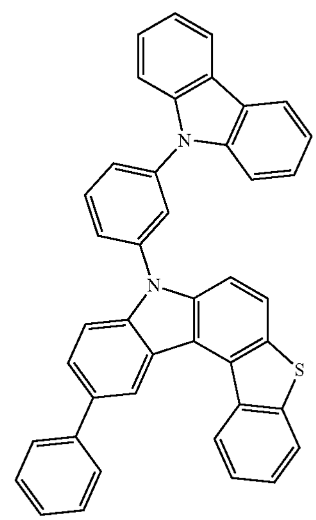
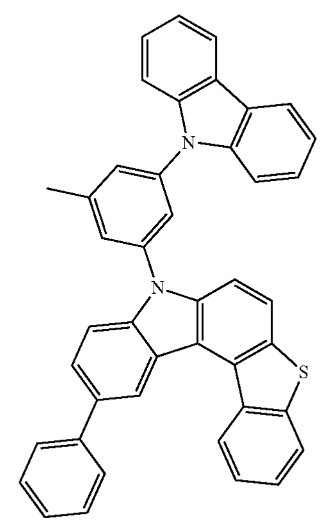
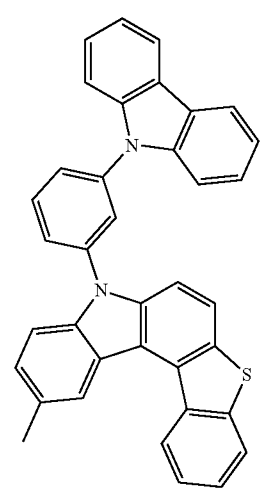
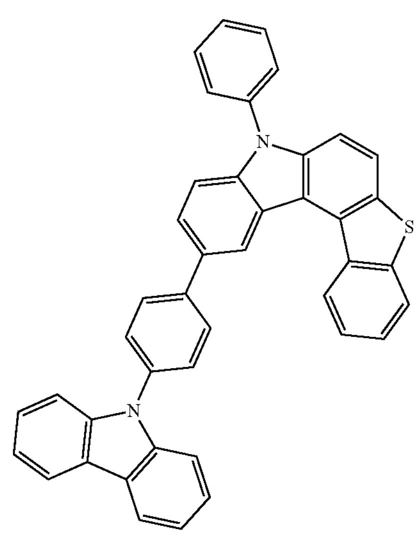

-continued
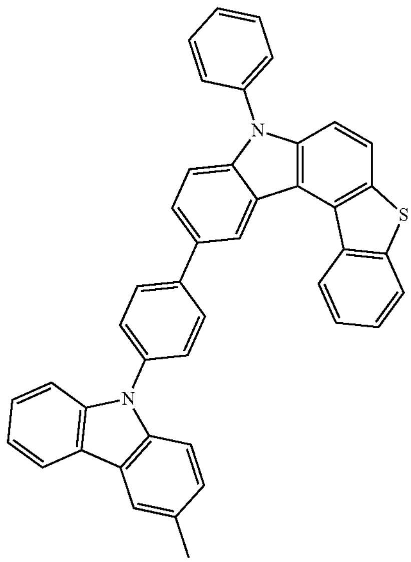
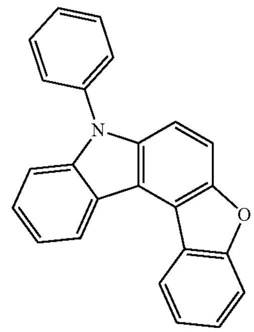
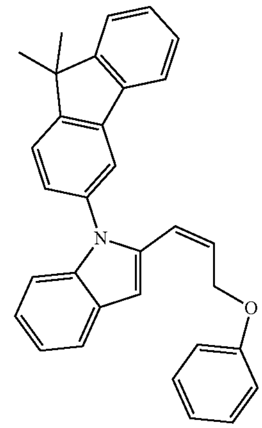
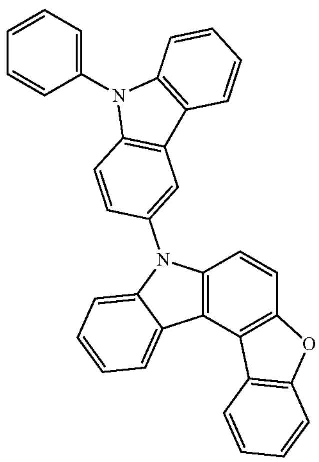
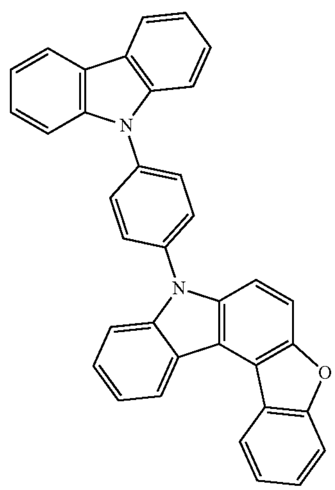
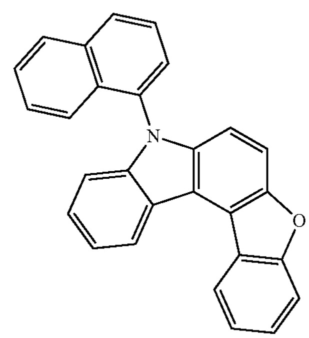
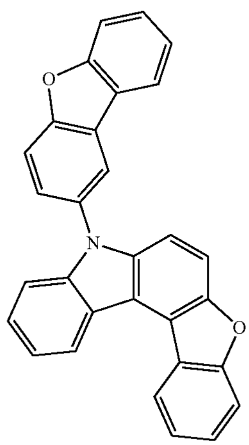
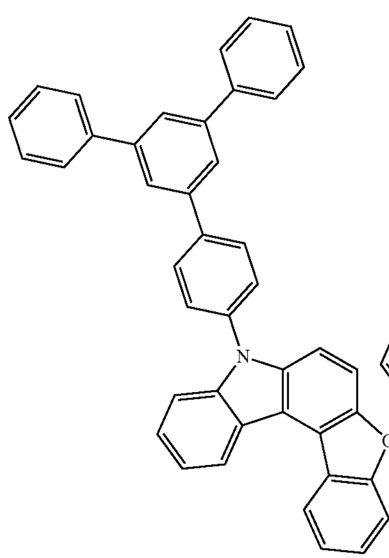
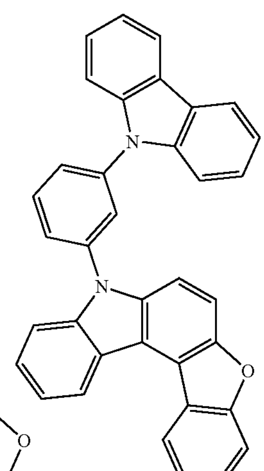

-continued
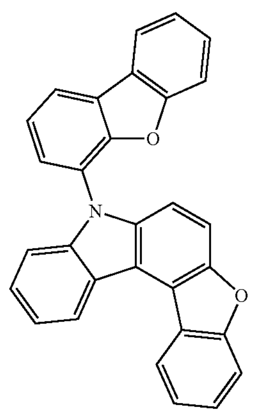
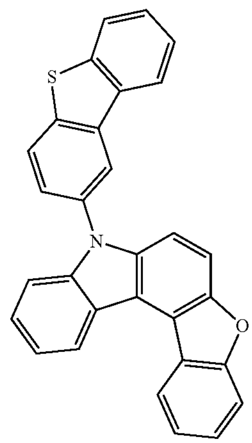
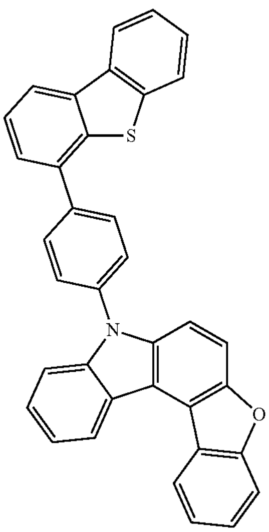
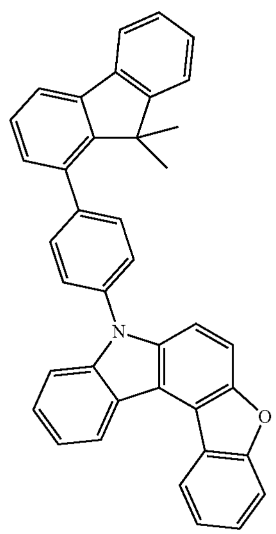
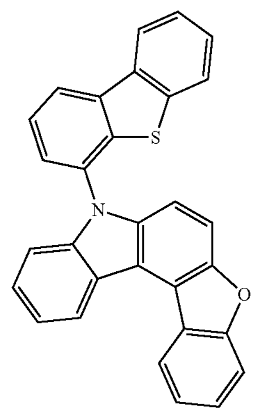
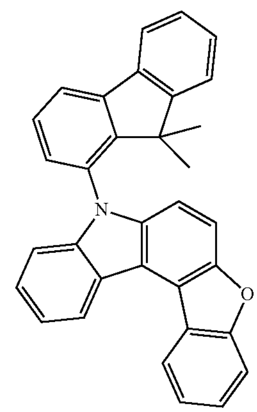
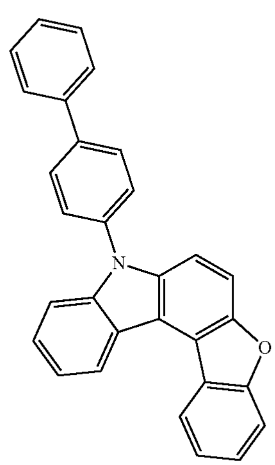
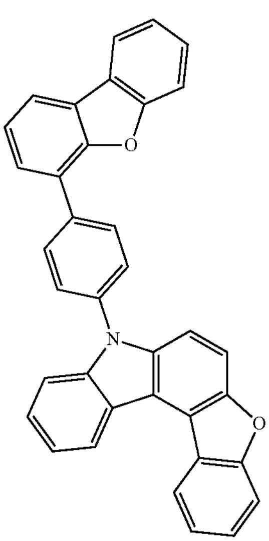
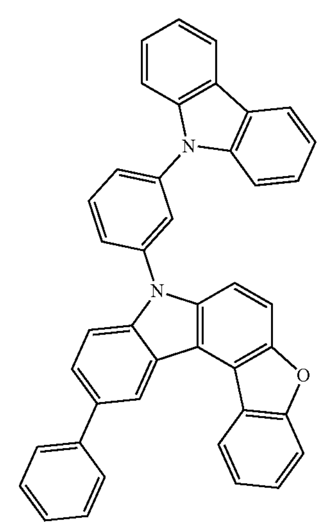

-continued
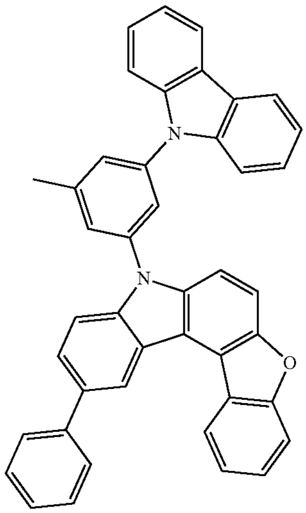
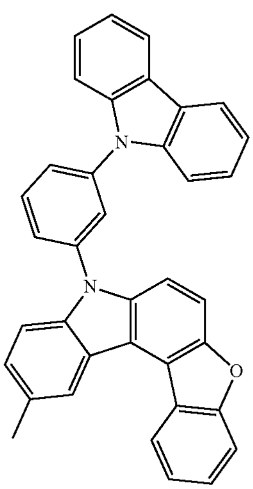
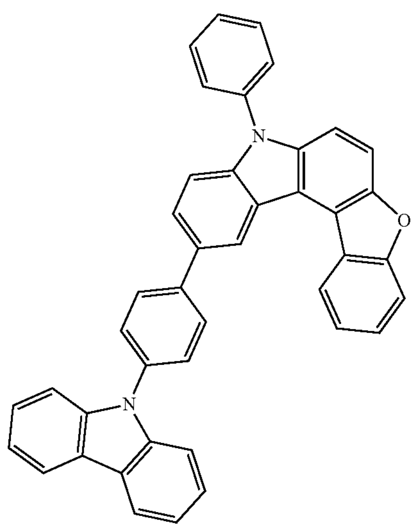
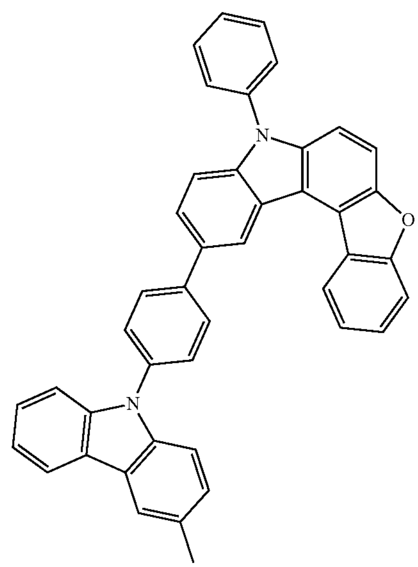
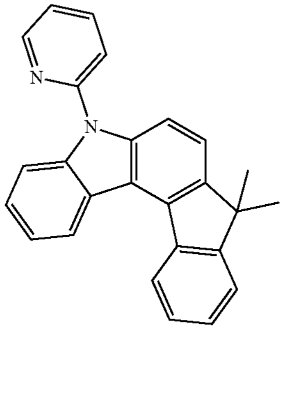
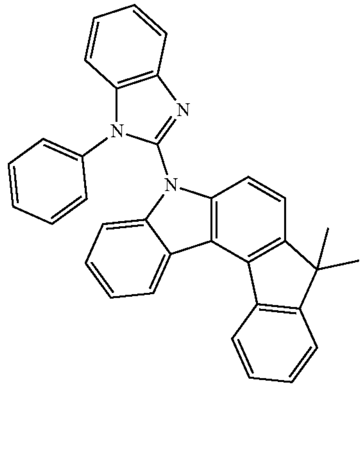
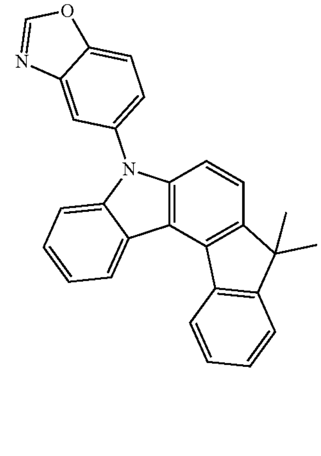

-continued
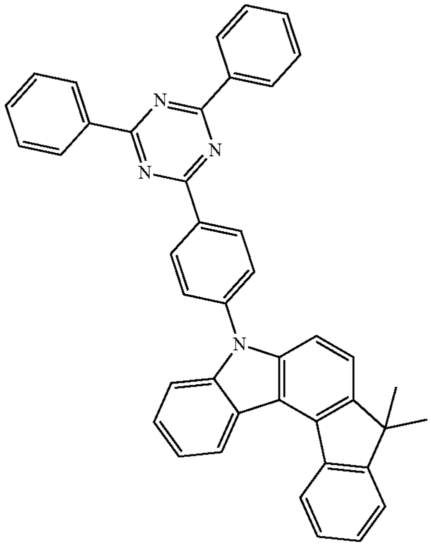
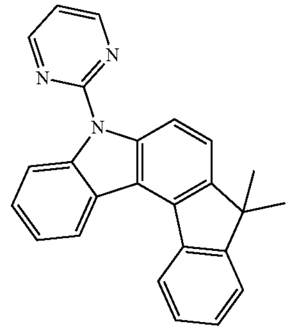
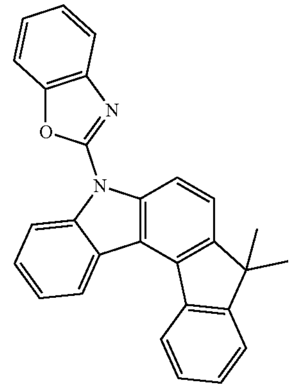
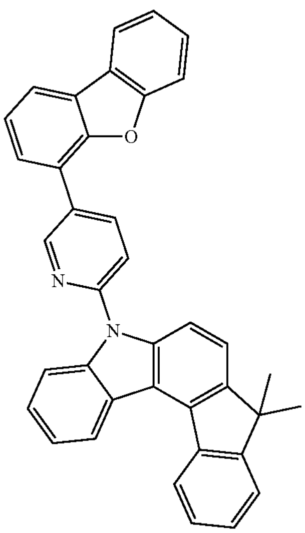
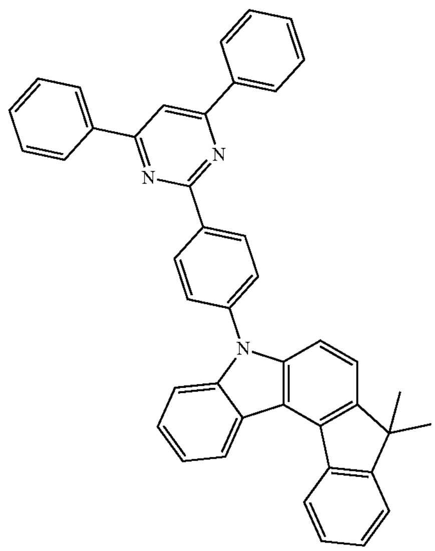
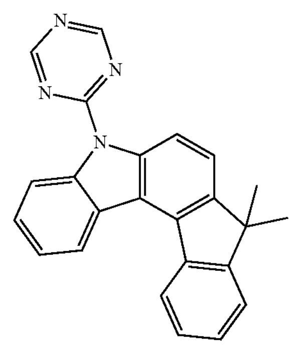
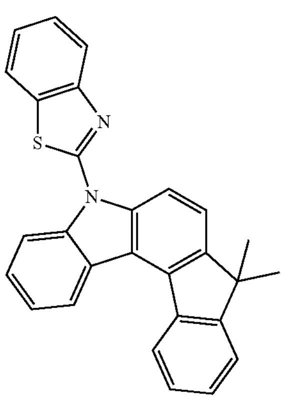
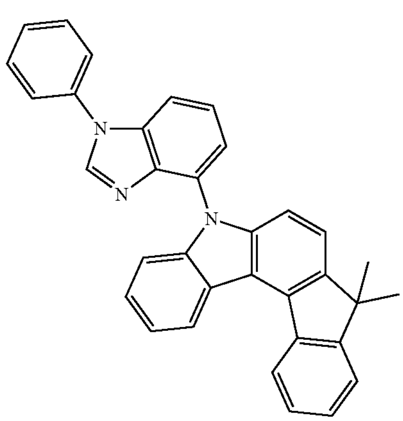
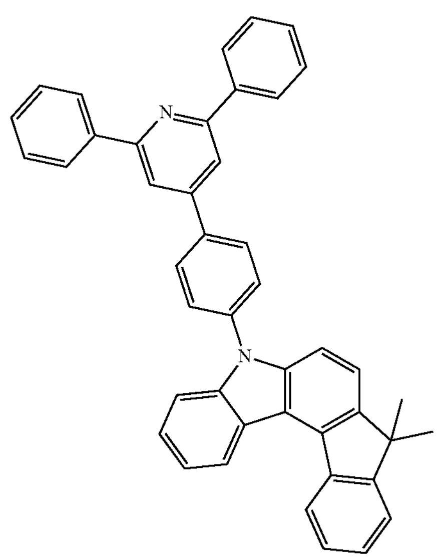

-continued
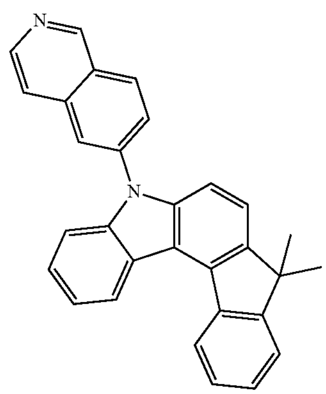
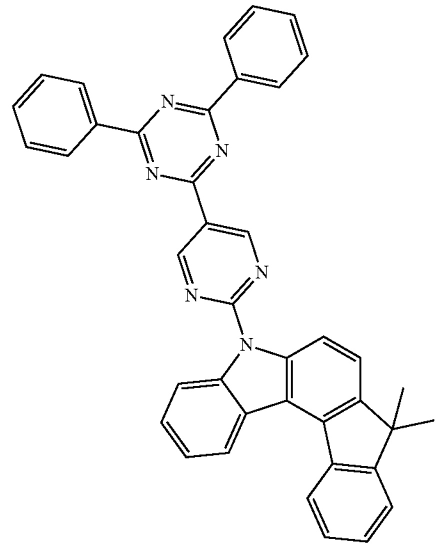
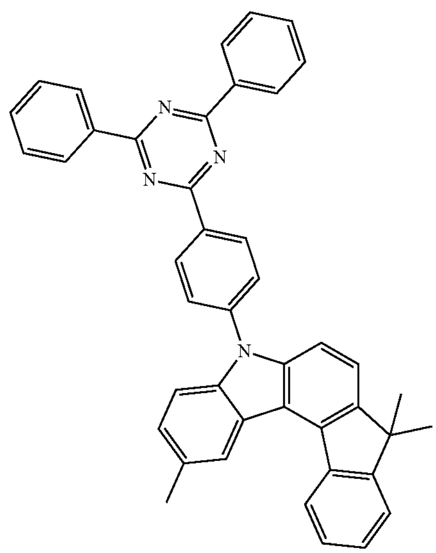
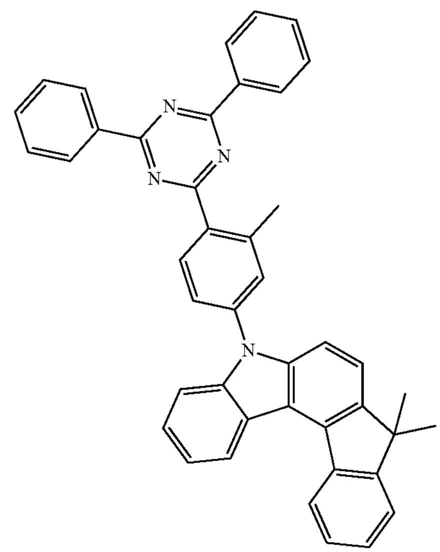
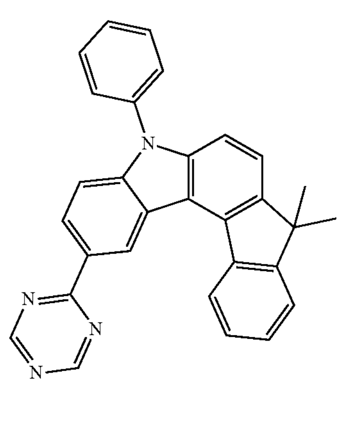
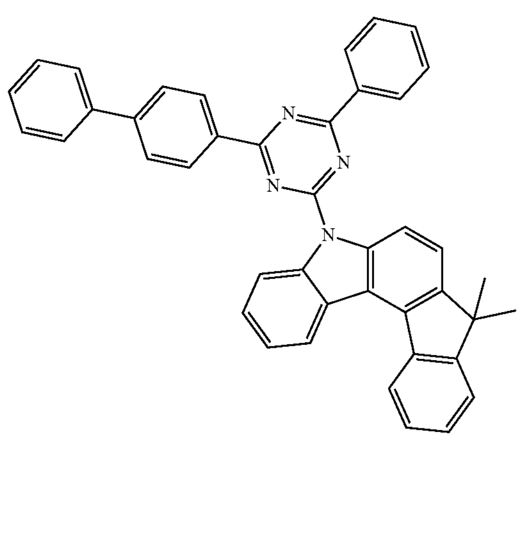

-continued
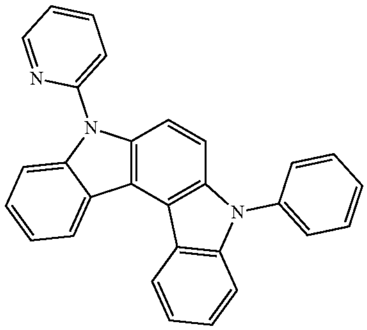
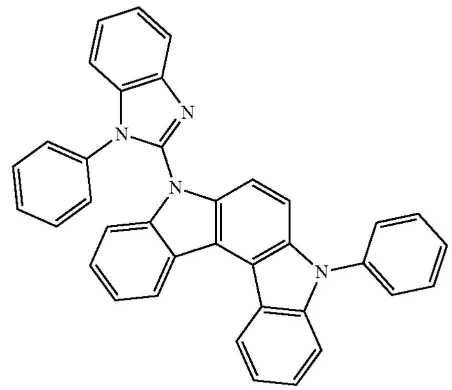
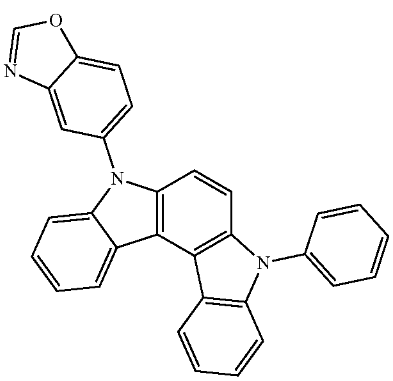
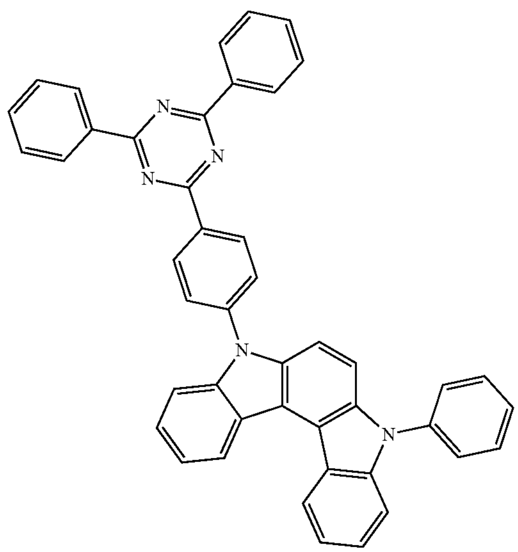
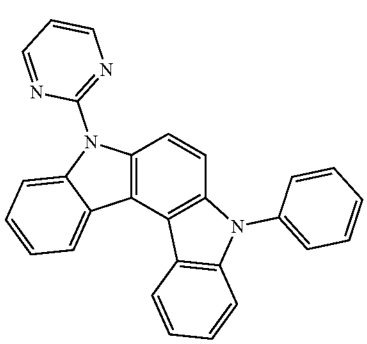
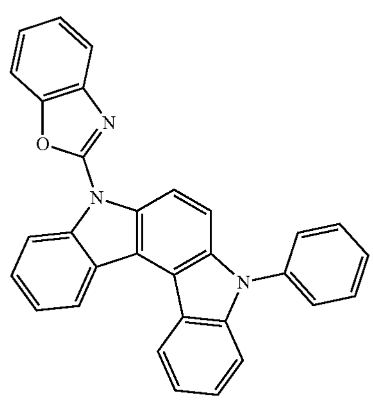

-continued
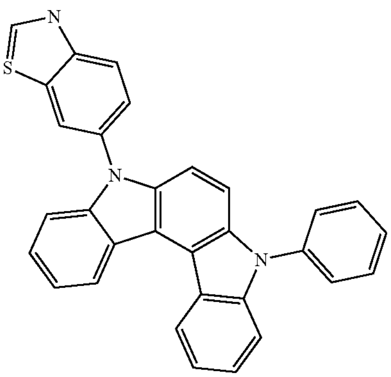
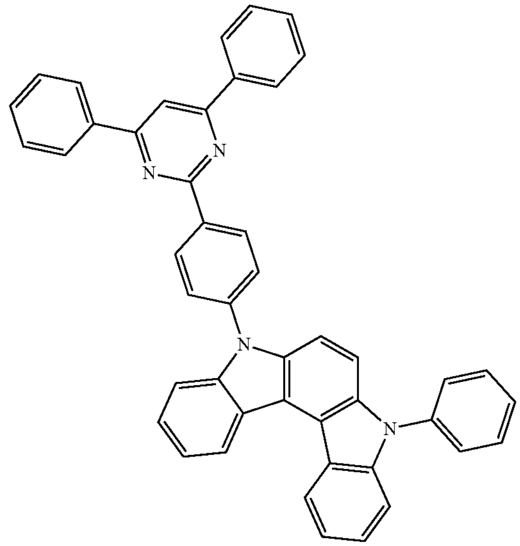
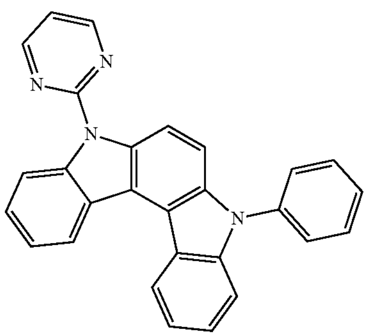
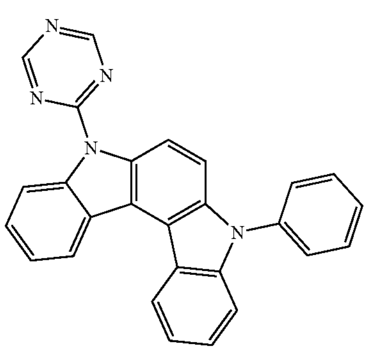
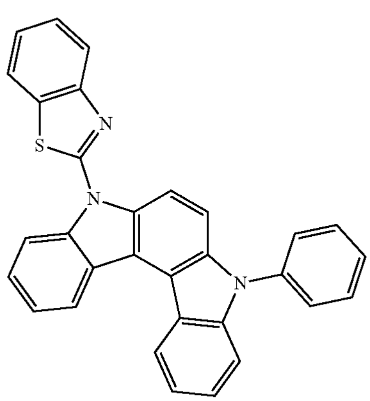

-continued
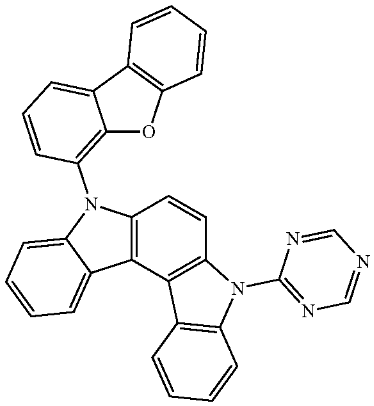
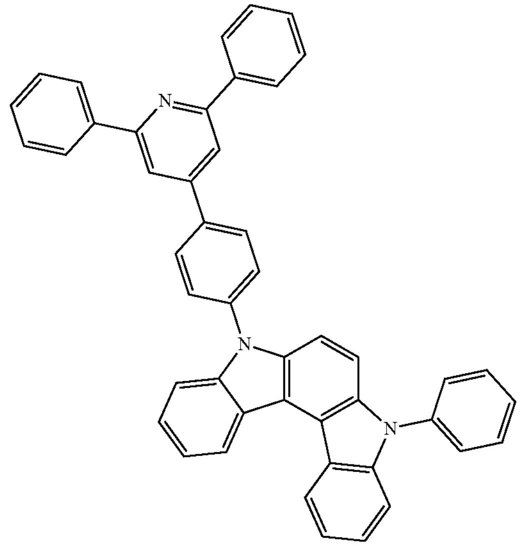
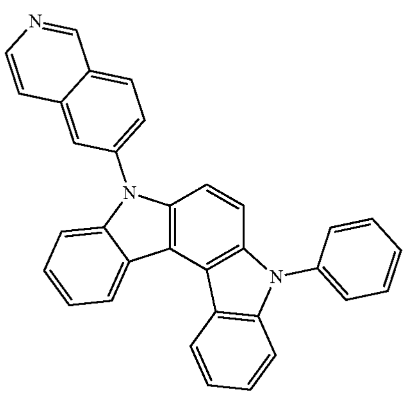
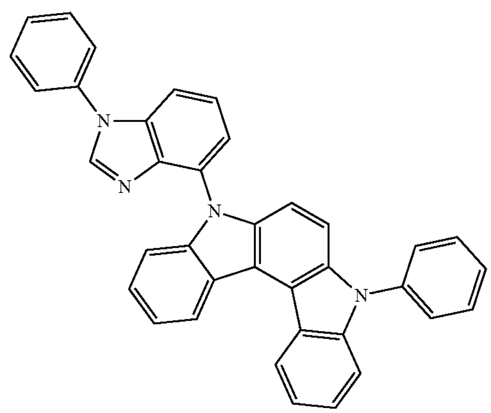
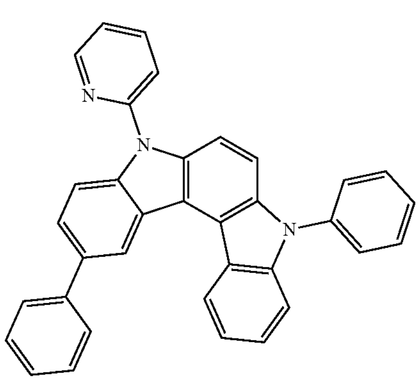
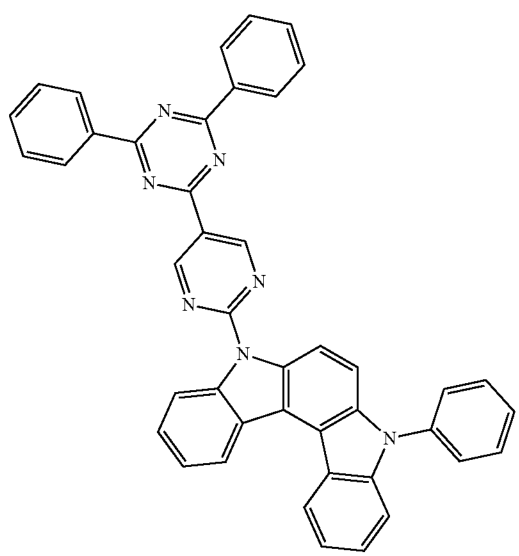

-continued
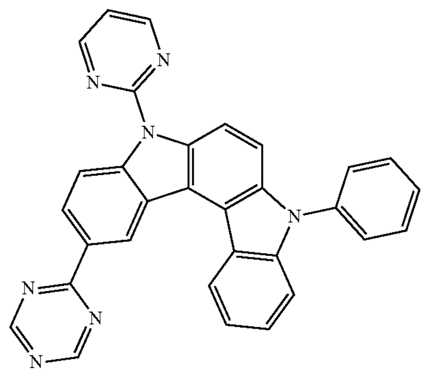
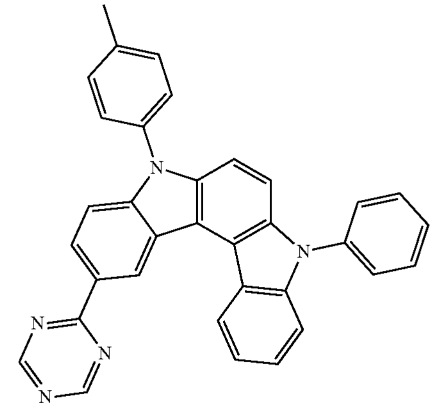
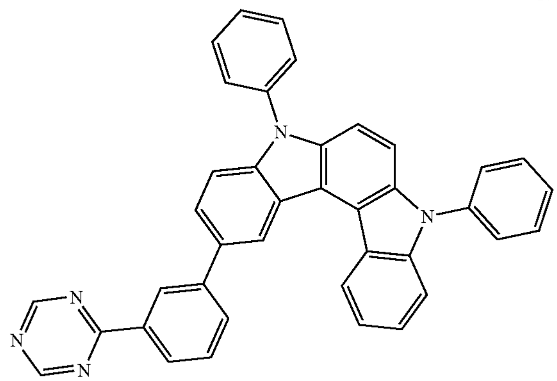
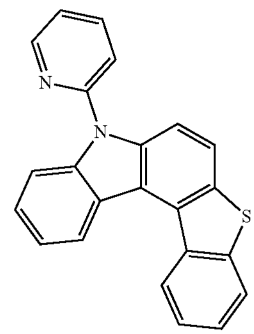
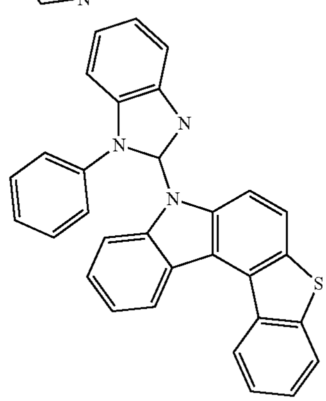
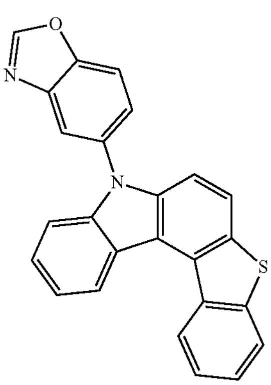
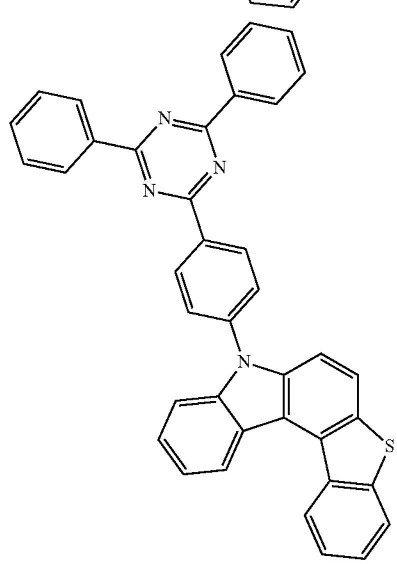
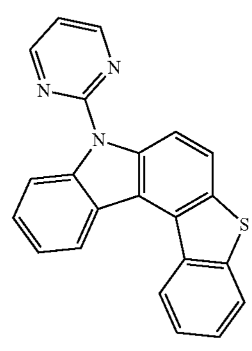
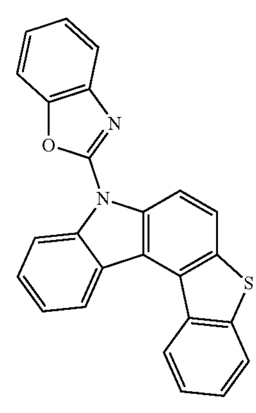

-continued
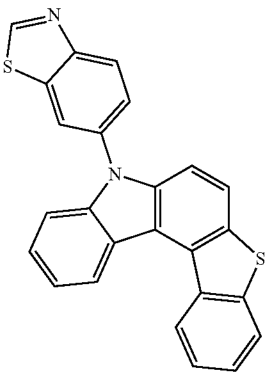
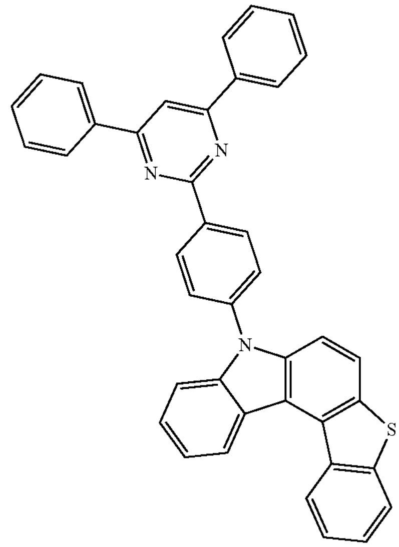
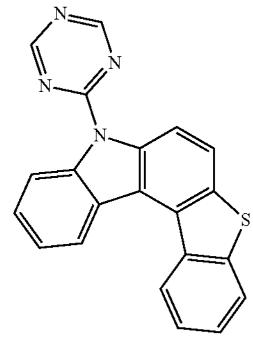
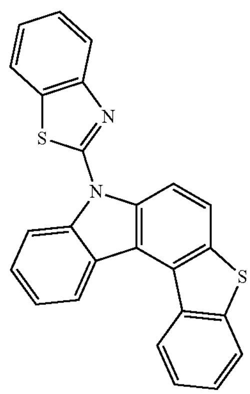
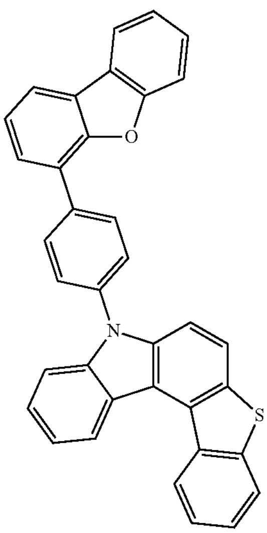
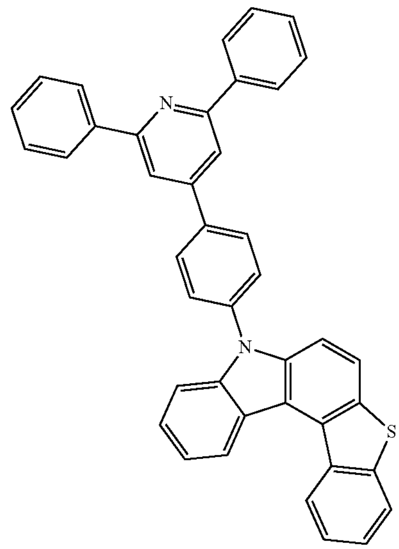
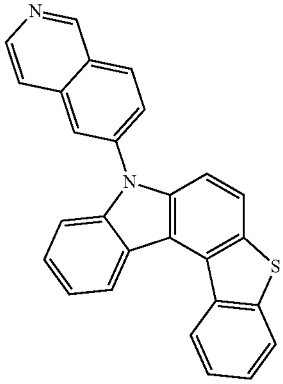
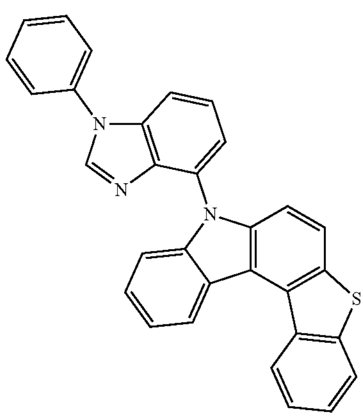
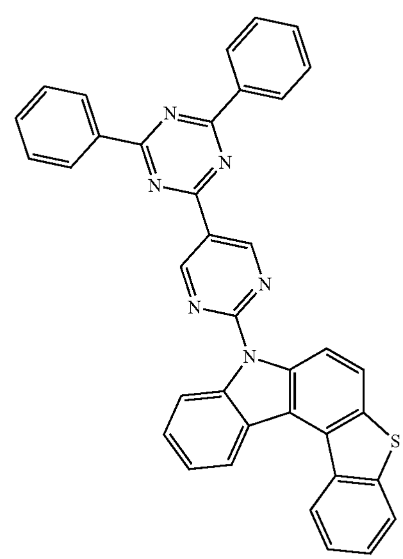

-continued
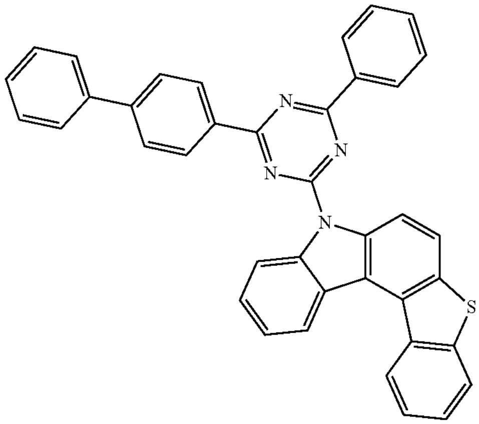
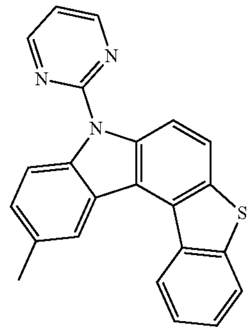
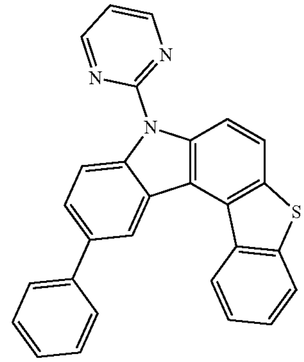
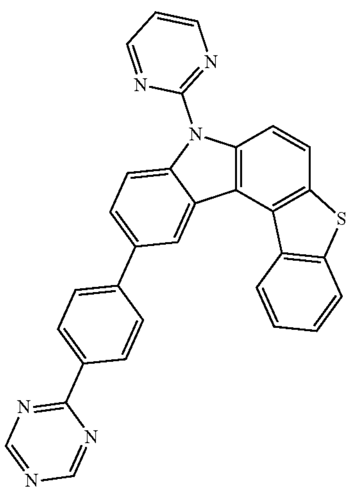
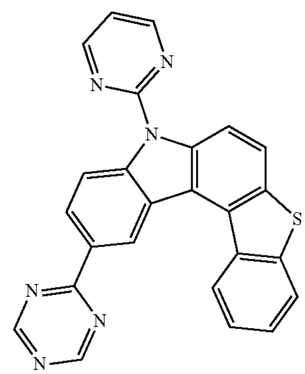
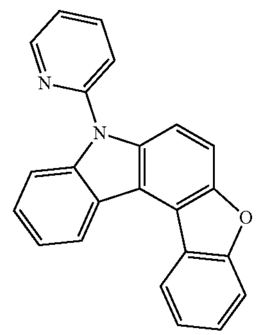
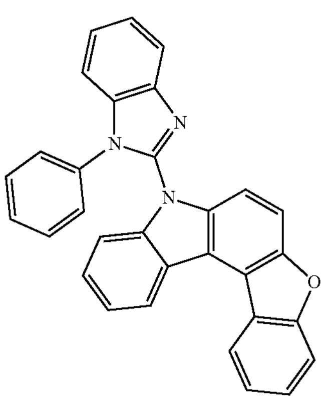
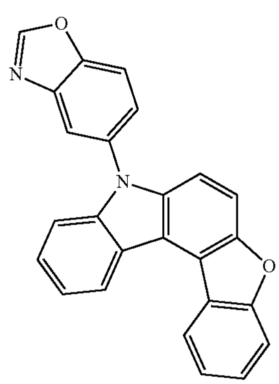

-continued
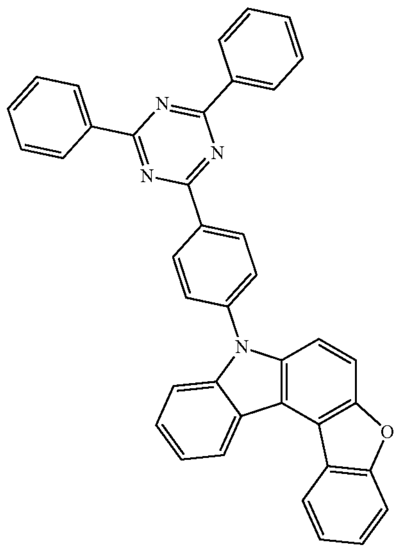
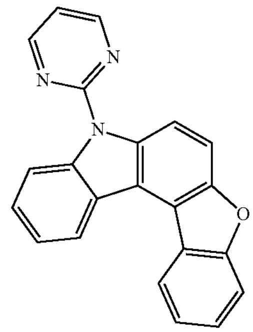
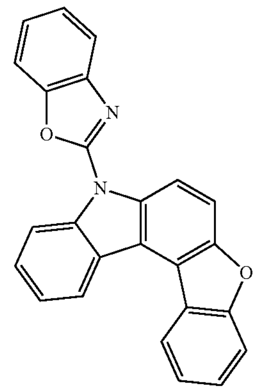
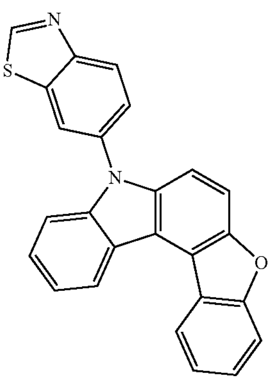
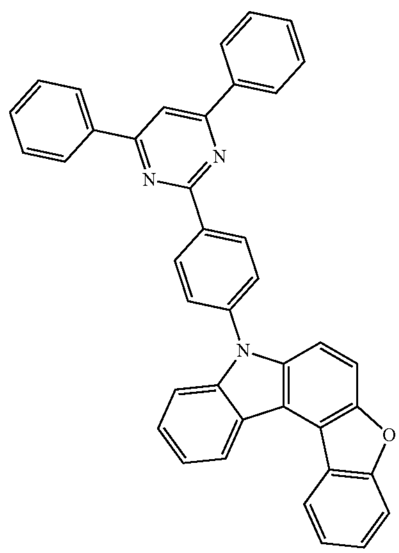
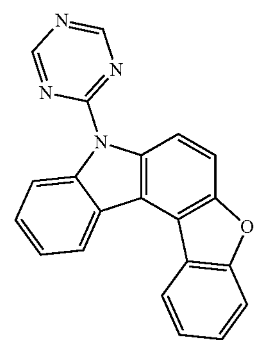
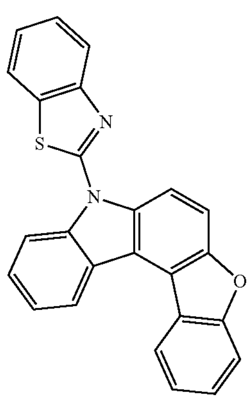
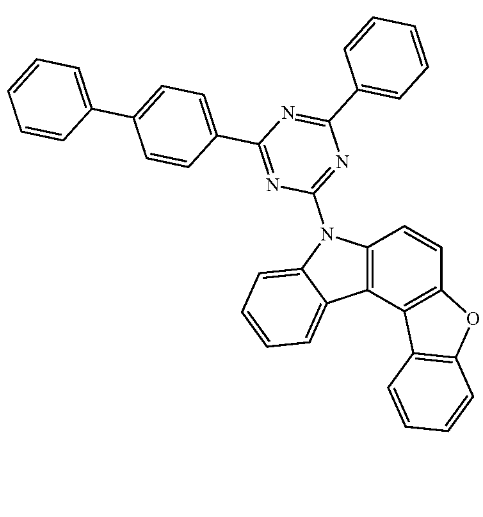

-continued
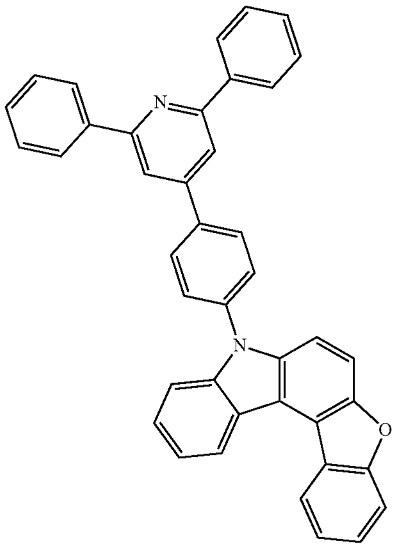
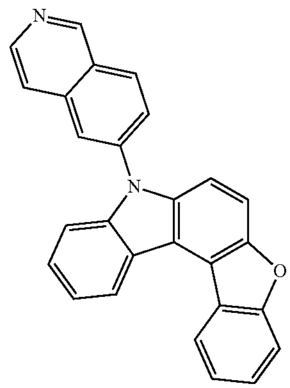
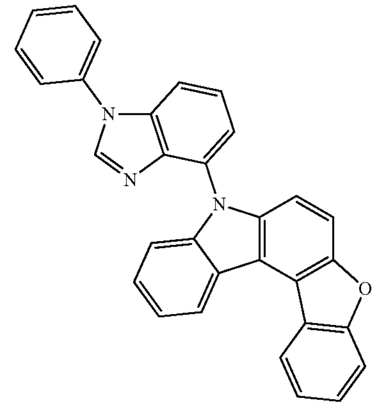
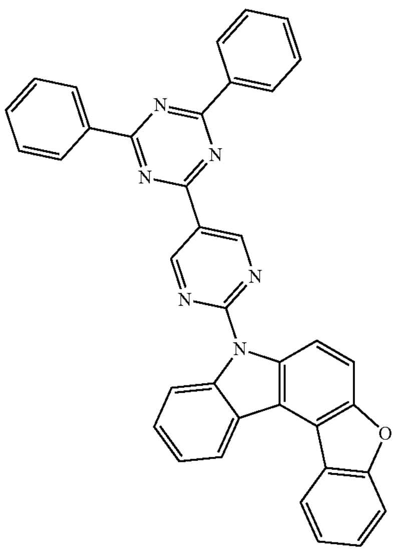
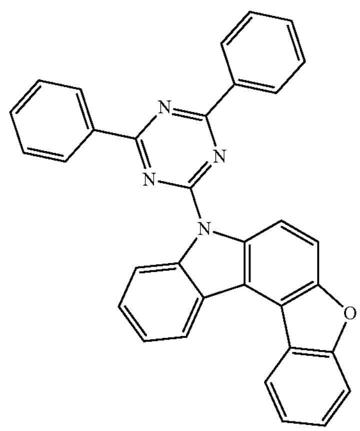
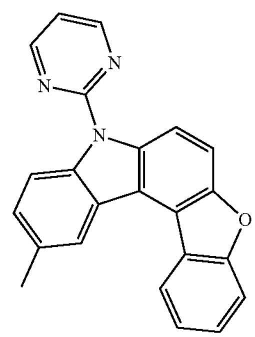
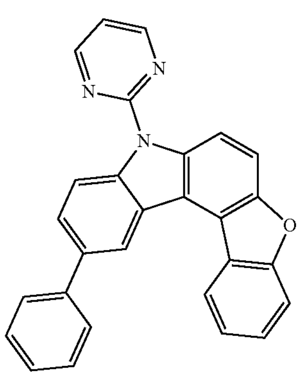
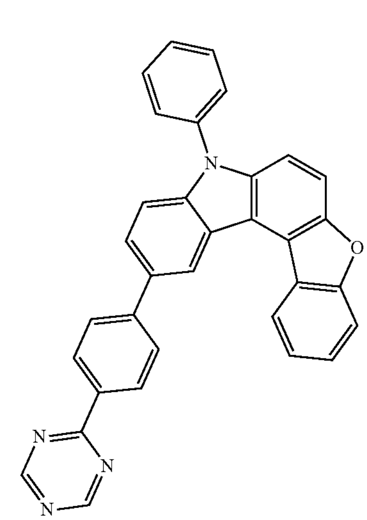
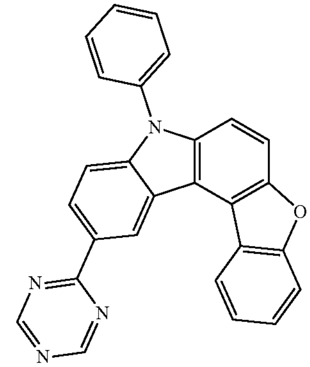

-continued
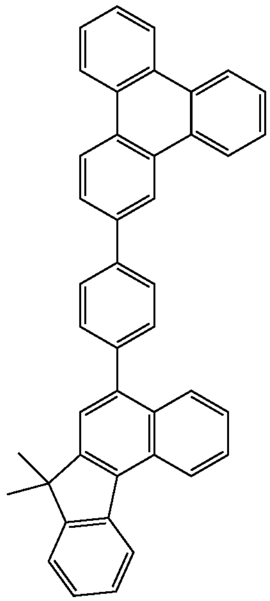
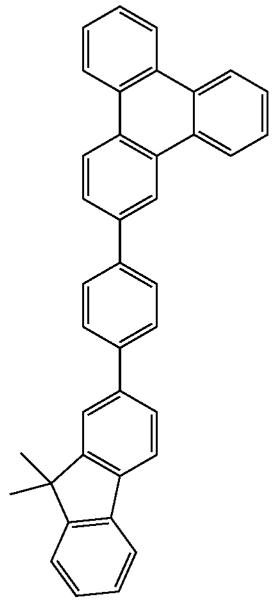
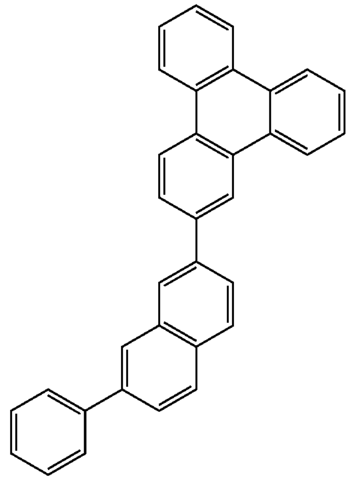
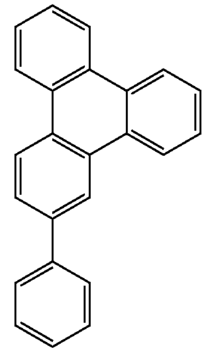
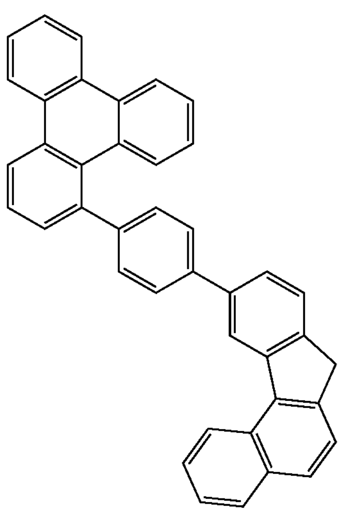
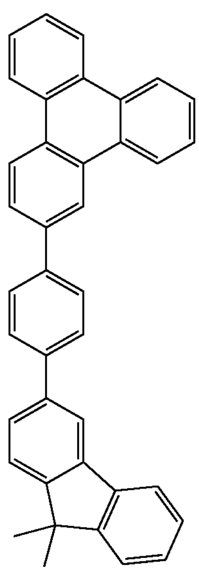
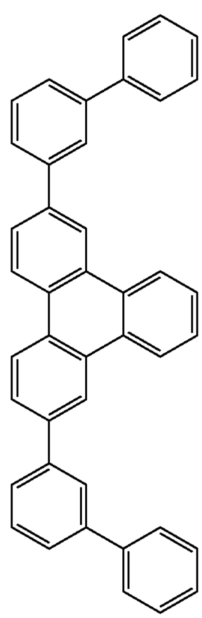
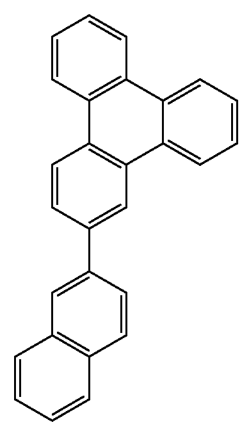

-continued
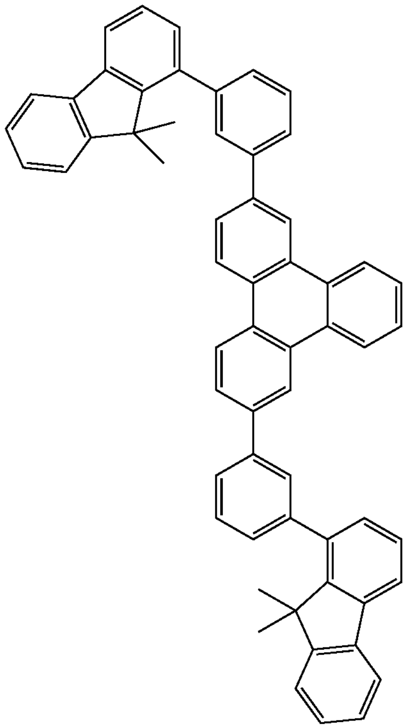
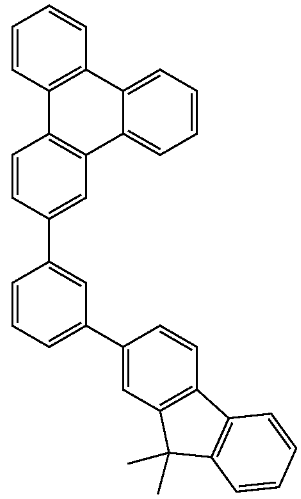
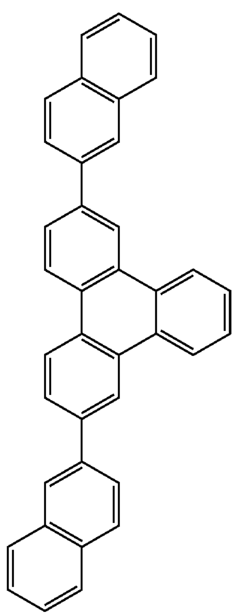
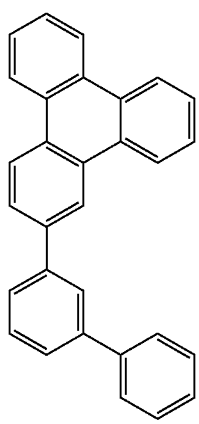
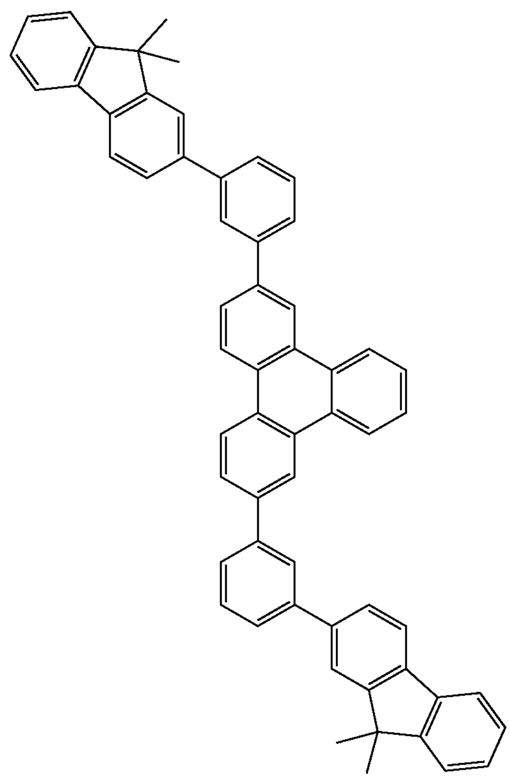

-continued
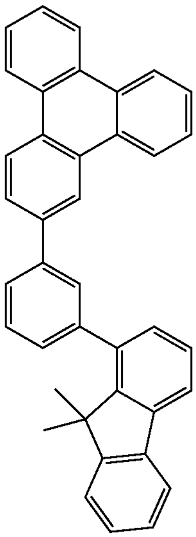
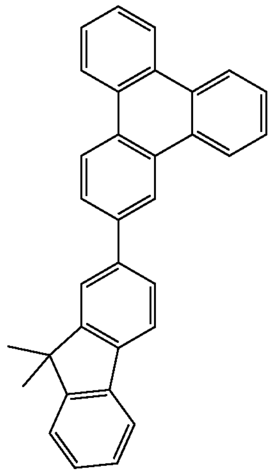
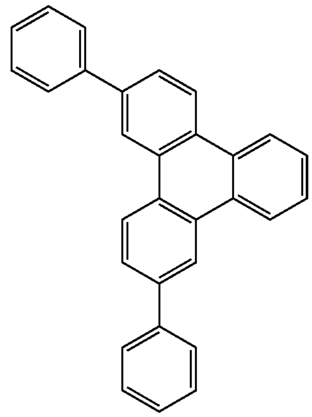
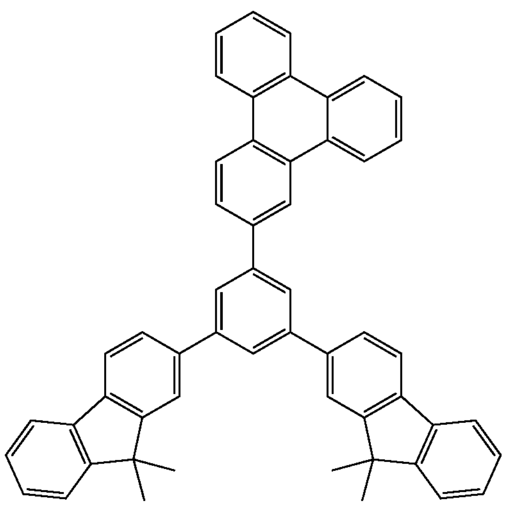
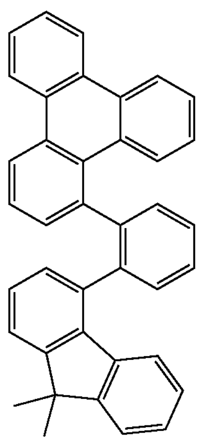
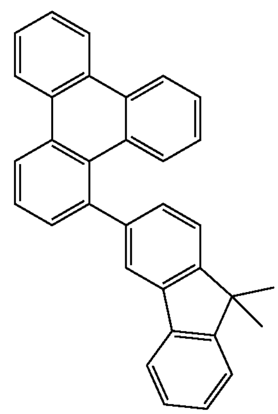
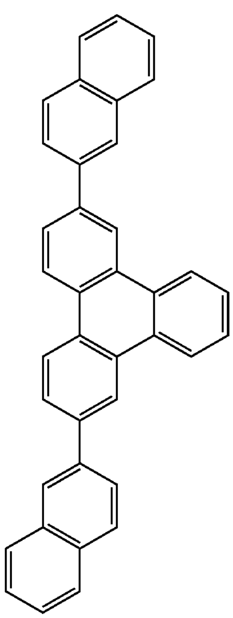
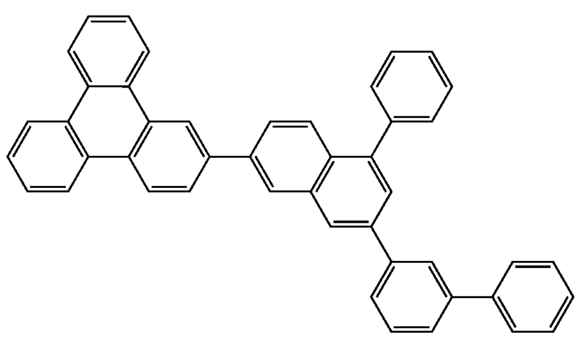

-continued
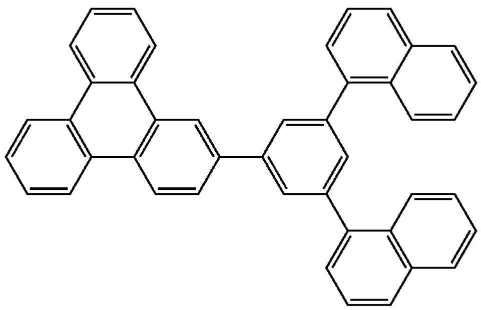
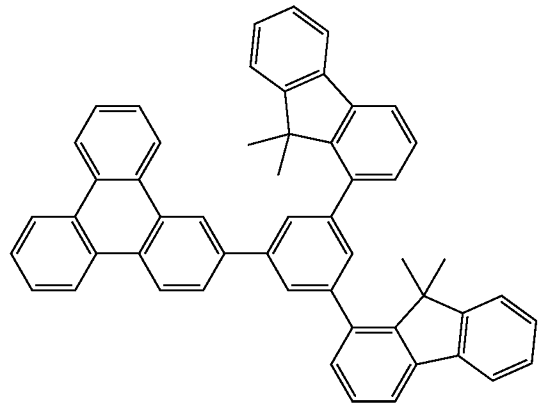
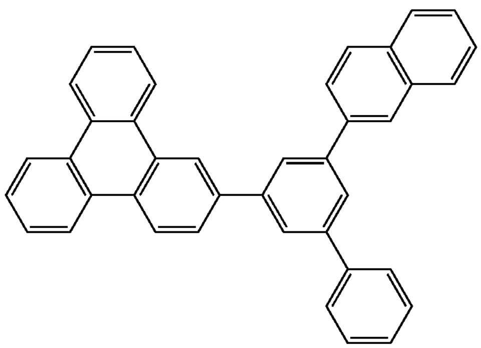
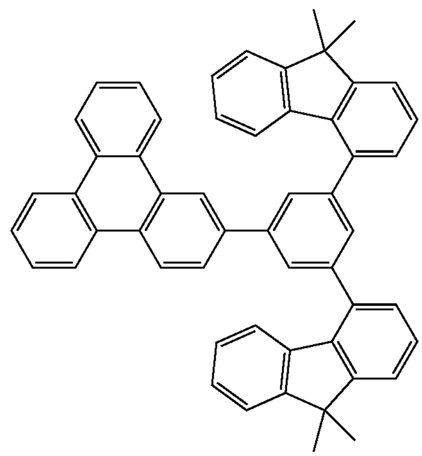
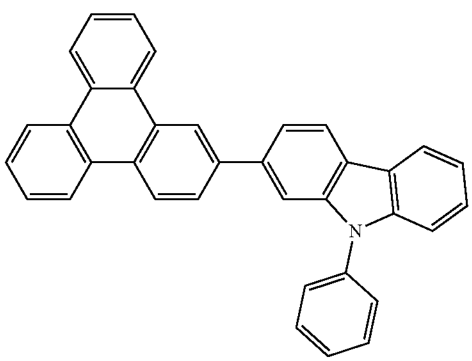
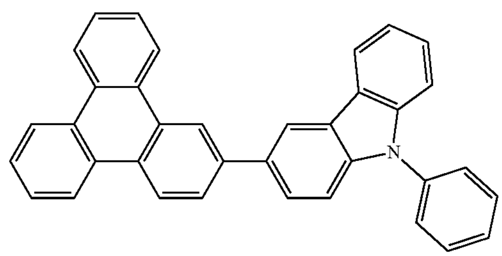
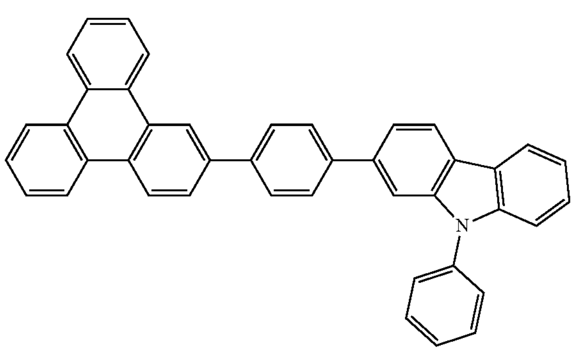
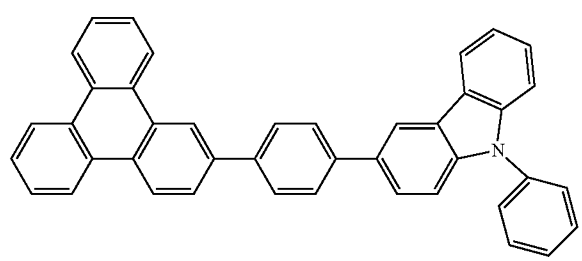

-continued
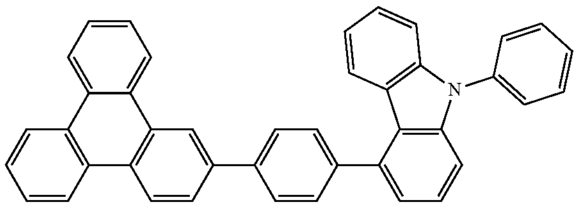
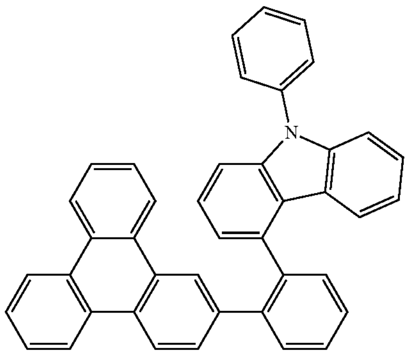
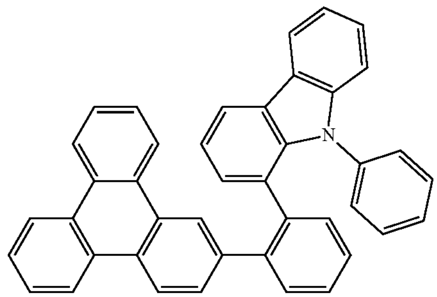
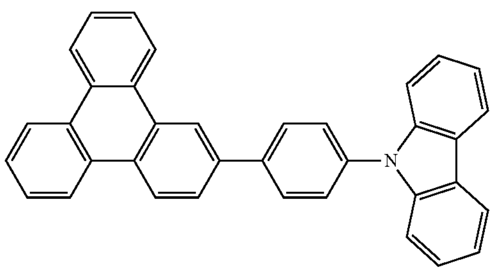
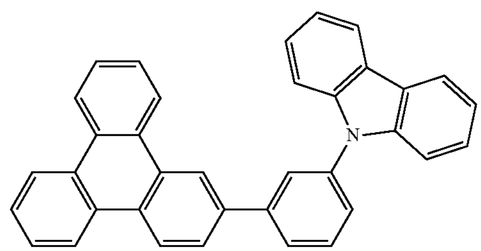
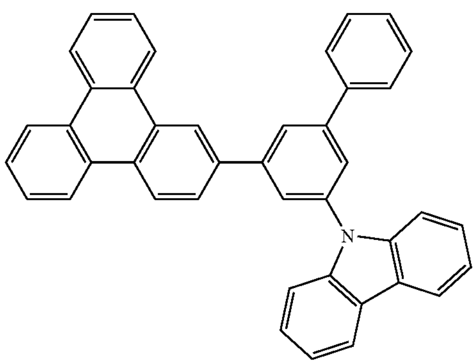
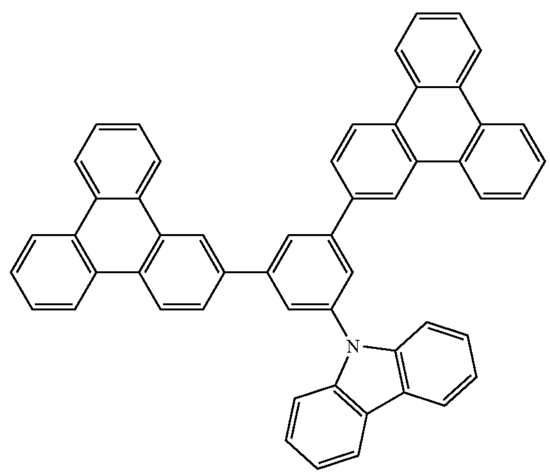
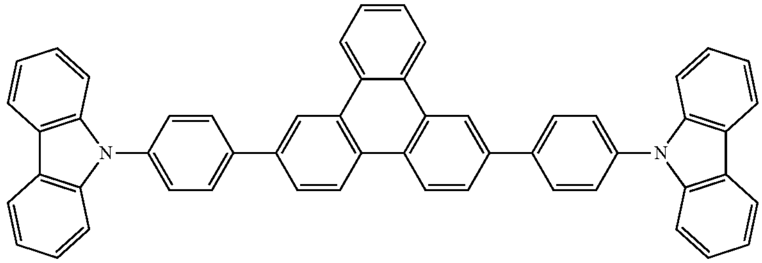

-continued
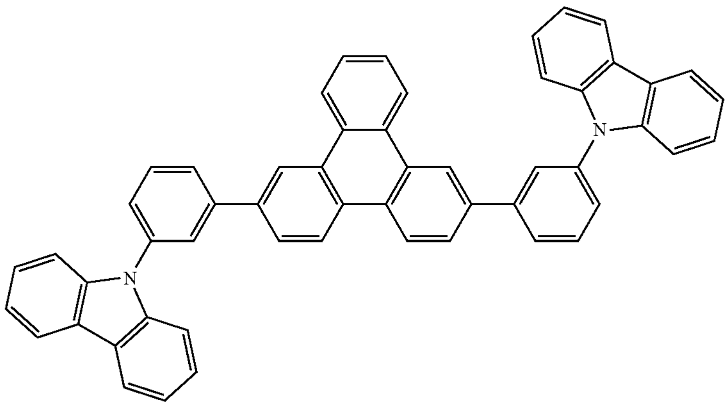
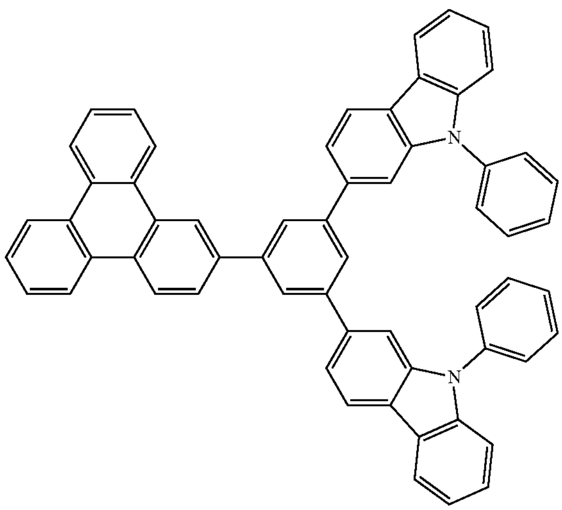
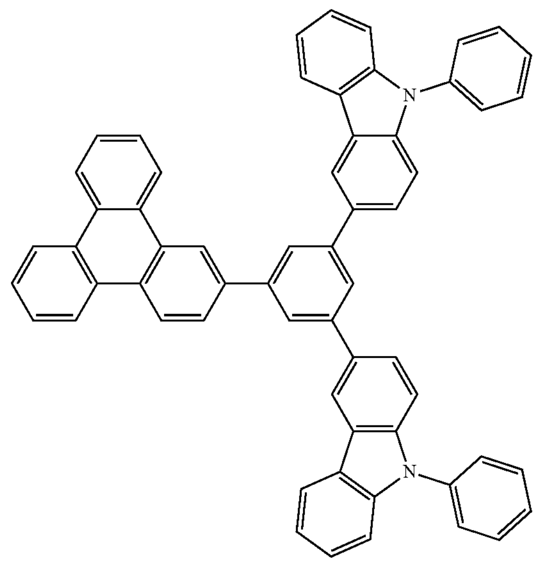
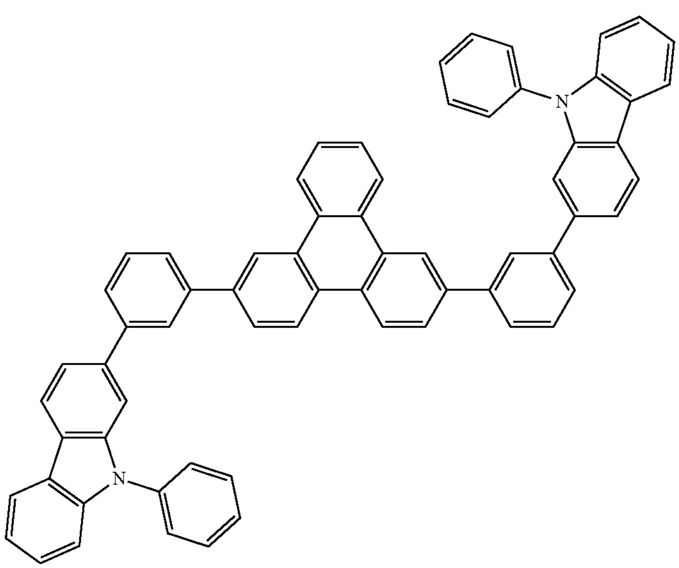

-continued
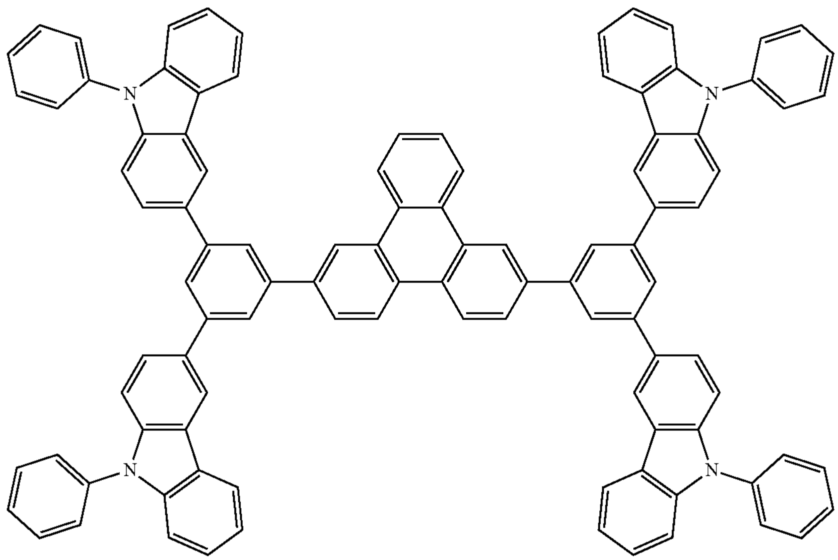
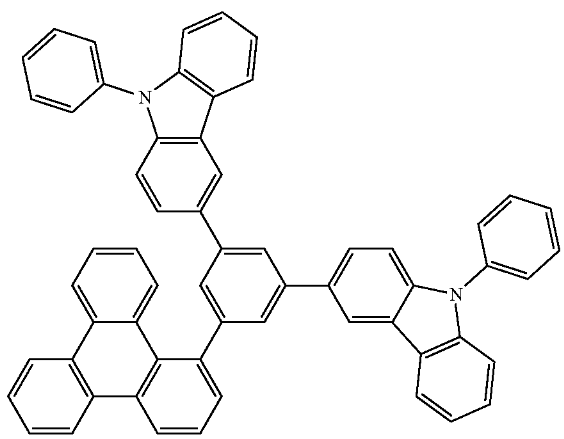
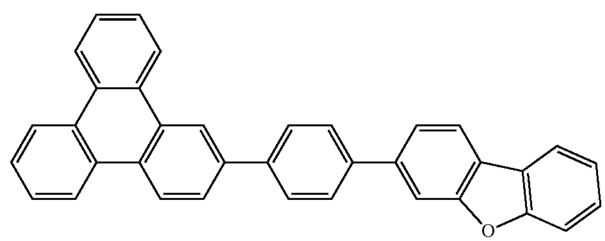
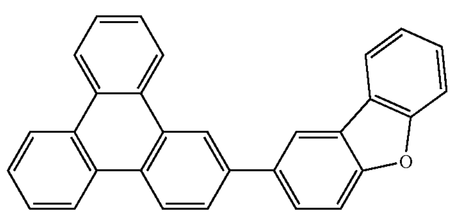
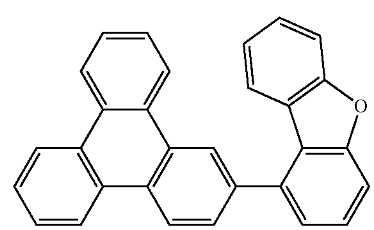
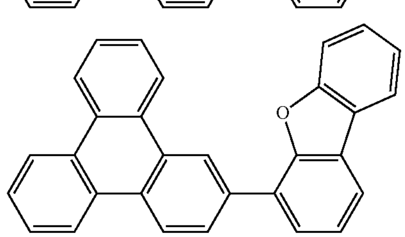
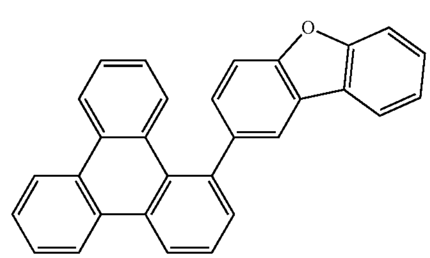
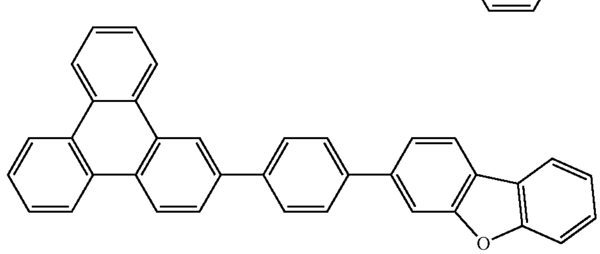
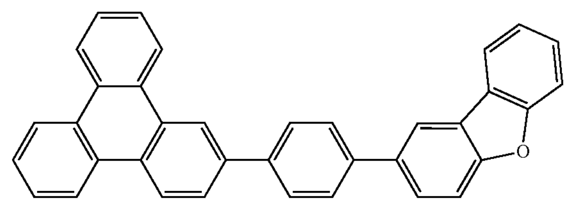

-continued
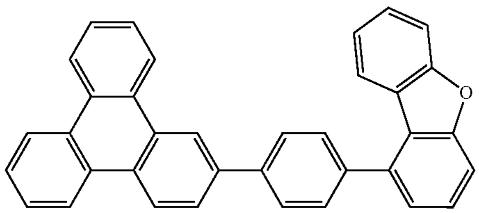
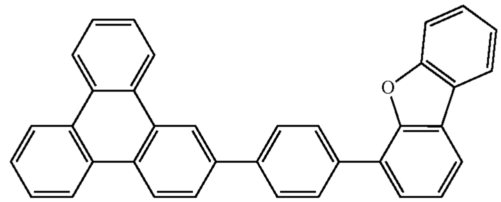
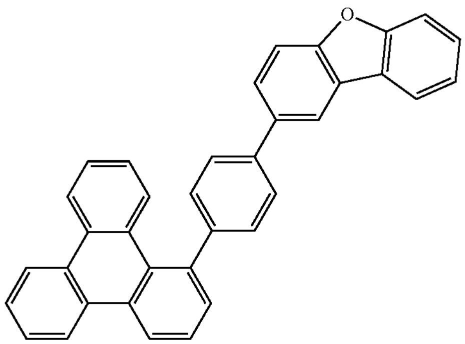
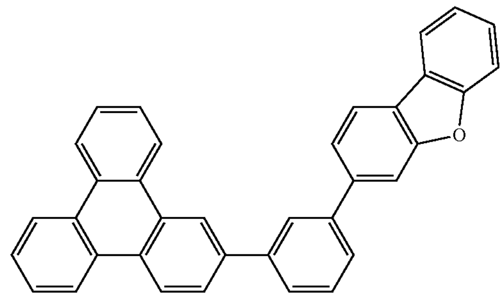
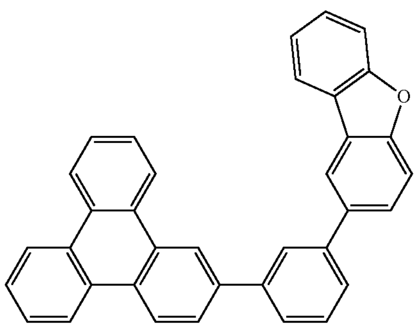
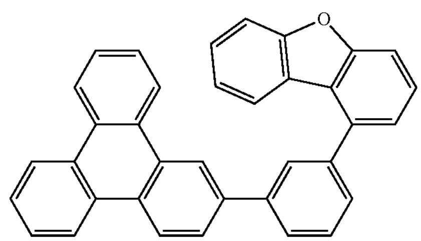
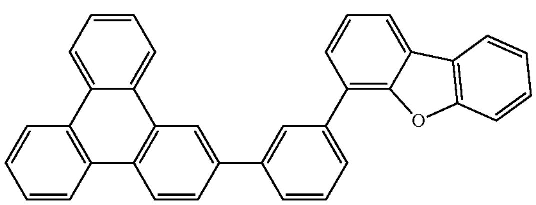
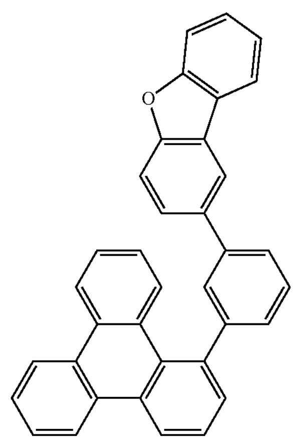
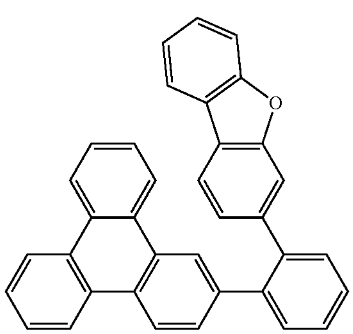
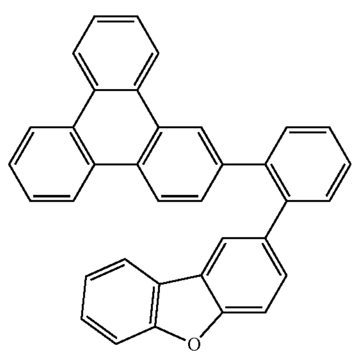
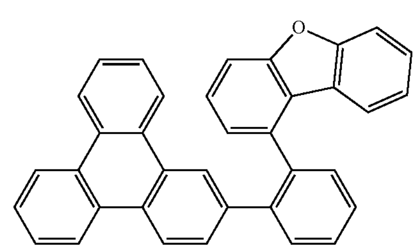

-continued
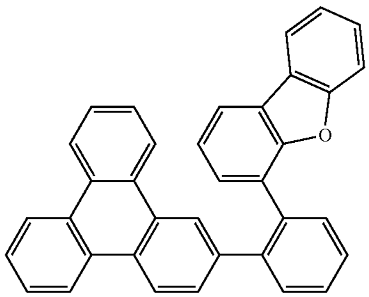
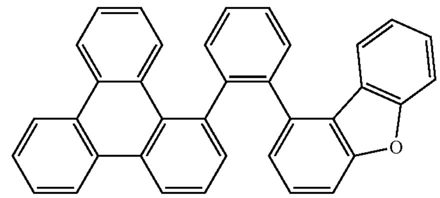
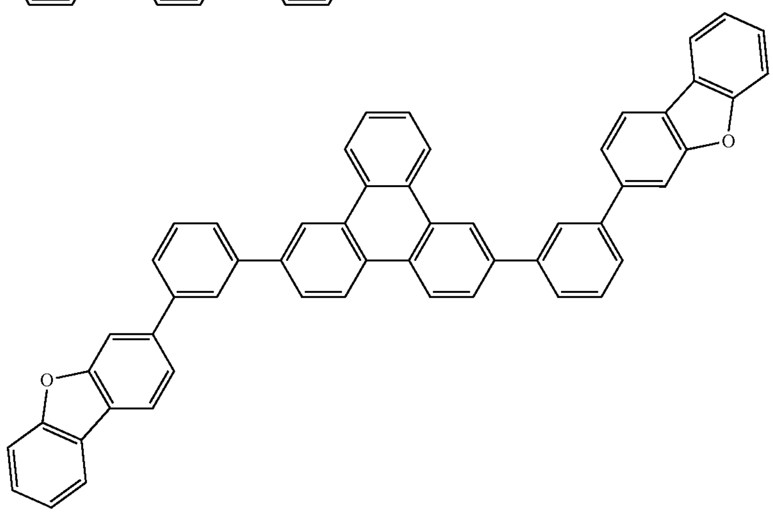
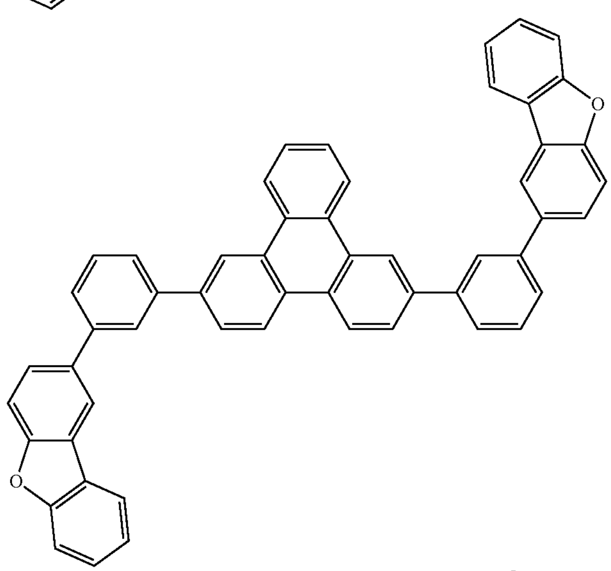
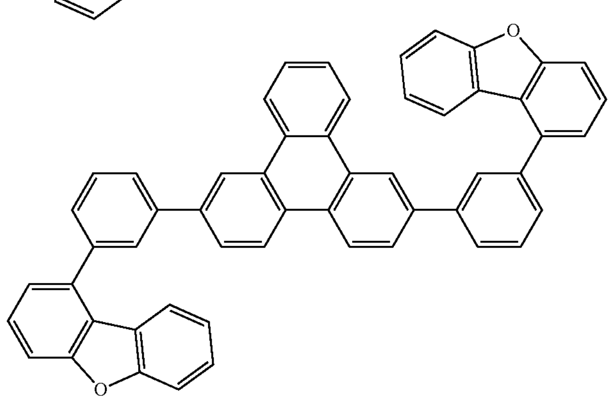

-continued
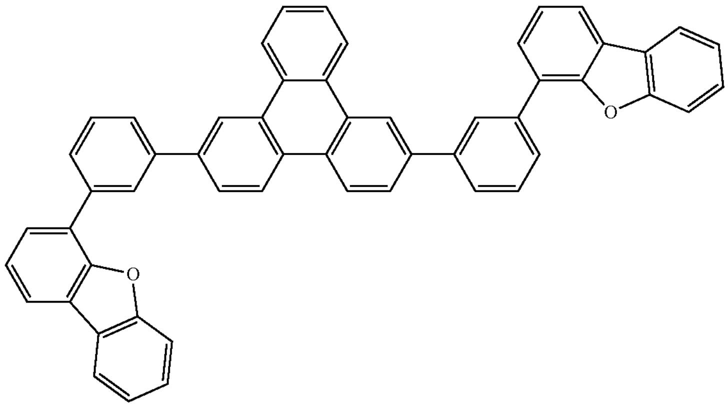
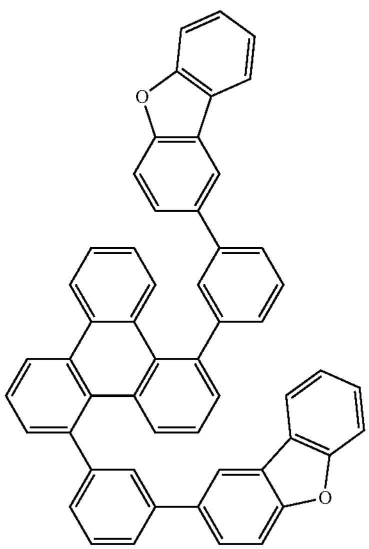
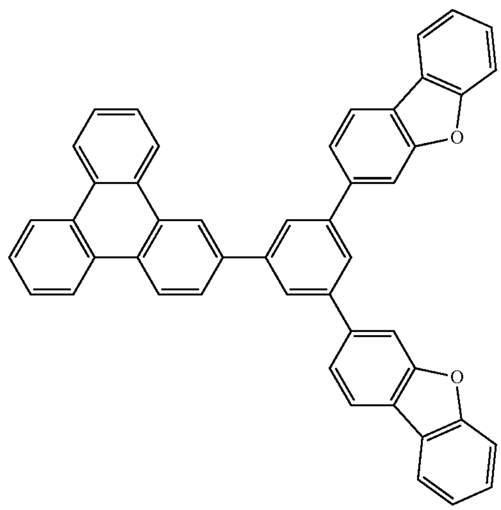
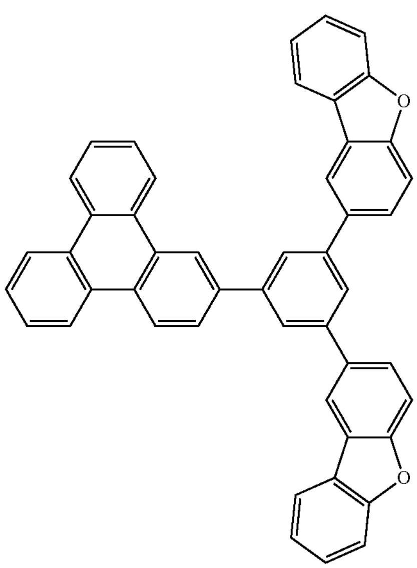
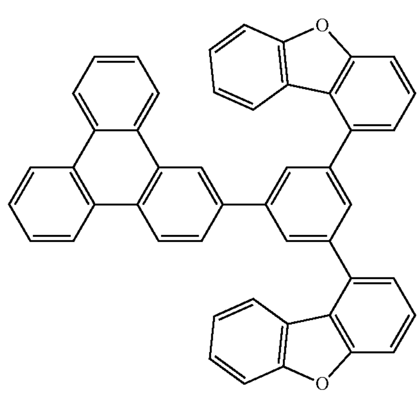

-continued
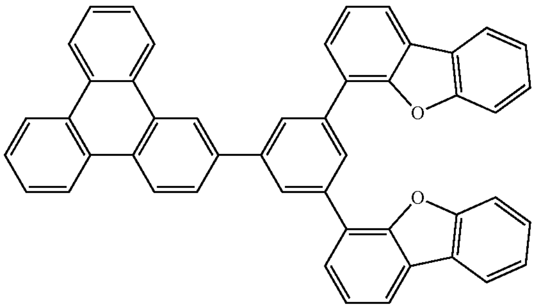
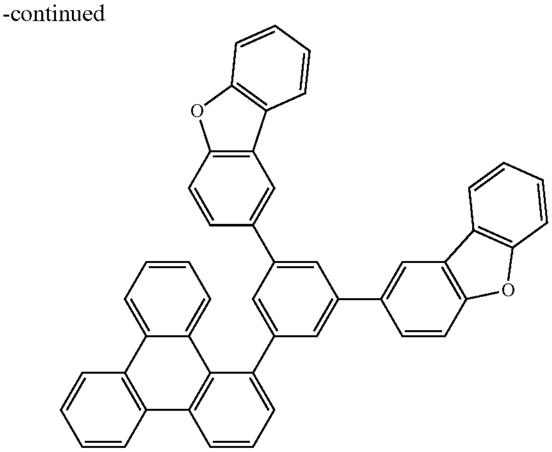
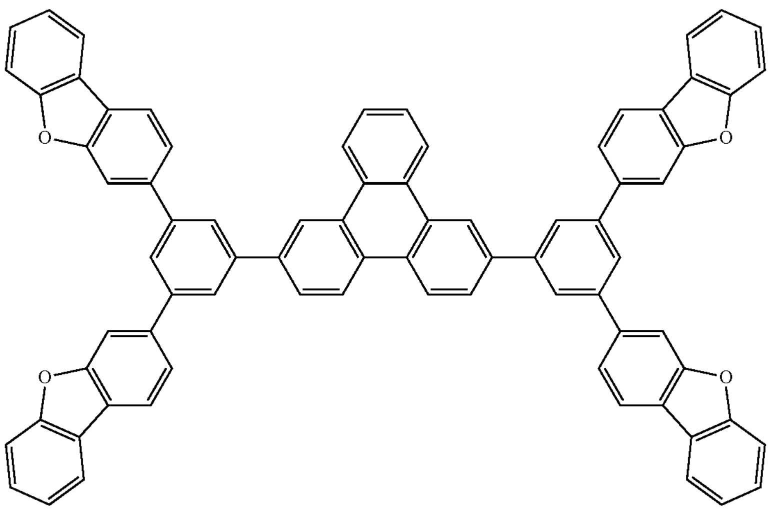
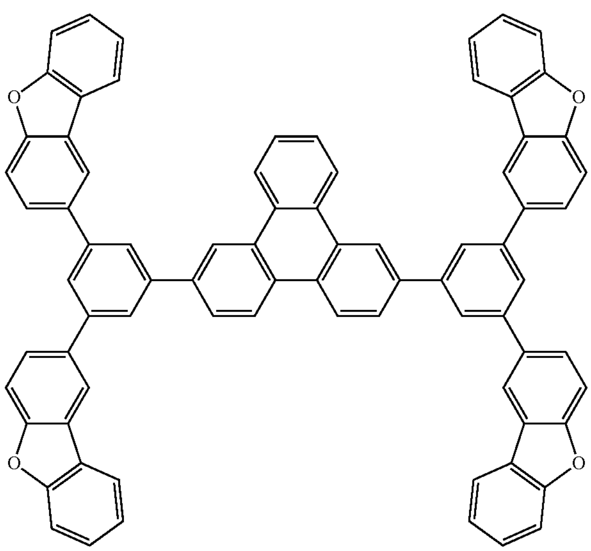

-continued
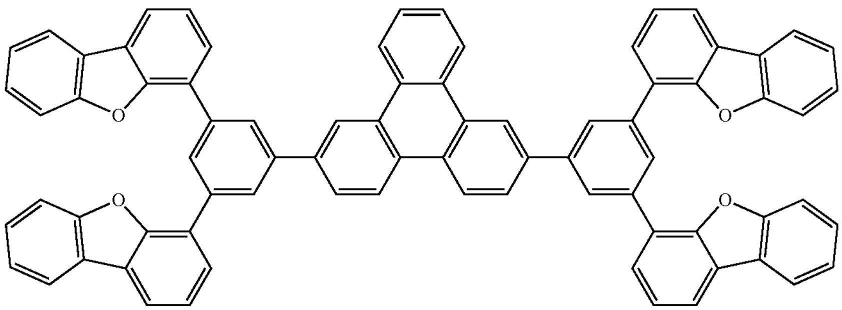
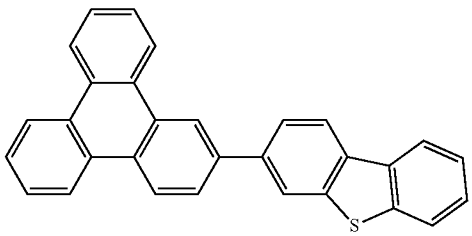
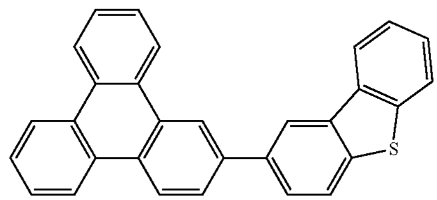
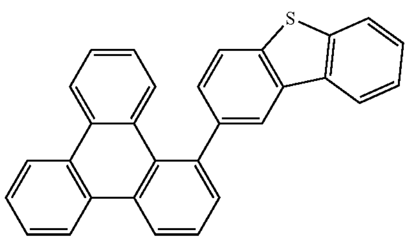
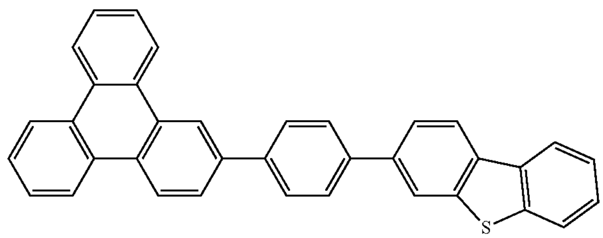
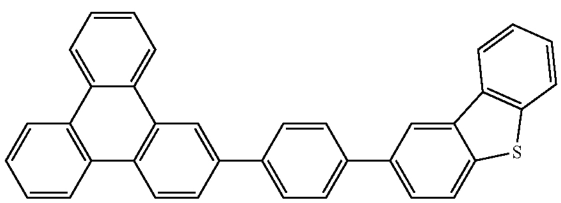
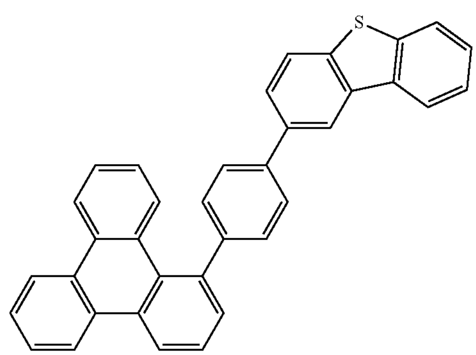
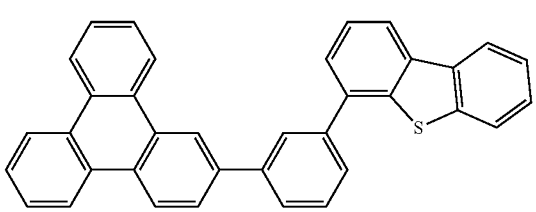
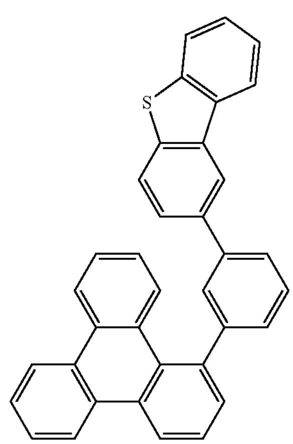

-continued
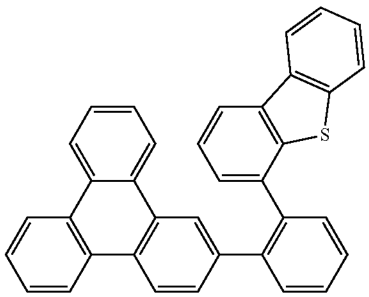
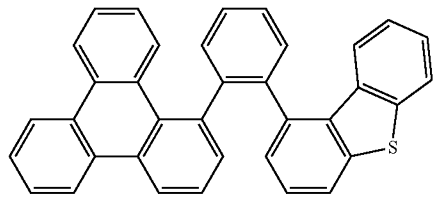
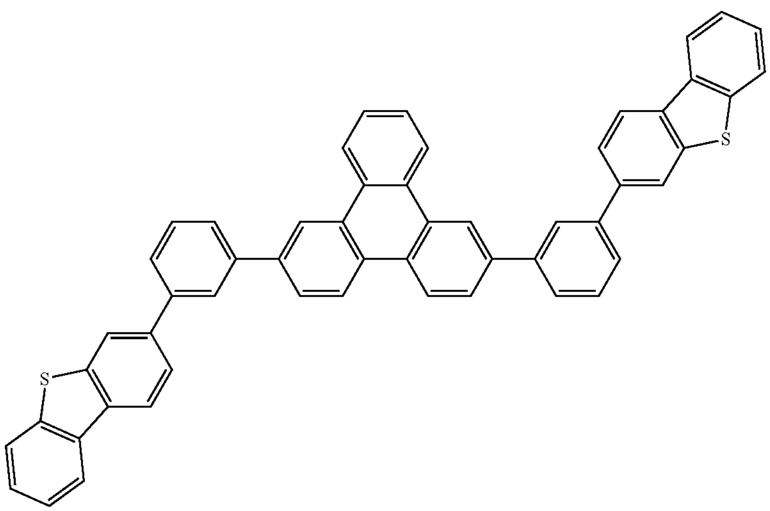
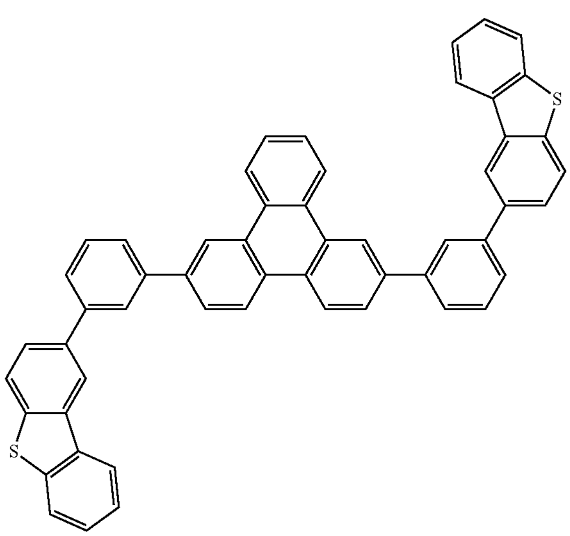
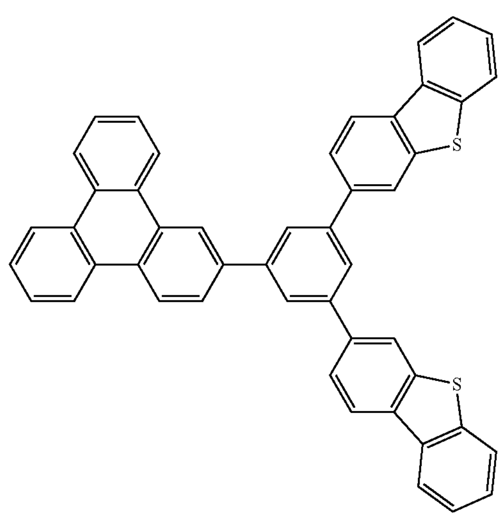

-continued
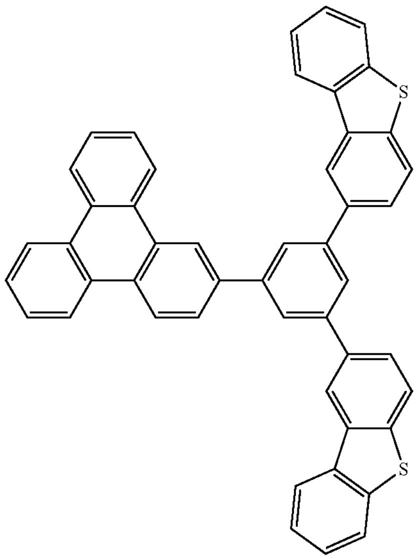
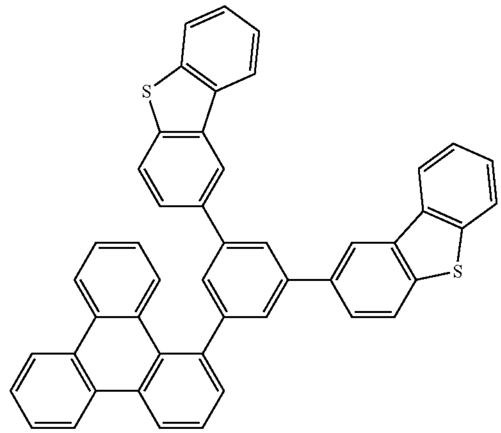
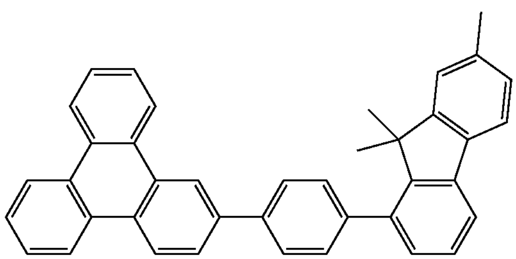
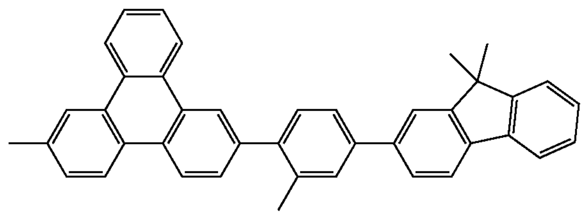
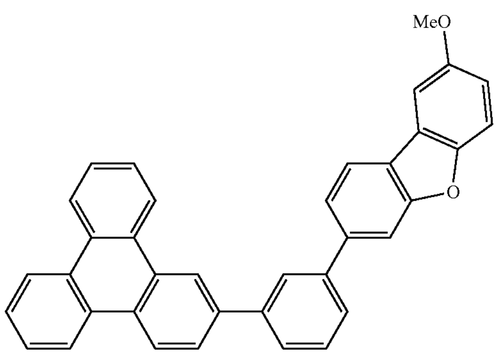
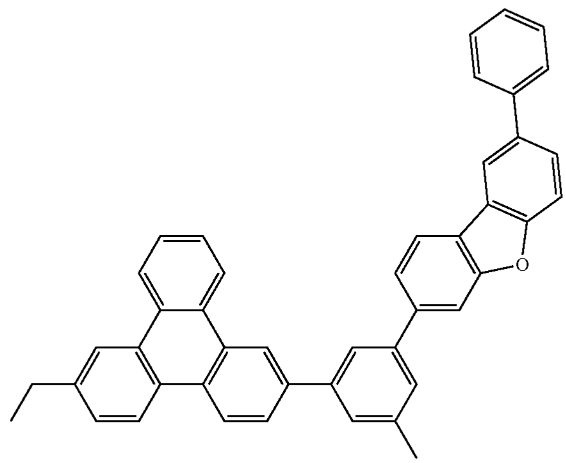
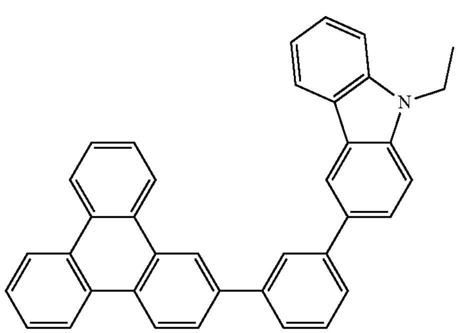
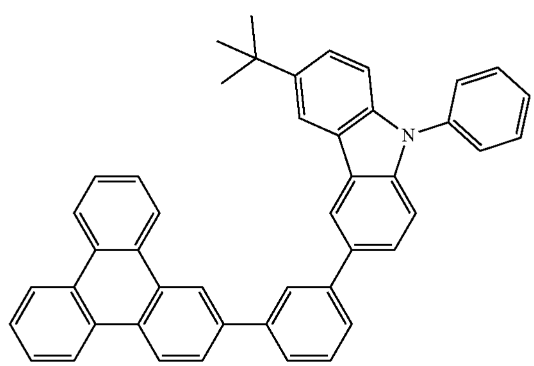

-continued
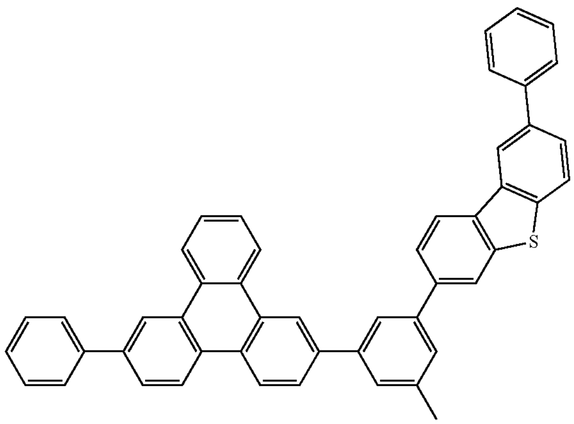
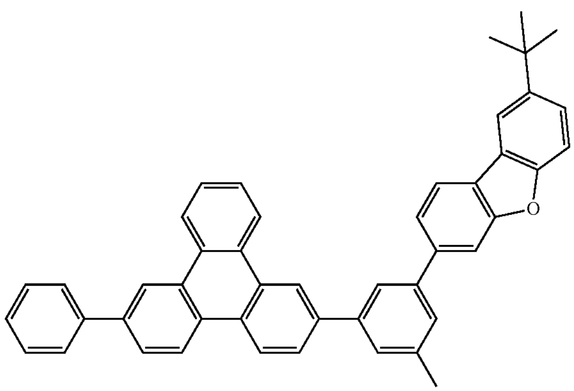
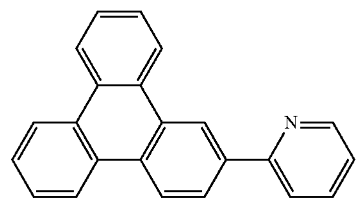
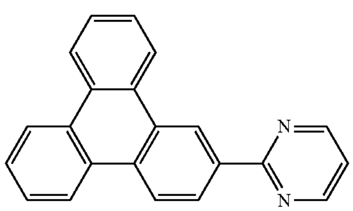
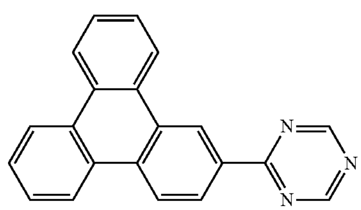
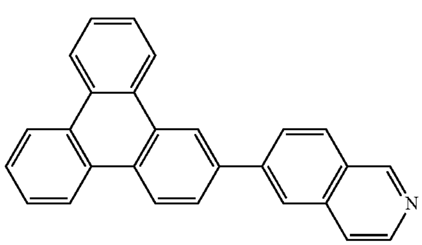
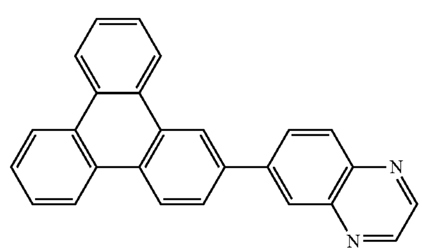
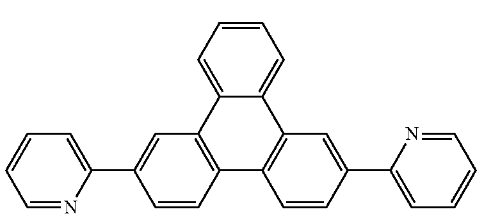
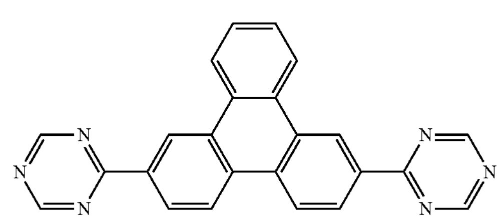

-continued
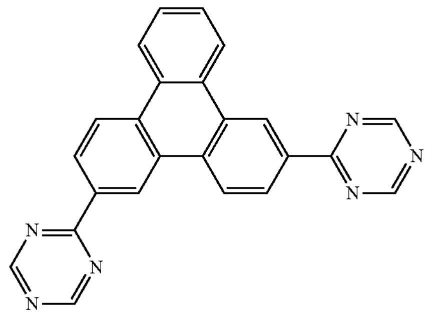
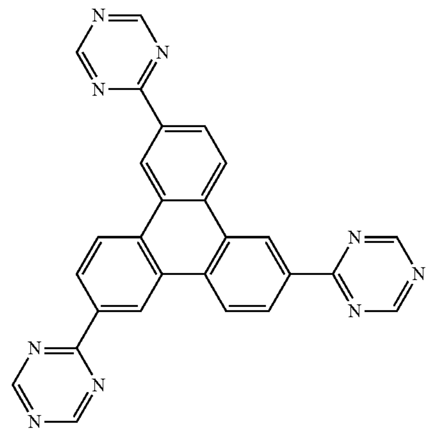
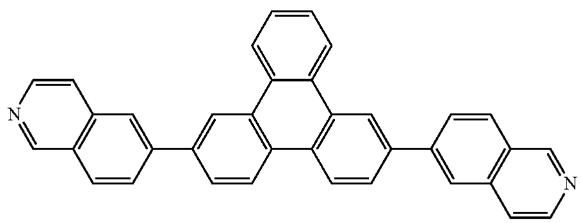
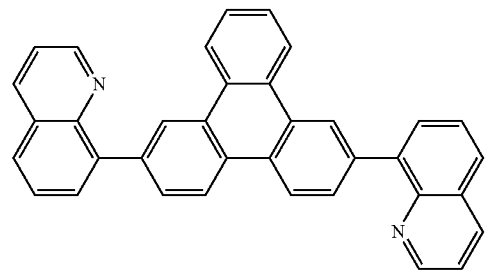
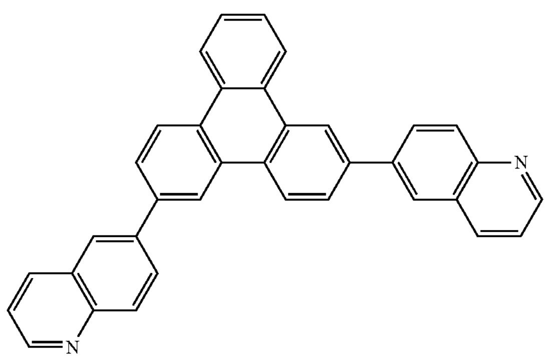
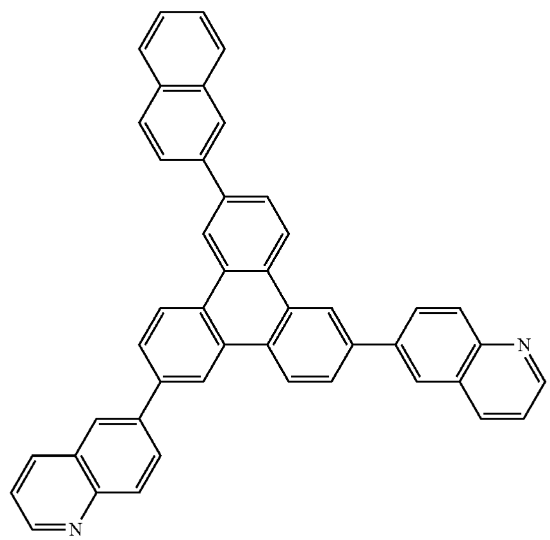
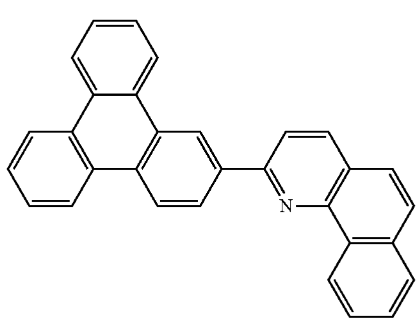
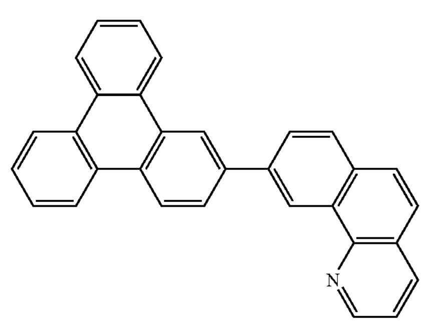

-continued
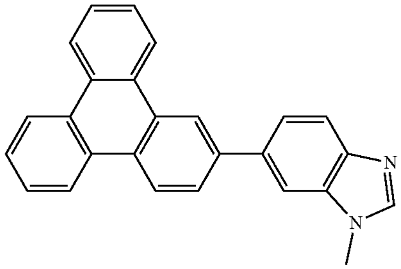
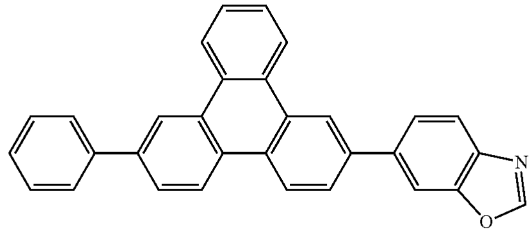
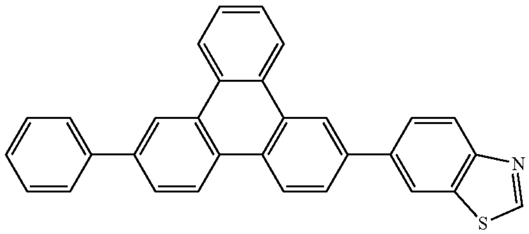
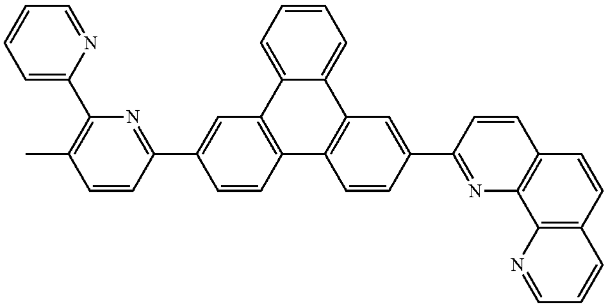
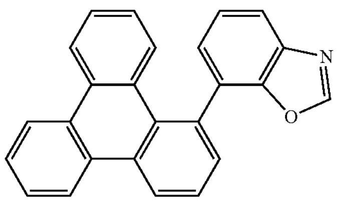
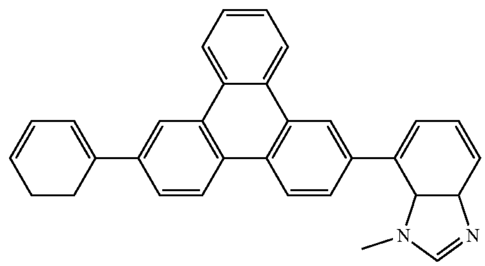
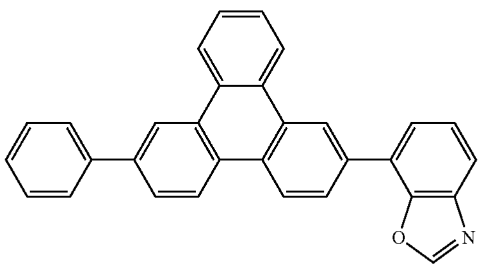
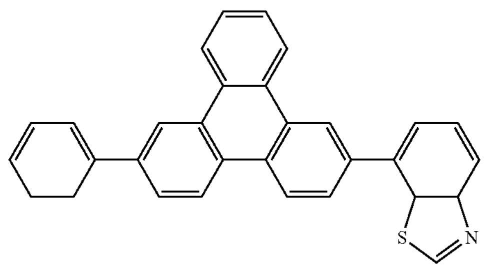
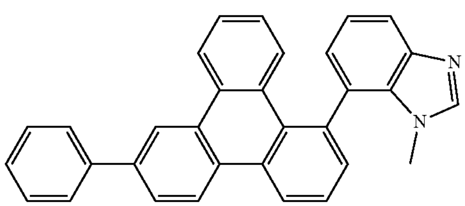
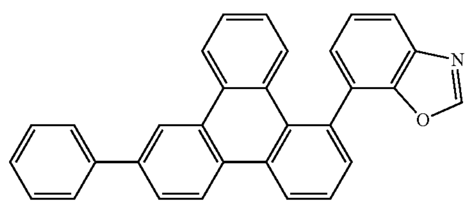
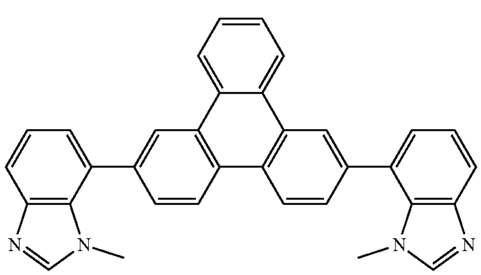
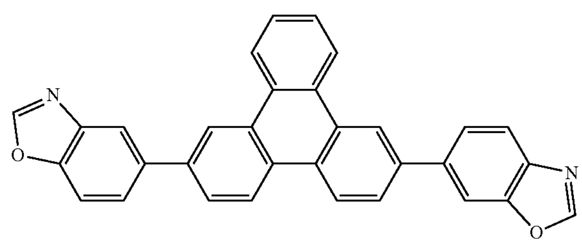

-continued
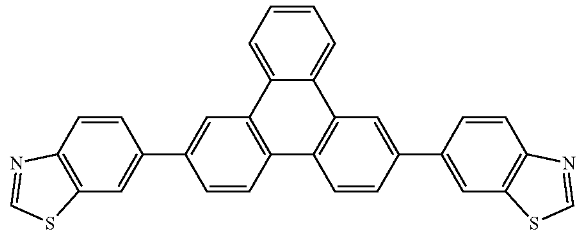
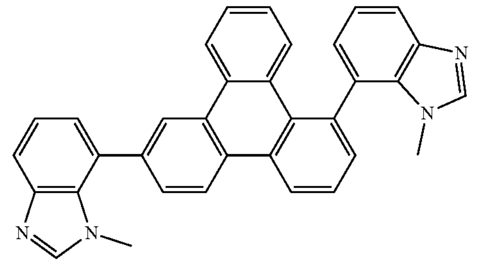
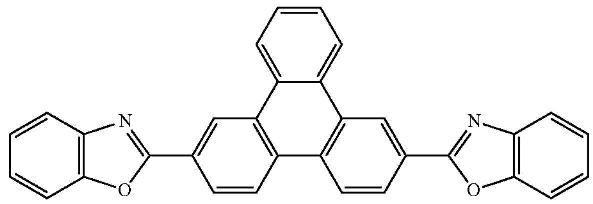
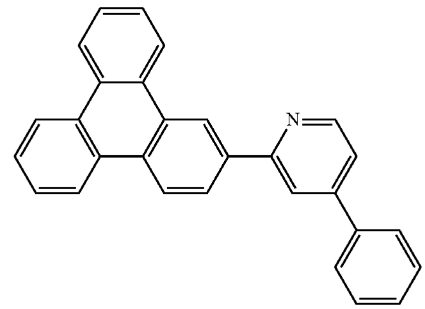
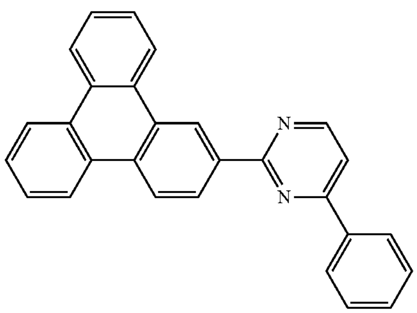
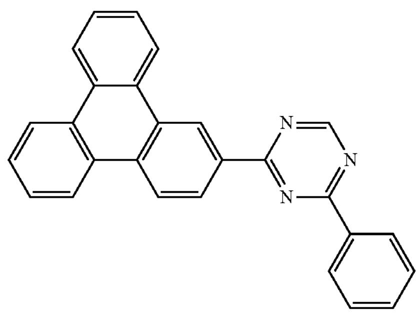
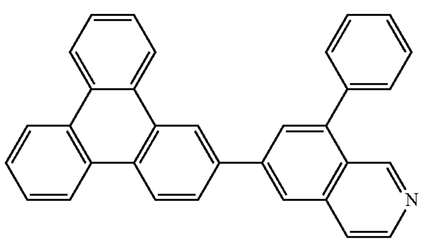
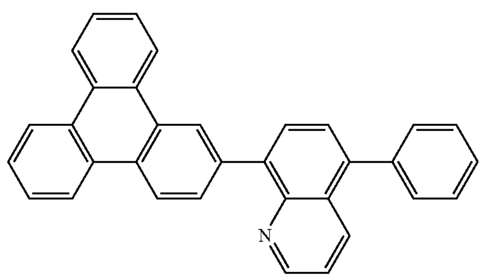
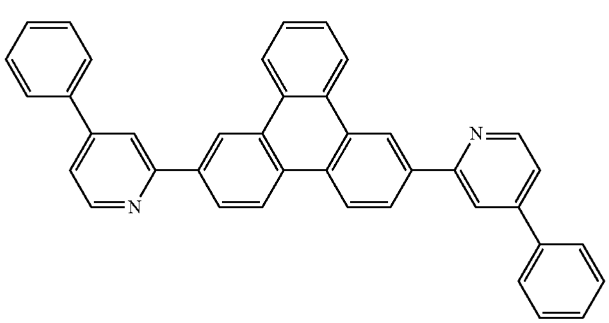
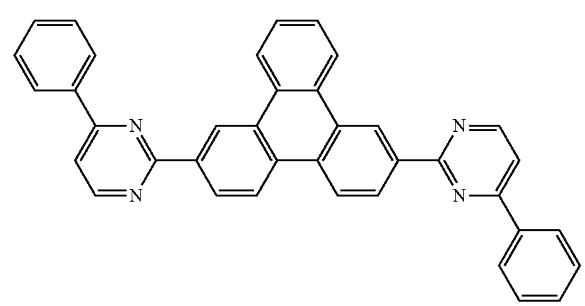

-continued
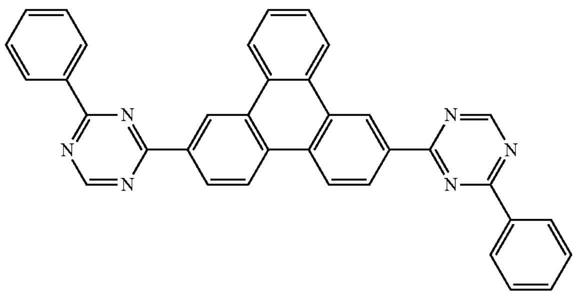
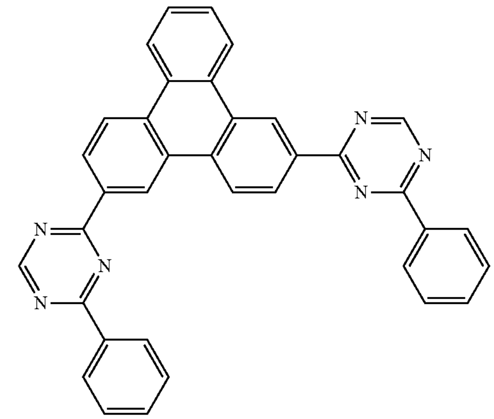
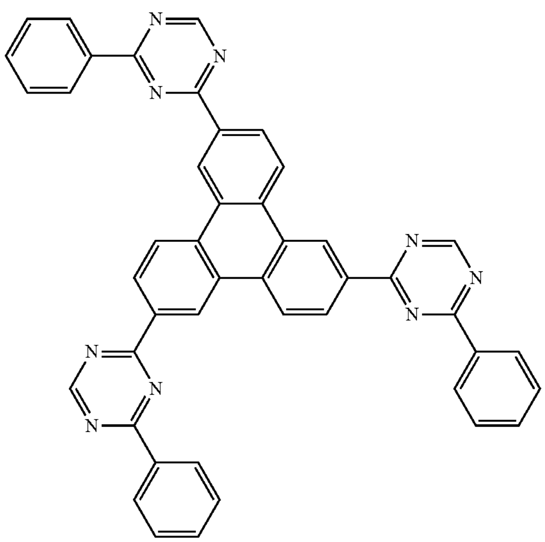
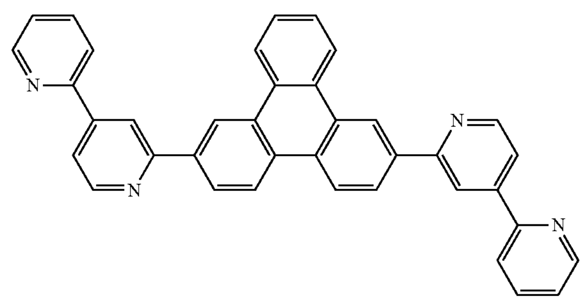
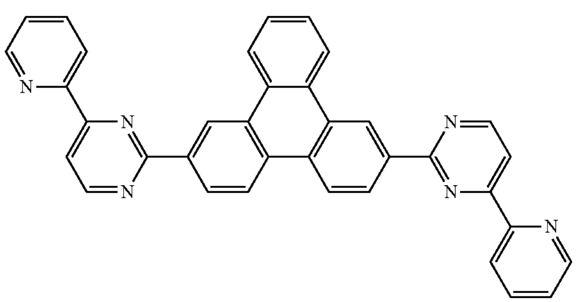
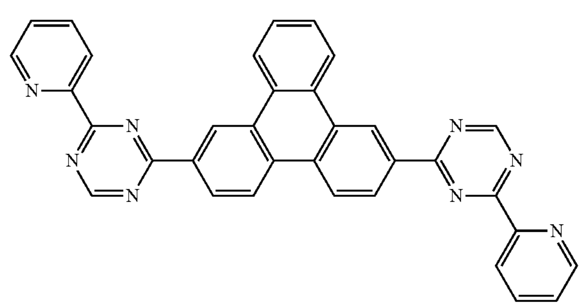

-continued
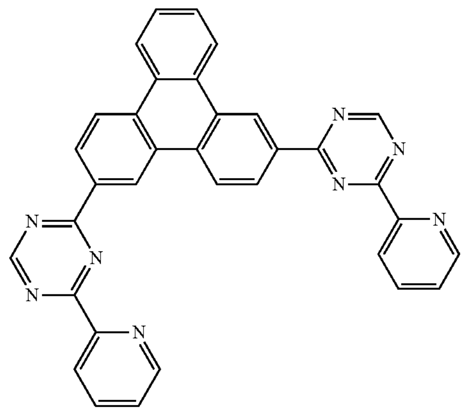
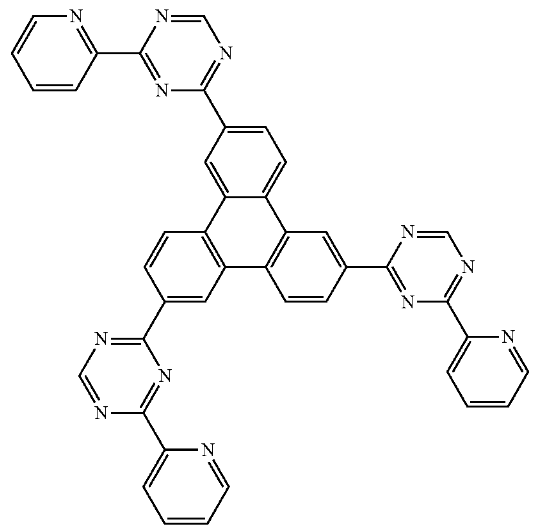
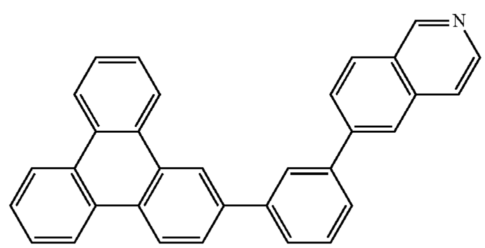
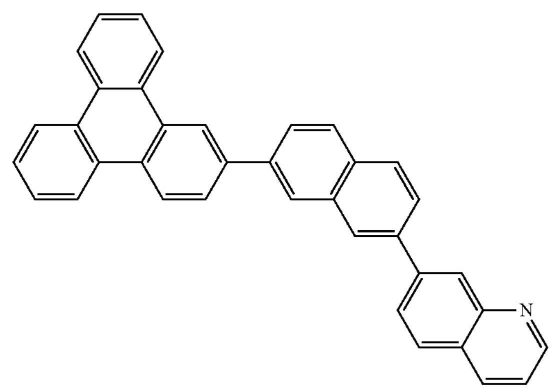
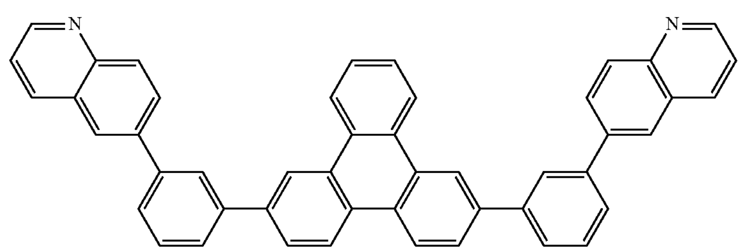
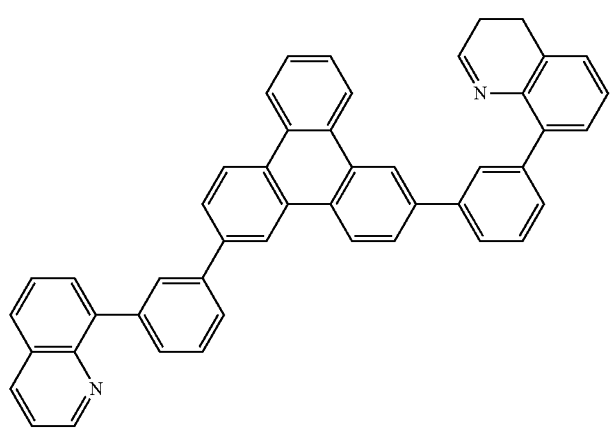

-continued
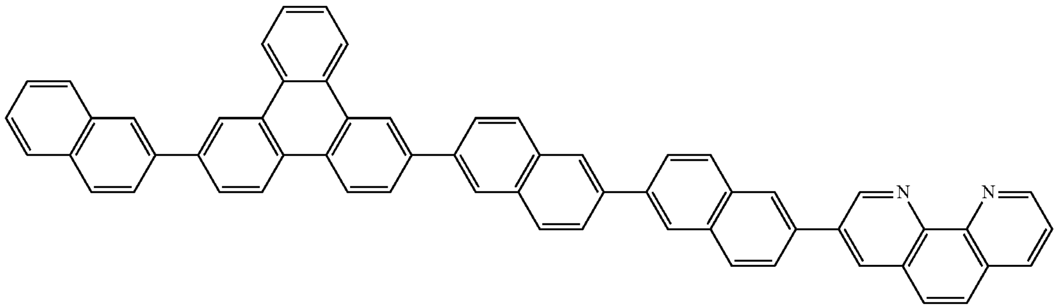
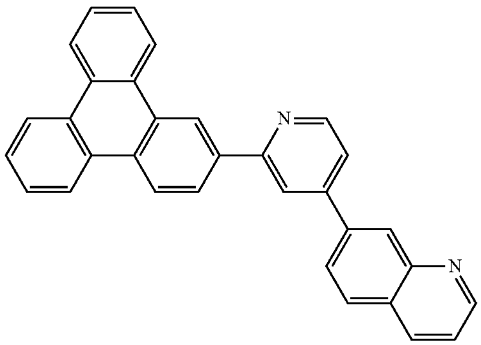
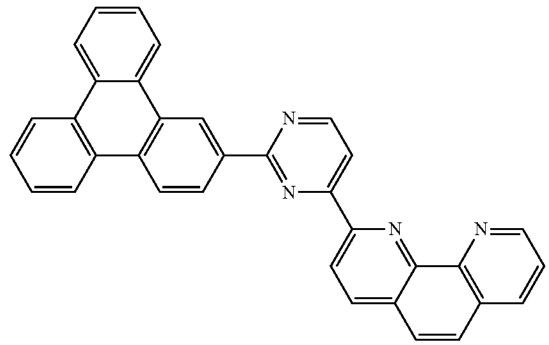
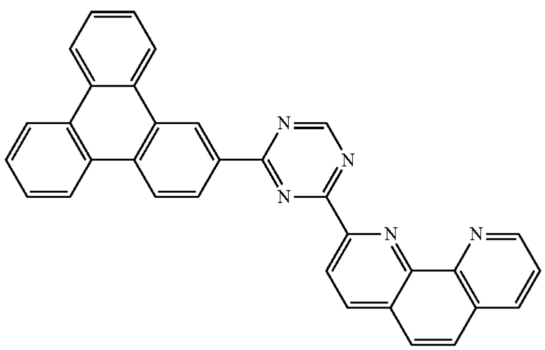
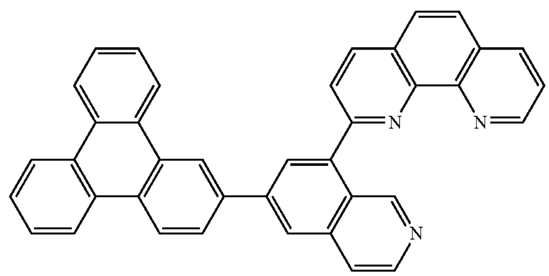
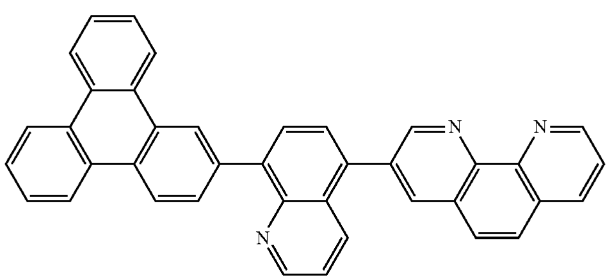
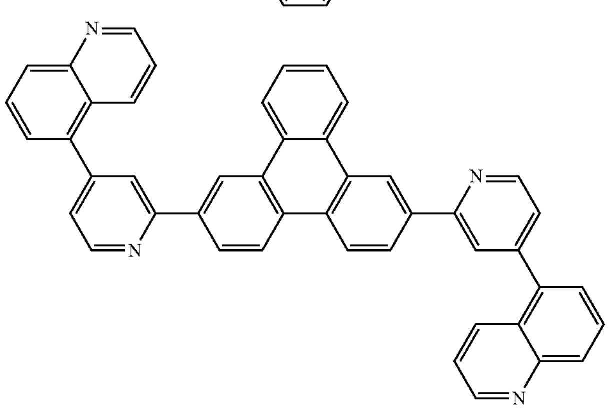
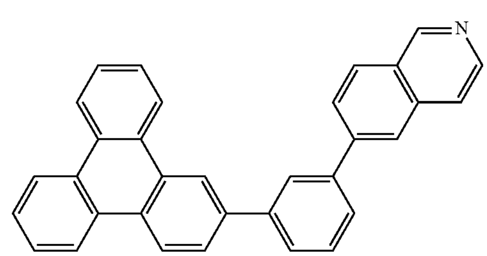

-continued
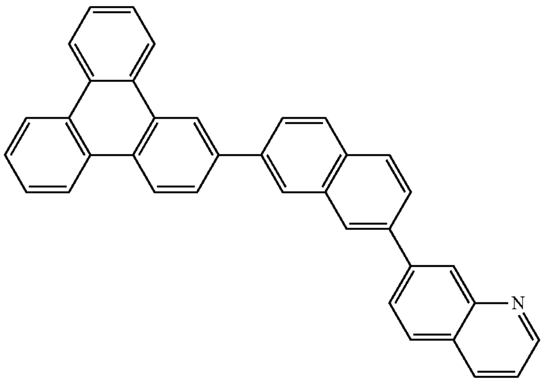
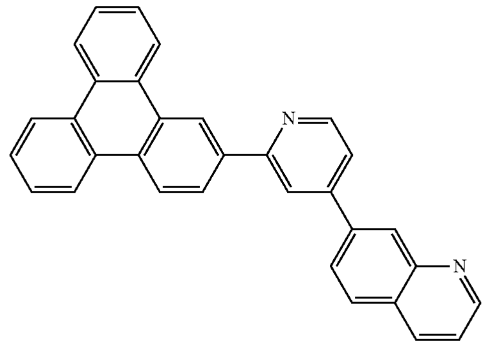
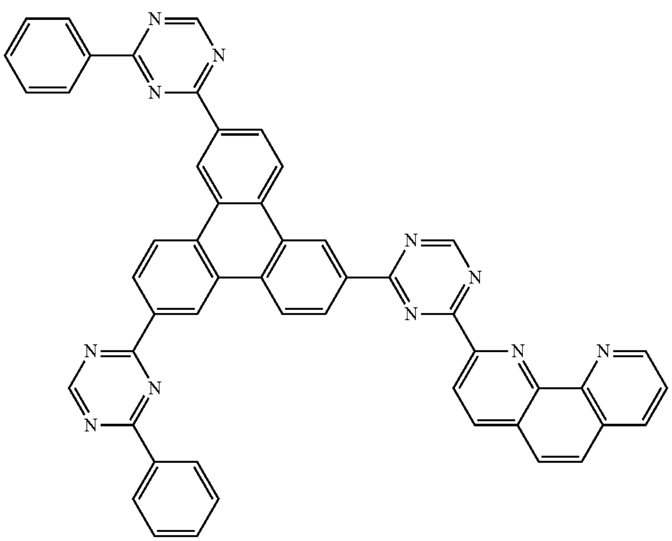
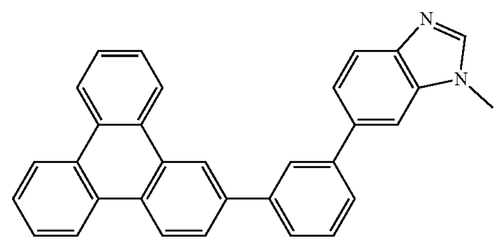
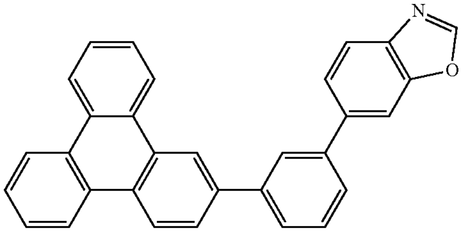
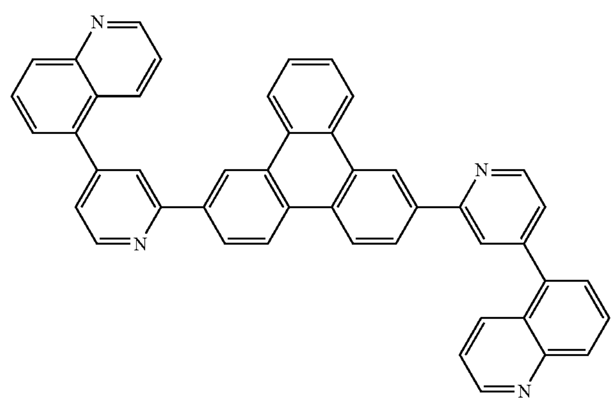
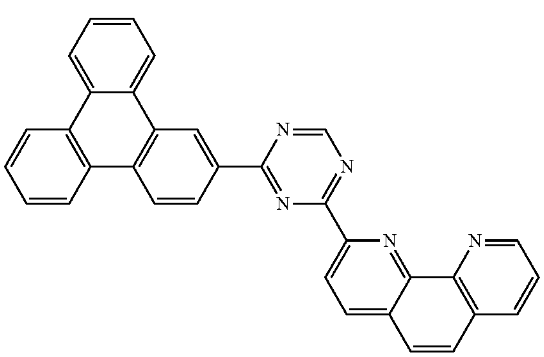

-continued
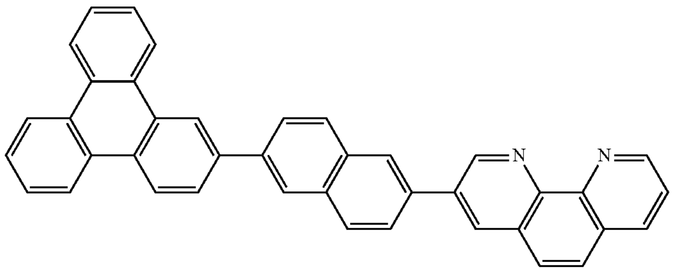
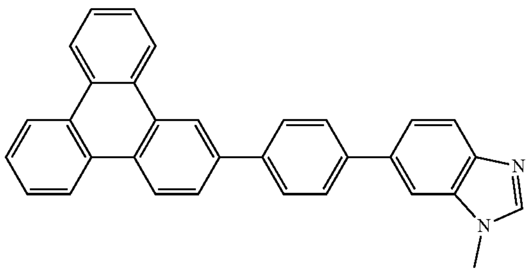
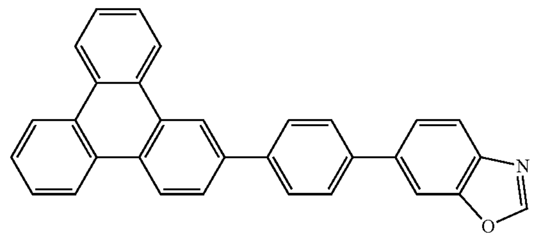
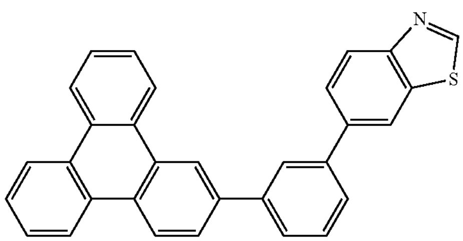
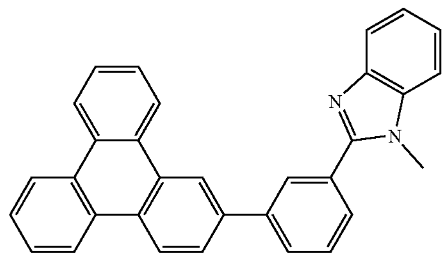
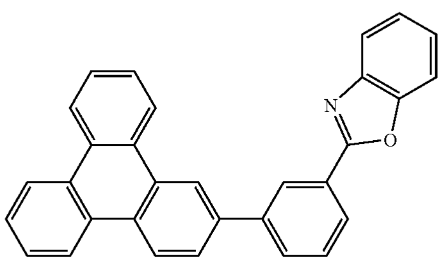
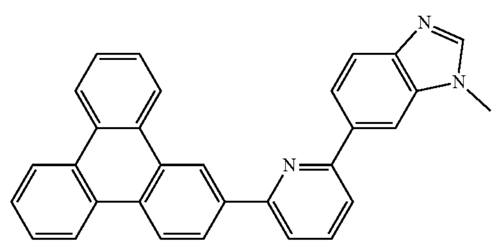
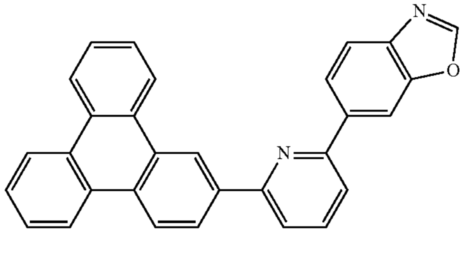
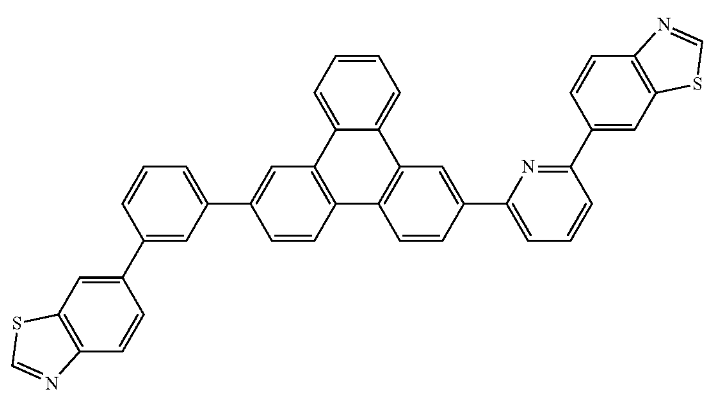

-continued
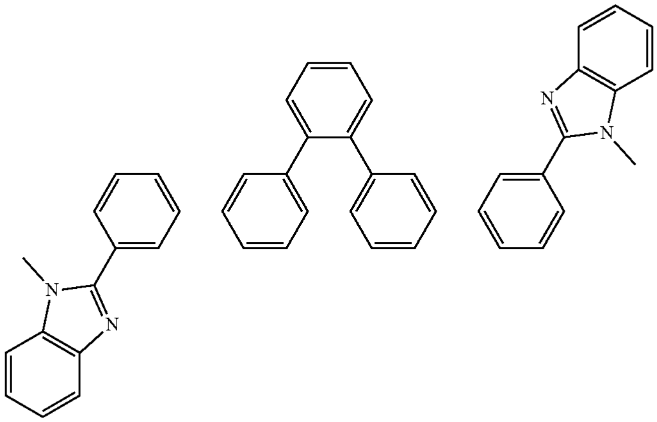
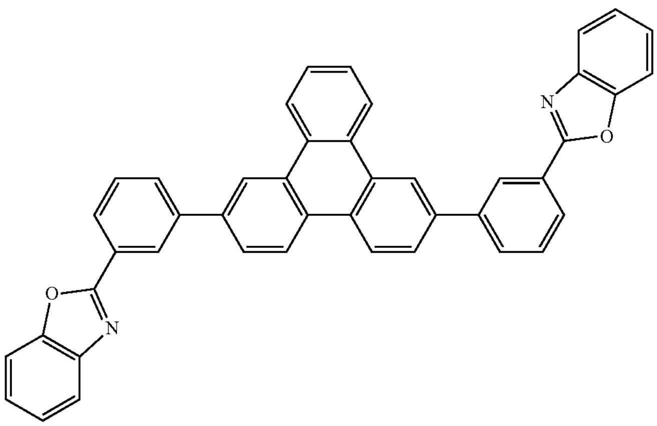
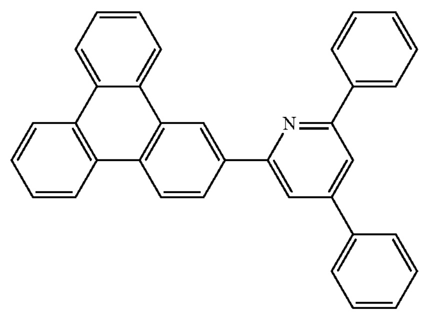
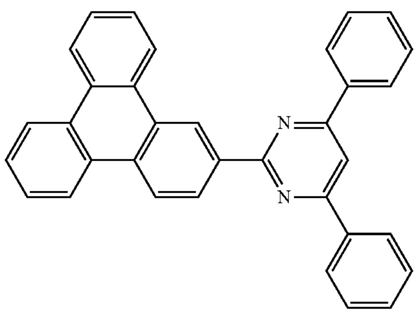
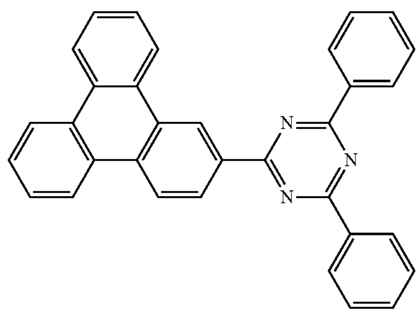
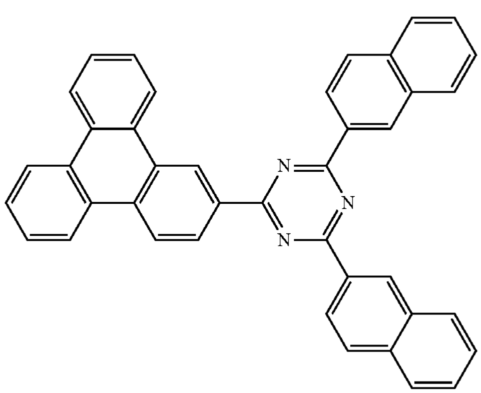
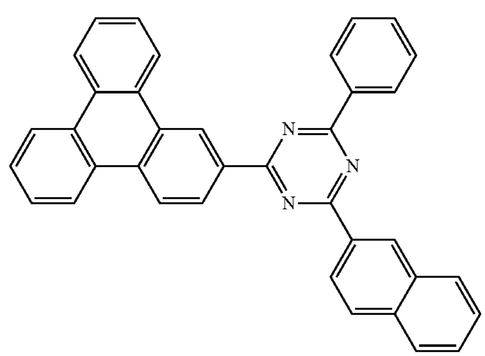

-continued
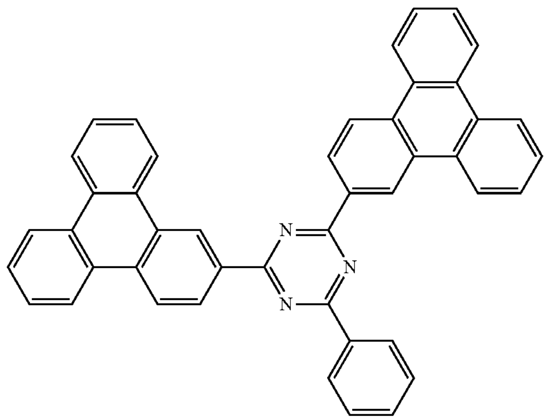
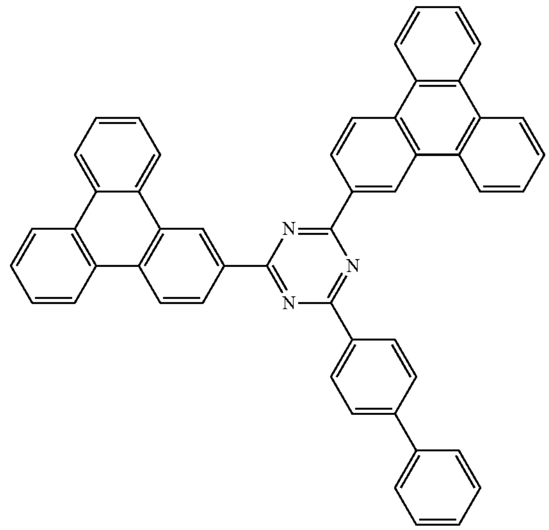
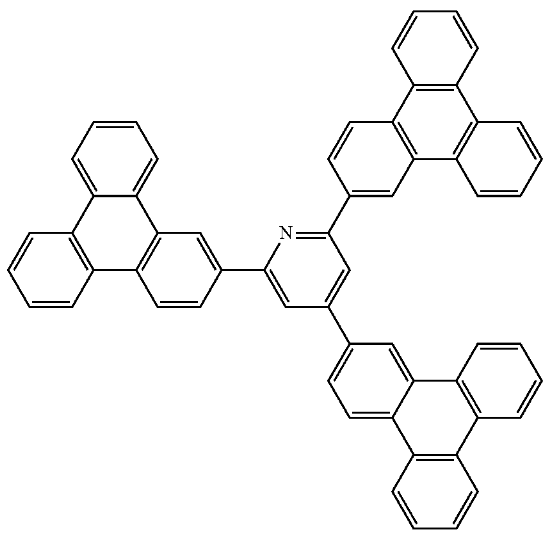
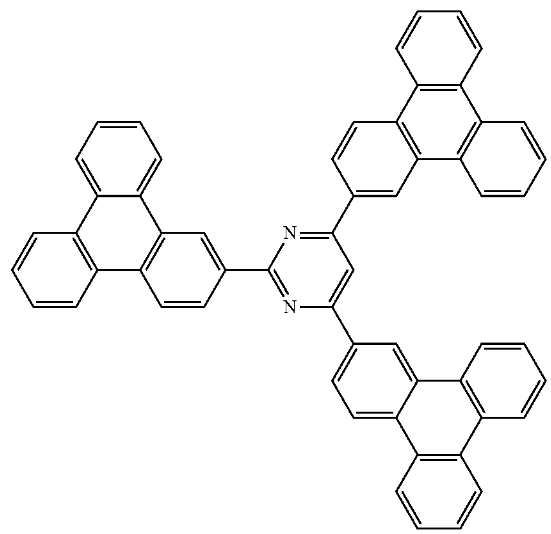
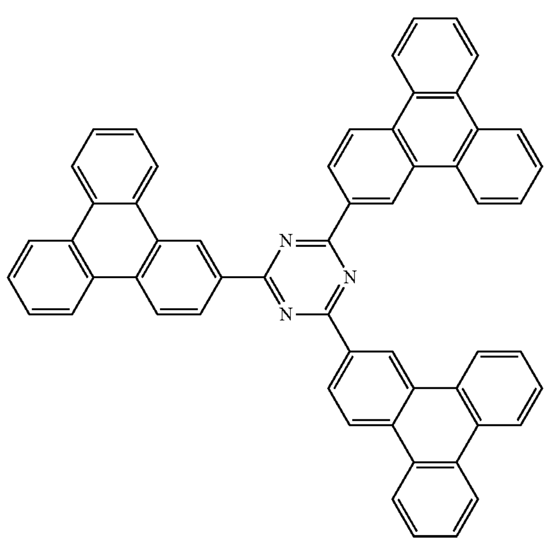
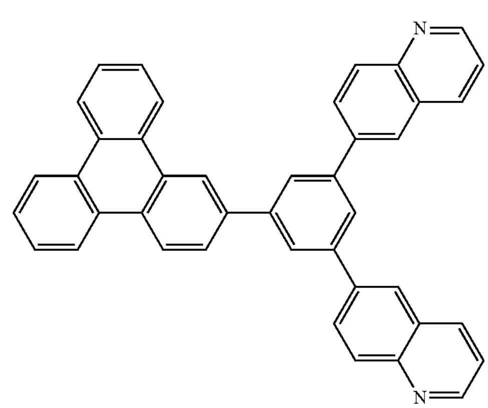

-continued
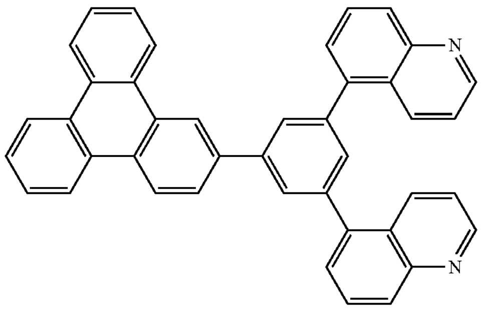
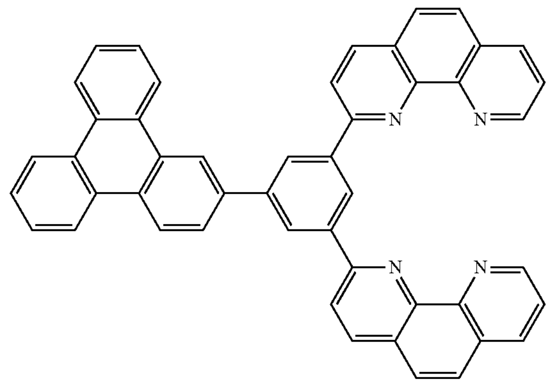
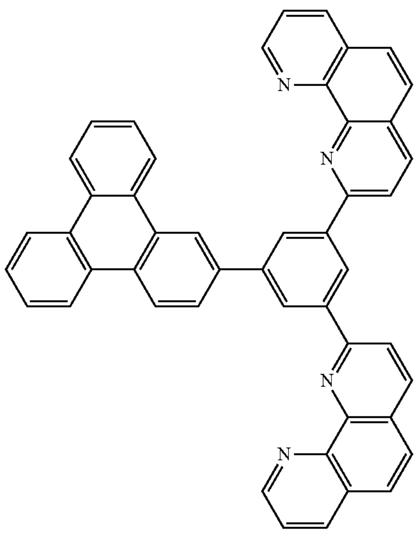
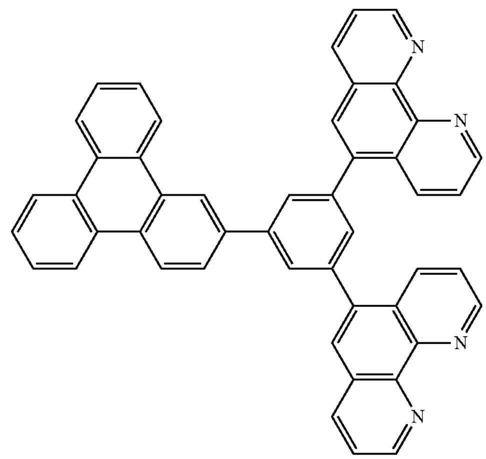
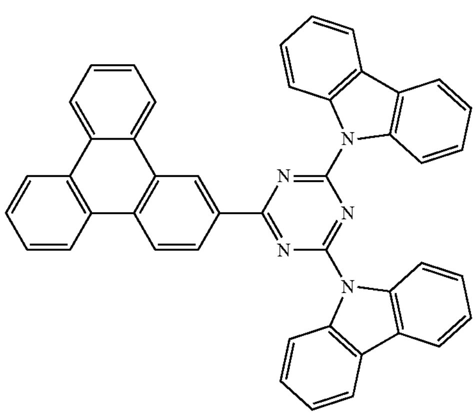
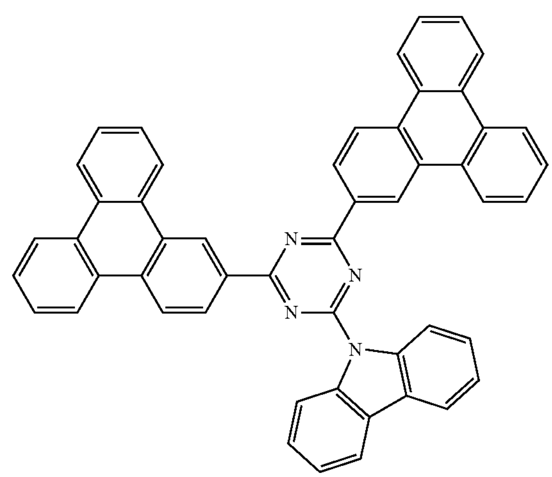

-continued
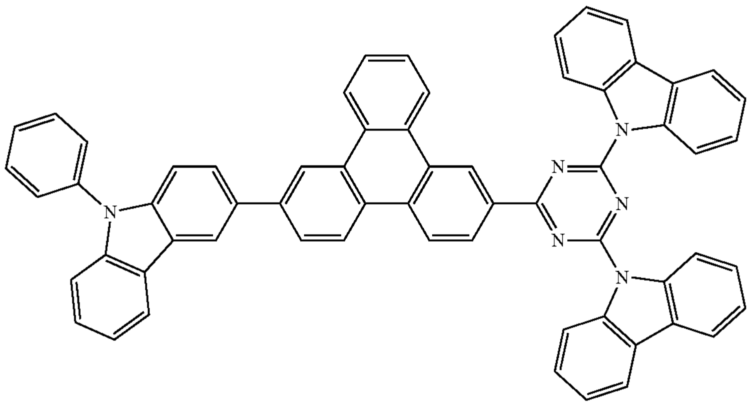
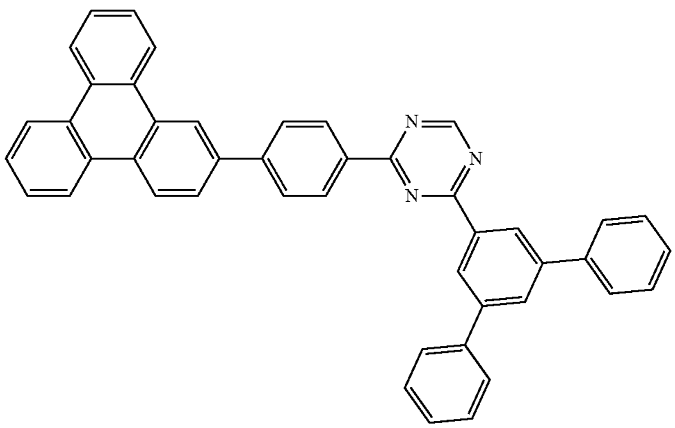
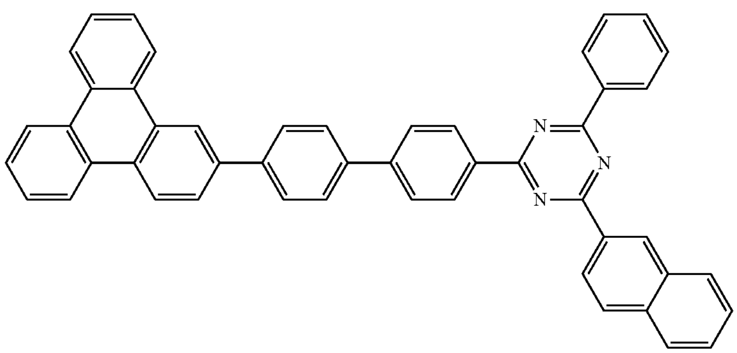
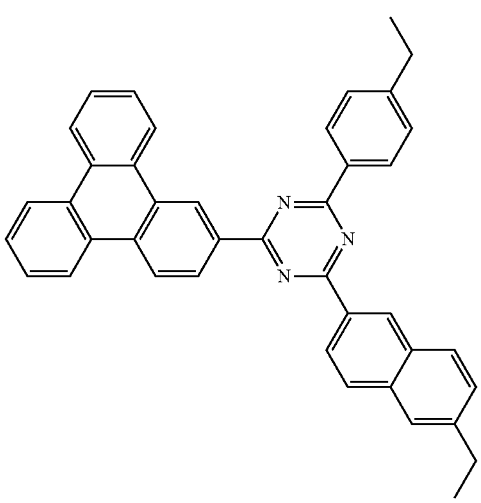
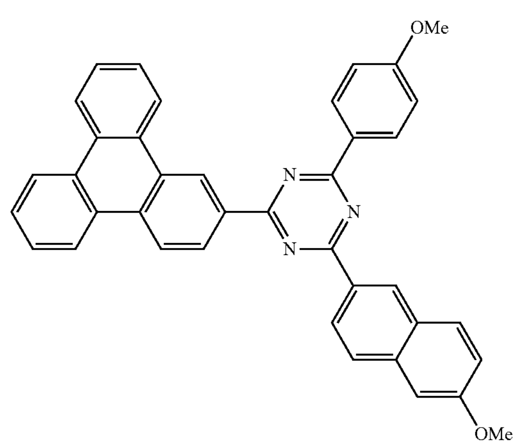

-continued
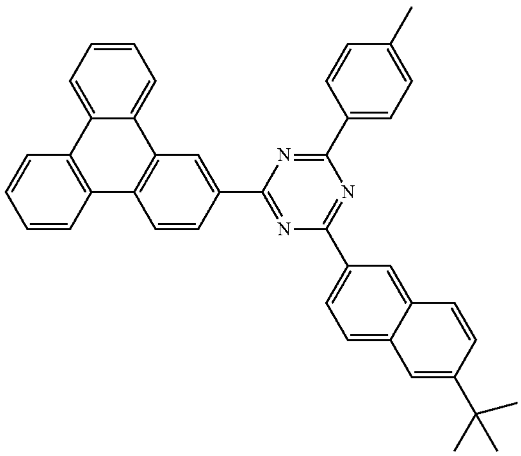
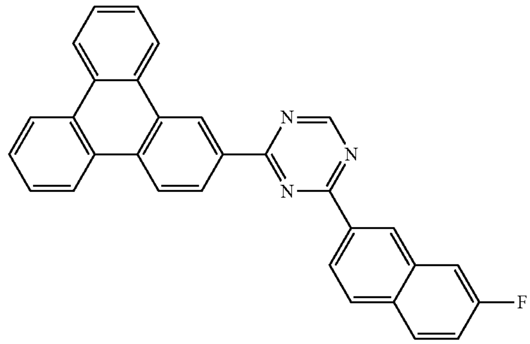
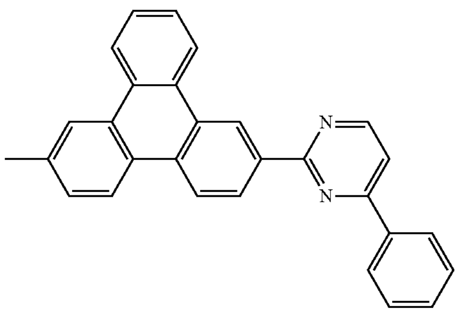
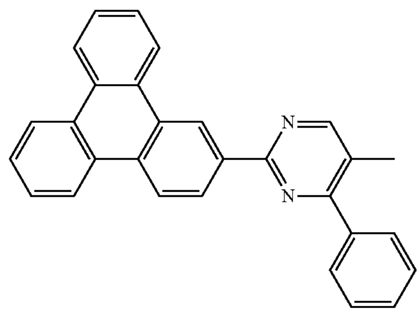
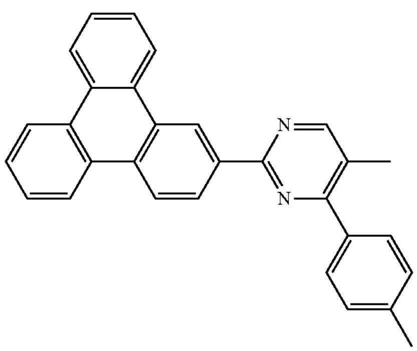
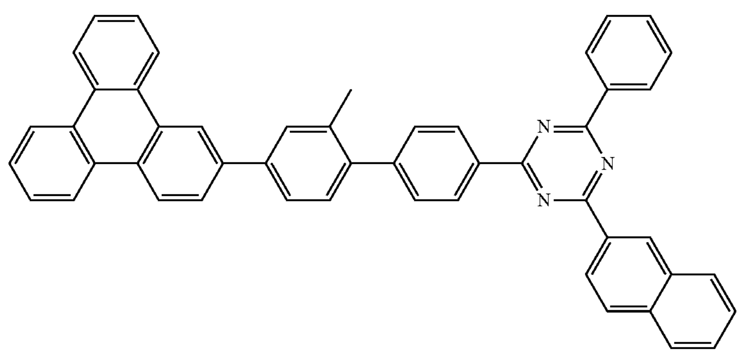
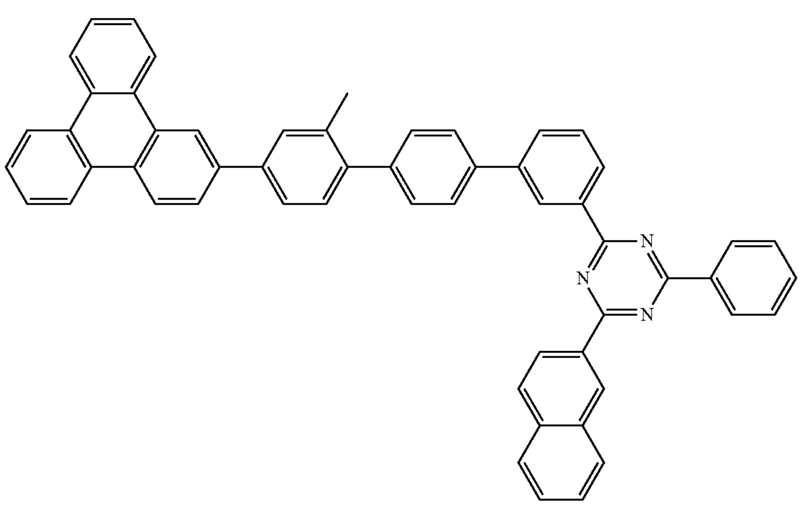

-continued
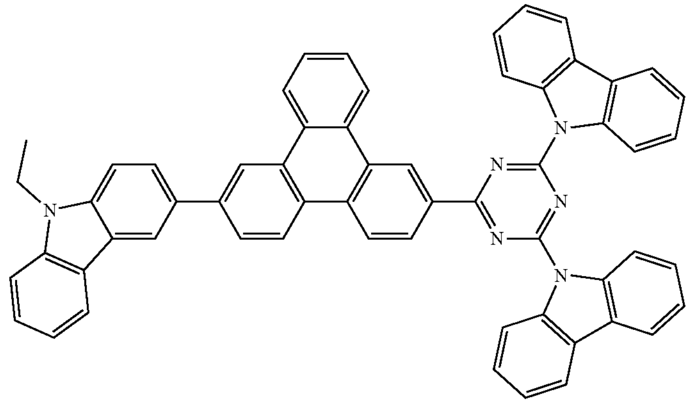
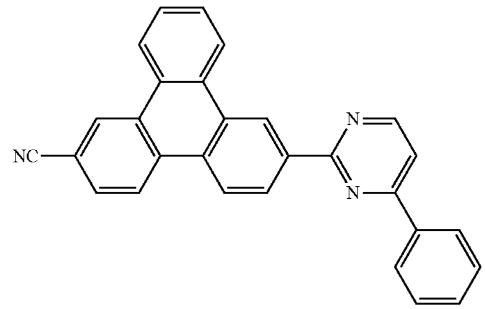
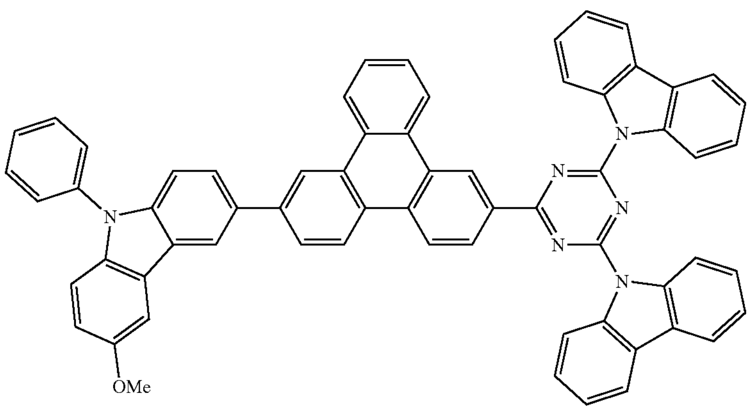
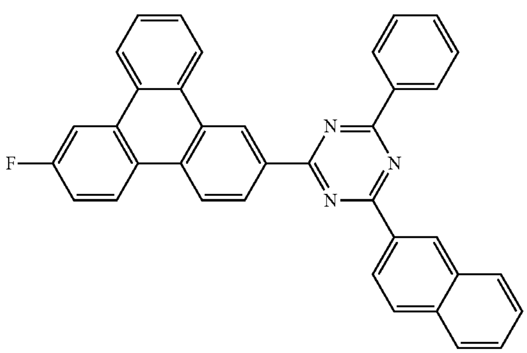
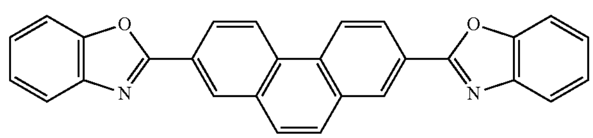
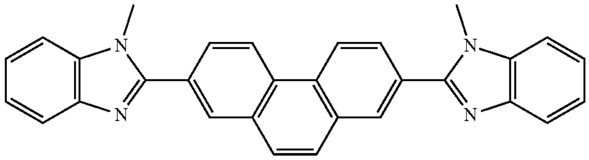
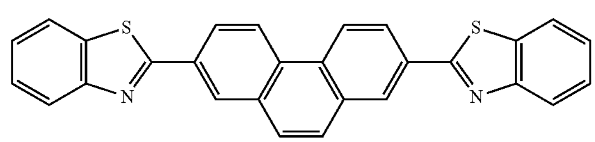
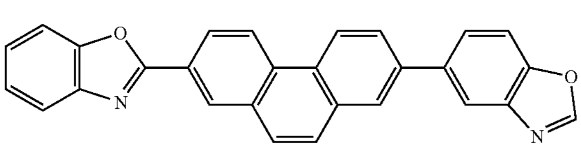
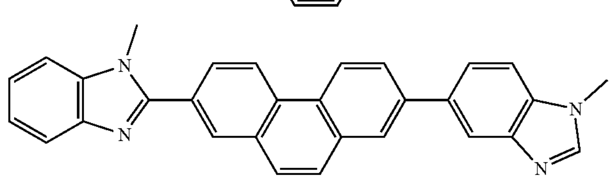
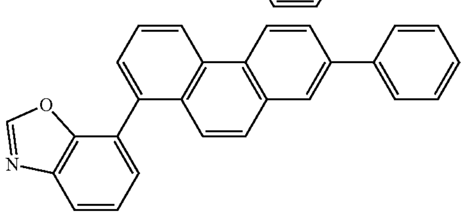
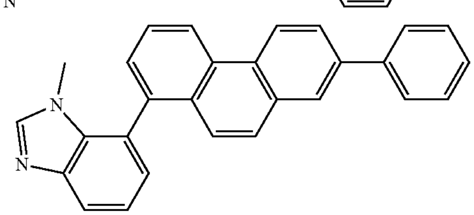

-continued
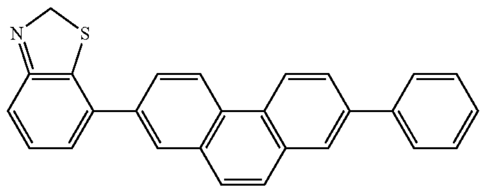
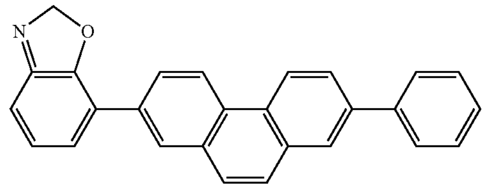
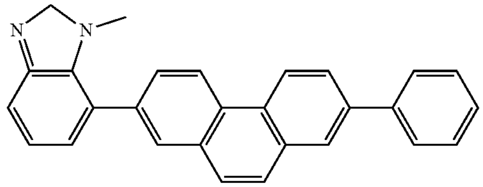
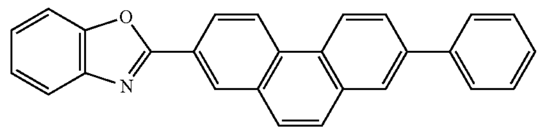
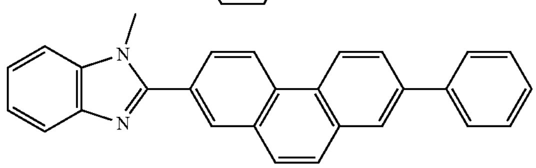
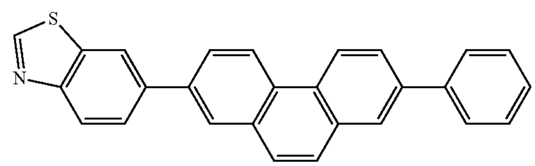
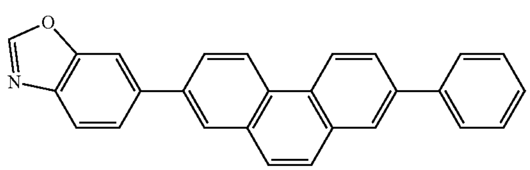
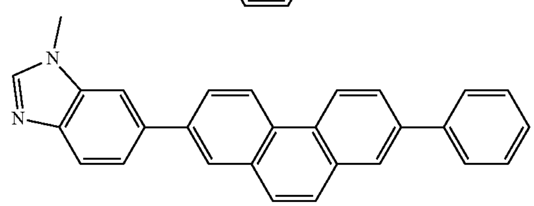
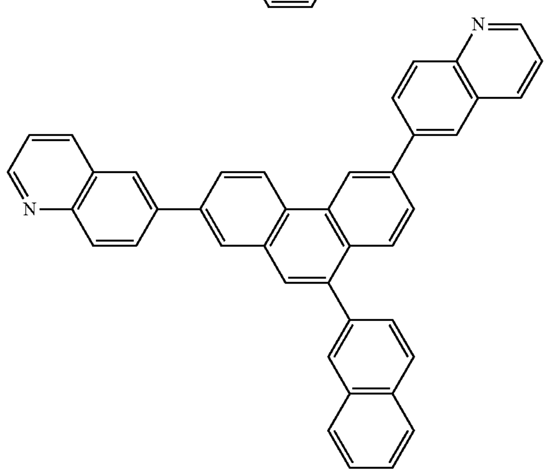
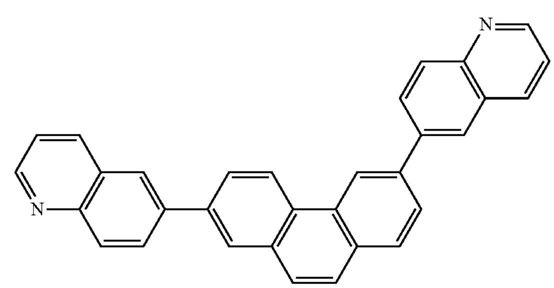
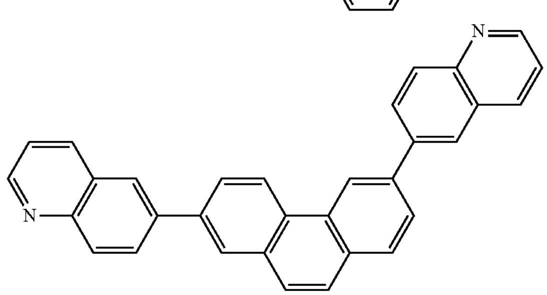
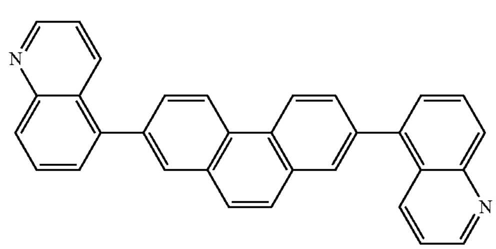
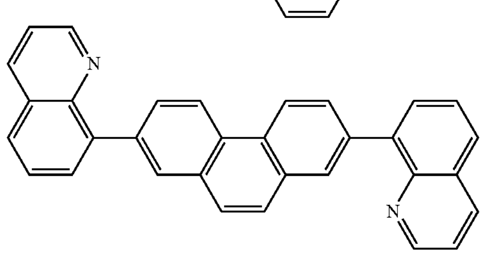
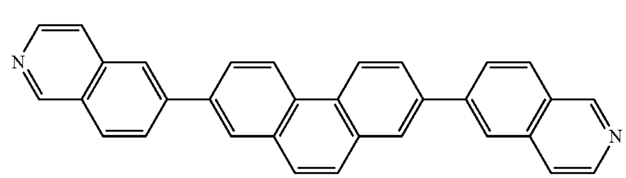

-continued
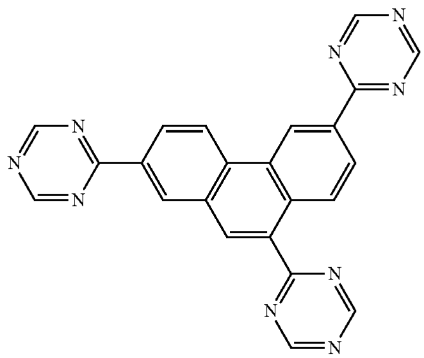
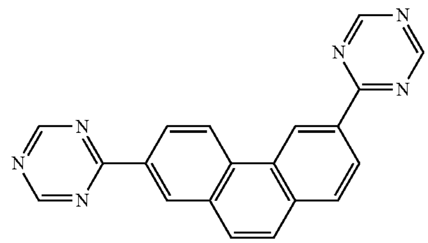
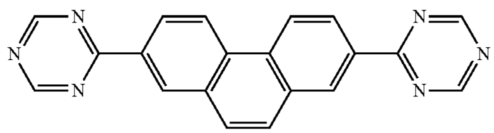
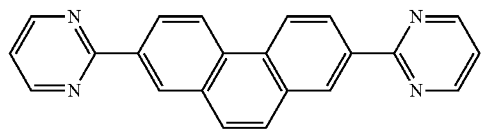
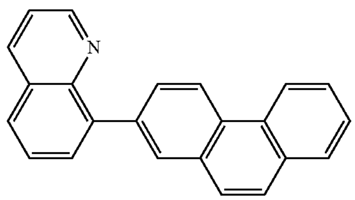
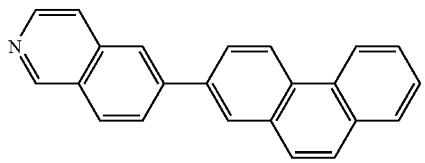
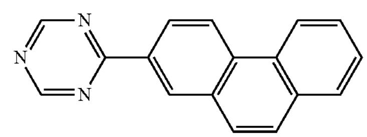
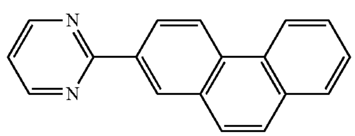
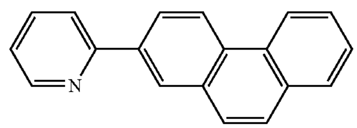
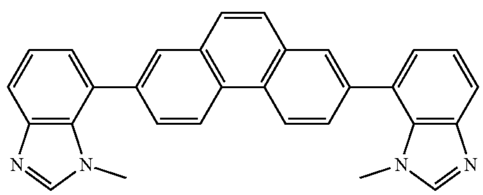
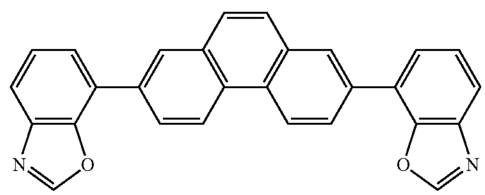
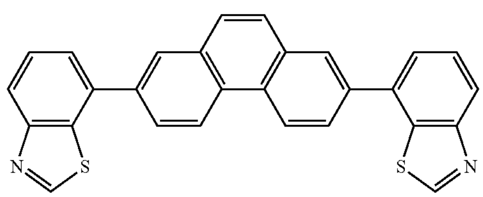
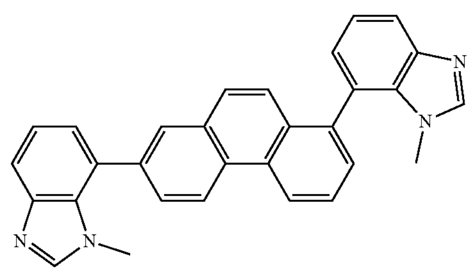
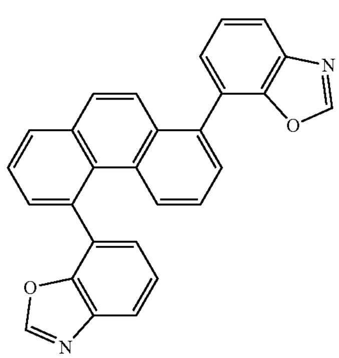
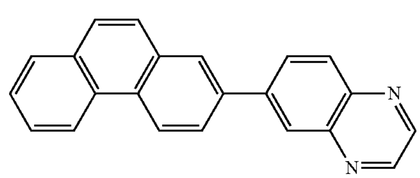

-continued
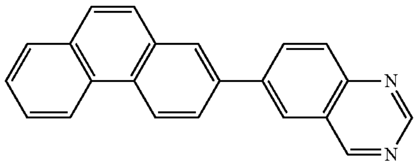
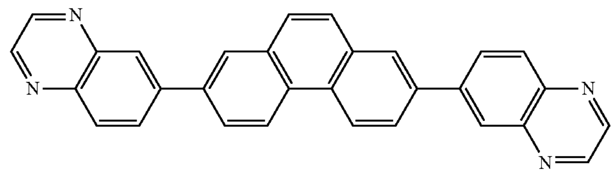
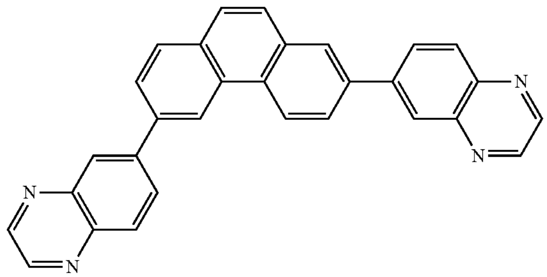
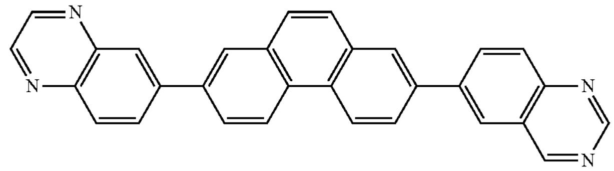
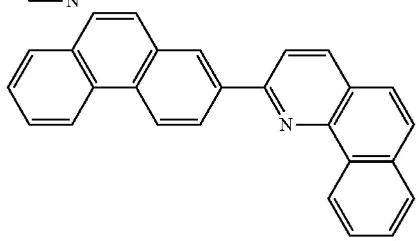
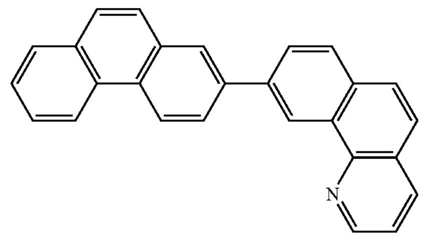
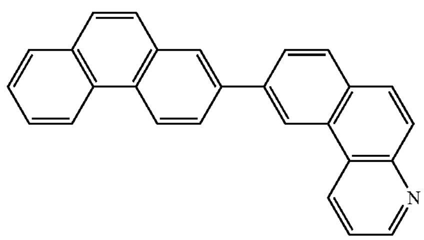
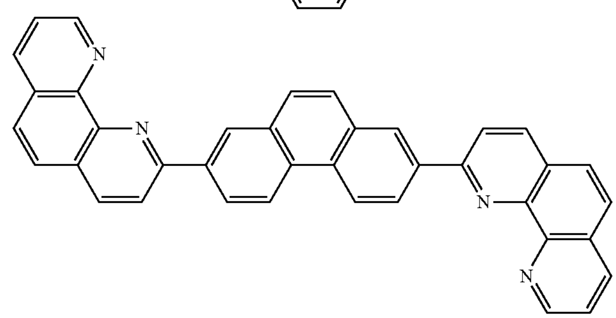
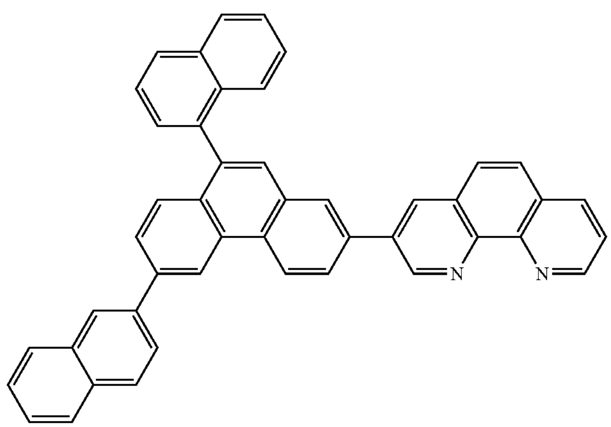
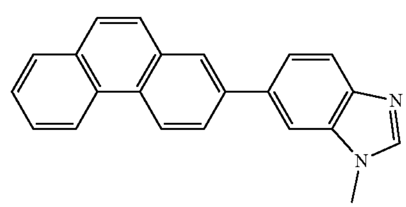
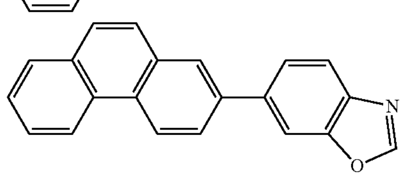
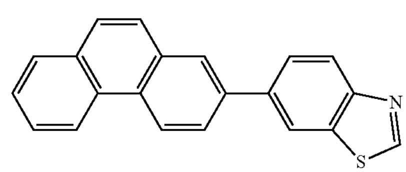
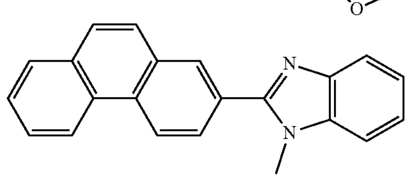
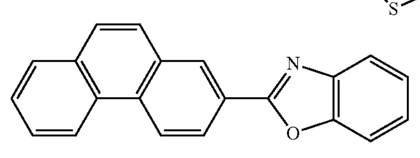

-continued
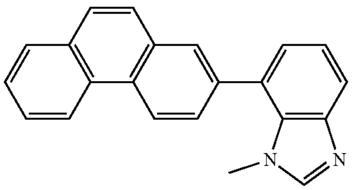
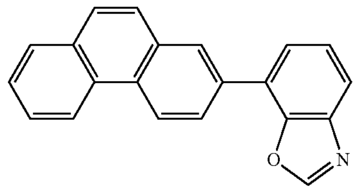
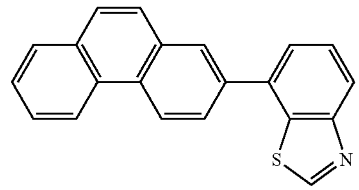
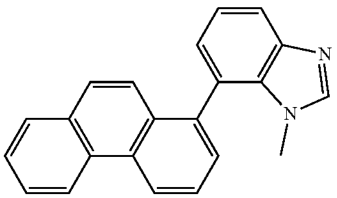
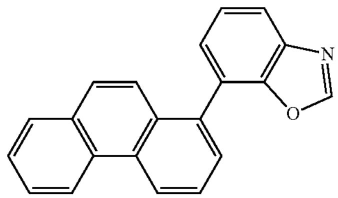
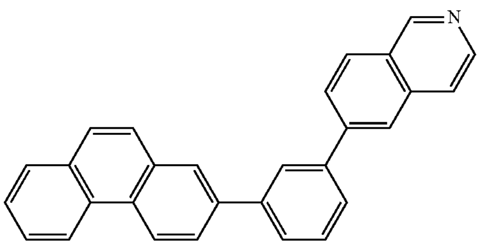
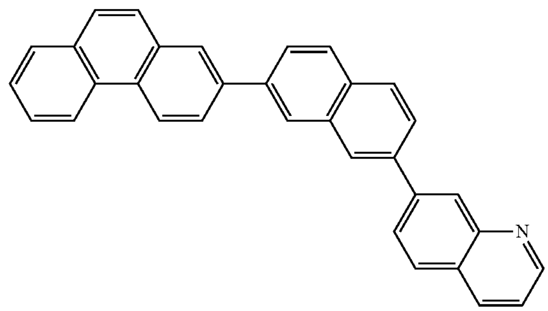
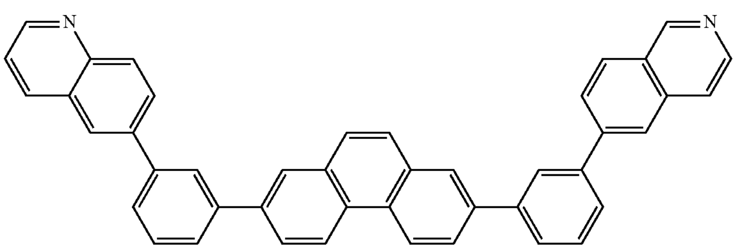
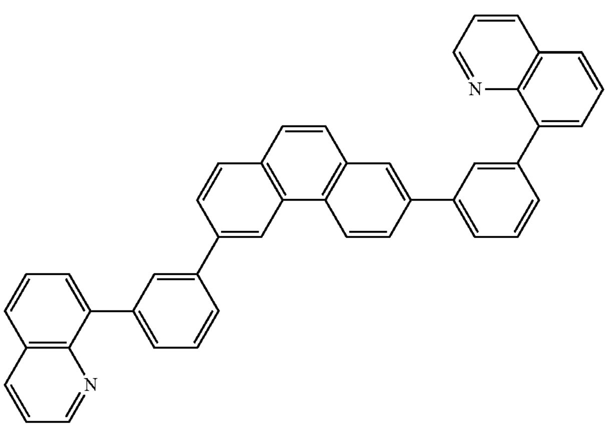
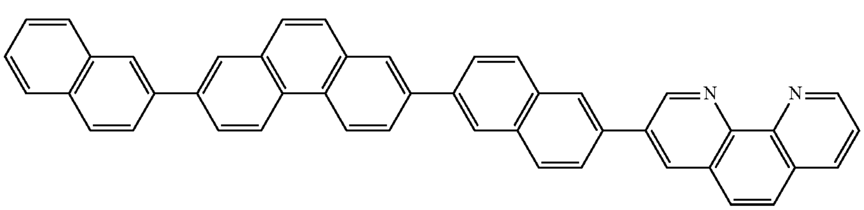 [SMILES: c1ccc2cc(-c3ccc4c(ccc5cc(-c6ccc7cc(-c8cnc9c(ccc%10cccnc%109)c8)ccc7c6)ccc54)c3)ccc2c1]

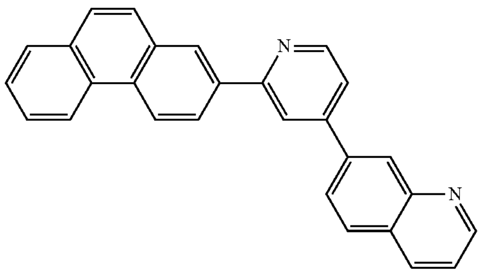
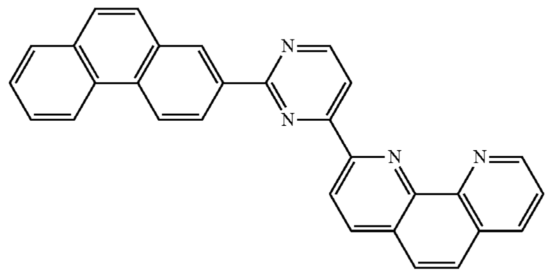
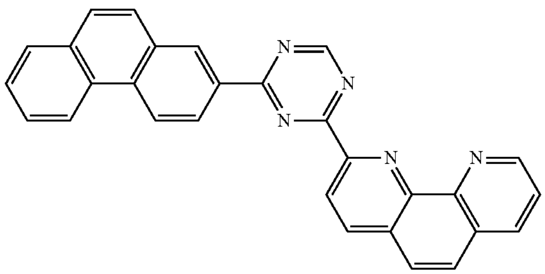
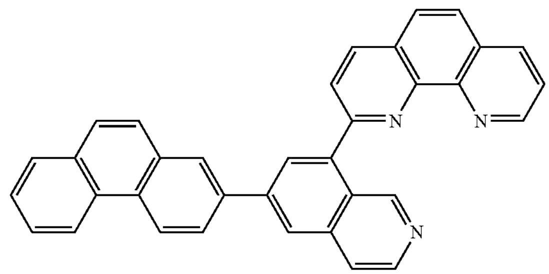
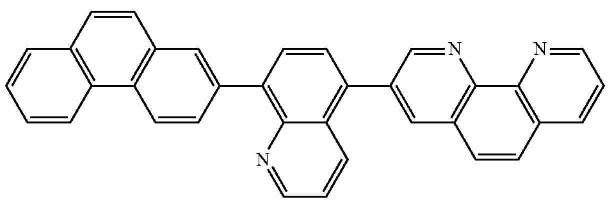
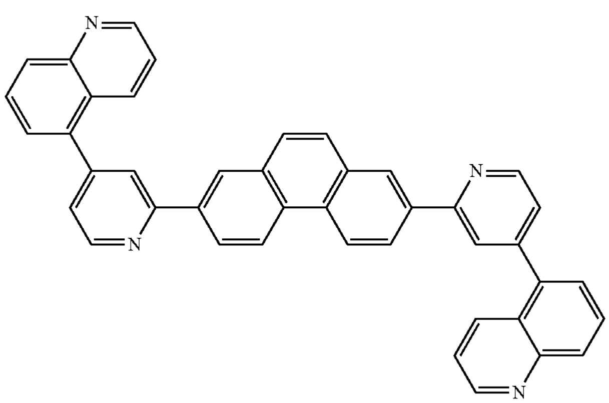
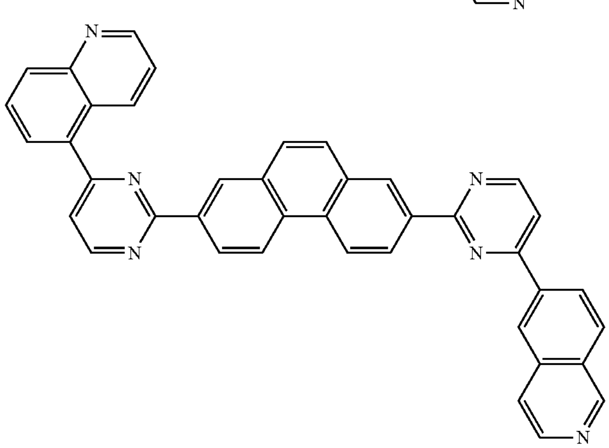

-continued
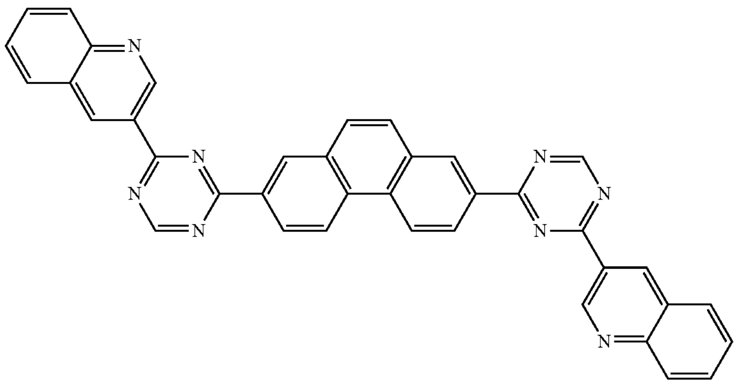
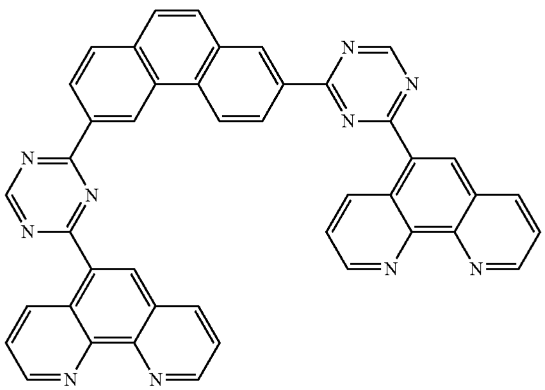
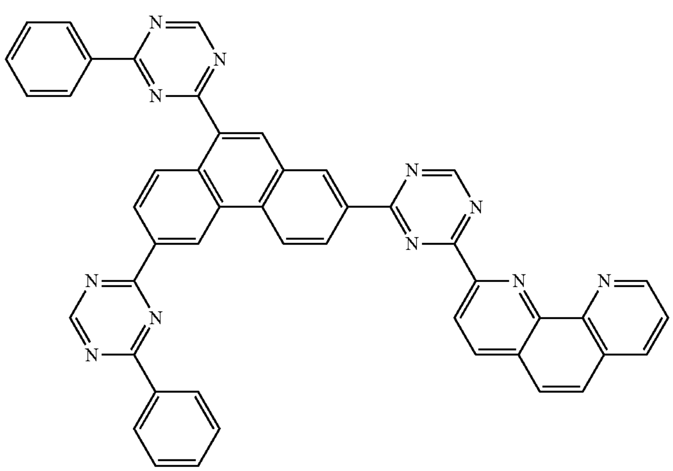
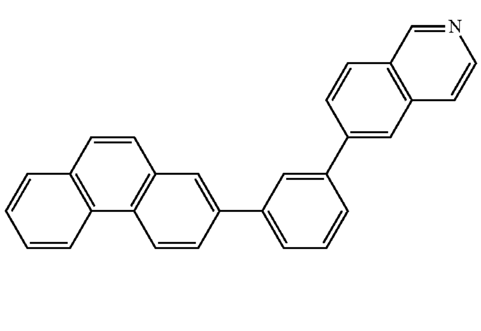
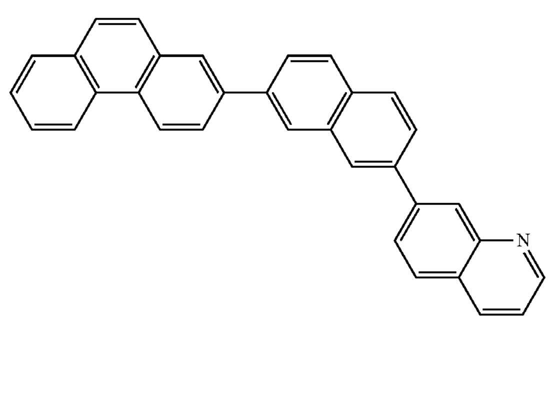

-continued
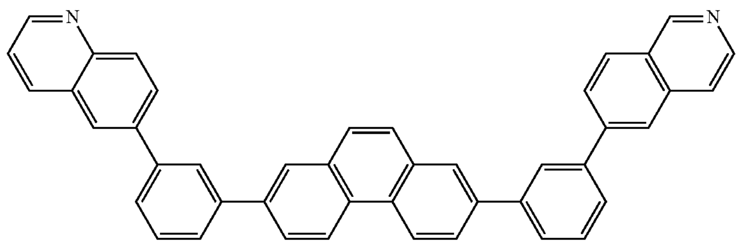
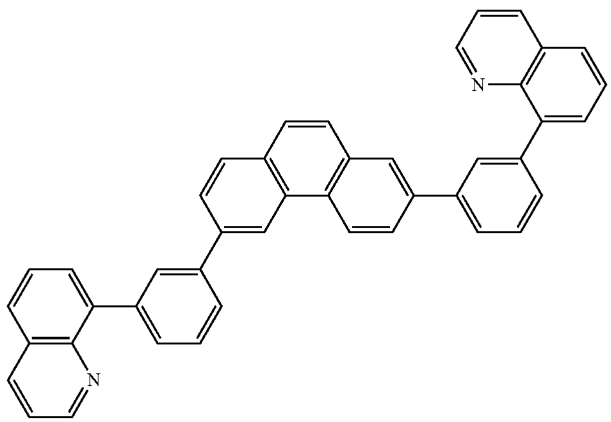
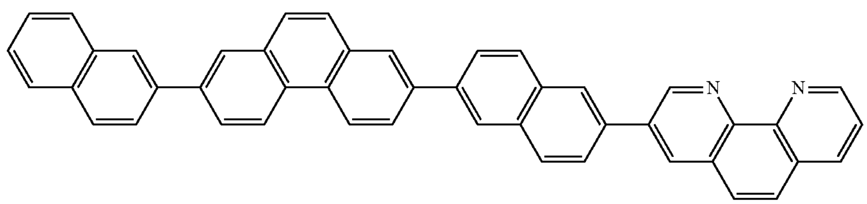
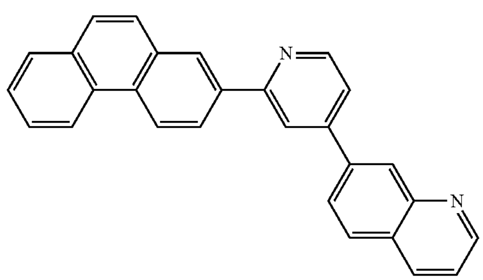
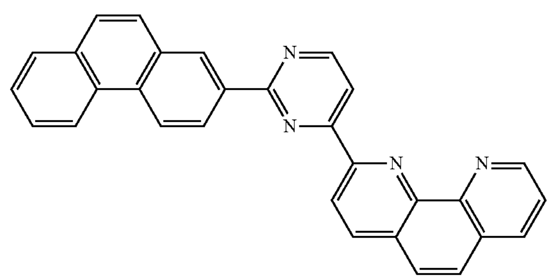
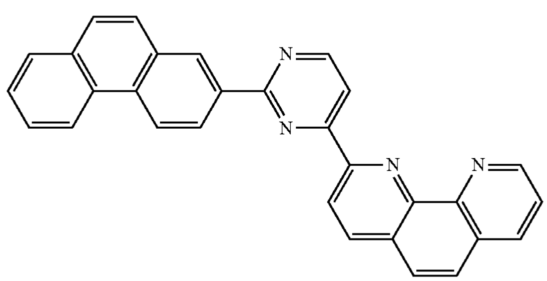
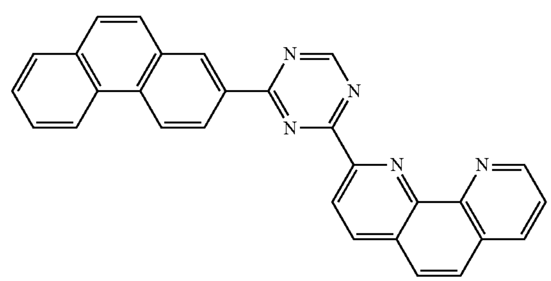
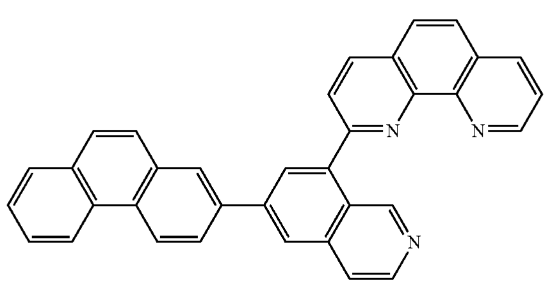
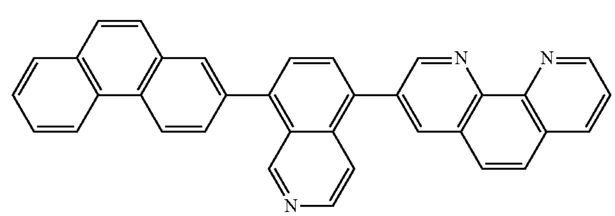

-continued
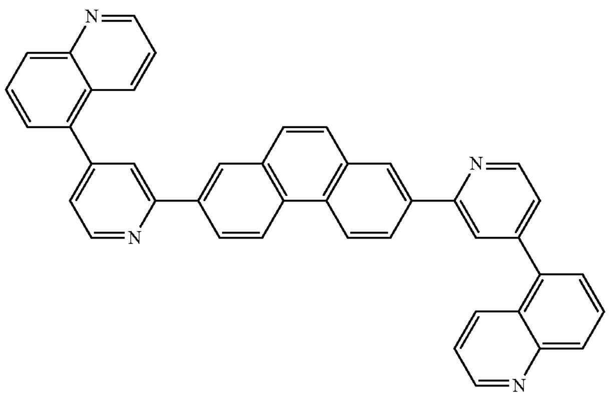
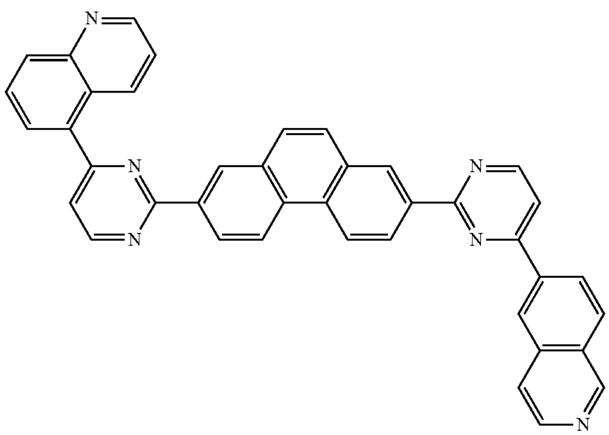
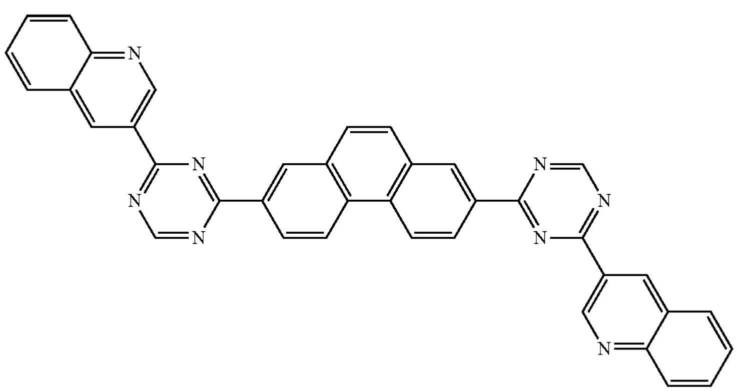
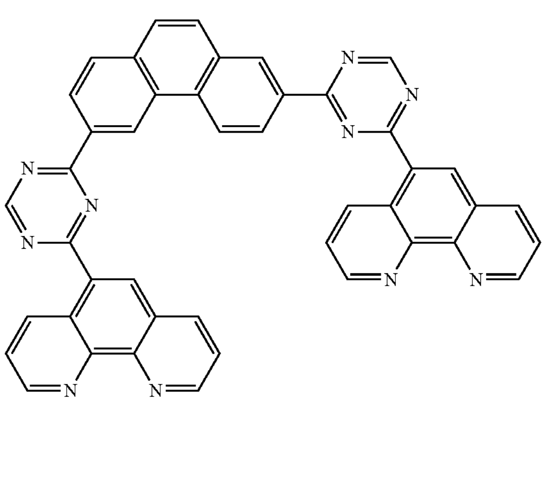

-continued
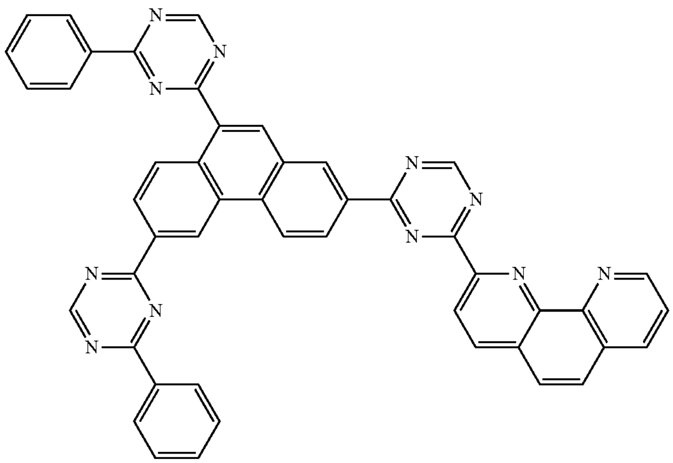
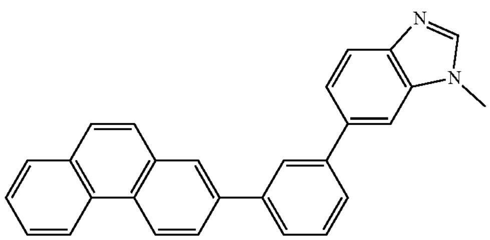
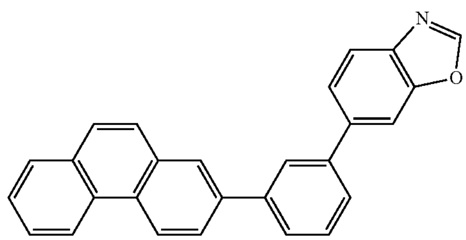
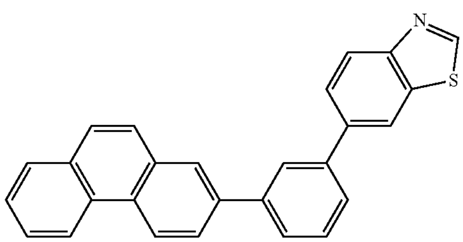
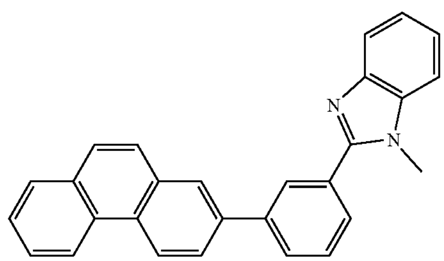
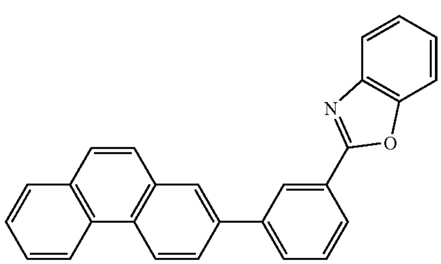
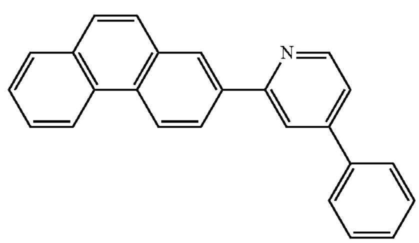
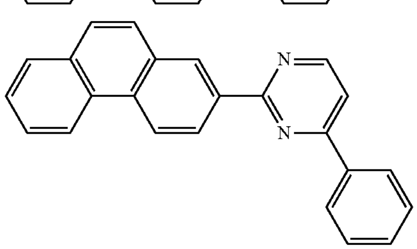
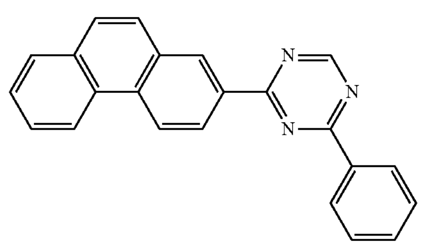
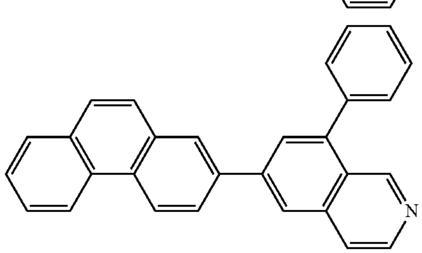
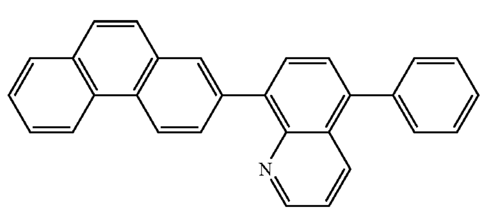

-continued
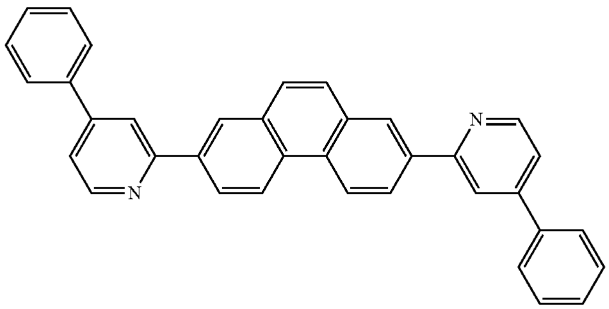
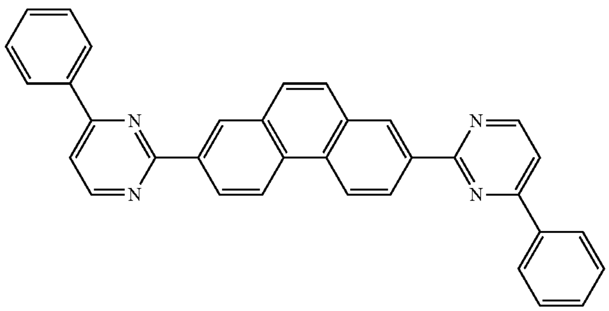
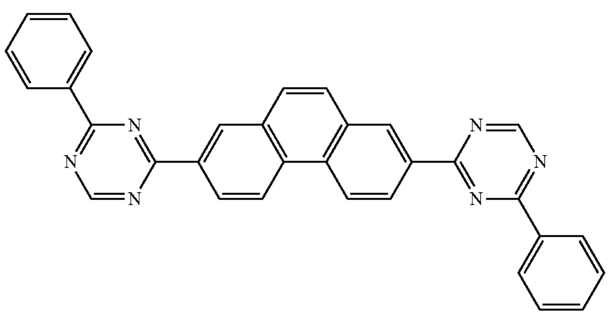
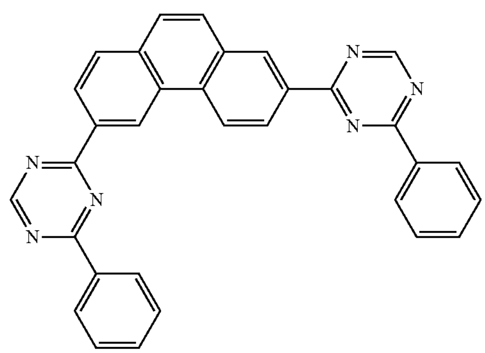
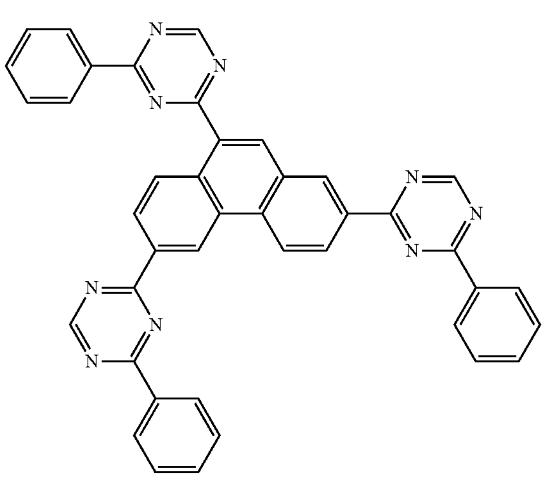
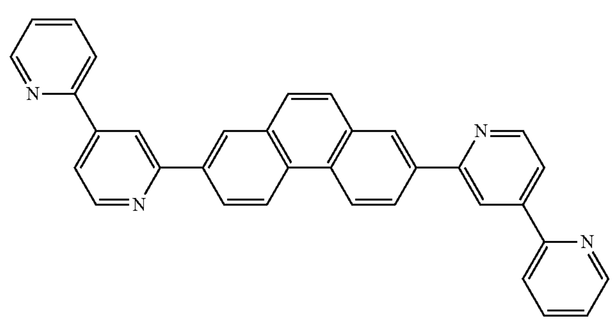

-continued
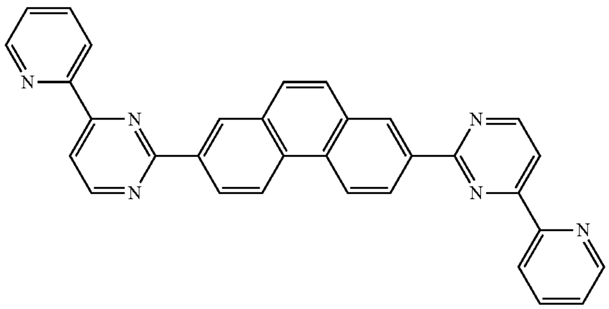
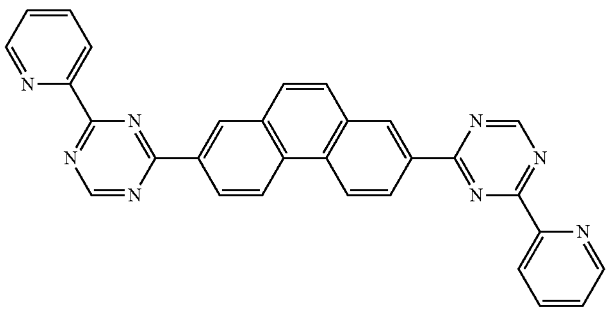
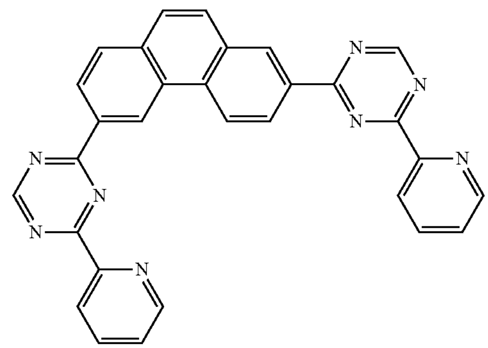
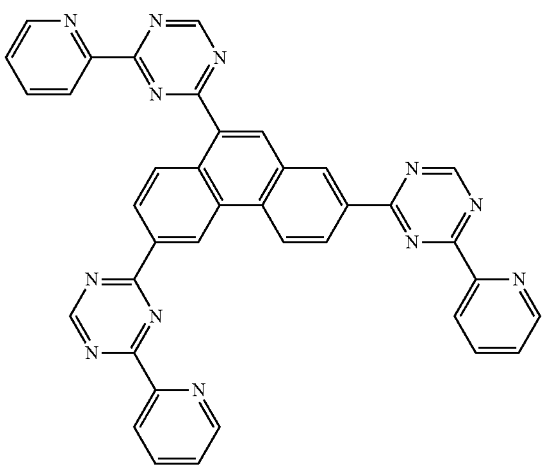
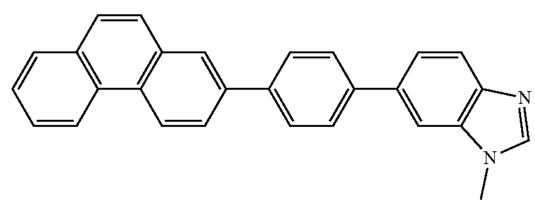
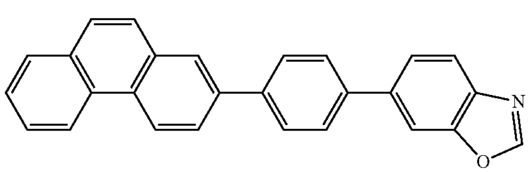
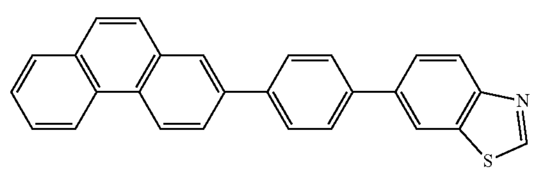
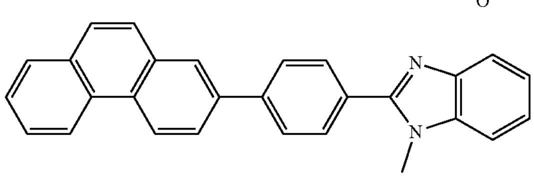
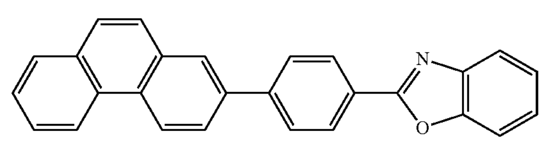
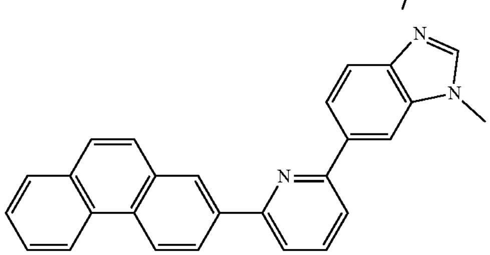
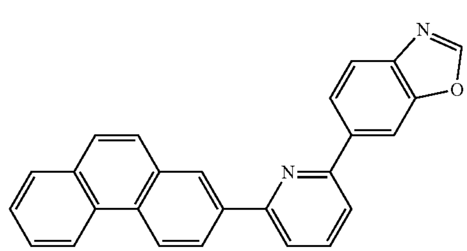

-continued
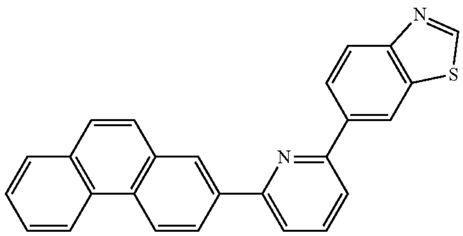
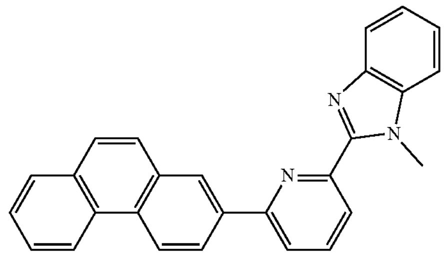
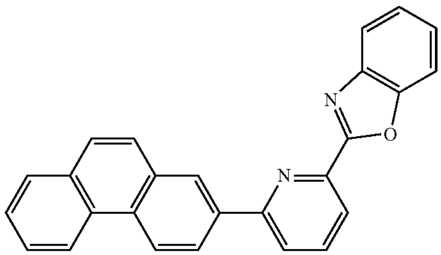
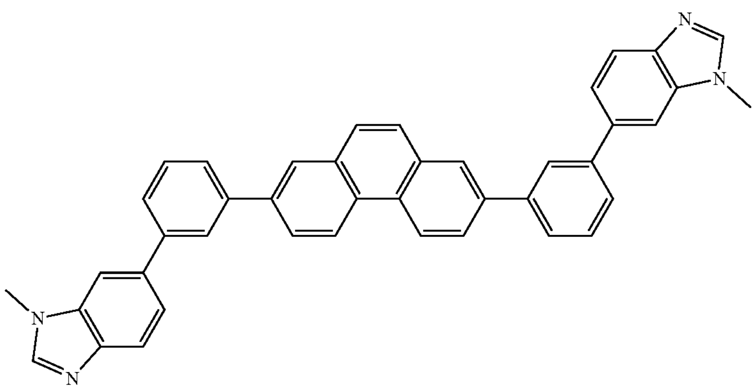
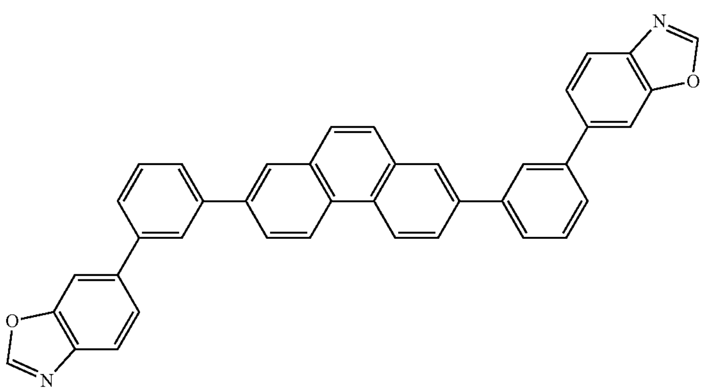
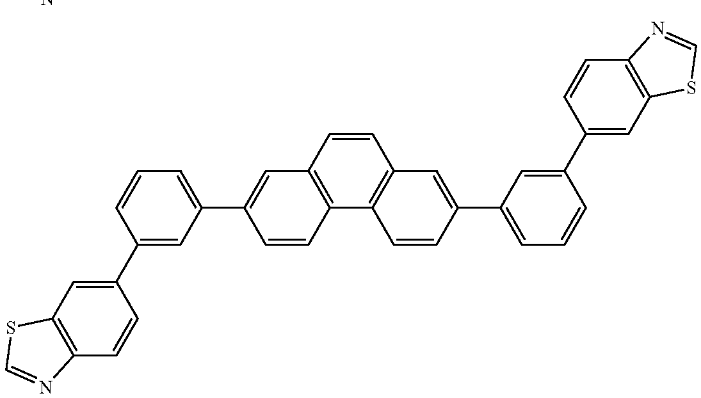

-continued
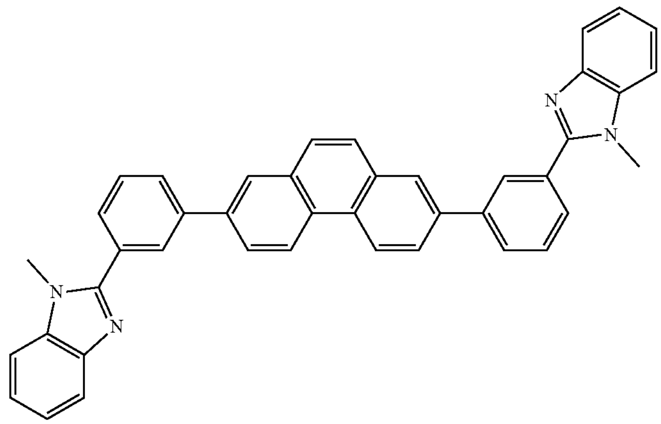
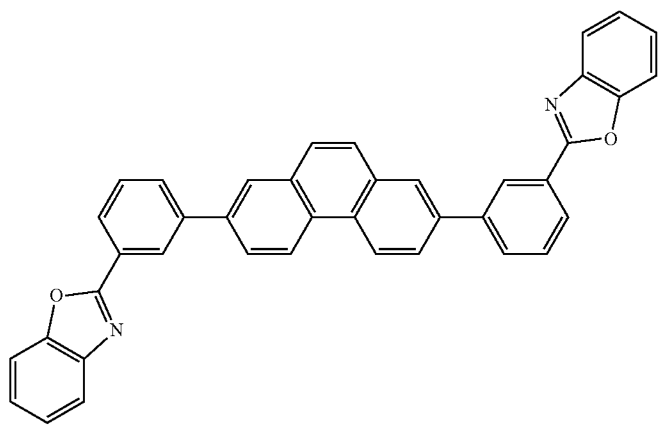
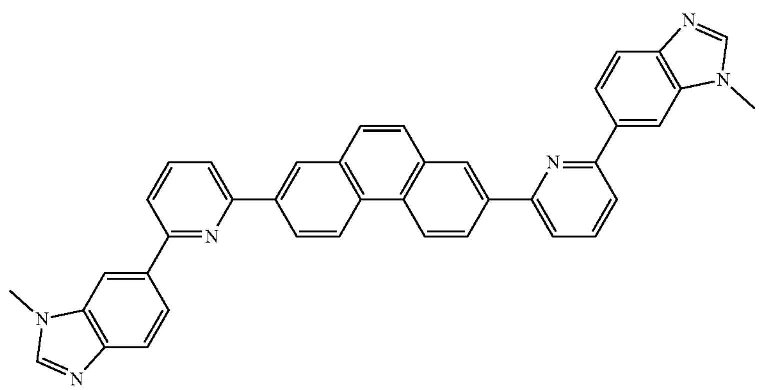
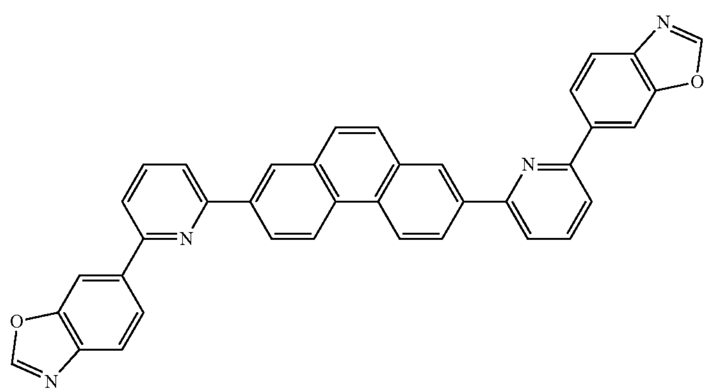

-continued
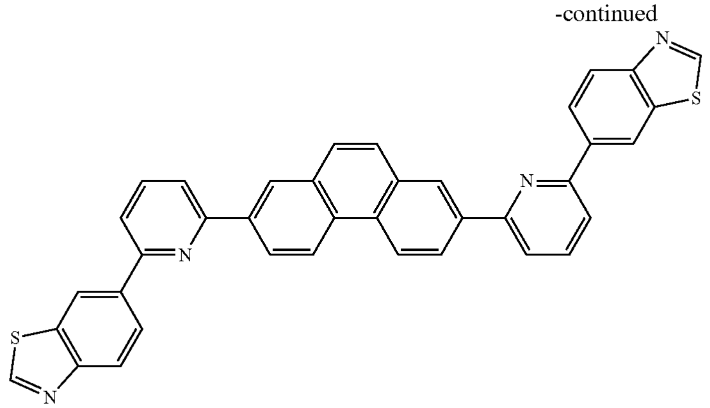
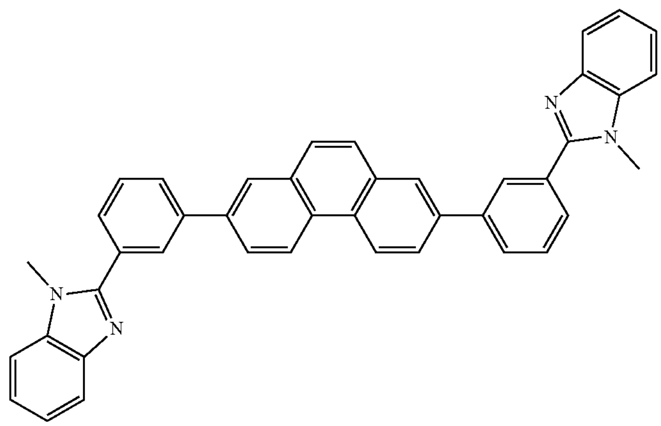
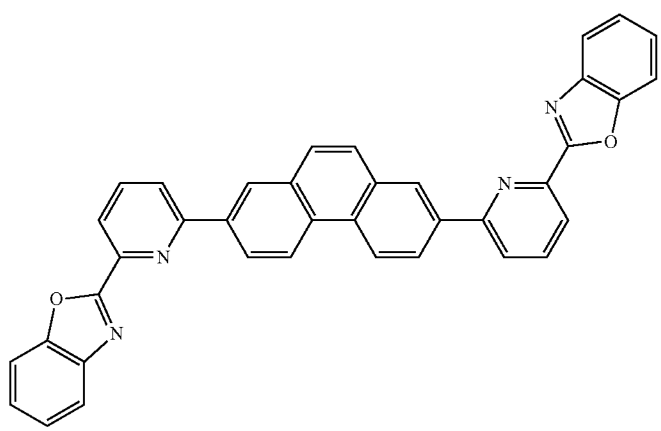
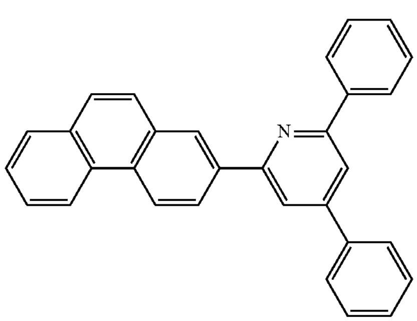
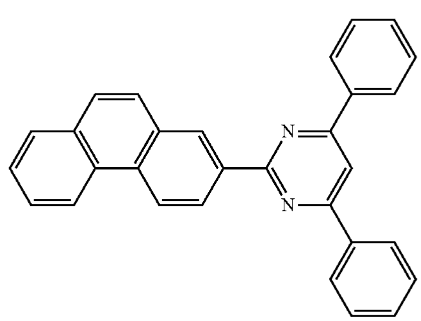

-continued
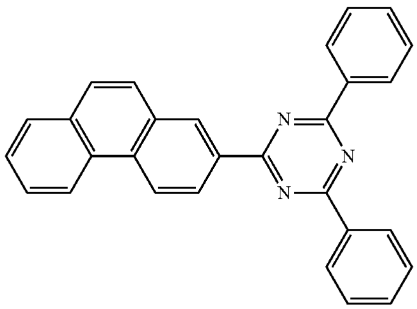
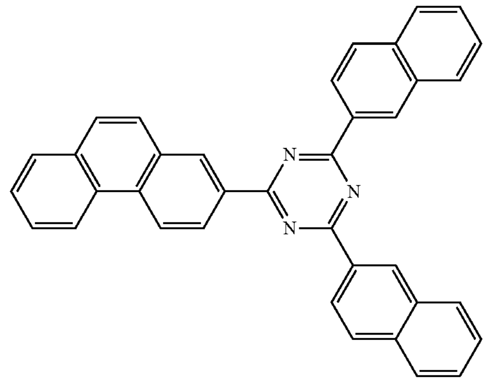
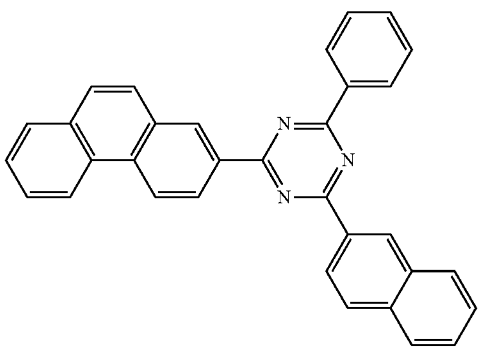
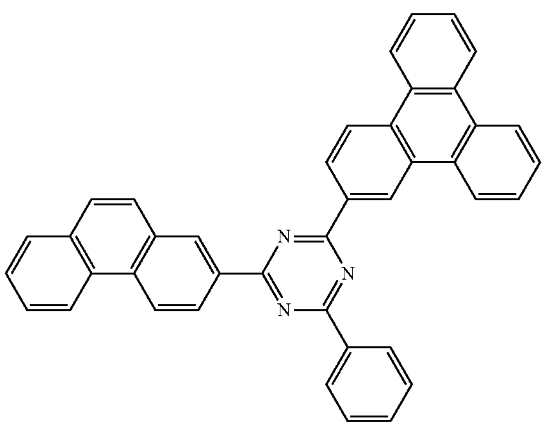
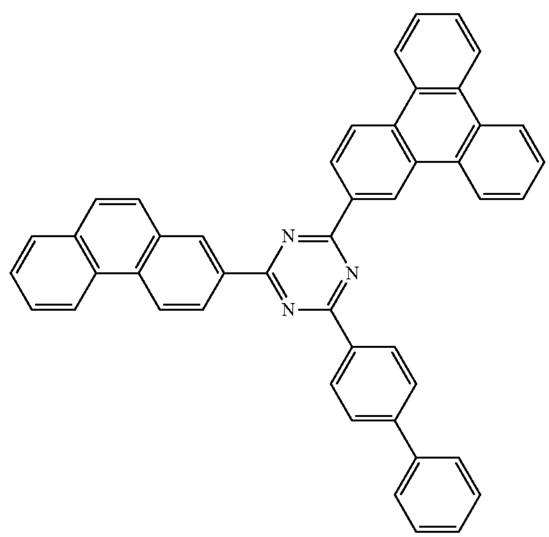

-continued
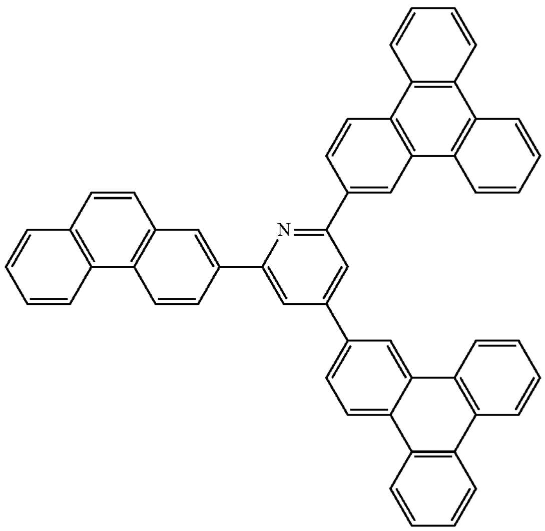
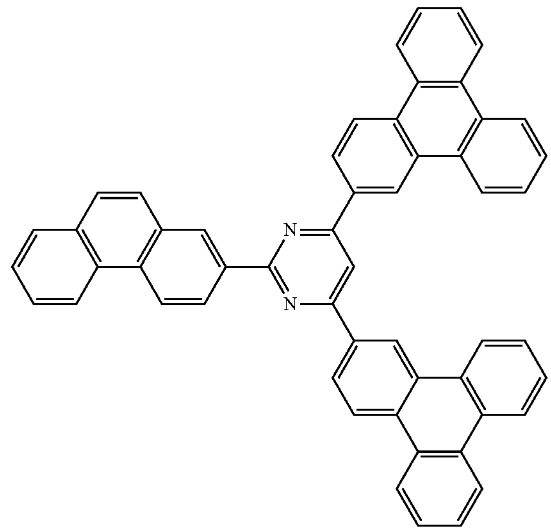
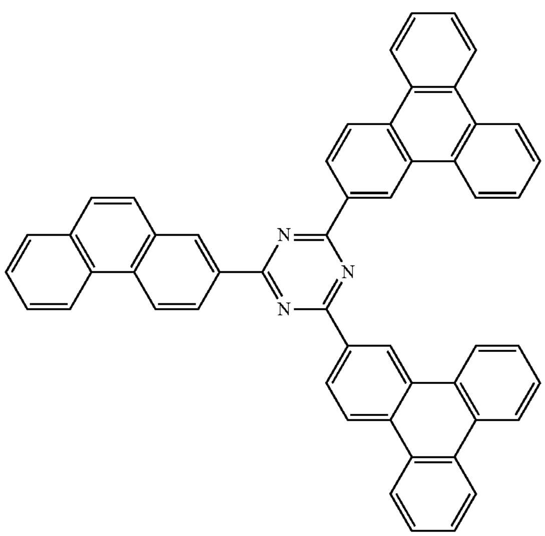
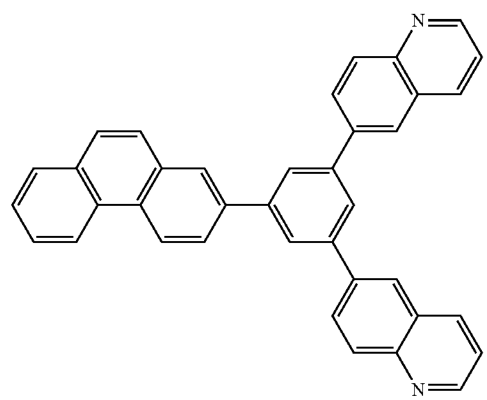
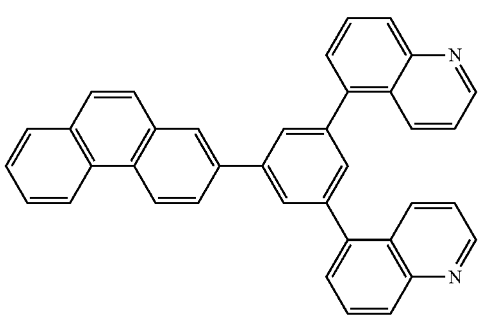
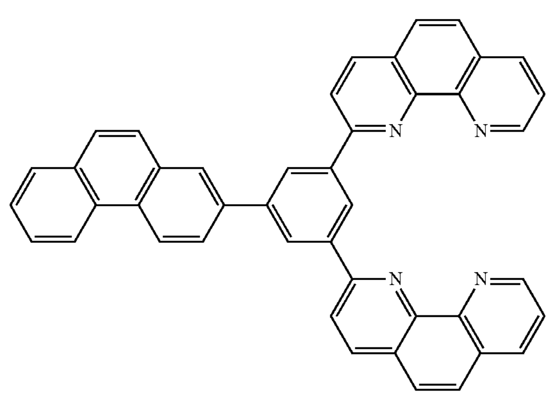

-continued
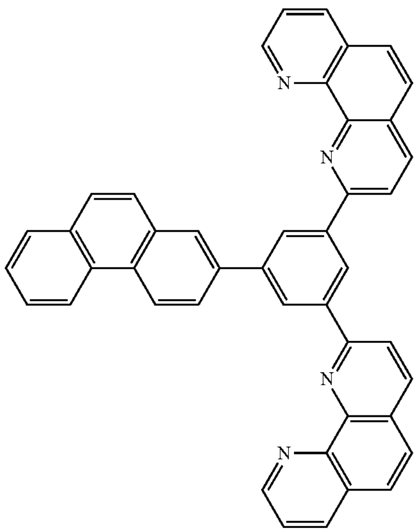
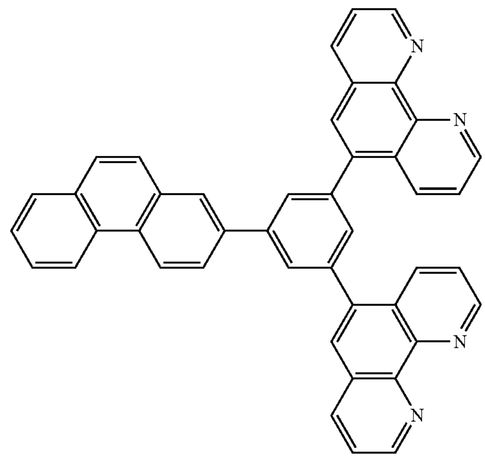
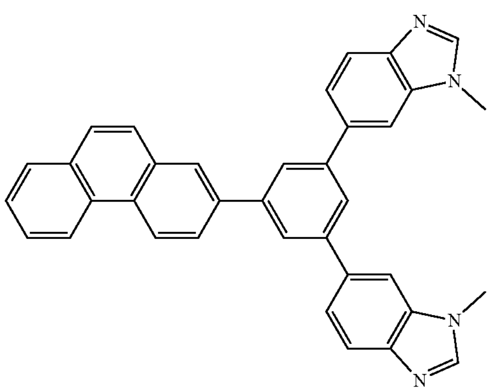
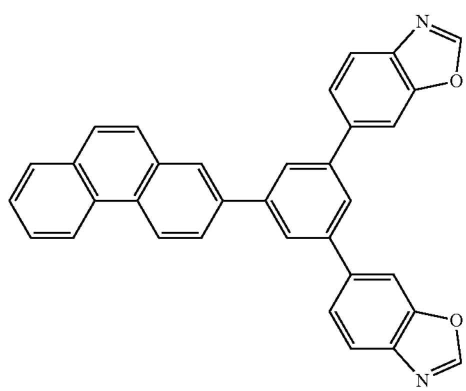
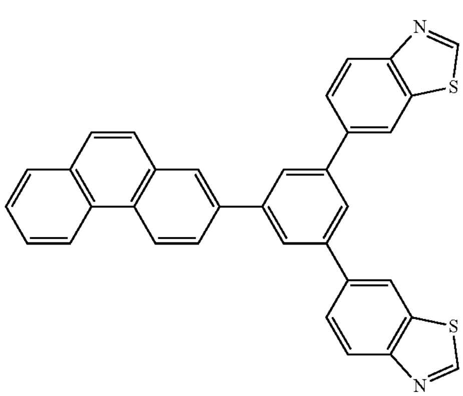
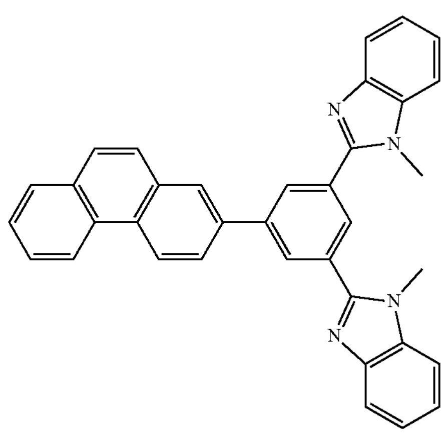

-continued
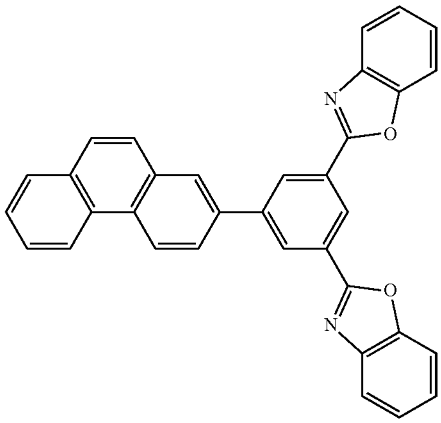
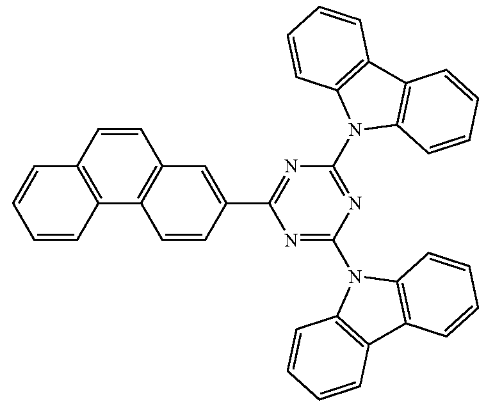
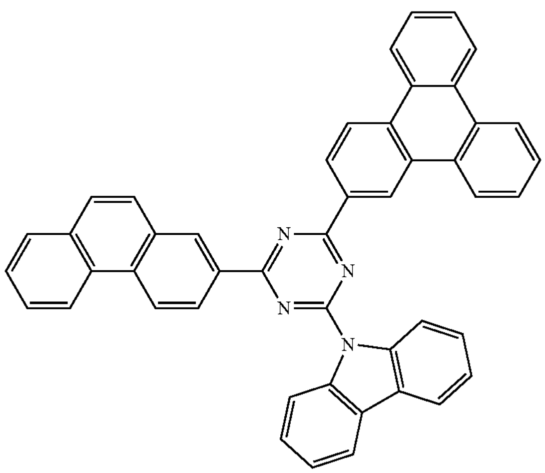
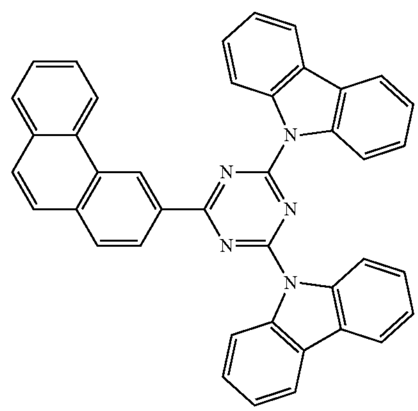
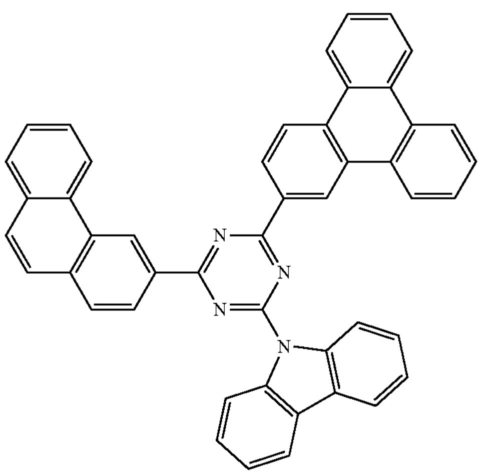
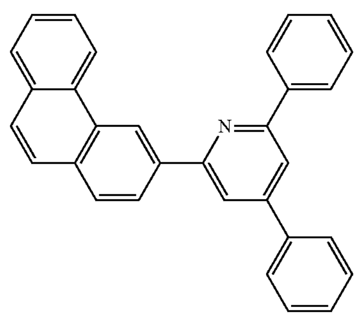
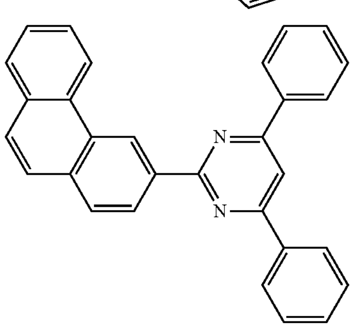
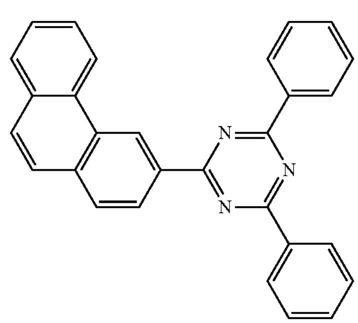

-continued
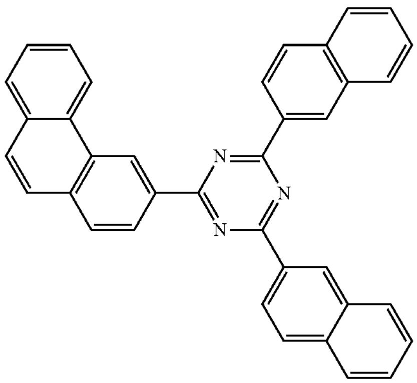
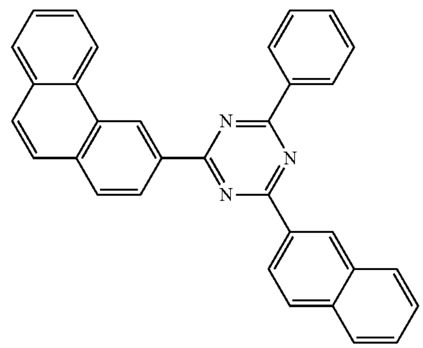
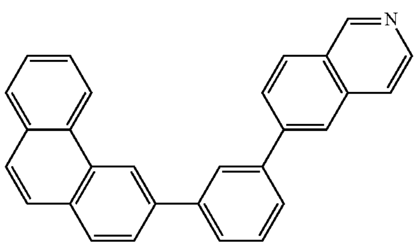
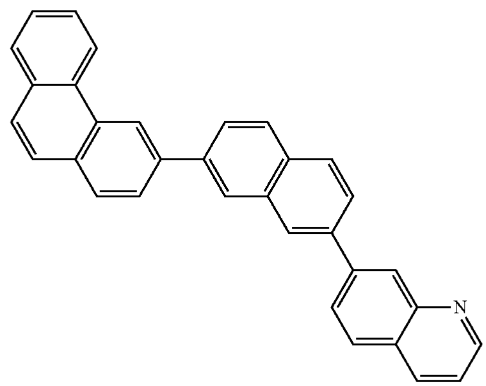
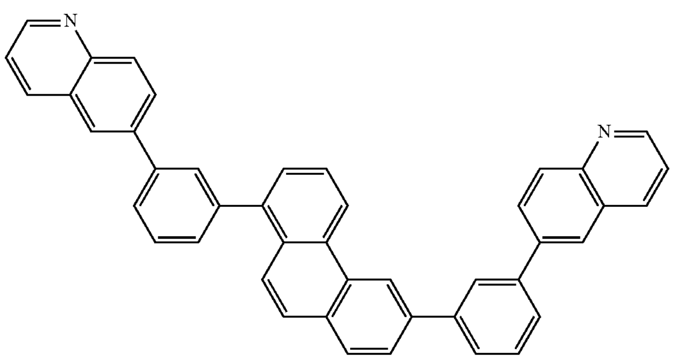
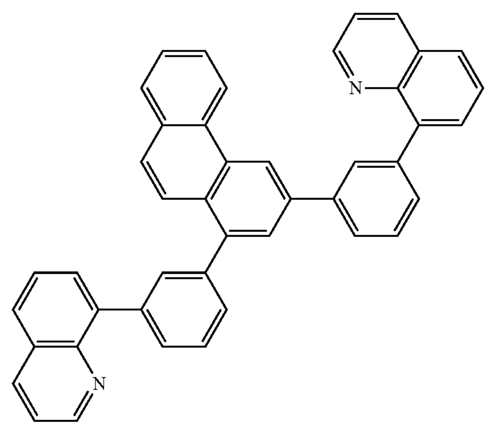
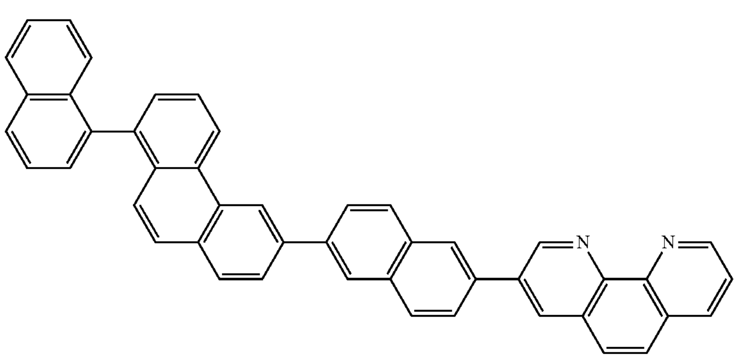

-continued
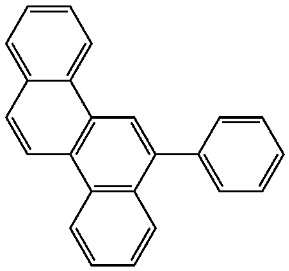
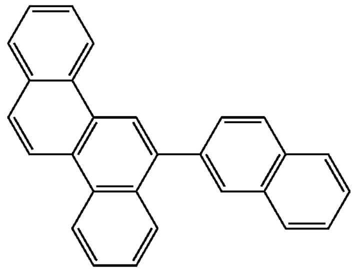
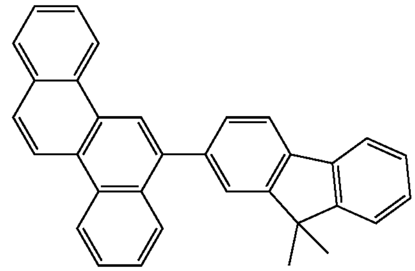
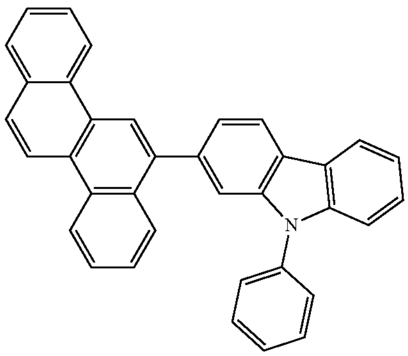
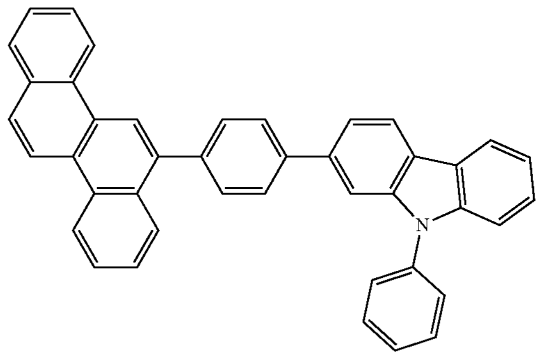
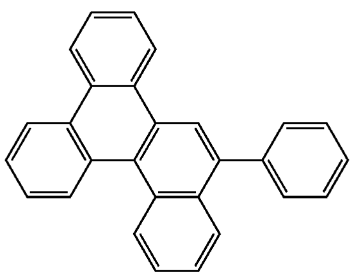
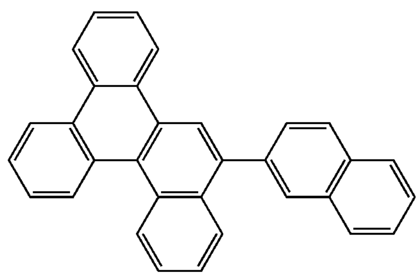
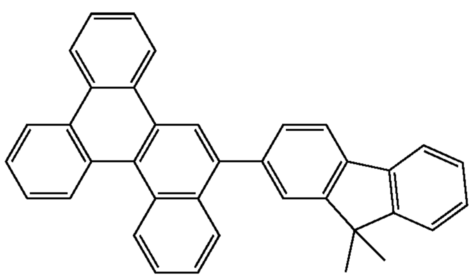
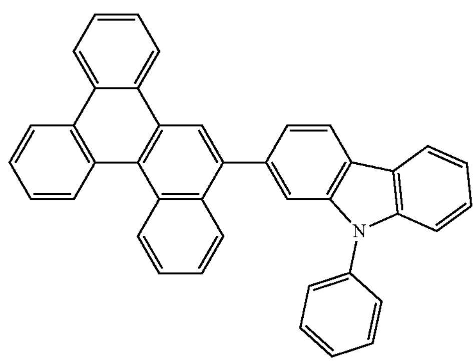
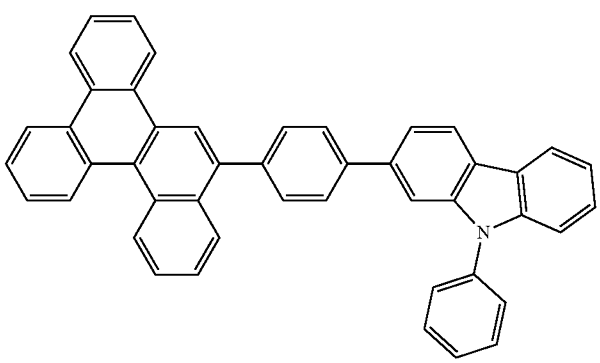
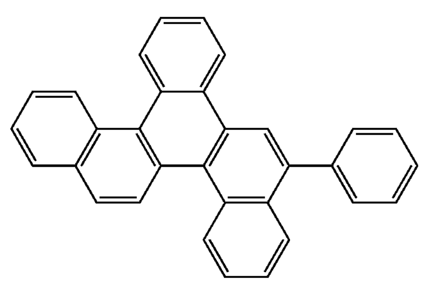

-continued
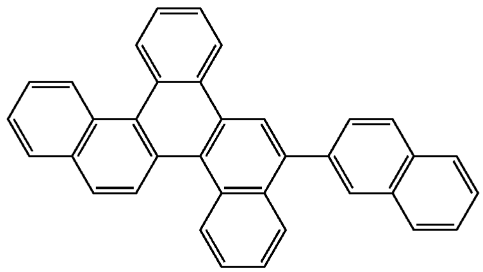
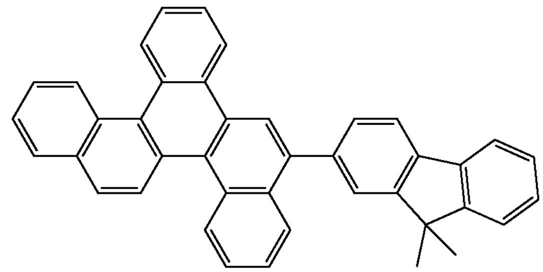
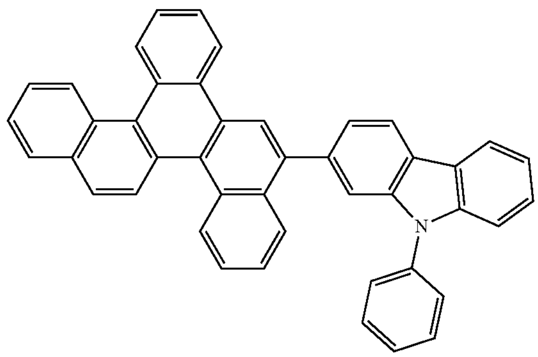
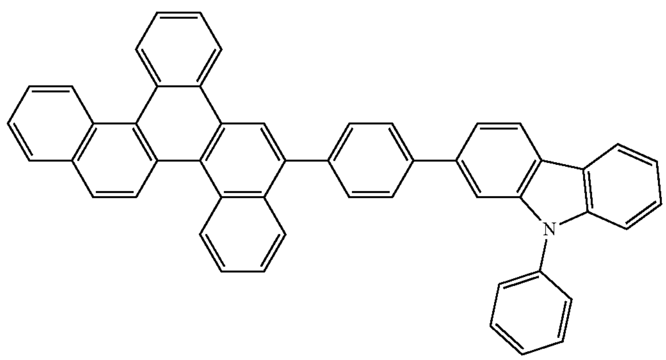
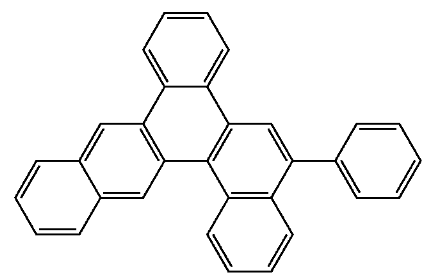
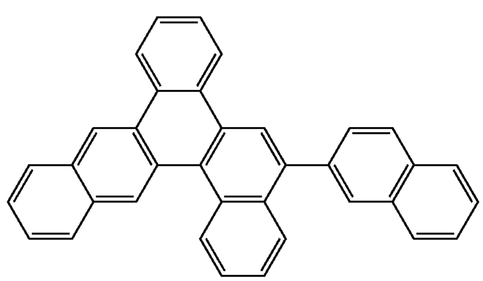
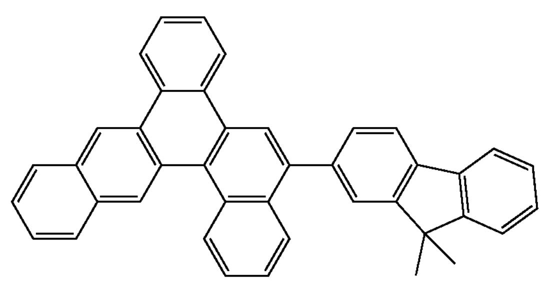
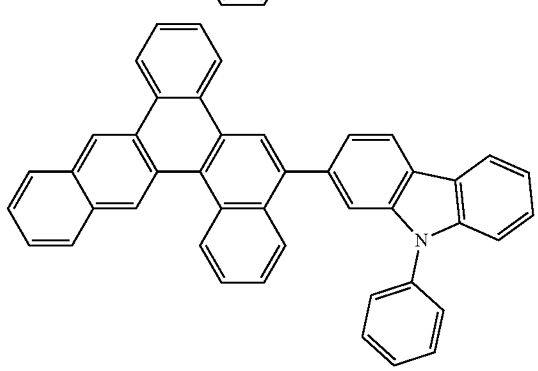

-continued
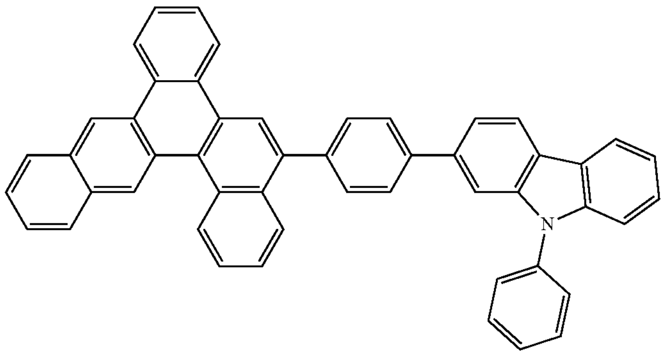
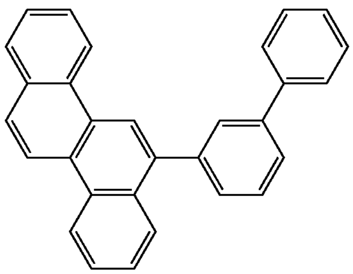
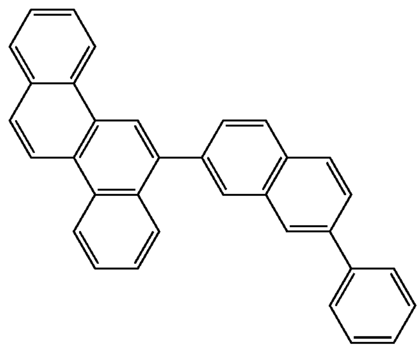
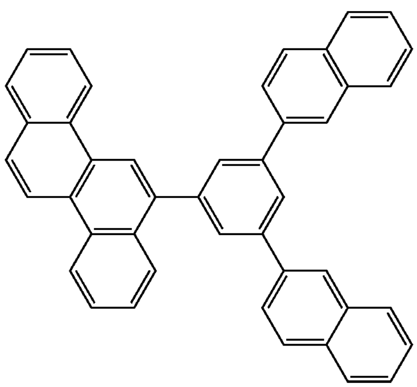
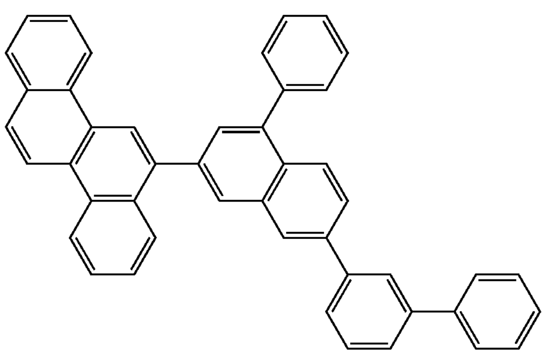
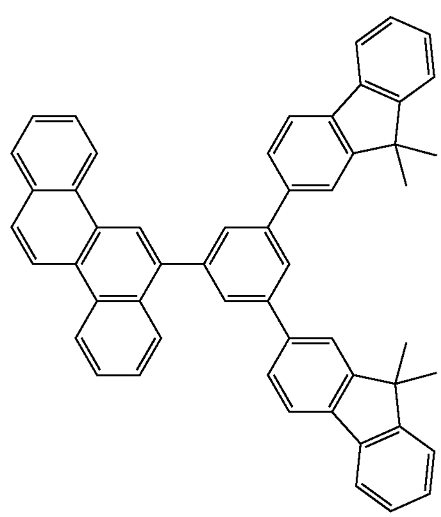

-continued
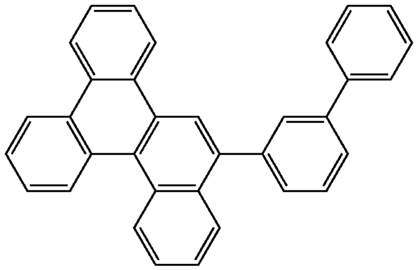
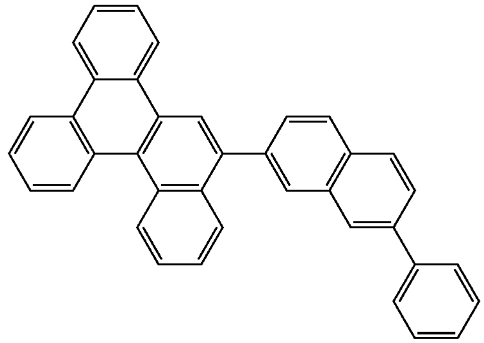
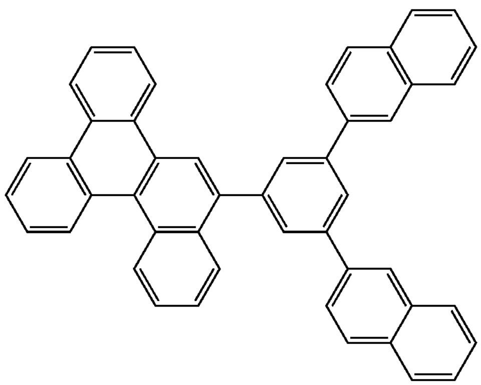
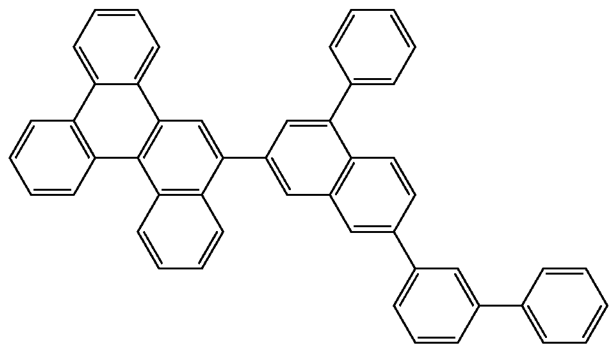
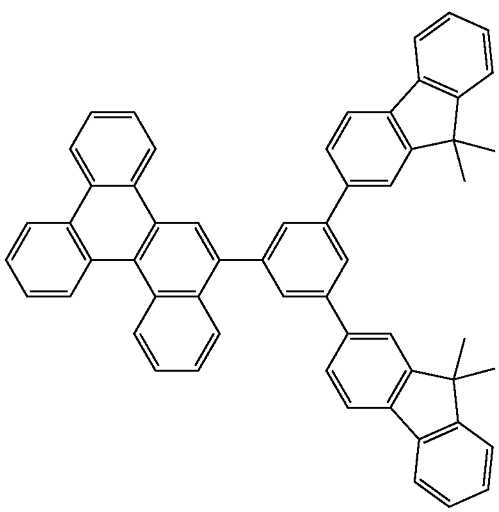
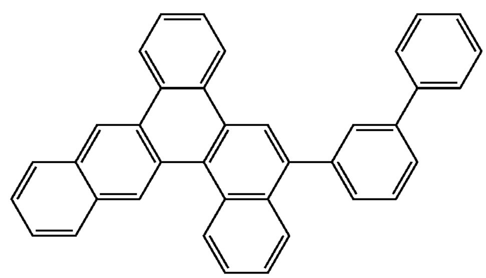
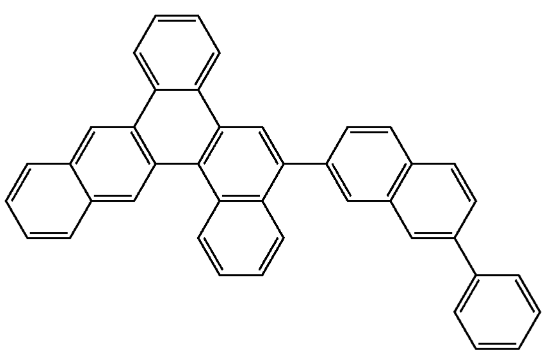
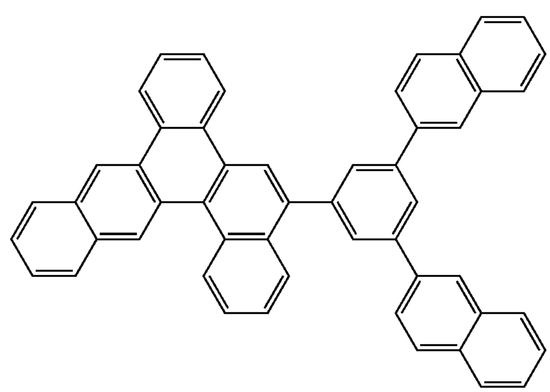

-continued
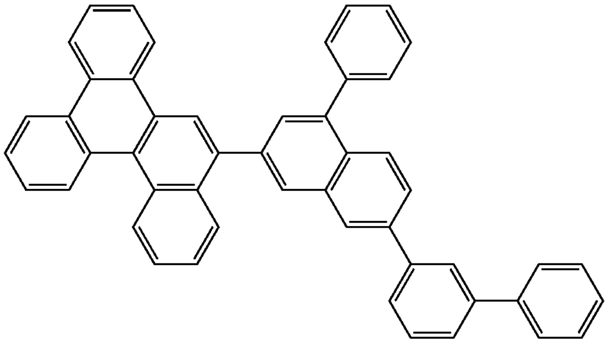
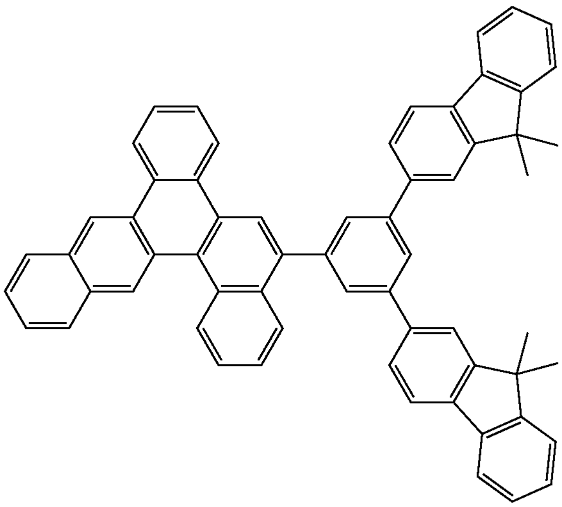
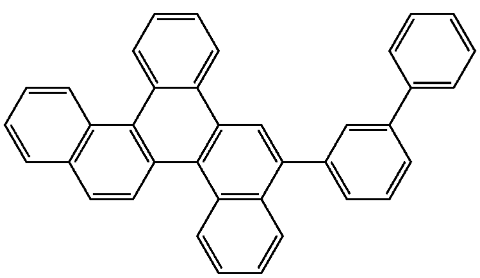
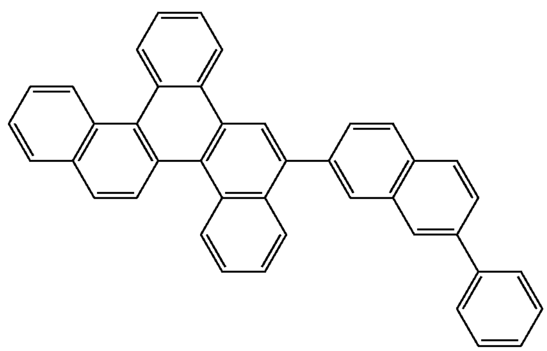
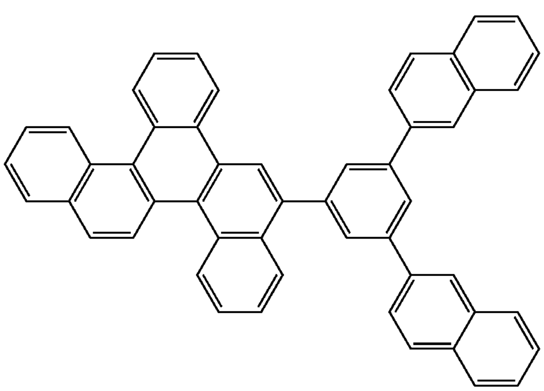

-continued
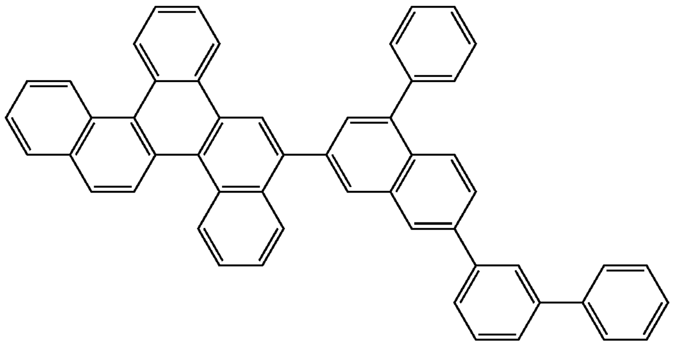
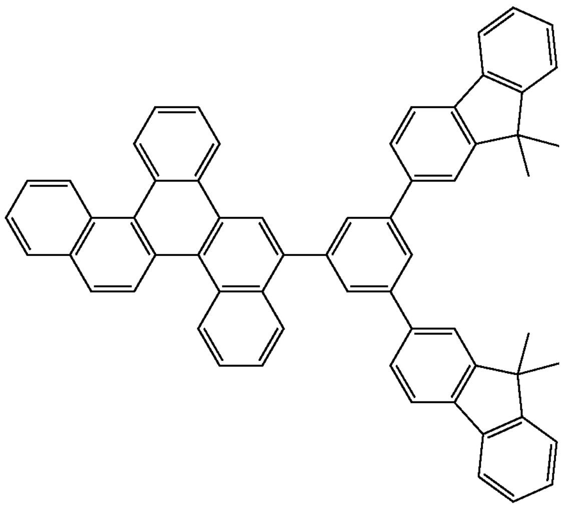
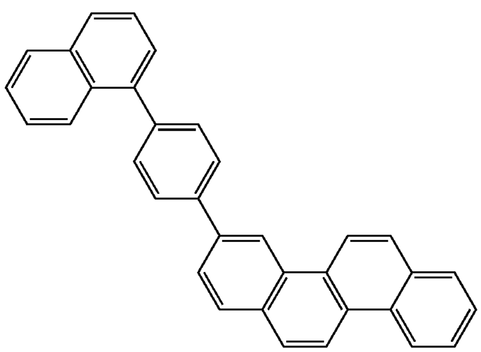
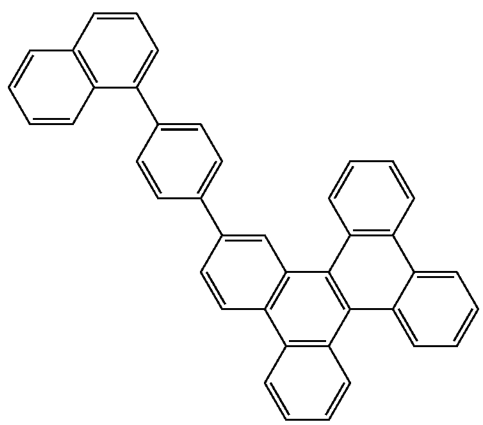
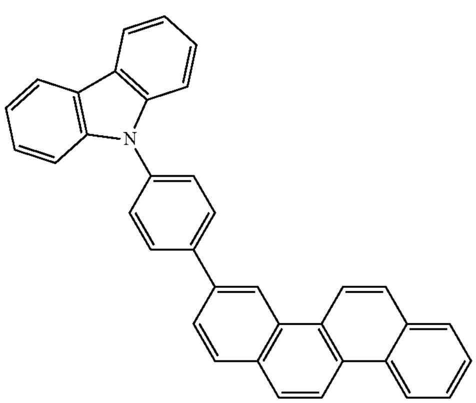
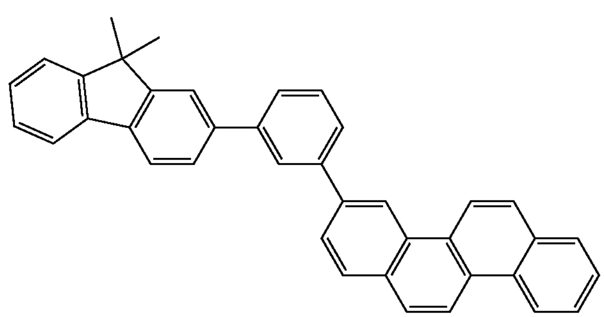

-continued
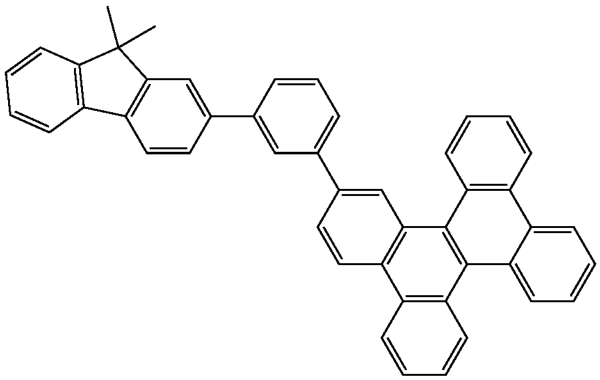
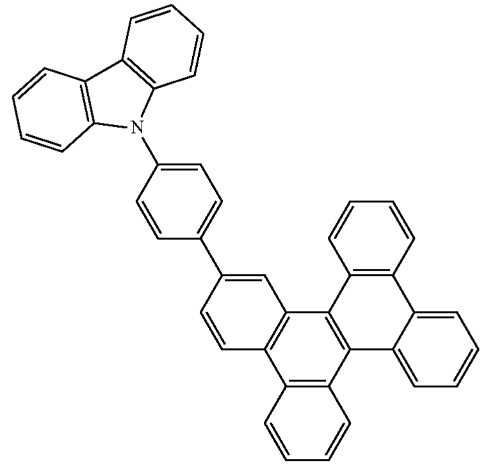
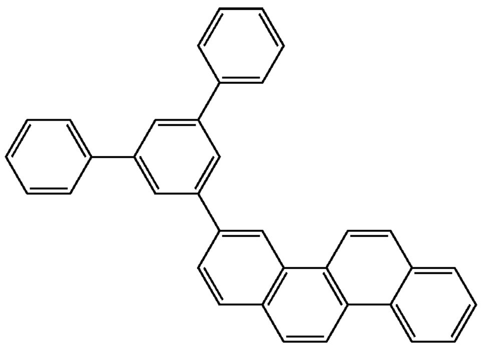
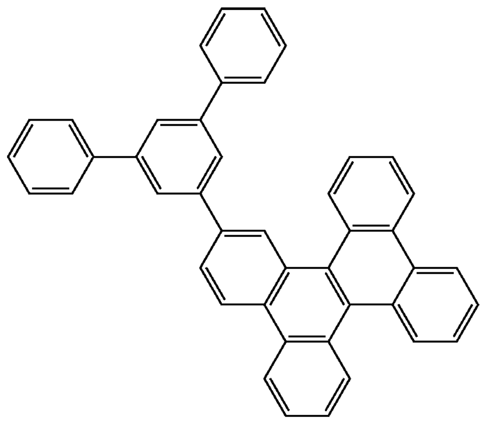
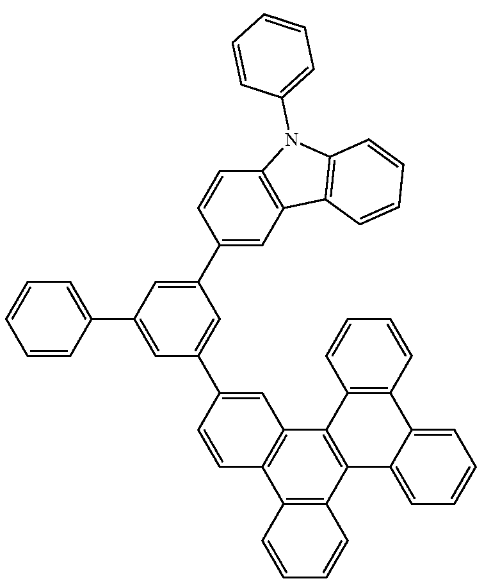
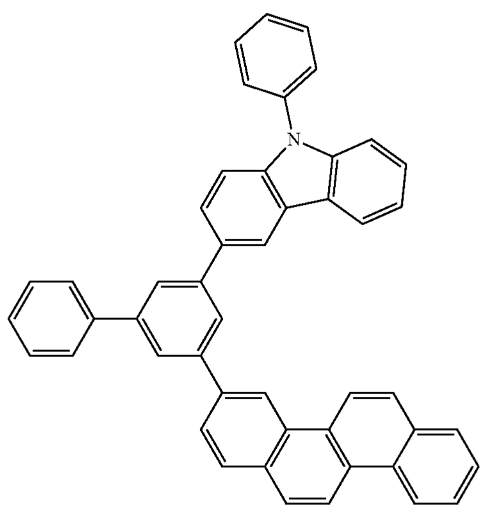

-continued
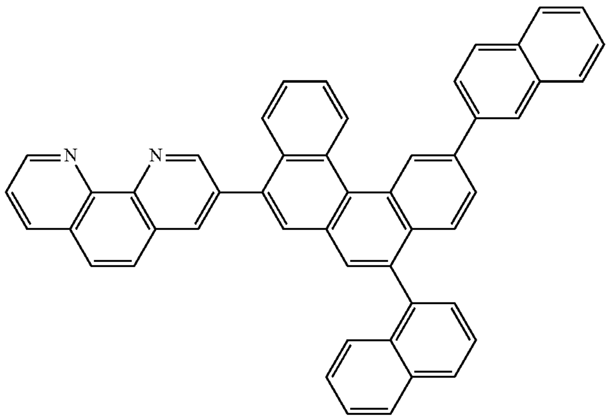
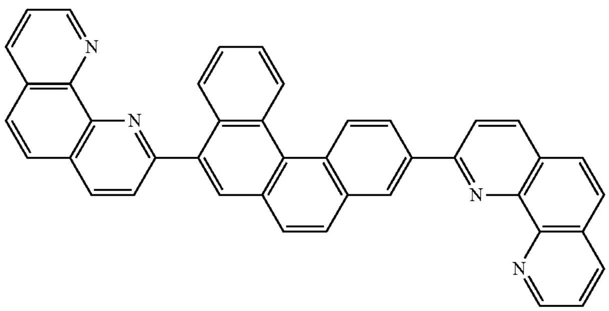
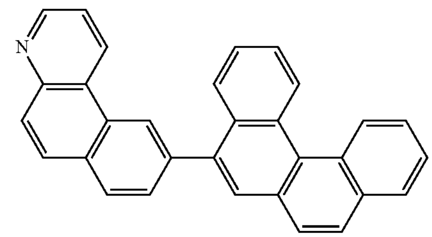
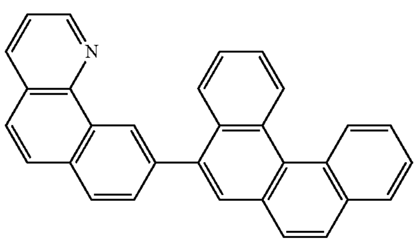
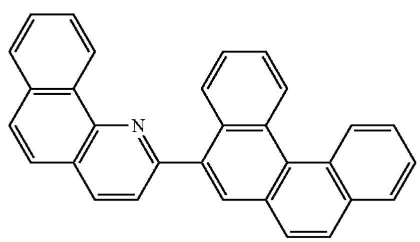
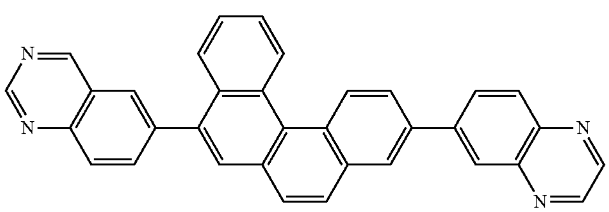
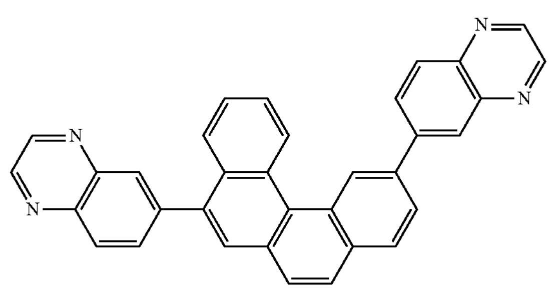
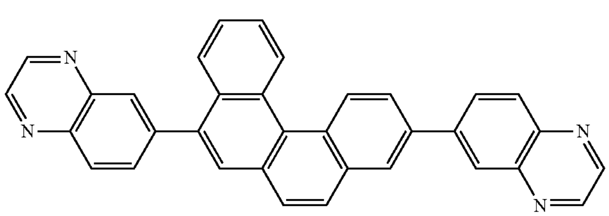
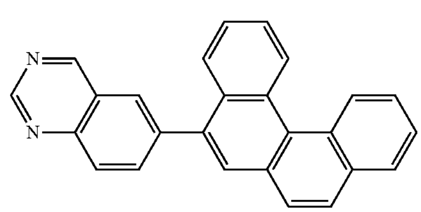

-continued
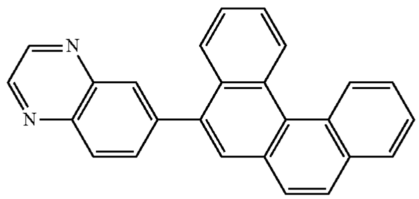
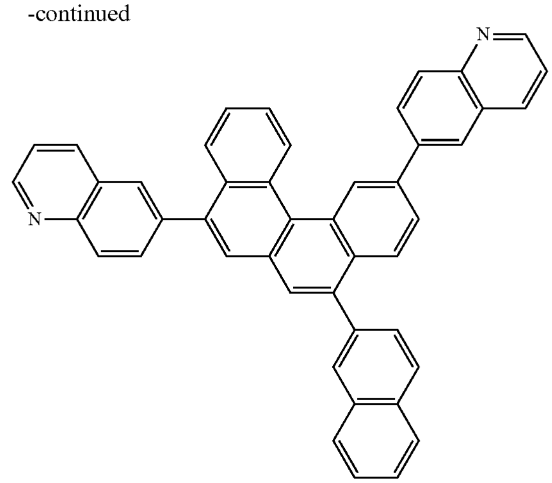
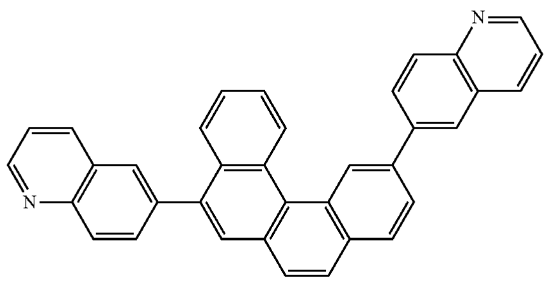
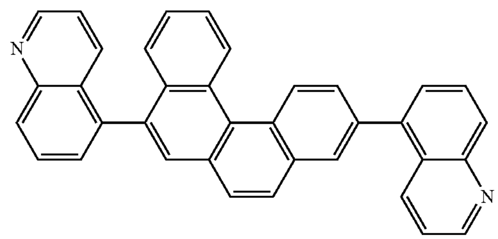
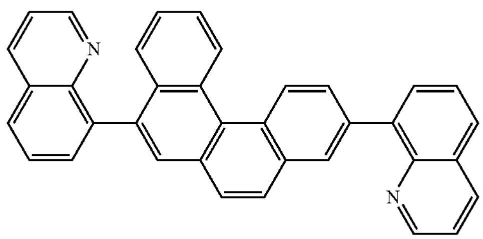
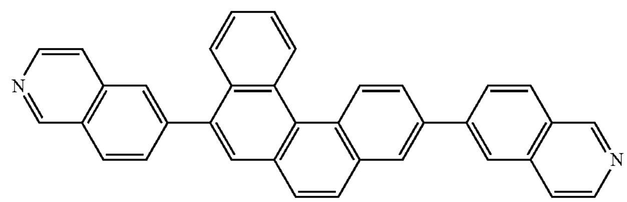
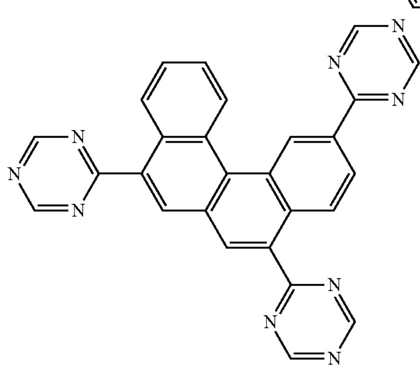
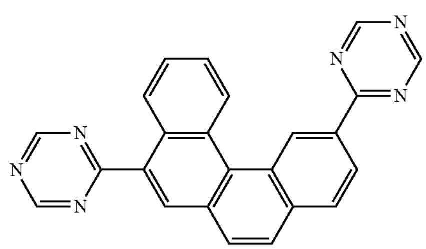
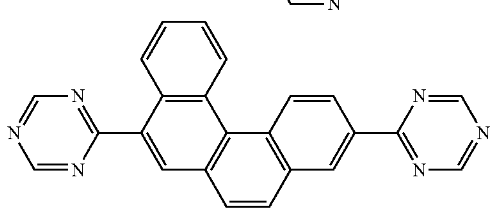
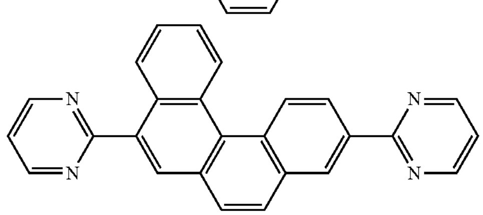
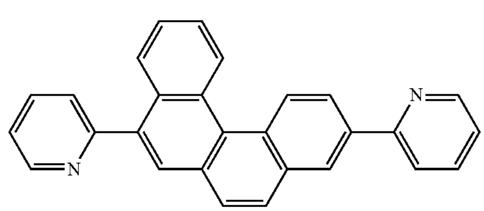

-continued
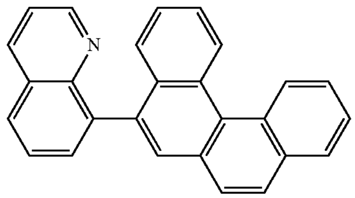
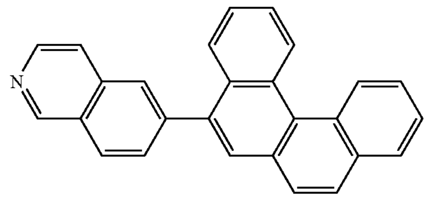
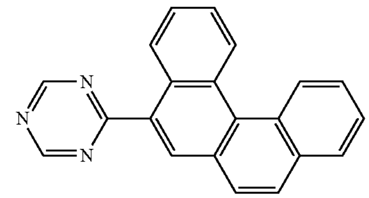
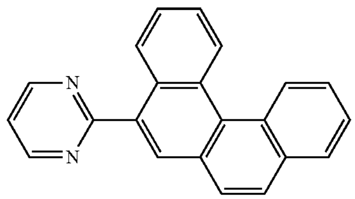
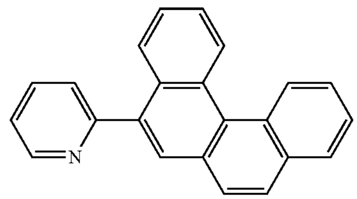
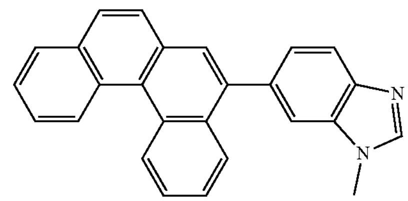
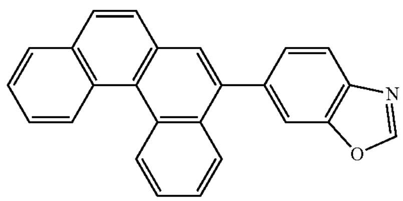
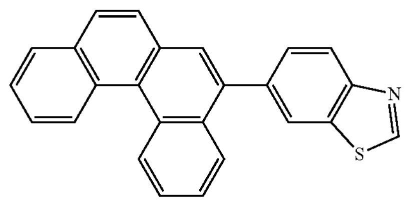
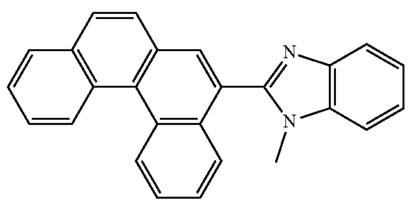
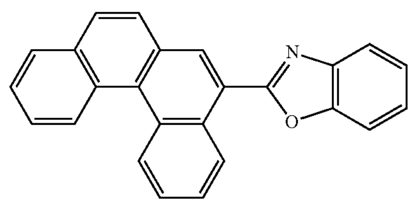
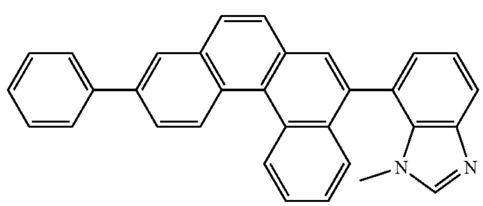
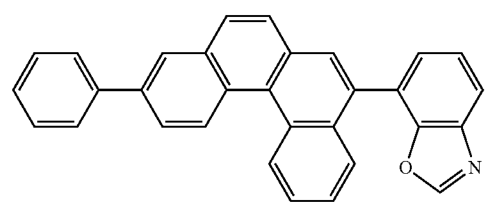
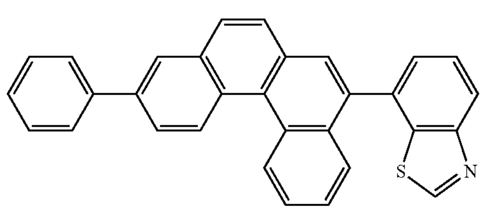
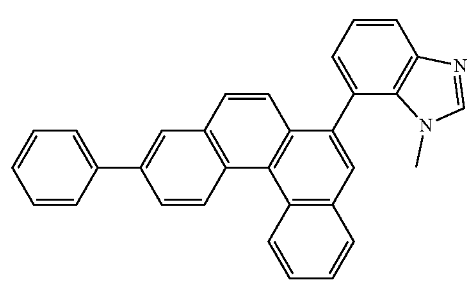
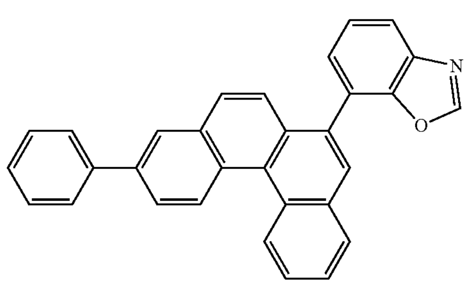
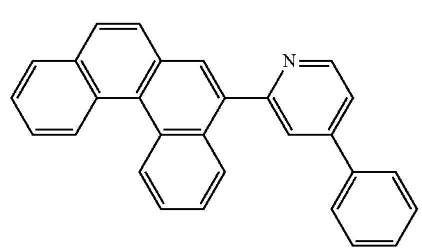

-continued
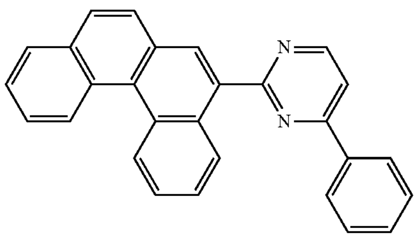
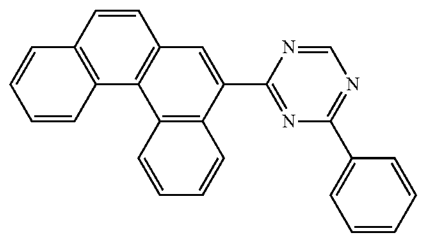
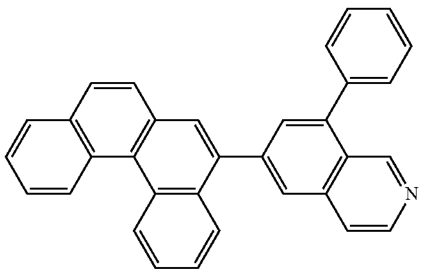
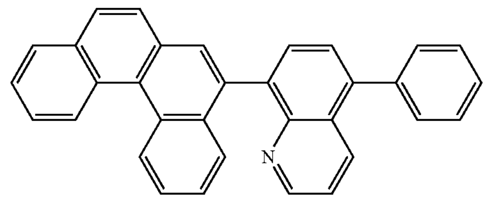
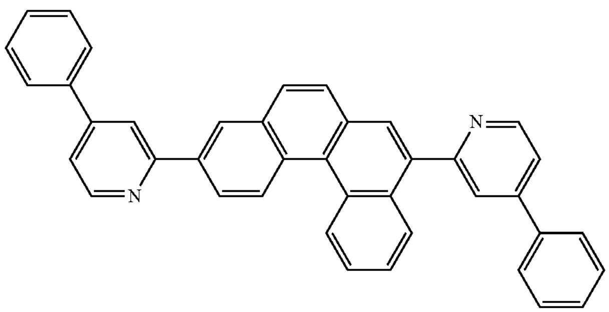
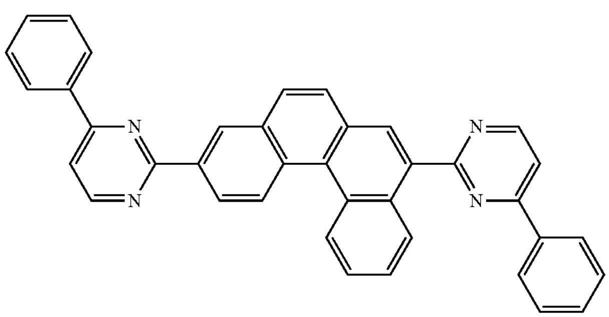
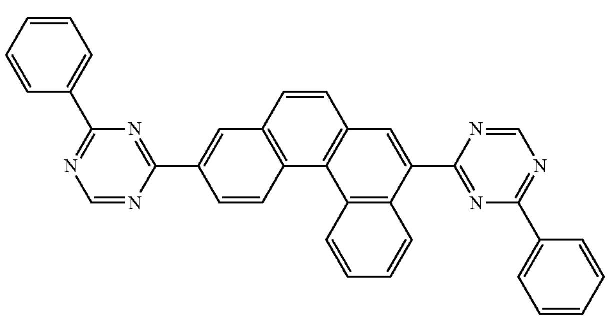
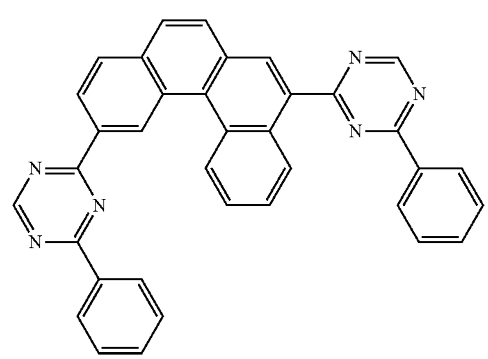

-continued
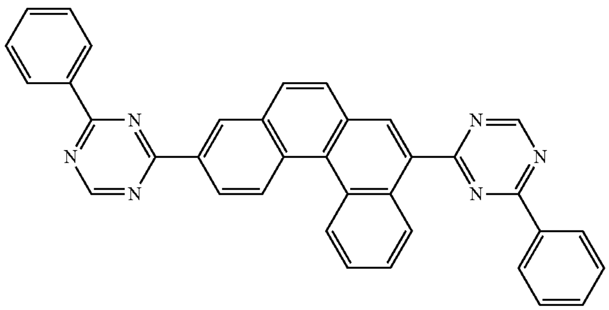
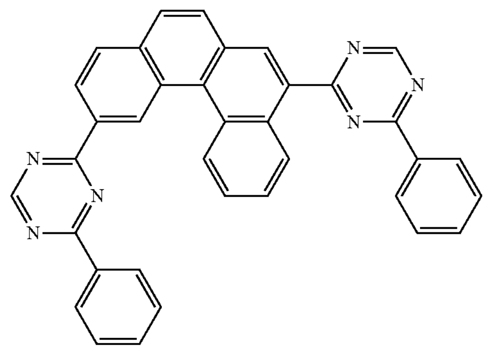
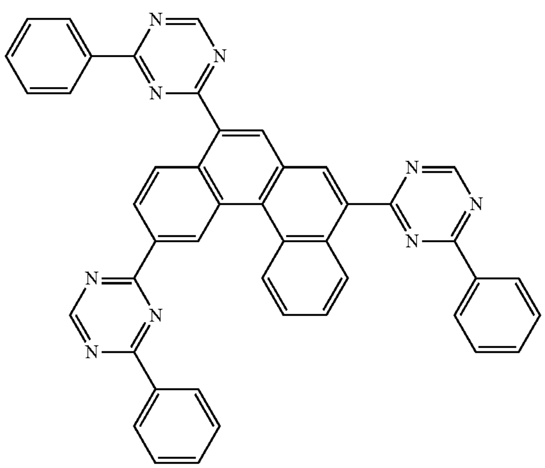
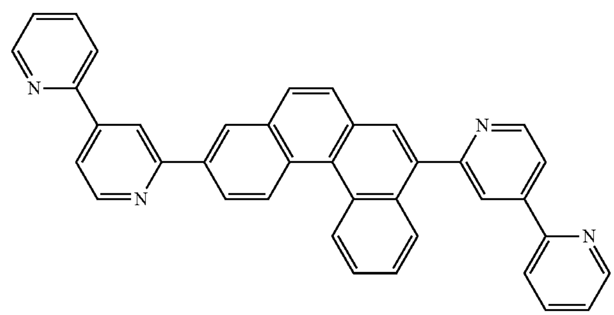
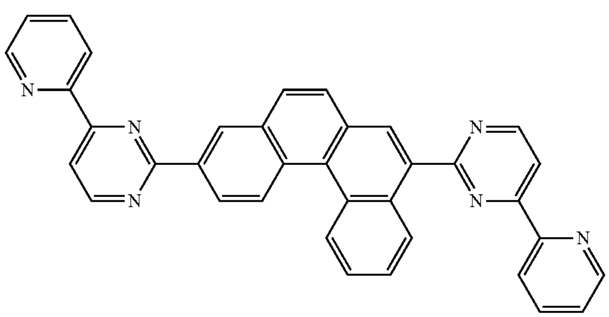
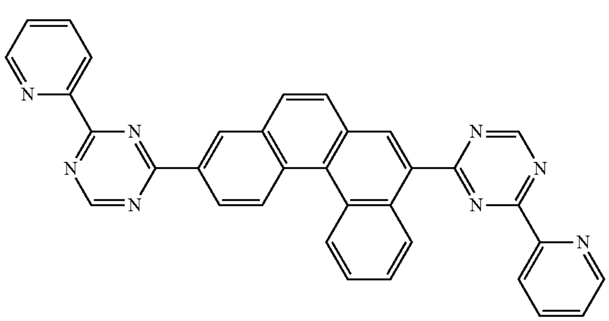
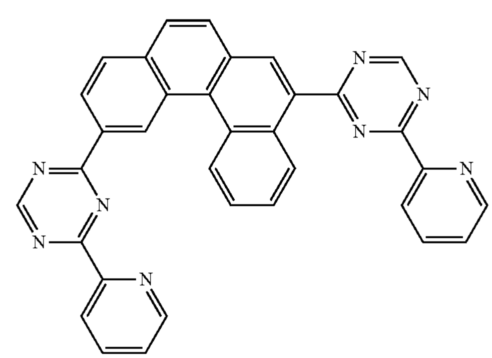

-continued
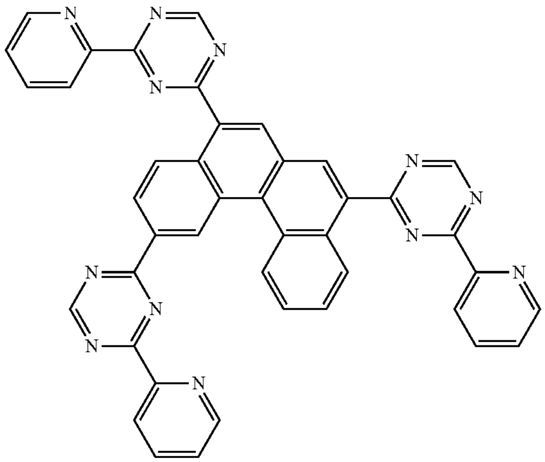
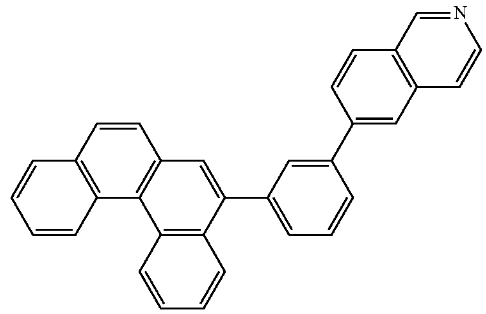
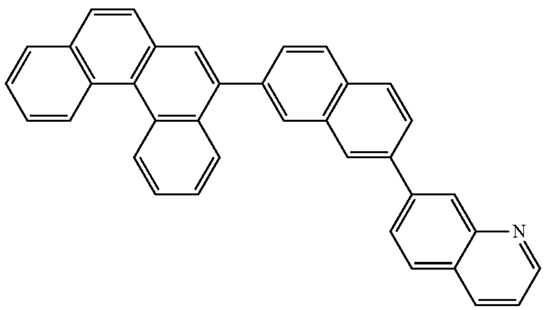
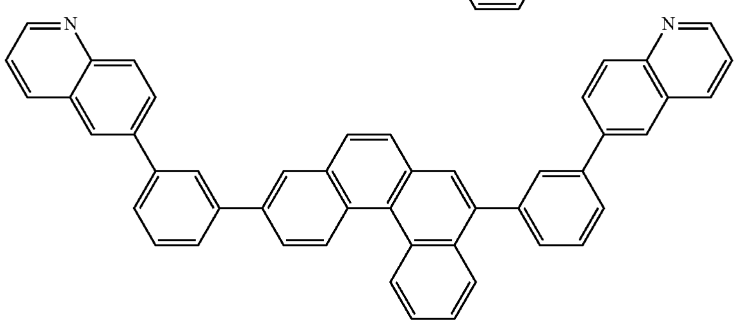
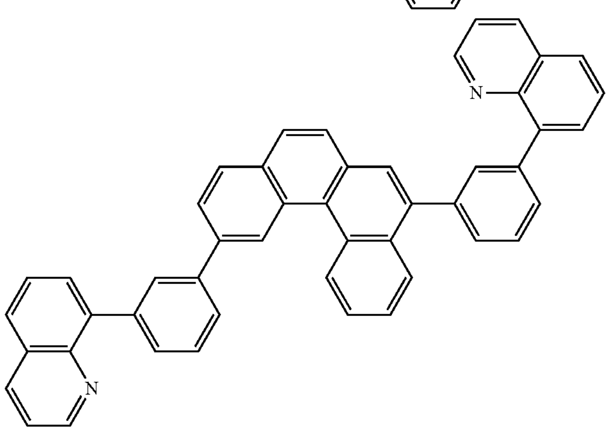
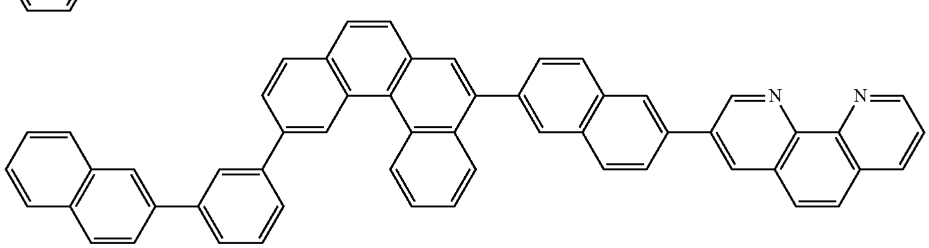

-continued
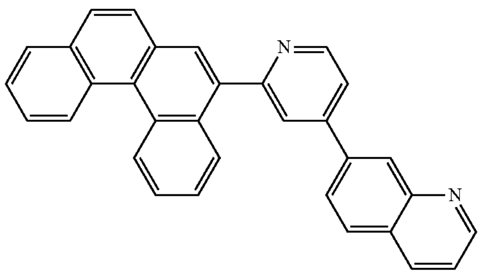
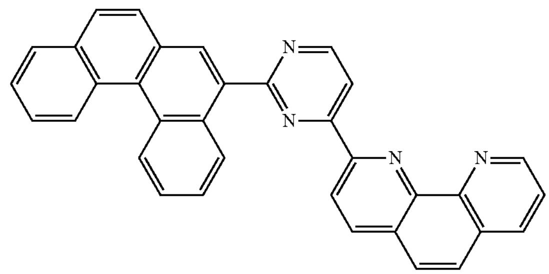
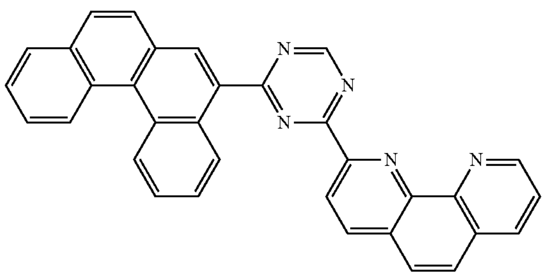
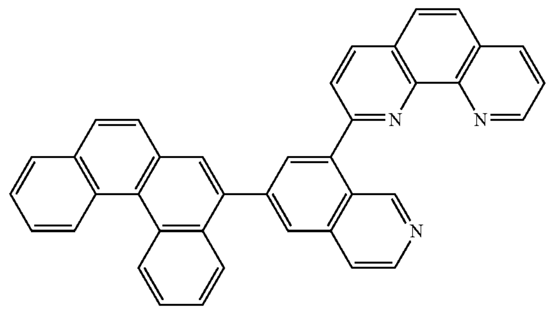
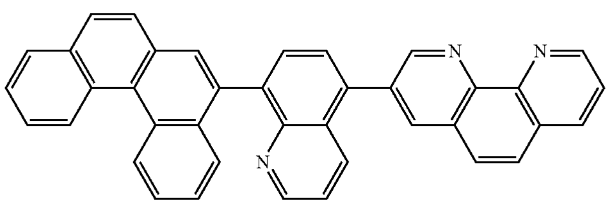
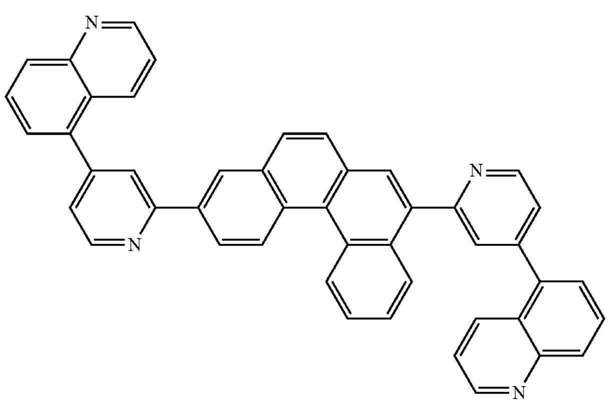
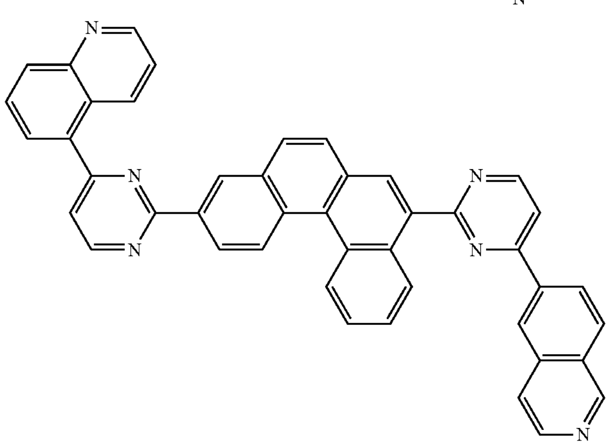

-continued
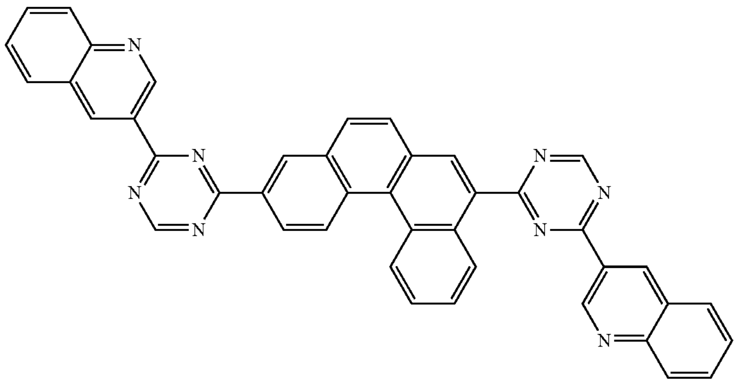
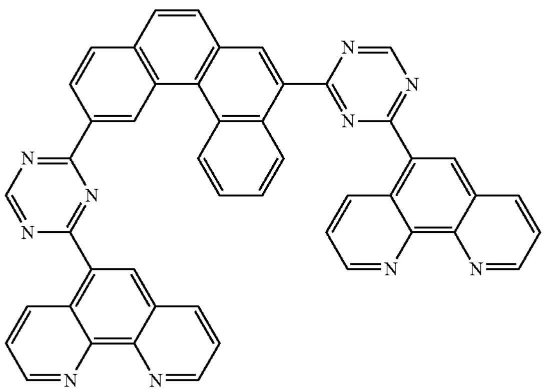
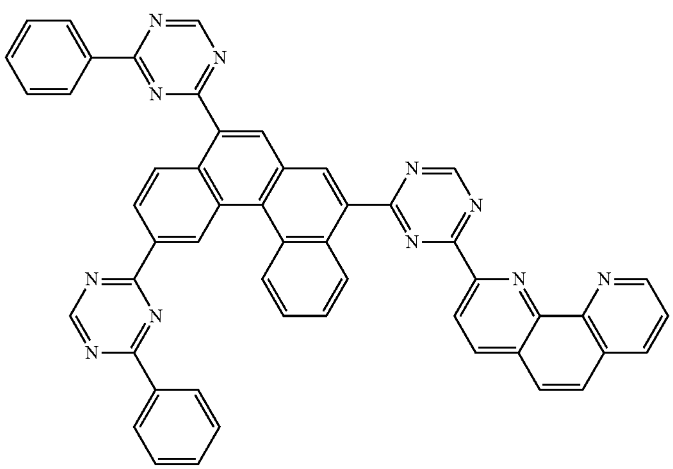
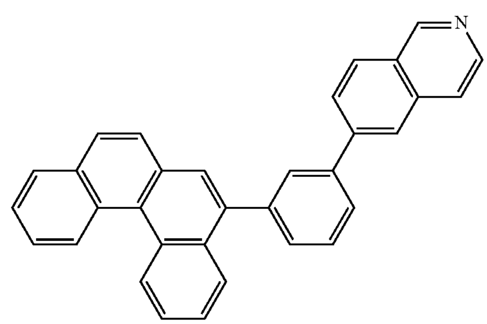
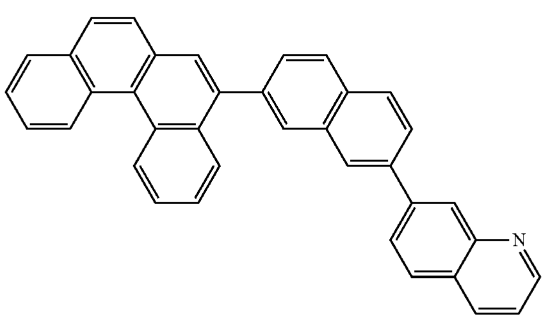

-continued
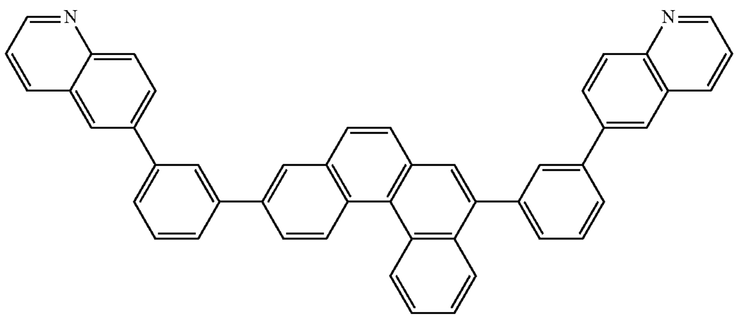
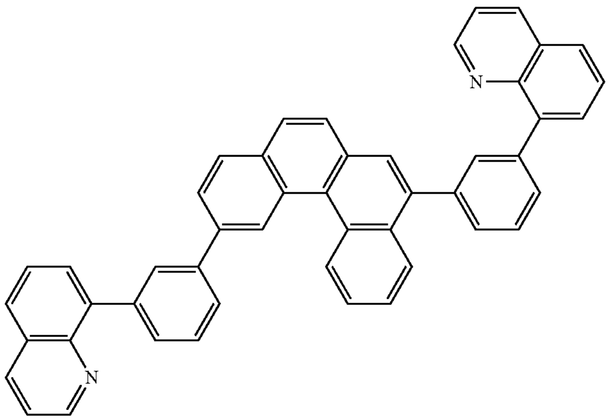
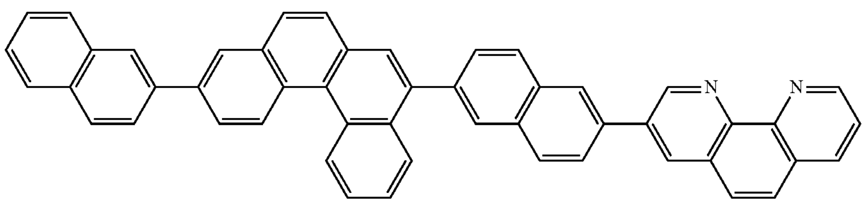
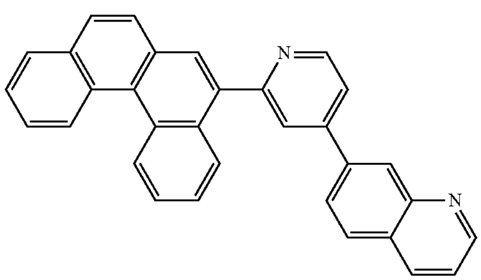
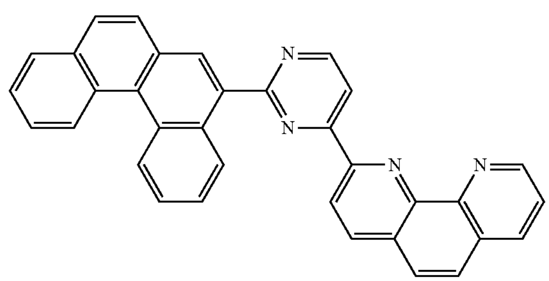
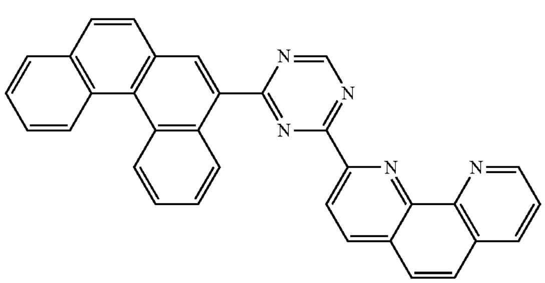
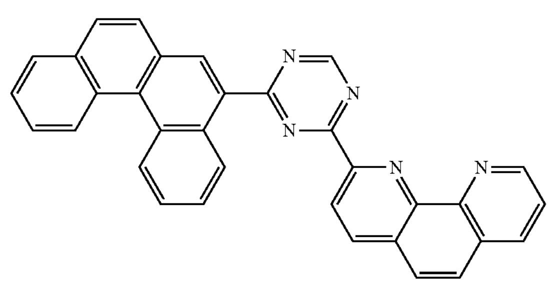

-continued
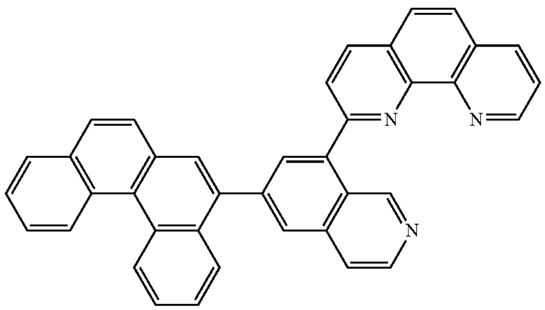
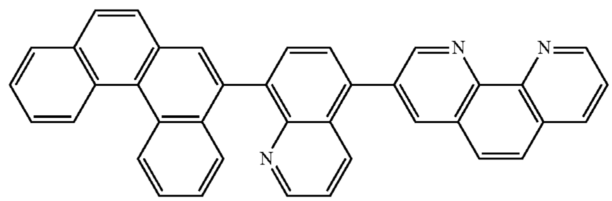
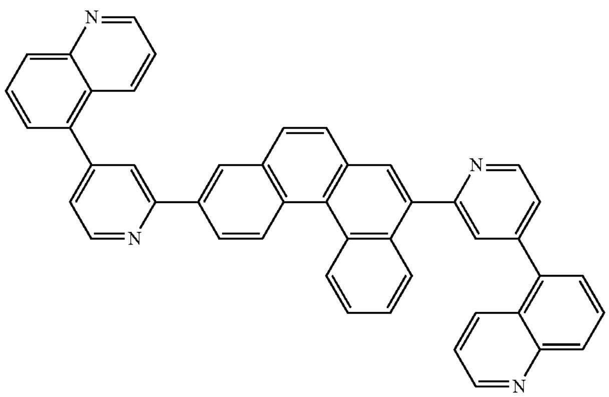
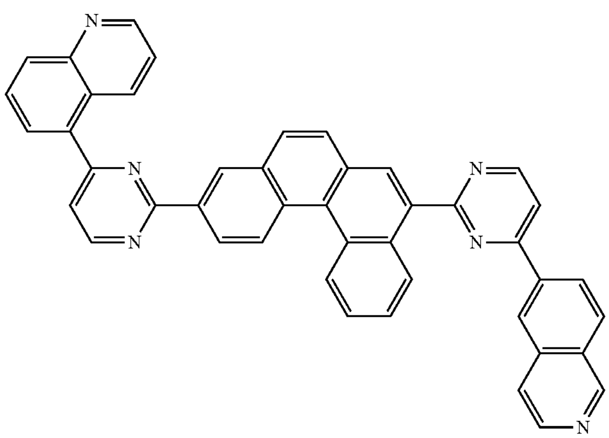
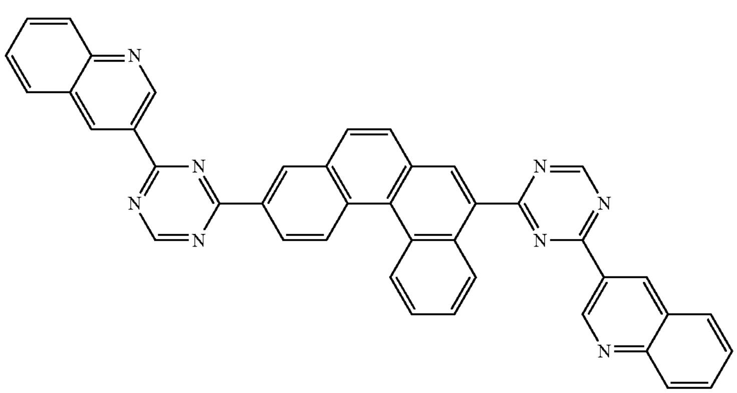

-continued
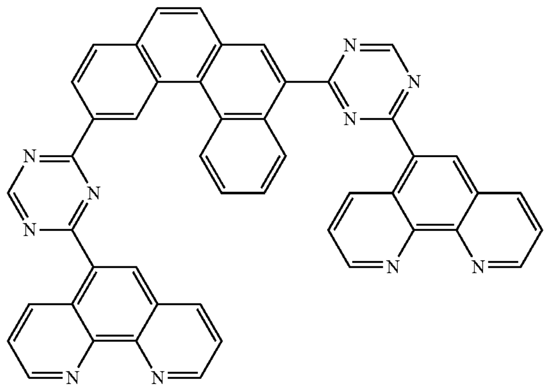
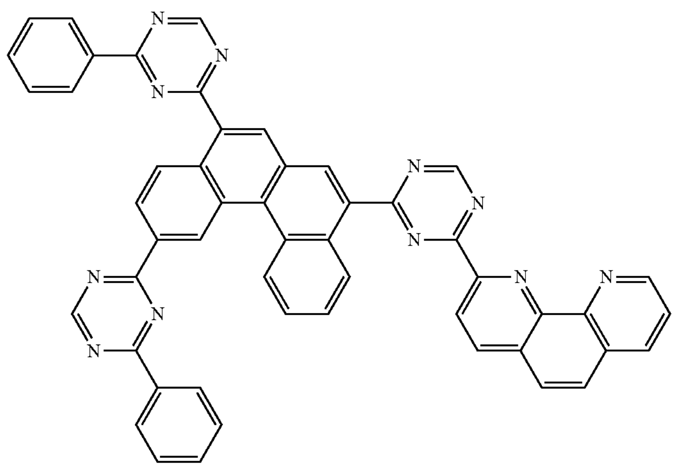
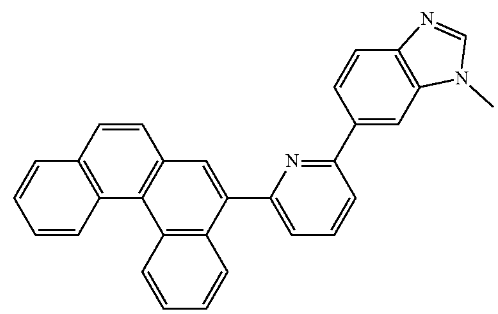
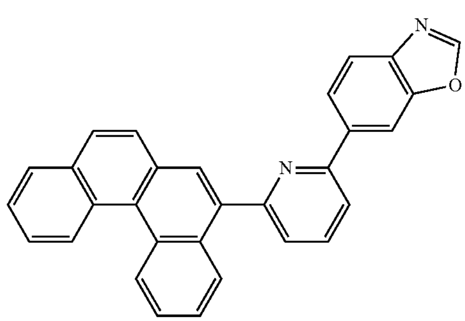
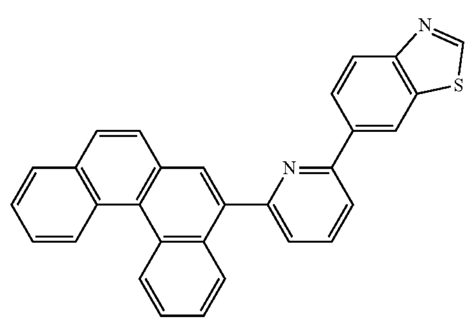
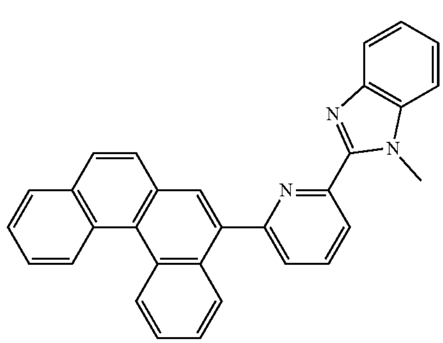
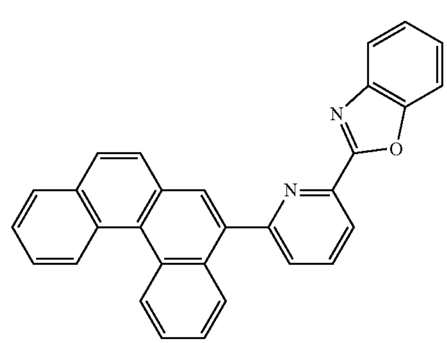

-continued
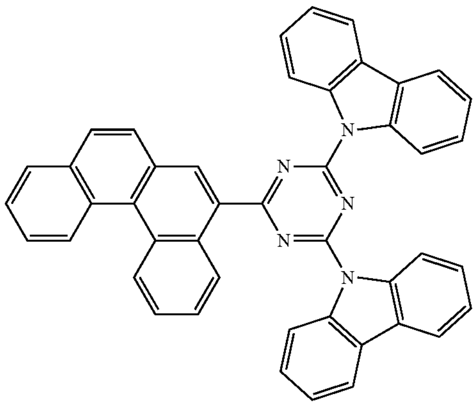
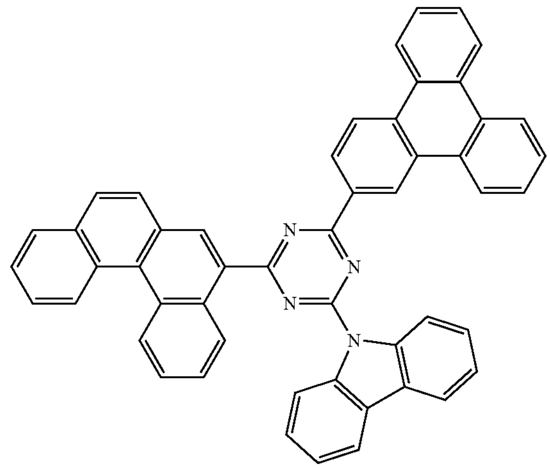
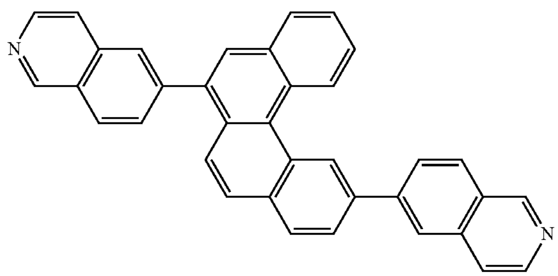
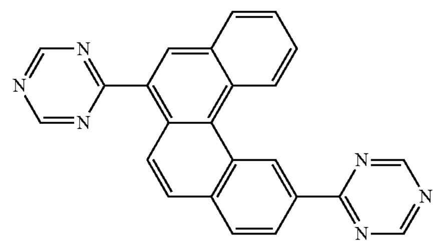
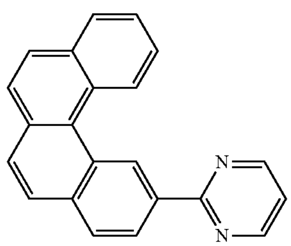
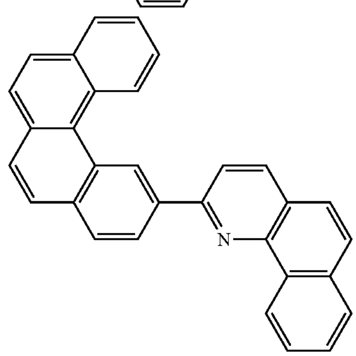
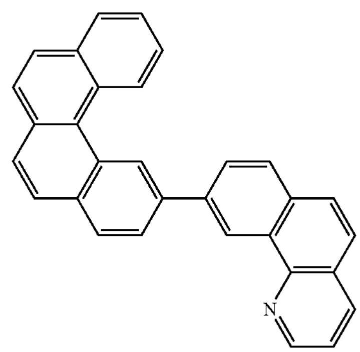
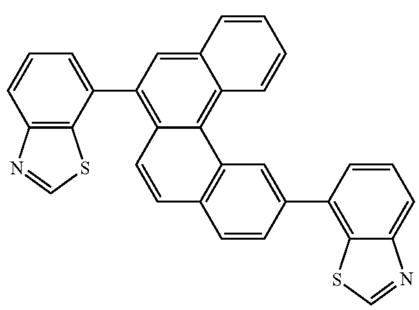
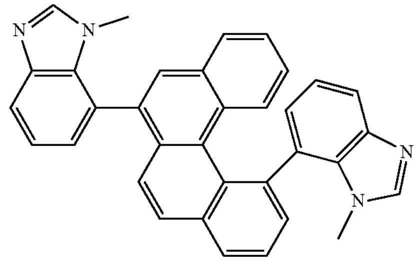
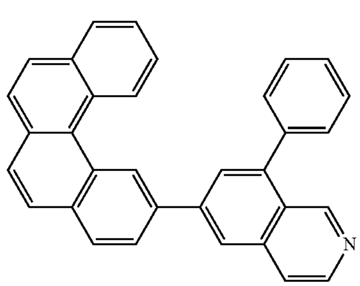
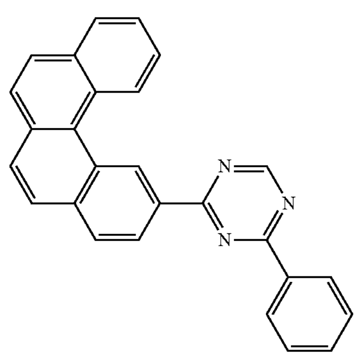

-continued
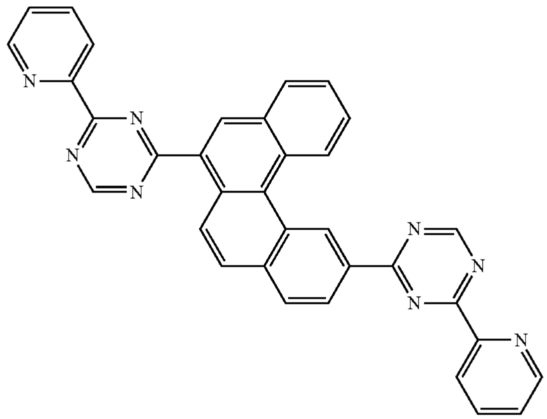
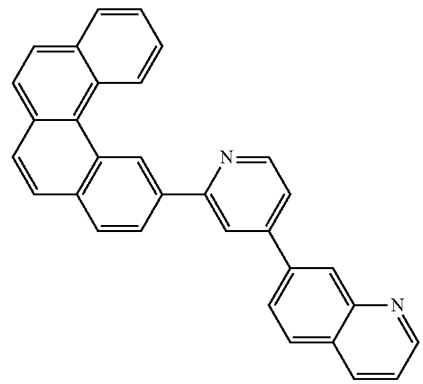
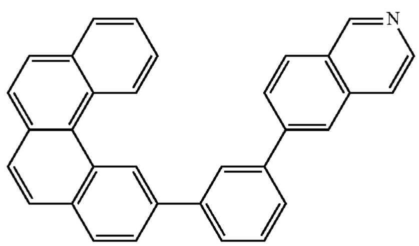
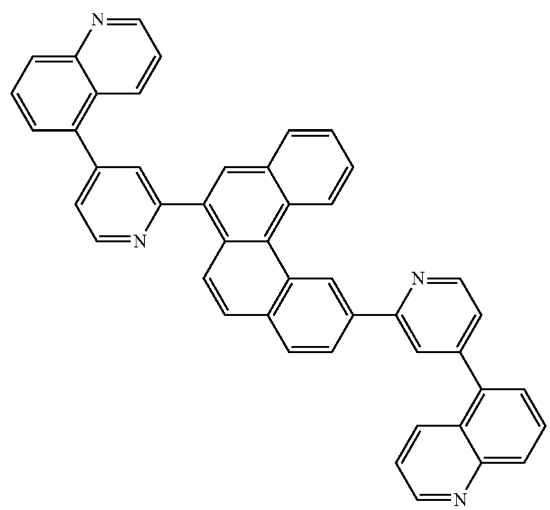
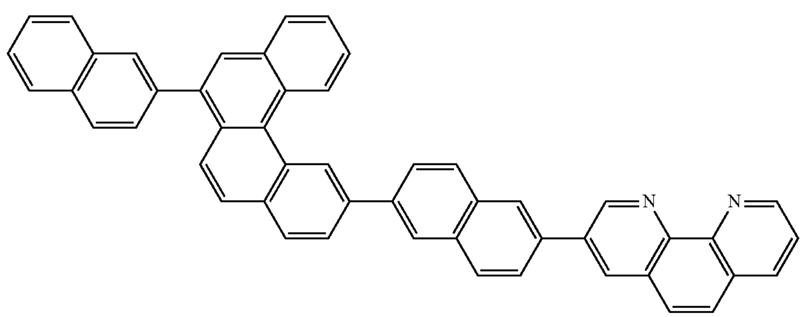
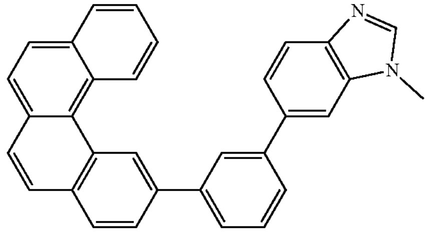
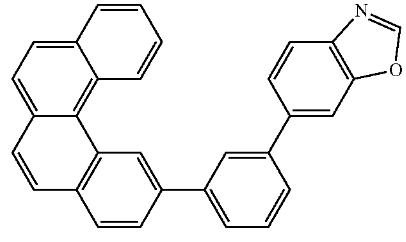

-continued
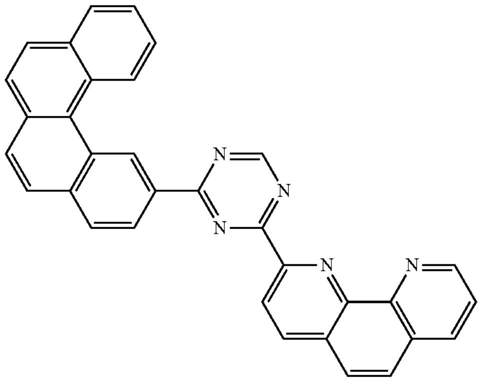
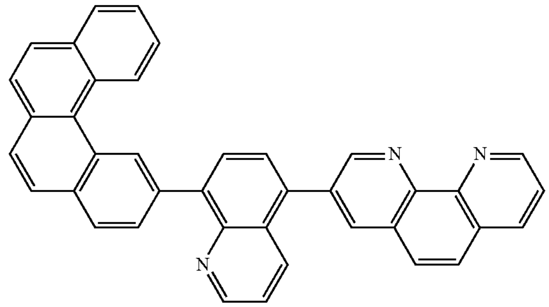
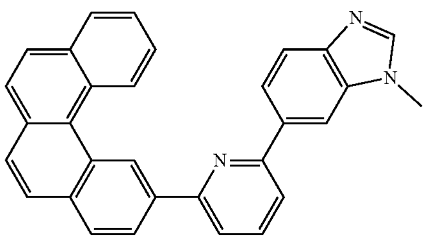
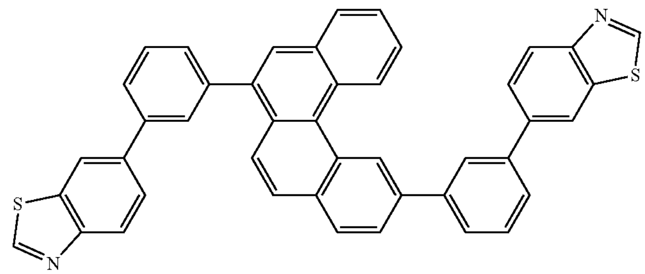
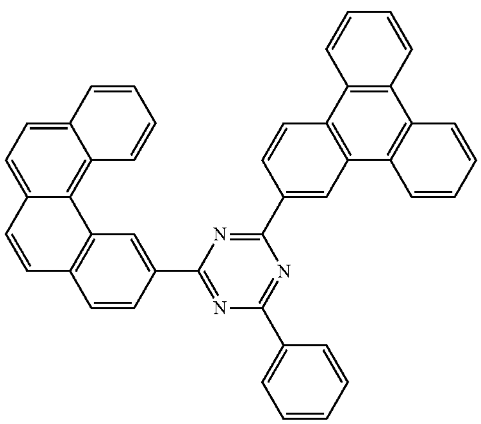
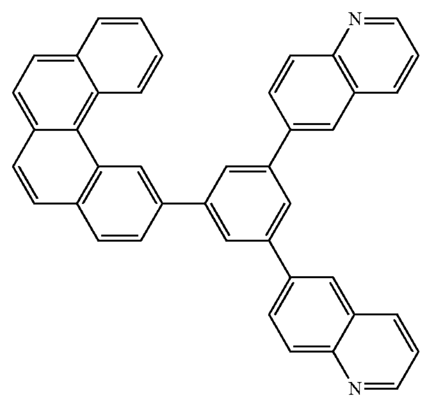
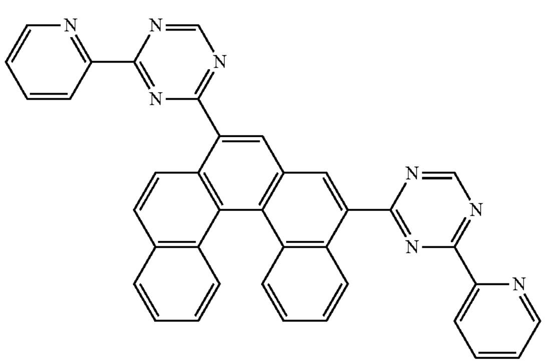
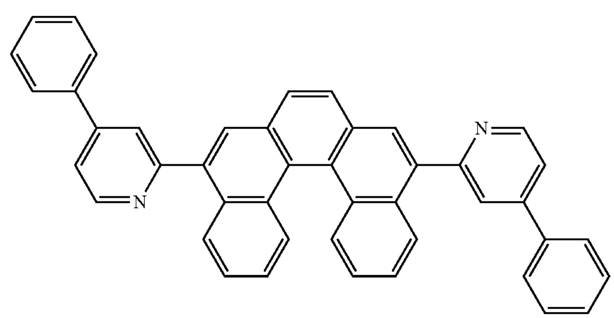

-continued
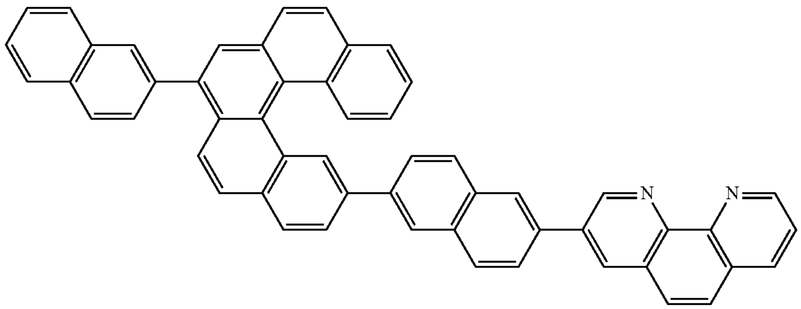
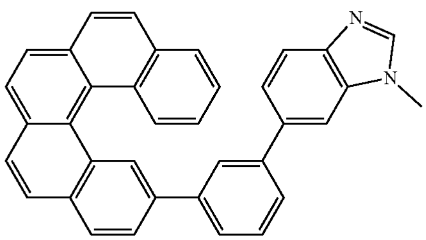
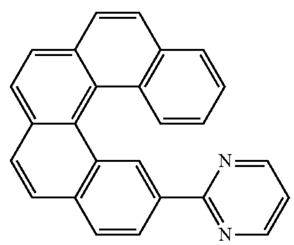
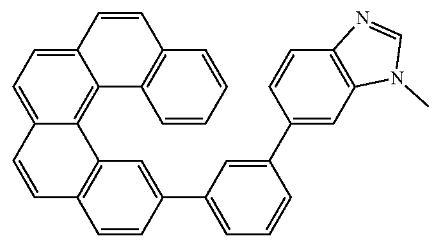
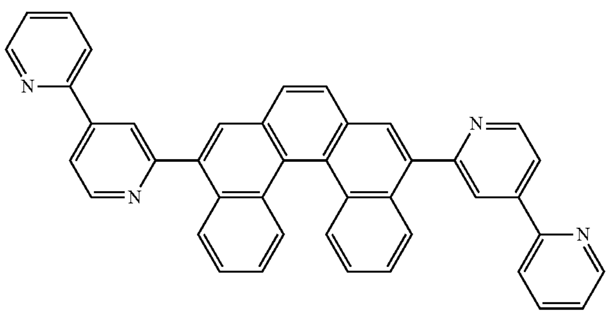
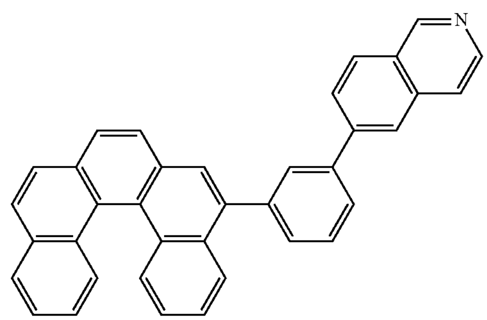
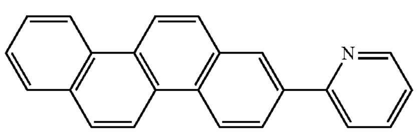
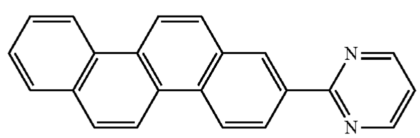
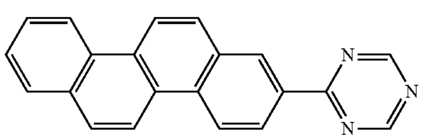
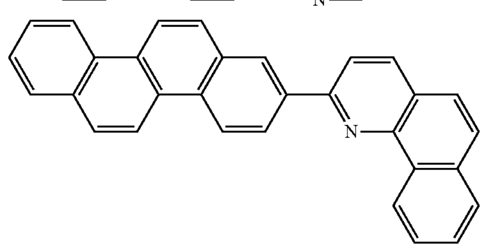
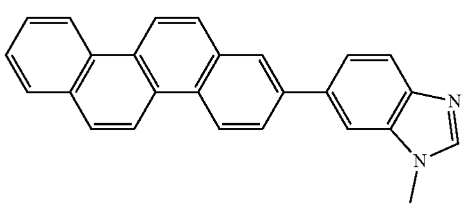
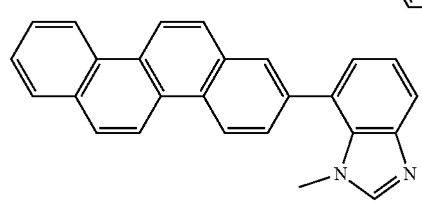
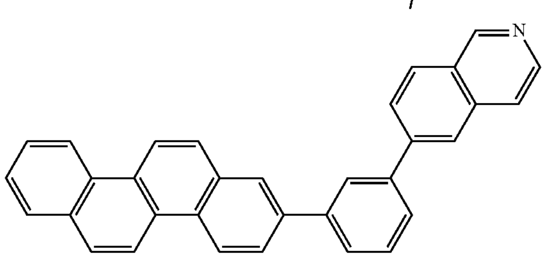
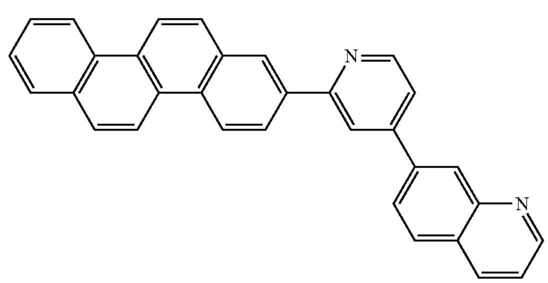

-continued
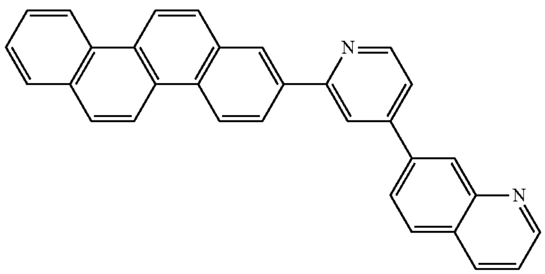
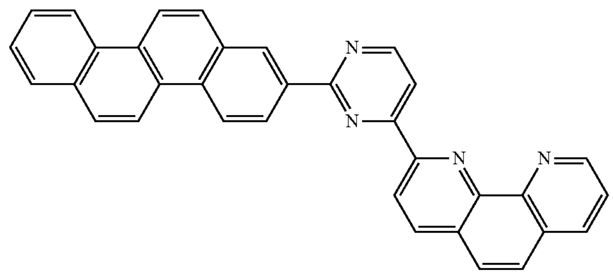
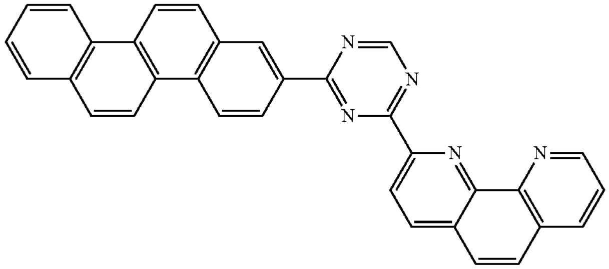
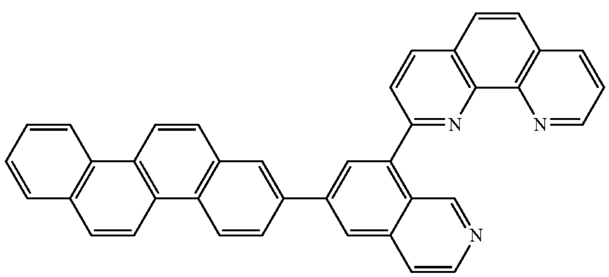
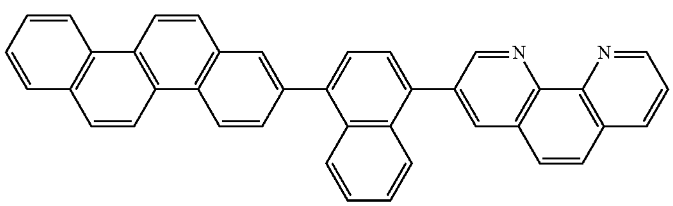
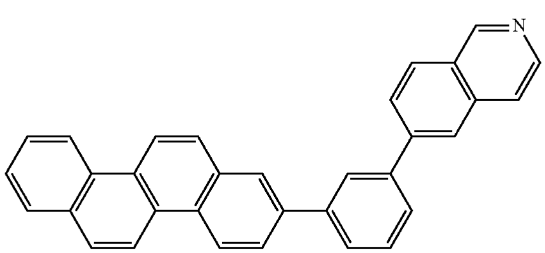
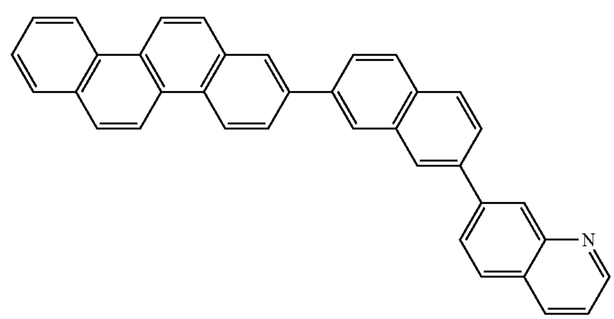
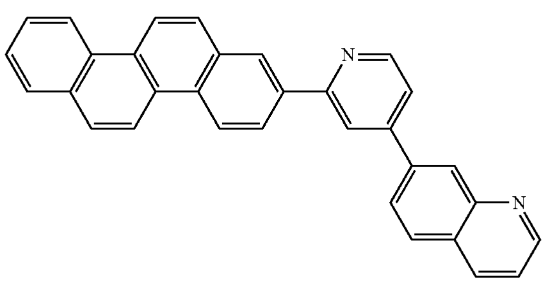
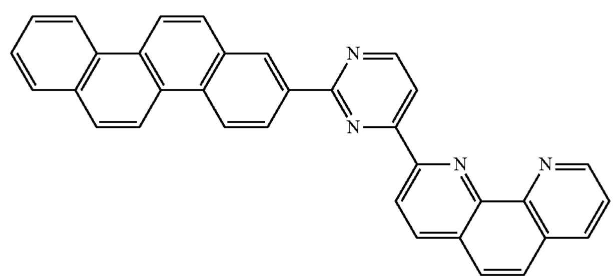

-continued
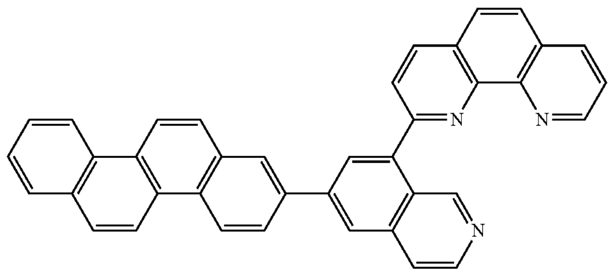
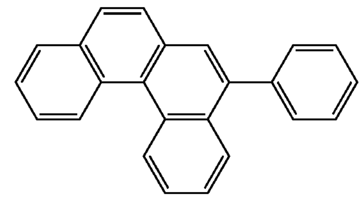
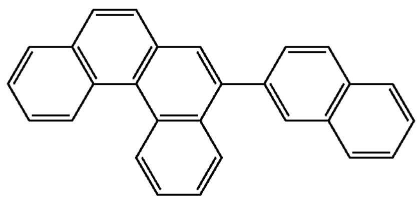
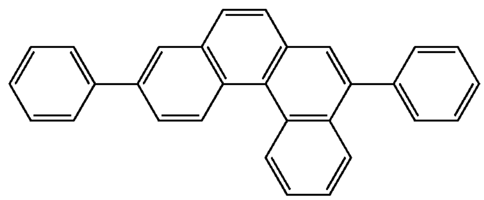
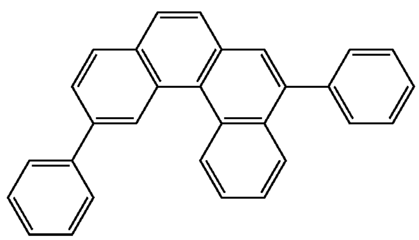
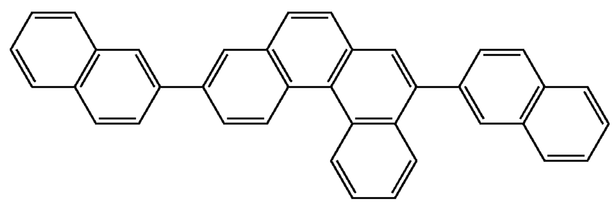
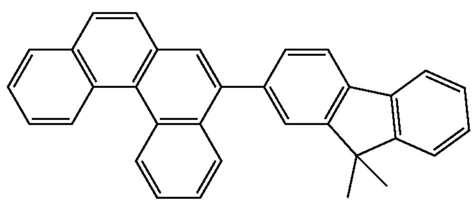
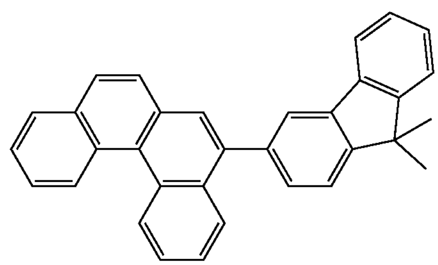
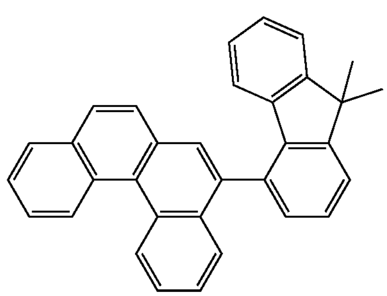
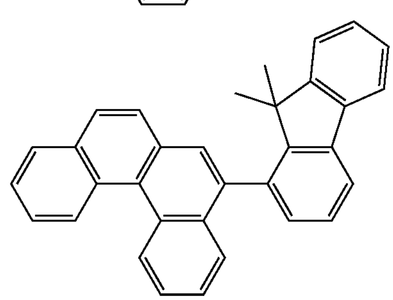
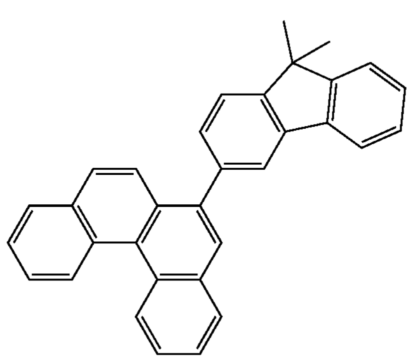
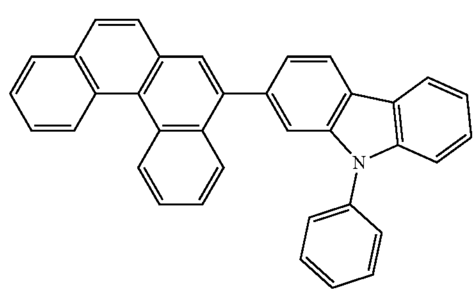

-continued
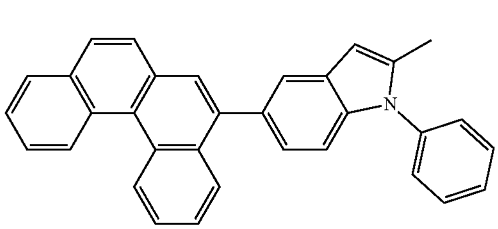
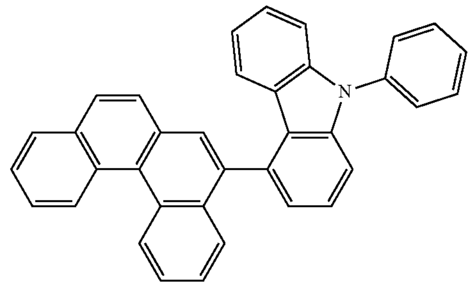
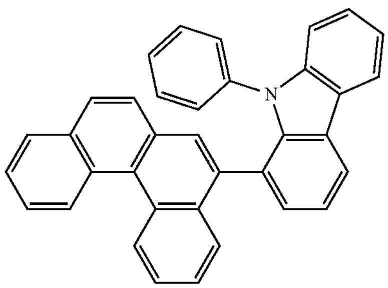
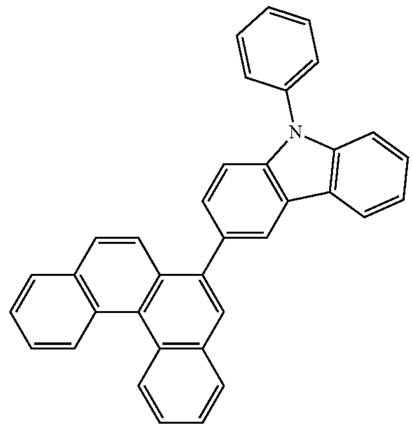
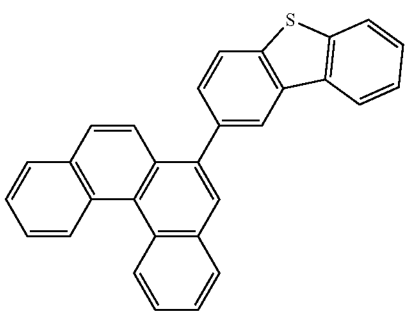
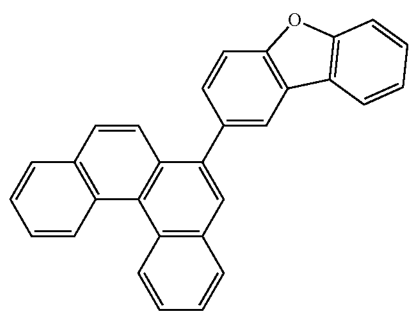
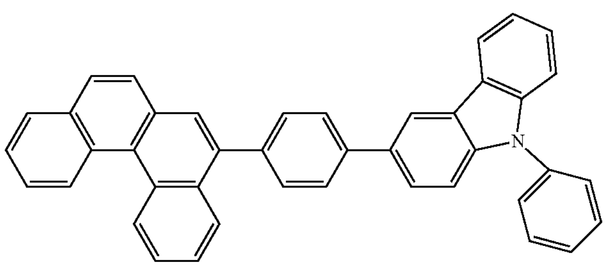
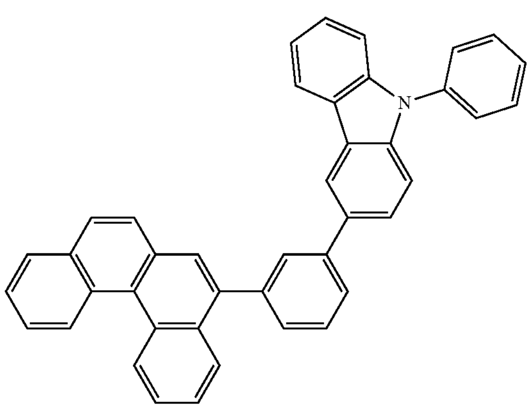
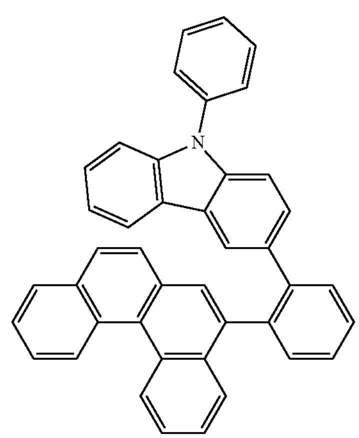

-continued
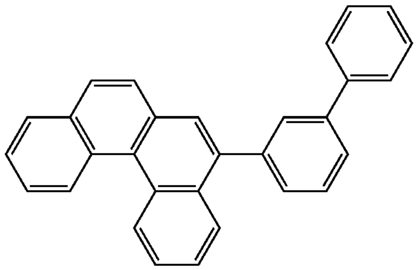
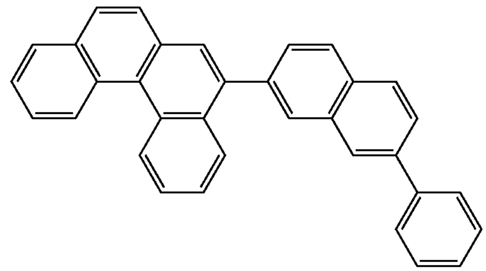
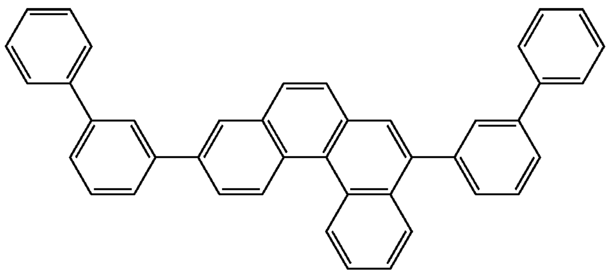
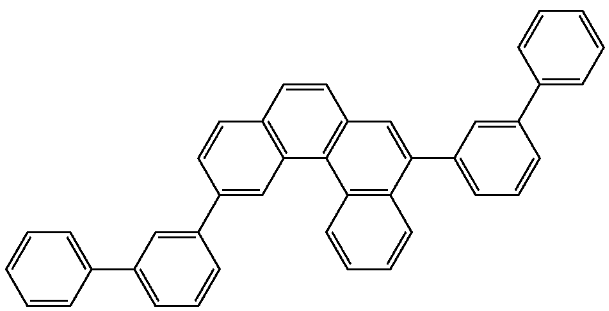
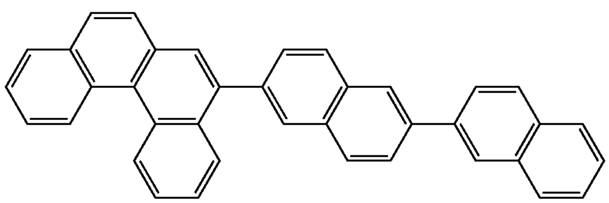
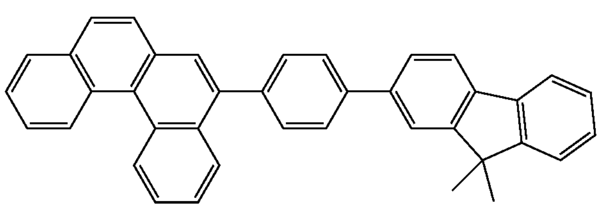
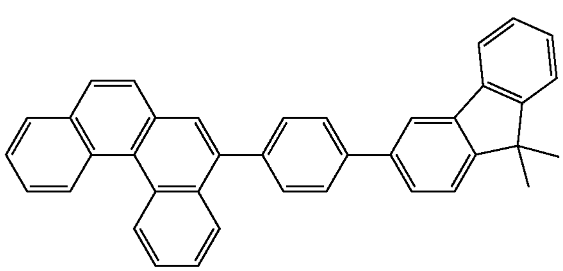
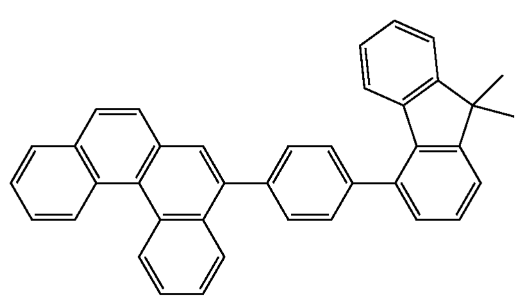

-continued
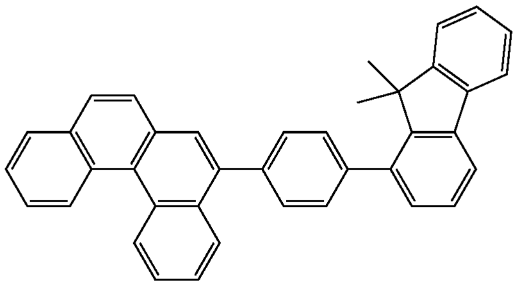
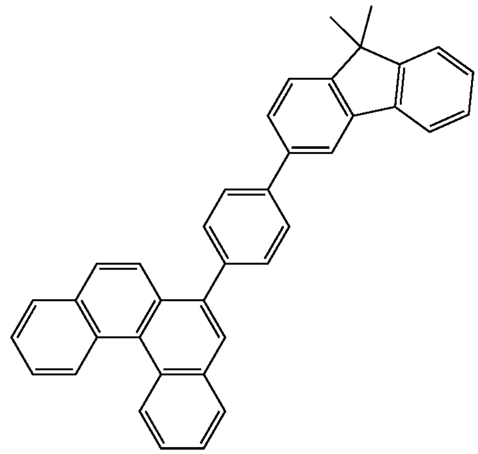
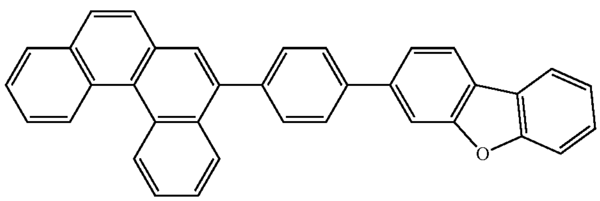
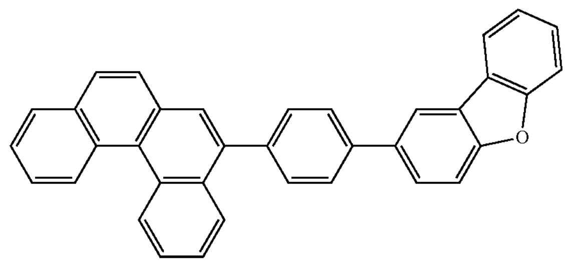
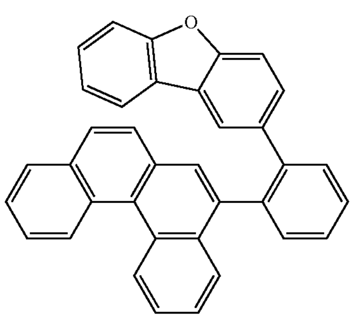
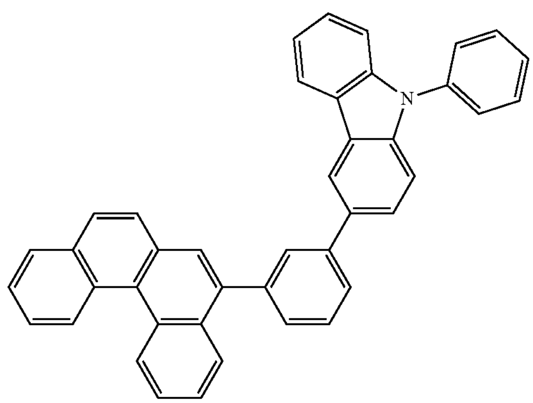
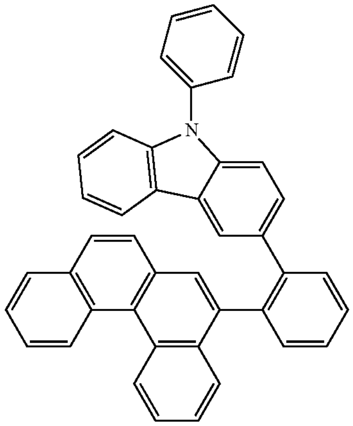
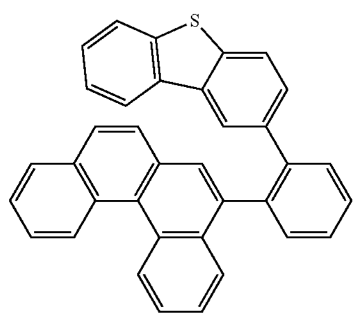

-continued
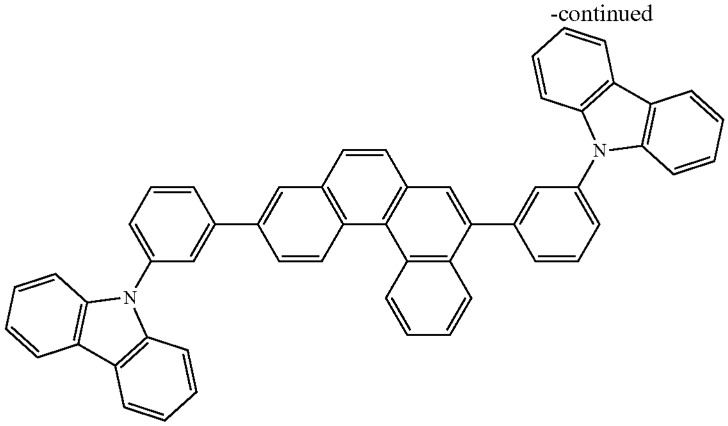
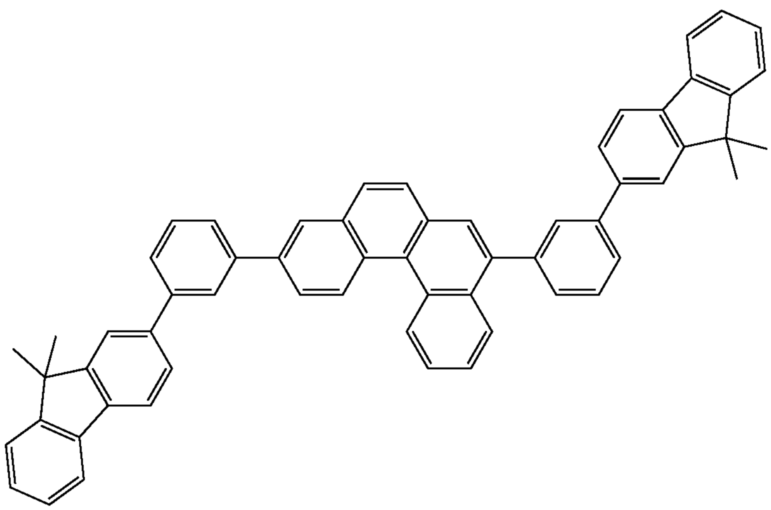
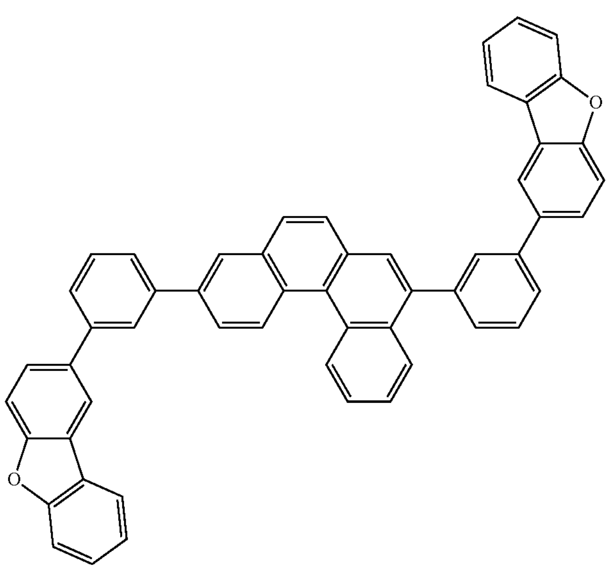

-continued
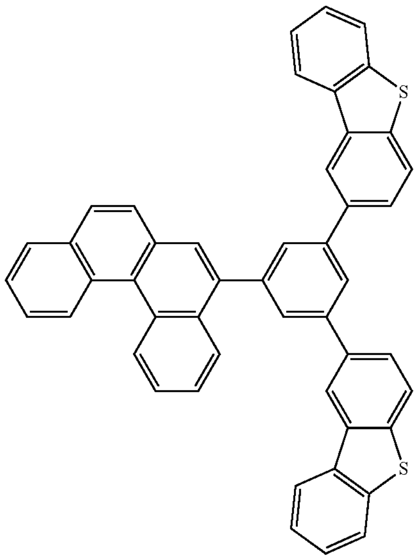
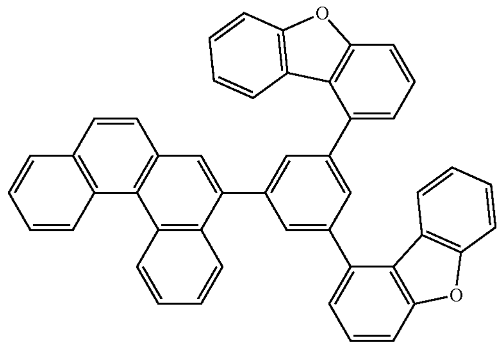
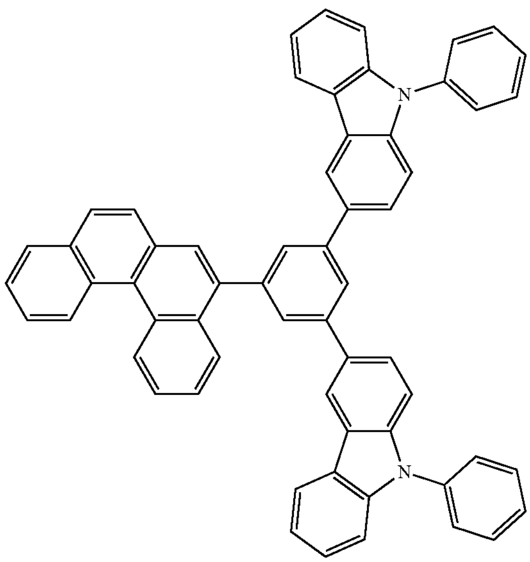
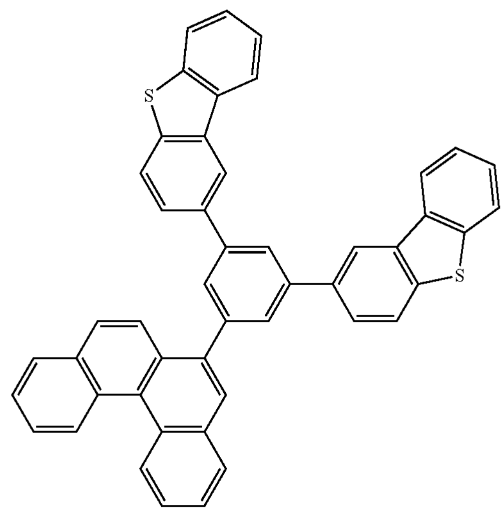
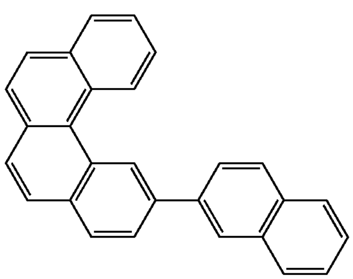
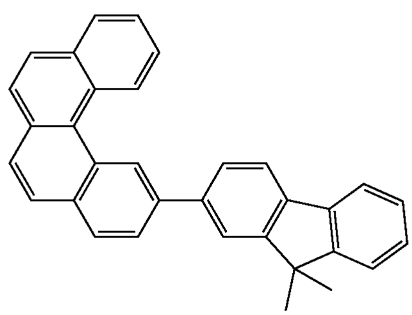
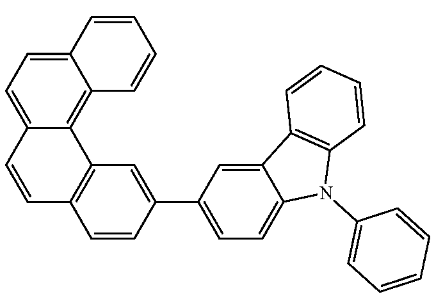
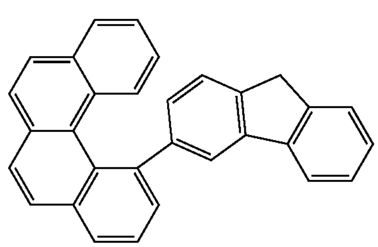
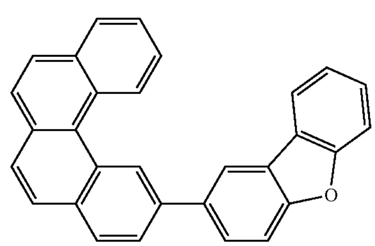

-continued
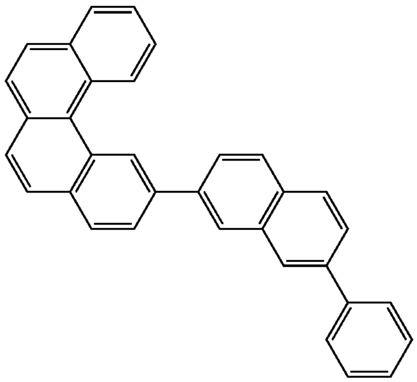
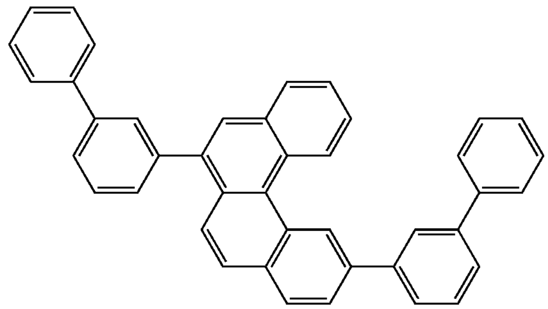
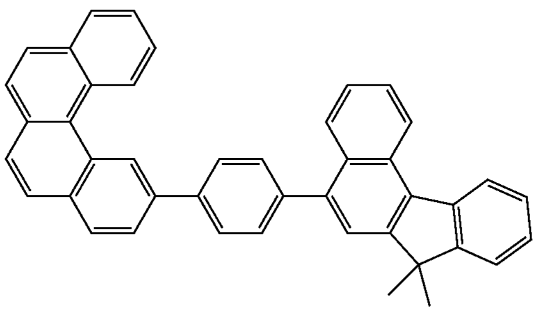
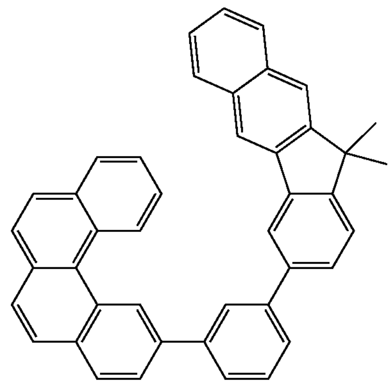
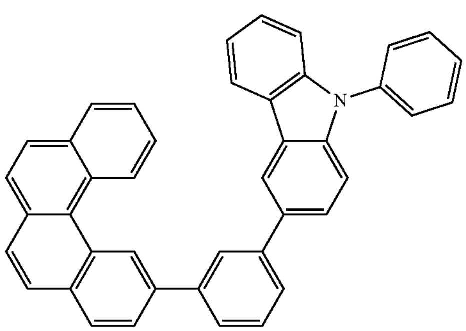
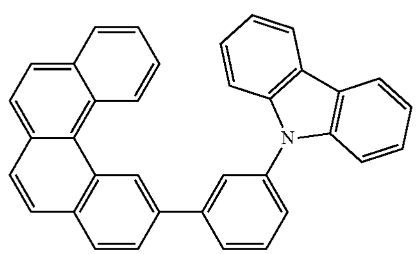
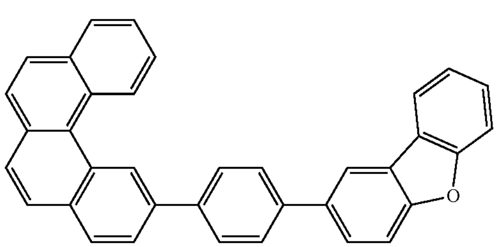
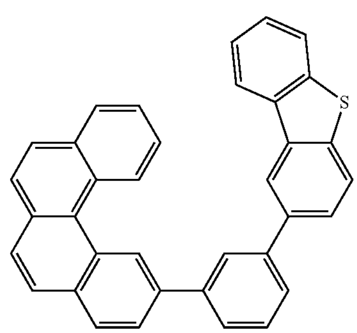

-continued
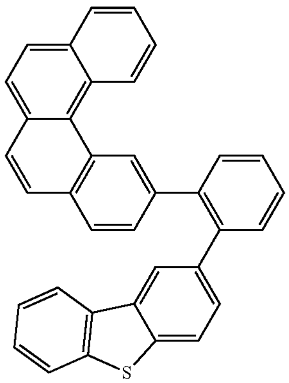
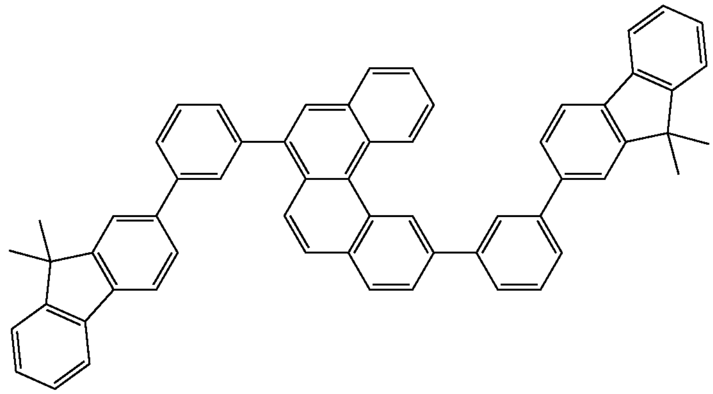
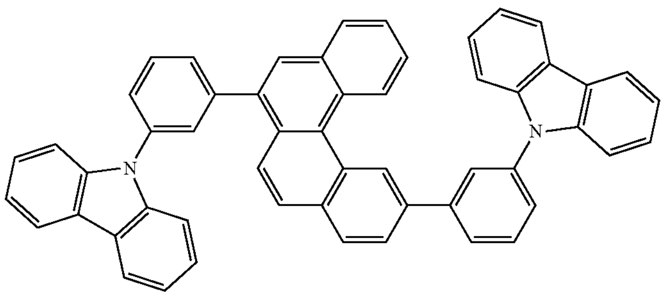
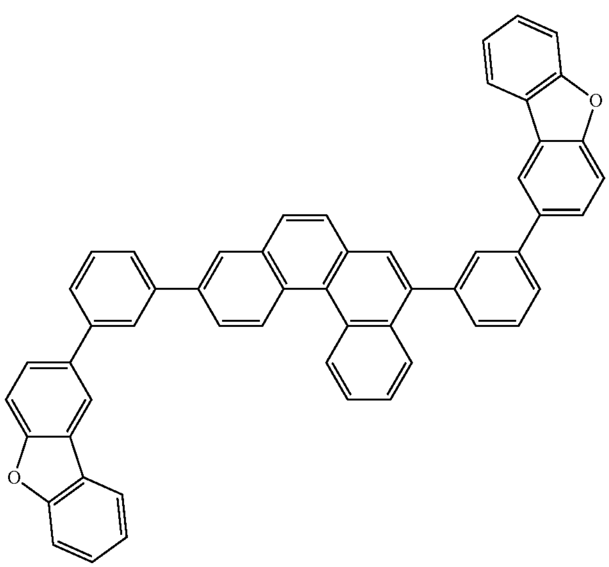
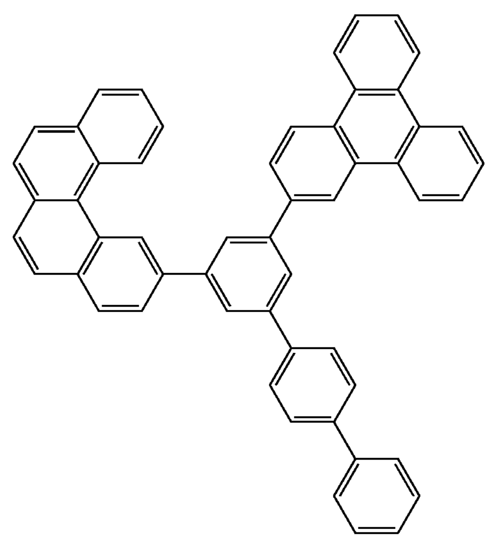

-continued
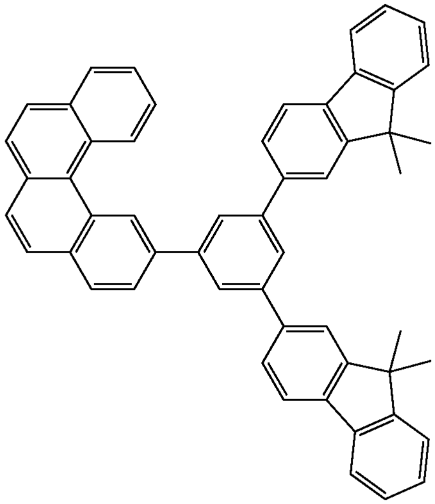
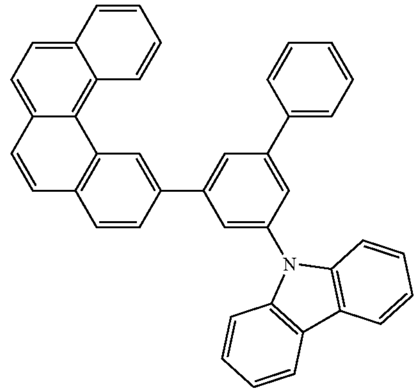
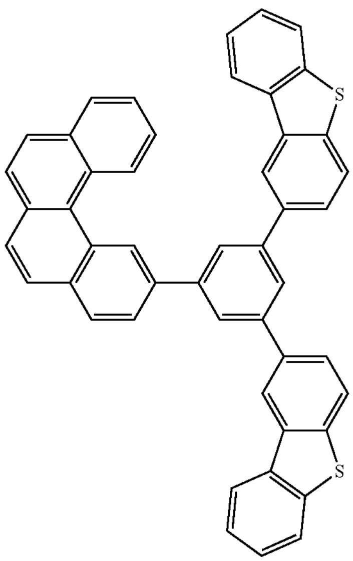
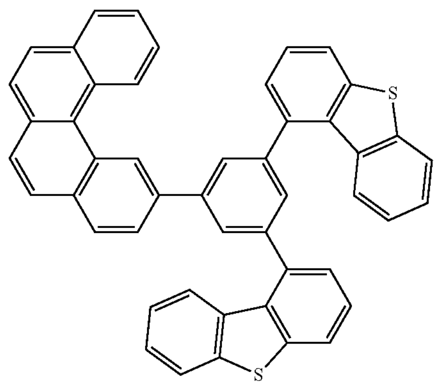
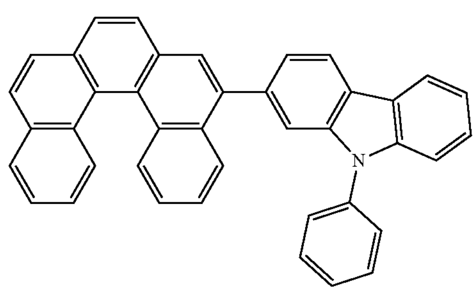
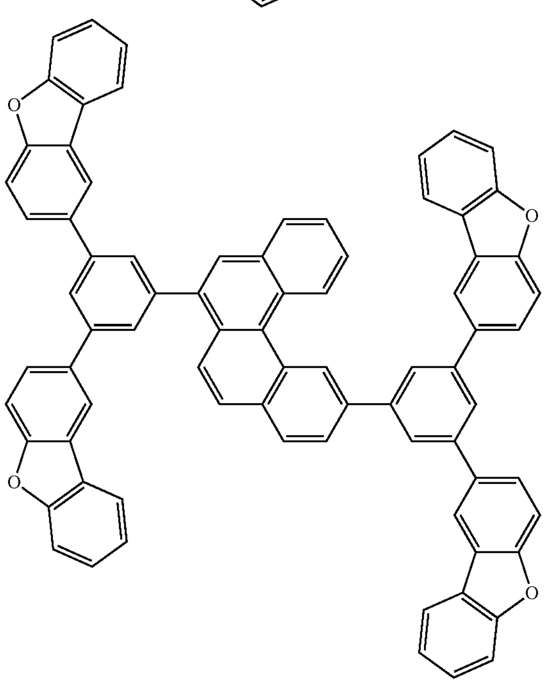

-continued
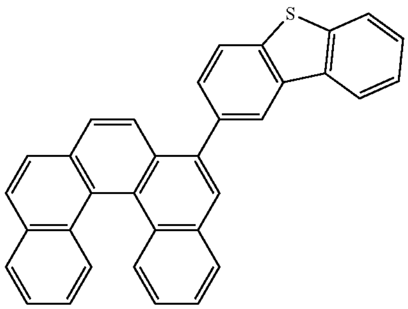
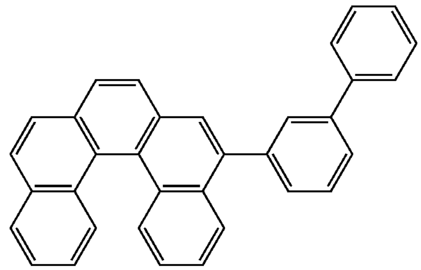
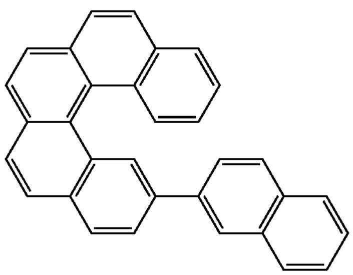
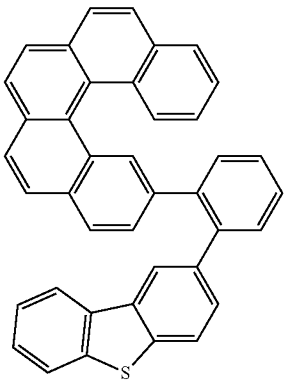
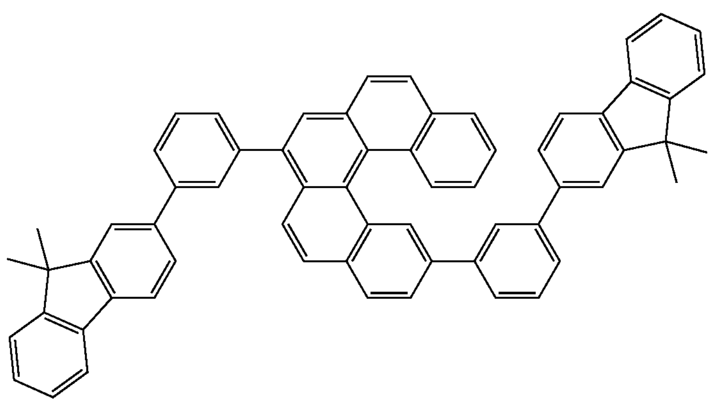
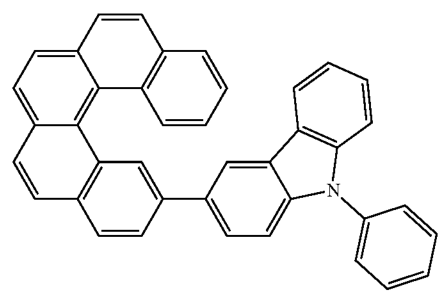
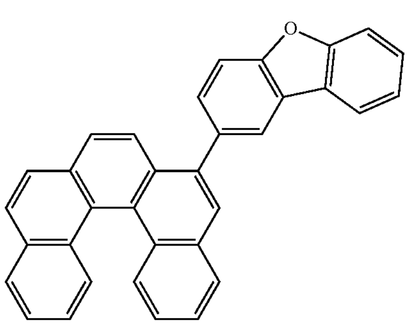
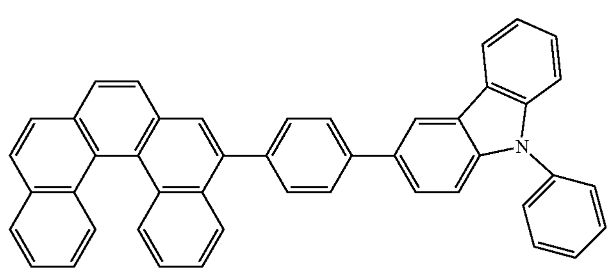

-continued
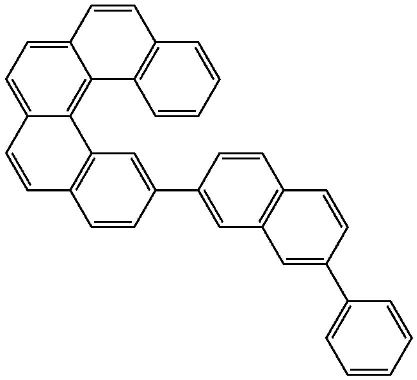
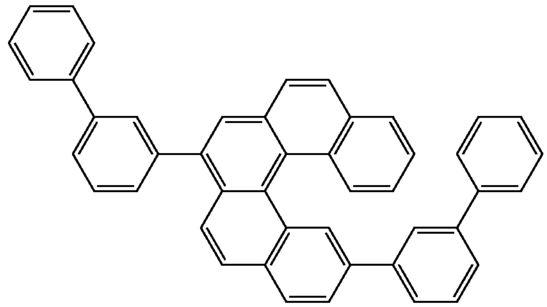
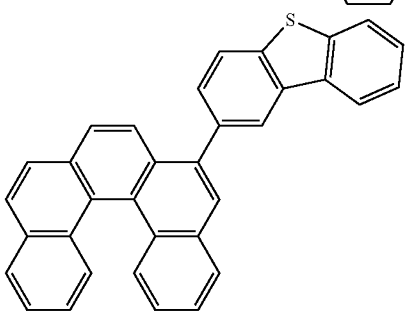
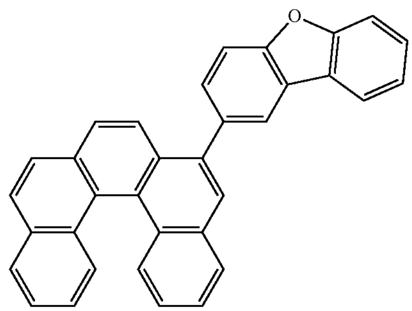
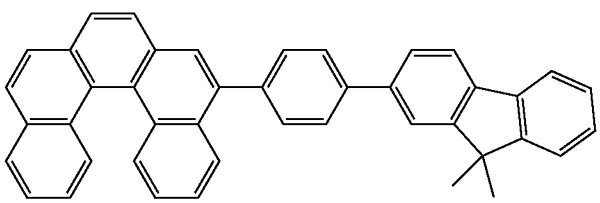
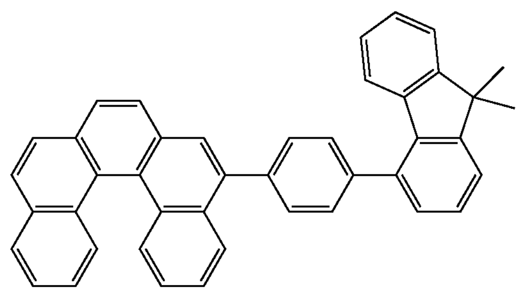
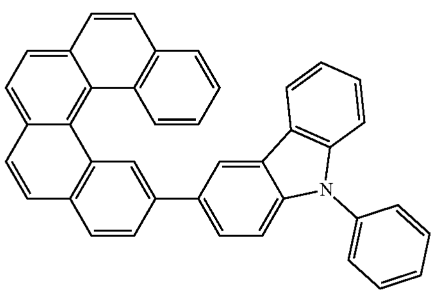
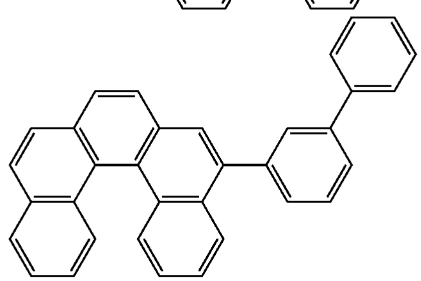
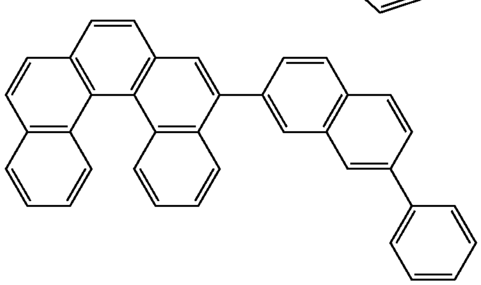
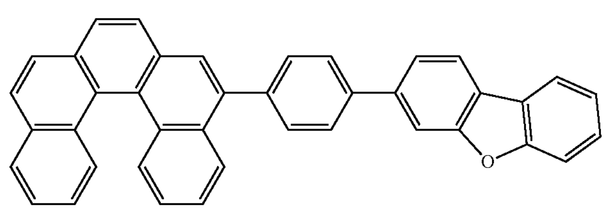
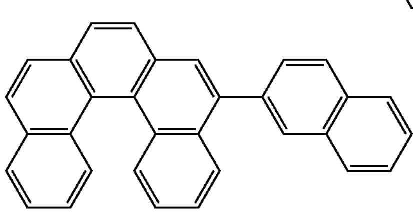
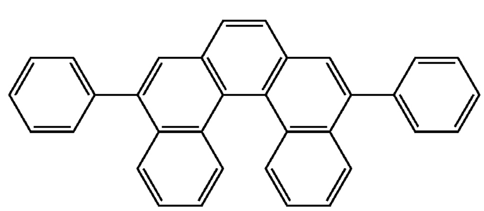

-continued
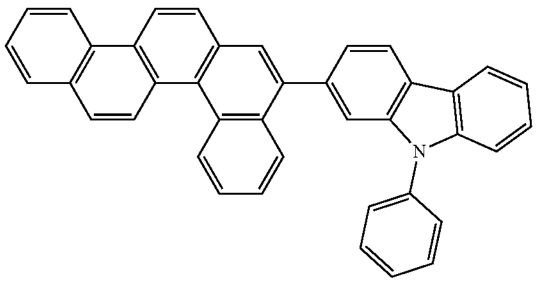
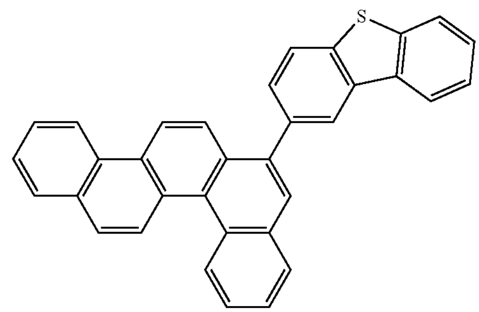
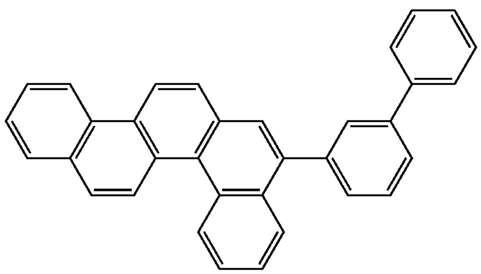
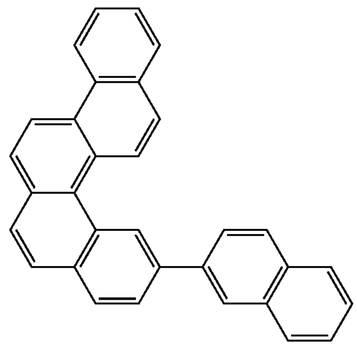
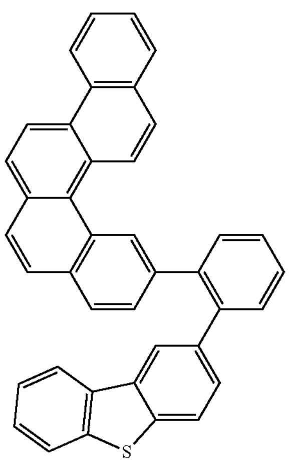
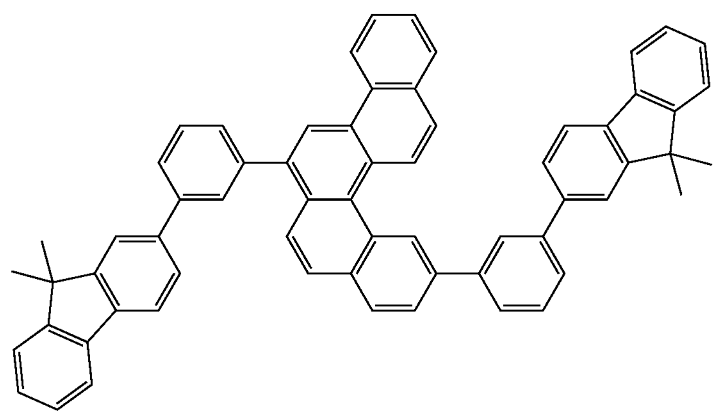
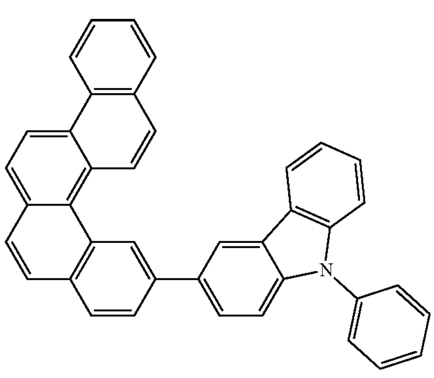
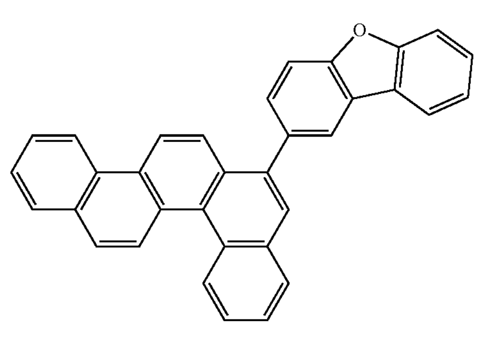

-continued
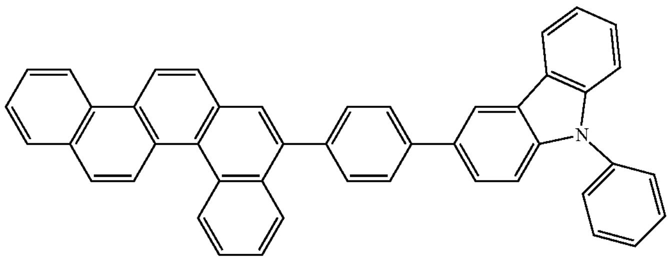
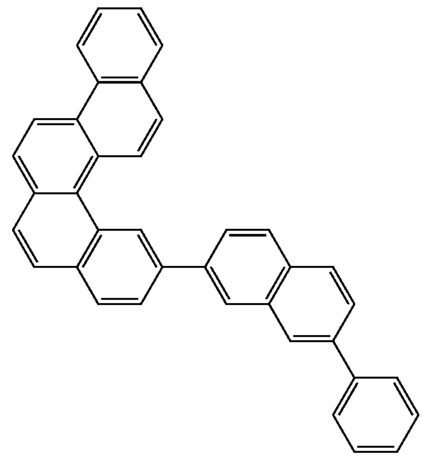
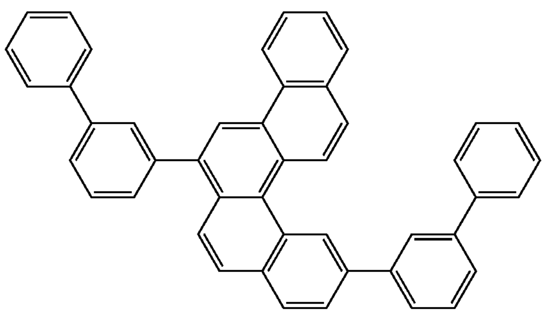
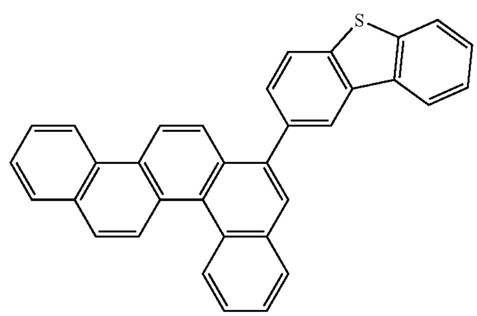
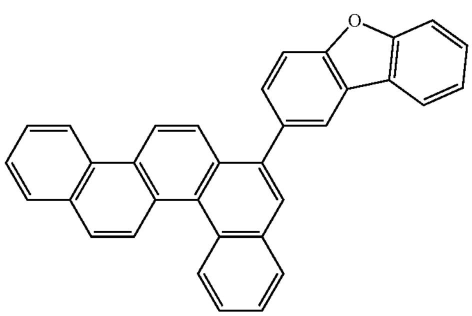
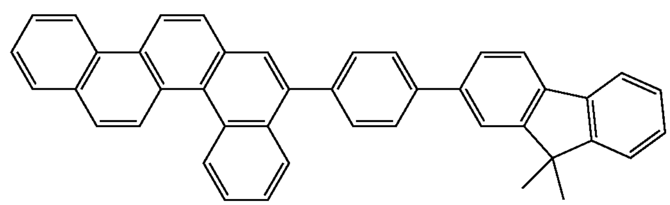
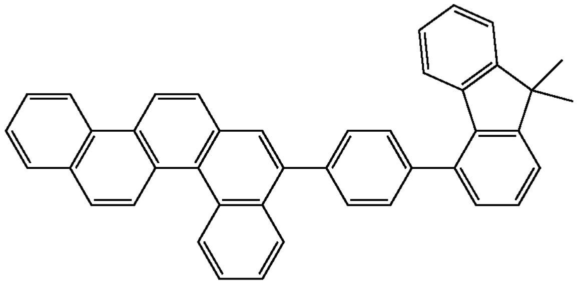
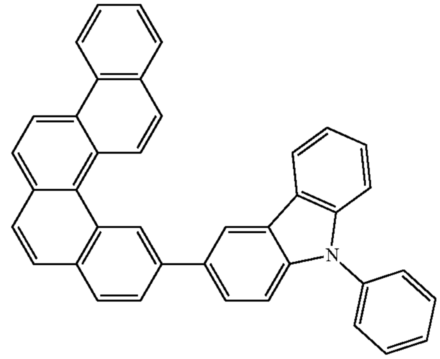

-continued
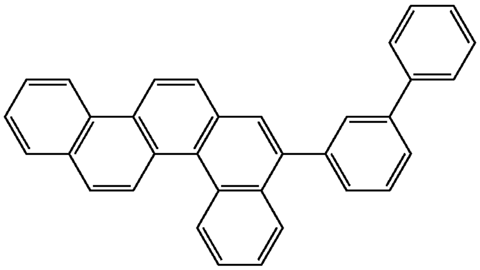
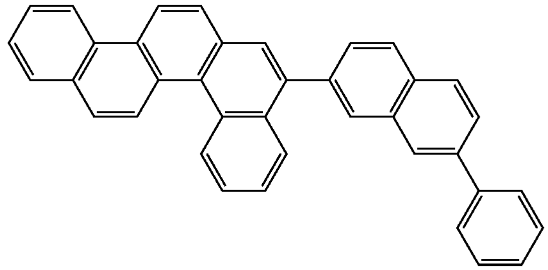
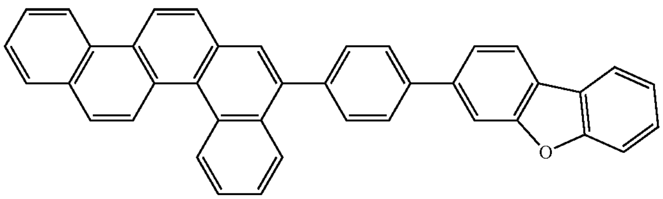
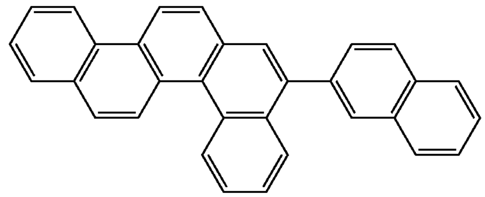
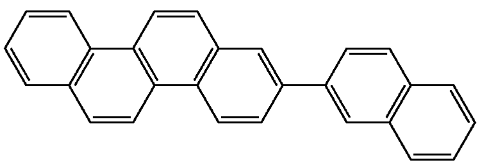
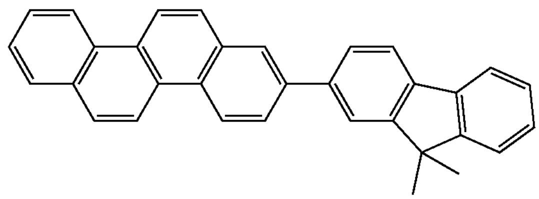
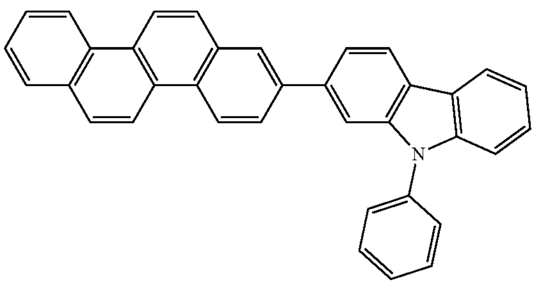
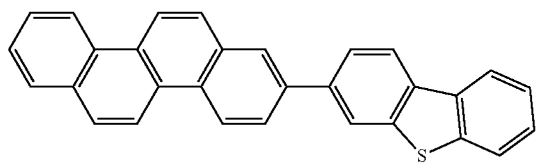
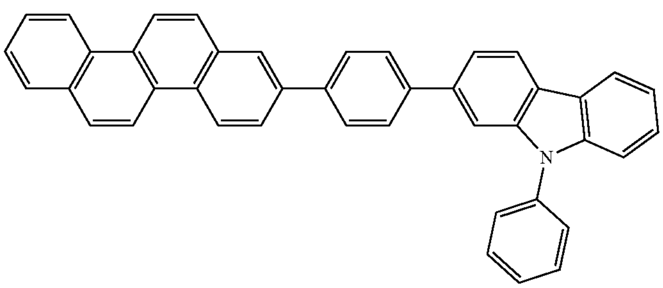
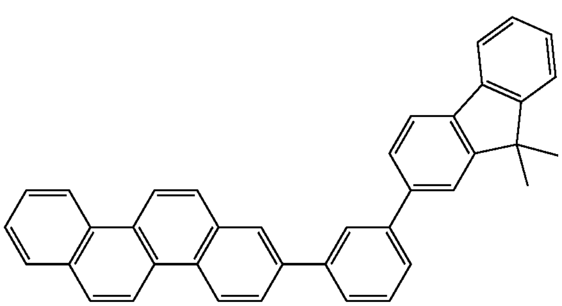
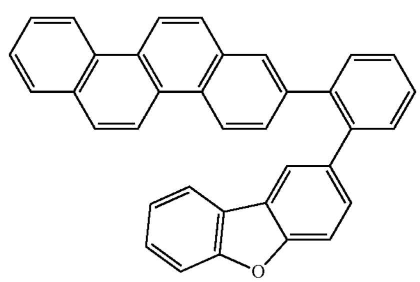

-continued
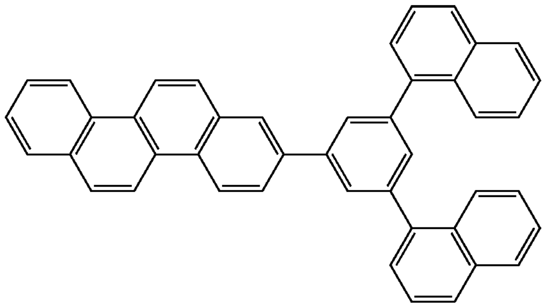
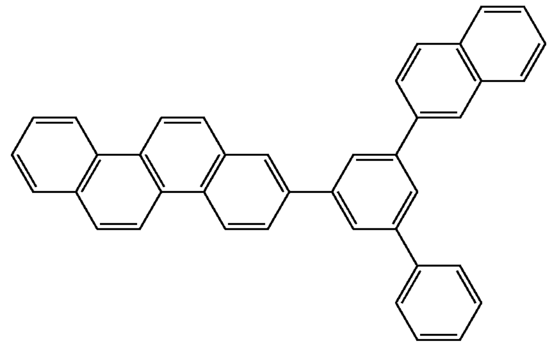
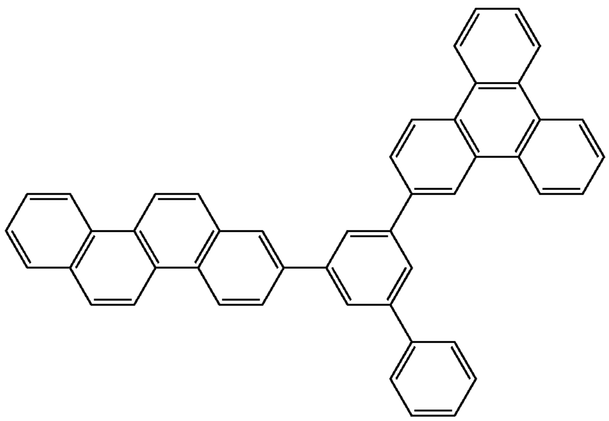
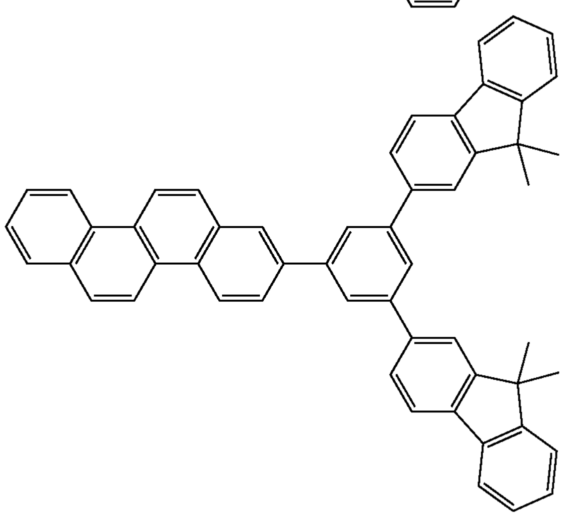
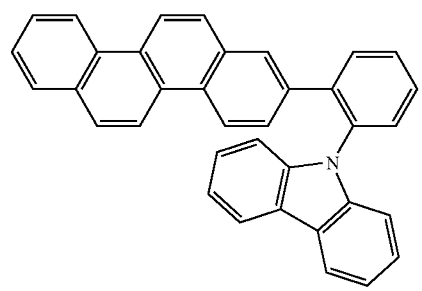
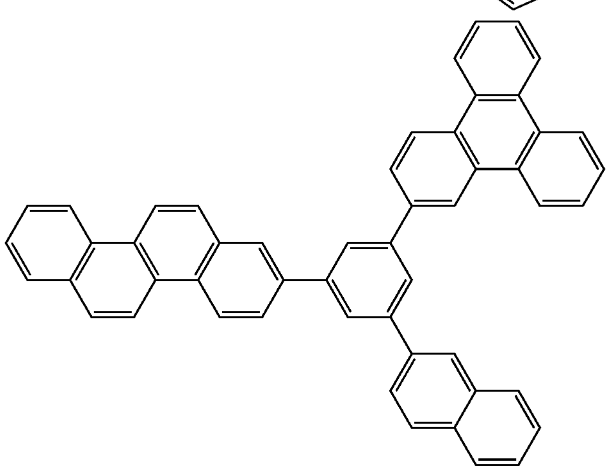

-continued
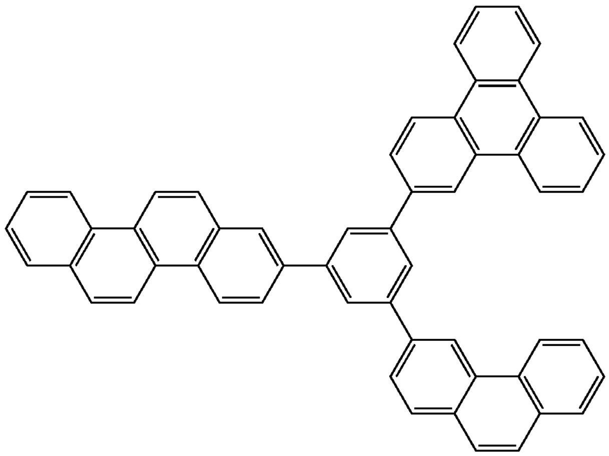
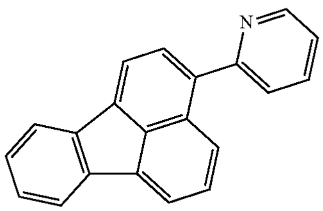
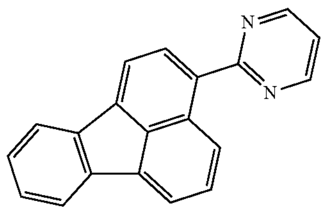
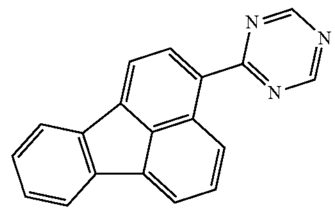
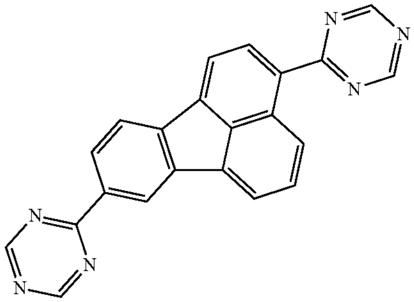
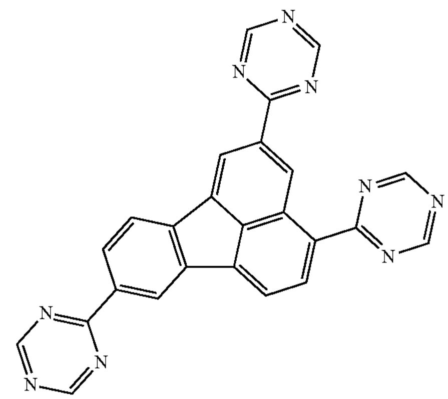
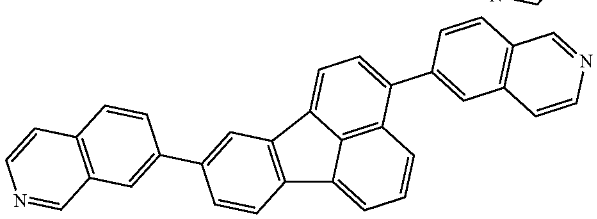
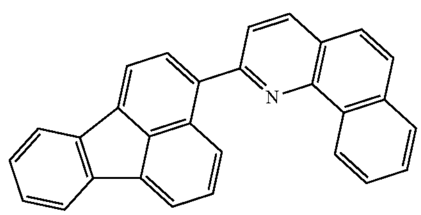
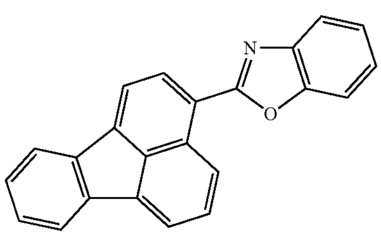
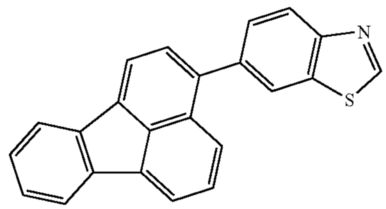
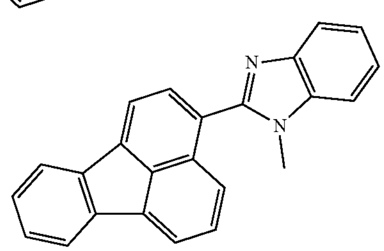
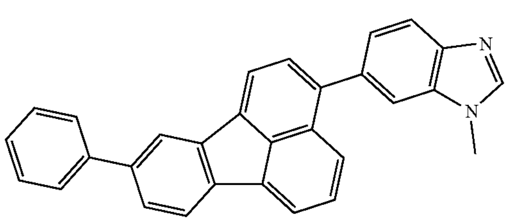
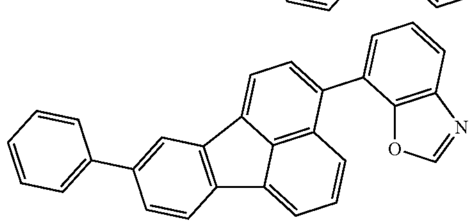

-continued
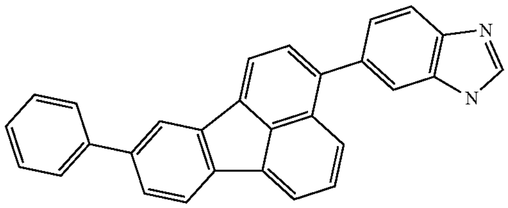
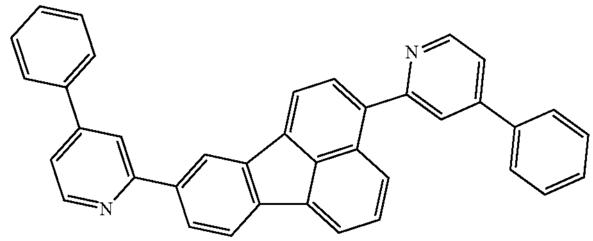
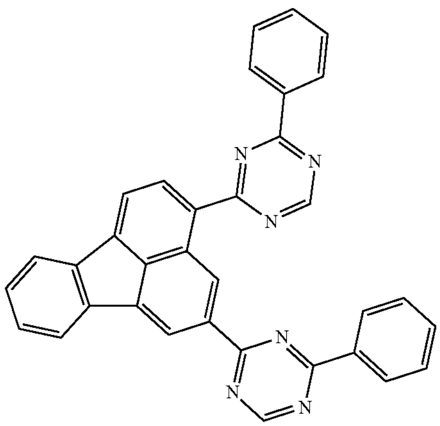
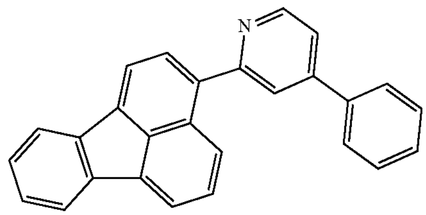
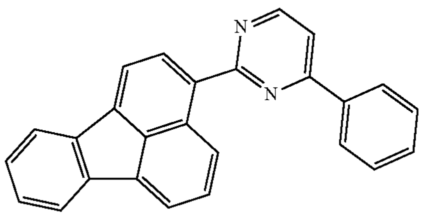
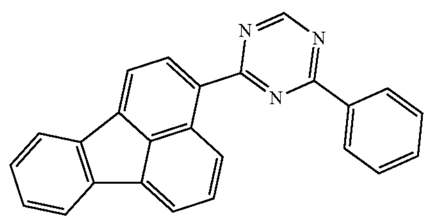
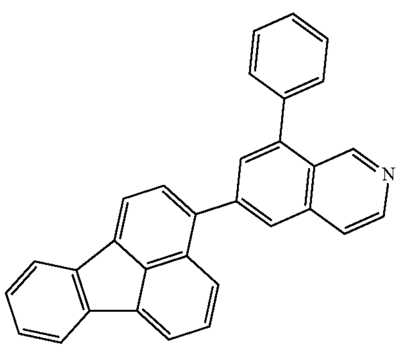
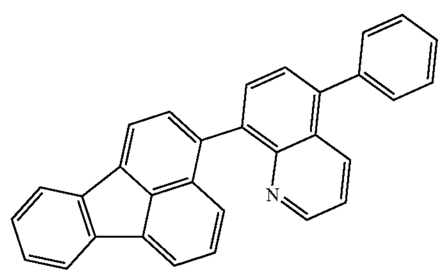
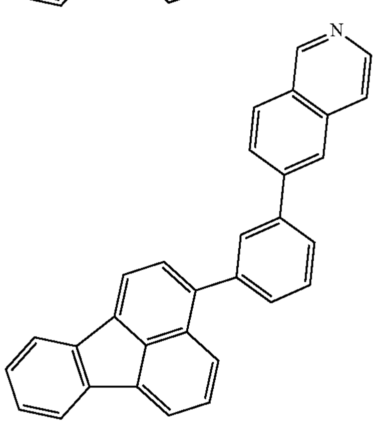
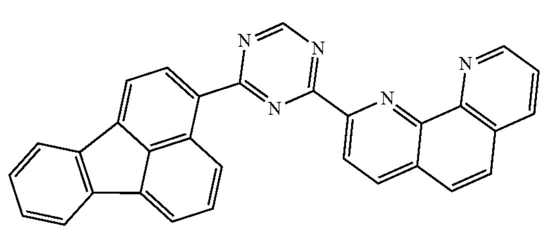

-continued
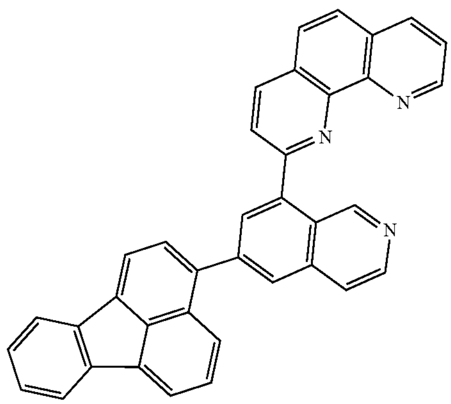
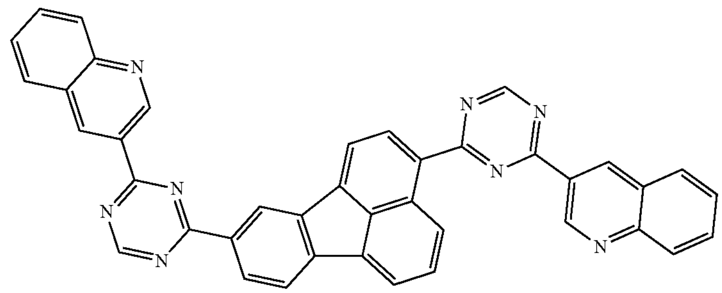
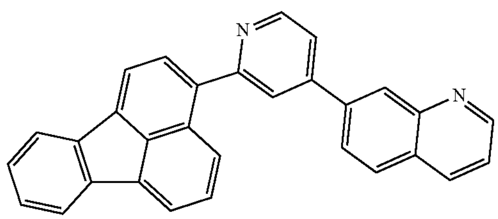
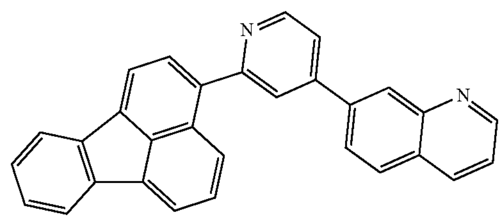
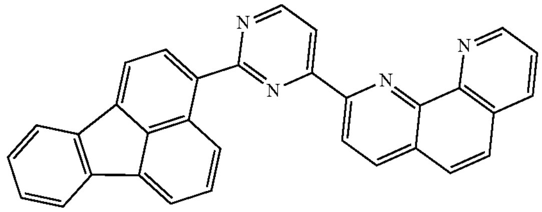
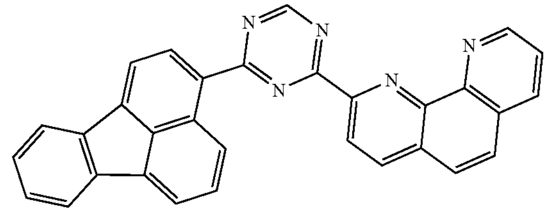
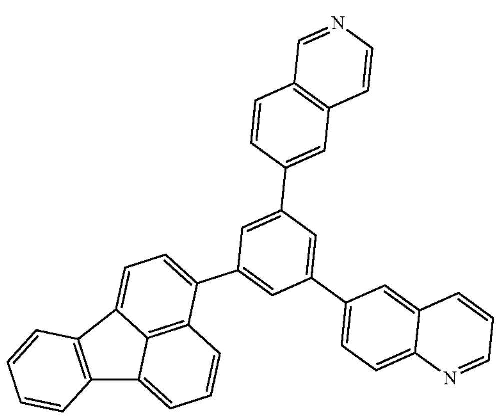
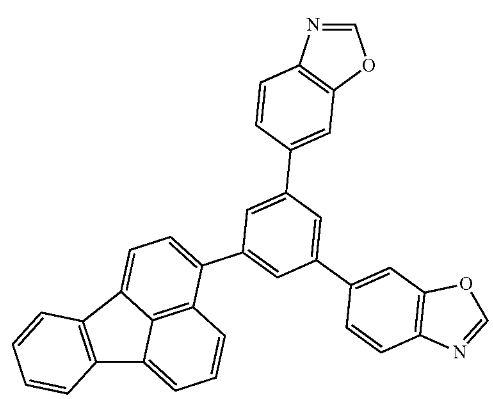
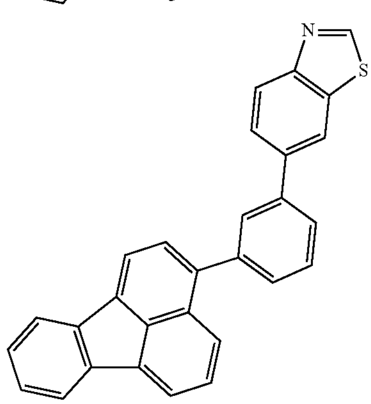
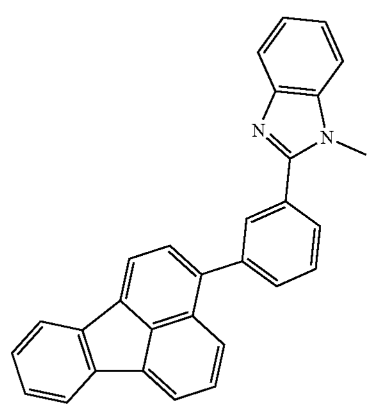
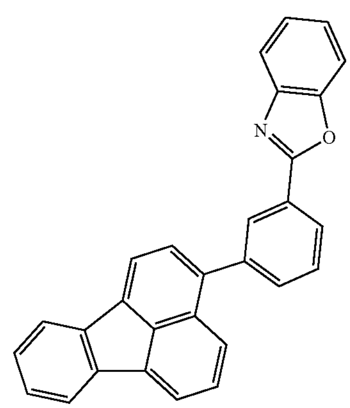

-continued
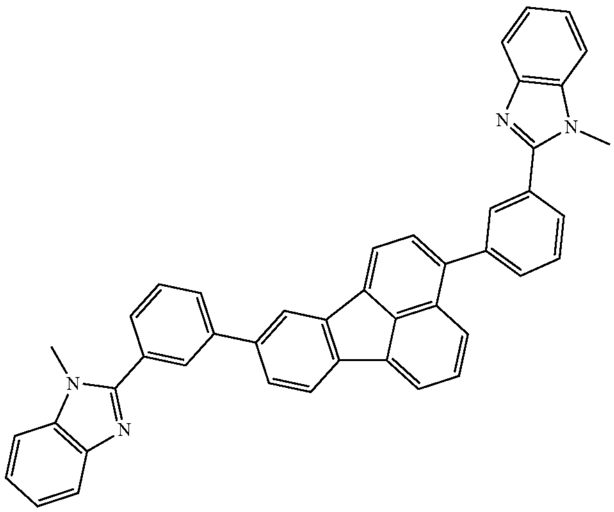
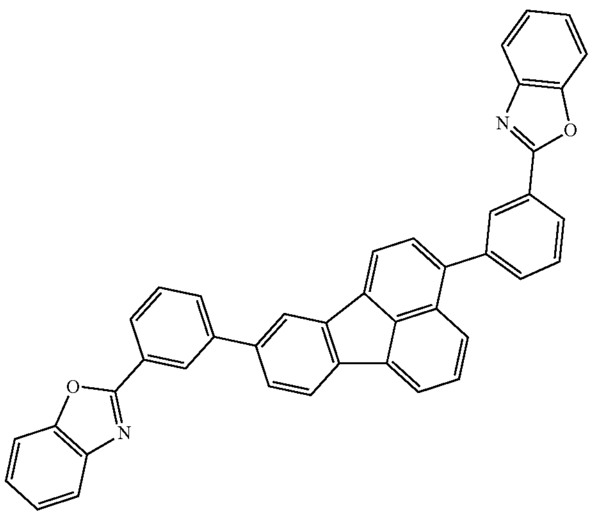
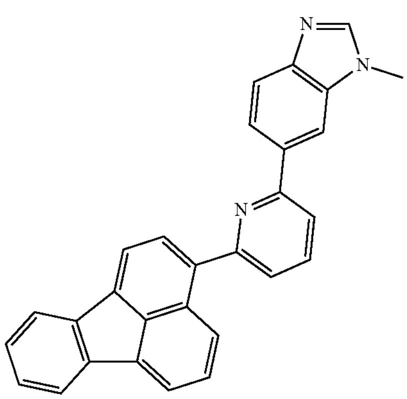
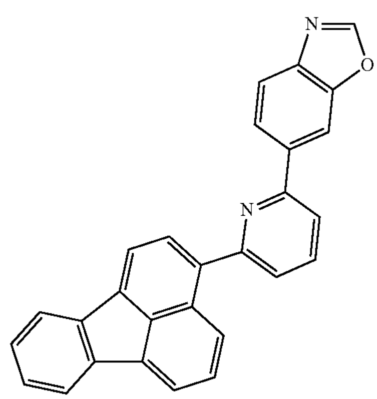

-continued
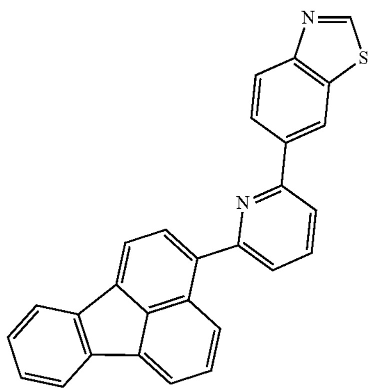
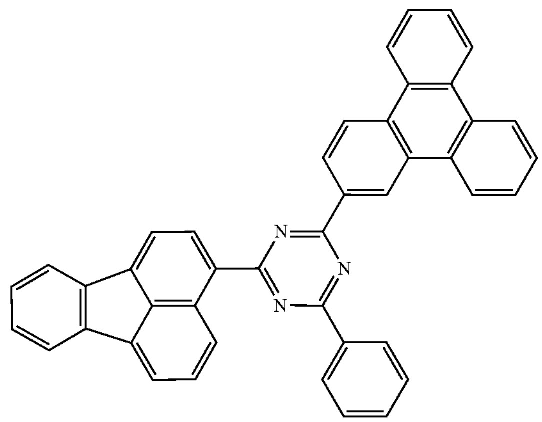
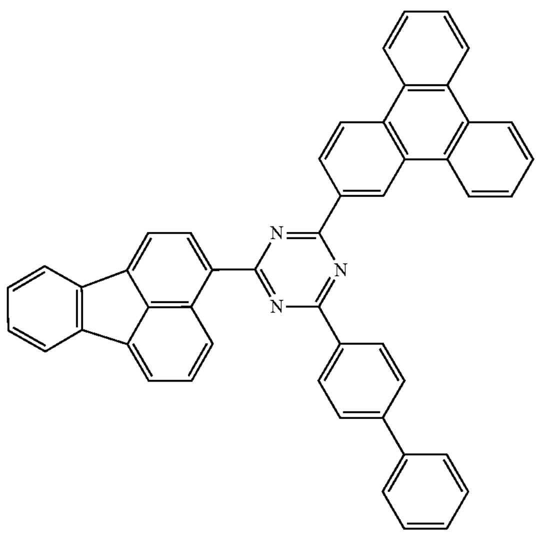
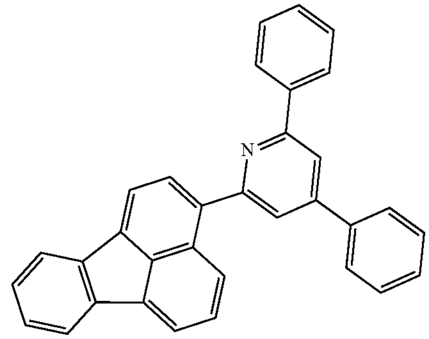
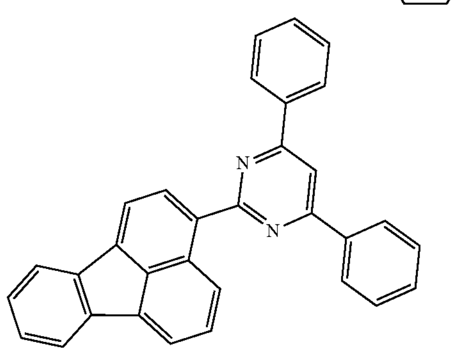
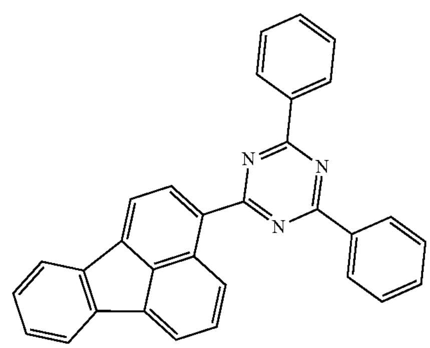
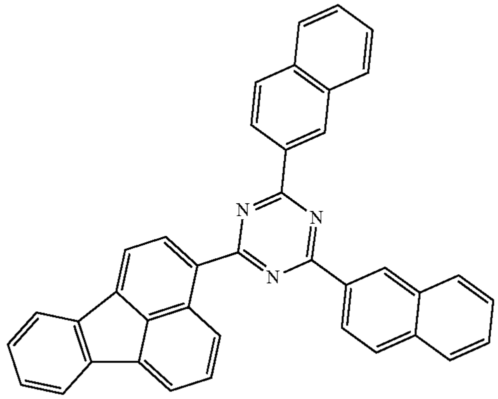
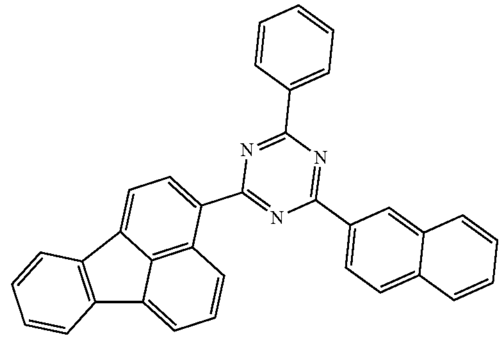

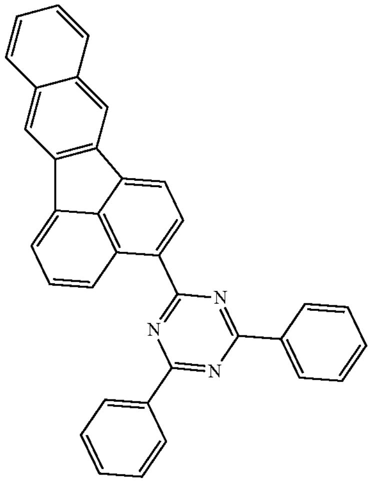
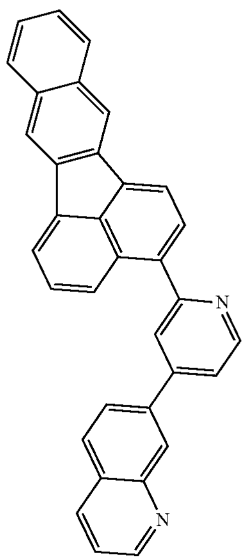
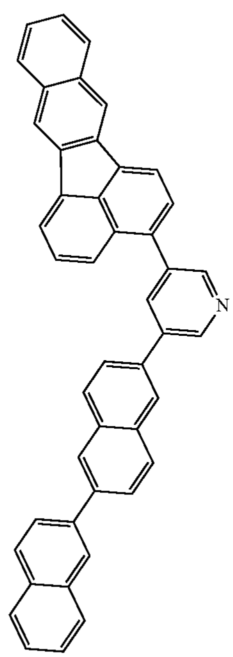
-continued
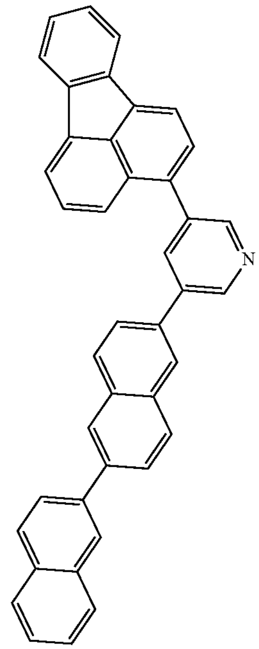
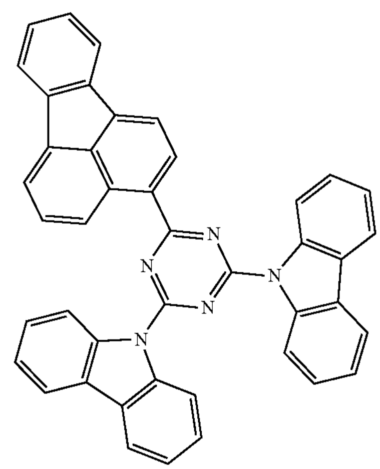
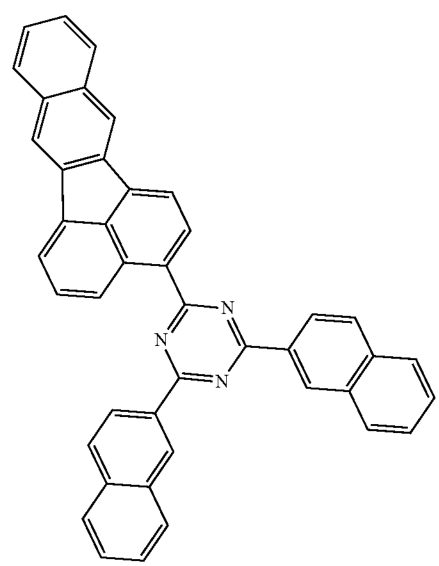

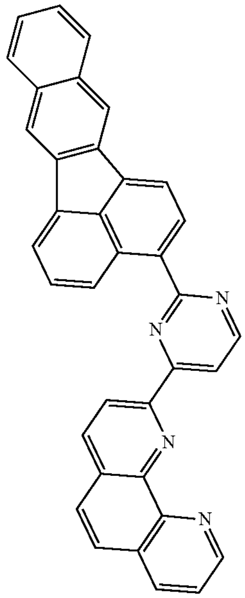
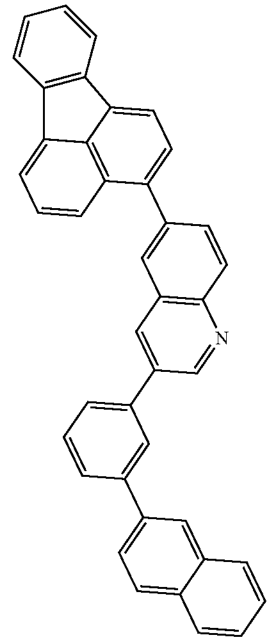
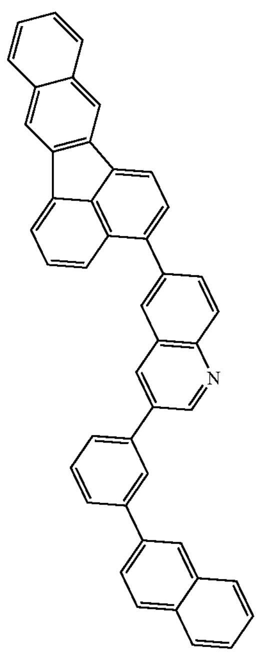
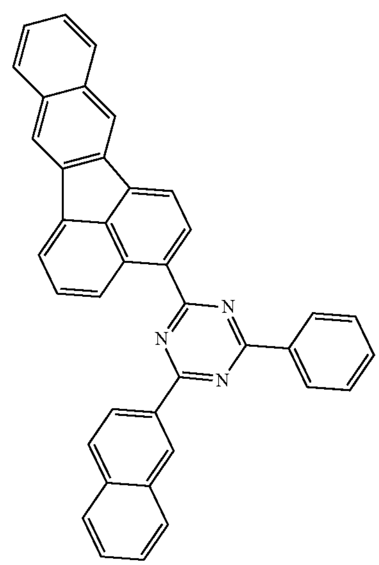

-continued
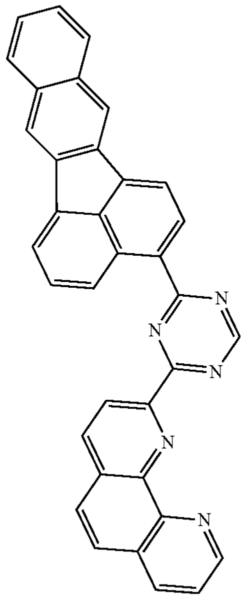
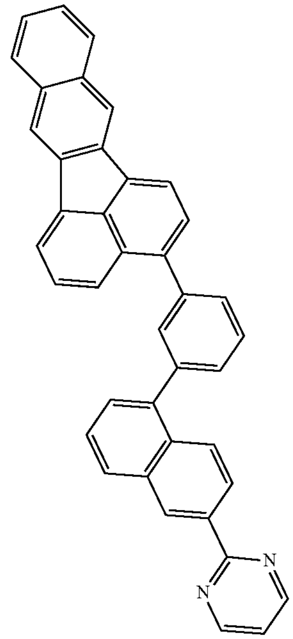
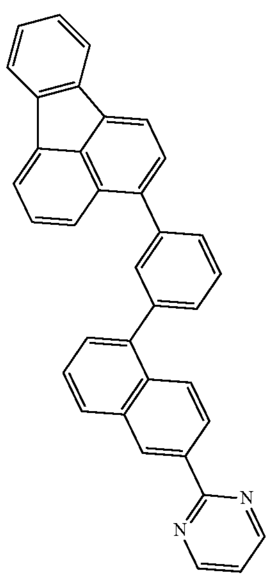
-continued
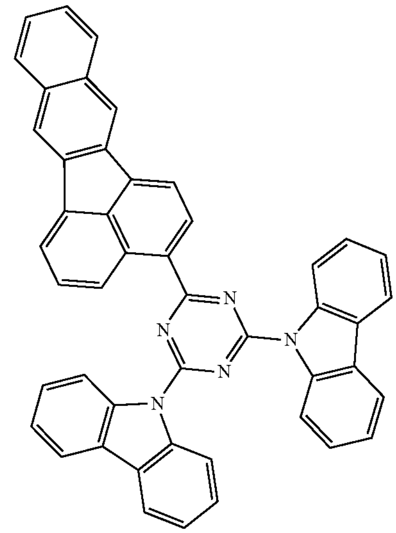
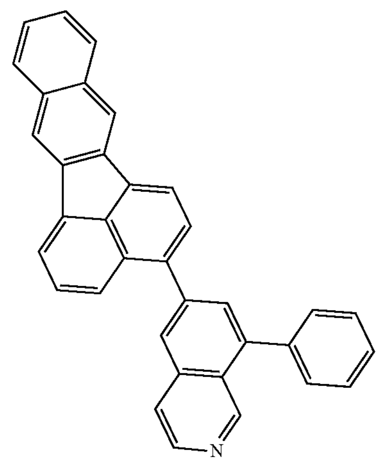
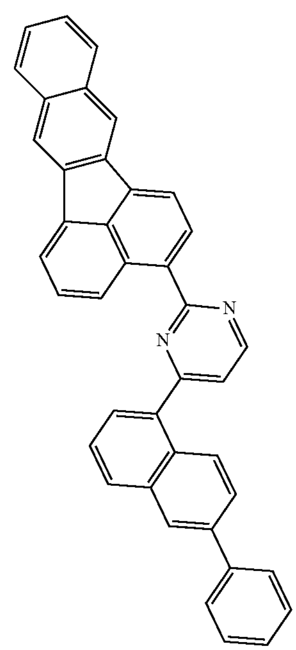
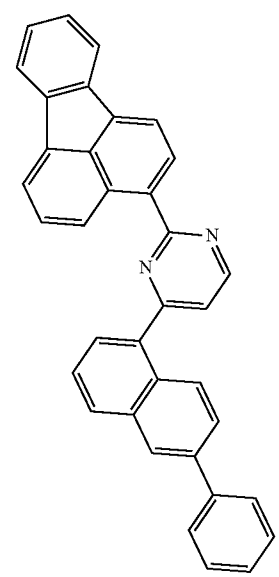

-continued
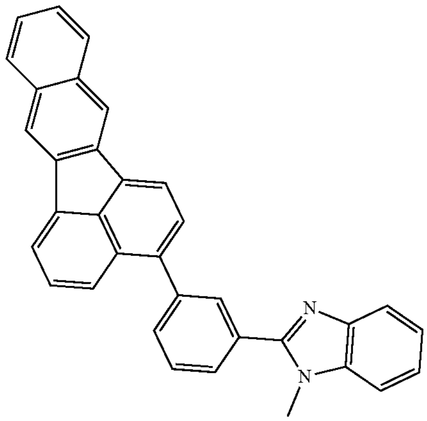
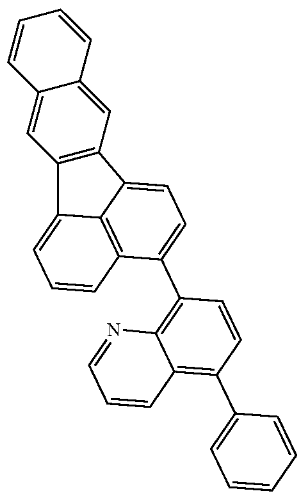
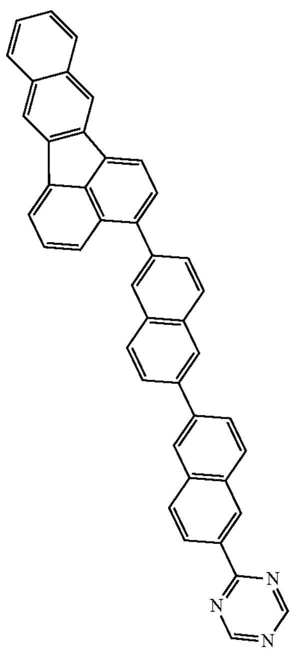
-continued
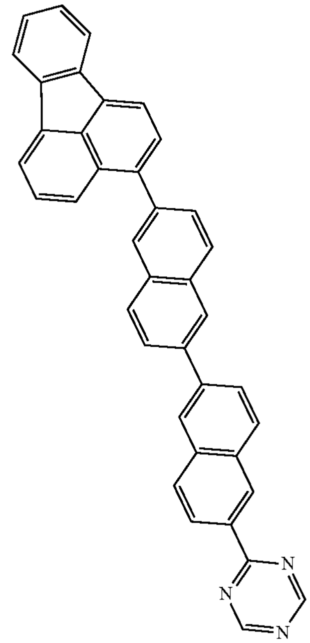
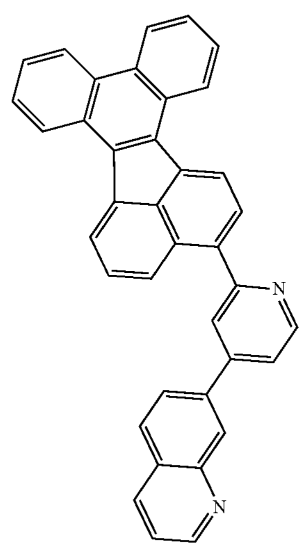

-continued
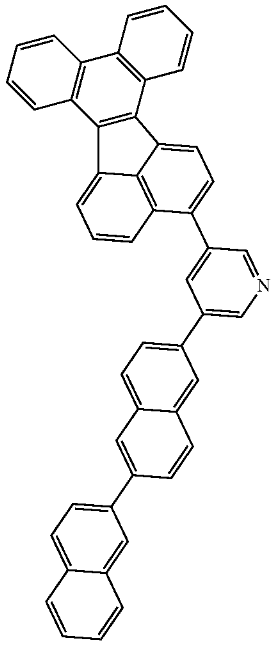
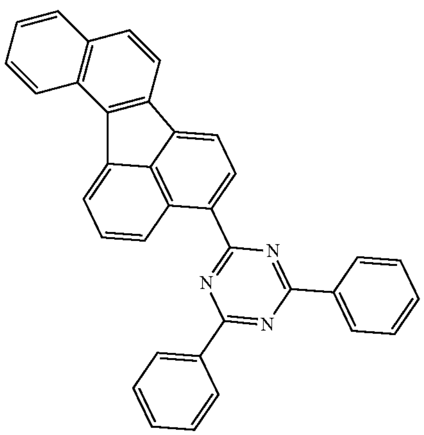
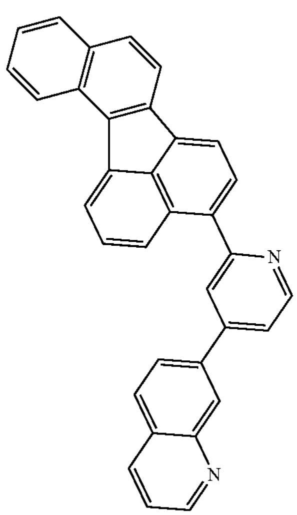
-continued
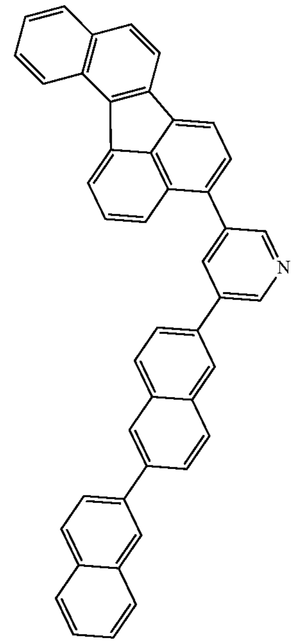
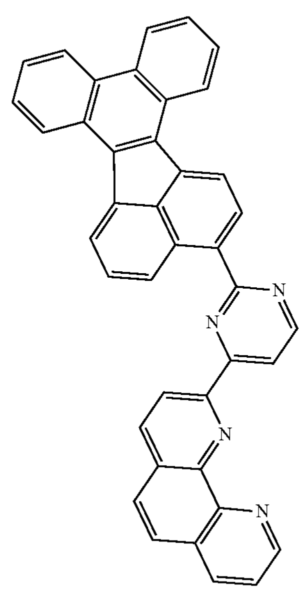

-continued
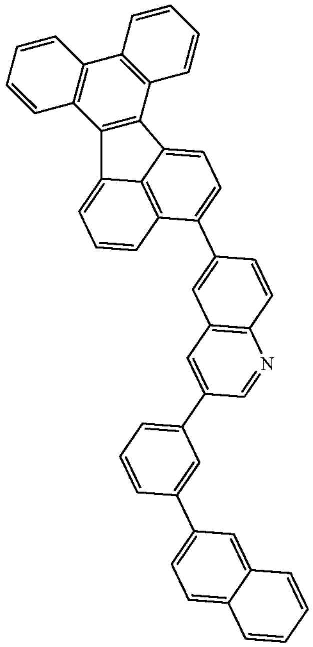
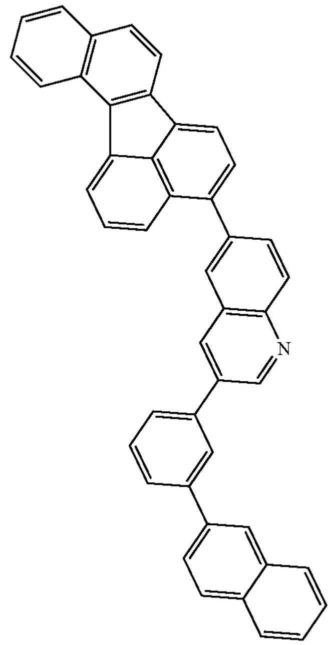
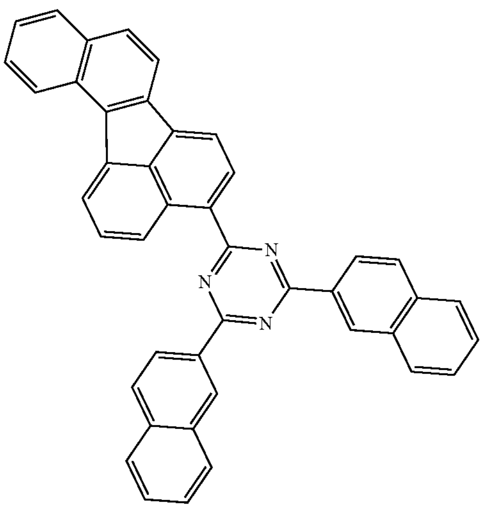
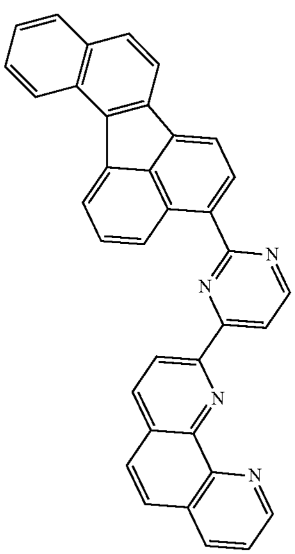
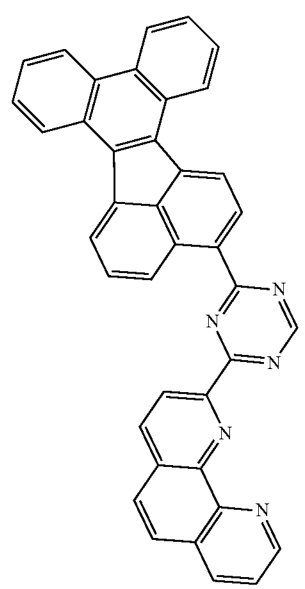

-continued
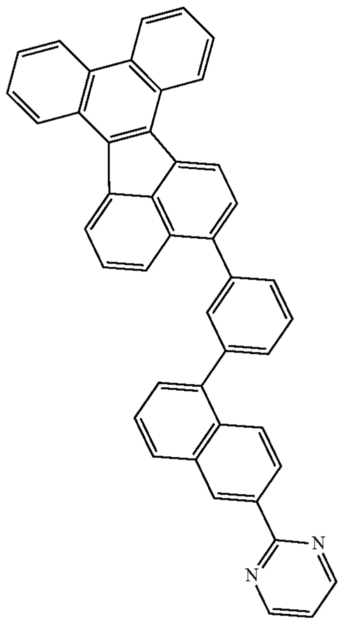
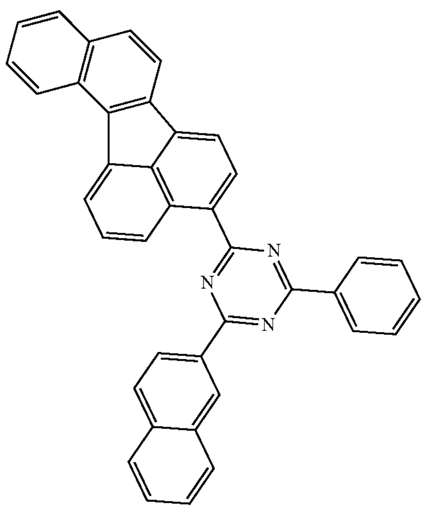
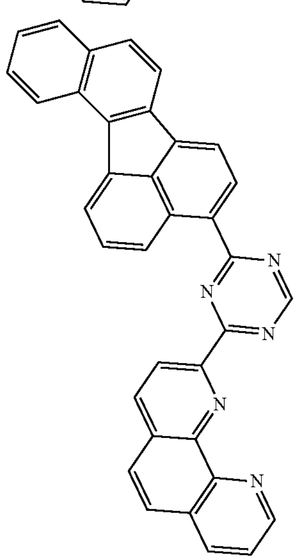
-continued
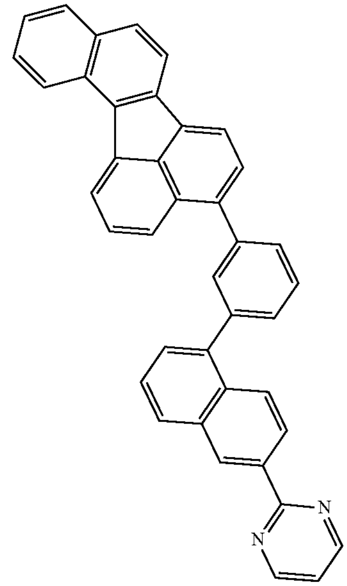
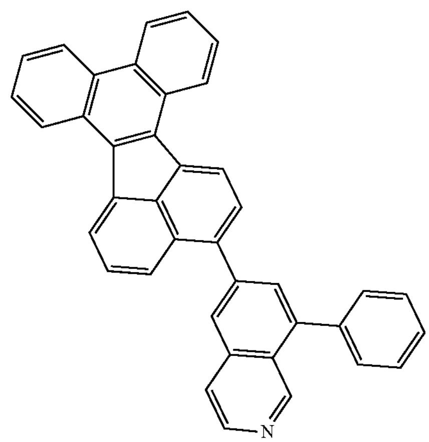
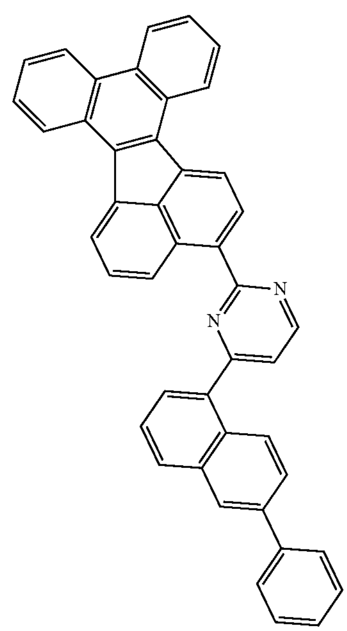

-continued
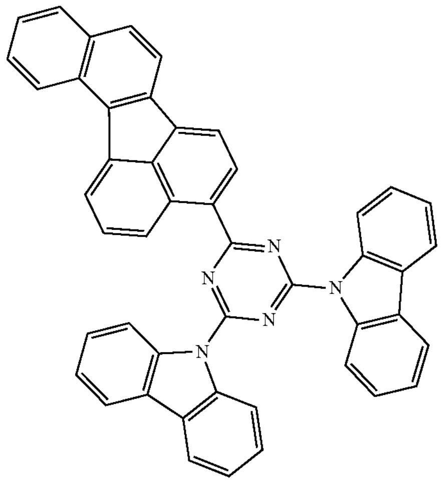
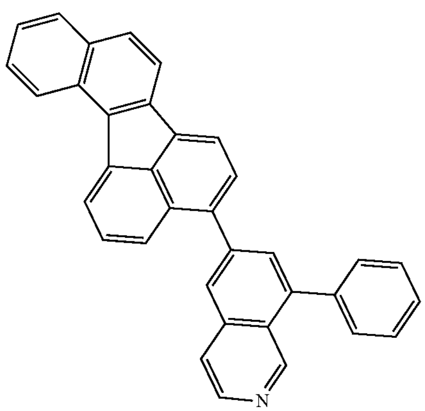
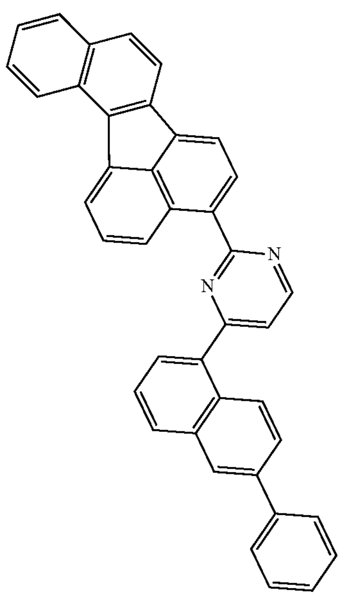
-continued
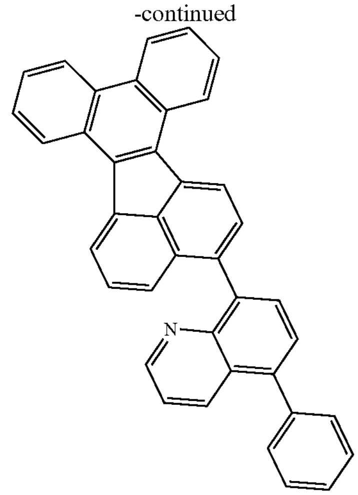
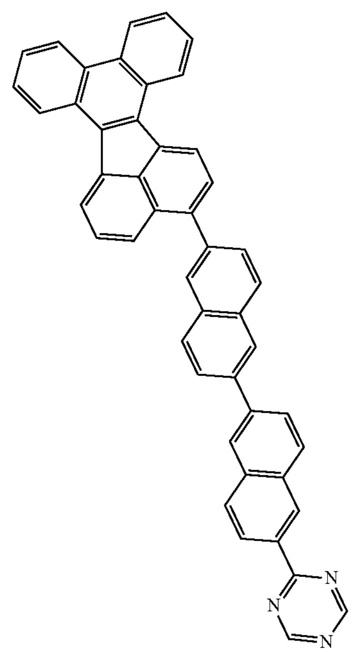
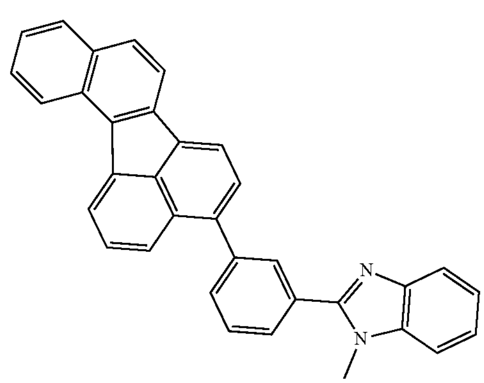

-continued
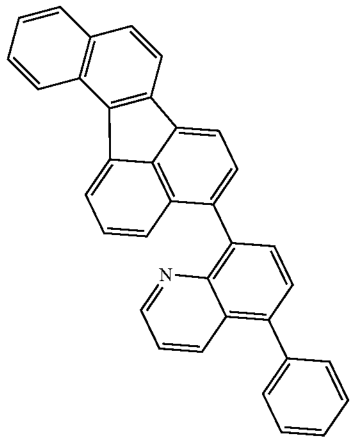
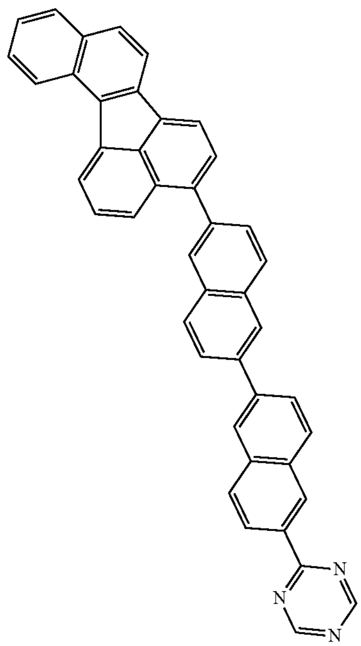
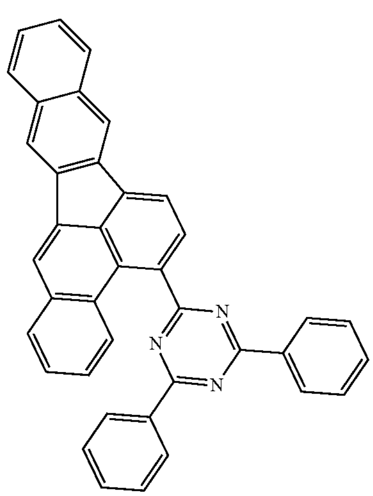
-continued
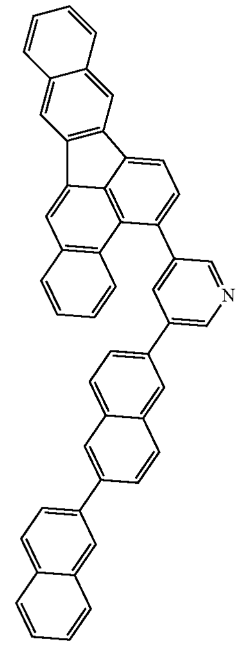
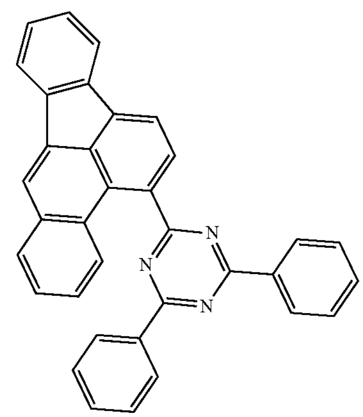
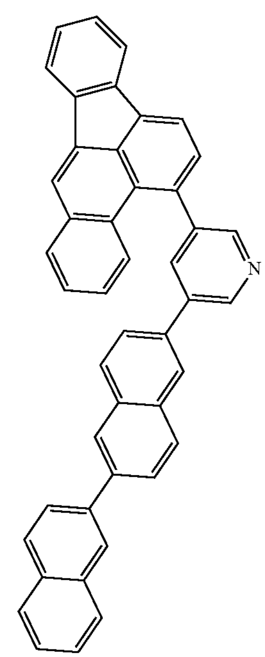

-continued
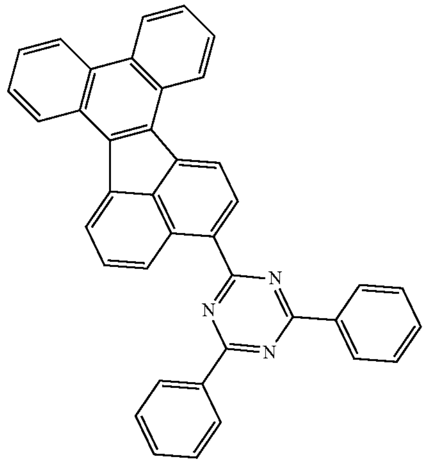
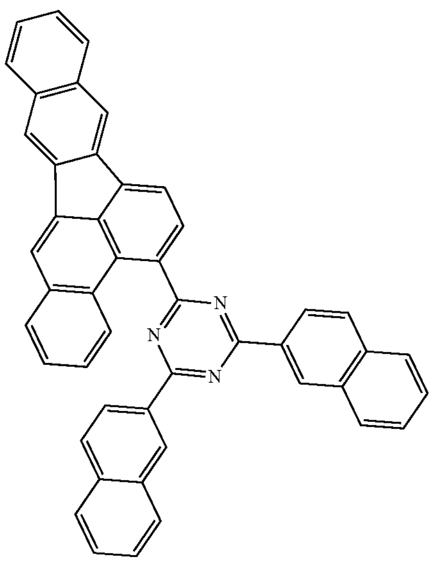
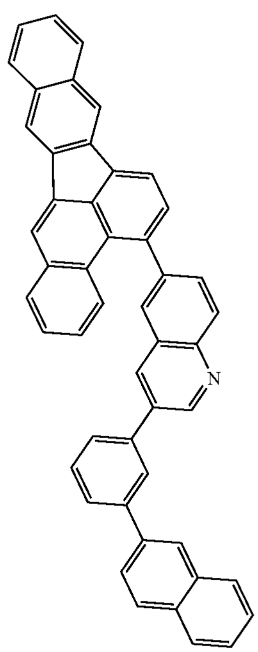
-continued
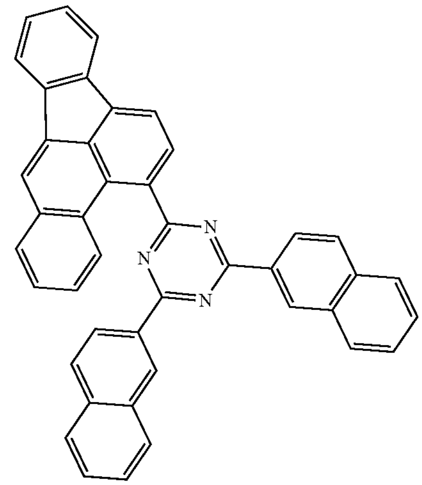
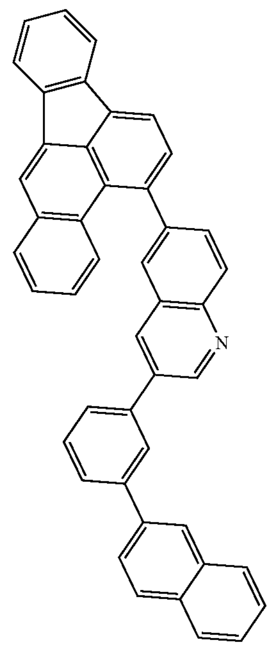
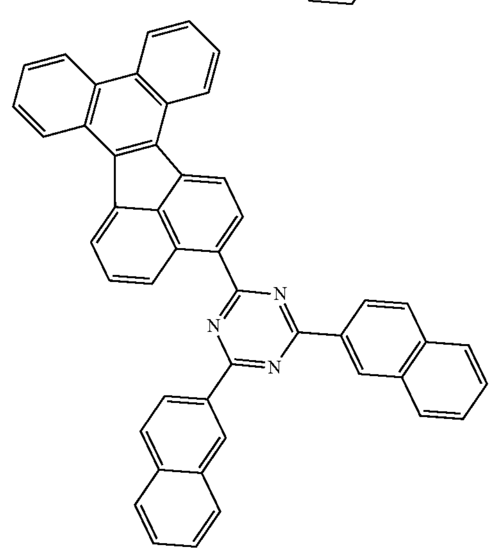

-continued
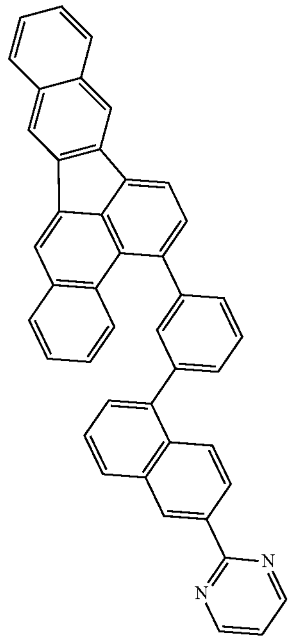
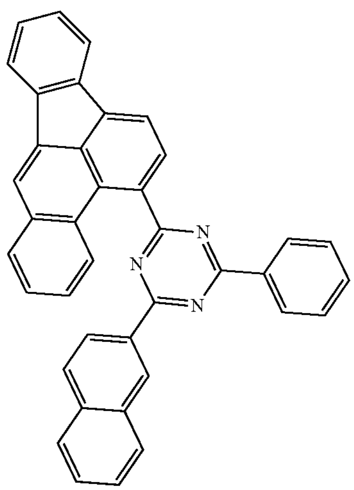
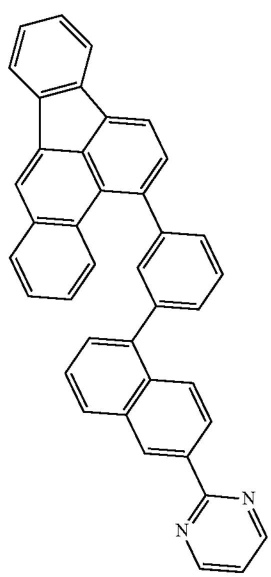
-continued
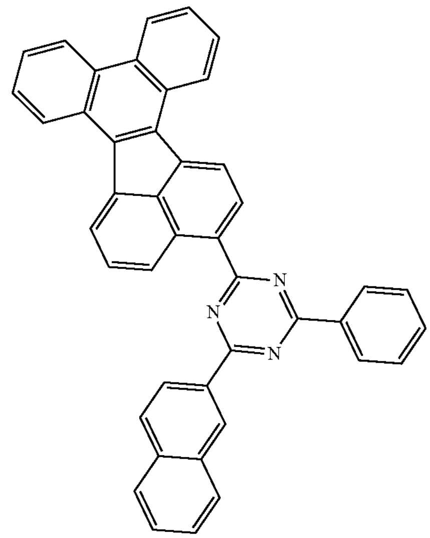
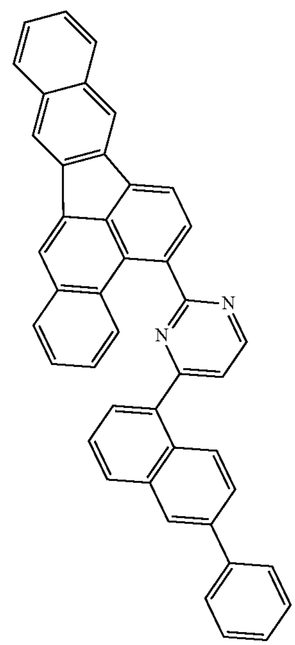
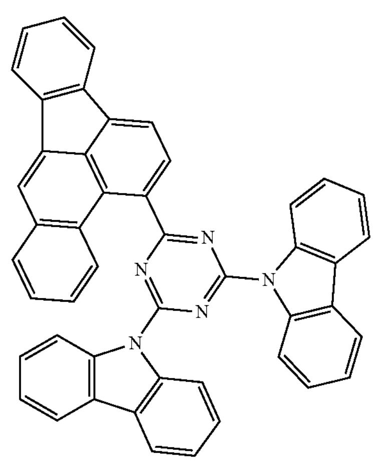

-continued
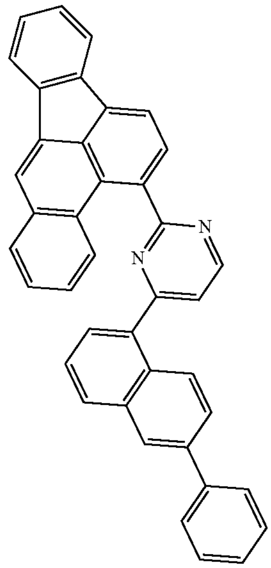
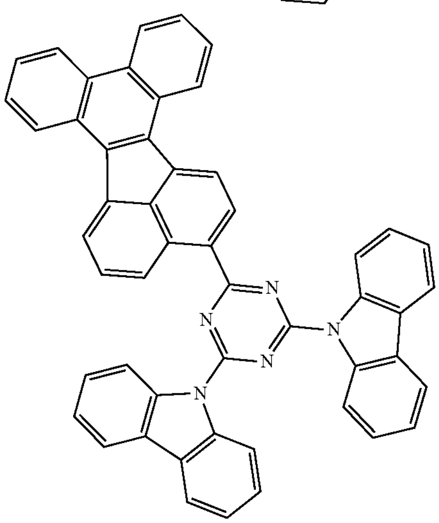
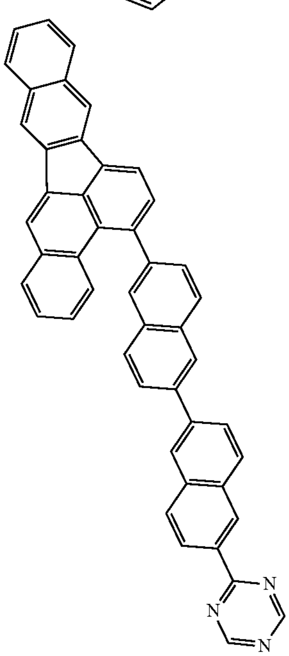
-continued
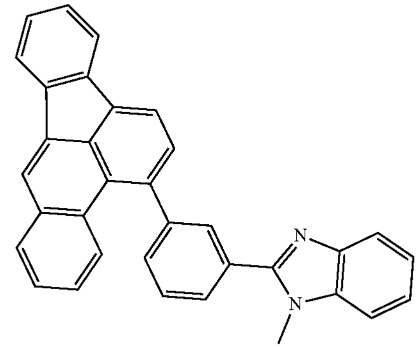
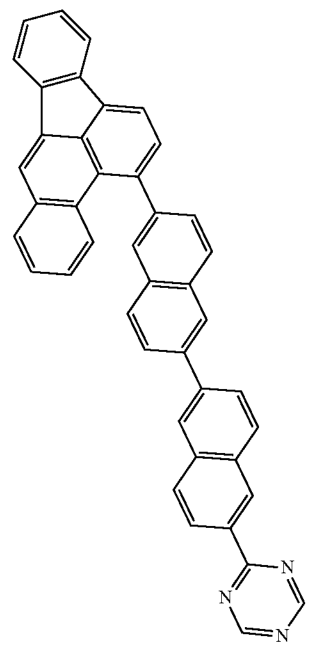
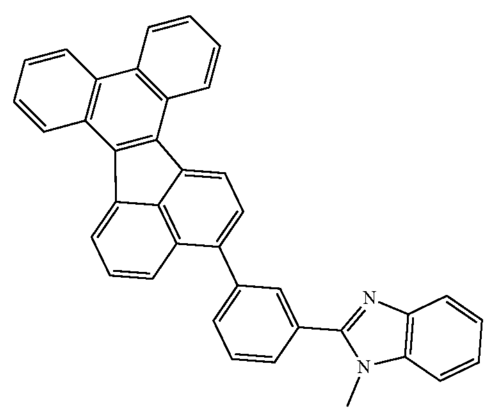

-continued
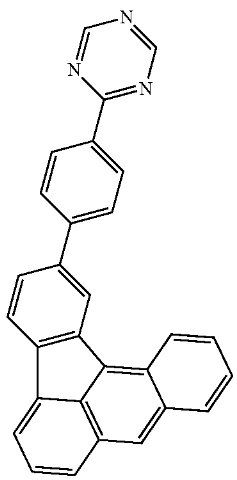
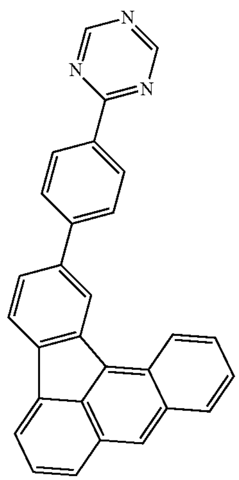
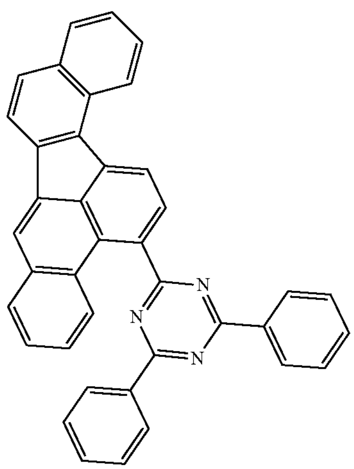
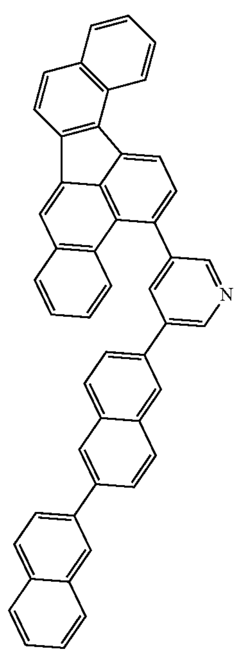
-continued
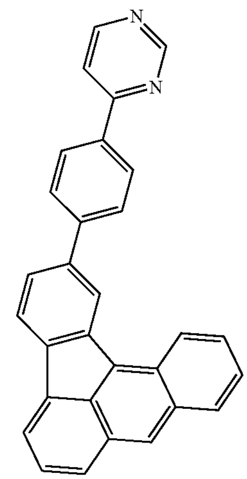
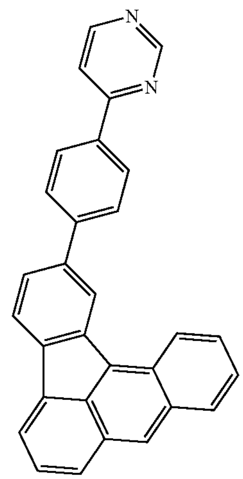
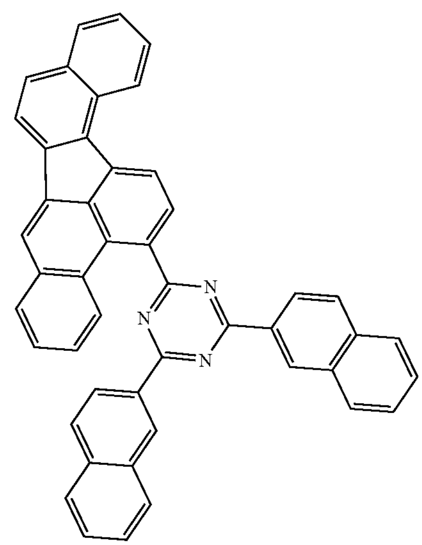
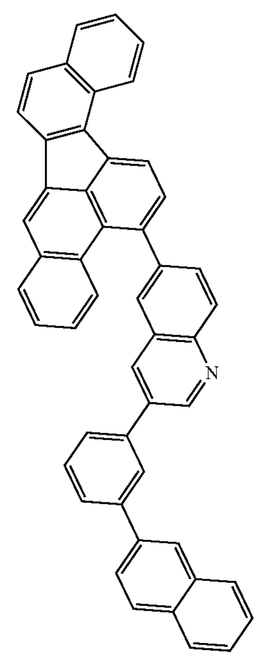

-continued
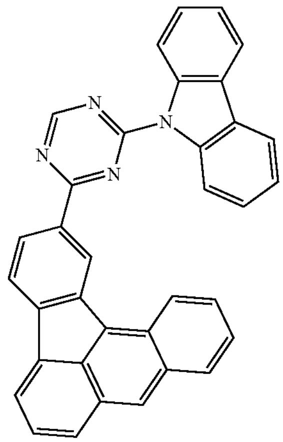
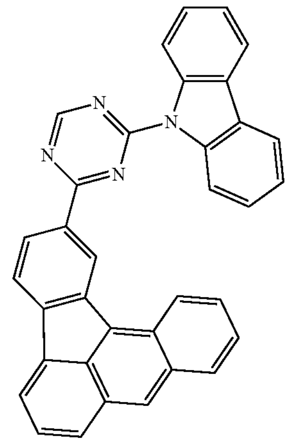
-continued
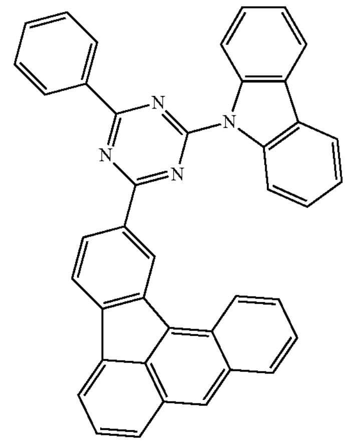
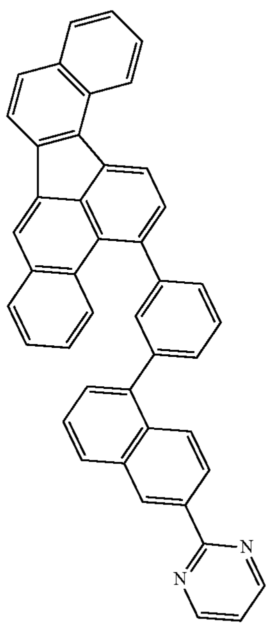
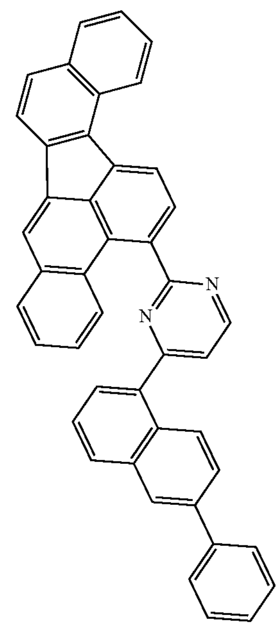
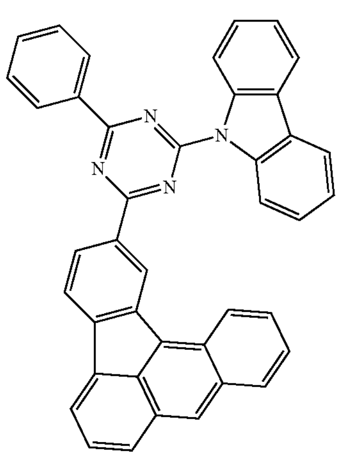
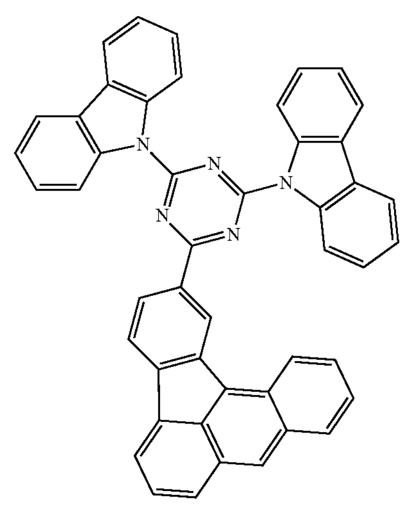

-continued
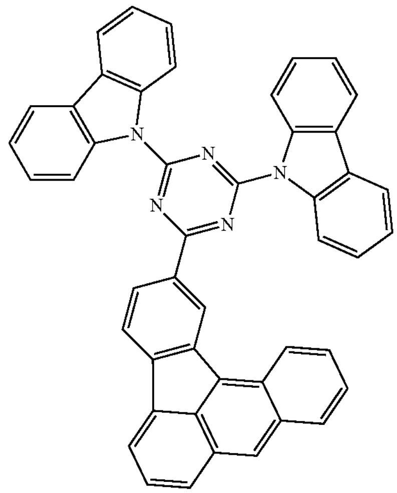
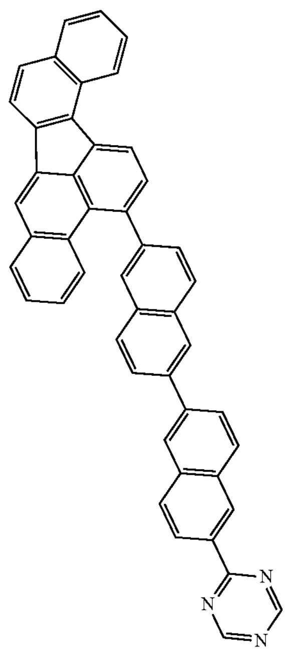
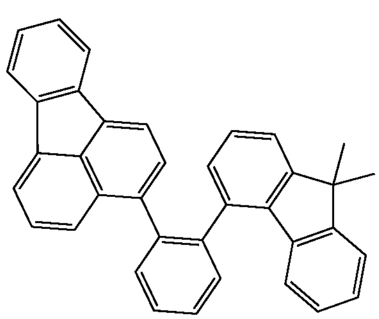
-continued
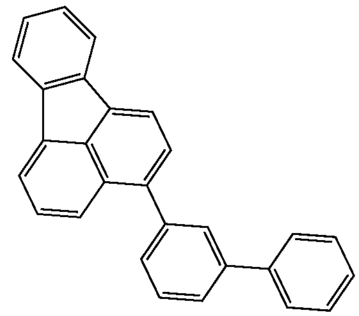
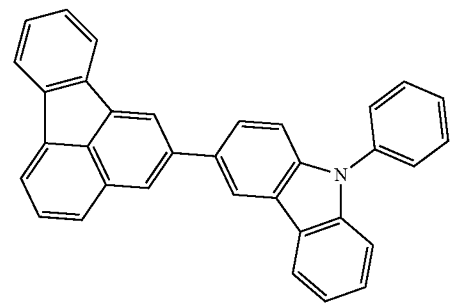
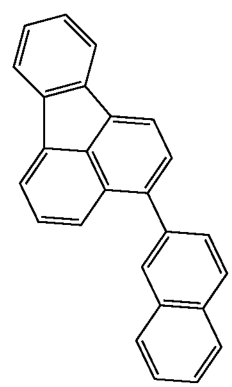
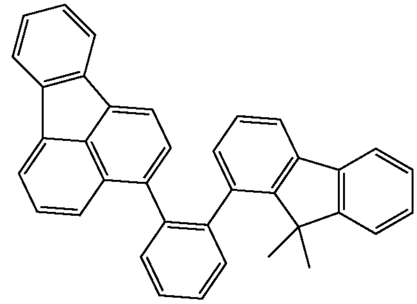

-continued
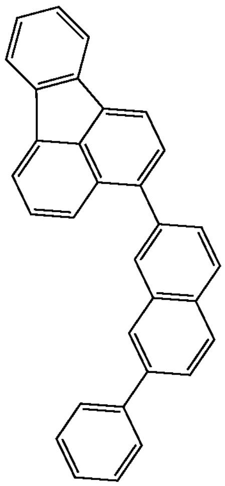
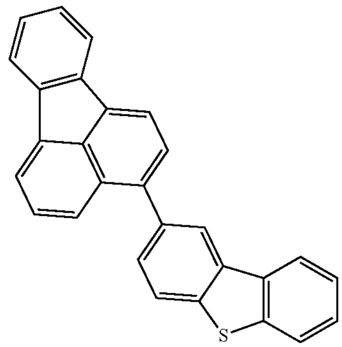
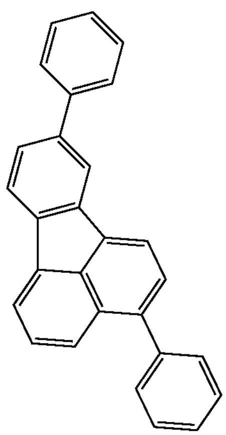
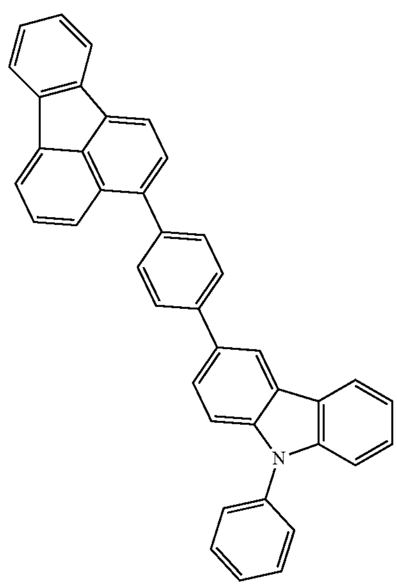
-continued
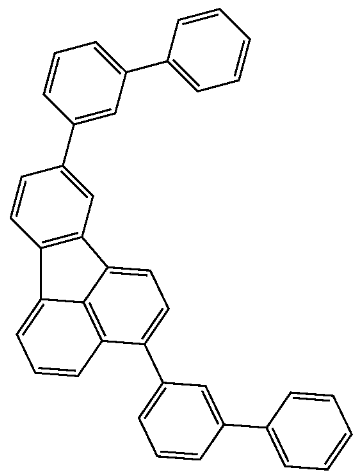
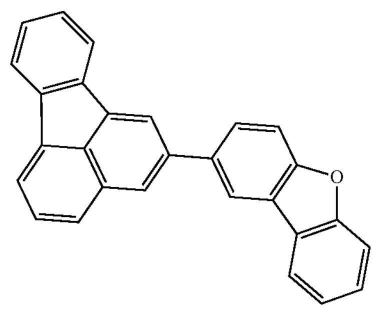
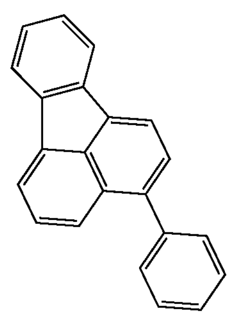
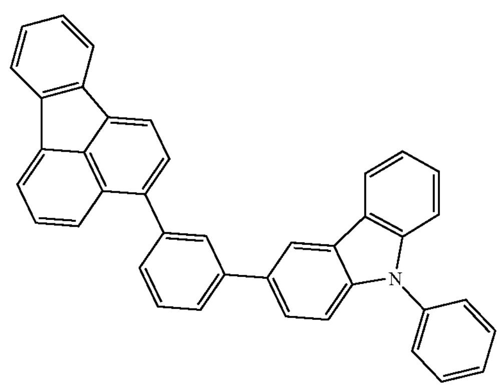

-continued
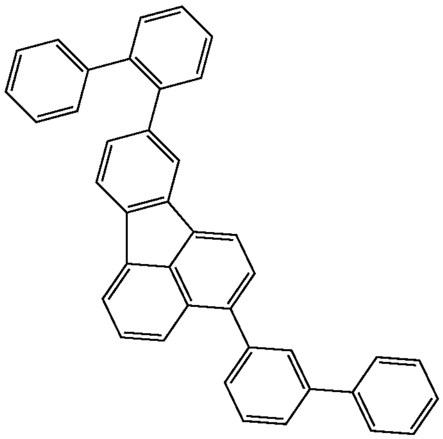
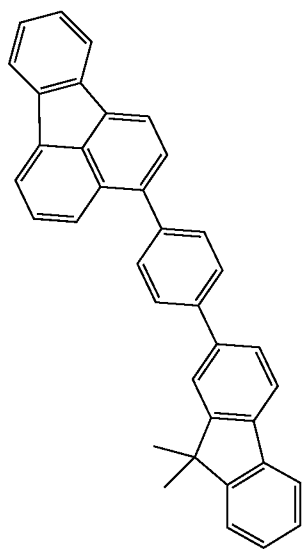
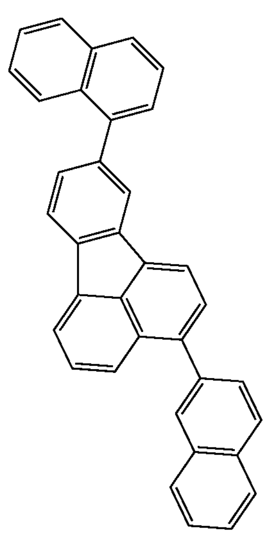
-continued
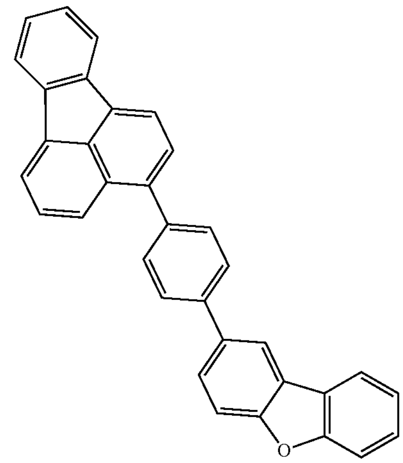
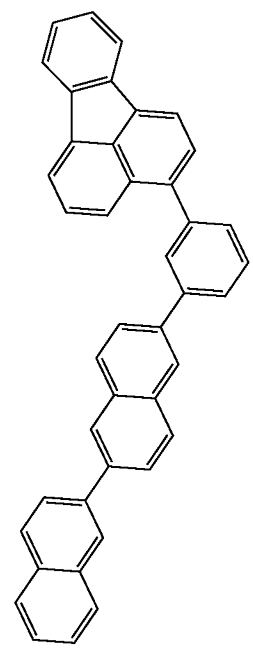
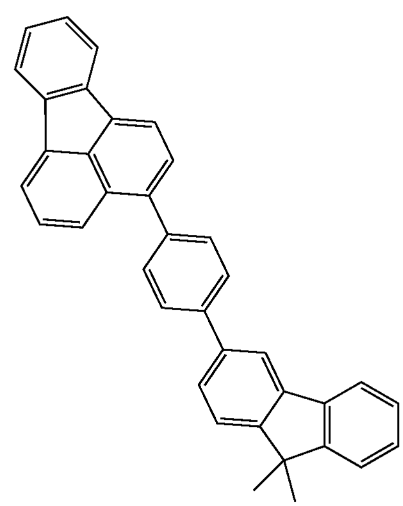

-continued
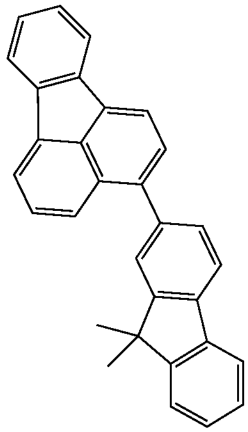
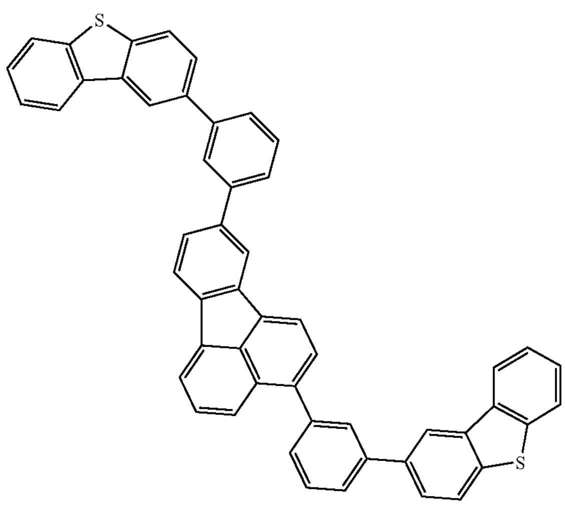
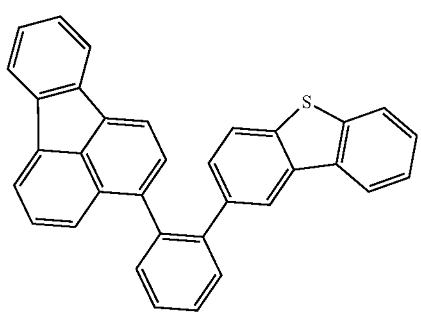
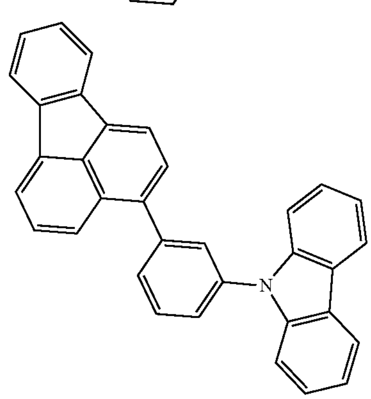
-continued
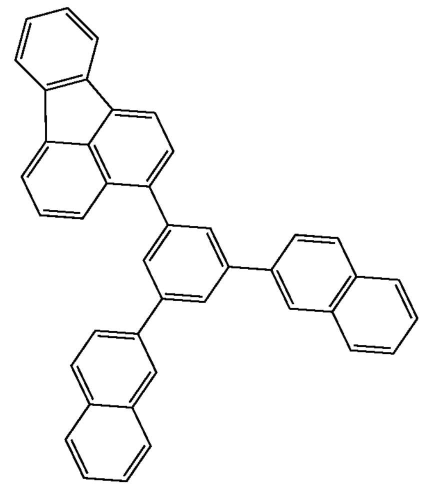
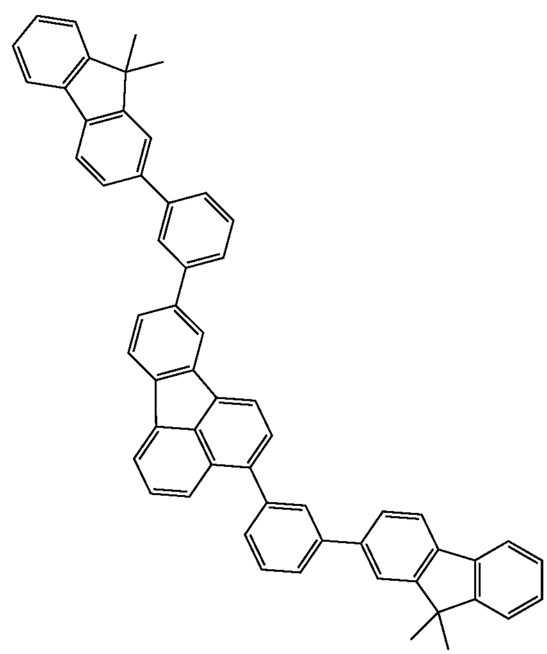
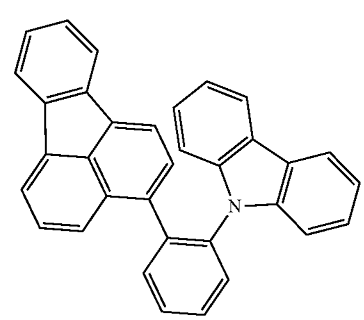

-continued
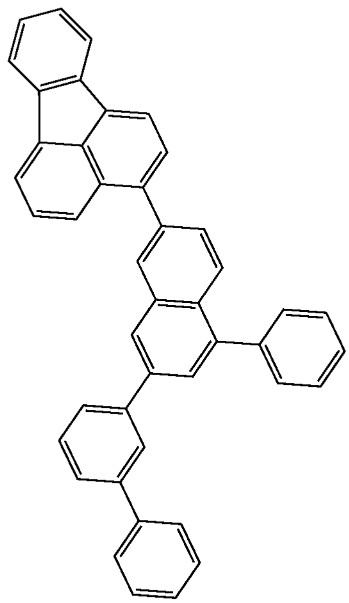
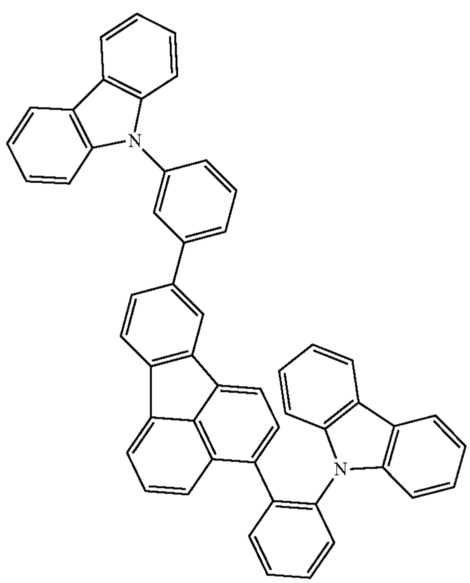
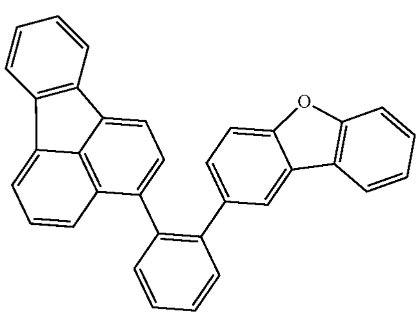
-continued
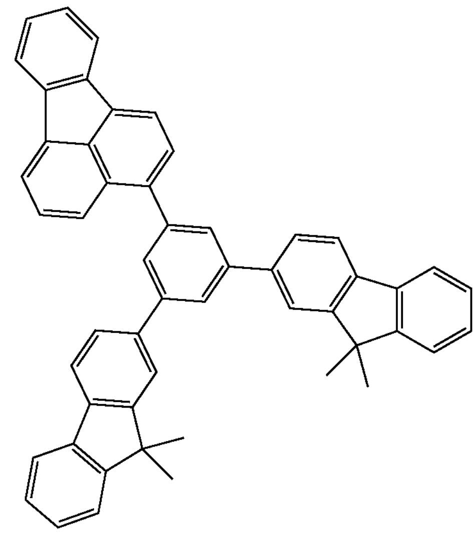
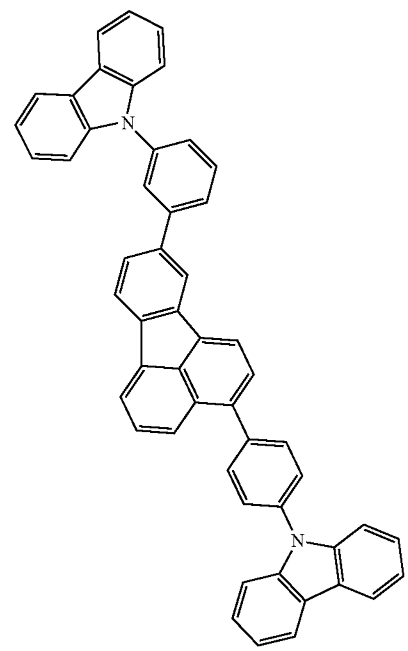
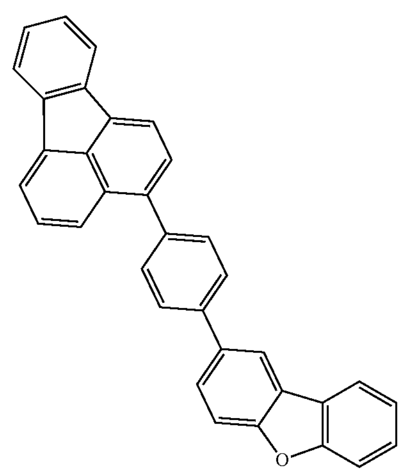

-continued
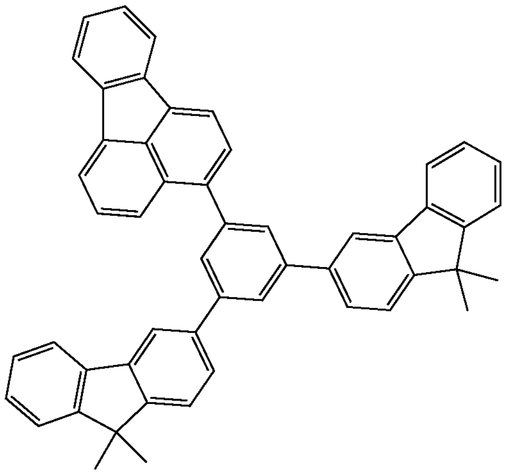
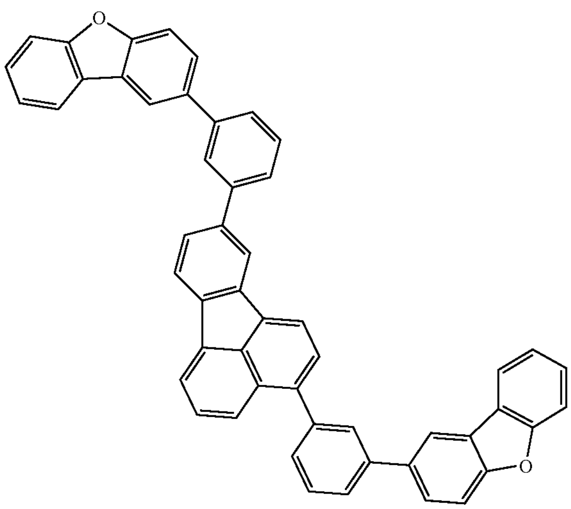
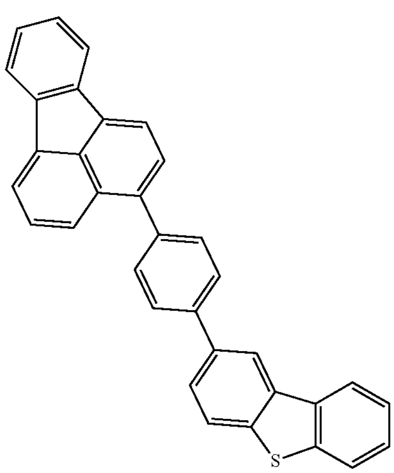
-continued
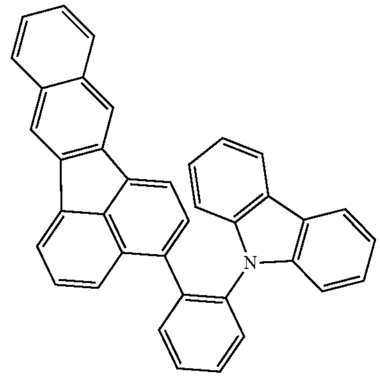
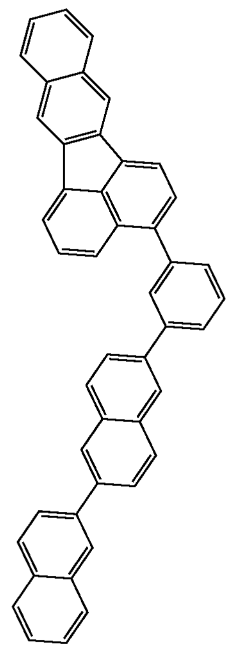
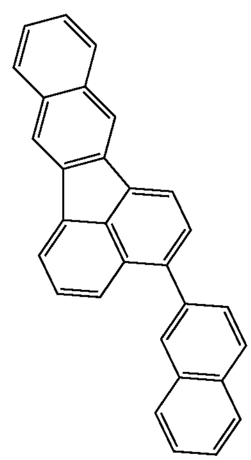

-continued
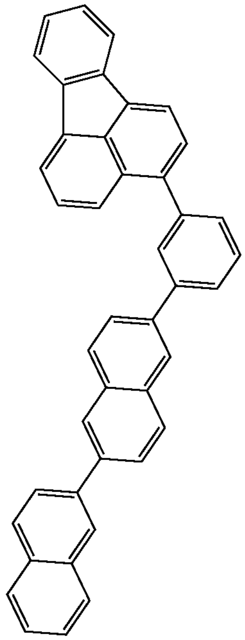
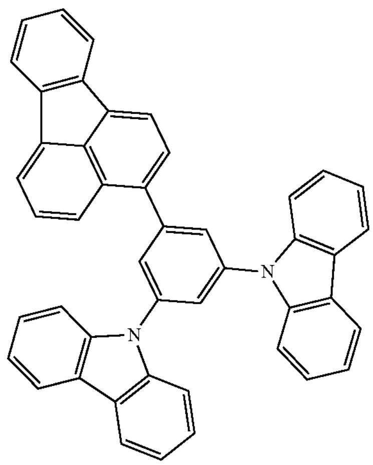
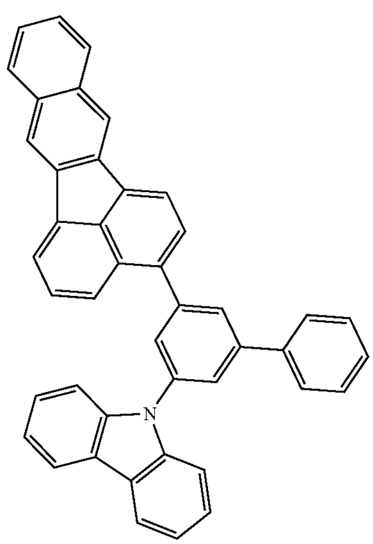
-continued
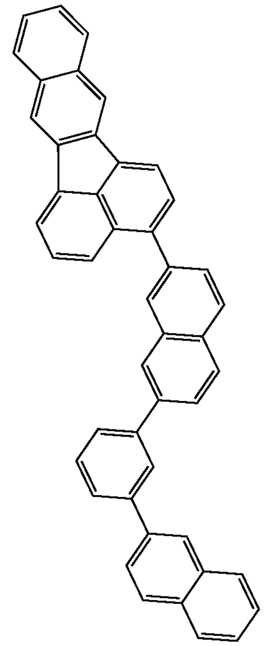
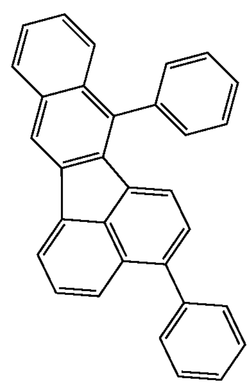
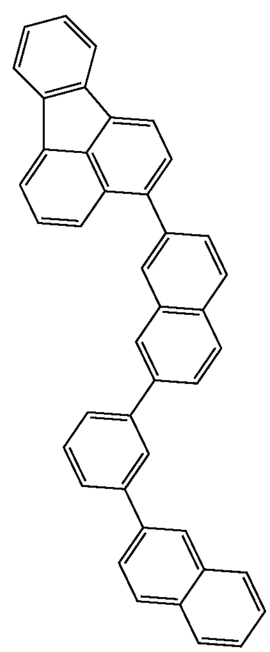

-continued
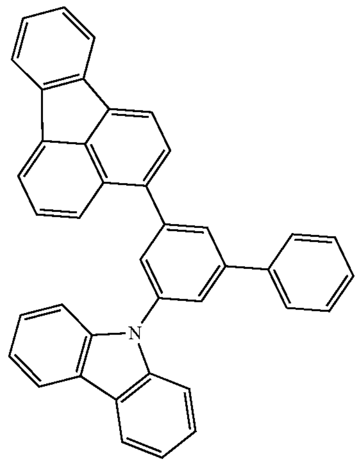
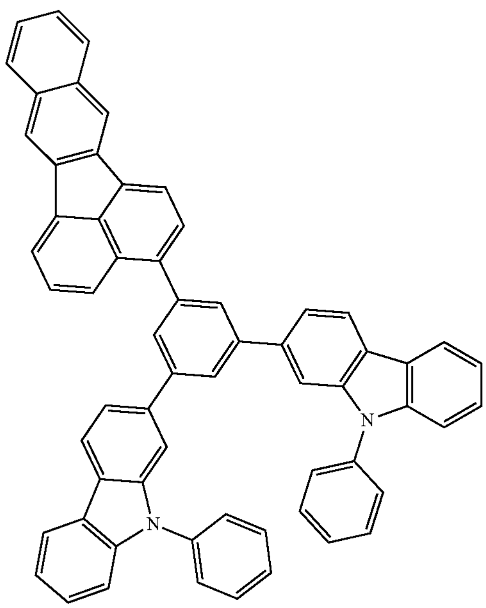
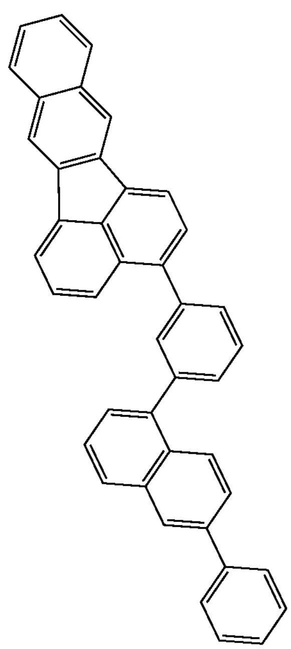
-continued
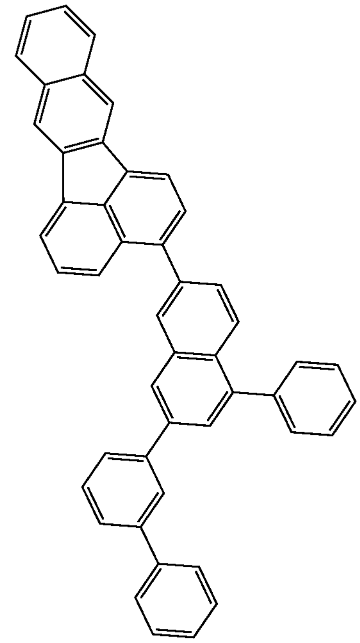
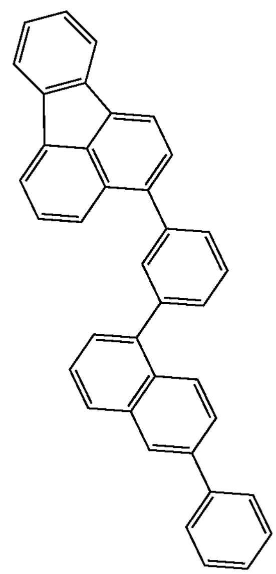
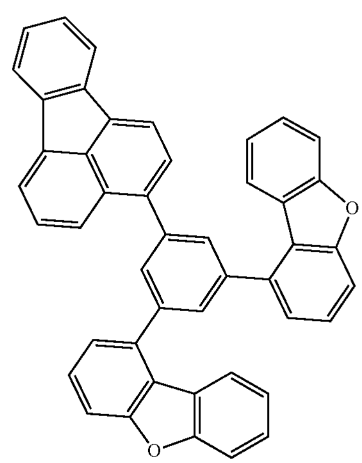

-continued
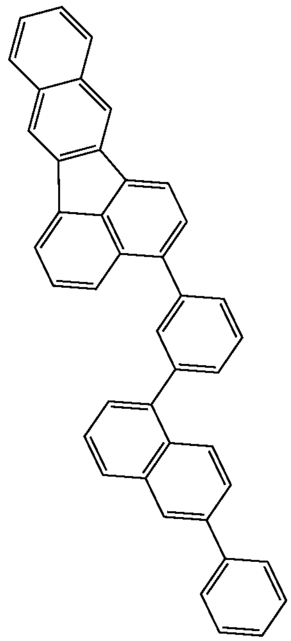
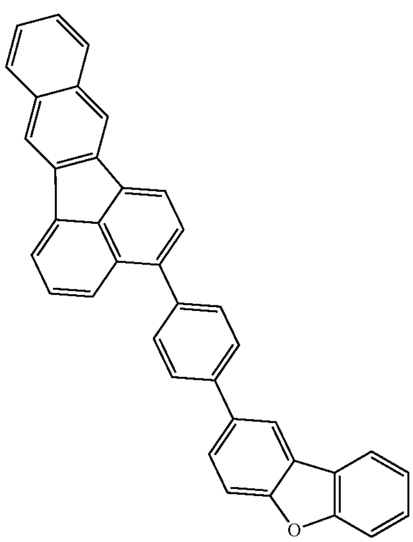
-continued
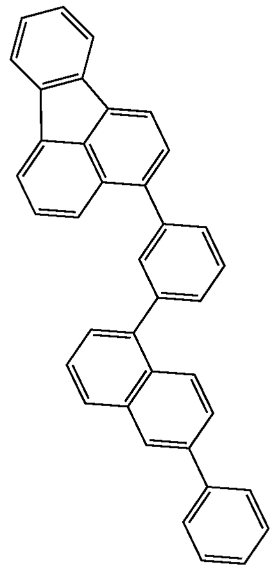
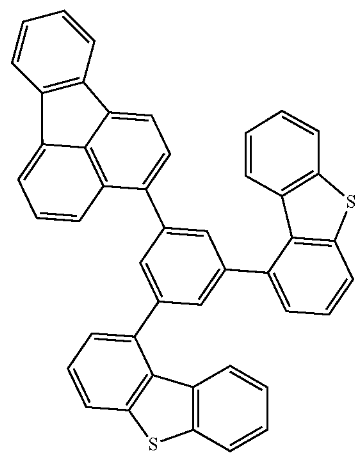
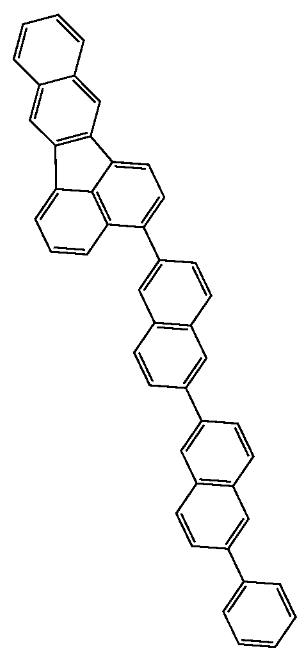

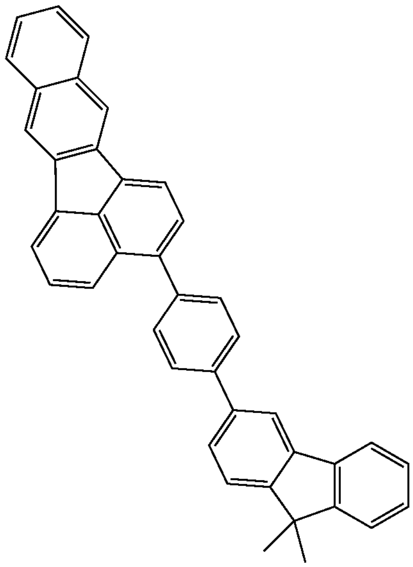
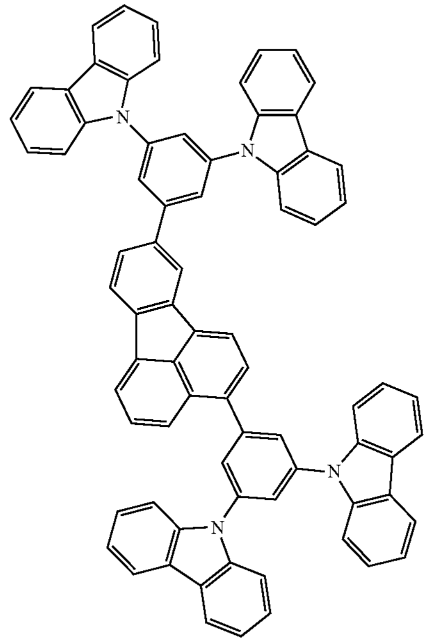
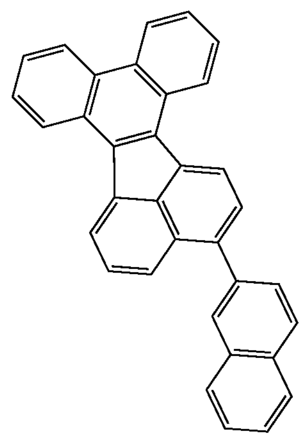
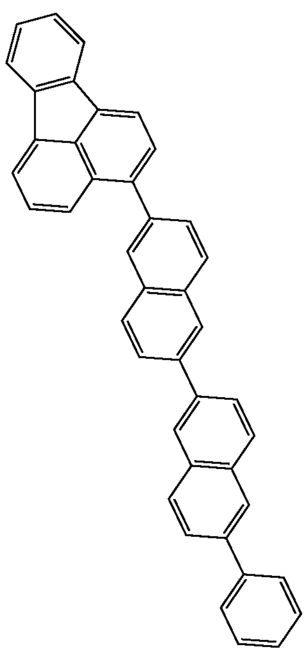
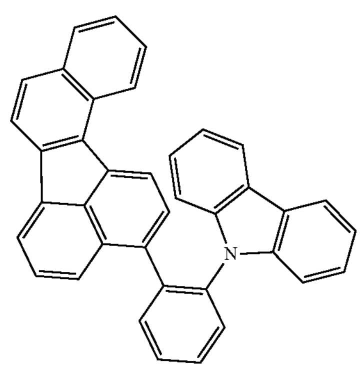
N

-continued
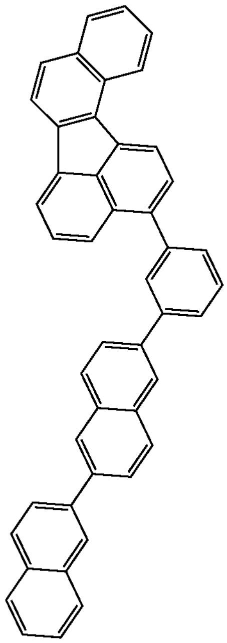
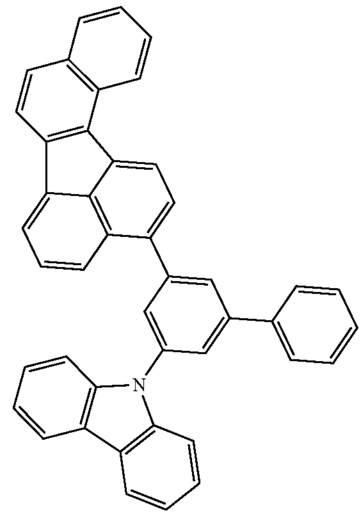
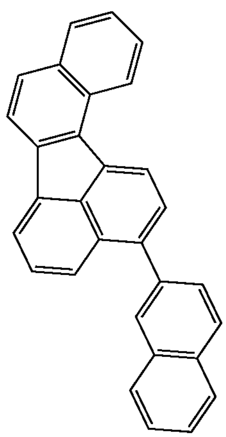
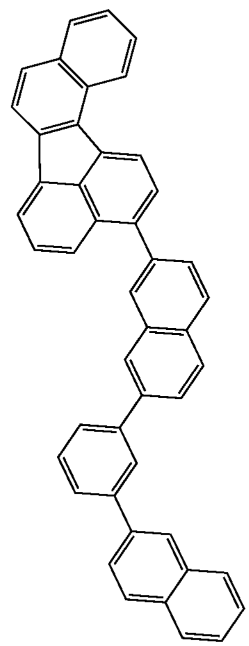
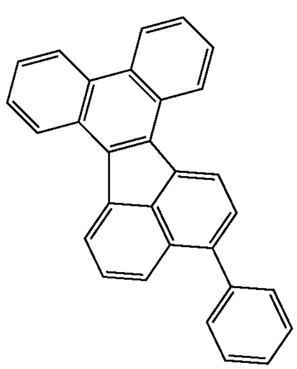
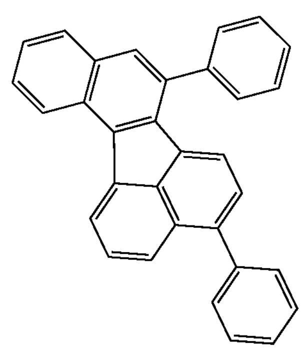

-continued
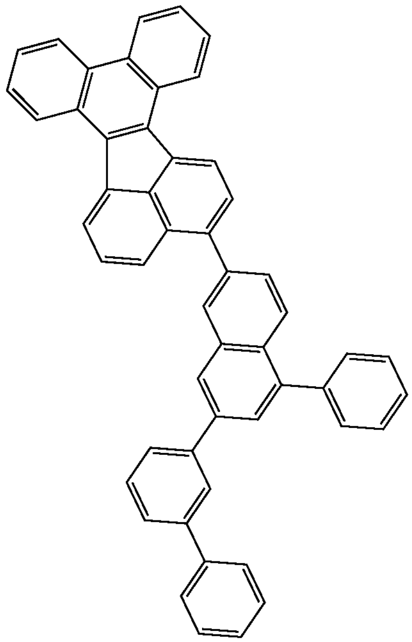
-continued
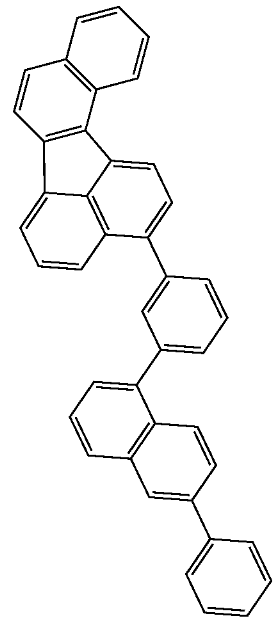
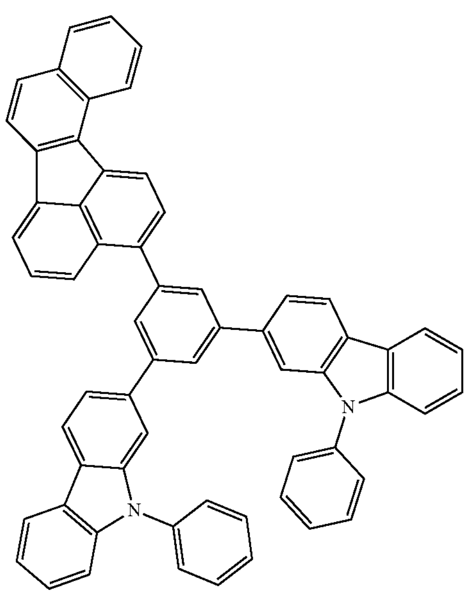
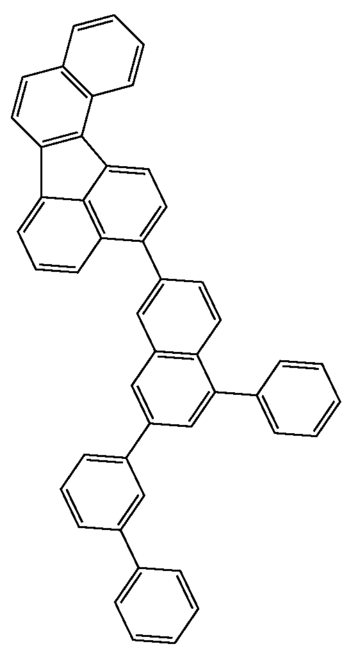

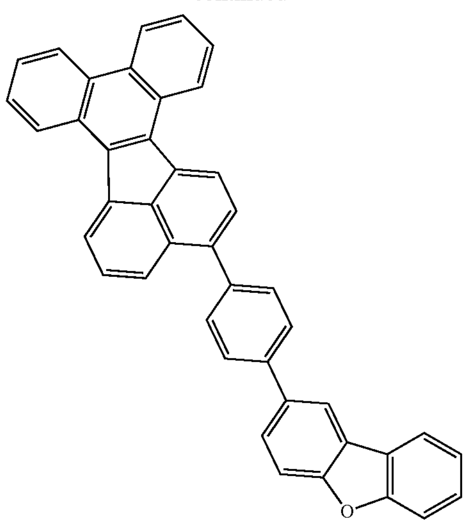
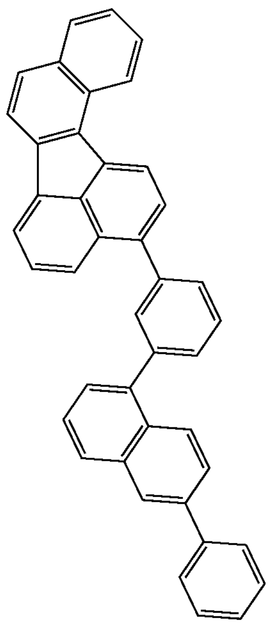
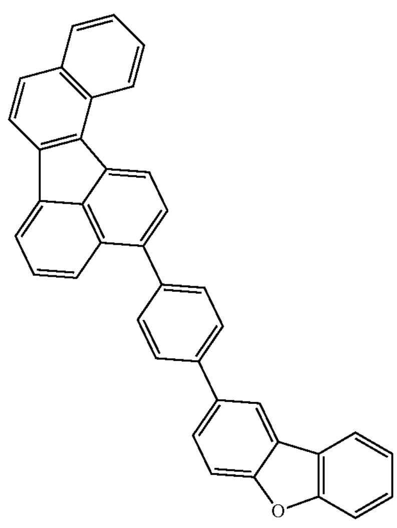
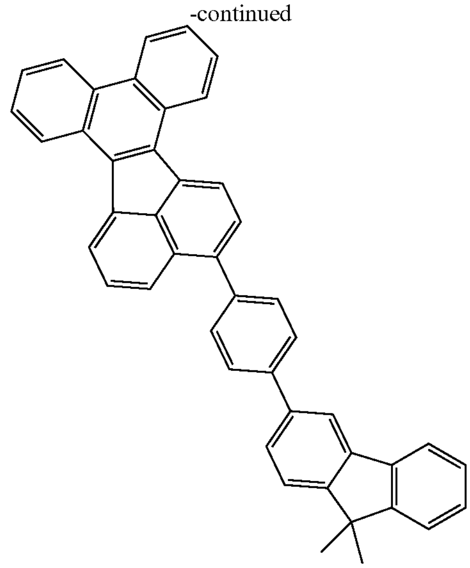
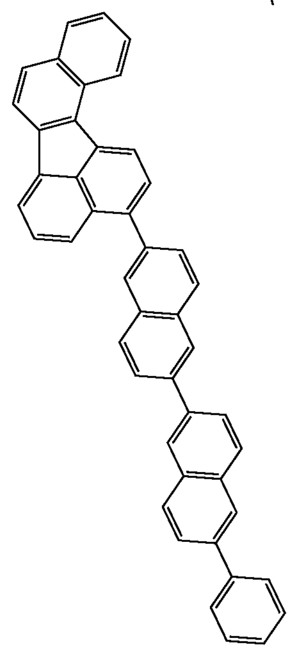
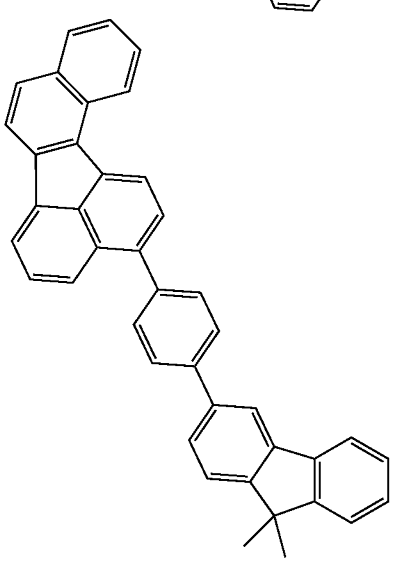

-continued
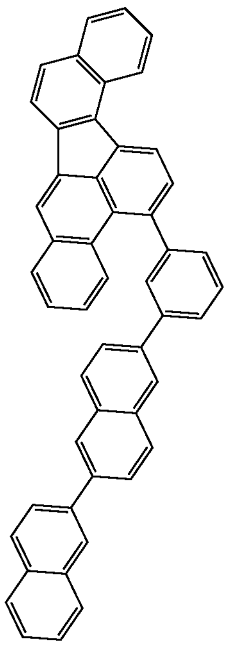
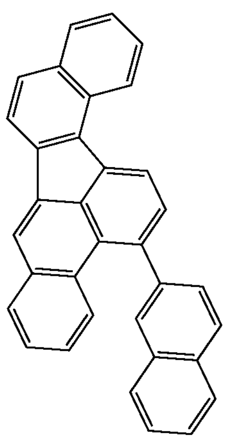
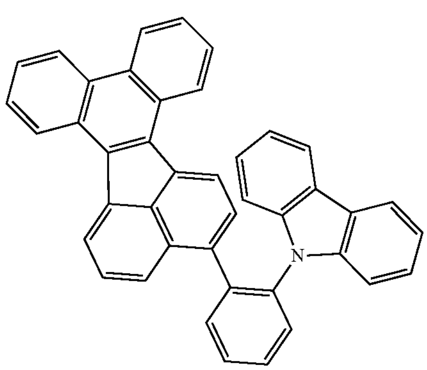
-continued
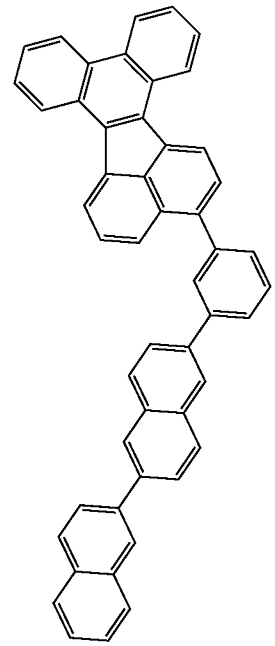
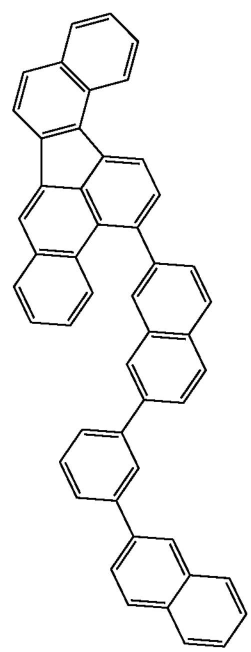
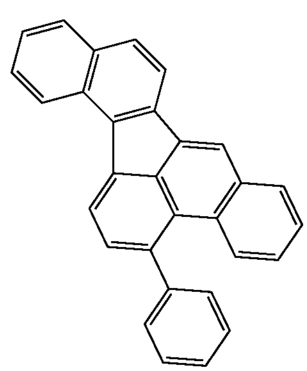

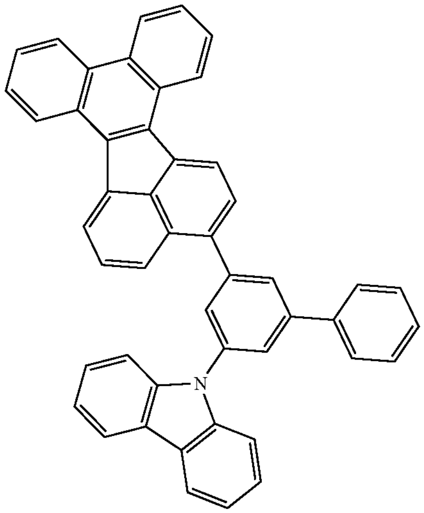
N
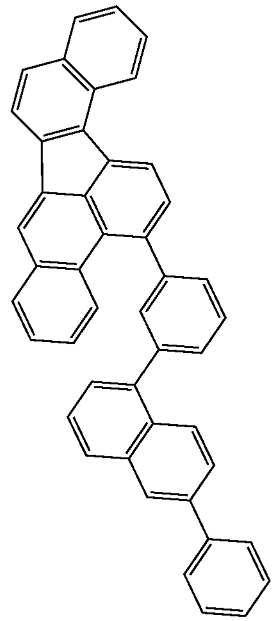
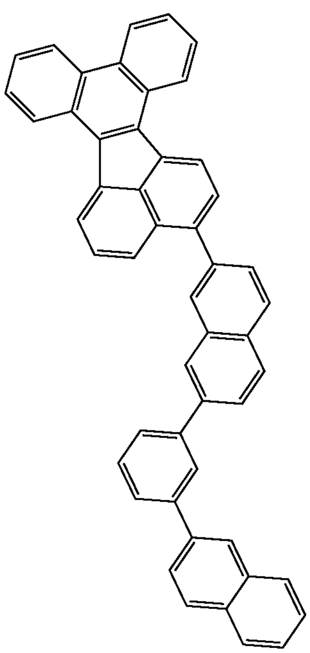
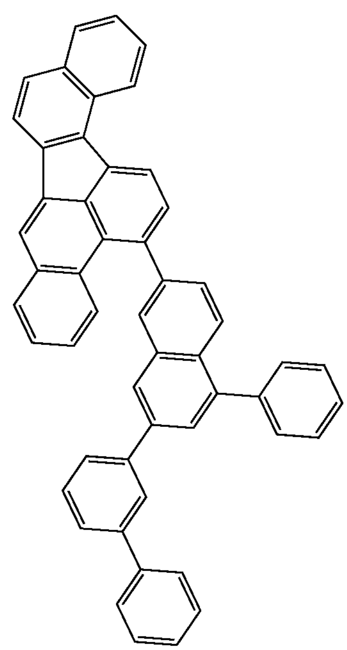

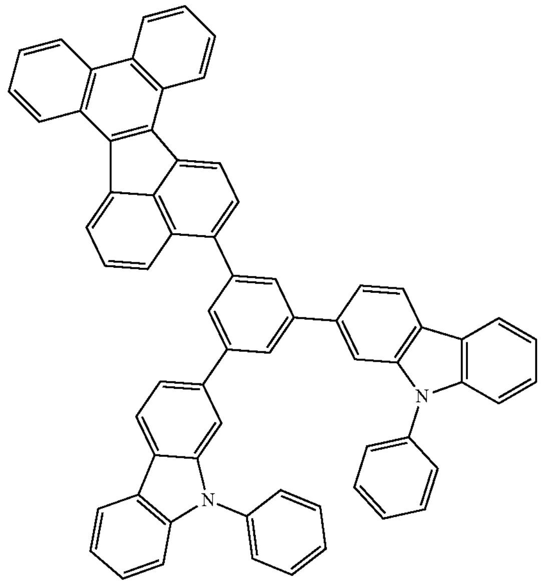
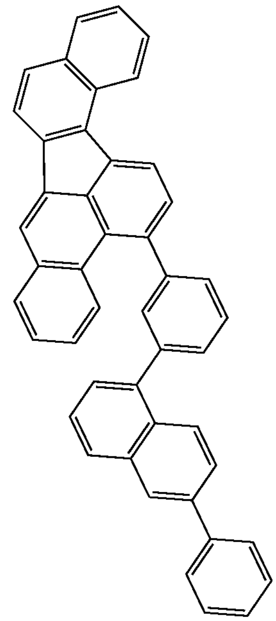
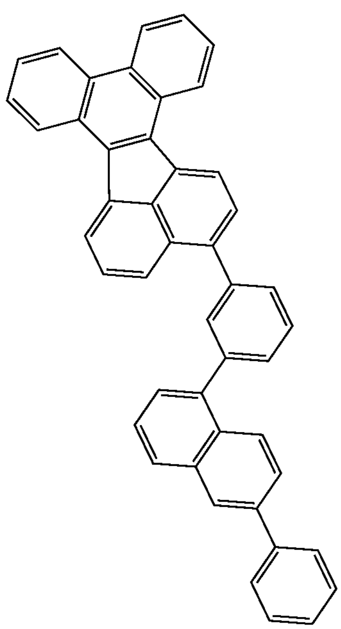
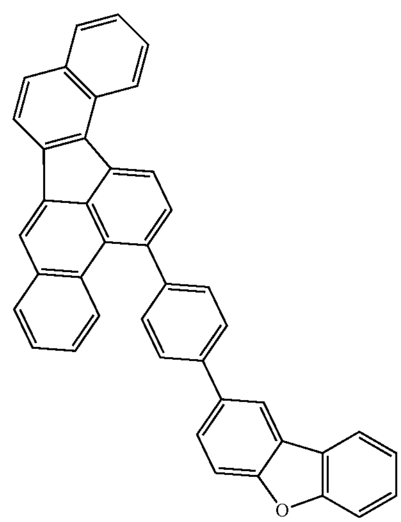

-continued
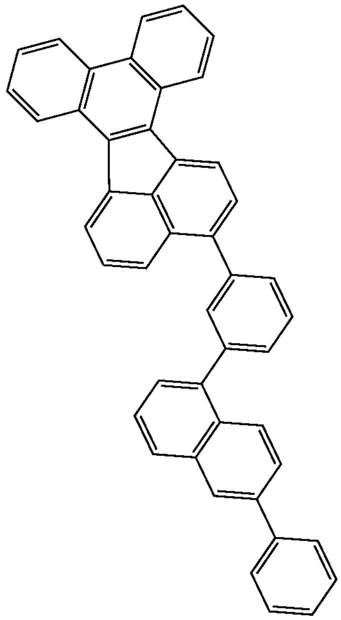
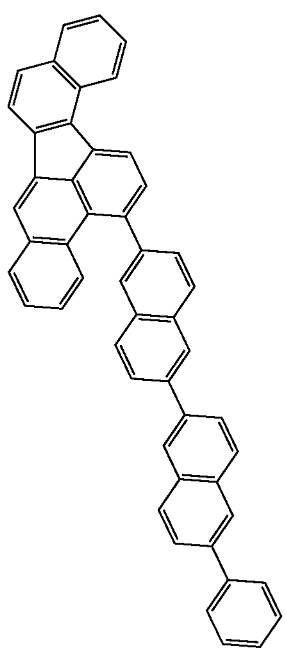
-continued
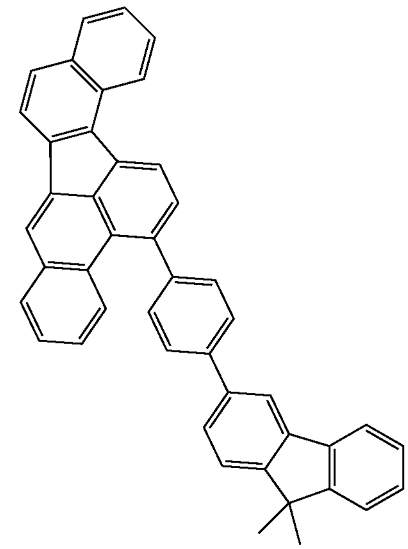
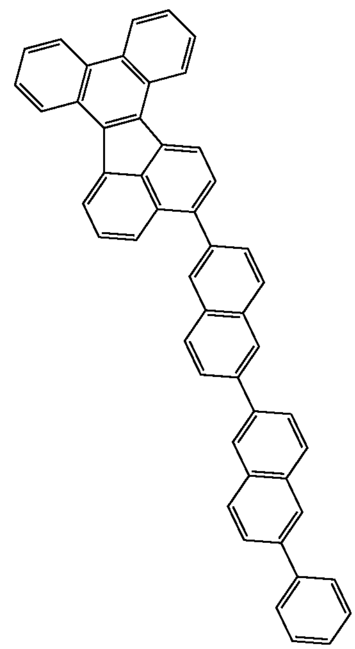
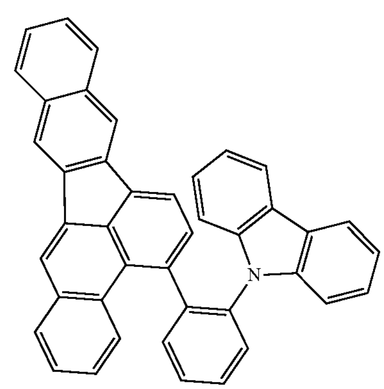

-continued
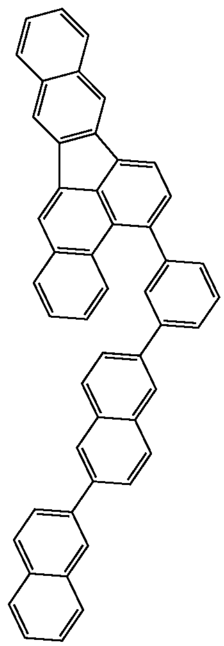
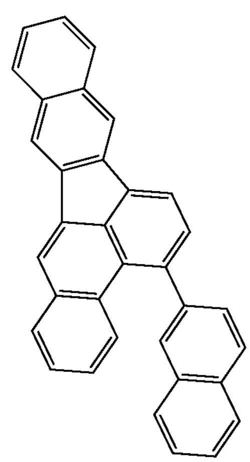
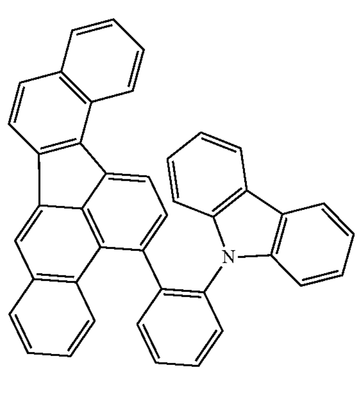
-continued
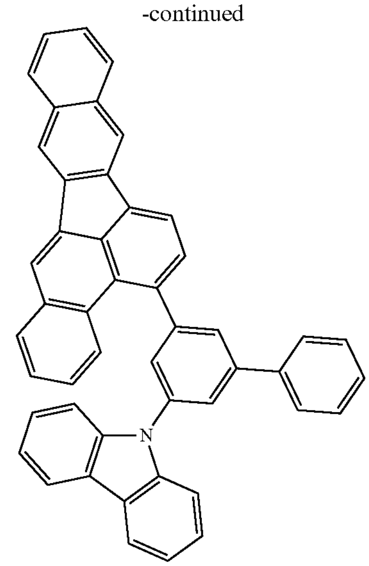
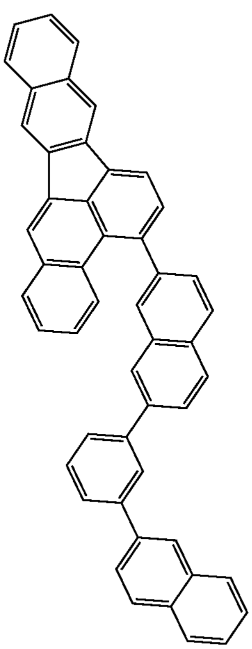
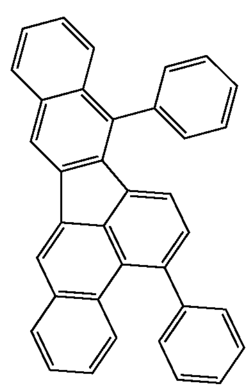

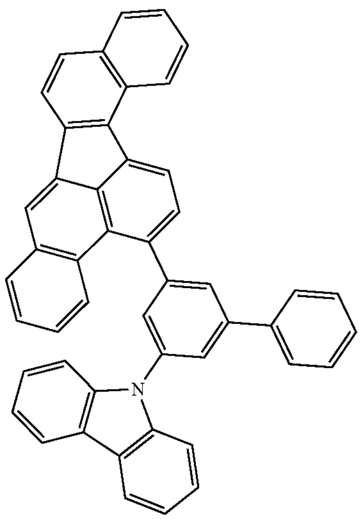
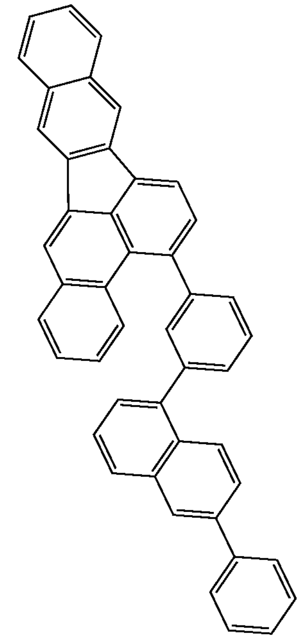
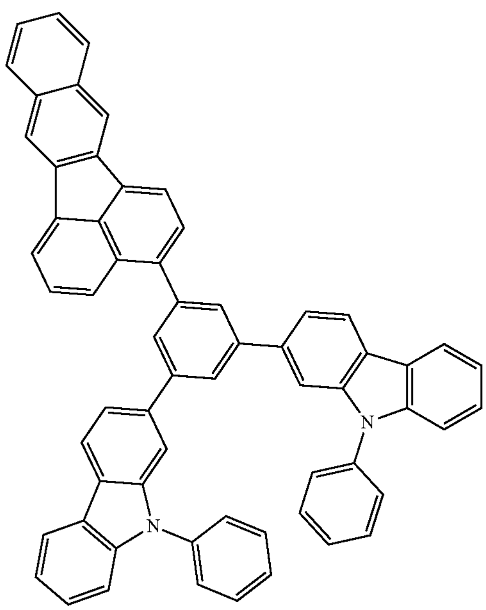
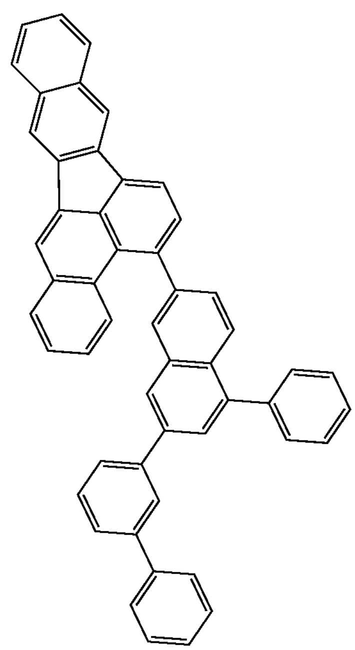

-continued
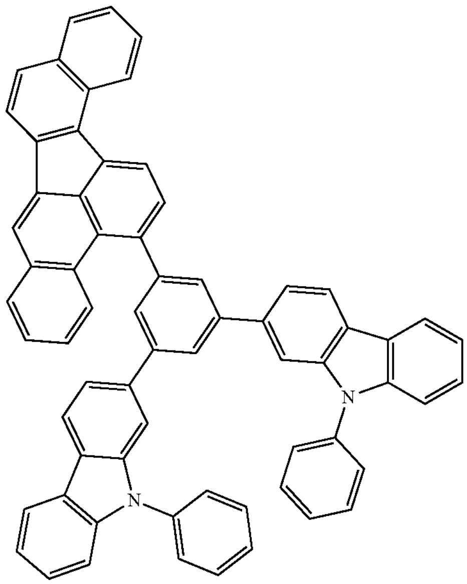
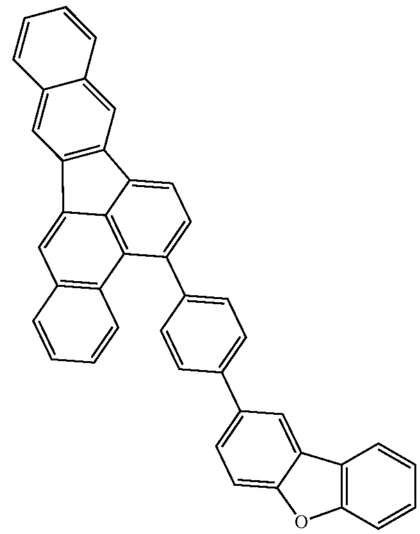
-continued
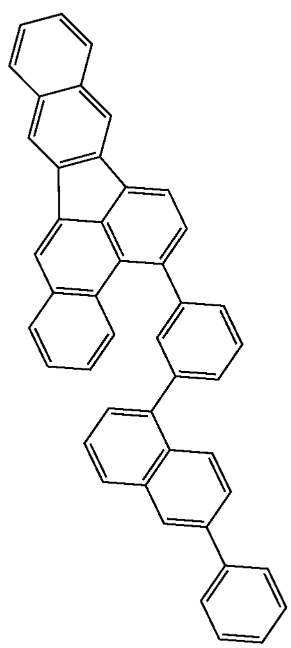
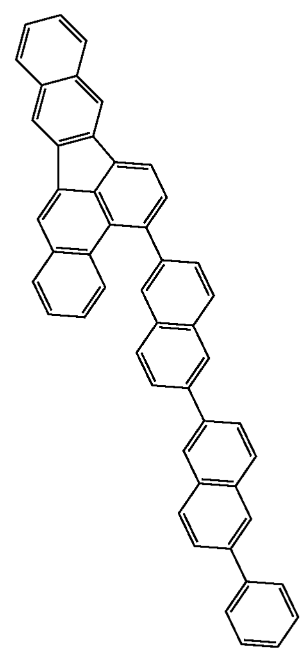

-continued
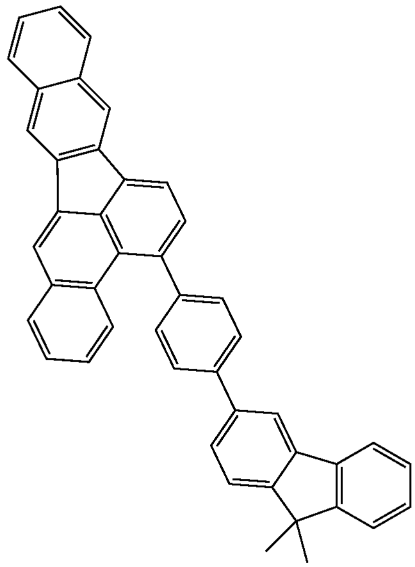
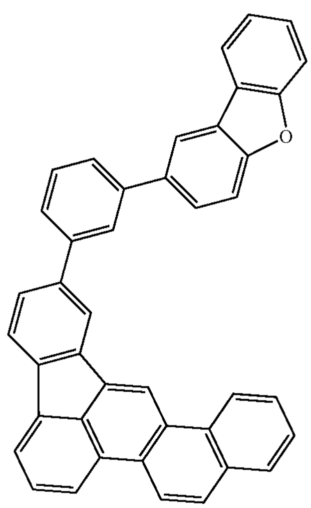
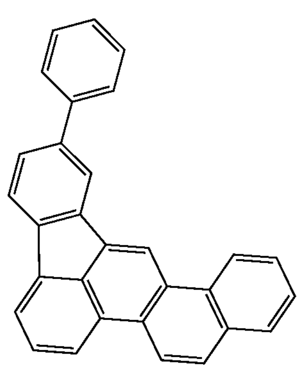
-continued
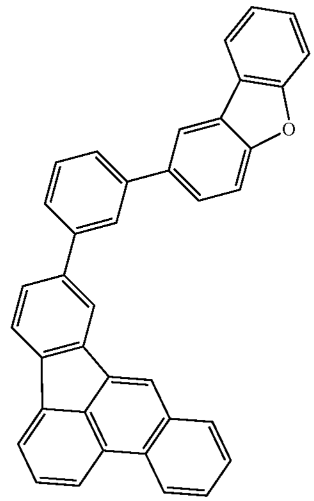
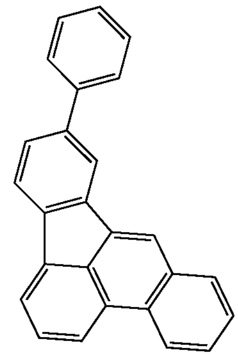
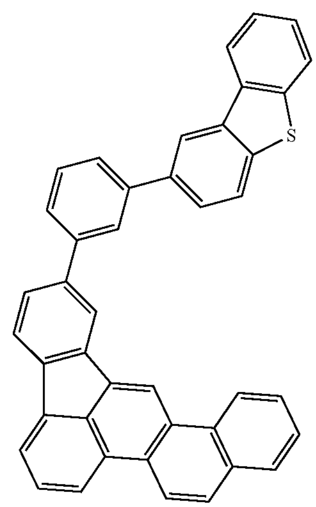
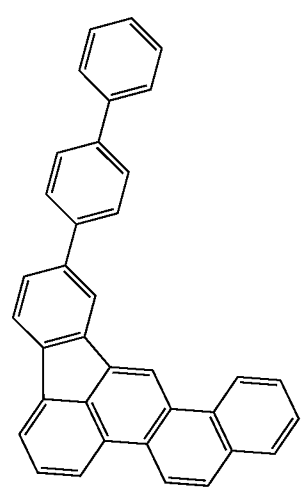

-continued
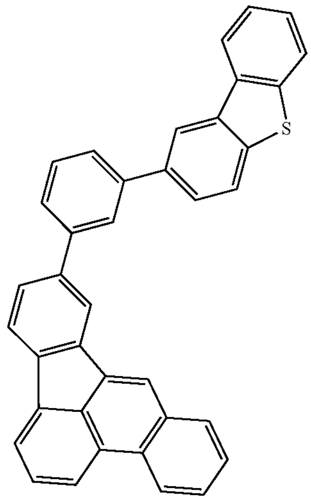
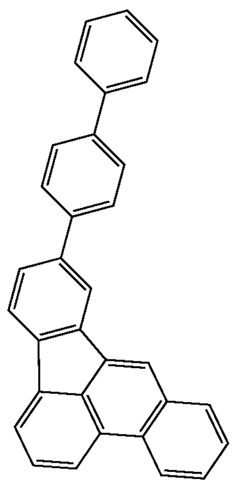
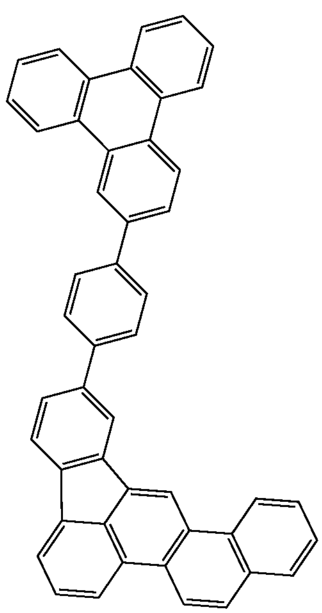
-continued
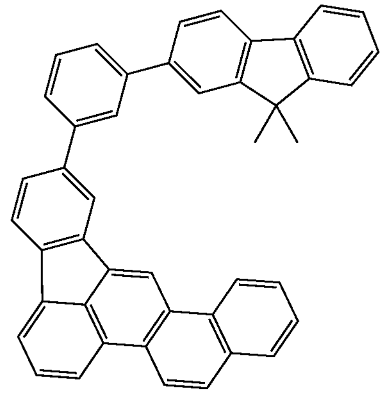
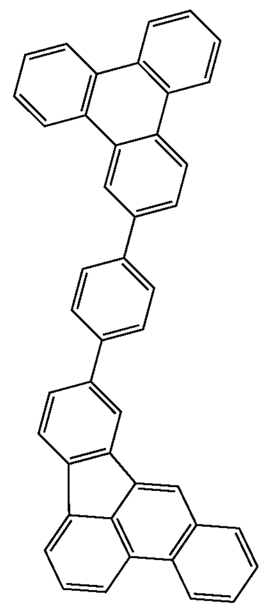
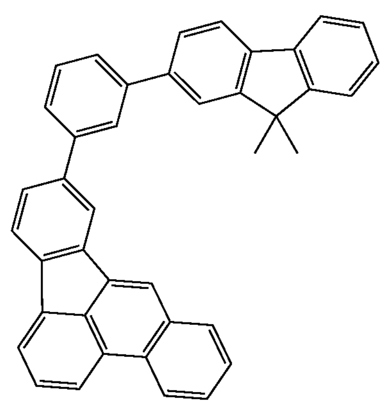

-continued
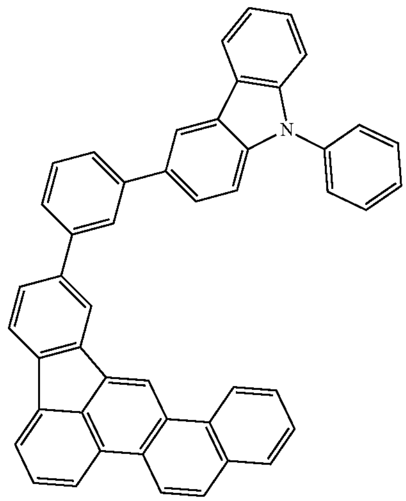
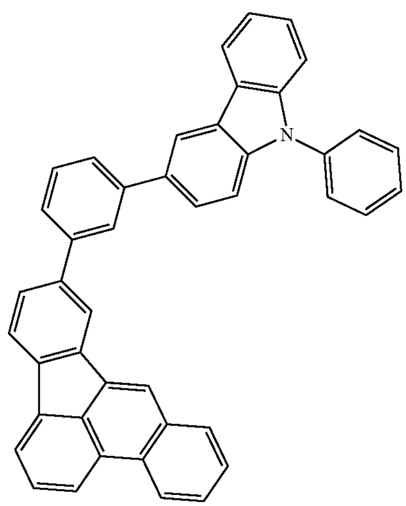
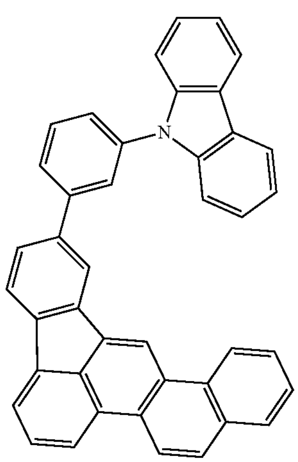
-continued
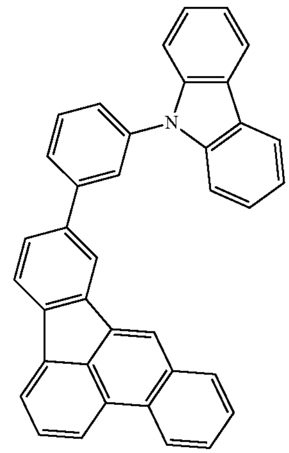
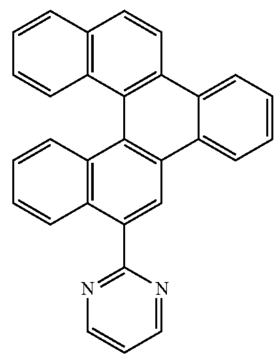
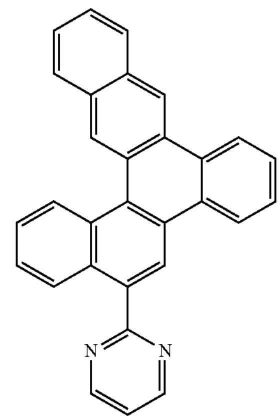
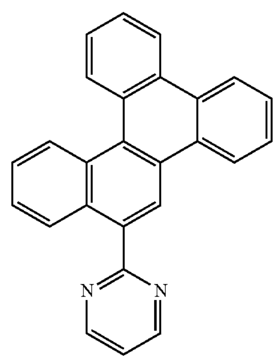
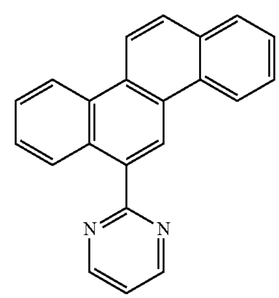
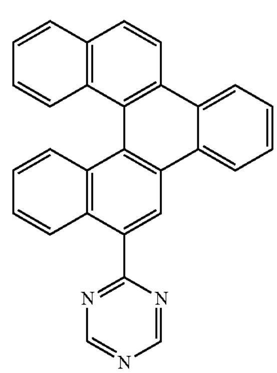
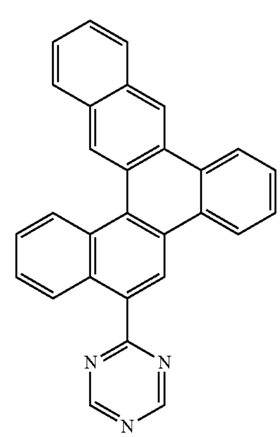

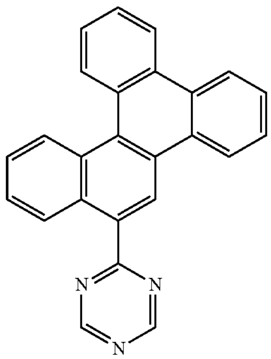
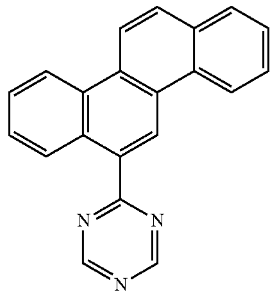
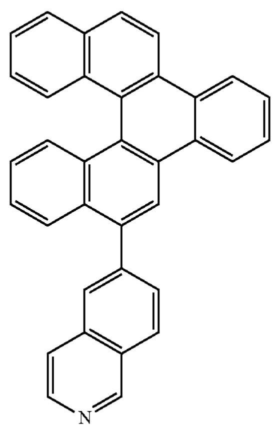
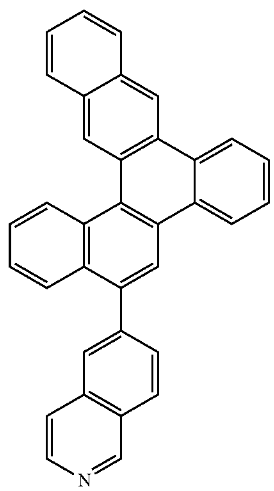
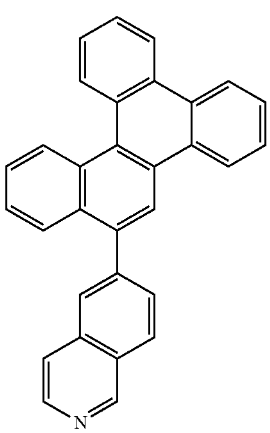
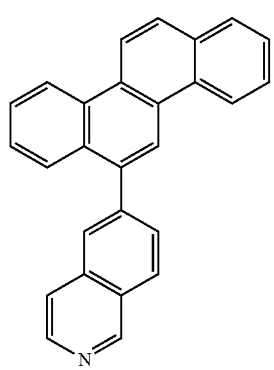
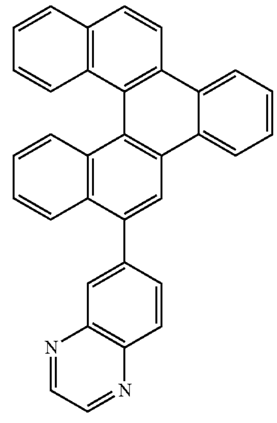
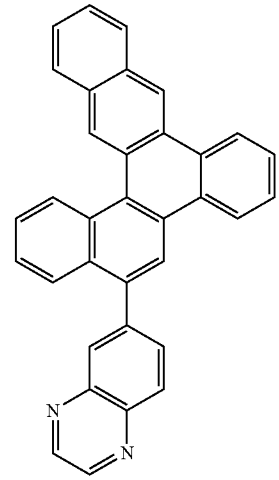
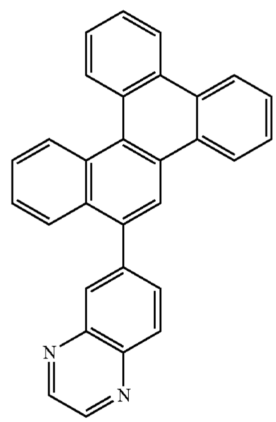
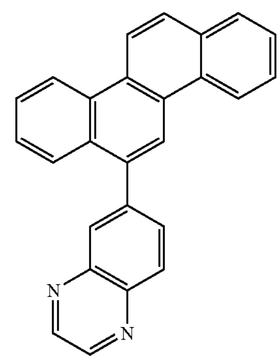
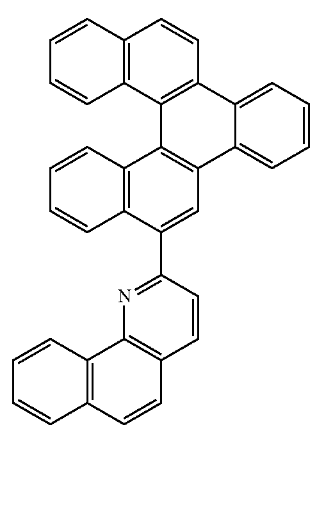

-continued
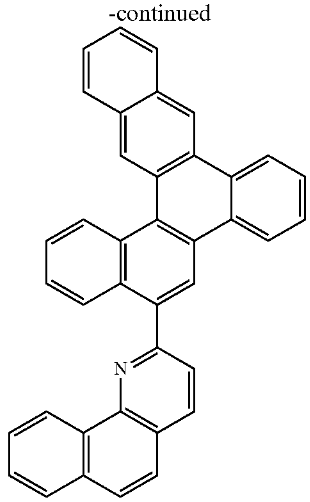
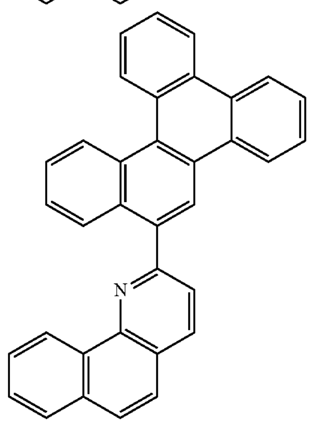
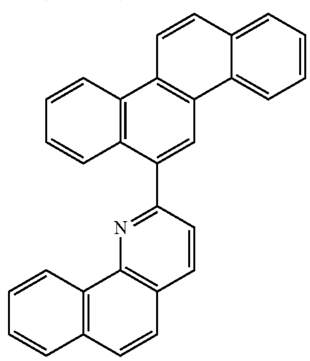
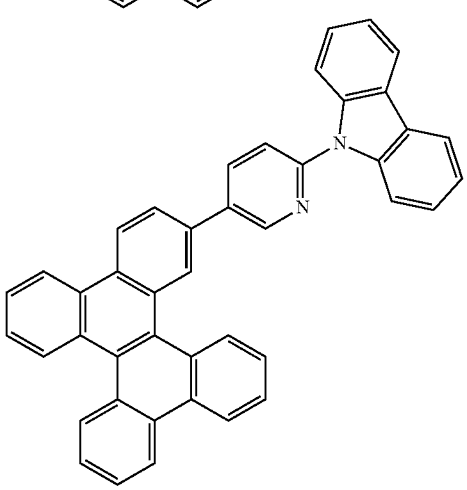
-continued
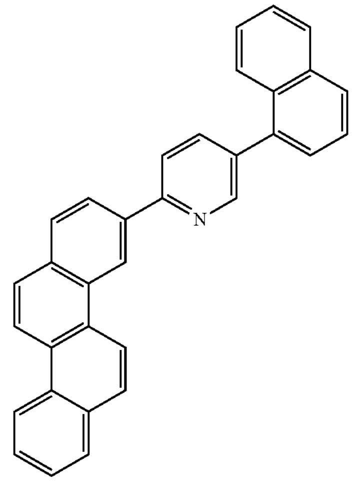
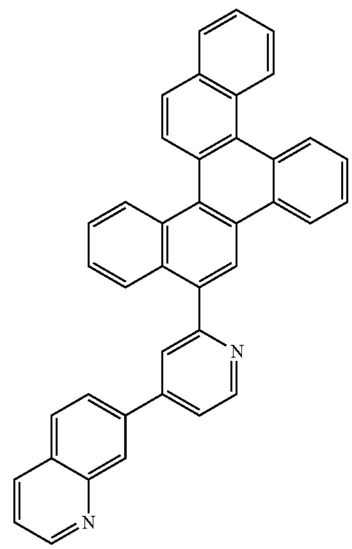
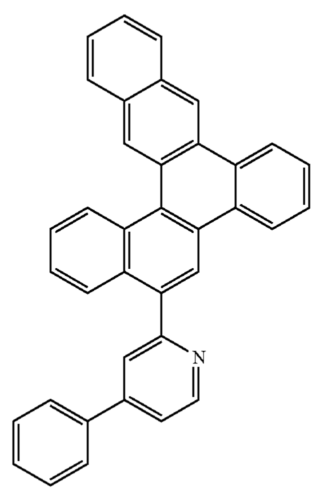

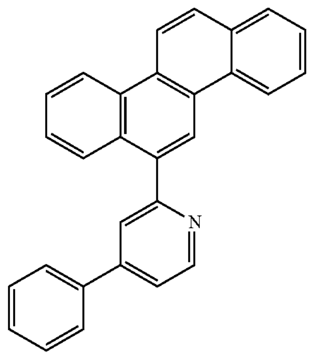
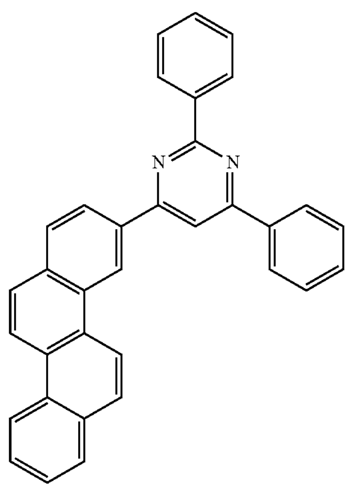
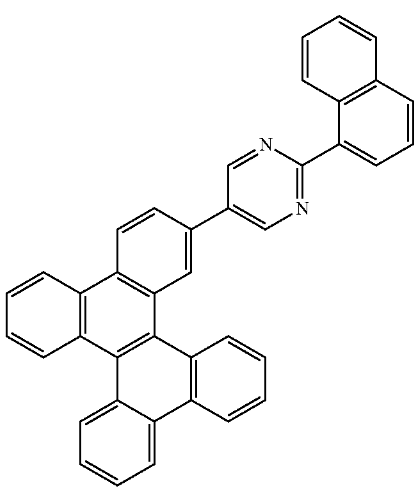
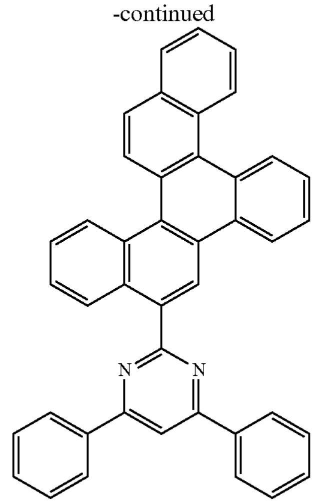
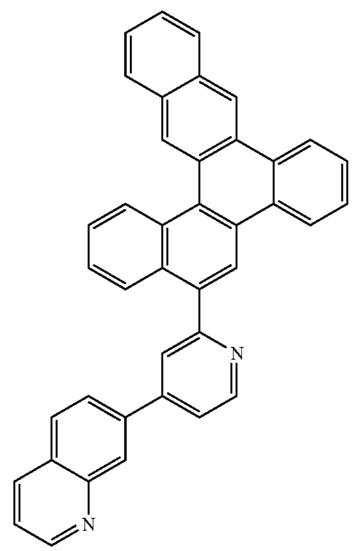
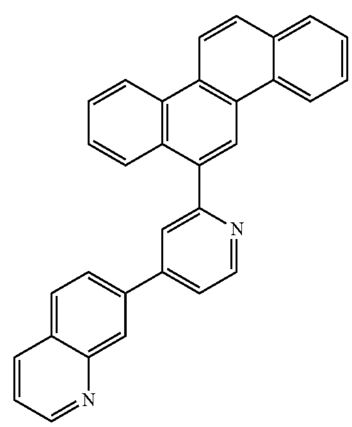

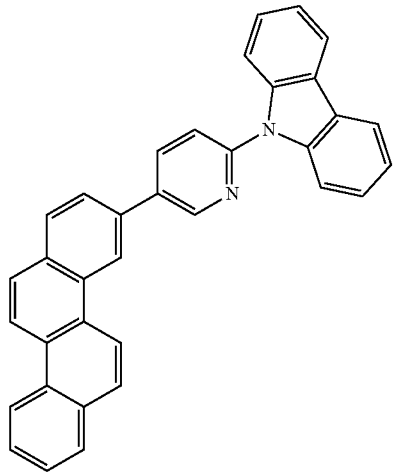
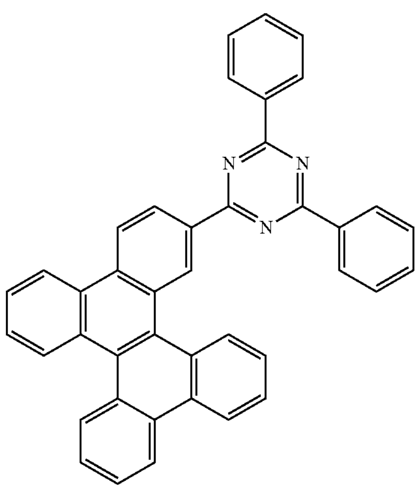
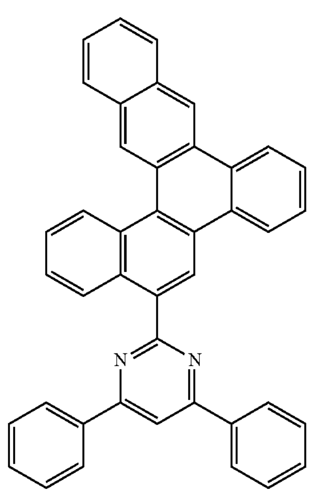
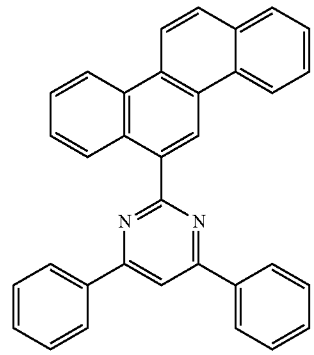
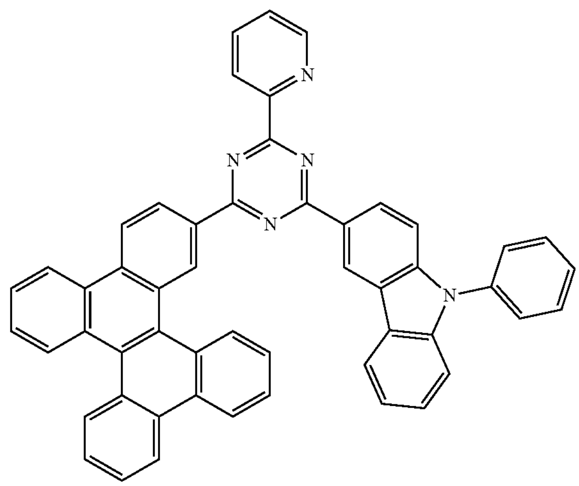
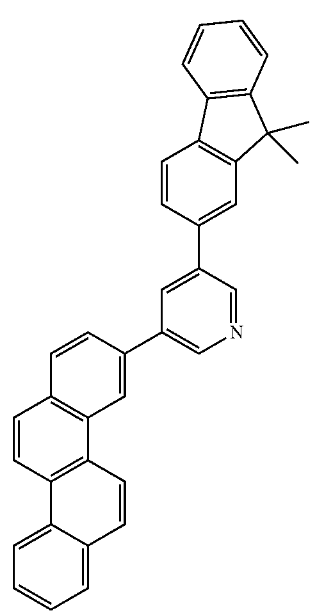

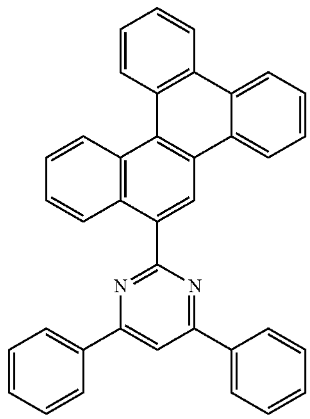
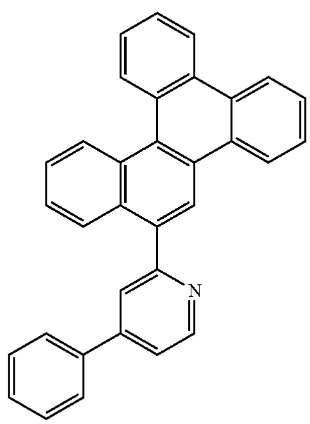
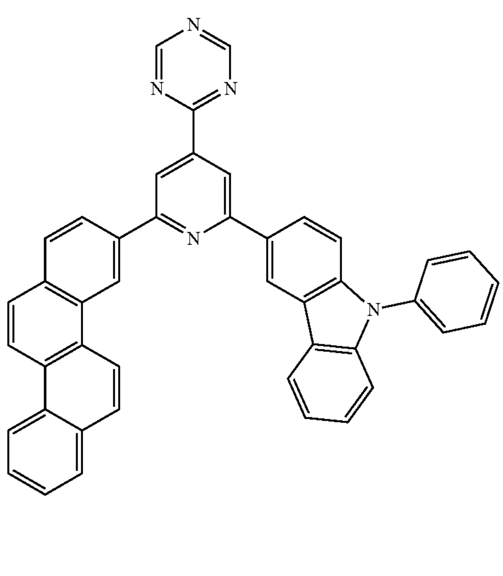
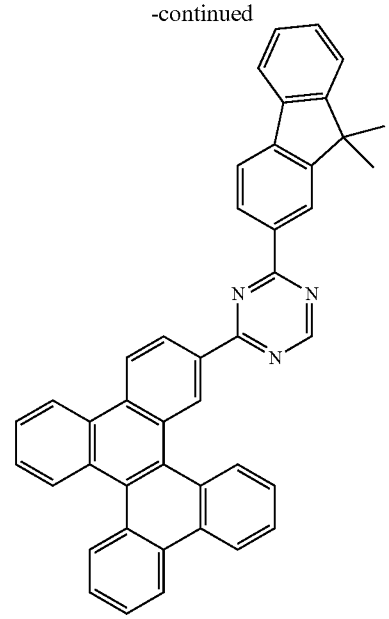
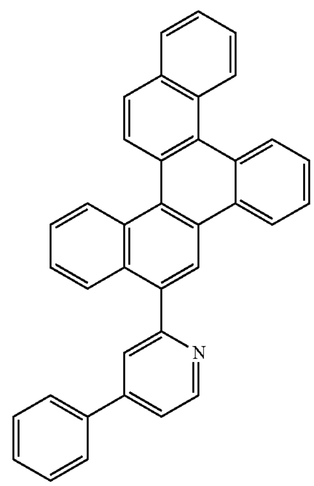
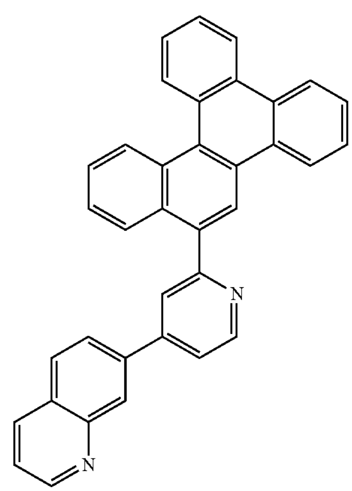
N
N
N
N -continued
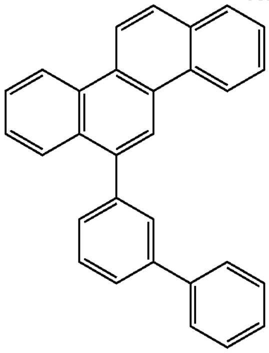
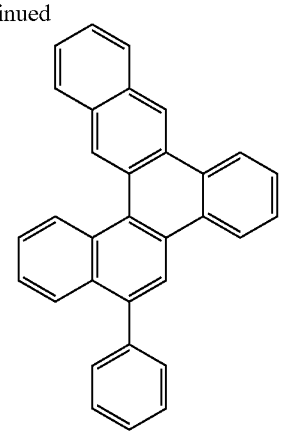
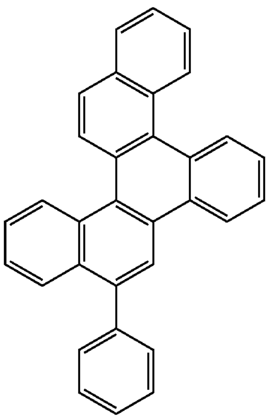
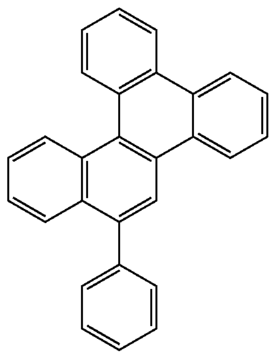
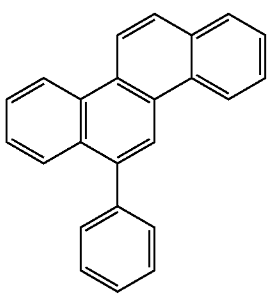
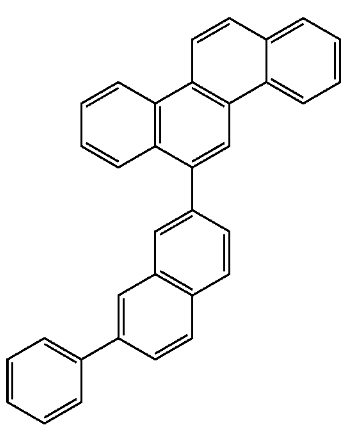
-continued
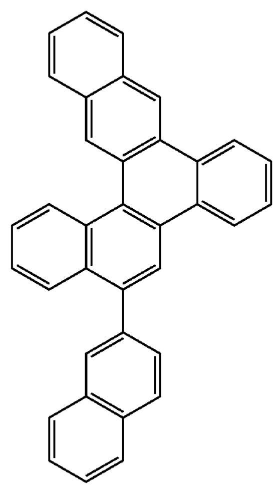
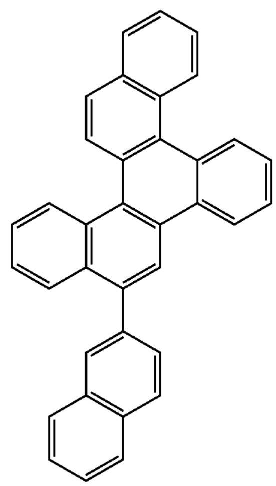
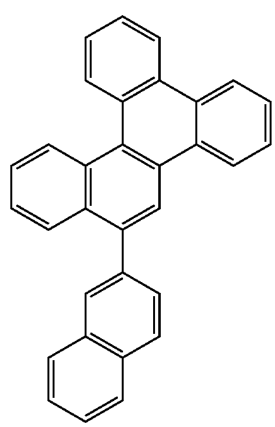
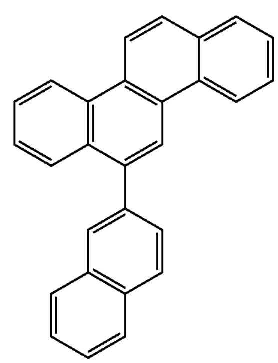

-continued
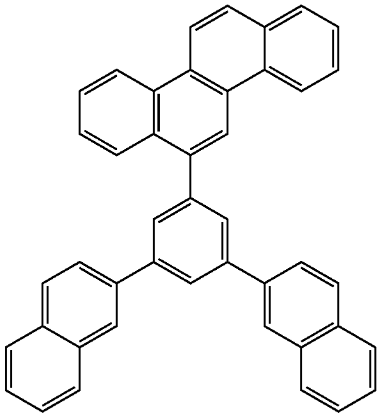
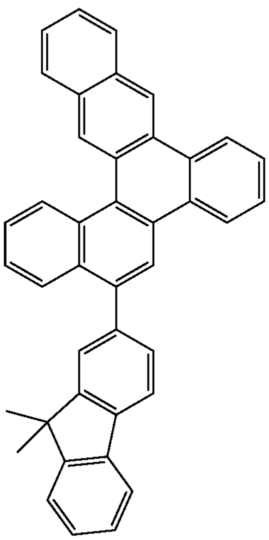
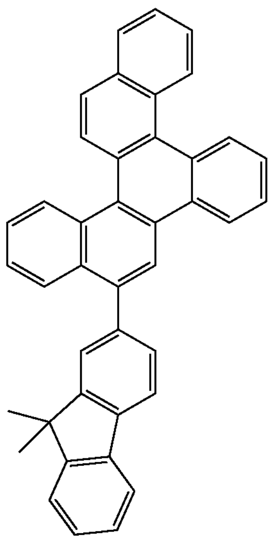
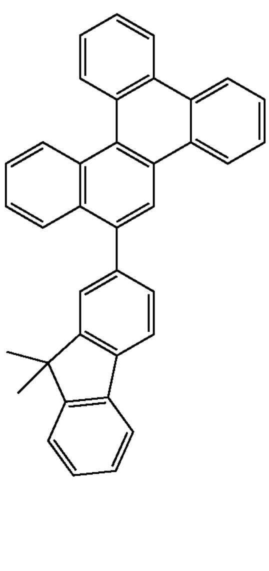
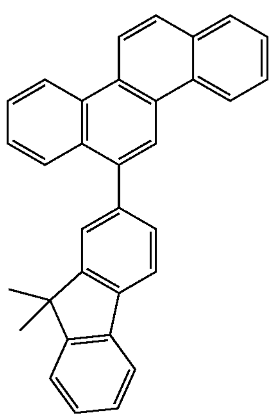
-continued
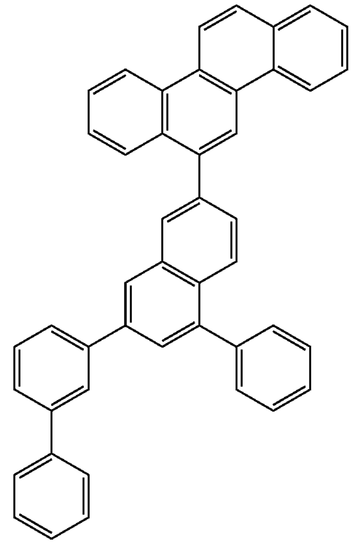
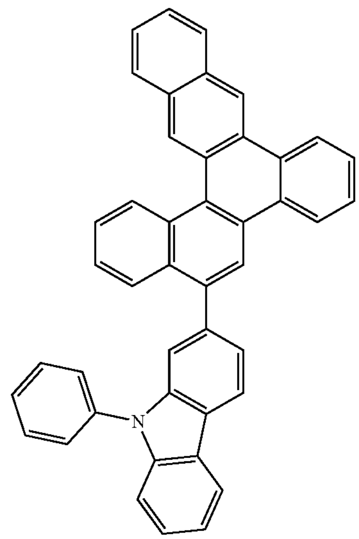
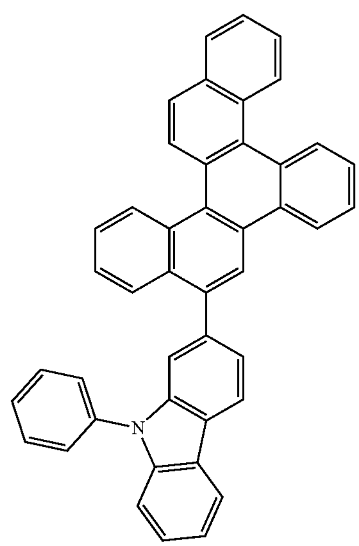

-continued
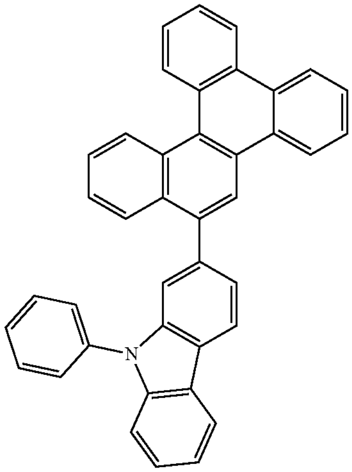
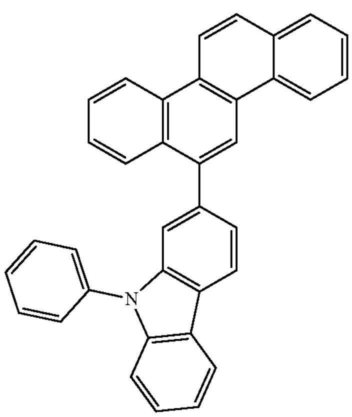
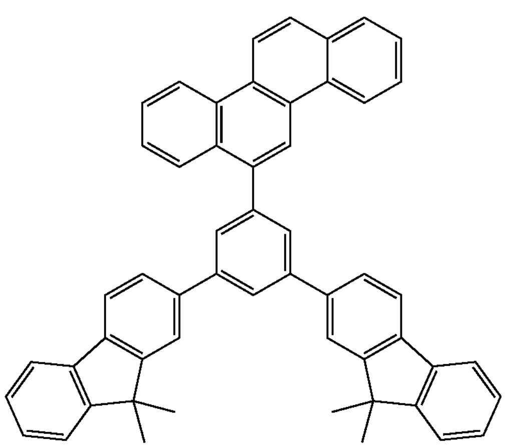
-continued
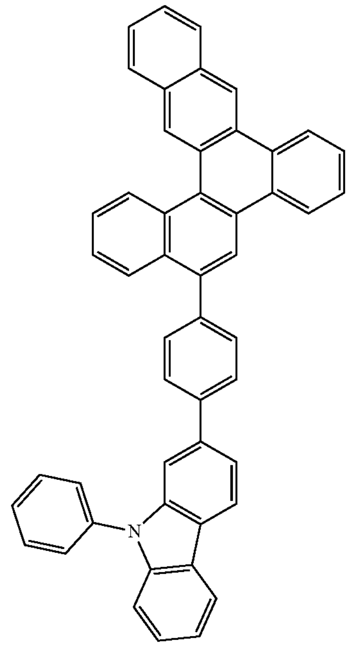
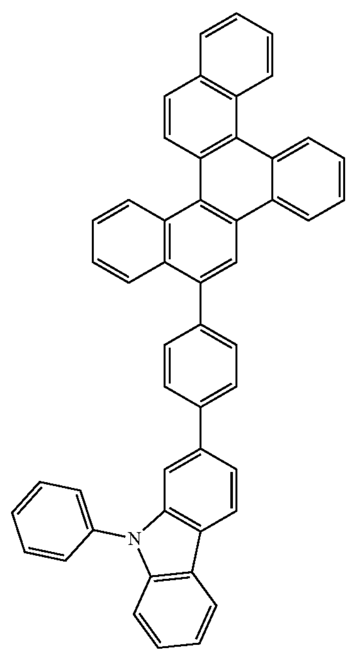

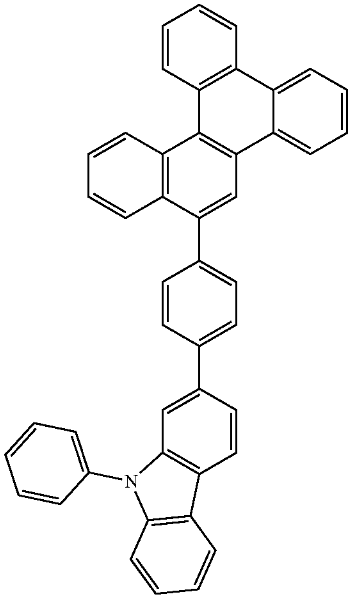
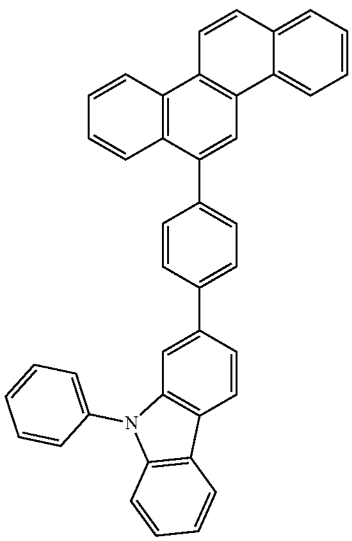
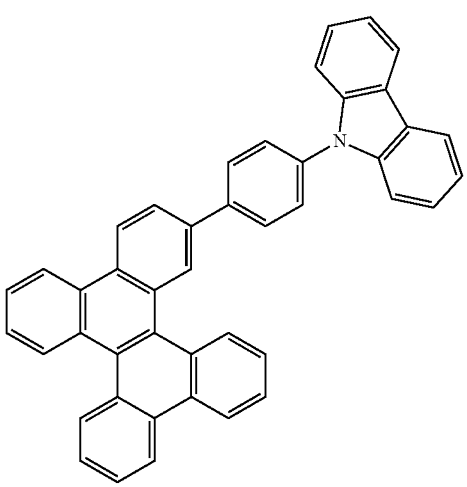
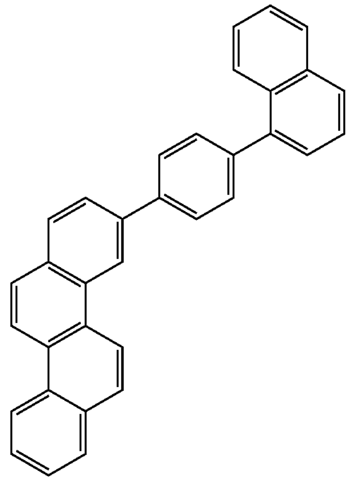
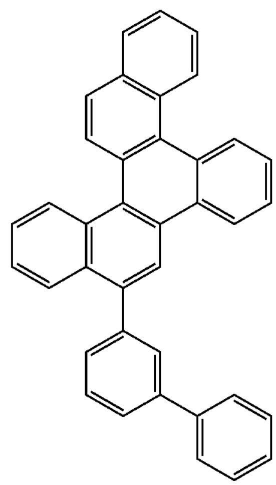
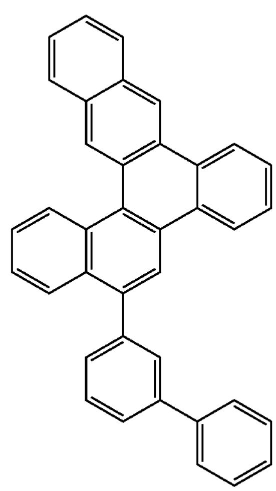
N
N
N -continued
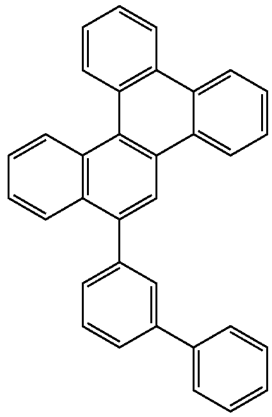
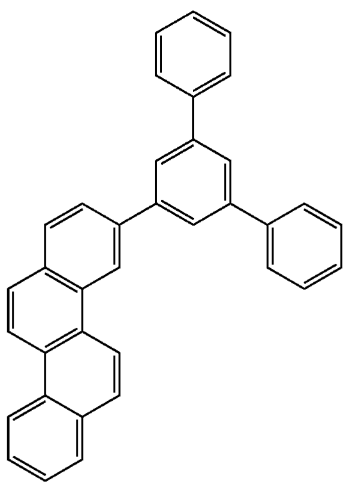
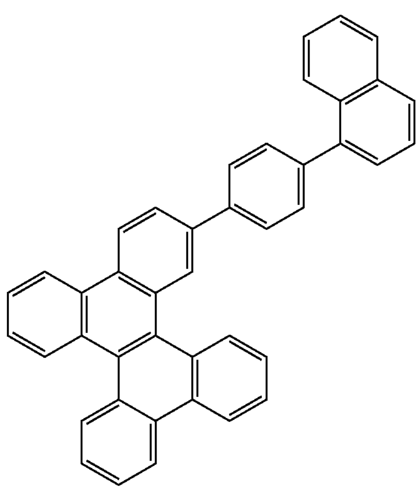
-continued
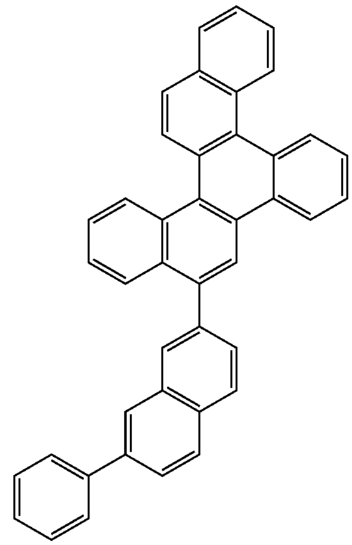
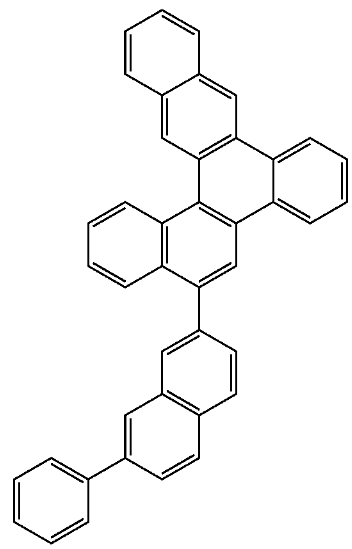
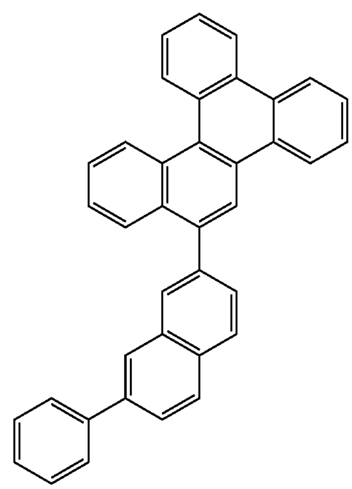

-continued
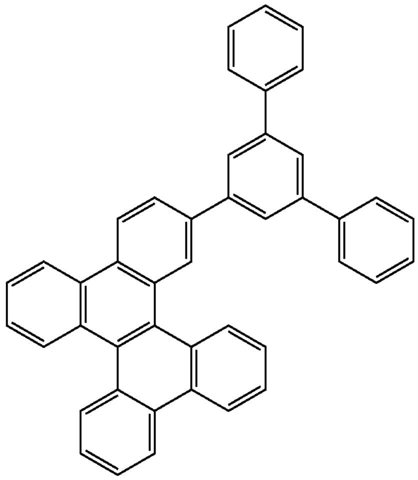
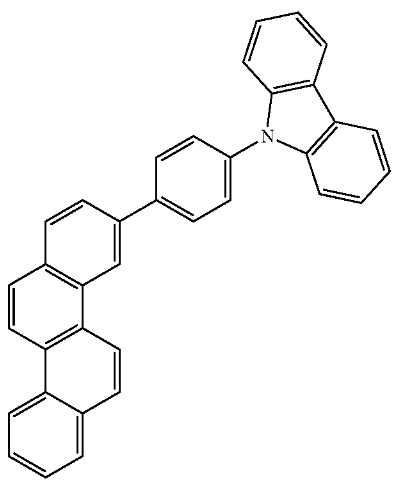
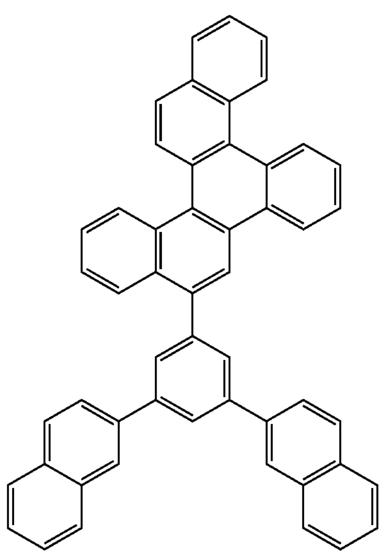
-continued
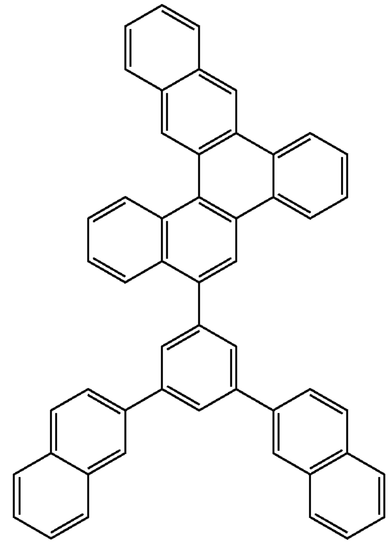
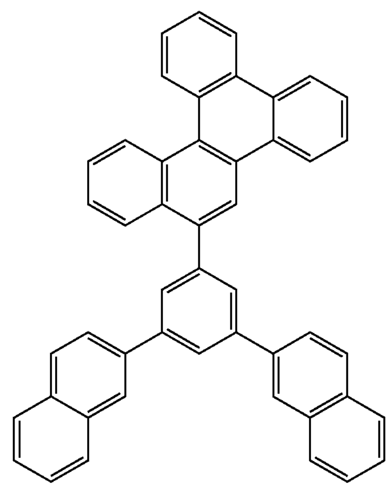
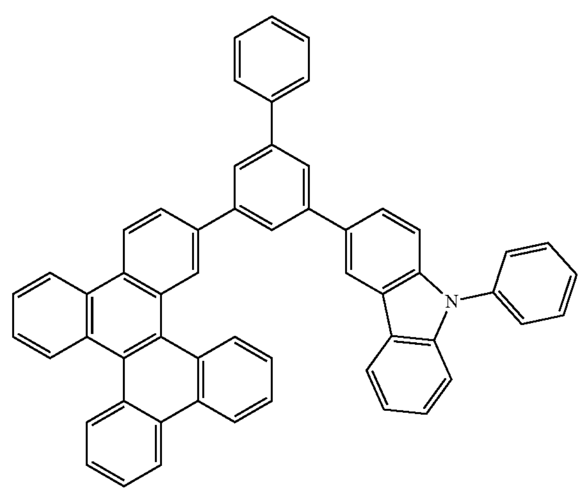

-continued
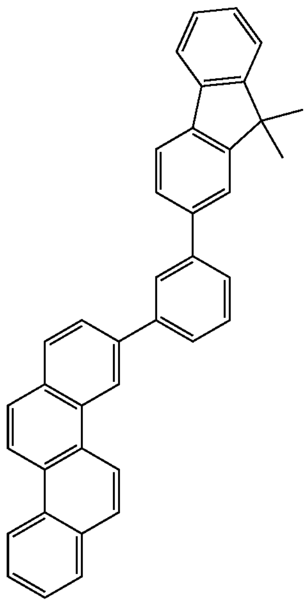
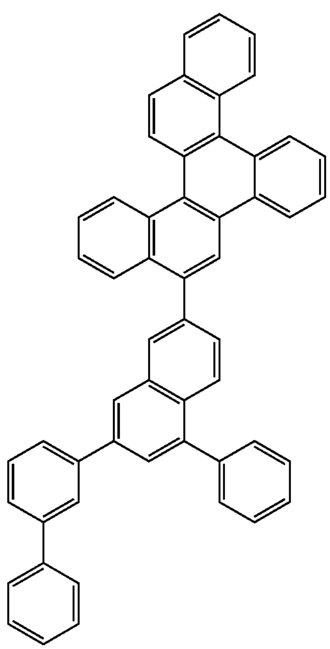
-continued
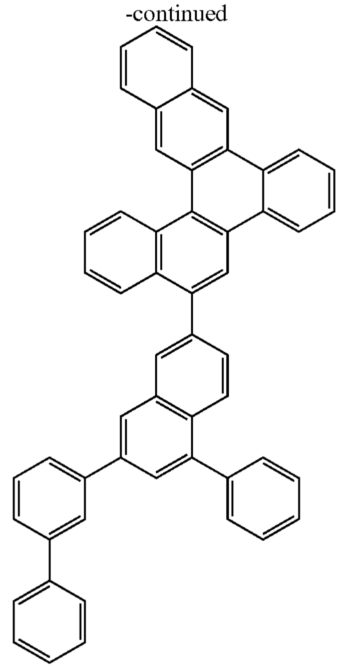
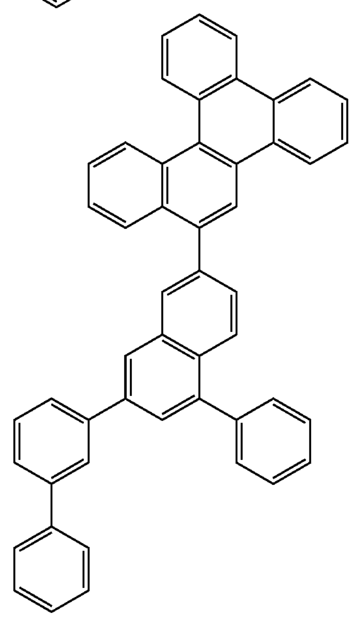
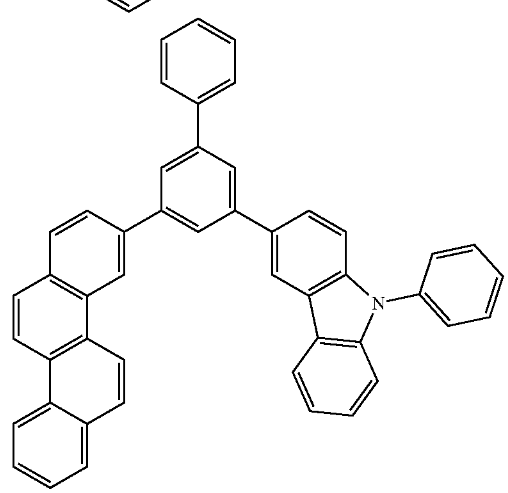

-continued
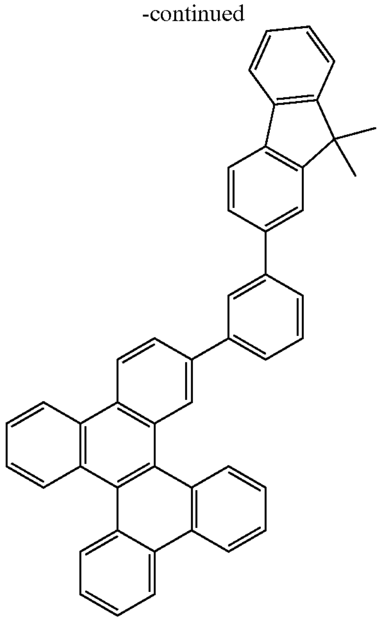
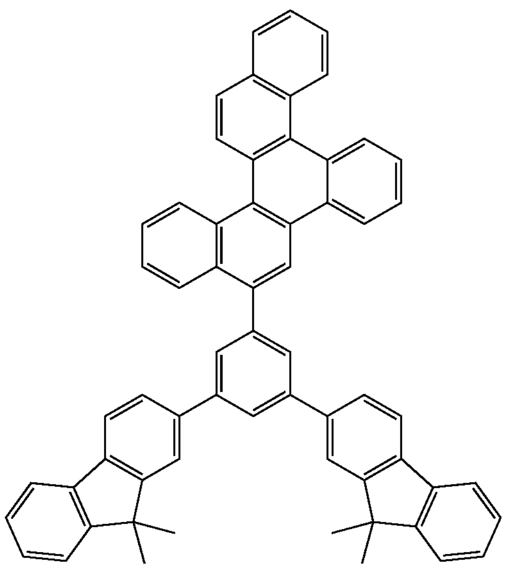
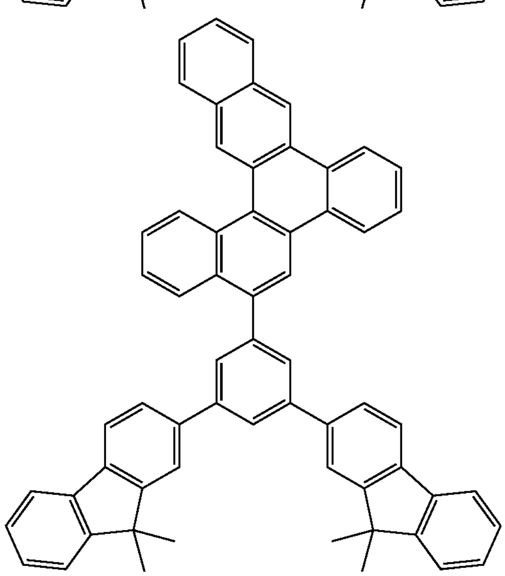
-continued
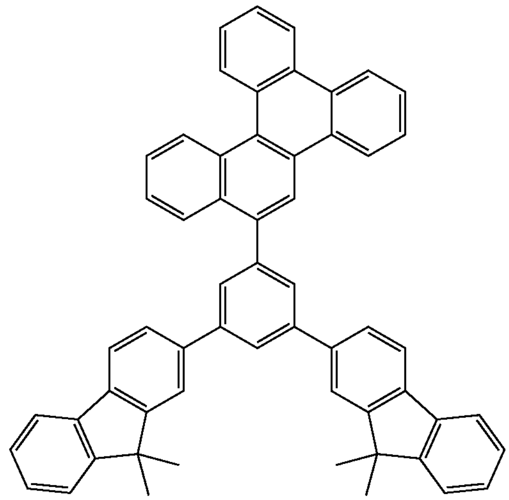
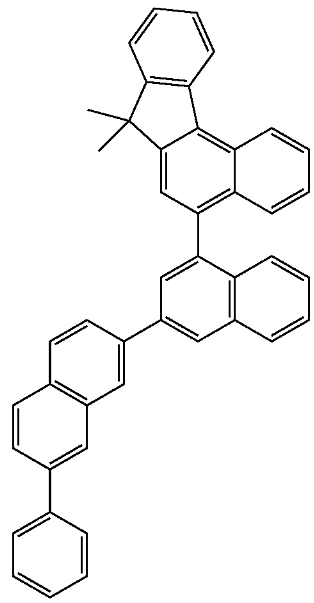
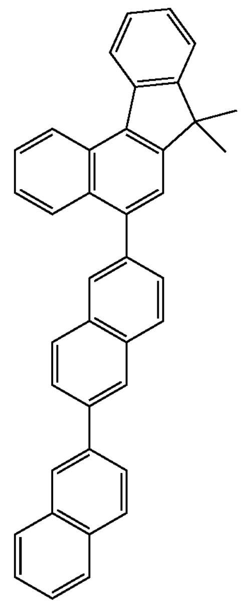
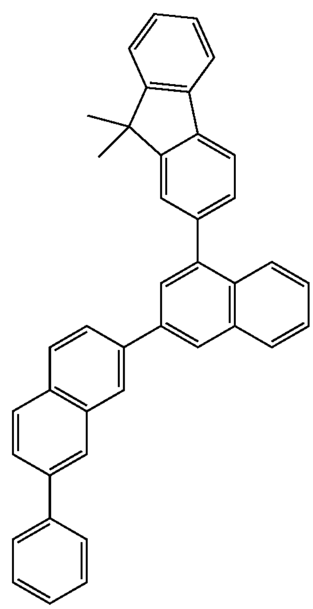
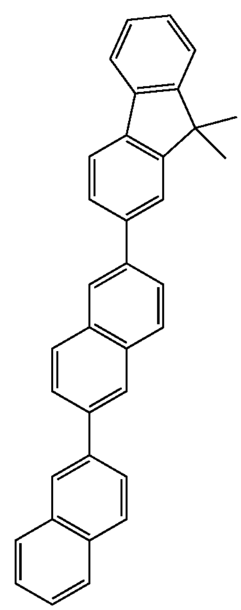

-continued
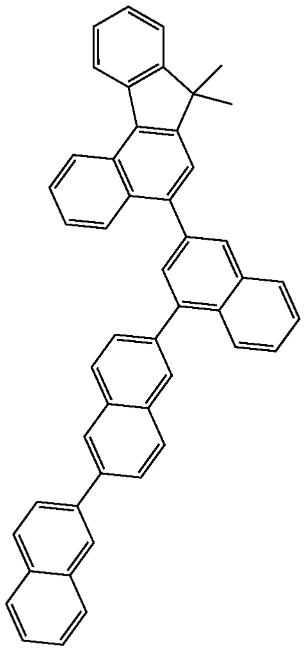
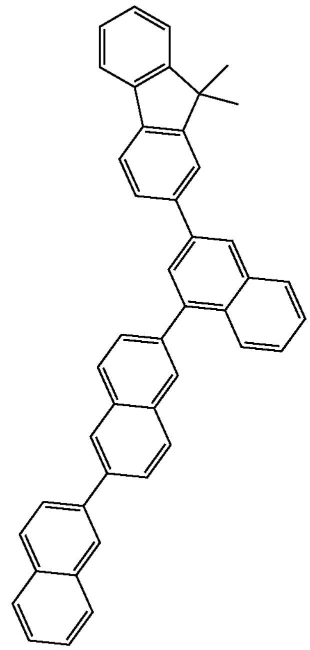
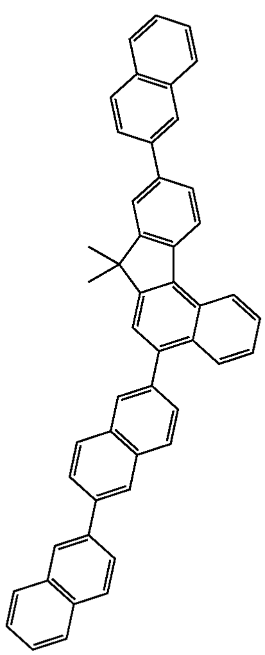
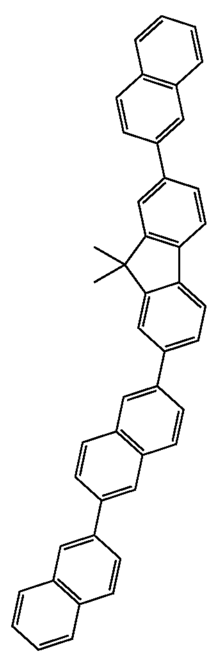

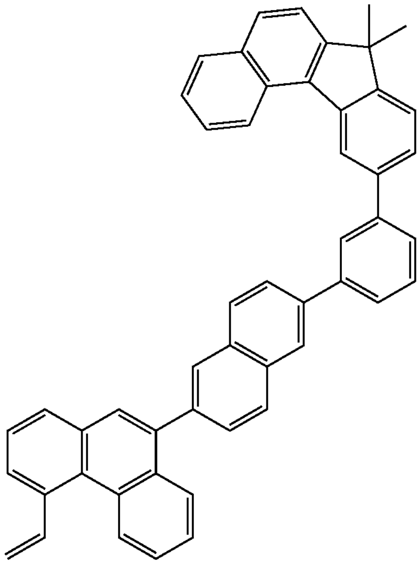
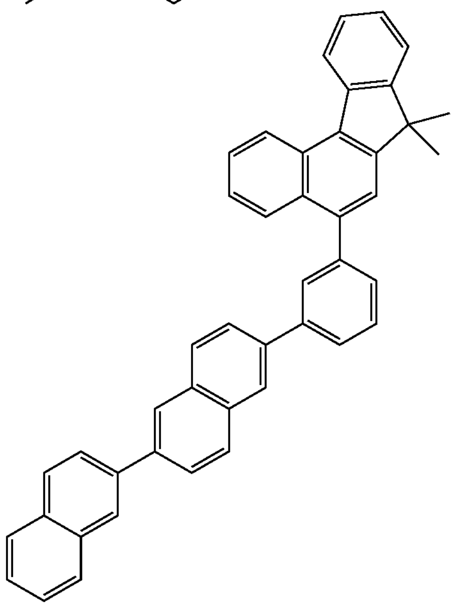
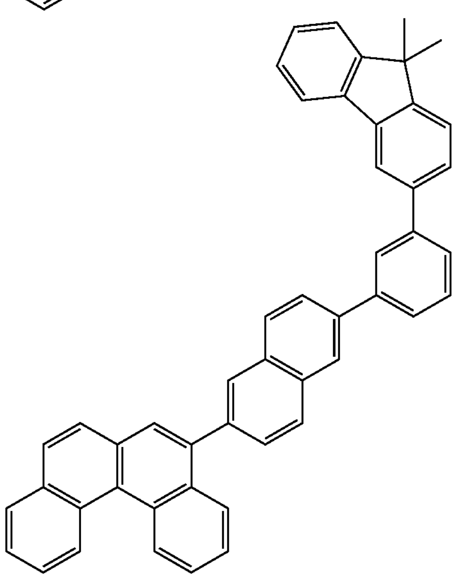
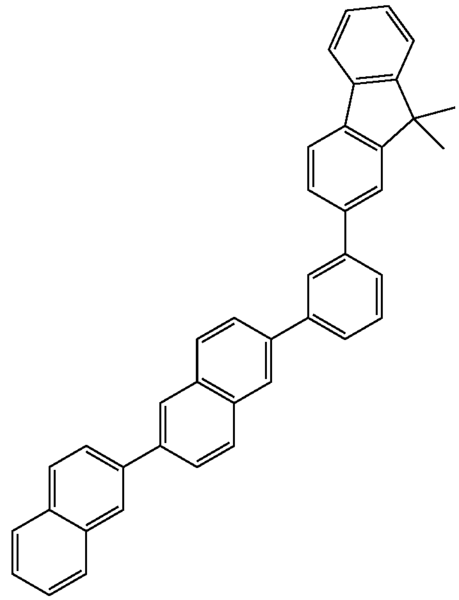
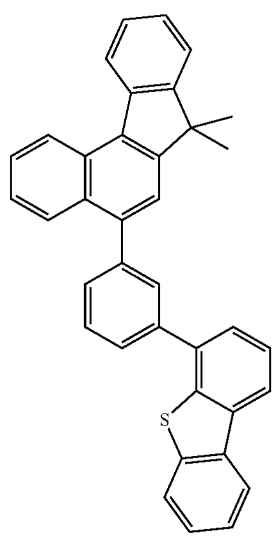

-continued
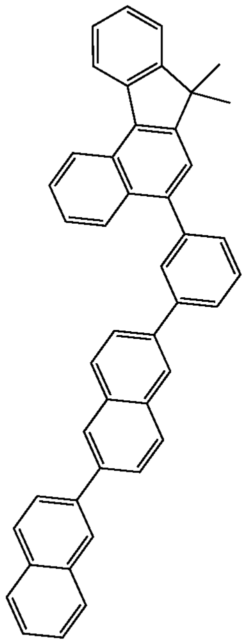
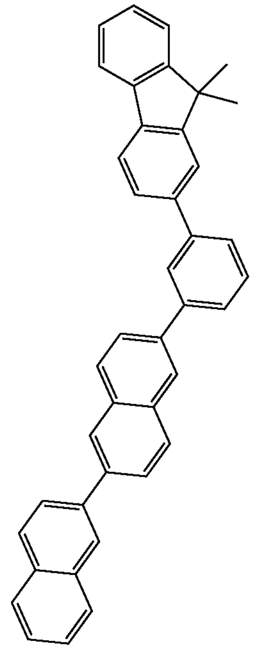
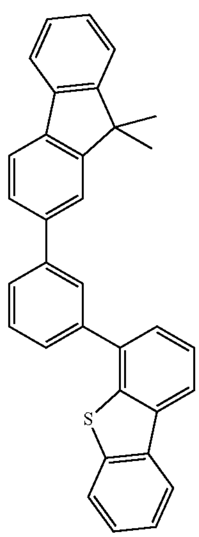
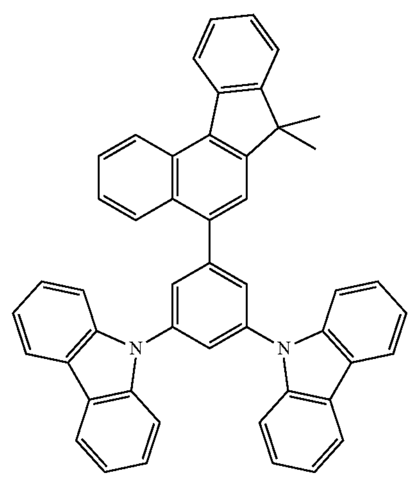

-continued
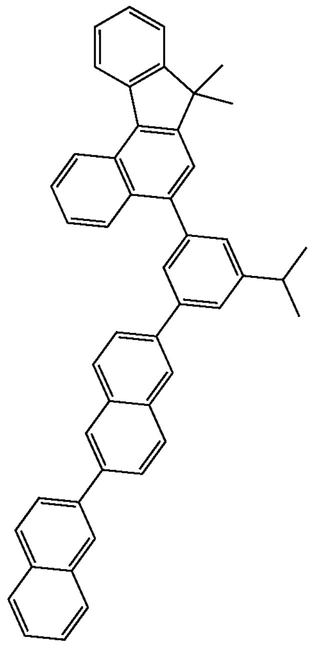
-continued
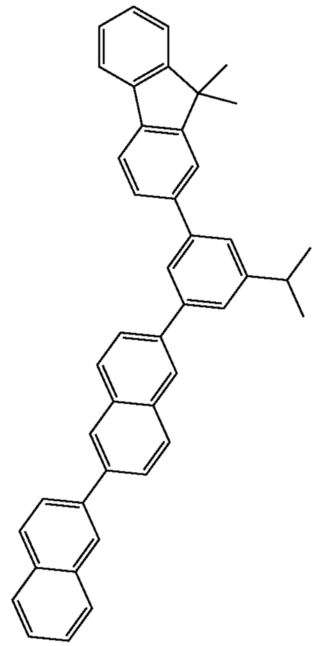
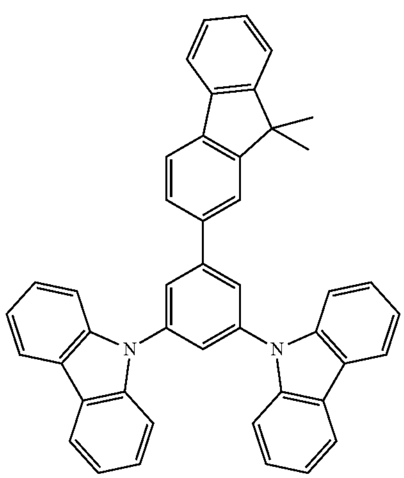
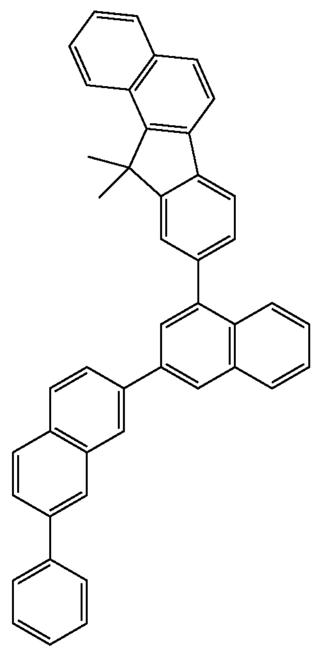
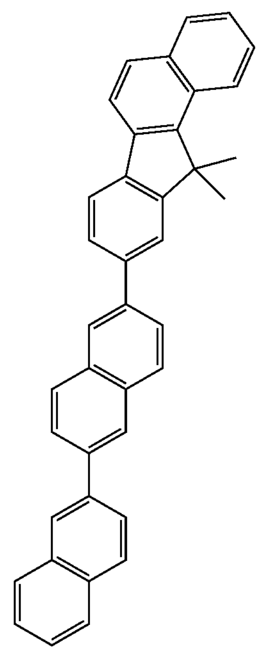

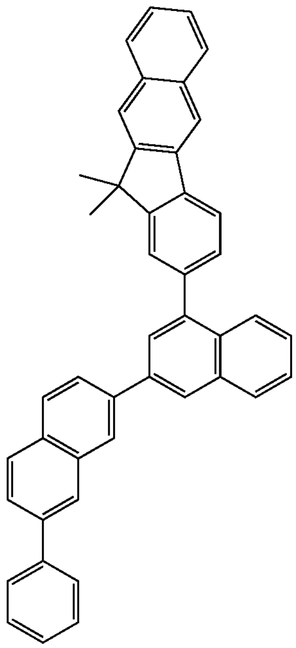
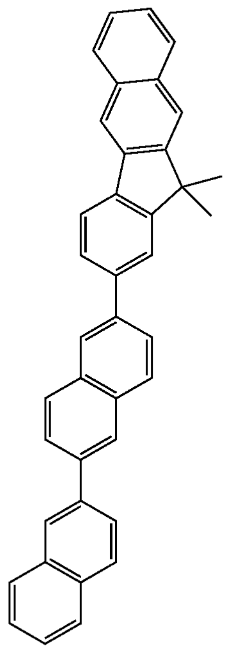
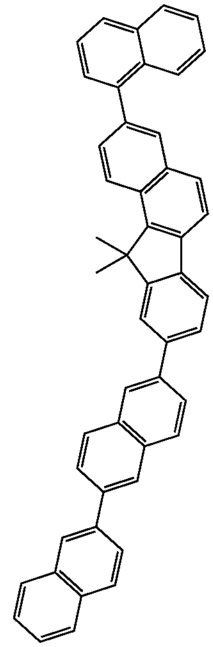
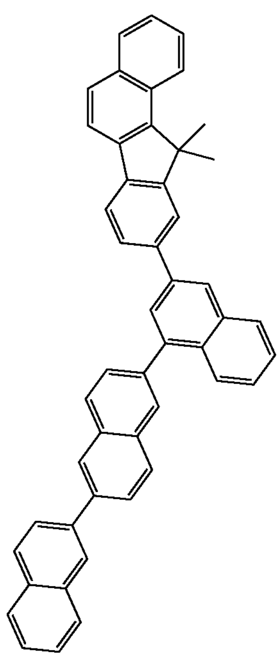
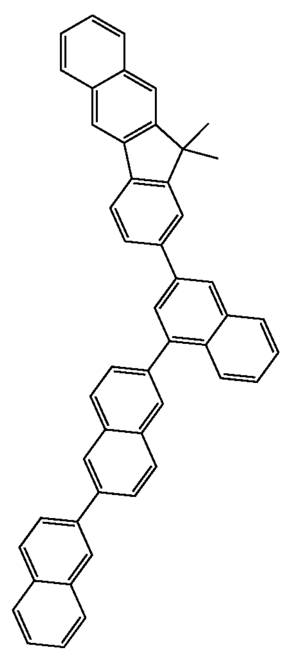

-continued
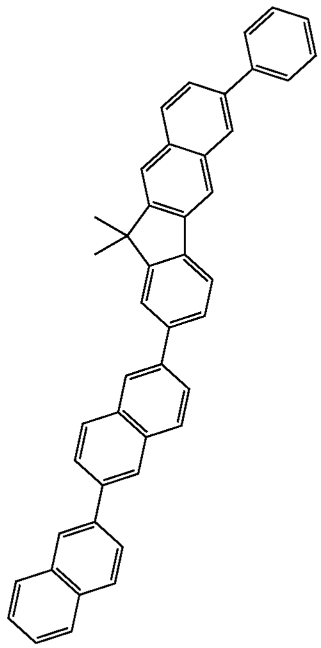
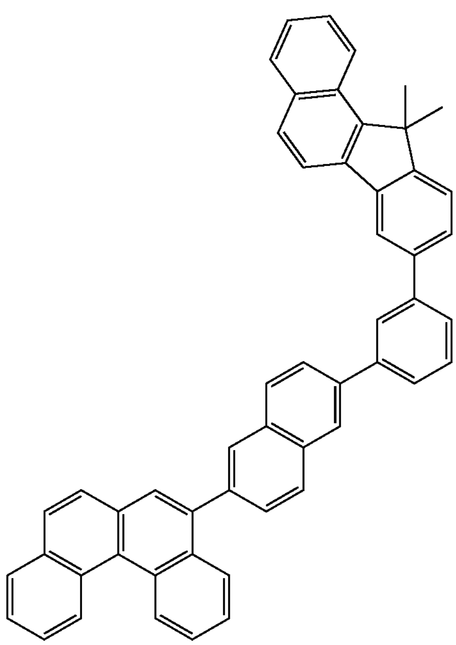
-continued
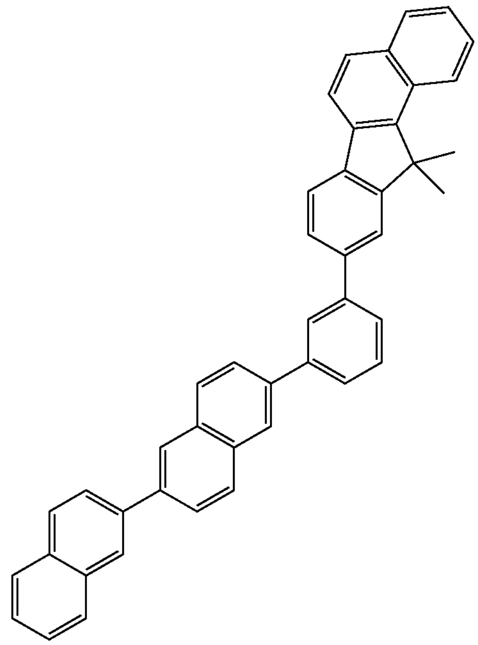
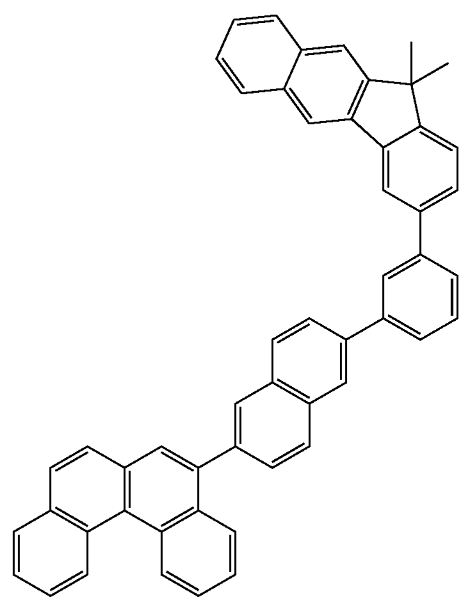

-continued
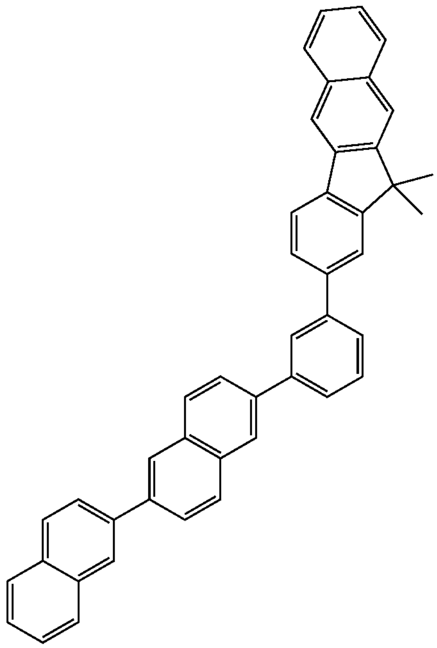
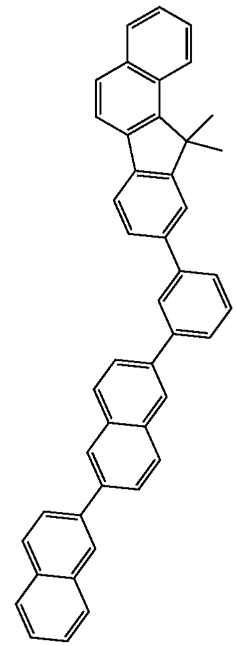
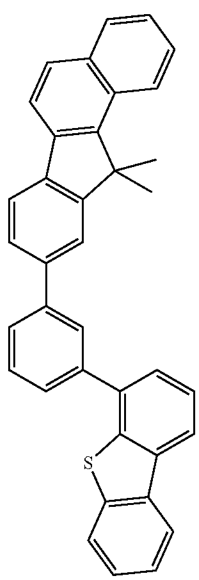
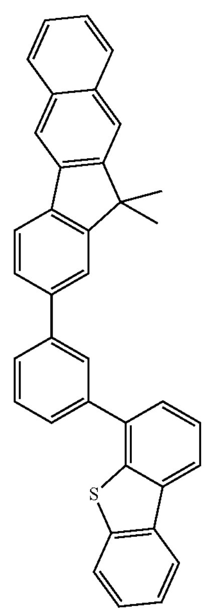

-continued
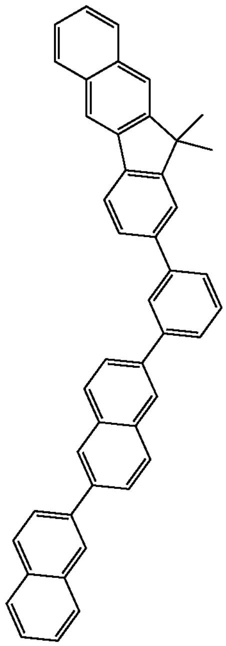
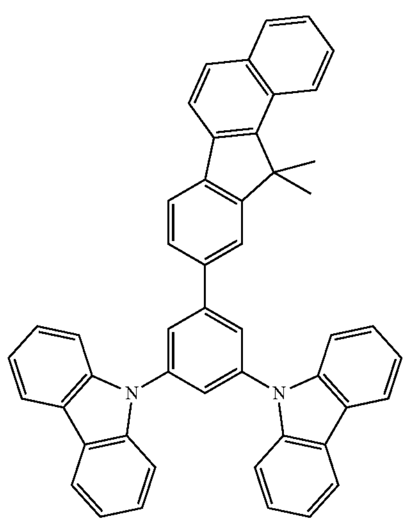
-continued
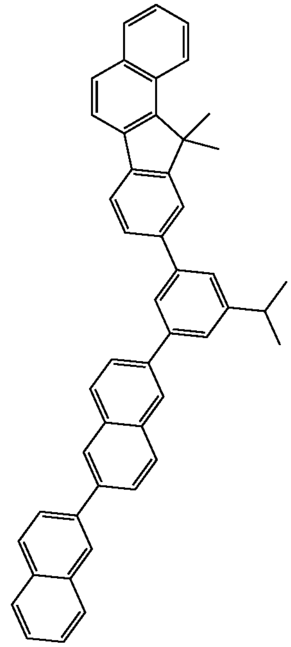
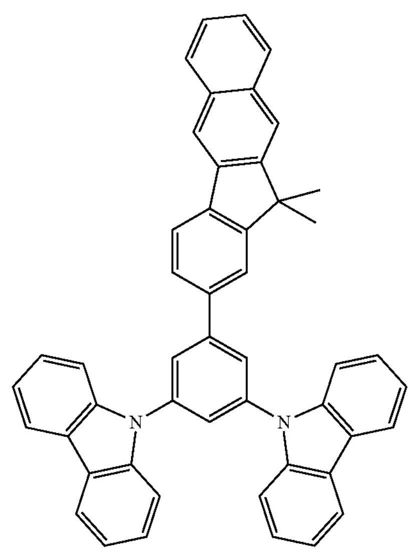

-continued
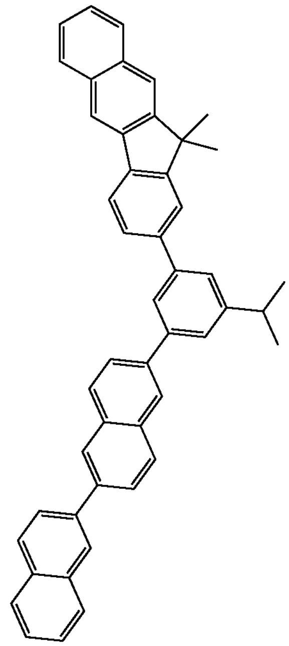
-continued
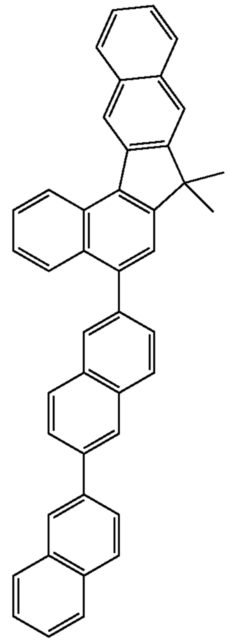
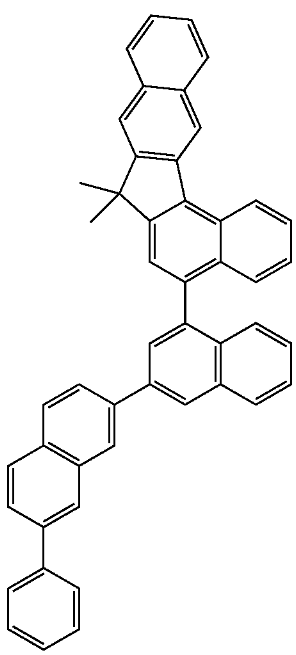
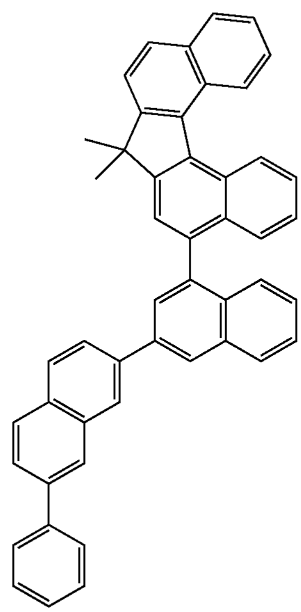

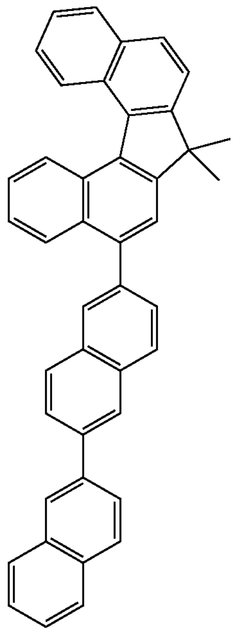
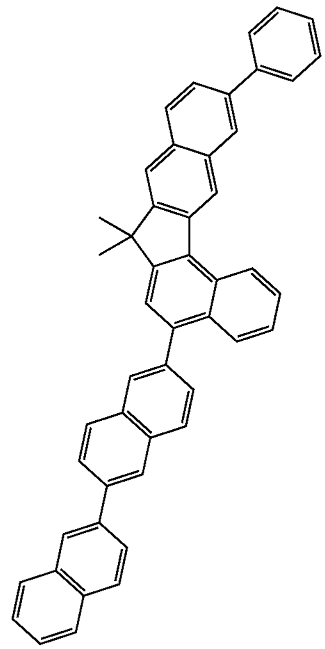
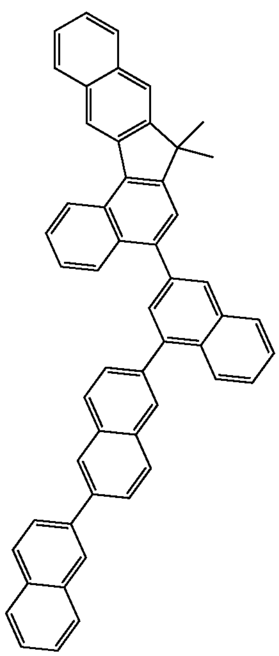
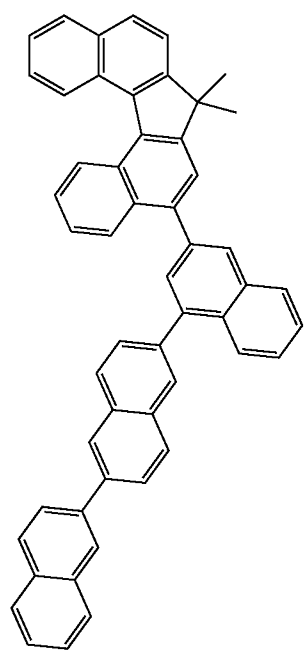

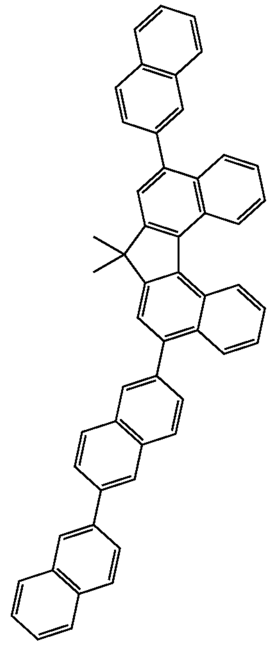
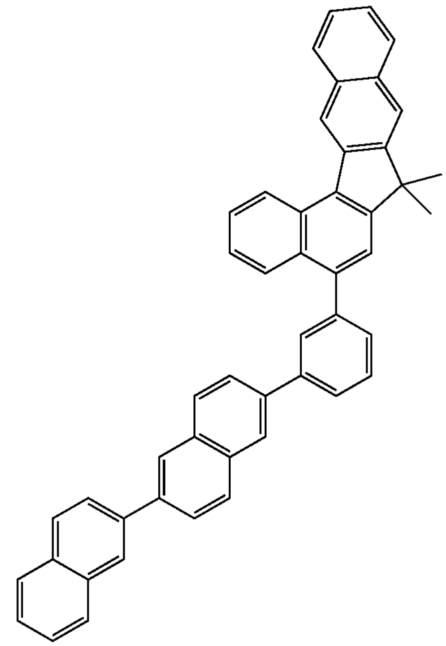
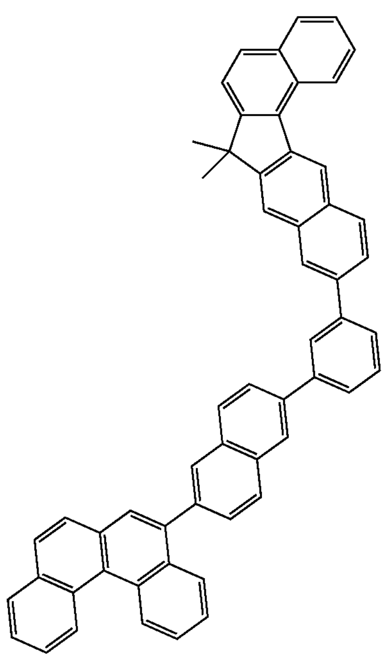
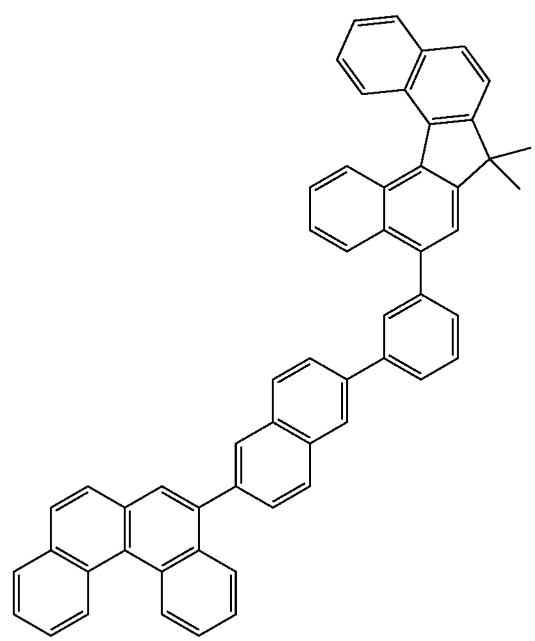

-continued
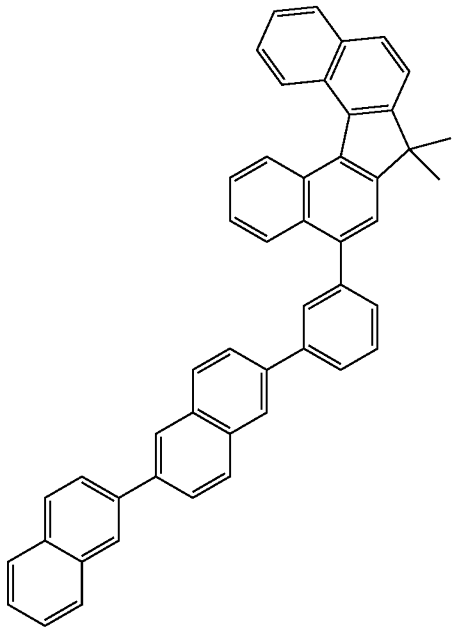
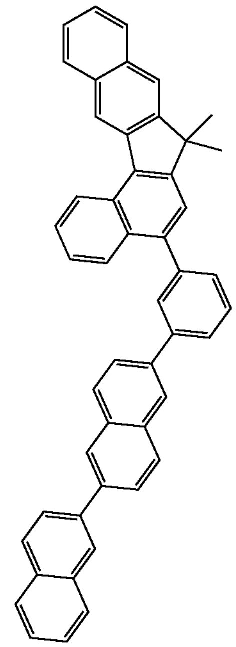
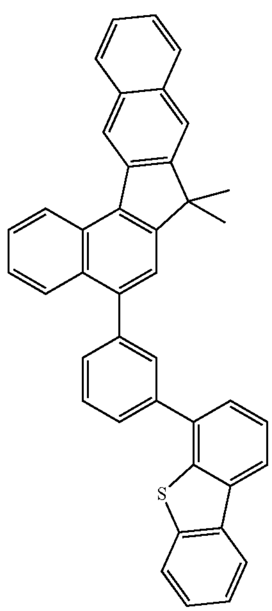
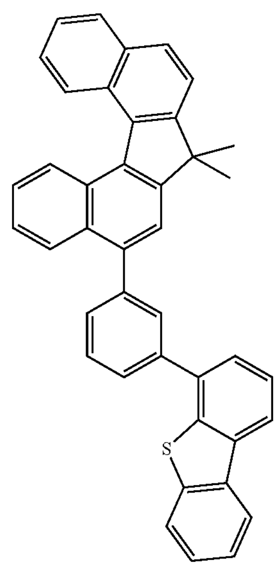

-continued
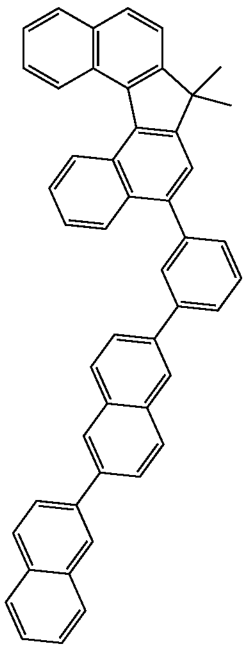
-continued
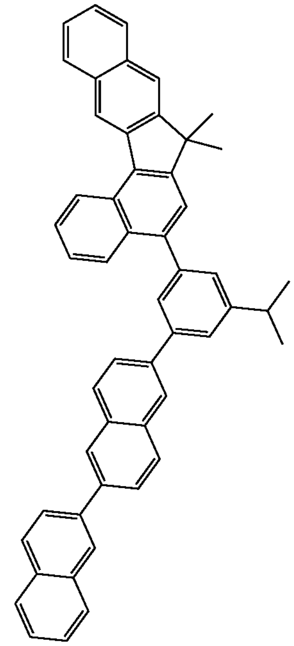
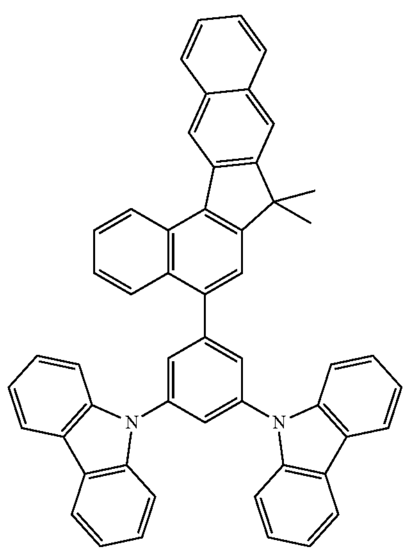
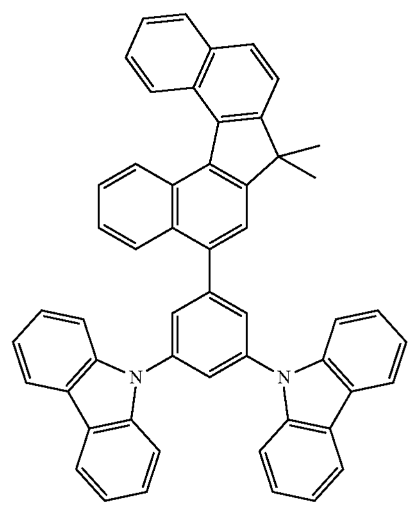

-continued
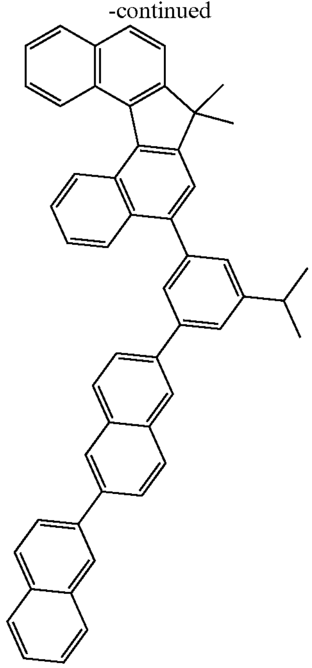
-continued
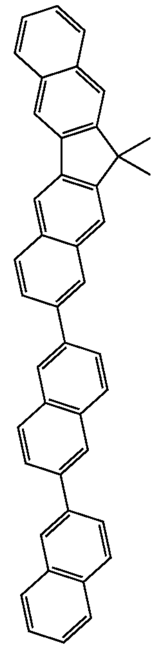
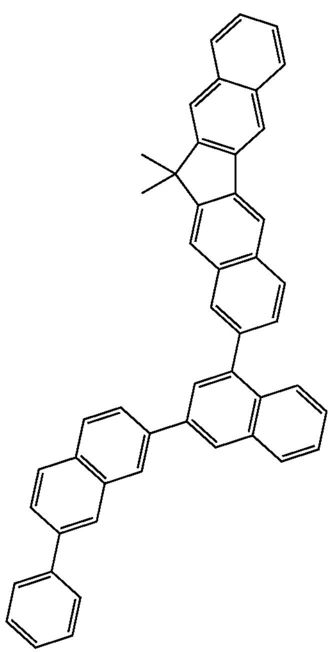
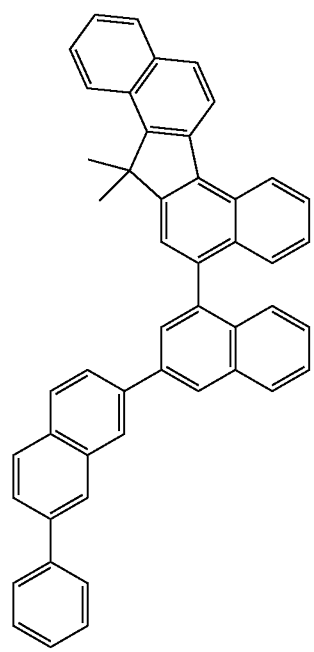

-continued
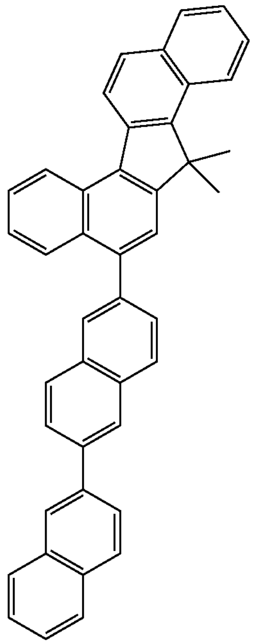
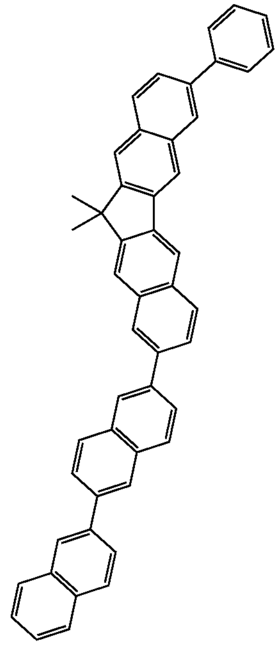
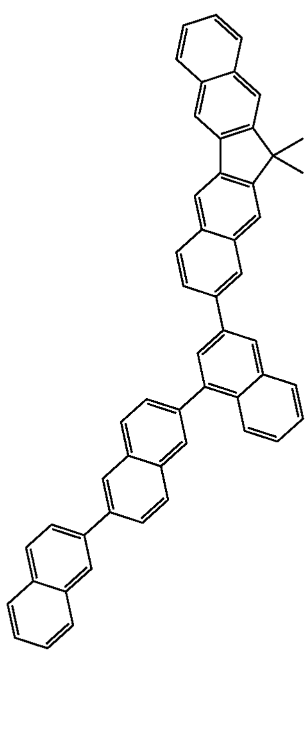
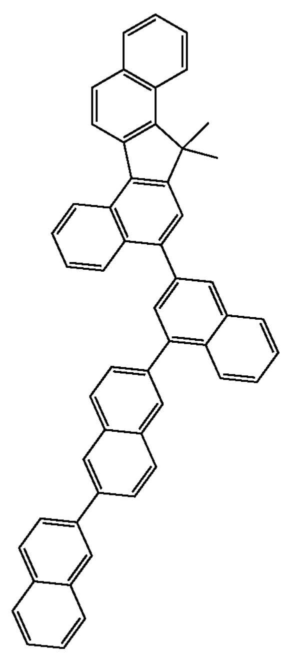
-continued

-continued
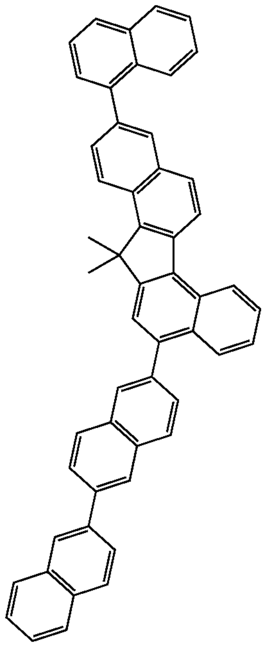
-continued
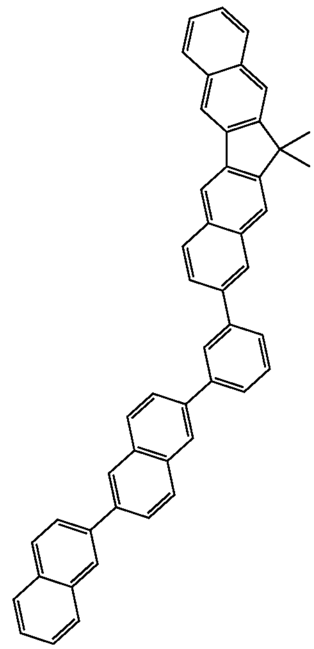
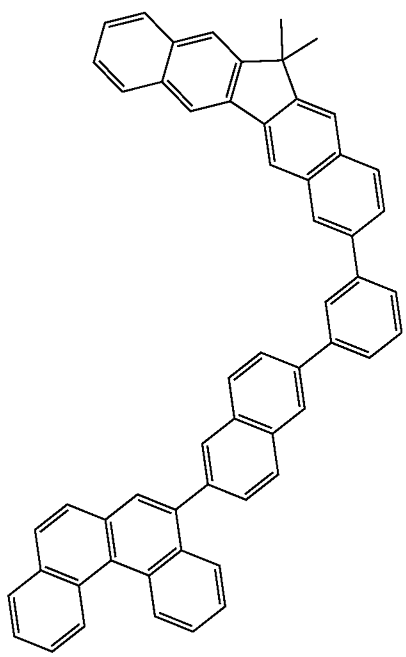
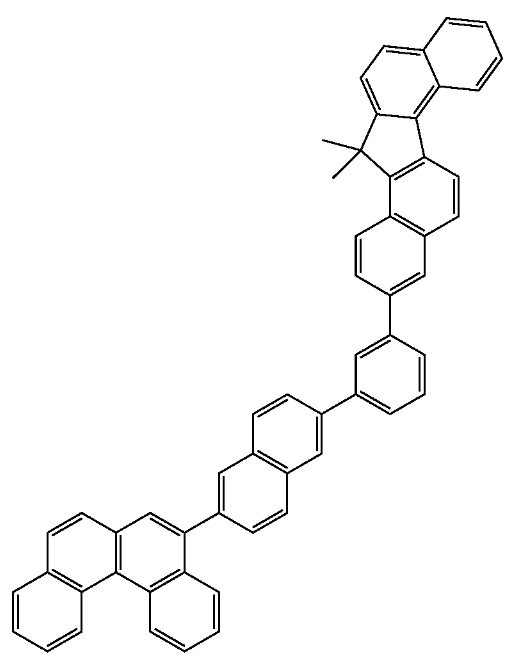

-continued
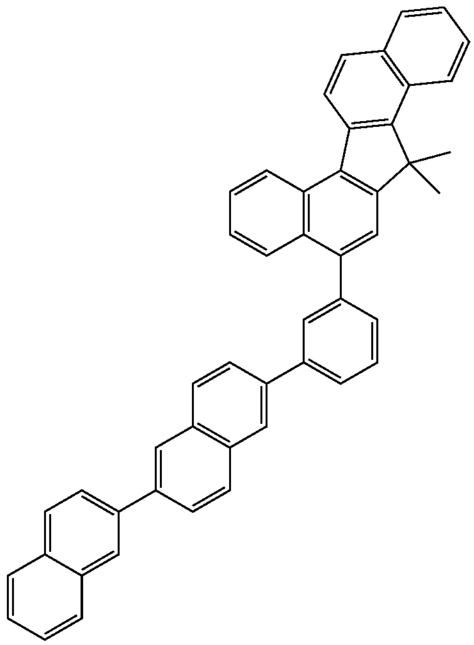
-continued
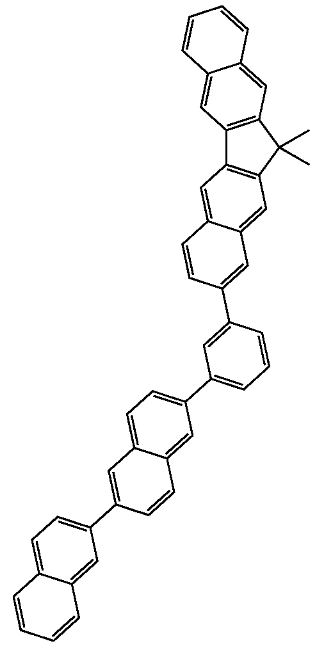
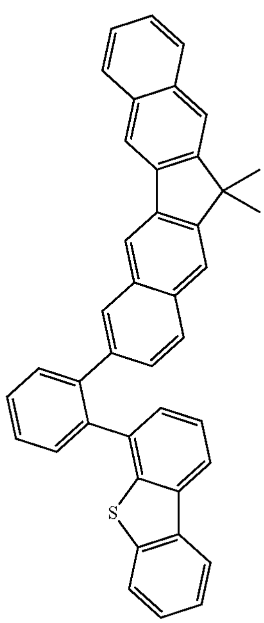
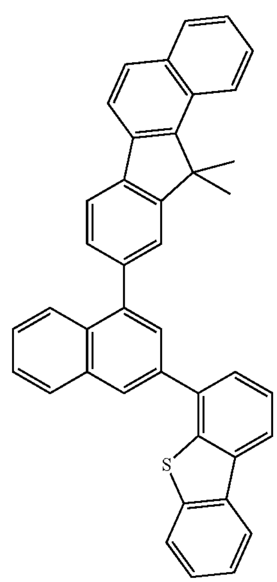

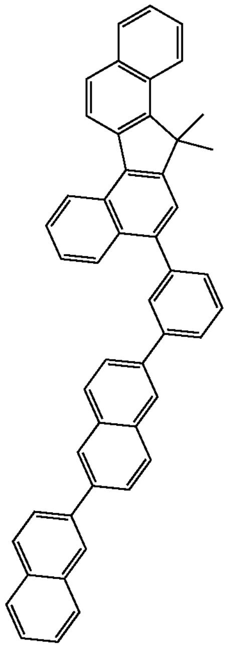
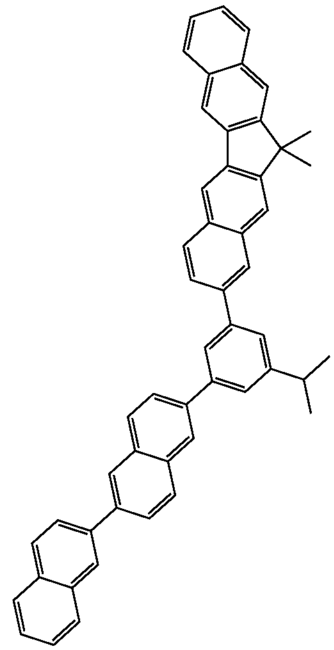
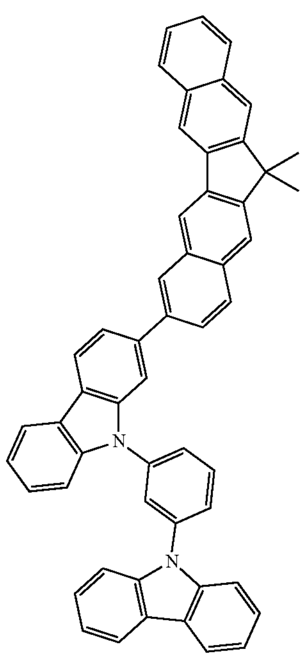
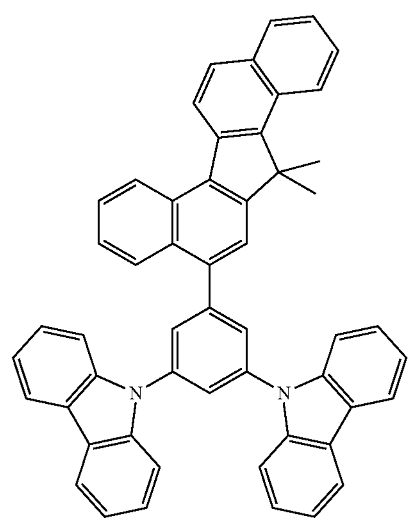

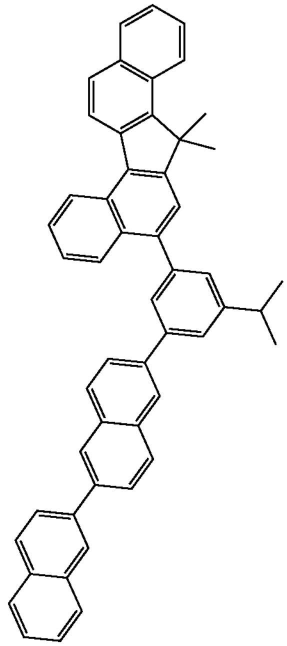
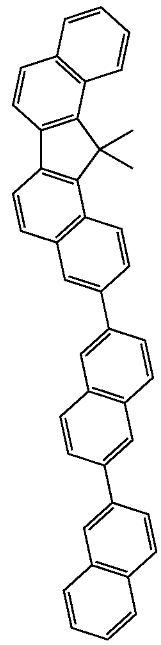
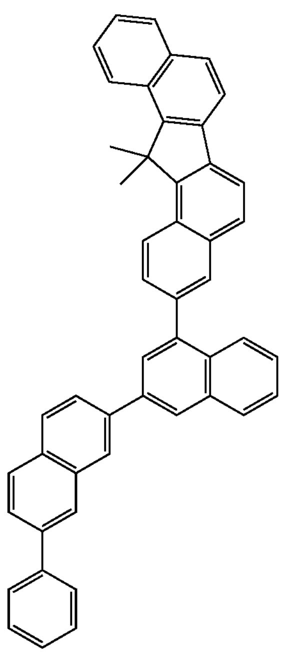
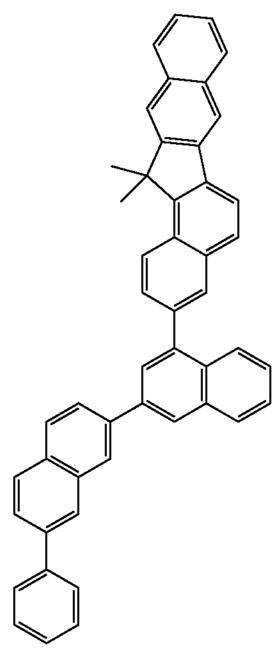

-continued
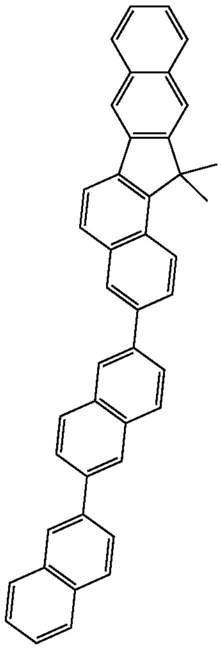
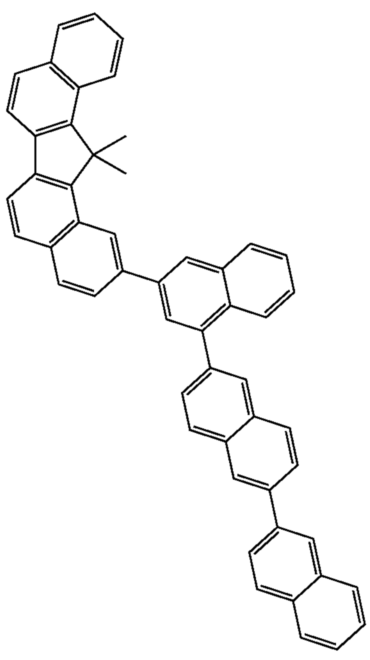
-continued
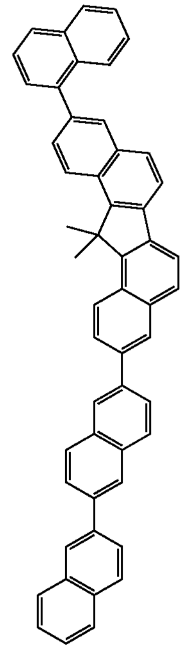
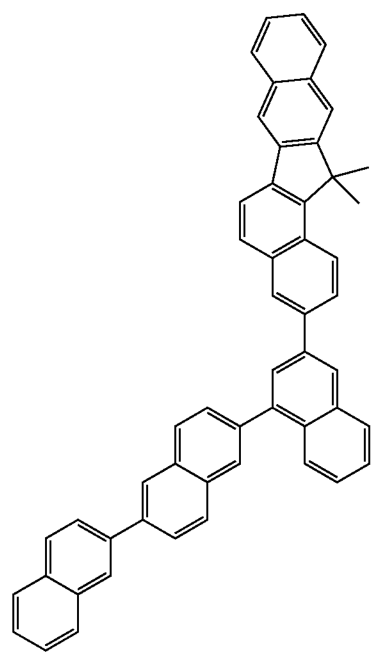

-continued
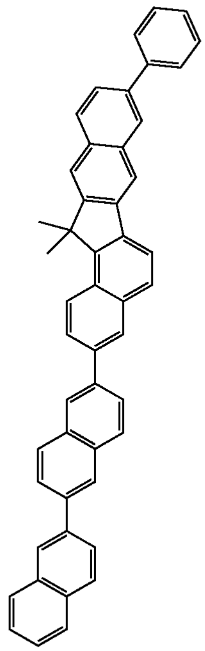
-continued
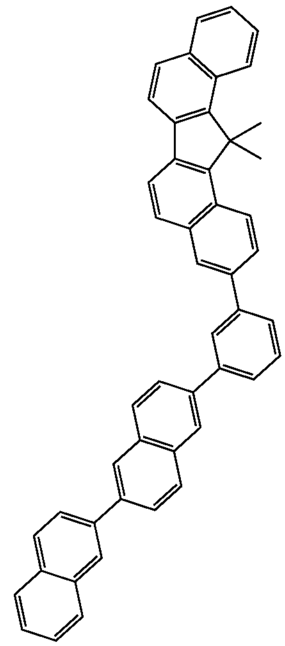
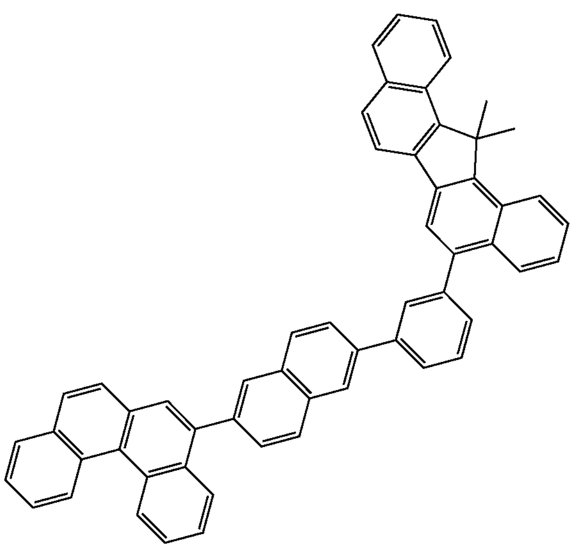
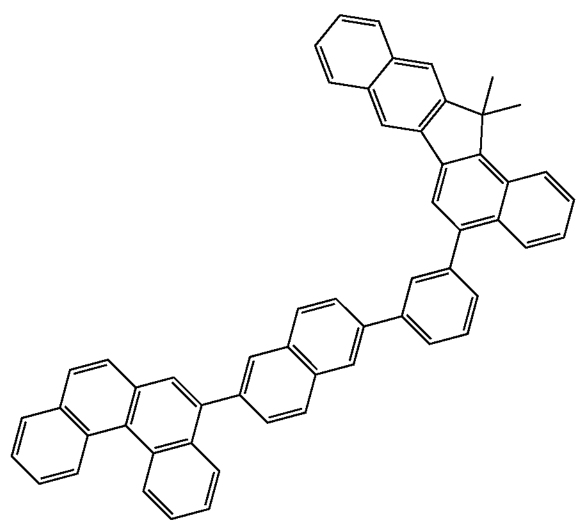

-continued
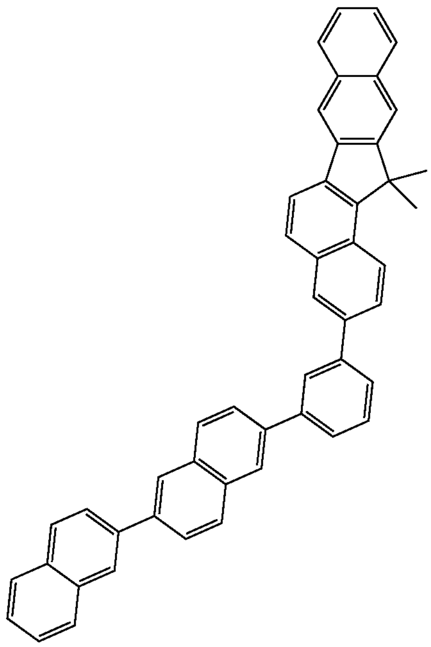
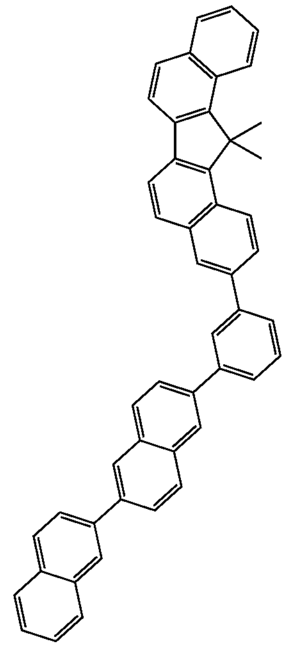
-continued
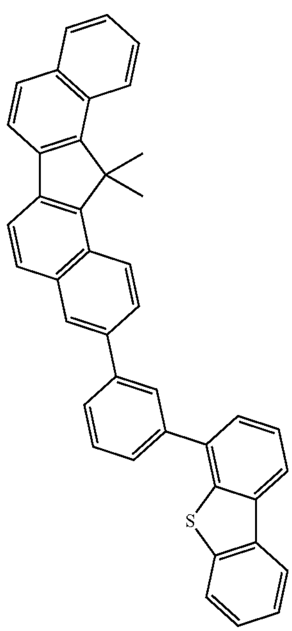
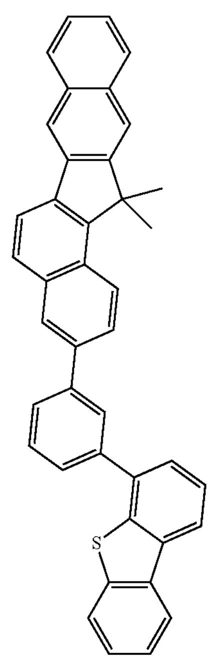

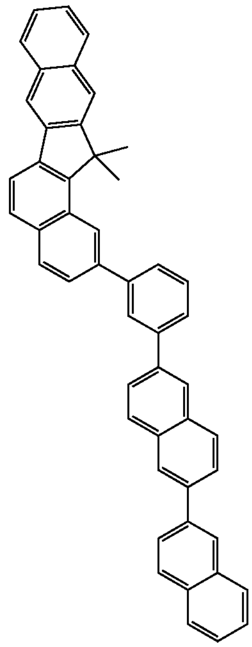
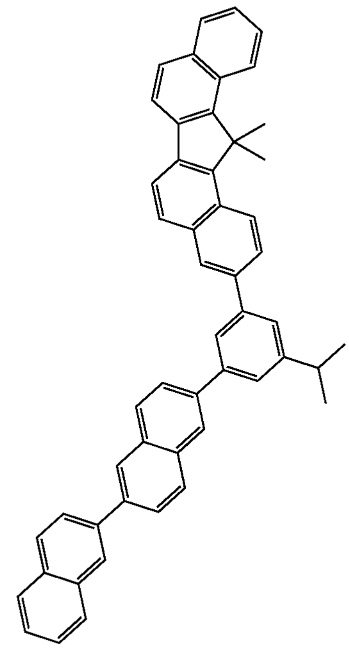
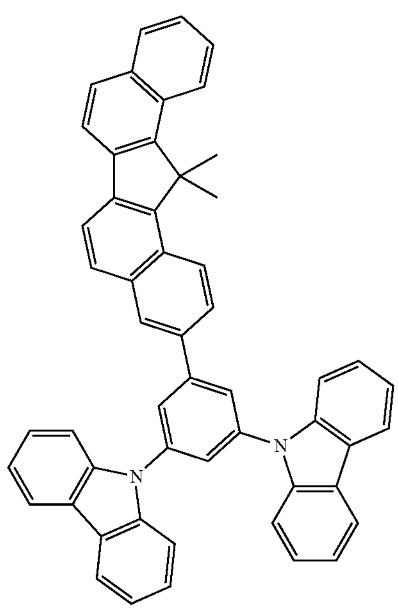
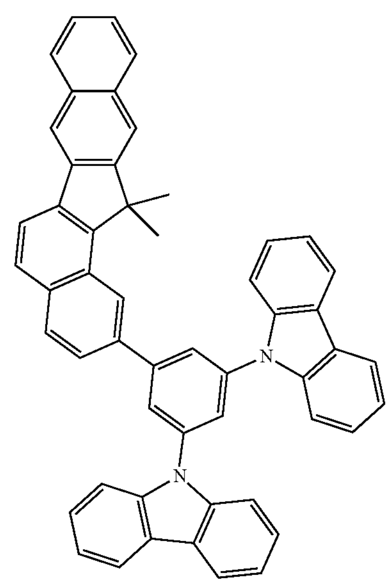
N
N

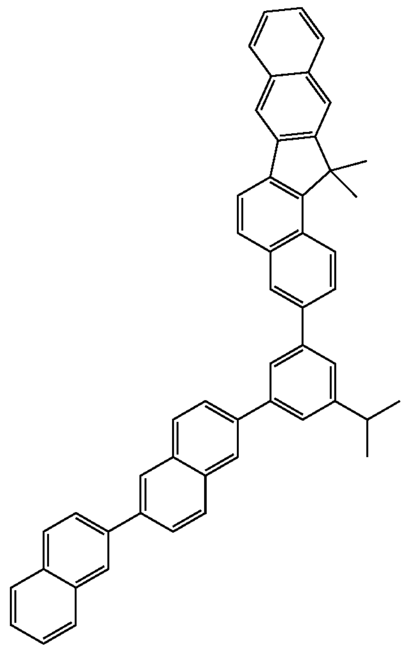
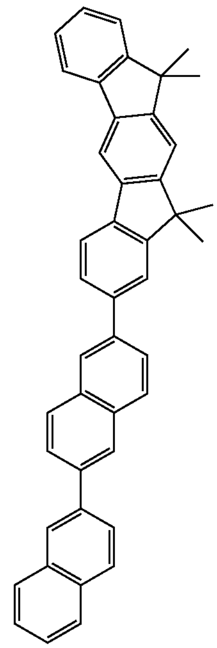
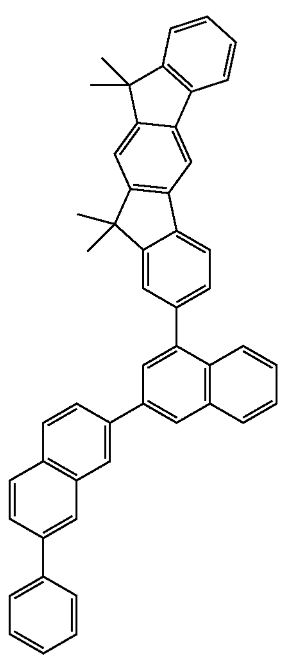
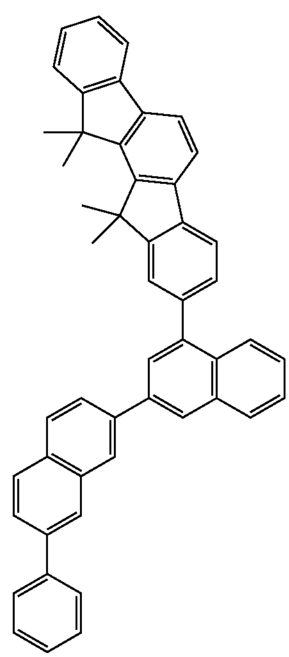

-continued
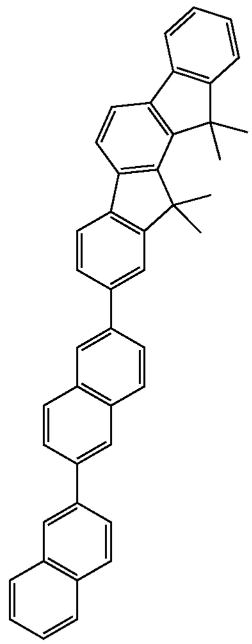
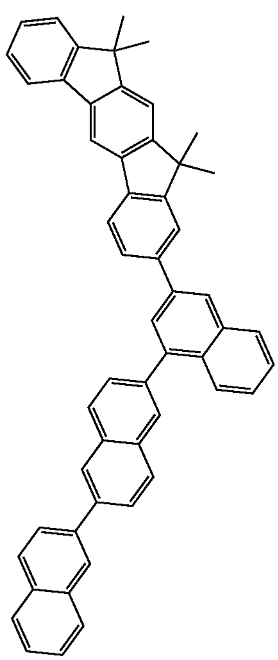
-continued
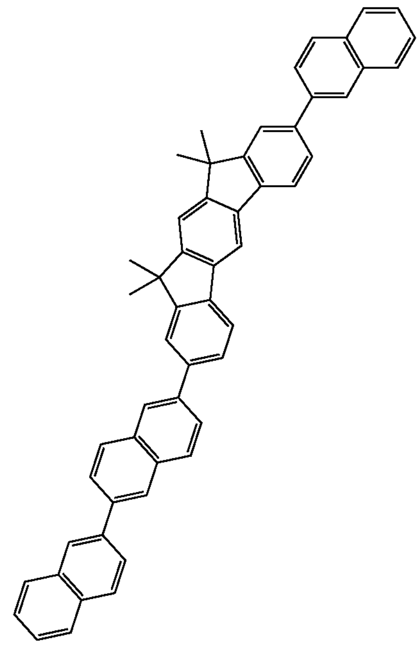
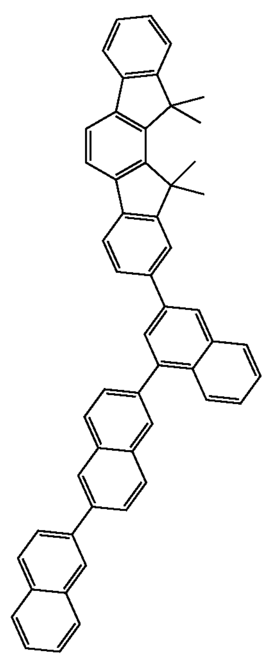

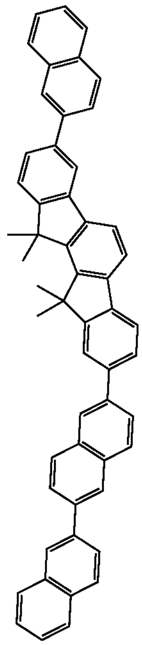
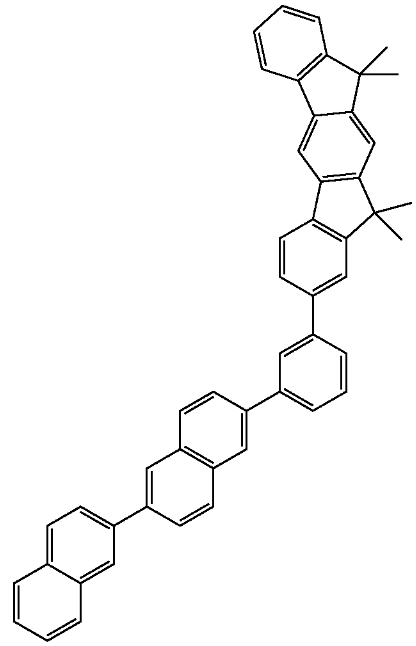
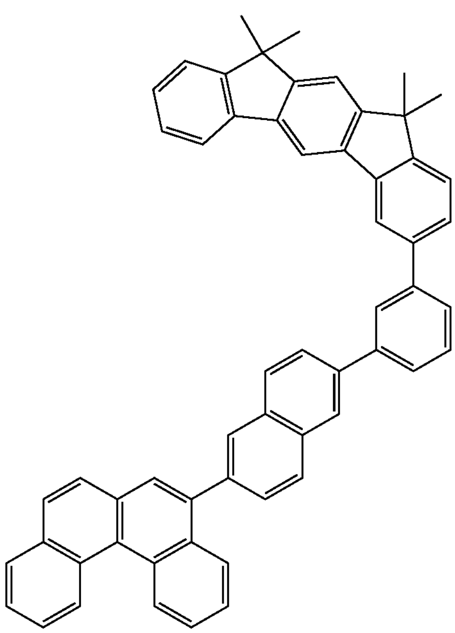
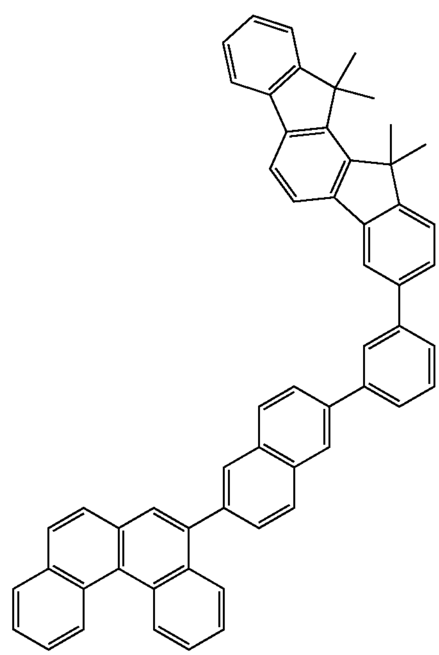

-continued
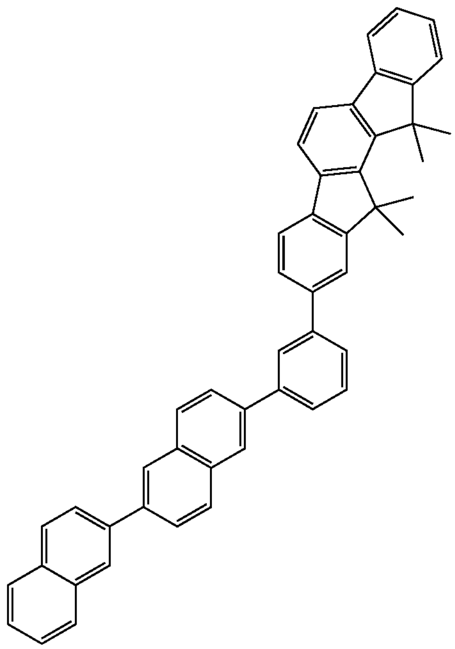
-continued
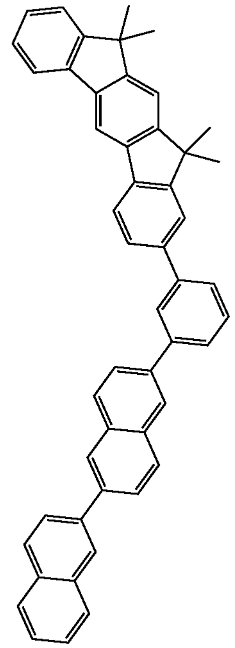
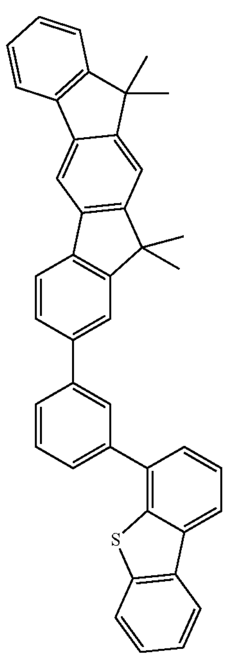
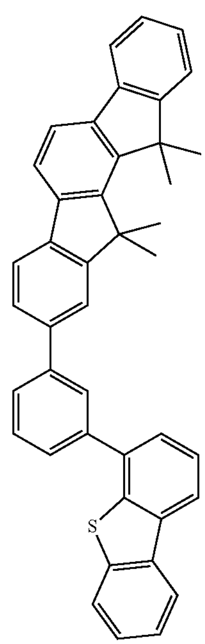

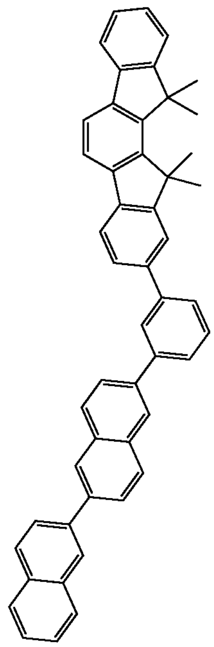
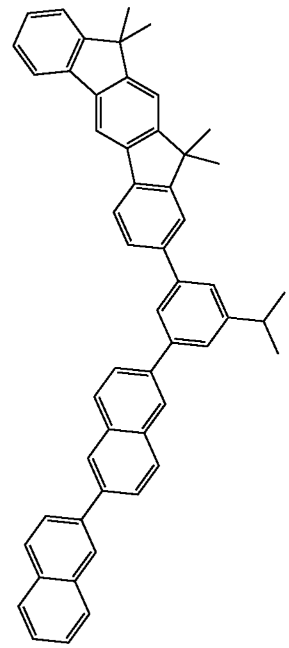
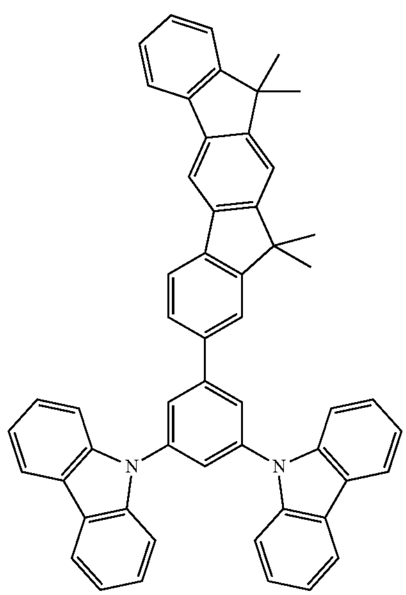
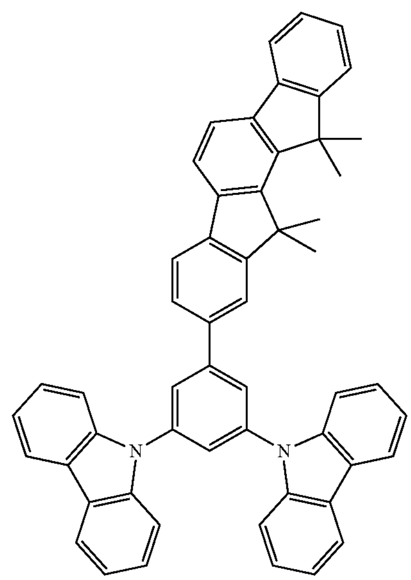

-continued
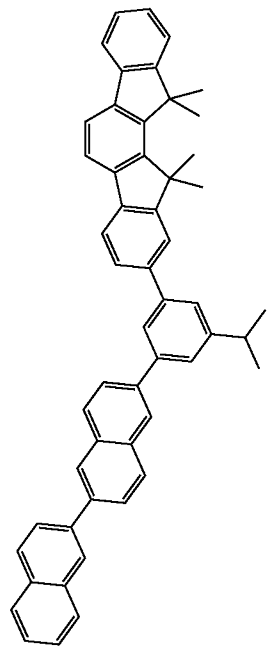
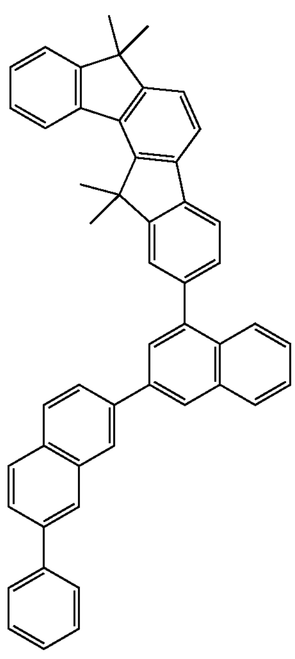
-continued
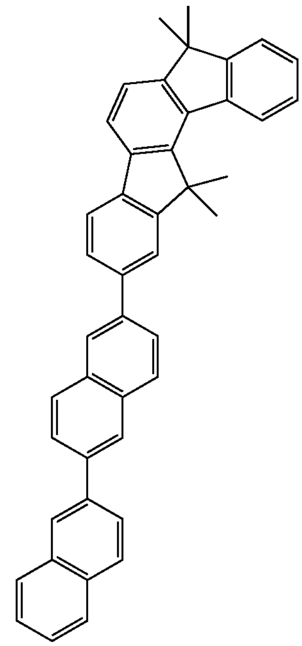
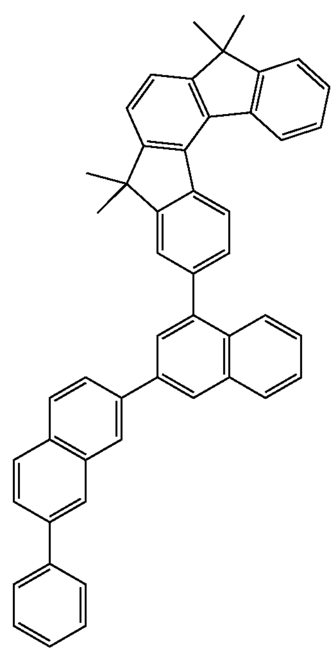

-continued
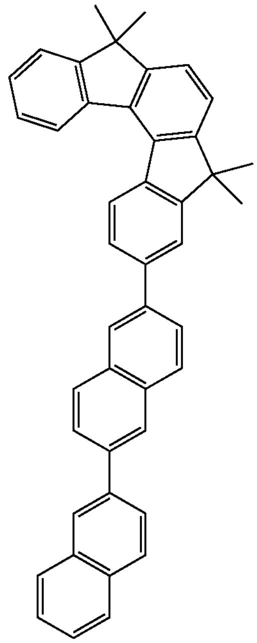
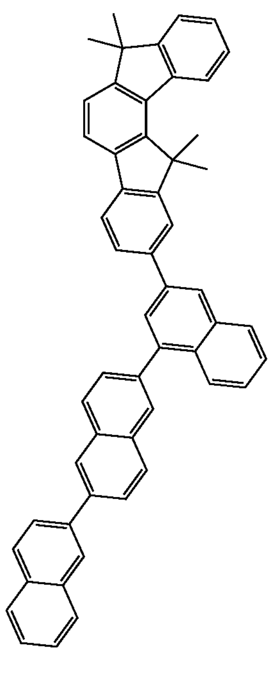
-continued
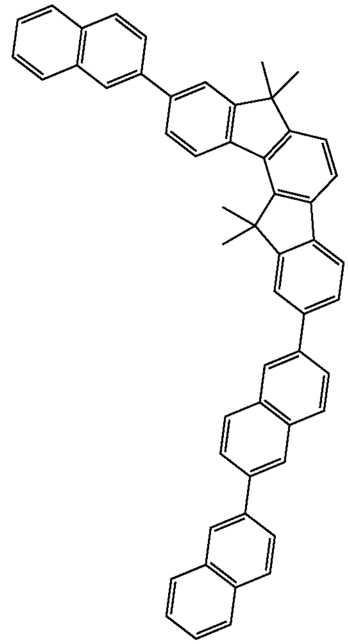
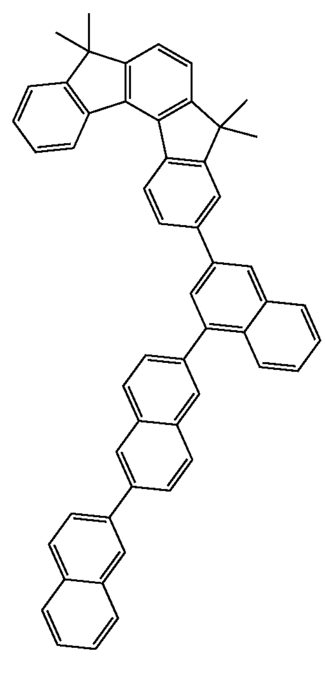

-continued
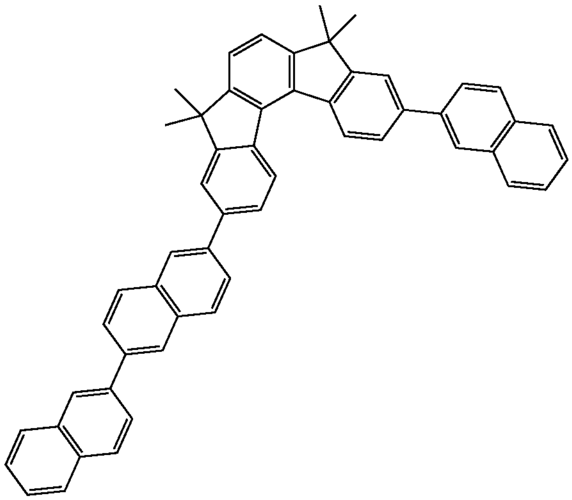
-continued
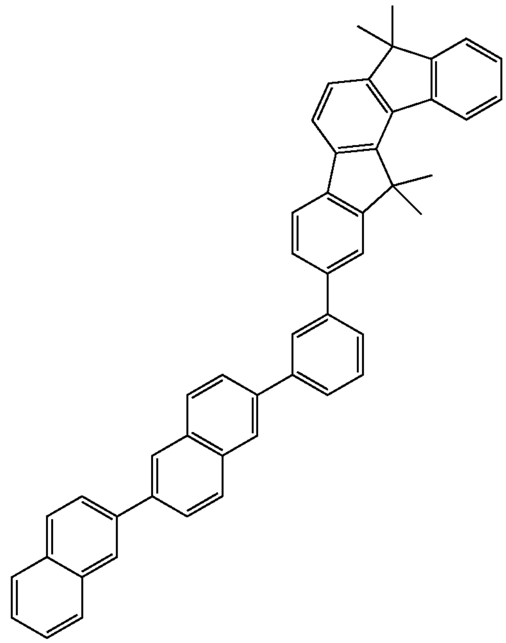
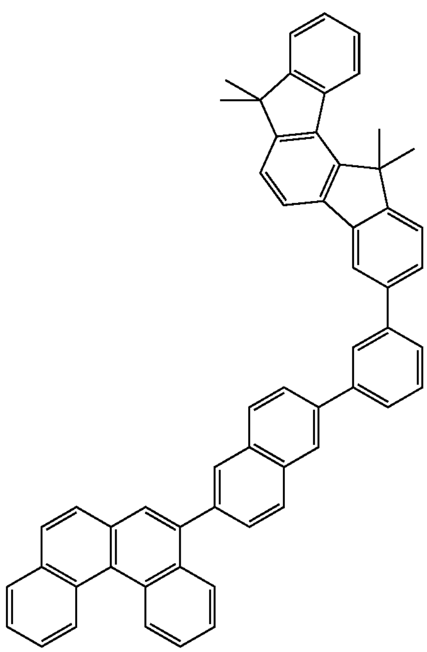
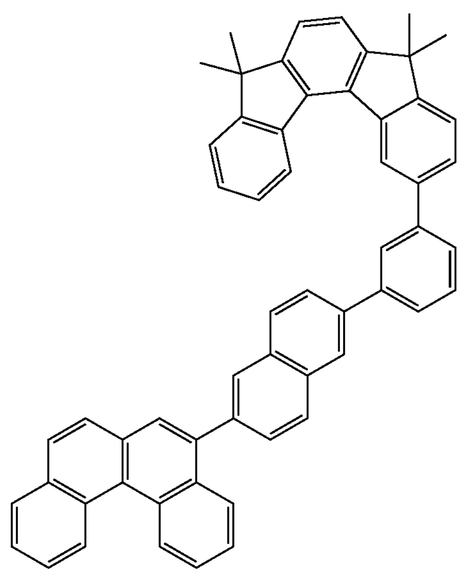

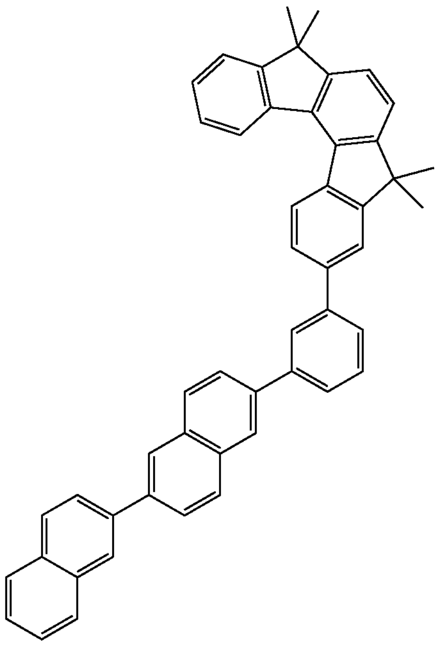
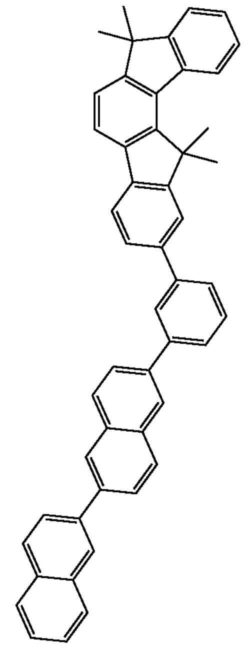
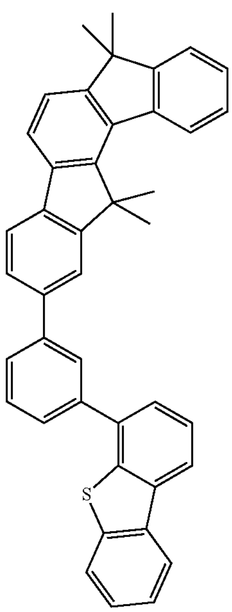
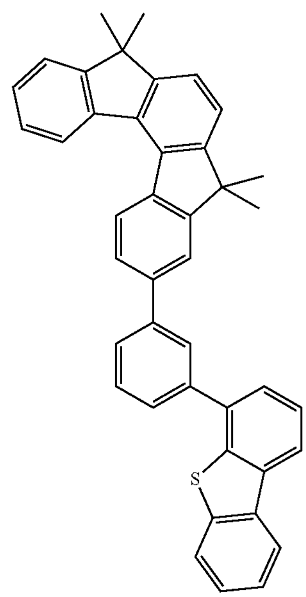

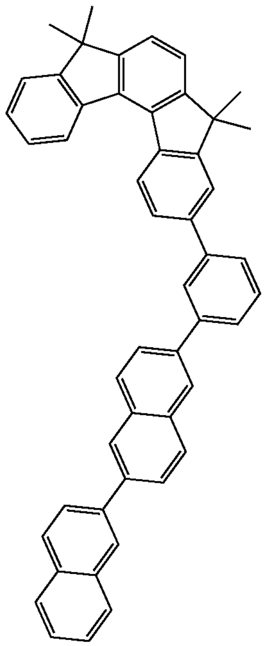
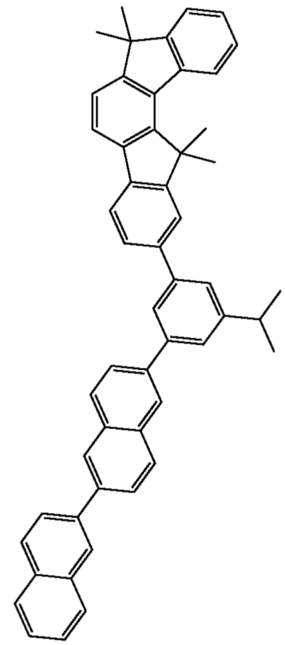
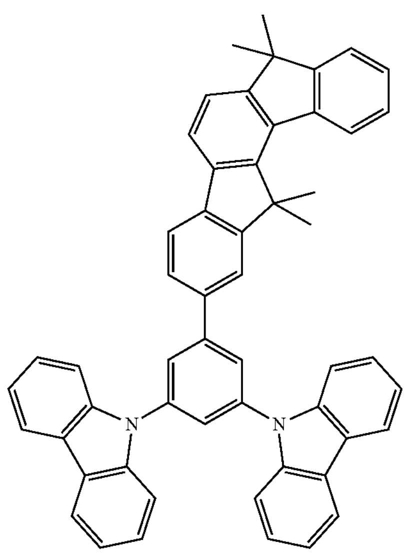
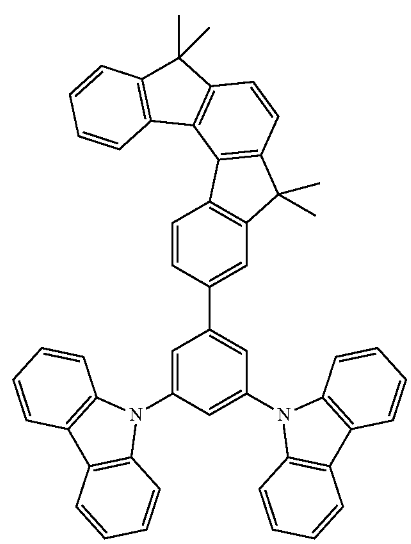
N
N

-continued
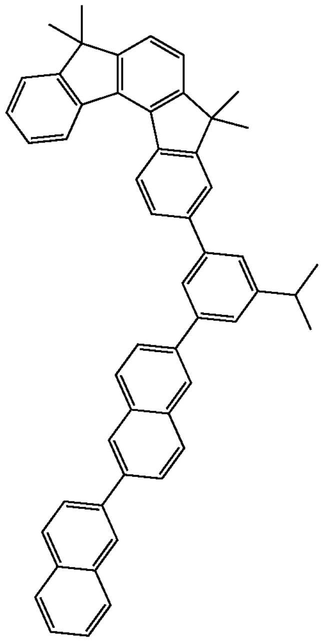
-continued
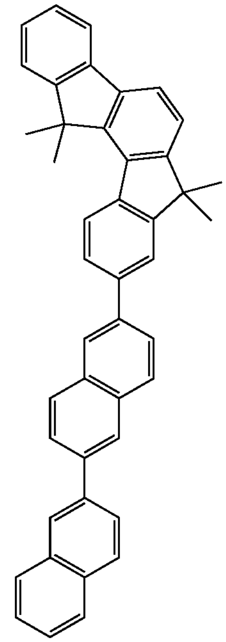
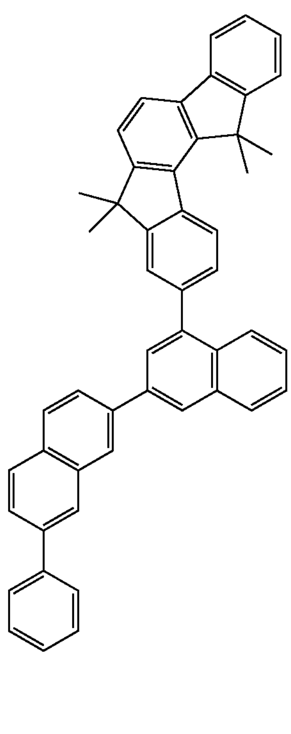
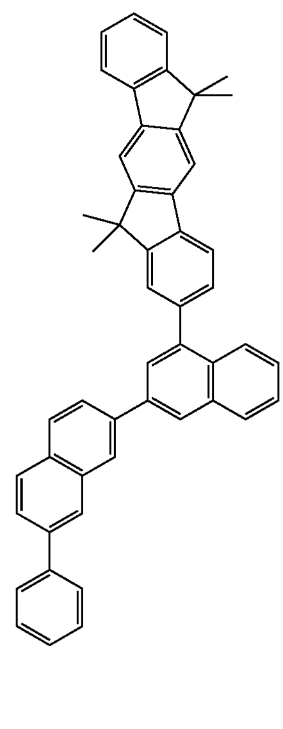

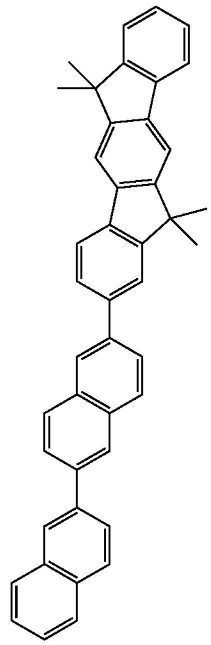
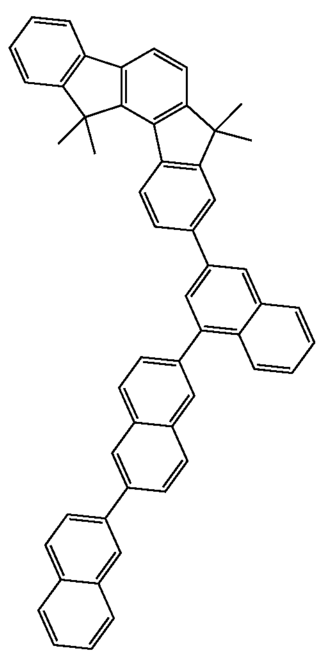
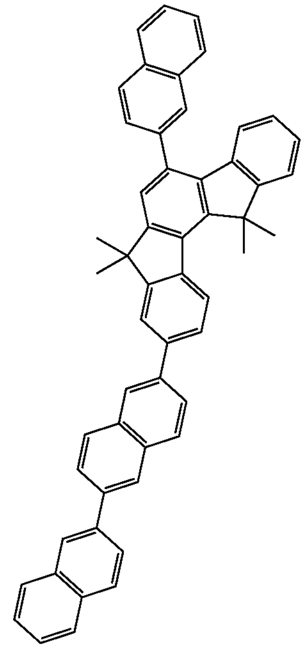
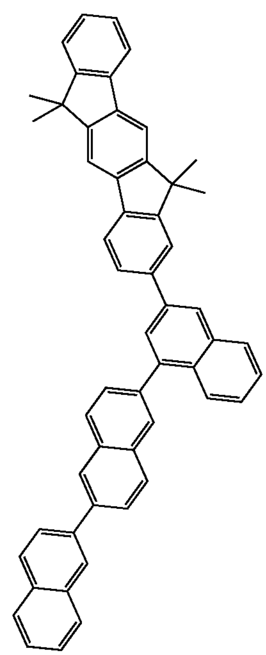

-continued
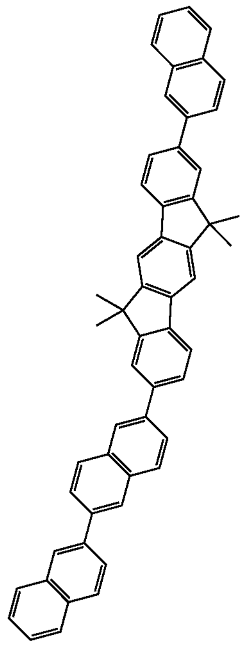
-continued
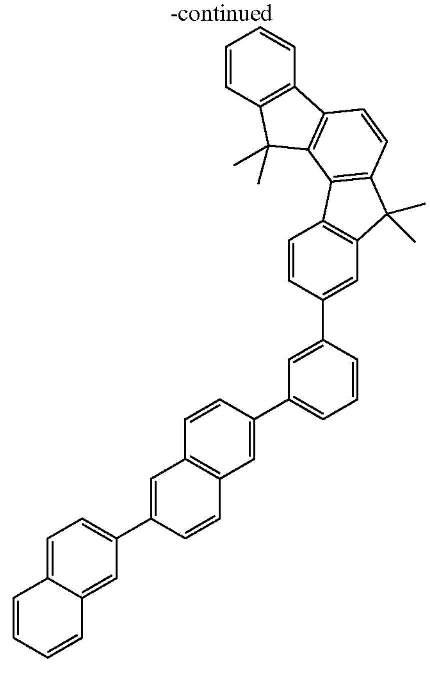
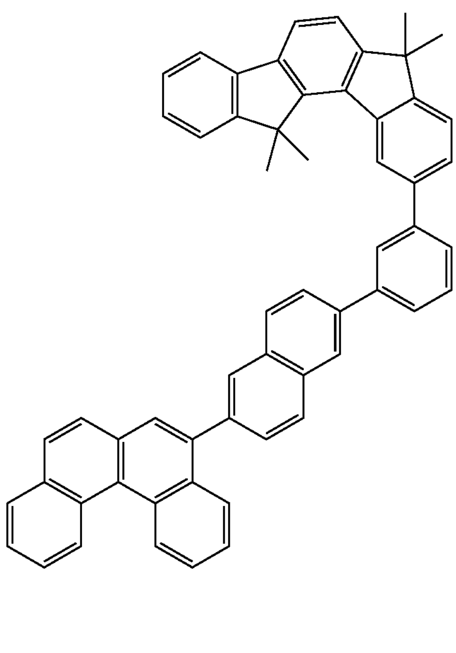
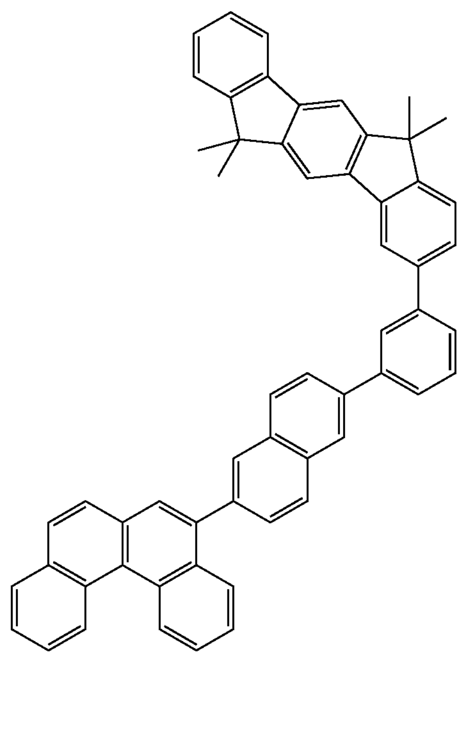

-continued
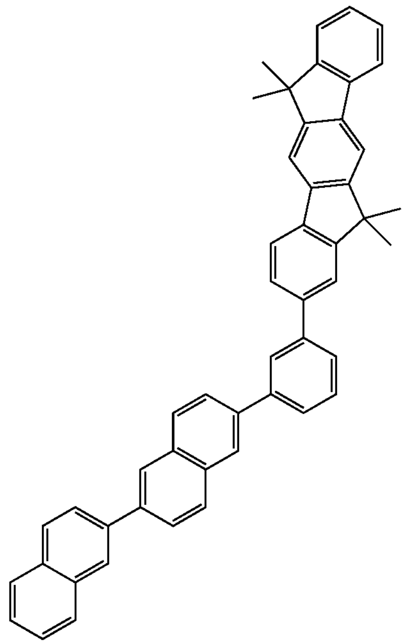
-continued
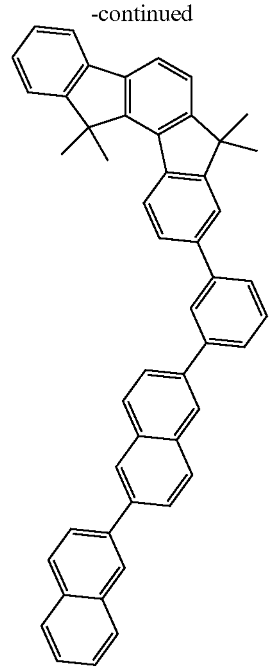
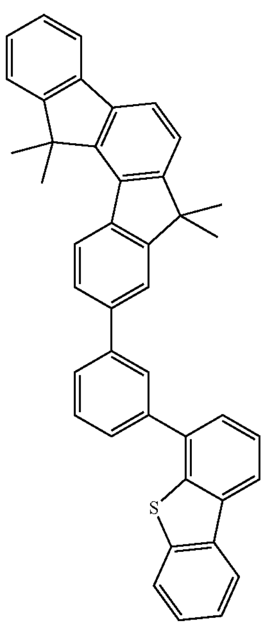
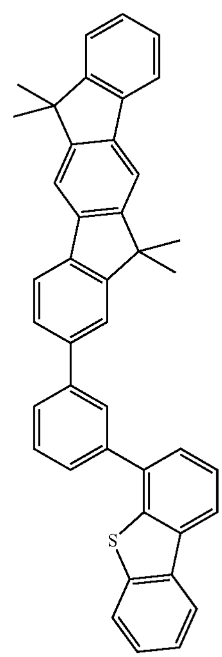

-continued
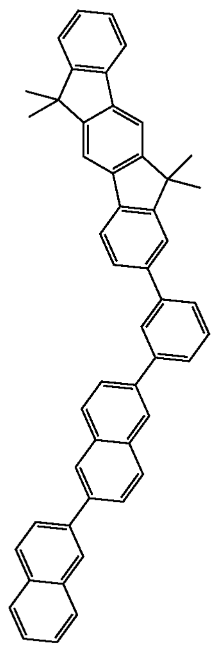
-continued
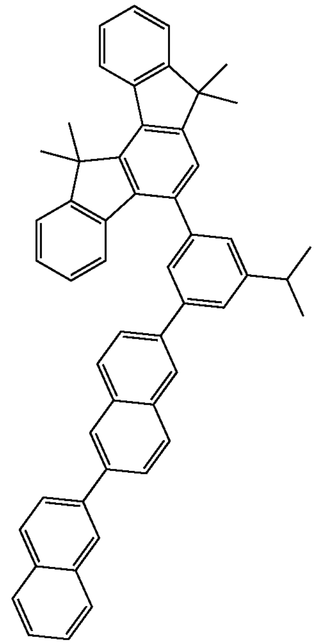
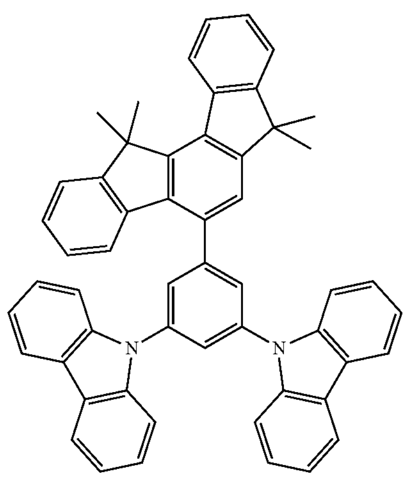
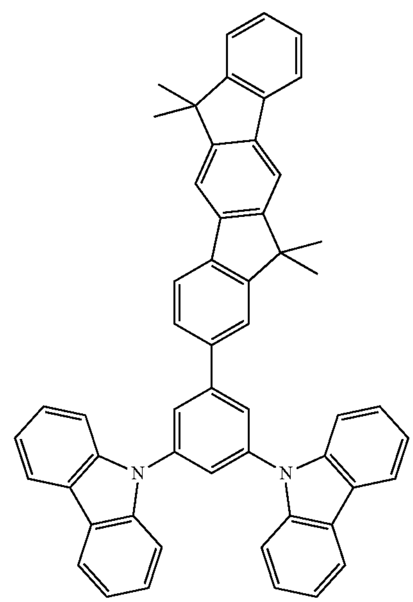

-continued
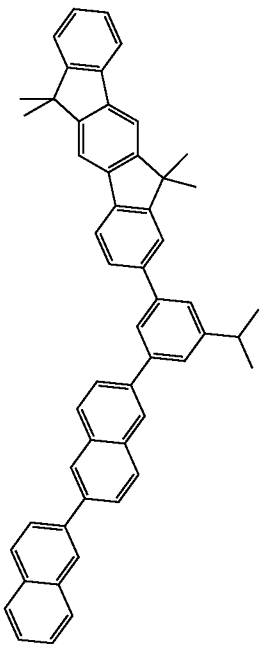
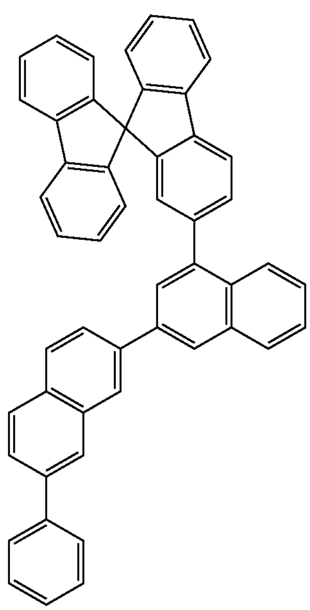
-continued
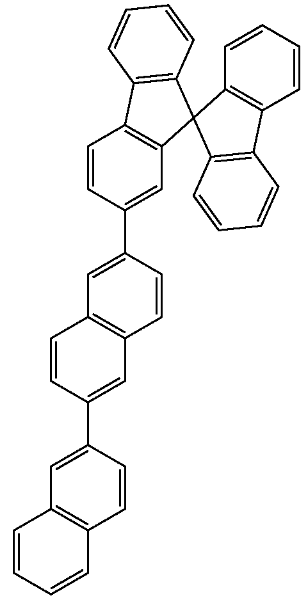
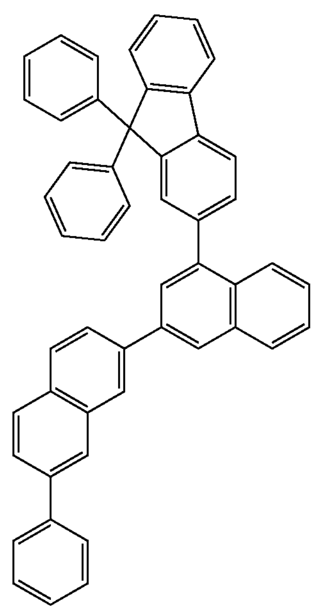

-continued
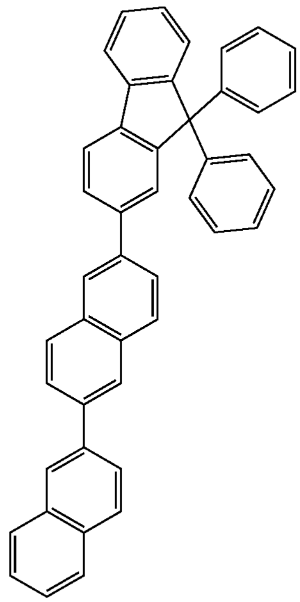
-continued
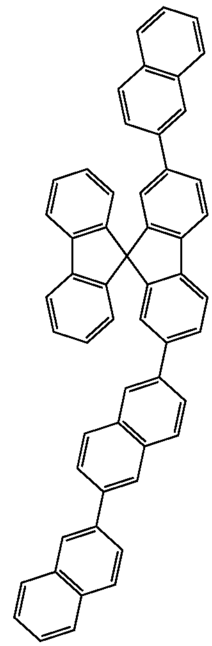
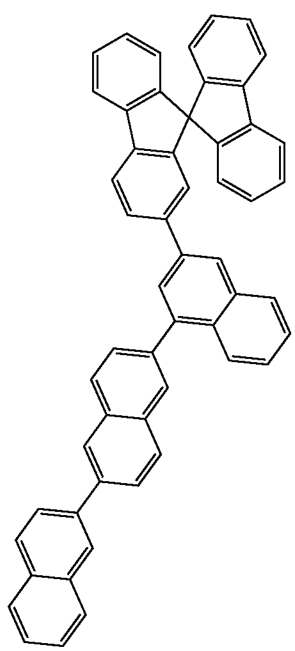
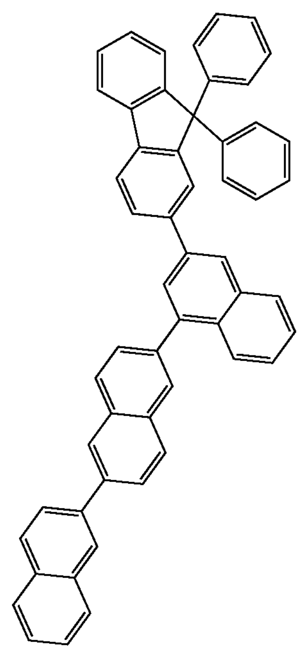

-continued
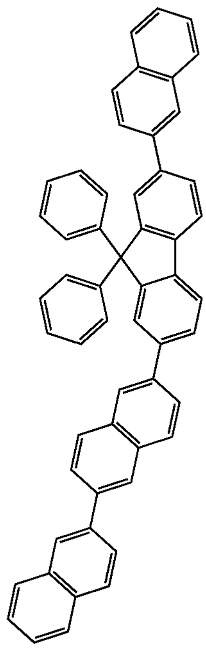
-continued
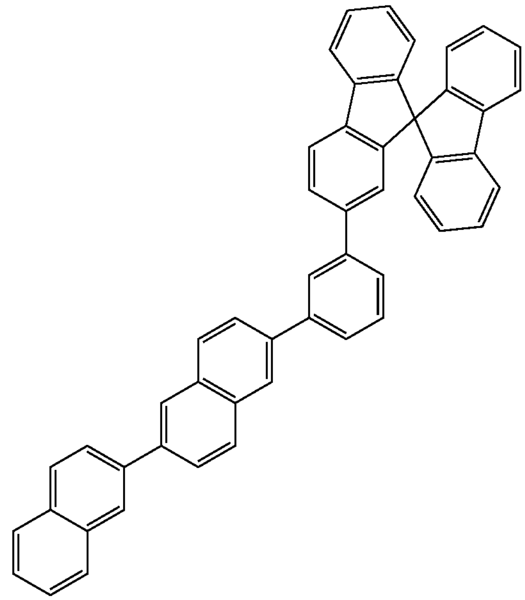
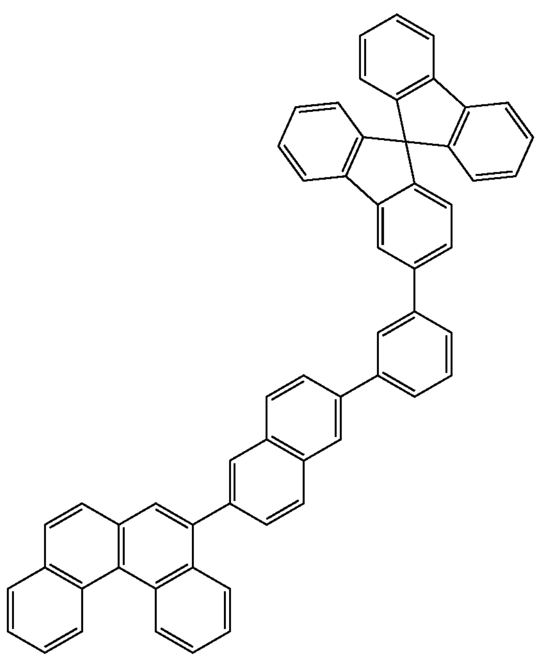
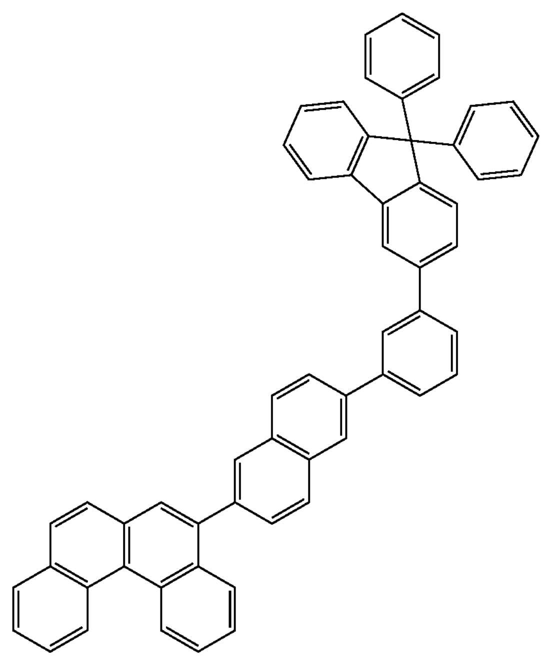

-continued
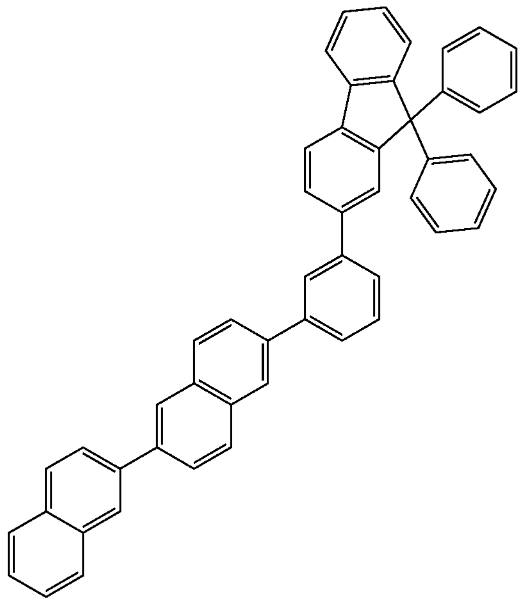
-continued
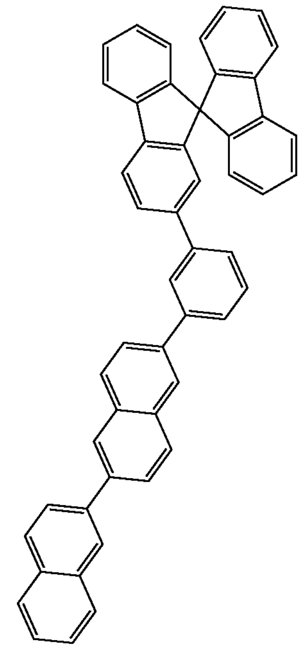
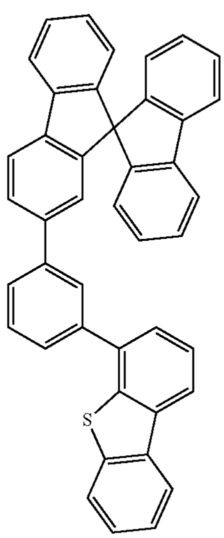
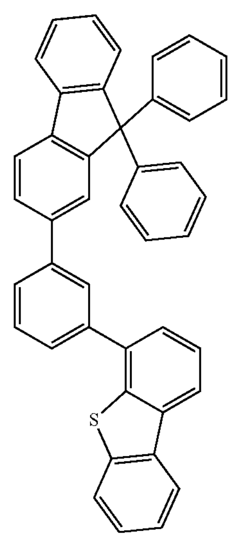

-continued
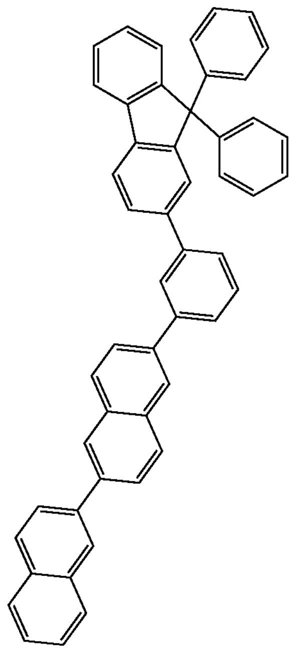
-continued
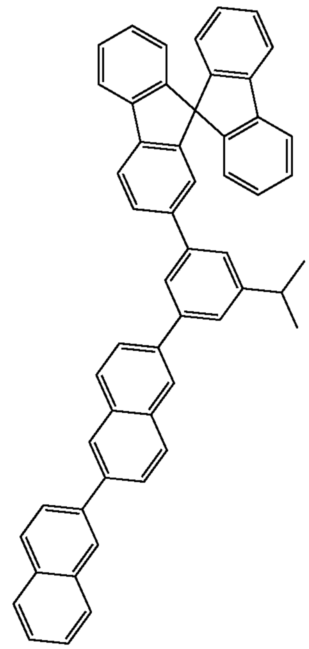
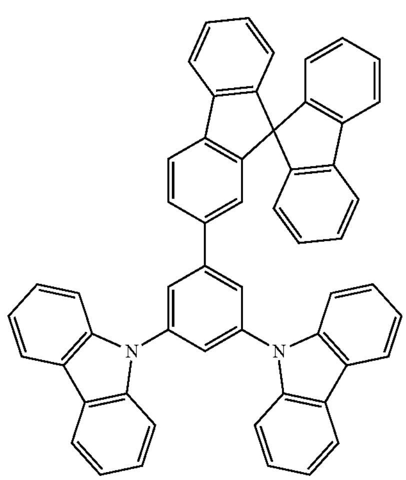
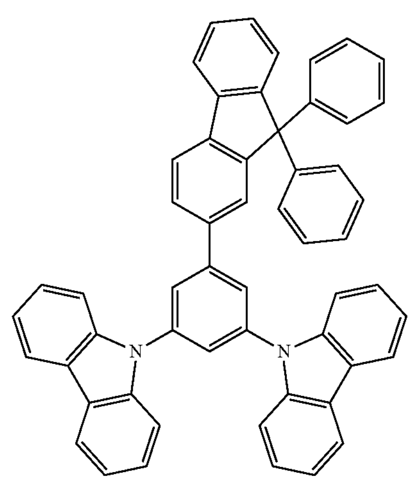

-continued
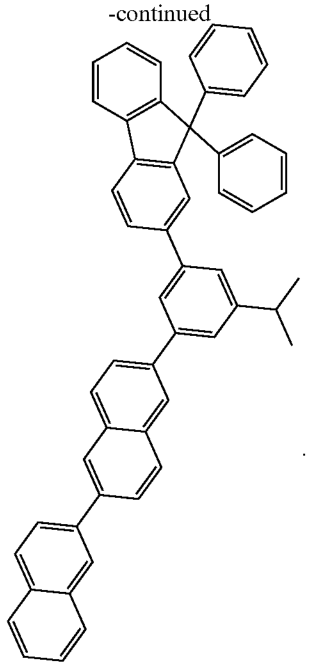
In another example embodiment, the first host may be selected from compounds below, but the first host is not limited thereto:
HT-18
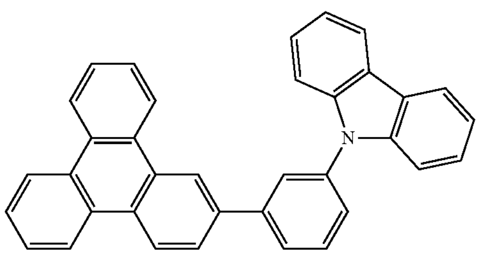
HT-34
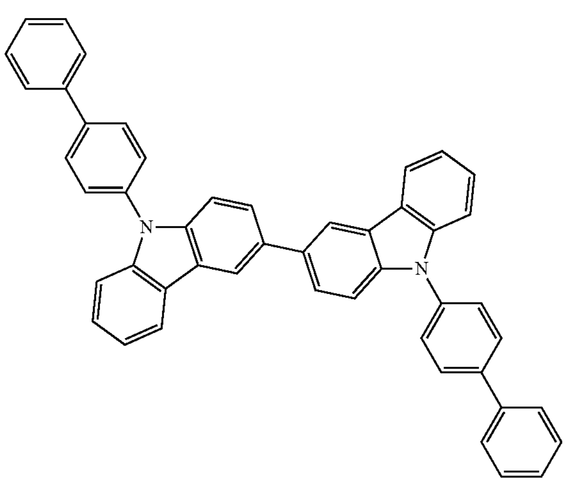
-continued
HT-45
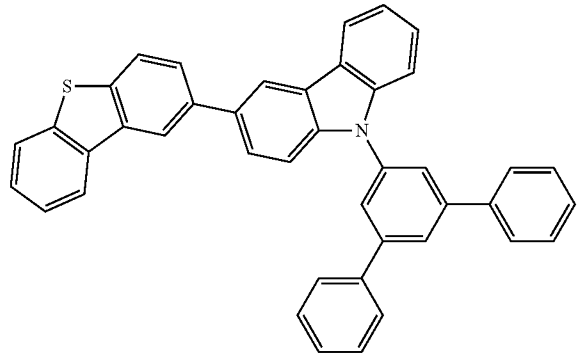
HT-50
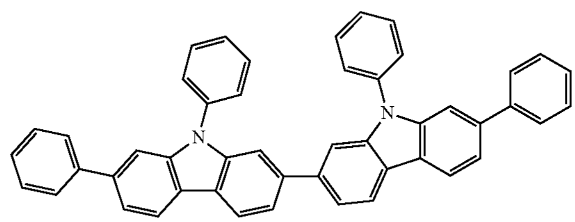
ET-8
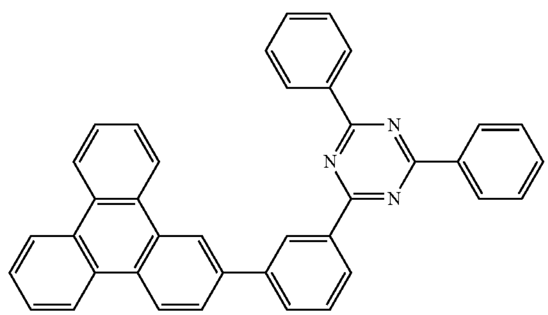
ET-61
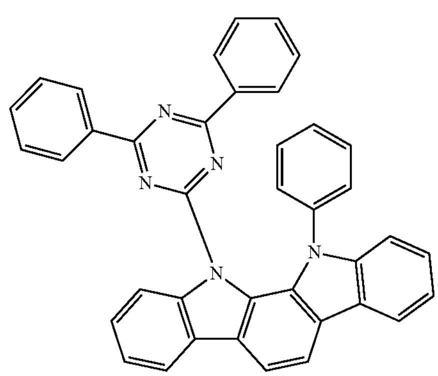

-continued
ET-73
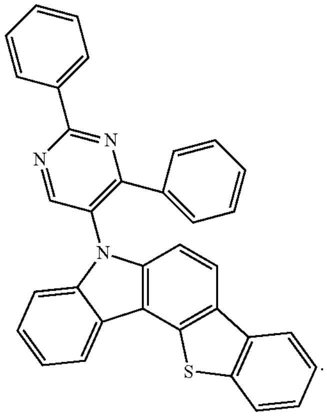
In another example embodiment, the first host may be selected from compounds below, but the first host is not limited thereto:
H-1
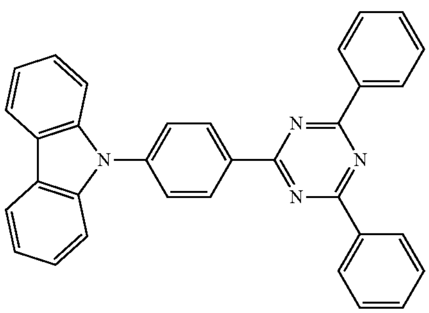
H-2
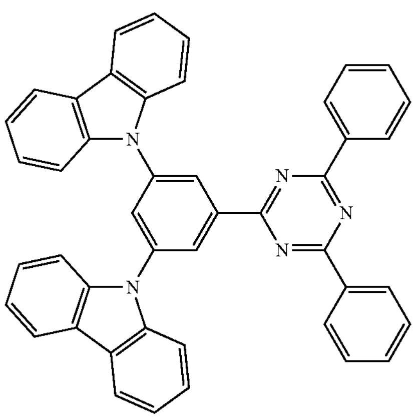
H-3
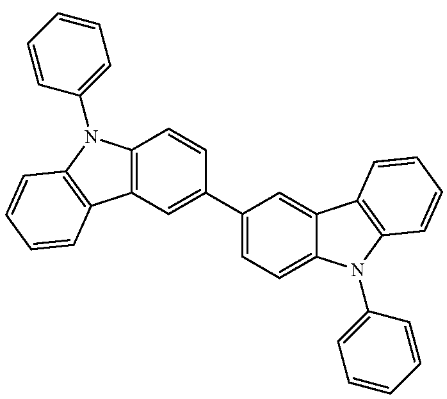
-continued
H-4
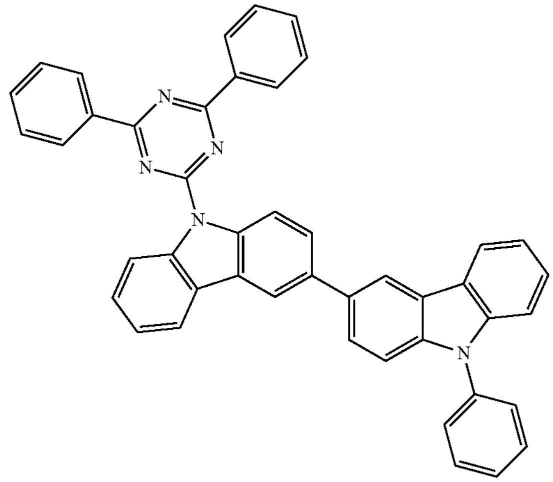
H-5
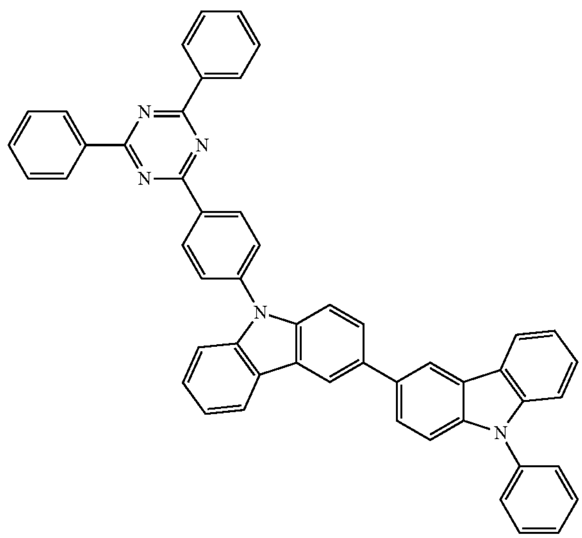
H-6
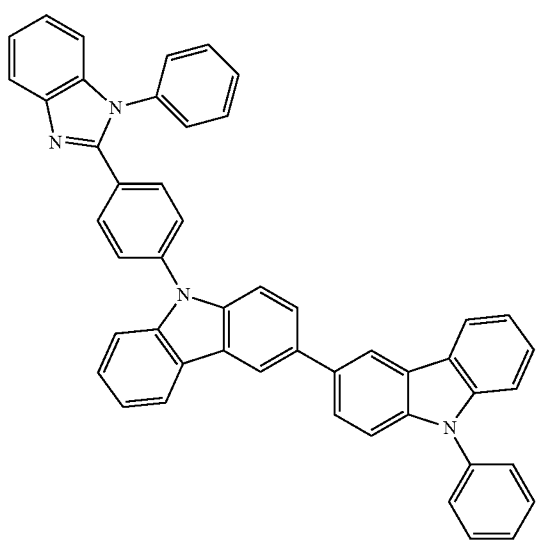

-continued
H-7
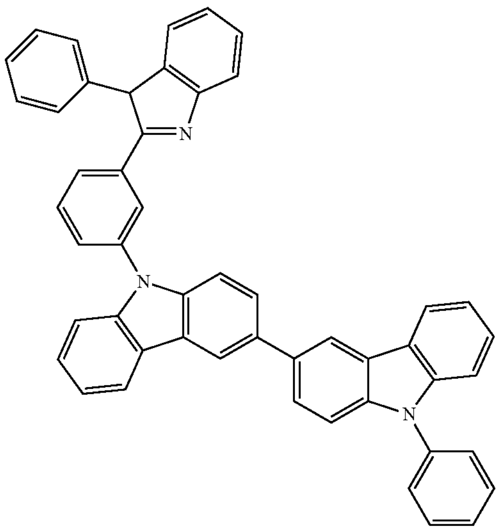
H-8
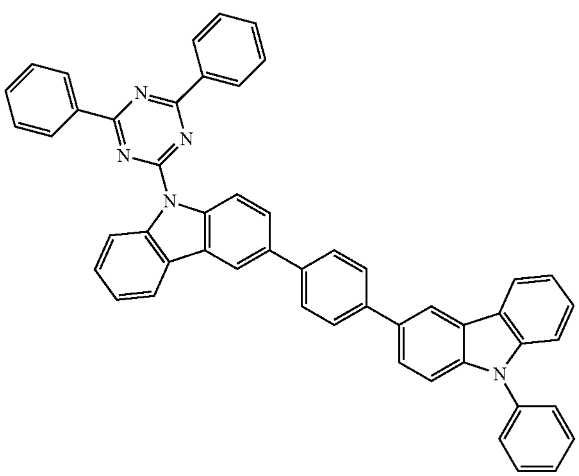
H-9
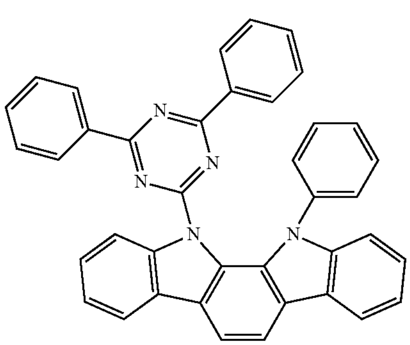
-continued
H-10
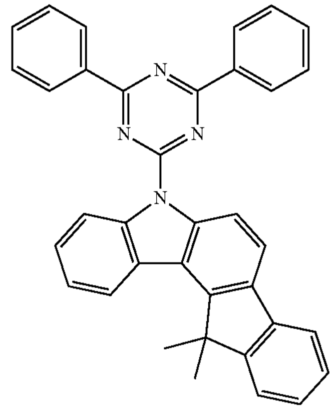
H-11
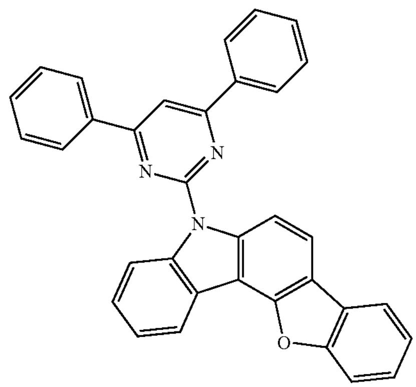
H12
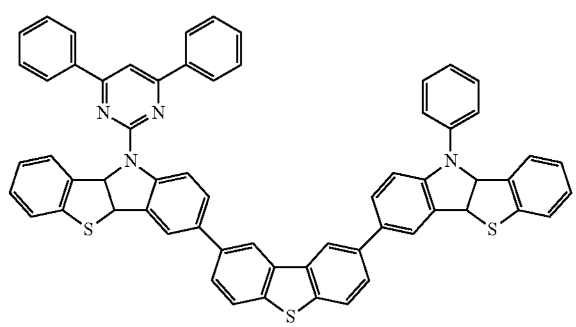
In another example embodiment, the first host may be selected from compounds below, but the first host is not limited thereto:

H-1
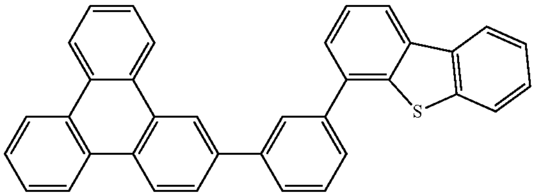
H-2
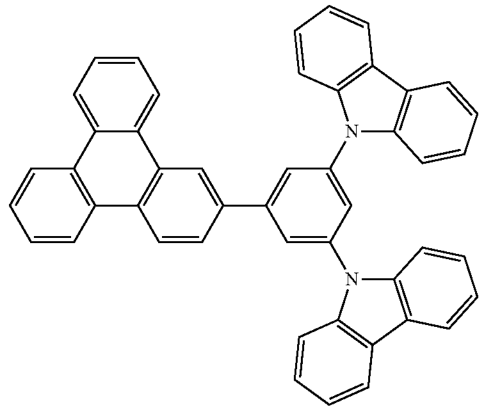
H-3
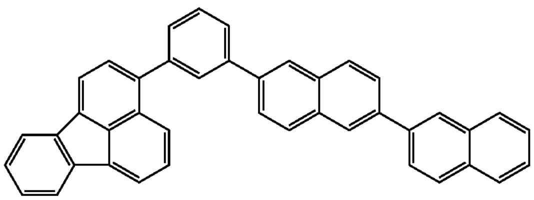
H-4
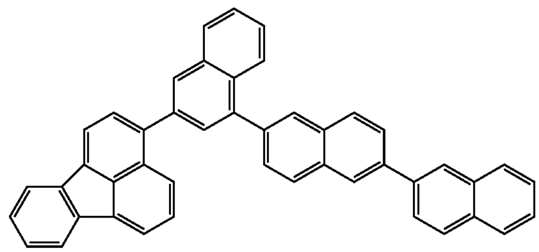
H-5
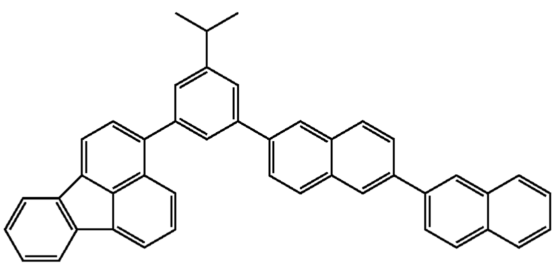
H-6
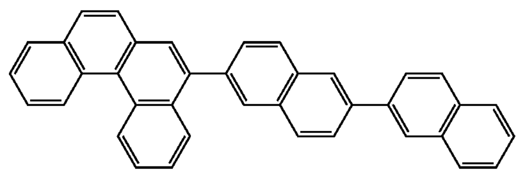
H-7
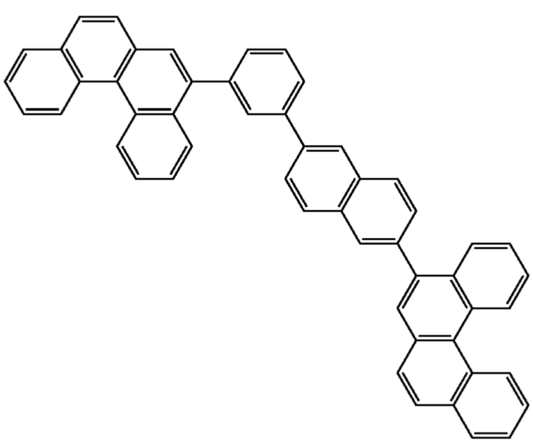
H-8
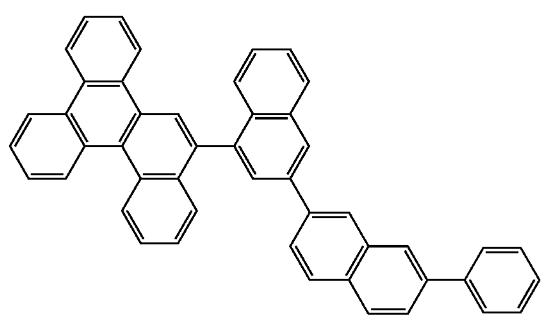

-continued

H-9

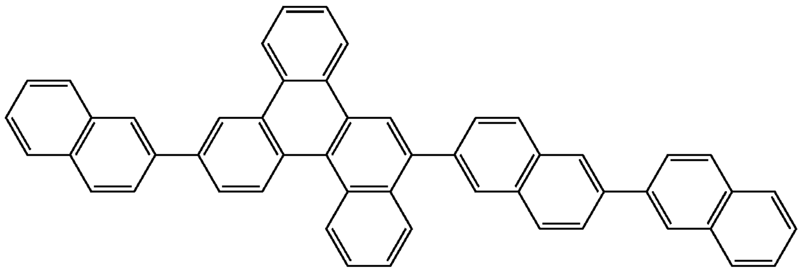

H-10

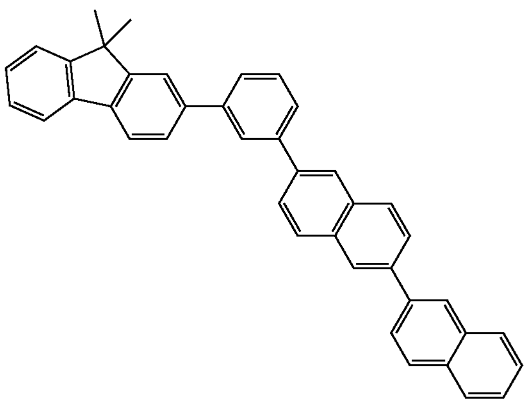

H-11

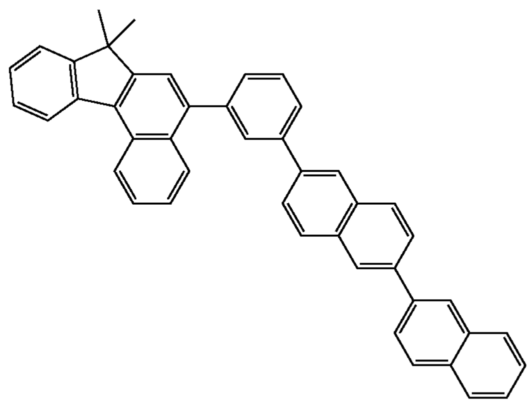

H-12

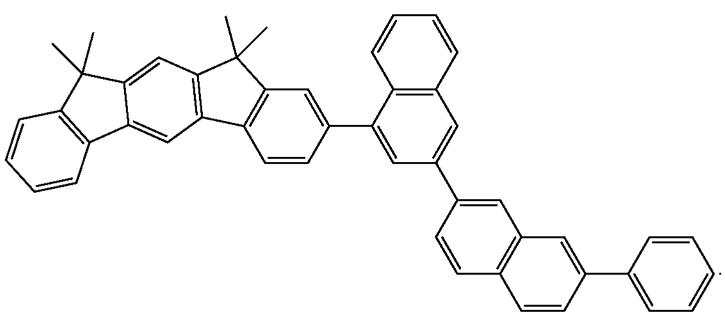

For example, the first host may have a triplet energy gap of 2.1 eV or more, but the first host is not limited thereto. When the first host has a triplet energy gap of 2.1 eV or more, the first host may have an excited state of triplet excitons of the EML in an efficient manner.

The EML may further include a second host, and the second host may be different from the first host, but the second host is not limited thereto.

For example, the second host may be selected from compounds below, but the second host is not limited thereto:

-continued

AH-1

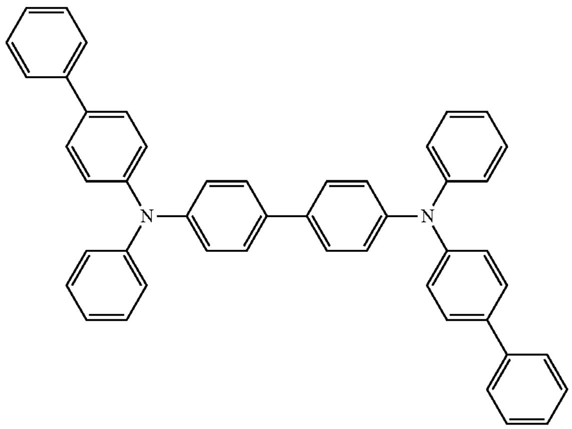

AH-2

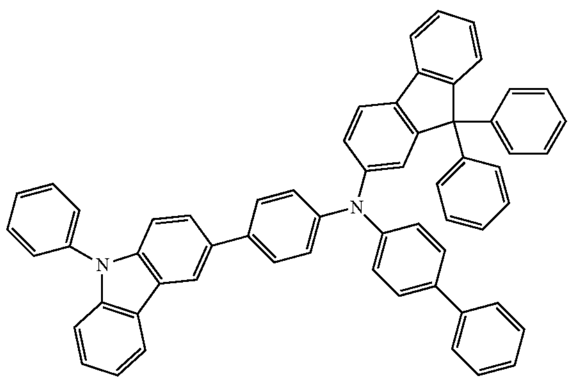

AH-3

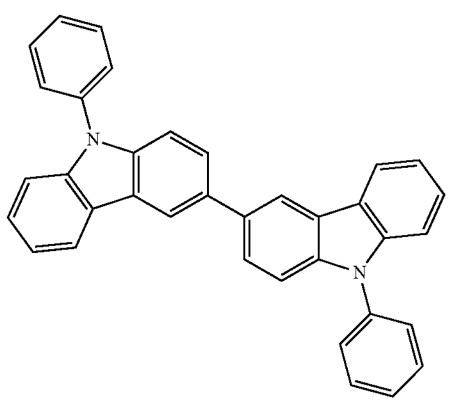

AH-4

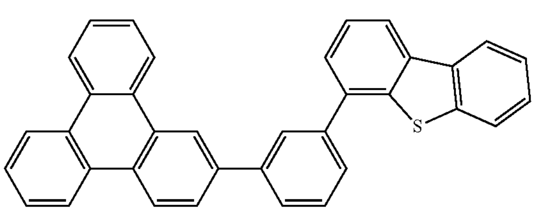

AH-5

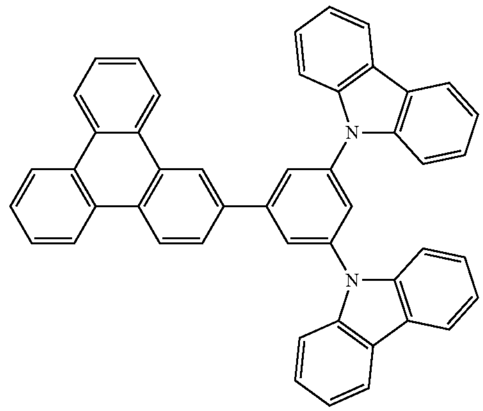

AH-6

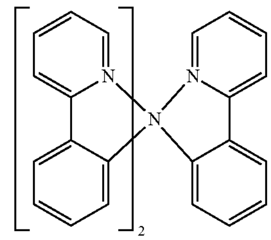

(?) indicates text missing or illegible when filed

Hereinafter, an example embodiment in which an EML of an organic light-emitting includes the first host and the second host will be described (Embodiment 2).

In this embodiment, the EML may include the first host and the second host, wherein the first host and the second host may each be independently represented by one of Formulae 1 and 2. The first host and the second host may be different from each other.

In another example embodiment, the first host may be represented by Formula 1, and the second host may be represented by Formula 2, but the first host and the second host are not limited thereto.

In another example embodiment, the first host may be represented by Formula 1, and the second host may be also represented by Formula 1, but the first host and the second host are not limited thereto.

In another example embodiment, the first host may be represented Formula 2, and the second host may be also represented by Formula 2, but the first host and the second host are not limited thereto.

For example, $Ar_{11}$ in Formula 1 may be a group represented by one of Formulae 8A-1 to 8A-4, and $Ar_{21}$ in Formula 2 may be a group represented by one of Formulae 9A-1 to 9A-4, but $Ar_{11}$ and $Ar_{21}$ are not limited thereto:

8A-1

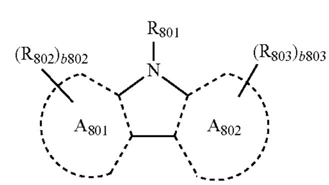

-continued

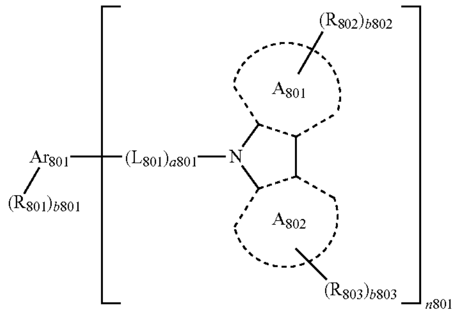

8A-2

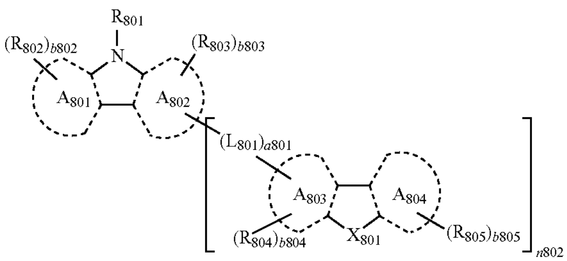

8A-3

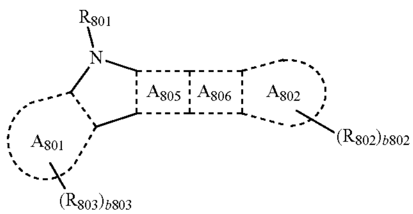

8A-4

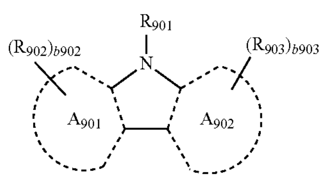

9A-1

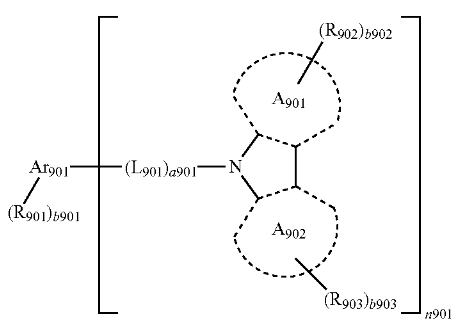

9A-2

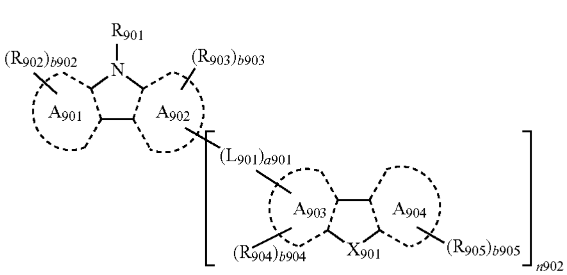

9A-3

-continued

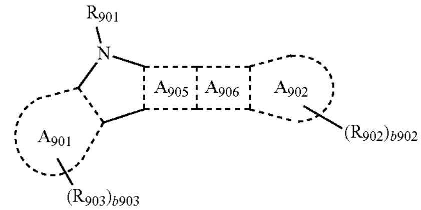

9A-4

In Formulae 8A-1 to 8A-4 and 9A-1 to 9A-4, descriptions of $L_{801}$, a801, $A_{801}$ to $A_{806}$, $R_{801}$ to $R_{805}$, b801 to b805, n801, and n802 may each be independently as referred to in the descriptions provided above, and descriptions of $L_{901}$, a901, $A_{901}$ to $A_{906}$, $R_{901}$ to $R_{905}$, b901 to b905, n901 and n902 may each be independently as referred to in the descriptions provided above.

For example, $Ar_{11}$ in Formula 1 may be a group represented by one of Formulae 8B-1 to 8B-19 and 8C-1 to 8C-19, and $Ar_{21}$ in Formula 2 may be a group represented by one of Formulae 9B-1 to 9B-19 and 9C-1 to 9C-19, but $Ar_{11}$ and $Ar_{21}$ are not limited thereto:

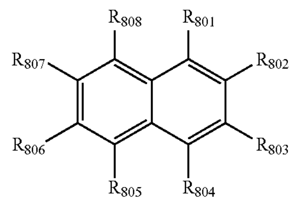

8B-1

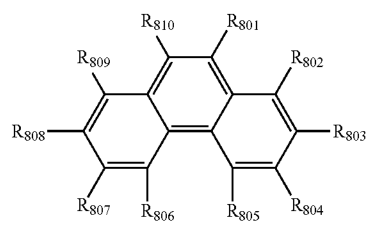

8B-2

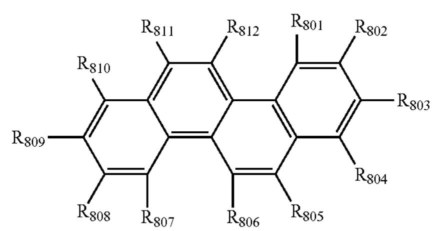

8B-3

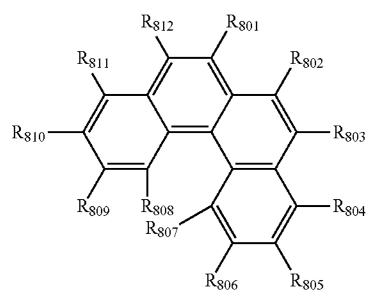

8B-4

-continued
8B-5
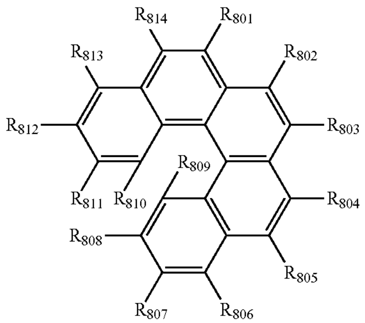
8B-6
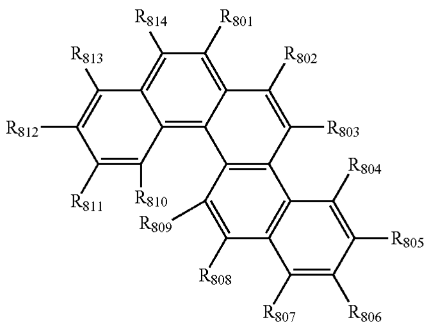
8B-7
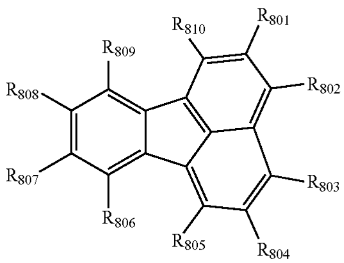
8B-8
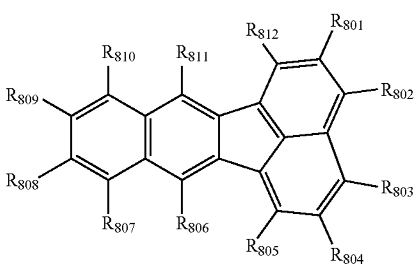
8B-9
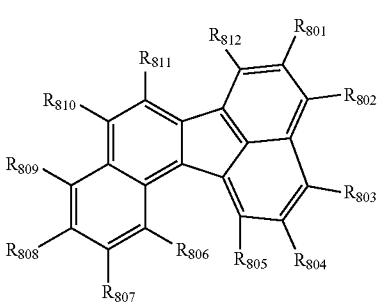
-continued
8B-10
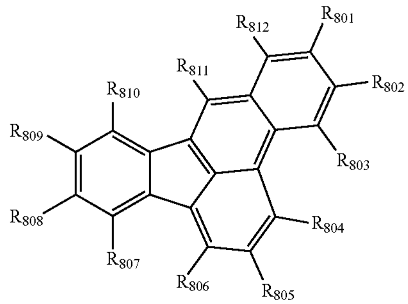
8B-11
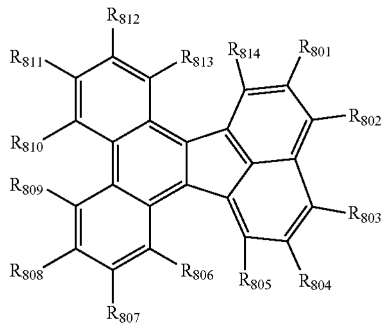
8B-12
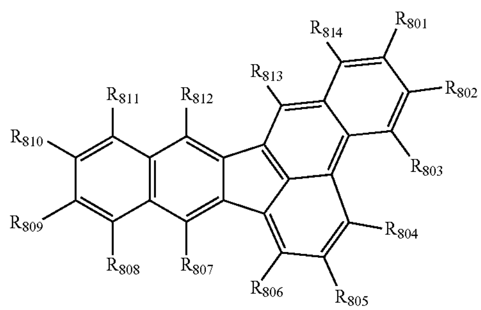
8B-13
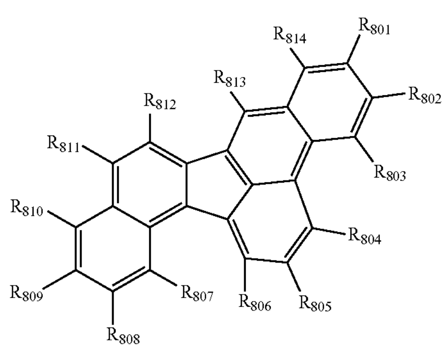

-continued
8B-14
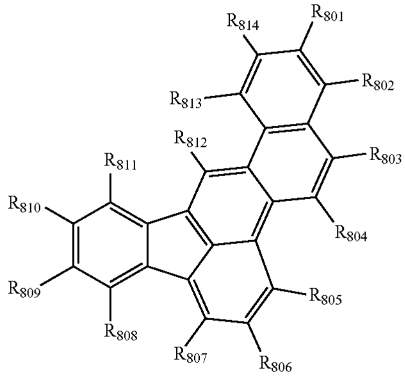
8B-15
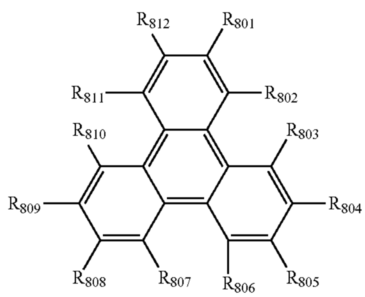
8B-16
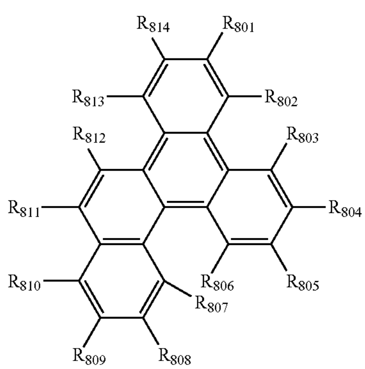
8B-17
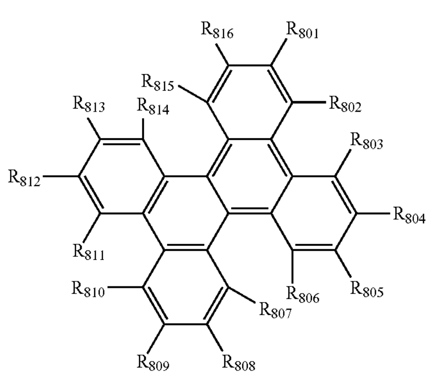
-continued
8B-18
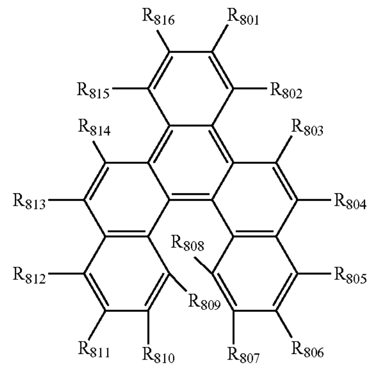
8B-19
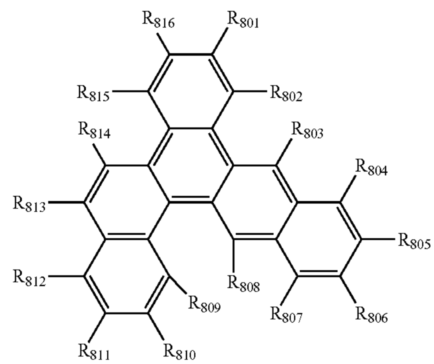
8C-1
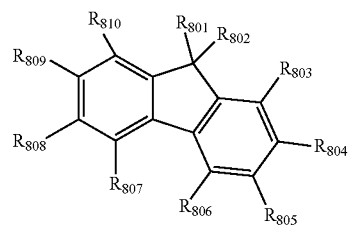
8C-2
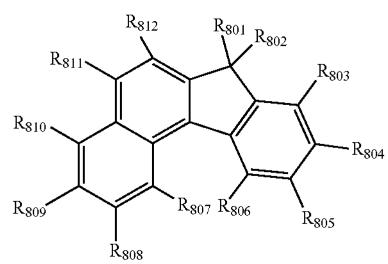
8C-3
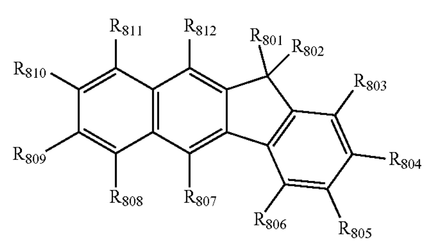

8C-4
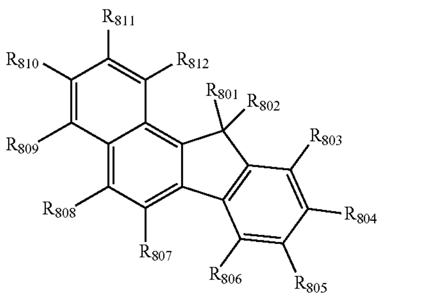
8C-5
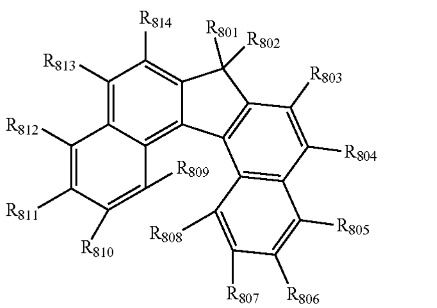
8C-6
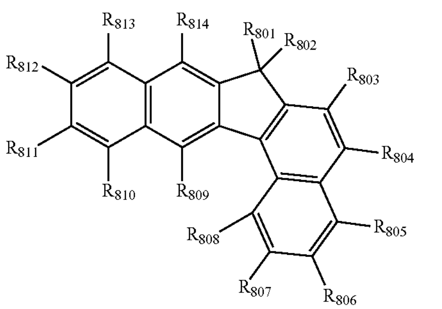
8C-7
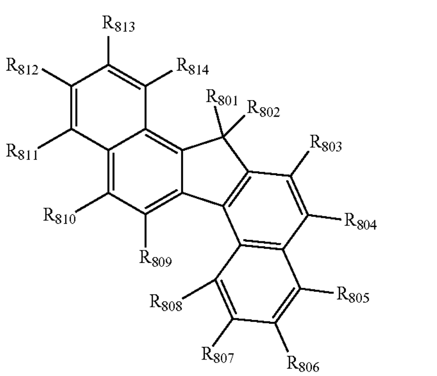
8C-8
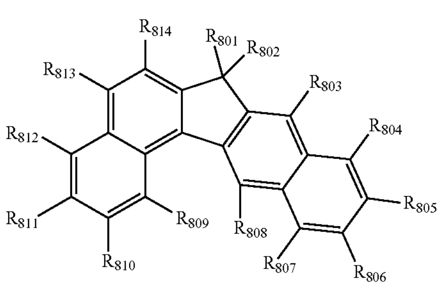
8C-9
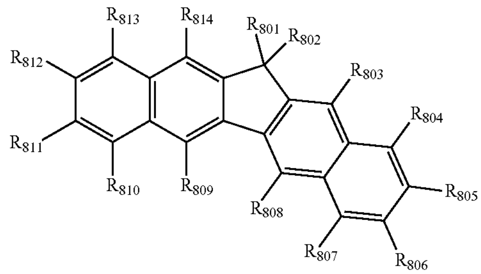
8C-10
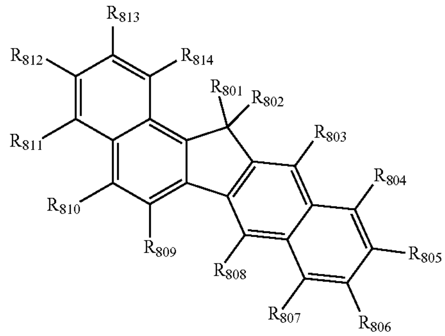
8C-11
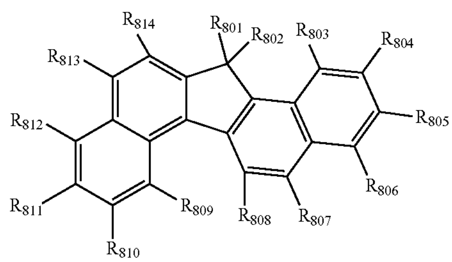
8C-12
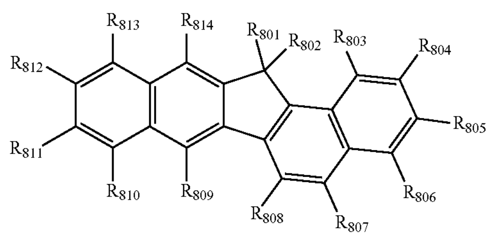
8C-13
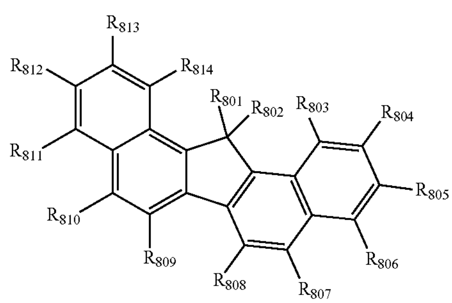

-continued
8C-14
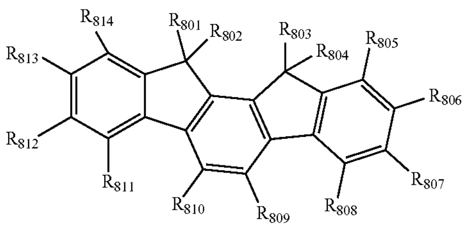
8C-15
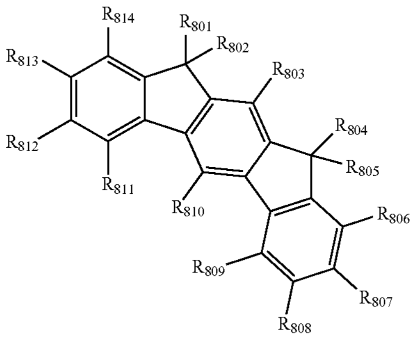
8C-16
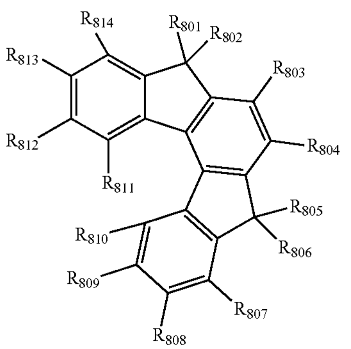
8C-17
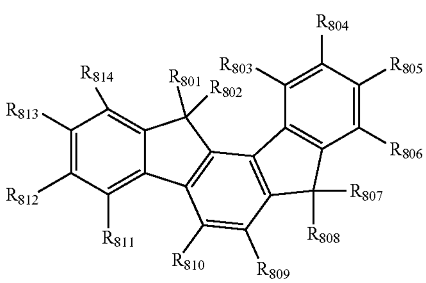
8C-18
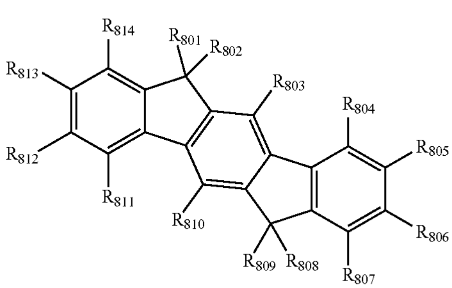
-continued
8C-19
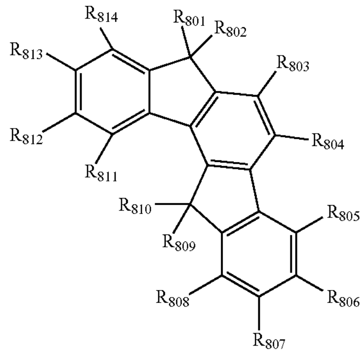
9B-1
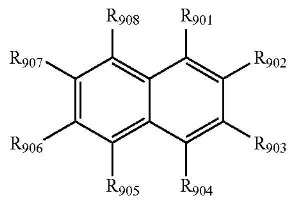
9B-2
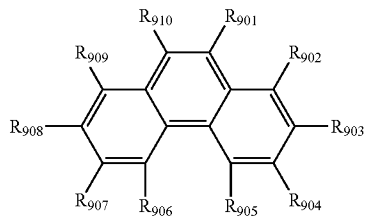
9B-3
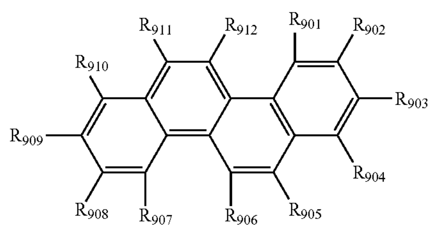
9B-4
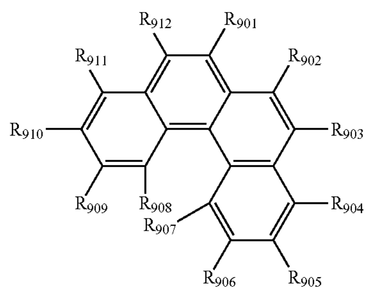
9B-5
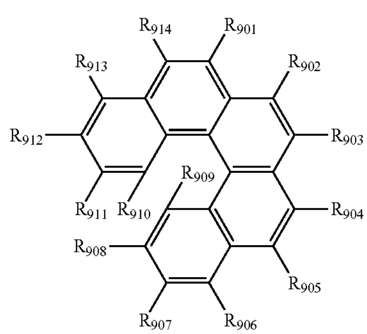

9B-6
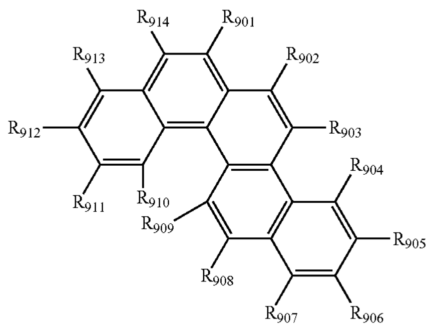
9B-7
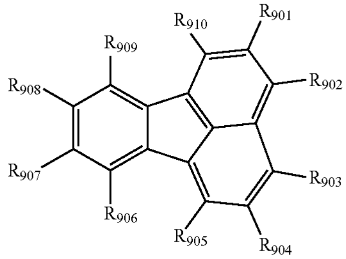
9B-8
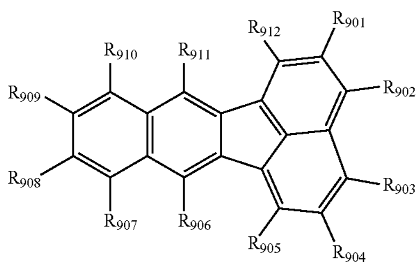
9B-9
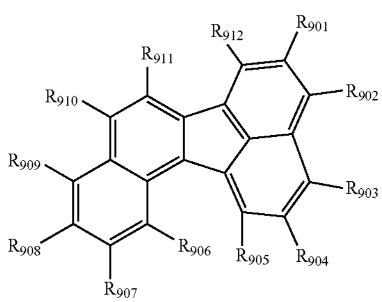
9B-10
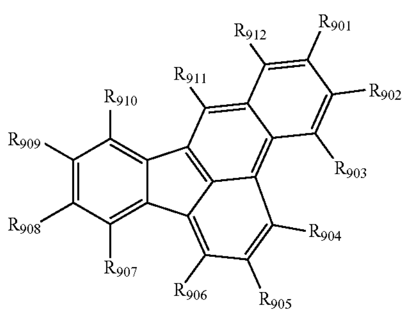
9B-11
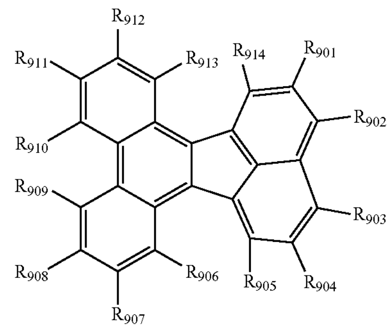
9B-12
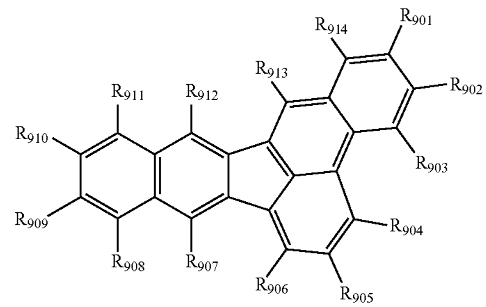
9B-13
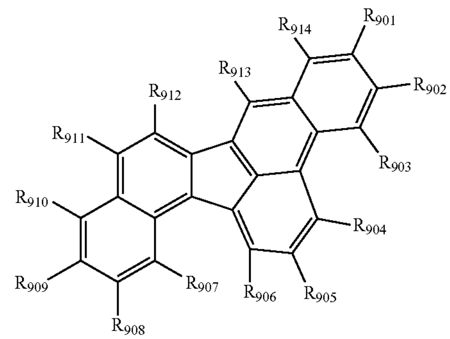
9B-14
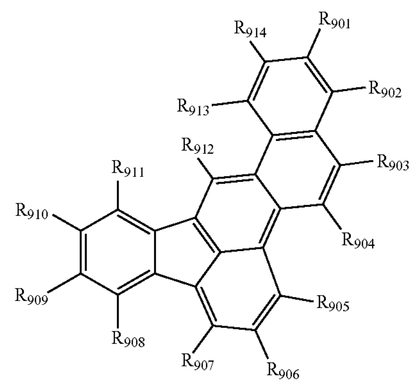

-continued
9B-15
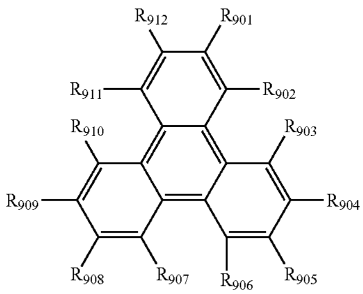
9B-16
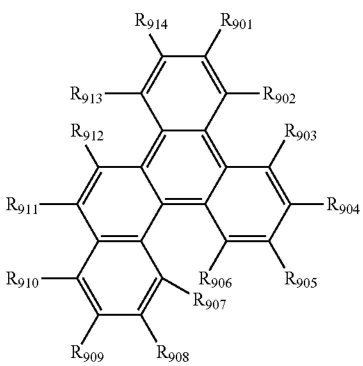
9B-17
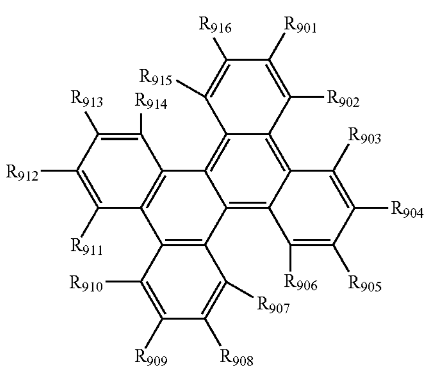
9B-18
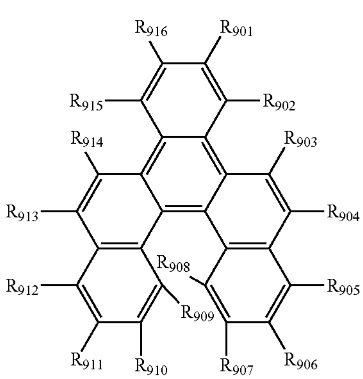
-continued
9B-19
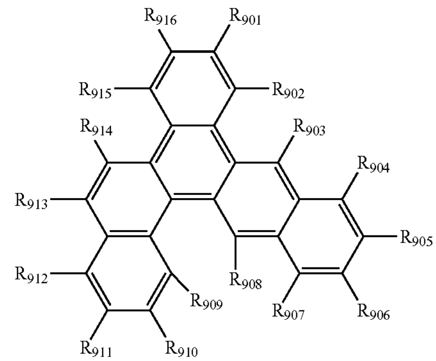
9C-1
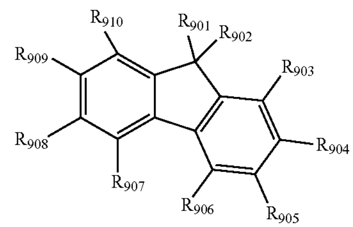
9C-2
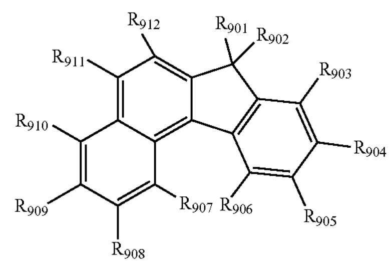
9C-3
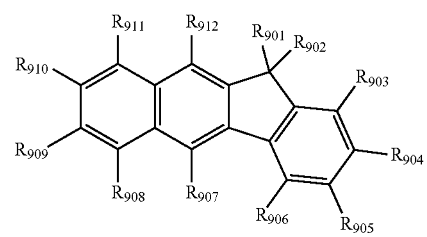
9C-4
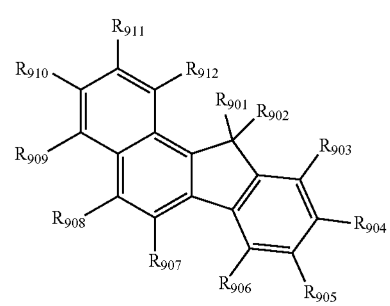

-continued
9C-5
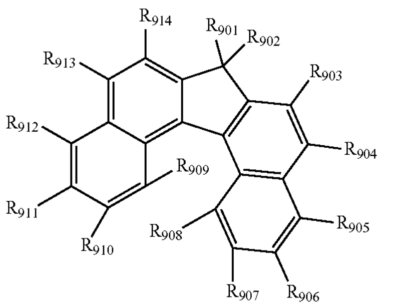
9C-6
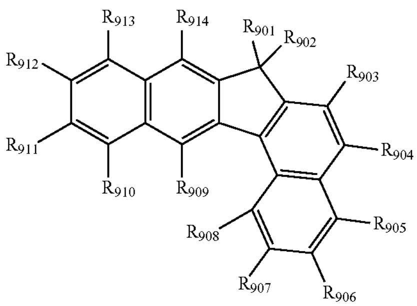
9C-7
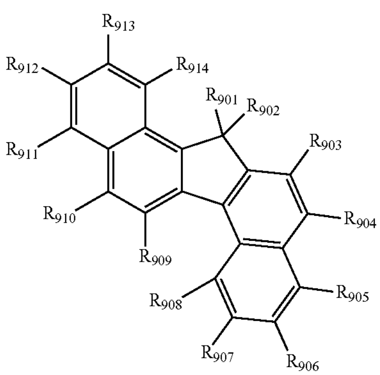
9C-8
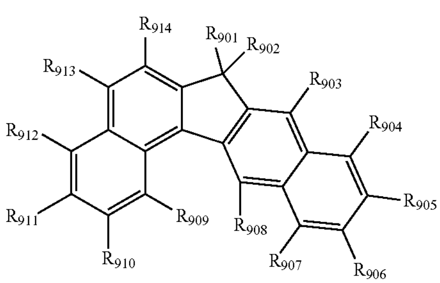
9C-9
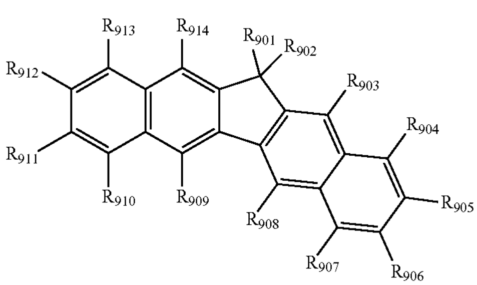
-continued
9C-10
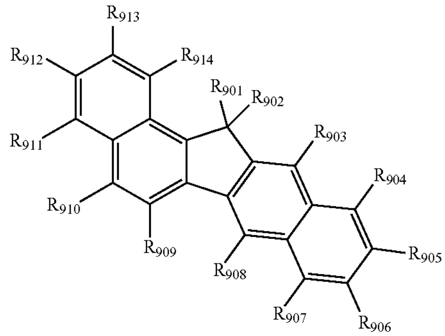
9C-11
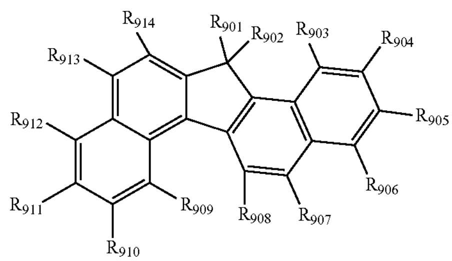
9C-12
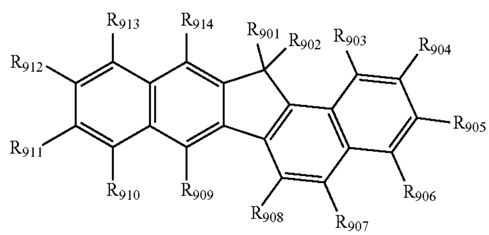
9C-13
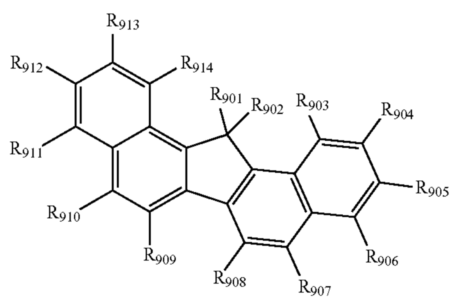
9C-14
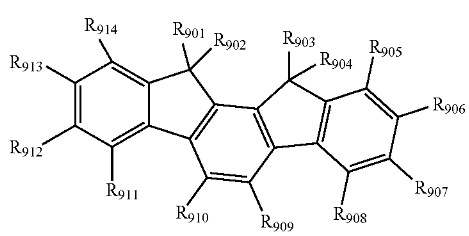

-continued 9C-15

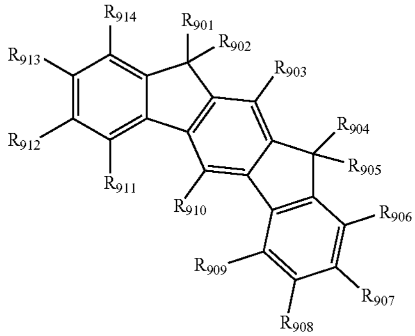

9C-16

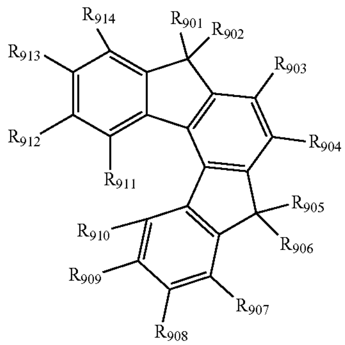

9C-17

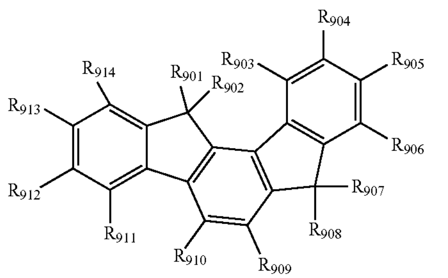

9C-18

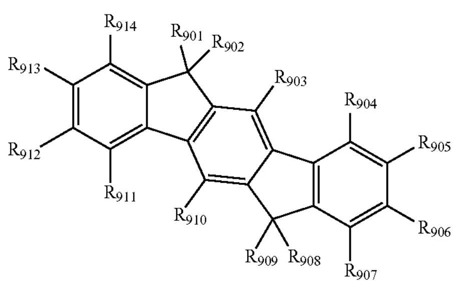

9C-19

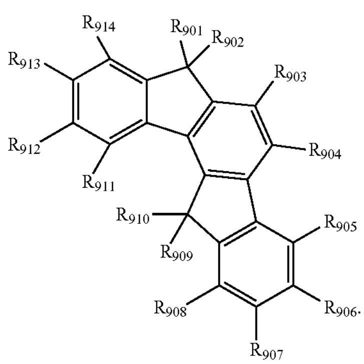

In Formulae 8B-1 to 8B-19, 8C-1 to 8C-19, 9B-1 to 9B-19, and 9C-1 to 9C-19, descriptions of $R_{801}$ to $R_{816}$ may each be independently as referred to in the descriptions provided above, and descriptions of $R_{901}$ to $R_{916}$ may each be independently as referred to in the descriptions provided above.

For example, the first host may be selected from Compounds HT-18, HT-34, HT-45, and HT-50 below, and the second host may be selected from Compounds ET-8, ET-61, and ET-73 below, but the first host and the second host are not limited thereto:

HT-18

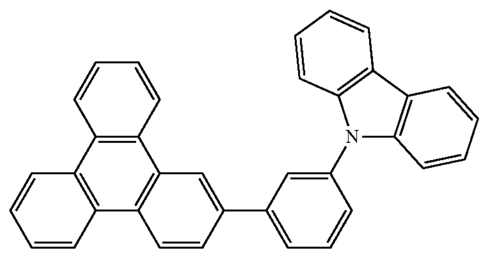

HT-34

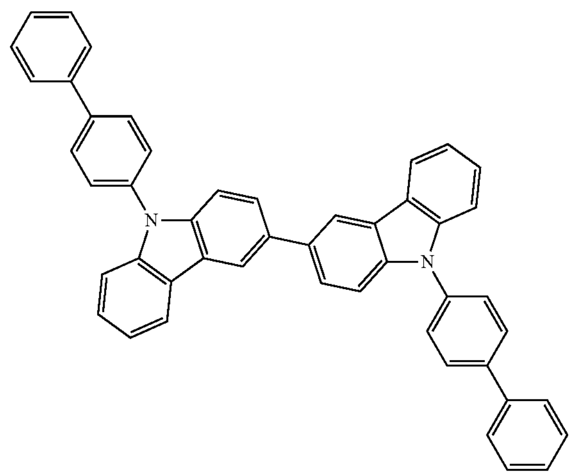

HT-45

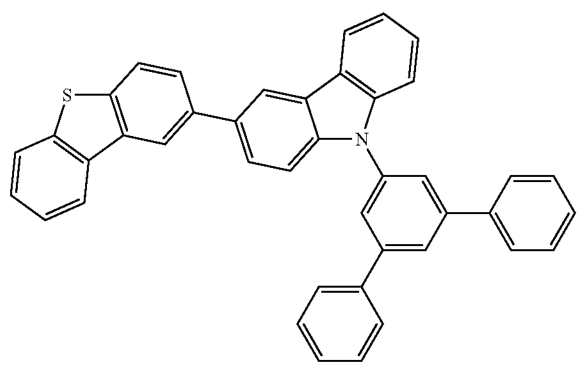

-continued
HT-50
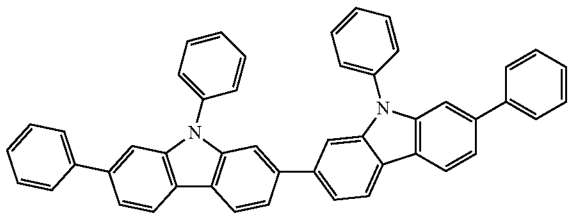
ET-8
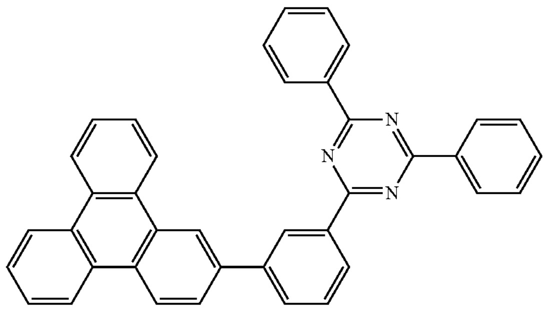
ET-61
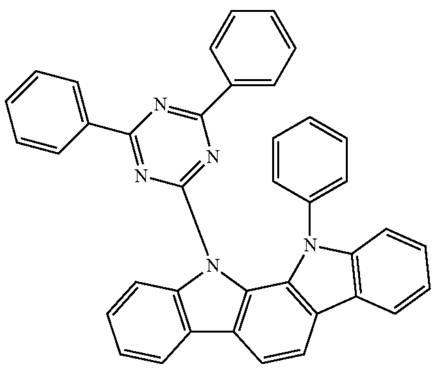
ET-73
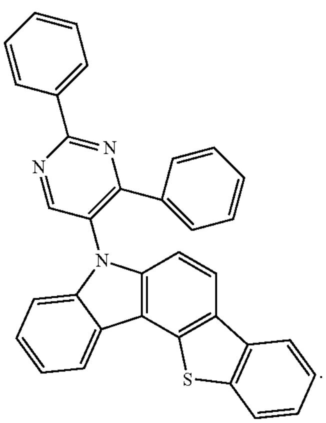
For example, the first host and the second host may each be independently selected from Compounds H-1a to H-12a below, but the first host and the second host are not limited thereto:
H-1a
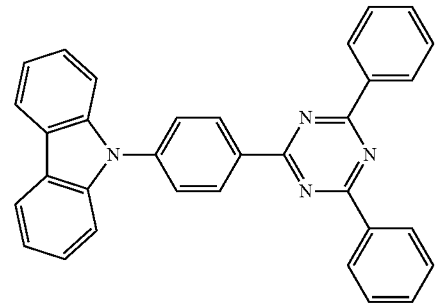
H-2a
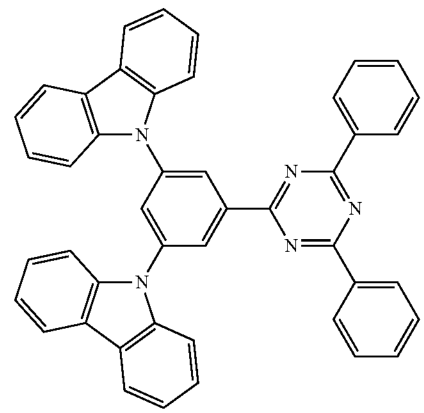
H-3a
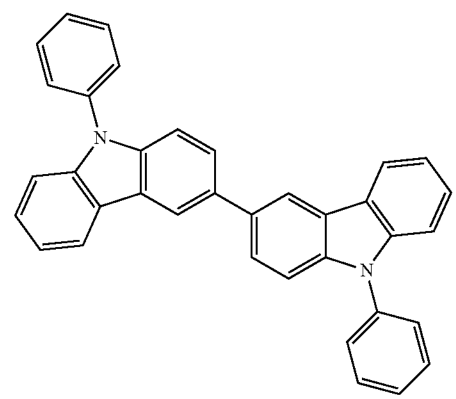
H-4a
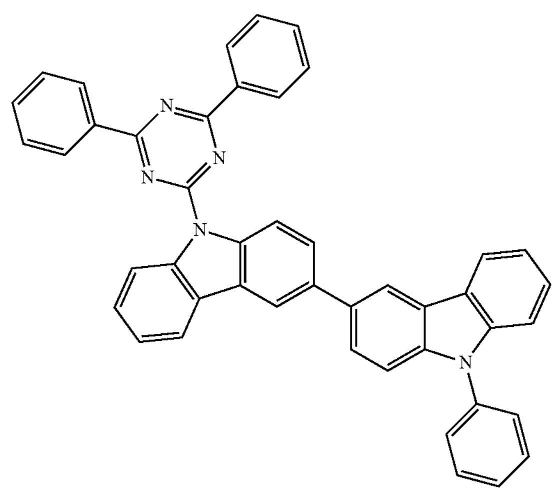

H-5a
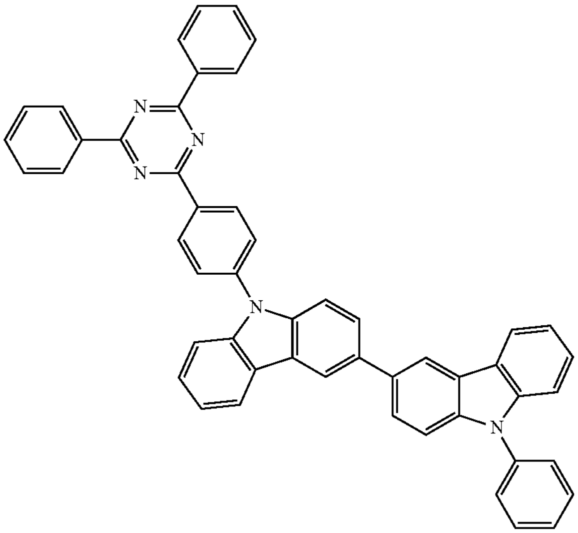
H-6a
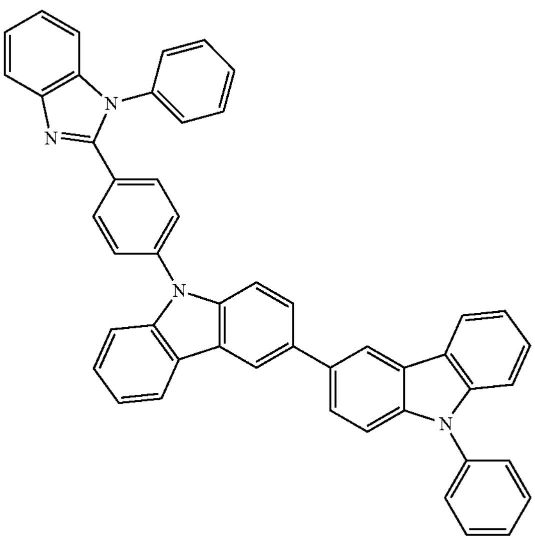
H-7a
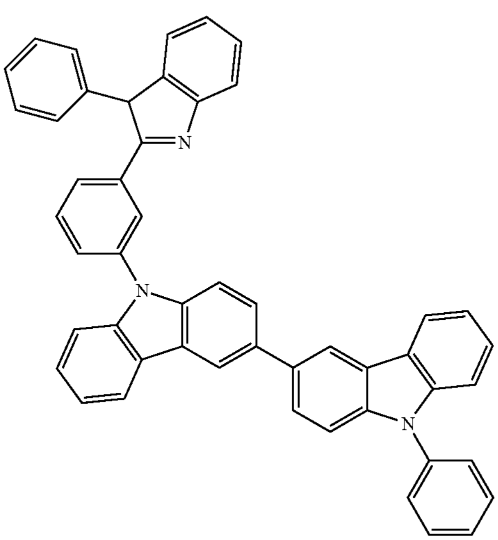
H-8a
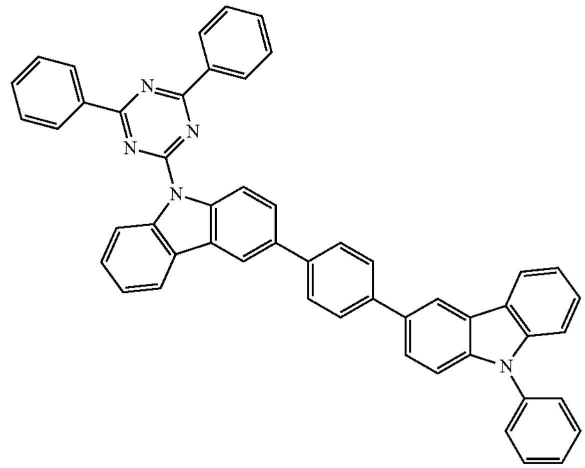
H-9a
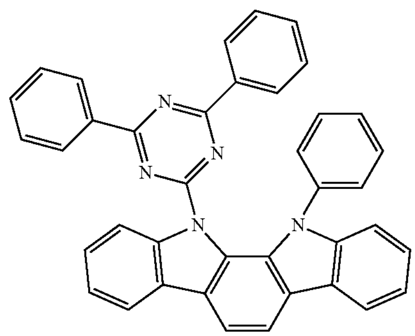
H-10a
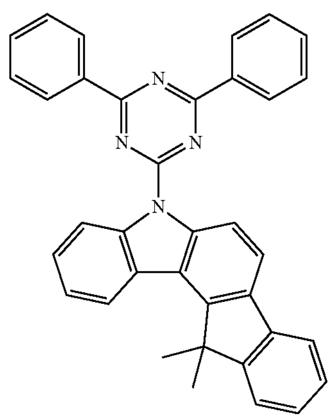
H-11a
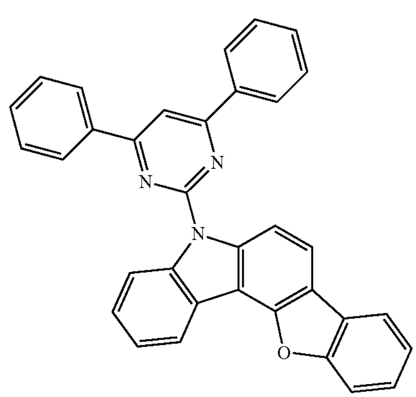

-continued
H-12a
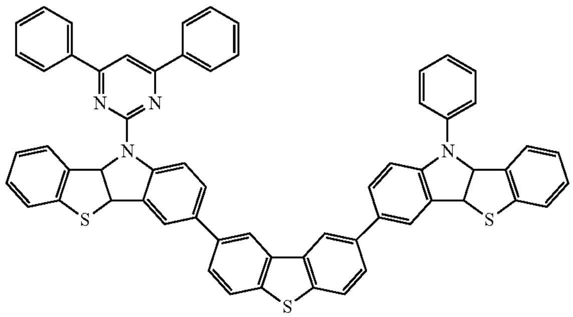
For example, the first host may be selected from Compounds H-1a to H-12a below, and the second host may be selected from Compounds H-1b to H-12b below, but the first host and the second host are not limited thereto:
H-1a
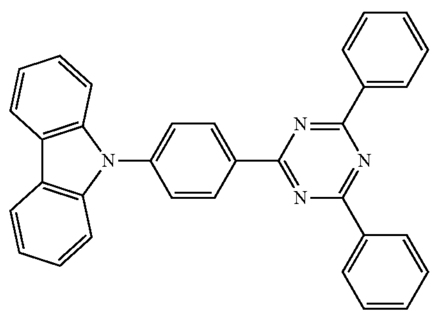
H-2a
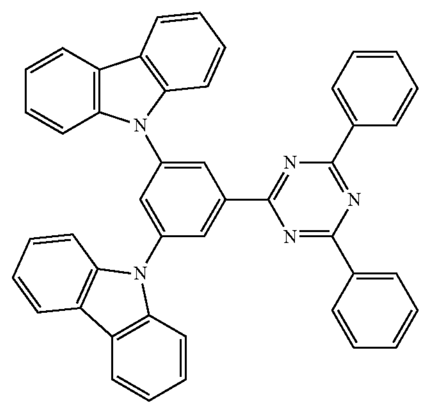
H-3a
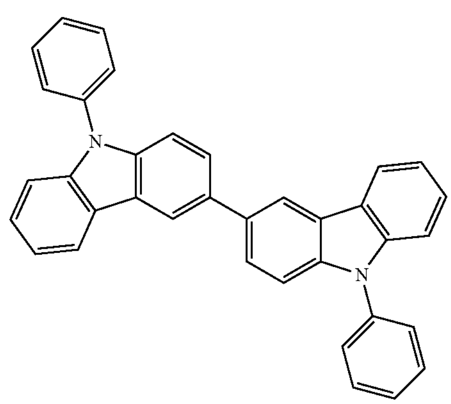
H-4a
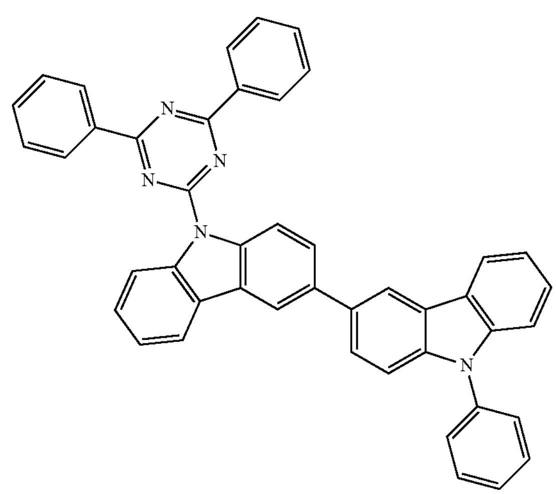

-continued
H-5a
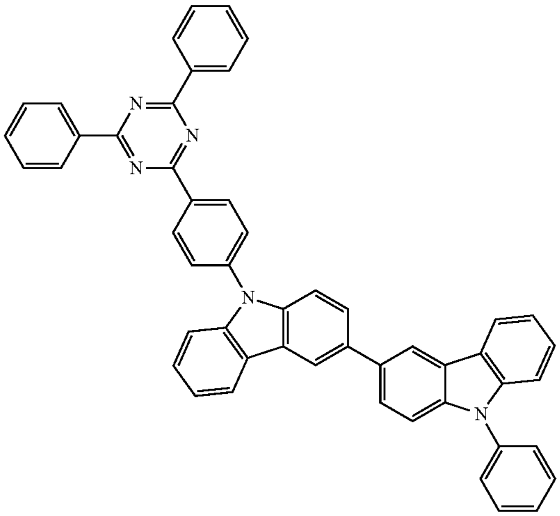
H-6a
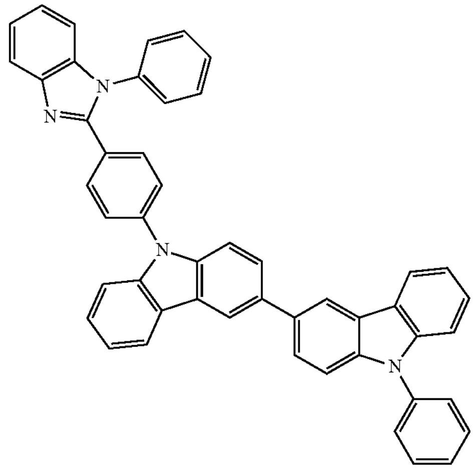
H-7a
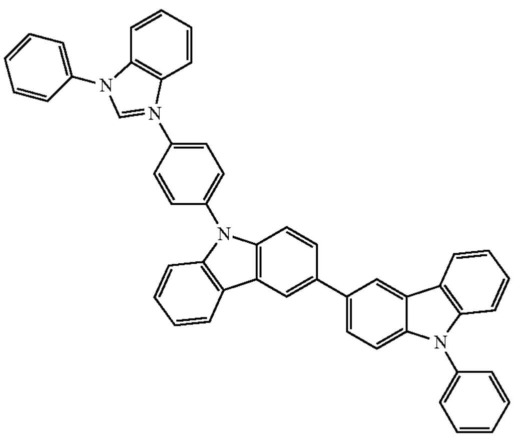
H-8a
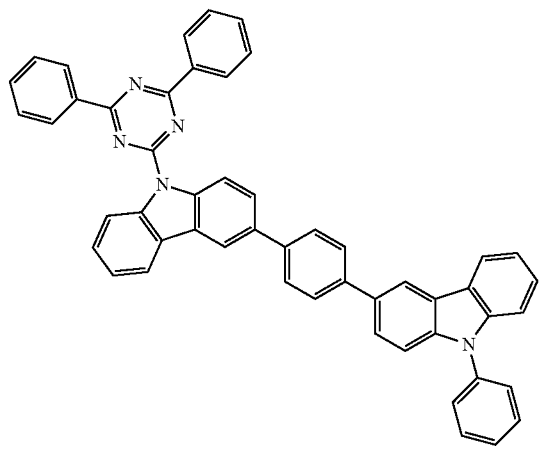
H-9a
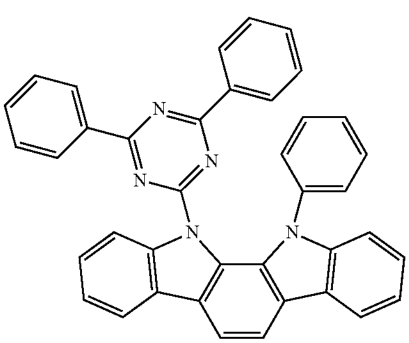
H-10a
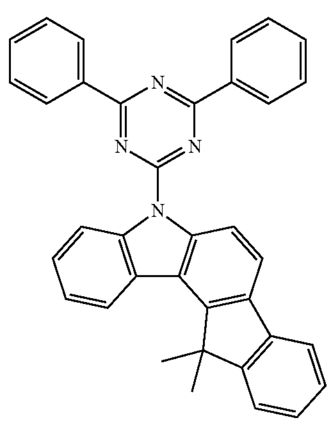

-continued
H-11a
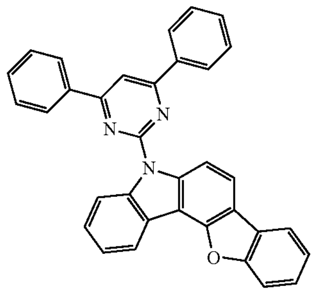
H-12a
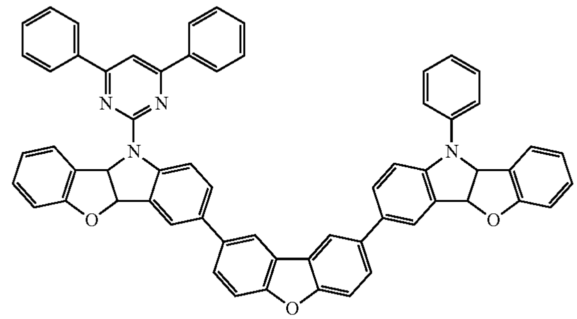
H-1b
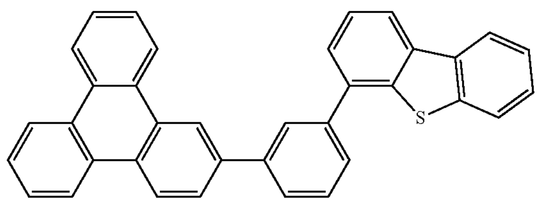
H-2b
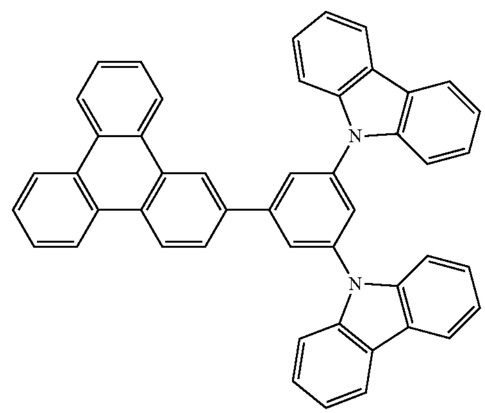
H-3b
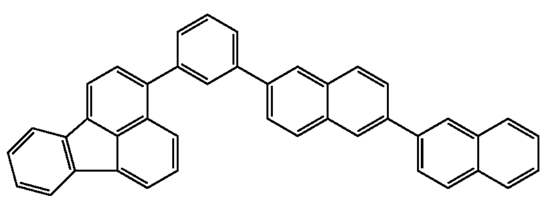
H-4b
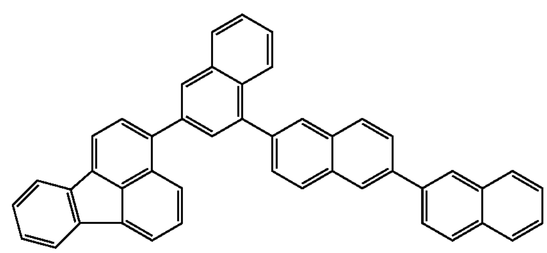
H-5b
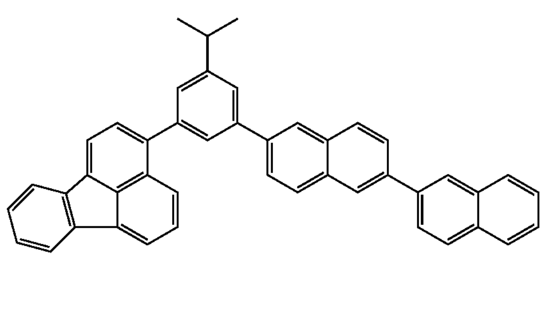
H-6b
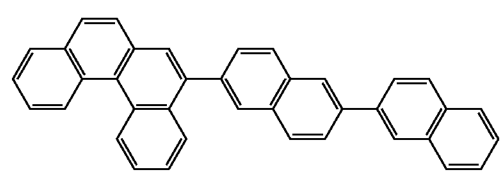

-continued
H-7b
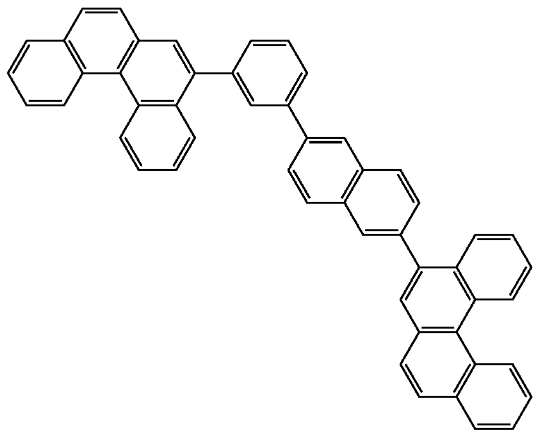
H-8b
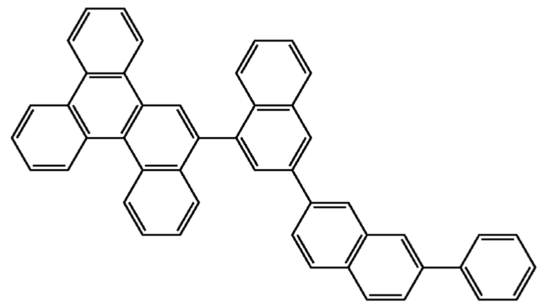
H-9b
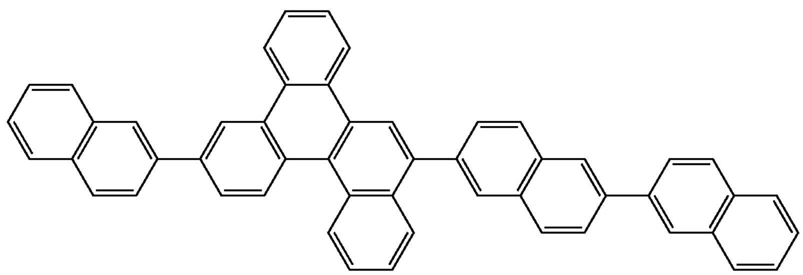
H-10b
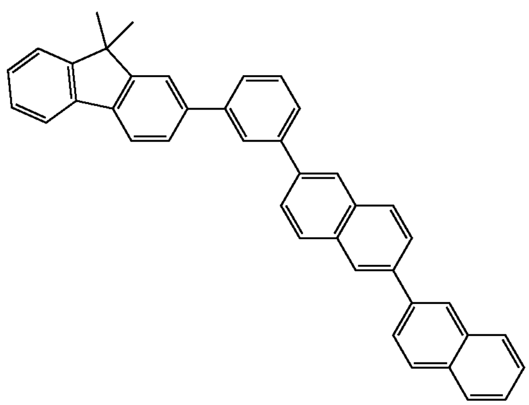
H-11b
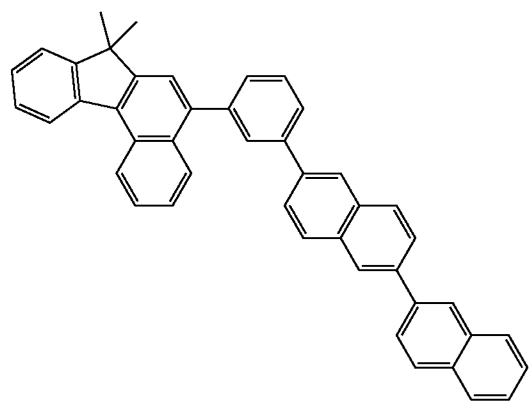
H-12b
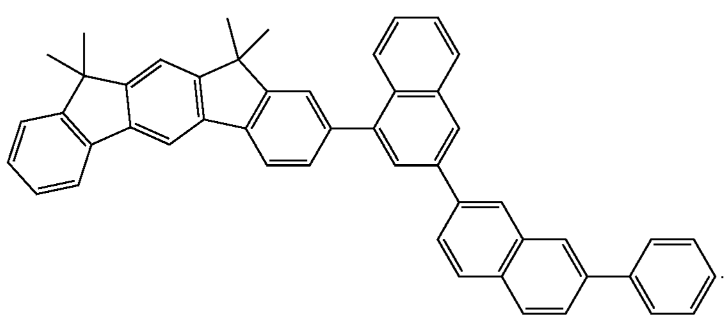
For example, the first host and the second host may each be independently selected from Compounds H-1b to H-12b below, but the first host and and the second host are not limited thereto:

H-1b
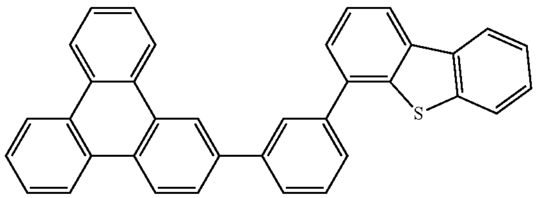
H-2b
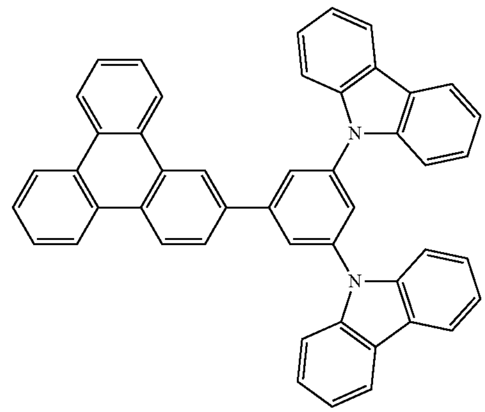
H-3b
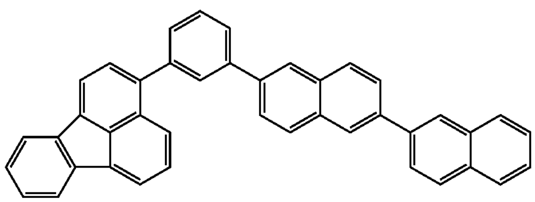
H-4b
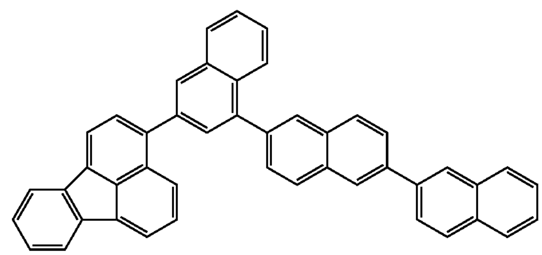
H-5b
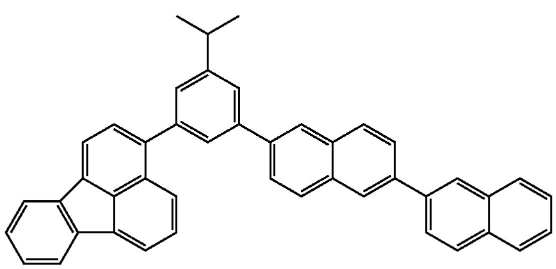
H-6b
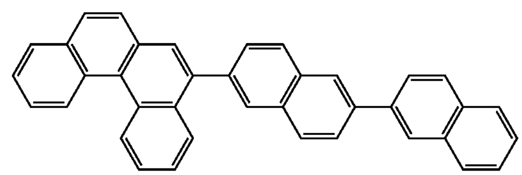
H-7b
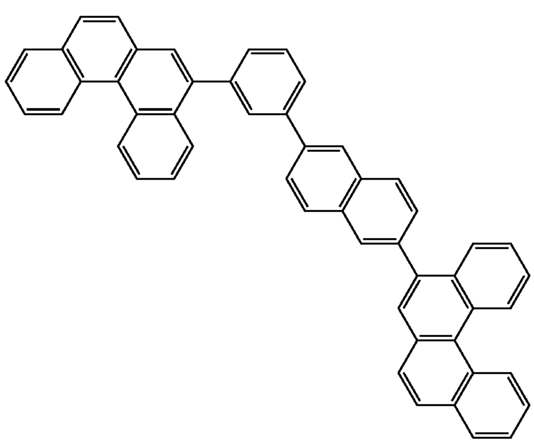
H-8b
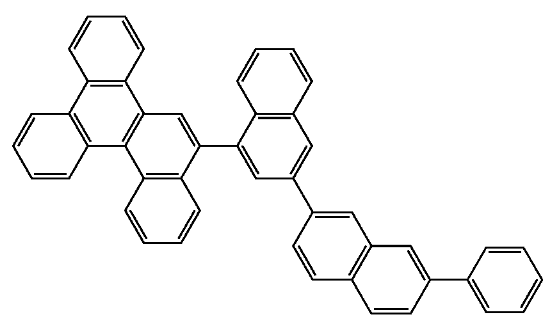

-continued

H-9b

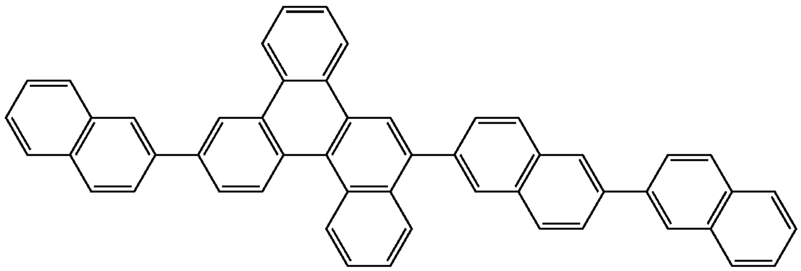

H-10b

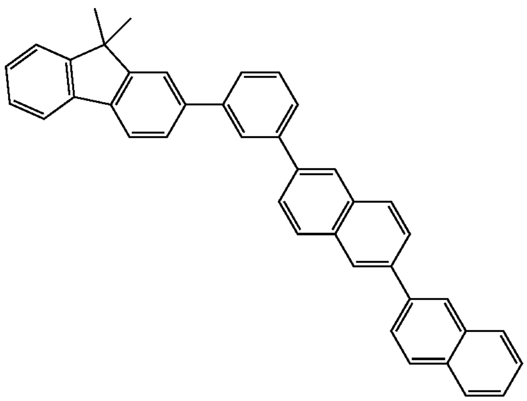

H-11b

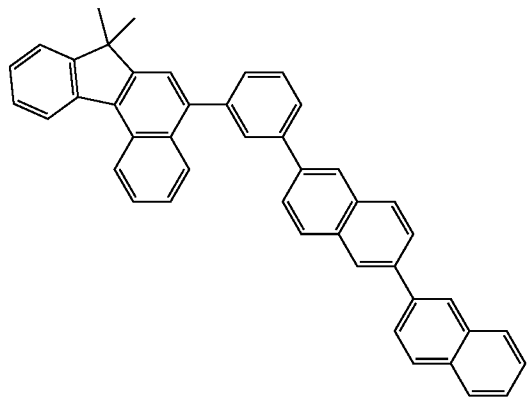

H-12b

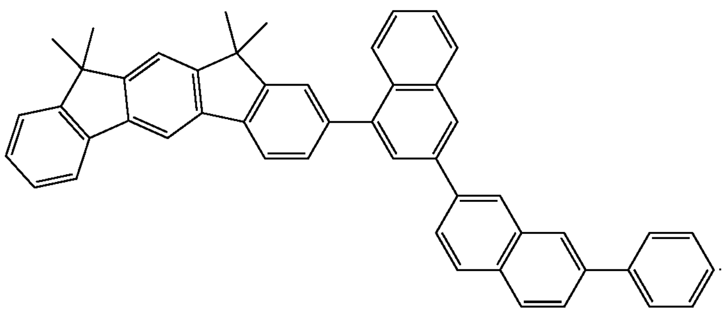

For example, one of the first host and the second host may have a triplet energy gap of 2.1 eV or more, but the first host and the second host are not limited thereto. When one of the first host and the second host has a triplet energy gap of 2.1 eV or more, one of the first host and the second host may have an excited state of triplet excitons of the EML in an efficient manner.

One of the factors that may influence efficiency and lifespan of organic light-emitting devices the most includes the balance between the electrons and the holes in the EML. Furthermore, it is also important to widely and evenly distribute emission regions in the EML emission layer with respect to the HTL and the ETL. In this regard, the EML including the first host and the second host that are different from each other may be used.

For example, the first host may include a hole-transporting group, and the second host may include an electron-transporting group, such that the electrons and the holes in the EML may be balanced.

A weight ratio of the first host and the second host may be in a range of about 1:9 to about 9:1. For example, the weight ratio of the first host and the second host may be in a range of about 2:8 to about 8:2. For example, the weight ratio of the first host and the second host may be in a range of about 3:7 to about 7:3. For example, the weight ratio of the first host and the second host may be about 5:5.

In some embodiments, a volume ratio of the first host and the second host may be in a range of about 1:9 to about 9:1. For example, the volume ratio of the first host and the second host may be in a range of about 2:8 to about 8:2. For example, the volume ratio of the first host and the second host may be in a range of about 3:7 to about 7:3. For example, the volume ratio of the first host and the second host may be about 5:5.

When the first host includes a hole-transporting group and an amount of the first host is 5 parts by weight or greater, the organic light-emitting device including the first host may have improve lifespan, but increased driving voltage. Thus, in consideration of the balance of the carriers in the organic light-emitting device, a critical or optimal weight ratio of the carriers needs to be selected.

For example, when the organic light-emitting device includes the second host having a relatively strong electron-transporting group (e.g., a triazine) and a large amount of the first host, which does not include an electron-transporting group, the organic light-emitting device may have excellent efficiency and lifespan.

Alternatively, when the organic light-emitting device includes the second host having a relatively weak electron-transporting group (e.g., a pyridine or a pyrimidine) and a small amount of the first host, which does not include an electron-transporting group, the organic light-emitting device may also have excellent efficiency and lifespan.

As such, the weight ratio of the first host and the second host may vary depending upon the electric characteristics and the balance thereof in the organic light-emitting device.

Hereinafter, an example embodiment in which an EML of an organic light-emitting includes the Host I will be described (Embodiment 3).

In this embodiment, the emission layer may include a Host I, and the Host I may be represented by Formula 11:

$$Ar_{111}\text{-}[(L_{111})_{a111}\text{-}(R_{111})_{b111}]_{n111}.$$

In Formula 11, $Ar_{111}$ may be selected from a substituted or unsubstituted $C_4$-$C_{30}$ pyrrolidine-based core and a substituted or unsubstituted $C_7$-$C_{30}$ condensed polycyclic-based core, at least one substituent of the substituted $C_4$-$C_{30}$ pyrrolidine-based core and the substituted $C_7$-$C_{30}$ condensed polycyclic-based core may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), where $Q_{11}$ to $Q_{17}$, $Q_{21}$ to $Q_{27}$, and $Q_{31}$ to $Q_{37}$ may each be independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 11, $Ar_{111}$ may be a group represented by one of Formulae 10-1 to 10-3, but $Ar_{111}$ is not limited thereto:

Formula 10-1

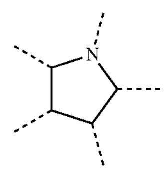

Formula 10-2

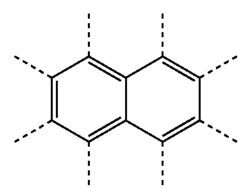

Formula 10-3

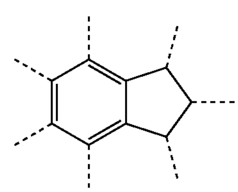

In Formulae 10-1 to 10-3, the line '- - -' indicates a covalent bond with an adjacent atom.

In another example embodiment, in Formula 11, $Ar_{111}$ may be a group represented by one of Formulae 12A-1 to 12A-4, 12B-1 to 12B-19, and 12C-1 to 12C-19, but $Ar_{111}$ is not limited thereto:

12A-1

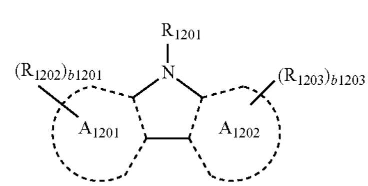

-continued
12A-2
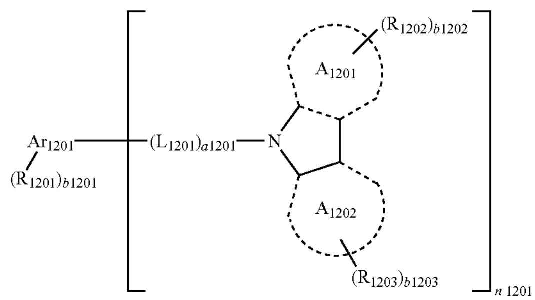
12A-3
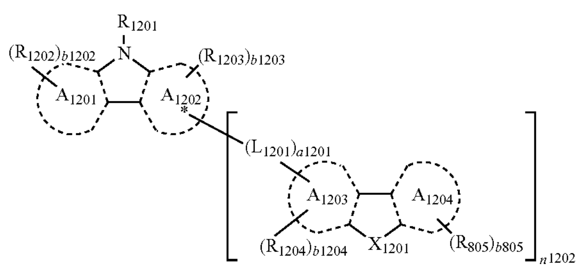
12A-4
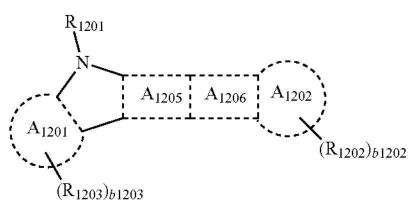
12B-1
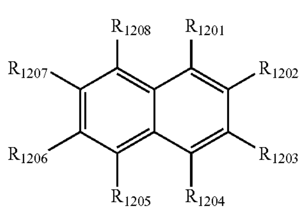
12B-2
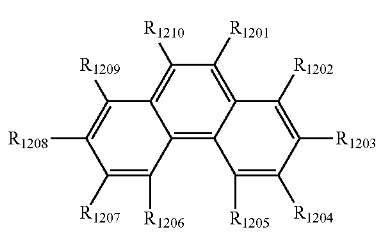
12B-3
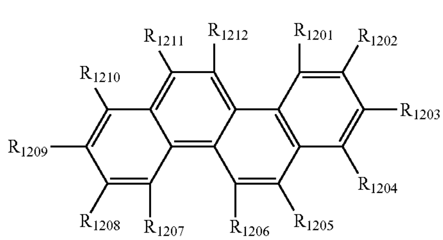
-continued
12B-4
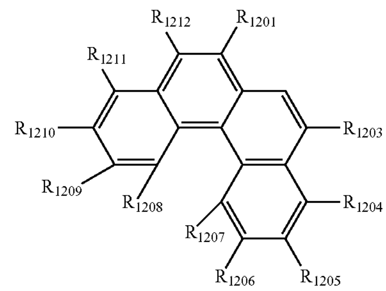
12B-5
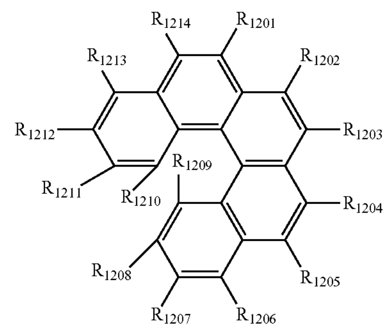
12B-6
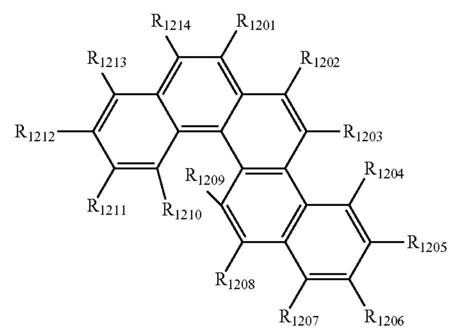
12B-7
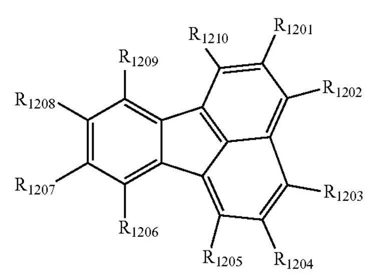
12B-8
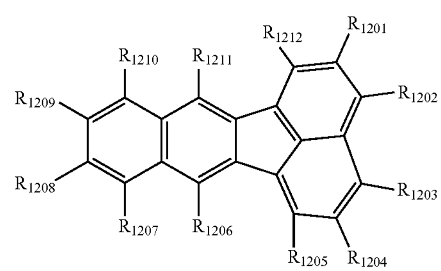

-continued
12B-9
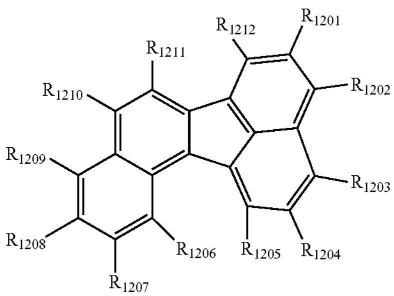
12B-10
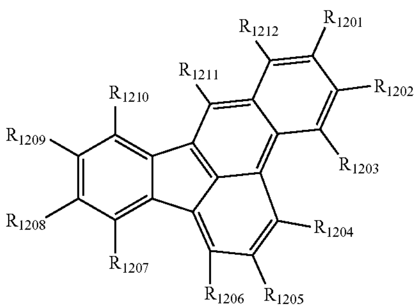
12B-11
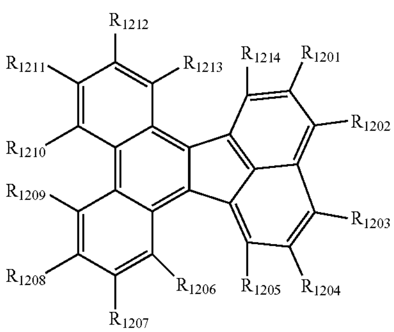
12B-12
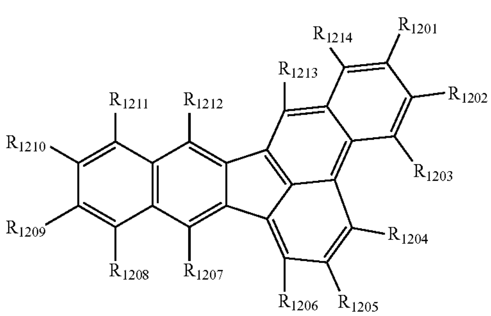
12B-13
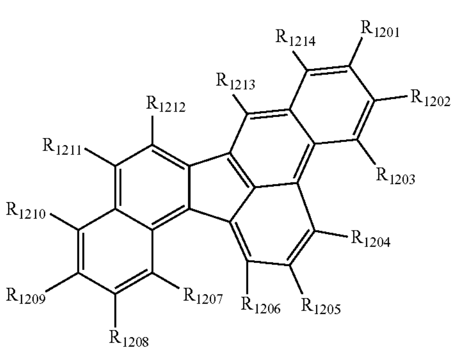
-continued
12B-14
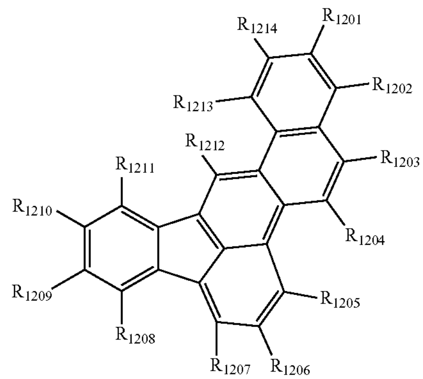
12B-15
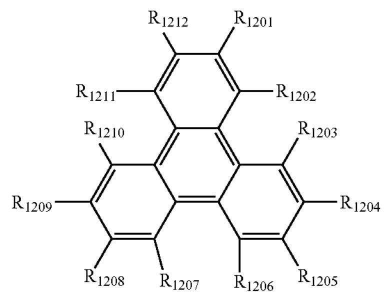
12B-16
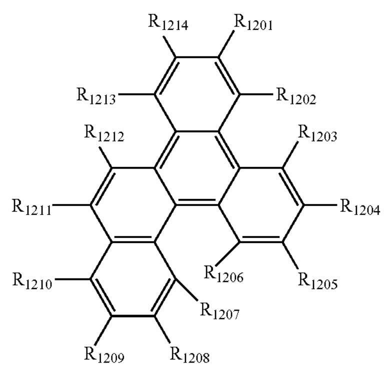
12B-17
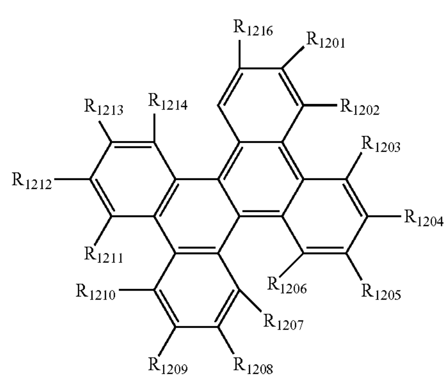

-continued
12B-18
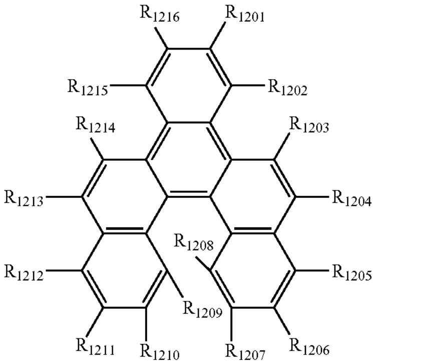
12B-19
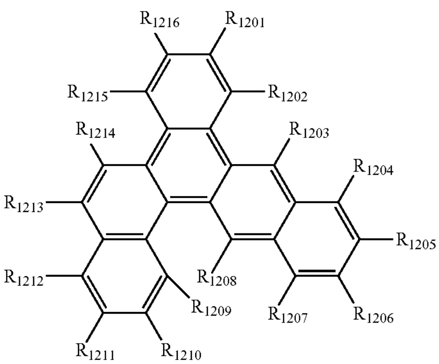
12C-1
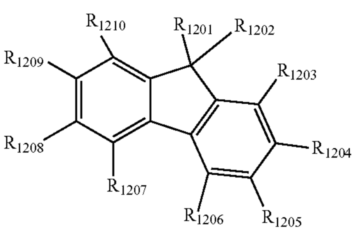
12C-2
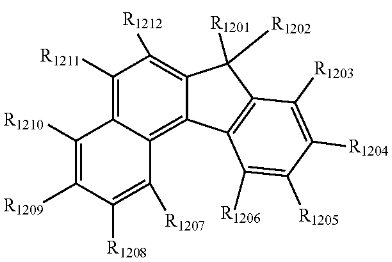
12C-3
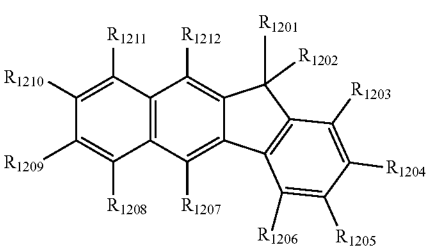
-continued
12C-4
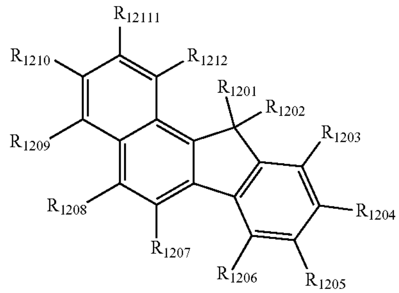
12C-5
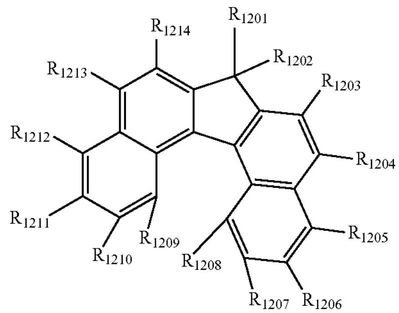
12C-6
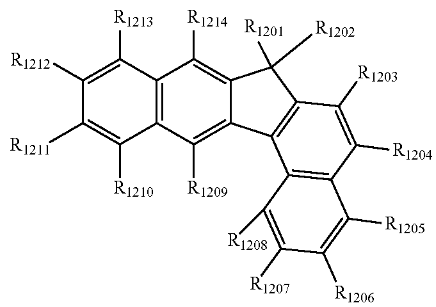
12C-7
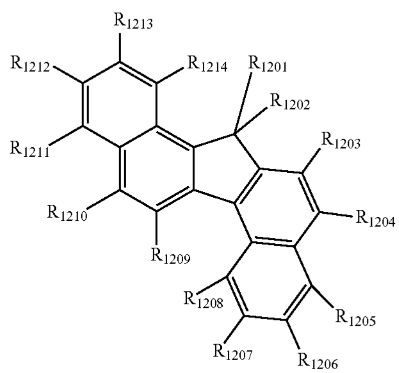
12C-8
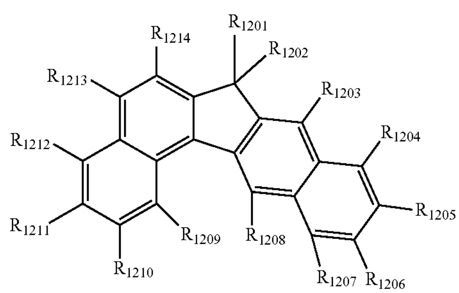

12C-9
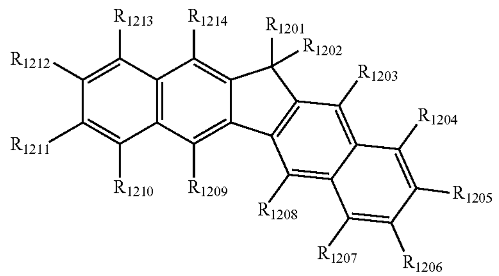
12C-10
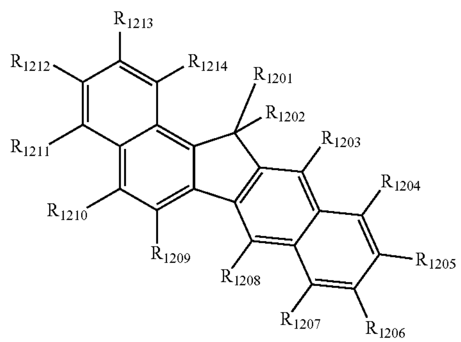
12C-11
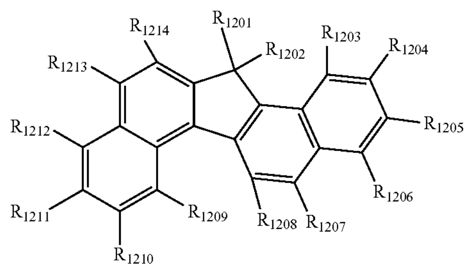
12C-12
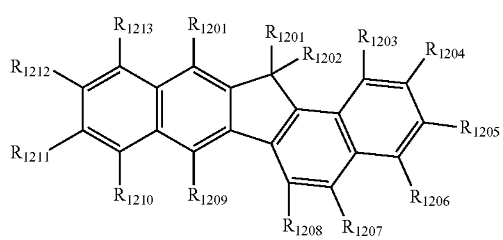
12C-13
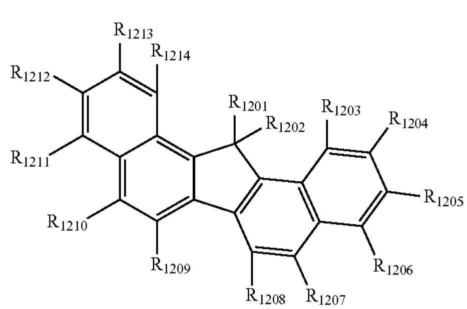
12C-14
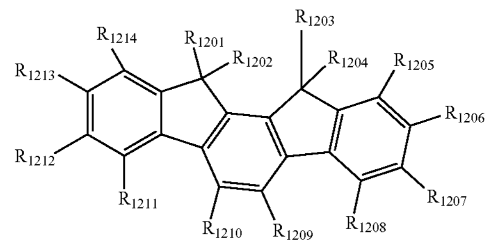
12C-15
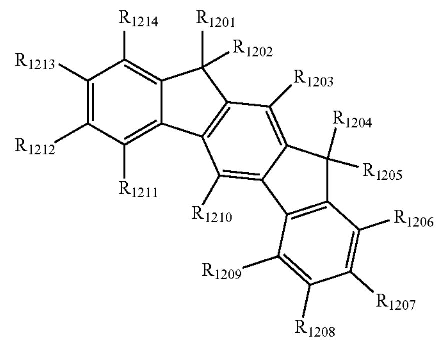
12C-16
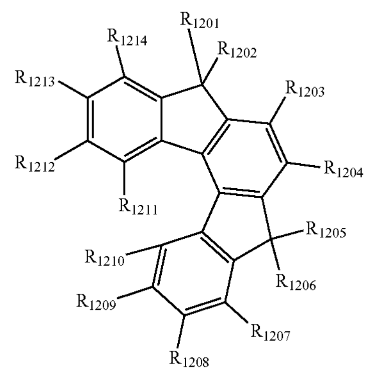
12C-17
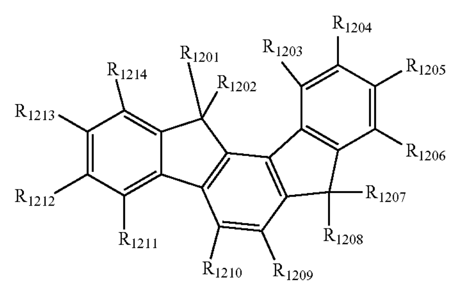
12C-18
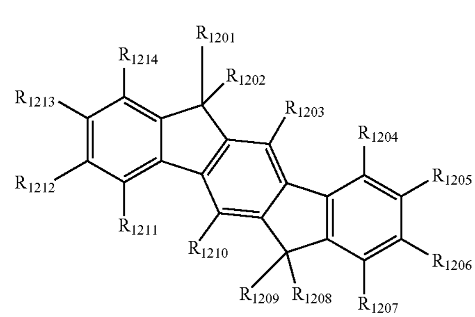

-continued 12C-19

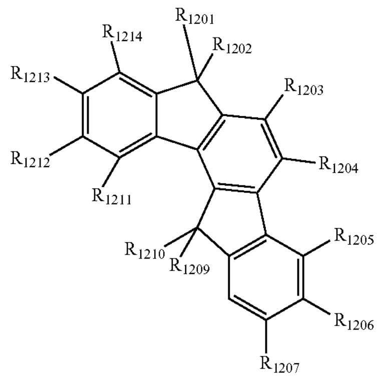

12D-1

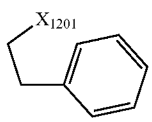

12D-2

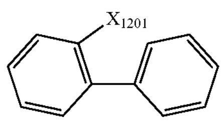

12D-3

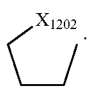

In the Formulae above, $Ar_{1201}$ may be selected from a substituted or unsubstituted $C_3$-$C_{10}$ cycloalkane group, a substituted or unsubstituted $C_1$-$C_{10}$ heterocycloalkane group, a substituted or unsubstituted $C_3$-$C_{10}$ cycloalkene group, a substituted or unsubstituted $C_1$-$C_{10}$ heterocycloalkene group, a substituted or unsubstituted $C_6$-$C_{60}$ arene group, a substituted or unsubstituted $C_1$-$C_{60}$ heteroarene group, a substituted or unsubstituted non-aromatic condensed polycyclic group, and a substituted or unsubstituted non-aromatic condensed heteropolycyclic group, $L_{1201}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1201 may be selected from 0, 1, 2, and 3, $A_{1201}$ to $A_{1204}$ may each be independently selected from a benzene, a naphthalene, a pyridine, a pyrimidine, a pyrazine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, a group represented by Formula 12D-1 above, and a group represented by Formula 12D-2 above, $A_{1205}$ may be selected from a benzene and a naphthalene, $A_{1206}$ may be a group represented by Formula 12D-3 above, $X_{1201}$ and $X_{1202}$ may each be independently selected from $N(R_{1206})$, O, S, $C(R_{1206})(R_{1207})$, $Si(R_{1206})(R_{1207})$, $B(R_{1206})$, $P(R_{1206})$, and $P(=O)(R_{1206})$, $R_{1201}$ to $R_{1216}$ may each be independently selected from *-[$(L_{111})_{a111}$-$(R_{111})_{b111}$], hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{1201}$ to $R_{1216}$ is selected from *-[$(L_{111})_{a111}$-$(R_{111})_{b111}$], b1201 to b1205 may each be independently selected from 1, 2, 3, and 4, n1201 may be selected from 2, 3, and 4, n1202 may be selected from 1, 2, and 3, at least one substituent of the substituted $C_3$-$C_{10}$ cycloalkane group, the substituted $C_1$-$C_{10}$ heterocycloalkane group, the substituted $C_3$-$C_{10}$ cycloalkene group, the substituted $C_1$-$C_{10}$ heterocycloalkene group, the substituted $C_6$-$C_{60}$ arene group, the substituted $C_1$-$C_{60}$ heteroarene group, the substituted non-aromatic condensed polycyclic group, the substituted non-aromatic condensed heteropolycyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), where $Q_{11}$ to $Q_{17}$, $Q_{21}$ to $Q_{27}$, and $Q_{31}$ to $Q_{37}$ may each be independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In Formula 11, $L_{111}$ may be selected from:

a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, and the substituted divalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), where $Q_{11}$ to $Q_{17}$, $Q_{21}$ to $Q_{27}$, and $Q_{31}$ to $Q_{37}$ may each be independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 11, $L_{111}$ may be selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group.

In another example embodiment, in Formula 11, $L_{111}$ may be a group represented by one of Formulae 3-1 to 3-18, but $L_{111}$ is not limited thereto:

3-1

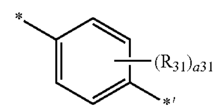

3-2

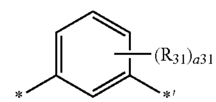

3-3

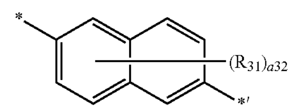

3-4

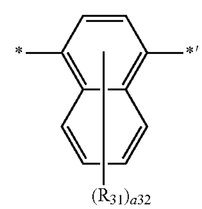

3-5

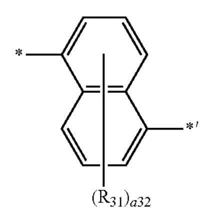

3-6

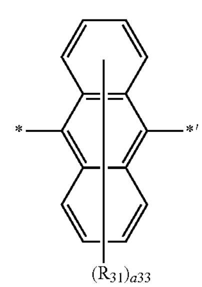

-continued 3-7

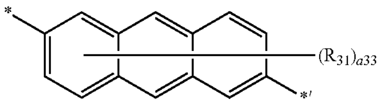

3-8

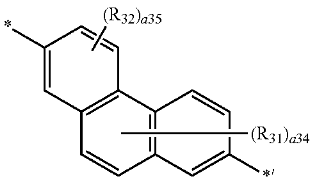

3-9

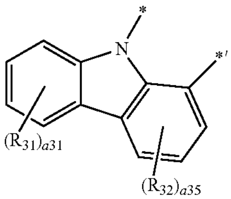

3-10

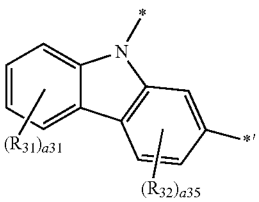

3-11

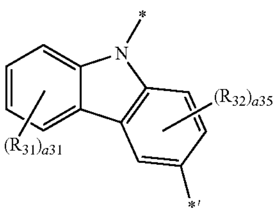

3-12

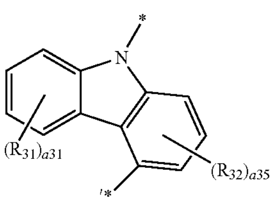

3-13

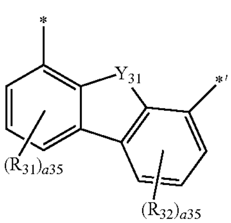

3-14

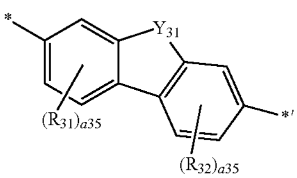

-continued 3-15

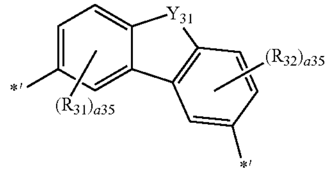

3-16

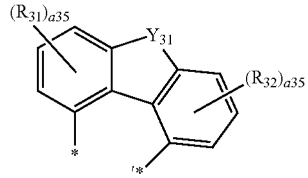

3-17

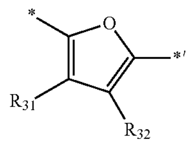

3-18

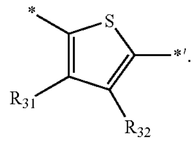

In Formulae 3-1 to 3-18, $Y_{31}$ may be selected from $C(R_{33})(R_{34})$, $N(R_{33})$, O, S, and $Si(R_{33})(R_{34})$, $R_{31}$ to $R_{34}$ may each be independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a31 may be selected from 1, 2, 3, and 4, a32 may be selected from 1, 2, 3, 4, 5, and 6, a33 may be selected from 1, 2, 3, 4, 5, 6, 7, and 8, a34 may be selected from 1, 2, 3, 4, and 5, a35 may be selected from selected from 1, 2, and 3, and

* and *' may each independently indicate a binding site to an adjacent atom.

In Formula 11, a111 may be selected from 0, 1, 2, and 3.

In Formula 11, $R_{111}$ may be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one $R_{111}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), where $Q_{11}$ to $Q_{17}$, $Q_{21}$ to $Q_{27}$, and $Q_{31}$ to $Q_{37}$ may each be independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 11, $R_{111}$ may be selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzothiazoly group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, a pyrimidobenzothiopheny group, and —N($R_{56}$)($R_{57}$); and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —N($Q_{31}$)($Q_{32}$), —Si($Q_{33}$)($Q_{34}$)($Q_{35}$), and —B($Q_{36}$)($Q_{37}$), where $R_{56}$ and $R_{57}$ may each be independently selected from:

a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group; and a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, and $Q_{31}$ to $Q_{37}$ may each be independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, but embodiments are not limited thereto.

In another example embodiment, in Formula 11, $R_{111}$ may be a group represented by one of Formulae 5-1 to 5-13 and 5-21 to 5-79, but $R_{111}$ is not limited thereto:

5-1

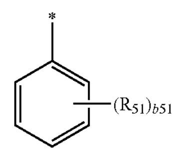

5-2

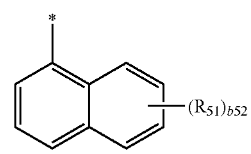

5-3

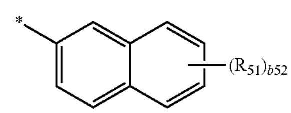

5-4

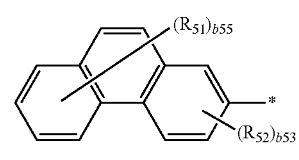

5-5

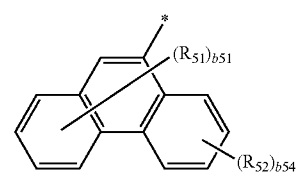

5-6

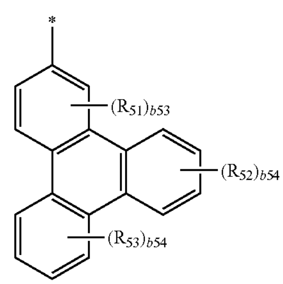

5-7

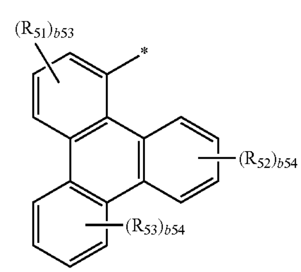

-continued
5-8
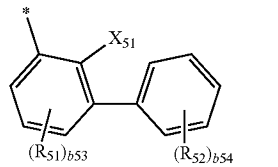
5-9
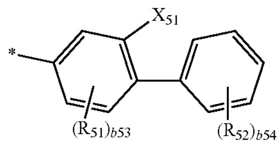
5-10
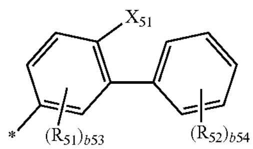
5-11
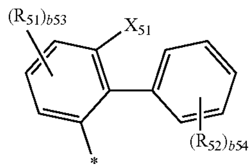
5-12
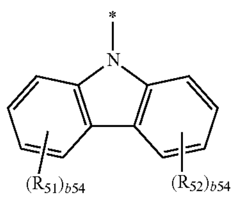
5-13
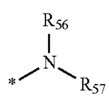
5-21
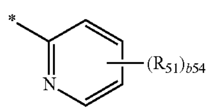
5-22
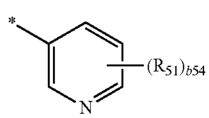
5-23
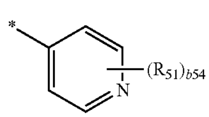
5-24
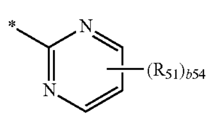
5-25
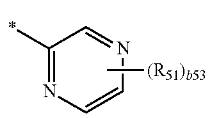
-continued
5-26
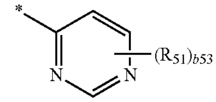
5-27
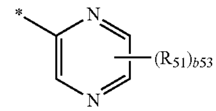
5-28
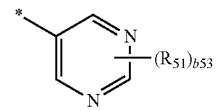
5-29
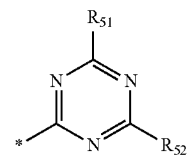
5-30
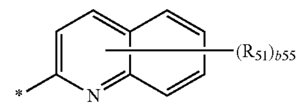
5-31
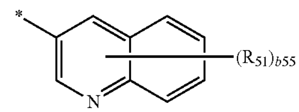
5-32
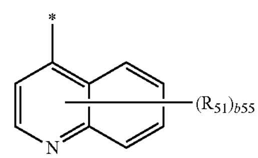
5-33
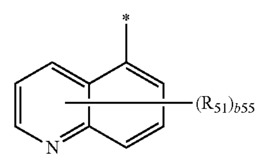
5-34
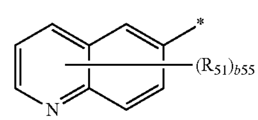
5-35
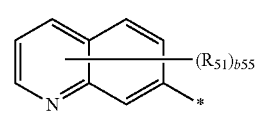
5-36
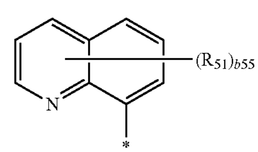
5-37
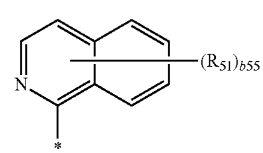

-continued
5-38
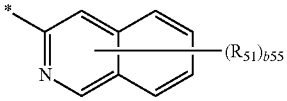
5-39
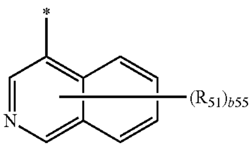
5-40
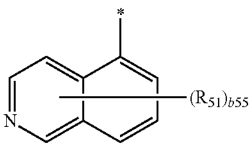
5-41
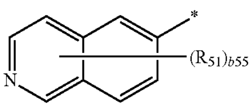
5-42
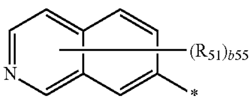
5-43
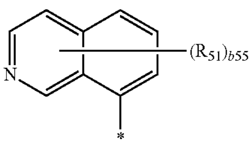
5-44
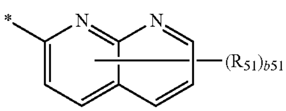
5-45
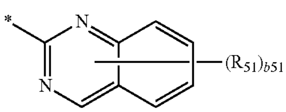
5-46
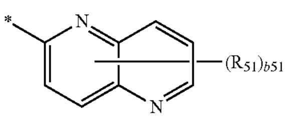
5-47
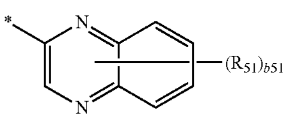
5-48
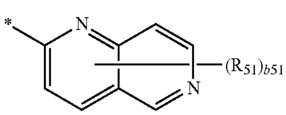
5-49
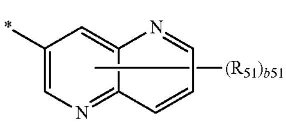
5-50
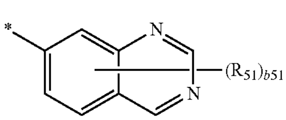
-continued
5-51
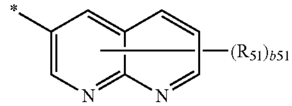
5-52
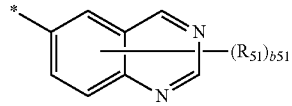
5-53
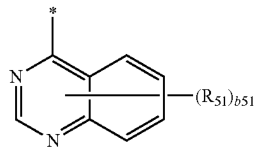
5-54
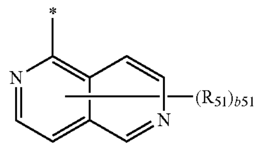
5-55
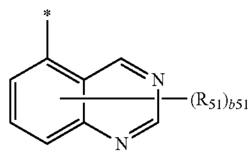
5-56
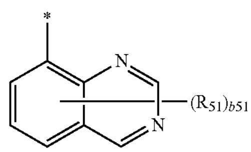
5-57
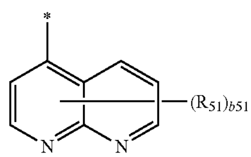
5-58
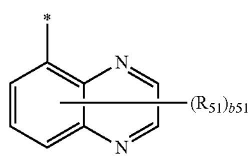
5-59
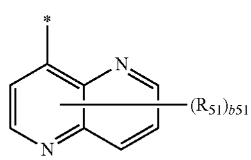
5-60
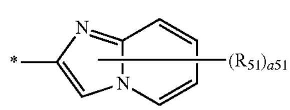
5-61
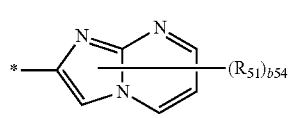

-continued
5-62
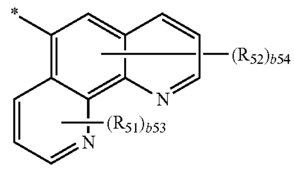
5-63
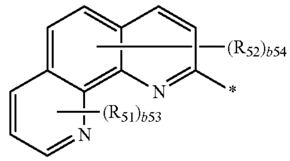
5-64
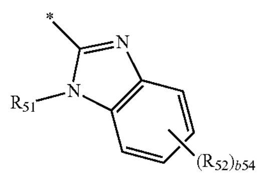
5-65
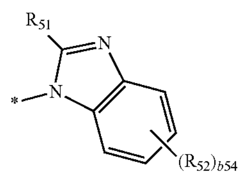
5-66
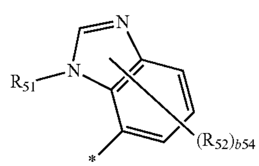
5-67
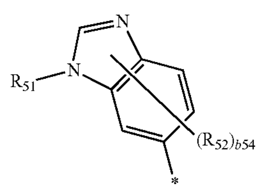
5-68
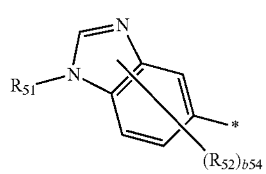
5-69
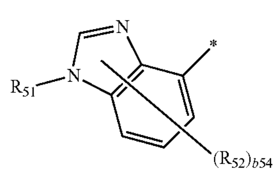
5-70
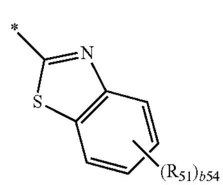
-continued
5-71
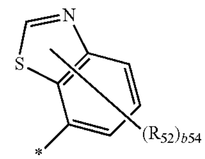
5-72
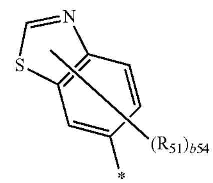
5-73
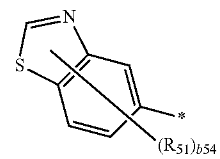
5-74
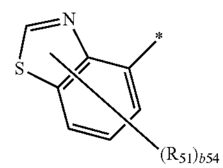
5-75
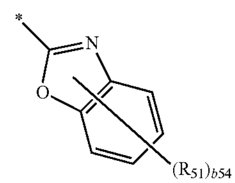
5-76
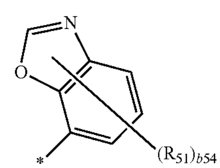
5-77
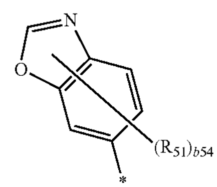
5-78
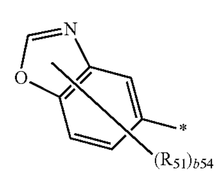
5-79
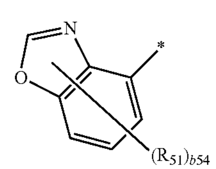

In Formulae 5-1 to 5-13 and 5-21 to 5-79, $X_{51}$ may be selected from O, S, $N(R_{54})$, and $C(R_{54})(R_{55})$, $R_{51}$ to $R_{55}$ may each be independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, a monovalent non-aromatic condensed heteropolycyclic group, $—N(Q_{41})(Q_{42})$, $—Si(Q_{43})(Q_{44})(Q_{45})$, and $—B(Q_{46})(Q_{47})$; and a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, $R_{56}$ and $R_{57}$ may each be independently selected from:

a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group; and a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, where $Q_{41}$ to $Q_{47}$ may each be independently selected from a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, b51 may be selected from 1, 2, 3, 4, and 5, b52 may be selected from 1, 2, 3, 4, 5, 6, and 7, b53 may be selected from 1, 2, and 3, b54 may be selected from 1, 2, 3, and 4, b55 may be selected from 1, 2, 3, 4, 5, and 6, and

* may indicate a binding site to an adjacent atom.

In another example embodiment, in Formula 11, $R_{111}$ may be a group represented by one of Formulae 6-1 to 6-59 and 6-61 to 6-219, but $R_{111}$ is not limited thereto:

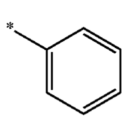

6-1

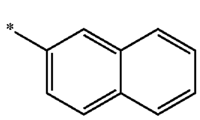

6-2

-continued

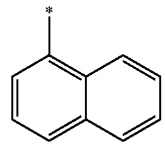

6-3

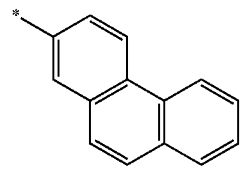

6-4

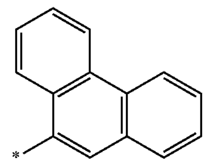

6-5

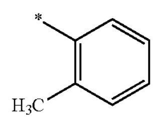

6-6

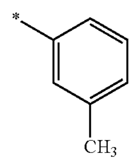

6-7

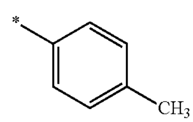

6-8

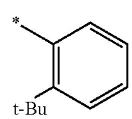

6-9

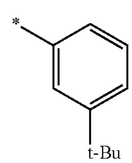

6-10

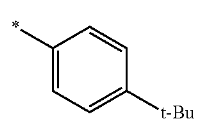

6-11

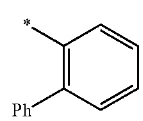

6-12

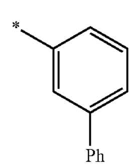

6-13

-continued
6-14
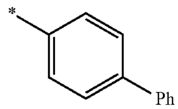
6-15
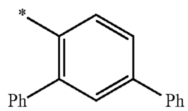
6-16
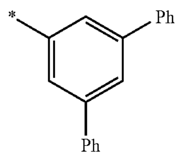
6-17
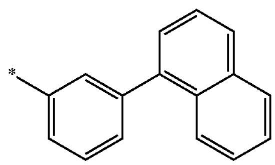
6-18
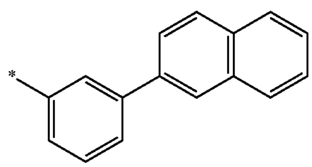
6-19
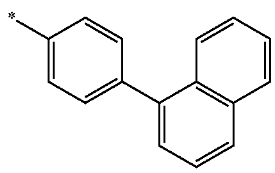
6-20
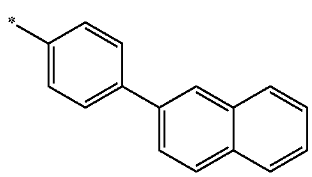
6-21
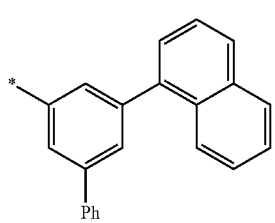
6-22
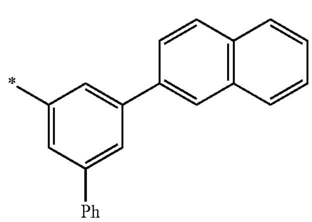
-continued
6-23
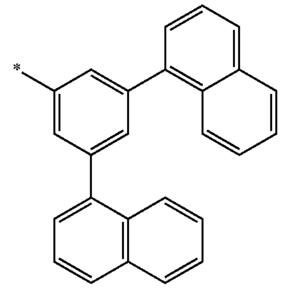
6-24
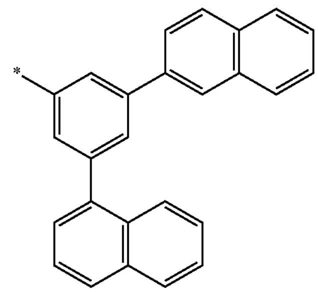
6-25
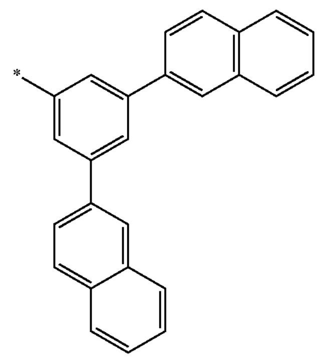
6-26
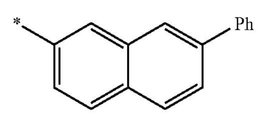
6-27
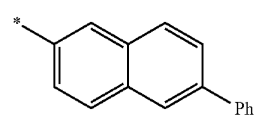
6-28
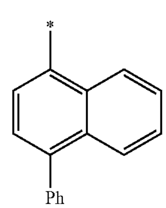
6-29
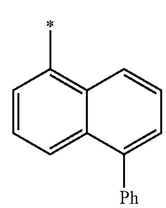

6-30
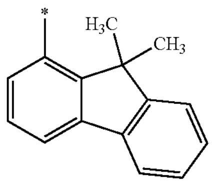
6-31
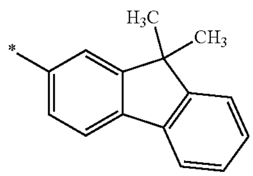
6-32
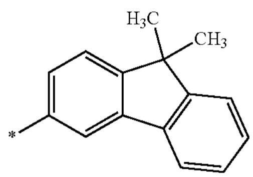
6-33
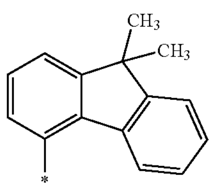
6-34
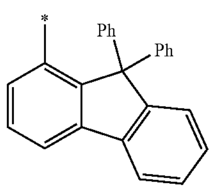
6-35
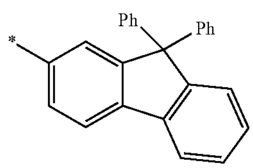
6-36
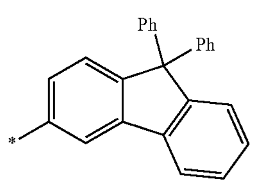
6-37
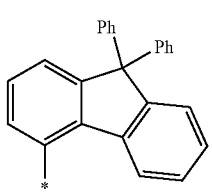
6-38
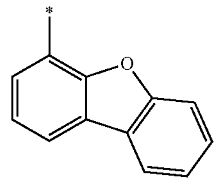
6-39
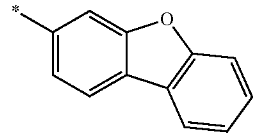
6-40
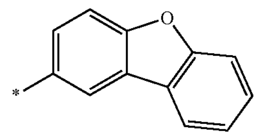
6-41
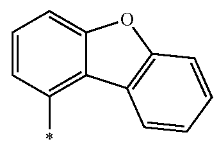
6-42
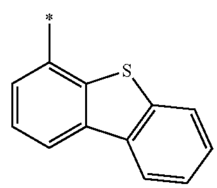
6-43
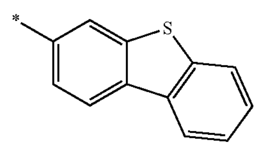
6-44
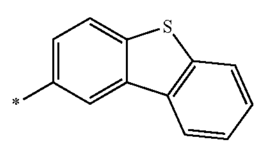
6-45
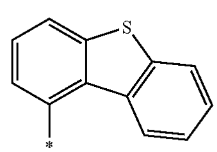
6-46
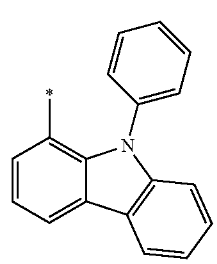

-continued
6-47
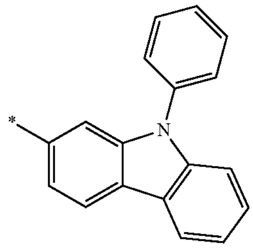
6-48
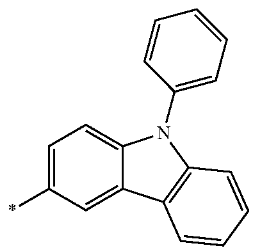
6-49
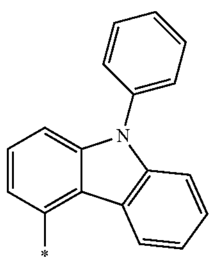
6-50
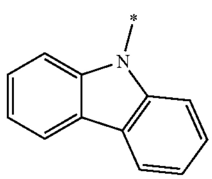
6-51
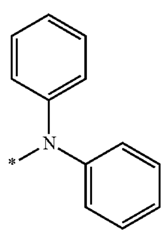
6-52
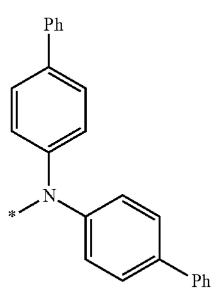
-continued
6-53
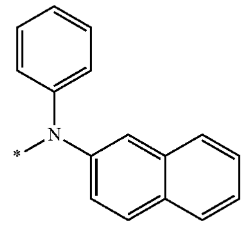
6-54
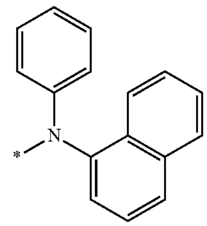
6-55
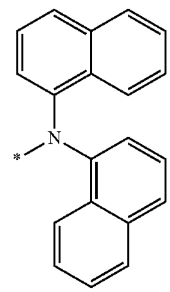
6-56
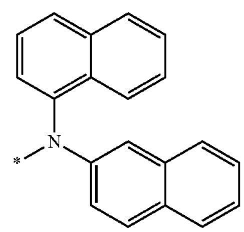
6-57
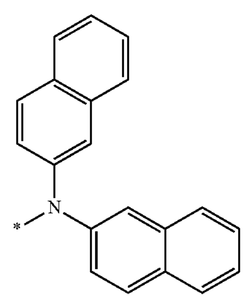
6-58
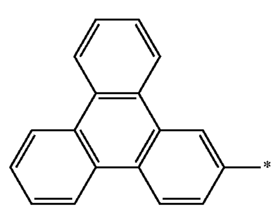

6-59
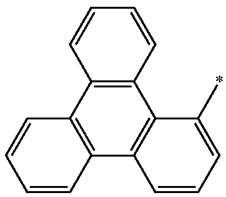
6-61
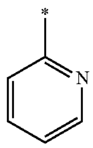
6-62
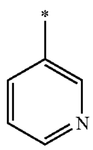
6-63
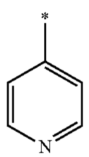
6-64
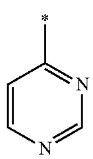
6-65
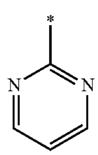
6-66
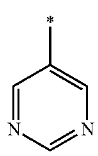
6-67
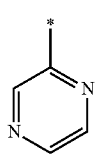
6-68
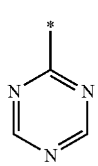
6-69
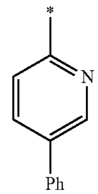
6-70
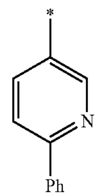
6-71
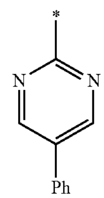
6-72
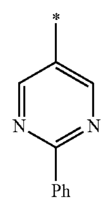
6-73
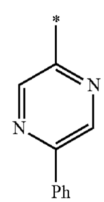
6-74
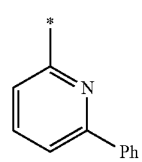
6-75
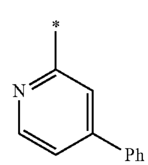
6-76
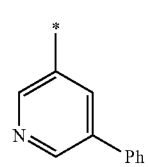

-continued
6-77
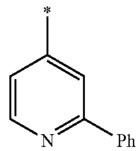
6-78
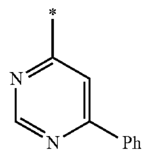
6-79
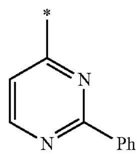
6-80
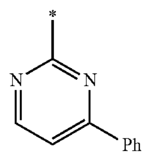
6-81
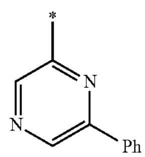
6-82
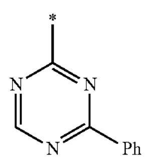
6-83
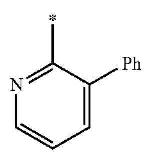
6-84
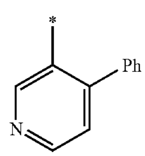
6-85
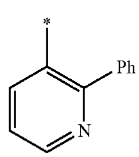
6-86
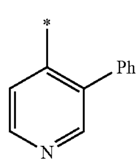
-continued
6-87
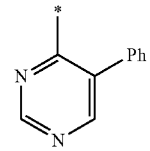
6-88
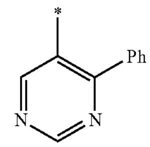
6-89
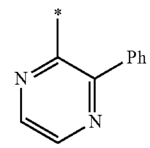
6-90
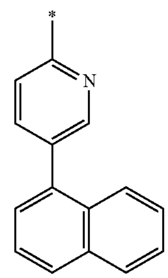
6-91
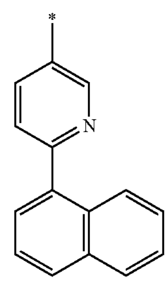
6-92
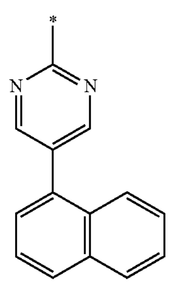
6-93
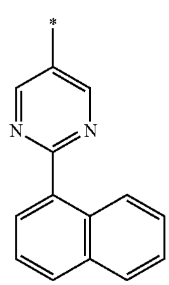

-continued
6-94
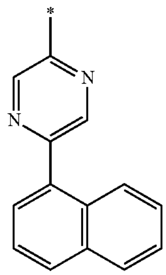
6-95
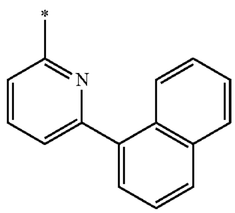
6-96
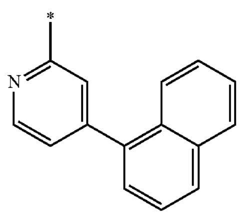
6-97
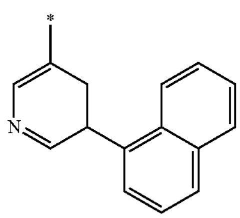
6-98
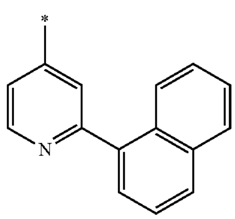
6-99
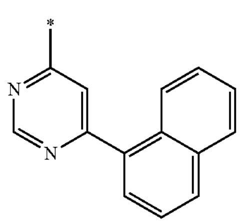
6-100
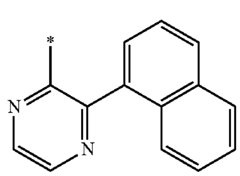
-continued
6-101
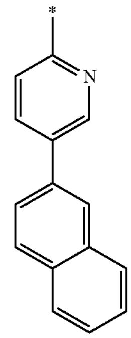
6-102
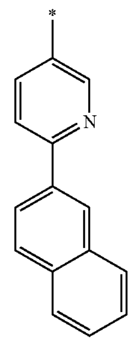
6-103
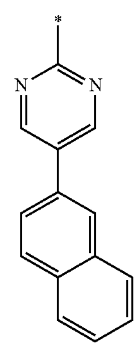
6-104
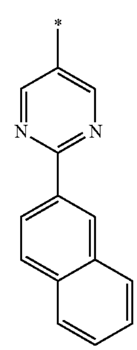

-continued
6-105
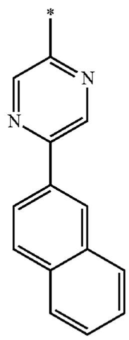
6-106
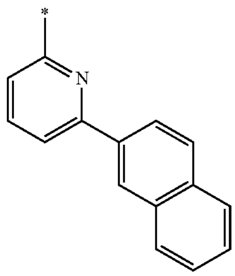
6-107
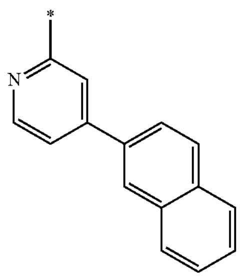
6-108
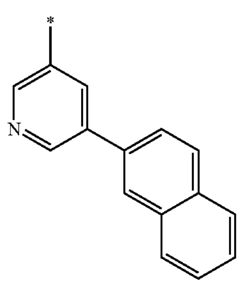
6-109
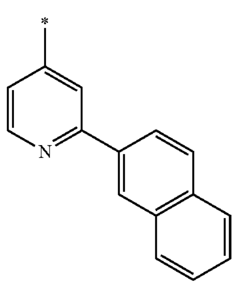
-continued
6-110
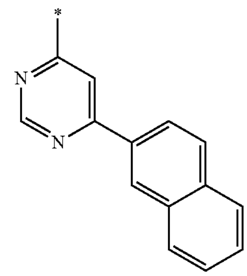
6-111
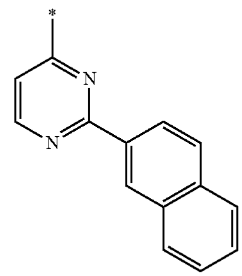
6-112
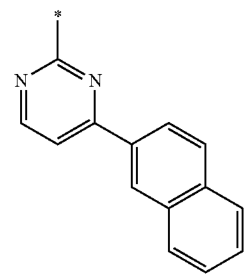
6-113
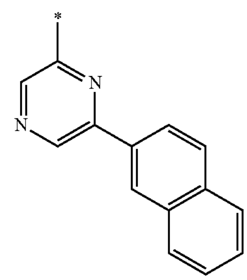
6-114
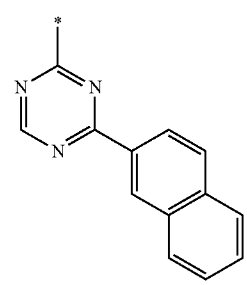
6-115
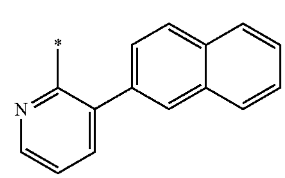

-continued
6-116
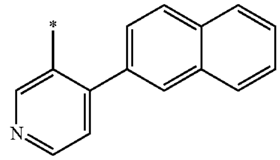
6-117
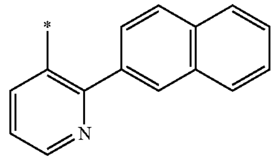
6-118
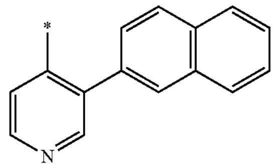
6-119
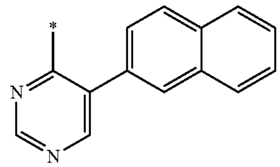
6-120
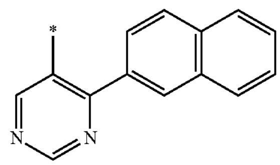
6-121
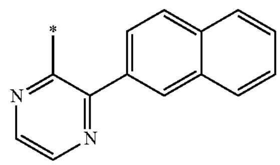
6-122
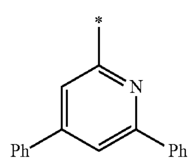
6-123
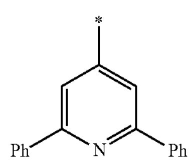
6-124
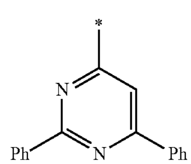
-continued
6-125
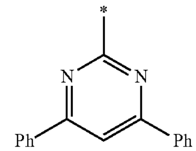
6-126
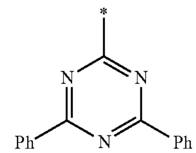
6-127
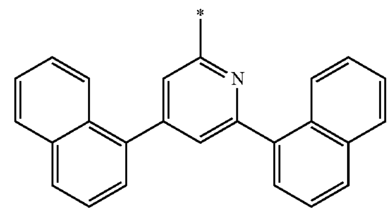
6-128
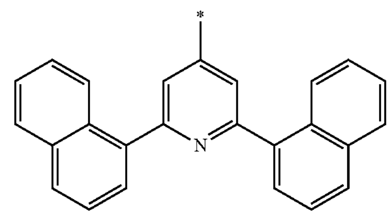
6-129
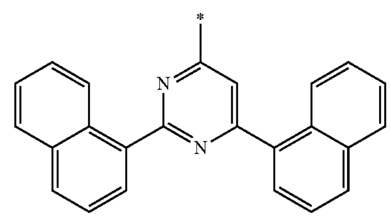
6-130
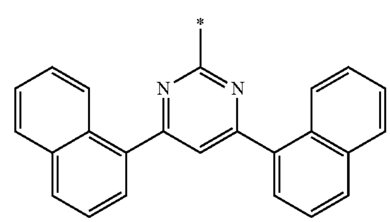
6-131
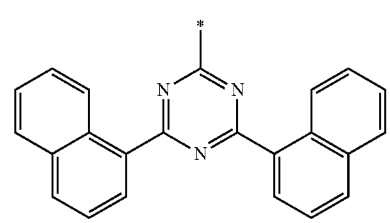

-continued
6-132
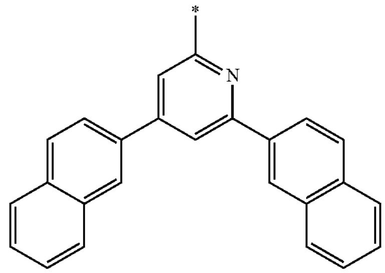
6-133
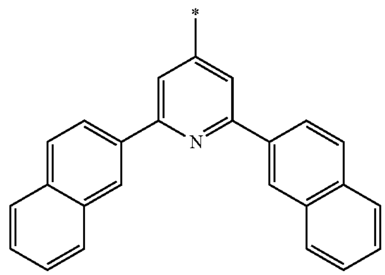
6-134
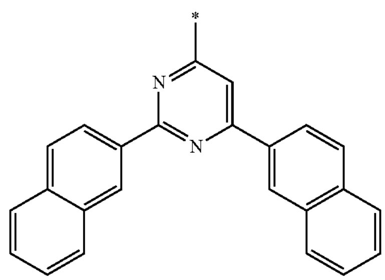
6-135
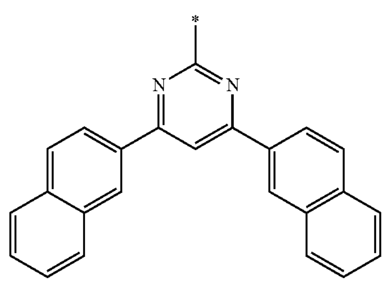
6-136
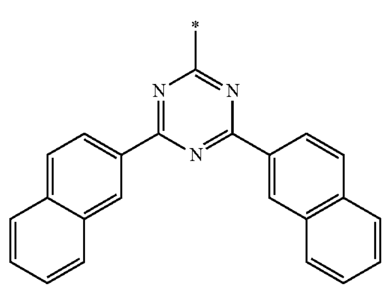
-continued
6-137
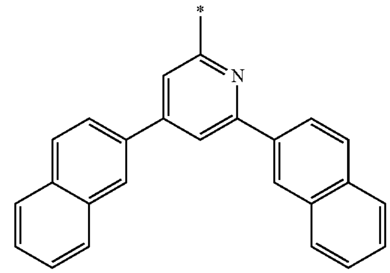
6-138
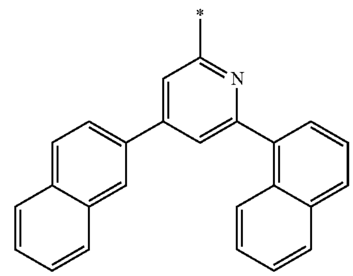
6-139
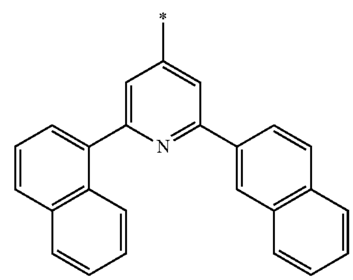
6-140
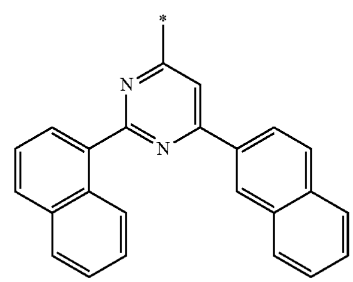
6-141
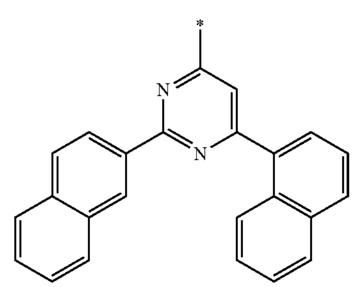

-continued
6-142
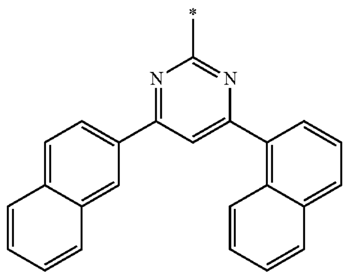
6-143
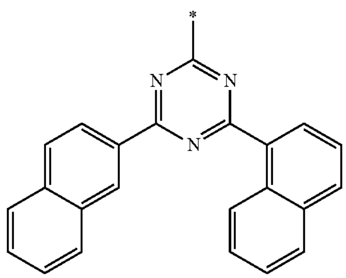
6-144
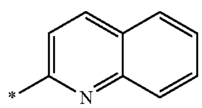
6-145
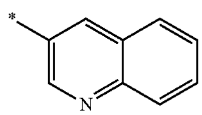
6-146
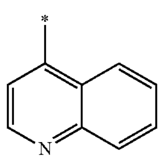
6-147
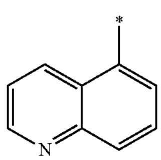
6-148
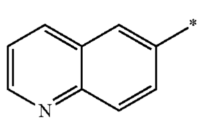
6-149
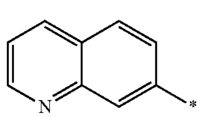
6-150
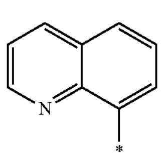
-continued
6-151
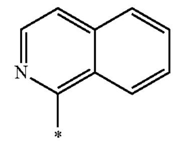
6-152
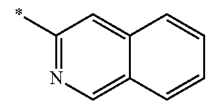
6-153
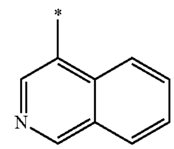
6-154
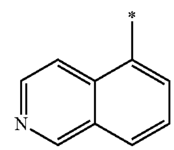
6-155
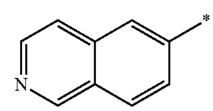
6-156
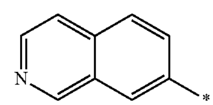
6-157
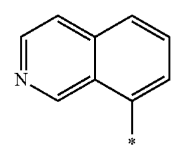
6-158
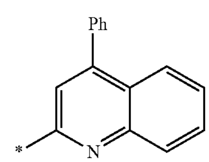
6-159
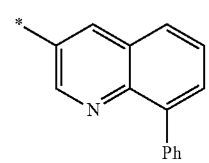
6-160
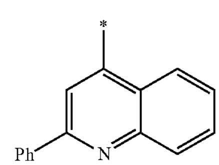
6-161
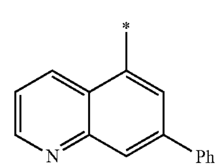

-continued
6-162
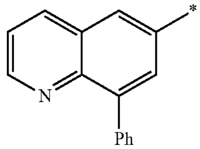
6-163
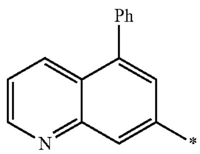
6-164
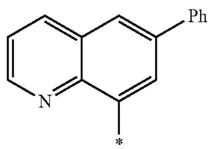
6-165
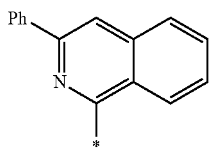
6-166
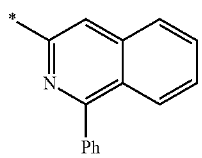
6-167
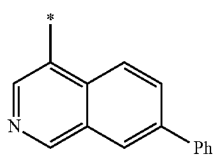
6-168
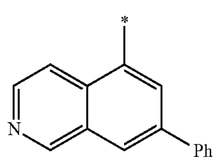
6-169
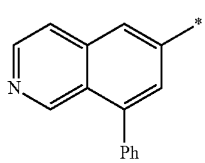
6-170
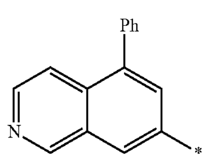
6-171
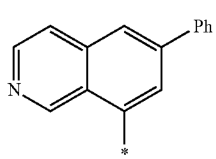
-continued
6-172
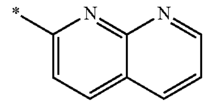
6-173
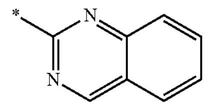
6-174
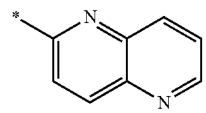
6-175
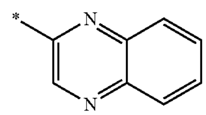
6-176
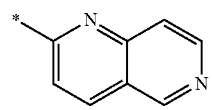
6-177
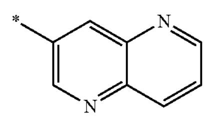
6-178
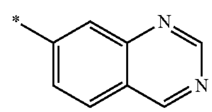
6-179
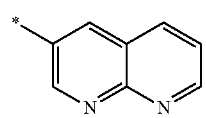
6-180
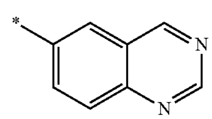
6-181
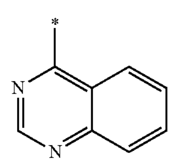
6-182
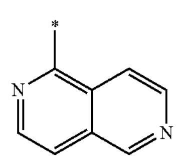
6-183
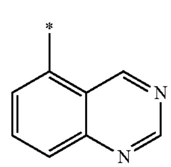

-continued
6-184
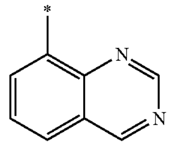
6-185
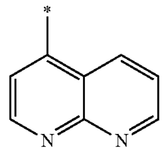
6-186
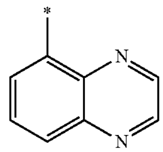
6-187
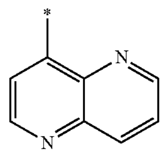
6-188
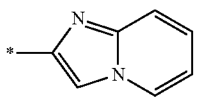
6-189
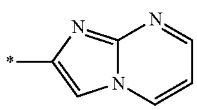
6-190
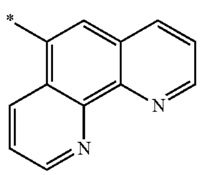
6-191
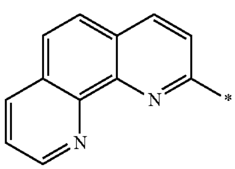
6-192
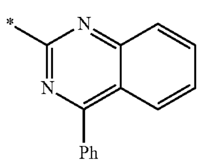
6-193
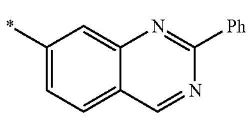
6-194
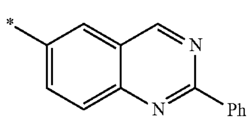
-continued
6-195
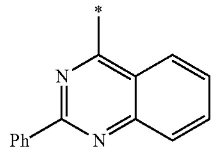
6-196
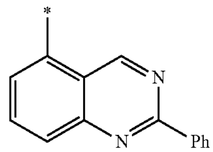
6-197
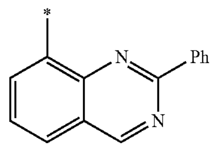
6-198
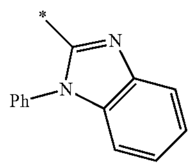
6-199
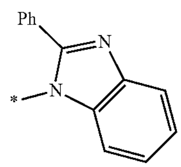
6-200
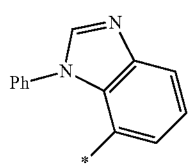
6-201
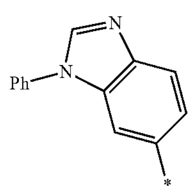
6-202
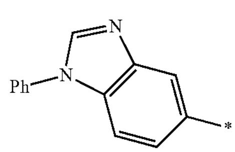
6-203
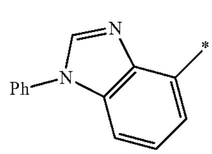

-continued
6-204
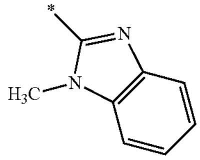
6-205
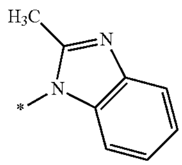
6-206
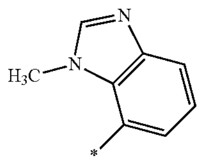
6-207
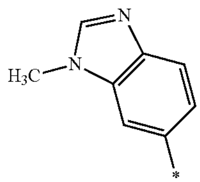
6-208
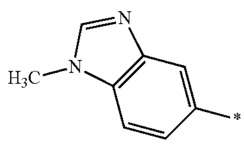
6-209
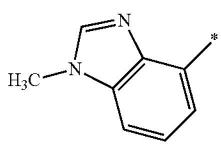
6-210
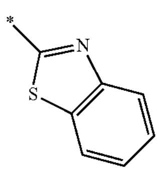
6-211
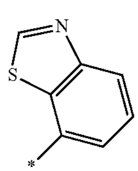
6-212
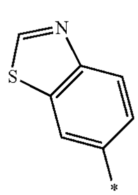
-continued
6-213
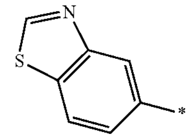
6-214
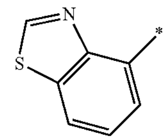
6-215
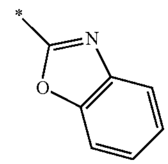
6-216
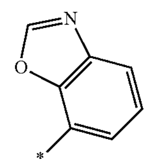
6-217
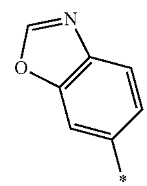
6-218
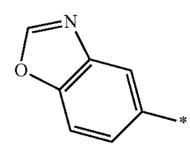
6-219
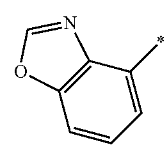
In Formulae 6-1 to 6-59 and 6-61 to 6-219,
t-Bu indicates a tert-butyl group,
Ph indicates a phenyl group, and
* indicates a binding site to an adjacent atom.
In Formula 11, b111 may be selected from 1, 2, and 3.
In Formula 11, n111 may be selected from 1, 2, 3, and 4.
For example, the Host I may be selected from compounds below, but the Host I is not limited thereto:

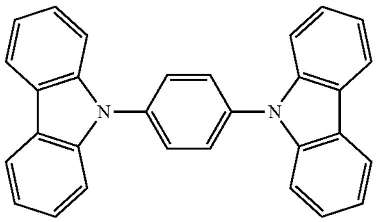
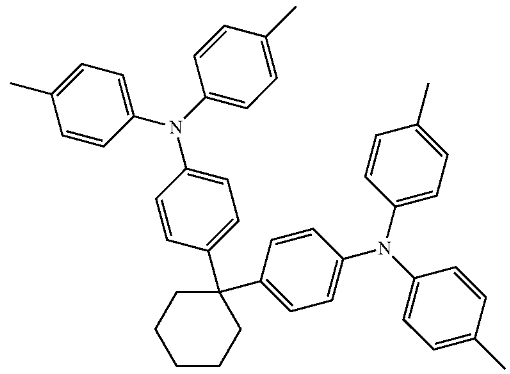
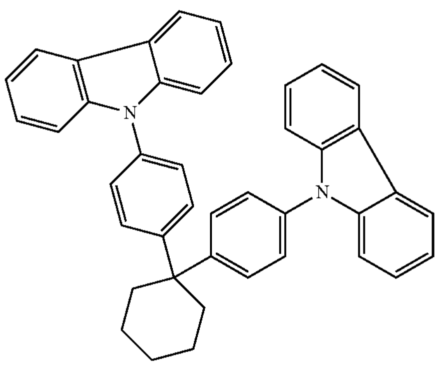
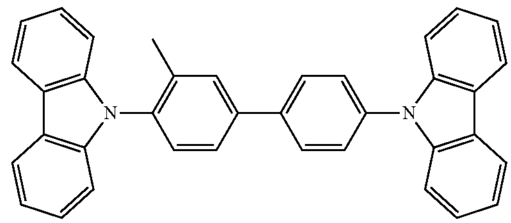
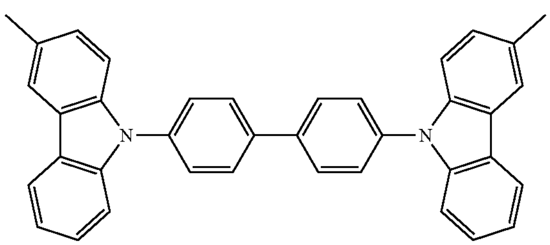
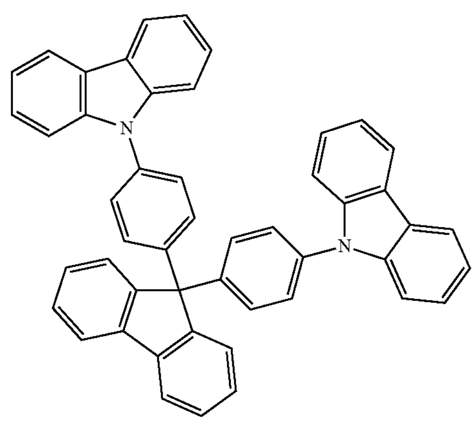
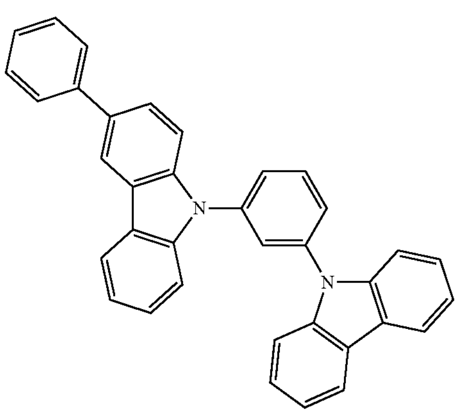
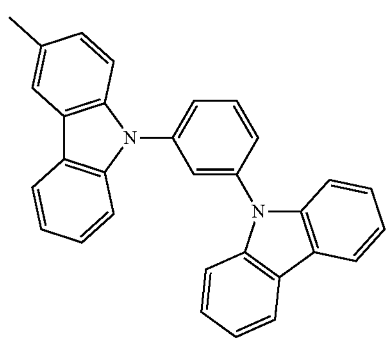

-continued
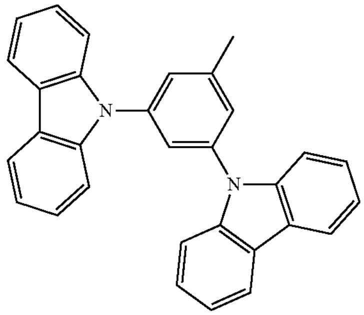
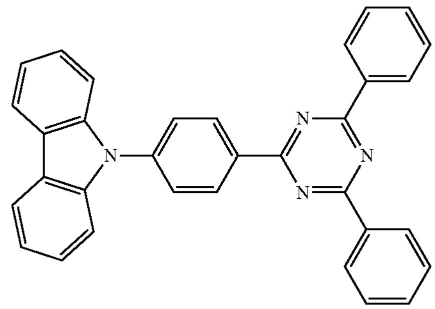
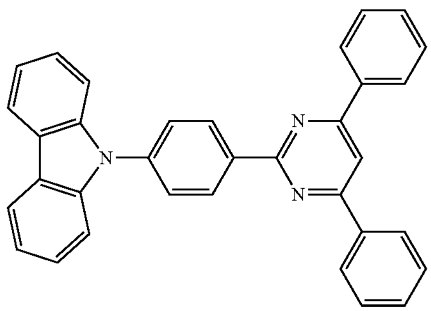
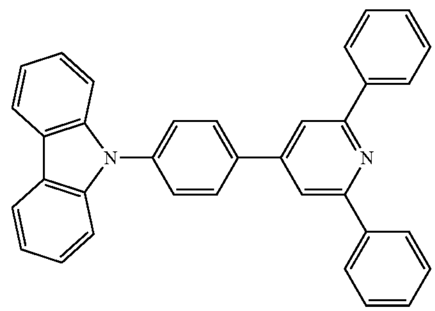
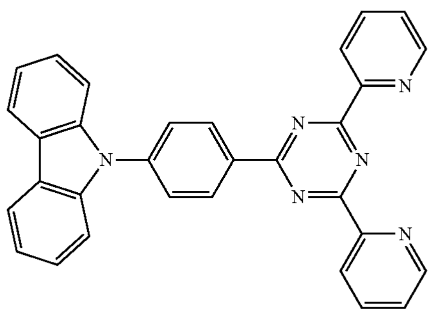
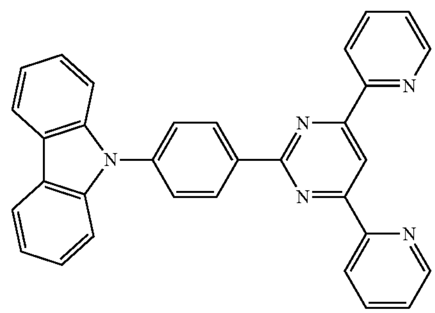
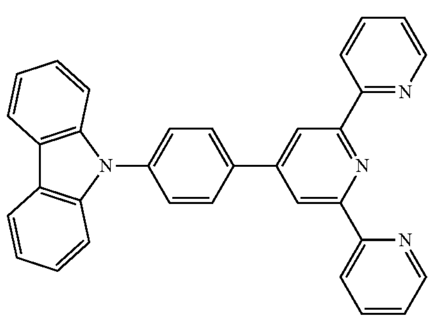
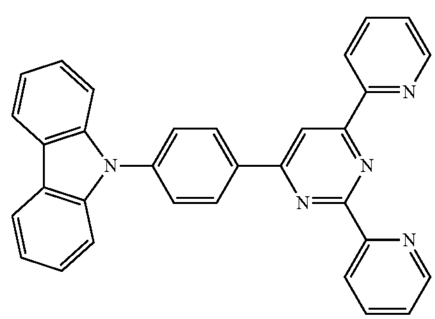
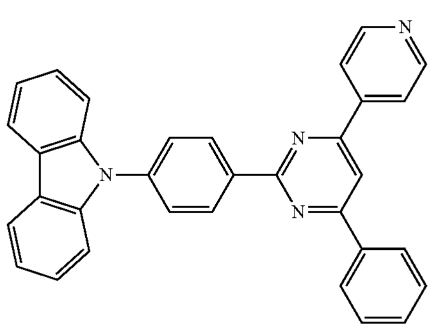
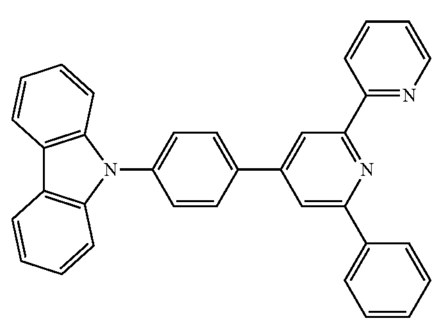

-continued
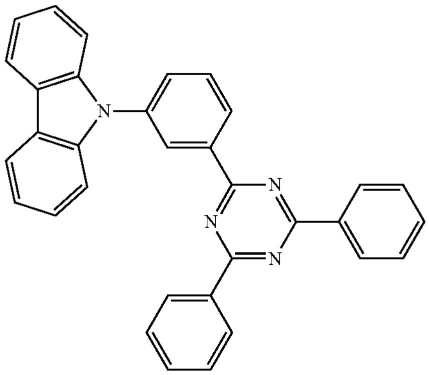
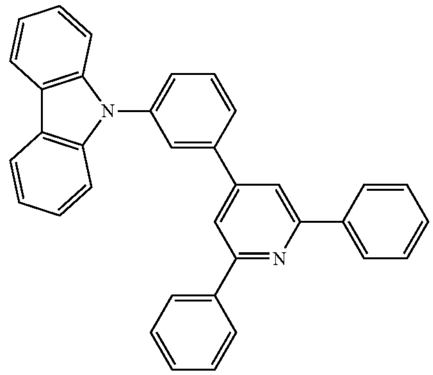
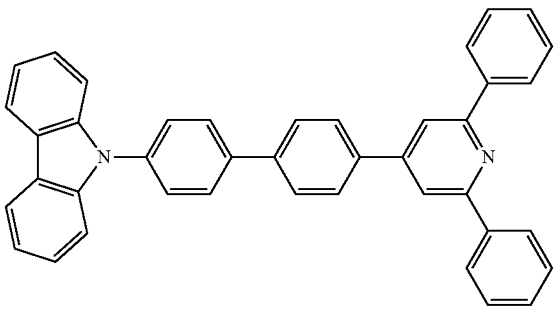
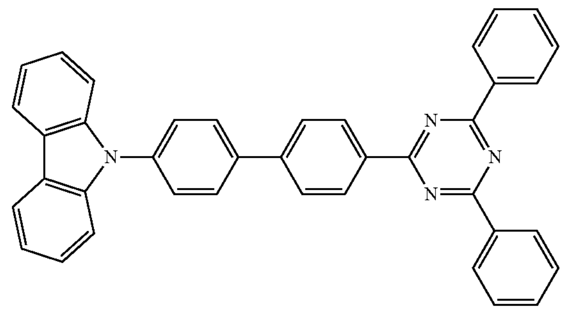
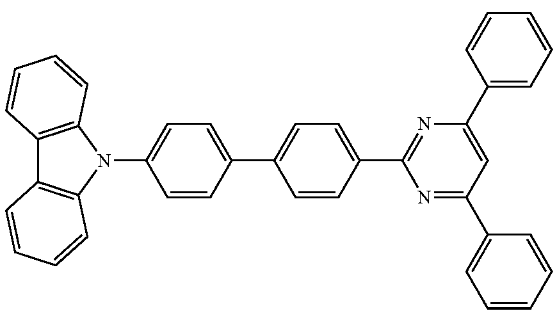
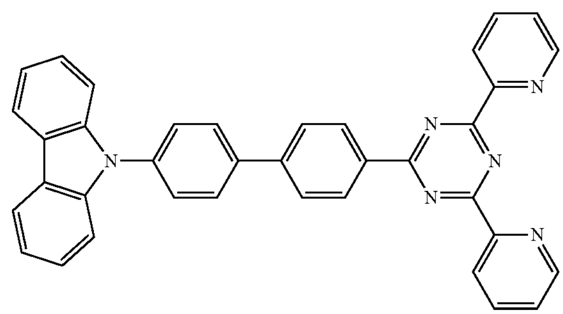
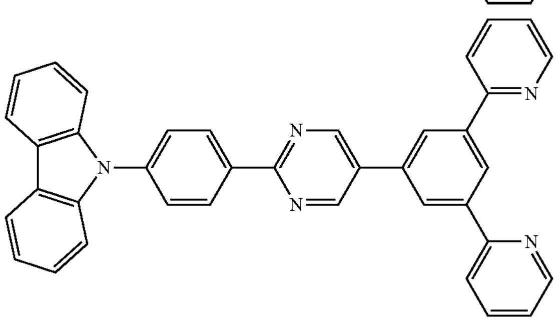
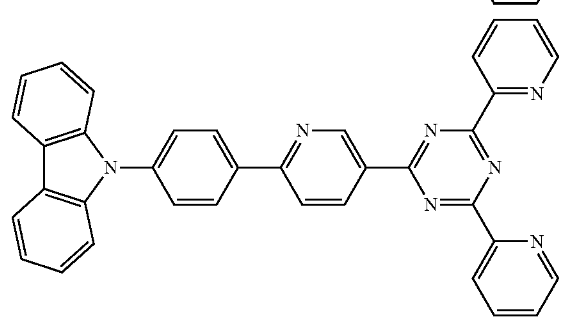
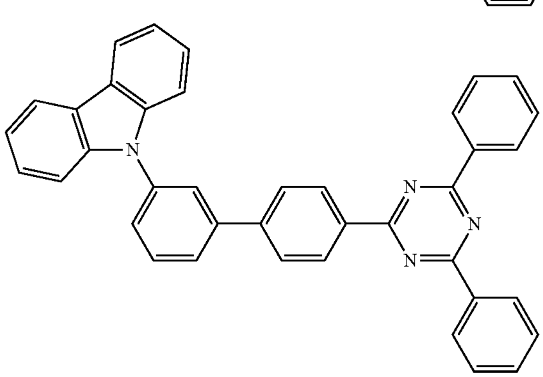
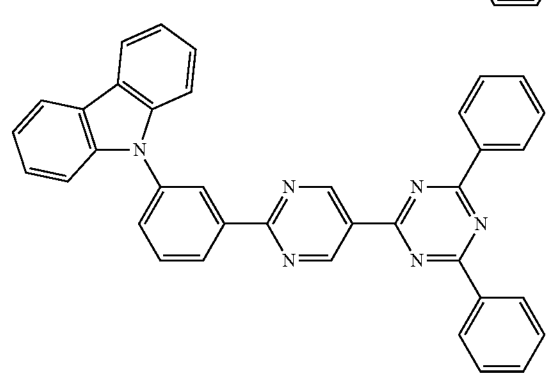

-continued
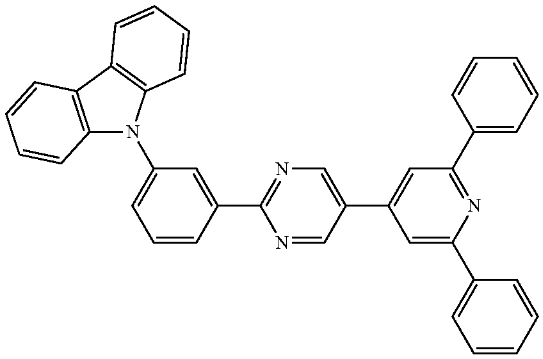
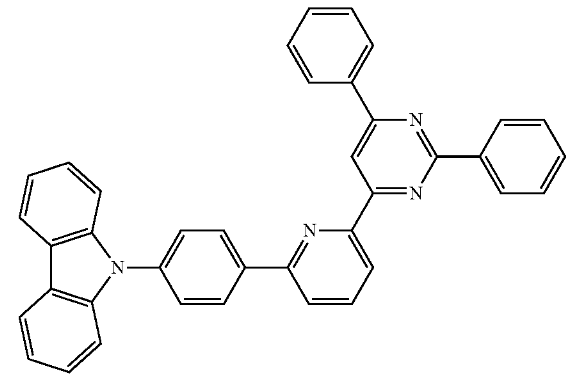
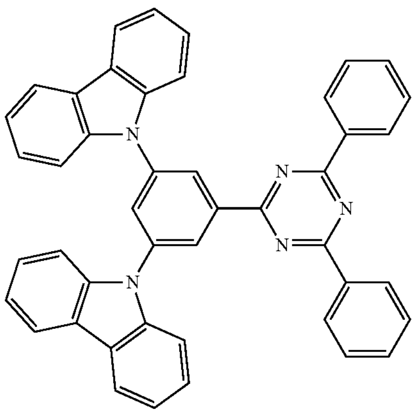
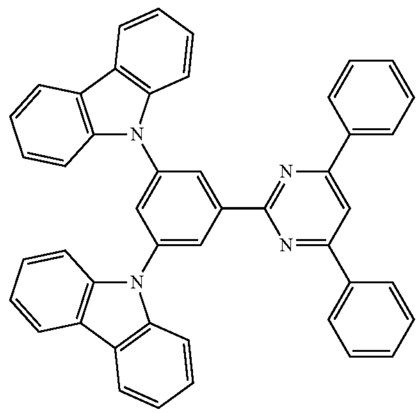
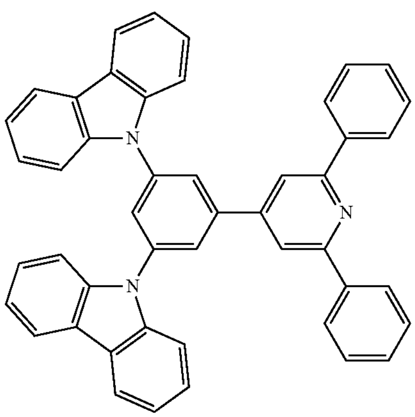
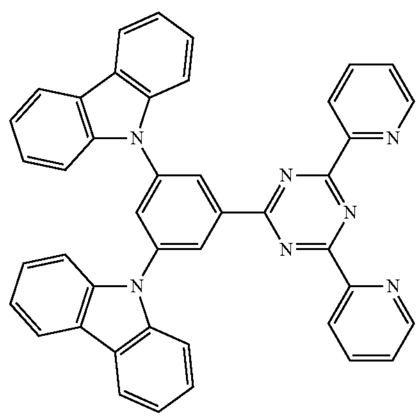
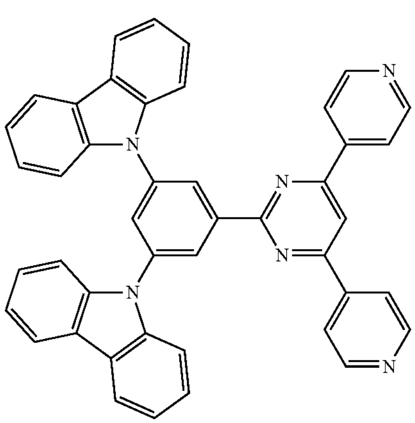
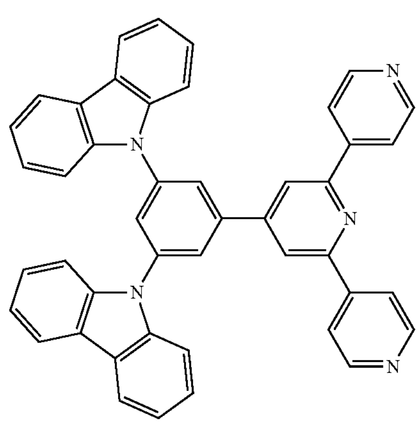

-continued
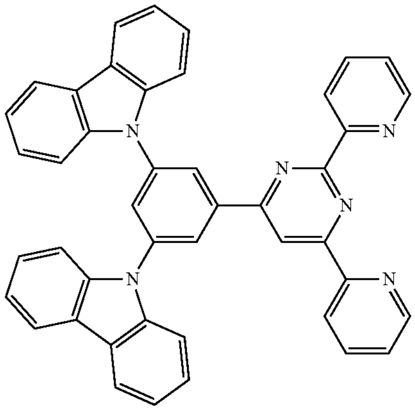
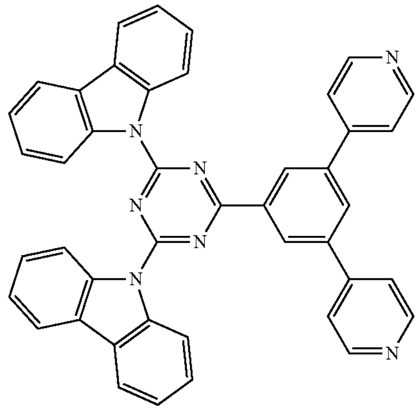
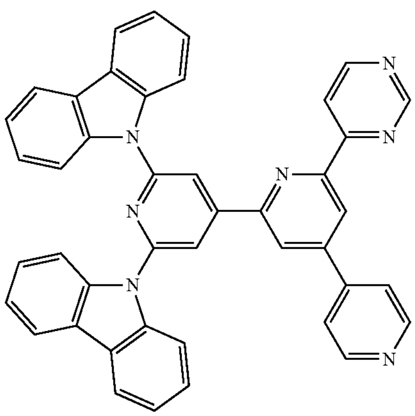
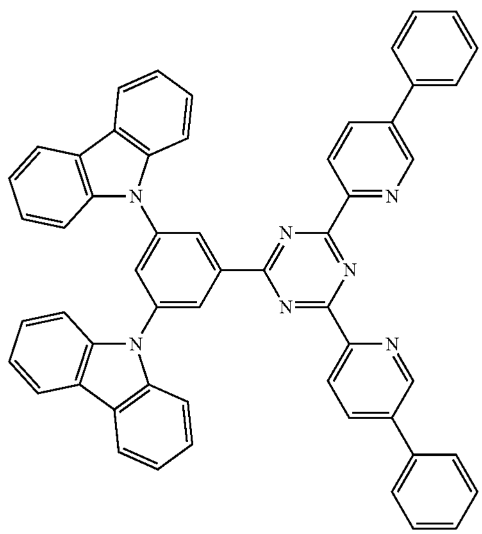
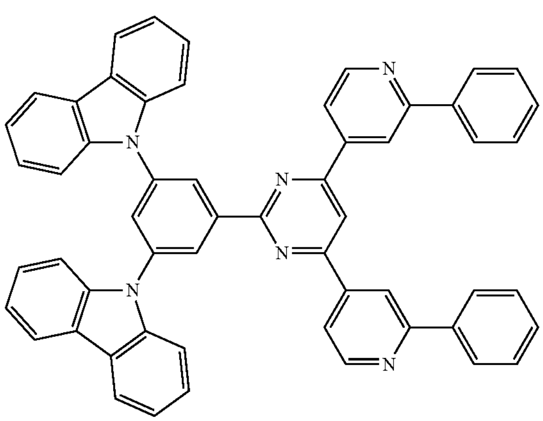
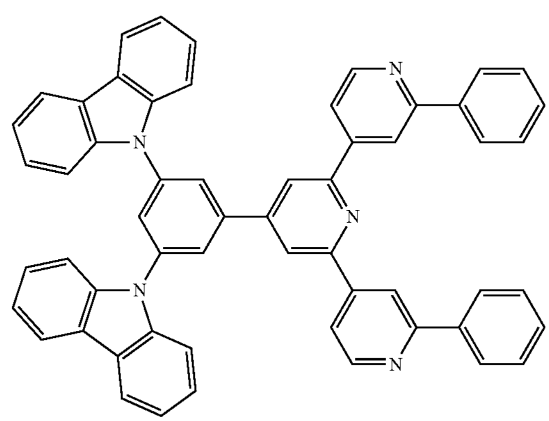

-continued
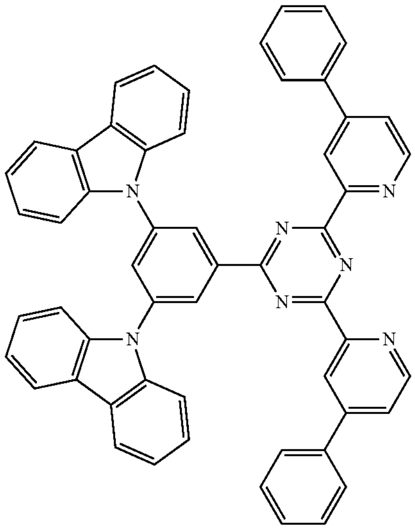
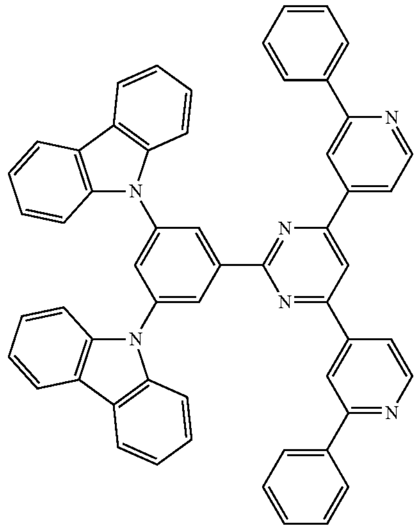
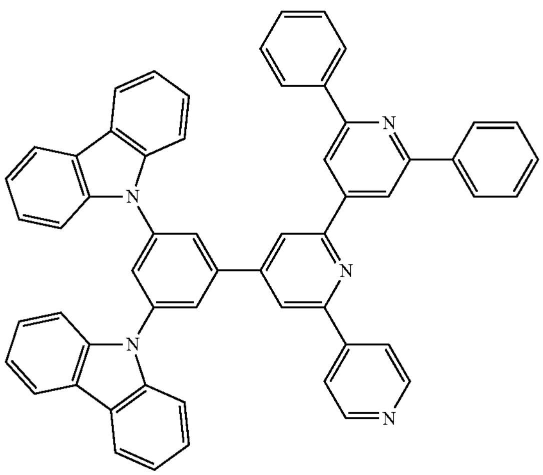
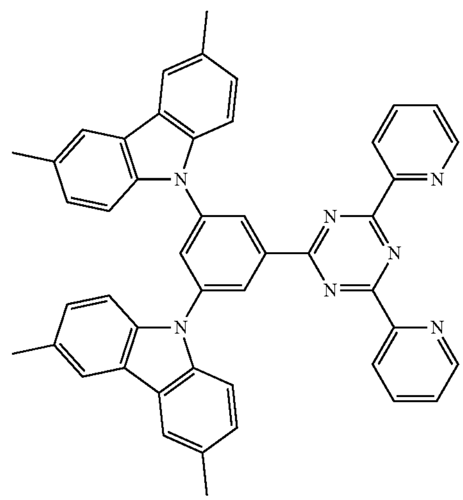
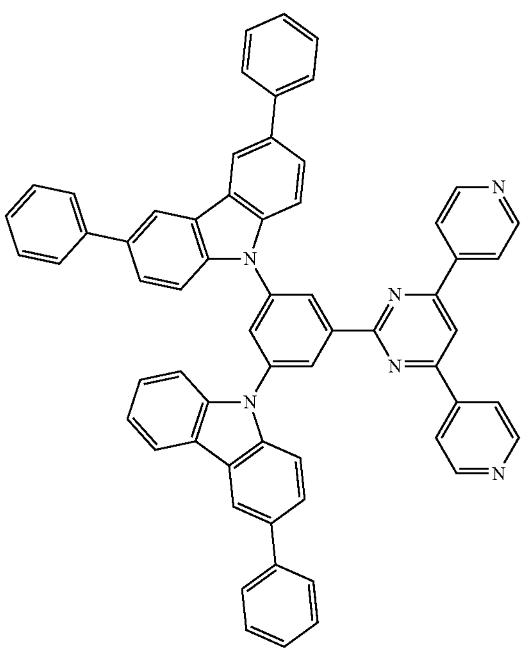
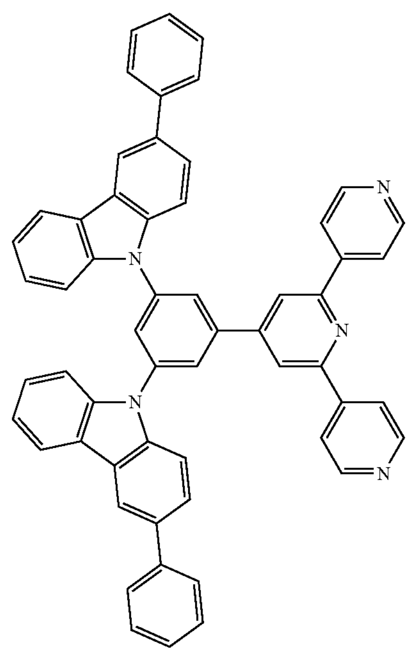

-continued
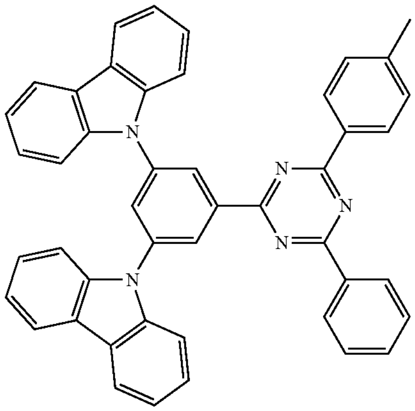
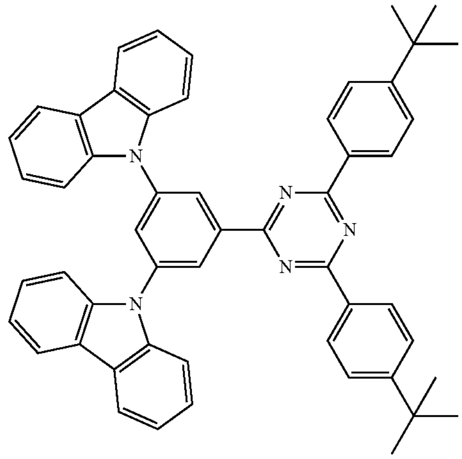
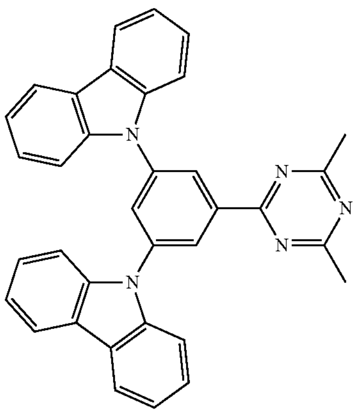
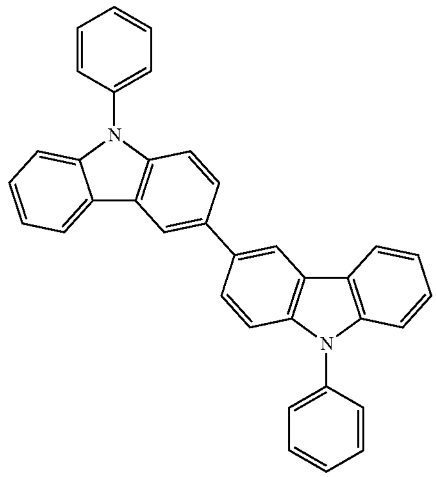
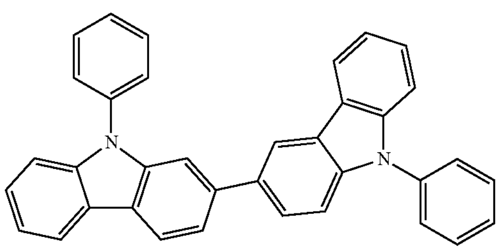
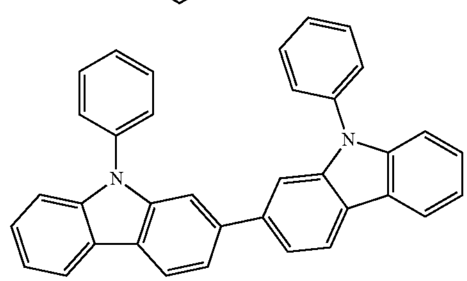
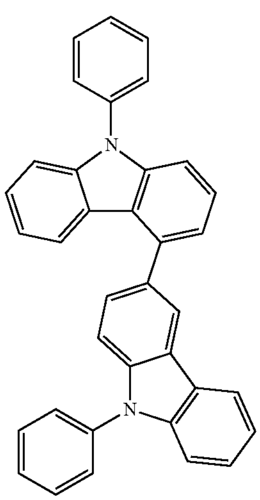
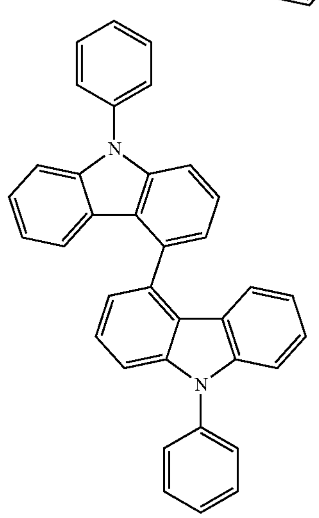
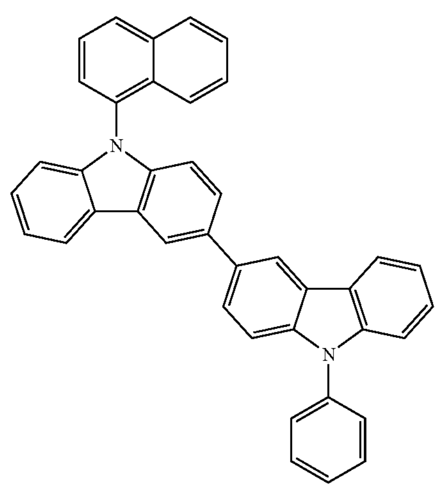

-continued
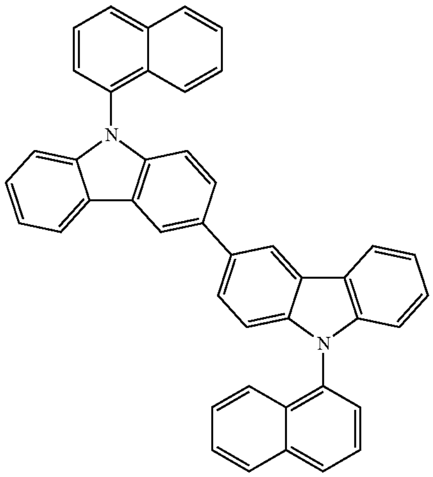
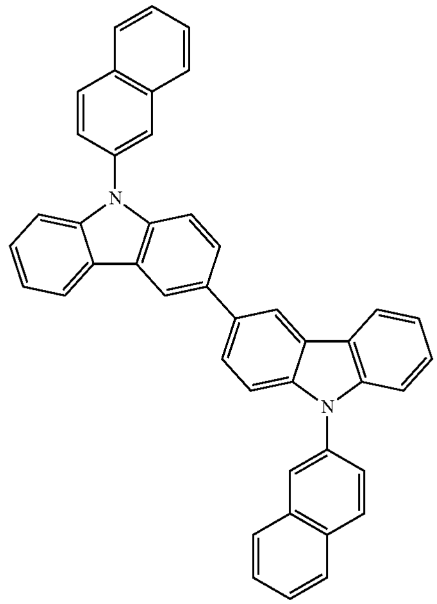
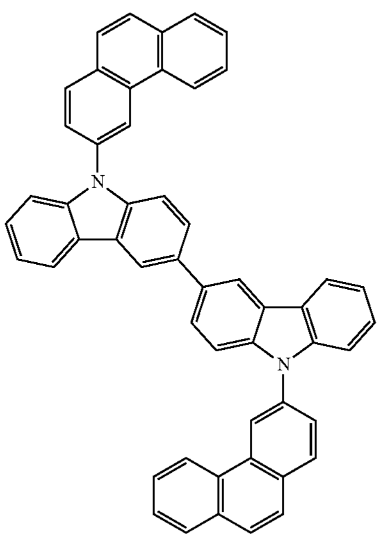
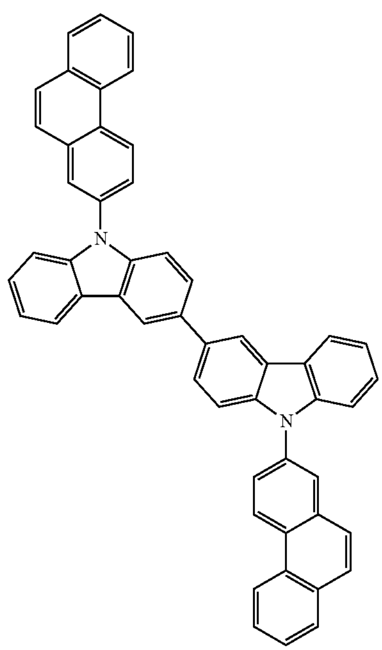

-continued
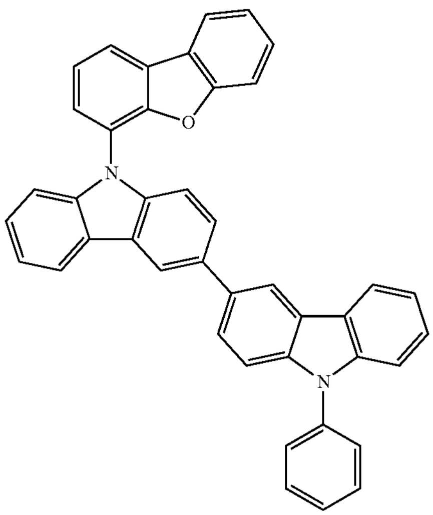
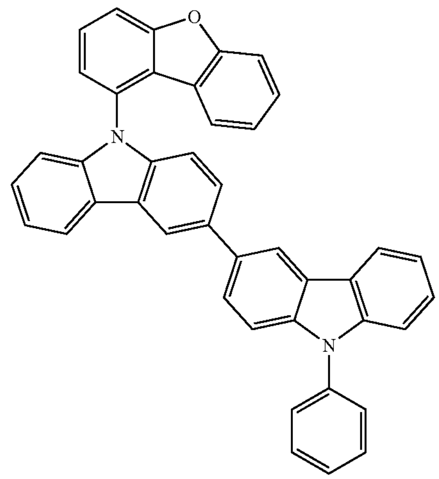
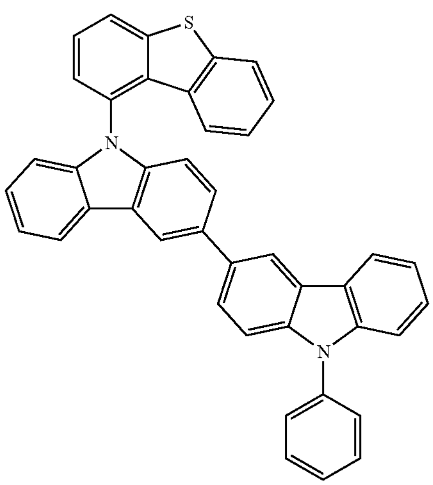
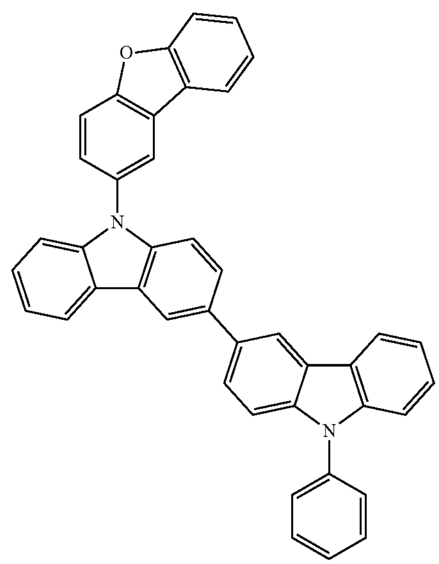
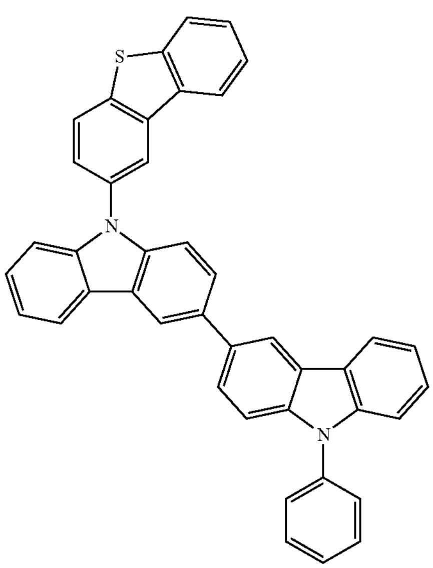
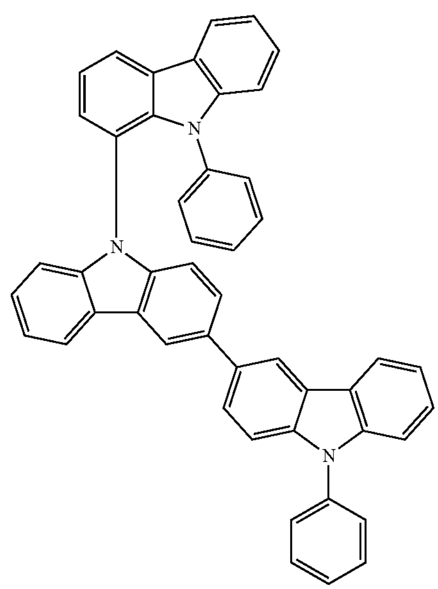

-continued
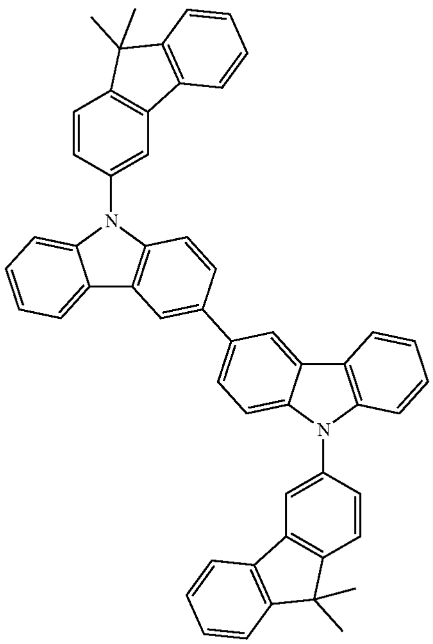
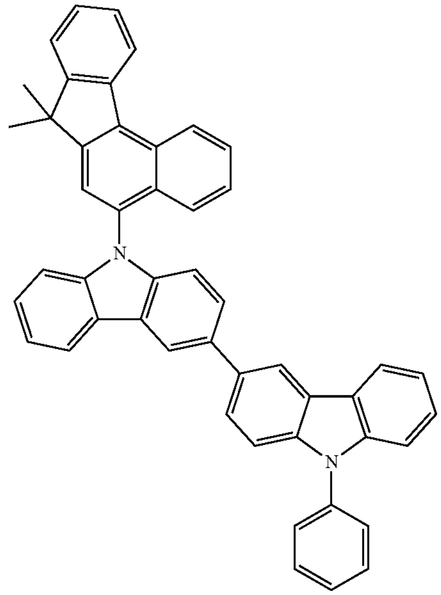
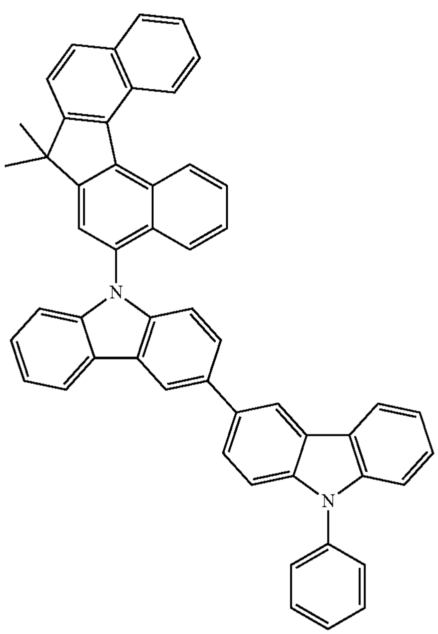
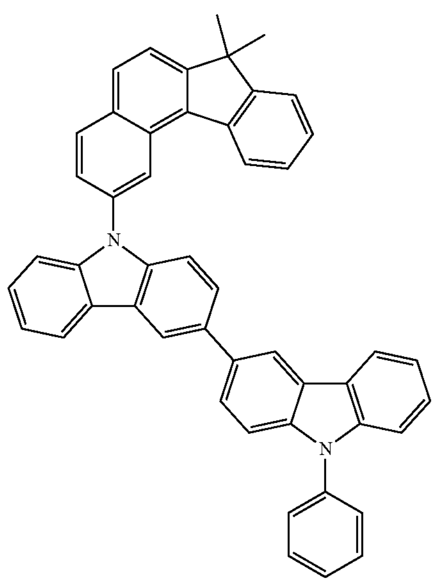

-continued
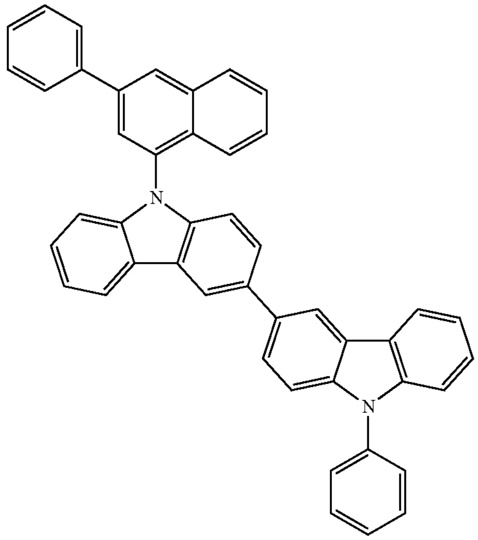
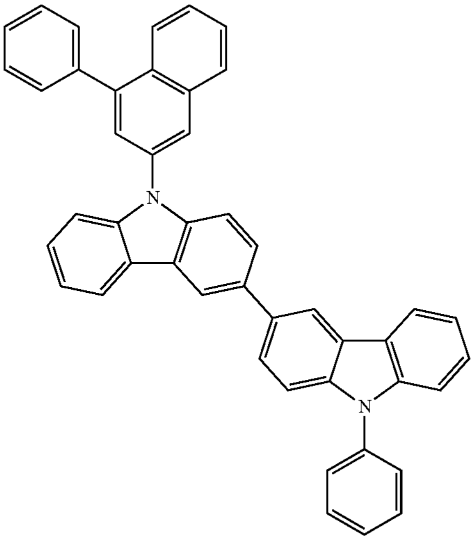
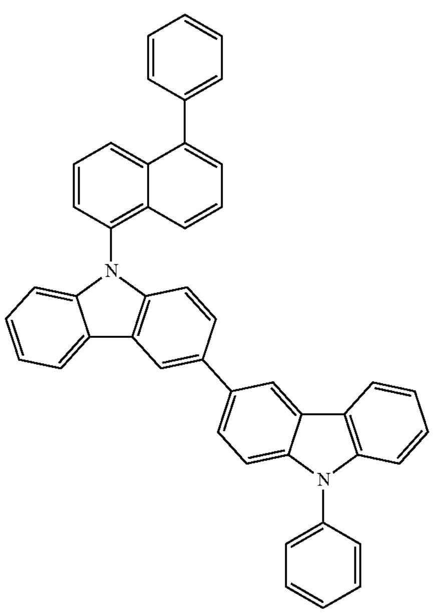
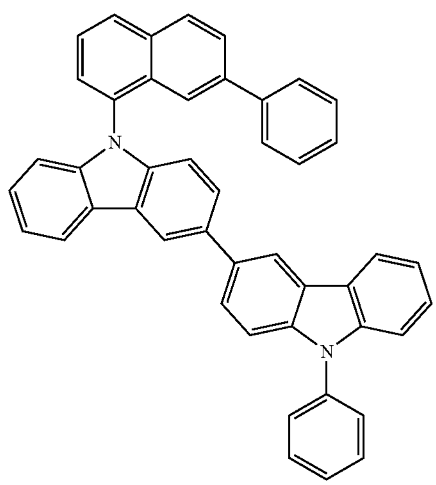

-continued
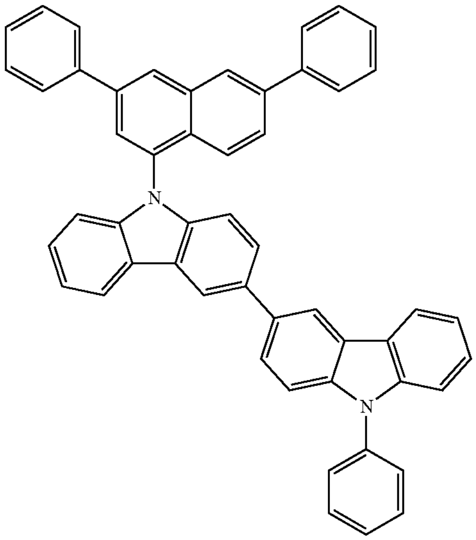
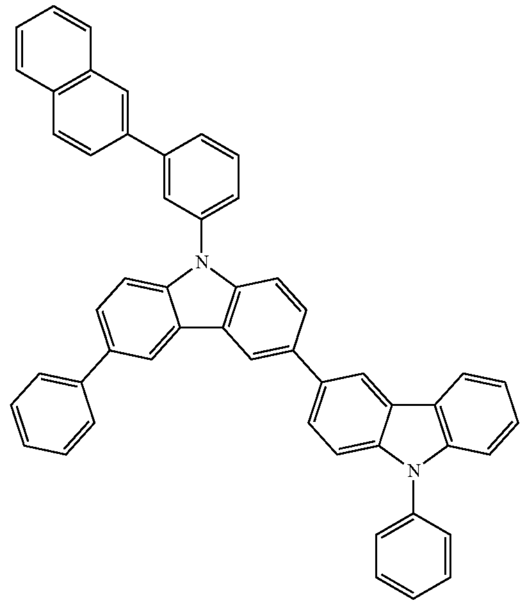
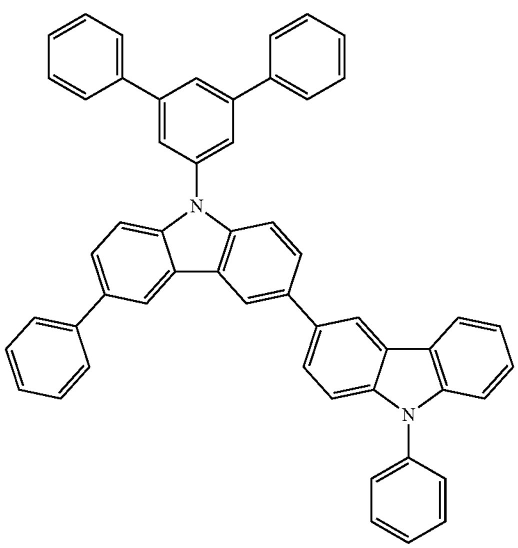
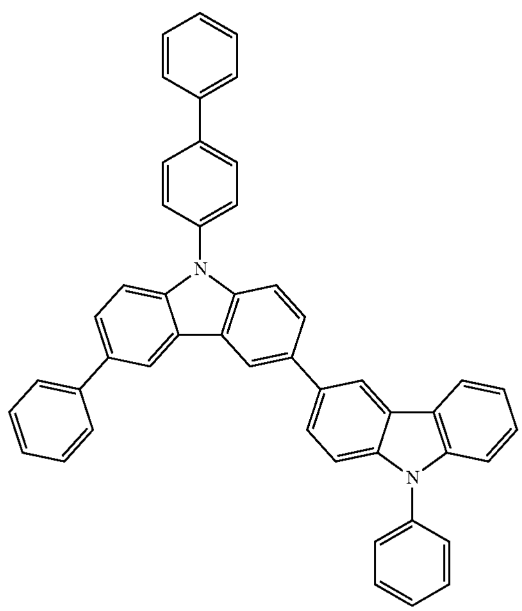

-continued
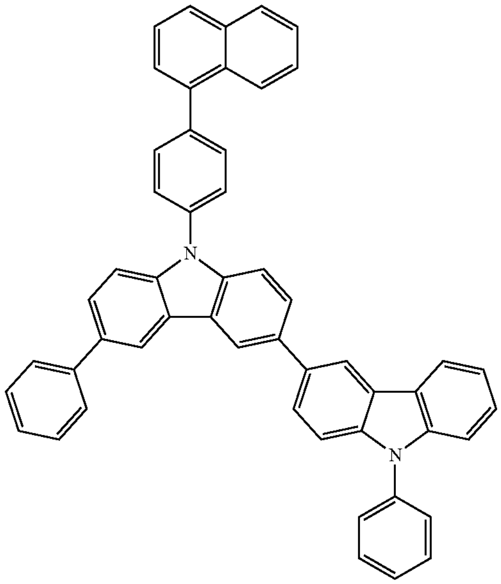
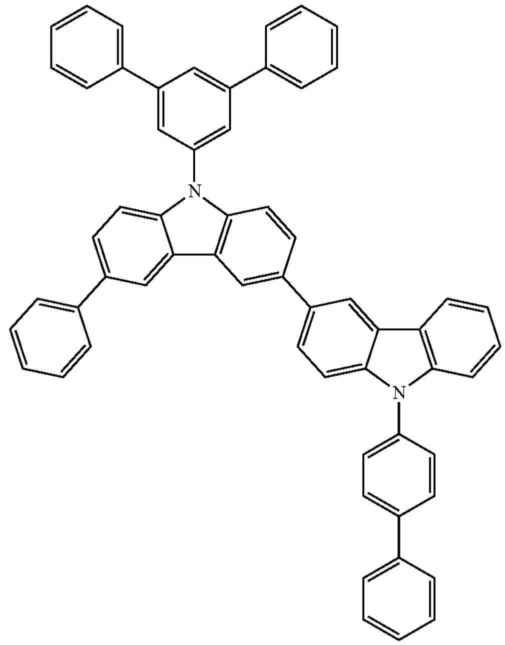
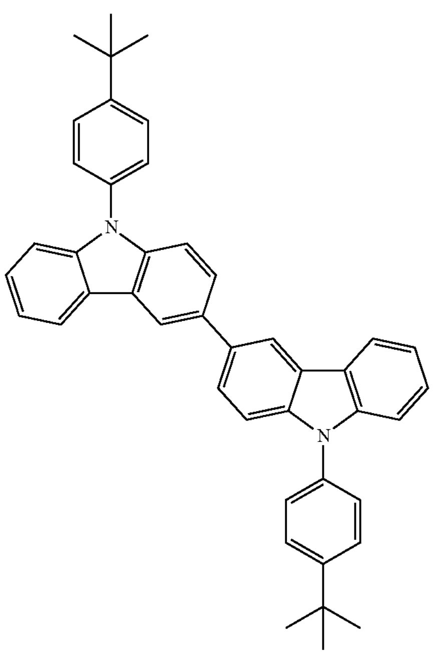
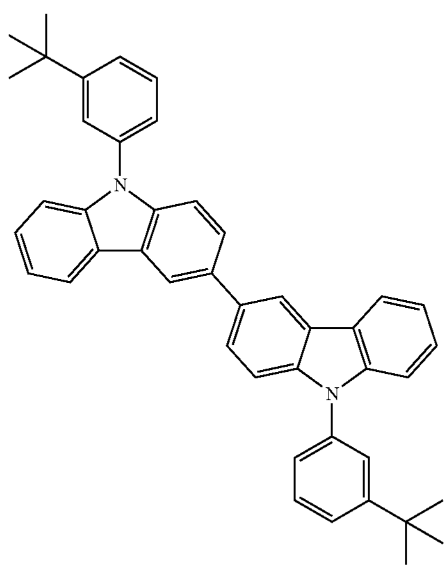

-continued
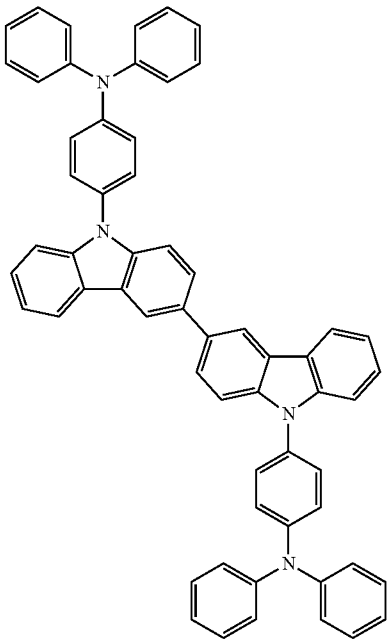
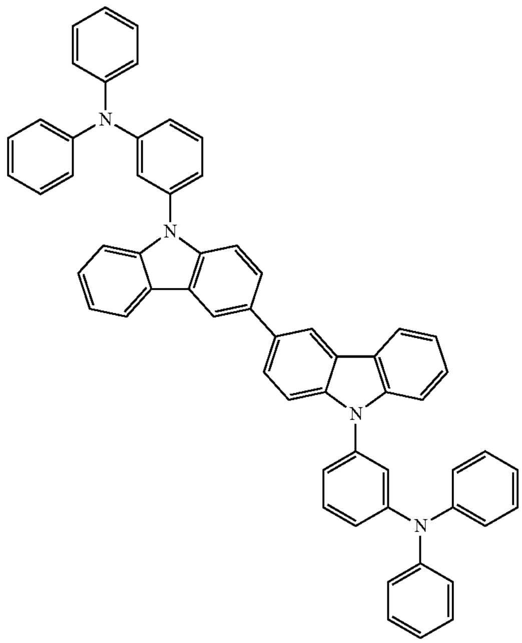
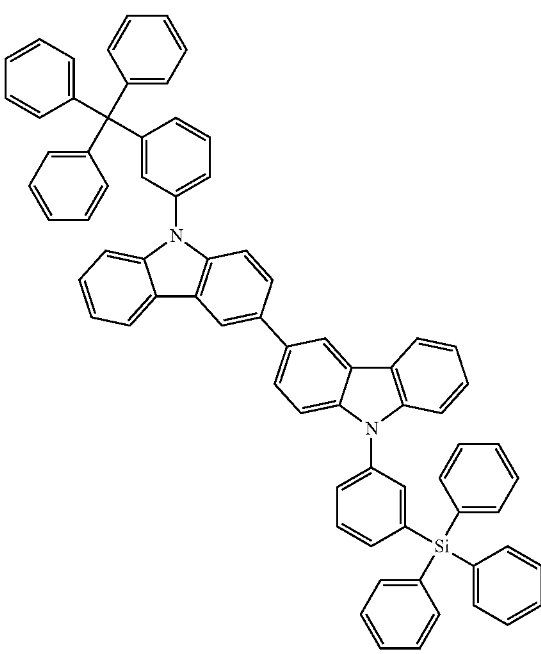
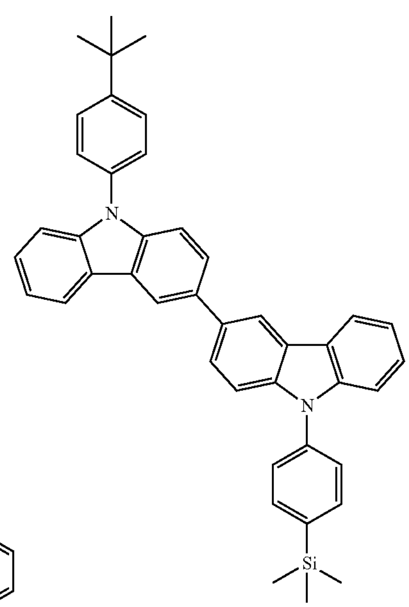

-continued
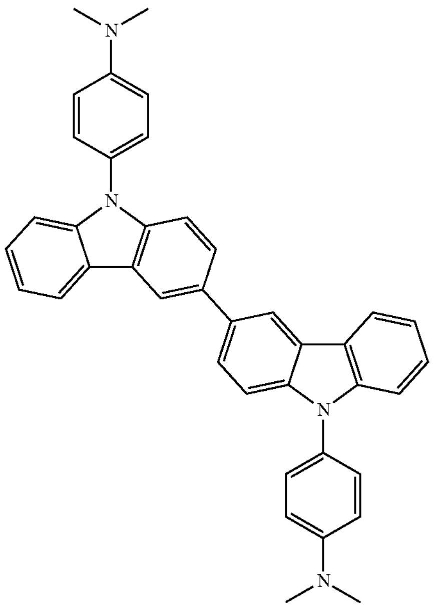
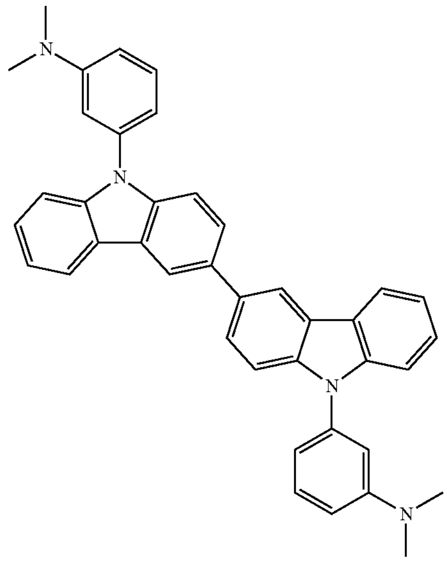
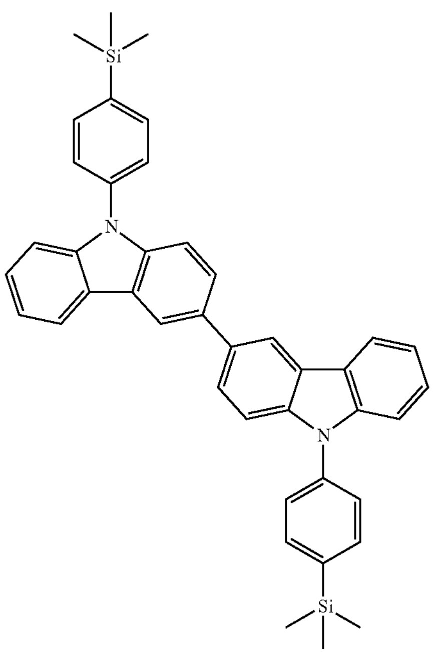
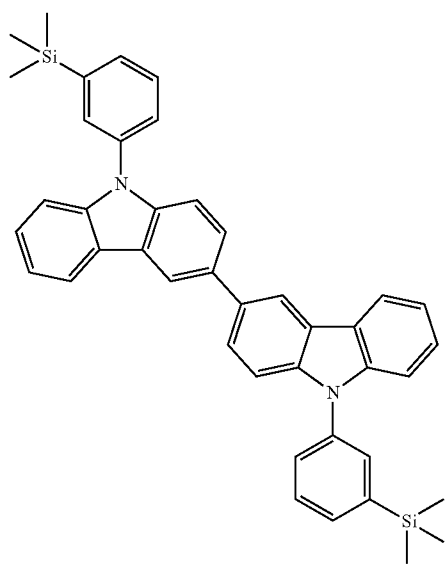

-continued
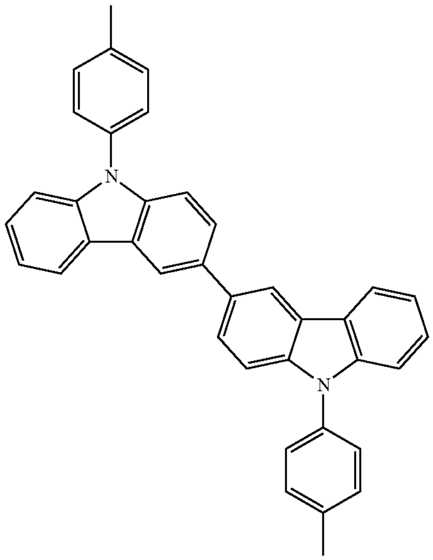
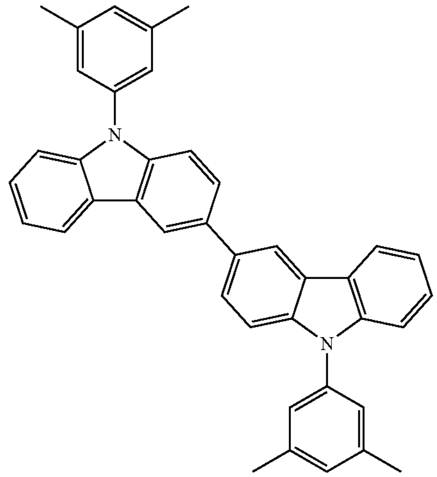
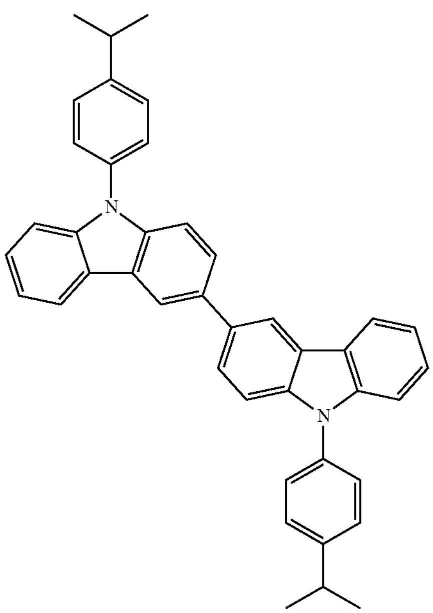
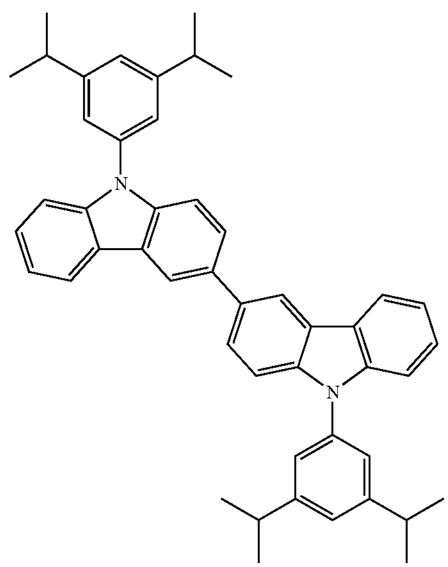

-continued
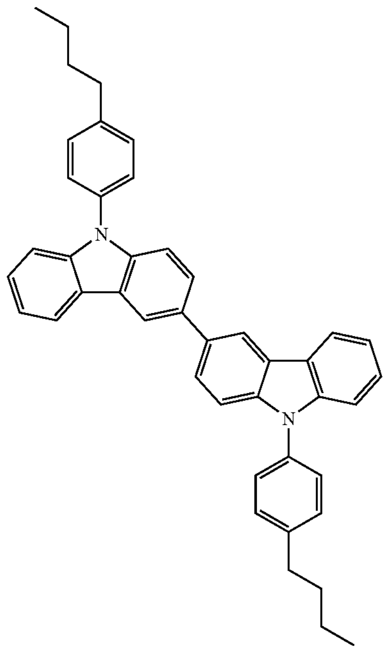
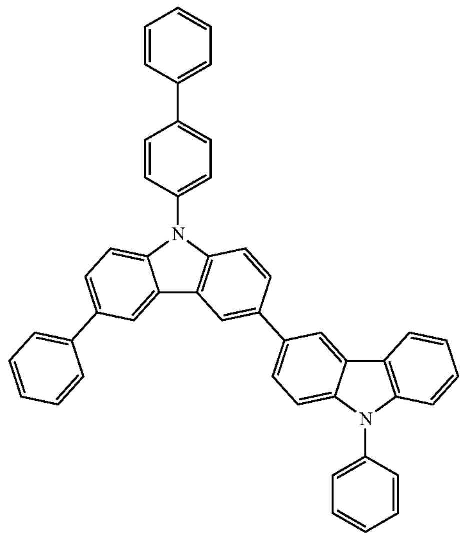
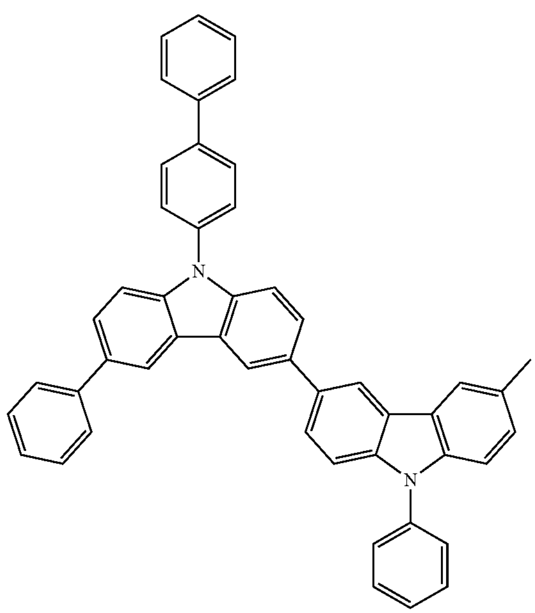
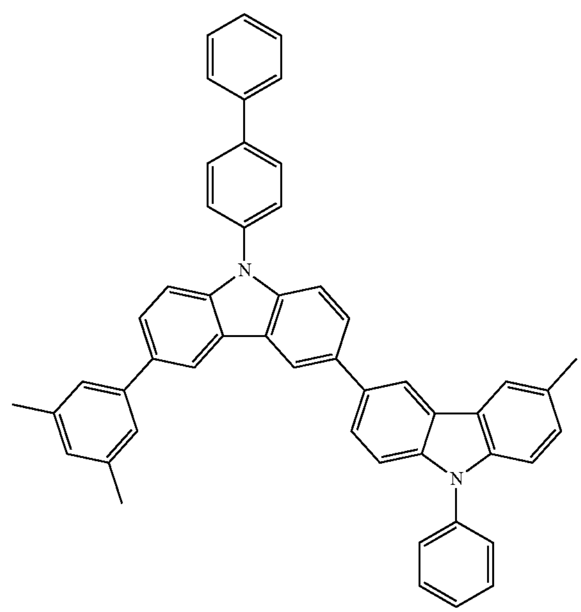

-continued
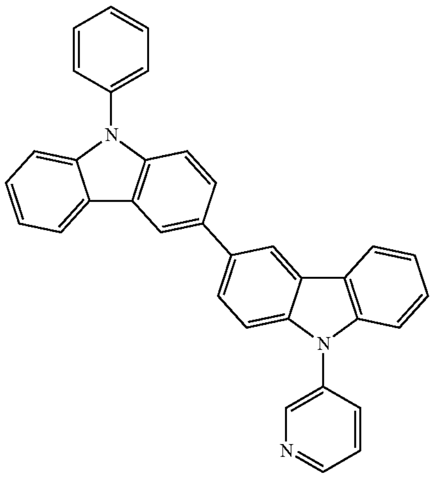
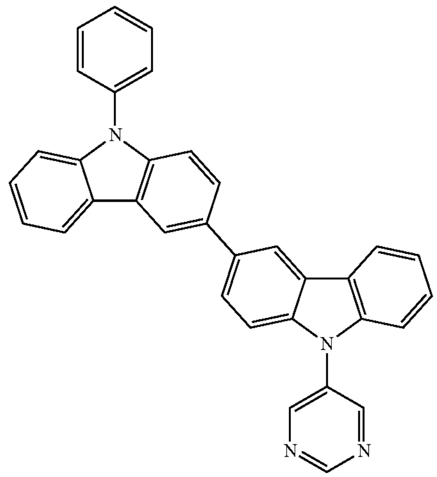
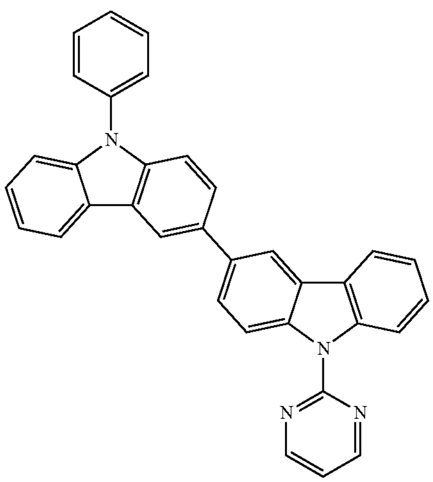
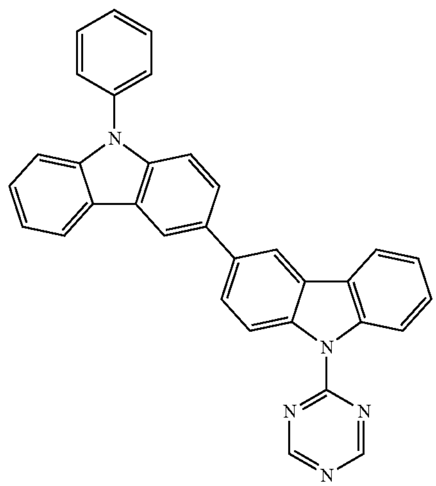
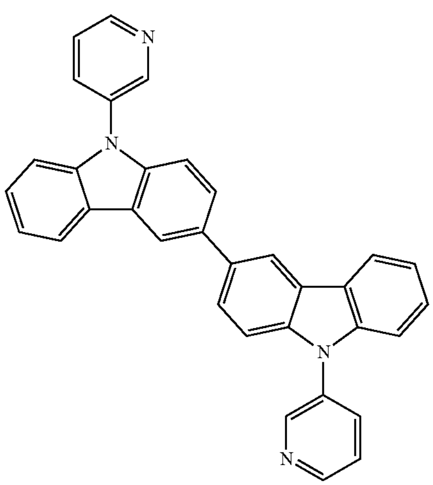
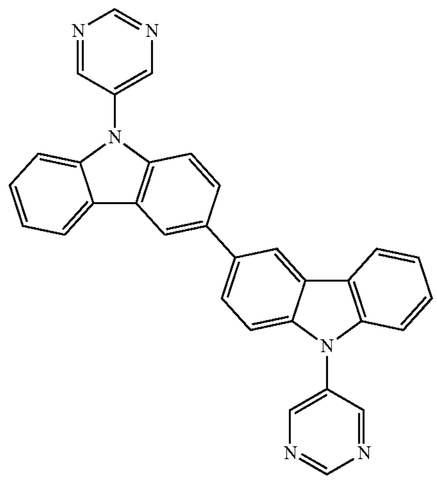

-continued
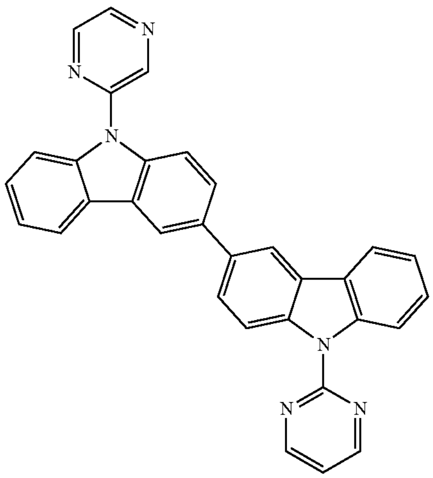
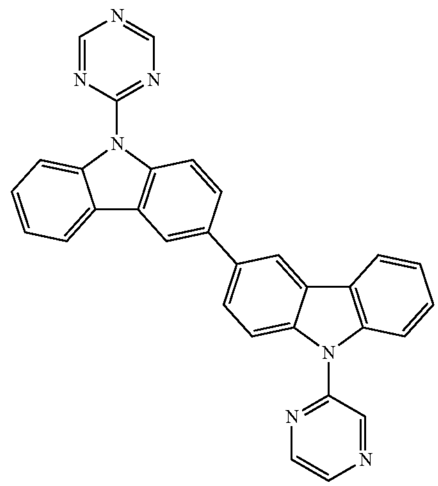
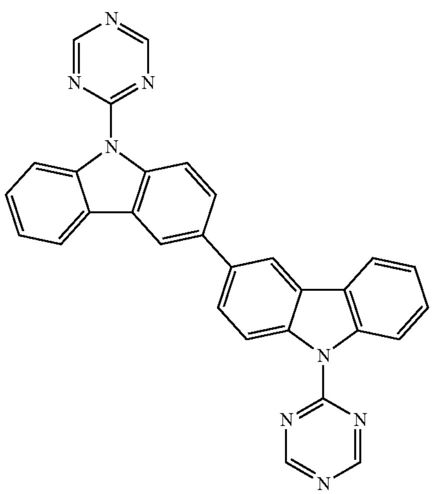
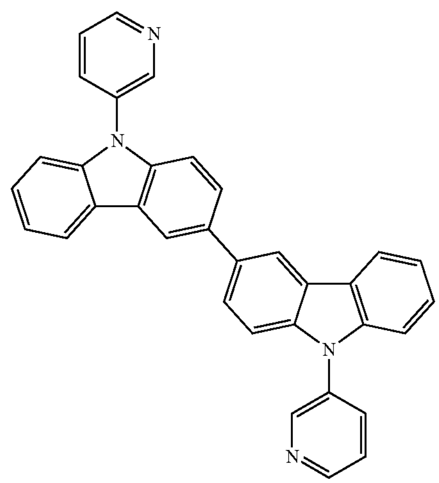
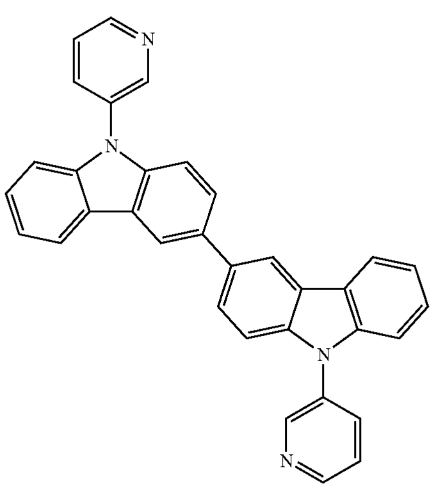
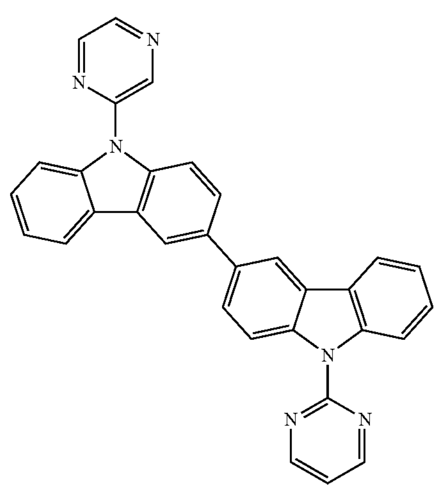

-continued
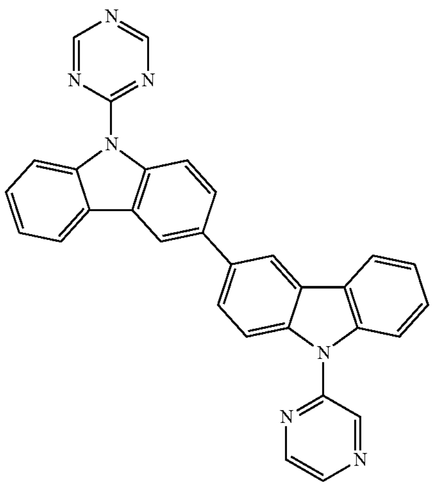
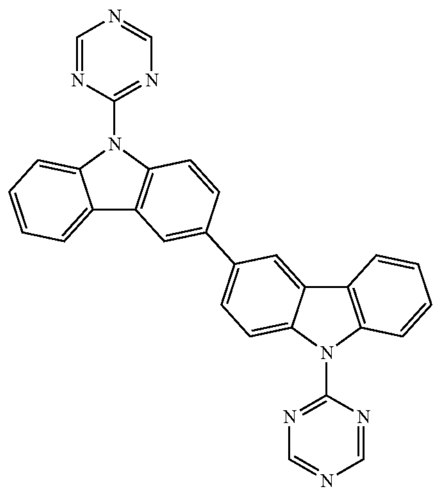
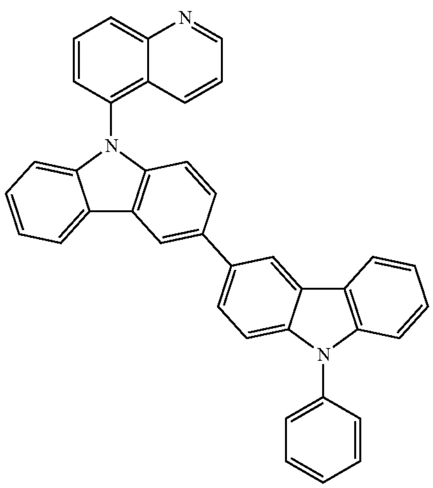
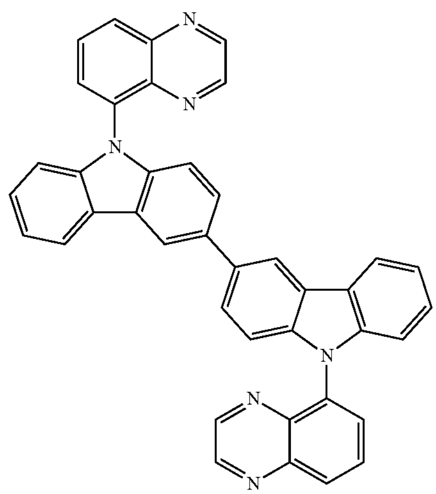
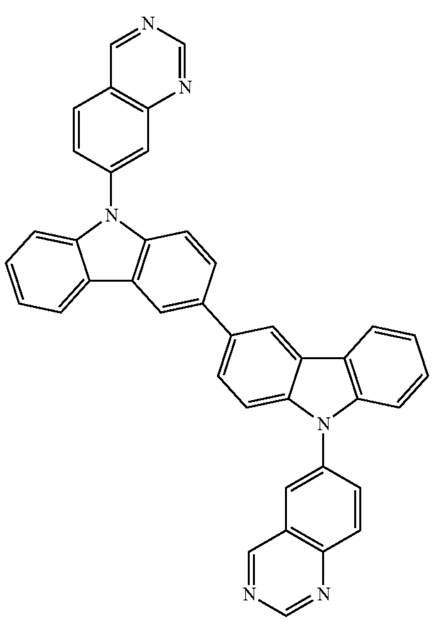
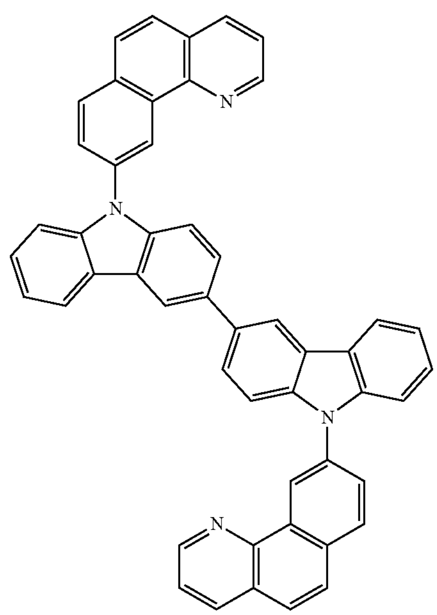

-continued
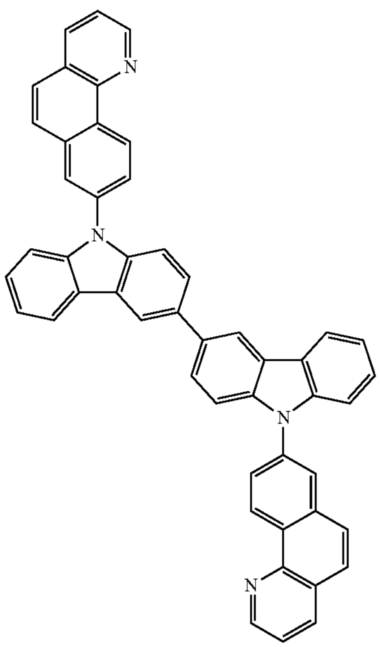
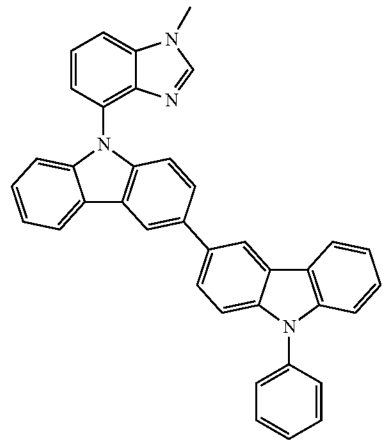
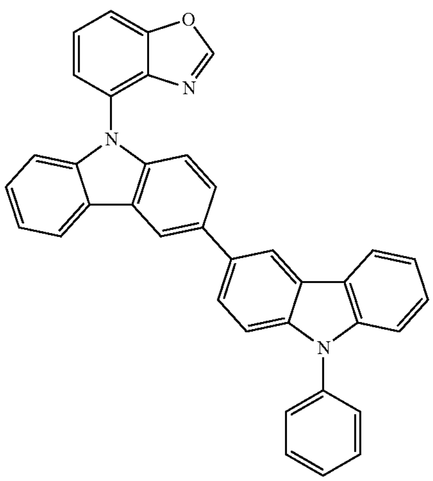
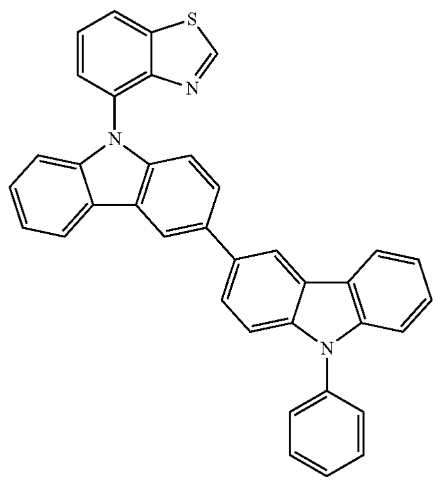
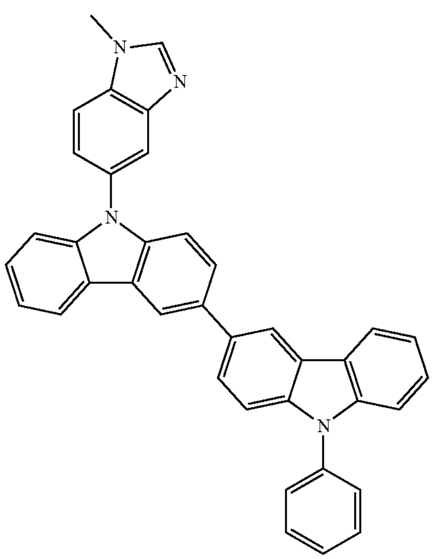
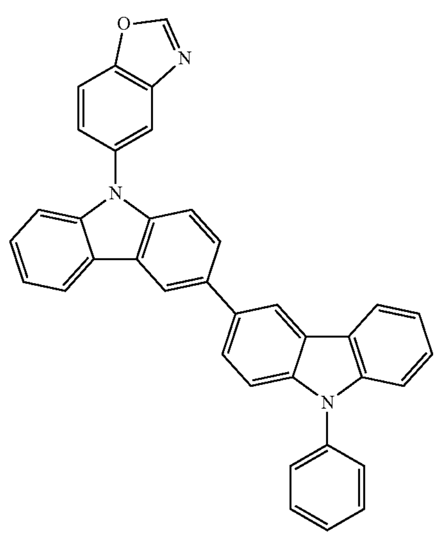

-continued
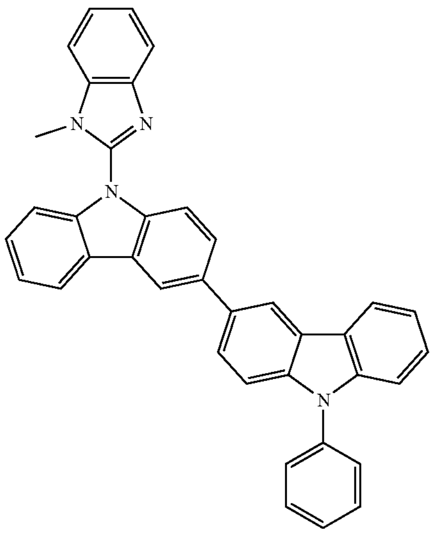
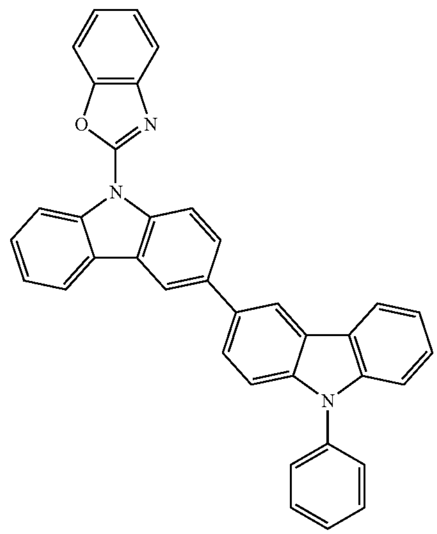
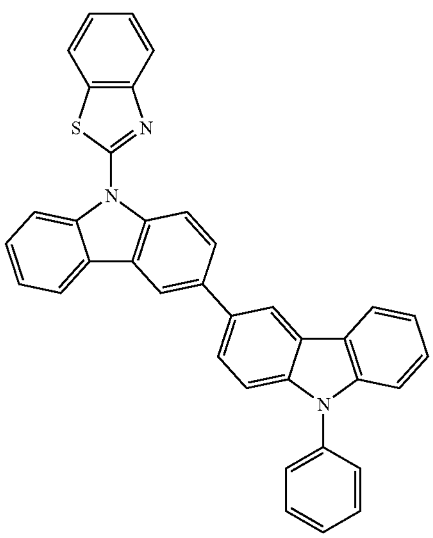
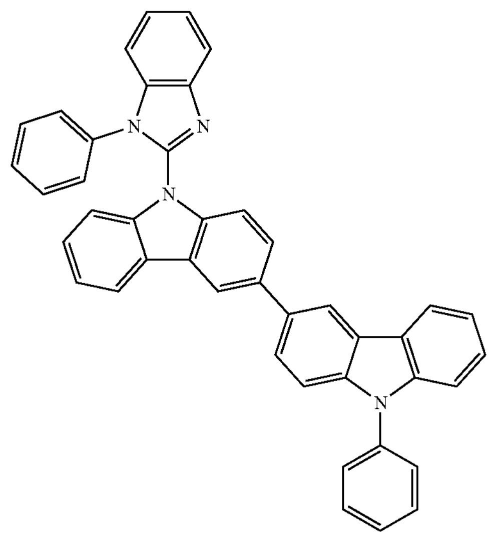
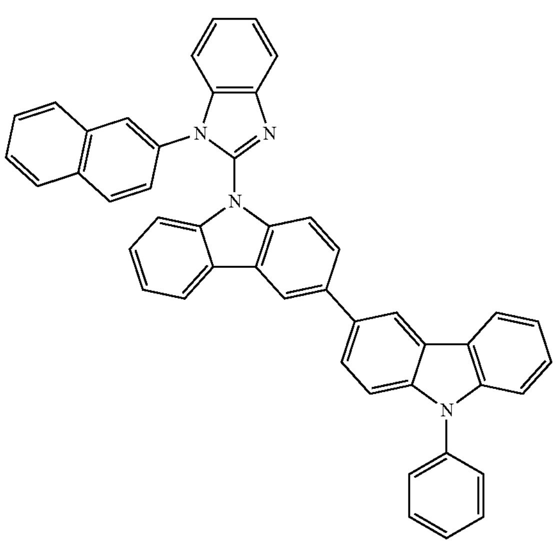
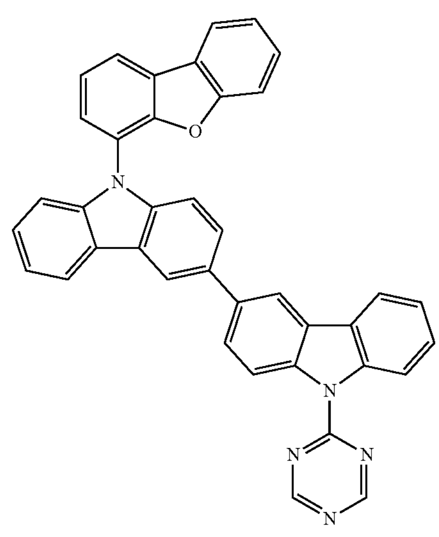

-continued
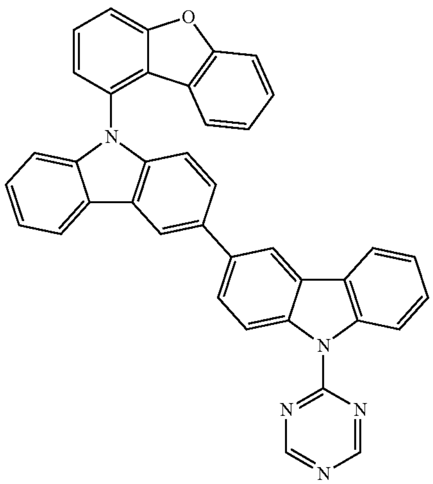
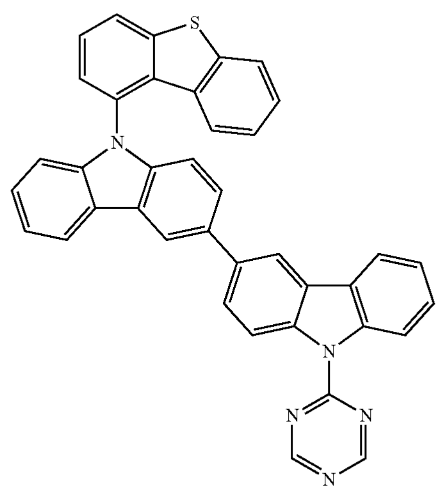
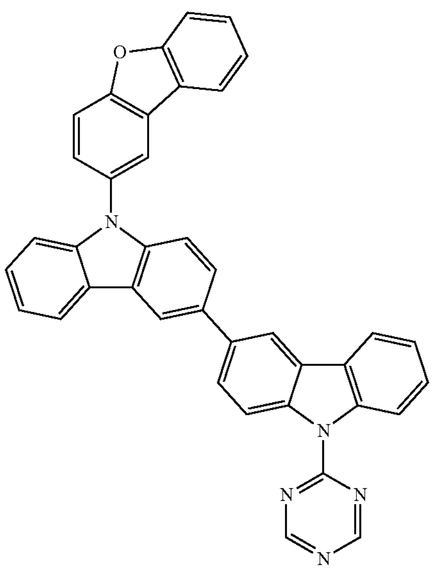
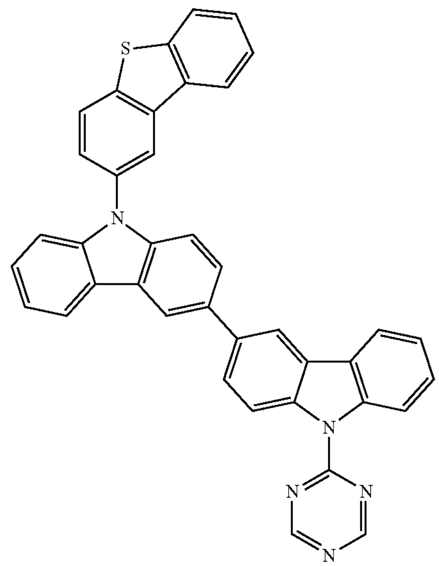
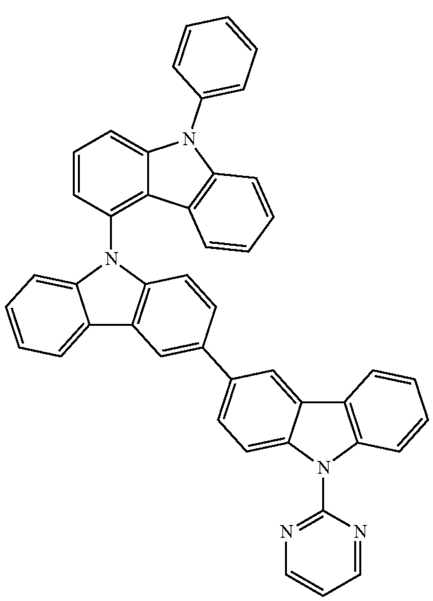
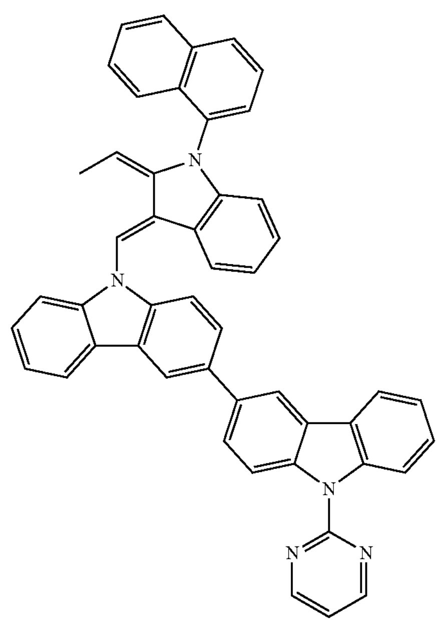

-continued
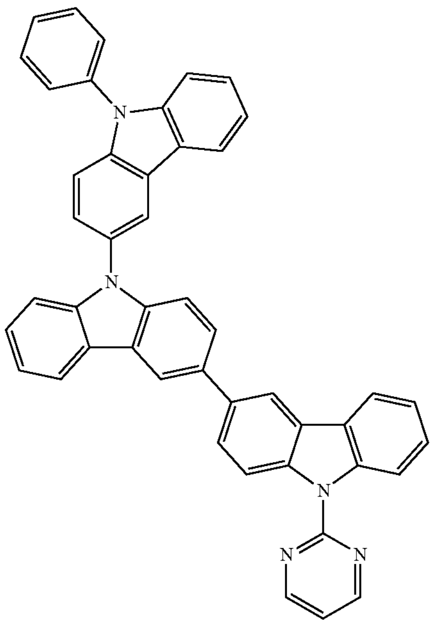
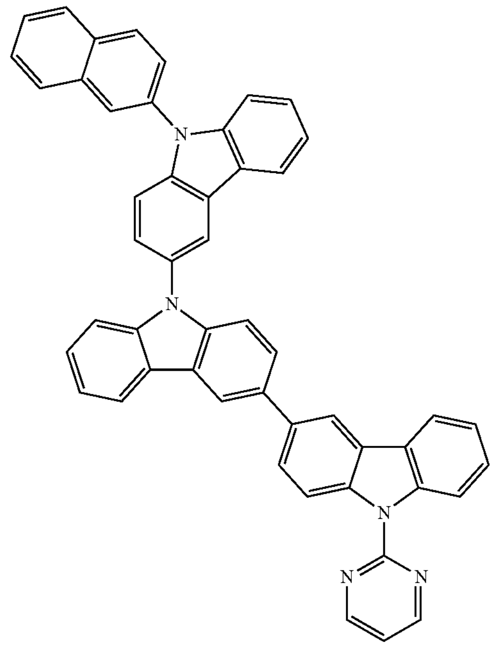
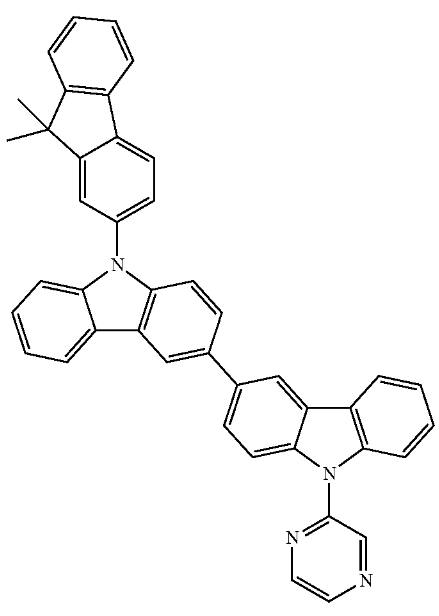
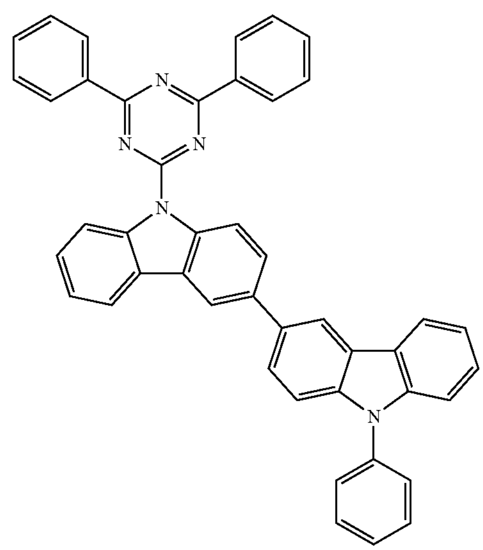

-continued
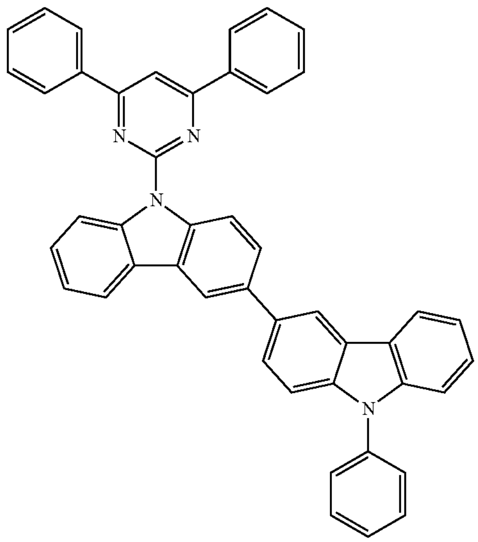
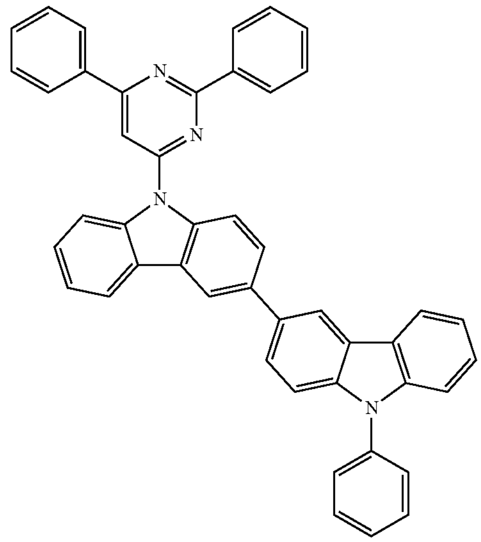
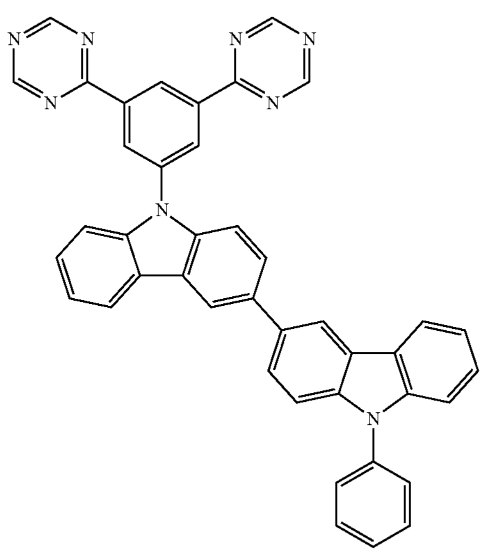
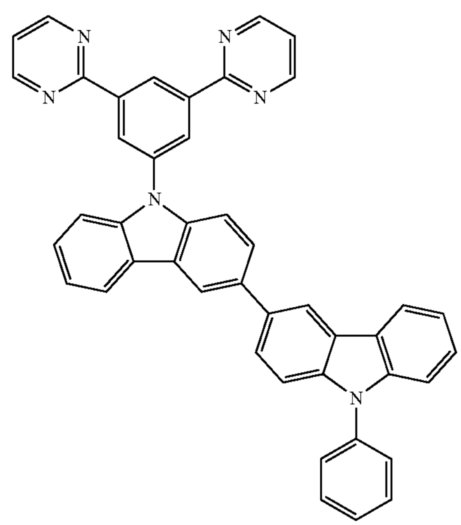

-continued
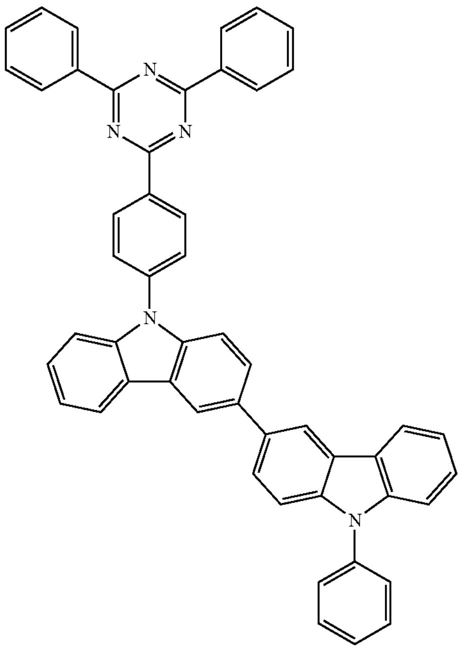
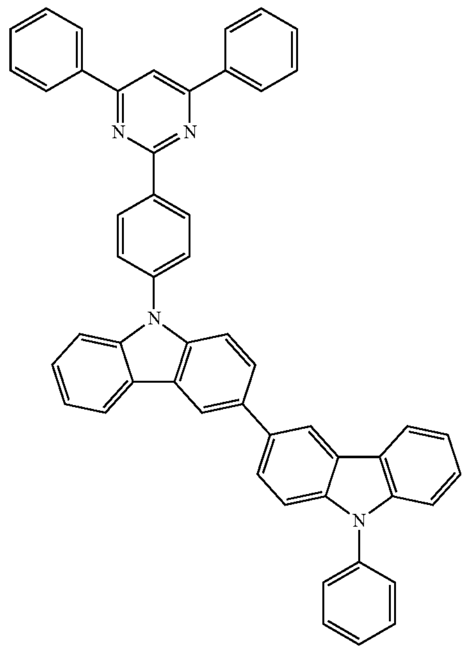
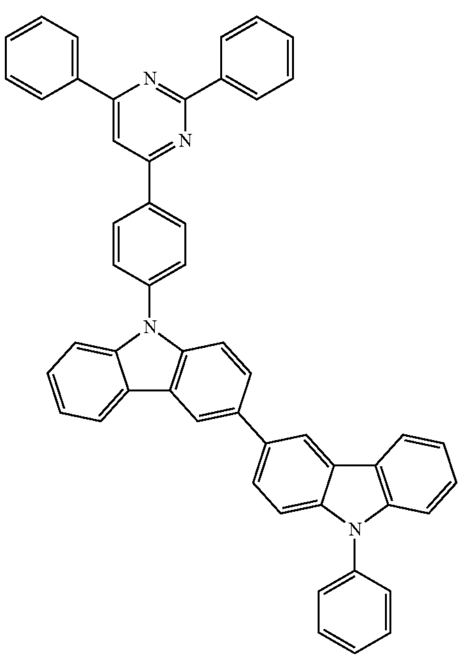
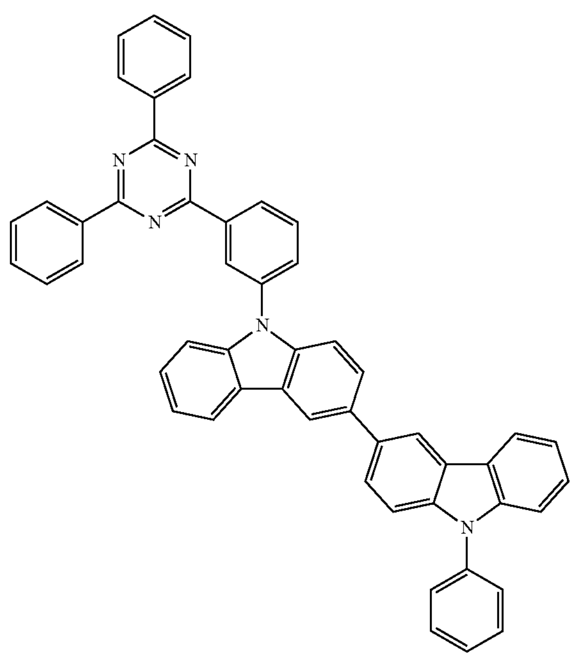

-continued
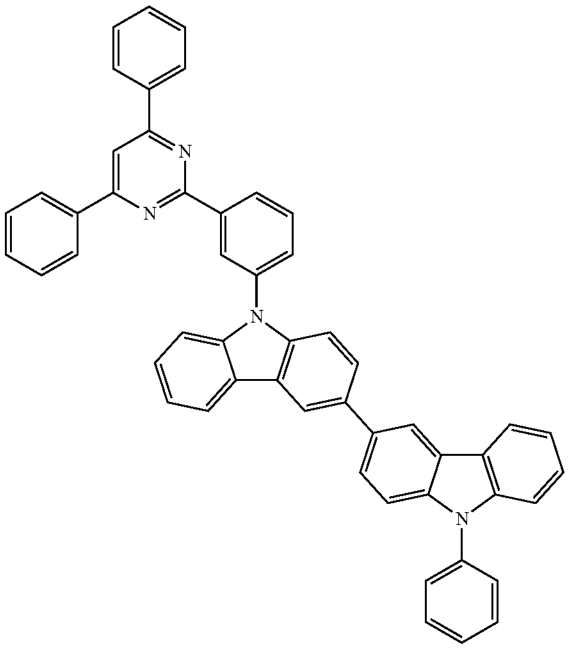
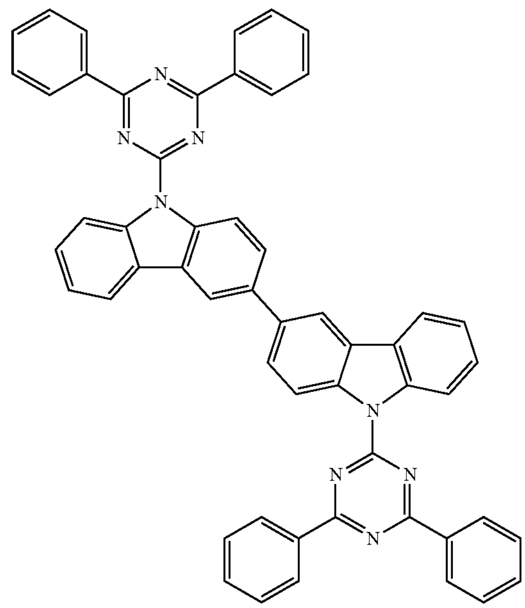
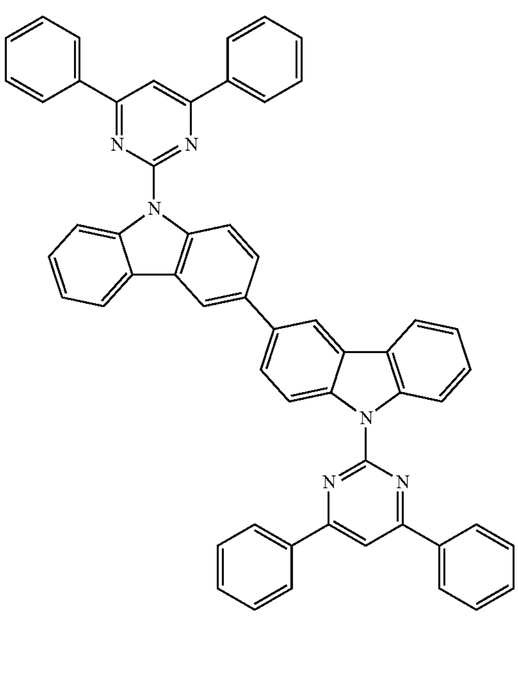
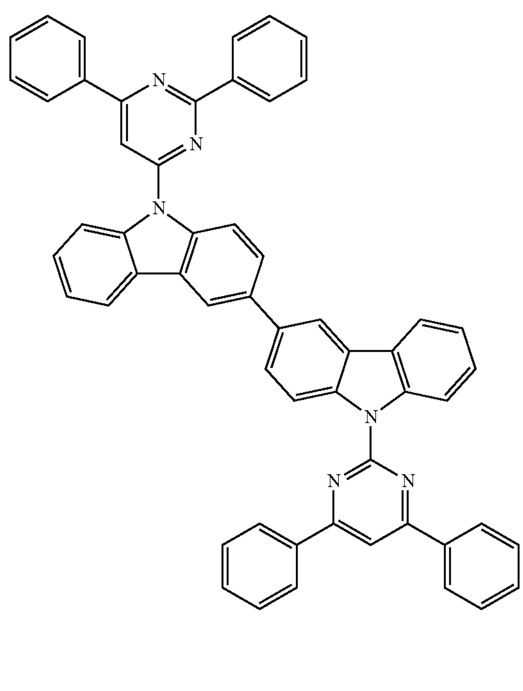

-continued
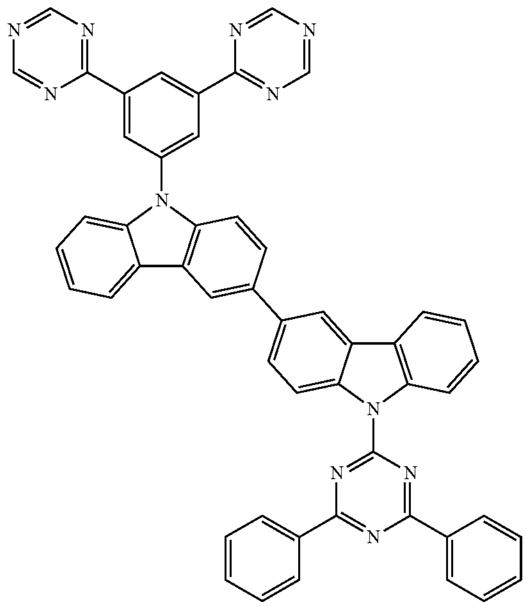
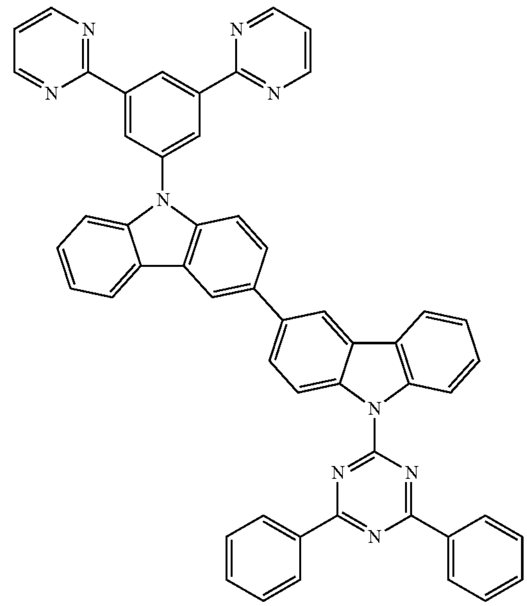
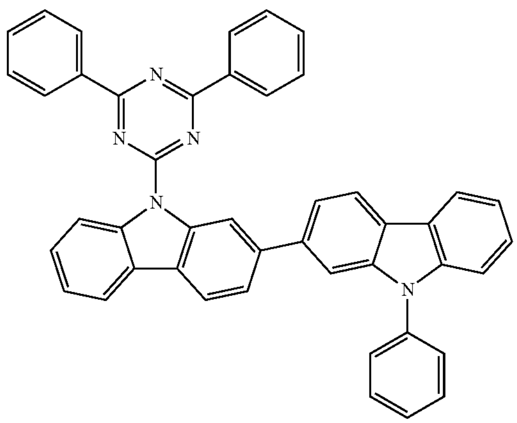
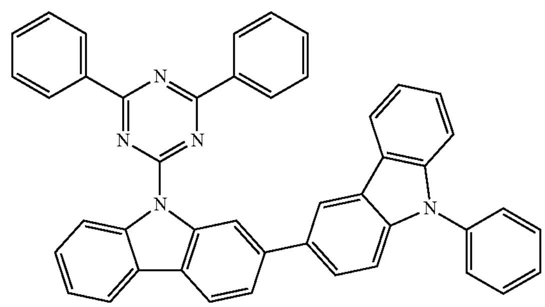
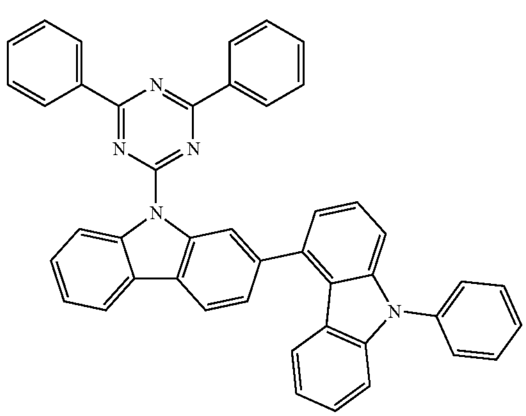
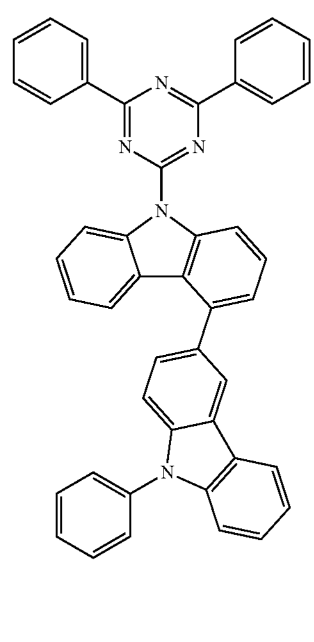

-continued
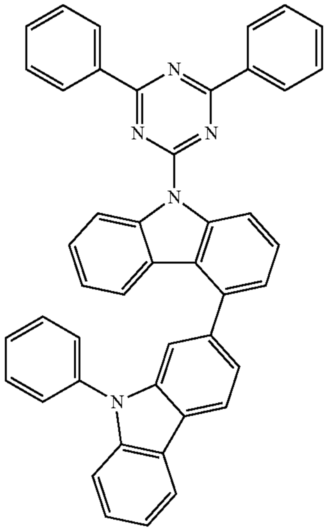
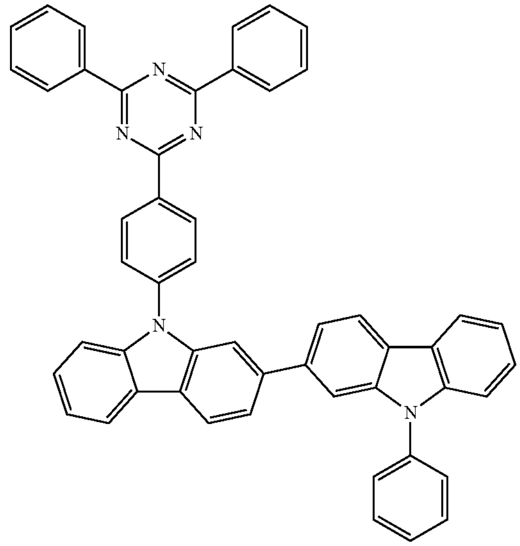
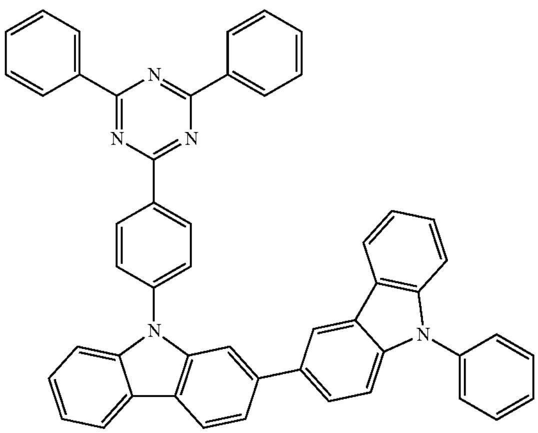
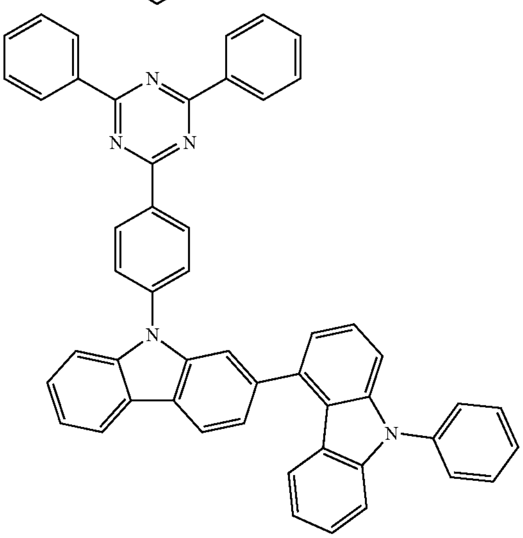
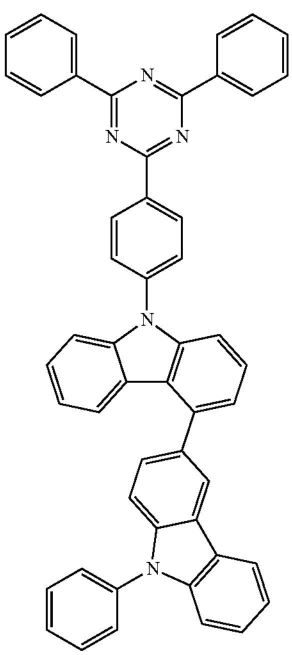
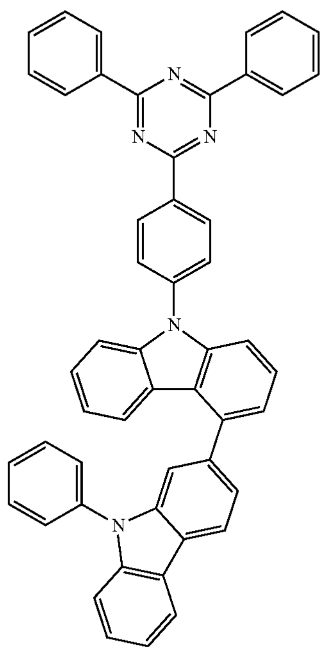

-continued
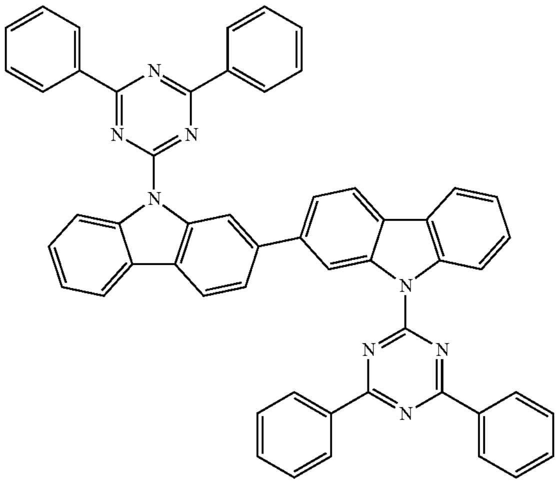
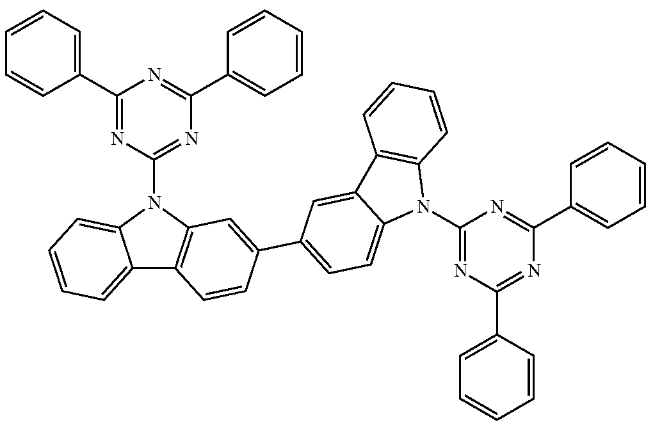
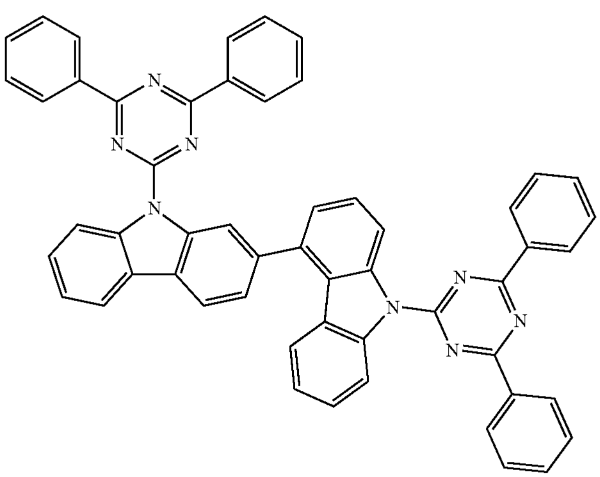
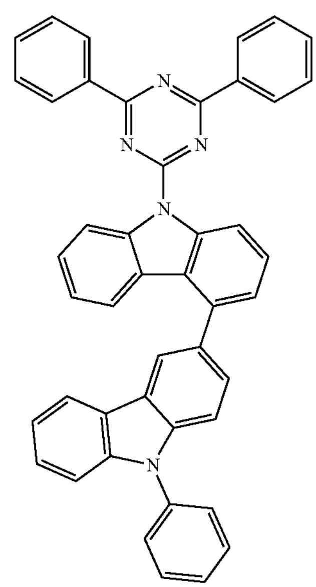

-continued
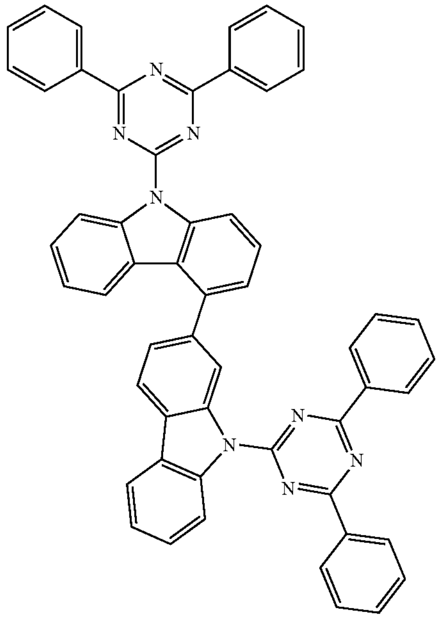
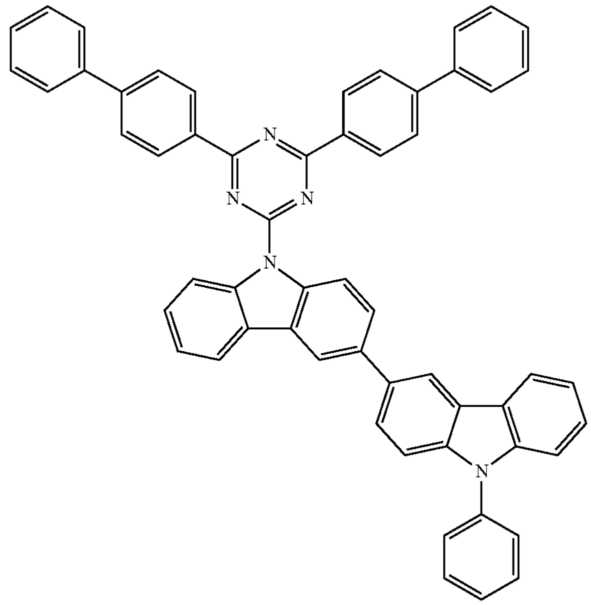
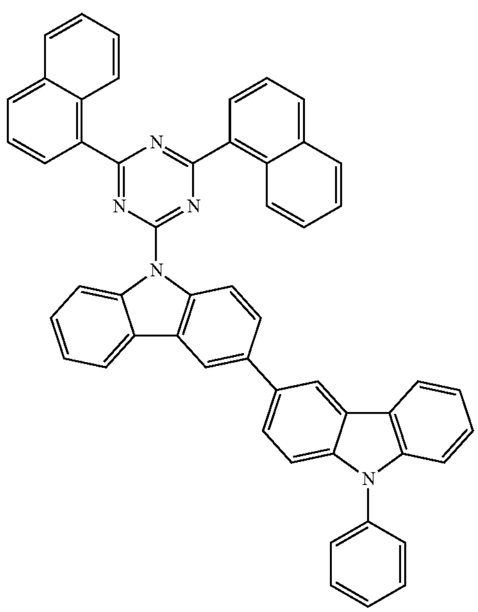
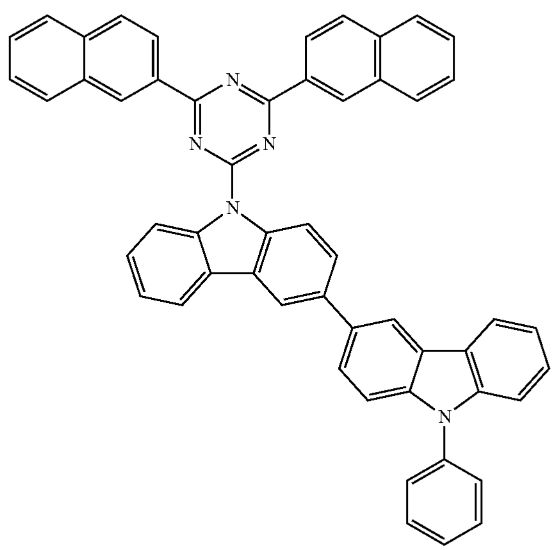

-continued
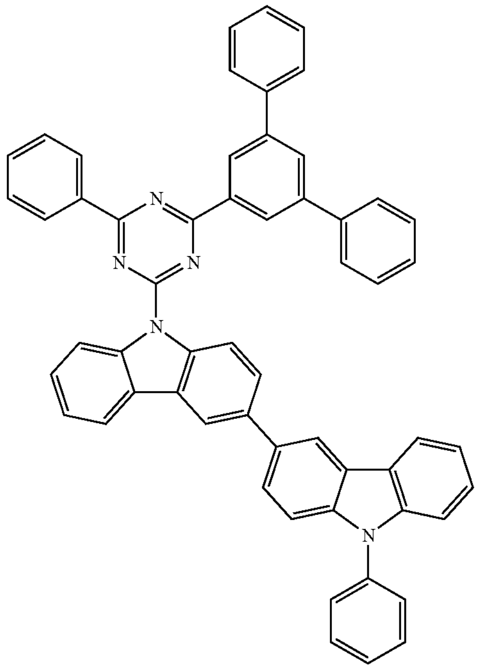
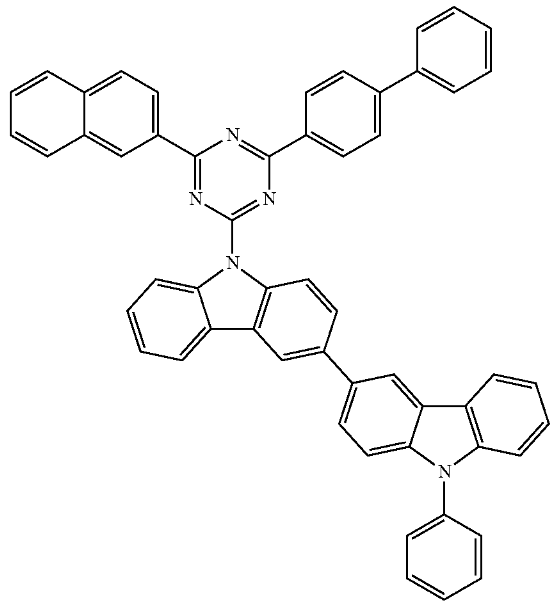
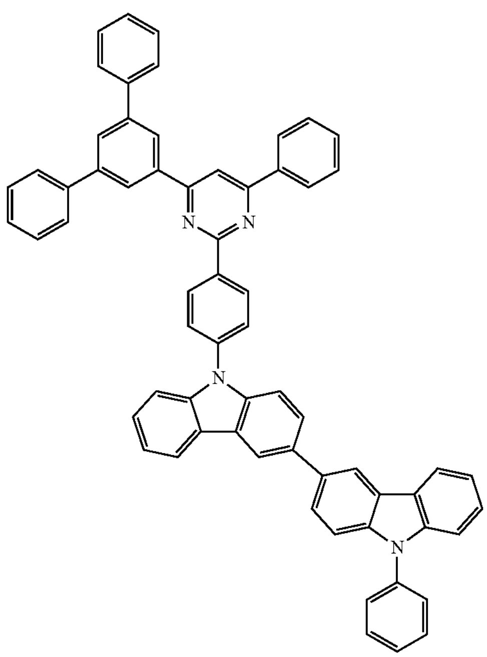
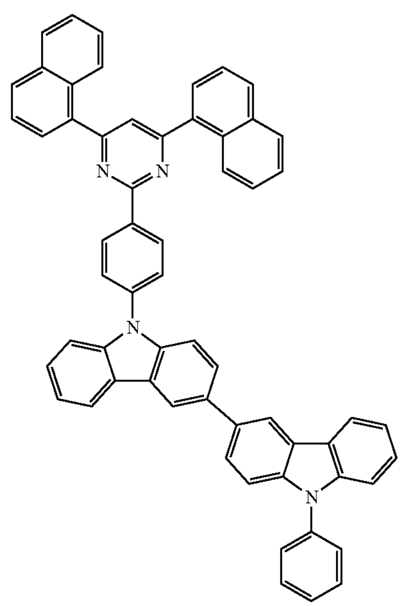

-continued
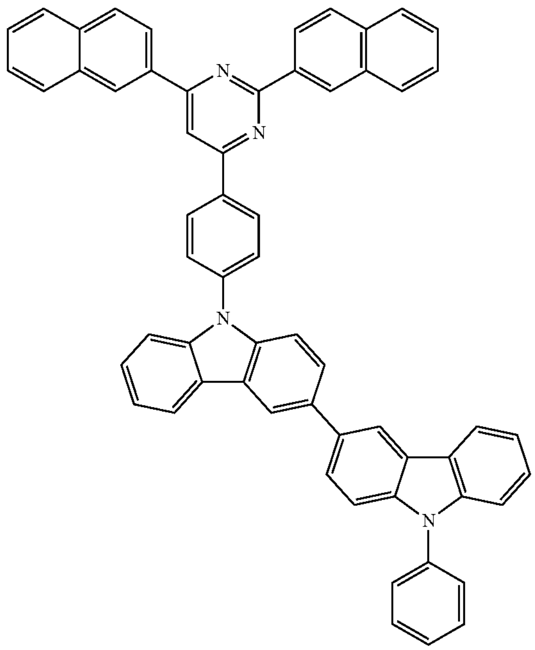
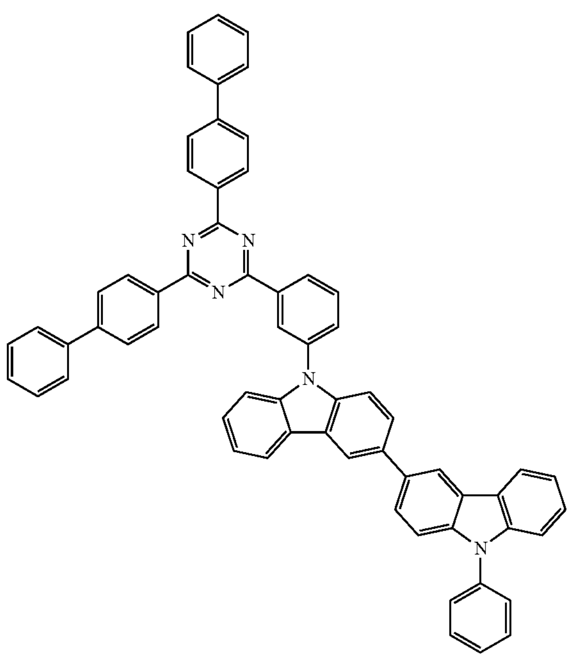
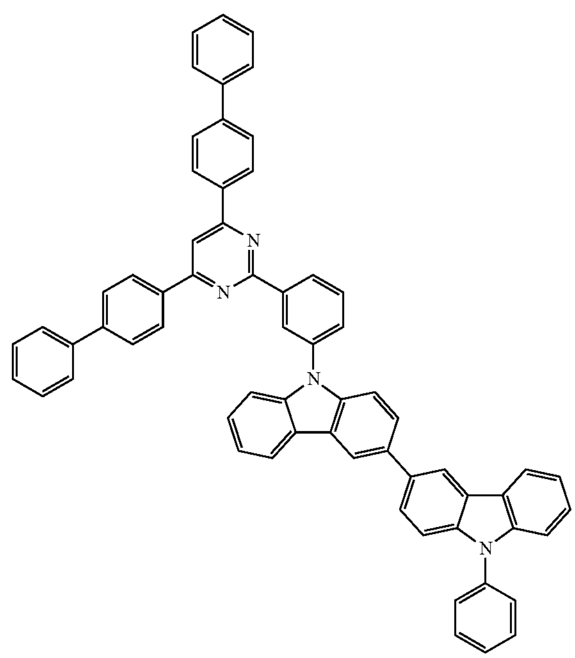

-continued
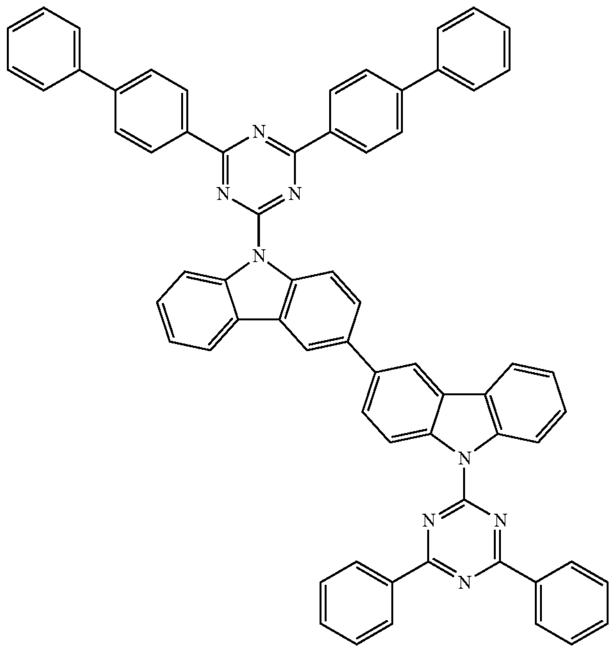
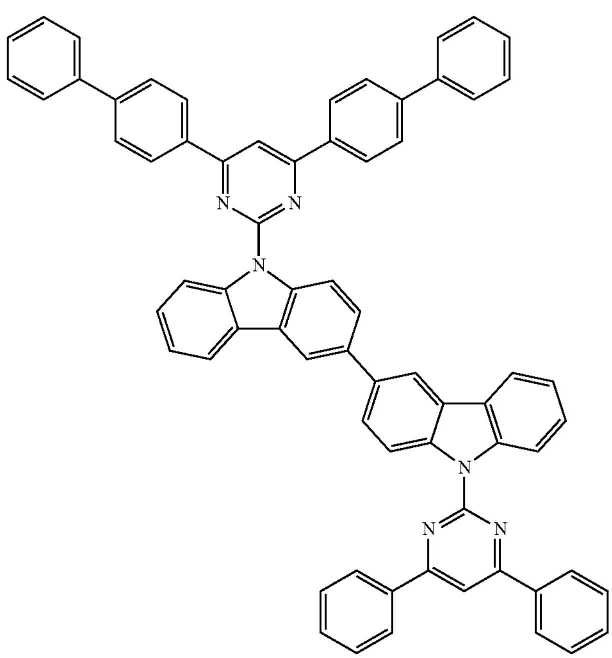

-continued
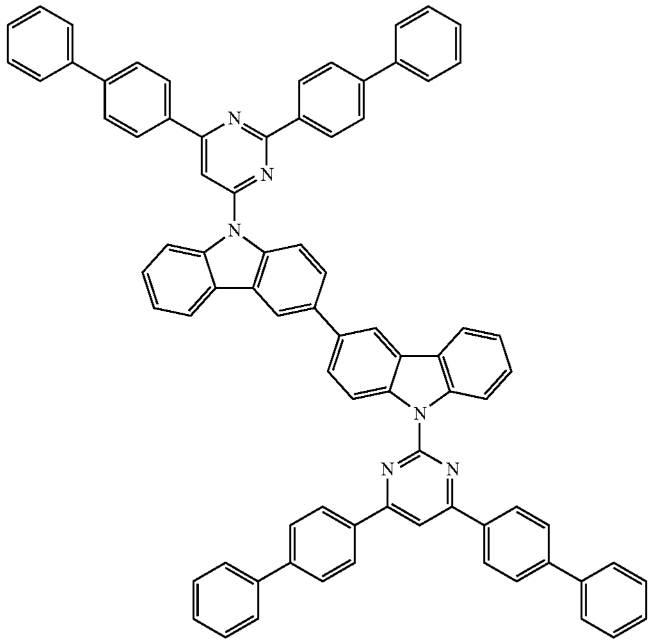
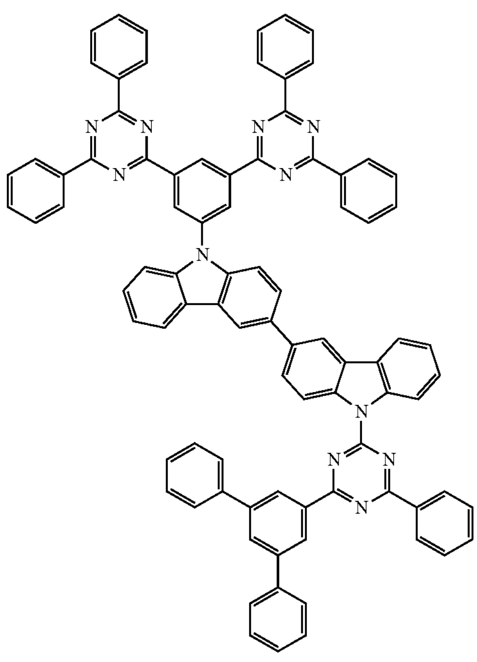
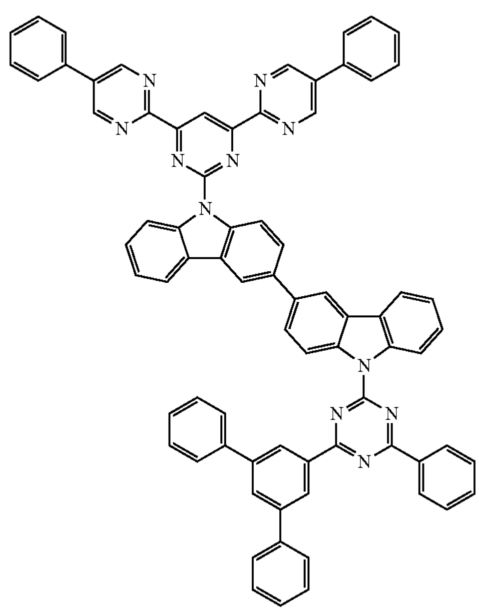

-continued
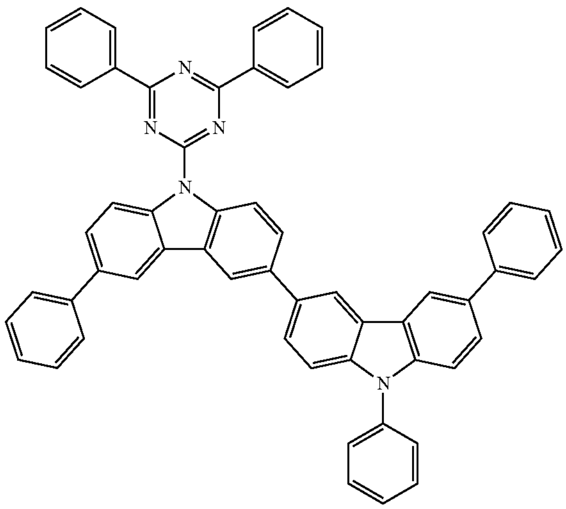
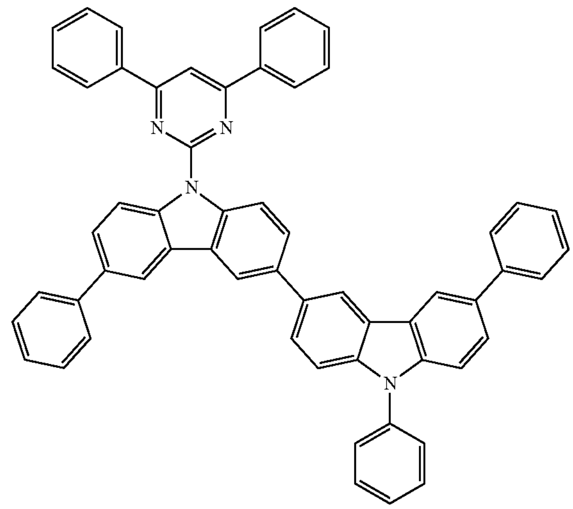
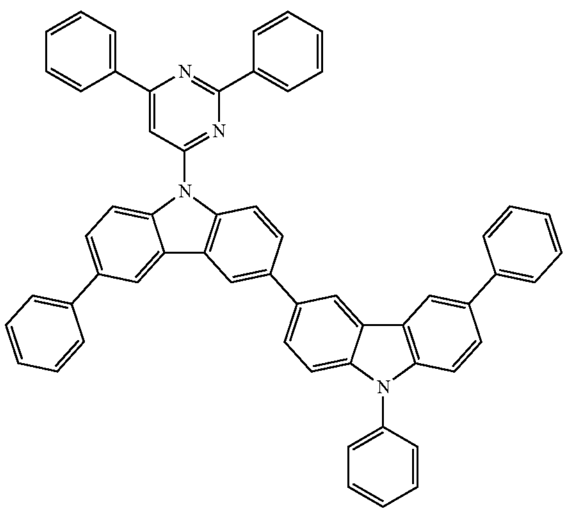
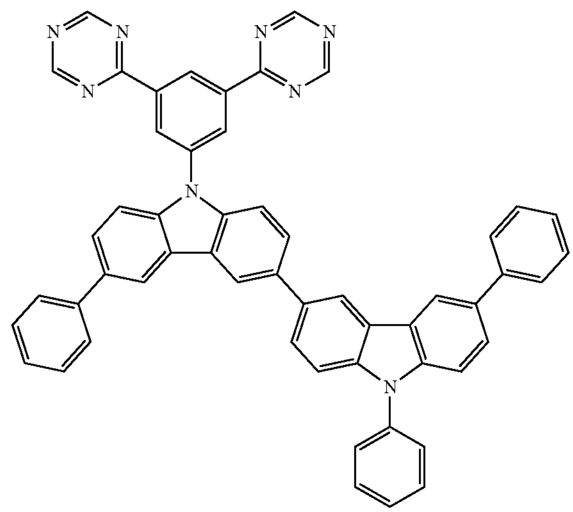
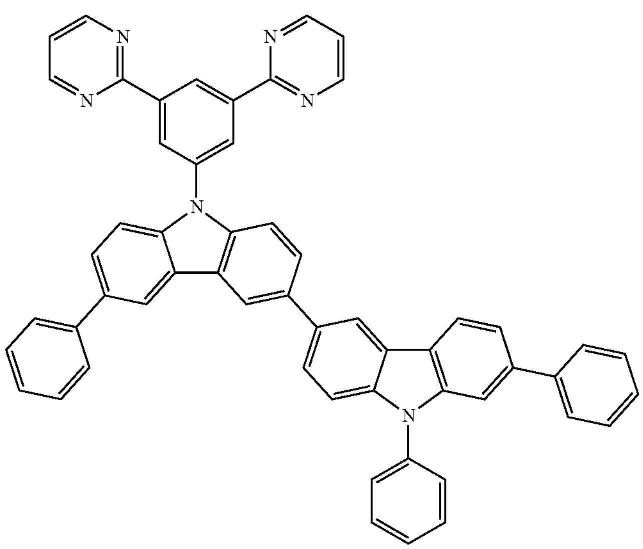

-continued
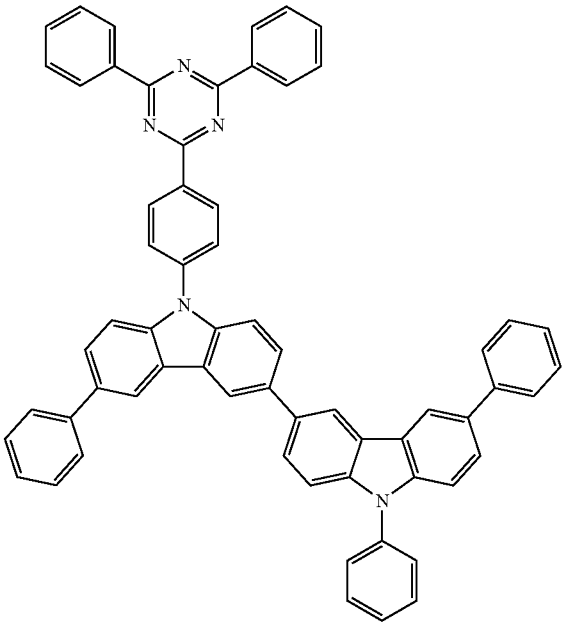
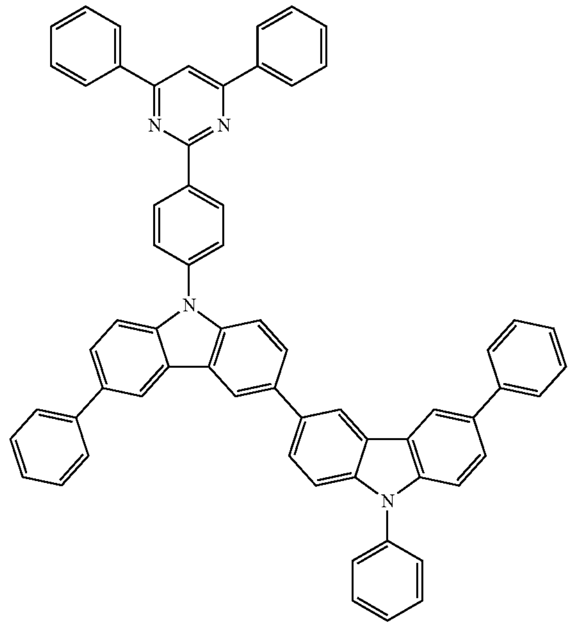
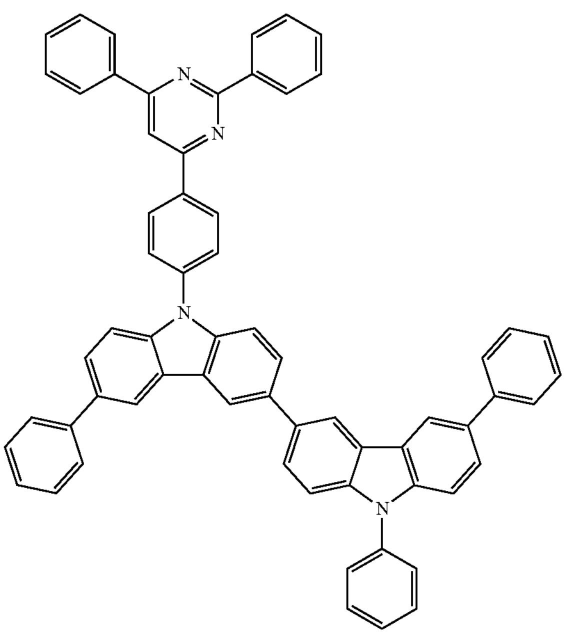

-continued
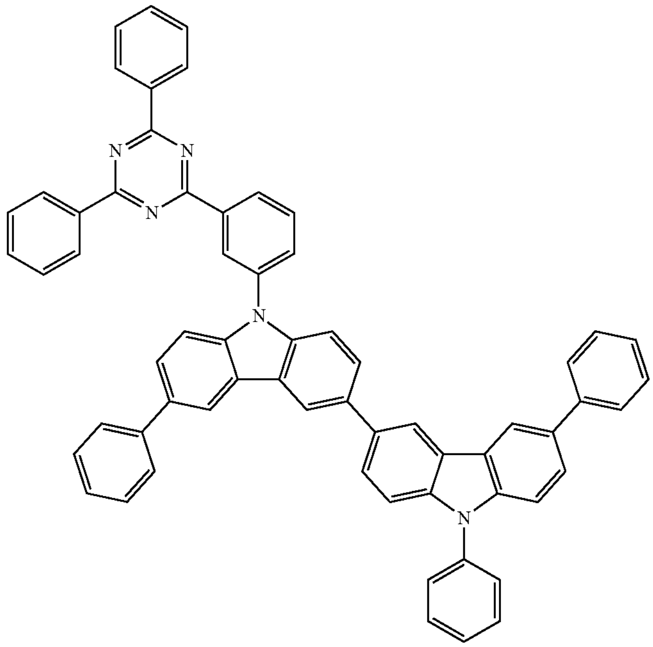
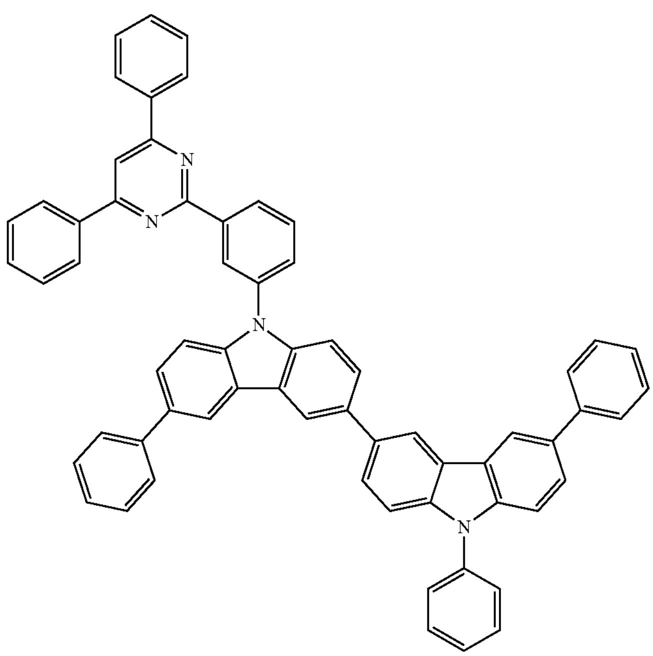

-continued
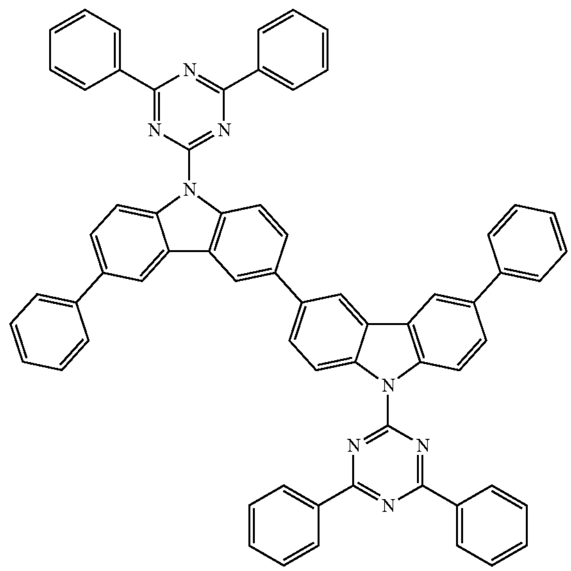
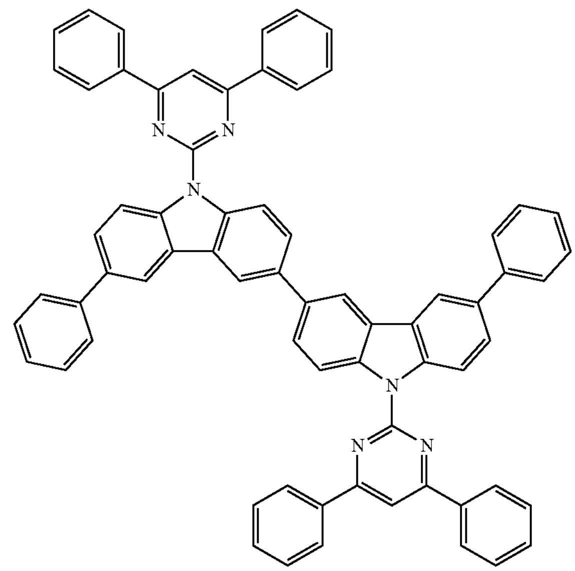
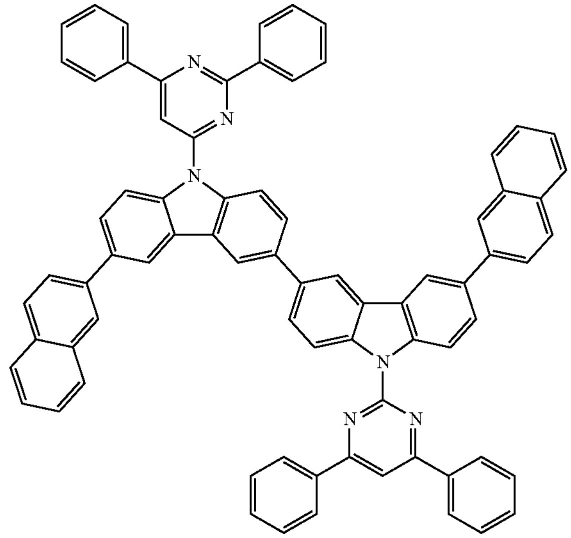
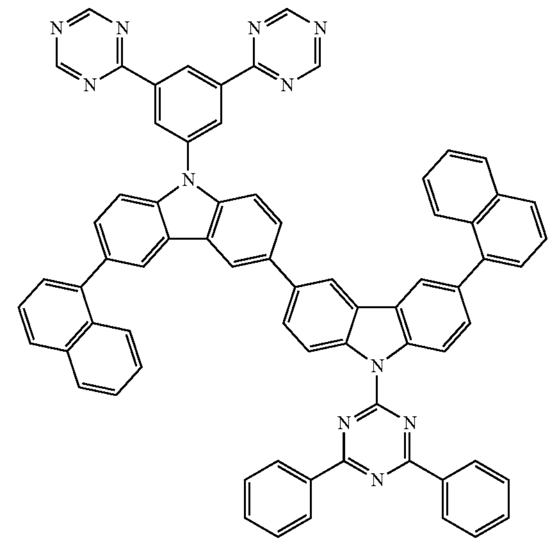
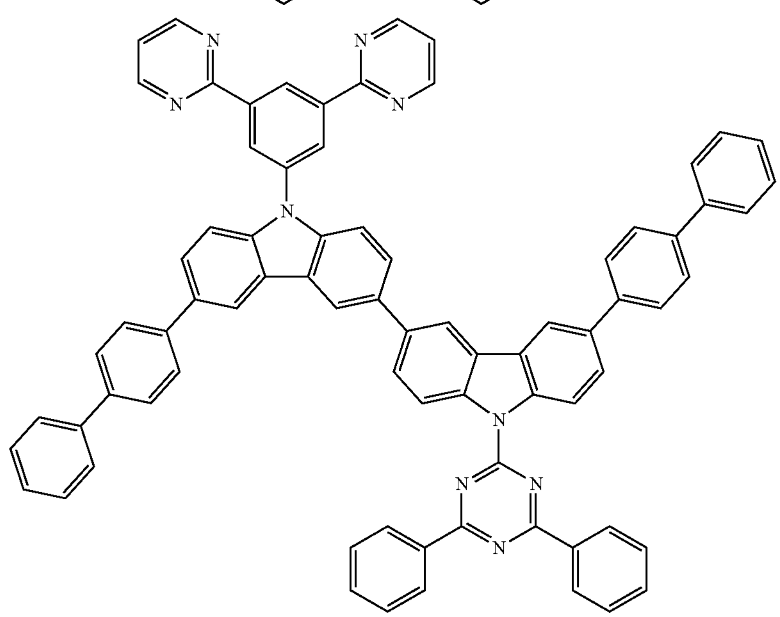

-continued
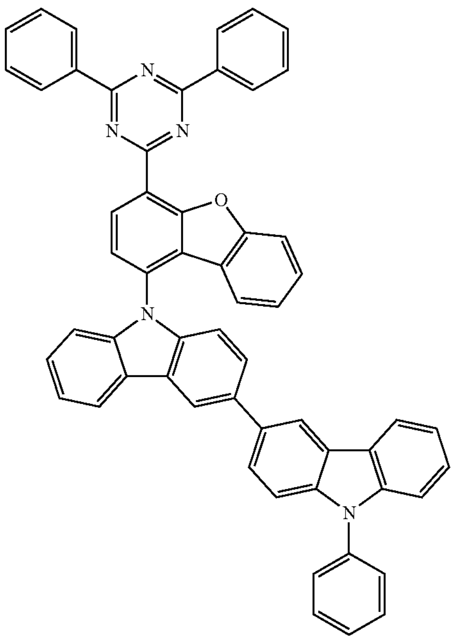
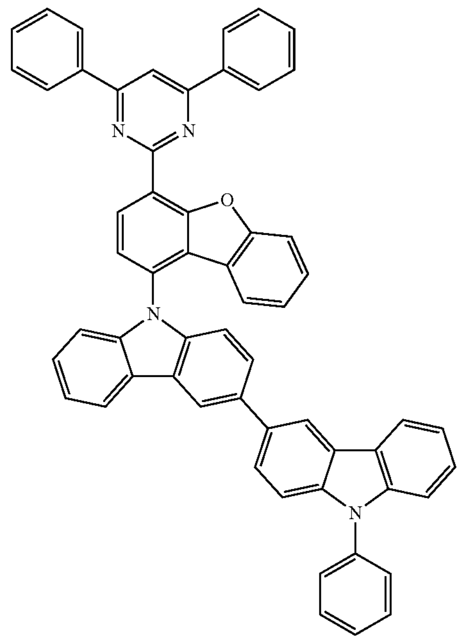
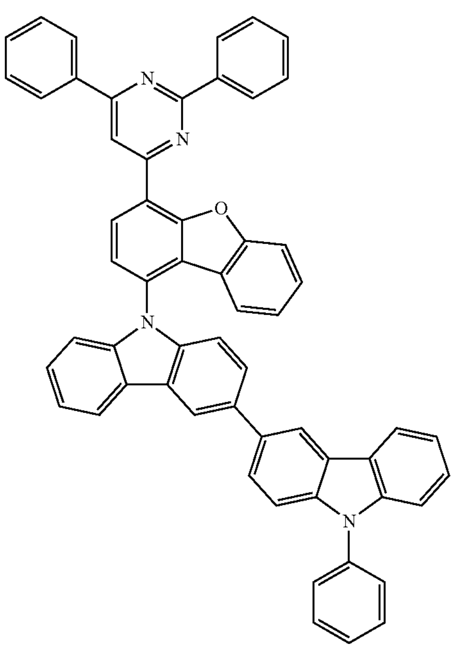
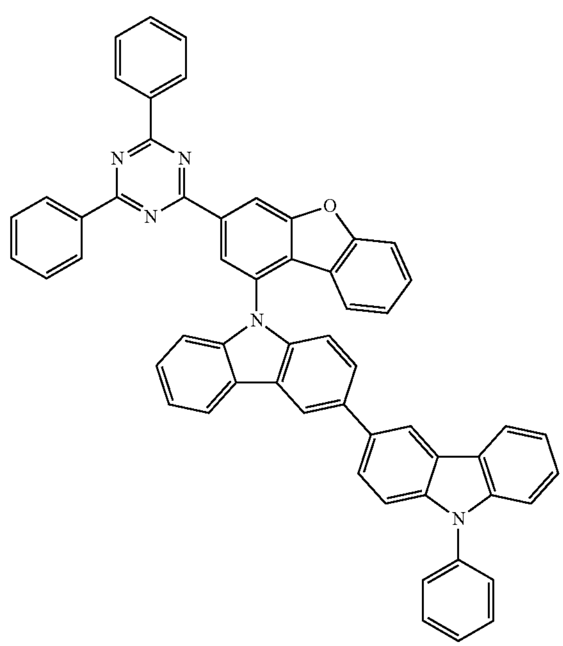

-continued
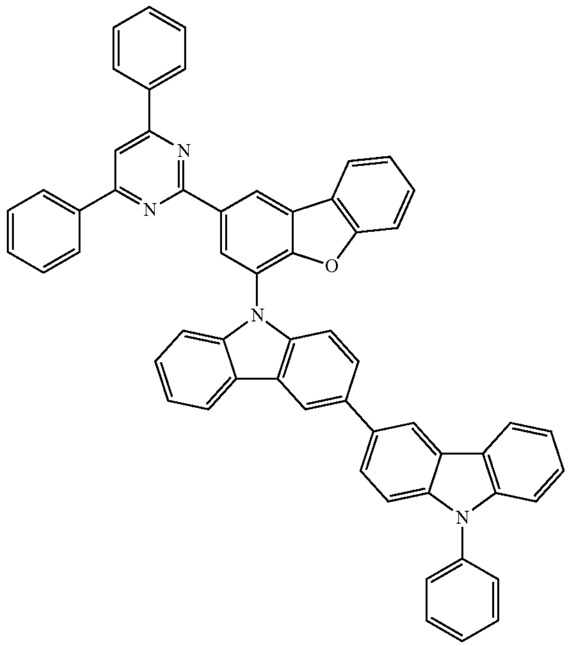
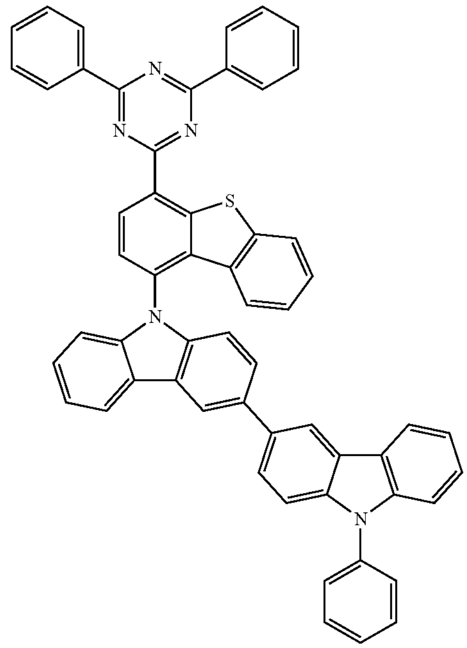
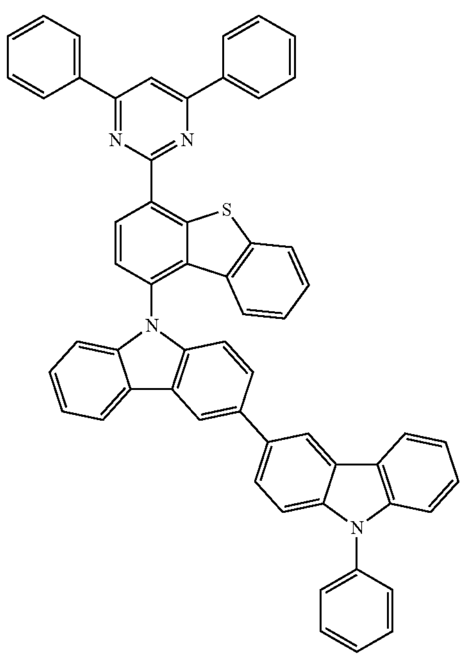
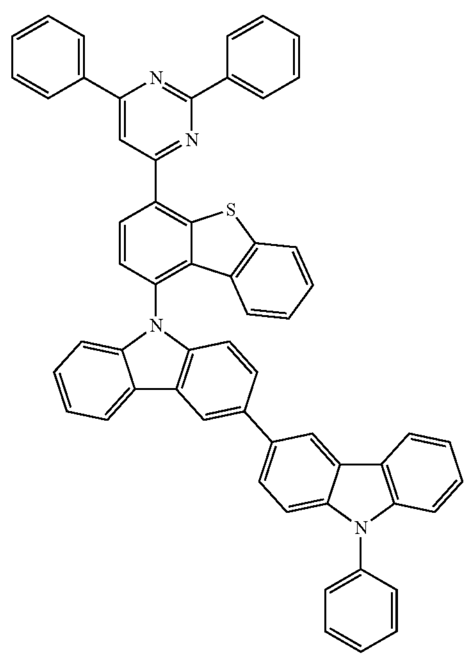

-continued
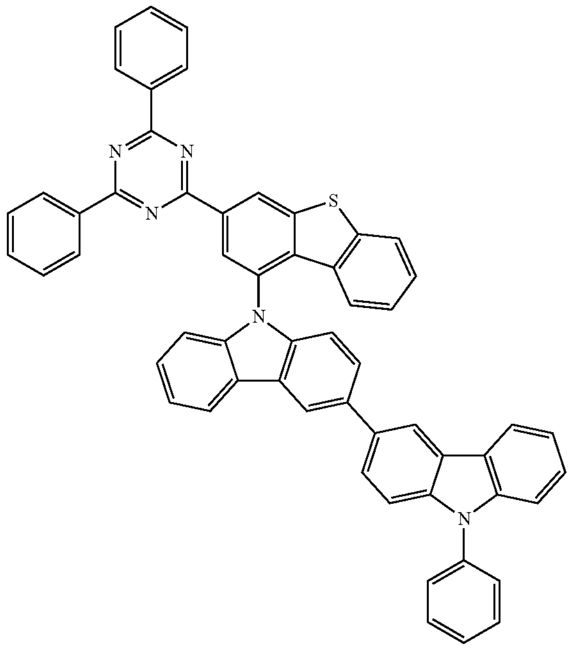
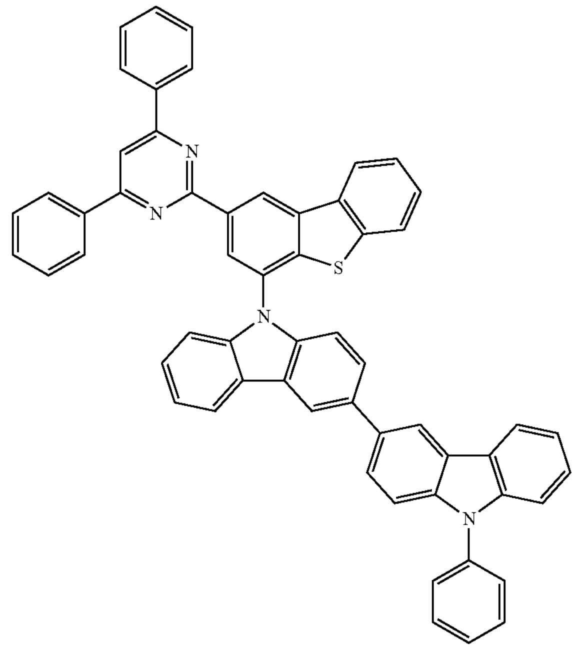
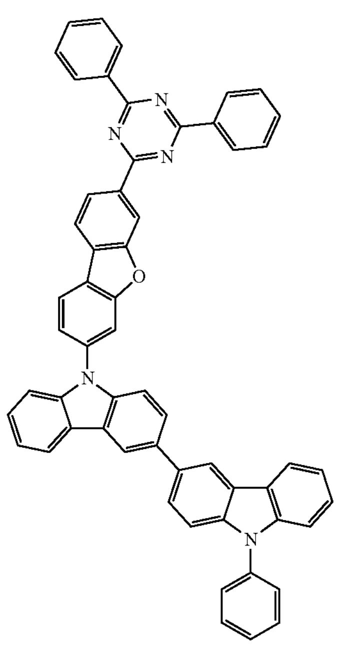
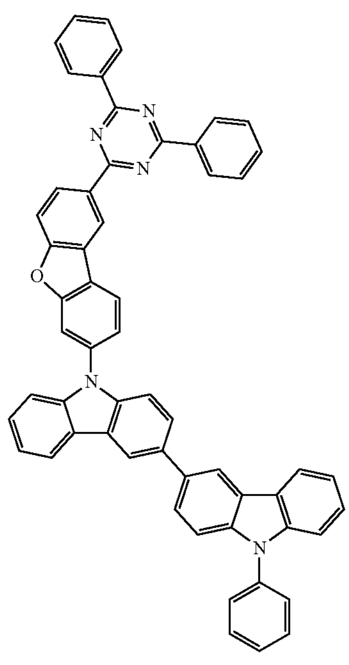

-continued
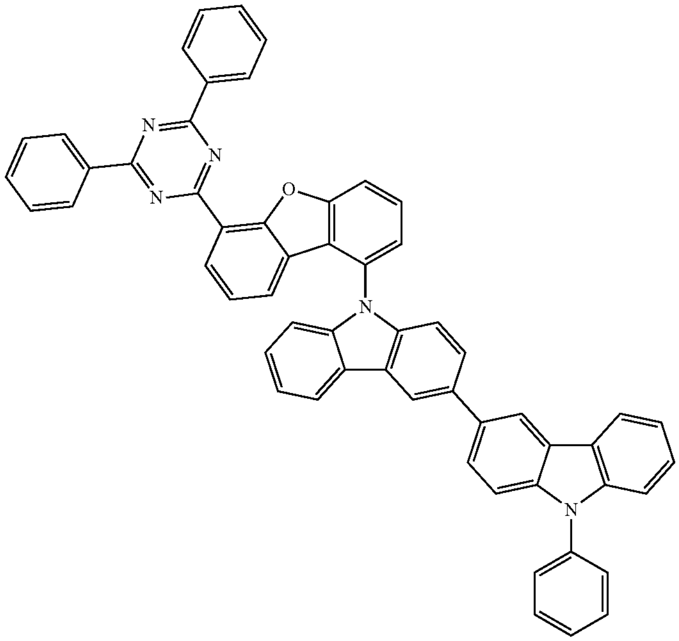
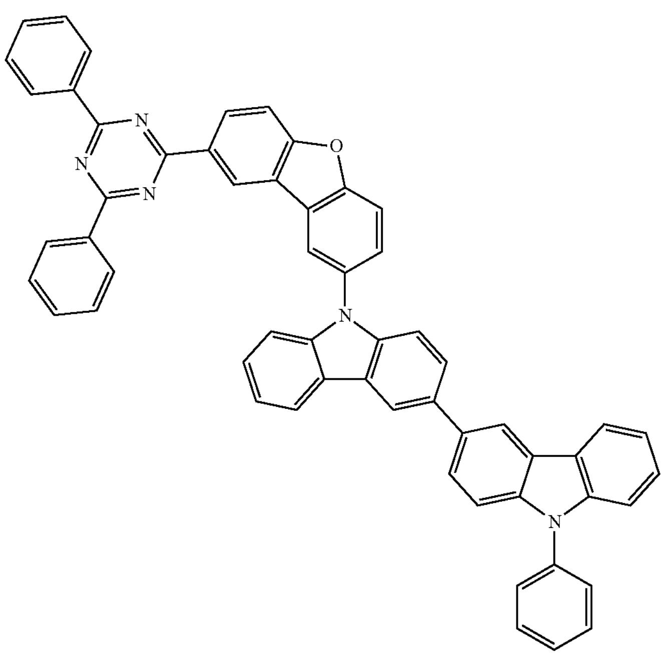

-continued
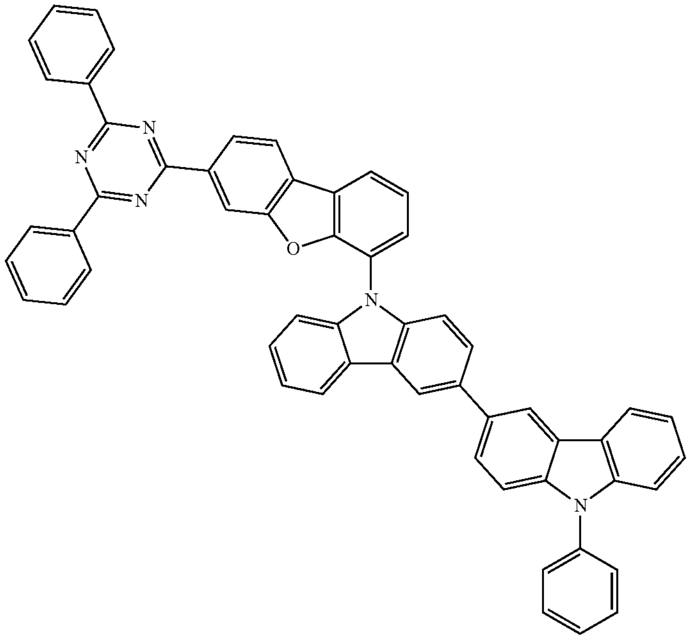
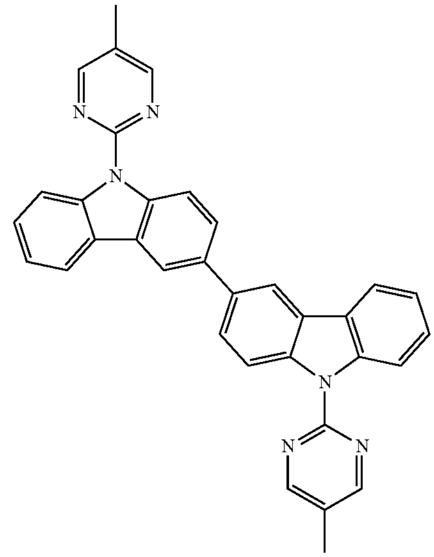
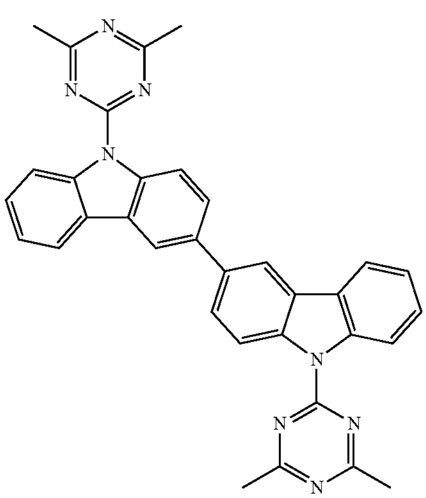
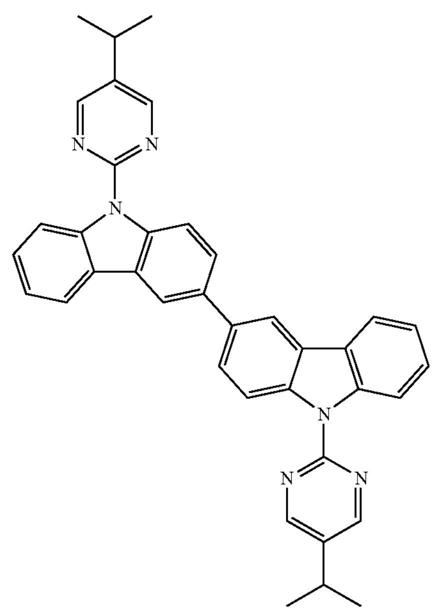

-continued
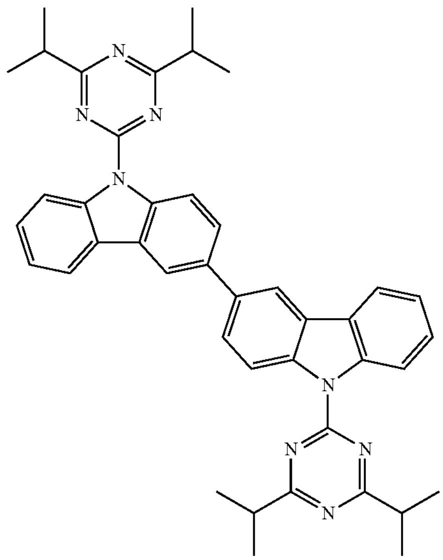
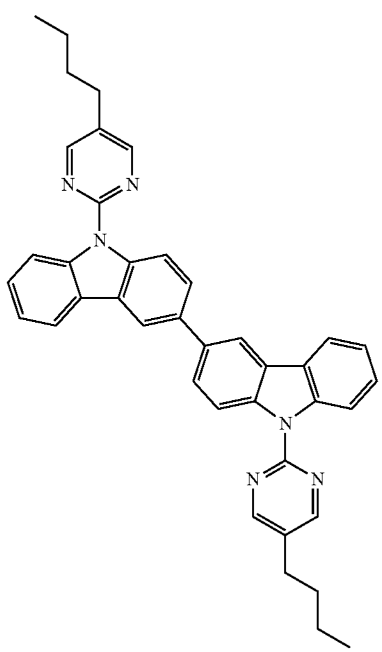
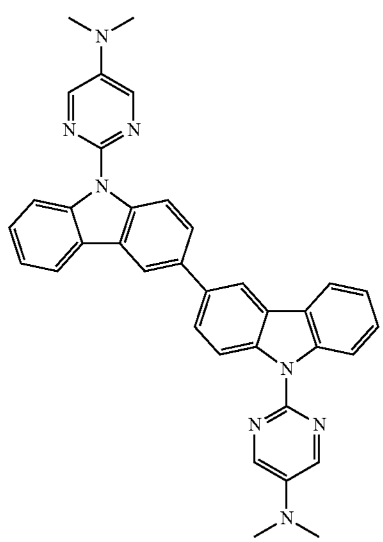

-continued
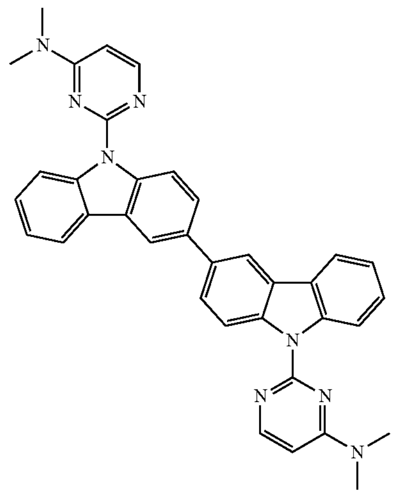
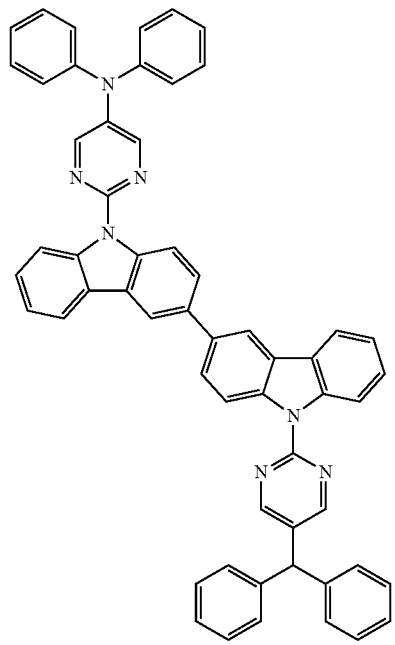
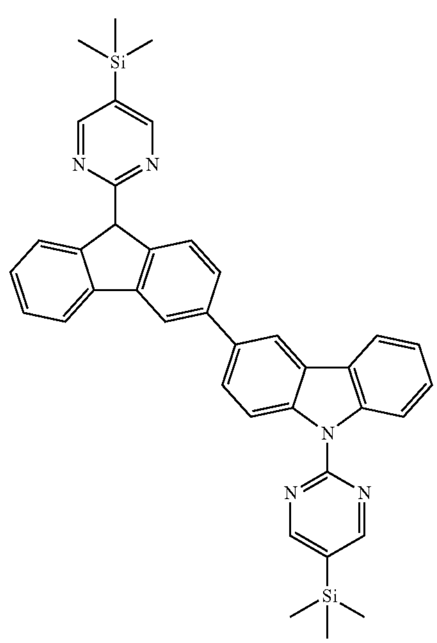
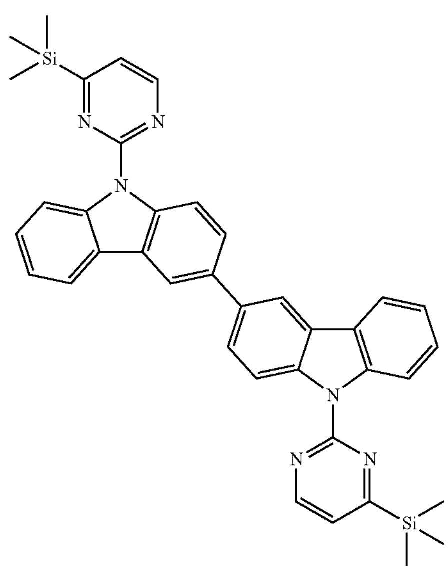

-continued
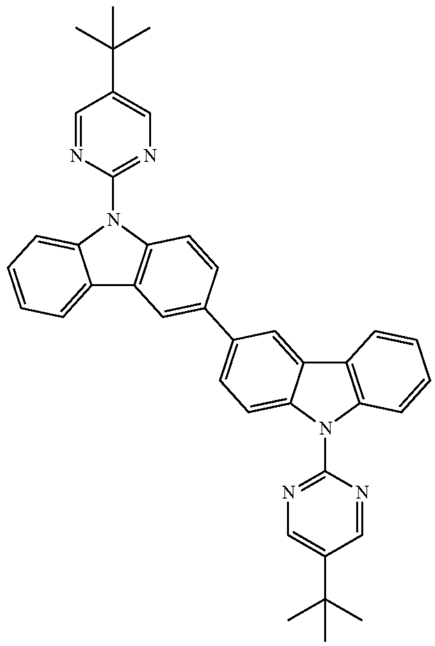
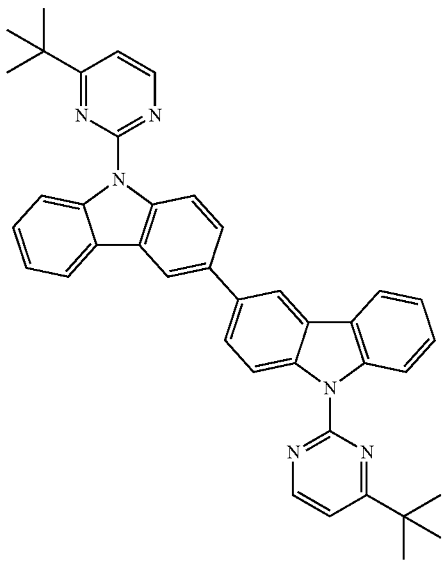
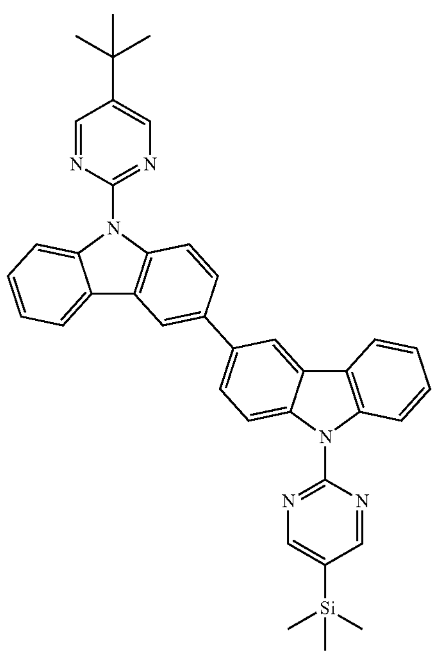
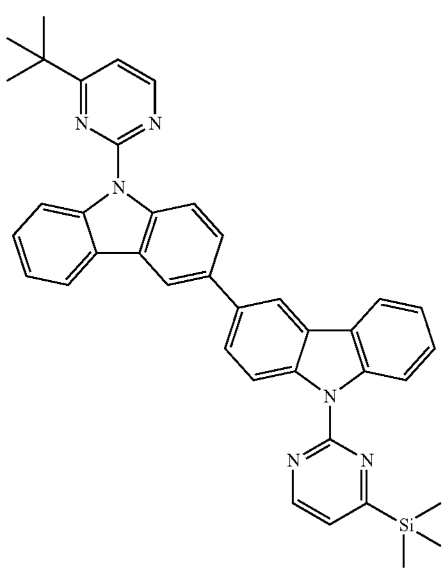

-continued
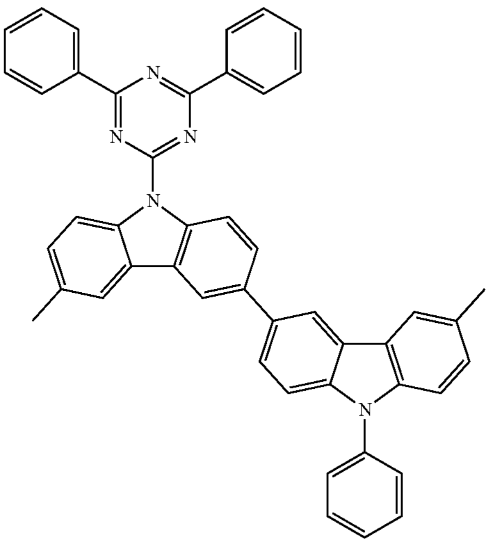
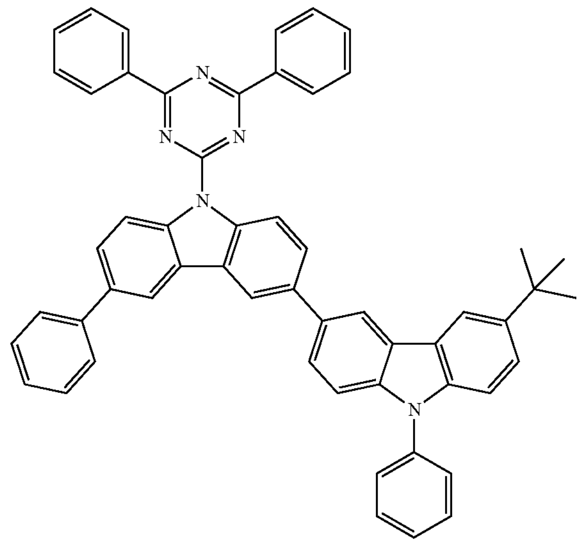
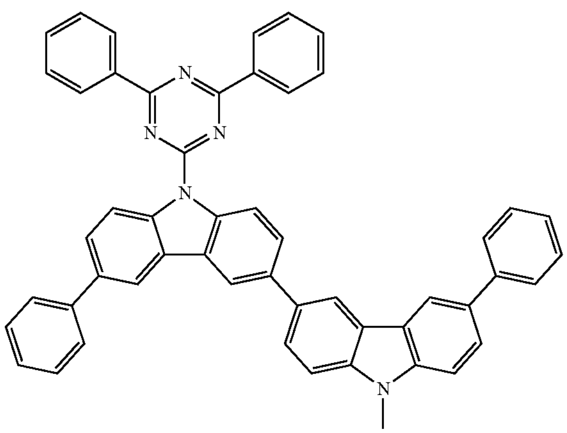
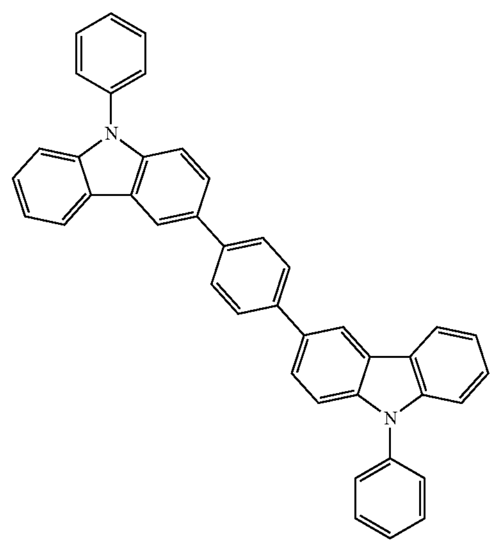
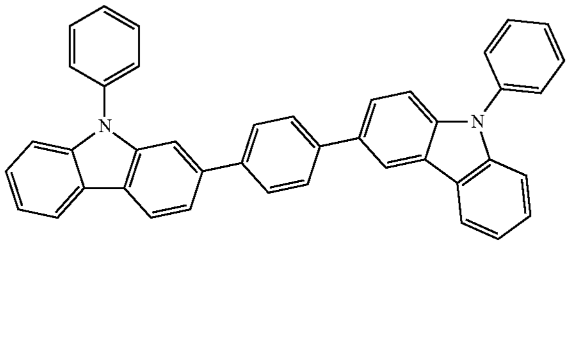

-continued
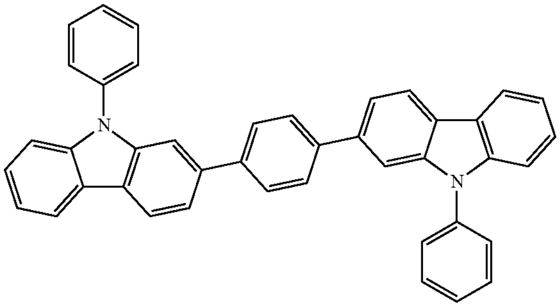
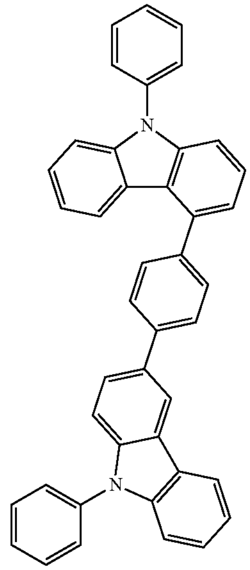
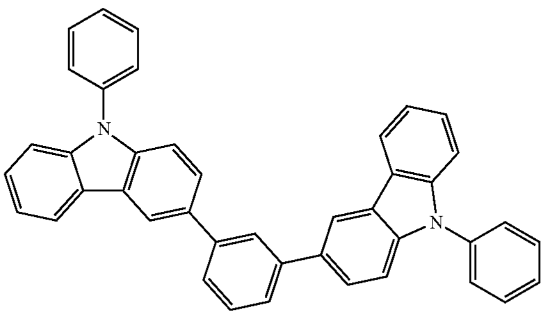
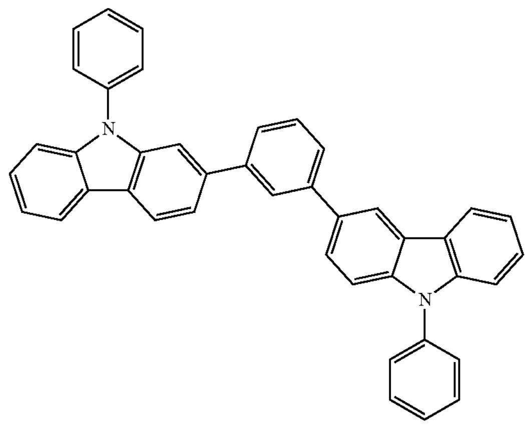
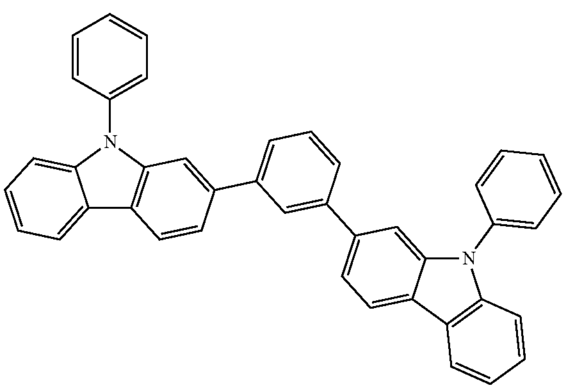
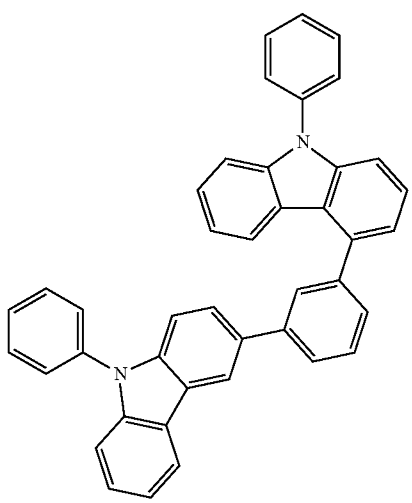

-continued
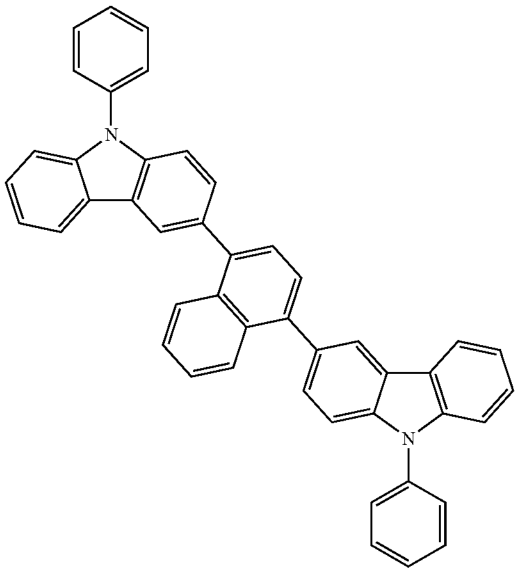
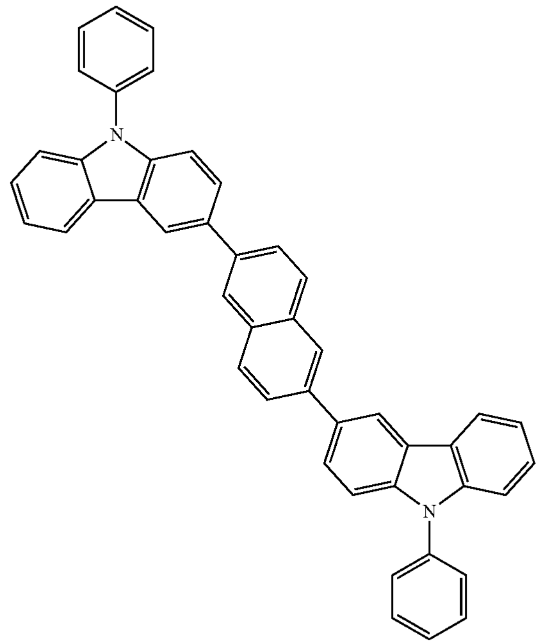
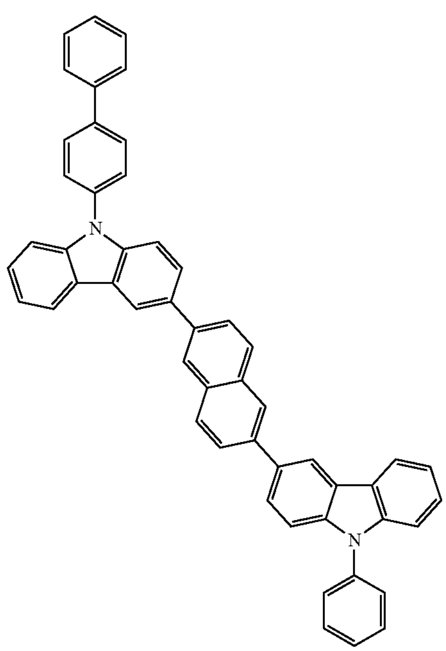
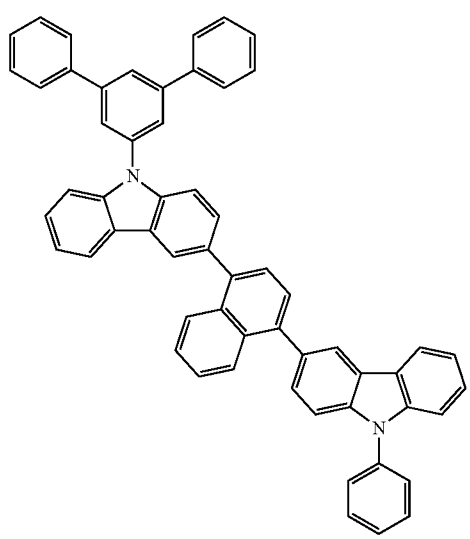

-continued
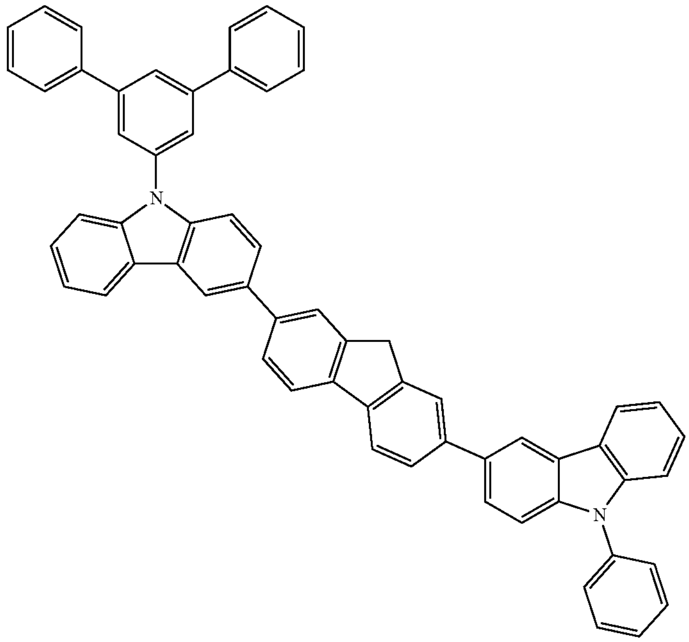
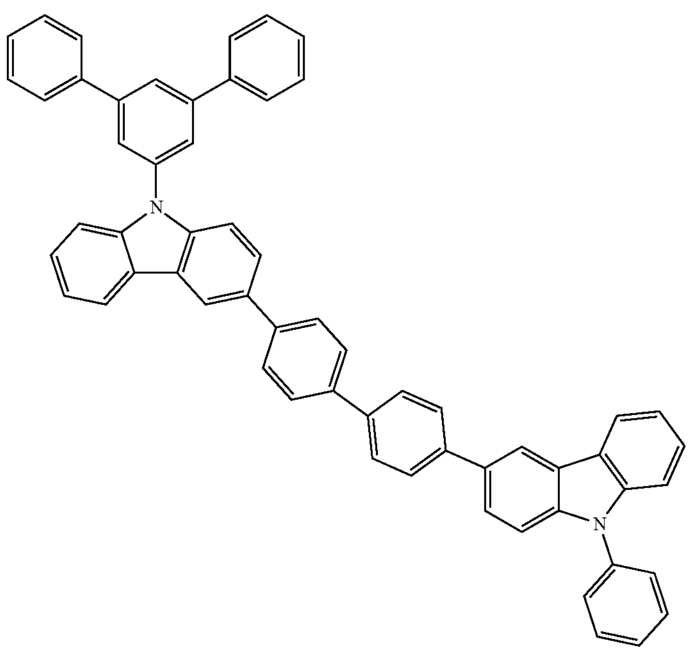

-continued
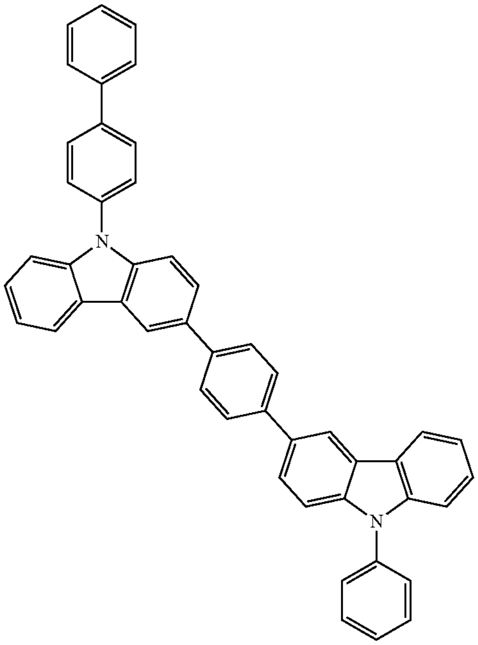
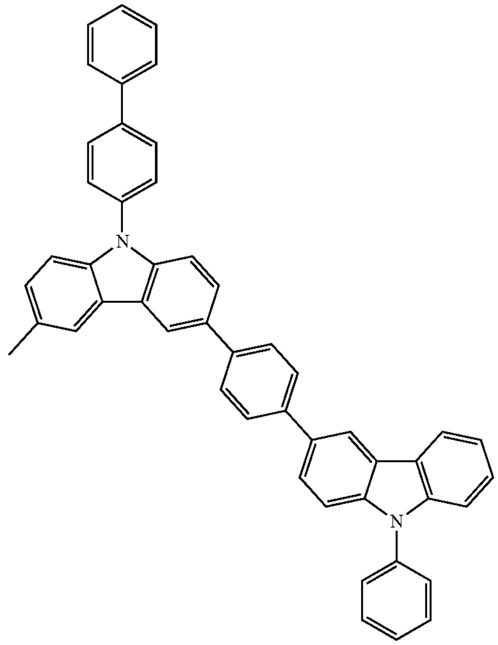
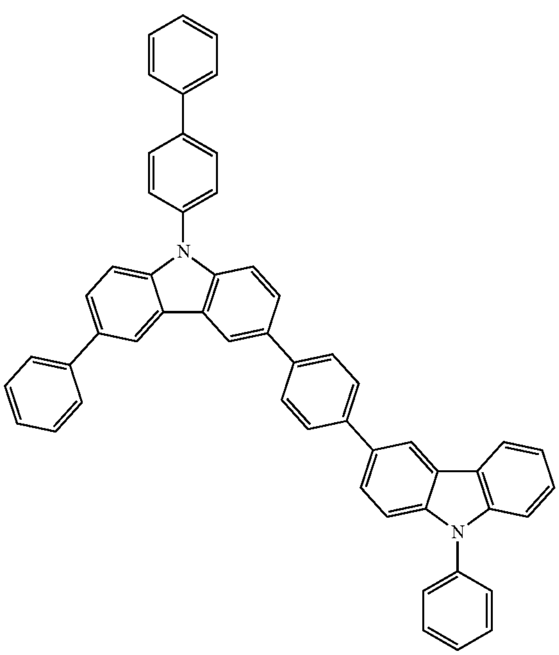
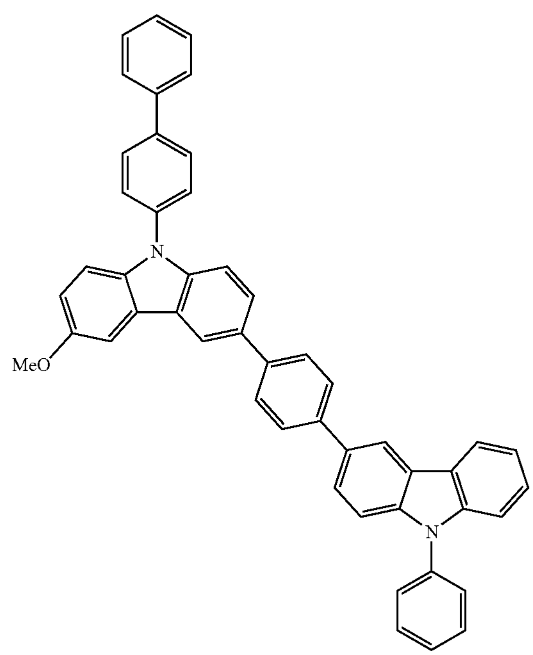

-continued
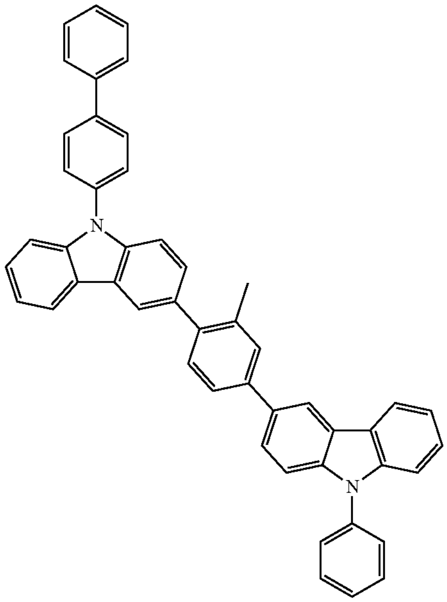
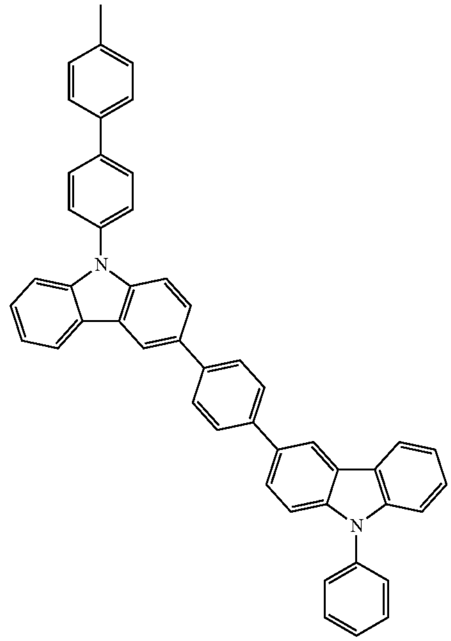
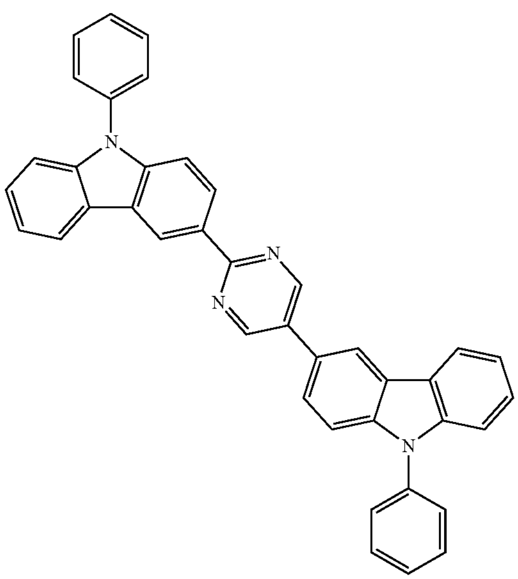
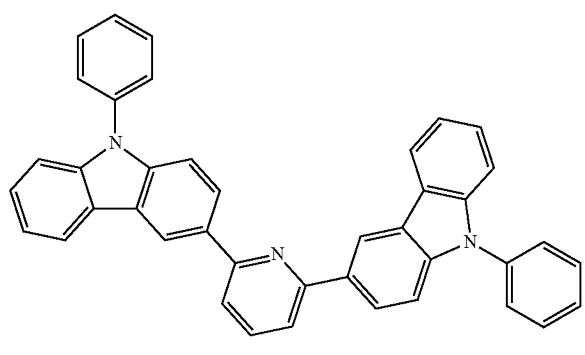

-continued
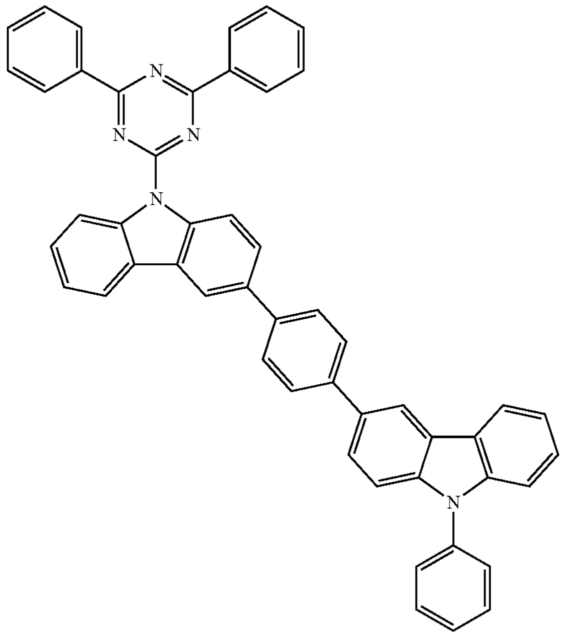
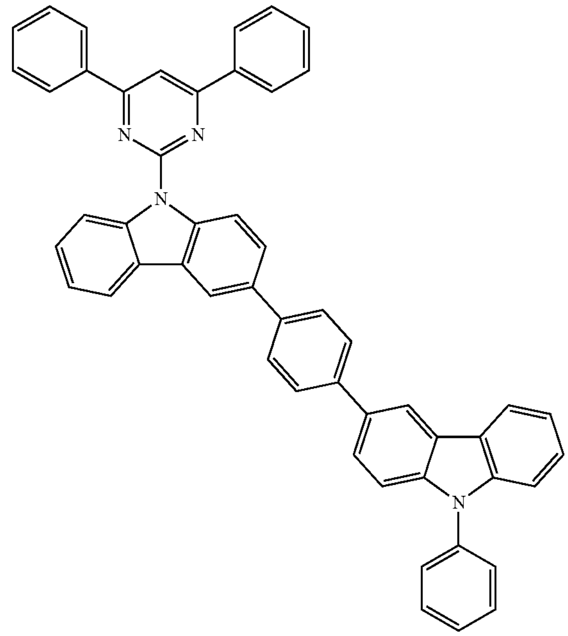
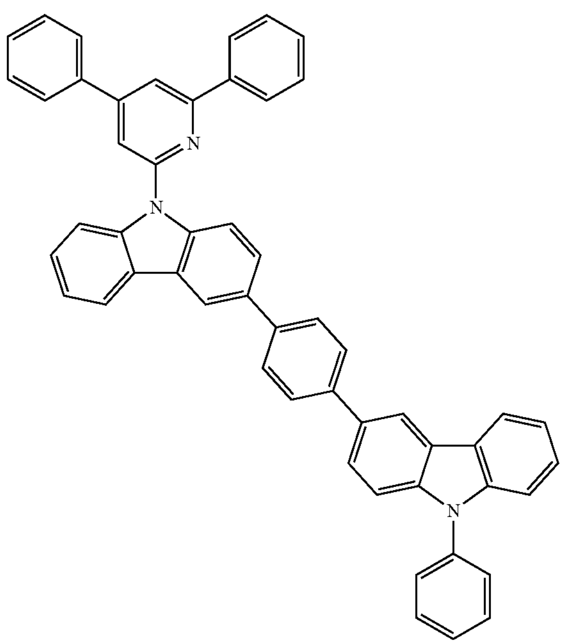
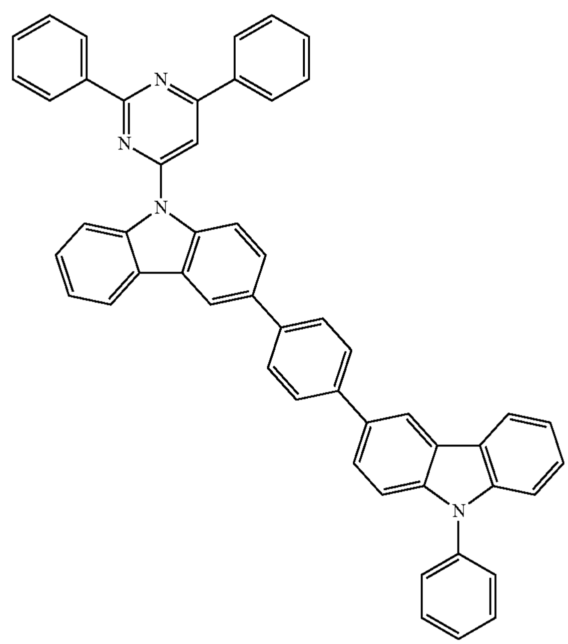

-continued
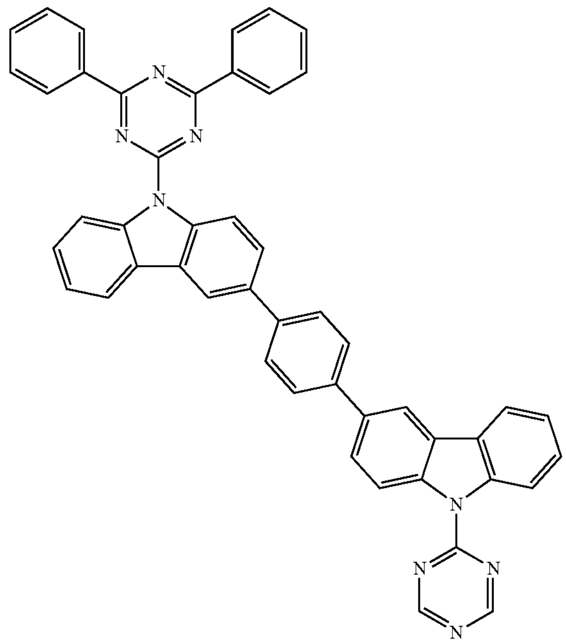
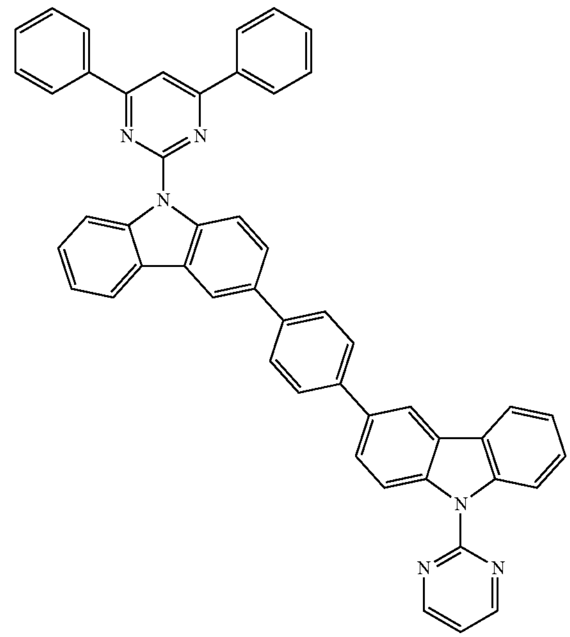
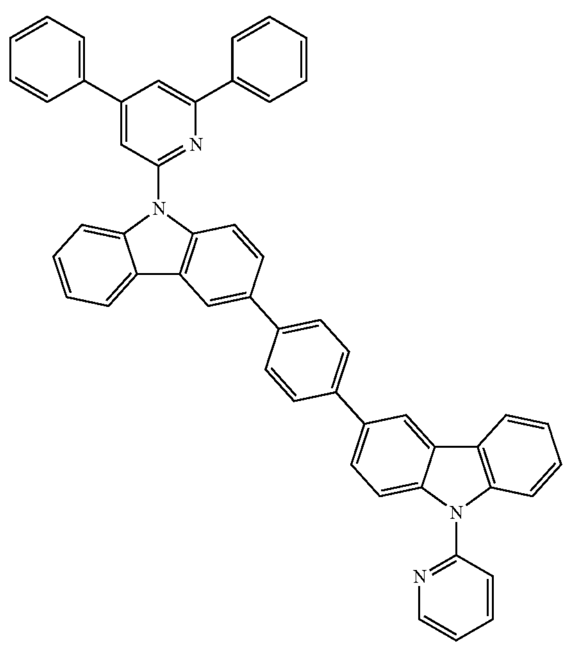
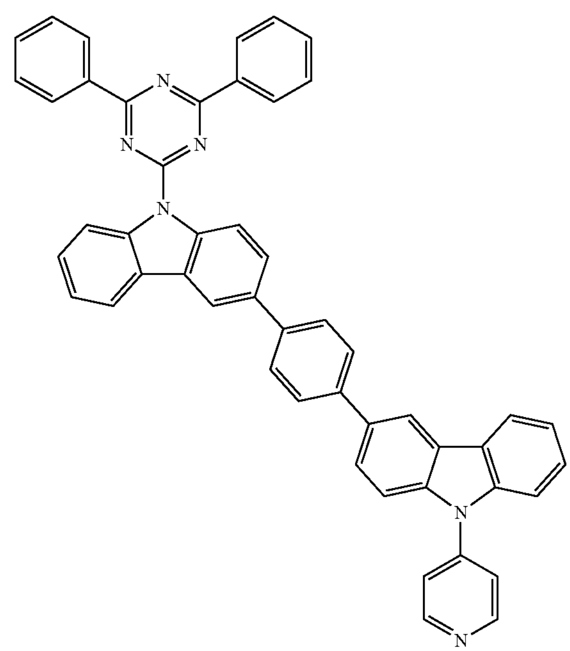

-continued
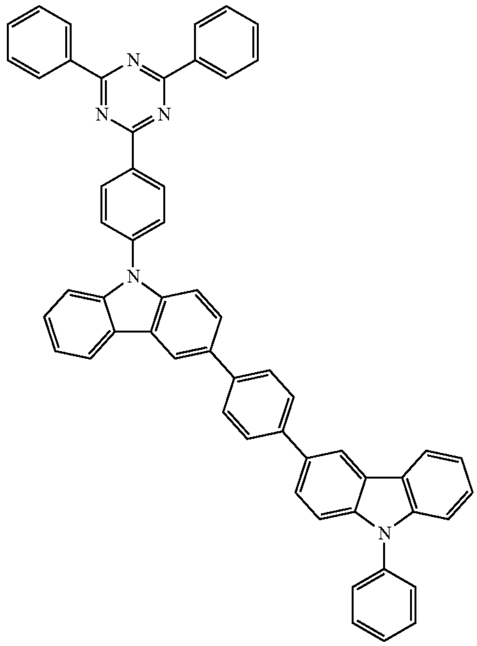
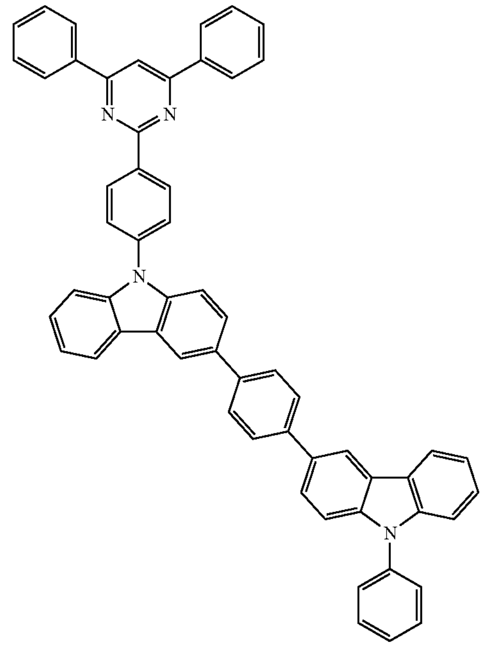
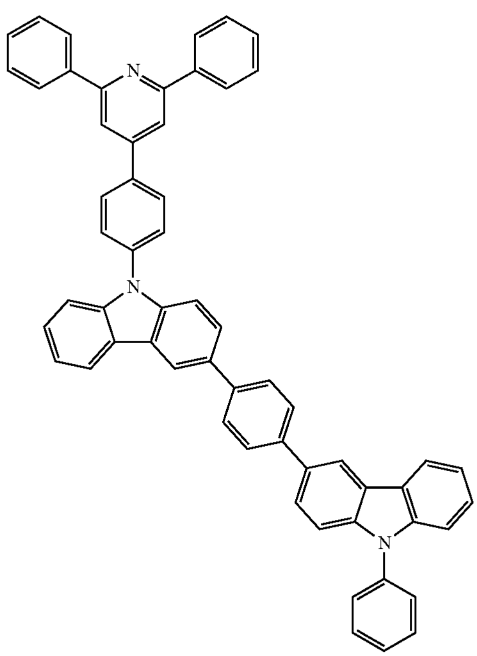
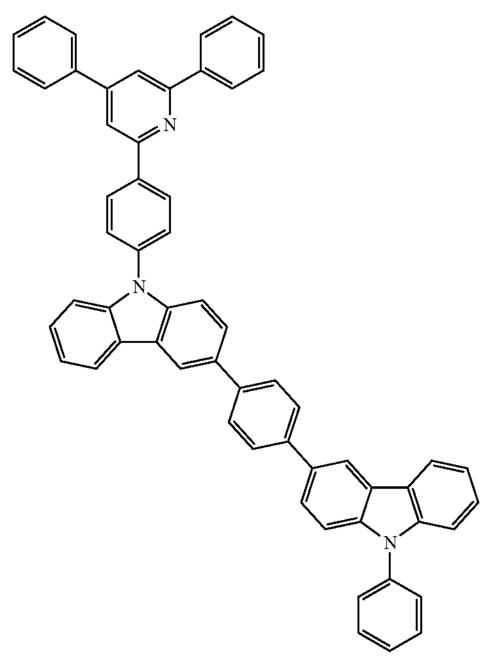

-continued
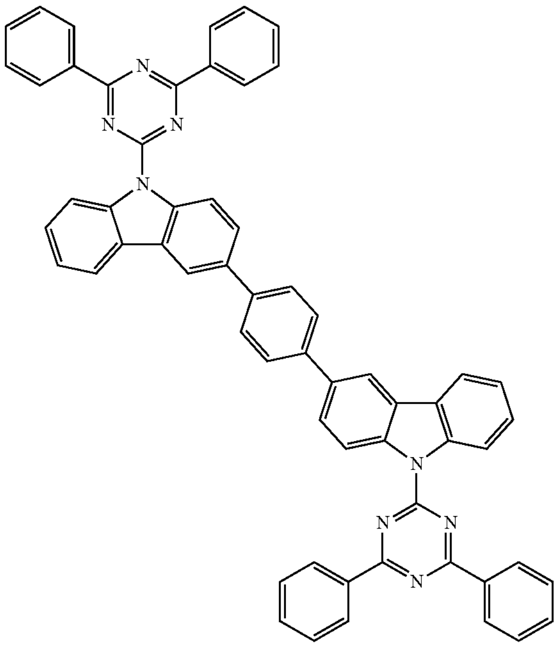
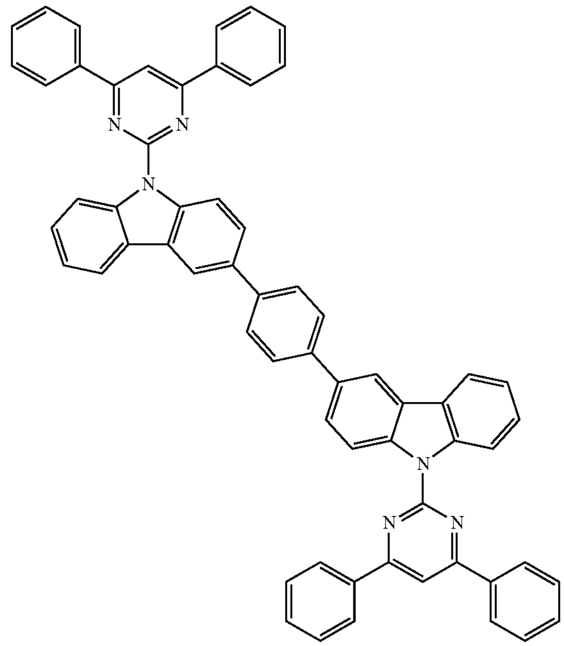
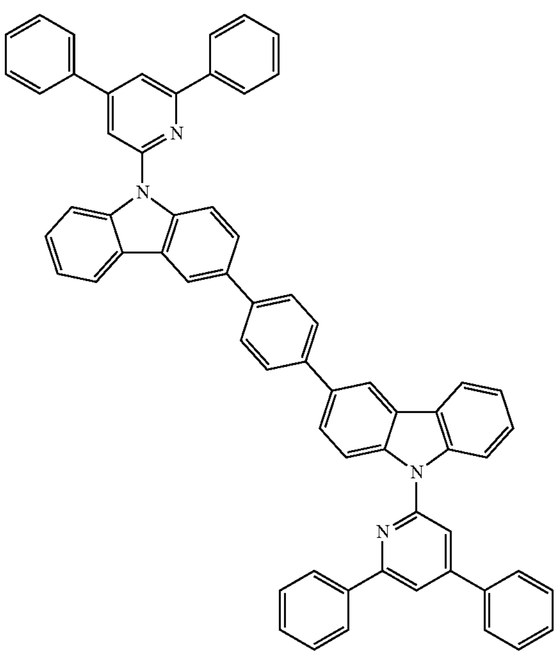
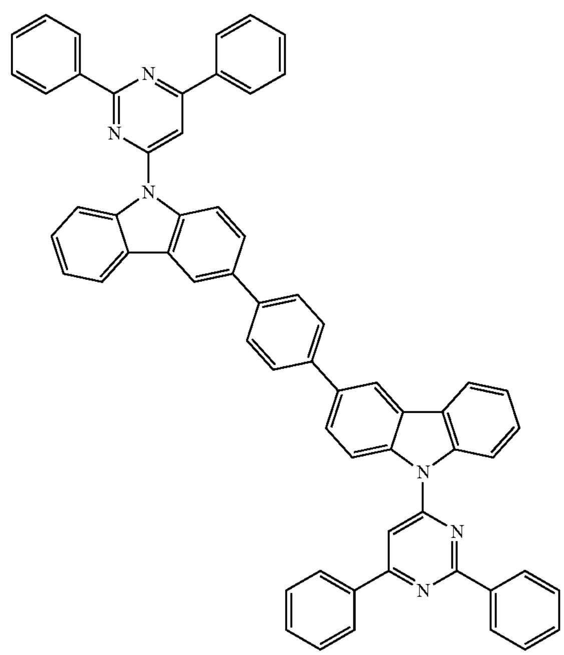

-continued
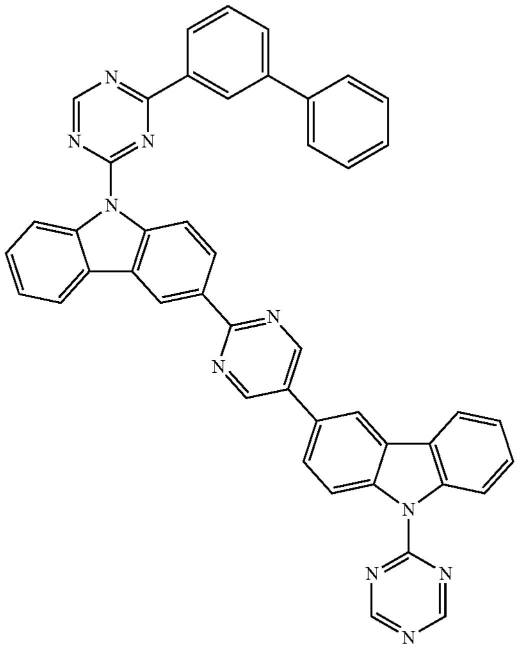
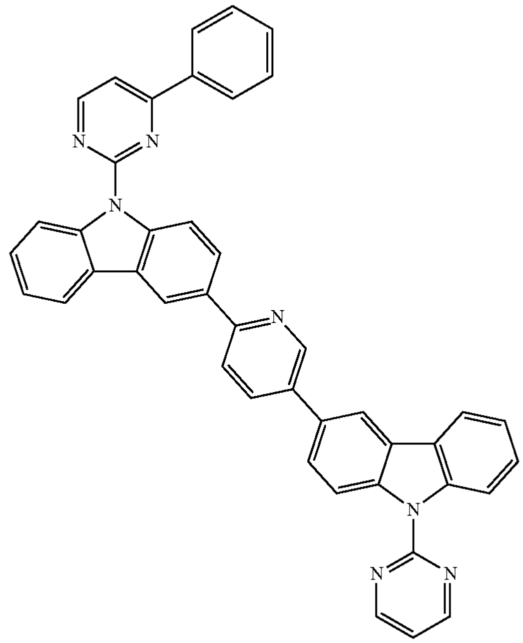
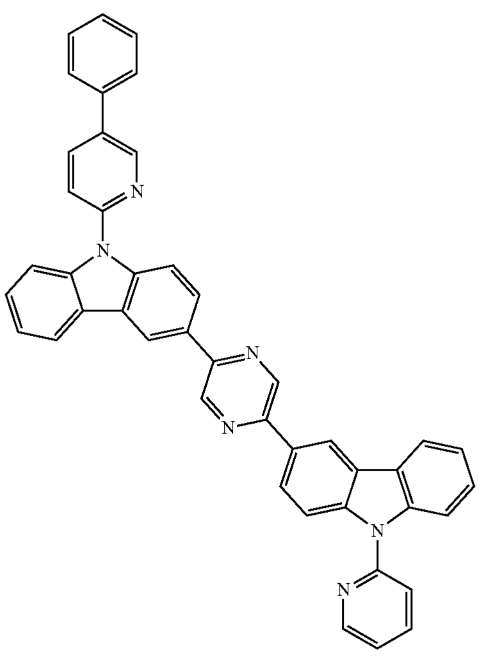
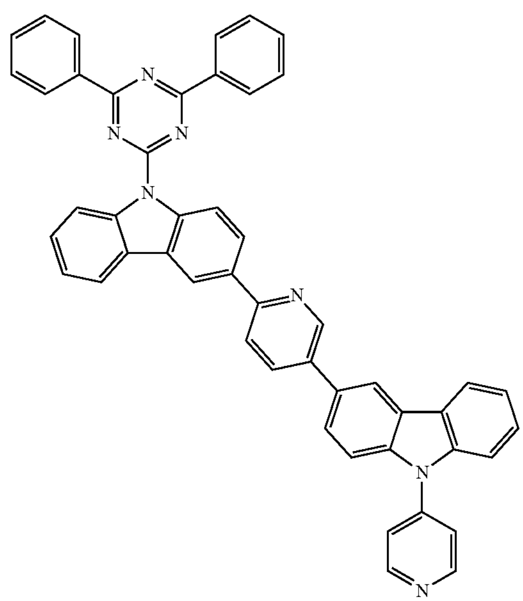

-continued
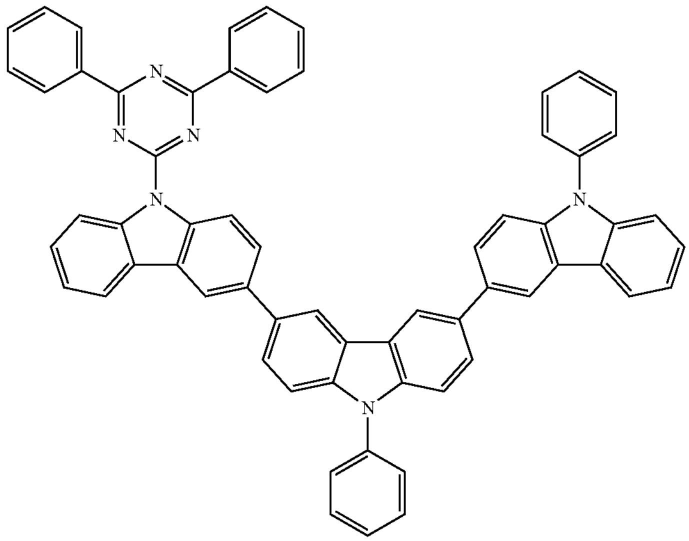
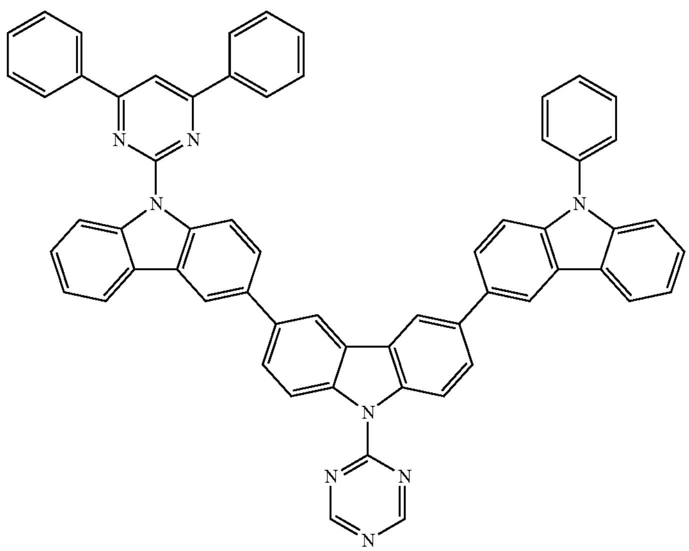
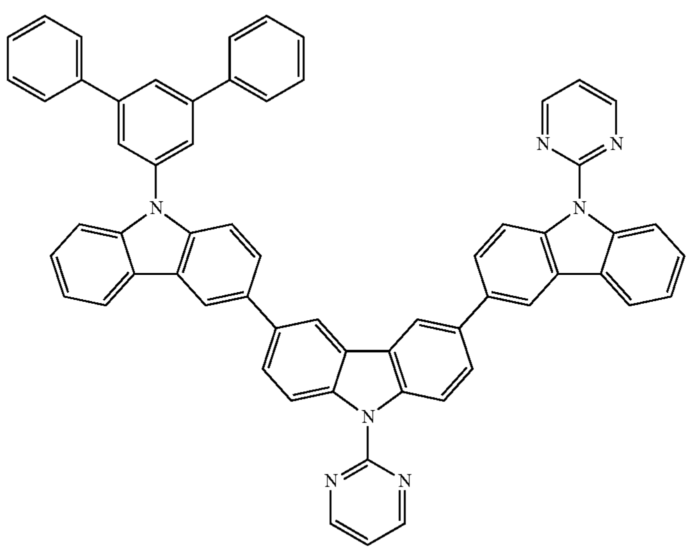

-continued
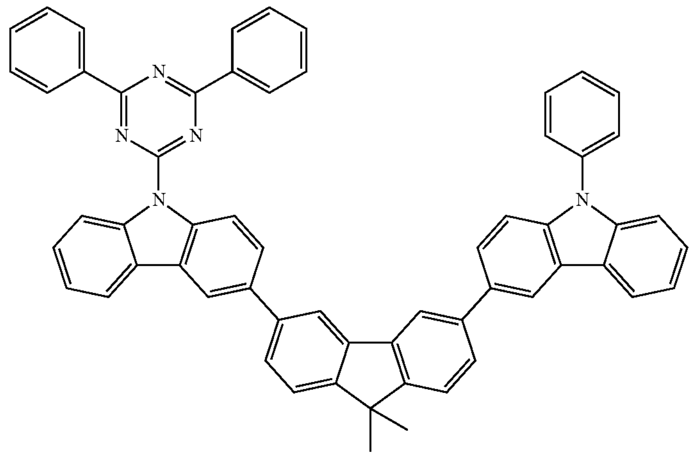
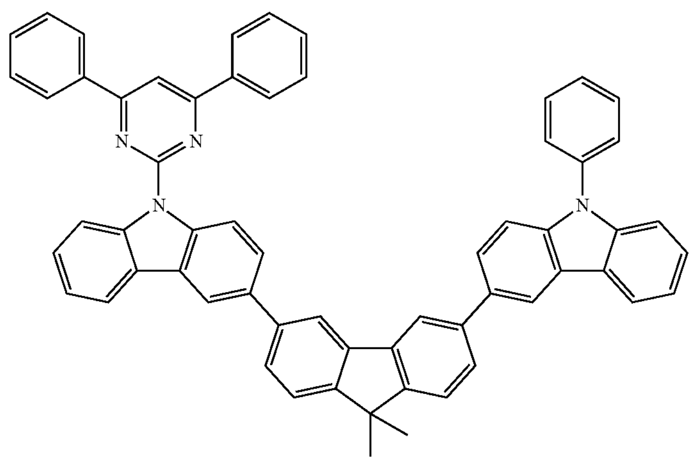
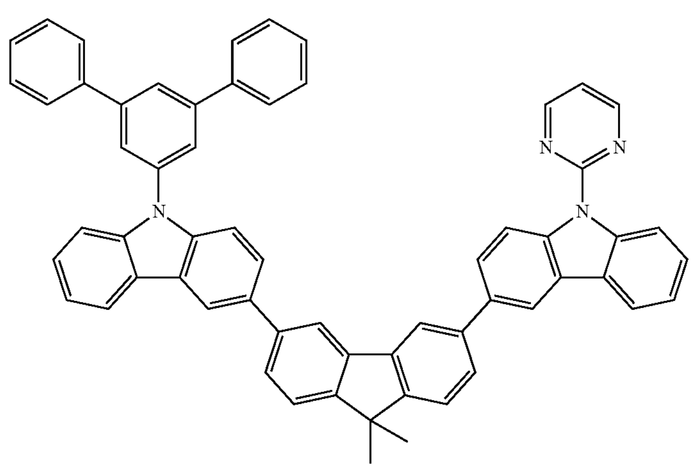

-continued
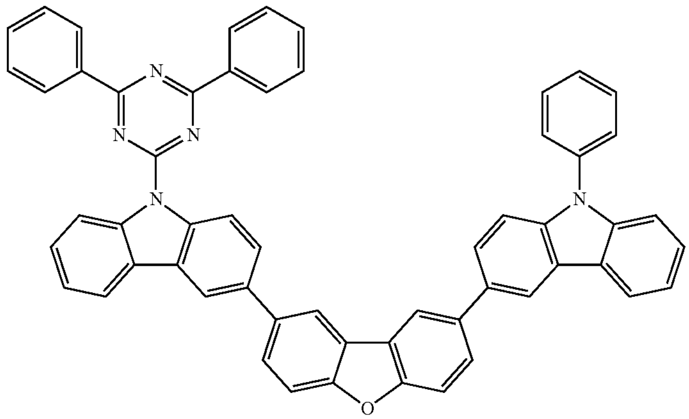
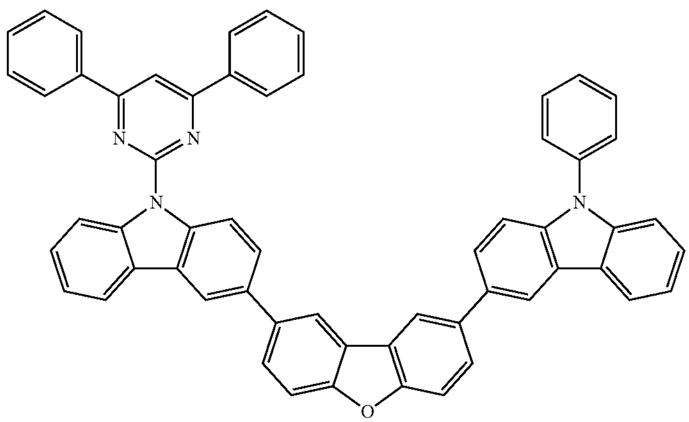
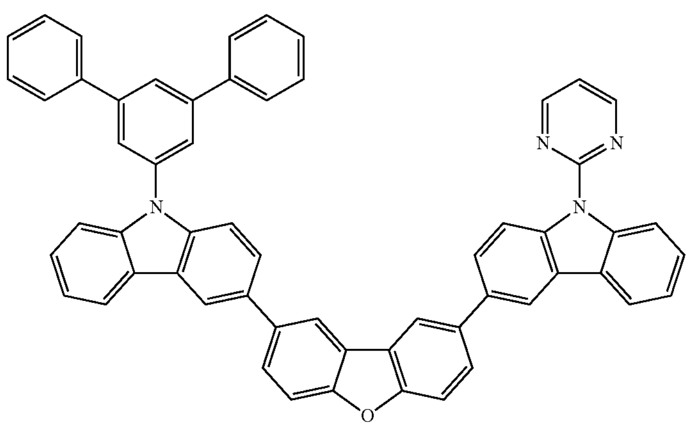
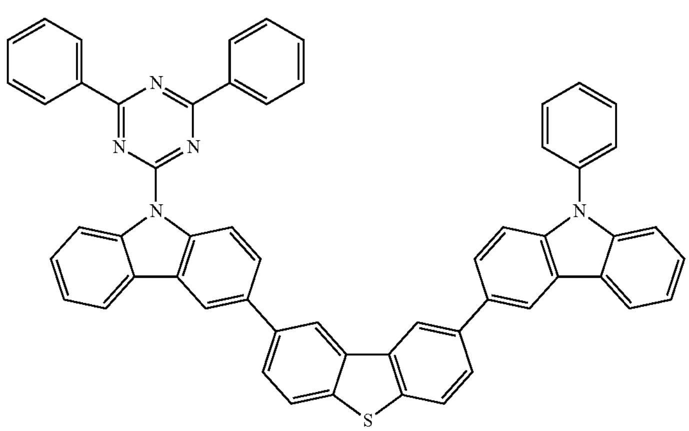

-continued
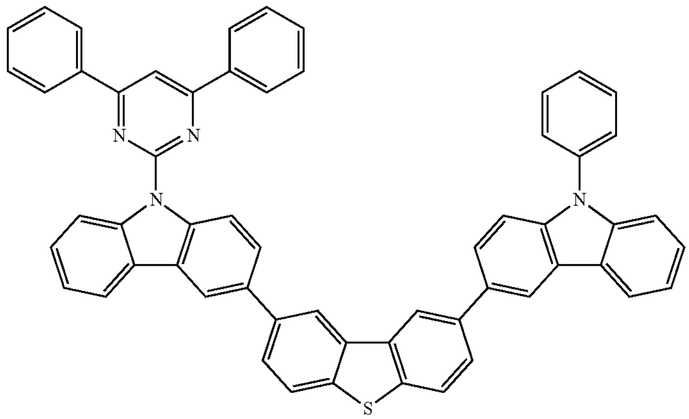
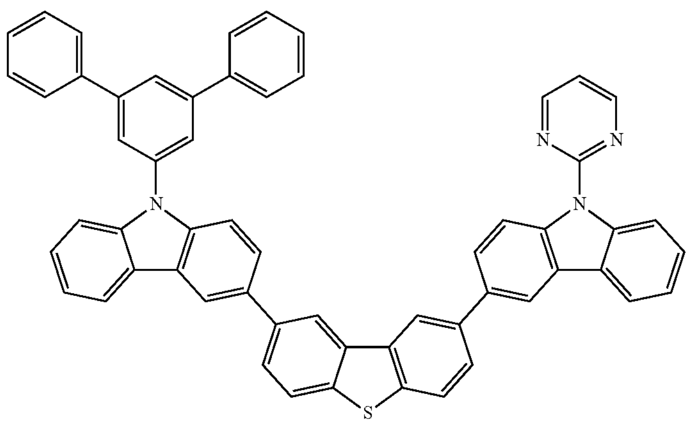
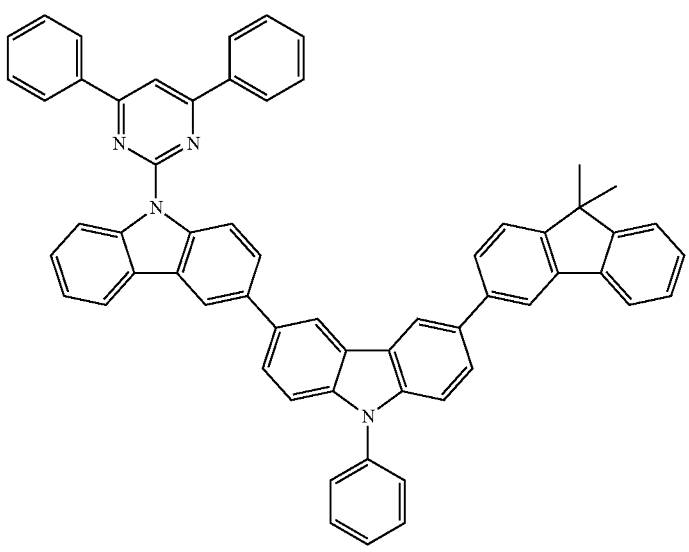

-continued
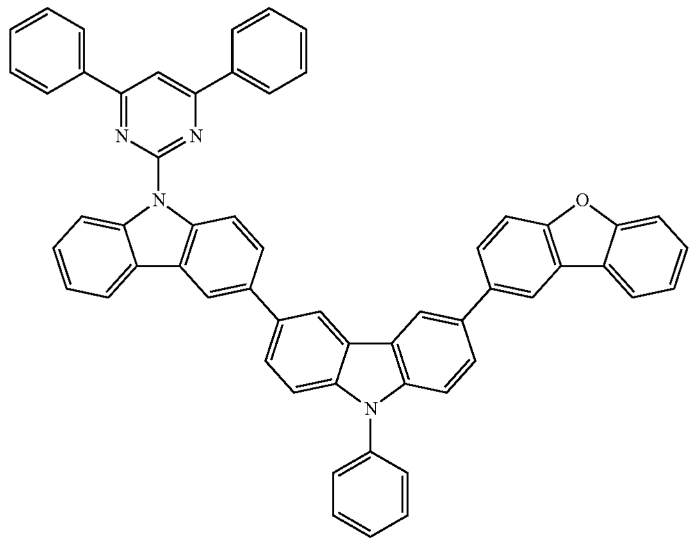
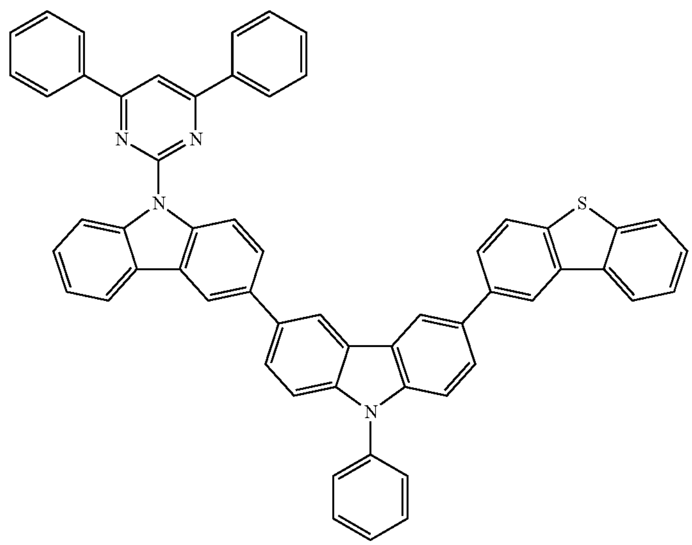
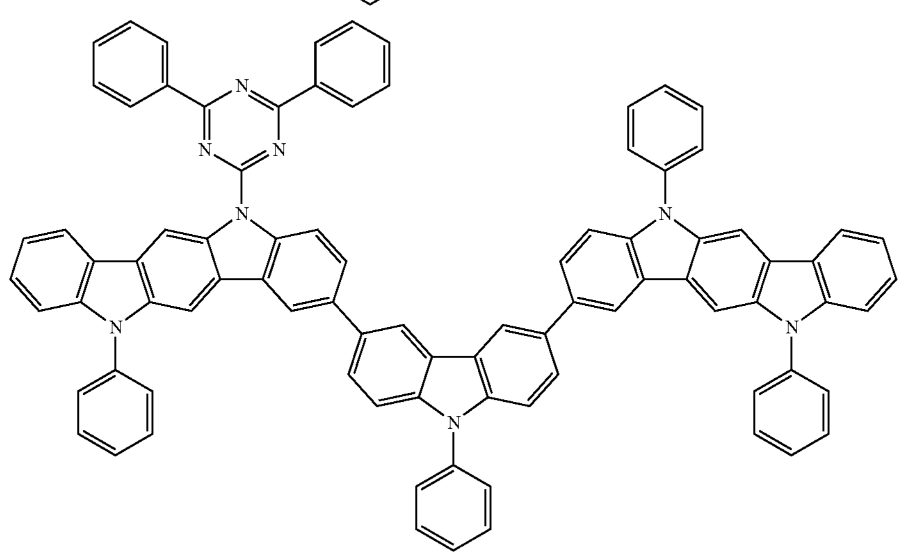

-continued
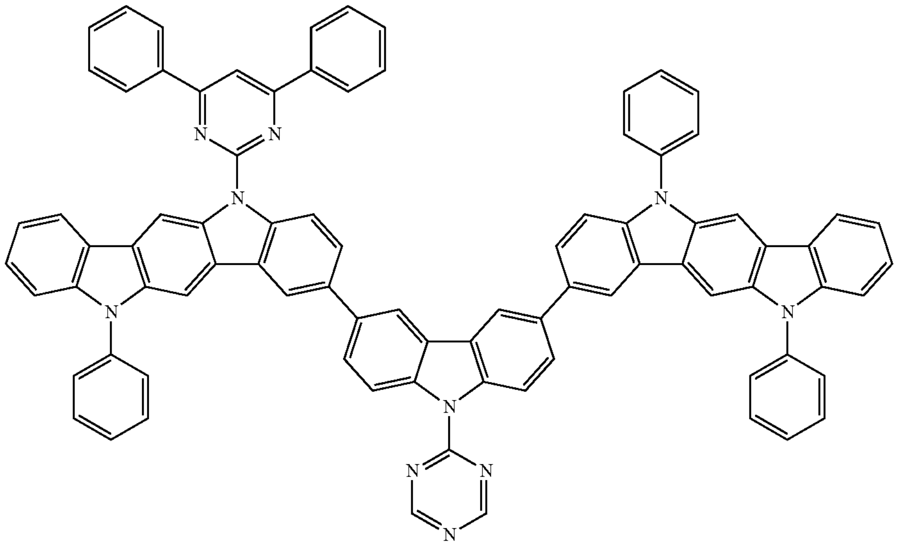
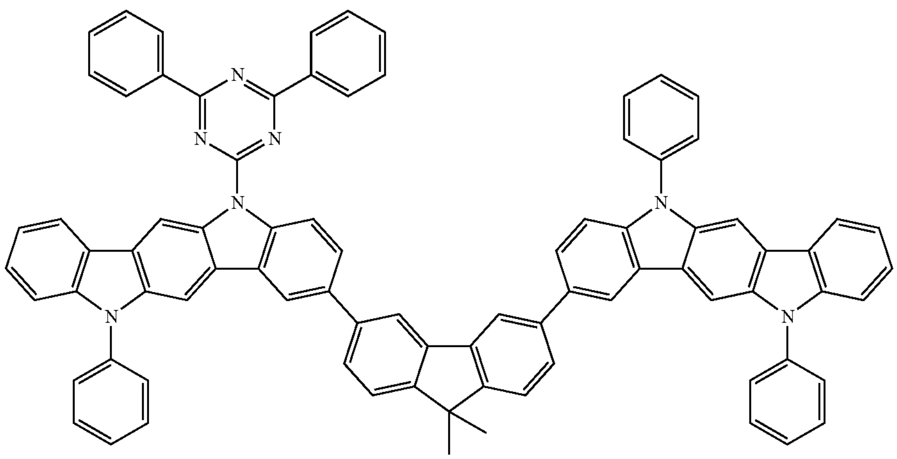
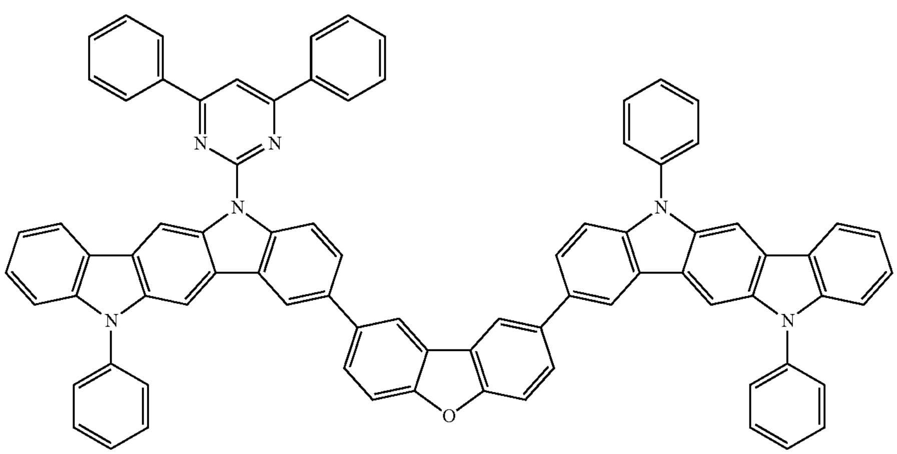

-continued
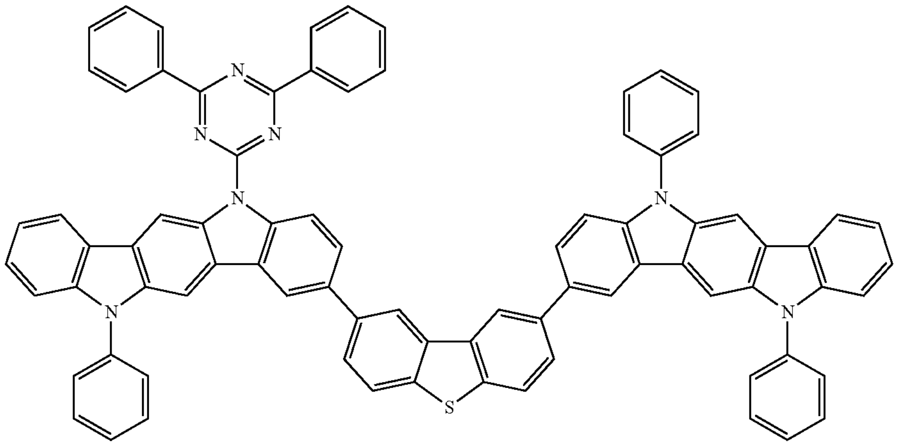
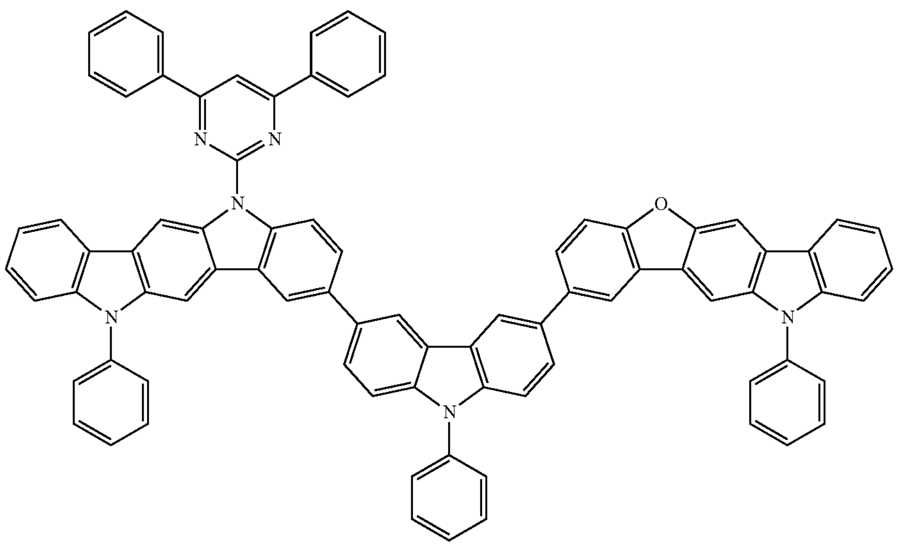
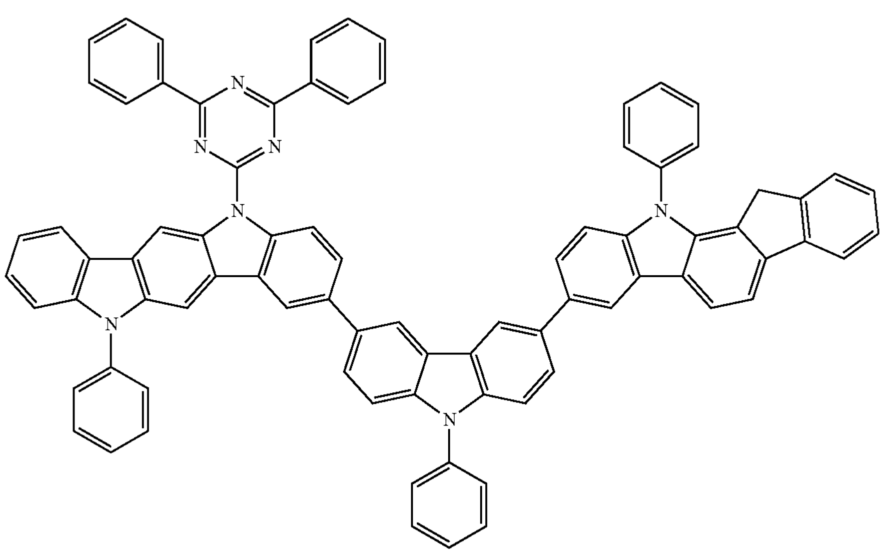

-continued
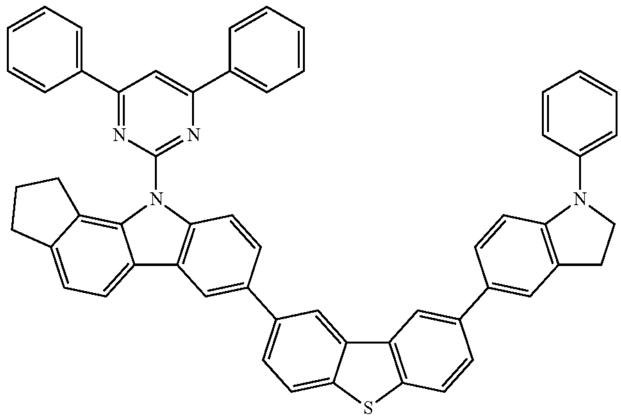
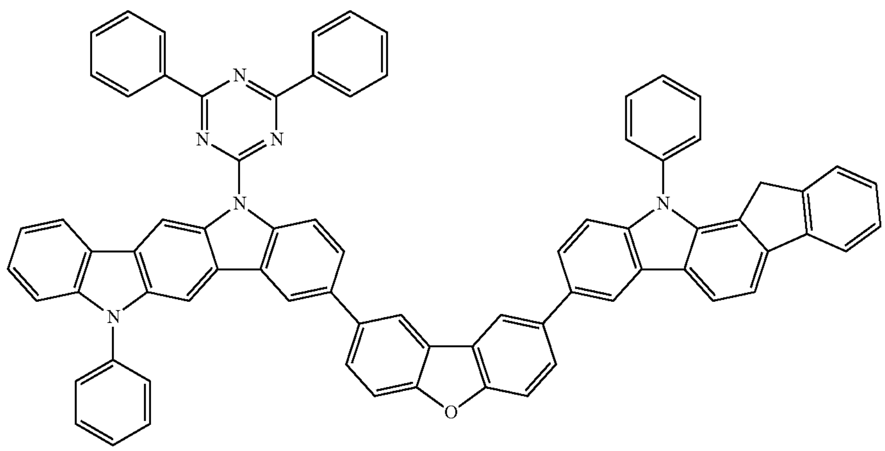
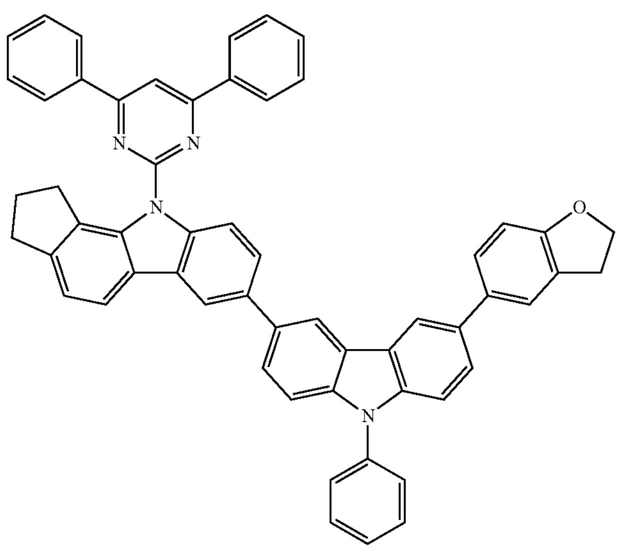

-continued
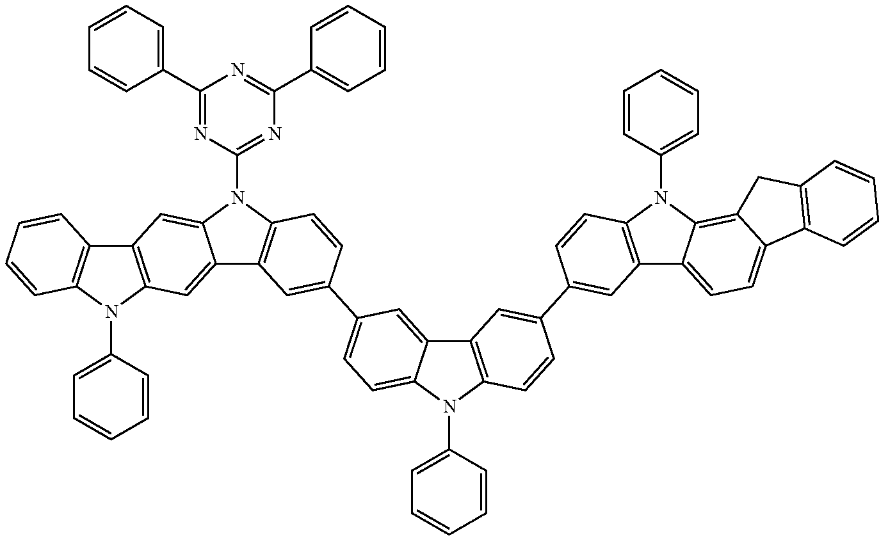
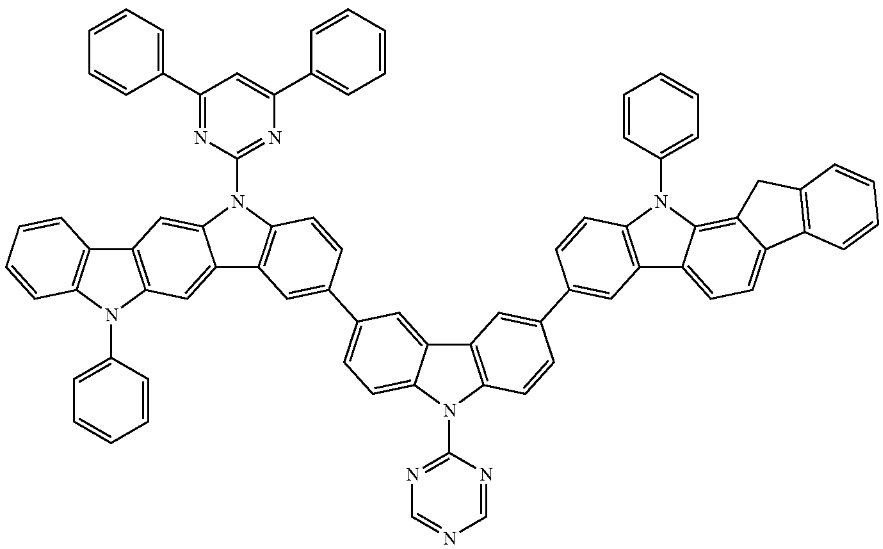
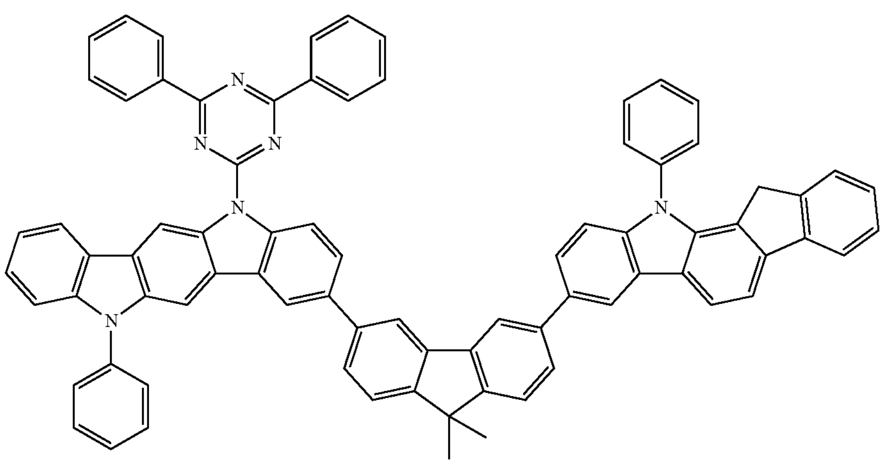

-continued
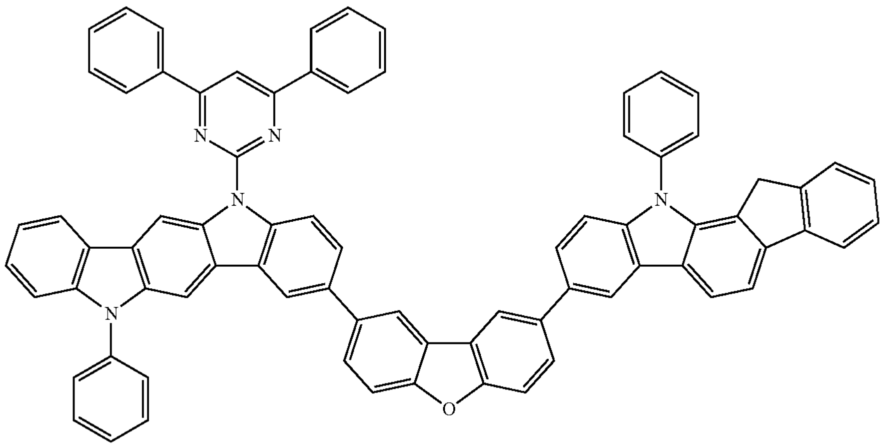
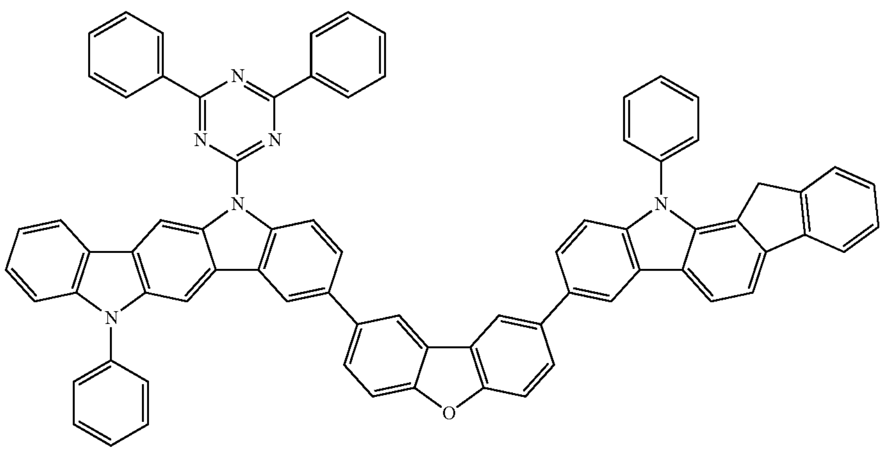
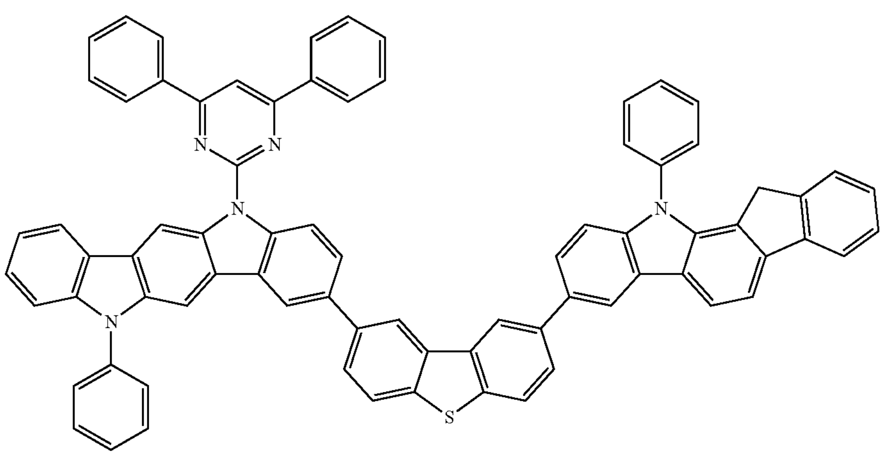

-continued
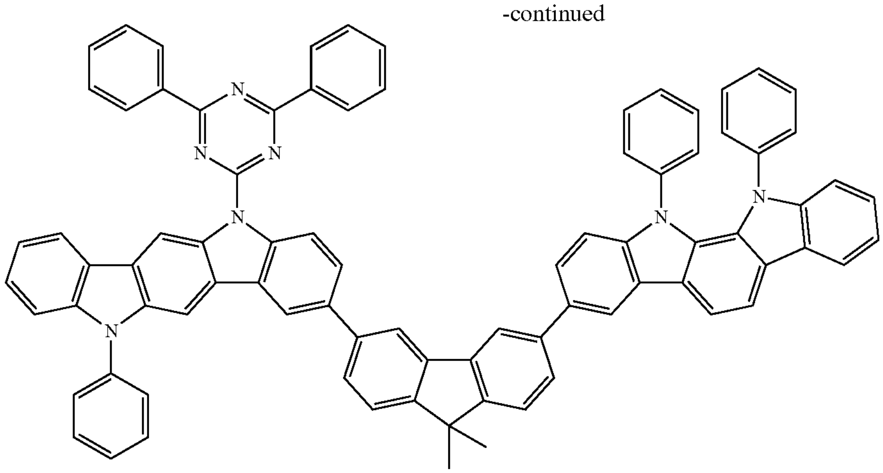
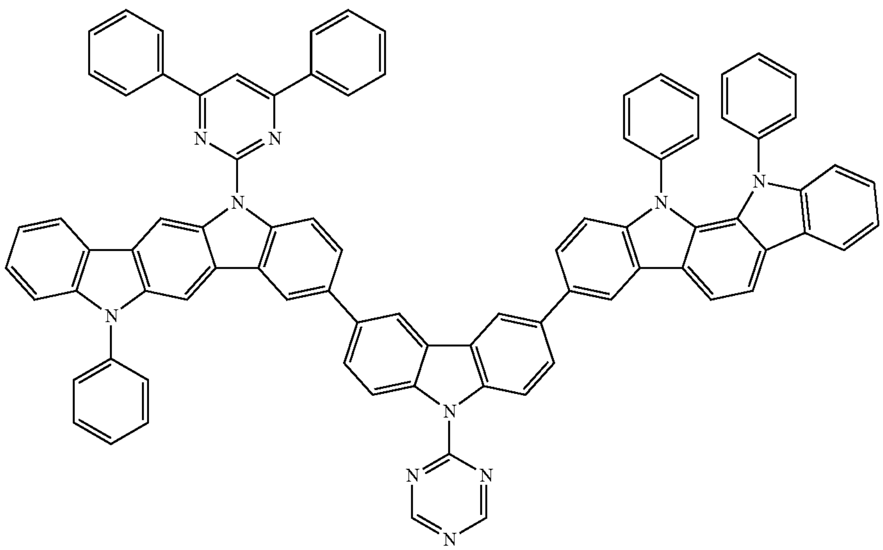
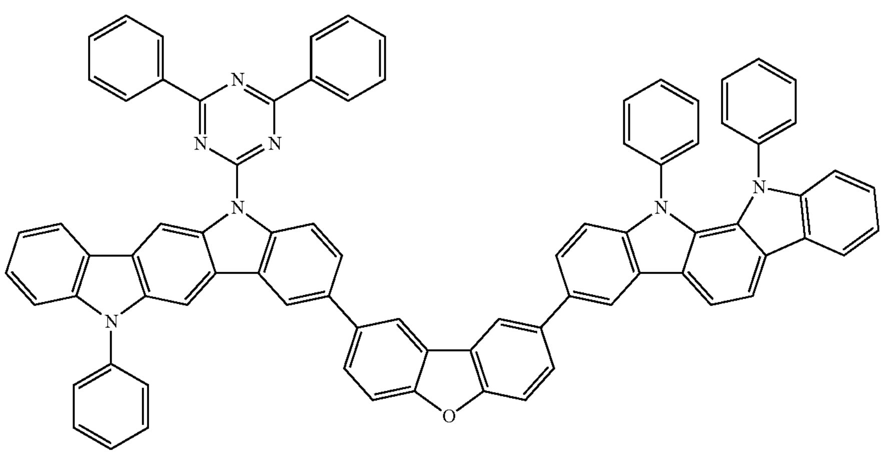

-continued
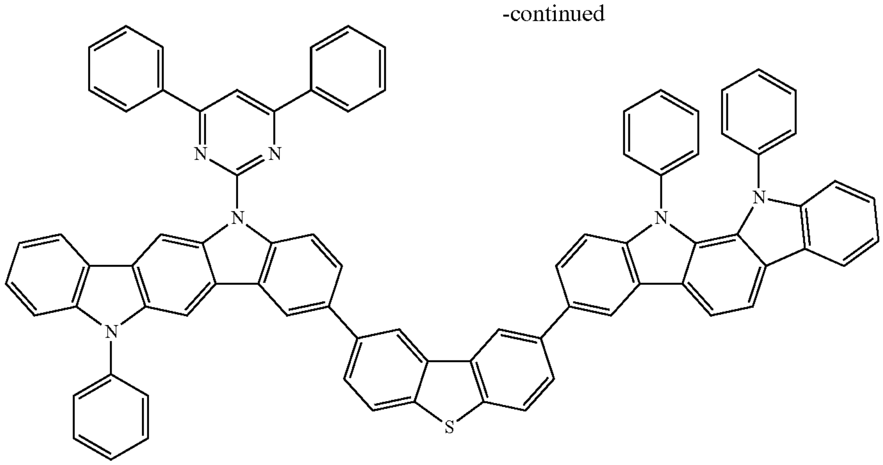
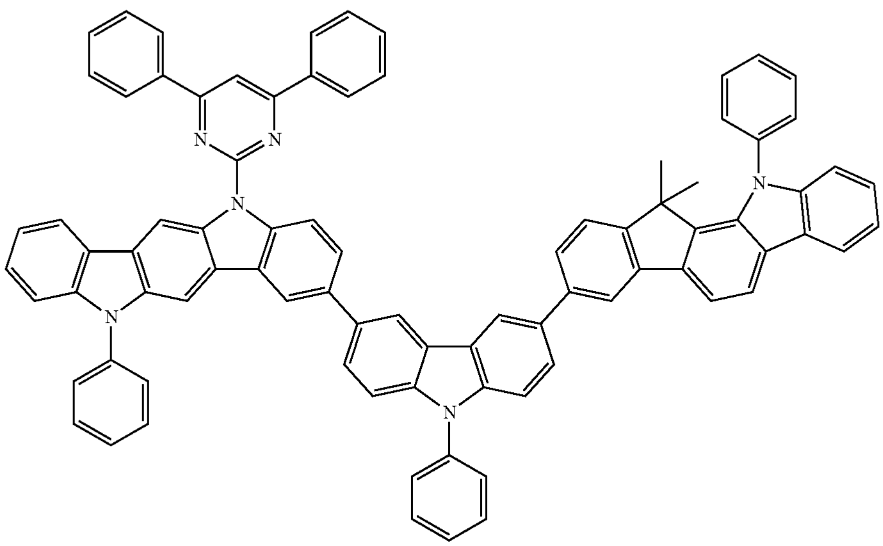
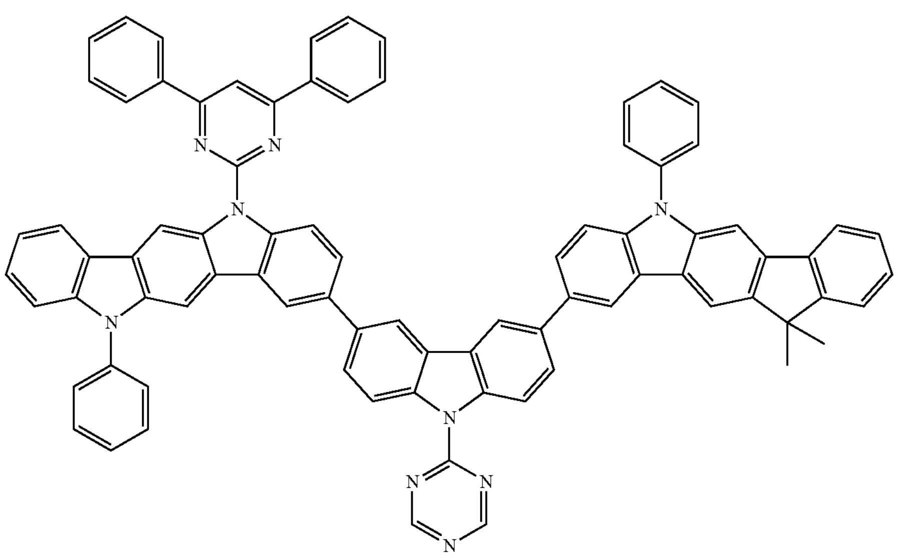

-continued
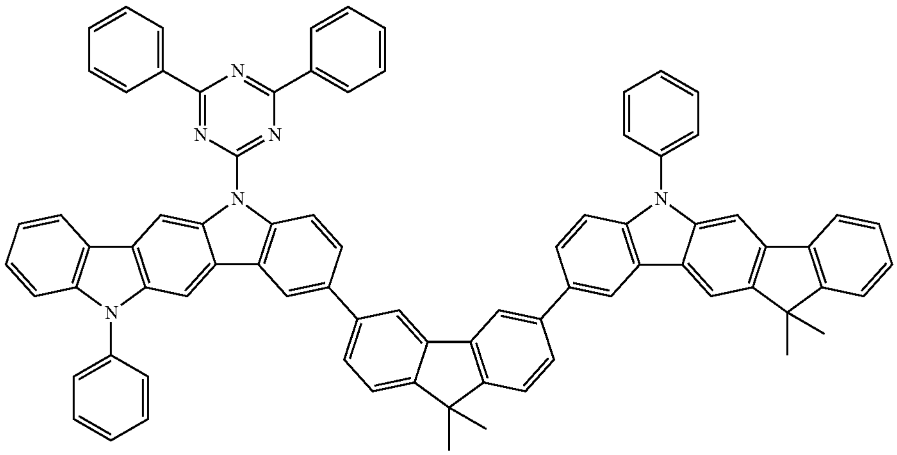
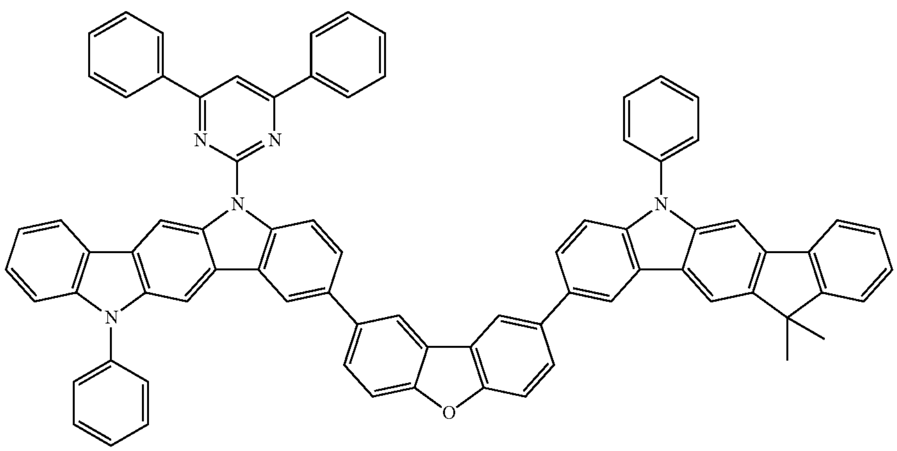
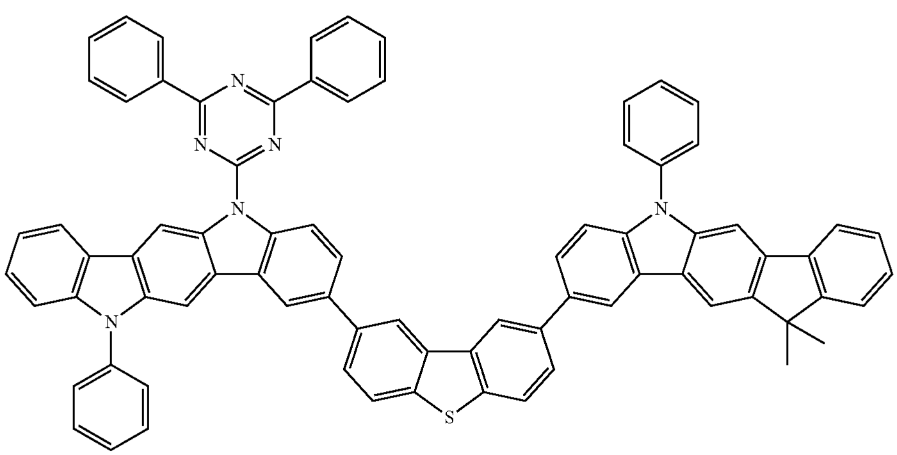

-continued
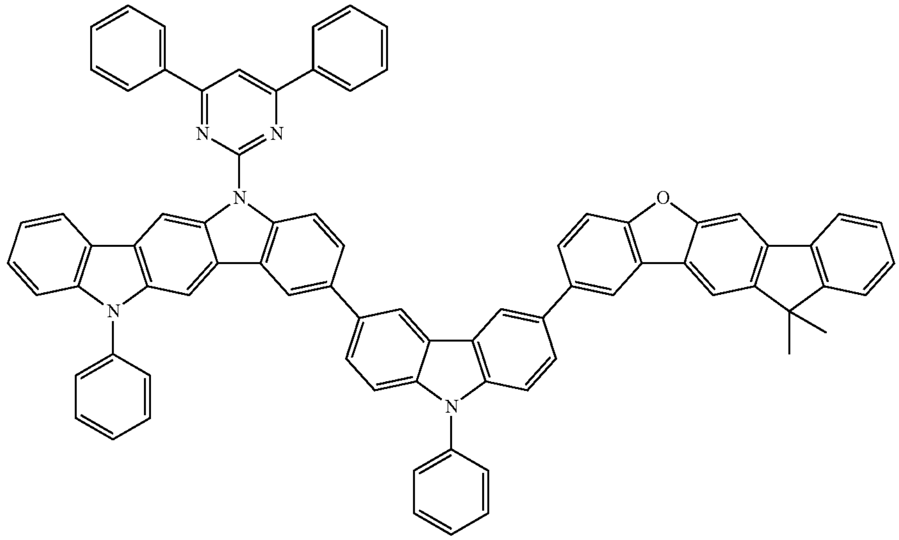
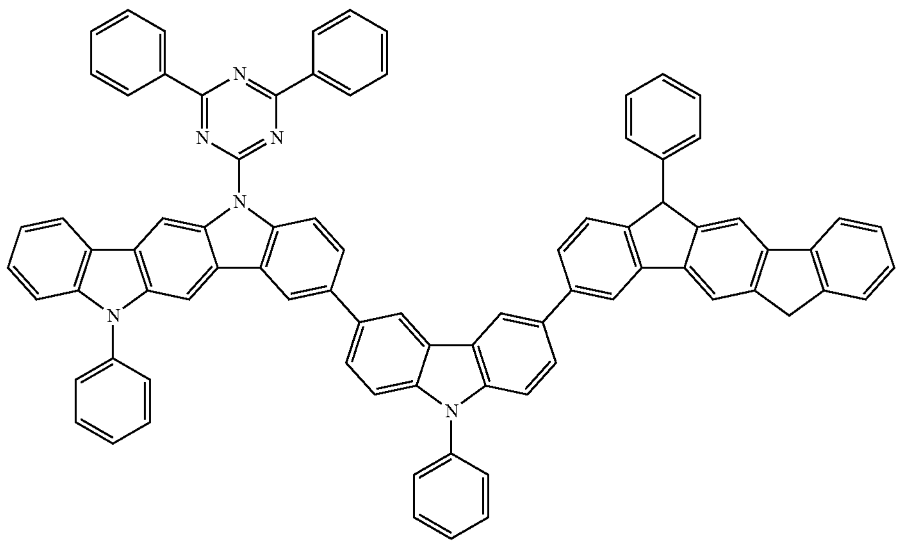
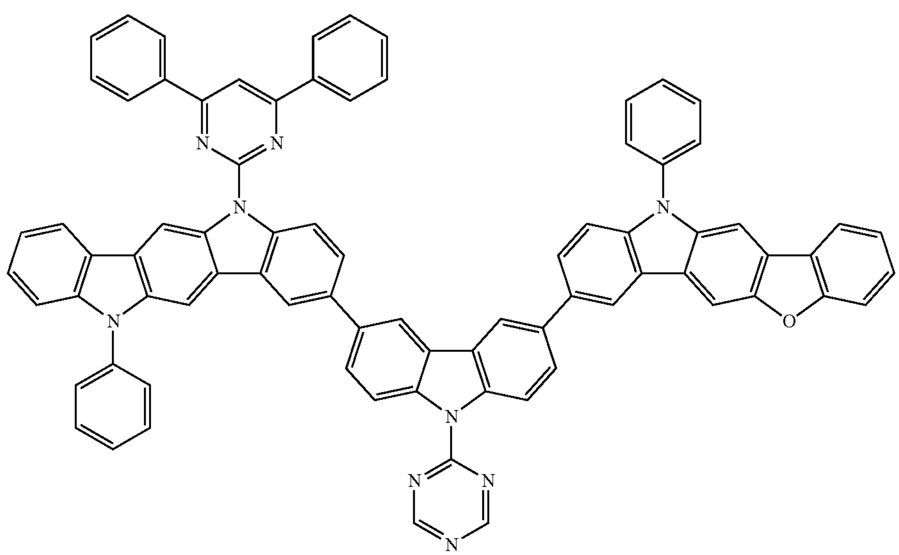

-continued
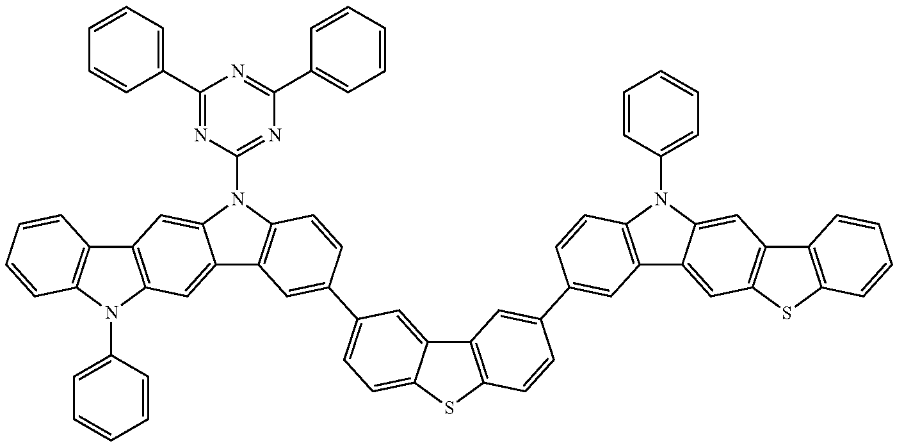
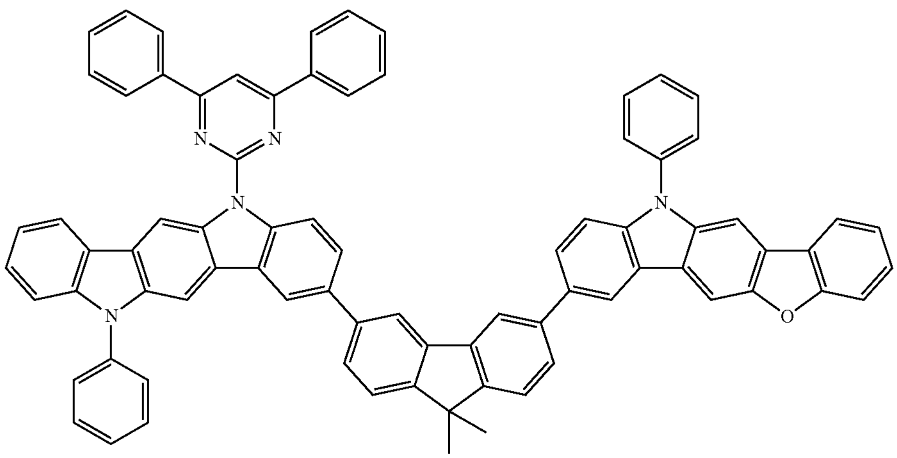
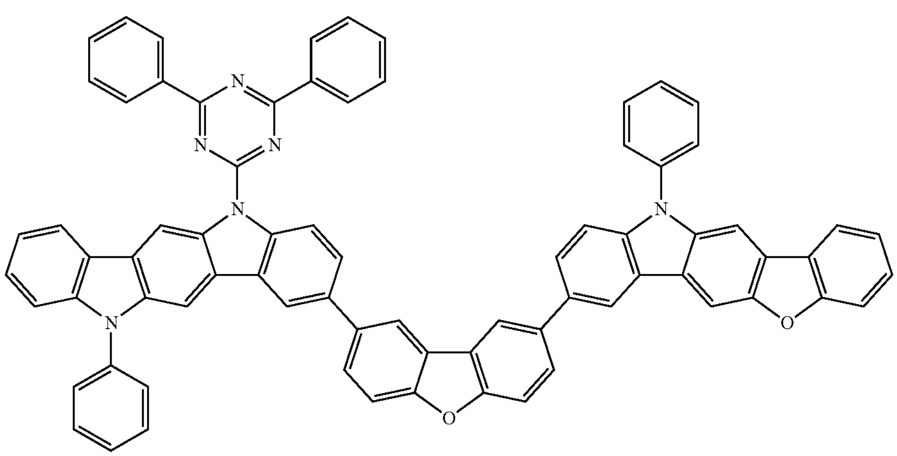

-continued
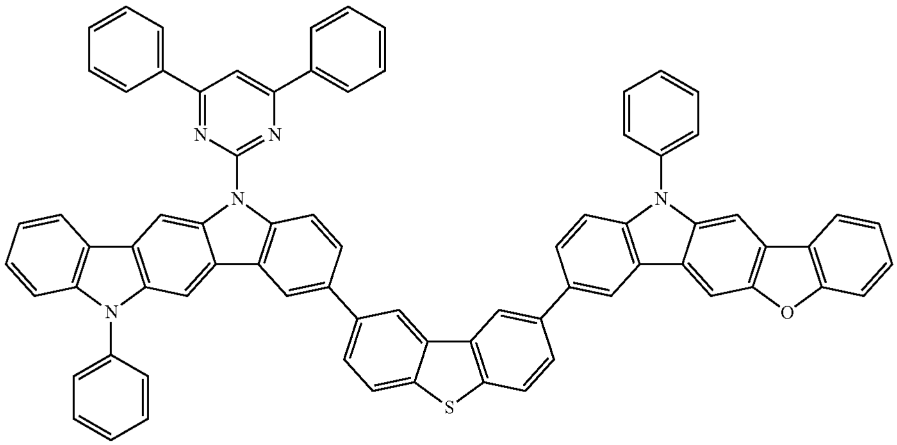
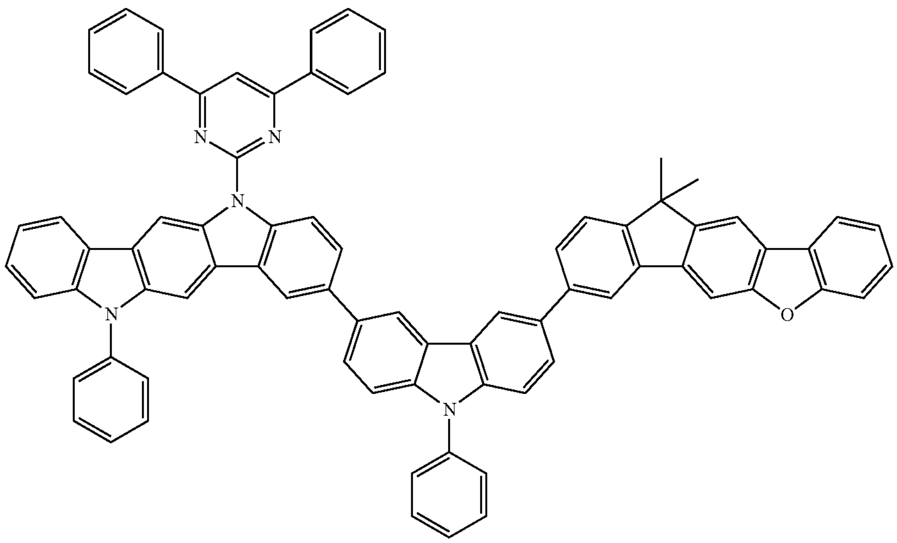
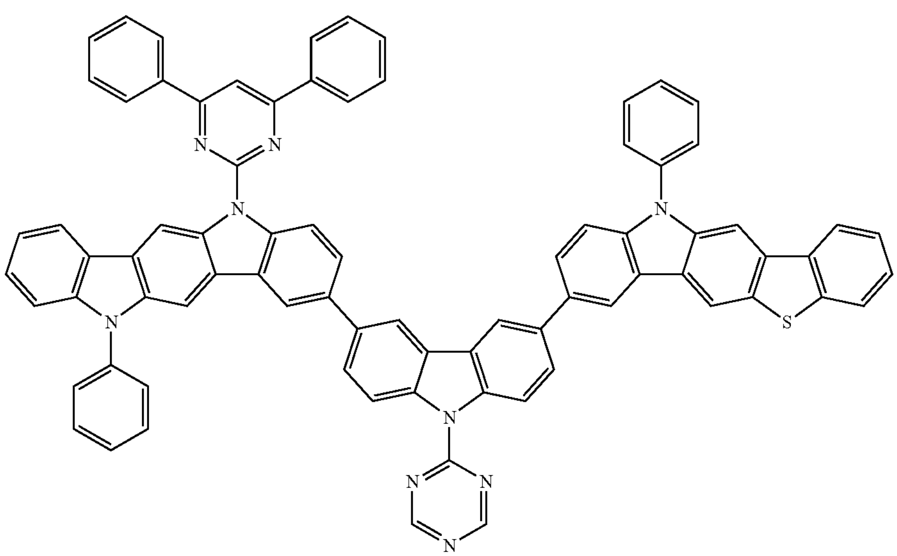

-continued
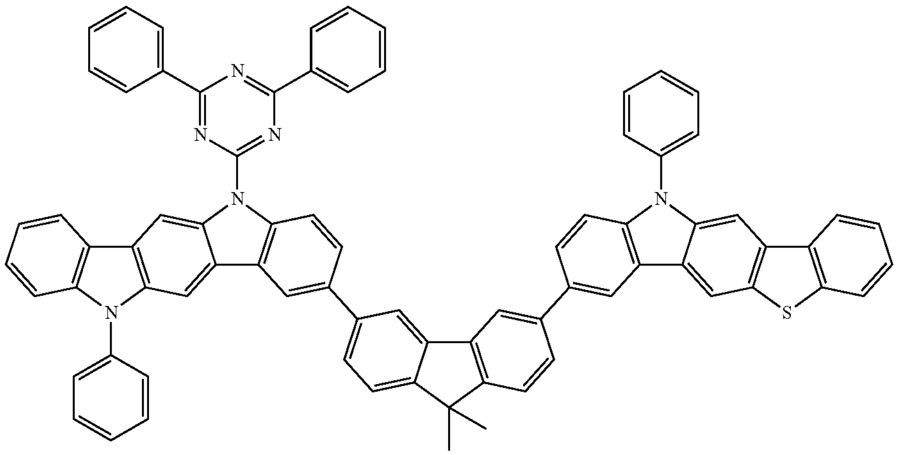
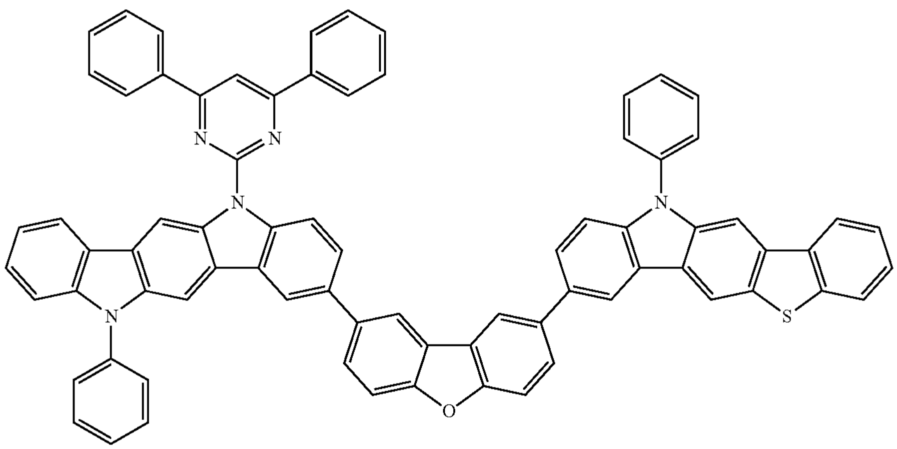
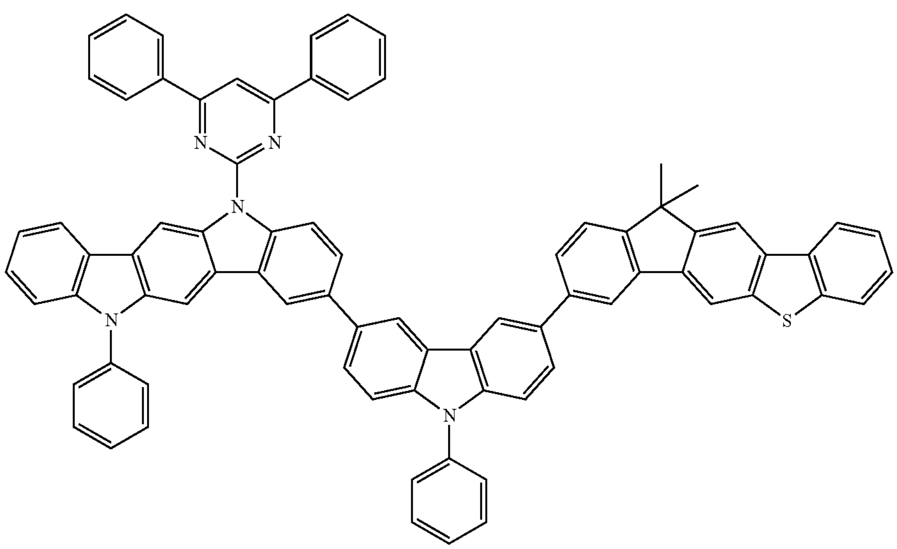

-continued
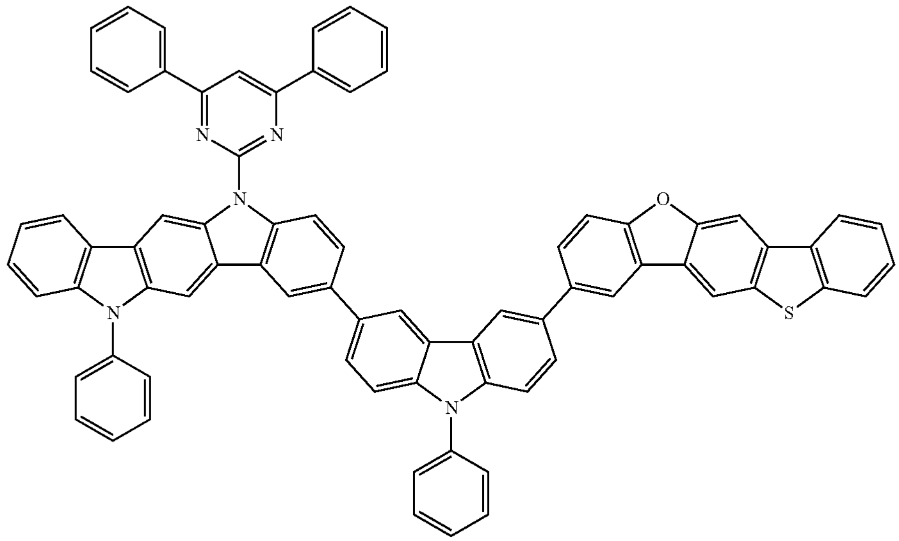
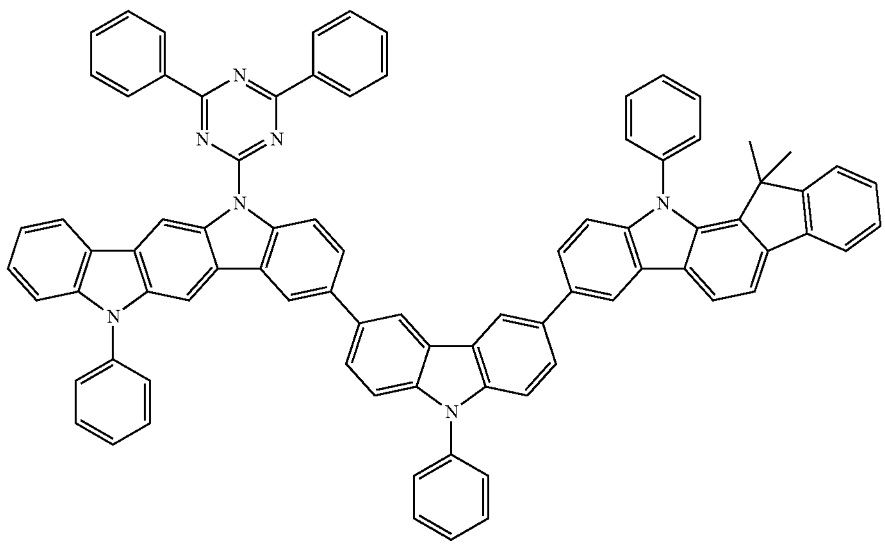
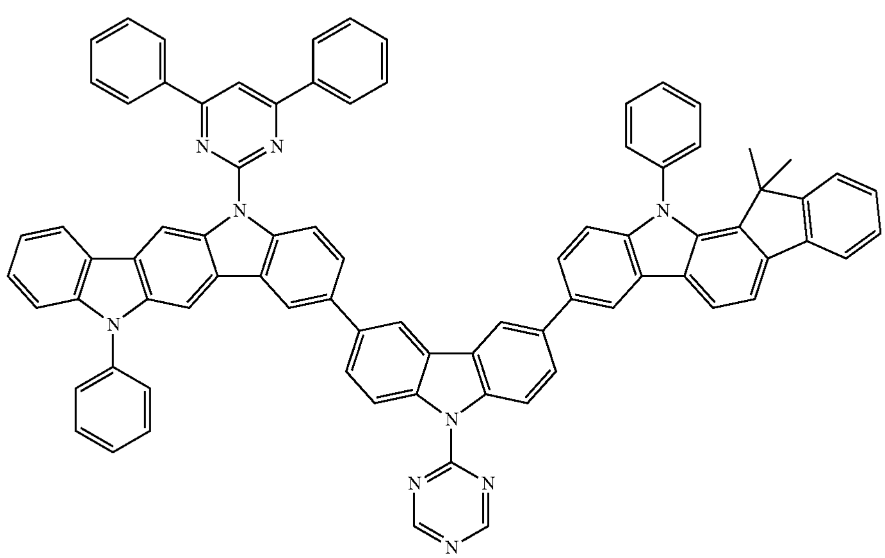

-continued
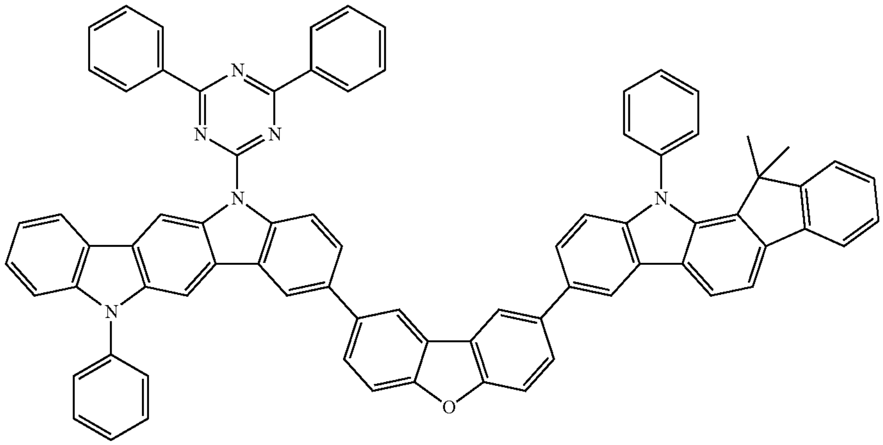
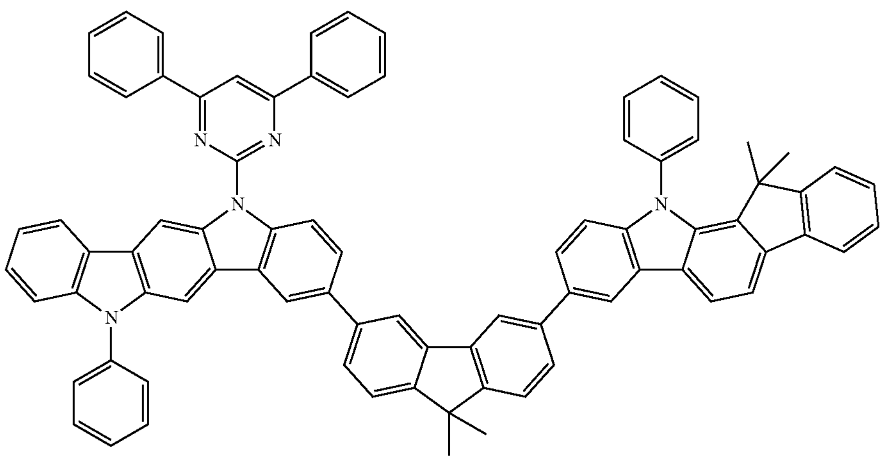
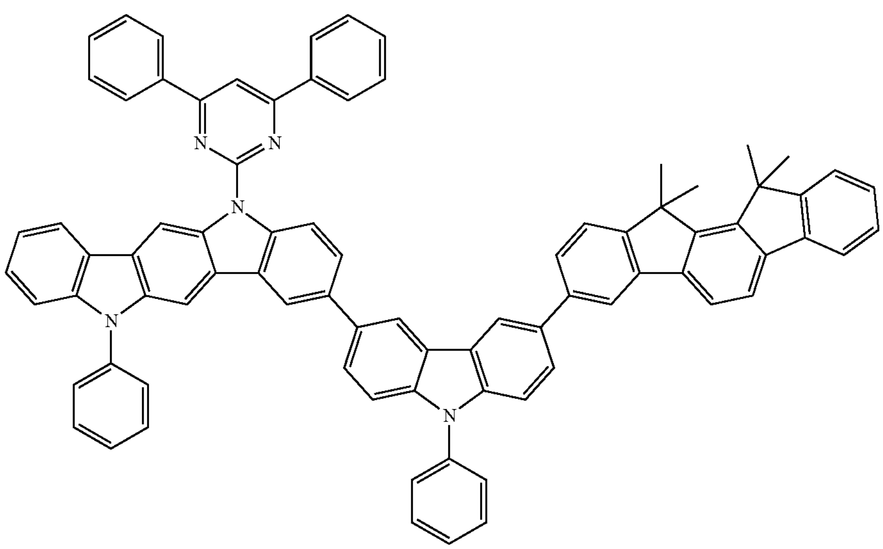

-continued
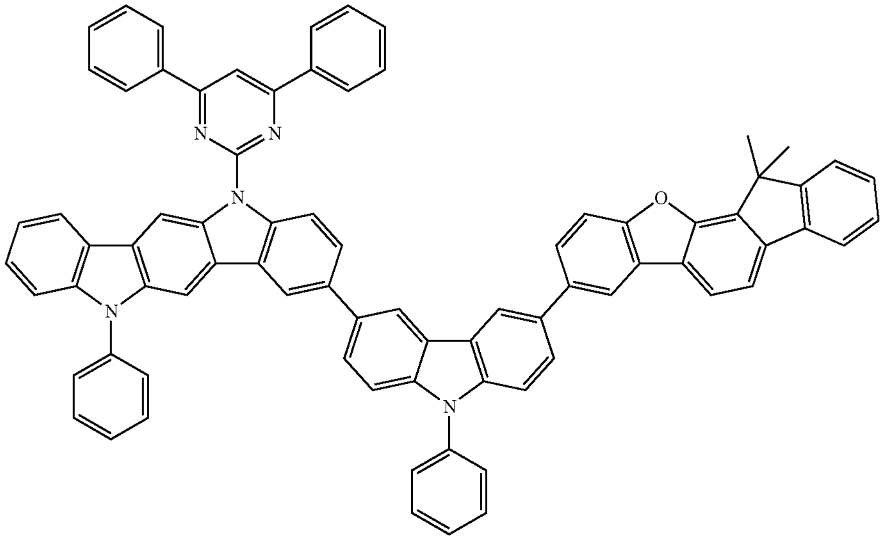
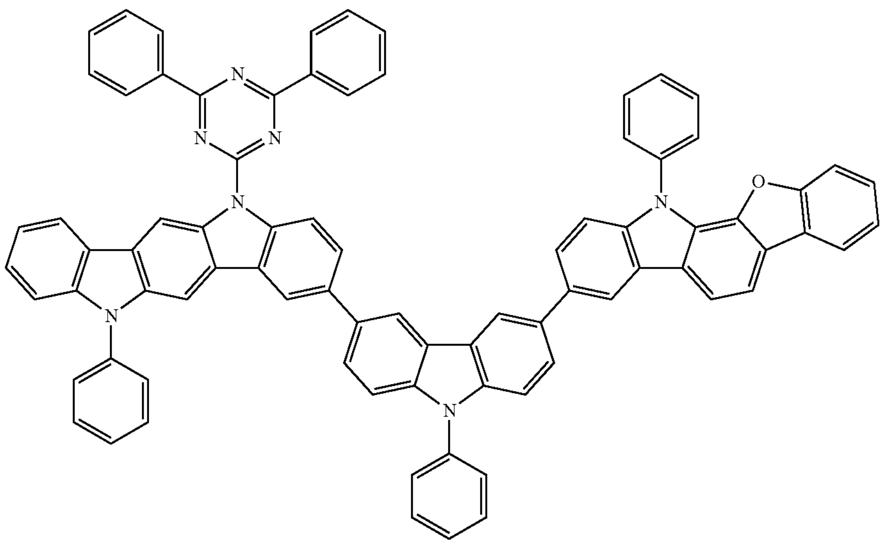
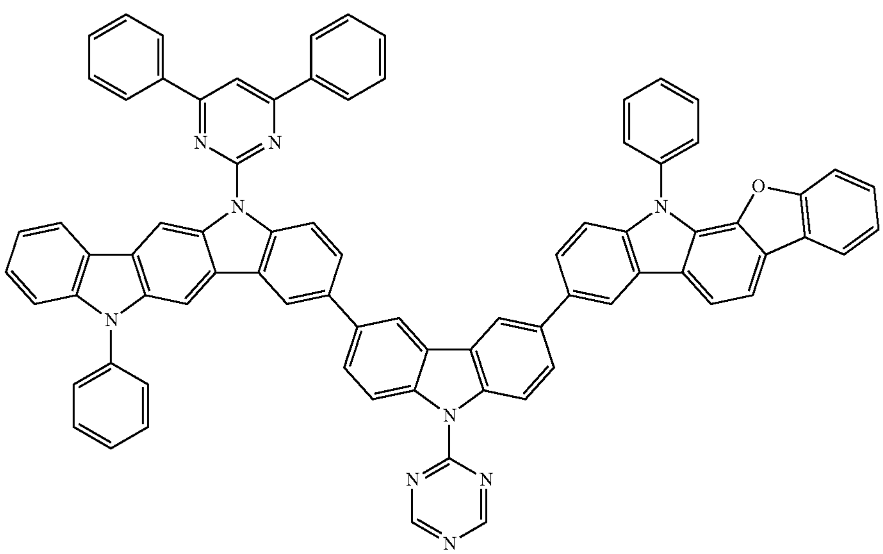

1205 1206
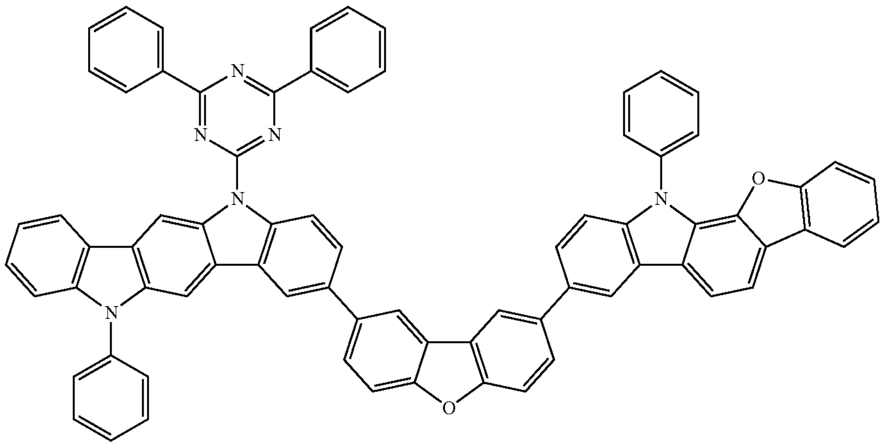
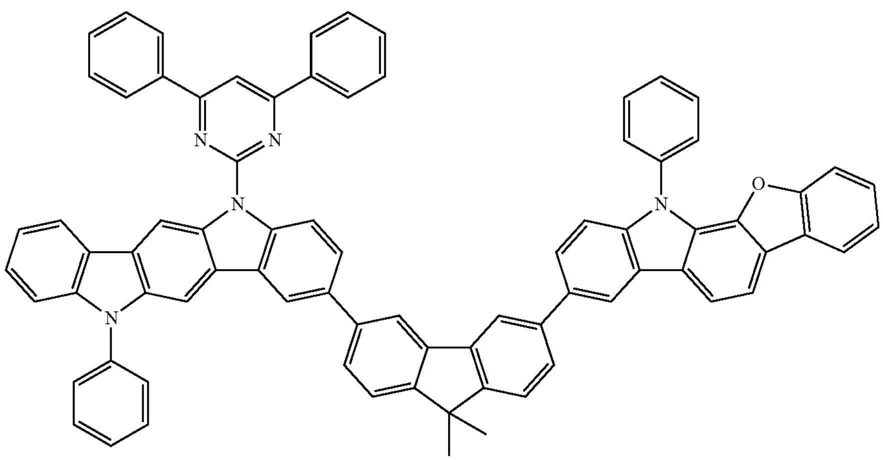
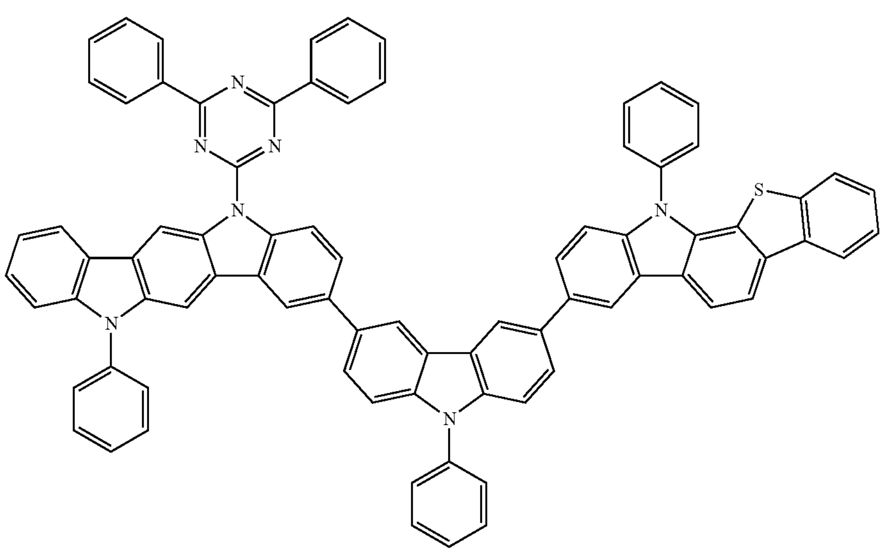

-continued
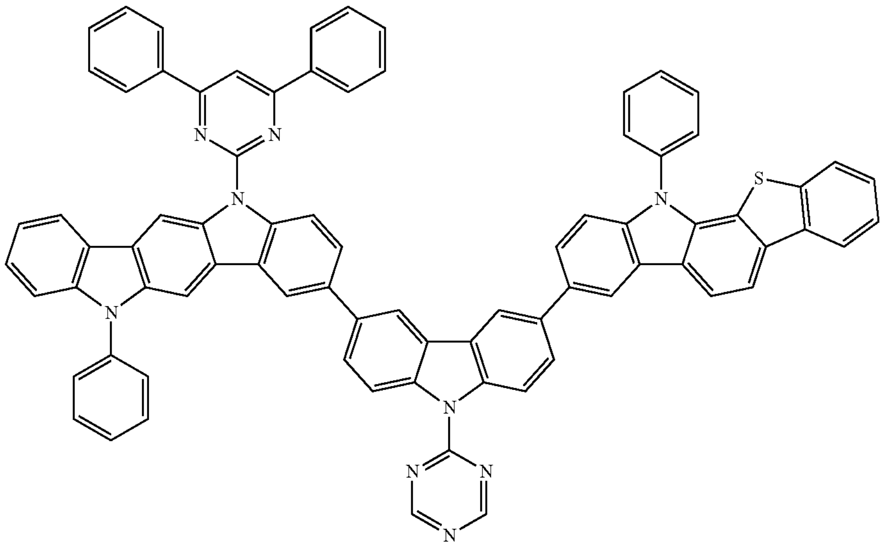
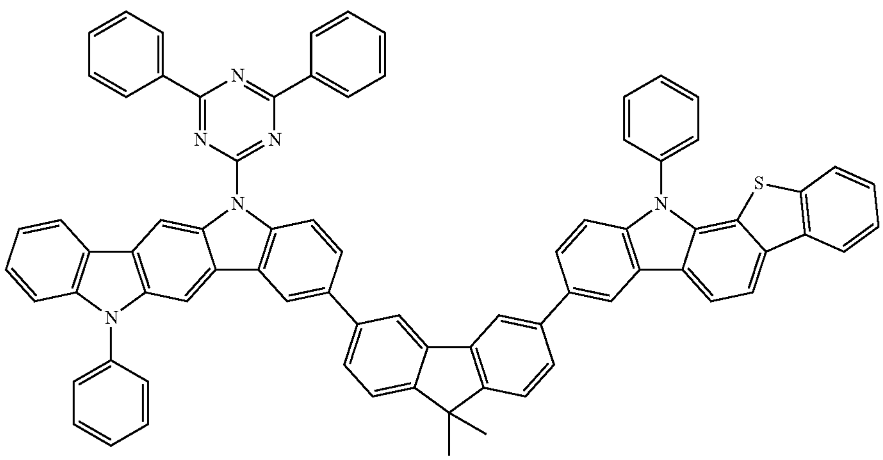
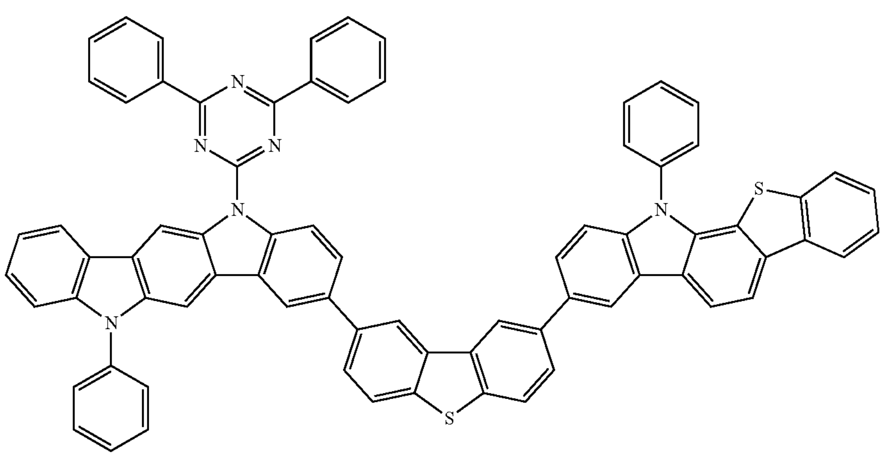

-continued
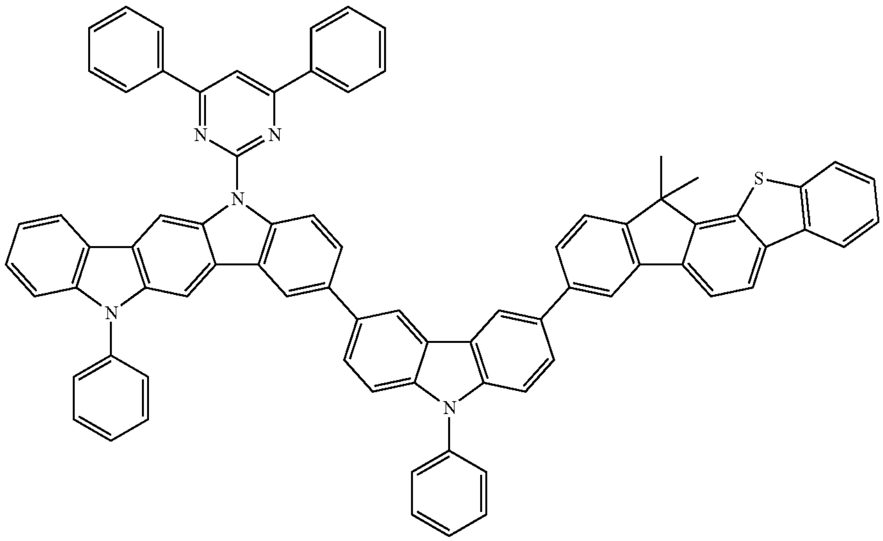
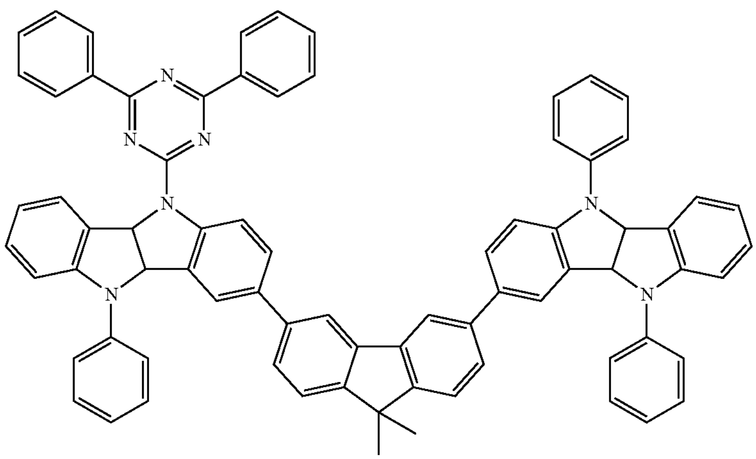
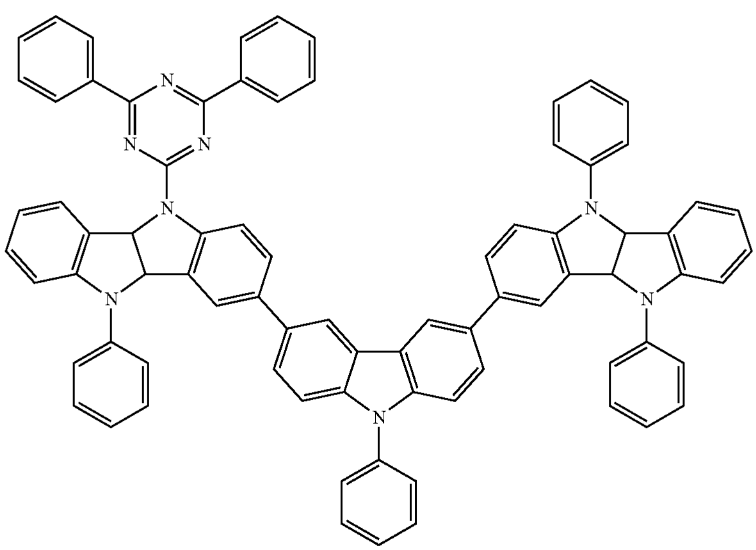

-continued
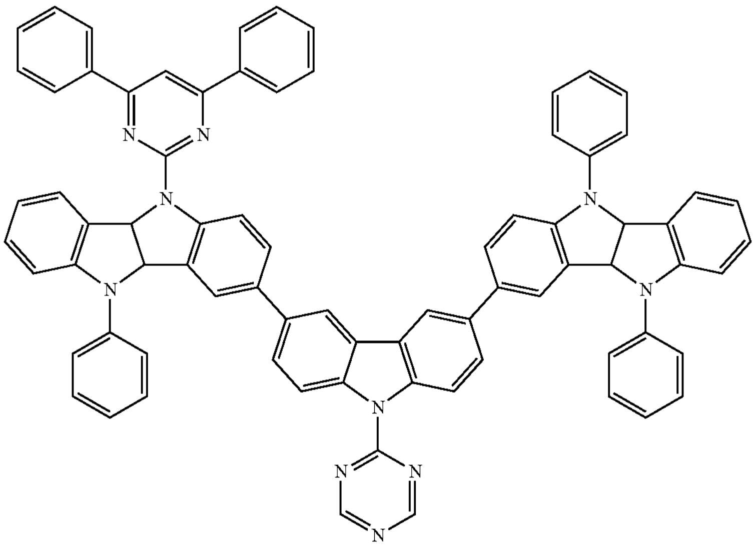
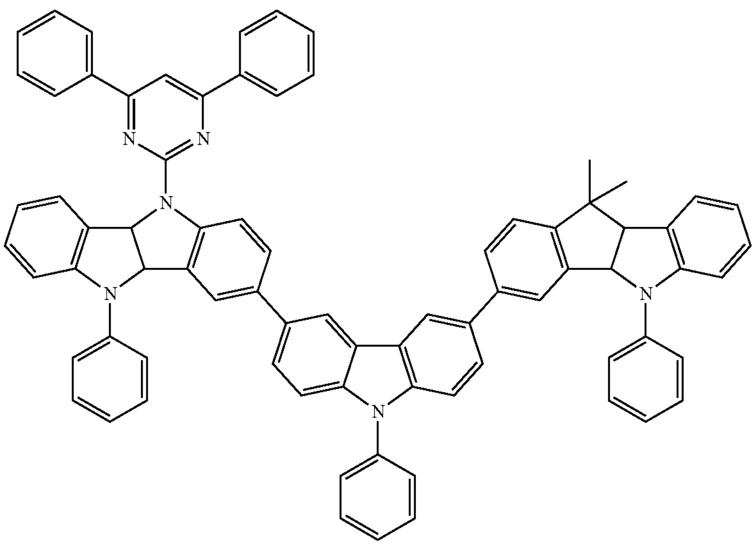
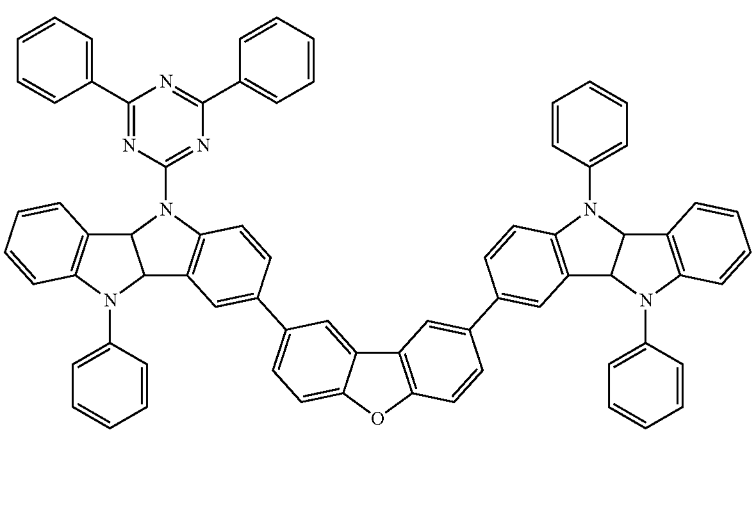

-continued
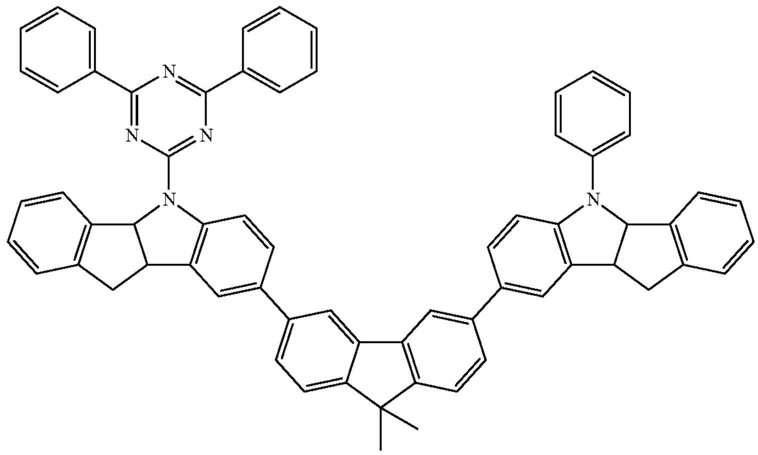
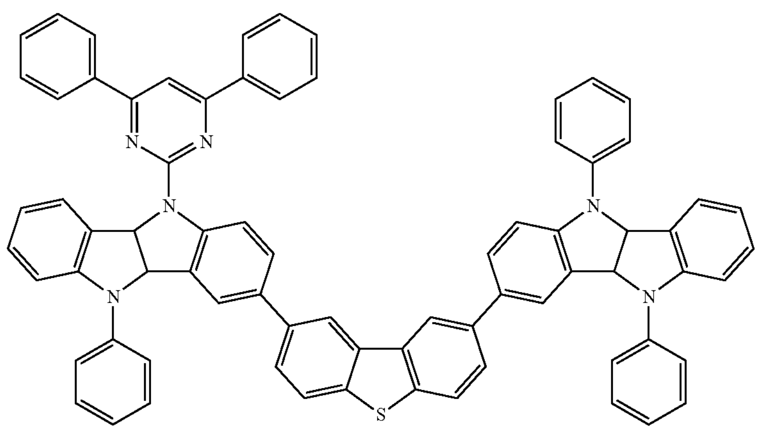
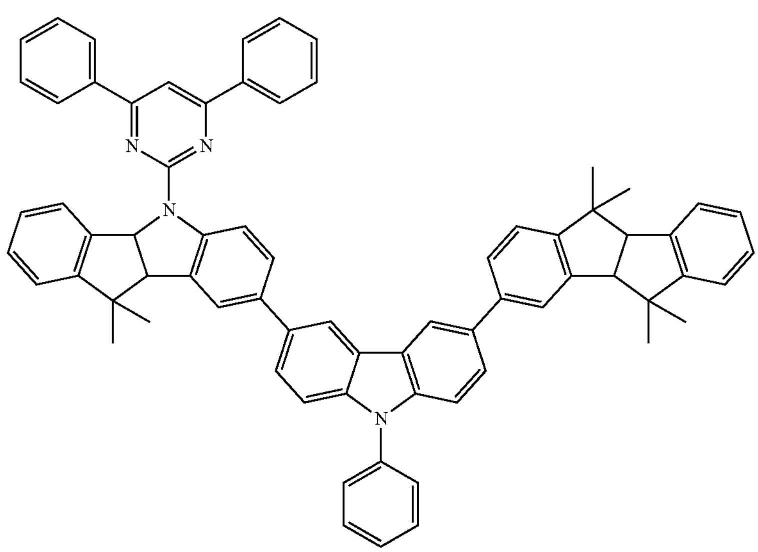

-continued
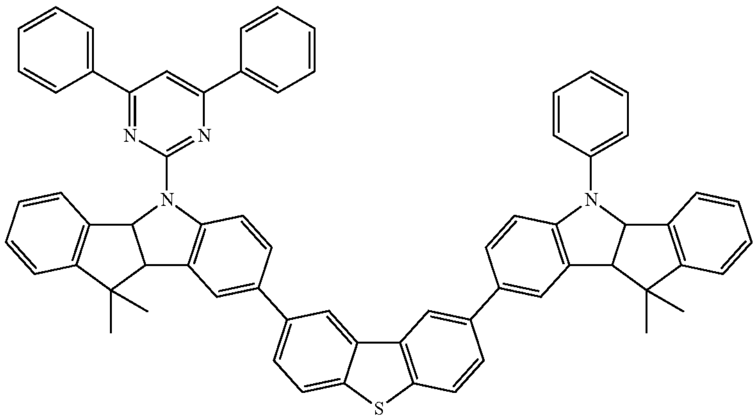
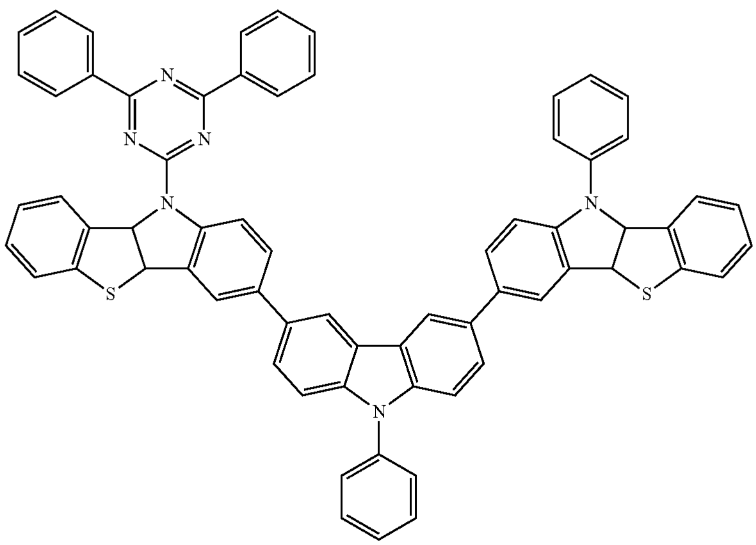
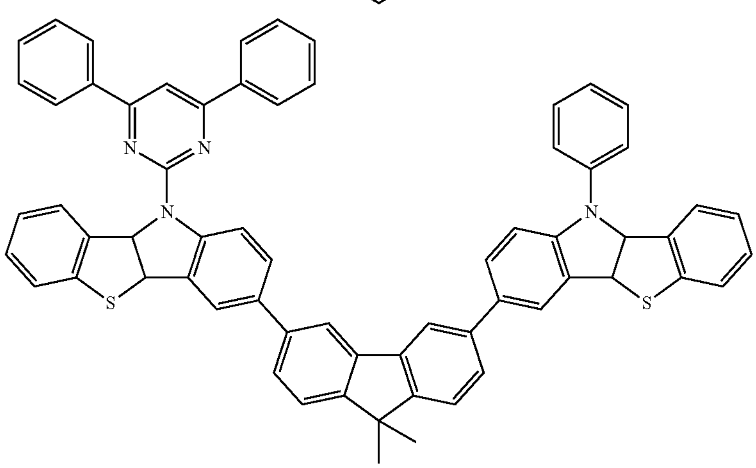
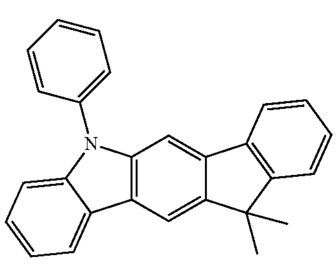
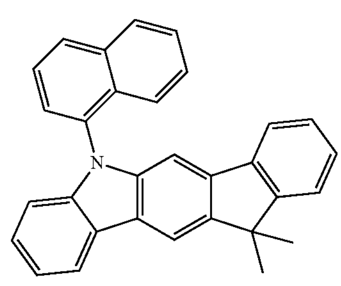

-continued
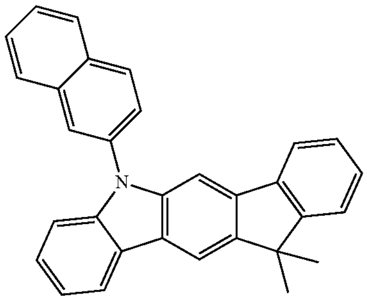
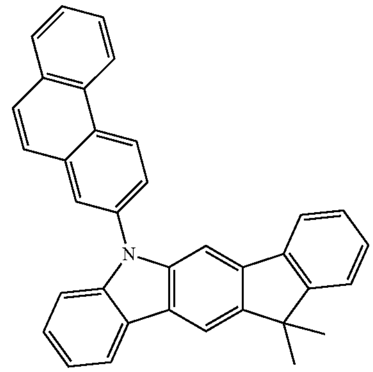
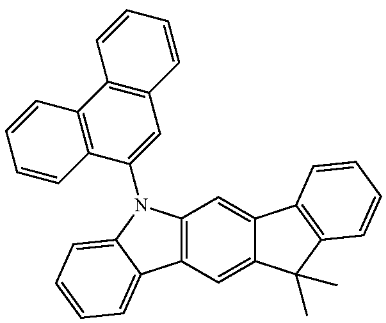
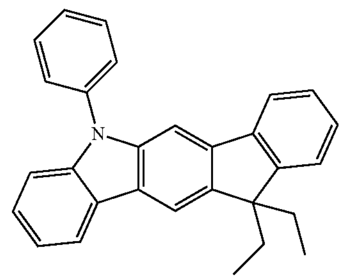
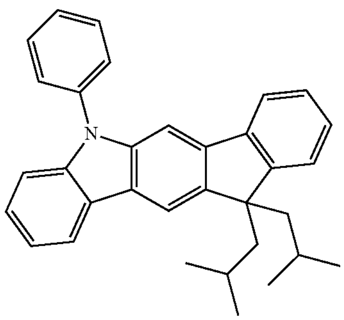
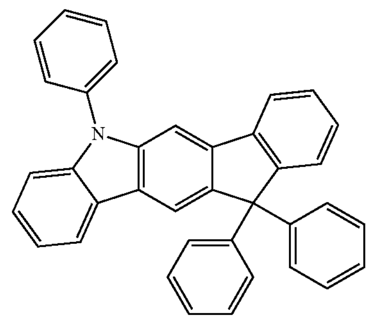
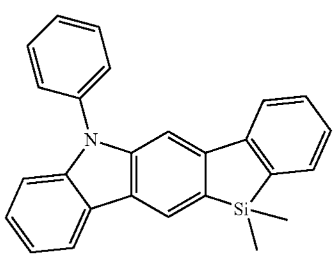
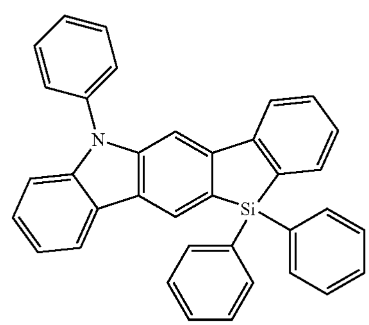
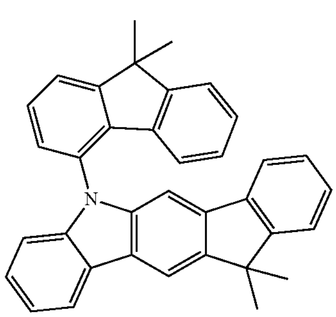
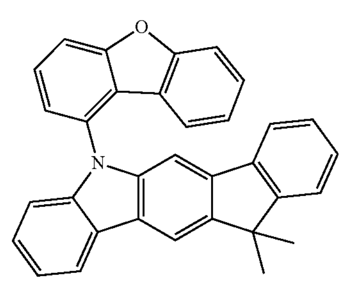

-continued
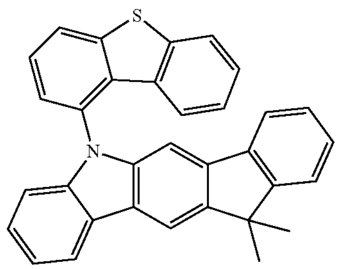
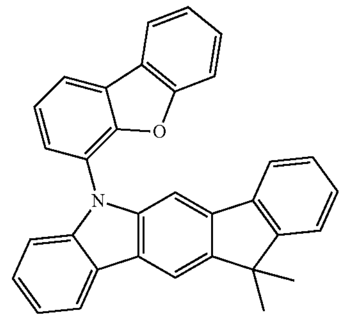
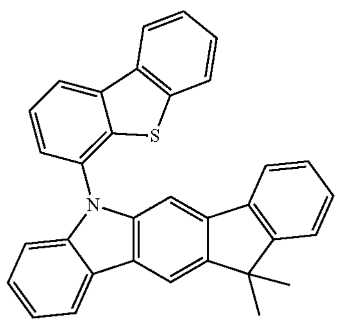
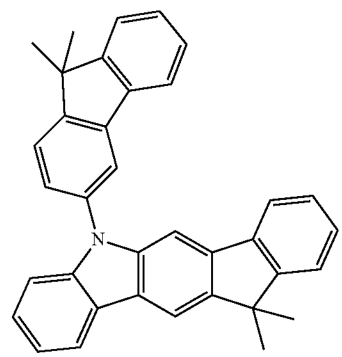
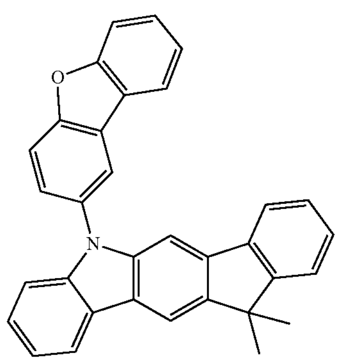
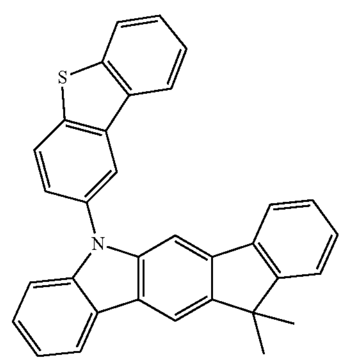
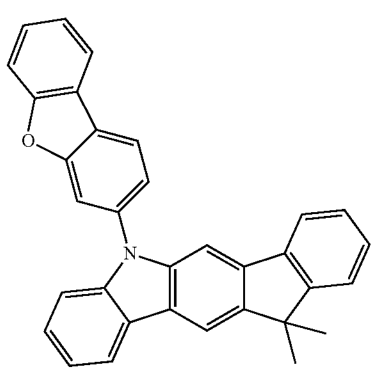
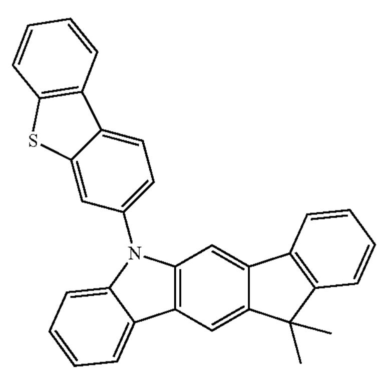

-continued
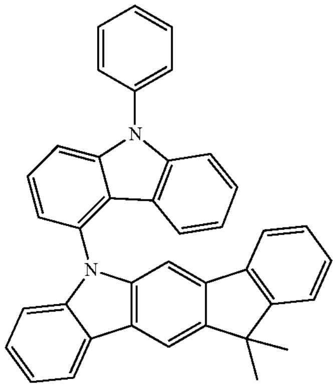
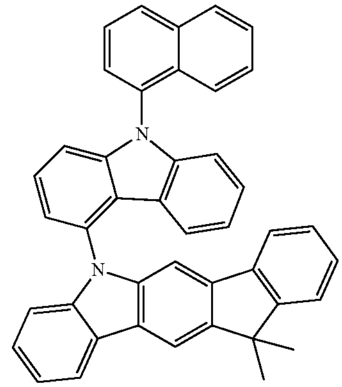
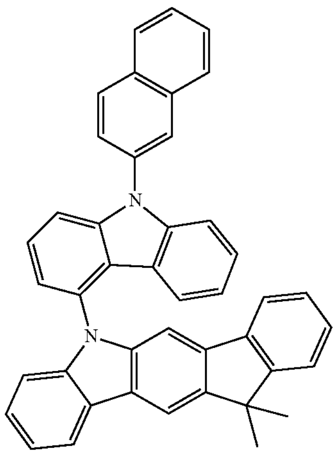
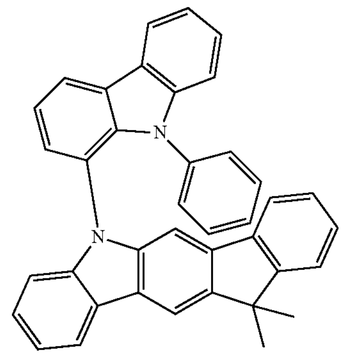
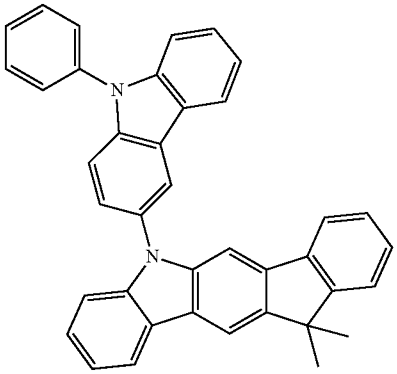
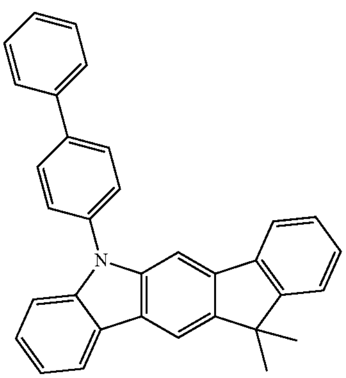
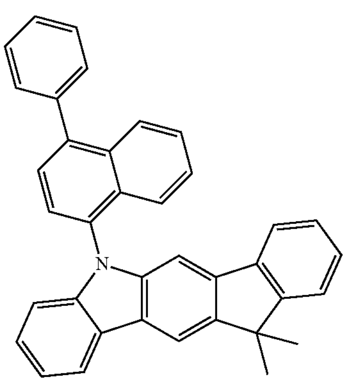
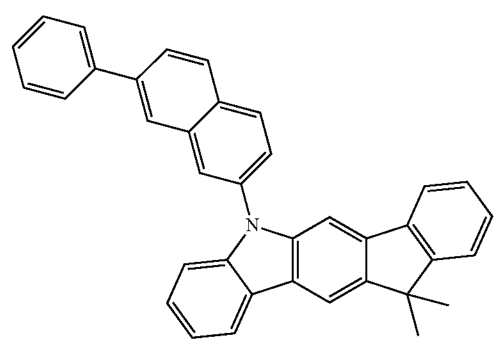

-continued
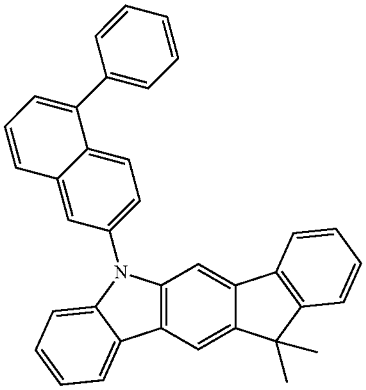
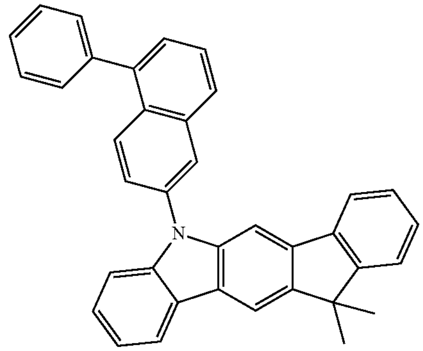
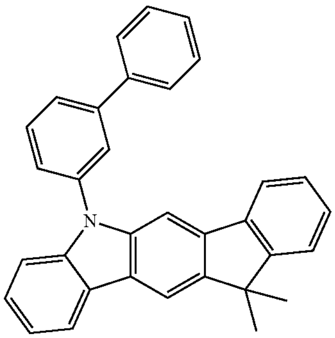
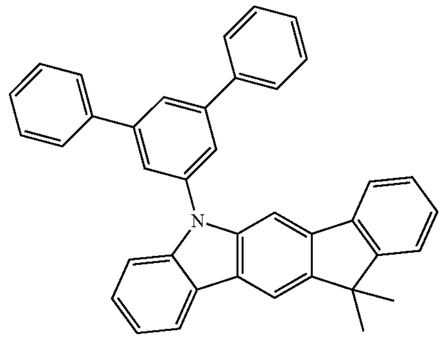
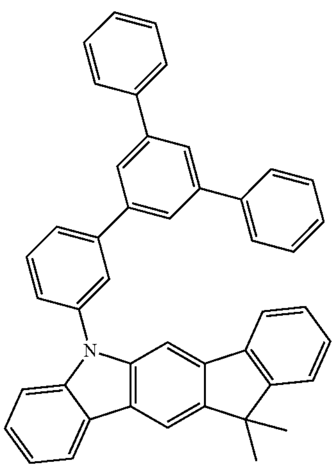
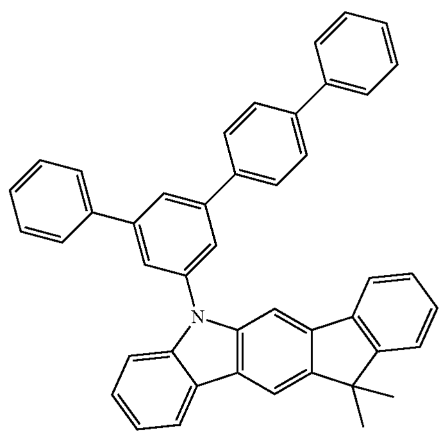
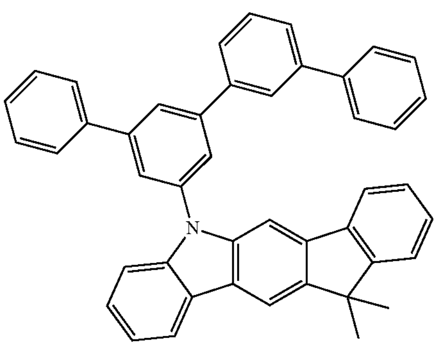
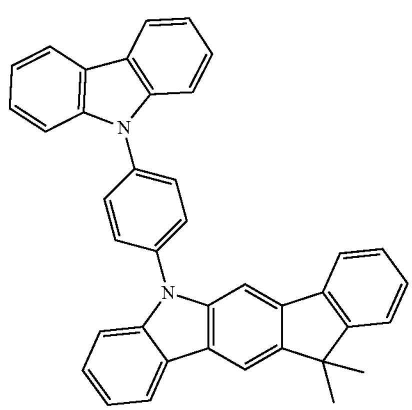

-continued
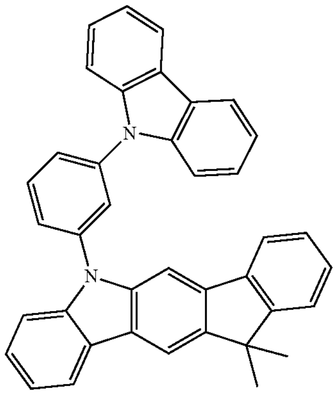
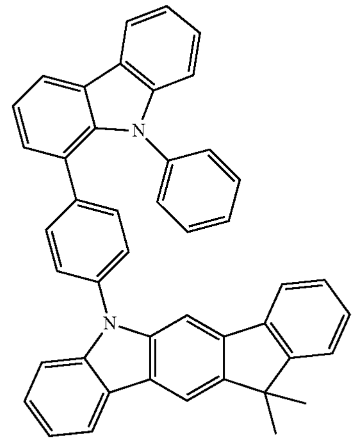
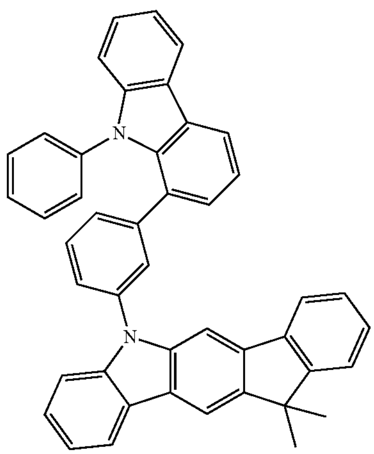
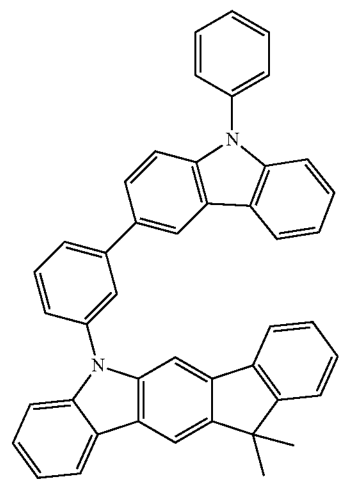
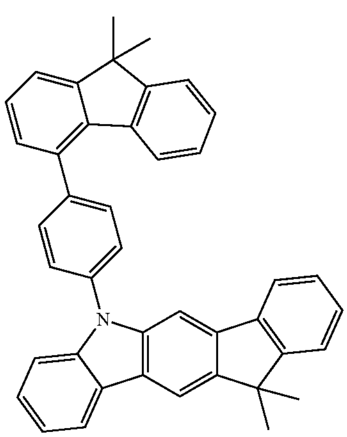
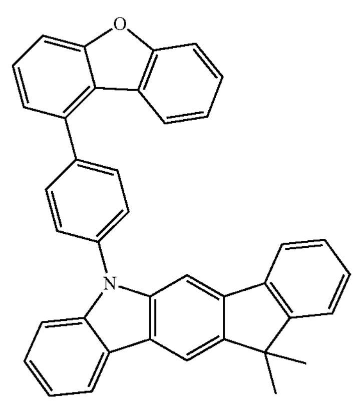

-continued
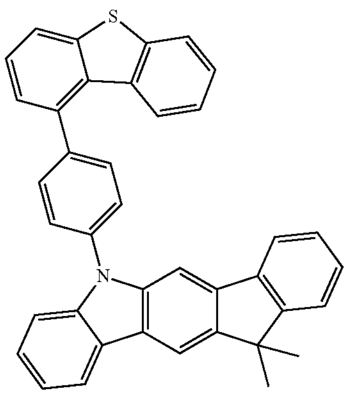
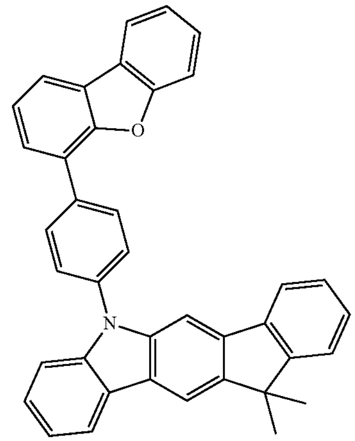
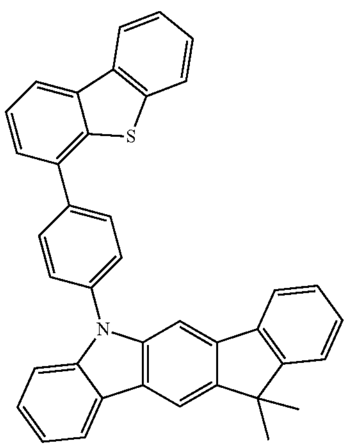
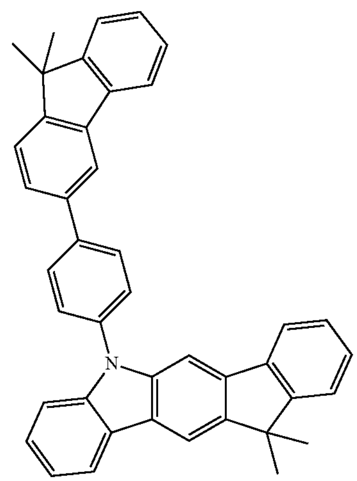
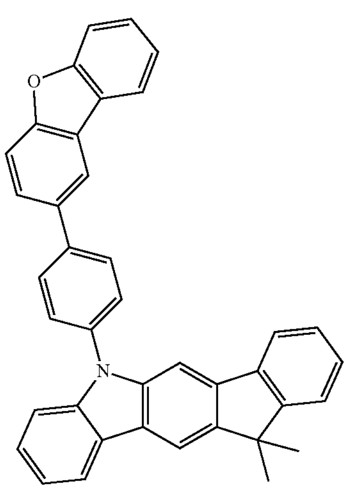
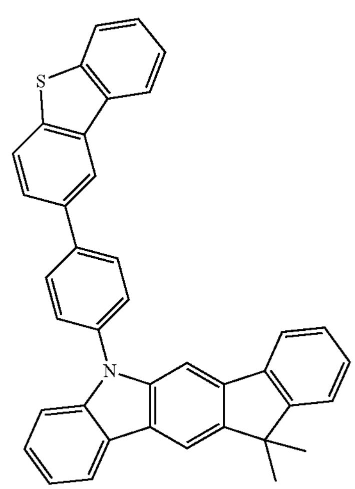

-continued
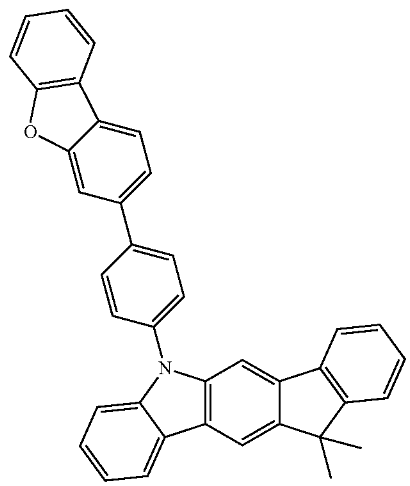
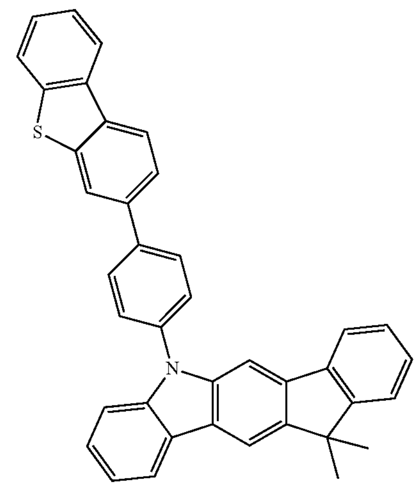
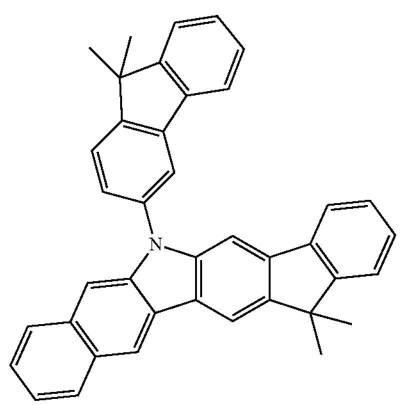
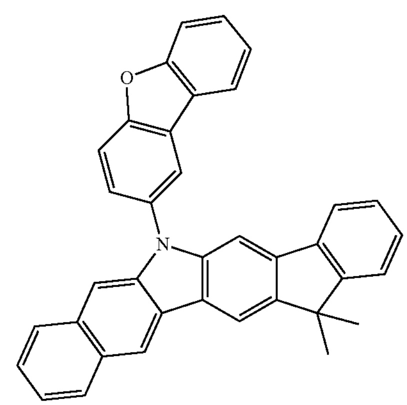
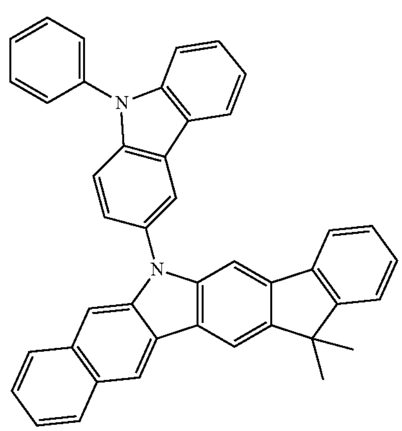
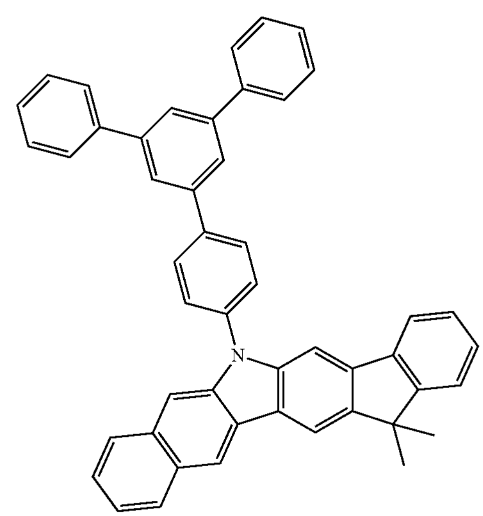

-continued
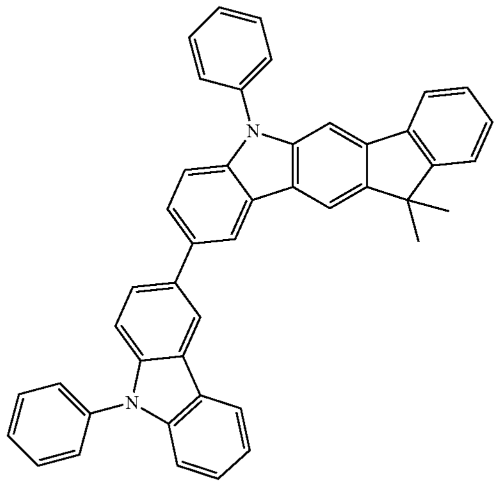
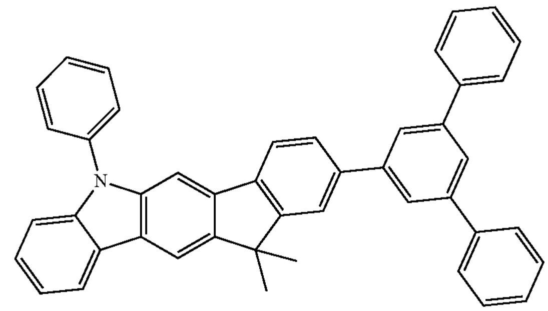
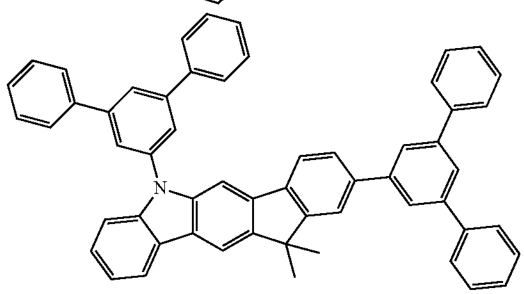
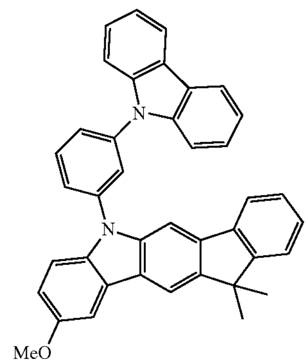
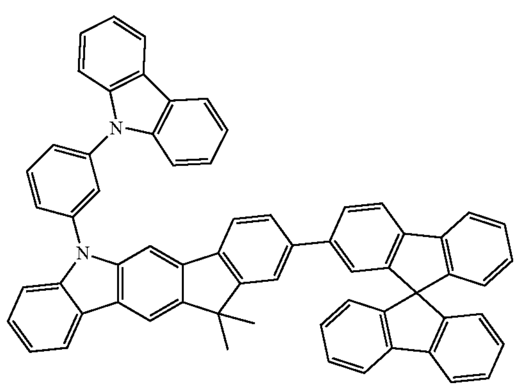
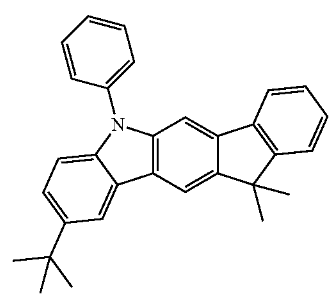
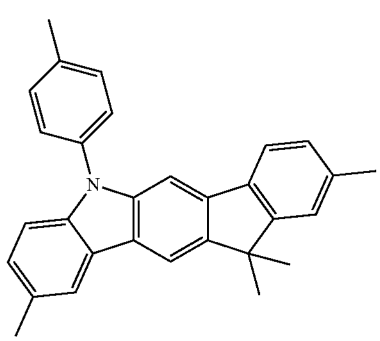
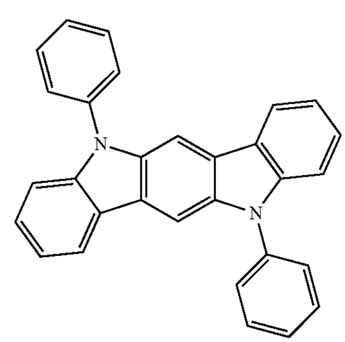

-continued
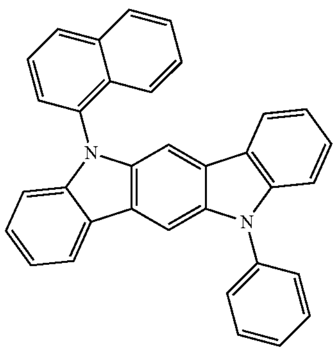
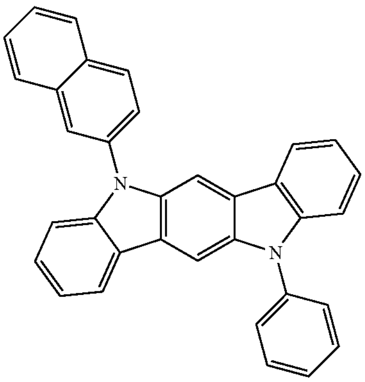
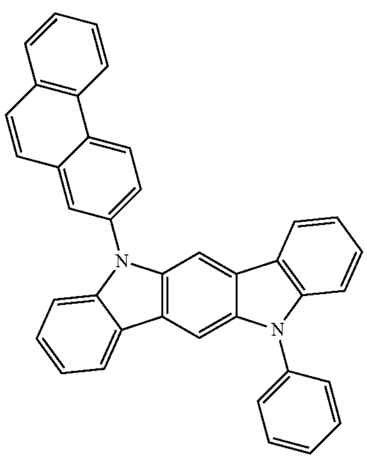
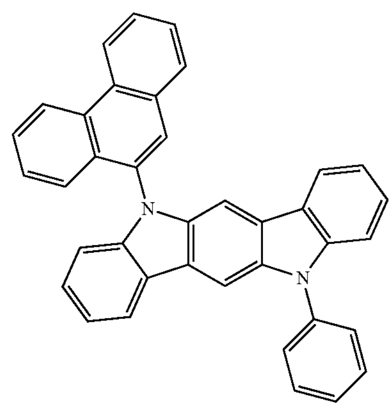
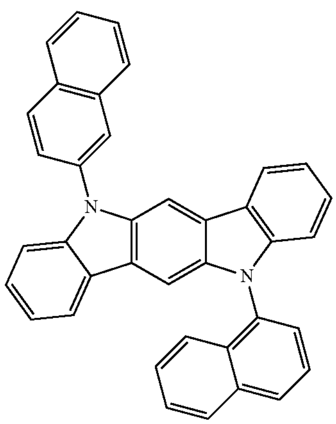
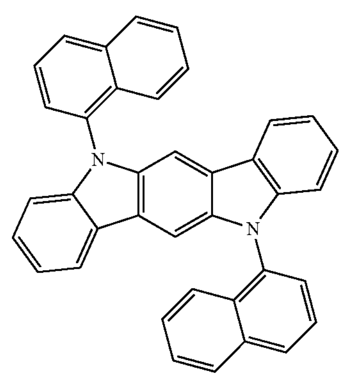

-continued
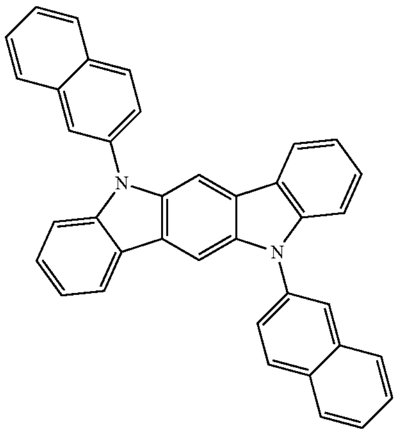
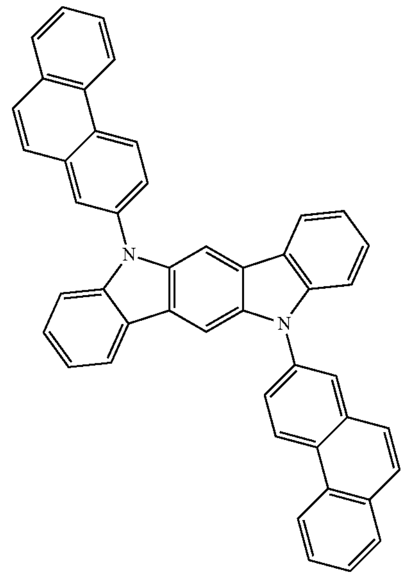
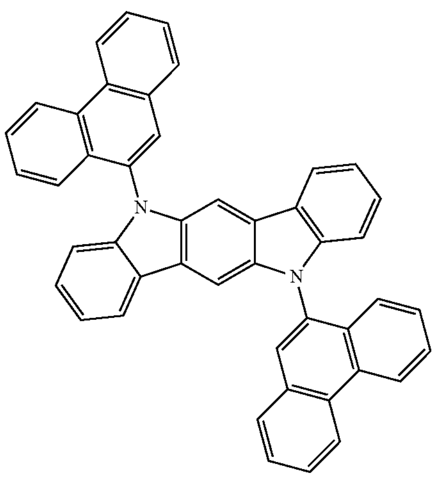
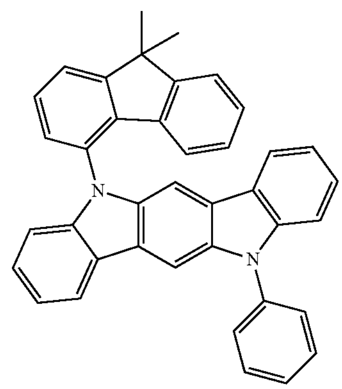
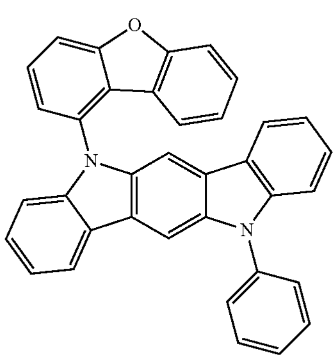
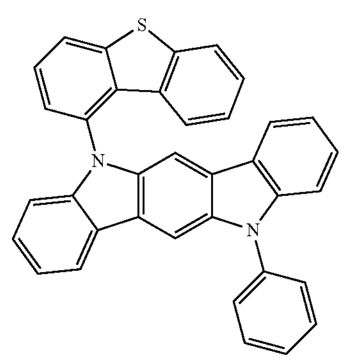

-continued
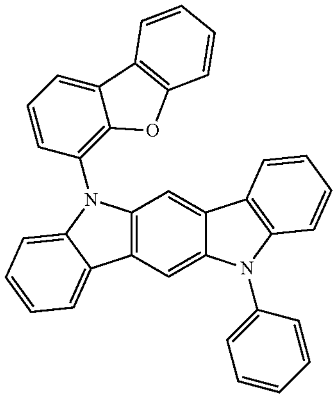
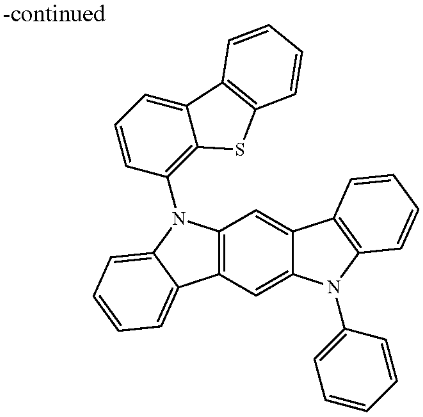
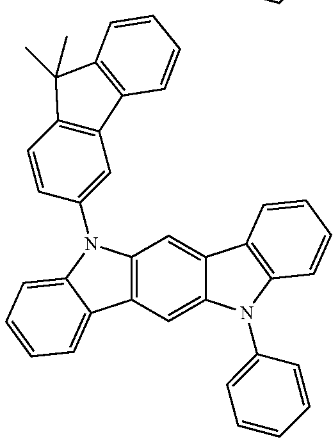
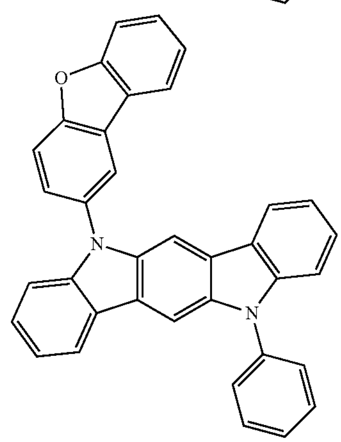
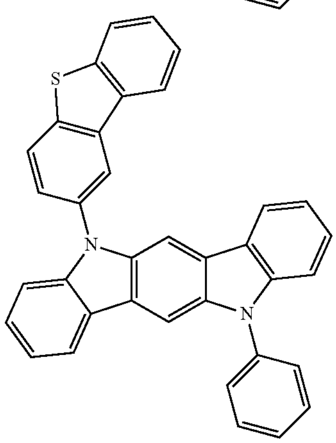
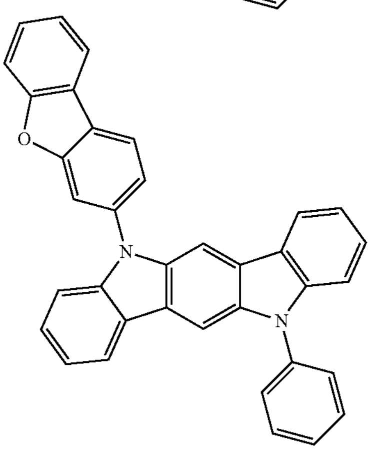
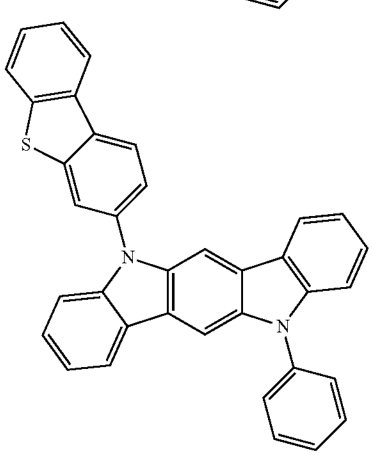
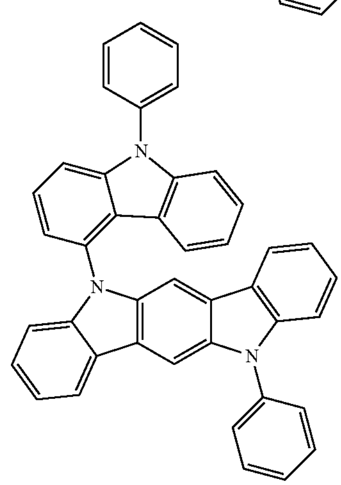

-continued
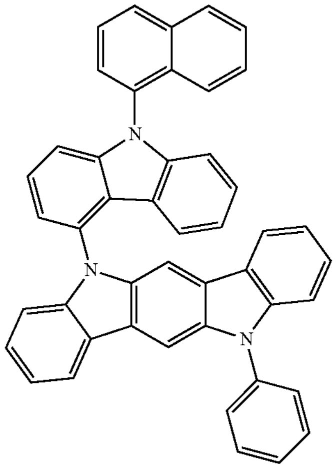
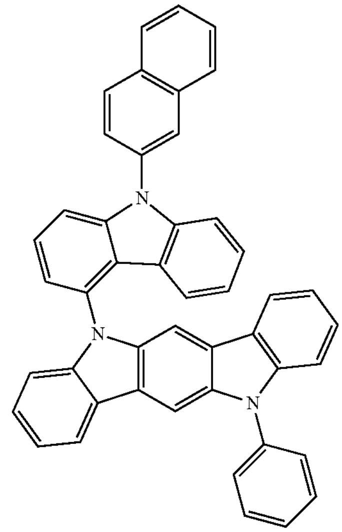
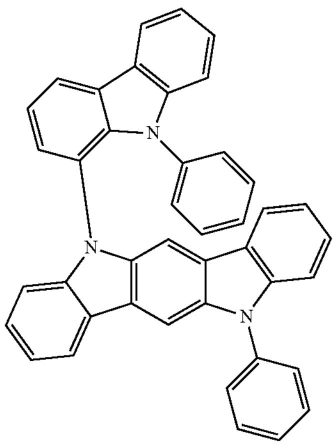
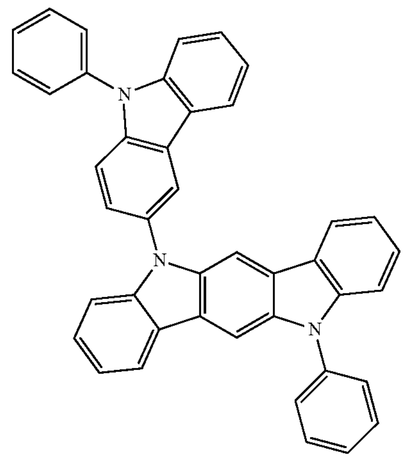
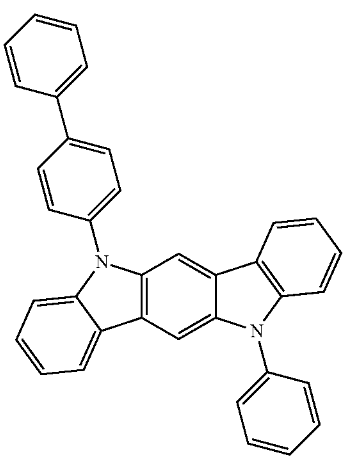
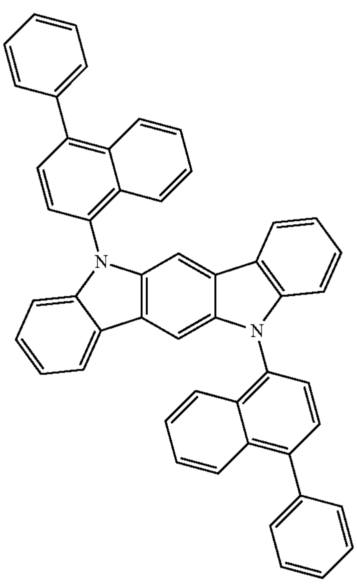

-continued
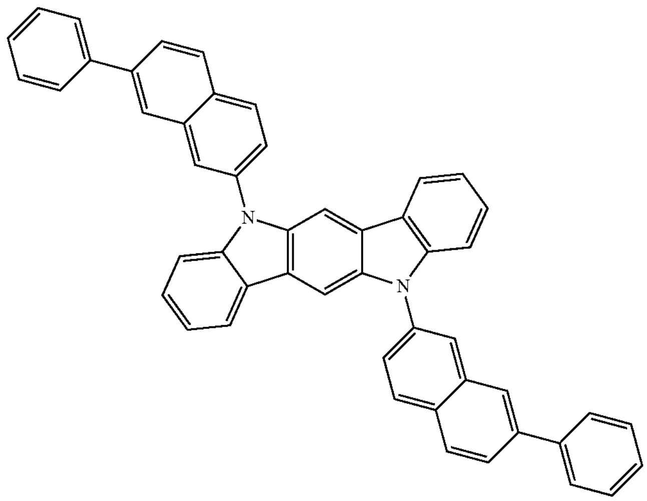
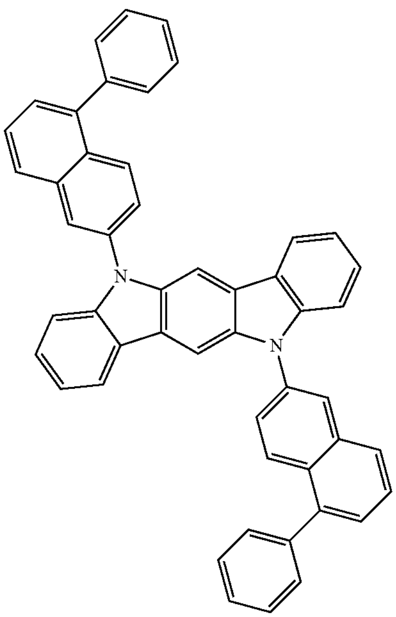
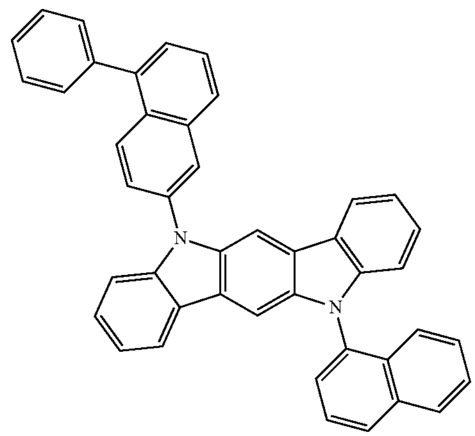
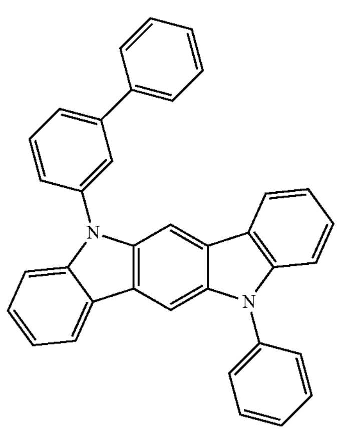
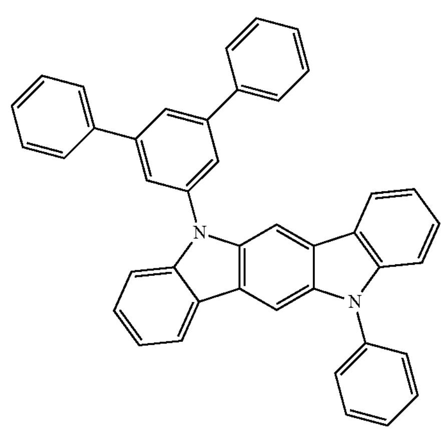

-continued
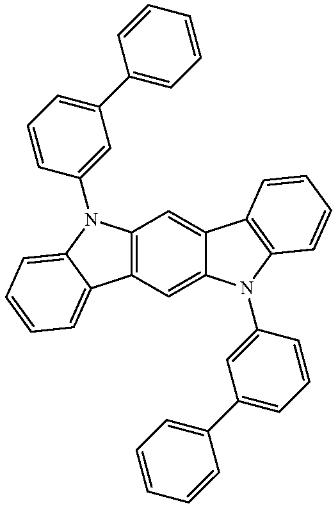
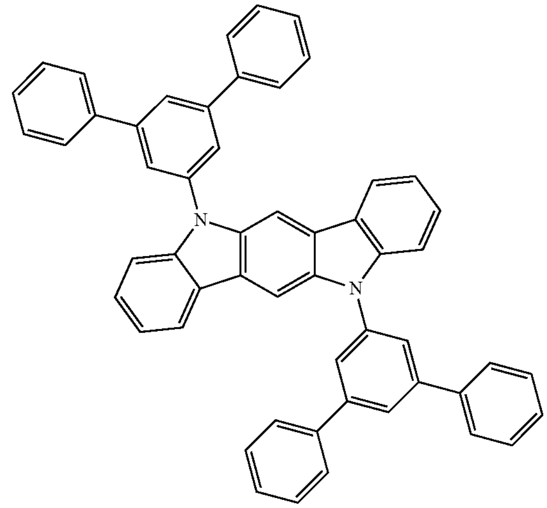
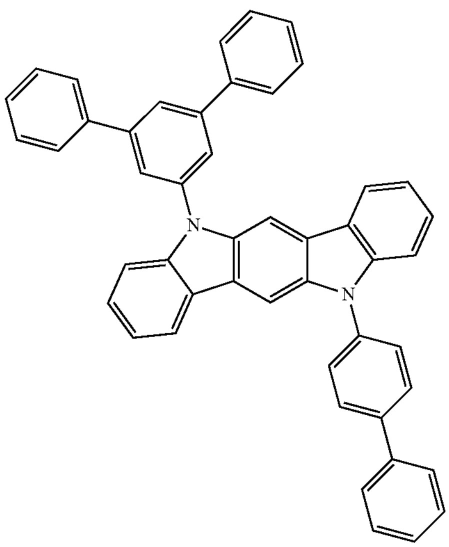
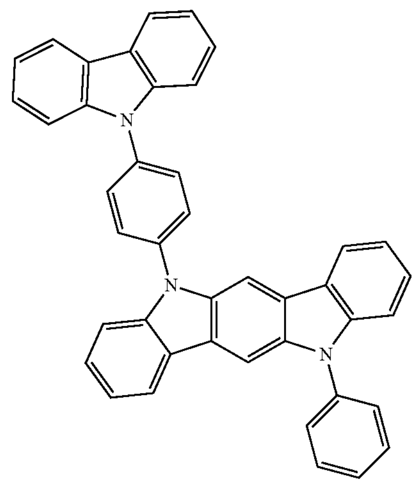
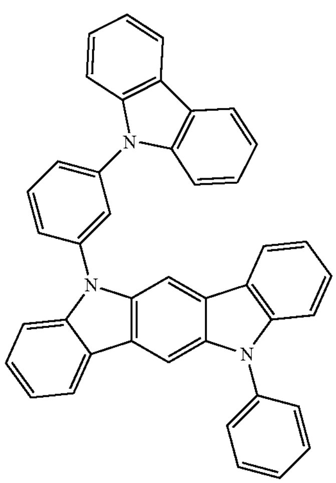
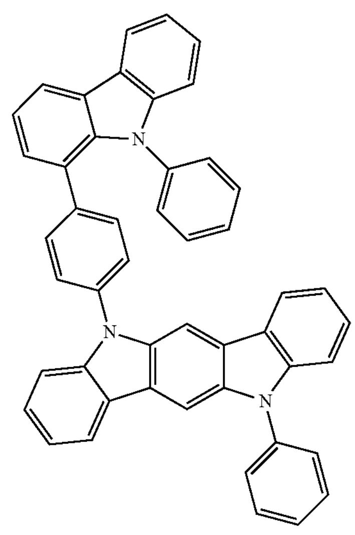

-continued
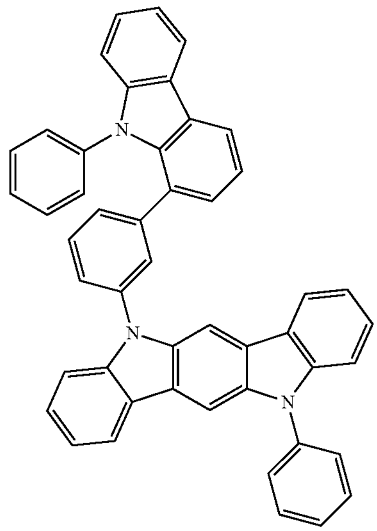
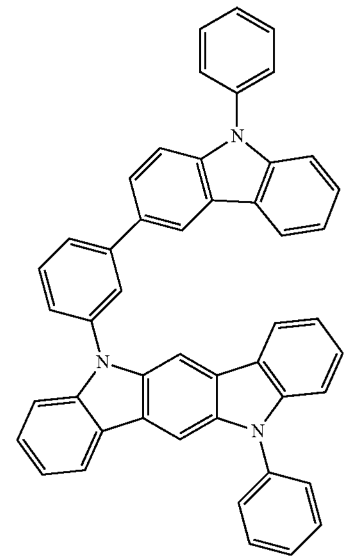
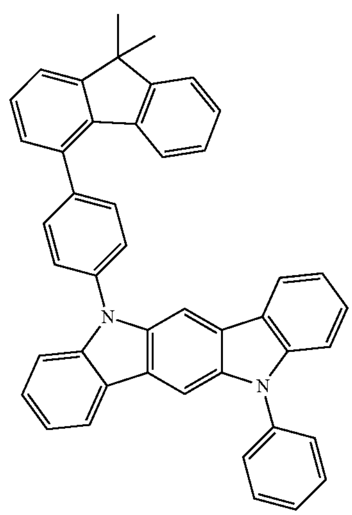
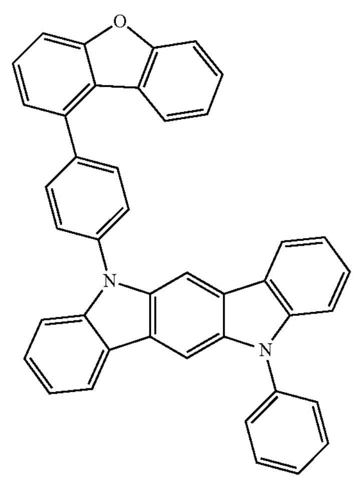
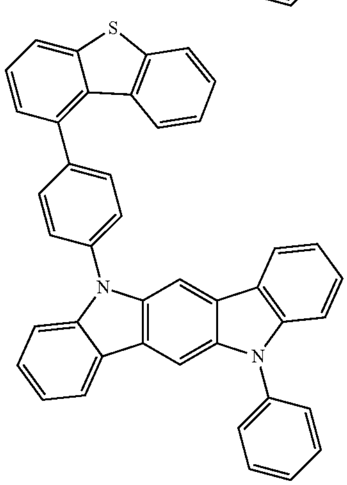
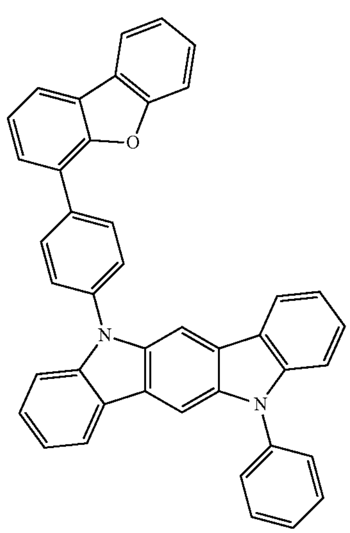

-continued
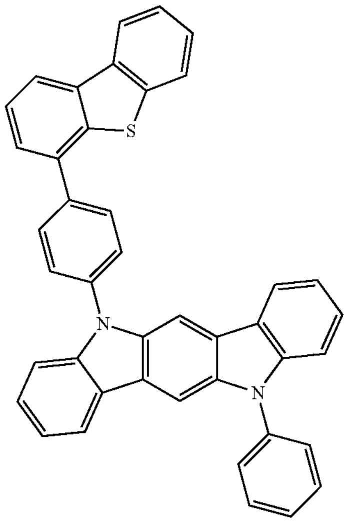
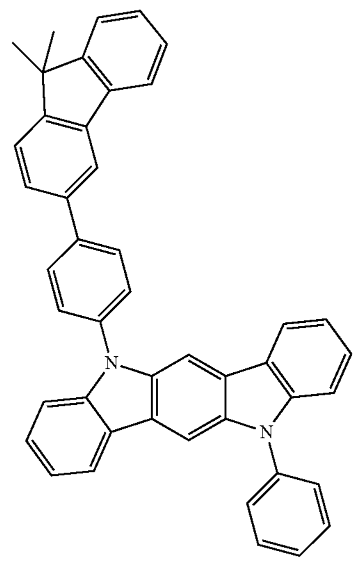
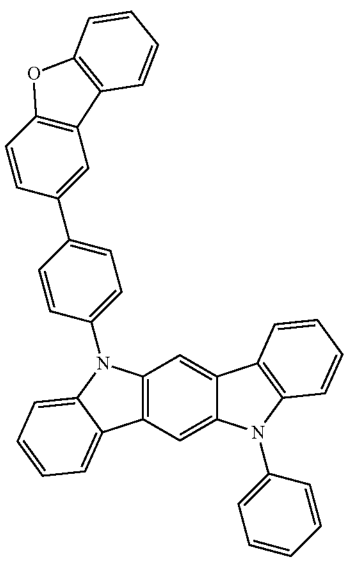
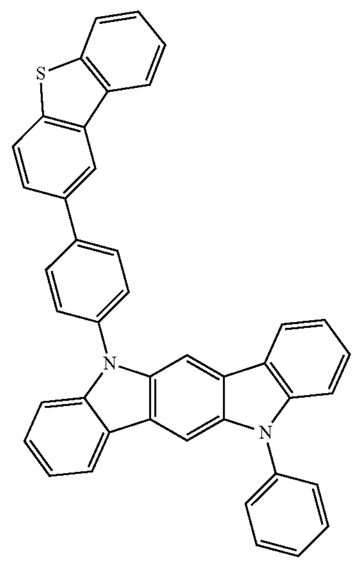
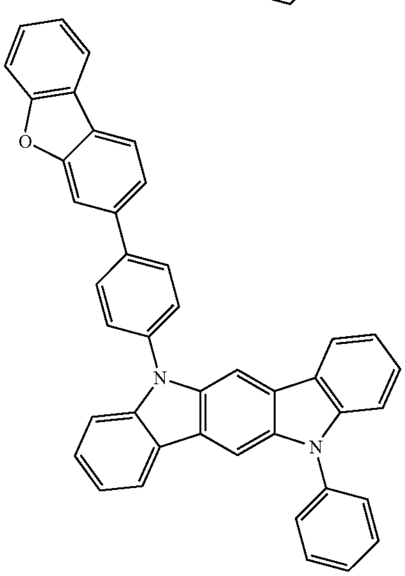
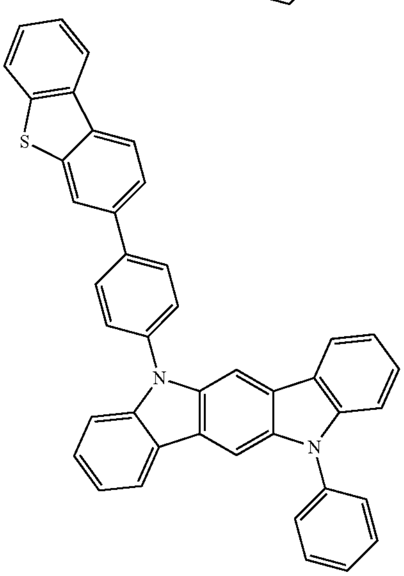

-continued
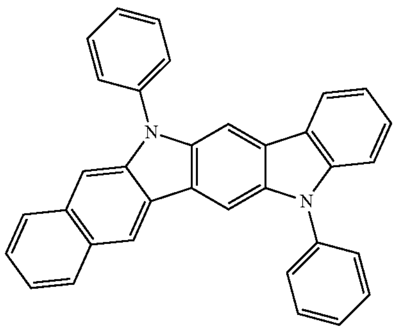
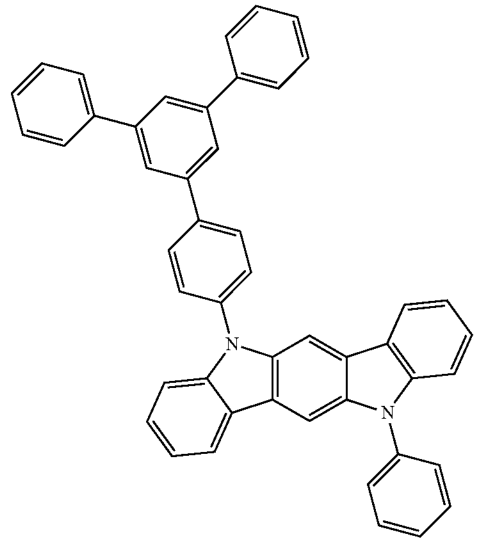
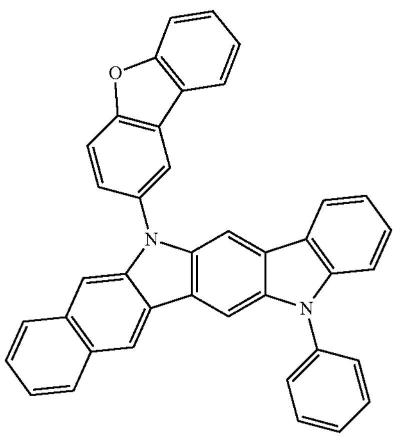
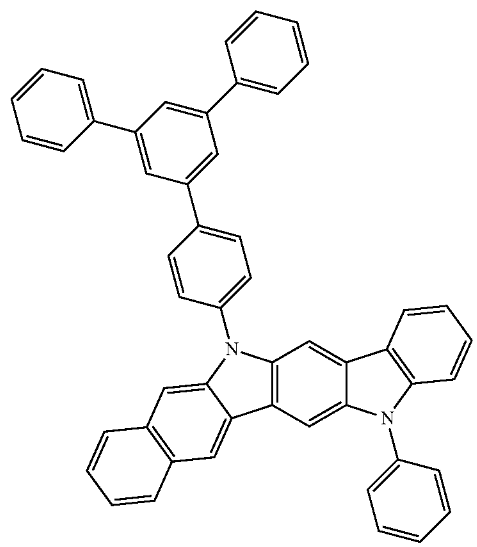
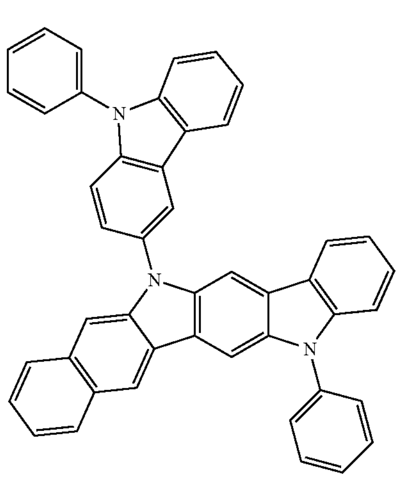
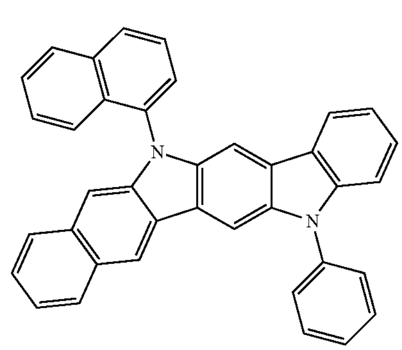

-continued
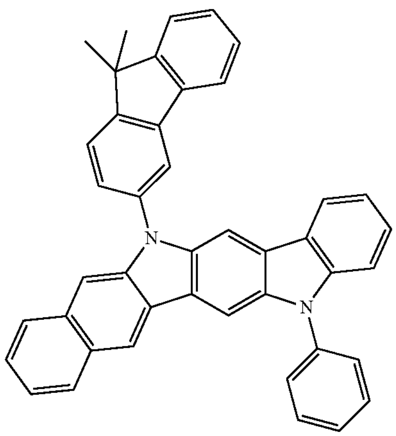
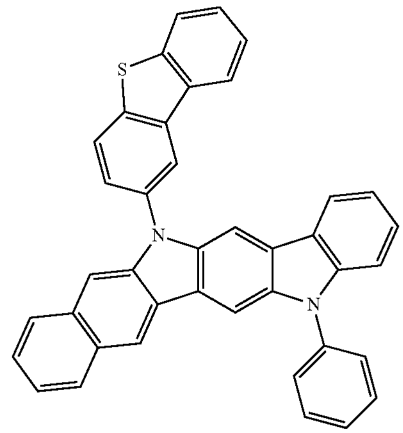
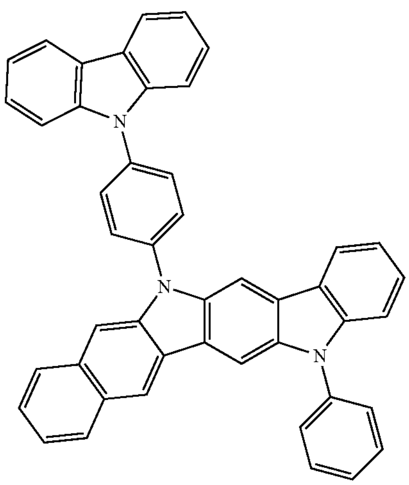
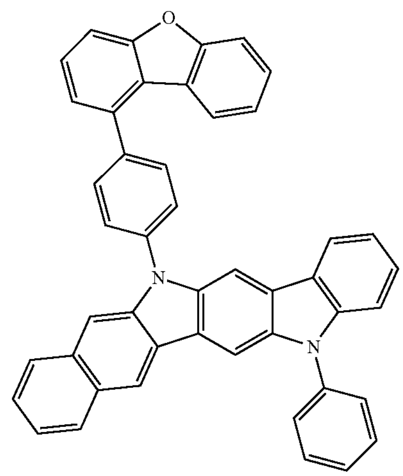
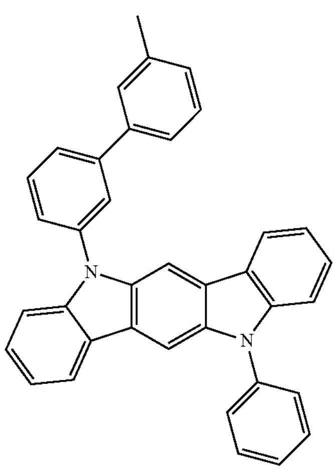
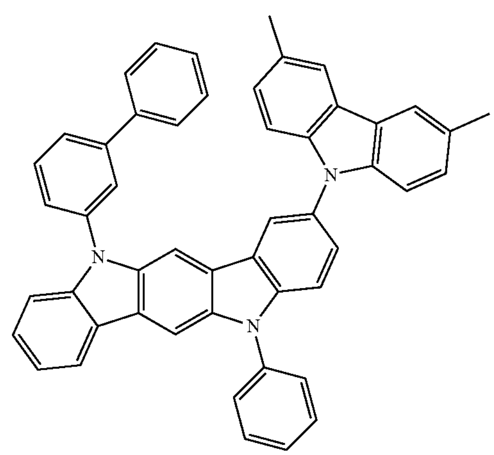

-continued
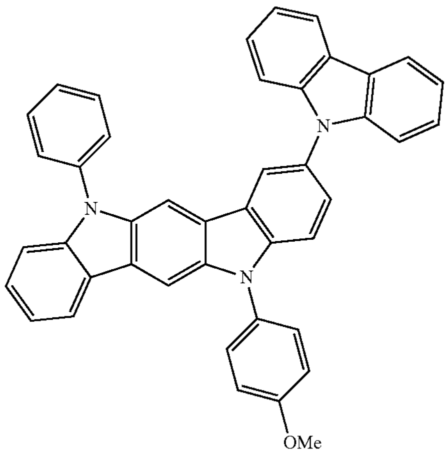
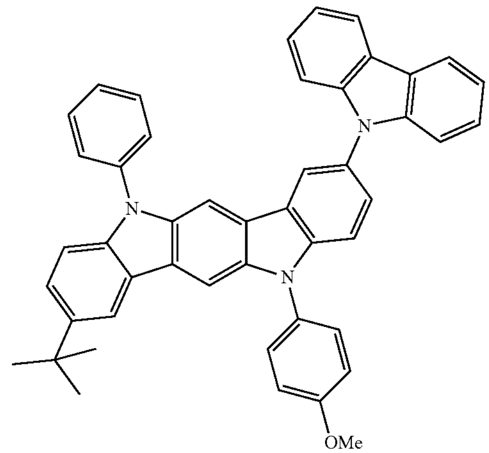
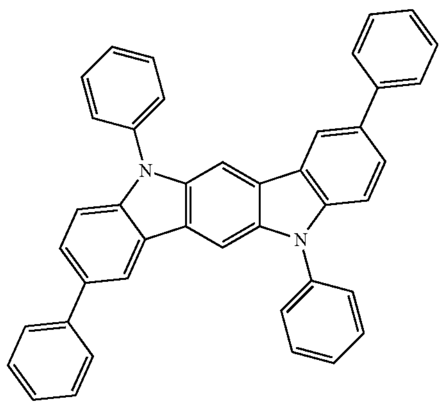
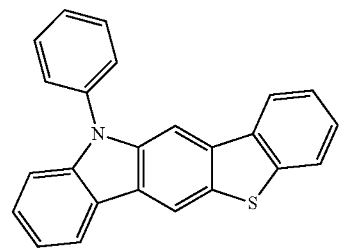
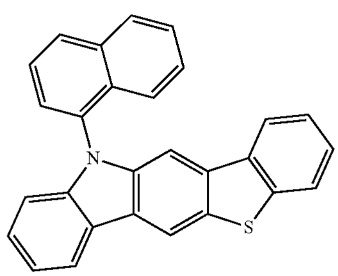
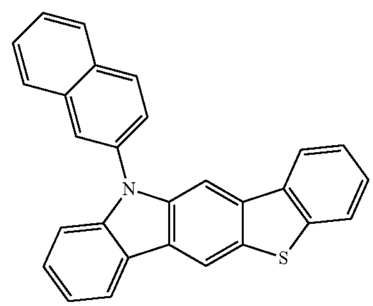
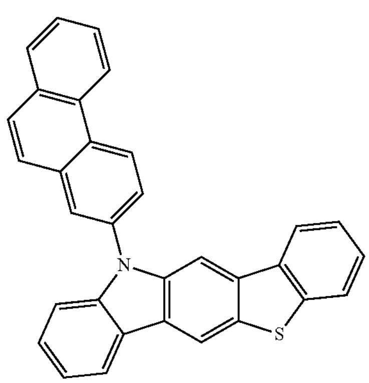
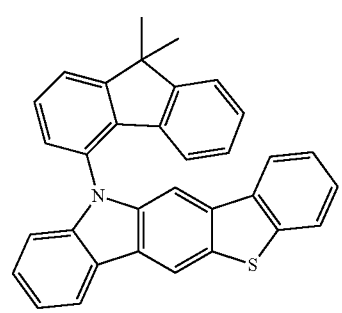

-continued
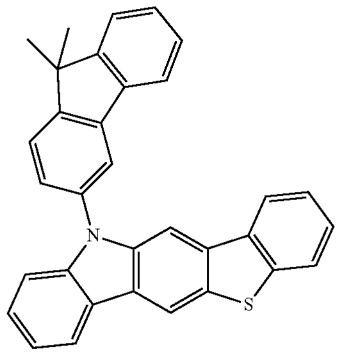
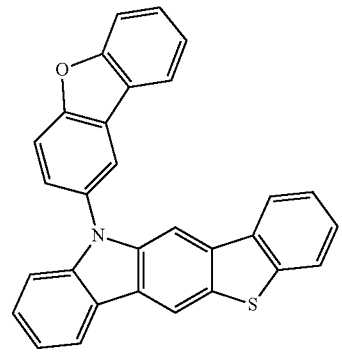
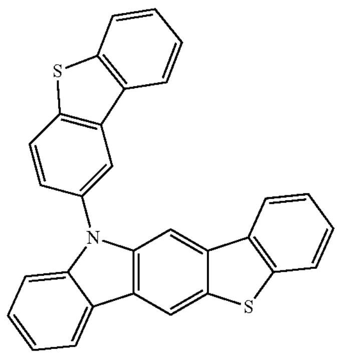
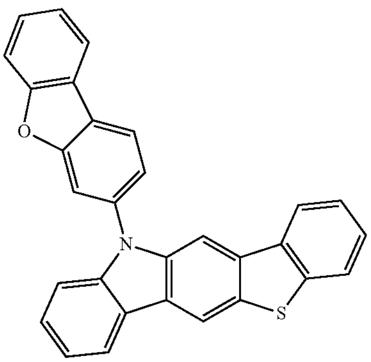
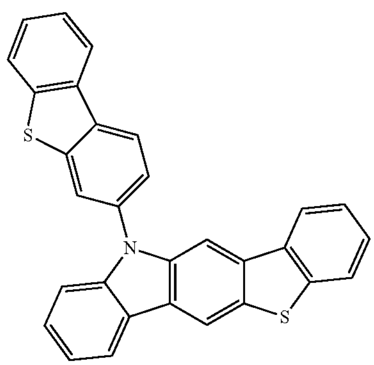
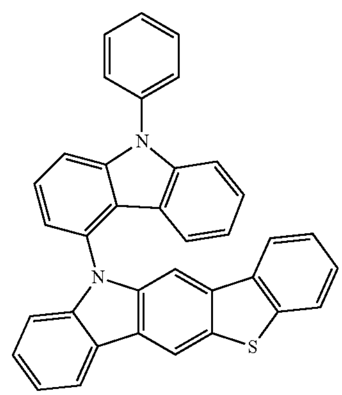
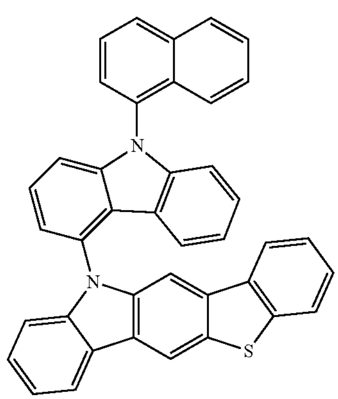
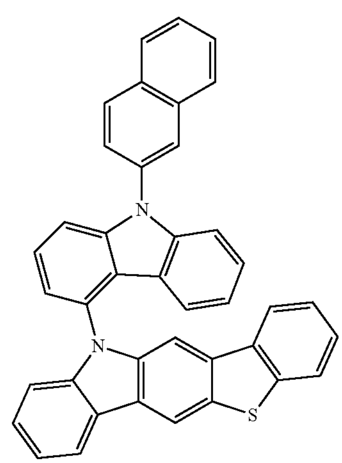

-continued
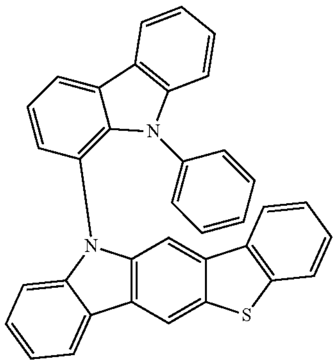
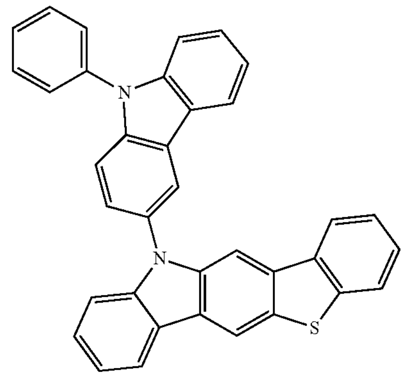
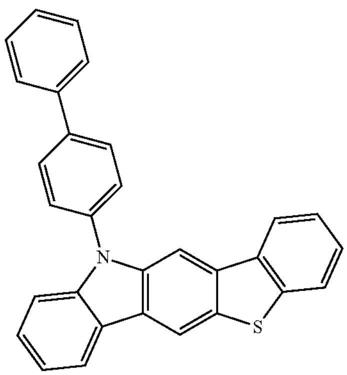
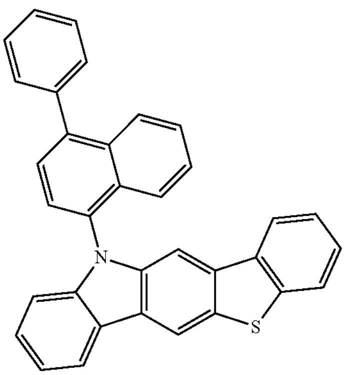
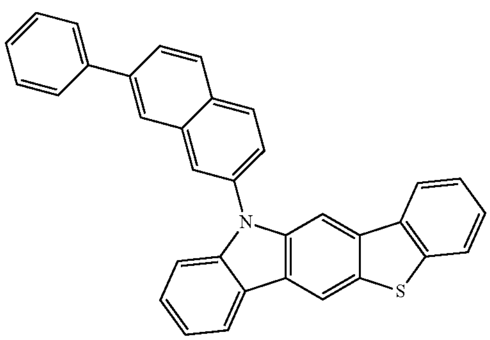
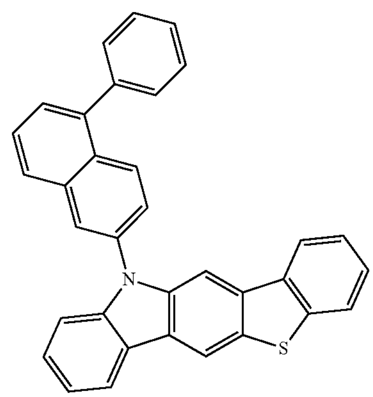
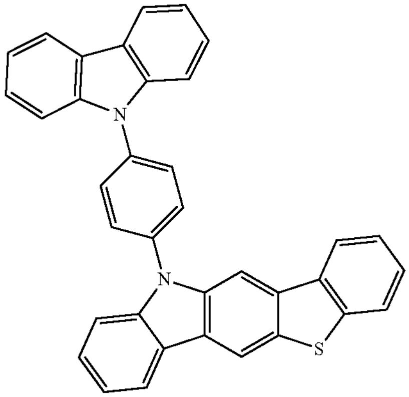
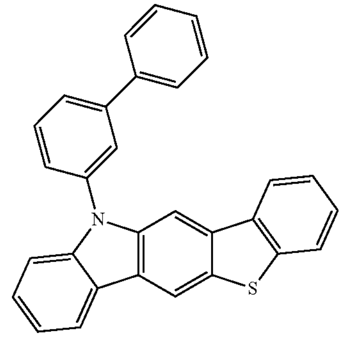

-continued
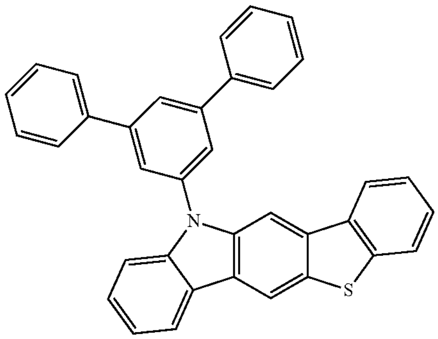
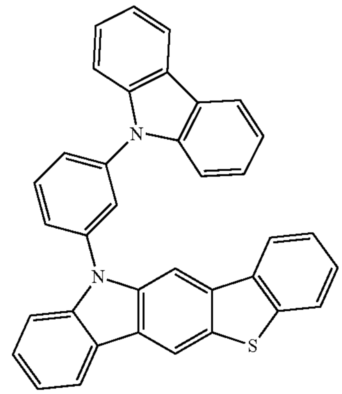
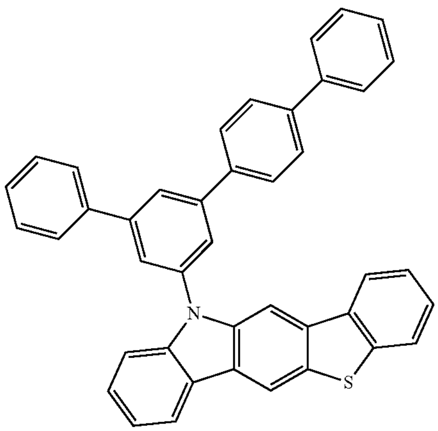
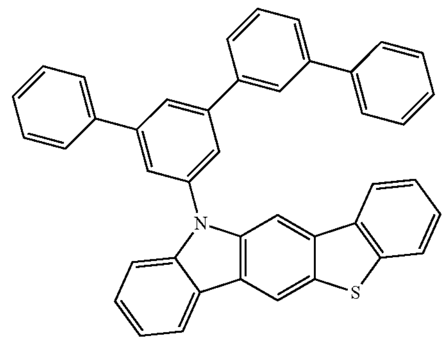
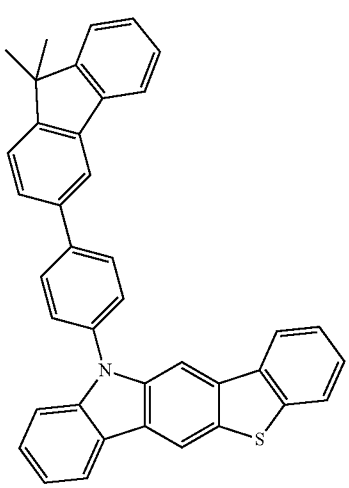
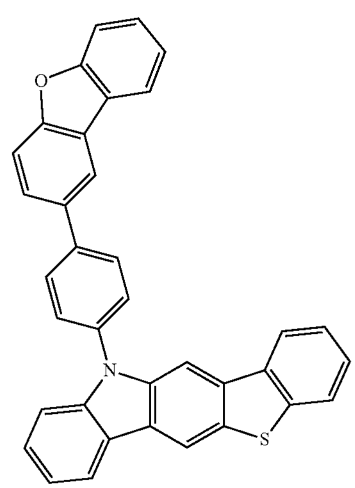

-continued
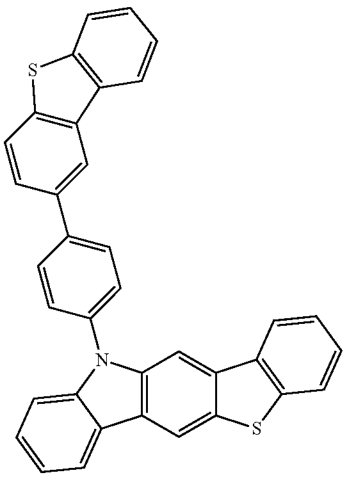
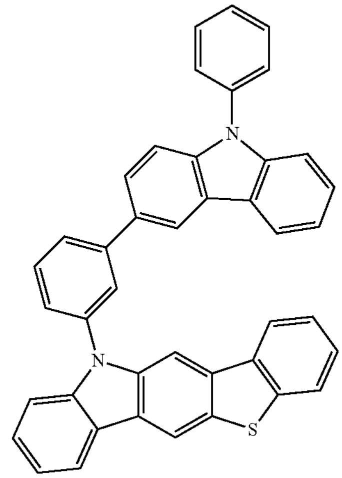
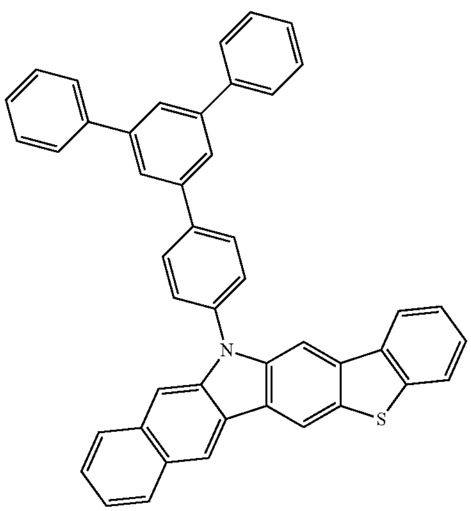
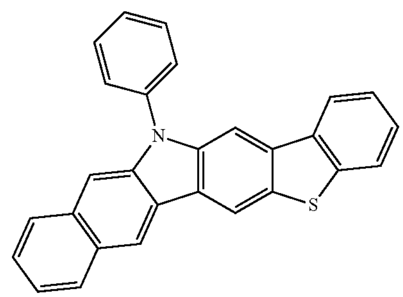
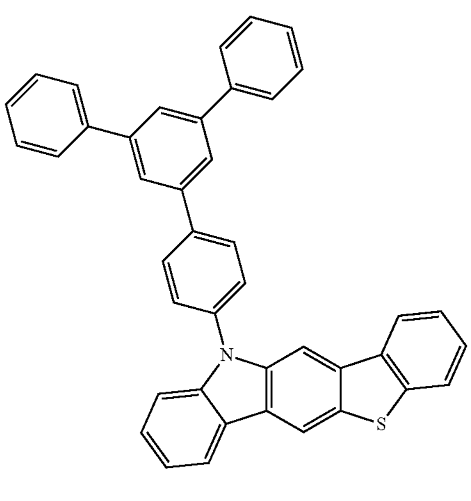
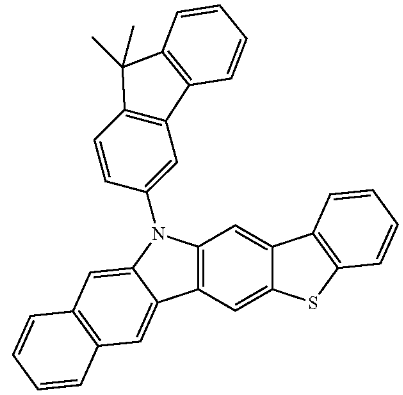

-continued
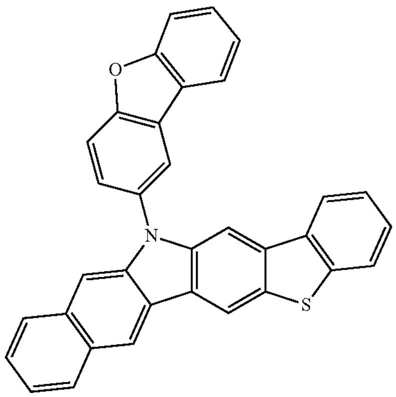
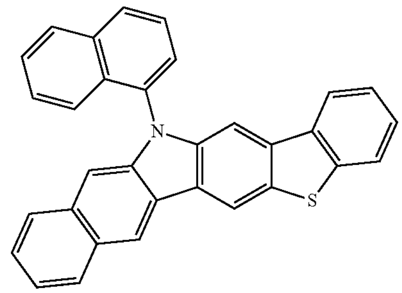
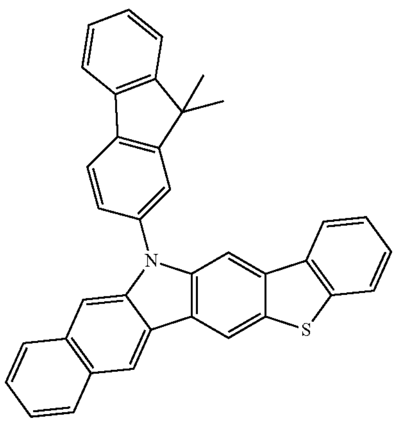
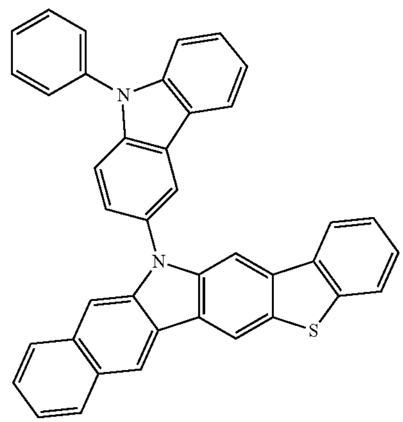
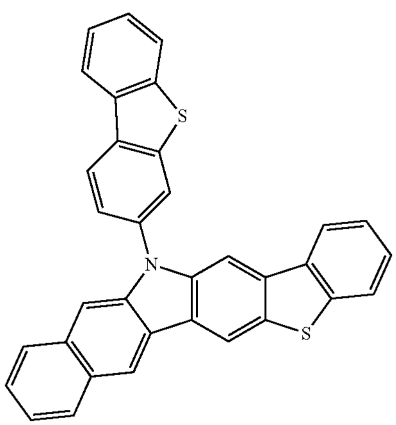
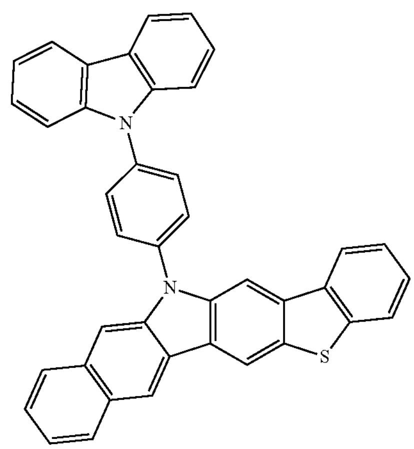
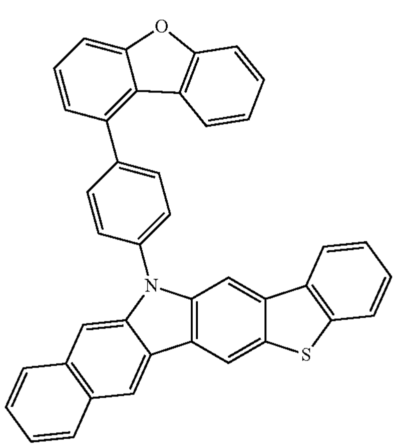
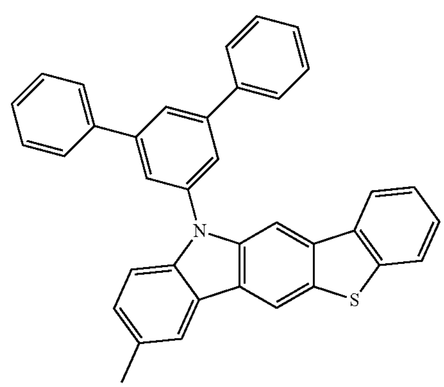

-continued
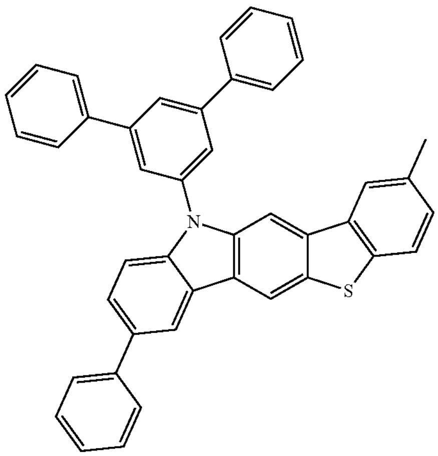
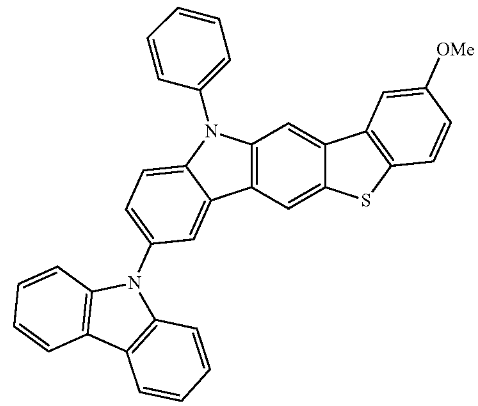
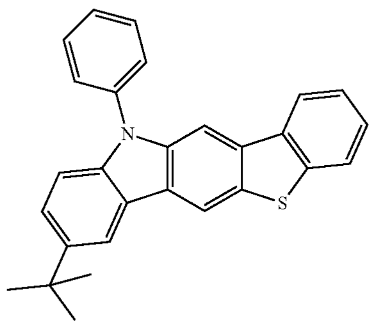
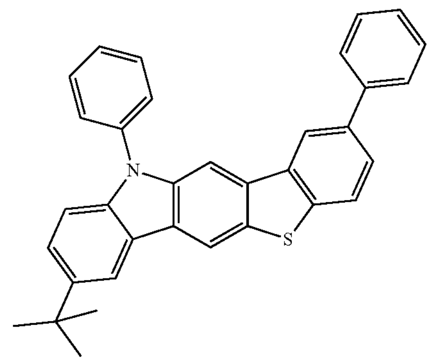
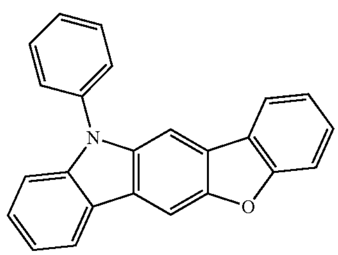
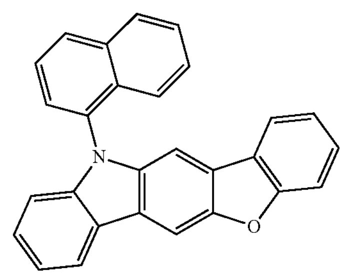
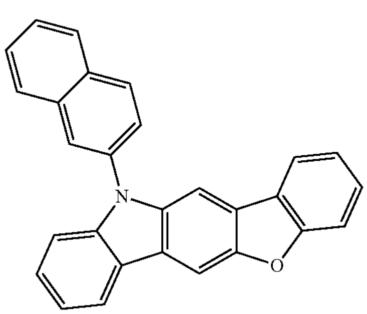
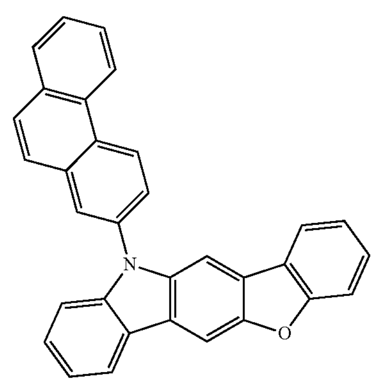

-continued
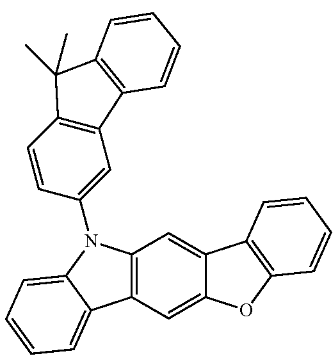
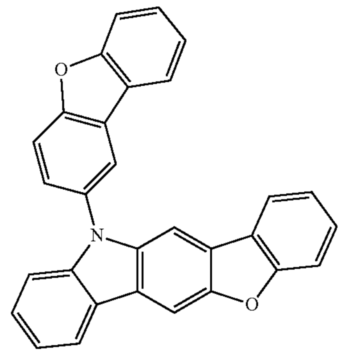
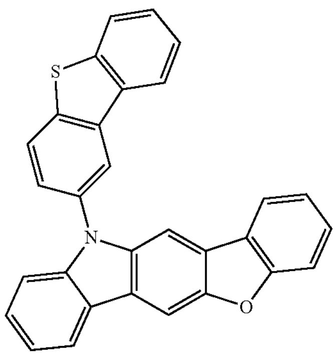
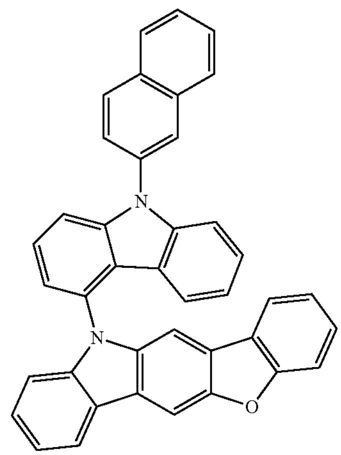
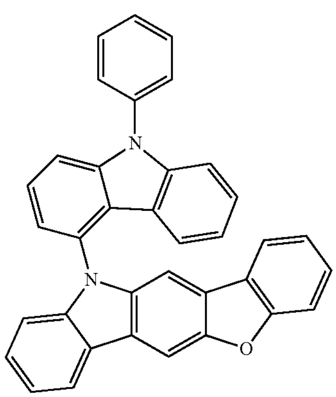
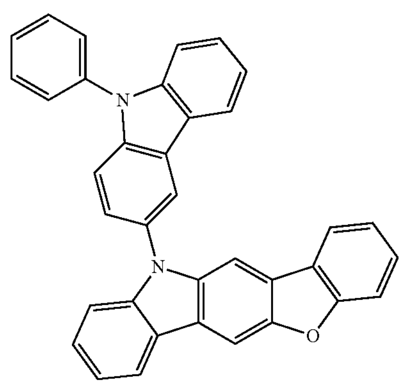
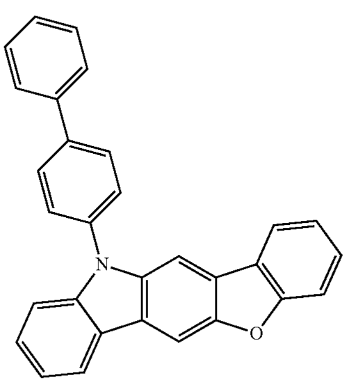
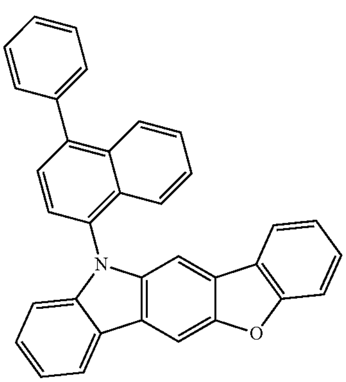

-continued
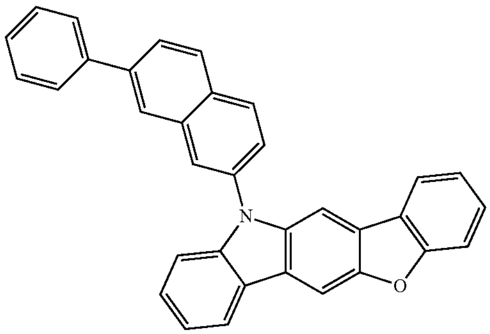
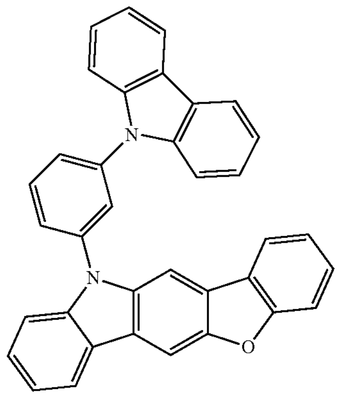
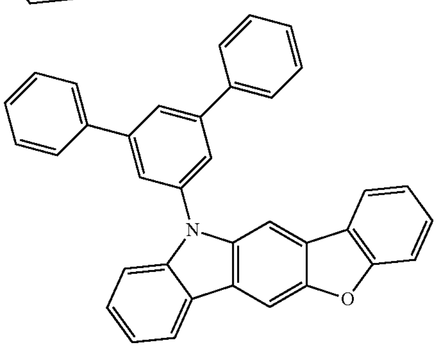
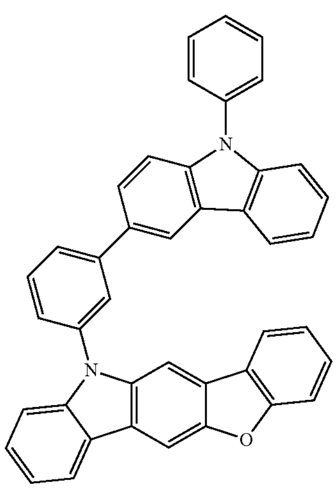
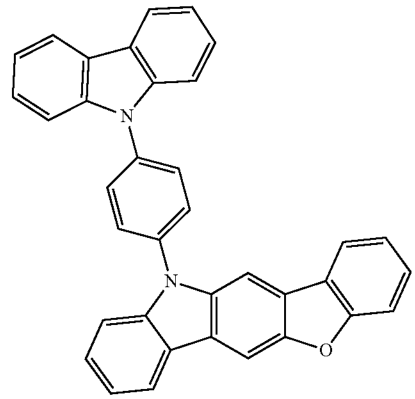
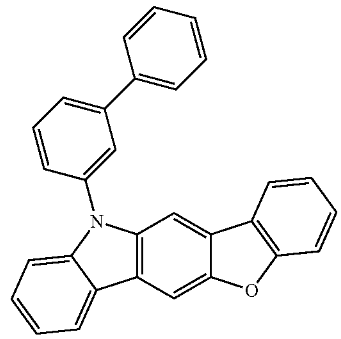
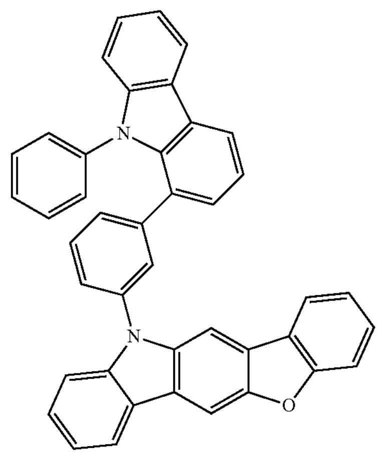
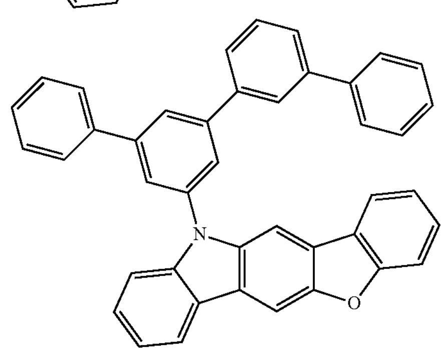

-continued
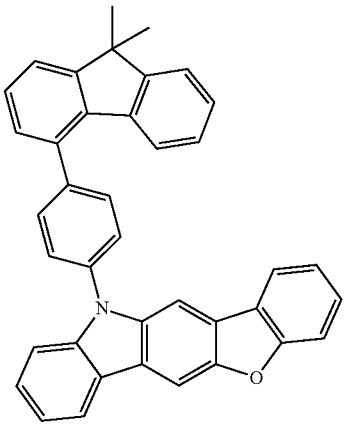
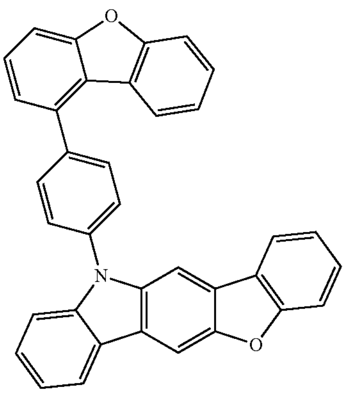
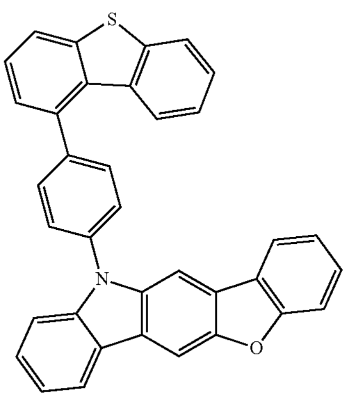
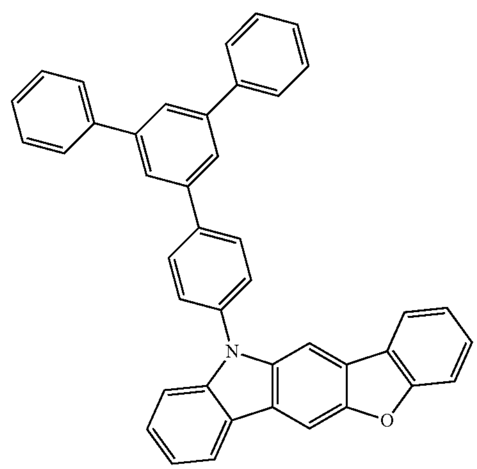
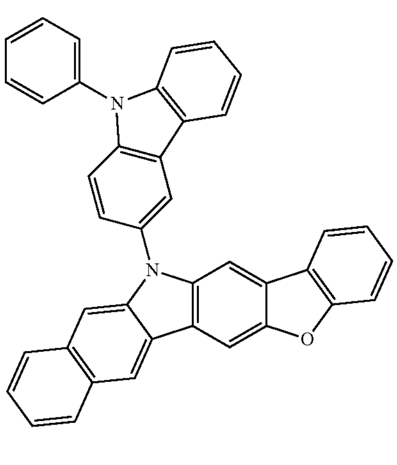
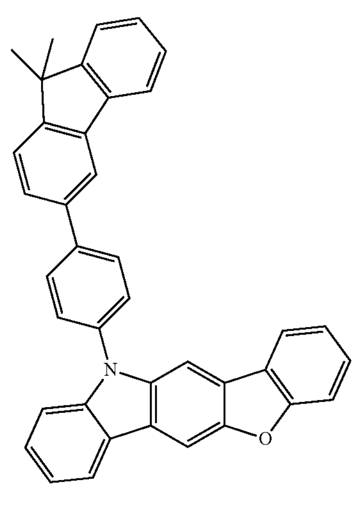

-continued
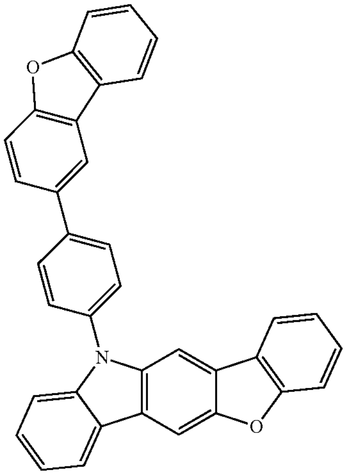
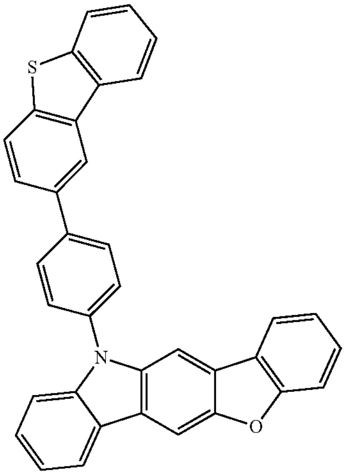
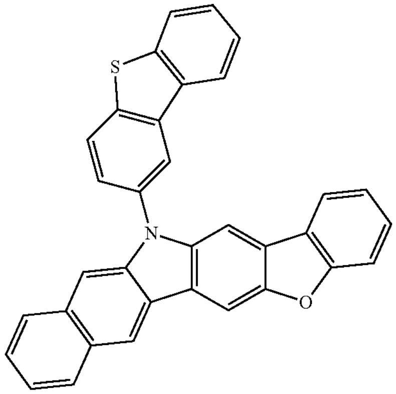
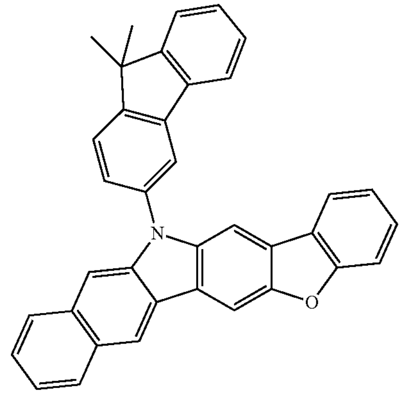
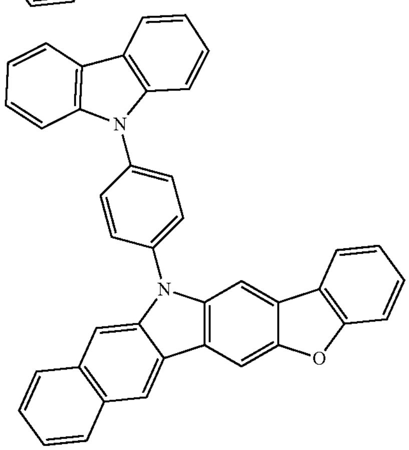
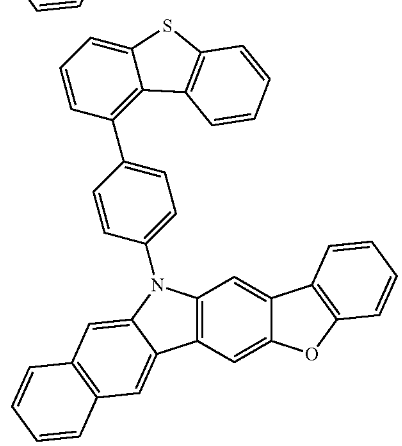
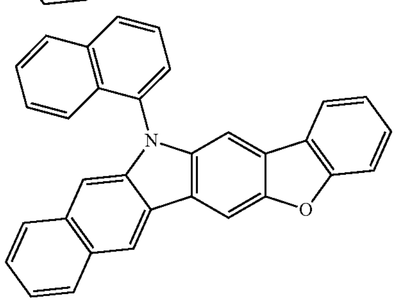
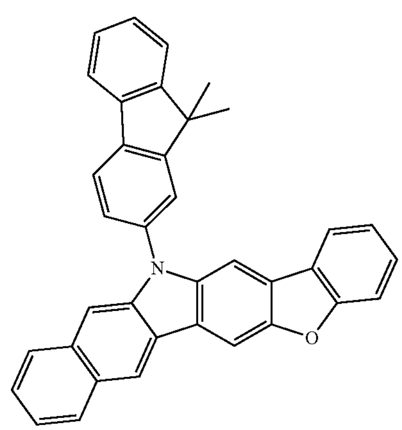

-continued
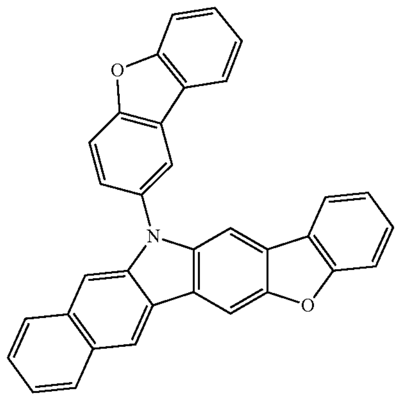
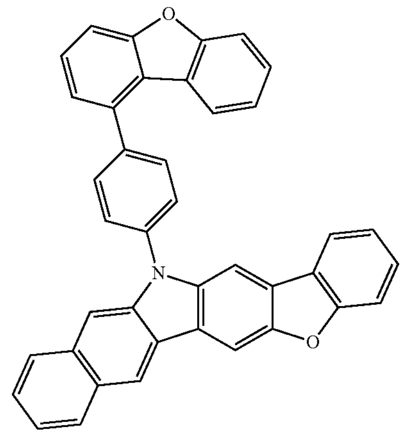
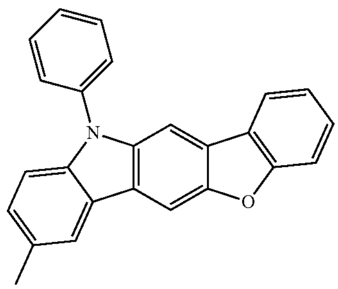
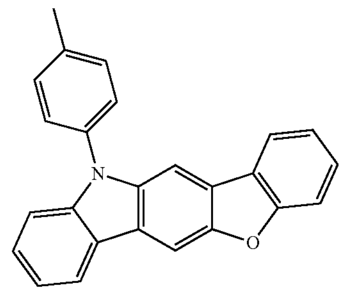
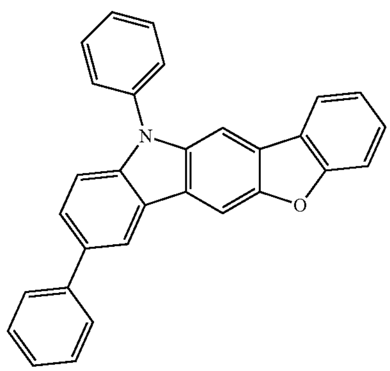
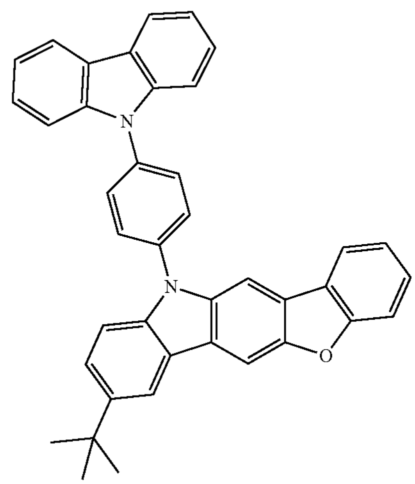
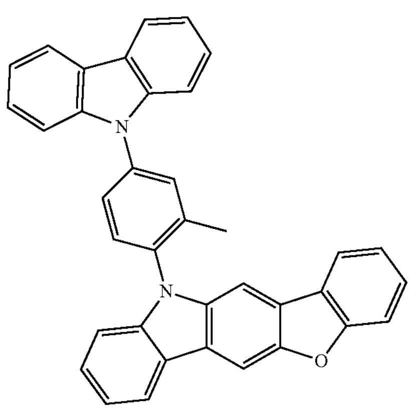
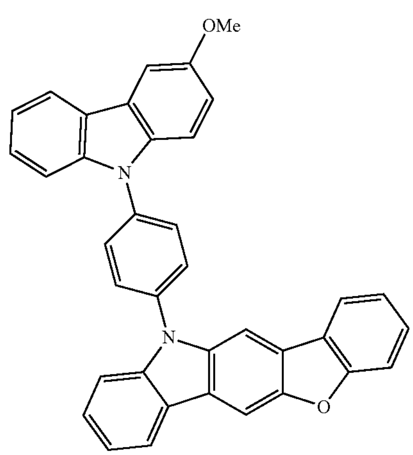

-continued
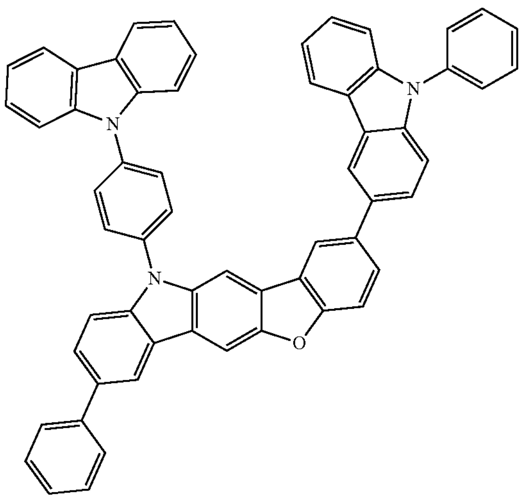
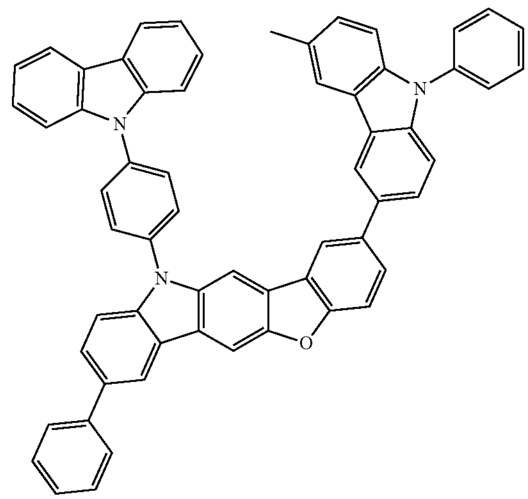
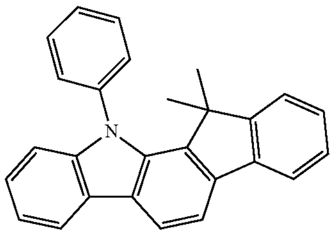
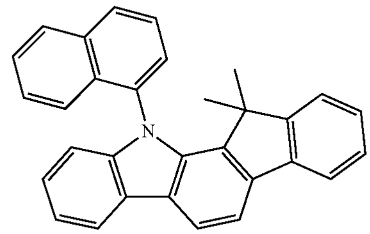
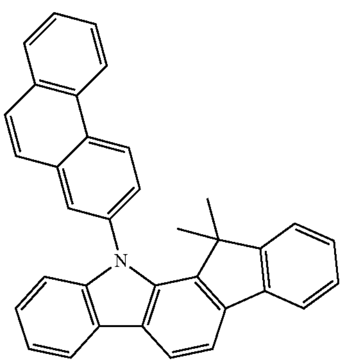
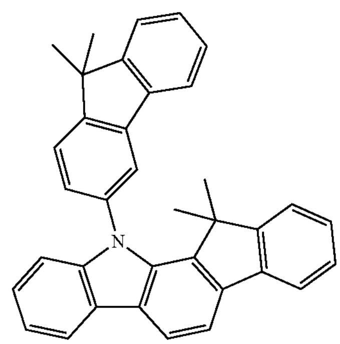
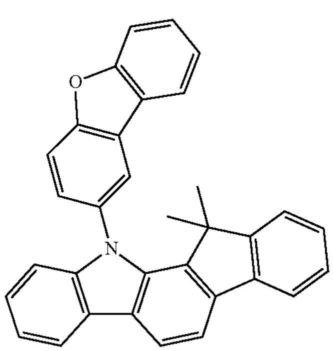
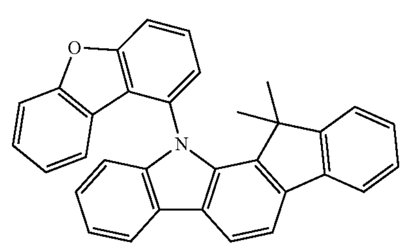
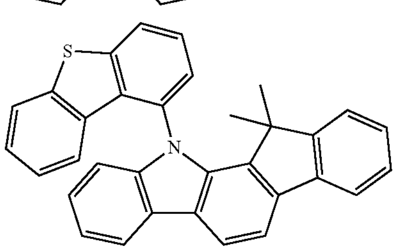
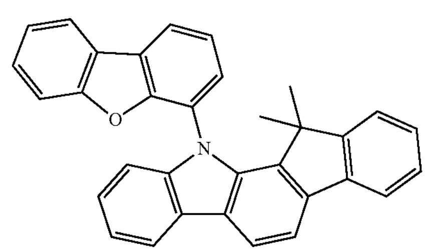

-continued
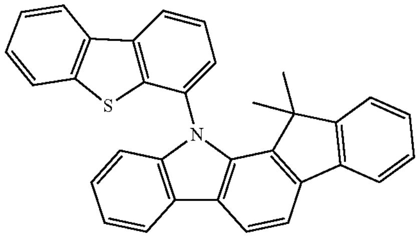
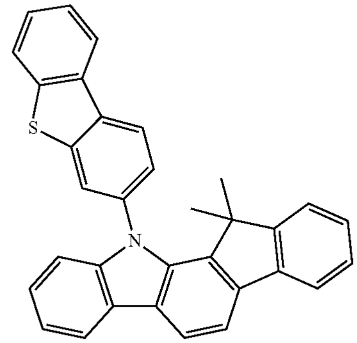
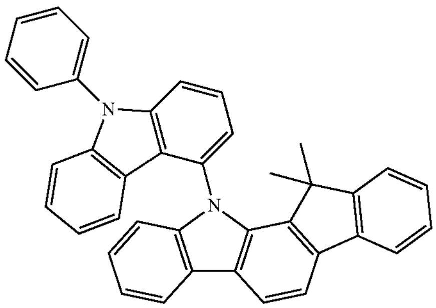
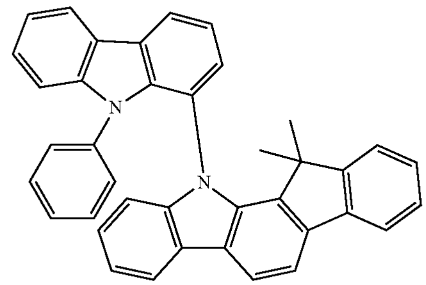
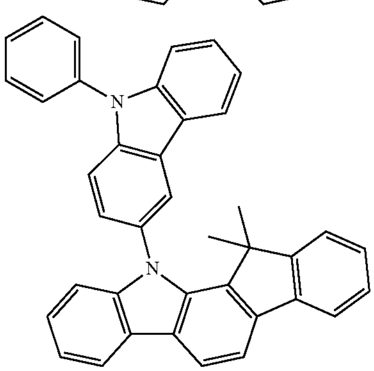
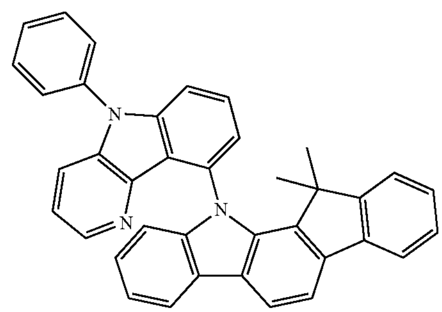
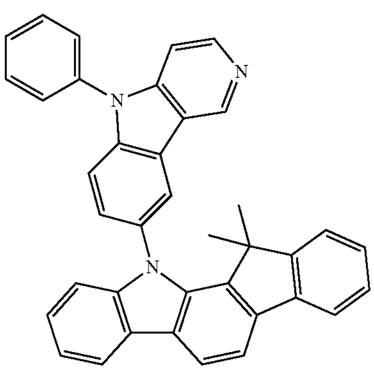
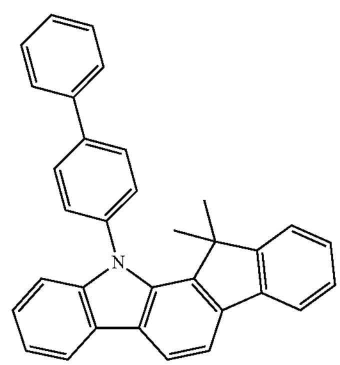
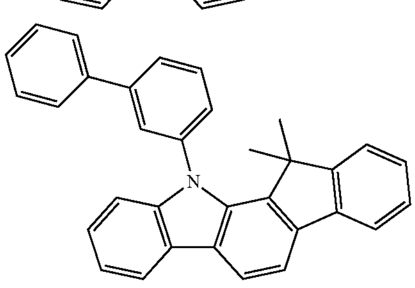
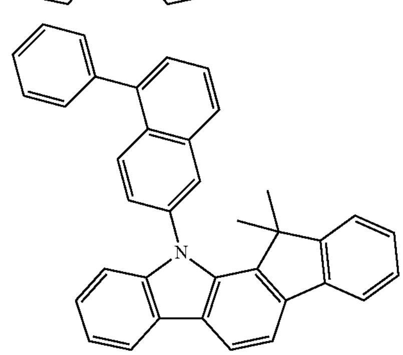

-continued
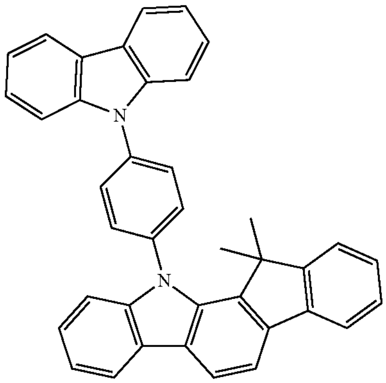
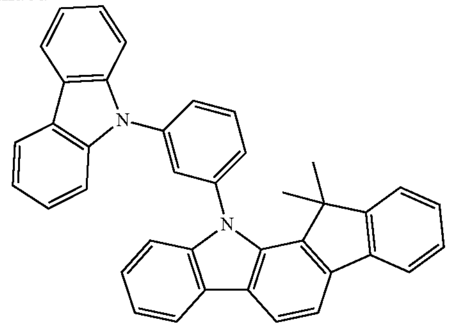
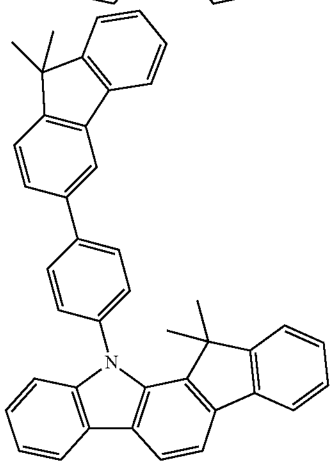
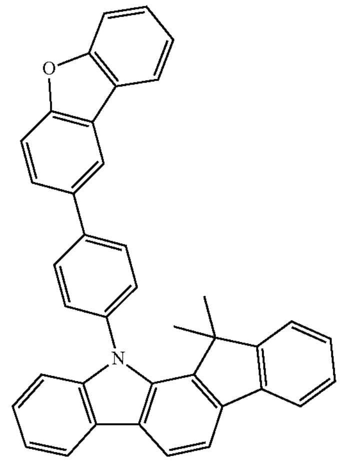
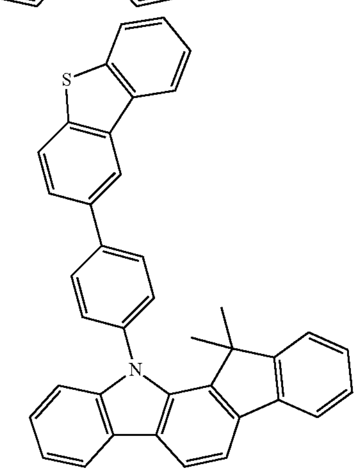
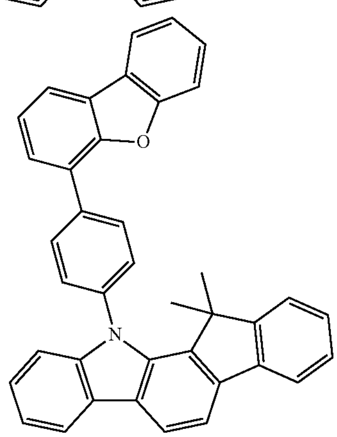
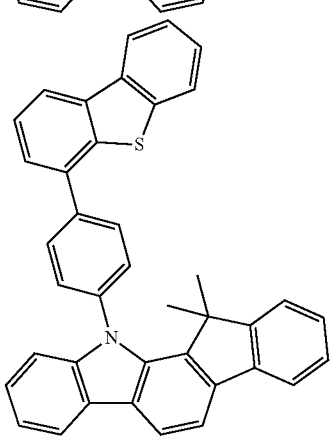
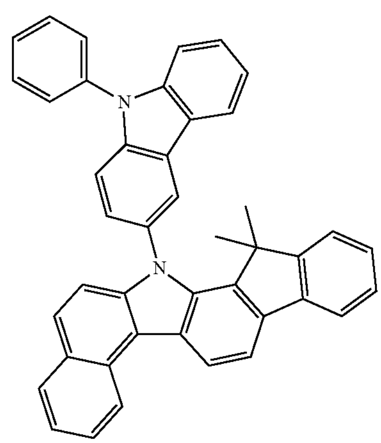

-continued
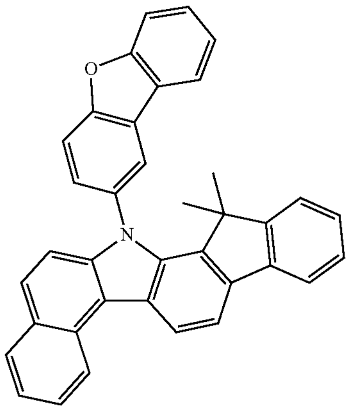
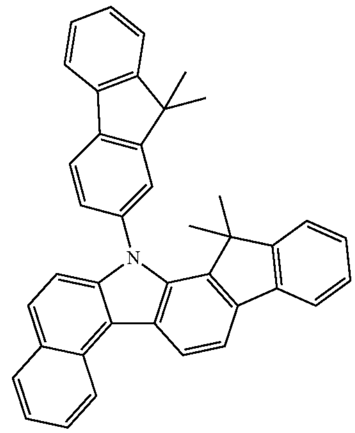
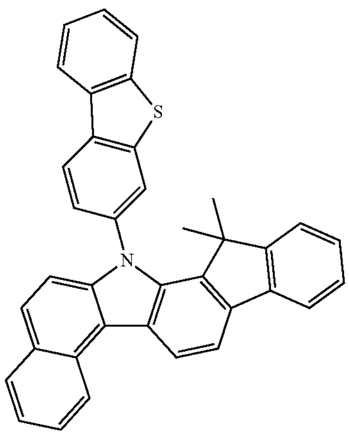
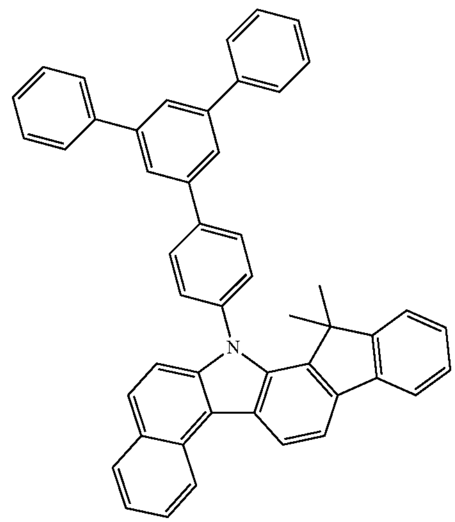
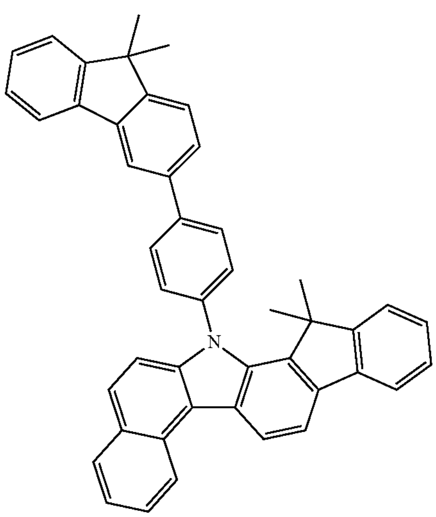
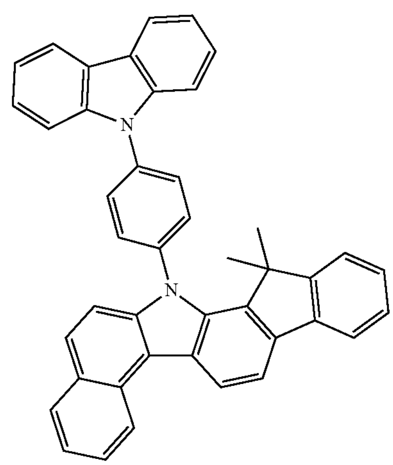

-continued
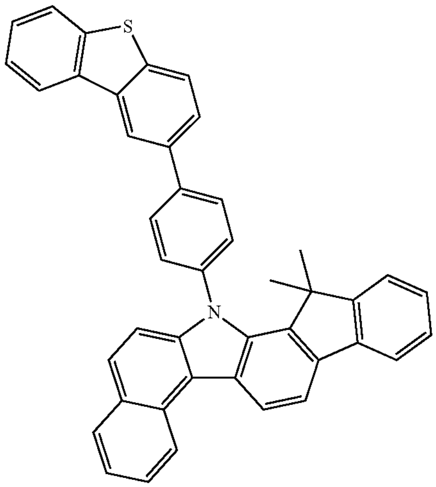
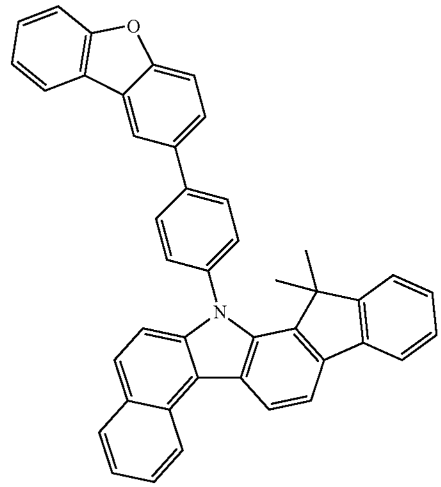
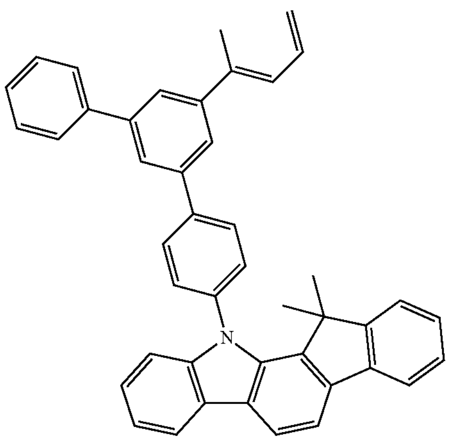
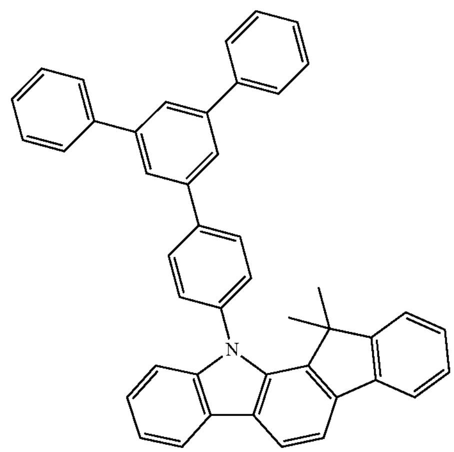
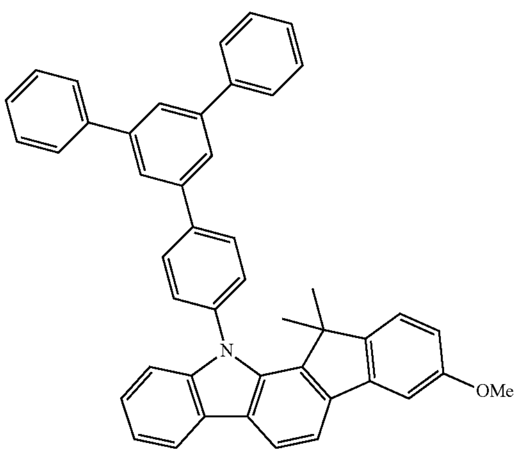
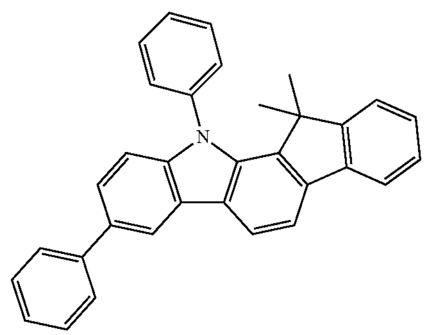
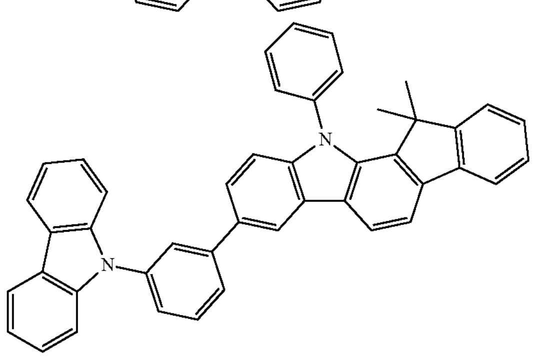
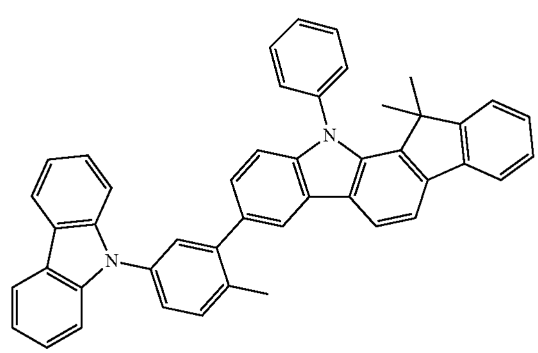

-continued
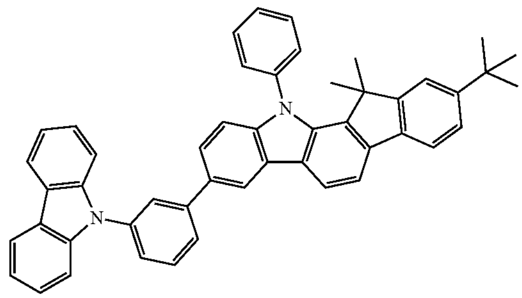
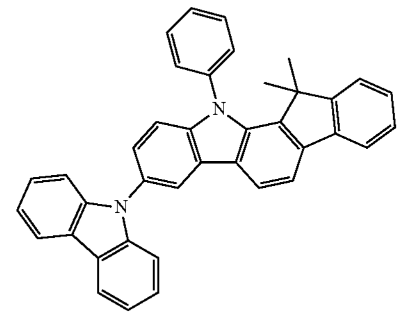
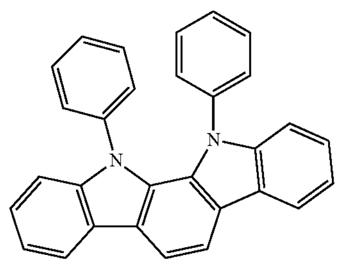
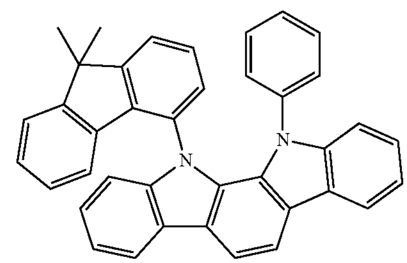
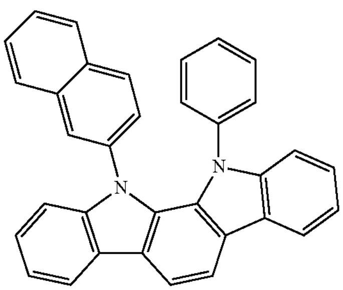
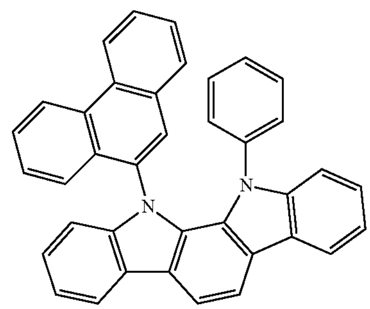
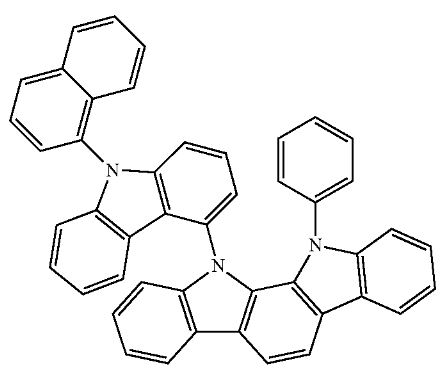
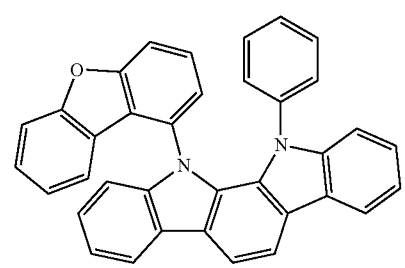
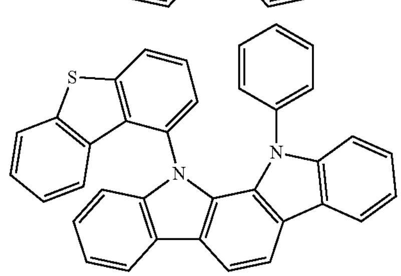
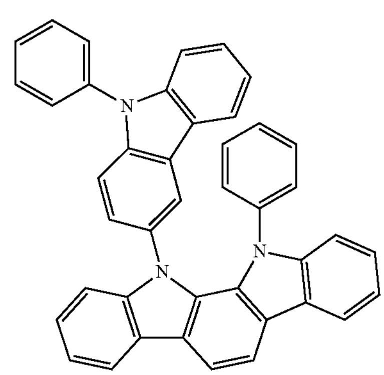

-continued
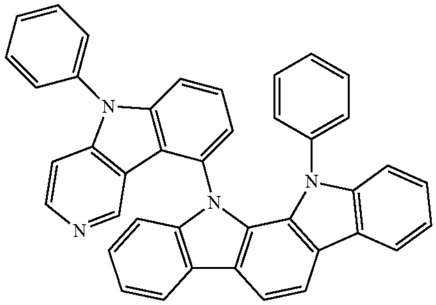
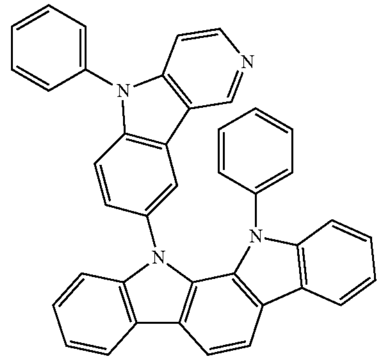
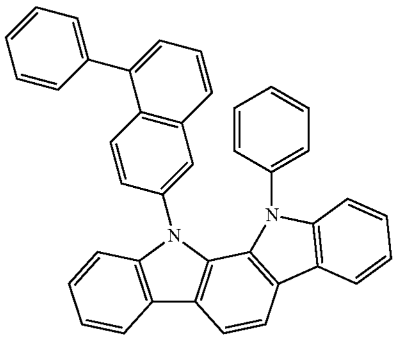
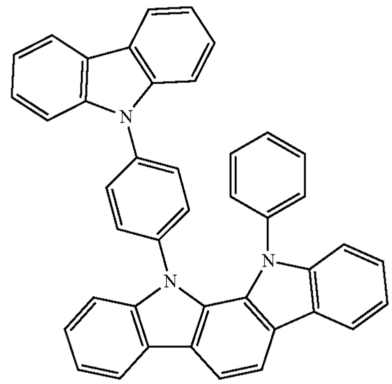
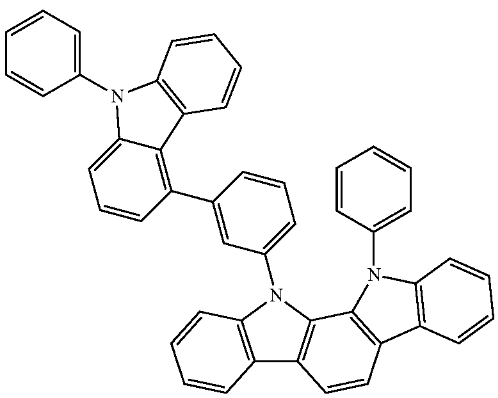
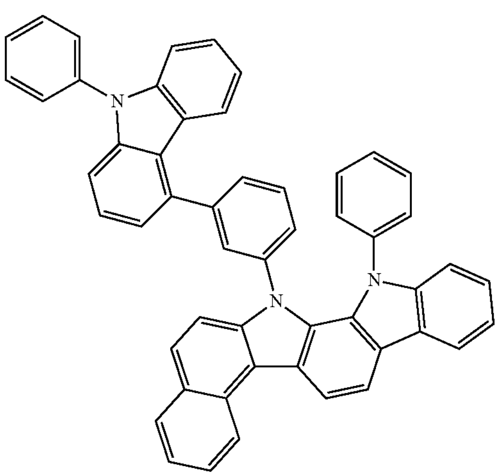
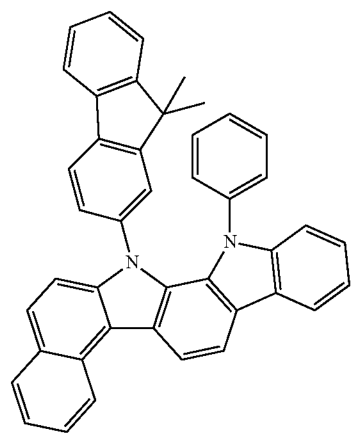

-continued
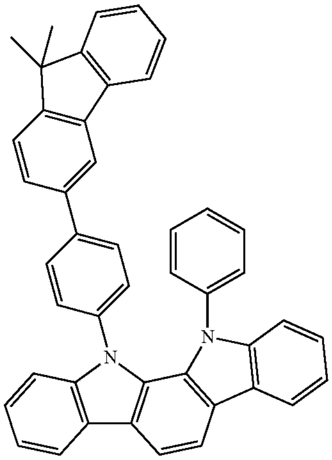
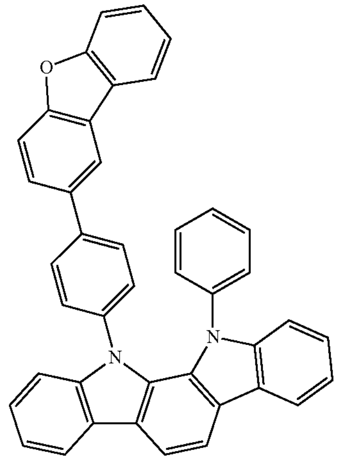
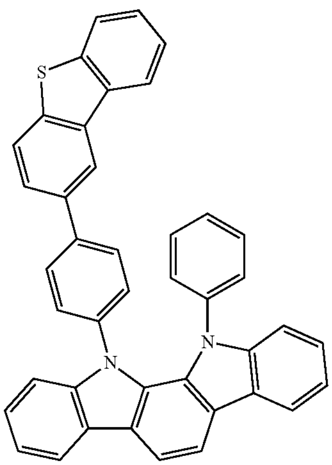
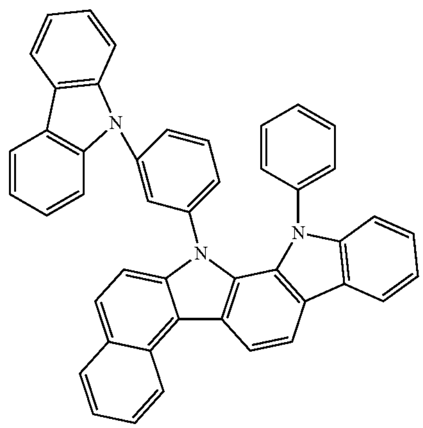
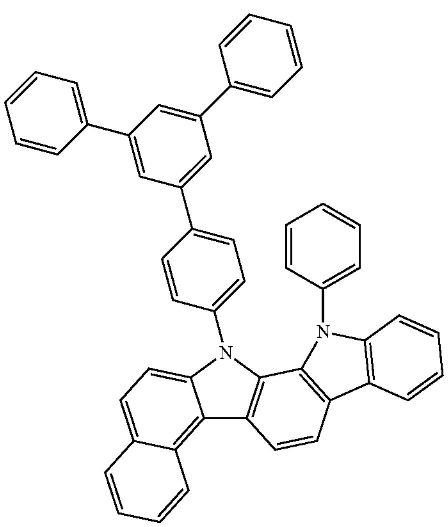
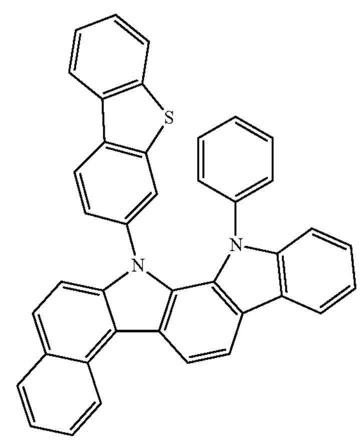

-continued
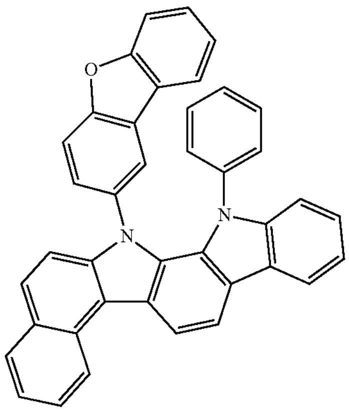
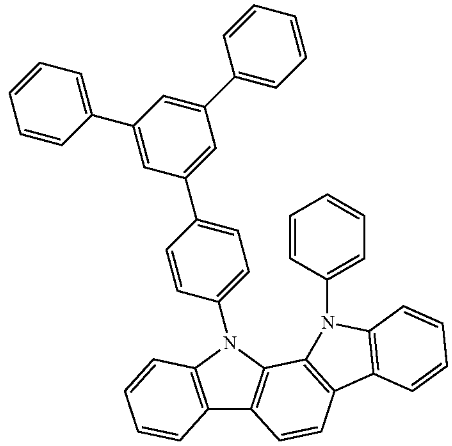
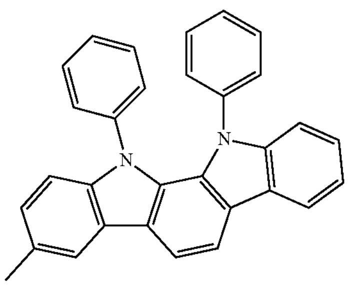
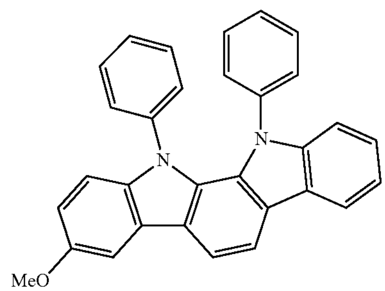
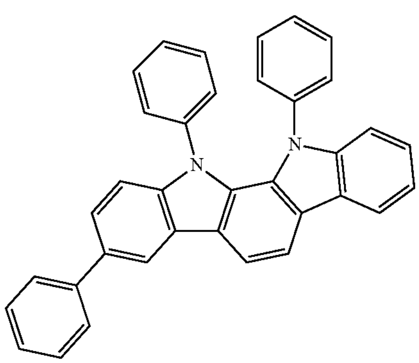
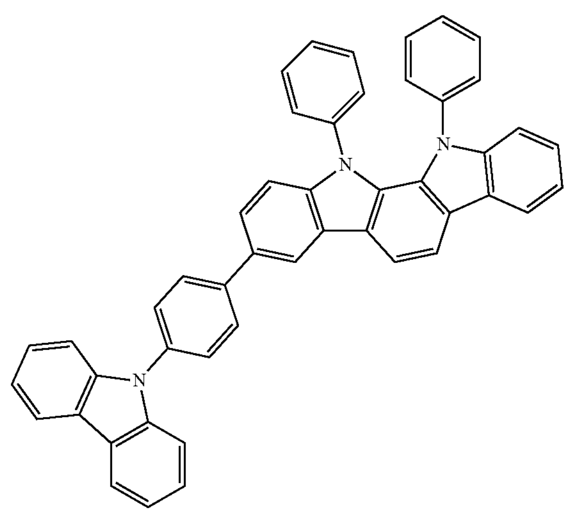

-continued
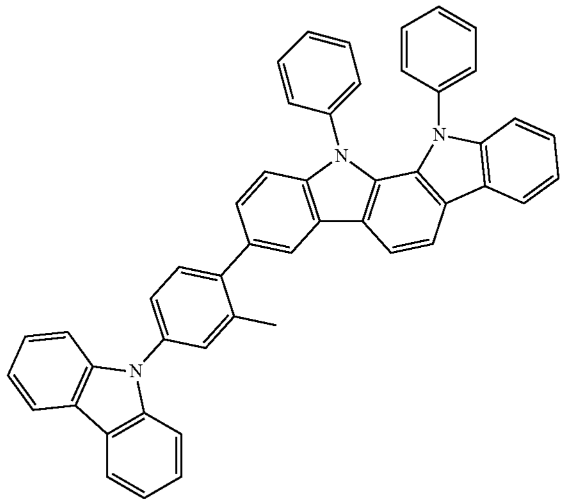
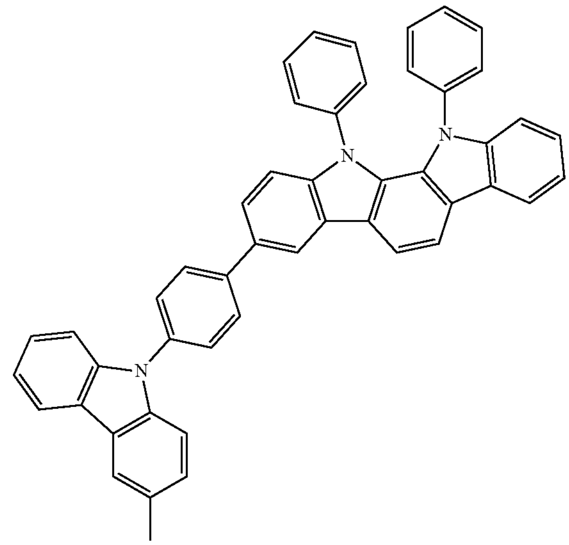
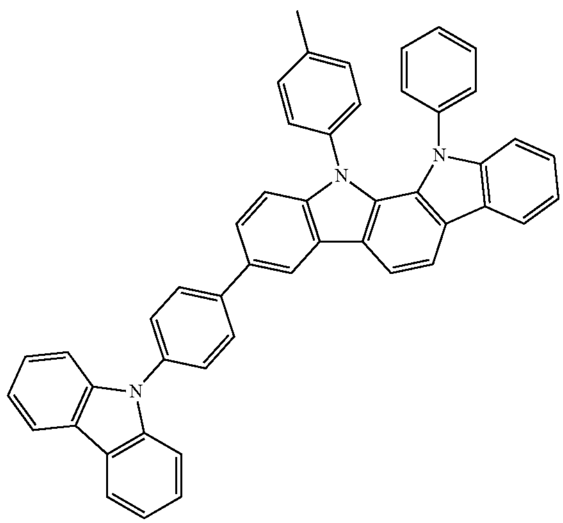
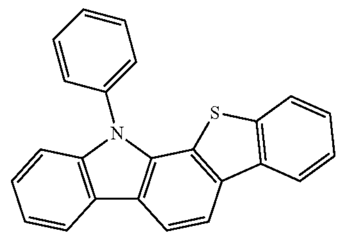
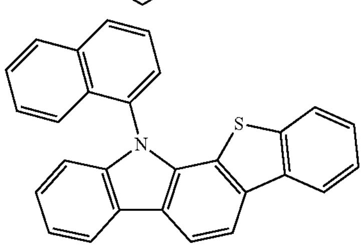
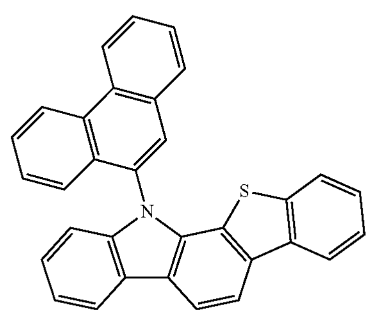
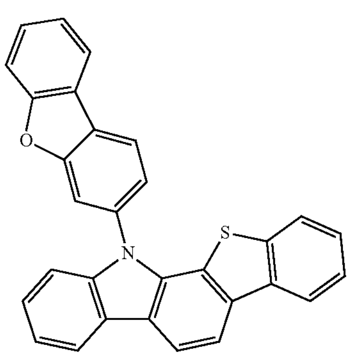
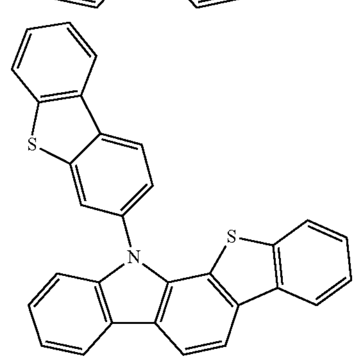

-continued
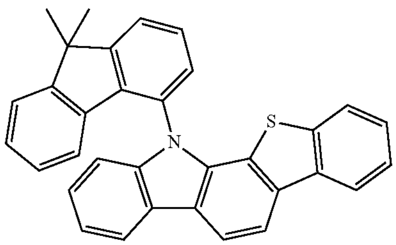
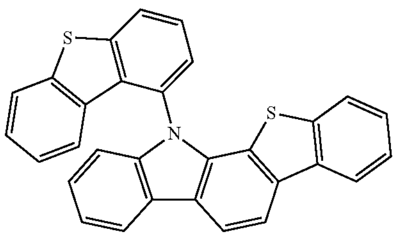
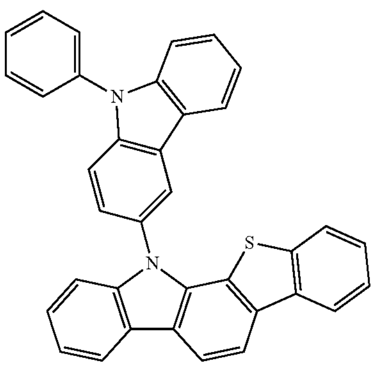
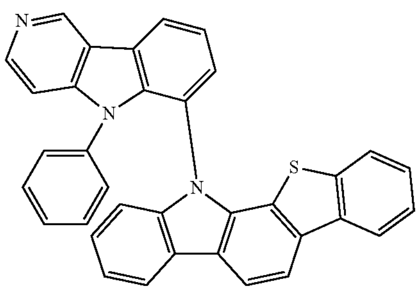
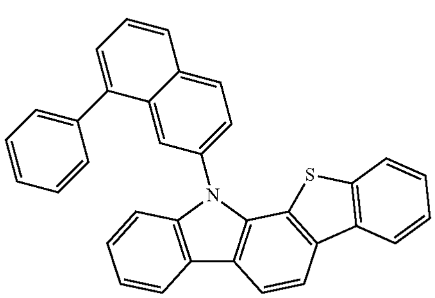
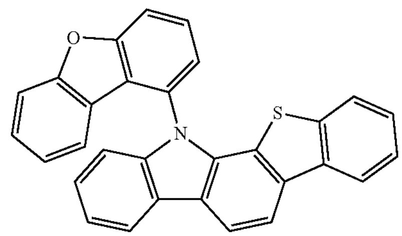
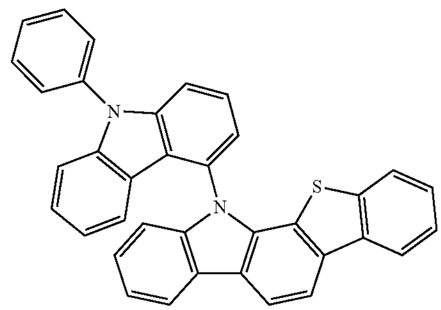
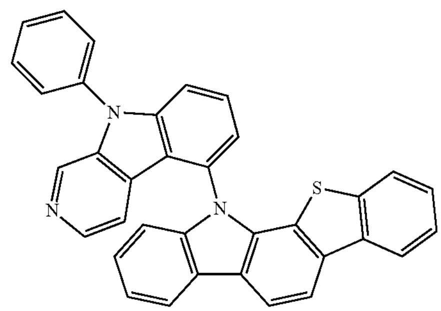
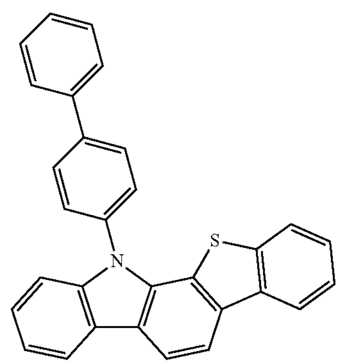
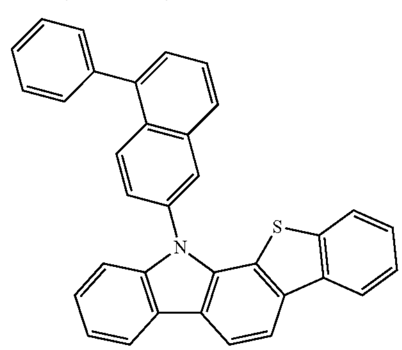

-continued
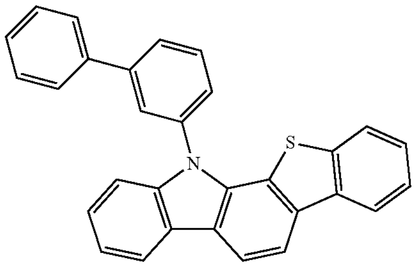
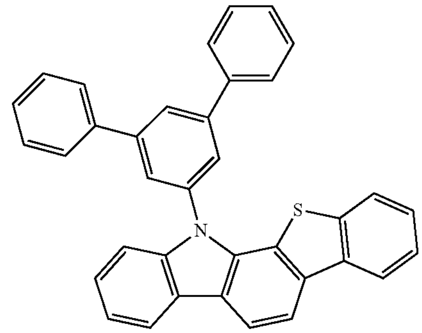
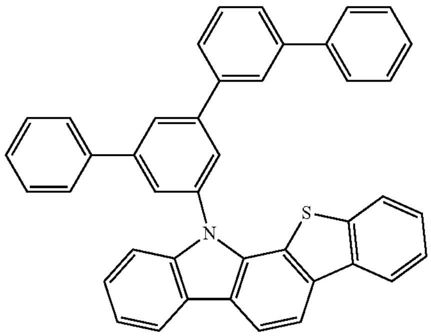
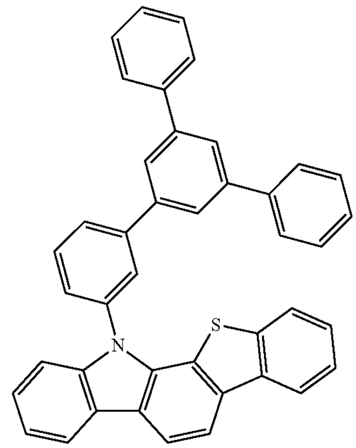
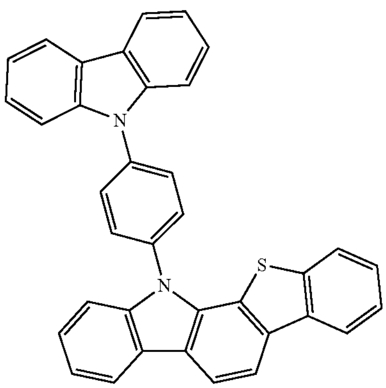
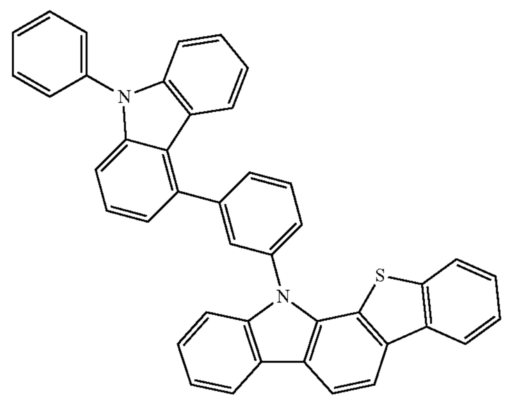
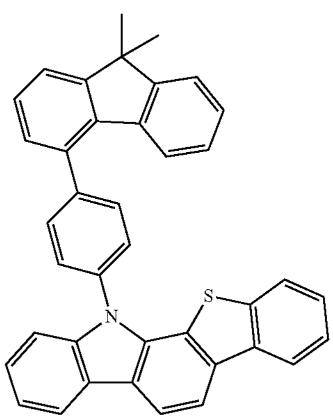
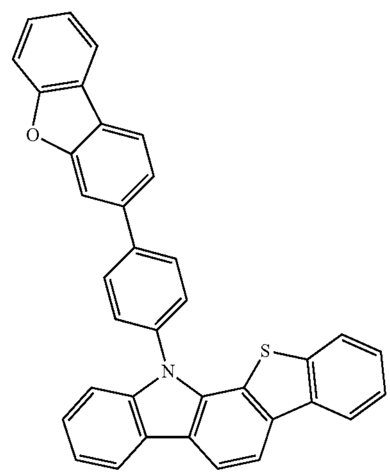

-continued
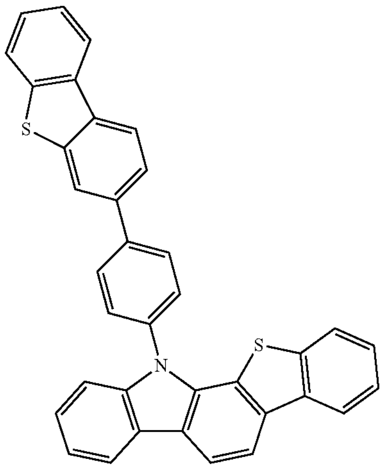
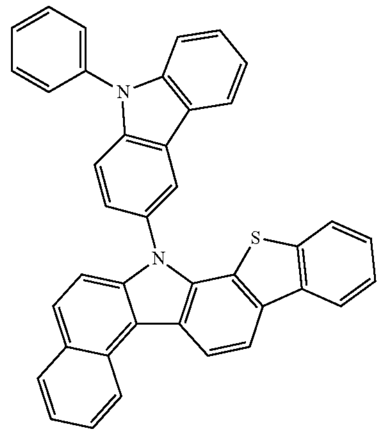
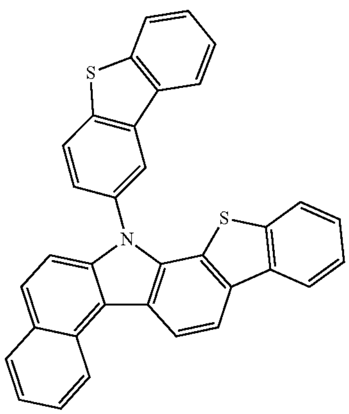
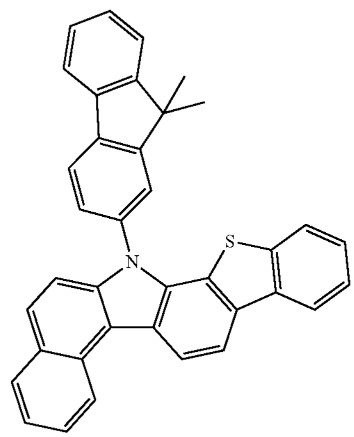
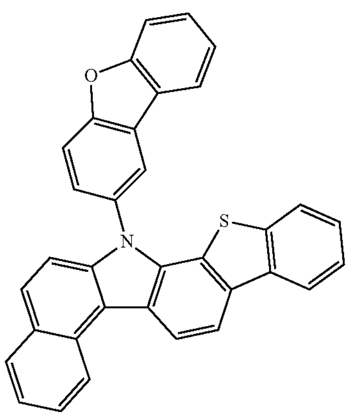
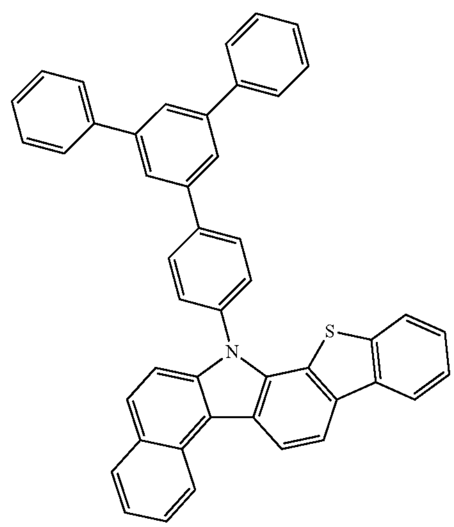

-continued
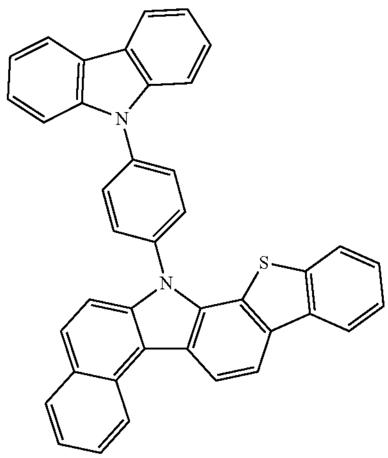
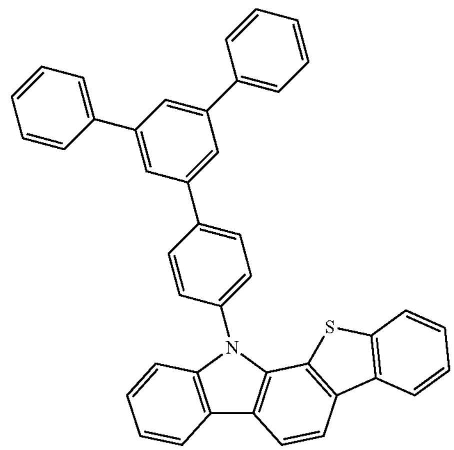
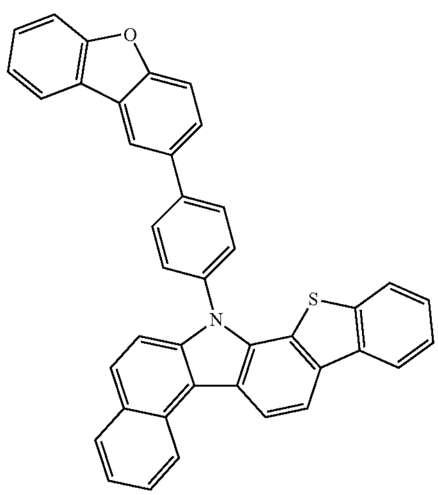
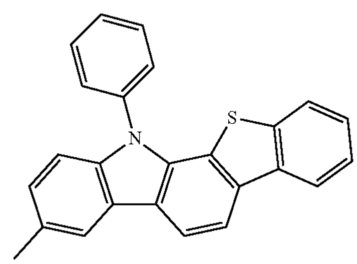
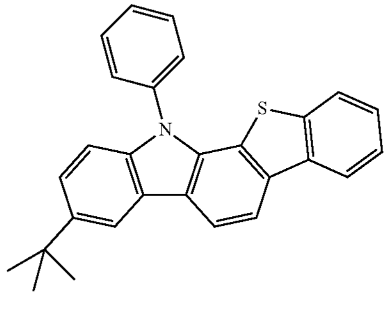
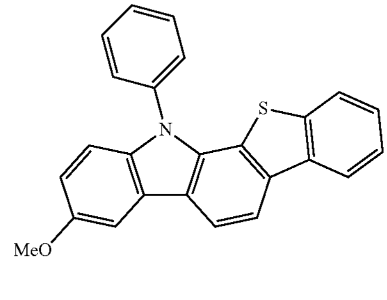

-continued
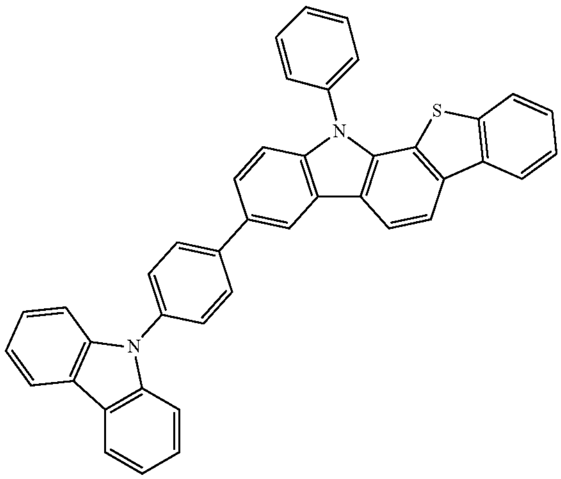
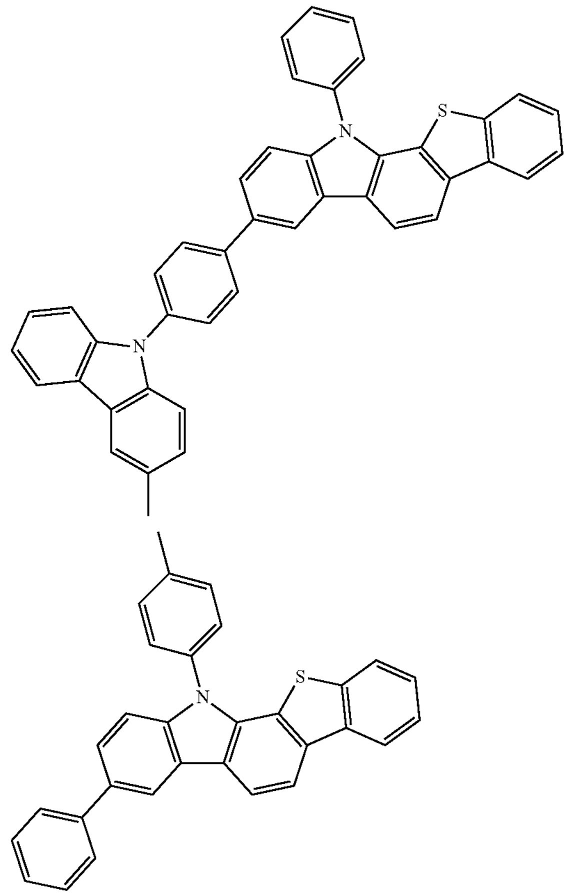
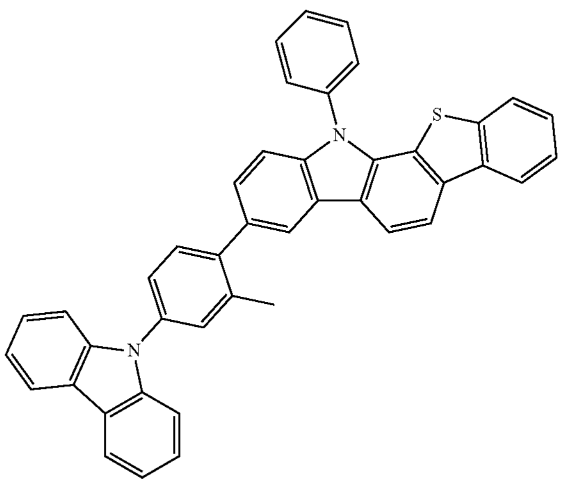
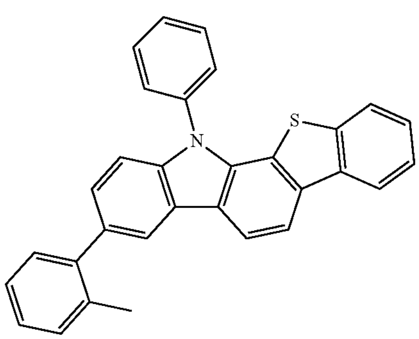
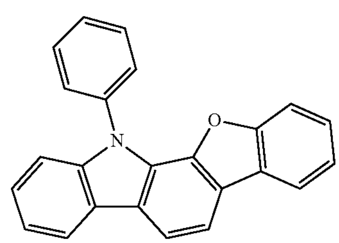
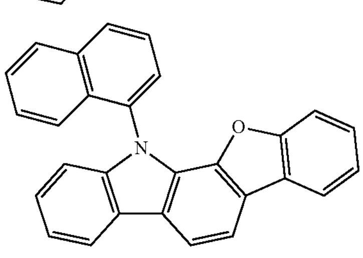
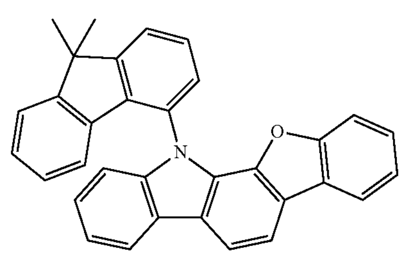

-continued
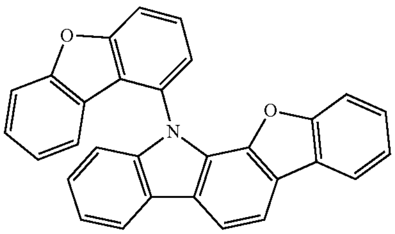
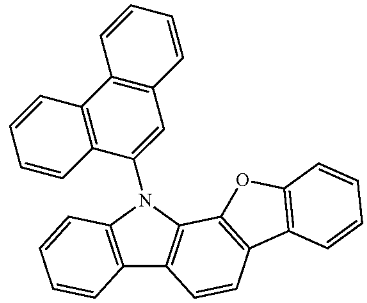
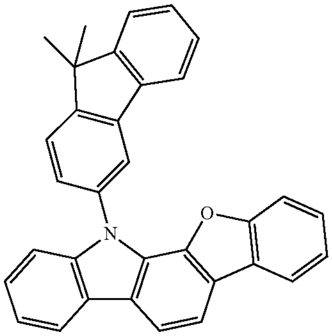
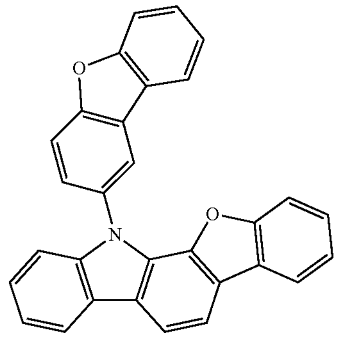
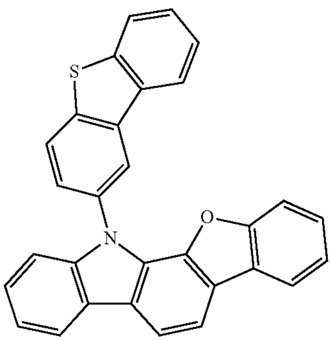
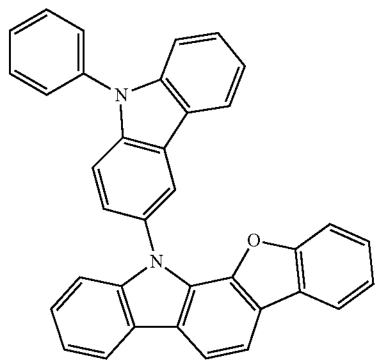
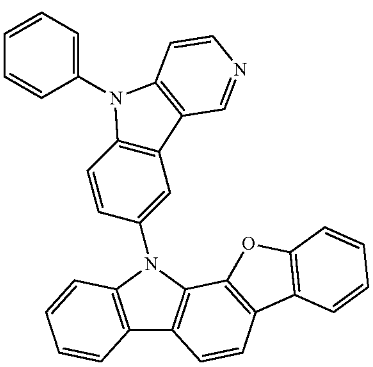
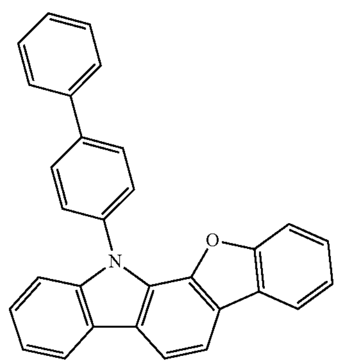
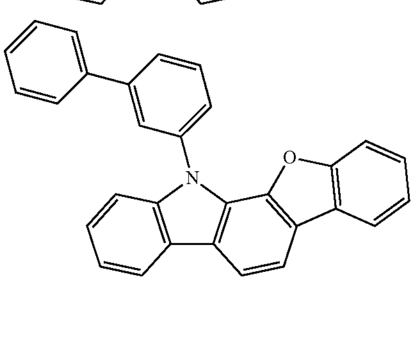
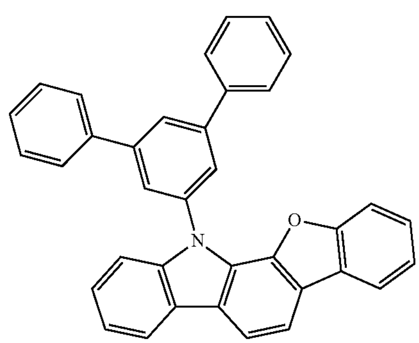

-continued
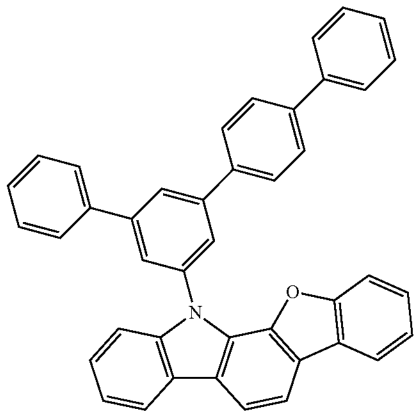
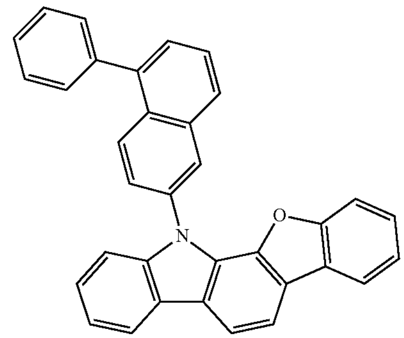
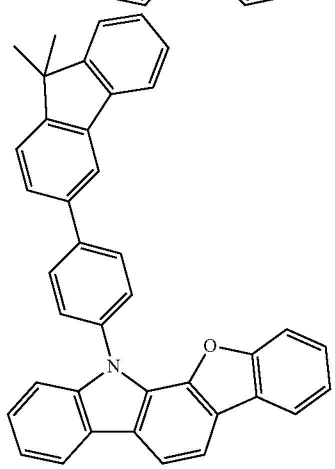
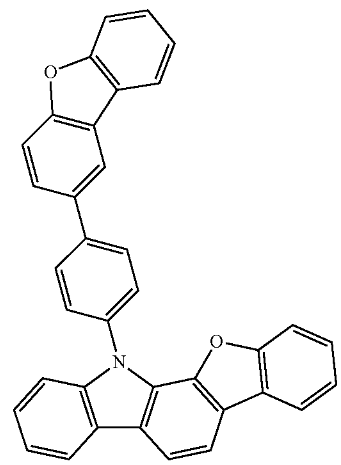
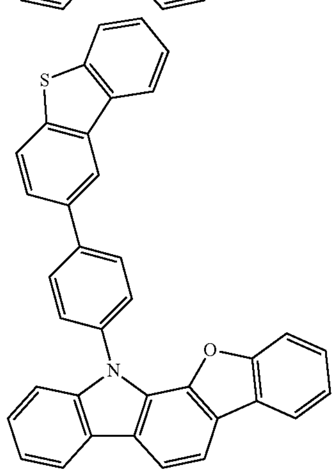
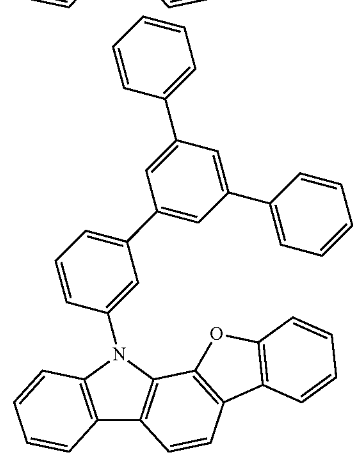
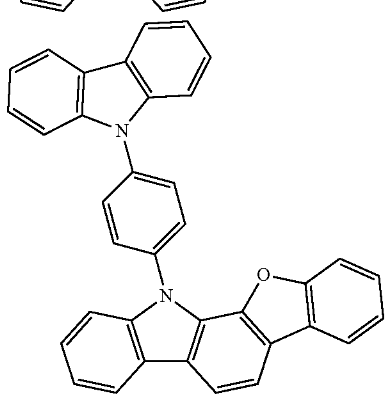
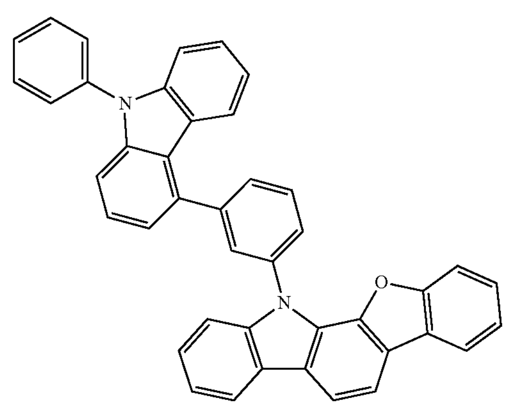

-continued
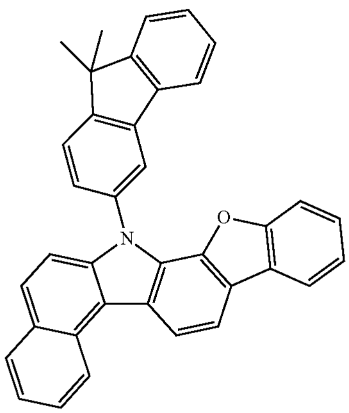
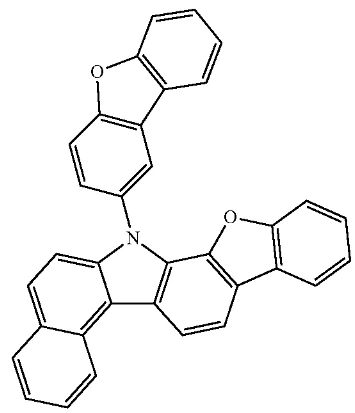
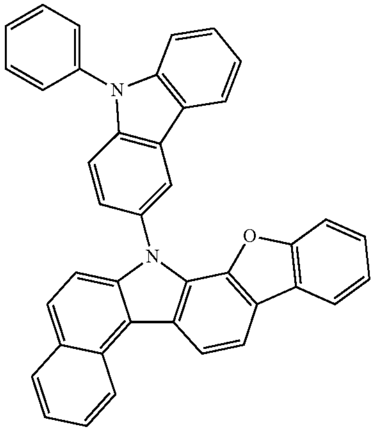
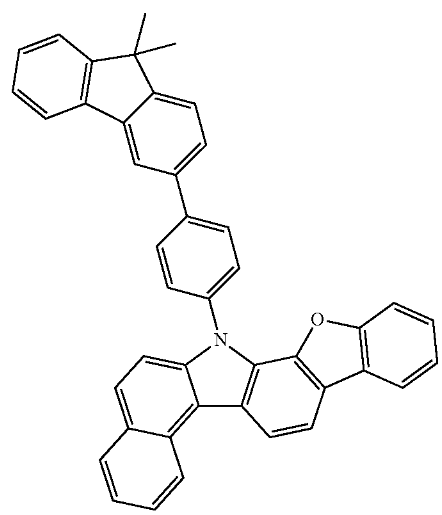
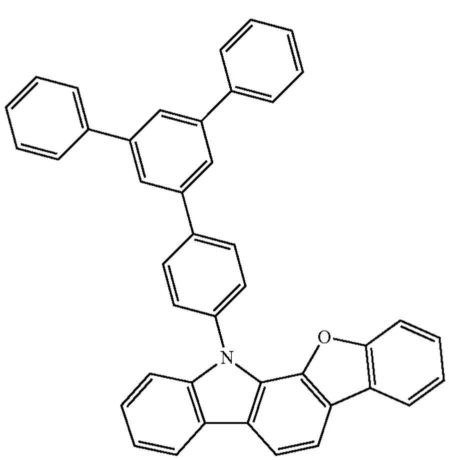
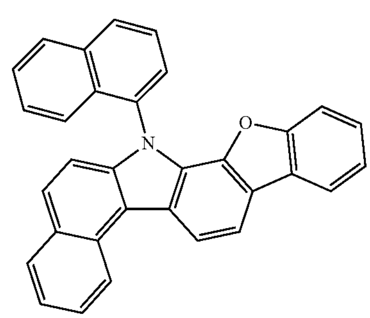

-continued
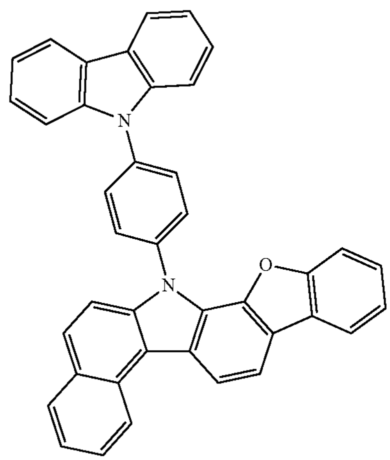
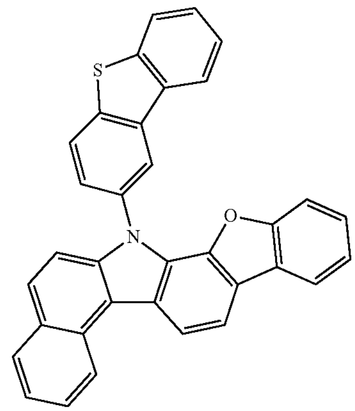
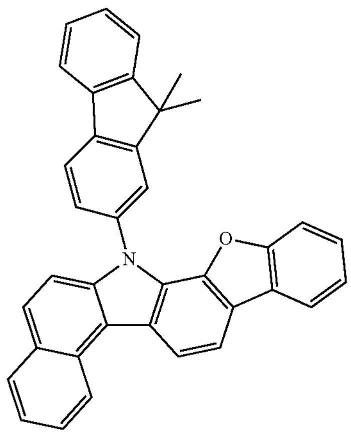
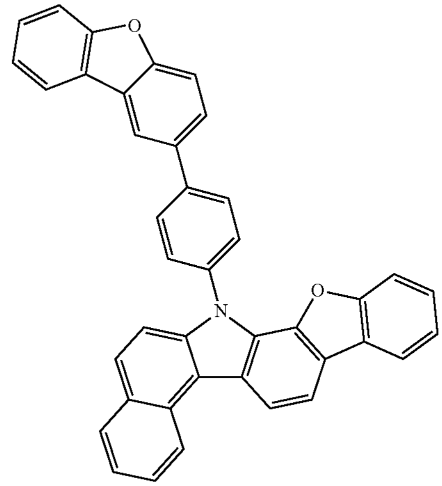
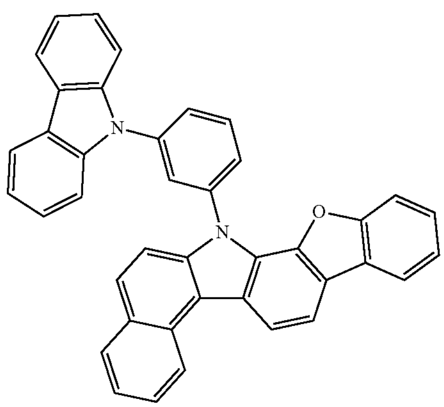
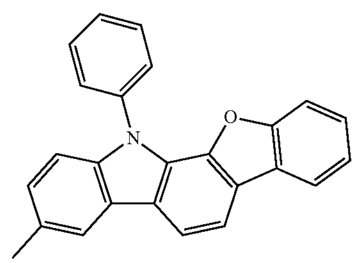
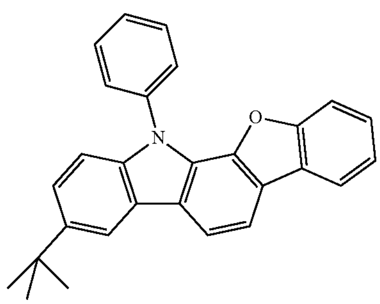
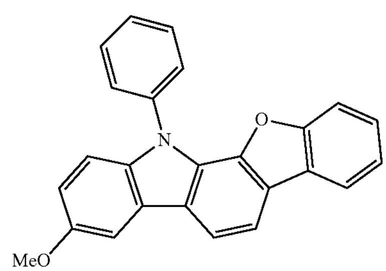

-continued
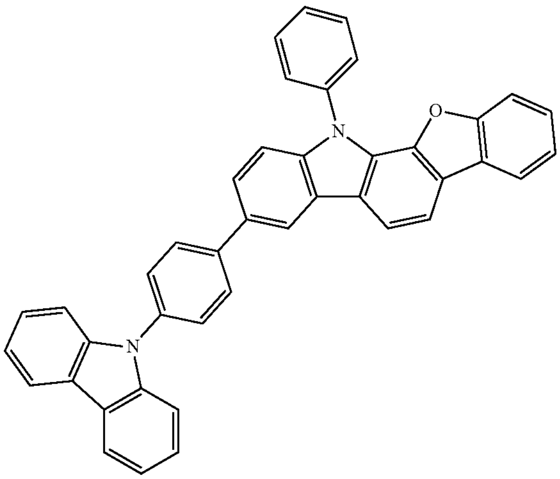
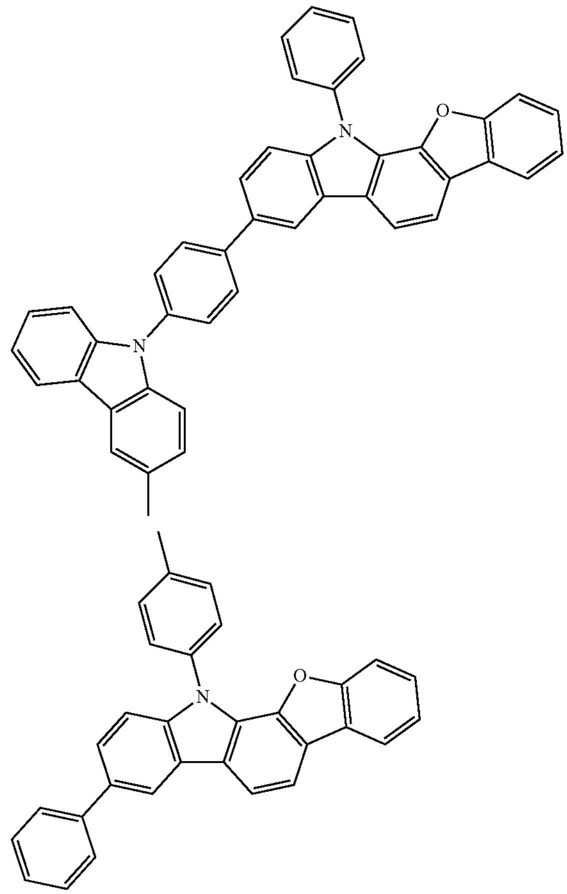
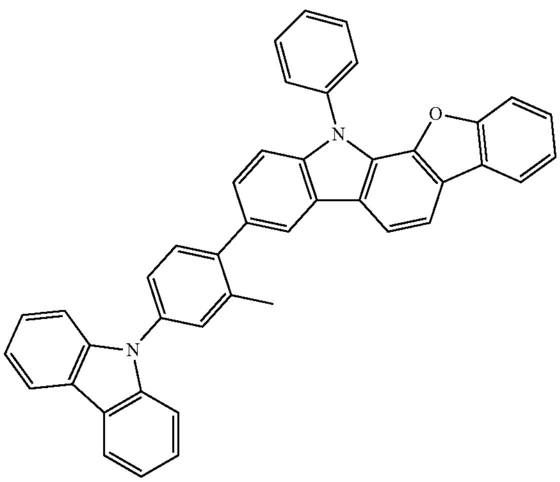
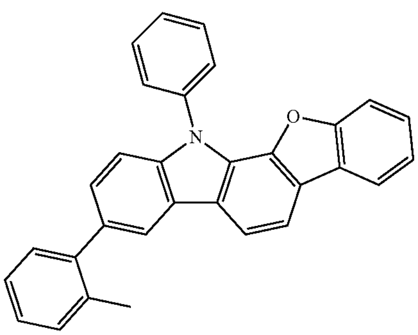
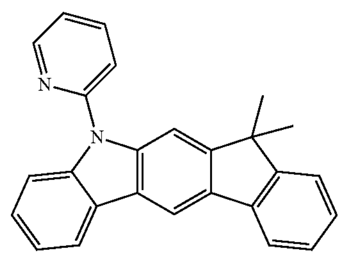
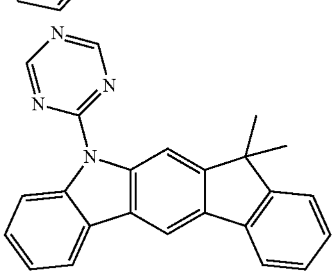
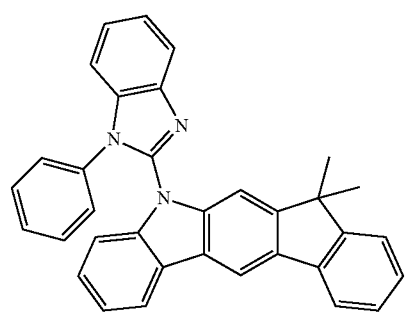

-continued
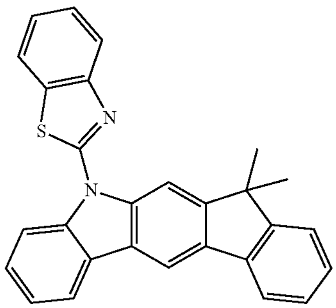
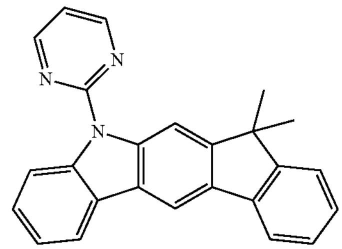
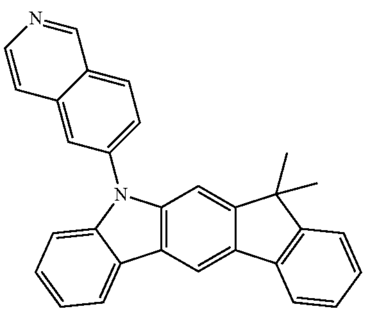
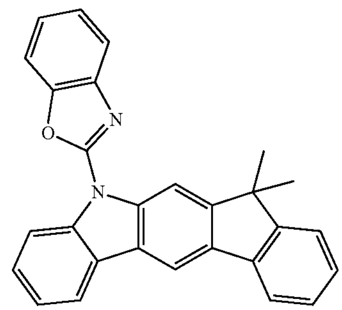
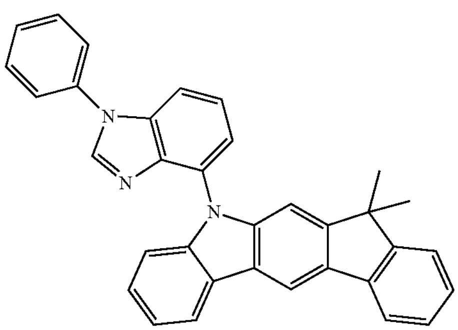
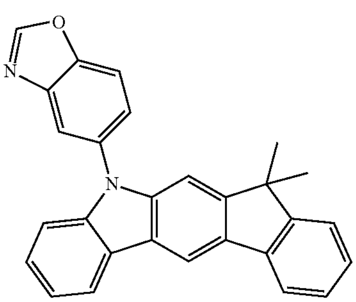
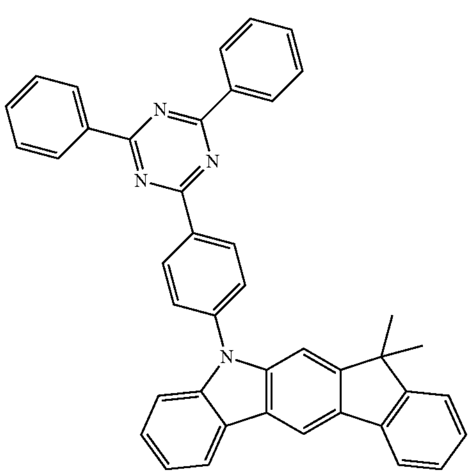
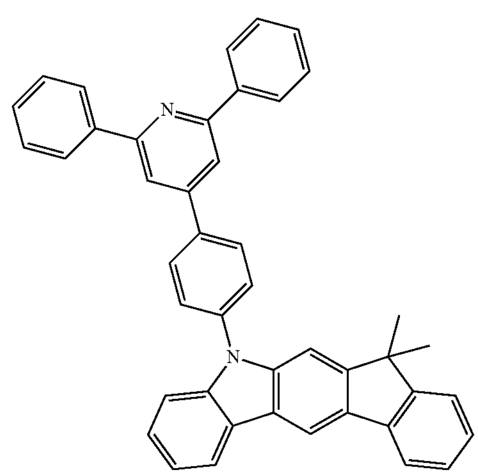

-continued
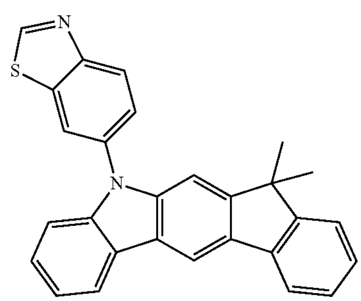
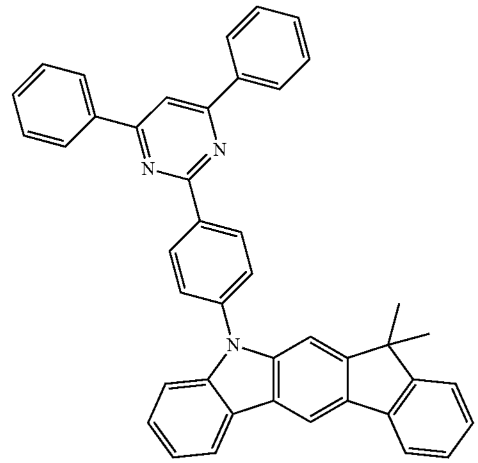
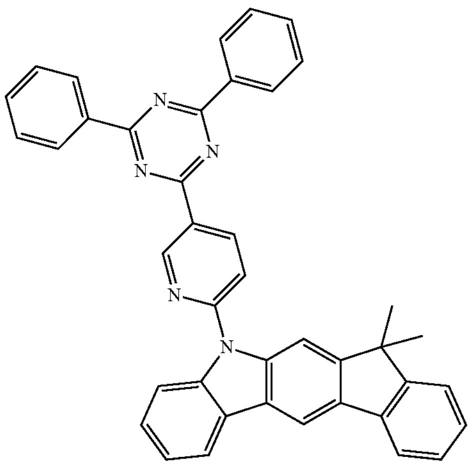
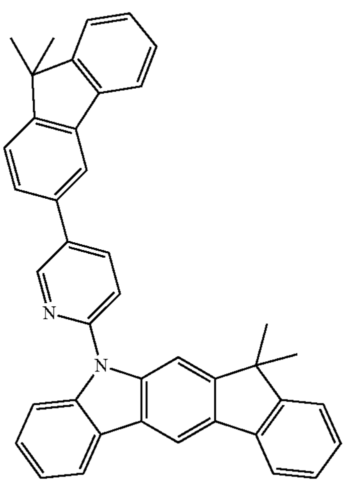
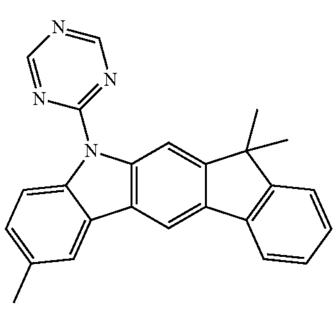
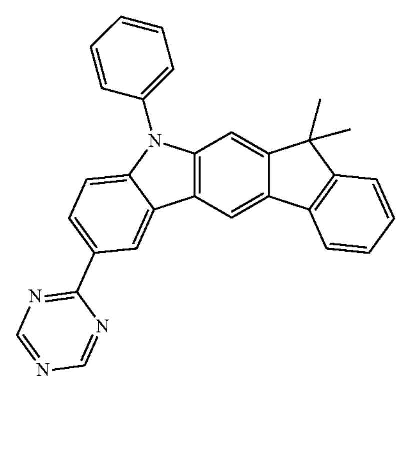

-continued
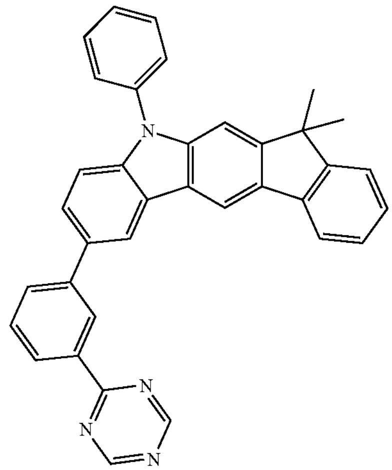
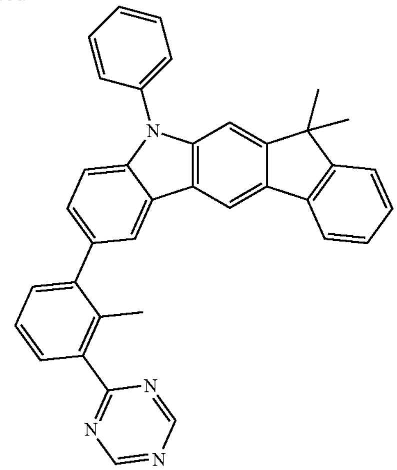
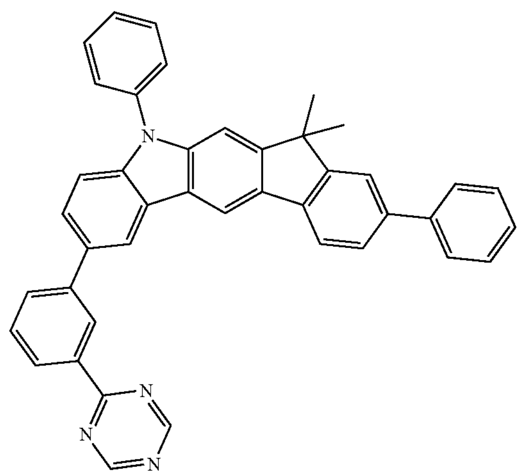
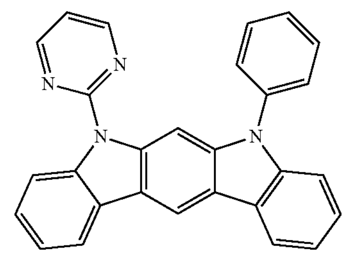
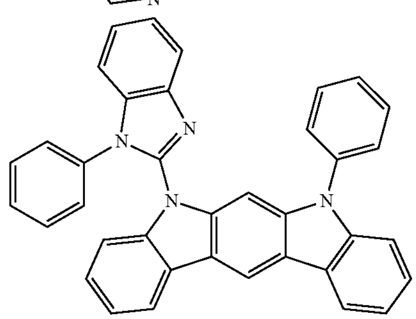
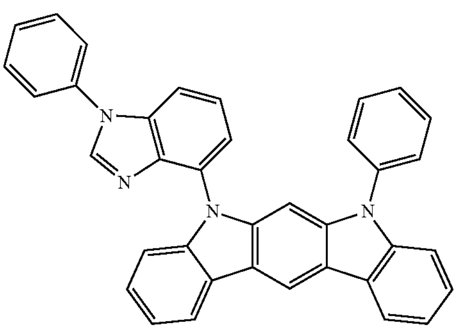
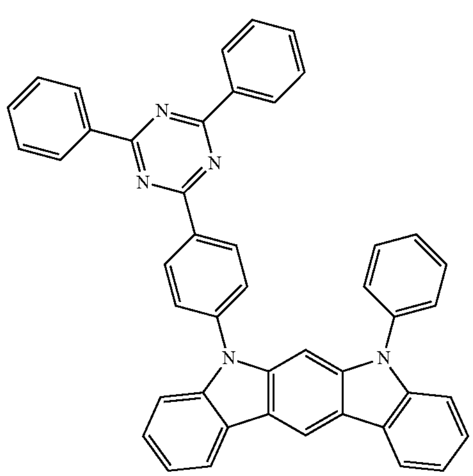
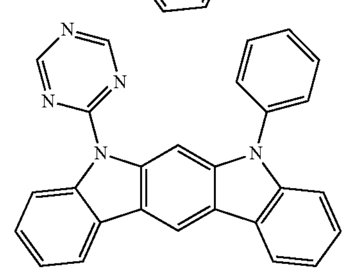

-continued
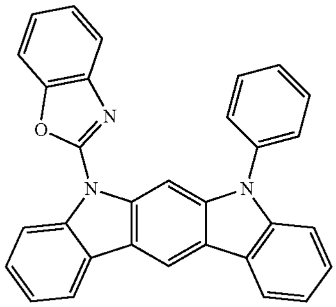
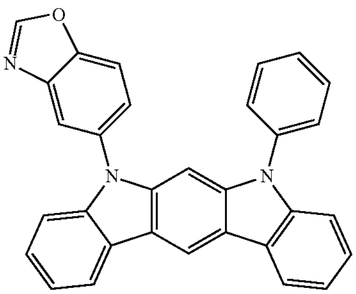
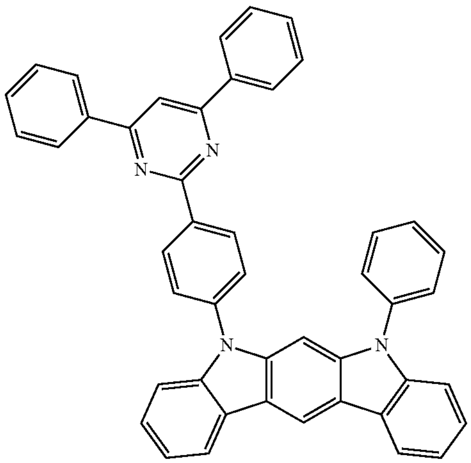
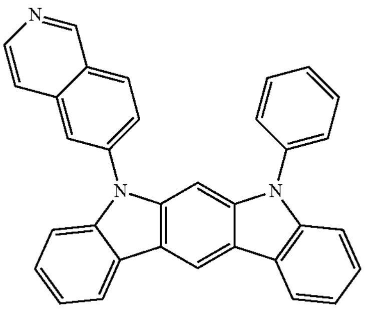
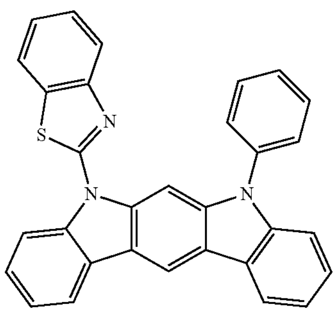
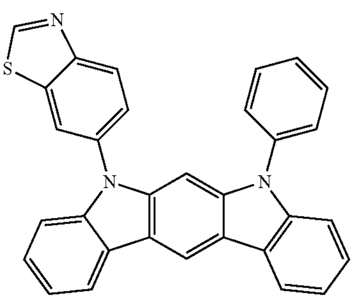
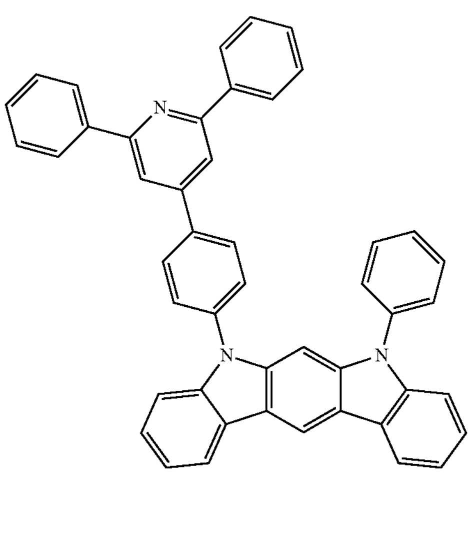
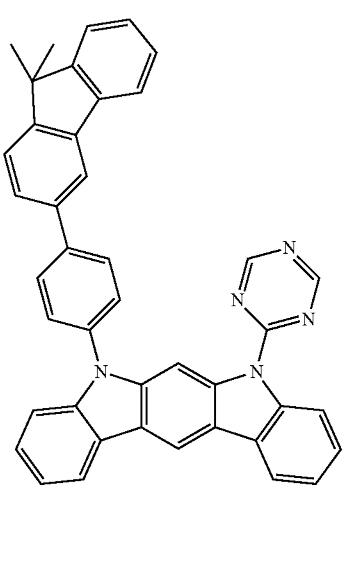

-continued
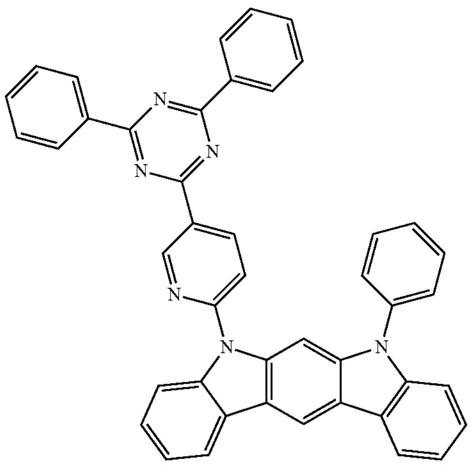
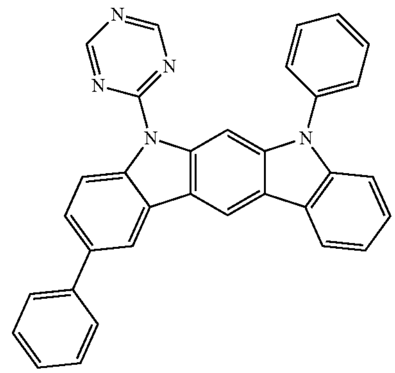
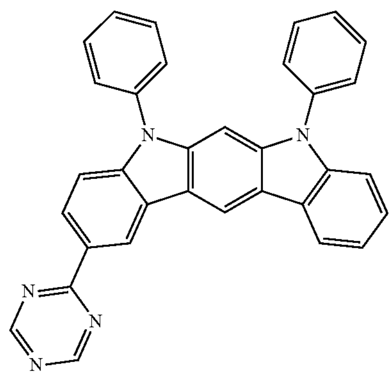
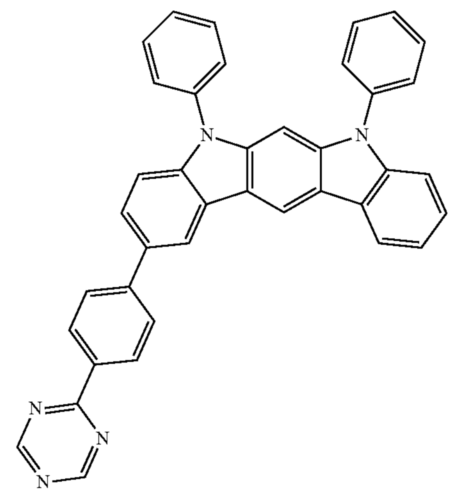
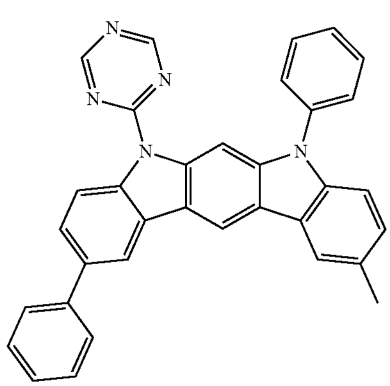
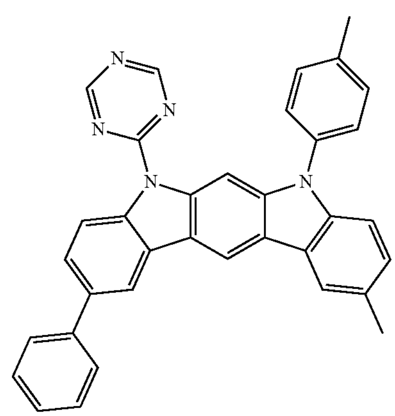

-continued
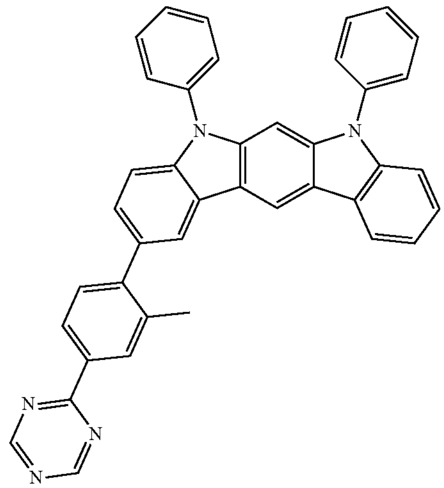
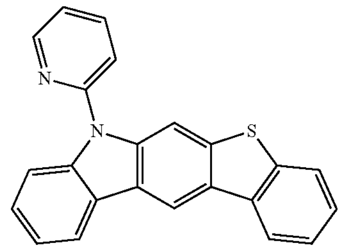
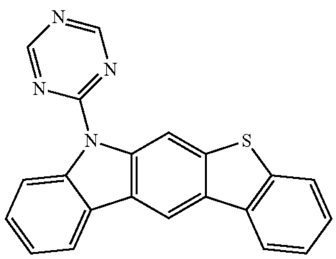
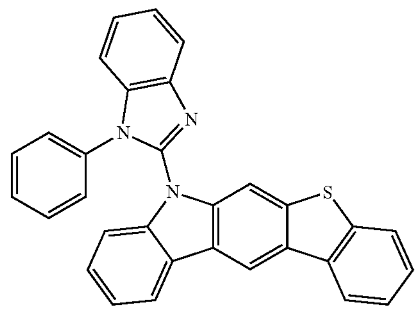
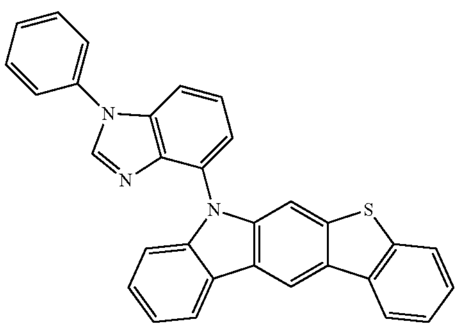
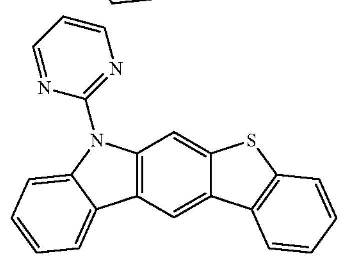
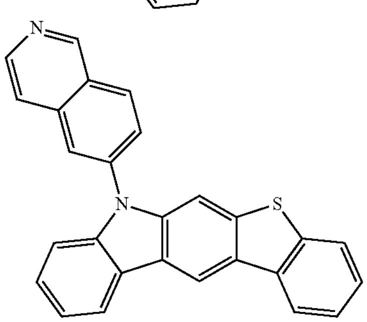
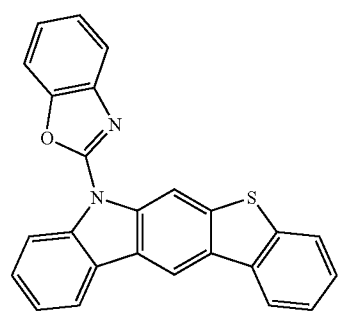
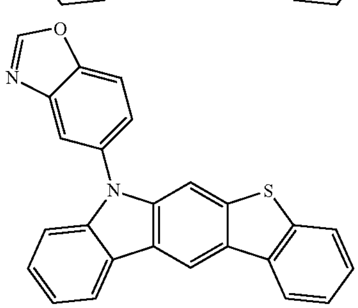
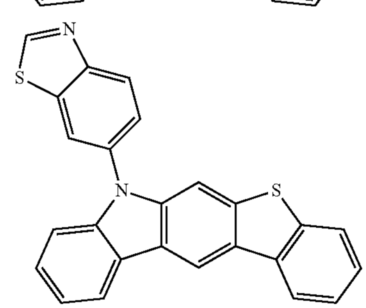

-continued
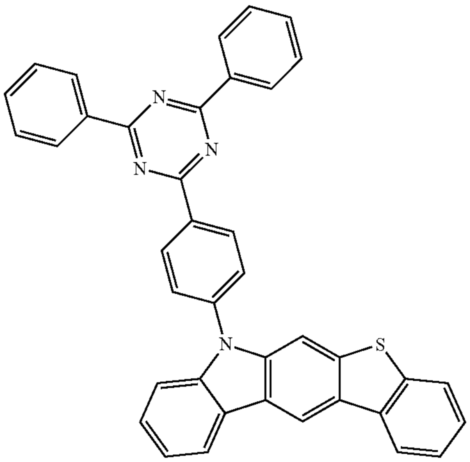
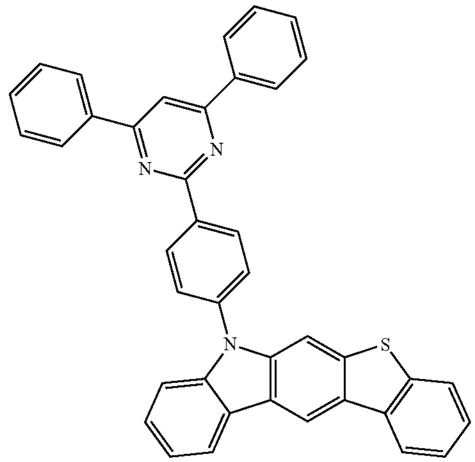
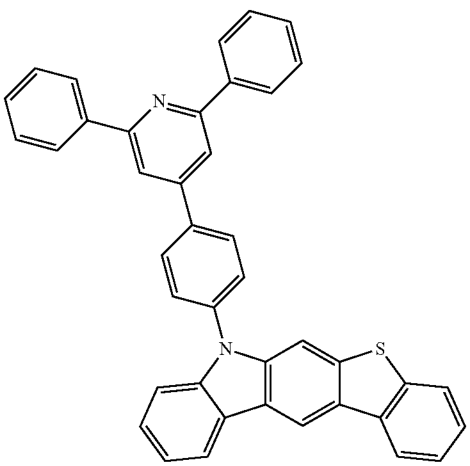
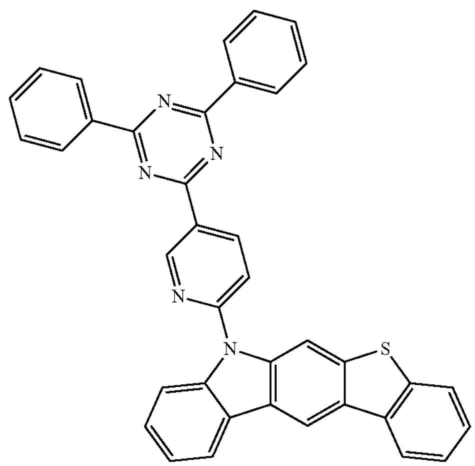
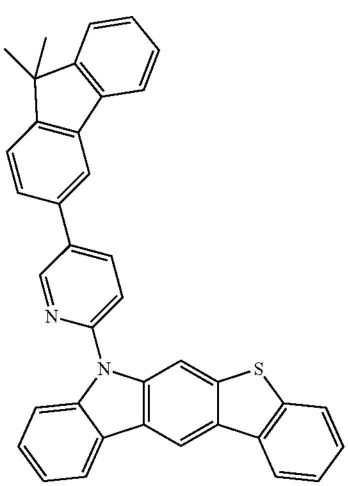
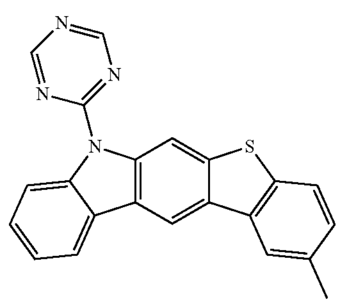

-continued
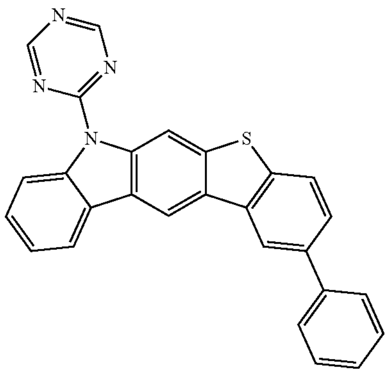
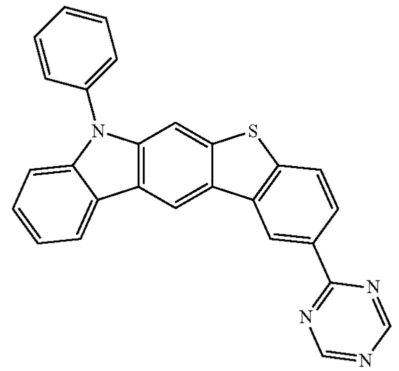
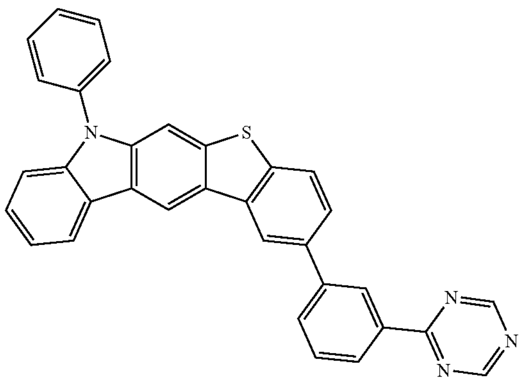
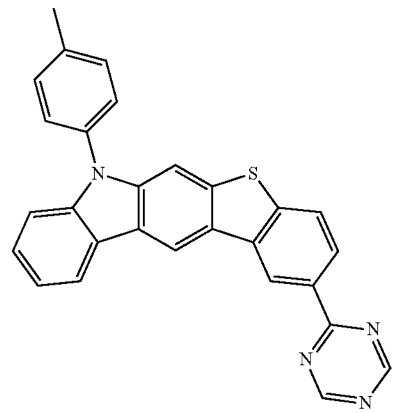
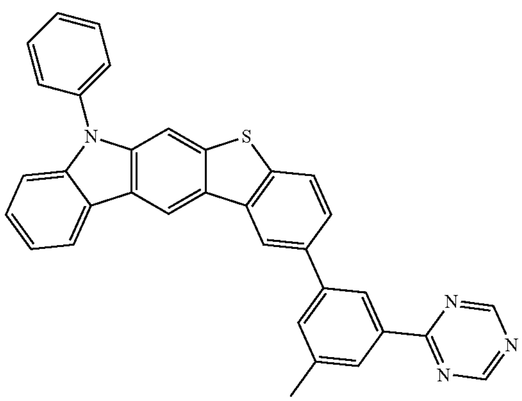
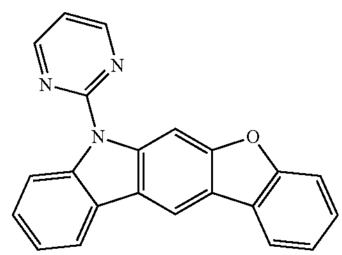
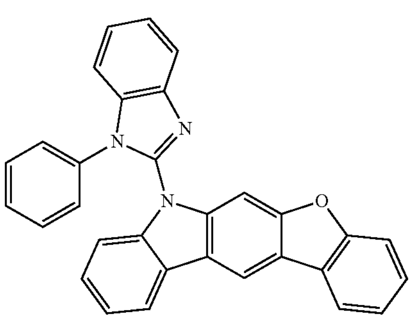
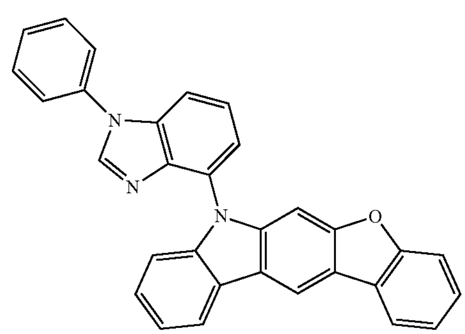

-continued
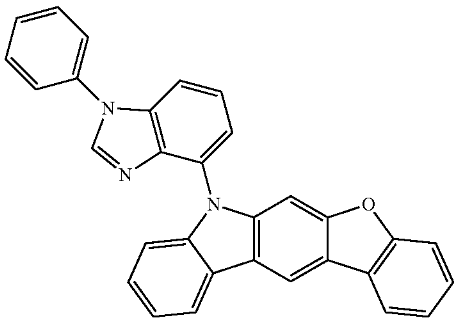
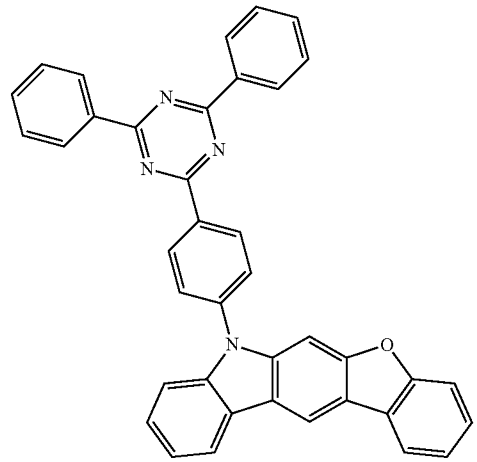
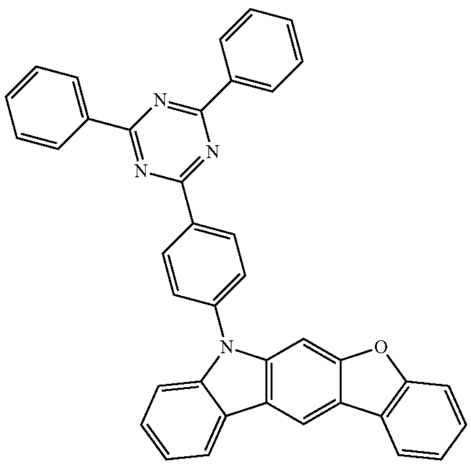
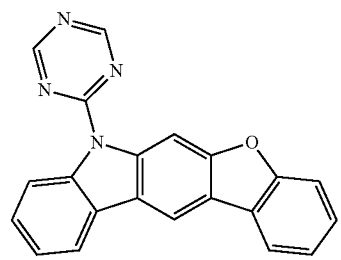
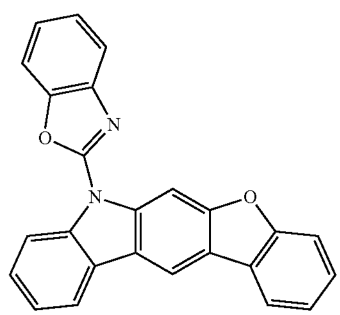
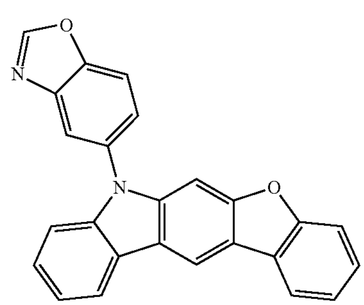
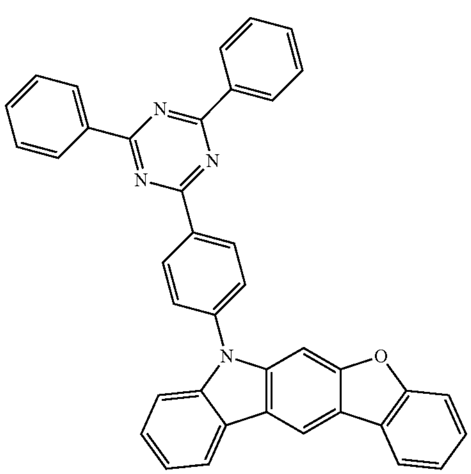
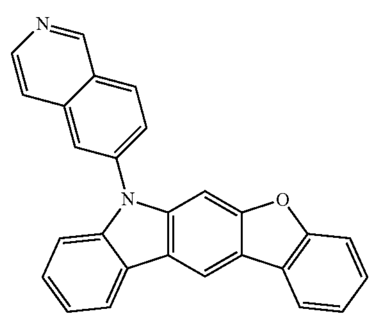

-continued
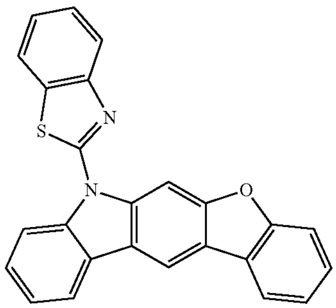
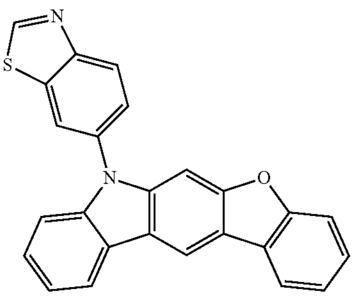
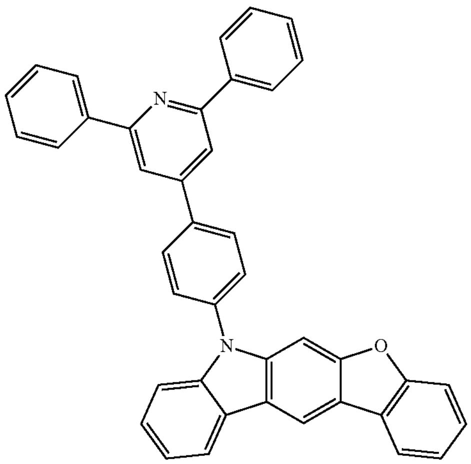
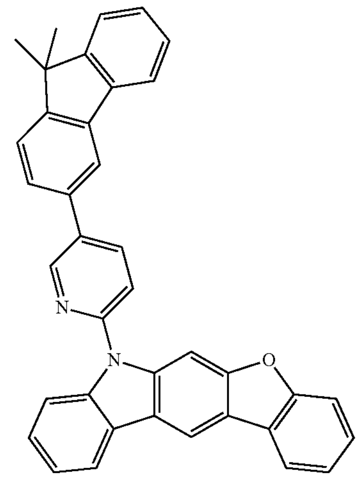
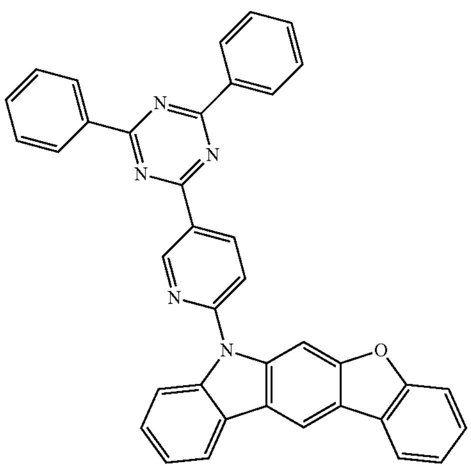
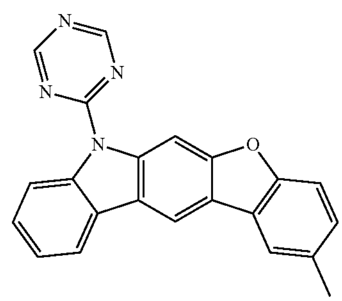
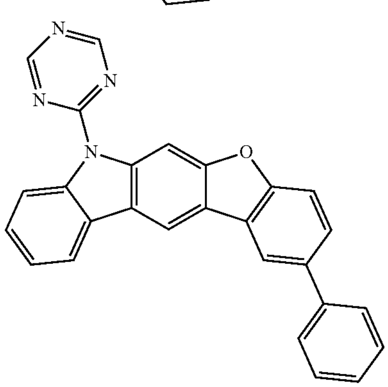
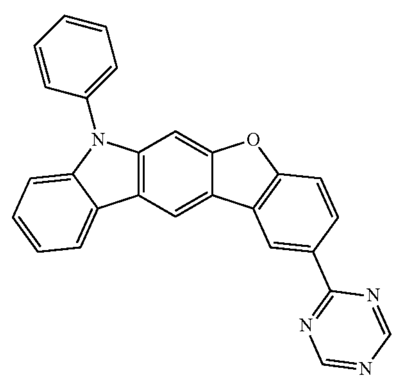

-continued
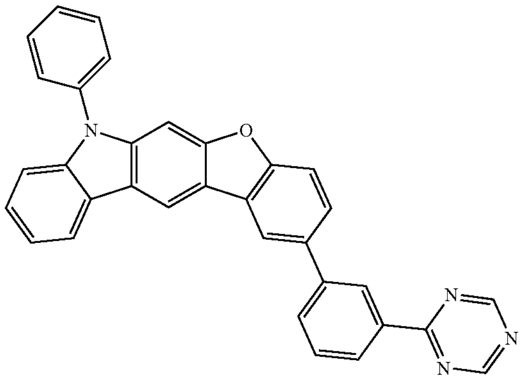
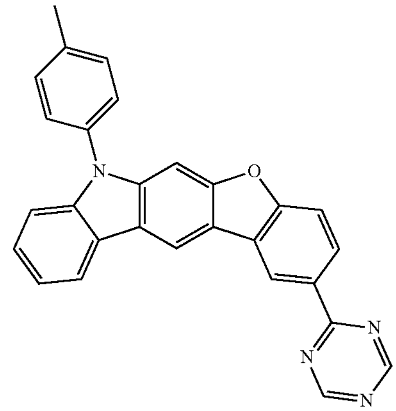
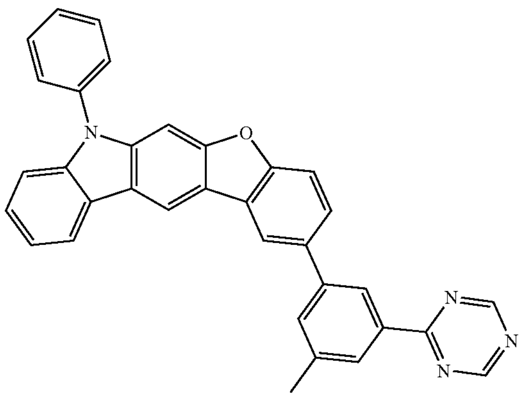
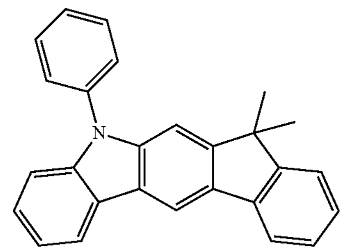
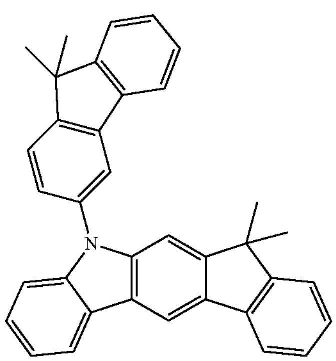
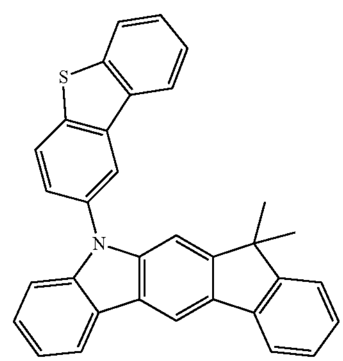
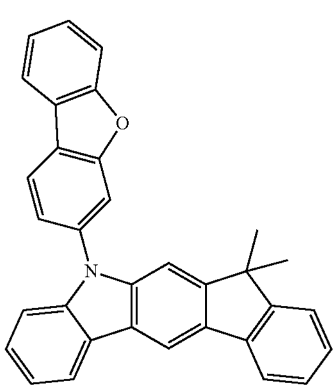
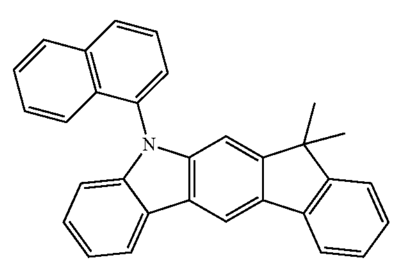

-continued
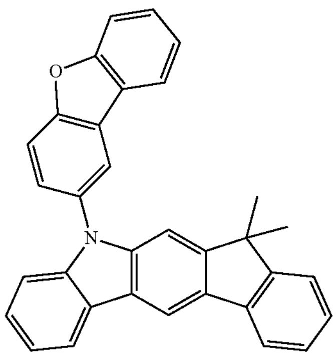
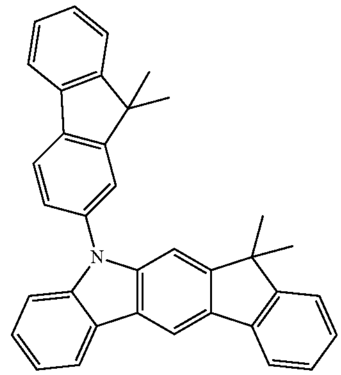
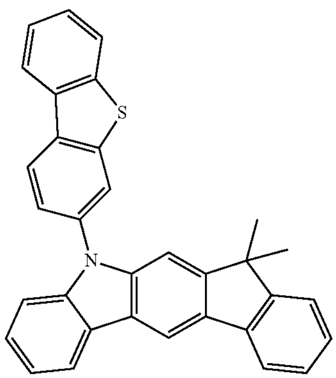
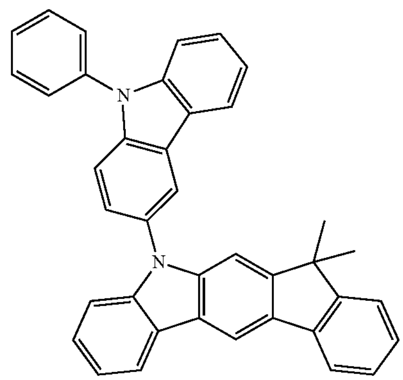
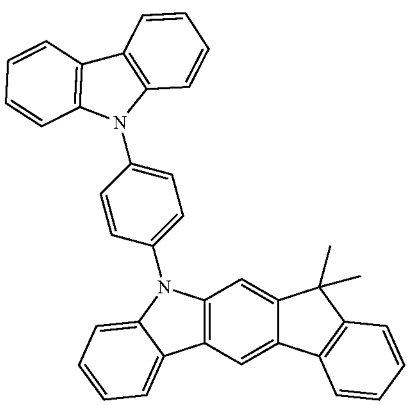
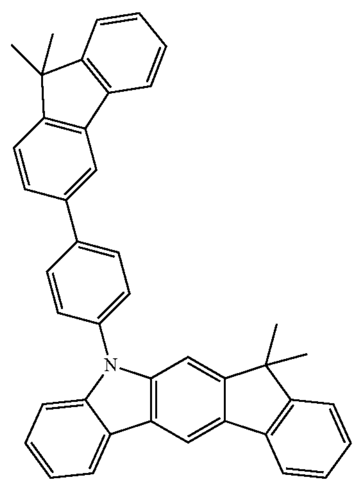
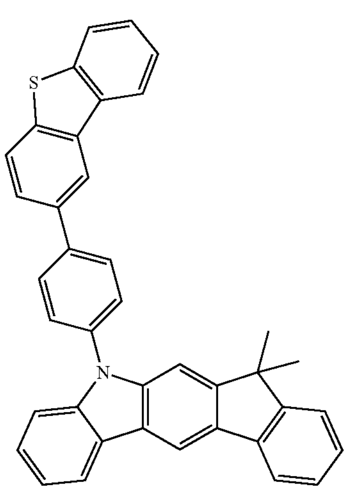
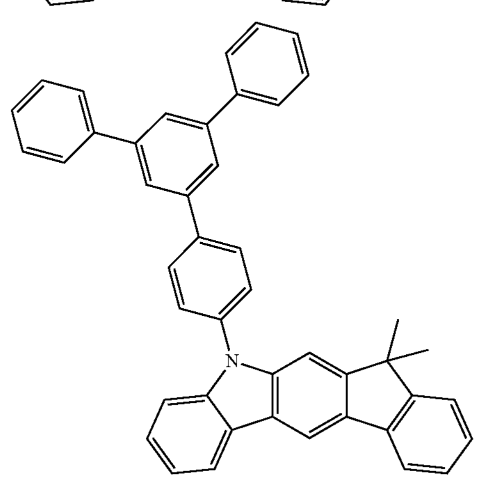

-continued
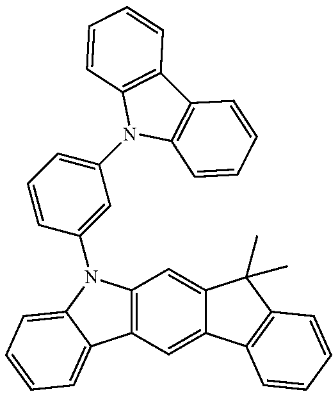
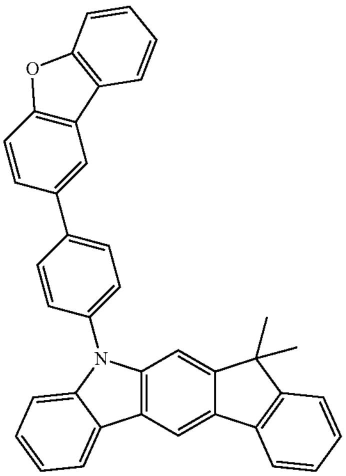
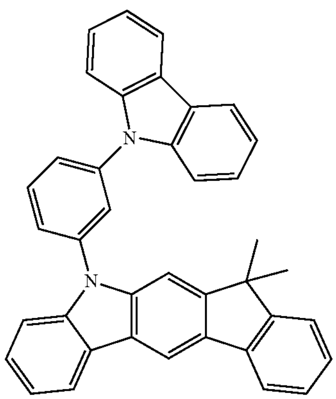
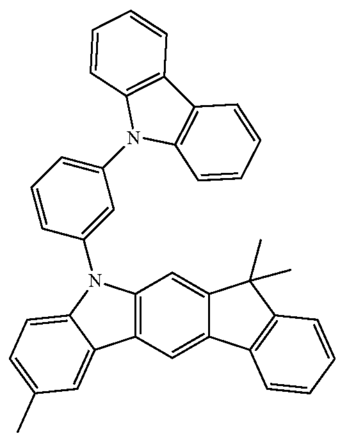
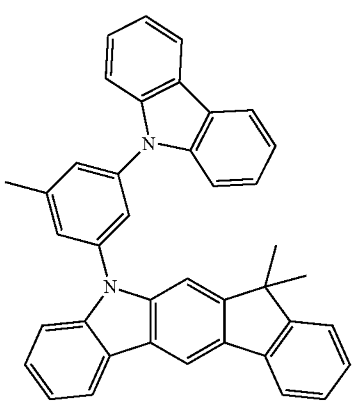
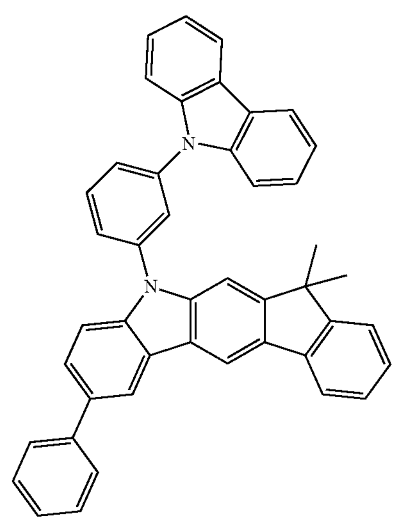

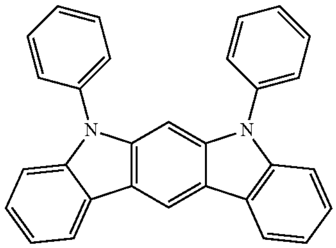
N
N
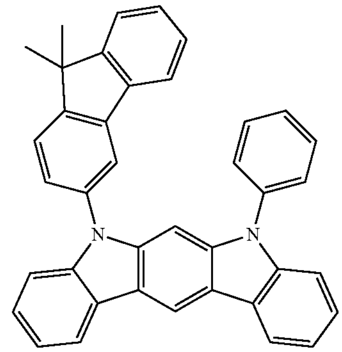
N
N
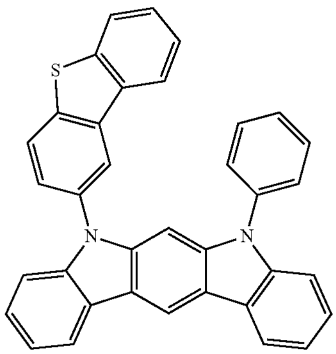
S
N
N
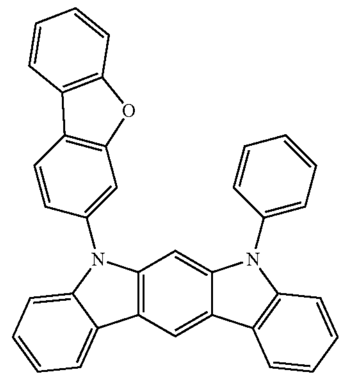
O
N
N
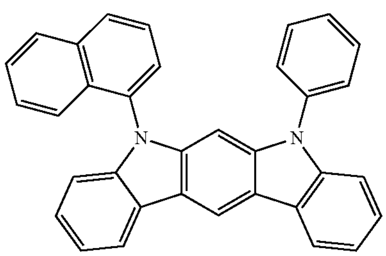
N
N
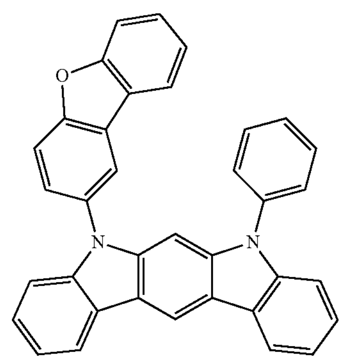
O
N
N
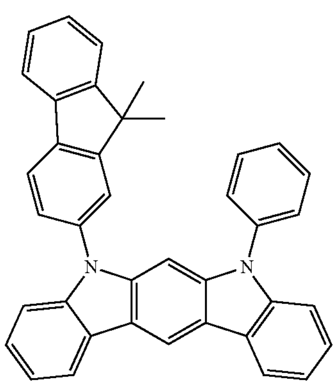
N
N
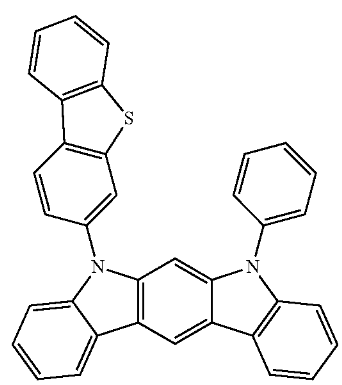
S
N
N -continued
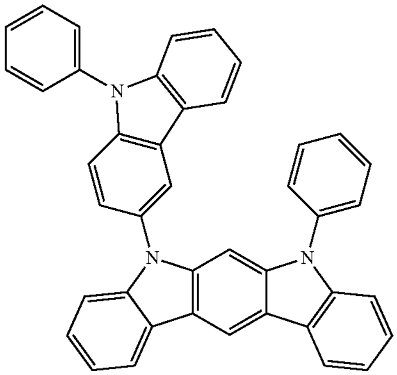
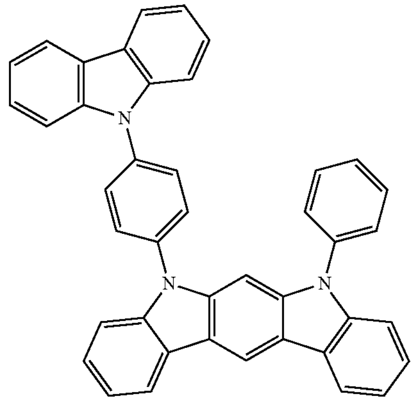
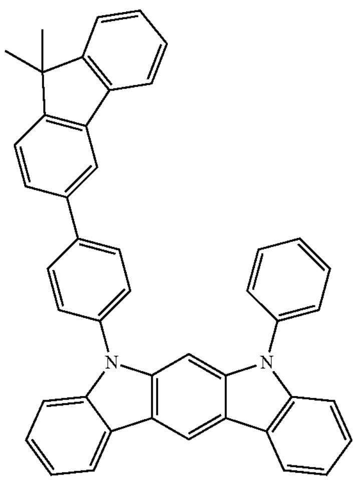
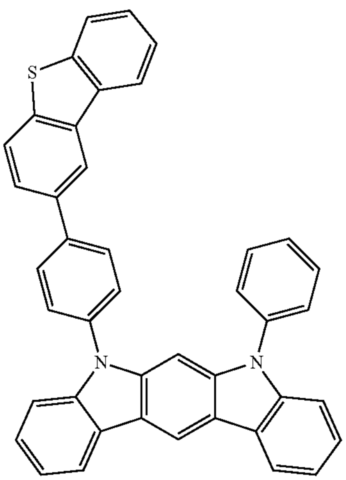
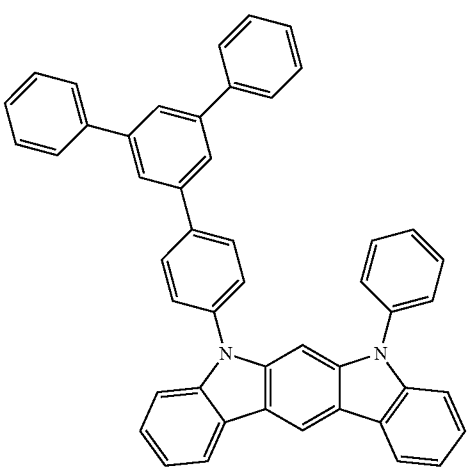
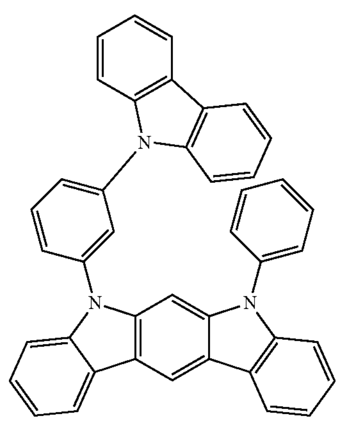

-continued
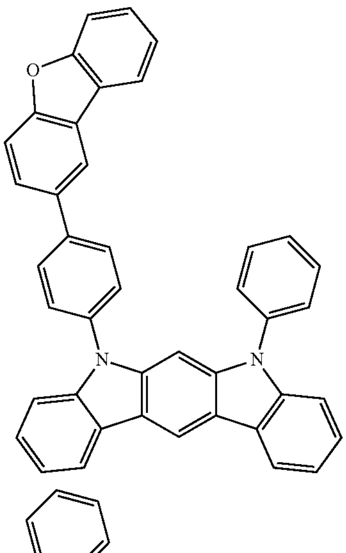
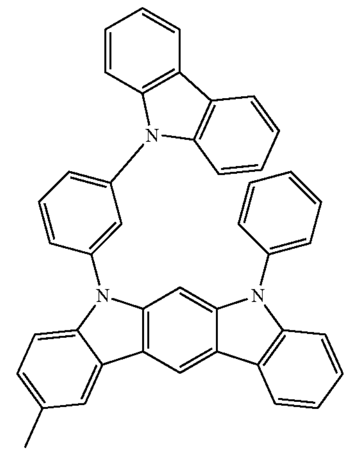
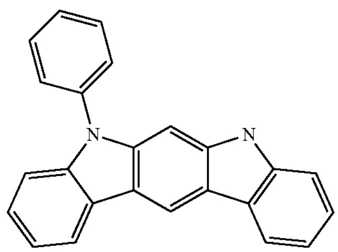
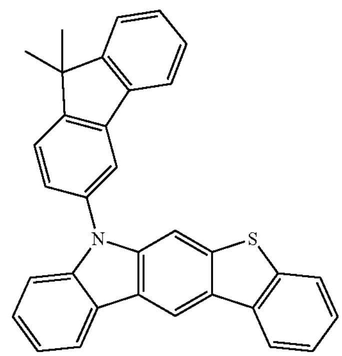
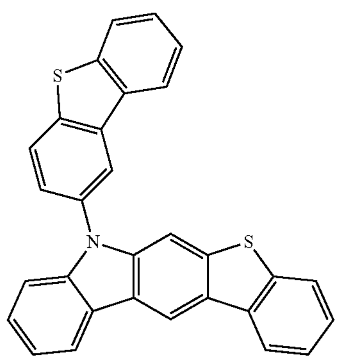
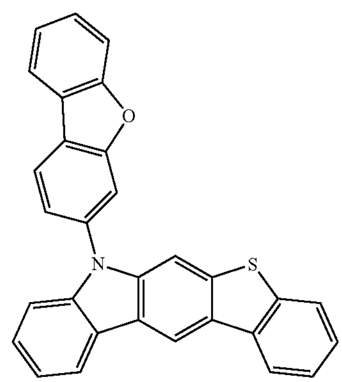
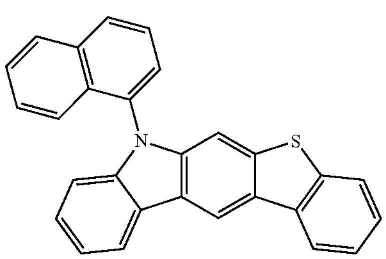
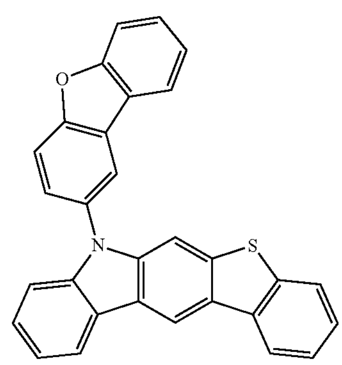

-continued
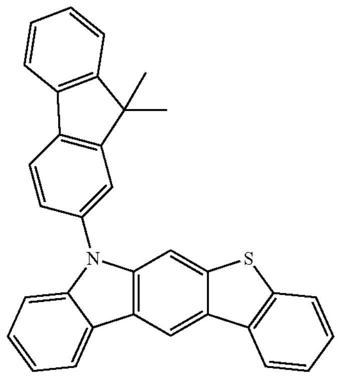
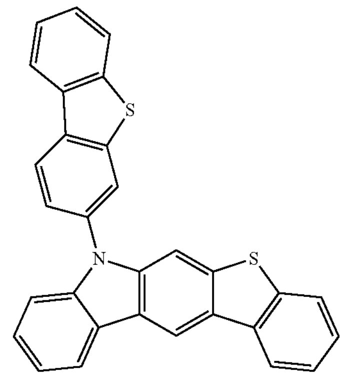
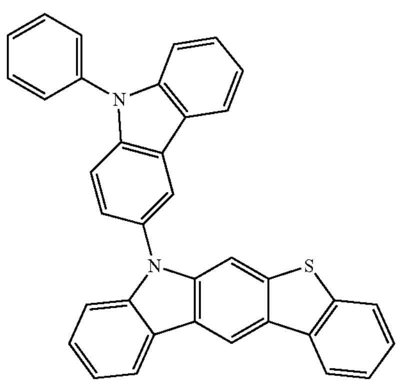
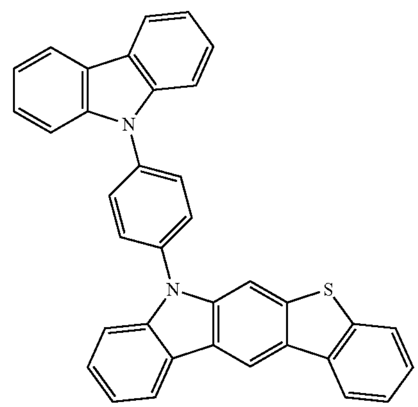
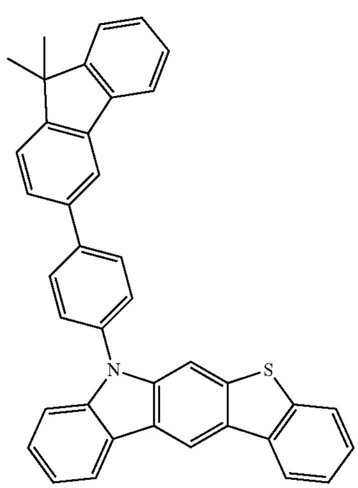
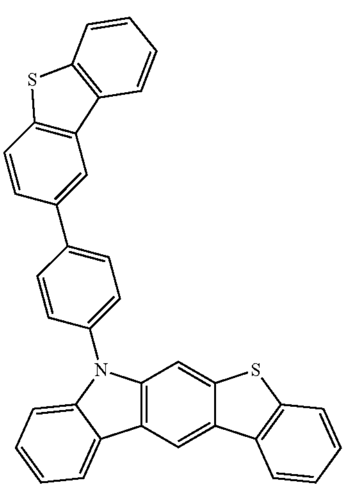

-continued
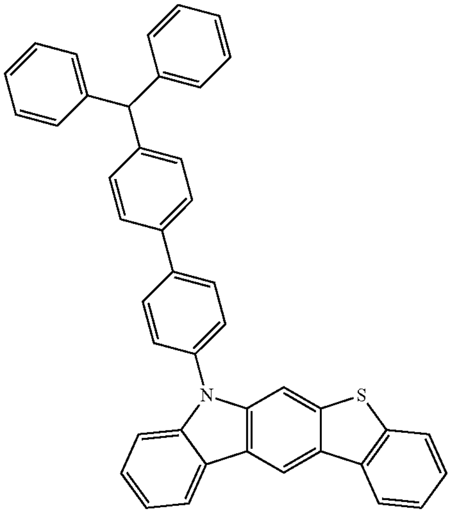
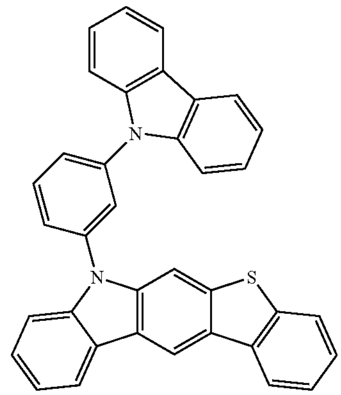
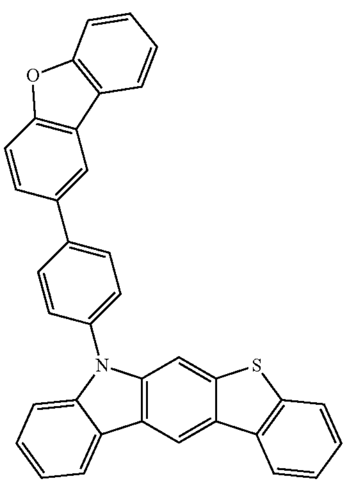
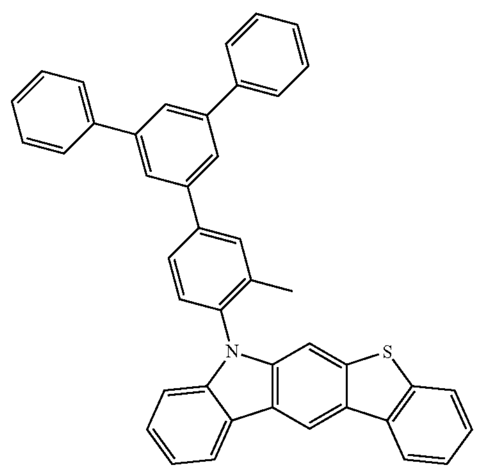
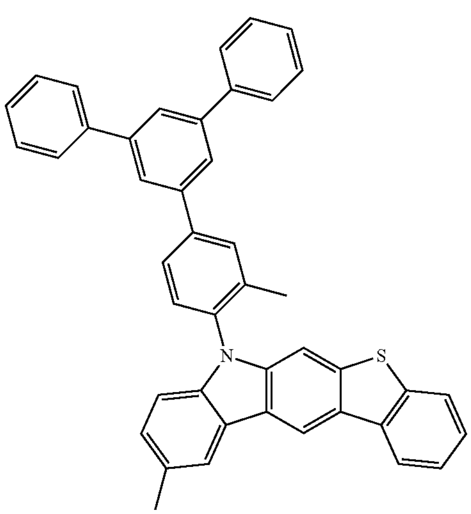
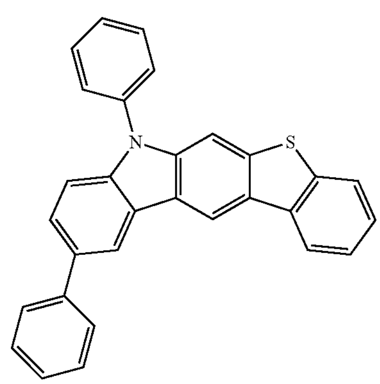

-continued
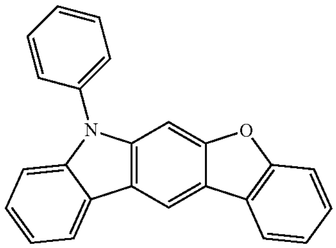
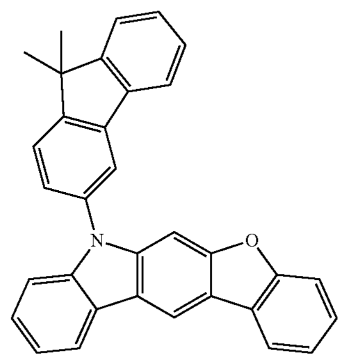
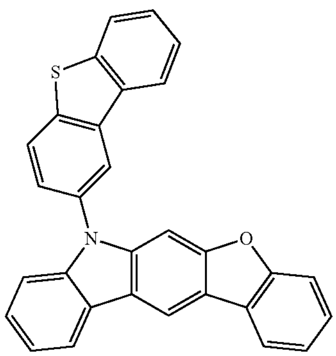
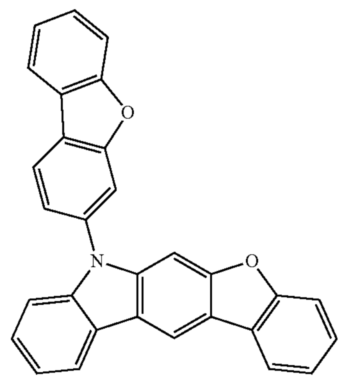
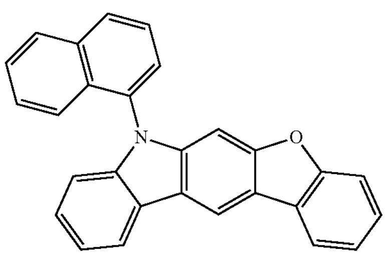
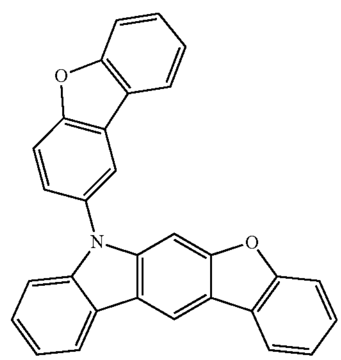
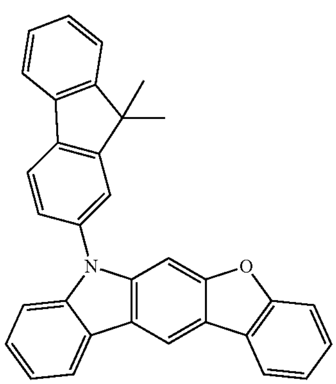
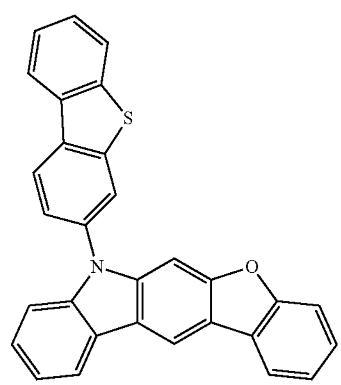

-continued
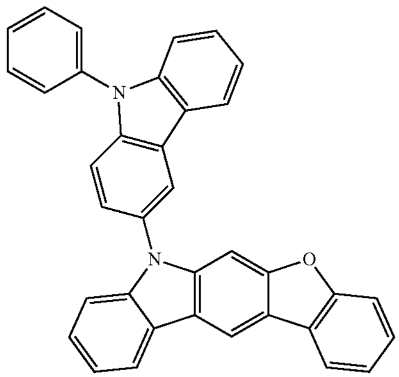
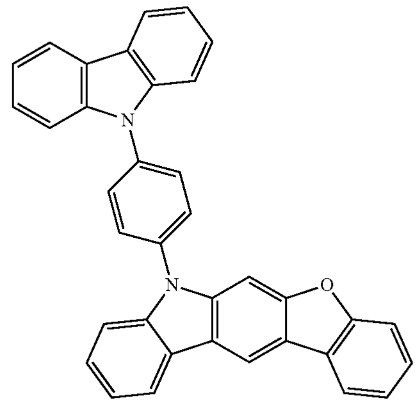
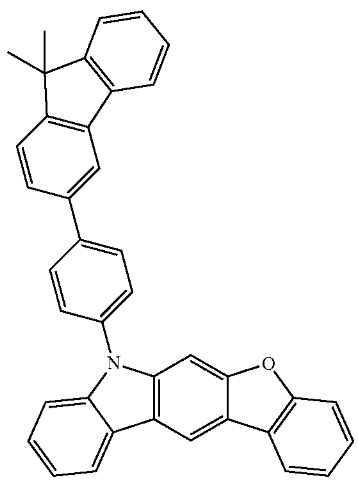
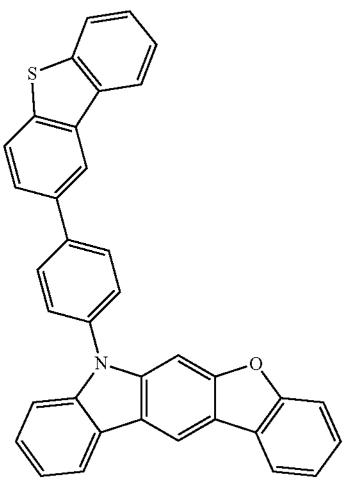
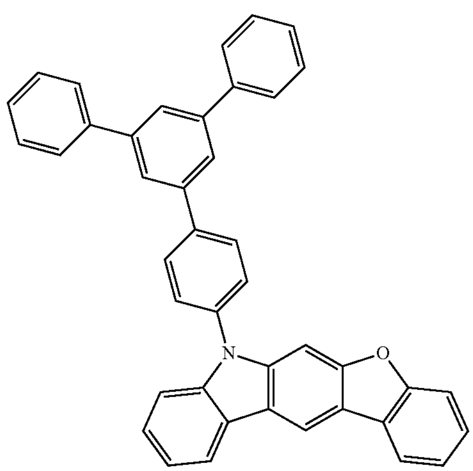
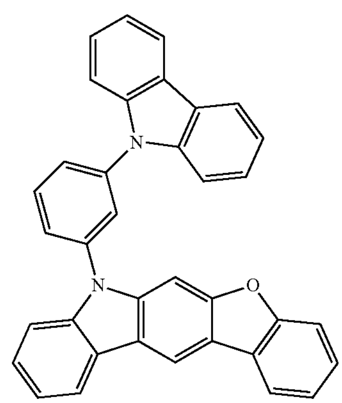

-continued
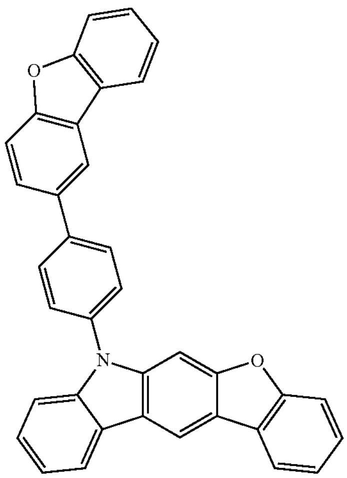
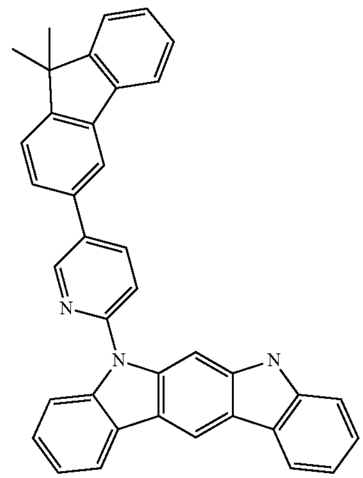
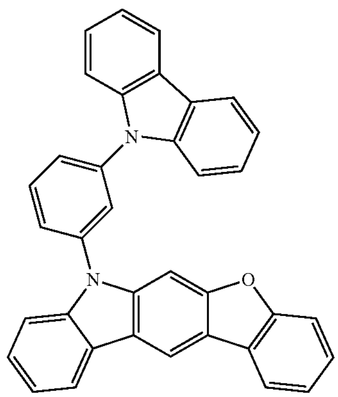
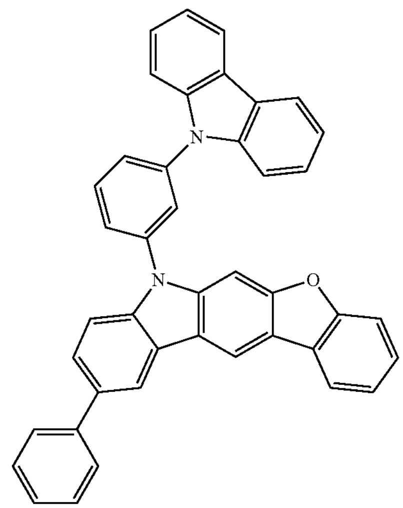
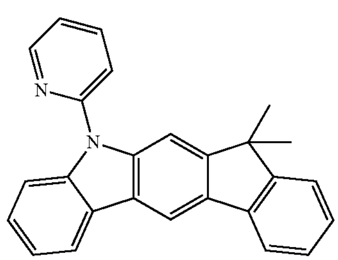
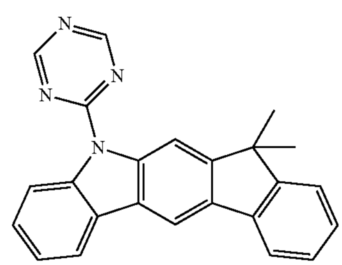
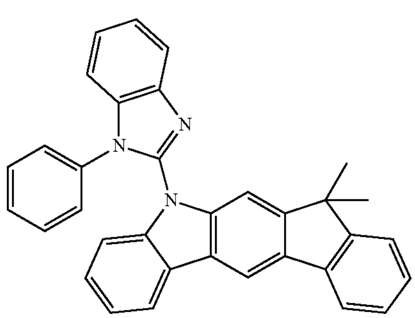
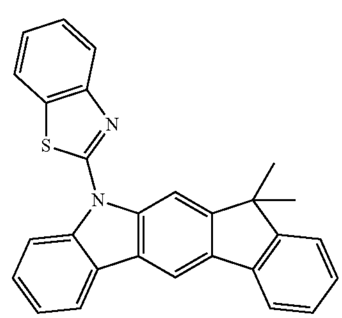

-continued
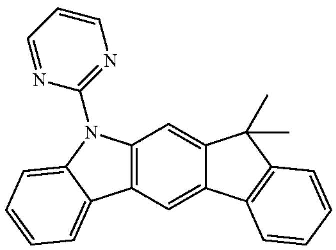
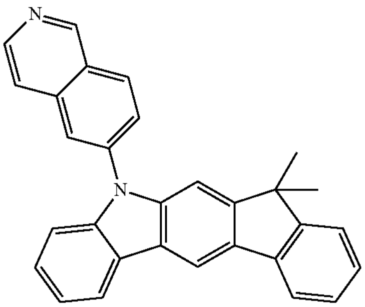
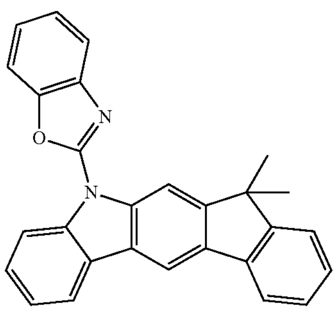
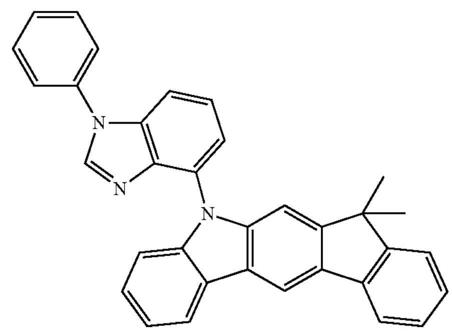
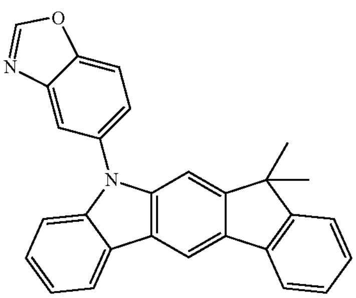
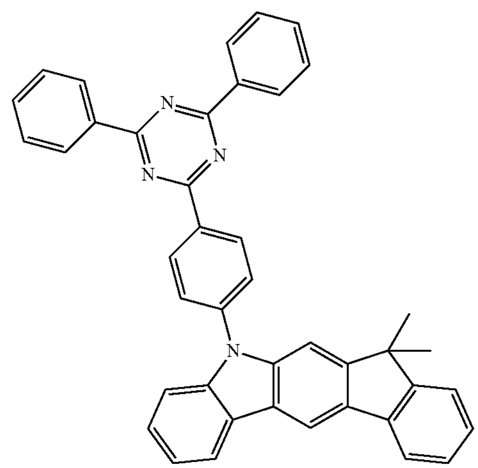
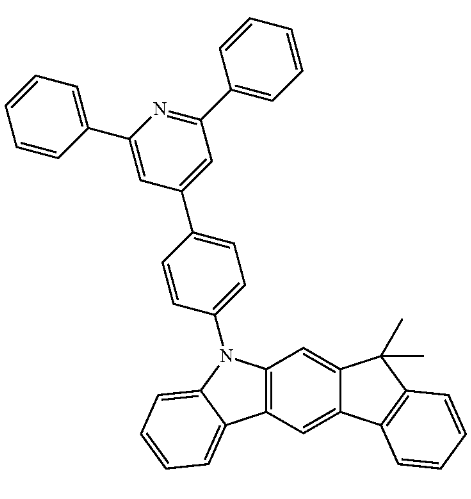
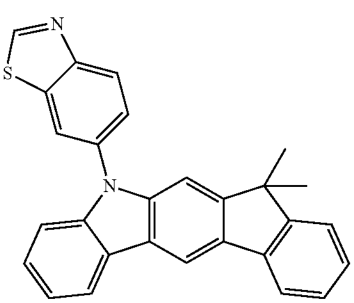

-continued
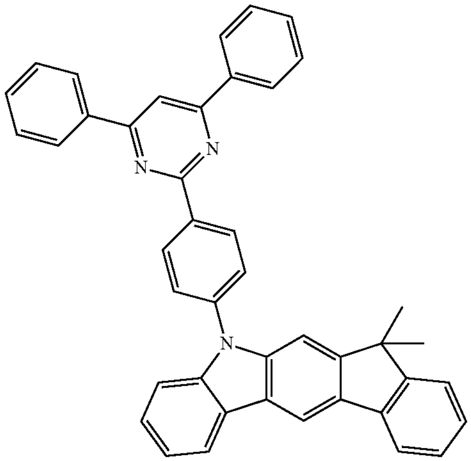
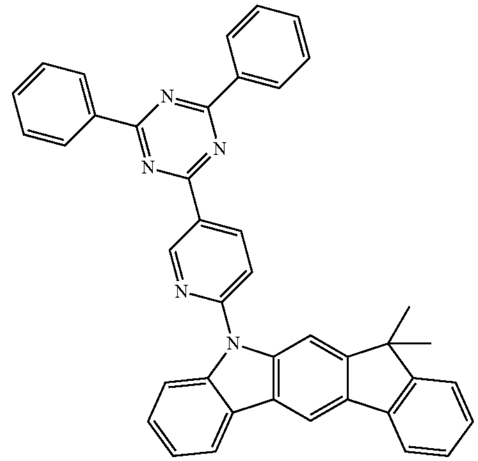
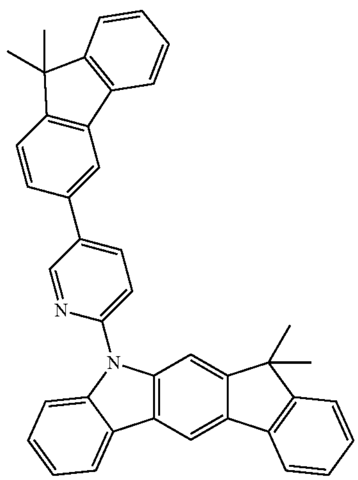
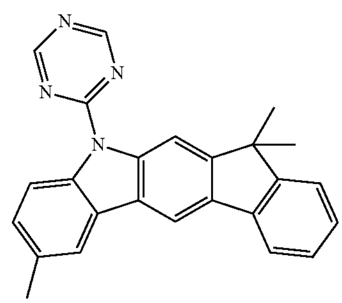
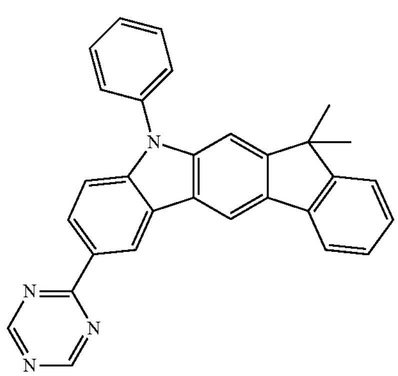
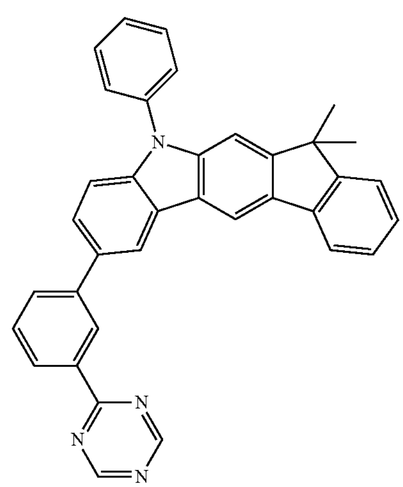

-continued
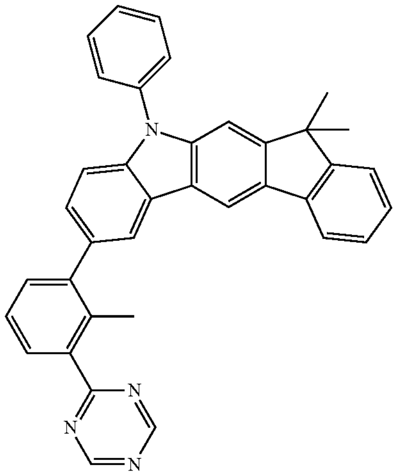
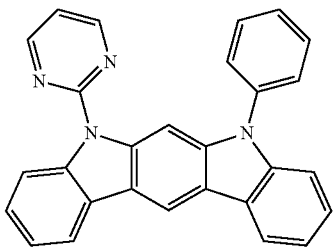
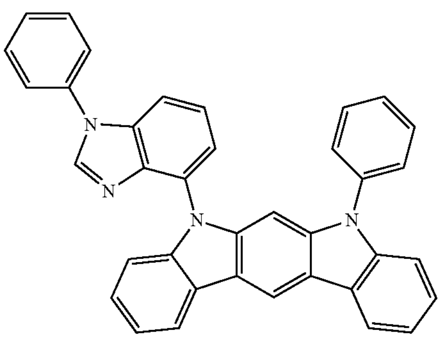
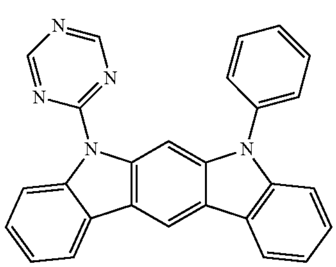
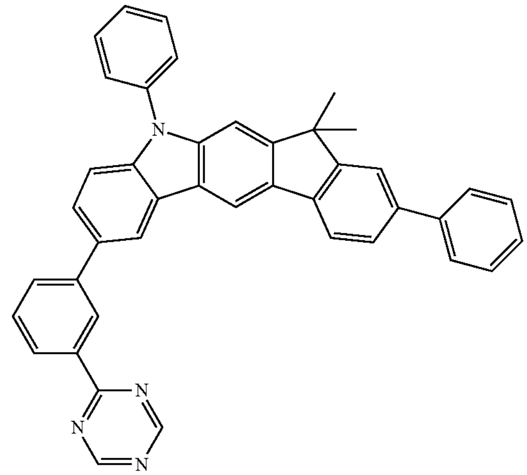
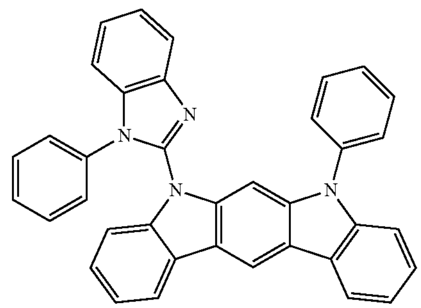
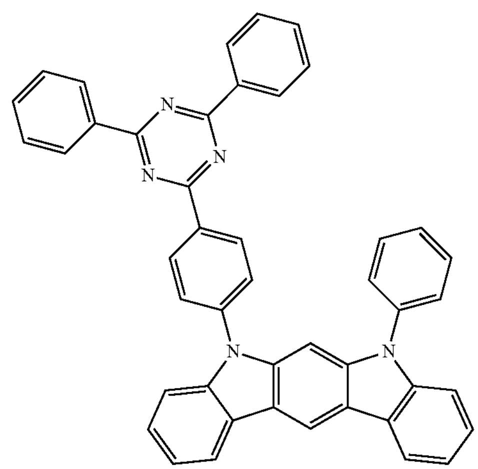
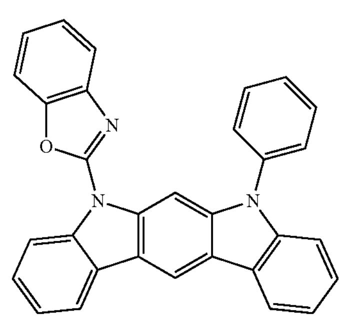

-continued
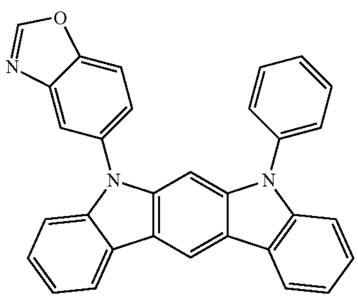
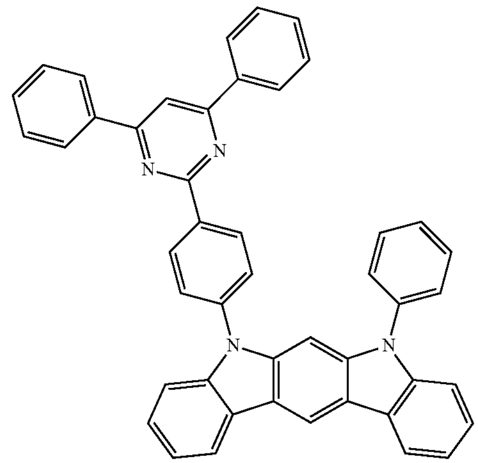
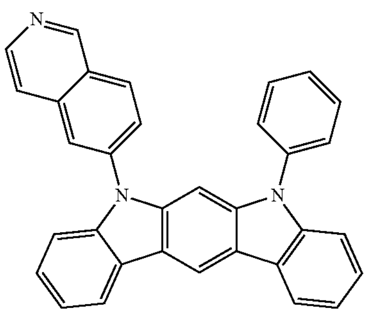
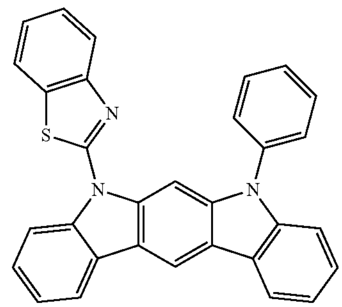
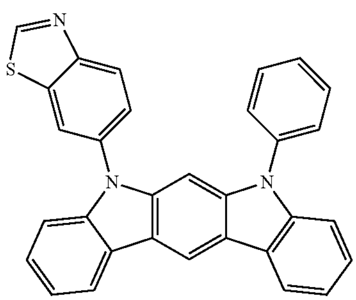
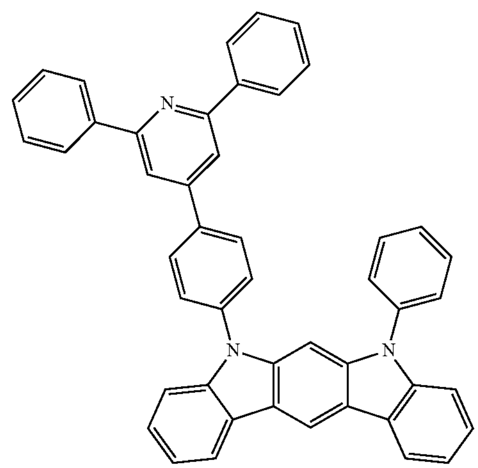
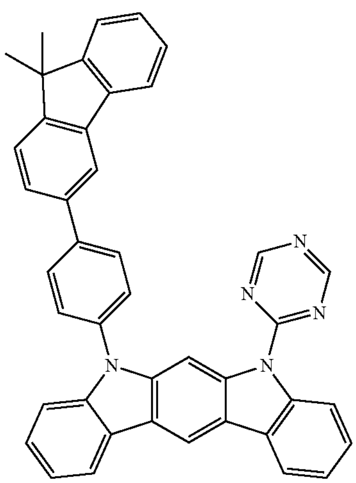
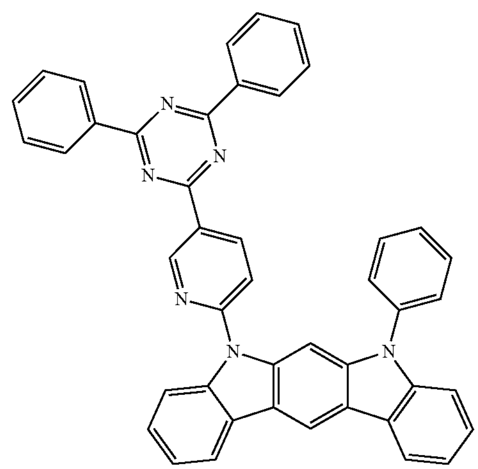

-continued
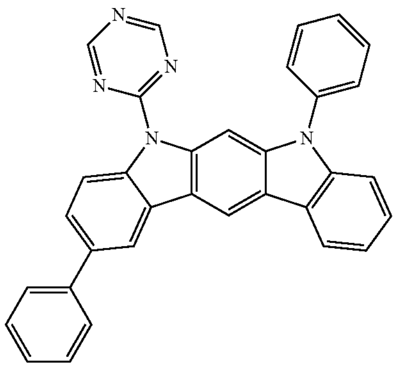
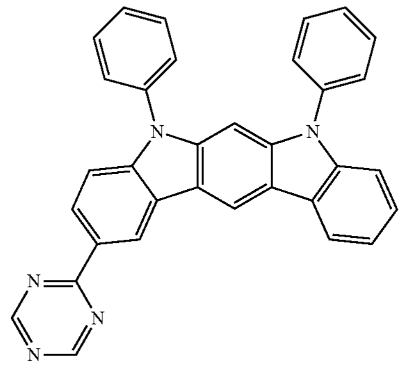
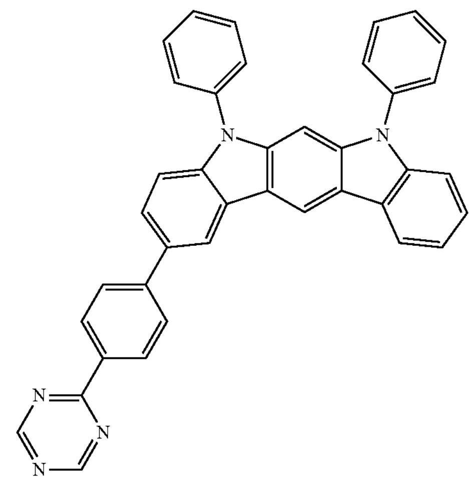
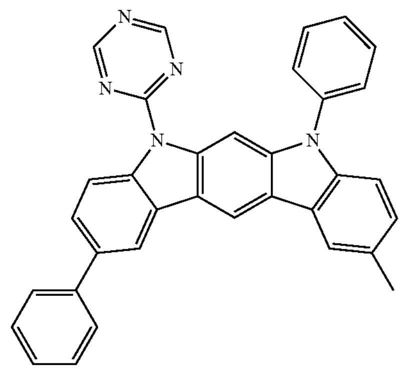
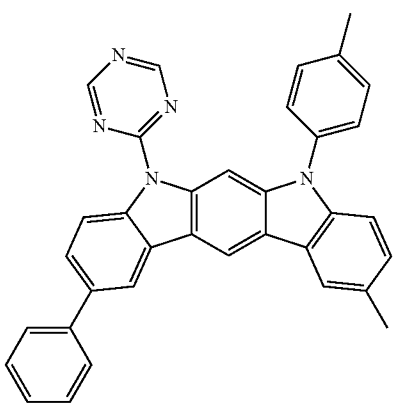
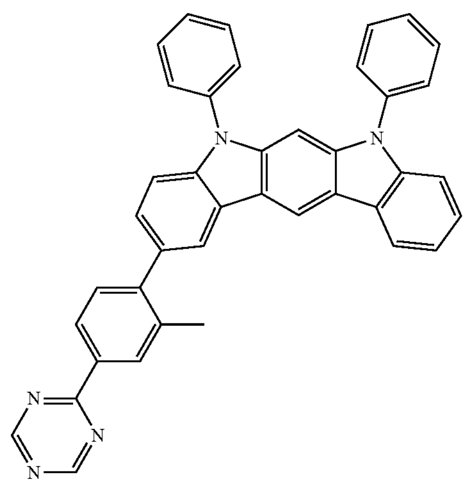
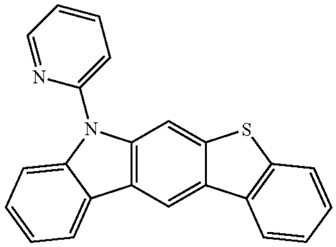
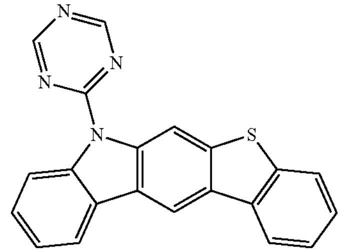

-continued
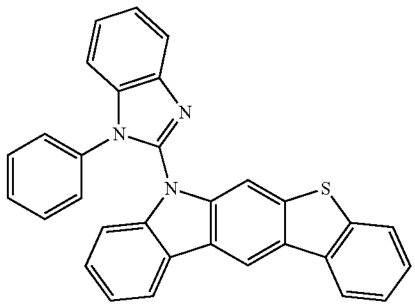
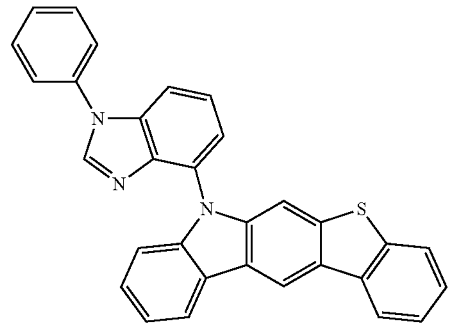
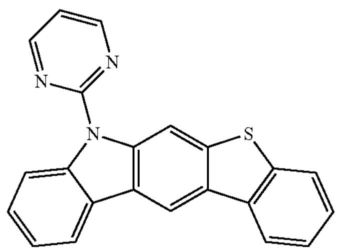
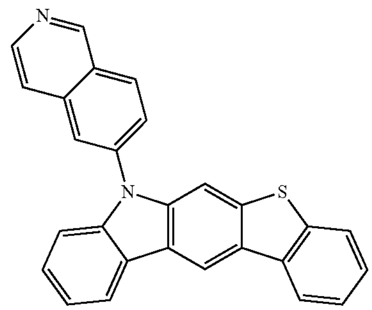
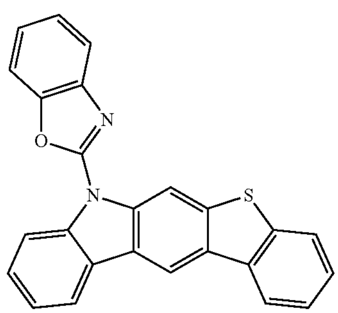
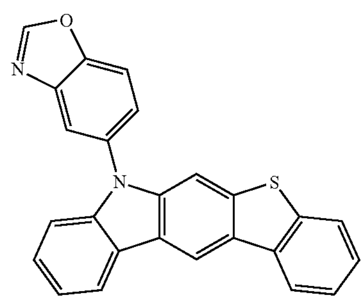
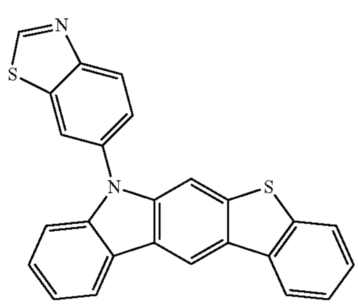
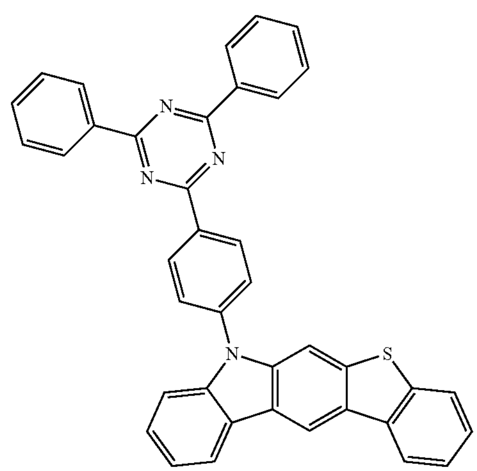

-continued
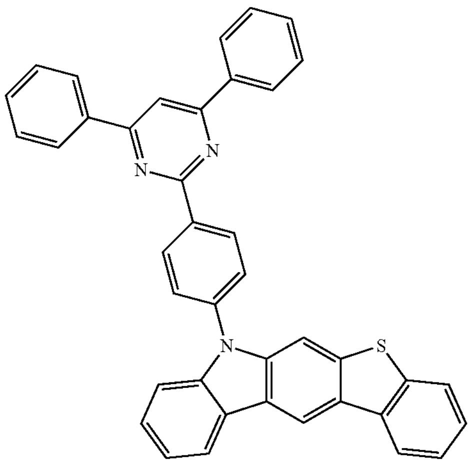
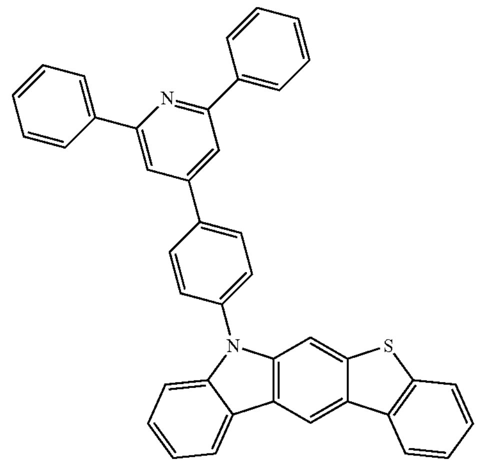
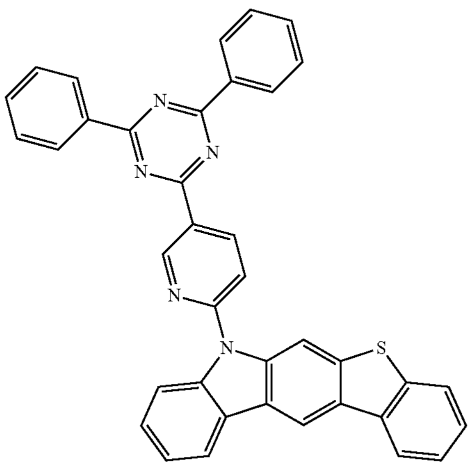
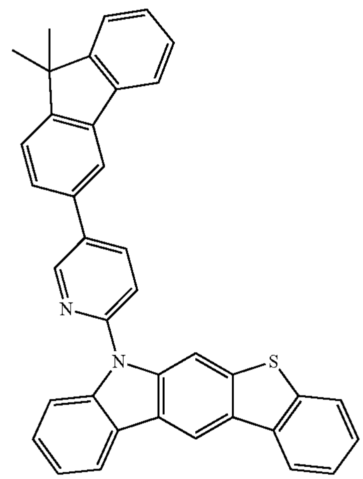
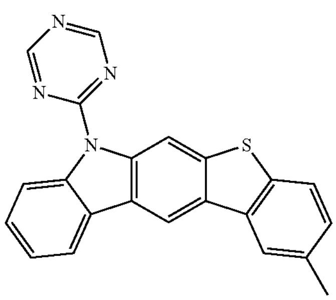
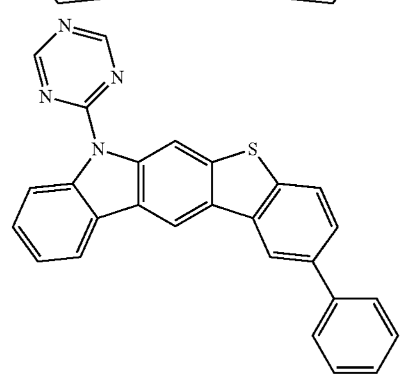
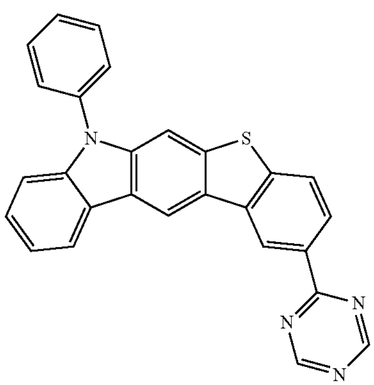
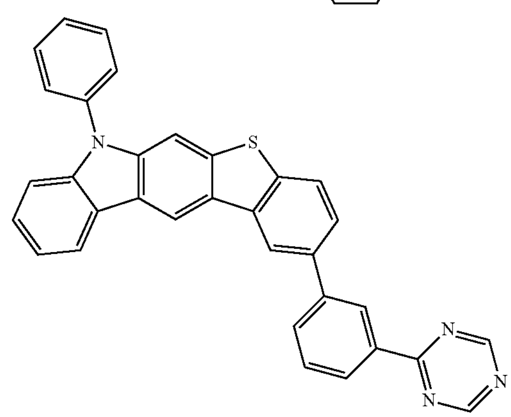

-continued
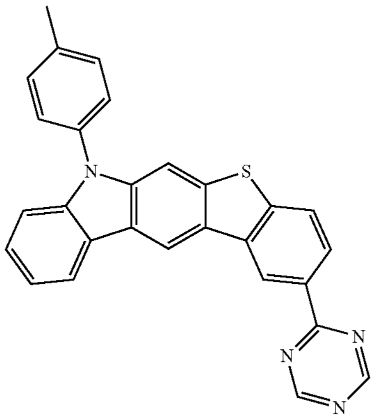
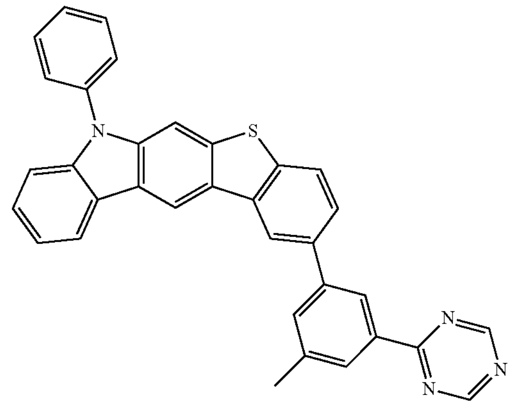
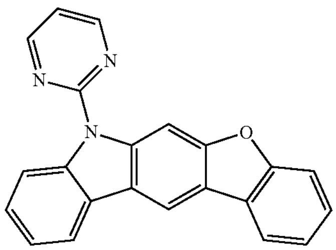
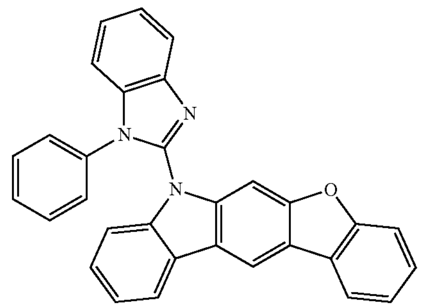
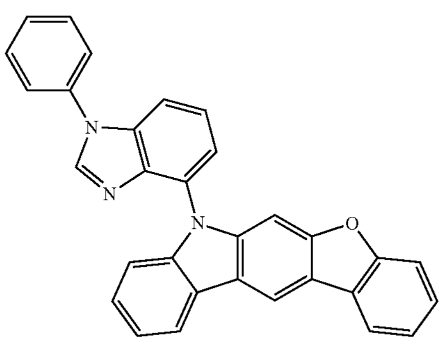
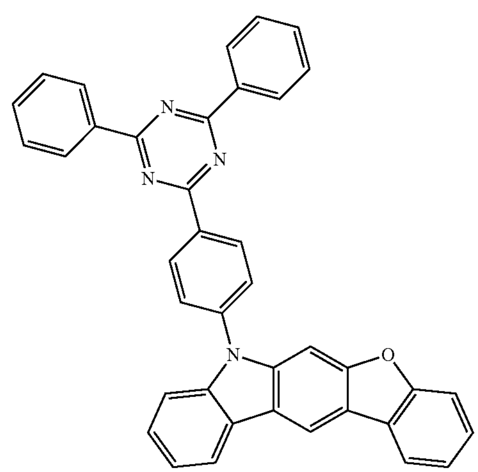
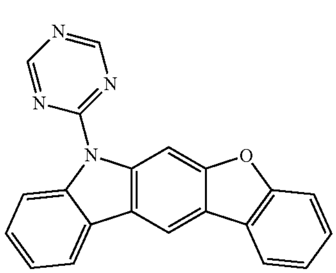
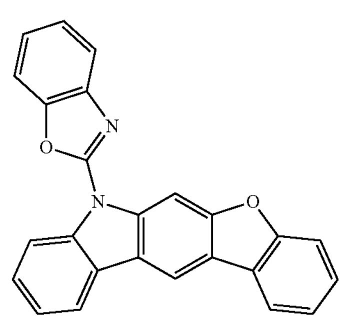

-continued
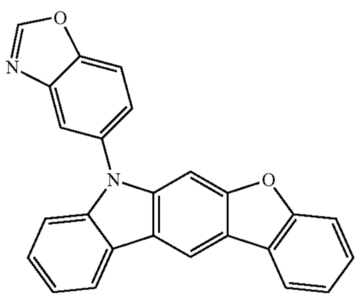
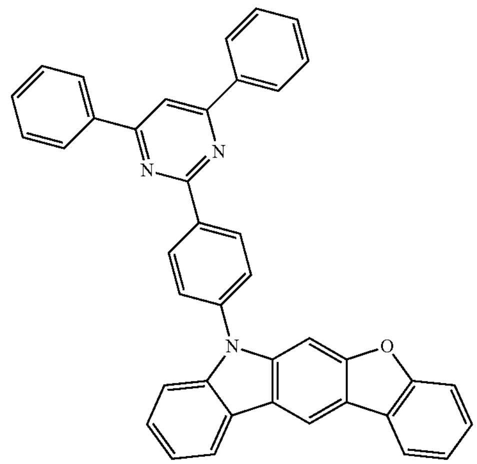
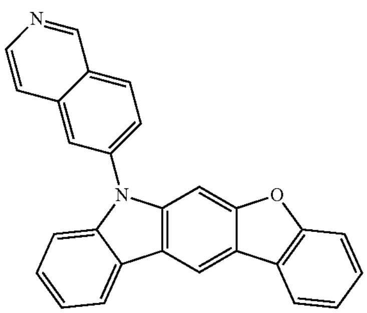
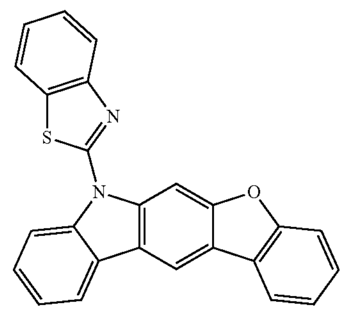
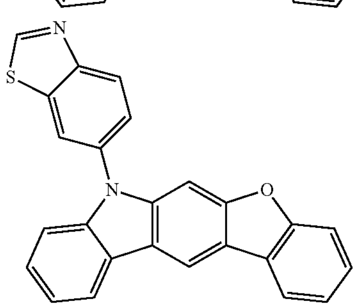
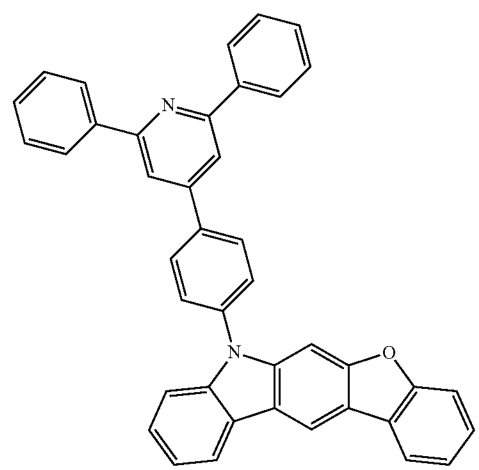
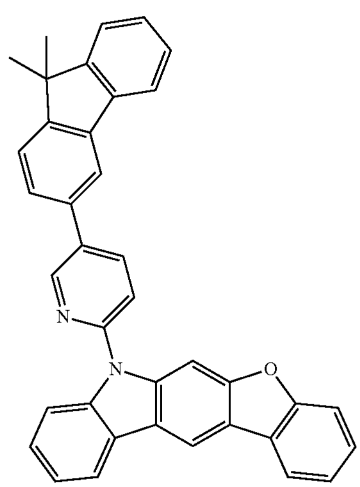
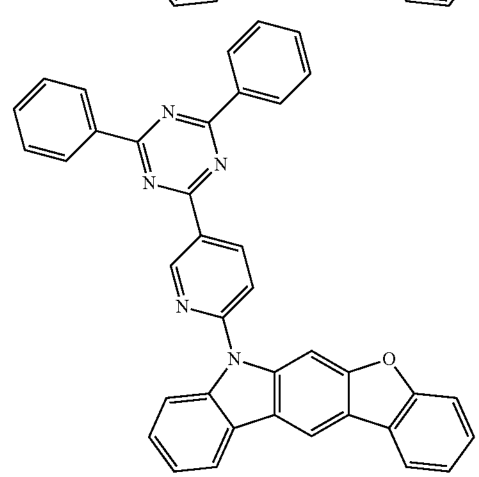

-continued
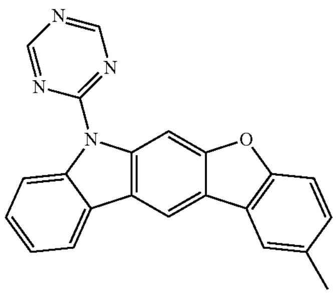
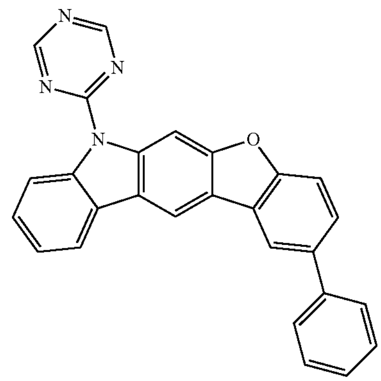
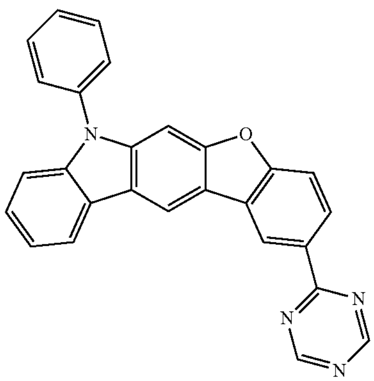
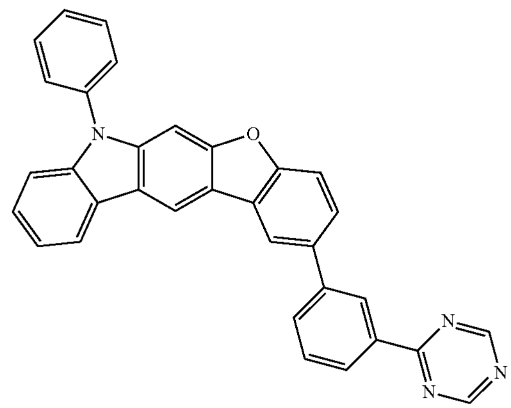
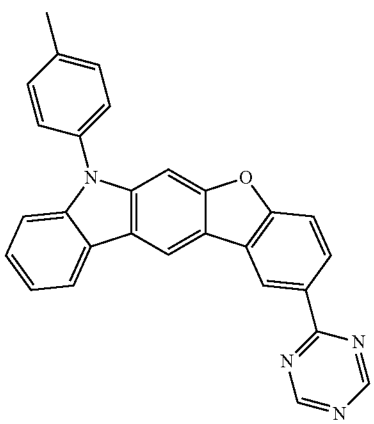
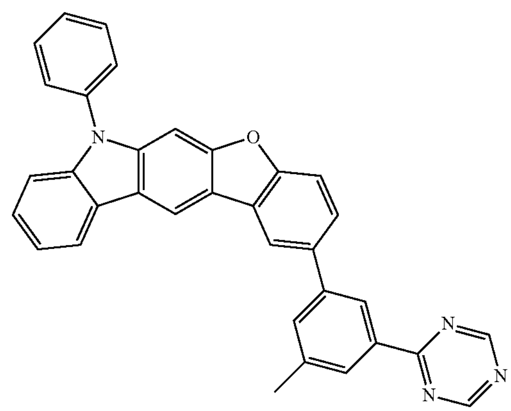
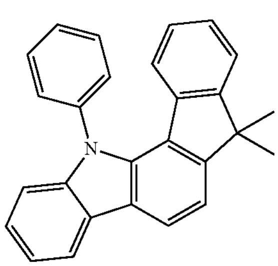
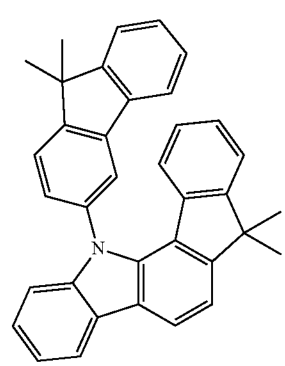

-continued
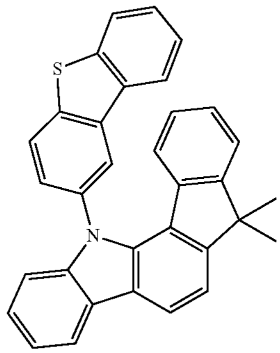
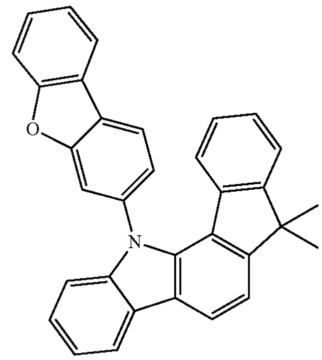
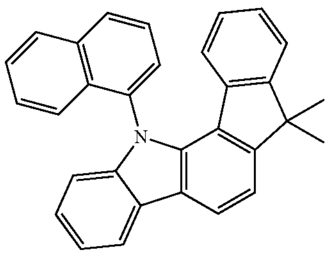
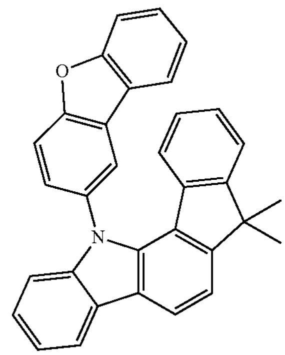
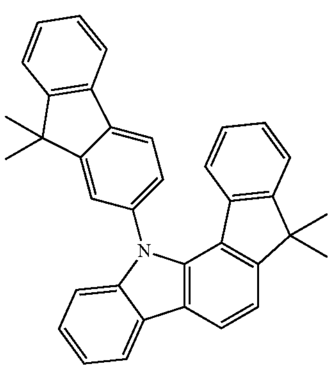
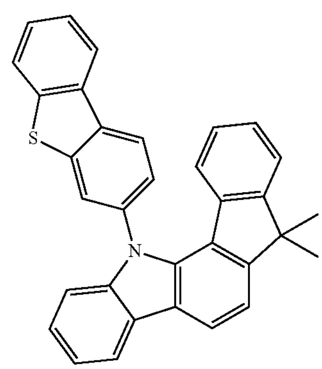
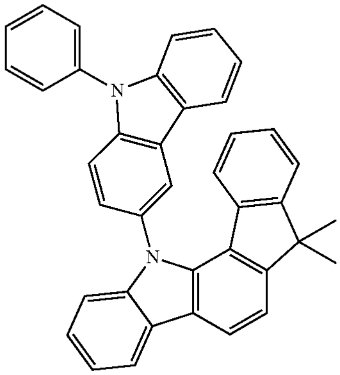
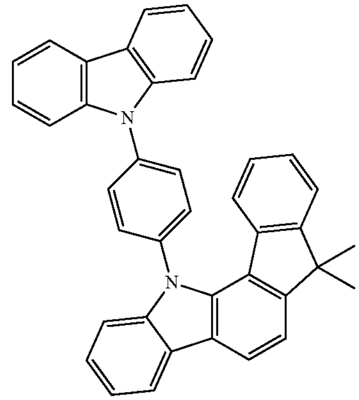

-continued
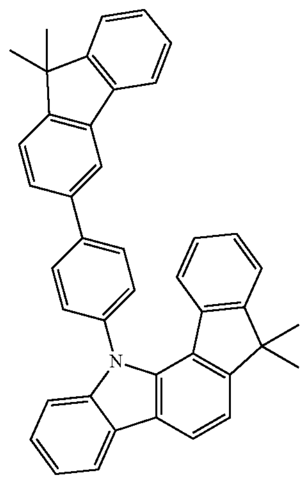
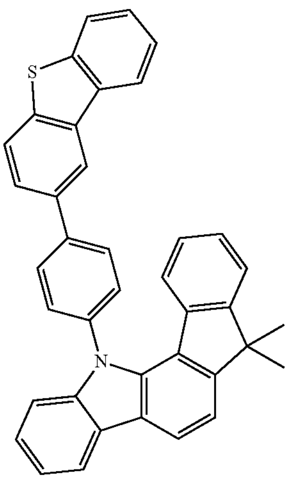
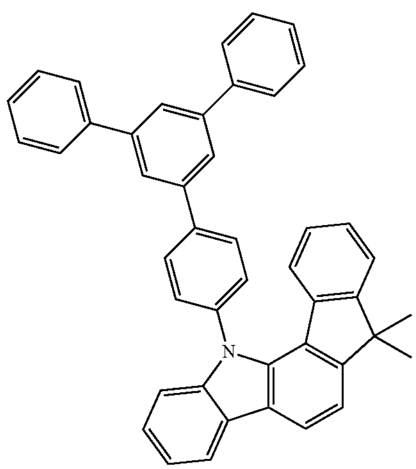
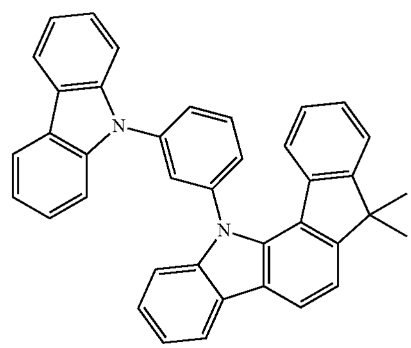
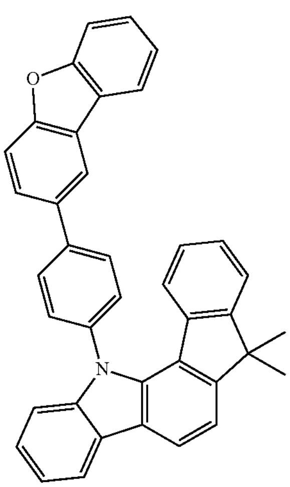
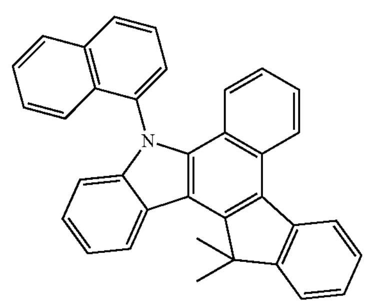

-continued
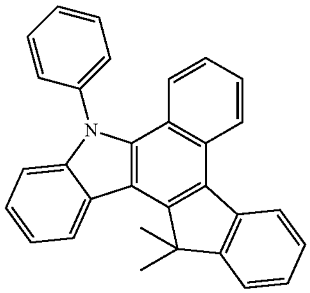
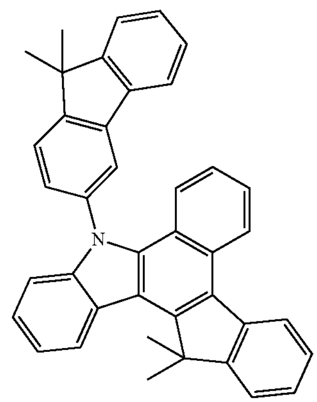
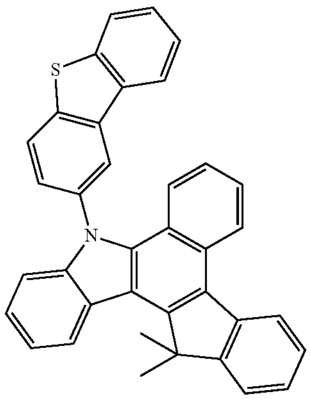
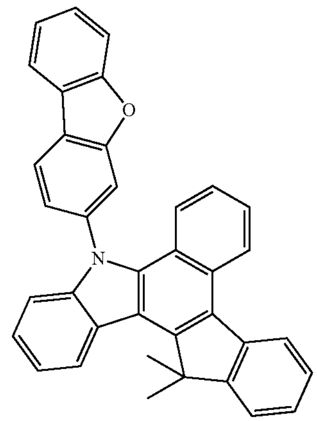
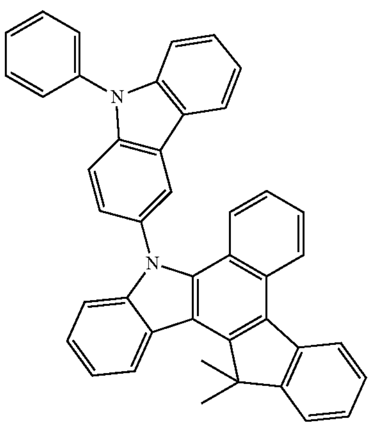
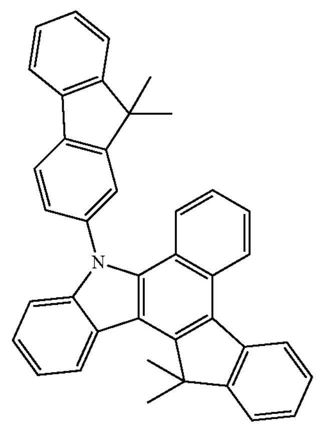
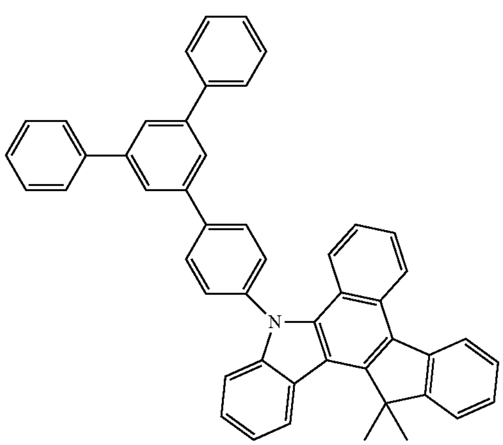
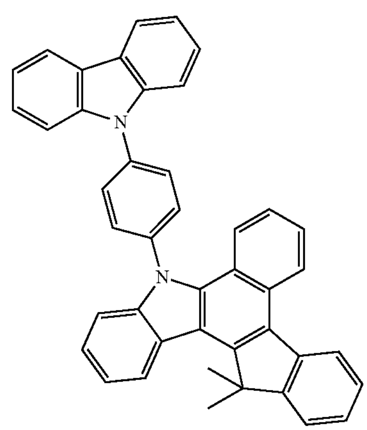

-continued
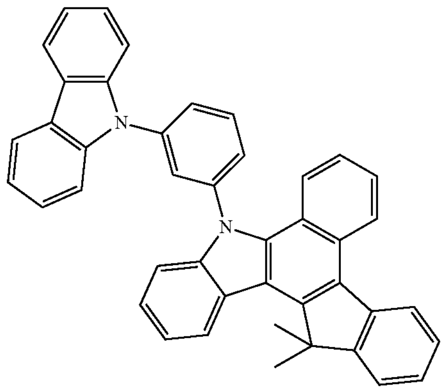
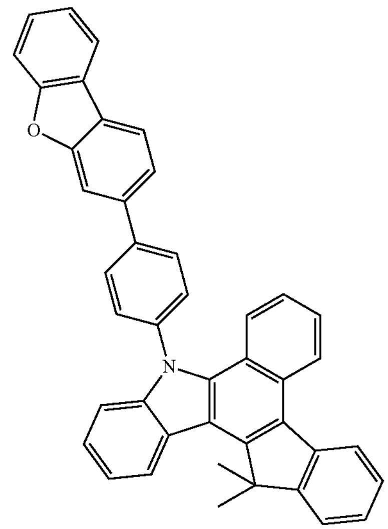
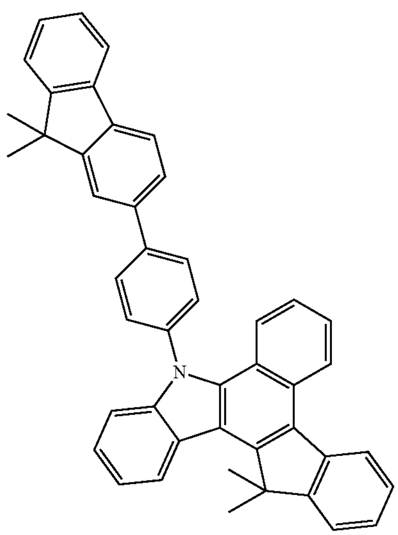
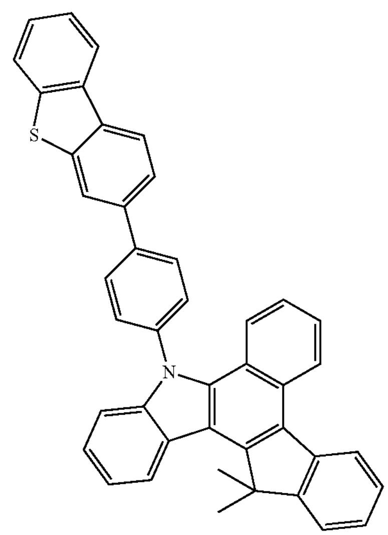
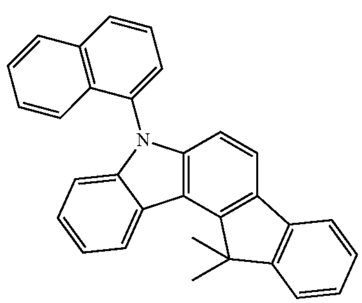
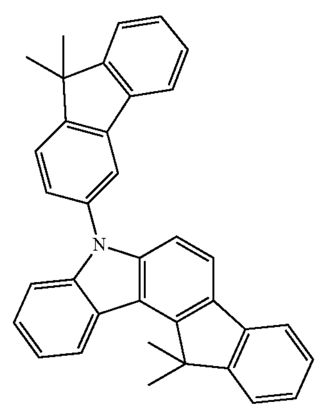

-continued
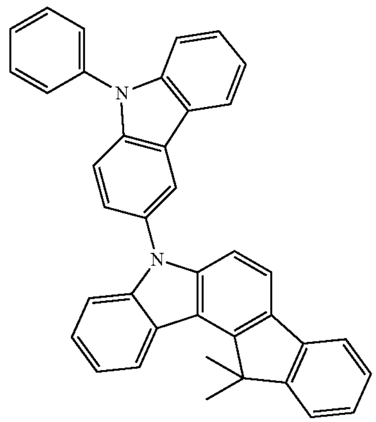
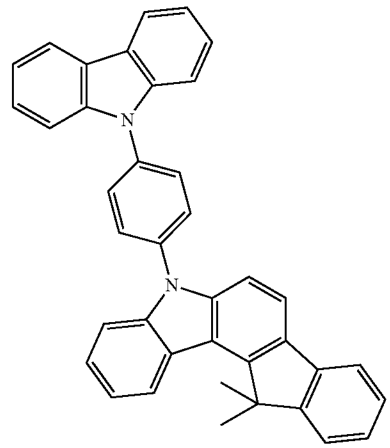
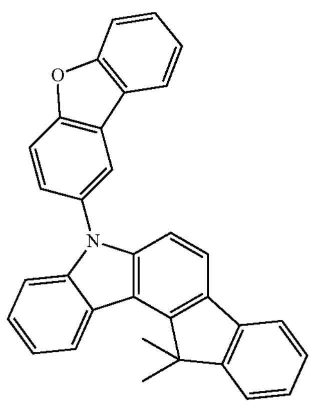
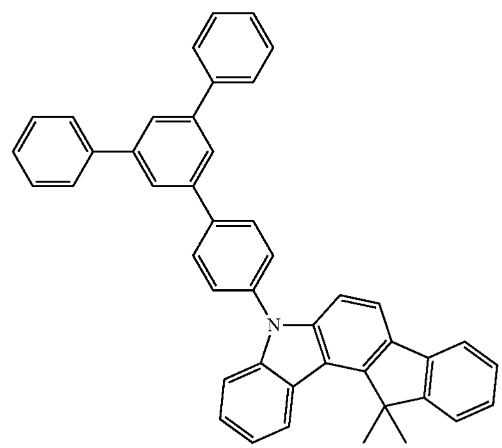
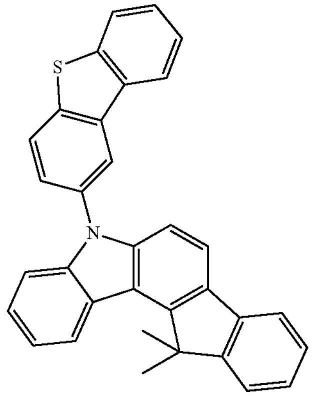
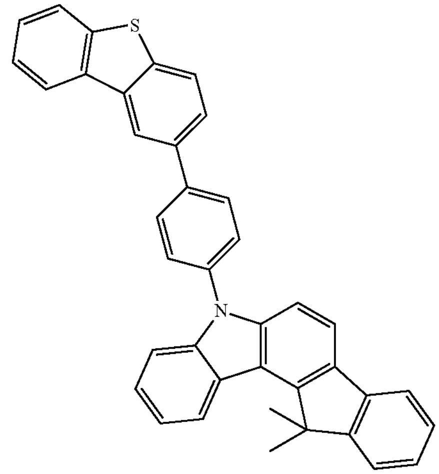

-continued
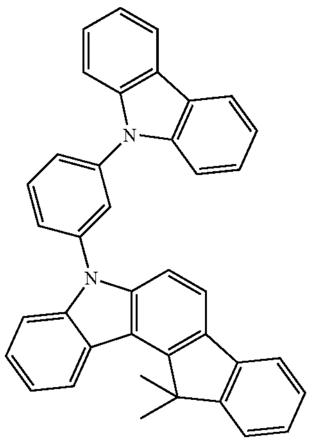
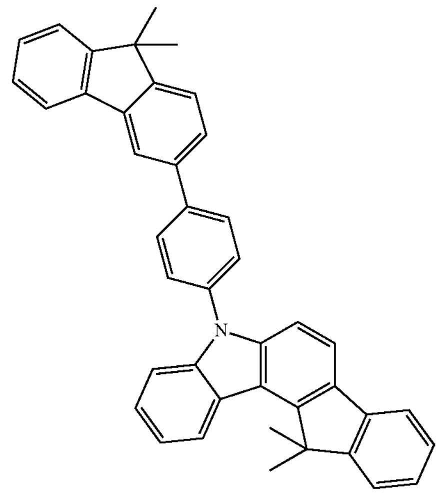
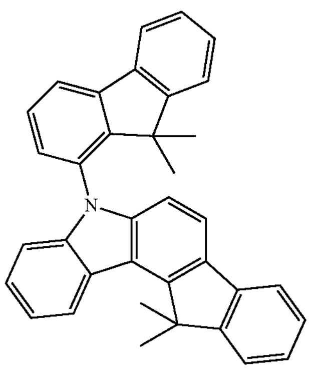
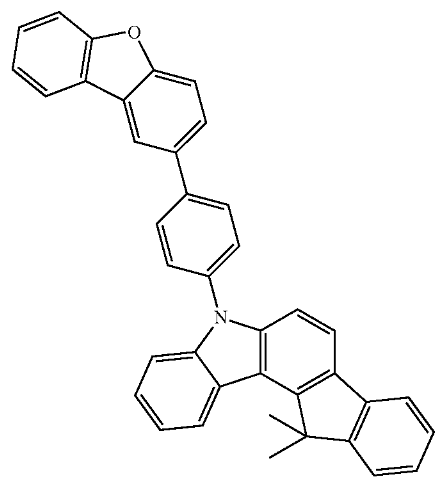
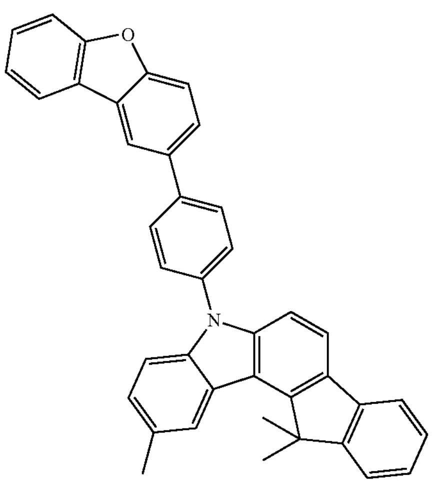
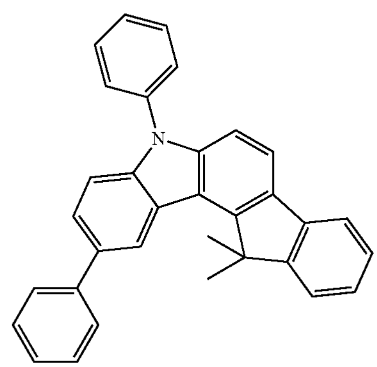

-continued
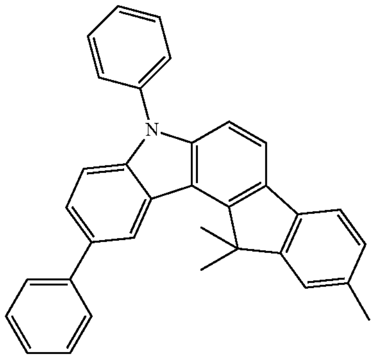
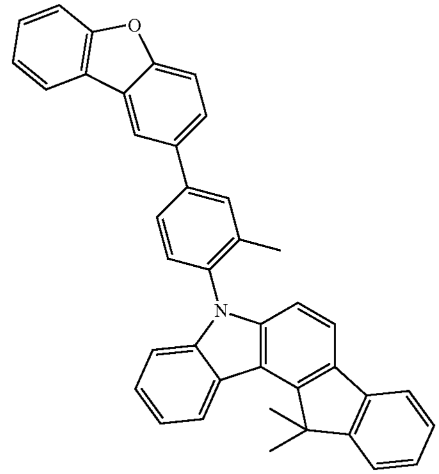
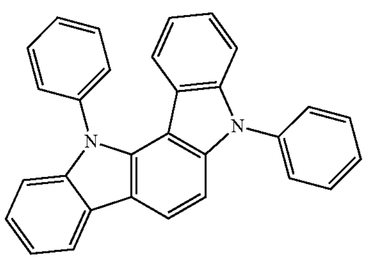
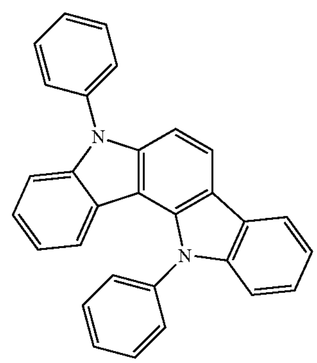
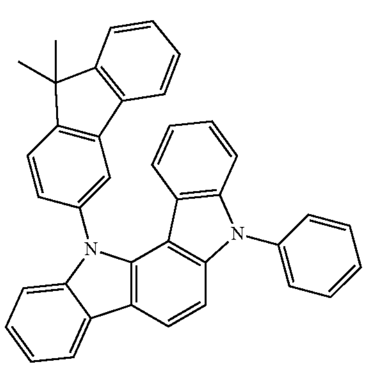
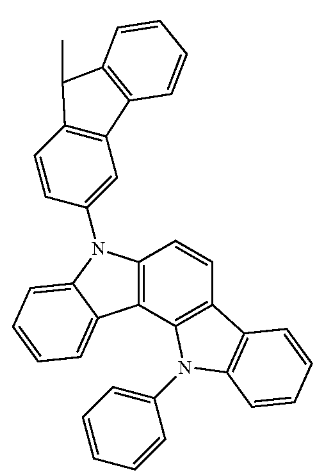

-continued
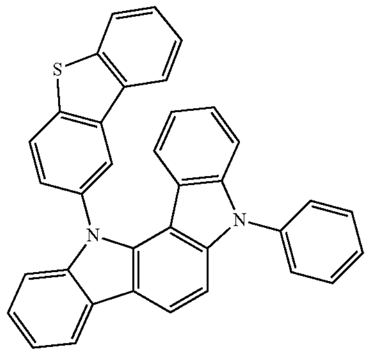
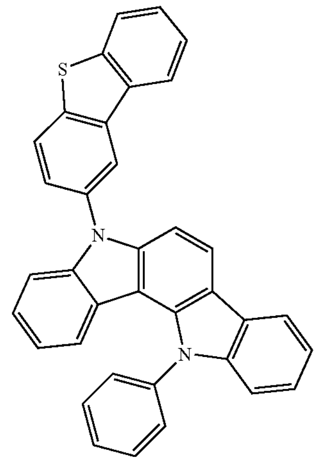
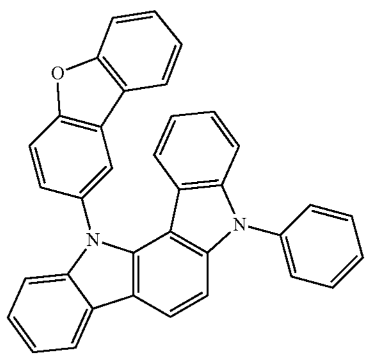
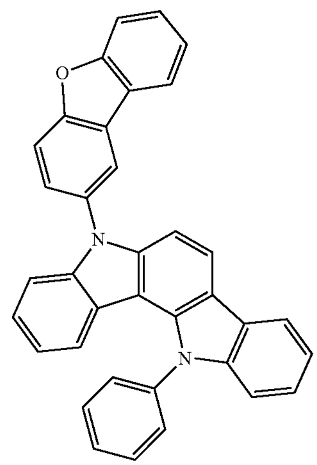
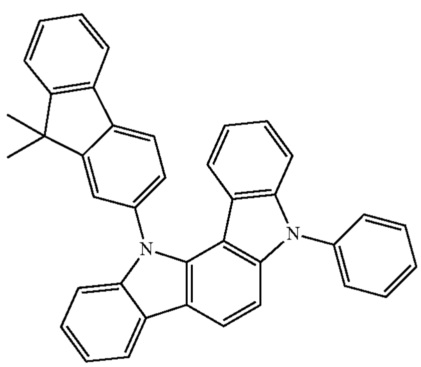
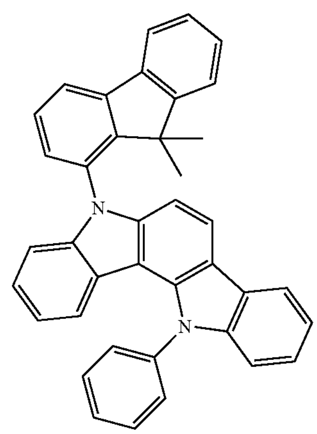

-continued
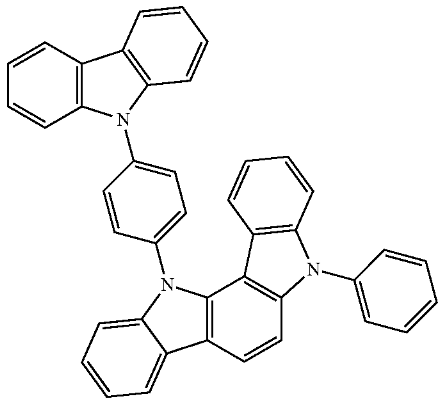
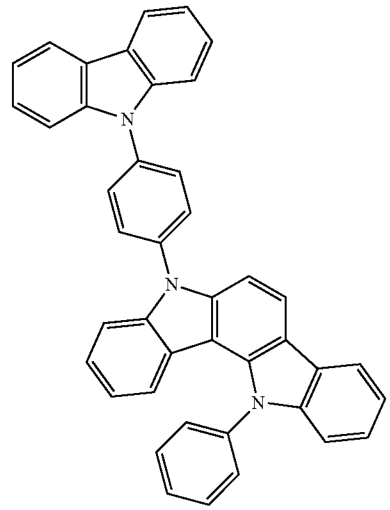
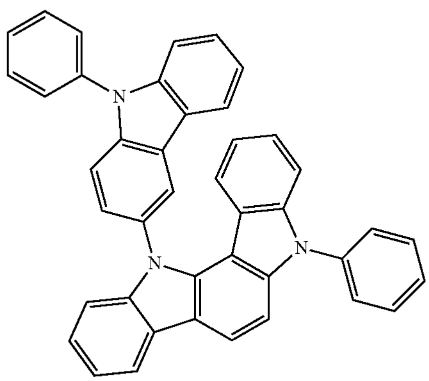
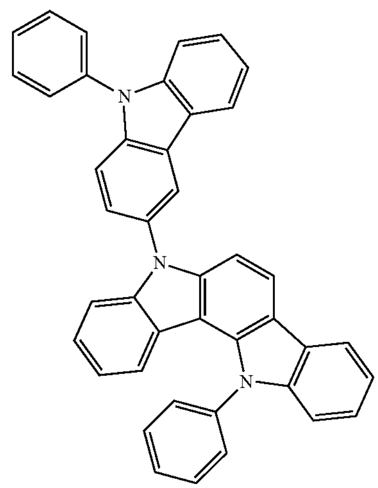
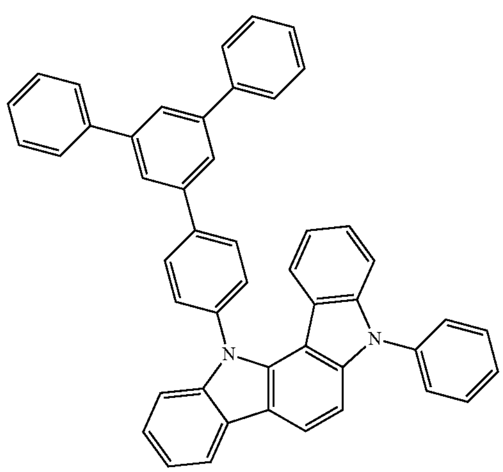
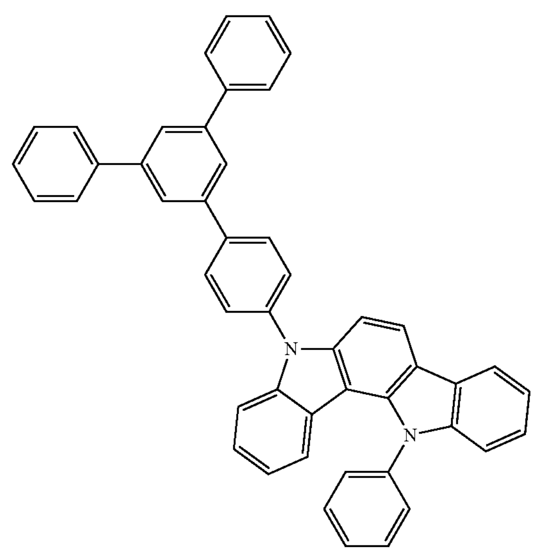

-continued
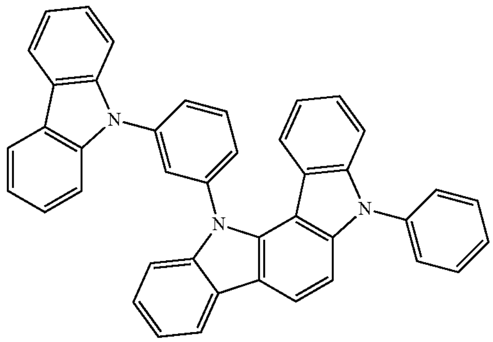
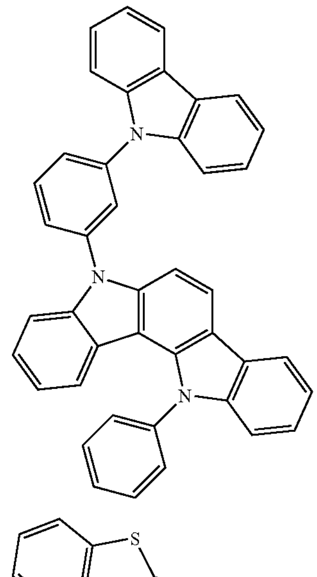
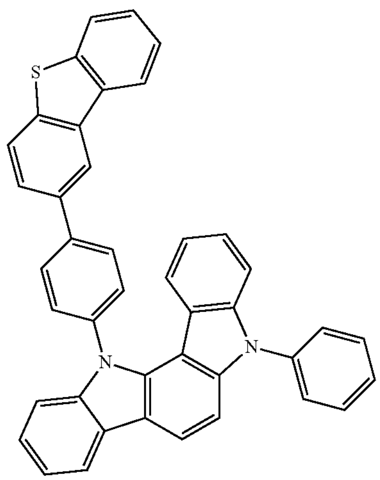
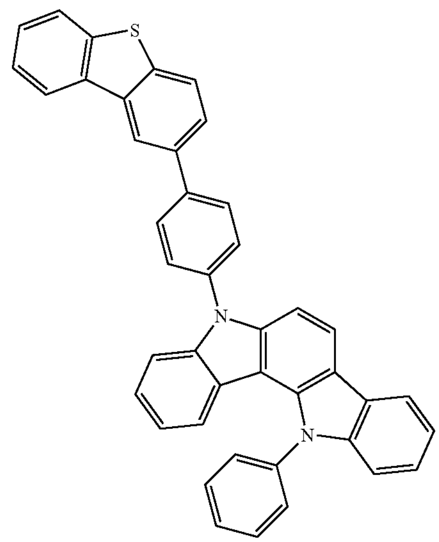
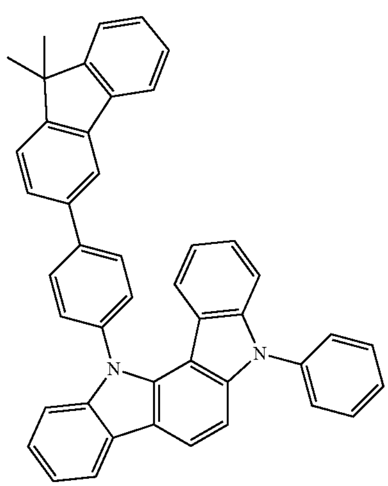
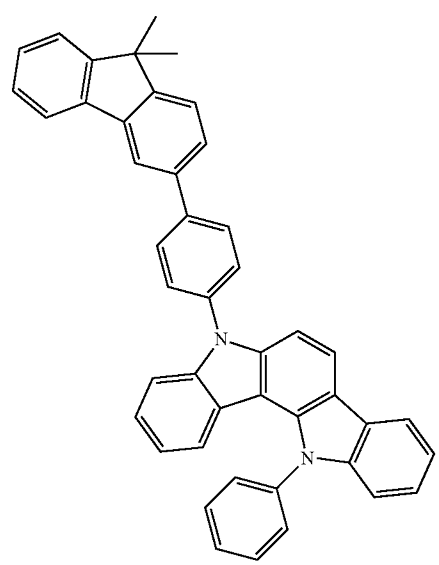

-continued
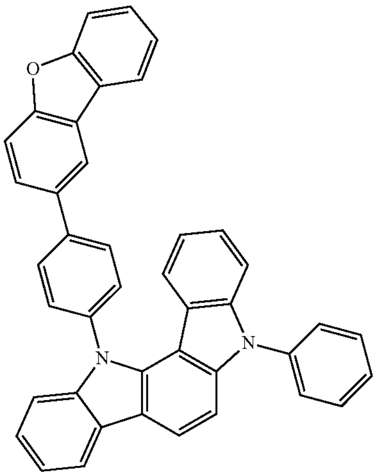
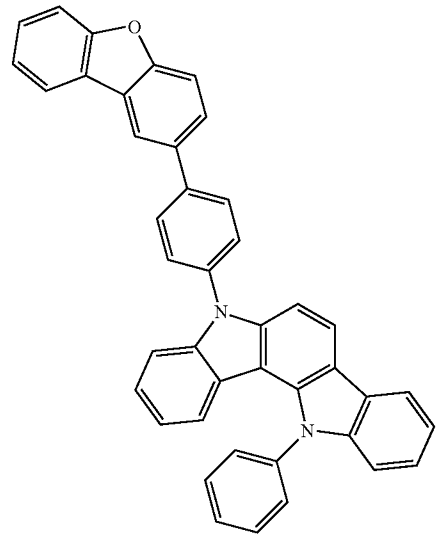
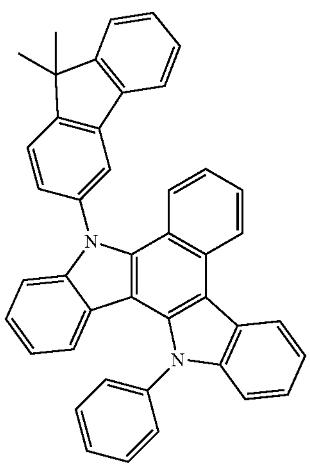
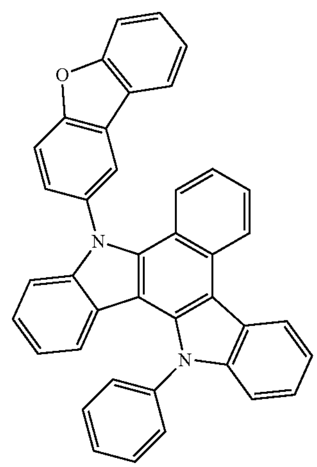
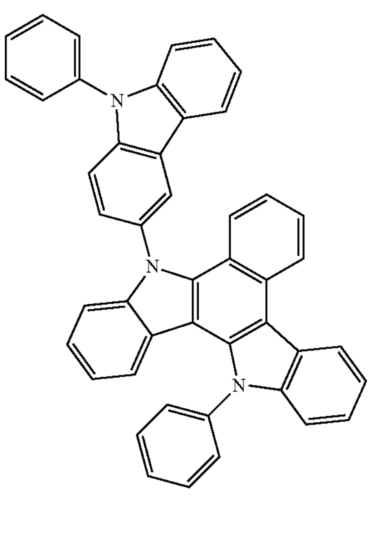
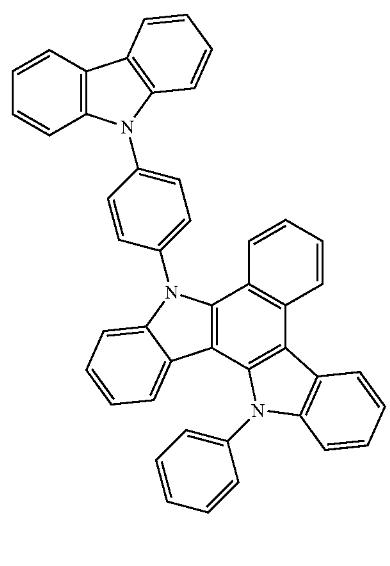

-continued
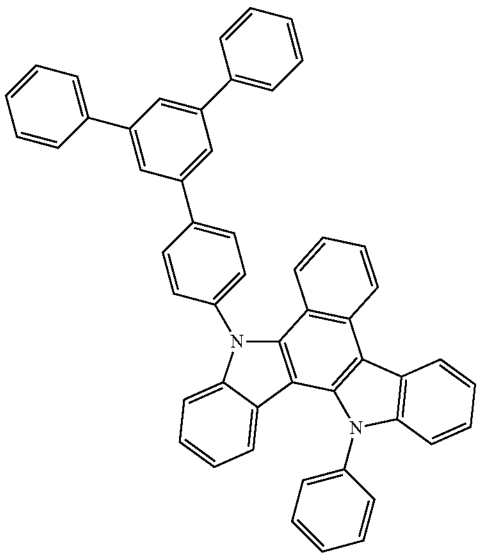
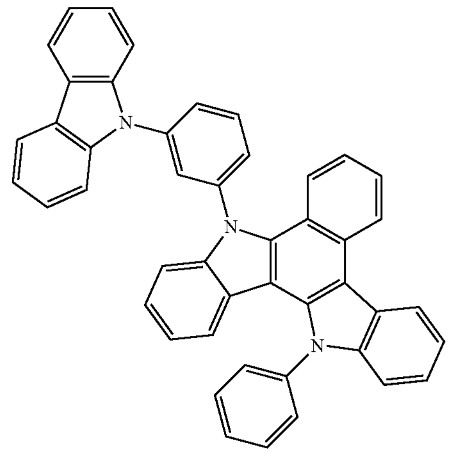
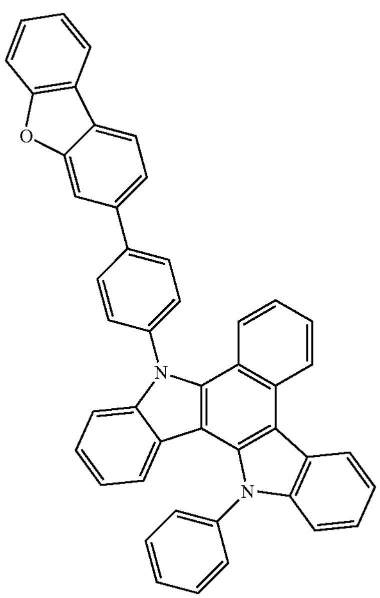
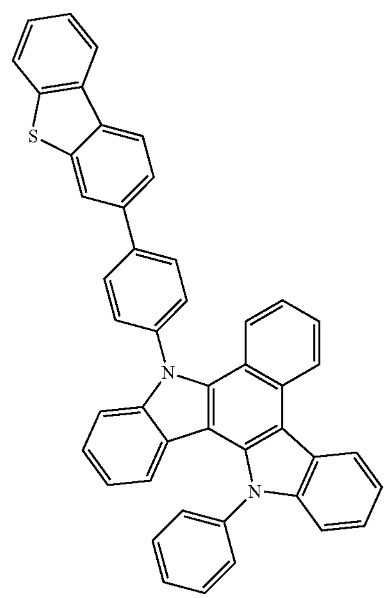
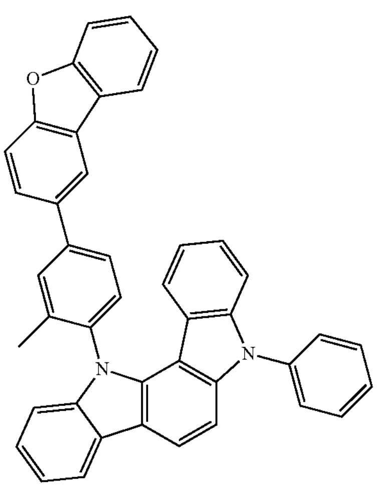
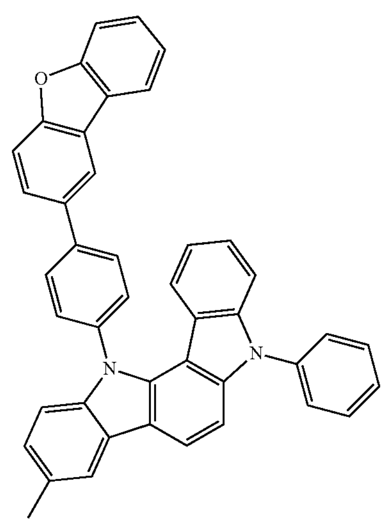

-continued
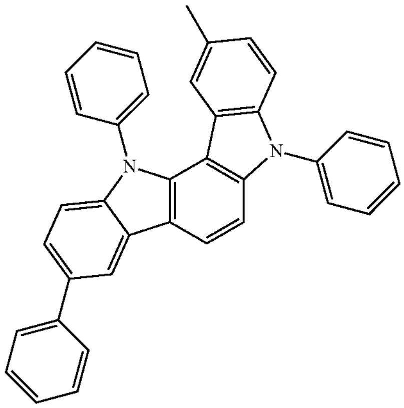
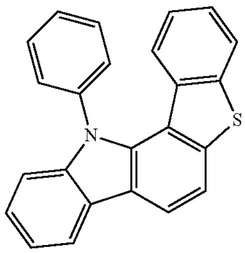
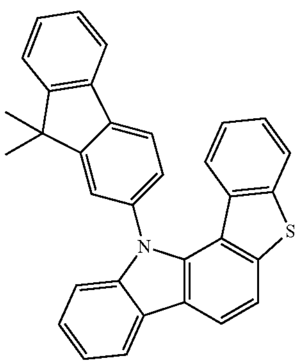
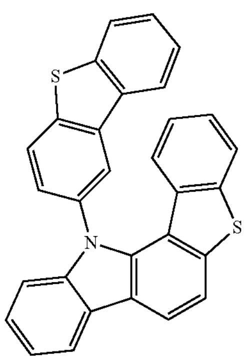
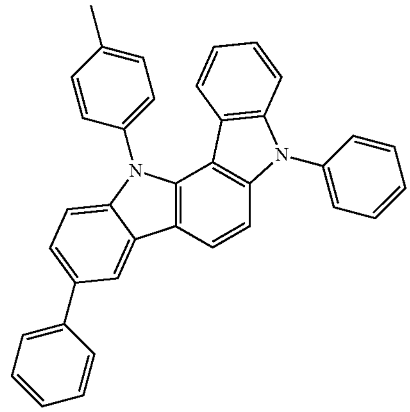
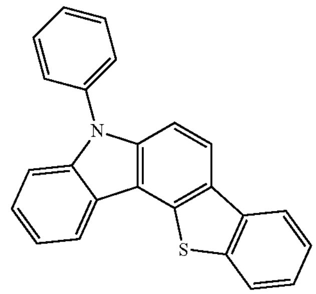
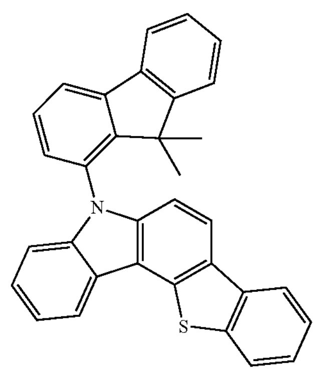
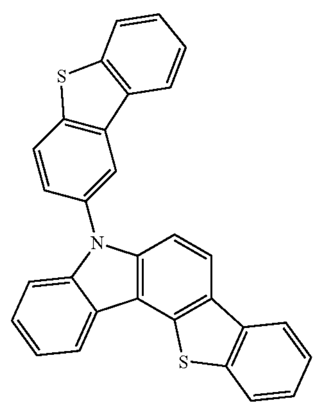

-continued
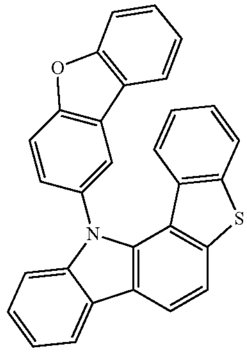
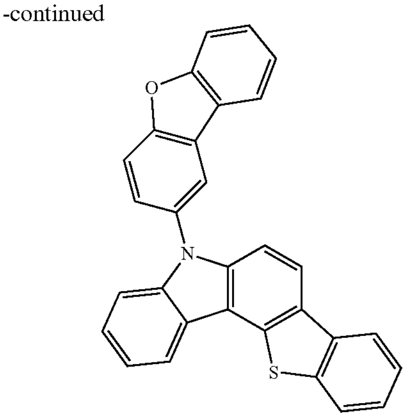
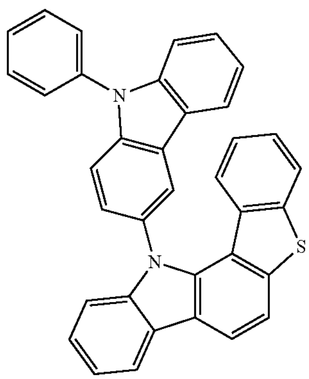
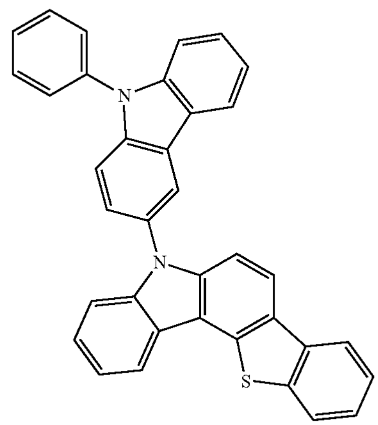
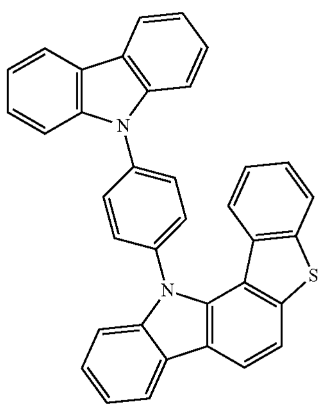
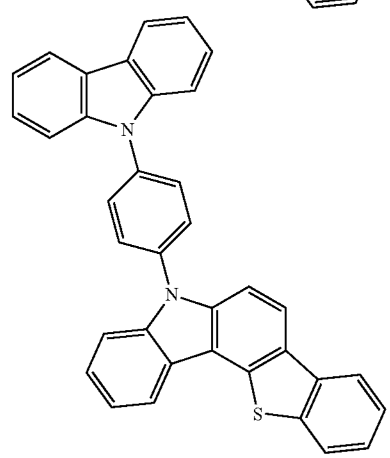
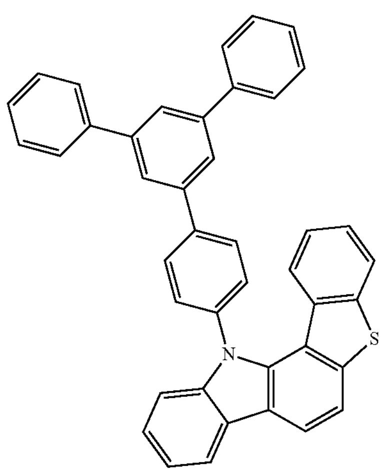
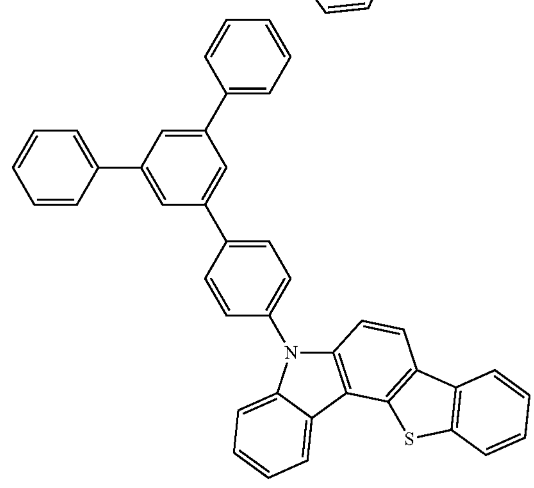

-continued
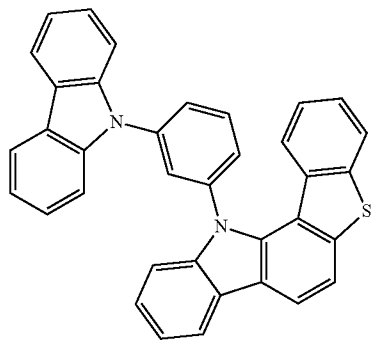
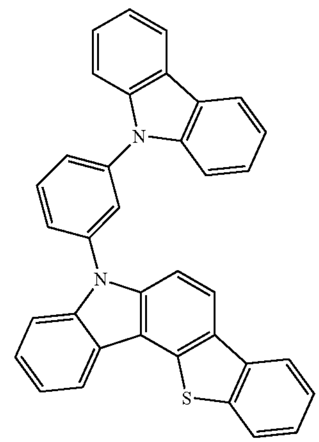
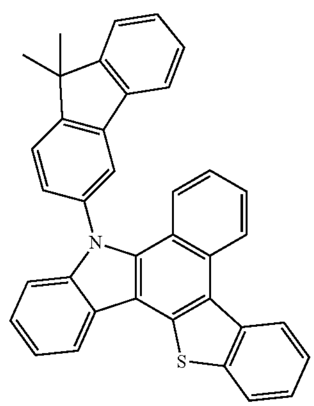
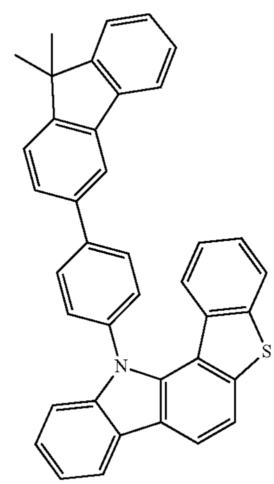
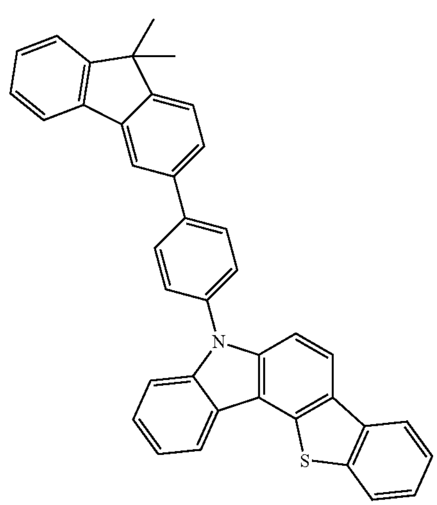
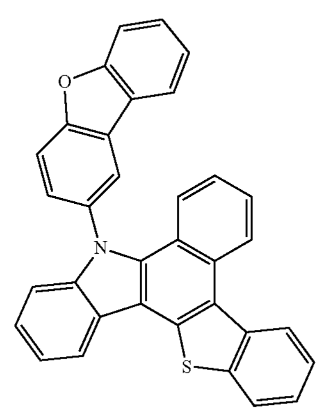

-continued
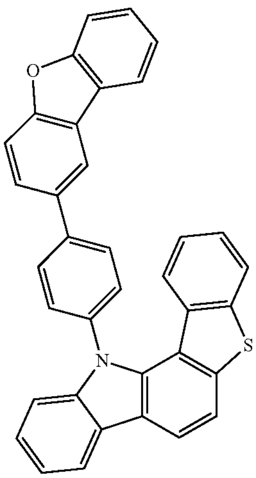
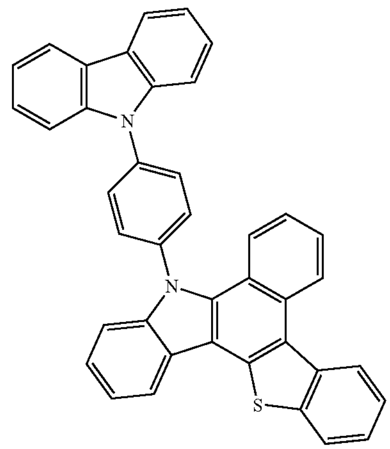
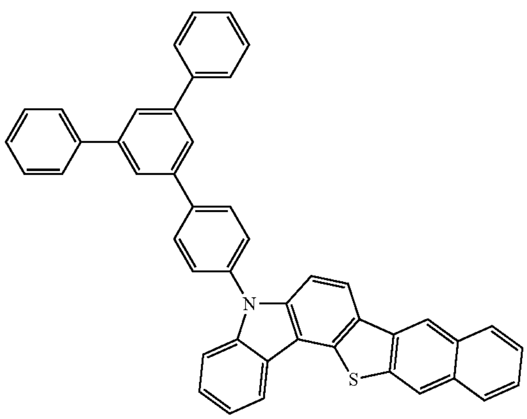
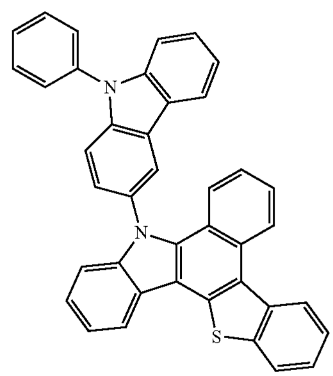
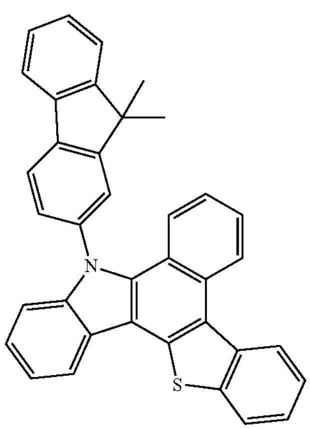
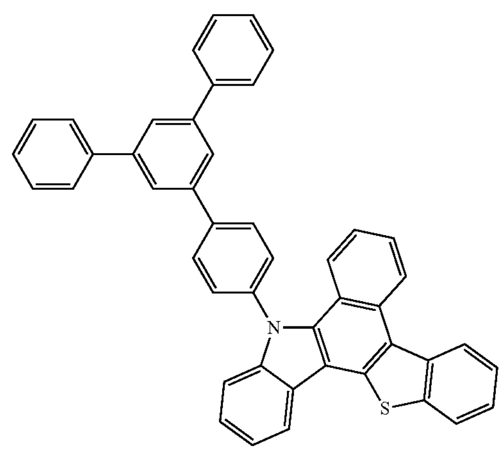

-continued
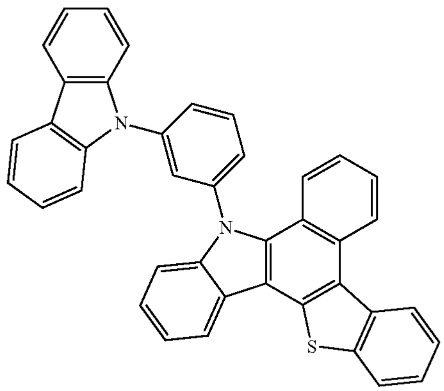
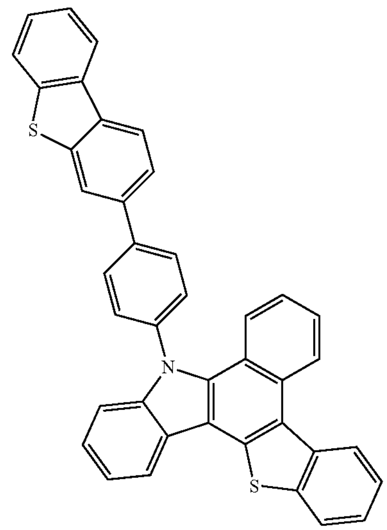
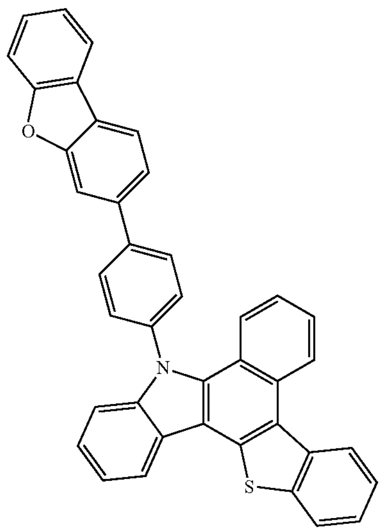
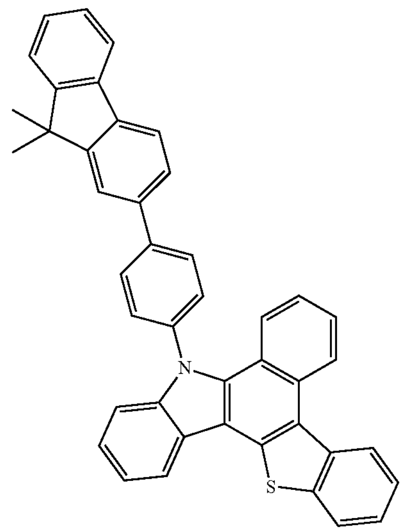
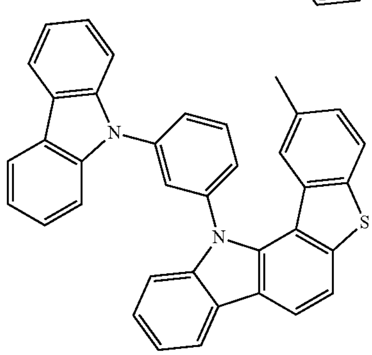
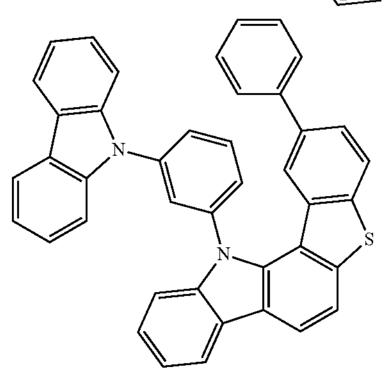
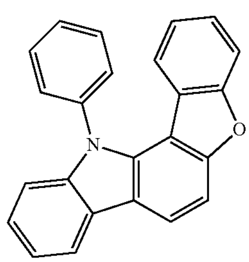
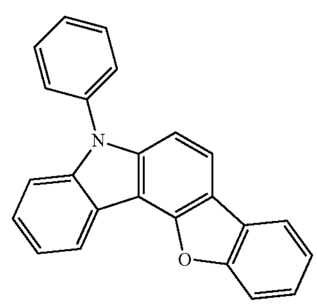

-continued
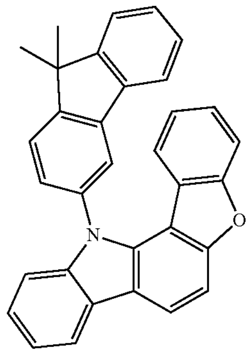
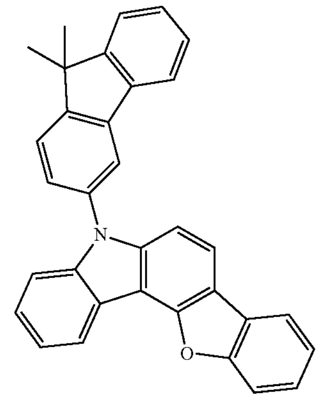
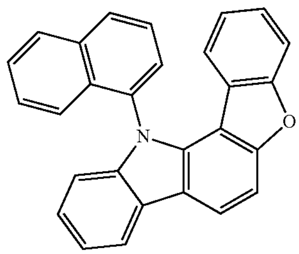
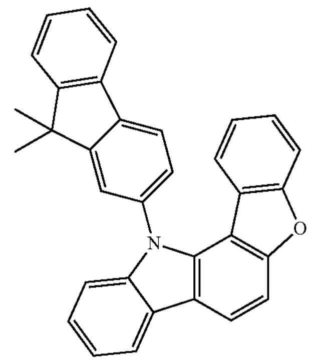
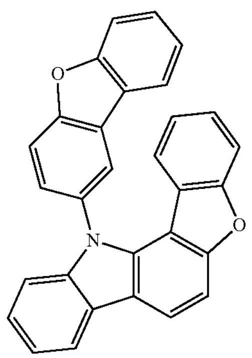
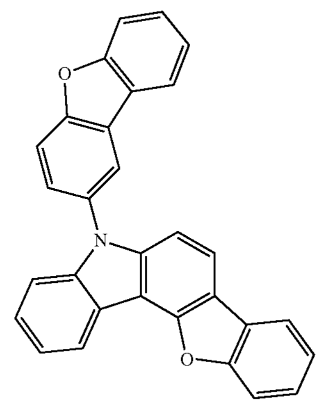
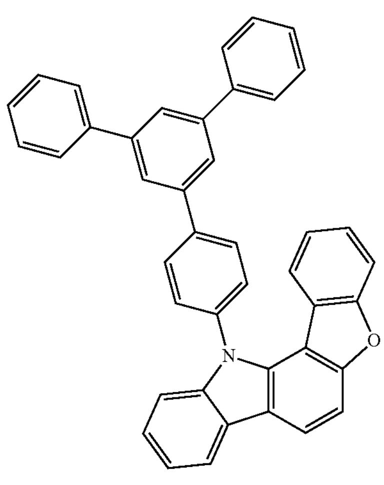
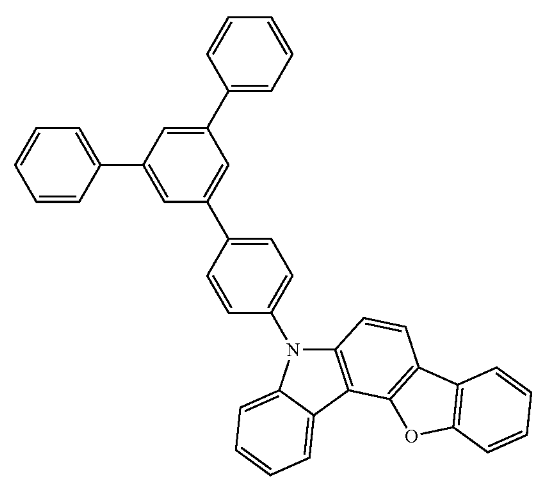

-continued
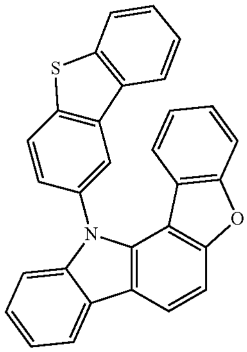
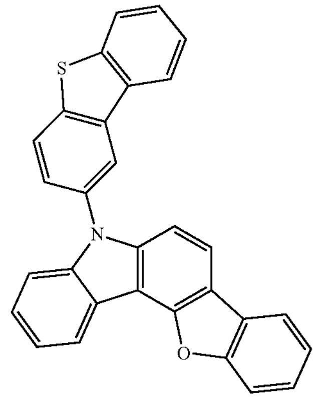
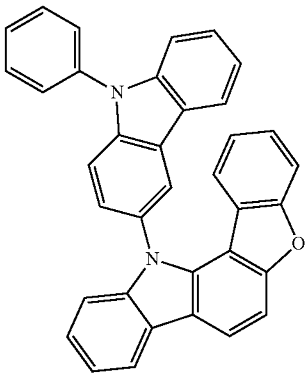
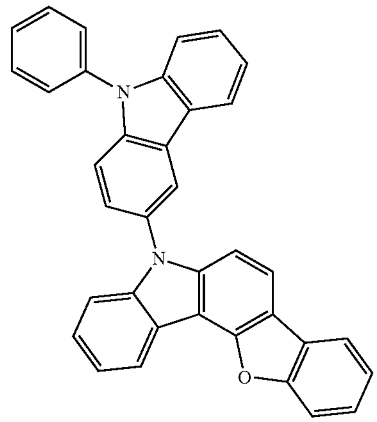
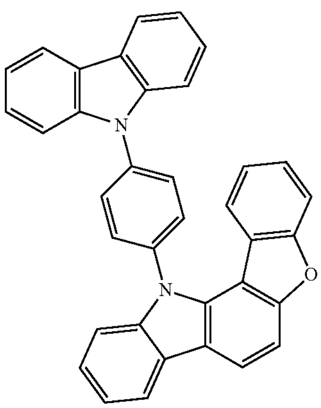
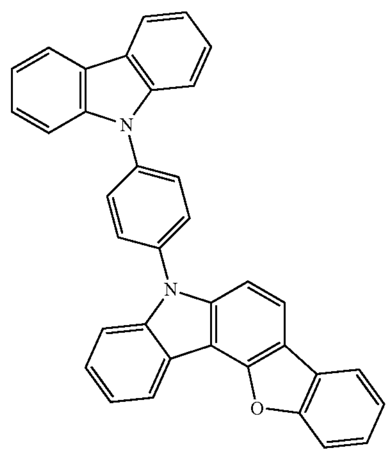
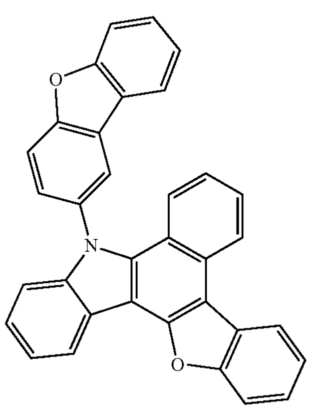
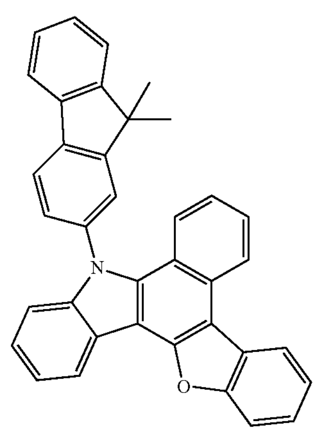

-continued
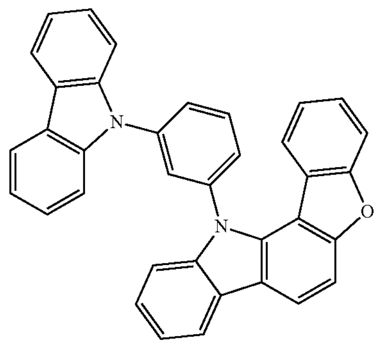
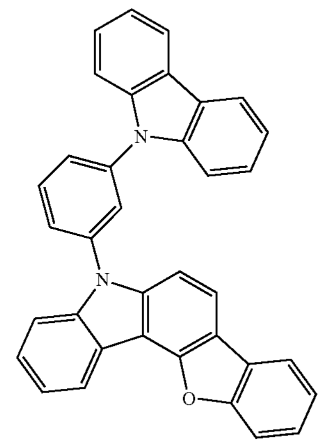
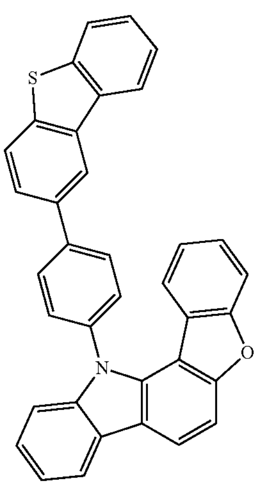
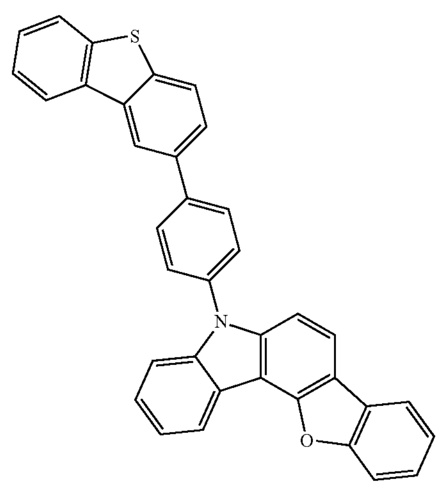
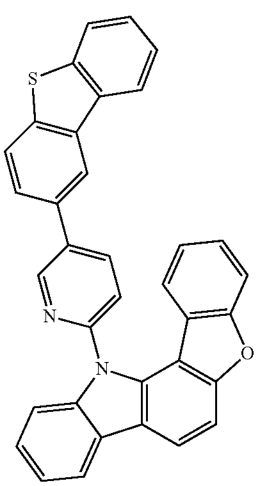
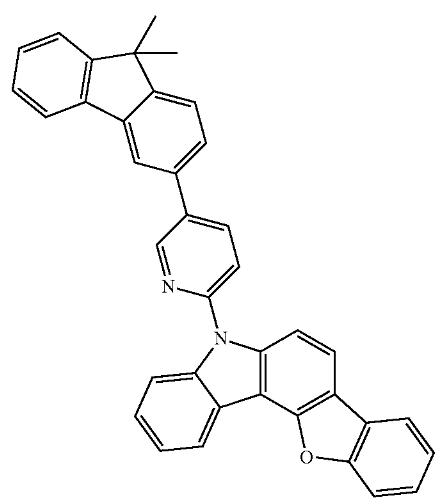

-continued
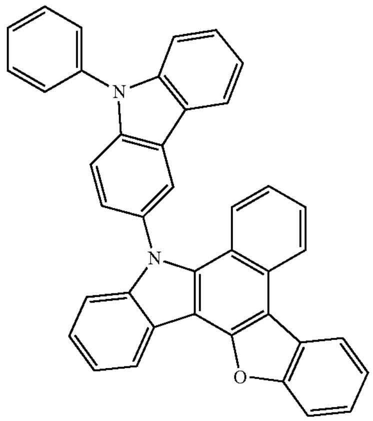
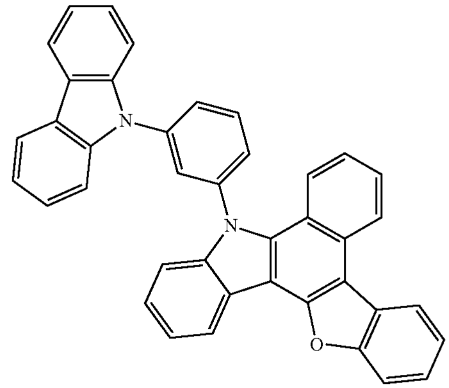
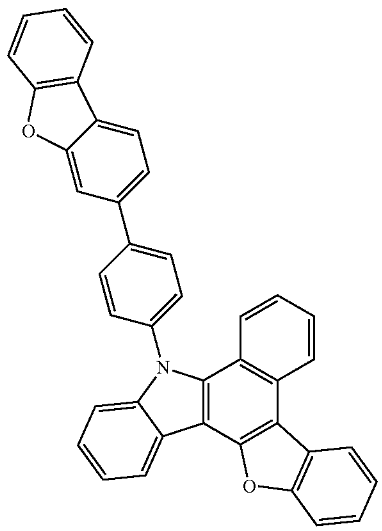
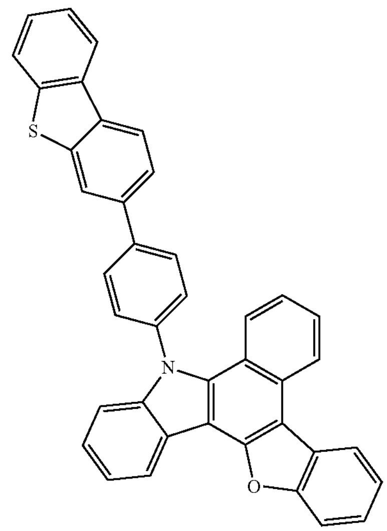
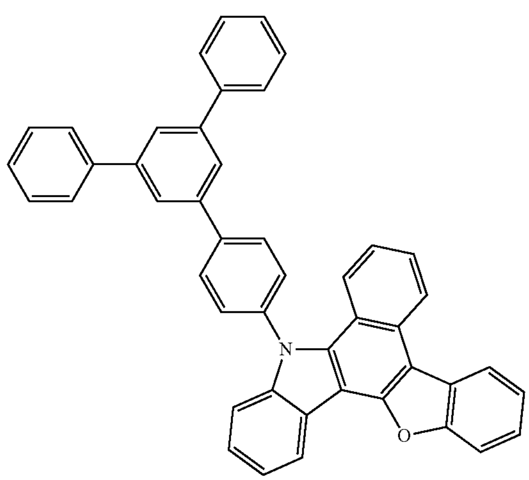
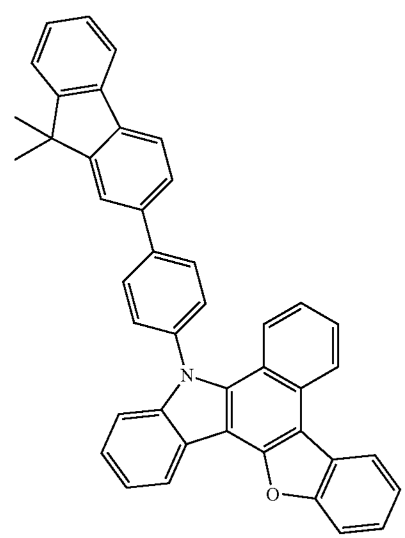

-continued
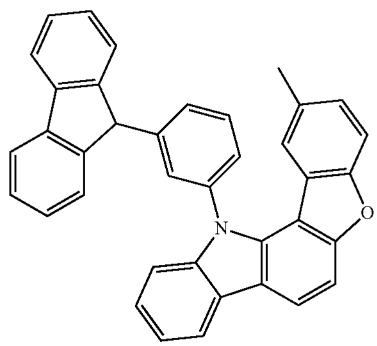
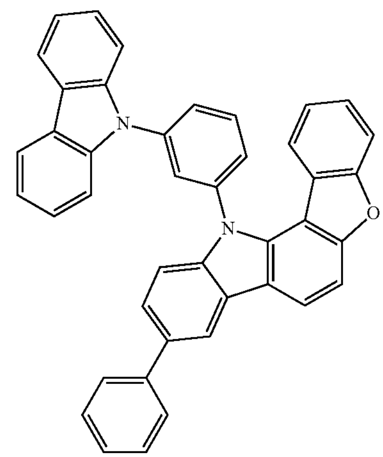
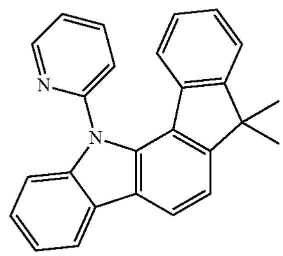
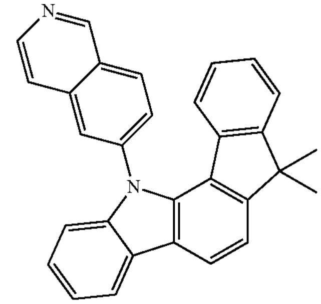
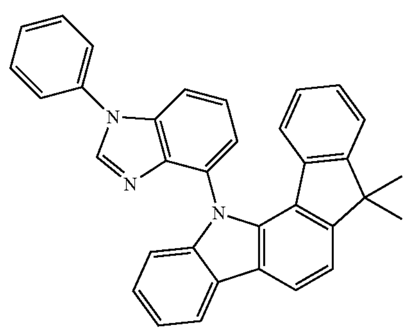
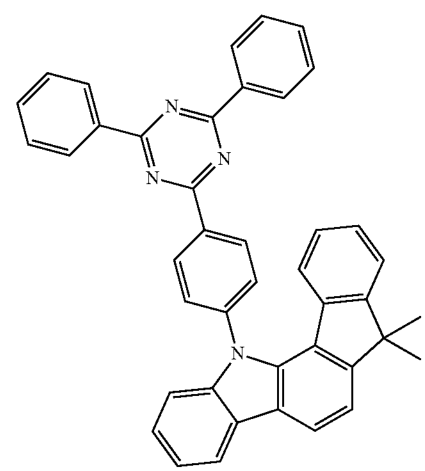
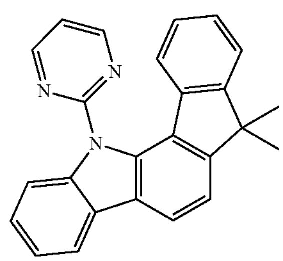
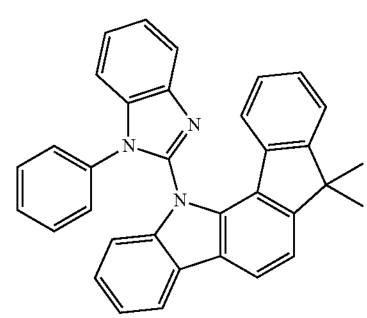

-continued
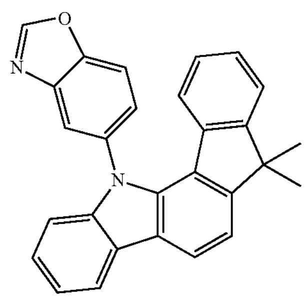
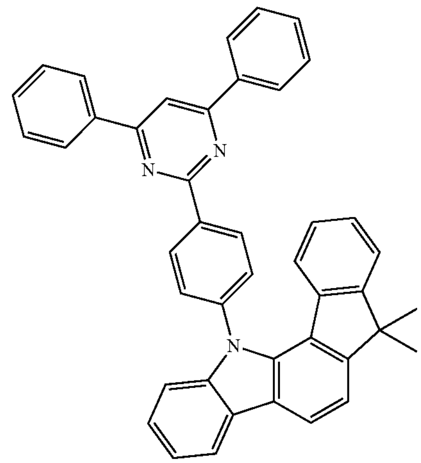
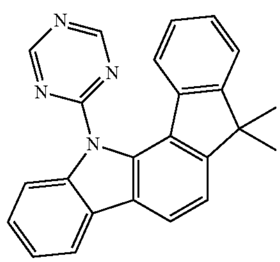
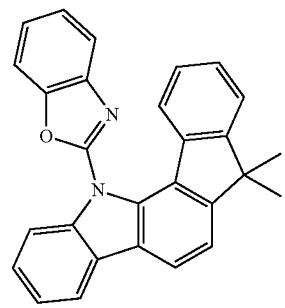
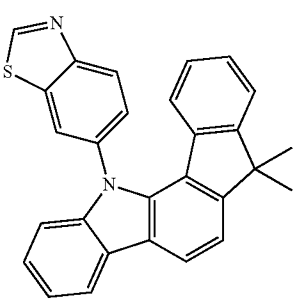
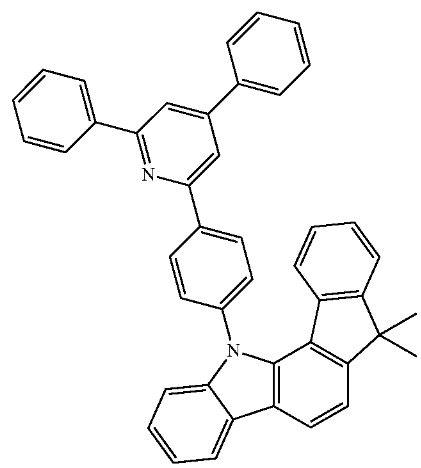
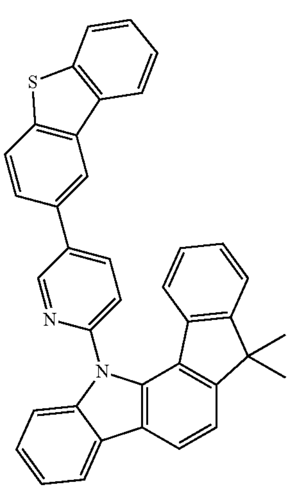
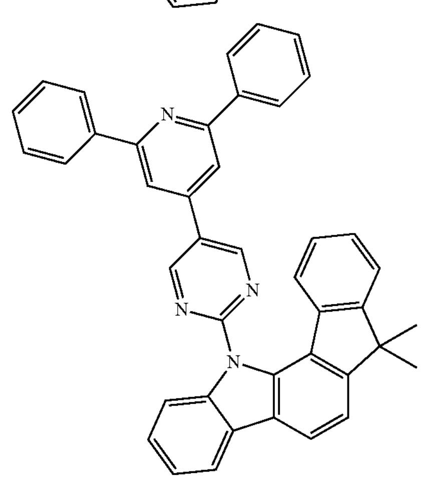

-continued
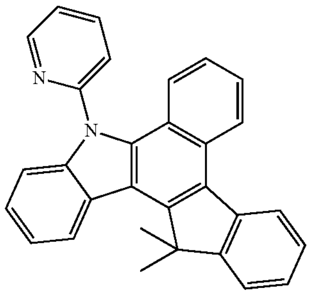
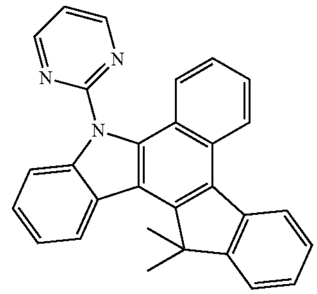
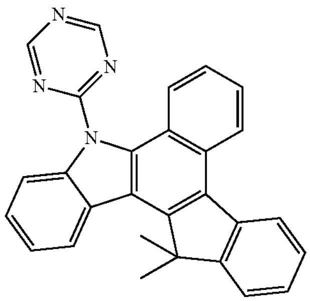
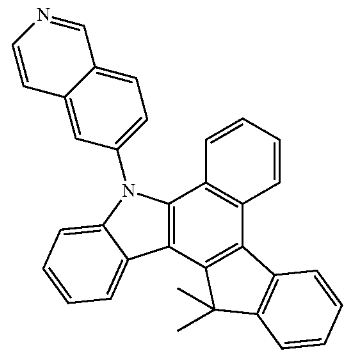
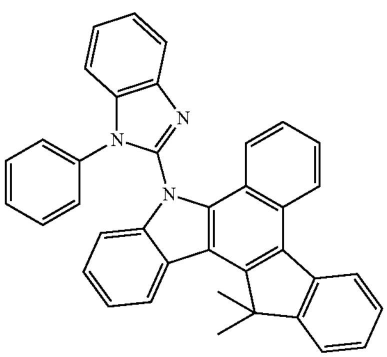
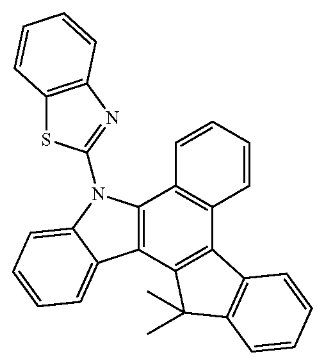
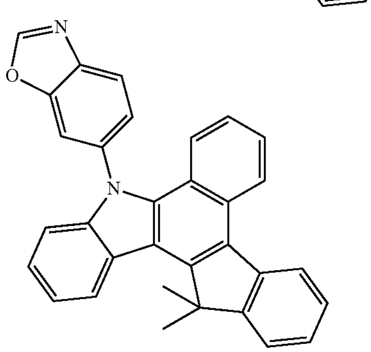
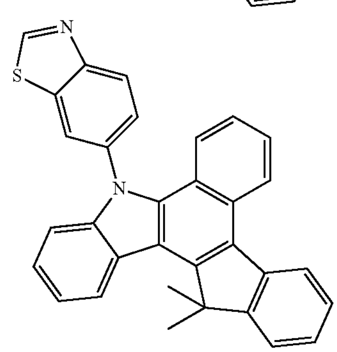
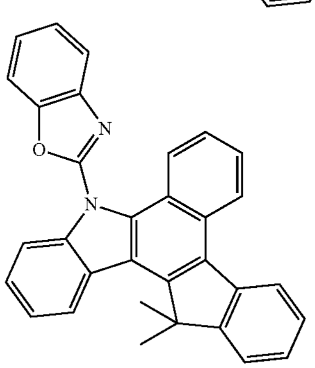
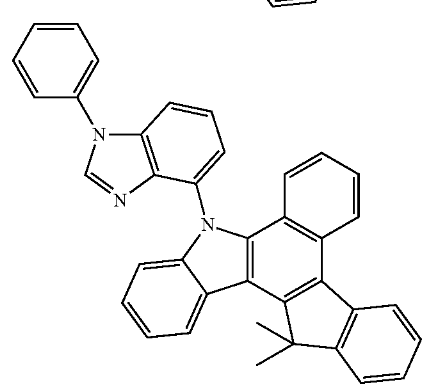

-continued
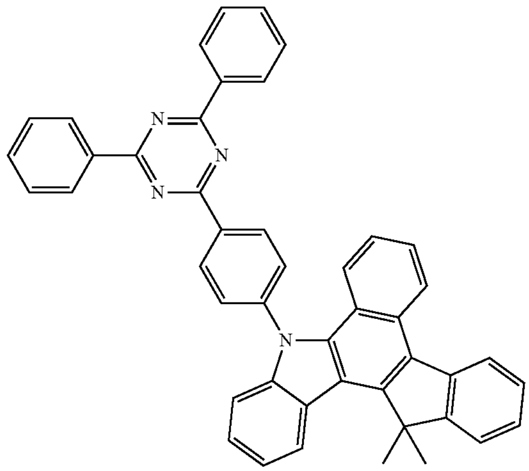
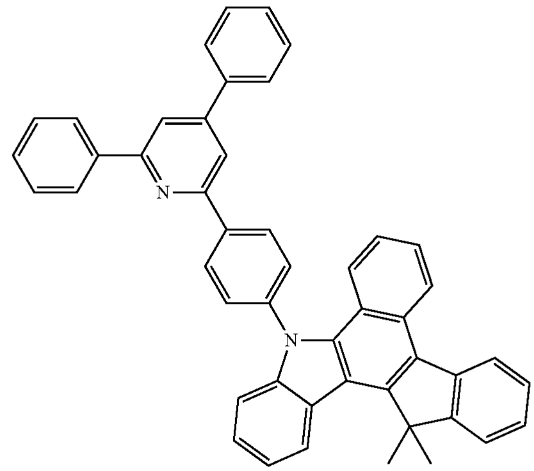
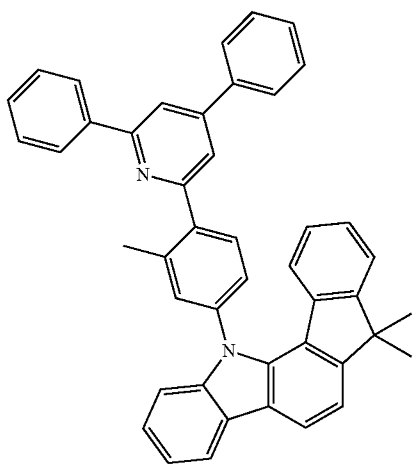
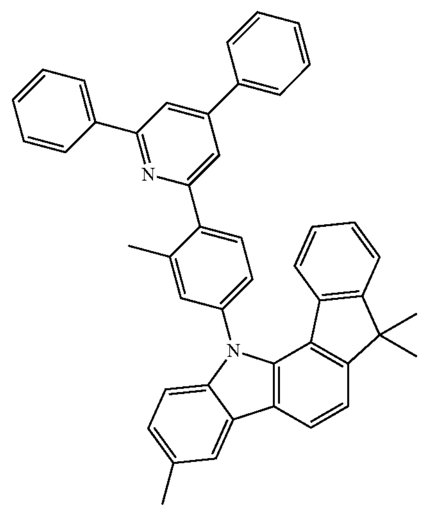
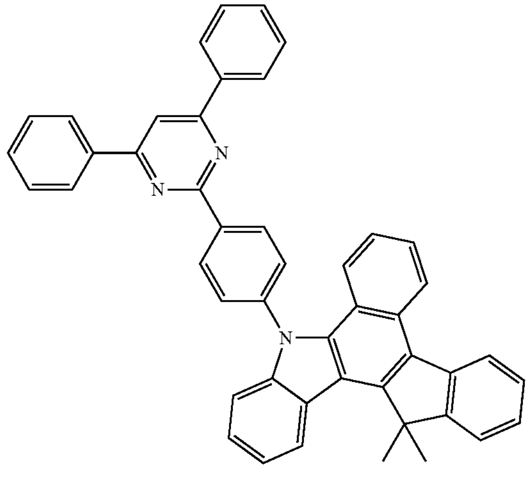
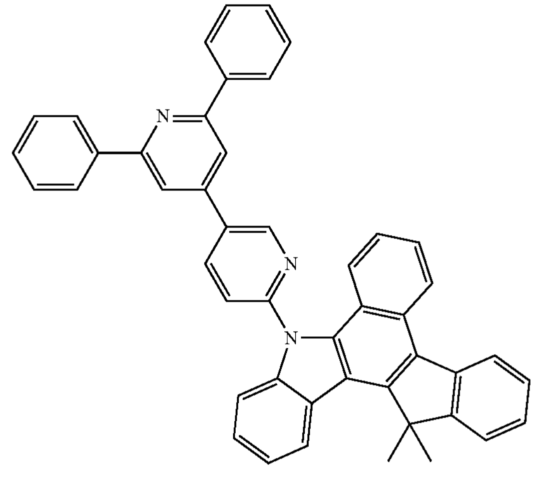

-continued
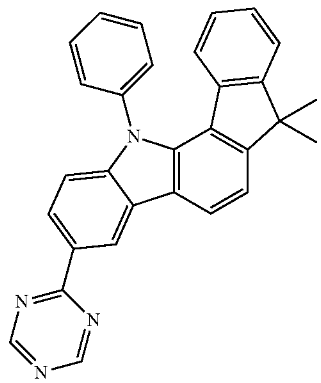
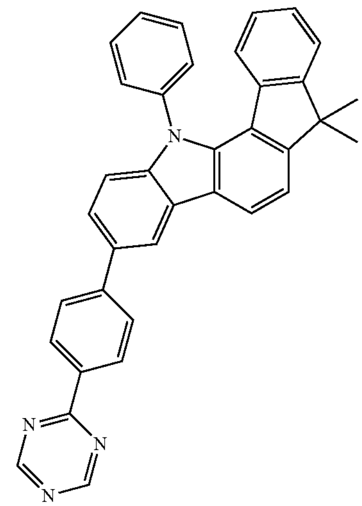
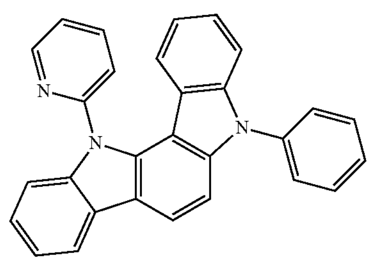
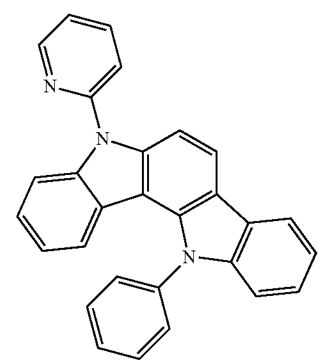
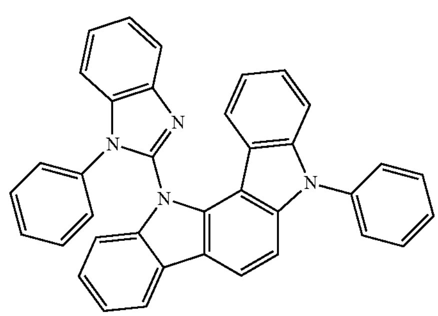
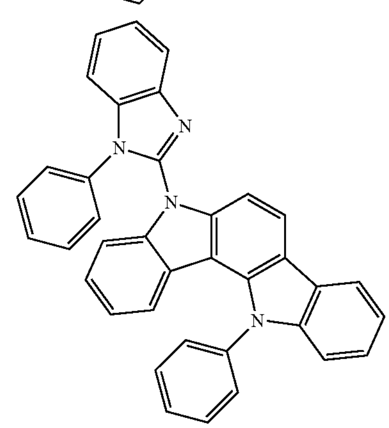
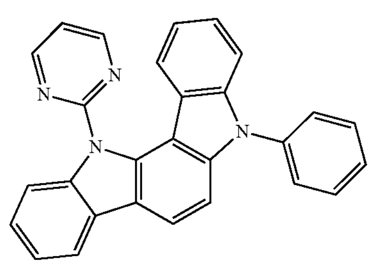
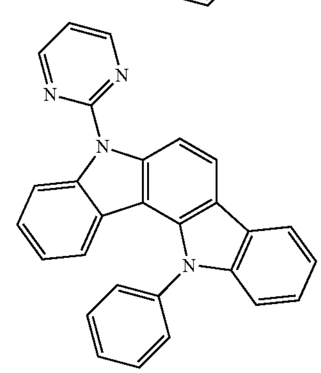

-continued
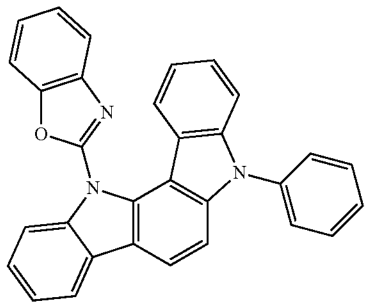
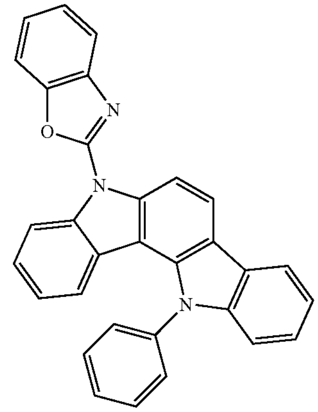
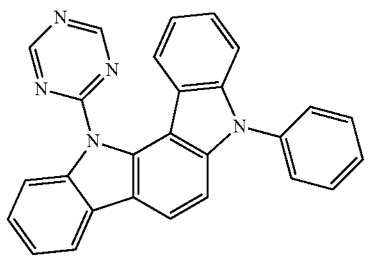
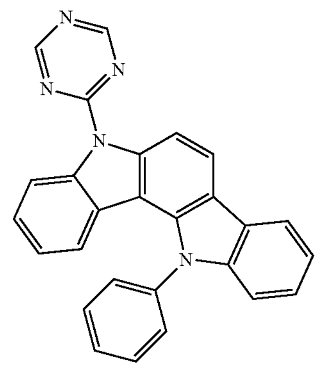
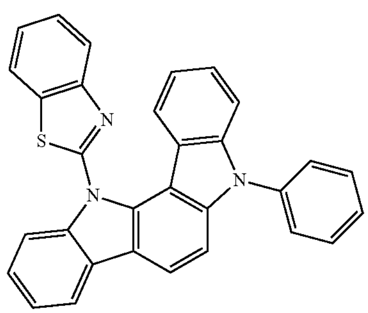
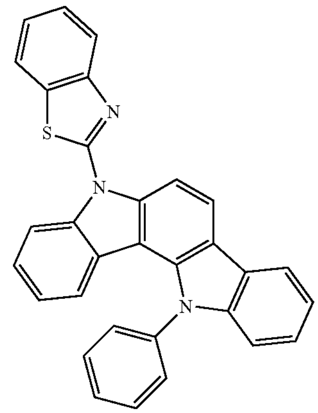
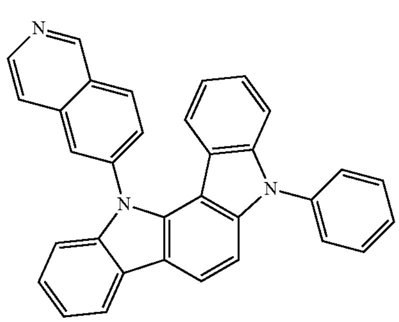
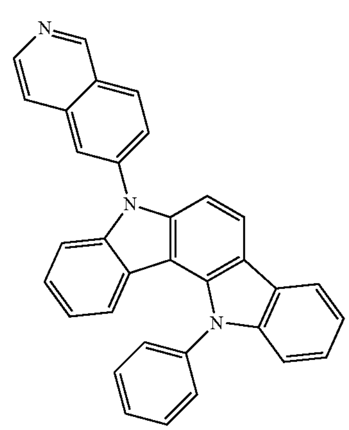

-continued
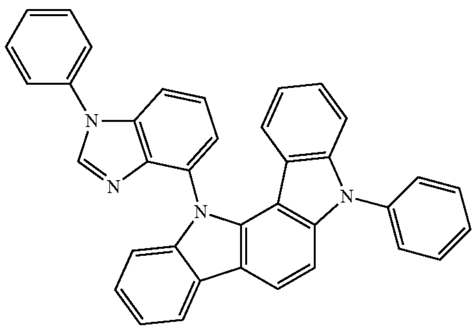
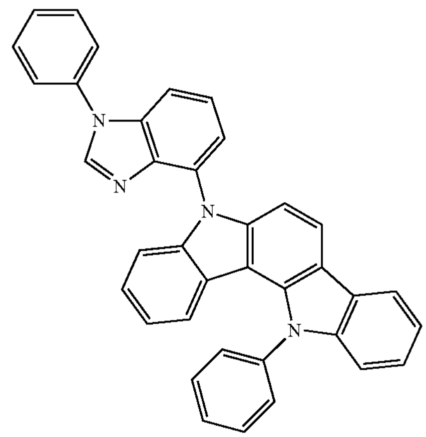
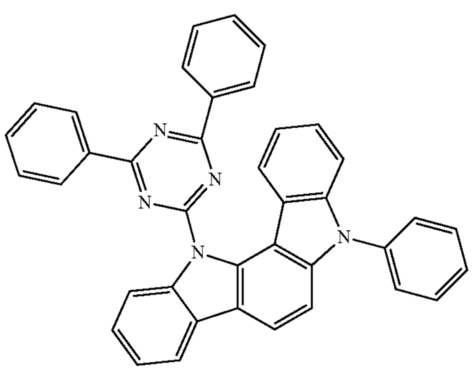
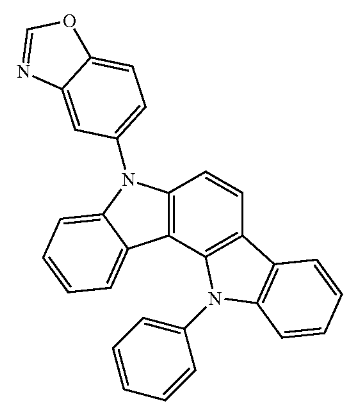
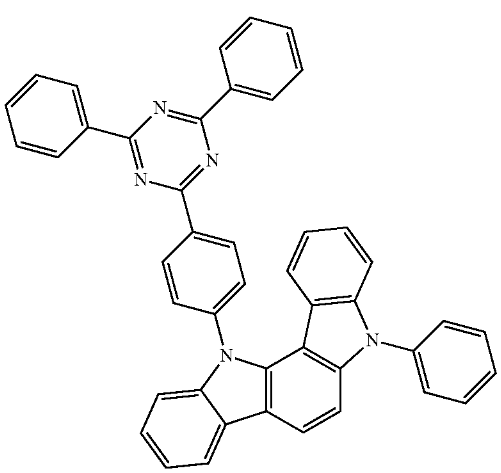
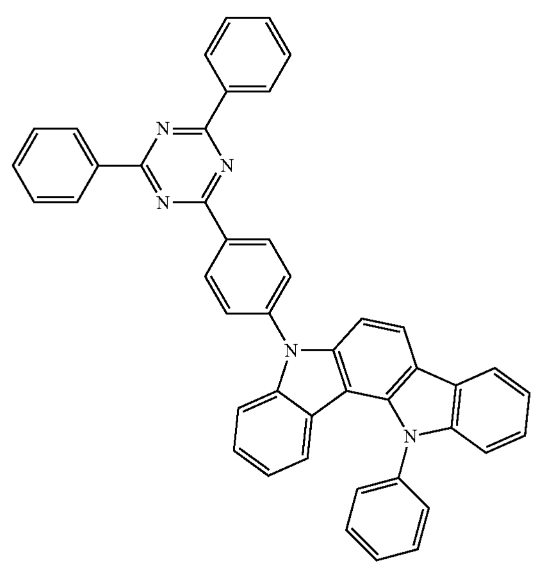

-continued
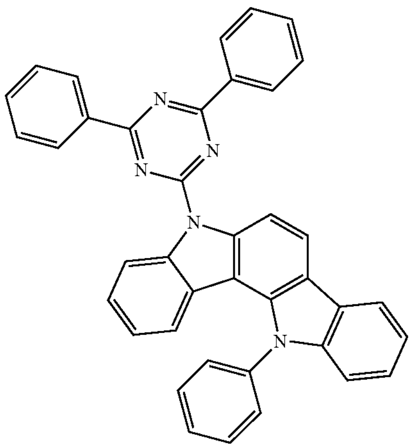
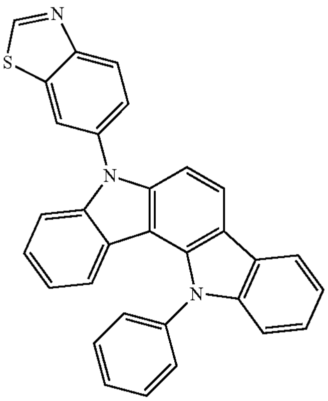
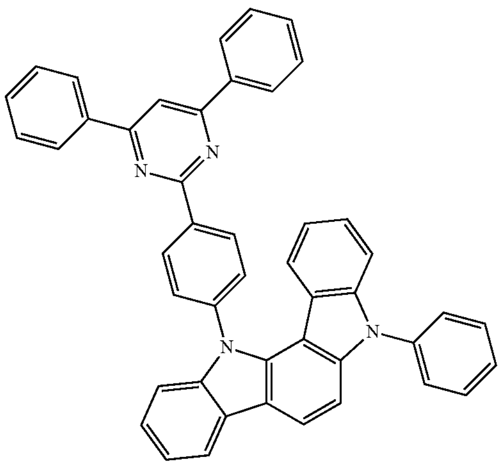
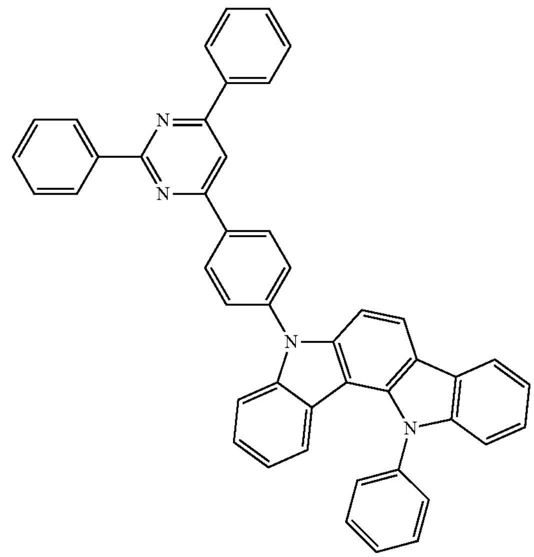
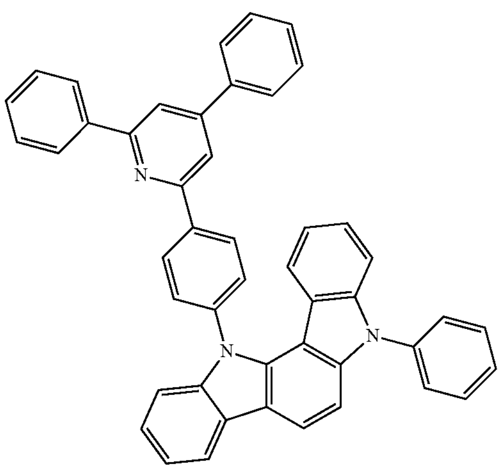
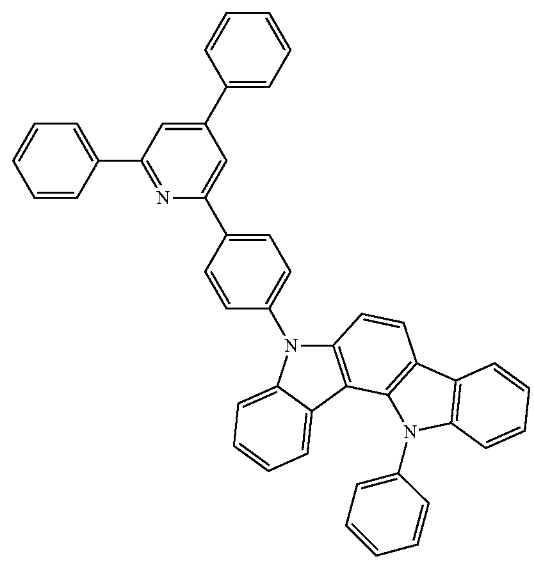

-continued
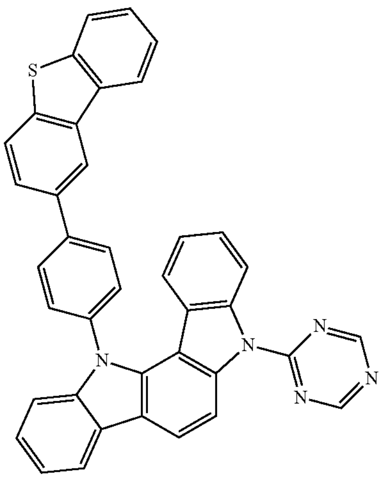
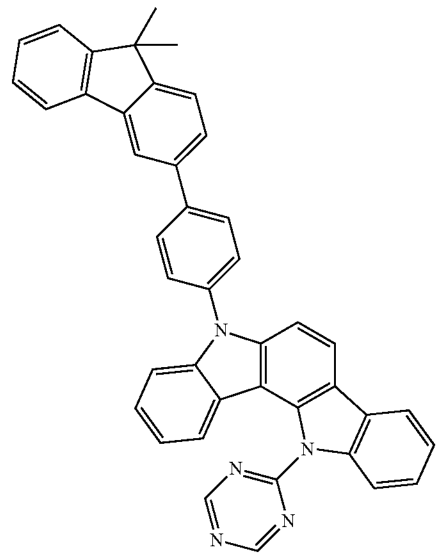
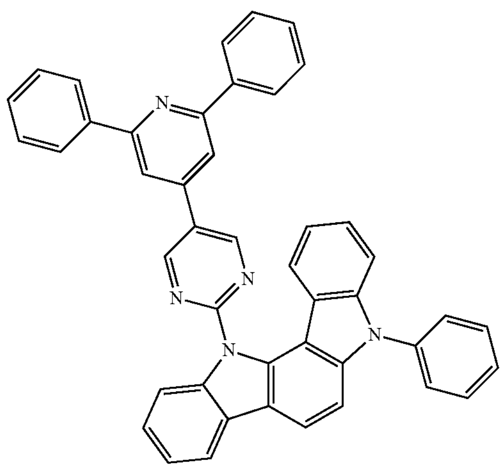
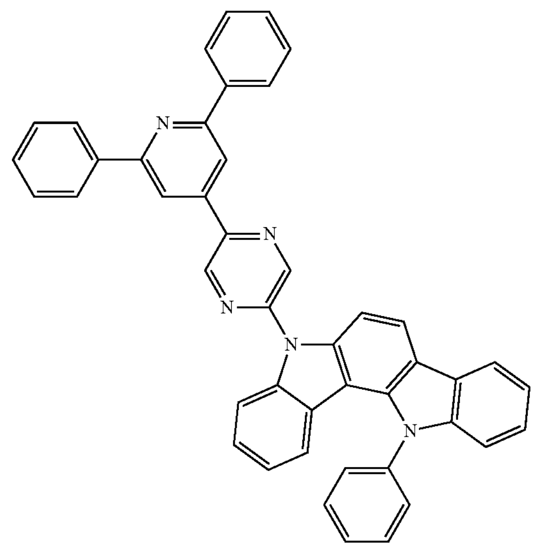
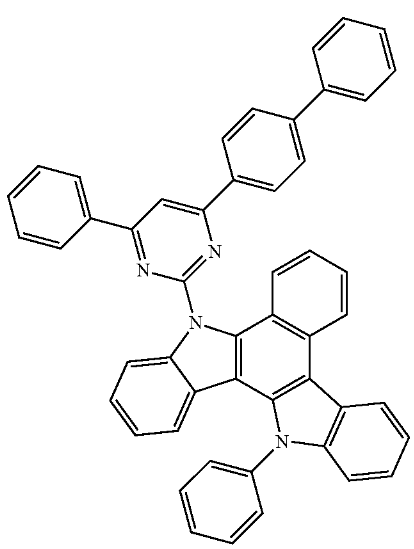
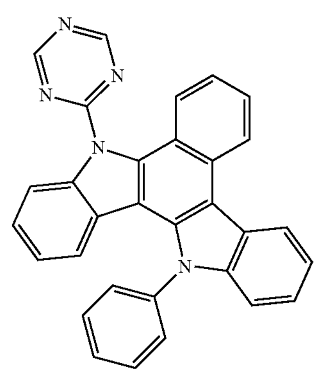

-continued
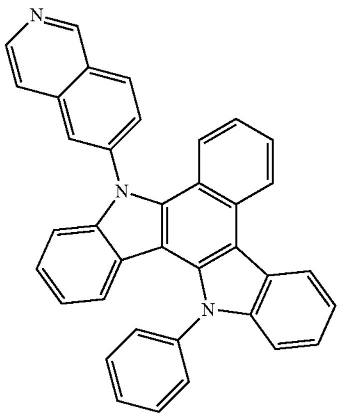
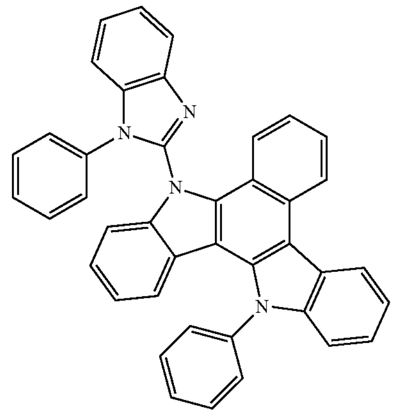
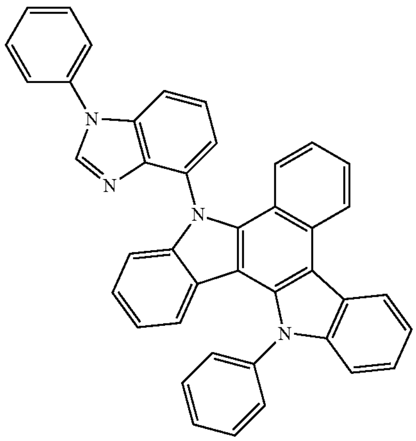
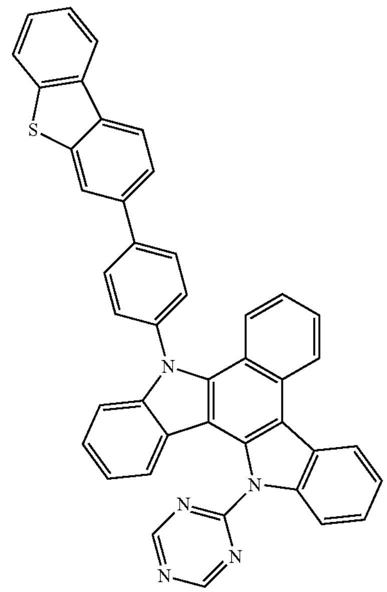
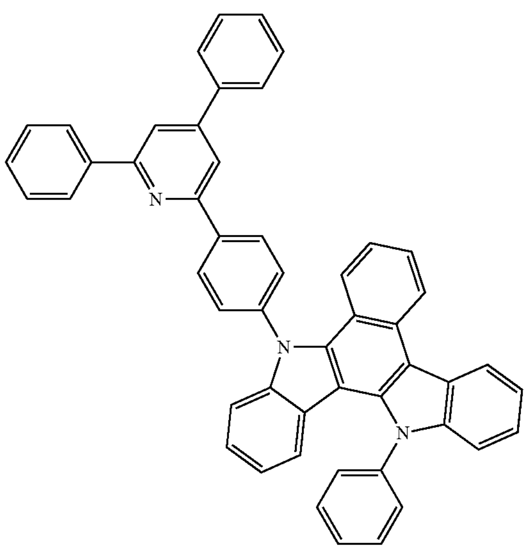
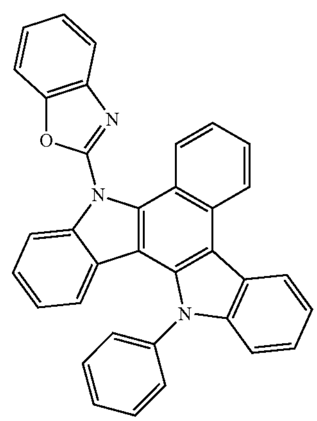

-continued
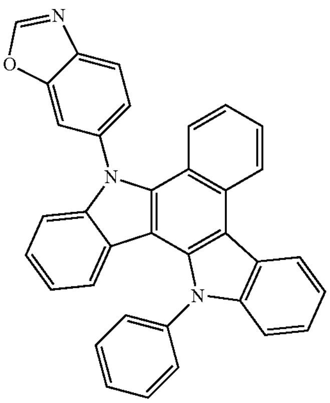
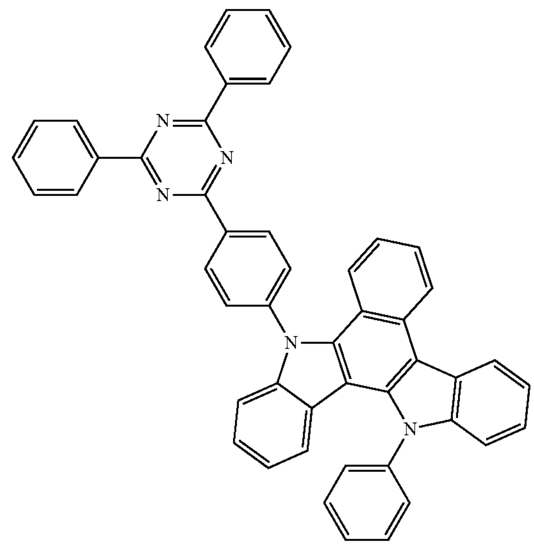
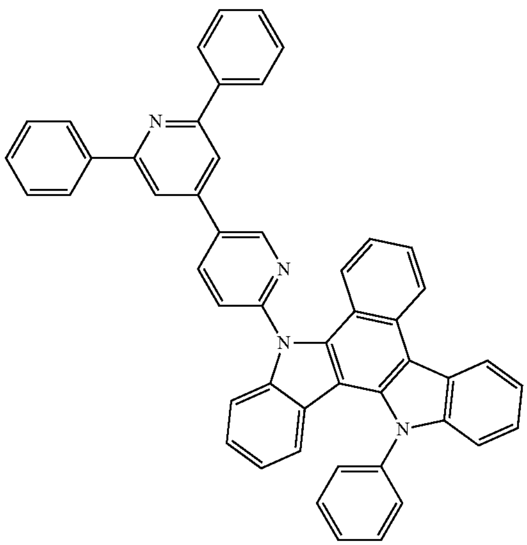
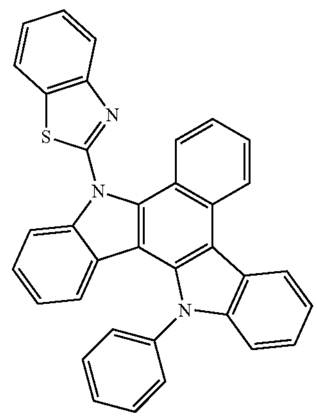
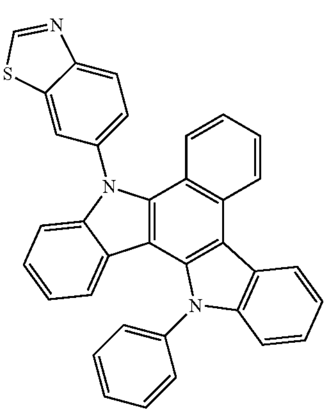
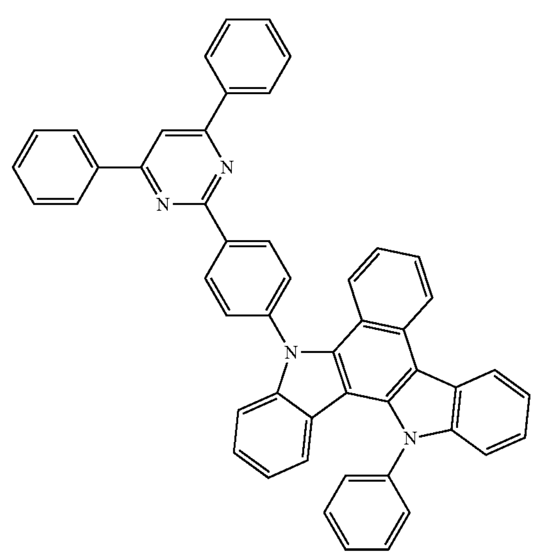

-continued
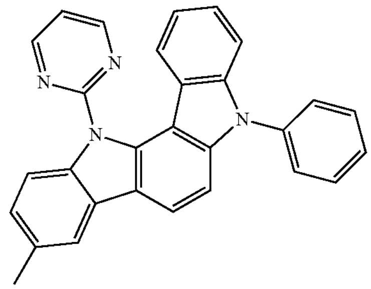
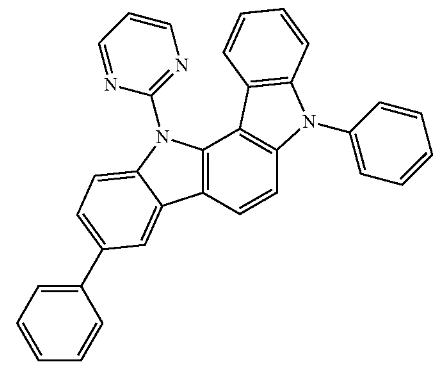
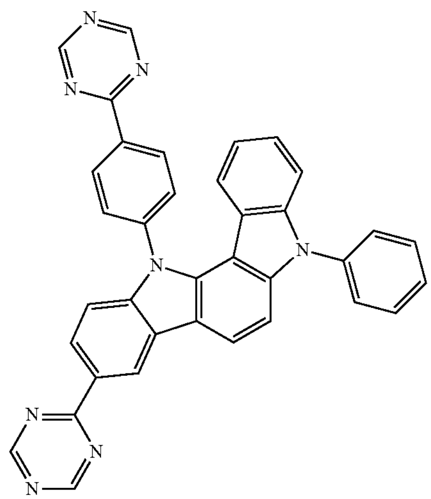
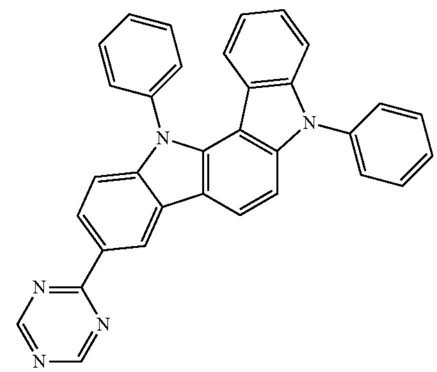
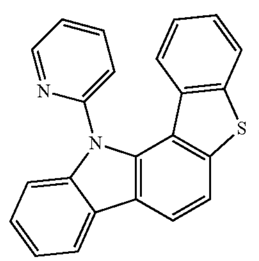
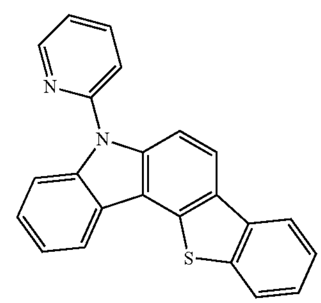
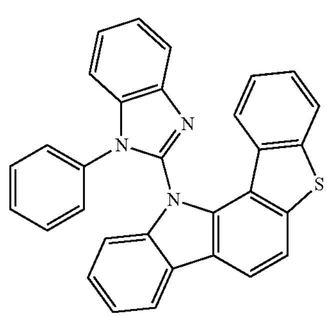
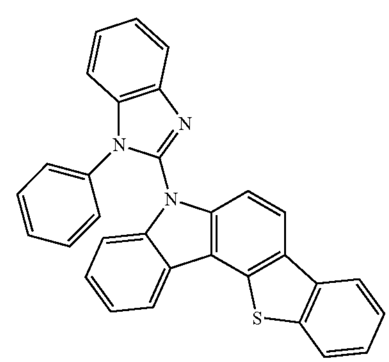

-continued
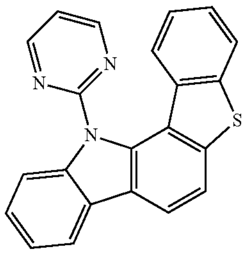
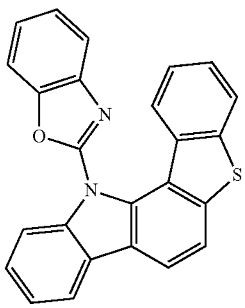
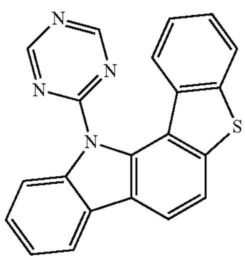
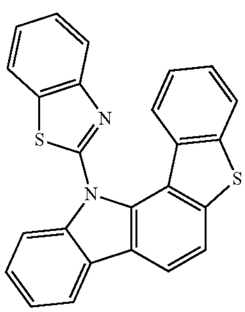
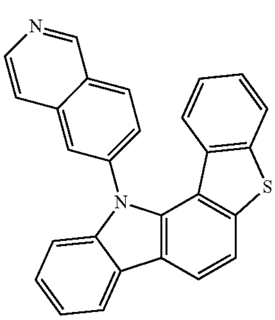
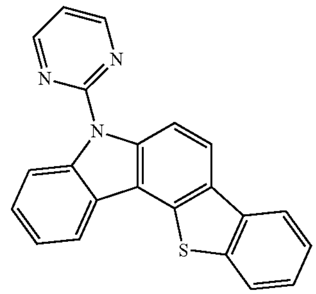
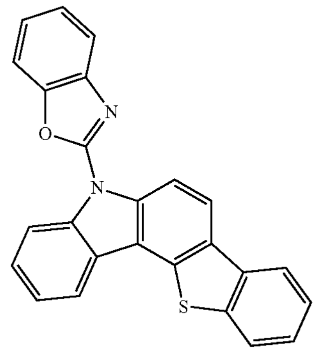
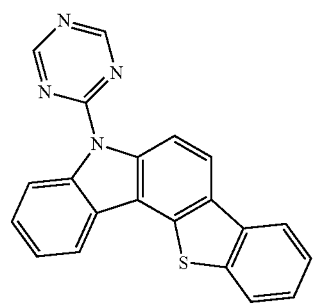
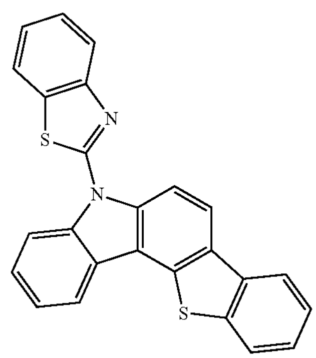
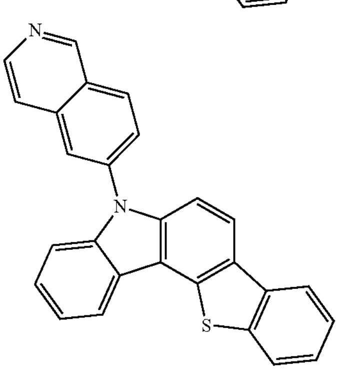

-continued
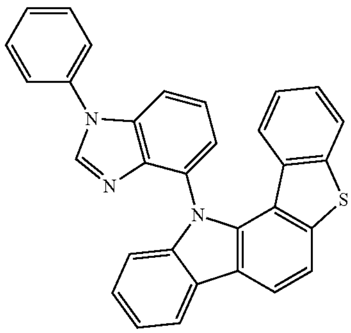
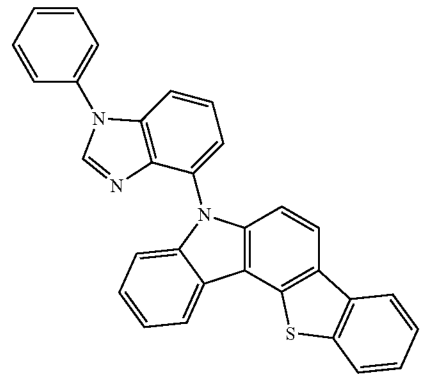
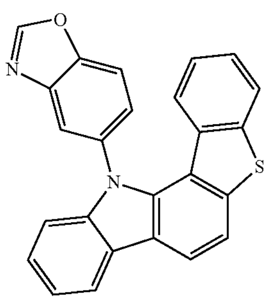
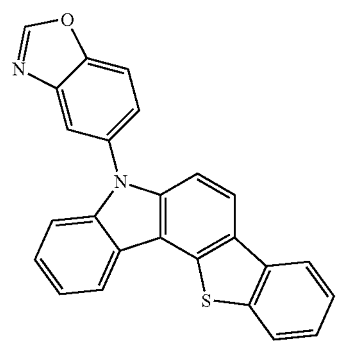
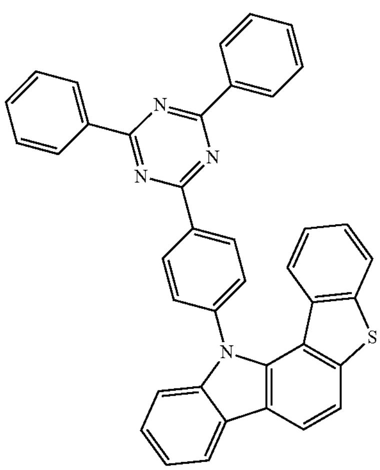
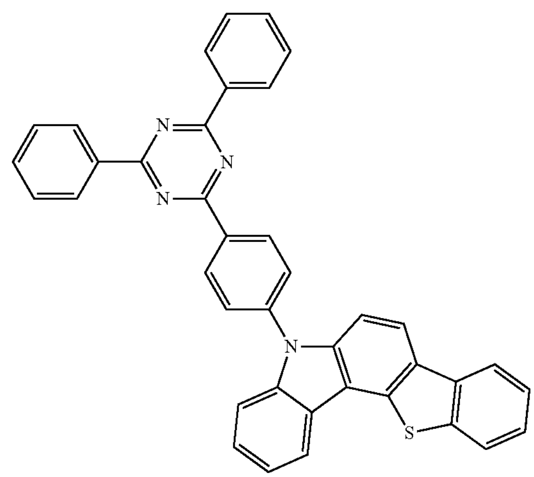
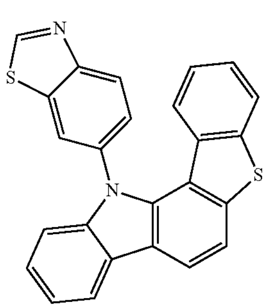
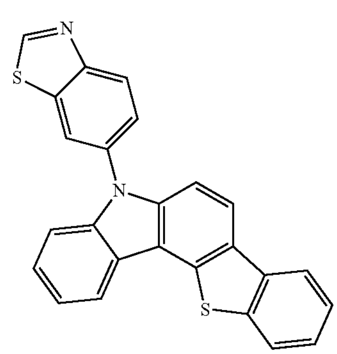

-continued
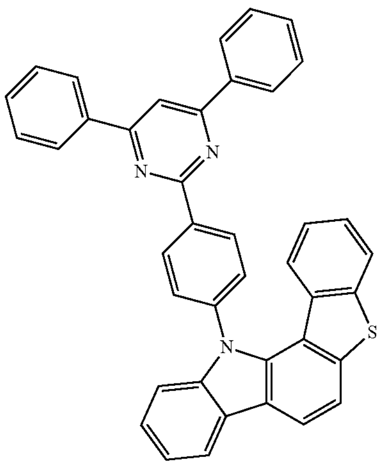
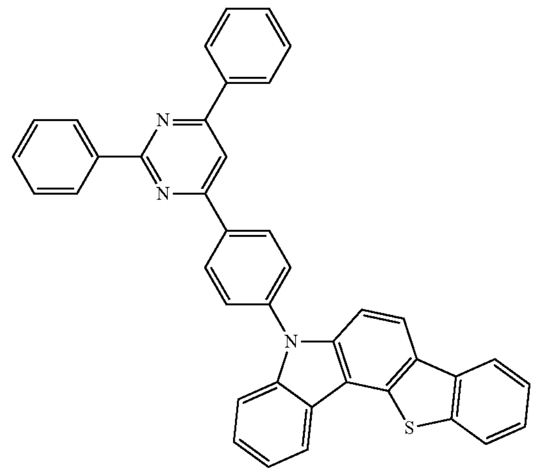
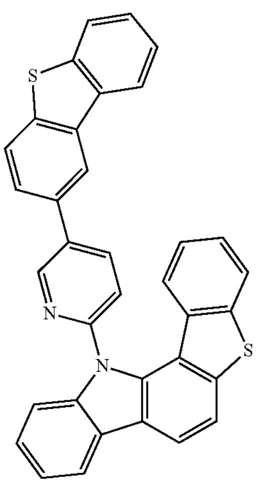
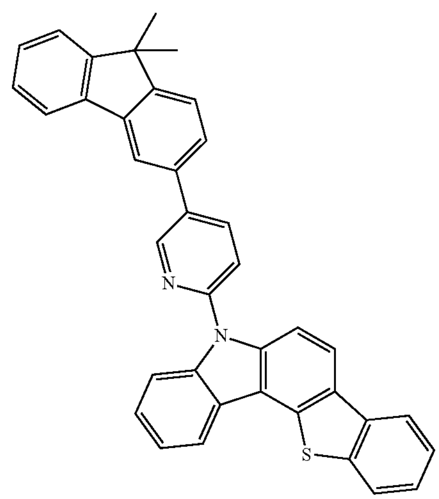
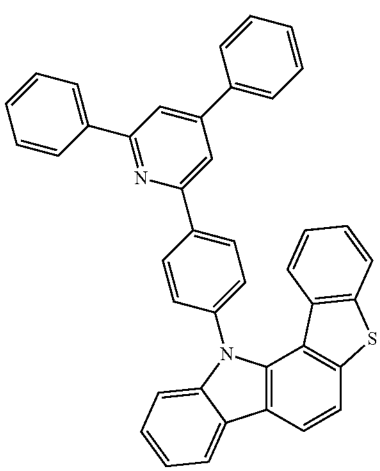
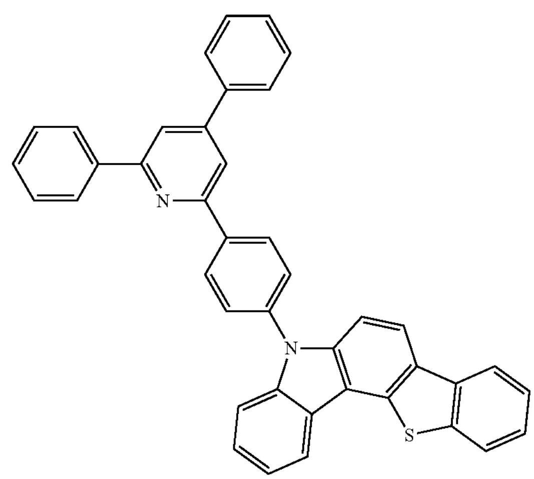

-continued
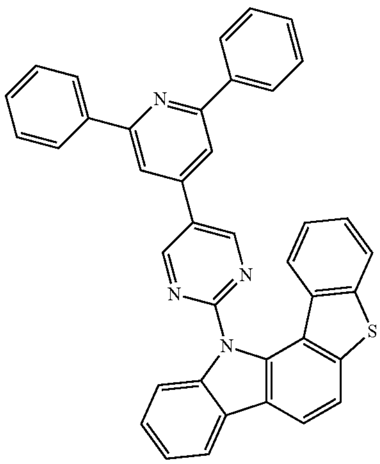
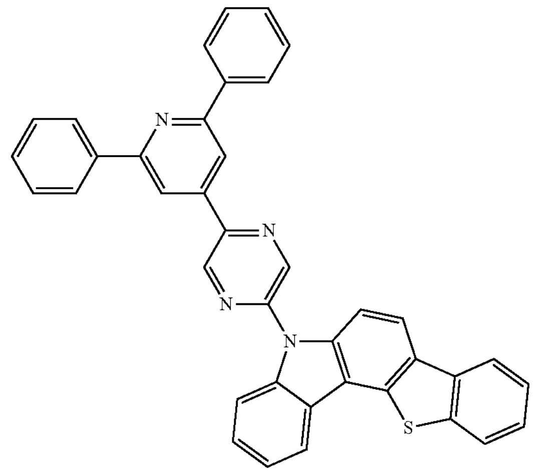
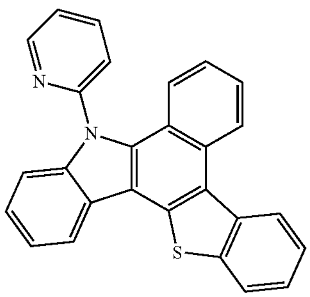
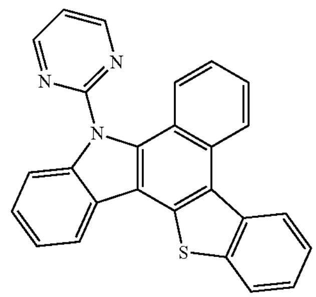
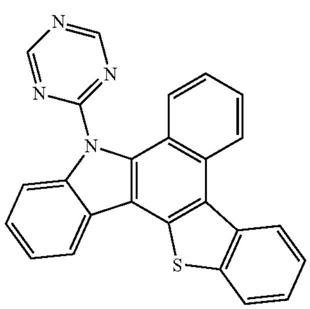
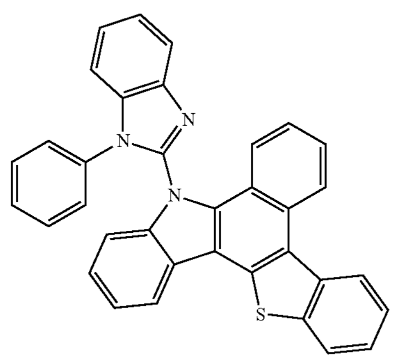
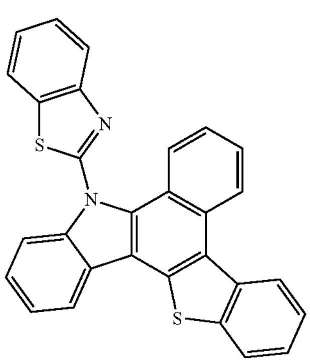
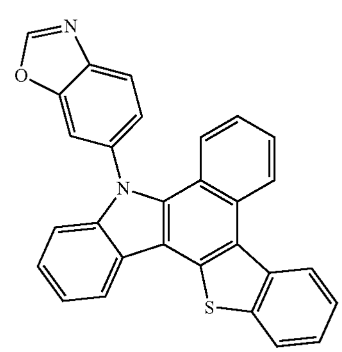

-continued
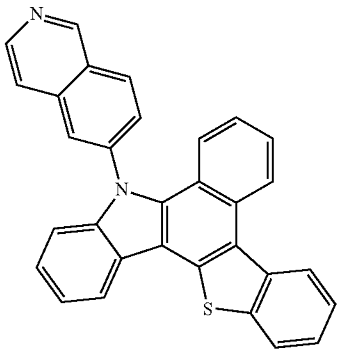
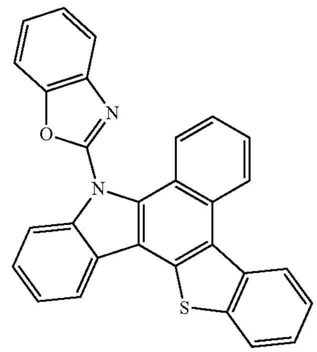
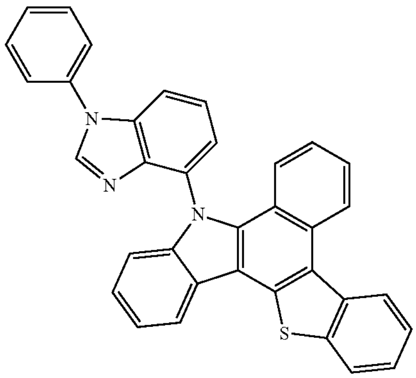
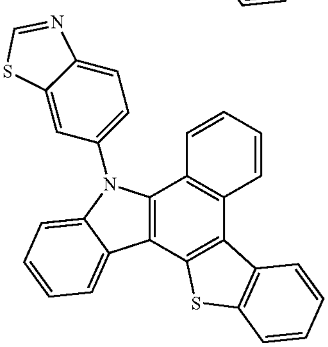
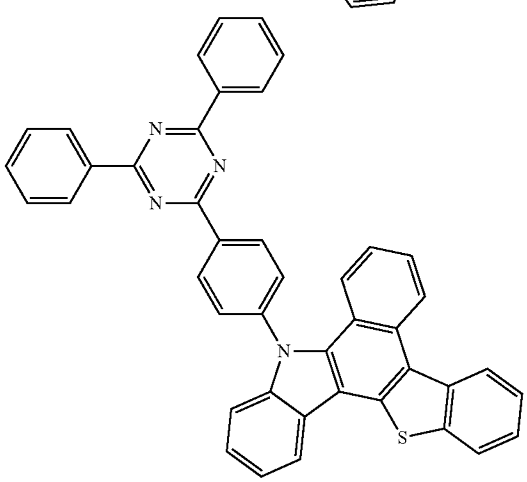
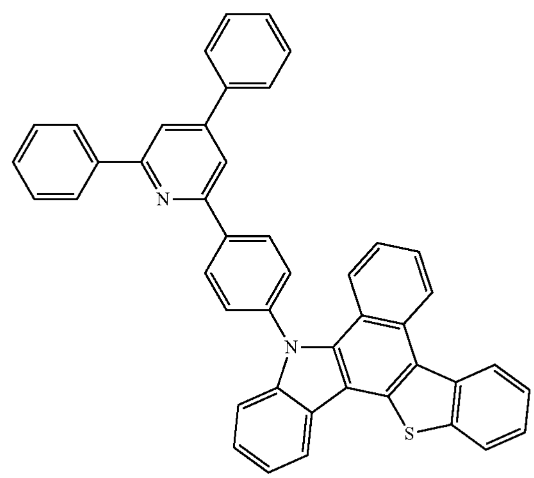
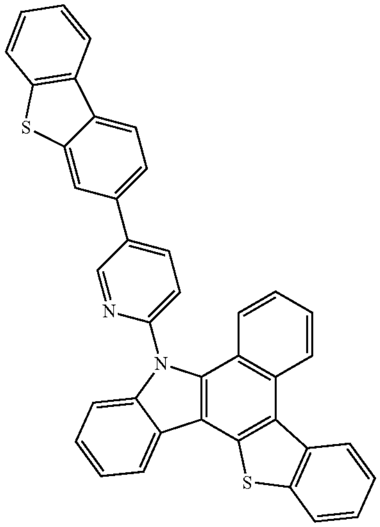
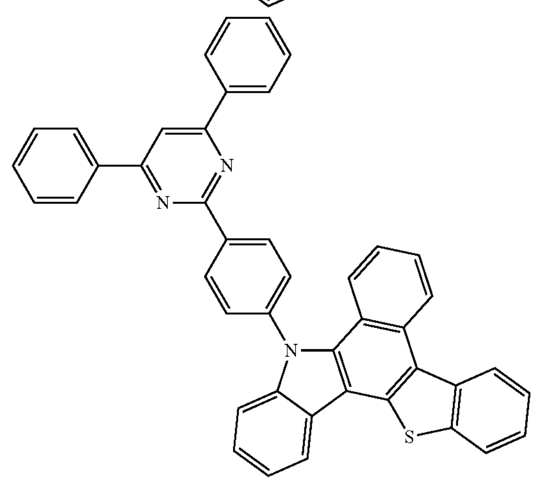

-continued
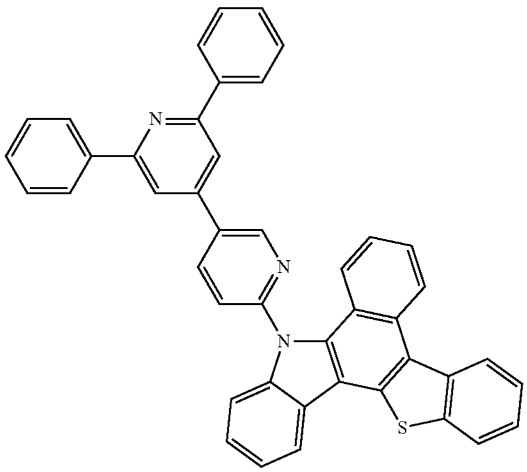
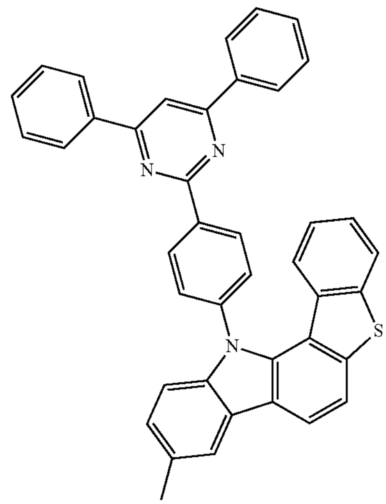
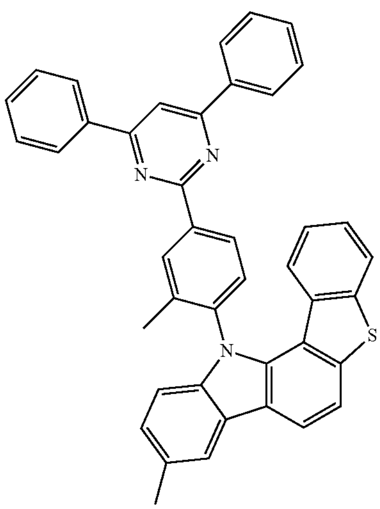
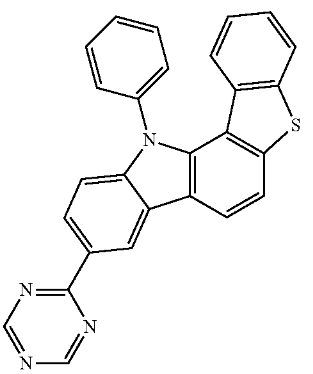
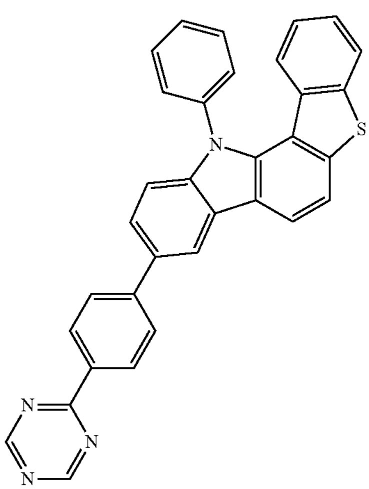
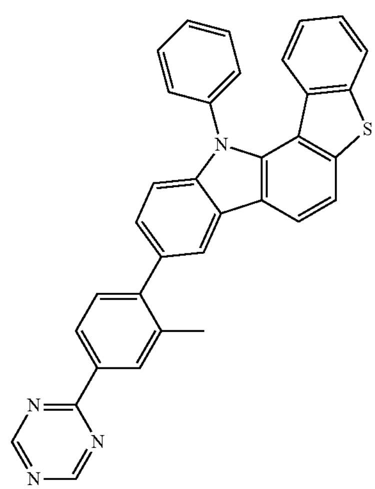

-continued
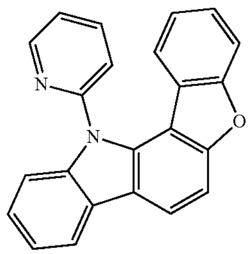
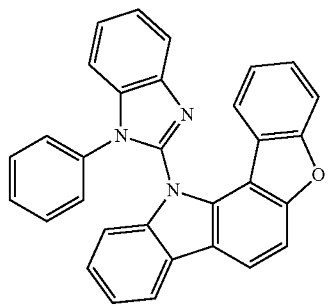
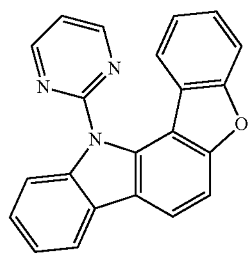
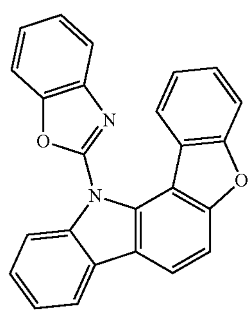
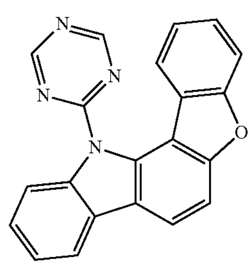
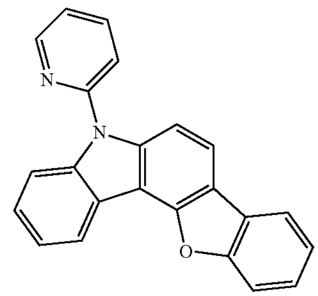
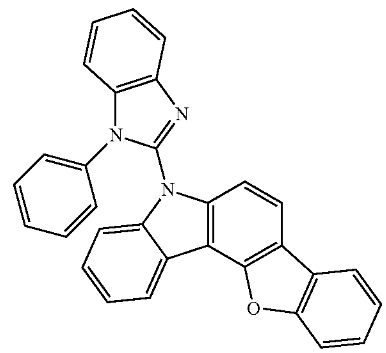
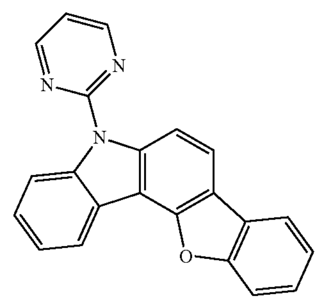
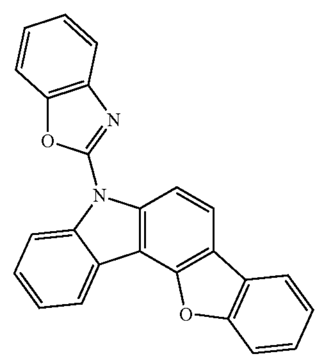
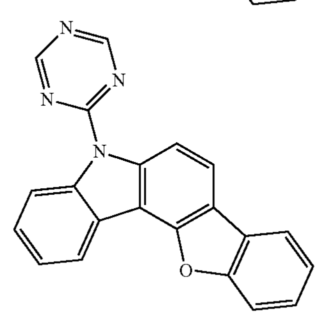

-continued
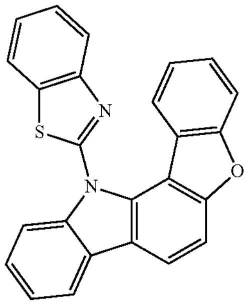
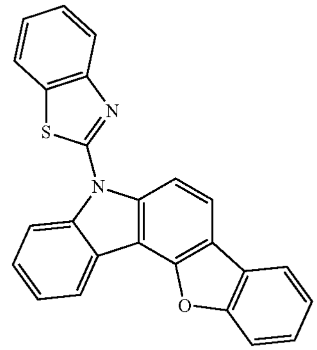
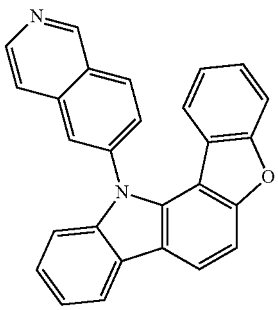
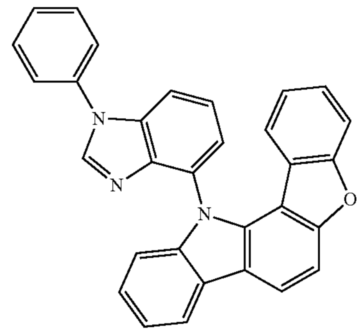
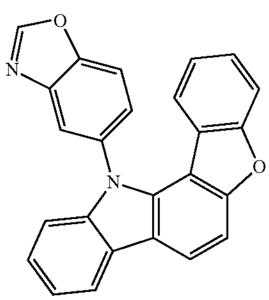
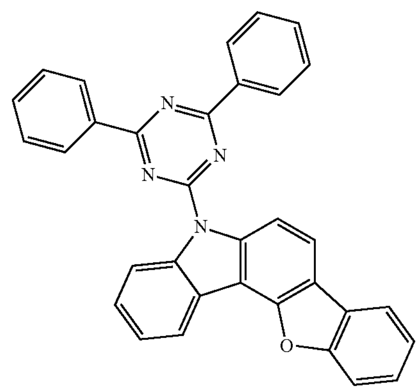
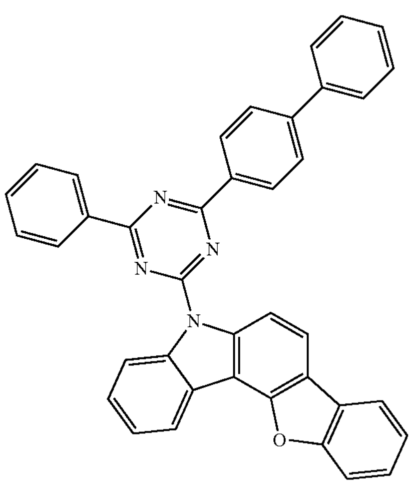
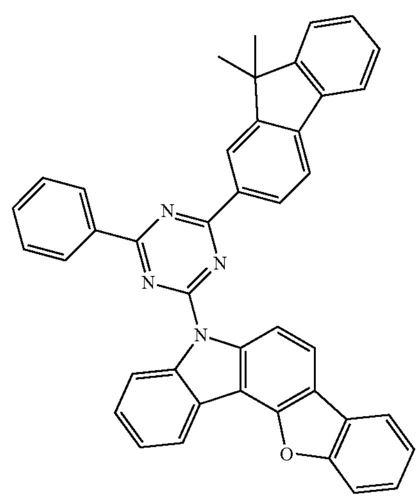

-continued
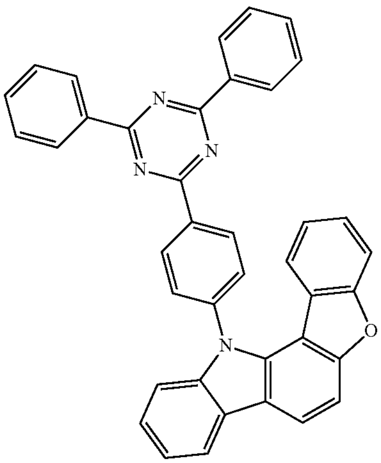
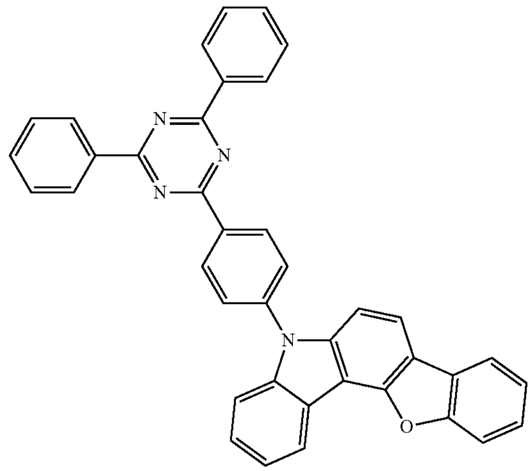
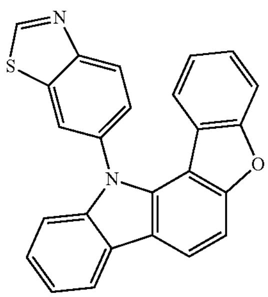
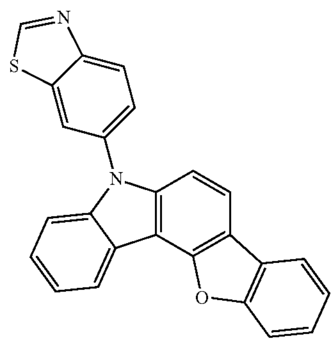
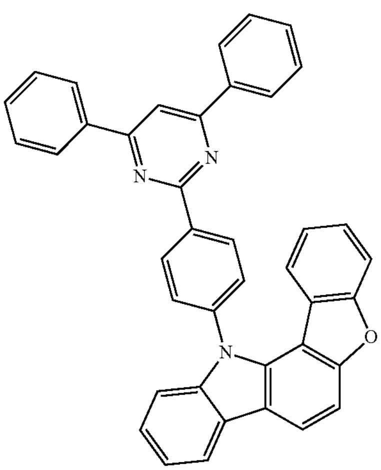
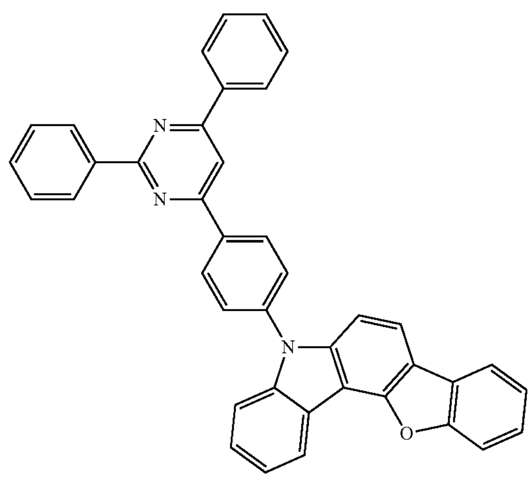
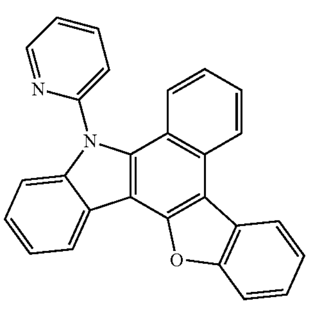
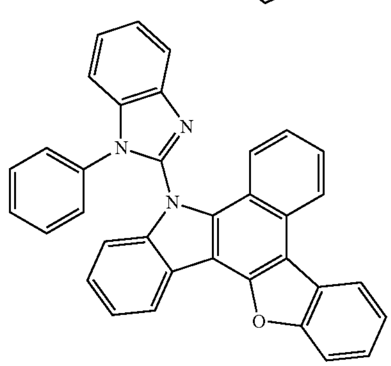

-continued
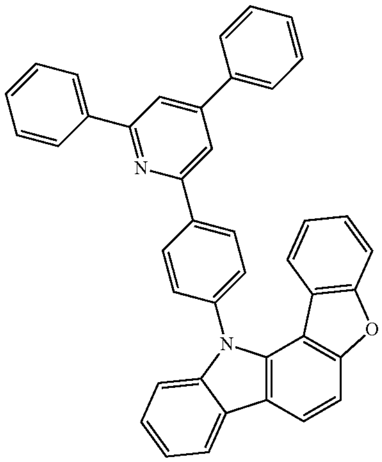
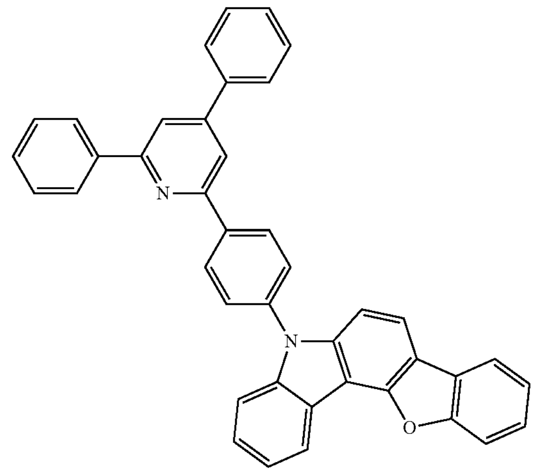
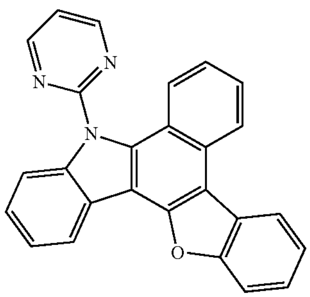
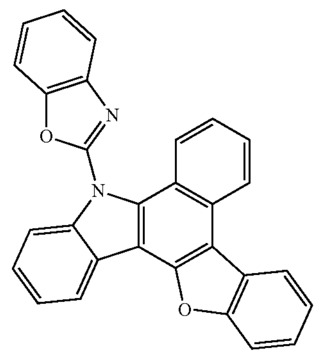
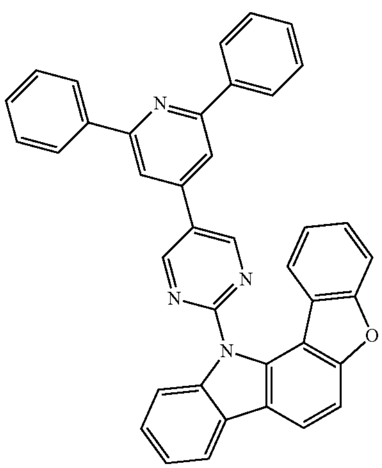
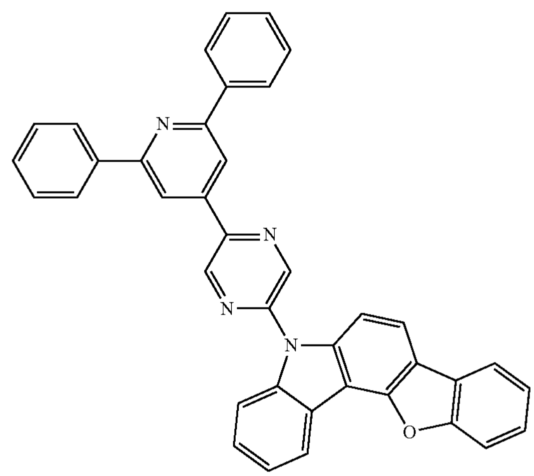
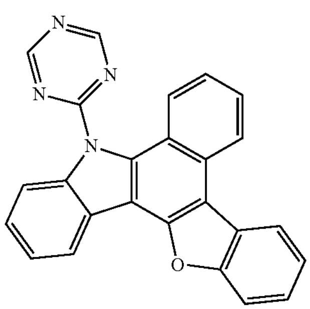
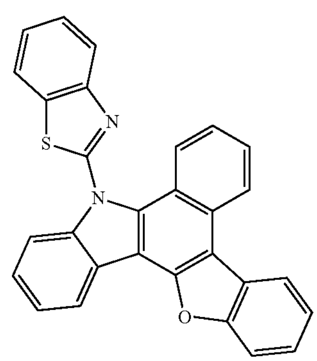

-continued
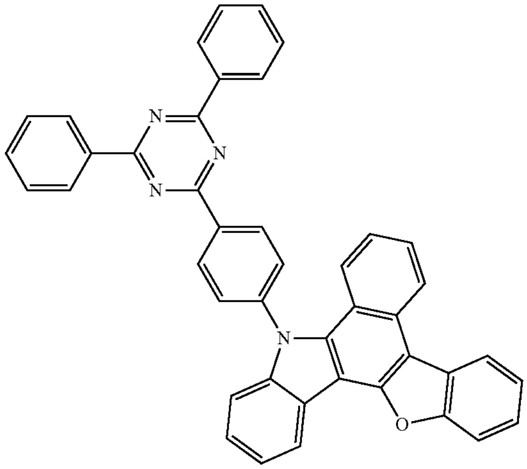
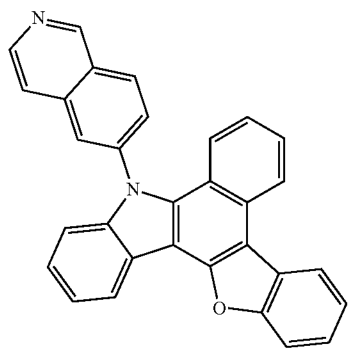
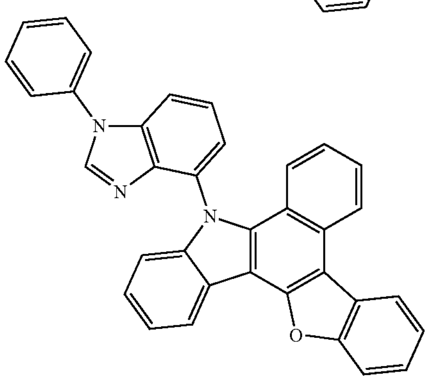
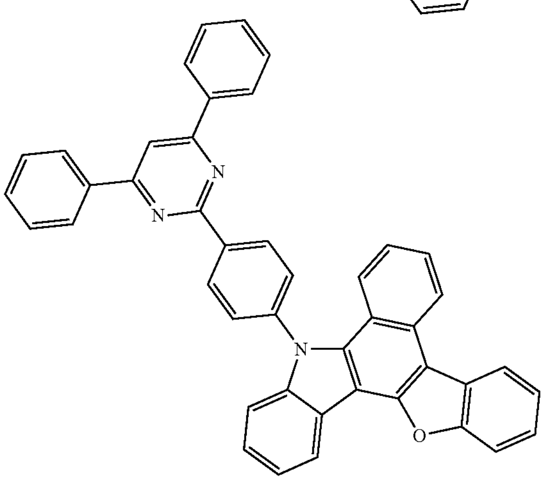
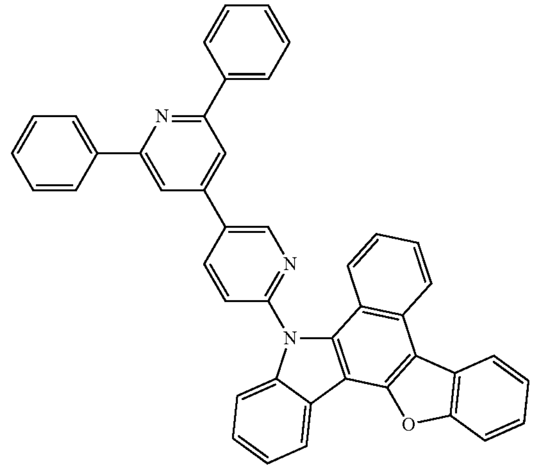
-continued
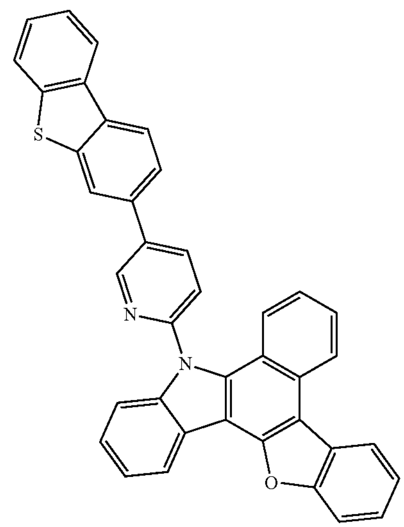
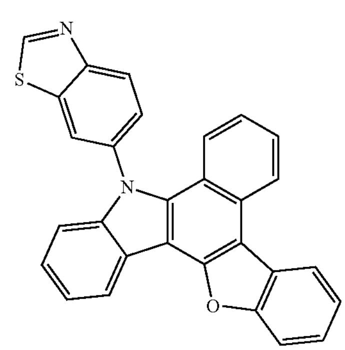

-continued
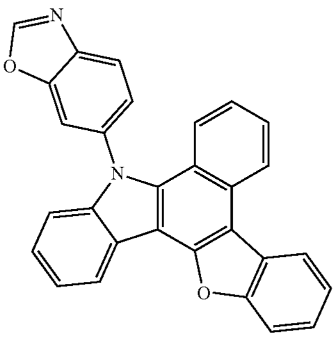
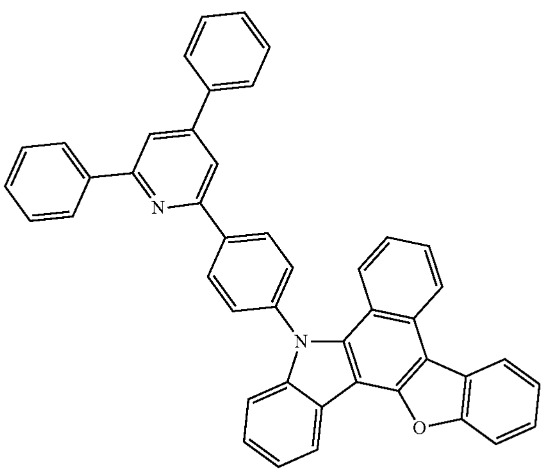
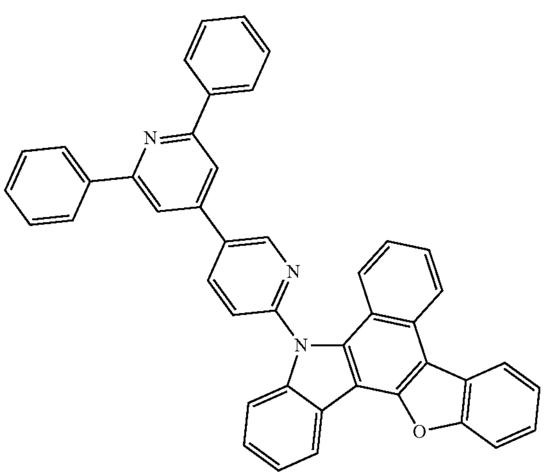
-continued
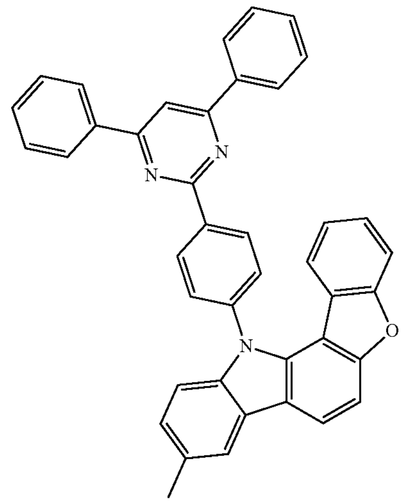
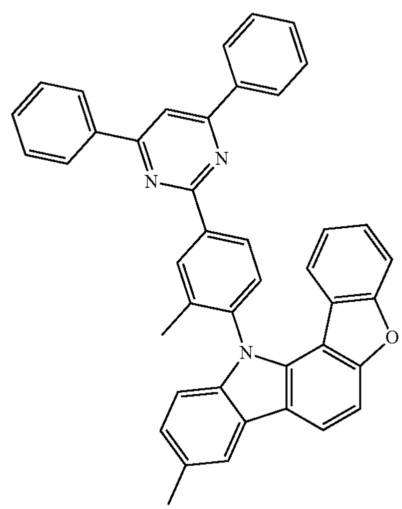
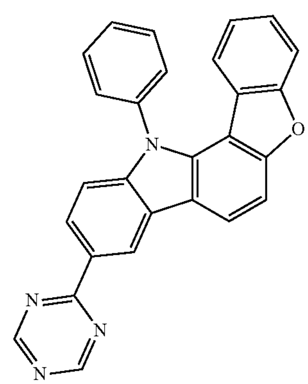

-continued
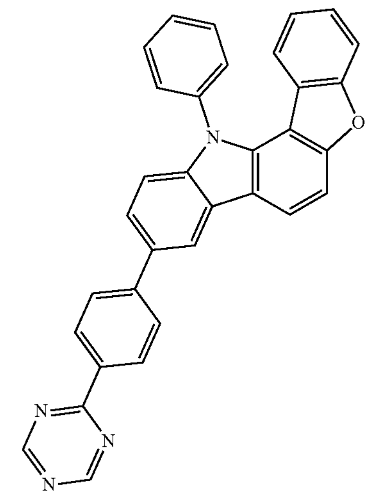
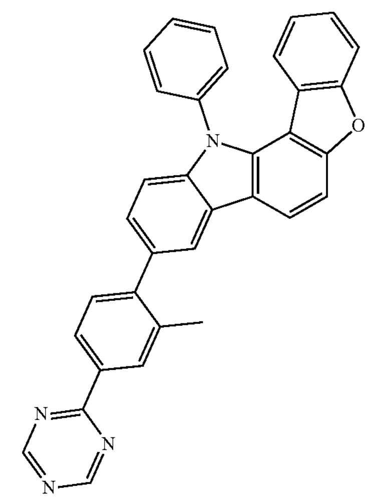
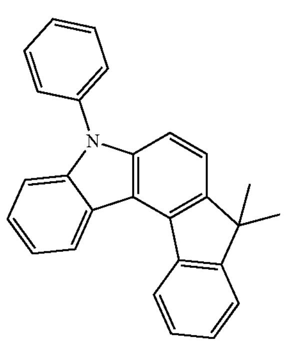
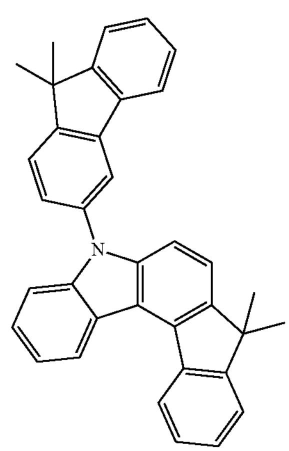
-continued
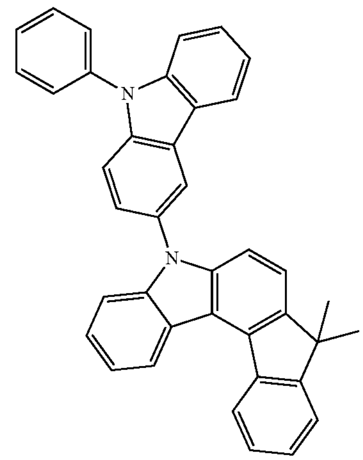
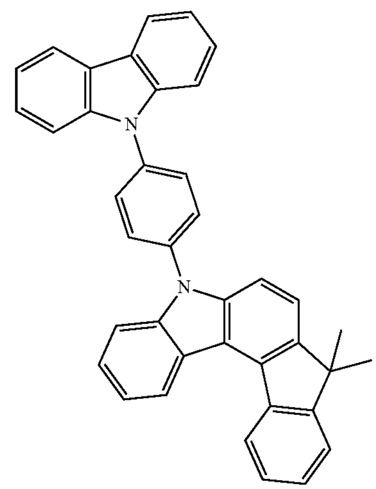
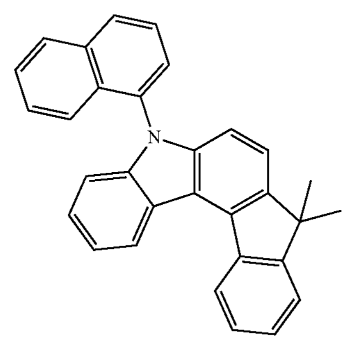
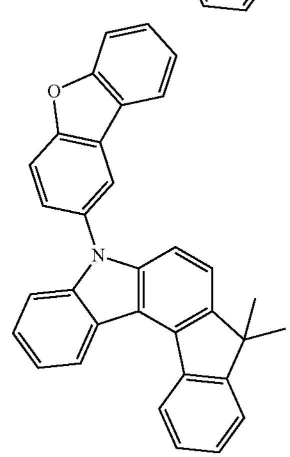

-continued
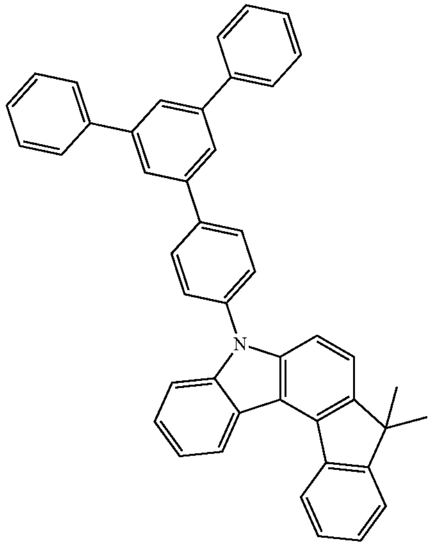
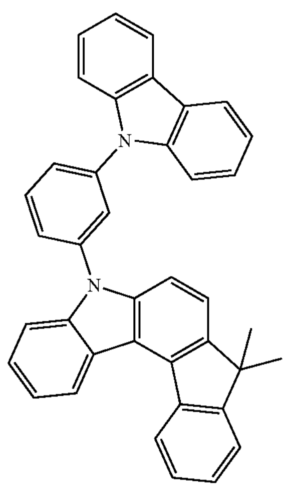
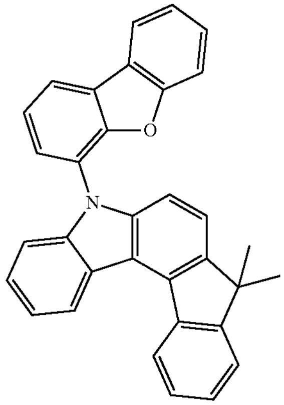
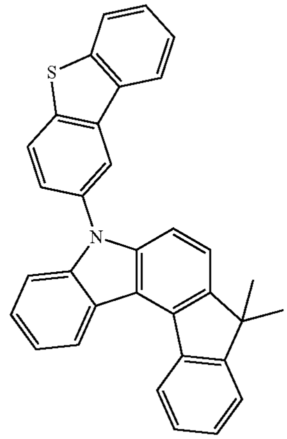
-continued
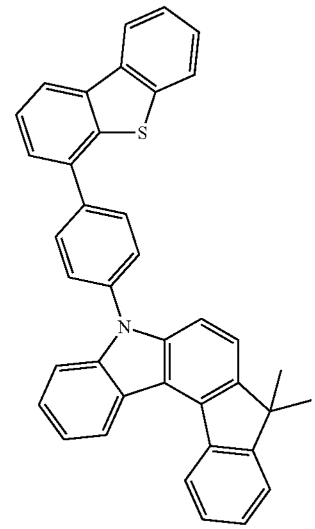
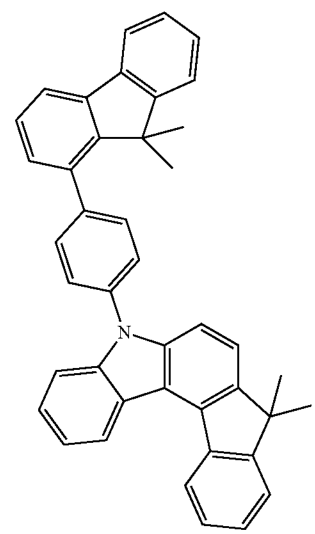
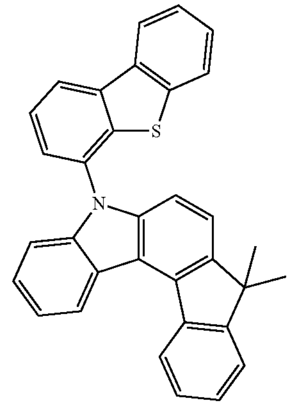
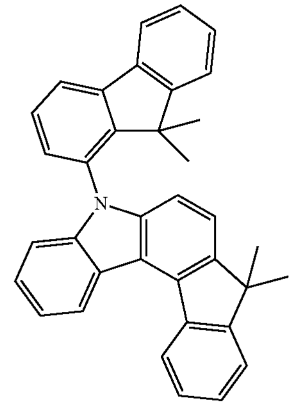

-continued
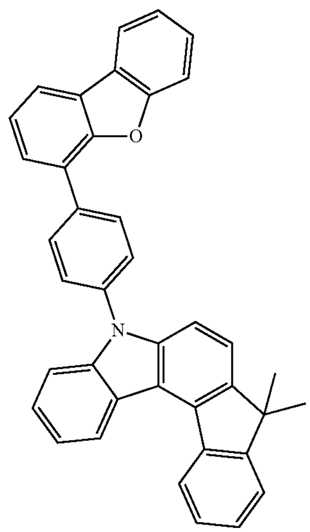
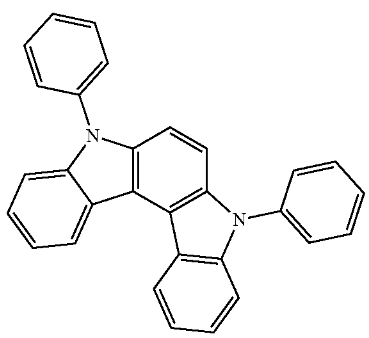
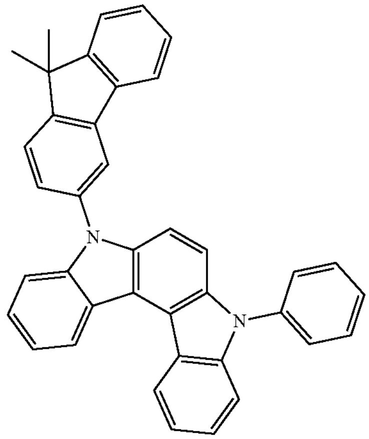
-continued
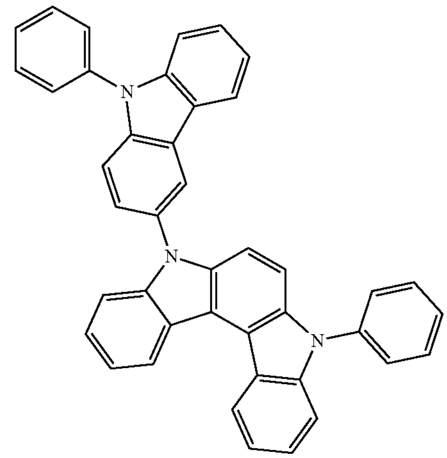
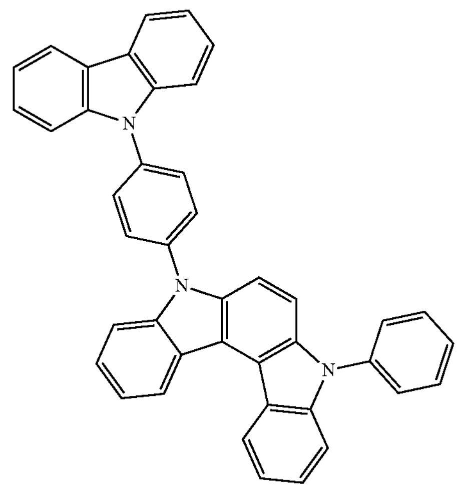
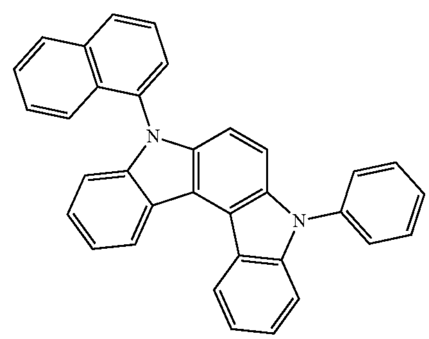
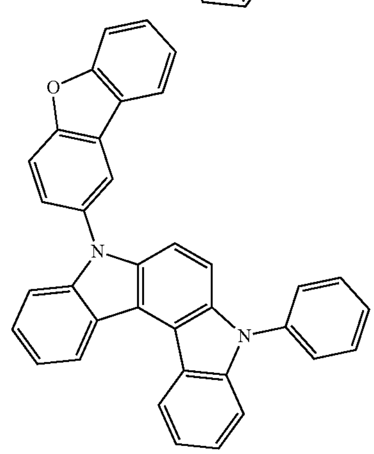

-continued
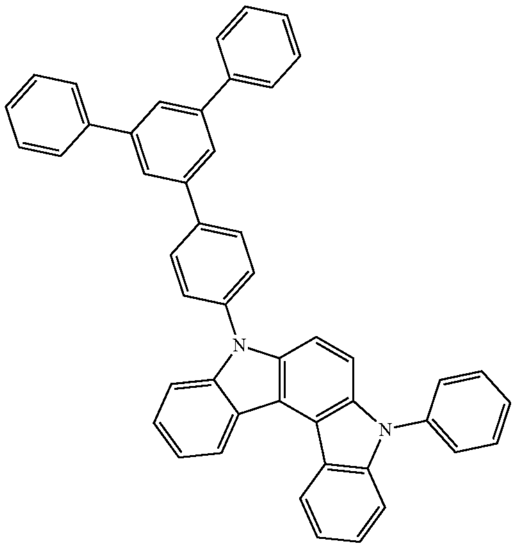
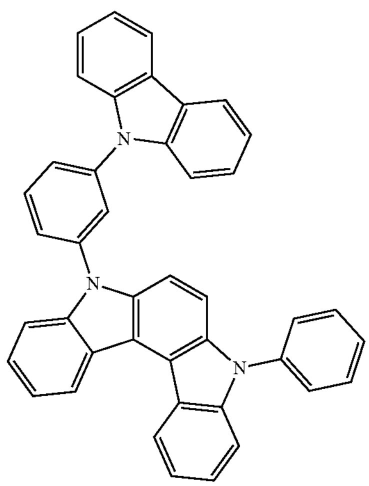
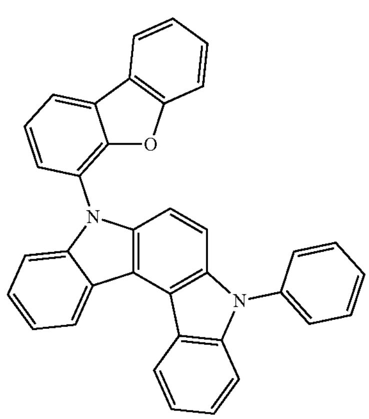
-continued
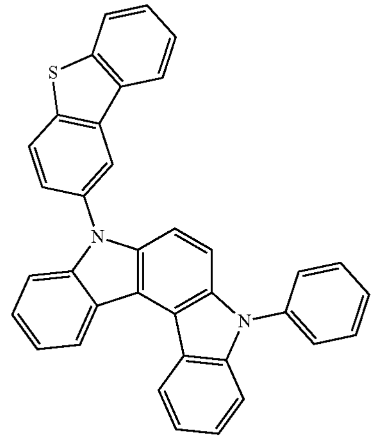
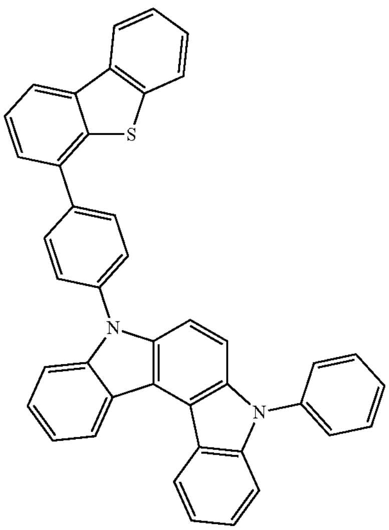
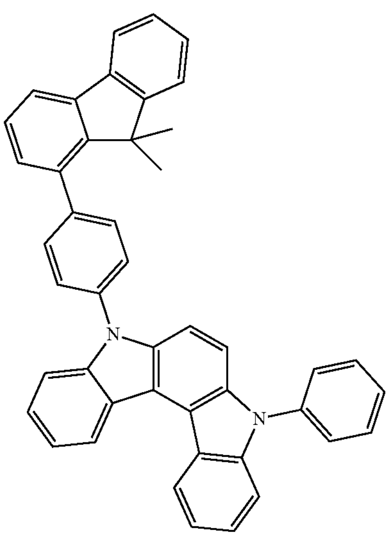

-continued
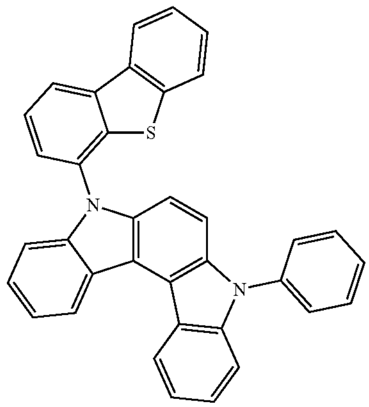
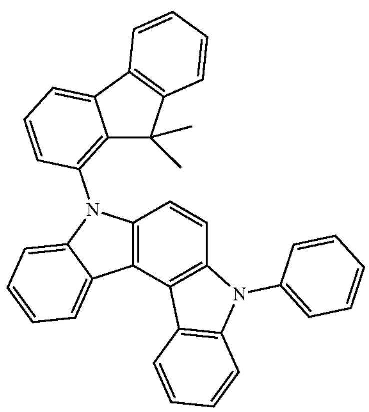
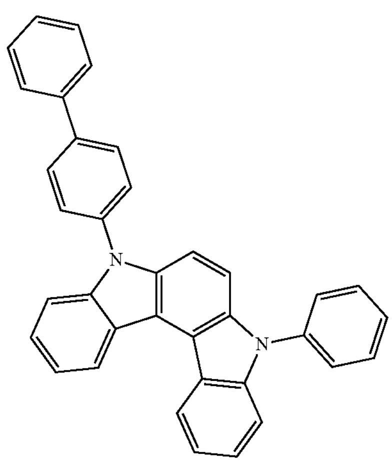
-continued
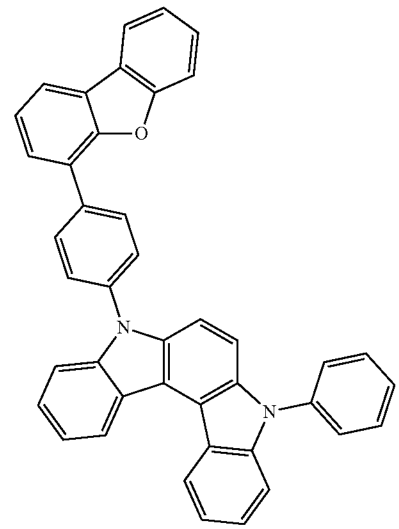
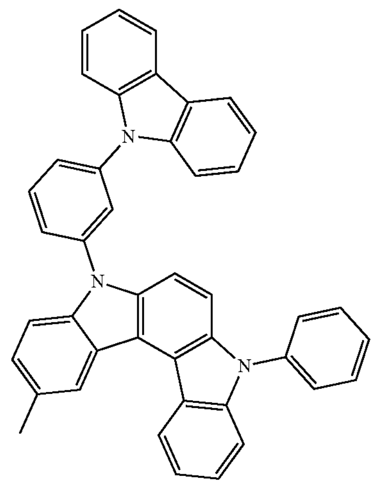
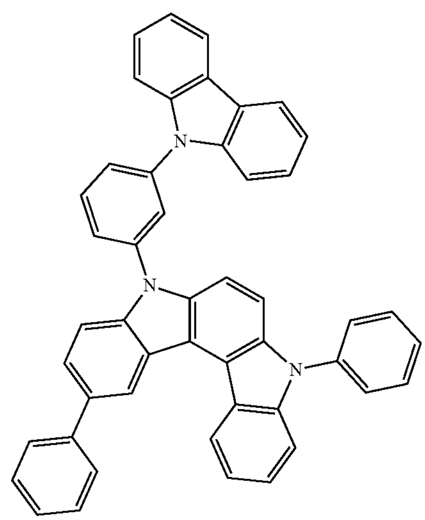

-continued
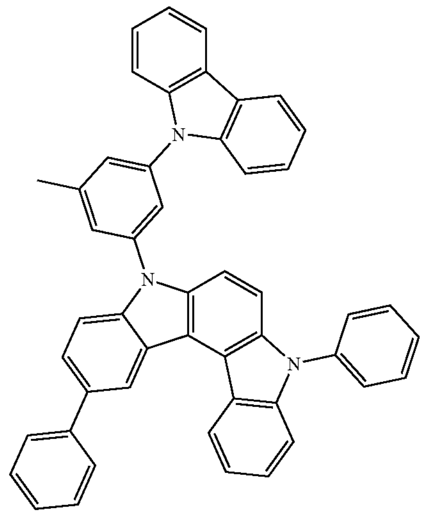
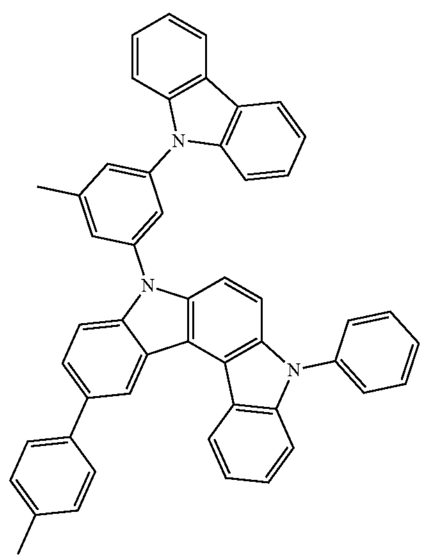
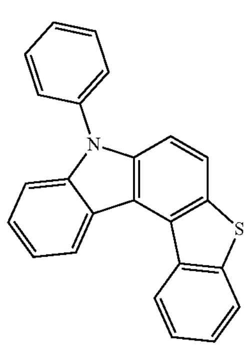
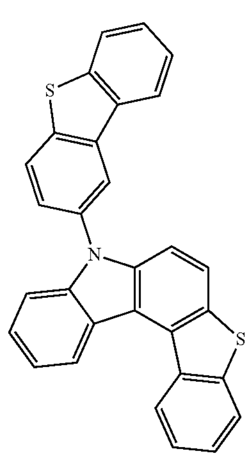
-continued
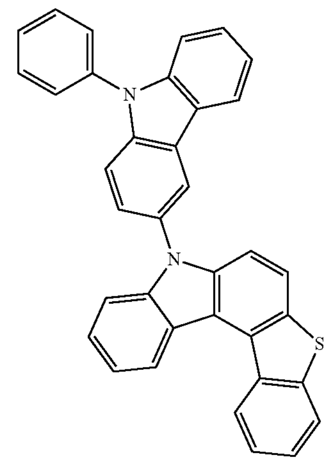
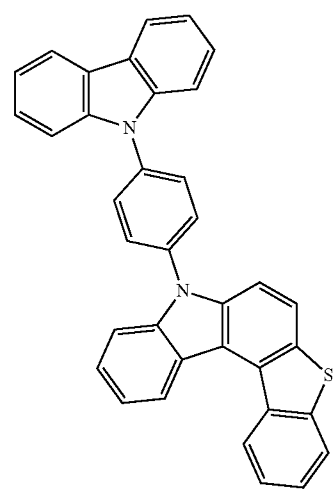
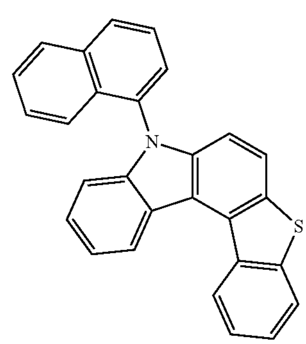
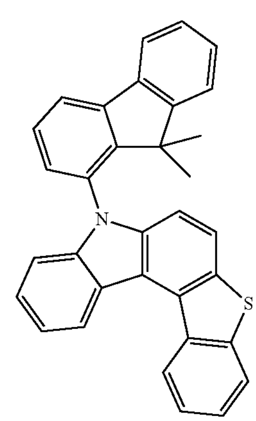

-continued
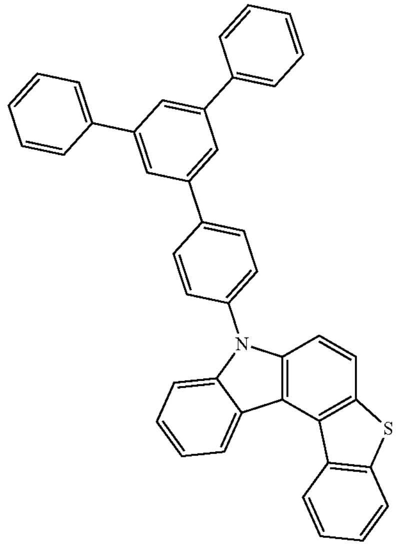
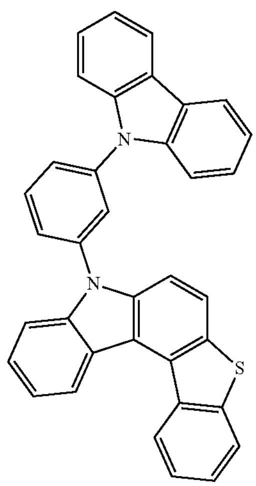
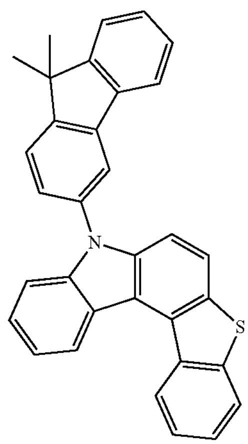
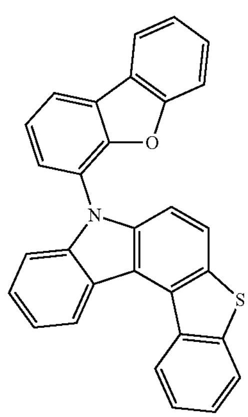
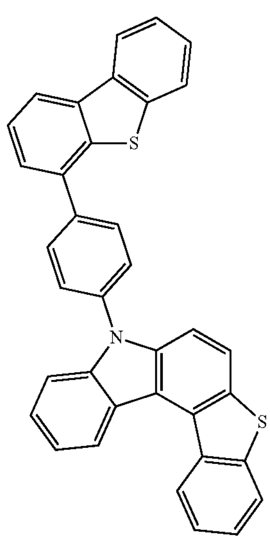
-continued
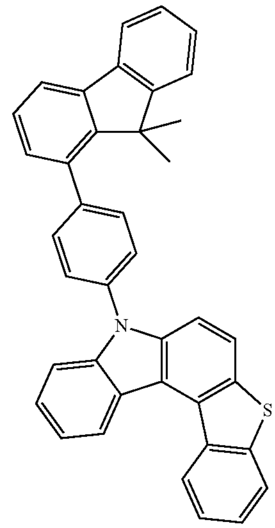
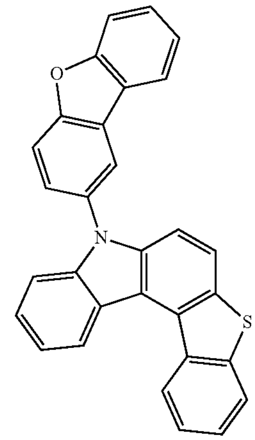
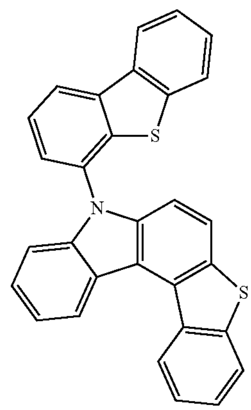
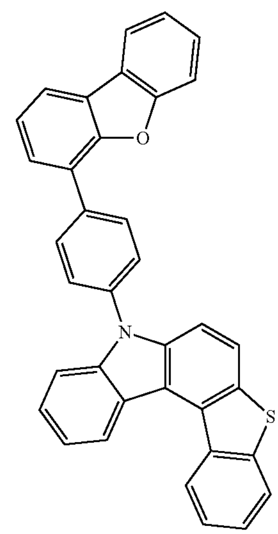
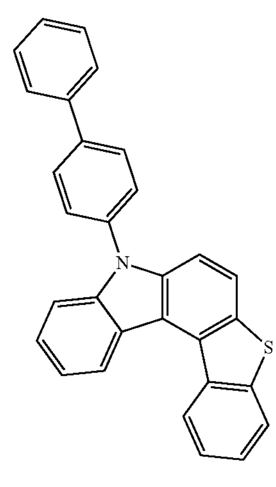
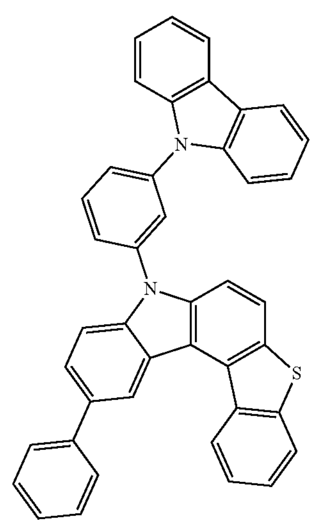

-continued
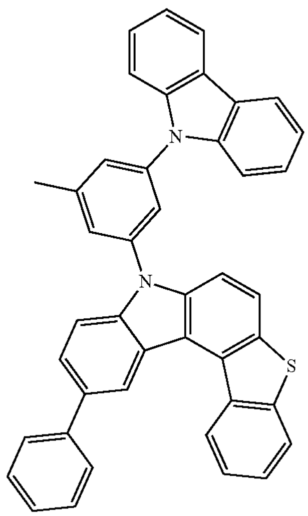
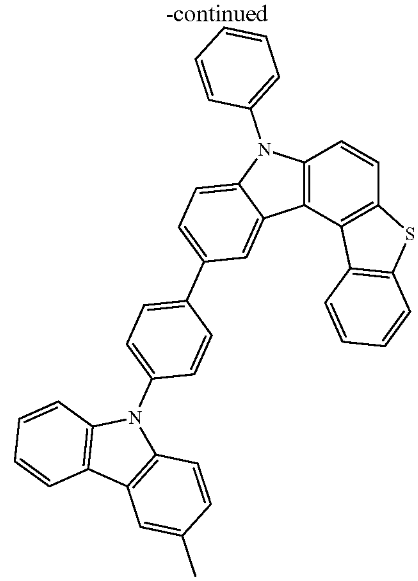
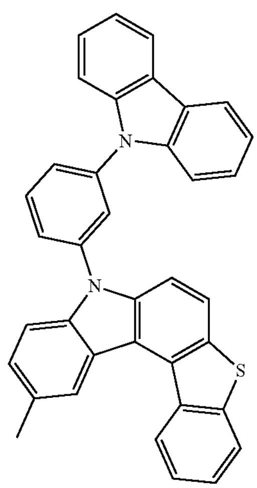
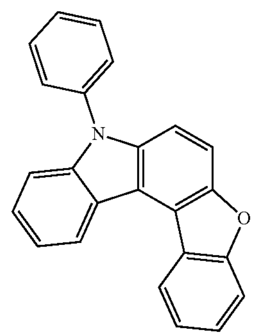
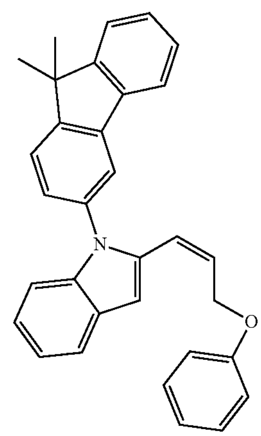
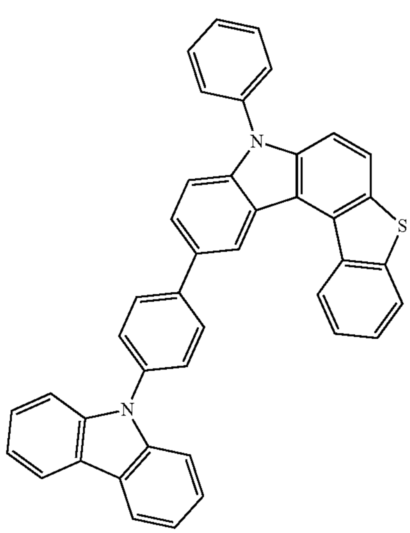
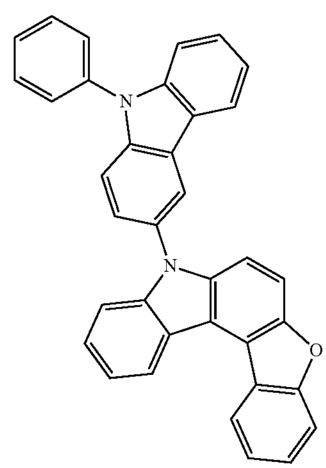

-continued
-continued
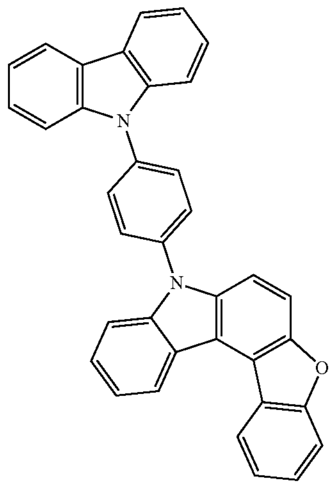
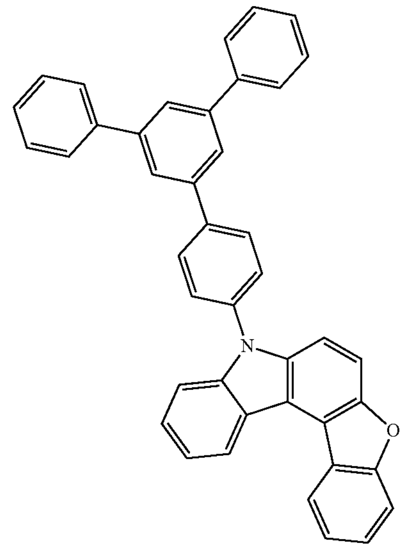
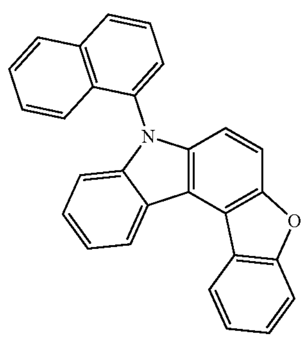
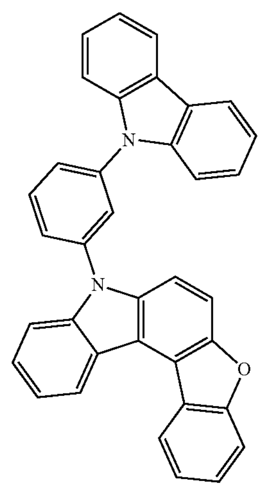
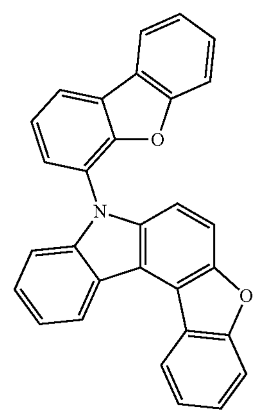
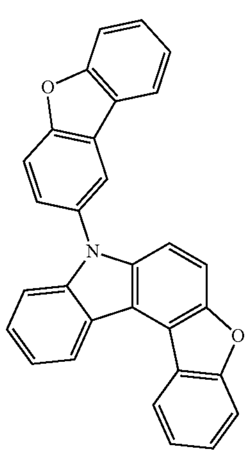
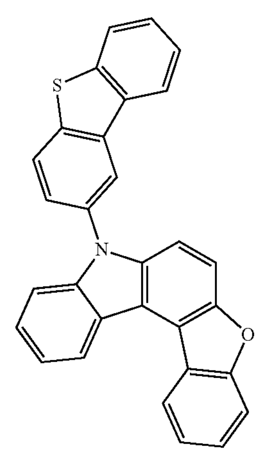

-continued
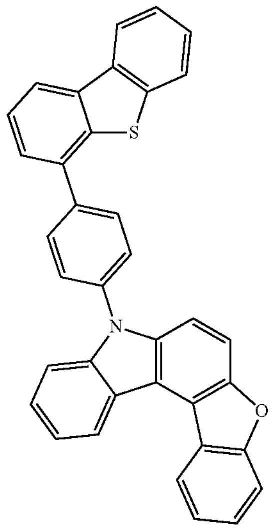
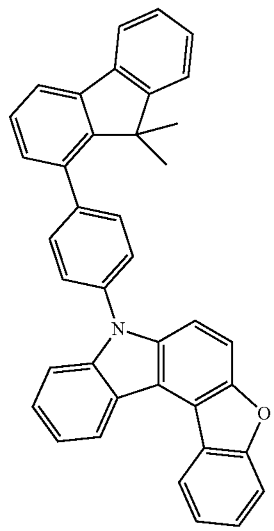
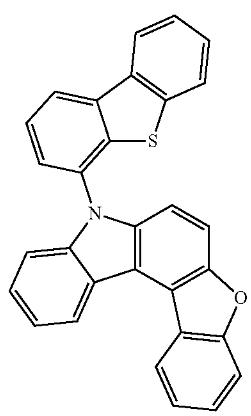
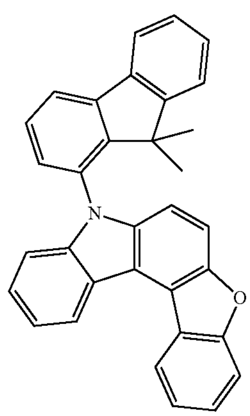
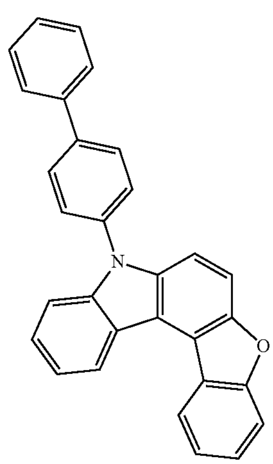
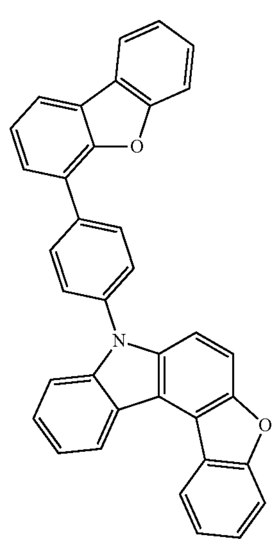
-continued
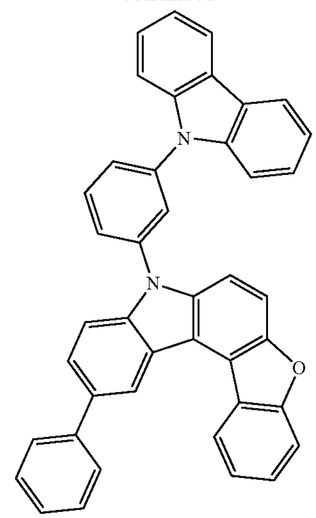
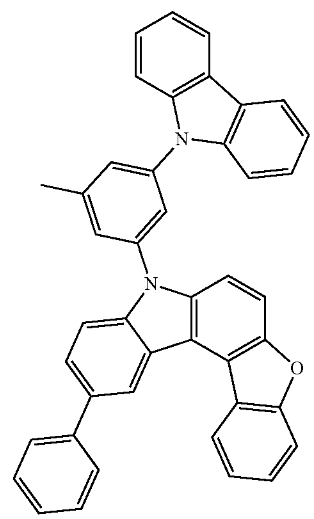
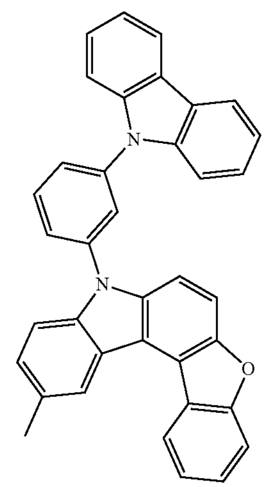
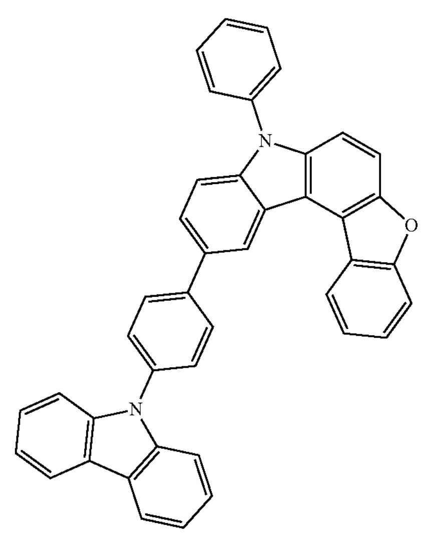

-continued
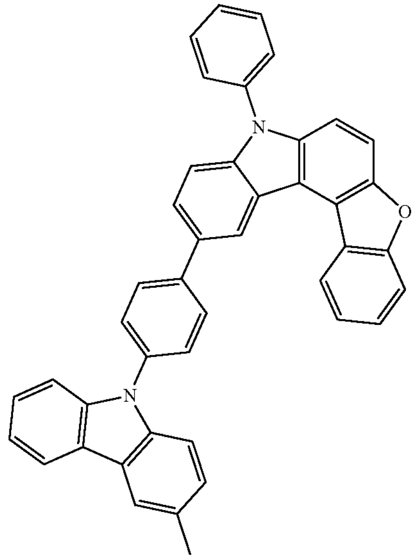
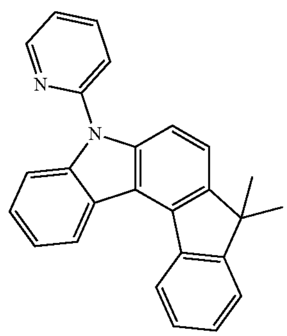
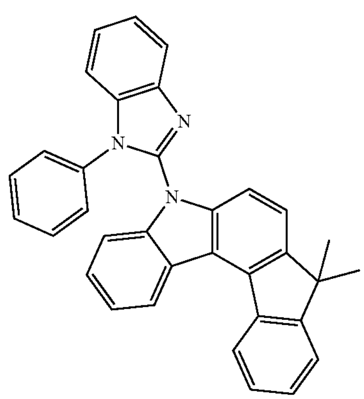
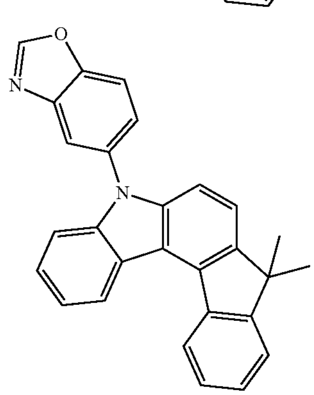
-continued
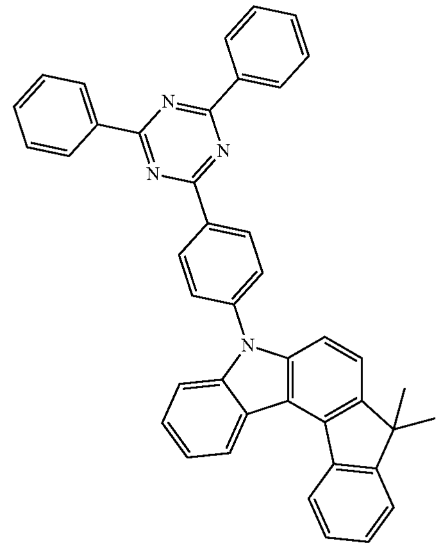
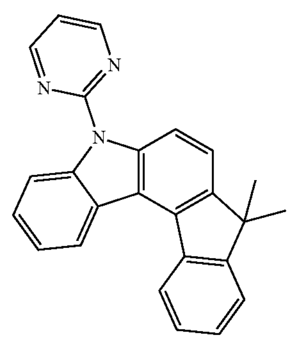
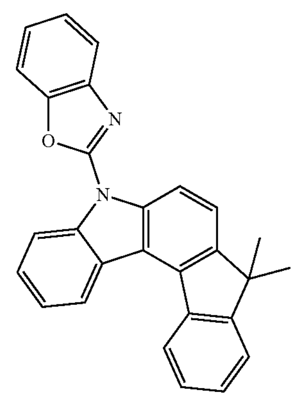
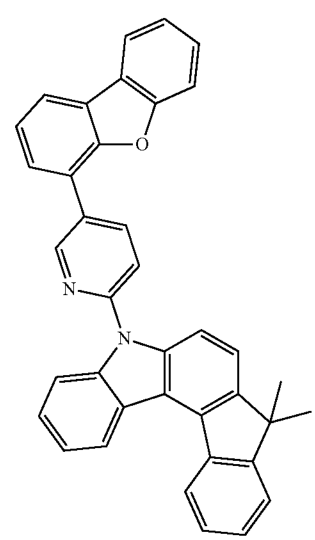

-continued
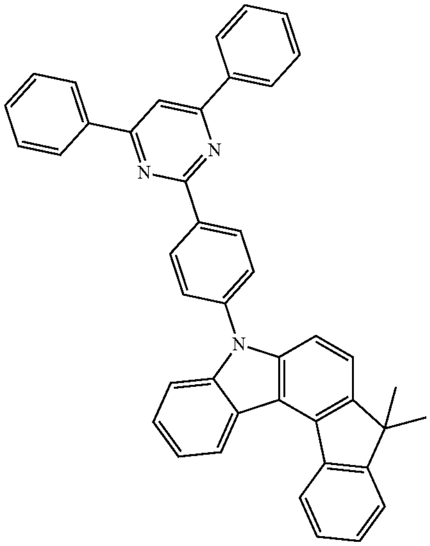
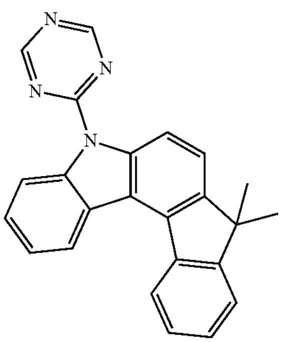
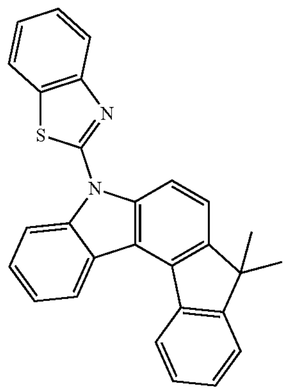
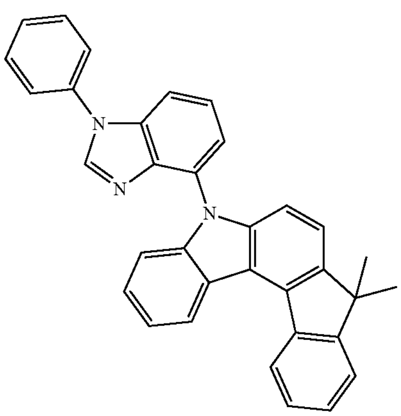
-continued
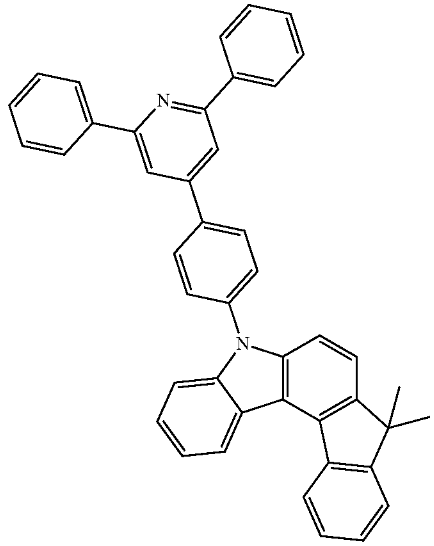
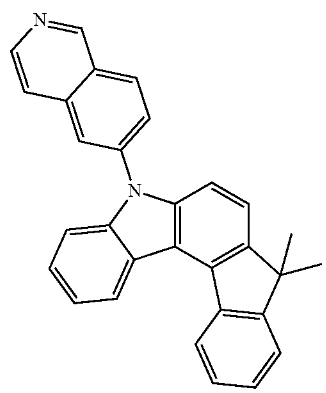
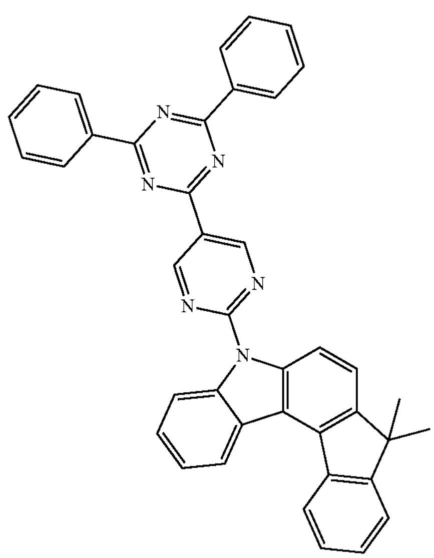

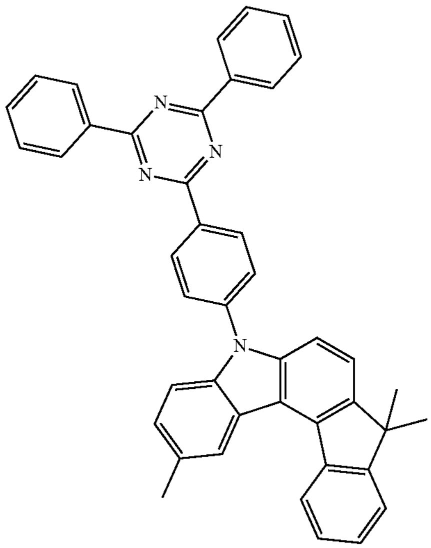
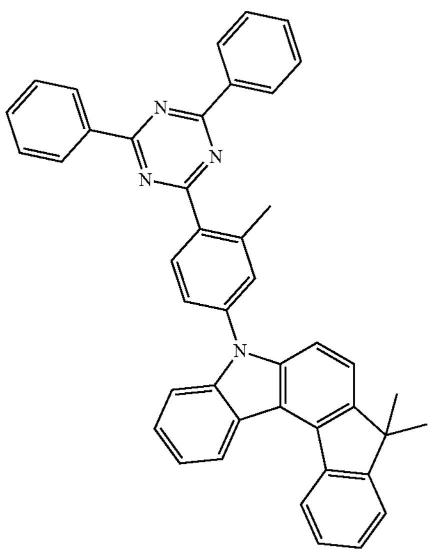
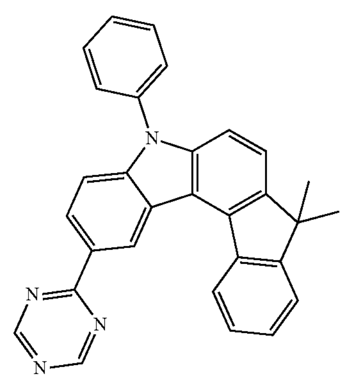
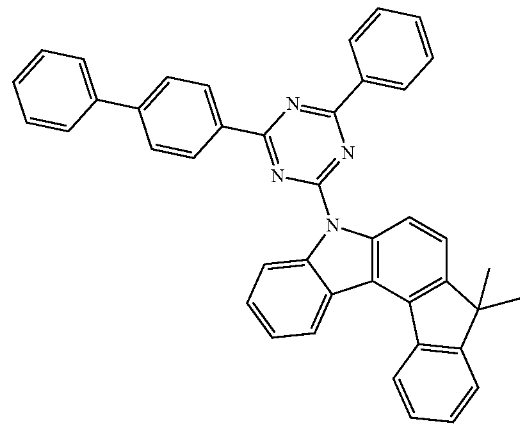
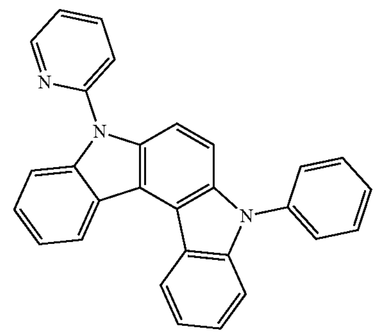
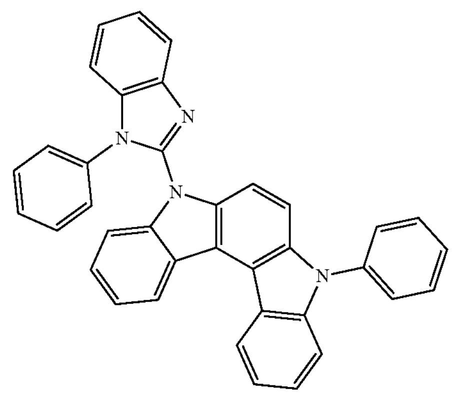
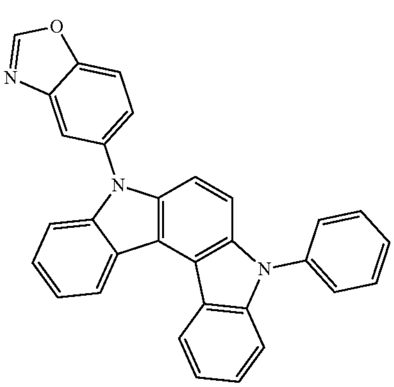

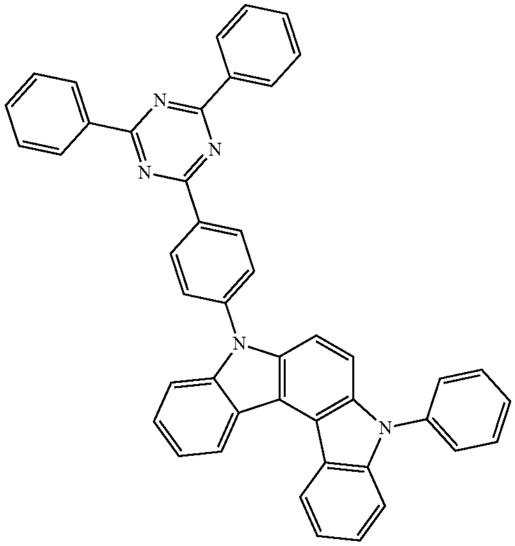
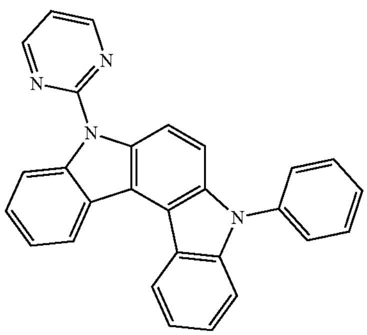
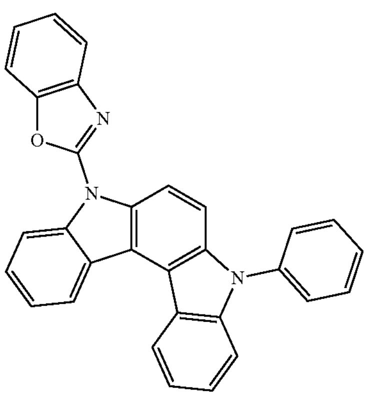
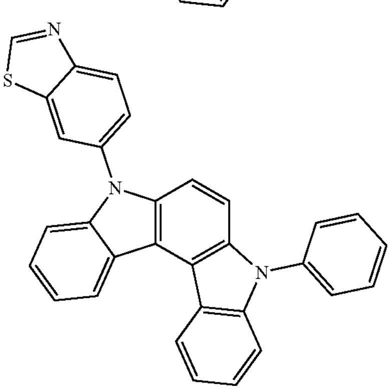
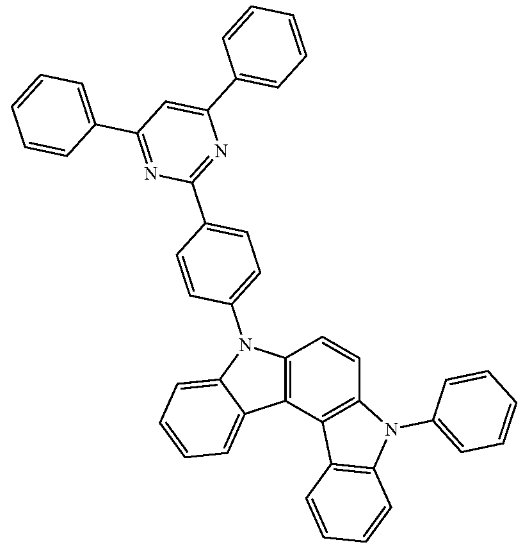
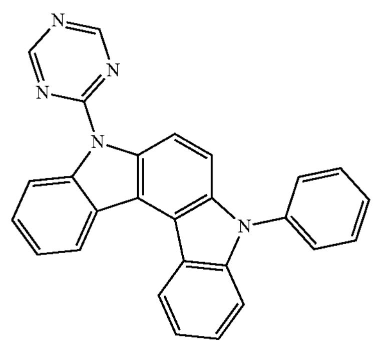
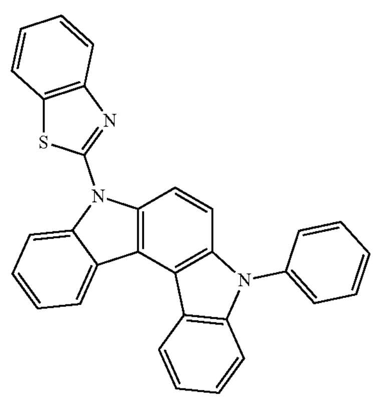

-continued
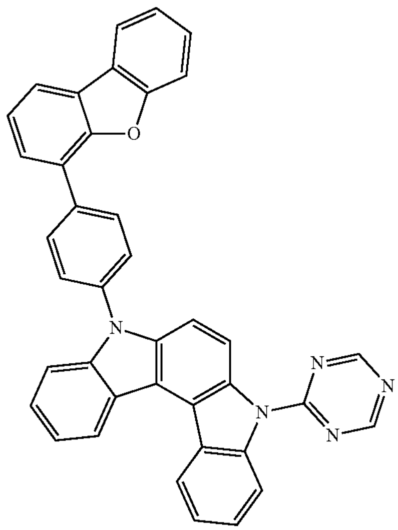
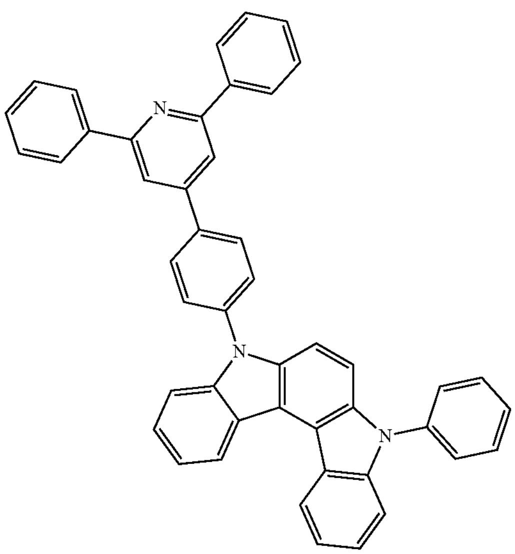
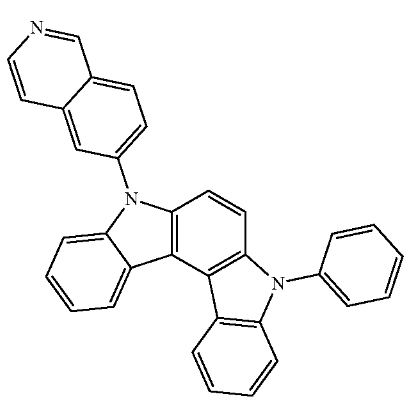
-continued
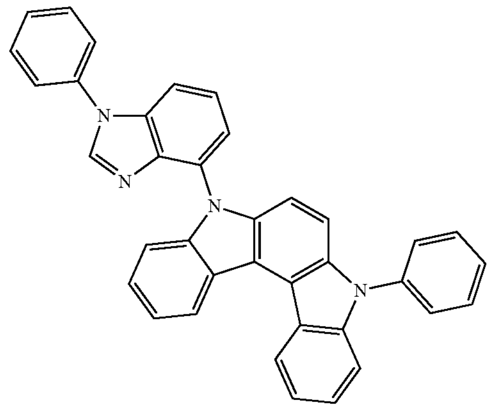
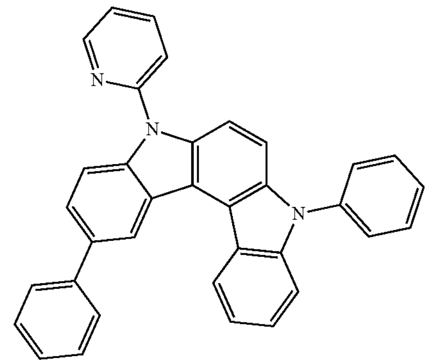
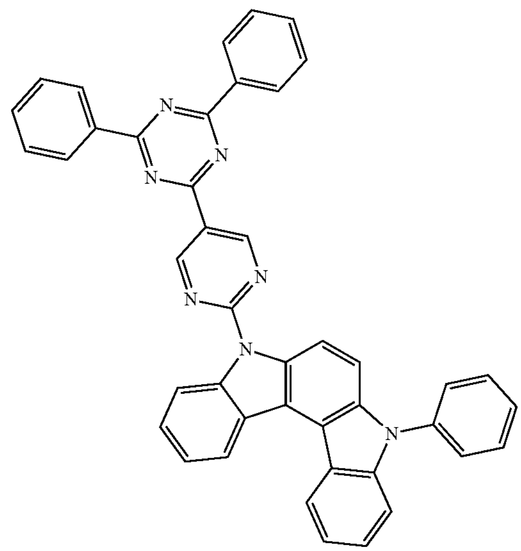
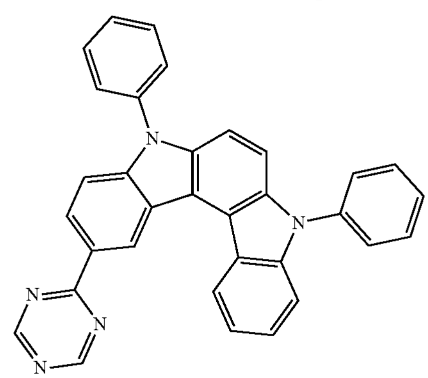

-continued
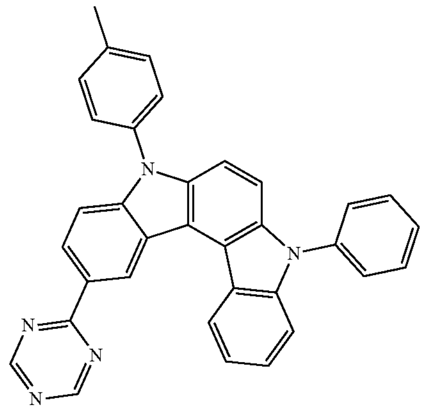
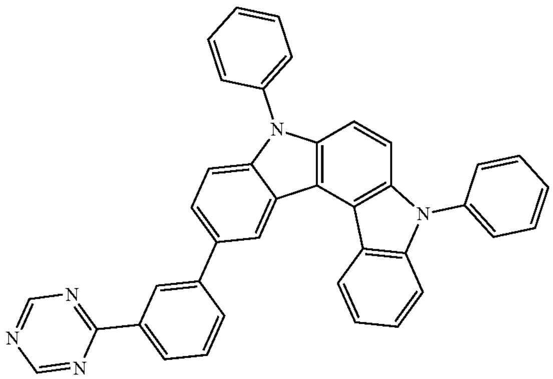
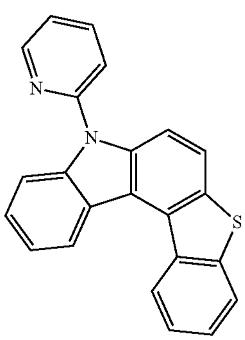
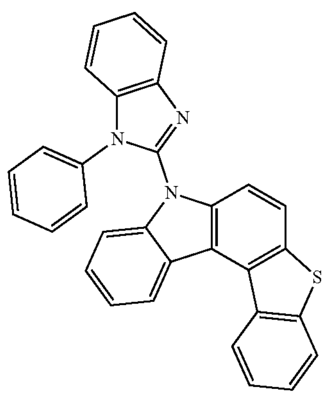
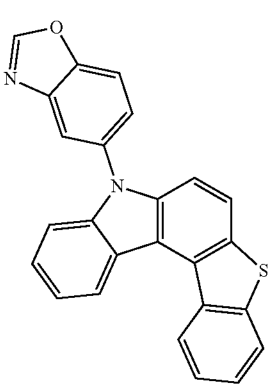
-continued
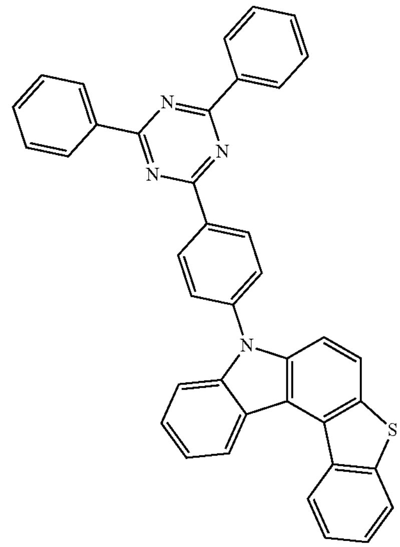
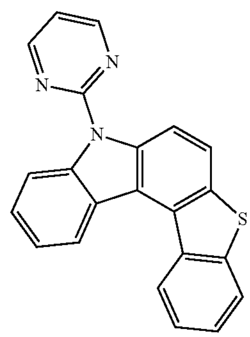
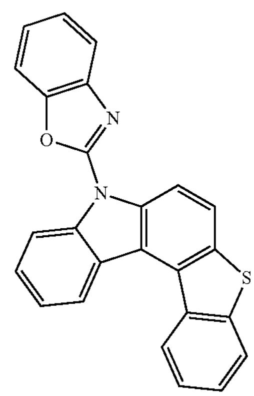
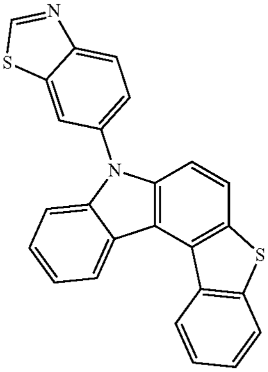

-continued
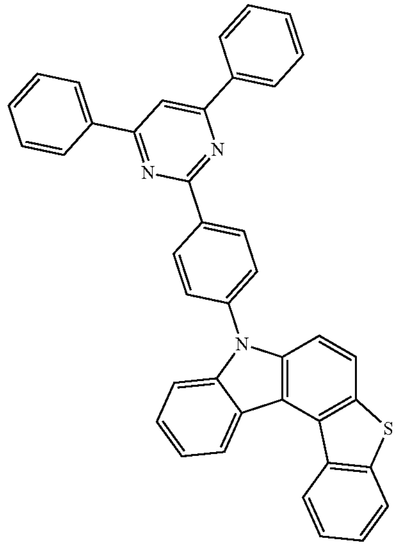
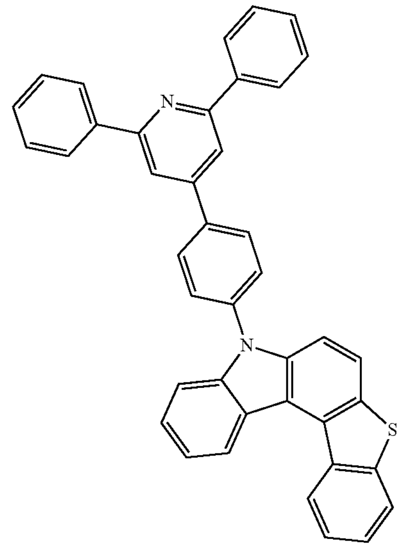
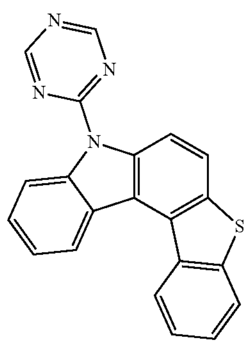
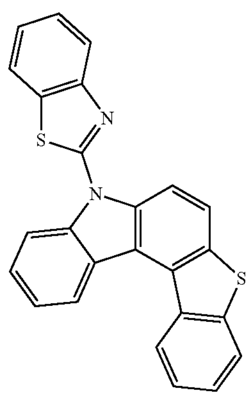
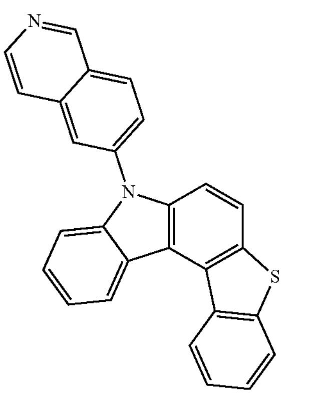
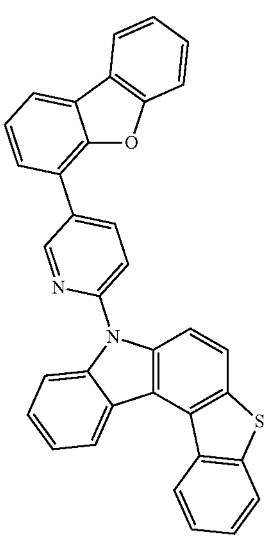
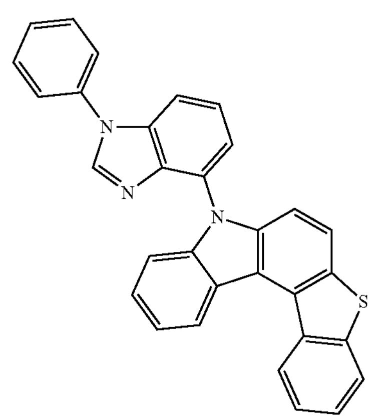
-continued -continued
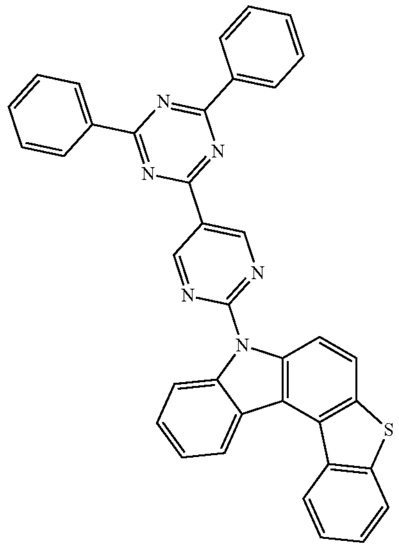
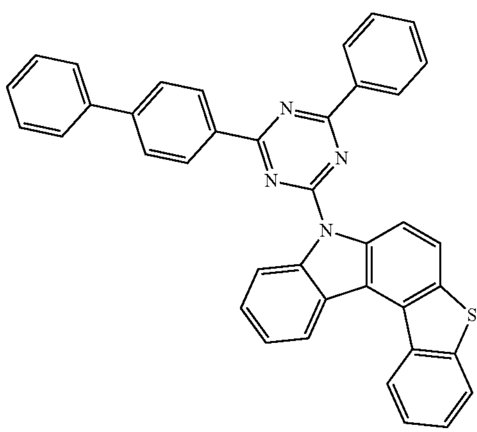
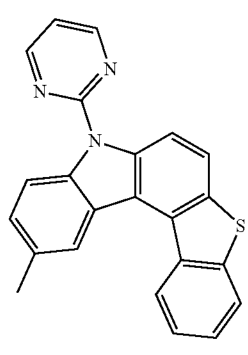
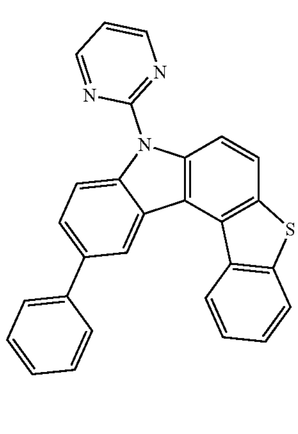
-continued
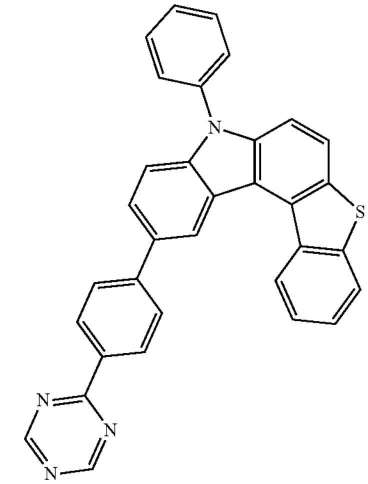
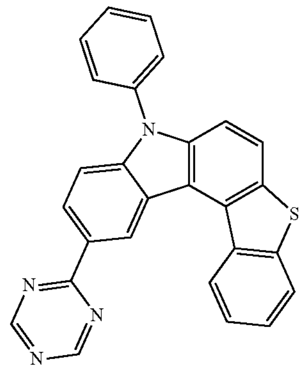
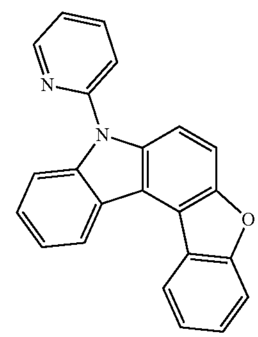
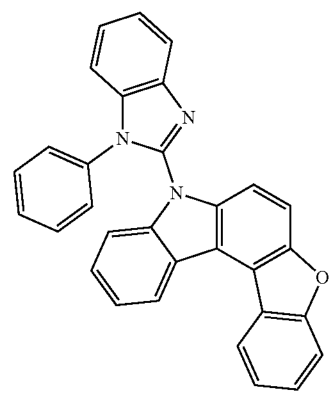
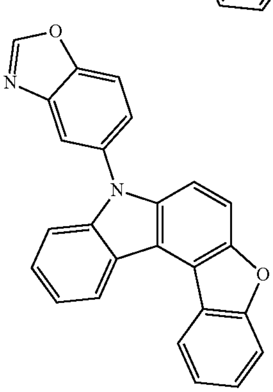

-continued
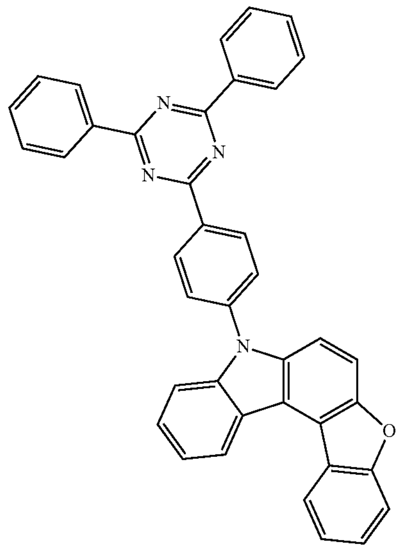
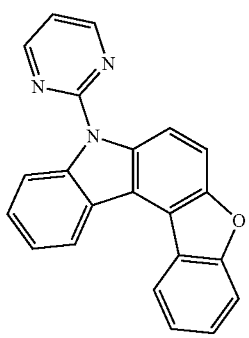
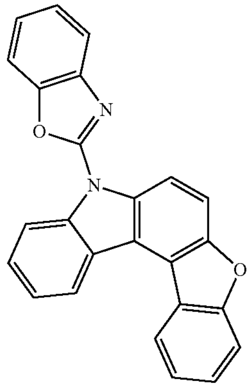
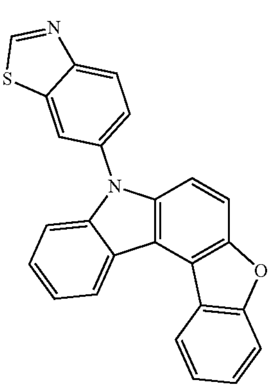
-continued
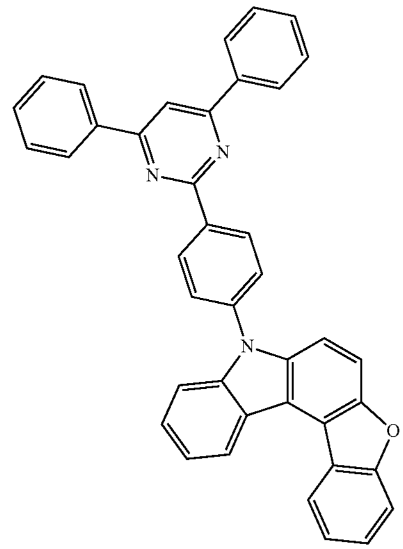
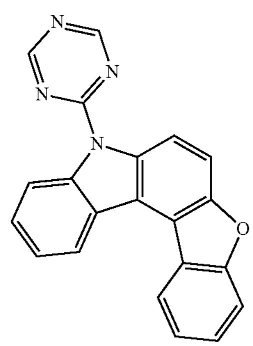
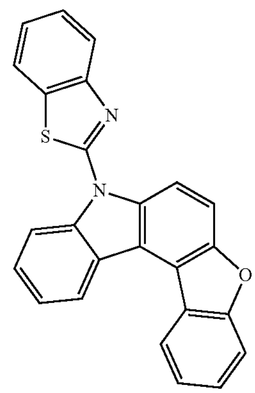
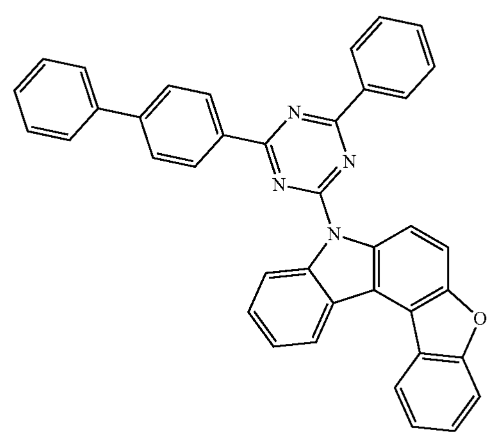

-continued
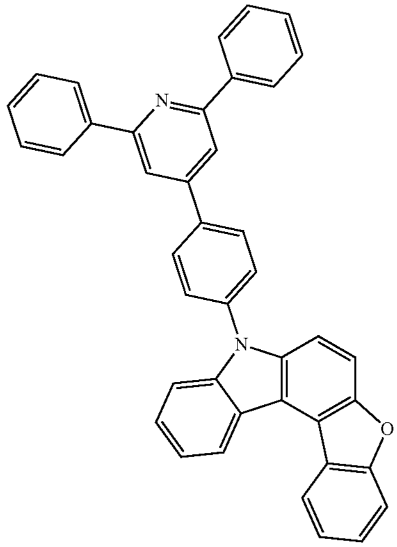
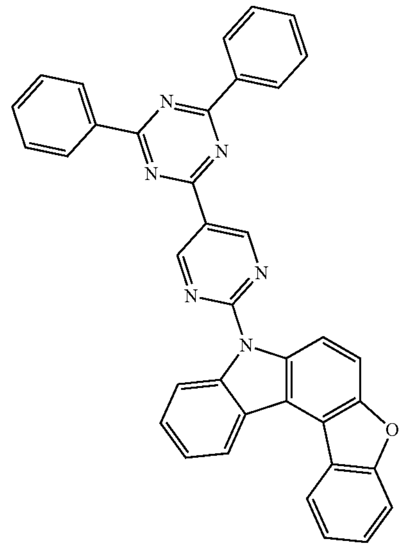
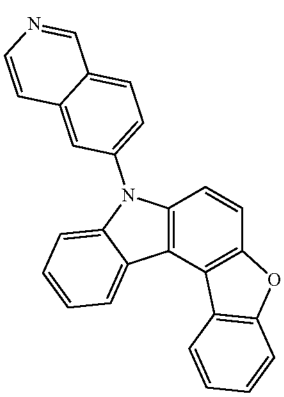
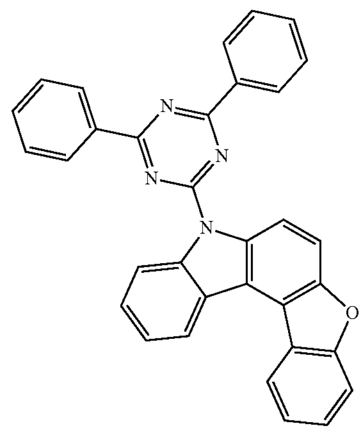
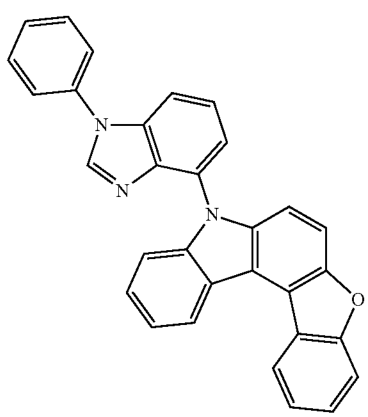
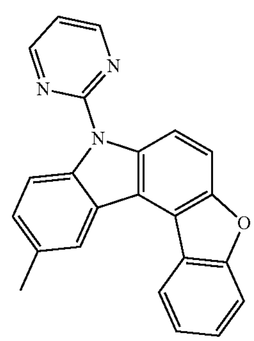
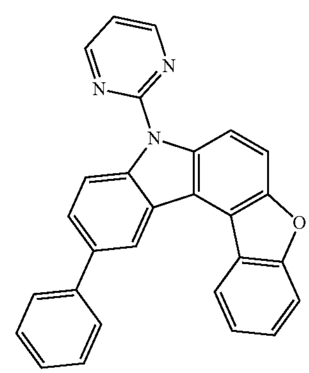

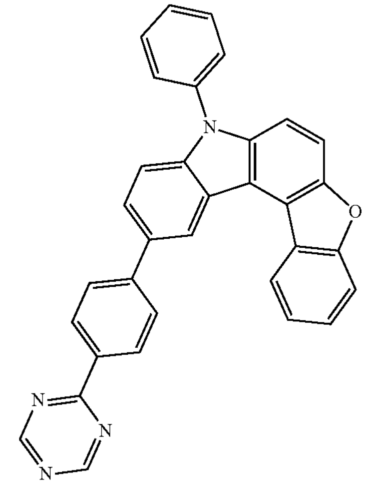
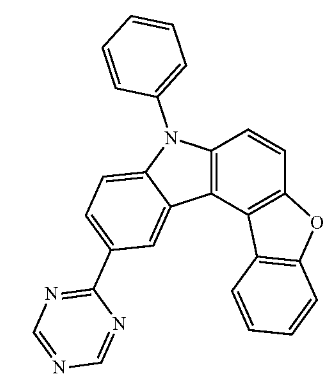
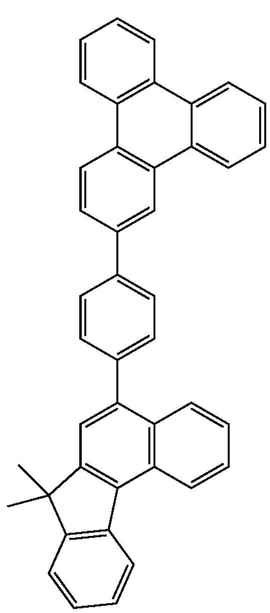
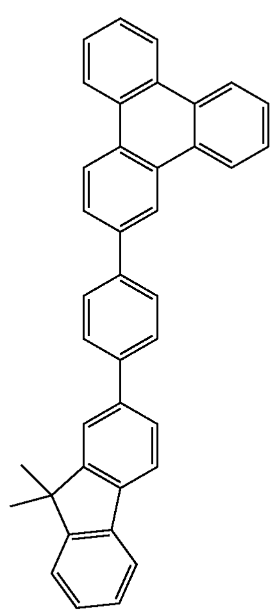
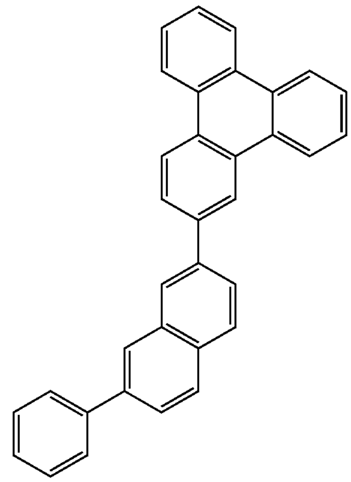
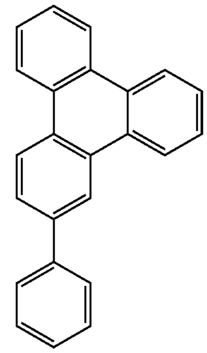
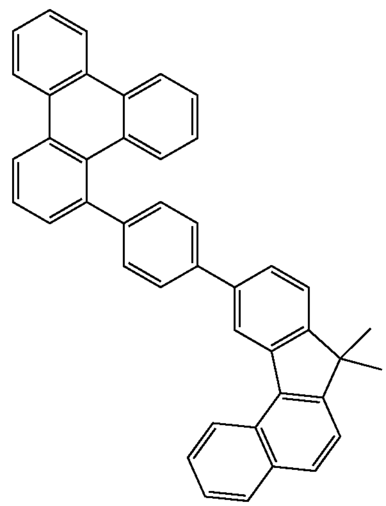
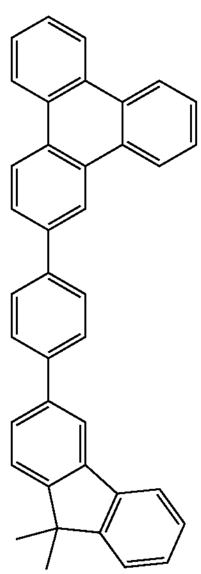
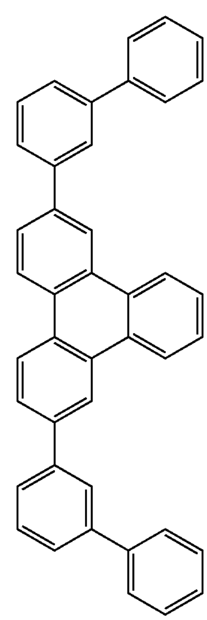

-continued
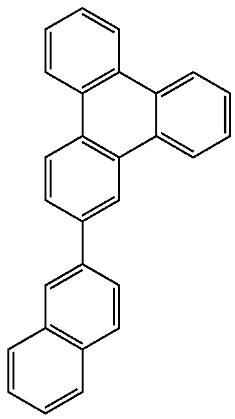
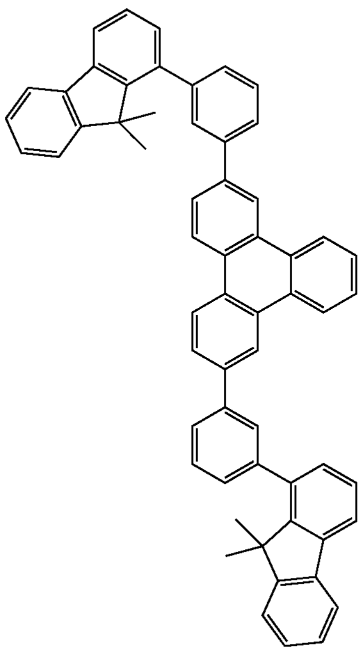
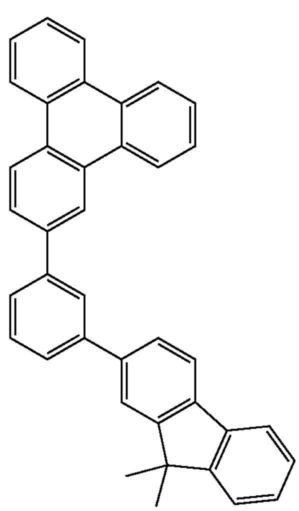
-continued
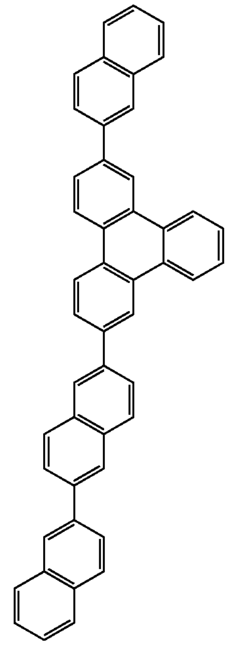
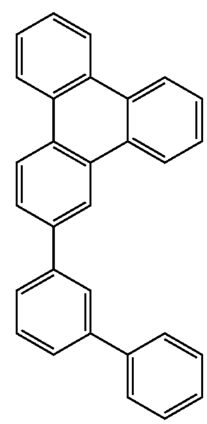
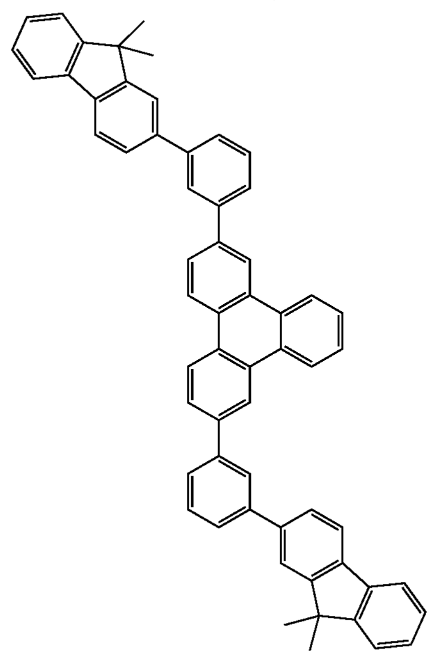

-continued
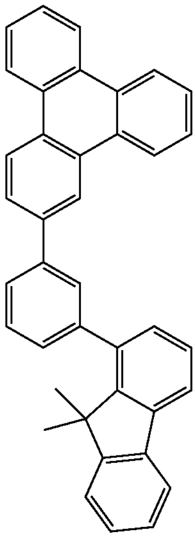
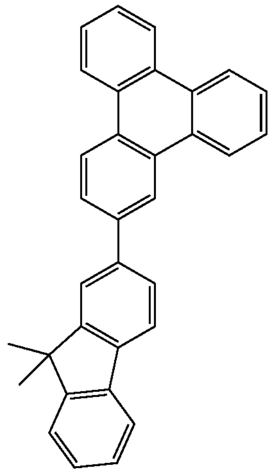
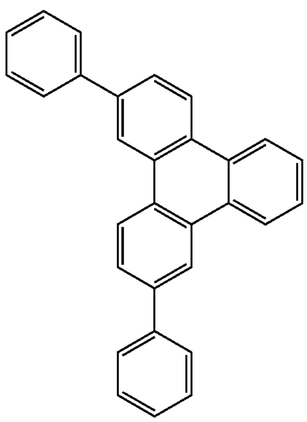
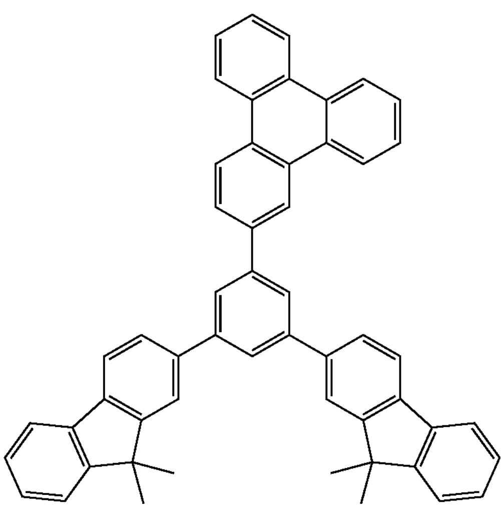
-continued
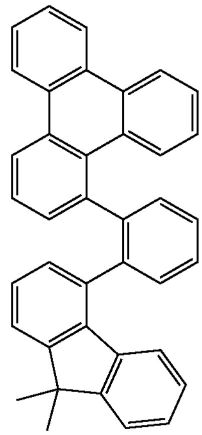
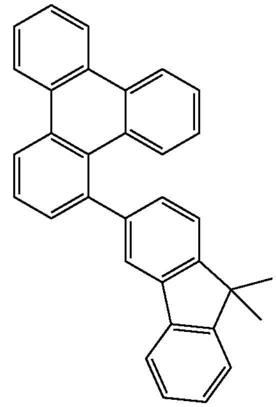
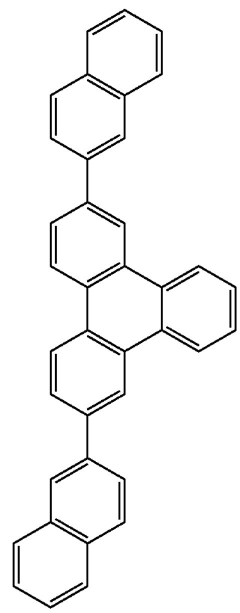
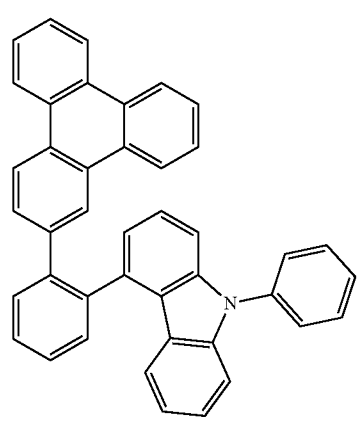

-continued
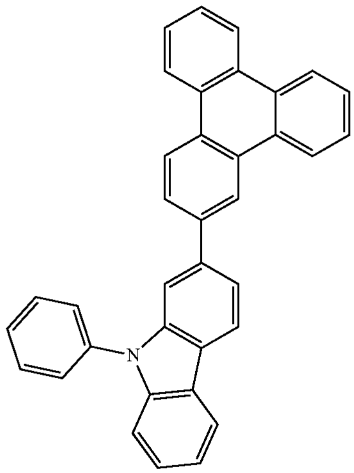
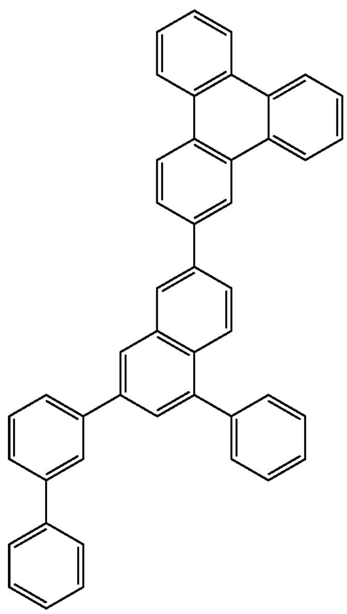
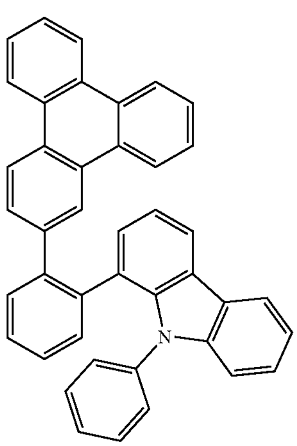
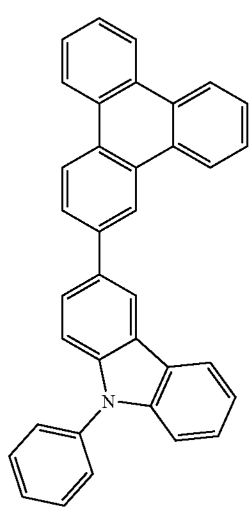
-continued
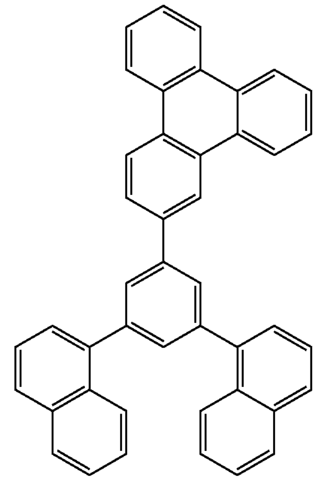
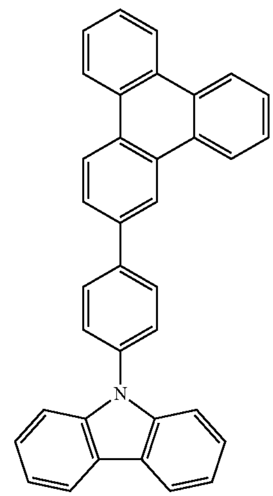
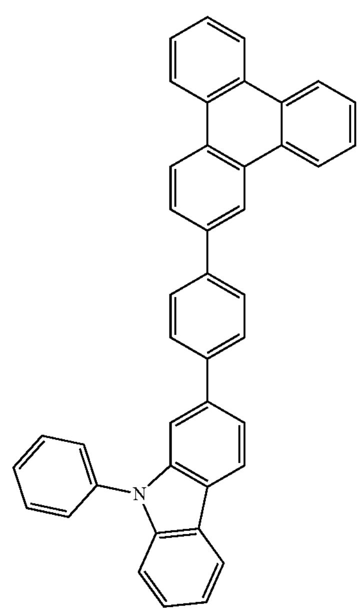

-continued
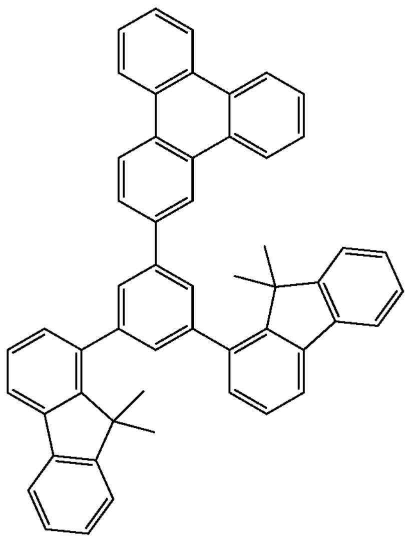
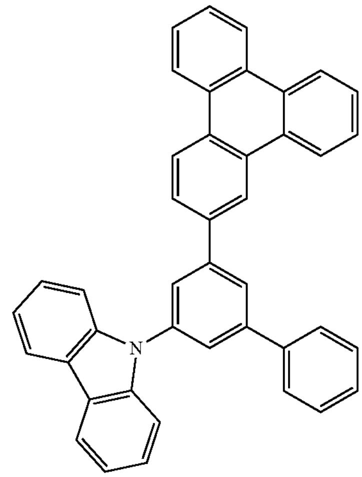
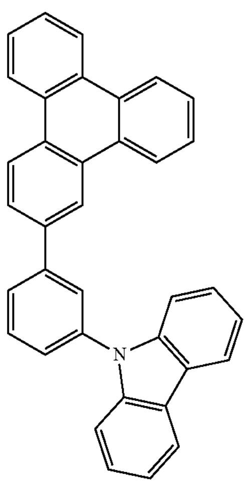
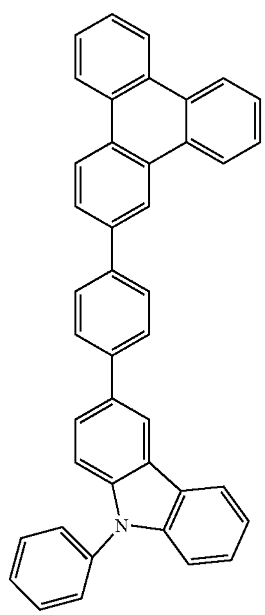
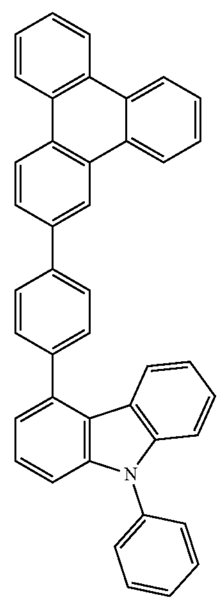
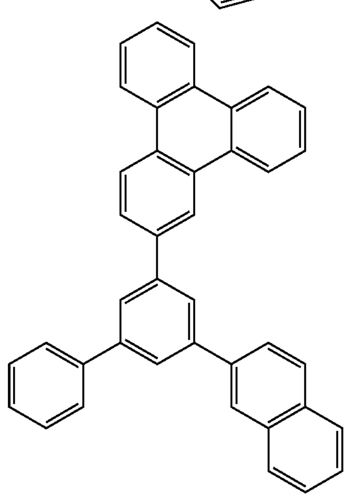
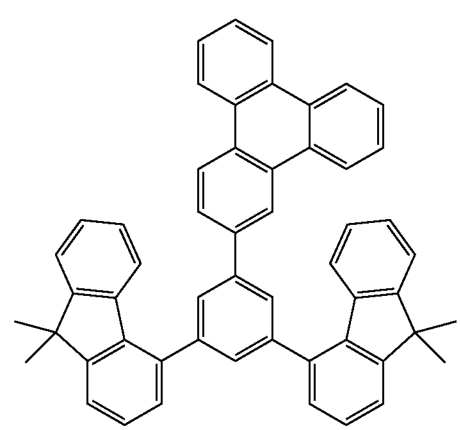

-continued
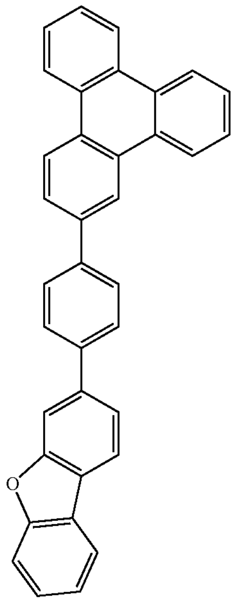
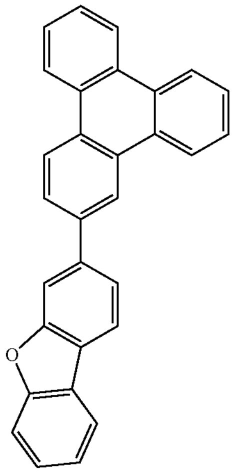
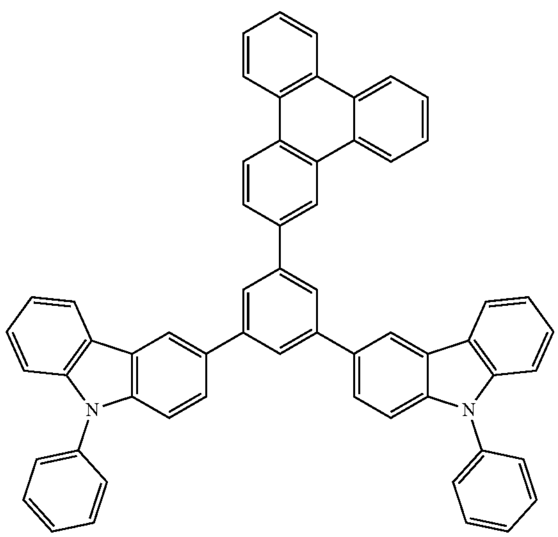
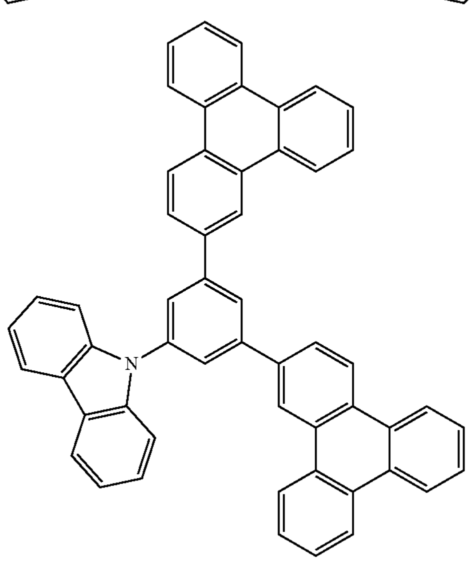
-continued
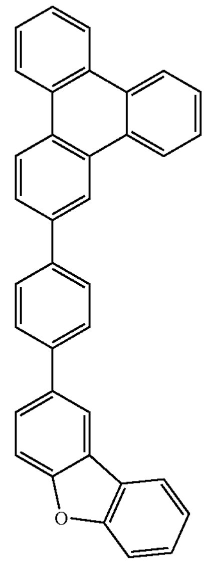
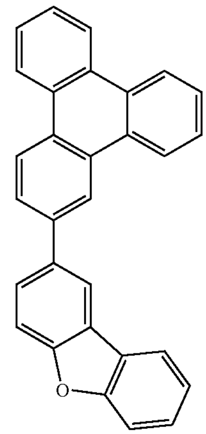
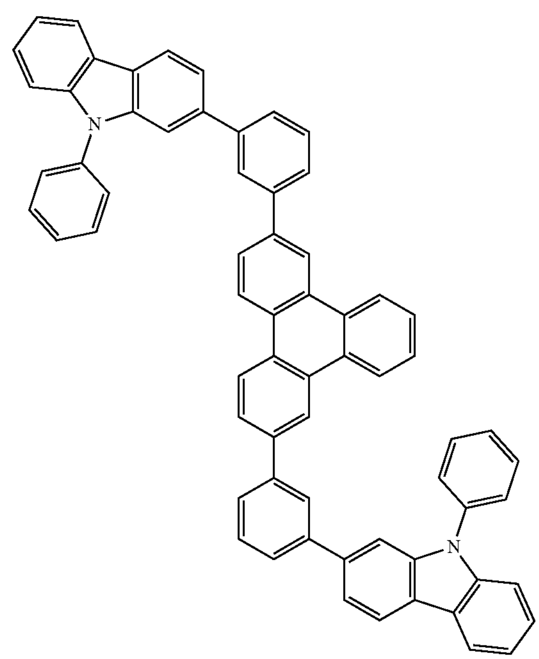

-continued
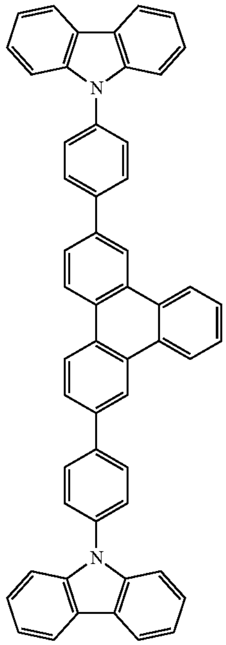
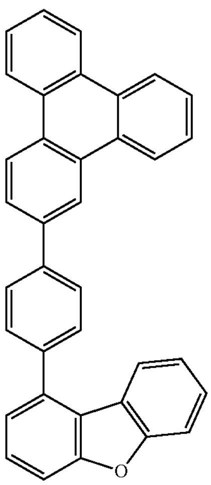
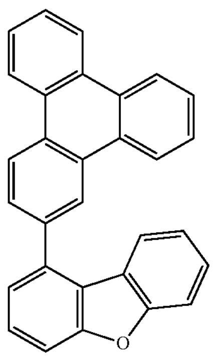
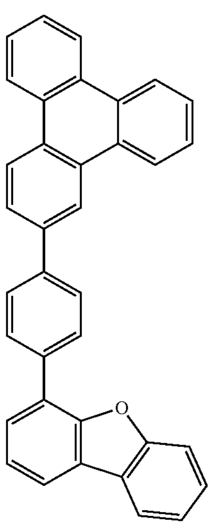
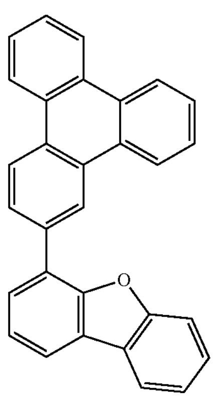
-continued
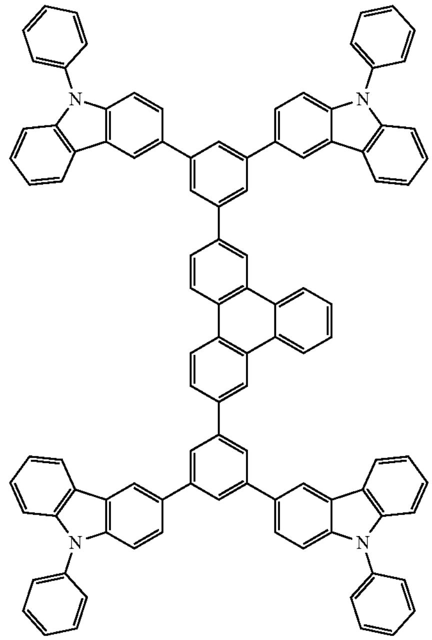
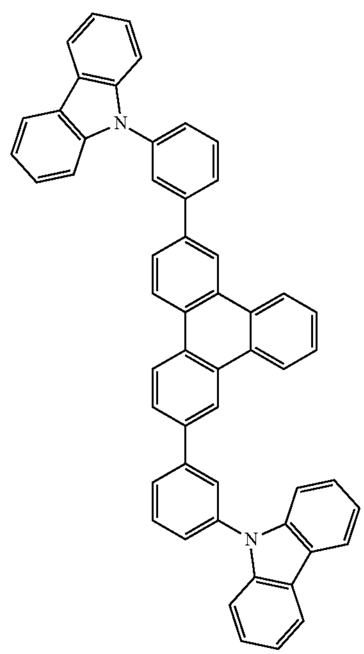

-continued
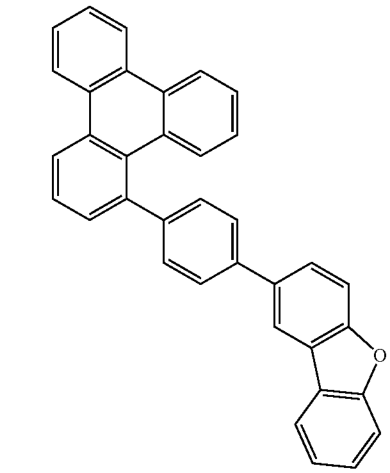
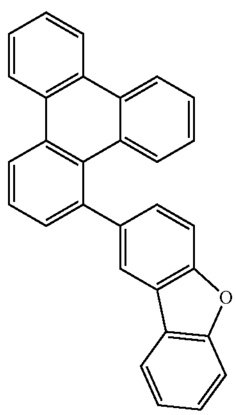
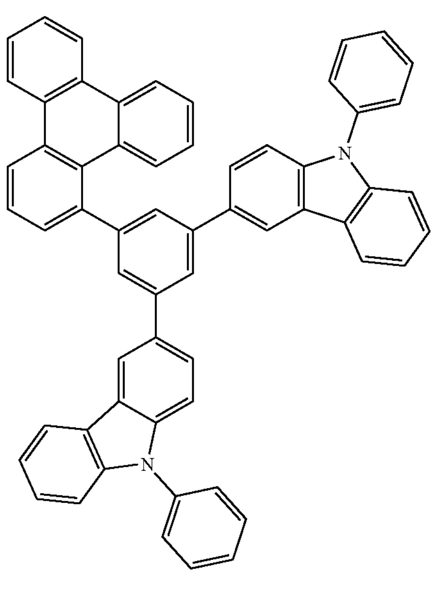
-continued
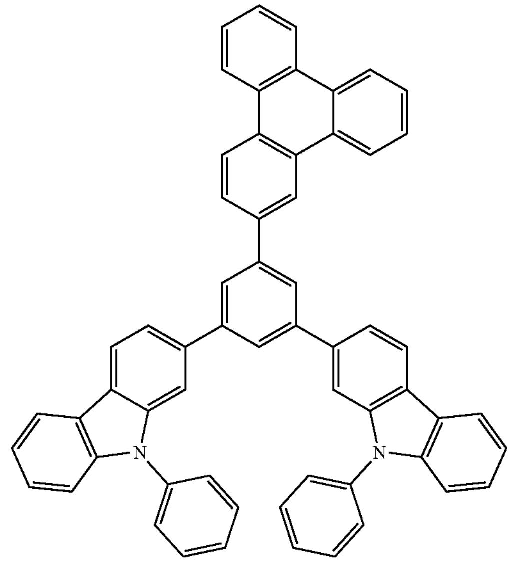
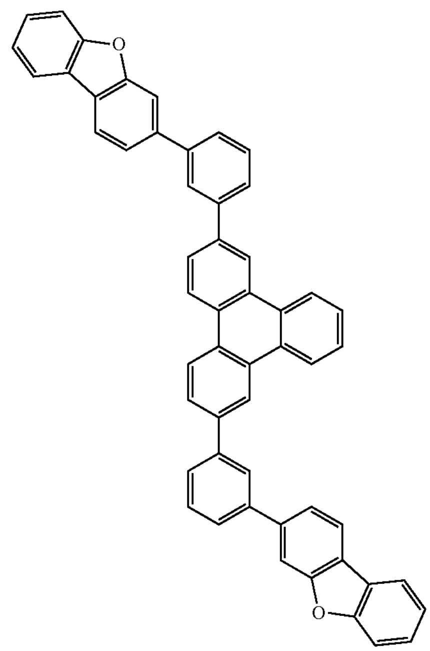
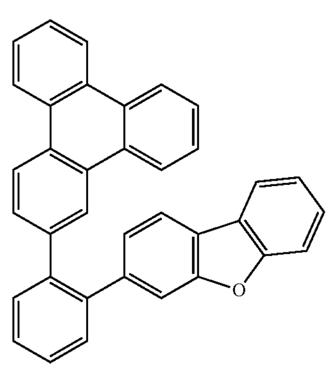

-continued
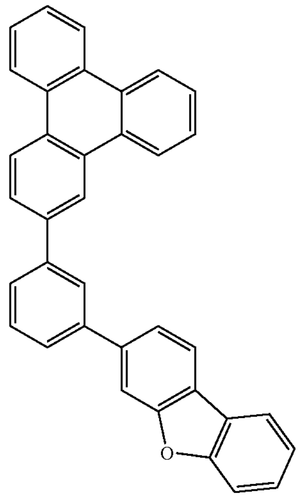
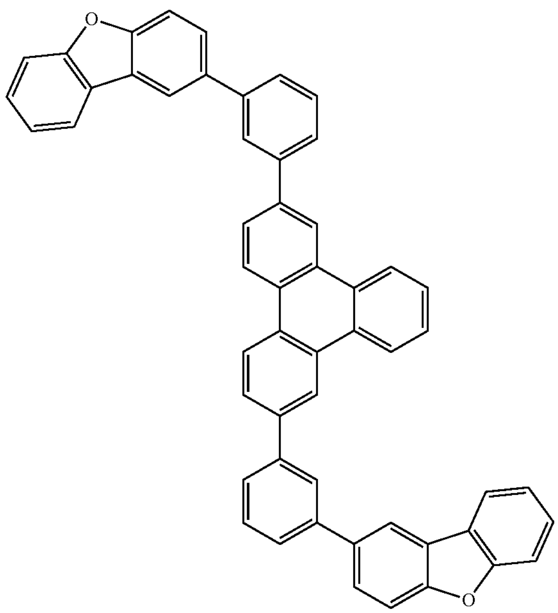
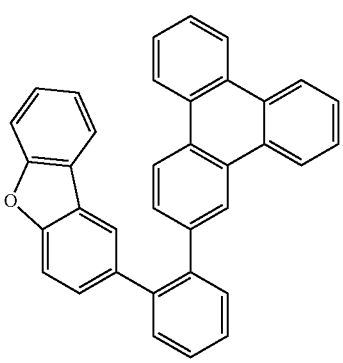
-continued
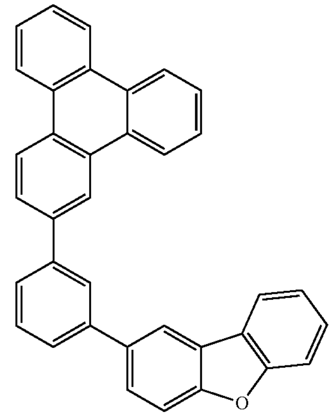
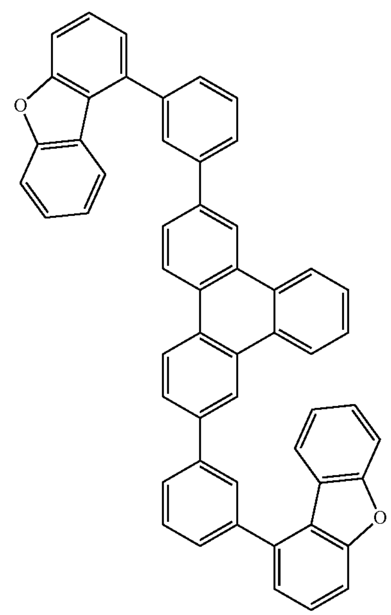
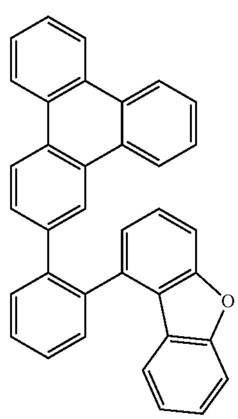
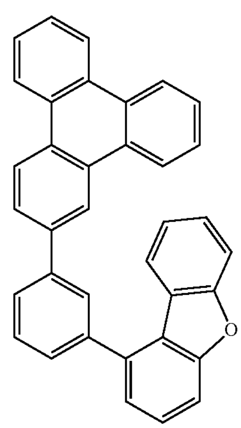

-continued
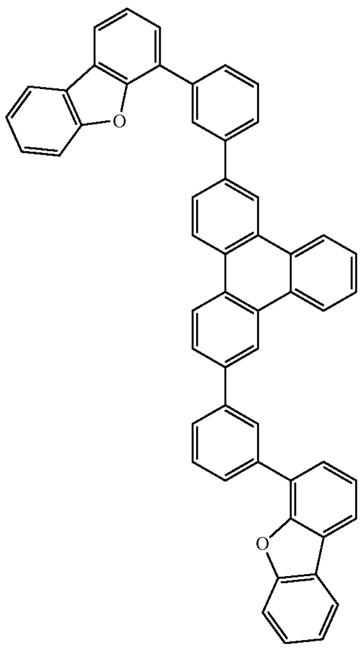
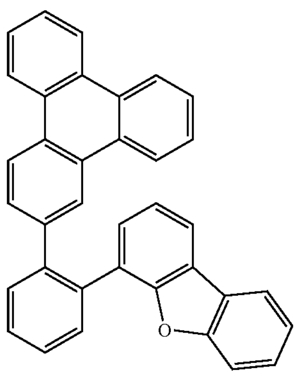
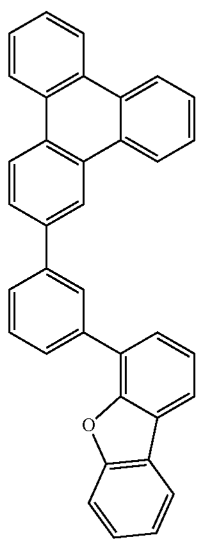
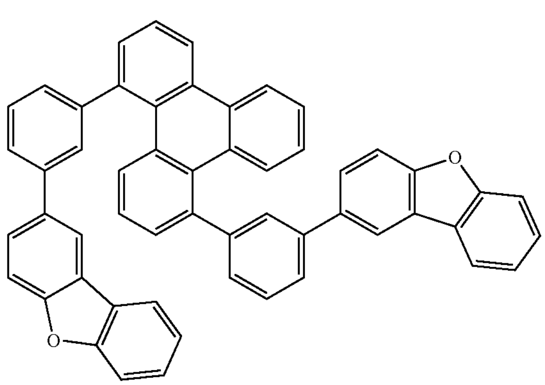
-continued
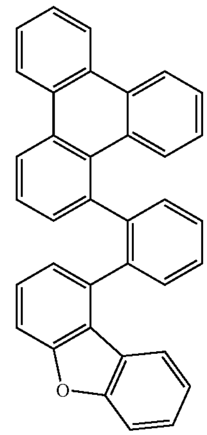
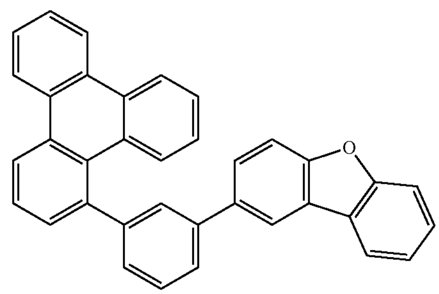
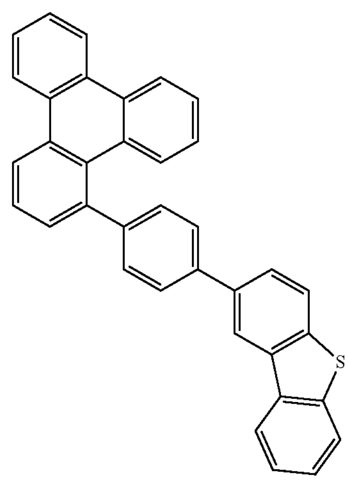
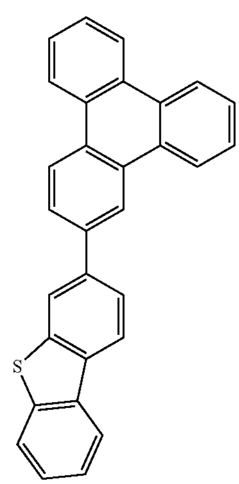

-continued
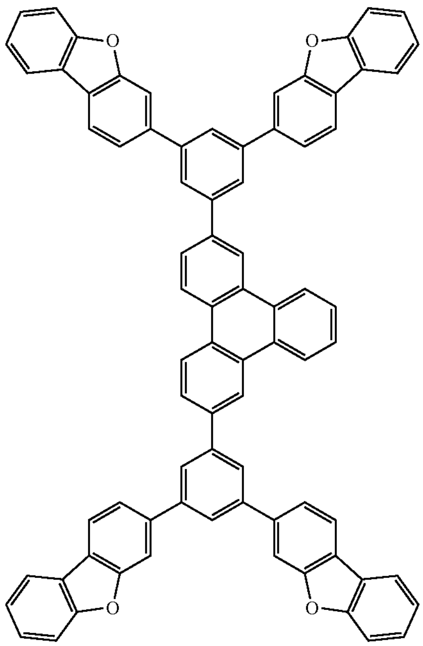
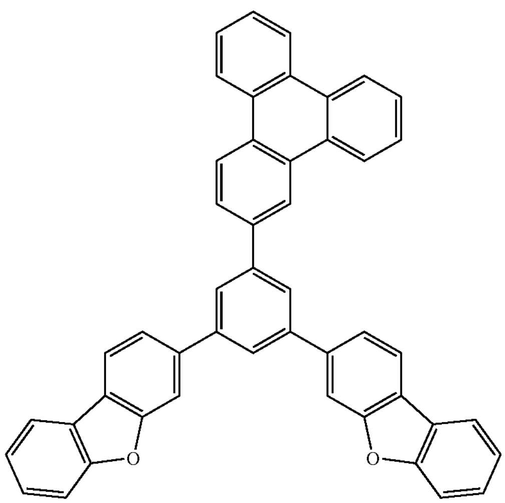
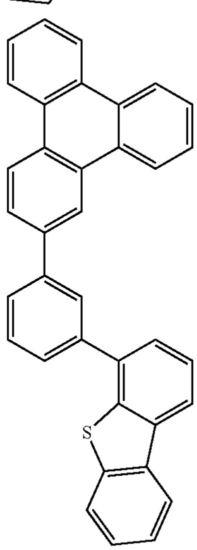
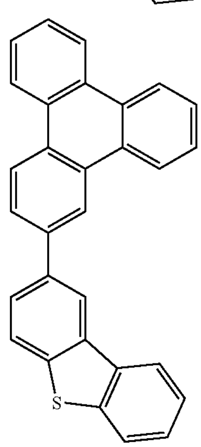
-continued
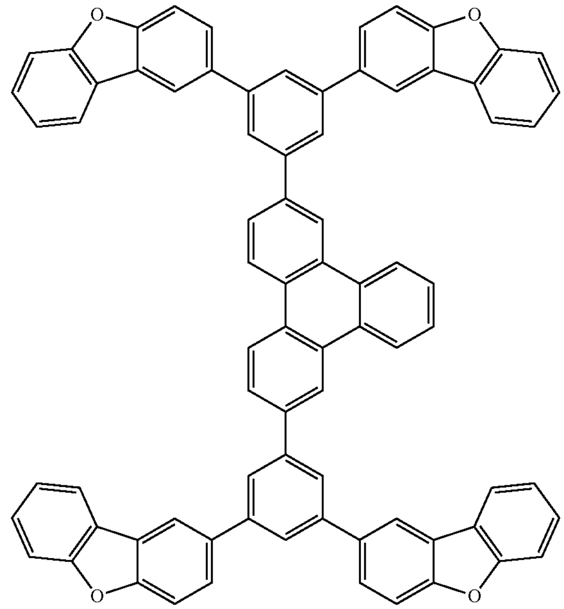
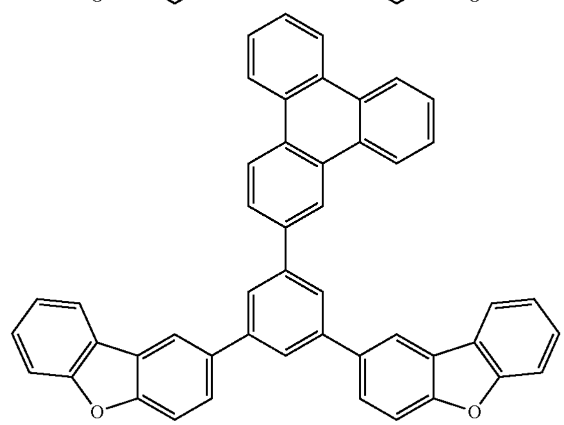
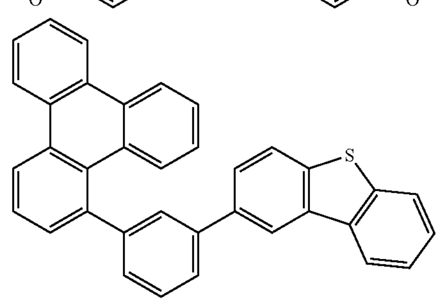
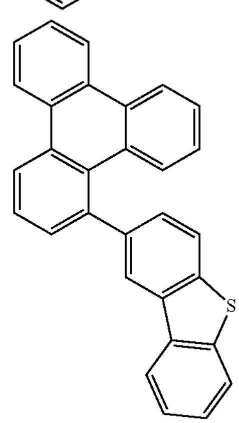

-continued
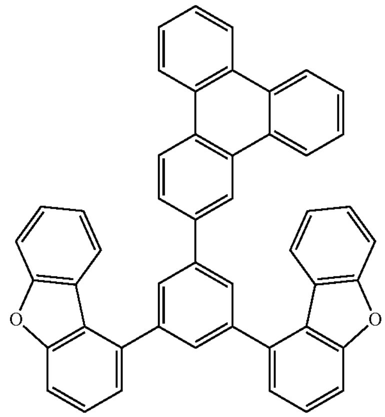
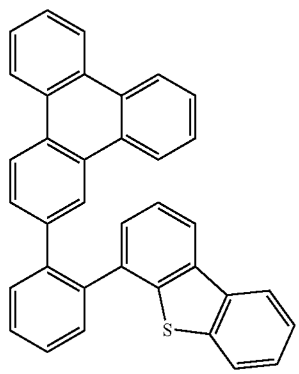
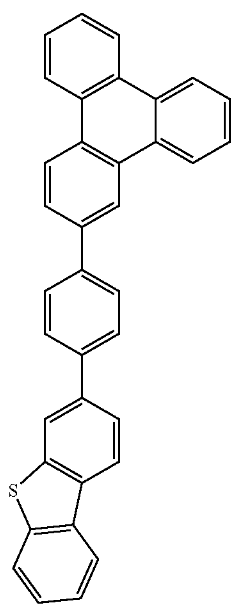
-continued
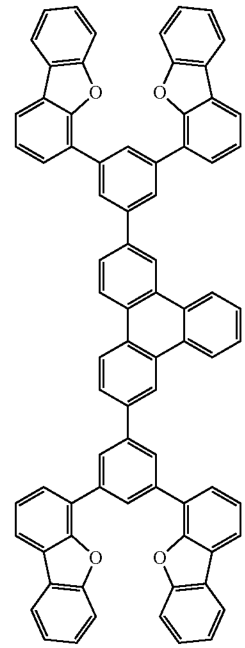
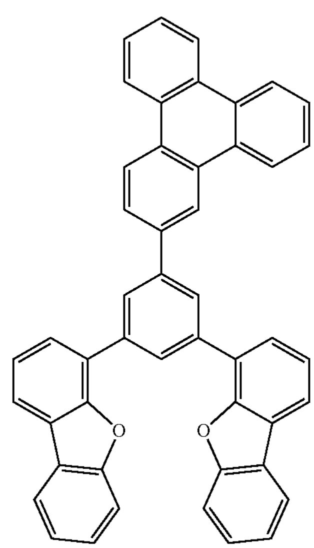

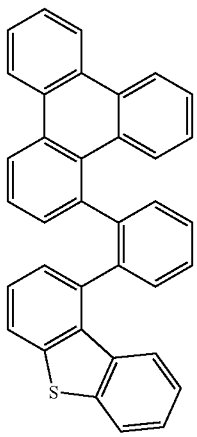
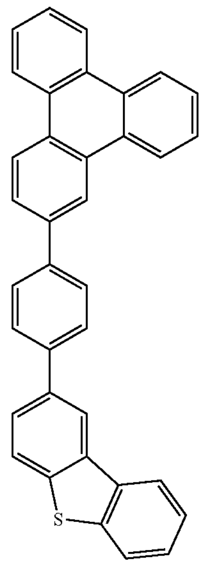
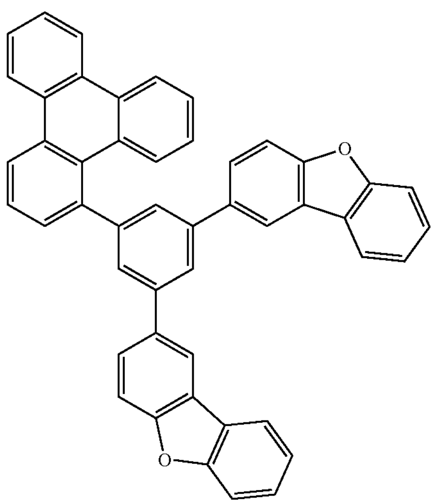
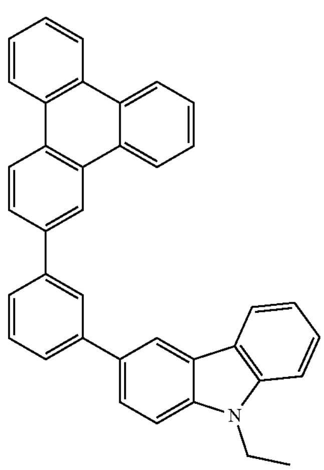
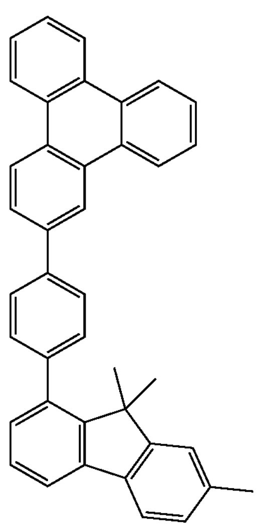
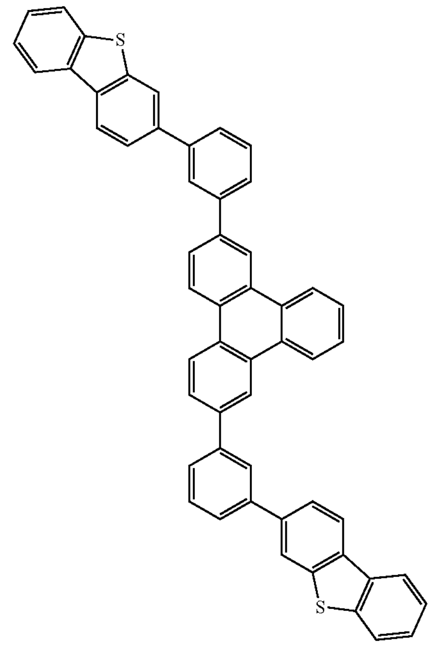
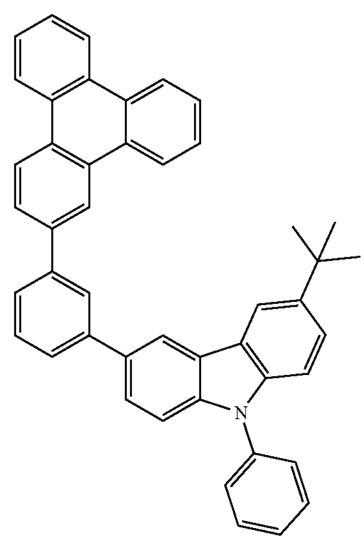

-continued
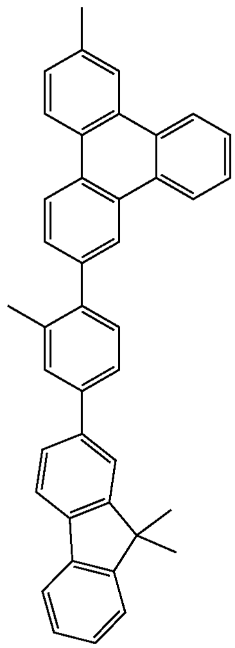
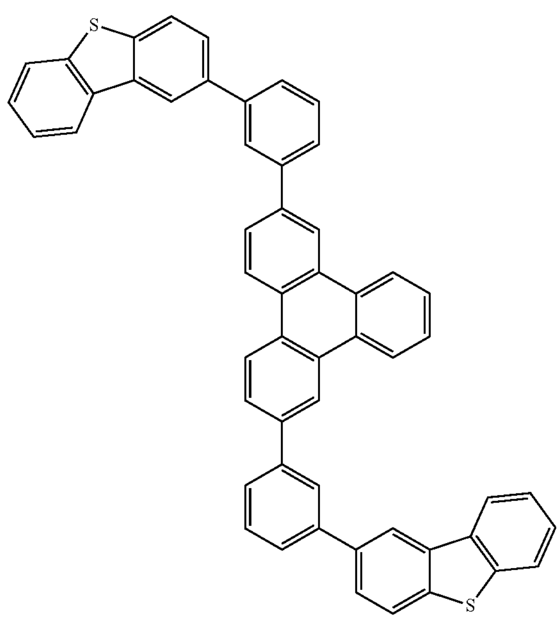
-continued
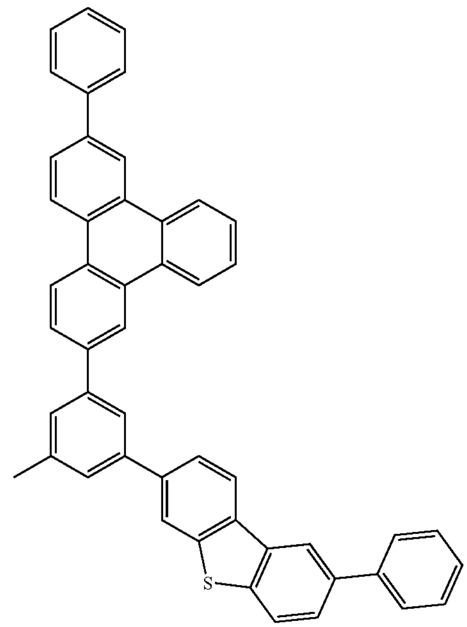
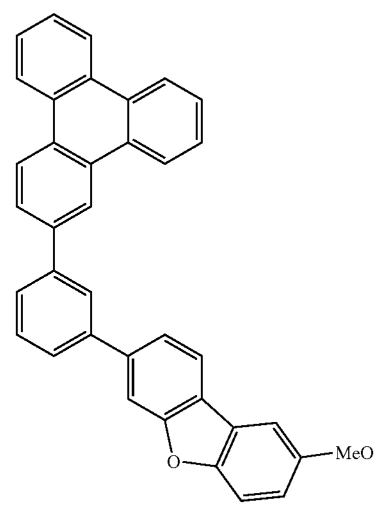
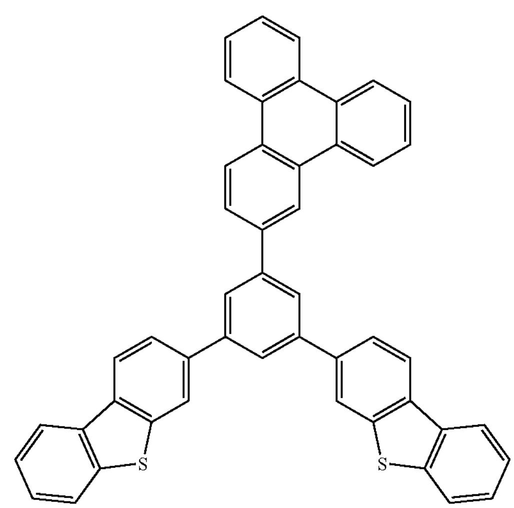

-continued
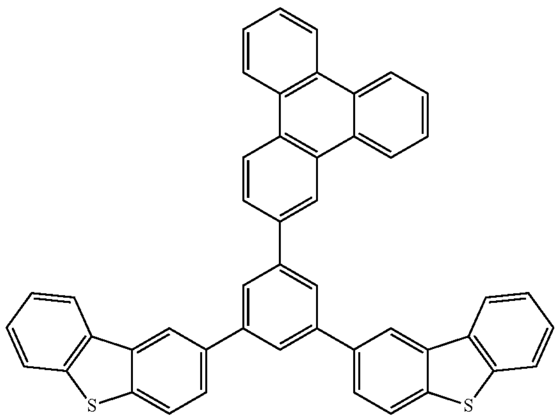
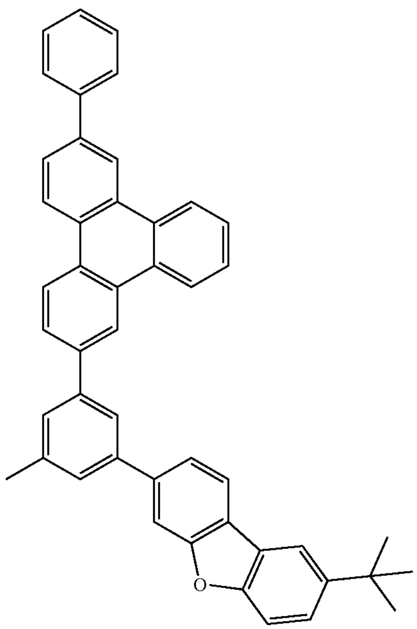
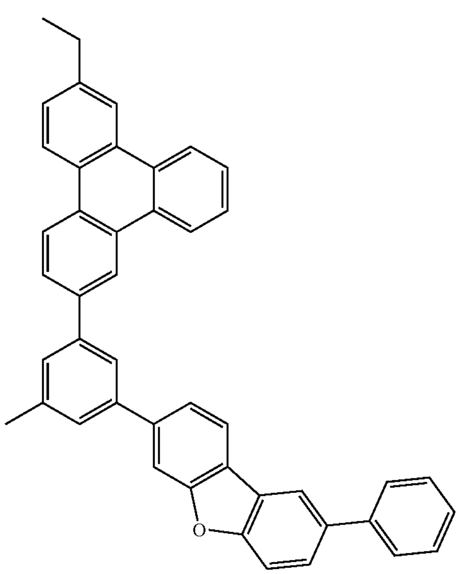
-continued
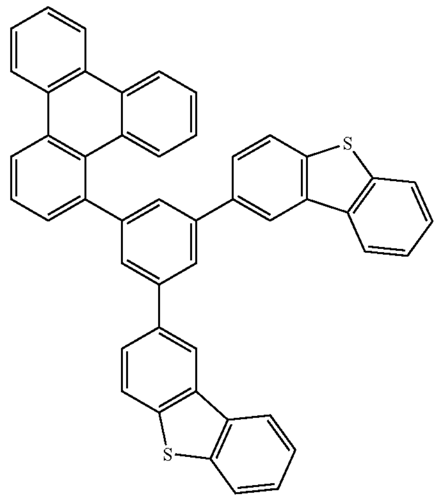
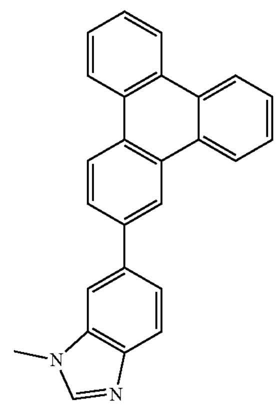
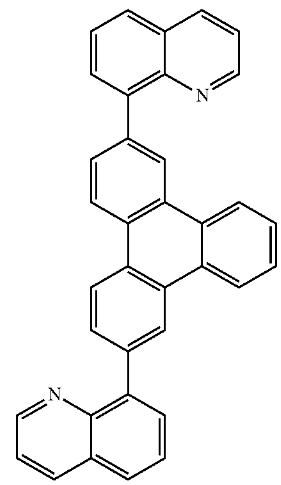
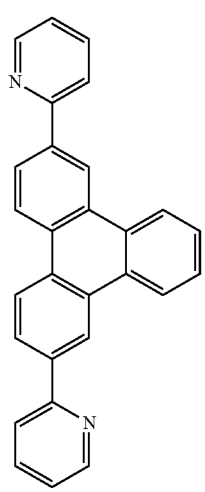
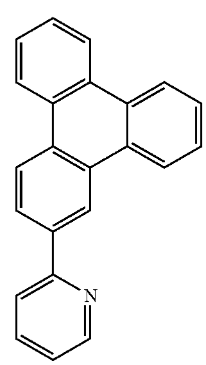

-continued
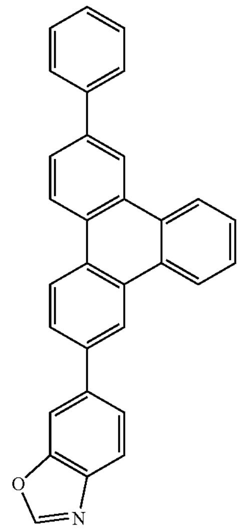
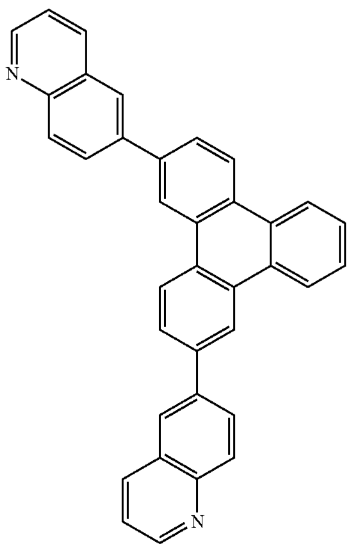
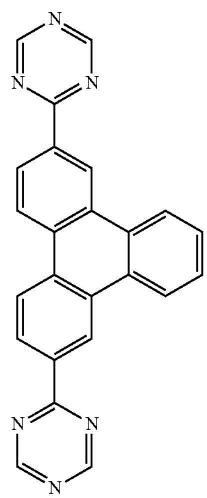
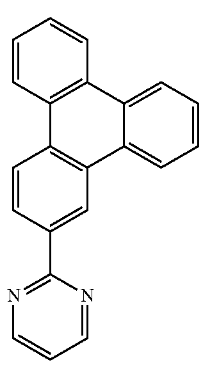
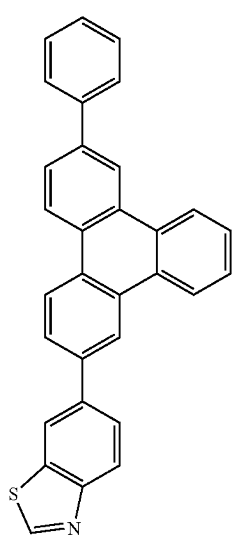
-continued
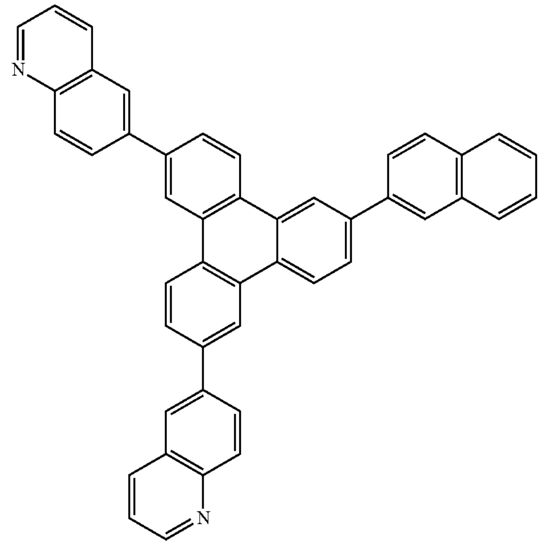
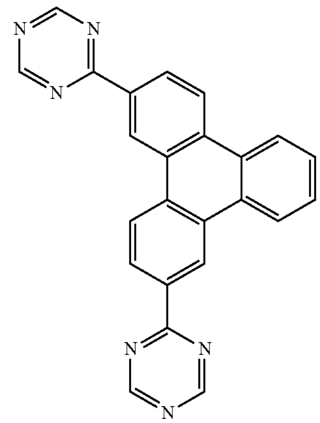
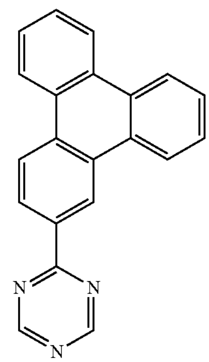
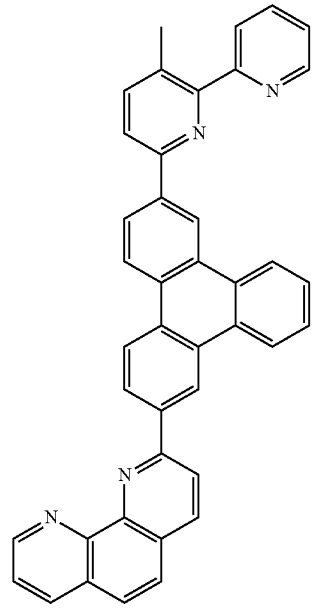

-continued
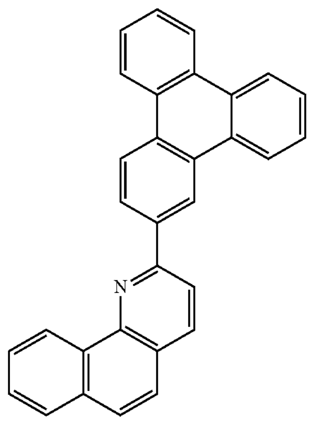
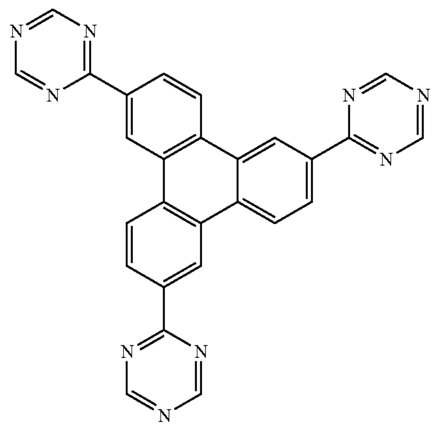
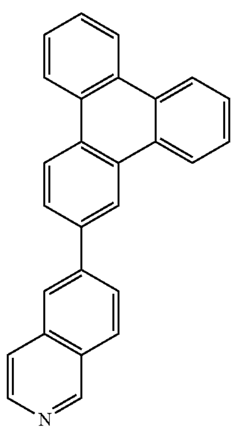
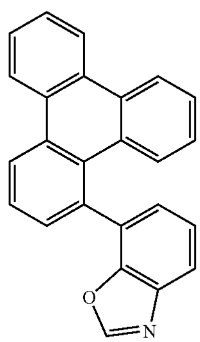
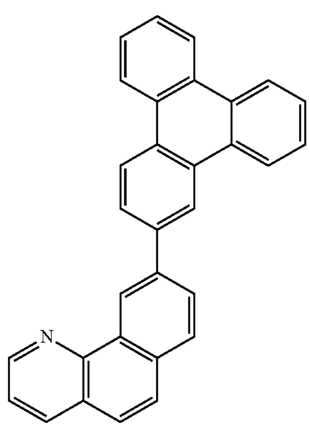
-continued
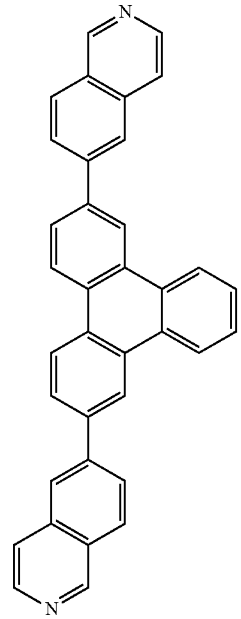
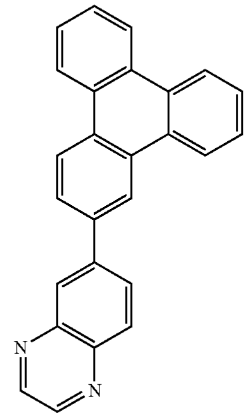
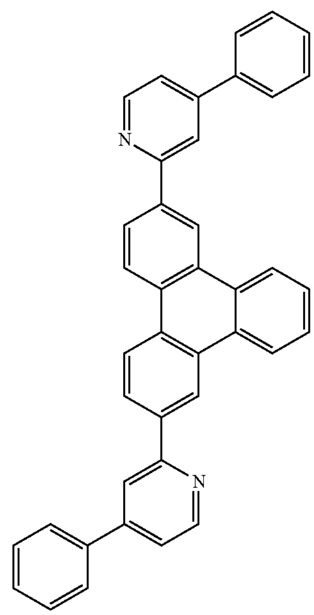
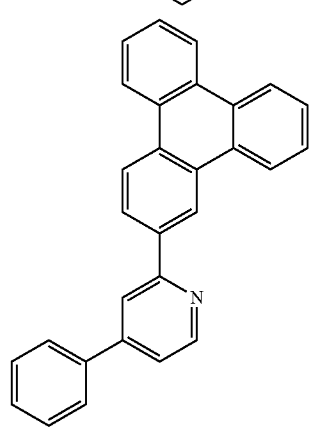
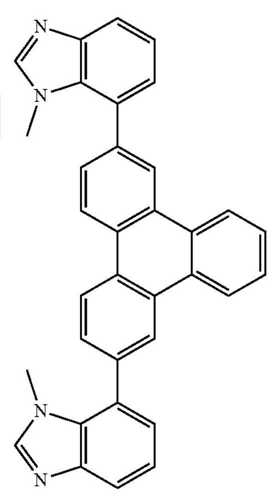

-continued
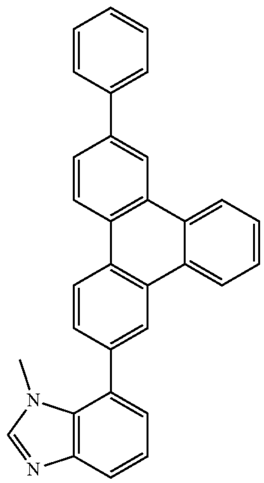
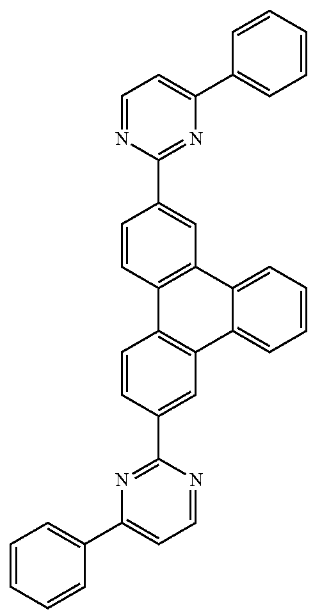
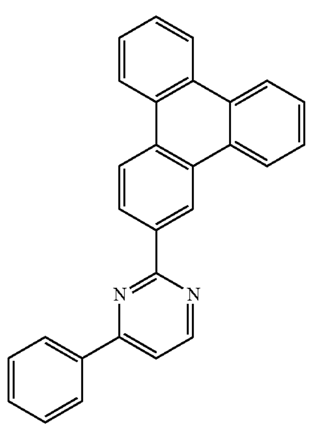
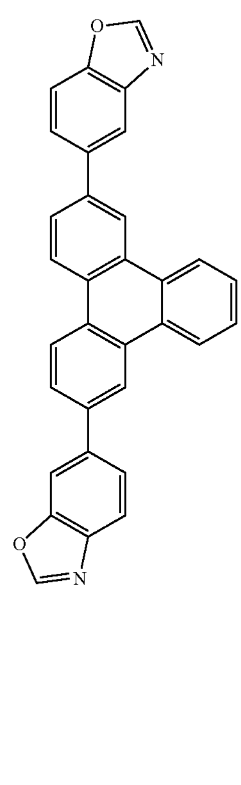
-continued
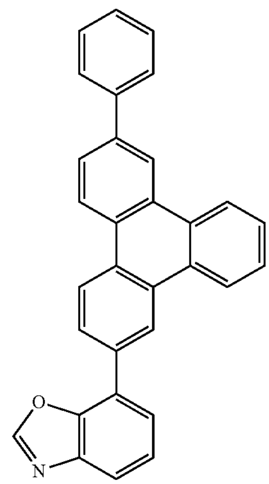
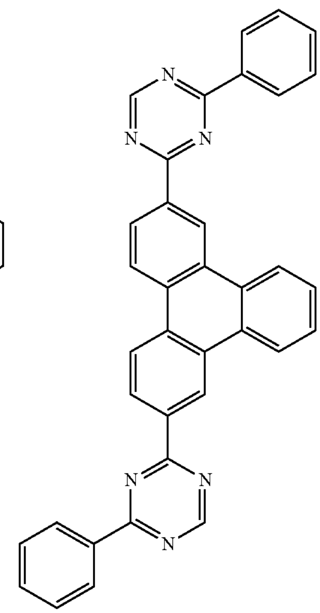
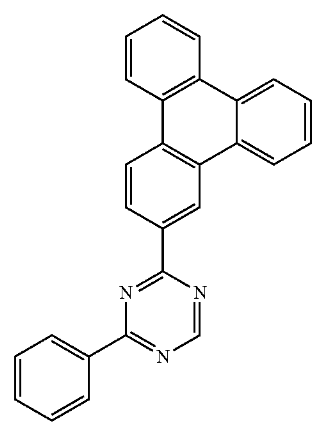
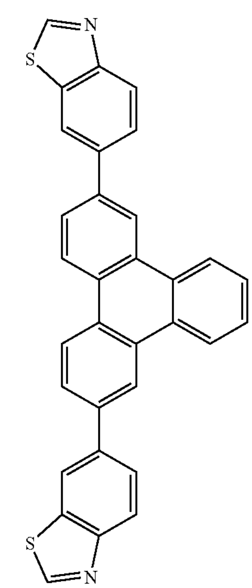
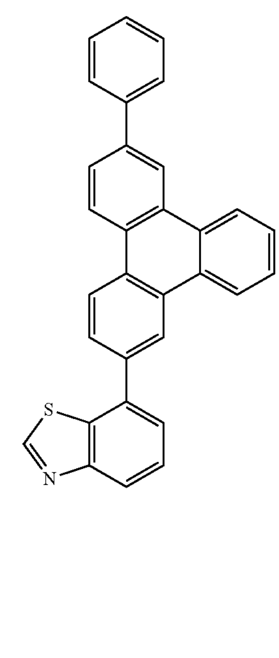

-continued
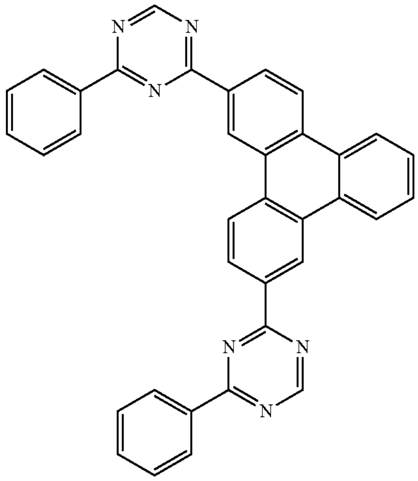
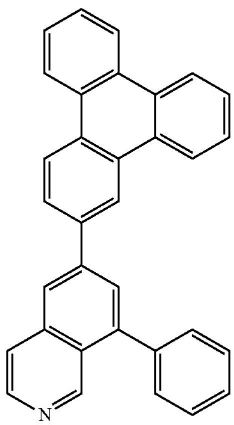
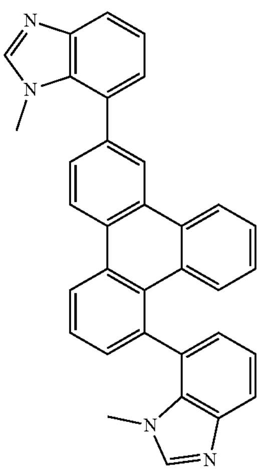
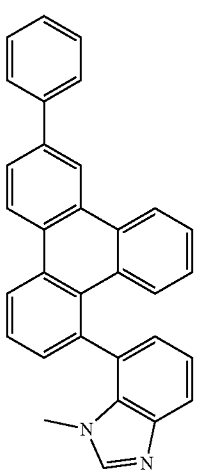
-continued
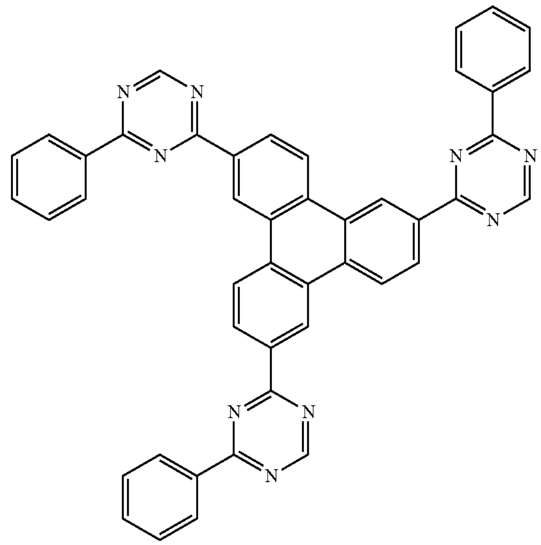
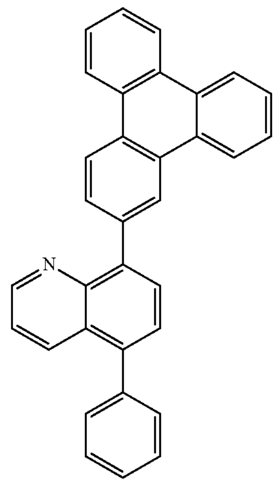
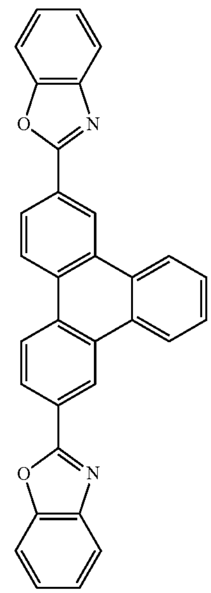
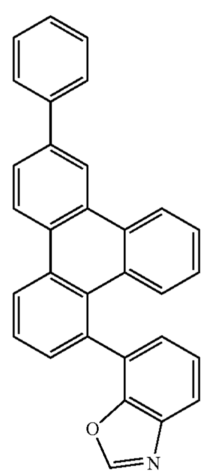

-continued
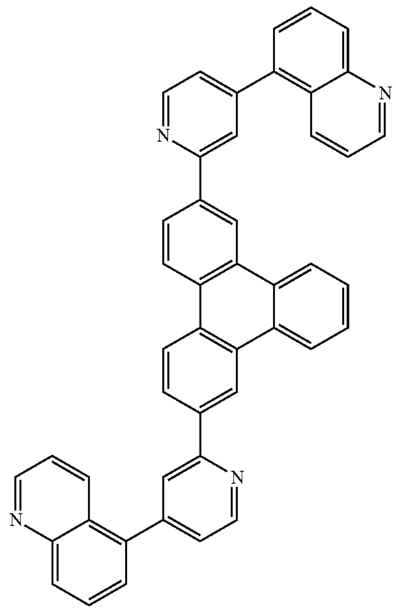
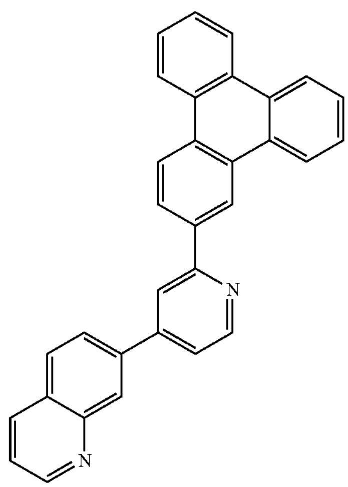
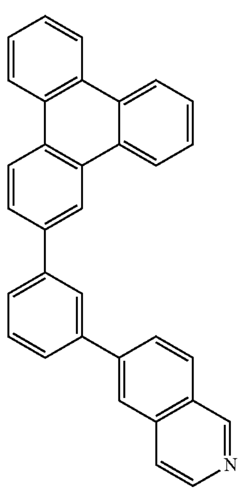
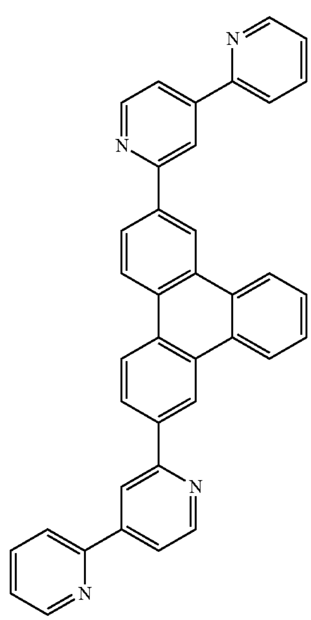
-continued
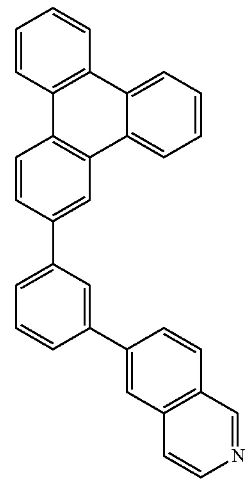
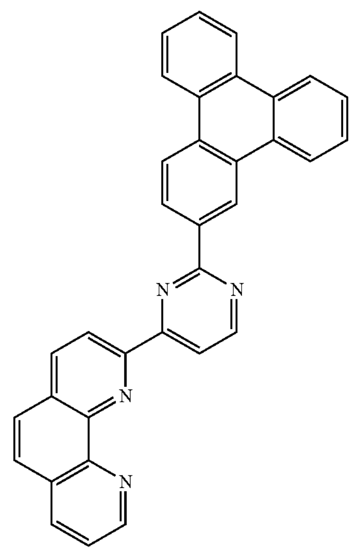
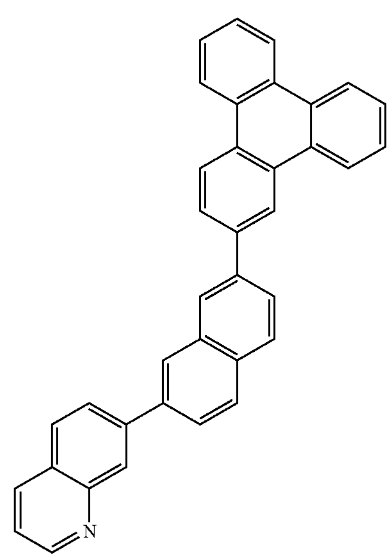

-continued
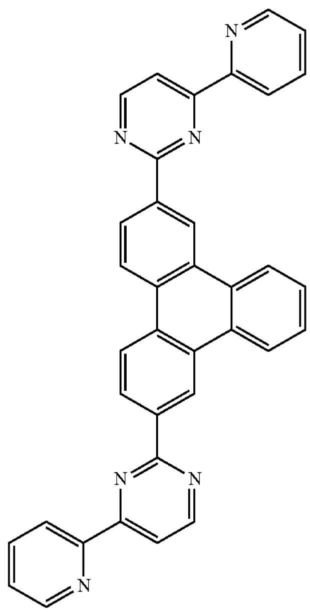
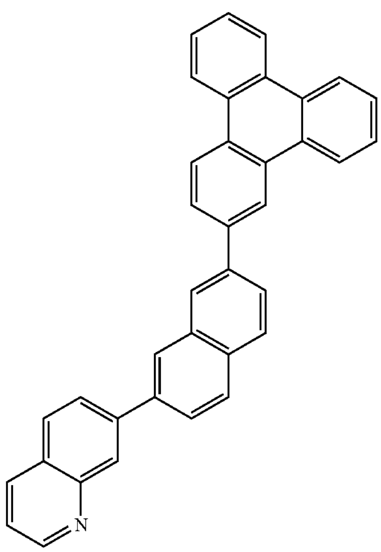
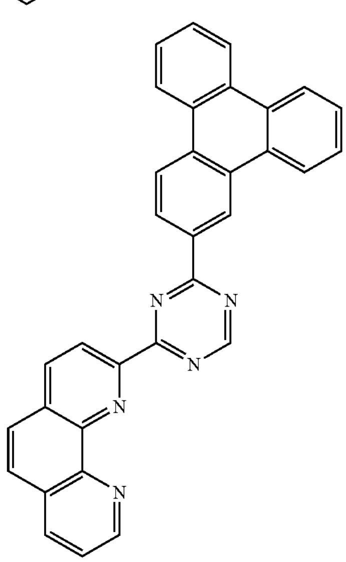
-continued
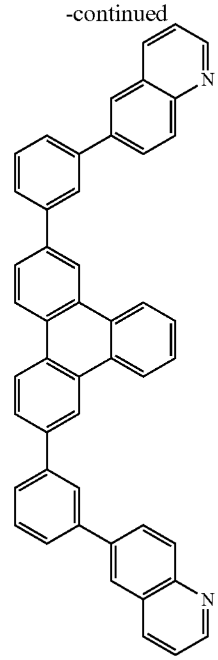
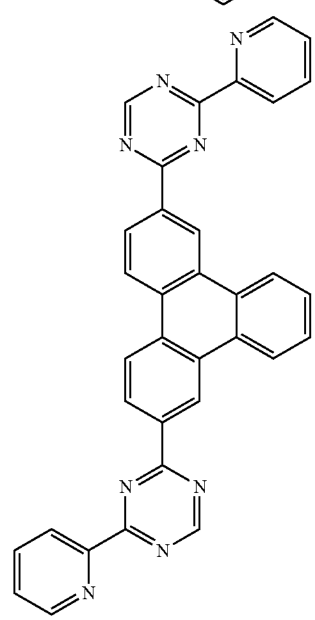
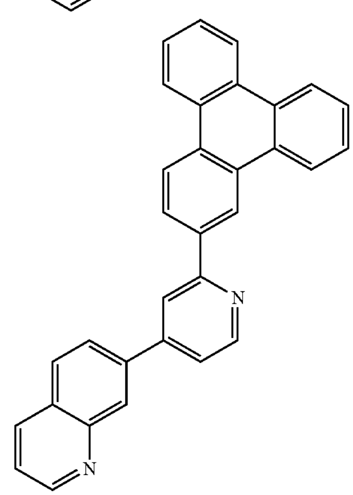

-continued
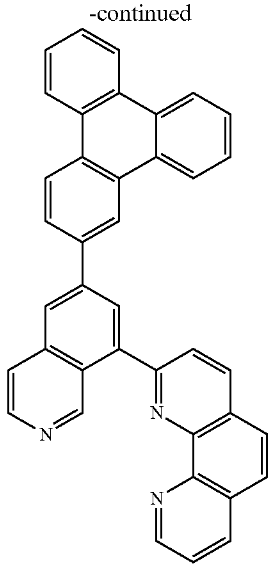
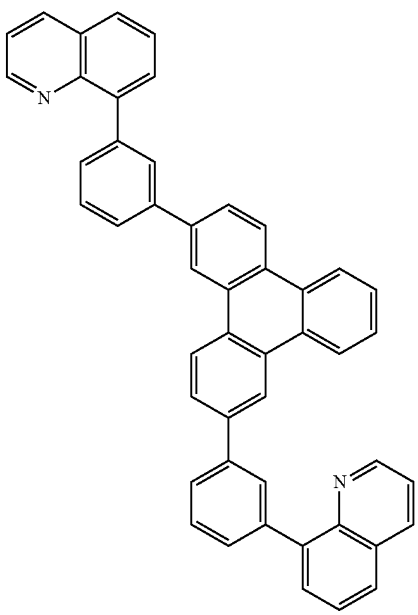
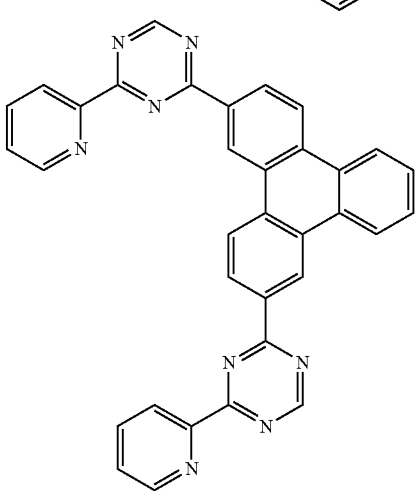
-continued
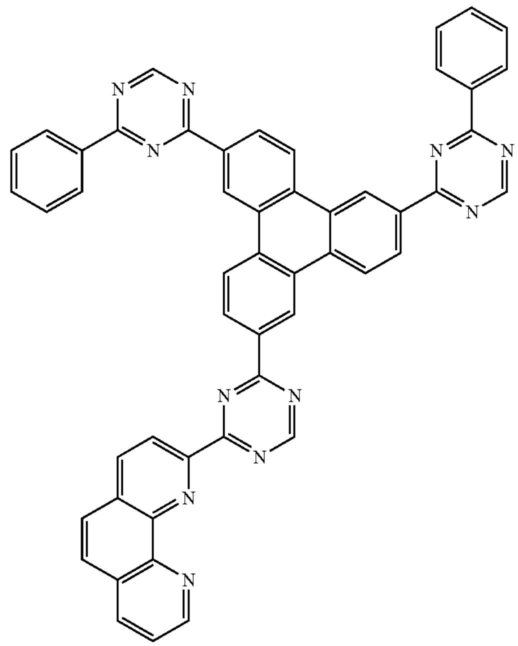
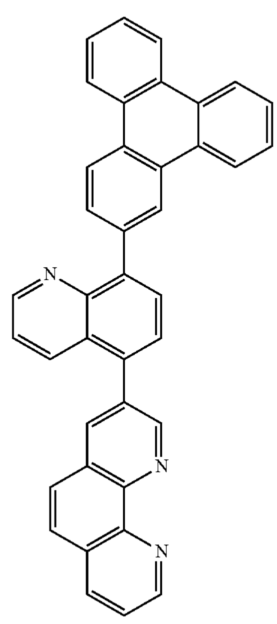

-continued
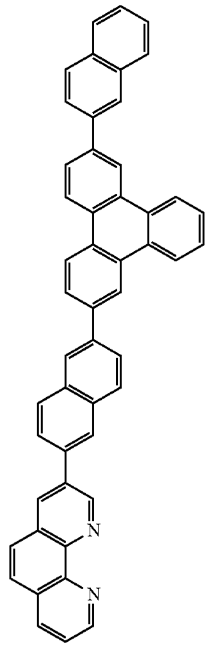
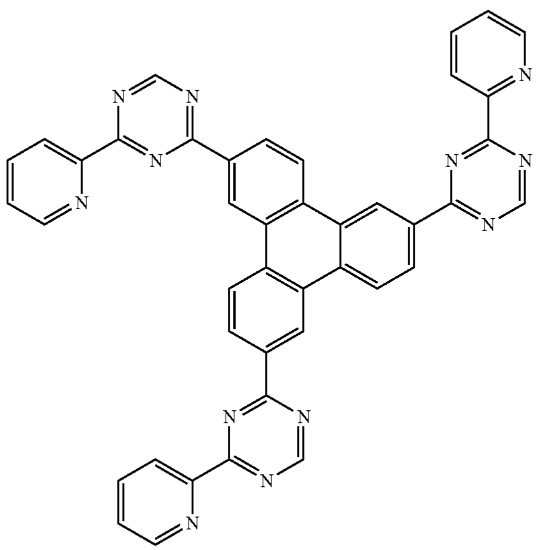
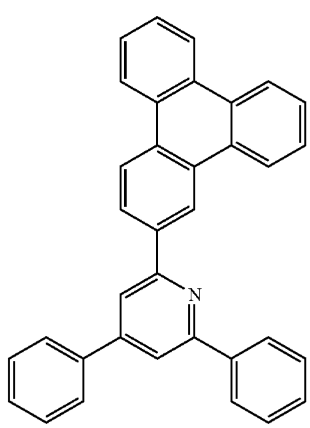
-continued
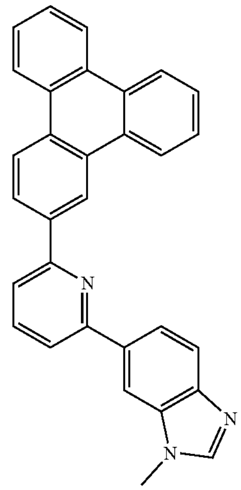
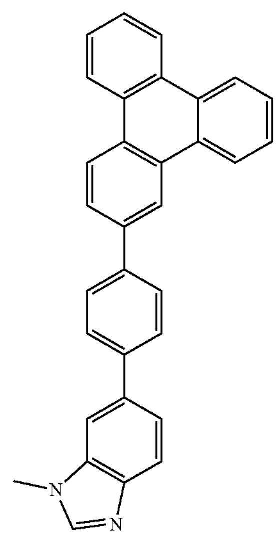
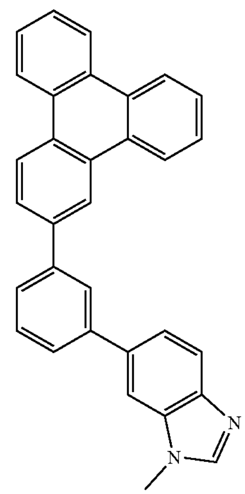
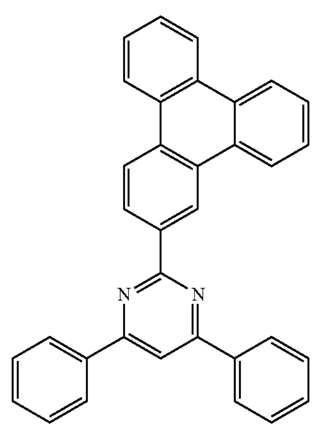
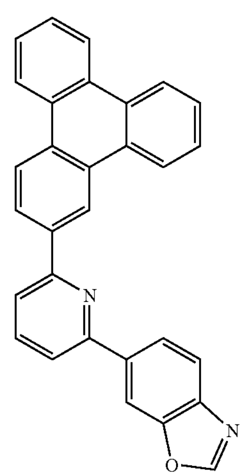

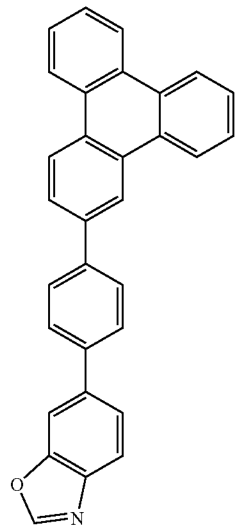
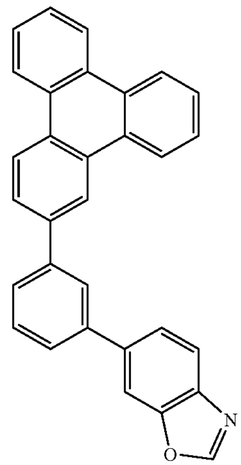
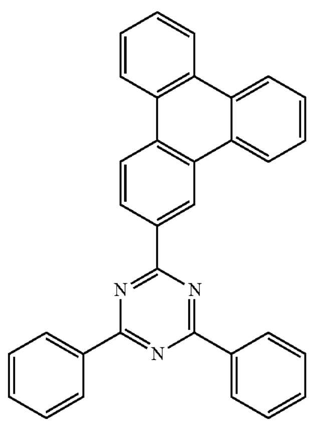
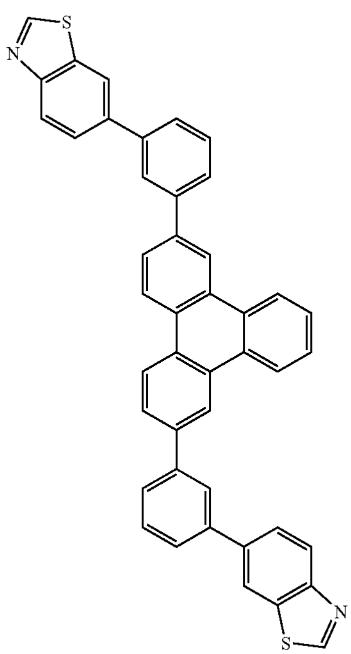
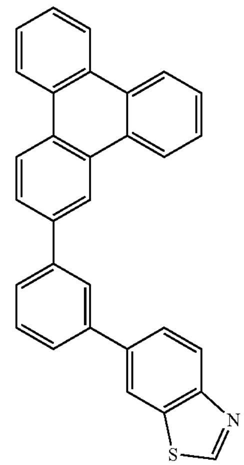
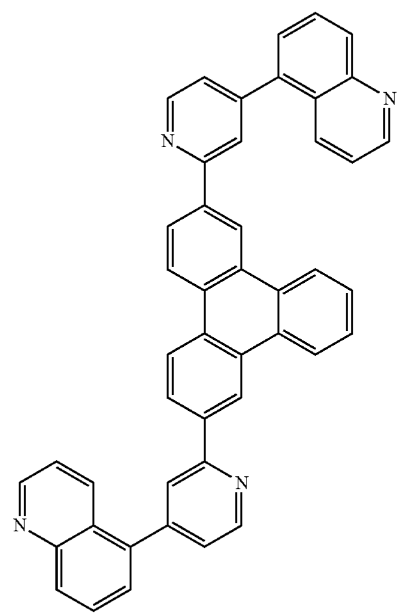
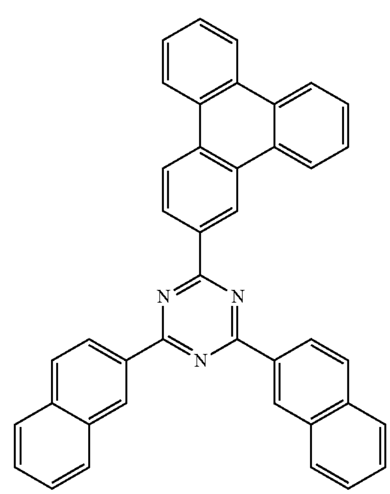

-continued
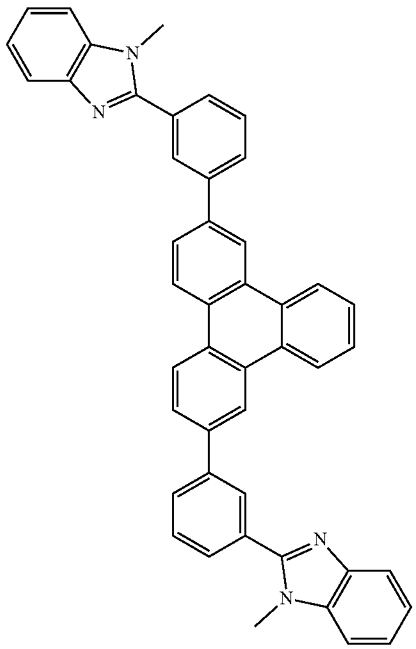
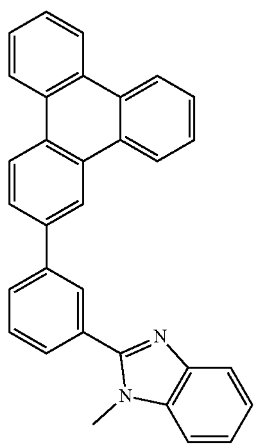
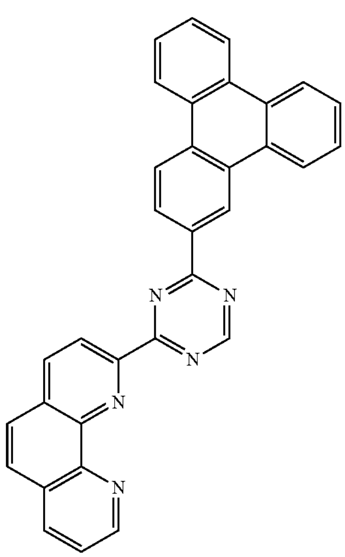
-continued
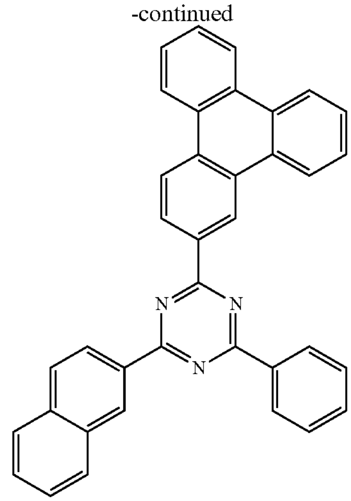
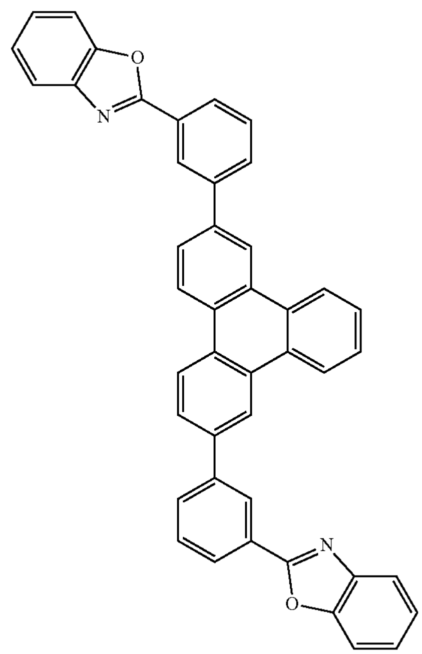
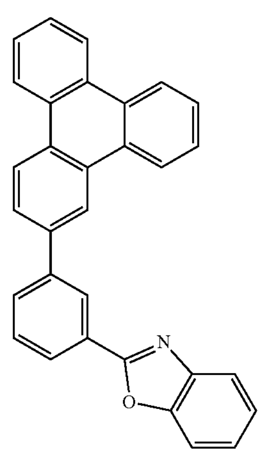

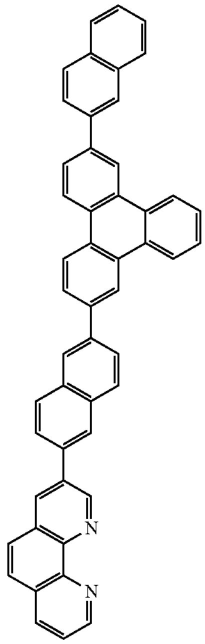
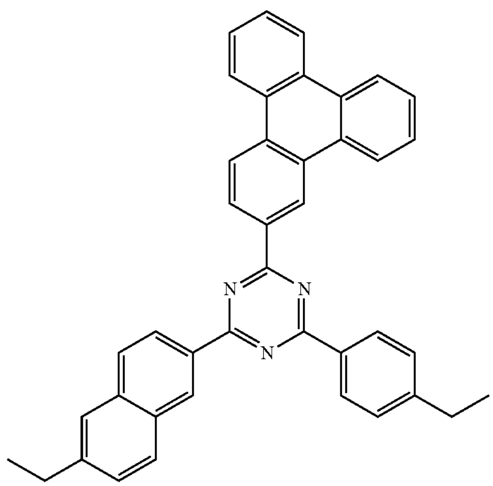
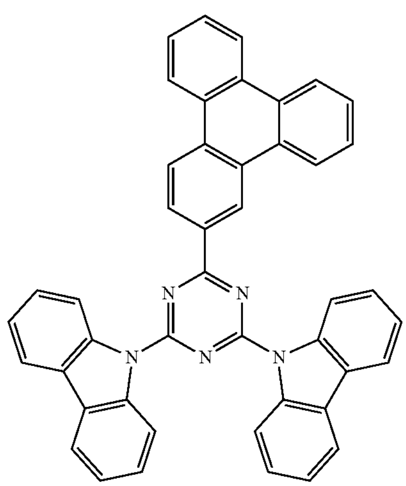
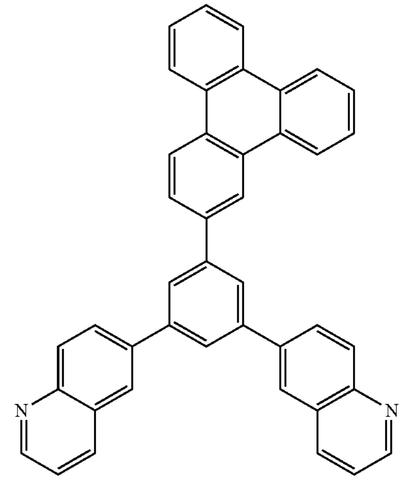
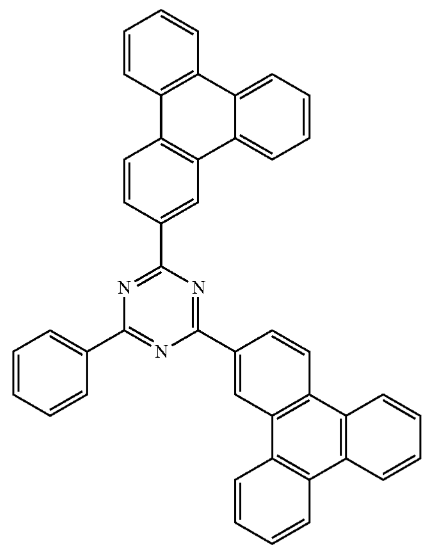
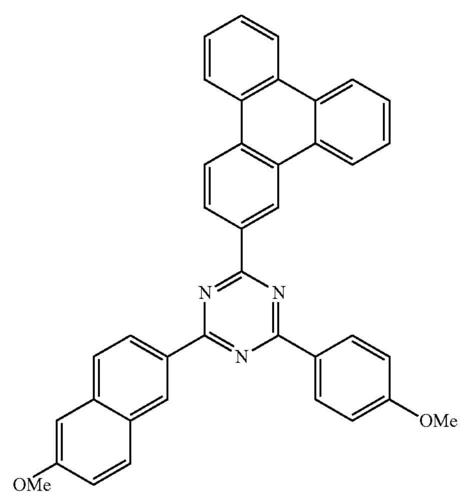
OMe
OMe -continued
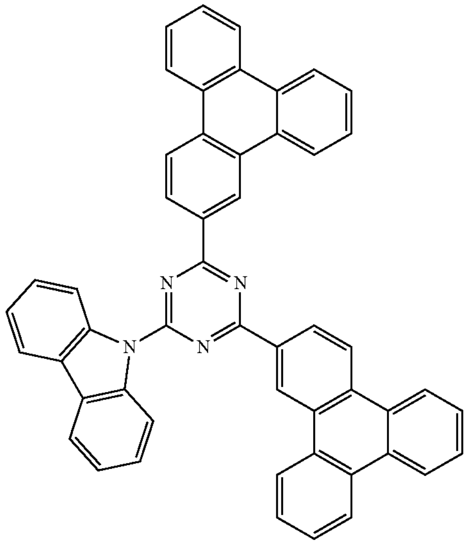
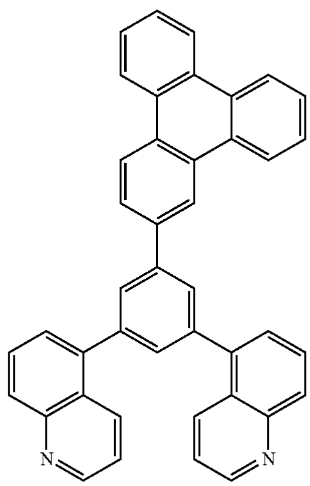
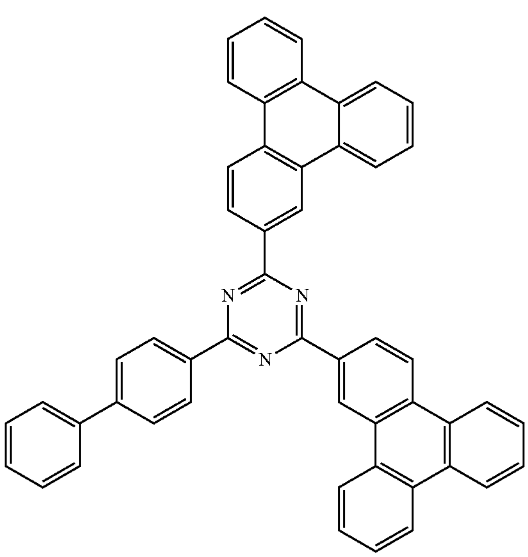
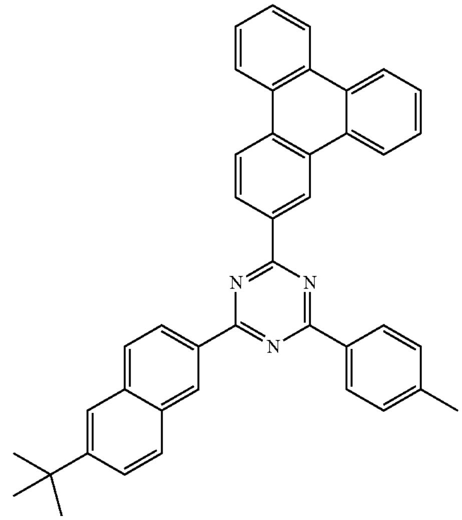
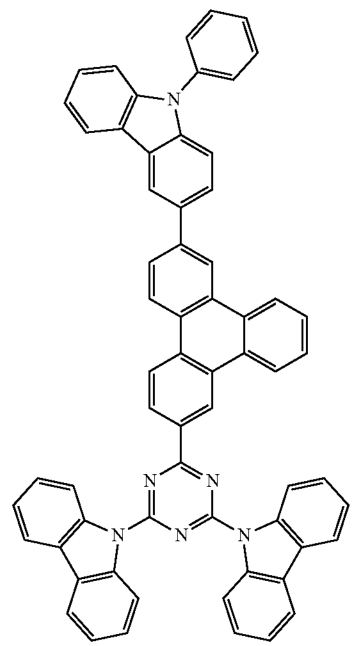
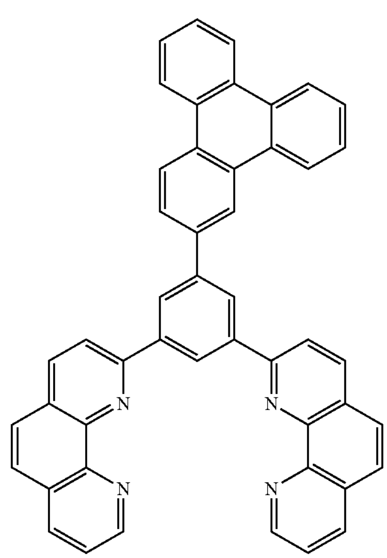

-continued
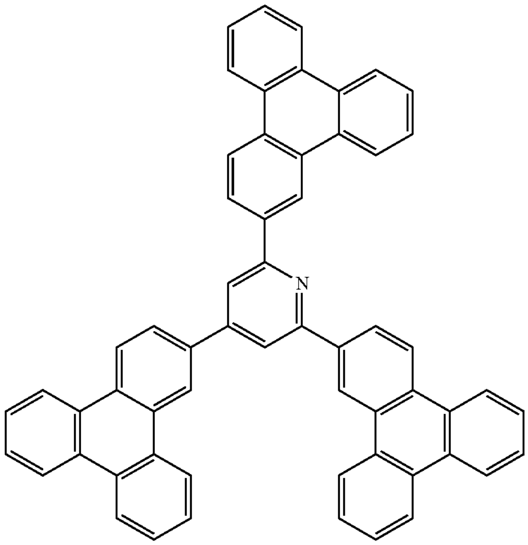
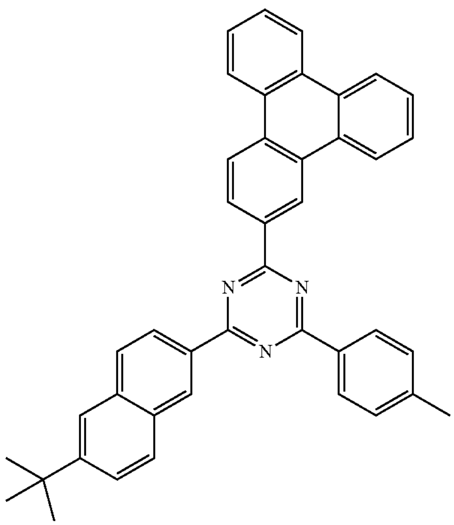
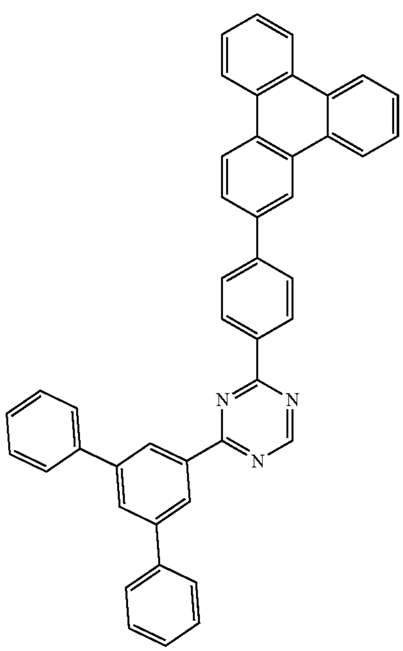
-continued
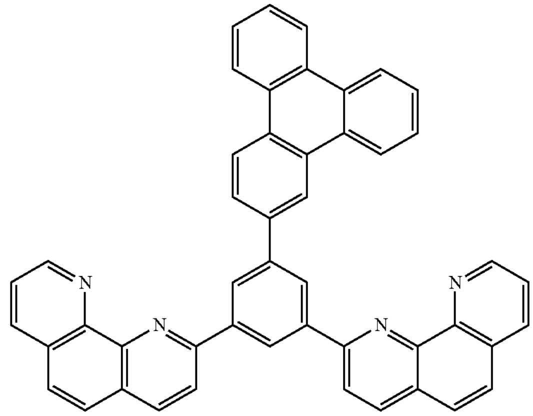
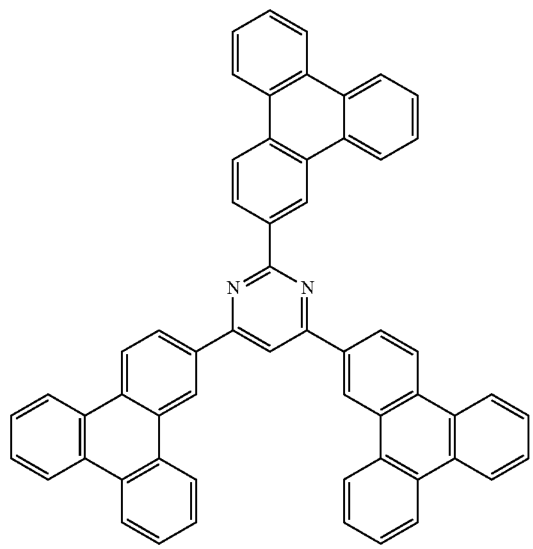
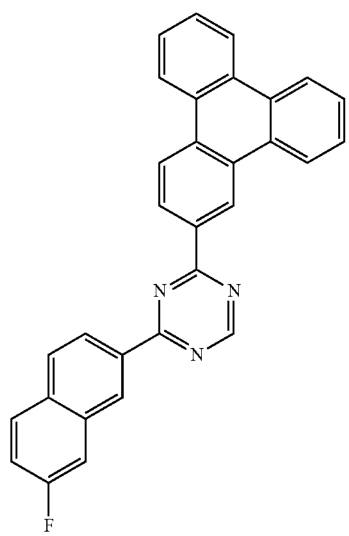

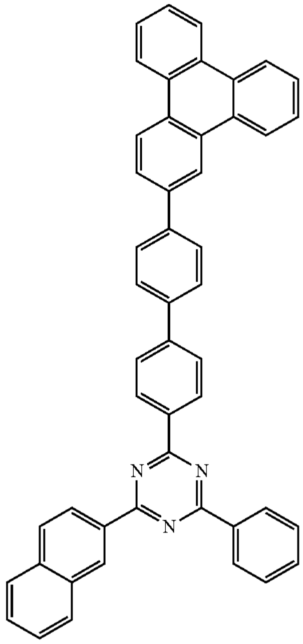
N
N
N
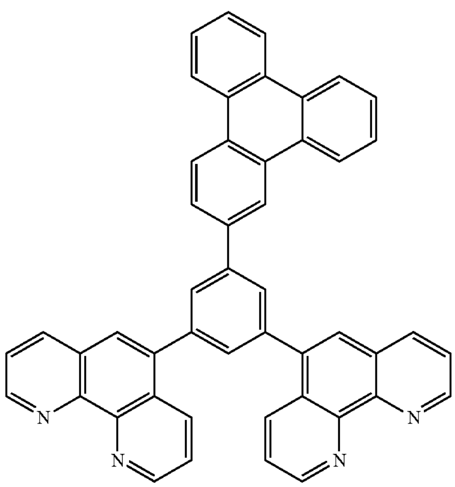
N
N
N
N
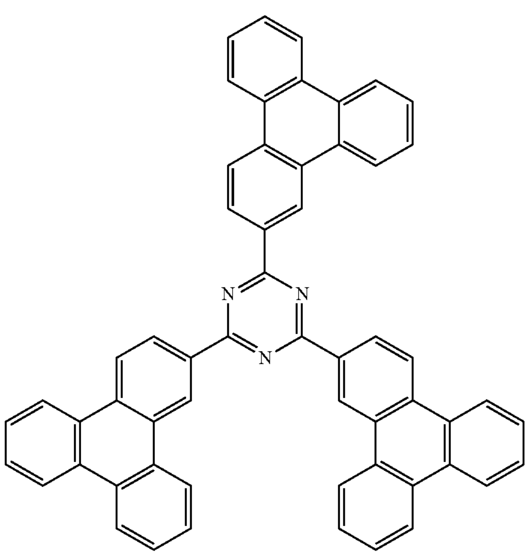
N
N
N
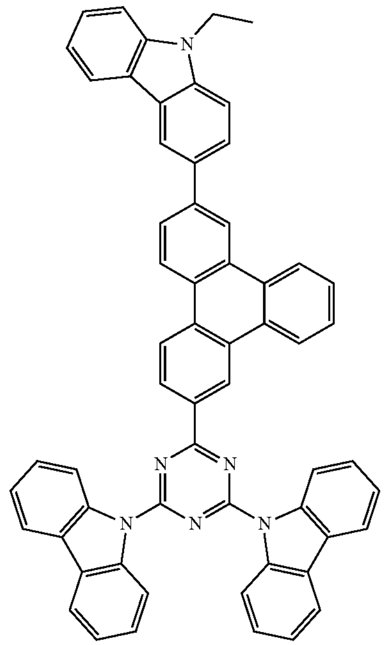
N
N
N
N
N
N
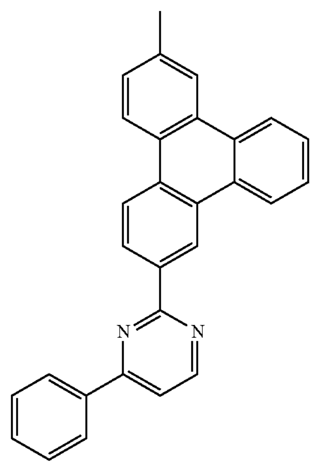
N
N
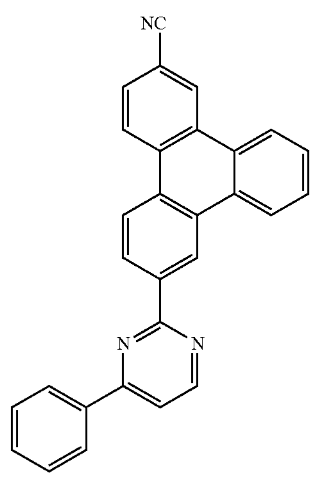
NC
N
N

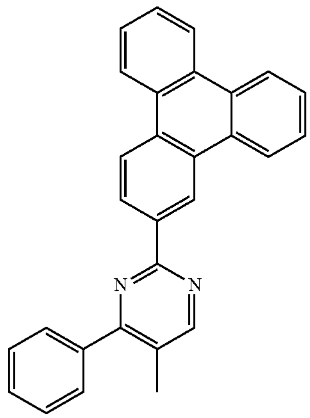
N
N
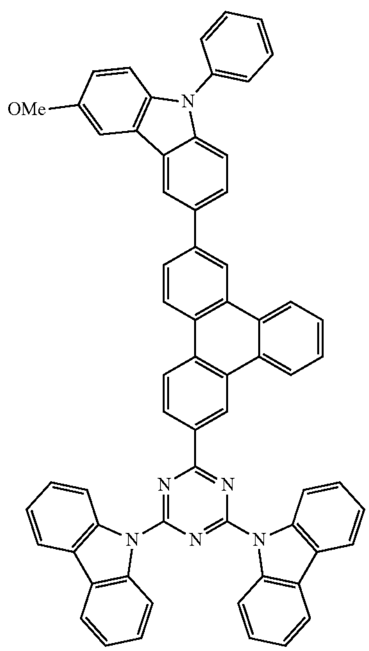
OMe
N
N
N
N
N
N
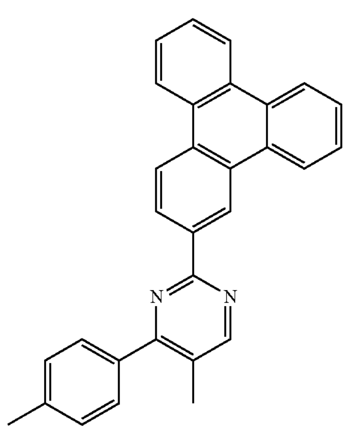
N
N
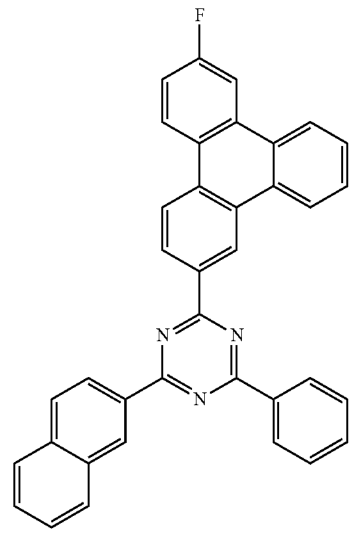
F
N
N
N
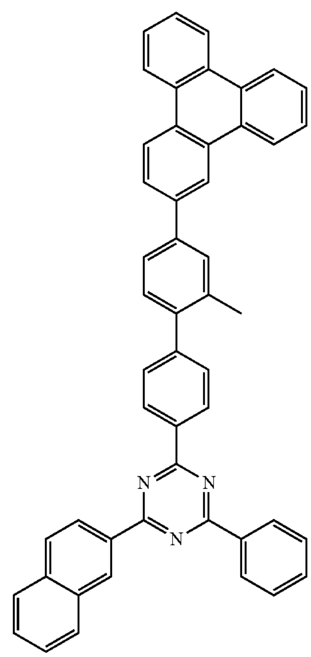
N
N
N

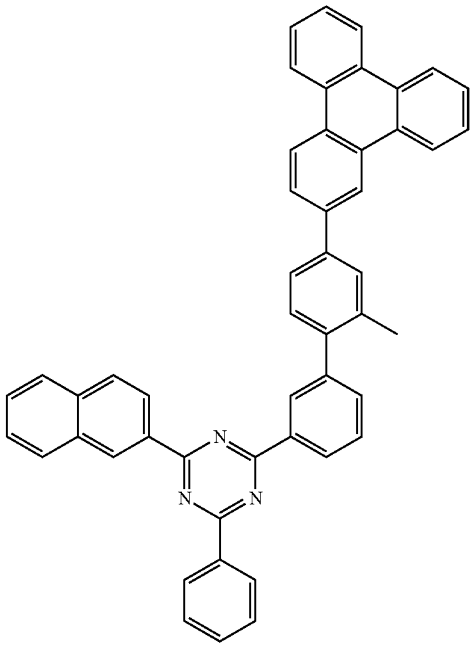
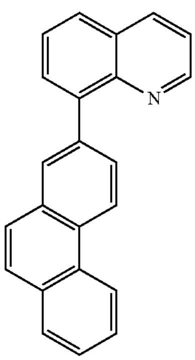
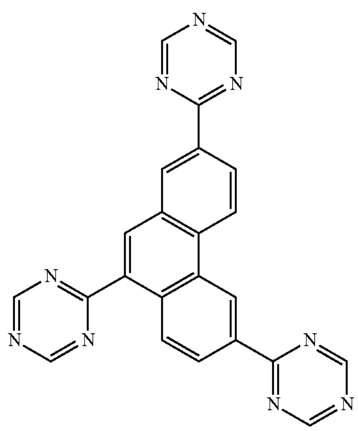
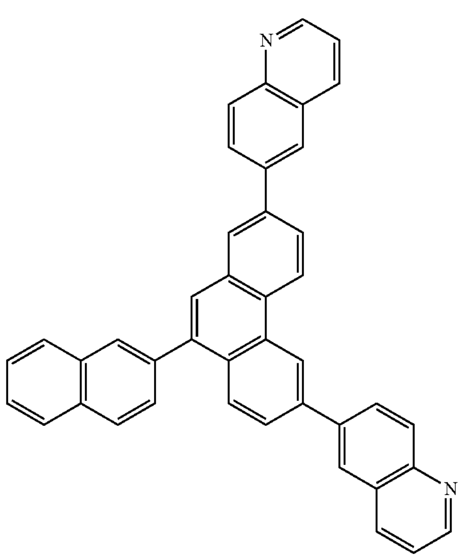
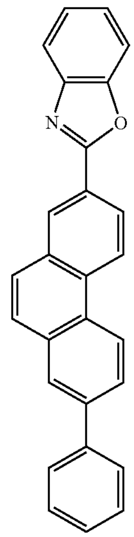
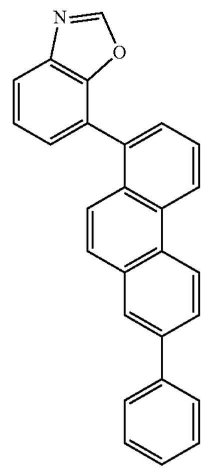
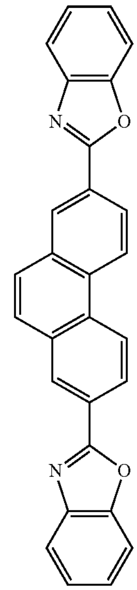
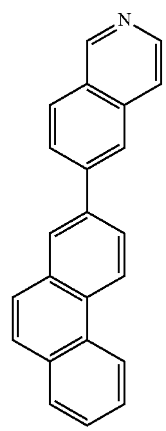
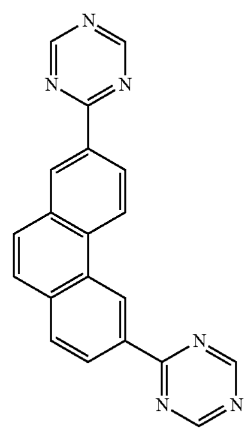
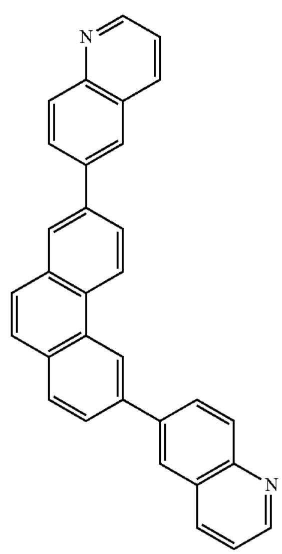
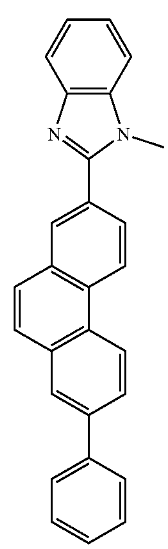

-continued
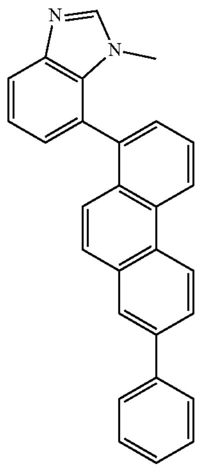
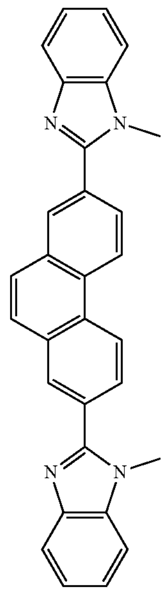
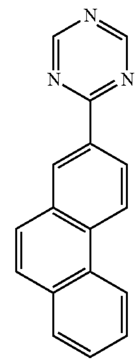
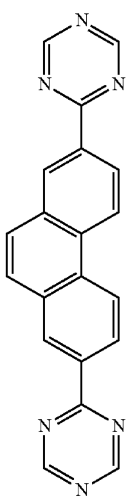
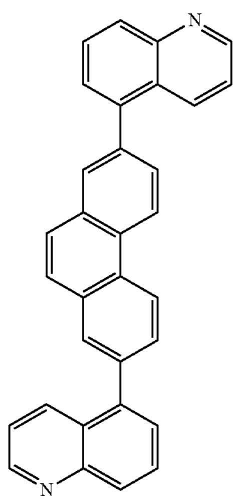
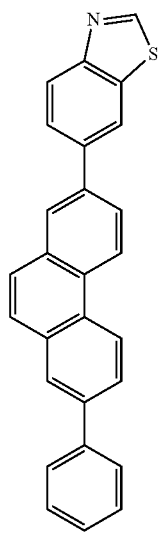
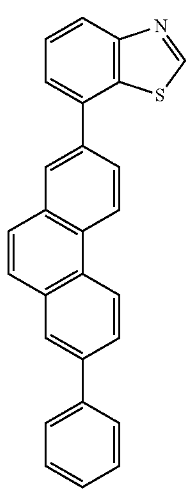
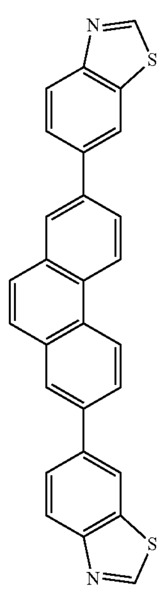
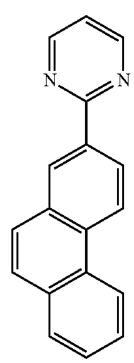
-continued
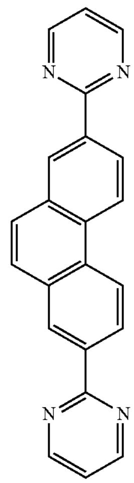
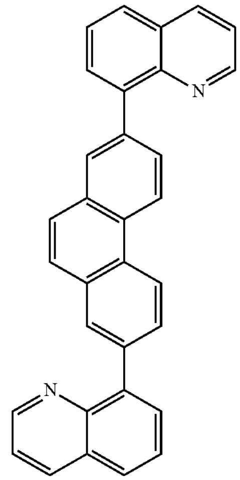
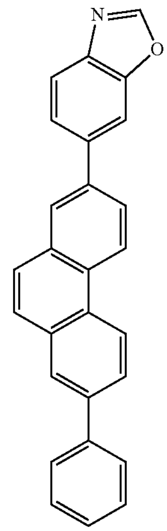
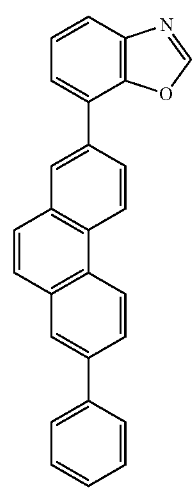
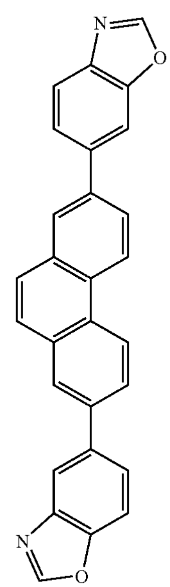
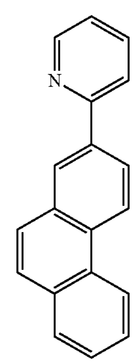

-continued
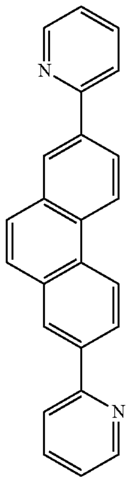
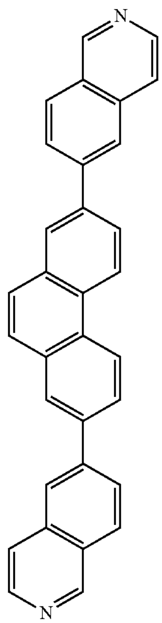
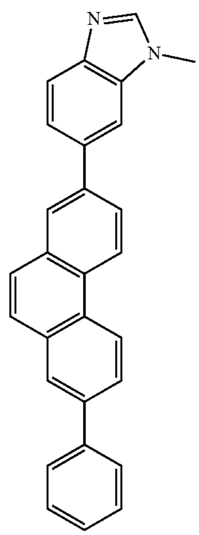
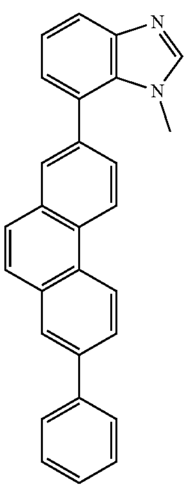
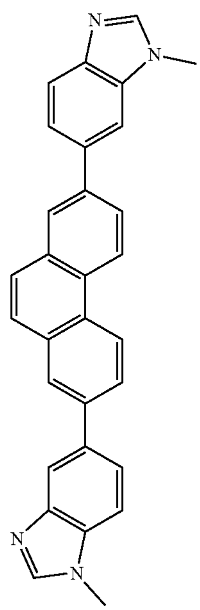
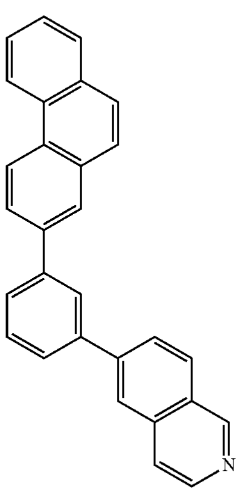
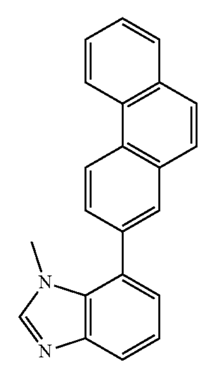
-continued
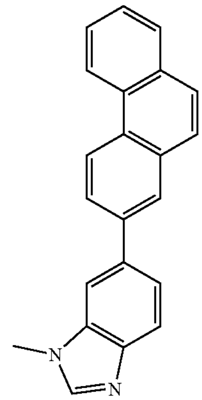
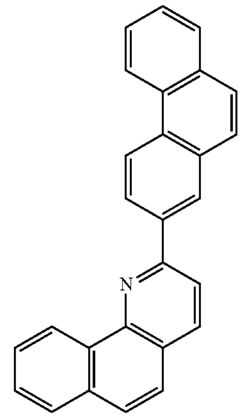
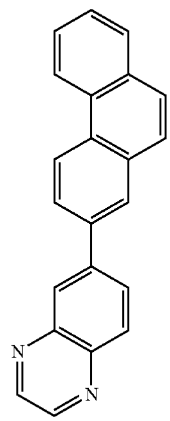
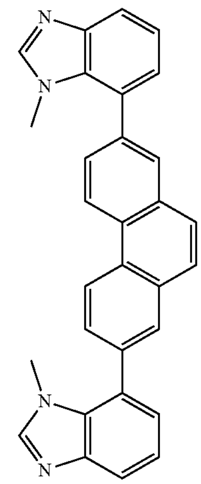
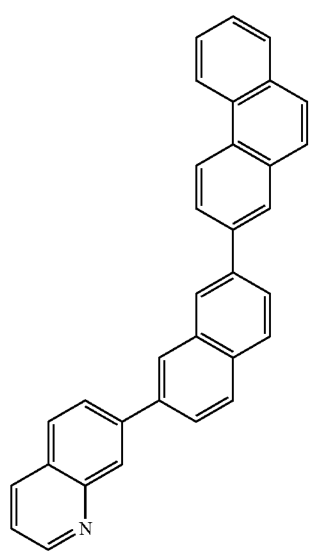
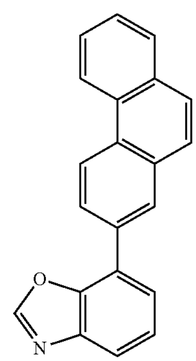

-continued
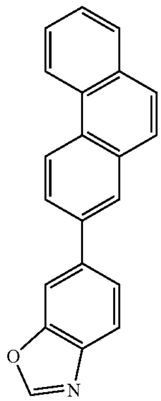
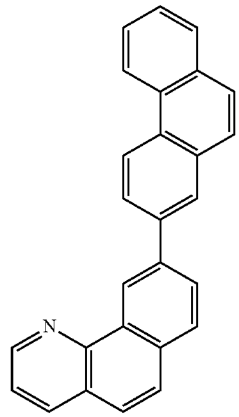
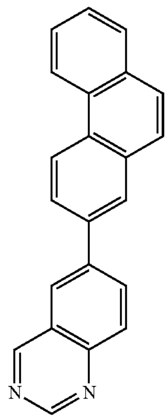
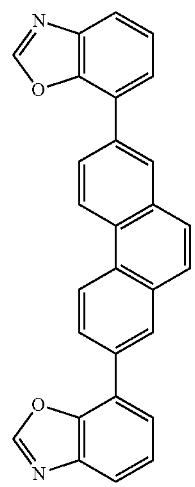
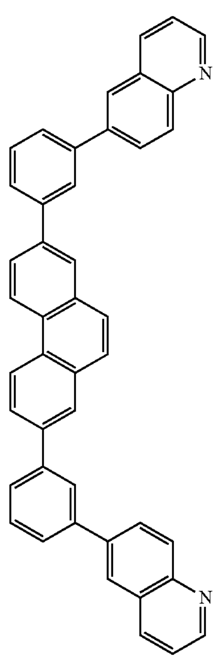
-continued
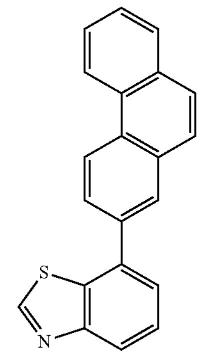
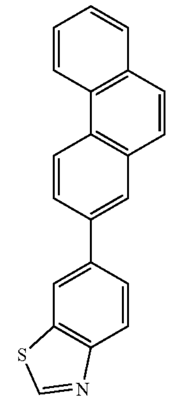
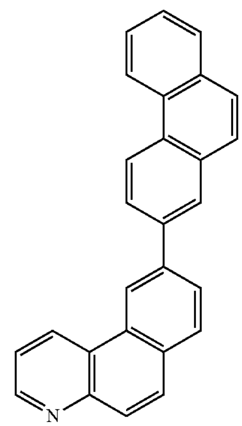
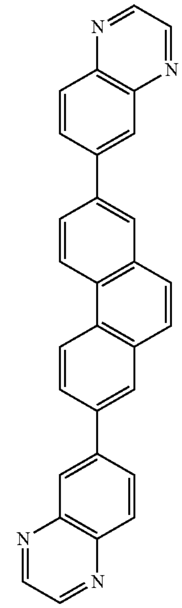
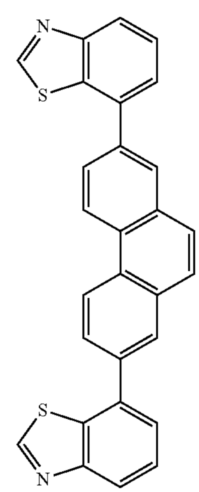

-continued
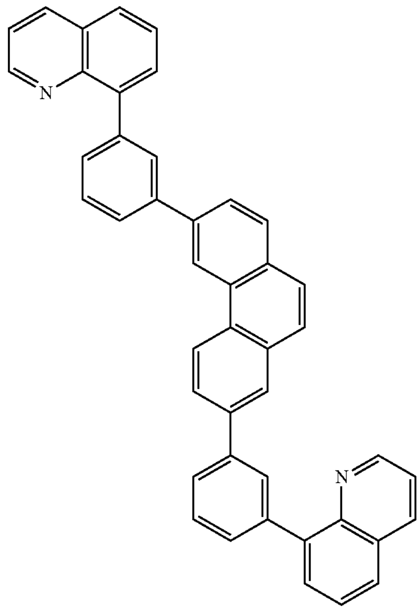
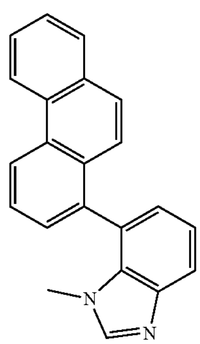
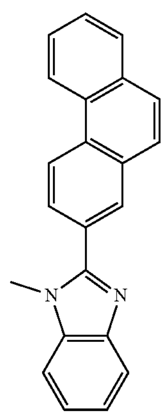
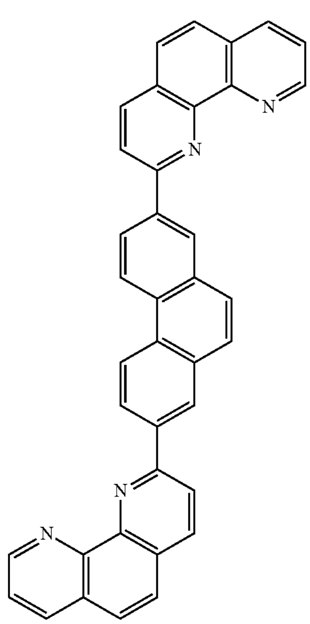
-continued
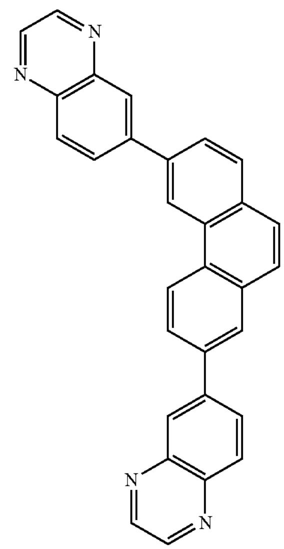
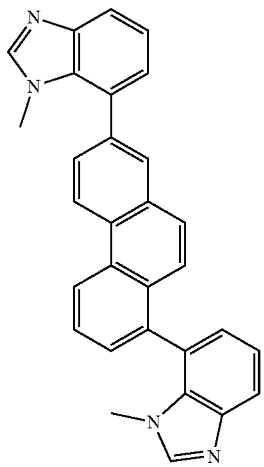
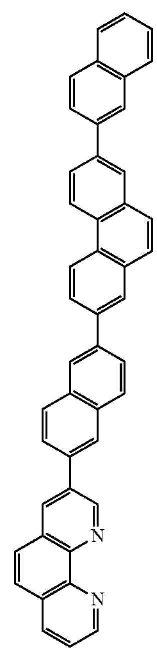
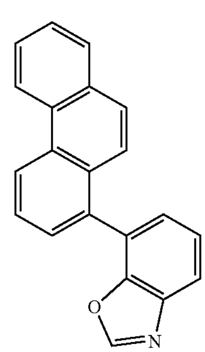
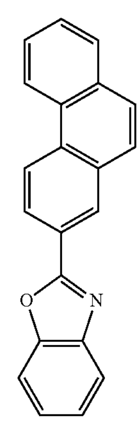

-continued
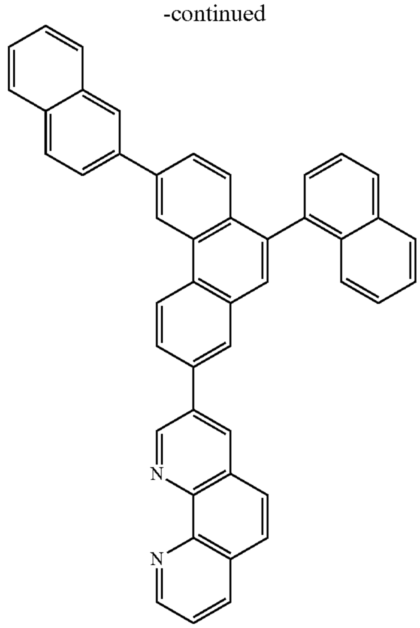
-continued
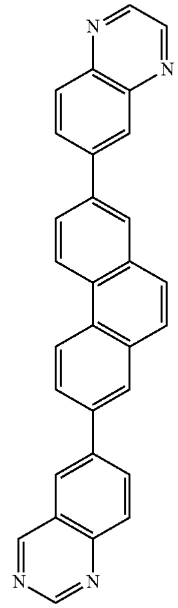
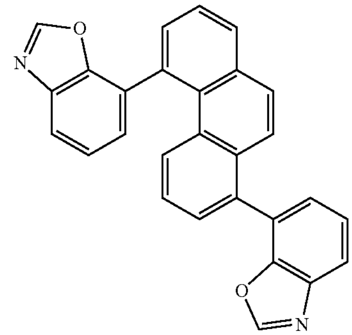
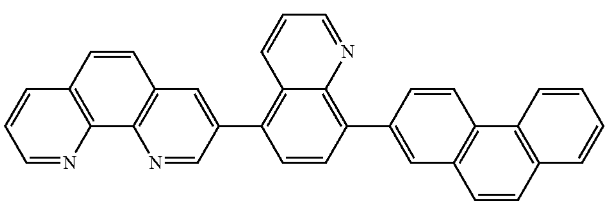
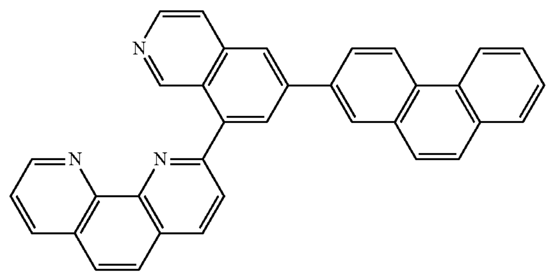
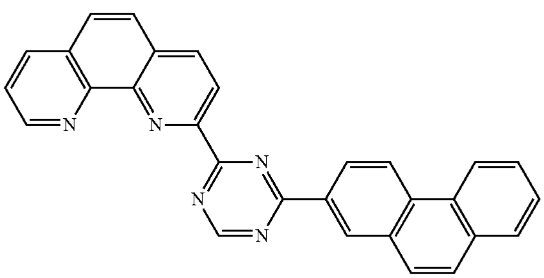
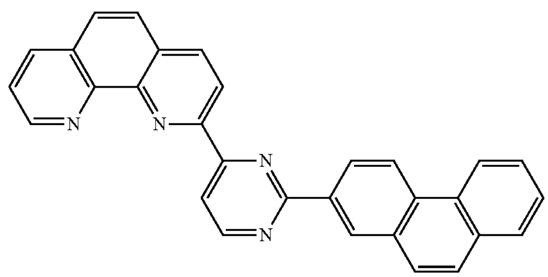
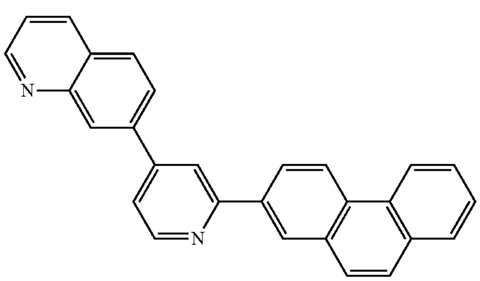
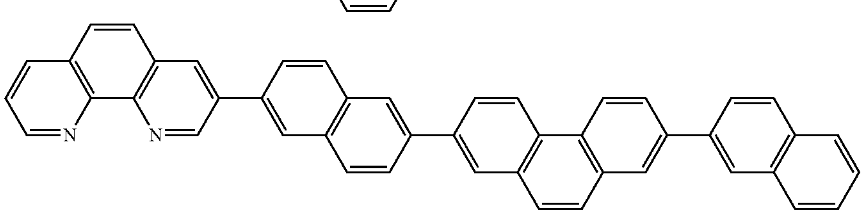

-continued
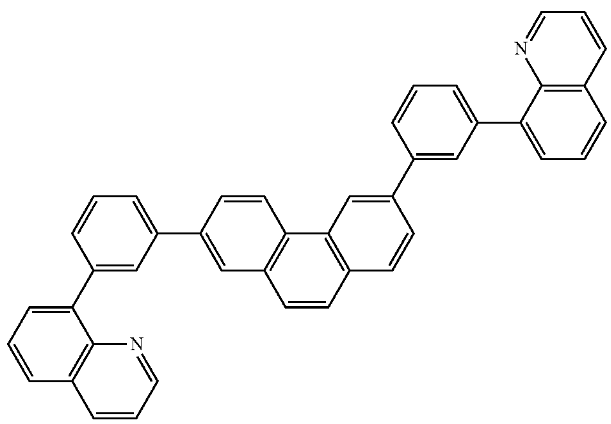
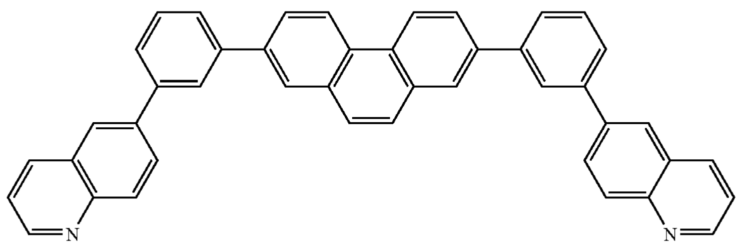
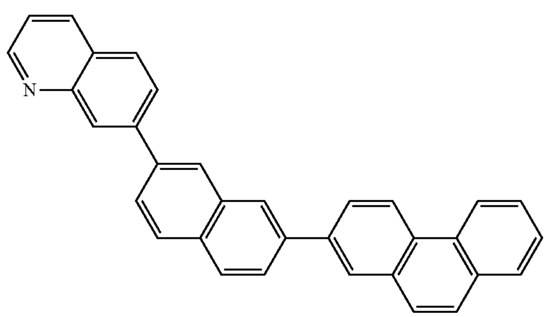
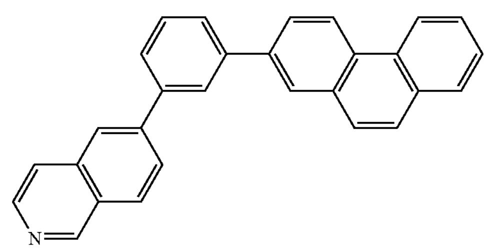
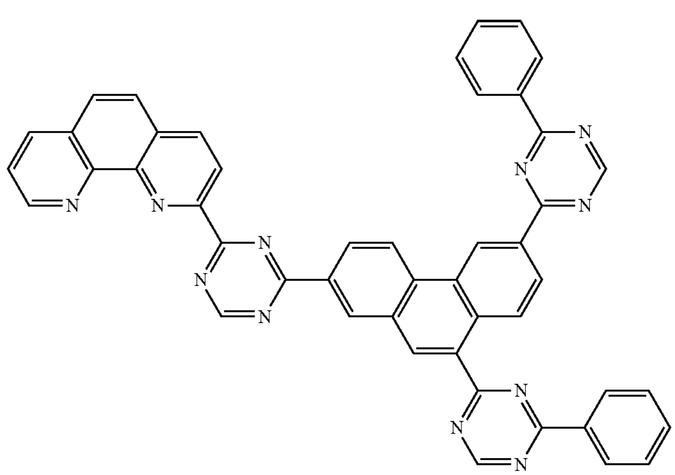

-continued
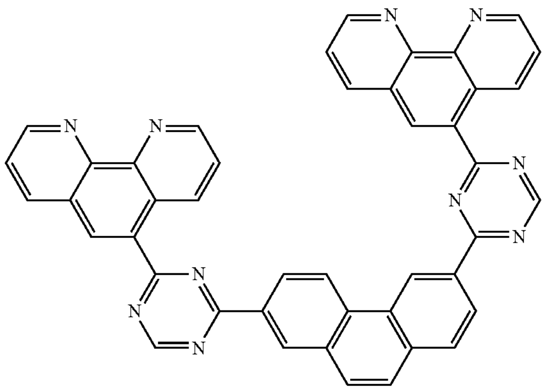
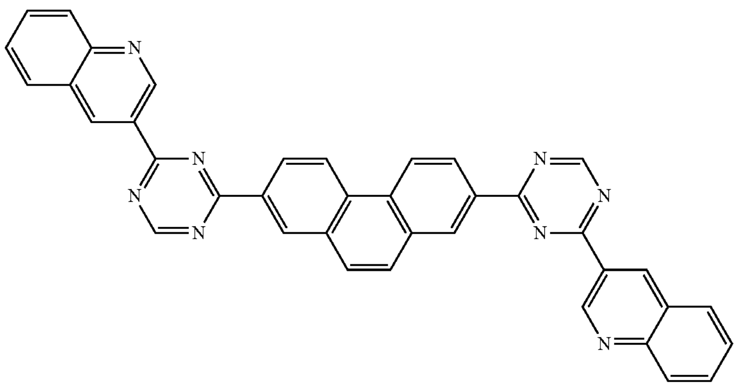
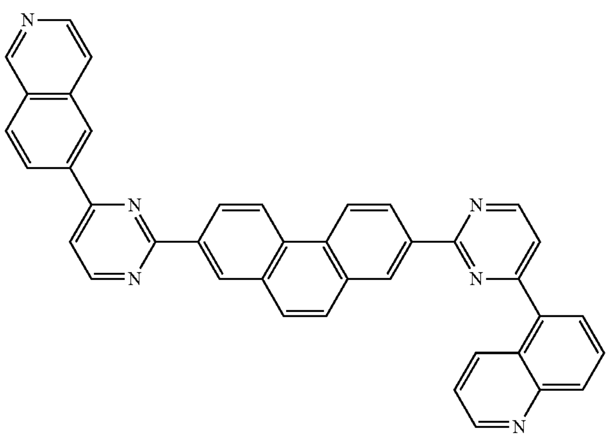
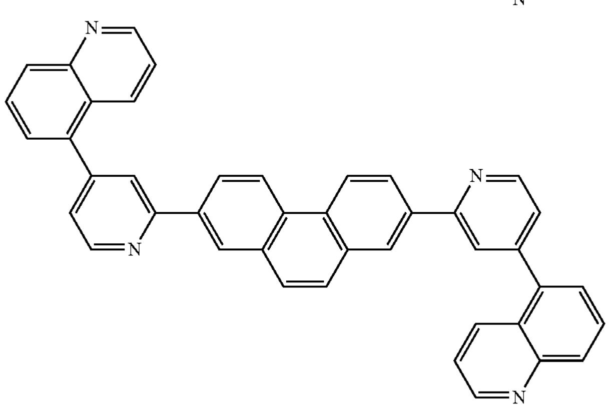

-continued
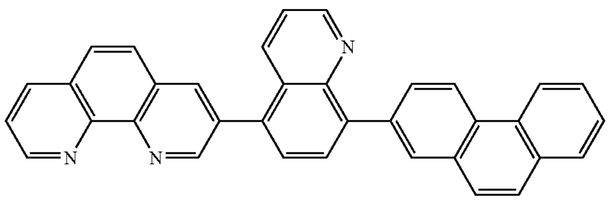
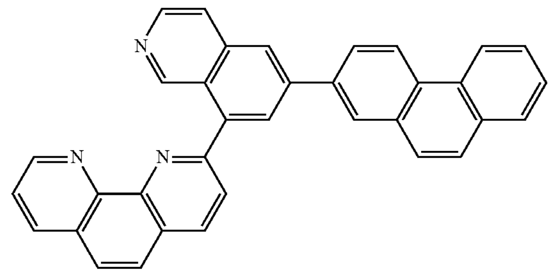
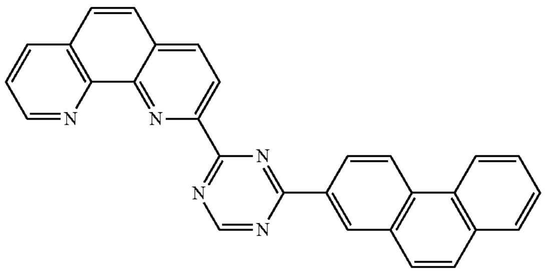
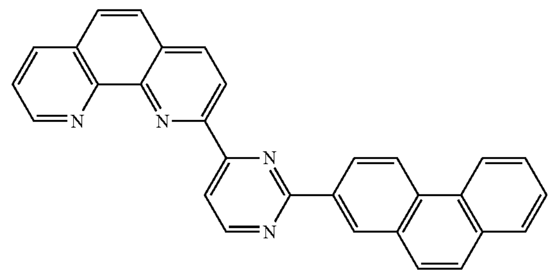
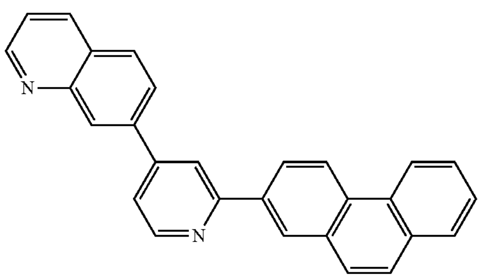
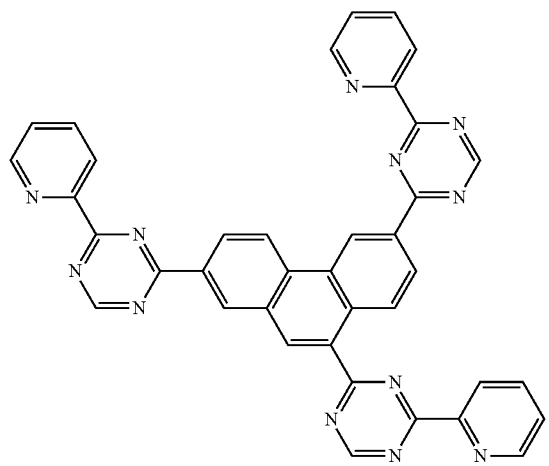
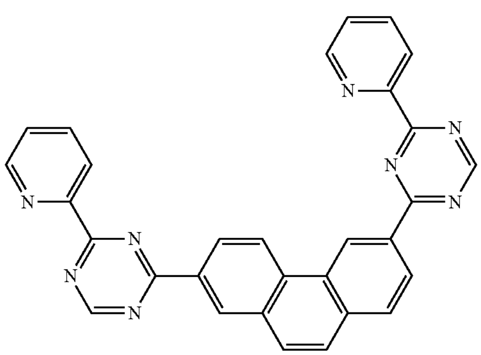
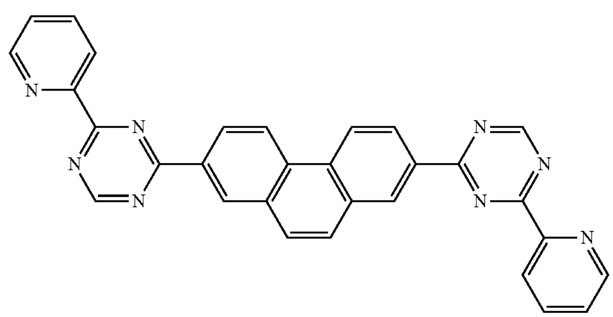
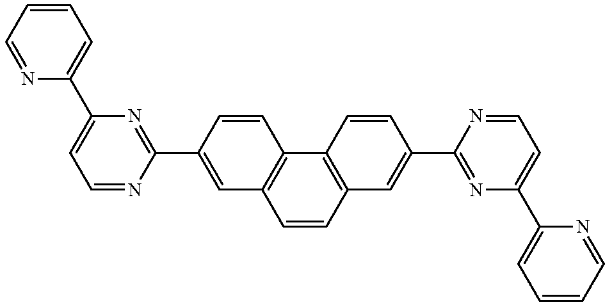

-continued
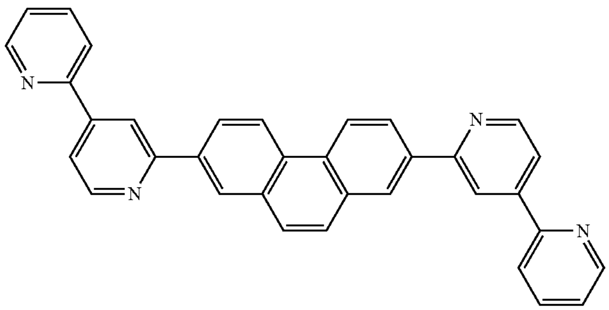
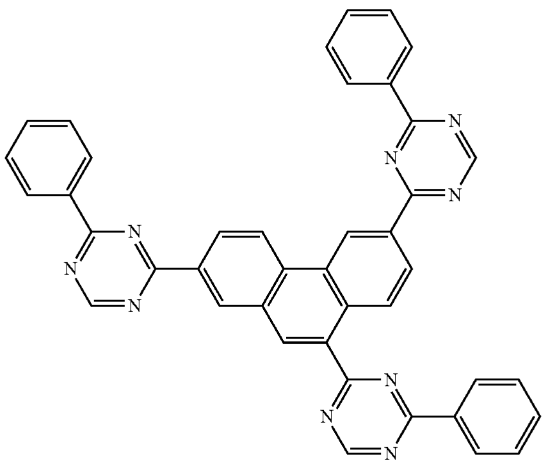
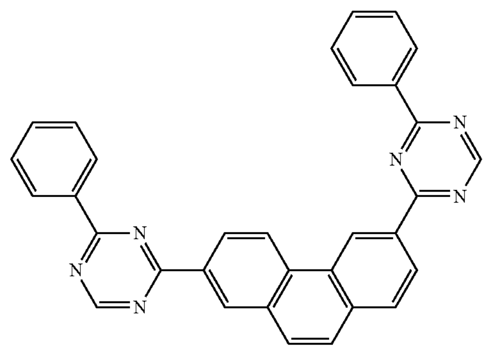
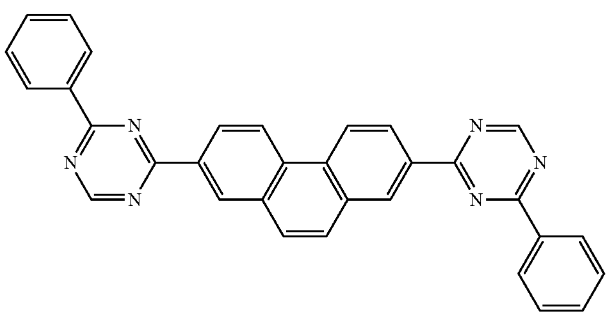
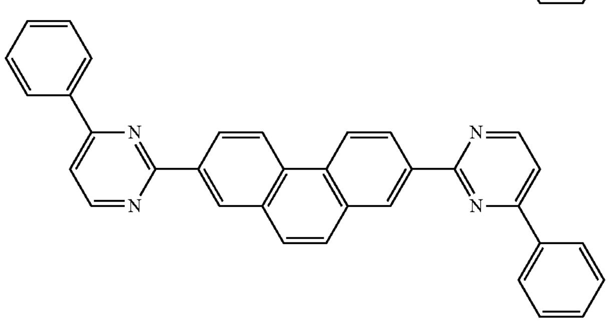
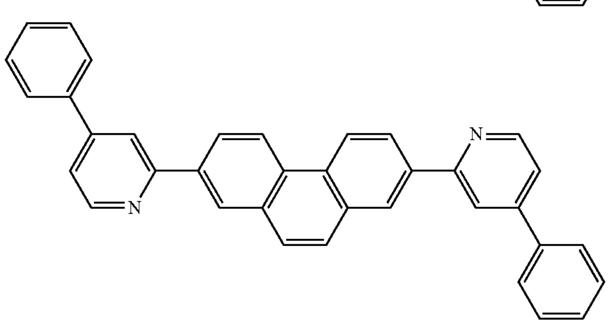
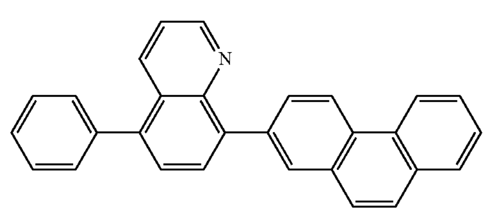

-continued
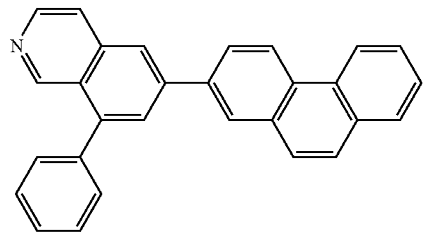
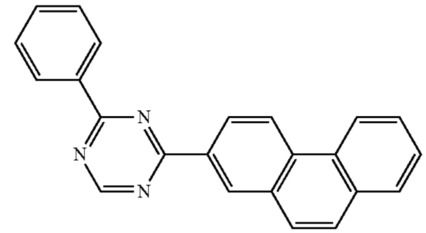
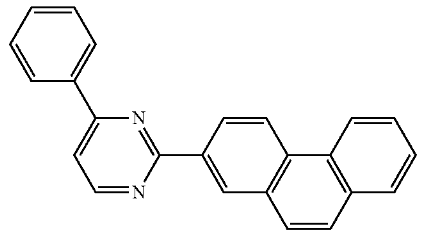
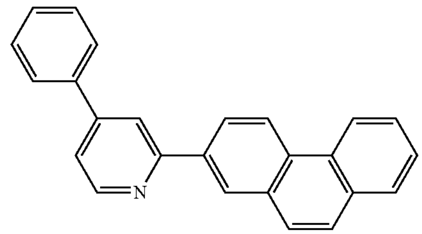
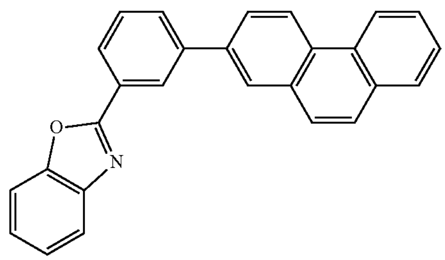
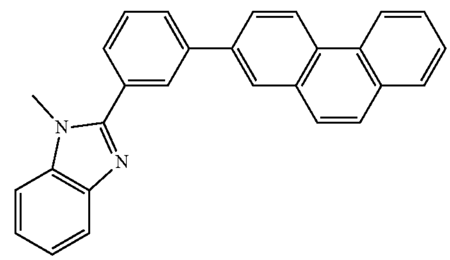
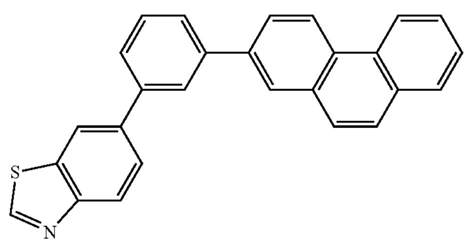
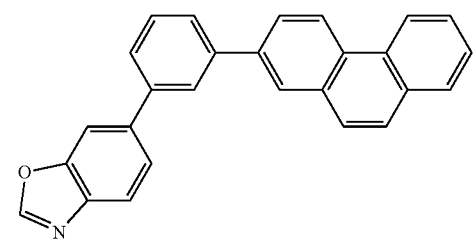
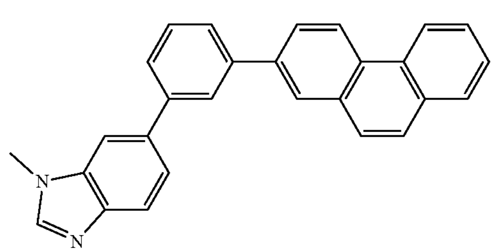
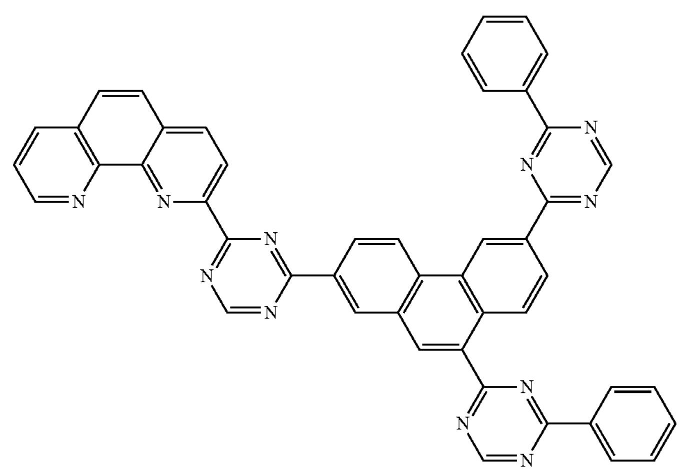

-continued
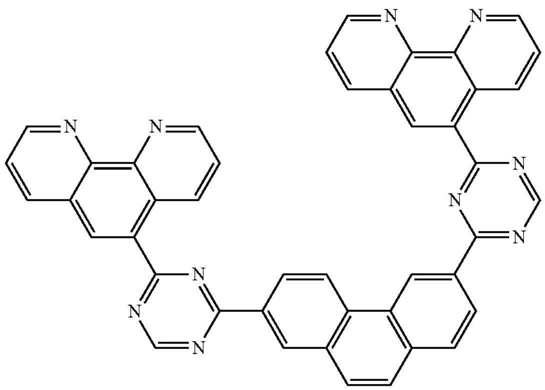
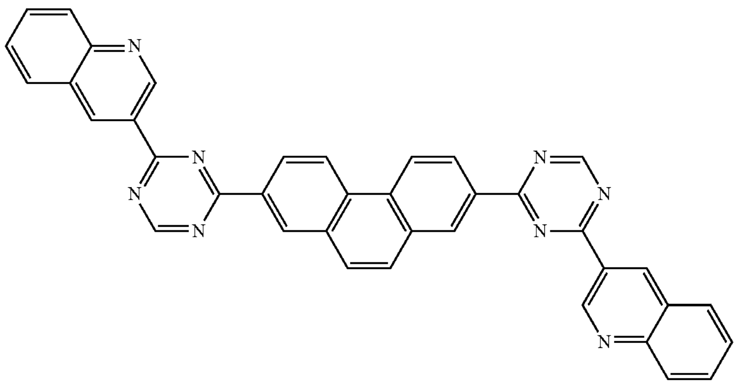
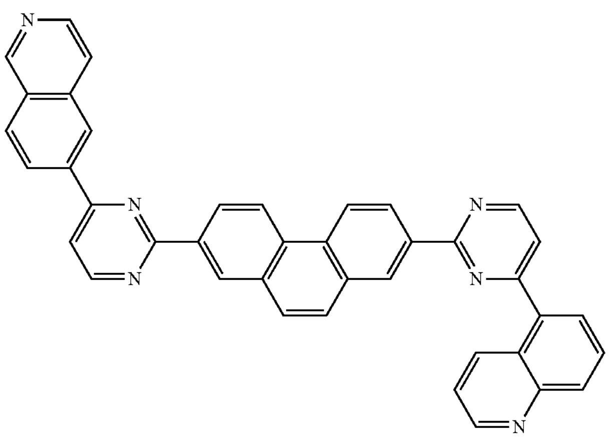
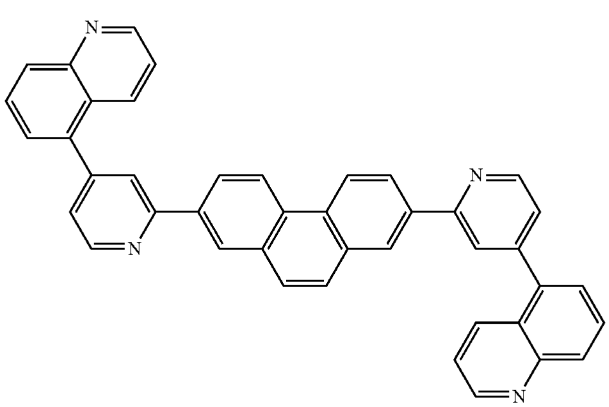
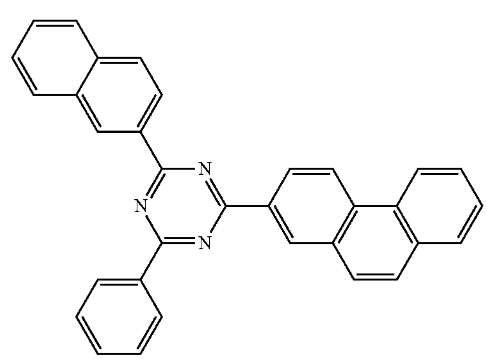

-continued
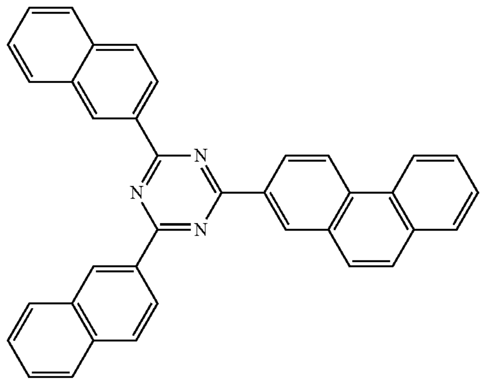
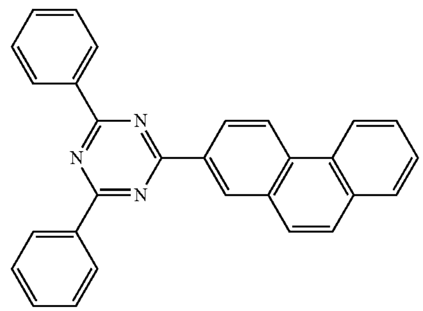
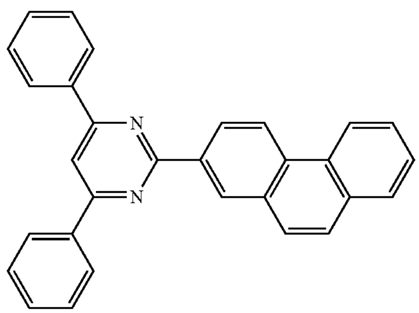
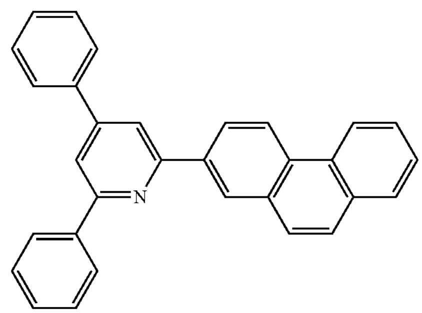
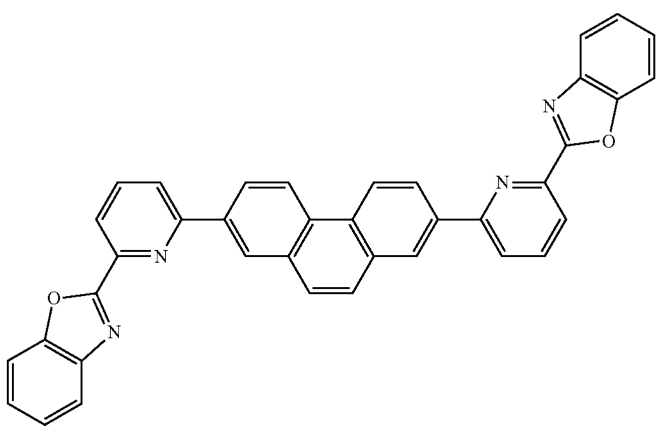
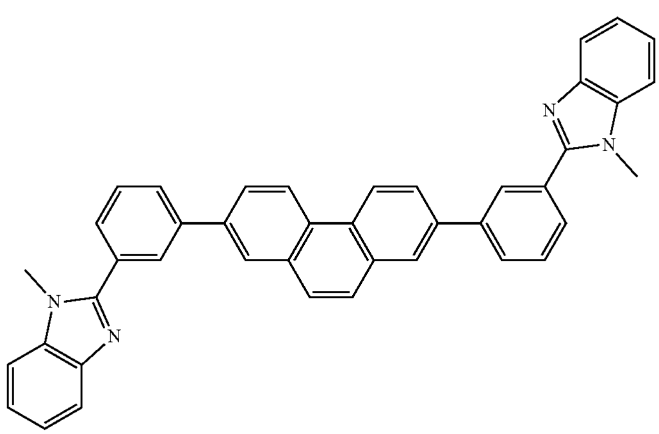

-continued
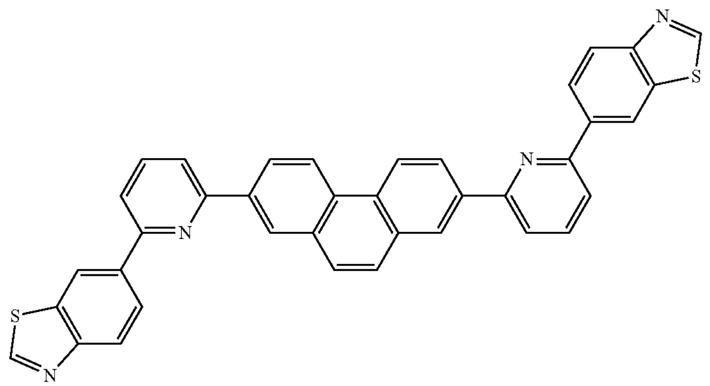
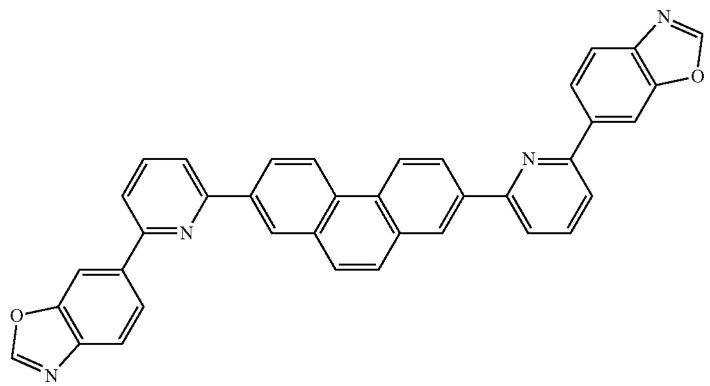
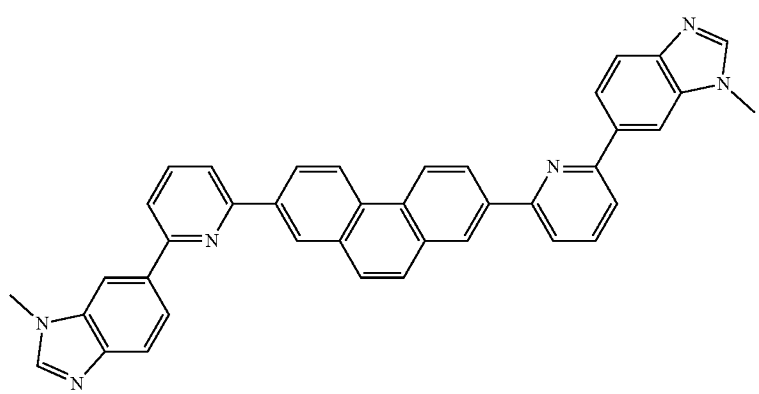
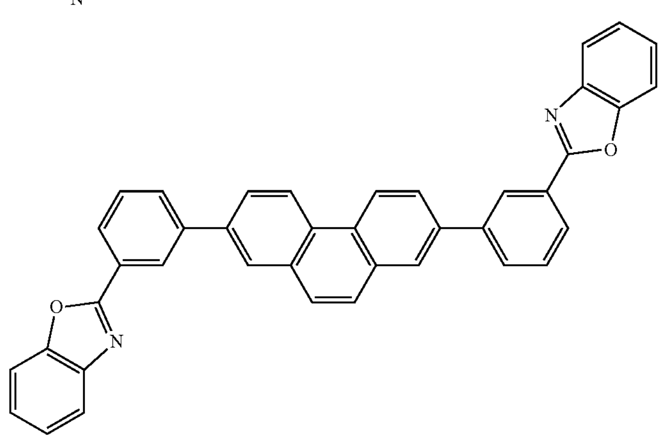

-continued
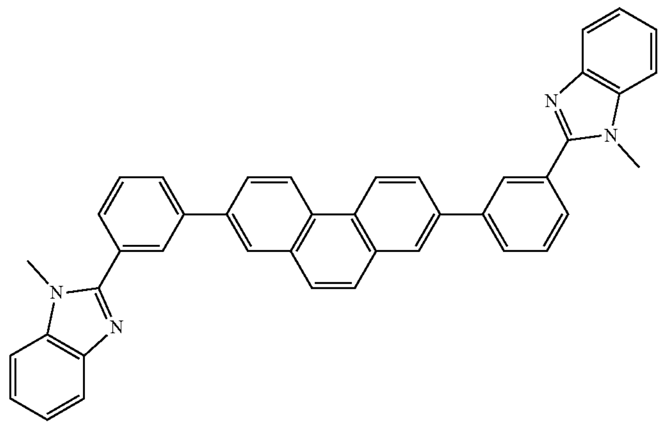
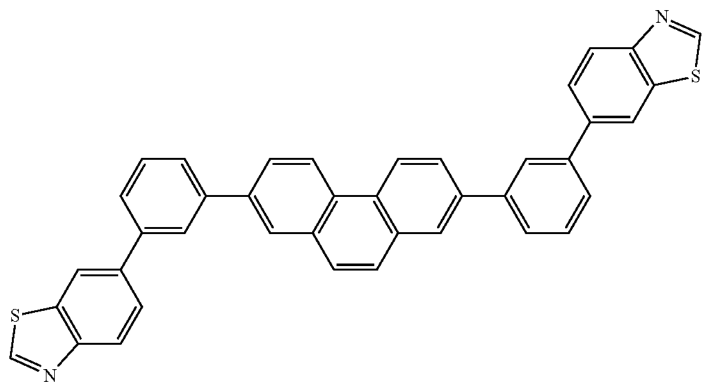
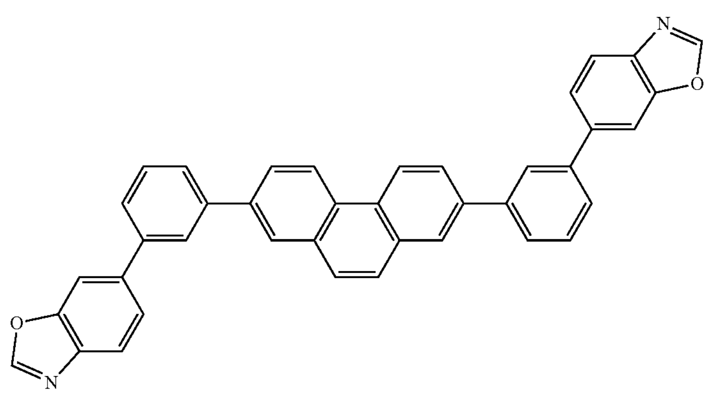
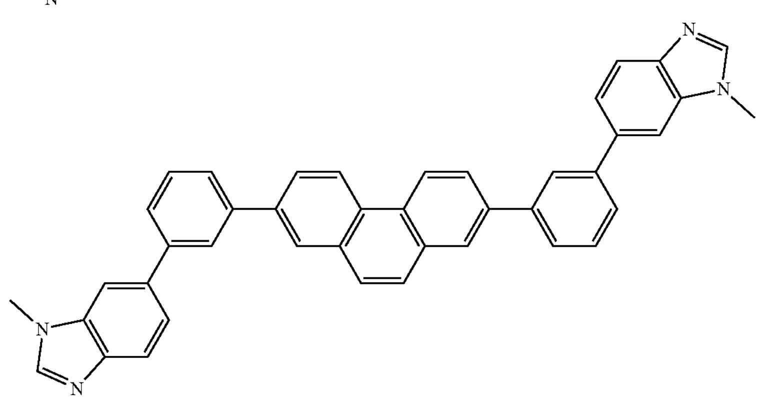

-continued
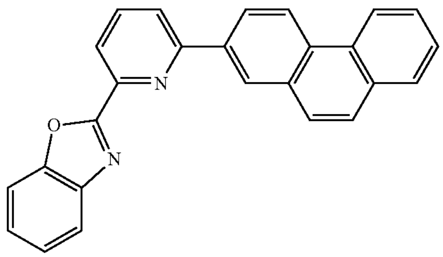
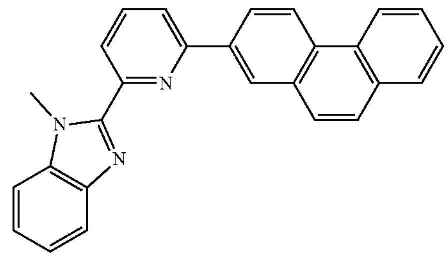
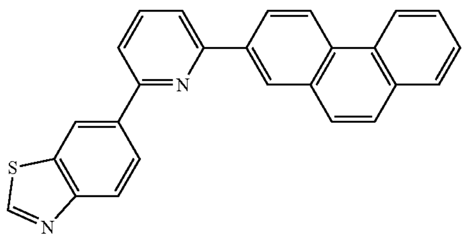
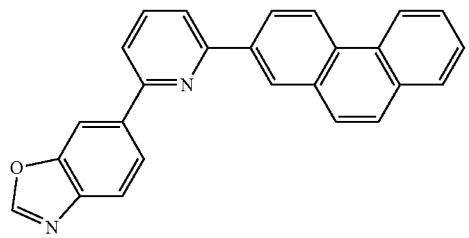
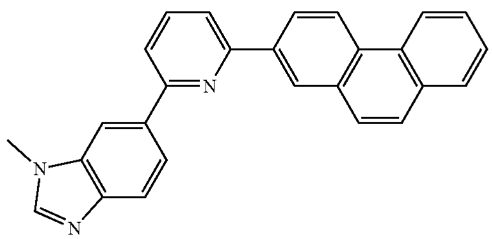
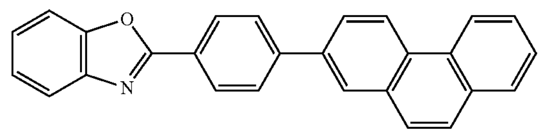
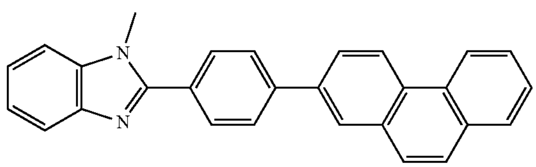
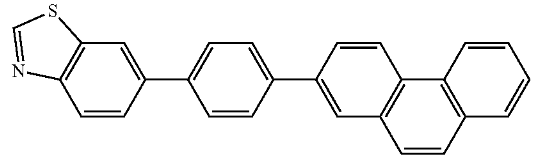
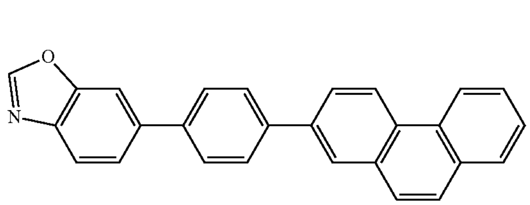
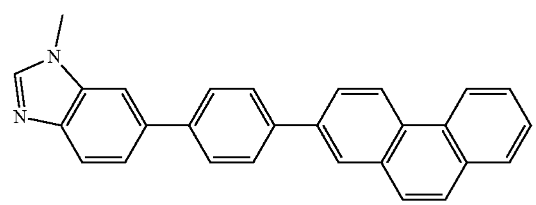
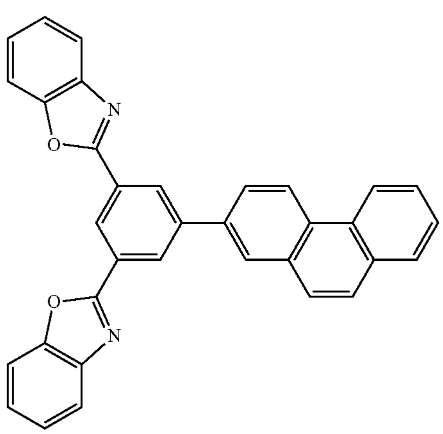
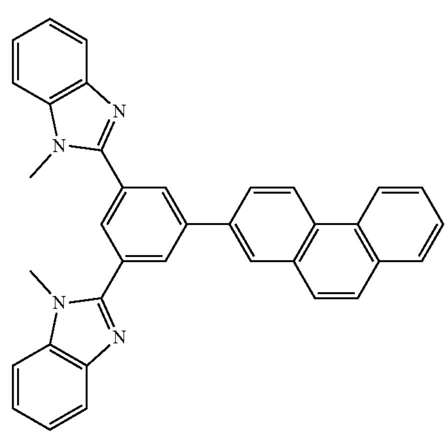

-continued
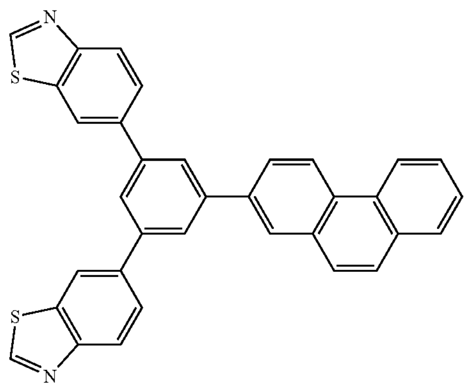
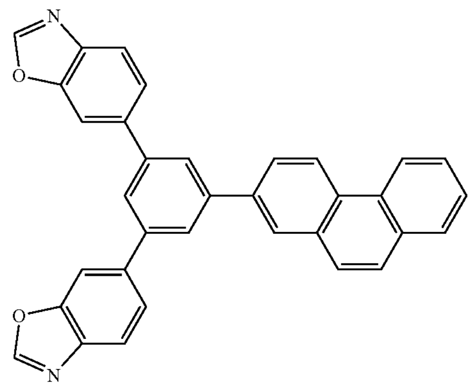
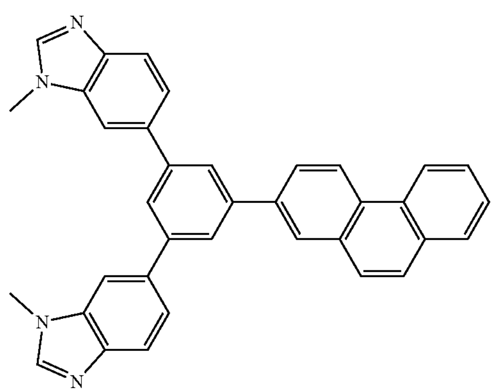
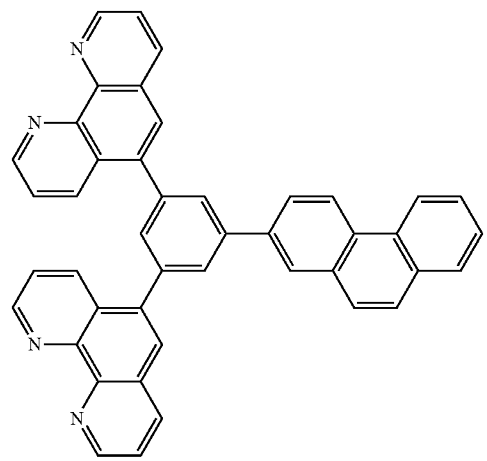
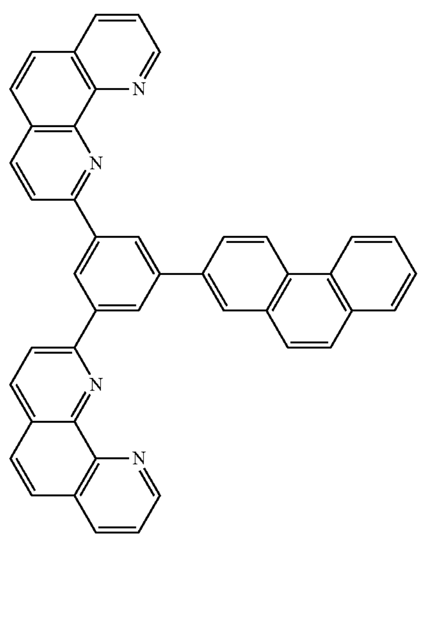
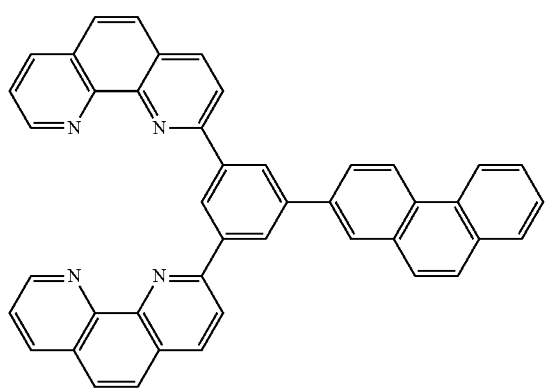

-continued
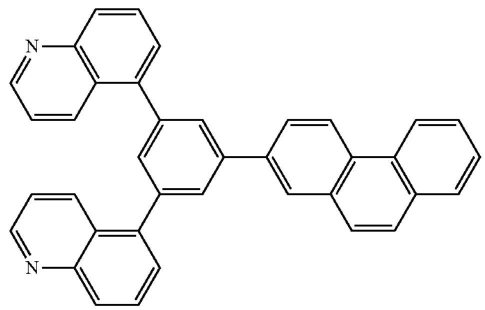
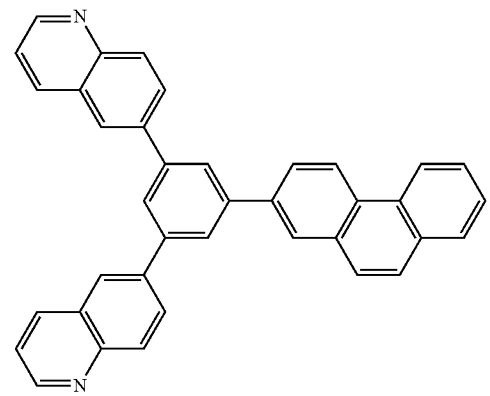
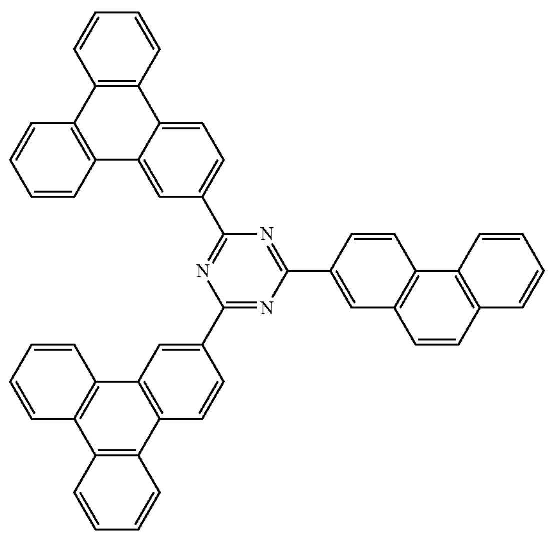
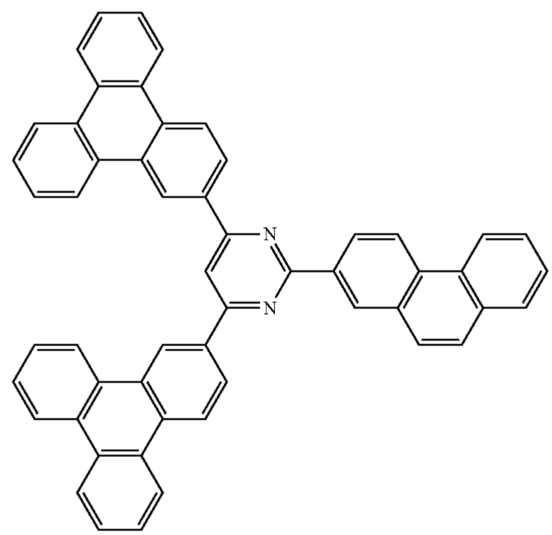
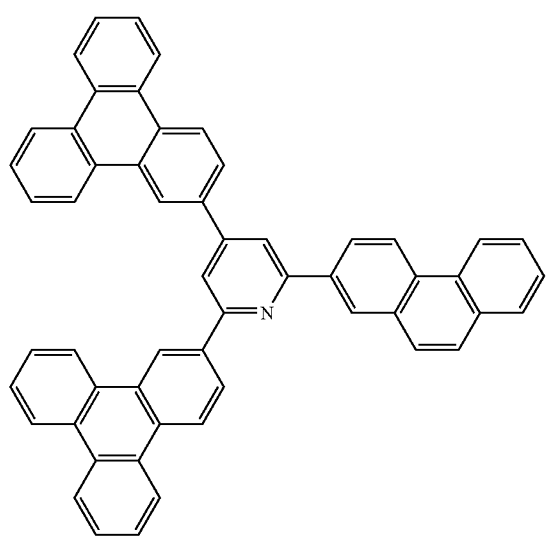
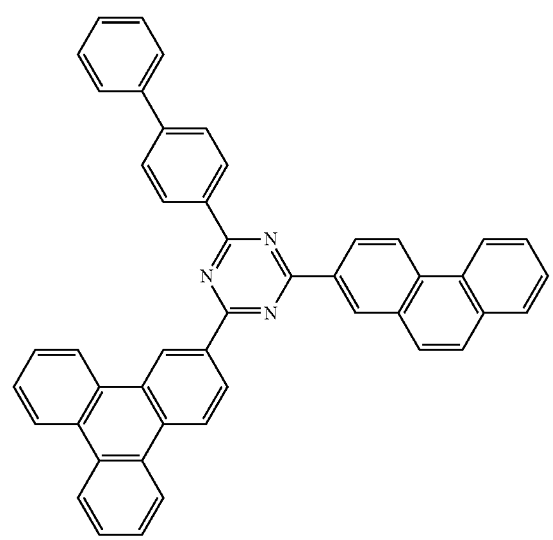

-continued
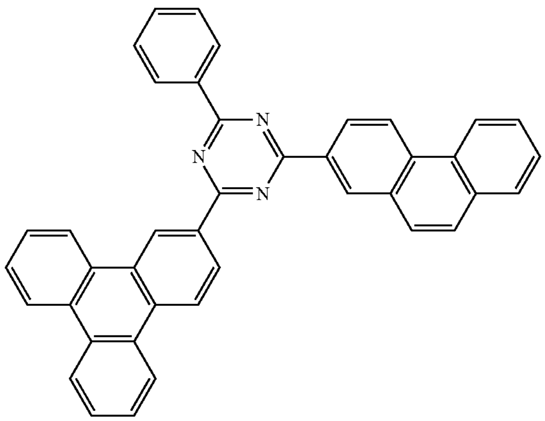
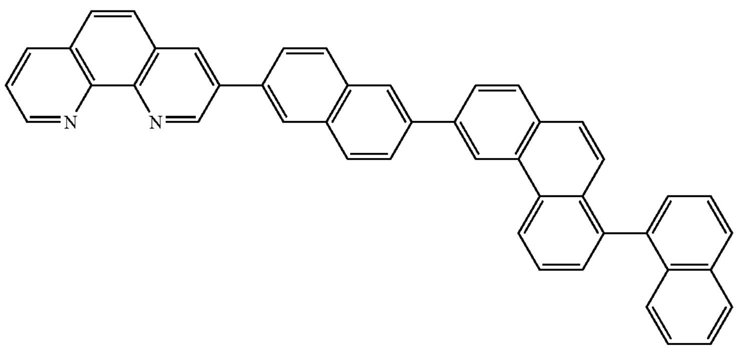
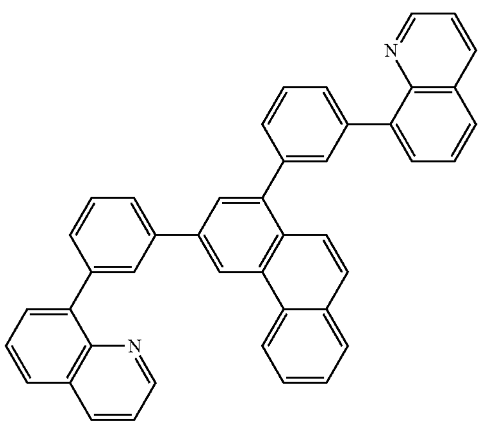
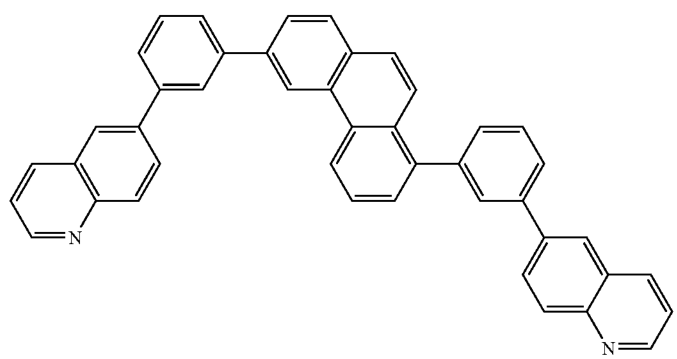
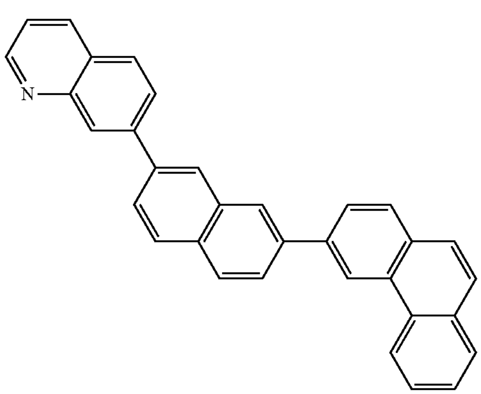
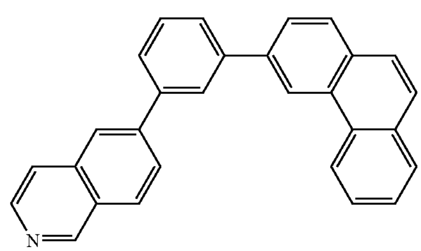

-continued
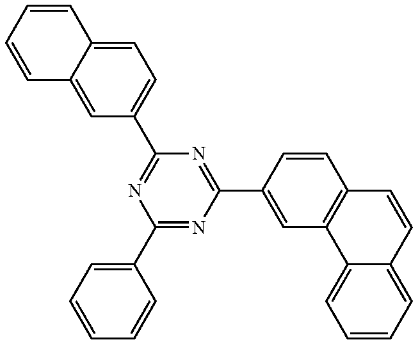
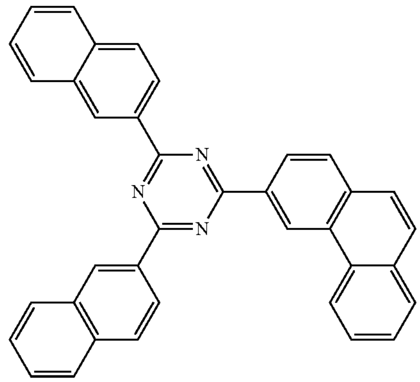
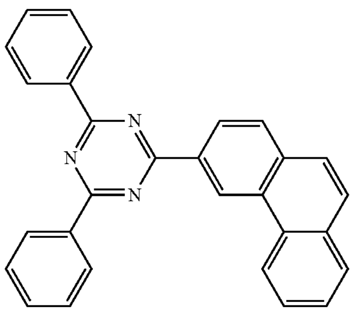
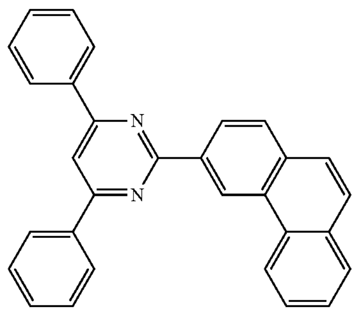
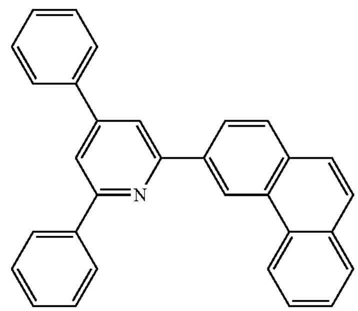
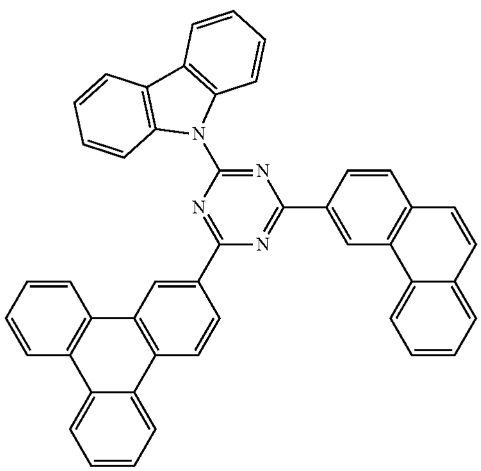
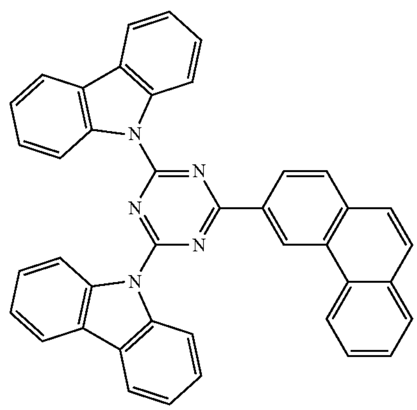
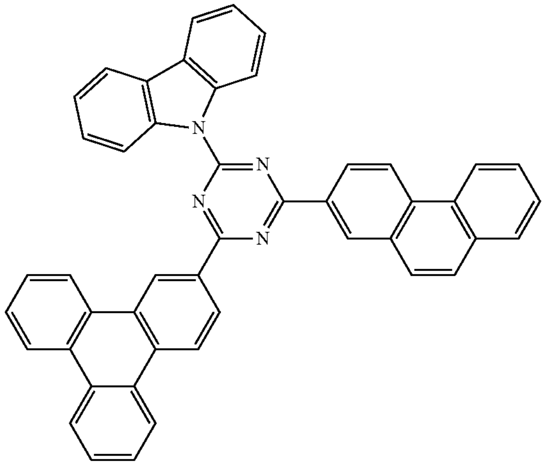
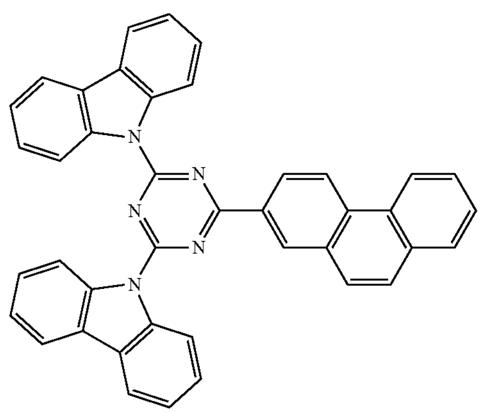

-continued
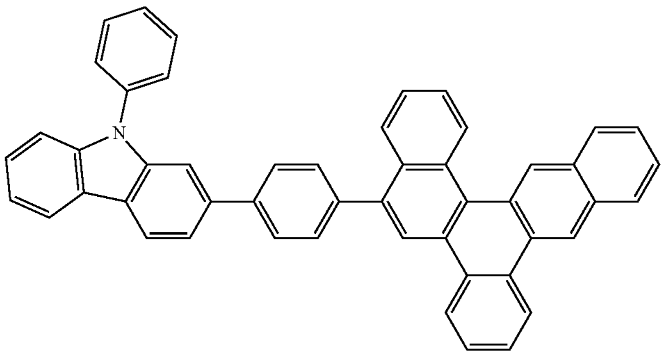
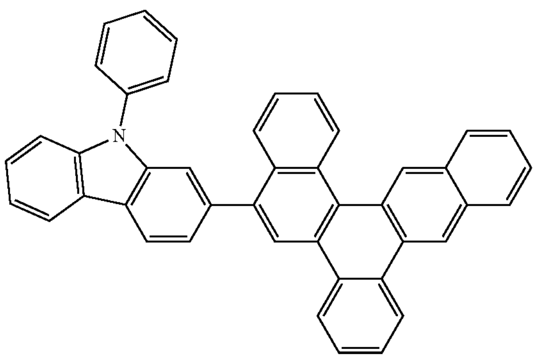
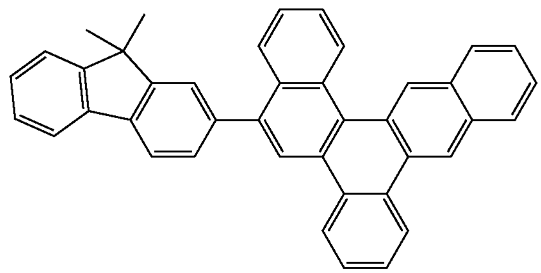
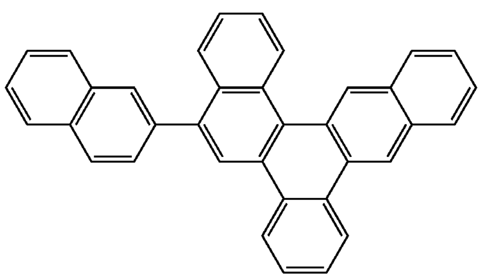
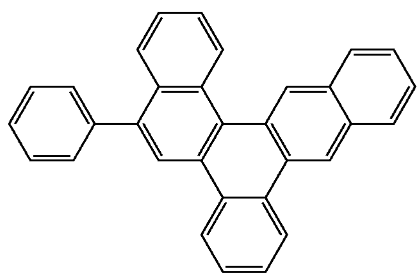
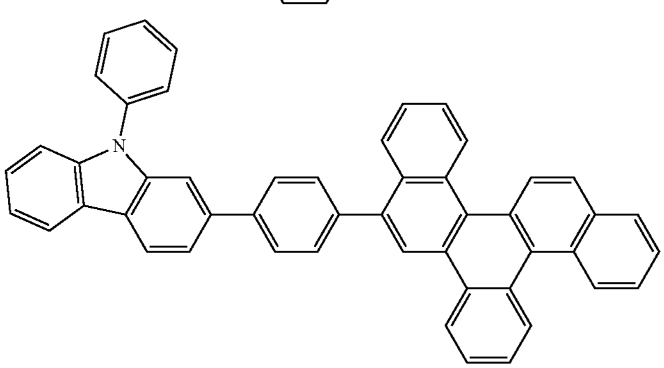
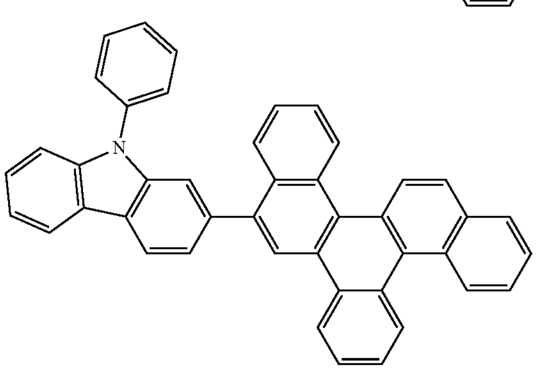
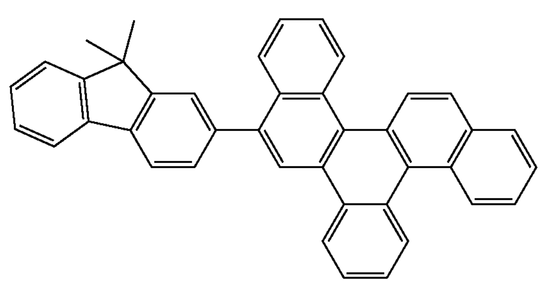

-continued
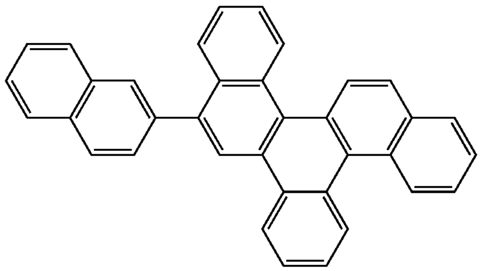
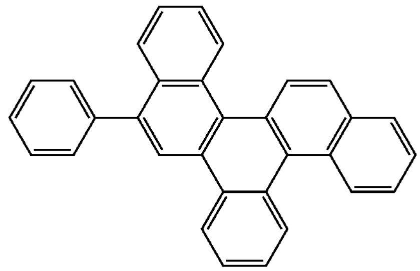
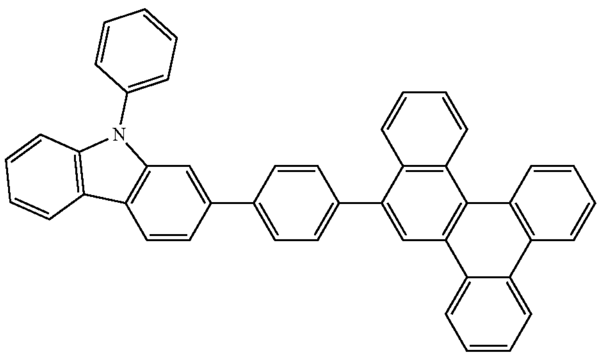
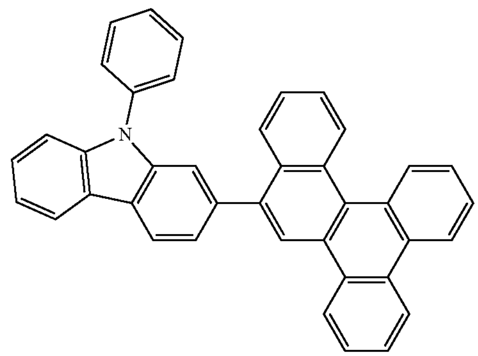
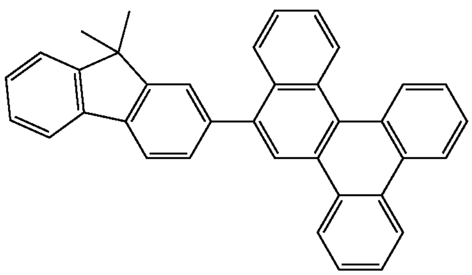
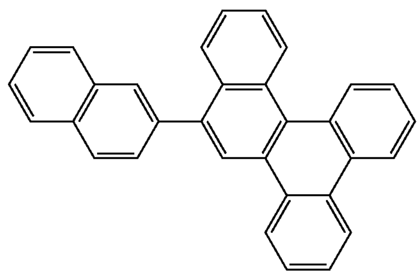
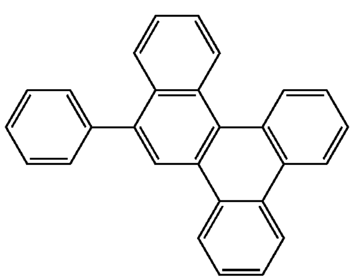
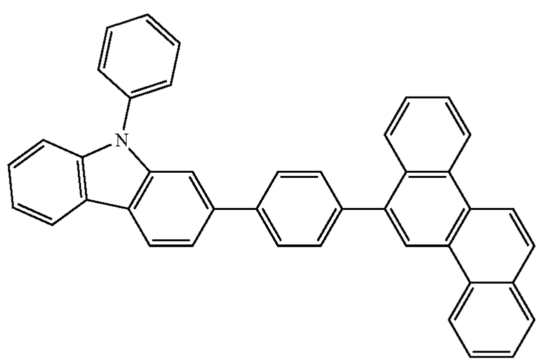
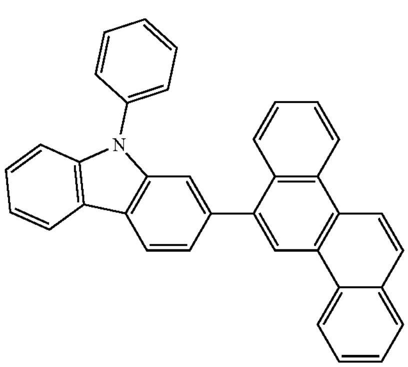
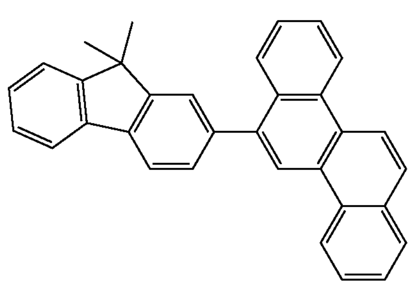

-continued
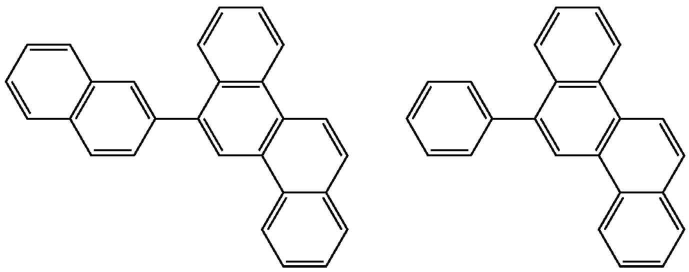
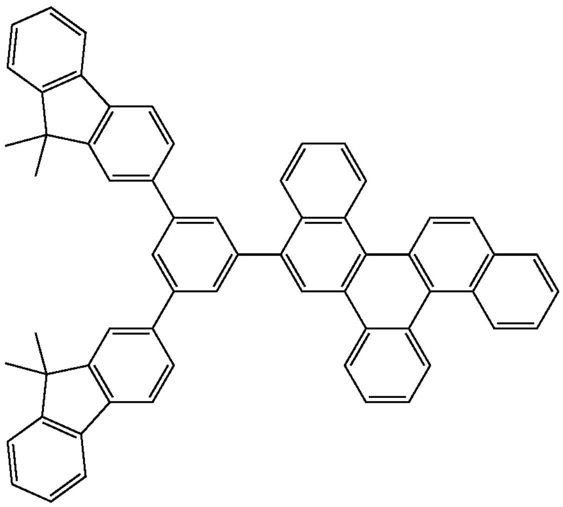
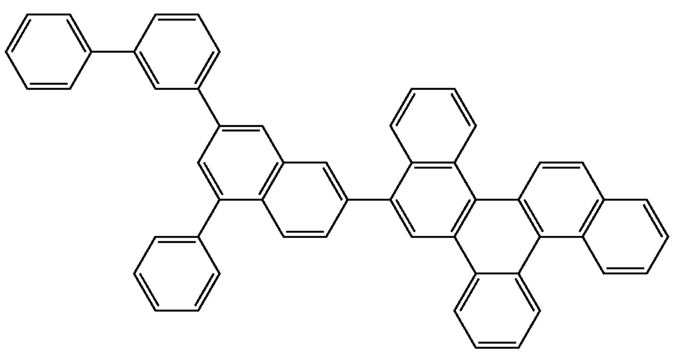
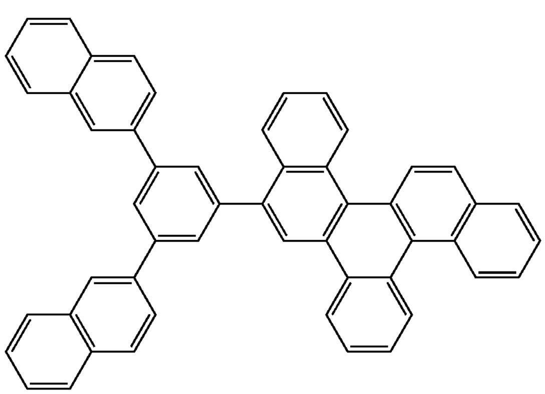
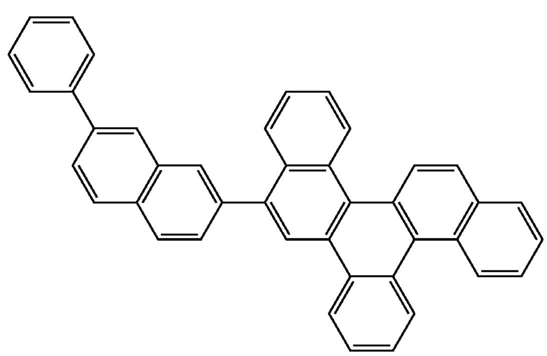

-continued
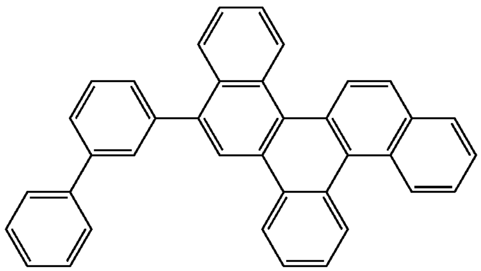
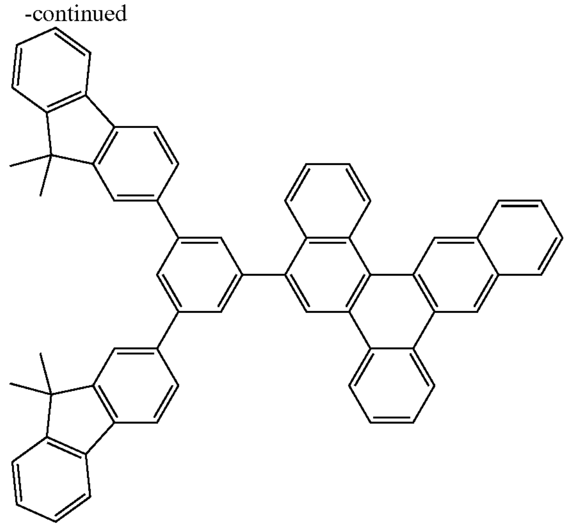
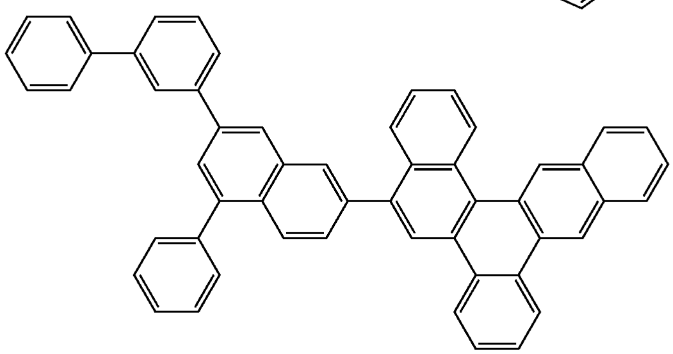
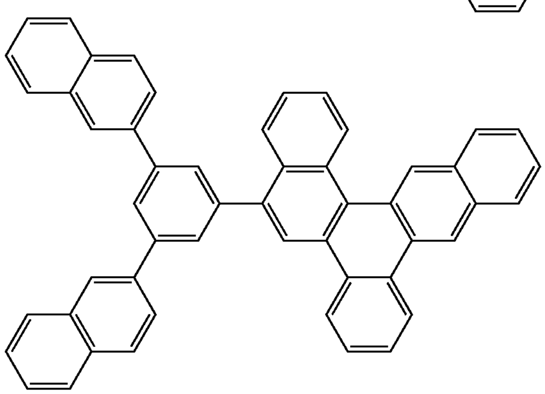
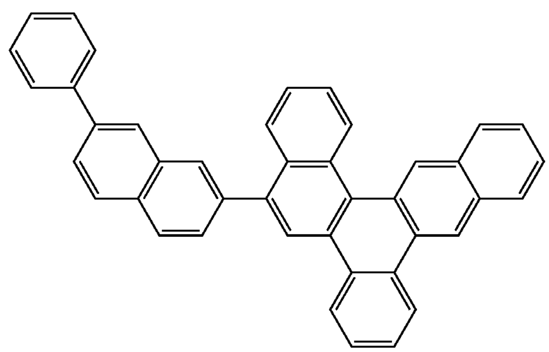
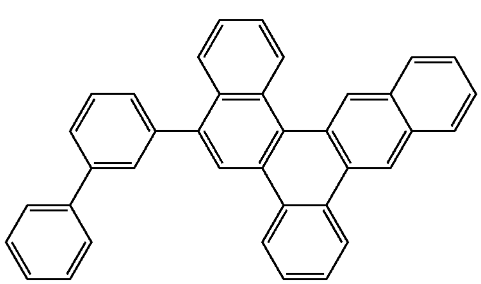
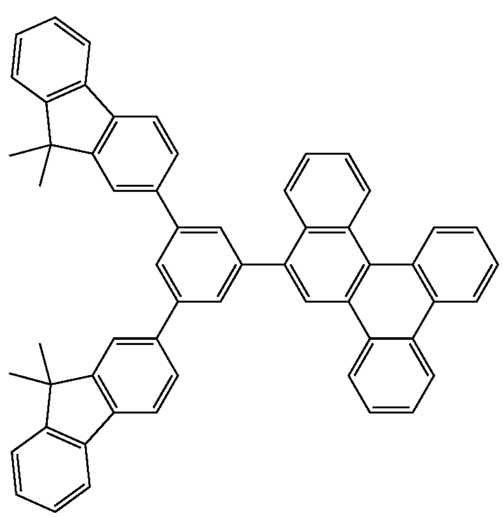

-continued
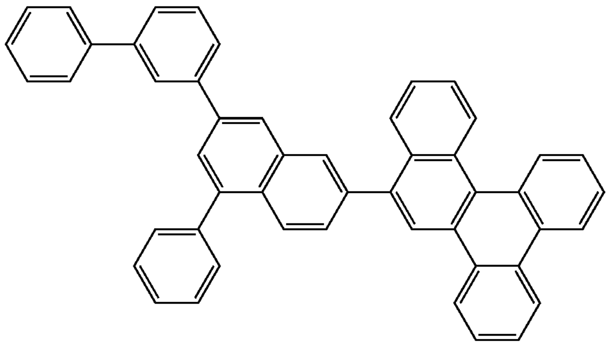
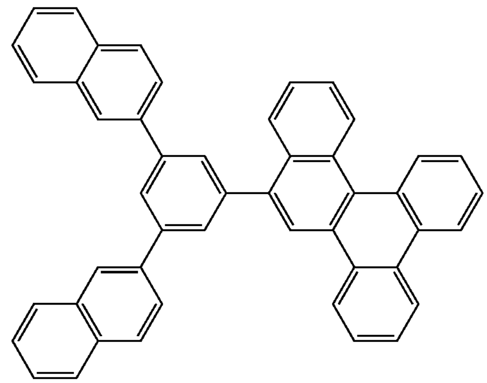
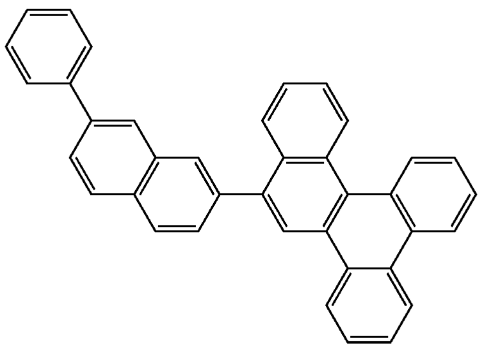
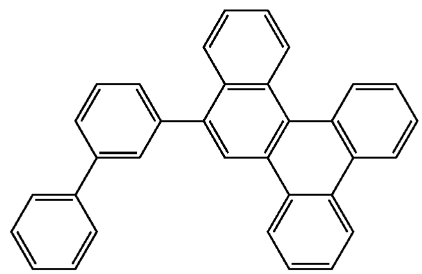
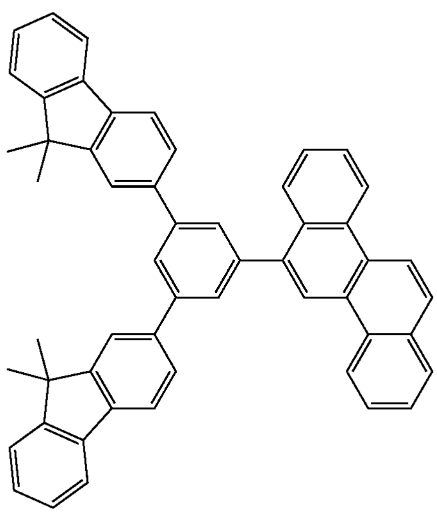
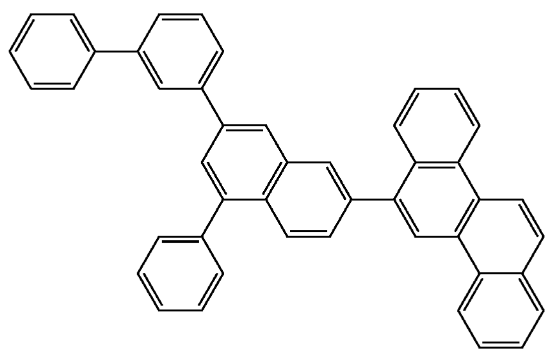
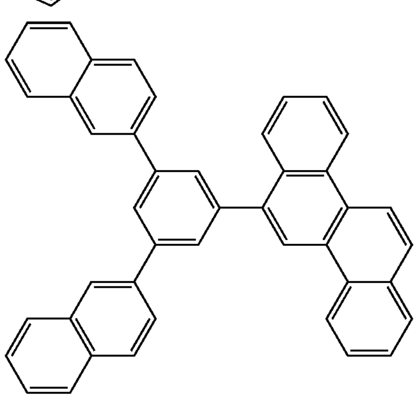
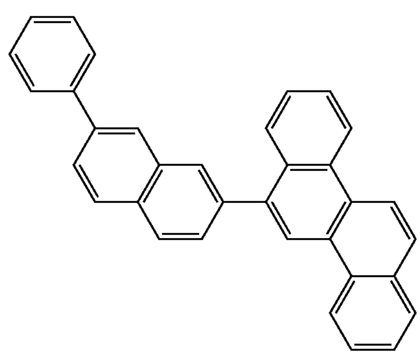

-continued
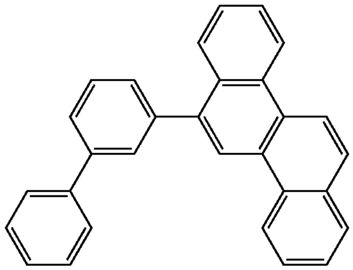
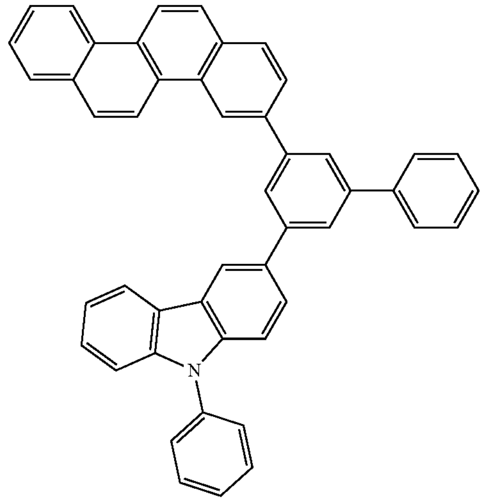
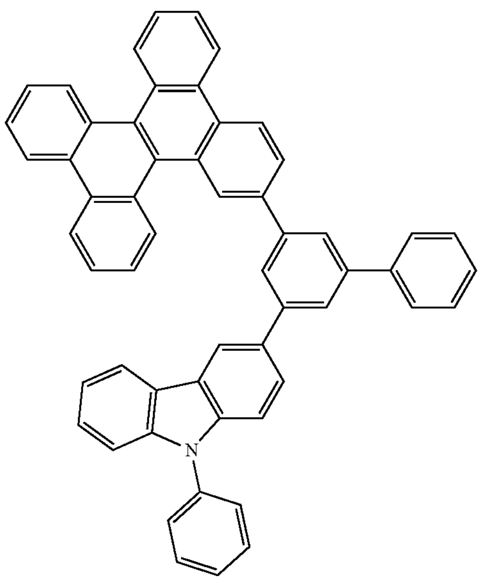
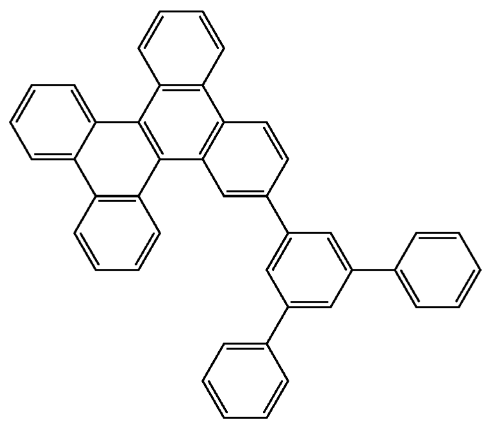
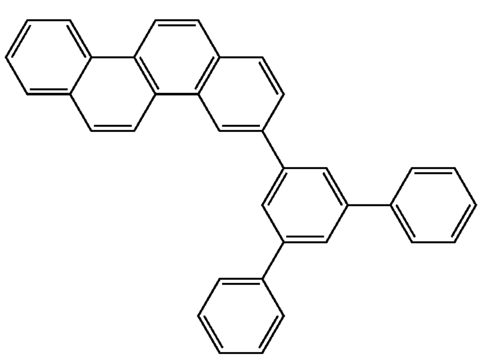
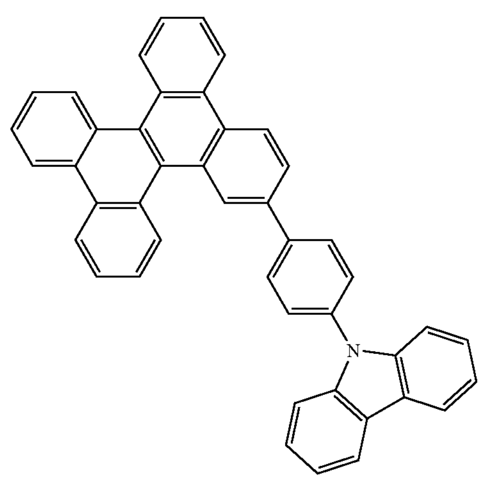

-continued
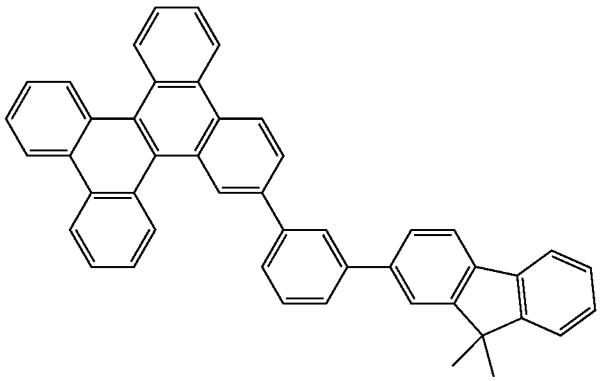
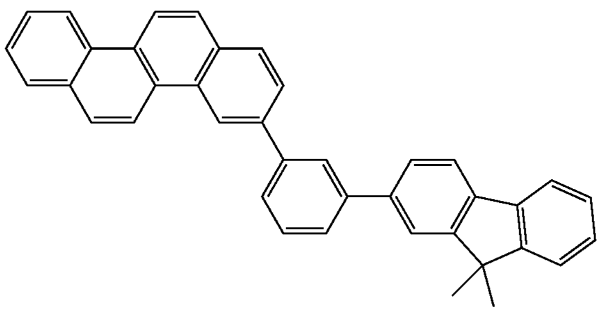
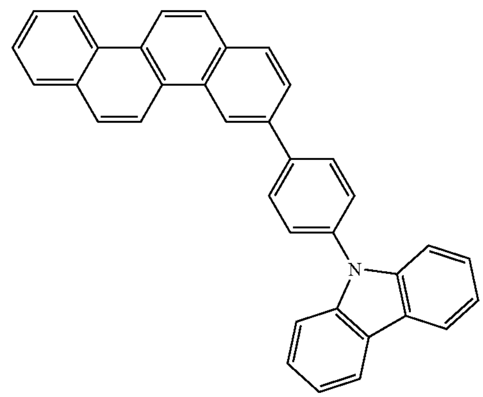
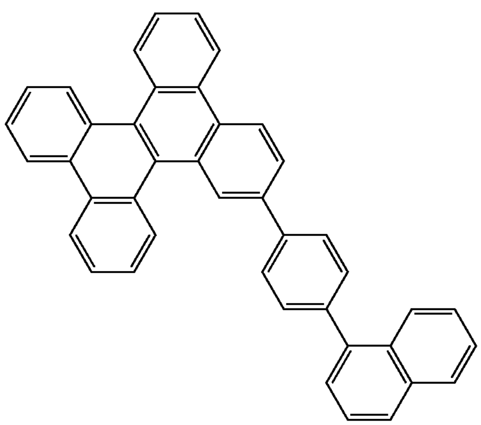
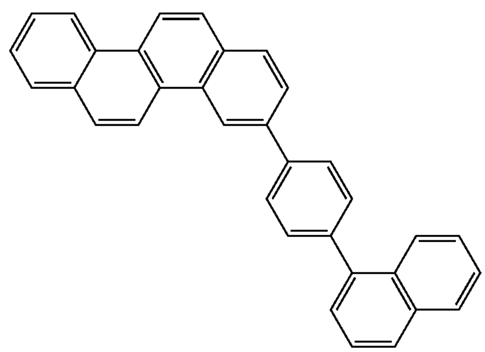
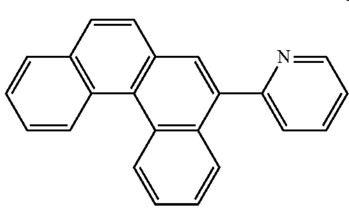
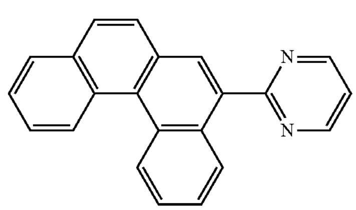
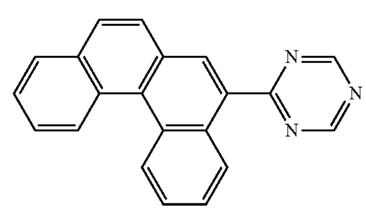
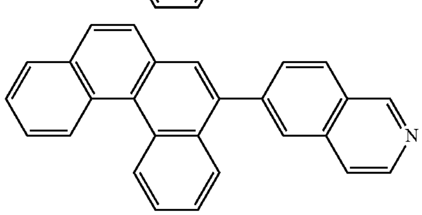
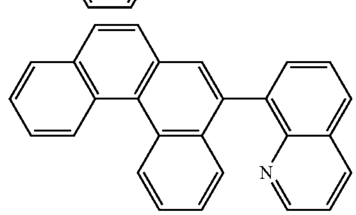

-continued
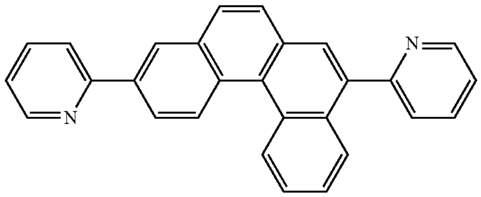
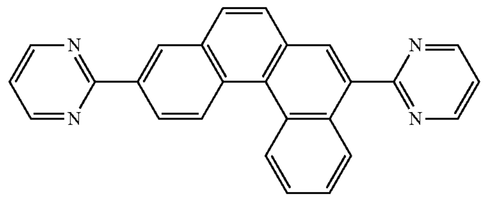
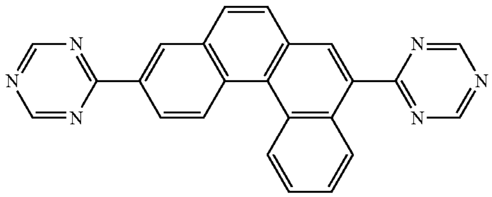
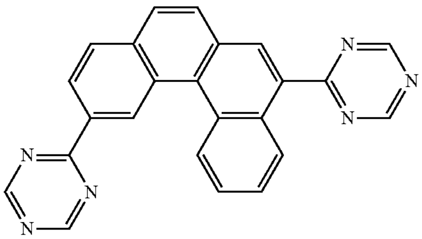
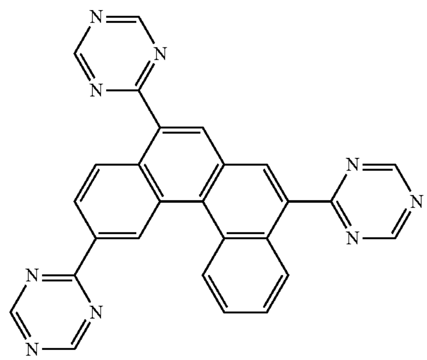
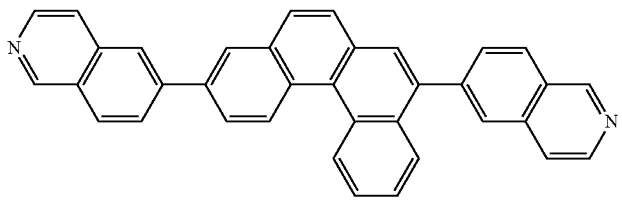
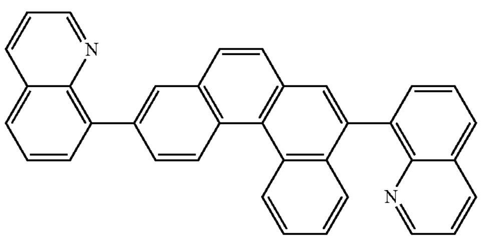
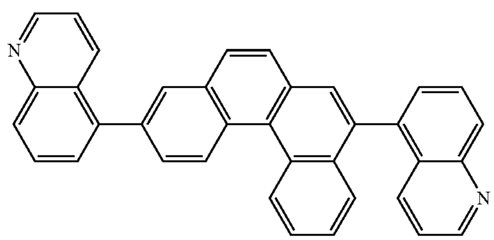
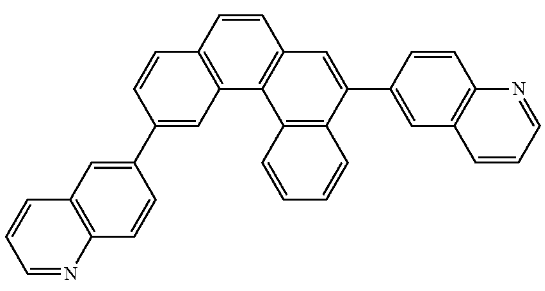
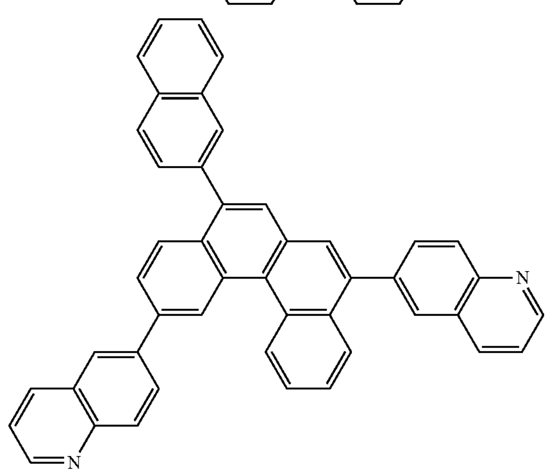
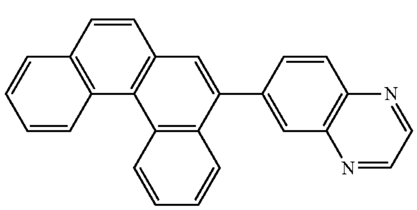
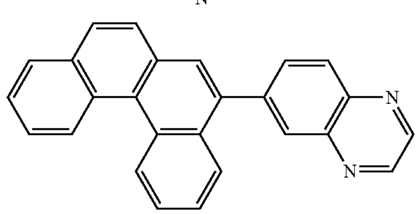

-continued
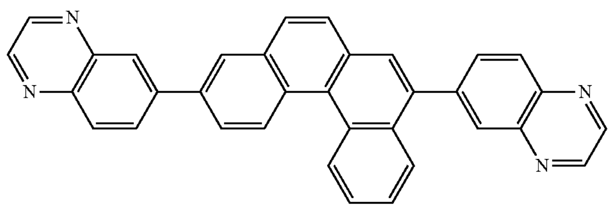
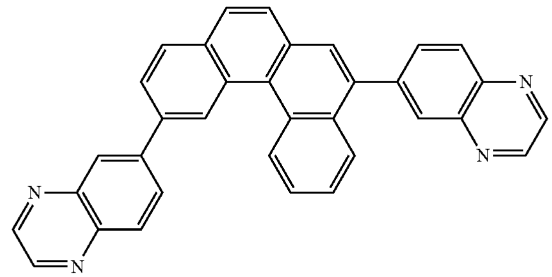
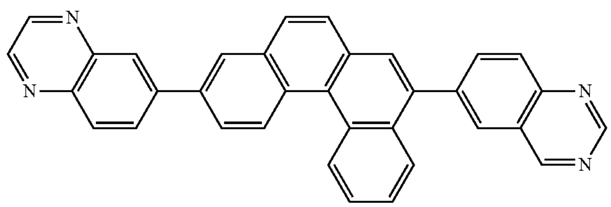
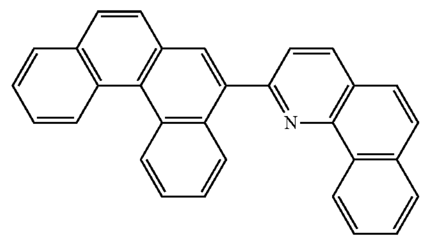
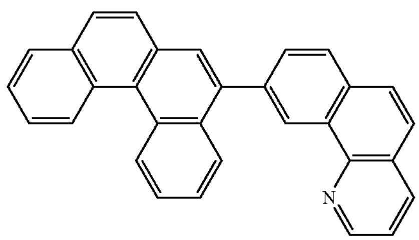
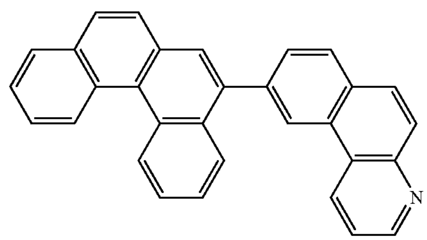
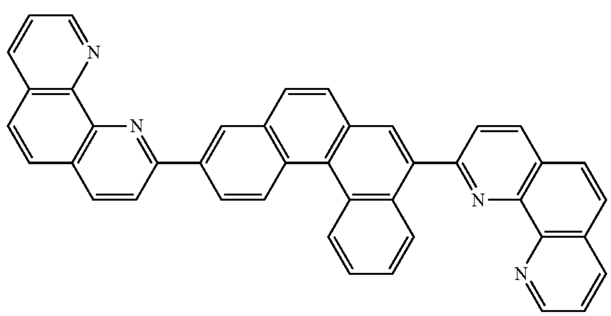
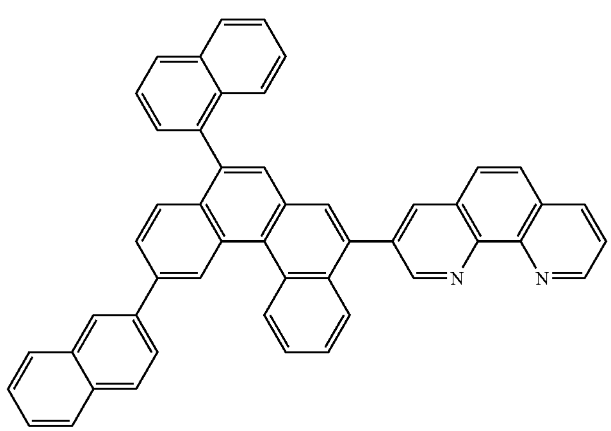
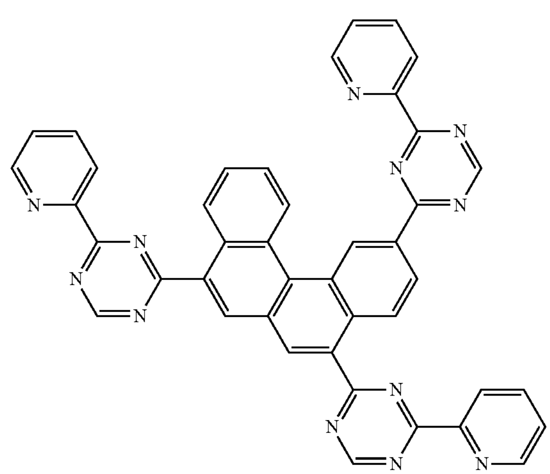

-continued
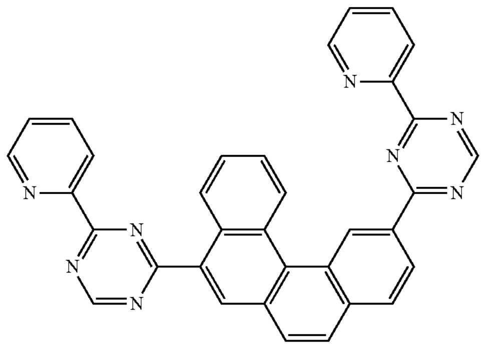
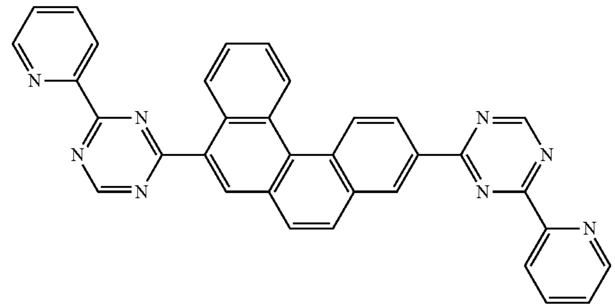
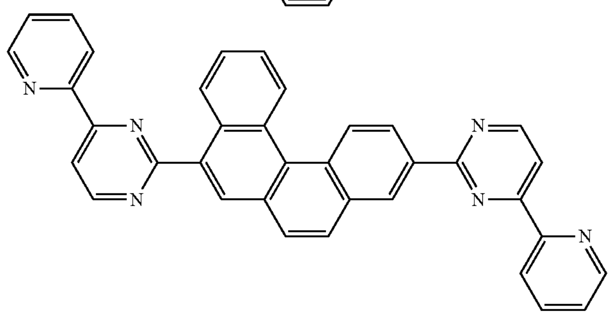
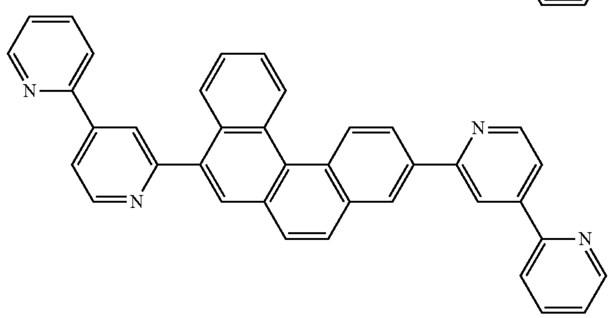
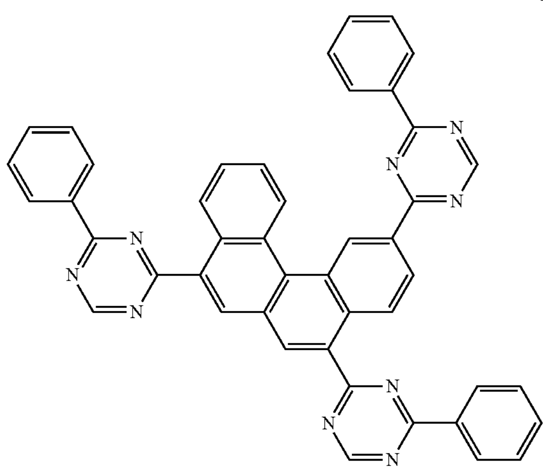
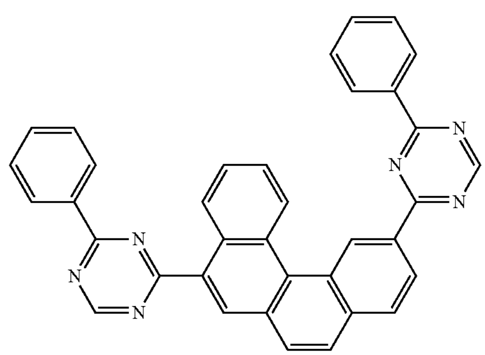
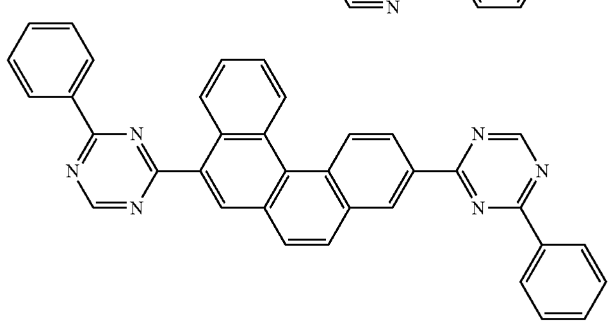

-continued
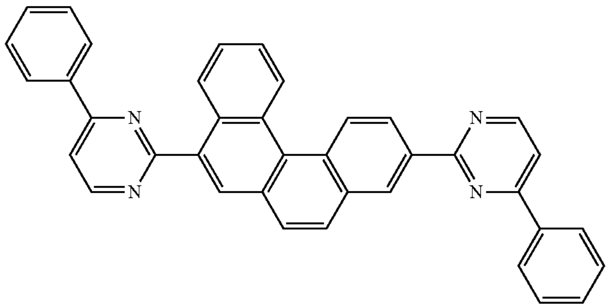
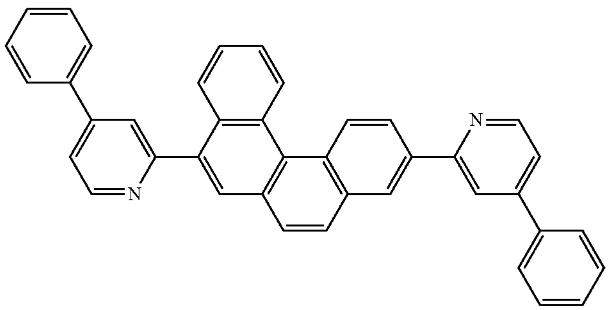
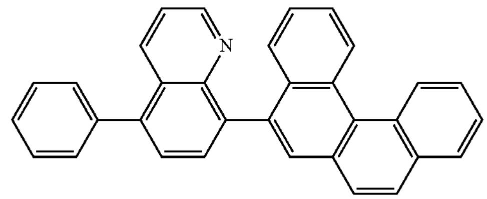
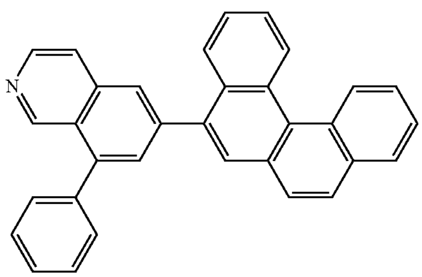
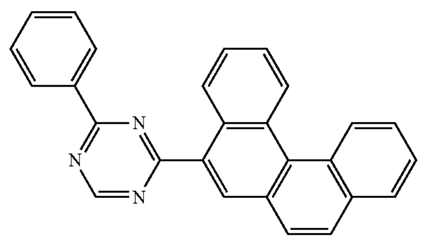
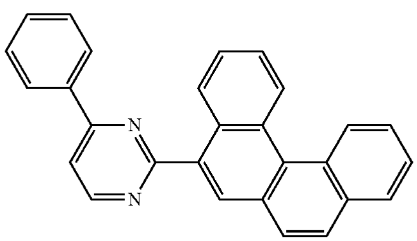
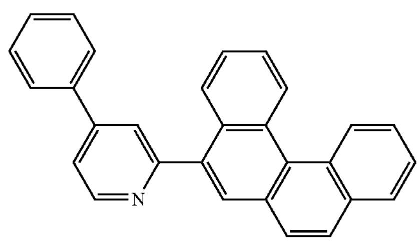
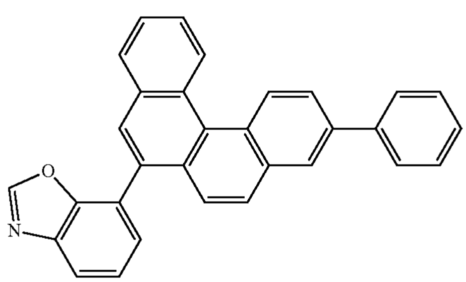
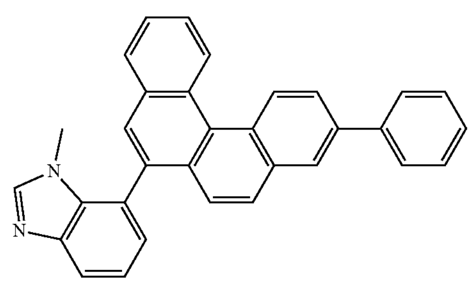
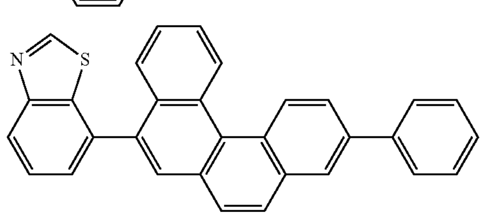
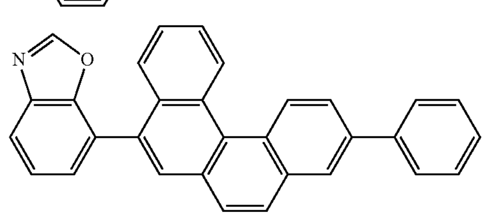

-continued
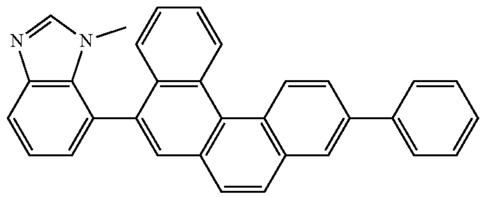
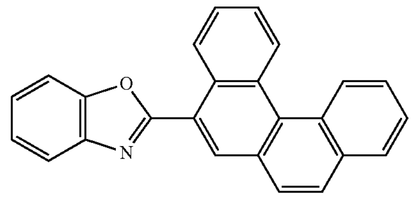
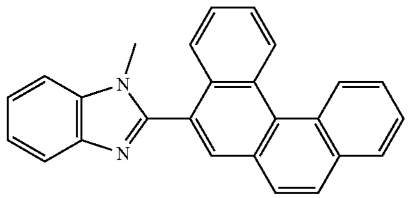
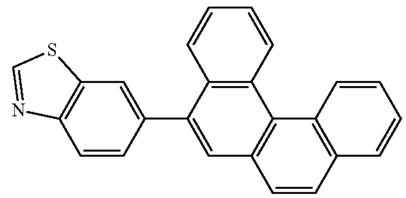
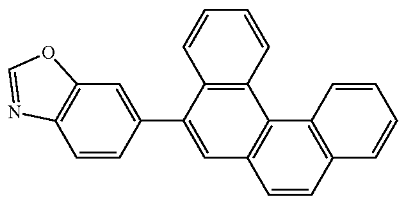
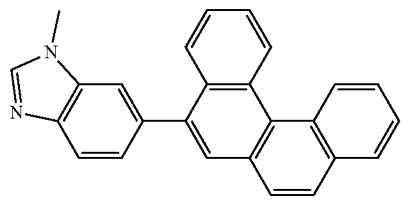
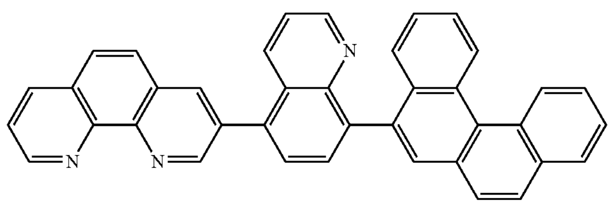
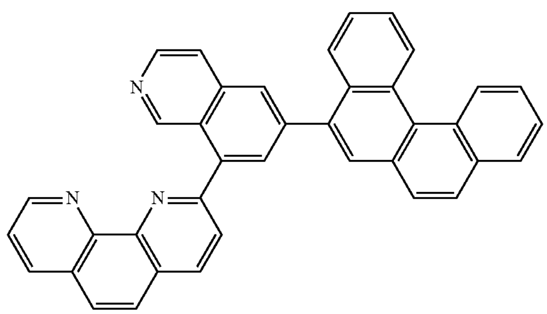
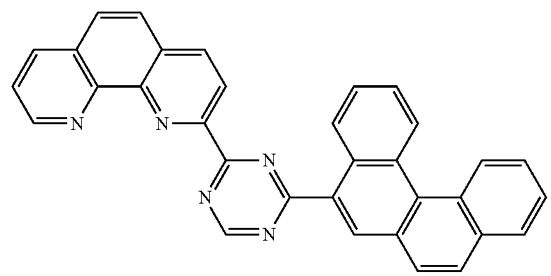
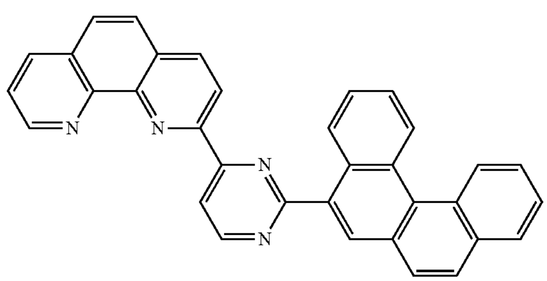
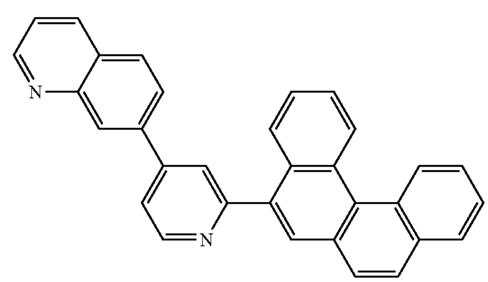
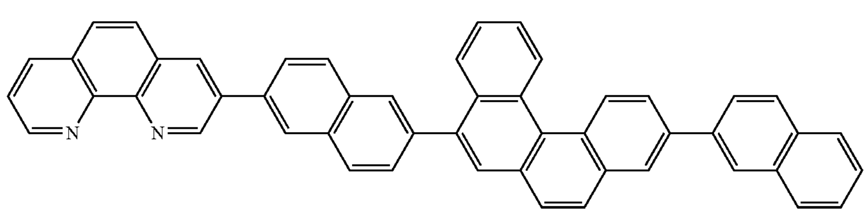

-continued
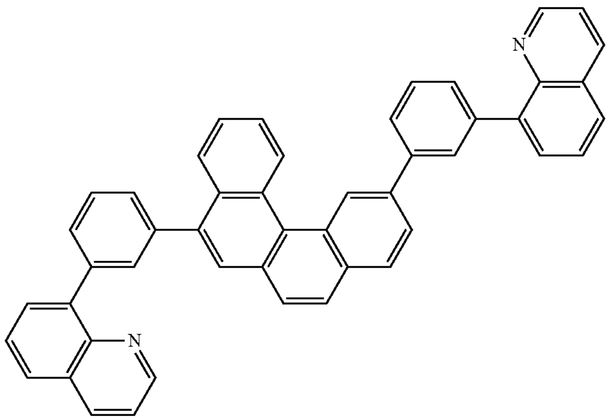
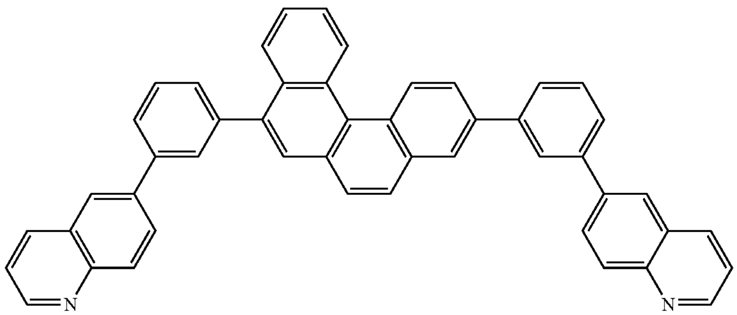
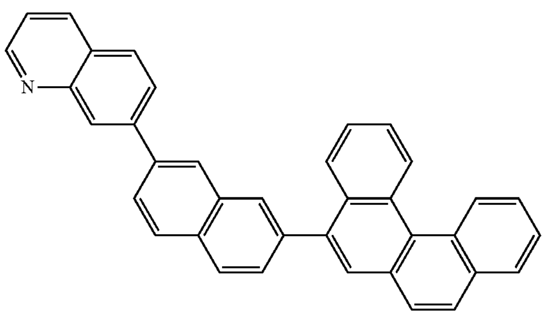
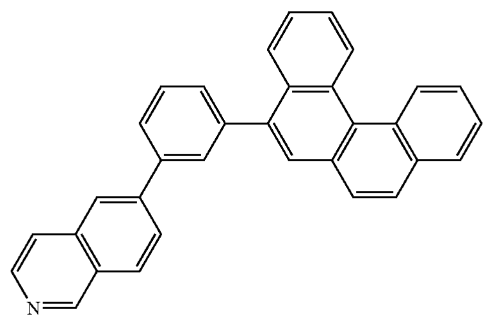
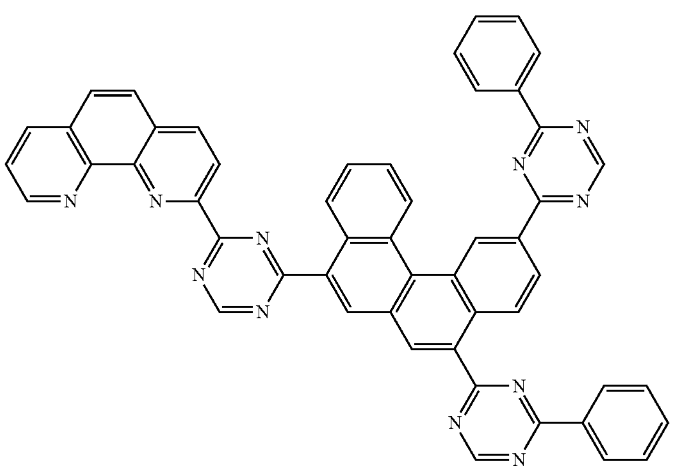

-continued
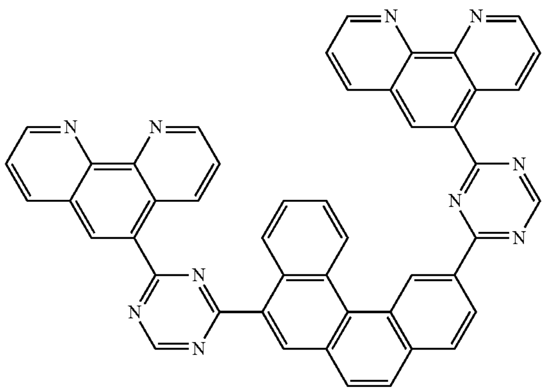
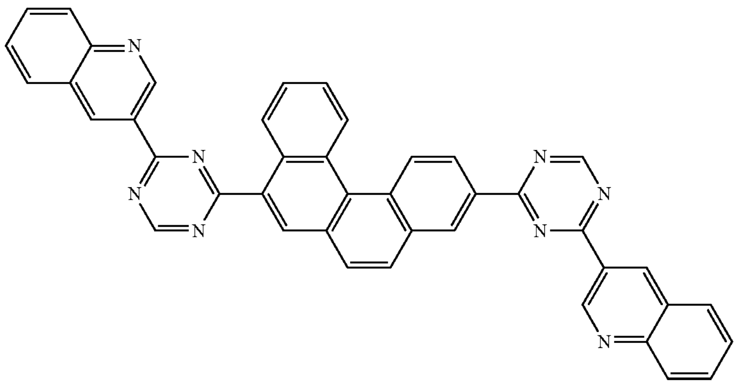
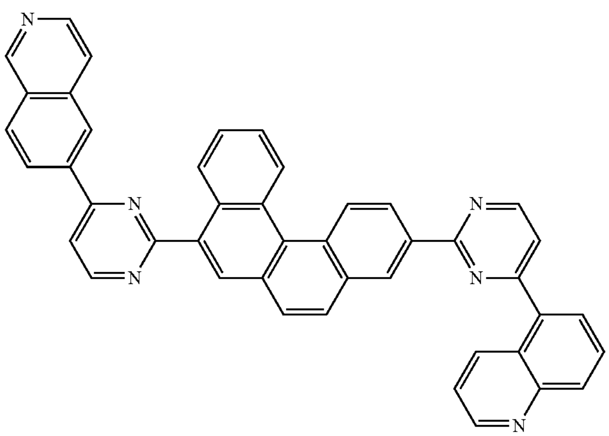
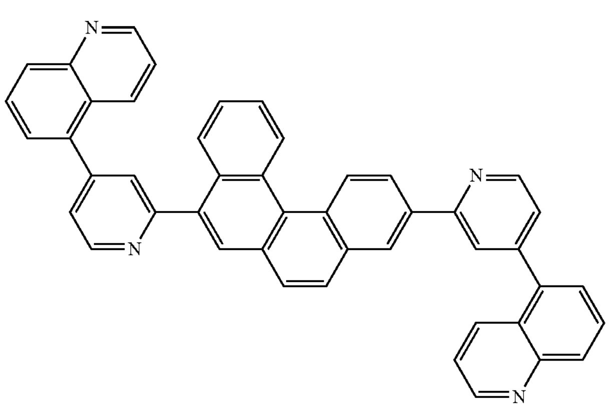

-continued
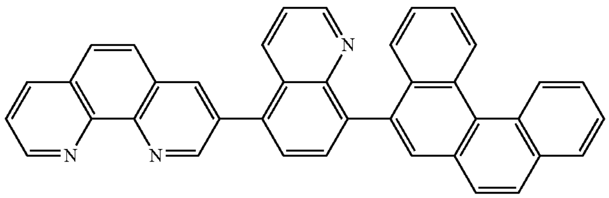
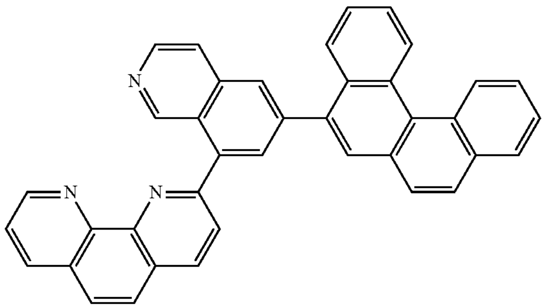
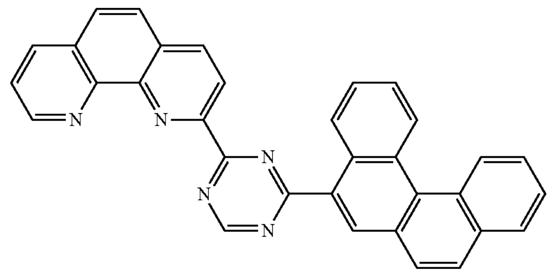
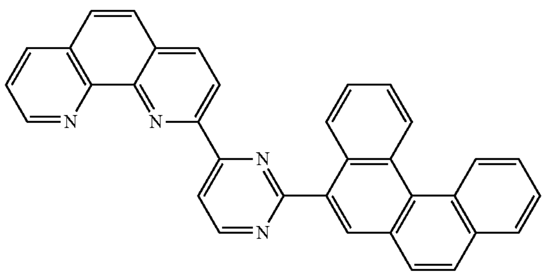
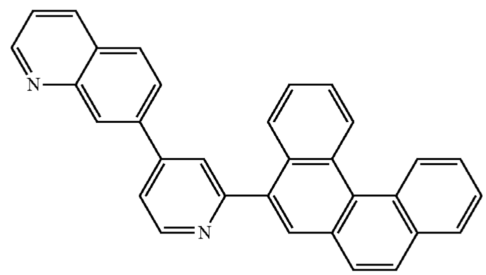
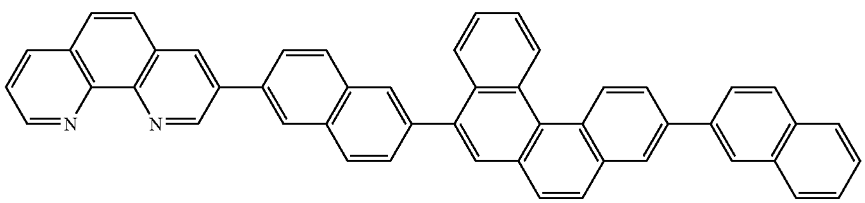
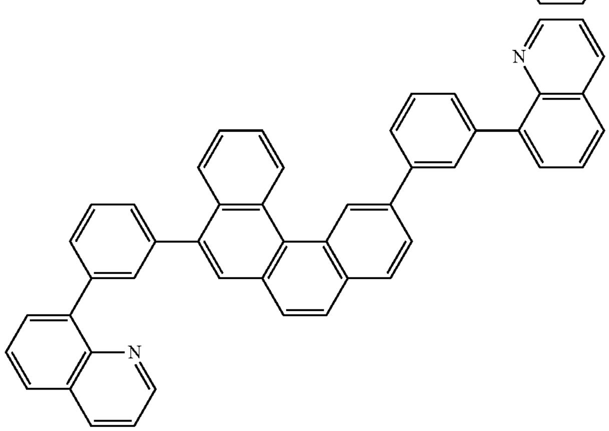
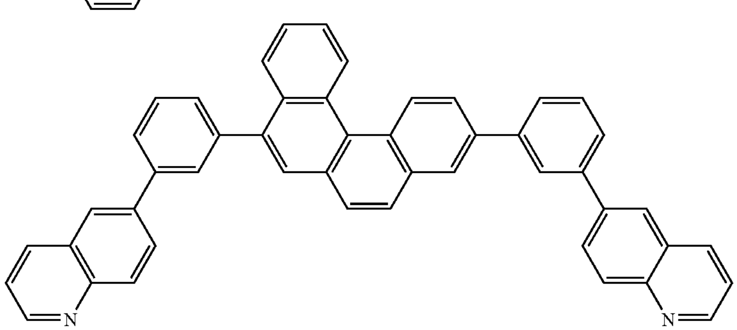

-continued
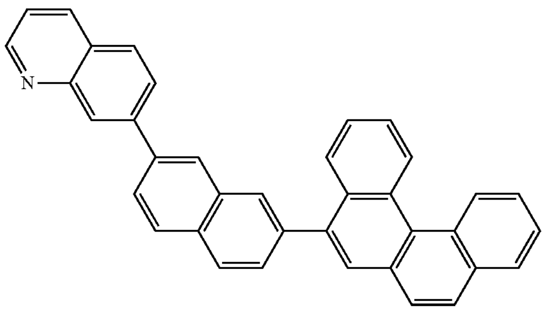
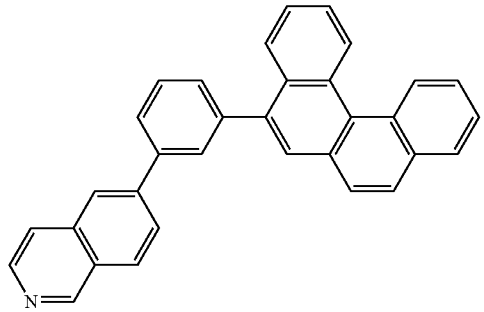
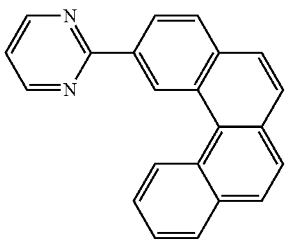
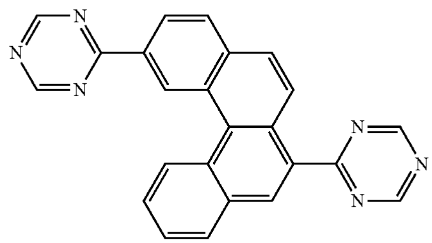
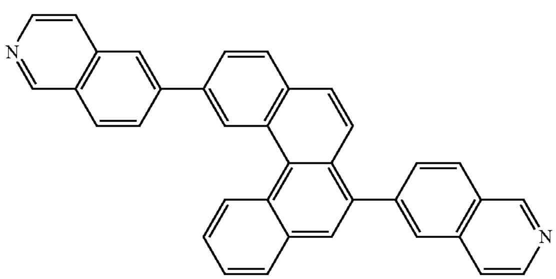
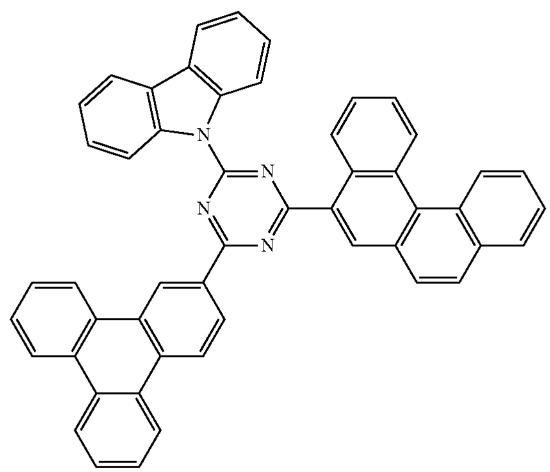
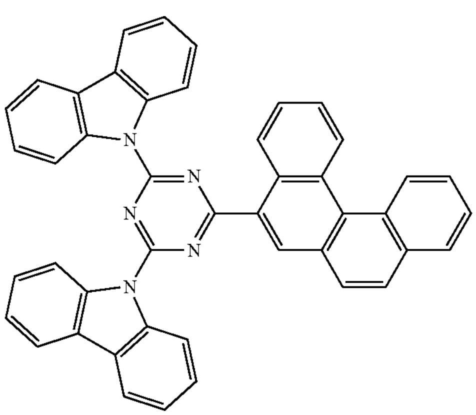
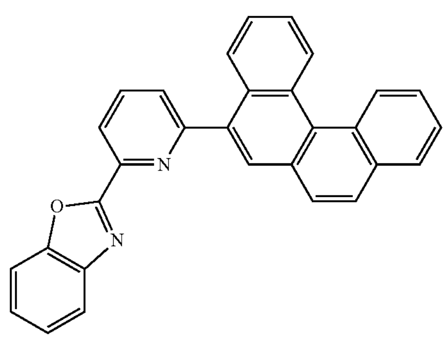

-continued
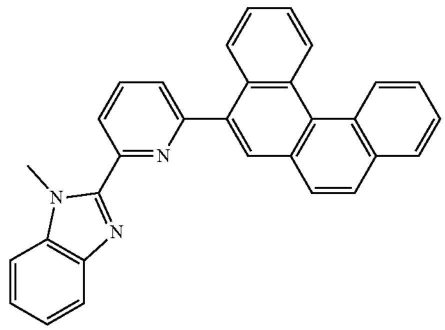
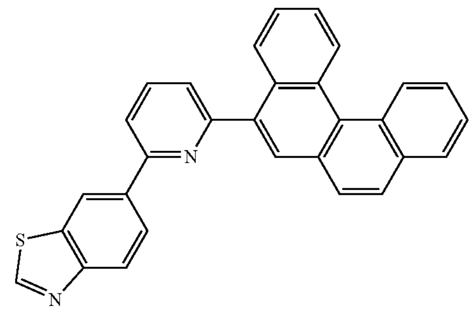
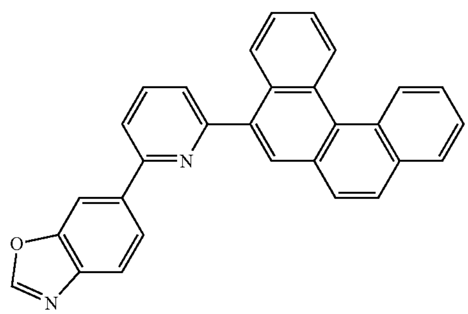
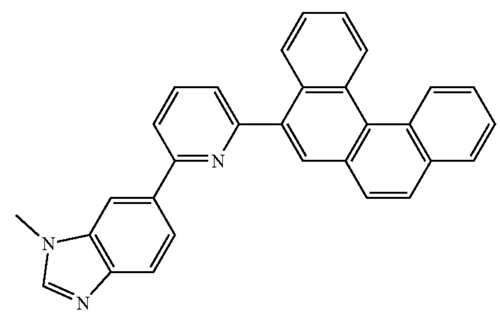
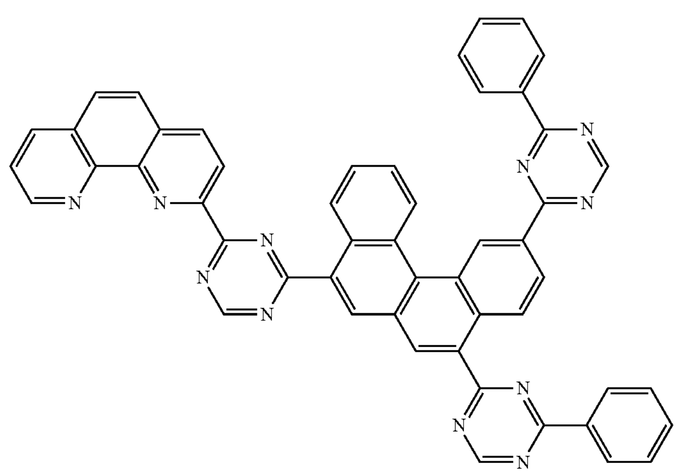
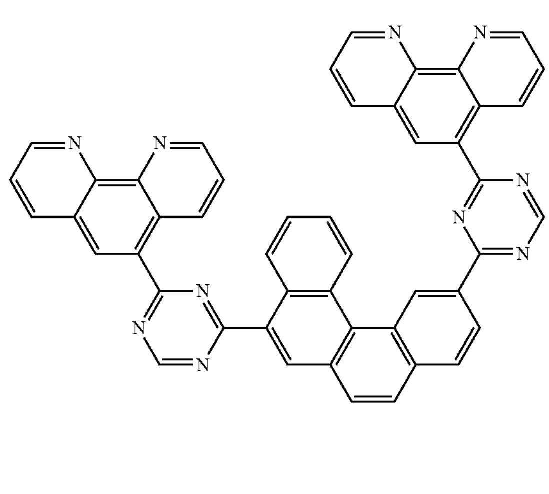

-continued
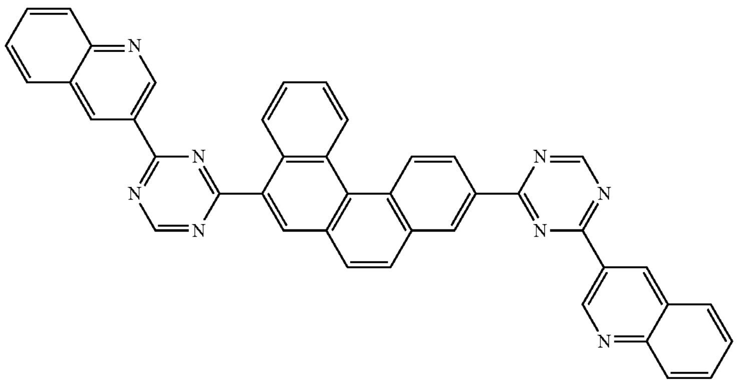
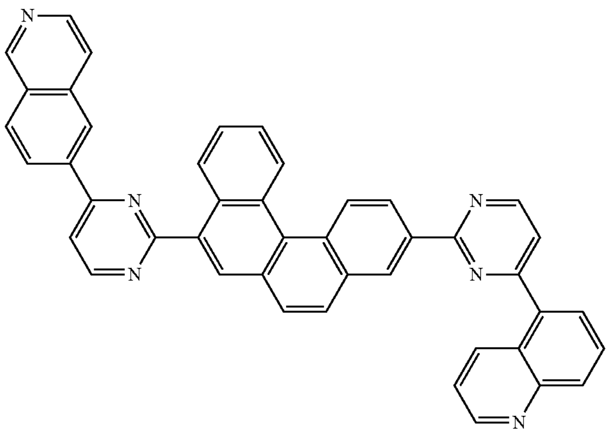
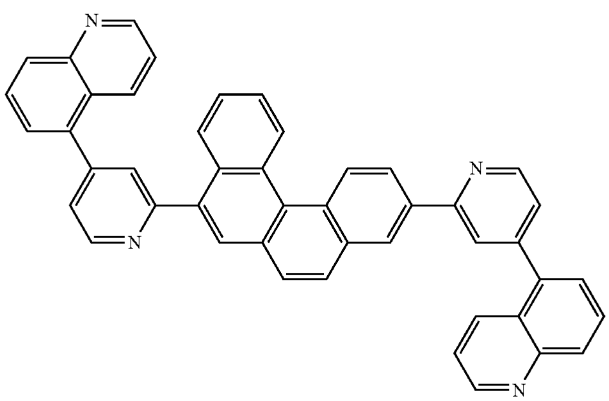
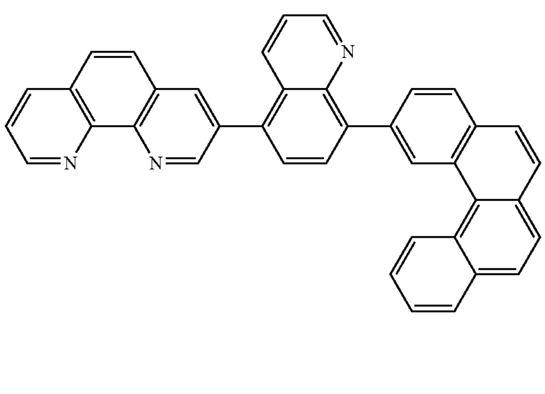
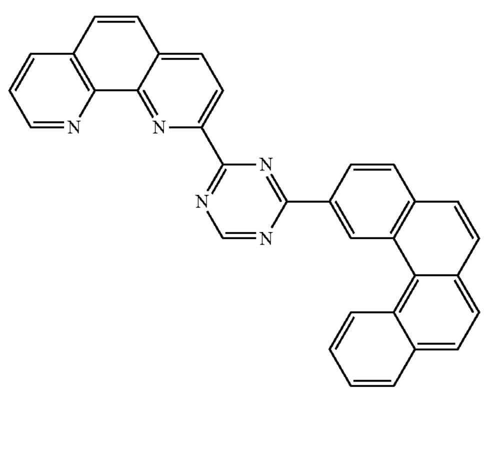

-continued
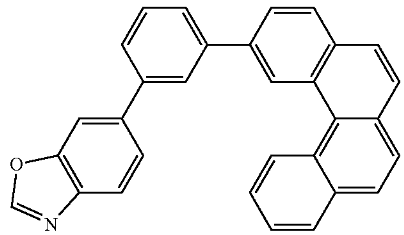
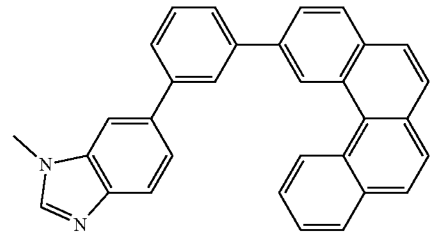
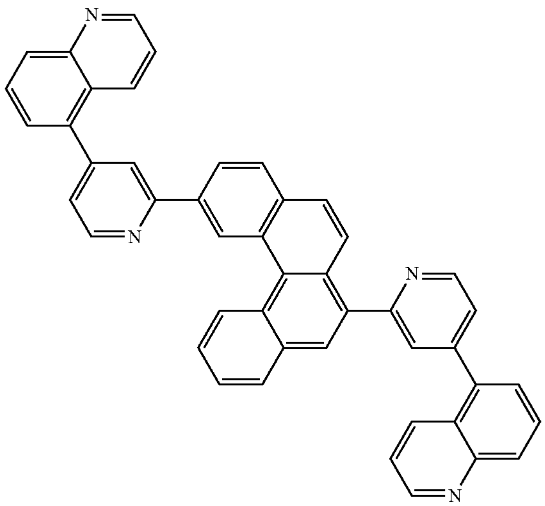
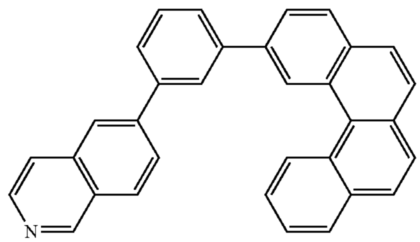
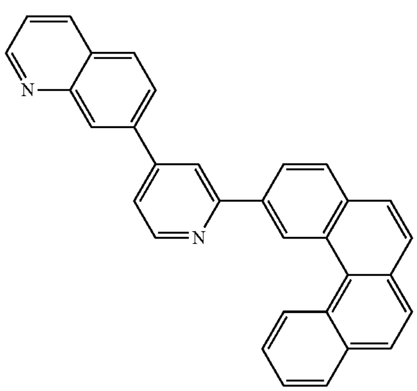
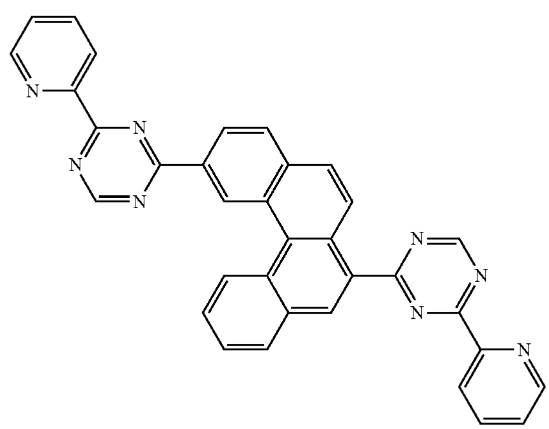
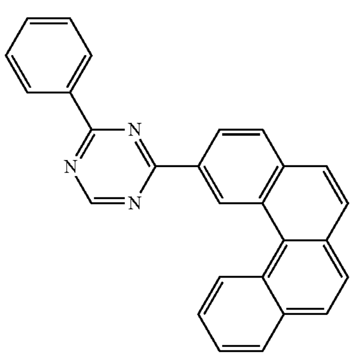
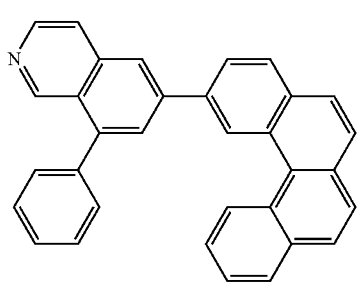
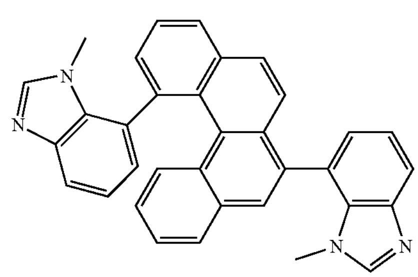

-continued
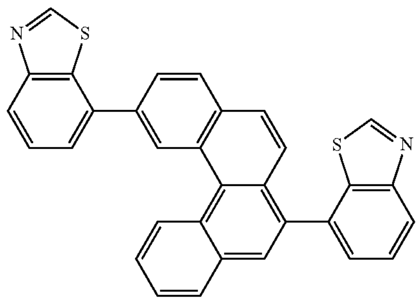
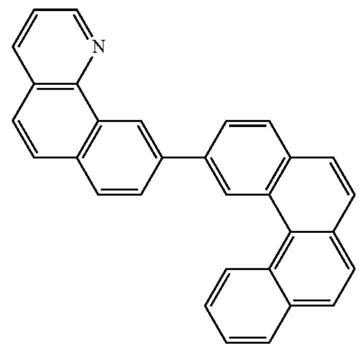
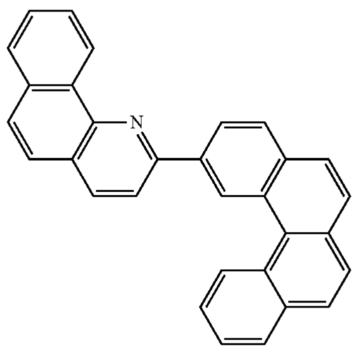
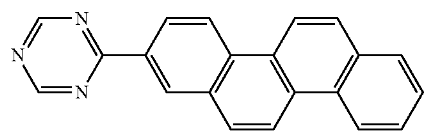
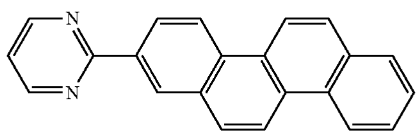
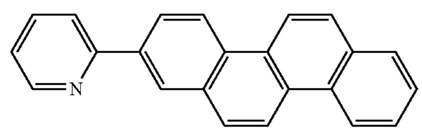
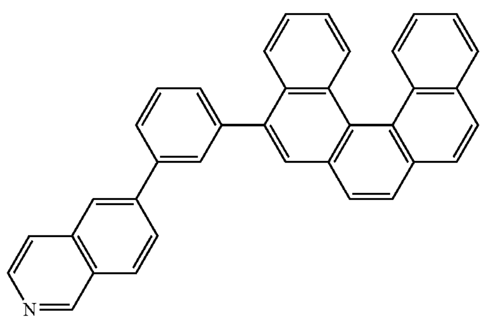
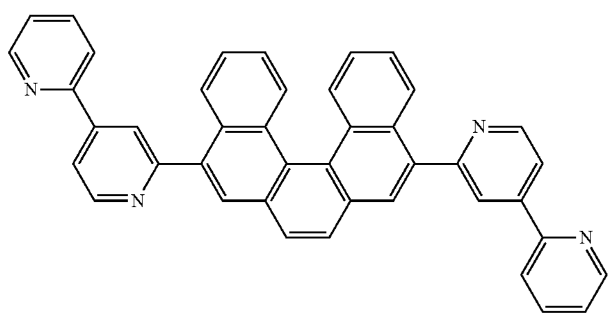
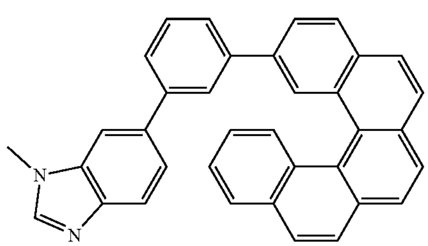
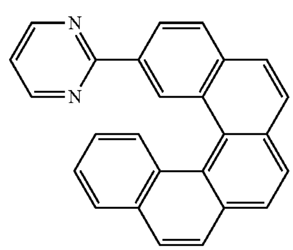
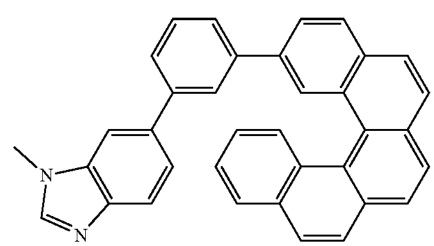
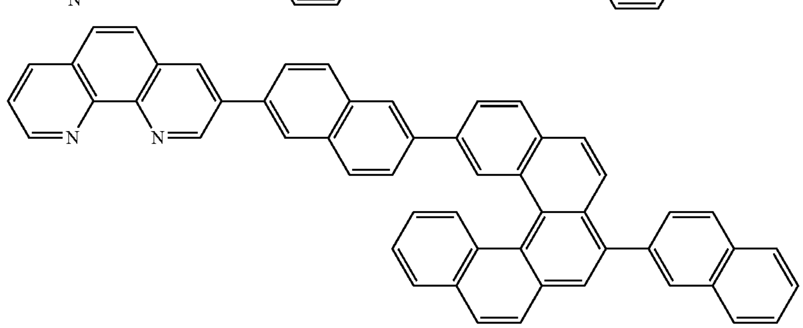

-continued
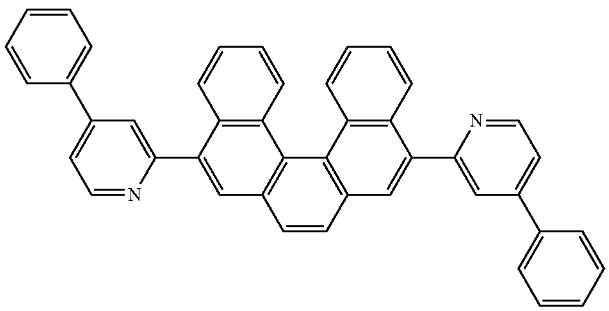
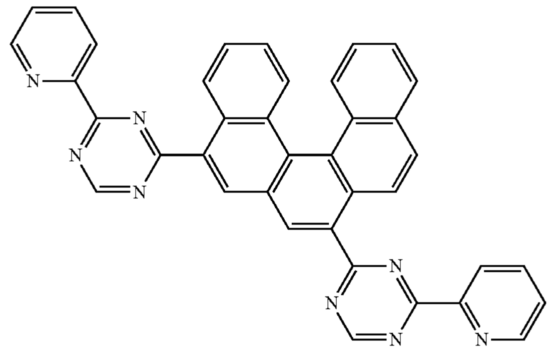
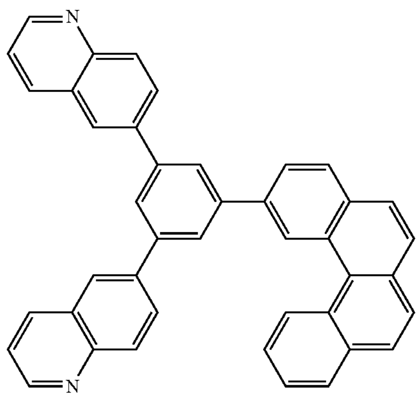
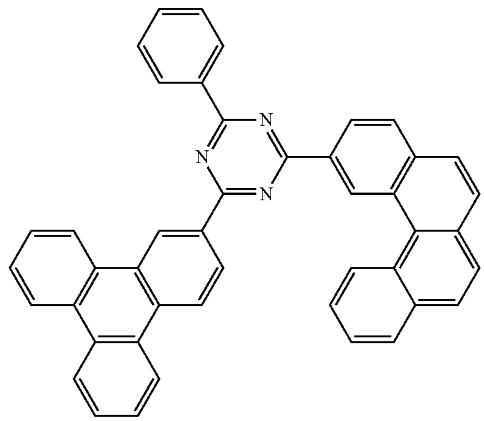
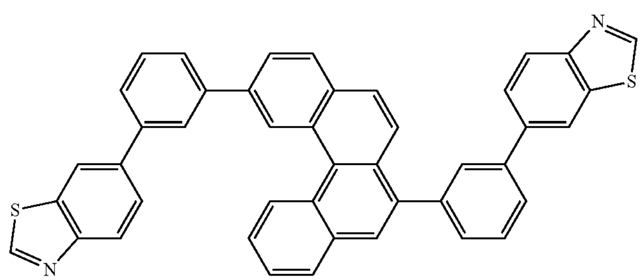
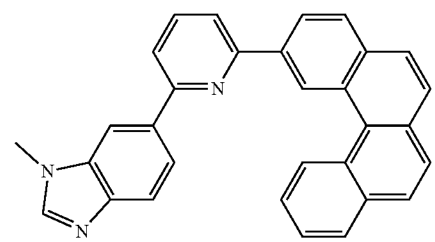
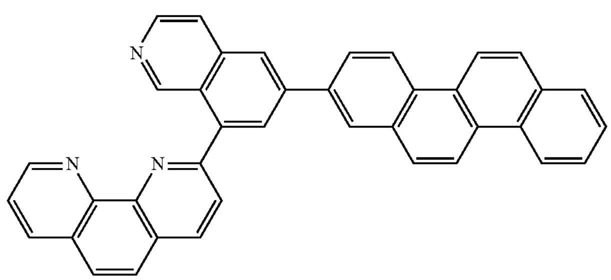
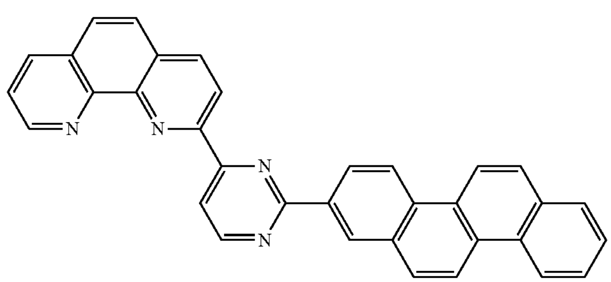
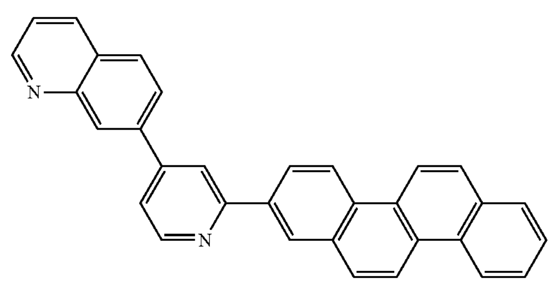

-continued
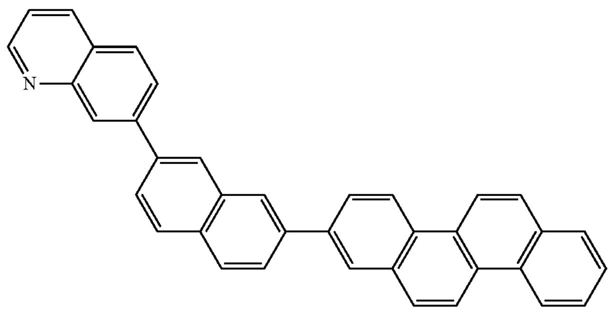
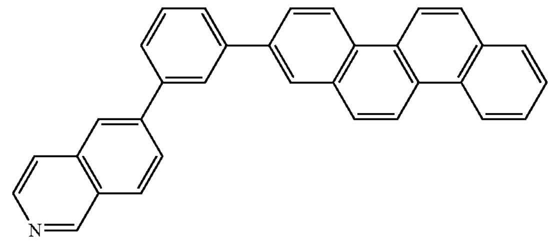
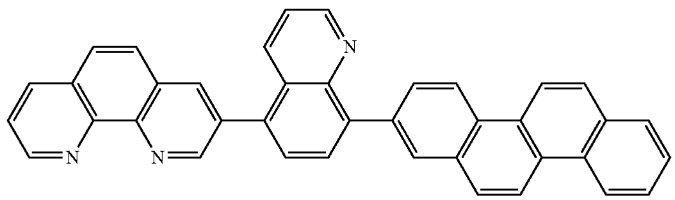
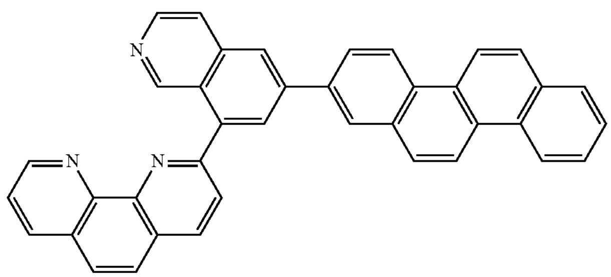
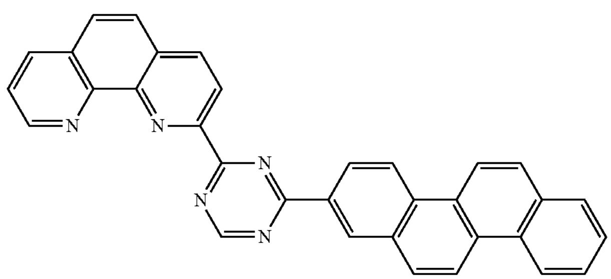
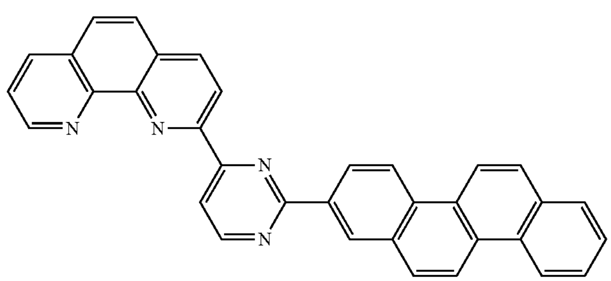
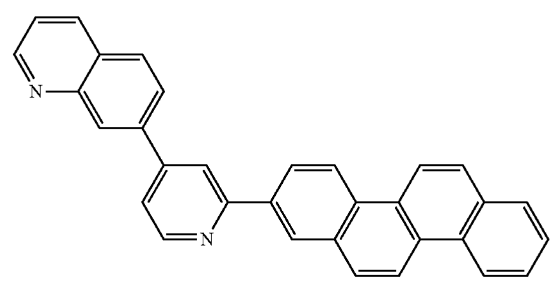
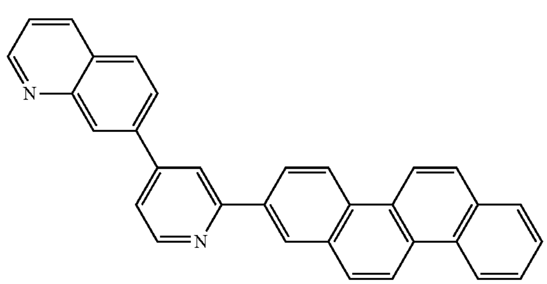
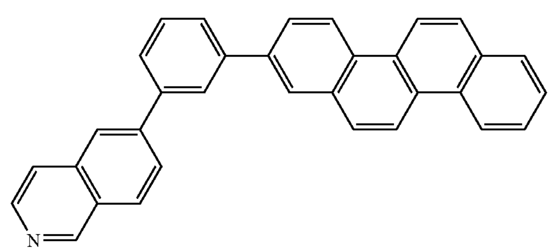

-continued
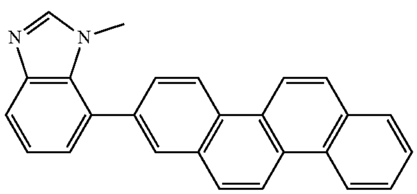
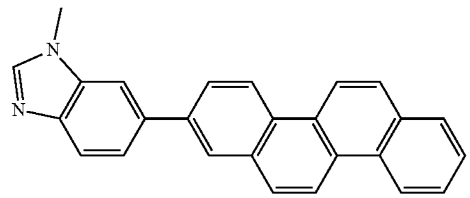
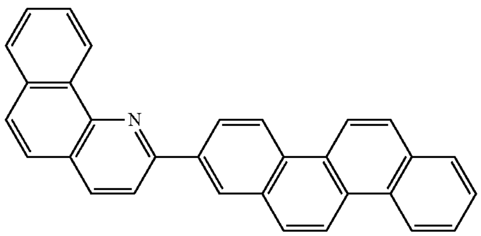
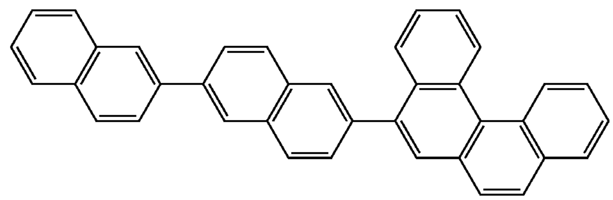
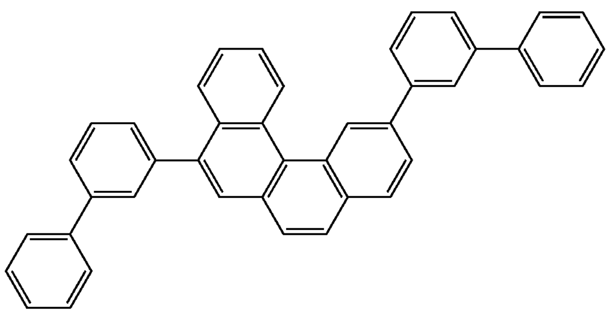
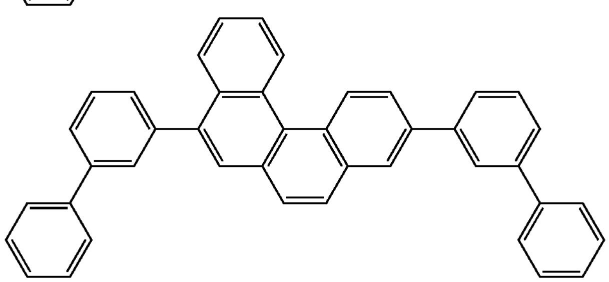
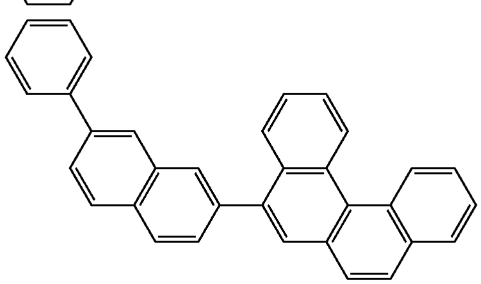
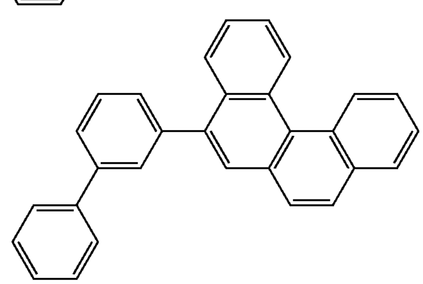
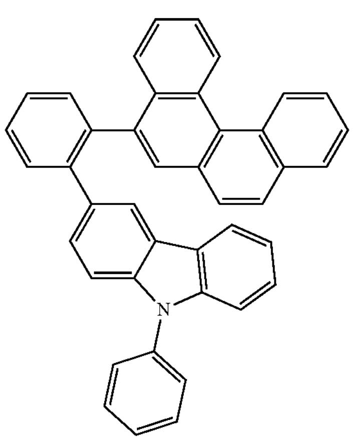
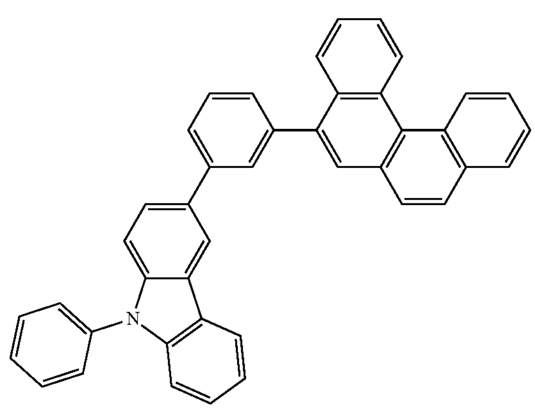

-continued
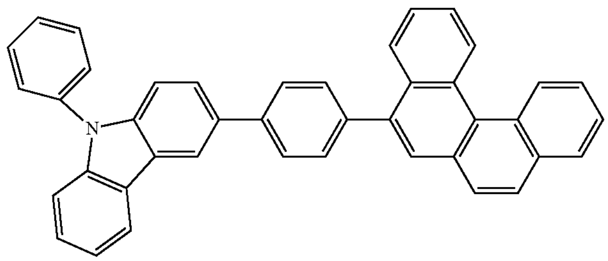
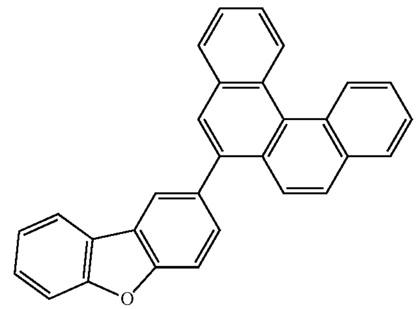
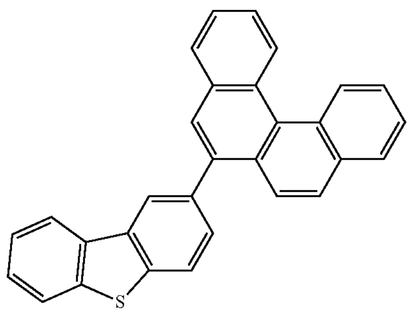
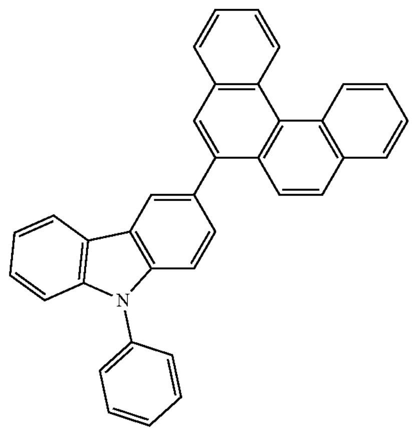
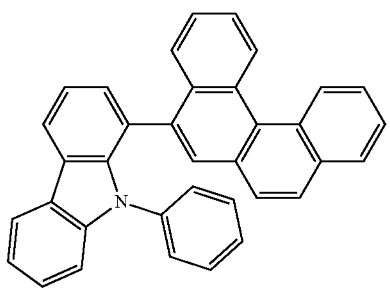
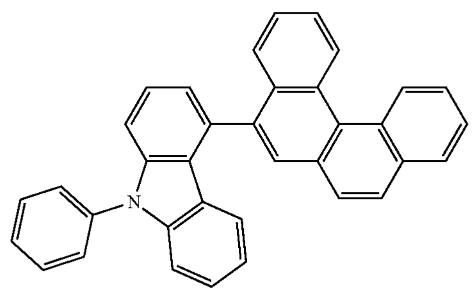
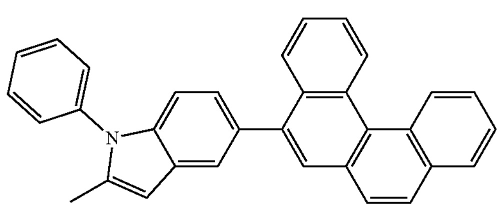
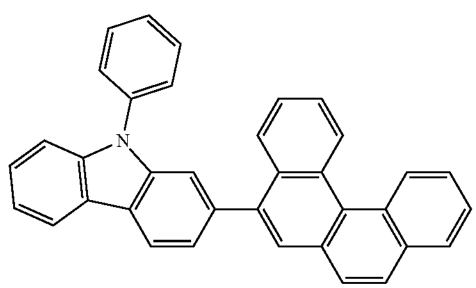
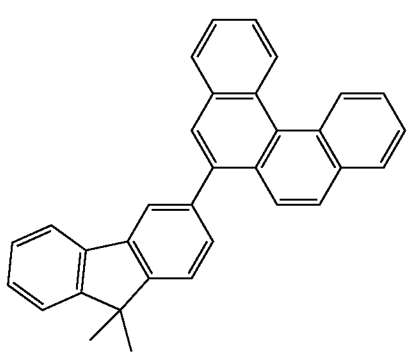
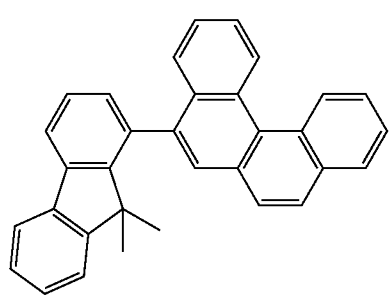

-continued
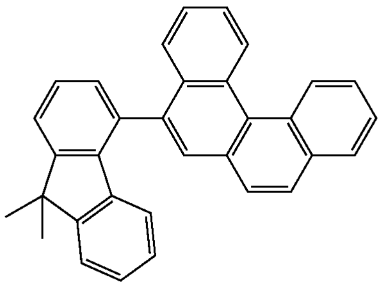
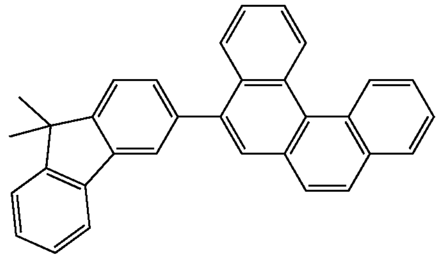
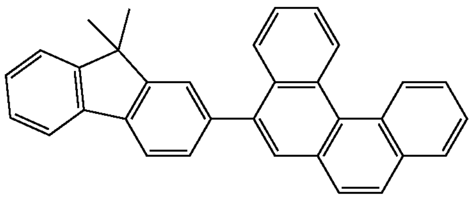
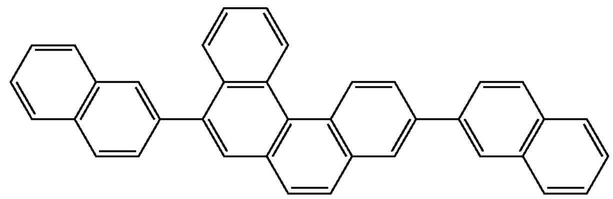
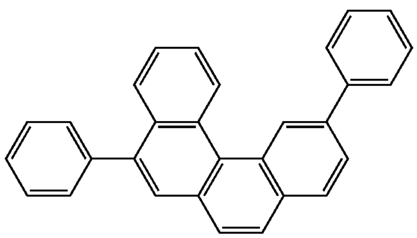
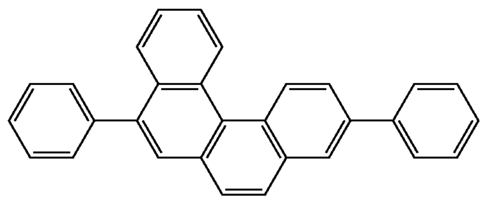
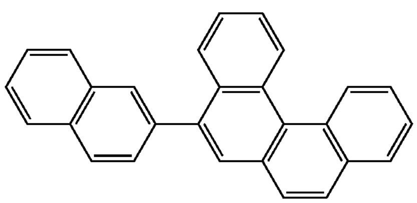
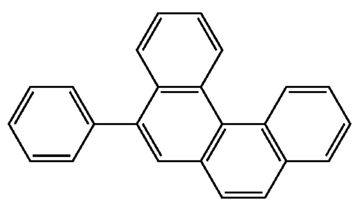
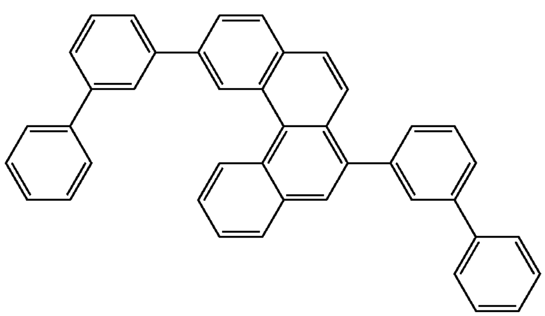
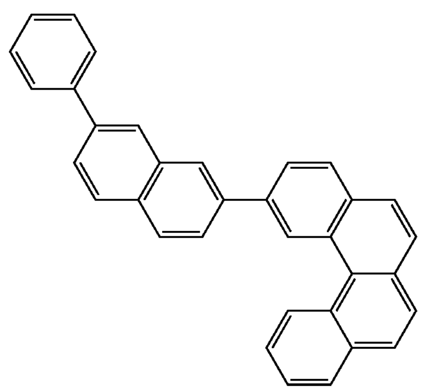
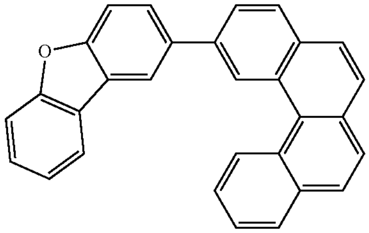
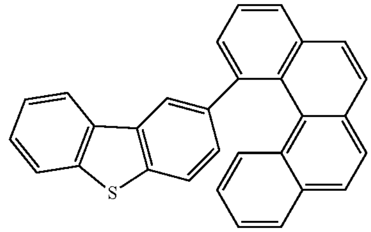

-continued
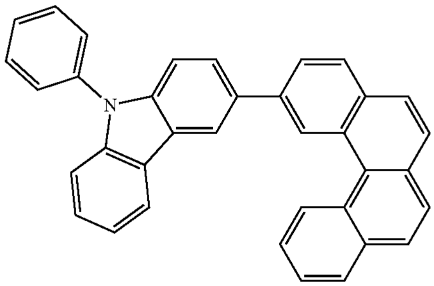
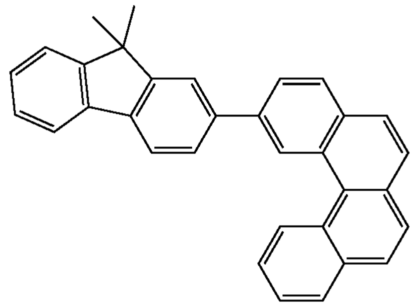
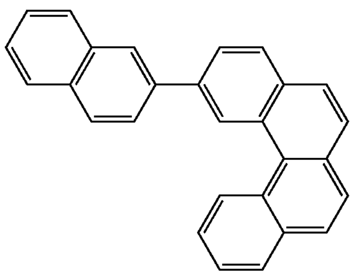
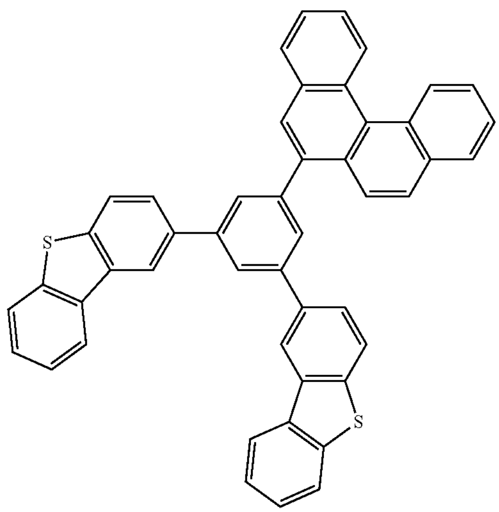
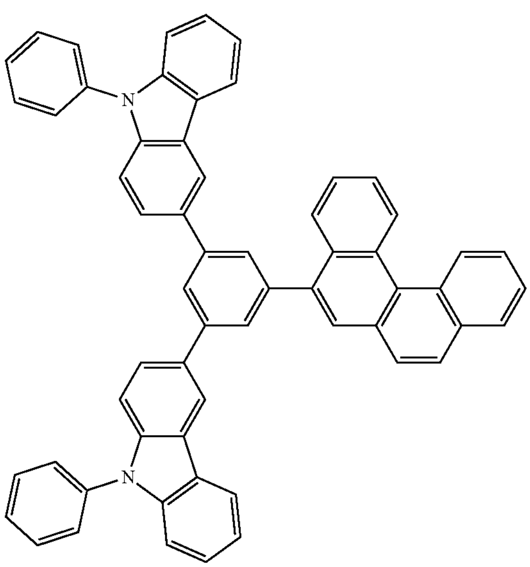
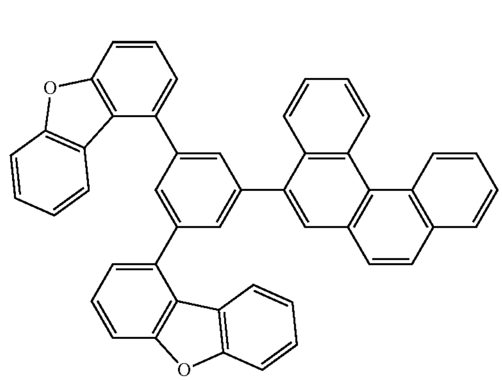

-continued
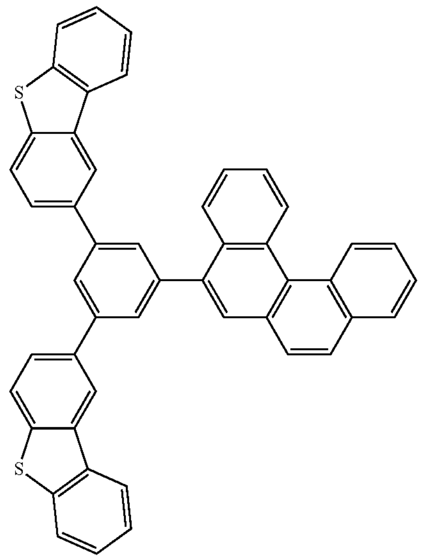
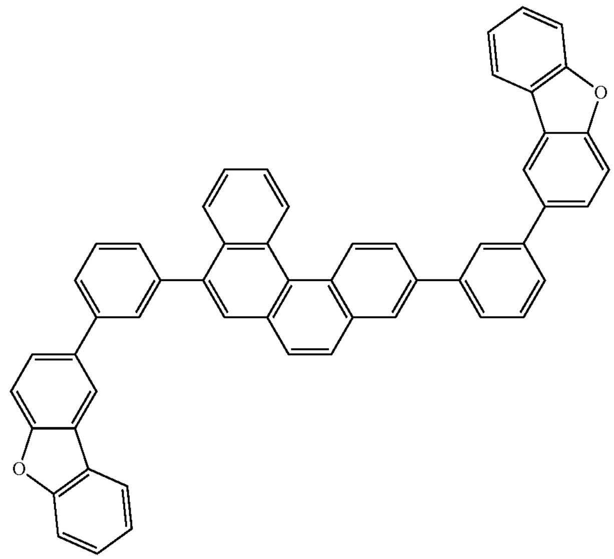
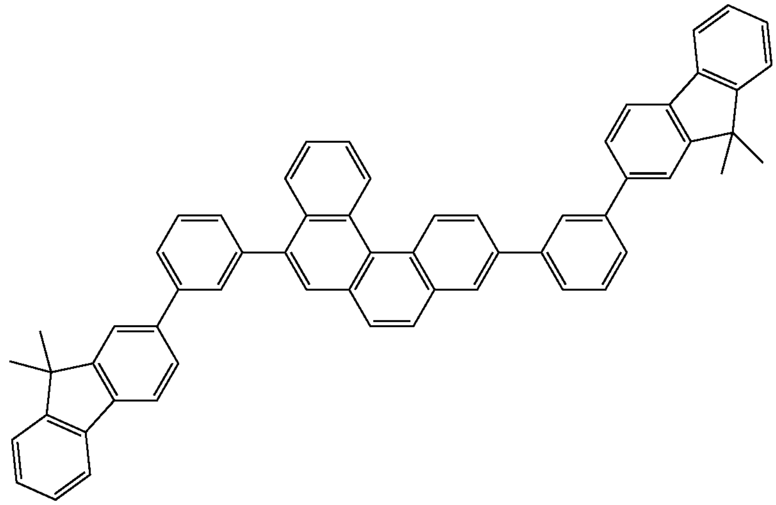
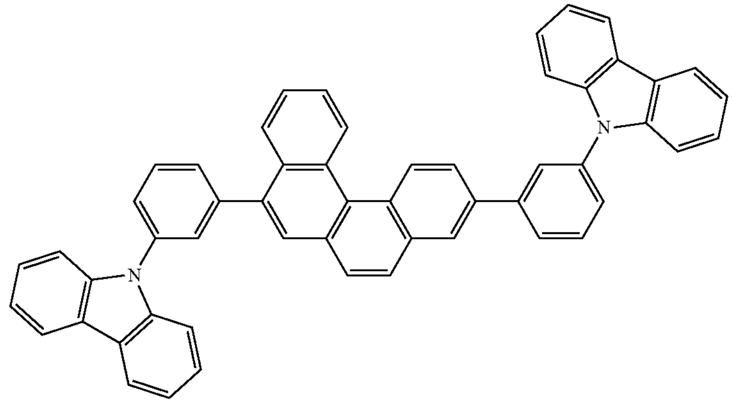
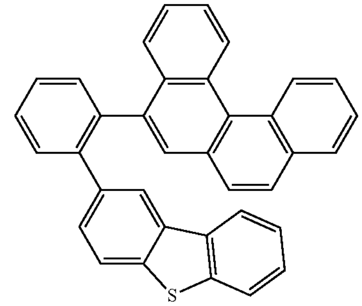

-continued
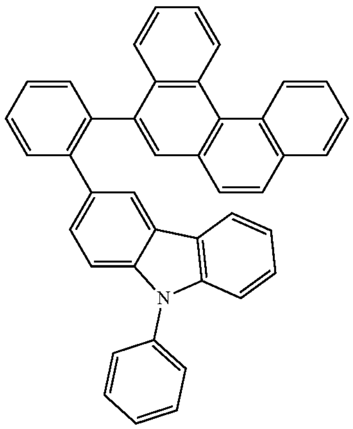
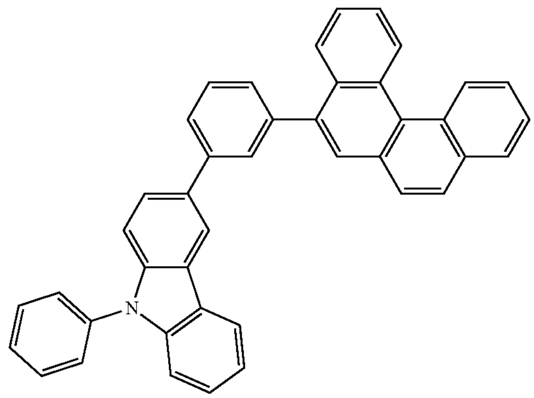
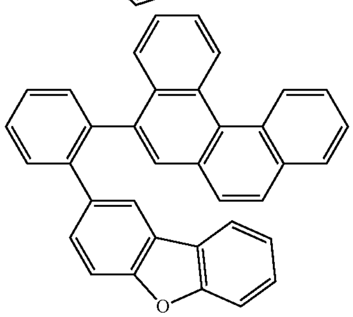
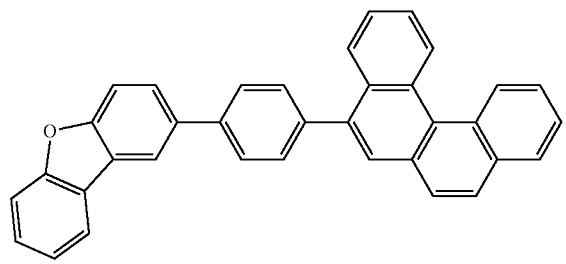
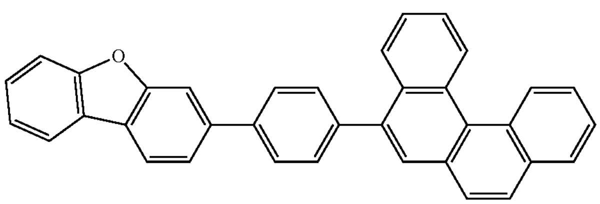
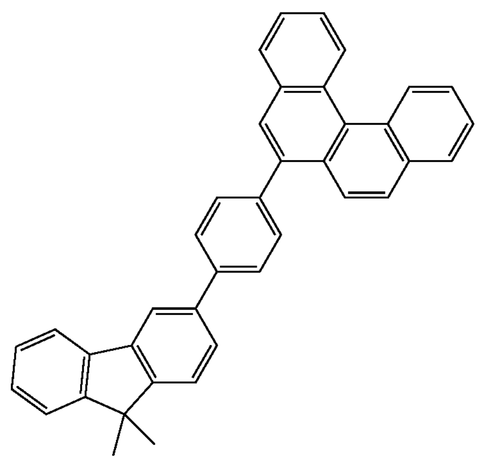
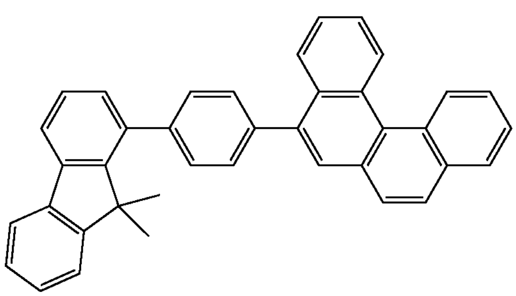
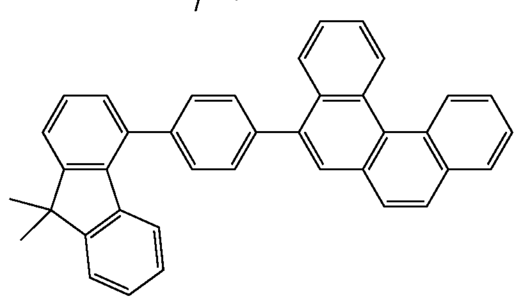
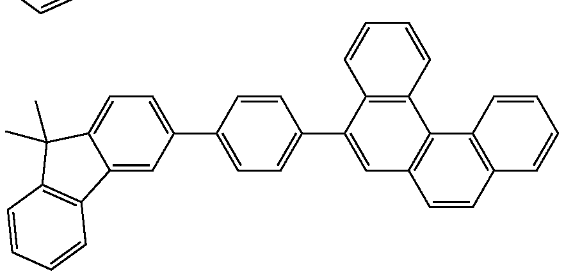
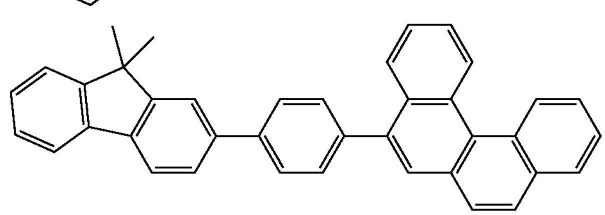

-continued
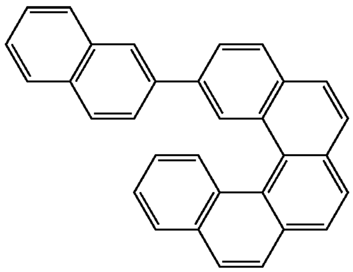
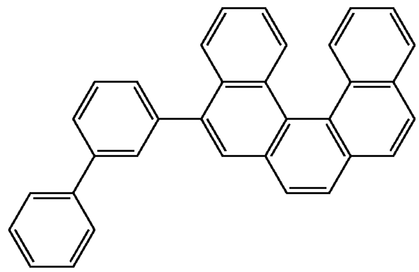
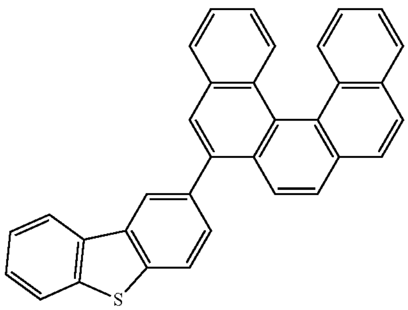
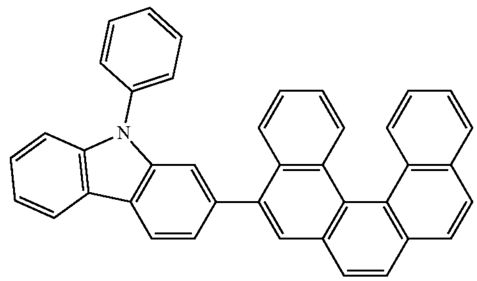
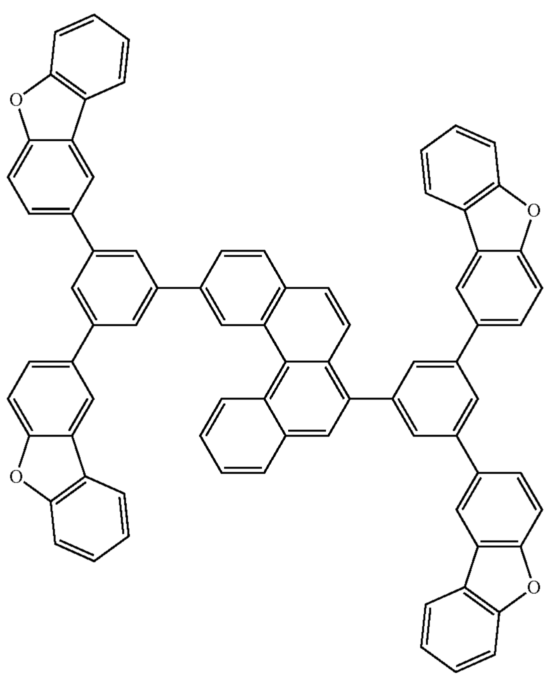
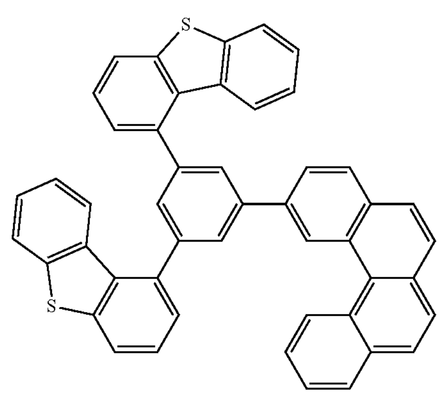

-continued
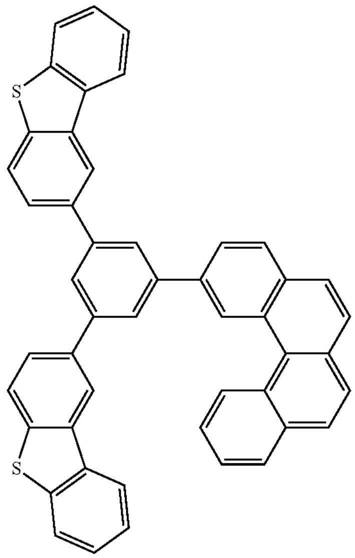
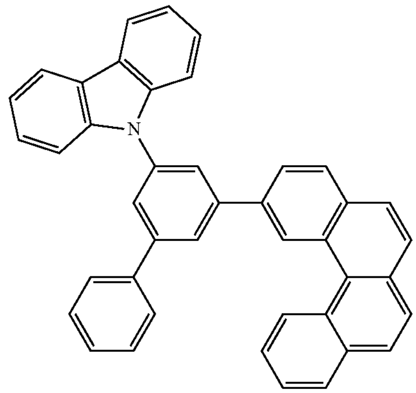
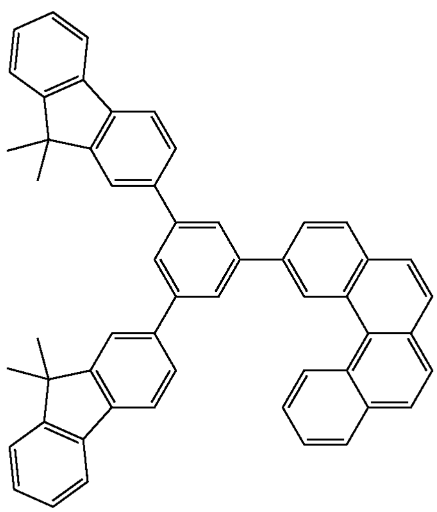
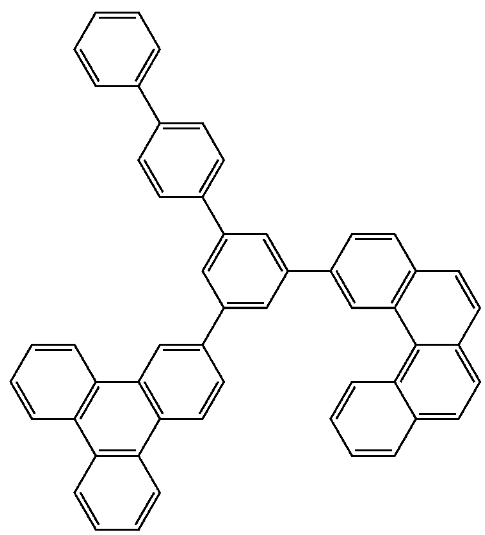
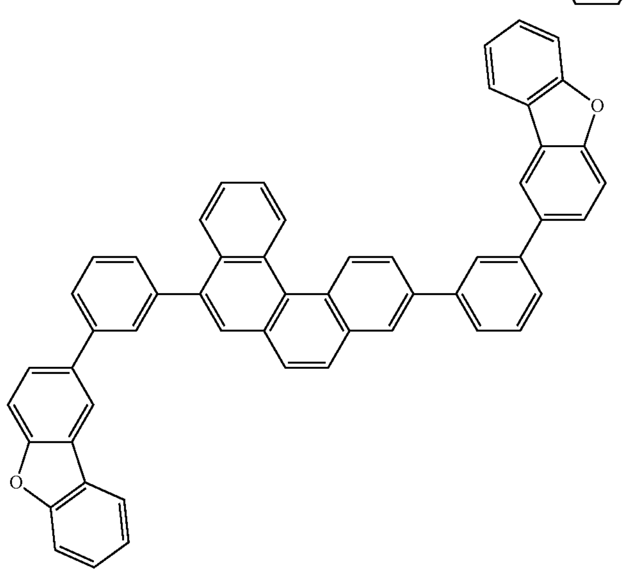

-continued
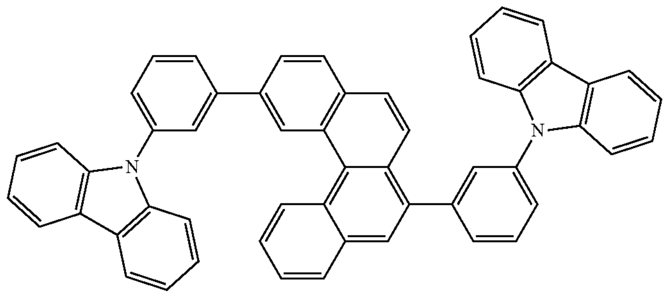
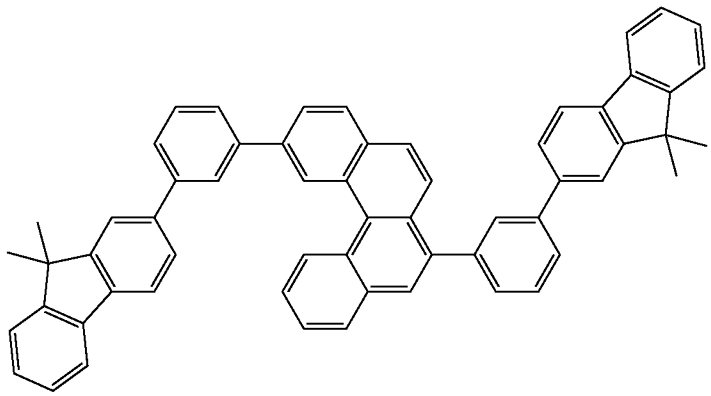
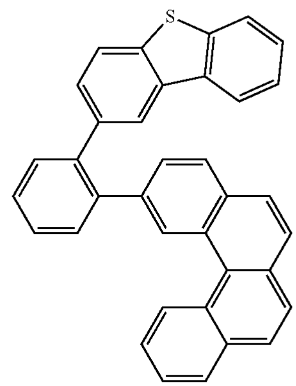
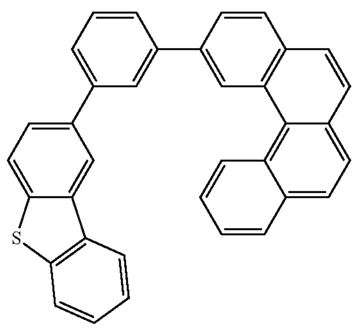
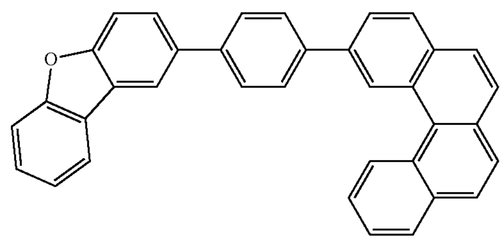
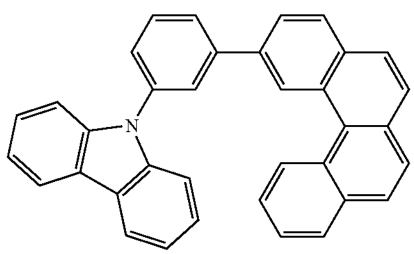
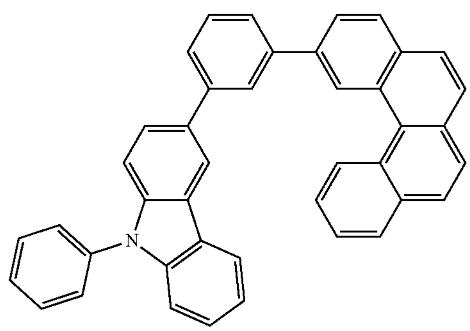
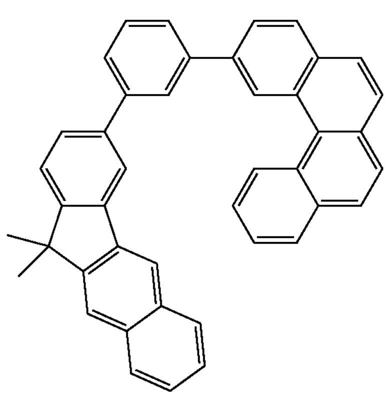
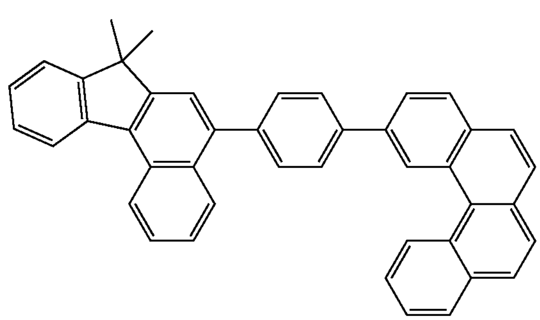

-continued
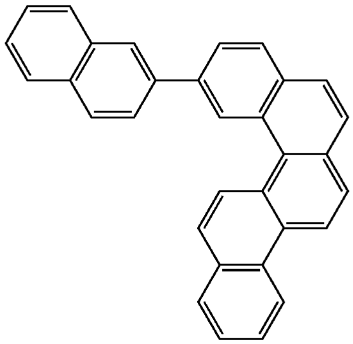
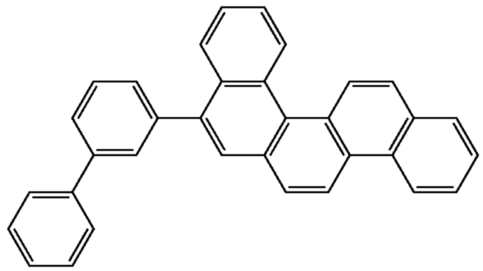
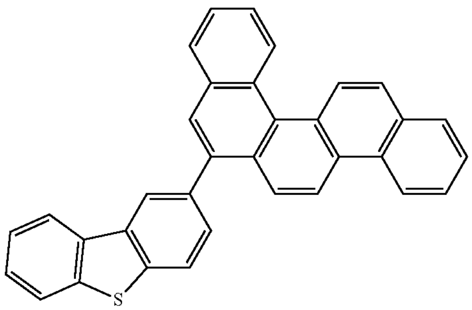
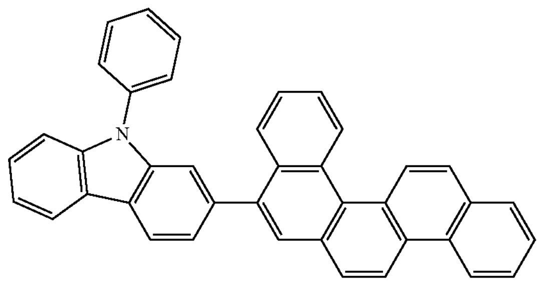
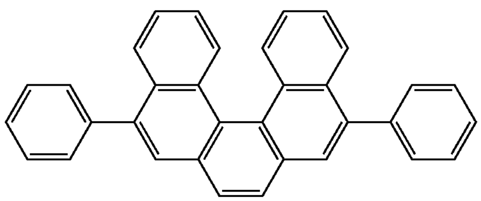
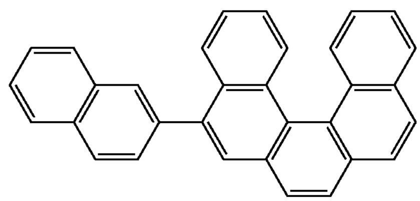
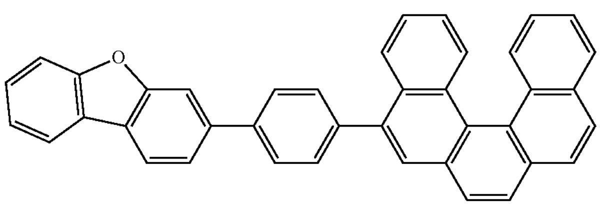
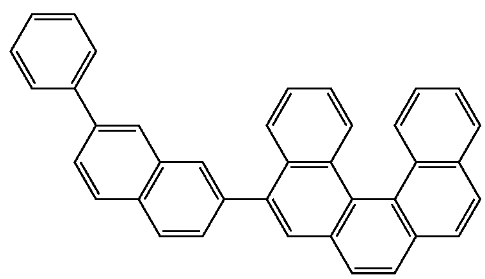
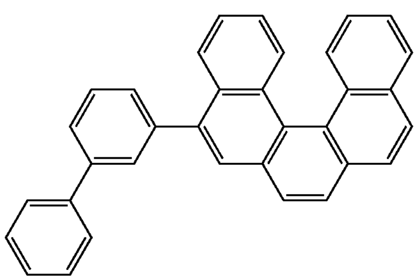
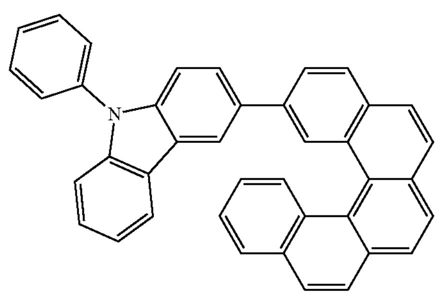
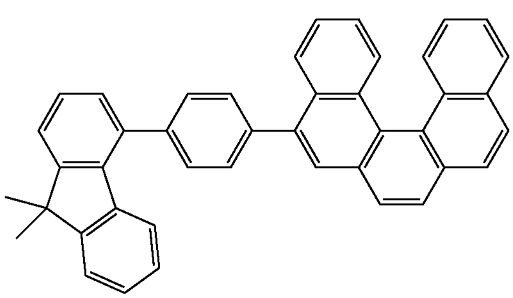
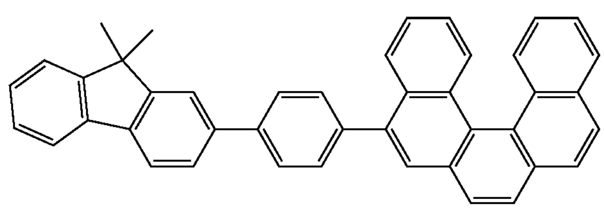

-continued
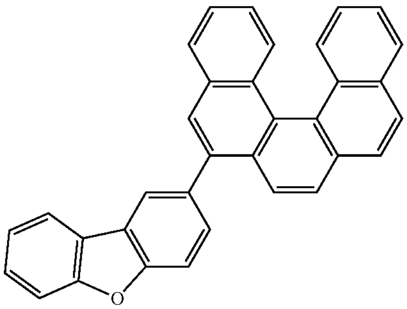
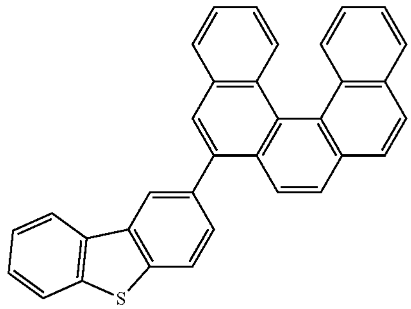
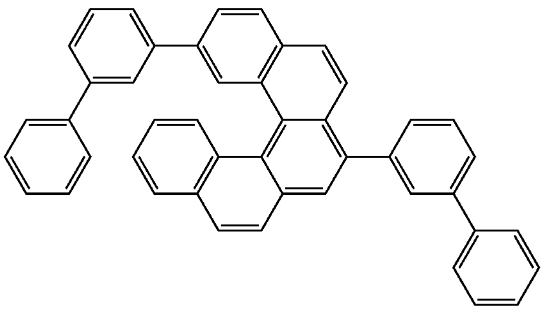
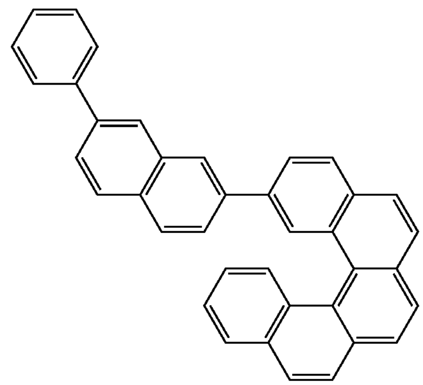
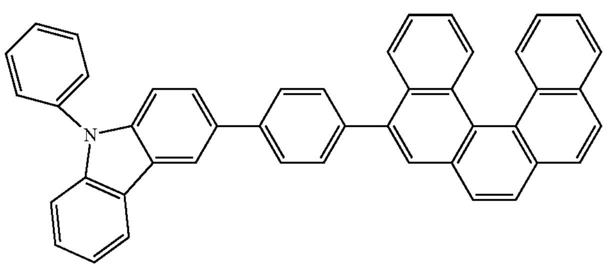
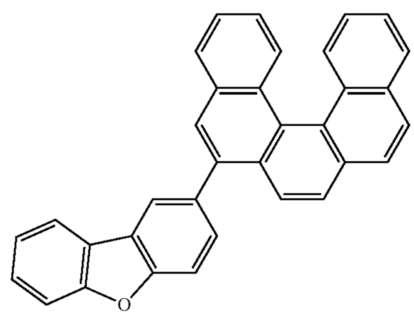
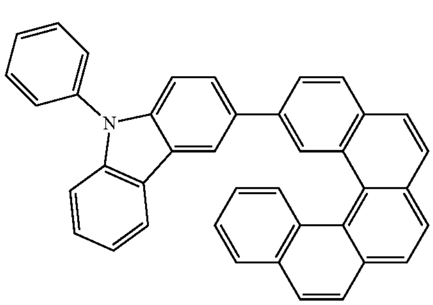
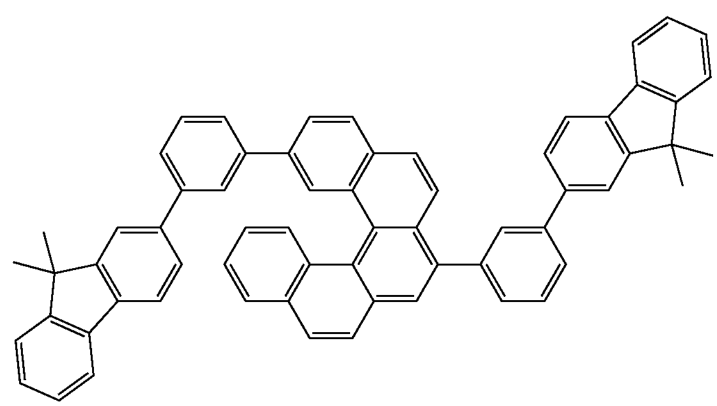

-continued
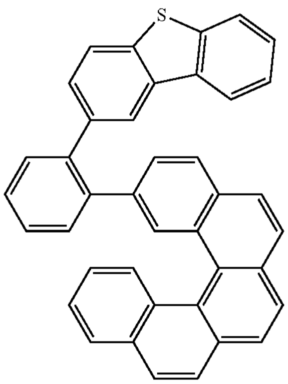
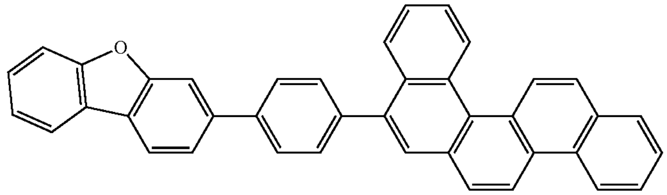
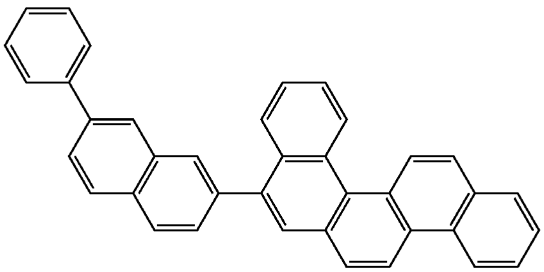
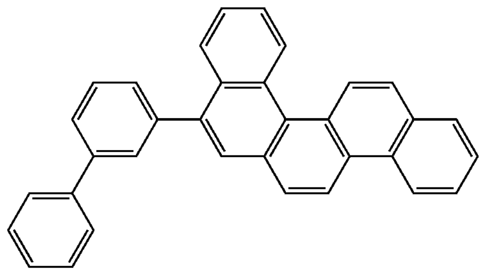
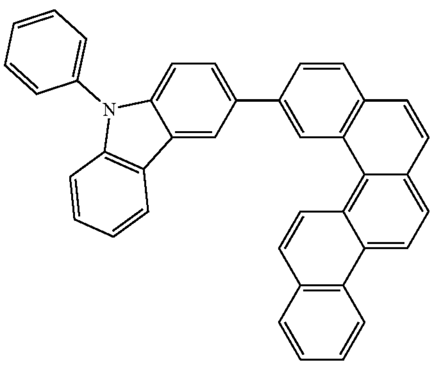
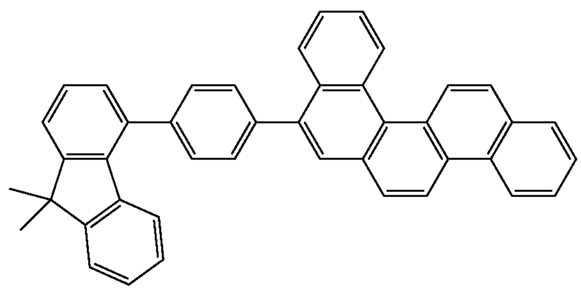
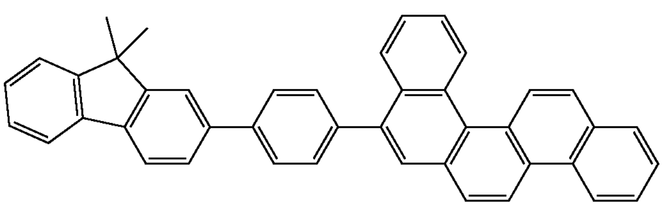
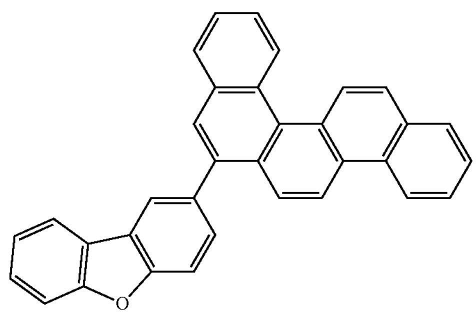
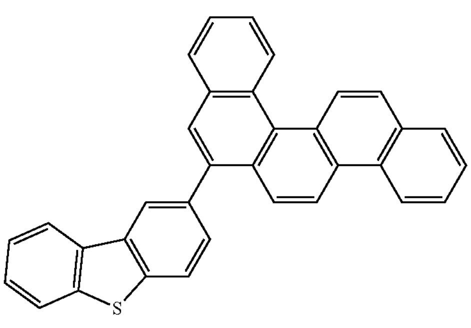
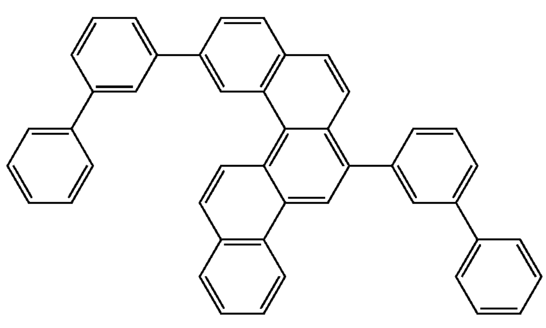

-continued
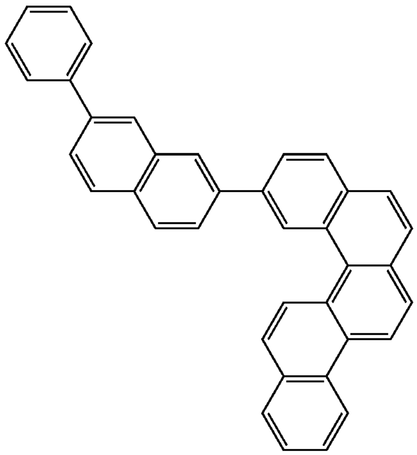
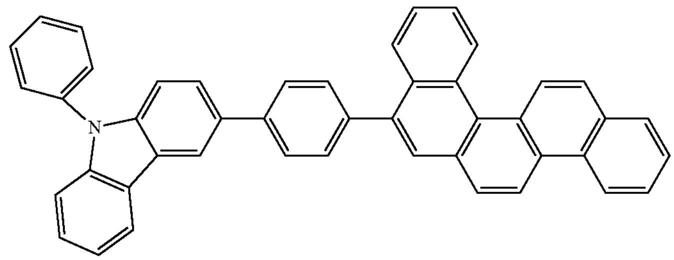
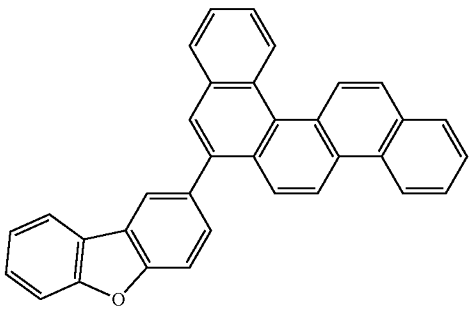
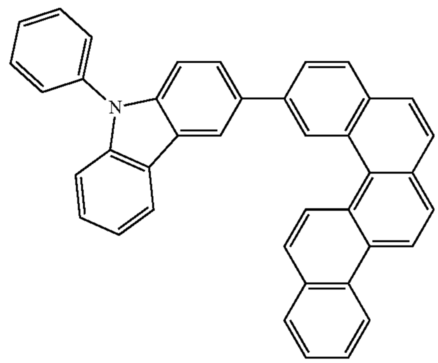
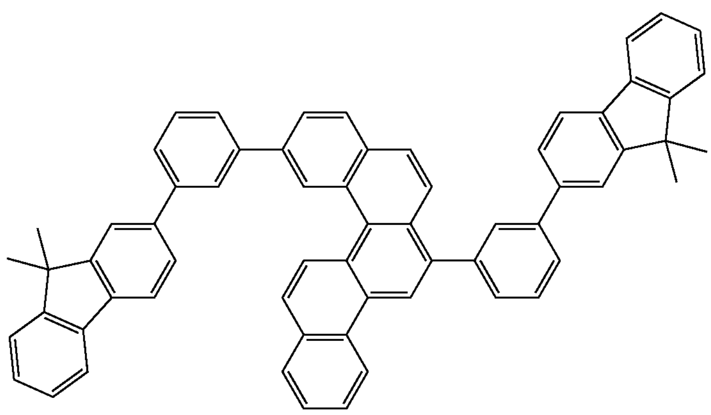
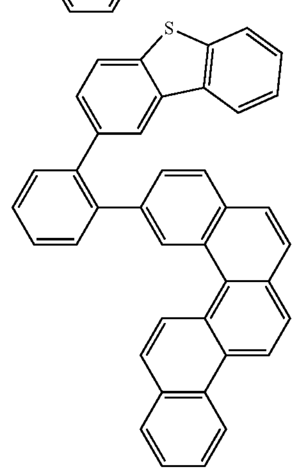
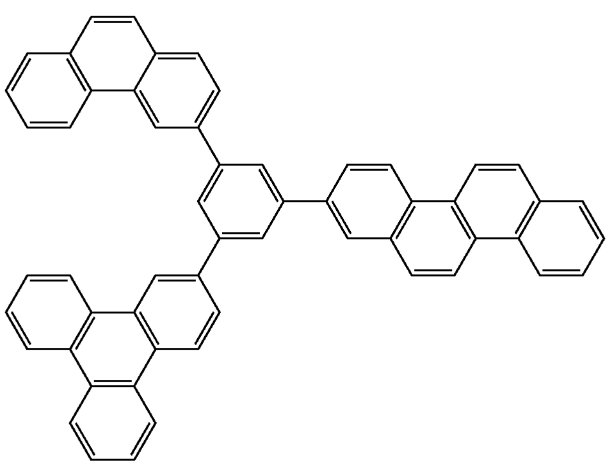

-continued
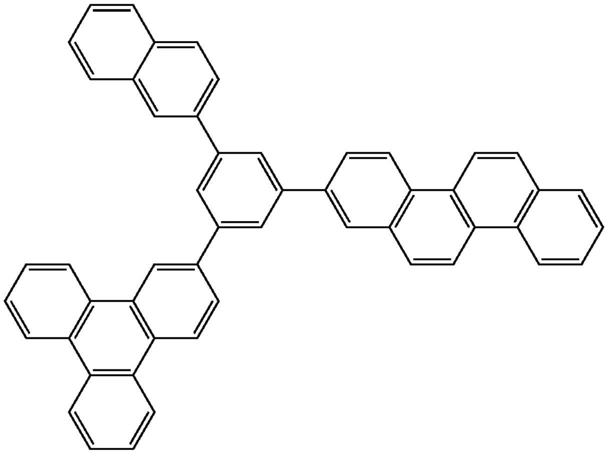
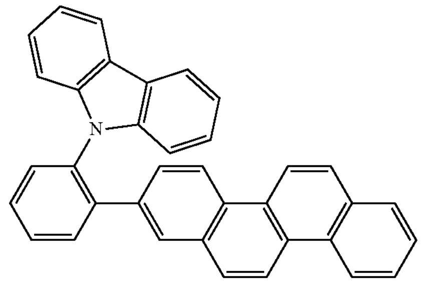
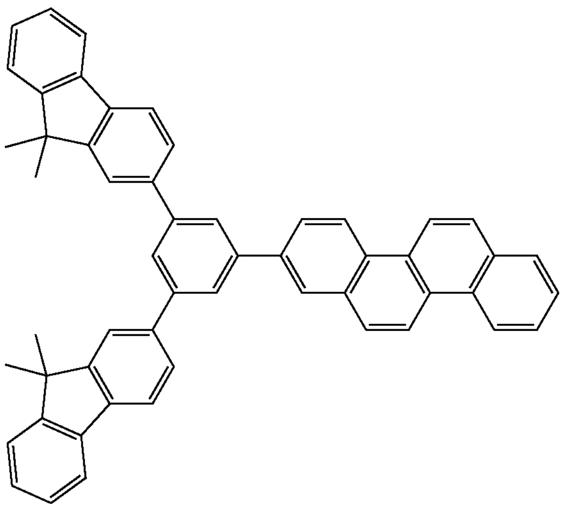
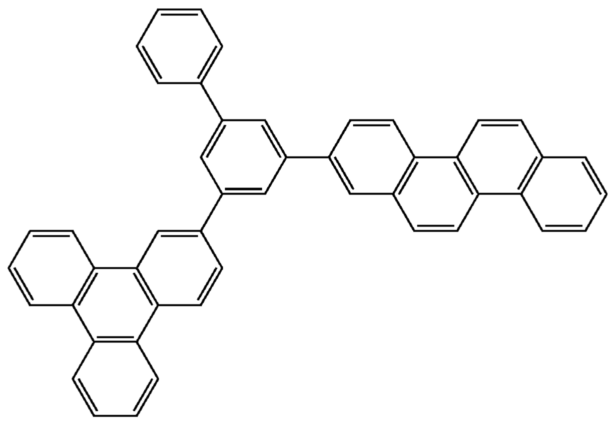
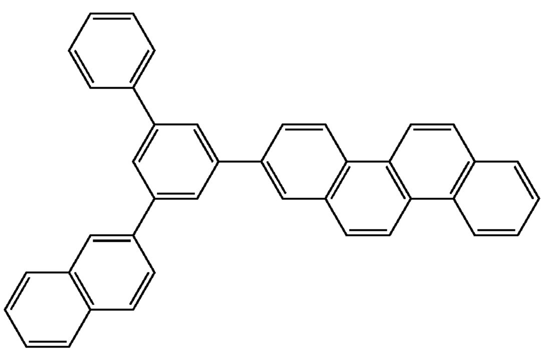
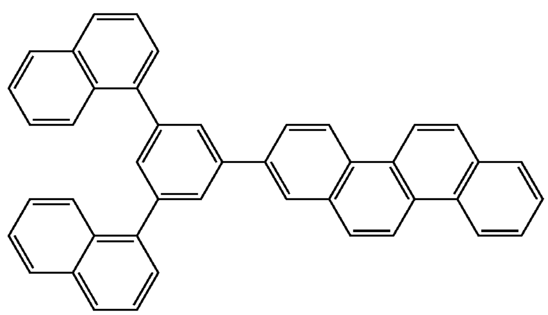
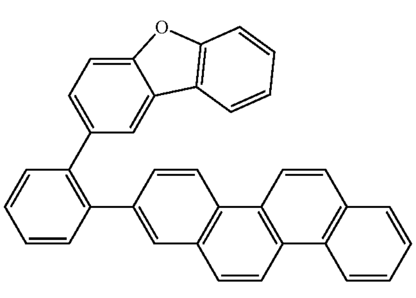
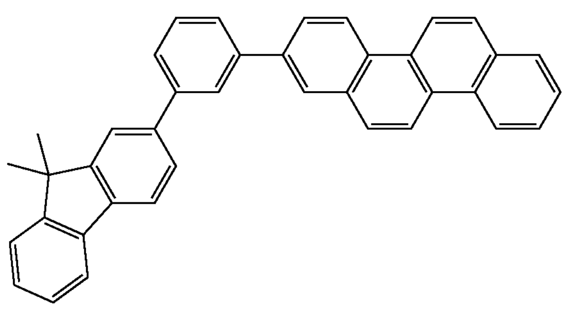

-continued
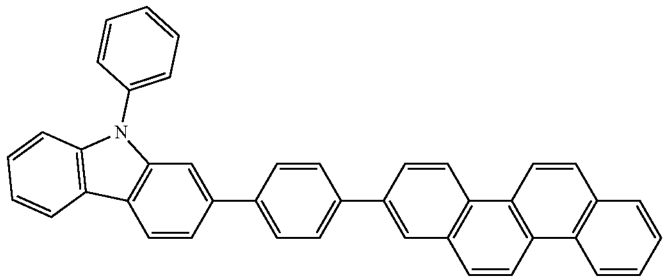
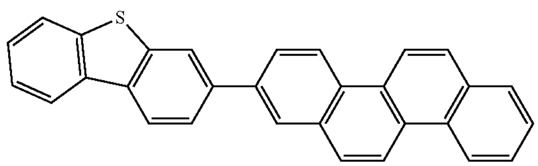
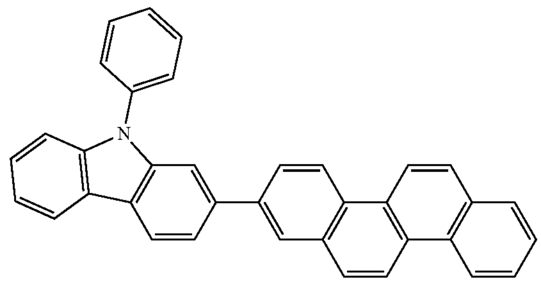
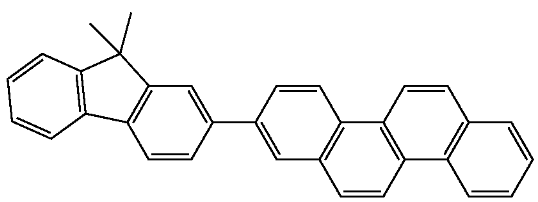
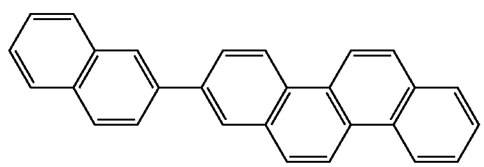
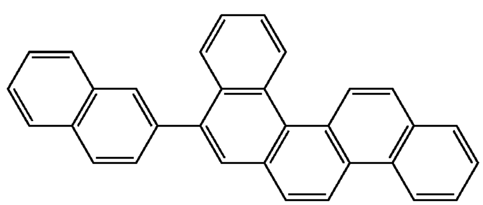
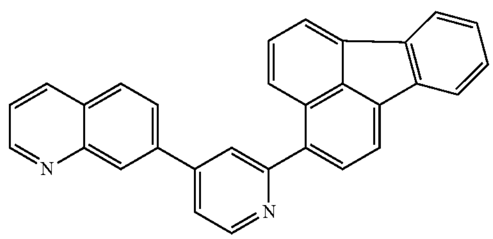
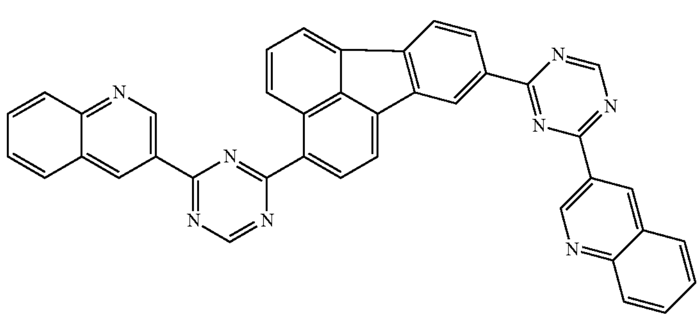
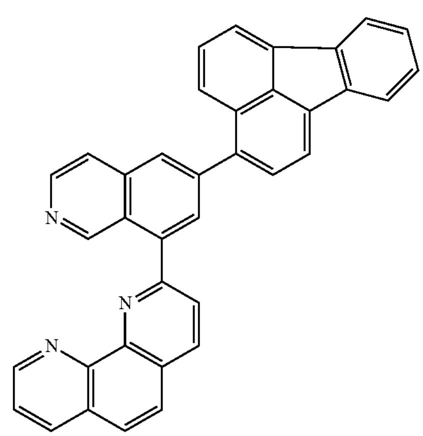

-continued
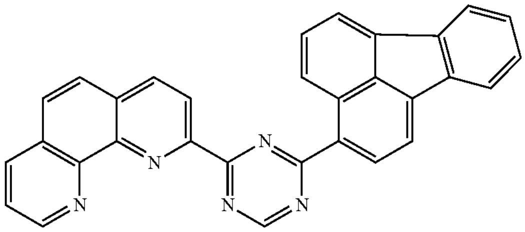
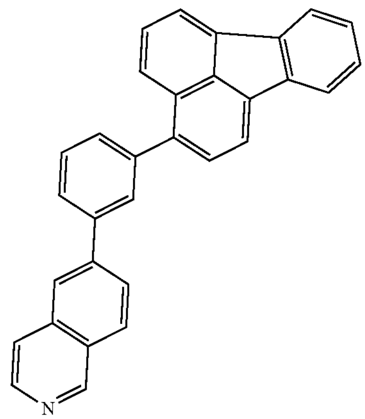
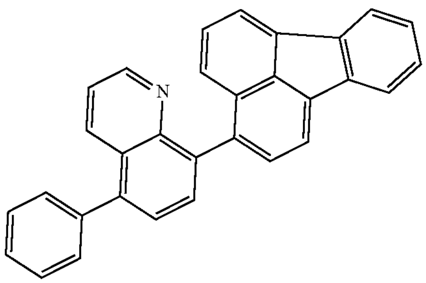
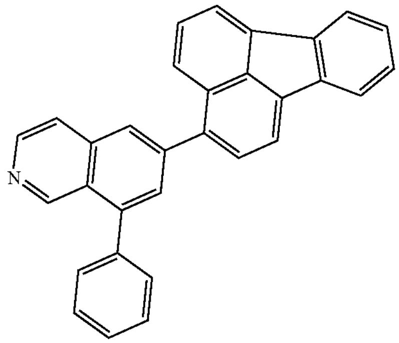
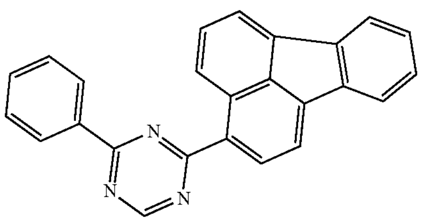
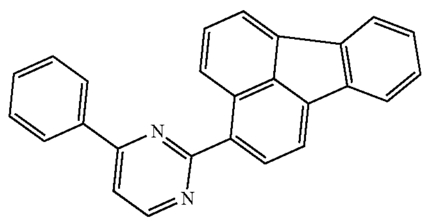
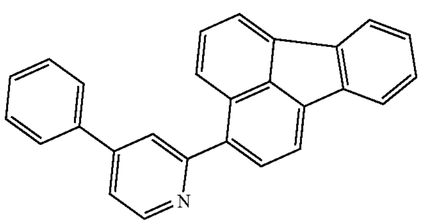
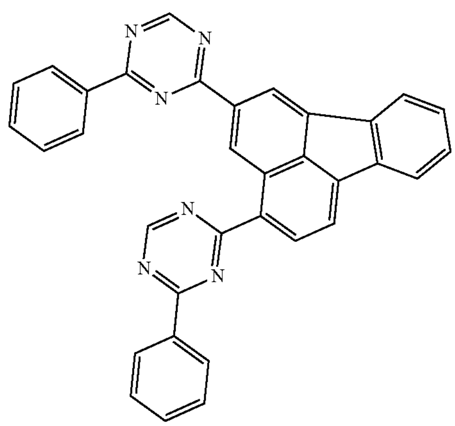
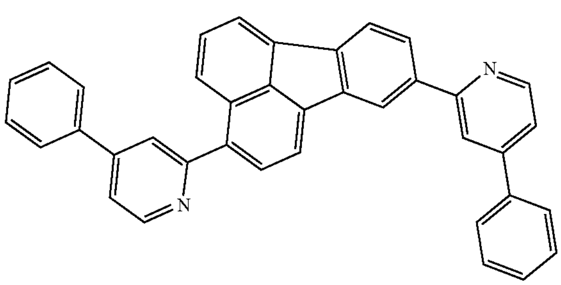
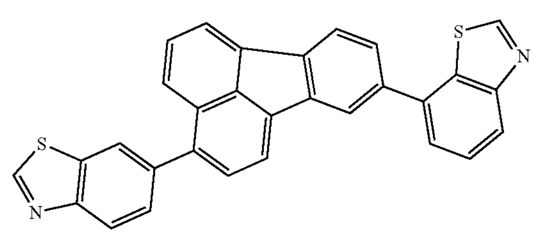

-continued
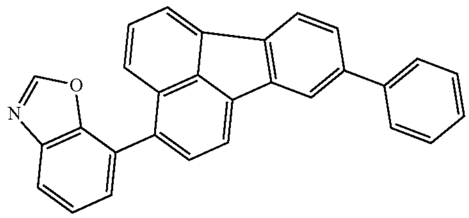
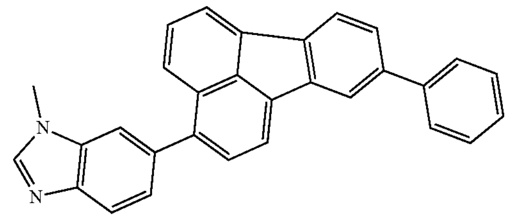
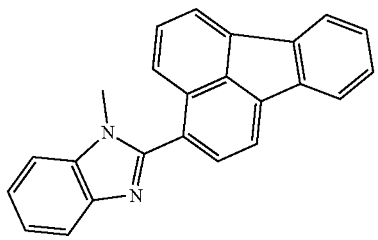
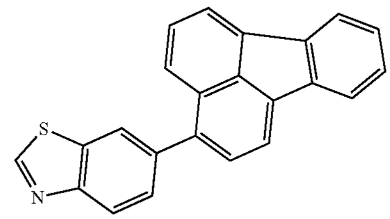
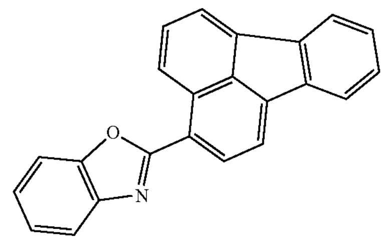
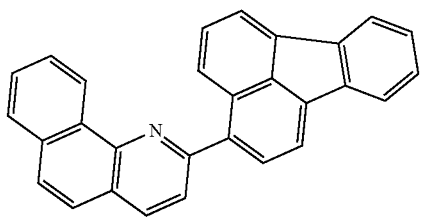
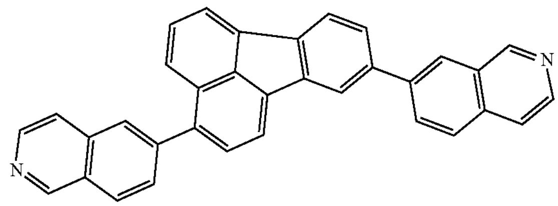
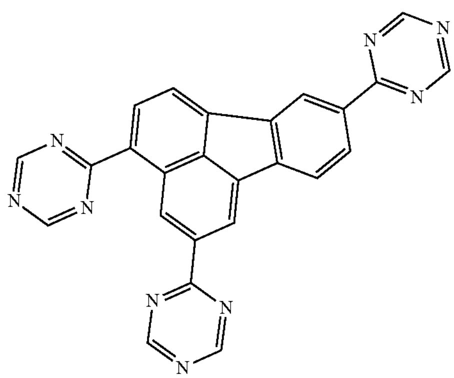
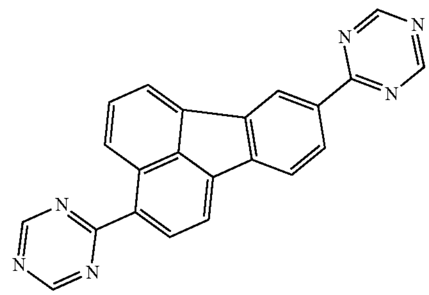
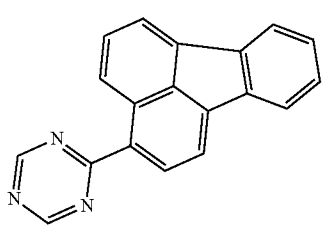
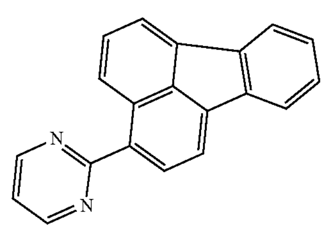
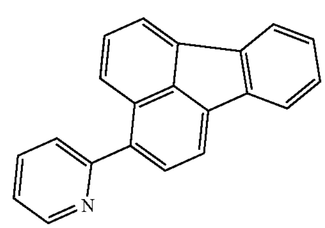
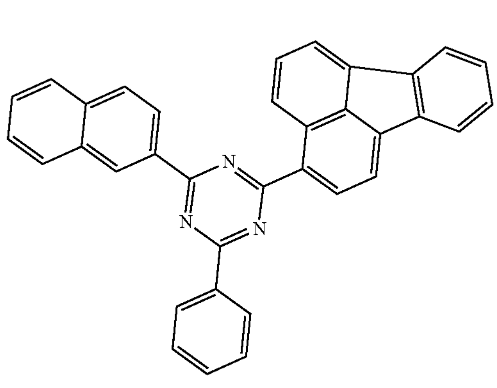
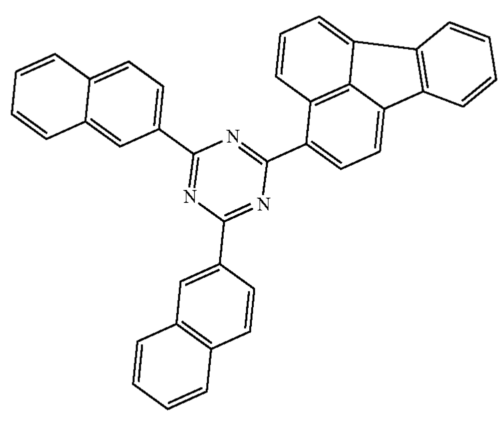

-continued
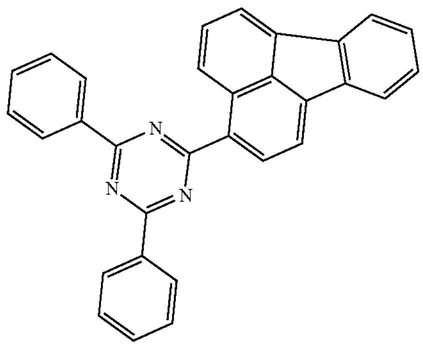
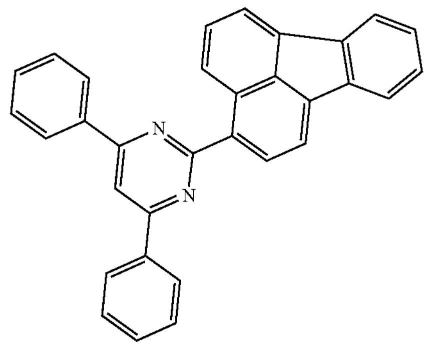
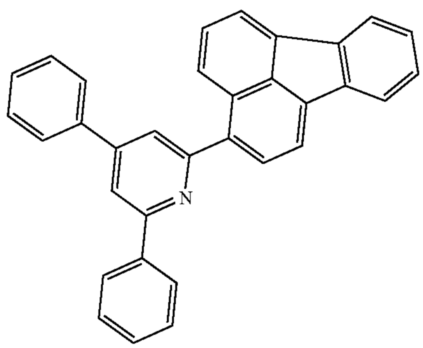
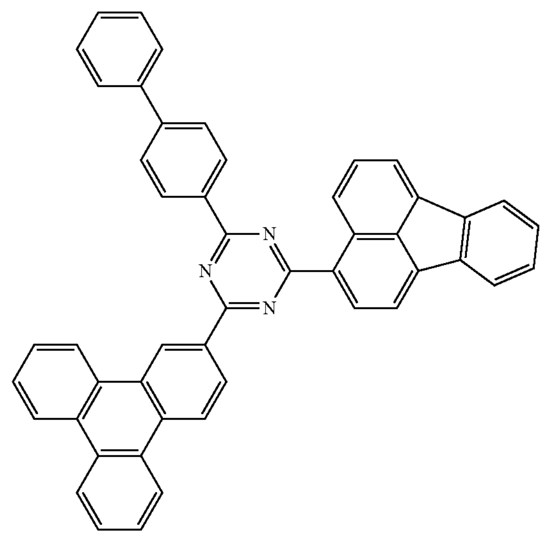
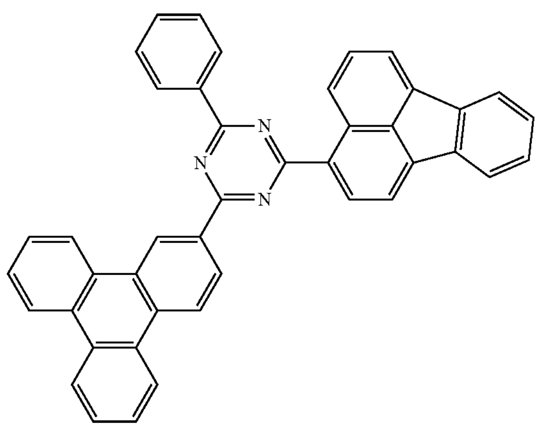
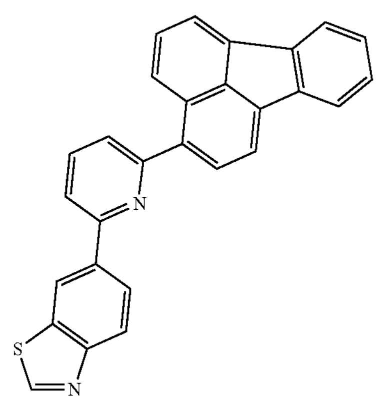
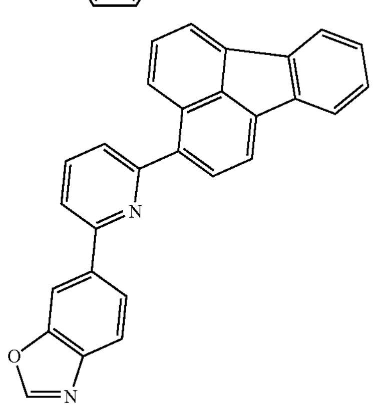
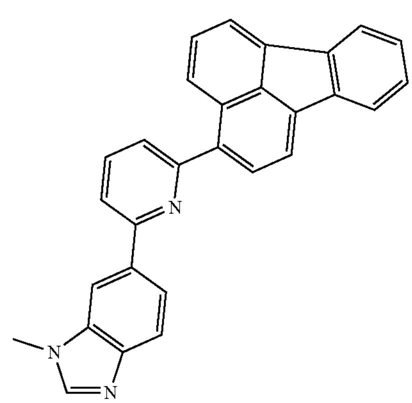

-continued
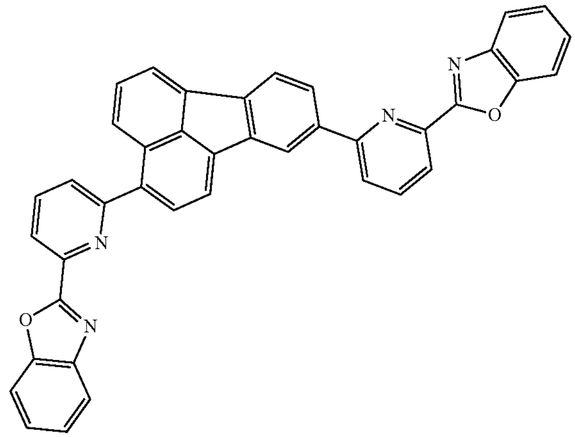
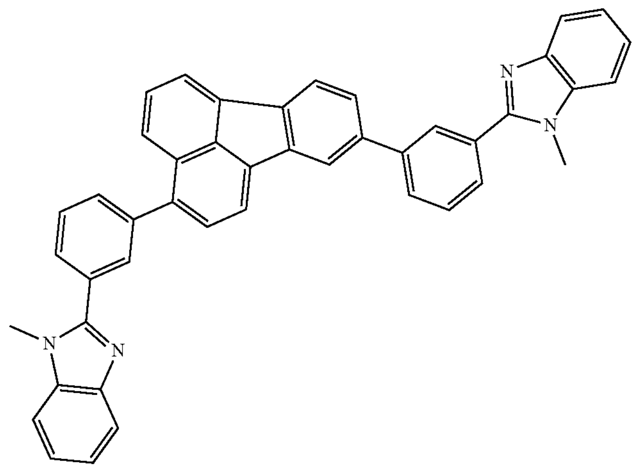
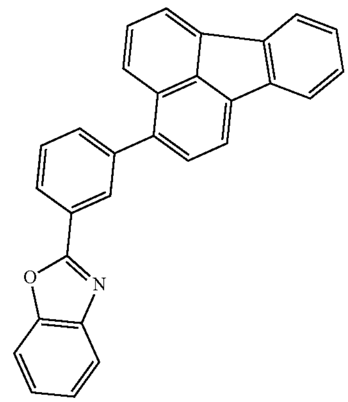
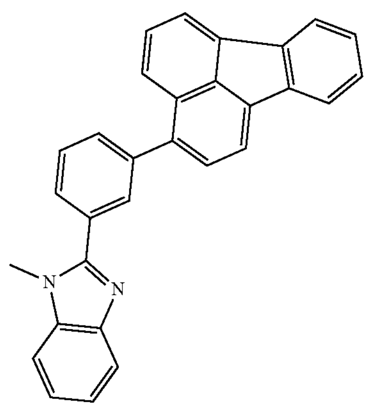
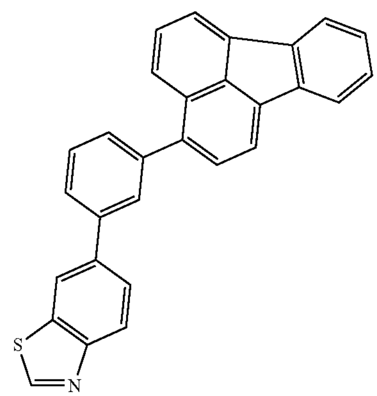
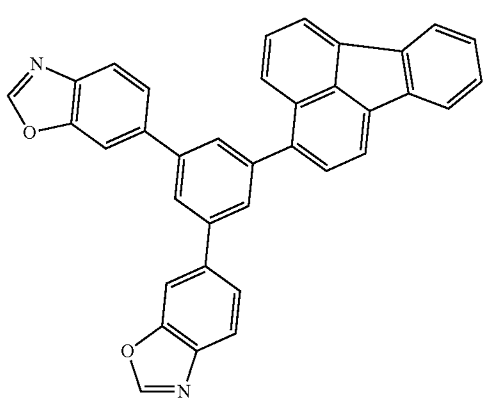
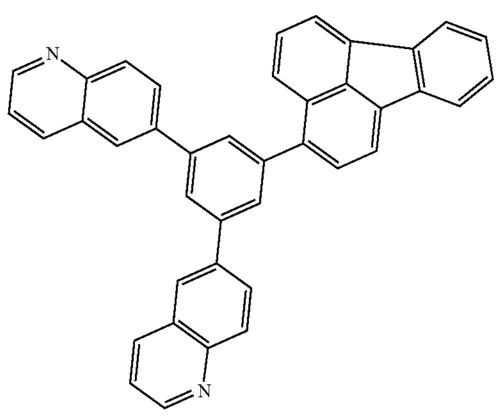

-continued
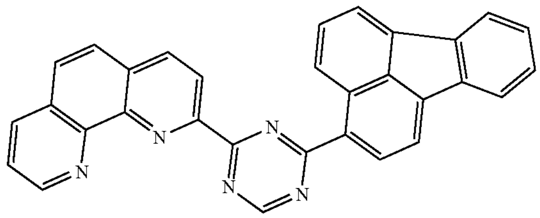
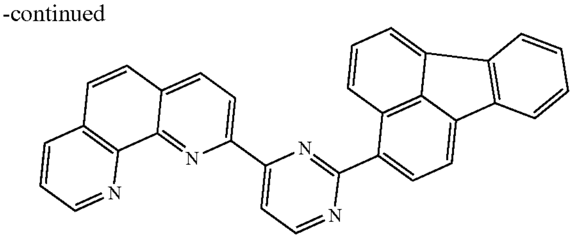
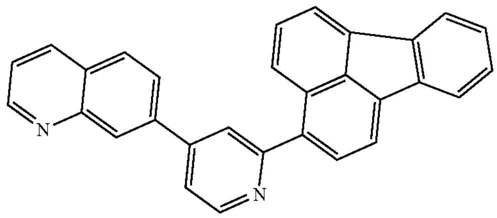
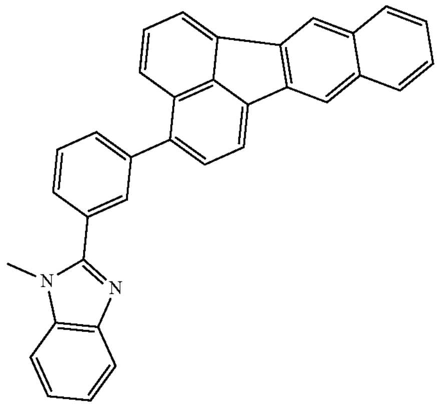
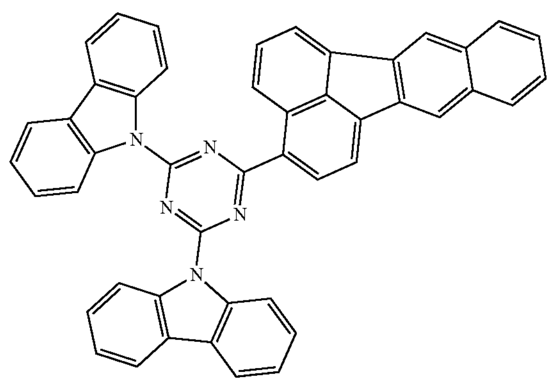
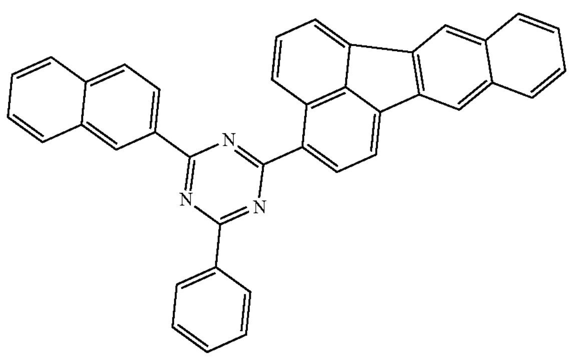
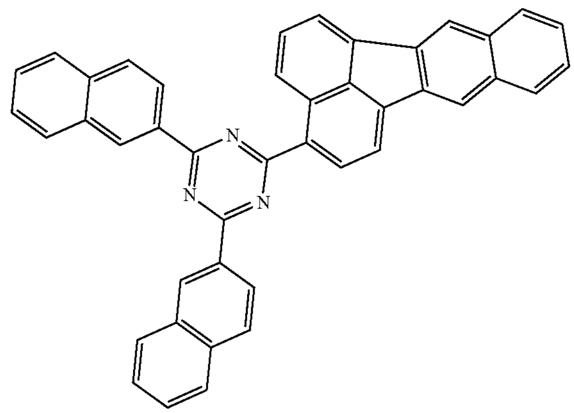
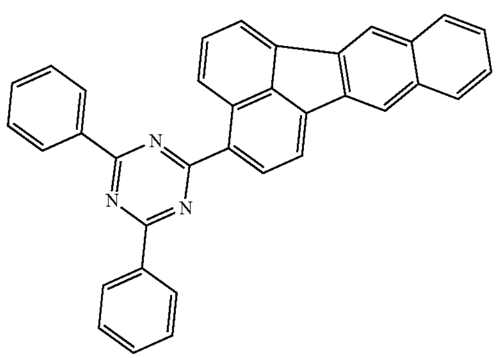
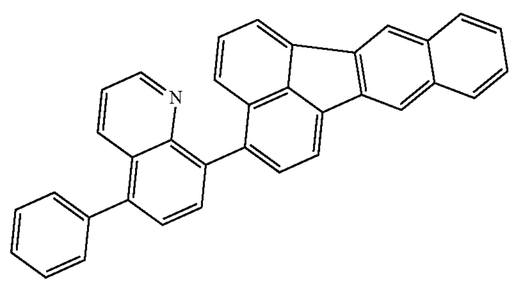

-continued
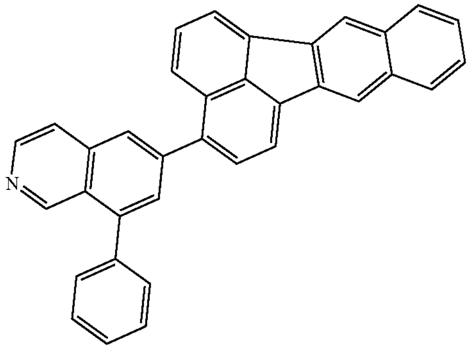
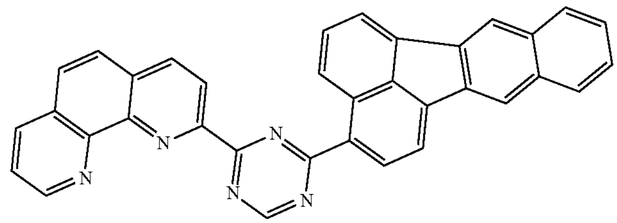
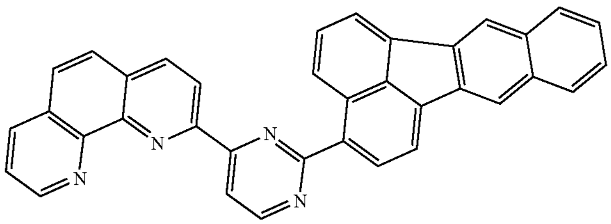
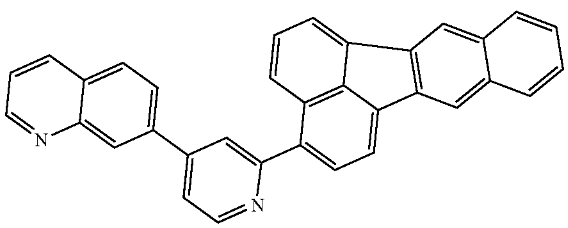
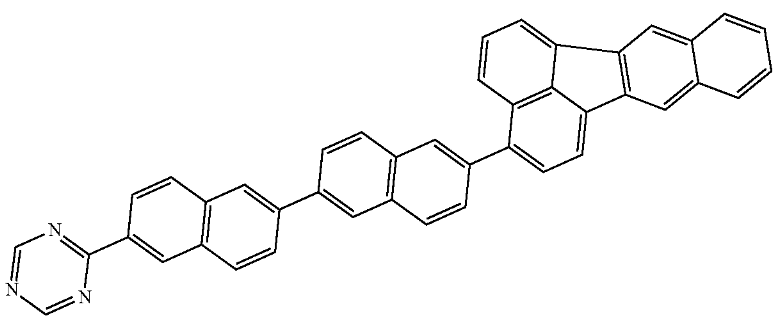
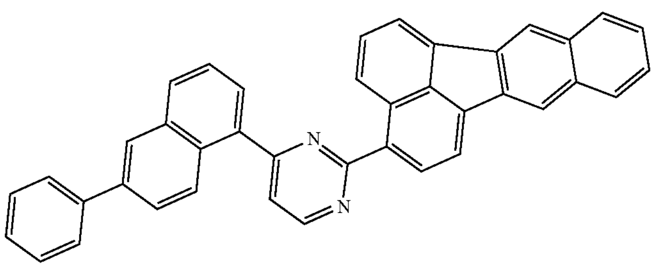
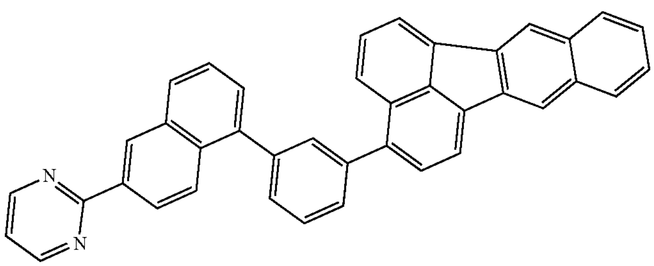

-continued
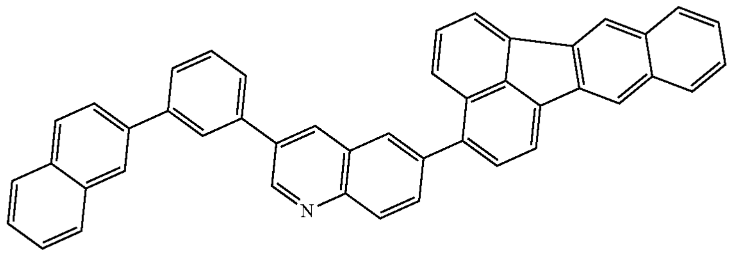
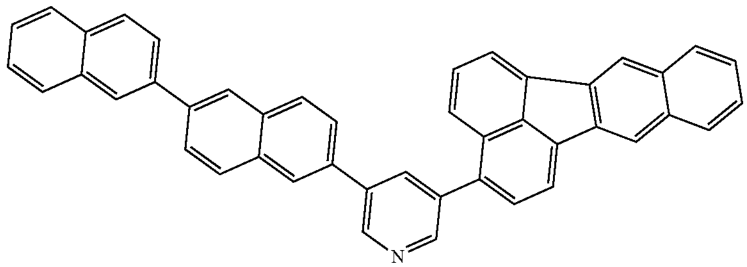
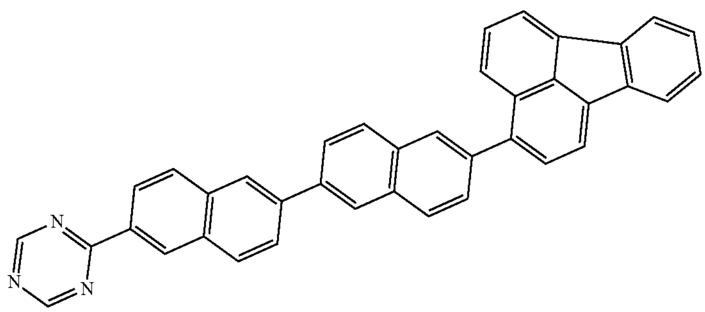
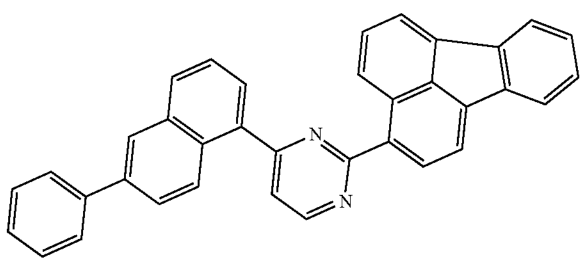
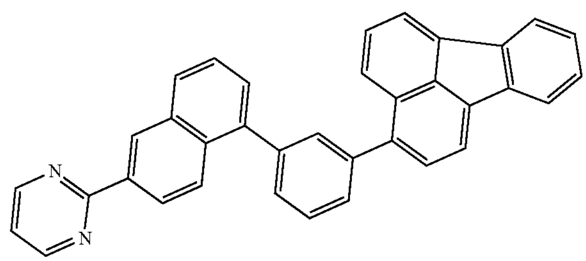
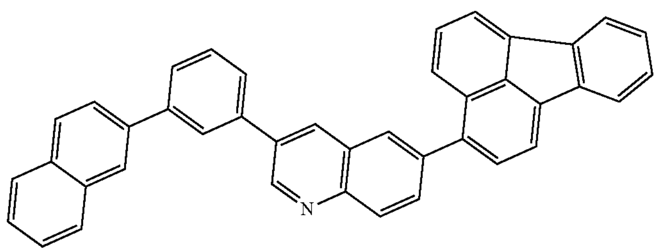
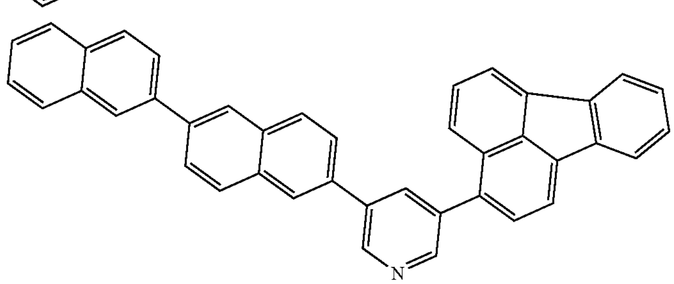

-continued
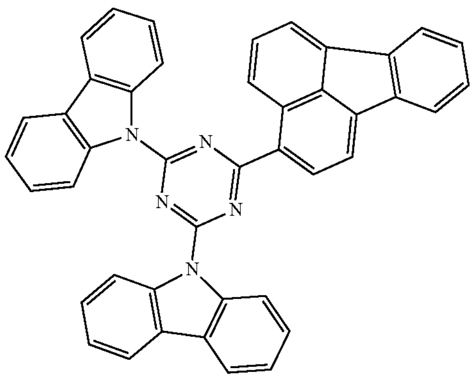
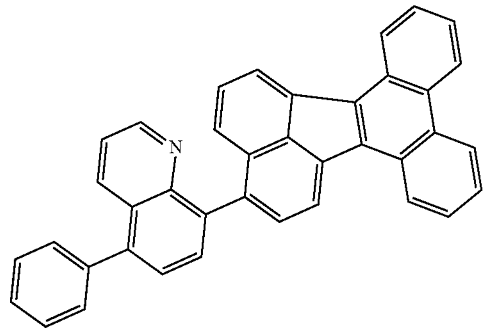
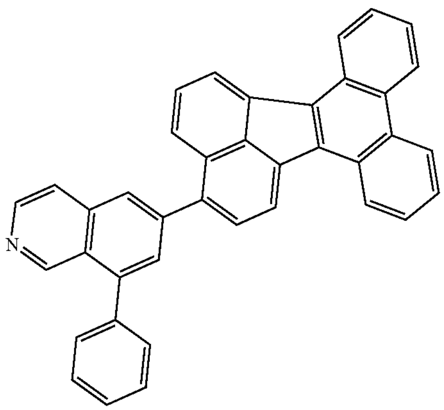
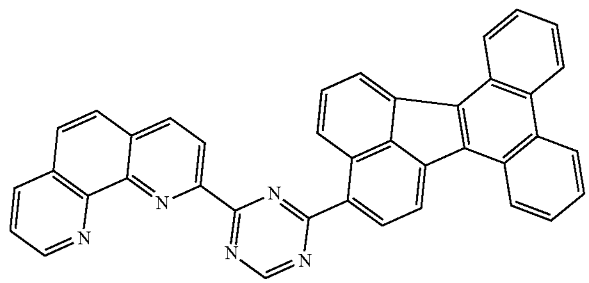
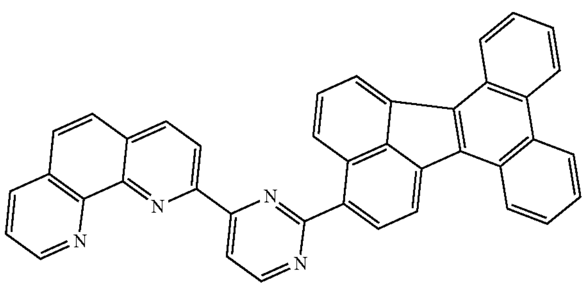
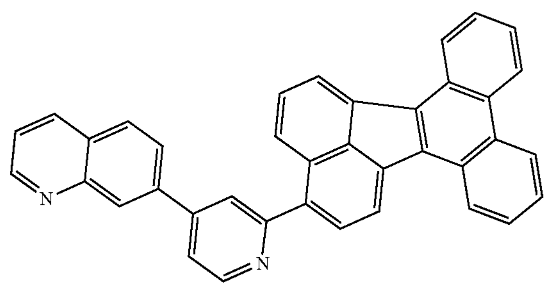
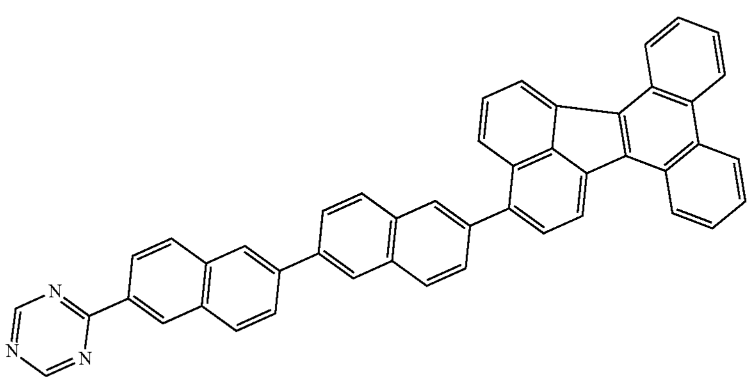

-continued
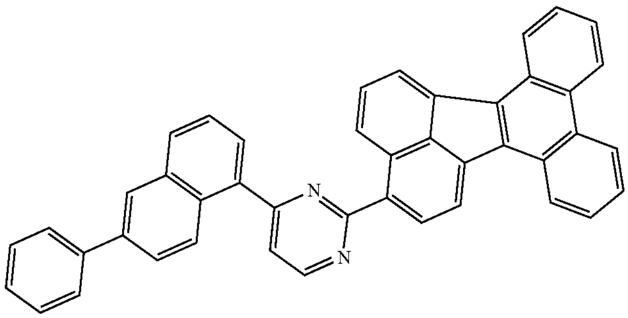
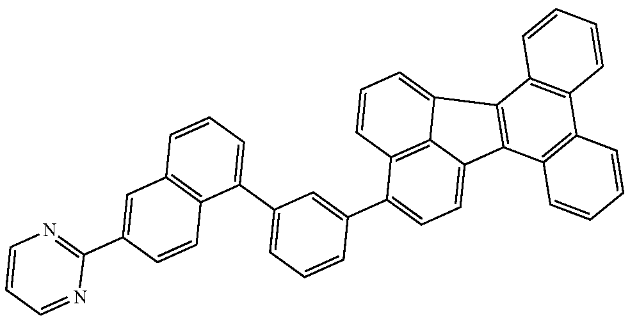
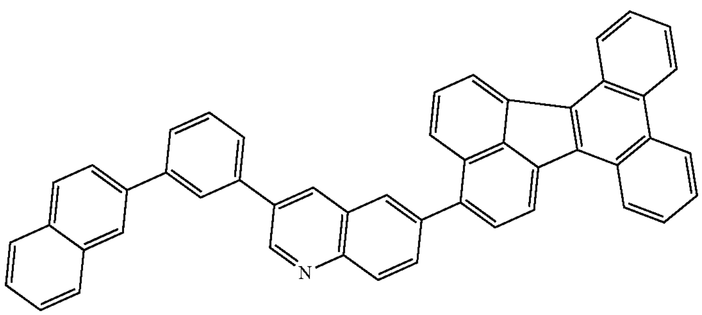
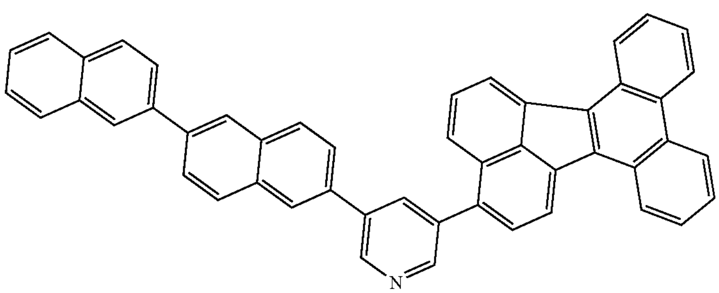
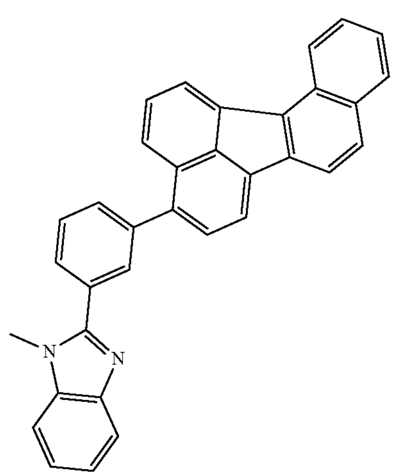
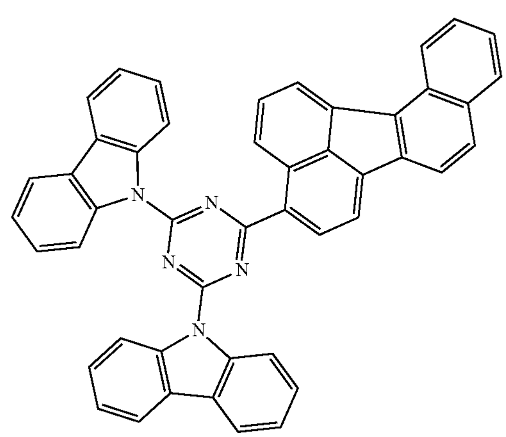

-continued
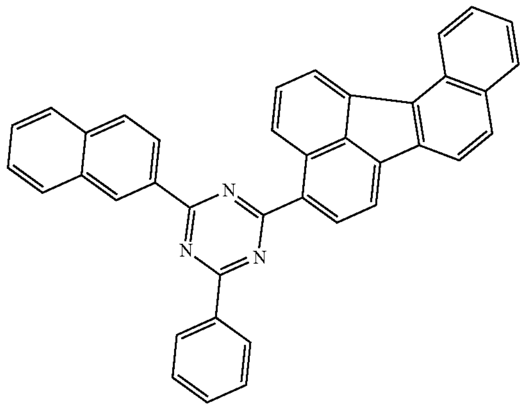
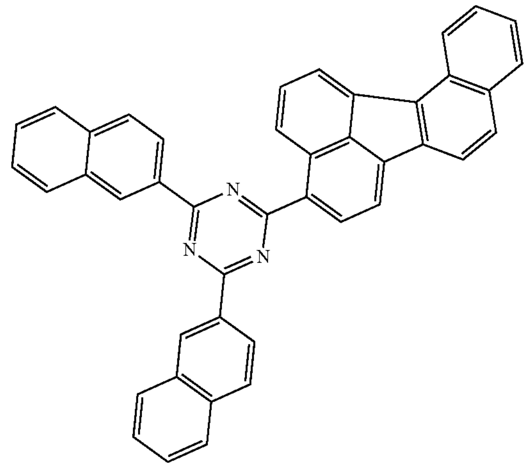
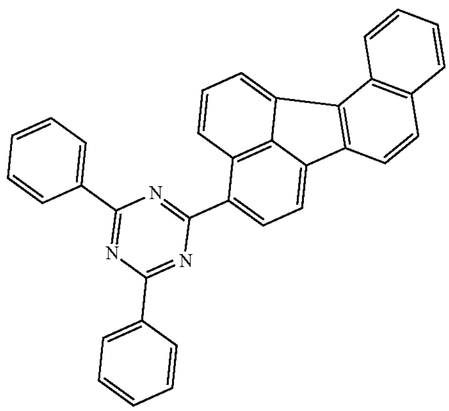
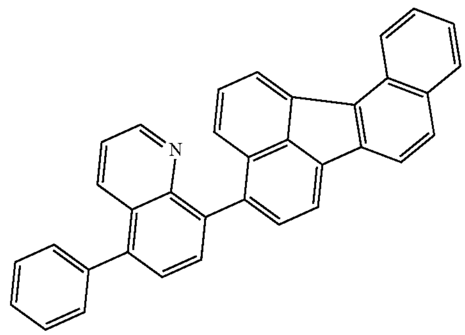
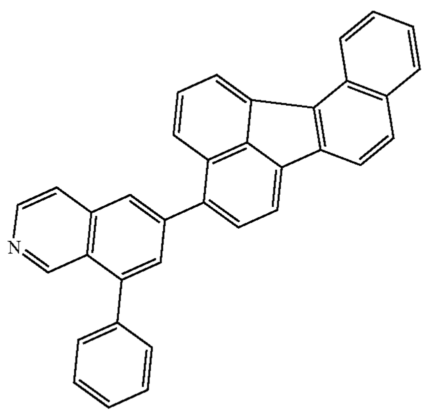
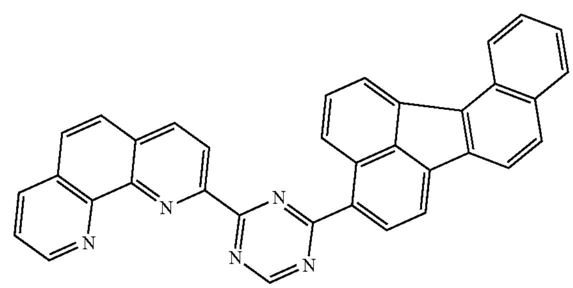
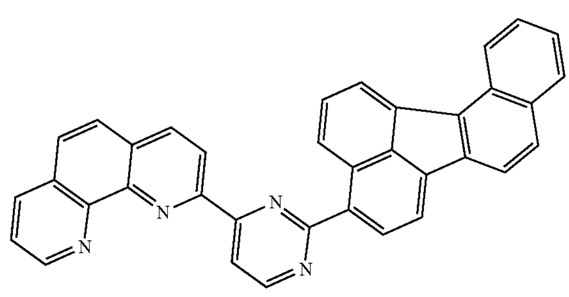
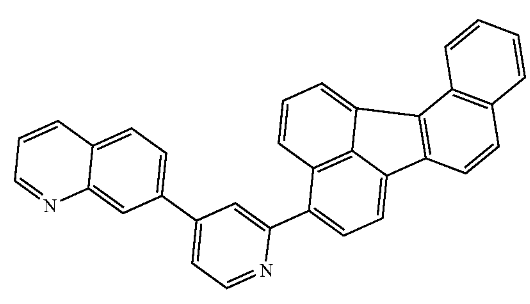

-continued
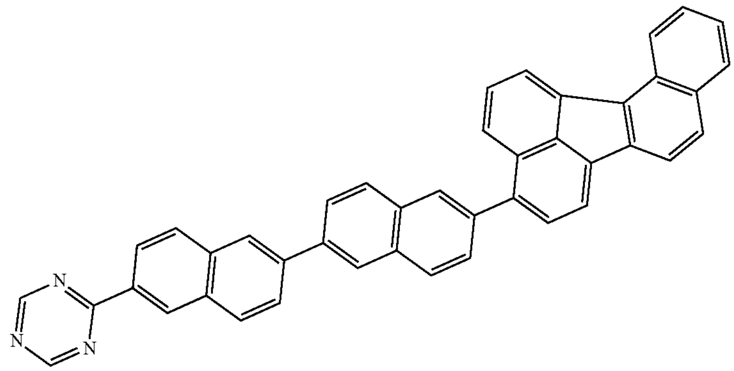
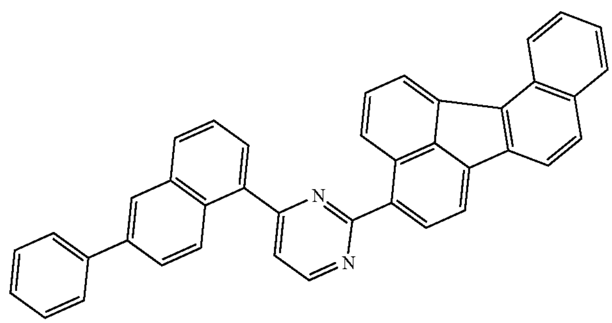
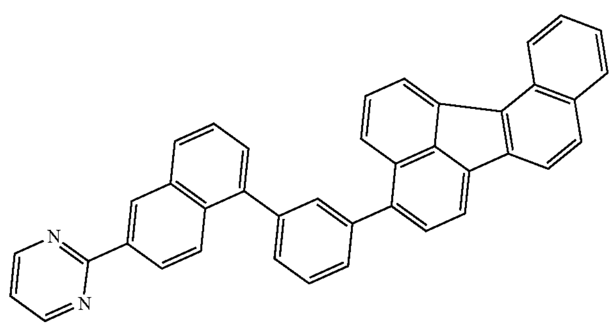
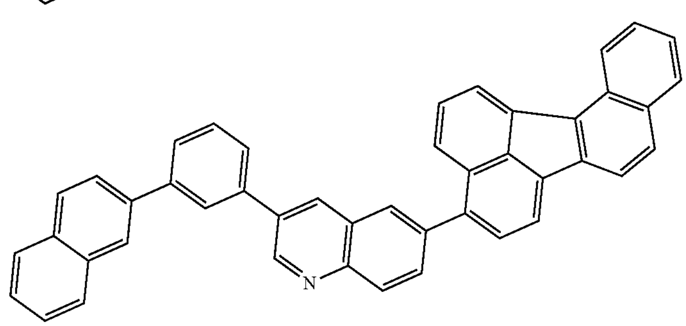
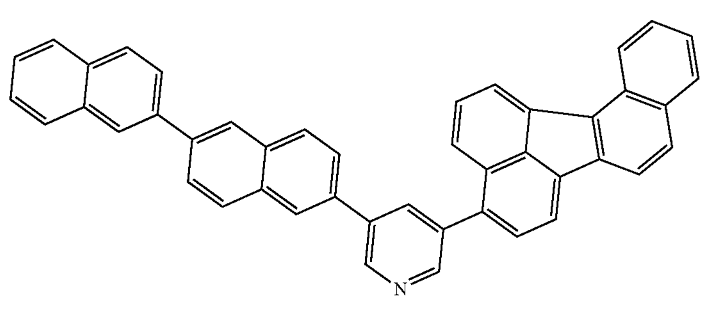

-continued
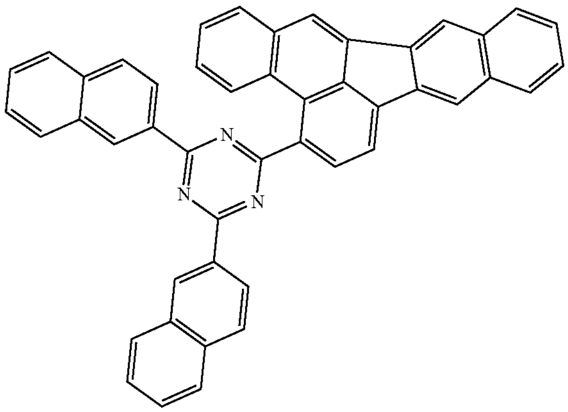
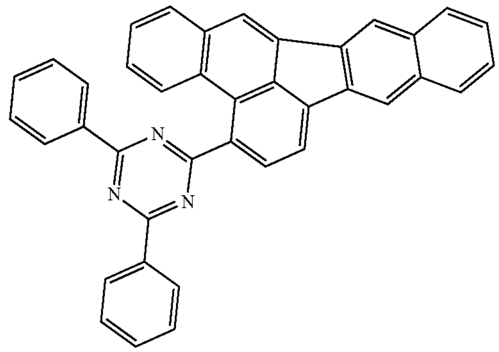
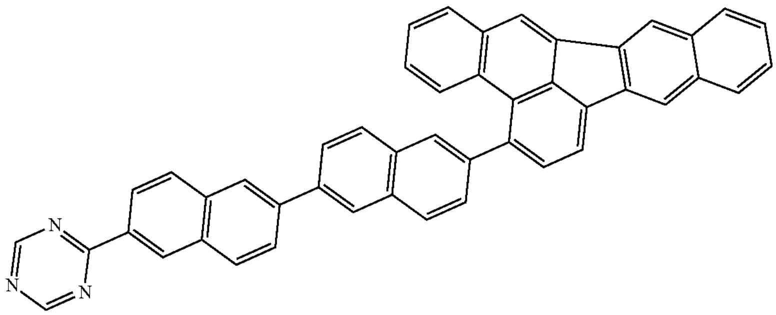
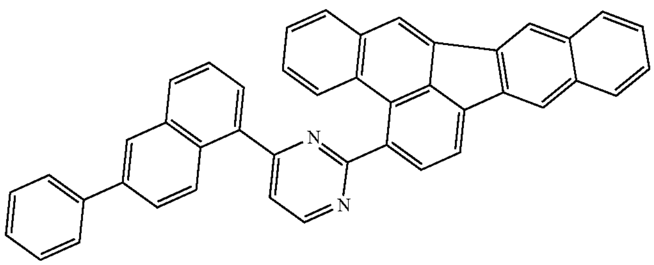
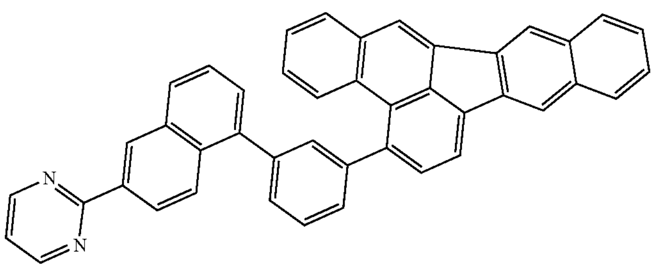
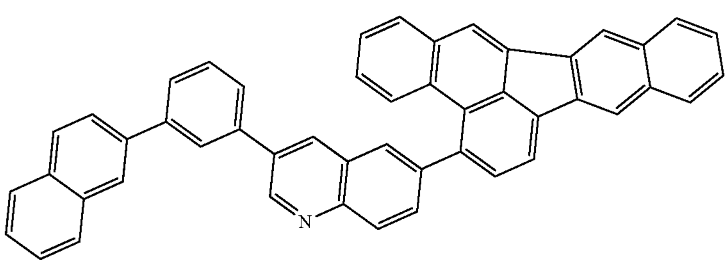

-continued
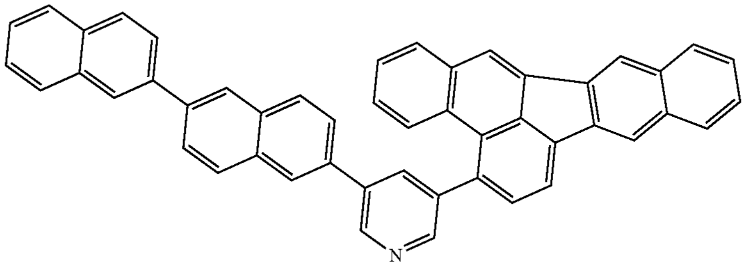
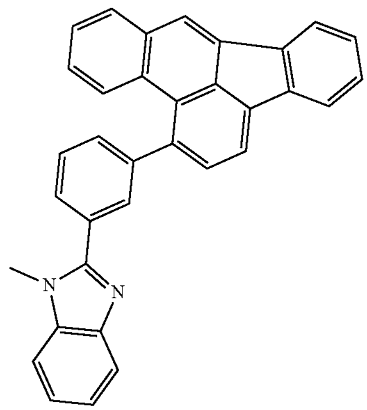
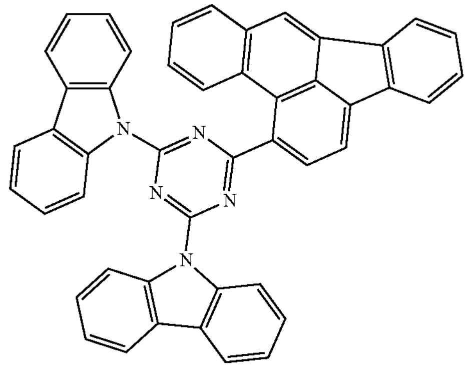
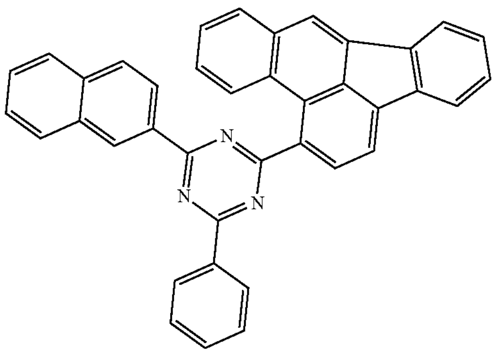
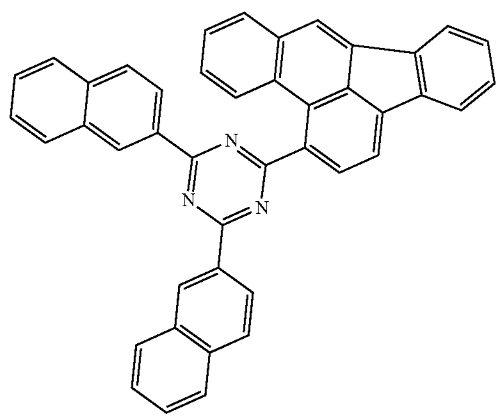
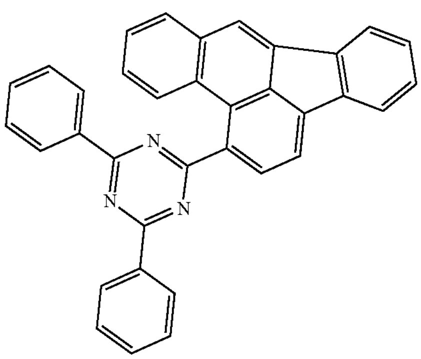
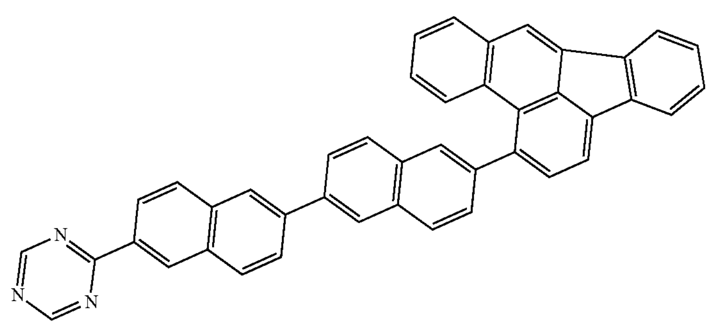
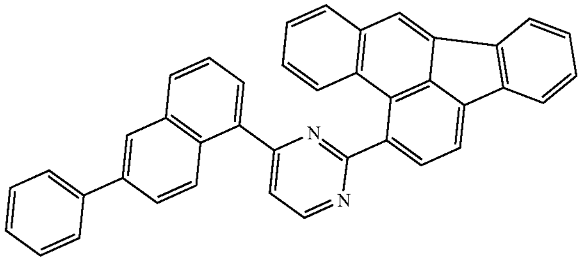
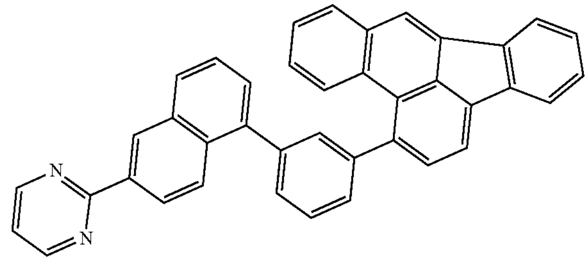

-continued
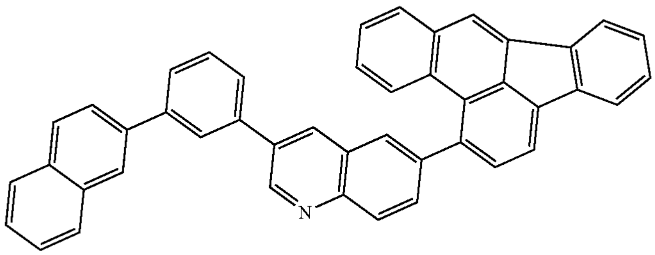
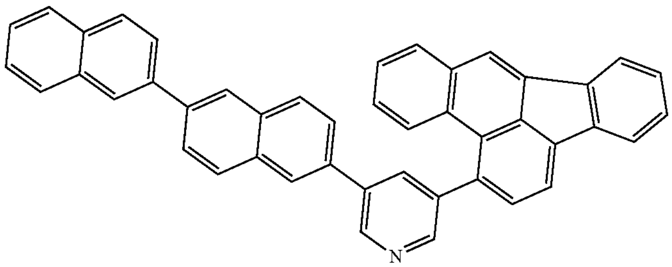
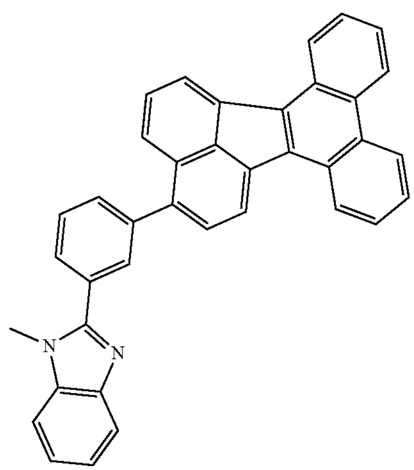
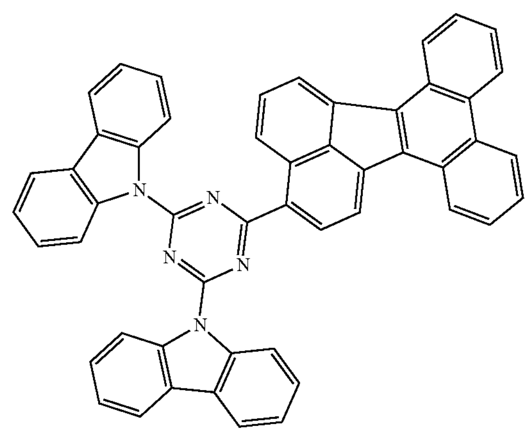
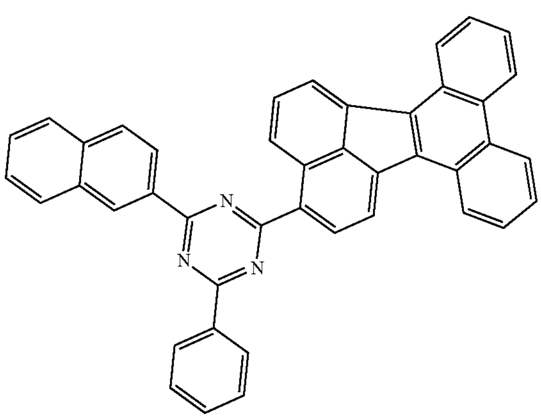
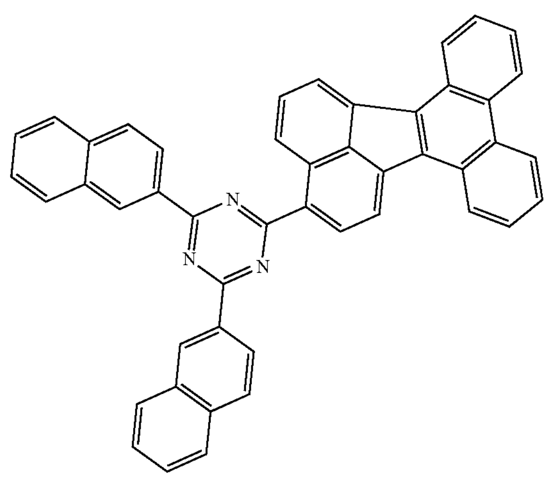

-continued
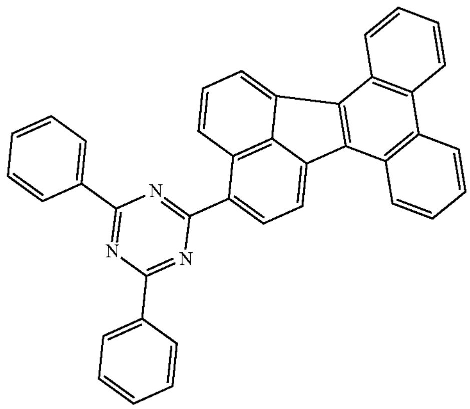
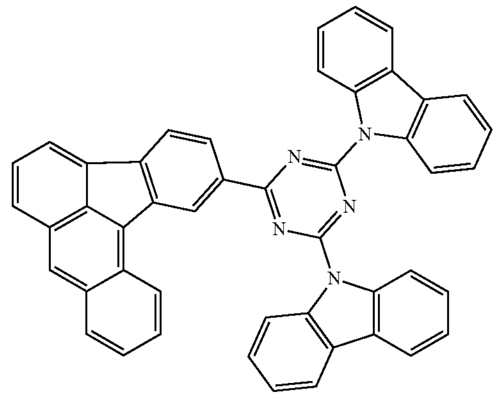
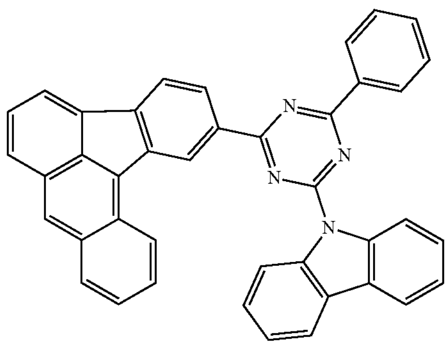
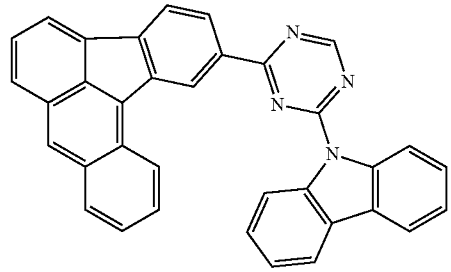
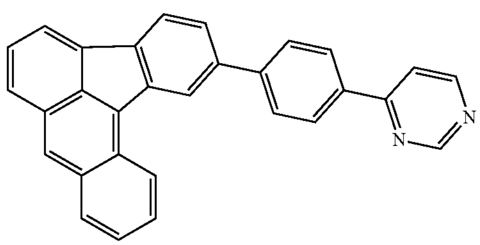
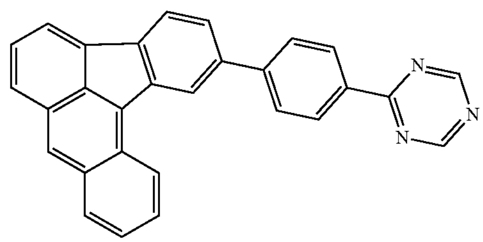
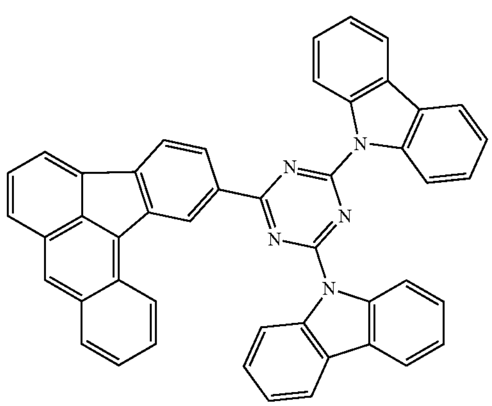
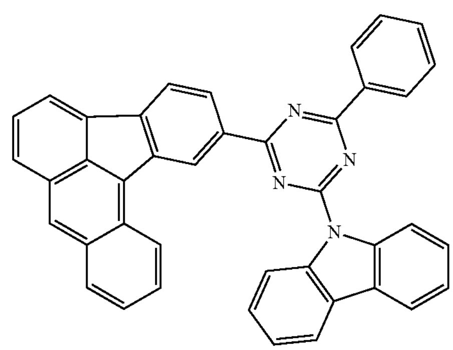
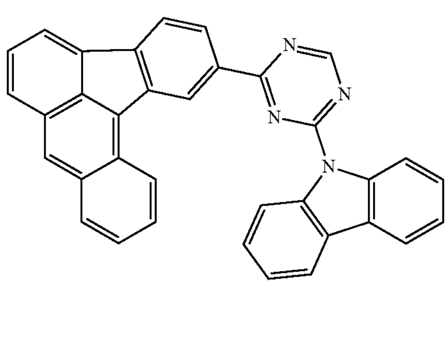
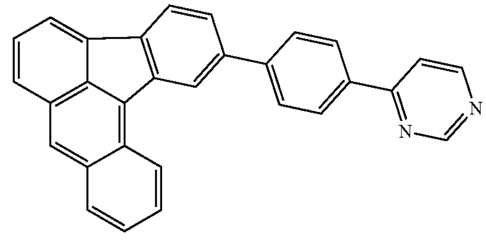

-continued
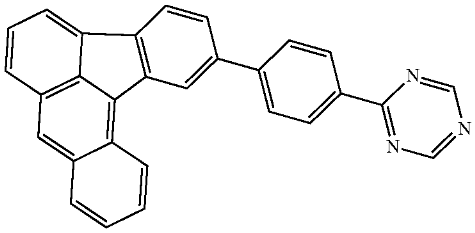
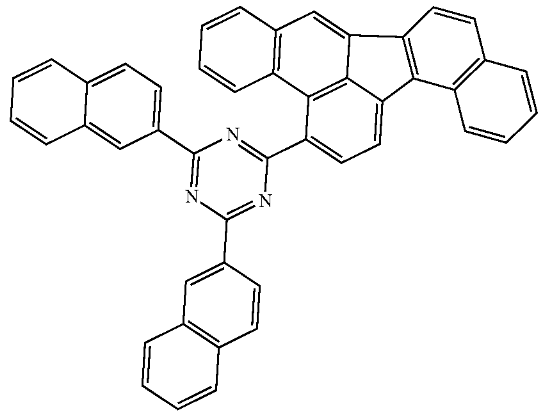
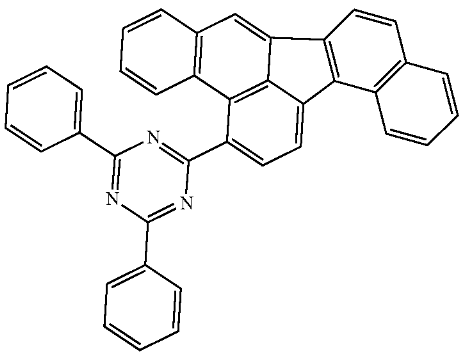
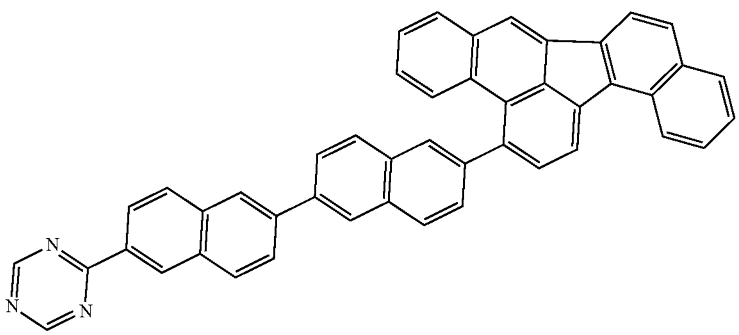
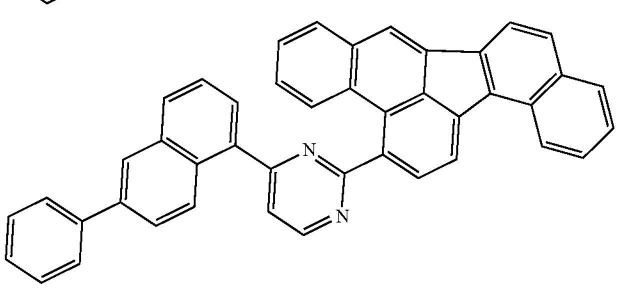
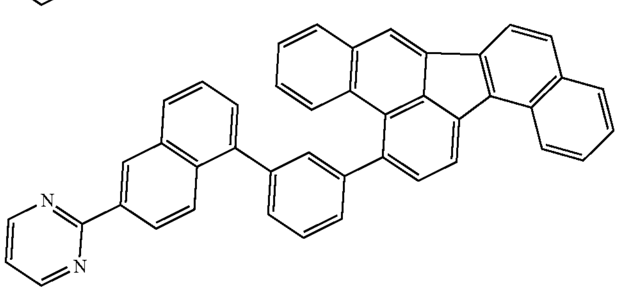

-continued
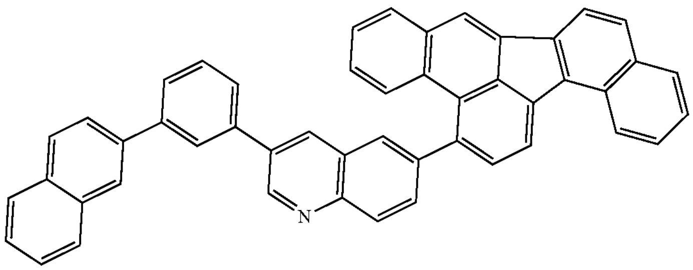
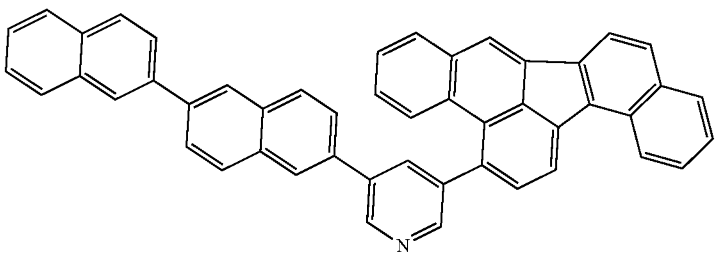
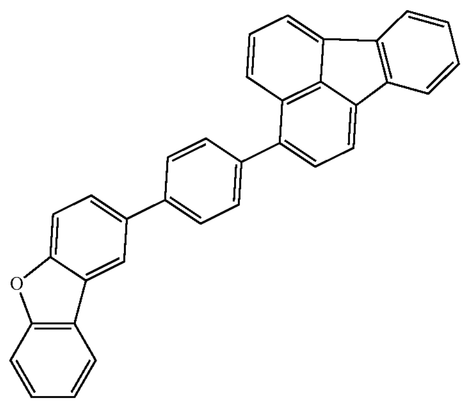
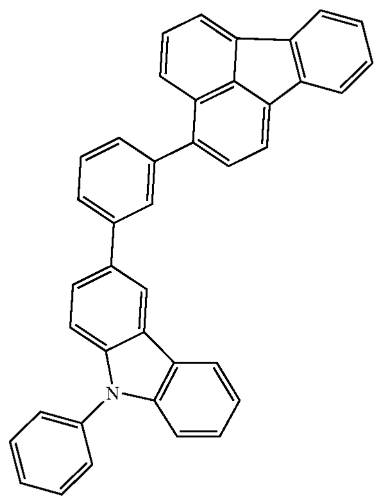
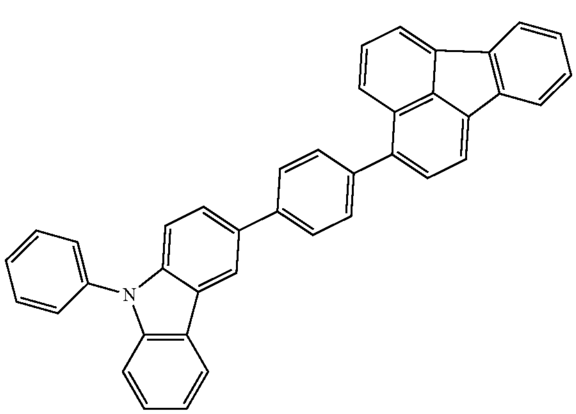
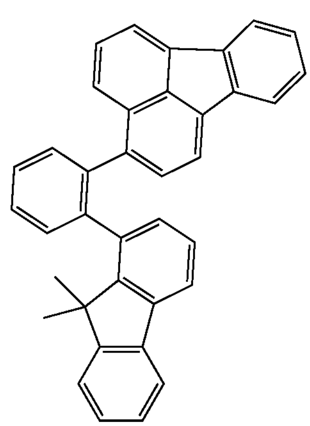

-continued
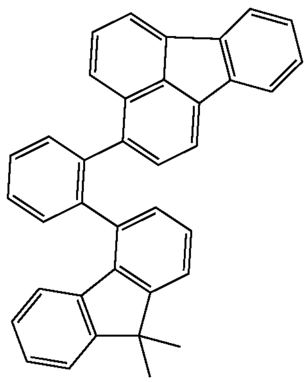
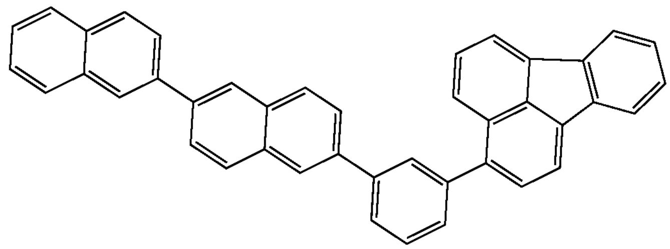
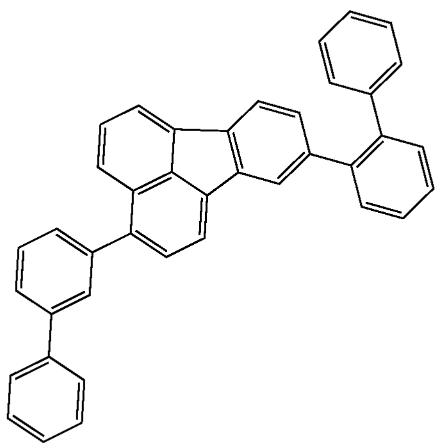
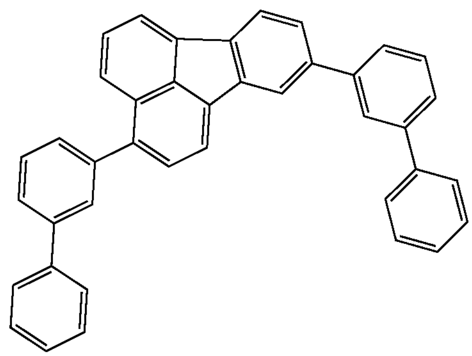
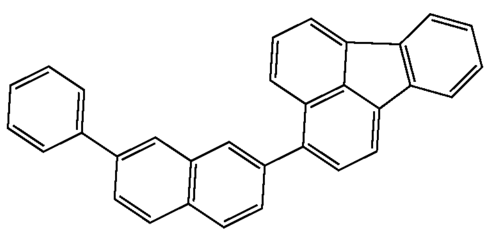
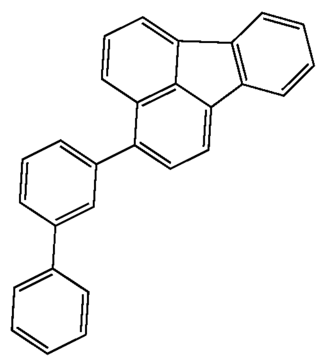
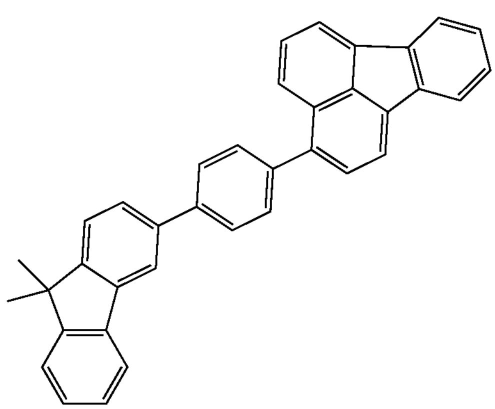
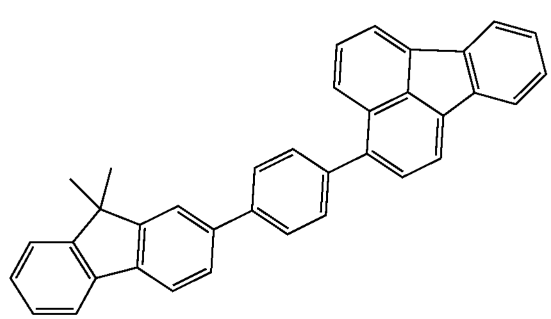

-continued
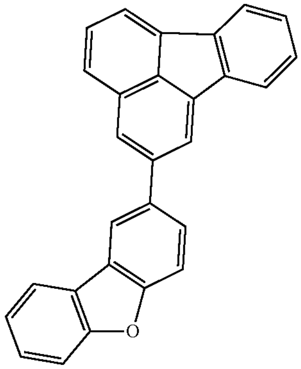
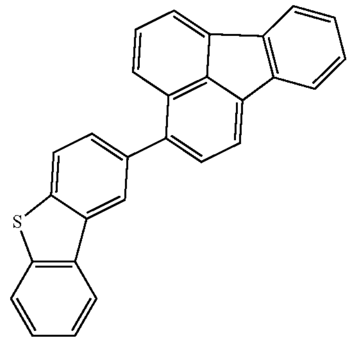
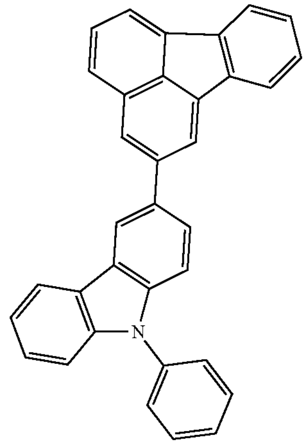
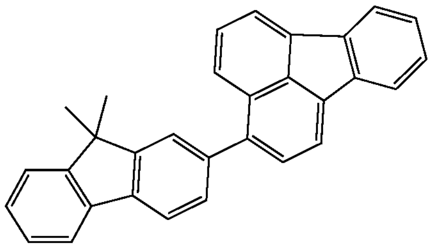
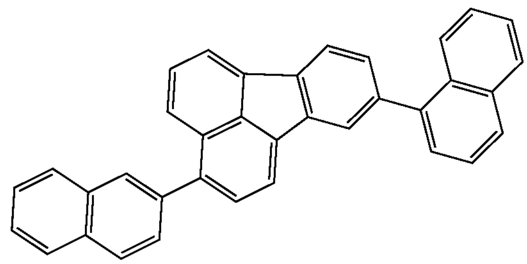
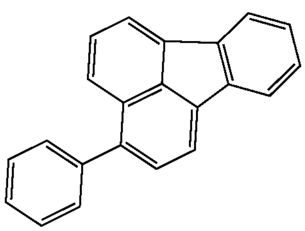
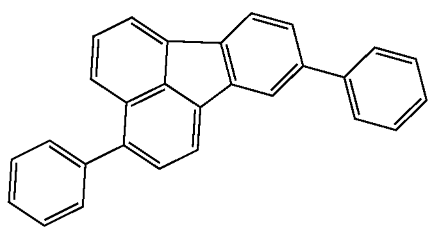
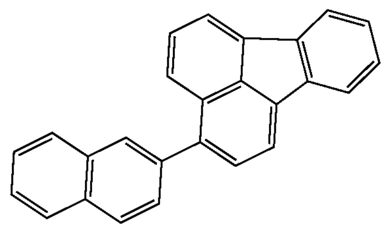
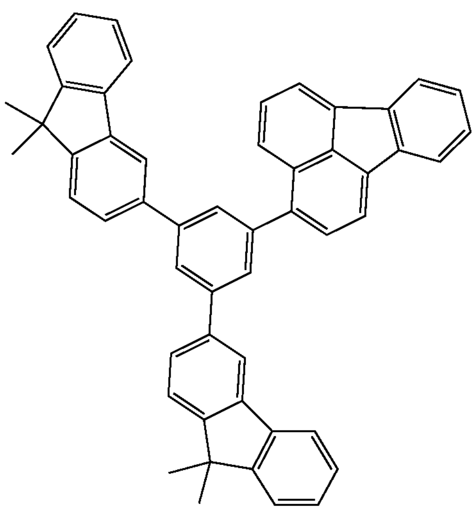
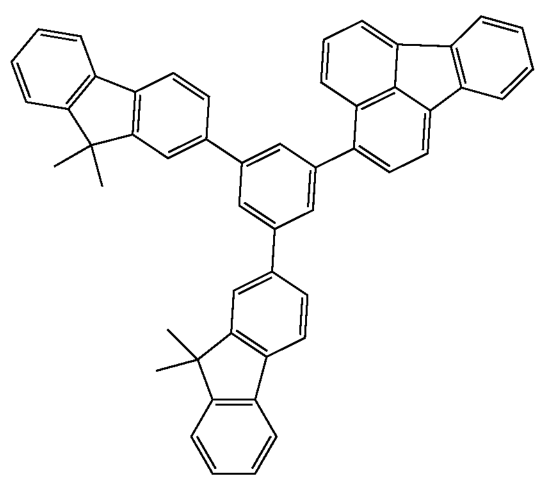

-continued
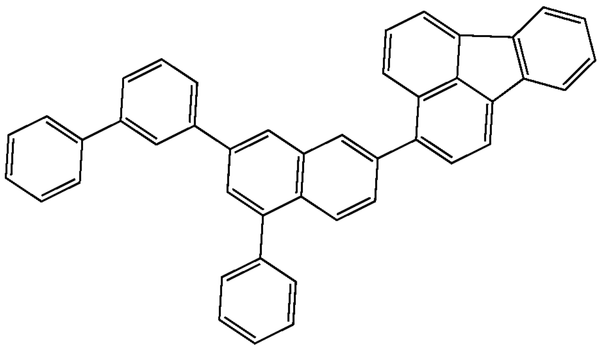
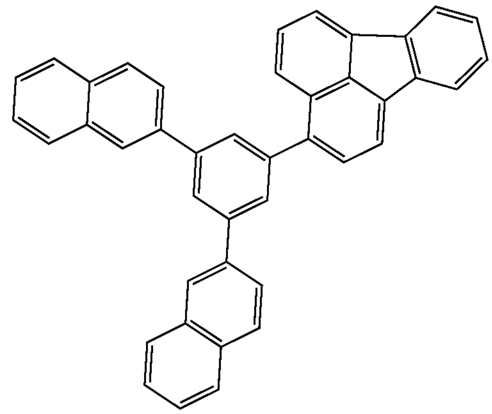
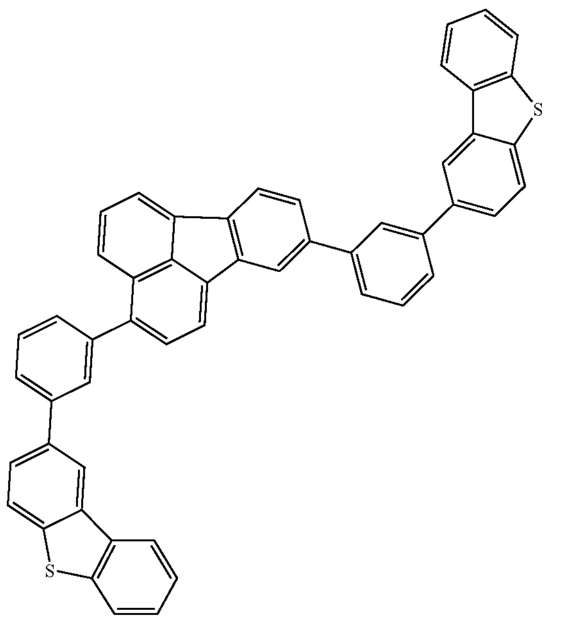
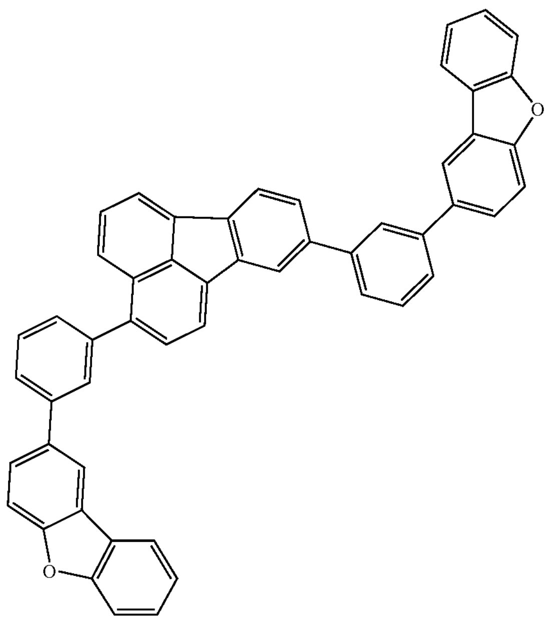
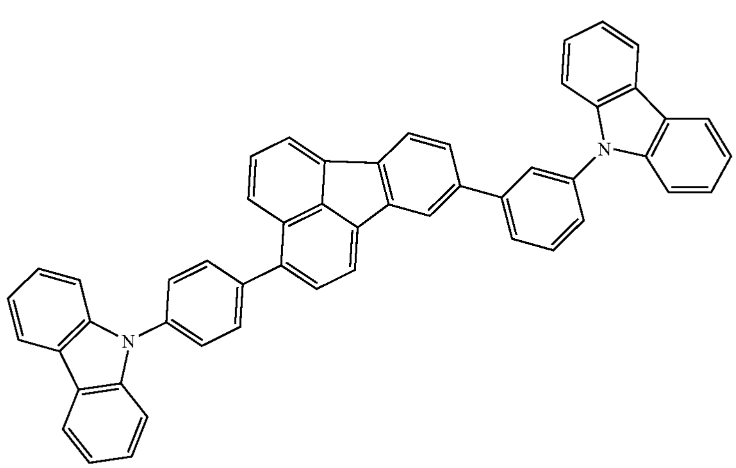

-continued
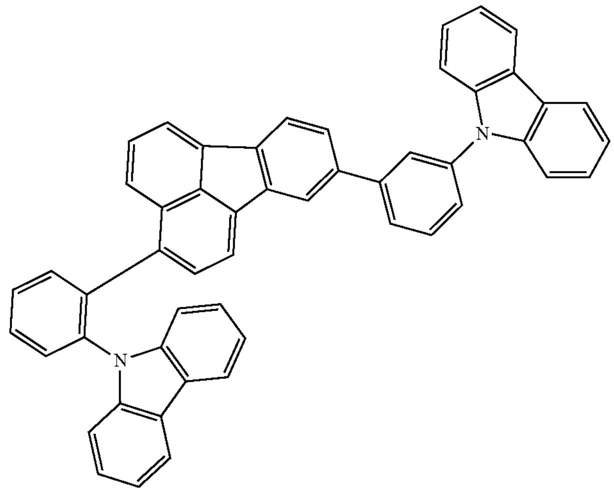
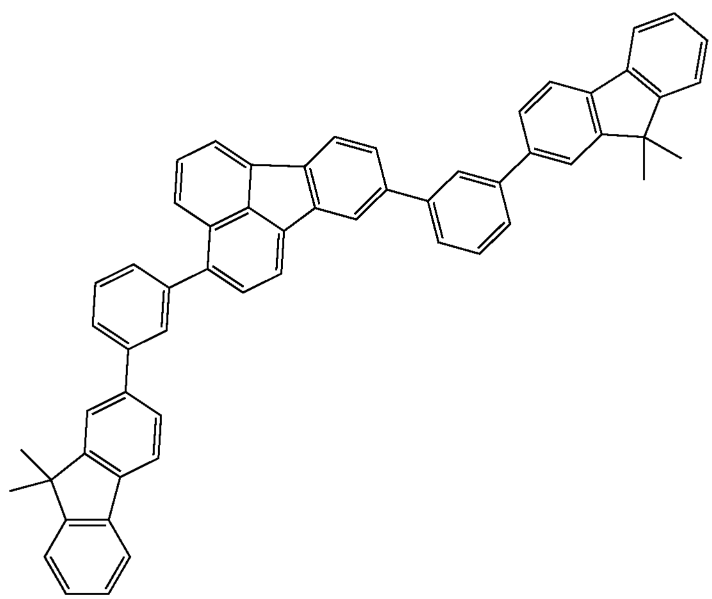
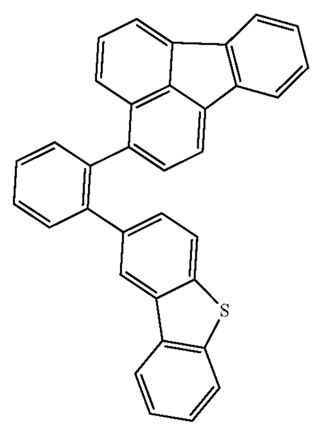
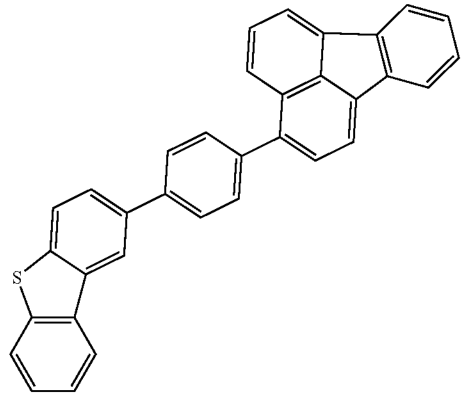
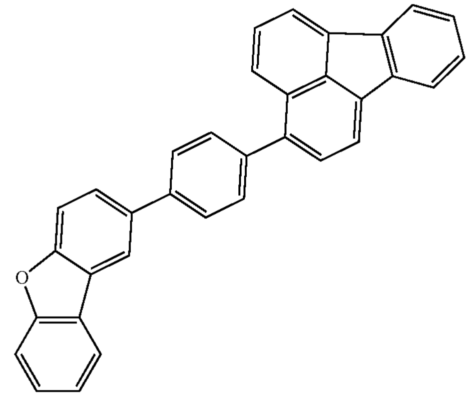

-continued
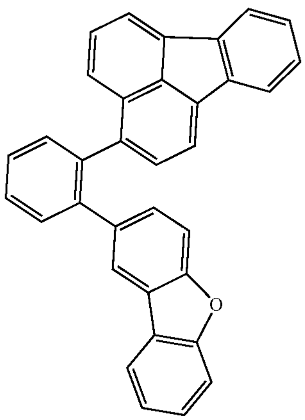
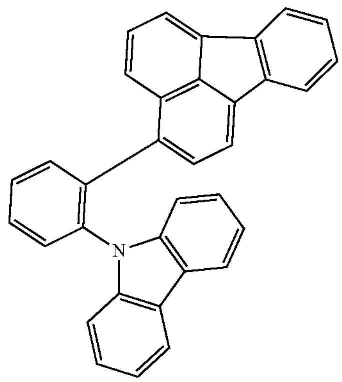
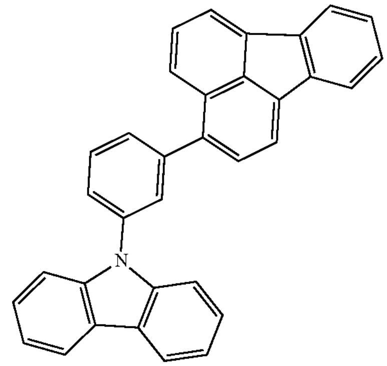
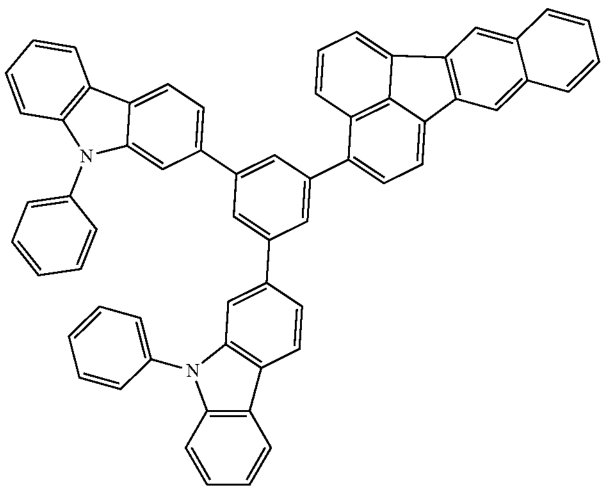
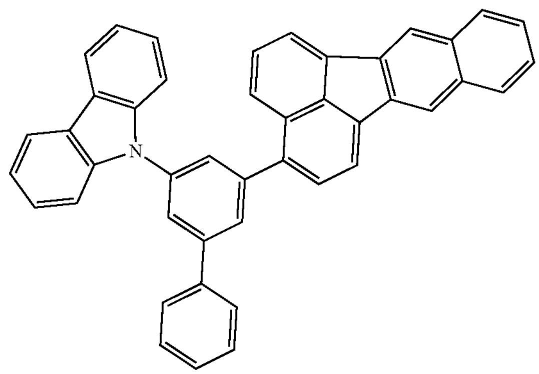
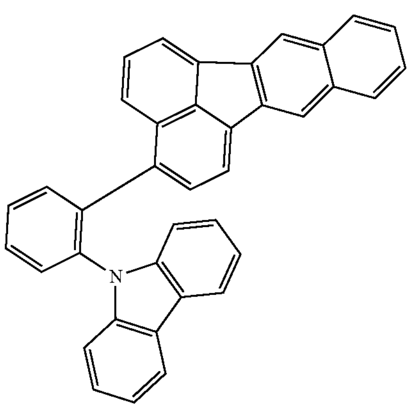
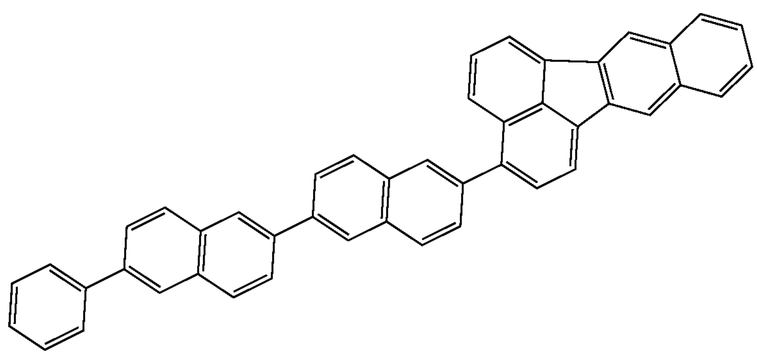
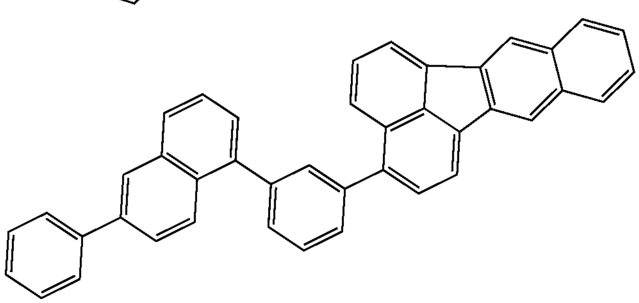

-continued
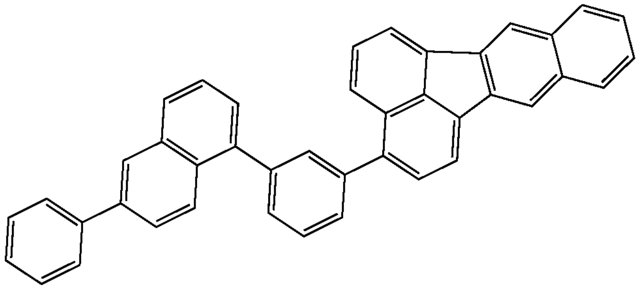
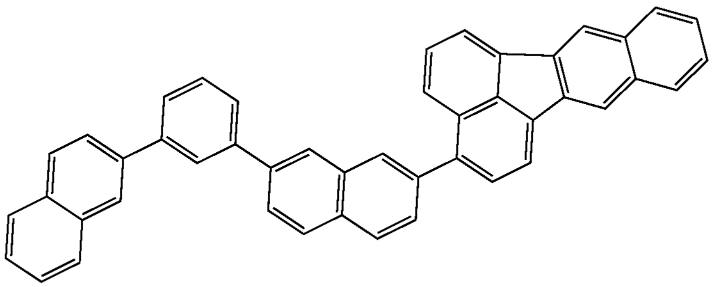
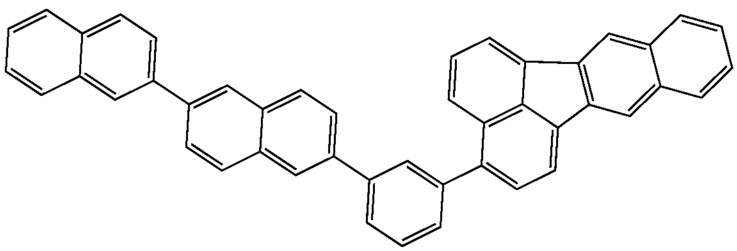
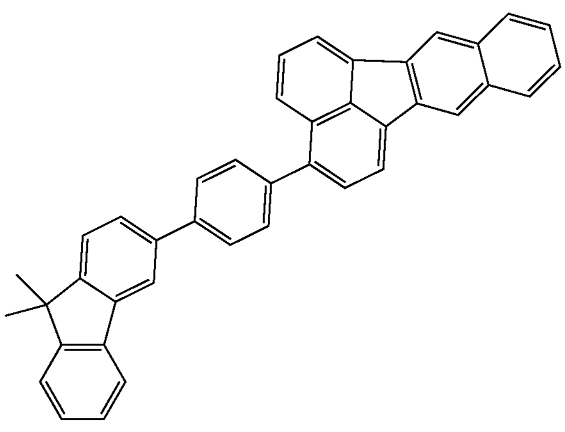
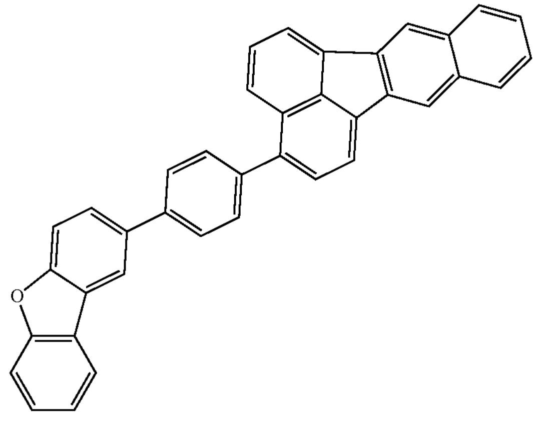
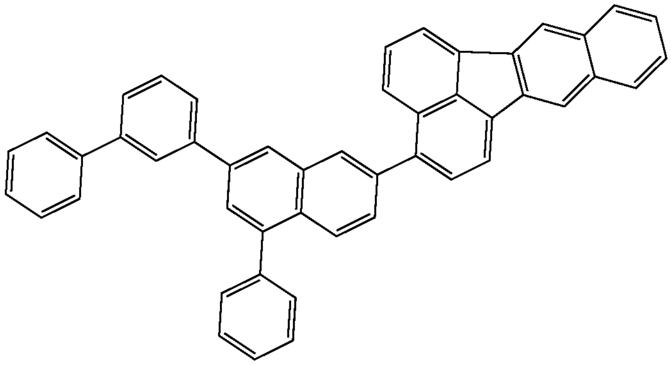
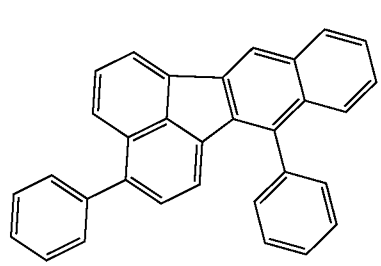

-continued
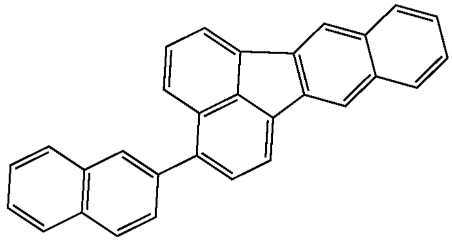
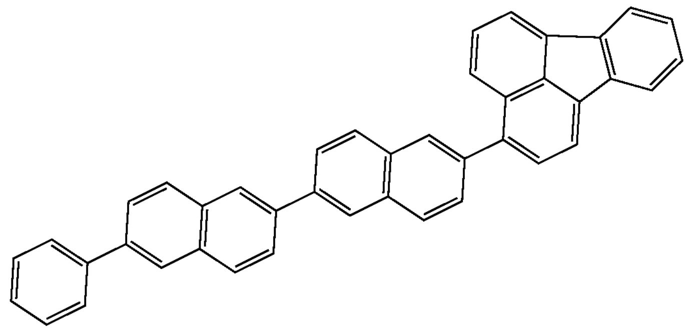
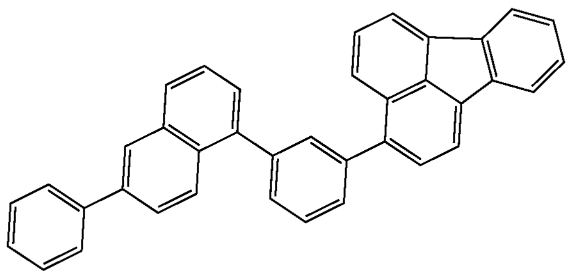
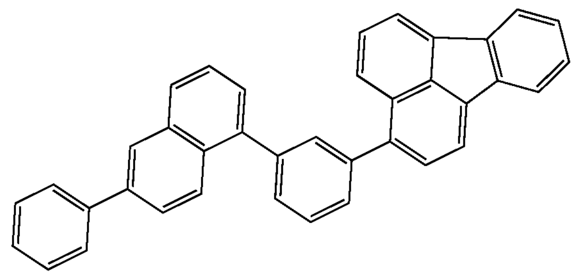
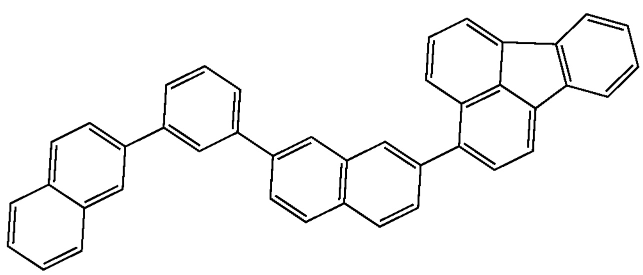
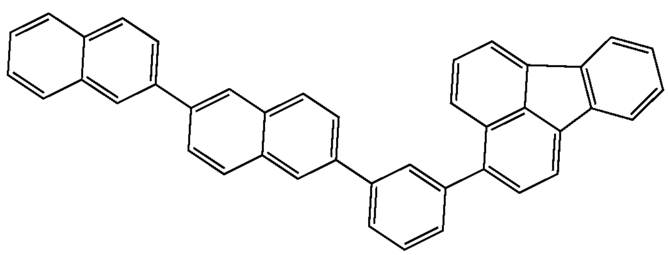
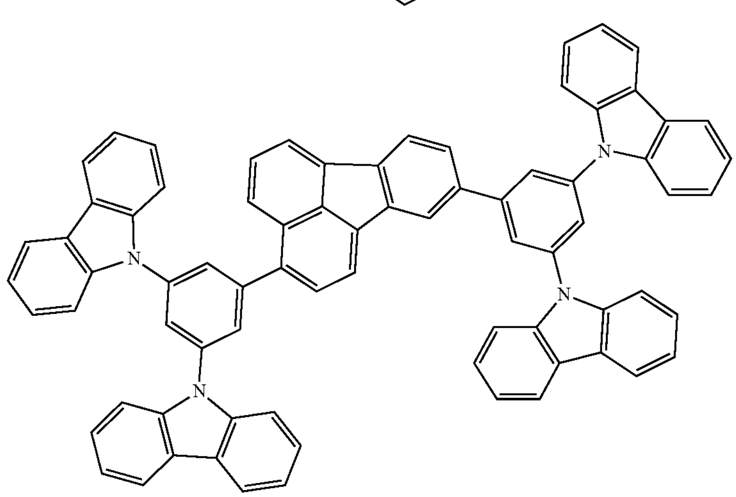

-continued
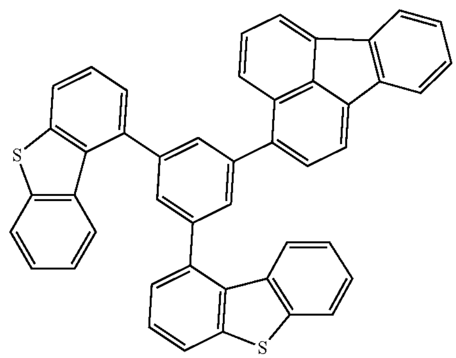
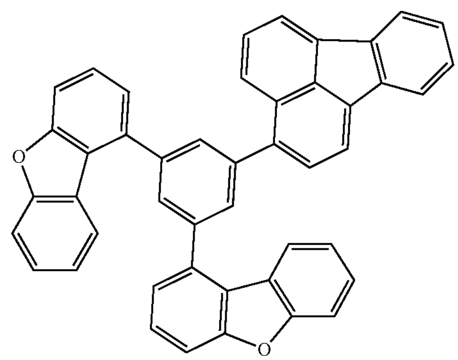
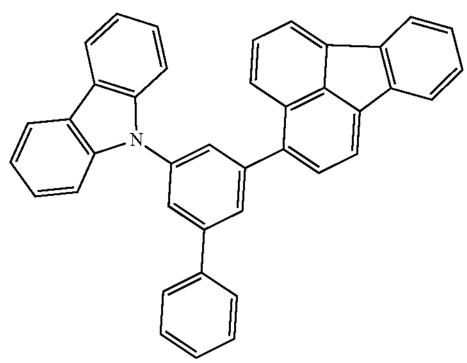
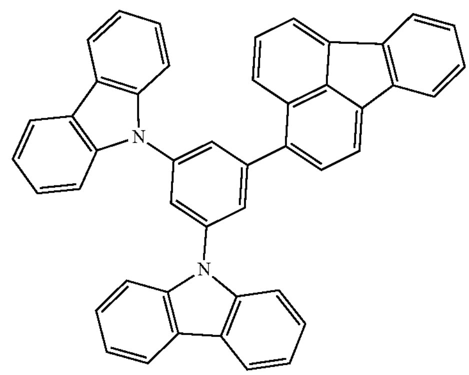
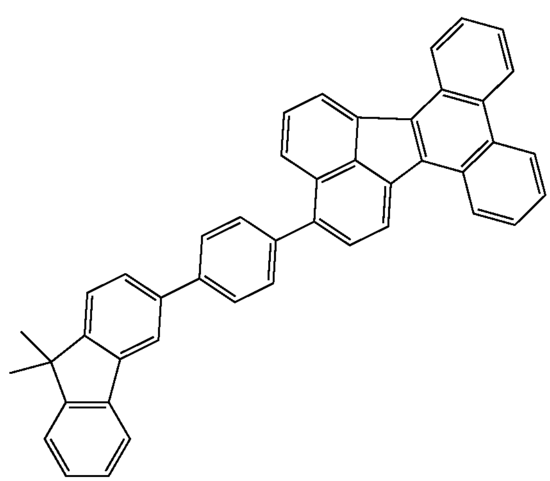
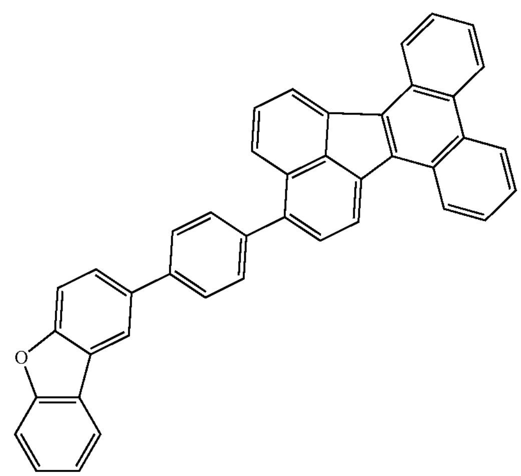
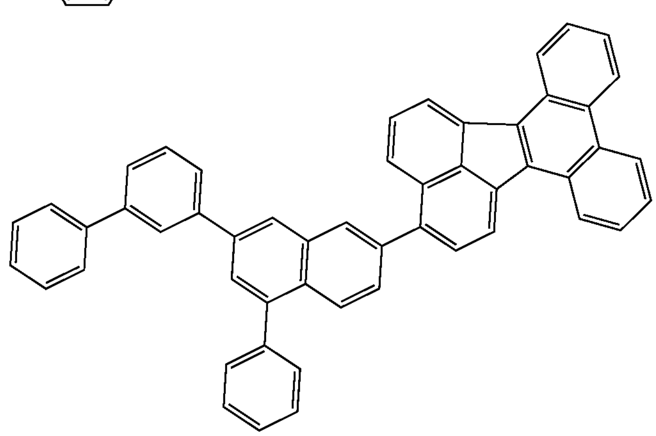
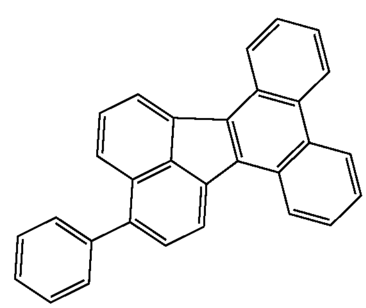

-continued
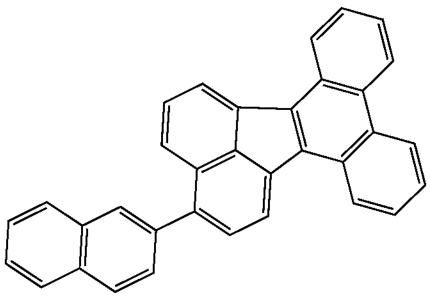
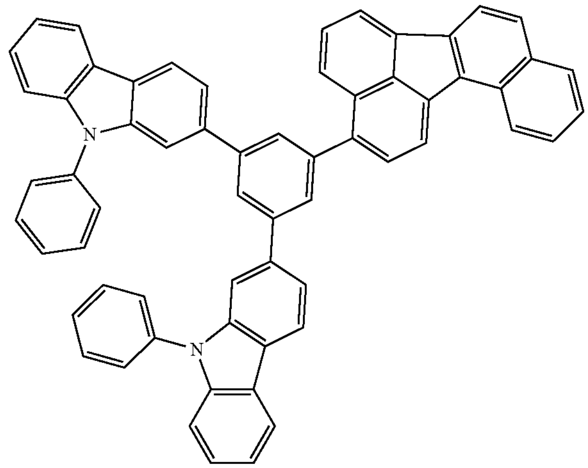
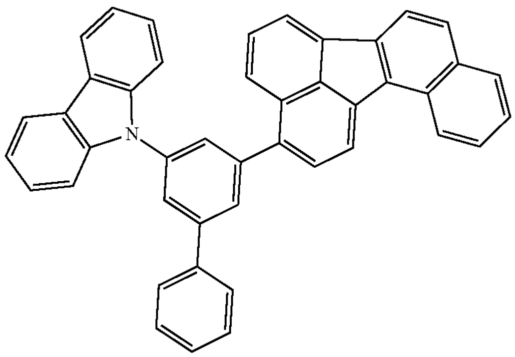
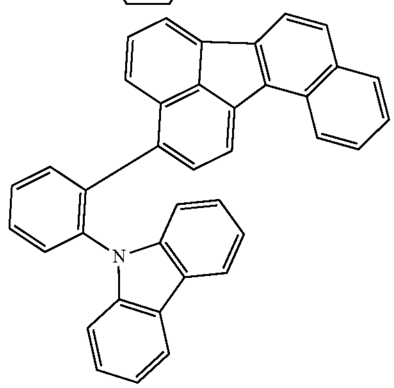
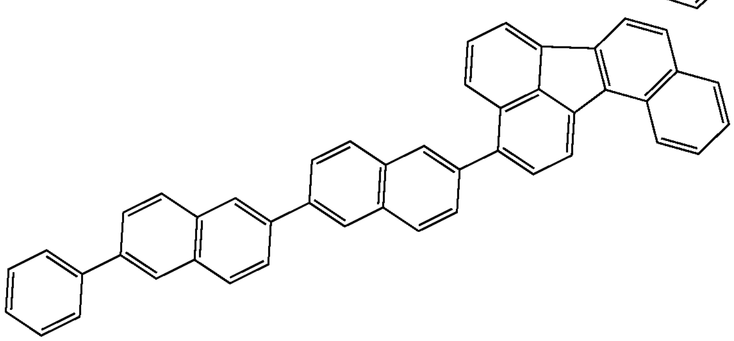
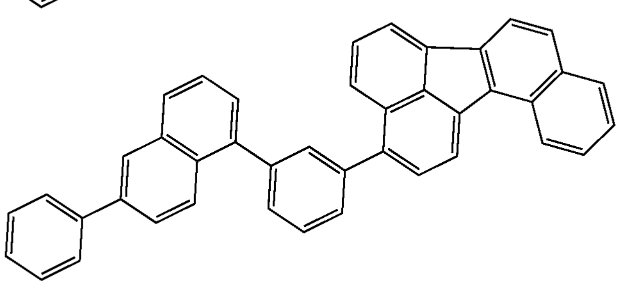
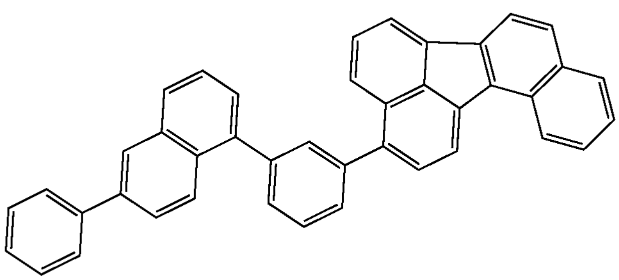

-continued
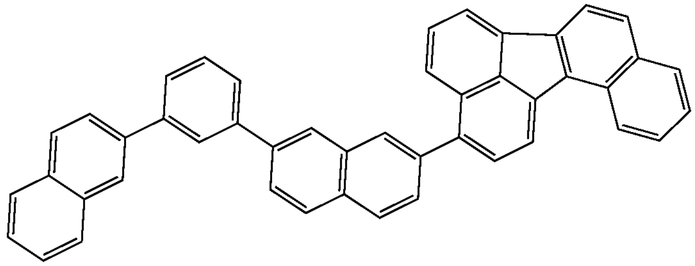
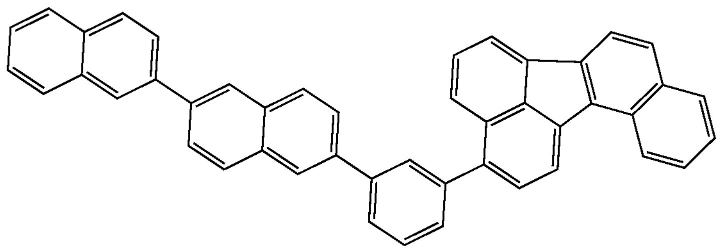
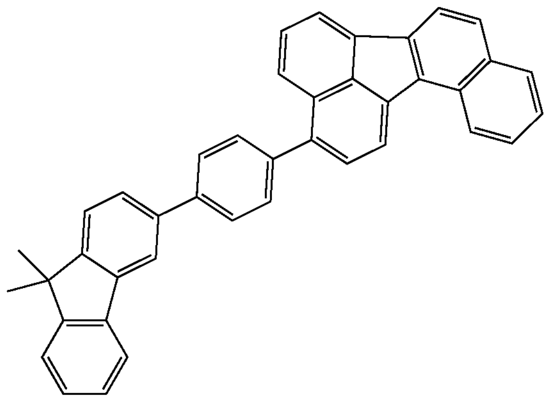
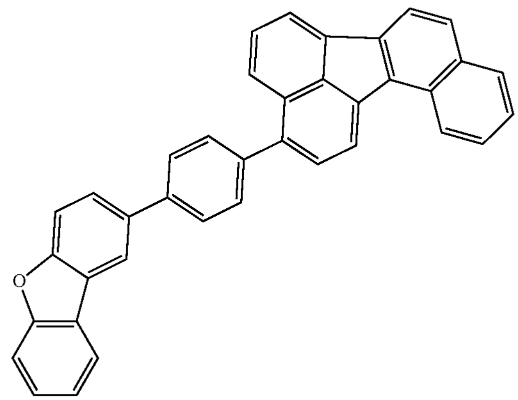
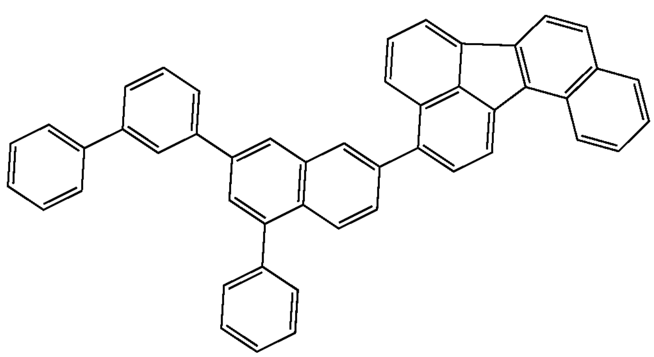
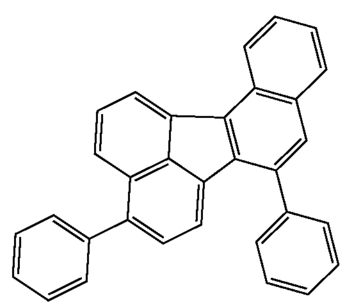
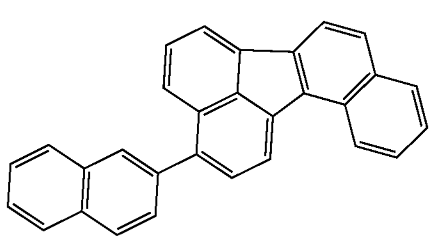
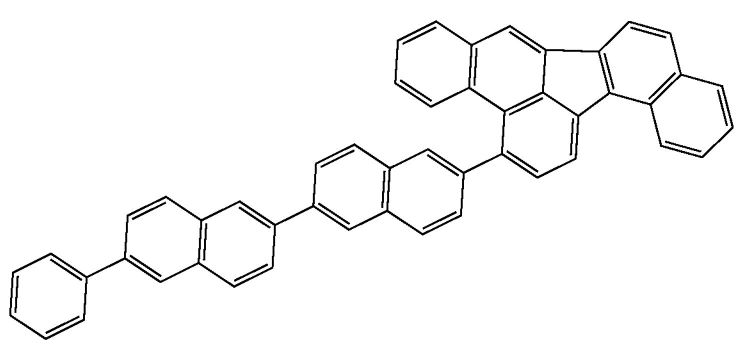

-continued
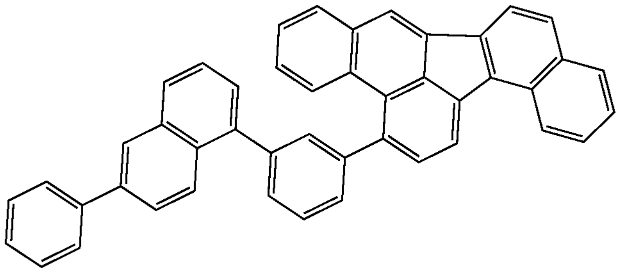
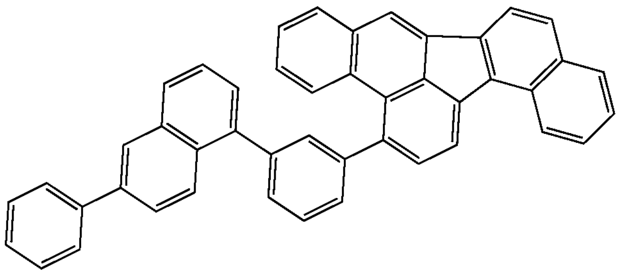
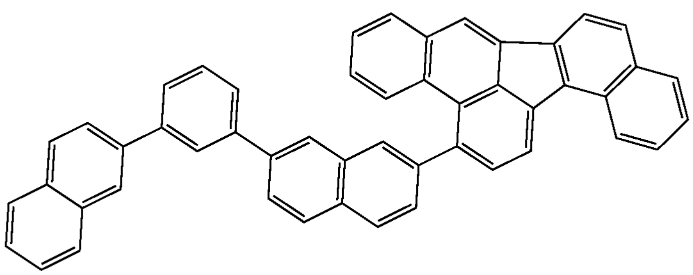
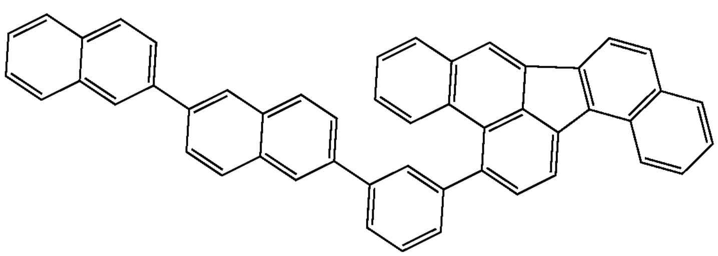
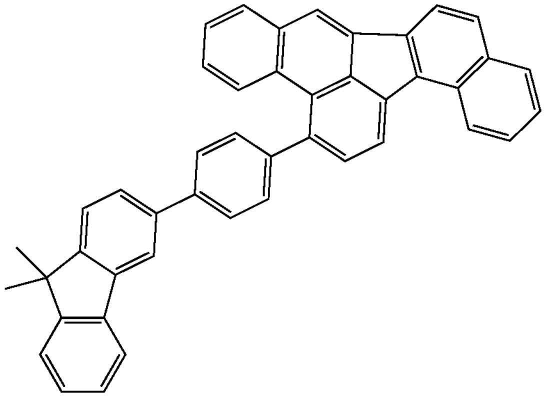
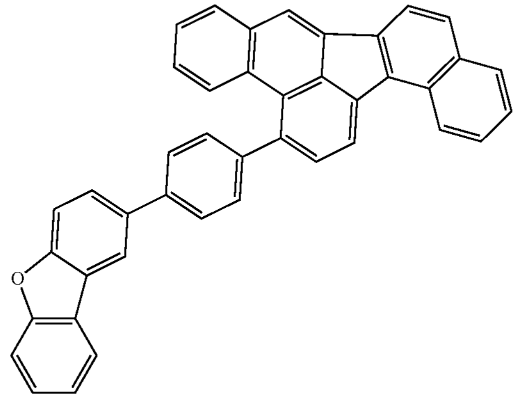

-continued
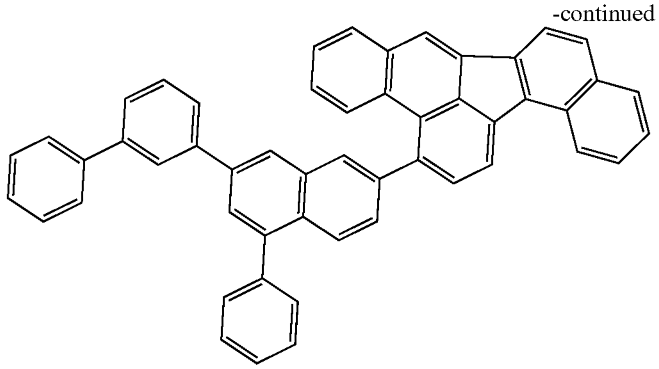
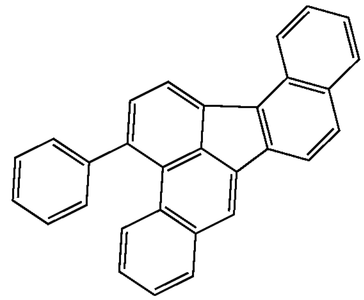
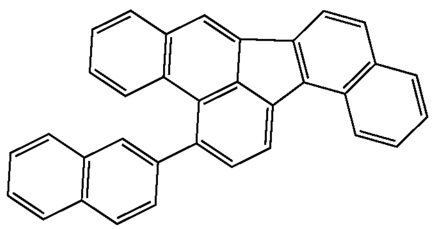
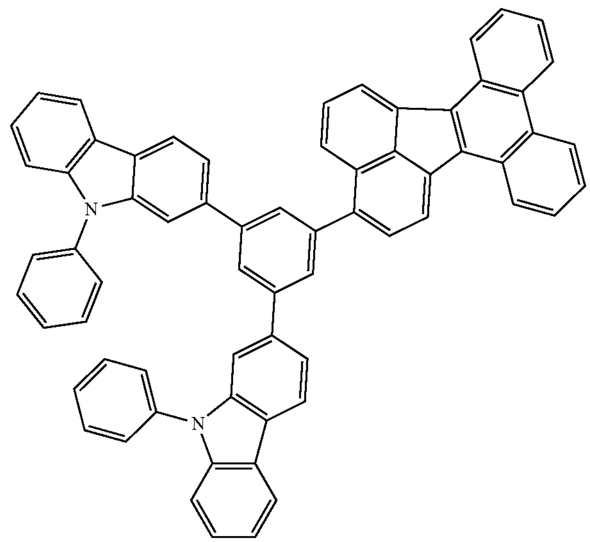
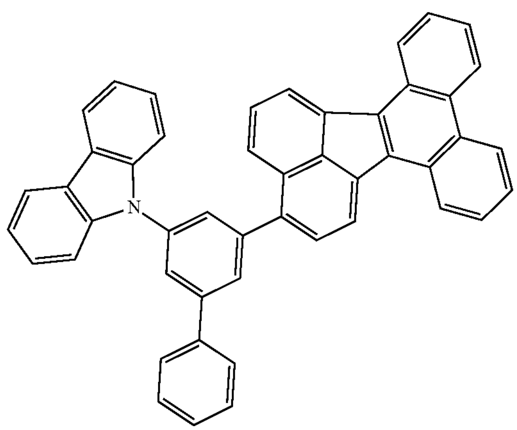
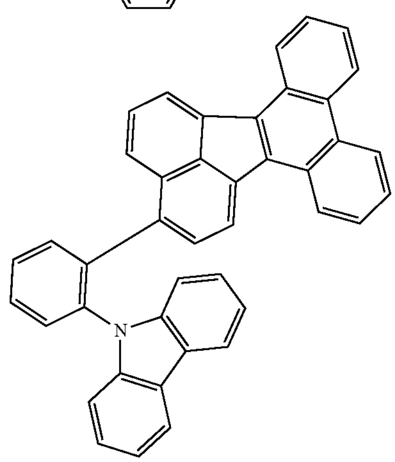
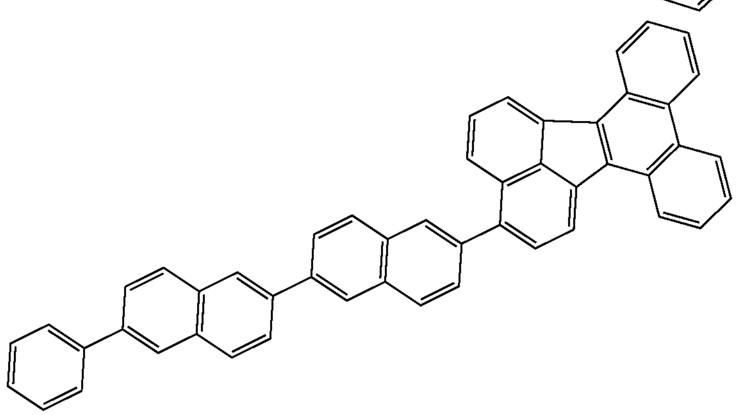

-continued
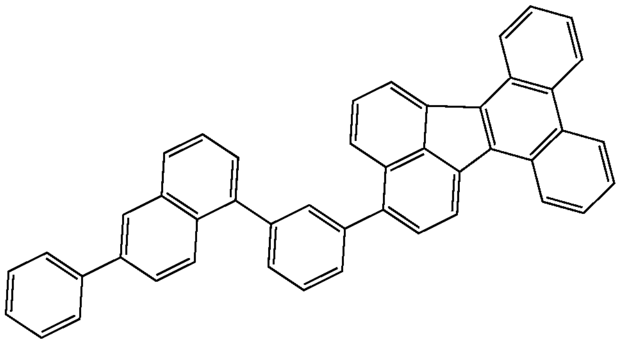
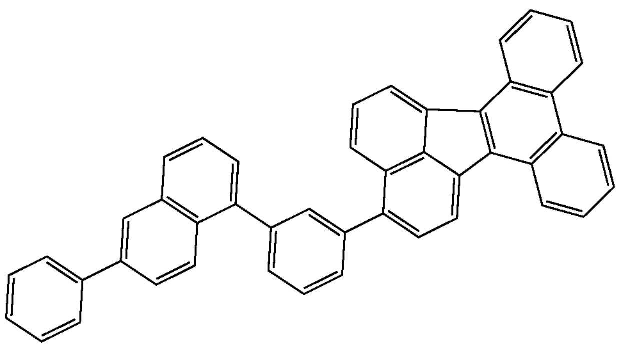
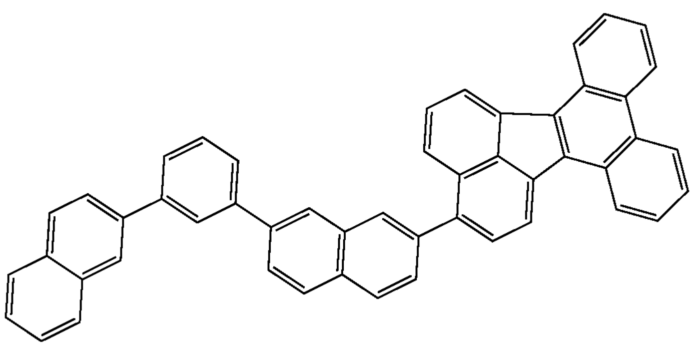
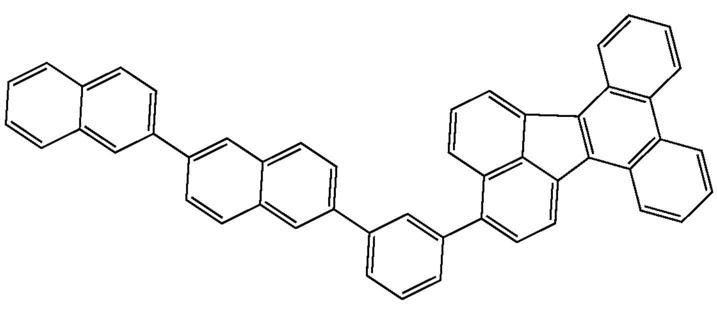

-continued
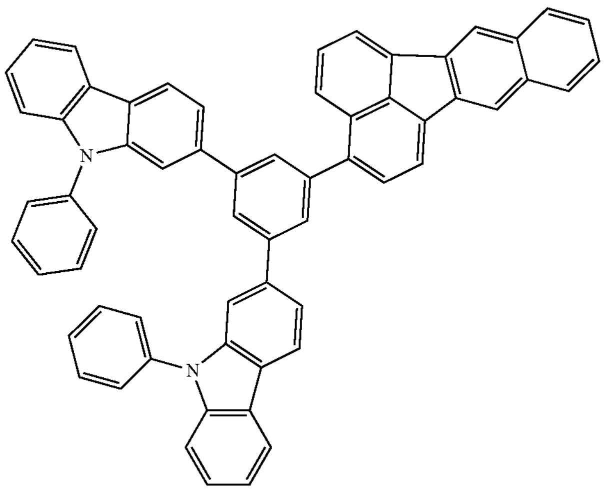
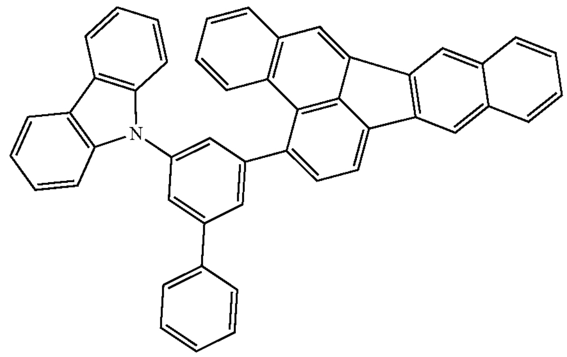
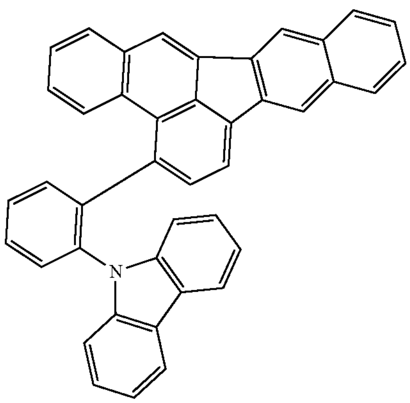
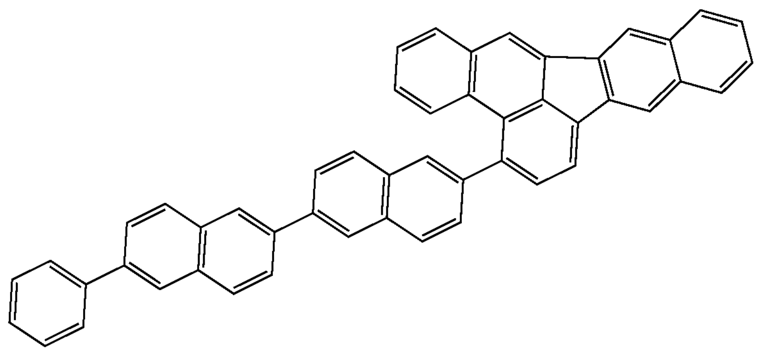
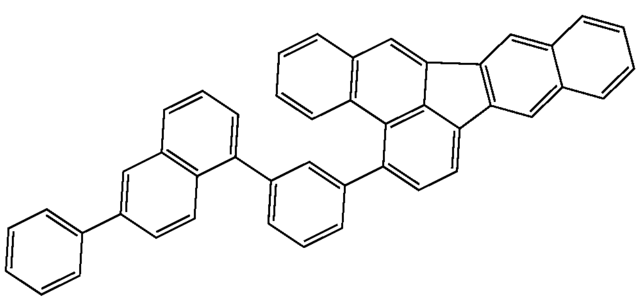
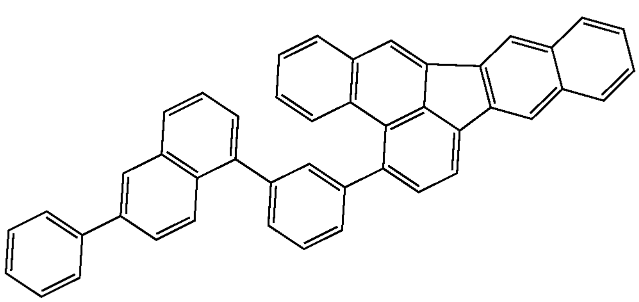

-continued
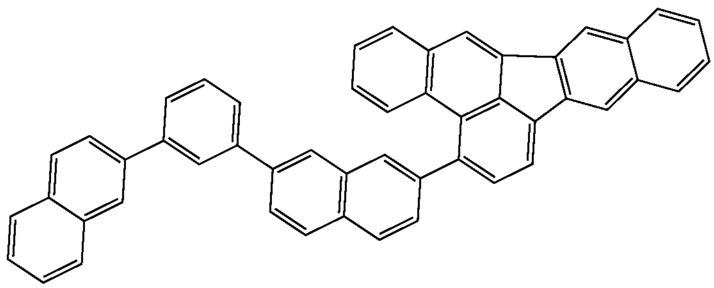
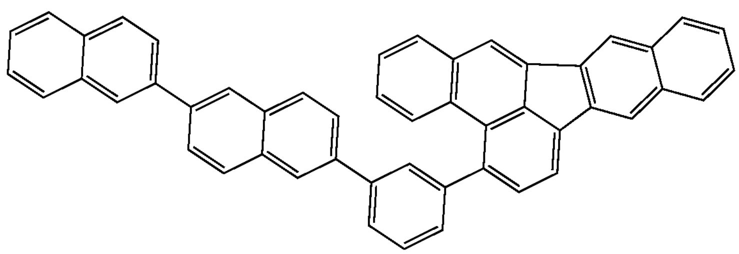
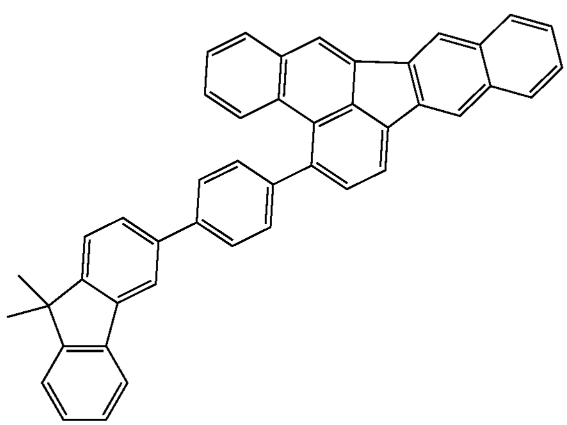
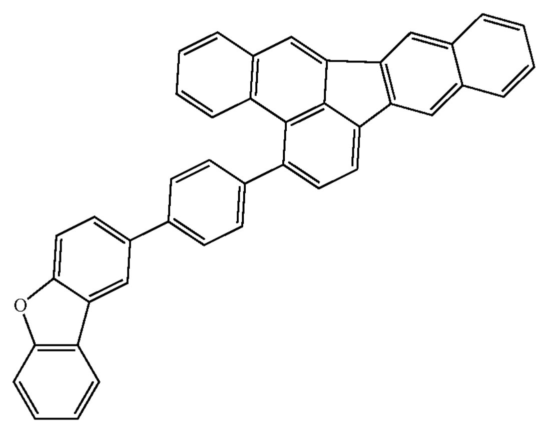
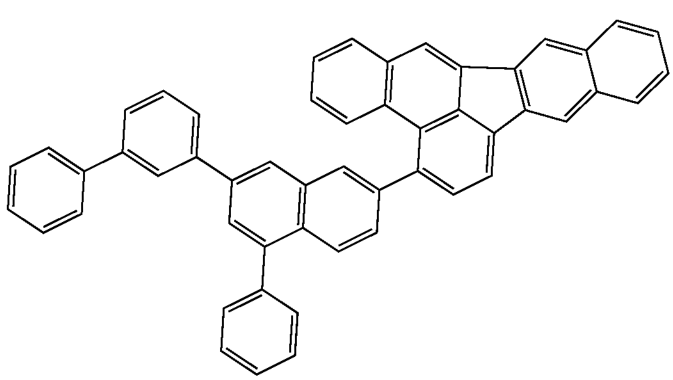
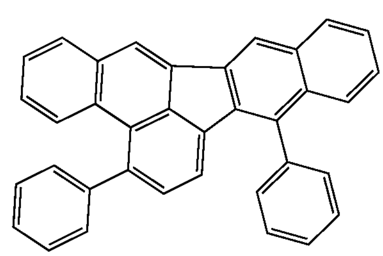

-continued
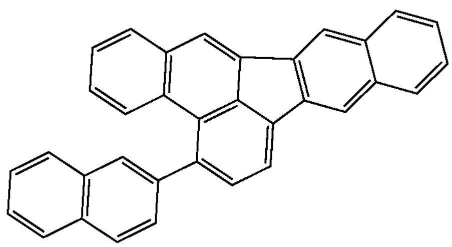
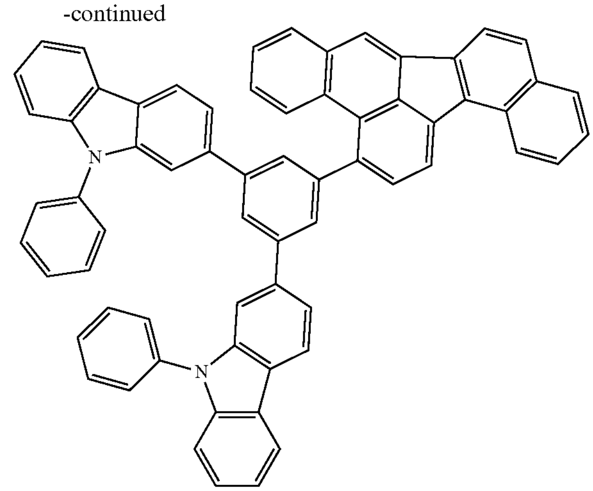
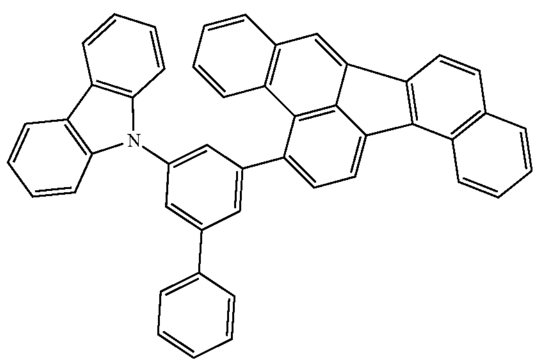
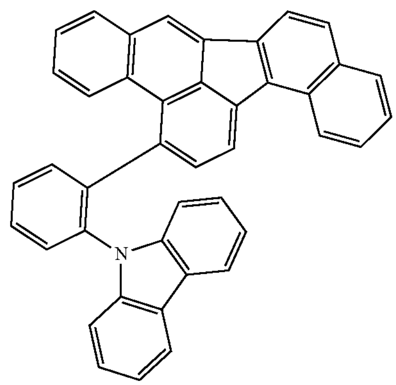
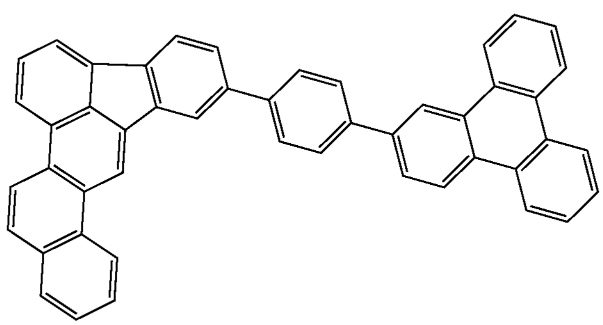
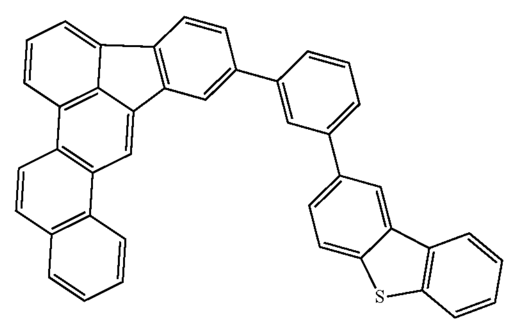
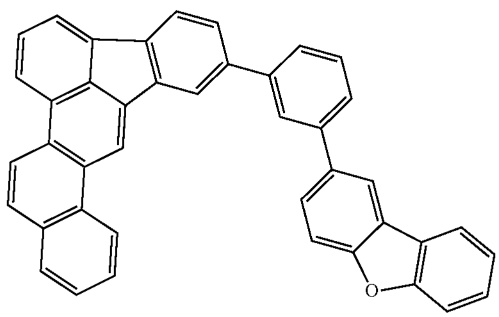
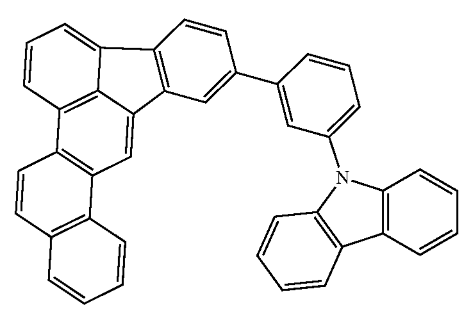

-continued
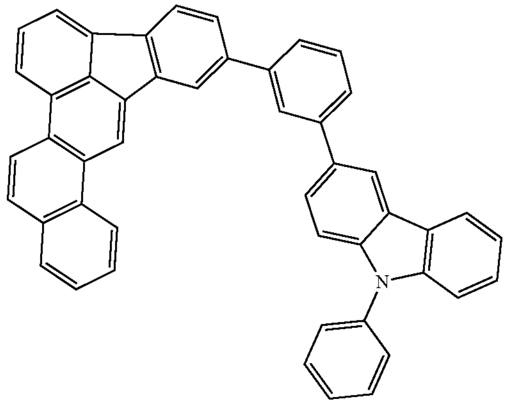
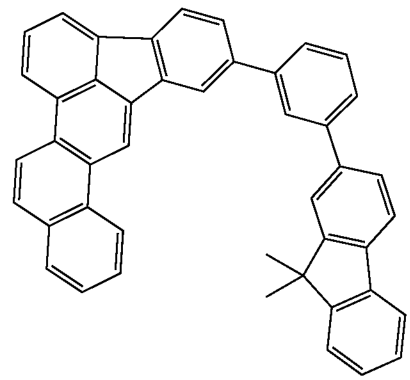
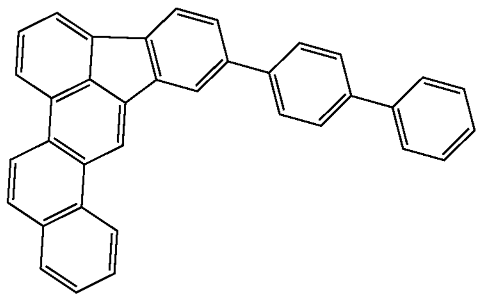
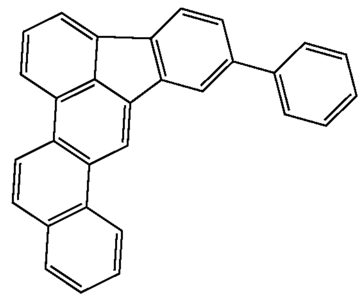
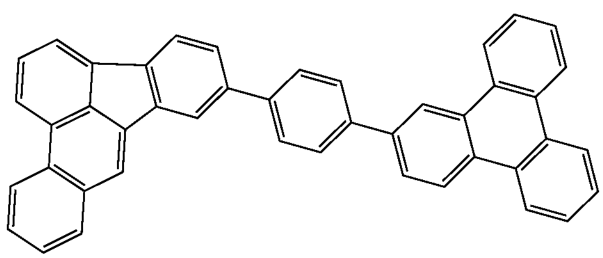
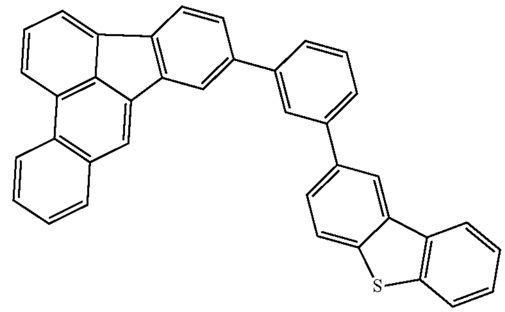
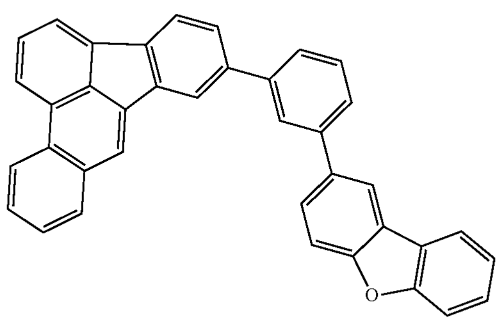
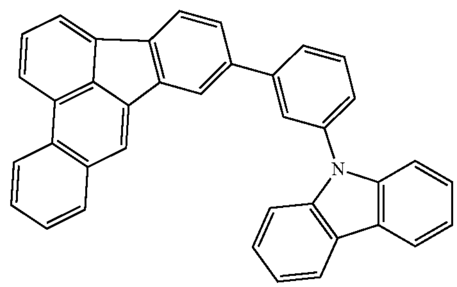
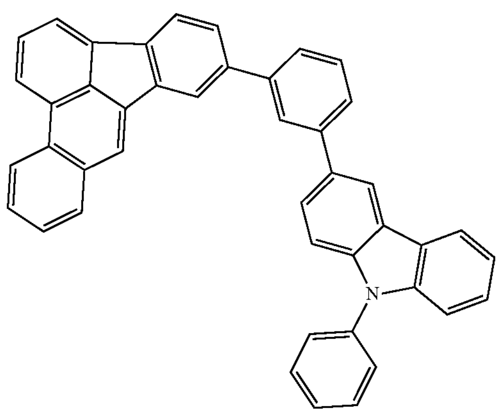
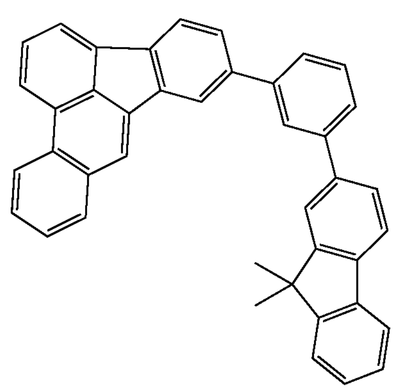

-continued
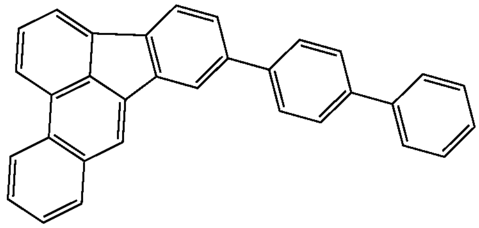
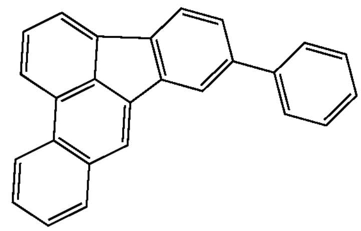
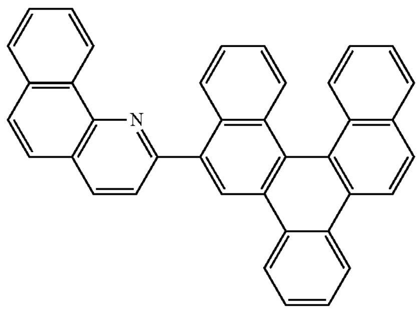
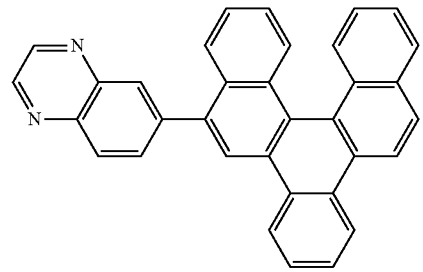
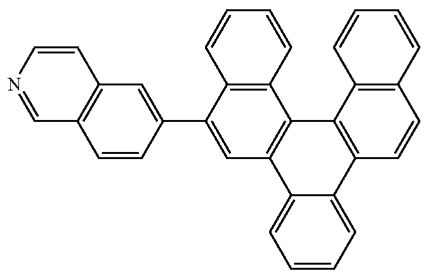
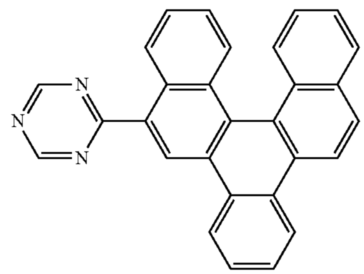
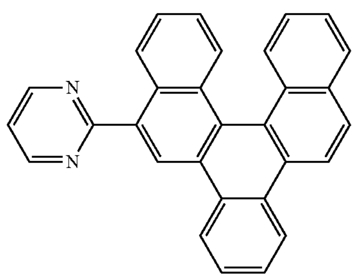
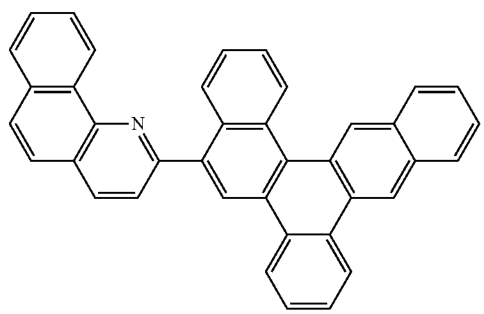
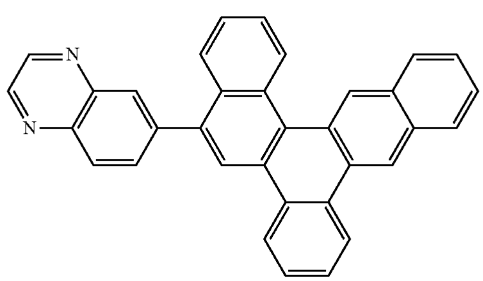
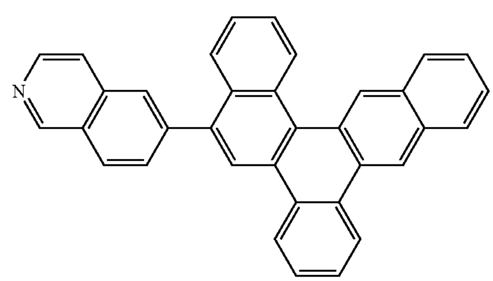
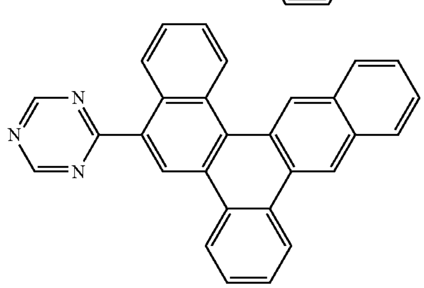
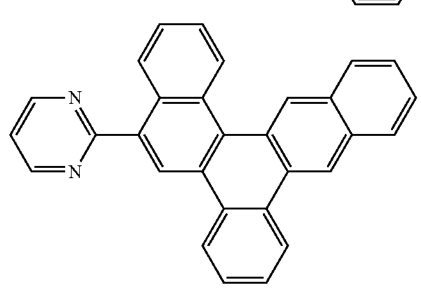

-continued
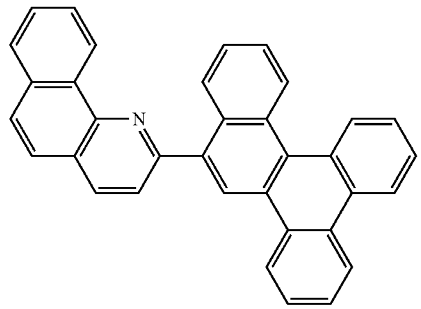
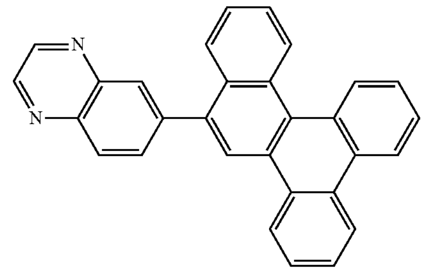
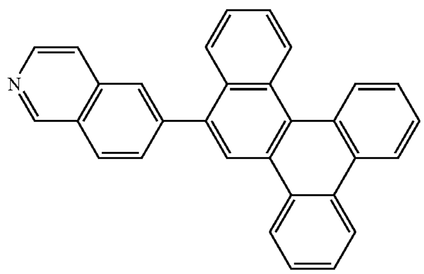
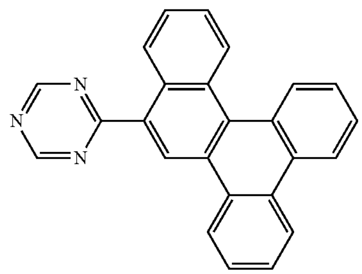
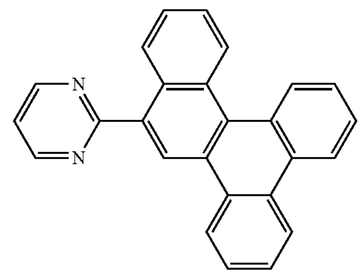
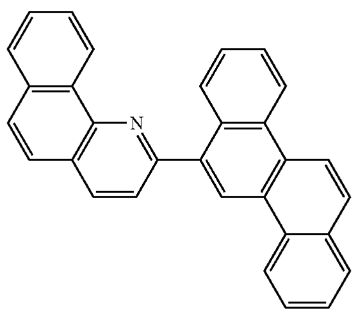
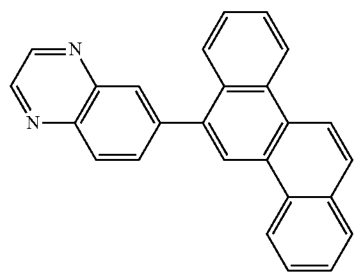
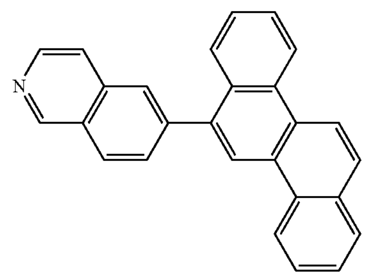
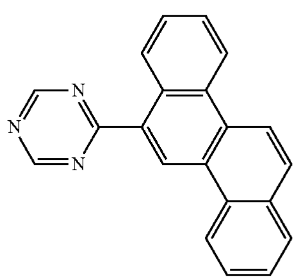
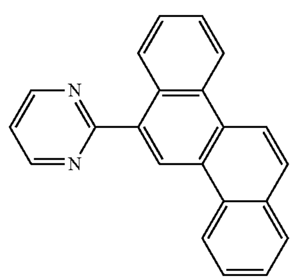
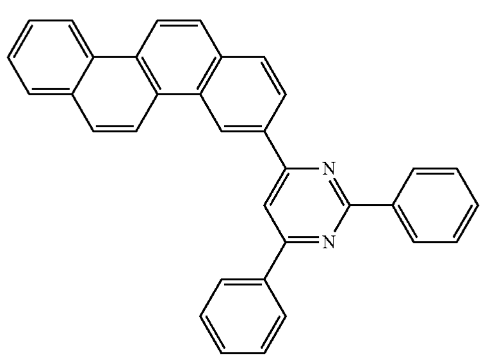
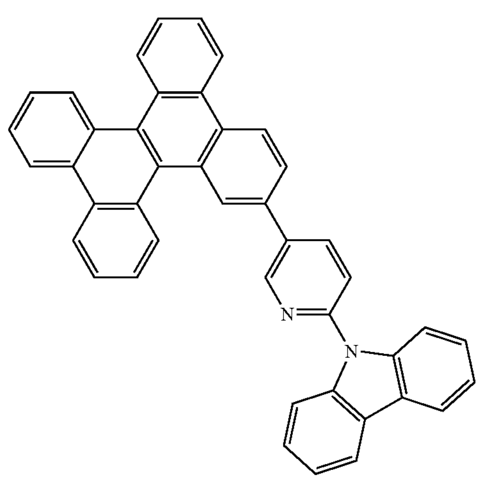

-continued
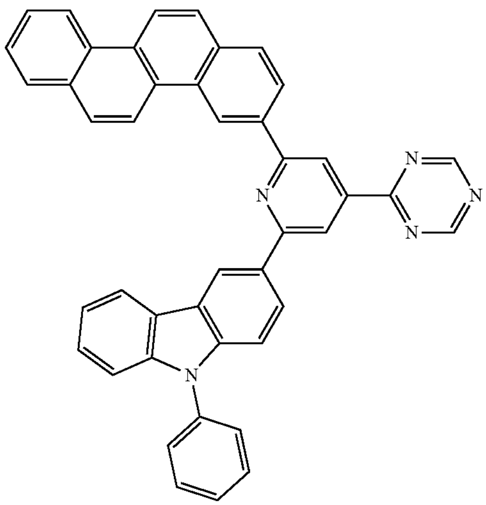
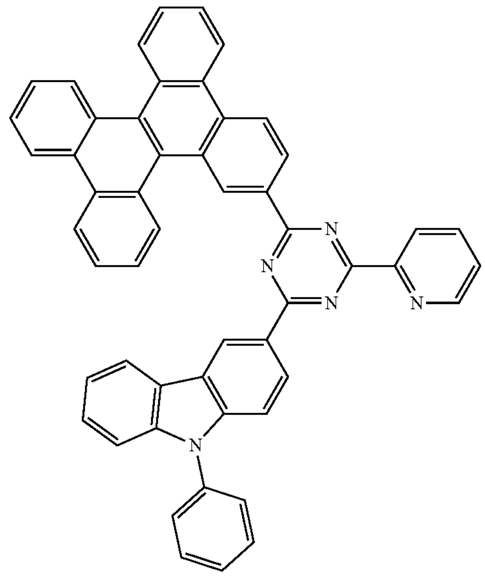
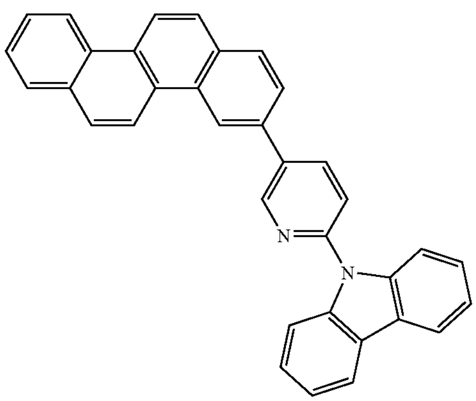
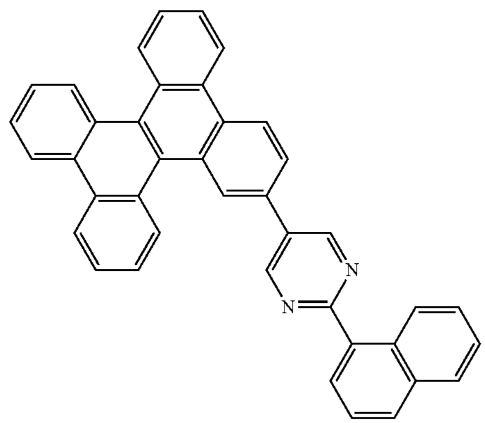
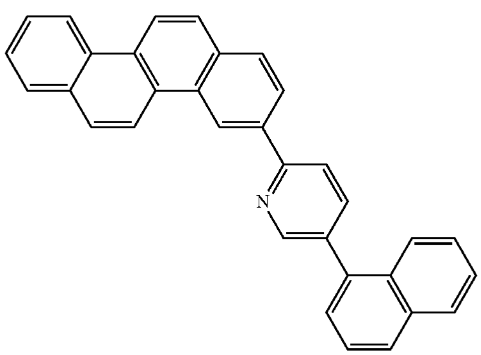
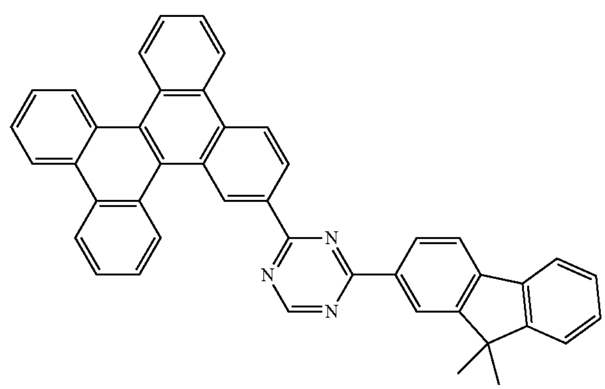
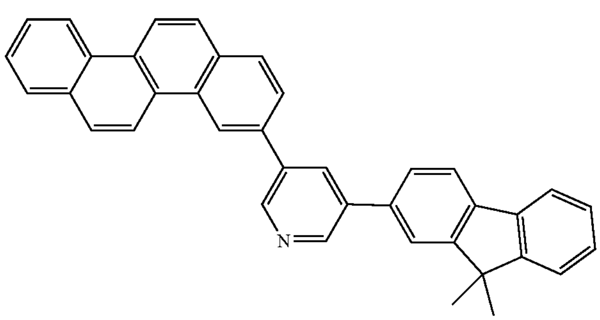

-continued
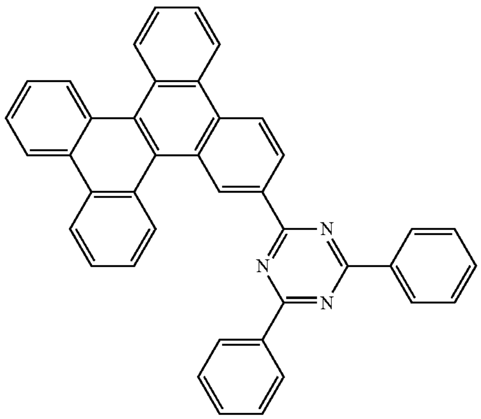
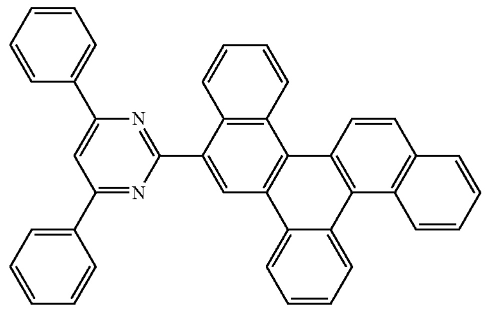
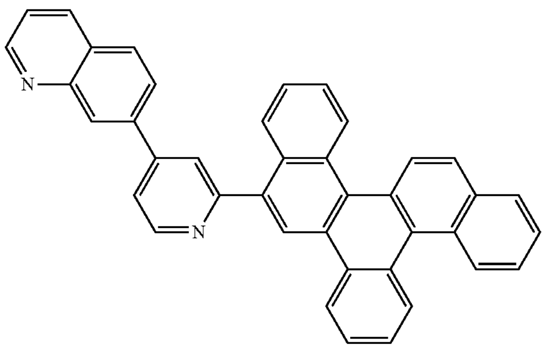
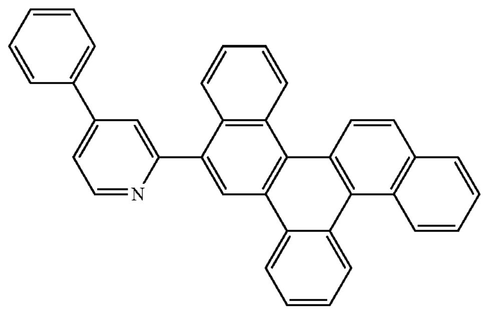
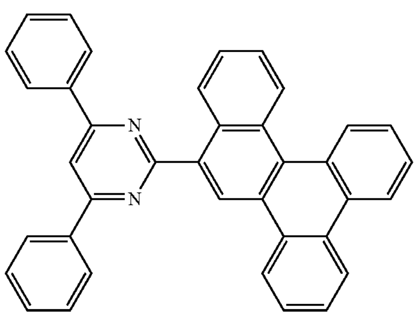
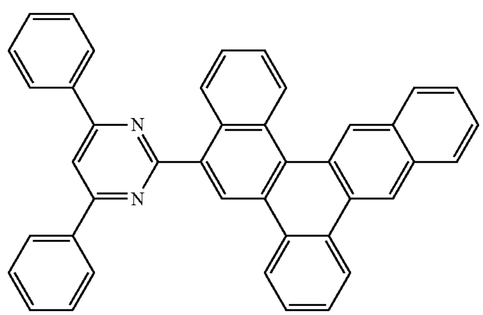
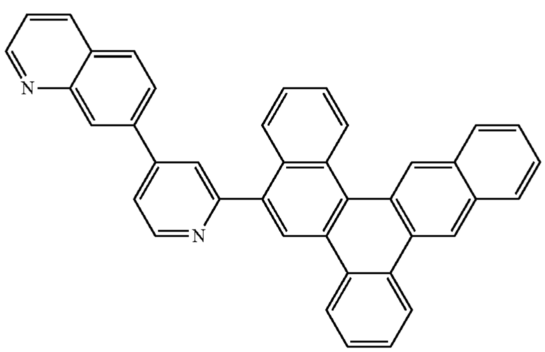
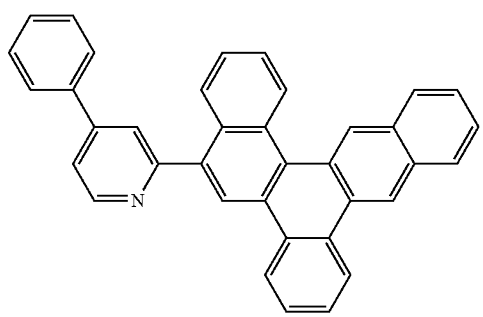

-continued
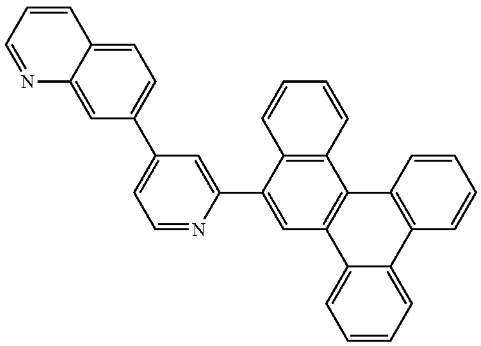
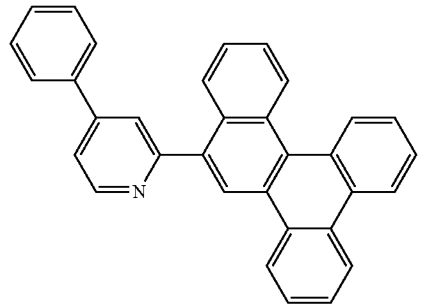
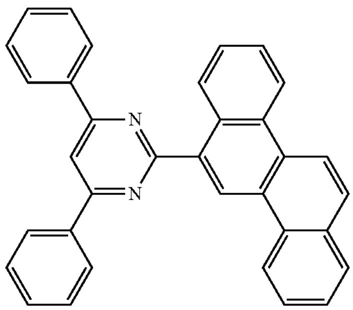
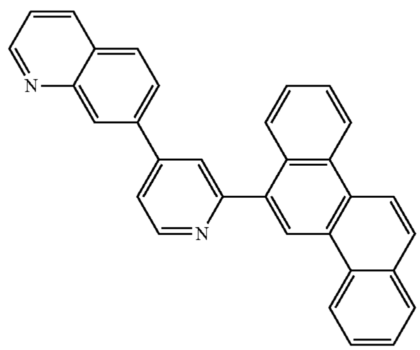
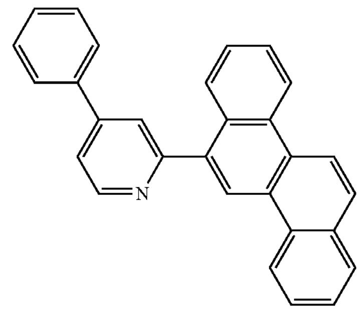
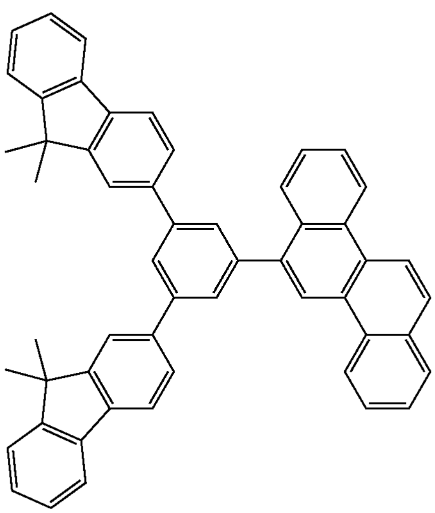
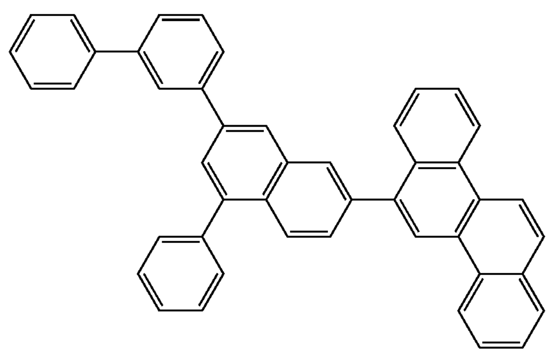
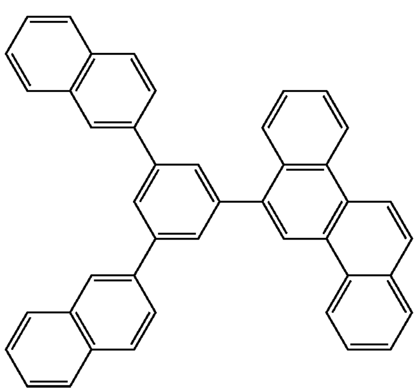
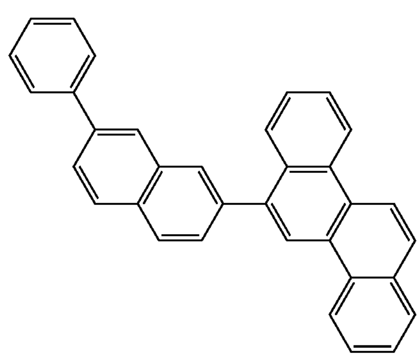

-continued
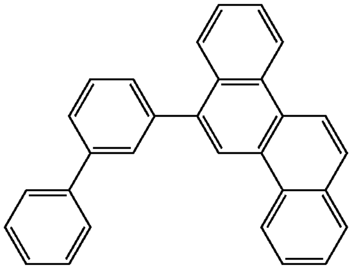
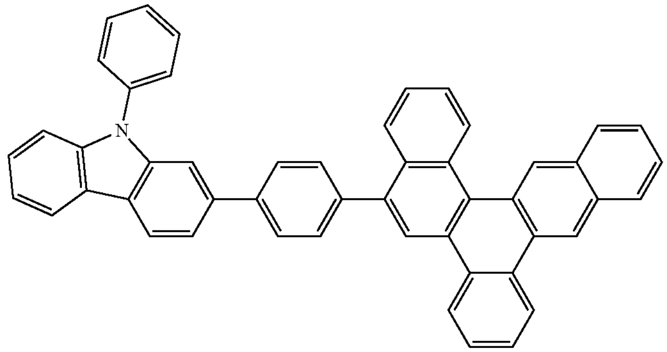
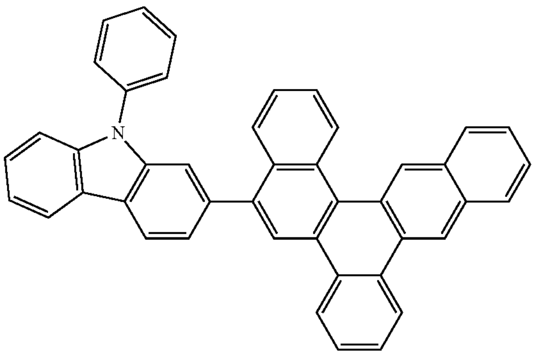
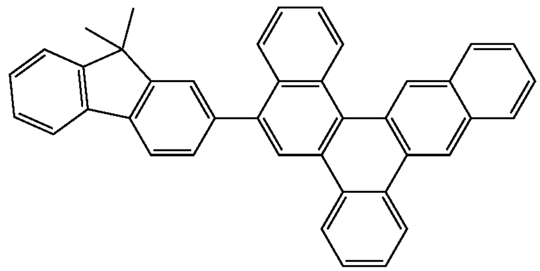
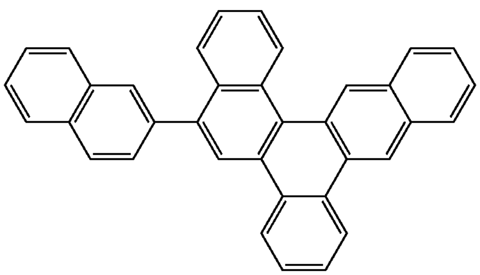
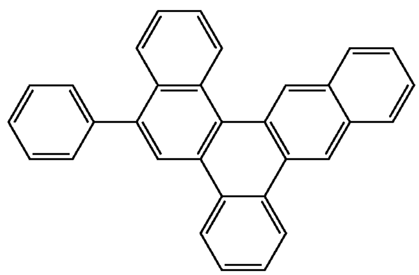
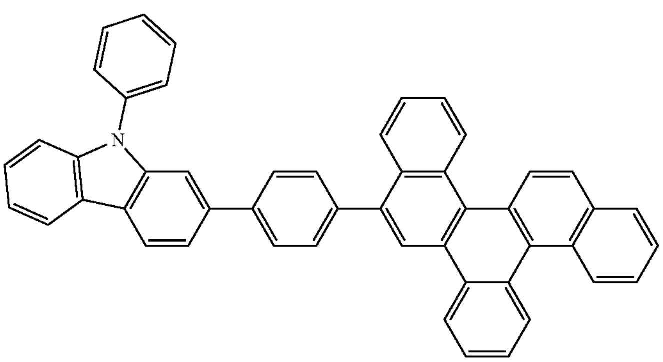
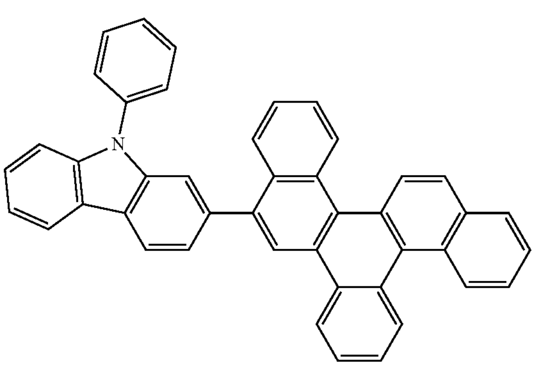
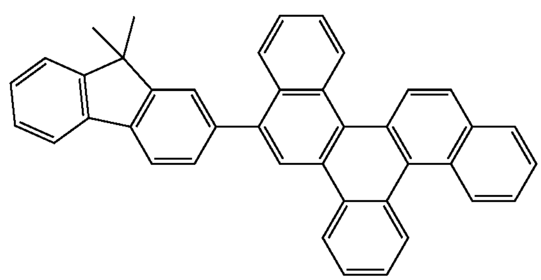

-continued
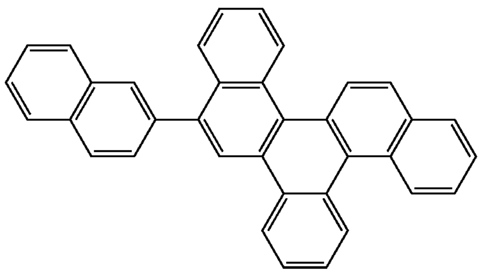
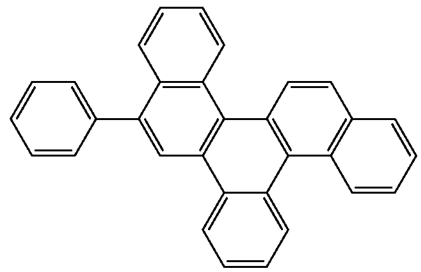
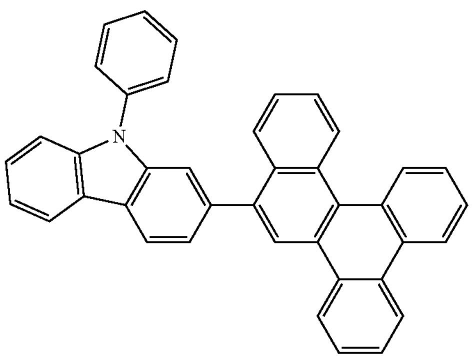
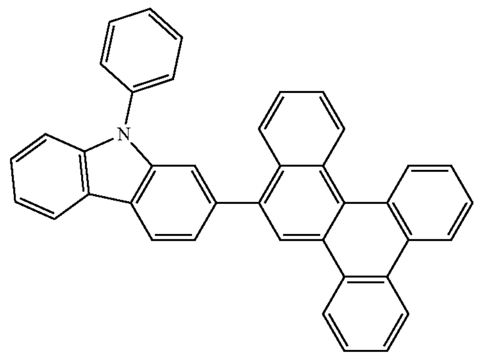
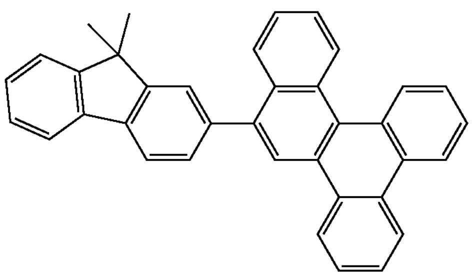
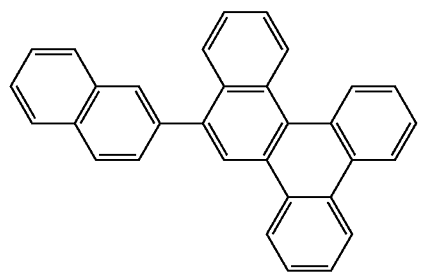
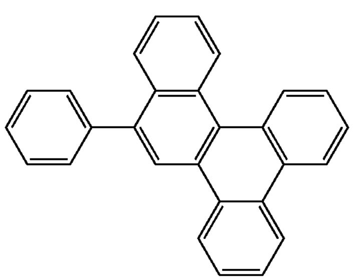
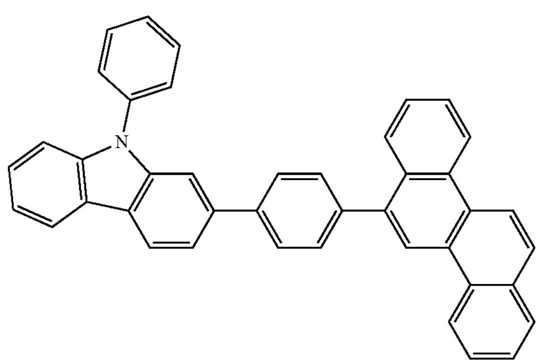
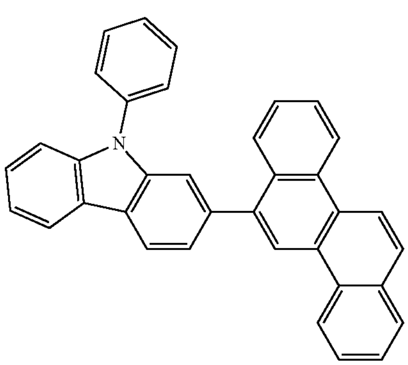
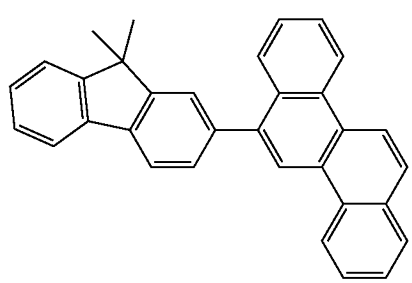

-continued
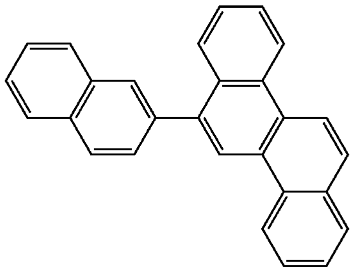
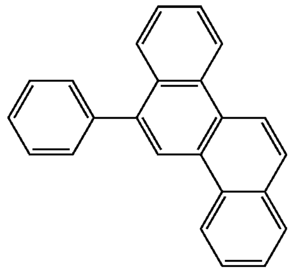
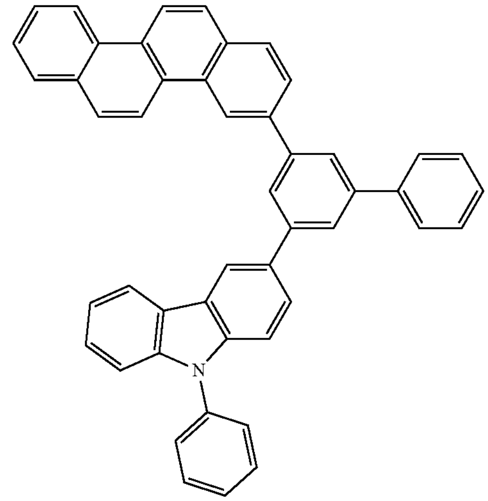
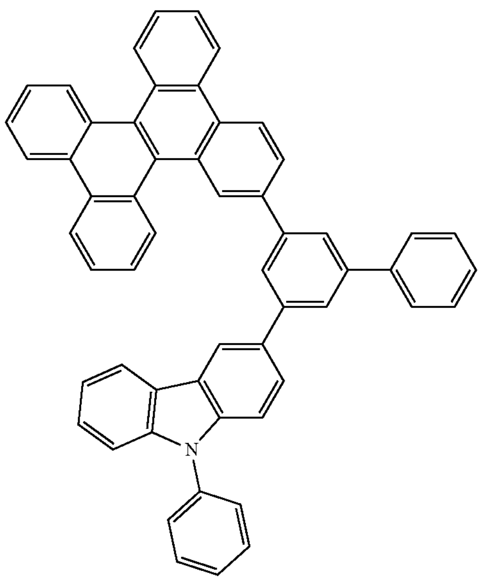
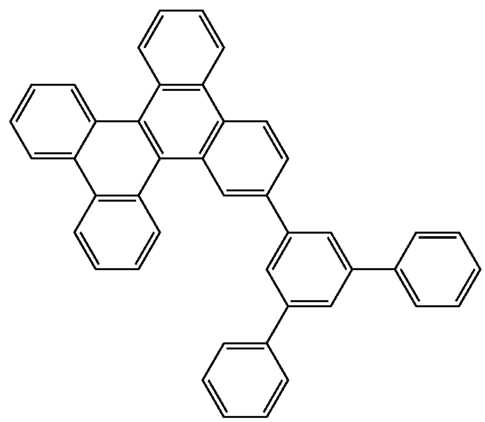
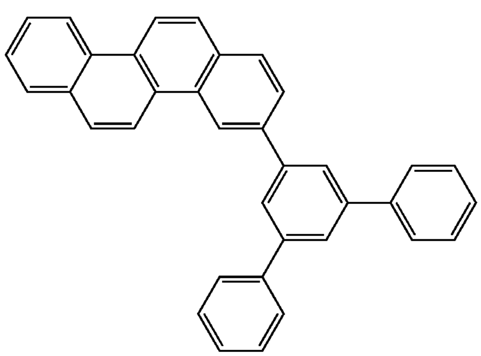
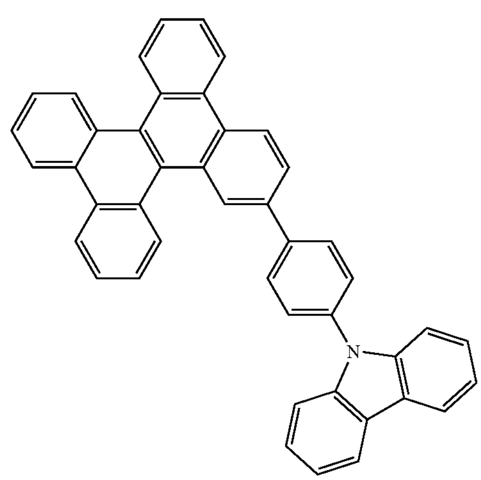

-continued
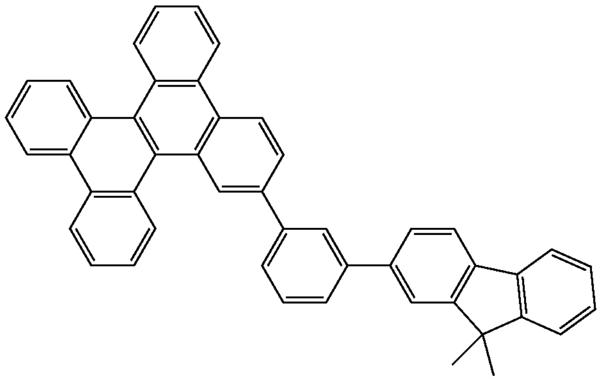
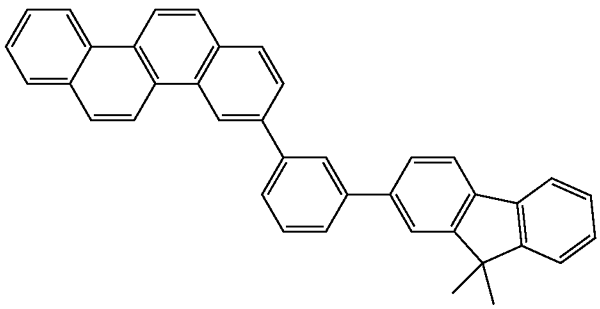
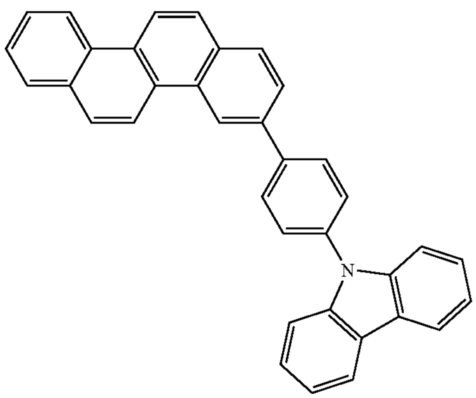
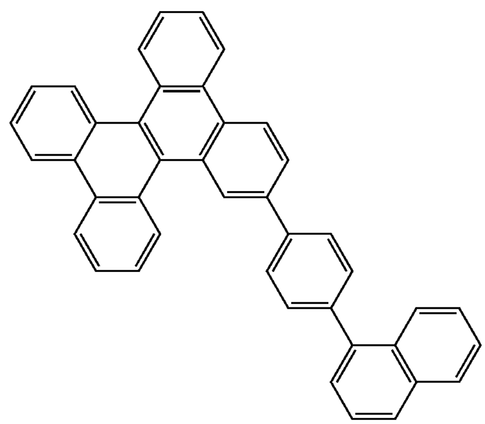
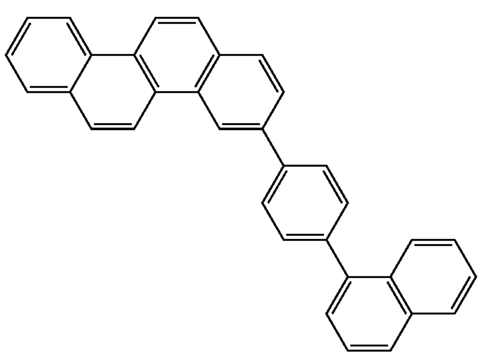
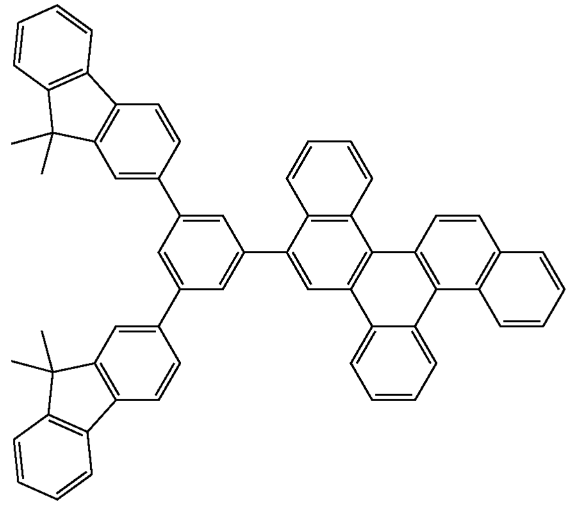

-continued
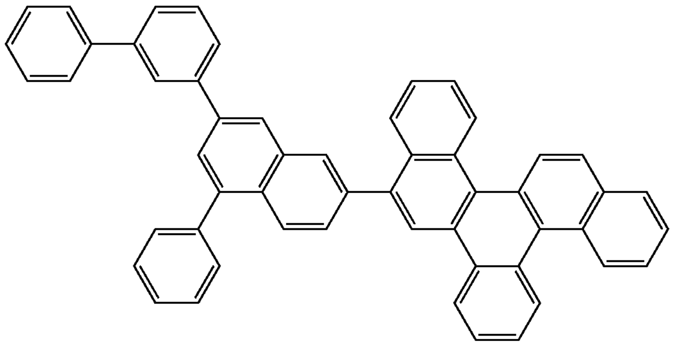
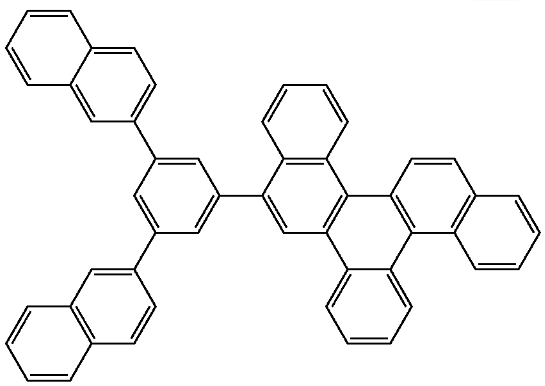
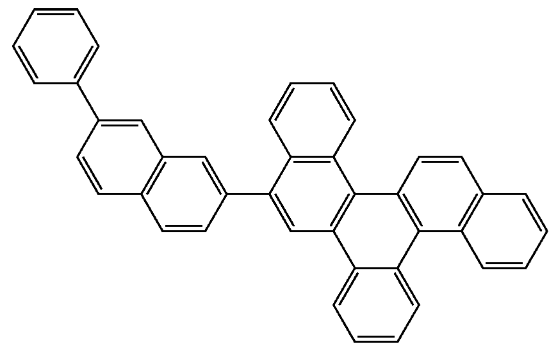
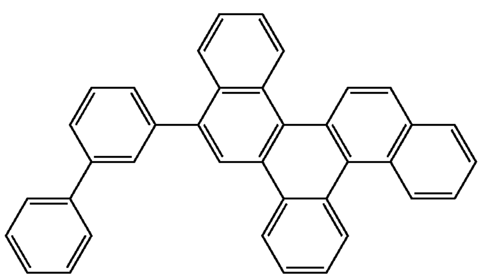
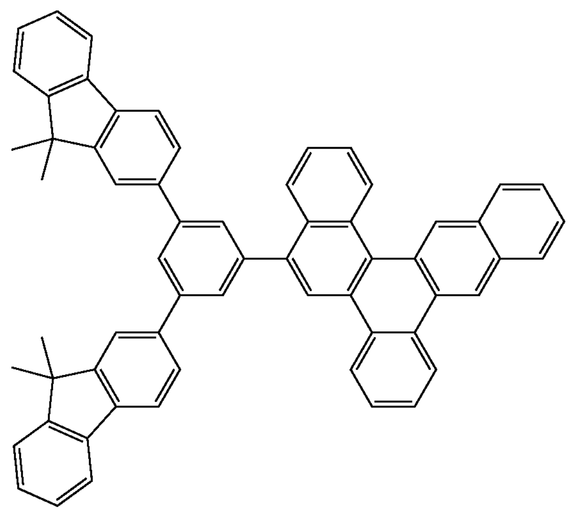
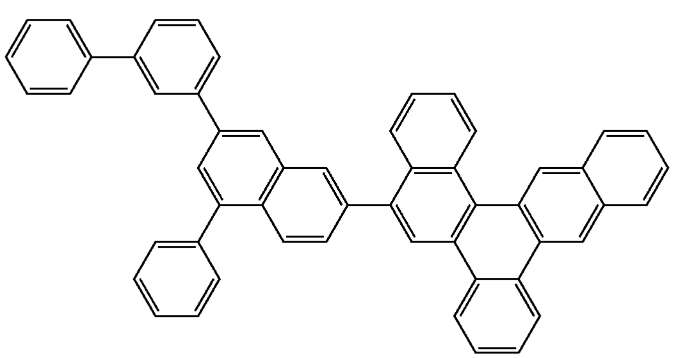

-continued
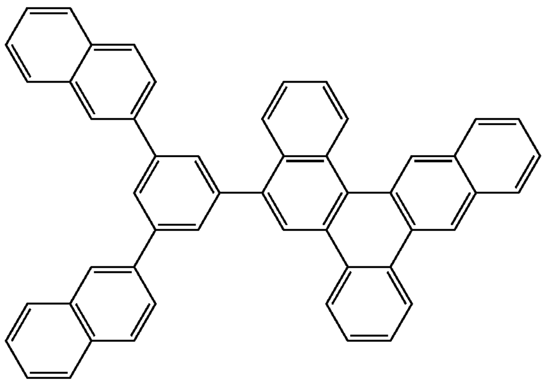
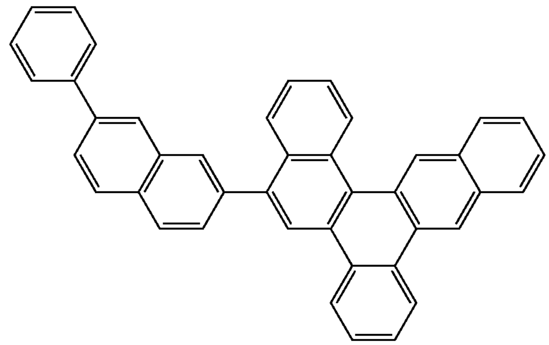
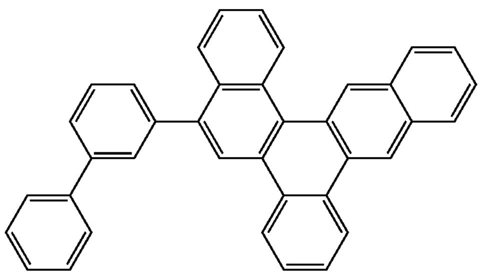
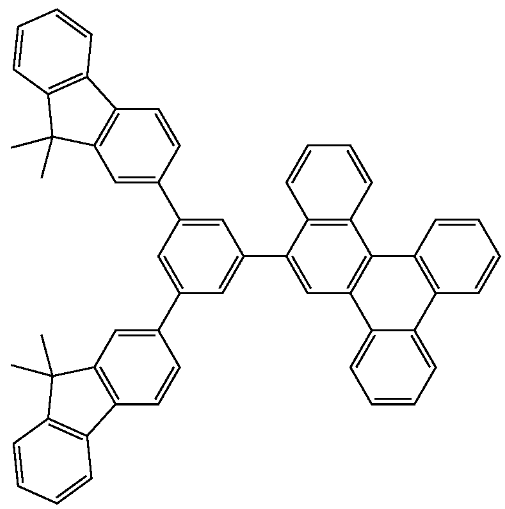
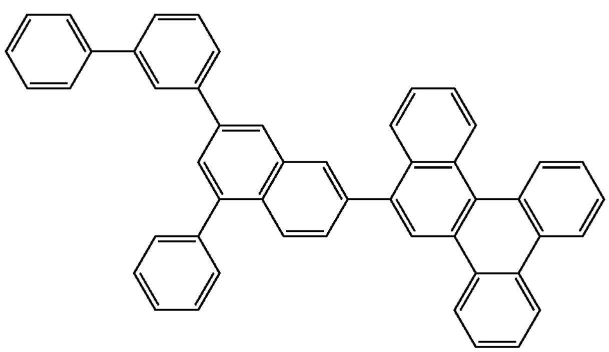
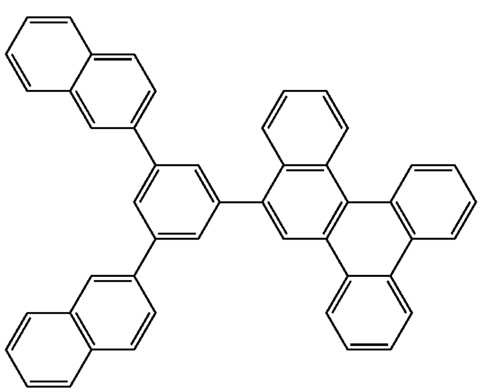
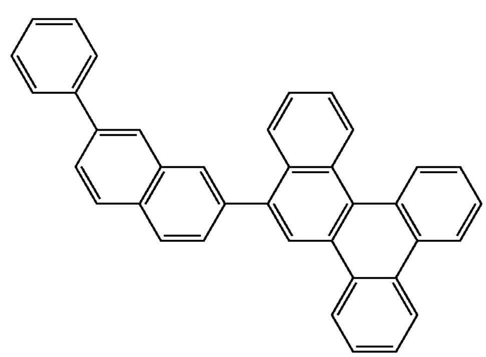

-continued
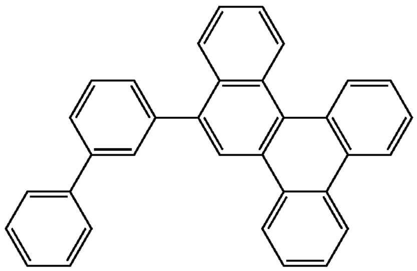
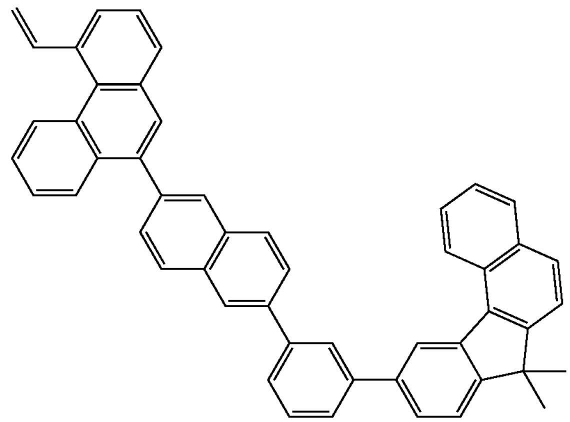
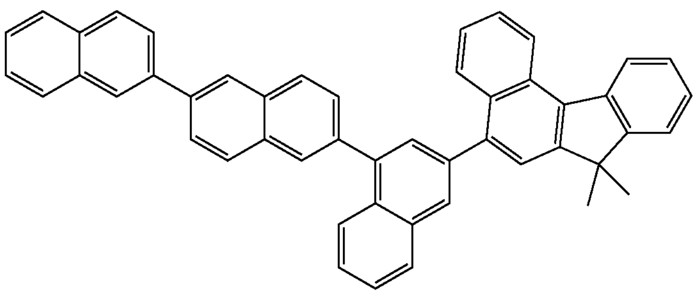
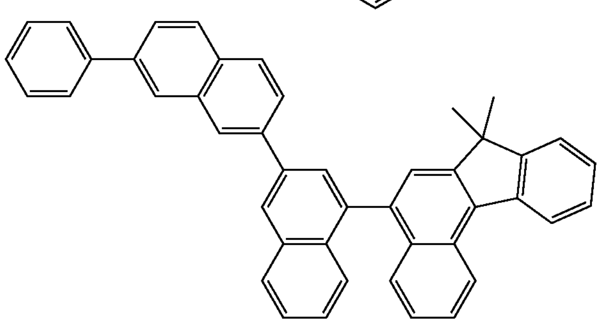
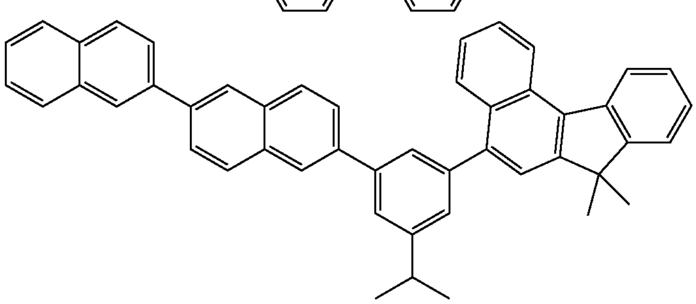
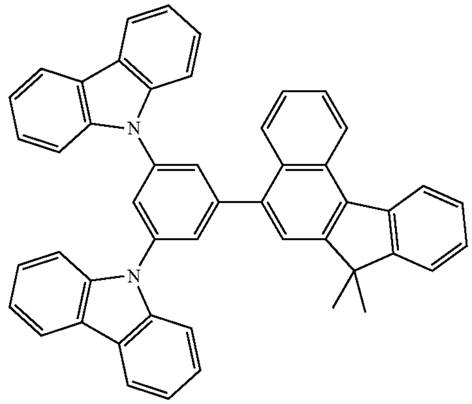
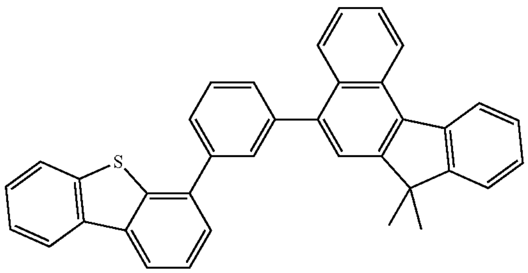

-continued
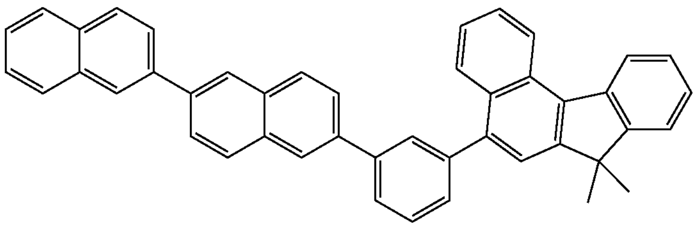
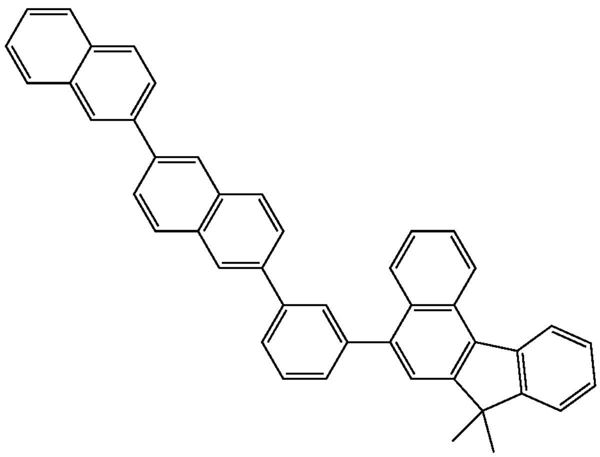
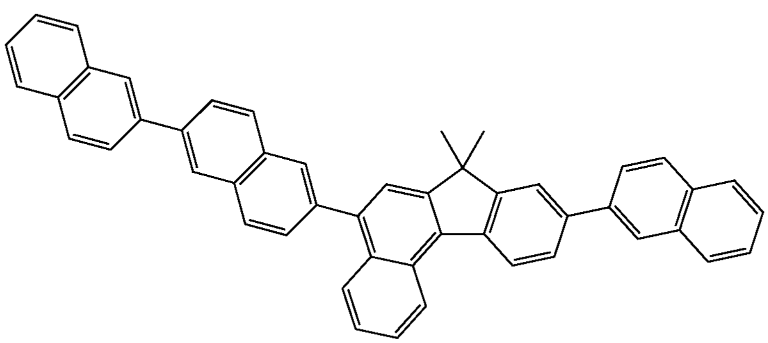
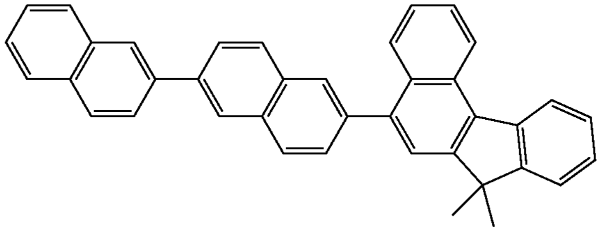
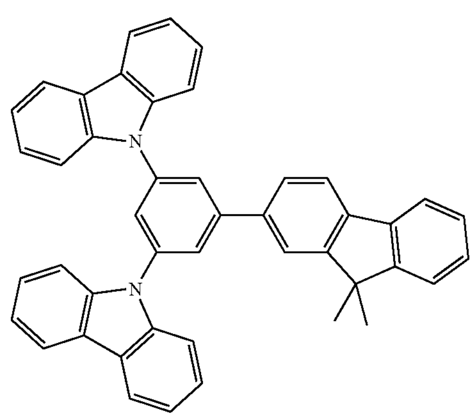

-continued
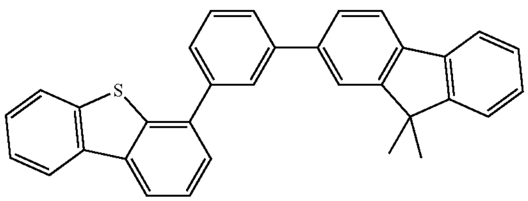
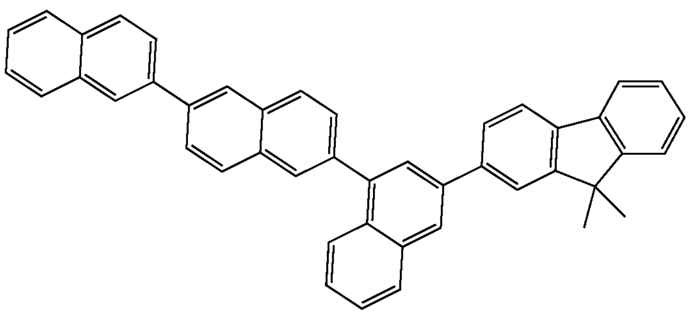
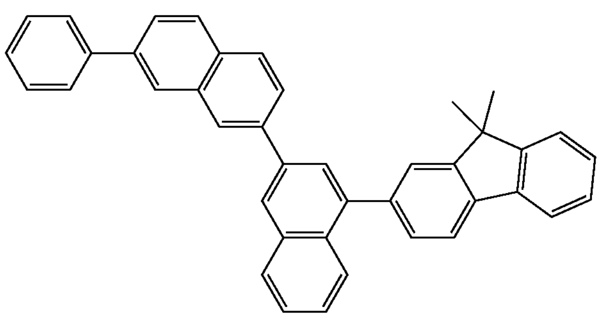
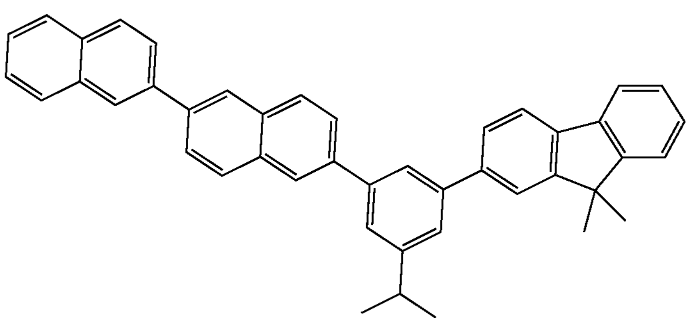
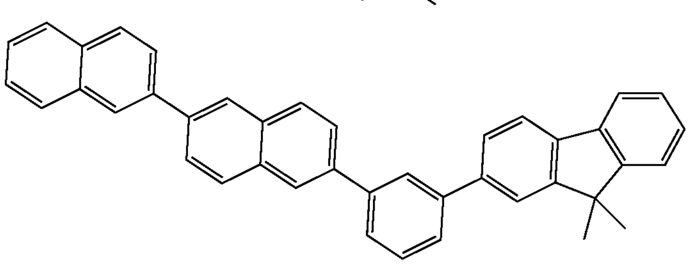
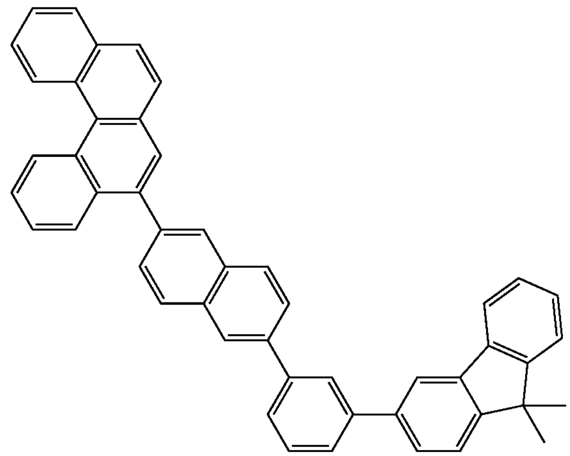

-continued
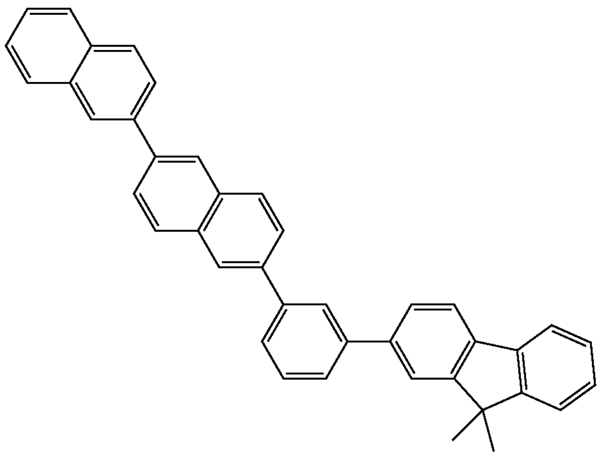
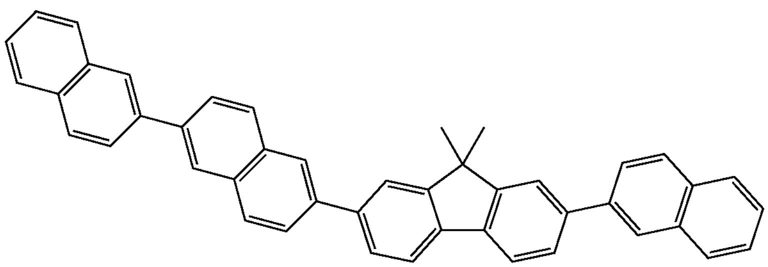
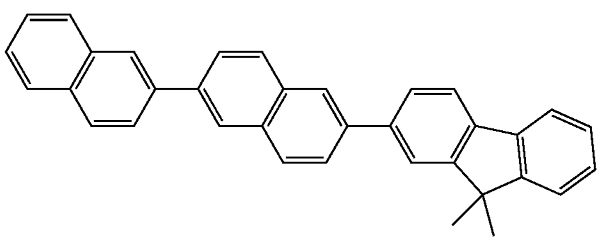
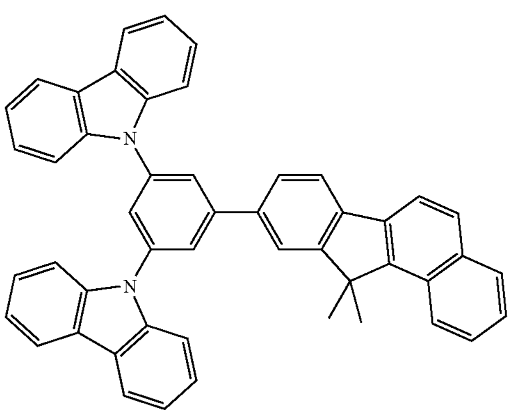
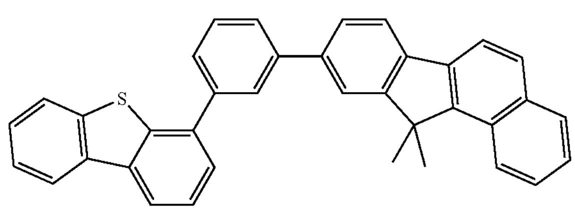

-continued
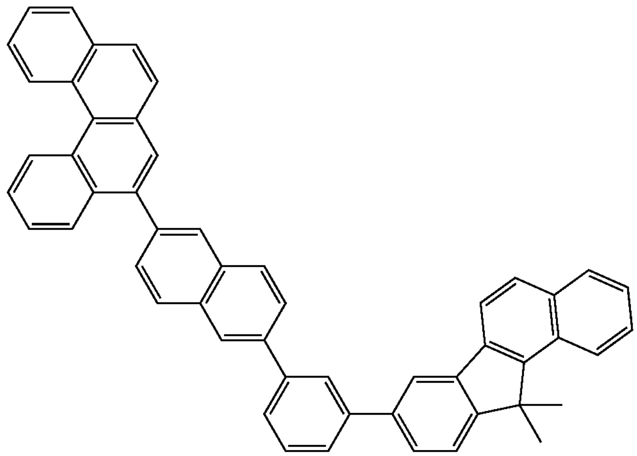
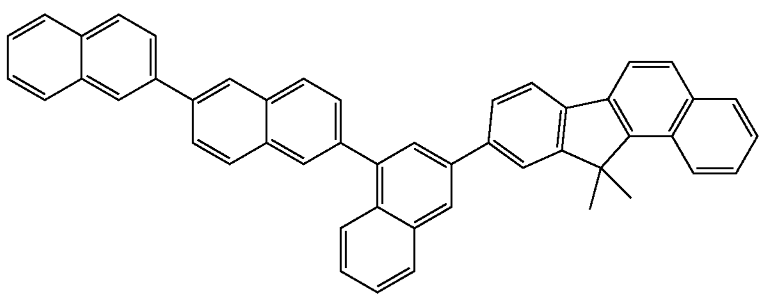
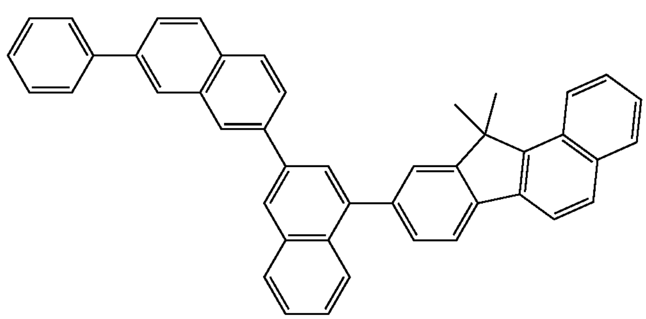
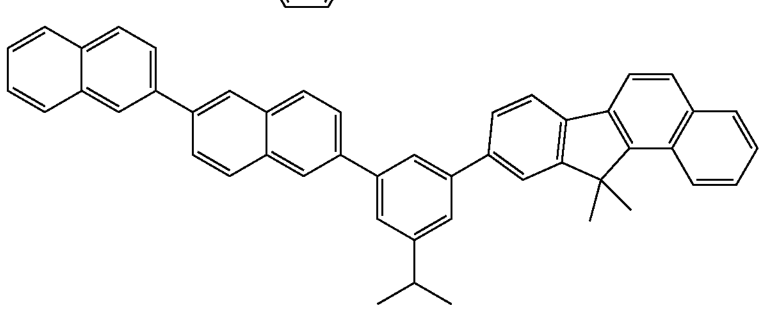
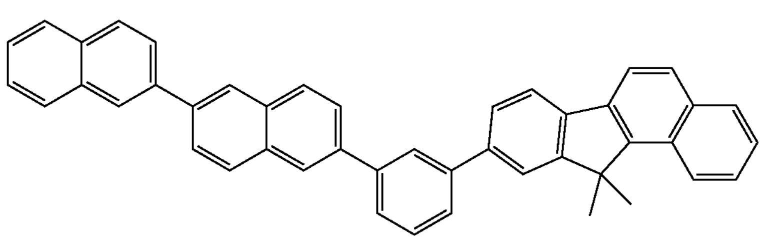

-continued
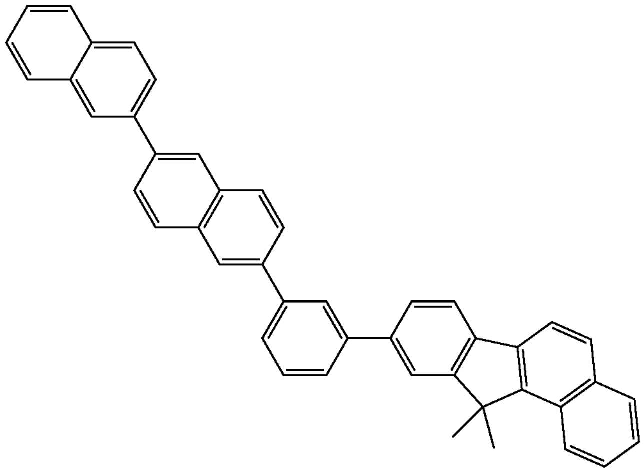
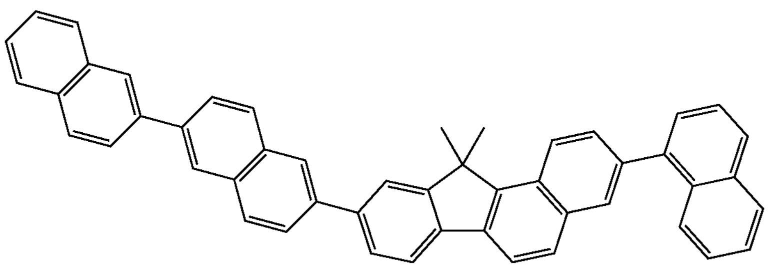
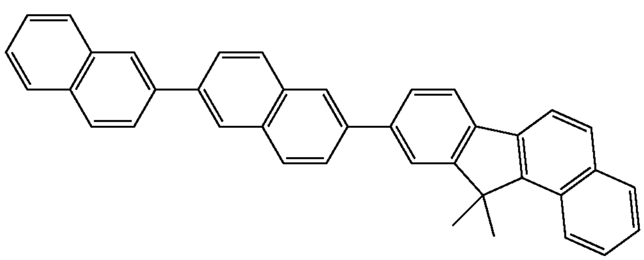
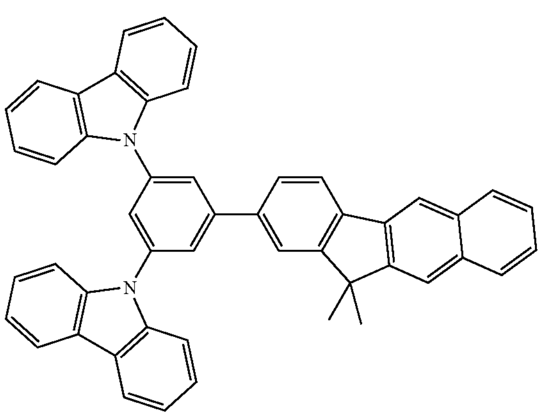
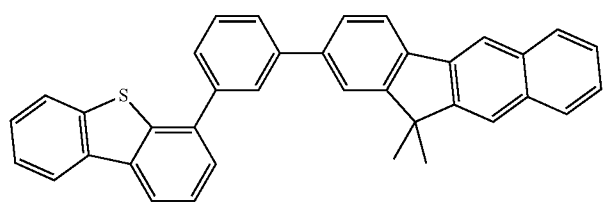

-continued
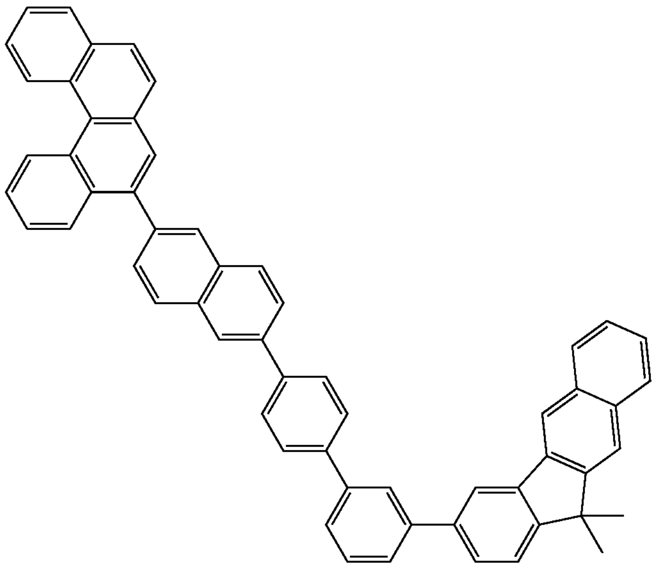
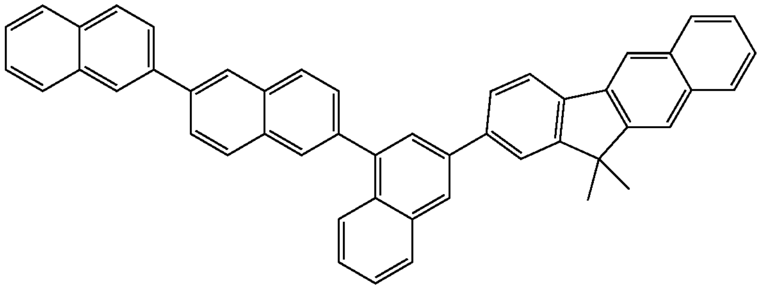
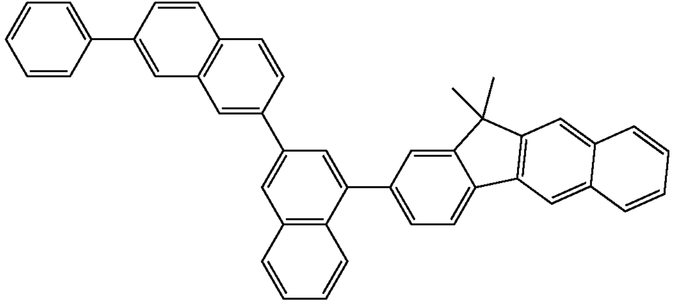
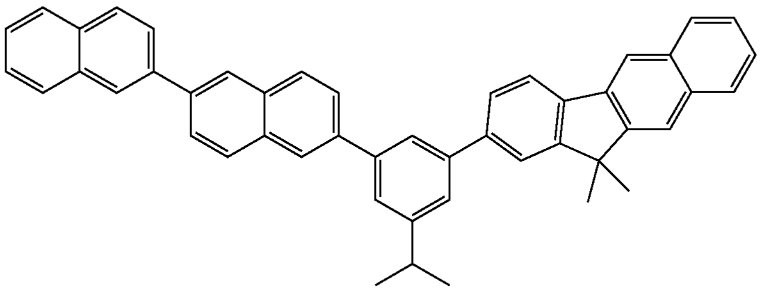
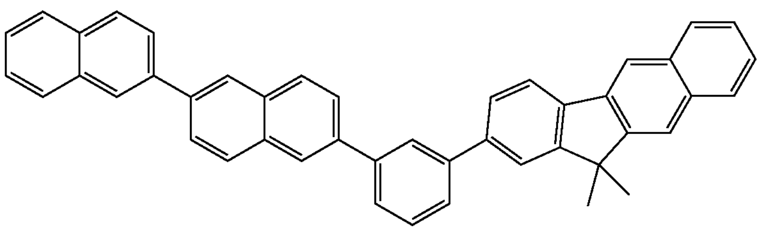

-continued
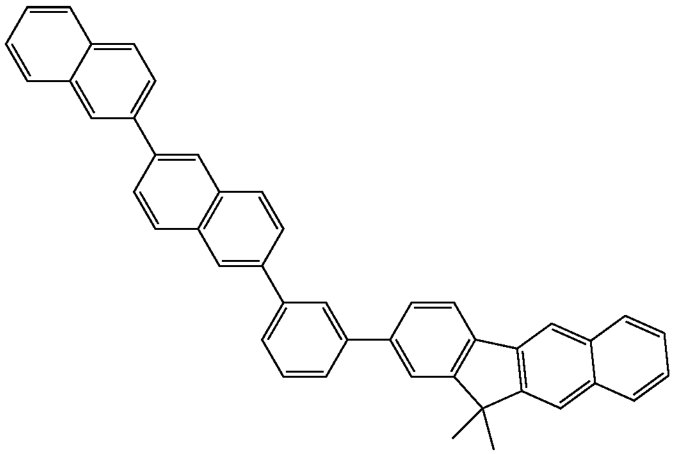
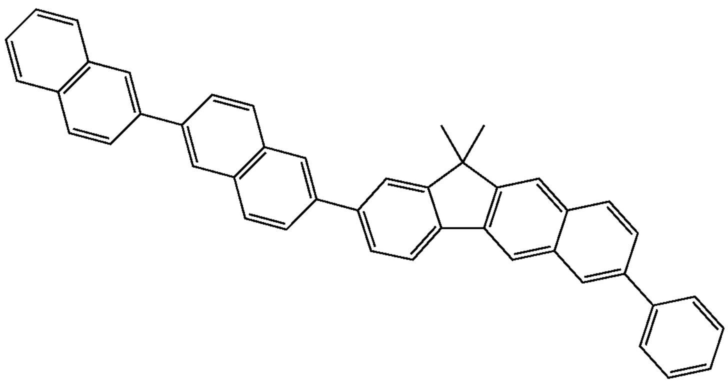
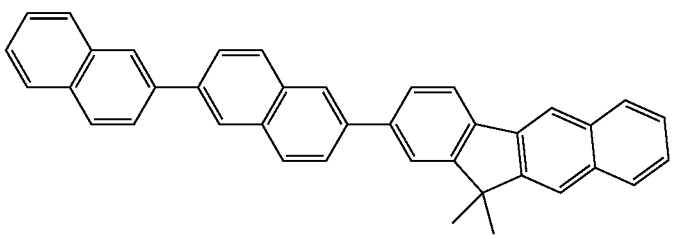
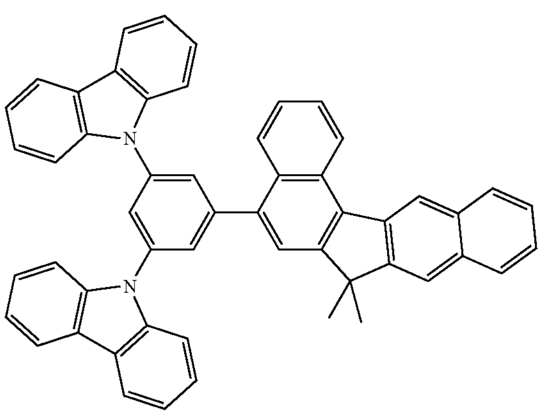
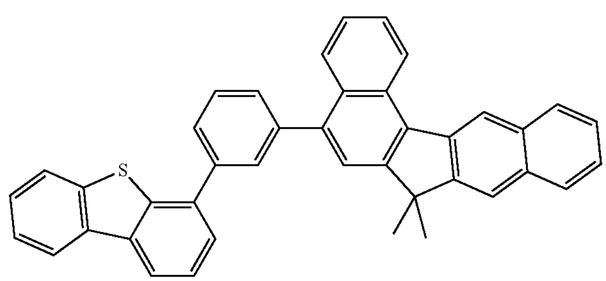

-continued
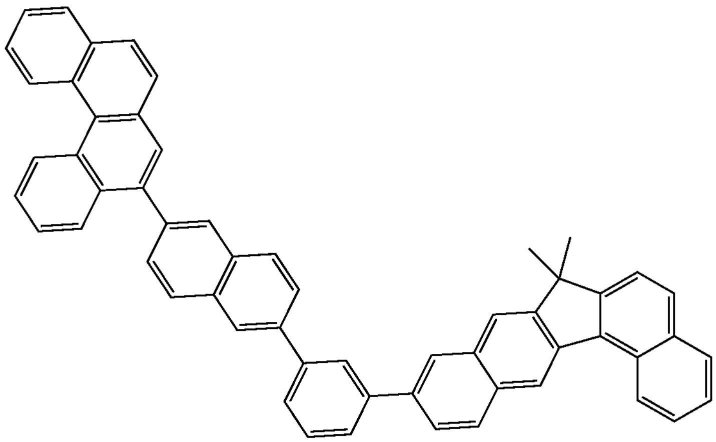
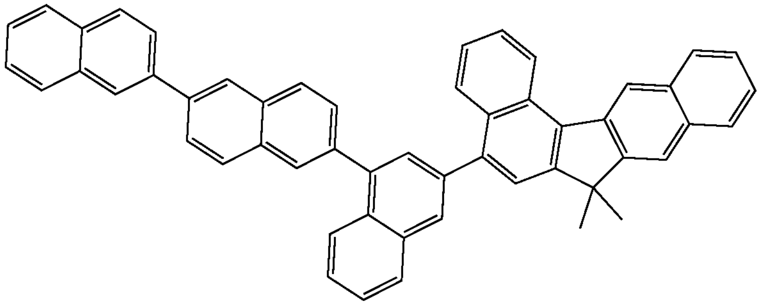
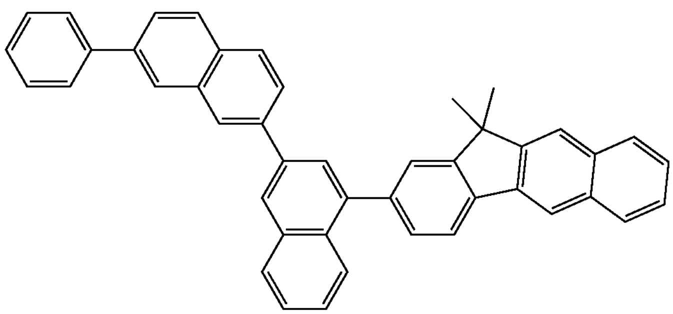
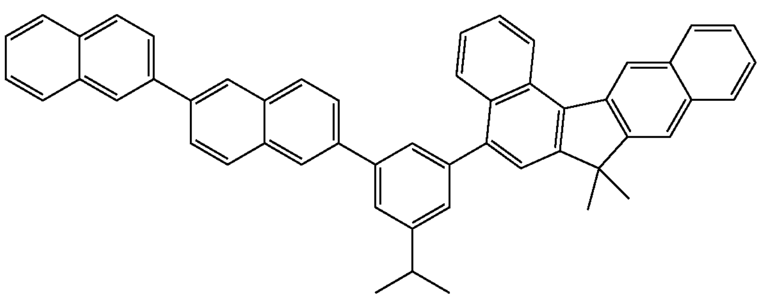
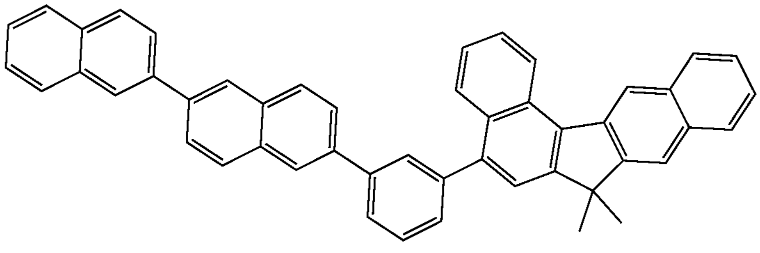

-continued
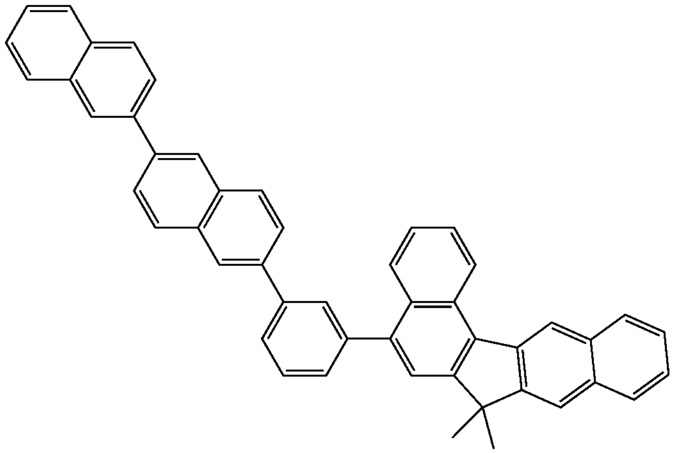
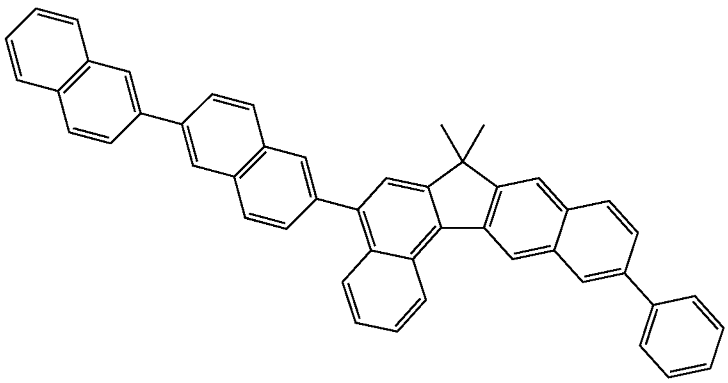
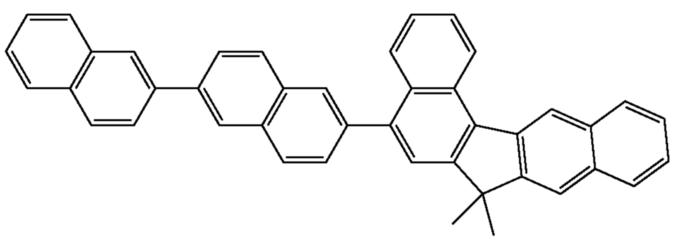
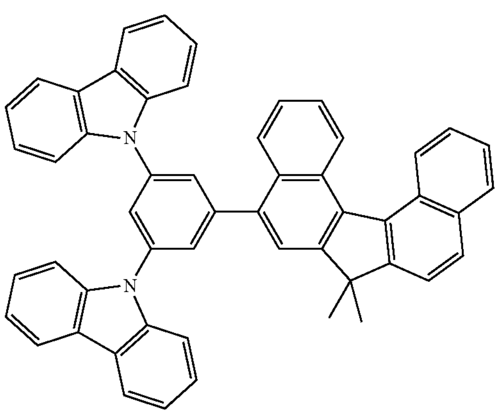
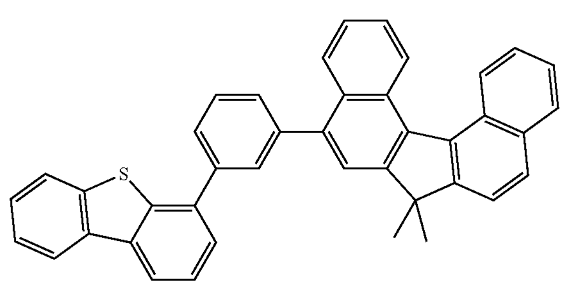

-continued
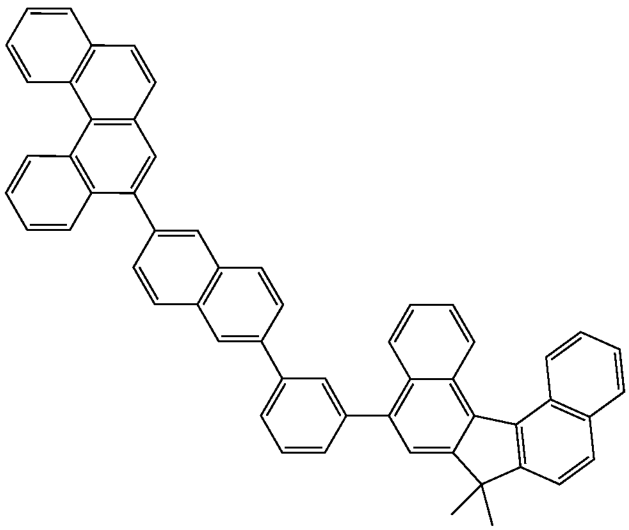
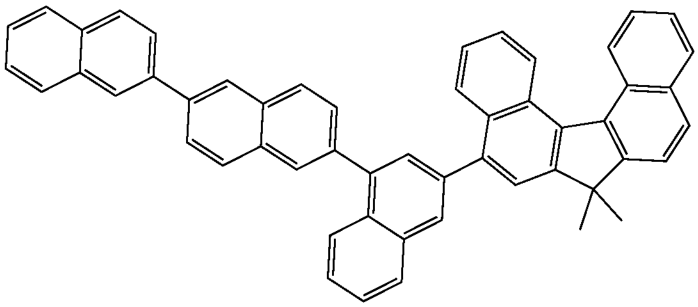
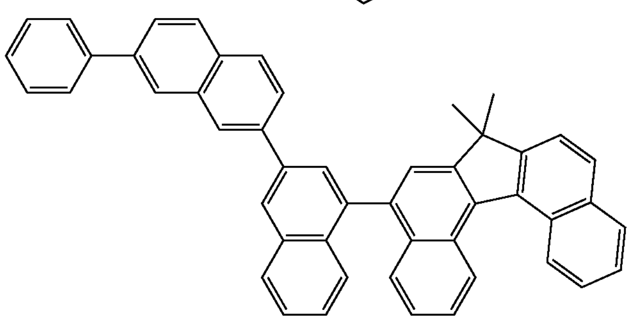
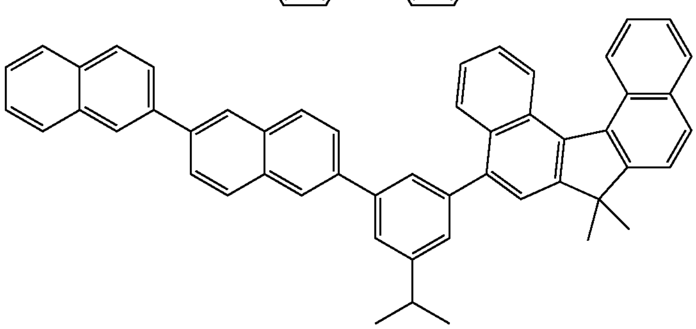
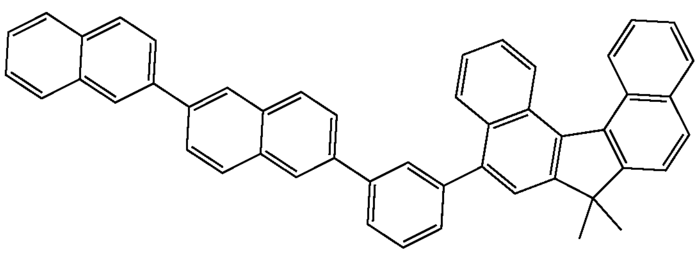

-continued
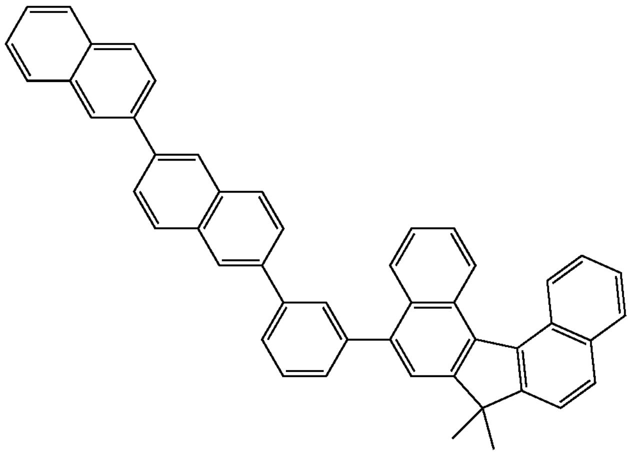
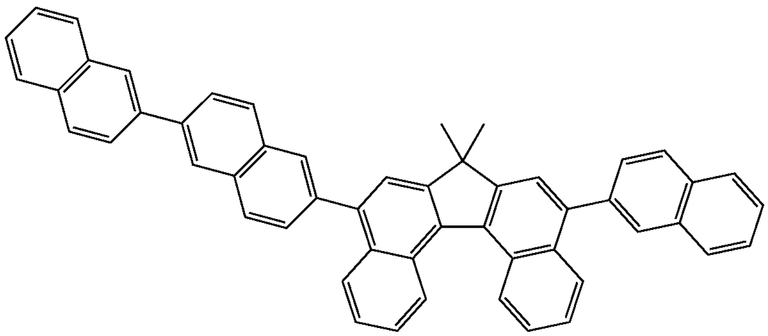
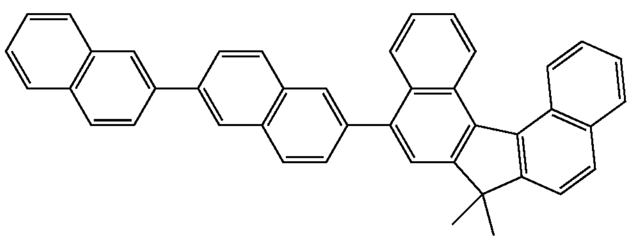
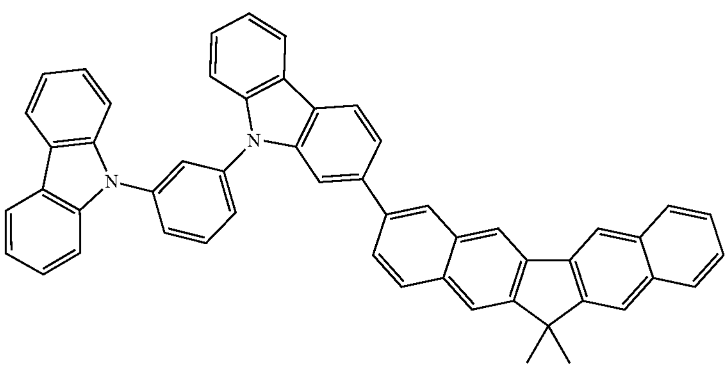
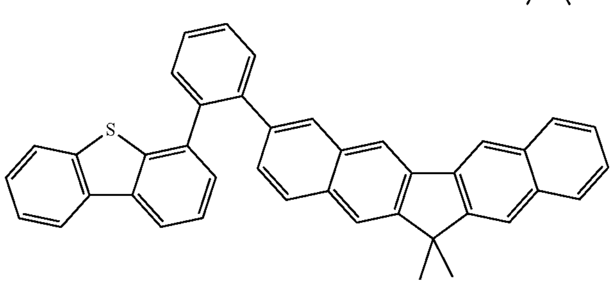

-continued
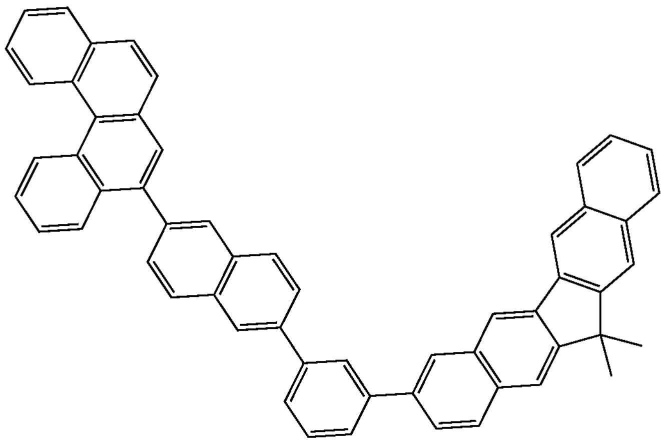
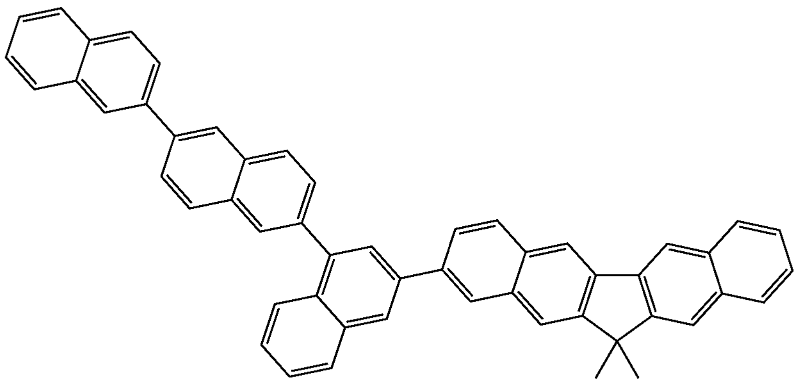
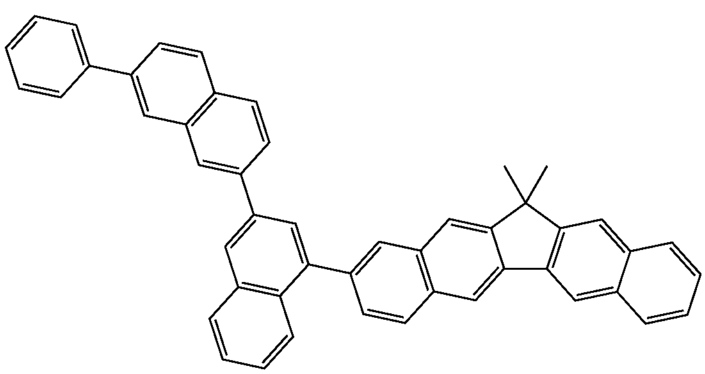
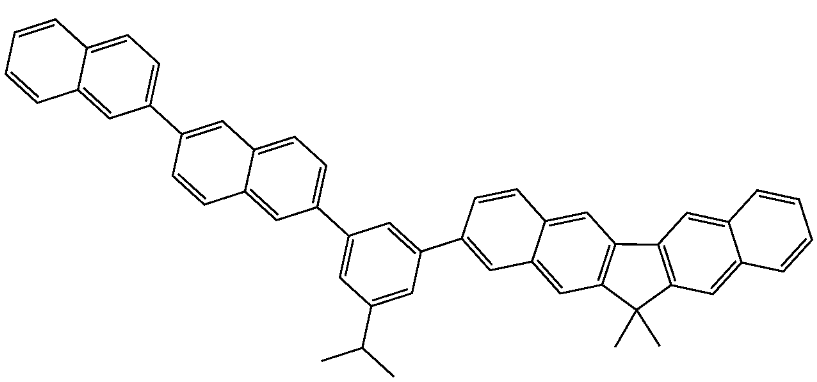

-continued
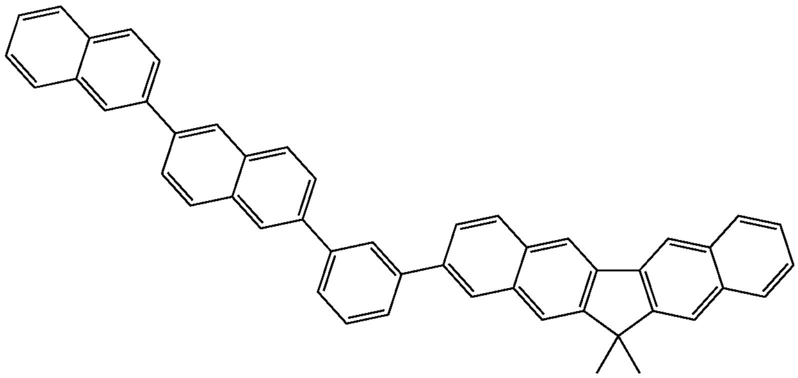
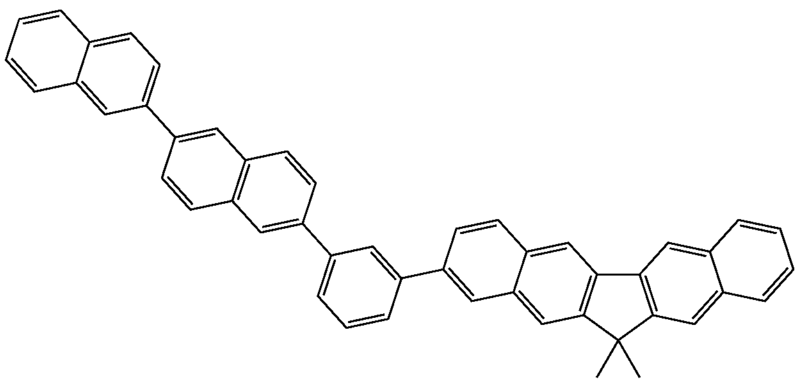
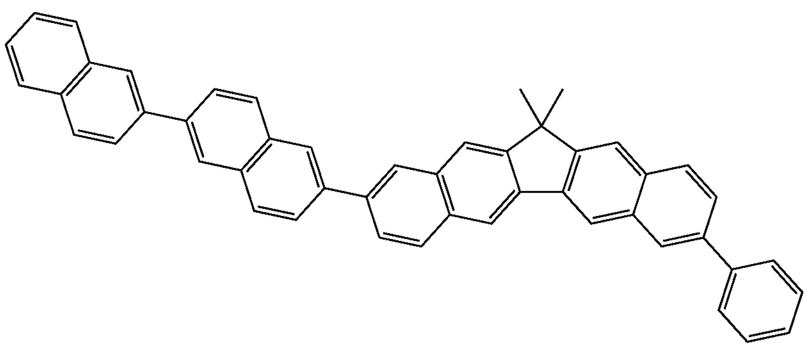
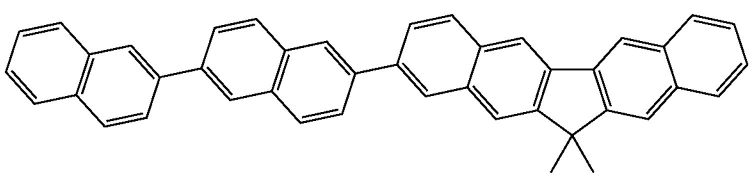
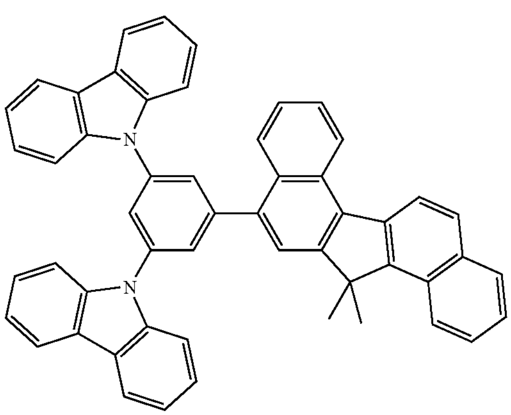
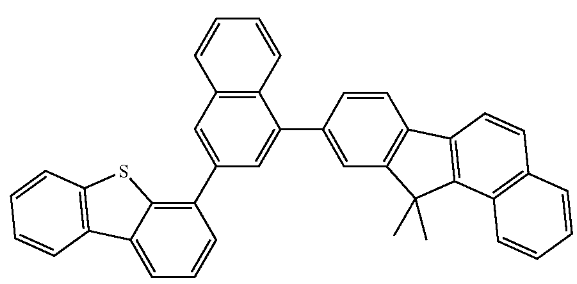

-continued
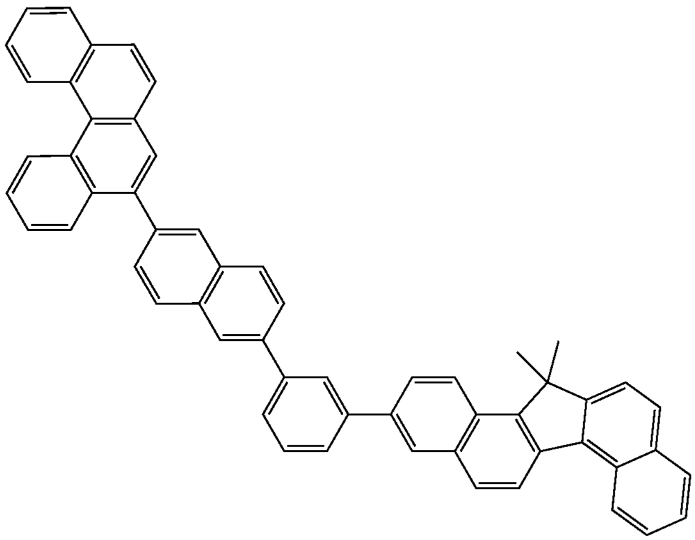
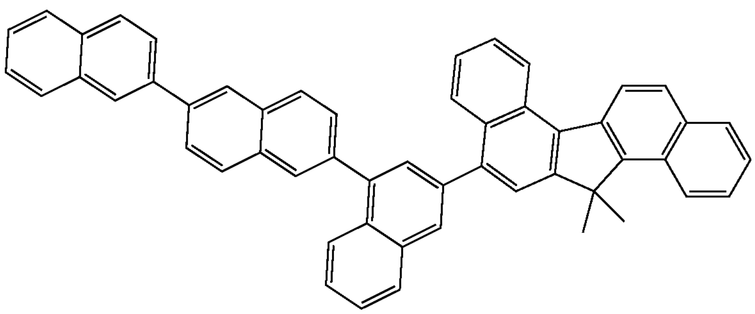
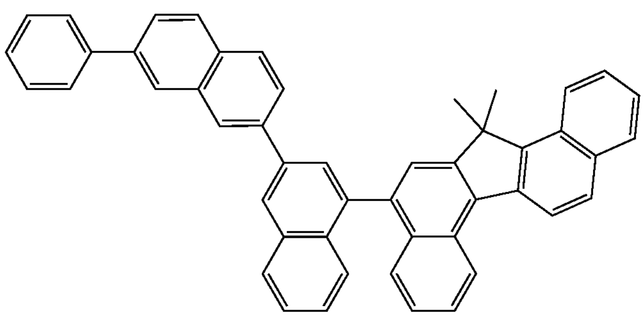
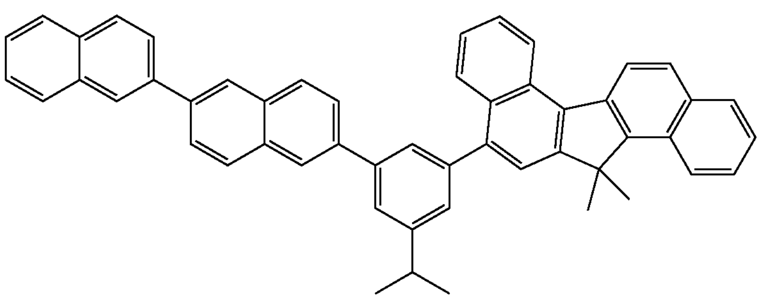
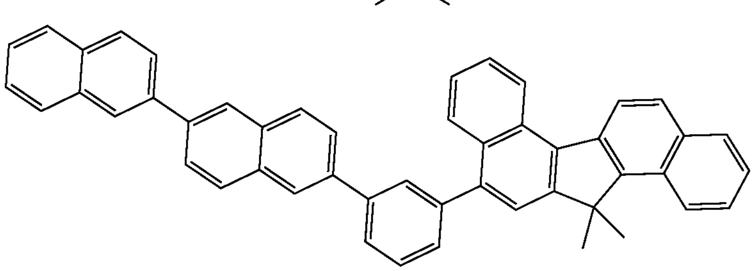

-continued
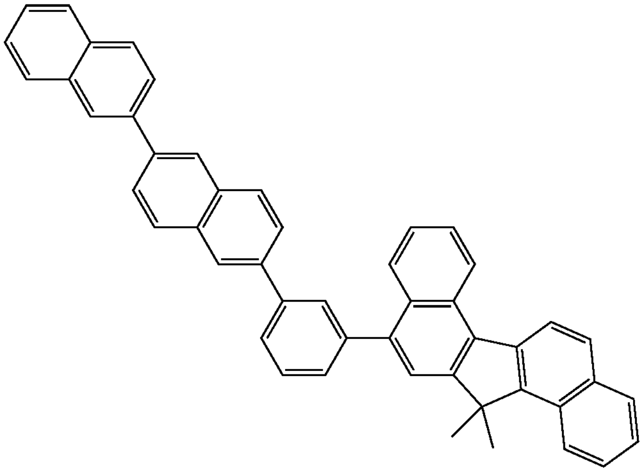
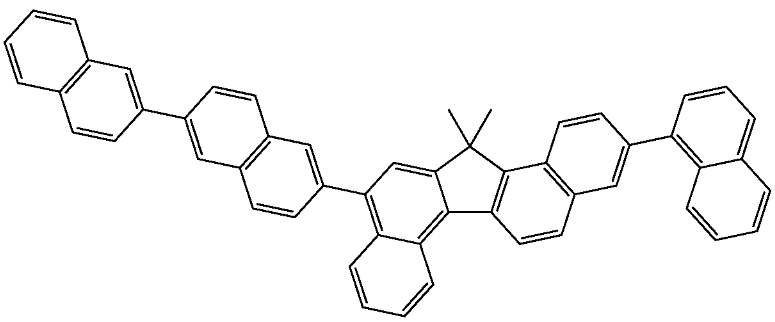
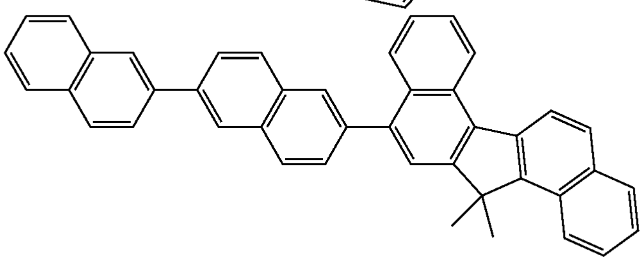
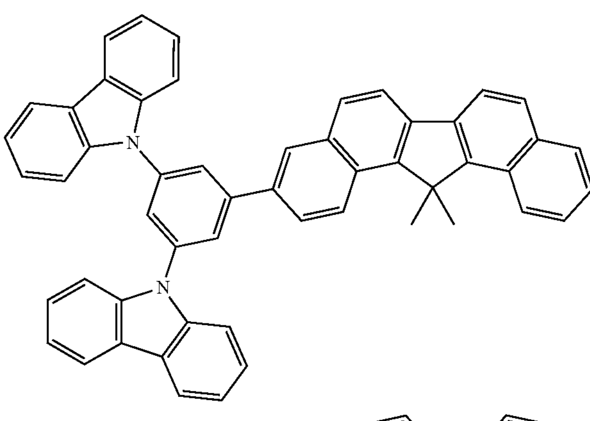
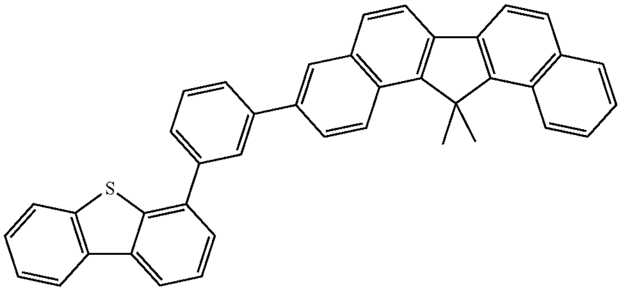

-continued
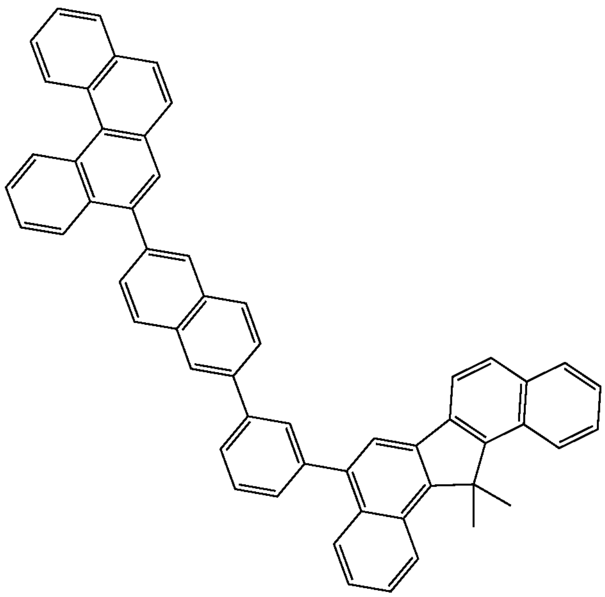
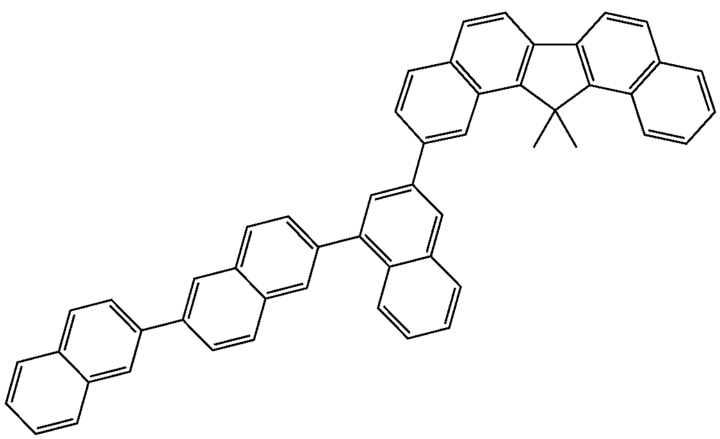
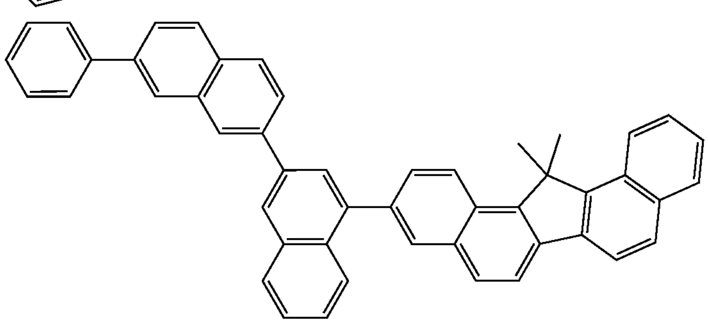
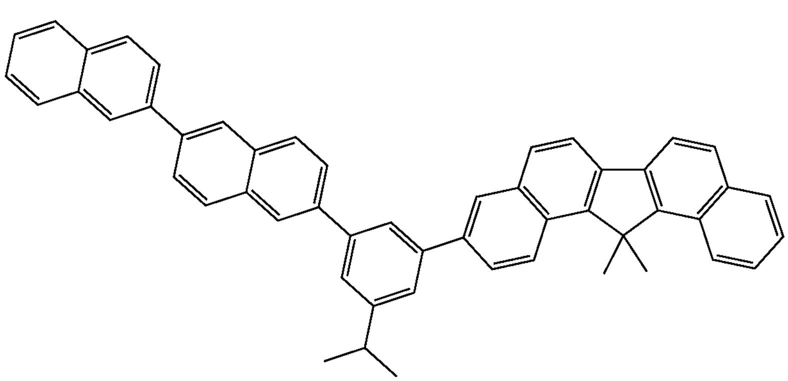

-continued
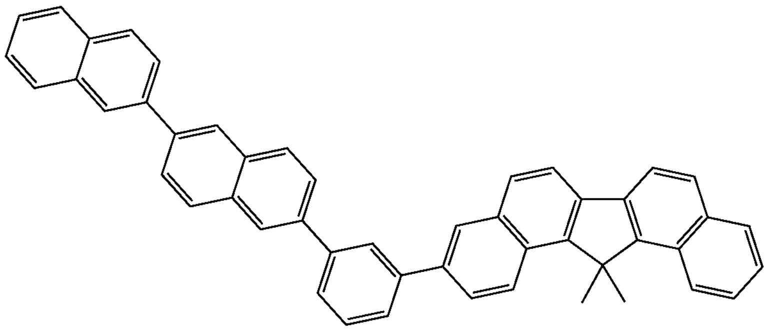
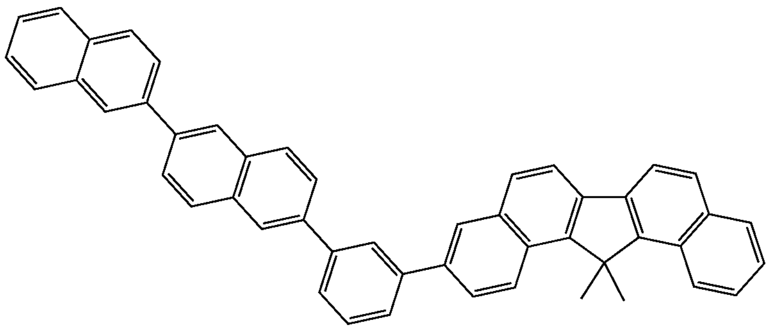
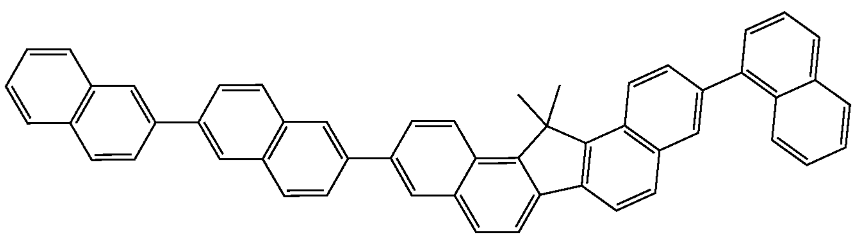
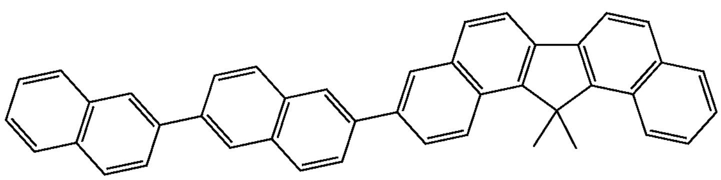
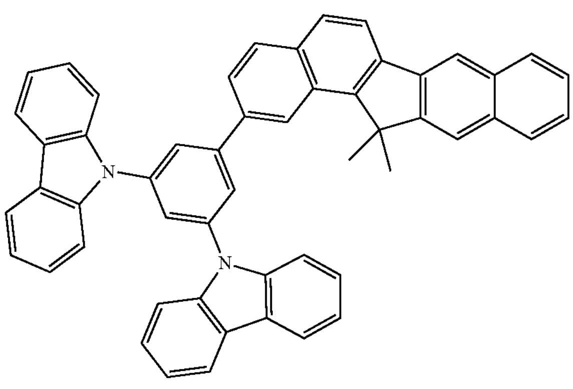
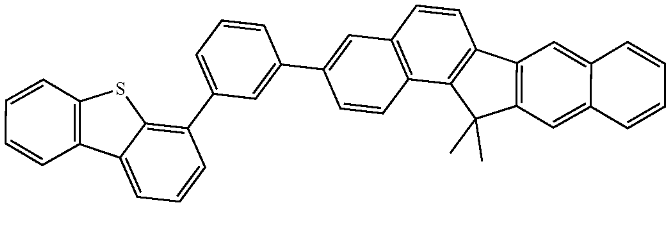

-continued
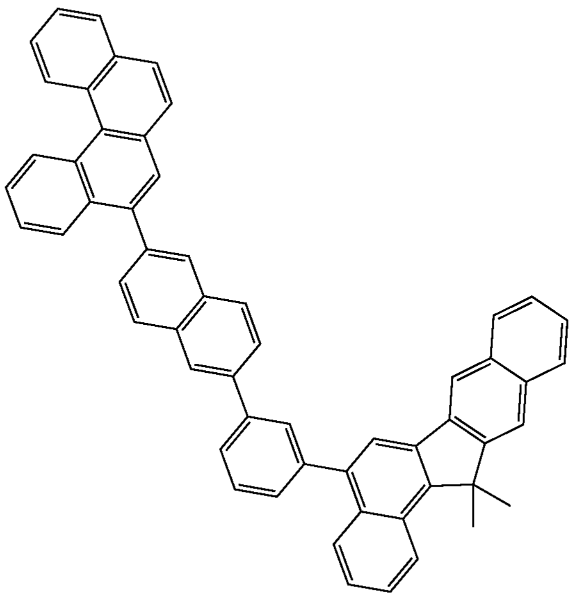
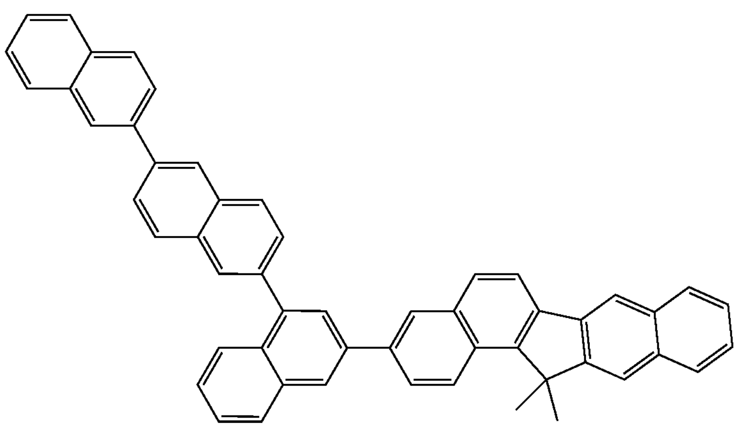
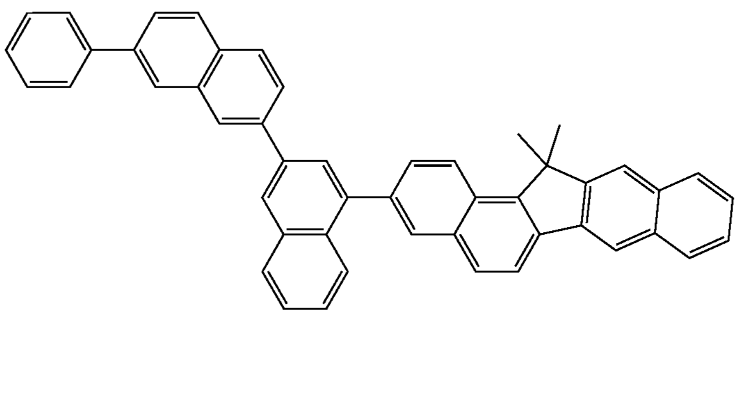

-continued
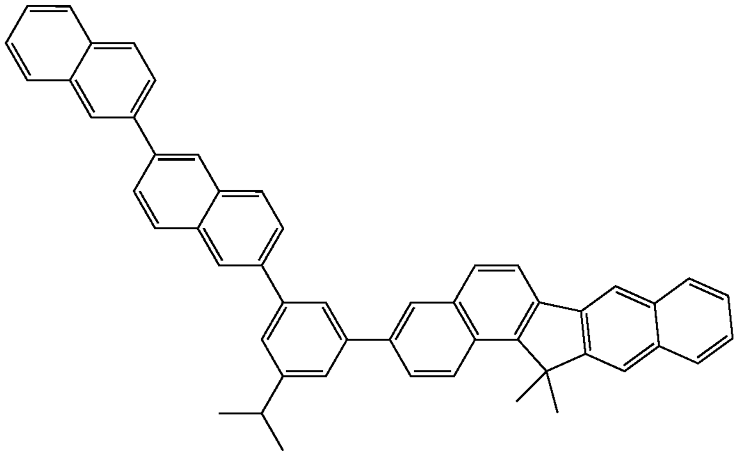
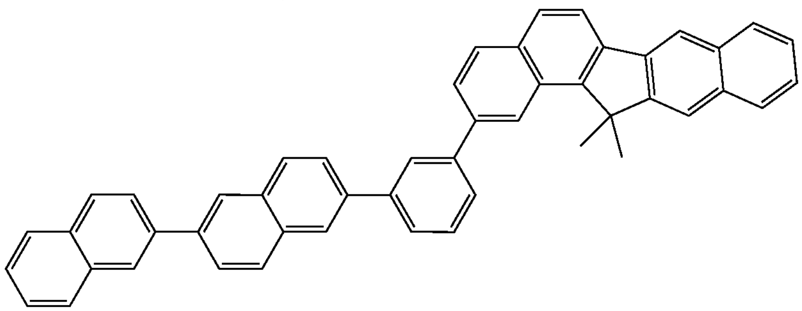
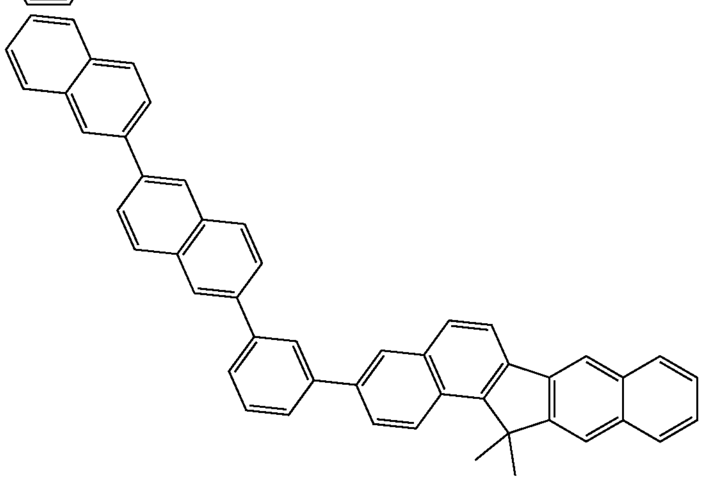
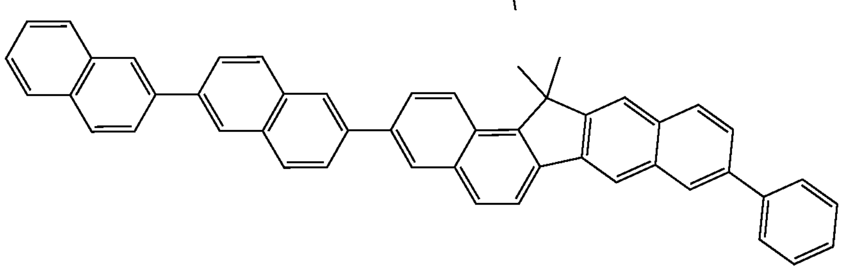
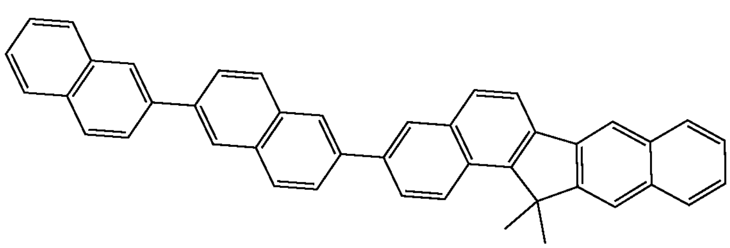

-continued
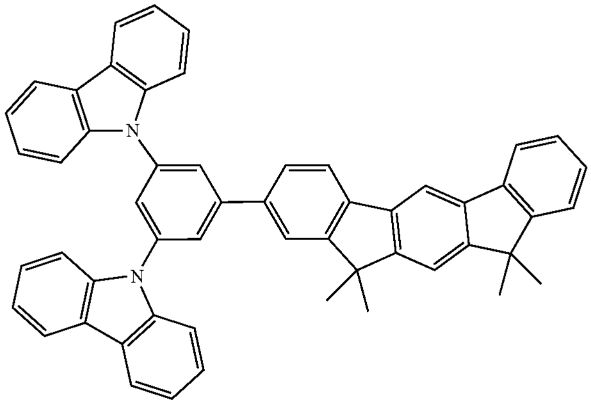
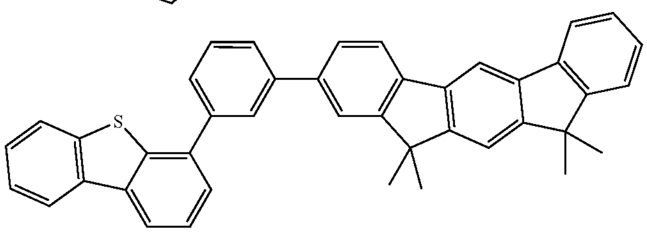
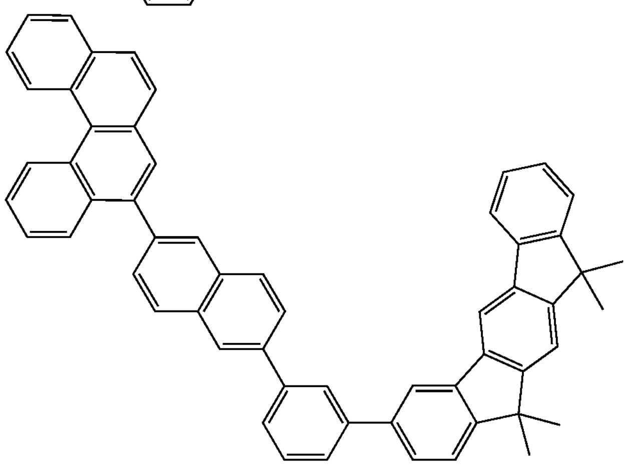
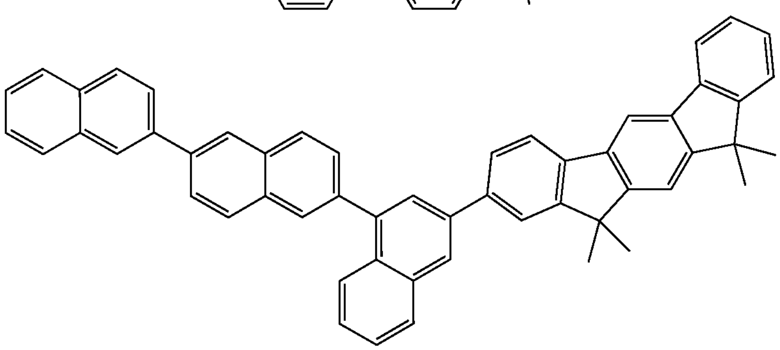
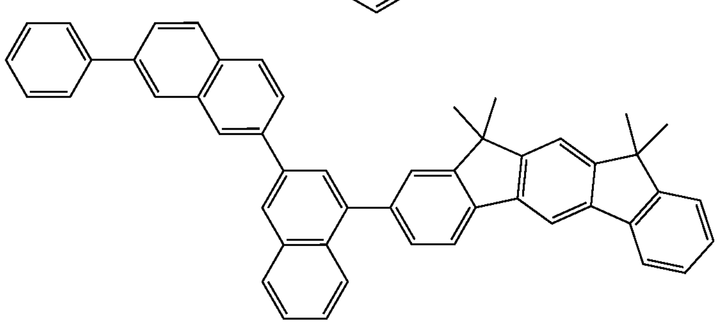

-continued
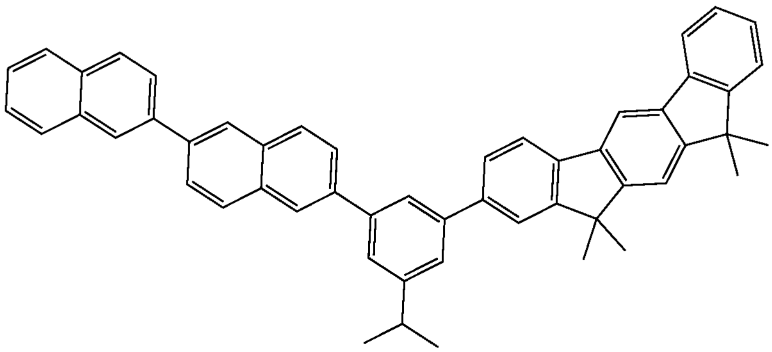
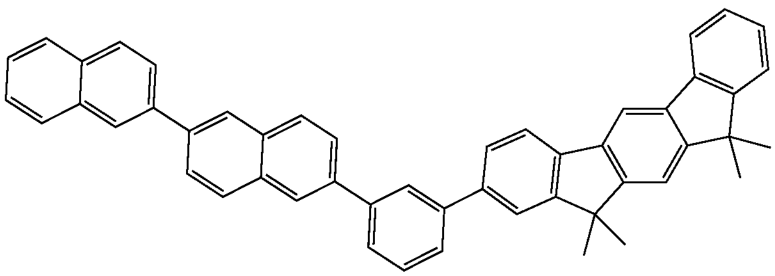
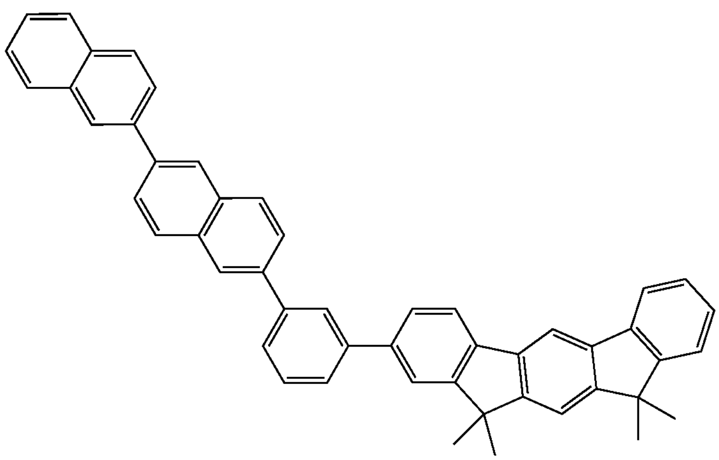
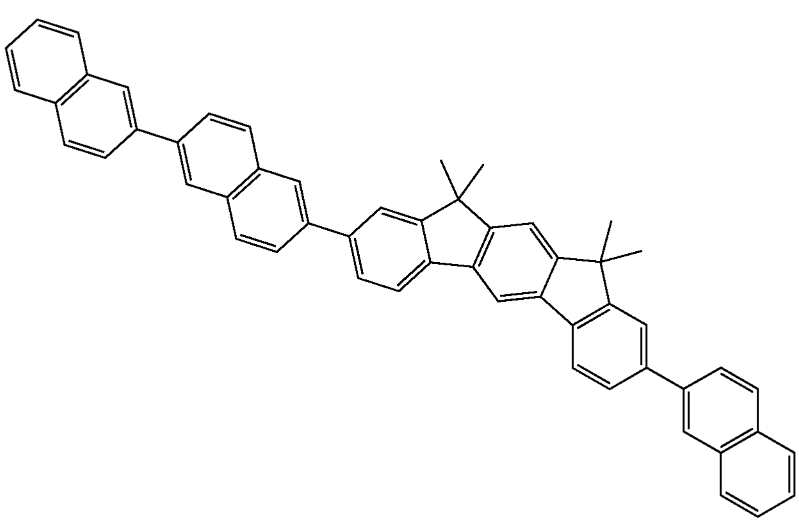

-continued
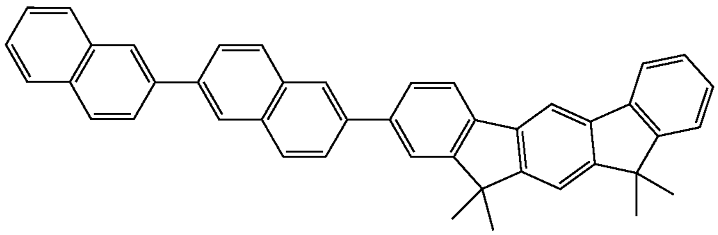
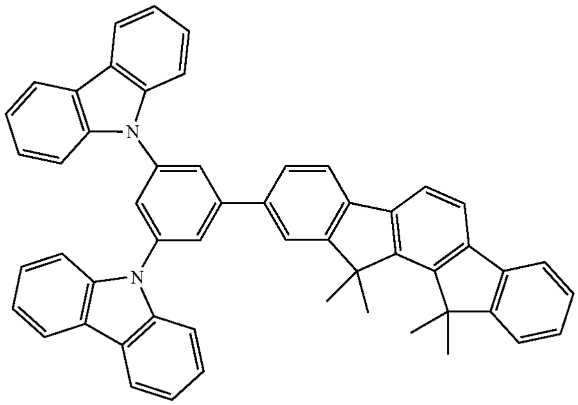
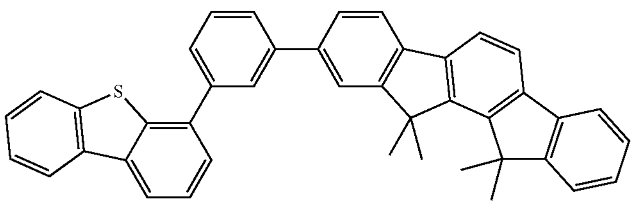
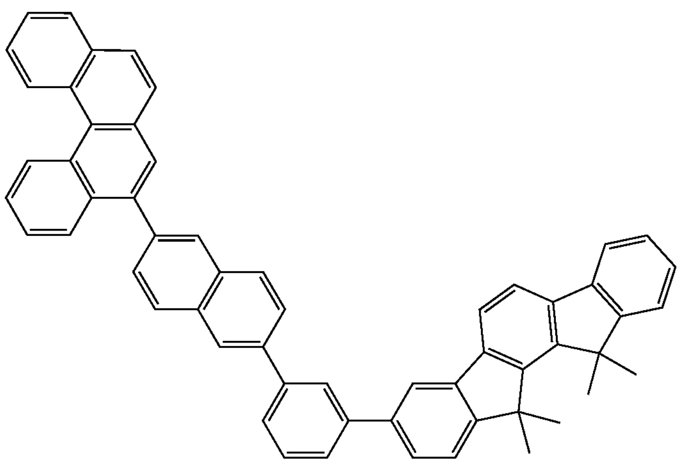
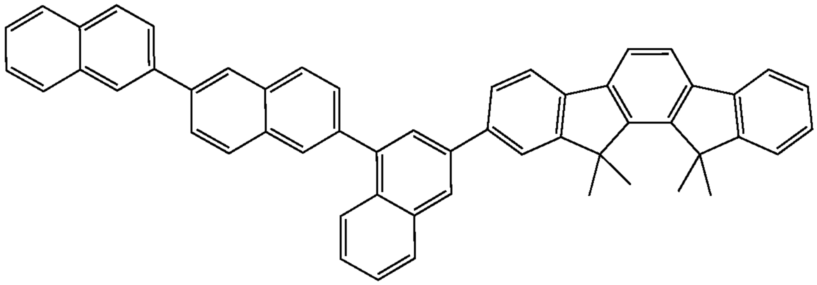

-continued
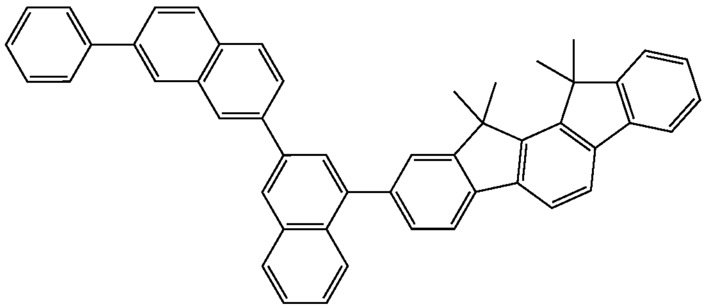
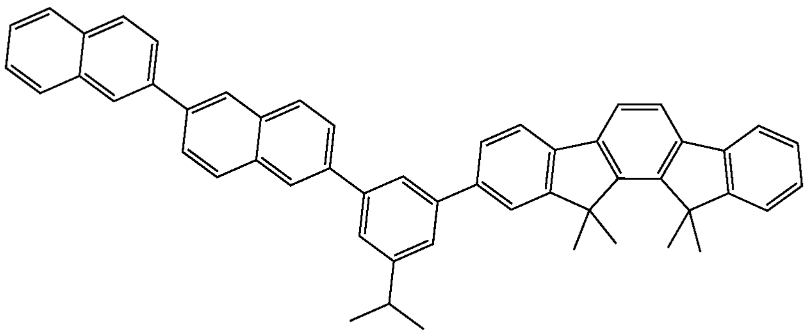
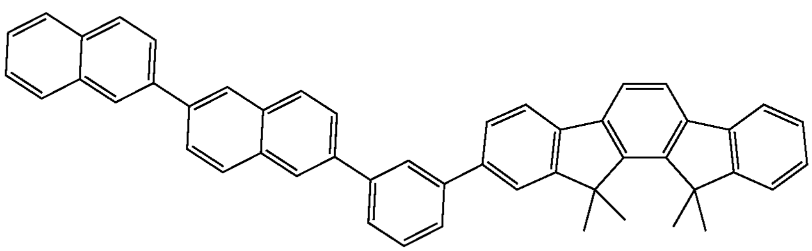
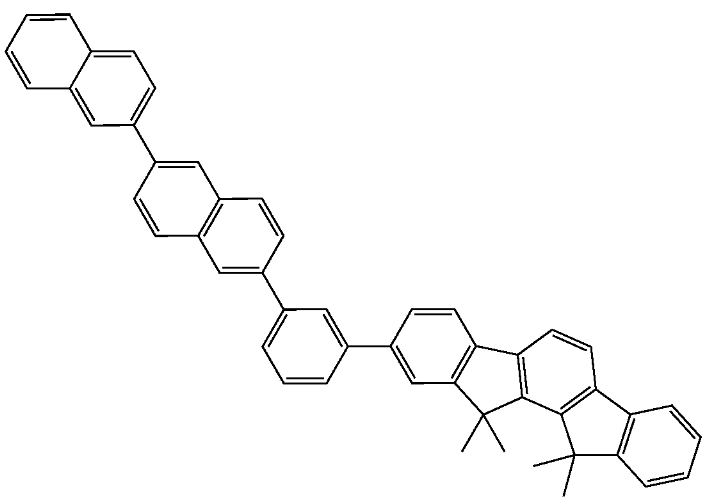
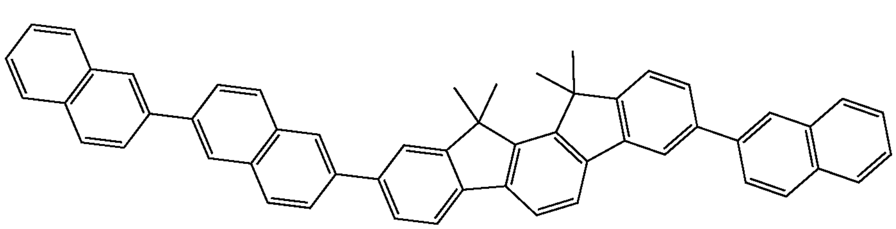

-continued
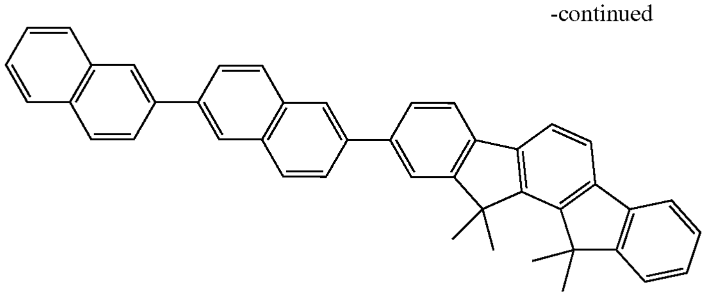
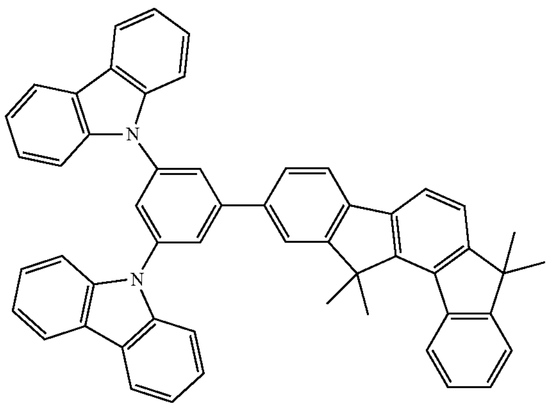
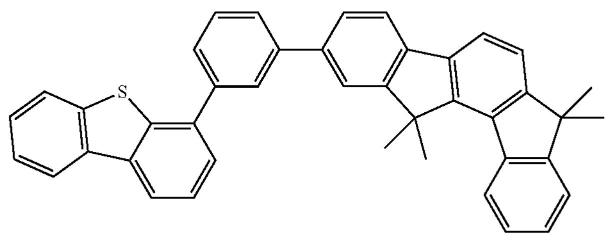
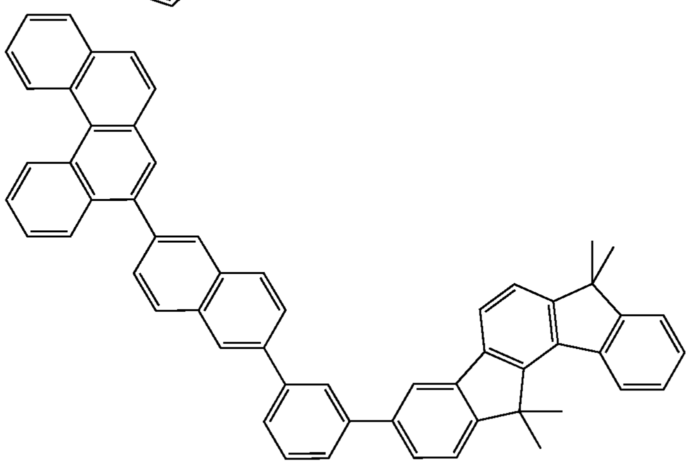
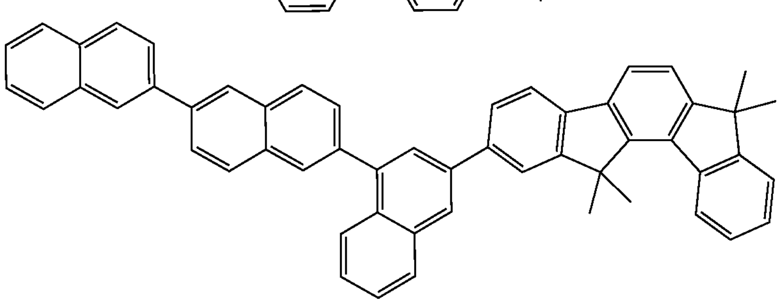
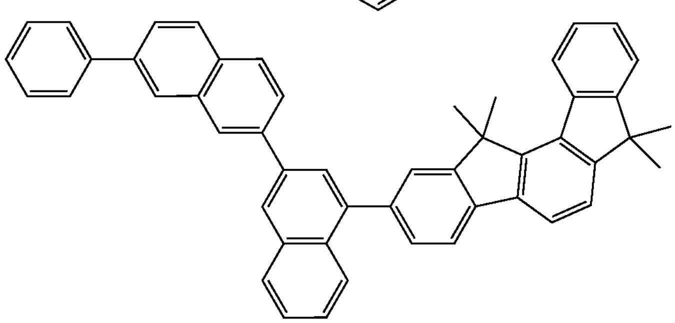

-continued
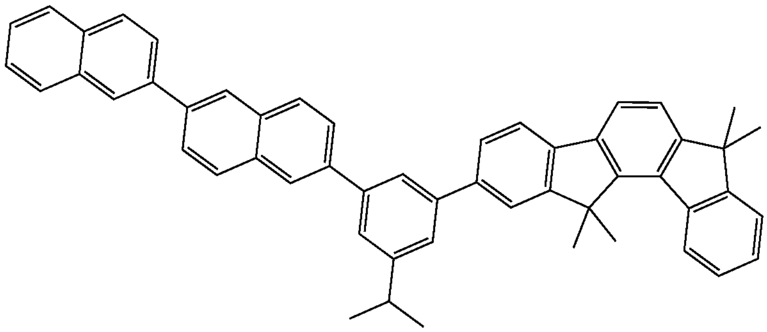
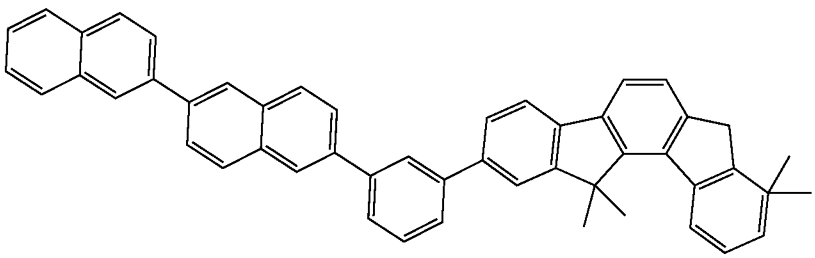
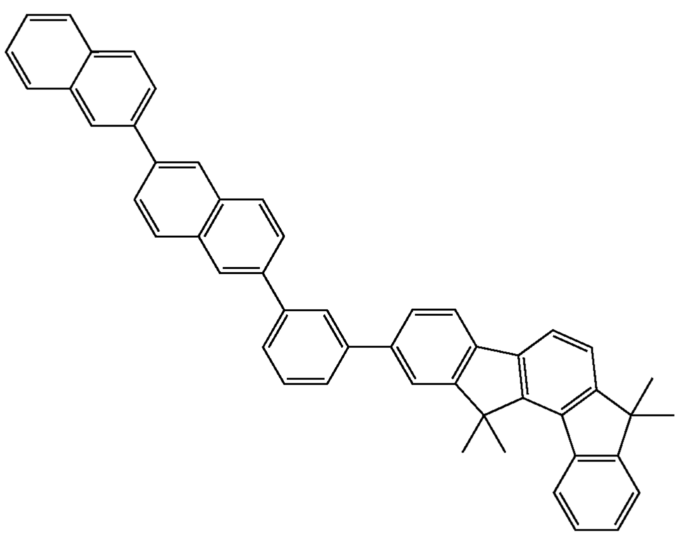
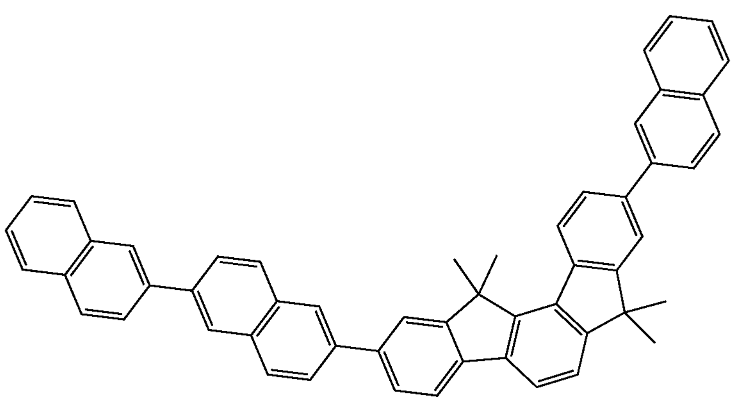

-continued
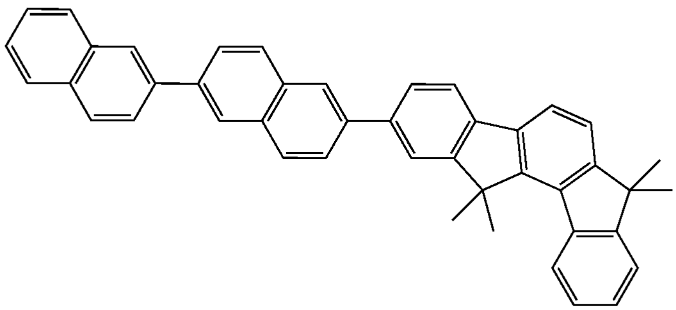
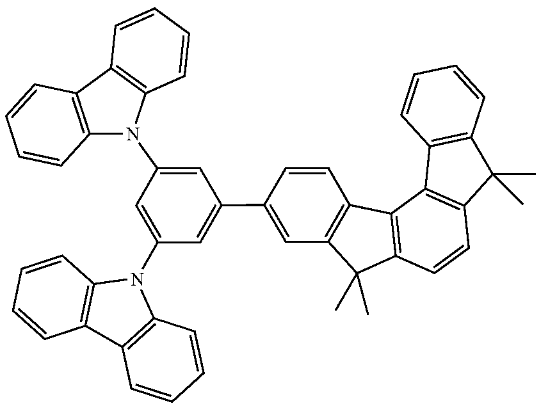
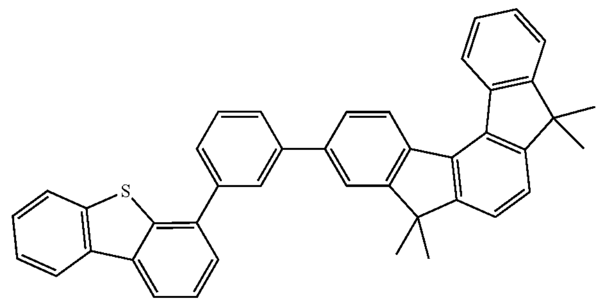
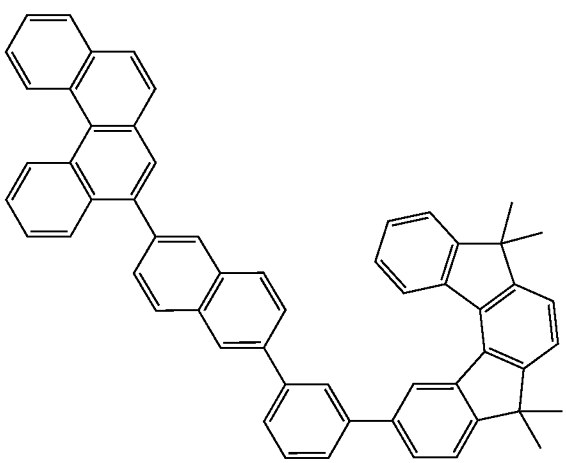
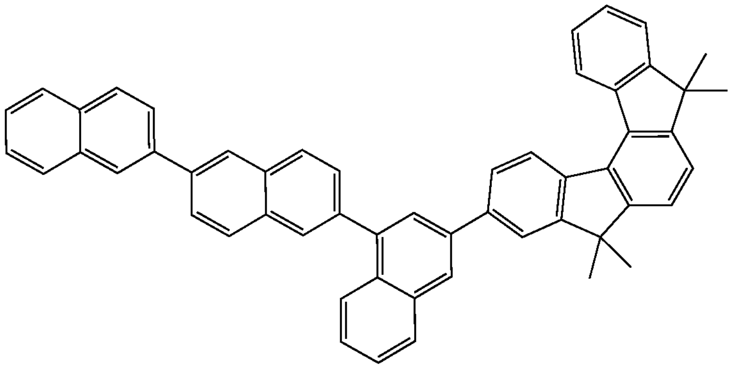

-continued
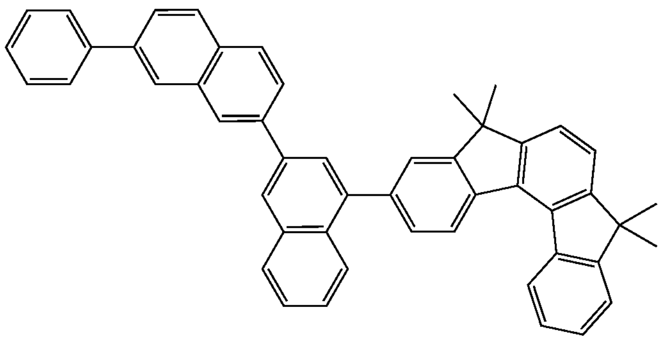
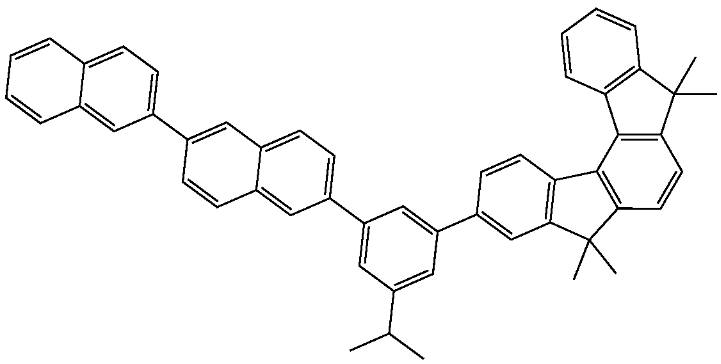
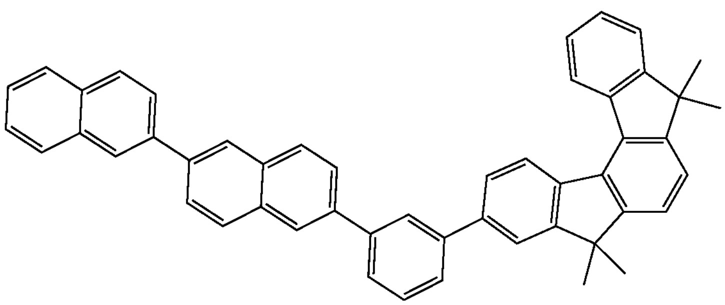
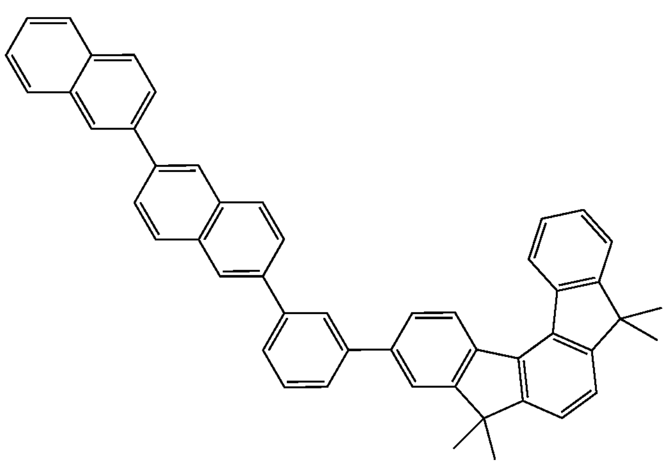

-continued
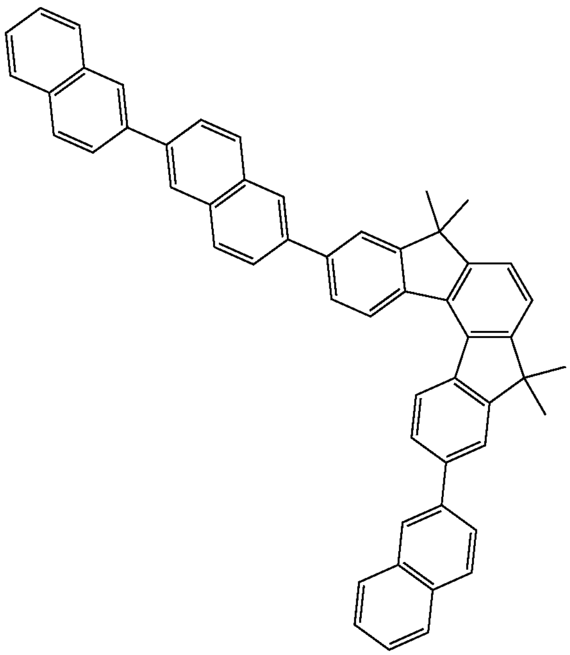
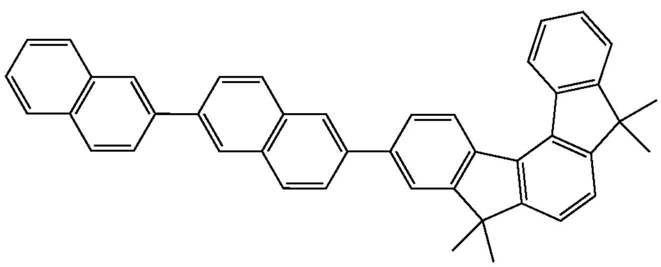
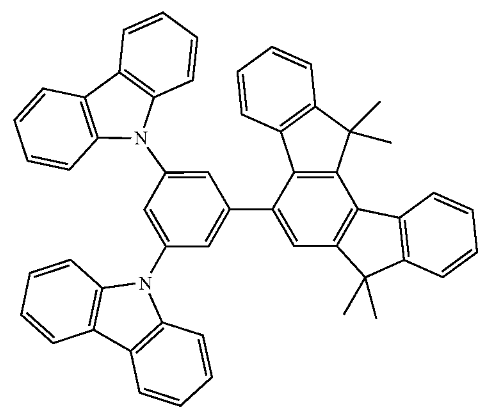
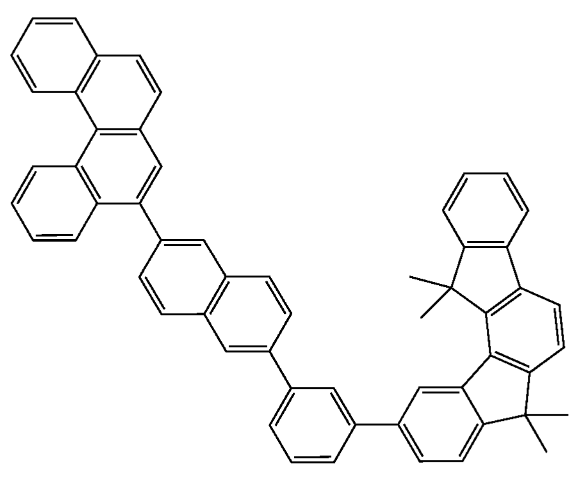
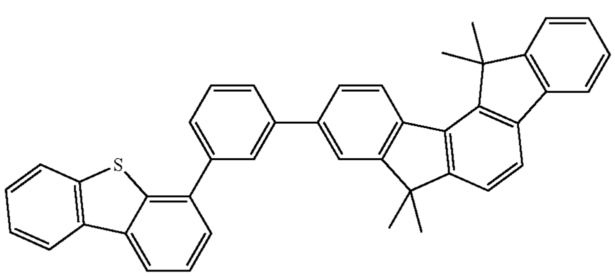

-continued
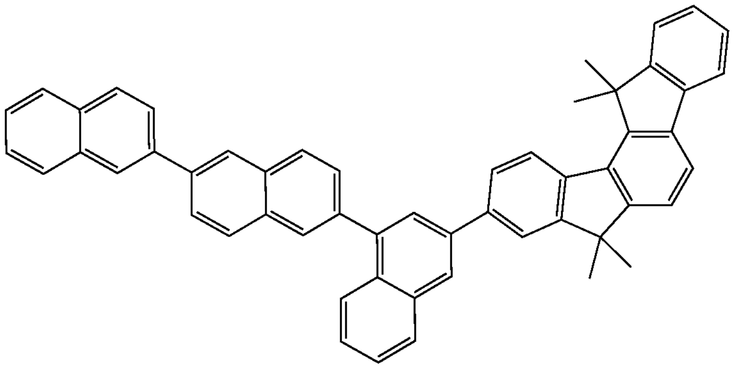
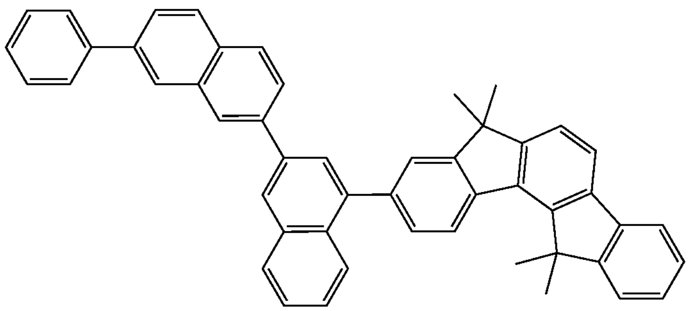
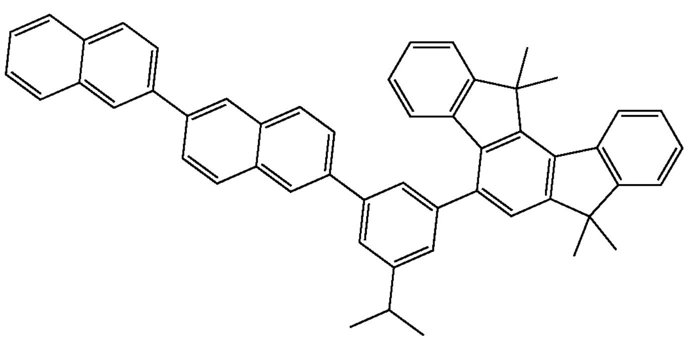
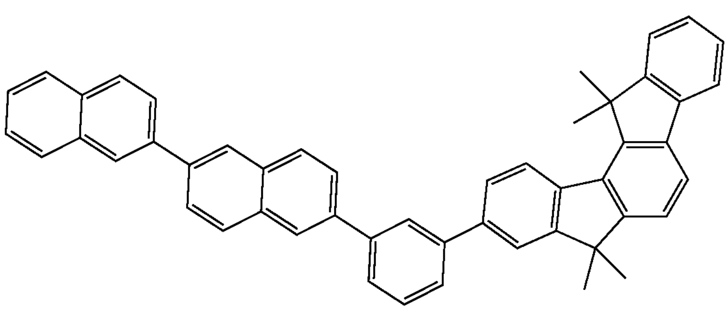

-continued
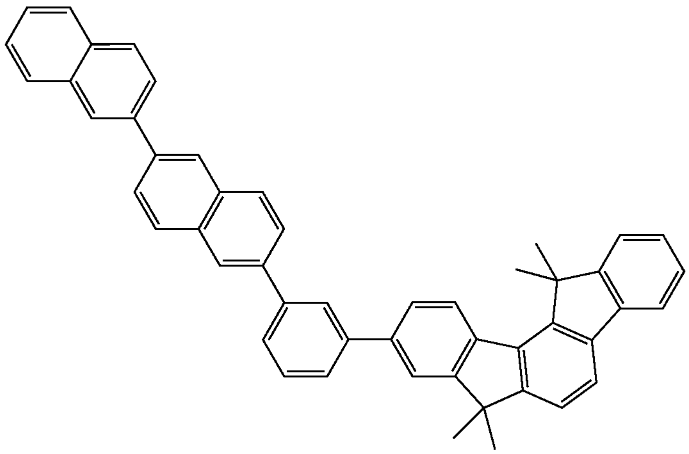
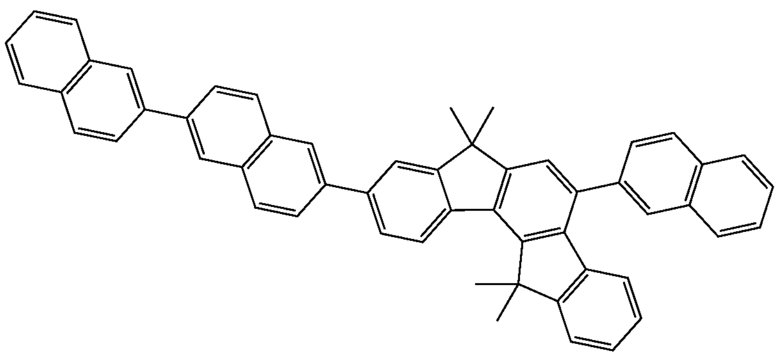
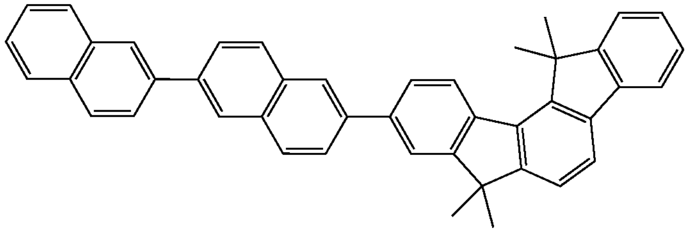
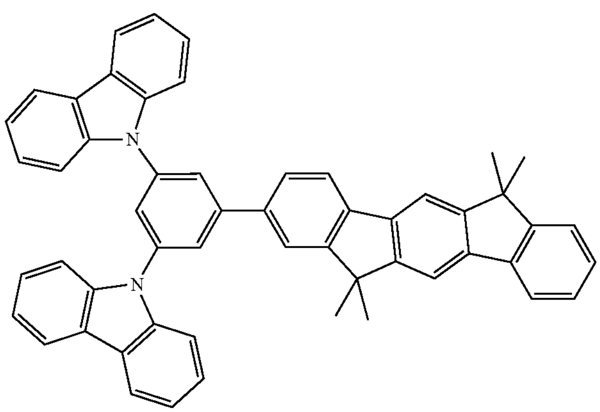
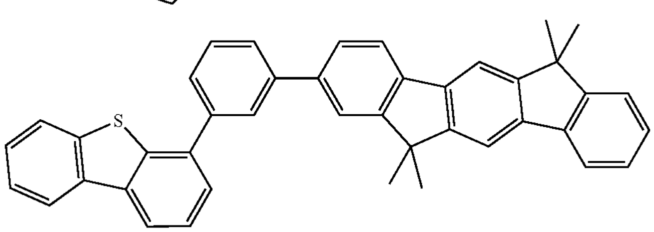

-continued
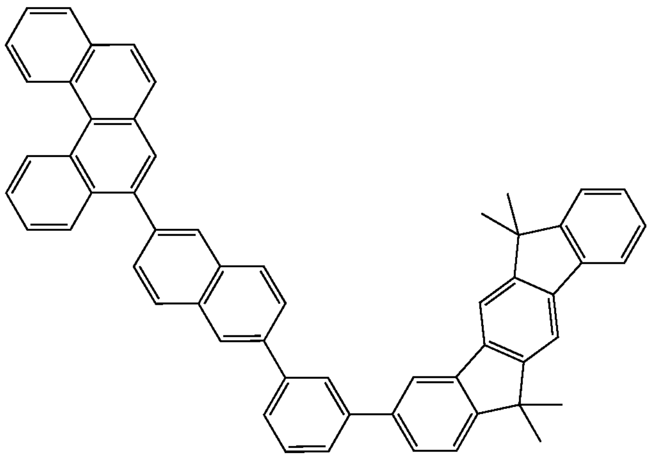
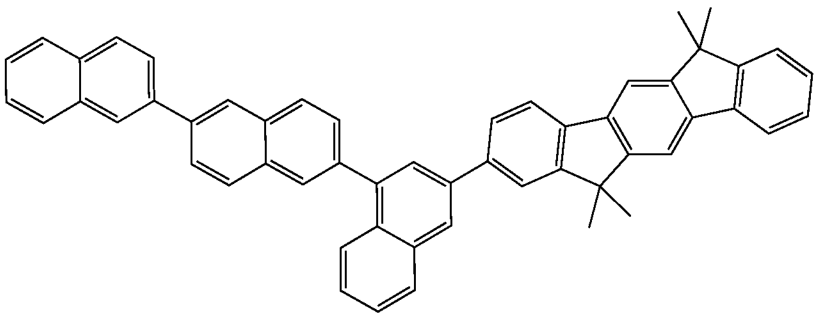
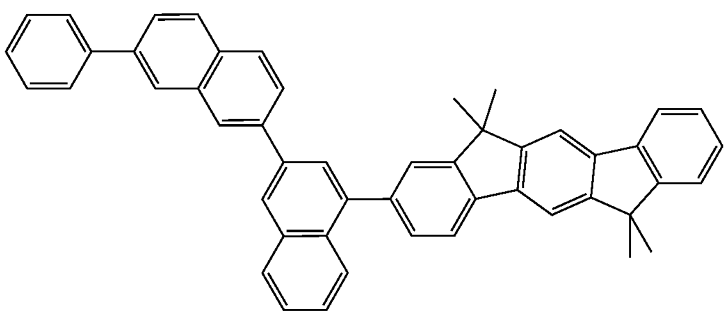
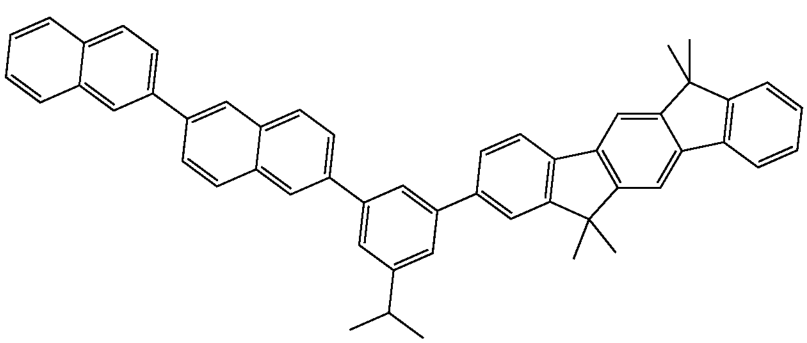
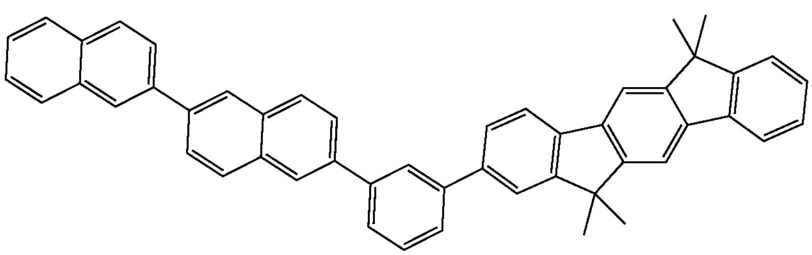

-continued
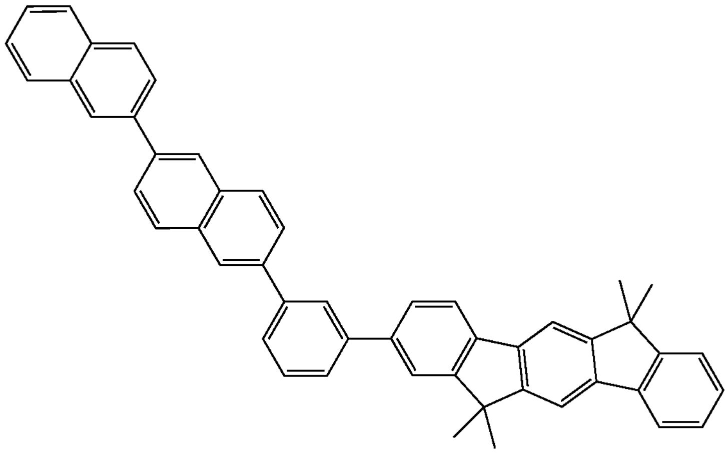
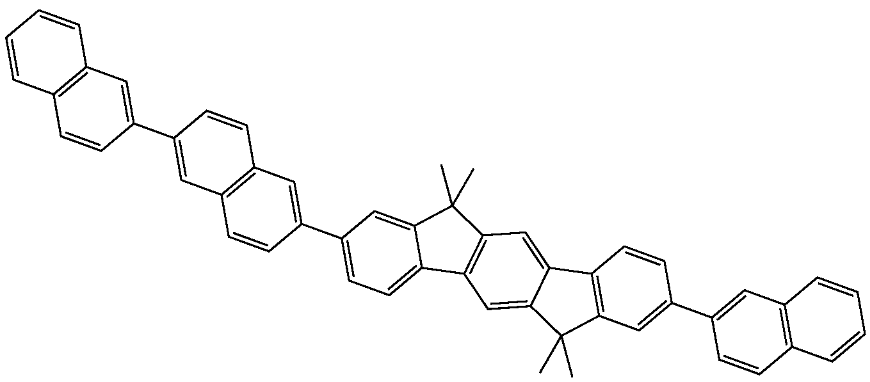
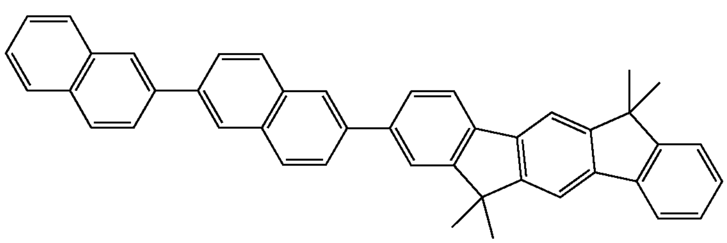
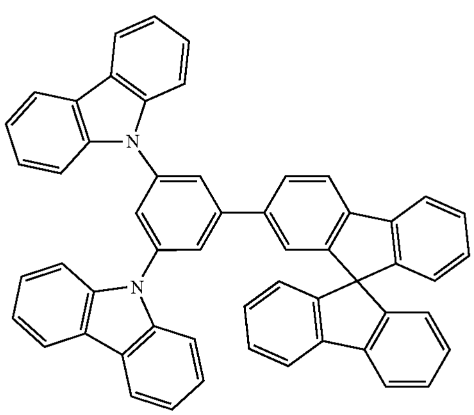
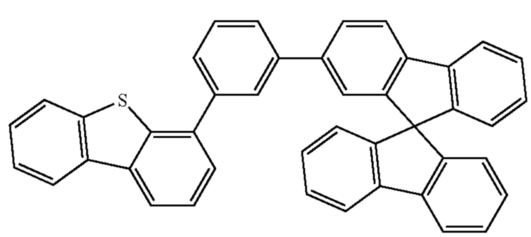

-continued
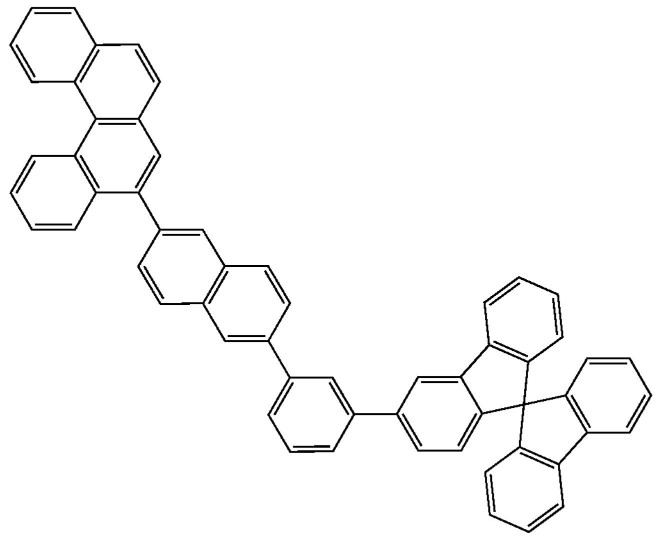
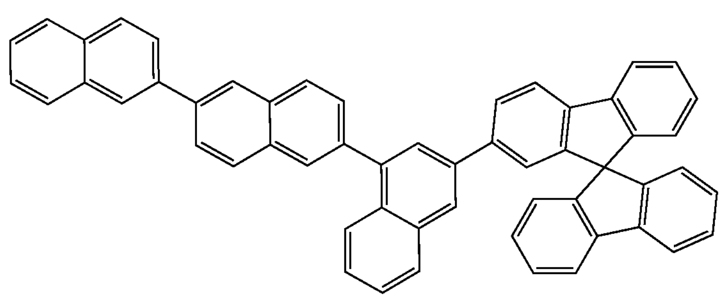
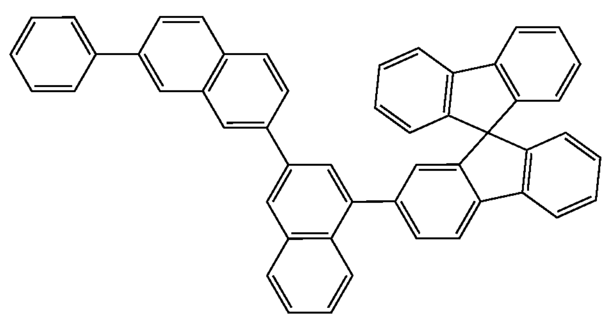
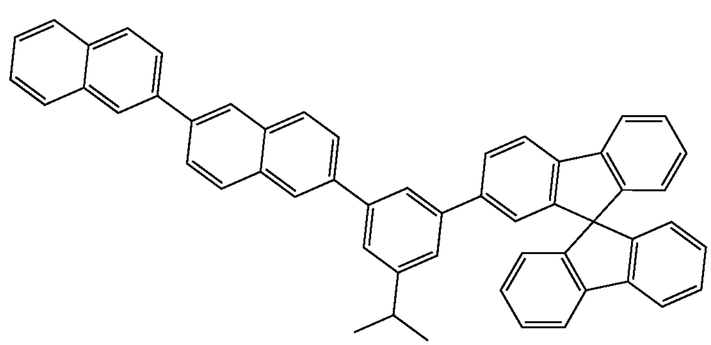

-continued
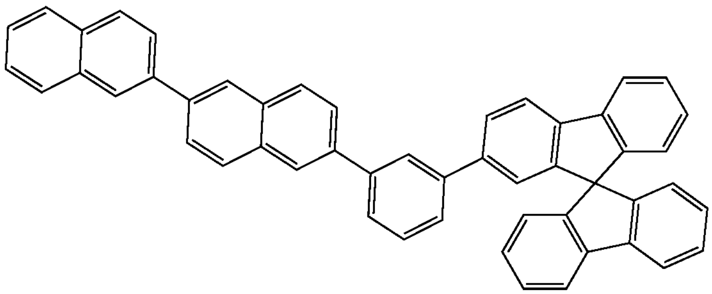
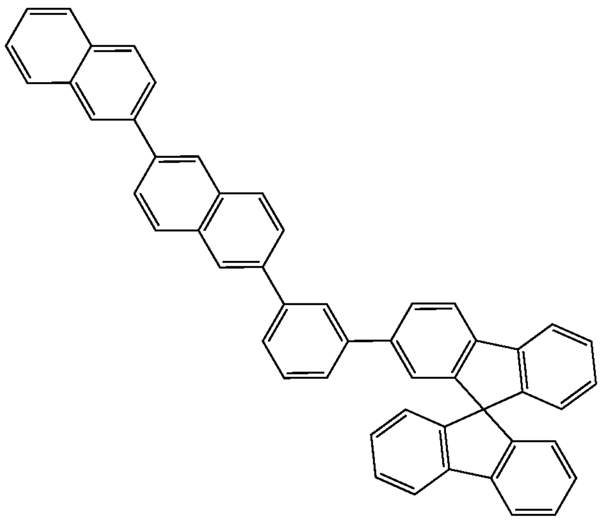
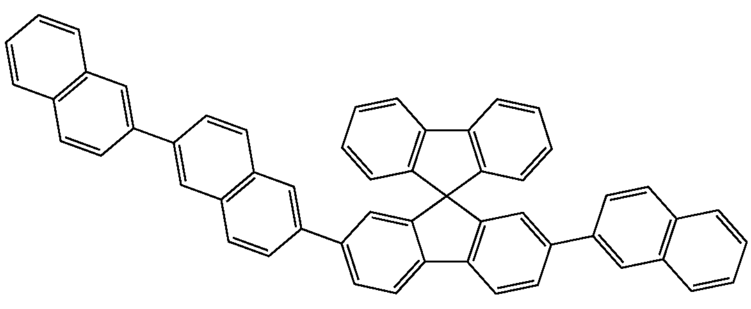
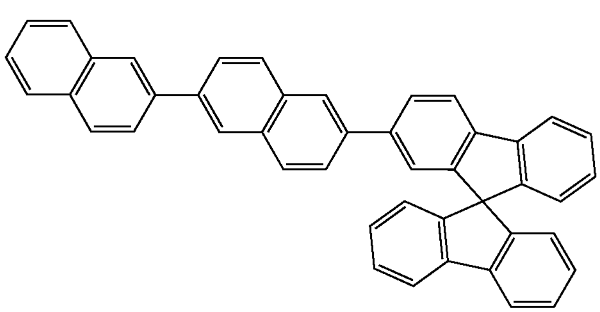
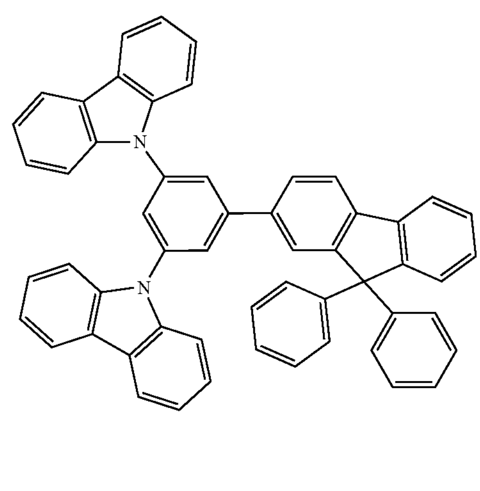

-continued
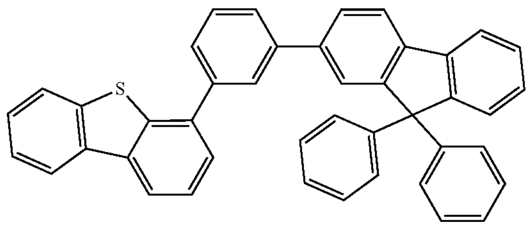
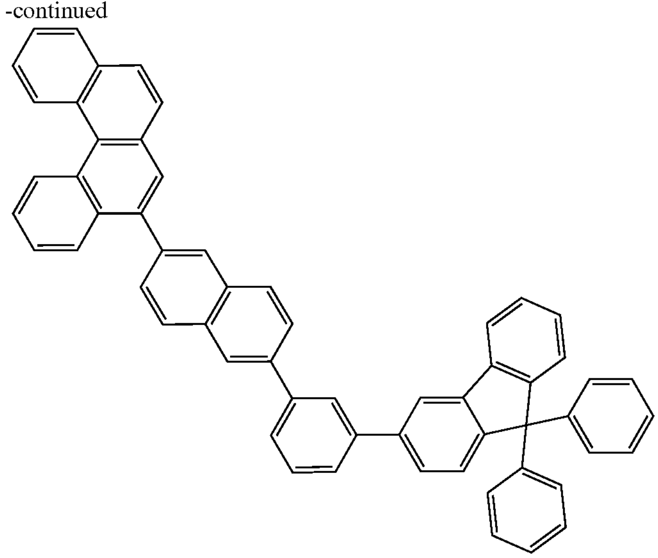
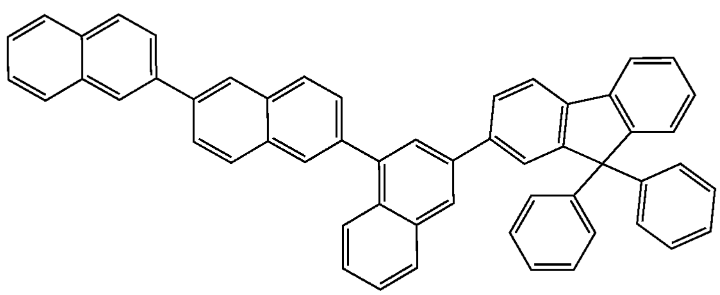
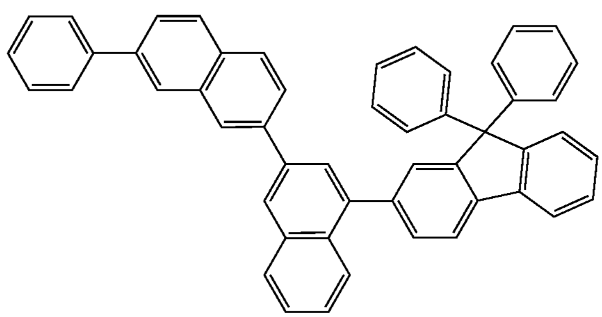
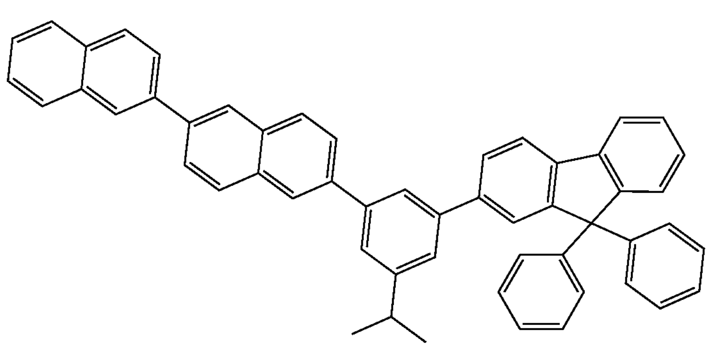

-continued
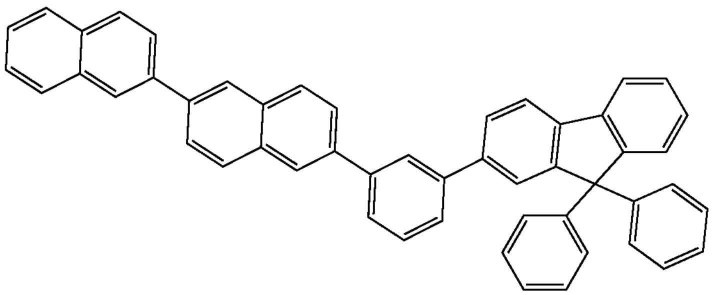
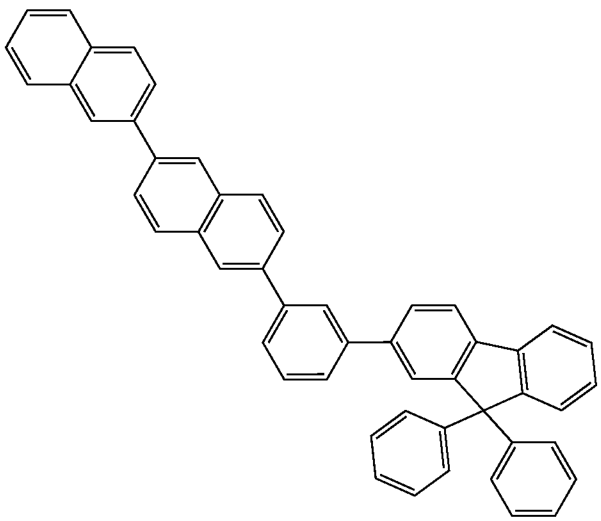
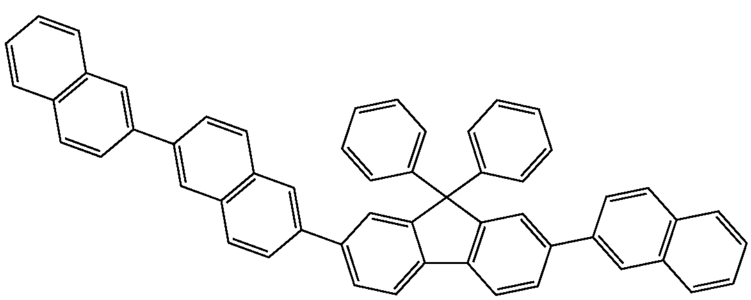
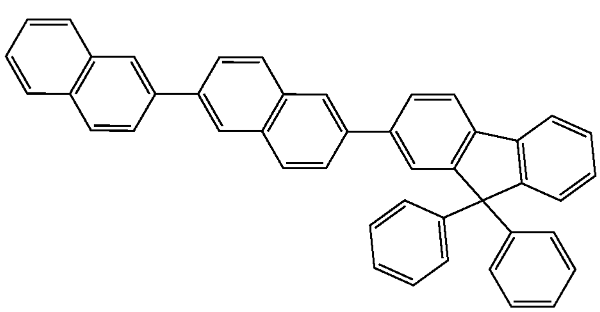

In another example embodiment, the Host I may be selected from Compounds H-1a to H-12a below, but the Host I is not limited thereto:
H-1a
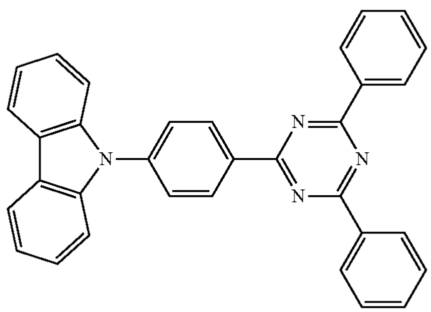
H-2a
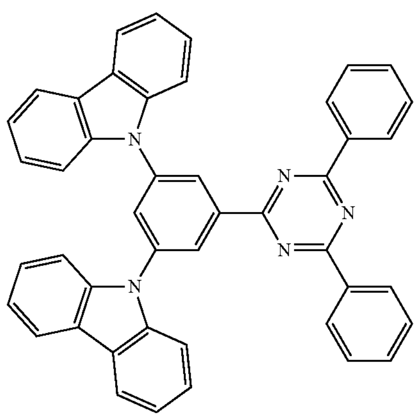
H-3a
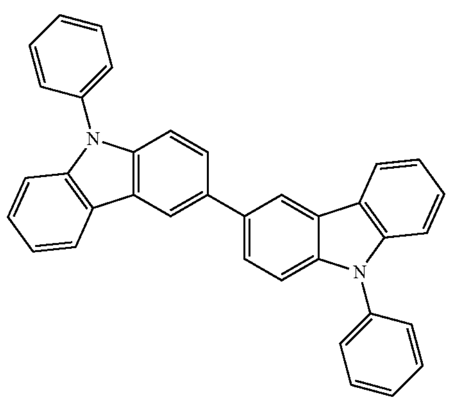
-continued
H-4a
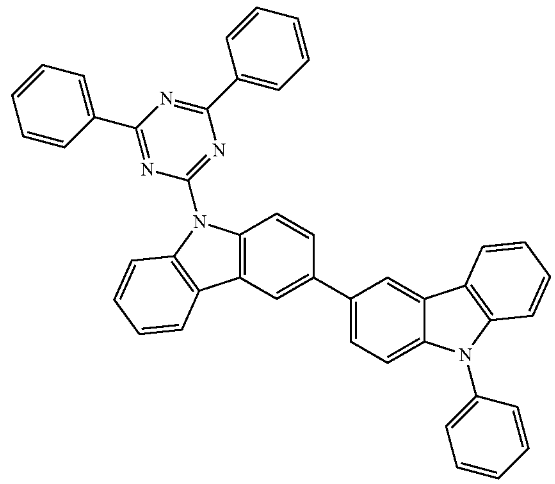
H-5a
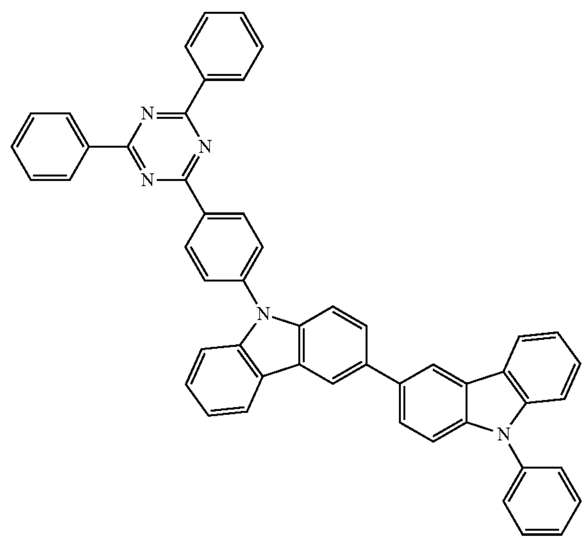
H-6a
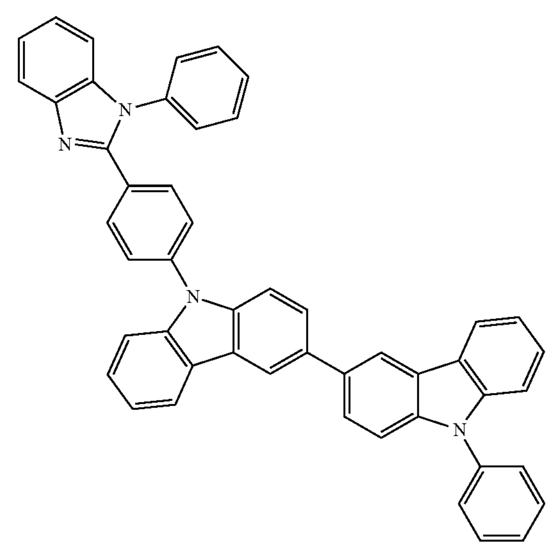

-continued
H-7a
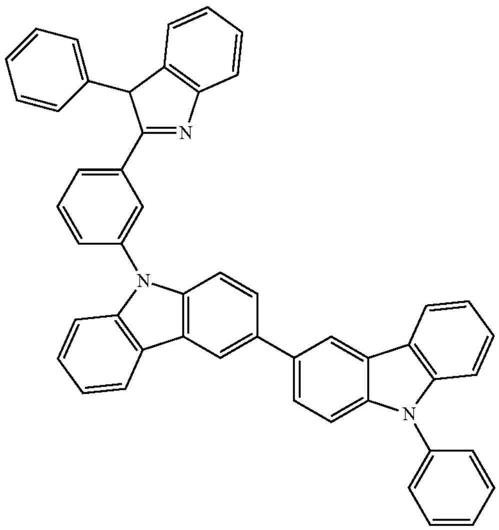
H-8a
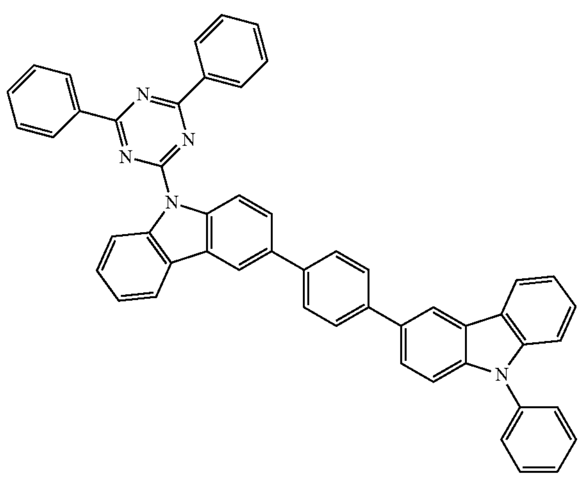
H-9a
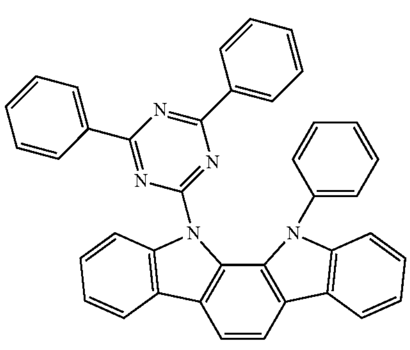
-continued
H-10a
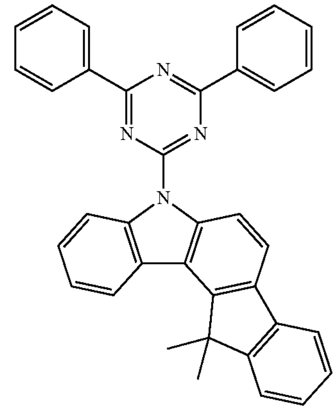
H-11a
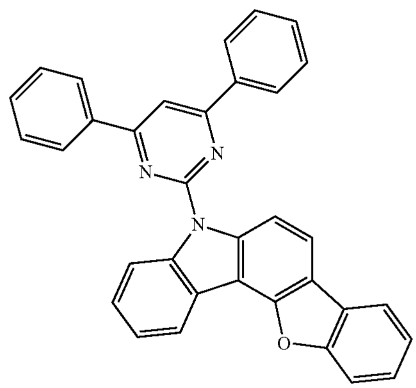
H-12a
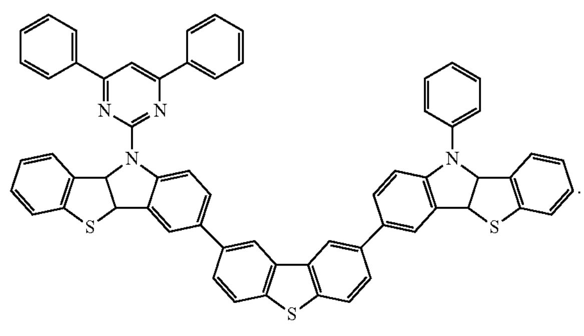
In another example embodiment, the Host I may be selected from Compounds H-1b to H-12b below, but the Host I is not limited thereto:

H-1b
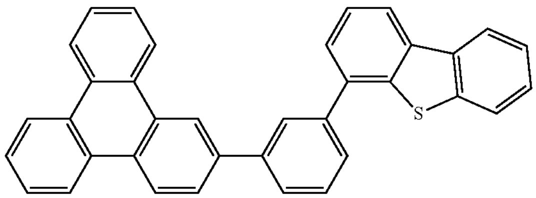
H-2b
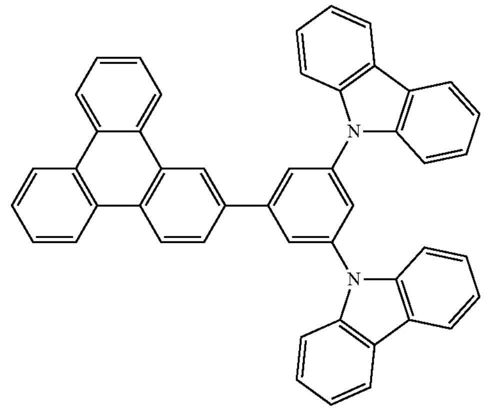
H-3b
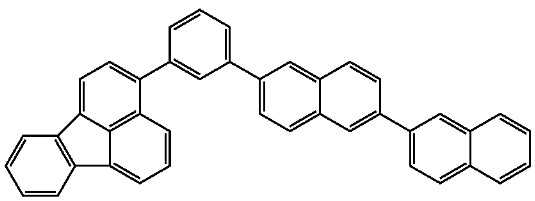
H-4b
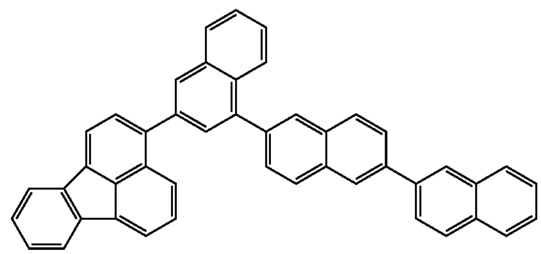
H-5b
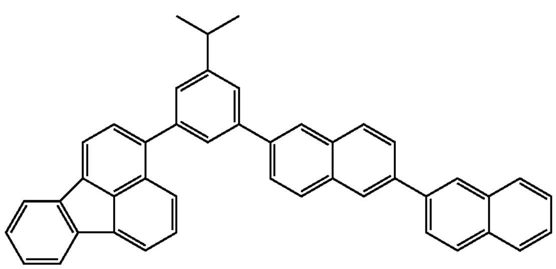
H-6b
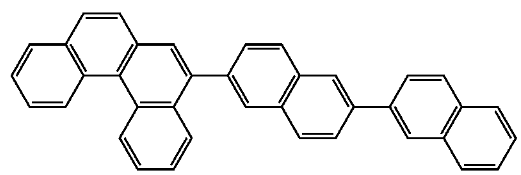
H-7b
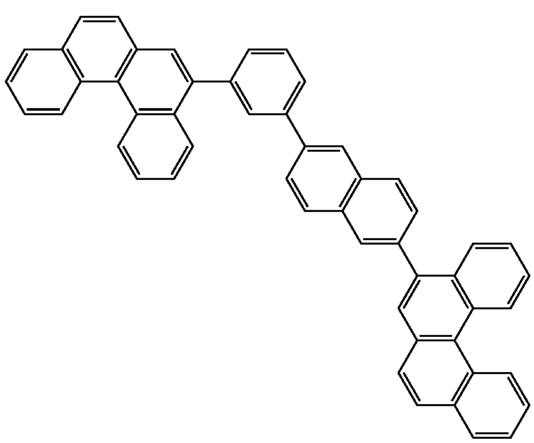
H-8b
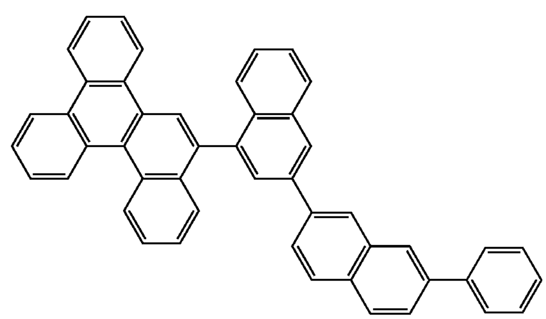

-continued

H-9b

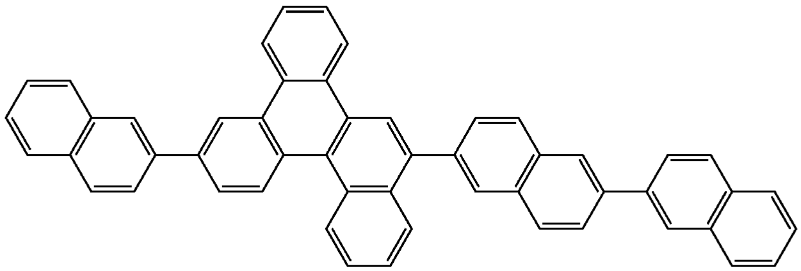

H-10b

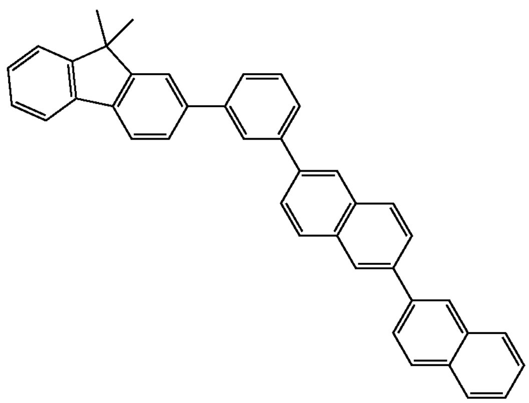

H-11b

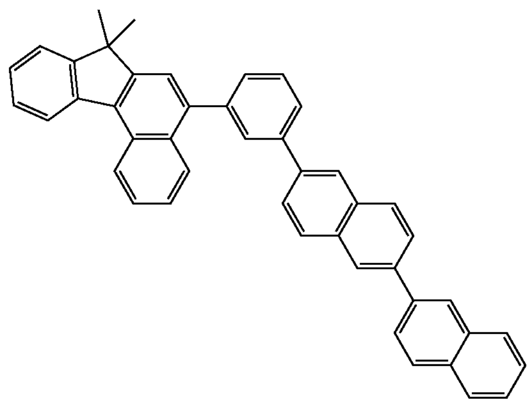

H-12b

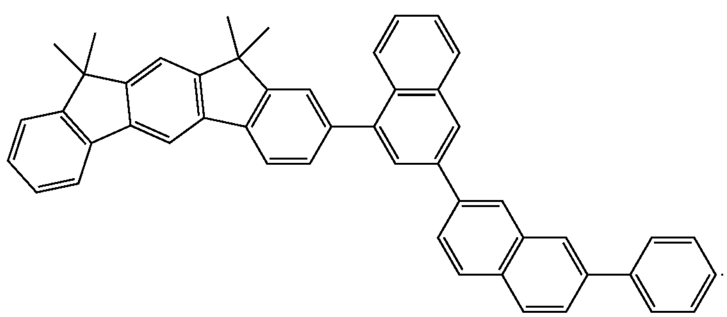

For example, the Host I may have a triplet energy gap of 2.1 eV or more, but the Host I is not limited thereto. When the Host I has a triplet energy gap of 2.1 eV or more, the Host I may have an excited state of triplet excitons of the EML in an efficient manner.

The EML may further include a Host II, and the Host II may be different from Host I, but the Host II is not limited thereto.

For example, the Host II may be selected from compounds below, but the Host II is not limited thereto:

AH-1

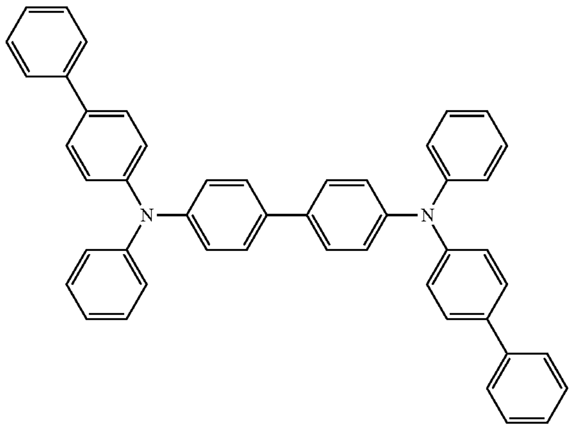

AH-2

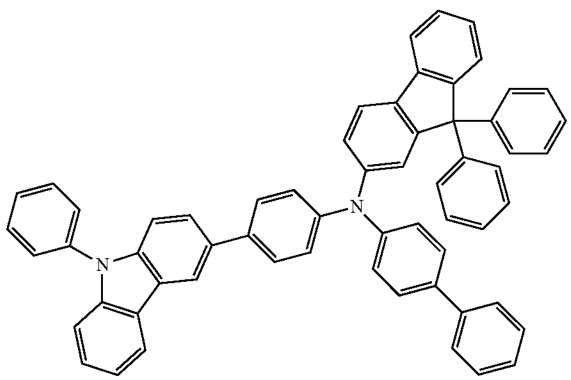

AH-3

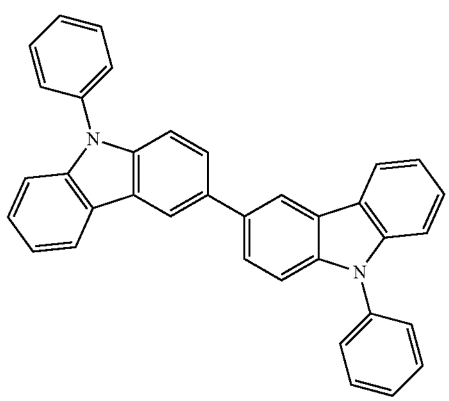

AH-4

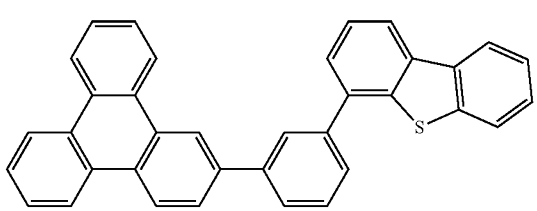

-continued

AH-5

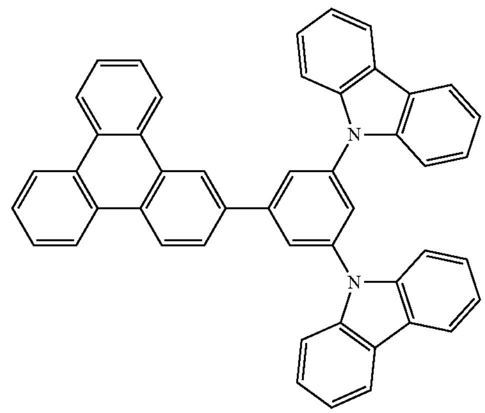

AH-6

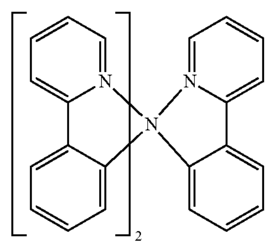

Hereinafter, an example embodiment in which an EML of an organic light-emitting includes the Host I and the Host II will be described (Embodiment 4).

In an example embodiment, the EML may include the Host I and the Host II, wherein the Host I and the Host II may each be independently selected from Formula 11 above.

For example, the Host I and the Host II may be different from each other, but the Host I and the Host II are not limited thereto:

For example, the Host I and the Host II may each be independently selected from Compounds H-1a to H-12a below, but the Host I and the Host II are not limited thereto:

H-1a

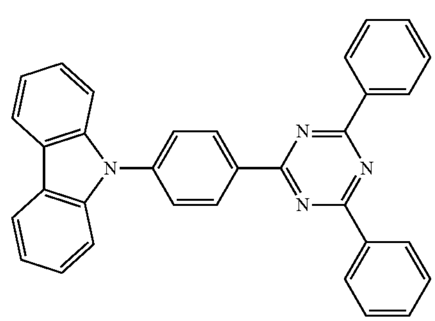

H-2a
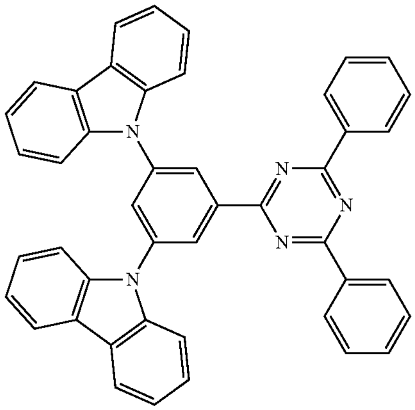
H-3a
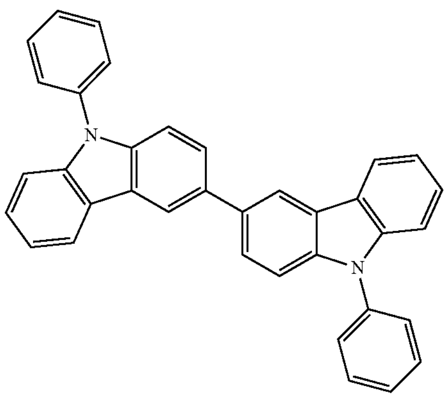
H-4a
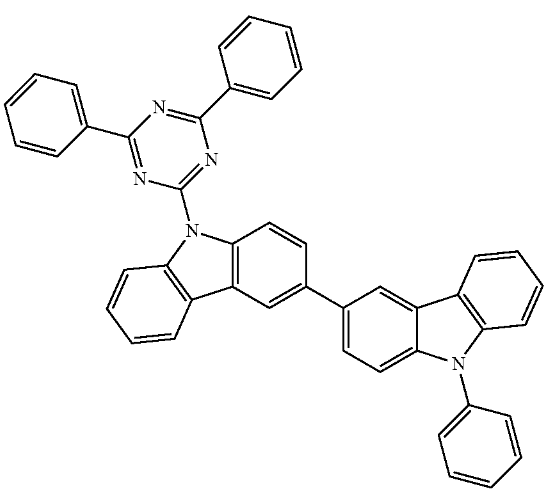
H-5a
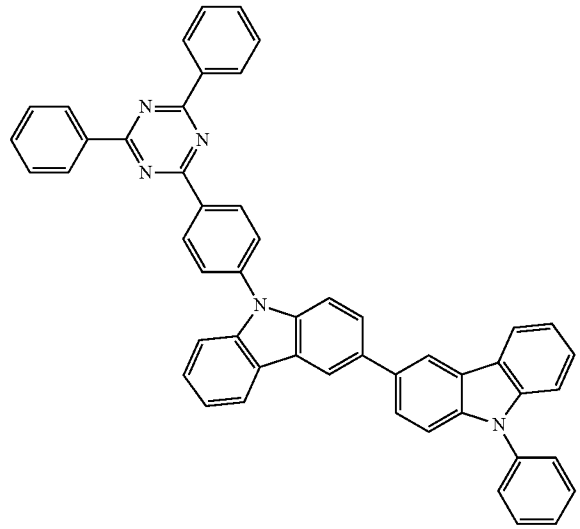
H-6a
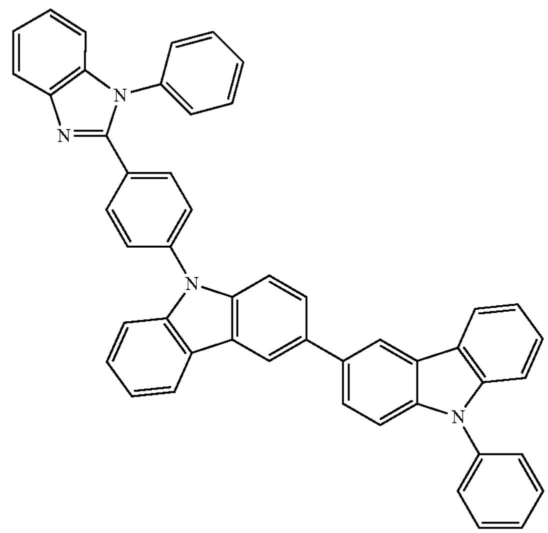
H-7a
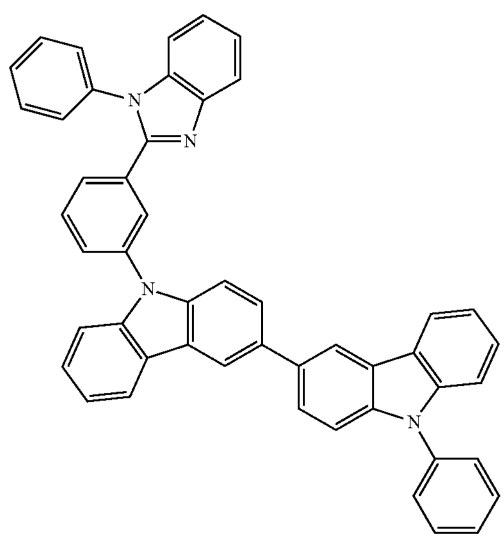

-continued
H-8a
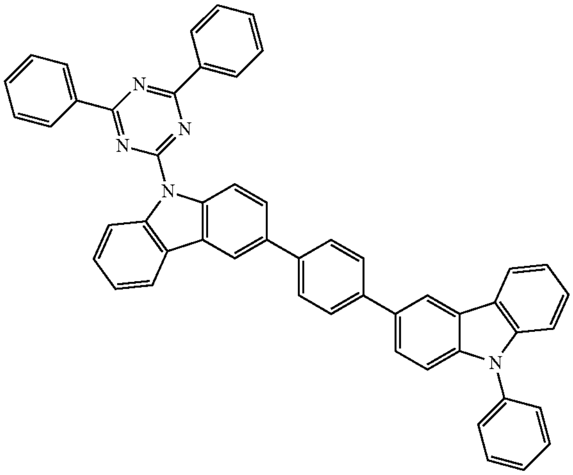
H-9a
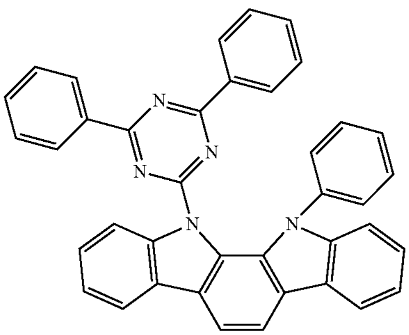
H-10a
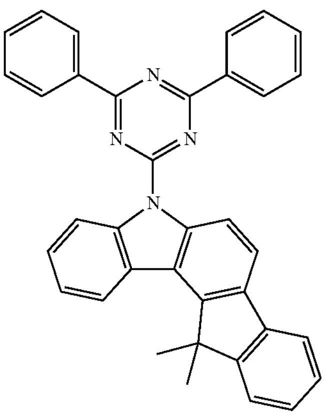
H-11a
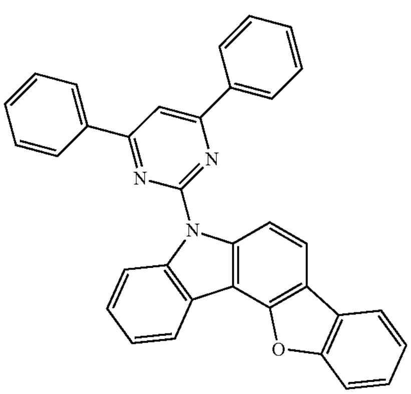
-continued
H-12a
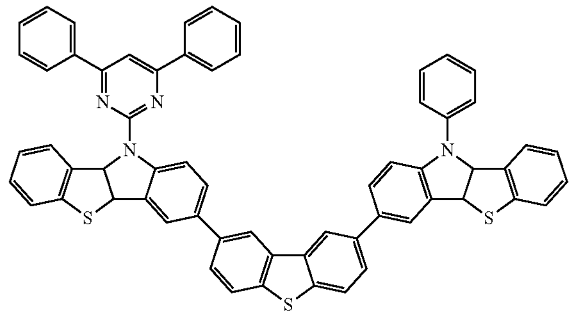
In another example embodiment, the Host I may be selected from Compounds H-1a to H-12a, and the Host II may be selected from Compounds H-1b to H-12b, but the Host I and the Host II are not limited thereto:
H-1a
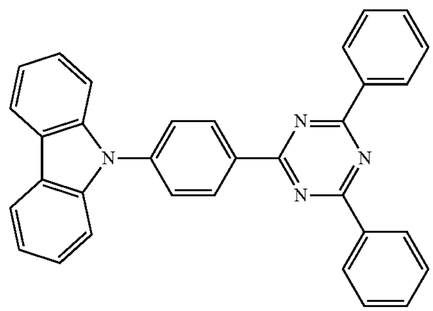
H-2a
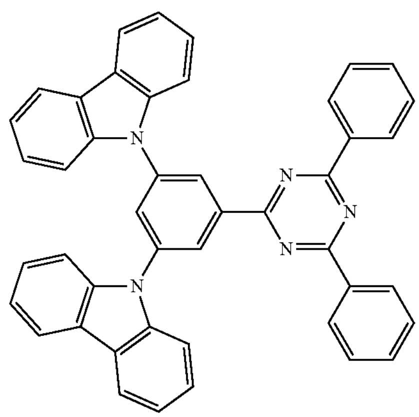
H-3a
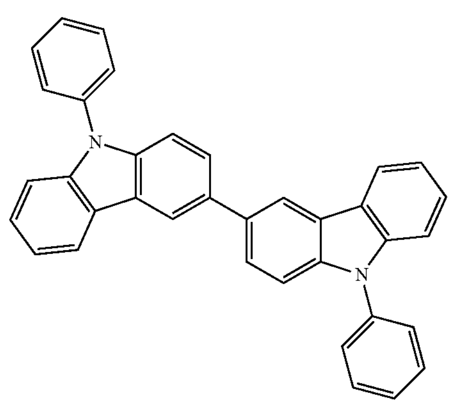

-continued
H-4a
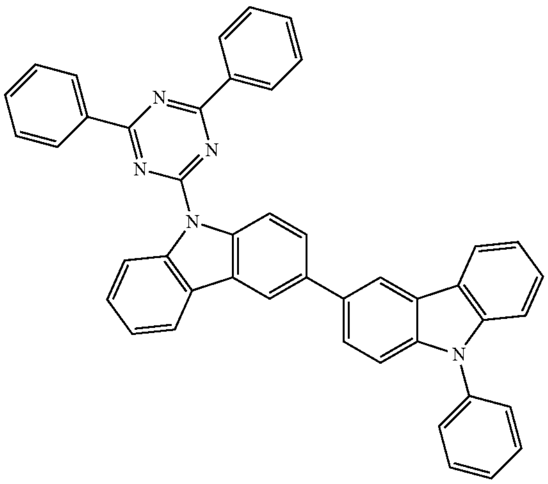
H-5a
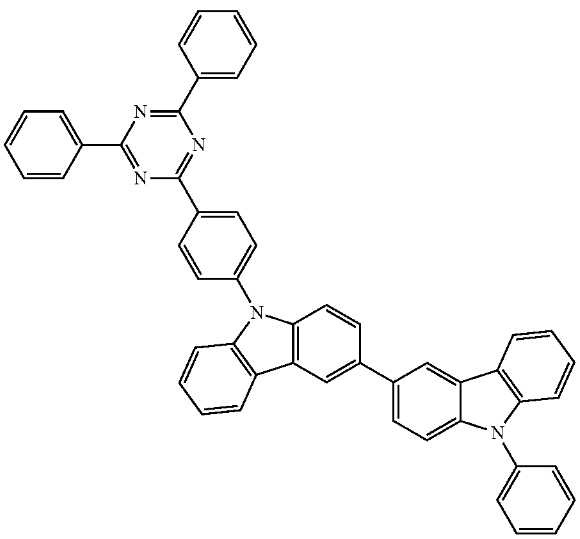
H-6a
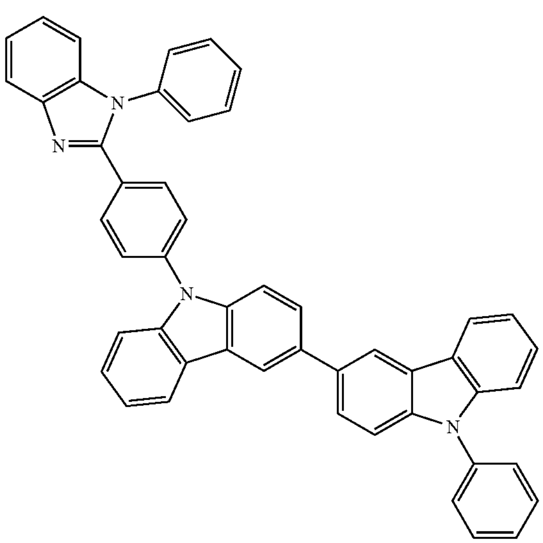
-continued
H-7a
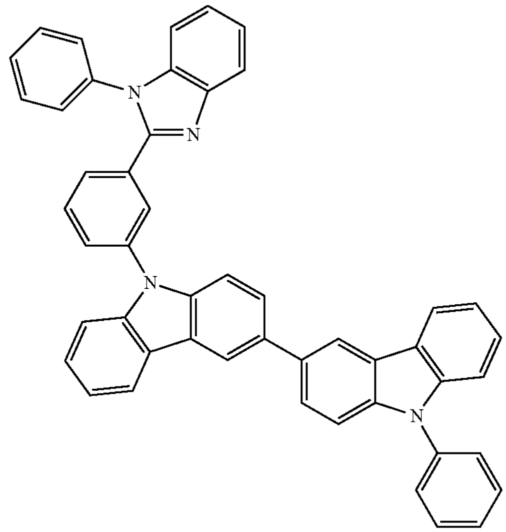
H-8a
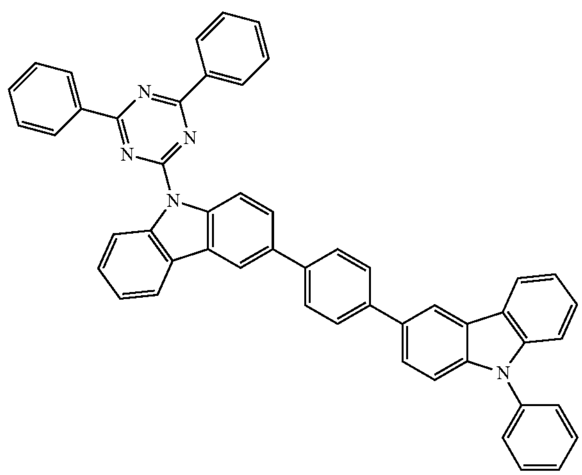
H-9a
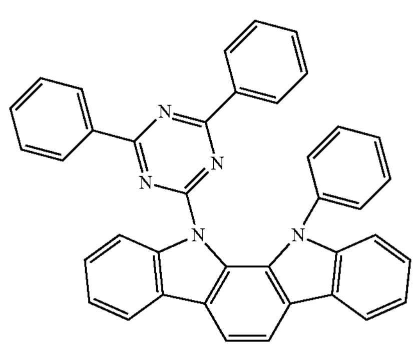

-continued
H-10a
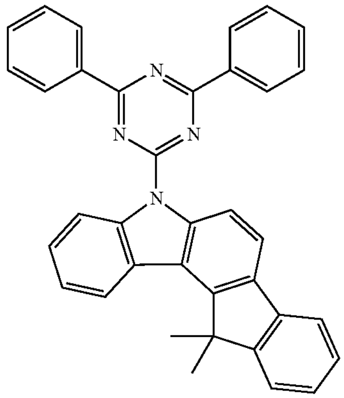
H-11a
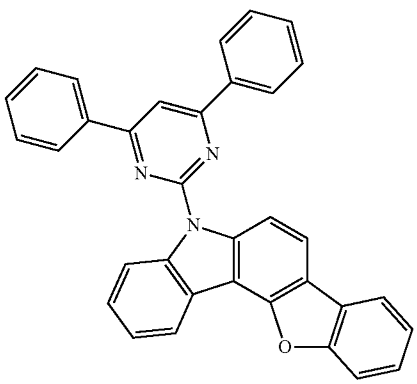
H-12a
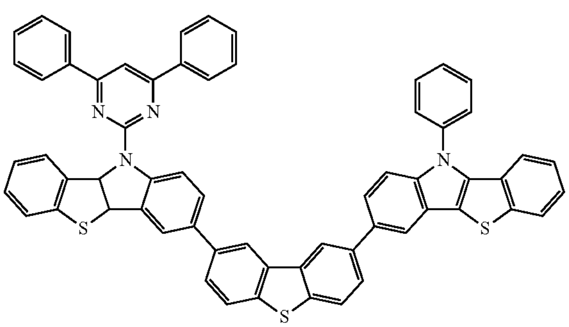
H-1b
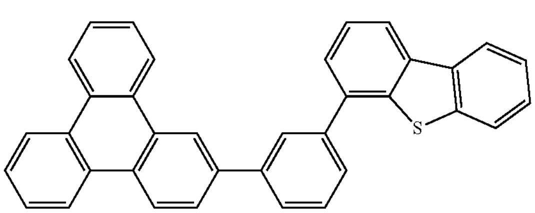
-continued
H-2b
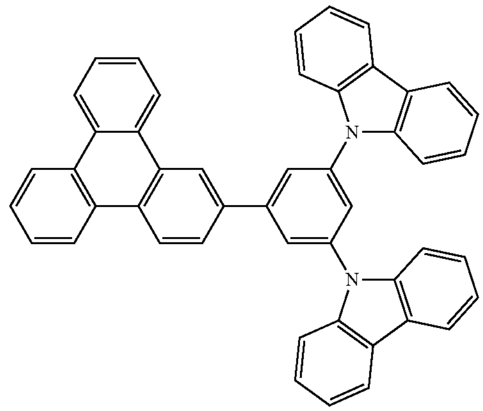
H-3b
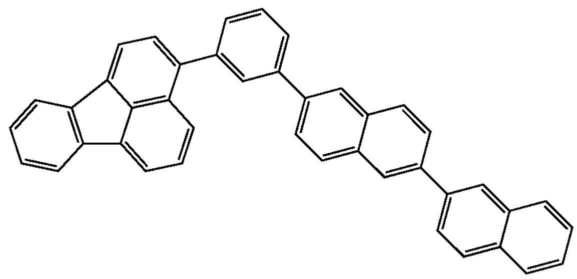
H-4b
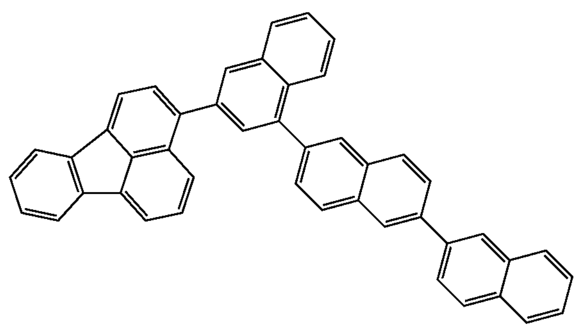
H-5b
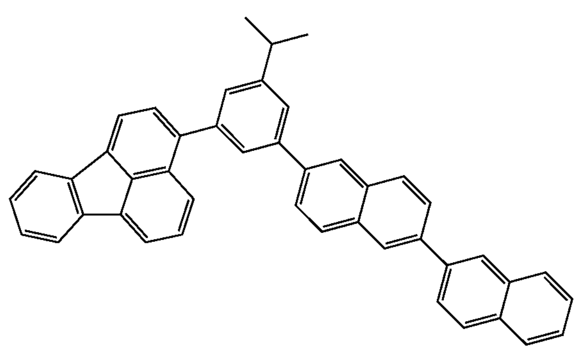
H-6b
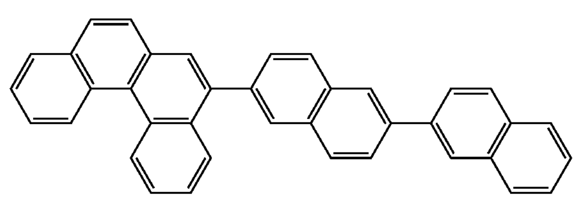

-continued
H-7b
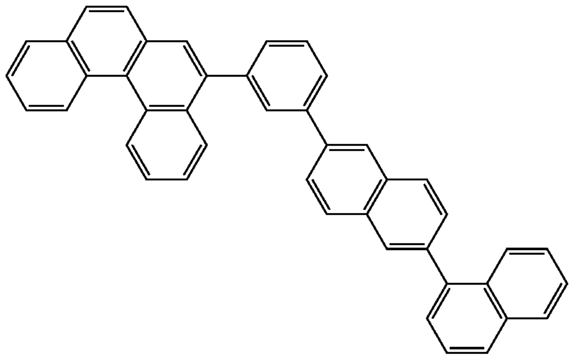
H-8b
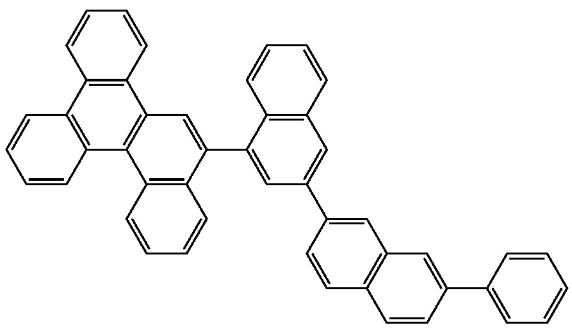
H-9b
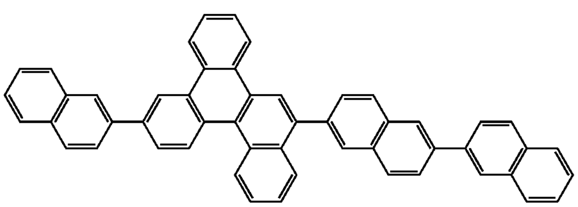
H-10b
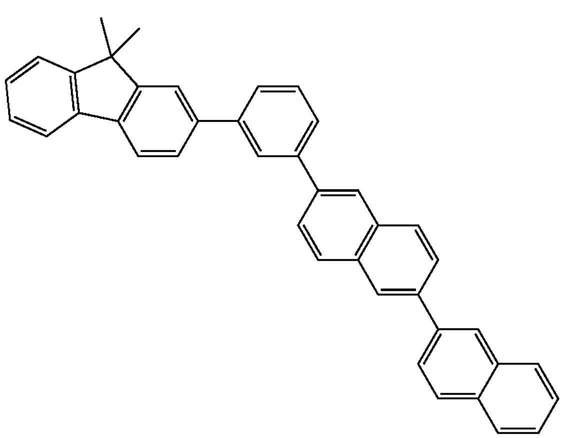
-continued
H-11b
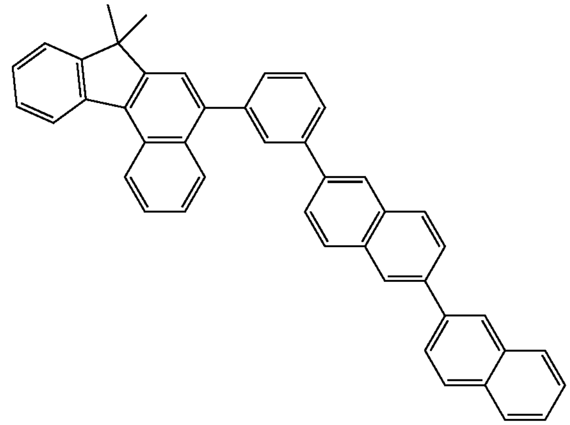
H-12b
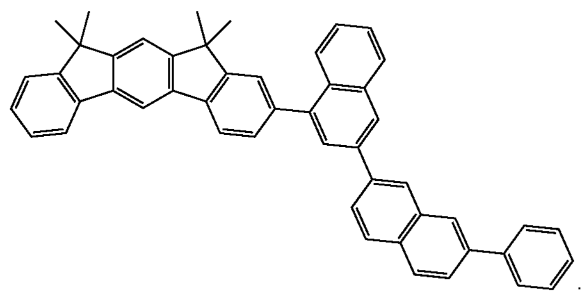
In another example embodiment, the Host I and the Host II may each be independently selected from Compounds H-1b to H-12b, but the Host I and the Host II are not limited thereto:
H-1b
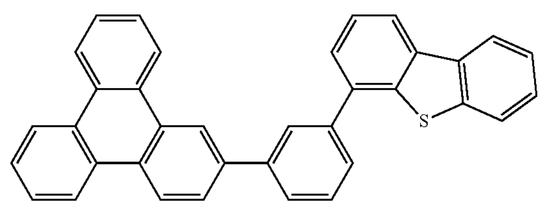
H-2b
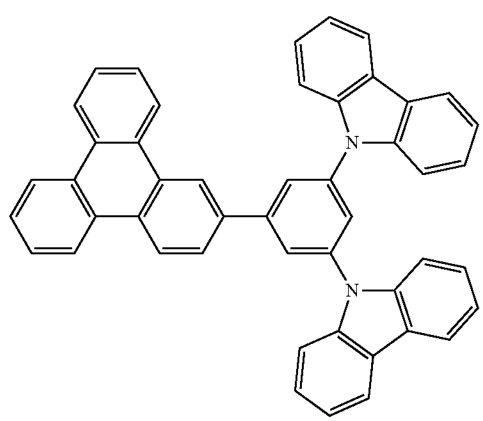

-continued
H-3b
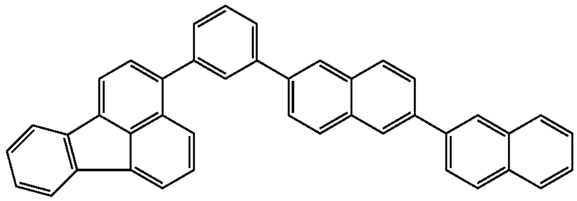
H-4b
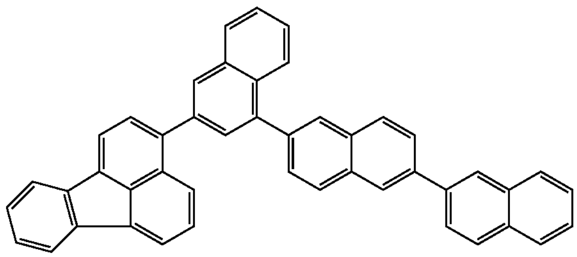
H-5b
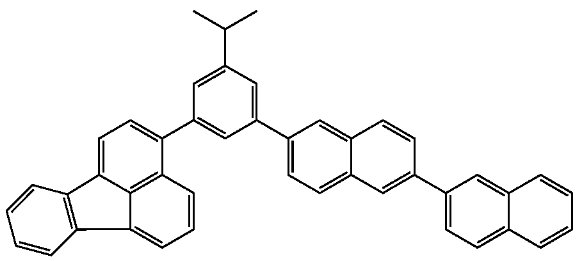
H-6b
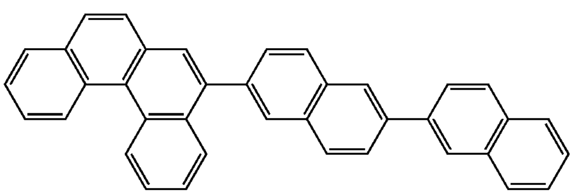
H-7b
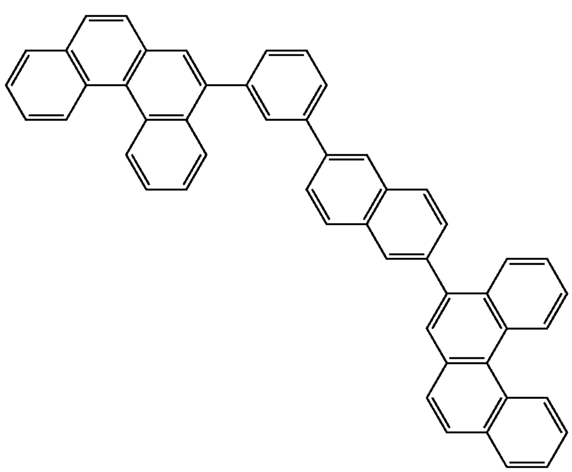
-continued
H-8b
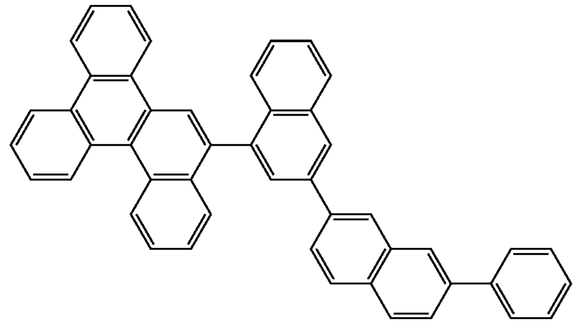
H-9b
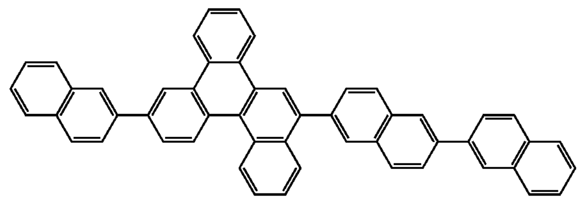
H-10b
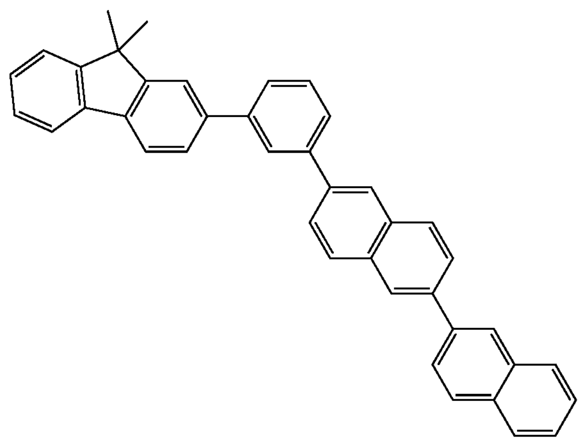
H-11b
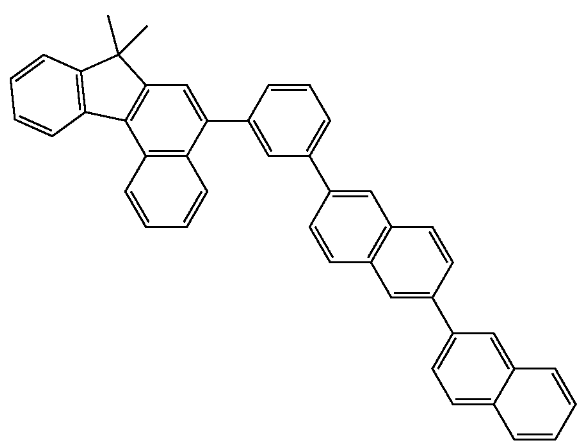

-continued

H-12b

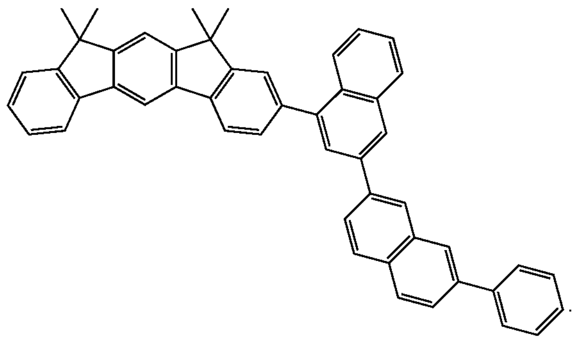

For example, one of the Host I and the Host II may have a triplet energy gap of 2.1 eV or more, but the Host I and the Host II are not limited thereto. When one of the Host I and the Host II has a triplet energy gap of 2.1 eV or more, one of the Host I and the Host II may have an excited state of triplet excitons of the EML in an efficient manner.

A weight ratio of the Host I and the Host II may be in a range of about 1:9 to about 9:1. For example, the weight ratio of the Host I and the Host II may be in a range of about 2:8 to about 8:2. For example, the weight ratio of the Host I and the Host II may be in a range of about 3:7 to about 7:3. For example, the weight ratio of the may be about 5:5.

In some embodiments, a volume ratio of the Host I and the Host II may be in a range of about 1:9 to about 9:1. For example, the volume ratio of the Host I and the Host II may be in a range of about 2:8 to about 8:2. For example, the volume ratio of the Host I and the Host II may be in a range of about 3:7 to about 7:3. For example, the volume ratio of the the Host I and the Host II may be about 5:5.

In some embodiments, the weight ratio or the volume ratio of the Host I and the Host II may vary depending upon the electric characteristics and the balance thereof in the organic light-emitting device.

The EML may further include an organometallic compound represented by Formula 7:

$$M(L_1)_{n71}(L_2)_{n72}. \quad \text{Formula 7}$$

In Formula 7, M may be selected from iridium (Ir), platinum (Pt), osmium (Os), titanium (Ti), zirconium (Zr), hafnium (Hf), europium (Eu), terbium (Tb), thulium (Tm), and rhodium (Rd).

In an example embodiment, M in Formula 7 may be selected from Os, Ir, and Pt, but M is not limited thereto.

In another example embodiment, M in Formula 7 may be Ir, but M is not limited thereto.

In Formula 7, $L_1$ may be a ligand represented by Formula 7A, and $L_2$ may be a ligand represented by Formula 7B, wherein $L_1$ and $L_2$ may be different from each other:

Formula 7A

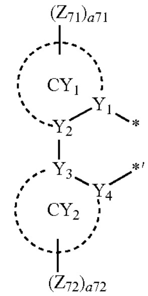

Formula 7B

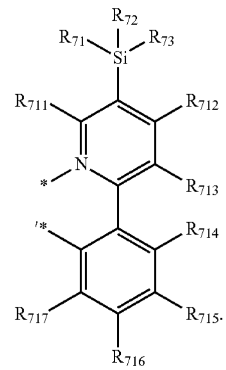

In Formulae 7A and 7B, * and *' may each independently indicate a binding site to M of Formula 7, and substituents may be as defined in the following description.

In Formula 7, n71 and n72 may each be independently 1 or 2, a sum of n71 and n72 (n71+n72) may be 2 or 3, and when n71 is 2, a plurality of $L_1$s may be identical to or different from each other, and when n72 is 2, a plurality of $L_2$s may be identical to or different from each other.

For example, n71 and n72 may each be independently 1 or 2, and a sum of n71 and n72 (n71+n72) may be 3, but n71 and n72 are not limited thereto.

In Formula 7A, $Y_1$ to $Y_4$ may each be independently C or N, wherein $Y_1$ and $Y_2$ may be linked to each other via a single bond or a double bond, and $Y_3$ and $Y_4$ may be linked to each other via a single bond or a double bond.

For example, in Formula 7A, $Y_1$ may be N, and $Y_2$ to $Y_4$ may be C, but $Y_1$ to $Y_4$ are not limited thereto.

In Formula 7A, $CY_1$ and $CY_2$ may each be independently selected from a $C_5$-$C_{60}$ cyclic group and a $C_2$-$C_{60}$ heterocyclic group, and $CY_1$ and $CY_2$ may be optionally linked to each other via a single bond or a first linking group.

In an example embodiment, in Formula 7A, $CY_1$ and $CY_2$ may each be independently selected from a benzene, a naphthalene, a fluorene, a spiro-fluorene, an indene, a furan, a thiophene, a carbazole, a benzofuran, a benzothiophene, a dibenzofuran, a dibenzothiophene, a pyrrole, an imidazole, a pyrazole, a thiazole, an isothiazole, an oxazole, an isoxazole, a triazole, a pyridine, a pyrazine, a pyrimidine, a quinoline, an isoquinoline, a benzoquinoline, a quinoxaline, a quinazoline, a naphthyridine, an indole, a benzimidazole, a benzoxazole, an isobenzoxazole, an oxadiazole, and a triazine, but $CY_1$ and $CY_2$ are not limited thereto.

In another example embodiment, in Formula 7A, $CY_1$ may be selected from a pyrrole, an imidazole, a pyrazole, a thiazole, an isothiazole, an oxazole, an isoxazole, a triazole, a pyridine, a pyrazine, a pyrimidine, a quinoline, an isoquinoline, a benzoquinoline, a quinoxaline, a quinazoline, a naphthyridine, a benzimidazole, a benzoxazole, an isobenzoxazole, an oxadiazole, and a triazine, but $CY_1$ is not limited thereto.

In another example embodiment, in Formula 7A, $CY_1$ may be selected from a pyrrole, an imidazole, a pyrazole, a triazole, a pyridine, a pyrimidine, a pyrazine, a quinoline, an isoquinoline, an oxadiazole, and a triazine, but $CY_1$ is not limited thereto.

In another example embodiment, in Formula 7A, $CY_1$ may be selected from a pyrrole, an imidazole, a pyrazole, a triazole, a pyridine, a pyrimidine, a pyrazine, and a triazine, but $CY_1$ is not limited thereto.

In another example embodiment, in Formula 7A, $CY_2$ may be selected from a benzene, a naphthalene, a fluorene, a carbazole, a furan, a thiophene, a benzofuran, a benzothiophene, a dibenzofuran, a dibenzothiophene, an indole, a pyridine, a pyrazine, a pyrimidine, a quinoline, an isoquinoline, a benzoquinoline, a quinoxaline, a quinazoline, a naphthyridine, an indole, an oxadiazole, and a triazine, but $CY_2$ is not limited thereto.

In another example embodiment, in Formula 7A, $CY_2$ may be selected from a benzene, a naphthalene, a fluorene, a carbazole, a furan, a thiophene, a benzofuran, a benzothiophene, a dibenzofuran, a dibenzothiophene, an indole, a pyridine, a pyrimidine, a pyrazine, and a triazine, but $CY_2$ is not limited thereto.

In another example embodiment, in Formula 7A, $CY_2$ may be selected from a benzene, a pyridine, a pyrimidine, a pyrazine, a triazine, a carbazole, a dibenzofuran, and a dibenzothiophene, but $CY_2$ is not limited thereto.

In another example embodiment, in Formula 7A, $CY_1$ may be selected from a pyrrole, an imidazole, a pyrazole, a triazole, a pyridine, a pyrimidine, a pyrazine, a triazine, a quinoline, an isoquinoline, and an oxadiazole, and $CY_2$ may be selected from a benzene, a naphthalene, a fluorene, a carbazole, a furan, a thiophene, a benzofuran, a benzothiophene, a dibenzofuran, a dibenzothiophene, an indole, a pyridine, a pyrimidine, a pyrazine, an oxadiazole, and a triazine, but $CY_1$ and $CY_2$ are not limited thereto.

In Formula 7B, $R_{71}$ to $R_{73}$ may each be independently selected from:

a $C_1$-$C_{10}$ alkyl group; and a $C_1$-$C_{10}$ alkyl group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, but $R_{71}$ to $R_{73}$ are not limited thereto.

In an example embodiment, in Formula 7B, $R_{71}$ to $R_{73}$ may each be independently selected from:

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group; and a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, but $R_{71}$ to $R_{73}$ are not limited thereto.

In another example embodiment, in Formula 7B, $R_{71}$ to $R_{73}$ may each be independently selected from:

a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, and a tert-pentyl group; and a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, and a tert-pentyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, but $R_{71}$ to $R_{73}$ are not limited thereto.

In another example embodiment, in Formula 7B, $R_{71}$ to $R_{73}$ may each be independently selected from a methyl group, an ethyl group, an n-propyl group, an iso-propyl group, an n-butyl group, an iso-butyl group, a sec-butyl group, and a tert-butyl group, but $R_{71}$ to $R_{73}$ are not limited thereto.

In another example embodiment, in Formula 7B, $R_{71}$ to $R_{73}$ may be identical to each other, but $R_{71}$ to $R_{73}$ are not limited thereto.

In Formulae 7A and 7B, $Z_{71}$, $Z_{72}$ and $R_{711}$ to $R_{717}$ may each be independently selected from:

hydrogen, deuterium, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$), wherein $R_{712}$ is not hydrogen, and two adjacent substituents selected from $R_{714}$ to $R_{717}$ are optionally linked to each other to form a condensed ring, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$, where $Q_1$ to $Q_7$, $Q_{11}$ to $Q_{17}$, $Q_{21}$ to $Q_{27}$, and $Q_{31}$ to $Q_{37}$ may each be independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an example embodiment, in Formulae 7A and 7B, $Z_{71}$, $Z_{72}$, and $R_{711}$ to $R_{717}$ may each be independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, wherein $R_{712}$ is not hydrogen, but embodiments are not limited thereto.

In another example embodiment, in Formulae 7A and 7B, $Z_{71}$, $Z_{72}$, and $R_{711}$ to $R_{717}$ may each be independently selected from:

hydrogen, —F, a cyano group, a nitro group, —$SF_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, butoxy group, a pentoxy group, a phenyl group, a naphthyl group, a pyridinyl group, and a pyrimidinyl group; and a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, butoxy group, a pentoxy group, a phenyl group, a naphthyl group, a pyridinyl group, and a pyrimidinyl group, each substituted with at least one selected from —F, a cyano group, and a nitro group, wherein $R_{712}$ is not hydrogen, but embodiments are not limited thereto.

In Formula 7A, a71 indicates the number of $Z_{71}$, and may be an integer selected from 1 to 5. When a71 is 2 or more, a plurality of $Z_{71}$s may be identical to or different from each other.

In Formula 1A, a72 indicates the number of $Z_{72}$, and may be an integer selected from 1 to 5. When a72 is 2 or more, a plurality of $Z_{72}$s may be identical to or different from each other.

For example, the organometallic compound of Formula 7 may be selected from Compounds PD-1 to PD-192, but the organometallic compound is not limited thereto:

PD-1

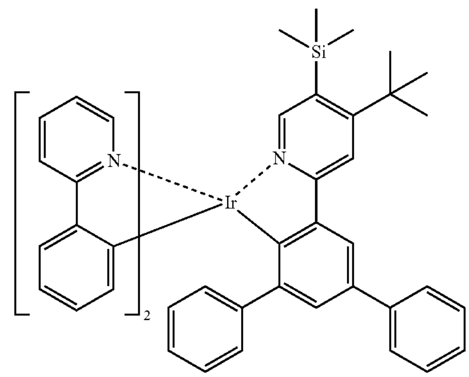

PD-2

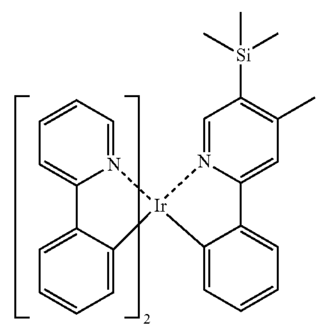

PD-3

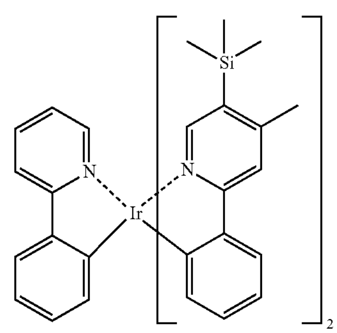

PD-4

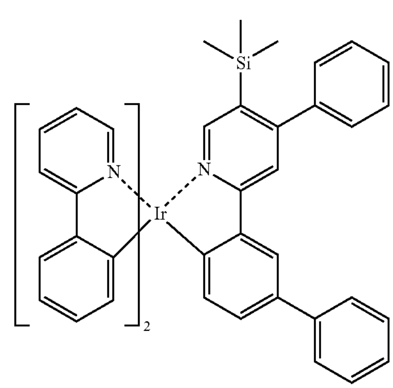

-continued
PD-5
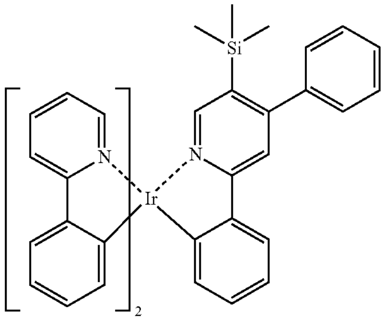
PD-6
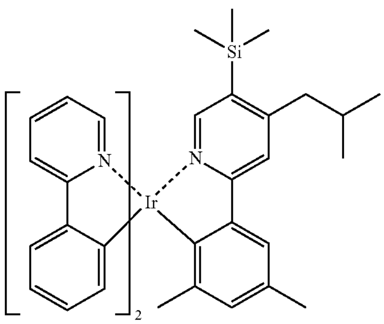
PD-7
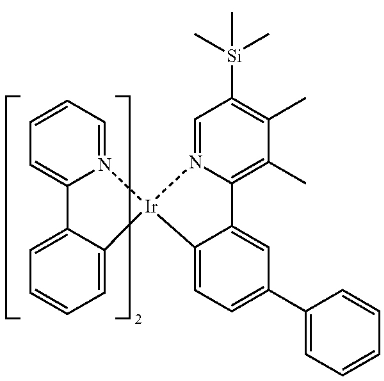
PD-8
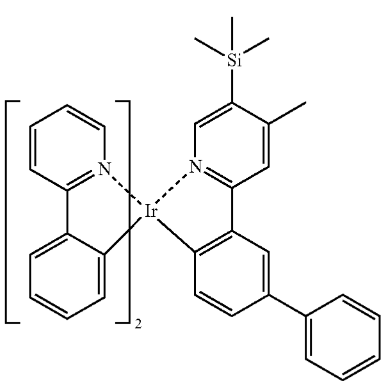
-continued
PD-9
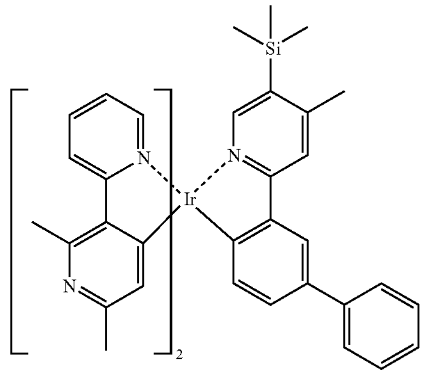
PD-10
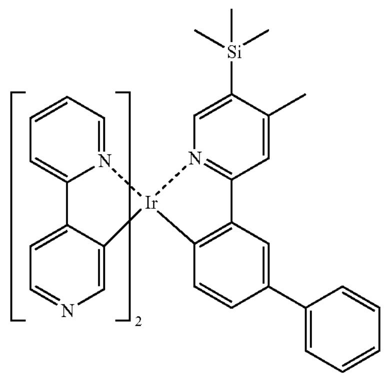
PD-11
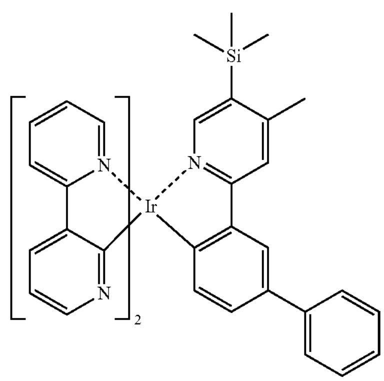
PD-12
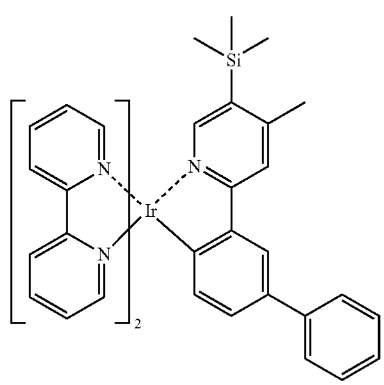

-continued
PD-13
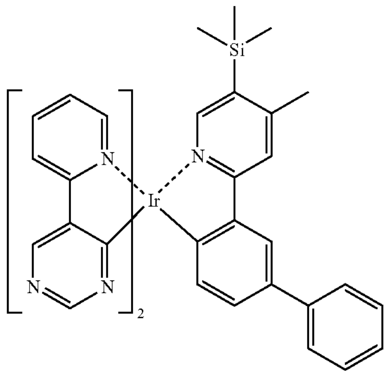
PD-14
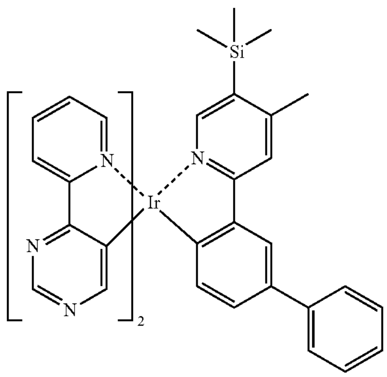
PD-15
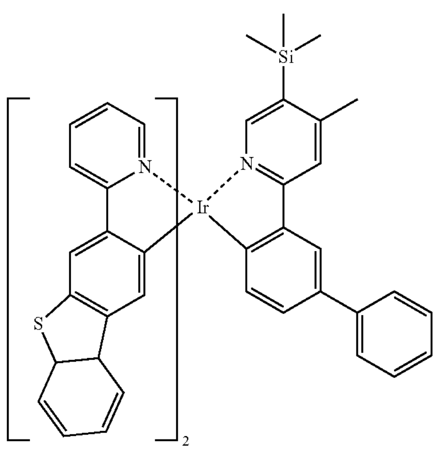
PD-16
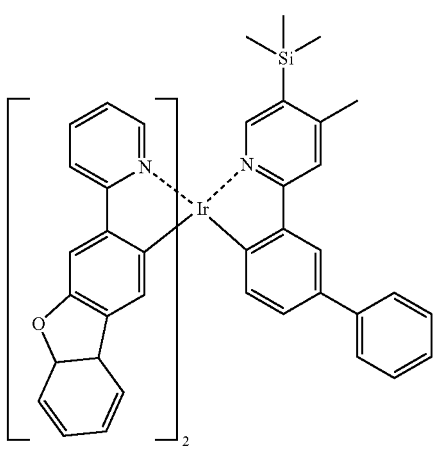
-continued
PD-17
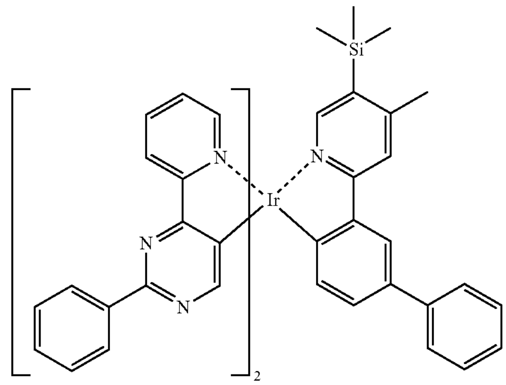
PD-18
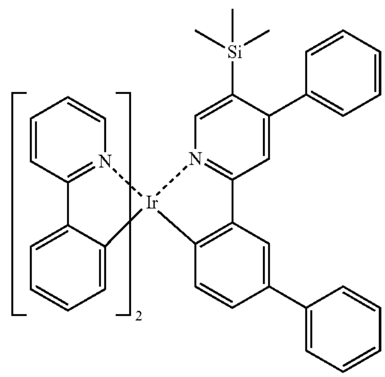
PD-19
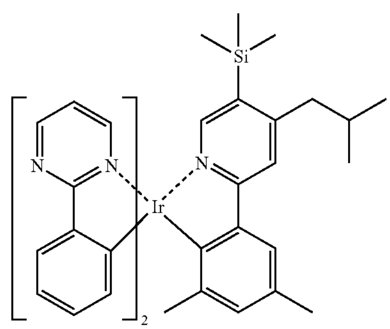
PD-20
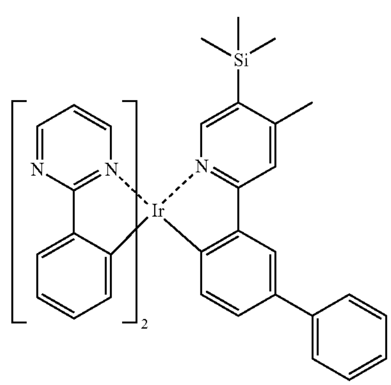

-continued
PD-21
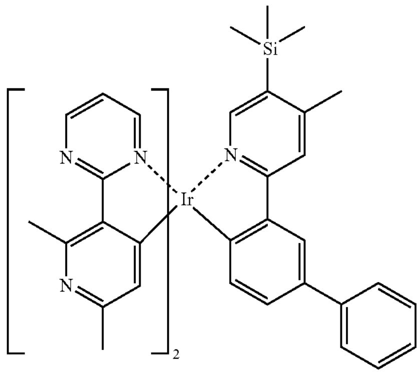
PD-22
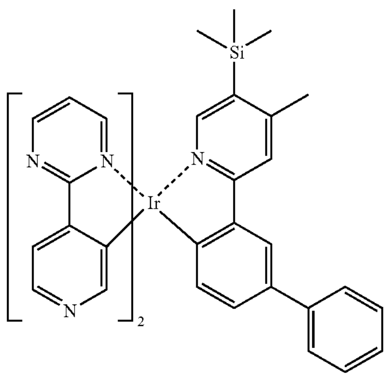
PD-23
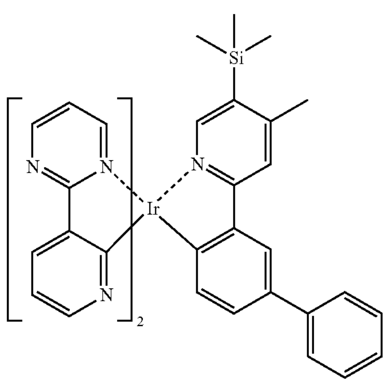
PD-24
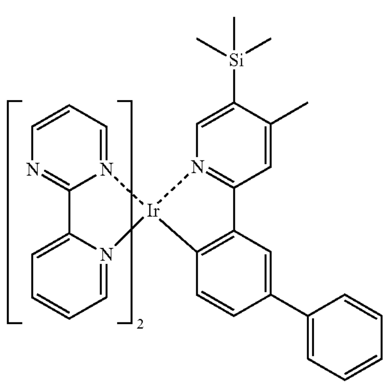
-continued
PD-25
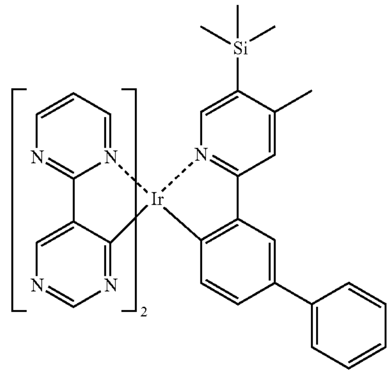
PD-26
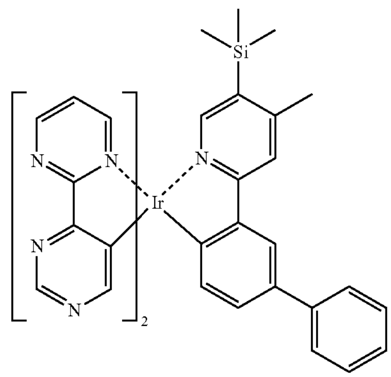
PD-27
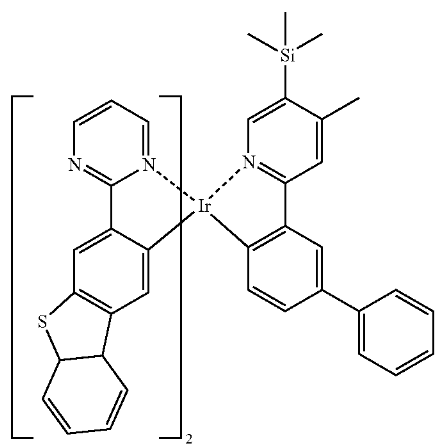
PD-28
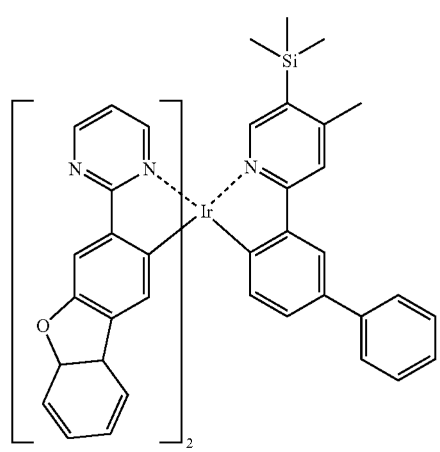

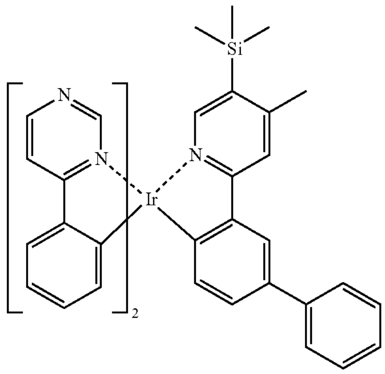
PD-29
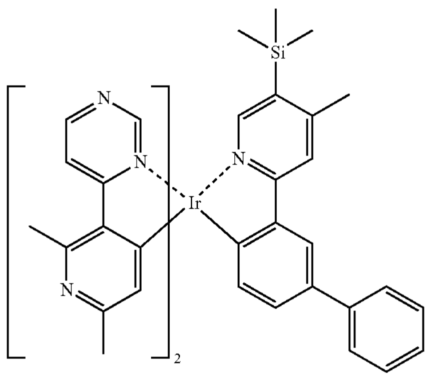
PD-30
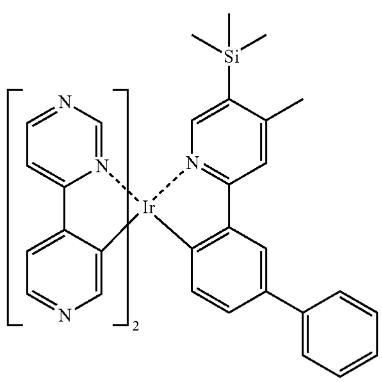
PD-31
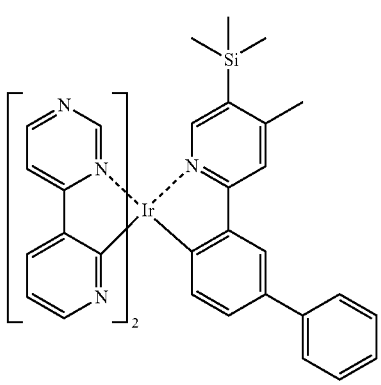
PD-32
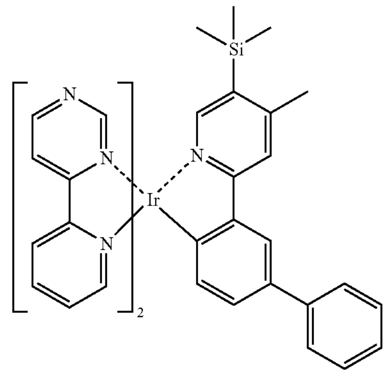
PD-33
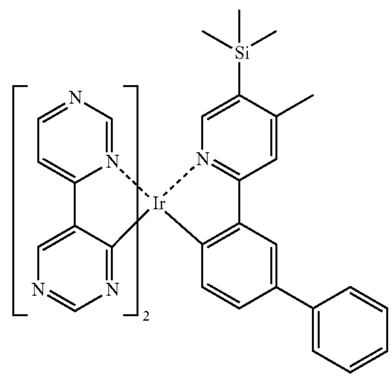
PD-34
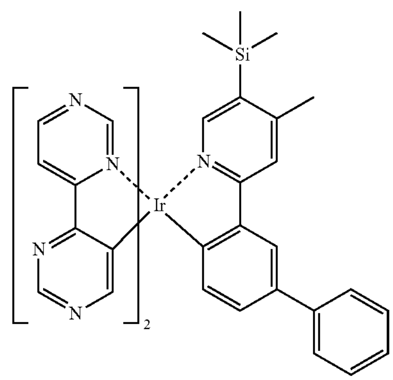
PD-35
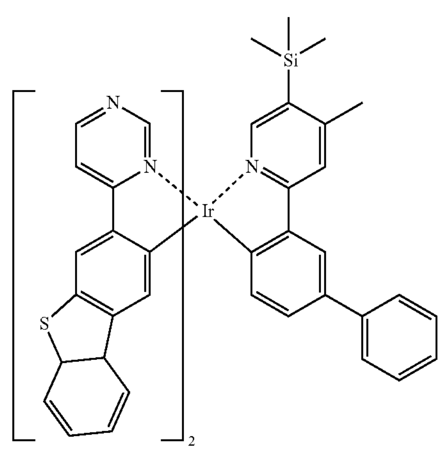
PD-36

-continued
PD-37
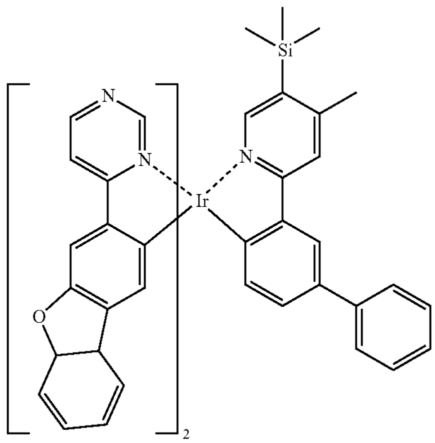
PD-38
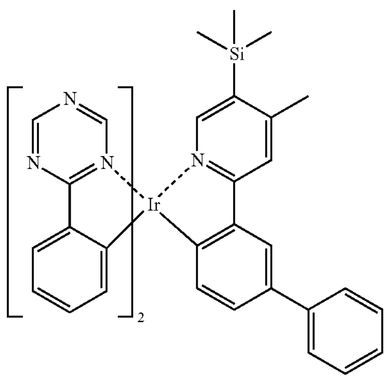
PD-39
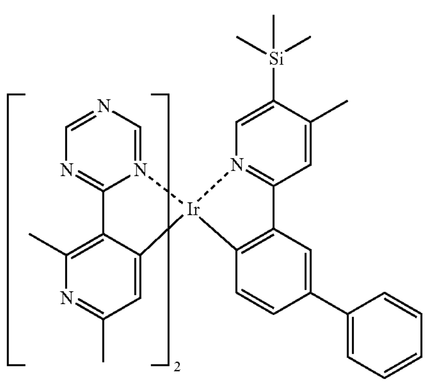
PD-40
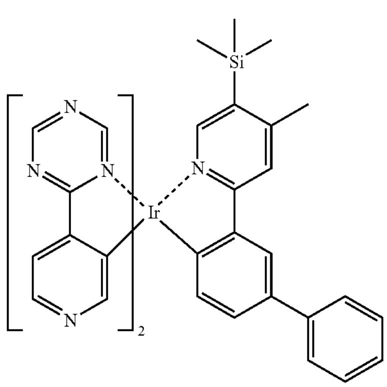
-continued
PD-41
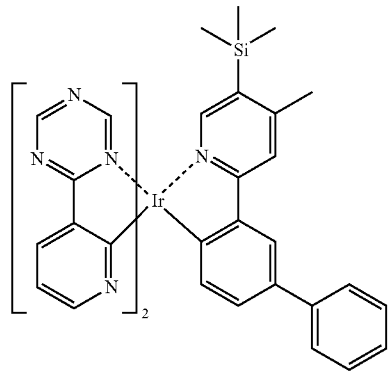
PD-42
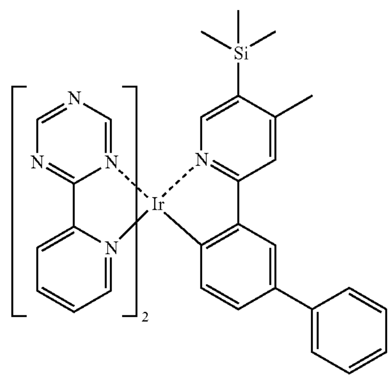
PD-43
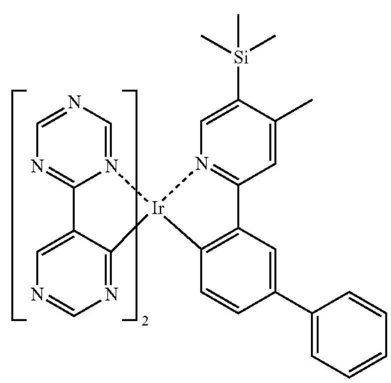
PD-44
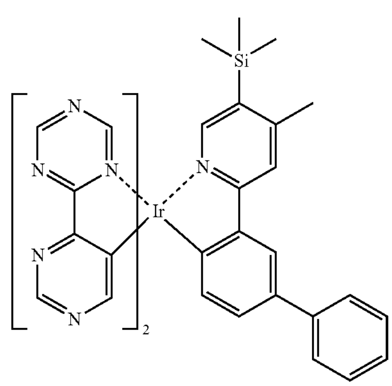

-continued
PD-45
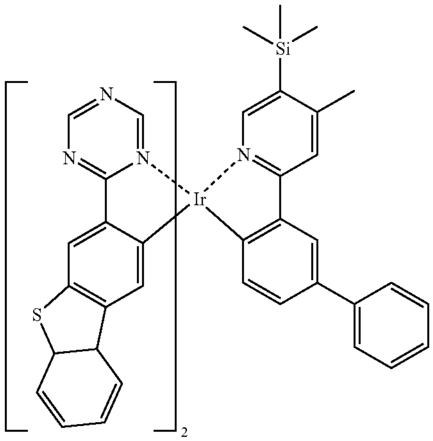
PD-46
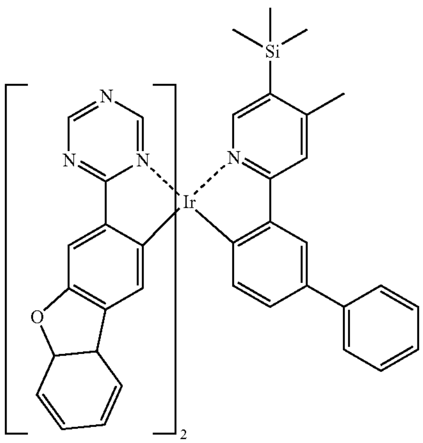
PD-47
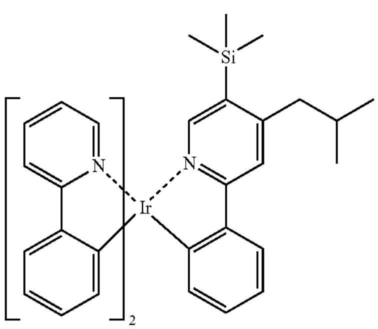
PD-48
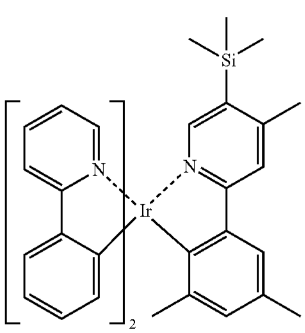
-continued
PD-49
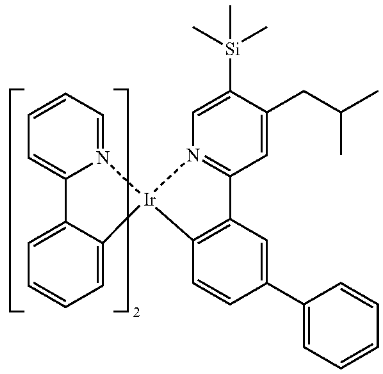
PD-50
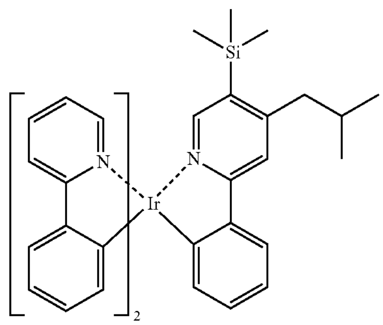
PD-51
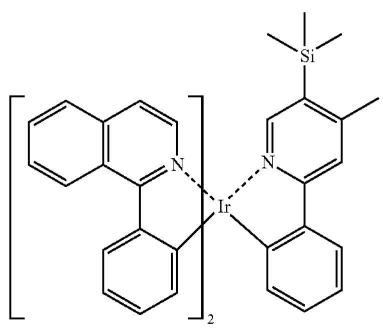
PD-52
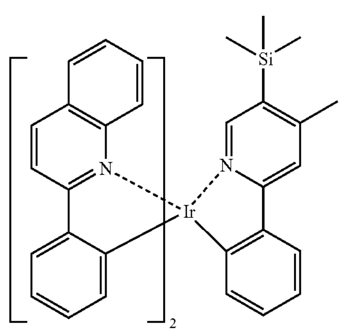

-continued
PD-53
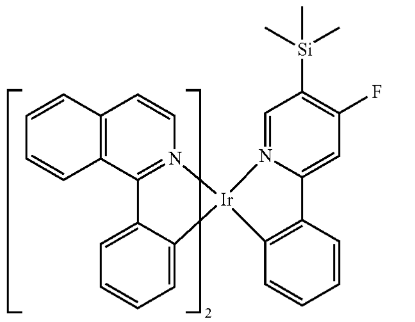
PD-54
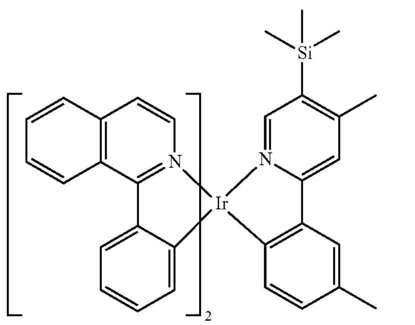
PD-55
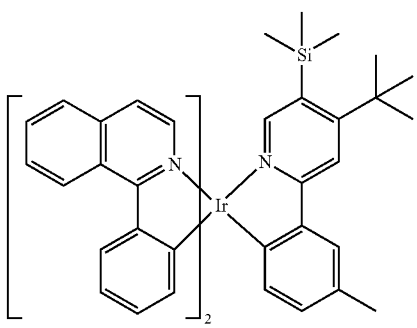
PD-56
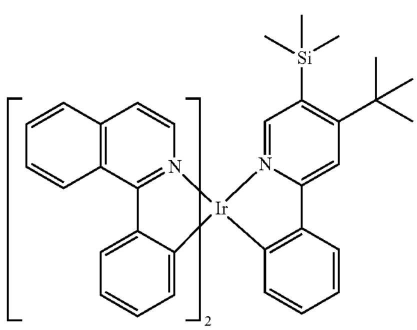
-continued
PD-57
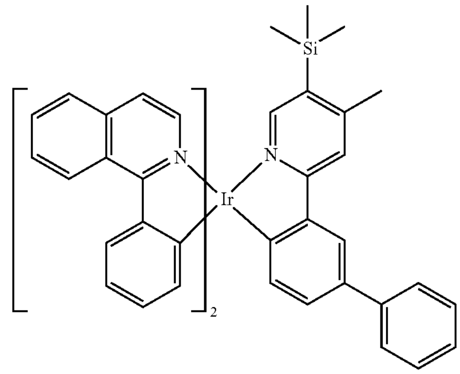
PD-58
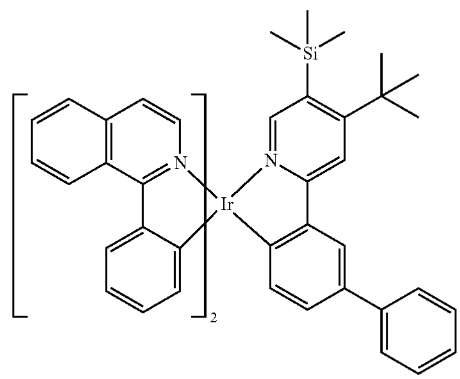
PD-59
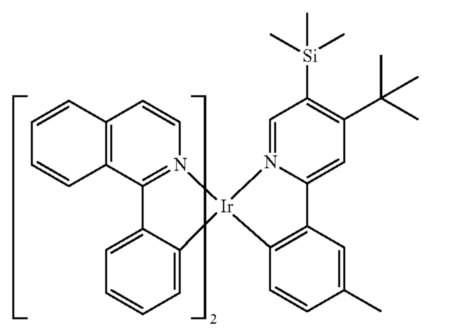
PD-60
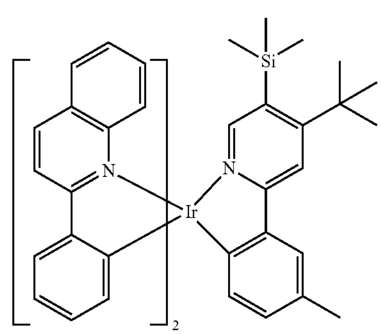

PD-61
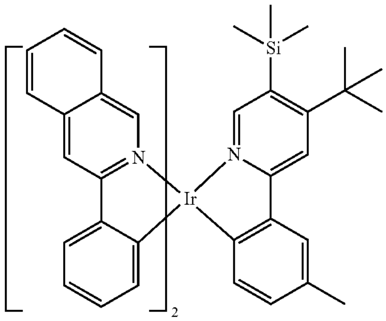
PD-62
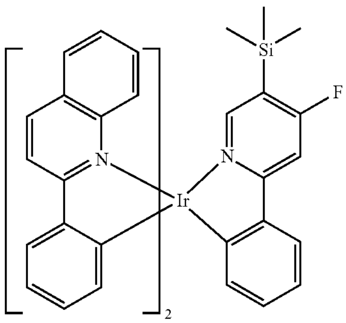
PD-63
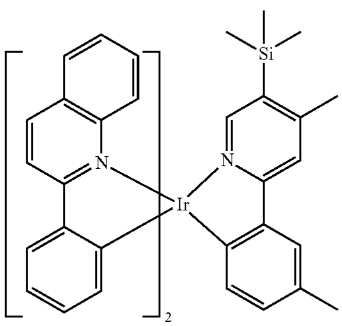
PD-64
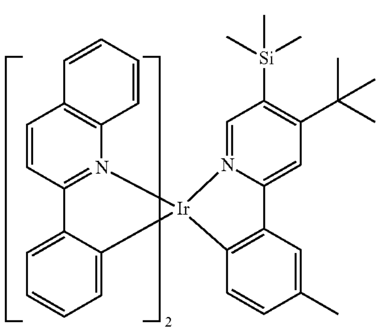
PD-65
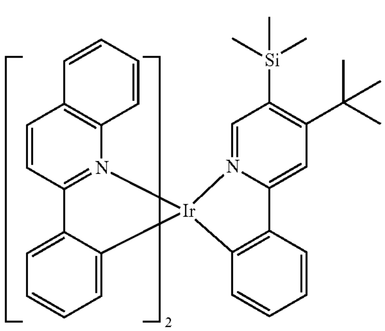
PD-66
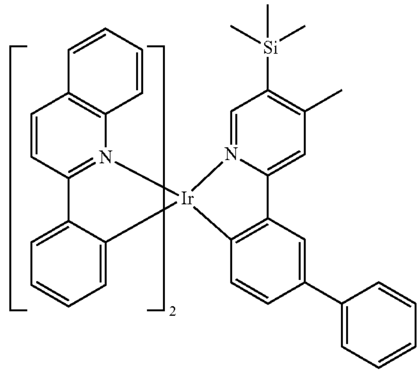
PD-67
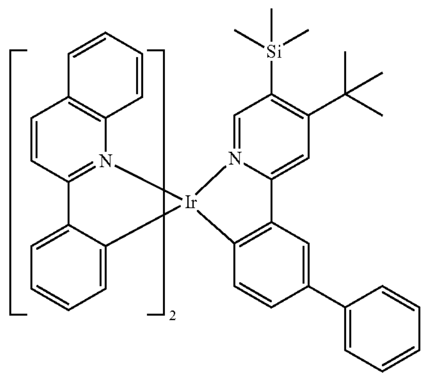
PD-68
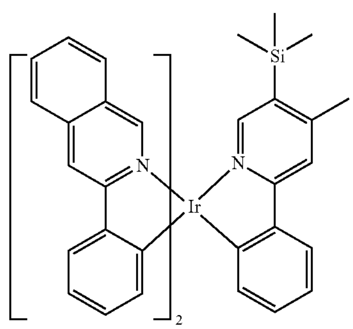
PD-69
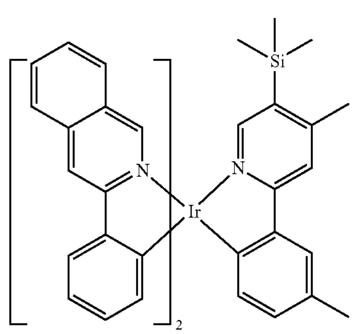

PD-70
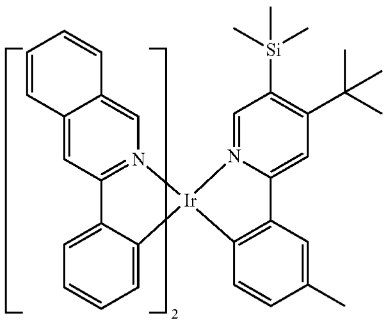
PD-71
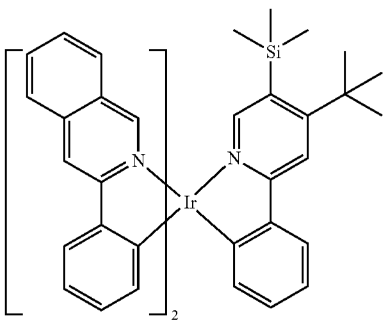
PD-72
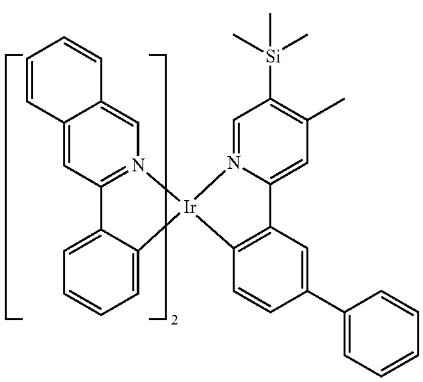
PD-73
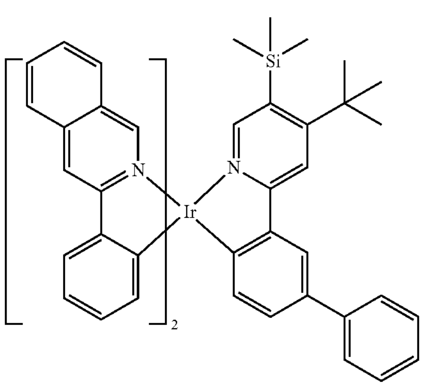
PD-74
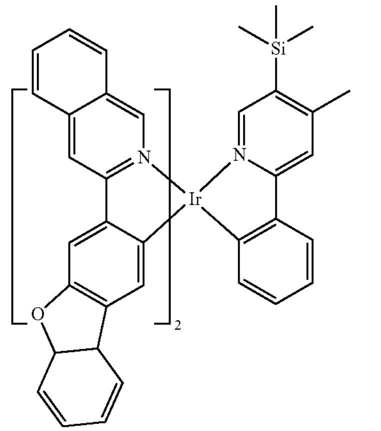
PD-75
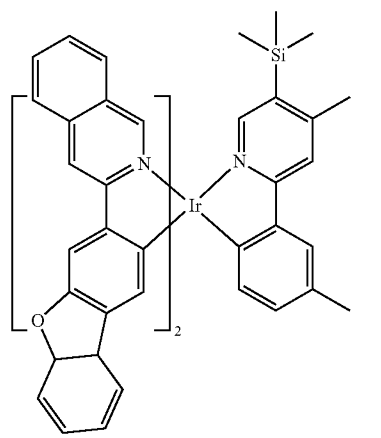
PD-76
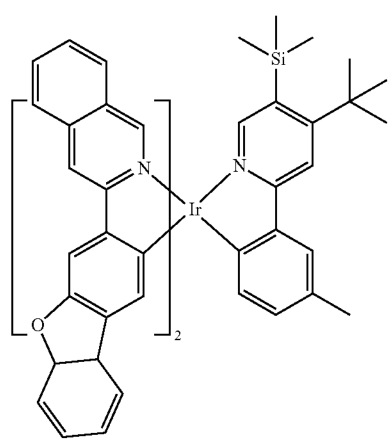

-continued
PD-77
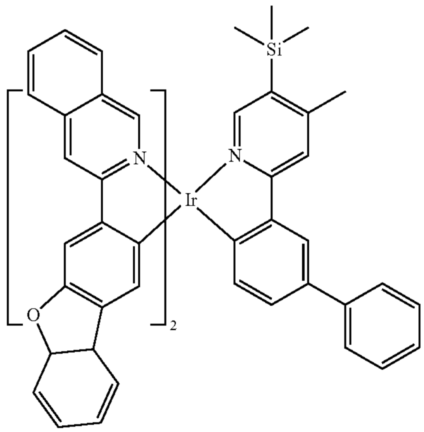
PD-78
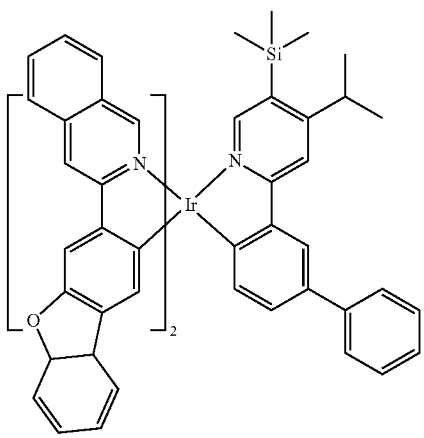
PD-79
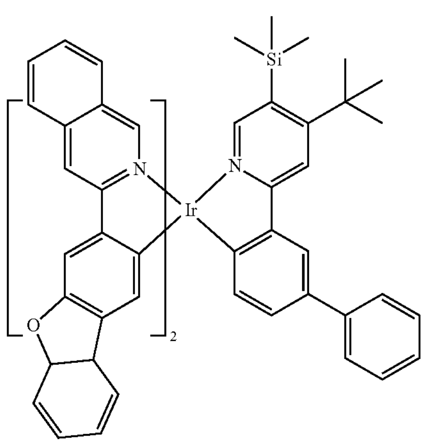
-continued
PD-80
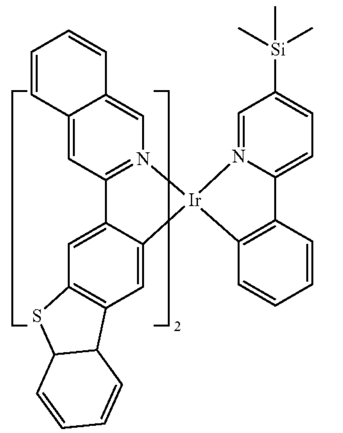
PD-81
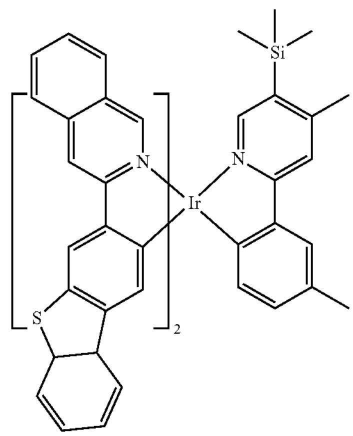
PD-82
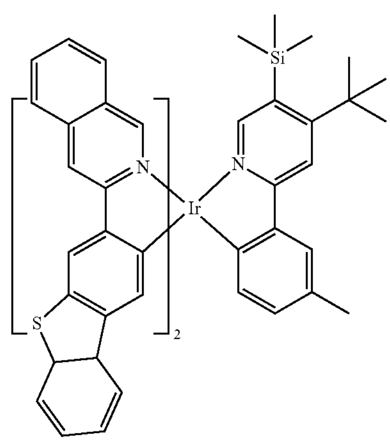

PD-83
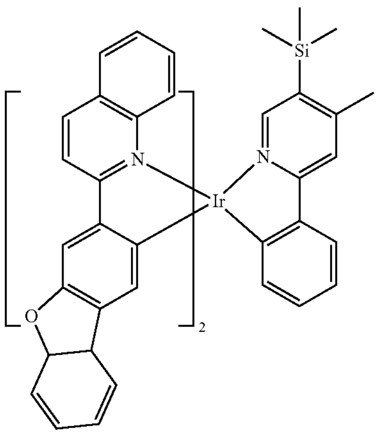
PD-84
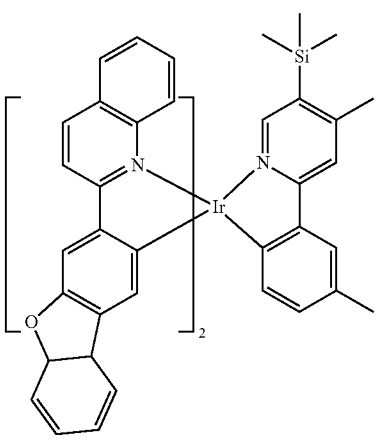
PD-85
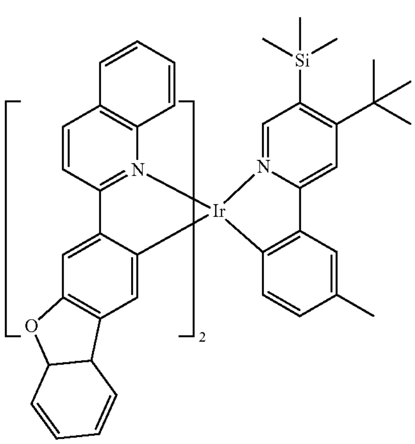
PD-86
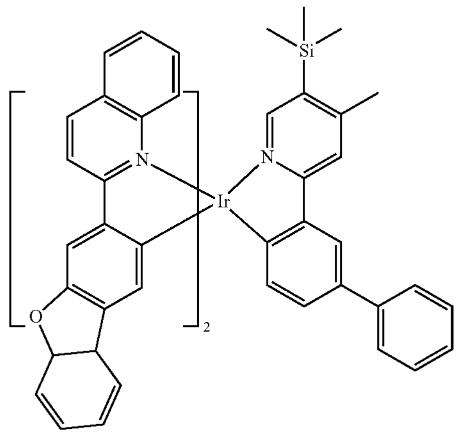
PD-87
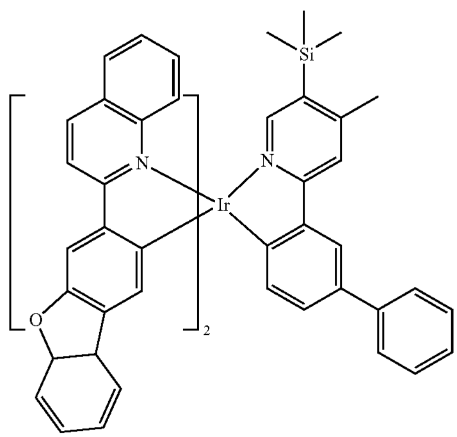
PD-88
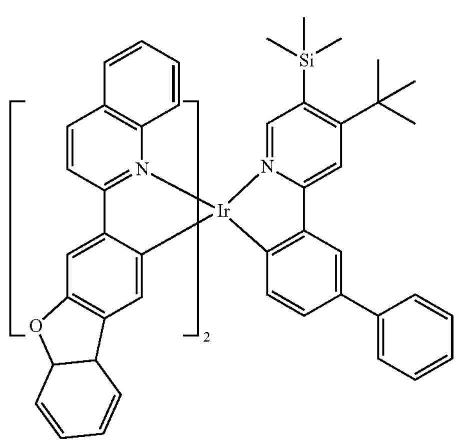

PD-89
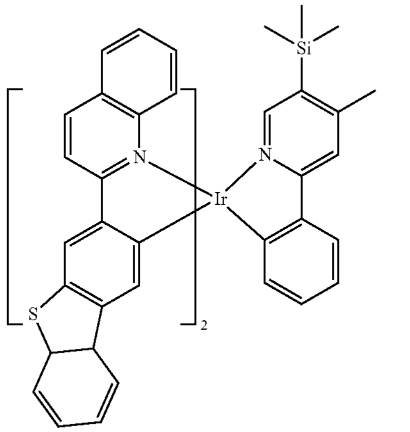
PD-90
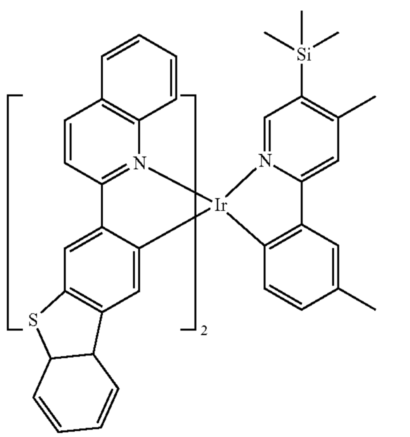
PD-91
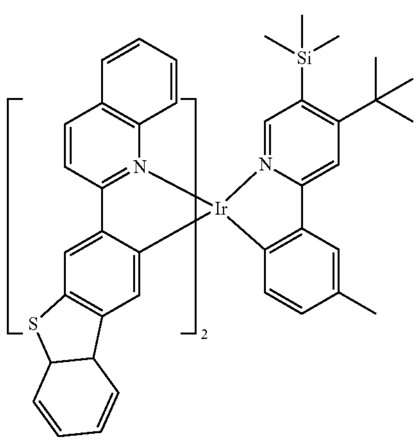
PD-92
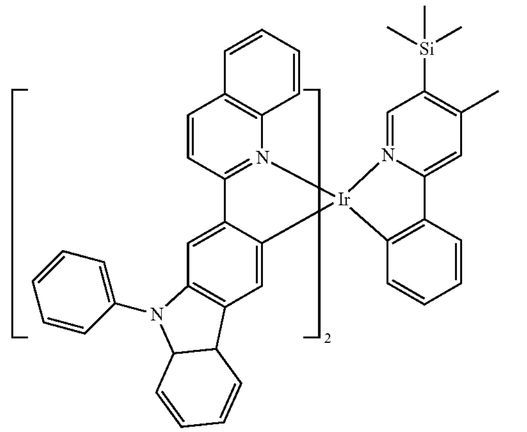
PD-93
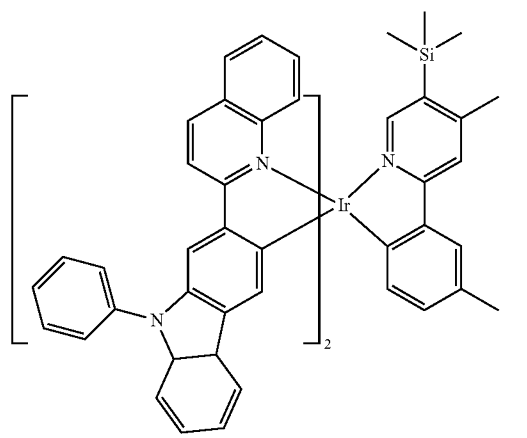
PD-94
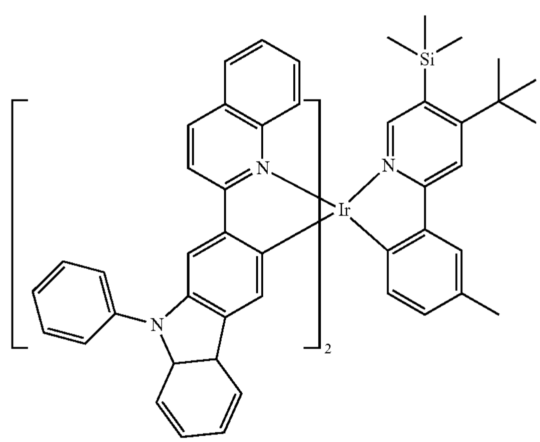

-continued
PD-95
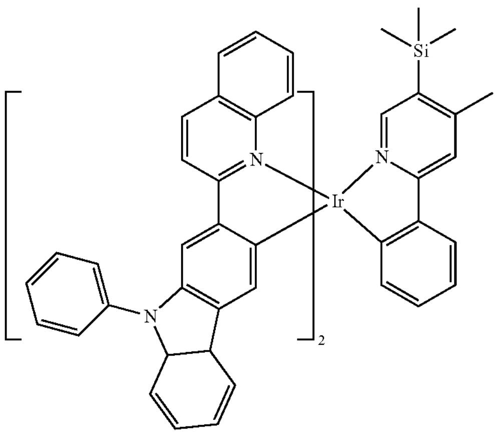
PD-96
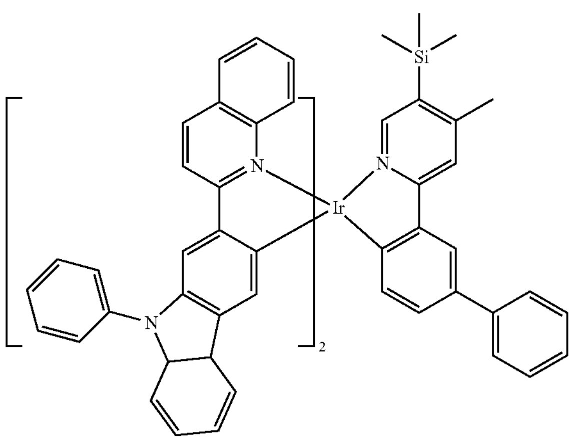
PD-97
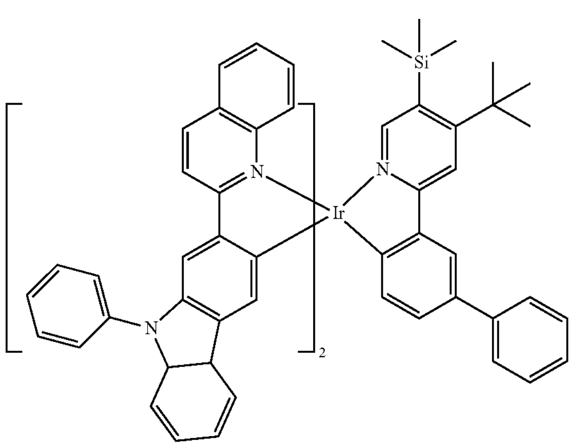
-continued
PD-98
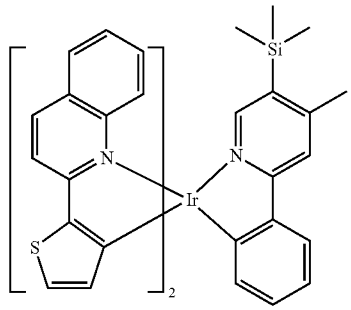
PD-99
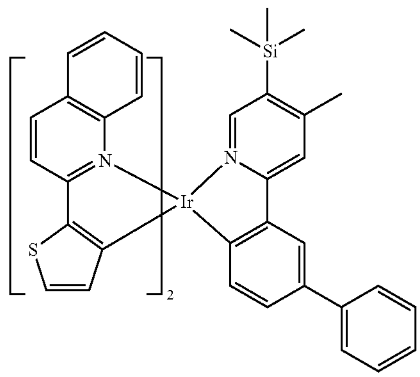
PD-100
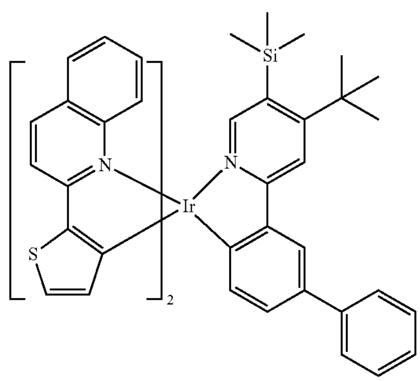
PD-101
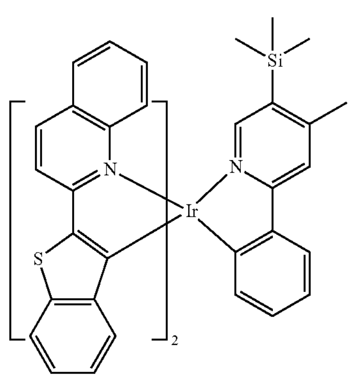

-continued
PD-102
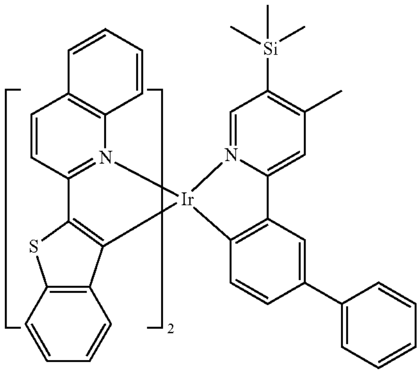
PD-103
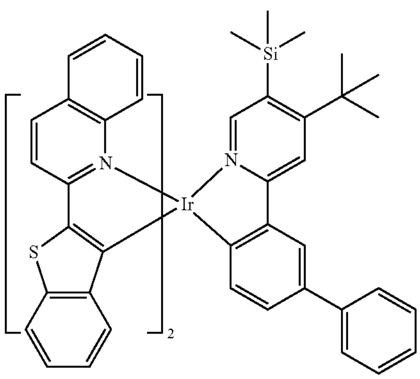
PD-104
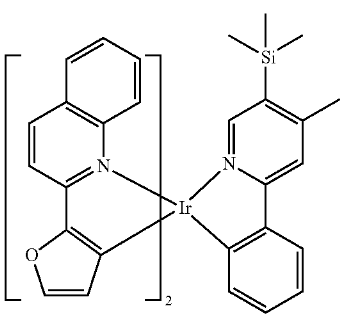
PD-105
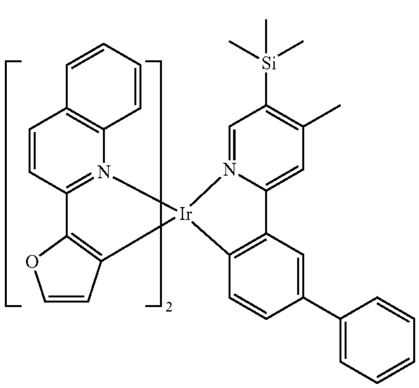
-continued
PD-106
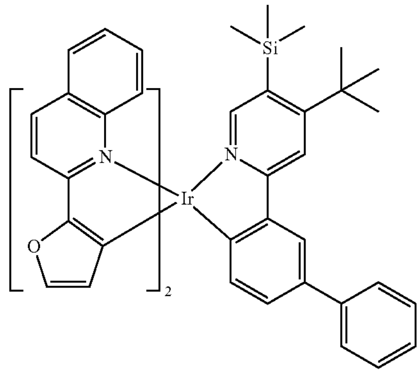
PD-107
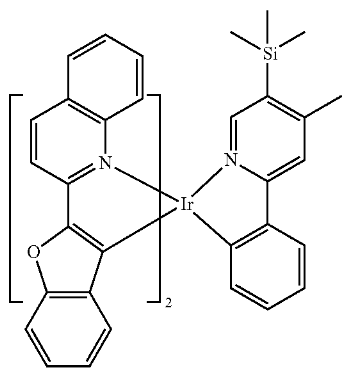
PD-108
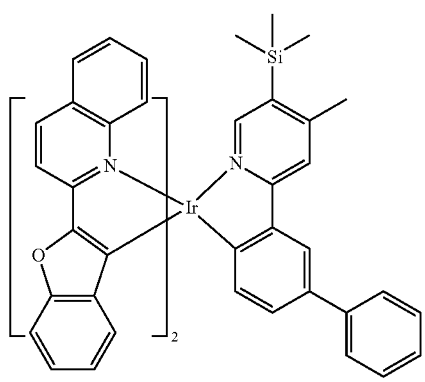
PD-109
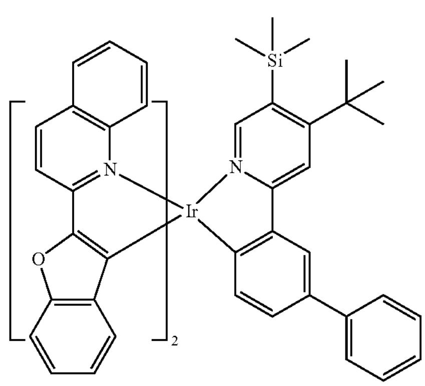

-continued
PD-110
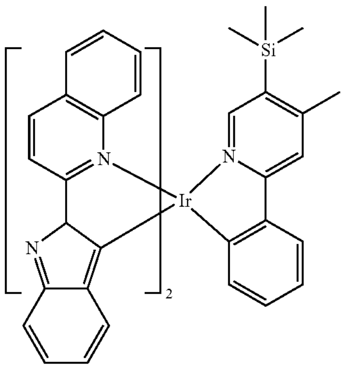
PD-111
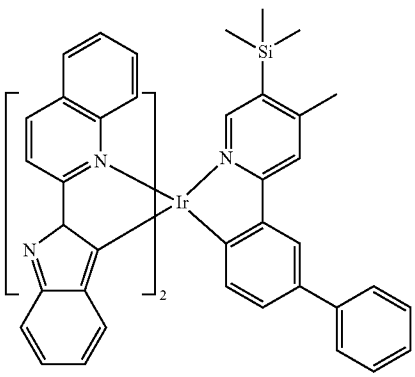
PD-112
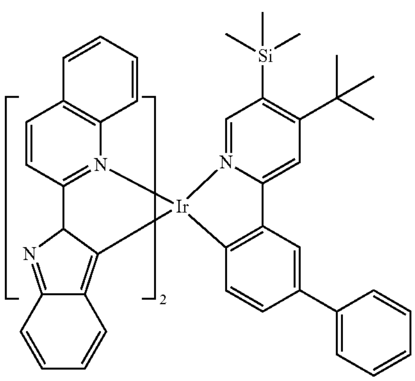
PD-113
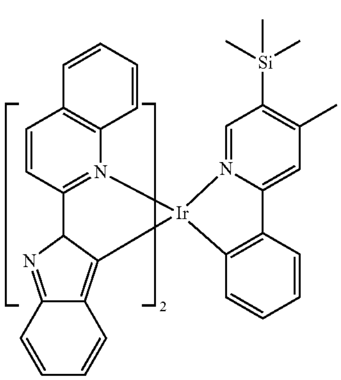
-continued
PD-114
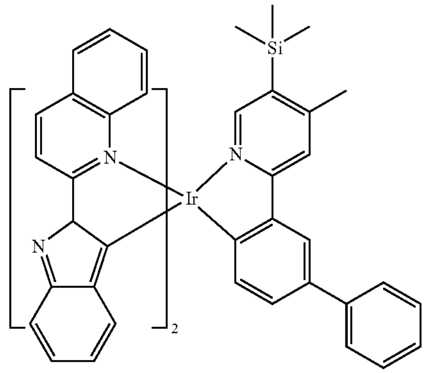
PD-115
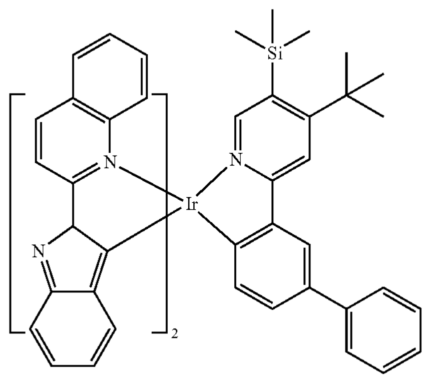
PD-116
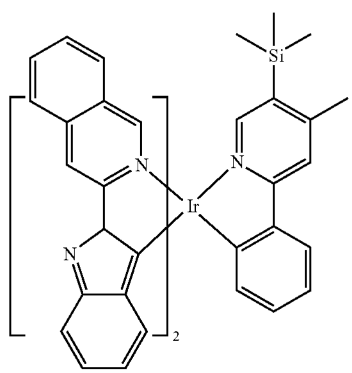
PD-117
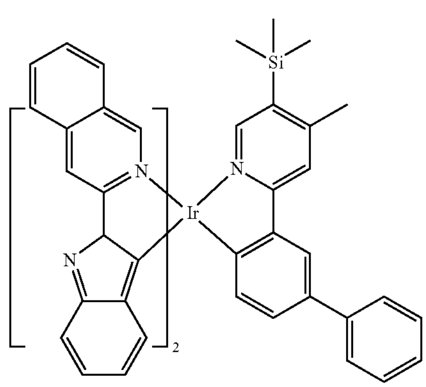

-continued
PD-118
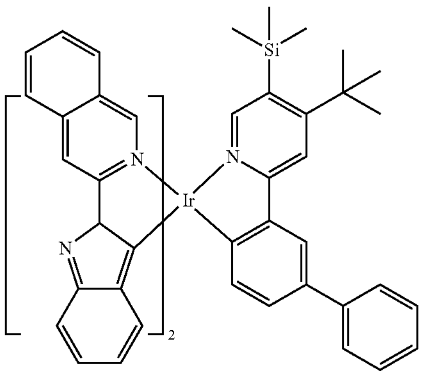
PD-119
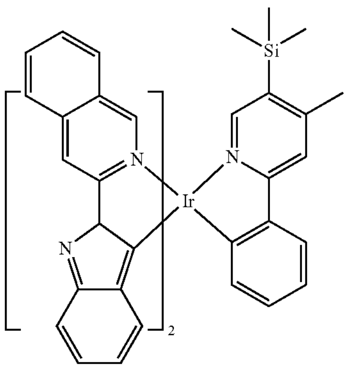
PD-120
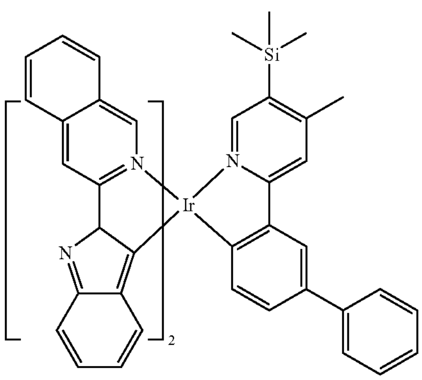
PD-121
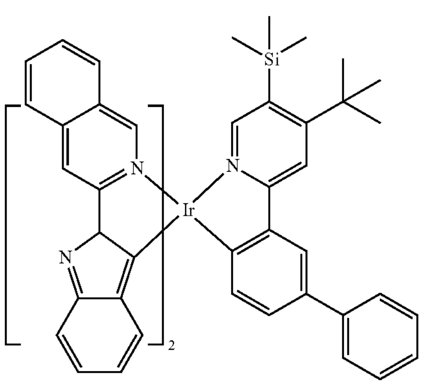
-continued
PD-122
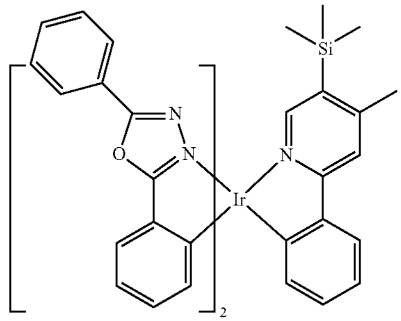
PD-123
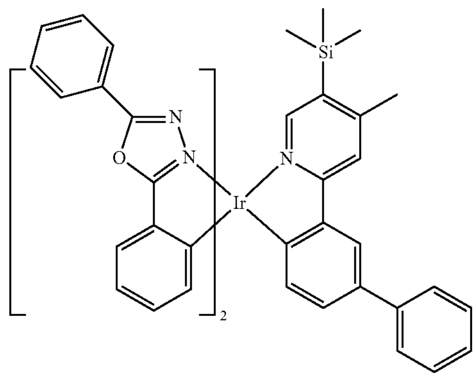
PD-124
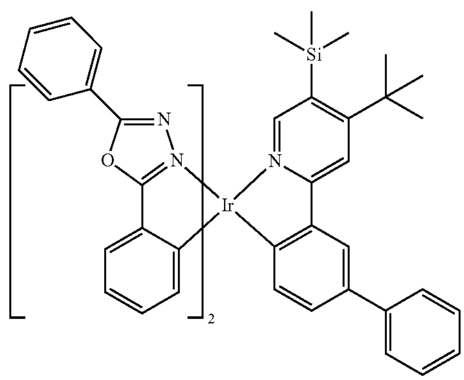
PD-125
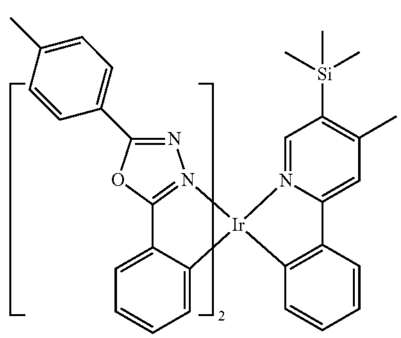

-continued
PD-126
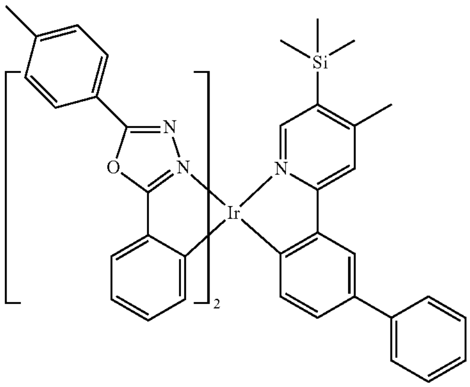
PD-127
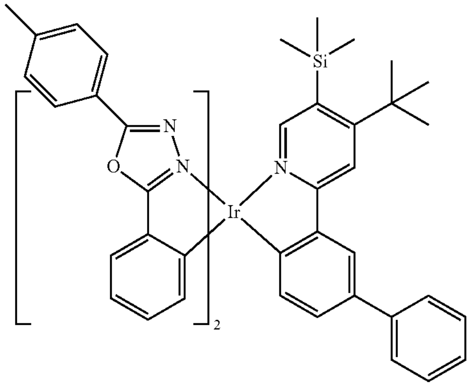
PD-128
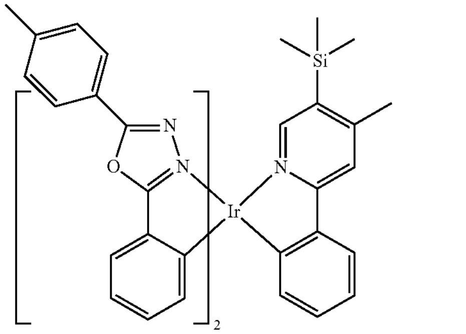
PD-129
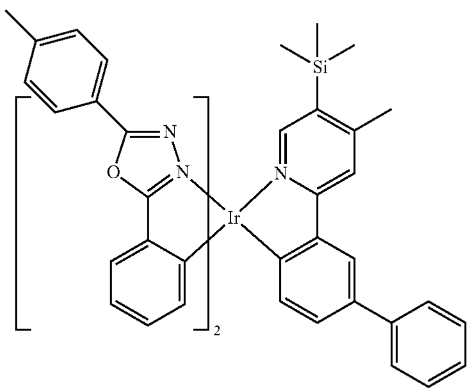
-continued
PD-130
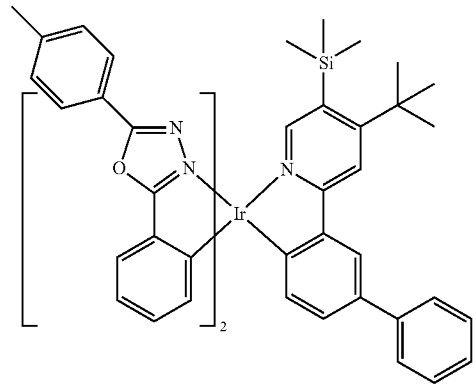
PD-131
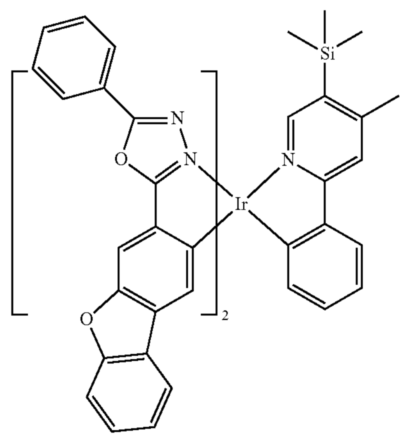
PD-132
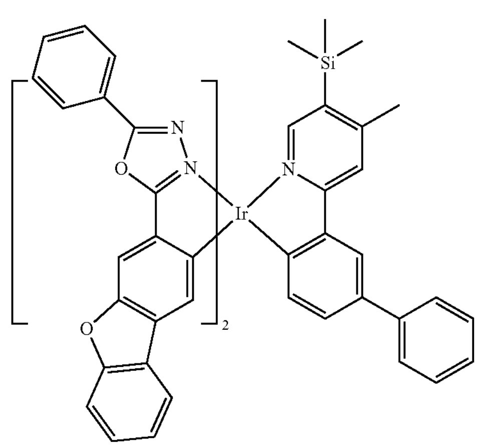

-continued
PD-133
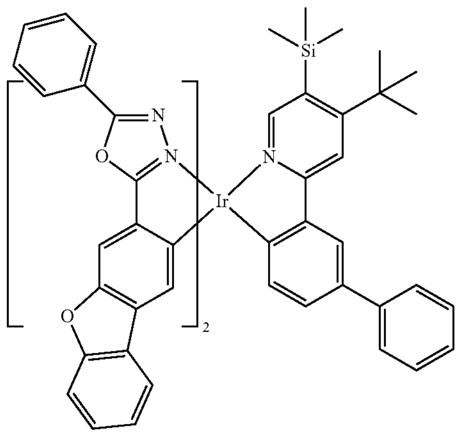
PD-134
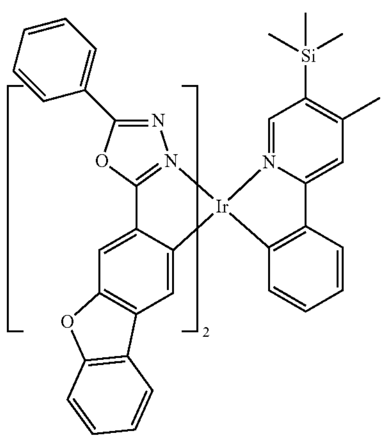
PD-135
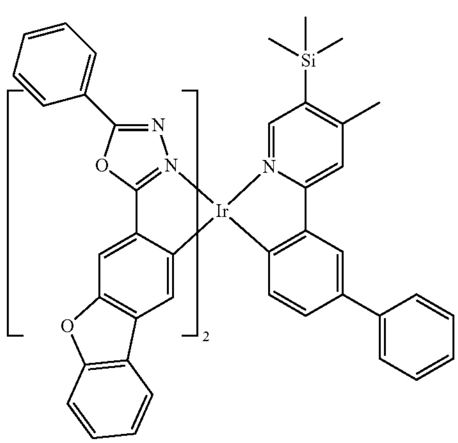
-continued
PD-136
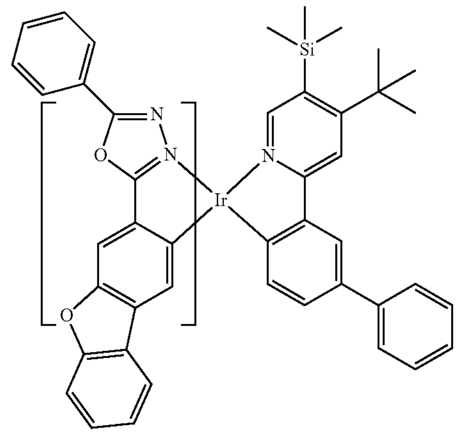
PD-137
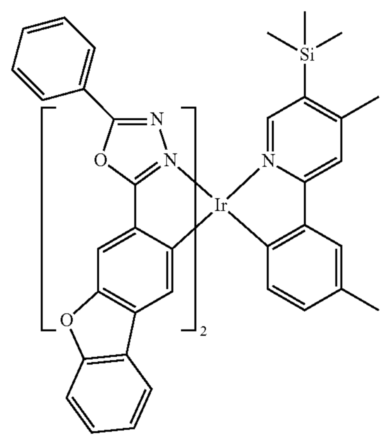
PD-138
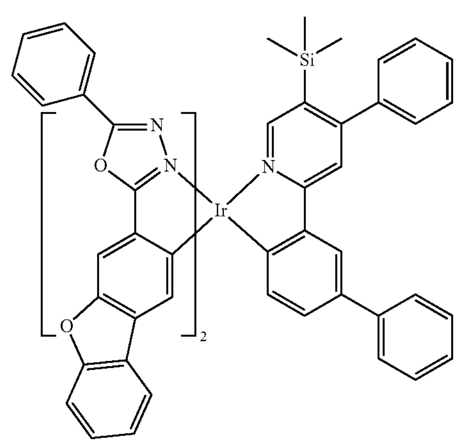

PD-139
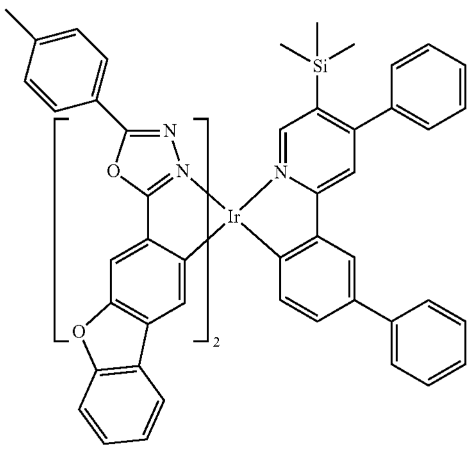
PD-140
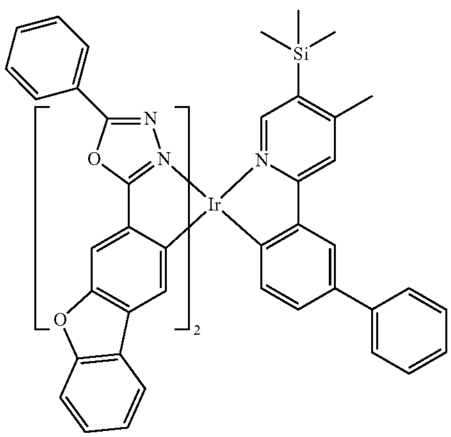
PD-141
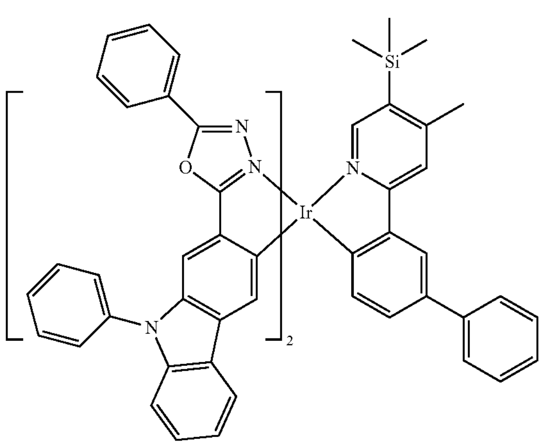
PD-142
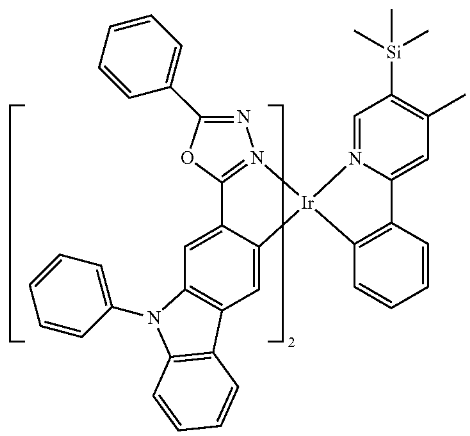
PD-143
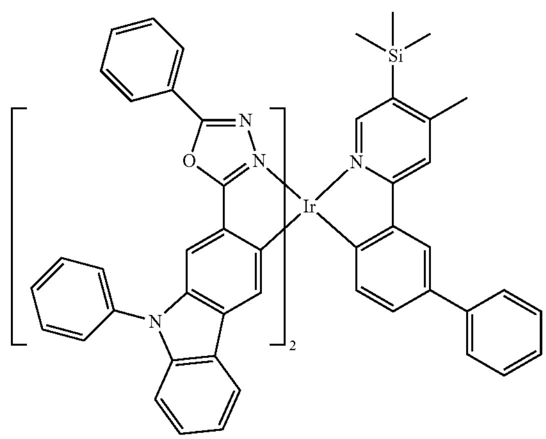
PD-144
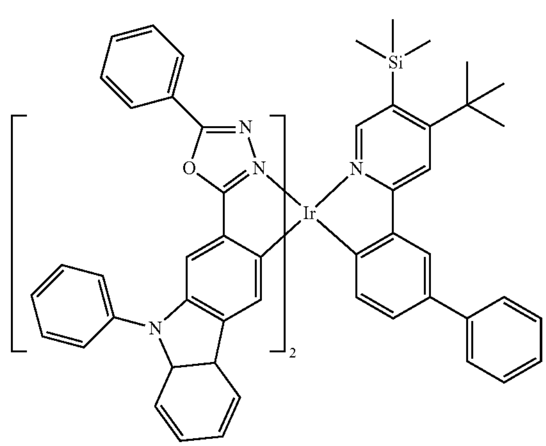

-continued
PD-145
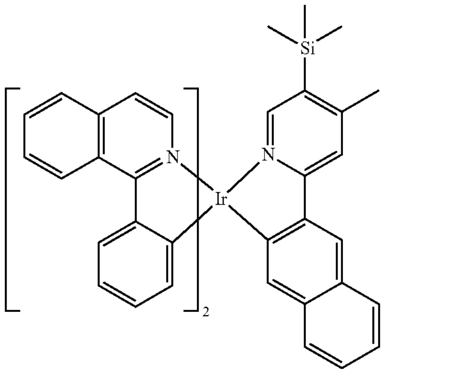
PD-146
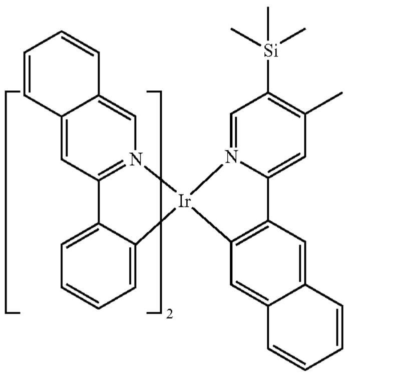
PD-147
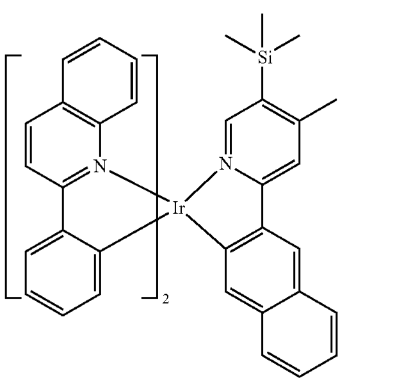
PD-148
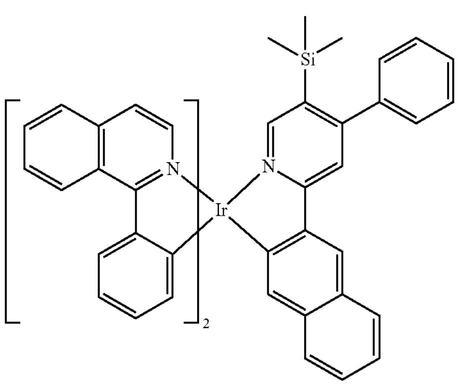
-continued
PD-149
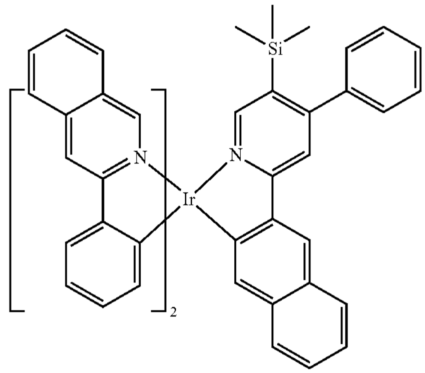
PD-150
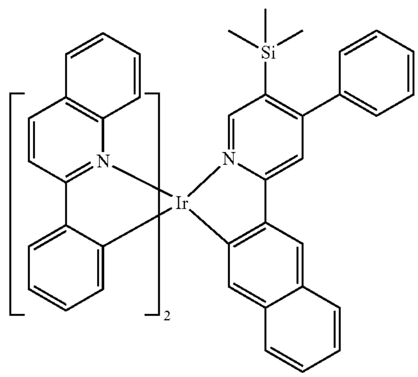
PD-151
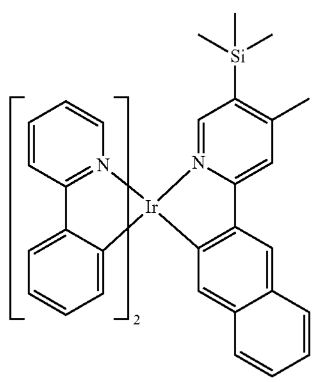
PD-152
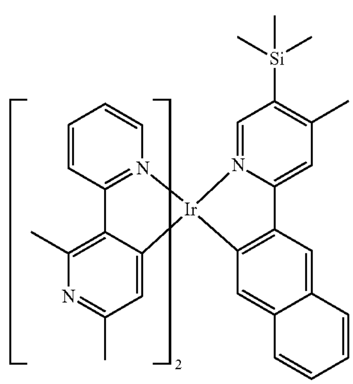

PD-153
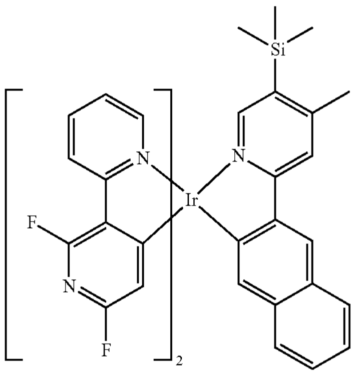
PD-154
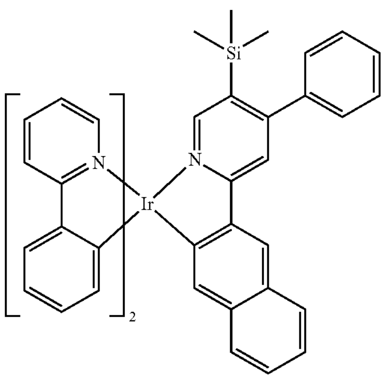
PD-155
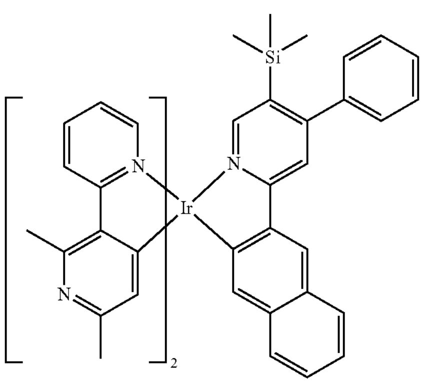
PD-156
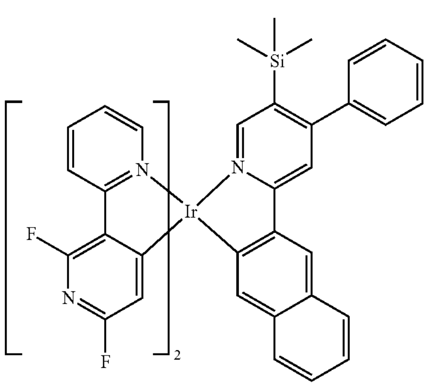
PD-157
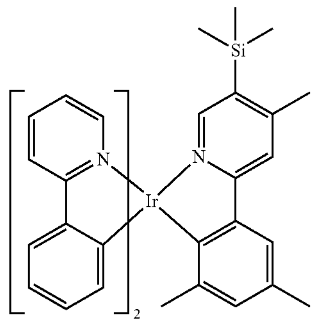
PD-158
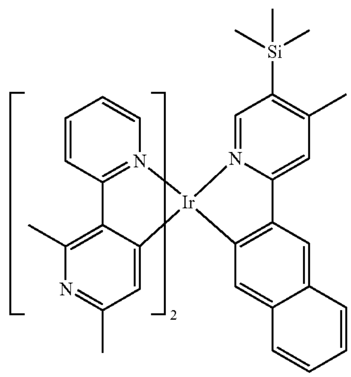
PD-159
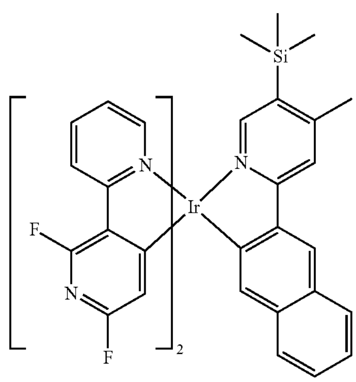
PD-160
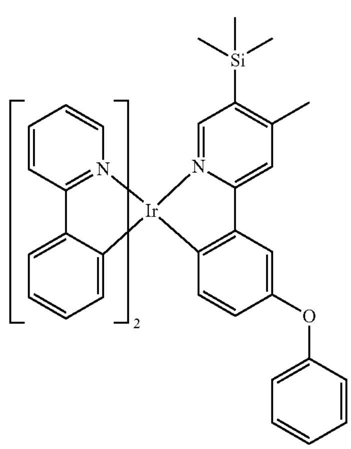

-continued
PD-161
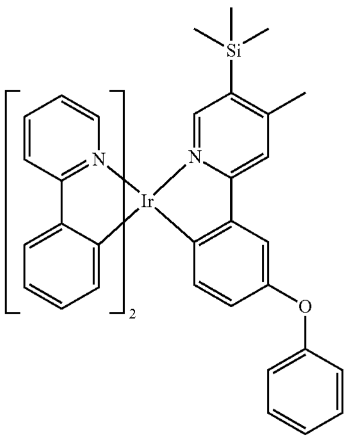
PD-162
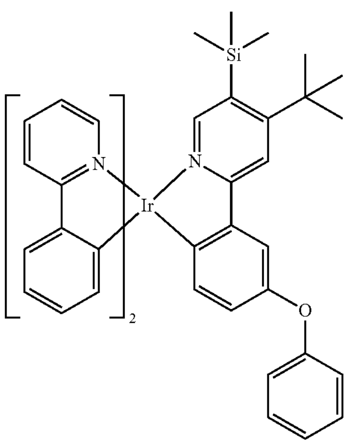
PD-163
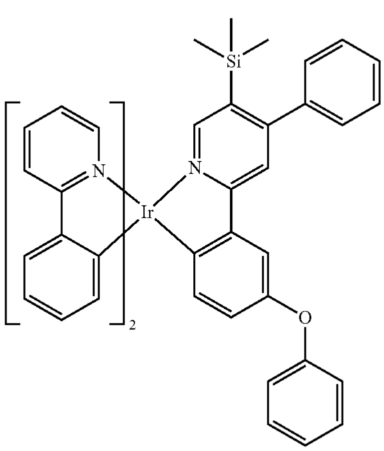
-continued
PD-164
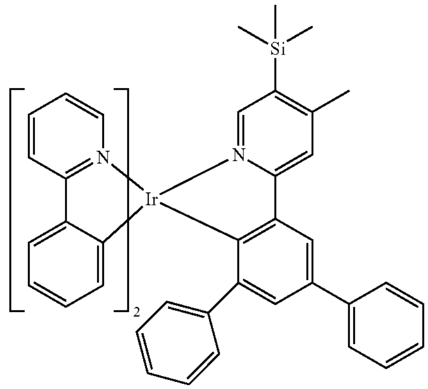
PD-165
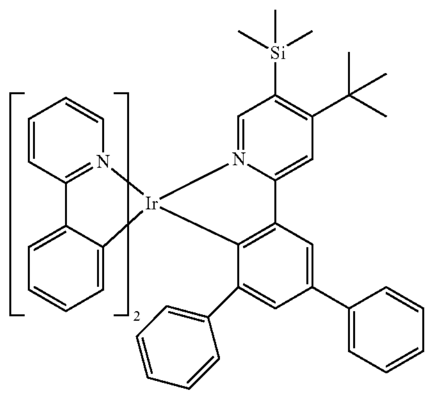
PD-166
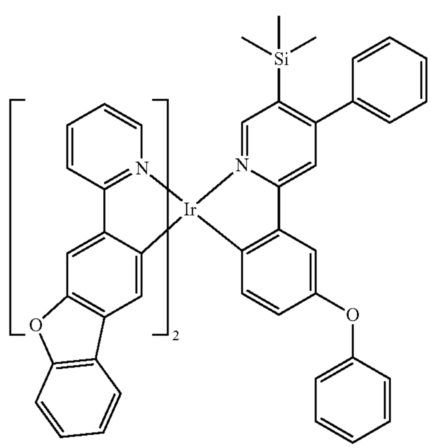

-continued
PD-167
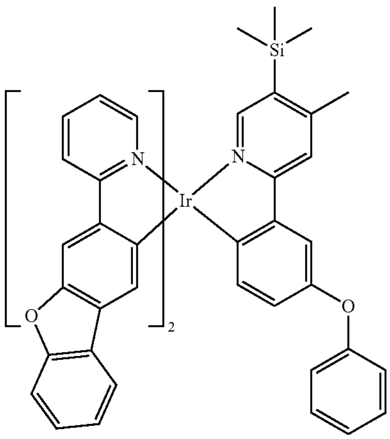
PD-168
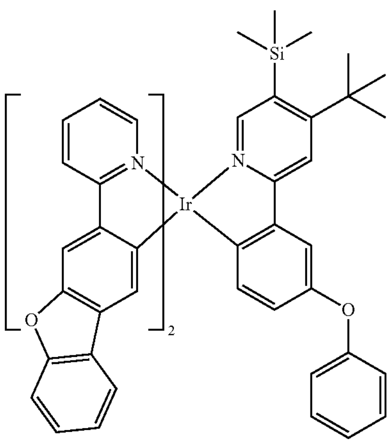
PD-169
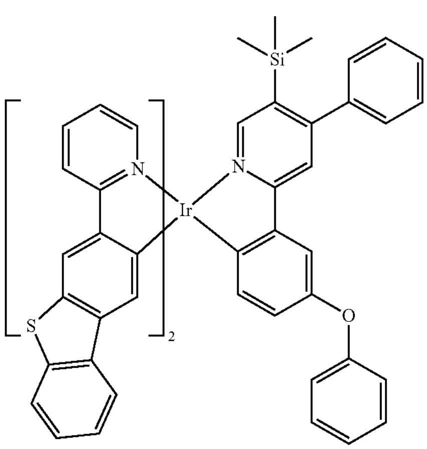
-continued
PD-170
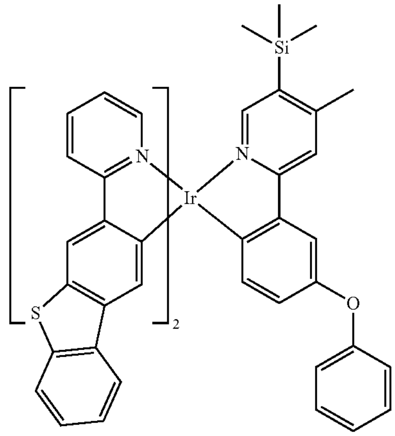
PD-171
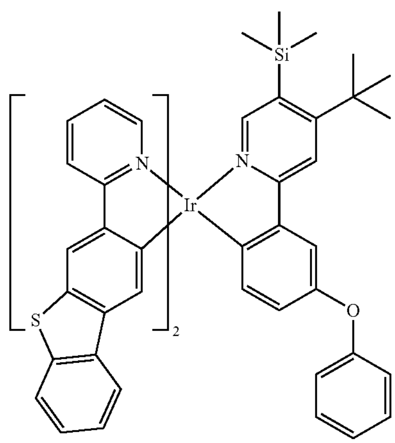
PD-172
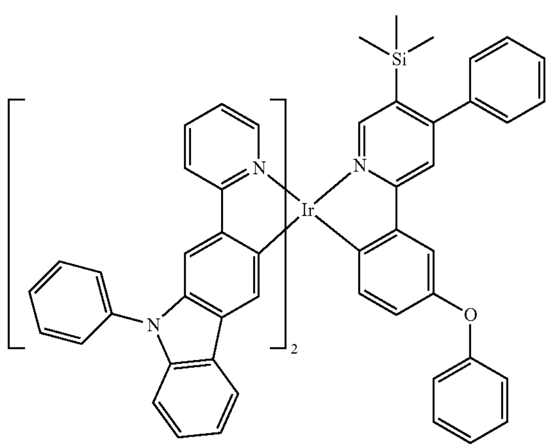

-continued
PD-173
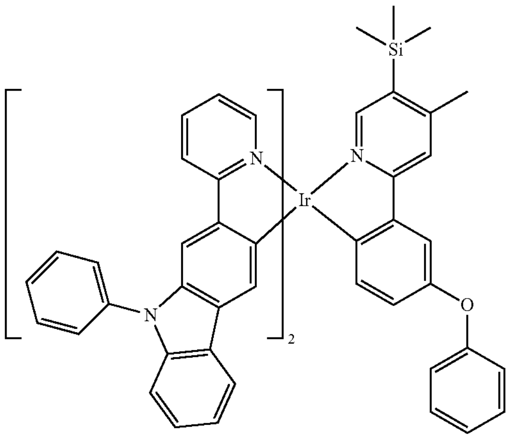
PD-174
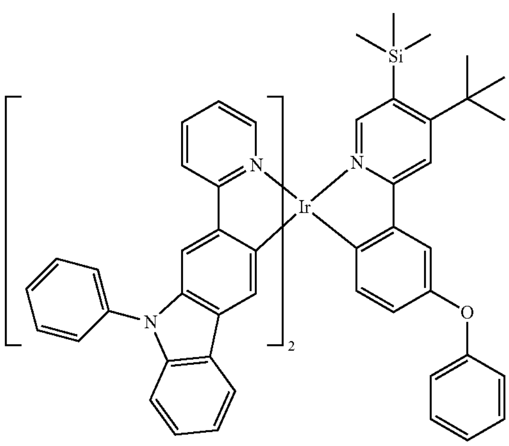
PD-175
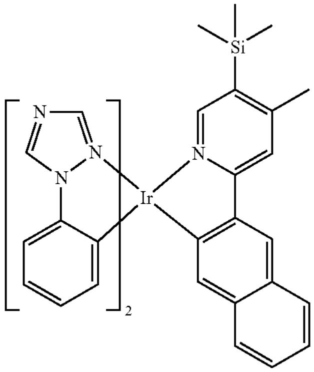
-continued
PD-176
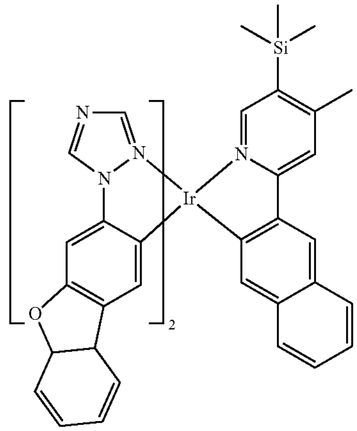
PD-177
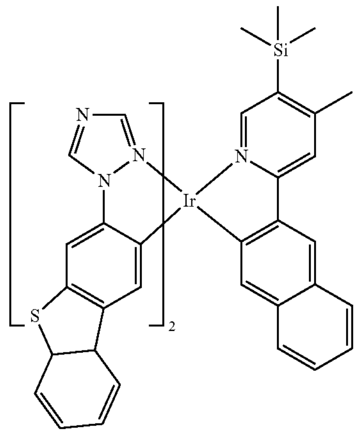
PD-178
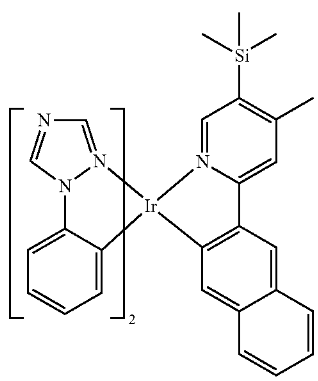
PD-179
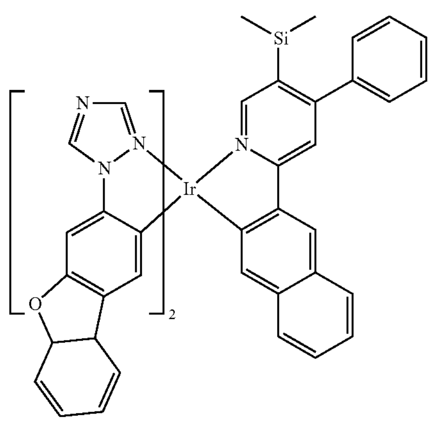

-continued
PD-180
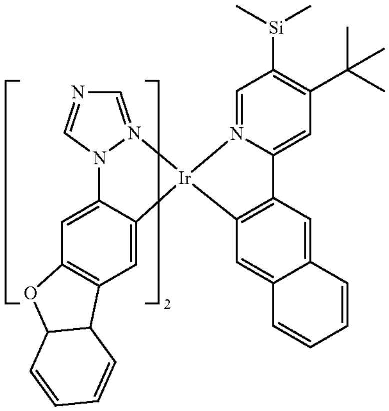
PD-181
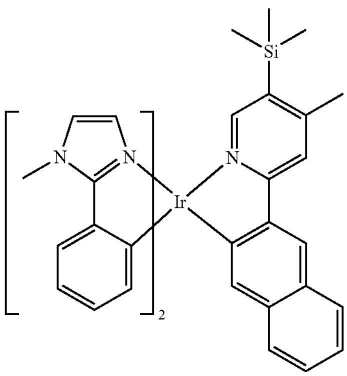
PD-182
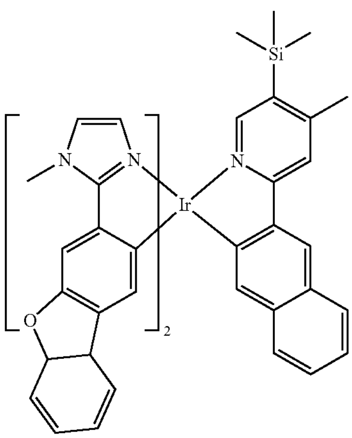
PD-183
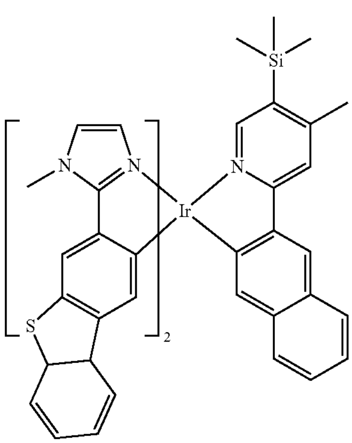
-continued
PD-184
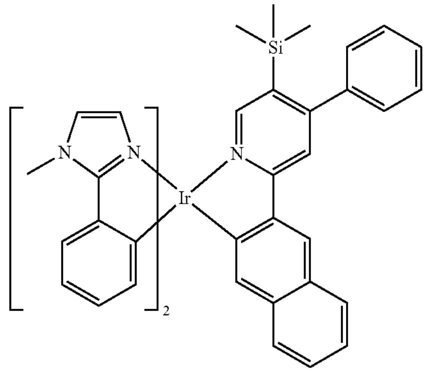
PD-185
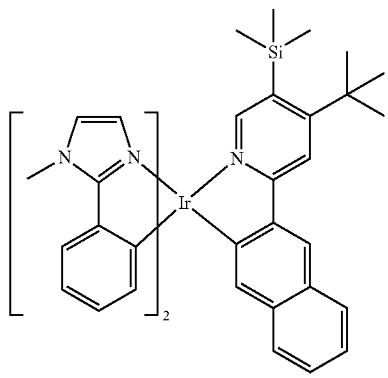
PD-186
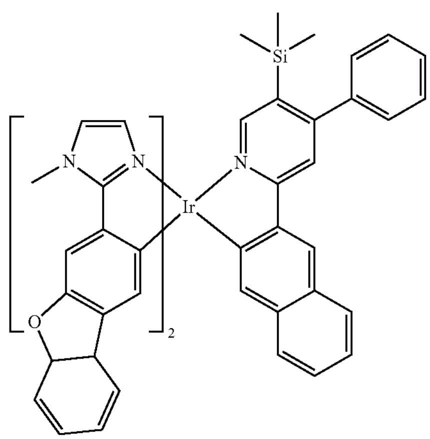
PD-187
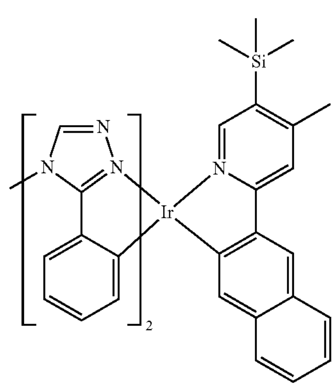

-continued

PD-188

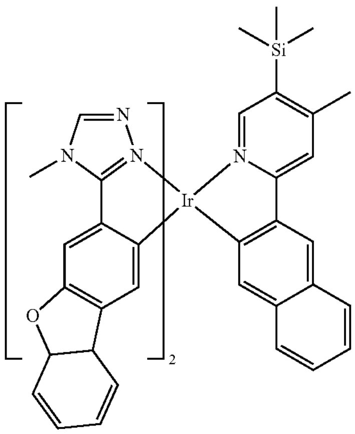

PD-189

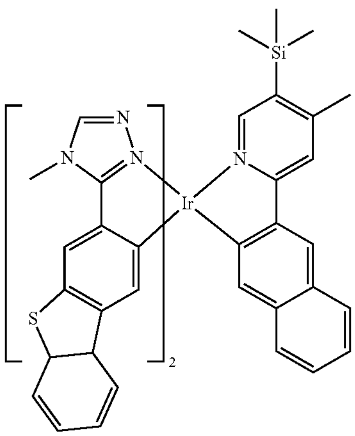

PD-190

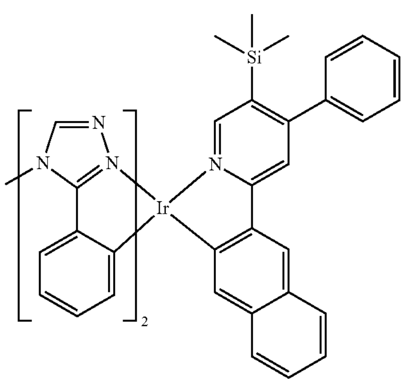

PD-191

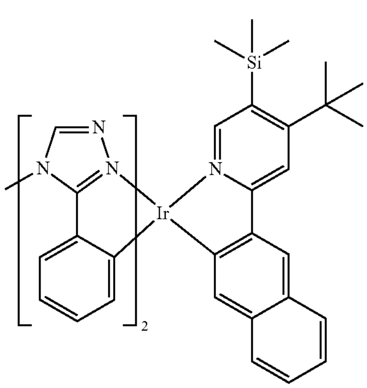

-continued

PD-192

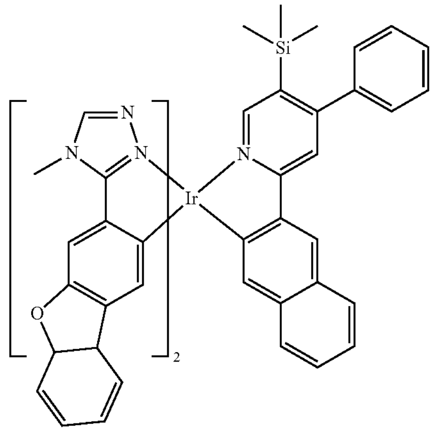

An amount of the organometallic compound included in the EML may be smaller than that of the host (e.g., the amount of the first host or the total amount of the first host and the second host). For example, the amount of the organometallic compound may be in a range of about 0.01 parts by weight to about 15 parts by weight based on 100 parts by weight of the host, but the amount is not limited thereto. In some embodiments, a volume percentage of the organometallic compound included in the EML may be in a range of about 0.01 v % to about 15 v %, but the volume percentage is not limited thereto.

The organometallic compound may be a dopant, and may emit green light or red light from the EML.

A thickness of the EML may be in a range of about 100 Å to about 1,000 Å, e.g., about 200 Å to about 600 Å. When the thickness of the EML is within any of these ranges, excellent emission characteristics may be obtained without a substantial increase in driving voltage.

The electron transport region may be disposed (e.g., positioned) on the EML.

The electron transport region may include at least one selected from an HBL, an ETL, and an EIL, but the electron transport region is not limited thereto.

For example, the electron transport region may have a structure of ETL/EIL or a structure of HBL/ETL/EIL, where the layers of each structure are sequentially stacked in the stated order from the EML, but the structure of the electron transport region is not limited thereto.

The electron transport region may include an HBL. When the EML includes a phosphorescent dopant, the HBL may serve as a layer that reduces or prevents triplet excitons or holes from being diffused into the ETL.

When the electron transport region includes a HBL, the HBL may be formed on the EML by using various suitable methods, such as vacuum deposition, spin coating, casting, a LB method, ink-jet printing, laser-printing, and/or LITI. When the HBL is formed by vacuum deposition and/or by spin coating, the deposition and coating conditions for the HBL may be determined by referring to the deposition and coating conditions for the HIL.

The HBL may include, for example, at least one selected from BCP and Bphen, but embodiments are not limited thereto.

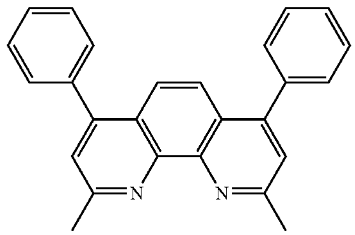

BCP

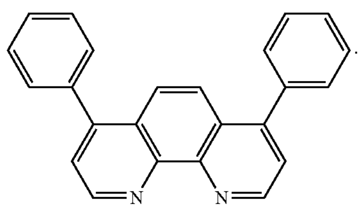

Bphen

A thickness of the HBL may be in a range of about 20 Å to about 1,000 Å, e.g., about 30 Å to about 300 Å. When the thickness of the HBL is within any of these ranges, excellent hole blocking characteristics may be obtained without a substantial increase in driving voltage.

The electron transport region may include an ETL, and the ETL may be formed on the EML or on the HBL by using various suitable methods, such as vacuum deposition, spin coating, casting, a LB method, ink-jet printing, laser-printing, and/or LITI. When the ETL is formed by vacuum deposition and/or by spin coating, the deposition and coating conditions for the ETL may be determined by referring to the deposition and coating conditions for the HIL.

The ETL may include at least one selected from BCP and Bphen (illustrated above) and $Alq_3$, Balq, TAZ, and NTAZ (illustrated below):

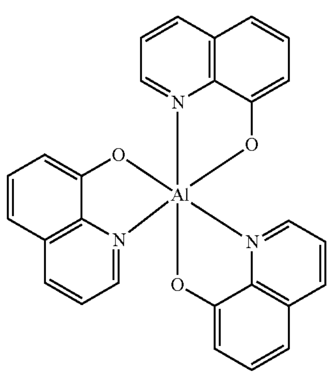

$Alq_3$

-continued

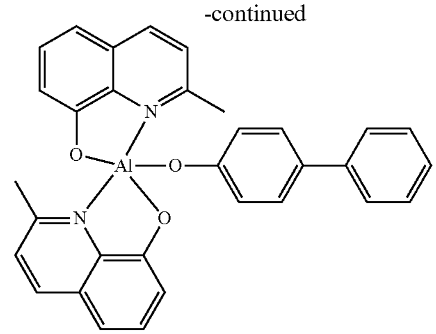

BAlq

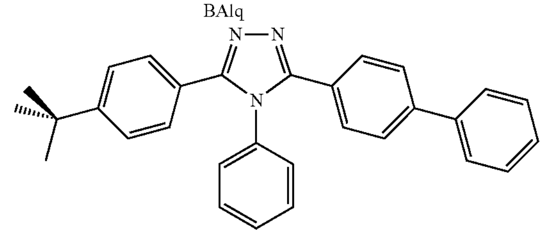

TAZ

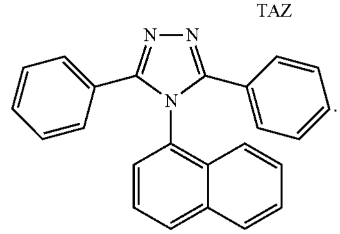

NTAZ

In some embodiments, the ETL may include at least one selected from compounds represented by Formula 601:

$$Ar_{601}\text{-}[(L_{601})_{xe1}\text{-}E_{601}]_{xe2}. \qquad \text{Formula 601}$$

In Formula 601, $Ar_{601}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —$Si(Q_{301})(Q_{302})(Q_{303})$ (where $Q_{301}$ to $Q_{303}$ may each be independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group), a description of $L_{601}$ may be as referred to in the description provided in connection with $L_{201}$, $E_{601}$ may be selected from a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, xe1 may be selected from 0, 1, 2, and 3, and xe2 may be selected from 1, 2, 3, and 4.

In some embodiments, the ETL may include at least one selected from compounds represented by Formula 602:

Formula 602

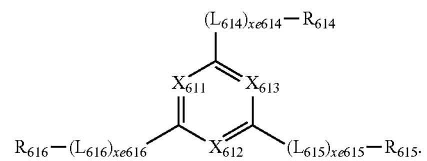

In Formula 602, $X_{611}$ may be N or C-$(L_{611})_{xe611}$-$R_{611}$, $X_{612}$ may be N or C-$(L_{612})_{xe612}$-$R_{612}$, and $X_{613}$ may be N or C-$(L_{613})_{xe613}$-$R_{613}$, wherein at least one selected from $X_{611}$ to $X_{613}$ may be N, descriptions of $L_{611}$ to $L_{616}$ may each be independently as referred to in the description provided in connection with $L_{201}$, $R_{611}$ to $R_{616}$ may each be independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and xe611 to xe616 may each be independently selected from 0, 1, 2, and 3.

The compound of Formula 601 and the compound of Formula 602 may each independently include at least one selected from Compounds ET1 to ET15:

-continued
ET1
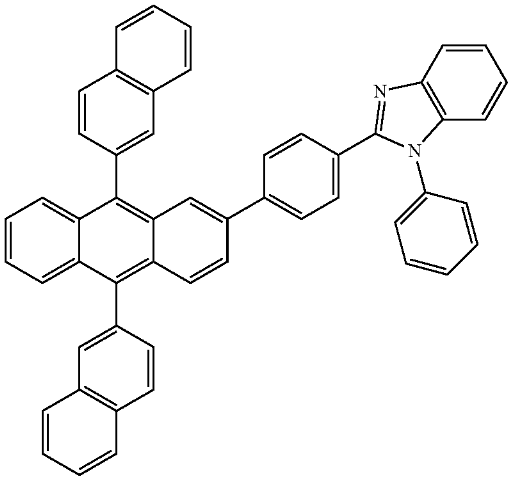
ET2
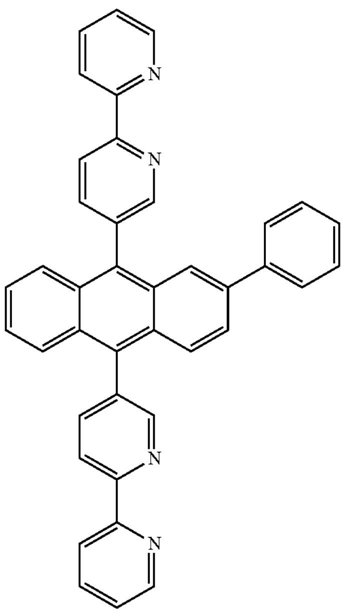
ET3
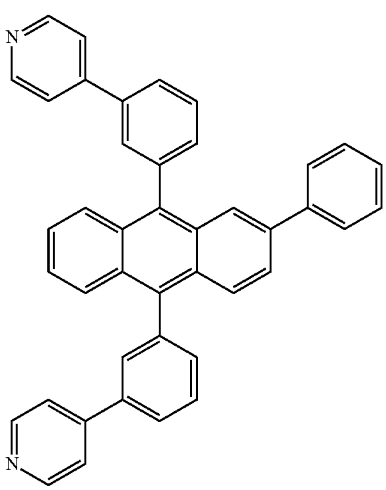
ET4
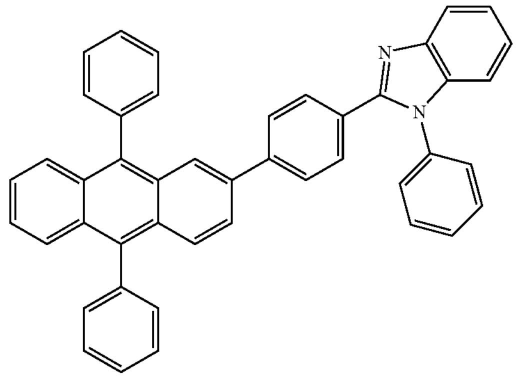
ET5
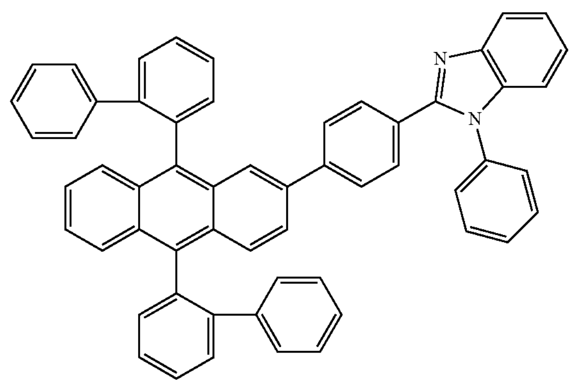
ET6
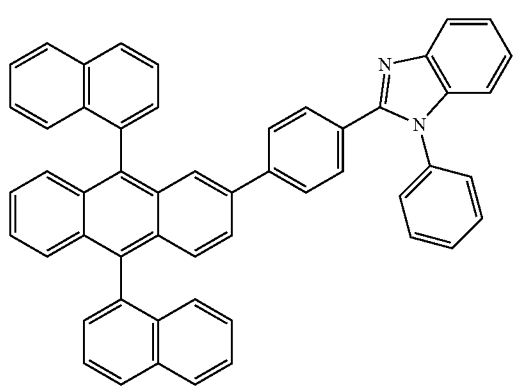

-continued
ET7
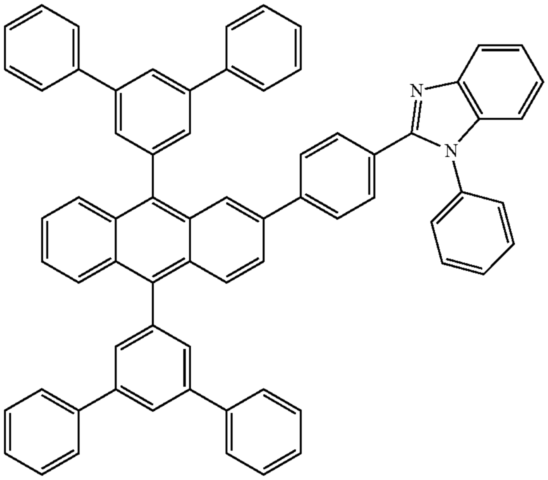
ET8
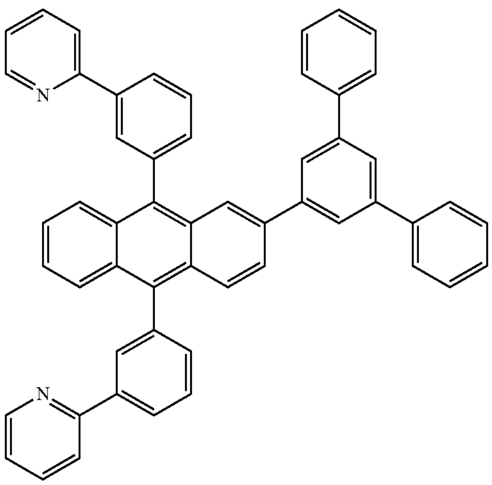
ET9
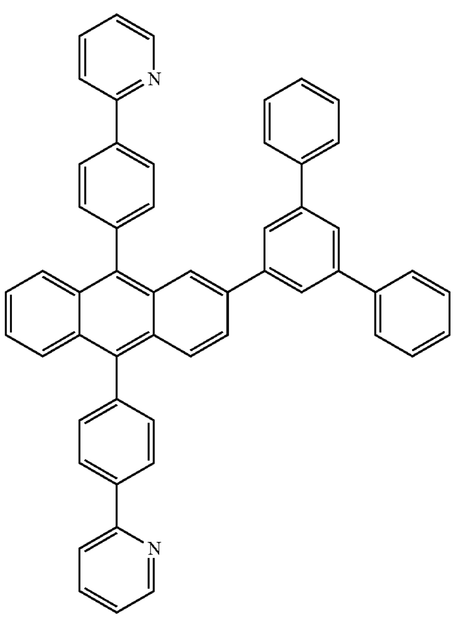
-continued
ET10
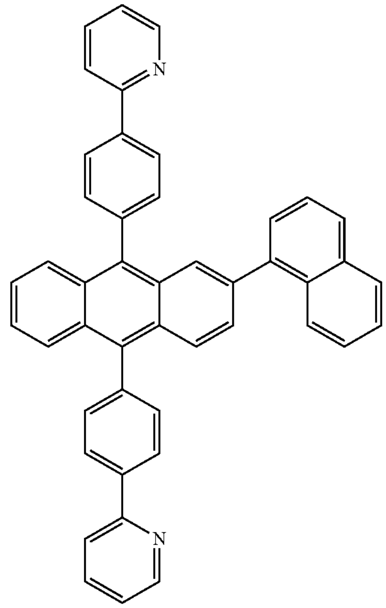
ET11
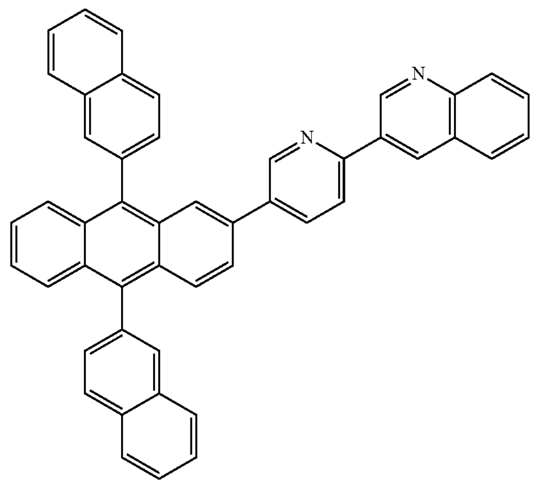
ET12
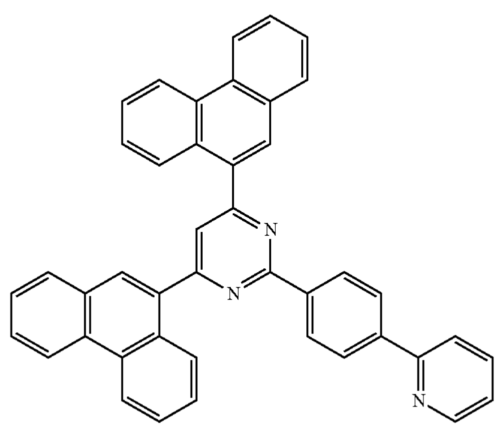

-continued

ET13

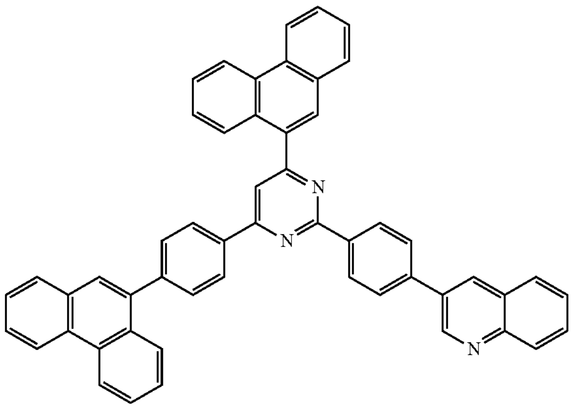

ET14

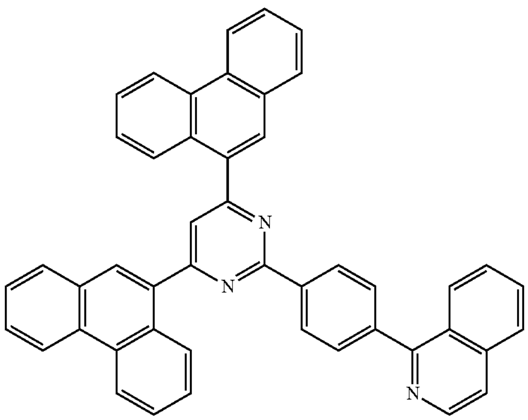

ET15

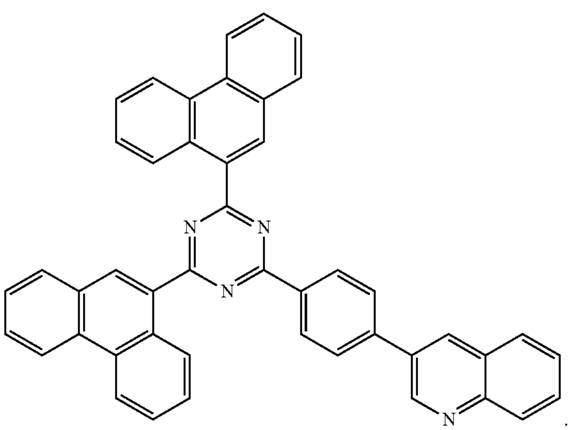

A thickness of the ETL may be in a range of about 100 Å to about 1,000 Å, e.g., about 150 Å to about 500 Å. When the thickness of the ETL is within any of these ranges, excellent electron transporting characteristics may be obtained without a substantial increase in driving voltage.

The ETL may further include, in addition to the materials described above, a metal-containing material.

The metal-containing material may include a Li complex. The Li complex may include, for example, Compound ET-D1 (e.g., lithium quinolate (LiQ)) and/or ET-D2.

ET-D1

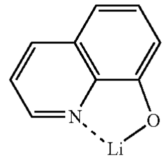

ET-D2

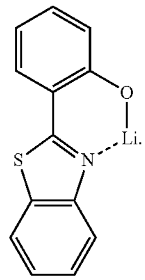

The electron transport region may include an EIL that facilitates electron injection from the second electrode 190.

The EIL may be formed on the ETL by using various suitable methods, such as vacuum deposition, spin coating, casting, a LB method, ink-jet printing, laser-printing, and/or LITI. When the EIL is formed by vacuum deposition and/or by spin coating, the deposition and coating conditions for the EIL may be determined by referring to the deposition and coating conditions for the HIL.

The EIL may include at least one selected from LiF, NaCl, CsF, $Li_2O$, BaO, and LiQ.

A thickness of the EIL may be in a range of about 1 Å to about 100 Å, e.g., about 3 Å to about 90 Å. When the thickness of the EIL is within any of these ranges, suitable or satisfactory electron injecting characteristics may be obtained without a substantial increase in driving voltage.

The second electrode 190 may be disposed (e.g., positioned) on the electron transport region. The second electrode may be a cathode, which is an electron injection electrode. Here, a material for forming the second electrode 190 may be a material having a relatively low work function, such as a metal, an alloy, an electrically conductive compound, or a mixture thereof. Non-limiting examples of the material for forming the second electrode 190 may include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may include ITO and/or IZO. The second electrode 190 may be a reflective electrode, a semi-transmissive electrode, or a transmissive electrode.

Hereinbefore, the organic light-emitting device 10 has been described in connection with FIG. 1, but embodiments of the present disclosure are not limited thereto.

The organic light-emitting device 10 may be used in a flat panel display including a thin film transistor. The thin film transistor may include a gate electrode, source and drain electrodes, a gate insulating film, and an activation layer, wherein one of the source and drain electrodes may be electrically coupled with the first electrode 110 of the organic light-emitting device 10. In addition, the activation layer may include crystalline silicon, amorphous silicon, an organic semiconductor, or an oxide semiconductor, but the activation layer is not limited thereto.

A $C_1$-$C_{60}$ alkyl group as used herein may refer to a linear or branched aliphatic hydrocarbon monovalent group having 1 to 60 carbon atoms, and non-limiting examples thereof include a methyl group, an ethyl group, an n-propyl group, an iso-propyl group, an n-butyl group, an iso-butyl group, a sec-butyl group, a tert-butyl group, pentyl group, an iso-amyl group, and a hexyl group. A $C_1$-$C_{60}$ alkylene group as used herein may refer to a divalent group having the same structure as the $C_1$-$C_{60}$ alkyl group.

A $C_1$-$C_{60}$ alkoxy group as used herein may refer to a monovalent group represented by —$OA_{101}$ (where $A_{101}$ is the $C_1$-$C_{60}$ alkyl group), and non-limiting examples thereof include a methoxy group, an ethoxy group, and an isopropyloxy group.

A $C_2$-$C_{60}$ alkenyl group as used herein may refer to a hydrocarbon group having at least one carbon double bond at one or more positions along a hydrocarbon chain of the $C_2$-$C_{60}$ alkyl group (e.g., in the middle or at either terminal end of the $C_2$-$C_{60}$ alkyl group), and non-limiting examples thereof include an ethenyl group, a propenyl group, and a butenyl group. A $C_2$-$C_{60}$ alkenylene group as used herein may refer to a divalent group having the same structure as the $C_2$-$C_{60}$ alkenyl group.

A $C_2$-$C_{60}$ alkynyl group as used herein may refer to a hydrocarbon group having at least one carbon triple bond at one or more positions along a hydrocarbon chain of the $C_2$-$C_{60}$ alkyl group (e.g., in a middle or at either terminal end of the $C_2$-$C_{60}$ alkyl group), and non-limiting examples thereof include an ethynyl group and a propynyl group. A $C_2$-$C_{60}$ alkynylene group as used herein may refer to a divalent group having the same structure as the $C_2$-$C_{60}$ alkynyl group.

A $C_3$-$C_{10}$ cycloalkyl group as used herein may refer to a monovalent hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. A $C_3$-$C_{10}$ cycloalkylene group used herein may refer to a divalent group having the same structure as the $C_3$-$C_{10}$ cycloalkyl group.

A $C_1$-$C_{10}$ heterocycloalkyl group as used herein may refer to a monovalent monocyclic group having at least one heteroatom selected from N, O, P, and S as a ring-forming atom and 1 to 10 carbon atoms, and non-limiting examples thereof include a tetrahydrofuranyl group and a tetrahydrothiophenyl group. A $C_1$-$C_{10}$ heterocycloalkylene group as used herein may refer to a divalent group having the same structure as the $C_1$-$C_{10}$ heterocycloalkyl group.

A $C_3$-$C_{10}$ cycloalkenyl group as used herein may refer to a monovalent monocyclic group that has 3 to 10 carbon atoms and at least one double bond in the ring thereof and does not have aromaticity (e.g., the ring is not aromatic), and non-limiting examples thereof include a cyclopentenyl group, a cyclohexenyl group, and a cycloheptenyl group. A $C_3$-$C_{10}$ cycloalkenylene group as used herein may refer to a divalent group having the same structure as the $C_3$-$C_{10}$ cycloalkenyl group.

A $C_1$-$C_{10}$ heterocycloalkenyl group as used herein may refer to a monovalent monocyclic group that has at least one heteroatom selected from N, O, P, and S as a ring-forming atom, 1 to 10 carbon atoms, and at least one double bond in the ring. Non-limiting examples of the $C_1$-$C_{10}$ heterocycloalkenyl group include a 2,3-hydrofuranyl group and a 2,3-hydrothiophenyl group. A $C_1$-$C_{10}$ heterocycloalkenylene group as used herein may refer to a divalent group having the same structure as the $C_1$-$C_{10}$ heterocycloalkenyl group.

A $C_6$-$C_{60}$ aryl group as used herein may refer to a monovalent group having a carbocyclic aromatic system having 6 to 60 carbon atoms, and a $C_6$-$C_{60}$ arylene group as used herein may refer to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and/or the $C_6$-$C_{60}$ arylene group include two or more rings, the respective rings may be fused to (with) each other.

A $C_1$-$C_{60}$ heteroaryl group as used herein may refer to a monovalent group having a carbocyclic aromatic system that has at least one heteroatom selected from N, O, P, and S as a ring-forming atom, and 1 to 60 carbon atoms. A $C_1$-$C_{60}$ heteroarylene group as used herein may refer to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and/or the $C_1$-$C_{60}$ heteroarylene group include two or more rings, the respective rings may be fused to each other.

A $C_6$-$C_{60}$ aryloxy group as used herein may refer to a monovalent group represented by —$OA_{102}$ (where $A_{102}$ is the $C_6$-$C_{60}$ aryl group), and a $C_6$-$C_{60}$ arylthio group as used herein may refer to a monovalent group represented by —$SA_{103}$ (where $A_{103}$ is the $C_6$-$C_{60}$ aryl group).

A monovalent non-aromatic condensed polycyclic group as used herein may refer to a monovalent group that has two or more rings condensed to each other, has carbon atoms only as ring-forming atoms, and has non-aromaticity in the entire molecular structure (e.g., does not have overall aromaticity). A non-limiting example of the monovalent non-aromatic condensed polycyclic group is a fluorenyl group. A divalent non-aromatic condensed polycyclic group as used herein may refer to a divalent group having the same structure as the monovalent non-aromatic condensed polycyclic group.

A monovalent non-aromatic condensed heteropolycyclic group as used herein may refer to a monovalent group that has two or more rings condensed to each other, has at least one heteroatom selected from N, O, P, and S as a ring-forming atom, in addition to carbon atoms, and has non-aromaticity in the entire molecular structure (e.g., does not have overall aromaticity). A non-limiting example of the monovalent non-aromatic condensed heteropolycyclic group is a carbazolyl group. A divalent non-aromatic condensed heteropolycyclic group used herein may refer to a divalent group having the same structure as the monovalent non-aromatic condensed heteropolycyclic group.

The term "Ph" as used herein may refer to a phenyl group, the term "Me" as used herein may refer to a methyl group, the term "Et" as used herein may refer to an ethyl group, and the term "ter-Bu" or "$Bu^t$" as used herein may refer to a tert-butyl group.

Hereinafter, an organic light-emitting device according to an example embodiment will be described in more detail with reference to Examples below. However, these examples are for illustrative purposes only and are not intended to limit the scope of the present disclosure.

EXAMPLES

Compounds used in Examples 1 to 4 are as follows:

HT-18

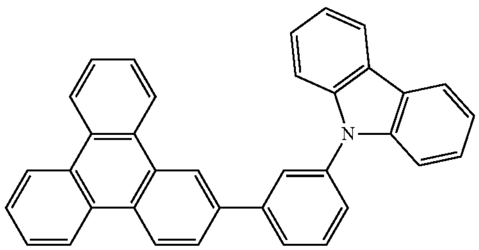

HT-34

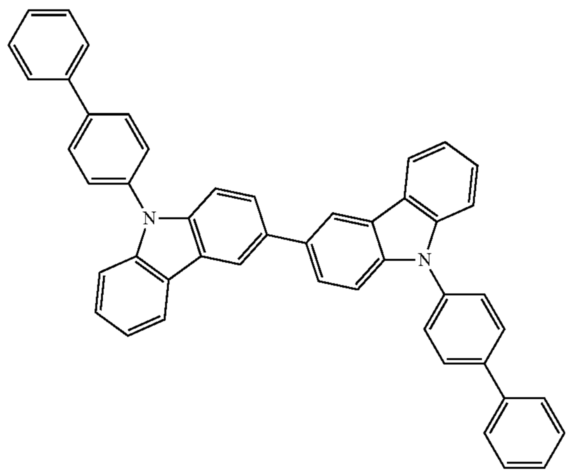

HT-45

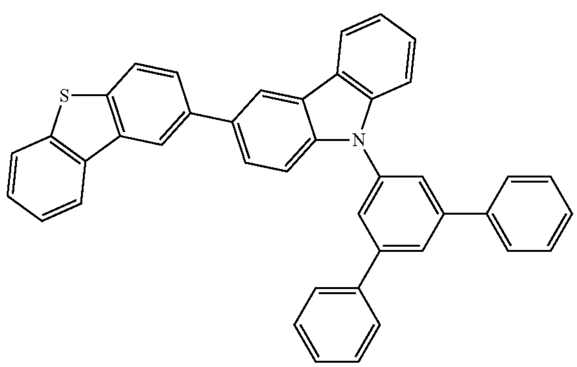

HT-50

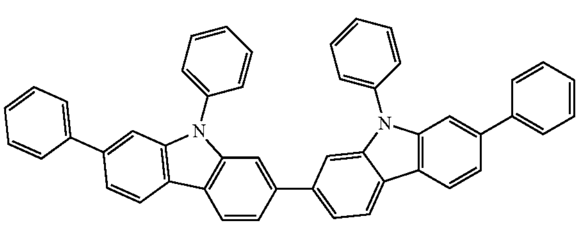

-continued

ET-8

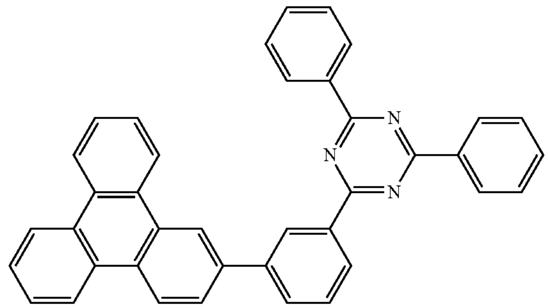

ET-61

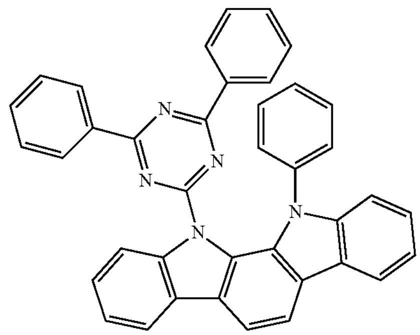

ET-73

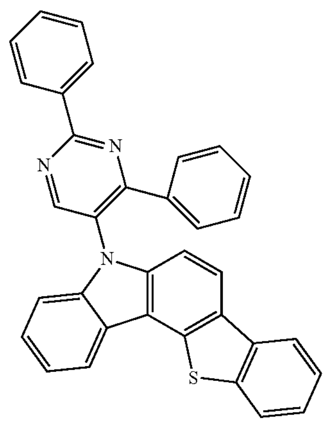

PD-19

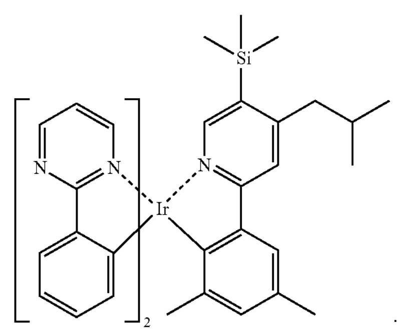

Example 1

As an anode, a 15 Ω/cm² (1,200 Å) ITO glass substrate (manufactured by Corning, Inc. company) was cut into a size of 50 mm×50 mm×0.7 mm and ultrasonically washed with isopropyl alcohol and pure water, each for 5 minutes. Afterwards, the ITO glass substrate was irradiated by UV light for 30 minutes, cleaned by exposure to ozone, and then, mounted on a vacuum depositor.

m-MTDATA was vacuum-deposited on the substrate to form a hole injection layer (HIL) having a thickness of 300 Å, and then, NPB was vacuum-deposited on the HIL to form a hole transport layer (HTL) having a thickness of 600 Å. Subsequently, Compound 4 was deposited on the HTL to form an auxiliary layer having a thickness of 100 Å.

HT-18, ET-61, and PD-19 were co-deposited on the auxiliary layer at a weight ratio of 72:18:10 to form an emission layer (EML) having a thickness of 300 Å. Subsequently, ET1 and LiF were co-deposited at a weight ratio of 1:1 on the EML to form an electron transport layer (ETL) having a thickness of 300 Å. LiF was vacuum-deposited on the ETL to form an electron injection layer (EIL) having a thickness of 10 Å, and Al was vacuum-deposited on the EIL to form a cathode having a thickness of 1,000 Å, thereby manufacturing an organic light-emitting device.

Example 2

An organic light-emitting device was manufactured in the same (or substantially the same) manner as in Example 1, except that in forming the EML, HT-50 and ET-8 were used instead of HT-18 and ET-61, respectively.

Example 3

An organic light-emitting device was manufactured in the same (or substantially the same) manner as in Example 1, except that in forming the EML, HT-34 and ET-73 were used instead of HT-18 and ET-61, respectively.

Example 4

An organic light-emitting device was manufactured in the same (or substantially the same) manner as in Example 1, except that in forming the EML, HT-45 was used instead of HT-18.

Comparative Example 1

An organic light-emitting device was manufactured in the same (or substantially the same) manner as in Example 1, except that in forming the EML, mCP was used instead of both HT-18 and ET-61.

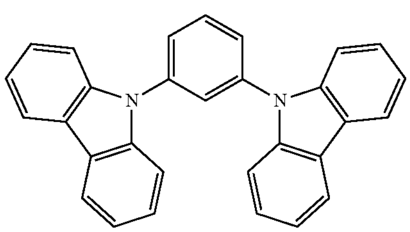

mCP

Comparative Example 2

An organic light-emitting device was manufactured in the same (or substantially the same) manner as in Example 1, except that in forming the EML, Compound X was used instead of PD-19.

Compound X

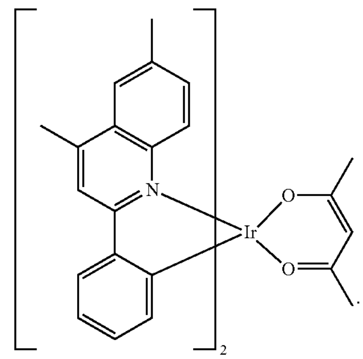

Evaluation Example 1

Figure 2:
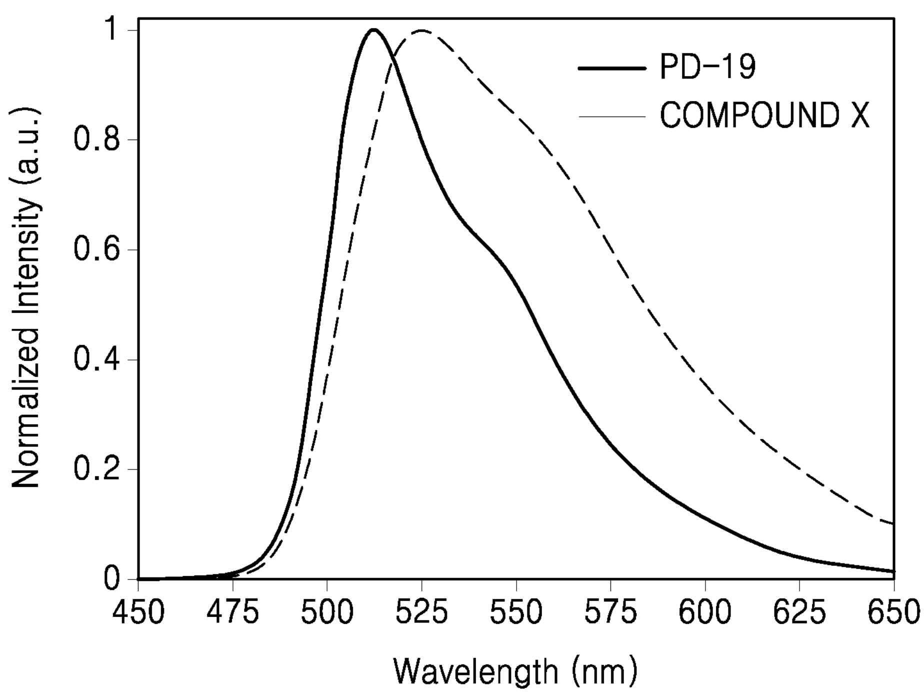
FIG. 2 is a diagram showing a photoluminescence (PL) spectrum of a dopant solution according to an example embodiment.

Photoluminescence (PL) spectra of PD-19 used in Example 1 and Compound X used in Comparative Example 2 were measured, and the results are shown in FIG. 2.

Referring to FIG. 2, it can be seen that there was a blue shift of 12 nm in the PL spectra of PD-19 ($\lambda_{max}$=512 nm) relative to the PL spectra of Compound X ($\lambda_{max}$=524 nm), and that the half-width (e.g., half width at half maximum (HWHM)) of PD-19 relative to the PL spectra of the Compound X was decreased from 80 nm to 52 nm (i.e., a decrease of 28 nm).

Evaluation Example 2

Figure 3:
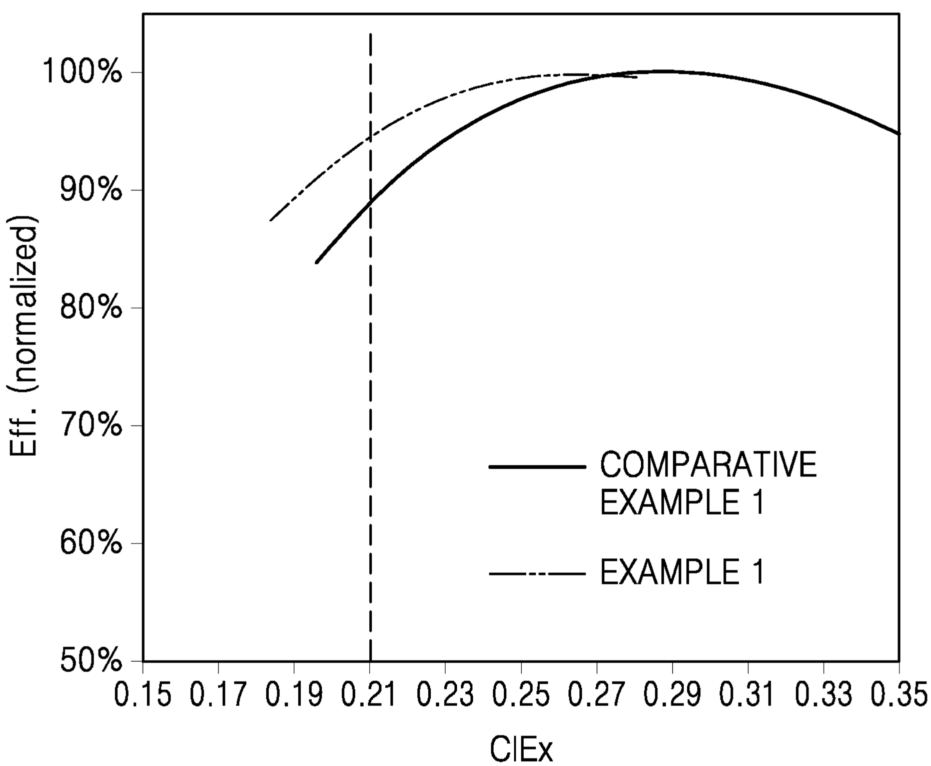
FIG. 3 is a graph plotting color coordinates associated with efficiency according to an example embodiment.

The organic light-emitting devices of Examples 1 to 4 and Comparative Examples 1 and 2 were subjected to measure and evaluation of driving voltages, efficiencies, lifespans (at a current density of 1,000 nit), and color coordinates by using a PR650 (Spectroscan) Source Measurement Unit (available from PhotoResearch, Inc.), and the results are shown in Table 1 and FIG. 3. In Table 1, the term "efficiency" may refer to a relative efficiency, and the term "lifespan" may refer to a relative lifespan, among the organic light-emitting devices.

TABLE 1

| Organic light-emitting device | First host | Second host | Dopant | Weight ratio of first host and second host | Driving voltage (V) | Efficiency | Lifespan |
|---|---|---|---|---|---|---|---|
| Example 1 | HT-18 | ET-61 | PD-19 | 8:2 | 5.1 | 1 | 1.3 |
| Example 2 | HT-50 | ET-8 | PD-19 | 8:2 | 4.5 | 1.3 | 1.8 |
| Example 3 | HT-34 | ET-73 | PD-19 | 8:2 | 4.1 | 1.5 | 1.5 |
| Example 4 | HT-45 | ET-73 | PD-19 | 8:2 | 4.2 | 1.6 | 1.6 |
| Comparative Example 1 | mCP | — | PD-19 | — | 4.6 | 1 | 1 |

TABLE 1-continued

| Organic light-emitting device | First host | Second host | Dopant | Weight ratio of first host and second host | Driving voltage (V) | Efficiency | Life-span |
|---|---|---|---|---|---|---|---|
| Comparative Example 2 | HT-18 | ET-61 | Compound X | 8:2 | 5.0 | 0.7 | 0.6 |

Referring to Table 1, it can be seen that the organic light-emitting devices of Examples 1 to 4 had improved efficiencies and lifespans compared to those of the organic light-emitting devices of Comparative Examples 1 and 2.

Referring to FIG. 3, it can be seen that light emitted from the organic light-emitting device manufactured in Example 1 had a shorter wavelength than that of light emitted from the organic light-emitting device manufactured in Comparative Example 2. In addition, it was confirmed that, compared to the organic light-emitting device of Comparative Example 2, light emitted from the organic light-emitting device manufactured in Example 1 was shifted towards short wavelengths based on the light emission wavelengths in CIEx, and there was little change in the efficiency at the x-coordinate value of 0.21. In addition, as shown in Evaluation Example 1, the half-width of PD-19 used in Example 1 was decreased compared to that of Compound X used in Comparative Example 2 (i.e., a decrease from 80 nm to 52 nm), leading to the improvement of the intensity in the actual peak areas. Accordingly, the efficiency of the organic light-emitting device could be maintained.

Hereinafter, compounds used in manufacturing organic light-emitting devices manufactured in Examples 1-1A to 1-33A and Comparative Examples 1-1A to 1-6A are as follows:

HT

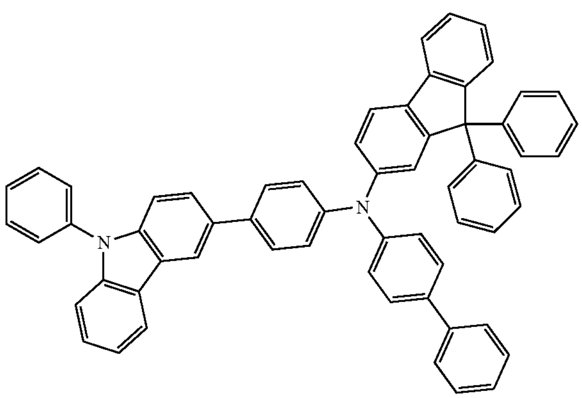

ET1

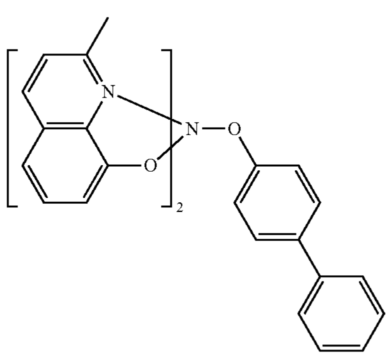

-continued

ET2

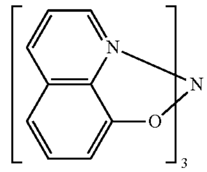

H-1

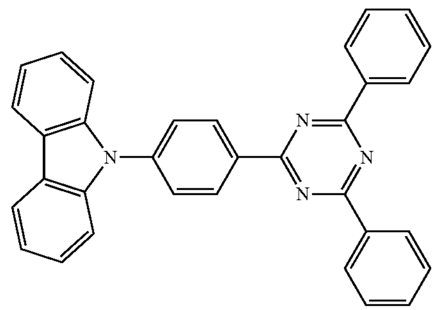

H-2

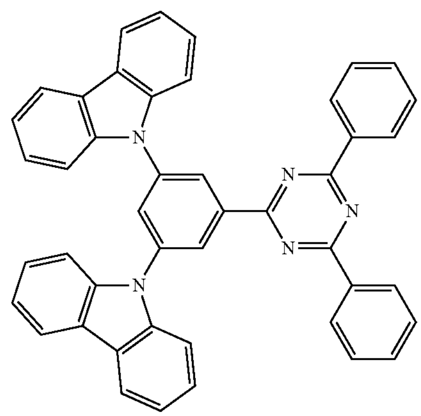

H-3

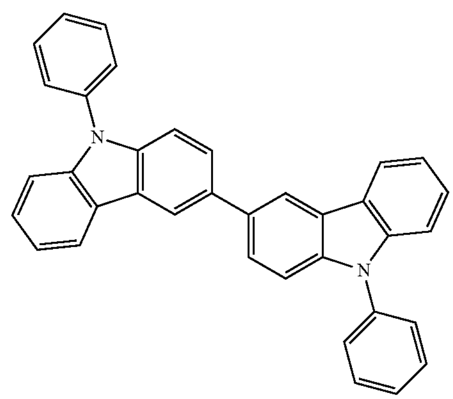

-continued
H-4
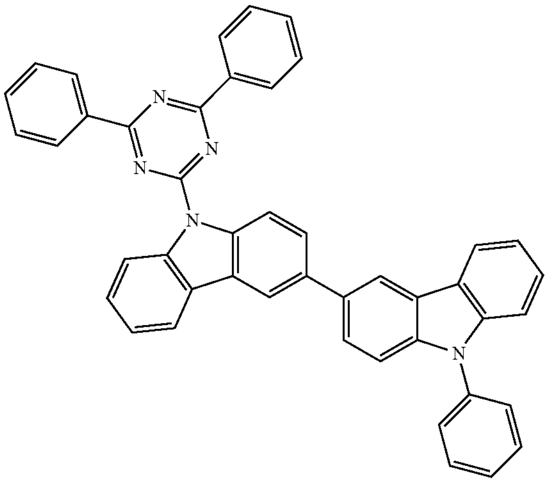
H-5
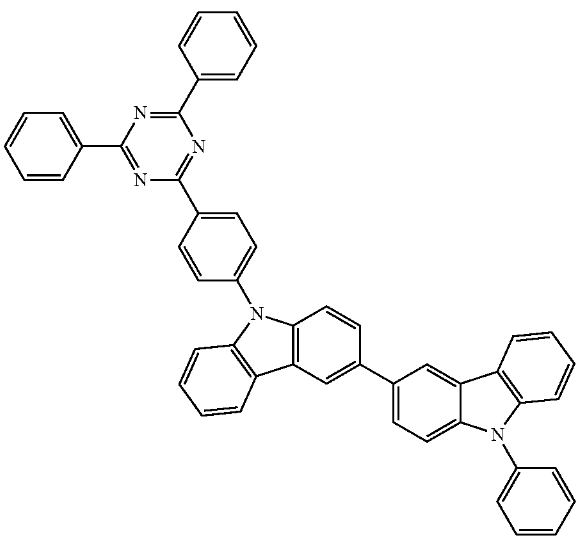
H-6
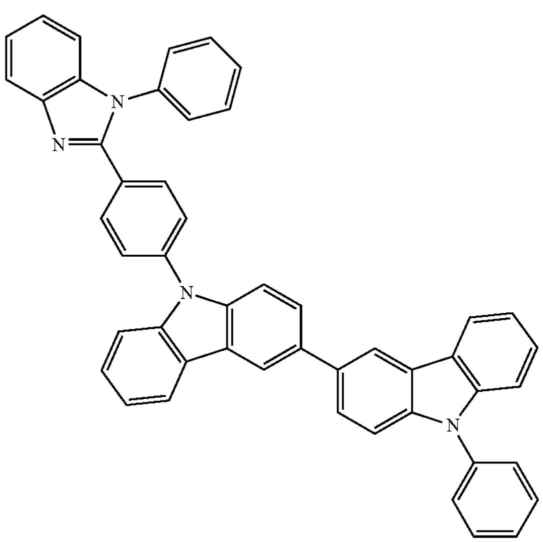
-continued
H-7
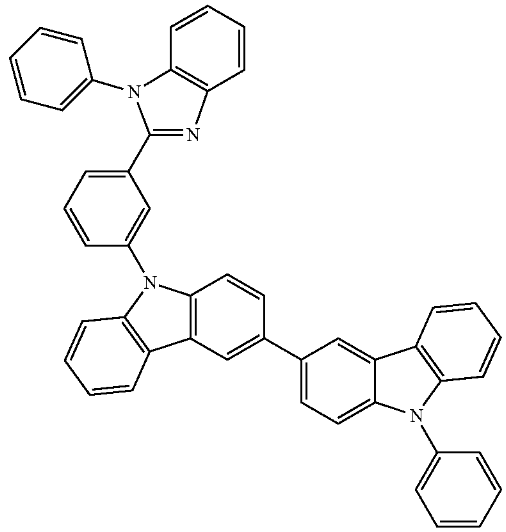
H-8
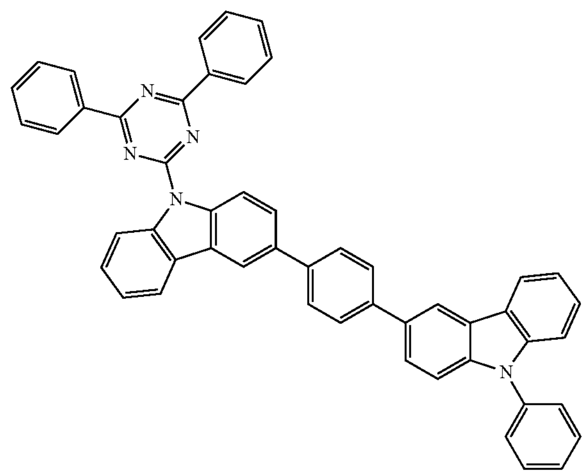
H-9
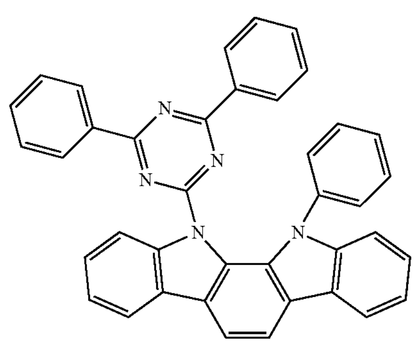

-continued
H-10
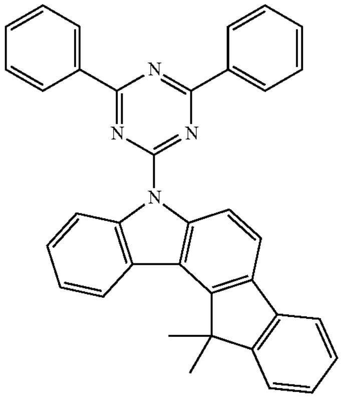
H-11
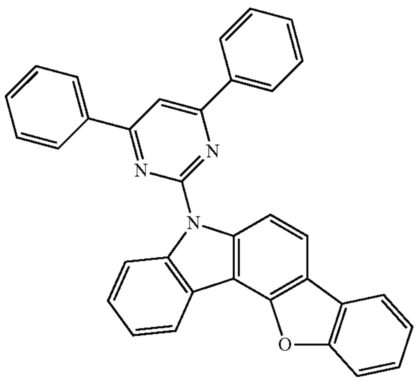
H-12
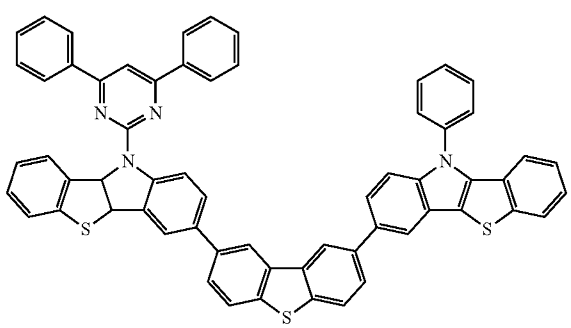
Compound 1
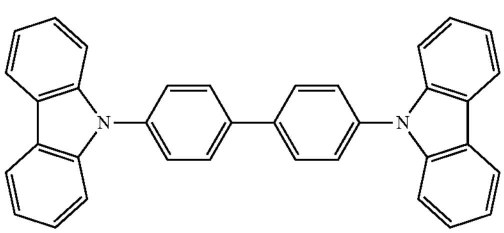
-continued
D-1
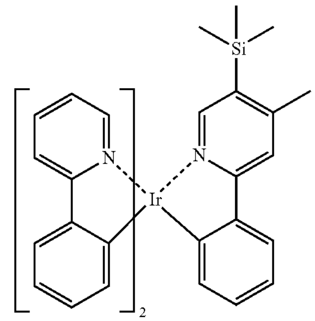
D-2
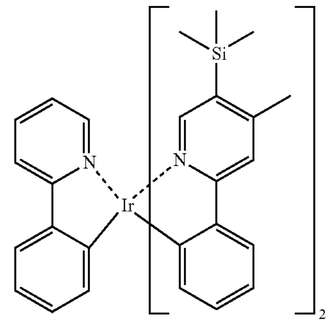
D-3
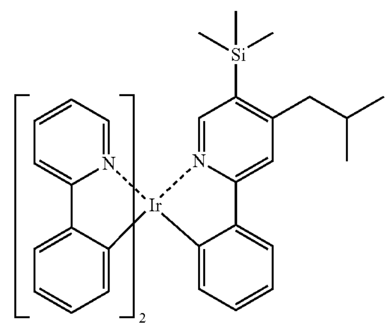
D-4
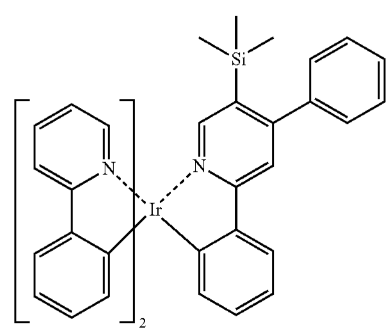

-continued

D-5

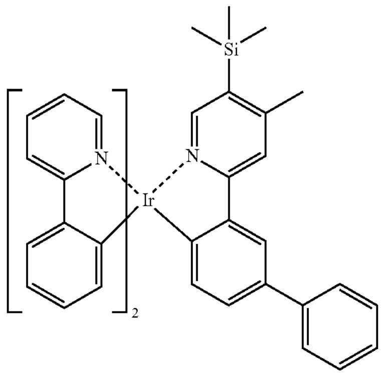

D-6

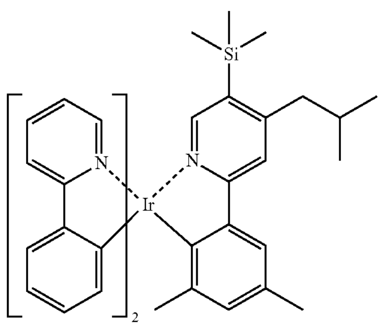

Compound 2

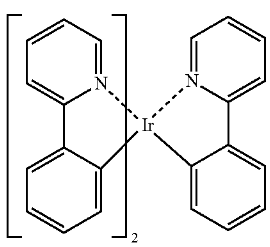

Compound 3

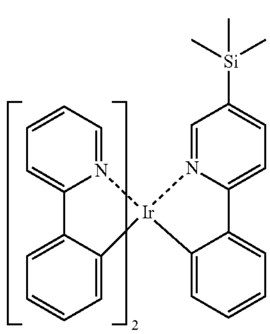

-continued

Compound 4

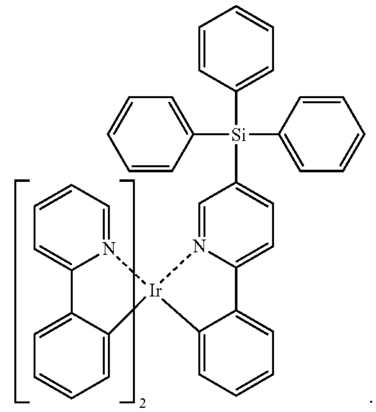

Example 1-1A

Class/ITO (120 nm)/HT (120 nm)/Host:Dop_7% (30 nm)/ET1 (5 nm)/ET2 (25 nm)/LiF (0.5 nm)/Al (150 nm)

As an anode, a 15 $\Omega/cm^2$ (1,200 Å) ITO glass substrate (manufactured by Corning, Inc. company) was cut into a size of 50 mm×50 mm×0.7 mm and ultrasonically washed with isopropyl alcohol and pure water, each for 5 minutes. Afterwards, the ITO glass substrate was irradiated by UV light for 30 minutes, cleaned by exposure to ozone, and then, mounted on a vacuum depositor.

Compound HT was vacuum-deposited on the substrate to form a hole transport region having a thickness of 120 nm.

Compound H-1 and Compound D-1 (7 v %) were co-deposited on the hole transport region to form an EML having a thickness of 30 nm.

Compound ET1 was deposited on the EML to form a buffer layer having a thickness of 5 nm, and Compound ET2 was deposited on the buffer layer to form an electron transport layer (ETL) having a thickness of 25 nm. LiF was deposited on the ETL to form an electron injection layer (EIL) having a thickness of 0.5 nm, thereby preparing an electron transport region.

Al was deposited on the electron transport region to a thickness of 150 nm, thereby manufacturing an organic light-emitting device.

Examples 1-2A to 1-33A and Comparative Examples 1-1A to 1-6A

Organic light-emitting devices were manufactured in the same (or substantially the same) manner as in Example 1-1A, except that in forming the EML, host and dopant materials as shown in Table 2 were used:

TABLE 2

| | Host | Dopant |
|---|---|---|
| Example 1-1A | H-1 | D-1 |
| Example 1-2A | H-1 | D-2 |
| Example 1-3A | H-1 | D-3 |
| Example 1-4A | H-1 | D-4 |
| Example 1-5A | H-1 | D-5 |
| Example 1-6A | H-1 | D-6 |
| Example 1-7A | H-2 | D-1 |

TABLE 2-continued

| | Host | Dopant |
|---|---|---|
| Example 1-8A | H-2 | D-3 |
| Example 1-9A | H-2 | D-5 |
| Example 1-10A | H-3 | D-1 |
| Example 1-11A | H-3 | D-3 |
| Example 1-12A | H-3 | D-5 |
| Example 1-13A | H-4 | D-1 |
| Example 1-14A | H-4 | D-3 |
| Example 1-15A | H-4 | D-5 |
| Example 1-16A | H-5 | D-1 |
| Example 1-17A | H-5 | D-3 |
| Example 1-18A | H-5 | D-5 |
| Example 1-19A | H-8 | D-1 |
| Example 1-20A | H-8 | D-3 |
| Example 1-21A | H-8 | D-5 |
| Example 1-22A | H-9 | D-1 |
| Example 1-23A | H-9 | D-3 |
| Example 1-24A | H-9 | D-5 |
| Example 1-25A | H-10 | D-1 |
| Example 1-26A | H-10 | D-3 |
| Example 1-27A | H-10 | D-5 |
| Example 1-28A | H-11 | D-1 |
| Example 1-29A | H-11 | D-3 |
| Example 1-30A | H-11 | D-5 |
| Example 1-31A | H-12 | D-1 |
| Example 1-32A | H-12 | D-3 |
| Example 1-33A | H-12 | D-5 |

TABLE 2-continued

| | Host | Dopant |
|---|---|---|
| Comparative Example 1-1A | Compound 1 | Compound 2 |
| Comparative Example 1-2A | Compound 1 | Compound 3 |
| Comparative Example 1-3A | Compound 1 | Compound 4 |
| Comparative Example 1-4A | Compound 1 | D-1 |
| Comparative Example 1-5A | H-1 | Compound 2 |
| Comparative Example 1-6A | H-2 | Compound 2 |

Evaluation Example 3

The organic light-emitting devices of Examples 1-1A to 1-33A and Comparative Examples 1-1A to 1-6A were subjected to measure and evaluation of efficiencies (at current density of 10 mA/cm$^2$), lifespan data (at 50 mA/cm$^2$), and color coordinates, by using an IVL meter (PhotoResearch PR650, Keithley 238), and the results are shown in Table 3. In Table 3, the term “efficiency” may refer to a relative efficiency, and the term “lifespan” may refer to a relative lifespan, among the organic light-emitting devices.

TABLE 3

| | Host | Dopant | Efficiency | Lifespan | Color coordinates (x, y) |
|---|---|---|---|---|---|
| Example 1-1A | H-1 | D-1 | 1.3 | 1.1 | 0.23, 0.69 |
| Example 1-2A | H-1 | D-2 | 1.2 | 1.1 | 0.24, 0.68 |
| Example 1-3A | H-1 | D-3 | 1.3 | 1.2 | 0.22, 0.69 |
| Example 1-4A | H-1 | D-4 | 1.3 | 1.2 | 0.23, 0.68 |
| Example 1-5A | H-1 | D-5 | 1.3 | 1.3 | 0.23, 0.68 |
| Example 1-6A | H-1 | D-6 | 1.2 | 1.2 | 0.22, 0.69 |
| Example 1-7A | H-2 | D-1 | 1.2 | 1.2 | 0.23, 0.69 |
| Example 1-8A | H-2 | D-3 | 1.3 | 1.3 | 0.22, 0.69 |
| Example 1-9A | H-2 | D-5 | 1.2 | 1.3 | 0.23, 0.68 |
| Example 1-10A | H-3 | D-1 | 1.3 | 1.1 | 0.23, 0.69 |
| Example 1-11A | H-3 | D-3 | 1.2 | 1.2 | 0.22, 0.69 |
| Example 1-12A | H-3 | D-5 | 1.3 | 1.3 | 0.23, 0.68 |
| Example 1-13A | H-4 | D-1 | 1.4 | 1.3 | 0.23, 0.69 |
| Example 1-14A | H-4 | D-3 | 1.3 | 1.3 | 0.22, 0.69 |
| Example 1-15A | H-4 | D-5 | 1.4 | 1.4 | 0.23, 0.68 |
| Example 1-16A | H-5 | D-1 | 1.4 | 1.2 | 0.23, 0.69 |
| Example 1-17A | H-5 | D-3 | 1.3 | 1.3 | 0.22, 0.69 |
| Example 1-18A | H-5 | D-5 | 1.3 | 1.4 | 0.23, 0.68 |
| Example 1-19A | H-8 | D-1 | 1.4 | 1.2 | 0.23, 0.69 |
| Example 1-20A | H-8 | D-3 | 1.3 | 1.3 | 0.22, 0.69 |
| Example 1-21A | H-8 | D-5 | 1.3 | 1.3 | 0.23, 0.68 |
| Example 1-22A | H-9 | D-1 | 1.3 | 1.2 | 0.23, 0.69 |
| Example 1-23A | H-9 | D-3 | 1.2 | 1.2 | 0.22, 0.69 |
| Example 1-24A | H-9 | D-5 | 1.2 | 1.2 | 0.23, 0.68 |
| Example 1-25A | H-10 | D-1 | 1.3 | 1.2 | 0.23, 0.69 |
| Example 1-26A | H-10 | D-3 | 1.3 | 1.2 | 0.22, 0.69 |
| Example 1-27A | H-10 | D-5 | 1.3 | 1.2 | 0.23, 0.68 |
| Example 1-28A | H-11 | D-1 | 1.3 | 1.3 | 0.23, 0.69 |
| Example 1-29A | H-11 | D-3 | 1.2 | 1.3 | 0.22, 0.69 |
| Example 1-30A | H-11 | D-5 | 1.3 | 1.4 | 0.23, 0.68 |
| Example 1-31A | H-12 | D-1 | 1.2 | 1.2 | 0.23, 0.69 |
| Example 1-32A | H-12 | D-3 | 1.1 | 1.3 | 0.22, 0.69 |
| Example 1-33A | H-12 | D-5 | 1.2 | 1.2 | 0.23, 0.68 |
| Comparative Example 1-1A | Compound 1 | Compound 2 | 1.0 | 1.0 | 0.30, 0.67 |
| Comparative Example 1-2A | Compound 1 | Compound 3 | 1.1 | 1.1 | 0.26, 0.69 |
| Comparative Example 1-3A | Compound 1 | Compound 4 | 1.1 | 1.1 | 0.28, 0.66 |
| Comparative Example 1-4A | Compound 1 | D-1 | 1.1 | 1.1 | 0.23, 0.69 |
| Comparative Example 1-5A | H-1 | Compound 2 | 1.1 | 1.2 | 0.30, 0.67 |

TABLE 3-continued

| | Host | Dopant | Efficiency | Lifespan | Color coordinates (x, y) |
|---|---|---|---|---|---|
| Comparative Example 1-6A | H-2 | Compound 2 | 1.0 | 1.1 | 0.30, 0.66 |

Referring to Table 3, it can be seen that the organic light-emitting devices of Examples 1-1A to 1-33A had mostly improved efficiencies and lifespans compared to those of the organic light-emitting devices of Comparative Examples 1-1A to 1-6A.

Hereinafter, compounds used in manufacturing organic light-emitting devices manufactured in Examples 2-1A to 2-8A and Comparative Examples 2-1A to 2-8A are as follows:

H-1

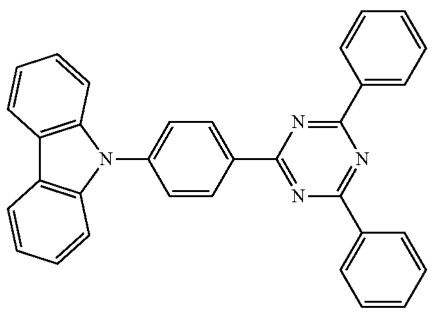

H-2

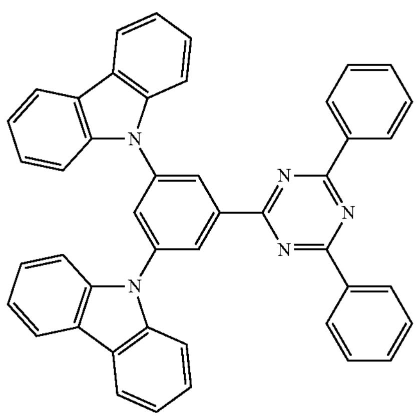

H-3

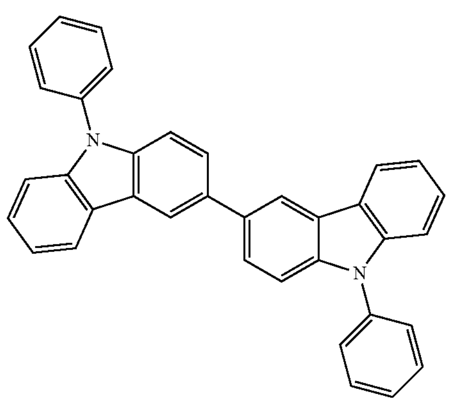

-continued

H-4

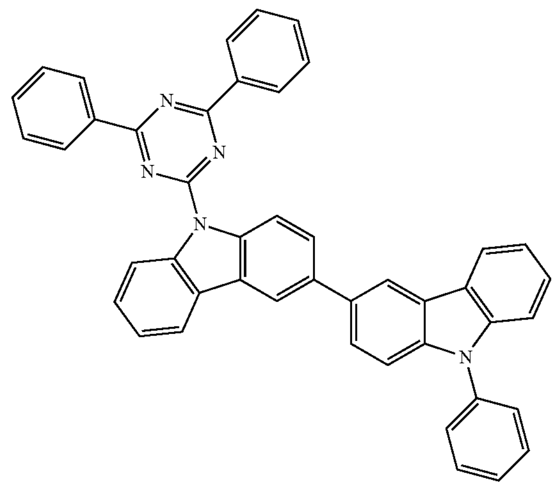

H-5

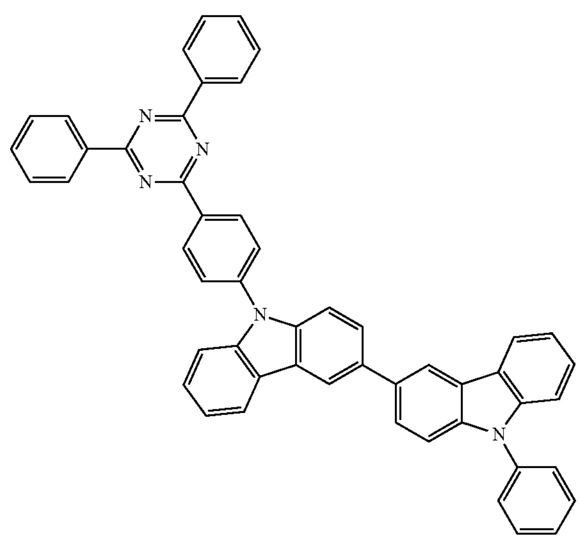

-continued
H-6
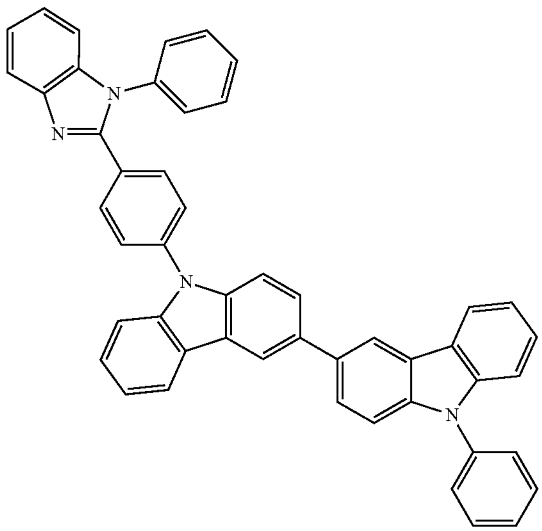
H-7
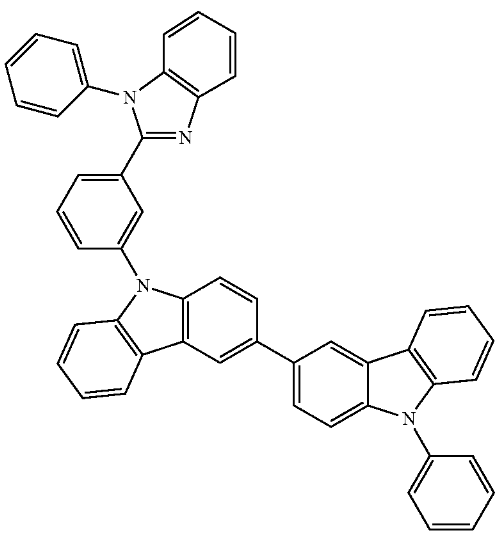
H-8
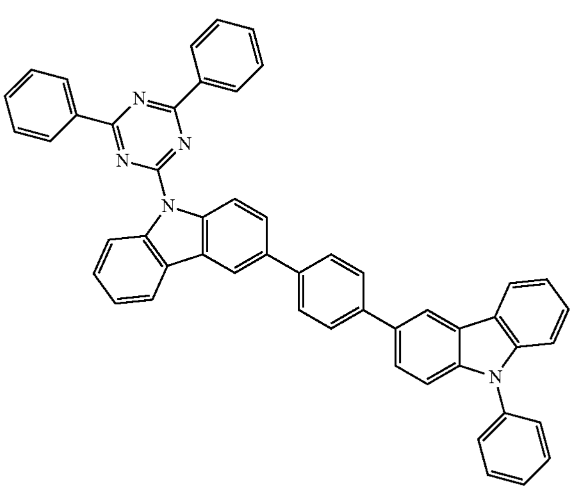
-continued
H-9
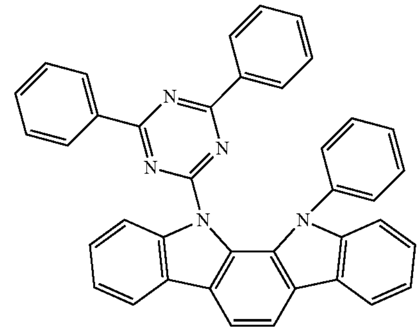
H-10
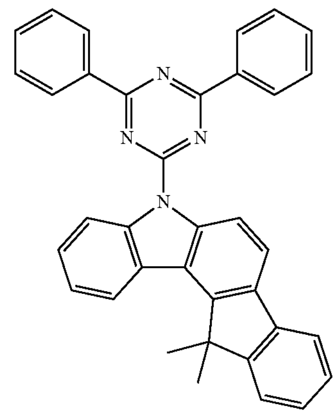
H-11
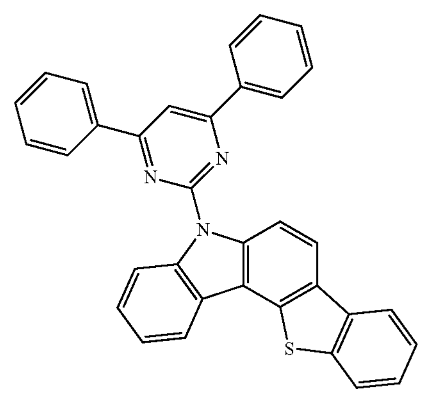
H-12
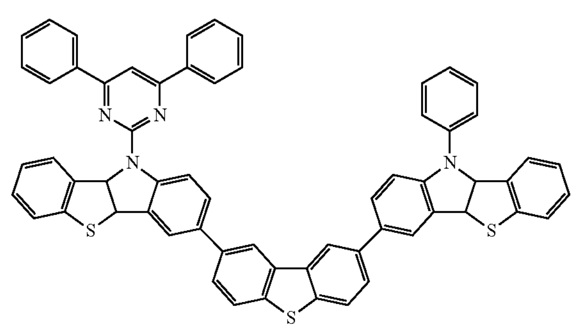

-continued

Compound 1

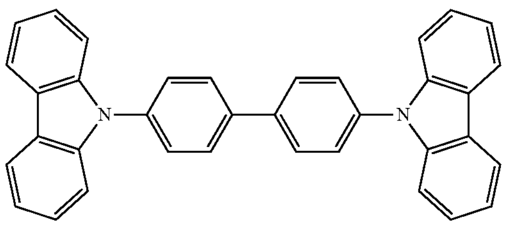

D-7

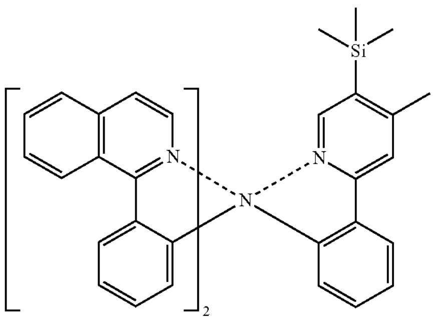

D-8

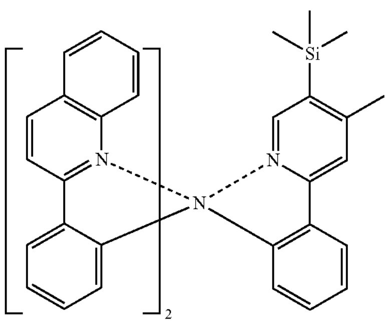

Compound 5

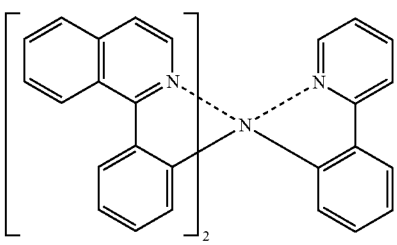

Compound 6

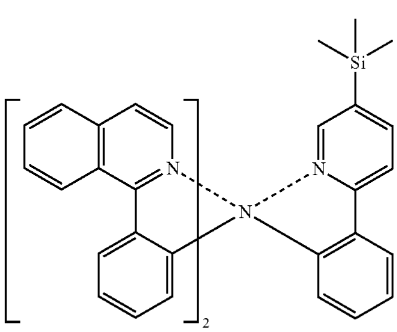

-continued

Compound 7

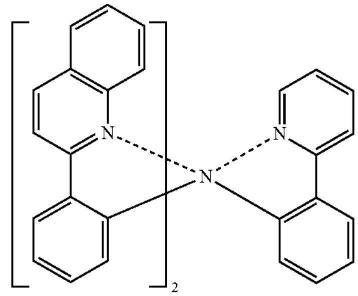

Compound 8

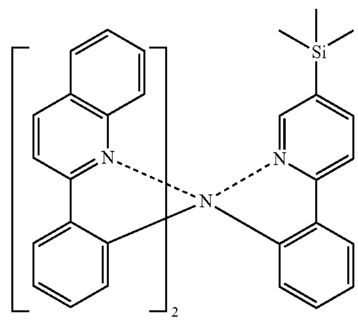

Examples 2-1A to 2-8A and Comparative Examples 2-1A to 2-8A

Glass/ITO (120 nm)/HT (120 nm)/Host:Dop_1% (30 nm)/ET1 (5 nm)/ET2 (25 nm)/LiF (0.5 nm)/Al (150 nm)

Organic light-emitting devices were manufactured in the same (or substantially the same) manner as in Example 1-1A, except that in forming the EML, dopant materials listed in Table 4 were used, and the amounts of the dopants were changed to 1 v %:

TABLE 4

| | Host | Dopant |
|---|---|---|
| Example 2-1A | H-1 | D-7 |
| Example 2-2A | H-5 | D-7 |
| Example 2-3A | H-6 | D-7 |
| Example 2-4A | H-7 | D-7 |
| Comparative Example 2-1A | Compound 1 | Compound 5 |
| Comparative Example 2-2A | Compound 1 | Compound 6 |
| Comparative Example 2-3A | Compound 1 | D-7 |
| Comparative Example 2-4A | H-1 | Compound 5 |
| Example 2-5A | H-1 | D-8 |
| Example 2-6A | H-5 | D-8 |
| Example 2-7A | H-6 | D-8 |
| Example 2-8A | H-7 | D-8 |
| Comparative Example 2-5A | Compound 1 | Compound 7 |
| Comparative Example 2-6A | Compound 1 | Compound 8 |
| Comparative Example 2-7A | Compound 1 | D-8 |
| Comparative Example 2-8A | H-1 | Compound 7 |

Evaluation Example 4

The organic light-emitting devices of Examples 2-1A to 2-8A and Comparative Examples 2-1A to 2-8A were subjected to measure and evaluation of efficiencies (at current density of 10 mA/$cm^2$), lifespan data (at 50 mA/$cm^2$), and color coordinates, by using an IVL meter (PhotoResearch PR650, Keithley 238), and the results are shown in Table 5. In Table 5, the term "efficiency" may refer to a relative efficiency, and the term "lifespan" may refer to a relative lifespan, among the organic light-emitting devices.

TABLE 5

| | Host | Dopant | Efficieny | Lifespan | Color coordinates (x, y) |
|---|---|---|---|---|---|
| Example 2-1A | H-1 | D-7 | 1.2 | 1.1 | 0.66, 0.33 |
| Example 2-2A | H-5 | D-7 | 1.3 | 1.2 | 0.66, 0.33 |
| Example 2-3A | H-6 | D-7 | 1.2 | 1.3 | 0.66, 0.33 |
| Example 2-4A | H-7 | D-7 | 1.2 | 1.3 | 0.66, 0.33 |
| Comparative Example 2-1A | Compound 1 | Compound 5 | 1.0 | 1.0 | 0.64, 0.34 |
| Comparative Example 2-2A | Compound 1 | Compound 6 | 1.1 | 1.0 | 0.65, 0.34 |
| Comparative Example 2-3A | Compound 1 | D-7 | 1.1 | 1.1 | 0.66, 0.33 |
| Comparative Example 2-4A | H-1 | Compound 5 | 1.1 | 1.2 | 0.64, 0.34 |
| Example 2-5A | H-1 | D-8 | 1.1 | 1.1 | 0.64, 0.34 |
| Example 2-6A | H-5 | D-8 | 1.2 | 1.2 | 0.64, 0.34 |
| Example 2-7A | H-6 | D-8 | 1.3 | 1.2 | 0.64, 0.34 |
| Example 2-8A | H-7 | D-8 | 1.2 | 1.3 | 0.64, 0.34 |
| Comparative Example 2-5A | Compound 1 | Compound 7 | 1.0 | 1.0 | 0.62, 0.35 |
| Comparative Example 2-6A | Compound 1 | Compound 8 | 1.1 | 1.0 | 0.63, 0.34 |
| Comparative Example 2-7A | Compound 1 | D-8 | 1.1 | 1.1 | 0.64, 0.34 |
| Comparative Example 2-8A | H-1 | Compound 7 | 1.1 | 1.1 | 0.62, 0.35 |

Referring to Table 5, it can be seen that the organic light-emitting devices of Examples 2-1A to 2-8A had mostly improved efficiencies and lifespans compared to those of the organic light-emitting devices of Comparative Examples 2-1A to 2-8A.

Hereinafter, compounds used in manufacturing organic light-emitting devices manufactured in Examples 3-1A to 3-16A and Comparative Example 3-1A to 3-10A are as follows:

H-1

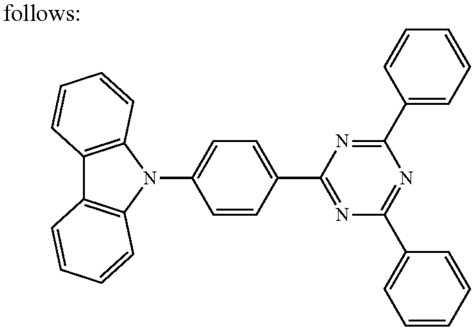

-continued

H-2

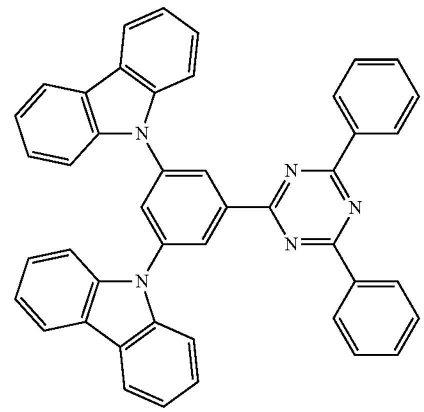

-continued

H-3

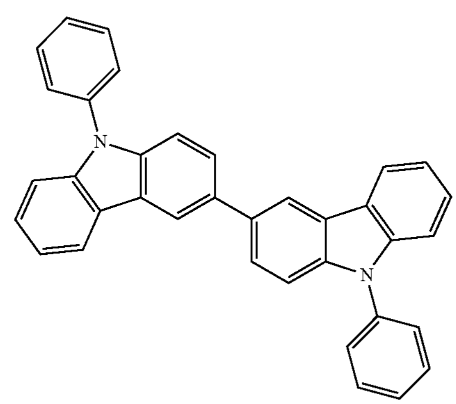

-continued
H-4
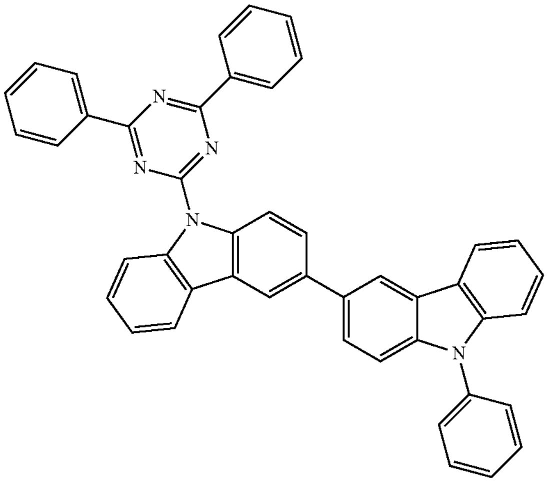
H-5
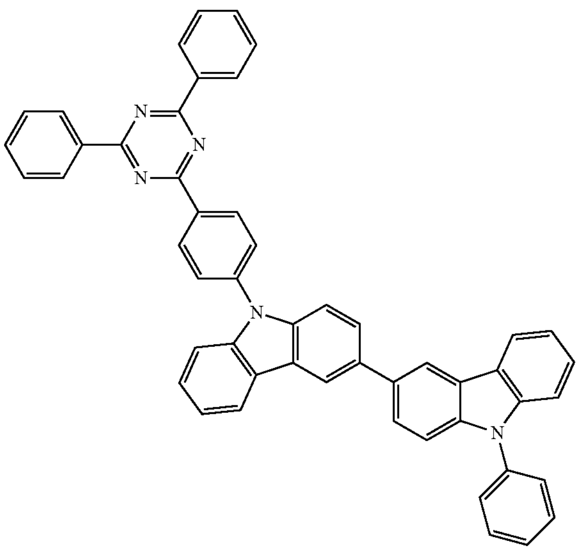
H-6
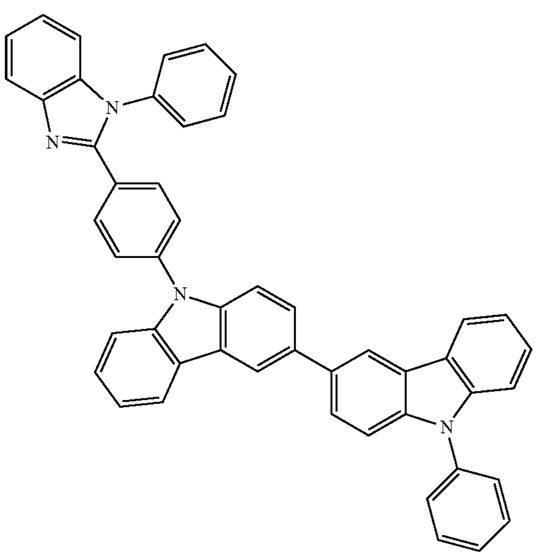
-continued
H-7
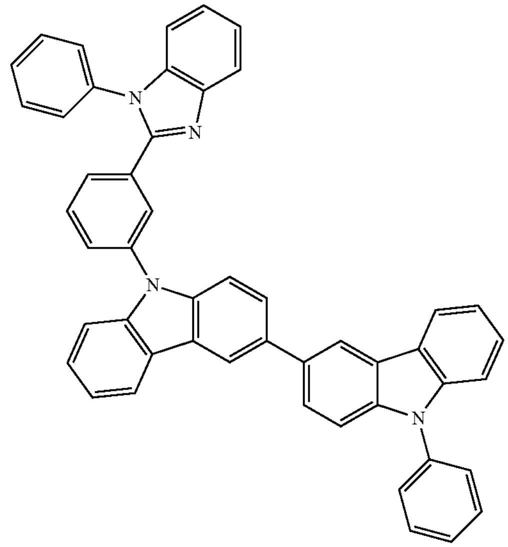
H-8
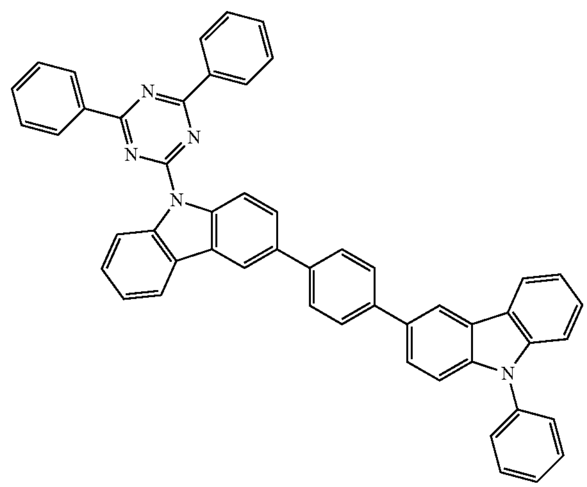
H-9
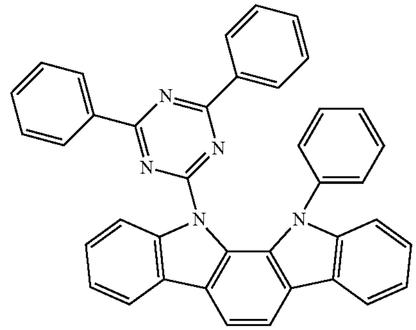

H-10
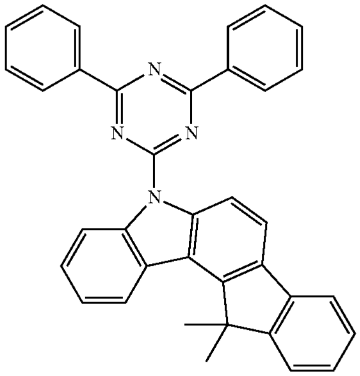
H-11
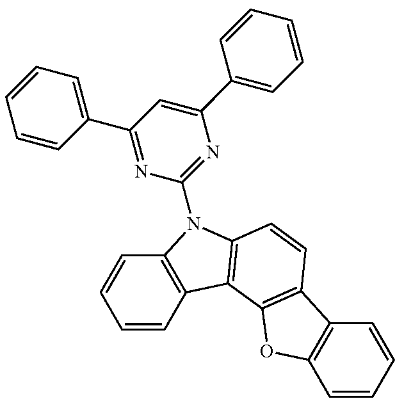
H-12
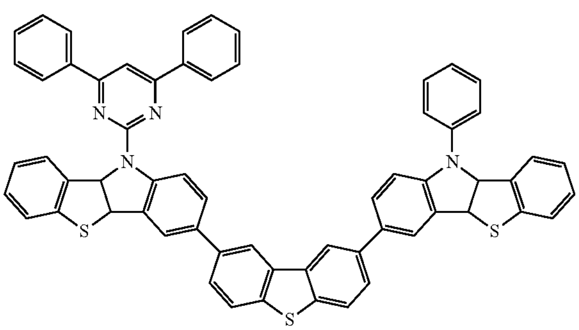
Compound 1
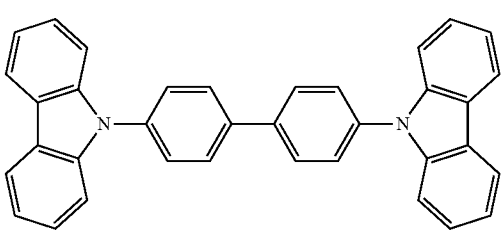
AH-1
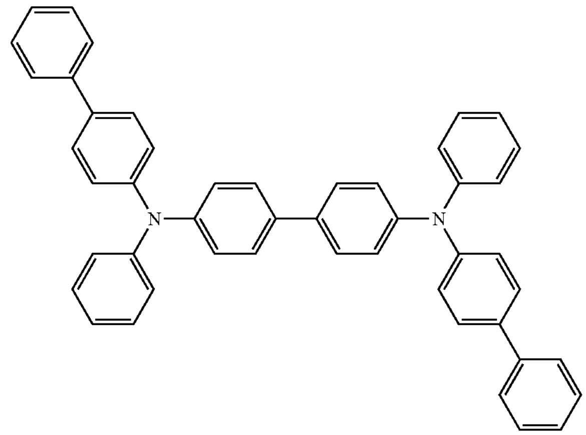
AH-2
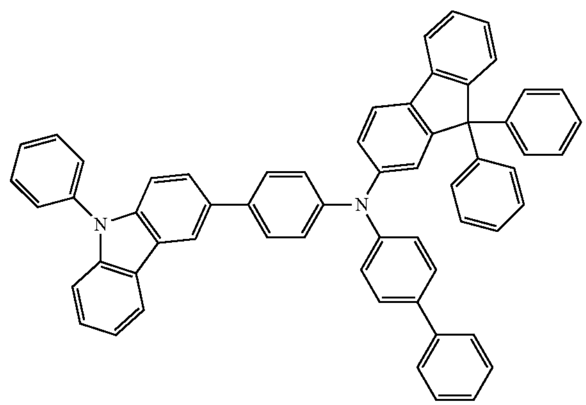
AH-3
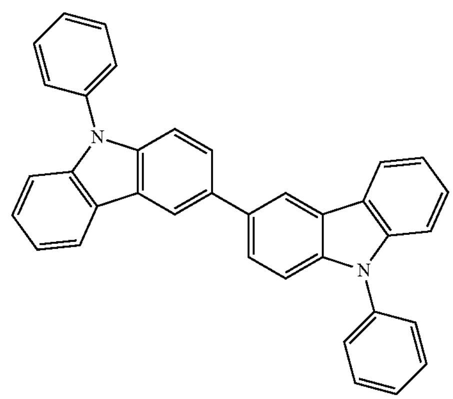
AH-4
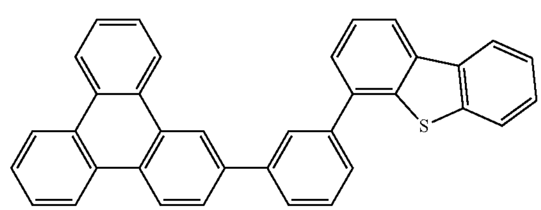

-continued
AH-5
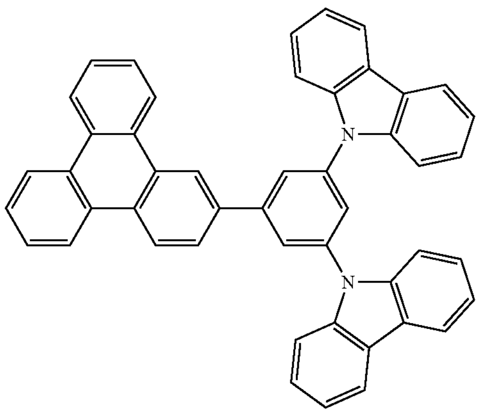
AH-6
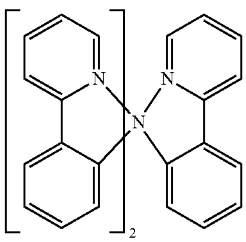
D-1
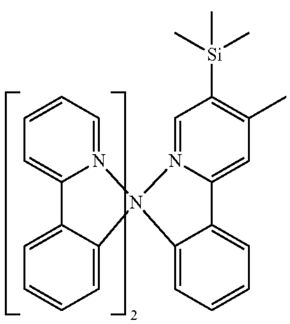
D-2
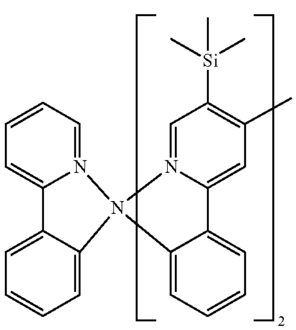
D-3
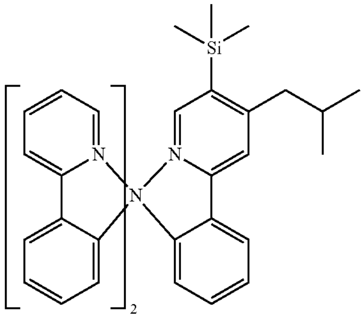
-continued
D-4
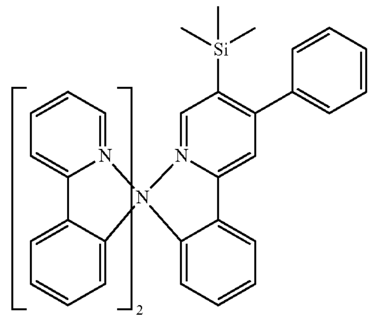
D-5
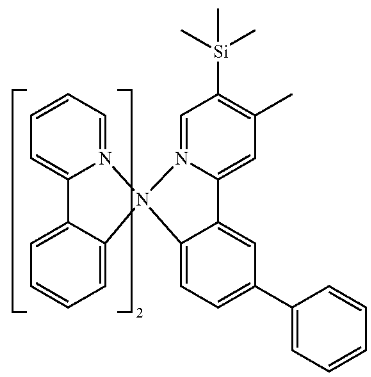
D-6
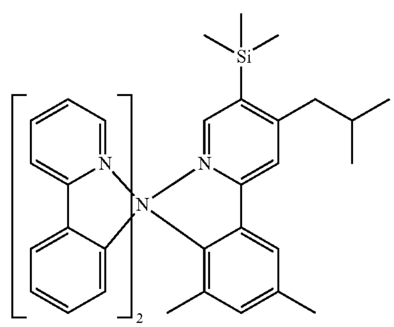
Compound 2
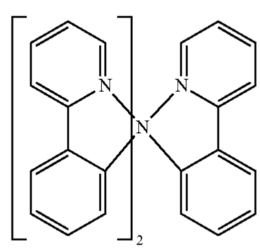
Compound 3
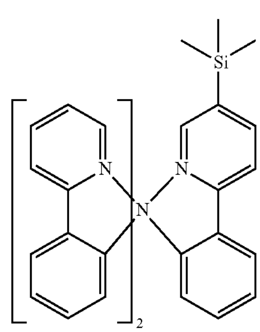

-continued

Compound 4

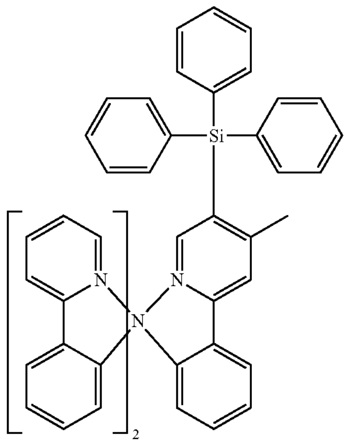

D-7

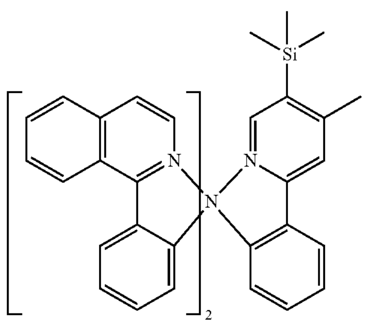

D-8

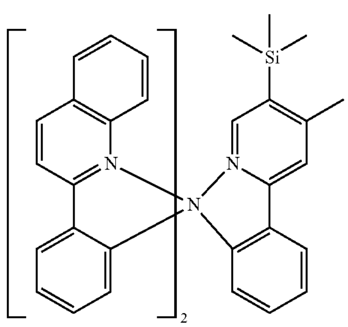

Compound 5

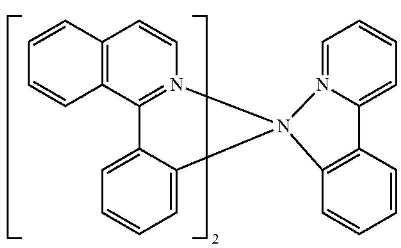

-continued

Compound 5

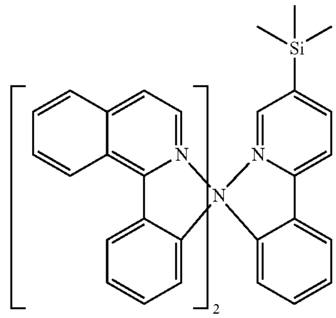

Compound 7

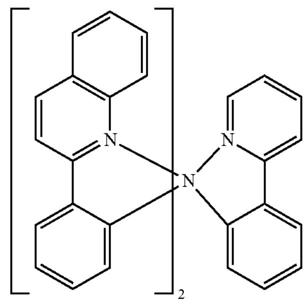

Compound 8

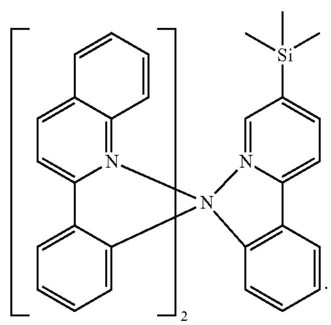

Examples 3-1A to 3-16A and Comparative Examples 3-1A to 3-10A

Glass/ITO (120 nm)/HT (120 nm)/Host1: Host2_10%:Dop_x % (30 nm)/ET1 (5 nm)/ET2 (25 nm)/LiF (0.5 nm)/Al (150 nm)

Organic light-emitting devices were manufactured in the same (or substantially the same) manner as in Example 1-1A, except that in forming the EML, host materials listed in Table 6 were used as the first host and the second host (wherein 10 v % of the second host was used), the amounts of the dopants were varied as shown in Table 6, and dopant materials listed in Table 6 were used.

TABLE 6

| | First host | Second host | Dopant | Dopant (v %) |
|---|---|---|---|---|
| Example 3-1A | H-4 | AH-1 | D-1 | 7 |
| Example 3-2A | H-4 | AH-2 | D-1 | 7 |
| Example 3-3A | H-4 | AH-3 | D-1 | 7 |
| Example 3-4A | H-4 | AH-4 | D-1 | 7 |
| Example 3-5A | H-9 | AH-1 | D-1 | 7 |
| Example 3-6A | H-9 | AH-2 | D-1 | 7 |
| Example 3-7A | H-9 | AH-3 | D-1 | 7 |

TABLE 6-continued

| | First host | Second host | Dopant | Dopant (v %) |
|---|---|---|---|---|
| Example 3-8A | H-9 | AH-4 | D-1 | 7 |
| Comparative Example 3-1A | Compound 1 | — | Compound 2 | 7 |
| Comparative Example 3-2A | Compound 1 | — | Compound 3 | 7 |
| Comparative Example 3-3A | Compound 1 | — | D-1 | 7 |
| Comparative Example 3-4A | H-1 | — | Compound 2 | 7 |
| Comparative Example 3-5A | Compound 1 | AH-3 | Compound 2 | 7 |
| Example 3-9A | H-6 | AH-1 | D-7 | 1 |
| Example 3-10A | H-6 | AH-2 | D-7 | 1 |
| Example 3-11A | H-6 | AH-3 | D-7 | 1 |
| Example 3-12A | H-6 | AH-6 | D-7 | 1 |
| Example 3-13A | H-7 | AH-1 | D-7 | 1 |
| Example 3-14A | H-7 | AH-2 | D-7 | 1 |
| Example 3-15A | H-7 | AH-3 | D-7 | 1 |
| Example 3-16A | H-7 | AH-6 | D-7 | 1 |
| Comparative Example 3-6A | Compound 1 | — | Compound 5 | 1 |
| Comparative Example 3-7A | Compound 1 | — | Compound 6 | 1 |
| Comparative Example 3-8A | Compound 1 | — | D-7 | 1 |
| Comparative Example 3-9A | H-3 | — | Compound 5 | 1 |
| Comparative Example 3-10A | Compound 1 | AH-1 | Compound 5 | 1 |

Evaluation Example 5

The organic light-emitting devices of Examples 3-1A to 3-16A and Comparative Examples 3-1A to 3-10A were subjected to measure and evaluation of efficiencies (at current density of 10 mA/cm$^2$), lifespan data (at 50 mA/cm$^2$), and color coordinates, by using an IVL meter (PhotoResearch PR650, Keithley 238), and the results are shown in Table 7. In Table 7, the term “efficiency” may refer to a relative efficiency, and the term “lifespan” may refer to a relative lifespan, among the organic light-emitting devices.

TABLE 7

| | First host | Second host | Dopant | Dopant (v %) | Effi-cieny | Life-span | Color coor-dinates (x, y) |
|---|---|---|---|---|---|---|---|
| Example 3-1A | H-4 | AH-1 | D-1 | 7 | 1.2 | 1.3 | 0.23, 0.69 |
| Example 3-2A | H-4 | AH-2 | D-1 | 7 | 1.3 | 1.3 | 0.23, 0.69 |
| Example 3-3A | H-4 | AH-3 | D-1 | 7 | 1.3 | 1.4 | 0.23, 0.69 |
| Example 3-4A | H-4 | AH-4 | D-1 | 7 | 1.2 | 1.3 | 0.24, 0.69 |
| Example 3-5A | H-9 | AH-1 | D-1 | 7 | 1.1 | 1.2 | 0.23, 0.69 |
| Example 3-6A | H-9 | AH-2 | D-1 | 7 | 1.2 | 1.2 | 0.23, 0.69 |
| Example 3-7A | H-9 | AH-3 | D-1 | 7 | 1.4 | 1.4 | 0.23, 0.69 |
| Example 3-8A | H-9 | AH-4 | D-1 | 7 | 1.5 | 1.4 | 0.24, 0.69 |
| Comparative Example 3-1A | Compound 1 | — | Compound 2 | 7 | 1.0 | 1.0 | 0.30, 0.67 |
| Comparative Example 3-2A | Compound 1 | — | Compound 3 | 7 | 1.1 | 1.1 | 0.26, 0.69 |
| Comparative Example 3-3A | Compound 1 | — | D-1 | 7 | 1.1 | 1.1 | 0.23, 0.69 |
| Comparative Example 3-4A | H-1 | — | Compound 2 | 7 | 1.1 | 1.2 | 0.30, 0.67 |
| Comparative Example 3-5A | Compound 1 | AH-3 | Compound 2 | 7 | 1.0 | 1.2 | 0.30, 0.67 |
| Example 3-9A | H-6 | AH-1 | D-7 | 1 | 1.2 | 1.4 | 0.66, 0.33 |
| Example 3-10A | H-6 | AH-2 | D-7 | 1 | 1.3 | 1.3 | 0.66, 0.33 |
| Example 3-11A | H-6 | AH-3 | D-7 | 1 | 1.3 | 1.3 | 0.66, 0.33 |
| Example 3-12A | H-6 | AH-6 | D-7 | 1 | 1.3 | 1.3 | 0.66, 0.33 |
| Example 3-13A | H-7 | AH-1 | D-7 | 1 | 1.2 | 1.4 | 0.66, 0.33 |
| Example 3-14A | H-7 | AH-2 | D-7 | 1 | 1.3 | 1.3 | 0.66, 0.33 |
| Example 3-15A | H-7 | AH-3 | D-7 | 1 | 1.3 | 1.4 | 0.66, 0.33 |
| Example 3-16A | H-7 | AH-6 | D-7 | 1 | 1.3 | 1.4 | 0.66, 0.33 |
| Comparative Example 3-6A | Compound 1 | — | Compound 5 | 1 | 1.0 | 1.0 | 0.64, 0.34 |
| Comparative Example 3-7A | Compound 1 | — | Compound 6 | 1 | 1.1 | 1.0 | 0.65, 0.34 |
| Comparative Example 3-8A | Compound 1 | — | D-7 | 1 | 1.1 | 1.1 | 0.66, 0.33 |
| Comparative Example 3-9A | H-3 | — | Compound 5 | 1 | 1.1 | 1.2 | 0.64, 0.34 |
| Comparative Example 3-10A | Compound 1 | AH-1 | Compound 5 | 1 | 1.0 | 1.2 | 0.64, 0.34 |

Referring to Table 7, it can be seen that the organic light-emitting devices of Examples 3-1A to 3-16A had mostly improved efficiencies and lifespans compared to those of the organic light-emitting devices of Comparative Examples 3-1A to 3-10A.

Hereinafter, compounds used in manufacturing organic light-emitting devices manufactured in Examples 1-1B to 1-12B and Comparative Examples 1-1B to 1-6B are as follows:

HT

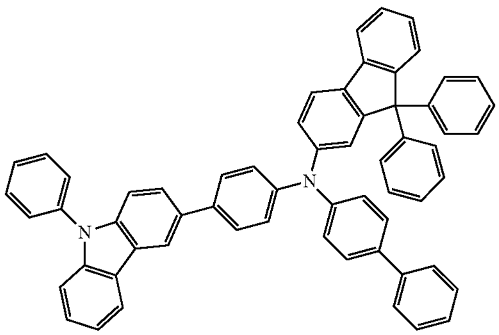

ET1

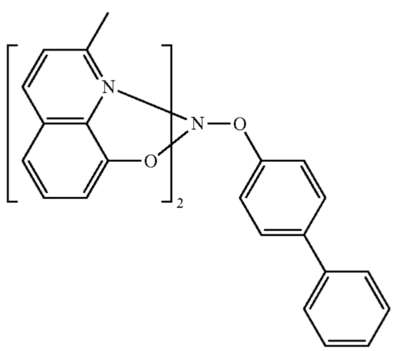

ET2

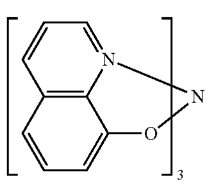

H-1

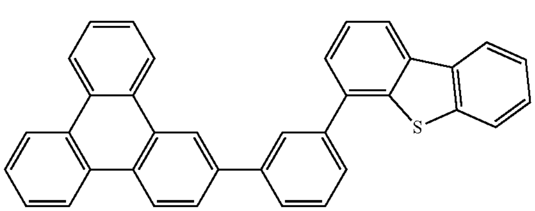

-continued

H-2

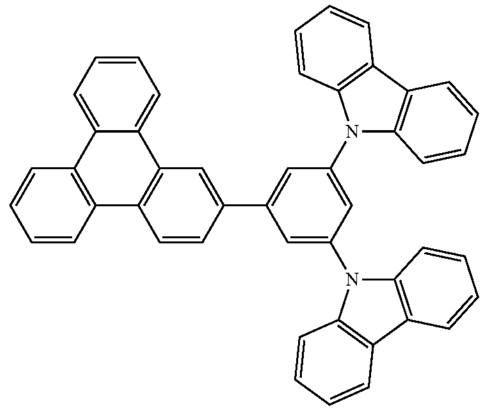

H-3

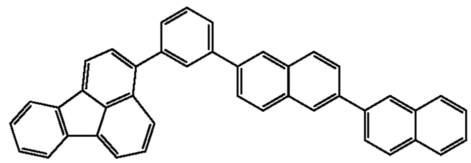

H-4

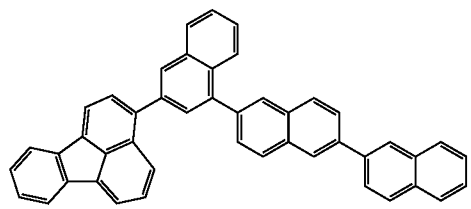

H-5

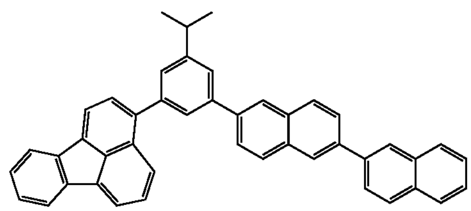

H-6

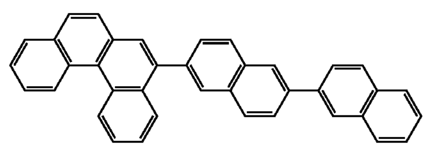

H-7

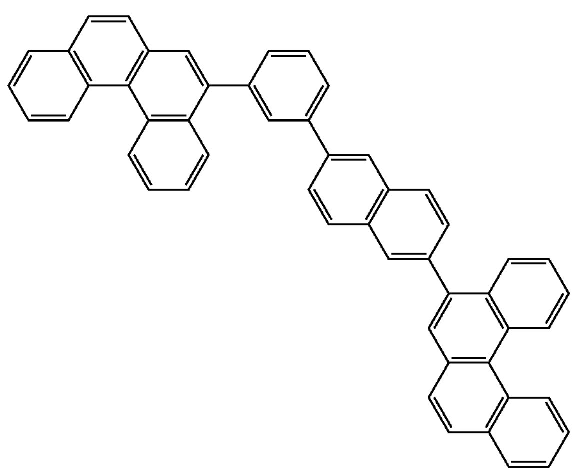

-continued
H-8
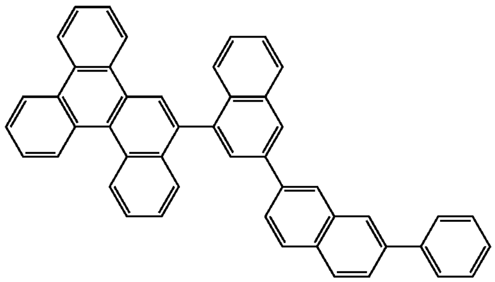
H-9
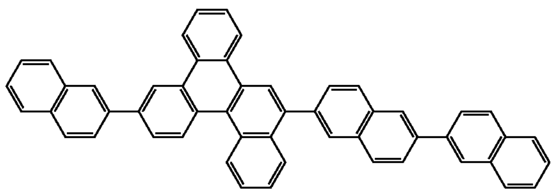
H-10
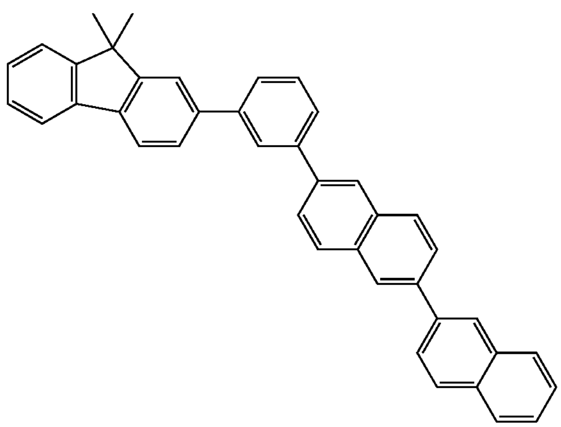
H-11
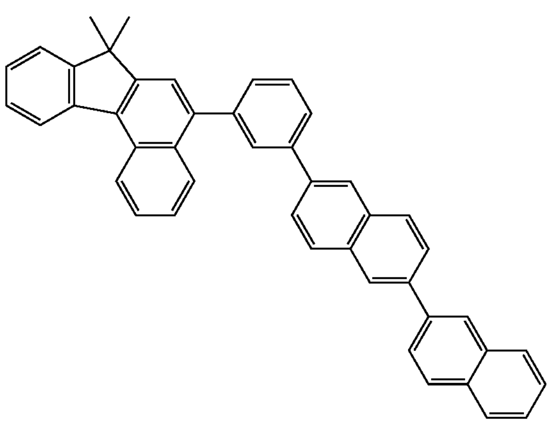
-continued
H-12
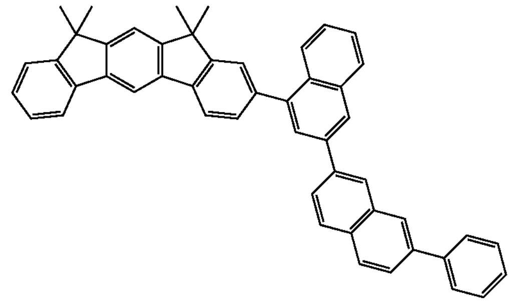
Compound 1
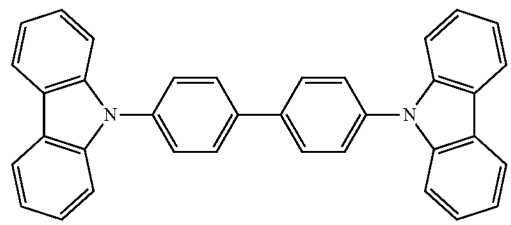
D-1
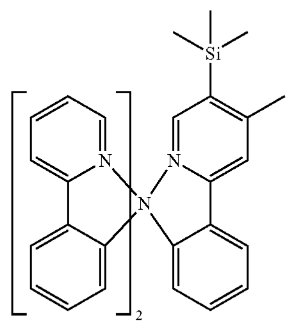
D-2
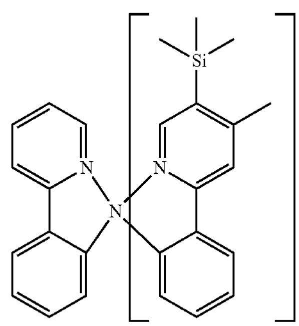
D-3
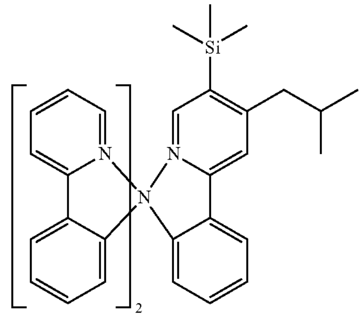

-continued

D-4

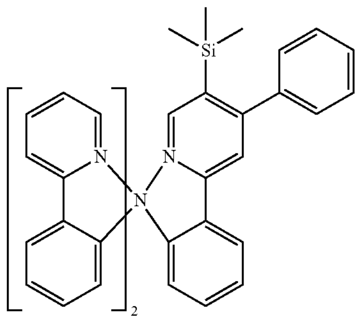

D-5

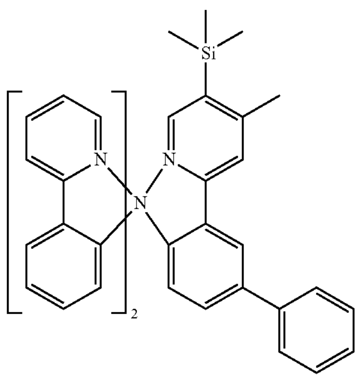

D-6

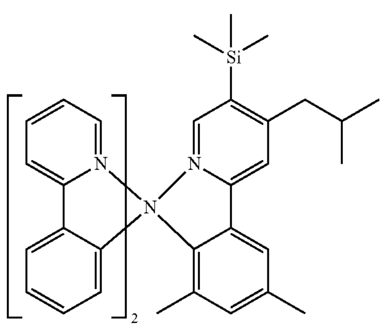

Compound 2

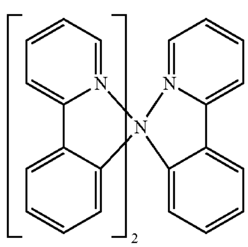

Compound 3

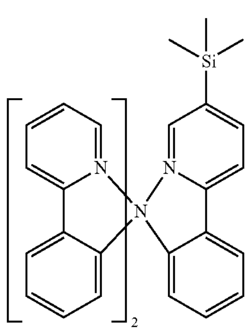

-continued

Compound 4

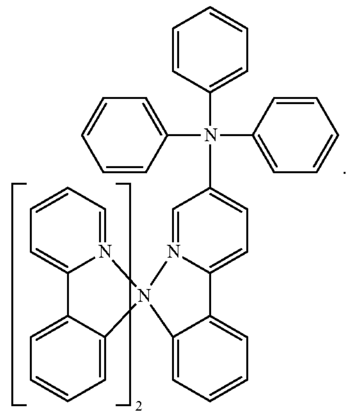

Example 1-1B

Glass/ITO (120 nm)/HT (120 nm)/Host:Dop_7% (30 nm)/ET1 (5 nm)/ET2 (25 nm)/LiF (0.5 nm)/Al (150 nm)

As an anode, a 15 Ω/cm$^2$ (1,200 Å) ITO glass substrate (manufactured by Corning company) was cut into a size of 50 mm×50 mm×0.7 mm and ultrasonically washed with isopropyl alcohol and pure water, each for 5 minutes. Afterwards, the ITO glass substrate was irradiated by UV light for 30 minutes, cleaned by exposure to ozone, and then, mounted on a vacuum depositor.

Compound HT was vacuum-deposited on the substrate to form a hole transport region having a thickness of 120 nm.

Compound H-1 and D-1 (7 v %) were co-deposited on the hole transport region to form an EML having a thickness of 30 nm.

Compound ET1 was deposited on the EML to form a buffer layer having a thickness of 5 nm, and Compound ET2 was deposited on the buffer layer to form an electron transport layer (ETL) having a thickness of 25 nm. LiF was deposited on the ETL to form an electron injection layer (EIL) having a thickness of 0.5 nm, thereby preparing an electron transport region.

Al was deposited on the electron transport region to a thickness of 150 nm, thereby manufacturing an organic light-emitting device.

Examples 1-2B to 1-12B and Comparative Examples 1-1B to 1-6B

Organic light-emitting devices were manufactured in the same (or substantially the same) manner as in Example 1-1B, except that in forming the EML, host and dopant materials shown in Table 8 were used:

TABLE 8

| | Host | Dopant |
|---|---|---|
| Example 1-1B | H-1 | D-1 |
| Example 1-2B | H-1 | D-2 |
| Example 1-3B | H-1 | D-3 |
| Example 1-4B | H-1 | D-4 |
| Example 1-5B | H-1 | D-5 |
| Example 1-6B | H-1 | D-6 |
| Example 1-7B | H-2 | D-1 |

TABLE 8-continued

| | Host | Dopant |
|---|---|---|
| Example 1-8B | H-2 | D-2 |
| Example 1-9B | H-2 | D-3 |
| Example 1-10B | H-2 | D-4 |
| Example 1-11B | H-2 | D-5 |
| Example 1-12B | H-2 | D-6 |
| Comparative Example 1-1B | Compound 1 | Compound 2 |
| Comparative Example 1-2B | Compound 1 | Compound 3 |
| Comparative Example 1-3B | Compound 1 | Compound 4 |
| Comparative Example 1-4B | Compound 1 | D-1 |
| Comparative Example 1-5B | H-1 | Compound 2 |
| Comparative Example 1-6B | H-2 | Compound 2 |

Evaluation Example 6

The organic light-emitting devices of Examples 1-1B to 1-12B and Comparative Examples 1-1B to 1-6B were subjected to measure and evaluation of efficiencies (at current density of 10 mA/cm$^2$), lifespan data (at 50 mA/cm$^2$), and color coordinates, by using an IVL meter (PhotoResearch PR650, Keithley 238), and the results are shown in Table 9. In Table 9, the term "efficiency" may refer to a relative efficiency, and the term "lifespan" may refer to a relative lifespan, among the organic light-emitting devices.

TABLE 9

| | Host | Dopant | Efficiency | Lifespan | Color coordinates (x, y) |
|---|---|---|---|---|---|
| Example 1-1B | H-1 | D-1 | 1.2 | 1.2 | 0.23, 0.69 |
| Example 1-2B | H-1 | D-2 | 1.2 | 1.2 | 0.24, 0.68 |
| Example 1-3B | H-1 | D-3 | 1.3 | 1.2 | 0.22, 0.69 |
| Example 1-4B | H-1 | D-4 | 1.3 | 1.3 | 0.23, 0.68 |
| Example 1-5B | H-1 | D-5 | 1.3 | 1.4 | 0.23, 0.68 |
| Example 1-6B | H-1 | D-6 | 1.2 | 1.2 | 0.22, 0.69 |
| Example 1-7B | H-2 | D-1 | 1.2 | 1.1 | 0.23, 0.69 |
| Example 1-8B | H-2 | D-2 | 1.2 | 1.2 | 0.24, 0.68 |
| Example 1-9B | H-2 | D-3 | 1.3 | 1.2 | 0.22, 0.70 |
| Example 1-10B | H-2 | D-4 | 1.2 | 1.3 | 0.23, 0.68 |
| Example 1-11B | H-2 | D-5 | 1.3 | 1.3 | 0.23, 0.68 |
| Example 1-12B | H-2 | D-6 | 1.2 | 1.2 | 0.22, 0.69 |
| Comparative Example 1-1B | Compound 1 | Compound 2 | 1.0 | 1.0 | 0.30, 0.67 |
| Comparative Example 1-2B | Compound 1 | Compound 3 | 1.1 | 1.1 | 0.26, 0.69 |
| Comparative Example 1-3B | Compound 1 | Compound 4 | 1.1 | 1.1 | 0.28, 0.66 |
| Comparative Example 1-4B | Compound 1 | D-1 | 1.1 | 1.1 | 0.23, 0.69 |
| Comparative Example 1-5B | H-1 | Compound 2 | 1.1 | 1.2 | 0.30, 0.67 |
| Comparative Example 1-6B | H-2 | Compound 2 | 1.0 | 1.1 | 0.30, 0.66 |

Referring to Table 9, it can be seen that the organic light-emitting devices of Examples 1-1B to 1-12B had improved efficiencies and mostly improved lifespans compared to those of the organic light-emitting devices of Comparative Examples 1-1B to 1-6B.

Hereinafter, compounds used in manufacturing organic light-emitting devices manufactured in Examples 2-1B to 2-20B and Comparative Examples 2-1B to 2-8B are as follows:

H-1

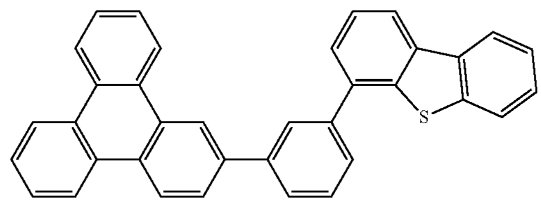

-continued
H-2
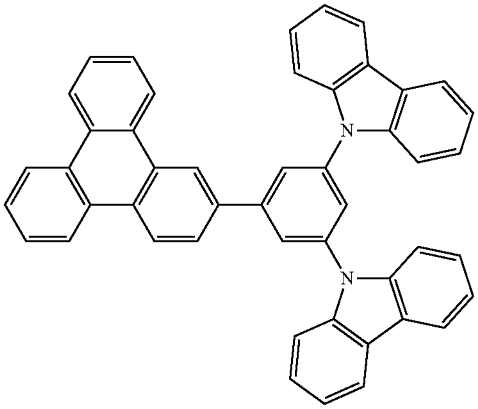
H-3
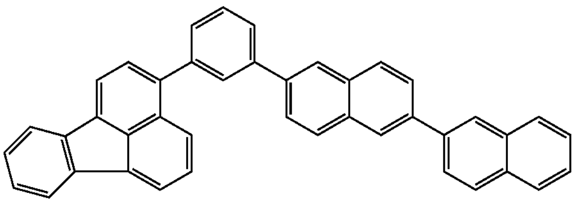
H-4
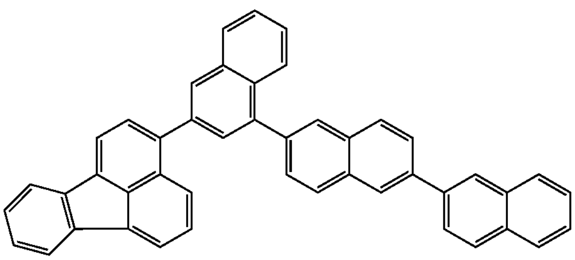
H-5
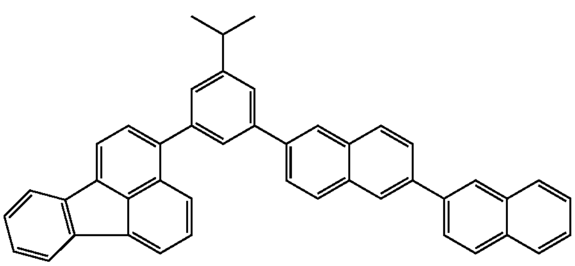
H-6
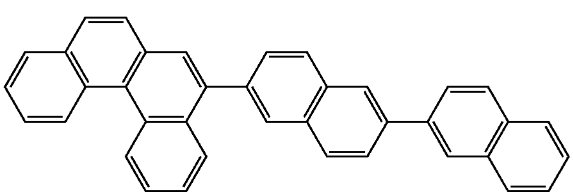
-continued
H-7
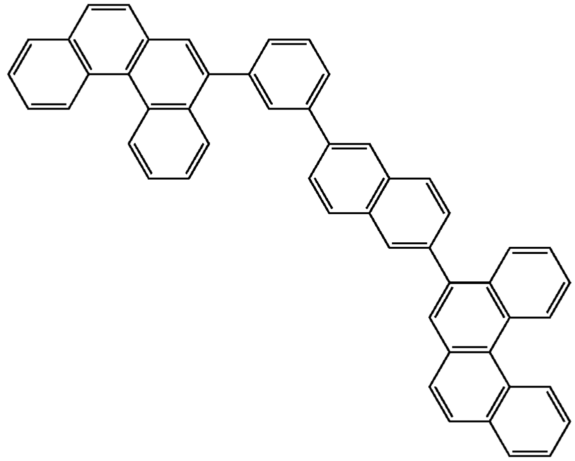
H-8
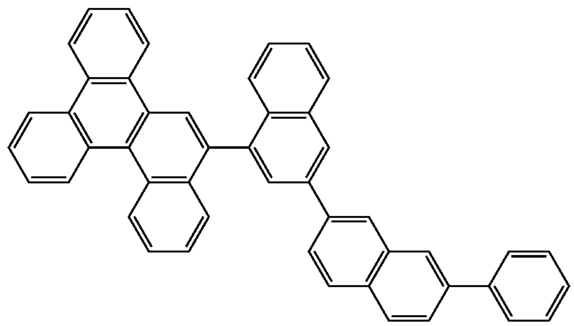
H-9
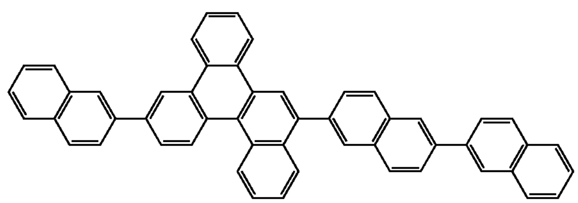
H-10
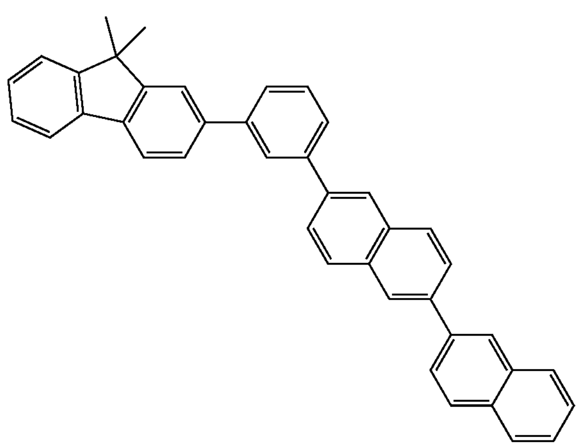

-continued
H-11
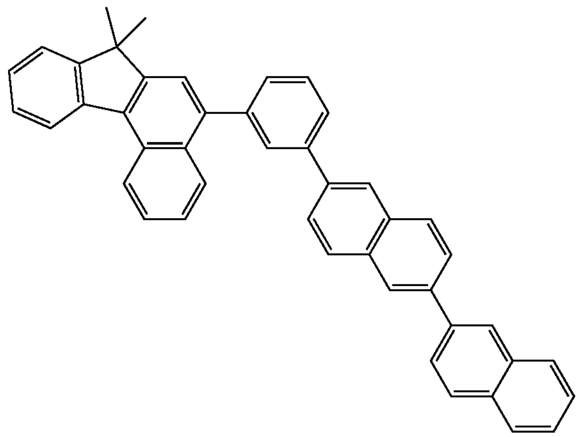
H-12
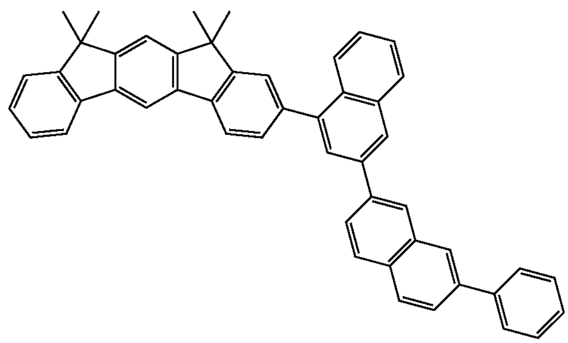
Compound 1
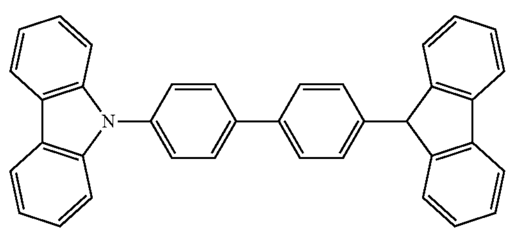
D-7
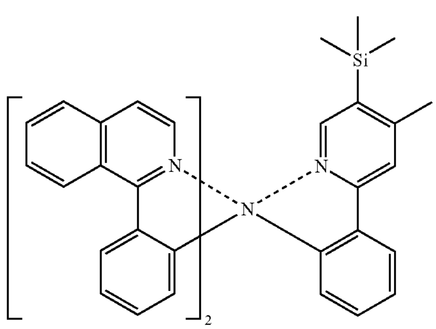
-continued
D-8
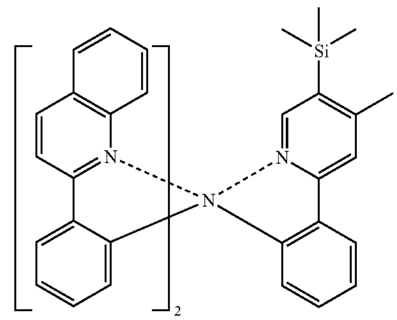
Compound 5
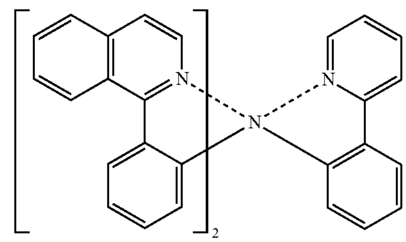
Compound 6
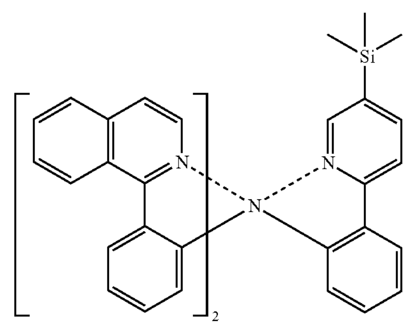
Compound 7
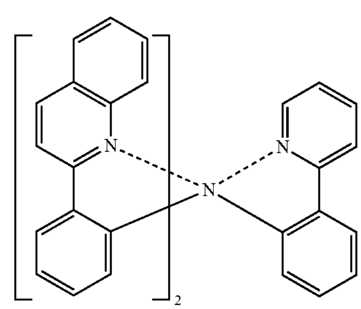
Compound 8
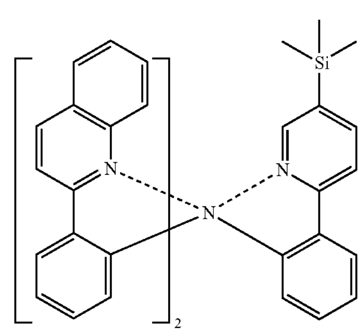

Examples 2-1B to 2-20B and Comparative Examples 2-1B to 2-8B

Glass/ITO (120 nm)/HT (120 nm)/Host:Dop_1% (30 nm)/ET1 (5 nm)/ET2 (25 nm)/LiF (0.5 nm)/Al (150 nm)

Organic light-emitting devices were manufactured in the same (or substantially the same) manner as in Example 1-1B, except that in forming the EML, dopant materials listed in Table 10 were used, and the amounts of the dopants were changed to 1 v %:

TABLE 10

| | Host | Dopant |
|---|---|---|
| Example 2-1B | H-3 | D-7 |
| Example 2-2B | H-4 | D-7 |
| Example 2-3B | H-5 | D-7 |
| Example 2-4B | H-6 | D-7 |
| Example 2-5B | H-7 | D-7 |
| Example 2-6B | H-8 | D-7 |
| Example 2-7B | H-9 | D-7 |
| Example 2-8B | H-10 | D-7 |
| Example 2-9B | H-11 | D-7 |
| Example 2-10B | H-12 | D-7 |
| Comparative Example 2-1B | Compound 1 | Compound 5 |
| Comparative Example 2-2B | Compound 1 | Compound 6 |
| Comparative Example 2-3B | Compound 1 | D-7 |
| Comparative Example 2-4B | H-3 | Compound 5 |
| Example 2-11B | H-3 | D-8 |
| Example 2-12B | H-4 | D-8 |
| Example 2-13B | H-5 | D-8 |
| Example 2-14B | H-6 | D-8 |
| Example 2-15B | H-7 | D-8 |
| Example 2-16B | H-8 | D-8 |
| Example 2-17B | H-9 | D-8 |
| Example 2-18B | H-10 | D-8 |
| Example 2-19B | H-11 | D-8 |
| Example 2-20B | H-12 | D-8 |
| Comparative Example 2-5B | Compound 1 | Compound 7 |
| Comparative Example 2-6B | Compound 1 | Compound 8 |
| Comparative Example 2-7B | Compound 1 | D-8 |
| Comparative Example 2-8B | H-3 | Compound 7 |

Evaluation Example 7

The organic light-emitting devices of Examples 2-1B to 2-20B and Comparative Examples 2-1B to 2-8B were subjected to measure and evaluation of efficiencies (at current density of 10 mA/cm$^2$), lifespan data (at 50 mA/cm$^2$), and color coordinates, by using an IVL meter (PhotoResearch PR650, Keithley 238), and the results are shown in Table 11. In Table 11, the term "efficiency" may refer to a relative efficiency, and the term "lifespan" may refer to a relative lifespan, among the organic light-emitting devices.

TABLE 11

| | Host | Dopant | Efficieny | Lifespan | Color coordinates (x, y) |
|---|---|---|---|---|---|
| Example 2-1B | H-3 | D-7 | 1.3 | 1.3 | 0.66, 0.33 |
| Example 2-2B | H-4 | D-7 | 1.2 | 1.4 | 0.66, 0.33 |
| Example 2-3B | H-5 | D-7 | 1.3 | 1.2 | 0.66, 0.34 |
| Example 2-4B | H-6 | D-7 | 1.3 | 1.3 | 0.66, 0.33 |
| Example 2-5B | H-7 | D-7 | 1.2 | 1.4 | 0.66, 0.33 |
| Example 2-6B | H-8 | D-7 | 1.3 | 1.2 | 0.66, 0.34 |
| Example 2-7B | H-9 | D-7 | 1.2 | 1.2 | 0.66, 0.33 |
| Example 2-8B | H-10 | D-7 | 1.3 | 1.3 | 0.66, 0.34 |
| Example 2-9B | H-11 | D-7 | 1.3 | 1.2 | 0.66, 0.33 |
| Example 2-10B | H-12 | D-7 | 1.3 | 1.1 | 0.66, 0.33 |
| Comparative Example 2-1B | Compound 1 | Compound 5 | 1.0 | 1.0 | 0.64, 0.34 |
| Comparative Example 2-2B | Compound 1 | Compound 6 | 1.1 | 1.0 | 0.65, 0.34 |
| Comparative Example 2-3B | Compound 1 | D-7 | 1.1 | 1.1 | 0.66, 0.33 |
| Comparative Example 2-4B | H-3 | Compound 5 | 1.1 | 1.2 | 0.64, 0.34 |
| Example 2-11B | H-3 | D-8 | 1.3 | 1.3 | 0.64, 0.34 |
| Example 2-12B | H-4 | D-8 | 1.3 | 1.3 | 0.64, 0.34 |
| Example 2-13B | H-5 | D-8 | 1.2 | 1.4 | 0.65, 0.34 |
| Example 2-14B | H-6 | D-8 | 1.3 | 1.3 | 0.64, 0.34 |
| Example 2-15B | H-7 | D-8 | 1.2 | 1.3 | 0.65, 0.34 |
| Example 2-16B | H-8 | D-8 | 1.3 | 1.2 | 0.64, 0.34 |
| Example 2-17B | H-9 | D-8 | 1.2 | 1.2 | 0.65, 0.34 |
| Example 2-18B | H-10 | D-8 | 1.3 | 1.2 | 0.64, 0.34 |
| Example 2-19B | H-11 | D-8 | 1.2 | 1.2 | 0.64, 0.34 |
| Example 2-20B | H-12 | D-8 | 1.3 | 1.1 | 0.64, 0.34 |
| Comparative Example 2-5B | Compound 1 | Compound 7 | 1.0 | 1.0 | 0.62, 0.35 |
| Comparative Example 2-6B | Compound 1 | Compound 8 | 1.1 | 1.0 | 0.63, 0.34 |
| Comparative Example 2-7B | Compound 1 | D-8 | 1.1 | 1.1 | 0.64, 0.34 |

TABLE 11-continued

| | Host | Dopant | Efficieny | Lifespan | Color coordinates (x, y) |
|---|---|---|---|---|---|
| Comparative Example 2-8B | H-3 | Compound 7 | 1.1 | 1.2 | 0.62, 0.35 |

Referring to Table 11, it can be seen that the organic light-emitting devices of Examples 2-1B to 2-20B had improved efficiencies and mostly improved lifespans compared to those of the organic light-emitting devices of Comparative Examples 2-1B to 2-8B.

Hereinafter, compounds used in manufacturing organic light-emitting devices manufactured in Examples 3-1B to 3-7B and Comparative Examples 3-1B to 3-10B are as follows:

H-1

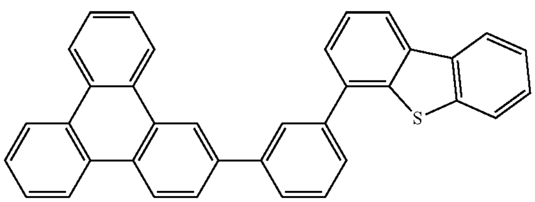

H-2

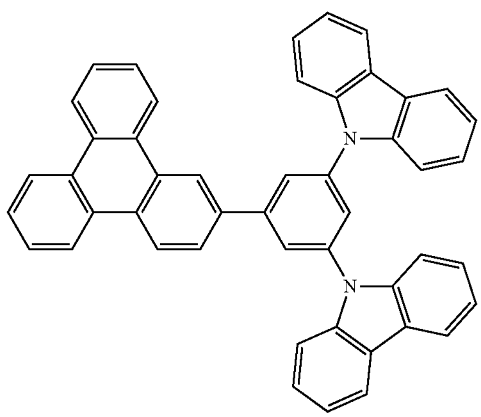

H-3

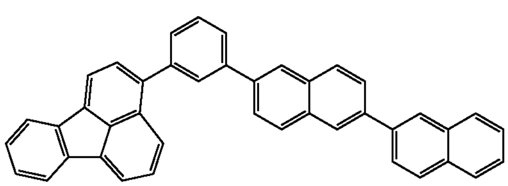

H-4

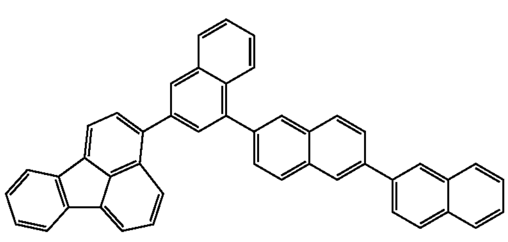

-continued

H-5

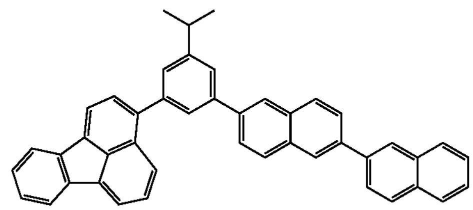

H-6

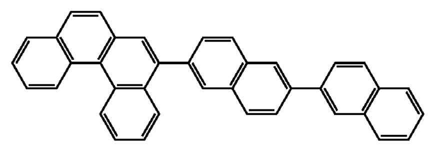

H-7

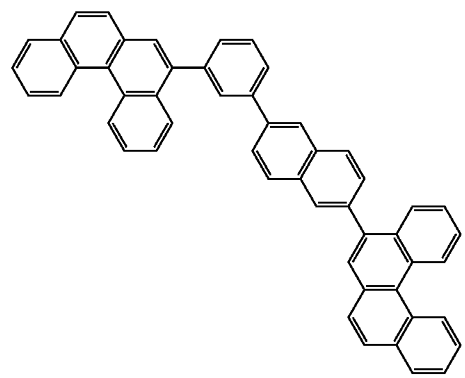

H-8

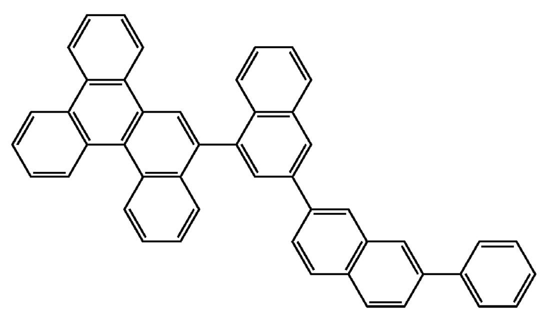

H-9

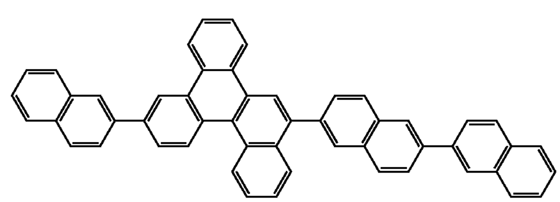

-continued
H-10
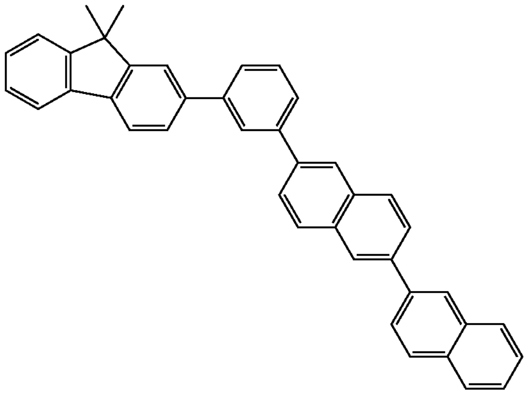
H-11
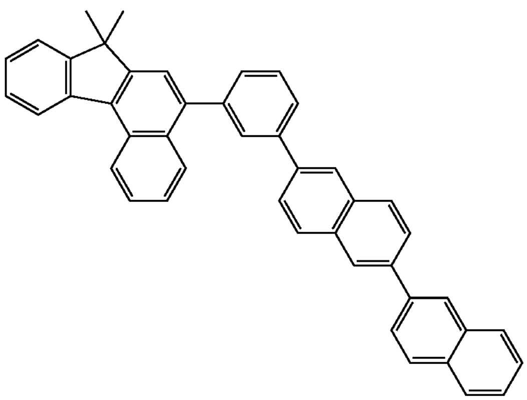
H-12
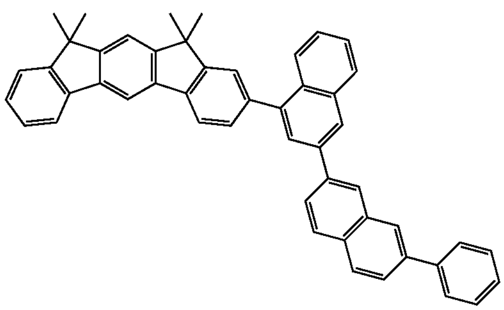
Compound 1
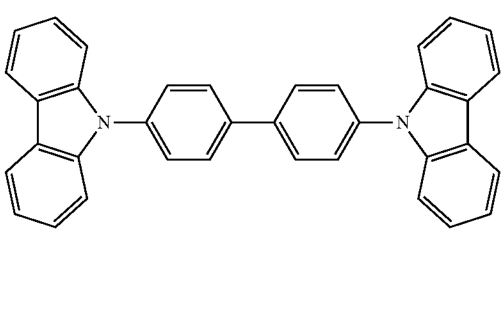
-continued
AH-1
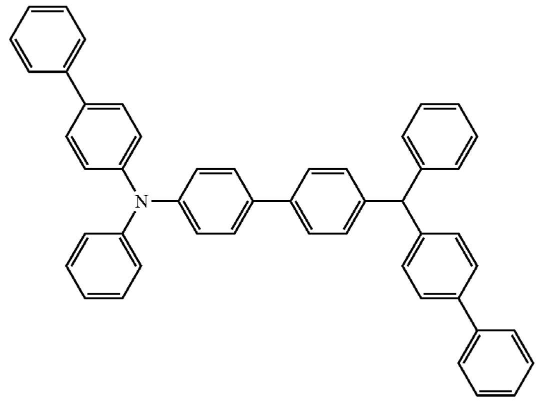
AH-2
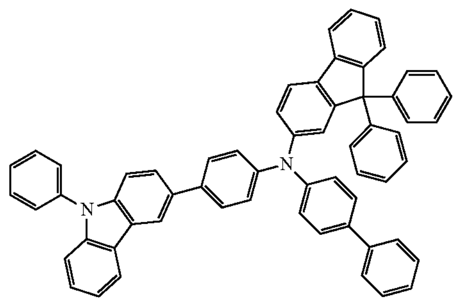
AH-3
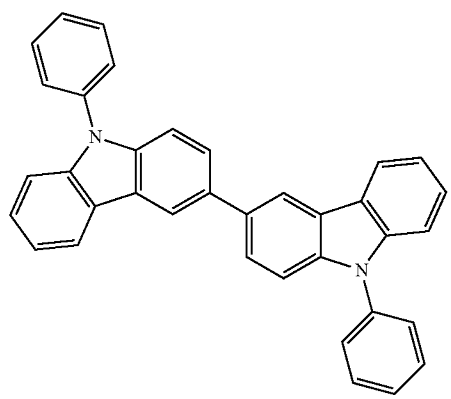
AH-4
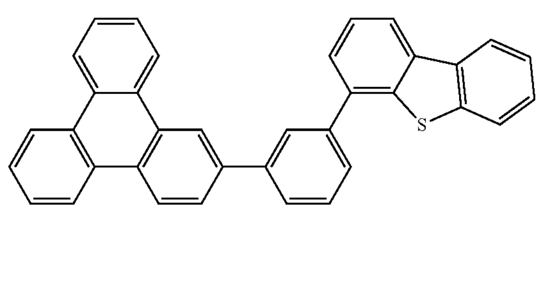

-continued
AH-5
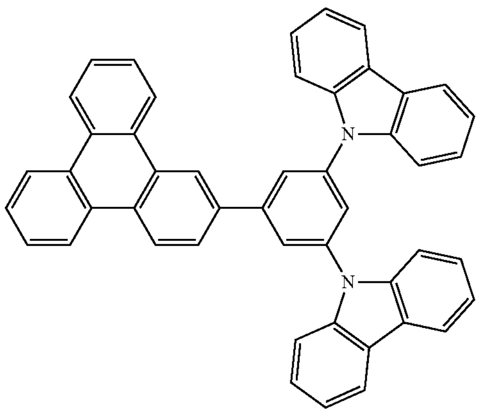
AH-6
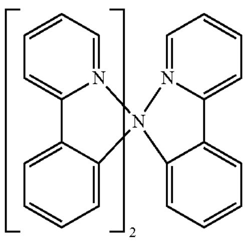
D-1
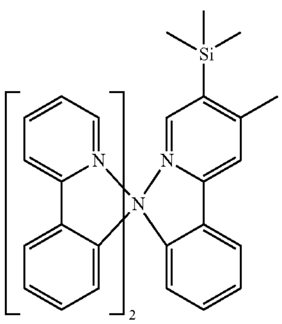
D-2
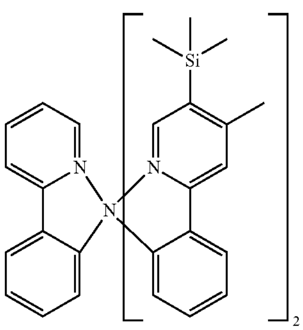
D-3
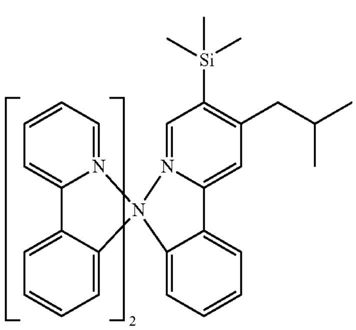
-continued
D-4
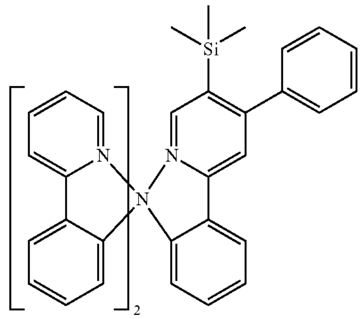
D-5
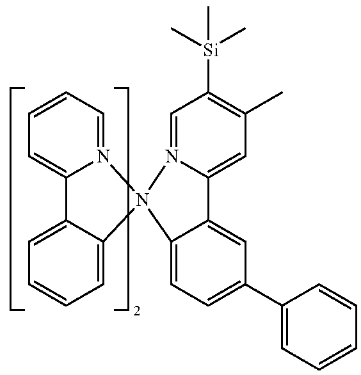
D-6
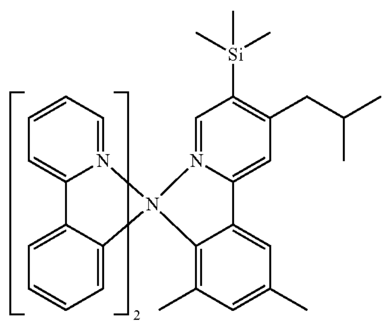
Compound 2
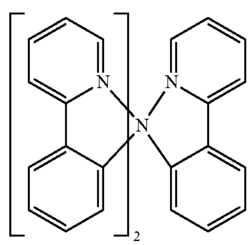
Compound 3
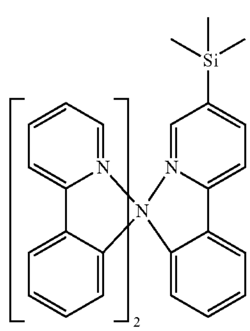

-continued

Compound 4

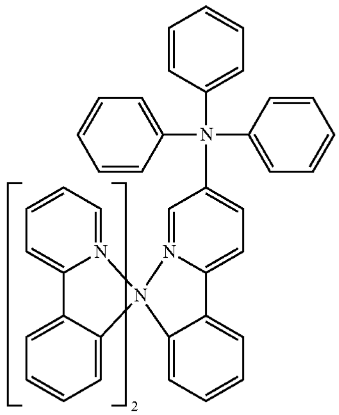

D-7

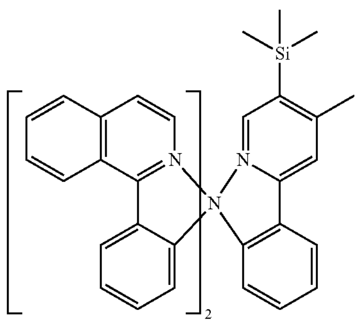

D-8

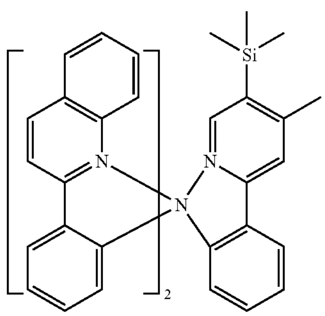

Compound 5

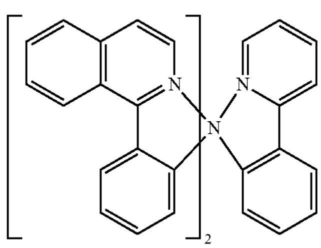

Compound 6

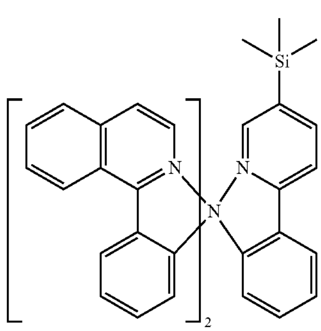

-continued

Compound 7

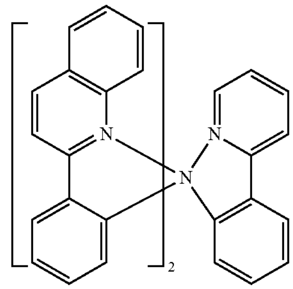

Compound 8

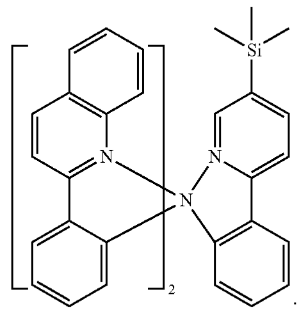

Examples 3-1B to 3-7B and Comparative Examples 3-1B to 3-10B

Glass/ITO (120)/HT (120)/Host1:Host2_10%: Dop_x % (30)/ET1 (5)/ET2 (25)/LiF (0.5)/Al (150)

Organic light-emitting devices were manufactured in the same (or substantially the same) manner as in 1-1B, except that in forming the EML, host materials listed in Table 12 were used as the first host and the second host (wherein 10 v % of the second host was used), the amounts of the dopants were varied as shown in Table 12, and dopant materials listed in Table 12 were used.

TABLE 12

| | First host | Second host | Dopant | Dopant (v %) |
|---|---|---|---|---|
| Example 3-1B | H-1 | AH-3 | D-1 | 7 |
| Example 3-2B | H-1 | AH-4 | D-1 | 7 |
| Example 3-3B | H-1 | AH-5 | D-1 | 7 |
| Comparative Example 3-1B | Compound 1 | — | Compound 2 | 7 |
| Comparative Example 3-2B | Compound 1 | — | Compound 3 | 7 |
| Comparative Example 3-3B | Compound 1 | — | D-1 | 7 |
| Comparative Example 3-4B | H-1 | — | Compound 2 | 7 |
| Comparative Example 3-5B | Compound 1 | AH-3 | Compound 2 | 7 |
| Example 3-4B | H-3 | AH-1 | D-7 | 1 |
| Example 3-5B | H-3 | AH-2 | D-7 | 1 |

TABLE 12-continued

| | First host | Second host | Dopant | Dopant (v %) |
|---|---|---|---|---|
| Example 3-6B | H-3 | AH-3 | D-7 | 1 |
| Example 3-7B | H-3 | AH-6 | D-7 | 1 |
| Comparative Example 3-6B | Compound 1 | — | Compound 5 | 1 |
| Comparative Example 3-7B | Compound 1 | — | Compound 6 | 1 |
| Comparative Example 3-8B | Compound 1 | — | D-7 | 1 |
| Comparative Example 3-9B | H-3 | — | Compound 5 | 1 |
| Comparative Example 3-10B | Compound 1 | AH-1 | Compound 5 | 1 |

Evaluation Example 8

The organic light-emitting devices of Examples 3-1B to 3-7B and Comparative Examples 3-1B to 3-10B were subjected to measure and evaluation of efficiencies (at current density of 10 mA/cm$^2$), lifespan data (at 50 mA/cm$^2$), and color coordinates, by using an IVL meter (PhotoResearch PR650, Keithley 238), and the results are shown in Table 13. In Table 13, the term "efficiency" may refer to a relative efficiency, and the term "lifespan" may refer to a relative lifespan, among the organic light-emitting devices.

TABLE 13

| | First host | Second host | Dopant | Dopant (v %) | Effi-cieny | Life-span | Color coor-dinates (x, y) |
|---|---|---|---|---|---|---|---|
| Example 3-1B | H-1 | AH-3 | D-1 | 7 | 1.2 | 1.3 | 0.23, 0.69 |
| Example 3-2B | H-1 | AH-4 | D-1 | 7 | 1.3 | 1.4 | 0.23, 0.69 |
| Example 3-3B | H-1 | AH-5 | D-1 | 7 | 1.3 | 1.5 | 0.23, 0.69 |
| Comparative Example 3-1B | Compound 1 | — | Compound 2 | 7 | 1.0 | 1.0 | 0.30, 0.67 |
| Comparative Example 3-2B | Compound 1 | — | Compound 3 | 7 | 1.1 | 1.1 | 0.26, 0.69 |
| Comparative Example 3-3B | Compound 1 | — | D-1 | 7 | 1.1 | 1.1 | 0.23, 0.69 |
| Comparative Example 3-4B | H-1 | — | Compound 2 | 7 | 1.1 | 1.2 | 0.30, 0.67 |
| Comparative Example 3-5B | Compound 1 | AH-3 | Compound 2 | 7 | 1.0 | 1.3 | 0.30, 0.67 |
| Example 3-4B | H-3 | AH-1 | D-7 | 1 | 1.2 | 1.3 | 0.66, 0.34 |
| Example 3-5B | H-3 | AH-2 | D-7 | 1 | 1.3 | 1.4 | 0.66, 0.33 |
| Example 3-6B | H-3 | AH-3 | D-7 | 1 | 1.3 | 1.3 | 0.66, 0.33 |
| Example 3-7B | H-3 | AH-6 | D-7 | 1 | 1.3 | 1.4 | 0.66, 0.33 |
| Comparative Example 3-6B | Compound 1 | — | Compound 5 | 1 | 1.0 | 1.0 | 0.64, 0.34 |
| Comparative Example 3-7B | Compound 1 | — | Compound 6 | 1 | 1.1 | 1.0 | 0.65, 0.34 |
| Comparative Example 3-8B | Compound 1 | — | D-7 | 1 | 1.1 | 1.1 | 0.66, 0.33 |
| Comparative Example 3-9B | H-3 | — | Compound 5 | 1 | 1.1 | 1.2 | 0.64, 0.34 |
| Comparative Example 3-10B | Compound 1 | AH-1 | Compound 5 | 1 | 1.1 | 1.2 | 0.64, 0.34 |

Referring to Table 13, it can be seen that the organic light-emitting devices of Examples 3-1B to 3-7B had improved efficiencies and lifespans compared to those of the organic light-emitting devices of Comparative Examples 3-1B to 3-10B.

Hereinafter, compounds used in manufacturing organic light-emitting devices manufactured in Examples 1-1C to 1-30C and Comparative Examples 1-1C to 1-5C are as follows:

HT

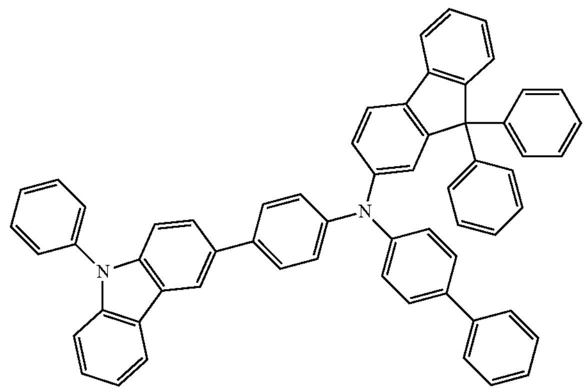

-continued
ET1
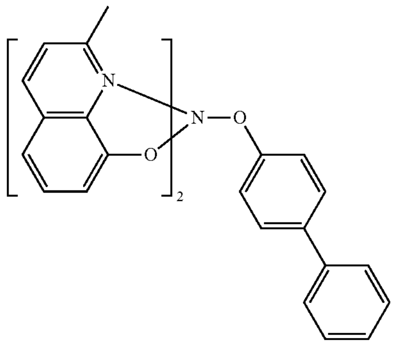
ET2
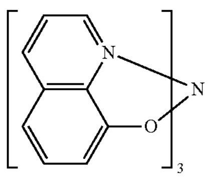
H-1a
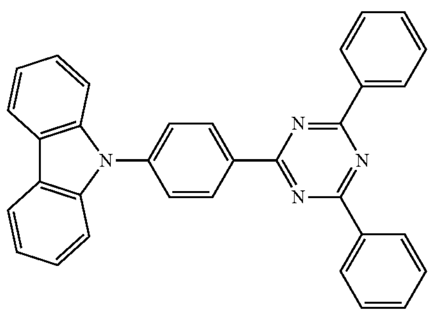
H-2a
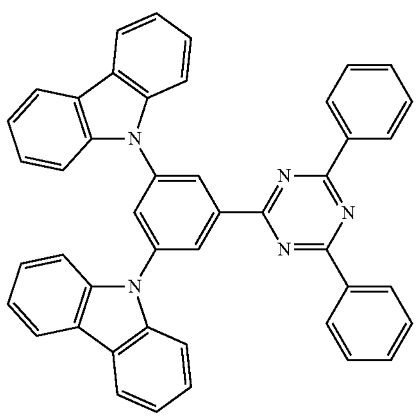
H-3a
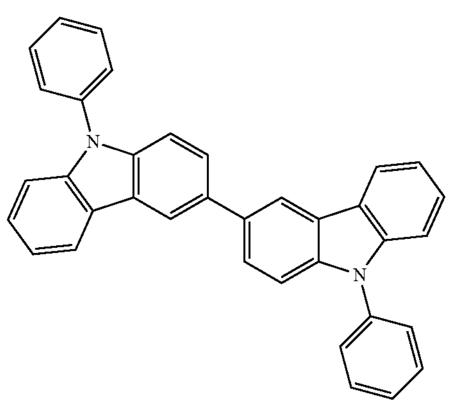
-continued
H-4a
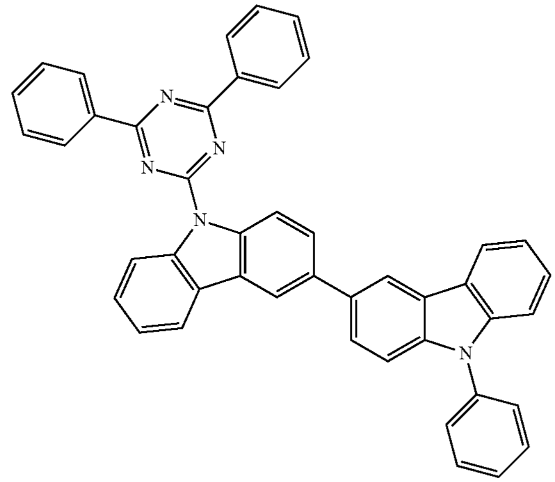
H-5a
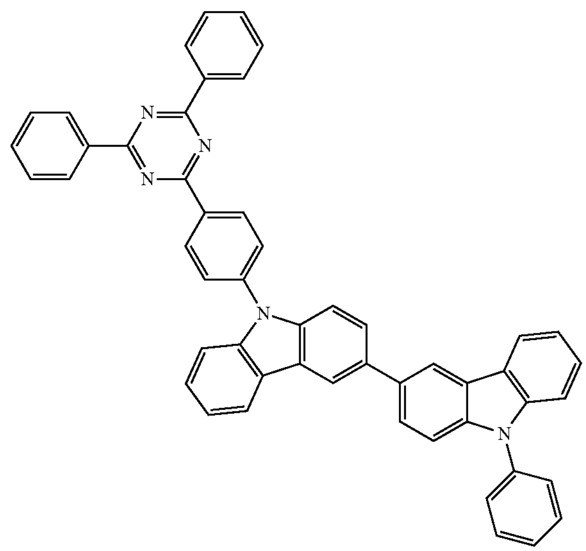
H-6a
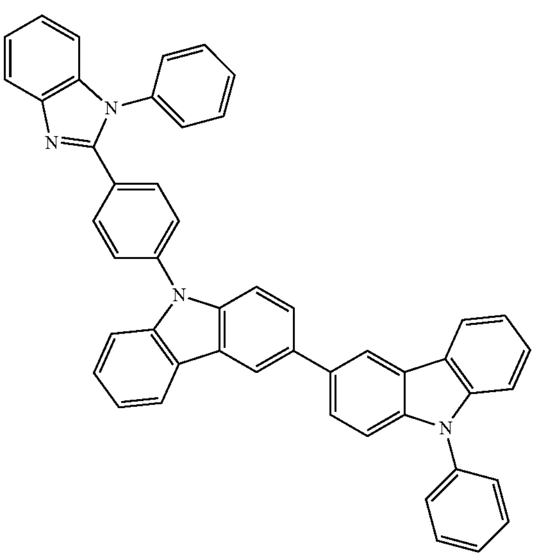

-continued
H-7a
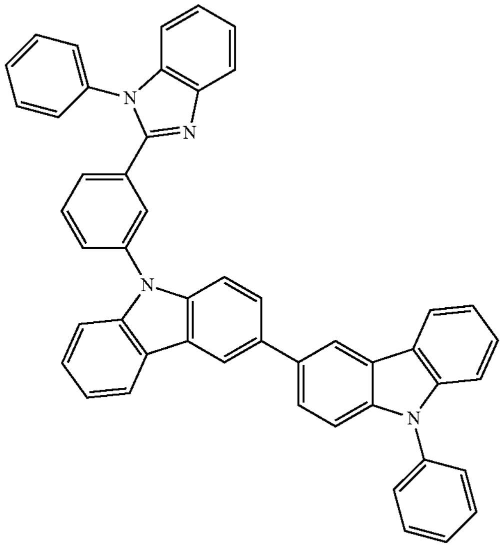
H-8a
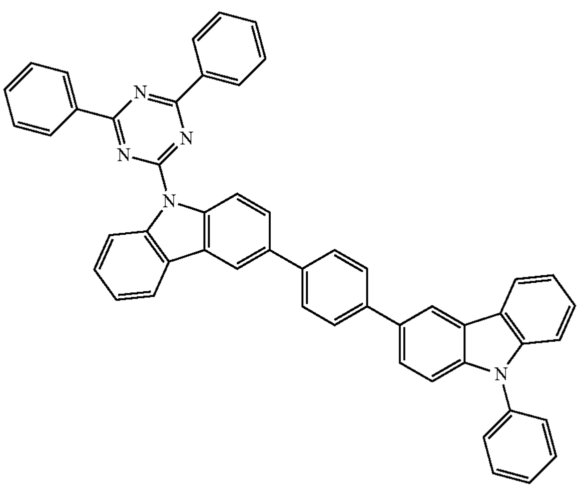
H-9a
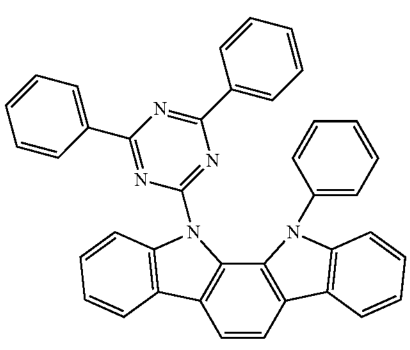
-continued
H-10a
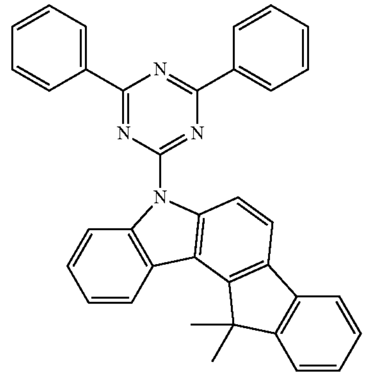
H-11a
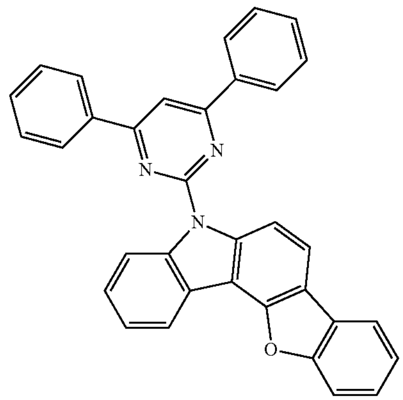
H-12a
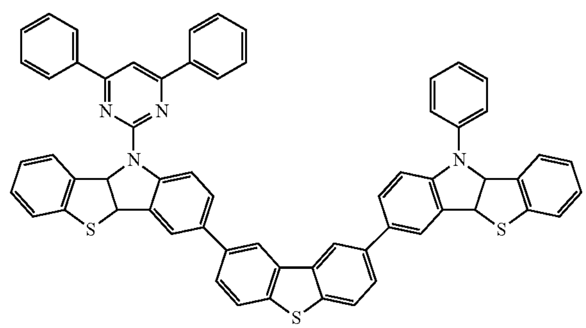
Compound 1
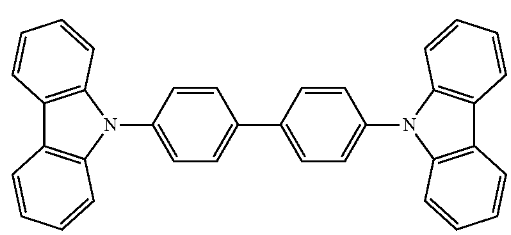

D-1
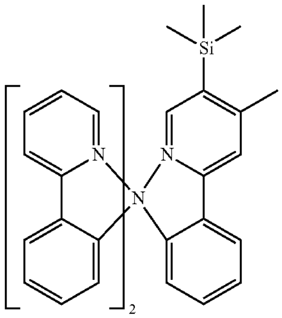
D-2
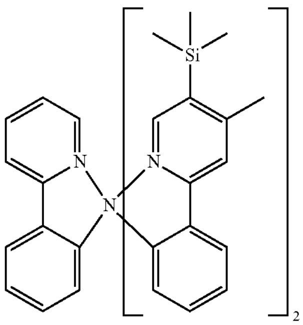
D-3
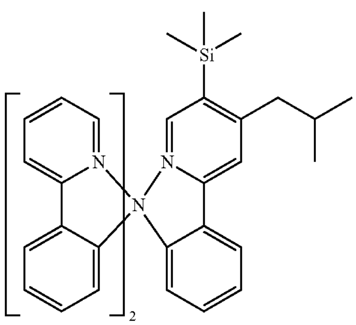
D-4
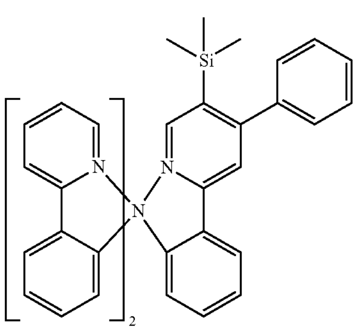
D-5
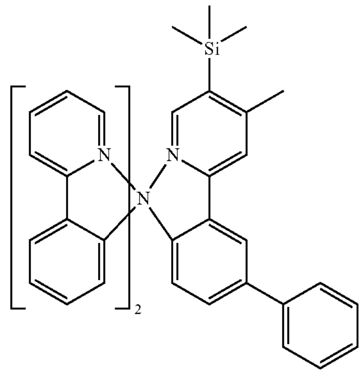
D-6
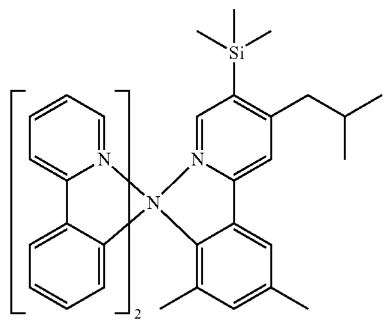
Compound 2
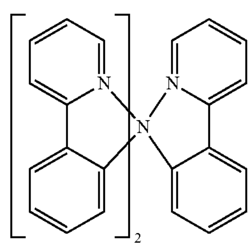
Compound 3
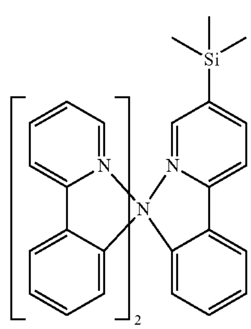

-continued

Compound 4

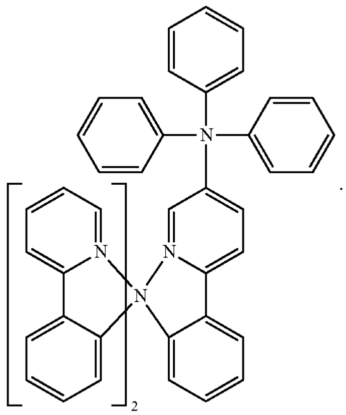

Example 1-1C

Glass/ITO (120)/HT (120)/Host1:Host2_10%: Dop_7% (30)/ET1 (5)/ET2 (25)/LiF (0.5)/Al (150)

As an anode, a 15 Ω/cm$^2$ (1,200 Å) ITO glass substrate (manufactured by Corning company) was cut into a size of 50 mm×50 mm×0.7 mm and ultrasonically washed with isopropyl alcohol and pure water, each for 5 minutes. Afterwards, the ITO glass substrate was irradiated by UV light for 30 minutes, cleaned by exposure to ozone, and then, mounted on a vacuum depositor.

Compound HT was vacuum-deposited on the substrate to form a hole transport region having a thickness of 120 nm.

Compound H-1a, H3-a (10 v %), and D-1 (7 v %) were co-deposited on the hole transport region to form an EML having a thickness of 30 nm.

Compound ET1 was deposited on the EML to form a buffer layer having a thickness of 5 nm, and Compound ET2 was deposited on the buffer layer to form an electron transport layer (ETL) having a thickness of 25 nm. LiF was deposited on the ETL to form an electron injection layer (EIL) having a thickness of 0.5 nm, thereby preparing an electron transport region.

Al was deposited on the electron transport region to a thickness of 150 nm, thereby manufacturing an organic light-emitting device.

Examples 1-2C to 1-30C and Comparative Examples 1-1C to 1-5C

Organic light-emitting devices were manufactured in the same (or substantially the same) manner as in Example 1-1C, except that in forming the EML, first host, second host, and dopant materials shown in Table 14 were used:

TABLE 14

| | First host | Second host | Dopant |
|---|---|---|---|
| Example 1-1C | H-1a | H-3a | D-1 |
| Example 1-2C | H-1a | H-3a | D-2 |
| Example 1-3C | H-1a | H-3a | D-3 |
| Example 1-4C | H-1a | H-3a | D-4 |
| Example 1-5C | H-1a | H-3a | D-5 |
| Example 1-6C | H-1a | H-3a | D-6 |
| Example 1-7C | H-2a | H-3a | D-1 |
| Example 1-8C | H-2a | H-3a | D-3 |
| Example 1-9C | H-2a | H-3a | D-5 |
| Example 1-10C | H-4a | H-3a | D-1 |
| Example 1-11C | H-4a | H-3a | D-3 |
| Example 1-12C | H-4a | H-3a | D-5 |
| Example 1-13C | H-5a | H-3a | D-1 |
| Example 1-14C | H-5a | H-3a | D-3 |
| Example 1-15C | H-5a | H-3a | D-5 |
| Example 1-16C | H-8a | H-3a | D-1 |
| Example 1-17C | H-8a | H-3a | D-3 |
| Example 1-18C | H-8a | H-3a | D-5 |
| Example 1-19C | H-9a | H-3a | D-1 |
| Example 1-20C | H-9a | H-3a | D-3 |
| Example 1-21C | H-9a | H-3a | D-5 |
| Example 1-22C | H-10a | H-3a | D-1 |
| Example 1-23C | H-10a | H-3a | D-3 |
| Example 1-24C | H-10a | H-3a | D-5 |
| Example 1-25C | H-11a | H-3a | D-1 |
| Example 1-26C | H-11a | H-3a | D-3 |
| Example 1-27C | H-11a | H-3a | D-5 |
| Example 1-28C | H-12a | H-3a | D-1 |
| Example 1-29C | H-12a | H-3a | D-3 |
| Example 1-30C | H-12a | H-3a | D-5 |
| Comparative Example 1-1C | Compound 1 | — | Compound 2 |
| Comparative Example 1-2C | Compound 1 | — | Compound 3 |
| Comparative Example 1-3C | Compound 1 | — | D-1 |
| Comparative Example 1-4C | H-1a | — | Compound 2 |
| Comparative Example 1-5C | Compound 1 | H-3a | Compound 2 |

Evaluation Example 9

The organic light-emitting devices of Examples 1-1C to 1-30C and Comparative Examples 1-1C to 1-5C were subjected to measure and evaluation of efficiencies (at current density of 10 mA/cm$^2$), lifespan data (at 50 mA/cm$^2$), and color coordinates, by using an IVL meter (PhotoResearch PR650, Keithley 238), and the results are shown in Table 15. In Table 15, the term "efficiency" may refer to a relative efficiency, and the term "lifespan" may refer to a relative lifespan, among the organic light-emitting devices.

TABLE 15

| | First host | Second host | Dopant | Efficiency | Life-span | Color coordinates (x, y) |
|---|---|---|---|---|---|---|
| Example 1-1C | H-1a | H-3a | D-1 | 1.1 | 1.2 | 0.23, 0.69 |
| Example 1-2C | H-1a | H-3a | D-2 | 1.2 | 1.2 | 0.24, 0.68 |
| Example 1-3C | H-1a | H-3a | D-3 | 1.2 | 1.3 | 0.22, 0.69 |
| Example 1-4C | H-1a | H-3a | D-4 | 1.2 | 1.2 | 0.23, 0.68 |
| Example 1-5C | H-1a | H-3a | D-5 | 1.2 | 1.3 | 0.23, 0.68 |
| Example 1-6C | H-1a | H-3a | D-6 | 1.2 | 1.2 | 0.22, 0.69 |

TABLE 15-continued

| | First host | Second host | Dopant | Effi-ciency | Life-span | Color coor-dinates (x, y) |
|---|---|---|---|---|---|---|
| Example 1-7C | H-2a | H-3a | D-1 | 1.2 | 1.3 | 0.23, 0.69 |
| Example 1-8C | H-2a | H-3a | D-3 | 1.3 | 1.3 | 0.22, 0.69 |
| Example 1-9C | H-2a | H-3a | D-5 | 1.2 | 1.3 | 0.23, 0.68 |
| Example 1-10C | H-4a | H-3a | D-1 | 1.4 | 1.4 | 0.23, 0.69 |
| Example 1-11C | H-4a | H-3a | D-3 | 1.3 | 1.5 | 0.22, 0.69 |
| Example 1-12C | H-4a | H-3a | D-5 | 1.3 | 1.4 | 0.23, 0.68 |
| Example 1-13C | H-5a | H-3a | D-1 | 1.4 | 1.3 | 0.23, 0.69 |
| Example 1-14C | H-5a | H-3a | D-3 | 1.3 | 1.4 | 0.22, 0.69 |
| Example 1-15C | H-5a | H-3a | D-5 | 1.3 | 1.4 | 0.23, 0.68 |
| Example 1-16C | H-8a | H-3a | D-1 | 1.4 | 1.3 | 0.23, 0.69 |
| Example 1-17C | H-8a | H-3a | D-3 | 1.3 | 1.3 | 0.22, 0.69 |
| Example 1-18C | H-8a | H-3a | D-5 | 1.3 | 1.4 | 0.23, 0.68 |
| Example 1-19C | H-9a | H-3a | D-1 | 1.3 | 1.4 | 0.23, 0.69 |
| Example 1-20C | H-9a | H-3a | D-3 | 1.3 | 1.3 | 0.22, 0.69 |
| Example 1-21C | H-9a | H-3a | D-5 | 1.3 | 1.4 | 0.23, 0.68 |
| Example 1-22C | H-10a | H-3a | D-1 | 1.2 | 1.3 | 0.23, 0.69 |
| Example 1-23C | H-10a | H-3a | D-3 | 1.3 | 1.2 | 0.22, 0.69 |
| Example 1-24C | H-10a | H-3a | D-5 | 1.3 | 1.3 | 0.23, 0.68 |
| Example 1-25C | H-11a | H-3a | D-1 | 1.3 | 1.3 | 0.23, 0.69 |
| Example 1-26C | H-11a | H-3a | D-3 | 1.2 | 1.3 | 0.22, 0.69 |
| Example 1-27C | H-11a | H-3a | D-5 | 1.3 | 1.4 | 0.23, 0.68 |
| Example 1-28C | H-12a | H-3a | D-1 | 1.1 | 1.3 | 0.23, 0.69 |
| Example 1-29C | H-12a | H-3a | D-3 | 1.1 | 1.3 | 0.22, 0.69 |
| Example 1-30C | H-12a | H-3a | D-5 | 1.2 | 1.2 | 0.23, 0.68 |
| Comparative Example 1-1C | Compound 1 | — | Compound 2 | 1.0 | 1.0 | 0.30, 0.67 |
| Comparative Example 1-2C | Compound 1 | — | Compound 3 | 1.1 | 1.1 | 0.26, 0.69 |
| Comparative Example 1-3C | Compound 1 | — | D-1 | 1.1 | 1.1 | 0.23, 0.69 |
| Comparative Example 1-4C | H-1a | — | Compound 2 | 1.1 | 1.2 | 0.30, 0.67 |
| Comparative Example 1-5C | Compound 1 | H-3a | Compound 2 | 1.0 | 1.2 | 0.30, 0.67 |

Referring to Table 15, it can be seen that the organic light-emitting devices of Examples 1-1C to 1-30C had improved efficiencies and mostly improved lifespans compared to those of the organic light-emitting devices of Comparative Examples 1-1C to 1-5C.

Hereinafter, compounds used in manufacturing organic light-emitting devices manufactured in Examples 2-1C to 2-8C and Comparative Examples 2-1C to 2-10C are as follows:

H-1a

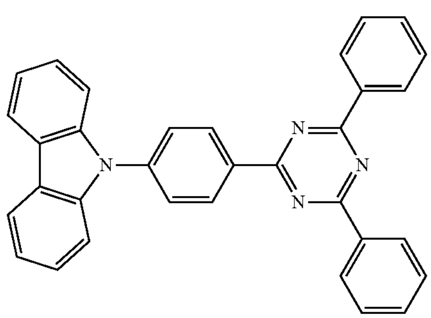

-continued

H-2a

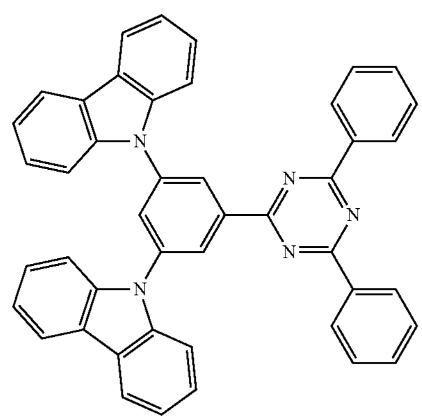

-continued
H-3a
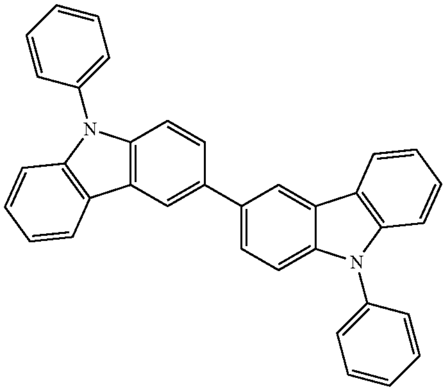
H-4a
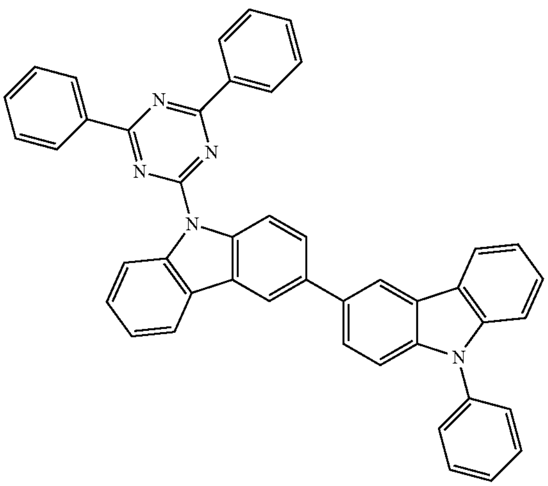
H-5a
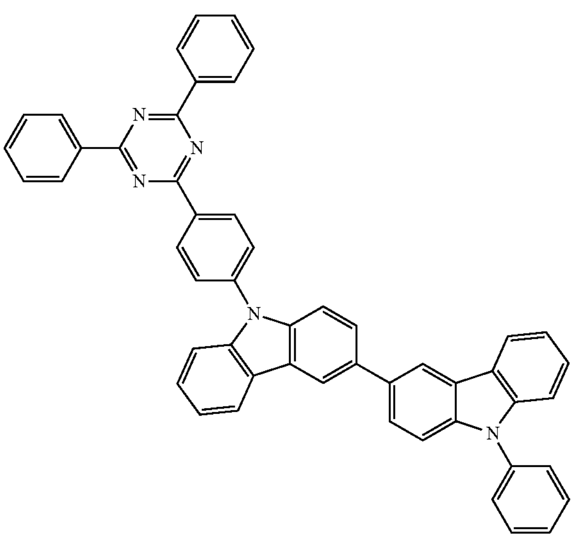
-continued
H-6a
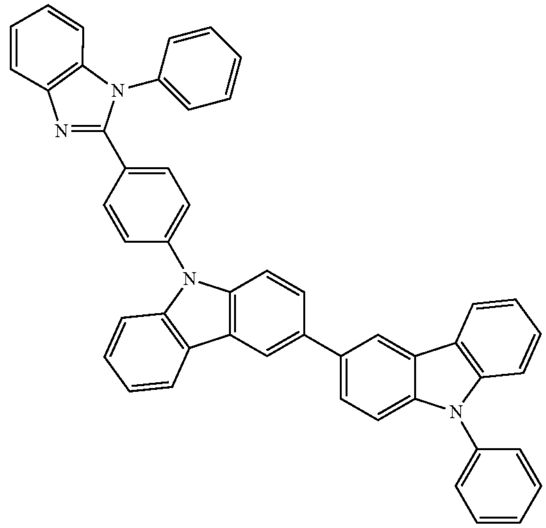
H-7a
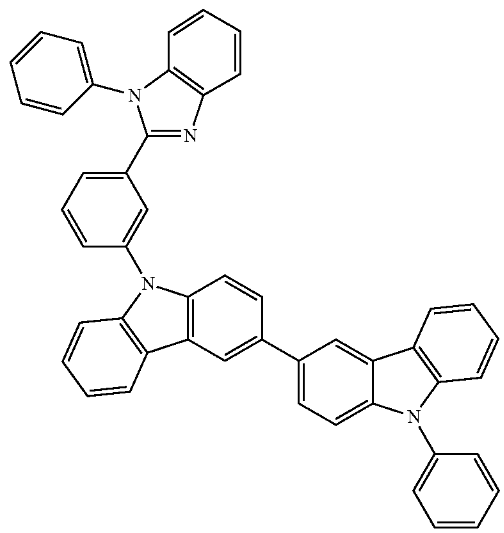
H-8a
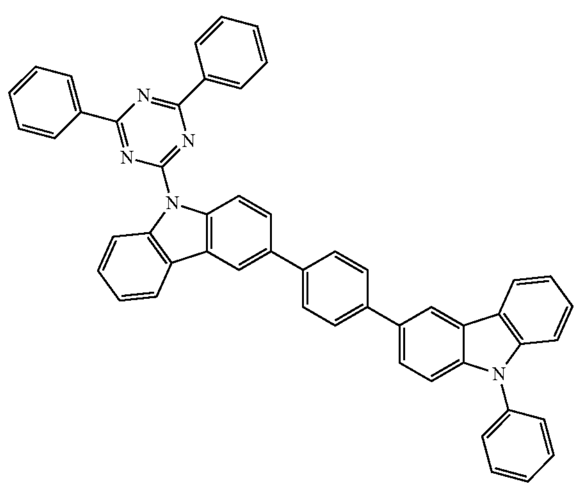

-continued
H-9a
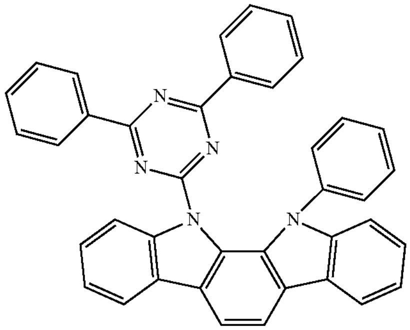
H-10a
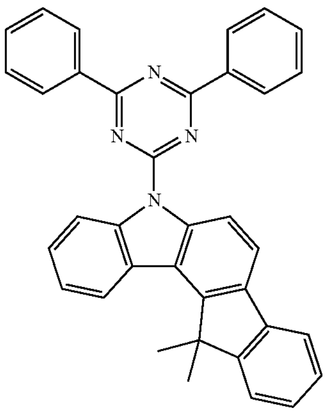
H-11a
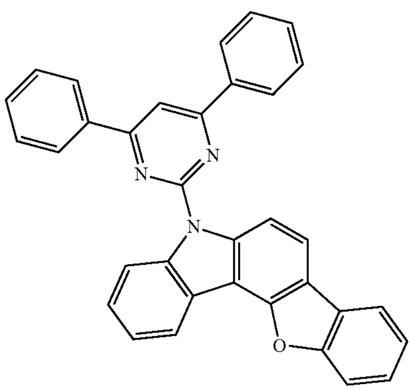
H-12a
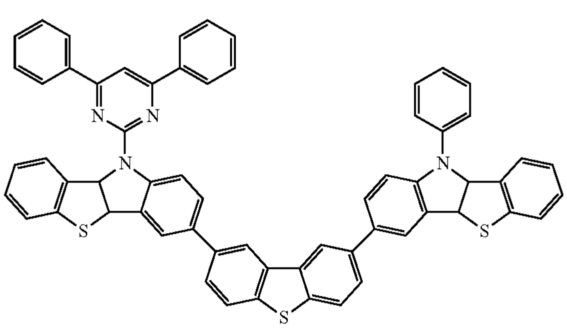
-continued
Compound 1
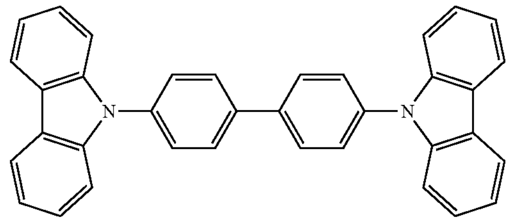
D-7
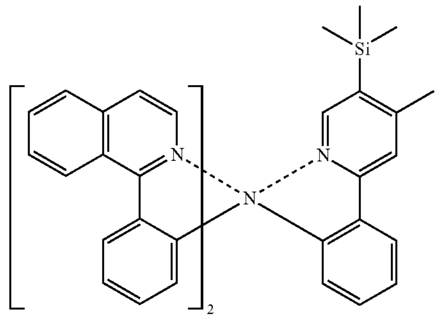
D-8
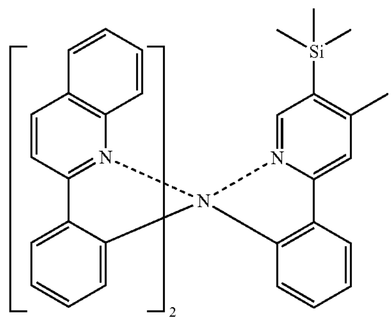
Compound 5
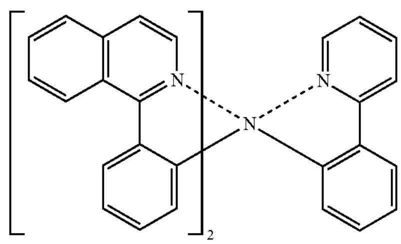
Compound 6
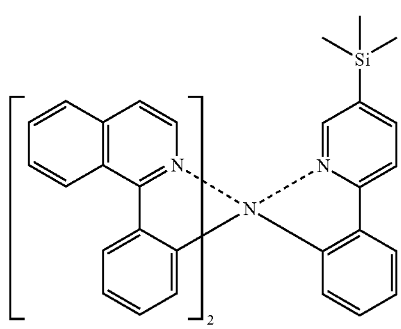

-continued

Compound 7

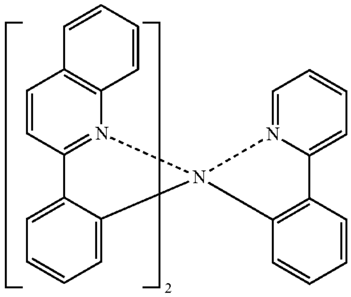

Compound 8

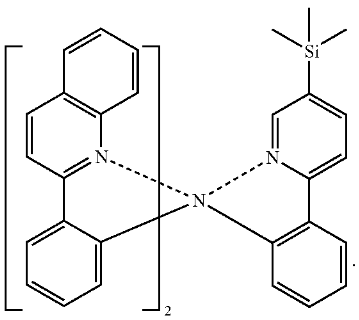

Examples 2-1C to 2-8C and Comparative Examples 2-1C to 2-10C

Glass/ITO (120)/HT (120)/Host1:Host2_10%: Dop_1% (30)/ET1 (5)/ET2 (25)/LiF (0.5)/Al (150)

Organic light-emitting devices were manufactured in the same (or substantially the same) manner as in Example 1-1C, except that in forming the EML, compounds listed in Table 16 were used as the first hosts, the second hosts, and the dopants, and the amounts of the dopants were changed to 1 v %.

TABLE 16

| | First host | Second host | Dopant |
|---|---|---|---|
| Example 2-1C | H-1a | H-4a | D-7 |
| Example 2-2C | H-5a | H-4a | D-7 |
| Example 2-3C | H-6a | H-4a | D-7 |
| Example 2-4C | H-7a | H-4a | D-7 |
| Comparative Example 2-1C | Compound 1 | — | Compound 5 |
| Comparative Example 2-2C | Compound 1 | — | Compound 6 |
| Comparative Example 2-3C | Compound 1 | — | D-7 |
| Comparative Example 2-4C | H-1a | — | Compound 5 |
| Comparative Example 2-5C | Compound 1 | H-4a | Compound 5 |
| Example 2-5C | H-1a | H-4a | D-8 |
| Example 2-6C | H-5a | H-4a | D-8 |
| Example 2-7C | H-6a | H-4a | D-8 |
| Example 2-8C | H-7a | H-4a | D-8 |
| Comparative Example 2-6C | Compound 1 | — | Compound 7 |
| Comparative Example 2-7C | Compound 1 | — | Compound 8 |
| Comparative Example 2-8C | Compound 1 | — | D-7 |
| Comparative Example 2-9C | H-1a | — | Compound 7 |
| Comparative Example 2-10C | Compound 1 | H-4a | Compound 7 |

Evaluation Example 10

The organic light-emitting devices of Examples 2-1C to 2-8C and Comparative Examples 2-1C to 2-10C were subjected to measure and evaluation of efficiencies (at current density of 10 mA/cm$^2$), lifespan data (at 50 mA/cm$^2$), and color coordinates, by using an IVL meter (PhotoResearch PR650, Keithley 238), and the results are shown in Table 17. In Table 17, the term "efficiency" may refer to a relative efficiency, and the term "lifespan" may refer to a relative lifespan, among the organic light-emitting devices.

TABLE 17

| | First host | Second host | Dopant | Efficiency | Life-span | Color coordinates (x, y) |
|---|---|---|---|---|---|---|
| Example 2-1C | H-1a | H-4a | D-7 | 1.2 | 1.2 | 0.66, 0.33 |
| Example 2-2C | H-5a | H-4a | D-7 | 1.2 | 1.3 | 0.66, 0.33 |
| Example 2-3C | H-6a | H-4a | D-7 | 1.2 | 1.4 | 0.66, 0.33 |
| Example 2-4C | H-7a | H-4a | D-7 | 1.2 | 1.4 | 0.66, 0.33 |
| Comparative Example 2-1C | Compound 1 | — | Compound 5 | 1.0 | 1.0 | 0.64, 0.34 |
| Comparative Example 2-2C | Compound 1 | — | Compound 6 | 1.1 | 1.0 | 0.65, 0.34 |
| Comparative Example 2-3C | Compound 1 | — | D-7 | 1.1 | 1.1 | 0.66, 0.33 |
| Comparative Example 2-4C | H-1a | — | Compound 5 | 1.1 | 1.2 | 0.64, 0.34 |
| Comparative Example 2-5C | Compound 1 | H-4a | Compound 5 | 1.0 | 1.2 | 0.64, 0.34 |
| Example 2-5C | H-1a | H-4a | D-8 | 1.2 | 1.2 | 0.64, 0.34 |

TABLE 17-continued

| | First host | Second host | Dopant | Efficiency | Lifespan | Color coordinates (x, y) |
|---|---|---|---|---|---|---|
| Example 2-6C | H-5a | H-4a | D-8 | 1.3 | 1.2 | 0.64, 0.34 |
| Example 2-7C | H-6a | H-4a | D-8 | 1.3 | 1.3 | 0.64, 0.34 |
| Example 2-8C | H-7a | H-4a | D-8 | 1.2 | 1.3 | 0.64, 0.34 |
| Comparative Example 2-6C | Compound 1 | — | Compound 7 | 1.0 | 1.0 | 0.62, 0.35 |
| Comparative Example 2-7C | Compound 1 | — | Compound 8 | 1.1 | 1.0 | 0.63, 0.34 |
| Comparative Example 2-8C | Compound 1 | — | D-7 | 1.1 | 1.1 | 0.64, 0.34 |
| Comparative Example 2-9C | H-1a | — | Compound 7 | 1.1 | 1.1 | 0.62, 0.35 |
| Comparative Example 2-10C | Compound 1 | H-4a | Compound 7 | 1.0 | 1.2 | 0.62, 0.35 |

Referring to Table 17, it can be seen that the organic light-emitting devices of Examples 2-1C to 2-8C had improved efficiencies and mostly improved lifespans compared to those of the organic light-emitting devices of Comparative Examples 2-1C to 2-10C.

Hereinafter, compounds used in manufacturing organic light-emitting devices manufactured in Examples 3-1C to 3-27C and Comparative Examples 3-1C to 3-5C are as follows:

H-1a

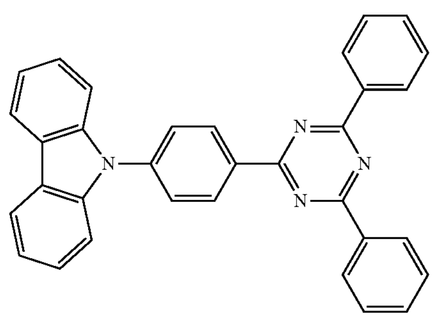

H-2a

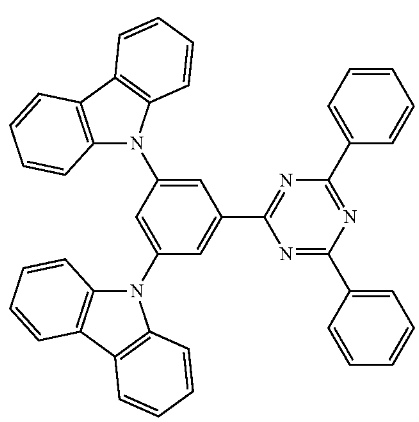

-continued

H-3a

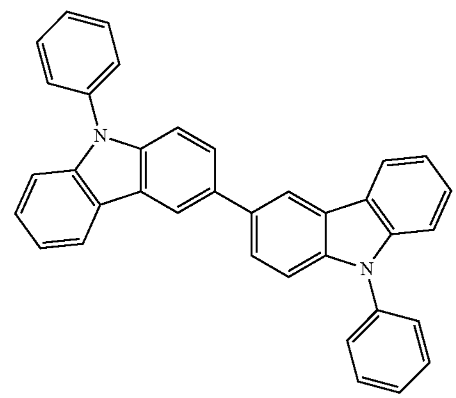

H-4a

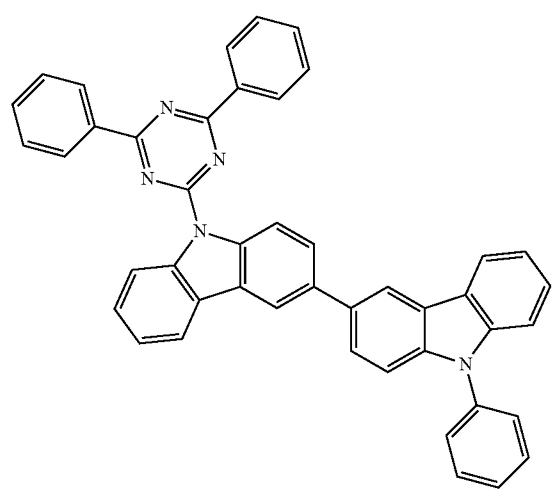

H-5a
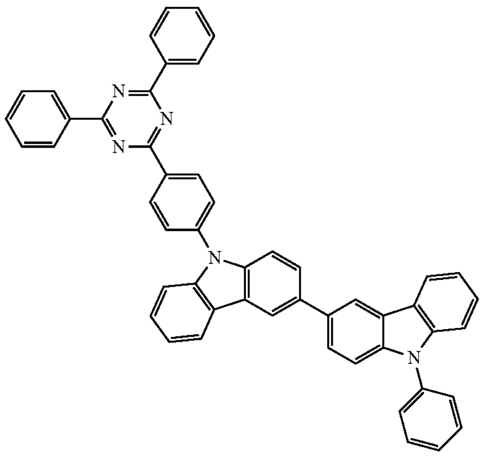
H-6a
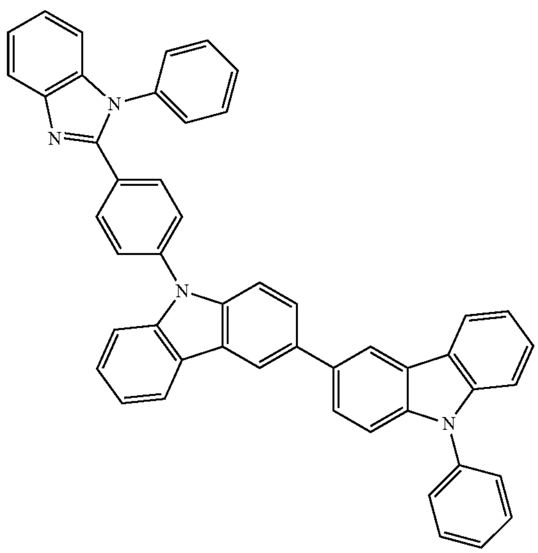
H-7a
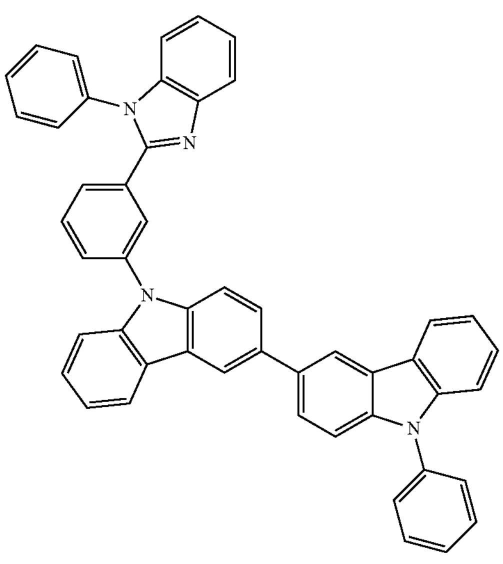
H-8a
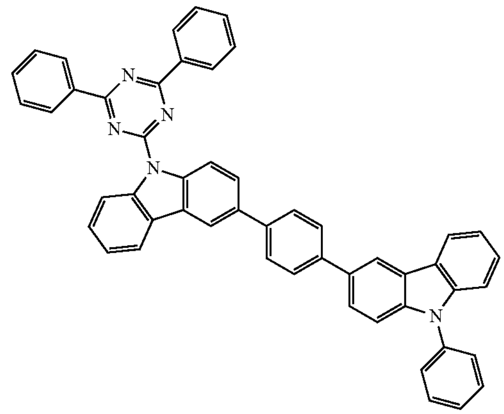
H-9a
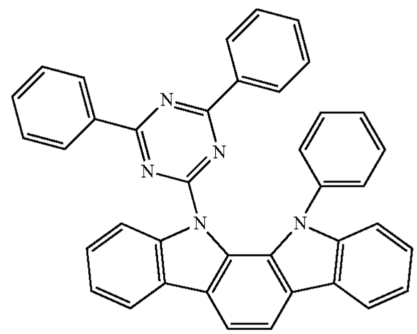
H-10a
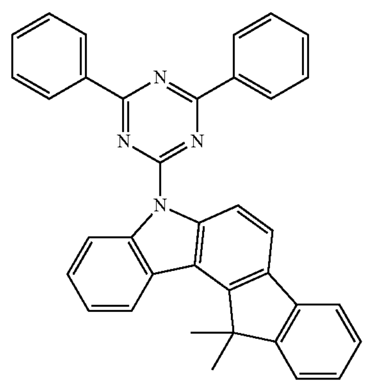
H-11a
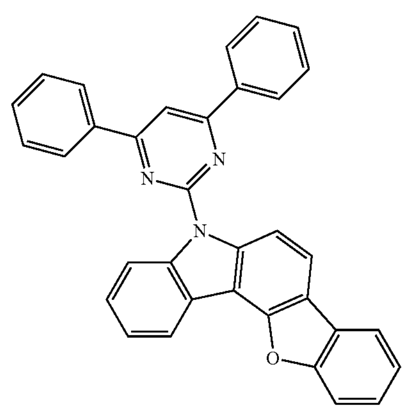

-continued
H-12a
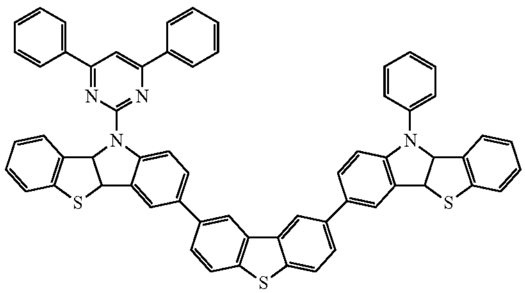
Compound 1
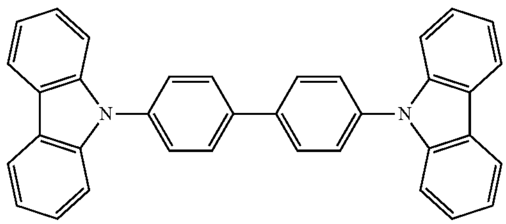
H-1b
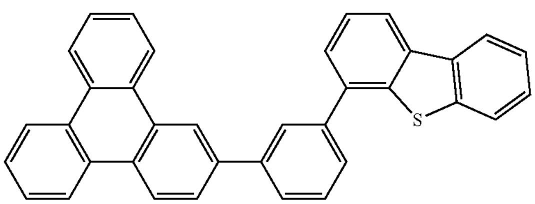
H-2b
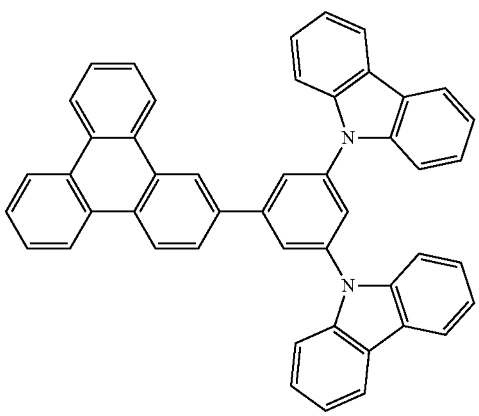
H-3b
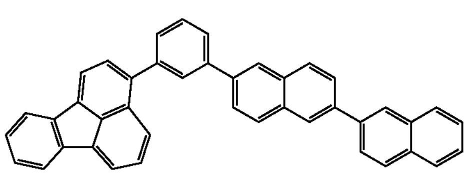
H-4b
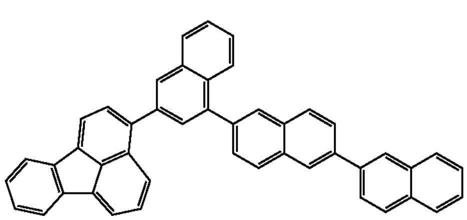
-continued
H-5b
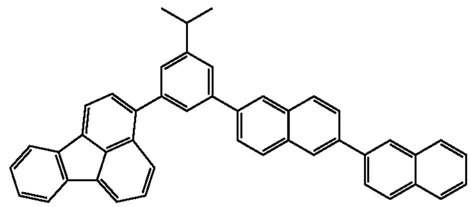
H-6b
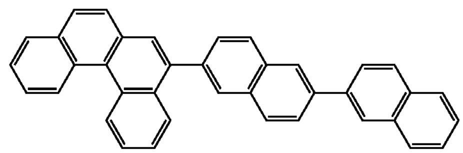
H-7b
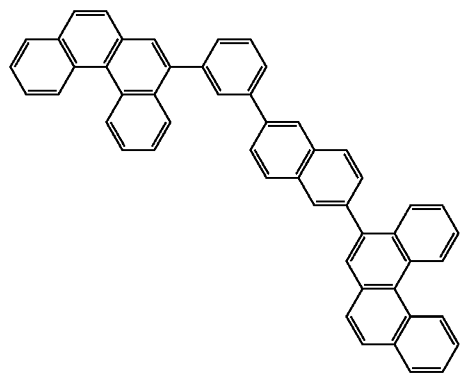
H-8b
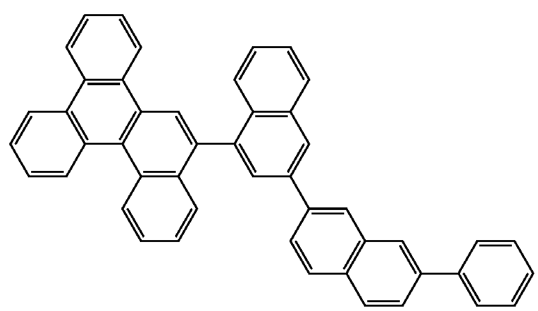
H-9b
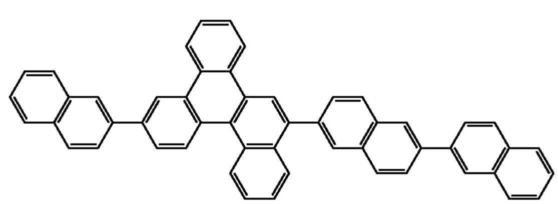

-continued
H-10b
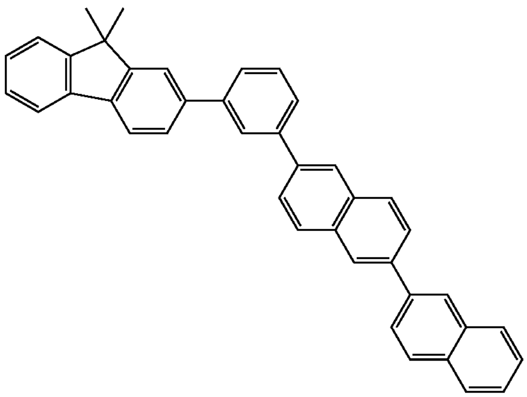
H-11b
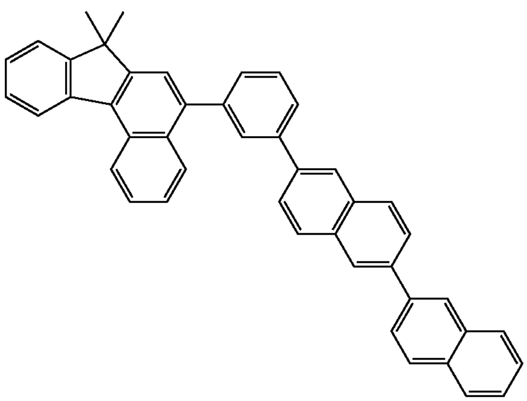
H-12b
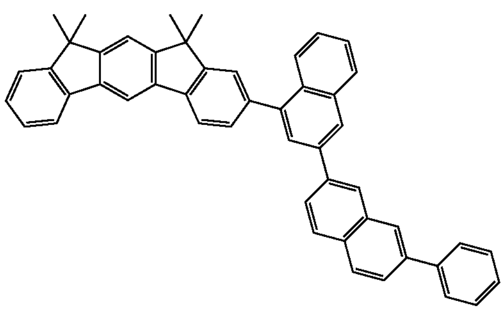
D-1
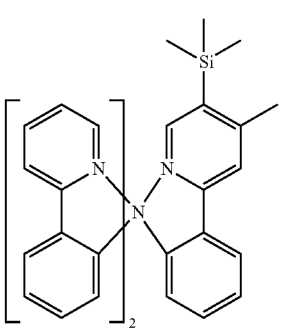
-continued
D-2
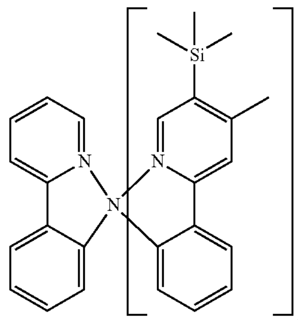
D-3
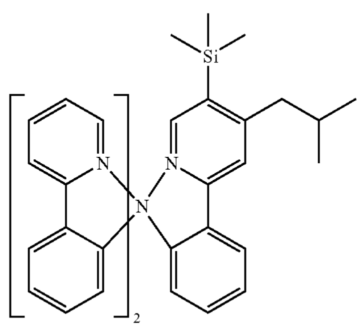
D-4
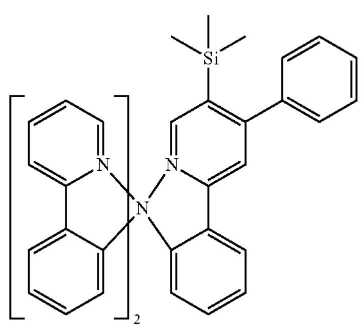
D-5
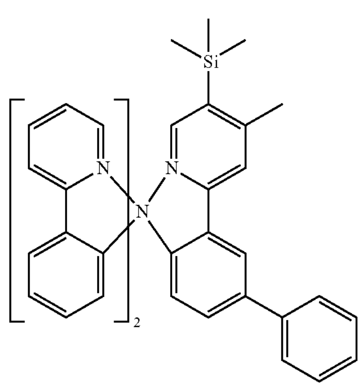

-continued

D-6

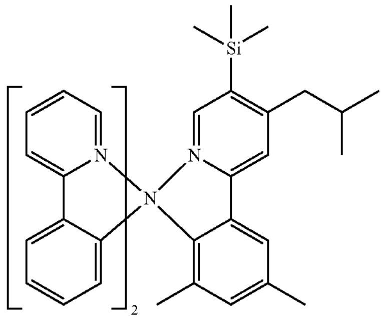

Compound 2

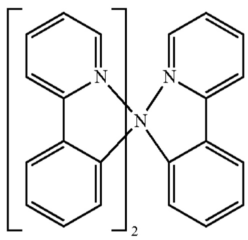

Compound 3

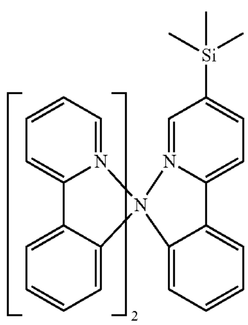

Compound 4

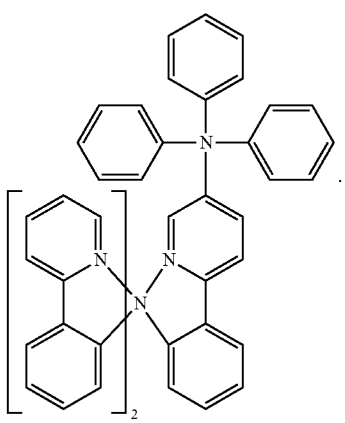

Examples 3-1C to 3-27C and Comparative Examples 3-1C to 3-5C

Glass/ITO (120)/HT (120)/Host1:Host2_10%: Dop_7% (30)/ET1 (5)/ET2 (25)/LiF (0.5)/Al (150)

Organic light-emitting devices were manufactured in the same (or substantially the same) manner as in Example 1-1C, except that in forming the EML, compounds listed in Table 18 were used as the first hosts, the second hosts, and the dopants:

TABLE 18

| | First host | Second host | Dopant |
|---|---|---|---|
| Example 3-1C | H-1b | H-4a | D-1 |
| Example 3-2C | H-1b | H-4a | D-2 |
| Example 3-3C | H-1b | H-4a | D-3 |
| Example 3-4C | H-1b | H-4a | D-4 |
| Example 3-5C | H-1b | H-4a | D-5 |
| Example 3-6C | H-1b | H-4a | D-6 |
| Example 3-7C | H-1b | H-5a | D-1 |
| Example 3-8C | H-1b | H-5a | D-3 |
| Example 3-9C | H-1b | H-5a | D-5 |
| Example 3-10C | H-1b | H-9a | D-1 |
| Example 3-11C | H-1b | H-9a | D-3 |
| Example 3-12C | H-1b | H-9a | D-5 |
| Example 3-13C | H-1b | H-10a | D-1 |
| Example 3-14C | H-1b | H-10a | D-3 |
| Example 3-15C | H-1b | H-10a | D-5 |
| Example 3-16C | H-1b | H-11a | D-1 |
| Example 3-17C | H-1b | H-11a | D-3 |
| Example 3-18C | H-1b | H-11a | D-5 |
| Example 3-19C | H-1b | H-12a | D-1 |
| Example 3-20C | H-1b | H-12a | D-3 |
| Example 3-21C | H-1b | H-12a | D-5 |
| Example 3-22C | H-2b | H-4a | D-1 |
| Example 3-23C | H-2b | H-4a | D-3 |
| Example 3-24C | H-2b | H-4a | D-5 |
| Example 3-25C | H-2b | H-9a | D-1 |
| Example 3-26C | H-2b | H-9a | D-3 |
| Example 3-27C | H-2b | H-9a | D-5 |
| Comparative Example 3-1C | Compound 1 | — | Compound 2 |
| Comparative Example 3-2C | Compound 1 | — | Compound 3 |
| Comparative Example 3-3C | Compound 1 | — | D-1 |
| Comparative Example 3-4C | H-1a | — | Compound 2 |
| Comparative Example 3-5C | Compound 1 | H-3a | Compound 2 |

Evaluation Example 11

The organic light-emitting devices of Examples 3-1C to 3-27C and Comparative Examples 3-1C to 3-5C were subjected to measure and evaluation of efficiencies (at current density of 10 mA/cm$^2$), lifespan data (at 50 mA/cm$^2$), and color coordinates, by using an IVL meter (PhotoResearch PR650, Keithley 238), and the results are shown in Table 19. In Table 19, the term "efficiency" may refer to a relative efficiency, and the term "lifespan" may refer to a relative lifespan, among the organic light-emitting devices.

TABLE 19

| | First host | Second host | Dopant | Effi-ciency | Life-span | Color coor-dinates (x, y) |
|---|---|---|---|---|---|---|
| Example 3-1C | H-1b | H-4a | D-1 | 1.3 | 1.3 | 0.23, 0.69 |
| Example 3-2C | H-1b | H-4a | D-2 | 1.3 | 1.4 | 0.24, 0.68 |
| Example 3-3C | H-1b | H-4a | D-3 | 1.2 | 1.4 | 0.22, 0.69 |
| Example 3-4C | H-1b | H-4a | D-4 | 1.3 | 1.3 | 0.23, 0.68 |
| Example 3-5C | H-1b | H-4a | D-5 | 1.3 | 1.4 | 0.23, 0.68 |
| Example 3-6C | H-1b | H-4a | D-6 | 1.2 | 1.3 | 0.22, 0.69 |
| Example 3-7C | H-1b | H-5a | D-1 | 1.3 | 1.4 | 0.23, 0.69 |
| Example 3-8C | H-1b | H-5a | D-3 | 1.4 | 1.4 | 0.22, 0.69 |
| Example 3-9C | H-1b | H-5a | D-5 | 1.3 | 1.5 | 0.23, 0.68 |
| Example 3-10C | H-1b | H-9a | D-1 | 1.3 | 1.4 | 0.23, 0.69 |
| Example 3-11C | H-1b | H-9a | D-3 | 1.2 | 1.3 | 0.22, 0.69 |
| Example 3-12C | H-1b | H-9a | D-5 | 1.3 | 1.4 | 0.23, 0.68 |
| Example 3-13C | H-1b | H-10a | D-1 | 1.3 | 1.3 | 0.23, 0.69 |
| Example 3-14C | H-1b | H-10a | D-3 | 1.3 | 1.2 | 0.22, 0.69 |
| Example 3-15C | H-1b | H-10a | D-5 | 1.4 | 1.3 | 0.23, 0.68 |
| Example 3-16C | H-1b | H-11a | D-1 | 1.2 | 1.4 | 0.23, 0.69 |
| Example 3-17C | H-1b | H-11a | D-3 | 1.2 | 1.3 | 0.22, 0.69 |
| Example 3-18C | H-1b | H-11a | D-5 | 1.3 | 1.4 | 0.23, 0.68 |
| Example 3-19C | H-1b | H-12a | D-1 | 1.2 | 1.3 | 0.23, 0.69 |
| Example 3-20C | H-1b | H-12a | D-3 | 1.1 | 1.2 | 0.22, 0.69 |
| Example 3-21C | H-1b | H-12a | D-5 | 1.2 | 1.3 | 0.23, 0.68 |
| Example 3-22C | H-2b | H-4a | D-1 | 1.2 | 1.2 | 0.23, 0.69 |
| Example 3-23C | H-2b | H-4a | D-3 | 1.1 | 1.3 | 0.22, 0.69 |
| Example 3-24C | H-2b | H-4a | D-5 | 1.2 | 1.3 | 0.23, 0.68 |
| Example 3-25C | H-2b | H-9a | D-1 | 1.2 | 1.2 | 0.23, 0.69 |
| Example 3-26C | H-2b | H-9a | D-3 | 1.2 | 1.2 | 0.22, 0.69 |
| Example 3-27C | H-2b | H-9a | D-5 | 1.3 | 1.2 | 0.23, 0.68 |
| Comparative Example 3-1C | Compound 1 | — | Compound 2 | 1.0 | 1.0 | 0.30, 0.67 |
| Comparative Example 3-2C | Compound 1 | — | Compound 3 | 1.1 | 1.1 | 0.26, 0.69 |
| Comparative Example 3-3C | Compound 1 | — | D-1 | 1.1 | 1.1 | 0.23, 0.69 |
| Comparative Example 3-4C | H-1a | — | Compound 2 | 1.1 | 1.2 | 0.30, 0.67 |
| Comparative Example 3-5C | Compound 1 | H-3a | Compound 2 | 1.0 | 1.2 | 0.30, 0.67 |

Referring to Table 19, it can be seen that the organic light-emitting devices of Examples 3-1C to 3-27C had mostly improved efficiencies and lifespans compared to those of the organic light-emitting devices of Comparative Examples 3-1C to 3-5C.

Hereinafter, compounds used in manufacturing organic light-emitting devices manufactured in Examples 4-1C to 4-13C and Comparative Examples 4-1C to 4-10C are as follows:

H-1a

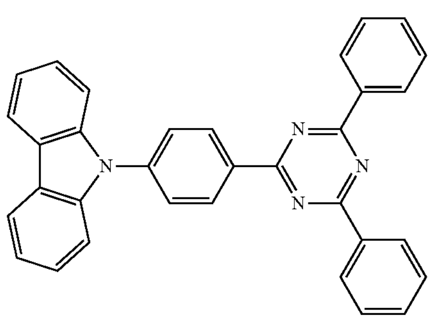

-continued

H-2a

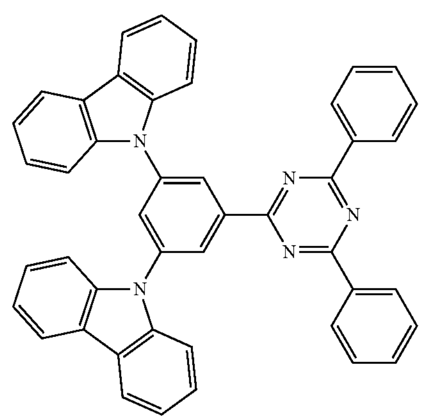

-continued
H-3a
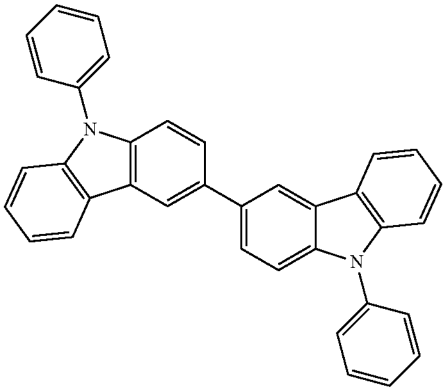
H-4a
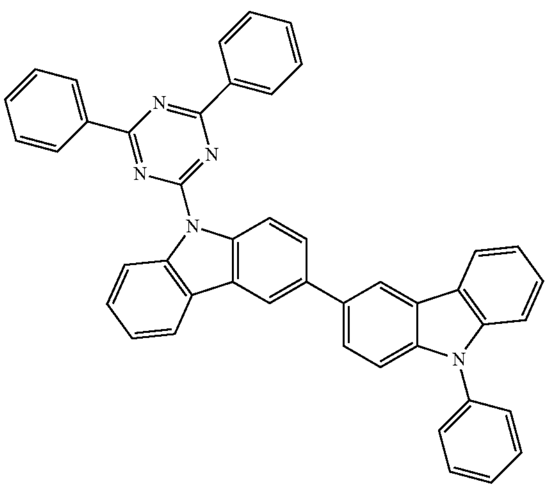
H-5a
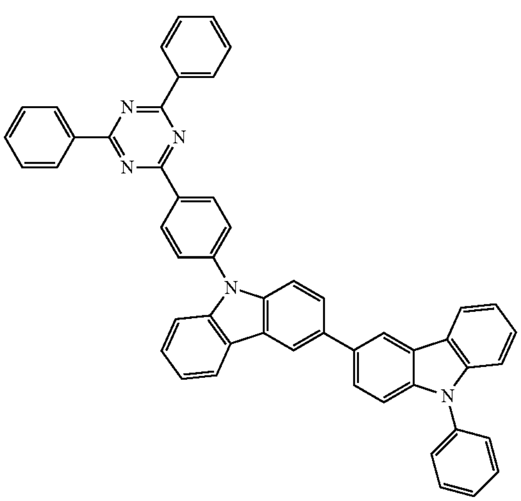
-continued
H-6a
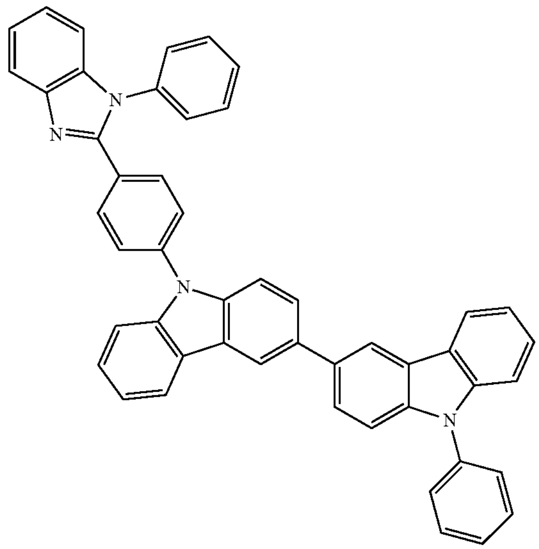
H-7a
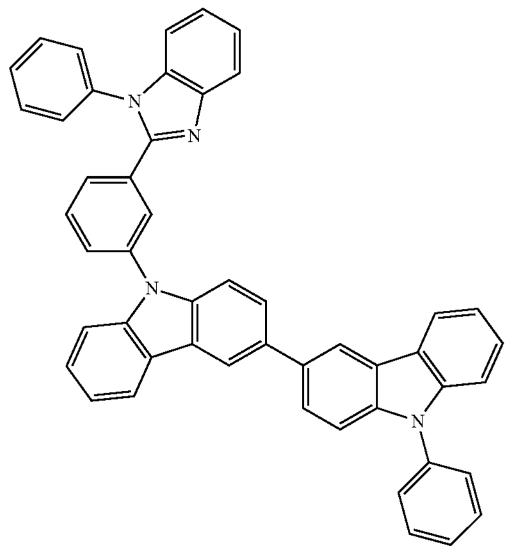
H-8a
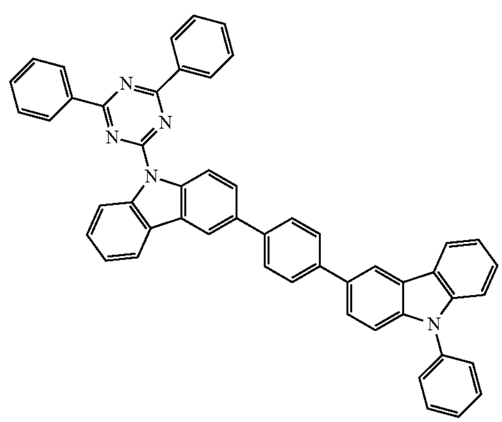

-continued
H-9a
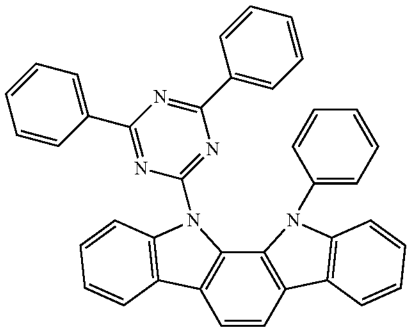
H-10a
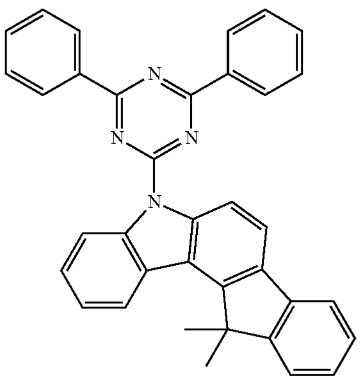
H-11a
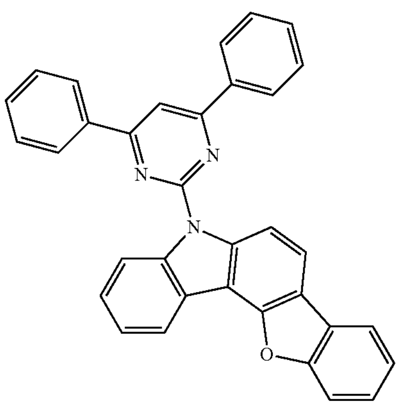
H-12a
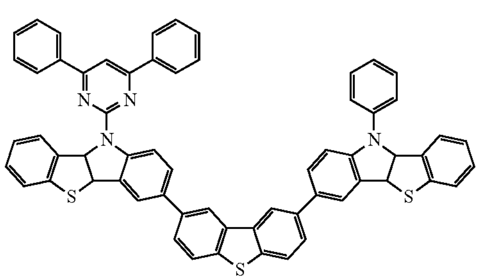
-continued
Compound 1
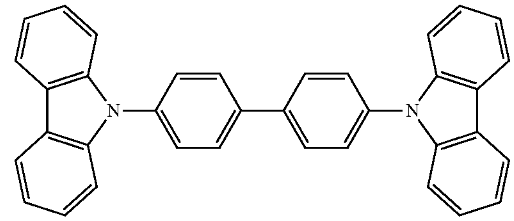
H-1b
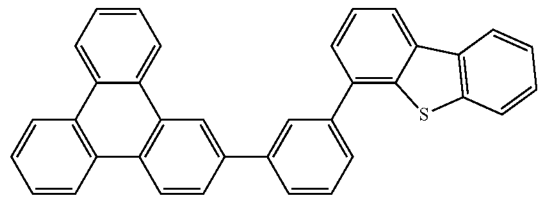
H-2b
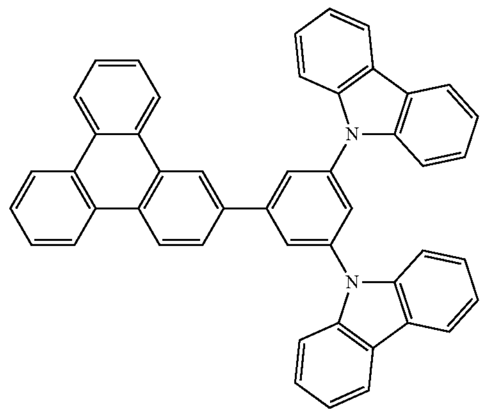
H-3b
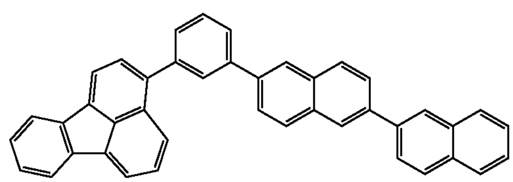
H-4b
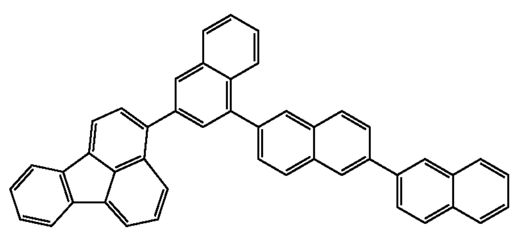
H-5b
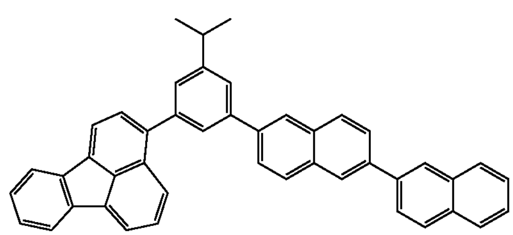

-continued
H-6b
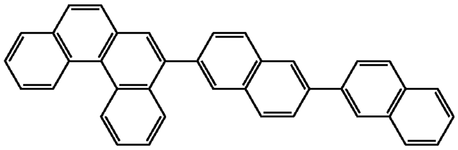
H-7b
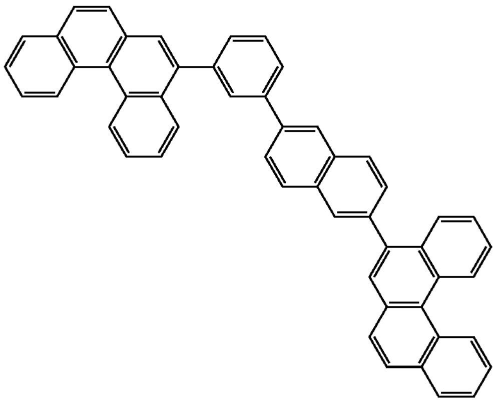
H-8b
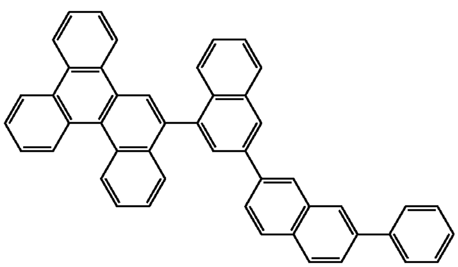
H-9b
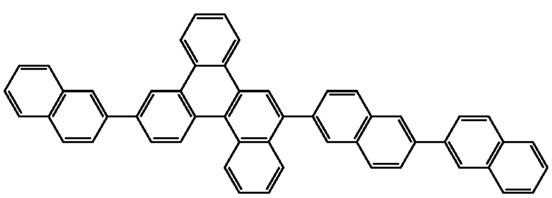
H-10b
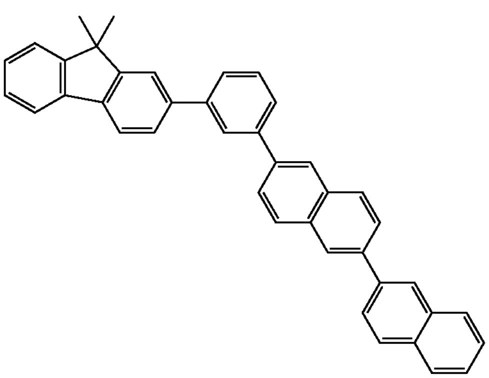
-continued
H-11b
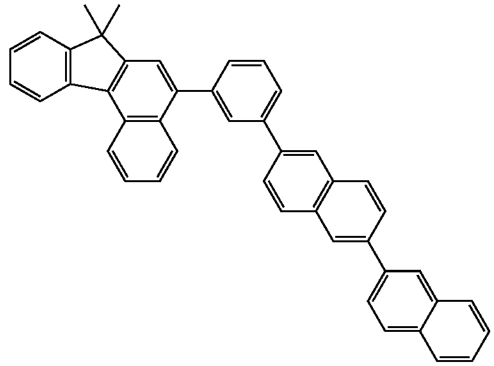
H-12b
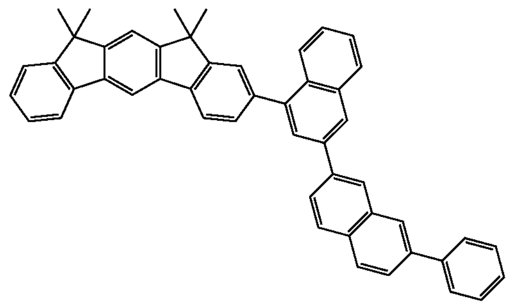
D-7
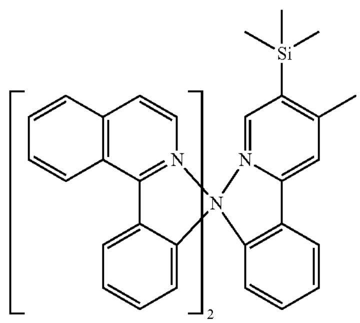
D-8
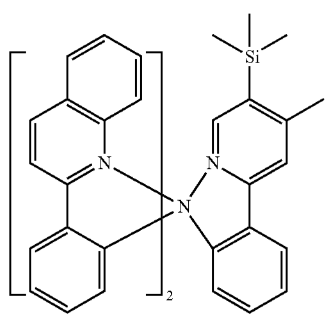
Compound 5
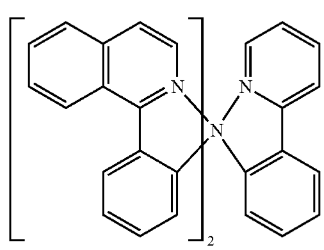

-continued

Compound 6

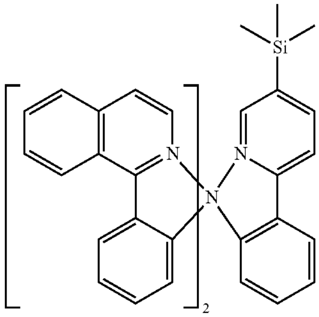

Compound 7

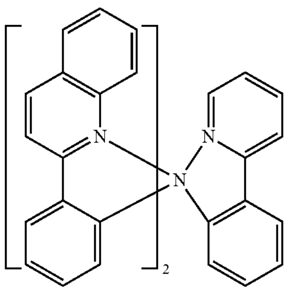

Compound 8

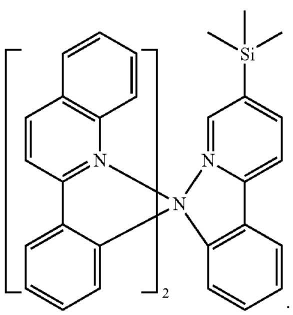

Examples 4-1C to 4-13C and Comparative Examples 4-1C to 4-10C

Glass/ITO (120)/HT (120)/Host1:Host2_10%: Dop_1% (30)/ET1 (5)/ET2 (25)/LiF (0.5)/Al (150)

Organic light-emitting devices were manufactured in the same (or substantially the same) manner as in Example 1-1C, except that in forming the EML, compounds listed in Table 20 were used as the first hosts, the second hosts, and the dopants, and the amounts of the dopants were changed to 1 v %.

TABLE 20

| | First host | Second host | Dopant |
|---|---|---|---|
| Example 4-1C | H-3b | H-3a | D-7 |
| Example 4-2C | H-4b | H-3a | D-7 |
| Example 4-3C | H-5b | H-3a | D-7 |
| Example 4-4C | H-6b | H-3a | D-7 |
| Example 4-5C | H-7b | H-3a | D-7 |
| Example 4-6C | H-8b | H-3a | D-7 |
| Example 4-7C | H-9b | H-3a | D-7 |
| Example 4-5C | H-10b | H-3a | D-7 |
| Example 4-8C | H-11b | H-3a | D-7 |
| Example 4-9C | H-12b | H-3a | D-7 |
| Comparative Example 4-1C | Compound 1 | — | Compound 5 |
| Comparative Example 4-2C | Compound 1 | — | Compound 6 |
| Comparative Example 4-3C | Compound 1 | — | D-7 |
| Comparative Example 4-4C | H-1a | — | Compound 5 |
| Comparative Example 4-5C | Compound 1 | H-4a | Compound 5 |
| Example 4-10C | H-3b | H-3a | D-8 |
| Example 4-11C | H-6b | H-3a | D-8 |
| Example 4-12C | H-8b | H-3a | D-8 |
| Example 4-13C | H-11b | H-3a | D-8 |
| Comparative Example 4-6C | Compound 1 | — | Compound 7 |
| Comparative Example 4-7C | Compound 1 | — | Compound 8 |
| Comparative Example 4-8C | Compound 1 | — | D-7 |
| Comparative Example 4-9C | H-1a | — | Compound 7 |
| Comparative Example 4-10C | Compound 1 | H-4a | Compound 7 |

Evaluation Example 12

The organic light-emitting devices of Examples 4-1C to 4-13C and Comparative Examples 4-1C to 4-10C were subjected to measure and evaluation of efficiencies (at current density of 10 mA/cm$^2$), lifespan data (at 50 mA/cm$^2$), and color coordinates, by using an IVL meter (PhotoResearch PR650, Keithley 238), and the results are shown in Table 21. In Table 21, the term "efficiency" may refer to a relative efficiency, and the term "lifespan" may refer to a relative lifespan, among the organic light-emitting devices.

TABLE 21

| | First host | Second host | Dopant | Efficiency | Lifespan | Color coordinates (x, y) |
|---|---|---|---|---|---|---|
| Example 4-1C | H-3b | H-3a | D-7 | 1.3 | 1.4 | 0.66, 0.33 |
| Example 4-2C | H-4b | H-3a | D-7 | 1.2 | 1.3 | 0.66, 0.33 |
| Example 4-3C | H-5b | H-3a | D-7 | 1.3 | 1.2 | 0.66, 0.34 |
| Example 4-4C | H-6b | H-3a | D-7 | 1.3 | 1.3 | 0.66, 0.33 |
| Example 4-5C | H-7b | H-3a | D-7 | 1.2 | 1.4 | 0.66, 0.33 |
| Example 4-6C | H-8b | H-3a | D-7 | 1.3 | 1.3 | 0.66, 0.34 |
| Example 4-7C | H-9b | H-3a | D-7 | 1.2 | 1.3 | 0.66, 0.33 |
| Example 4-5C | H-10b | H-3a | D-7 | 1.3 | 1.3 | 0.66, 0.34 |
| Example 4-8C | H-11b | H-3a | D-7 | 1.3 | 1.2 | 0.66, 0.33 |
| Example 4-9C | H-12b | H-3a | D-7 | 1.3 | 1.2 | 0.66, 0.33 |

TABLE 21-continued

| | First host | Second host | Dopant | Effi- ciency | Life- span | Color coor- dinates (x, y) |
|---|---|---|---|---|---|---|
| Comparative Example 4-1C | Compound 1 | — | Compound 5 | 1.0 | 1.0 | 0.64, 0.34 |
| Comparative Example 4-2C | Compound 1 | — | Compound 6 | 1.1 | 1.0 | 0.65, 0.34 |
| Comparative Example 4-3C | Compound 1 | — | D-7 | 1.1 | 1.1 | 0.66, 0.33 |
| Comparative Example 4-4C | H-1a | — | Compound 5 | 1.1 | 1.2 | 0.64, 0.34 |
| Comparative Example 4-5C | Compound 1 | H-4a | Compound 5 | 1.0 | 1.2 | 0.64, 0.34 |
| Example 4-10C | H-3b | H-3a | D-8 | 1.3 | 1.3 | 0.64, 0.34 |
| Example 4-11C | H-6b | H-3a | D-8 | 1.3 | 1.2 | 0.64, 0.34 |
| Example 4-12C | H-8b | H-3a | D-8 | 1.3 | 1.3 | 0.64, 0.34 |
| Example 4-13C | H-11b | H-3a | D-8 | 1.2 | 1.2 | 0.64, 0.34 |
| Comparative Example 4-6C | Compound 1 | — | Compound 7 | 1.0 | 1.0 | 0.62, 0.35 |
| Comparative Example 4-7C | Compound 1 | — | Compound 8 | 1.1 | 1.0 | 0.63, 0.34 |
| Comparative Example 4-8C | Compound 1 | — | D-7 | 1.1 | 1.1 | 0.64, 0.34 |
| Comparative Example 4-9C | H-1a | — | Compound 7 | 1.1 | 1.1 | 0.62, 0.35 |
| Comparative Example 4-10C | Compound 1 | H-4a | Compound 7 | 1.1 | 1.2 | 0.62, 0.35 |

Referring to Table 21, it was confirmed that the organic light-emitting devices of Examples 4-1C to 4-13C had improved efficiencies and mostly improved lifespans compared to those of the organic light-emitting devices of Comparative Examples 4-1C to 4-10C.

Hereinafter, compounds used in manufacturing organic light-emitting devices manufactured in Examples 5-1C to 5-8C and Comparative Examples 5-1C to 5-10C are as follows:

H-1b

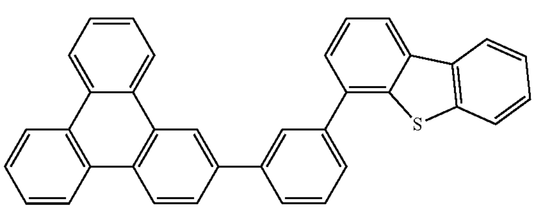

H-2b

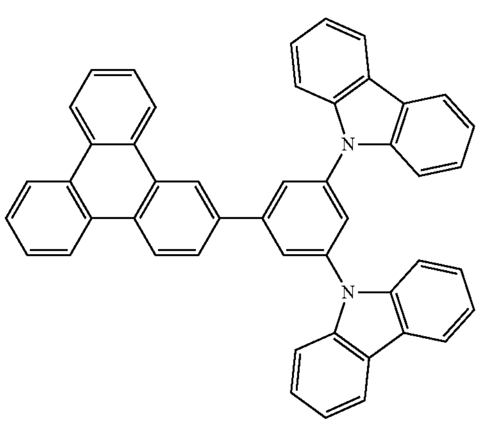

-continued

H-3b

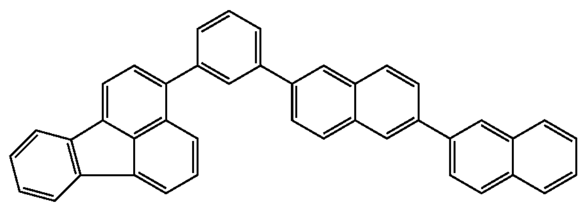

H-4b

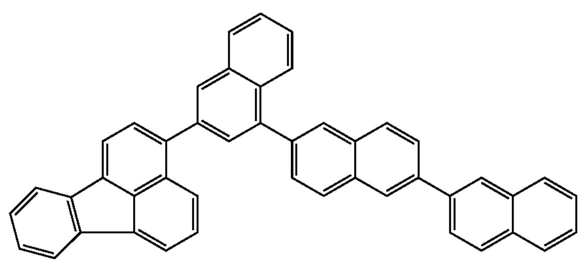

H-5b

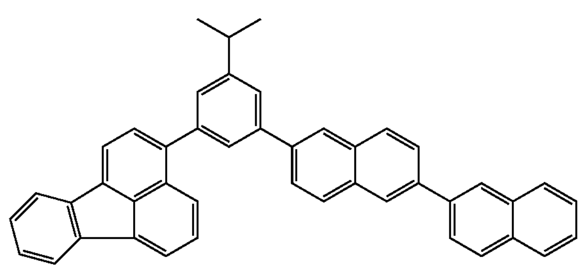

-continued
H-6b
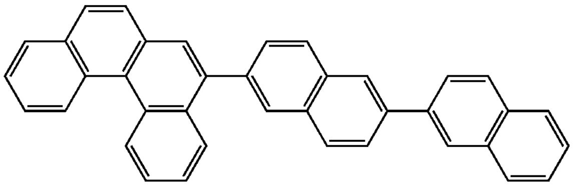
H-7b
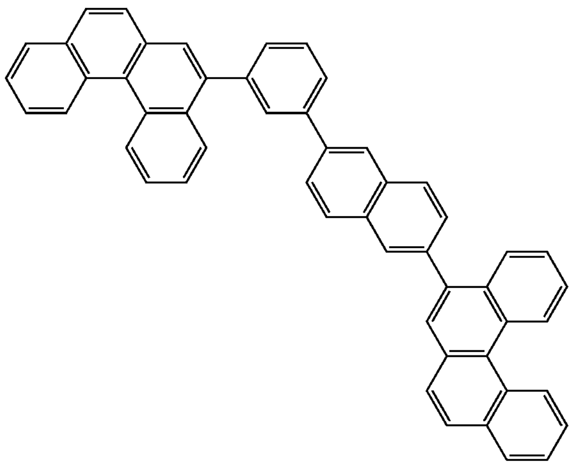
H-8b
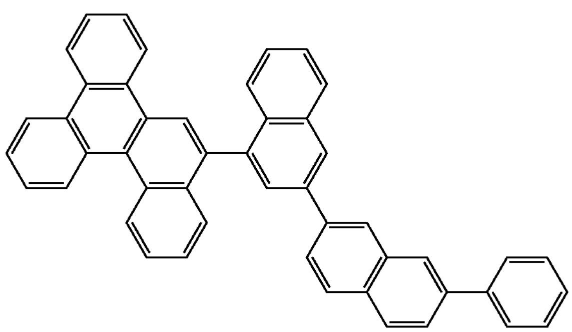
H-9b
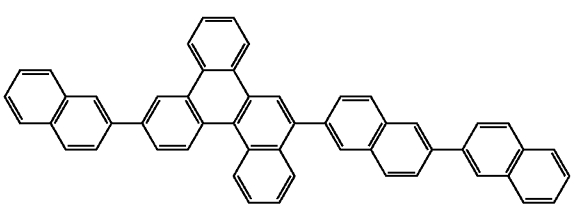
-continued
H-10b
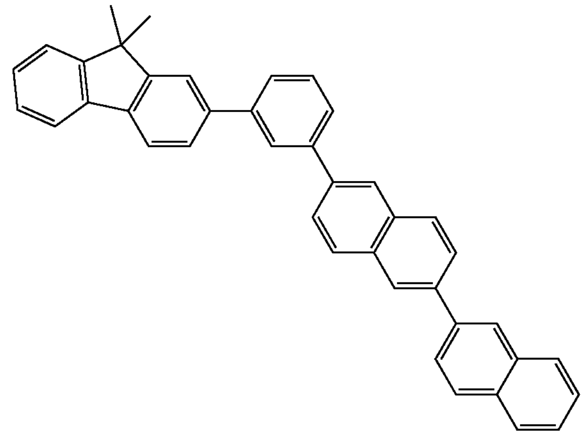
H-11b
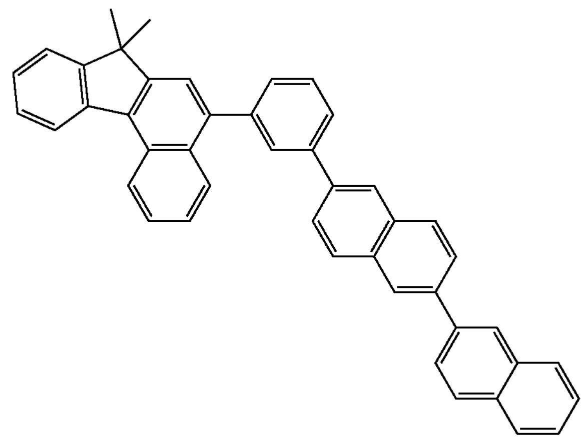
H-12b
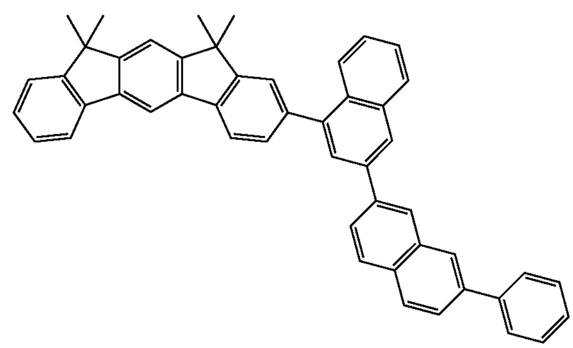
D-7
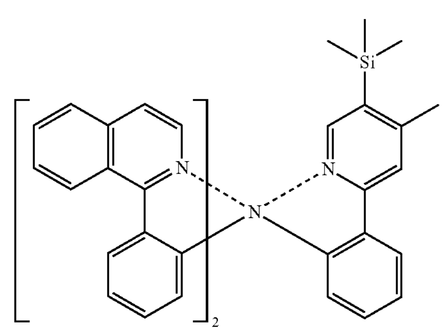

-continued

D-8

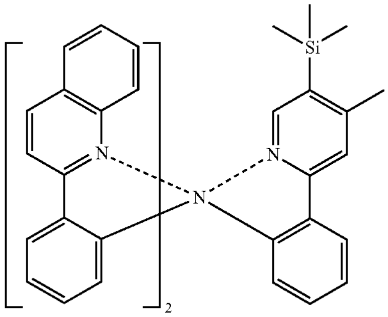

Compound 5

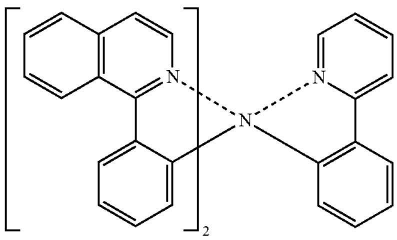

Compound 6

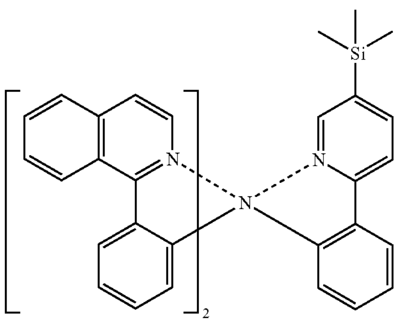

Compound 7

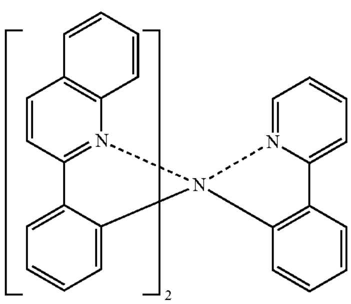

Compound 8

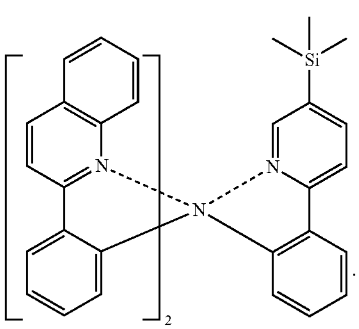

Examples 5-1C to 5-8C and Comparative Examples 5-1C to 5-10C

Glass/ITO (120)/HT (120)/Host1:Host2_10%: Dop_1% (30)/ET1 (5)/ET2 (25)/LiF (0.5)/Al (150)

Organic light-emitting devices were manufactured in the same (or substantially the same) manner as in Example 1-1C, except that in forming the EML, compounds listed in Table 22 were used as the first hosts, the second hosts, and the dopants, and the amounts of the dopants were changed to 1 v %.

TABLE 22

| | First host | Second host | Dopant |
|---|---|---|---|
| Example 5-1 | H-3b | H-2b | D-7 |
| Example 5-2 | H-6b | H-2b | D-7 |
| Example 5-3 | H-8b | H-2b | D-7 |
| Example 5-4 | H-11b | H-2b | D-7 |
| Comparative Example 5-1 | Compound 1 | — | Compound 5 |
| Comparative Example 5-2 | Compound 1 | — | Compound 6 |
| Comparative Example 5-3 | Compound 1 | — | D-7 |
| Comparative Example 5-4 | H-3b | — | Compound 5 |
| Comparative Example 5-5 | Compound 1 | H-2b | Compound 5 |
| Example 5-5 | H-3b | H-2b | D-8 |
| Example 5-6 | H-6b | H-2b | D-8 |
| Example 5-7 | H-8b | H-2b | D-8 |
| Example 5-8 | H-11b | H-2b | D-8 |
| Comparative Example 5-6 | Compound 1 | — | Compound 7 |
| Comparative Example 5-7 | Compound 1 | — | Compound 8 |
| Comparative Example 5-8 | Compound 1 | — | D-7 |
| Comparative Example 5-9 | H-3b | — | Compound 7 |
| Comparative Example 5-10 | Compound 1 | H-2b | Compound 7 |

Evaluation Example 12

The organic light-emitting devices of Examples 5-1C to 5-8C and Comparative Examples 5-1C to 5-10C were subjected to measure and evaluation of efficiencies (at current density of 10 $mA/cm^2$), lifespan data (at 50 $mA/cm^2$), and color coordinates, by using an IVL meter (PhotoResearch PR650, Keithley 238), and the results are shown in Table 23. In Table 23, the term "efficiency" may refer to a relative efficiency, and the term "lifespan" may refer to a relative lifespan, among the organic light-emitting devices.

TABLE 23

| | First host | Second host | Dopant | Efficiency | Lifespan | Color coordinates (x, y) |
|---|---|---|---|---|---|---|
| Example 5-1C | H-3b | H-2b | D-7 | 1.3 | 1.4 | 0.66, 0.33 |
| Example 5-2C | H-6b | H-2b | D-7 | 1.3 | 1.3 | 0.66, 0.33 |
| Example 5-3C | H-8b | H-2b | D-7 | 1.3 | 1.3 | 0.66, 0.34 |
| Example 5-4C | H-11b | H-2b | D-7 | 1.3 | 1.2 | 0.66, 0.33 |
| Comparative Example 5-1C | Compound 1 | — | Compound 5 | 1.0 | 1.0 | 0.64, 0.34 |
| Comparative Example 5-2C | Compound 1 | — | Compound 6 | 1.1 | 1.0 | 0.65, 0.34 |
| Comparative Example 5-3C | Compound 1 | — | D-7 | 1.1 | 1.1 | 0.66, 0.33 |
| Comparative Example 5-4C | H-3b | — | Compound 5 | 1.1 | 1.1 | 0.64, 0.34 |
| Comparative Example 5-5C | Compound 1 | H-2b | Compound 5 | 1.0 | 1.1 | 0.64, 0.34 |
| Example 5-5C | H-3b | H-2b | D-8 | 1.3 | 1.3 | 0.64, 0.34 |
| Example 5-6C | H-6b | H-2b | D-8 | 1.2 | 1.3 | 0.64, 0.34 |
| Example 5-7C | H-8b | H-2b | D-8 | 1.3 | 1.2 | 0.64, 0.34 |
| Example 5-8C | H-11b | H-2b | D-8 | 1.2 | 1.3 | 0.64, 0.34 |
| Comparative Example 5-6C | Compound 1 | — | Compound 7 | 1.0 | 1.0 | 0.62, 0.35 |
| Comparative Example 5-7C | Compound 1 | — | Compound 8 | 1.1 | 1.0 | 0.63, 0.34 |
| Comparative Example 5-8C | Compound 1 | — | D-7 | 1.1 | 1.1 | 0.64, 0.34 |
| Comparative Example 5-9C | H-3b | — | Compound 7 | 1.1 | 1.1 | 0.62, 0.35 |
| Comparative Example 5-10C | Compound 1 | H-2b | Compound 7 | 1.0 | 1.2 | 0.62, 0.35 |

Referring to Table 23, it can be seen that the organic light-emitting devices of Examples 5-1C to 5-8C had improved efficiencies and lifespans compared to those of the organic light-emitting devices of Comparative Examples 5-1C to 5-10C.

According to one or more embodiments of the present disclosure, organic light-emitting devices including the compounds according to embodiments of the present disclosure may have excellent high efficiency long lifespan characteristics, and may show little change in the efficiency at an x-coordinate value of 0.21.

As used herein, the terms "use," "using," and "used" may be considered synonymous with the terms "utilize," "utilizing," and "utilized," respectively.

As used herein, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:

a first electrode;

a second electrode; and an organic layer between the first electrode and the second electrode, the organic layer comprising an emission layer, wherein the emission layer comprises a first host and a dopant, the first host is represented by one selected from Formulae 1 and 2, and the dopant is represented by Formula 7:

Formula 1

$$Ar_{11}\text{—}[(L_{11})_{a11}\text{—}(R_{11})_{b11}]_{n11}$$

Formula 2

$$Ar_{21}\text{—}[(L_{21})_{a21}\text{—}(R_{21})_{b21}]_{n21}$$

Formula 7

$$M(L_1)_{n71}(L_2)_{n72}$$

-continued
Formula 7A
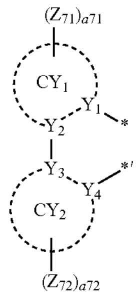
Formula 7B
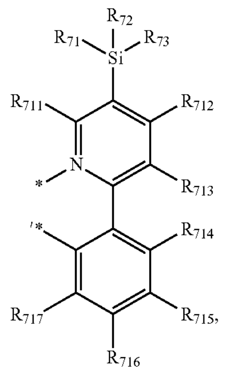
wherein, in Formulae above,
$Ar_{11}$ is a group represented by one of Formulae 8A-2, 8B-3 to 8B-14, 8B-16 to 8B-19, and 8C-1 to 8C-19, and
$Ar_{21}$ is a group represented by one of Formulae 9A-2, 9B-3 to 9B-14, 9B-16 to 9B-19, and 9C-1 to 9C-19:
8A-2
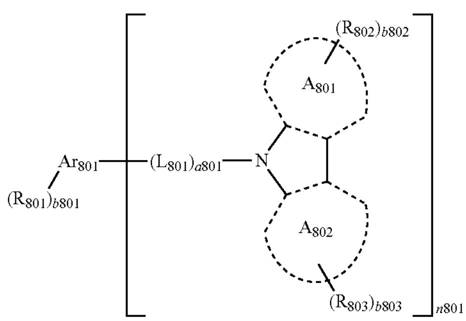
8B-3
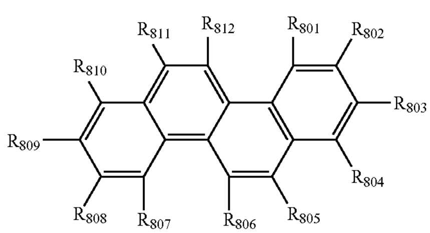
-continued
8B-4
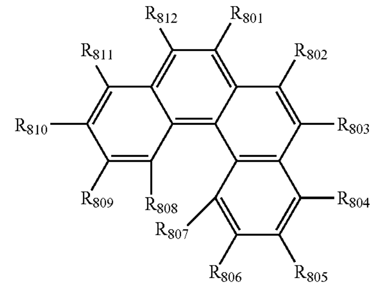
8B-5
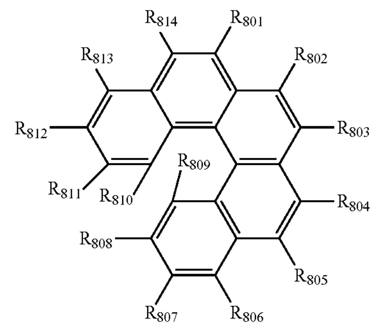
8B-6
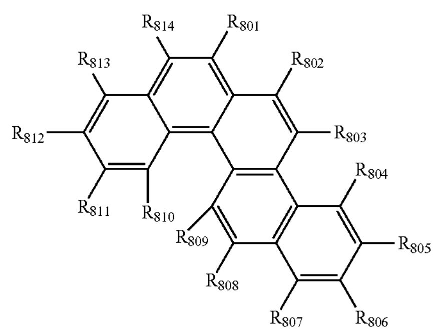
8B-7
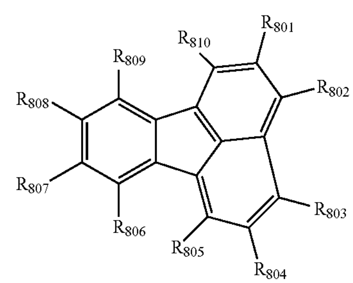
8B-8
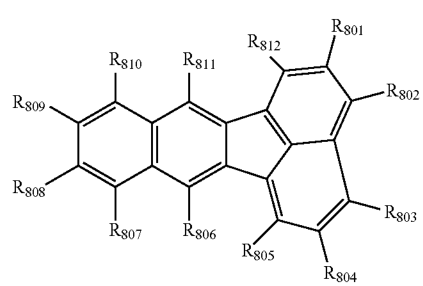

-continued
8B-9
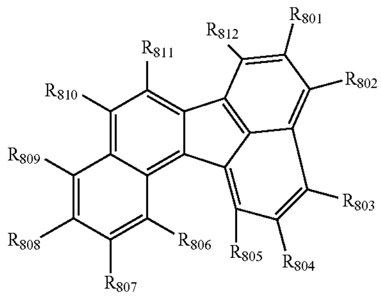
8B-10
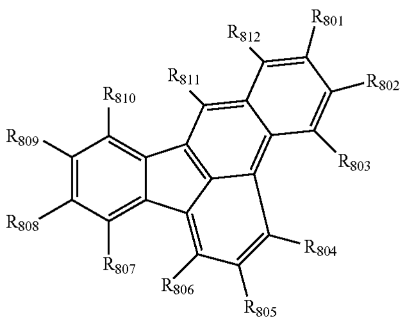
8B-11
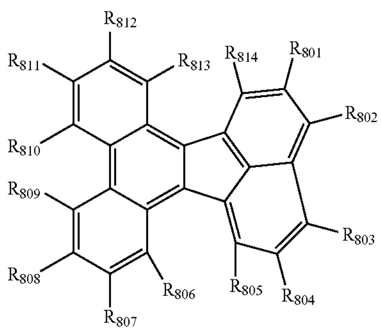
8B-12
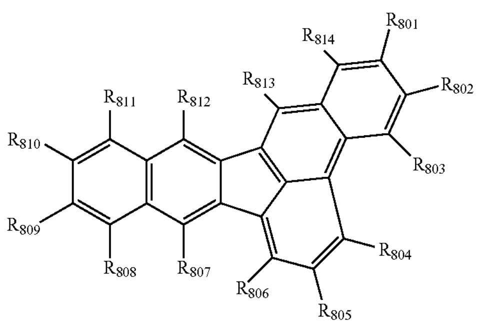
8B-13
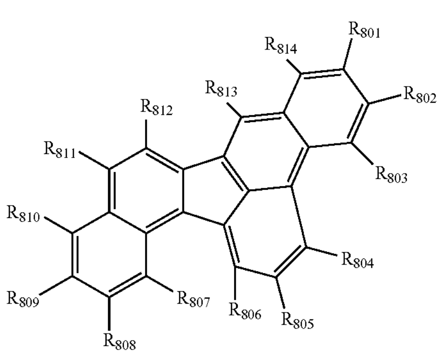
-continued
8B-14
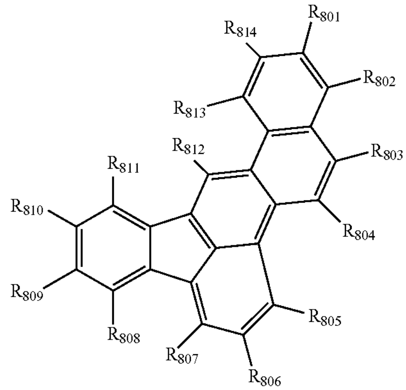
8B-16
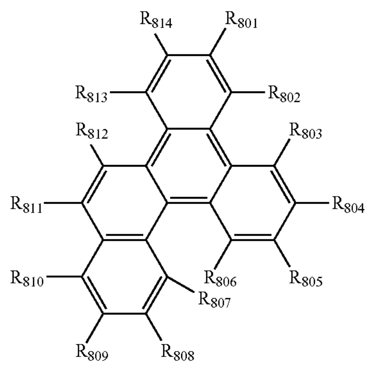
8B-17
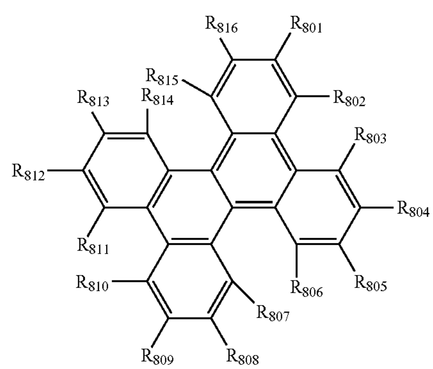
8B-18
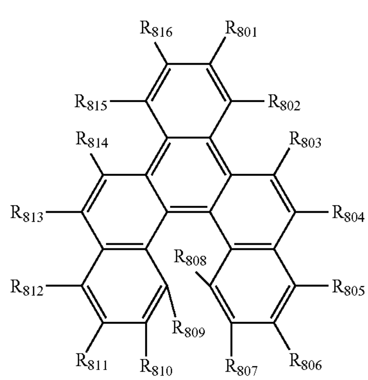

-continued
8B-19
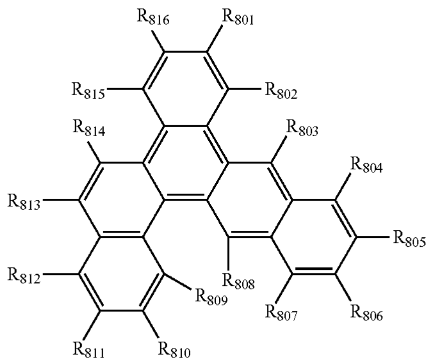
8C-1
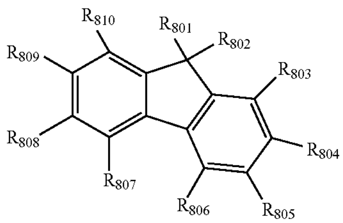
8C-2
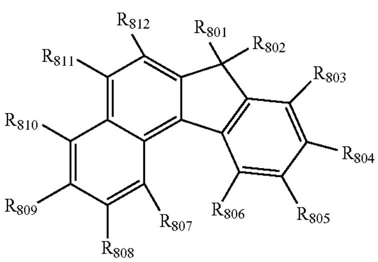
8C-3
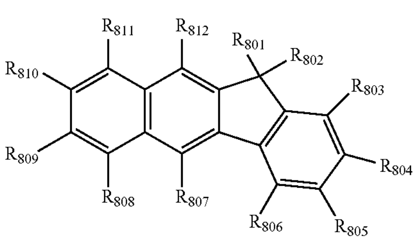
8C-4
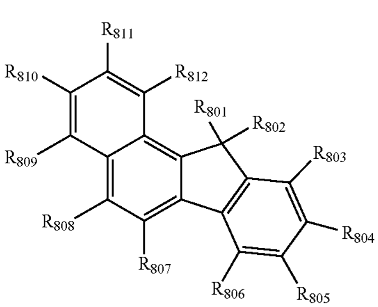
-continued
8C-5
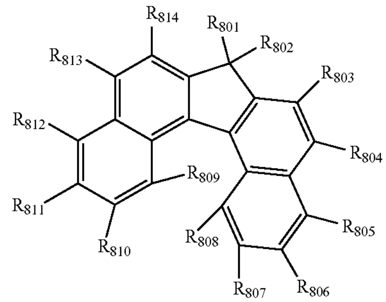
8C-6
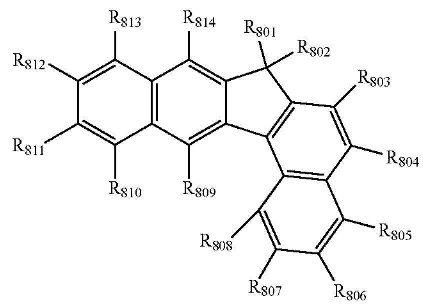
8C-7
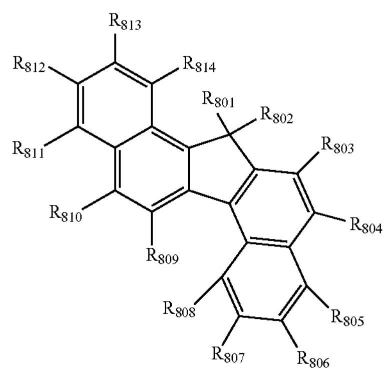
8C-8
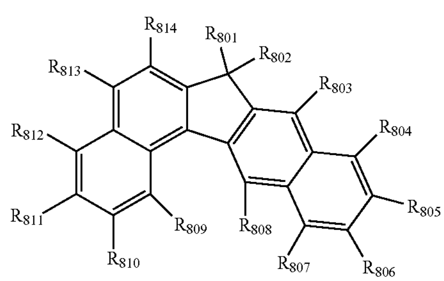
8C-9
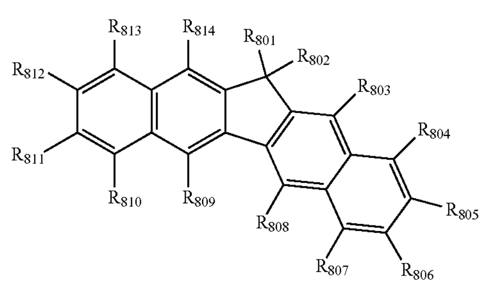

8C-10
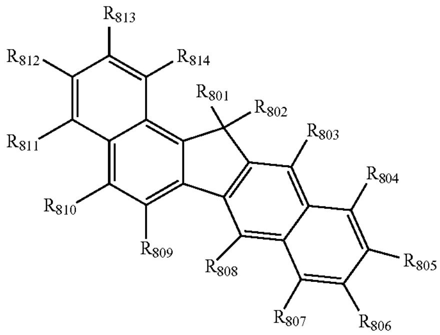
8C-11
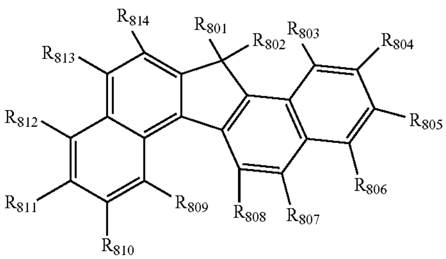
8C-12
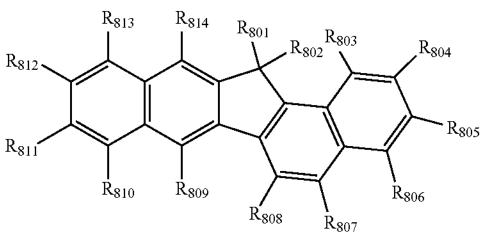
8C-13
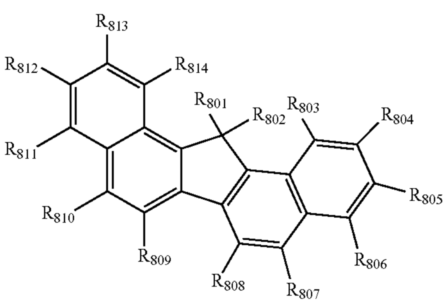
8C-14
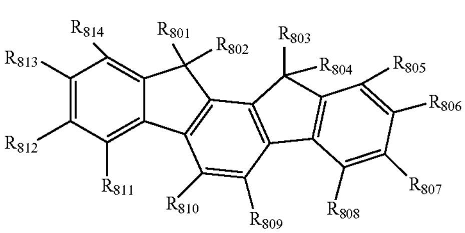
8C-15
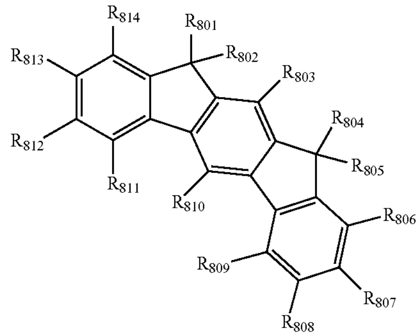
8C-16
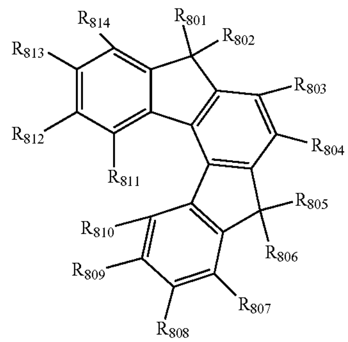
8C-17
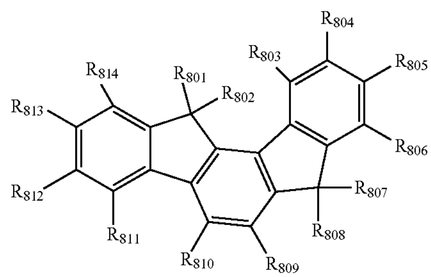
8C-18
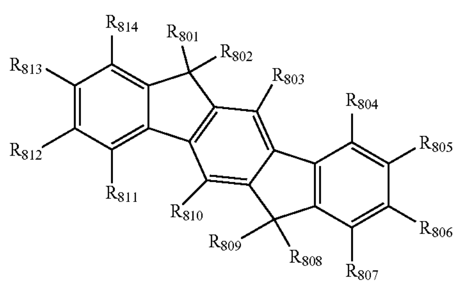
8C-19
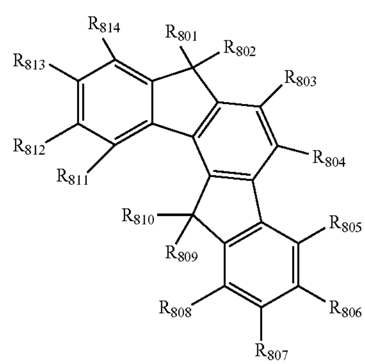

-continued
8D-1
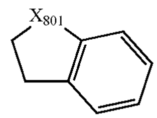
8D-2
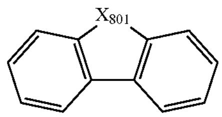
8D-3
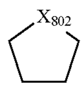
9A-2
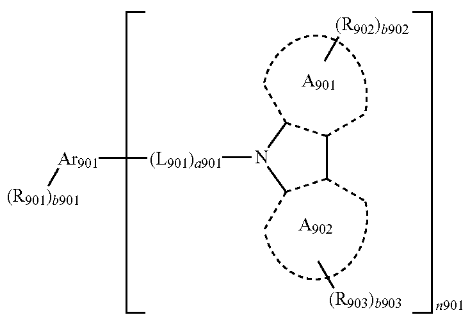
9B-3
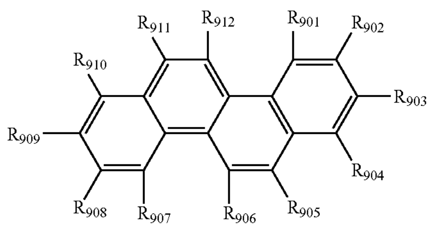
9B-4
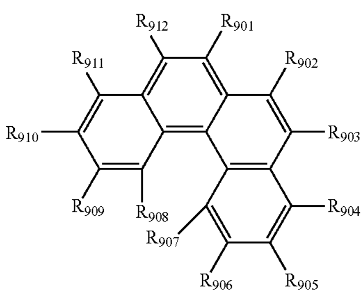
9B-5
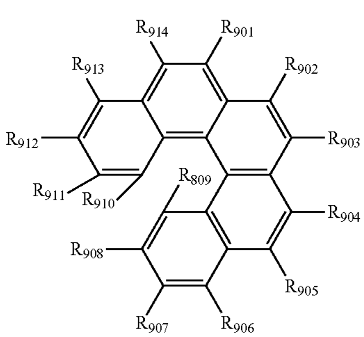
-continued
9B-6
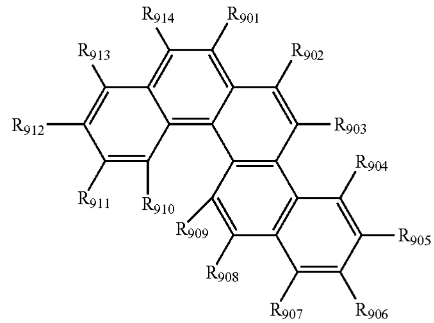
9B-7
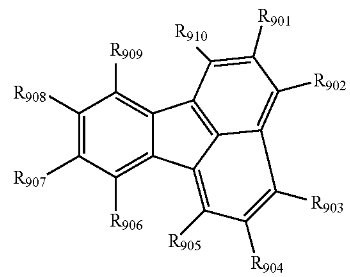
9B-8
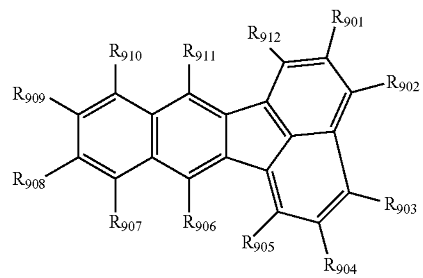
9B-9
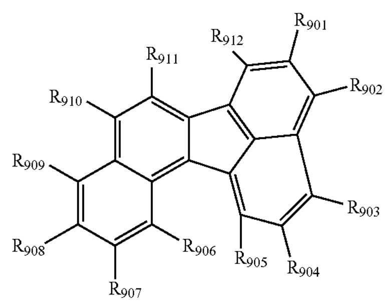
9B-10
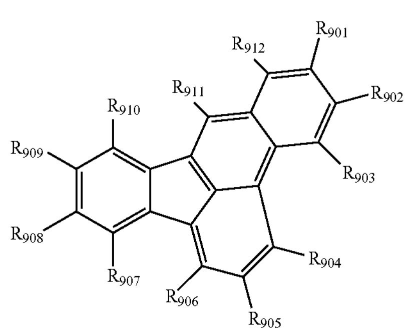

-continued
9B-11
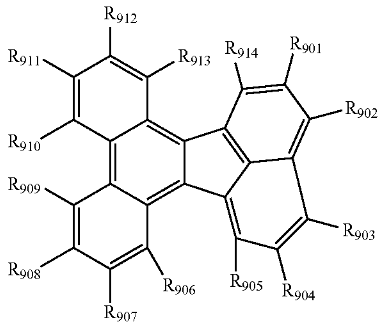
9B-12
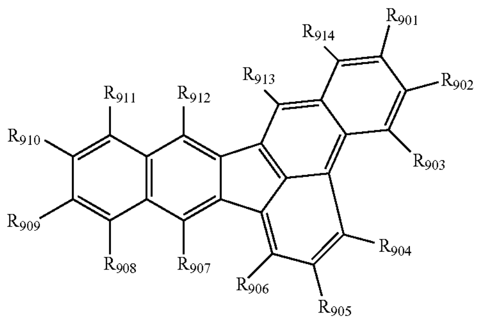
9B-13
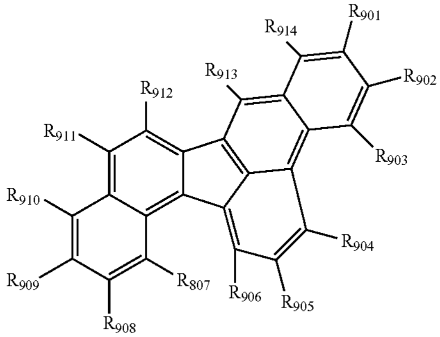
9B-14
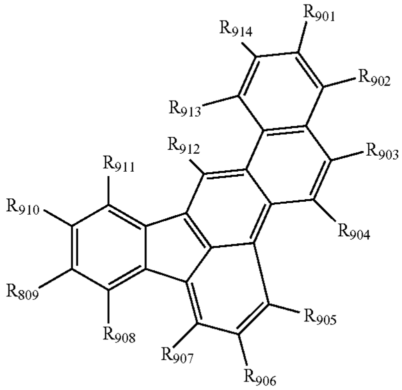
-continued
9B-16
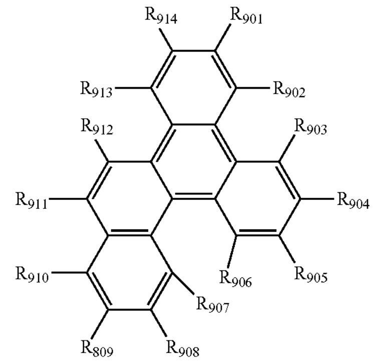
9B-17
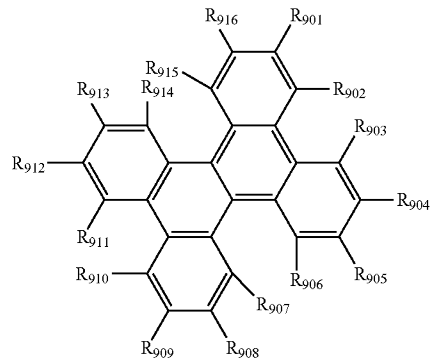
9B-18
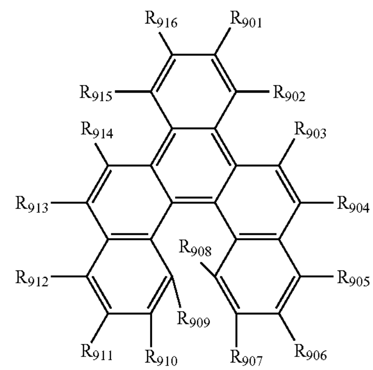
9B-19
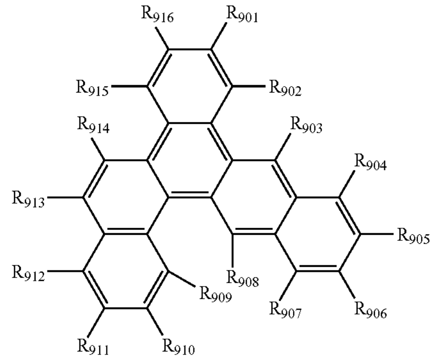

-continued
9C-1
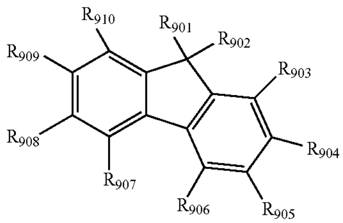
9C-2
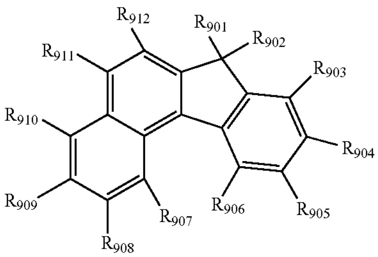
9C-3
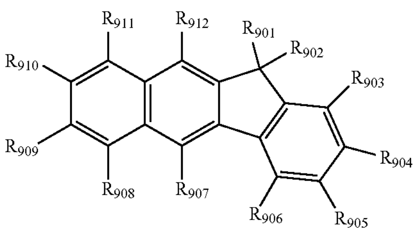
9C-4
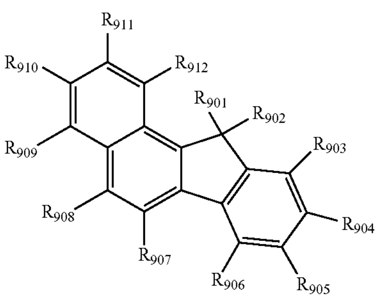
9C-5
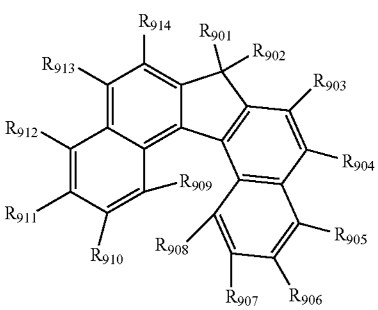
9C-6
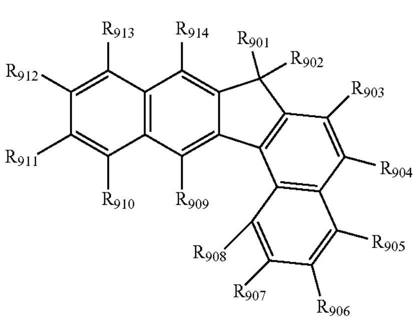
-continued
9C-7
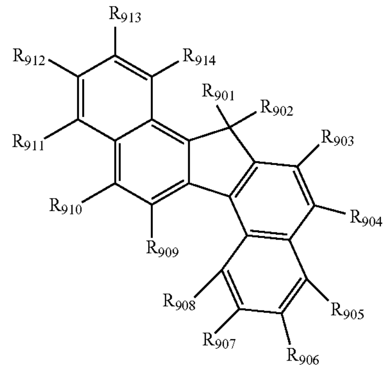
9C-8
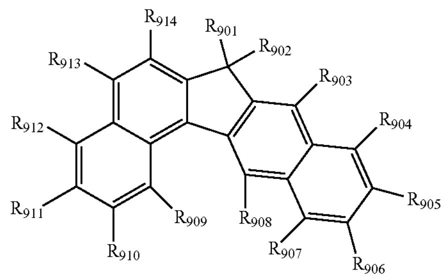
9C-9
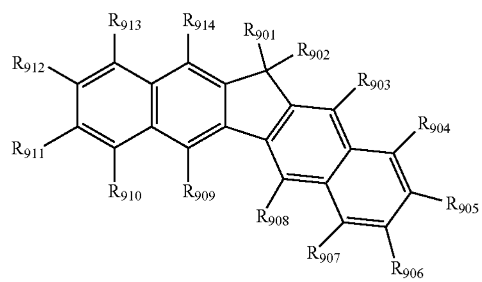
9C-10
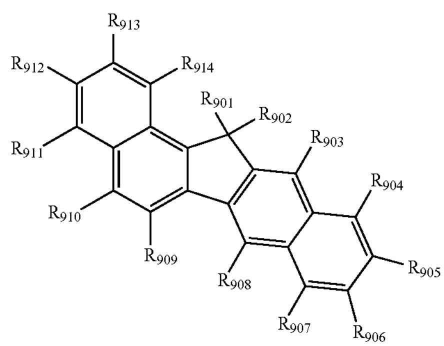
9C-11
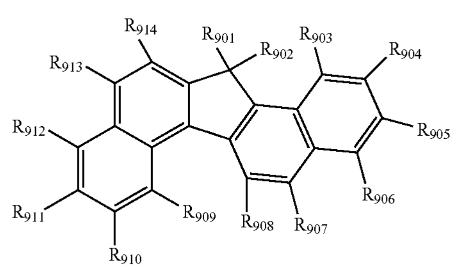

-continued 9C-12

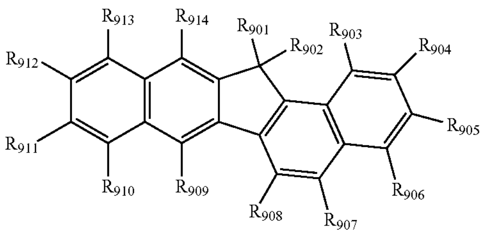

9C-13

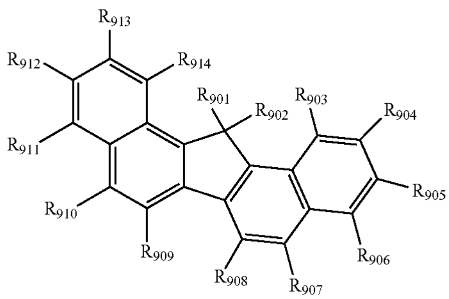

9C-14

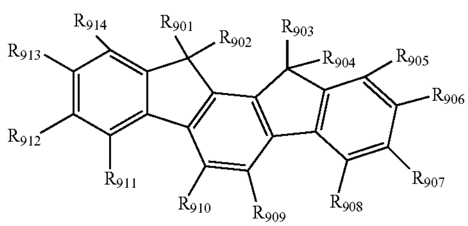

9C-15

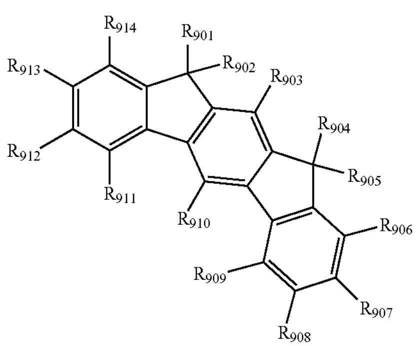

9C-16

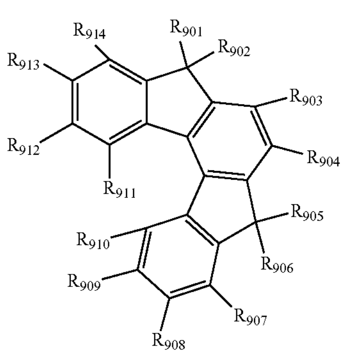

-continued 9C-17

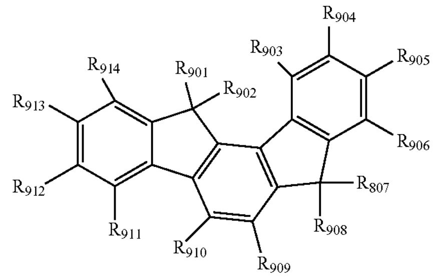

9C-18

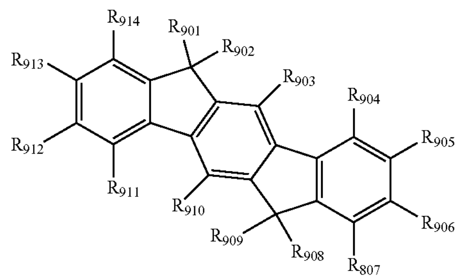

9C-19

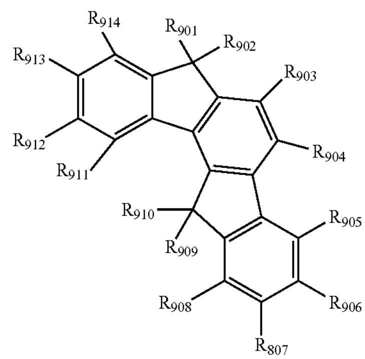

9D-1

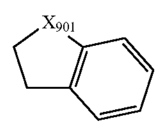

9D-2

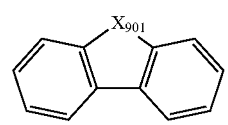

9D-3

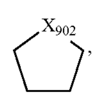

$Ar_{801}$ and $Ar_{901}$ are each independently selected from a substituted or unsubstituted $C_3$-$C_{10}$ cycloalkane group, a substituted or unsubstituted $C_1$-$C_{10}$ heterocycloalkane group, a substituted or unsubstituted $C_3$-$C_{10}$ cycloalkene group, a substituted or unsubstituted $C_1$-$C_{10}$ heterocycloalkene group, a substituted or unsubstituted $C_6$-$C_{60}$ arene group, a substituted or unsubstituted $C_1$-$C_{60}$ heteroarene group, a substituted or unsubstituted non-aromatic condensed polycyclic group, and a substituted or unsubstituted non-aromatic condensed heteropolycyclic group, $L_{801}$, $L_{901}$, $L_{11}$ and $L_{21}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a801, a901, a11 and a21 are each independently selected from 0, 1, 2, and 3;

$R_{11}$ is a hole-transporting group, and $R_{21}$ is an electron-transporting group, b11 and b21 are each independently selected from 1, 2, and 3, n11 and n21 are each independently selected from 1, 2, 3, and 4, $A_{801}$ to $A_{804}$ are each independently selected from a benzene, a naphthalene, a pyridine, a pyrimidine, a pyrazine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, a group represented by Formula 8D-1, and a group represented by Formula 8D-2, and $A_{901}$ to $A_{904}$ are each independently selected from a benzene, a naphthalene, a pyridine, a pyrimidine, a pyrazine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, a group represented by Formula 9D-1, and a group represented by Formula 9D-2, $A_{805}$ and $A_{905}$ are each independently selected from a benzene and a naphthalene, $A_{806}$ is represented by Formula 8D-3, and $A_{906}$ is represented by Formula 9D-3, $X_{801}$ in Formula 8D-1 and $X_{802}$ are each independently selected from $N(R_{806})$, O, S, $C(R_{806})(R_{807})$, $Si(R_{806})(R_{807})$, $B(R_{806})$, $P(R_{806})$, and $P(=O)(R_{806})$, $X_{801}$ in Formula 8D-2 is selected from O, S, $C(R_{806})(R_{807})$, $Si(R_{806})(R_{807})$, $B(R_{806})$, $P(R_{806})$, and $P(=O)(R_{806})$, $X_{901}$ in Formula 9D-1 and $X_{902}$ are each independently selected from $N(R_{906})$, O, S, $C(R_{906})(R_{907})$, $Si(R_{906})(R_{907})$, $B(R_{906})$, $P(R_{906})$, and $P(=O)(R_{906})$, and $X_{901}$ in Formula 9D-2 is selected from O, S, $C(R_{906})(R_{907})$, $Si(R_{906})(R_{907})$, $B(R_{906})$, $P(R_{906})$, and $P(=O)(R_{906})$, $R_{801}$ to $R_{816}$ are each independently selected from *-$[(L_{11})_{a11}$-$(R_{11})_{b11}]$, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein the number of $R_{801}$ to $R_{816}$ represented by *-$[(L_{11})_{a11}$-$(R_{11})_{b11}]$ equals to n11, $R_{901}$ to $R_{916}$ are each independently selected from *-$[(L_{21})_{a21}$-$(R_{21})_{b21}]$, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein the number of $R_{901}$ to $R_{916}$ represented by *-$[(L_{21})_{a21}$-$(R_{21})_{b21}]$ equals to n21, b801 to b805 and b901 to b905 are each independently selected from 1, 2, 3, and 4, n801 and n901 are each independently selected from 2, 3, and 4, n802 and n902 are each independently selected from 1, 2, and 3, M is selected from iridium (Ir), platinum (Pt), osmium (Os), titanium (Ti), zirconium (Zr), hafnium (Hf), europium (Eu), terbium (Tb), thulium (Tm), and rhodium (Rd), $L_1$ is a ligand selected from Formula 7A, and $L_2$ is a ligand selected from Formula 7B, wherein $L_1$ are $L_2$ are different from each other, n71 and n72 are each independently 1 or 2, a sum of n71 and n72 (n71+n72) is 2 or 3, and when n71 is 2, two $L_1$s are identical to or different from each other, and when n72 is 2, two $L_2$S are identical to or different from each other, $Y_1$ to $Y_4$ are each independently carbon (C) or nitrogen (N), wherein $Y_1$ and $Y_2$ are linked to each other via a single bond or a double bond, and $Y_3$ and $Y_4$ are linked to each other via a single bond or a double bond, $CY_1$ and $CY_2$ are each independently selected from a $C_5$-$C_{60}$ cyclic group and a $C_2$-$C_{60}$ heterocyclic group, wherein $CY_1$ and $CY_2$ are optionally linked to each other via a single bond or a first linking group, $R_{71}$ to $R_{73}$ are each independently selected from:

a $C_1$-$C_{10}$ alkyl group; and a $C_1$-$C_{10}$ alkyl group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, $Z_{71}$, $Z_{72}$, and $R_{711}$ to $R_{717}$ are each independently selected from hydrogen, deuterium, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$), wherein $R_{712}$ is not hydrogen, and two adjacent substituents selected from $R_{714}$ to $R_{717}$ are optionally linked to each other to form a condensed ring, a71 and a72 are each independently an integer selected from 1 to 5, and when a71 is 2 or more, a plurality of $Z_{71}$s are identical to or different from each other, and when a72 is 2 or more, a plurality of $Z_{72}$s are identical to or different from each other,

* and *' each independently indicate a binding site to M of Formula 1, and at least one substituent of the substituted $C_4$-$C_{30}$ pyrrolidine-based core, the substituted $C_7$-$C_{30}$ condensed polycyclic-based core, the substituted $C_3$-$C_{10}$ cycloalkane group, the substituted $C_1$-$C_{10}$ heterocycloalkane group, the substituted $C_3$-$C_{10}$ cycloalkene group, the substituted $C_1$-$C_{10}$ heterocycloalkene group, the substituted $C_6$-$C_{60}$ arene group, the substituted $C_1$-$C_{60}$ heteroarene group, the substituted non-aromatic condensed polycyclic group, the substituted non-aromatic condensed heteropolycyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ are each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting device of claim 1, wherein $L_{11}$ and $L_{21}$ are each independently selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group.

3. The organic light-emitting device of claim 1, wherein Ru is selected from a phenyl group, a naphthyl group, a fluorenyl group, a benzofluorenyl group, a dibenzofluorenyl group, a phenanthrenyl group, an anthracenyl group, a triphenylenyl group, a benzofuranyl group, a benzothiophenyl group, a dibenzofuranyl group, a dibenzothiophenyl group, a carbazolyl group, and —N($R_{56}$)($R_{57}$);

a phenyl group, a naphthyl group, a fluorenyl group, a benzofluorenyl group, a dibenzofluorenyl group, a phenanthrenyl group, an anthracenyl group, a triphenylenyl group, a benzofuranyl group, a benzothiophenyl group, a dibenzofuranyl group, a dibenzothiophenyl group, and a carbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, a monovalent non-aromatic condensed heteropolycyclic group, —N($Q_{41}$)($Q_{42}$), —Si($Q_{43}$)($Q_{44}$)($Q_{45}$), and —B($Q_{46}$)($Q_{47}$); and a phenyl group, a naphthyl group, a fluorenyl group, a benzofluorenyl group, a dibenzofluorenyl group, a phenanthrenyl group, an anthracenyl group, a triphenylenyl group, a benzofuranyl group, a benzothiophenyl group, a dibenzofuranyl group, a dibenzothiophenyl group, and a carbazolyl group, each substituted with at least one selected from a $C_6$-$C_{20}$ aryl group, a $C_1$-$C_{20}$ heteroaryl group, a monovalent non-aromatic condensed polycyclic group, and a monovalent non-aromatic condensed heteropolycyclic group that are each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group and $C_1$-$C_{20}$ alkoxy group;

wherein $R_{56}$ and $R_{57}$ each independently a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group; and a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, and $Q_{41}$ to $Q_{47}$ are each independently selected from a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

4. The organic light-emitting device of claim 1, wherein $R_{21}$ is selected from:

a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzothiazolyl group, a benzoxazolyl group, a benzimidazolyl group, a triazolyl group, a triazinyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group;

a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzothiazolyl group, a benzoxazolyl group, a benzimidazolyl group, a triazolyl group, a triazinyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, a monovalent non-aromatic condensed heteropolycyclic group, —$N(Q_{41})(Q_{42})$, —$Si(Q_{43})(Q_{44})(Q_{45})$, and —$B(Q_{46})(Q_{47})$; and a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a quinolinyl group, an isoquinolinyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzothiazolyl group, a benzoxazolyl group, a benzimidazolyl group, a triazolyl group, a triazinyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from a $C_6$-$C_{20}$ aryl group, a $C_1$-$C_{20}$ heteroaryl group, a monovalent non-aromatic condensed polycyclic group, and a monovalent non-aromatic condensed heteropolycyclic group that are each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, wherein $Q_{41}$ to $Q_{47}$ are each independently selected from a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

5. The organic light-emitting device of claim 1, wherein M is iridum (Ir).

6. The organic light-emitting device of claim 1, wherein n71 and n72 are each independently 1 or 2, and a sum of n71 and n72 (n71+n72) is 3.

7. The organic light-emitting device of claim 1, wherein $CY_1$ and $CY_2$ are each independently selected from a benzene, a naphthalene, a fluorene, a spiro-fluorene, an indene, a furan, a thiophene, a carbazole, a benzofuran, a benzothiophene, a dibenzofuran, a dibenzothiophene, a pyrrole, an imidazole, a pyrazole, a thiazole, an isothiazole, an oxazole, an isoxazole, a triazole, a pyridine, a pyrazine, a pyrimidine, a quinoline, an isoquinoline, a benzoquinoline, a quinoxaline, a quinazoline, a naphthyridine, an indole, a benzimidazole, a benzoxazole, an isobenzoxazole, an oxadiazole, and a triazine.

8. The organic light-emitting device of claim 1, wherein $CY_1$ is selected from a pyrrole, an imidazole, a pyrazole, a triazole, a pyridine, a pyrimidine, a pyrazine, a triazine, a quinoline, an isoquinoline, and, an oxadiazole, and $CY_2$ is selected from a benzene, a naphthalene, a fluorene, a carbazole, a furan, a thiophene, a benzofuran, a benzothiophene, a dibenzofuran, a dibenzothiophene, an indole, a pyridine, a pyrimidine, a pyrazine, an oxadiazole, and a triazine.

9. The organic light-emitting device of claim 1, wherein $R_{71}$ to $R_{73}$ are each independently selected from:

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group; and a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof.

10. The organic light-emitting device of claim 1, wherein $Z_{71}$, $Z_{72}$, and $R_{711}$ to $R_{717}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, wherein $R_{712}$ is not hydrogen.

11. An organic light-emitting device comprising:

a first electrode;

a second electrode; and an organic layer between the first electrode and the second electrode, the organic layer comprising an emission layer, wherein the emission layer comprises a first host, a second host, and a dopant, the first host and the second host are each independently represented by one selected from Formulae 1 and 2, and the dopant is represented by Formula 7:

Formula 1

$$A_{11}\text{—}[(L_{11})_{a11}\text{—}(R_{11})_{b11}]_{n11}$$

Formula 2

$$A_{21}\text{—}[(L_{21})_{a21}\text{—}(R_{21})_{b21}]_{n21}$$

Formula 7

$$M(L_1)_{n71}(L_2)_{n72}$$

-continued
Formula 7A
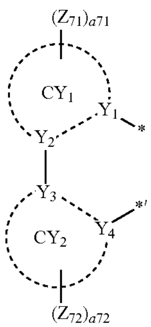
Formula 7B
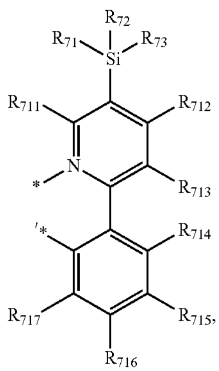
wherein, in Formulae above,
$Ar_{11}$ is a group represented by one of Formulae 8A-1, 8A-2, 8A-4, 8B-1 to 8B-19, and 8C-1 to 8C-19, and $Ar_{21}$ is a group represented by one of Formulae 9A-1, 9A-2, 9A-4, 9B-1 to 9B-19, and 9C-1 to 9C-19,
8A-1
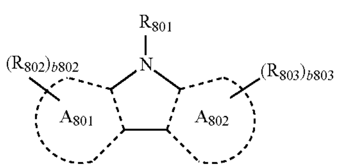
8A-2
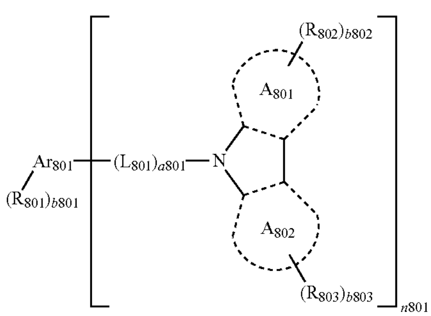
8A-4
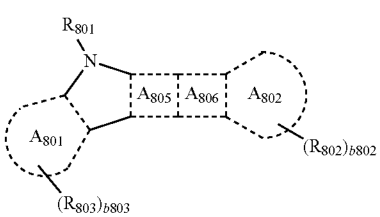
-continued
8B-1
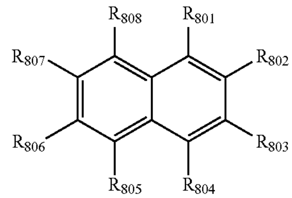
8B-2
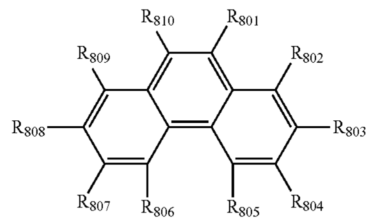
8B-3
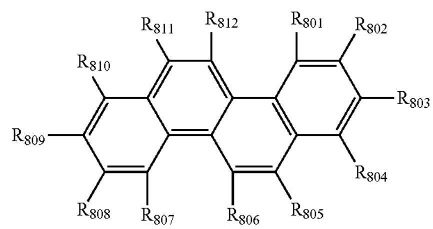
8B-4
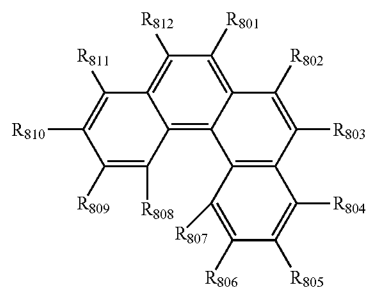
8B-5
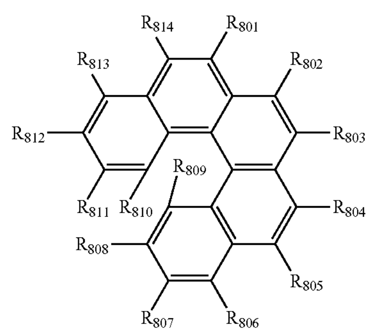
8B-6
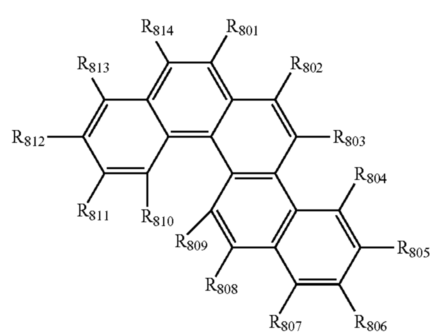

-continued
8B-7
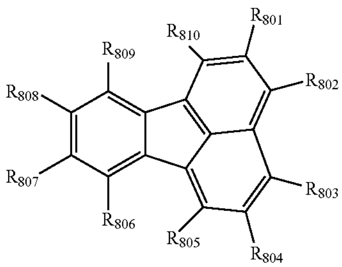
8B-8
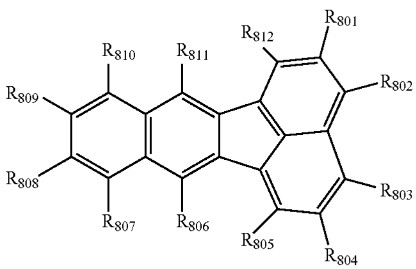
8B-9
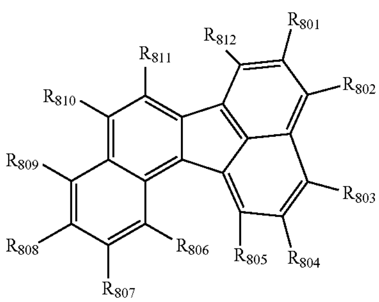
8B-10
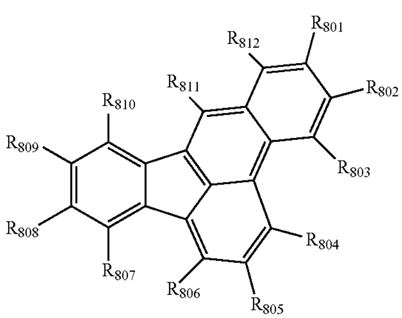
8B-11
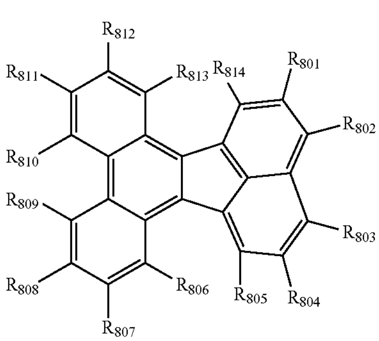
-continued
8B-12
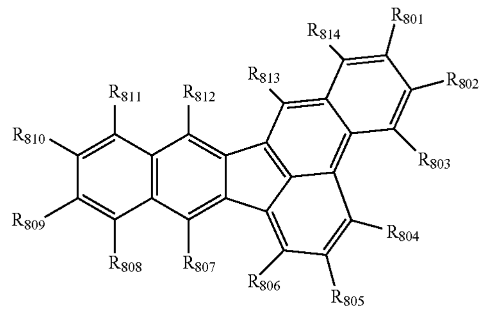
8B-13
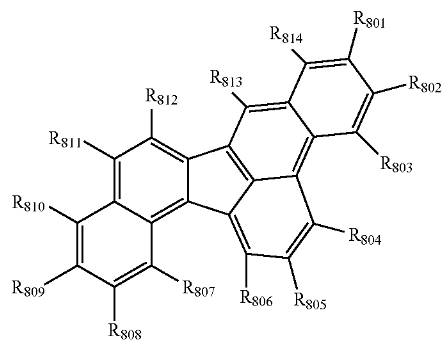
8B-14
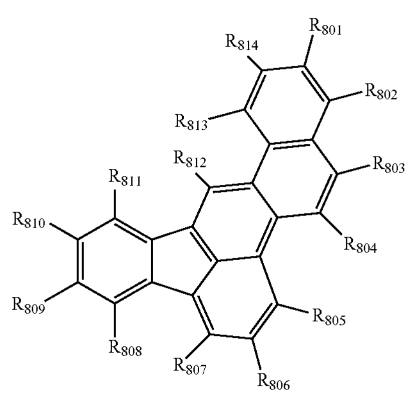
8B-15
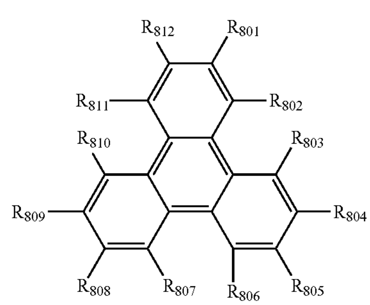

-continued
8B-16
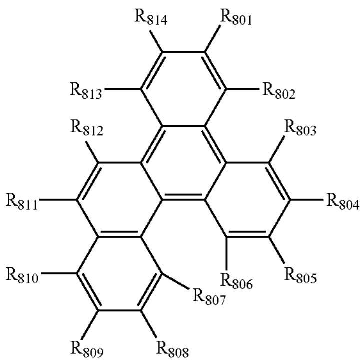
8B-17
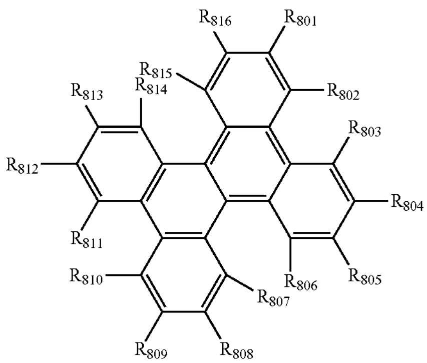
8B-18
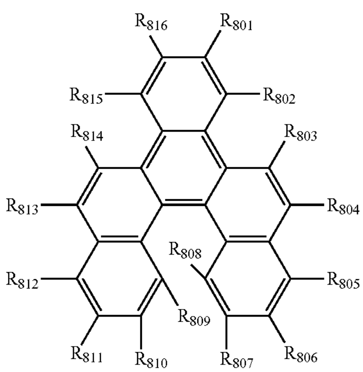
8B-19
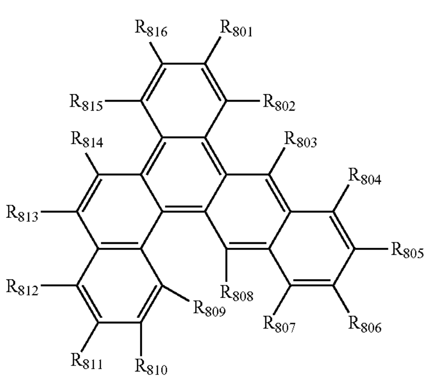
-continued
8C-1
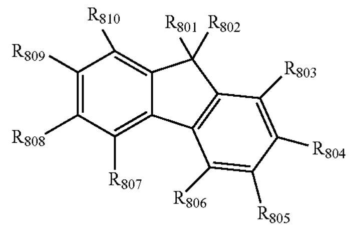
8C-2
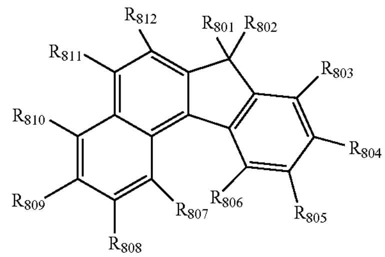
8C-3
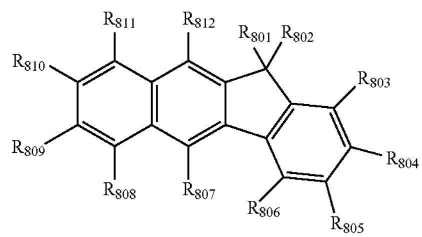
8C-4
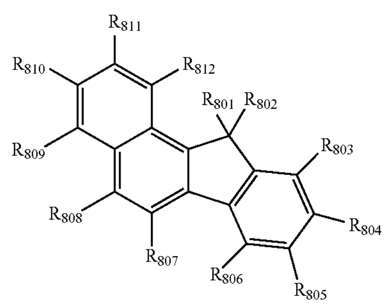
8C-5
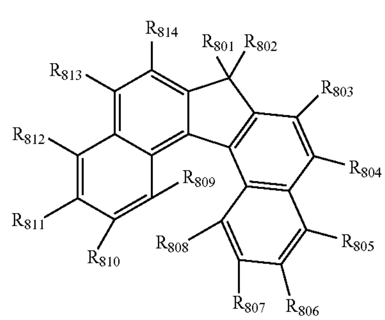

-continued
8C-6
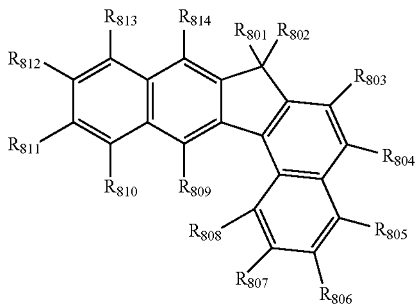
8C-7
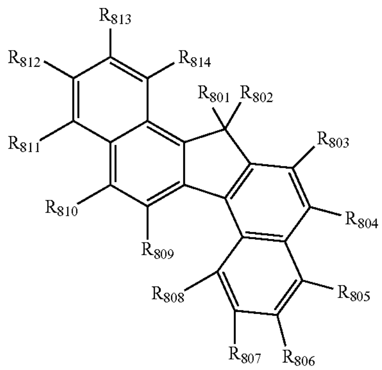
8C-8
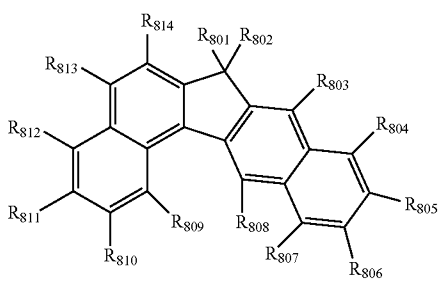
8C-9
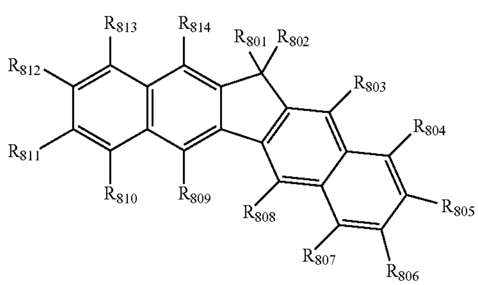
8C-10
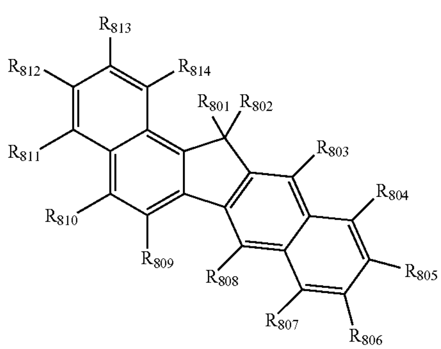
-continued
8C-11
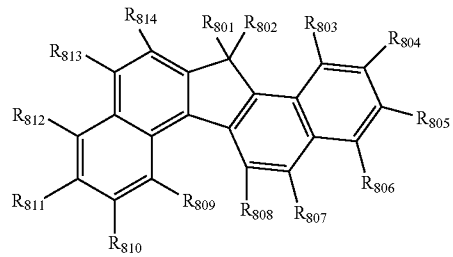
8C-12
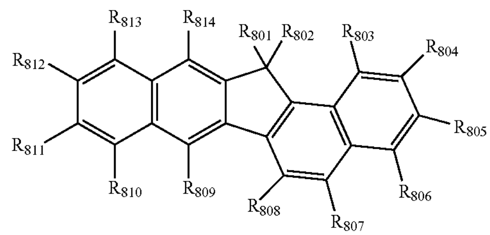
8C-13
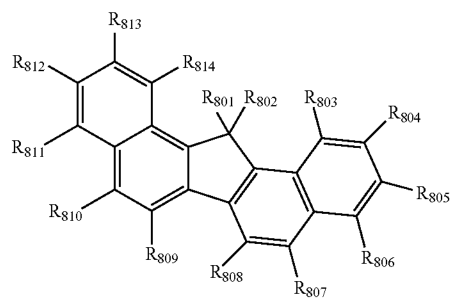
8C-14
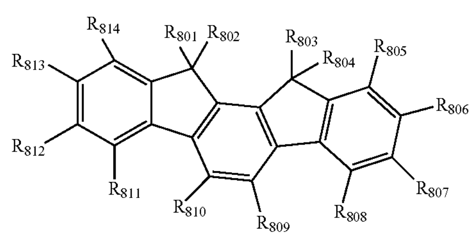
8C-15
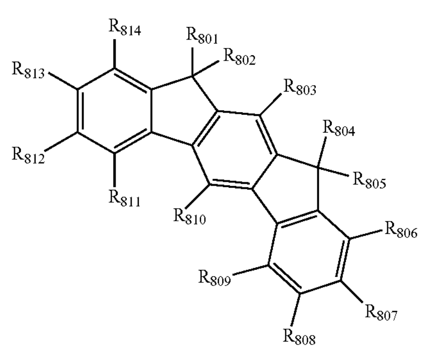

-continued
8C-16
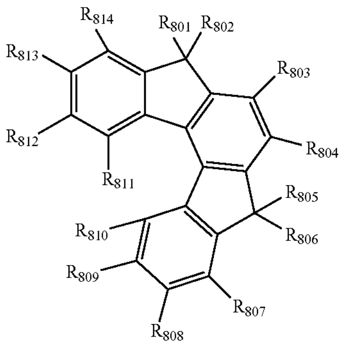
8C-17
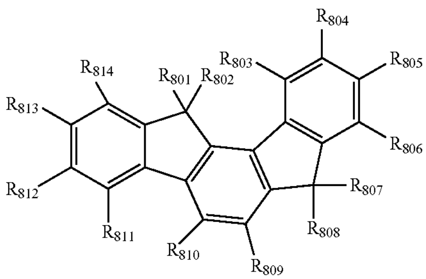
8C-18
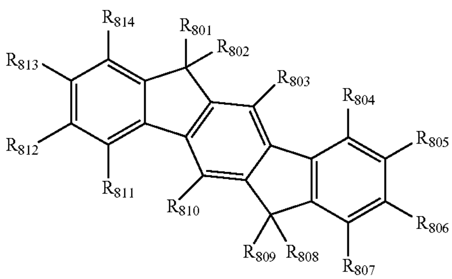
8C-19
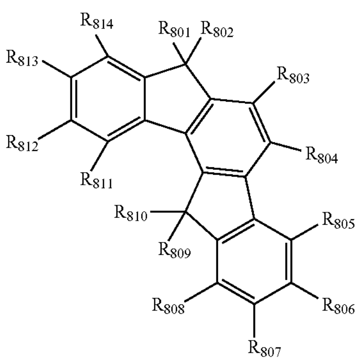
8D-1
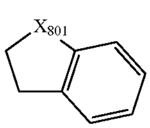
8D-2
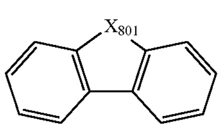
8D-3
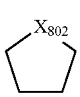
-continued
9A-1
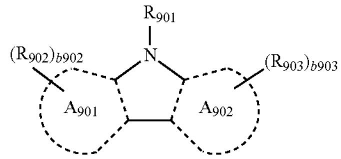
9A-2
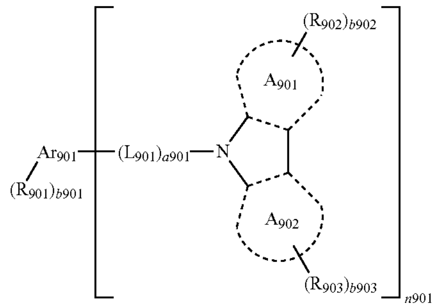
9A-4
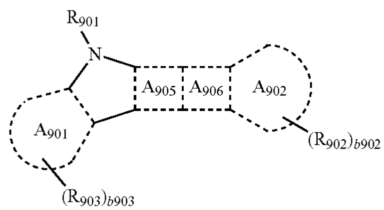
9B-1
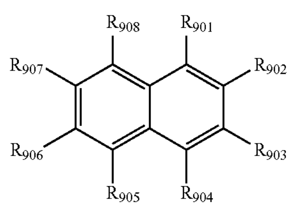
9B-1
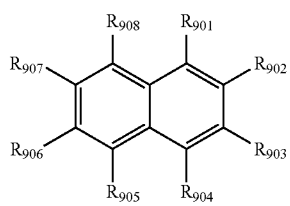
9B-2
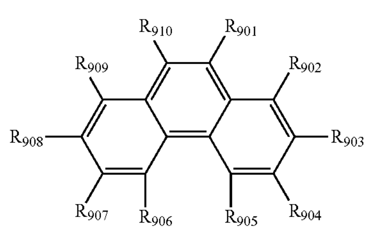
9B-3
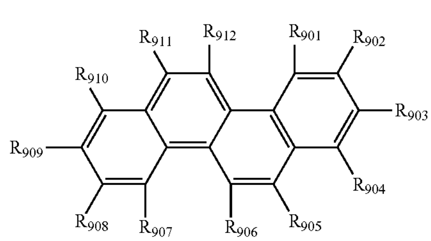

-continued
9B-4
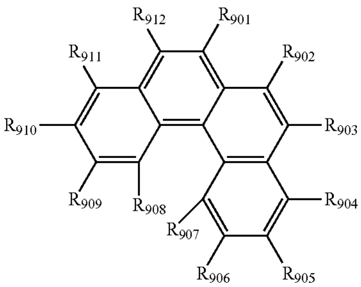
9B-5
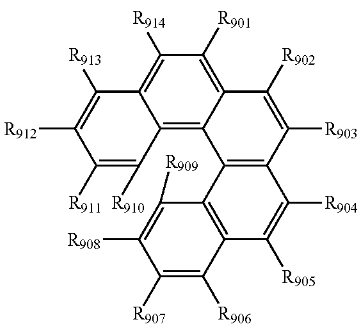
9B-6
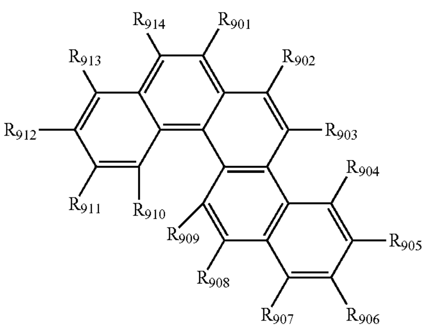
9B-7
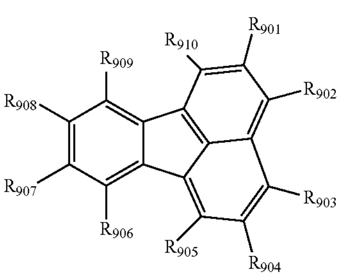
9B-8
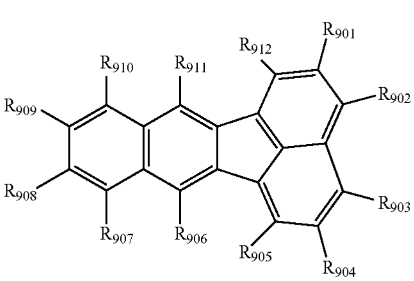
-continued
9B-9
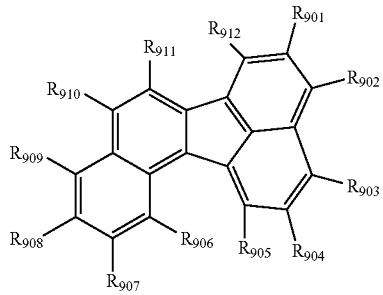
9B-10
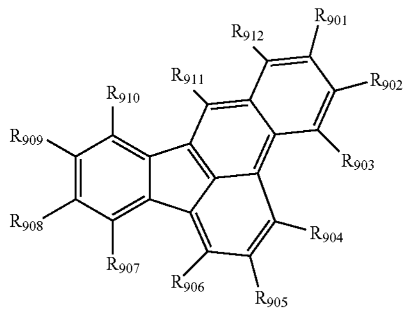
9B-11
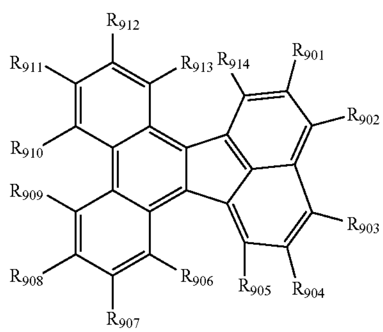
9B-12
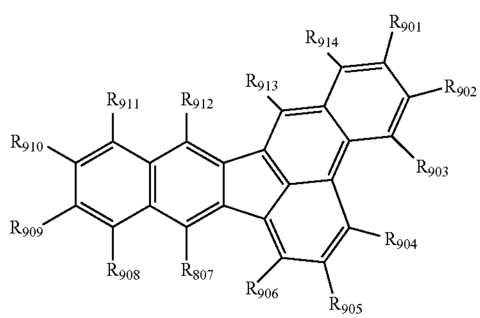
9B-13
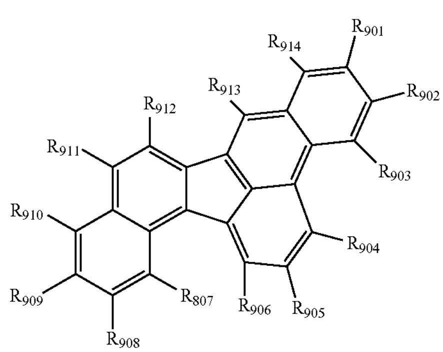

-continued
9B-14
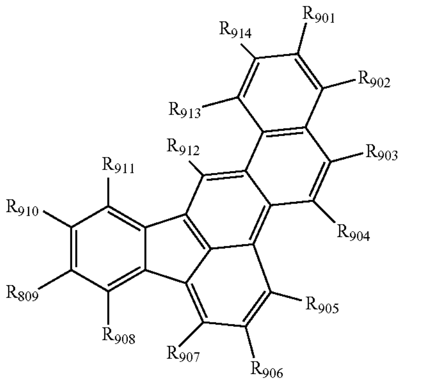
9B-15
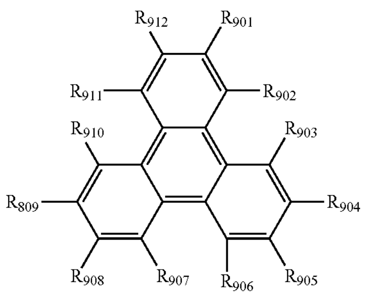
9B-16
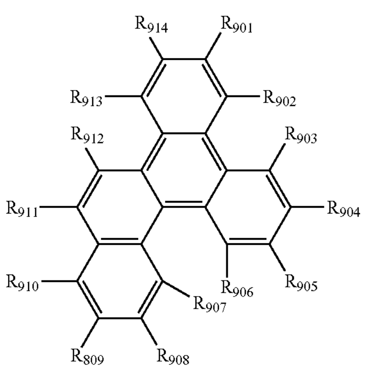
9B-17
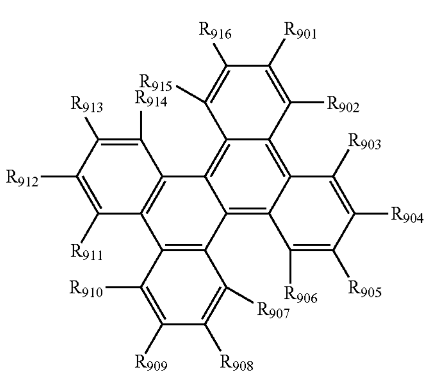
-continued
9B-18
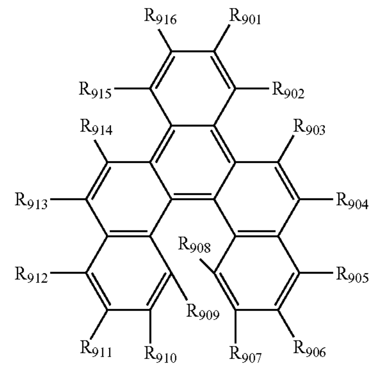
9B-19
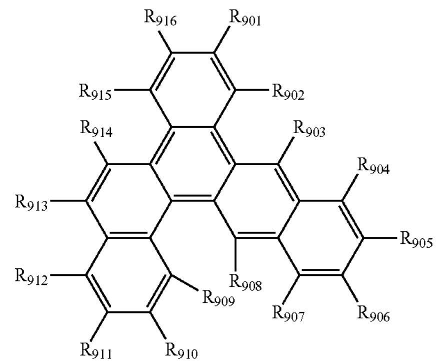
9C-1
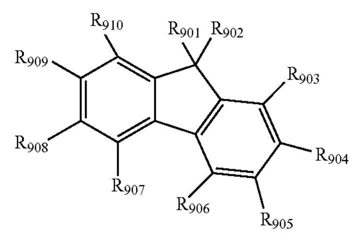
9C-2
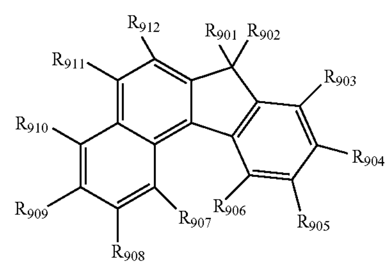
9C-3
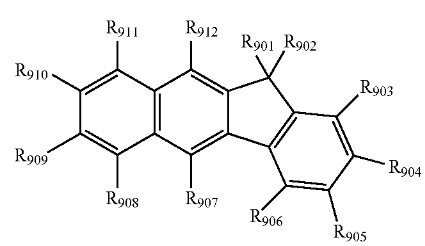

-continued
9C-4
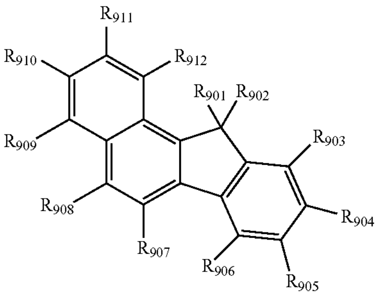
9C-5
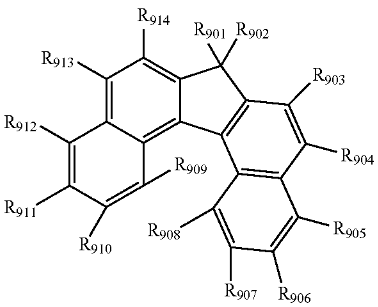
9C-6
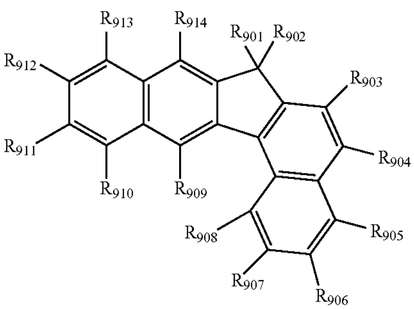
9C-7
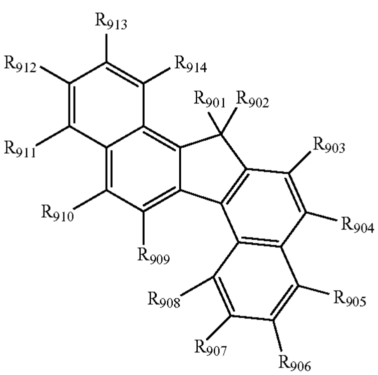
9C-8
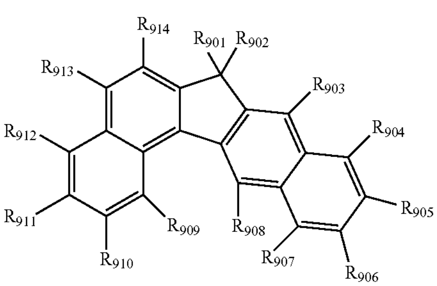
-continued
9C-9
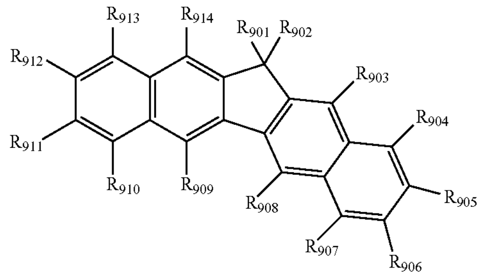
9C-10
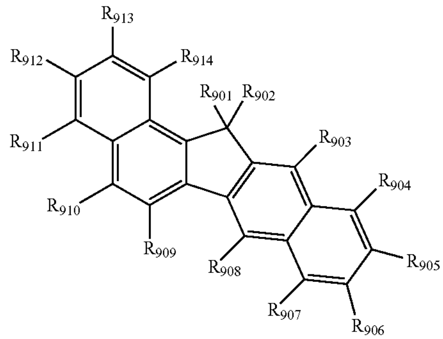
9C-11
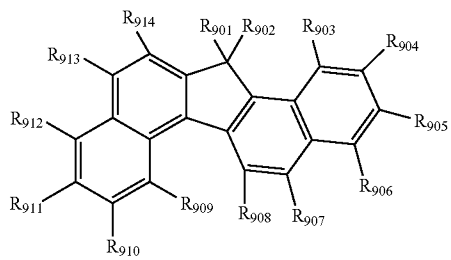
9C-12
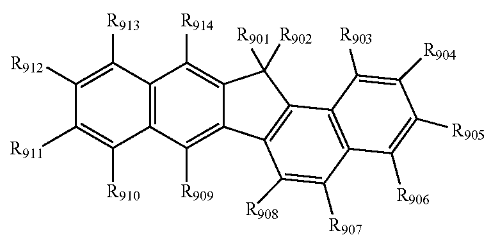
9C-13
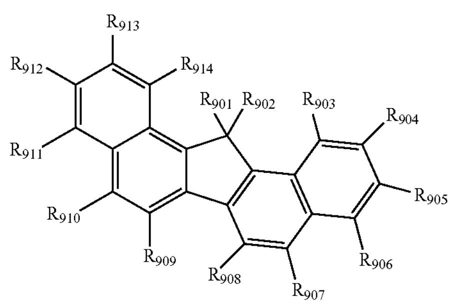

-continued 9C-14

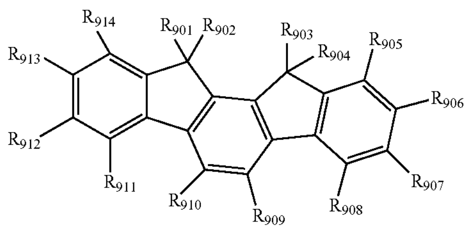

9C-15

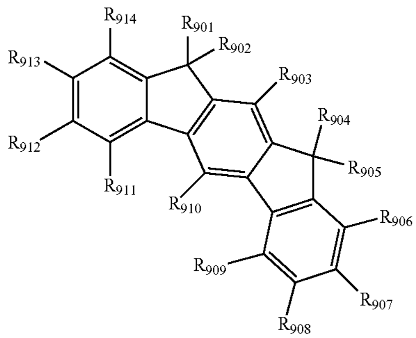

9C-16

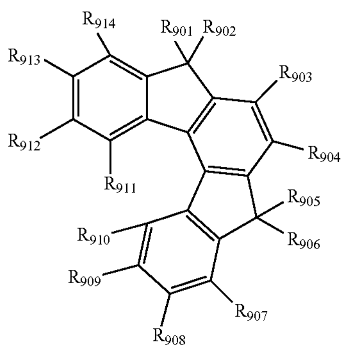

9C-17

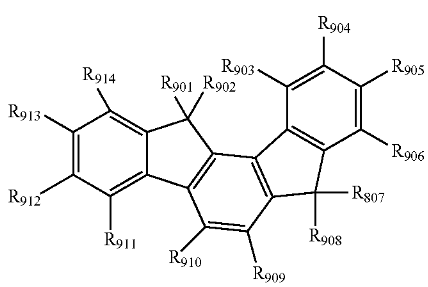

9C-18

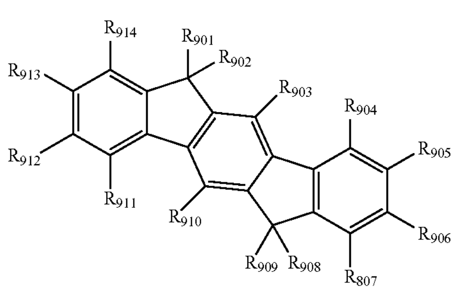

-continued 9C-19

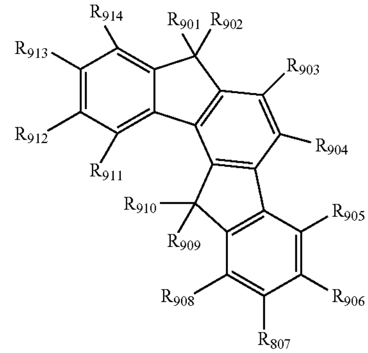

9D-1

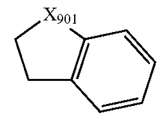

9D-2

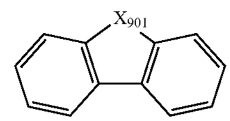

9D-3

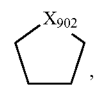

$Ar_{801}$ and $Ar_{901}$ are each independently selected from a substituted or unsubstituted $C_3$-$C_{10}$ cycloalkane group, a substituted or unsubstituted $C_1$-$C_{10}$ heterocycloalkane group, a substituted or unsubstituted $C_3$-$C_{10}$ cycloalkene group, a substituted or unsubstituted $C_1$-$C_{10}$ heterocycloalkene group, a substituted or unsubstituted $C_6$-$C_{60}$ arene group, a substituted or unsubstituted $C_1$-$C_{60}$ heteroarene group, a substituted or unsubstituted non-aromatic condensed polycyclic group, and a substituted or unsubstituted non-aromatic condensed heteropolycyclic group, $L_{801}$, $L_{901}$, $L_{11}$ and $L_{21}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a801, a901, a11 and a21 are each independently selected from 0, 1, 2, and 3, $R_{11}$ is a hole-transporting group, and $R_{21}$ is an electron-transporting group, provided that $R_{11}$ and $R_{21}$ are each independently not a carbazolyl group, a dibenzofuranyl group, a pyridinyl group, a pyrimidinyl group, a benzimidazolyl group, or a triazinyl group, b11 and b21 are each independently selected from 1, 2, and 3, n11 and n21 are each independently selected from 1, 2, 3, and 4, $A_{801}$ to $A_{804}$ are each independently selected from a benzene, a naphthalene, a pyridine, a pyrimidine, a pyrazine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, a group represented by Formula 8D-1, and a group represented by Formula 8D-2, and $A_{901}$ to $A_{904}$ are each independently selected from a benzene, a naphthalene, a pyridine, a pyrimidine, a pyrazine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, a group represented by Formula 9D-1, and a group represented by Formula 9D-2, $A_{805}$ and $A_{905}$ are each independently selected from a benzene and a naphthalene, $A_{806}$ is represented by Formula 8D-3, and $A_{906}$ is represented by Formula 9D-3, $X_{801}$ and $X_{802}$ are each independently selected from $N(R_{806})$, O, S, $C(R_{806})(R_{807})$, $Si(R_{806})(R_{807})$, $B(R_{806})$, $P(R_{806})$, and $P(=O)(R_{806})$, and $X_{901}$ and $X_{902}$ are each independently selected from $N(R_{906})$, O, S, $C(R_{906})(R_{907})$, $Si(R_{906})(R_{907})$, $B(R_{906})$, $P(R_{906})$, and $P(=O)(R_{906})$, $R_{801}$ to $R_{816}$ are each independently selected from $*-[(L_{11})_{a11}-(R_{11})_{b11}]$, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein the number of $R_{801}$ to $R_{816}$ represented by $*-[(L_{11})_{a11}-(R_{11})_{b11}]$ equals to n11, $R_{901}$ to $R_{916}$ are each independently selected from $*-[(L_{21})_{a21}-(R_{21})_{b21}]$, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein the number of $R_{901}$ to $R_{916}$ represented by $*-[(L_{21})_{a21}-(R_{21})_{b21}]$ equals to n21, b801 to b805 and b901 to b905 are each independently selected from 1, 2, 3, and 4, n801 and n901 are each independently selected from 2, 3, and 4, n802 and n902 are each independently selected from 1, 2, and 3, M is selected from iridium (Ir), platinum (Pt), osmium (Os), titanium (Ti), zirconium (Zr), hafnium (Hf), europium (Eu), terbium (Tb), thulium (Tm), and rhodium (Rd), $L_1$ is a ligand represented by Formula 7A, $L_2$ is a ligand represented by Formula 7B, wherein $L_1$ and $L_2$ are different from each other, n71 and n72 are each independently 1 or 2, a sum of n71 and n72 (n71+n72) is 2 or 3, and when n71 is 2, two $L_1$s are identical to or different from each other, and n72 is 2, two $L_2$s are identical to or different from each other, $Y_1$ to $Y_4$ are each independently C or N, wherein $Y_1$ and $Y_2$ are linked to each other via a single bond or a double bond, and $Y_3$ and $Y_4$ are linked to each other via a single bond or a double bond, $CY_1$ and $CY_2$ are each independently selected from a $C_5$-$C_{60}$ cyclic group and a $C_2$-$C_{60}$ heterocyclic group, wherein $CY_1$ and $CY_2$ are optionally linked to each other via a single bond or a first linking group, $R_{71}$ to $R_{73}$ are each independently selected from:

a $C_1$-$C_{10}$ alkyl group; and a $C_1$-$C_{10}$ alkyl group, substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, $Z_{71}$, $Z_{72}$, and $R_{711}$ to $R_{717}$ are each independently selected from hydrogen, deuterium, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, and $—B(Q_6)(Q_7)$, wherein $R_{712}$ is not hydrogen, and two adjacent substituents selected from $R_{714}$ to $R_{717}$ are optionally linked to each other to form a condensed ring, a71 and a72 are each independently an integer selected from 1 to 5, and when a71 is 2 or more, a plurality of $Z_{71}$s are identical to or different from each other, and a72 is 2 or more, a plurality of $Z_{72}$s are identical to or different from each other,

* and *' each independently indicate a binding site to M of Formula 1, and at least one substituent of the substituted $C_4$-$C_{30}$ pyrrolidine-based core, the substituted $C_7$-$C_{30}$ condensed polycyclic-based core, the substituted $C_3$-$C_{10}$ cycloalkane group, the substituted $C_1$-$C_{10}$ heterocycloalkane group, the substituted $C_3$-$C_{10}$ cycloalkene group, the substituted $C_1$-$C_{10}$ heterocycloalkene group, the substituted $C_6$-$C_{60}$ arene group, the substituted $C_1$-$C_{60}$ heteroarene group, the substituted non-aromatic condensed polycyclic group, the substituted non-aromatic condensed heteropolycyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, and —$B(Q_{36})(Q_{37})$, wherein $Q_1$ to $Q_7$, $Q_{11}$ to $Q_{17}$, $Q_{21}$ to $Q_{27}$, and $Q_{31}$ to $Q_{37}$ are each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

12. The organic light-emitting device of claim 11, wherein the first host and the second host are different from each other.

13. The organic light-emitting device of claim 11, wherein the first host is represented by Formula 1, and the second host is represented by Formula 2.

14. An organic light-emitting device comprising:

a first electrode;

a second electrode; and an organic layer between the first electrode and the second electrode, the organic layer comprising an emission layer, wherein the emission layer comprises a Host I and a dopant, the Host I is represented by Formula 11, and the dopant is represented by Formula 7:

Formula 11

$$Ar_{111}\text{-}[(L_{111})_{a111}\text{-}(R_{111})_{b111}]_{n111}$$

Formula 7

$$M(L_1)_{n71}(L_2)_{n72}$$

Formula 7A

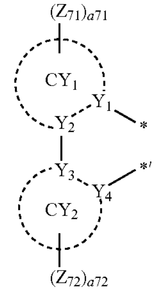

-continued
Formula 7B
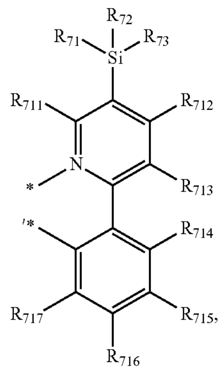
wherein, in Formulae above,
$Ar_{111}$ is represented by one of Formulae 12A-2, 12B-3 to 12B-14, 12B-16 to 12B-19, and 12C-1 to 12C-19:
12A-2
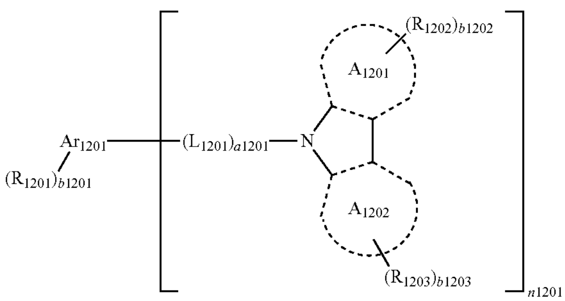
12B-3
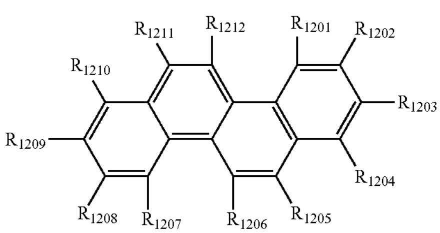
12B-4
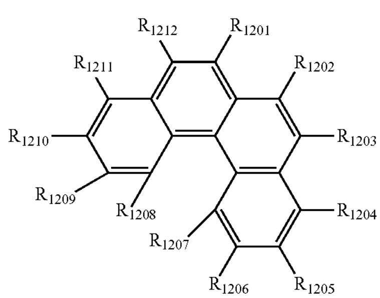
-continued
12B-5
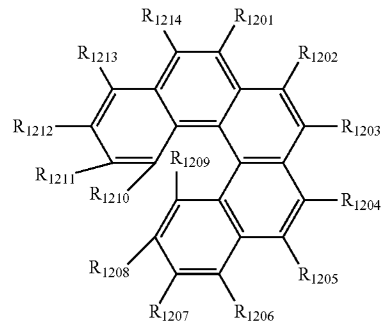
12B-6
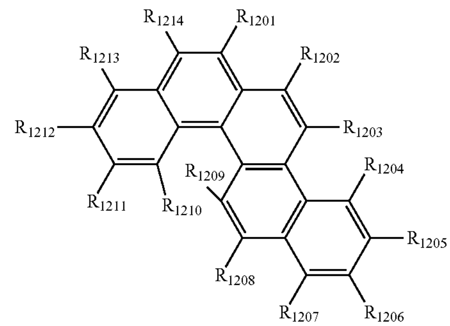
12B-7
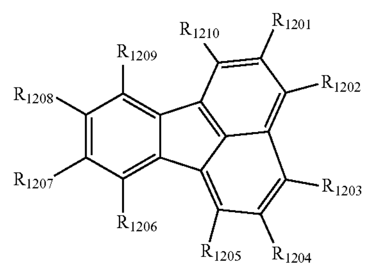
12B-8
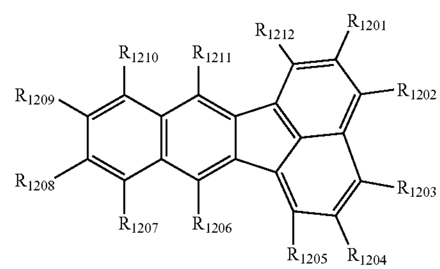
12B-9
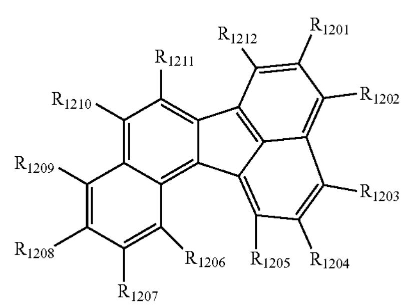

-continued
12B-10
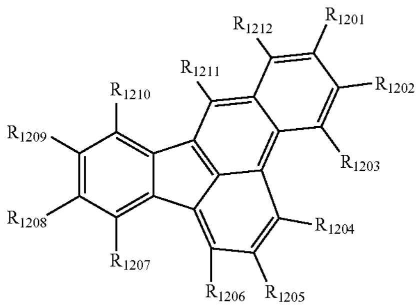
12B-11
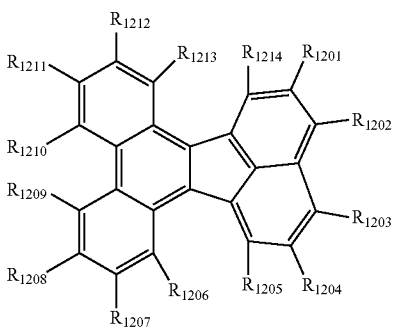
12B-12
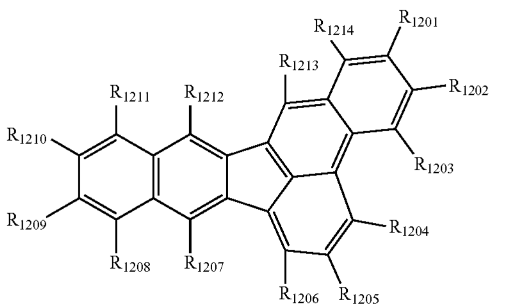
12B-13
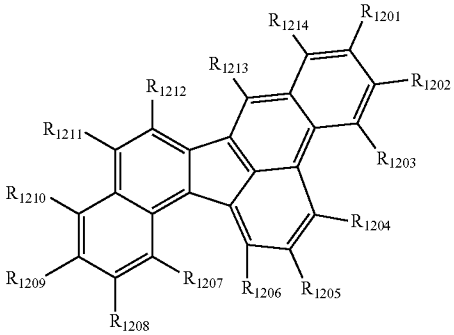
-continued
12B-14
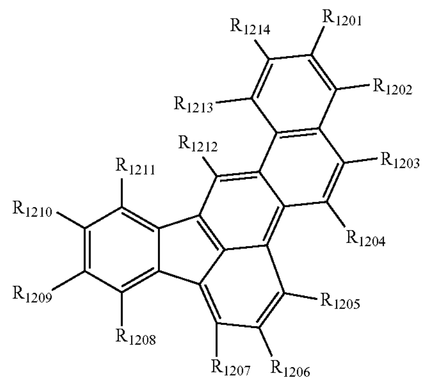
12B-16
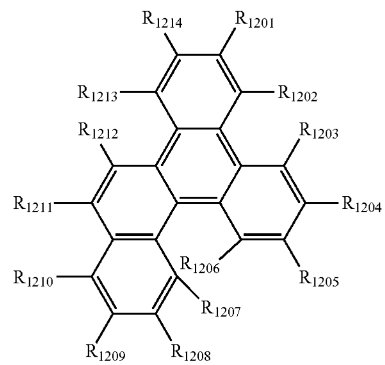
12B-17
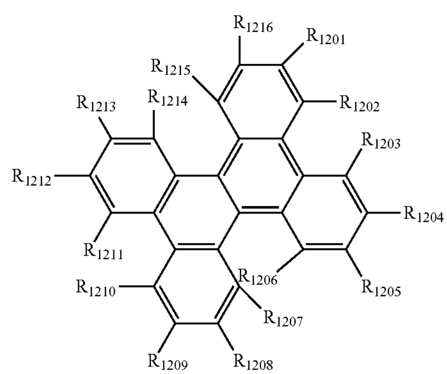
12B-18
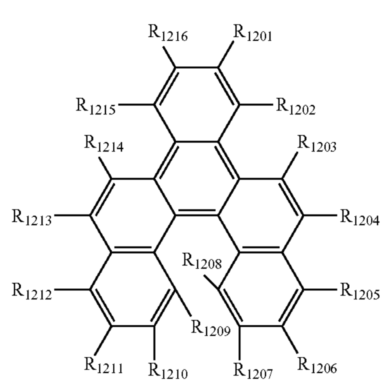

-continued
12B-19
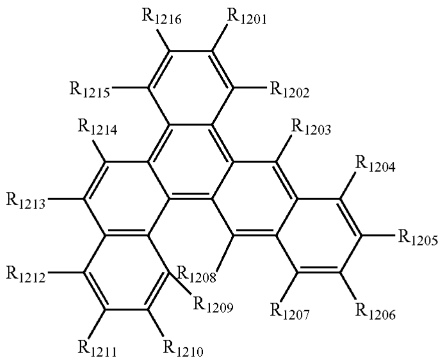
12C-1
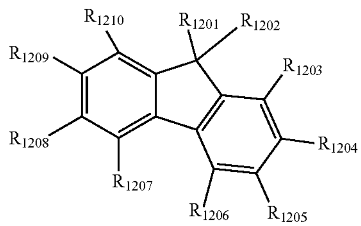
12C-2
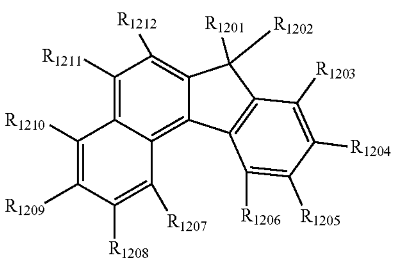
12C-3
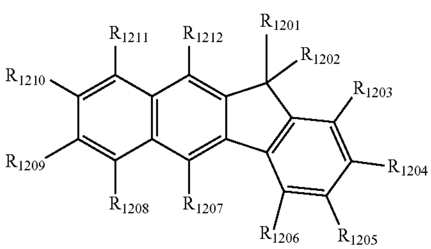
12C-4
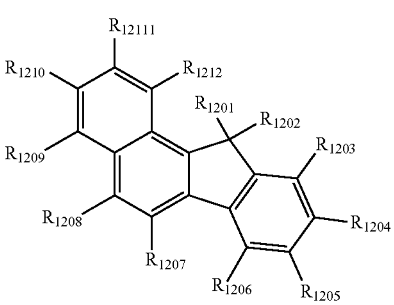
-continued
12C-5
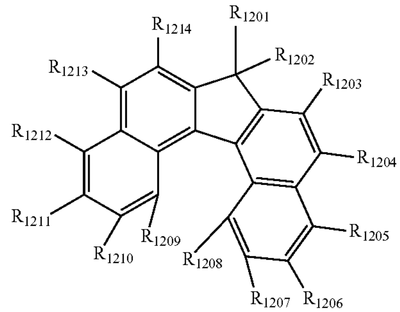
12C-6
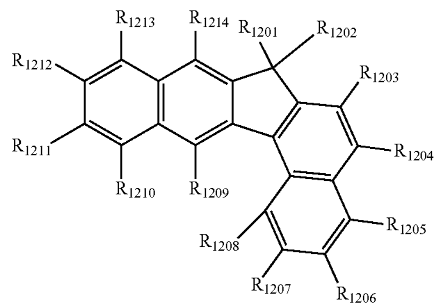
12C-7
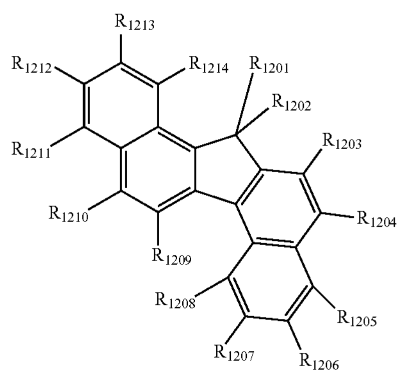
12C-8
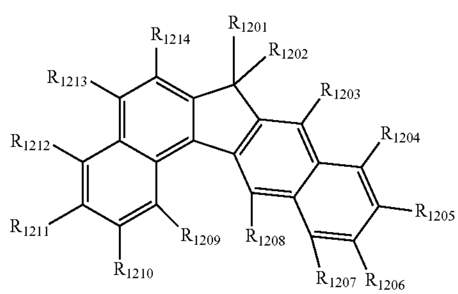
12C-9
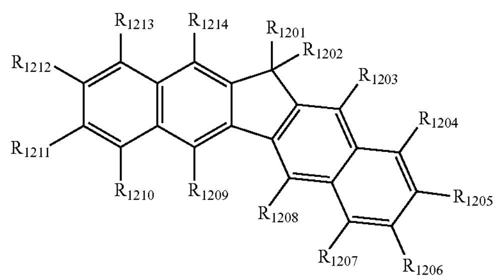

-continued
12C-10
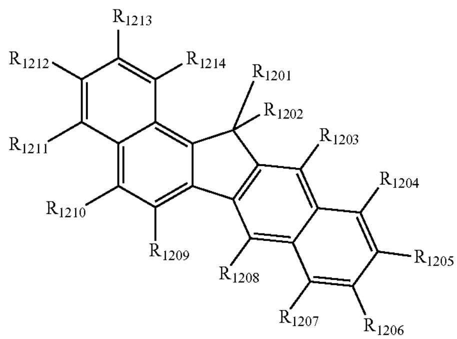
12C-11
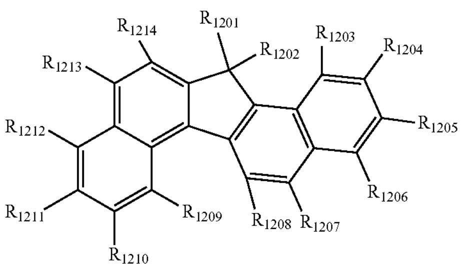
12C-12
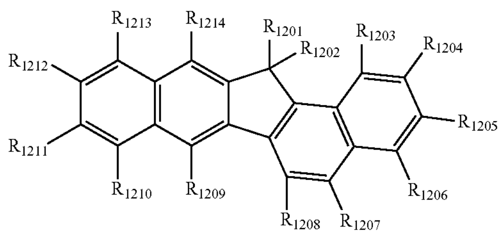
12C-13
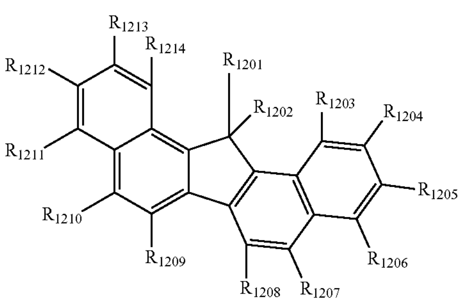
12C-14
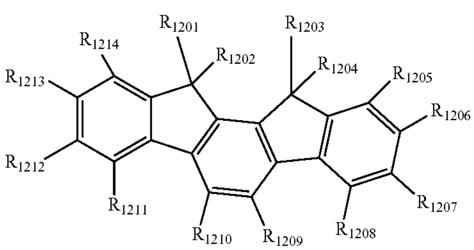
12C-15
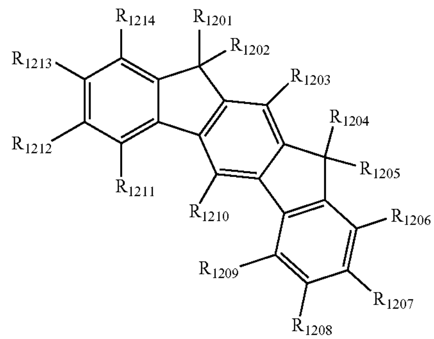
12C-16
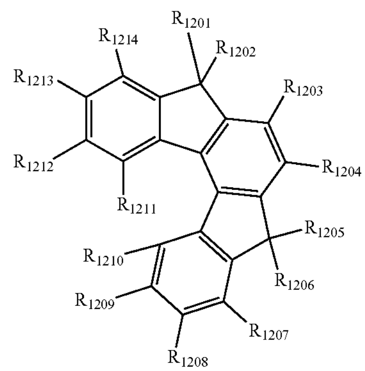
12C-17
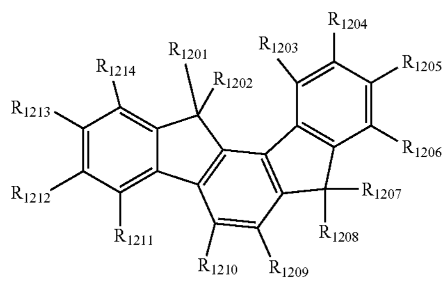
12C-18
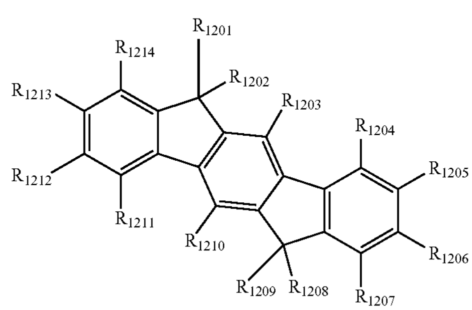

-continued 12C-19

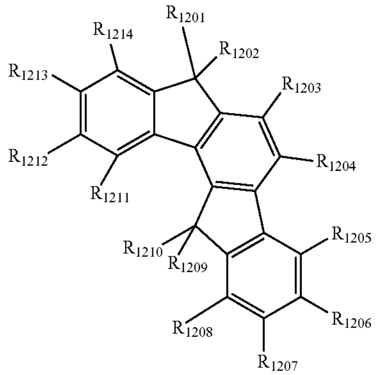

12D-1

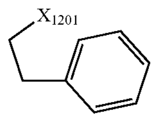

12D-2

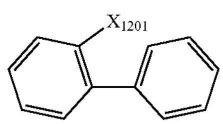

12D-3

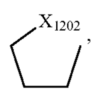

$Ar_{1201}$ is selected from a substituted or unsubstituted $C_3$-$C_{10}$ cycloalkane group, a substituted or unsubstituted $C_1$-$C_{10}$ heterocycloalkane group, a substituted or unsubstituted $C_3$-$C_{10}$ cycloalkene group, a substituted or unsubstituted $C_1$-$C_{10}$ heterocycloalkene group, a substituted or unsubstituted $C_6$-$C_{60}$ arene group, a substituted or unsubstituted $C_1$-$C_{60}$ heteroarene group, a substituted or unsubstituted non-aromatic condensed polycyclic group, and a substituted or unsubstituted non-aromatic condensed heteropolycyclic group, $L_{111}$ and $L_{1201}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a111 and a1201 are each independently selected from 0, 1, 2, and 3, $R_{111}$ is selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one $R_{111}$ is selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, b111 is selected from 1, 2, and 3, n111 is selected from 1, 2, 3, and 4, $A_{1201}$ to $A_{1204}$ are each independently selected from a benzene, a naphthalene, a pyridine, a pyrimidine, a pyrazine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, a group represented by Formula 12D-1, and a group represented by Formula 12D-2, $A_{1205}$ and $A_{1205}$ are each independently selected from a benzene and a naphthalene, $A_{1206}$ is represented by Formula 12D-3, $X_{1201}$ in Formula 12D-1 and $X_{1202}$ are each independently selected from $N(R_{1206})$, O, S, $C(R_{1206})(R_{1207})$, $Si(R_{1206})(R_{1207})$, $B(R_{1206})$, $P(R_{1206})$, and $P(=O)(R_{1206})$, and $X_{1201}$ in Formula 12D-2 is selected from O, S, $C(R_{1206})(R_{1207})$, $Si(R_{1206})(R_{1207})$, $B(R_{1206})$, $P(R_{1206})$, and $P(=O)(R_{1206})$, $R_{1201}$ to $R_{1216}$ are each independently selected from $*\text{-}[(L_{111})_{a111}\text{-}(R_{111})_{b111}]$, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{1201}$ to $R_{1216}$ is $*\text{-}[(L_{111})_{a111}(R_{111})_{b111}]$, b1201 to b1205 are each independently selected from 1, 2, 3, and 4, n1201 is selected from 2, 3, and 4, n1202 is selected from 1, 2, and 3, M is selected from iridium (Ir), platinum (Pt), osmium (Os), titanium (Ti), zirconium (Zr), hafnium (Hf), europium (Eu), terbium (Tb), thulium (Tm), and rhodium (Rd), $L_1$ is a ligand represented by Formula 7A, and $L_2$ is a ligand represented by Formula 7B, wherein $L_1$ and $L_2$ are different from each other, n71 and n72 are each independently 1 or 2, a sum of n71 and n72 (n71+n72) is 2 or 3, and when n71 is 2, two $L_1$s are identical to or different from each other, and when n72 is 2, two $L_2$ are identical to or different from each other;

$Y_1$ to $Y_4$ are each independently C or N, wherein $Y_1$ and $Y_2$ are linked to each other via a single bond or a double bond, and $Y_3$ and $Y_4$ are linked to each other via a single bond or a double bond, $CY_1$ and $CY_2$ are each independently selected from a $C_5$-$C_{60}$ cyclic group and a $C_2$-$C_{60}$ heterocyclic group, wherein $CY_1$ and $CY_2$ are optionally linked to each other via a single bond or a first linking group, $R_{71}$ to $R_{73}$ are each independently selected from:

a $C_1$-$C_{10}$ alkyl group; and a $C_1$-$C_{10}$ alkyl group substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, $Z_{71}$, $Z_{72}$, and $R_{711}$ to $R_{717}$ are each independently selected from hydrogen, deuterium, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$), wherein $R_{712}$ is not hydrogen, and two adjacent substituents selected from $R_{714}$ to $R_{717}$ are optionally linked to each other to form a condensed ring, a71 and a72 are each independently an integer selected from 1 to 5, when a71 is 2 or more, a plurality of $Z_{71}$s are identical to or different from each other, and when a72 is 2 or more, a plurality of $Z_{72}$s are identical to or different from each other,

* and *' each independently indicate a binding site to M of Formula 1, and at least one substituent of the substituted $C_4$-$C_{30}$ pyrrolidine-based core, the substituted $C_7$-$C_{30}$ condensed polycyclic-based core, the substituted $C_3$-$C_{10}$ cycloalkane group, the substituted $C_1$-$C_{10}$ heterocycloalkane group, the substituted $C_3$-$C_{10}$ cycloalkene group, the substituted $C_1$-$C_{10}$ heterocycloalkene group, the substituted $C_6$-$C_{60}$ arene group, the substituted $C_1$-$C_{60}$ heteroarene group, the substituted non-aromatic condensed polycyclic group, the substituted non-aromatic condensed heteropolycyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ are each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

15. The organic light-emitting device of claim 14, wherein $L_{111}$ is selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group.

16. The organic light-emitting device of claim 14, wherein $R_{111}$ is selected from:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzothiazoly group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, a pyrimidobenzothiophenyl group, and —N($R_{56}$)($R_{57}$); and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —N($Q_{31}$)($Q_{32}$), —Si($Q_{33}$)($Q_{34}$)($Q_{35}$), and —B($Q_{36}$)($Q_{37}$), wherein $R_{56}$ and $R_{57}$ may each be independently selected from a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group; and a $C_1$-$C_{20}$ alkyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, and $Q_{31}$ to $Q_{37}$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

17. The organic light-emitting device of claim 14, wherein the emission layer further comprises a Host II, and the Host I and the Host II are different from each other.

18. An organic light-emitting device comprising:

a first electrode;

a second electrode; and an organic layer between the first electrode and the second electrode, the organic layer comprising an emission layer, wherein the emission layer comprises a Host I, a Host II, and a dopant, the Host I and the Host II are different from each other, the Host I and the Host II are each independently represented by Formula 11, and the dopant is represented by Formula 7:

Formula 11

$$Ar_{111}+(L_{111})_{a111}-(R_{111})_{b111}]_{n111}$$

Formula 7

$$M(L_1)_{n71}(L_2)_{n72}$$

Formula 7A

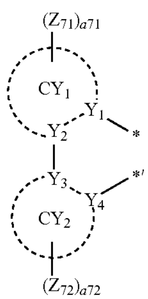

Formula 7B

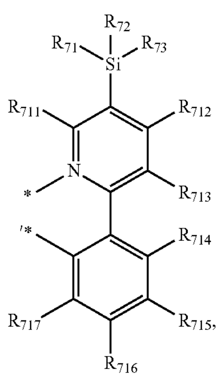

wherein, in Formulae above, $Ar_{111}$ is represented by one of Formulae 12A-1, 12A-2, 12A-4, 12B-1 to 12B-19, and 12C-1 to 12C-19:

12A-1

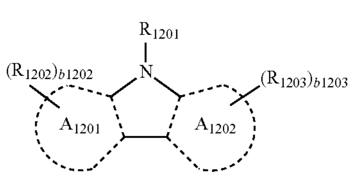

-continued 12A-2

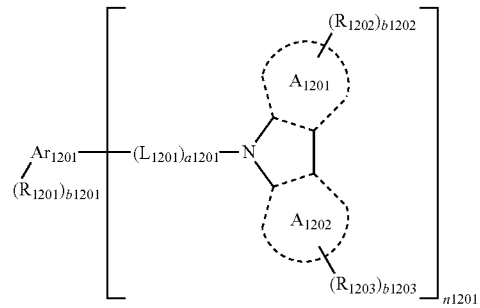

12A-4

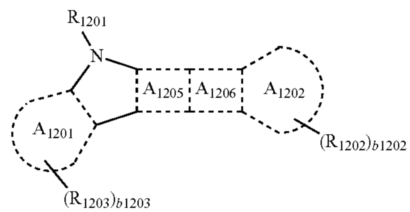

12B-1

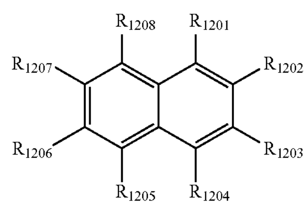

12B-2

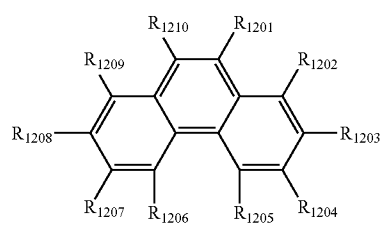

12B-3

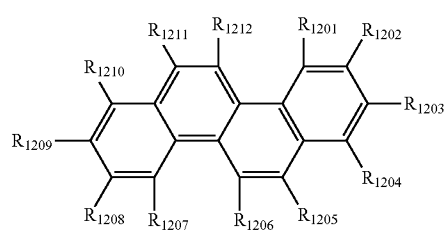

12B-4

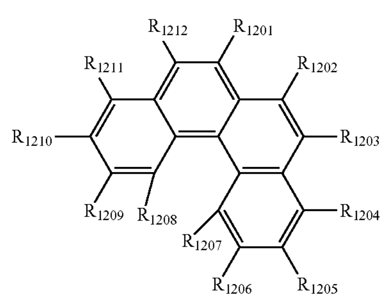

-continued
12B-5
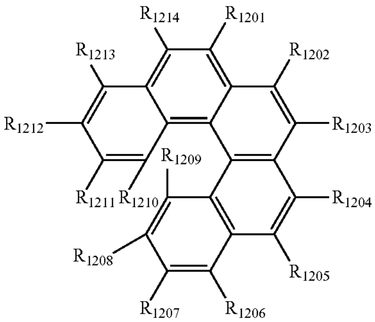
12B-6
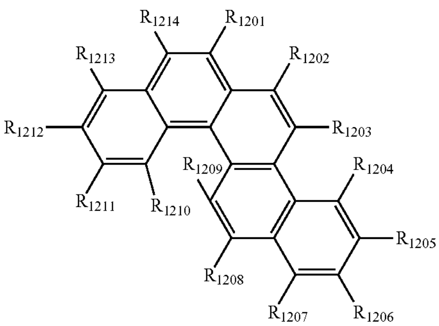
12B-7
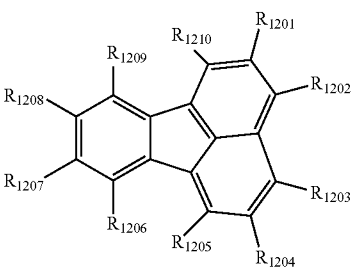
12B-8
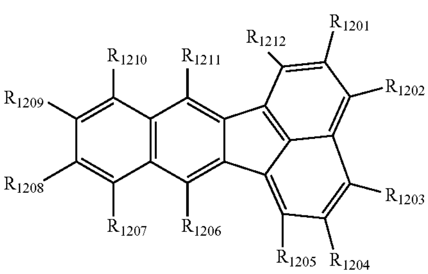
12B-9
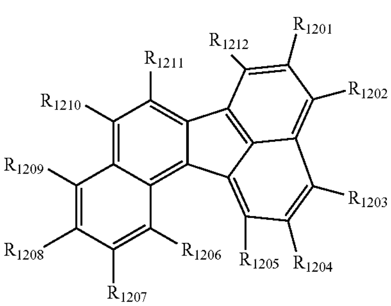
-continued
12B-10
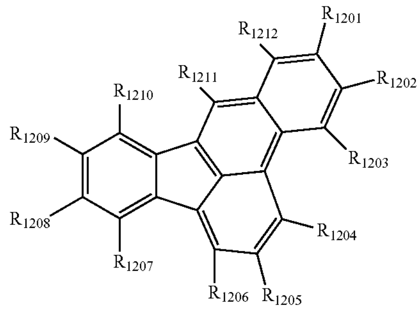
12B-11
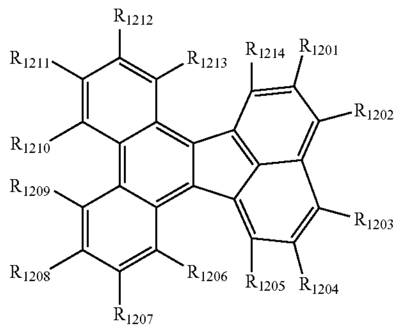
12B-12
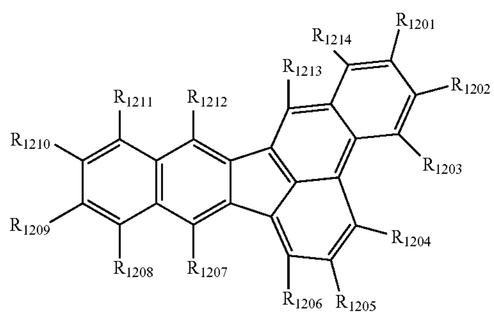
12B-13
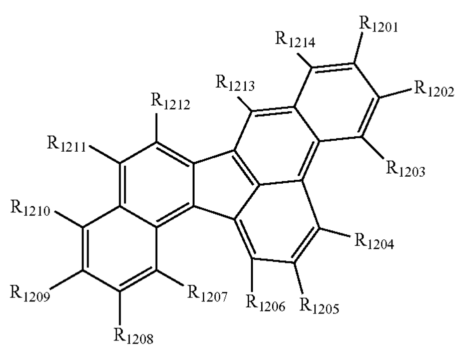

-continued
12B-14
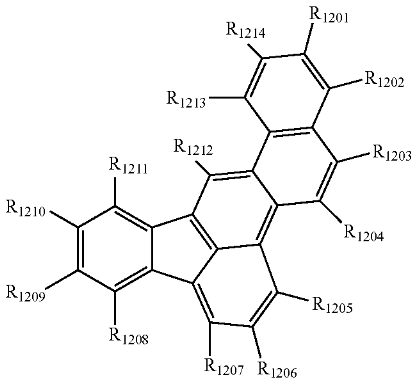
12B-15
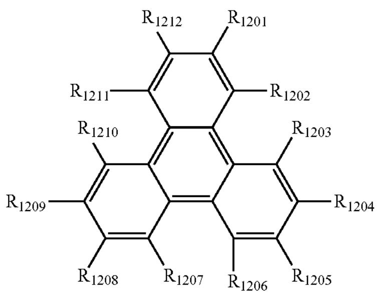
12B-16
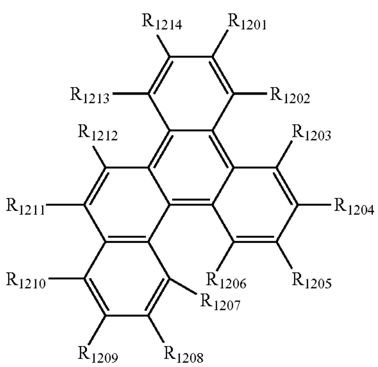
12B-17
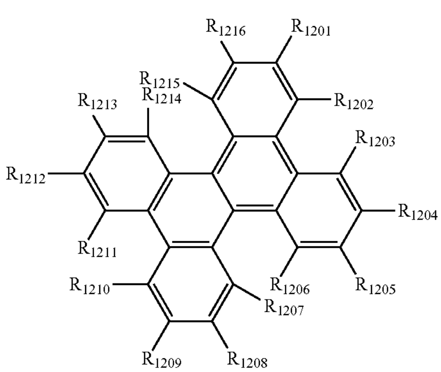
-continued
12B-18
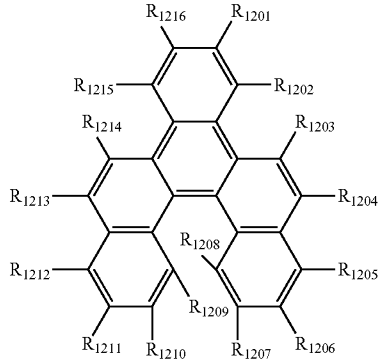
12B-19
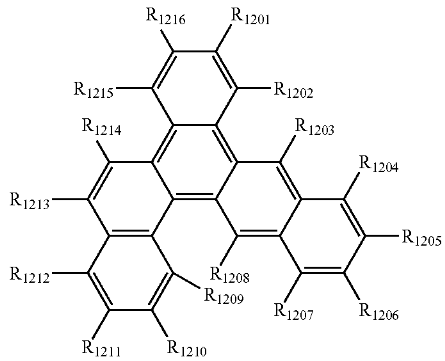
12C-1
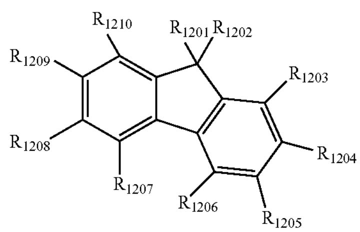
12C-2
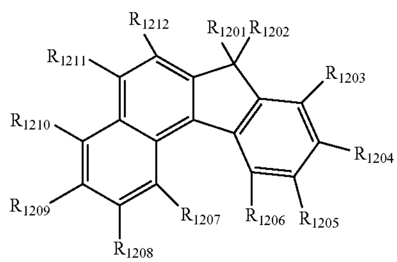
12C-3
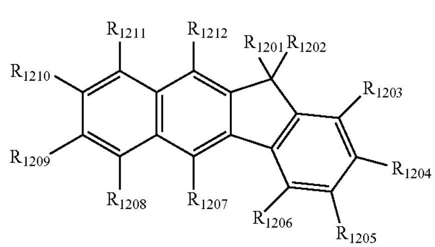

-continued
12C-4
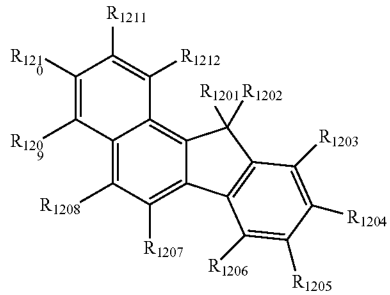
12C-5
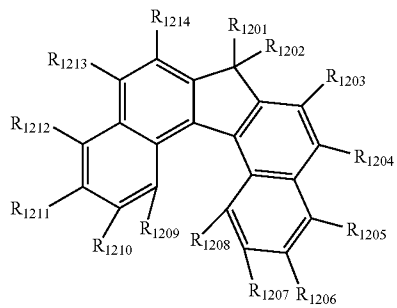
12C-6
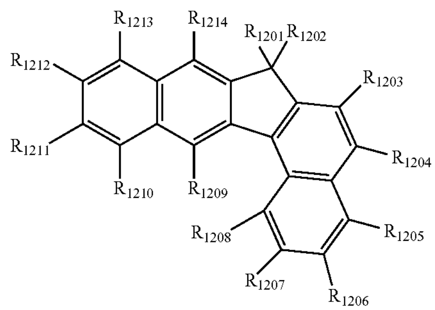
12C-7
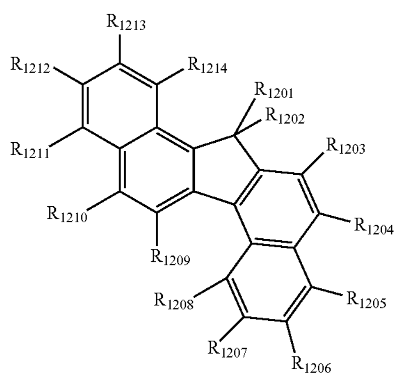
12C-8
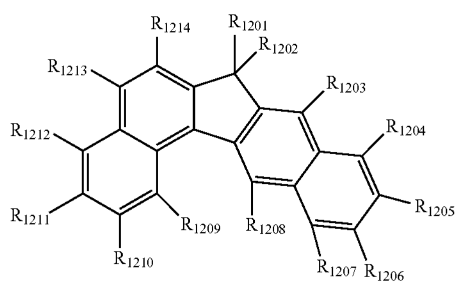
-continued
12C-9
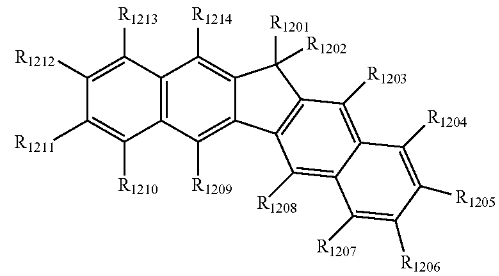
12C-10
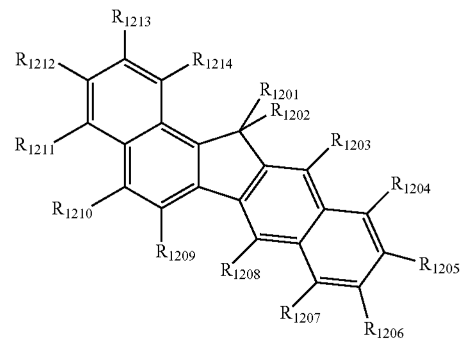
12C-11
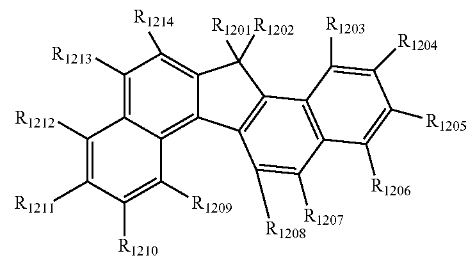
12C-12
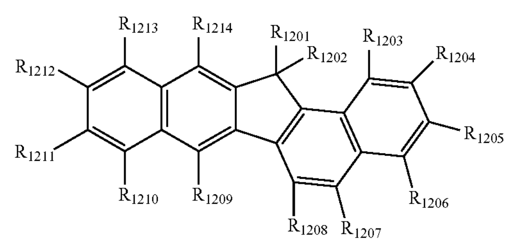
12C-13
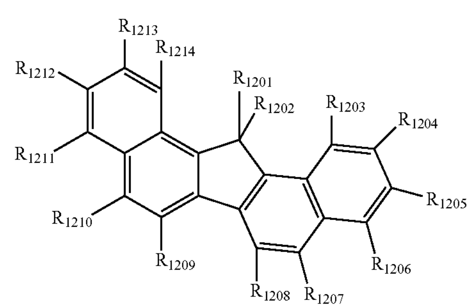

-continued 12C-14

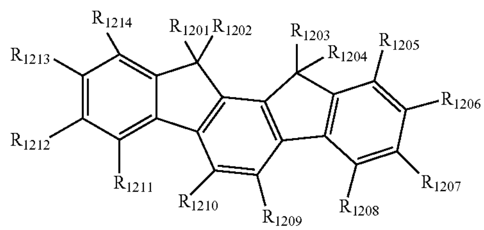

12C-15

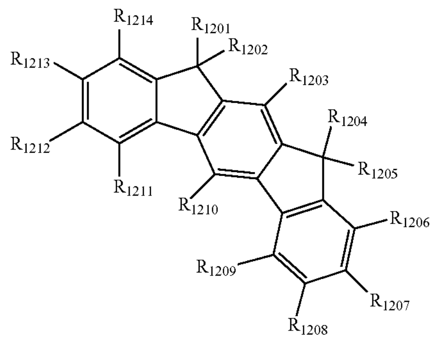

12C-16

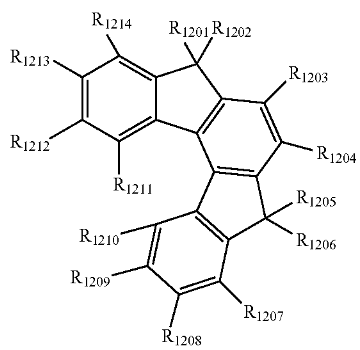

12C-17

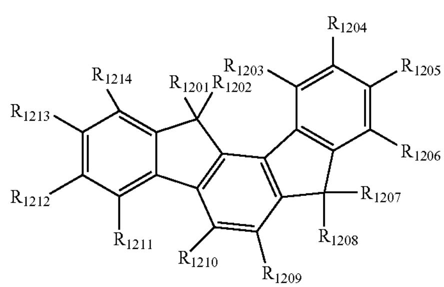

12C-18

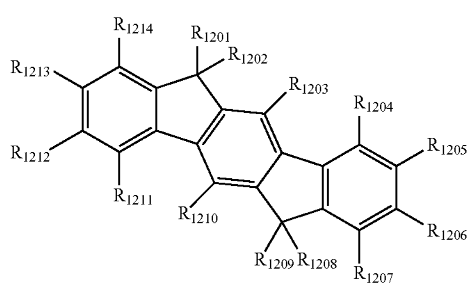

-continued 12C-19

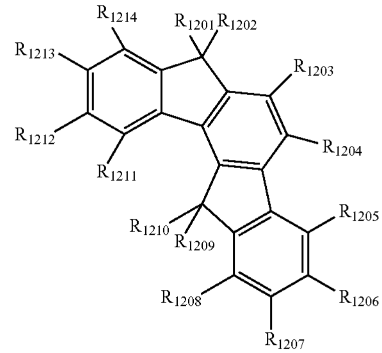

12D-1

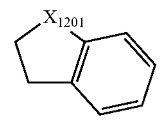

12D-2

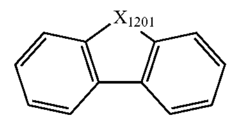

12D-3

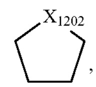

$Ar_{1201}$ is selected from a substituted or unsubstituted $C_3$-$C_{10}$ cycloalkane group, a substituted or unsubstituted $C_1$-$C_{10}$ heterocycloalkane group, a substituted or unsubstituted $C_3$-$C_{10}$ cycloalkene group, a substituted or unsubstituted $C_1$-$C_{10}$ heterocycloalkene group, a substituted or unsubstituted $C_6$-$C_{60}$ arene group, a substituted or unsubstituted $C_1$-$C_{60}$ heteroarene group, a substituted or unsubstituted non-aromatic condensed polycyclic group, and a substituted or unsubstituted non-aromatic condensed heteropolycyclic group, $L_{111}$ and $L_{1201}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a111 and a1201 are each independently selected from 0, 1, 2, and 3, $R_{111}$ is selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one $R_{111}$ is selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, provided that $R_{111}$ is not a carbazolyl group, a dibenzofuranyl group, a pyridinyl group, a pyrimidinyl group, a benzimidazolyl group, or a triazinyl group, b111 is selected from 1, 2, and 3, n111 is selected from 1, 2, 3, and 4, $A_{1201}$ to $A_{1204}$ are each independently selected from a benzene, a naphthalene, a pyridine, a pyrimidine, a pyrazine, a quinoline, an isoquinoline, a 2,6-naphthyridine, a 1,8-naphthyridine, a 1,5-naphthyridine, a 1,6-naphthyridine, a 1,7-naphthyridine, a 2,7-naphthyridine, a quinoxaline, a phthalazine, a quinazoline, a group represented by Formula 12D-1, and a group represented by Formula 12D-2, $A_{1205}$ and $A_{1205}$ are each independently selected from a benzene and a naphthalene, $A_{1206}$ is represented by Formula 12D-3, $X_{1201}$ and $X_{1202}$ are each independently selected from $N(R_{1206})$, O, S, $C(R_{1206})(R_{1207})$, $Si(R_{1206})(R_{1207})$, $B(R_{1206})$, $P(R_{1206})$, and $P(=O)(R_{1206})$, $R_{1201}$ to $R_{1216}$ are each independently selected from $*$-$[(L_{111})_{a111}$-$(R_{111})_{b111}]$, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{1201}$ to $R_{1216}$ is $*$-$[(L_{111})_{a111}$-$(R_{111})_{b111}]$, b1201 to b1205 are each independently selected from 1, 2, 3, and 4, n1201 is selected from 2, 3, and 4, n1202 is selected from 1, 2, and 3, M is selected from iridium (Ir), platinum (Pt), osmium (Os), titanium (Ti), zirconium (Zr), hafnium (Hf), europium (Eu), terbium (Tb), thulium (Tm), and rhodium (Rd), $L_1$ is a ligand represented by Formula 7A, $L_2$ is a ligand represented by Formula 7B, wherein $L_1$ and $L_2$ are different from each other, n71 and n72 are each independently 1 or 2, a sum of n71 and n72 (n71+n72) is 2 or 3, and when n71 is 2, two $L_1$s are identical to or different from each other, and when n72 is 2, two $L_2$s may be identical to or different from each other;

$Y_1$ to $Y_4$ are each independently C or N, wherein $Y_1$ and $Y_2$ are linked to each other via a single bond or a double bond, and $Y_3$ and $Y_4$ are linked to each other via a single bond or a double bond, $CY_1$ and $CY_2$ are each independently selected from a $C_5$-$C_{60}$ cyclic group and a $C_2$-$C_{60}$ heterocyclic group, wherein $CY_1$ and $CY_2$ are optionally linked to each other via a single bond or a first linking group, $R_{71}$ to $R_{73}$ are each independently selected from:

a $C_1$-$C_{10}$ alkyl group; and a $C_1$-$C_{10}$ alkyl group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, $Z_{71}$, $Z_{72}$, and $R_{711}$ to $R_{717}$ are each independently selected from hydrogen, deuterium, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, and $—B(Q_6)(Q_7)$, wherein $R_{712}$ is not hydrogen, and two adjacent substituents selected from $R_{714}$ to $R_{717}$ are optionally linked to each other to form a condensed ring, a71 and a72 are each independently an integer selected from 1 to 5, and when a71 is 2 or more, a plurality of $Z_{71}$s are identical to or different from each other, and when a72 is 2 or more, a plurality of $Z_{72}$s are identical to or different from each other,

* and *' each independently indicate a binding site to M of Formula 1, and at least one substituent of the substituted $C_4$-$C_{30}$ pyrrolidine-based core, the substituted $C_7$-$C_{30}$ condensed polycyclic-based core, the substituted $C_3$-$C_{10}$ cycloalkane group, the substituted $C_1$-$C_{10}$ heterocycloalkane group, the substituted $C_3$-$C_{10}$ cycloalkene group, the substituted $C_1$-$C_{10}$ heterocycloalkene group, the substituted $C_6$-$C_{60}$ arene group, the substituted $C_1$-$C_{60}$ heteroarene group, the substituted non-aromatic condensed polycyclic group, the substituted non-aromatic condensed heteropolycyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted or unsubstituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ are each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

* * * * *